US012581850B2

(12) United States Patent
Lee et al.

(10) Patent No.: US 12,581,850 B2
(45) Date of Patent: Mar. 17, 2026

(54) ORGANIC ELECTROLUMINESCENCE ELEMENT, COMPOSITION, POWDER, ELECTRONIC EQUIPMENT, AND NOVEL COMPOUND

(71) Applicant: IDEMITSU KOSAN CO., LTD., Tokyo (JP)

(72) Inventors: Yongguk Lee, Sodegaura (JP); Ryoji Maeda, Sodegaura (JP); Yuki Nakano, Sodegaura (JP); Hiroaki Itoi, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 559 days.

(21) Appl. No.: 17/633,887

(22) PCT Filed: Dec. 25, 2020

(86) PCT No.: PCT/JP2020/048995
§ 371 (c)(1),
(2) Date: Feb. 8, 2022

(87) PCT Pub. No.: WO2021/132667
PCT Pub. Date: Jul. 1, 2021

(65) Prior Publication Data
US 2022/0393110 A1 Dec. 8, 2022

(30) Foreign Application Priority Data
Dec. 26, 2019 (JP) ................................ 2019-236723
Oct. 13, 2020 (JP) ................................ 2020-172479

(51) Int. Cl.
*H10K 85/60* (2023.01)
*H10K 50/12* (2023.01)

(52) U.S. Cl.
CPC ........... *H10K 85/622* (2023.02); *H10K 50/12* (2023.02)

(58) Field of Classification Search
None
See application file for complete search history.

(56) References Cited

U.S. PATENT DOCUMENTS

2017/0133600 A1 5/2017 Pyo et al.
2020/0395553 A1 12/2020 Park et al.
2021/0399234 A1* 12/2021 Kim .................. H10K 85/6576
2021/0408386 A1* 12/2021 Song .................... H10K 85/626
2022/0165965 A1* 5/2022 Itoi ...................... H10K 85/633

FOREIGN PATENT DOCUMENTS

CN 1853000 A 10/2006
CN 108463535 A 8/2018
JP 2007-506249 A 3/2007
JP 2015-018883 A 1/2015
KR 2018-0071850 A 6/2018
(Continued)

OTHER PUBLICATIONS

International Searching Authority, "International Search Report," issued in connection with International Patent Application No. PCT/JP2020/048995, dated Feb. 22, 2021.
(Continued)

*Primary Examiner* — Robert S Loewe
(74) *Attorney, Agent, or Firm* — Foley & Lardner LLP

(57) ABSTRACT

An organic electroluminescence device including: a cathode; an anode; and at least one emitting layer disposed between the cathode and the anode, wherein the emitting layer contains a first host material, a second host material, and a dopant material, wherein the first host material is a compound represented by the following formula (1), the second host material is a compound represented by the following formula (2), and the first host material and the second host material are different compounds.

(1)

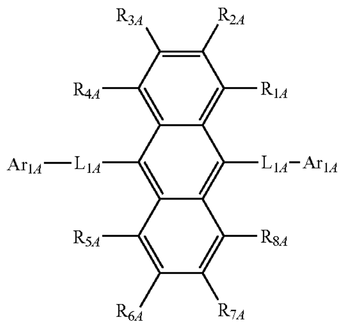

(2)

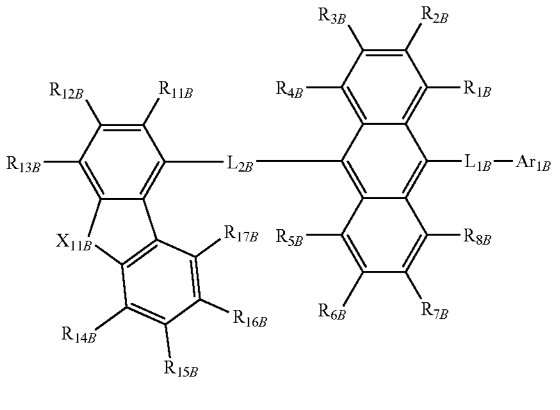

19 Claims, 1 Drawing Sheet

(56) References Cited

FOREIGN PATENT DOCUMENTS

| | | | |
|---|---|---|---|
| KR | 2018-0081005 | A | 7/2018 |
| KR | 2019-0056338 | A | 5/2019 |
| WO | WO-2005/033354 | A1 | 4/2005 |

OTHER PUBLICATIONS

International Searching Authority, "Written Opinion," issued in connection with International Patent Application No. PCT/JP2020/048995, dated Feb. 22, 2021.
CN Office Action and issued against corresponding Chinese Patent Appl. Ser. No.202080056746.8 dated May 30, 2025 (14 pages).

* cited by examiner

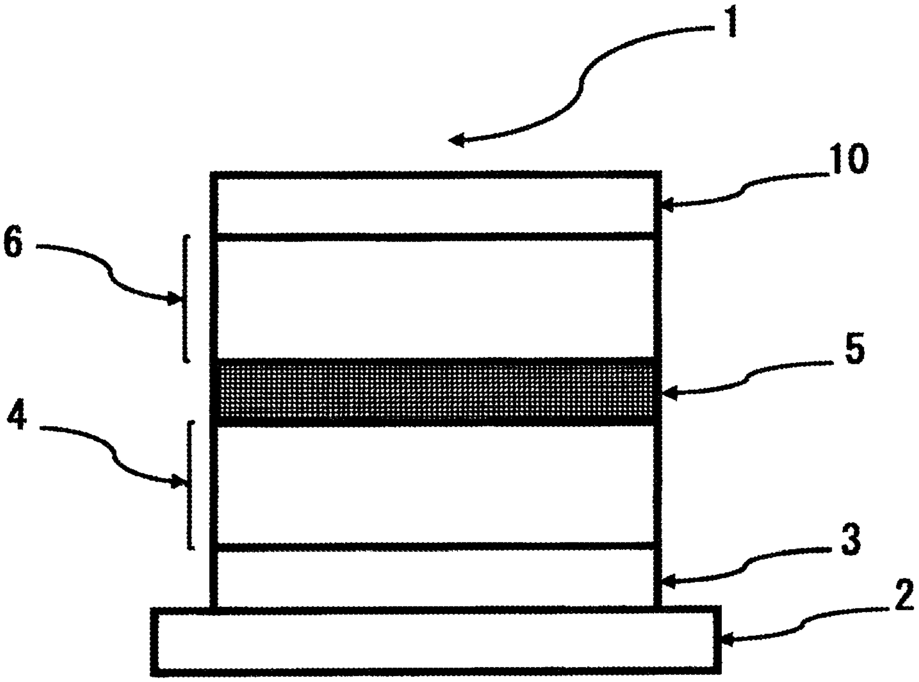
1
10
6
5
4
3
2

ORGANIC ELECTROLUMINESCENCE ELEMENT, COMPOSITION, POWDER, ELECTRONIC EQUIPMENT, AND NOVEL COMPOUND

CROSS-REFERENCE TO RELATED APPLICATIONS

The present application claims priority under 37 U.S.C. § 371 to International Patent Application No. PCT/JP2020/048995, filed Dec. 25, 2020, which claims priority to and the benefit of Japanese Patent Application Nos. 2019-236723, filed on Dec. 26, 2019, and 2020-172479, filed on Oct. 13, 2020. The contents of these applications are hereby incorporated by reference in their entireties.

TECHNICAL FIELD

The invention relates to an organic electroluminescence device, a composition, a powder, an electronic apparatus, and a novel compound.

BACKGROUND ART

When voltage is applied to an organic electroluminescence device (hereinafter, referred to as an organic EL device), holes and electrons are injected into an emitting layer from an anode and a cathode, respectively. Then, thus injected holes and electrons are recombined in the emitting layer, and excitons are formed therein.

The improvement of the device material is proceeded with in order to enhance the device performance of the organic EL device. Attempts of the use of two or more materials in combination in a single organic layer to utilize the advantage of the features of each material are made. For example, Patent Document 1 discloses a technique in which two kinds of host materials are used in combination in an emitting layer.

RELATED ART DOCUMENTS

Patent Documents

[Patent Document 1] JP 2015-18883 A

SUMMARY OF THE INVENTION

However, even when a plurality of materials is used in combination, the advantages of each material are not necessarily maintained. There are cases where the improvement as expected is not observed or the performance is deteriorated on the contrary, and there is still room for upgrading in the art for improving the performance of the organic EL device by this method.

An object of the invention is to provide an organic EL device having a low drive voltage and a high external quantum efficiency.

Another object of the invention is to provide a novel compound that can improve the lifetime of an organic EL device.

As a result of intensive studies to achieve the above objects, the inventors found that an organic EL device having a low driving voltage and a high external quantum efficiency can be obtained by using a combination of two compounds having a specific structure (a first host material and a second host material) in an emitting layer of an organic EL device, thereby completing the invention.

According to the invention, the following organic EL device, composition, powder, electronic apparatus, and novel compound are provided.

1. An organic electroluminescence device comprising:

a cathode;

an anode; and at least one emitting layer disposed between the cathode and the anode, wherein the emitting layer comprises a first host material, a second host material, and a dopant material, the first host material is a compound represented by the following formula (1), the second host material is a compound represented by the following formula (2), and the first host material and the second host material are different compounds:

(1)

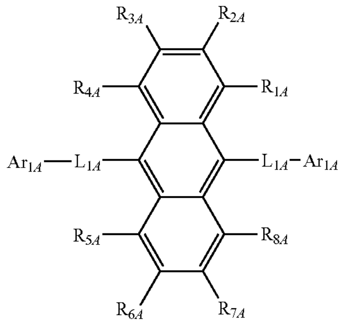

wherein in the formula (1), $R_{1A}$ to $R_{8A}$ are independently a hydrogen atom, a substituent R, or a group represented by the following formula (1A);

the substituent R is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $—Si(R_{901})(R_{902})(R_{903})$, $—O—(R_{904})$, $—S—(R_{905})$, $—N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

when two or more of the substituents R are present, the two or more of the substituents R may be the same as or different from each other;

$L_{1A}$'s are independently a single bond, a substituted or unsubstituted arylene group including 6 to 50 ring carbon atoms, or a substituted or unsubstituted divalent heterocyclic group including 5 to 50 ring atoms;

$Ar_{1A}$'s are independently a substituted or unsubstituted aryl group including 6 to 50 ring carbon atoms, or a substituted or unsubstituted monovalent heterocyclic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when two or more of each of $R_{901}$ to $R_{907}$ are present, the two or more of each of $R_{901}$ to $R_{907}$ are the same as or different from each other;

$$-L_{1A}-Ar_{1A} \quad (1A)$$

wherein in the formula (1A), $L_{1A}$ and $Ar_{1A}$ are as defined in the formula (1); and when two or more groups represented by the formula (1A) are present, the two or more of each of the groups represented by the formula (1A) may be the same as or different from each other;

(2)

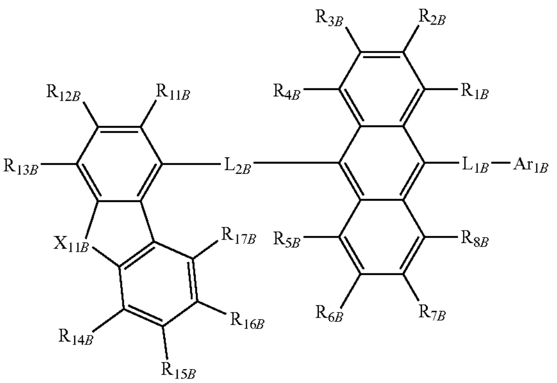

wherein in the formula (2), $X_{11B}$ is an oxygen atom or a sulfur atom;

one or more sets of adjacent two or more of $R_{14B}$ to $R_{17B}$ form a substituted or unsubstituted, saturated or unsaturated ring by bonding with each other;

one or more sets of adjacent two or more of $R_{11B}$ to $R_{13B}$ form a substituted or unsubstituted, saturated or unsaturated ring by bonding with each other, or do not form a substituted or unsubstituted, saturated or unsaturated ring;

$R_{11B}$ to $R_{17B}$ which do not form the substituted or unsubstituted, saturated or unsaturated ring, and $R_{1B}$ to $R_{8B}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$L_{1B}$ and $L_{2B}$ are independently a single bond, a substituted or unsubstituted arylene group including 6 to 50 ring carbon atoms, or a substituted or unsubstituted divalent heterocyclic group including 5 to 50 ring atoms;

$Ar_{1B}$ is a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formula (1).

2. A composition comprising a compound represented by the following formula (1) and a compound represented by the following formula (2), wherein the compound represented by the following formula (1) and the compound represented by the following formula (2) are different compounds:

(1)

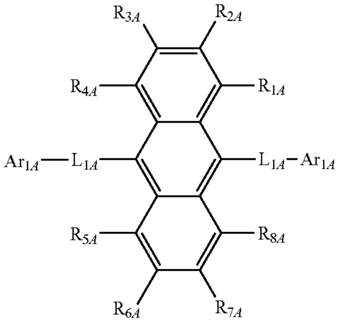

wherein in the formula (1), $R_{1A}$ to $R_{8A}$ are independently a hydrogen atom, a substituent R, or a group represented by the following formula (1A);

the substituent R is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

when two or more of the substituents R are present, the two or more of the substituents R may be the same as or different from each other;

$L_{1A}$'s are independently a single bond, a substituted or unsubstituted arylene group including 6 to 50 ring carbon atoms, or a substituted or unsubstituted divalent heterocyclic group including 5 to 50 ring atoms;

$Ar_{1A}$'s are independently a substituted or unsubstituted aryl group including 6 to 50 ring carbon atoms, or a substituted or unsubstituted monovalent heterocyclic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when two or more of each of $R_{901}$ to $R_{907}$ are present, the two or more of each of $R_{901}$ to $R_{907}$ are the same as or different from each other;

$$-L_{1A}-Ar_{1A} \quad (1A)$$

wherein in the formula (1A), $L_1A$ and $Ar_{1A}$ are as defined in the formula (1); and when two or more groups represented by the formula (1A) are present, the two or more of the groups represented by the formula (1A) may be the same as or different from each other, (2)

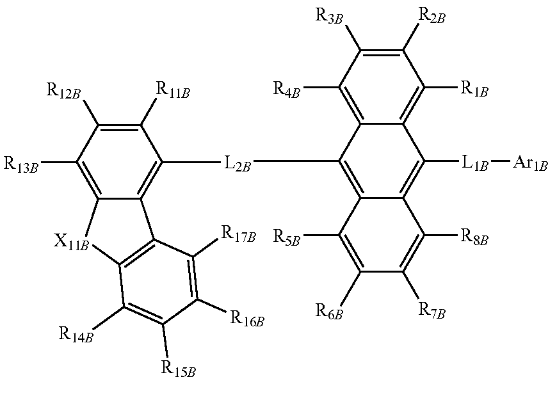

wherein in the formula (2), $X_{11B}$ is an oxygen atom or a sulfur atom;

one or more sets of adjacent two or more of $R_{14B}$ to $R_{17B}$ form a substituted or unsubstituted, saturated or unsaturated ring by bonding with each other;

one or more sets of adjacent two or more of $R_{11B}$ to $R_{13B}$ form a substituted or unsubstituted, saturated or unsaturated ring by bonding with each other, or do not form a substituted or unsubstituted, saturated or unsaturated ring;

$R_{11B}$ to $R_{17B}$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{1B}$ to $R_{8B}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$L_{1B}$ and $L_{2B}$ are independently a single bond, a substituted or unsubstituted arylene group including 6 to 50 ring carbon atoms, or a substituted or unsubstituted divalent heterocyclic group including 5 to 50 ring atoms;

$Ar_1B$ is a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formula (1).

3. A powder comprising the composition according to 2.

4. An organic electroluminescence device comprising:

a cathode;

an anode; and at least one emitting layer disposed between the cathode and the anode, wherein the emitting layer comprises a composition according to 2.

5. An electronic apparatus, equipped with the organic electroluminescence device according to 1 or 4.

6. A compound represented by the following formula (3-1):

(3-1)

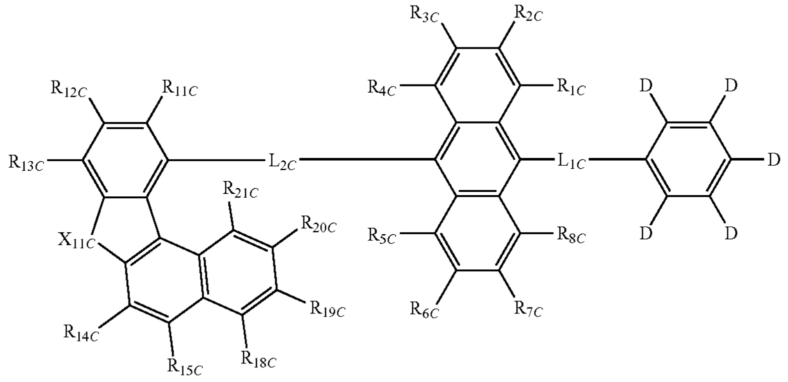

wherein in the formula (3-1), $X_{11C}$ is an oxygen atom or a sulfur atom;

$L_{1C}$ and $L_{2C}$ are independently a single bond, a substituted or unsubstituted arylene group including 6 to 50 ring carbon atoms, or a substituted or unsubstituted divalent heterocyclic group including 5 to 50 ring atoms;

provided that a hydrogen atom possessed by $L_{1C}$ which is not a single bond may be a deuterium atom;

one or more sets of adjacent two or more of $R_{11C}$ to $R_{13C}$ form a substituted or unsubstituted, saturated or unsaturated ring by bonding with each other, or do not form a substituted or unsubstituted, saturated or unsaturated ring;

$R_{1C}$ to $R_{8C}$, $R_{14C}$, $R_{15C}$, and $R_{13C}$ to $R_{21C}$, and $R_{11C}$ to $R_{13C}$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $—Si(R_{901})(R_{902})(R_{903})$, $—O—(R_{904})$, $—S—(R_{905})$, $—N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when two or more of each of $R_{901}$ to $R_{907}$ are present, the two or more of each of $R_{901}$ to $R_{907}$ may be the same as or different from each other;

provided that in the case where $R_{1C}$ to $R_{8C}$, $R_{14C}$, $R_{15C}$, and $R_{13C}$ to $R_{21C}$, and $R_{11C}$ to $R_{13C}$ which do not form the substituted or unsubstituted, saturated or unsaturated ring are hydrogen atoms, the hydrogen atoms are not deuterium atoms;

hydrogen atoms possessed by $R_{1C}$ to $R_{8C}$, $R_{14C}$, $R_{15C}$, and $R_{13C}$ to $R_{21C}$ which are not hydrogen atoms, and $R_{11C}$ to $R_{13C}$ which do not form the substituted or unsubstituted, saturated or unsaturated ring are not deuterium atoms;

in the case where $R_{1C}$ to $R_{8C}$, $R_{14C}$, $R_{15C}$, and $R_{13C}$ to $R_{21C}$ which are not hydrogen atoms, and $R_{11C}$ to $R_{13C}$ which form a substituted or unsubstituted, saturated or unsaturated ring and have an arbitrary substituent, hydrogen atoms possessed by the arbitrary substituent are not deuterium atoms;

hydrogen atoms possessed by the substituted or unsubstituted, saturated or unsaturated ring formed by bonding $R_{11C}$ to $R_{13C}$ to each other are not deuterium atoms; and in the case where the substituted or unsubstituted, saturated or unsaturated ring formed by bonding $R_{11C}$ to $R_{13C}$ to each other has an arbitrary substituent, hydrogen atoms possessed by the arbitrary substituent are not deuterium atoms.

7. A compound represented by the following formula (3-2):

(3-2)

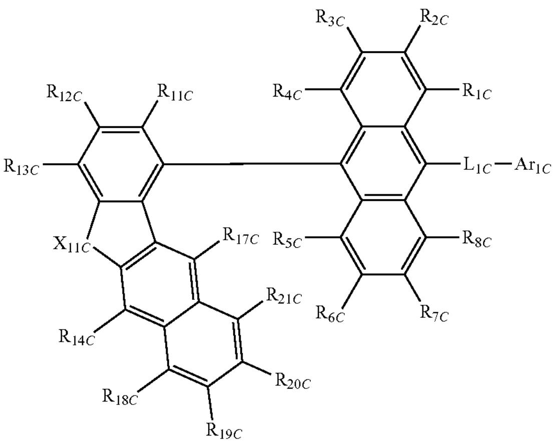

wherein in the formula (3-2), $X_{11C}$ is an oxygen atom or a sulfur atom;

$L_{1C}$ is a single bond, a substituted or unsubstituted arylene group including 6 to 50 ring carbon atoms, or a substituted or unsubstituted divalent heterocyclic group including 5 to 50 ring atoms;

$Ar_{1C}$ is a substituted or unsubstituted aryl group including 6 to 50 ring carbon atoms, or a substituted or unsubstituted monovalent heterocyclic group including 5 to 50 ring atoms;

provided that at least one hydrogen atom possessed by the group of $-L_{1C}-Ar_{1C}$ is a deuterium atom;

one or more sets of adjacent two or more of $R_{11C}$ to $R_{13C}$ form a substituted or unsubstituted, saturated or unsaturated ring by bonding with each other, or do not form a substituted or unsubstituted, saturated or unsaturated ring;

$R_{1C}$ to $R_{8C}$, $R_{14C}$, and $R_{17C}$ to $R_{21C}$, and $R_{11C}$ to $R_{13C}$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $—Si(R_{901})(R_{902})(R_{903})$, $—O—(R_{904})$, $—S—(R_{905})$, $—N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when two or more of each of $R_{901}$ to $R_{907}$ are present, the two or more of each of $R_{901}$ to $R_{907}$ may be the same as or different from each other;

provided that in the case where $R_{1C}$ to $R_{8C}$, $R_{14C}$, and $R_{17C}$ to $R_{21C}$, and $R_{11C}$ to $R_{13C}$ which do not form the substituted or unsubstituted, saturated or unsaturated ring are hydrogen atoms, the hydrogen atoms are not deuterium atoms;

hydrogen atoms possessed by $R_{1C}$ to $R_{8C}$, $R_{14C}$ and $R_{17C}$ to $R_{21C}$, which are not hydrogen atoms, and $R_{11C}$ to $R_{13C}$ which do not form substituted or unsubstituted, saturated or unsaturated rings, are not deuterium atoms;

in the case where $R_{1C}$ to $R_{8C}$, $R_{14C}$, and $R_{17C}$ to $R_{21C}$ which are not hydrogen atoms, and $R_{11C}$ to $R_{13C}$ which do not form the substituted or unsubstituted, saturated or unsaturated ring and have an arbitrary substituent, hydrogen atoms possessed by the arbitrary substituent are not deuterium atoms;

hydrogen atoms possessed by the substituted or unsubstituted, saturated or unsaturated ring formed by bonding $R_{11C}$ to $R_{13C}$ to each other are not deuterium atoms; and in the case where the substituted or unsubstituted, saturated or unsaturated ring formed by bonding $R_{11C}$ to $R_{13C}$ to each other has an arbitrary substituent, hydrogen atoms possessed by the arbitrary substituent are not deuterium atoms.

According to the invention, an organic EL device having a low drive voltage and a high external quantum efficiency can be provided.

According to the invention, a novel compound that can increase the lifetime of an organic EL device can be provided.

BRIEF DESCRIPTION OF THE DRAWINGS

The FIGURE is a diagram showing a schematic configuration of an organic EL device according to an aspect of the invention.

MODE FOR CARRYING OUT THE INVENTION

Definition

In this specification, a hydrogen atom includes its isotopes different in the number of neutrons, namely, a protium, a deuterium and a tritium.

In this specification, at a bondable position in a chemical formula where a symbol such as "R", or "D" representing a deuterium atom is not indicated, a hydrogen atom, that is, a protium atom, a deuterium atom or a tritium atom is bonded.

In this specification, the number of ring carbon atoms represents the number of carbon atoms forming a subject ring itself among the carbon atoms of a compound having a structure in which atoms are bonded in a ring form (for example, a monocyclic compound, a fused ring compound, a cross-linked compound, a carbocyclic compound, or a heterocyclic compound). When the subject ring is substituted by a substituent, the carbon contained in the substituent is not included in the number of ring carbon atoms. The same shall apply to "the number of ring carbon atoms" described below, unless otherwise specified. For example, a benzene ring has 6 ring carbon atoms, a naphthalene ring includes 10 ring carbon atoms, a pyridine ring includes 5 ring carbon atoms, and a furan ring includes 4 ring carbon atoms. Further, for example, a 9,9-diphenylfluorenyl group includes 13 ring carbon atoms, and a 9,9'-spirobifluorenyl group includes 25 ring carbon atoms.

When a benzene ring is substituted by, for example, an alkyl group as a substituent, the number of carbon atoms of the alkyl group is not included in the number of ring carbon atoms of the benzene ring. Therefore, the number of ring carbon atoms of the benzene ring substituted by the alkyl group is 6. When a naphthalene ring is substituted by, for example, an alkyl group as a substituent, the number of carbon atoms of the alkyl group is not included in the number of ring carbon atoms of the naphthalene ring. Therefore, the number of ring carbon atoms of the naphthalene ring substituted by the alkyl group is 10.

In this specification, the number of ring atoms represents the number of atoms forming a subject ring itself among the atoms of a compound having a structure in which atoms are bonded in a ring form (for example, the structure includes a monocyclic ring, a fused ring and a ring assembly) (for example, a monocyclic compound, a fused ring compound, a cross-linked compound, a carbocyclic compound and a heterocyclic compound). The number of ring atoms does not include atoms which do not form the ring (for example, a hydrogen atom which terminates a bond of the atoms forming the ring), or atoms contained in a substituent when the ring is substituted by the substituent. The same shall apply to "the number of ring atoms" described below, unless otherwise specified. For example, the number of atoms of a pyridine ring is 6, the number of atoms of a quinazoline ring is 10, and the number of a furan ring is 5. For example, hydrogen atoms bonded to a pyridine ring and atoms constituting a substituent substituted on the pyridine ring are not included in the number of ring atoms of the pyridine ring. Therefore, the number of ring atoms of a pyridine ring with which a hydrogen atom or a substituent is bonded is 6. For example, hydrogen atoms and atoms constituting a substituent which are bonded with a quinazoline ring is not included in the number of ring atoms of the quinazoline ring. Therefore, the number of ring atoms of a quinazoline ring with which a hydrogen atom or a substituent is bonded is 10.

In this specification, "XX to YY carbon atoms" in the expression "a substituted or unsubstituted ZZ group including XX to YY carbon atoms" represents the number of carbon atoms in the case where the ZZ group is unsubstituted by a substituent, and does not include the number of carbon atoms of a substituent in the case where the ZZ group is substituted by the substituent. Here, "YY" is larger than "XX", and "XX" means an integer of 1 or more and "YY" means an integer of 2 or more.

In this specification, "XX to YY atoms" in the expression "a substituted or unsubstituted ZZ group including XX to YY atoms" represents the number of atoms in the case where the ZZ group is unsubstituted by a substituent, and does not include the number of atoms of a substituent in the case where the ZZ group is substituted by the substituent. Here, "YY" is larger than "XX", and "XX" means an integer of 1 or more and "YY" means an integer of 2 or more.

In this specification, the unsubstituted ZZ group represents the case where the "substituted or unsubstituted ZZ group" is a "ZZ group unsubstituted by a substituent", and the substituted ZZ group represents the case where the "substituted or unsubstituted ZZ group" is a "ZZ group substituted by a substituent".

In this specification, a term "unsubstituted" in the case of "a substituted or unsubstituted ZZ group" means that hydrogen atoms in the ZZ group are not substituted by a substituent. Hydrogen atoms in a term "unsubstituted ZZ group" are a protium atom, a deuterium atom, or a tritium atom.

In this specification, a term "substituted" in the case of "a substituted or unsubstituted ZZ group" means that one or more hydrogen atoms in the ZZ group are substituted by a substituent. Similarly, a term "substituted" in the case of "a BB group substituted by an AA group" means that one or more hydrogen atoms in the BB group are substituted by the AA group.

"Substituent as Described in this Specification"

Hereinafter, the substituent described in this specification will be explained.

The number of ring carbon atoms of the "unsubstituted aryl group" described in this specification is 6 to 50, preferably 6 to 30, and more preferably 6 to 18, unless otherwise specified.

The number of ring atoms of the "unsubstituted heterocyclic group" described in this specification is 5 to 50, preferably 5 to 30, and more preferably 5 to 18, unless otherwise specified.

The number of carbon atoms of the "unsubstituted alkyl group" described in this specification is 1 to 50, preferably 1 to 20, and more preferably 1 to 6, unless otherwise specified.

The number of carbon atoms of the "unsubstituted alkenyl group" described in this specification is 2 to 50, preferably 2 to 20, and more preferably 2 to 6, unless otherwise specified.

The number of carbon atoms of the "unsubstituted alkynyl group" described in this specification is 2 to 50, preferably 2 to 20, and more preferably 2 to 6, unless otherwise specified.

The number of ring carbon atoms of the "unsubstituted cycloalkyl group" described in this specification is 3 to 50, preferably 3 to 20, and more preferably 3 to 6, unless otherwise specified.

The number of ring carbon atoms of the "unsubstituted arylene group" described in this specification is 6 to 50, preferably 6 to 30, and more preferably 6 to 18, unless otherwise specified.

The number of ring atoms of the "unsubstituted divalent heterocyclic group" described in this specification is 5 to 50, preferably 5 to 30, and more preferably 5 to 18, unless otherwise specified.

The number of carbon atoms of the "unsubstituted alkylene group" described in this specification is 1 to 50, preferably 1 to 20, and more preferably 1 to 6, unless otherwise specified.

"Substituted or Unsubstituted Aryl Group"

Specific examples of the "substituted or unsubstituted aryl group" described in this specification (specific example group G1) include the following unsubstituted aryl groups (specific example group G1A), substituted aryl groups (specific example group G1B), and the like. (Here, the unsubstituted aryl group refers to the case where the "substituted or unsubstituted aryl group" is an "aryl group unsubstituted by a substituent", and the substituted aryl group refers to the case where the "substituted or unsubstituted aryl group" is an "aryl group substituted by a substituent".). In this specification, in the case where simply referred as an "aryl group", it includes both a "unsubstituted aryl group" and a "substituted aryl group."

The "substituted aryl group" means a group in which one or more hydrogen atoms of the "unsubstituted aryl group" are substituted by a substituent. Specific examples of the "substituted aryl group" include, for example, groups in which one or more hydrogen atoms of the "unsubstituted aryl group" of the following specific example group G1A are substituted by a substituent, the substituted aryl groups of the following specific example group G1B, and the like. It should be noted that the examples of the "unsubstituted aryl group" and the examples of the "substituted aryl group" enumerated in this specification are mere examples, and the "substituted aryl group" described in this specification also includes a group in which a hydrogen atom bonded with a carbon atom of the aryl group itself in the "substituted aryl group" of the following specific group G1B is further substituted by a substituent, and a group in which a hydrogen atom of a substituent in the "substituted aryl group" of the following specific group G1B is further substituted by a substituent.

Unsubstituted Aryl Group (Specific Example Group G1a):

a phenyl group,
a p-biphenyl group,
a m-biphenyl group,
an o-biphenyl group,
a p-terphenyl-4-yl group,
a p-terphenyl-3-yl group,
a p-terphenyl-2-yl group,
a m-terphenyl-4-yl group,
a m-terphenyl-3-yl group,
a m-terphenyl-2-yl group,
an o-terphenyl-4-yl group,
an o-terphenyl-3-yl group,
an o-terphenyl-2-yl group,
a 1-naphthyl group,
a 2-naphthyl group,
an anthryl group,
a benzanthryl group,
a phenanthryl group,
a benzophenanthryl group,
a phenalenyl group,
a pyrenyl group,
a chrysenyl group,
a benzochrysenyl group,
a triphenylenyl group,
a benzotriphenylenyl group,
a tetracenyl group,
a pentacenyl group,
a fluorenyl group,
a 9,9'-spirobifluorenyl group,
a benzofluorenyl group,
a dibenzofluorenyl group,
a fluoranthenyl group,
a benzofluoranthenyl group,
a perylenyl group, and
a monovalent aryl group derived by removing one hydrogen atom from the ring structures represented by any of the following general formulas (TEMP-1) to (TEMP-15).

(TEMP-1)

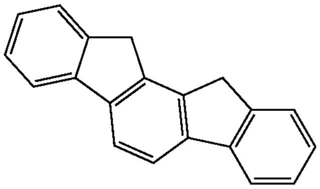

(TEMP-2)

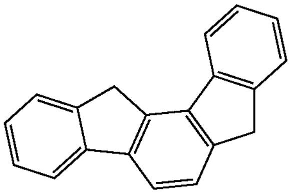

-continued (TEMP-3)

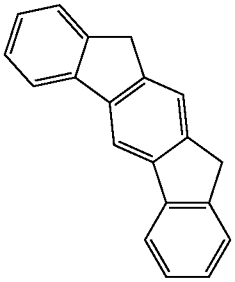

(TEMP-4)

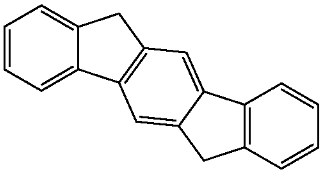

(TEMP-5)

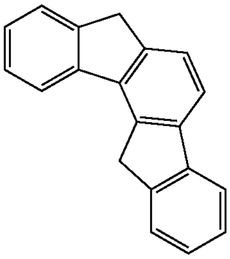

(TEMP-6)

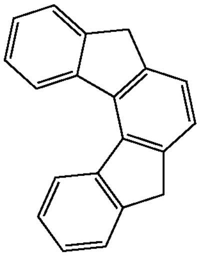

(TEMP-7)

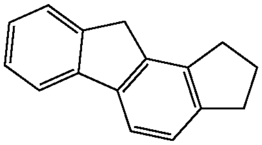

(TEMP-8)

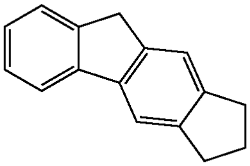

(TEMP-9)

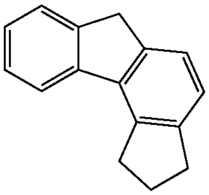

-continued (TEMP-10)

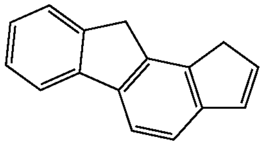

(TEMP-11)

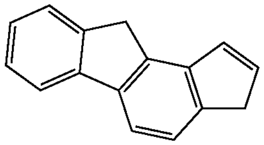

(TEMP-12)

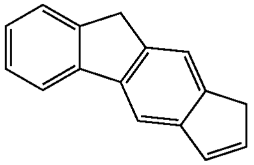

(TEMP-13)

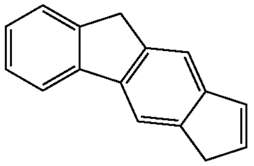

(TEMP-14)

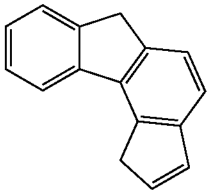

(TEMP-15)

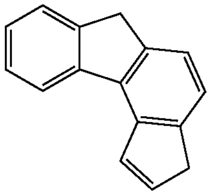

Substituted Aryl Group (Specific Example Group G1B):

an o-tolyl group,
a m-tolyl group,
a p-tolyl group,
a p-xylyl group,
a m-xylyl group,
an o-xylyl group,
a p-isopropylphenyl group,
a m-isopropylphenyl group,
an o-isopropylphenyl group,
a p-t-butylphenyl group,
a m-t-butylphenyl group,
an o-t-butylphenyl group,
a 3,4,5-trimethylphenyl group,
a 9,9-dimethylfluorenyl group,
a 9,9-diphenylfluorenyl group,
a 9,9-bis(4-methylphenyl)fluorenyl group,
a 9,9-bis(4-isopropylphenyl)fluorenyl group,
a 9,9-bis(4-t-butylphenyl)fluorenyl group,
a cyanophenyl group,
a triphenylsilylphenyl group,
a trimethylsilylphenyl group,
a phenylnaphthyl group,
a naphthylphenyl group, and
a group in which one or more hydrogen atoms of a monovalent group derived from the ring structures represented by any of the general formulas (TEMP-1) to (TEMP-15) are substituted by a substituent.

"Substituted or Unsubstituted Heterocyclic Group"

The "heterocyclic group" described in this specification is a ring group having at least one hetero atom in the ring atom. Specific examples of the hetero atom include a nitrogen atom, an oxygen atom, a sulfur atom, a silicon atom, a phosphorus atom, and a boron atom.

The "heterocyclic group" in this specification is a monocyclic group or a fused ring group.

The "heterocyclic group" in this specification is an aromatic heterocyclic group or a non-aromatic heterocyclic group.

Specific examples of the "substituted or unsubstituted heterocyclic group" (specific example group G2) described in this specification include the following unsubstituted heterocyclic group (specific example group G2A), the following substituted heterocyclic group (specific example group G2B), and the like. (Here, the unsubstituted heterocyclic group refers to the case where the "substituted or unsubstituted heterocyclic group" is a "heterocyclic group unsubstituted by a substituent", and the substituted heterocyclic group refers to the case where the "substituted or unsubstituted heterocyclic group" is a "heterocyclic group substituted by a substituent".). In this specification, in the case where simply referred as a "heterocyclic group", it includes both the "unsubstituted heterocyclic group" and the "substituted heterocyclic group."

The "substituted heterocyclic group" means a group in which one or more hydrogen atom of the "unsubstituted heterocyclic group" are substituted by a substituent. Specific examples of the "substituted heterocyclic group" include a group in which a hydrogen atom of "unsubstituted heterocyclic group" of the following specific example group G2A is substituted by a substituent, the substituted heterocyclic groups of the following specific example group G2B, and the like. It should be noted that the examples of the "unsubstituted heterocyclic group" and the examples of the "substituted heterocyclic group" enumerated in this specification are mere examples, and the "substituted heterocyclic group" described in this specification includes groups in which hydrogen atom bonded with a ring atom of the heterocyclic group itself in the "substituted heterocyclic group" of the specific example group G2B is further substituted by a substituent, and a group in which hydrogen atom of a substituent in the "substituted heterocyclic group" of the specific example group G2B is further substituted by a substituent.

Specific example group G2A includes, for example, the following unsubstituted heterocyclic group containing a nitrogen atom (specific example group G2A1), the following unsubstituted heterocyclic group containing an oxygen atom (specific example group G2A2), the following unsubstituted heterocyclic group containing a sulfur atom (specific example group G2A3), and the monovalent heterocyclic group derived by removing one hydrogen atom from the ring structures represented by any of the following general formulas (TEMP-16) to (TEMP-33) (specific example group G2A4).

Specific example group G2B includes, for example, the following substituted heterocyclic group containing a nitrogen atom (specific example group G2B1), the following substituted heterocyclic group containing an oxygen atom (specific example group G2B2), the following substituted heterocyclic group containing a sulfur atom (specific example group G2B3), and the following group in which one or more hydrogen atoms of the monovalent heterocyclic group derived from the ring structures represented by any of the following general formulas (TEMP-16) to (TEMP-33) are substituted by a substituent (specific example group G2B4).

Unsubstituted Heterocyclic Group Containing a Nitrogen Atom (Specific Example Group G2A1):

a pyrrolyl group,
an imidazolyl group,
a pyrazolyl group,
a triazolyl group,
a tetrazolyl group,
an oxazolyl group,
an isoxazolyl group,
an oxadiazolyl group,
a thiazolyl group,
an isothiazolyl group,
a thiadiazolyl group,
a pyridyl group,
a pyridazinyl group,
a pyrimidinyl group,
a pyrazinyl group,
a triazinyl group,
an indolyl group,
an isoindolyl group,
an indolizinyl group,
a quinolizinyl group,
a quinolyl group,
an isoquinolyl group,
a cinnolyl group,
a phthalazinyl group,
a quinazolinyl group,
a quinoxalinyl group,
a benzimidazolyl group,
an indazolyl group,
a phenanthrolinyl group,
a phenanthridinyl group,
an acridinyl group,
a phenazinyl group,
a carbazolyl group,
a benzocarbazolyl group,
a morpholino group,
a phenoxazinyl group,
a phenothiazinyl group,
an azacarbazolyl group, and
a diazacarbazolyl group.

Unsubstituted Heterocyclic Group Containing an Oxygen Atom (Specific Example Group G2A2):

a furyl group,
an oxazolyl group,
an isoxazolyl group,
an oxadiazolyl group,
a xanthenyl group,
a benzofuranyl group,
an isobenzofuranyl group,
a dibenzofuranyl group,
a naphthobenzofuranyl group,
a benzoxazolyl group,
a benzisoxazolyl group,
a phenoxazinyl group,
a morpholino group,
a dinaphthofuranyl group,
an azadibenzofuranyl group,
a diazadibenzofuranyl group,
an azanaphthobenzofuranyl group, and
a diazanaphthobenzofuranyl group.

Unsubstituted Heterocyclic Group Containing a Sulfur Atom (Specific Example Group G2A3):

a thienyl group,
a thiazolyl group,
an isothiazolyl group,
a thiadiazolyl group,
a benzothiophenyl group (benzothienyl group),
an isobenzothiophenyl group (isobenzothienyl group),
a dibenzothiophenyl group (dibenzothienyl group),
a naphthobenzothiophenyl group (naphthobenzothienyl group),
a benzothiazolyl group,
a benzisothiazolyl group,
a phenothiazinyl group,
a dinaphthothiophenyl group (dinaphthothienyl group),
an azadibenzothiophenyl group (azadibenzothienyl group),
a diazadibenzothiophenyl group (diazadibenzothienyl group),
an azanaphthobenzothiophenyl group (azanaphthobenzothienyl group), and
a diazanaphthobenzothiophenyl group (diazanaphthobenzothienyl group).

Monovalent Heterocyclic Group Derived by Removing One Hydrogen Atom from the Ring Structures Represented by any of the Following General Formulas (TEMP-16) to (TEMP-33) (Specific Example Group G2A4):

(TEMP-16)

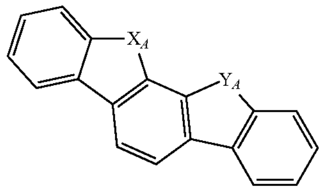

(TEMP-17)

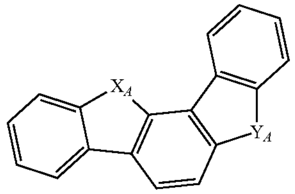

(TEMP-18)

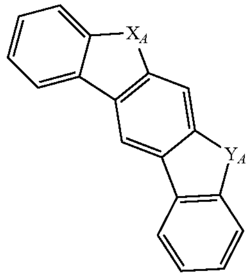

(TEMP-19)

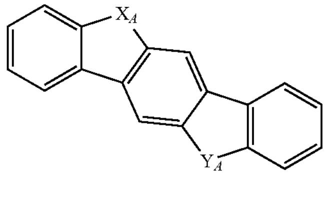

-continued (TEMP-20)

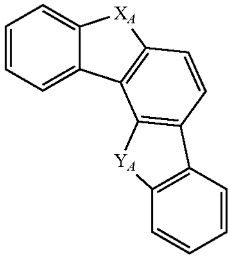

(TEMP-21)

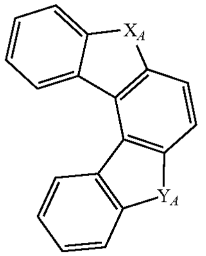

(TEMP-22)

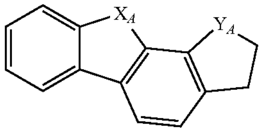

(TEMP-23)

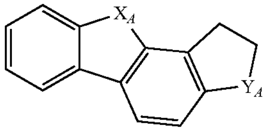

(TEMP-24)

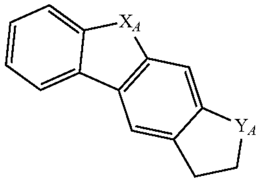

(TEMP-25)

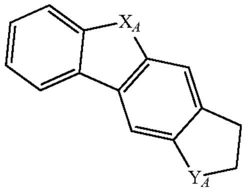

(TEMP-26)

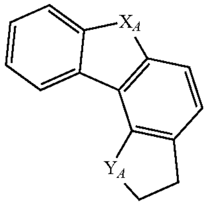

(TEMP-27)

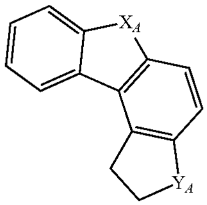

-continued (TEMP-28)

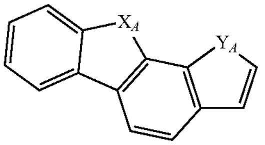

(TEMP-29)

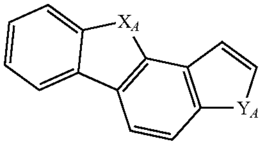

(TEMP-30)

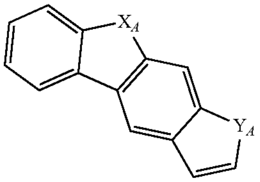

(TEMP-31)

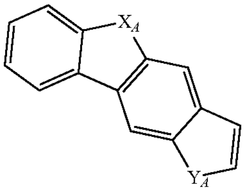

(TEMP-32)

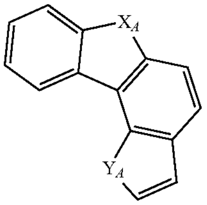

(TEMP-33)

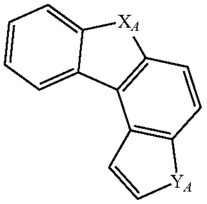

In the general formulas (TEMP-16) to (TEMP-33), $X_A$ and $Y_A$ are independently an oxygen atom, a sulfur atom, NH, or $CH_2$. Provided that at least one of $X_A$ and $Y_A$ is an oxygen atom, a sulfur atom, or NH.

In the general formulas (TEMP-16) to (TEMP-33), when at least one of $X_A$ and $Y_A$ is NH or $CH_2$, the monovalent heterocyclic group derived from the ring structures represented by any of the general formulas (TEMP-16) to (TEMP-33) includes a monovalent group derived by removing one hydrogen atom from these NH or $CH_2$.

Substituted Heterocyclic Group Containing a Nitrogen Atom (Specific Example Group G2B1):

a (9-phenyl)carbazolyl group,
a (9-biphenylyl)carbazolyl group,
a (9-phenyl)phenylcarbazolyl group,
a (9-naphthyl)carbazolyl group,
a diphenylcarbazol-9-yl group,
a phenylcarbazol-9-yl group,
a methylbenzimidazolyl group, an ethylbenzimidazolyl group,
a phenyltriazinyl group,
a biphenylyltriazinyl group,
a diphenyltriazinyl group,
a phenylquinazolinyl group, and
a biphenylylquinazolinyl group.

Substituted Heterocyclic Group Containing an Oxygen Atom (Specific Example Group G2B2):

a phenyldibenzofuranyl group,
a methyldibenzofuranyl group,
a t-butyldibenzofuranyl group, and
a monovalent residue of spiro[9H-xanthene-9,9'-[9H] fluorene].

Substituted Heterocyclic Group Containing a Sulfur Atom (Specific Example Group G2B3):

a phenyldibenzothiophenyl group,
a methyldibenzothiophenyl group,
a t-butyldibenzothiophenyl group, and
a monovalent residue of spiro[9H-thioxanthene-9,9'-[9H] fluorene].

Group in which One or More Hydrogen Atoms of the Monovalent Heterocyclic Group Derived from the Ring Structures Represented by any of the Following General Formulas (TEMP-16) to (TEMP-33) are Substituted by a Substituent (Specific Example Group G2B4):

The "one or more hydrogen atoms of the monovalent heterocyclic group" means one or more hydrogen atoms selected from hydrogen atoms bonded with ring carbon atoms of the monovalent heterocyclic group, a hydrogen atom bonded with a nitrogen atom when at least one of $X_A$ and $Y_A$ is NH, and hydrogen atoms of a methylene group when one of $X_A$ and $Y_A$ is $CH_2$.

"Substituted or Unsubstituted Alkyl Group"

Specific examples of the "substituted or unsubstituted alkyl group" (specific example group G3) described in this specification include the following unsubstituted alkyl groups (specific example group G3A) and the following substituted alkyl groups (specific example group G3B). (Here, the unsubstituted alkyl group refers to the case where the "substituted or unsubstituted alkyl group" is an "alkyl group unsubstituted by a substituent", and the substituted alkyl group refers to the case where the "substituted or unsubstituted alkyl group" is an "alkyl group substituted by a substituent".). In this specification, in the case where simply referred as an "alkyl group" includes both the "unsubstituted alkyl group" and the "substituted alkyl group."

The "substituted alkyl group" means a group in which one or more hydrogen atoms in the "unsubstituted alkyl group" are substituted by a substituent. Specific examples of the "substituted alkyl group" include groups in which one or more hydrogen atoms in the following "unsubstituted alkyl group" (specific example group G3A) are substituted by a substituent, the following substituted alkyl group (specific example group G3B), and the like. In this specification, the alkyl group in the "unsubstituted alkyl group" means a linear alkyl group. Thus, the "unsubstituted alkyl group" includes a straight-chain "unsubstituted alkyl group" and a branched-chain "unsubstituted alkyl group". It should be noted that the examples of the "unsubstituted alkyl group" and the examples of the "substituted alkyl group" enumerated in this specification are mere examples, and the "substituted alkyl group" described in this specification includes a group in which hydrogen atom of the alkyl group itself in the "substituted alkyl group" of the specific example group G3B is further substituted by a substituent, and a group in which hydrogen atom of a substituent in the "substituted alkyl group" of the specific example group G3B is further substituted by a substituent.

Unsubstituted Alkyl Group (Specific Example Group G3a):

a methyl group,
an ethyl group,
a n-propyl group,
an isopropyl group,
a n-butyl group,
an isobutyl group,
a s-butyl group, and
a t-butyl group.

Substituted Alkyl Group (Specific Example Group G3B):

a heptafluoropropyl group (including isomers),
a pentafluoroethyl group,
a 2,2,2-trifluoroethyl group, and
a trifluoromethyl group.

"Substituted or Unsubstituted Alkenyl Group"

Specific examples of the "substituted or unsubstituted alkenyl group" described in this specification (specific example group G4) include the following unsubstituted alkenyl group (specific example group G4A), the following substituted alkenyl group (specific example group G4B), and the like. (Here, the unsubstituted alkenyl group refers to the case where the "substituted or unsubstituted alkenyl group" is a "alkenyl group unsubstituted by a substituent", and the "substituted alkenyl group" refers to the case where the "substituted or unsubstituted alkenyl group" is a "alkenyl group substituted by a substituent."). In this specification, in the case where simply referred as an "alkenyl group" includes both the "unsubstituted alkenyl group" and the "substituted alkenyl group."

The "substituted alkenyl group" means a group in which one or more hydrogen atoms in the "unsubstituted alkenyl group" are substituted by a substituent. Specific examples of the "substituted alkenyl group" include a group in which the following "unsubstituted alkenyl group" (specific example group G4A) has a substituent, the following substituted alkenyl group (specific example group G4B), and the like. It should be noted that the examples of the "unsubstituted alkenyl group" and the examples of the "substituted alkenyl group" enumerated in this specification are mere examples, and the "substituted alkenyl group" described in this specification includes a group in which a hydrogen atom of the alkenyl group itself in the "substituted alkenyl group" of the specific example group G4B is further substituted by a substituent, and a group in which a hydrogen atom of a substituent in the "substituted alkenyl group" of the specific example group G4B is further substituted by a substituent.

Unsubstituted Alkenyl Group (Specific Example Group G4a):

a vinyl group,
an allyl group,
a 1-butenyl group,
a 2-butenyl group, and
a 3-butenyl group.

Substituted Alkenyl Group (Specific Example Group G4B):

a 1,3-butanedienyl group,
a 1-methylvinyl group,
a 1-methylallyl group,
a 1,1-dimethylallyl group,
a 2-methylally group, and
a 1,2-dimethylallyl group.

"Substituted or Unsubstituted Alkynyl Group"

Specific examples of the "substituted or unsubstituted alkynyl group" described in this specification (specific example group G5) include the following unsubstituted alkynyl group (specific example group G5A) and the like. (Here, the unsubstituted alkynyl group refers to the case where the "substituted or unsubstituted alkynyl group" is an "alkynyl group unsubstituted by a substituent".). In this specification, in the case where simply referred as an "alkynyl group" includes both the "unsubstituted alkynyl group" and the "substituted alkynyl group."

The "substituted alkynyl group" means a group in which one or more hydrogen atoms in the "unsubstituted alkynyl group" are substituted by a substituent. Specific examples of the "substituted alkynyl group" include a group in which one or more hydrogen atoms in the following "unsubstituted alkynyl group" (specific example group G5A) are substituted by a substituent, and the like.

Unsubstituted Alkynyl Group (Specific Example Group G5a):

an ethynyl group.

"Substituted or Unsubstituted Cycloalkyl Group"

Specific examples of the "substituted or unsubstituted cycloalkyl group" described in this specification (specific example group G6) include the following unsubstituted cycloalkyl group (specific example group G6A), the following substituted cycloalkyl group (specific example group G6B), and the like. (Here, the unsubstituted cycloalkyl group refers to the case where the "substituted or unsubstituted cycloalkyl group" is a "cycloalkyl group unsubstituted by a substituent", and the substituted cycloalkyl group refers to the case where the "substituted or unsubstituted cycloalkyl group" is a "cycloalkyl group substituted by a substituent".). In this specification, in the case where simply referred as a "cycloalkyl group" includes both the "unsubstituted cycloalkyl group" and the "substituted cycloalkyl group."

The "substituted cycloalkyl group" means a group in which one or more hydrogen atoms in the "unsubstituted cycloalkyl group" are substituted by a substituent. Specific examples of the "substituted cycloalkyl group" include a group in which one or more hydrogen atoms in the following "unsubstituted cycloalkyl group" (specific example group G6A) are substituted by a substituent, and examples of the following substituted cycloalkyl group (specific example group G6B), and the like. It should be noted that the examples of the "unsubstituted cycloalkyl group" and the examples of the "substituted cycloalkyl group" enumerated in this specification are mere examples, and the "substituted cycloalkyl group" in this specification includes a group in which one or more hydrogen atoms bonded with the carbon atom of the cycloalkyl group itself in the "substituted cycloalkyl group" of the specific example group G6B are substituted by a substituent, and a group in which a hydrogen atom of a substituent in the "substituted cycloalkyl group" of specific example group G6B is further substituted by a substituent.

Unsubstituted Cycloalkyl Group (Specific Example Group G6a):

a cyclopropyl group, a cyclobutyl group, a cyclopentyl group, a cyclohexyl group, a 1-adamantyl group, a 2-adamantyl group, a 1-norbornyl group, and a 2-norbornyl group.

Substituted Cycloalkyl Group (Specific Example Group G6B):

a 4-methylcyclohexyl group.

"Group Represented by —Si($R_{901}$)($R_{902}$)($R_{903}$)"

Specific examples of the group represented by —Si($R_{901}$)($R_{902}$)($R_{903}$) described in this specification (specific example group G7) include:

—Si(G1)(G1)(G1),

—Si(G1)(G2)(G2),

—Si(G1)(G1)(G2),

—Si(G2)(G2)(G2),

—Si(G3)(G3)(G3), and

—Si(G6)(G6)(G6).

G1 is the "substituted or unsubstituted aryl group" described in the specific example group G1.

G2 is the "substituted or unsubstituted heterocyclic group" described in the specific example group G2.

G3 is the "substituted or unsubstituted alkyl group" described in the specific example group G3.

G6 is the "substituted or unsubstituted cycloalkyl group" described in the specific example group G6.

Plural G1's in —Si(G1)(G1)(G1) are the same or different.

Plural G2's in —Si(G1)(G2)(G2) are the same or different.

Plural G1's in —Si(G1)(G1)(G2) are the same or different.

Plural G2's in —Si(G2)(G2)(G2) are be the same or different.

Plural G3's in —Si(G3)(G3)(G3) are the same or different.

Plural G6's in —Si(G6)(G6)(G6) are be the same or different.

"Group Represented by —O—($R_{904}$)" Specific examples of the group represented by —O—($R_{904}$) in this specification (specific example group G8) include:

—O(G1),

—O(G2),

—O(G3), and

—O(G6).

G1 is the "substituted or unsubstituted aryl group" described in the specific example group G1.

G2 is the "substituted or unsubstituted heterocyclic group" described in the specific example group G2.

G3 is the "substituted or unsubstituted alkyl group" described in the specific example group G3.

G6 is the "substituted or unsubstituted cycloalkyl group" described in the specific example group G6.

"Group Represented by —S—($R_{905}$)"

Specific examples of the group represented by —S—($R_{905}$) in this specification (specific example group G9) include:

—S(G1),

—S(G2),

—S(G3), and

—S(G6).

G1 is the "substituted or unsubstituted aryl group" described in the specific example group G1.

G2 is the "substituted or unsubstituted heterocyclic group" described in the specific example group G2.

G3 is the "substituted or unsubstituted alkyl group" described in the specific example group G3.

G6 is the "substituted or unsubstituted cycloalkyl group" described in the specific example group G6.

"Group Represented by —N($R_{906}$)($R_{907}$)"

Specific examples of the group represented by —N($R_{906}$)($R_{907}$) in this specification (specific example group G10) include:

—N(G1)(G1),

—N(G2)(G2),

—N(G1)(G2),

—N(G3)(G3), and

—N(G6)(G6).

G1 is the "substituted or unsubstituted aryl group" described in the specific example group G1.

G2 is the "substituted or unsubstituted heterocyclic group" described in the specific example group G2.

G3 is the "substituted or unsubstituted alkyl group" described in the specific example group G3.

G6 is the "substituted or unsubstituted cycloalkyl group" described in the specific example group G6.

Plural G1's in —N(G1)(G1) are the same or different.

Plural G2's in —N(G2)(G2) are the same or different.

Plural G3's in —N(G3)(G3) are the same or different.

Plural G6's in —N(G6)(G6) are the same or different.

"Halogen Atom"

Specific examples of the "halogen atom" described in this specification (specific example group G11) include a fluorine atom, a chlorine atom, a bromine atom, an iodine atom, and the like.

"Substituted or Unsubstituted Fluoroalkyl Group"

The "substituted or unsubstituted fluoroalkyl group" described in this specification is a group in which at least one hydrogen atom bonded with a carbon atom constituting the alkyl group in the "substituted or unsubstituted alkyl group" is substituted by a fluorine atom, and includes a group in which all hydrogen atoms bonded with a carbon atom constituting the alkyl group in the "substituted or unsubstituted alkyl group" are substituted by a fluorine atom (a perfluoro group). The number of carbon atoms of the "unsubstituted fluoroalkyl group" is 1 to 50, preferably 1 to 30, more preferably 1 to 18, unless otherwise specified in this specification. The "substituted fluoroalkyl group" means a group in which one or more hydrogen atoms of the "fluoroalkyl group" are substituted by a substituent. The "substituted fluoroalkyl group" described in this specification also includes a group in which one or more hydrogen atoms bonded with a carbon atom of the alkyl chains in the "substituted fluoroalkyl group" are further substituted by a substituent, and a group in which one or more hydrogen atom of a substituent in the "substituted fluoroalkyl group" are further substituted by a substituent. Specific examples of the "unsubstituted fluoroalkyl group" include a group in which one or more hydrogen atoms in the "alkyl group" (specific group G3) are substituted by a fluorine atom, and the like.

"Substituted or Unsubstituted Haloalkyl Group"

The "substituted or unsubstituted haloalkyl group" described in this specification is a group in which at least one hydrogen atom bonded with a carbon atom constituting the alkyl group in the "substituted or unsubstituted alkyl group" is substituted by a halogen atom, and also includes a group in which all hydrogen atoms bonded with a carbon atom constituting the alkyl group in the "substituted or unsubstituted alkyl group" are substituted by a halogen atom. The number of carbon atoms of the "unsubstituted haloalkyl group" is 1 to 50, preferably 1 to 30, more preferably 1 to 18, unless otherwise specified in this specification. The "substituted haloalkyl group" means a group in which one or more hydrogen atoms of the "haloalkyl group" are substituted by a substituent. The "substituted haloalkyl group" described in this specification also includes a group in which one or more hydrogen atoms bonded with a carbon atom of the alkyl chain in the "substituted haloalkyl group" are further substituted by a substituent, and a group in which one or more hydrogen atoms of a substituent in the "substituted haloalkyl group" are further substituted by a substituent. Specific examples of the "unsubstituted haloalkyl group" include a group in which one or more hydrogen atoms in the "alkyl group" (specific example group G3) are substituted by a halogen atom, and the like. A haloalkyl group is sometimes referred to as an alkyl halide group.

"Substituted or Unsubstituted Alkoxy Group"

Specific examples of the "substituted or unsubstituted alkoxy group" described in this specification include a group represented by —O(G3), wherein G3 is the "substituted or unsubstituted alkyl group" described in the specific example group G3. The number of carbon atoms of the "unsubstituted alkoxy group" is 1 to 50, preferably 1 to 30, more preferably 1 to 18, unless otherwise specified in this specification.

"Substituted or Unsubstituted Alkylthio Group"

Specific examples of the "substituted or unsubstituted alkylthio group" described in this specification include a group represented by —S(G3), wherein G3 is the "substituted or unsubstituted alkyl group" described in the specific example group G3. The number of carbon atoms of the "unsubstituted alkylthio group" is 1 to 50, preferably 1 to 30, more preferably 1 to 18, unless otherwise specified in this specification.

"Substituted or Unsubstituted Aryloxy Group"

Specific examples of the "substituted or unsubstituted aryloxy group" described in this specification include a group represented by —O(G1), wherein G1 is the "substituted or unsubstituted aryl group" described in the specific example group G1. The number of ring carbon atoms of the "unsubstituted aryloxy group" is 6 to 50, preferably 6 to 30, more preferably 6 to 18, unless otherwise specified in this specification.

"Substituted or Unsubstituted Arylthio Group"

Specific examples of the "substituted or unsubstituted arylthio group" described in this specification include a group represented by —S(G1), wherein G1 is a "substituted or unsubstituted aryl group" described in the specific example group G1. The number of ring carbon atoms of the "unsubstituted arylthio group" is 6 to 50, preferably 6 to 30, more preferably 6 to 18, unless otherwise specified in this specification.

"Substituted or Unsubstituted Trialkylsilyl Group"

Specific examples of the "trialkylsilyl group" described in this specification include a group represented by —Si(G3)(G3)(G3), where G3 is the "substituted or unsubstituted alkyl group" described in the specific example group G3. Plural G3's in —Si(G3)(G3)(G3) are the same or different. The number of carbon atoms in each alkyl group of the "trialkylsilyl group" is 1 to 50, preferably 1 to 20, more preferably 1 to 6, unless otherwise specified in this specification.

"Substituted or Unsubstituted Aralkyl Group"

Specific examples of the "substituted or unsubstituted aralkyl group" described in this specification is a group represented by -(G3)-(G1), wherein G3 is the "substituted or unsubstituted alkyl group" described in the specific example group G3, and G1 is the "substituted or unsubstituted aryl group" described in the specific example group G1. Therefore, the "aralkyl group" is a group in which a hydrogen atom of the "alkyl group" is substituted by an "aryl group" as a substituent, and is one form of the "substituted alkyl group." The "unsubstituted aralkyl group" is the "unsubstituted alkyl group" substituted by the "unsubstituted aryl group", and the number of carbon atoms of the "unsubstituted aralkyl group" is 7 to 50, preferably 7 to 30, more preferably 7 to 18, unless otherwise specified in this specification.

Specific examples of the "substituted or unsubstituted aralkyl group" include a benzyl group, a 1-phenylethyl group, a 2-phenylethyl group, a 1-phenylisopropyl group, a 2-phenylisopropyl group, a phenyl-t-butyl group, an α-naphthylmethyl group, a 1-α-naphthylethyl group, a 2-α-naphthylethyl group, a 1-α-naphthylisopropyl group, a 2-α-naphthylisopropyl group, a β-naphthylmethyl group, a 1-β-naphthylethyl group, a 2-β-naphthylethyl group, a 1-β-naphthylisopropyl group, a 2-β-naphthylisopropyl group, and the like.

Unless otherwise specified in this specification, examples of the substituted or unsubstituted aryl group described in this specification preferably include a phenyl group, a p-biphenyl group, a m-biphenyl group, an o-biphenyl group, a p-terphenyl-4-yl group, a p-terphenyl-3-yl group, a p-terphenyl-2-yl group, a m-terphenyl-4-yl group, a m-terphenyl-3-yl group, a m-terphenyl-2-yl group, an o-terphenyl-4-yl group, an o-terphenyl-3-yl group, an o-terphenyl-2-yl group, a 1-naphthyl group, a 2-naphthyl group, an anthryl group, a phenanthryl group, a pyrenyl group, a chrysenyl group, a triphenylenyl group, a fluorenyl group, a 9,9'-spirobifluorenyl group, 9,9-dimethylfluorenyl group, 9,9-diphenylfluorenyl group, and the like.

Unless otherwise specified in this specification, examples of the substituted or unsubstituted heterocyclic groups described in this specification preferably include a pyridyl group, a pyrimidinyl group, a triazinyl group, a quinolyl group, an isoquinolyl group, a quinazolinyl group, a benzimidazolyl group, a phenanthrolinyl group, a carbazolyl group (a 1-carbazolyl group, a 2-carbazolyl group, a 3-carbazolyl group, a 4-carbazolyl group, or a 9-carbazolyl group), a benzocarbazolyl group, an azacarbazolyl group, a diazacarbazolyl group, a dibenzofuranyl group, a naphthobenzofuranyl group, an azadibenzofuranyl group, a diazadibenzofuranyl group, a dibenzothiophenyl group, a naphthobenzothiophenyl group, an azadibenzothiophenyl group, a diazadibenzothiophenyl group, a (9-phenyl)carbazolyl group (a (9-phenyl)carbazol-1-yl group, a (9-phenyl)carbazol-2-yl group, a (9-phenyl)carbazol-3-yl group, or a (9-phenyl)carbazol-4-yl group), a (9-biphenylyl)carbazolyl group, a (9-phenyl)phenylcarbazolyl group, a diphenylcarbazol-9-yl group, a phenylcarbazol-9-yl group, a phenyltriazinyl group, a biphenylyltriazinyl group, a diphenyltriazinyl group, a phenyldibenzofuranyl group, a phenyldibenzothiophenyl group, and the like.

In this specification, the carbazolyl group is specifically any of the following groups, unless otherwise specified in this specification.

(TEMP-Cz1)

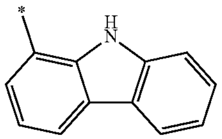

(TEMP-Cz2)

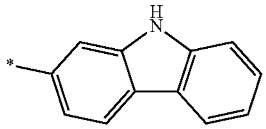

(TEMP-Cz3)

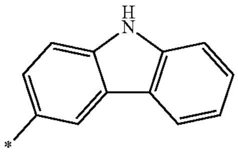

-continued (TEMP-Cz4)

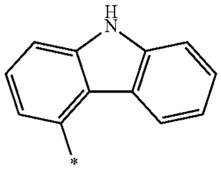

(TEMP-Cz5)

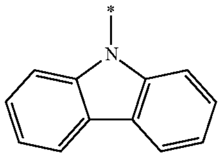

In this specification, the (9-phenyl)carbazolyl group is specifically any of the following groups, unless otherwise specified in this specification.

(TEMP-Cz6)

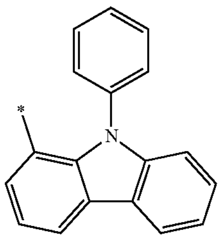

(TEMP-Cz7)

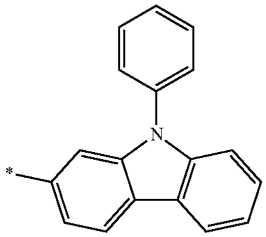

(TEMP-Cz8)

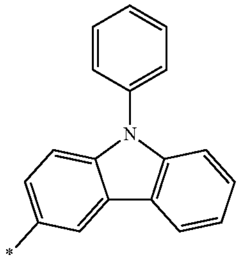

(TEMP-Cz9)

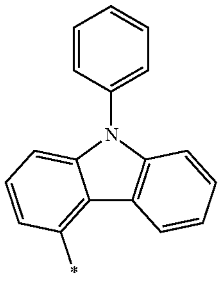

In the general formulas (TEMP-Cz1) to (TEMP-Cz9), * represents a bonding position.

In this specification, the dibenzofuranyl group and the dibenzothiophenyl group are specifically any of the following groups, unless otherwise specified in this specification.

(TEMP-34)

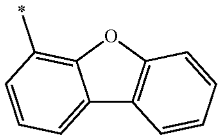

(TEMP-35)

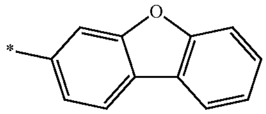

(TEMP-36)

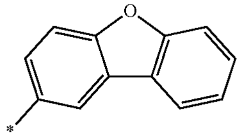

(TEMP-37)

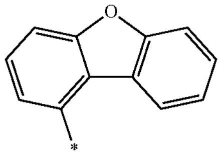

(TEMP-38)

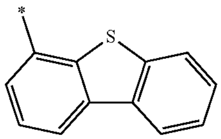

(TEMP-39)

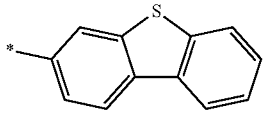

(TEMP-40)

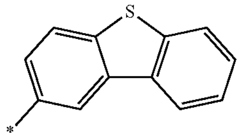

(TEMP-41)

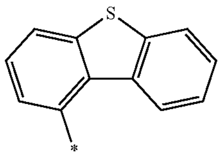

In the general formulas (TEMP-34) to (TEMP-41), * represents a bonding position.

The substituted or unsubstituted alkyl group described in this specification is preferably a methyl group, an ethyl group, a propyl group, an isopropyl group, a n-butyl group, an isobutyl group, a t-butyl group, or the like, unless otherwise specified in this specification.

"Substituted or Unsubstituted Arylene Group"

The "substituted or unsubstituted arylene group" described in this specification is a divalent group derived by removing one hydrogen atom on the aryl ring of the "substituted or unsubstituted aryl group", unless otherwise specified. Specific examples of the "substituted or unsubstituted arylene group" (specific example group G12) include a divalent group derived by removing one hydrogen atom on the aryl ring of the "substituted or unsubstituted aryl group" described in the specific example group G1, and the like.

"Substituted or Unsubstituted Divalent Heterocyclic Group"

The "substituted or unsubstituted divalent heterocyclic group" described in this specification is a divalent group derived by removing one hydrogen atom on the heterocyclic ring of the "substituted or unsubstituted heterocyclic group", unless otherwise specified. Specific examples of the "substituted or unsubstituted divalent heterocyclic group" (specific example group G13) include a divalent group derived by removing one hydrogen atom on the heterocyclic ring of the "substituted or unsubstituted heterocyclic group" described in the specific example group G2, and the like.

"Substituted or Unsubstituted Alkylene Group"

The "substituted or unsubstituted alkylene group" described in this specification is a divalent group derived by removing one hydrogen atom on the alkyl chain of the "substituted or unsubstituted alkyl group", unless otherwise specified. Specific examples of the "substituted or unsubstituted alkylene group" (specific example group G14) include a divalent group derived by removing one hydrogen atom on the alkyl chain of the "substituted or unsubstituted alkyl group" described in the specific example group G3, and the like.

The substituted or unsubstituted arylene group described in this specification is preferably any group of the following general formulas (TEMP-42) to (TEMP-68), unless otherwise specified in this specification.

(TEMP-42)

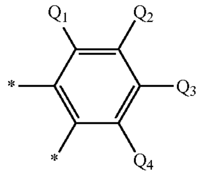

(TEMP-43)

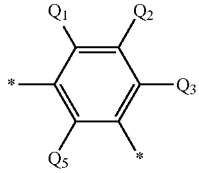

(TEMP-44)

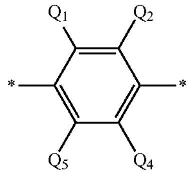

(TEMP-45)

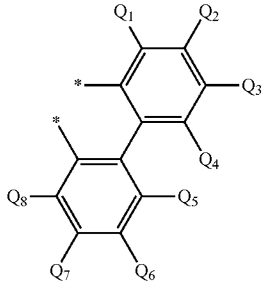

-continued
(TEMP-46)
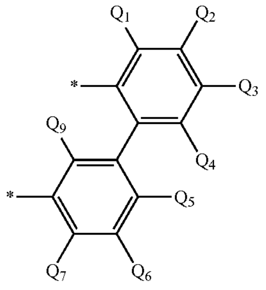
(TEMP-47)
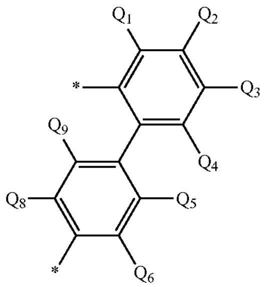
(TEMP-48)
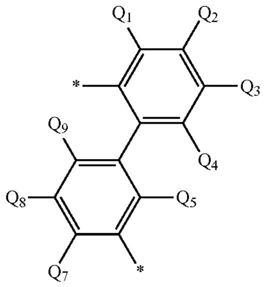
(TEMP-49)
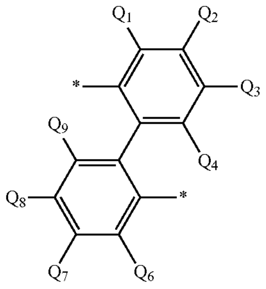
(TEMP-50)
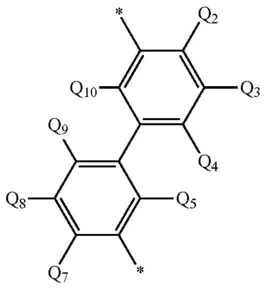
-continued
(TEMP-51)
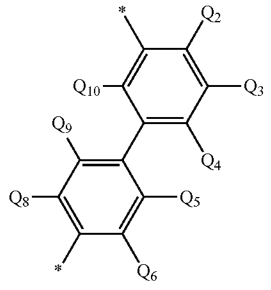
(TEMP-52)
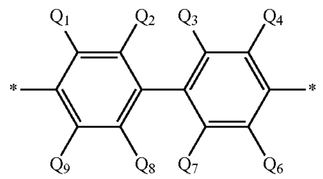
In the general formulas (TEMP-42) to (TEMP-52), $Q_1$ to $Q_{10}$ are independently a hydrogen atom or a substituent.
In the general formulas (TEMP-42) to (TEMP-52), * represents a bonding position.
(TEMP-53)
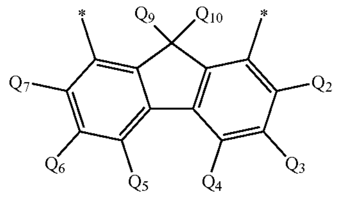
(TEMP-54)
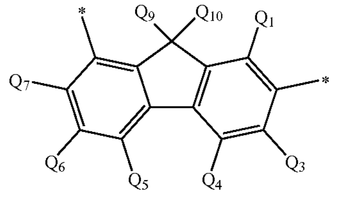
(TEMP-55)
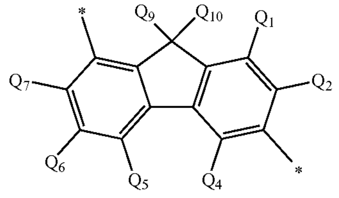
(TEMP-56)
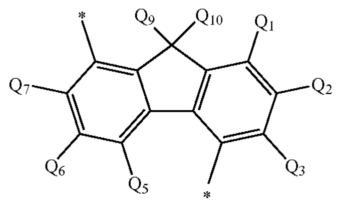

-continued (TEMP-57)

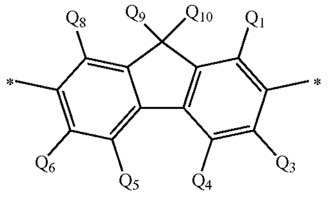

(TEMP-58)

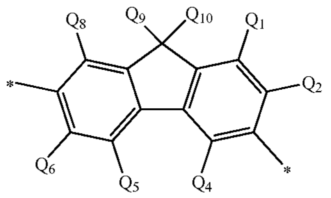

(TEMP-59)

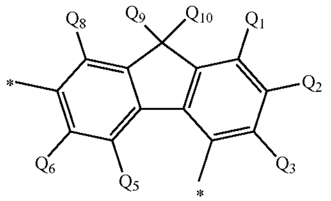

(TEMP-60)

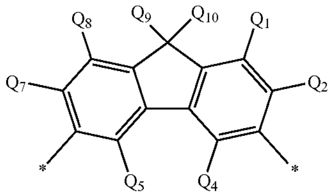

(TEMP-61)

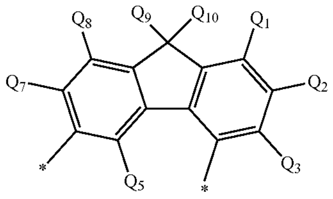

(TEMP-62)

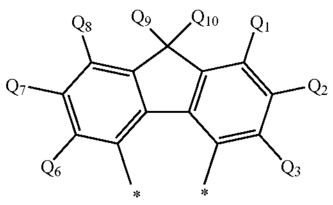

(TEMP-63)

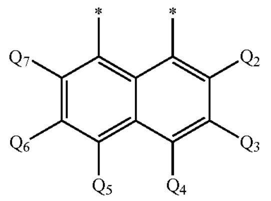

(TEMP-64)

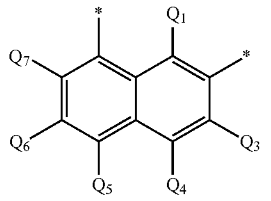

(TEMP-65)

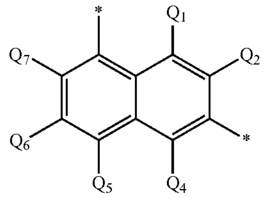

(TEMP-66)

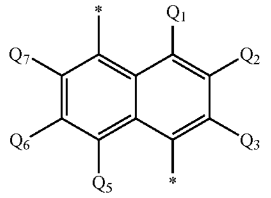

(TEMP-67)

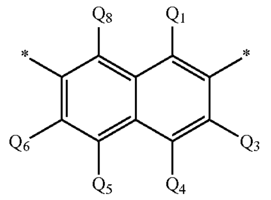

(TEMP-68)

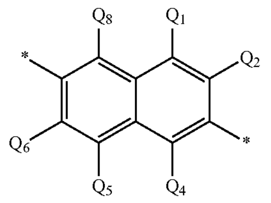

In the general formulas (TEMP-53) to (TEMP-62), $Q_1$ to $Q_{10}$ are independently a hydrogen atom or a substituent.

$Q_9$ and $Q_{10}$ may be bonded with each other via a single bond to form a ring.

In the general formulas (TEMP-53) to (TEMP-62), * represents a bonding position.

In the general formulas (TEMP-63) to (TEMP-68), $Q_1$ to $Q_8$ are independently a hydrogen atom or a substituent.

In the general formulas (TEMP-63) to (TEMP-68), * represents a bonding position.

The substituted or unsubstituted divalent heterocyclic group described in this specification is preferably any group of the following general formulas (TEMP-69) to (TEMP-102), unless otherwise specified in this specification.

-continued
(TEMP-69)
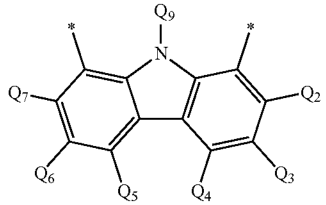
(TEMP-70)
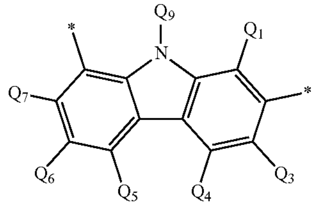
(TEMP-71)
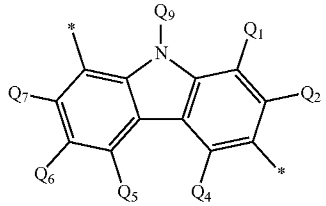
(TEMP-72)
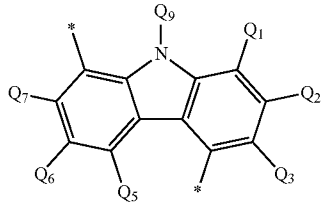
(TEMP-73)
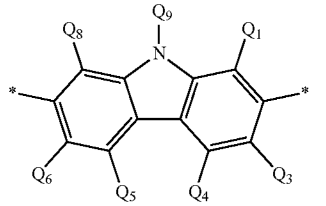
(TEMP-74)
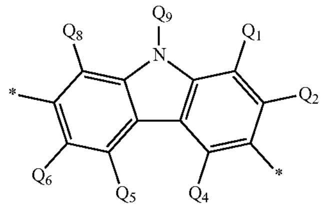
(TEMP-75)
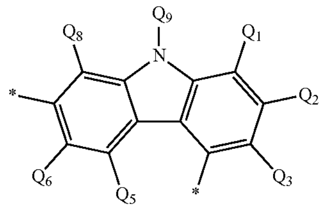
(TEMP-76)
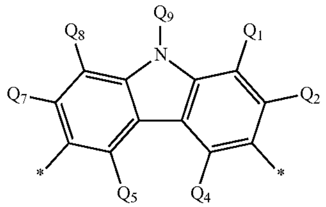
(TEMP-77)
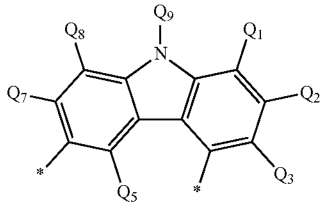
(TEMP-78)
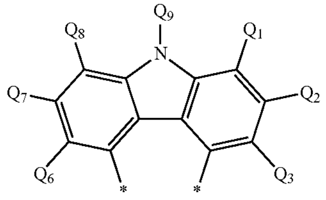
(TEMP-79)
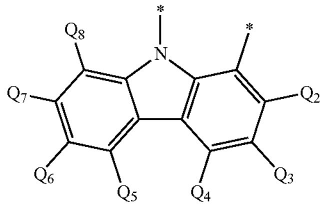
(TEMP-80)
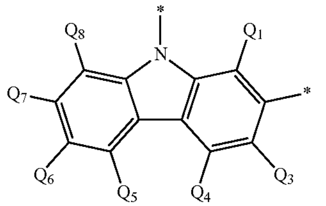
(TEMP-81)
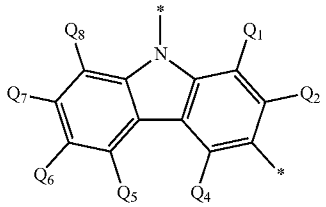
(TEMP-82)
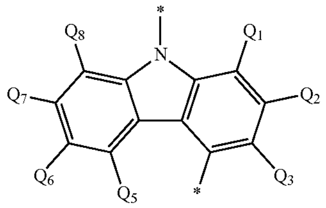
In the general formulas (TEMP-69) to (TEMP-82), $Q_1$ to $Q_9$ are independently a hydrogen atom or a substituent.

-continued
(TEMP-83)
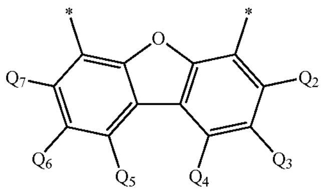
(TEMP-84)
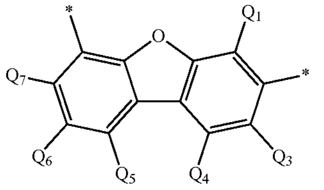
(TEMP-85)
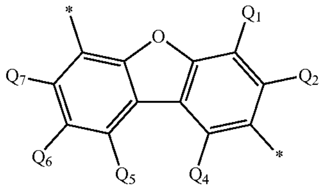
(TEMP-86)
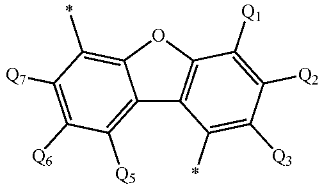
(TEMP-87)
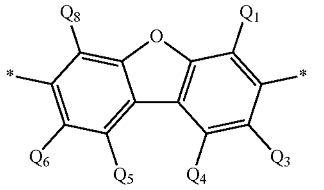
(TEMP-88)
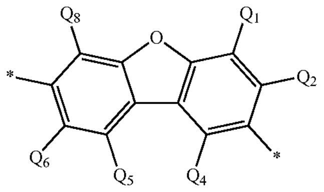
(TEMP-89)
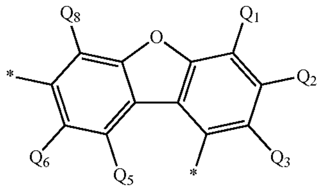
(TEMP-90)
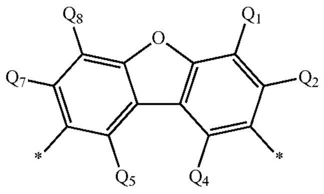
(TEMP-91)
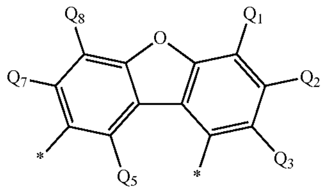
(TEMP-92)
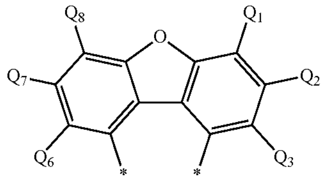
(TEMP-93)
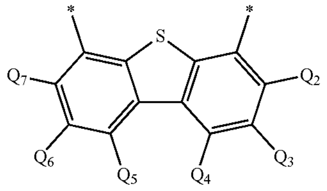
(TEMP-94)
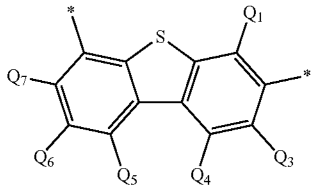
(TEMP-95)
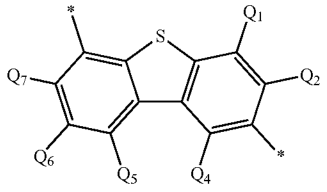
(TEMP-96)
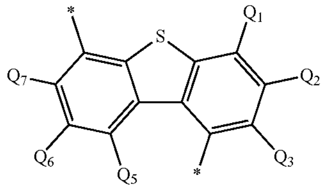
(TEMP-97)
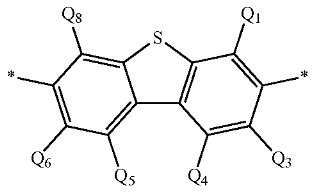
(TEMP-98)
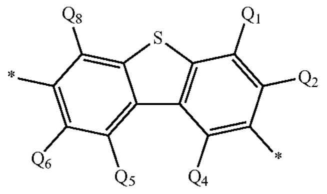

-continued (TEMP-99)

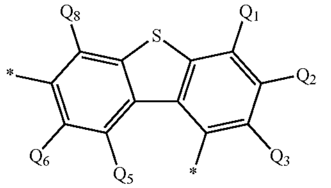

(TEMP-100)

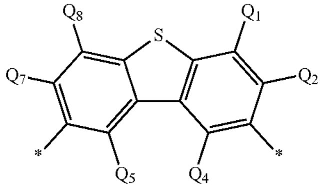

(TEMP-101)

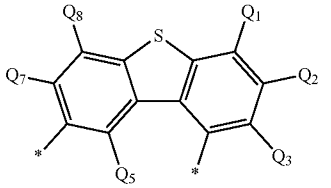

(TEMP-102)

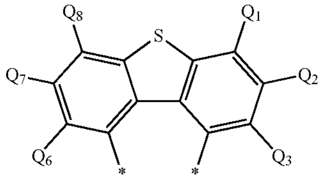

In the general formulas (TEMP-83) to (TEMP-102), $Q_1$ to $Q_8$ are independently a hydrogen atom or a substituent.

The above is the explanation of the "Substituent described in this specification."

"The Case where Bonded with Each Other to Form a Ring"

In this specification, the case where "one or more sets of adjacent two or more form a substituted or unsubstituted monocycle by bonding with each other, form a substituted or unsubstituted fused ring by bonding with each other, or do not bond with each other" means the case where "one or more sets of adjacent two or more form a substituted or unsubstituted monocycle by bonding with each other"; the case where "one or more sets of adjacent two or more form a substituted or unsubstituted fused ring by bonding with each other"; and the case where "one or more sets of adjacent two or more do not bond with each other."

The case where "one or more sets of adjacent two or more form a substituted or unsubstituted monocycle by bonding with each other" and the case where "one or more sets of adjacent two or more form a substituted or unsubstituted fused ring by bonding with each other" in this specification (these cases may be collectively referred to as "the case where forming a ring by bonding with each other") will be described below. The case of an anthracene compound represented by the following general formula (TEMP-103) in which the mother skeleton is an anthracene ring will be described as an example.

(TEMP-103)

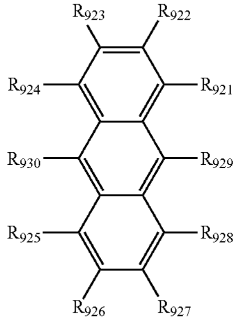

For example, in the case where "one or more sets of adjacent two or more among $R_{921}$ to $R_{930}$ form a ring by bonding with each other", the one set of adjacent two includes a pair of $R_{921}$ and $R_{922}$, a pair of $R_{922}$ and $R_{923}$, a pair of $R_{923}$ and $R_{924}$, a pair of $R_{924}$ and $R_{930}$, a pair of $R_{930}$ and $R_{925}$, a pair of $R_{925}$ and $R_{926}$, a pair of $R_{926}$ and $R_{927}$, a pair of $R_{927}$ and $R_{928}$, a pair of $R_{928}$ and $R_{929}$, and a pair of $R_{929}$ and $R_{921}$.

The "one or more sets" means that two or more sets of the adjacent two or more sets may form a ring at the same time. For example, $R_{921}$ and $R_{922}$ form a ring $Q_A$ by bonding with each other, and at the same, time $R_{925}$ and $R_{926}$ form a ring $Q_B$ by bonding with each other, the anthracene compound represented by the general formula (TEMP-103) is represented by the following general formula (TEMP-104).

(TEMP-104)

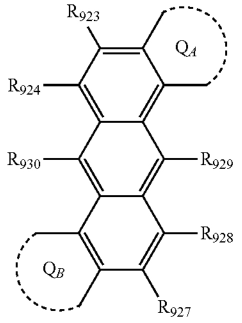

The case where the "set of adjacent two or more" form a ring includes not only the case where the set (pair) of adjacent "two" is bonded with as in the above-mentioned examples, but also the case where the set of adjacent "three or more" are bonded with each other. For example, it means the case where $R_{921}$ and $R_{922}$ form a ring $Q_A$ by bonding with each other, and $R_{922}$ and $R_{923}$ form a ring Qc by bonding with each other, and adjacent three ($R_{921}$, $R_{922}$ and $R_{923}$) form rings by bonding with each other and together fused to the anthracene mother skeleton. In this case, the anthracene compound represented by the general formula (TEMP-103) is represented by the following general formula (TEMP-105). In the following general formula (TEMP-105), the ring $Q_A$ and the ring Qc share $R_{922}$.

(TEMP-105)

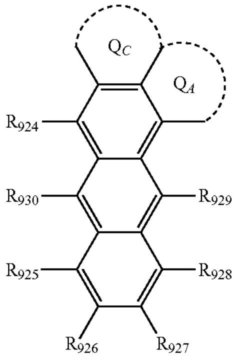

The "monocycle" or "fused ring" formed may be a saturated ring or an unsaturated ring, as a structure of the formed ring alone. Even when the "one pair of adjacent two" forms a "monocycle" or a "fused ring", the "monocycle" or the "fused ring" may form a saturated ring or an unsaturated ring. For example, the ring $Q_A$ and the ring $Q_B$ formed in the general formula (TEMP-104) are independently a "monocycle" or a "fused ring." The ring $Q_A$ and the ring Qc formed in the general formula (TEMP-105) are "fused ring." The ring $Q_A$ and ring Qc of the general formula (TEMP-105) are fused ring by fusing the ring $Q_A$ and the ring Qc together. When the ring $Q_A$ of the general formula (TMEP-104) is a benzene ring, the ring $Q_A$ is a monocycle. When the ring $Q_A$ of the general formula (TMEP-104) is a naphthalene ring, the ring $Q_A$ is a fused ring.

The "unsaturated ring" means an aromatic hydrocarbon ring or an aromatic heterocyclic ring. The "saturated ring" means an aliphatic hydrocarbon ring, or a non-aromatic heterocyclic ring.

Specific examples of the aromatic hydrocarbon ring include a structure in which the group listed as a specific example in the specific example group G1 is terminated by a hydrogen atom.

Specific examples of the aromatic heterocyclic ring include a structure in which the aromatic heterocyclic group listed as a specific example in the example group G2 is terminated by a hydrogen atom.

Specific examples of the aliphatic hydrocarbon ring include a structure in which the group listed as a specific example in the specific example group G6 is terminated by a hydrogen atom.

The term "to form a ring" means forming a ring only with plural atoms of the mother skeleton, or with plural atoms of the mother skeleton and one or more arbitrary elements in addition. For example, the ring $Q_A$ shown in the general formula (TEMP-104), which is formed by bonding $R_{921}$ and $R_{922}$ with each other, is a ring formed from the carbon atom of the anthracene skeleton with which $R_{921}$ is bonded, the carbon atom of the anthracene skeleton with which $R_{922}$ is bonded, and one or more arbitrary elements. For example, in the case where the ring $Q_A$ is formed with $R_{921}$ and $R_{922}$, when a monocyclic unsaturated ring is formed with the carbon atom of the anthracene skeleton with which $R_{921}$ is bonded, the carbon atom of the anthracene skeleton with which $R_{922}$ is bonded, and four carbon atoms, the ring formed with $R_{921}$ and $R_{922}$ is a benzene ring.

Here, the "arbitrary element" is preferably at least one element selected from the group consisting of a carbon element, a nitrogen element, an oxygen element, and a sulfur element, unless otherwise specified in this specification. In the arbitrary element (for example, a carbon element or a nitrogen element), a bond which does not form a ring may be terminated with a hydrogen atom or the like, or may be substituted with "arbitrary substituent" described below. When an arbitrary element other than a carbon element is contained, the ring formed is a heterocyclic ring.

The number of "one or more arbitrary element(s)" constituting a monocycle or a fused ring is preferably 2 or more and 15 or less, more preferably 3 or more and 12 or less, and still more preferably 3 or more and 5 or less, unless otherwise specified in this specification.

The "monocycle" is preferable among the "monocycle" and the "fused ring", unless otherwise specified in this specification.

The "unsaturated ring" is preferable among the "saturated ring" and the "unsaturated ring", unless otherwise specified in this specification. Unless otherwise specified in this specification, the "monocycle" is preferably a benzene ring.

Unless otherwise specified in this specification, the "unsaturated ring" is preferably a benzene ring.

Unless otherwise specified in this specification, when "one or more sets of adjacent two or more" are "bonded with each other to form a substituted or unsubstituted monocycle" or "bonded with each other to form a substituted or unsubstituted fused ring", this specification, one or more sets of adjacent two or more are preferably bonded with each other to form a substituted or unsubstituted "unsaturated ring" from plural atoms of the mother skeleton and one or more and 15 or less elements which is at least one kind selected from a carbon elements, a nitrogen element, an oxygen element, and a sulfur element.

The substituent in the case where the above-mentioned "monocycle" or "fused ring" has a substituent is, for example, an "arbitrary substituent" described below. Specific examples of the substituent which the above-mentioned "monocycle" or "fused ring" has include the substituent described above in the "Substituent described in this specification" section.

The substituent in the case where the above-mentioned "saturated ring" or "unsaturated ring" has a substituent is, for example, an "arbitrary substituent" described below. Specific examples of the substituent which the above-mentioned "monocycle" or "fused ring" has include the substituent described above in the "Substituent described in this specification" section.

The foregoing describes the case where "one or more sets of adjacent two or more form a substituted or unsubstituted monocycle by bonding with each other" and the case where "one or more sets of adjacent two or more form a substituted or unsubstituted fused ring by bonding with each other" (the case where "forming a ring by bonding with each other").

Substituent in the Case of "Substituted or Unsubstituted"

In one embodiment in this specification, the substituent (in this specification, sometimes referred to as an "arbitrary substituent") in the case of "substituted or unsubstituted" is, for example, a group selected from the group consisting of:

an unsubstituted alkyl group including 1 to 50 carbon atoms, an unsubstituted alkenyl group including 2 to 50 carbon atoms, an unsubstituted alkynyl group including 2 to 50 carbon atoms, an unsubstituted cycloalkyl group including 3 to 50 ring carbon atoms, $—Si(R_{901})(R_{902})(R_{903})$, $—O—(R_{904})$, $—S—(R_{905})$,

—$N(R_{906})(R_{907})$, a halogen atom, a cyano group, a nitro group, an unsubstituted aryl group including 6 to 50 ring carbon atoms, and an unsubstituted heterocyclic group including 5 to 50 ring atoms, wherein, $R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted heterocyclic group including 5 to 50 ring atoms.

When two or more $R_{901}$'s are present, the two or more $R_{901}$'s may be the same or different.

When two or more $R_{902}$'s are present, the two or more $R_{902}$'s may be the same or different.

When two or more $R_{903}$'s are present, the two or more $R_{903}$'s may be the same or different.

When two or more $R_{904}$'s are present, the two or more $R_{904}$'s may be the same or different.

When two or more $R_{905}$'s are present, the two or more $R_{905}$'s may be the same or different.

When two or more $R_{906}$'s are present, the two or more $R_{906}$'s may be the same or different.

When two or more $R_{907}$'s are present, the two or more $R_{907}$'s may be the same or different.

In one embodiment, the substituent in the case of "substituted or unsubstituted" is a group selected from the group consisting of:

an alkyl group including 1 to 50 carbon atoms, an aryl group including 6 to 50 ring carbon atoms, and a heterocyclic group including 5 to 50 ring atoms.

In one embodiment, the substituent in the case of "substituted or unsubstituted" is a group selected from the group consisting of:

an alkyl group including 1 to 18 carbon atoms, an aryl group including 6 to 18 ring carbon atoms, and a heterocyclic group including 5 to 18 ring atoms.

Specific examples of each of the arbitrary substituents include specific examples of substituent described in the section "Substituent described in this specification" above.

Unless otherwise specified in this specification, adjacent arbitrary substituents may form a "saturated ring" or an "unsaturated ring", preferably form a substituted or unsubstituted saturated 5-membered ring, a substituted or unsubstituted saturated 6-membered ring, a substituted or unsubstituted unsaturated 5-membered ring, or a substituted or unsubstituted unsaturated 6-membered ring, more preferably form a benzene ring.

Unless otherwise specified in this specification, the arbitrary substituent may further have a substituent. The substituent which the arbitrary substituent further has is the same as that of the above-mentioned arbitrary substituent.

In this specification, the numerical range represented by "AA to BB" means the range including the numerical value AA described on the front side of "AA to BB" as the lower limit and the numerical value BB described on the rear side of "AA to BB" as the upper limit.

[Organic EL Device]

The organic EL device according to an aspect of the invention is an organic EL device including a cathode, an anode, and an emitting layer disposed between the cathode and the anode, wherein the emitting layer contains a first host material, a second host material, and a dopant material.

The organic EL device according to an aspect of the invention exhibits high device performance by having the above-mentioned configuration. Specifically, an organic EL device having a low driving voltage and a high external quantum efficiency can be provided.

Details of each material will be described later.

Schematic configuration of organic EL device according to an aspect of the invention will be explained with reference to the FIGURE.

The organic EL device 1 according to an aspect of the invention includes a substrate 2, an anode 3, an emitting layer 5, a cathode 10, an organic layer 4 disposed between the anode 3 and the emitting layer 5, and an organic layer 6 disposed between the emitting layer 5 and the cathode 10.

The first host material, the second host material, and the dopant material are contained in the emitting layer 5 disposed between the anode 3 and the cathode 10. Each of the compounds contained in the emitting layer 5 may be one compound alone or two or more compounds.

Although the organic EL device 1 may include an emitting layer other than the emitting layer 5, in an aspect of the invention, one emitting layer (emitting layer 5) generally contains the first host material, the second host material, and the dopant material.

(First Host Material)

The first host material is a compound represented by the following formula (1);

provided that the first host material and the second host material described later are different compounds:

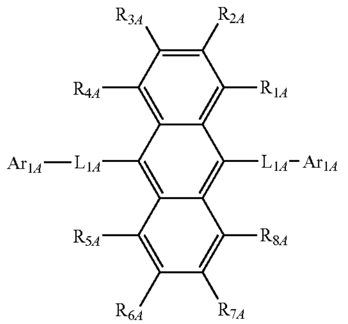

(1)

In the formula (1), $R_{1A}$ to $R_{8A}$ are independently a hydrogen atom, a substituent R, or a group represented by the following formula (1A);

the substituent R is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

when two or more of the substituents R are present, the two or more of the substituents R may be the same as or different from each other;

$L_{1A}$'s are independently a single bond, a substituted or unsubstituted arylene group including 6 to 50 ring carbon atoms, or a substituted or unsubstituted divalent heterocyclic group including 5 to 50 ring atoms;

$Ar_{1A}$'s are independently a substituted or unsubstituted aryl group including 6 to 50 ring carbon atoms, or a substituted or unsubstituted monovalent heterocyclic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when two or more of each of $R_{901}$ to $R_{907}$ are present, the two or more of each of $R_{901}$ to $R_{907}$ are the same as or different from each other;

$$-L_{1A}-Ar_{1A} \quad (1A)$$

wherein in the formula (1A), $L_1A$ and $Ar_{1A}$ are as defined in the formula (1); and when two or more groups represented by the formula (1A) are present, the two or more of the groups represented by the formula (1A) may be the same as or different from each other.

Any of the hydrogen atoms possessed by the compound represented by the formula (1) may be a deuterium atom.

In one embodiment, the compound represented by the formula (1) is a compound represented by the following formula (1-1):

(1-1)

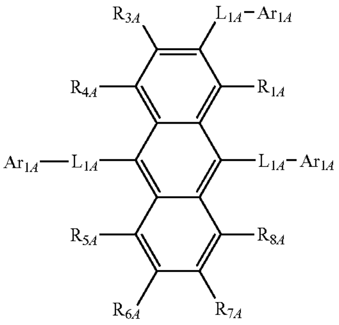

In the formula (1-1), $R_{1A}$, $R_{3A}$ to $R_{8A}$, $L_{1A}$, and $Ar_{1A}$ are as defined in the formula (1).

In one embodiment, the compound represented by the formula (1) is a compound represented by the following formula (1-11), the following formula (1-12), or the following formula (1-13):

(1-11)

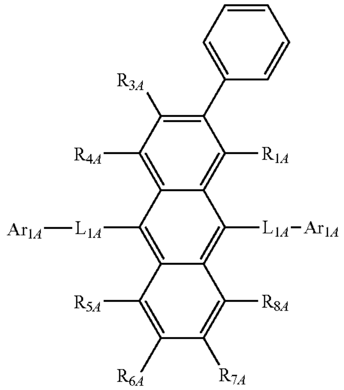

(1-12)

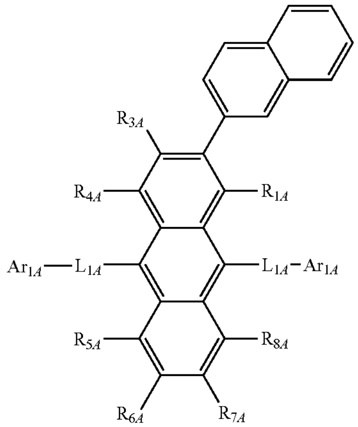

(1-13)

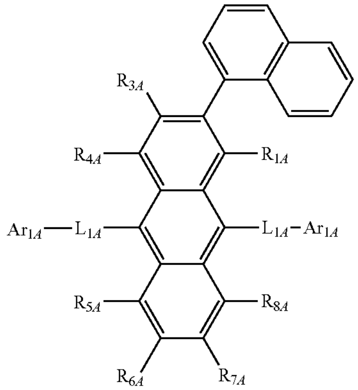

In the formula (1-11), the formula (1-12), and the formula (1-13), $R_{1A}$, $R_{3A}$ to $R_{8A}$, $L_{1A}$, and $Ar_{1A}$ are as defined in the formula (1).

In one embodiment, the compound represented by the formula (1) is a compound represented by the following formula (1-2):

(1-2)

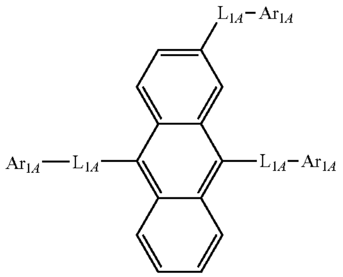

In the formula (1-2), $L_{1A}$ and $Ar_{1A}$ are as defined in the formula (1).

In one embodiment, the compound represented by the formula (1) is a compound represented by the following formula (1-21), the following formula (1-22), or the following formula (1-23):

(1-21)

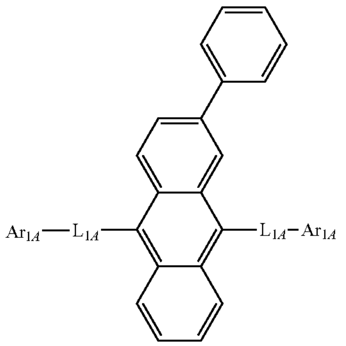

(1-22)

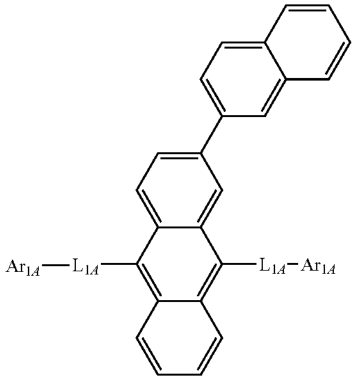

(1-23)

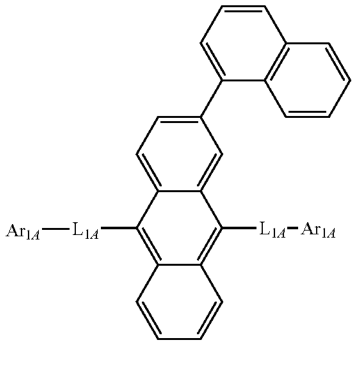

In the formula (1-21), the formula (1-22), and the formula (1-23), $L_{1A}$ and $Ar_{1A}$ are as defined in the formula (1).

In one embodiment, $L_{1A}$'s are independently a single bond or a substituted or unsubstituted arylene group including 6 to 14 ring carbon atoms.

In one embodiment, $L_{1A}$'s are independently a single bond, a substituted or unsubstituted phenylene group, or a substituted or unsubstituted naphthylene group.

In one embodiment, $Ar_{1A}$'s are independently a substituted or unsubstituted aryl group including 6 to 50 ring carbon atoms.

In one embodiment, $Ar_{1A}$'s are independently selected from groups represented by each of the following formulas (a1) to (a4):

(a1)

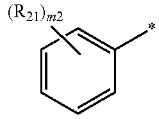

(a2)

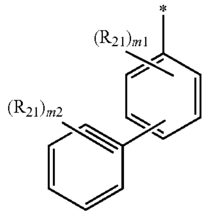

(a3)

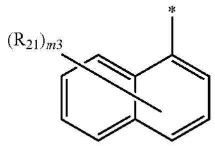

(a4)

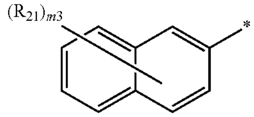

In the formulas (a1) to (a4), * is a single bond which bonds with $L_{1A}$;

$R_{21}$ is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $—Si(R_{901})(R_{902})(R_{903})$, $—O—(R_{904})$, $—S—(R_{905})$, $—N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{901}$ to $R_{907}$ are as defined in the formula (1);

m1 is an integer of 0 to 4;

m2 is an integer of 0 to 5;

m3 is an integer of 0 to 7;

when each of m1 to m3 is 2 or more, a plurality of $R_{21}$'s may be the same as or different from each other; and when each of m1 to m3 is 2 or more, a plurality of adjacent $R_{21}$'s form a substituted or unsubstituted, saturated or unsaturated ring by bonding with each other, or do not form a substituted or unsubstituted, saturated or unsaturated ring.

In one embodiment, at least one of $R_{1A}$ to $R_{8A}$ may be a deuterium atom, and all of $R_{1A}$ to $R_{8A}$ may be deuterium atoms.

In one embodiment, based on the total amount of a compound represented by the formula (1) and a compound having a structure same as the compound represented by the formula (1) except that only protium atoms are contained as hydrogen atoms (hereinafter also referred to as a "protium compound"), the content of the latter in the emitting layer is preferably 99 mol % or less. The content of the protium compound can be confirmed by mass spectrometry.

The compound represented by the formula (1) can be synthesized by using a known alternative reaction or a raw material tailored to the target compound.

Specific examples of the compound represented by the formula (1) will be described below, but these are merely illustrative, and the compound represented by the formula (1) is not limited to the following specific examples.

1-1

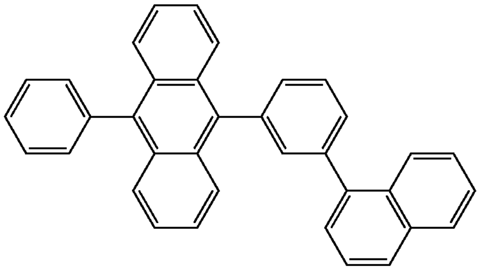

1-2

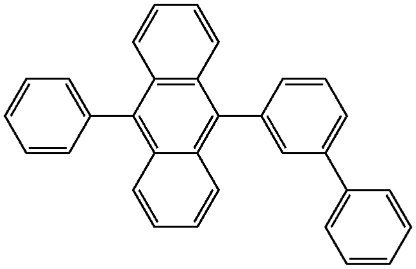

1-3

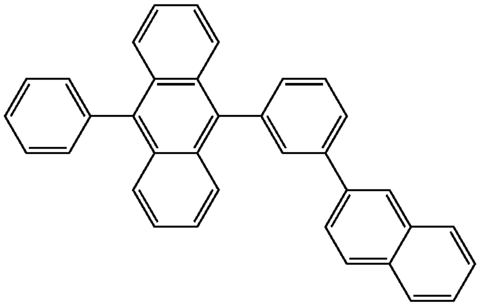

-continued 1-4

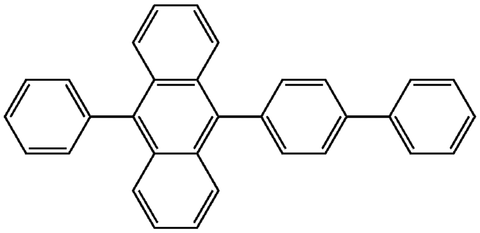

1-5

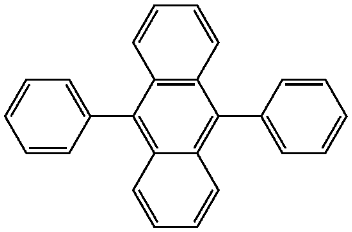

1-6

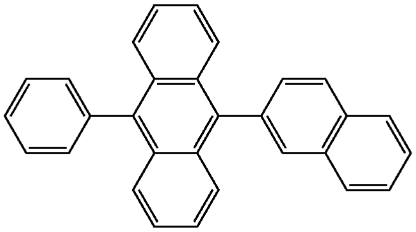

1-7

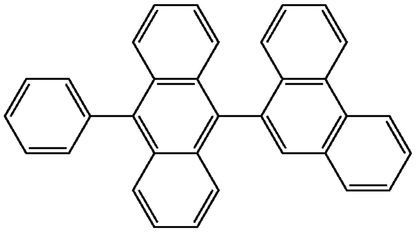

1-8

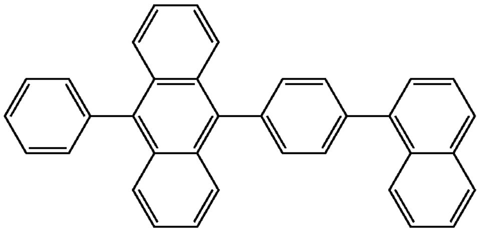

1-9

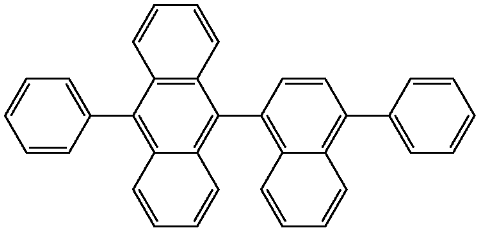

-continued
1-10
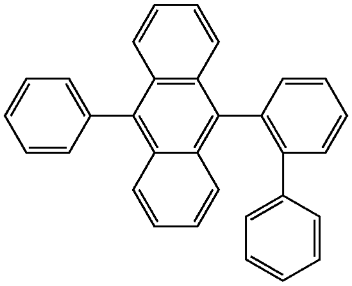
1-11
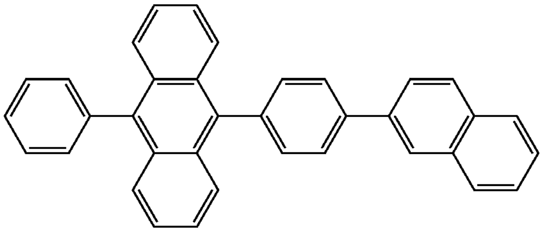
1-12
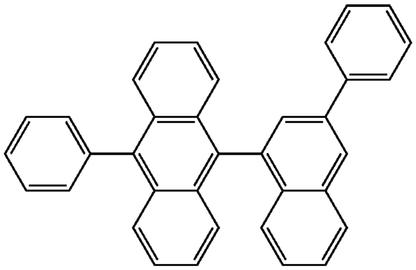
1-13
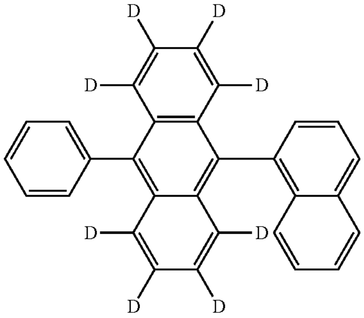
1-14
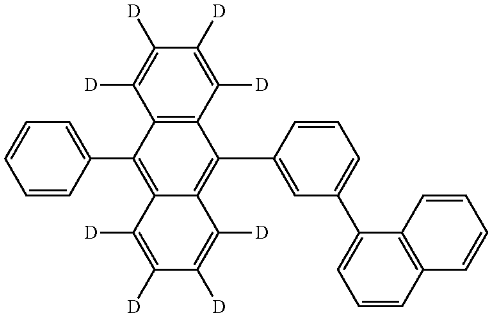
-continued
1-15
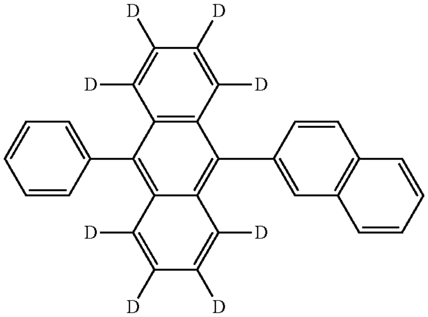
1-16
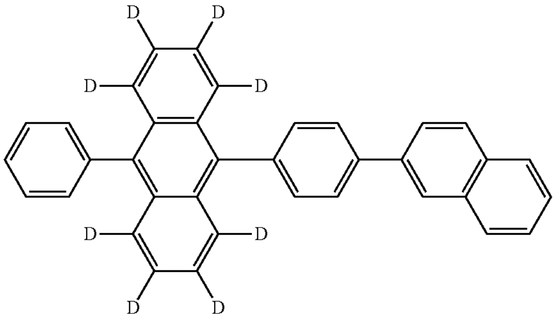
1-17
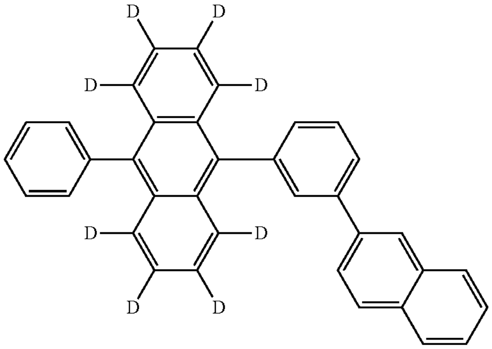
1-18
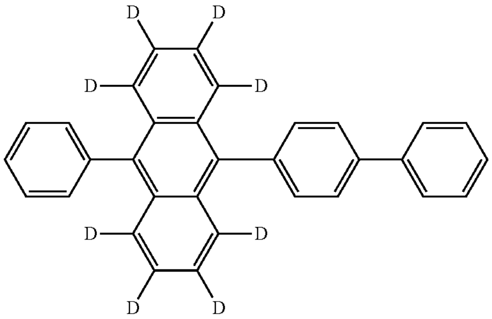

-continued
1-19
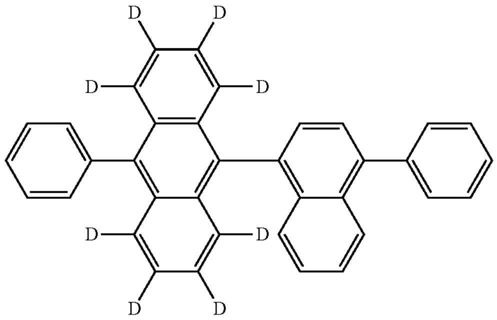
1-20
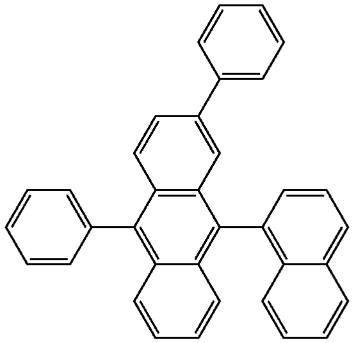
1-21
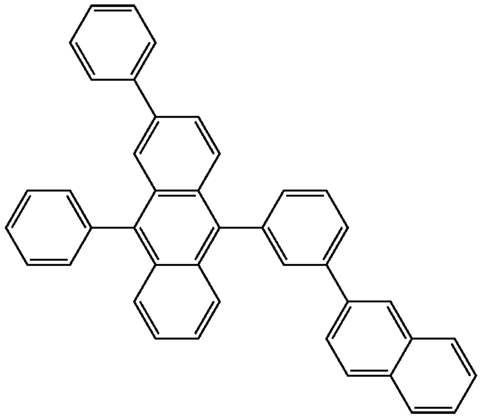
1-22
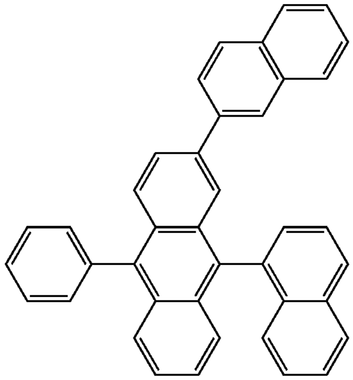
-continued
1-23
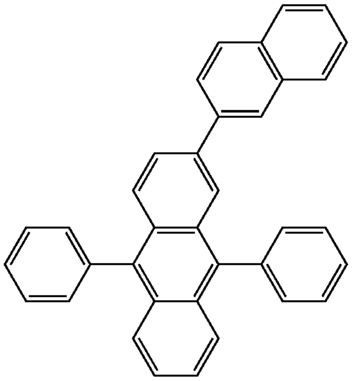
1-24
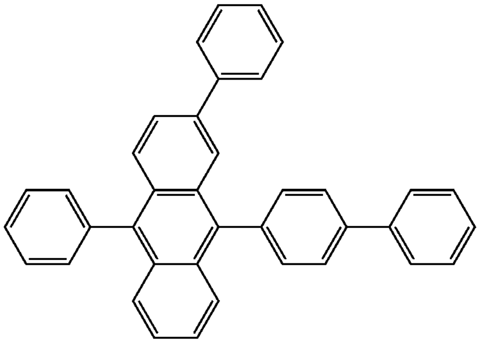
1-25
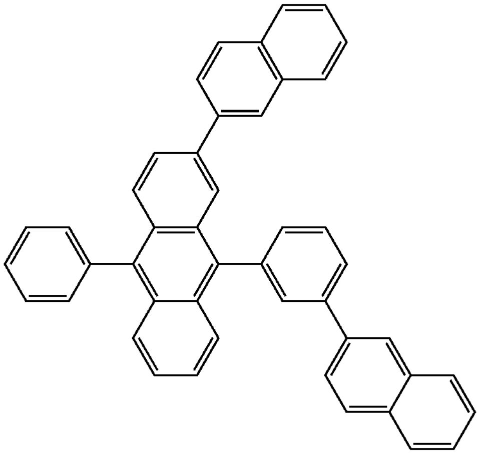
1-26
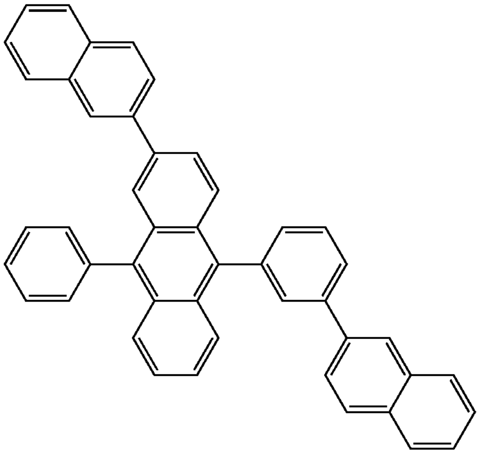

-continued
1-27
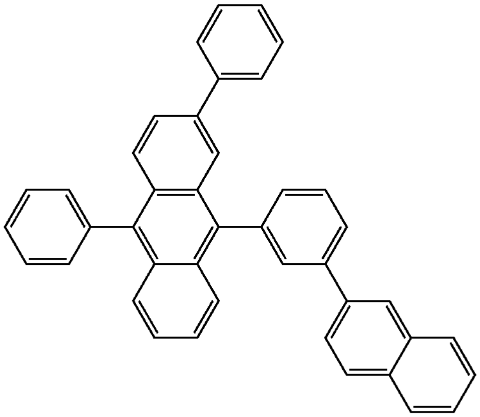
1-28
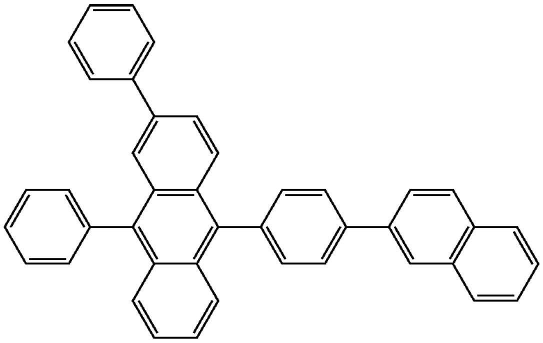
1-29
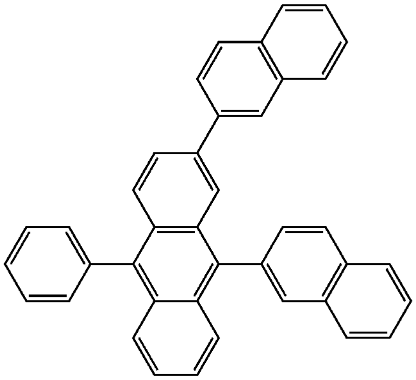
1-30
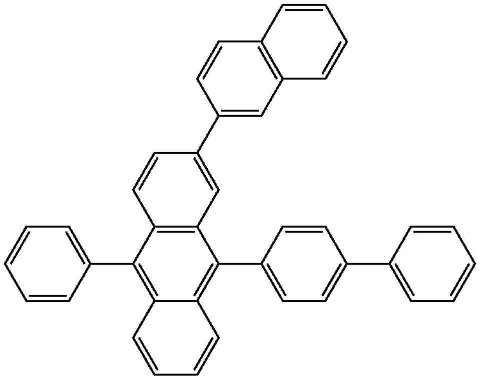
-continued
1-31
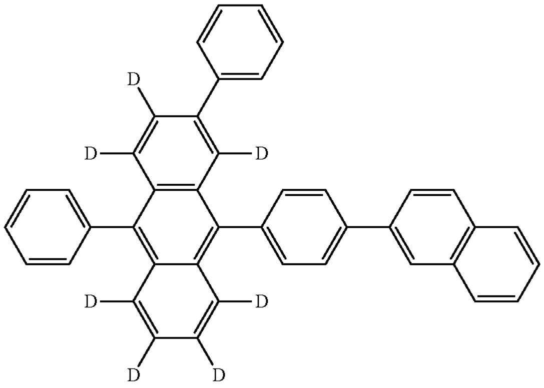
1-32
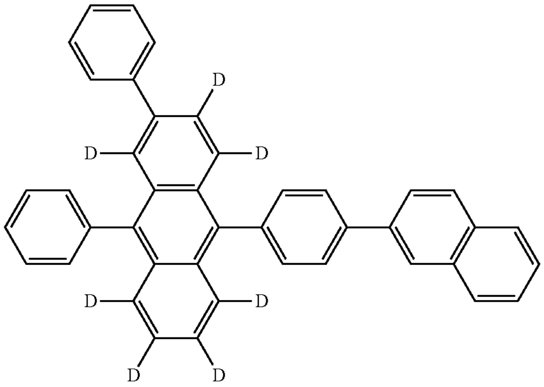
1-33
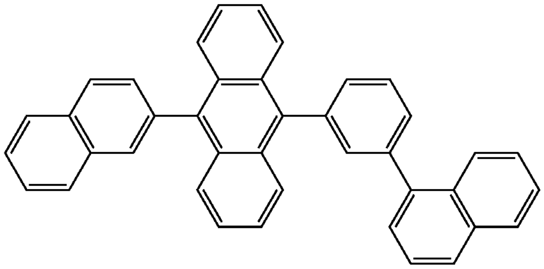
1-34
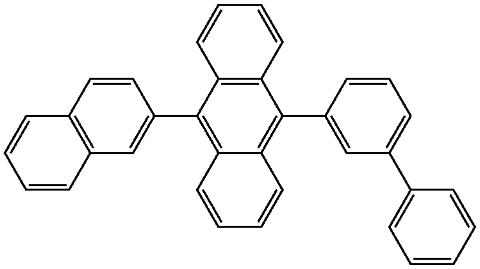
1-35
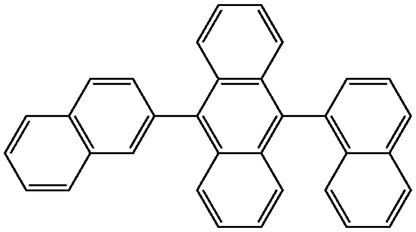

-continued
1-36
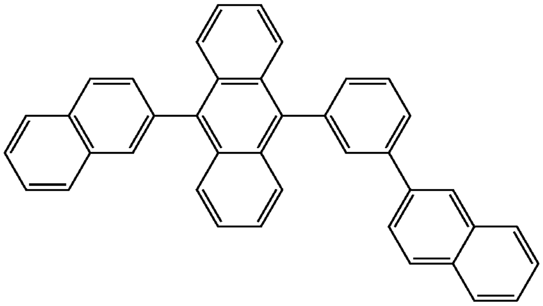
1-37
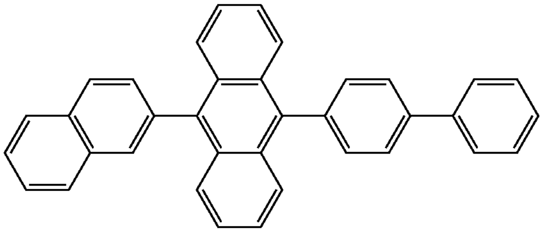
1-38
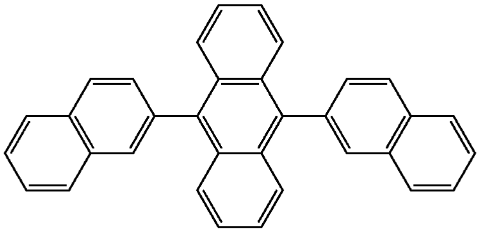
1-39
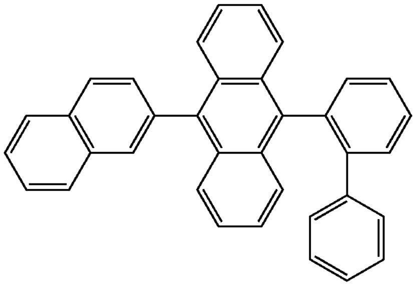
1-40
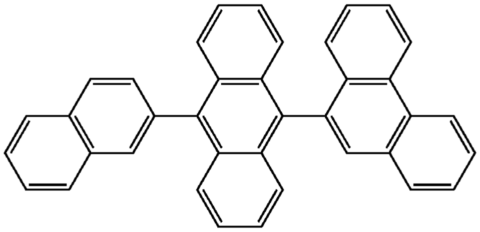
1-41
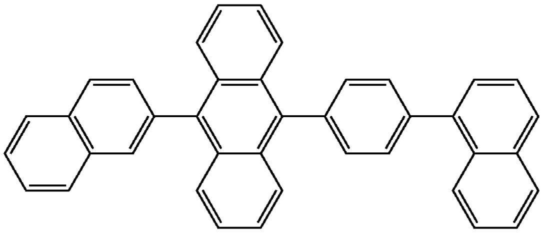
-continued
1-42
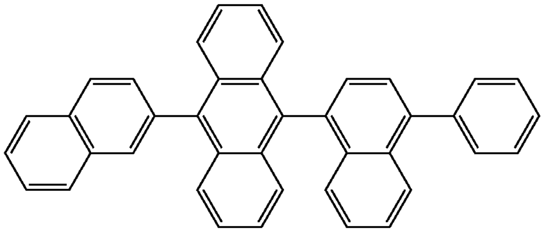
1-43
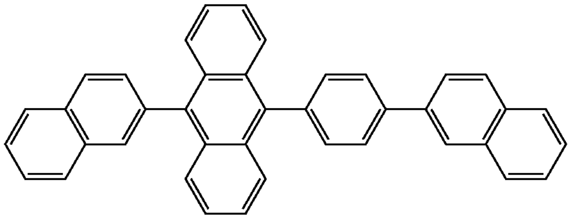
1-44
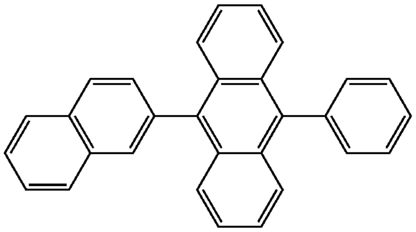
1-45
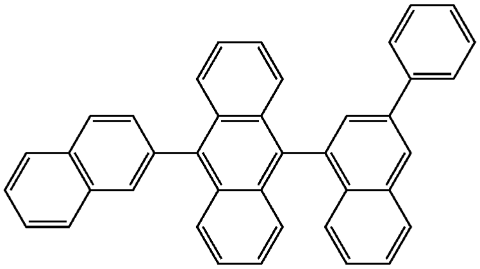
1-46
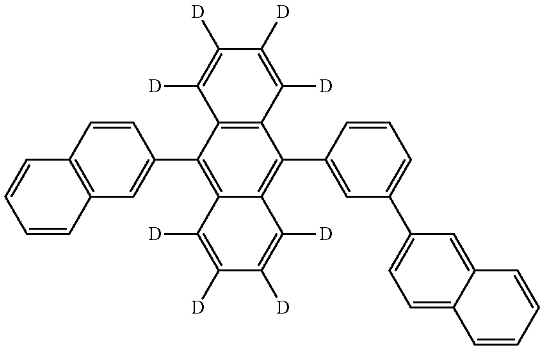

-continued
1-47
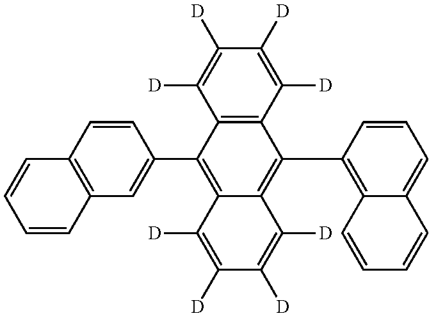
1-48
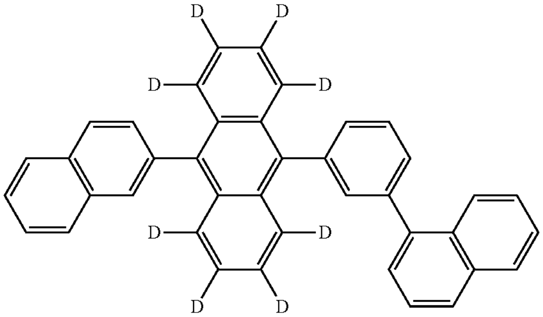
1-49
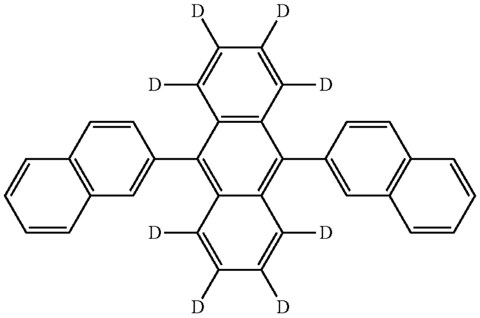
1-50
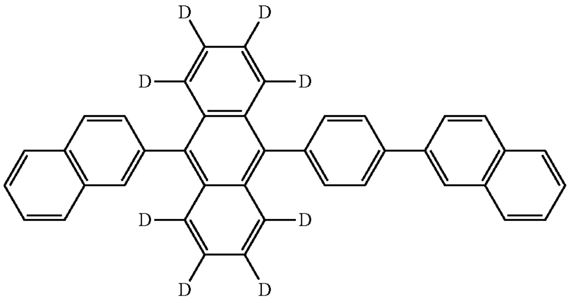
-continued
1-51
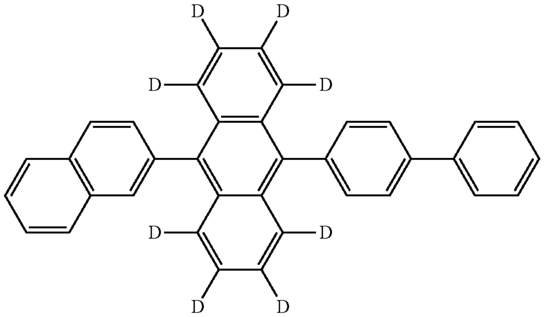
1-52
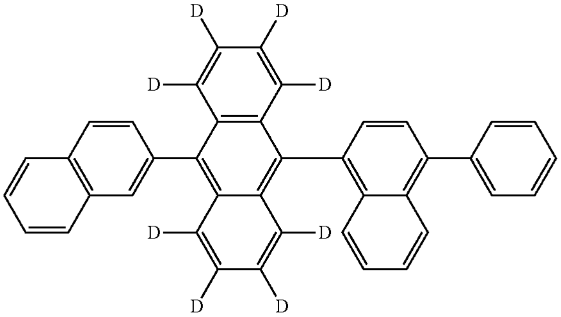
1-53
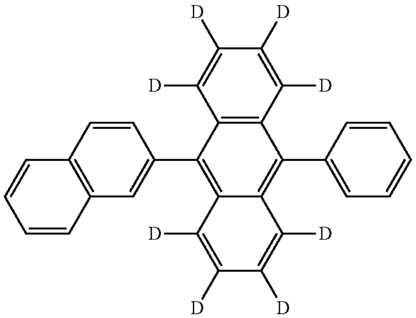
1-54
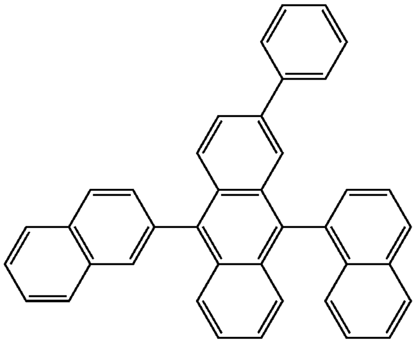

-continued
1-55
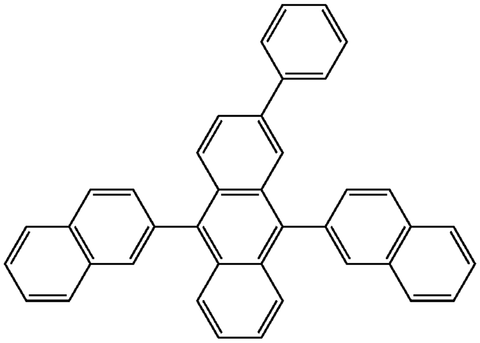
1-56
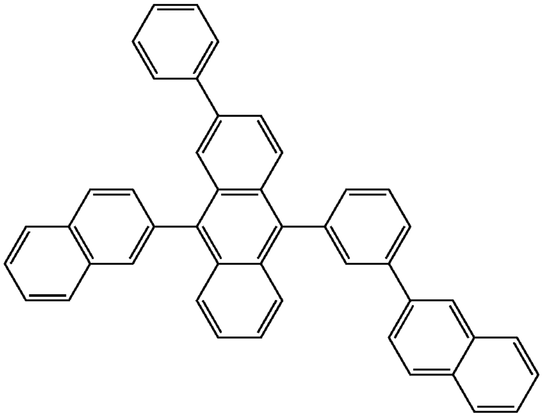
1-57
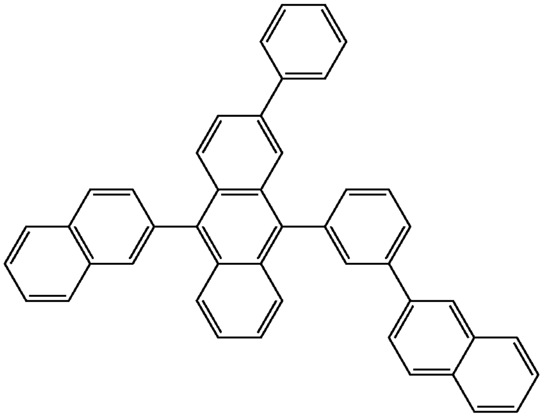
1-58
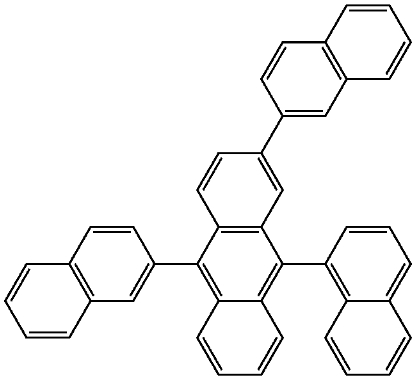
-continued
1-59
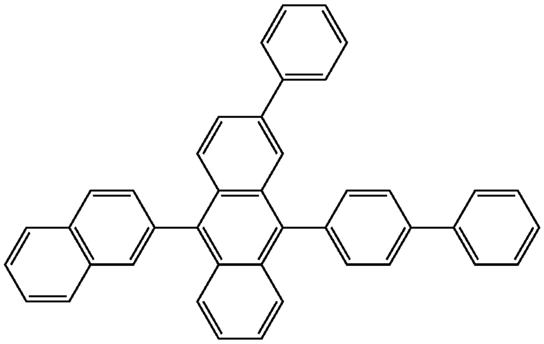
1-60
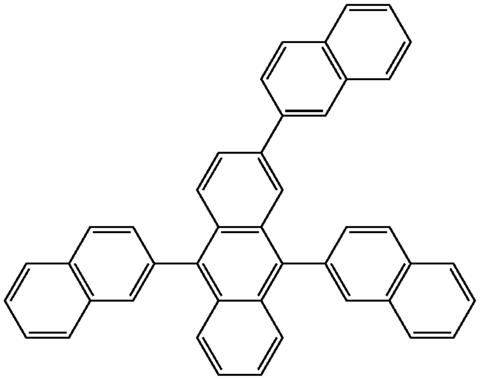
1-61
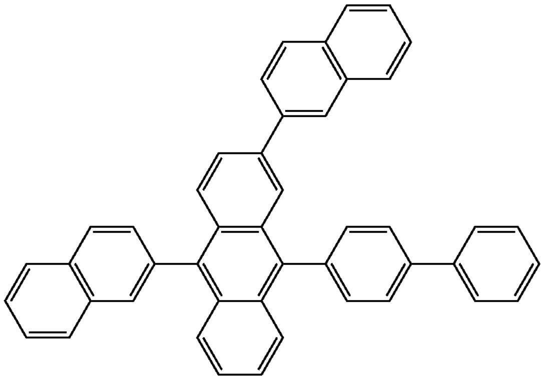
1-62
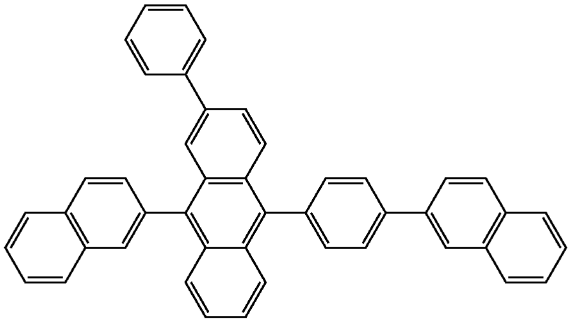

-continued
1-63
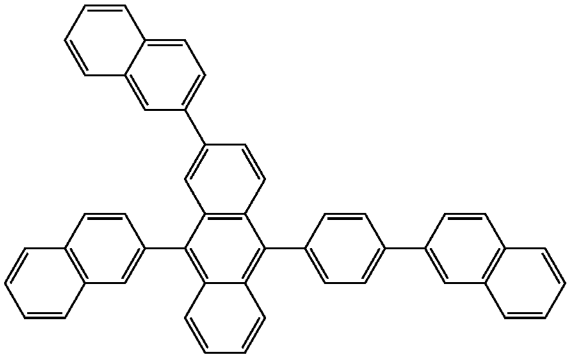
1-64
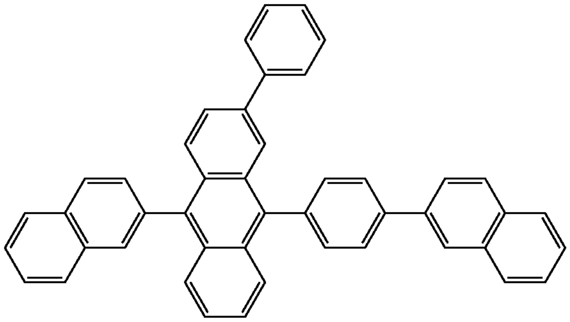
1-65
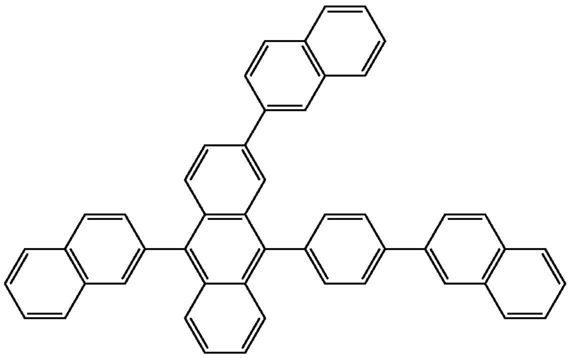
1-66
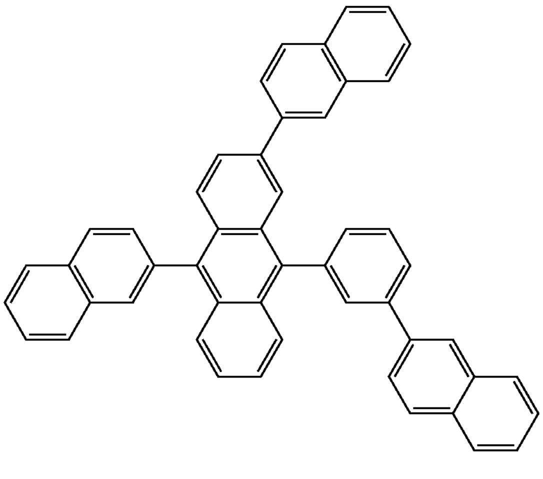
-continued
1-67
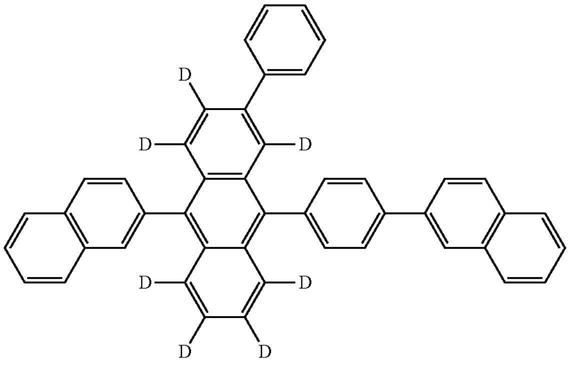
1-68
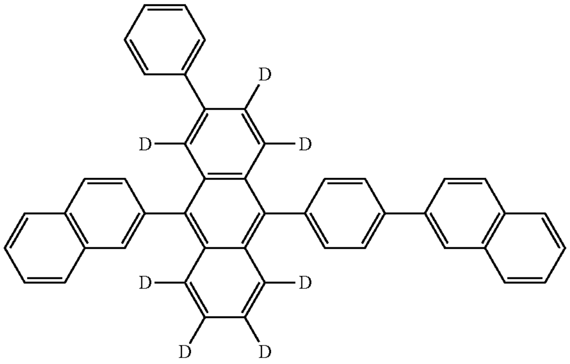
1-69
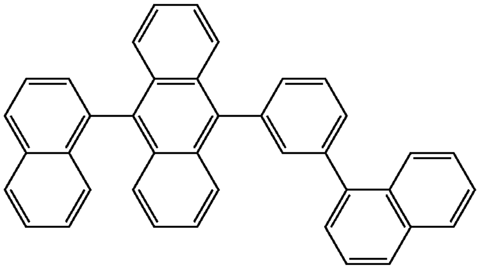
1-70
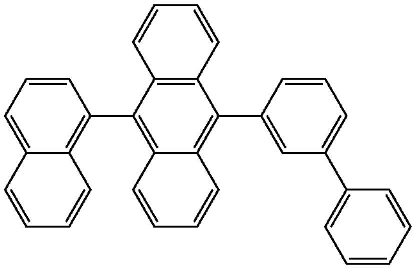
1-71
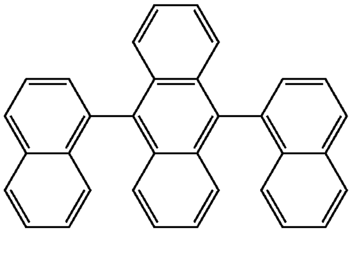

-continued
1-72
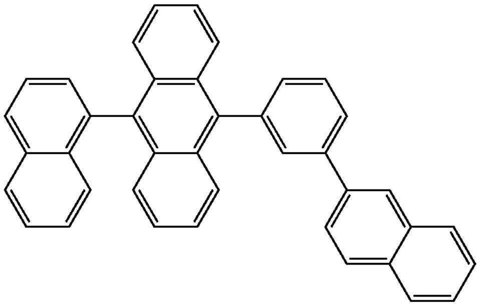
1-73
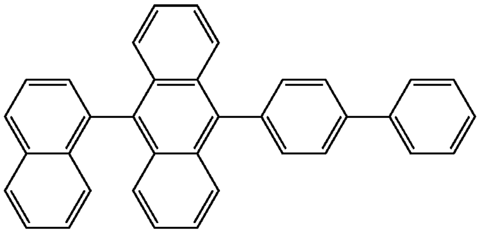
1-74
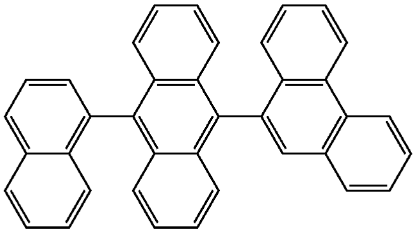
1-75
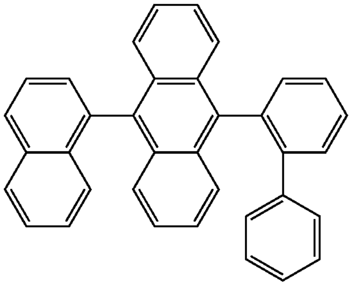
1-76
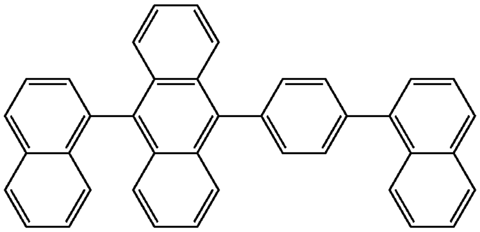
1-77
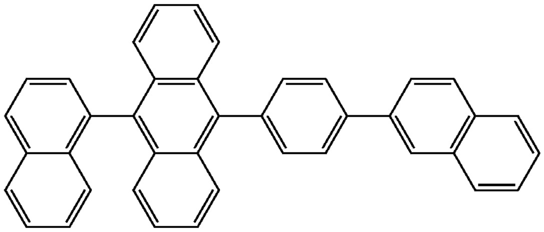
-continued
1-78
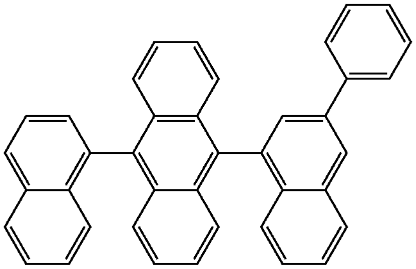
1-79
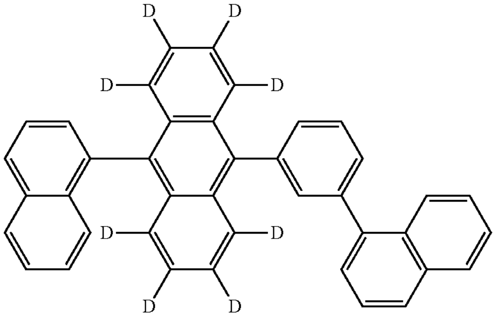
1-80
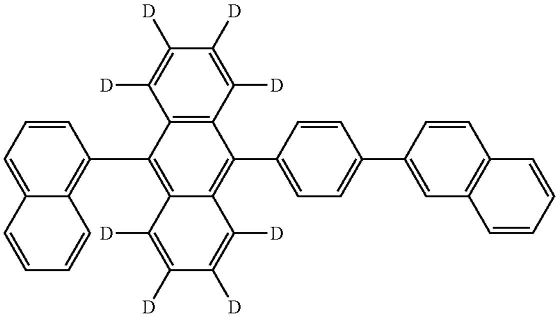
1-81
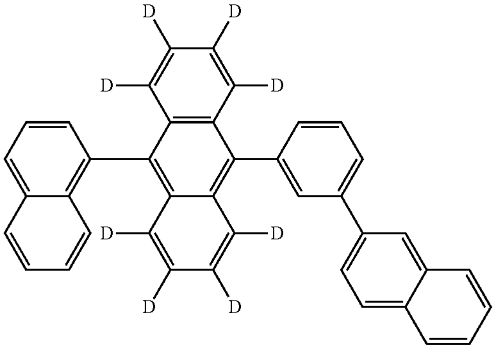

-continued
1-82
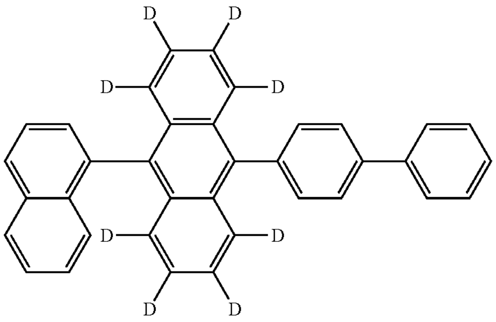
1-83
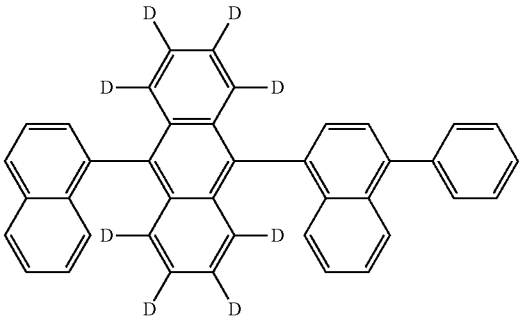
1-84
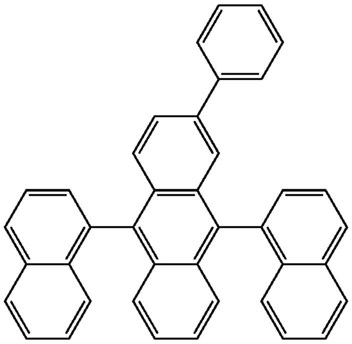
1-85
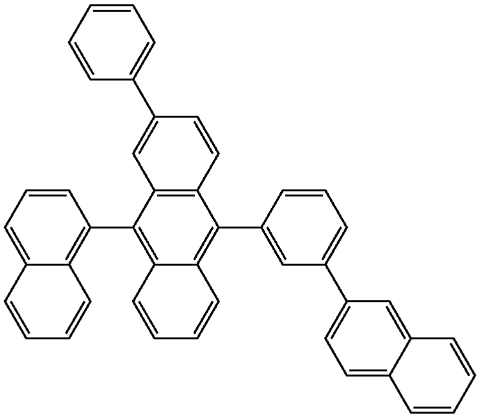
-continued
1-86
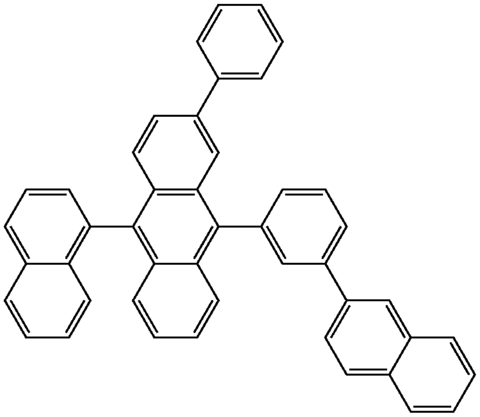
1-87
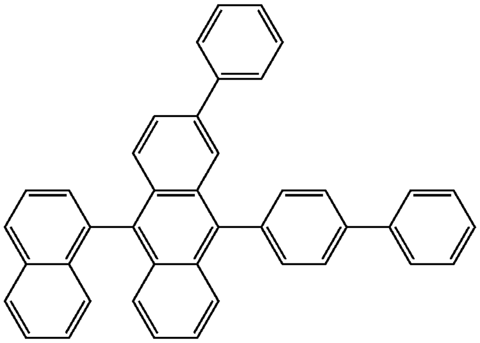
1-88
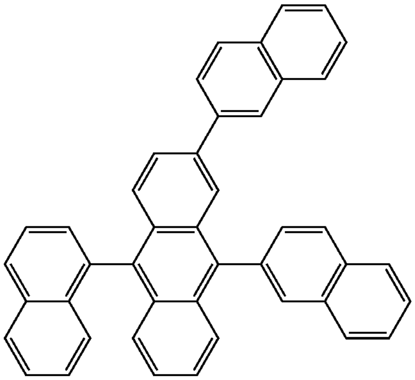
1-89
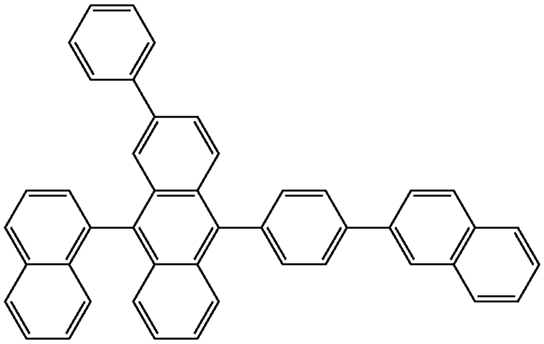

-continued
1-90
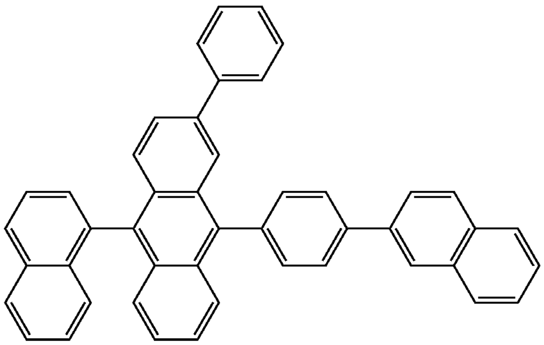
1-91
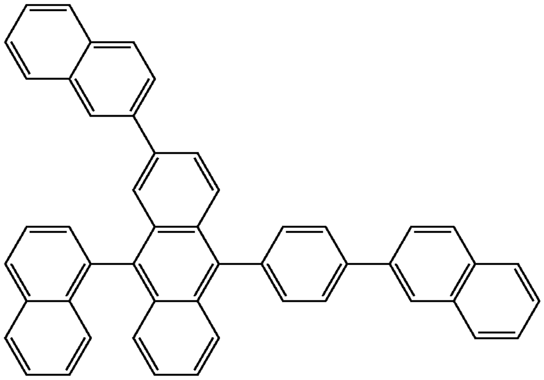
1-92
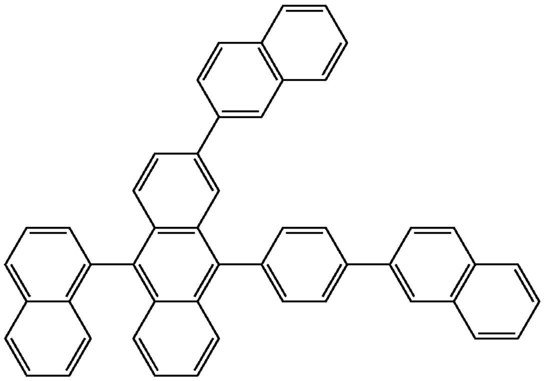
1-93
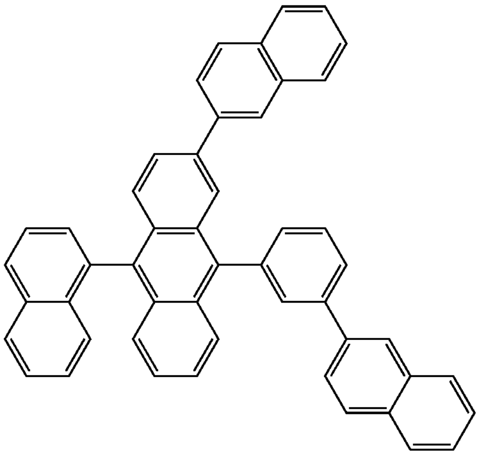
-continued
1-94
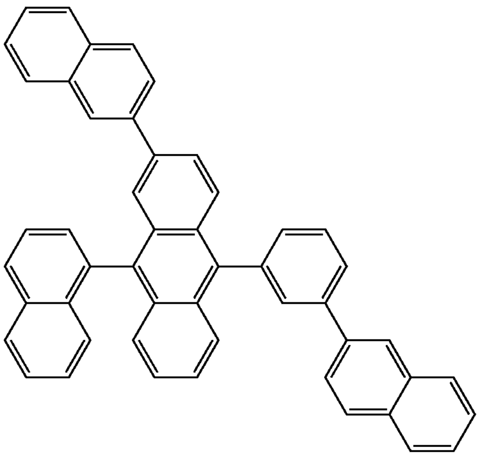
1-95
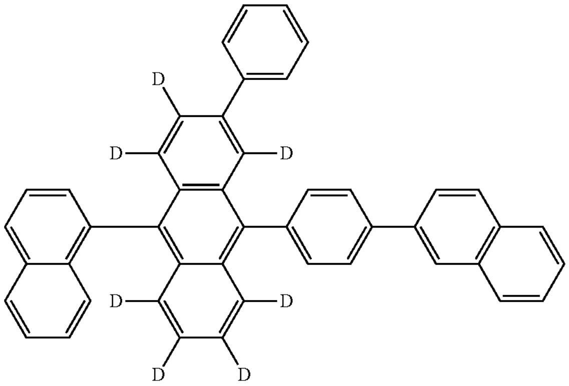
1-96
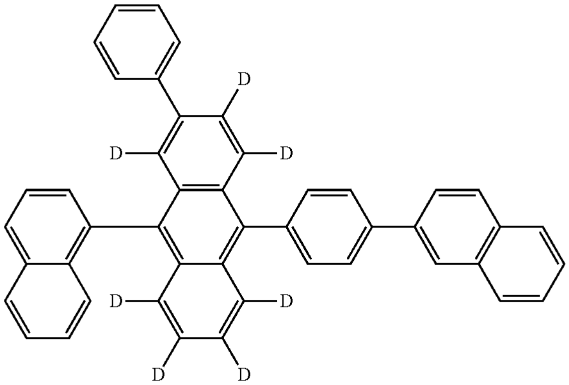
1-97
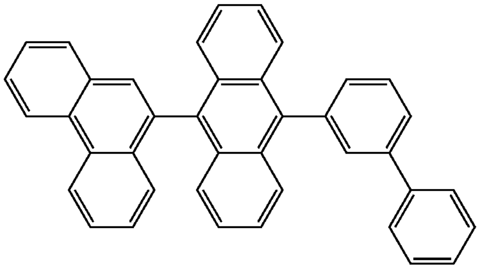

-continued
1-98
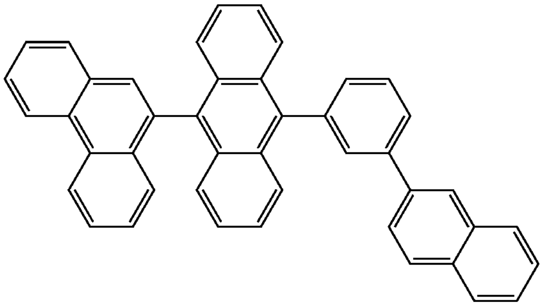
1-99
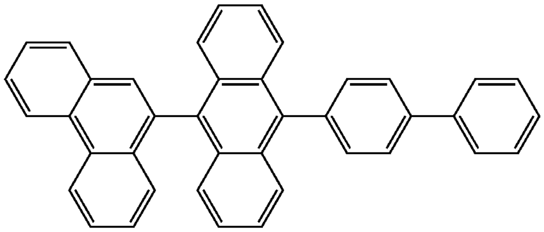
1-100
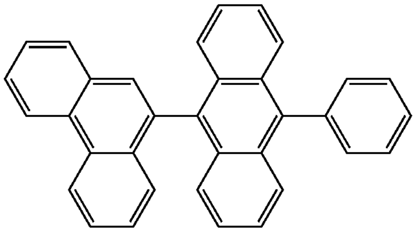
1-101
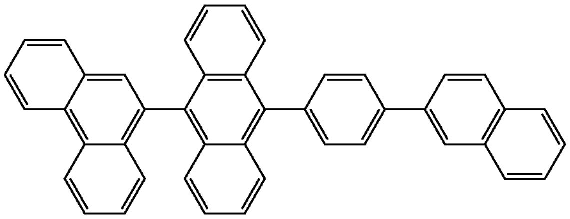
1-102
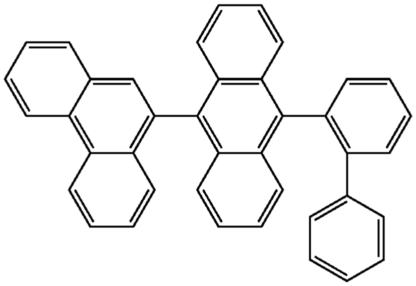
1-103
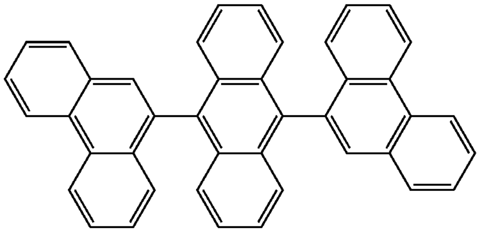
-continued
1-104
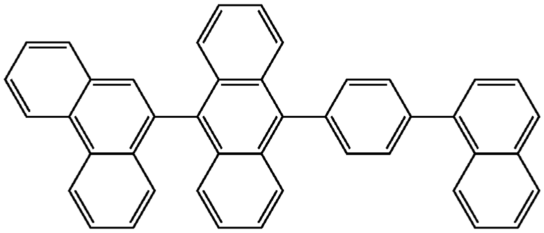
1-105
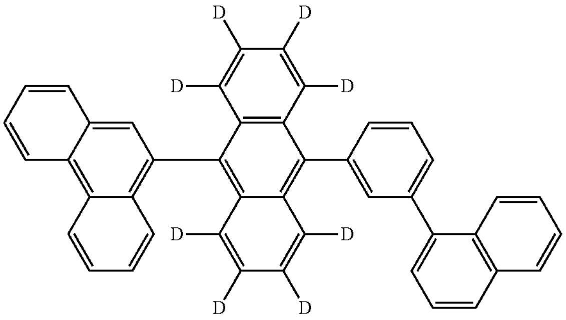
1-106
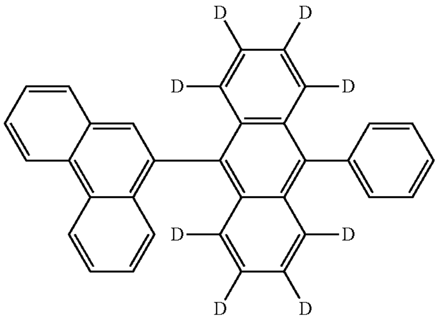
1-107
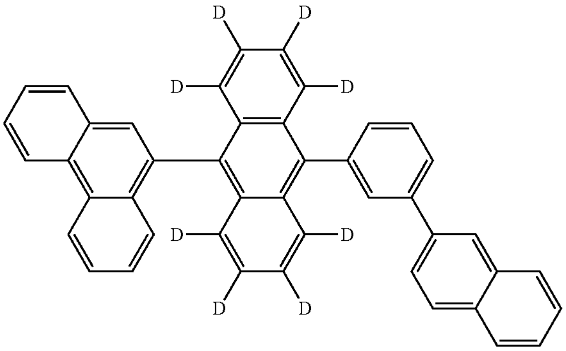
1-108
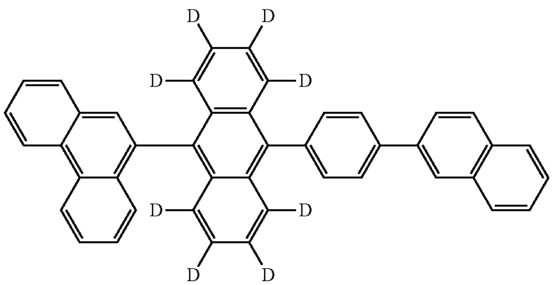

-continued
1-109
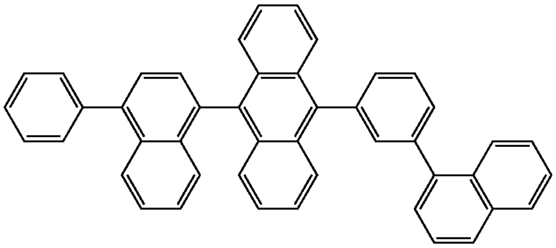
1-110
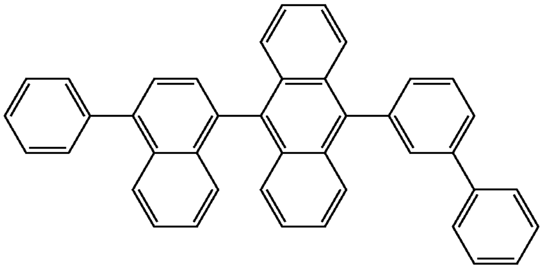
1-111
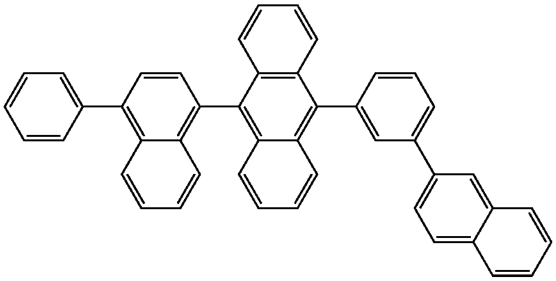
1-112
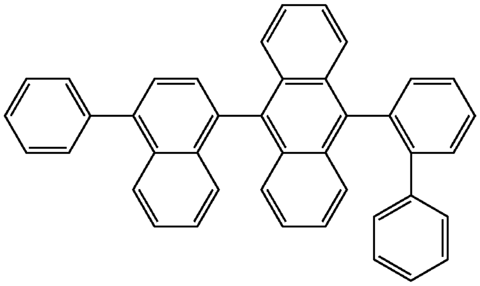
1-113
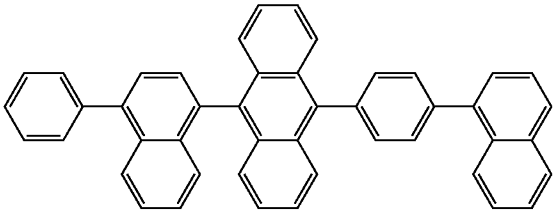
-continued
1-114
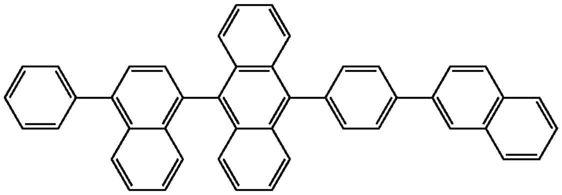
1-115
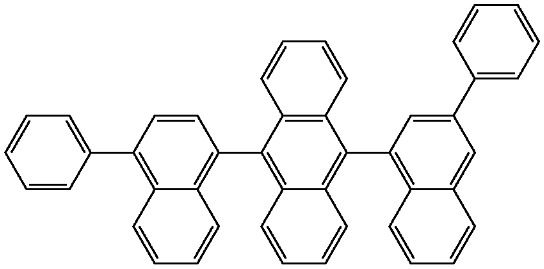
1-116
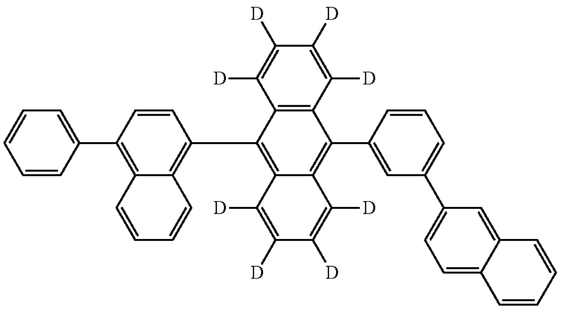
1-117
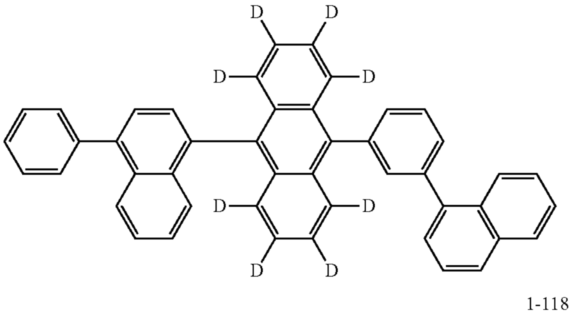
1-118
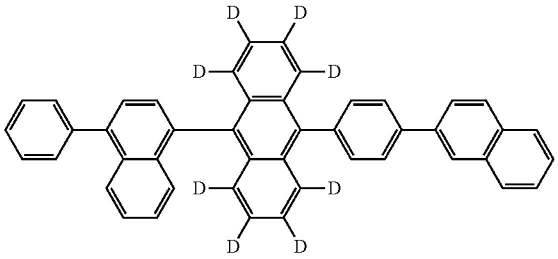

-continued
1-119
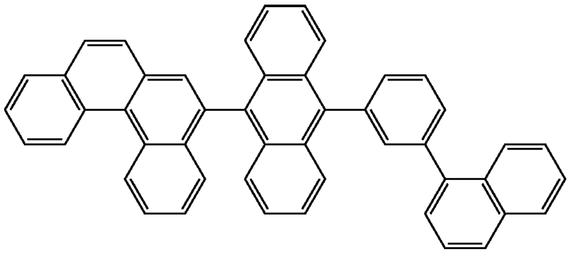
1-120
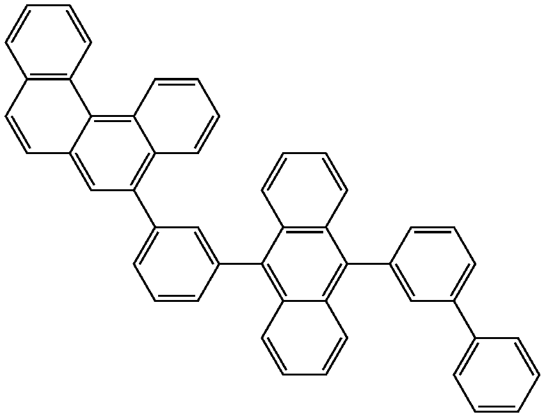
1-121
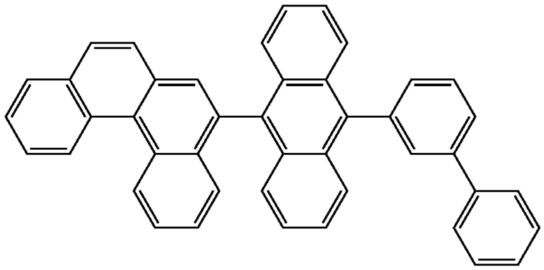
1-122
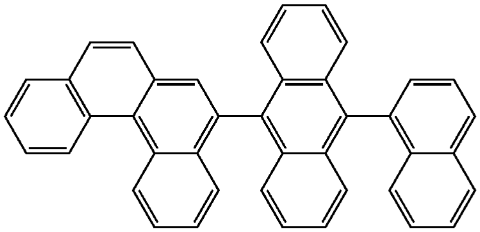
-continued
1-123
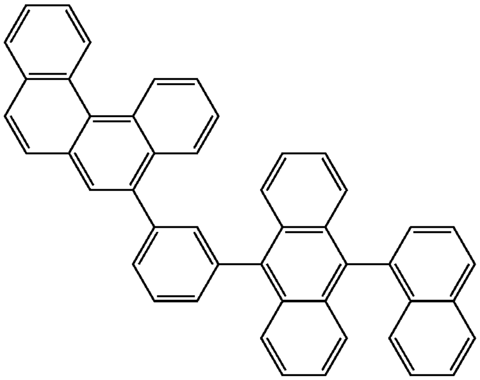
1-124
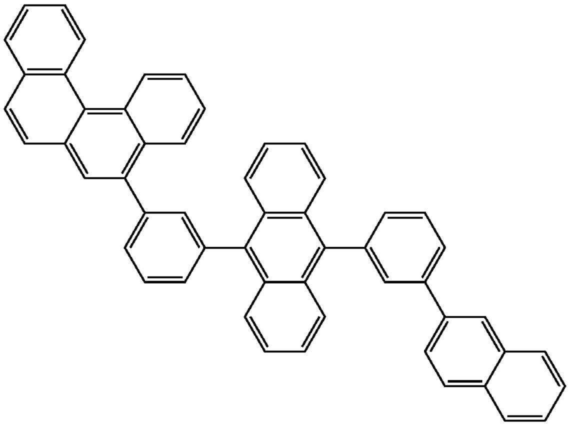
1-125
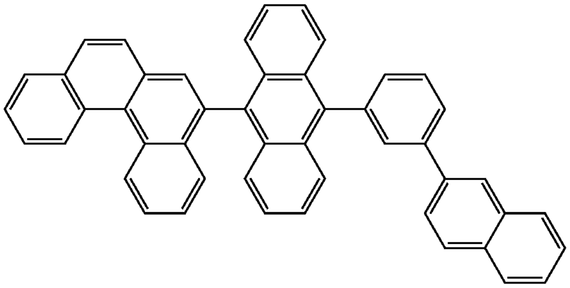
1-126
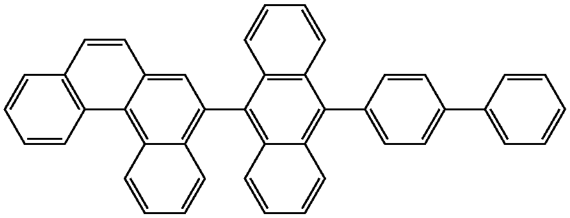

-continued
1-127
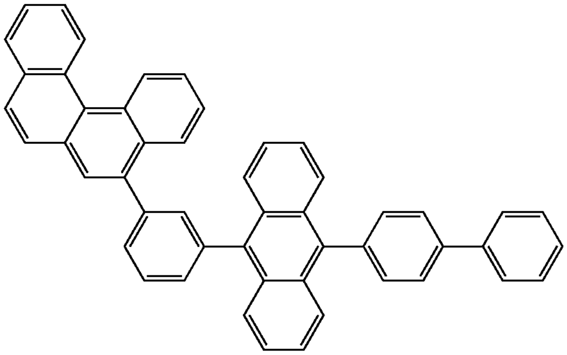
1-128
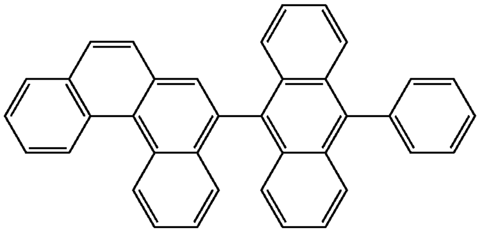
1-129
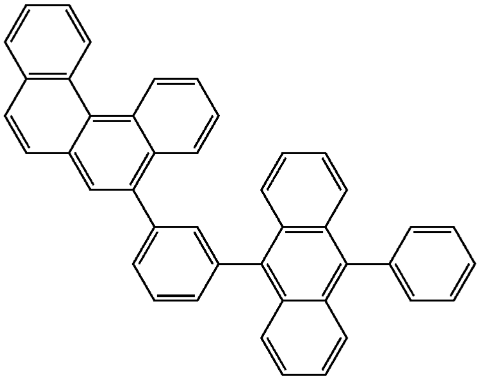
1-130
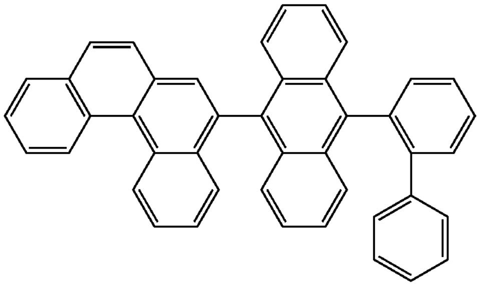
-continued
1-131
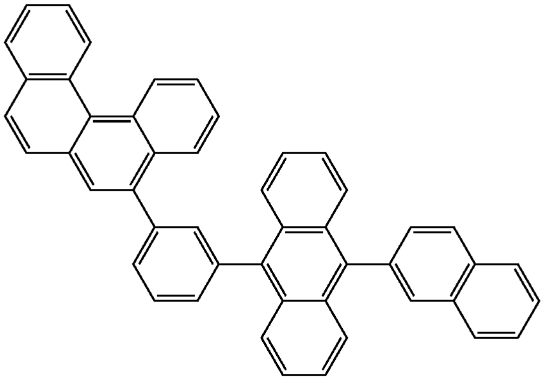
1-132
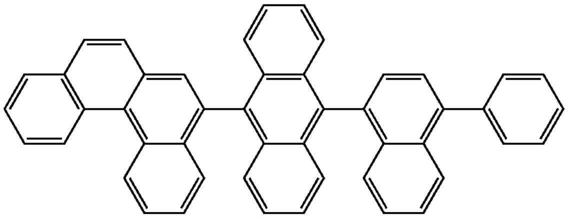
1-133
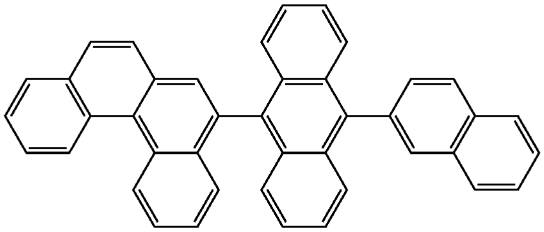
1-134
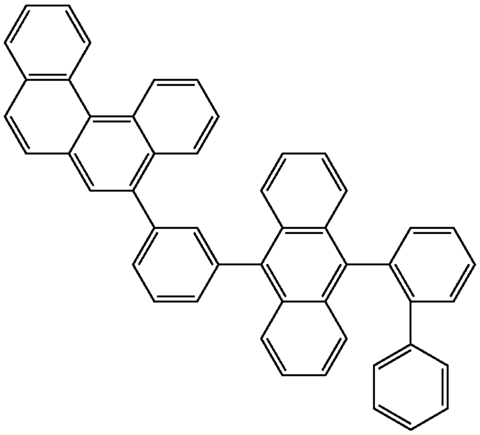

-continued
1-135
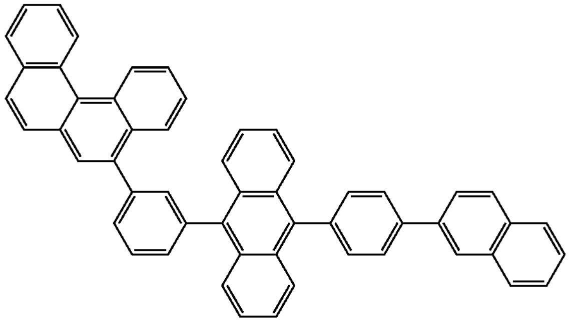
1-136
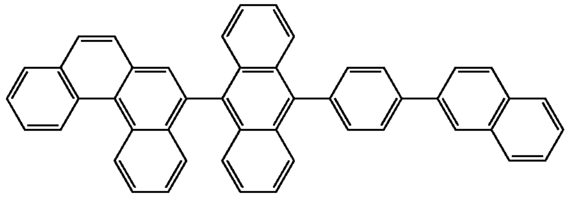
1-137
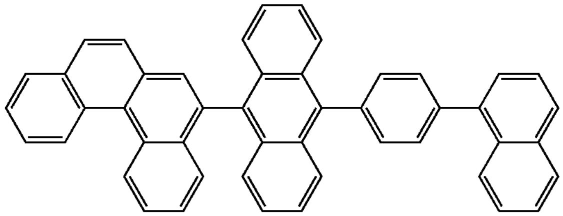
1-138
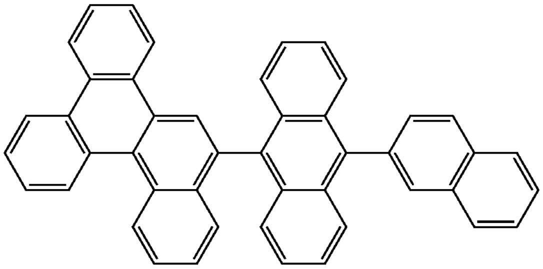
1-139
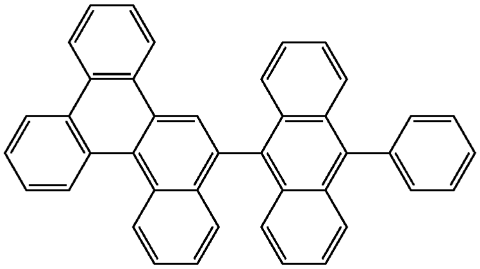
-continued
1-140
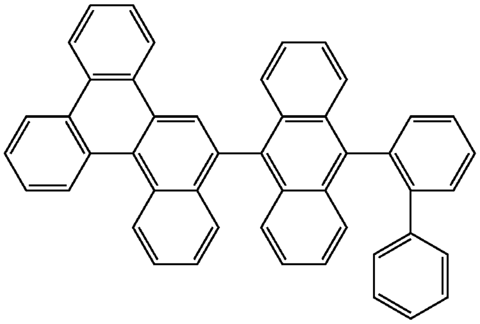
1-141
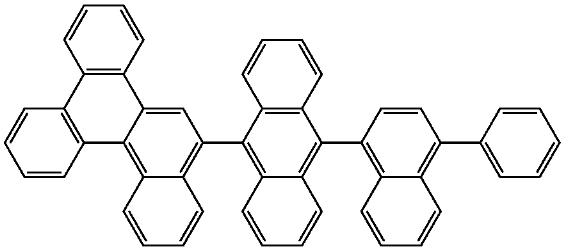
1-142
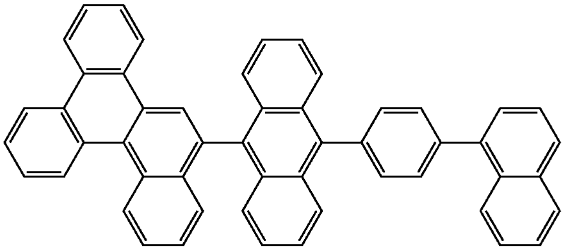
1-143
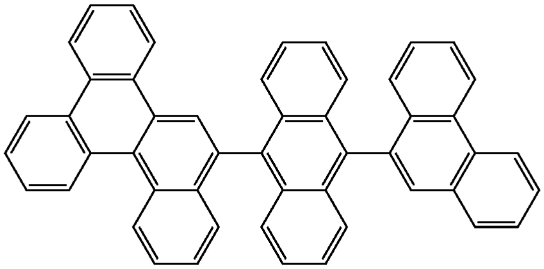
1-144
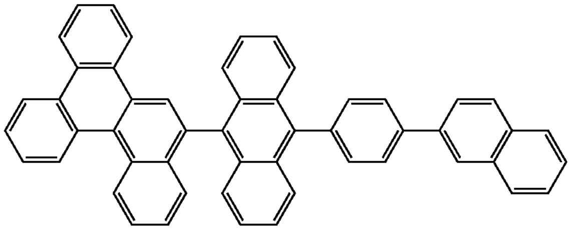

-continued
1-145
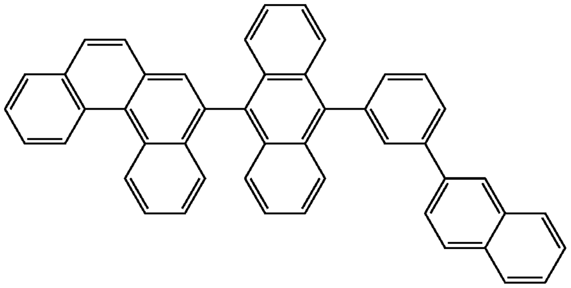
1-146
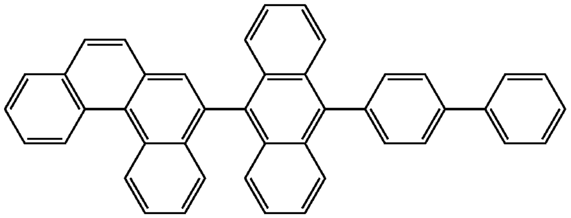
1-147
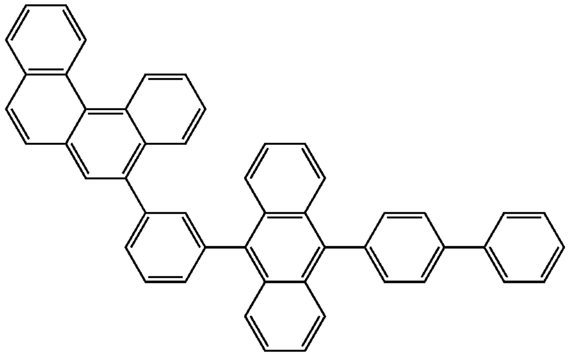
1-148
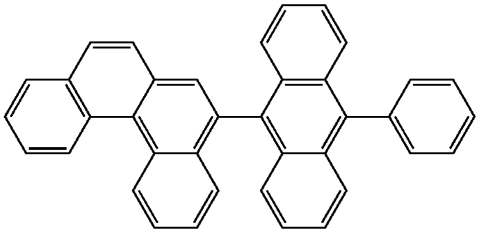
1-149
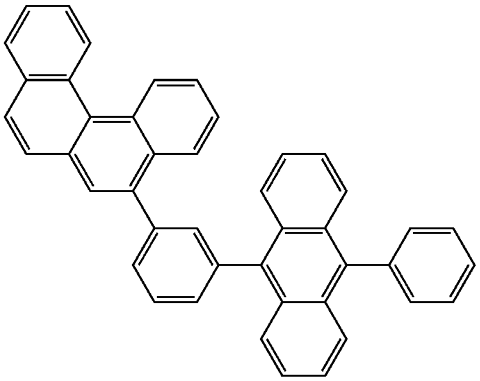
-continued
1-150
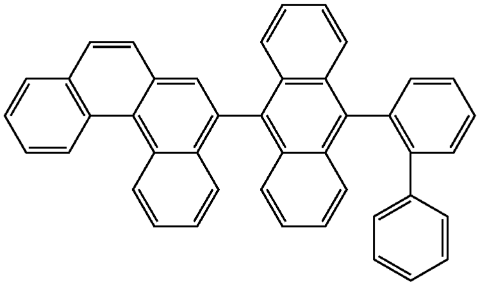
1-151
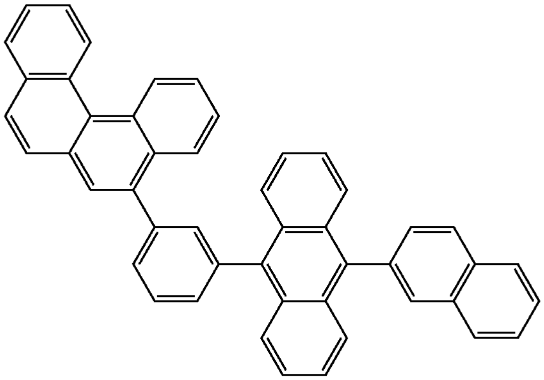
1-152
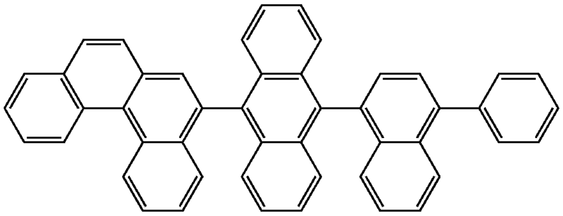
1-153
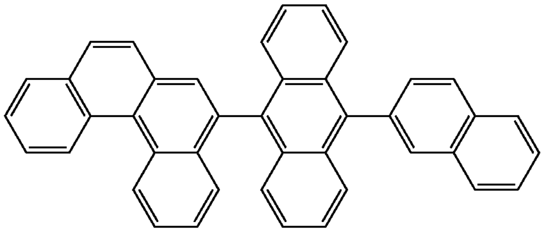

-continued
1-154
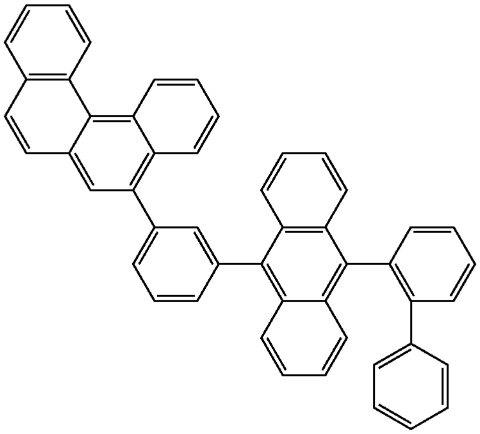
1-155
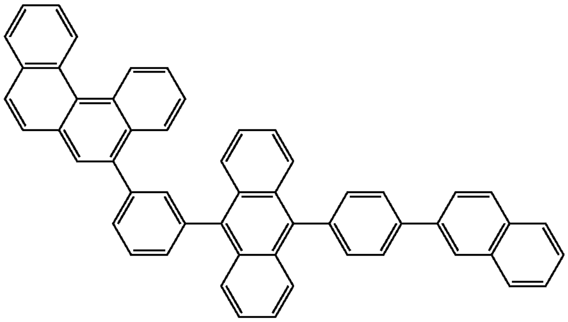
1-156
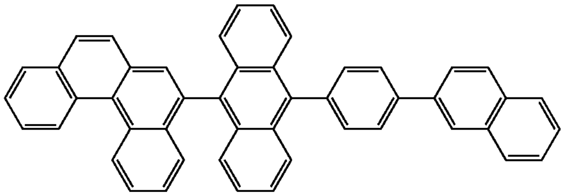
1-157
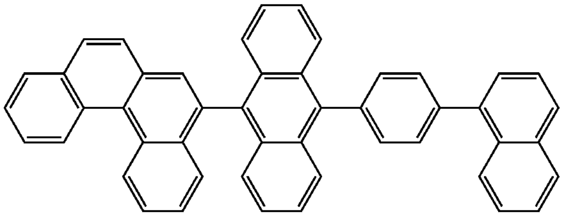
1-158
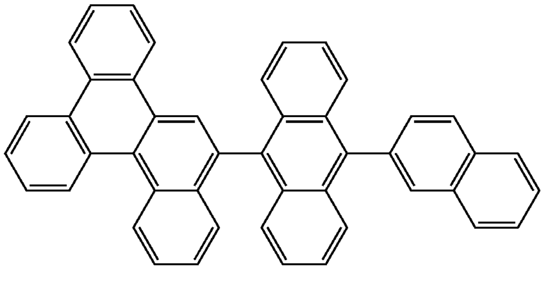
-continued
1-159
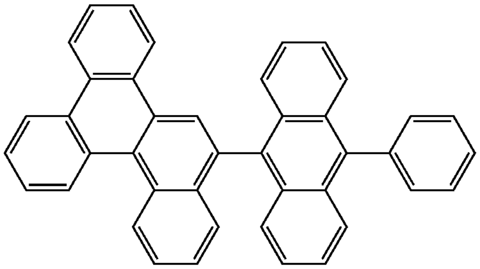
1-160
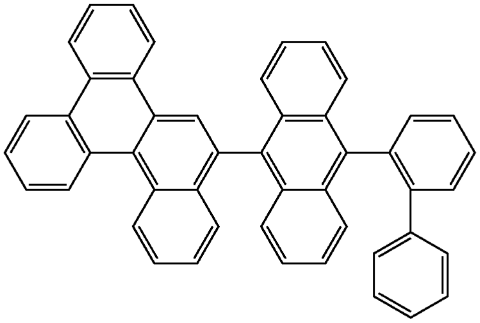
1-161
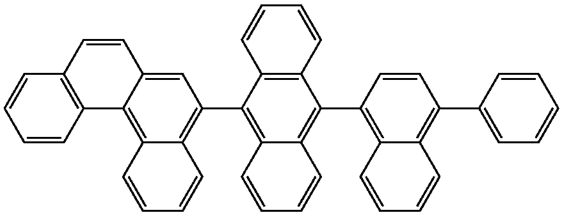
1-162
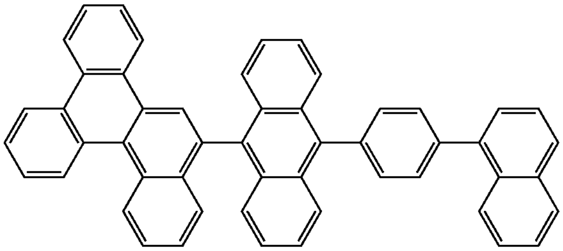
1-163
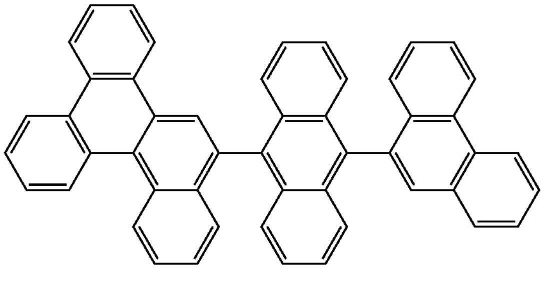

-continued
1-164
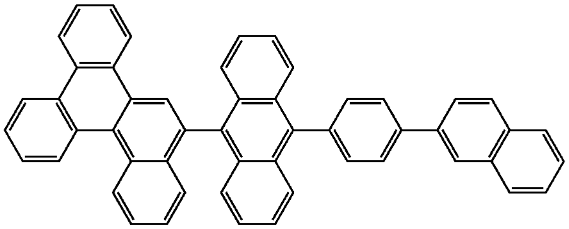
1-165
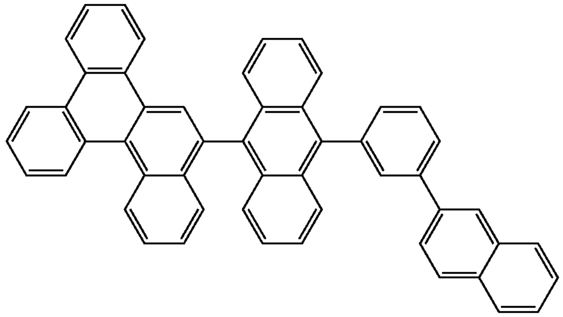
1-166
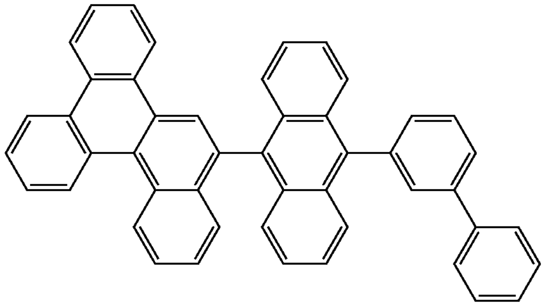
1-167
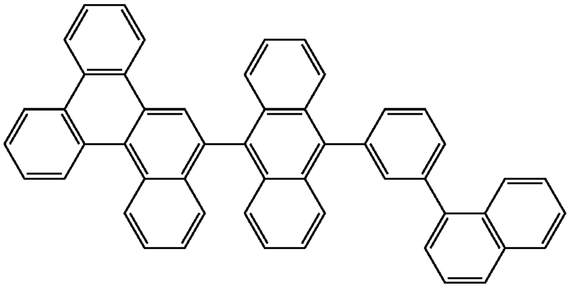
1-168
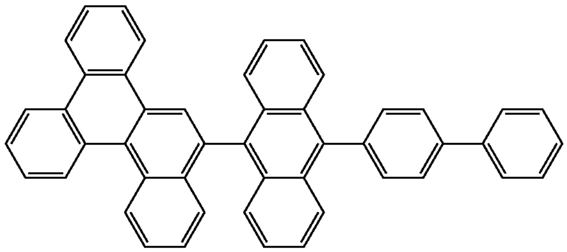
-continued
1-169
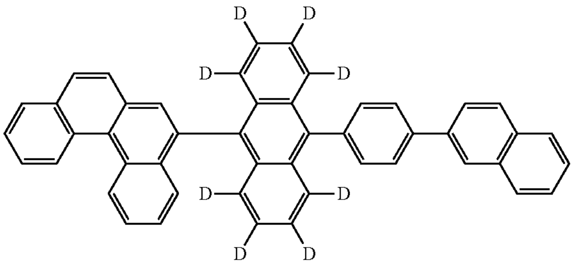
1-170
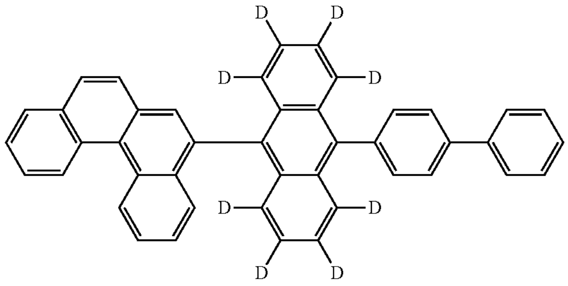
1-171
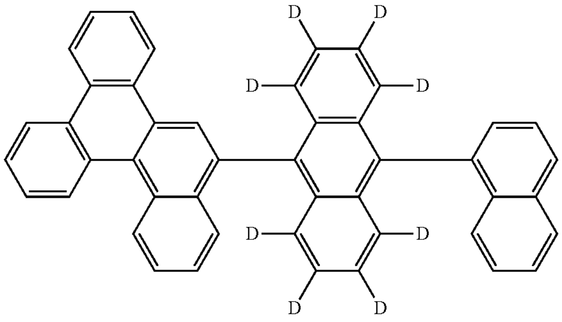
1-172
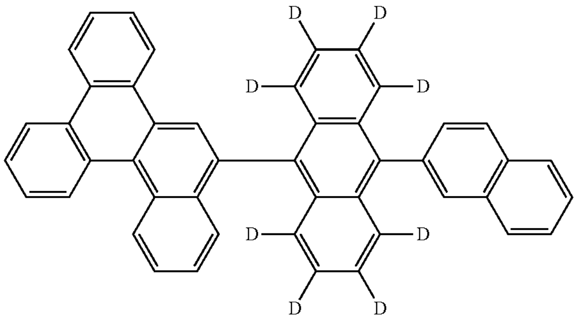
1-173
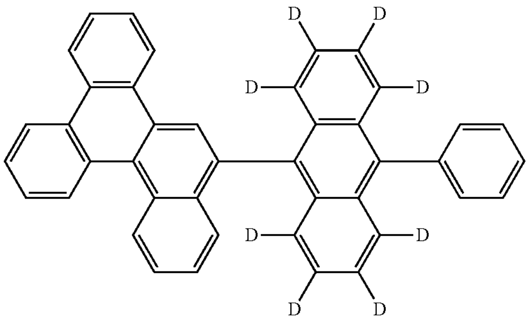

-continued
1-174
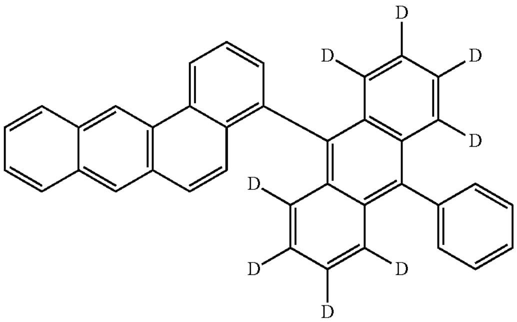
1-175
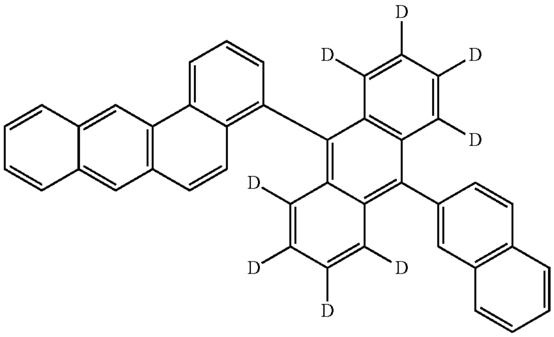
1-176
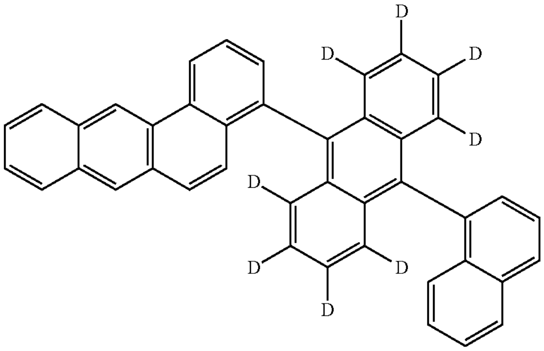
1-177
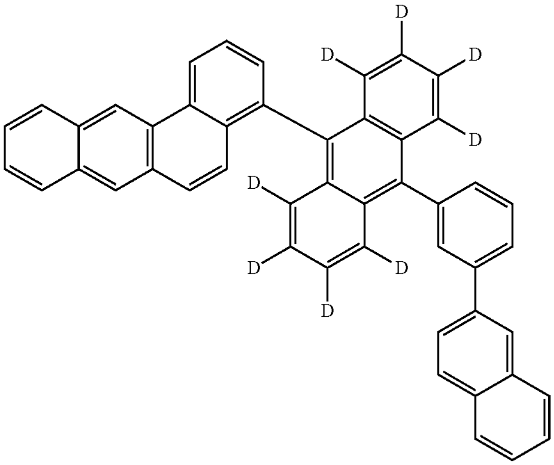
-continued
1-178
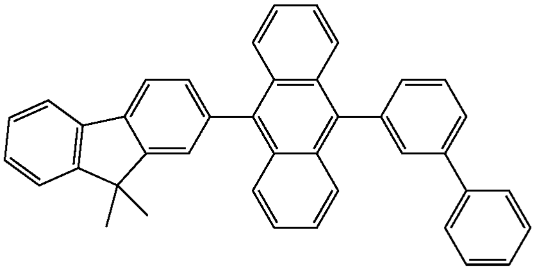
1-179
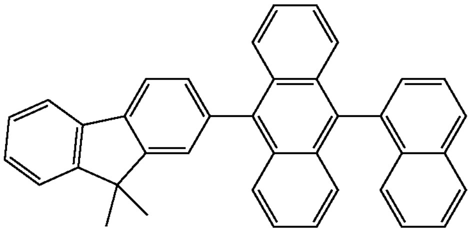
1-180
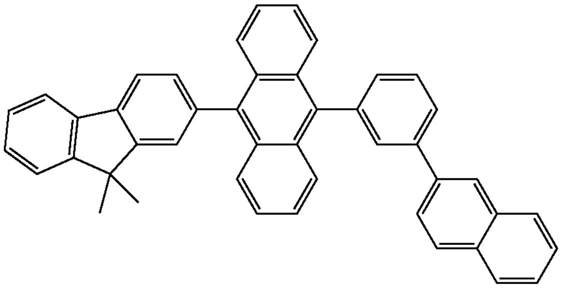
1-181
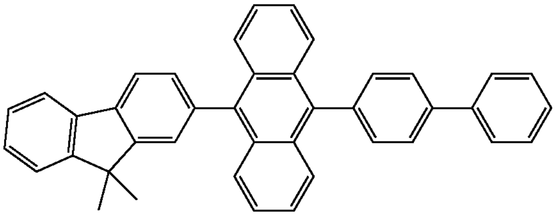
1-182
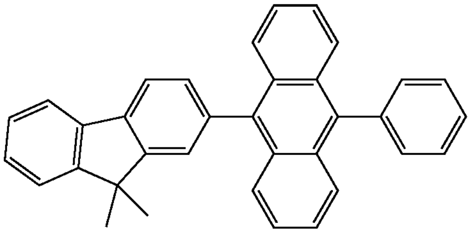
1-183
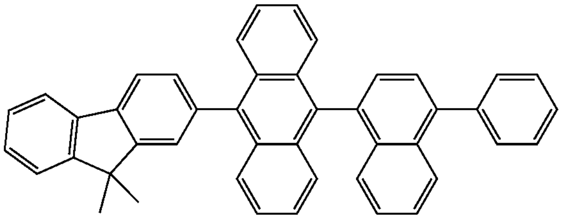

-continued
1-184
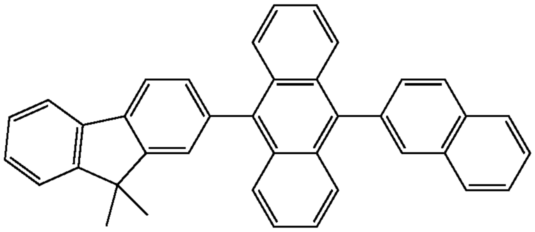
1-185
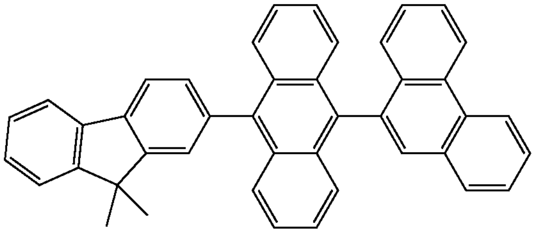
1-186
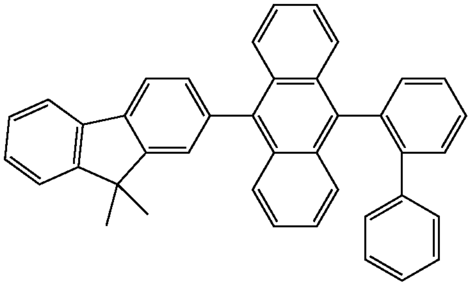
1-187
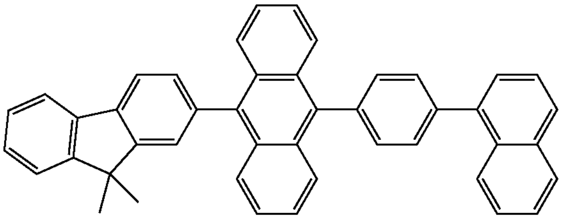
1-188
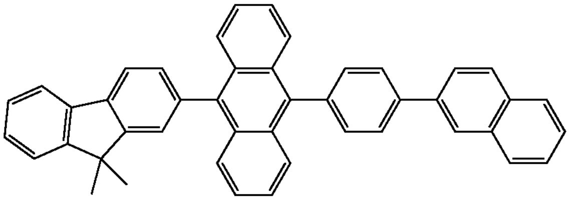
1-189
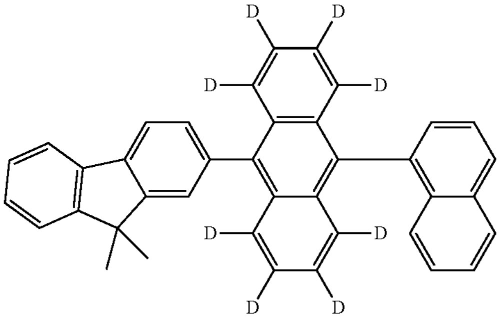
-continued
1-190
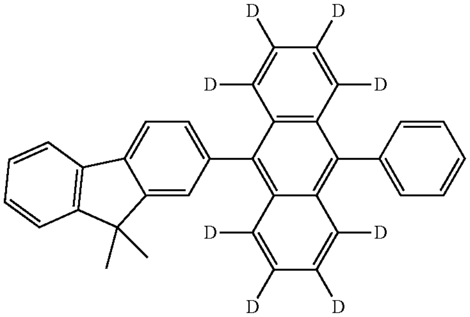
1-191
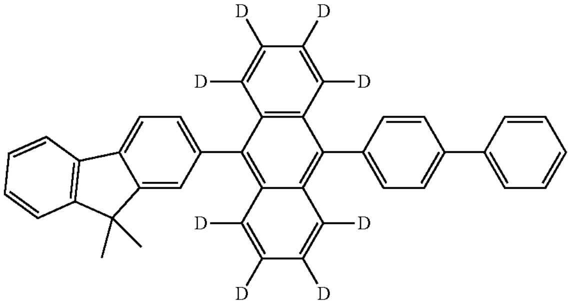
1-192
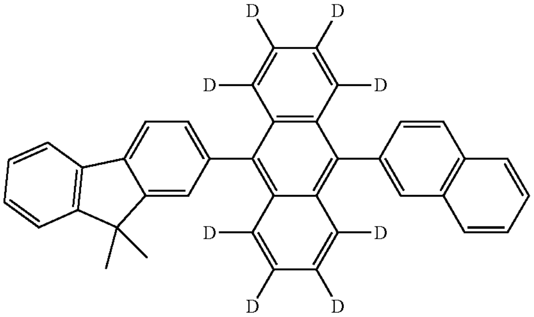
1-193
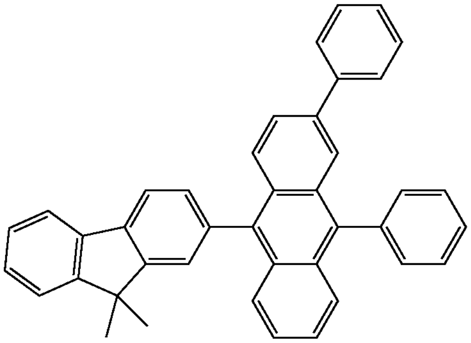

-continued
1-194
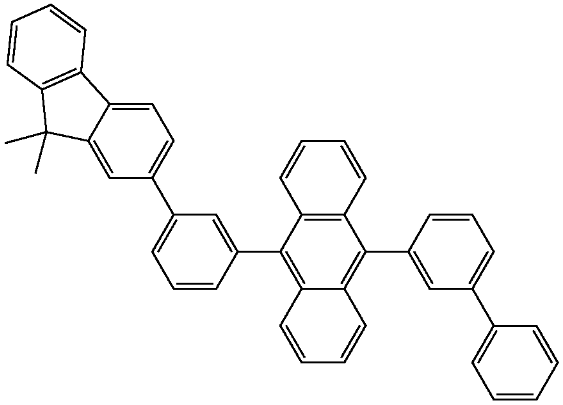
1-195
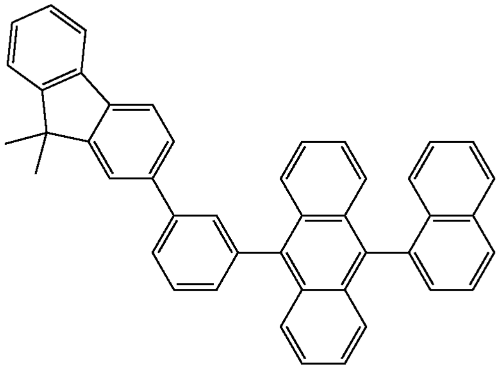
1-196
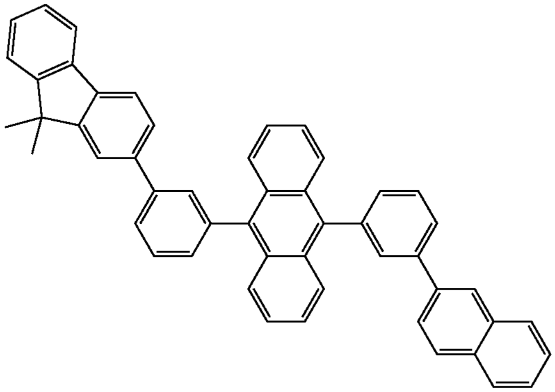
1-197
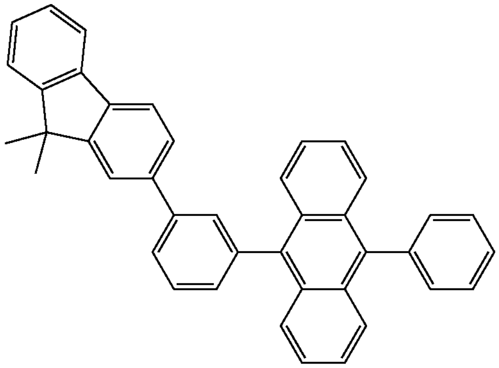
-continued
1-198
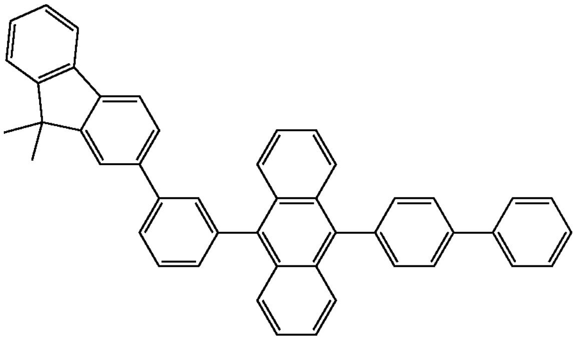
1-199
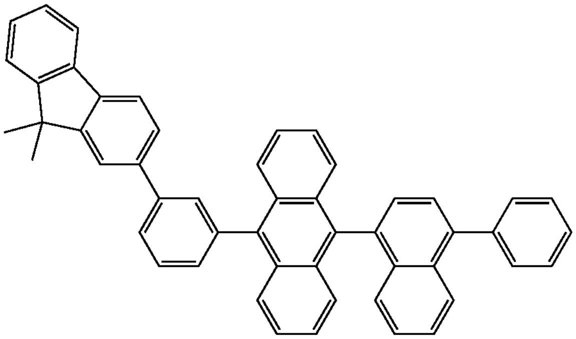
1-200
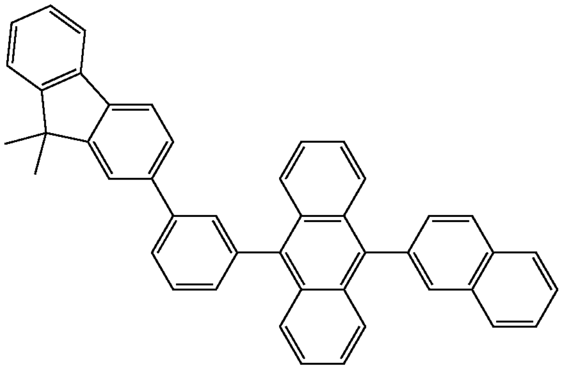
1-201
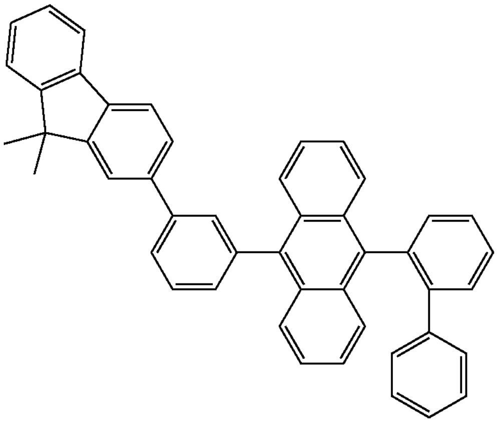

-continued
1-202
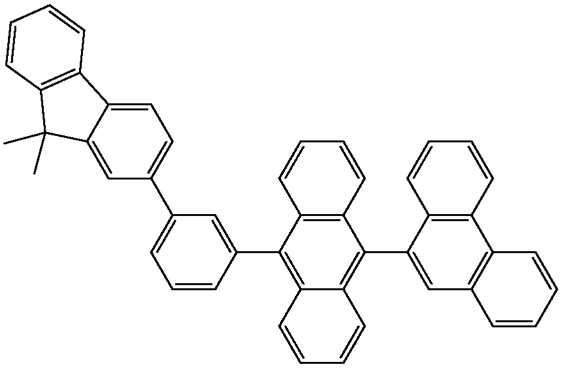
1-203
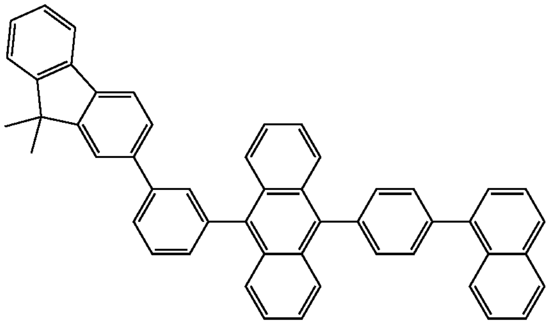
1-204
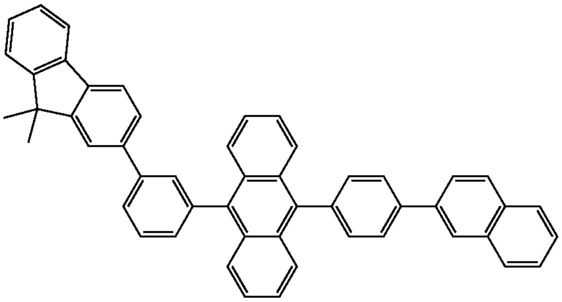
1-205
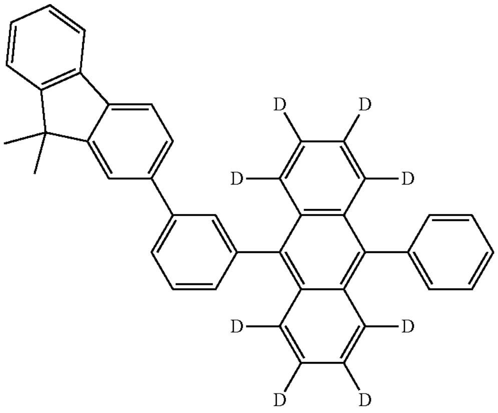
-continued
1-206
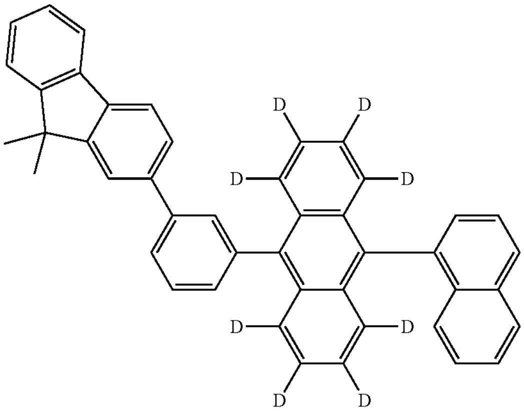
1-207
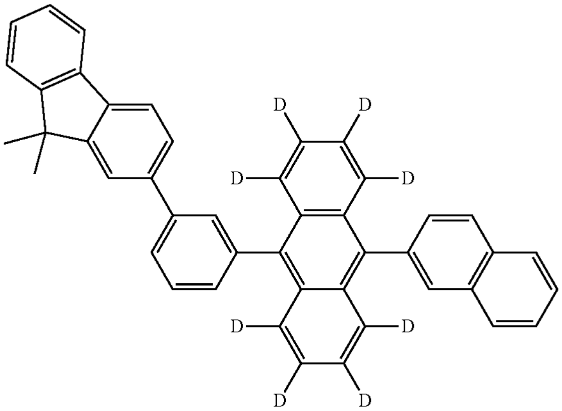
1-208
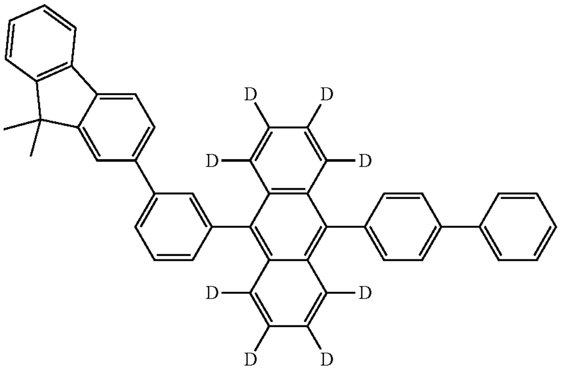
1-209
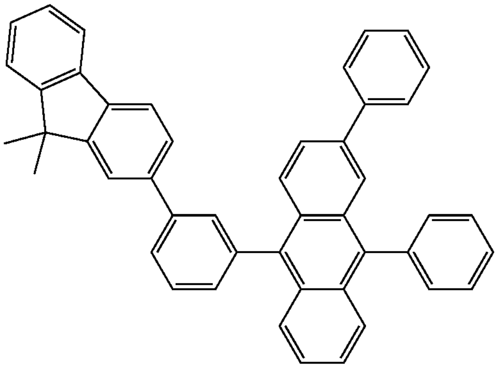

-continued 1-210

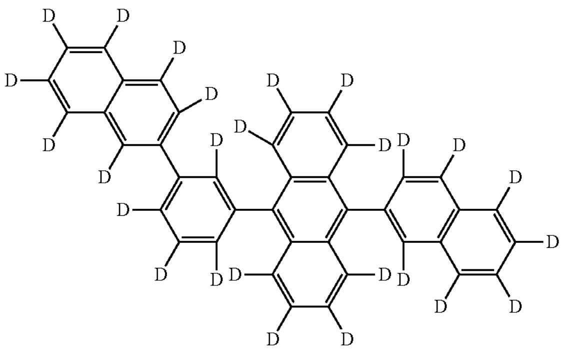

1-211

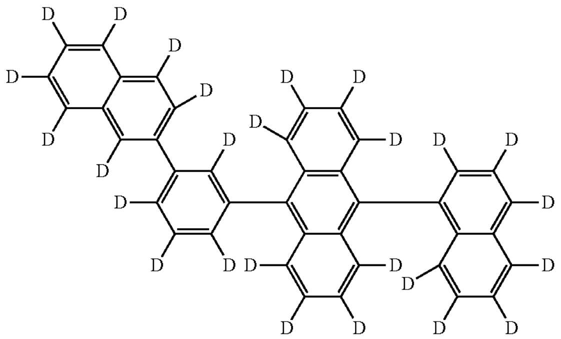

1-212

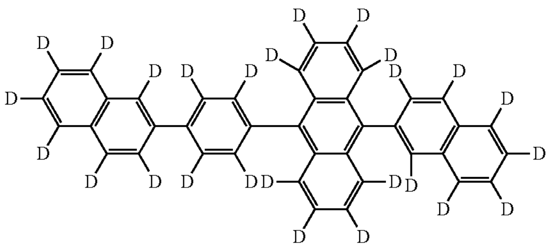

1-213

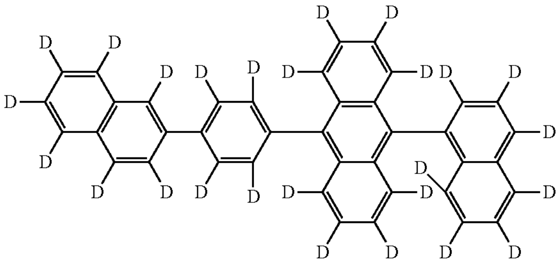

1-214

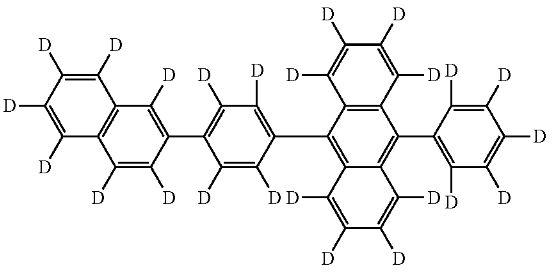

-continued 1-215

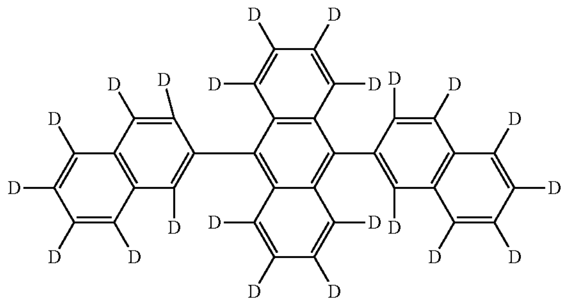

1-216

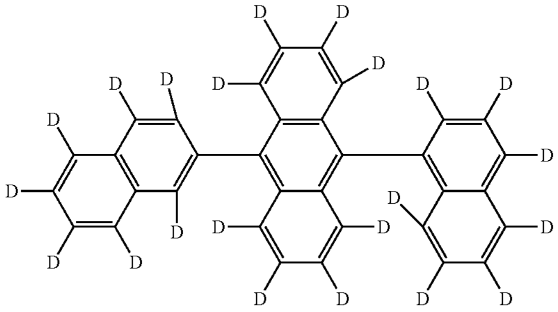

(Second Host Material)

The second host material used in an aspect of the invention is a compound represented by the following formula (2):

(2)

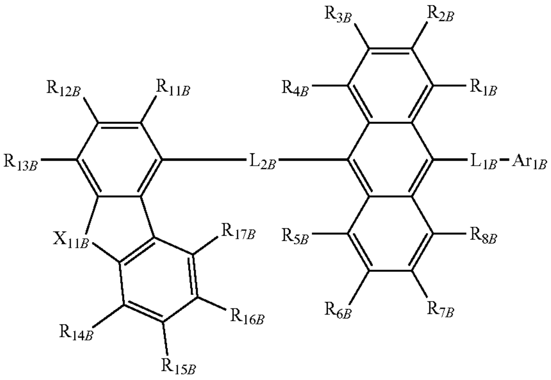

In the formula (2), $X_{11B}$ is an oxygen atom or a sulfur atom;

one or more sets of adjacent two or more of $R_{14B}$ to $R_{17B}$ form a substituted or unsubstituted, saturated or unsaturated ring by bonding with each other;

one or more sets of adjacent two or more of $R_{11B}$ to $R_{13B}$ form a substituted or unsubstituted, saturated or unsaturated ring by bonding with each other, or do not form a substituted or unsubstituted, saturated or unsaturated ring;

$R_{11B}$ to $R_{17B}$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{1B}$ to $R_{8B}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$L_{1B}$ and $L_{2B}$ are independently a single bond, a substituted or unsubstituted arylene group including 6 to 50 ring carbon atoms, or a substituted or unsubstituted divalent heterocyclic group including 5 to 50 ring atoms;

$Ar_1B$ is a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formula (1).

Any hydrogen atom possessed by the compound represented by the formula (2) may be a deuterium atom.

In one embodiment, the compound represented by the formula (2) is a compound represented by the following formula (2-1), the following formula (2-2), or the following formula (2-3):

(2-1)

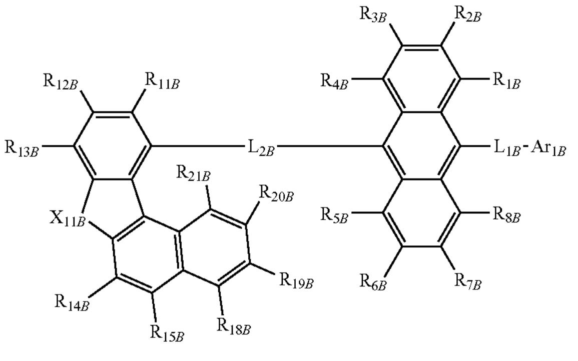

-continued (2-2)

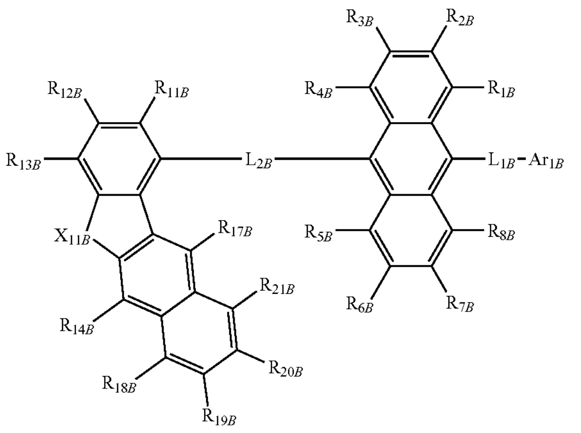

(2-3)

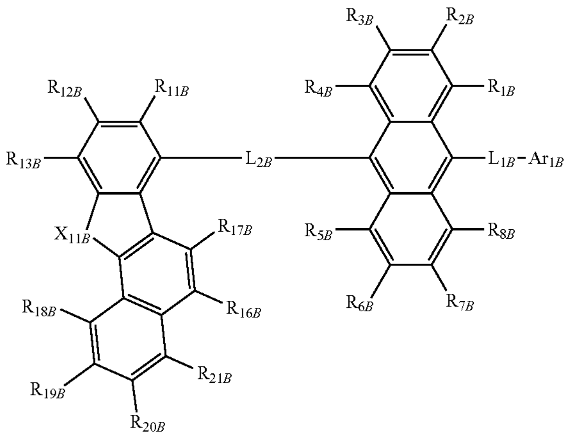

In the formulas (2-1), (2-2) and (2-3), $R_{1B}$ to $R_{8B}$, $R_{11B}$ to $R_{13B}$, $L_{1B}$, $L_{2B}$, $X_{11B}$, and $Ar_{1B}$ are as defined in the formula (2);

$R_{14B}$ to $R_{21B}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formula (1).

In one embodiment, $L_{1B}$ and $L_{2B}$ are independently a single bond or a substituted or unsubstituted arylene group including 6 to 14 ring carbon atoms.

In one embodiment, $L_{1B}$ and $L_{2B}$ are independently a single bond, a substituted or unsubstituted phenylene group, or a substituted or unsubstituted naphthylene group.

In one embodiment, the compound represented by the formula (2) is a compound represented by the following formula (2-11), the following formula (2-12), or the following formula (2-13):

(2-11)

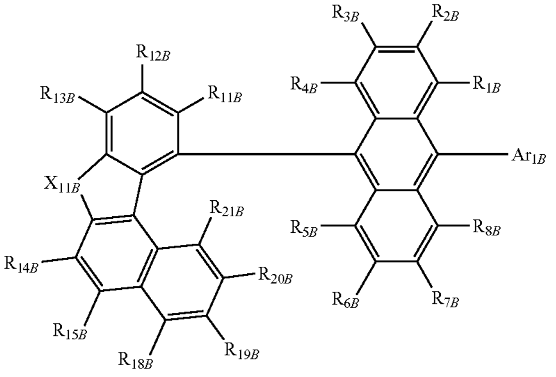

(2-12)

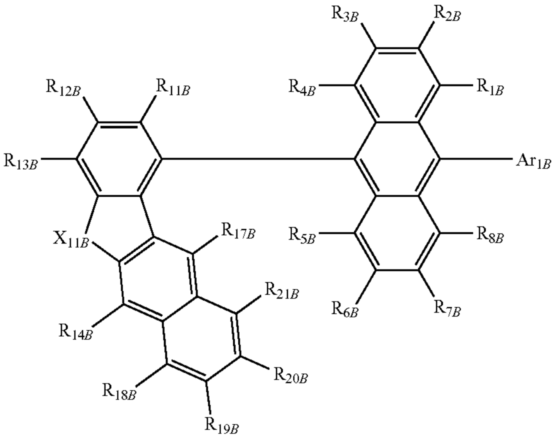

(2-13)

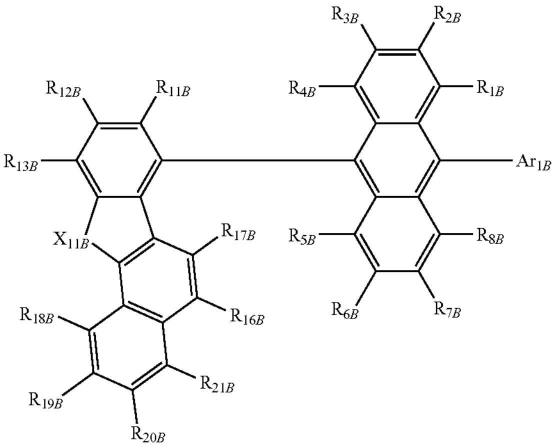

In the formulas (2-11), (2-12), and (2-13), $R_{1B}$ to $R_{8B}$, $R_{11B}$ to $R_{13B}$, $X_{11B}$, and $Ar_{1B}$ are as defined in the formula (2);

$R_{14B}$ to $R_{21B}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formula (1).

In one embodiment, $Ar_{1B}$ is a substituted or unsubstituted aryl group including 6 to 50 ring carbon atoms.

In one embodiment, $Ar_{1B}$ is selected from groups represented by each of the following formulas (a1) to (a4):

(a1)

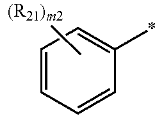

(a2)

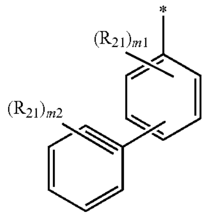

(a3)

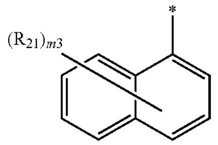

(a4)

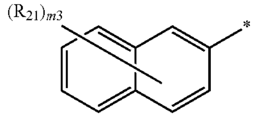

In the formulas (a1) to (a4), * is a single bond which bonds with $L_{1B}$;

$R_{21}$ is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{901}$ to $R_{907}$ are as defined in the formula (1);

m1 is an integer of 0 to 4;

m2 is an integer of 0 to 5;

m3 is an integer of 0 to 7;

when each of m1 to m3 is 2 or more, a plurality of $R_{21}$'s may be the same as or different from each other; and when each of m1 to m3 is 2 or more, a plurality of adjacent $R_{21}$'s form a substituted or unsubstituted, saturated or unsaturated ring by bonding with each other, or do not form a substituted or unsubstituted, saturated or unsaturated ring.

In one embodiment, $X_{11B}$ is an oxygen atom.

In one embodiment, the compound represented by the formula (2) is a compound represented by the following formula (2-21), the following formula (2-22), or the following formula (2-23):

(2-21)

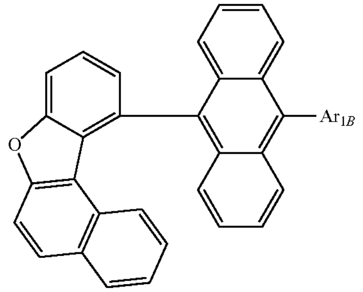

(2-22)

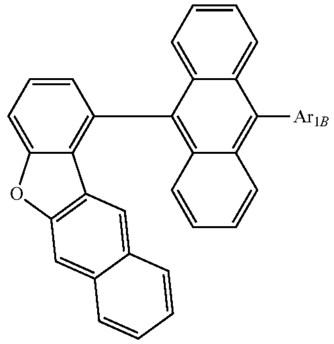

-continued (2-23)

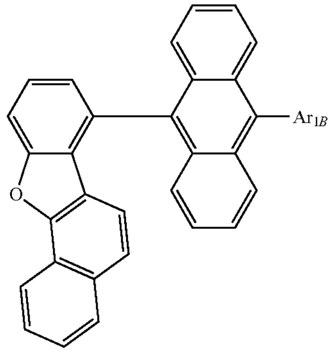

In the formulas (2-21), (2-22), and (2-23), $Ar_{1B}$ is as defined in the formula (2).

The compound represented by the formula (2) can be synthesized in accordance with the synthetic methods described in Examples by using known alternative reactions or raw materials tailored to the target compound.

Specific examples of the compound represented by the formula (2) will be described below, but these are merely illustrative, and the compound represented by the formula (2) is not limited to the following specific examples.

2-1

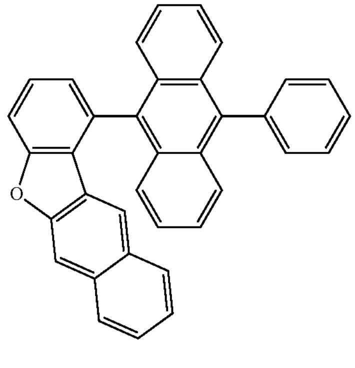

2-2

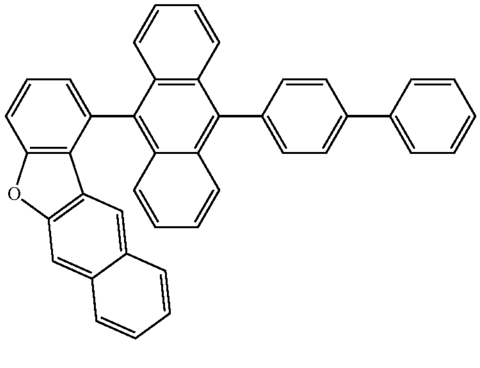

-continued
2-3
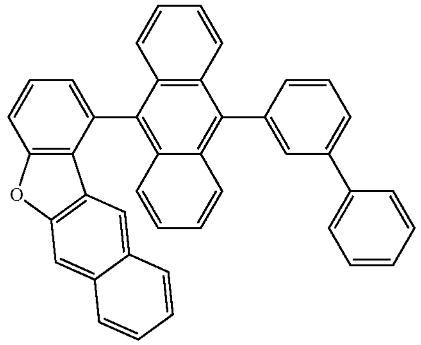
2-4
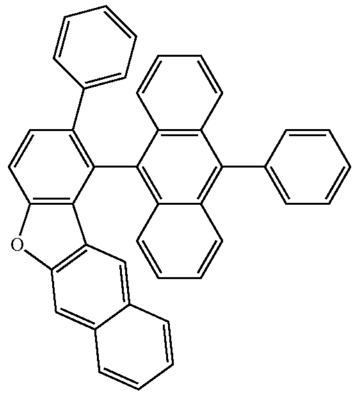
2-5
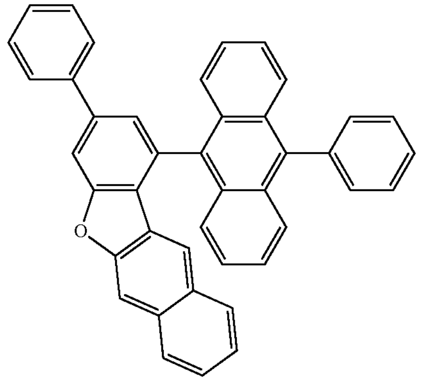
2-6
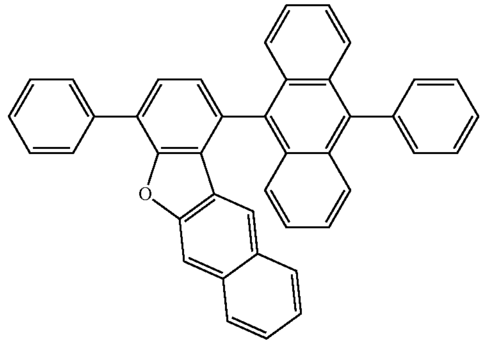
2-7
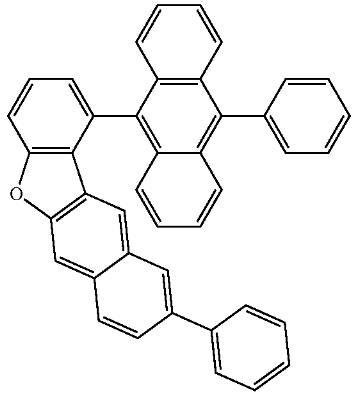
2-8
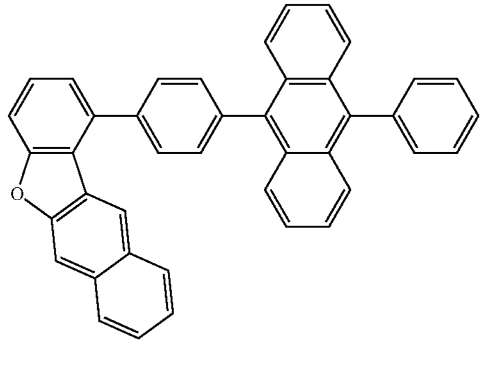
2-9
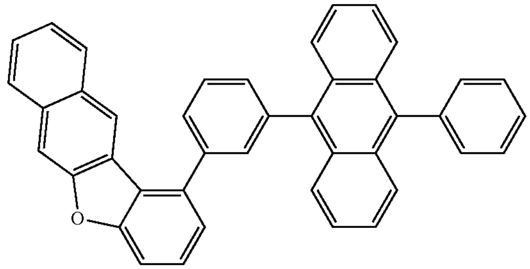
2-10
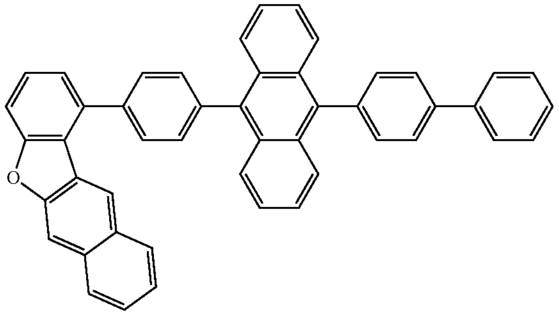

-continued
2-11
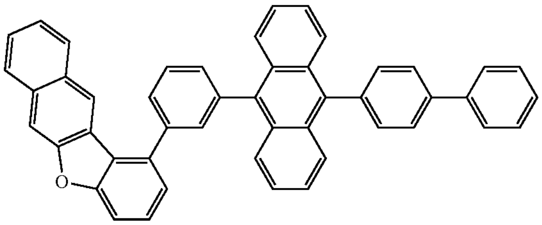
2-12
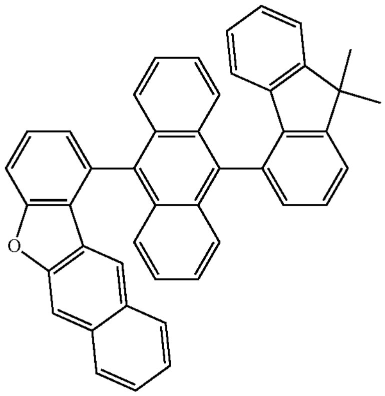
2-13
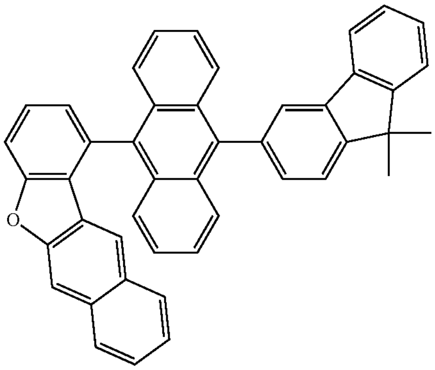
2-14
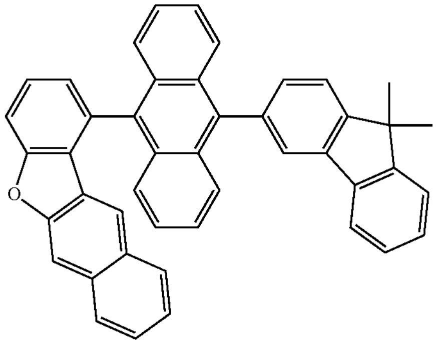
2-15
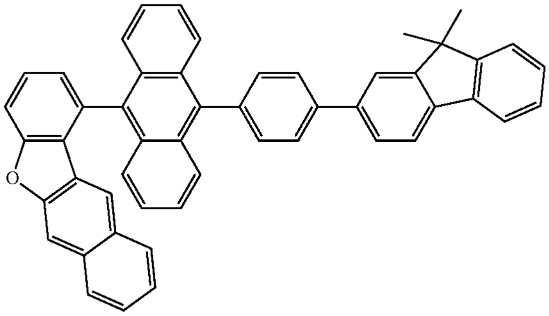
2-16
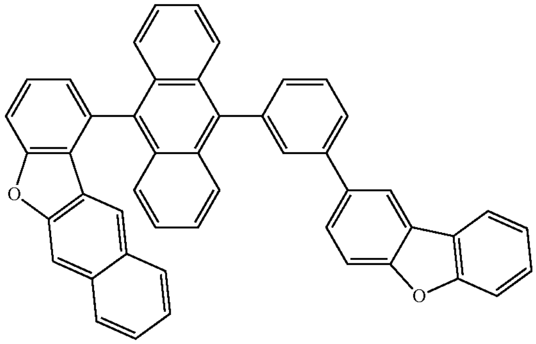
2-17
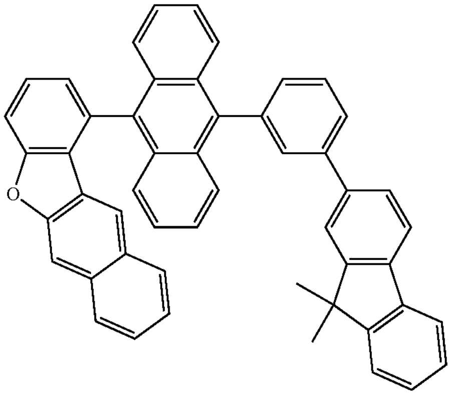
2-18
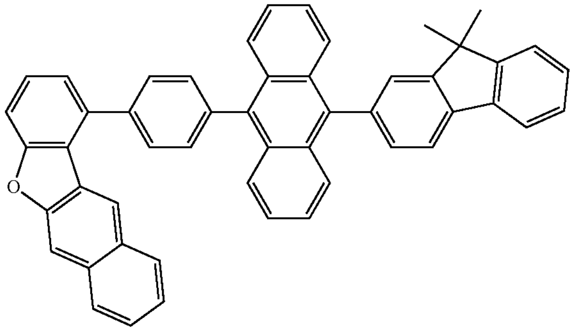

-continued
2-19
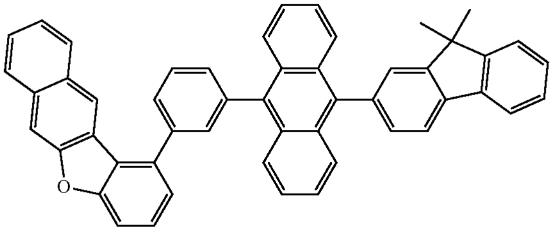
2-20
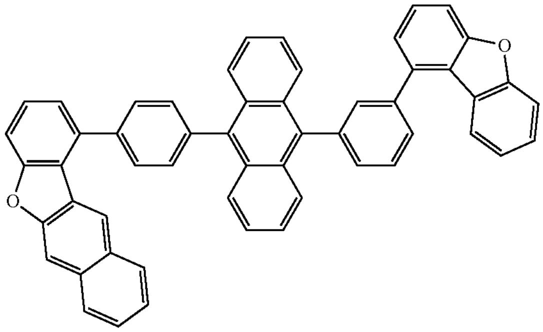
2-21
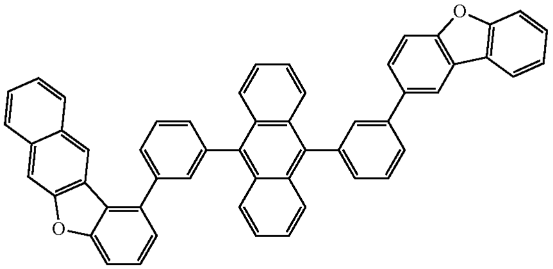
2-22
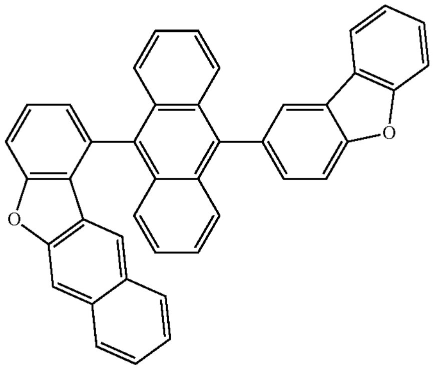
2-23
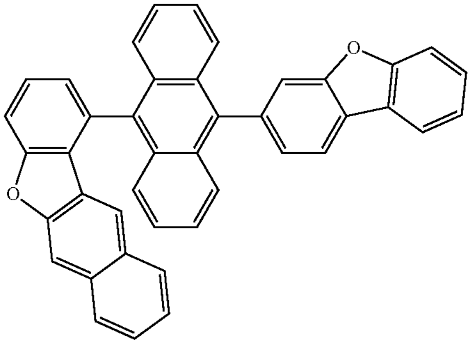
2-24
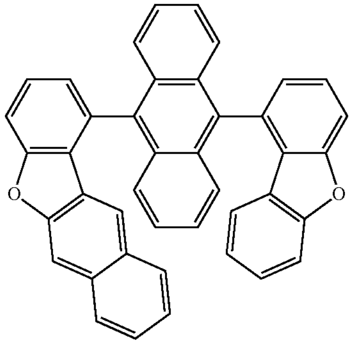
2-25
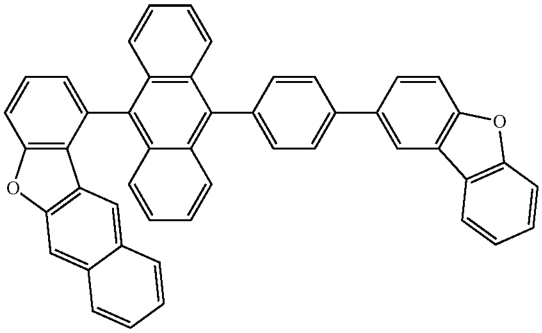
2-26
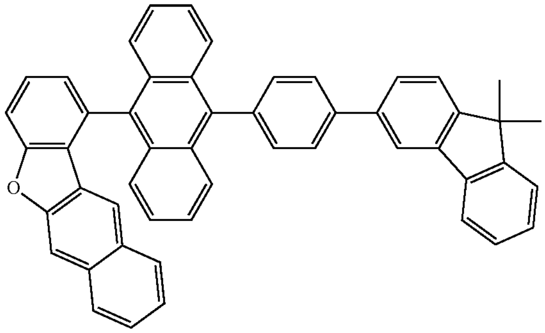

-continued
2-27
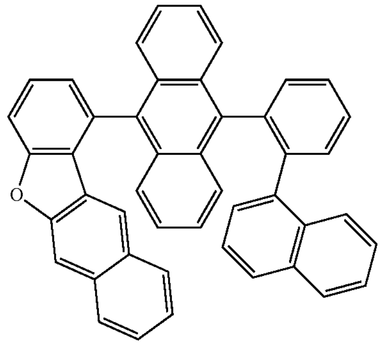
2-28
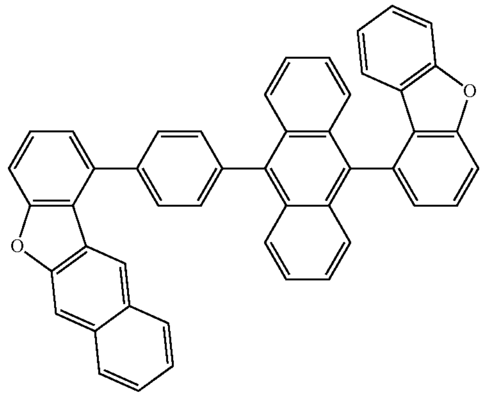
2-29
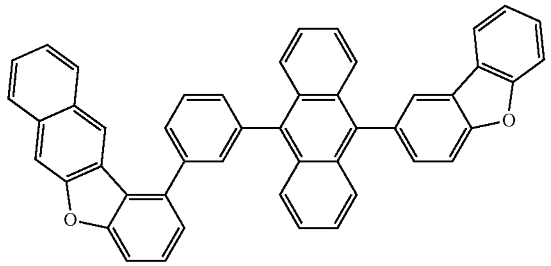
2-30
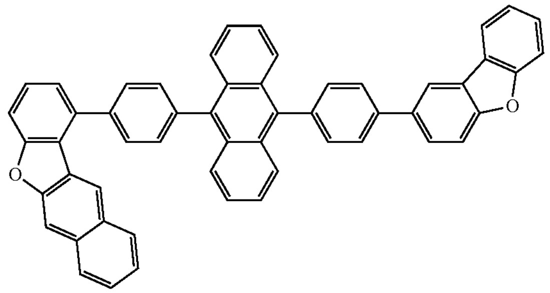
2-31
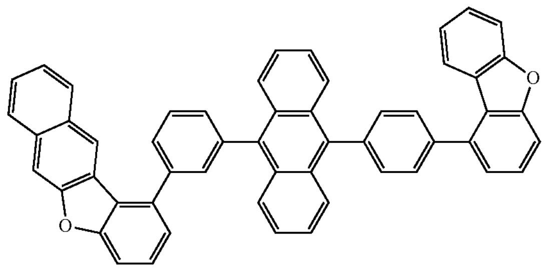
2-32
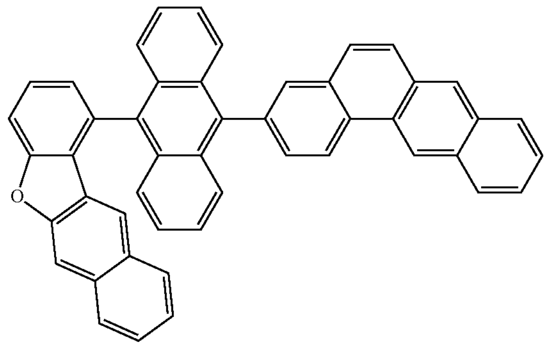
2-33
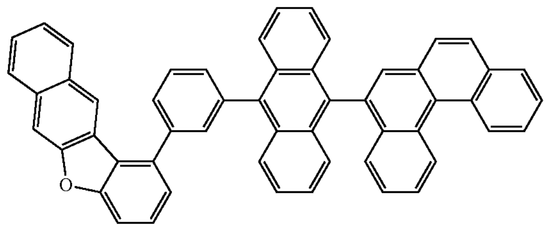
2-34
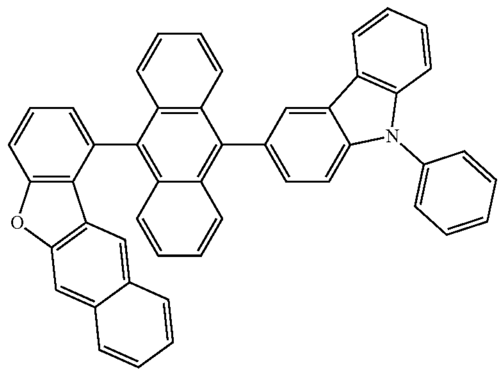

-continued
2-35
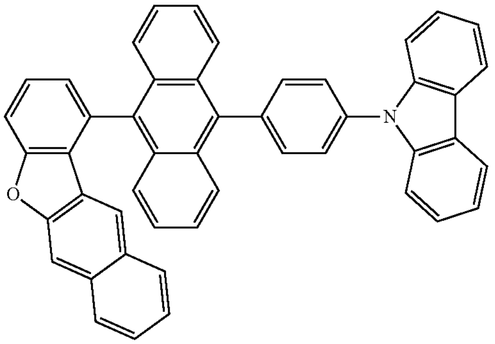
2-36
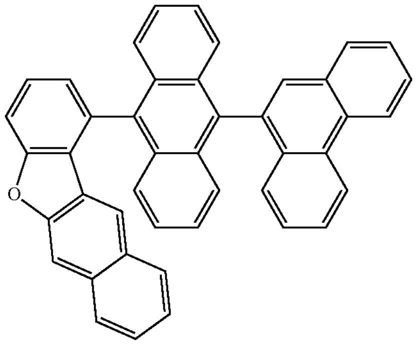
2-37
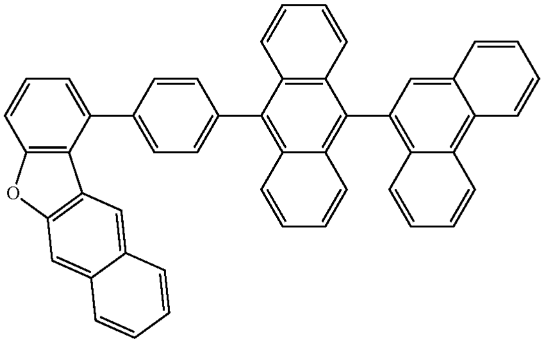
2-38
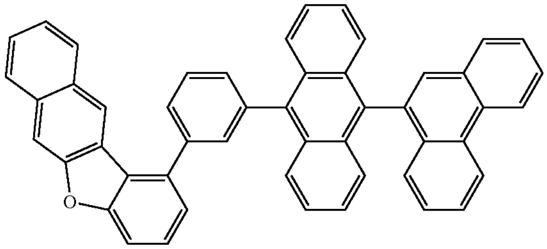
2-39
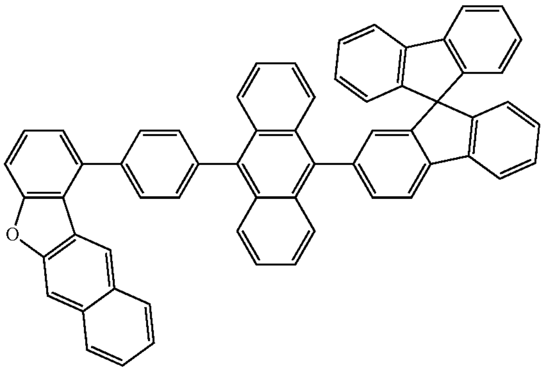
2-40
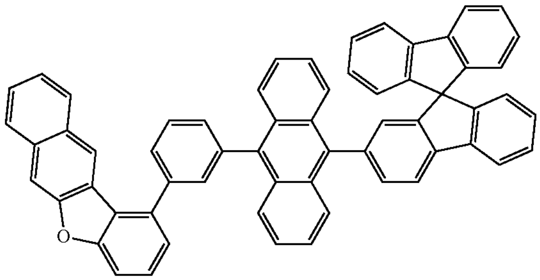
2-41
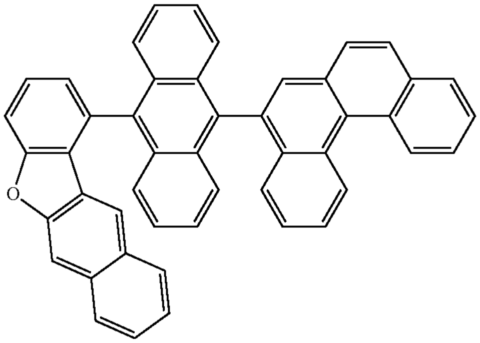
2-42
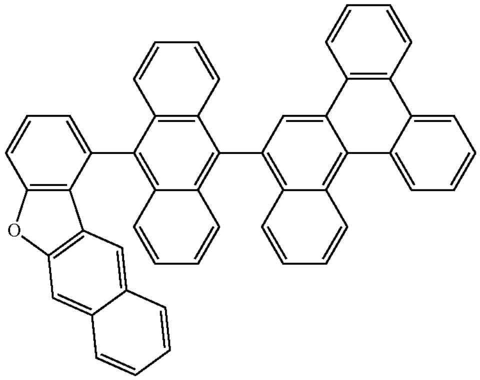

-continued
2-43
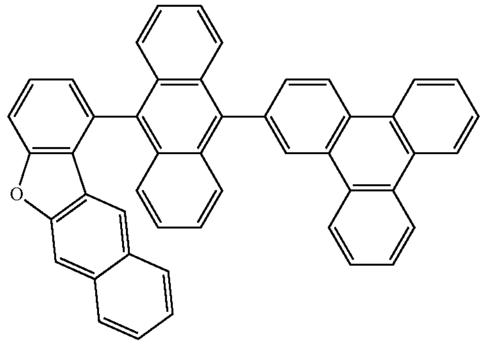
2-44
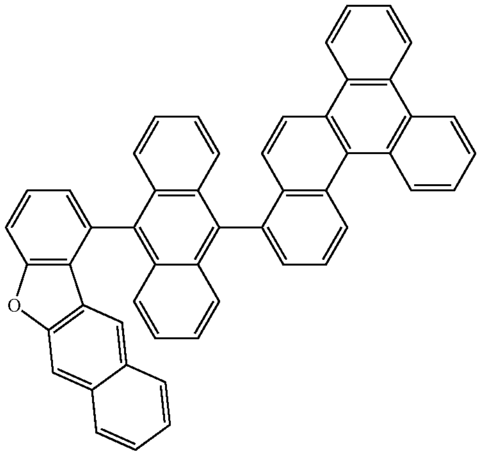
2-45
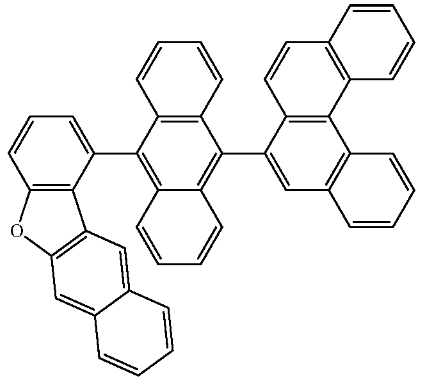
2-46
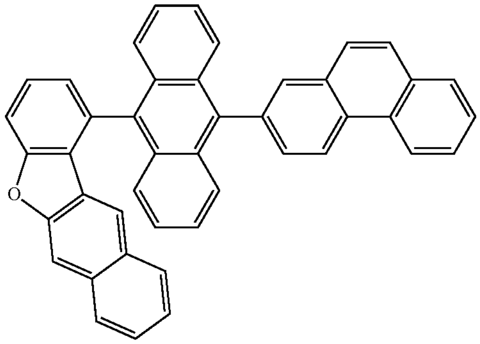
2-47
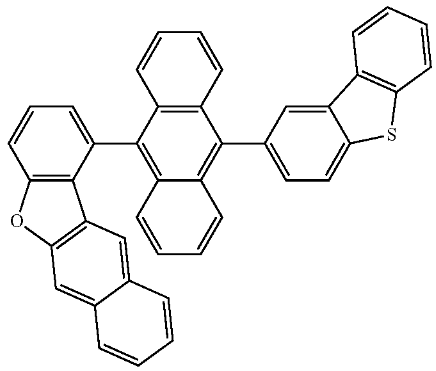
2-48
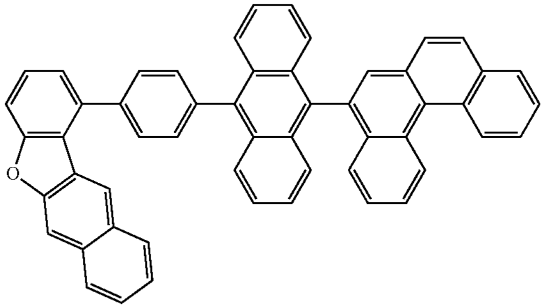
2-49
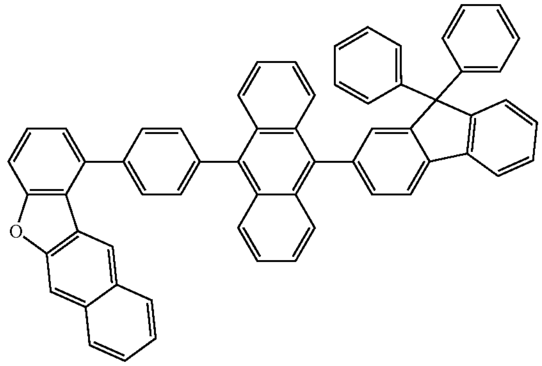
2-50
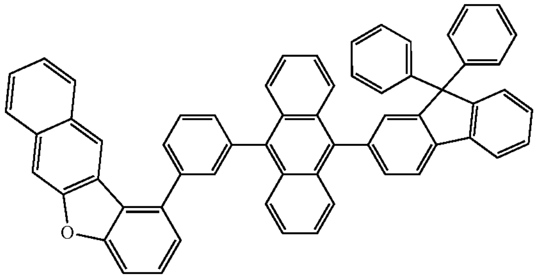

-continued
2-51
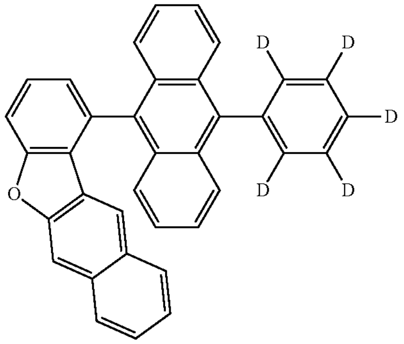
2-52
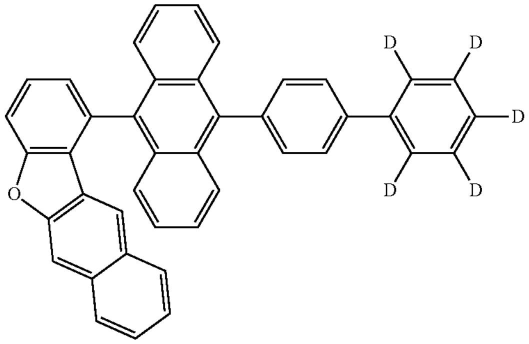
2-53
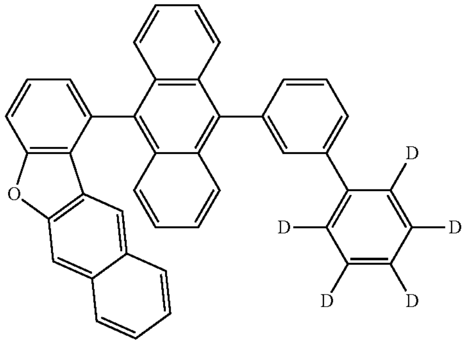
2-54
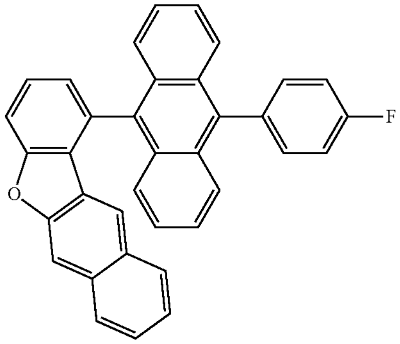
2-55
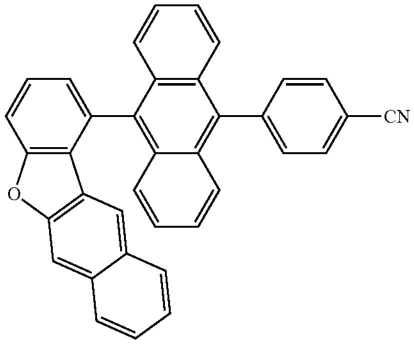
2-56
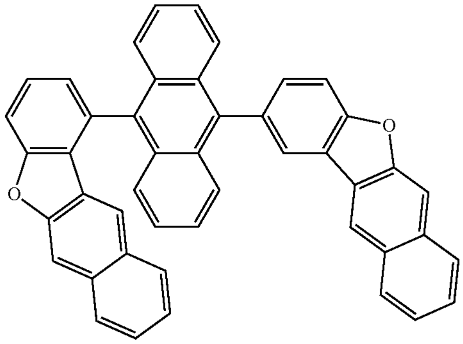
2-57
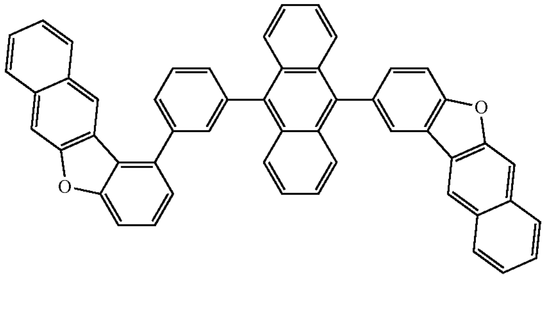
2-58
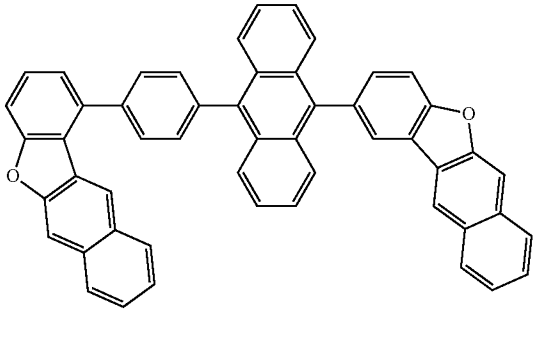

-continued
2-59
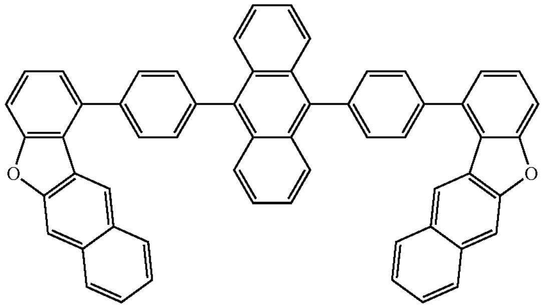
2-60
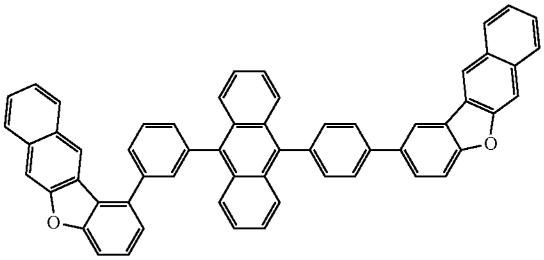
2-61
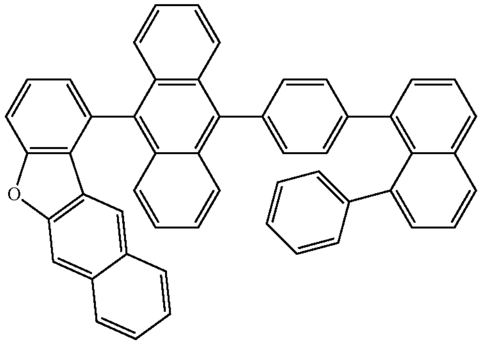
2-62
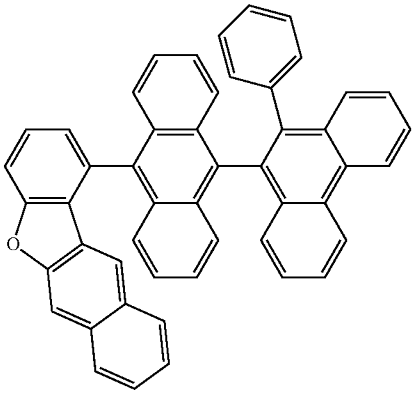
2-63
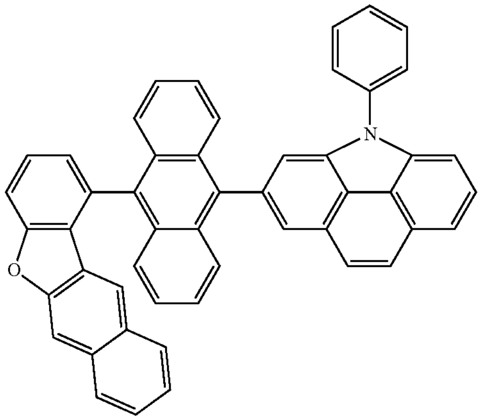
2-64
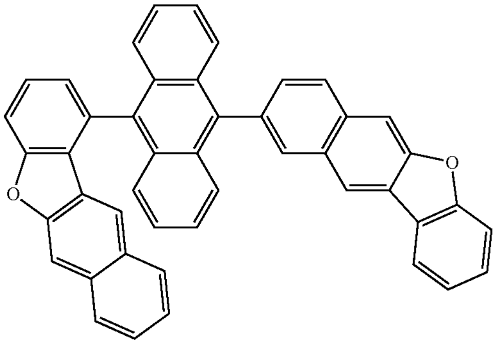
2-65
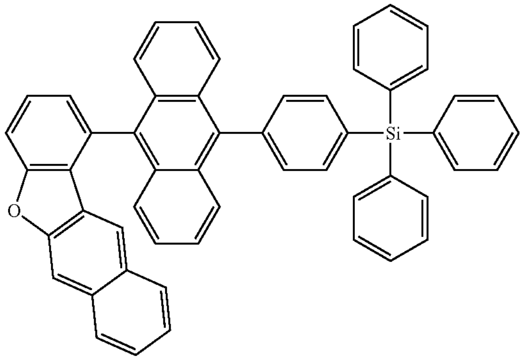
2-66
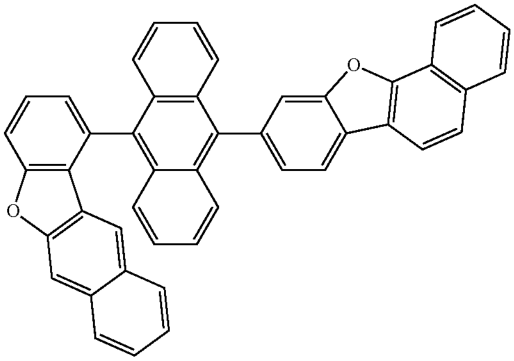

-continued
2-67
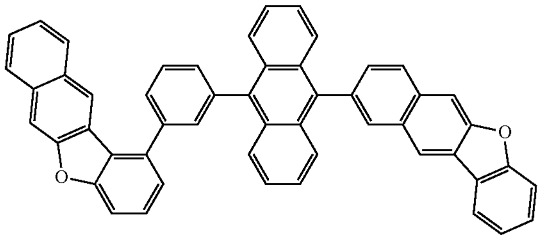
2-68
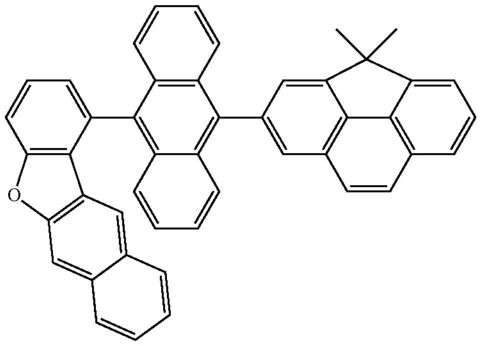
2-69
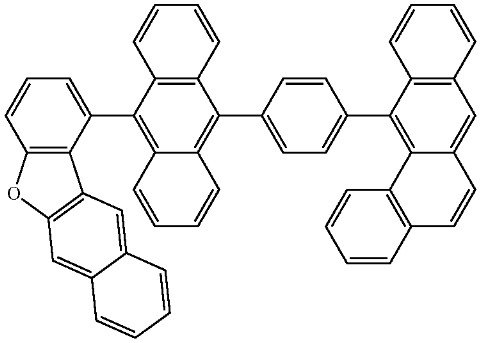
2-70
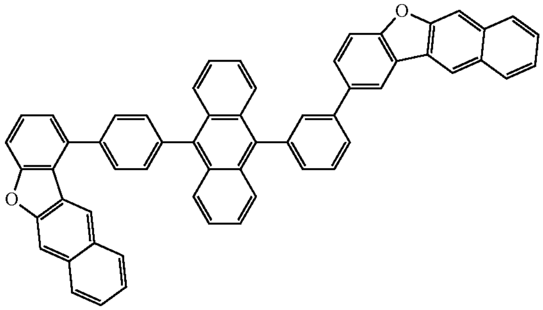
2-71
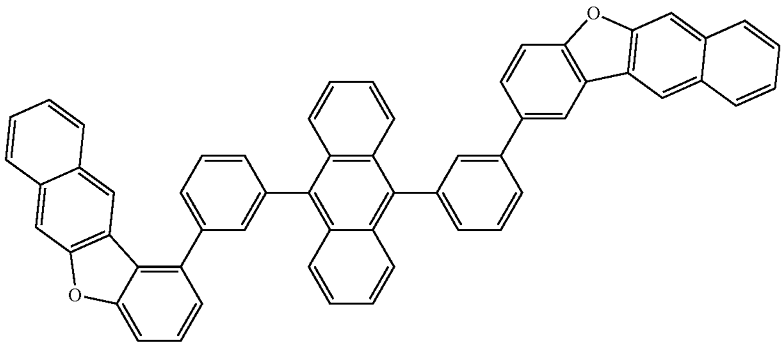
2-72
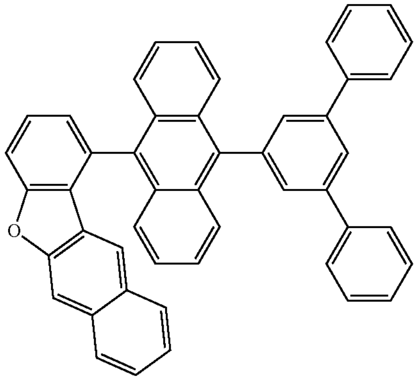
2-73
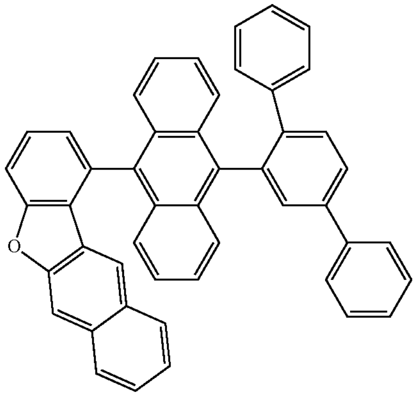

-continued
2-74
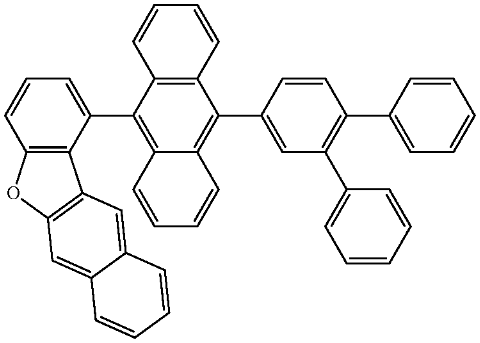
2-75
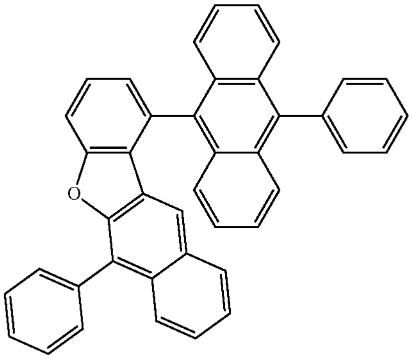
2-76
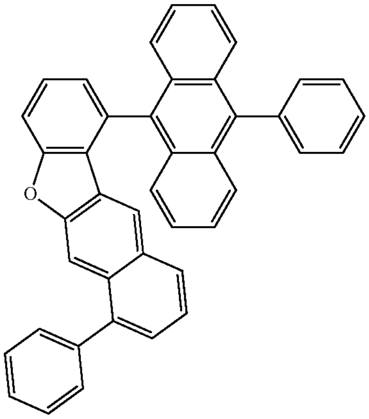
2-77
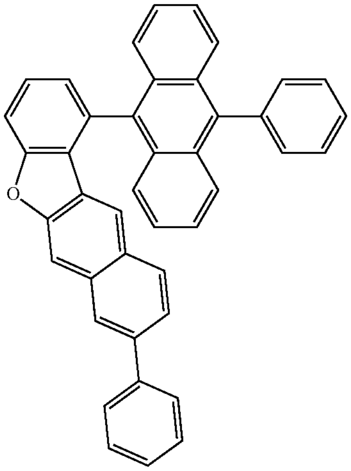
2-78
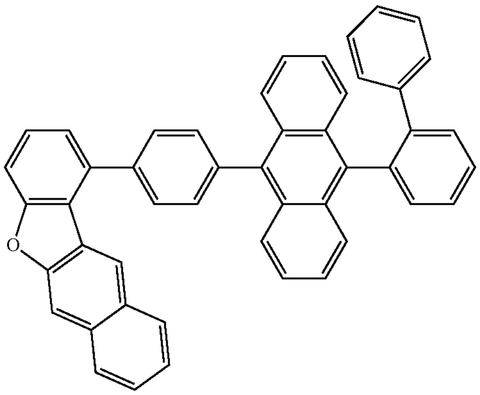
2-79
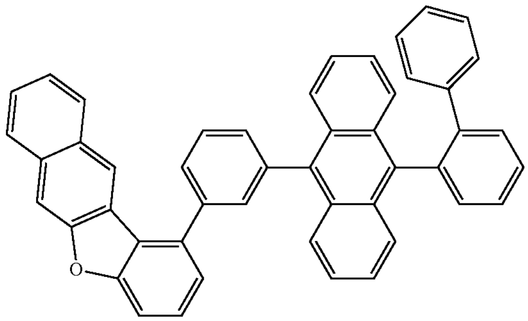
2-80
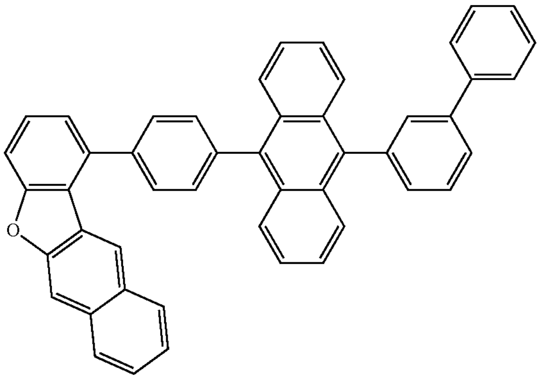
2-81
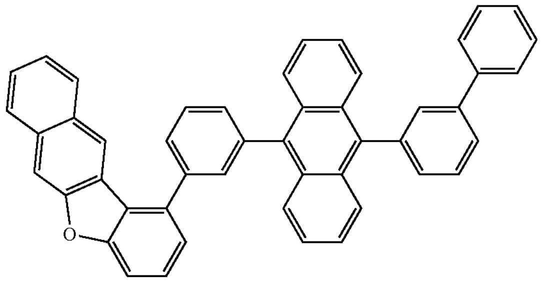

-continued
2-82
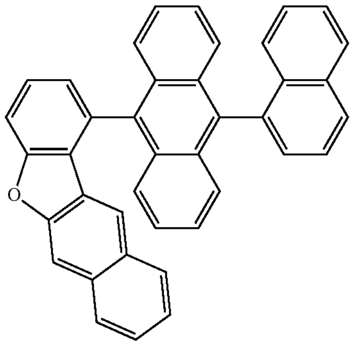
2-83
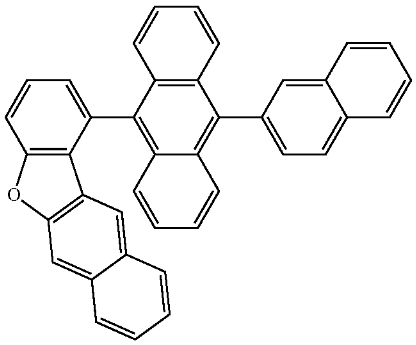
2-84
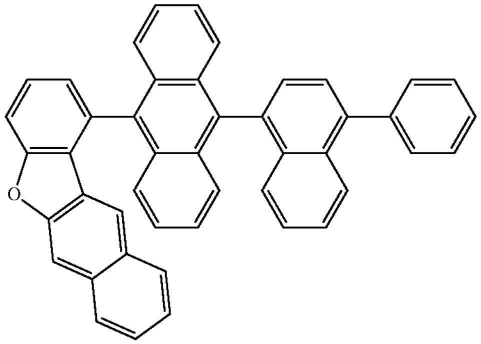
2-85
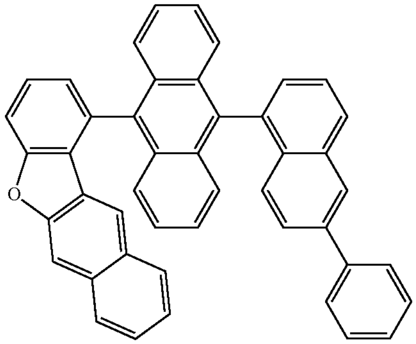
2-86
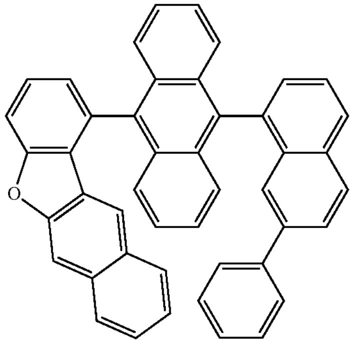
2-87
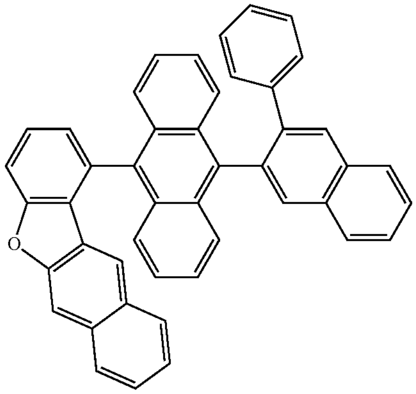
2-88
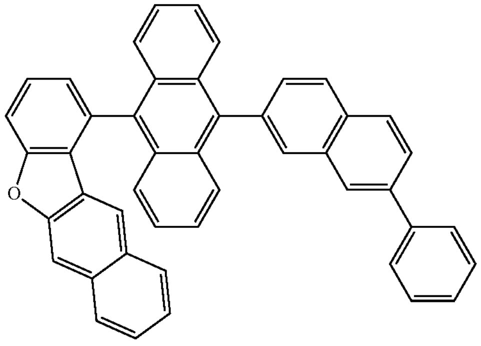
2-89
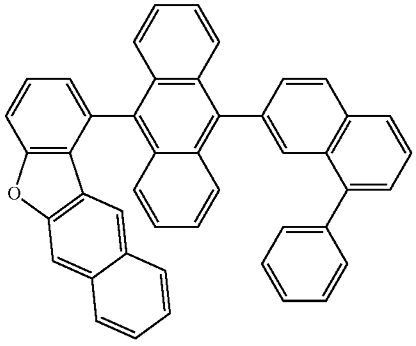

-continued
2-90
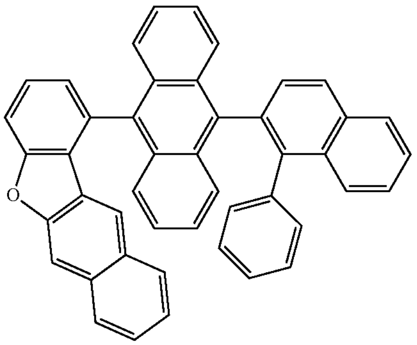
2-91
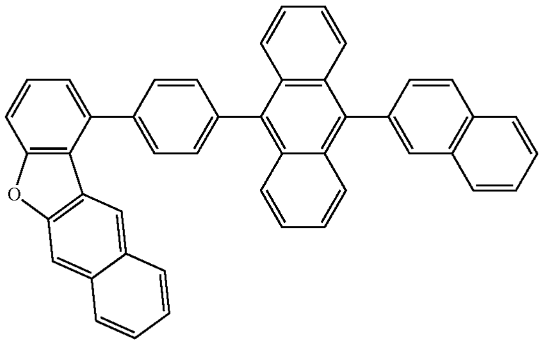
2-92
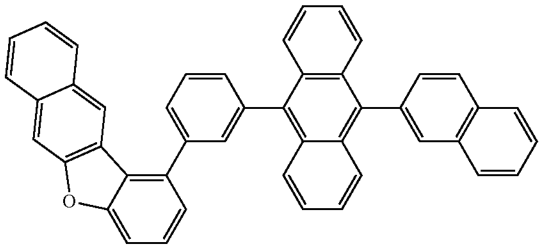
2-93
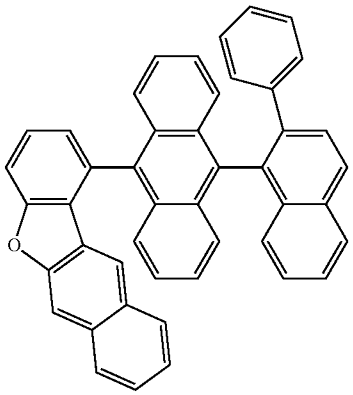
2-94
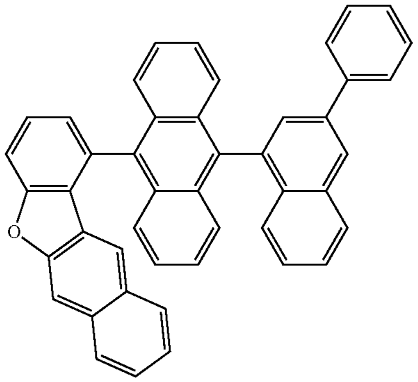
2-95
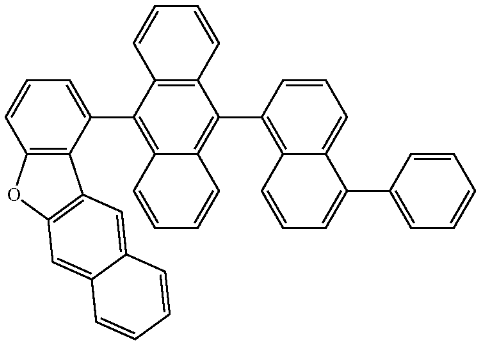
2-96
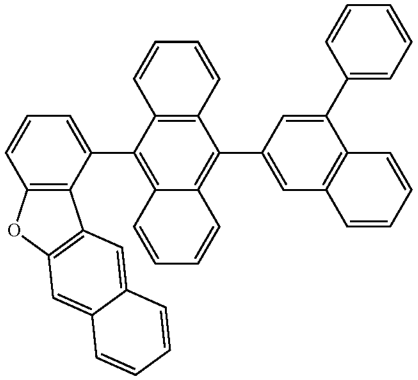
2-97
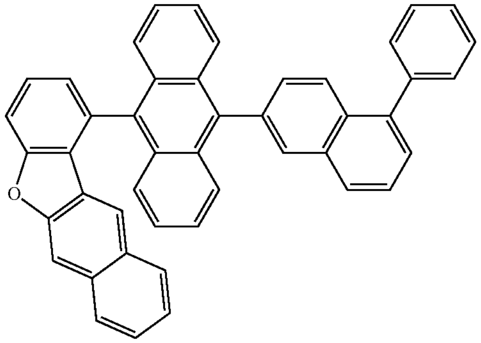

-continued
2-98
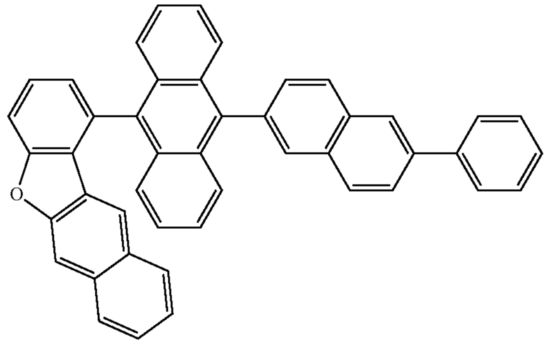
2-99
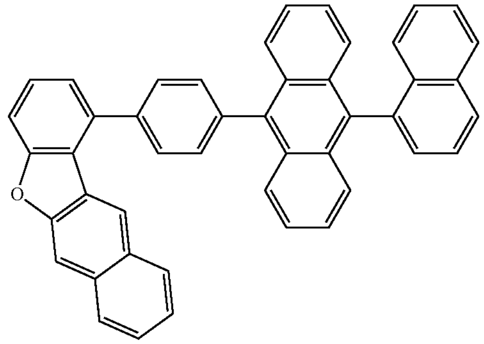
2-100
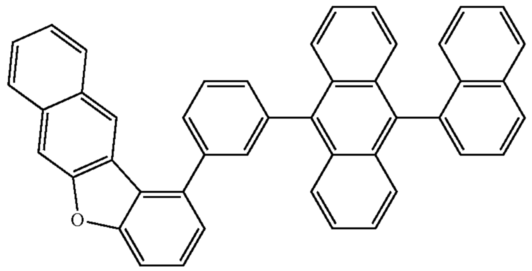
2-101
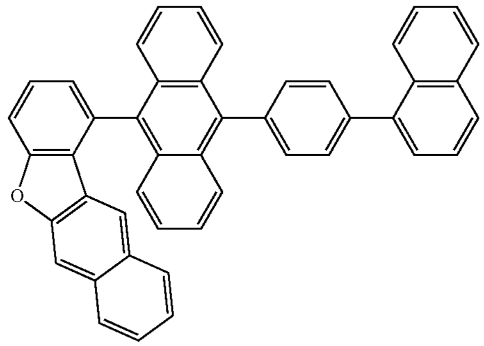
2-102
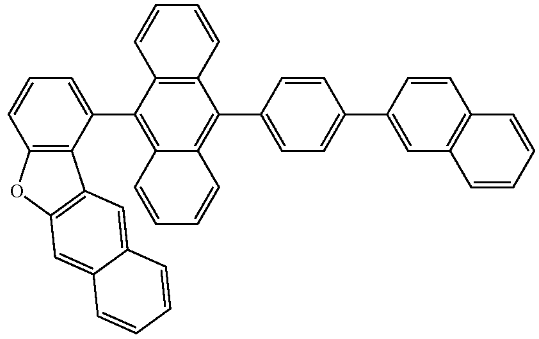
2-103
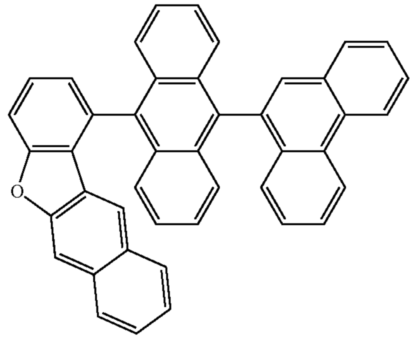
2-104
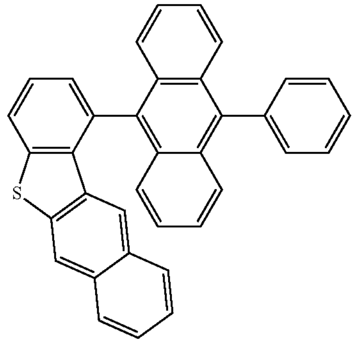
2-105
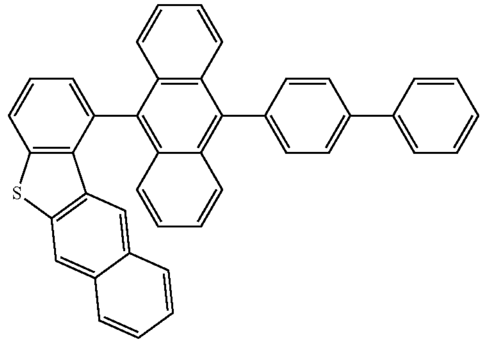

-continued
2-106
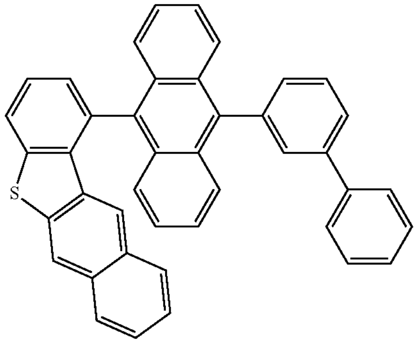
2-107
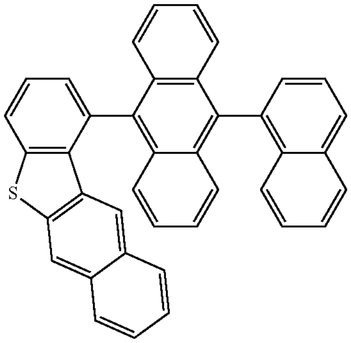
2-108
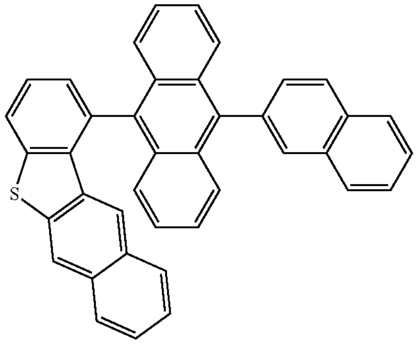
2-109
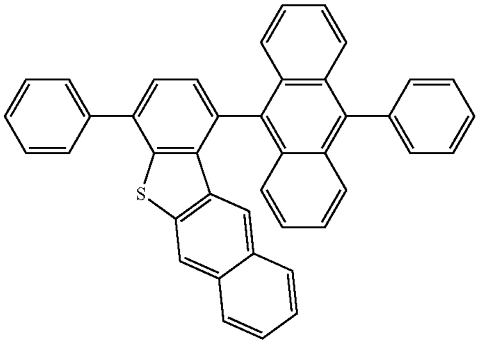
2-110
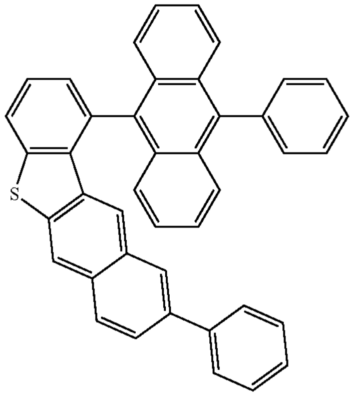
2-111
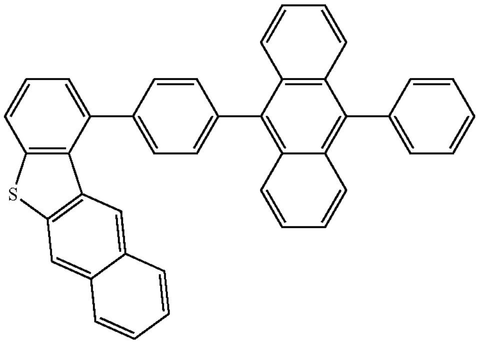
2-112
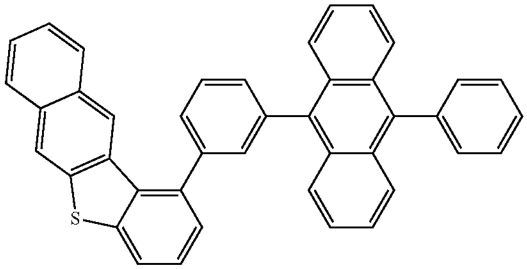
2-113
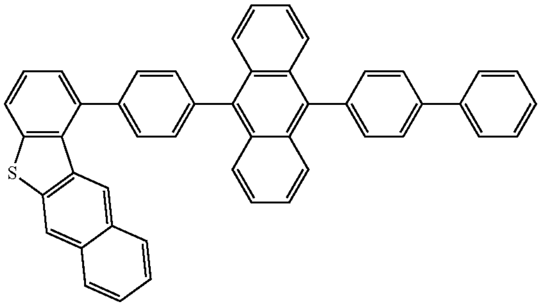

-continued
2-114
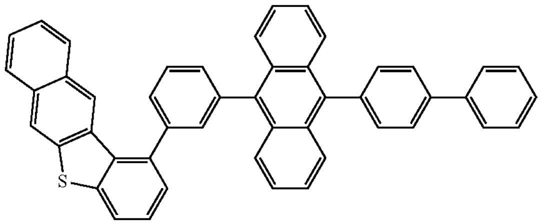
2-115
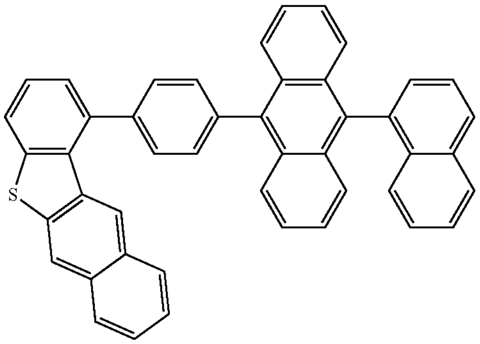
2-116
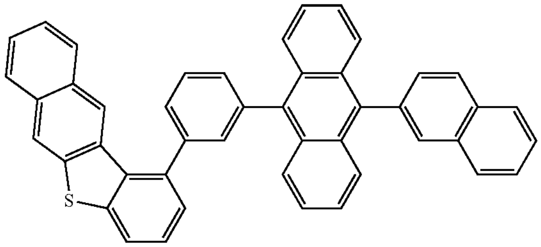
2-117
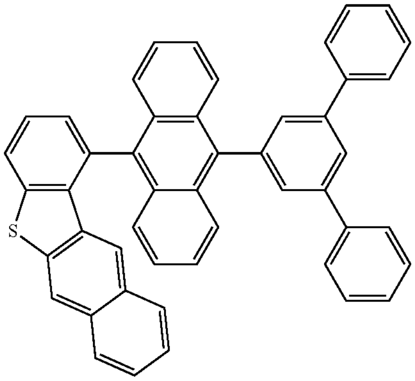
2-118
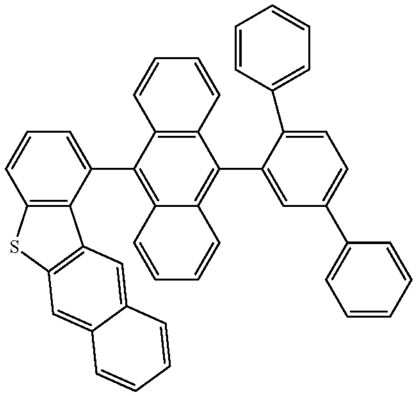
2-119
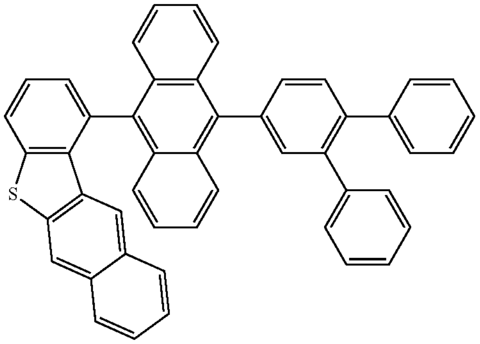
2-120
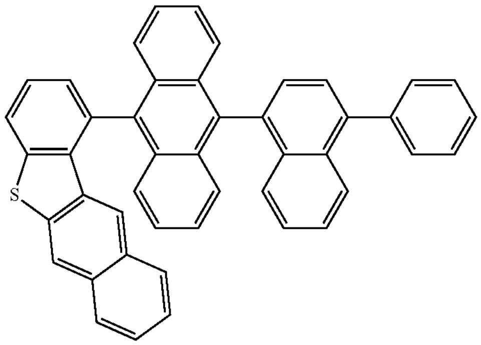
2-121
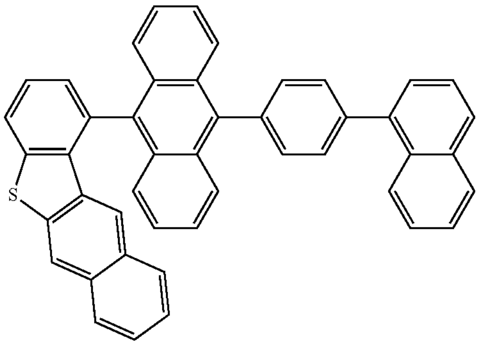

-continued
2-122
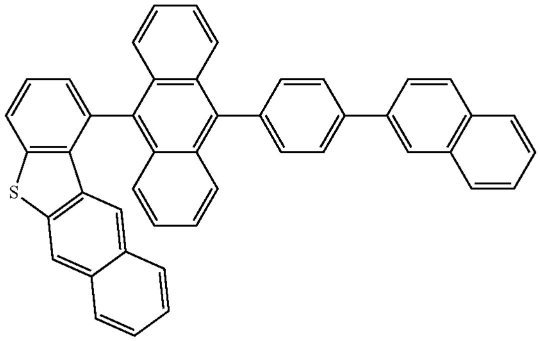
2-123
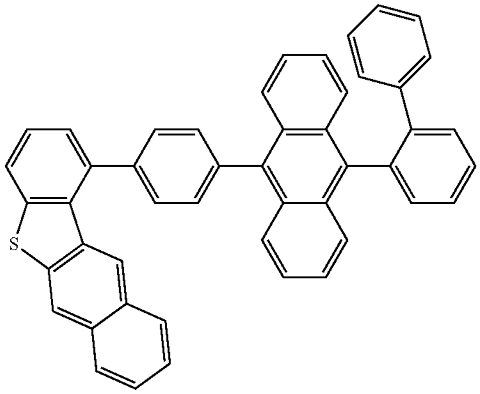
2-124
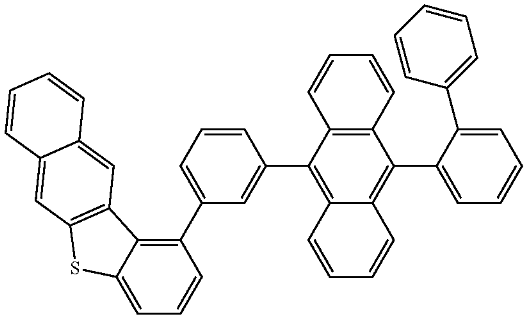
2-125
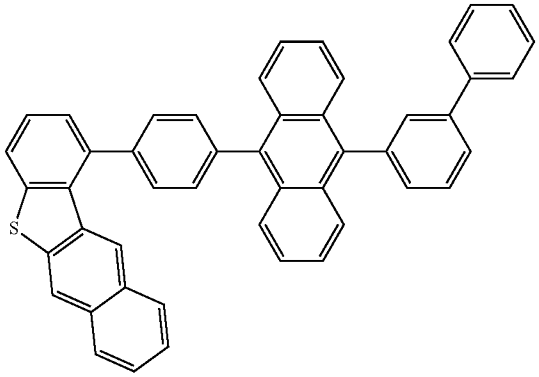
2-126
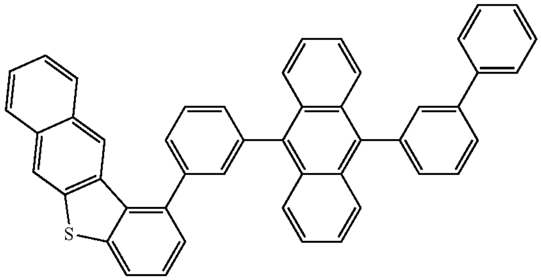
2-127
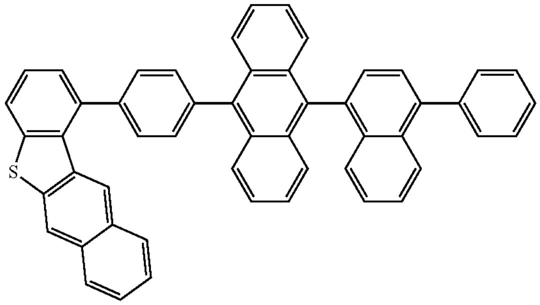
2-128
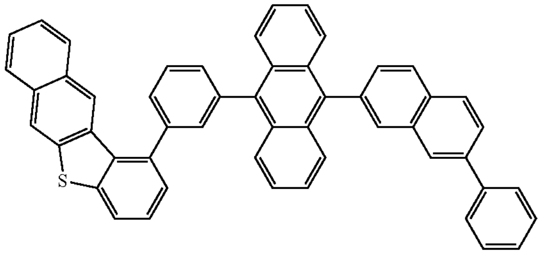
2-129
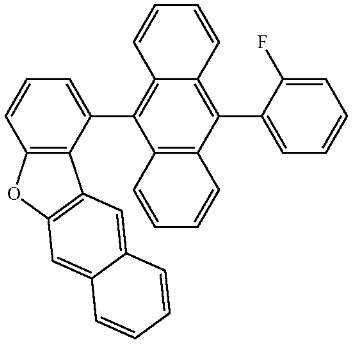

-continued
2-130
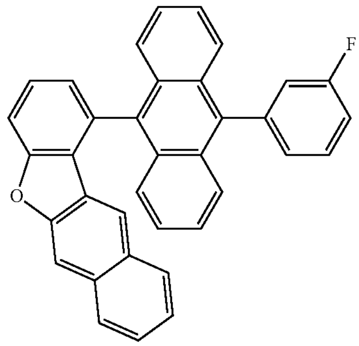
2-131
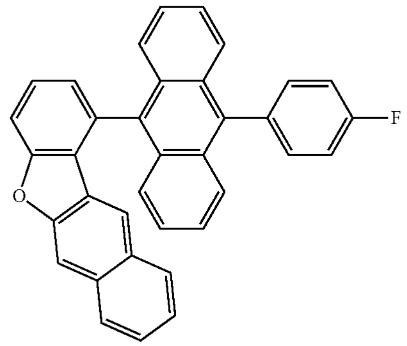
2-132
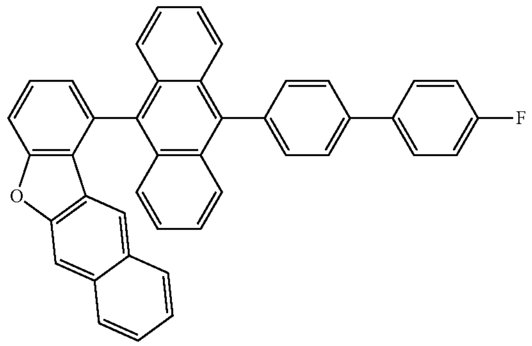
2-133
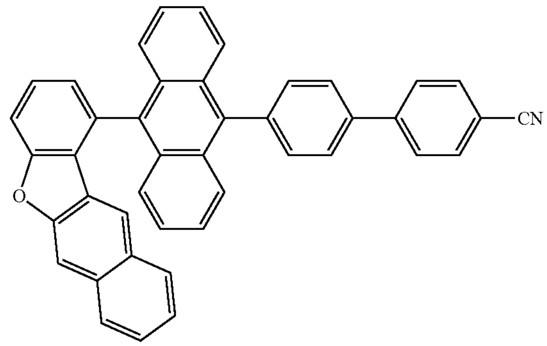
2-134
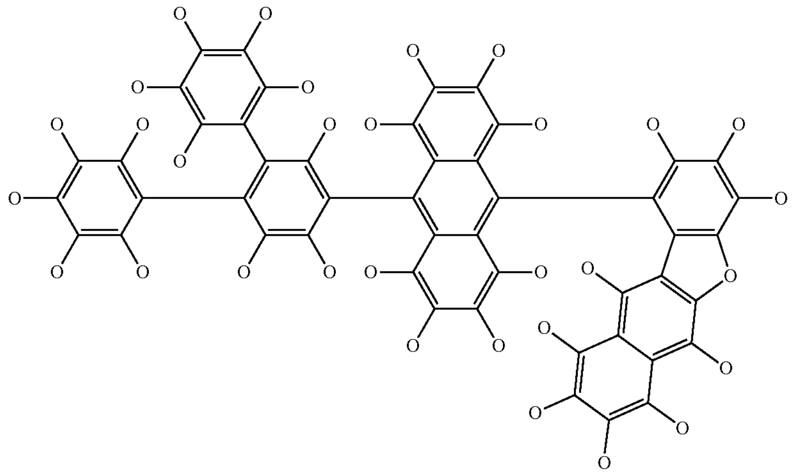
2-135
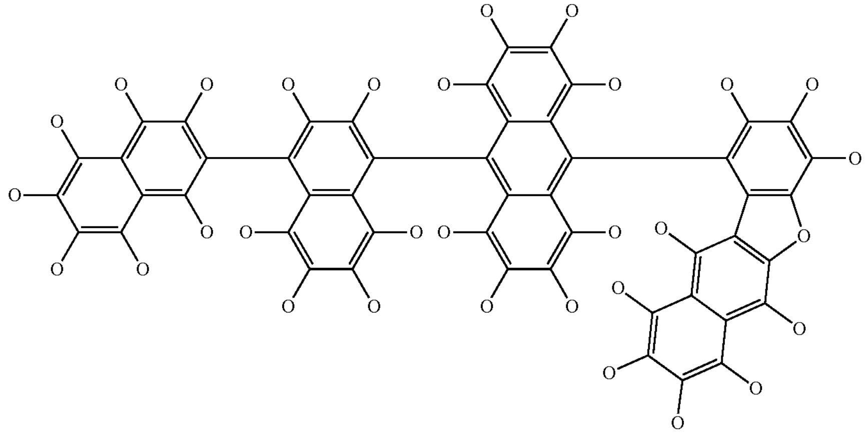

-continued
2-136
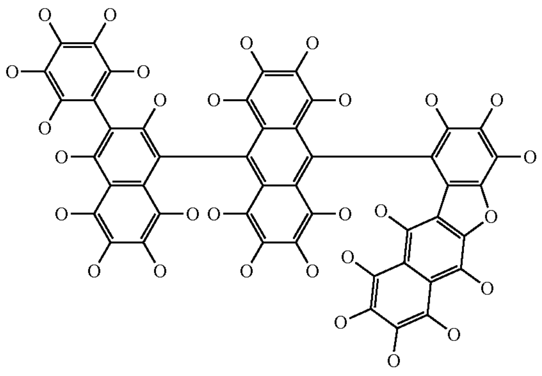
2-137
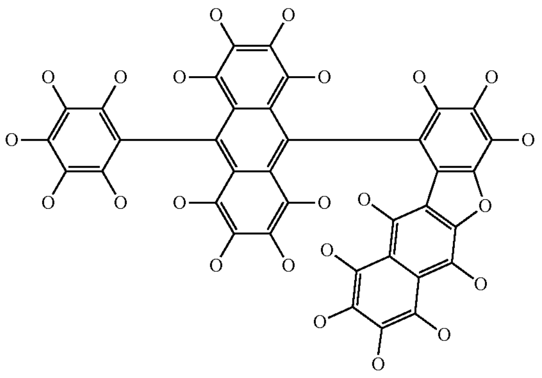
2-138
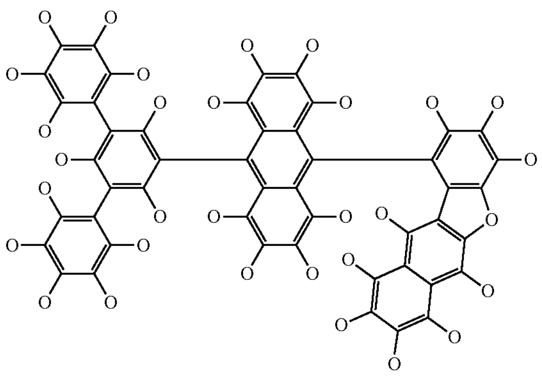
2-139
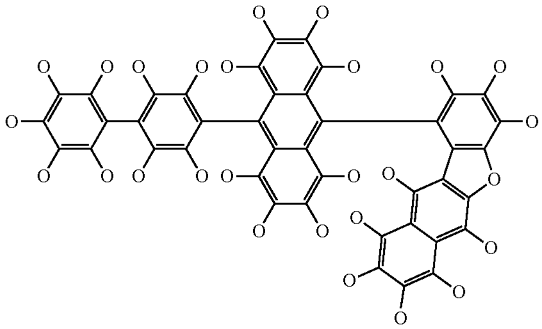
2-140
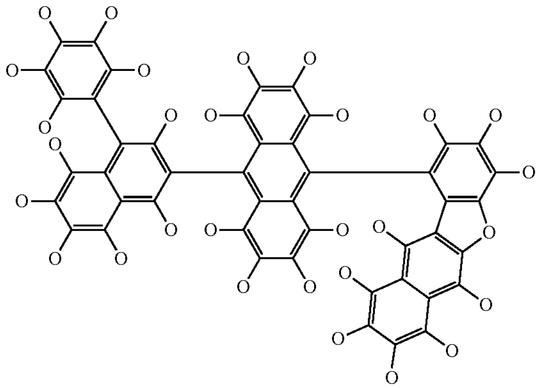
2-141
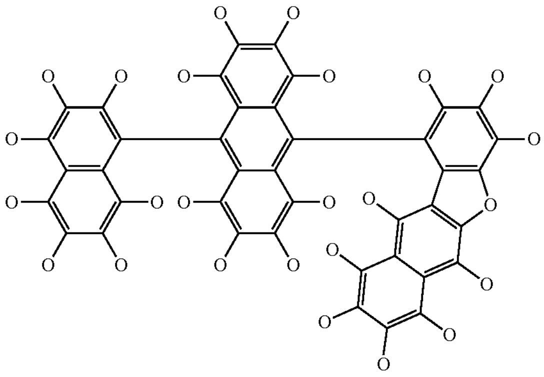
2-142
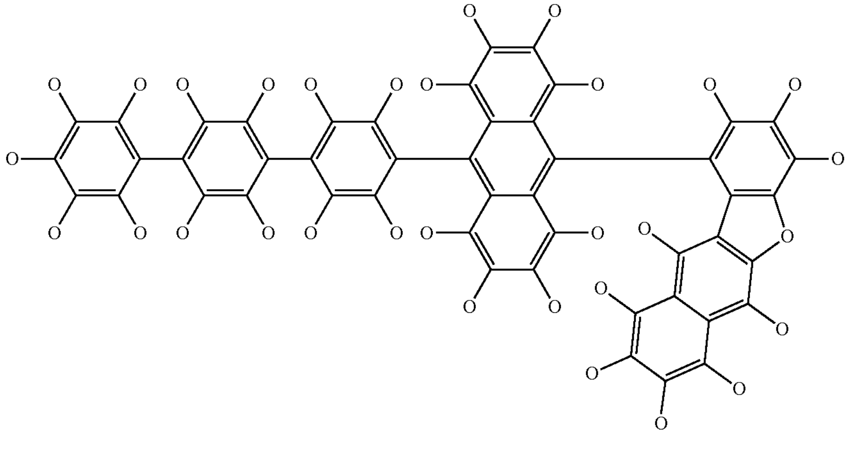

-continued
2-143
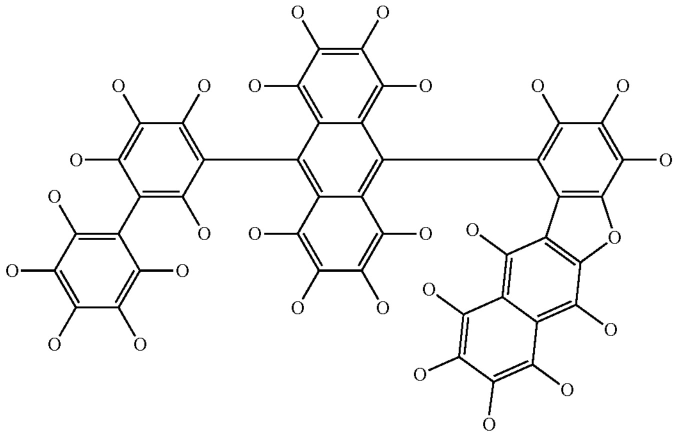
2-144
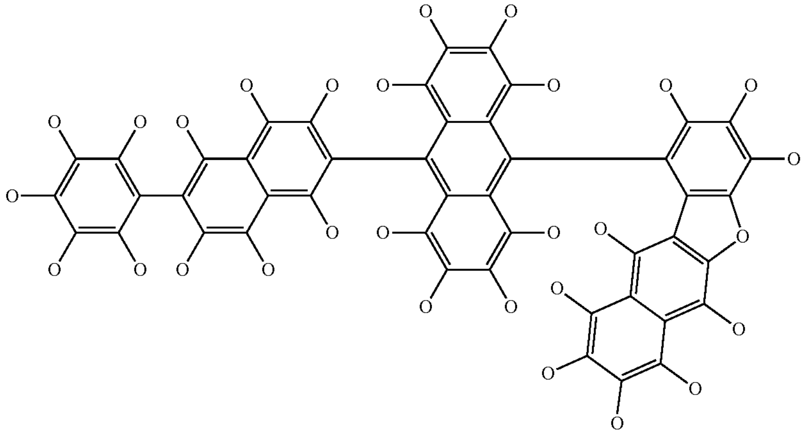
2-145
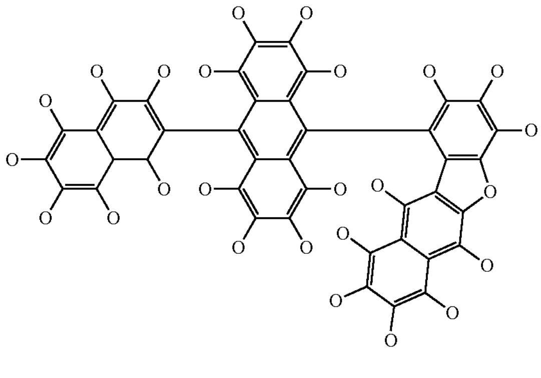
2-146
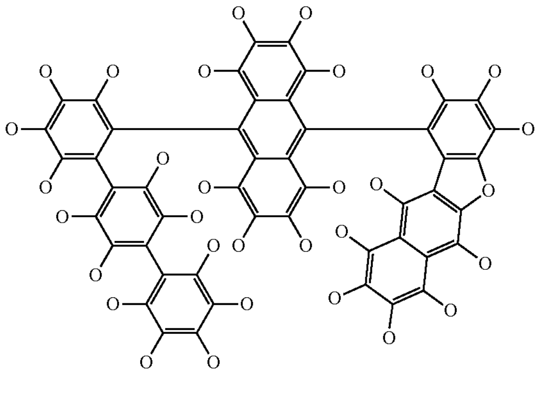

-continued
2-147
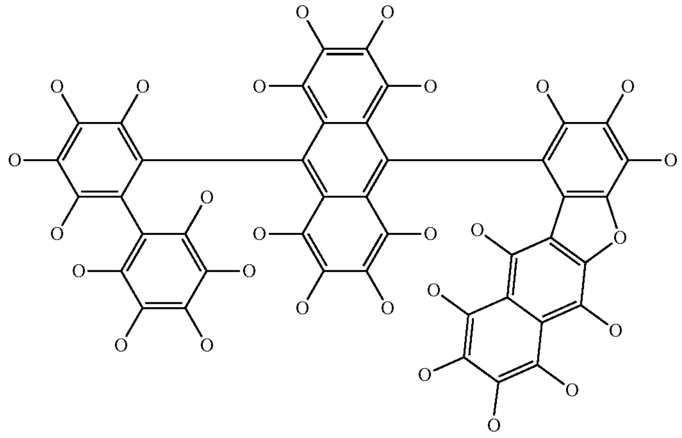
2-148
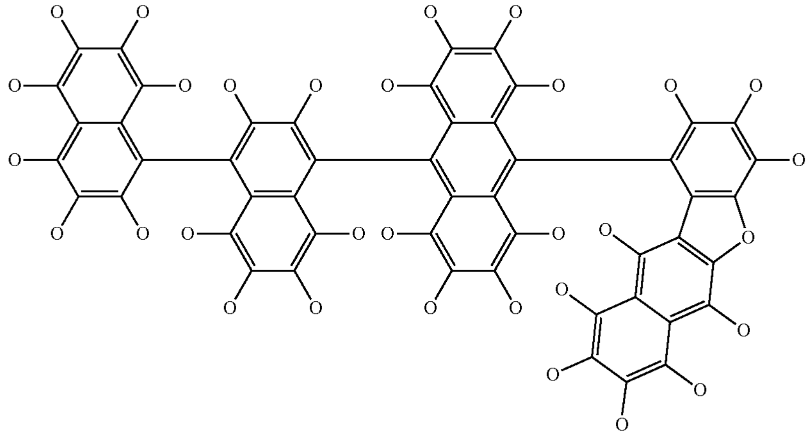
2-149
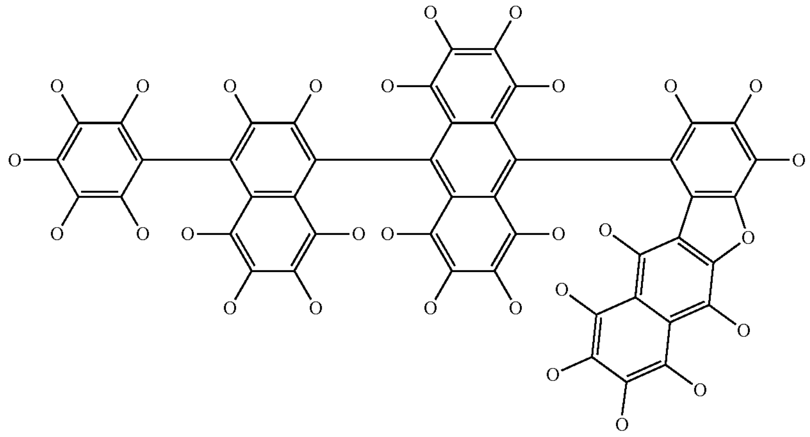

-continued
2-150
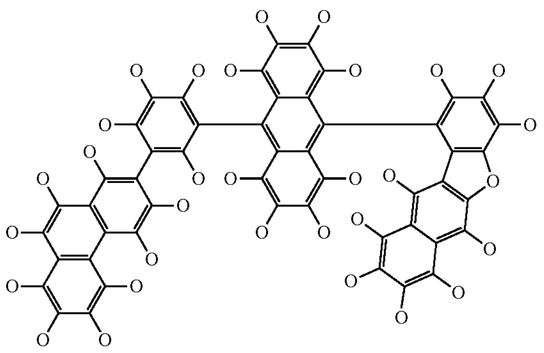
2-151
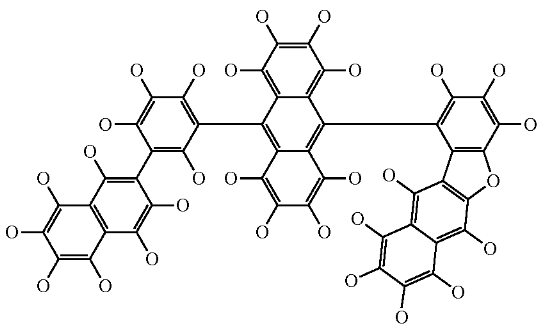
2-152
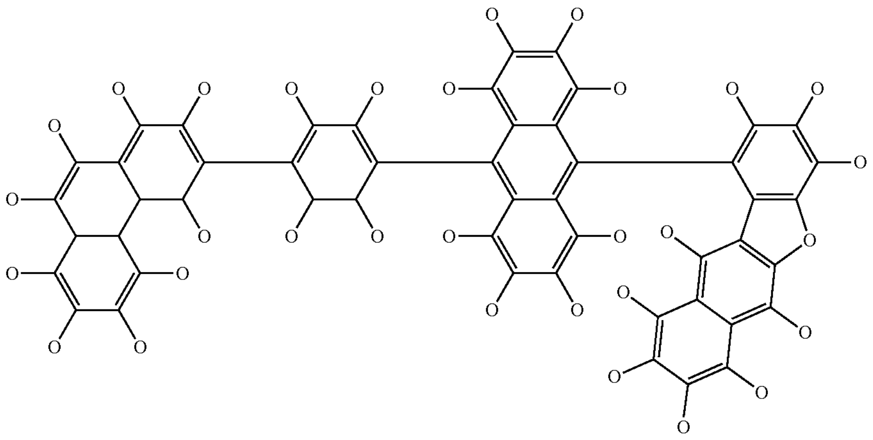
2-153
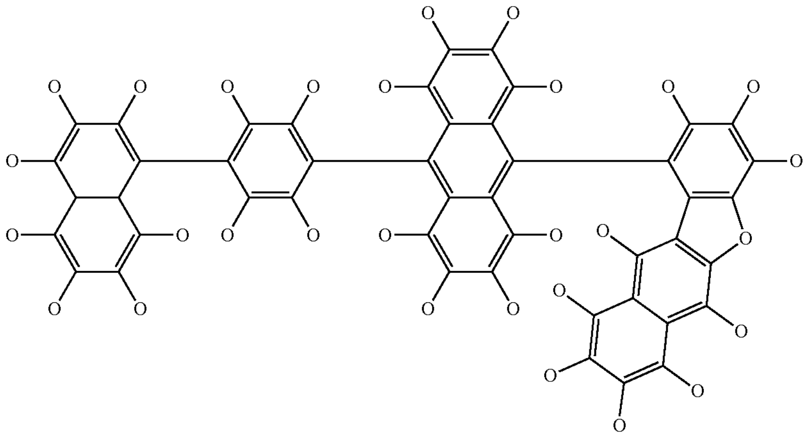

-continued
2-154
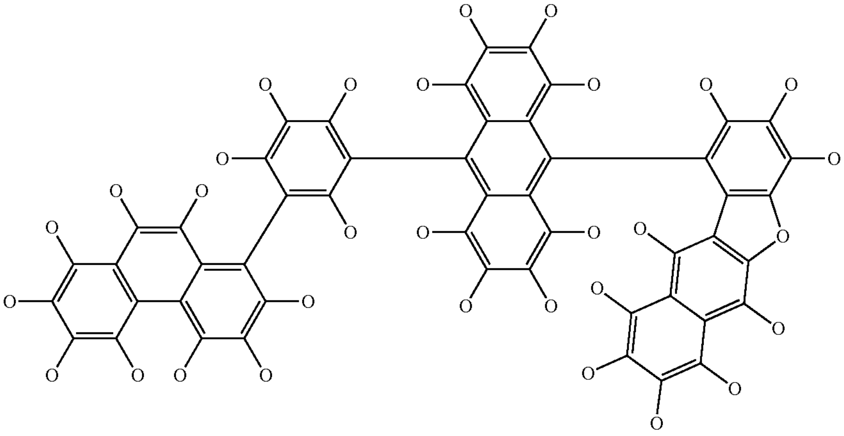
2-155
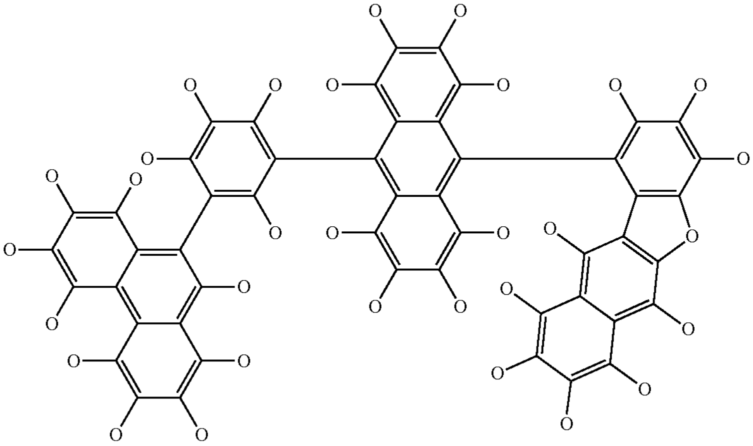
2-156
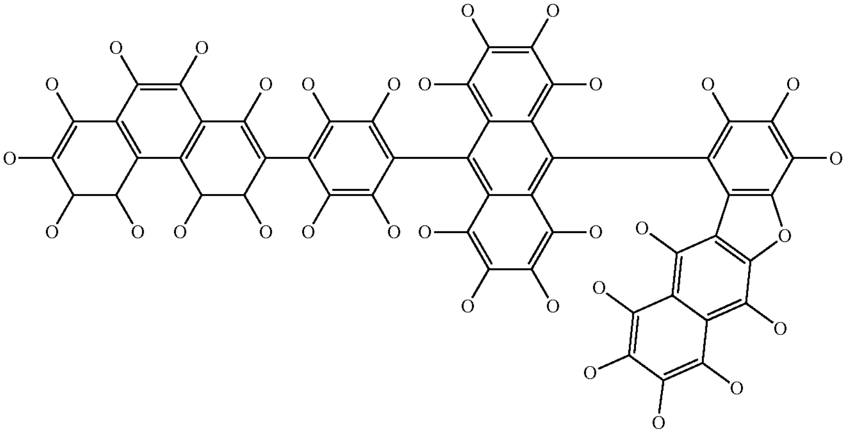

-continued
2-157
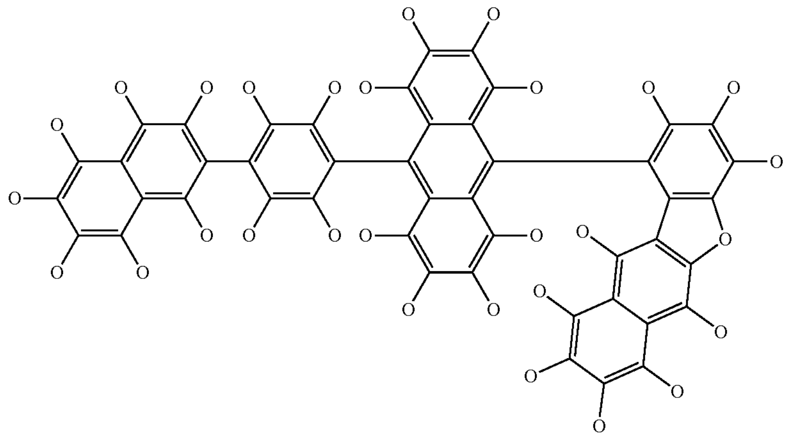
2-158
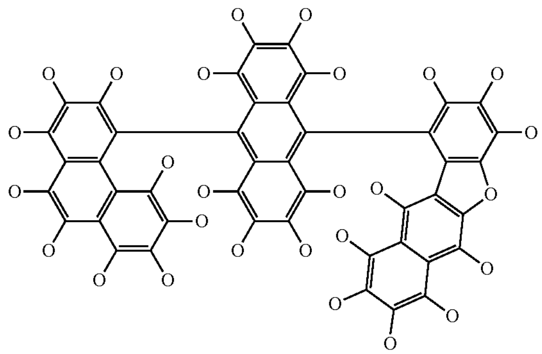
2-159
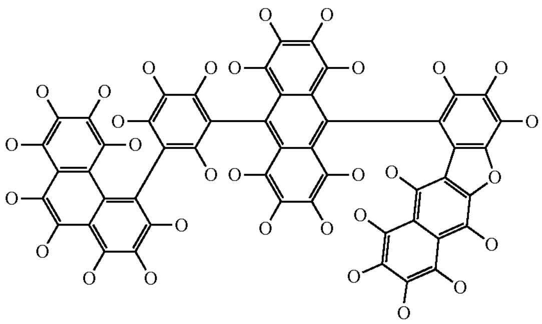
2-160
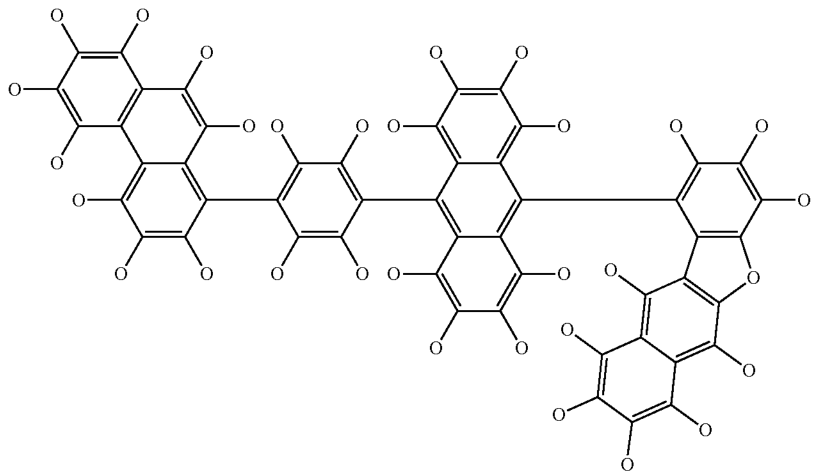

-continued
2-161
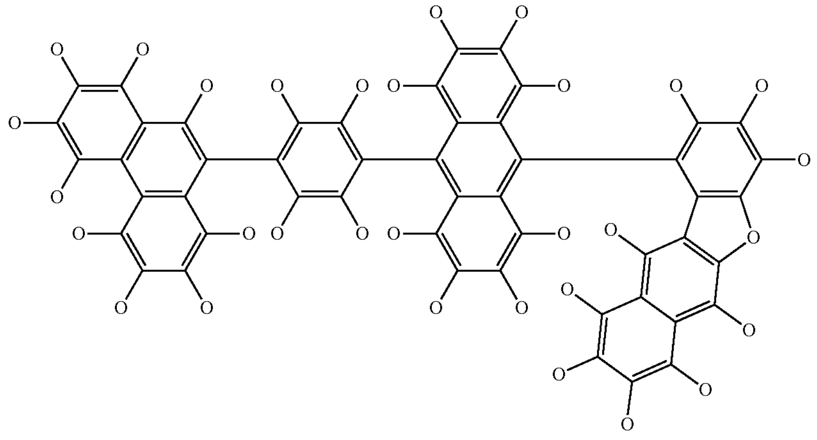
2-162
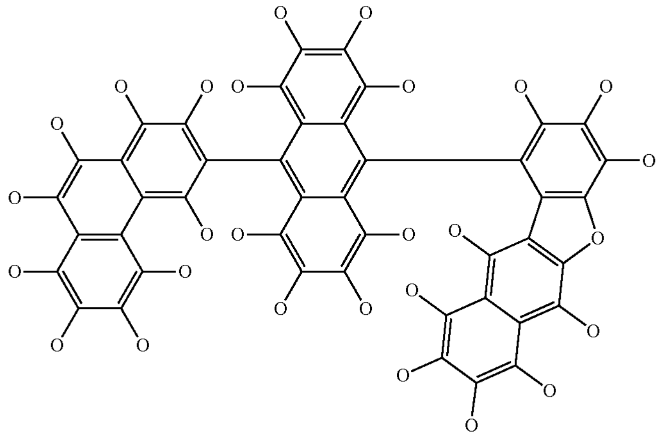
2-163
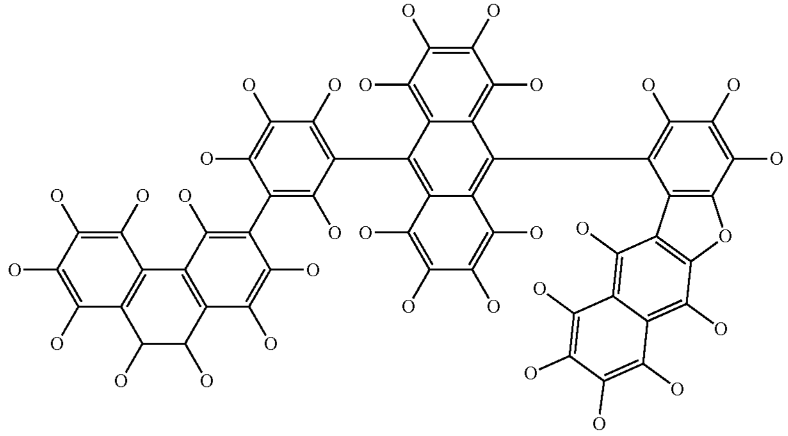

-continued
2-164
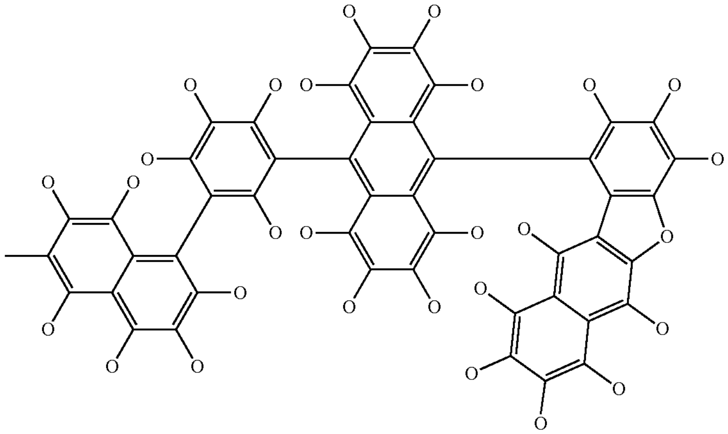
2-165
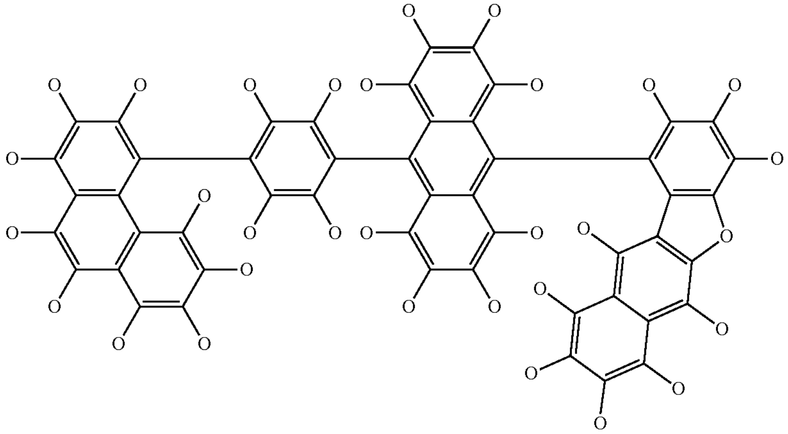
2-166
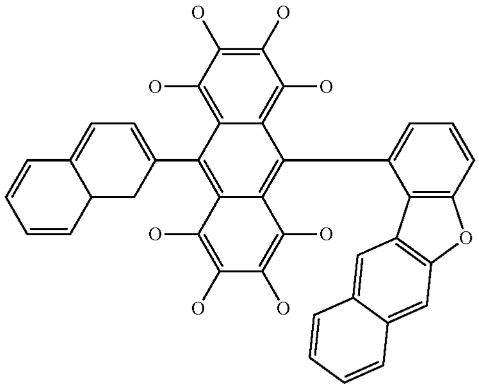
2-167
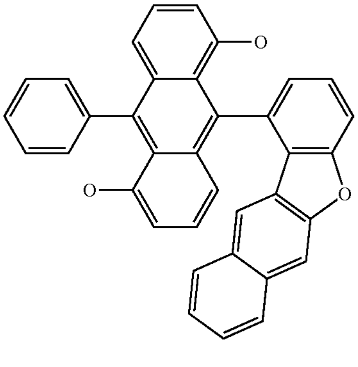
2-168
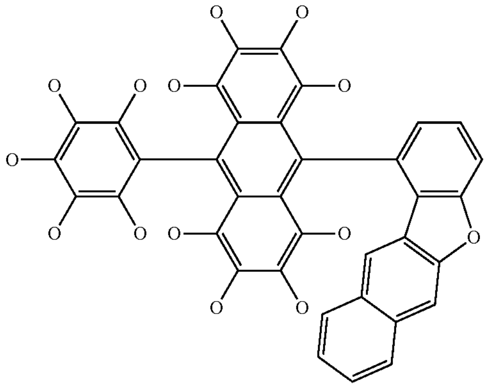
2-169
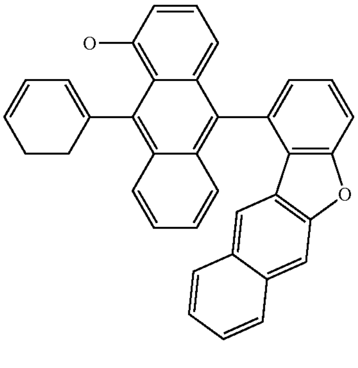

-continued
2-170
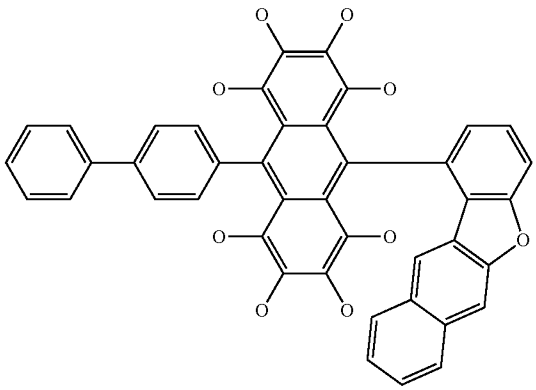
2-171
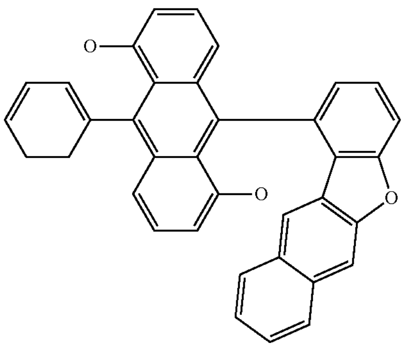
2-172
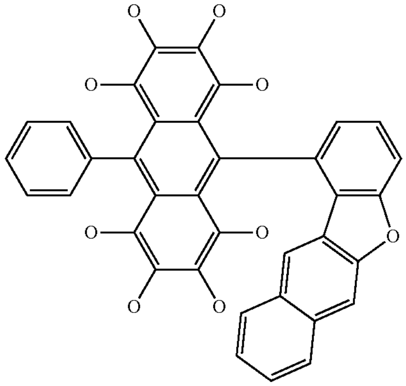
2-173
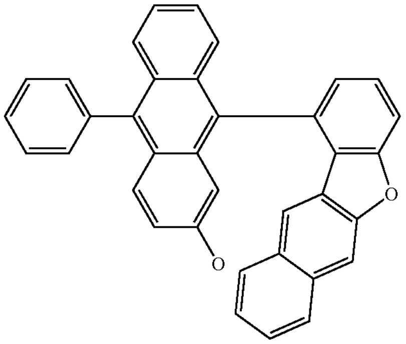
2-174
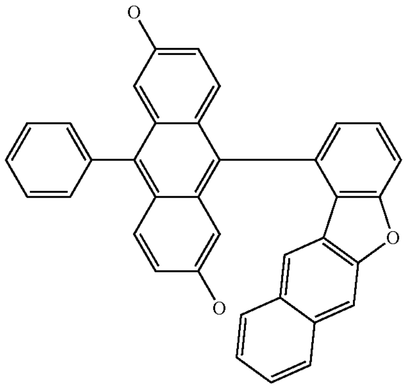
2-175
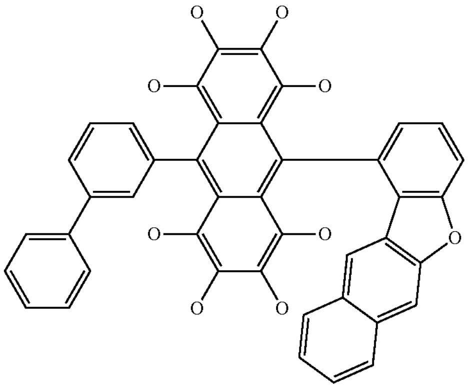
2-176
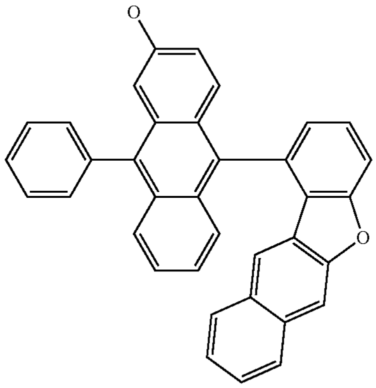
2-177
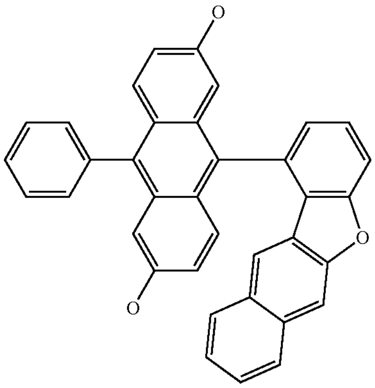

-continued
2-178
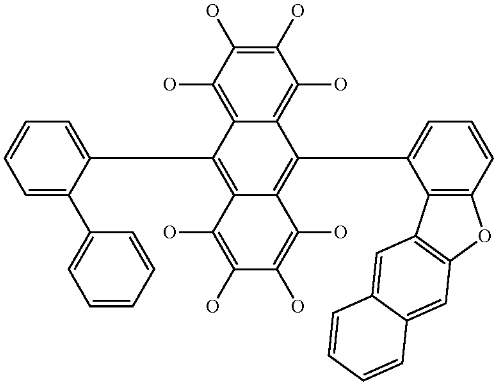
2-179
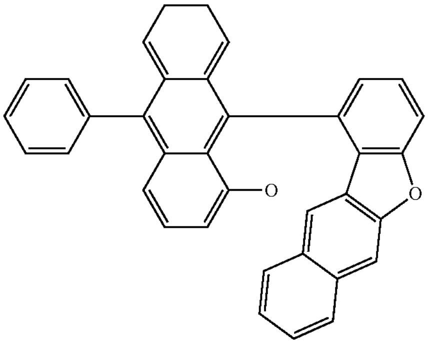
2-180
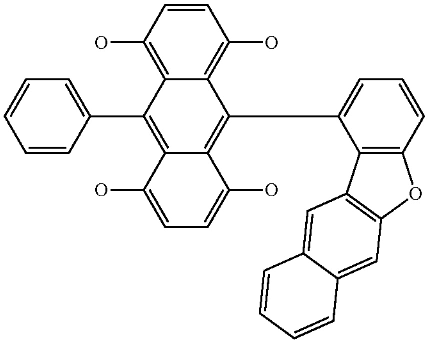
2-181
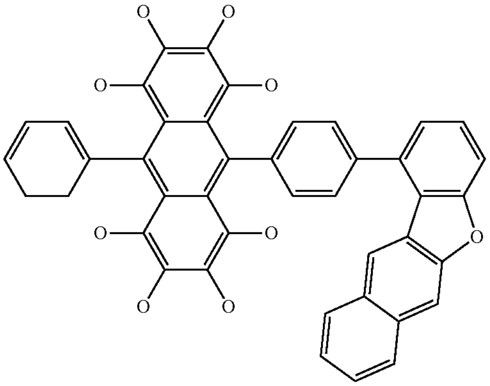
2-182
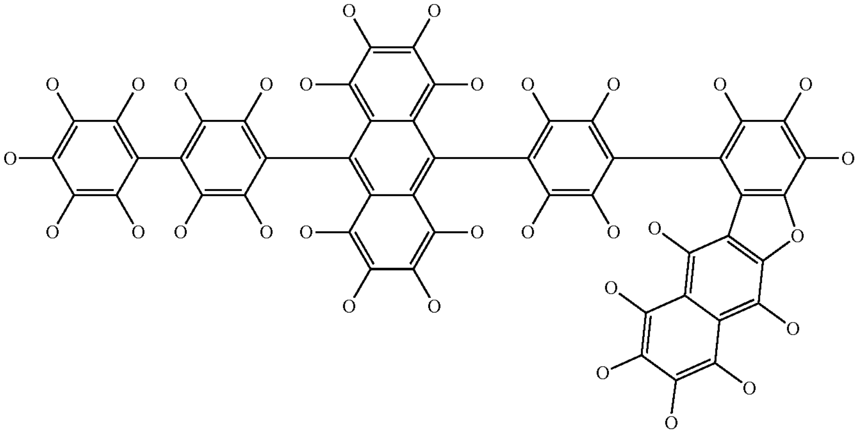
2-183
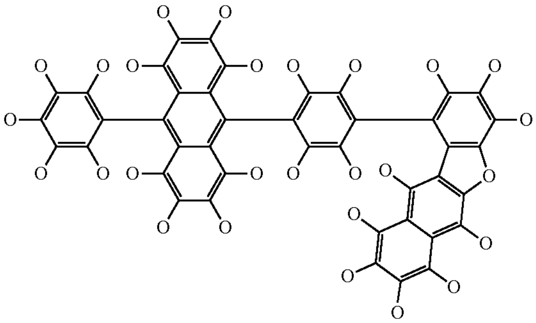
2-184
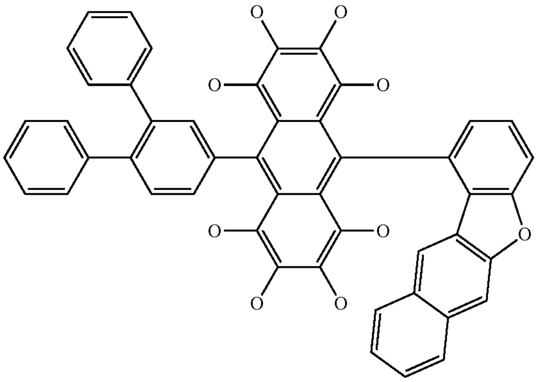

-continued
2-185
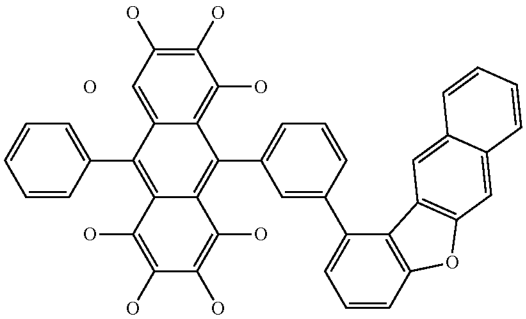
2-186
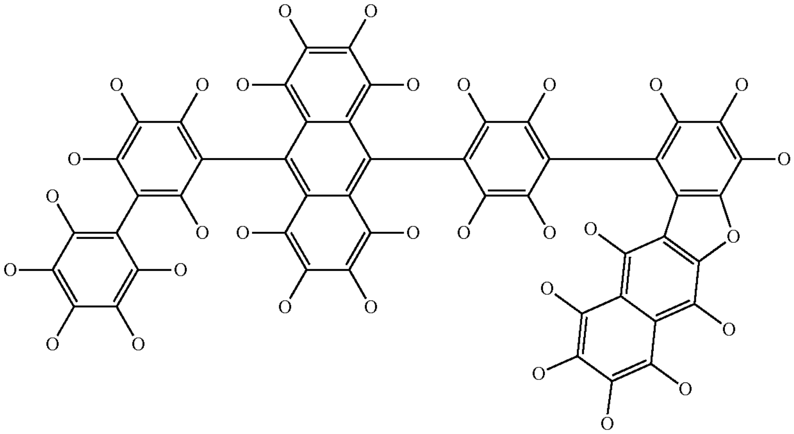
2-187
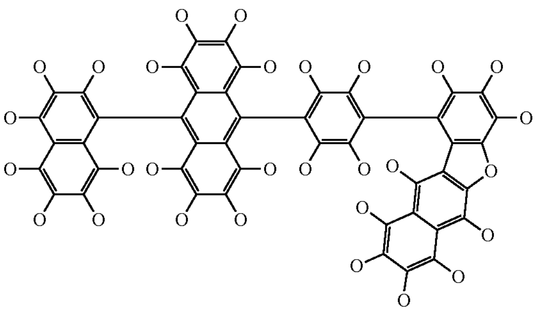
2-188
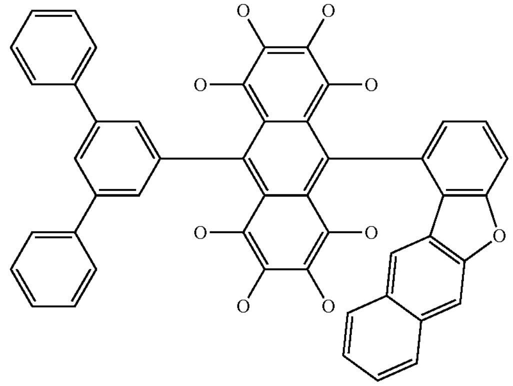
2-189
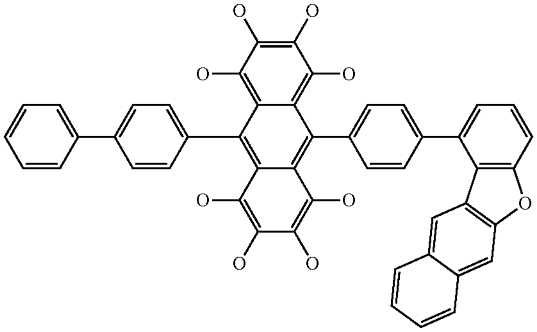
2-190
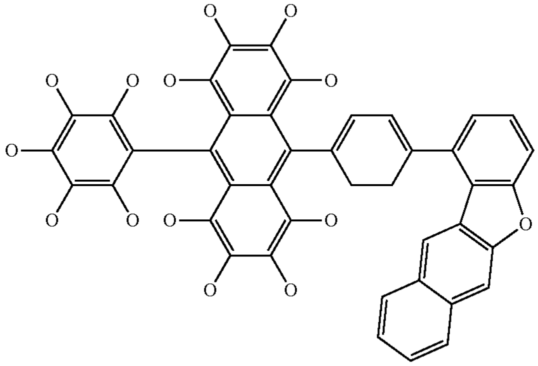

-continued
2-191
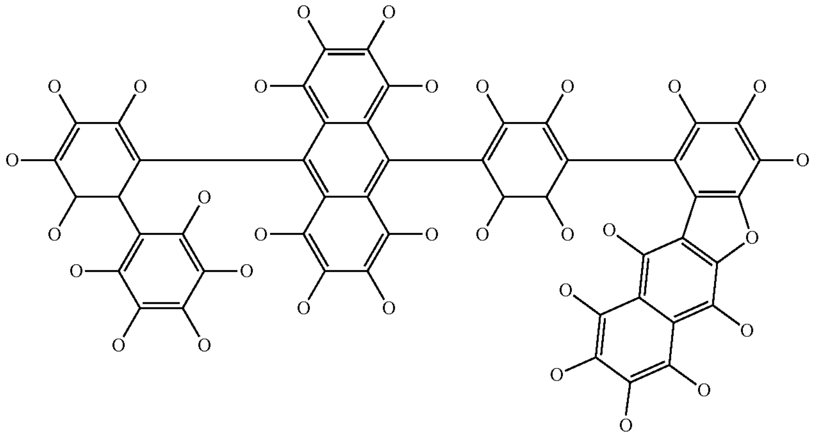
2-192
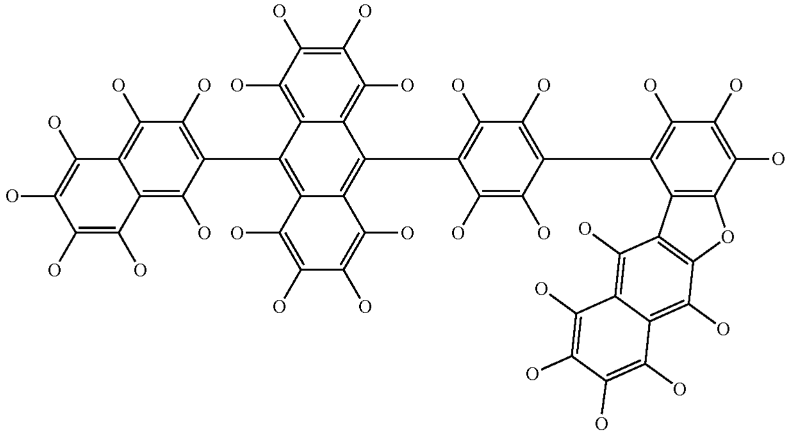
2-193
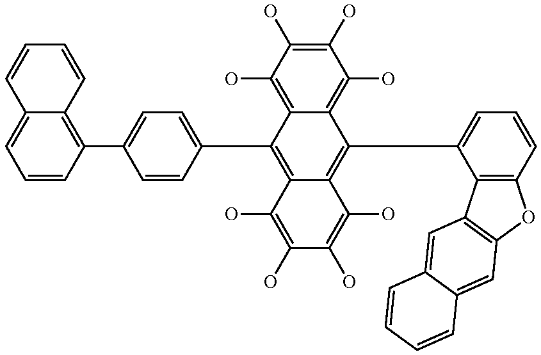
2-194
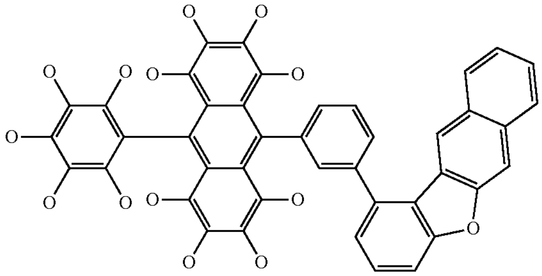

-continued
2-195
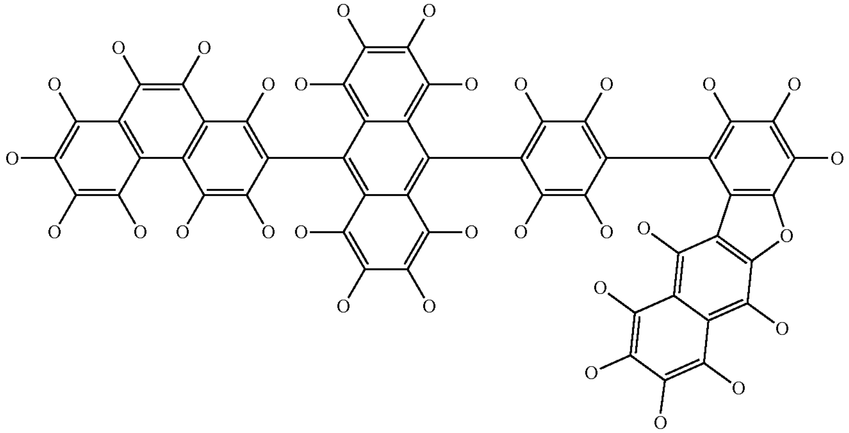
2-196
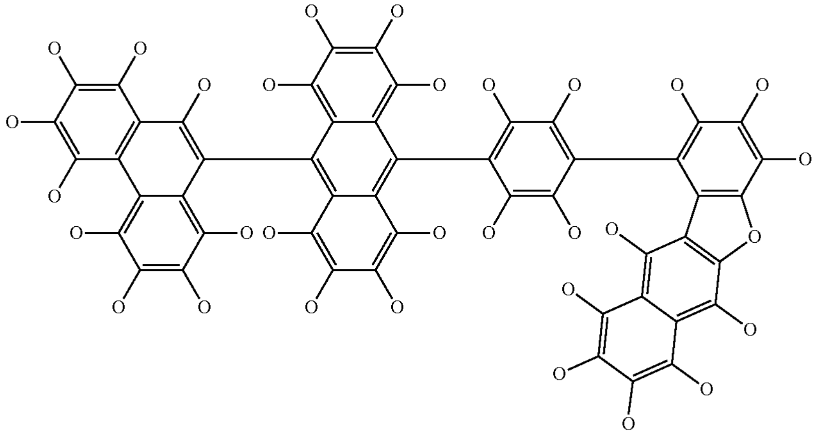
2-197
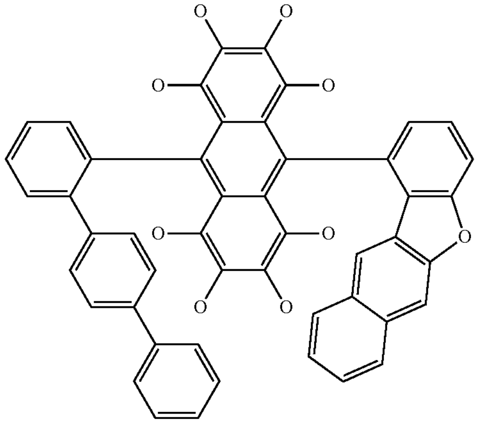
2-198
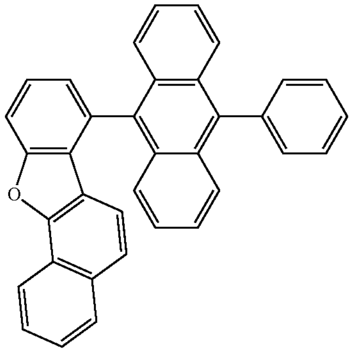
2-199
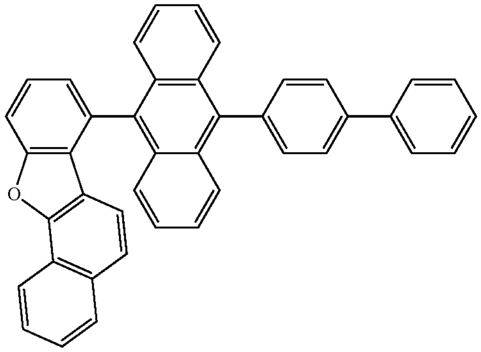
2-200
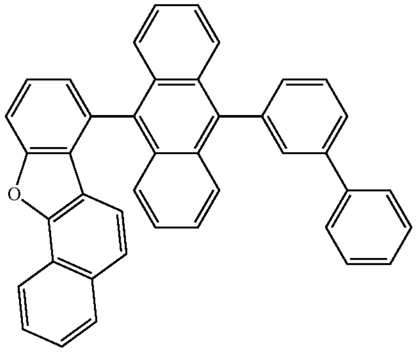

-continued
2-201
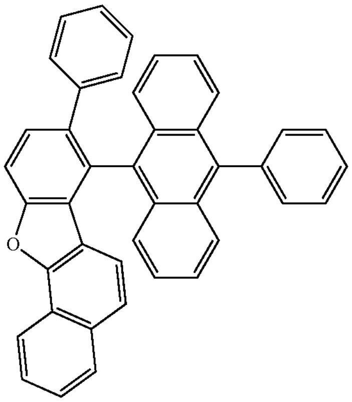
2-202
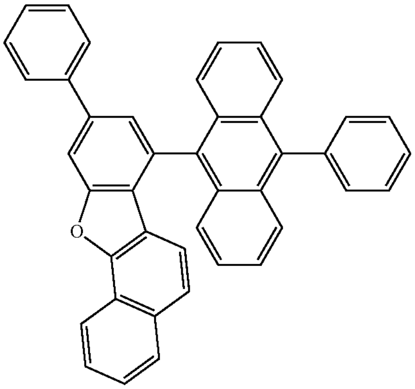
2-203
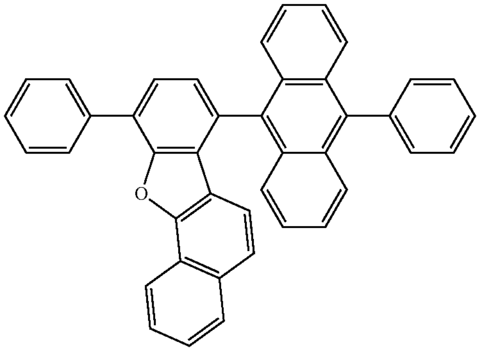
2-204
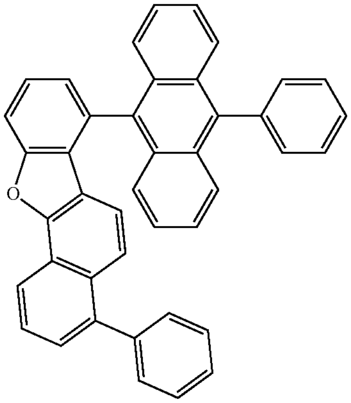
2-205
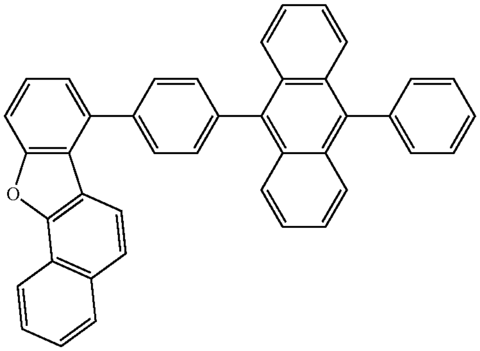
2-206
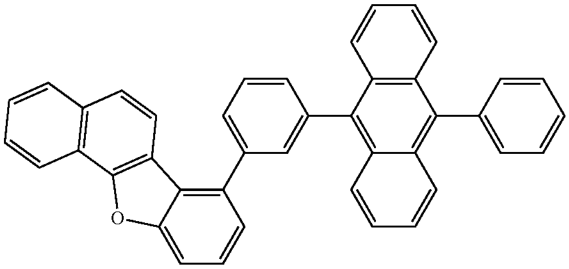
2-207
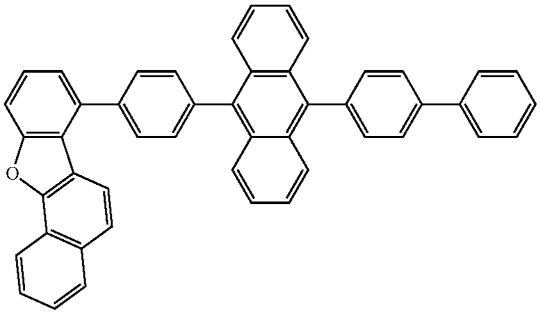
2-208
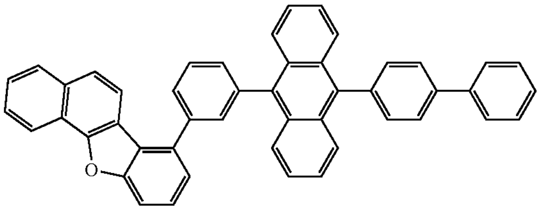

-continued
2-209
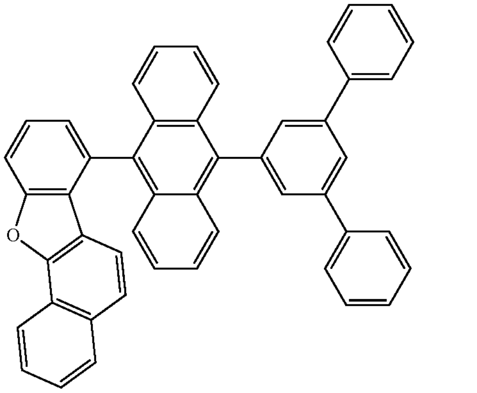
2-210
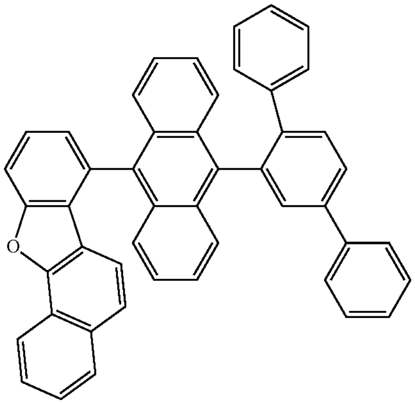
2-211
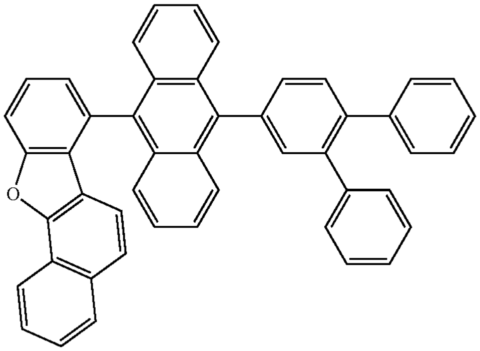
2-212
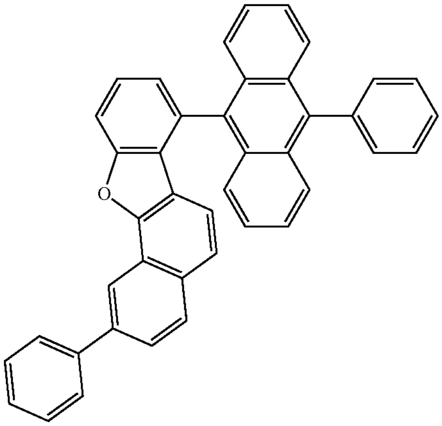
2-213
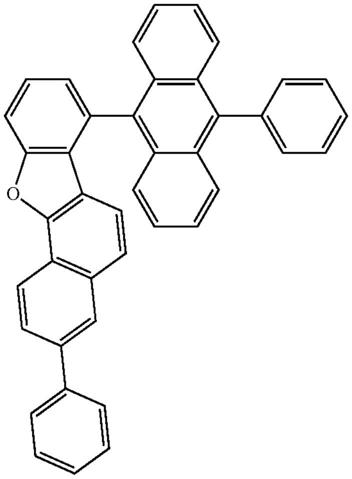
2-214
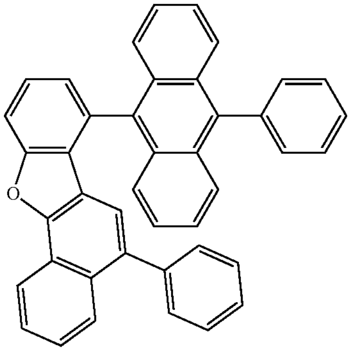

-continued
2-215
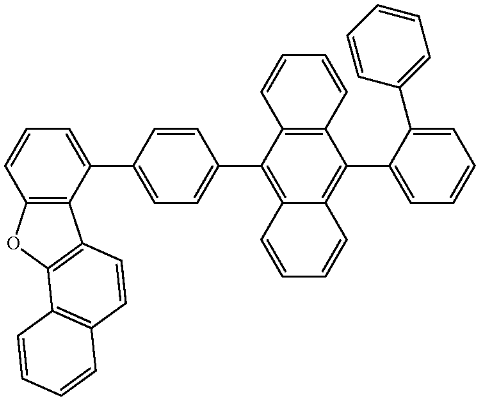
2-216
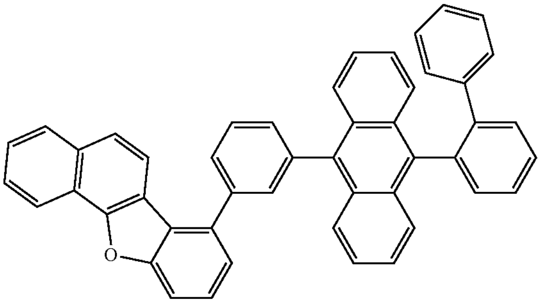
2-217
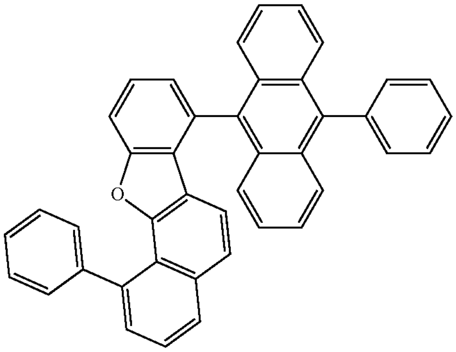
2-218
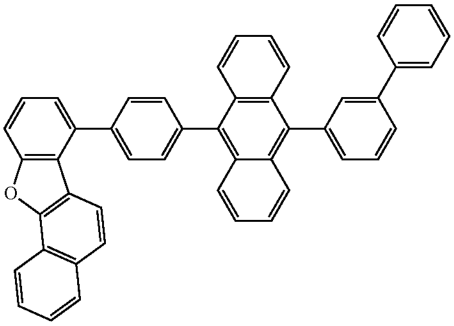
2-219
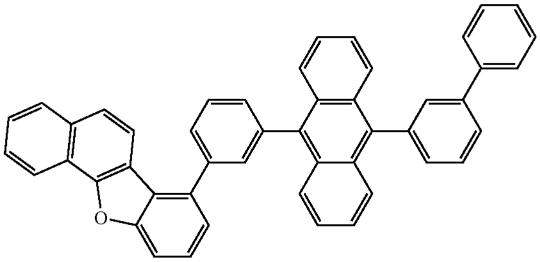
2-220
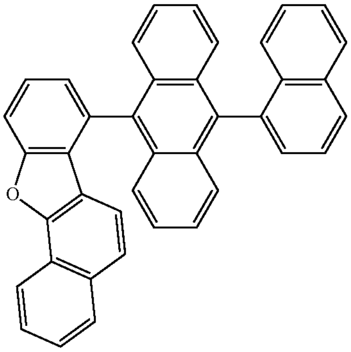
2-221
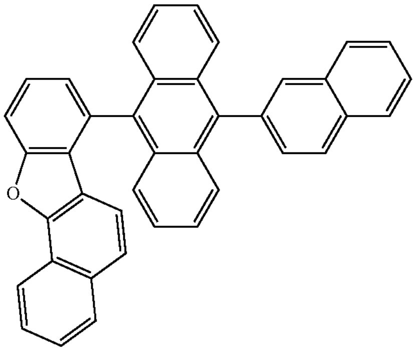
2-222
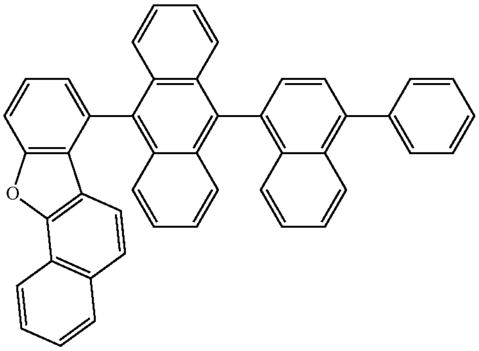

-continued
2-223
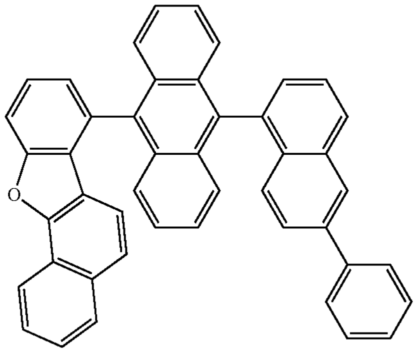
2-224
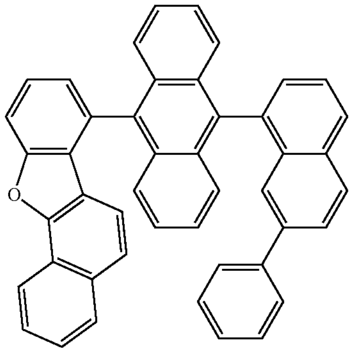
2-225
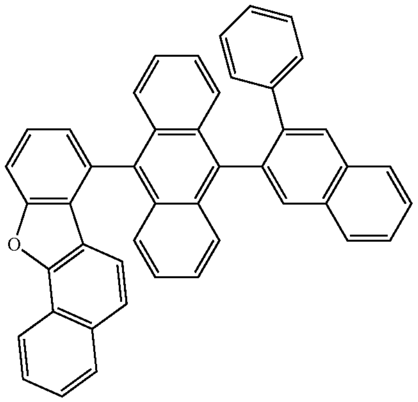
2-226
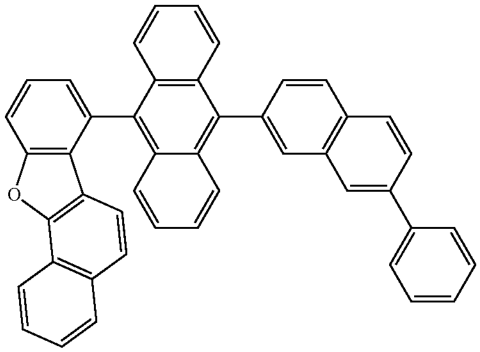
2-227
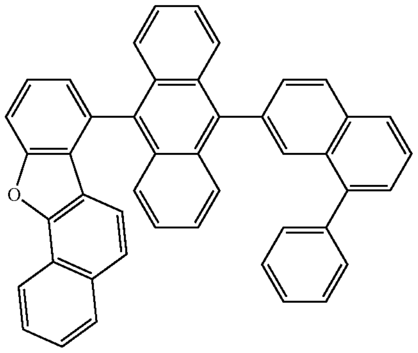
2-228
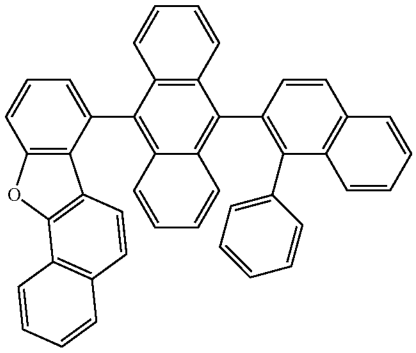
2-229
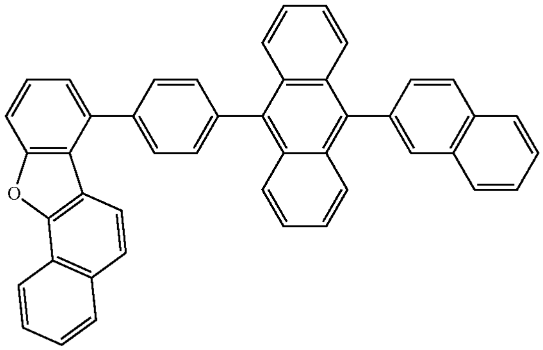
2-230
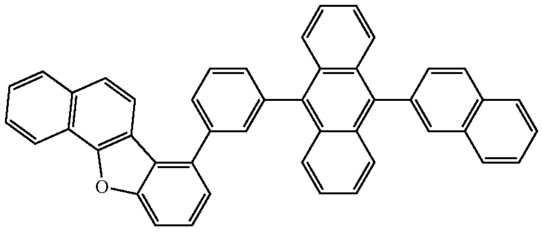

-continued
2-231
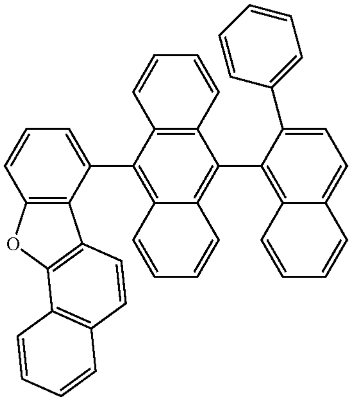
2-232
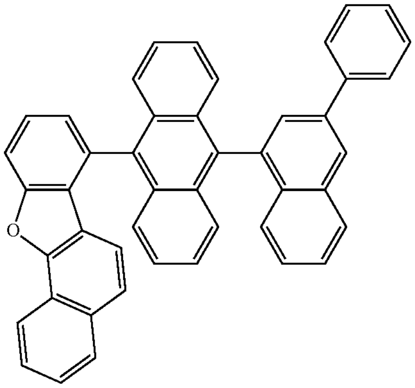
2-233
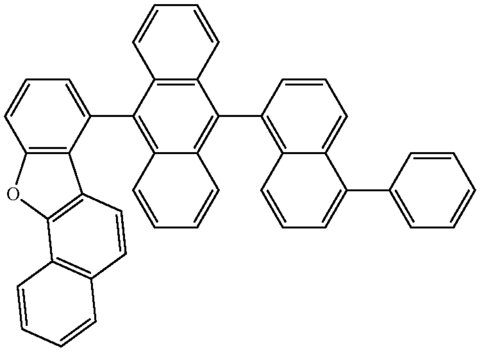
2-234
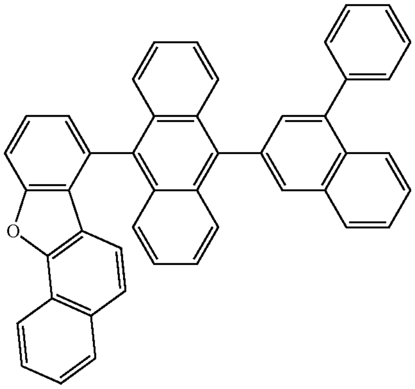
2-235
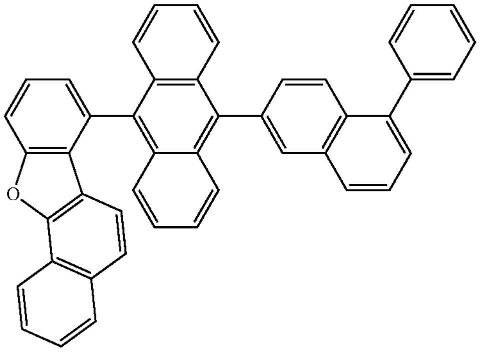
2-236
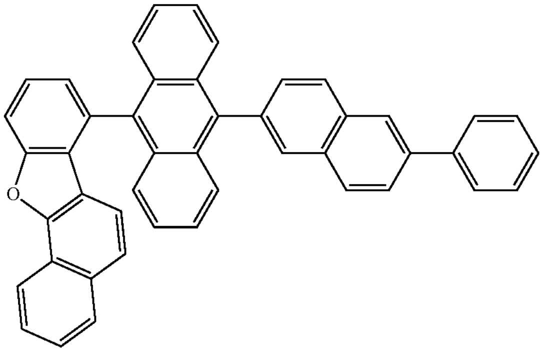
2-237
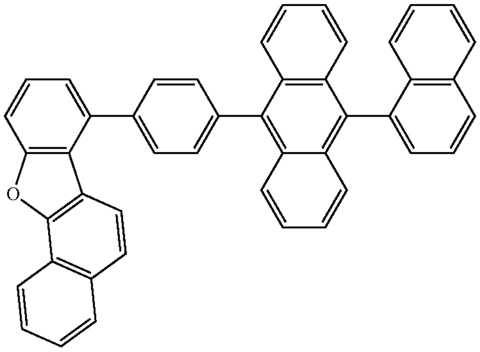
2-238
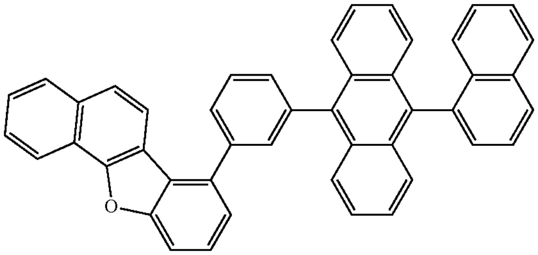

-continued
2-239
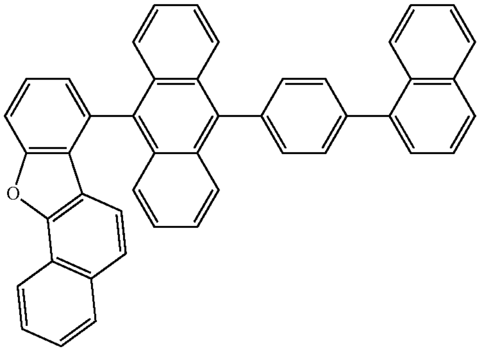
2-240
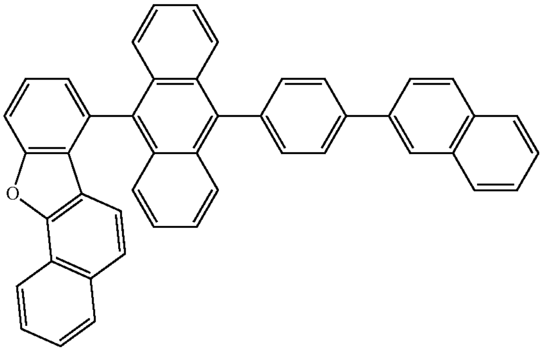
2-241
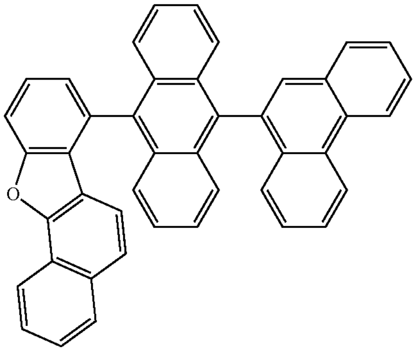
2-242
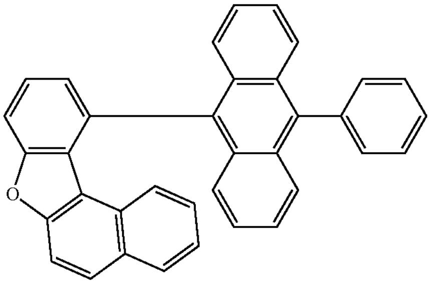
2-243
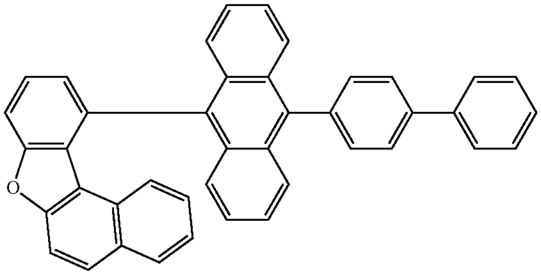
2-244
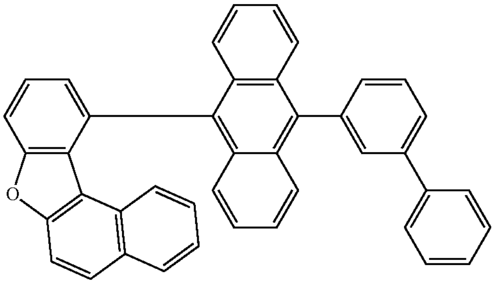
2-245
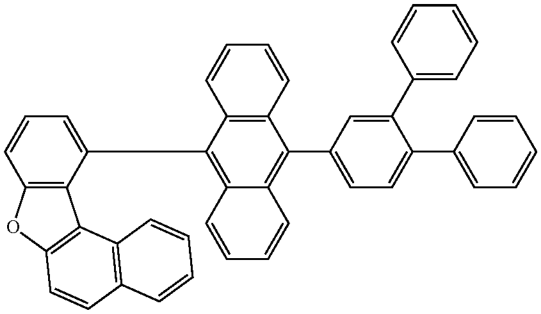
2-246
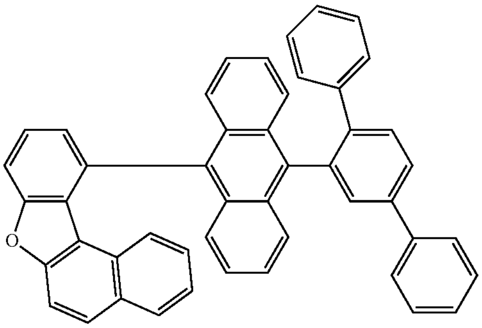

-continued
2-247
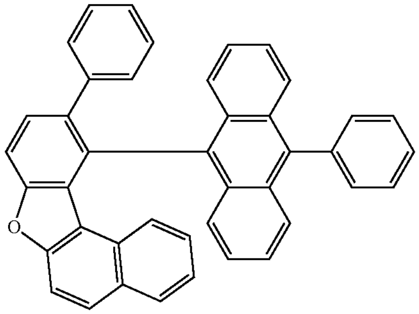
2-248
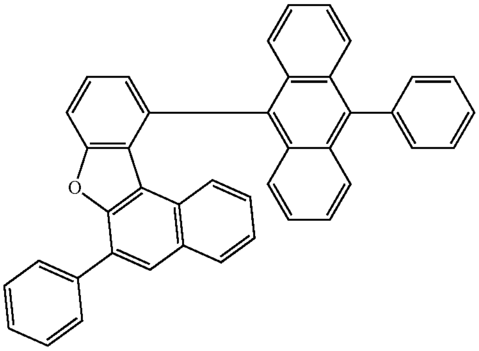
2-249
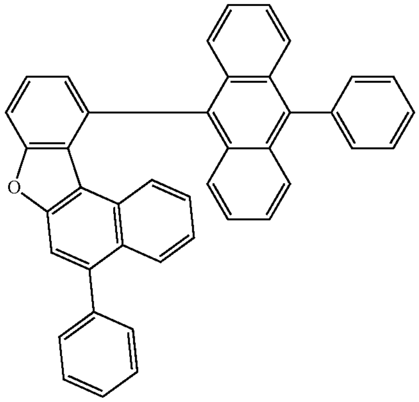
2-250
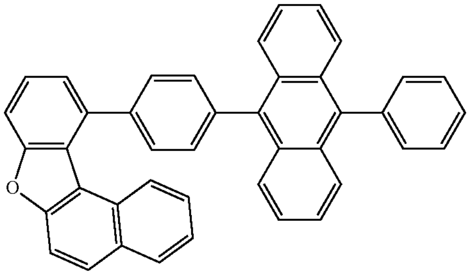
2-251
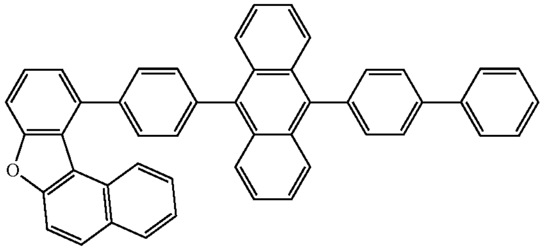
2-252
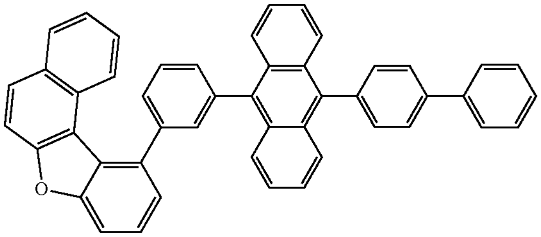
2-253
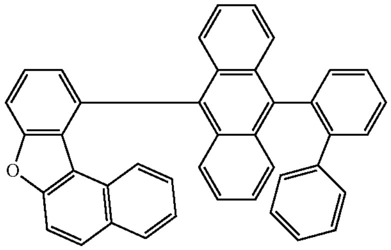
2-254
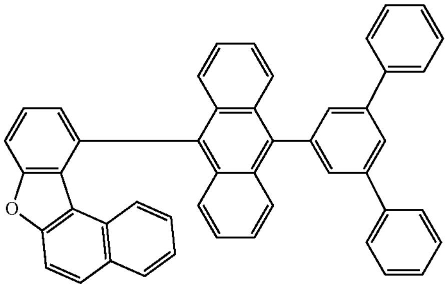

-continued
2-255
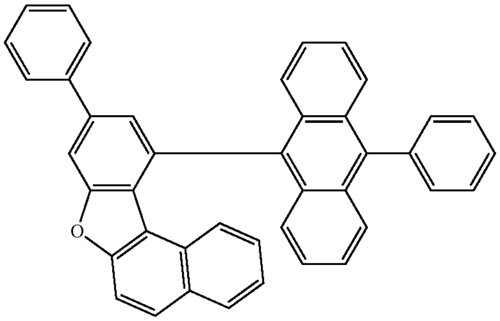
2-256
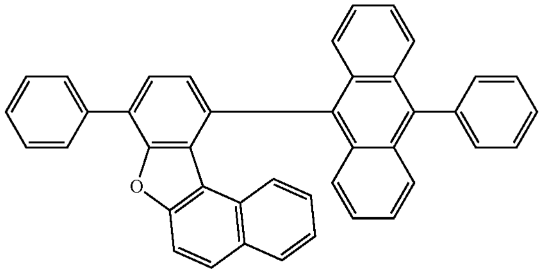
2-257
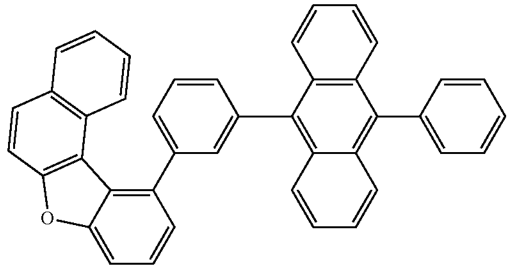
2-258
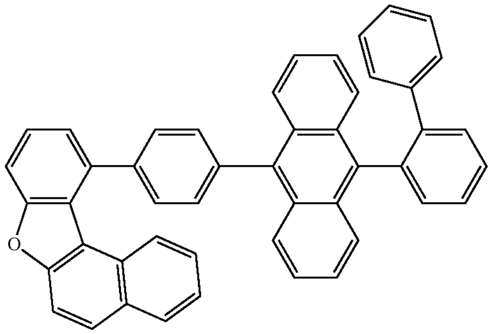
2-259
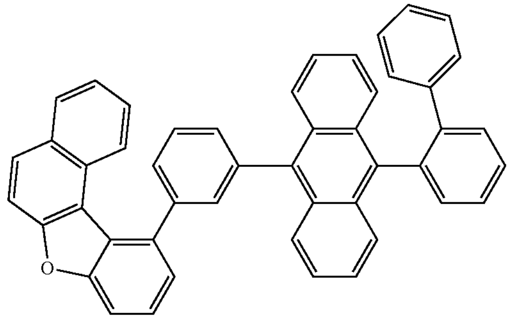
2-260
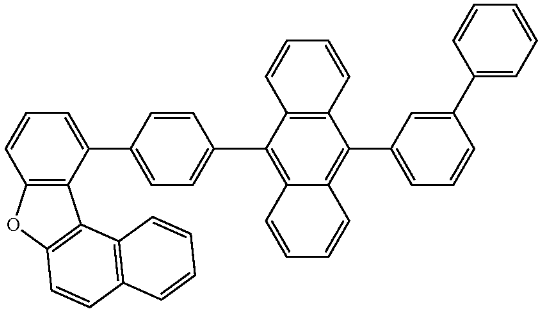
2-261
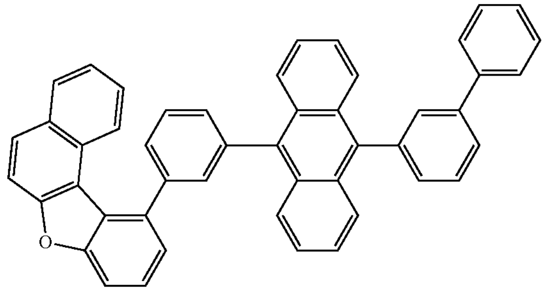
2-262
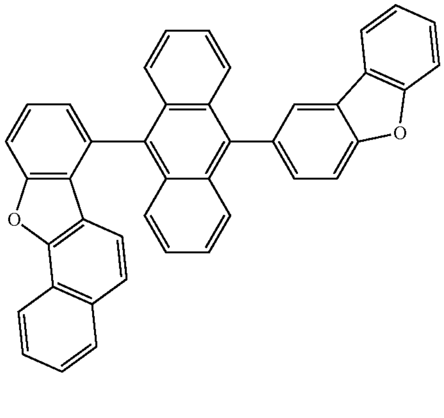

-continued
2-263
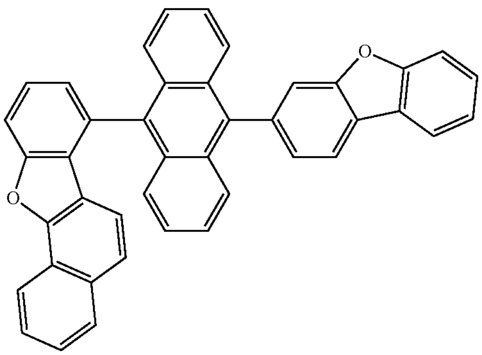
2-264
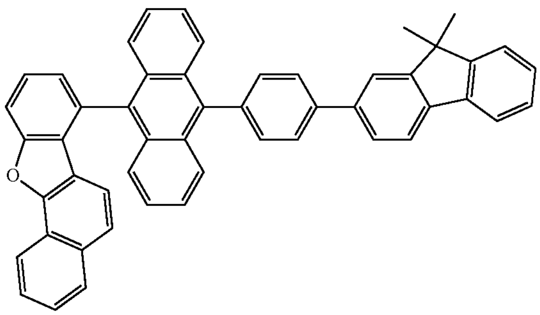
2-265
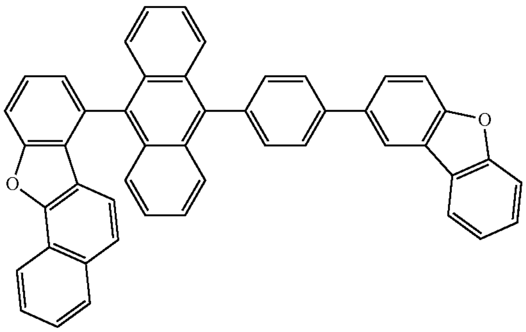
2-266
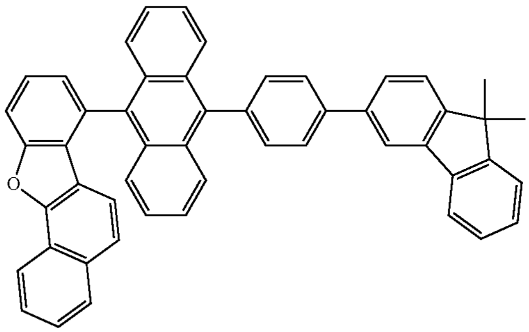
2-267
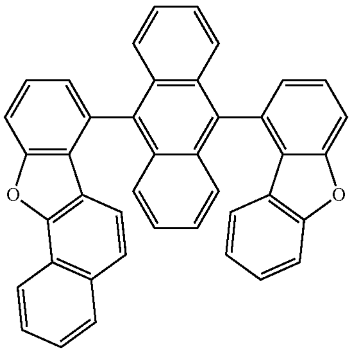
2-268
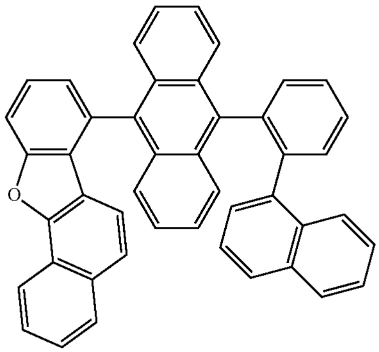
2-269
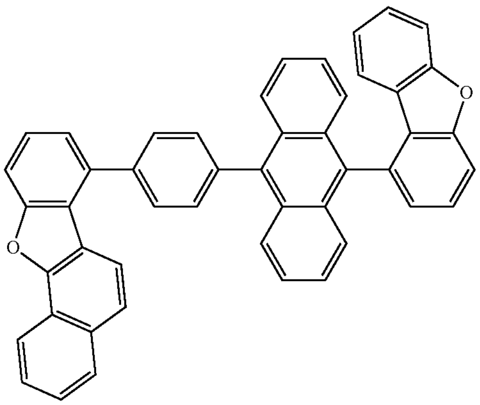
2-270
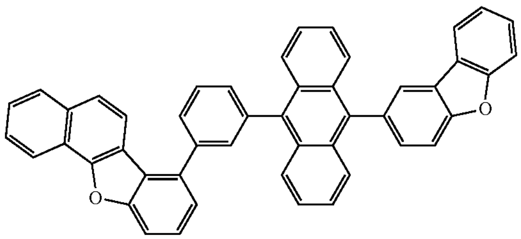

-continued
2-271
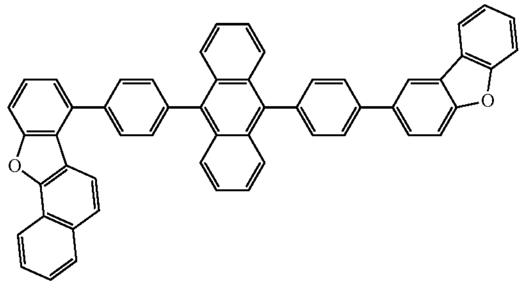
2-272
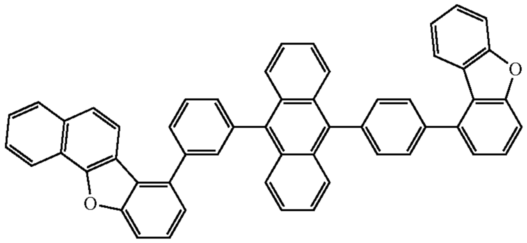
2-273
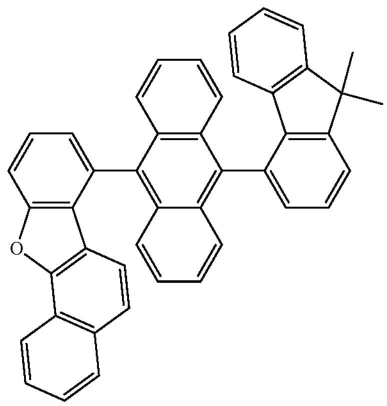
2-274
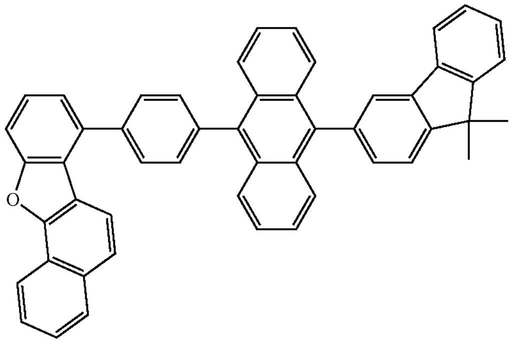
2-275
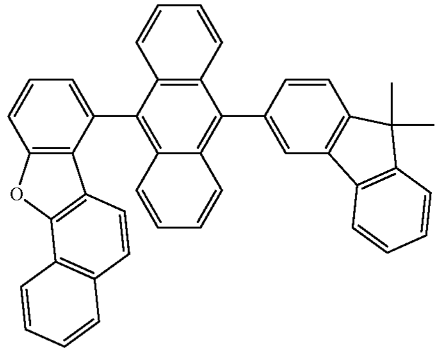
2-276
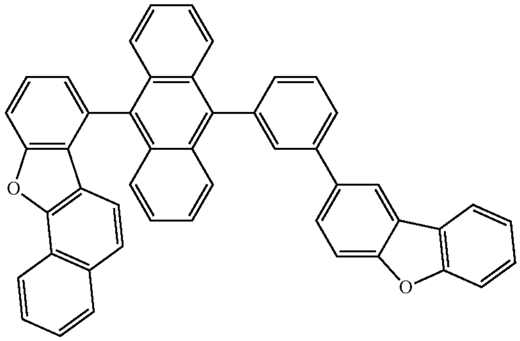
2-277
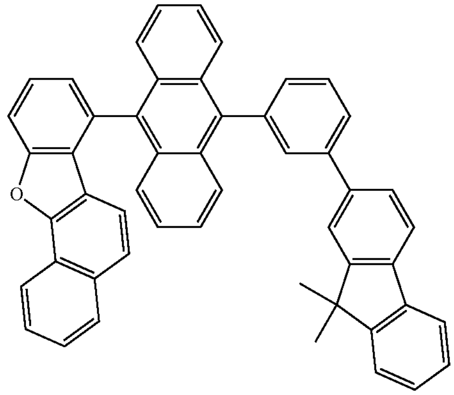
2-278
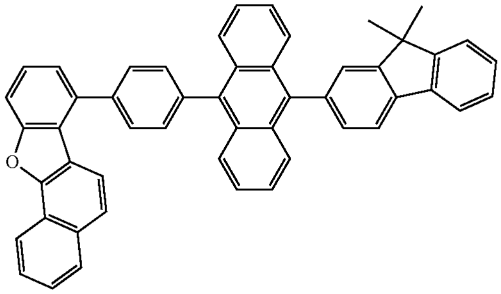

-continued
2-279
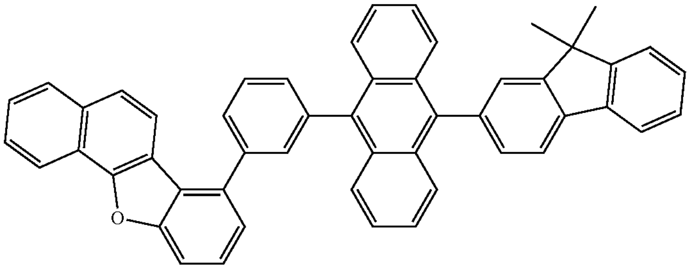
2-280
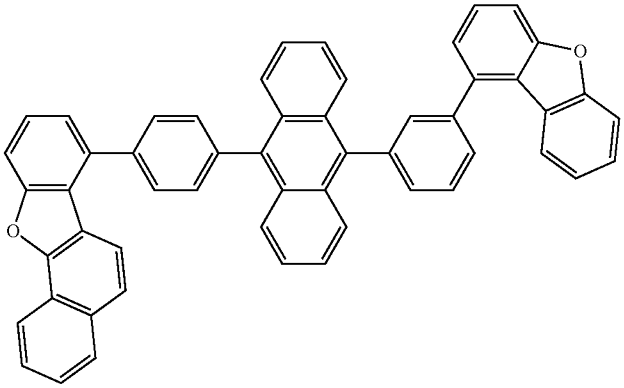
2-281
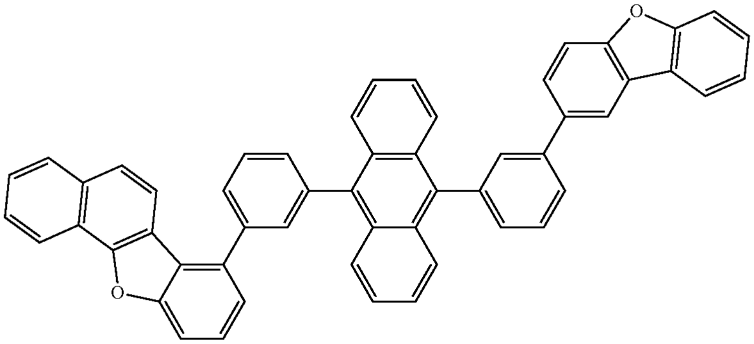
2-282
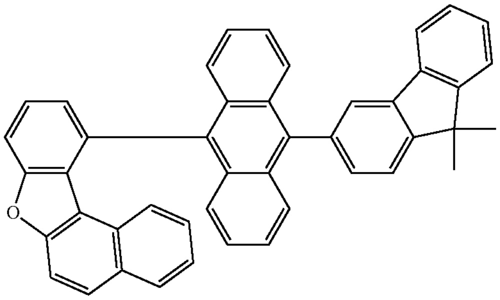
2-283
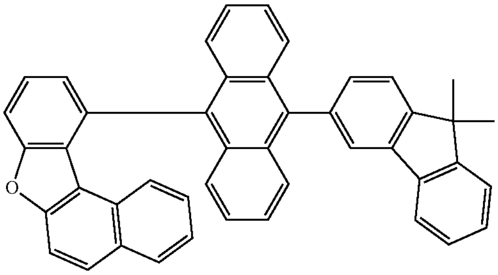

-continued
2-284
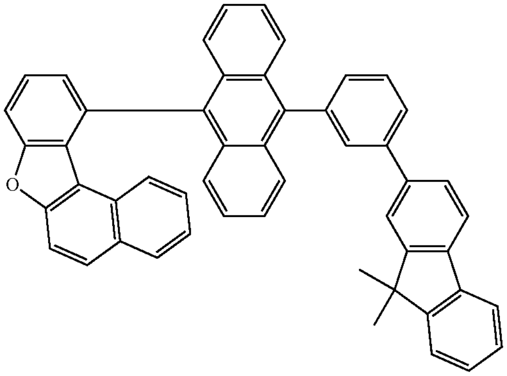
2-285
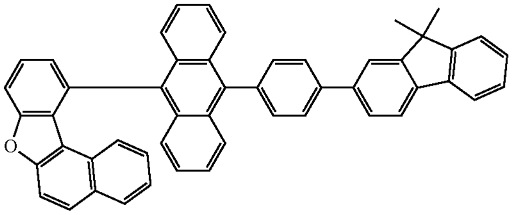
2-286
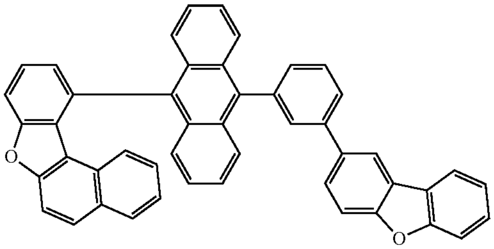
2-287
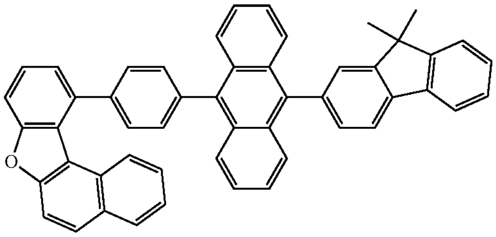
2-288
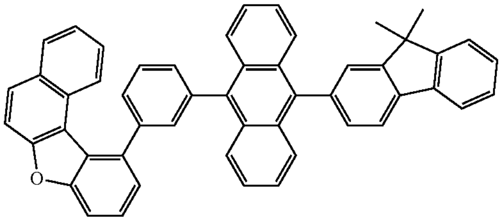
2-265
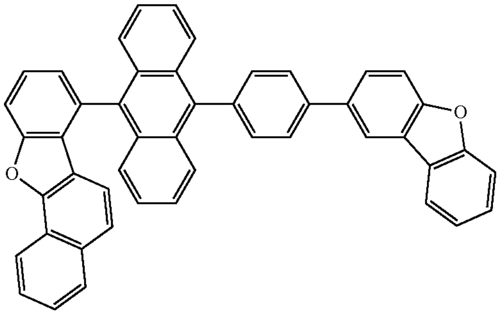
2-266
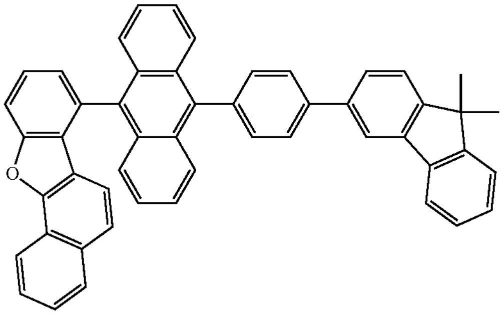
2-267
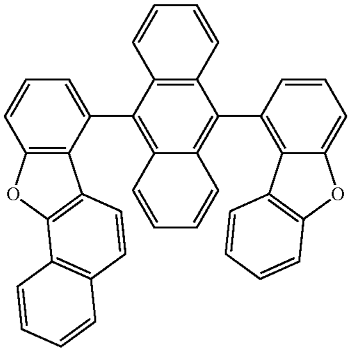

-continued
2-268
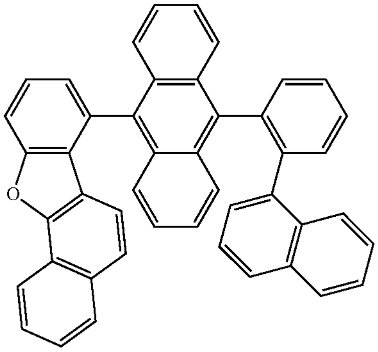
2-269
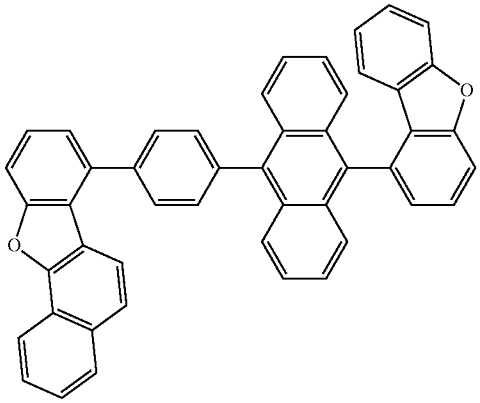
2-270
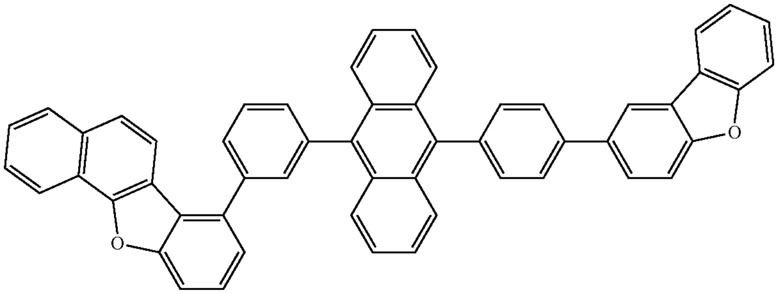
2-271
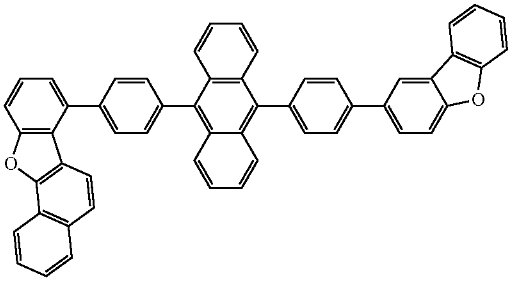
2-272
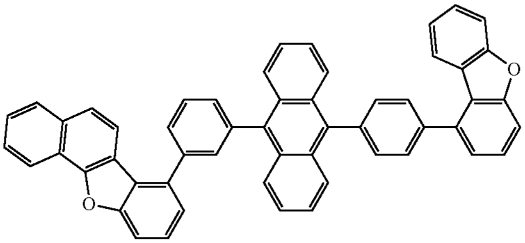
2-273
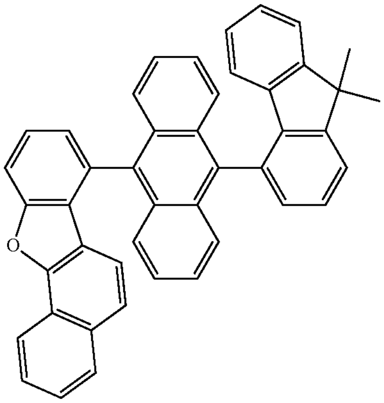
2-274
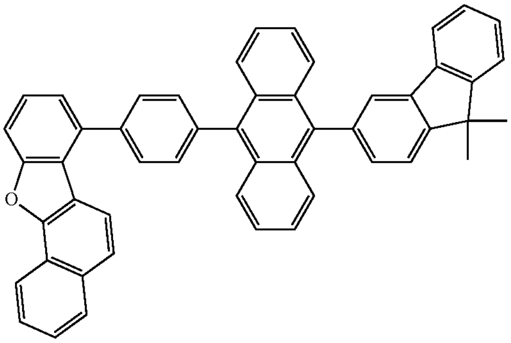

-continued
2-275
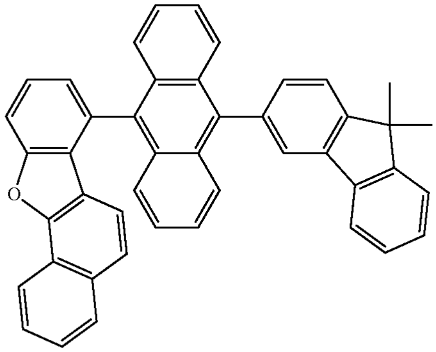
2-276
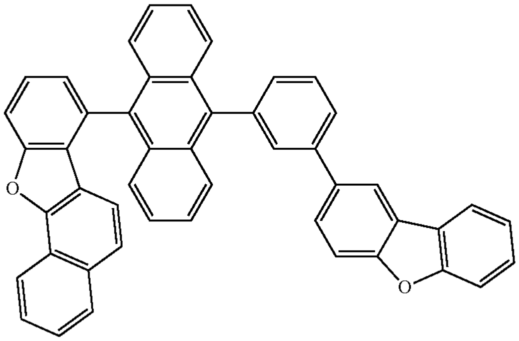
2-277
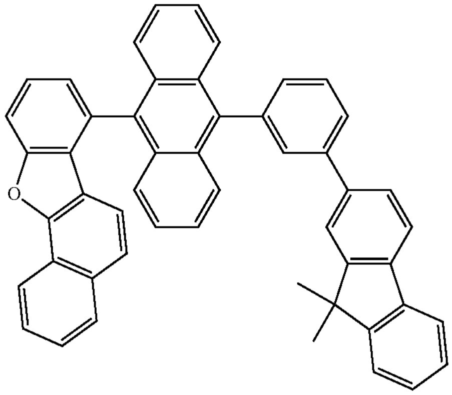
2-278
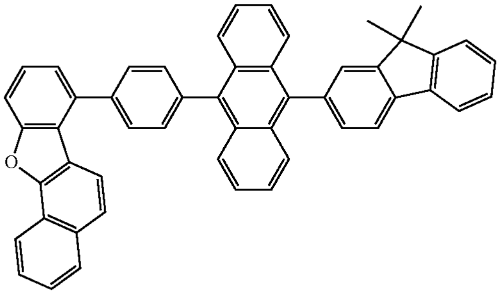
2-279
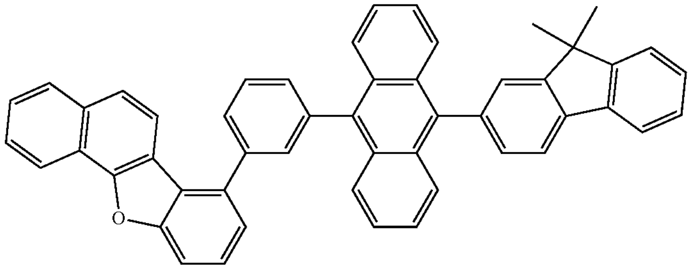
2-280
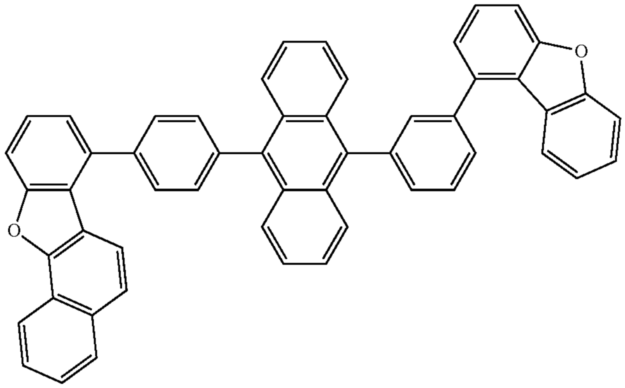

-continued
2-281
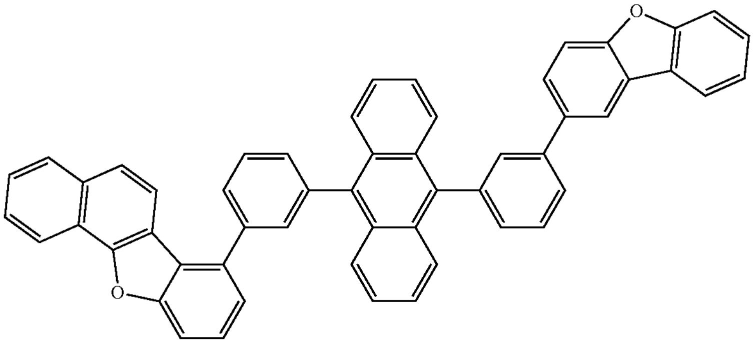
2-282
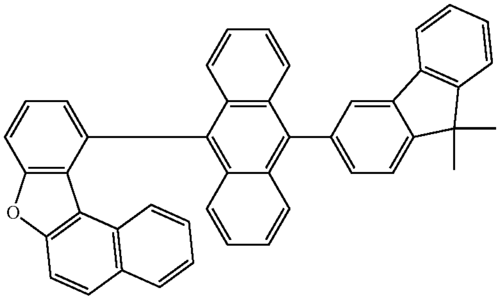
2-283
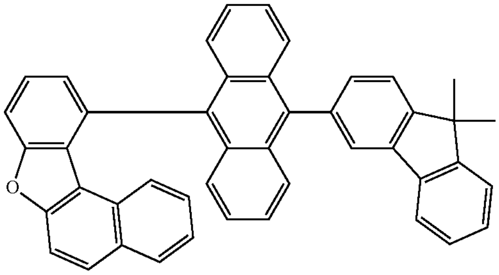
2-284
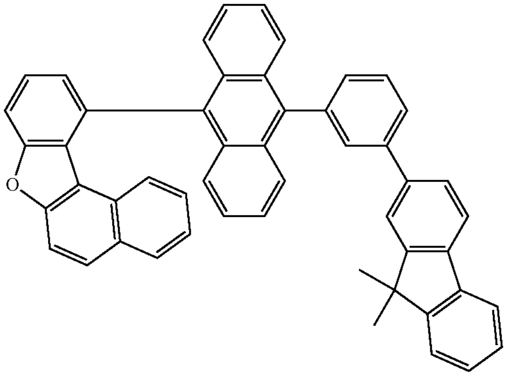
2-285
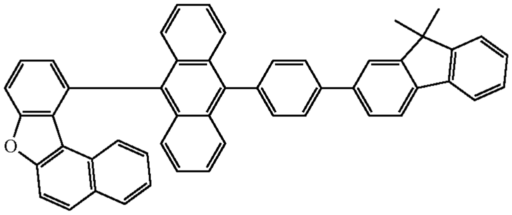
2-286
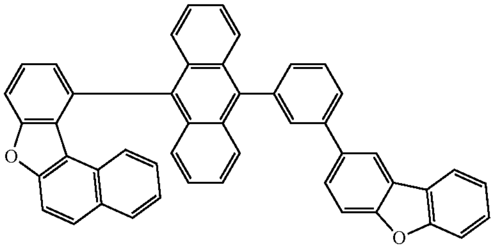
2-287
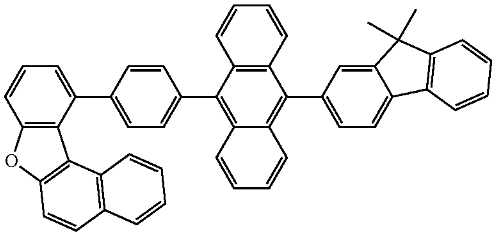
2-288
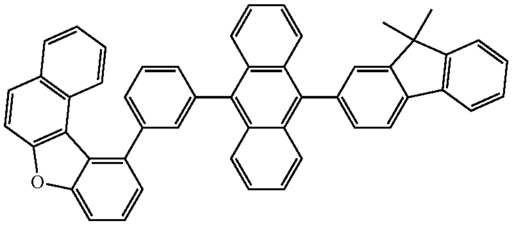
2-289
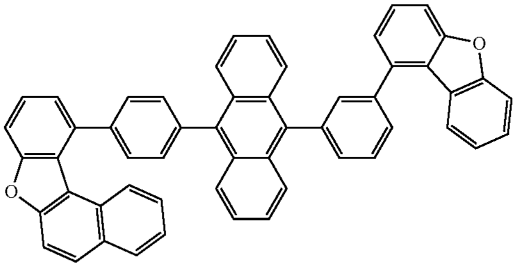

-continued
2-290
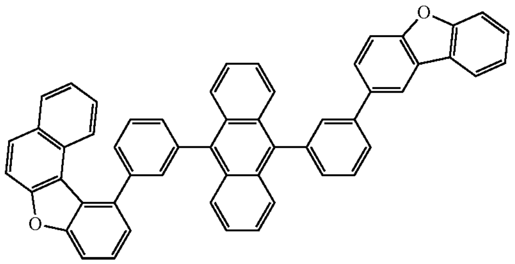
2-291
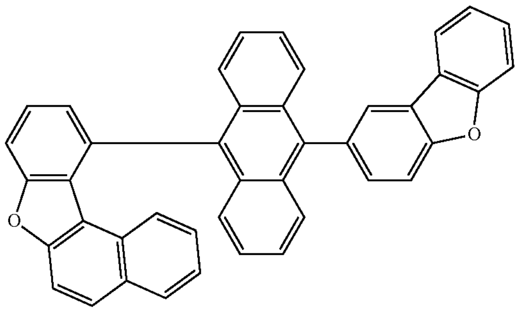
2-292
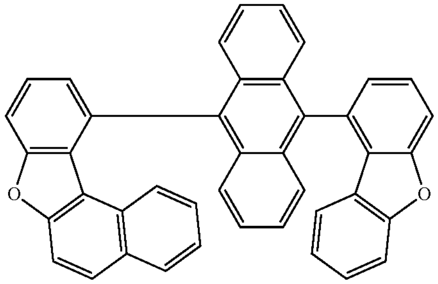
2-293
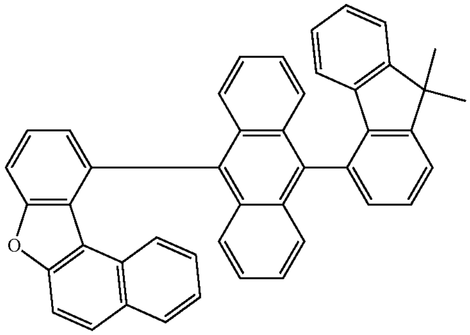
2-294
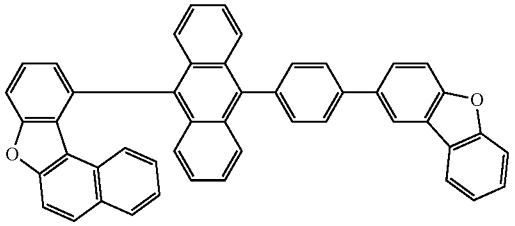
2-295
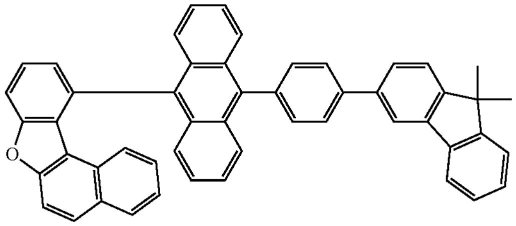
2-296
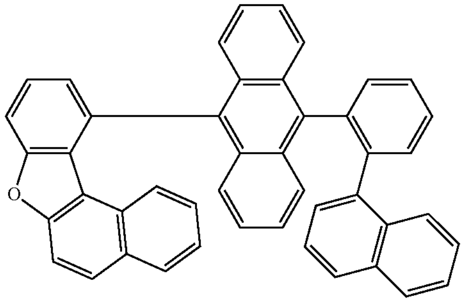
2-297
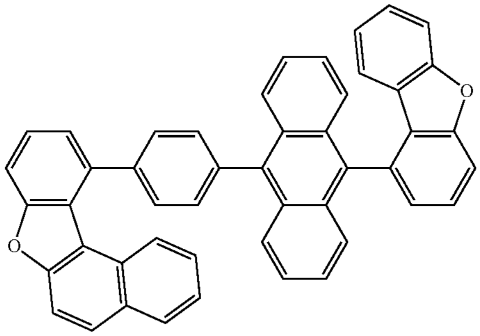
2-298
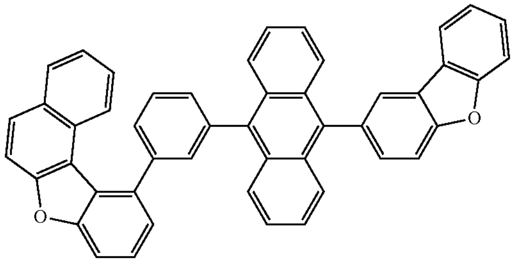
2-299
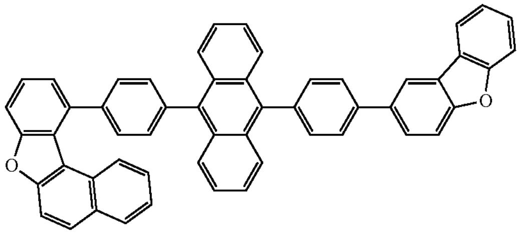

-continued
2-300
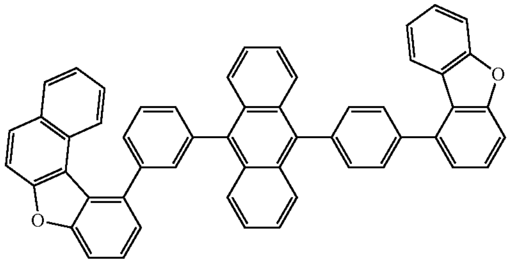
2-301
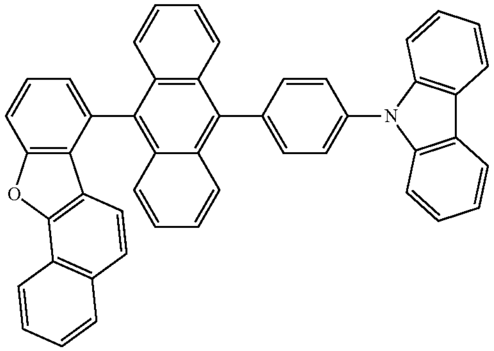
2-302
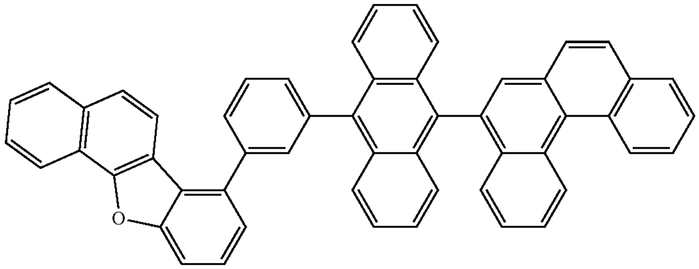
2-303
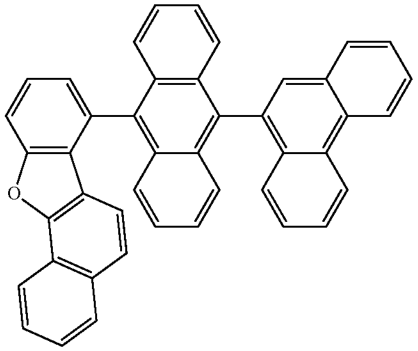
2-304
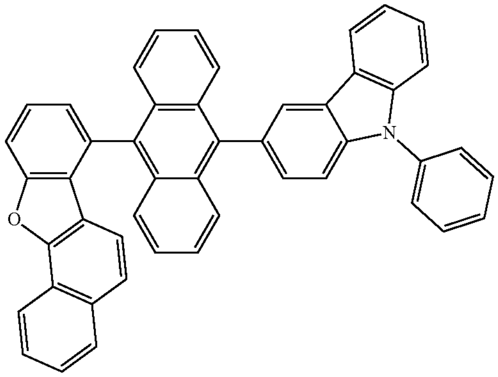
2-305
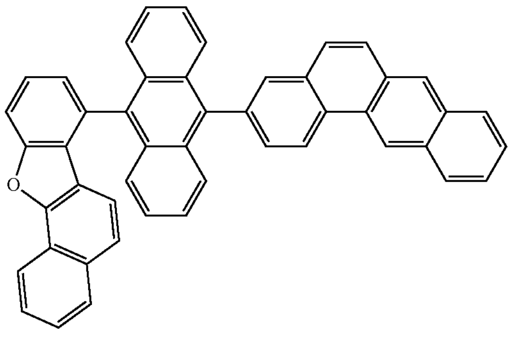
2-306
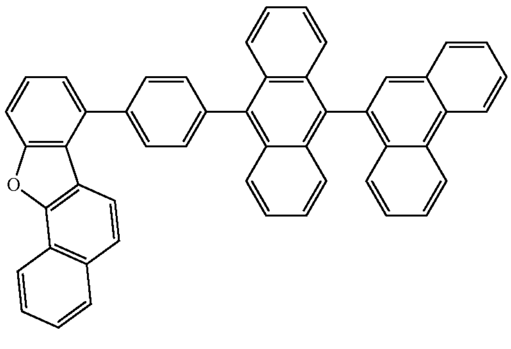

-continued
2-307
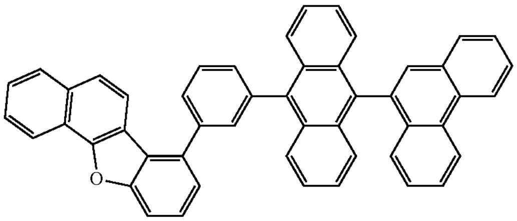
2-308
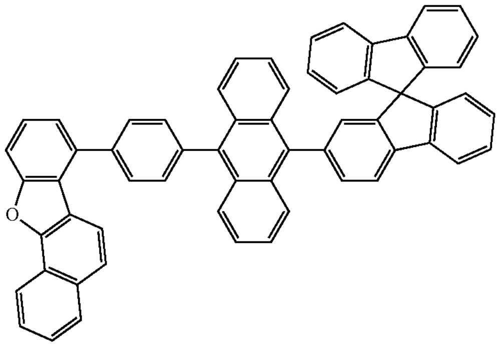
2-309
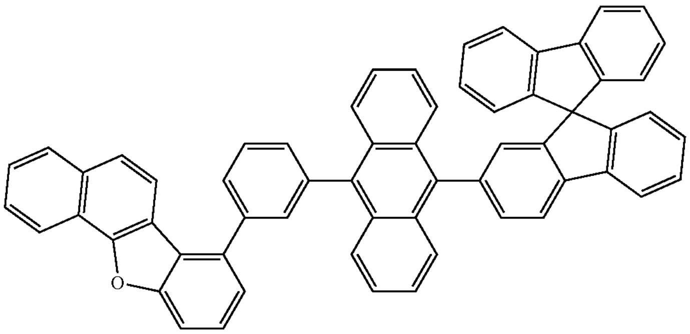
2-310
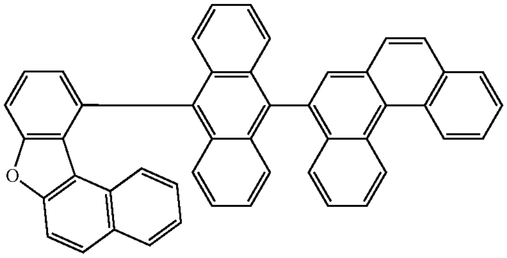
2-311
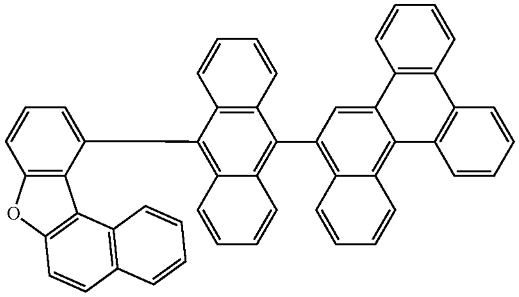
2-312
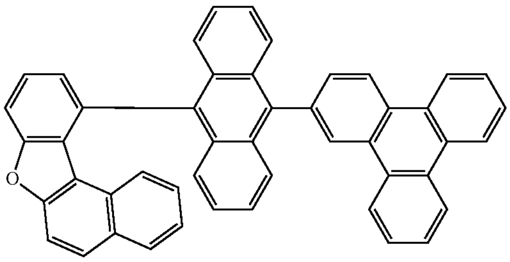
2-313
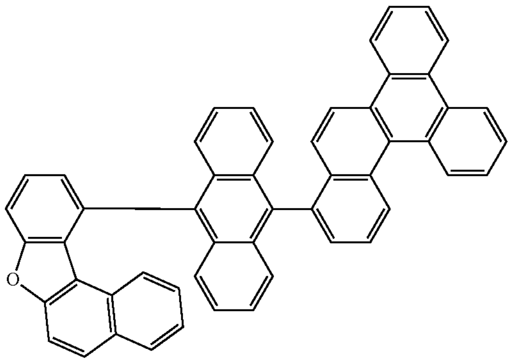

-continued
2-314
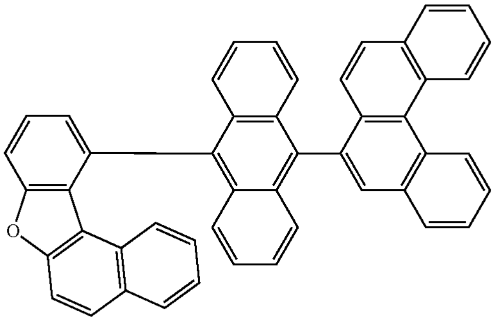
2-315
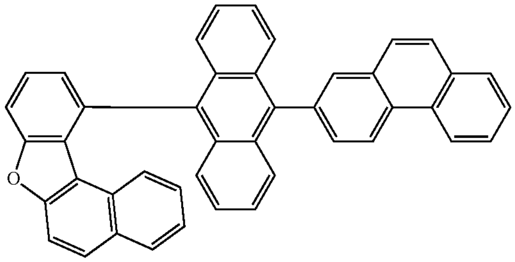
2-316
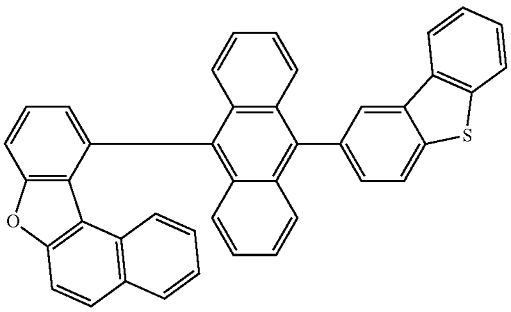
2-317
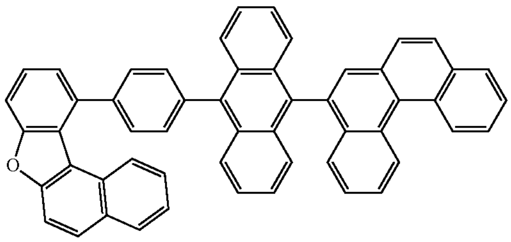
2-318
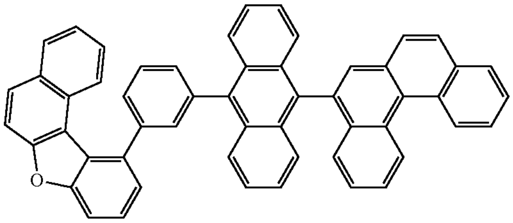
2-319
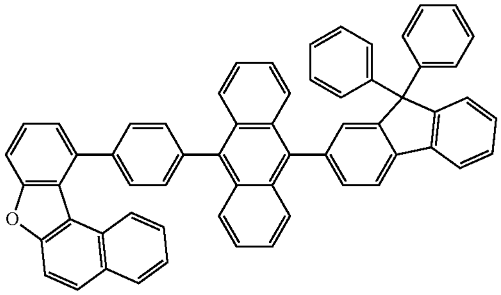
2-320
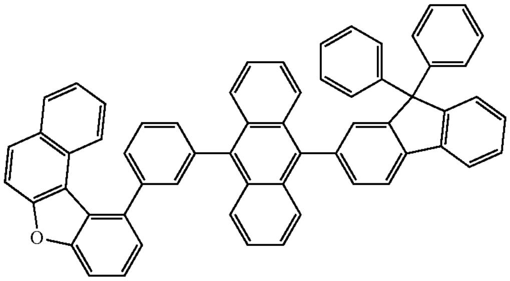
2-321
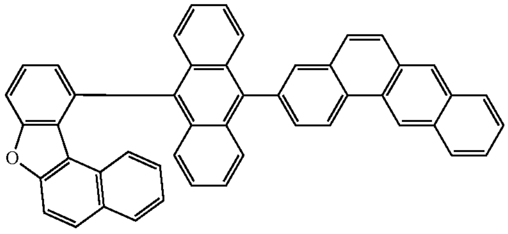
2-322
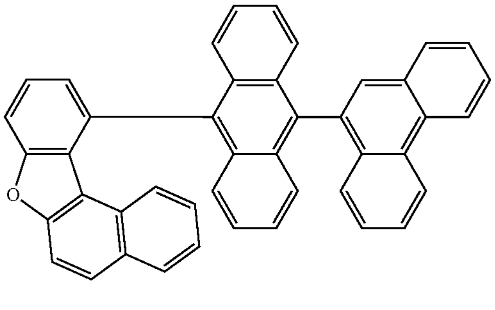
2-323
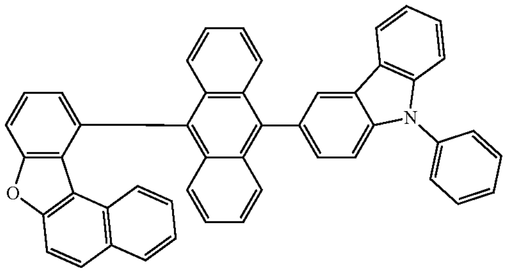

-continued
2-324
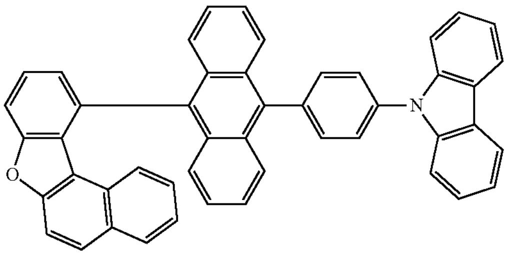
2-325
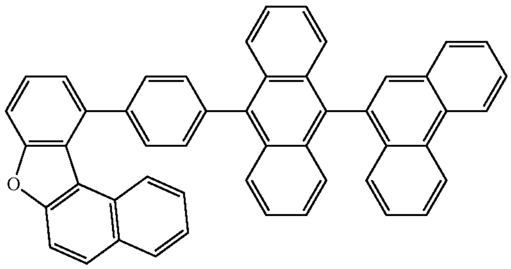
2-326
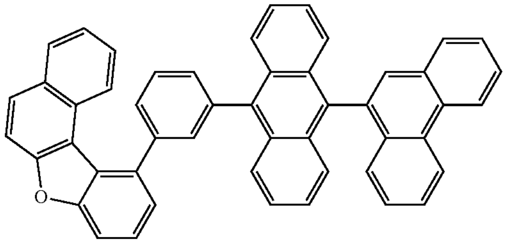
2-327
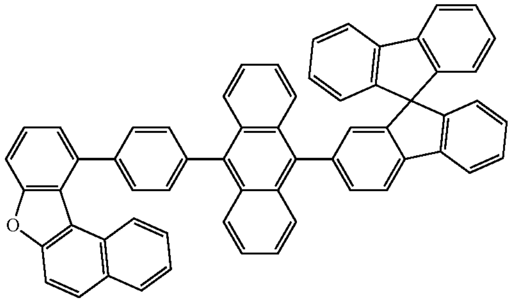
2-328
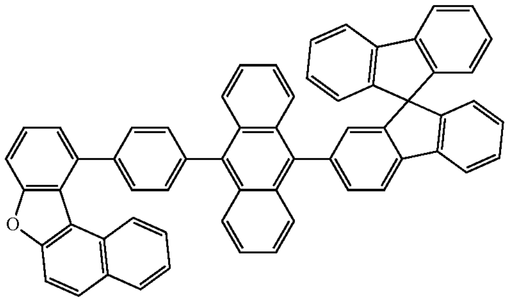
2-329
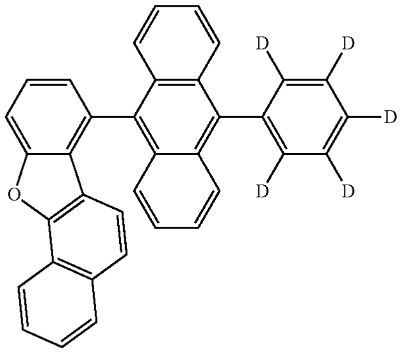
2-330
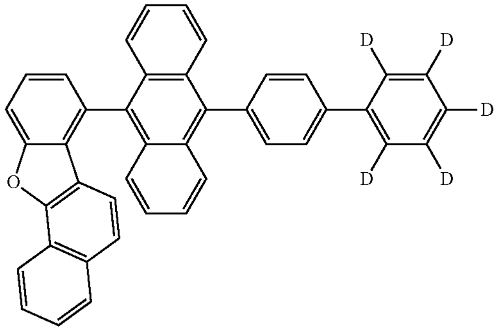
2-331
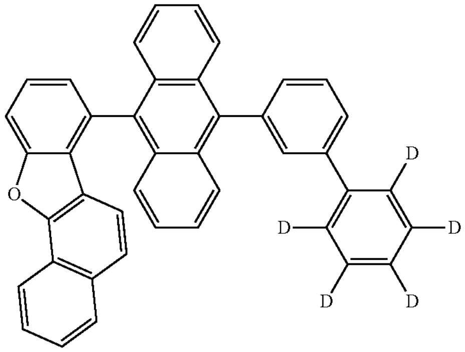

-continued
2-332
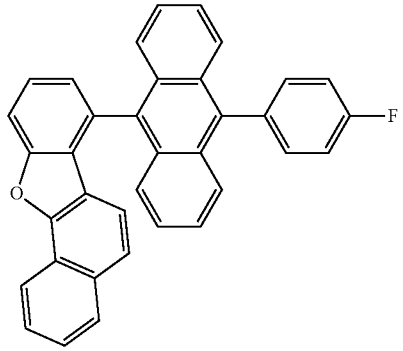
2-333
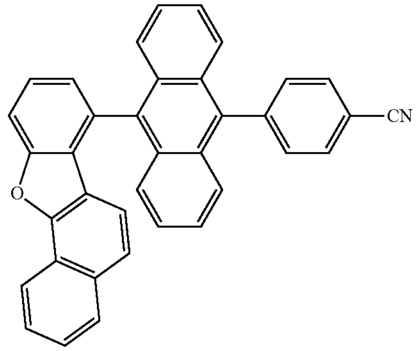
2-334
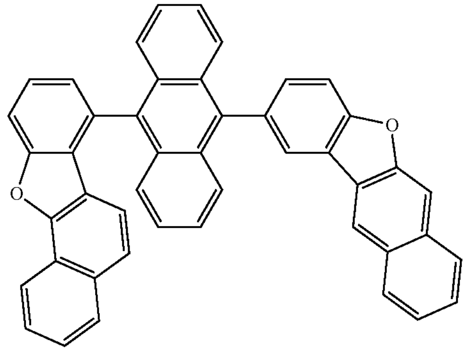
2-335
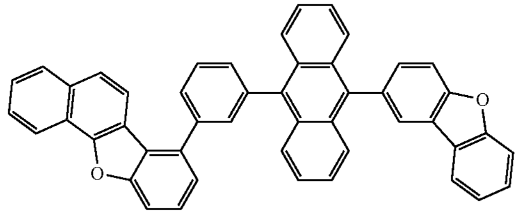
2-336
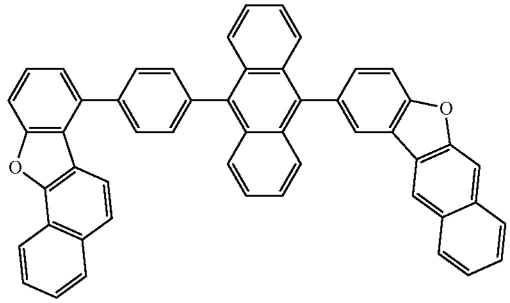
2-313
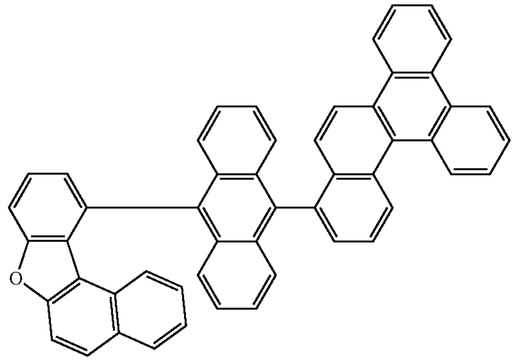
2-314
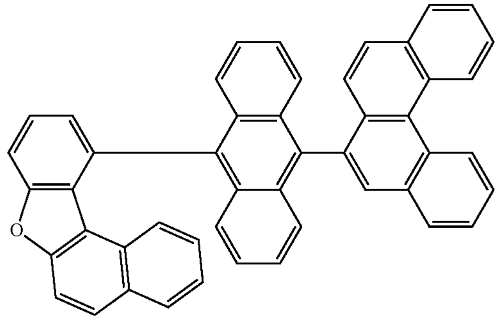
2-315
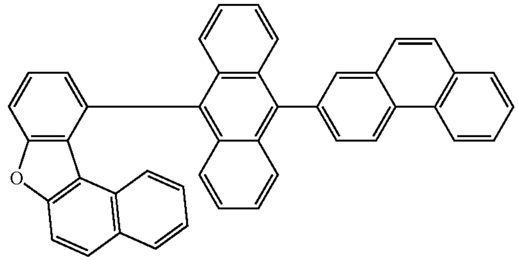

-continued
2-316
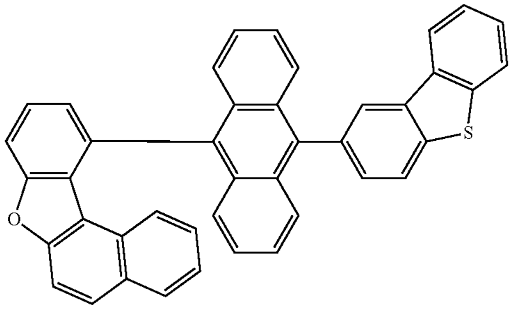
2-317
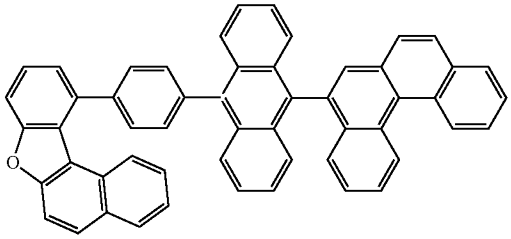
2-318
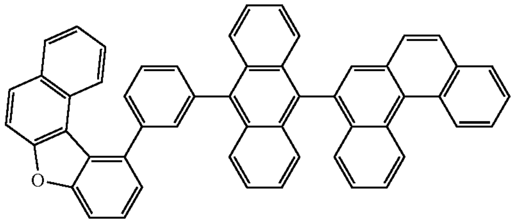
2-319
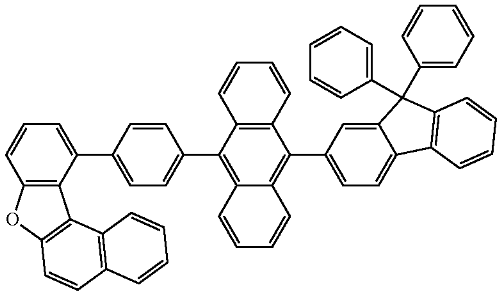
2-320
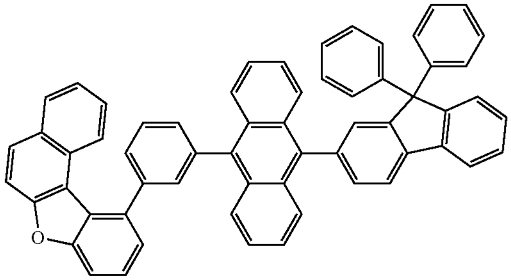
2-321
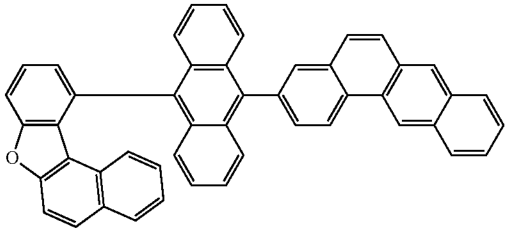
2-322
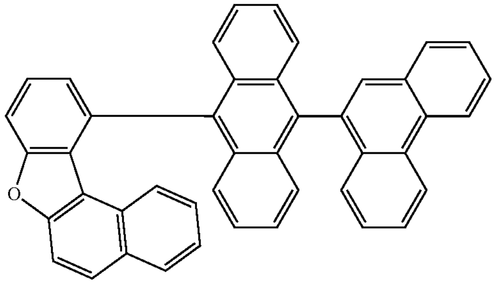
2-323
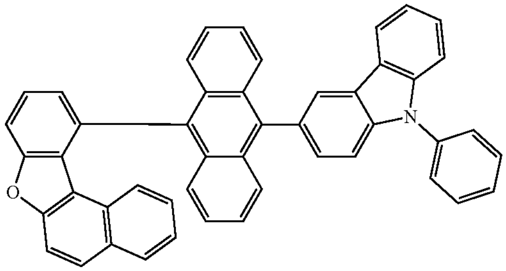
2-324
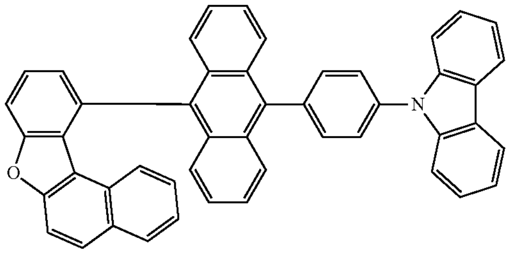
2-325
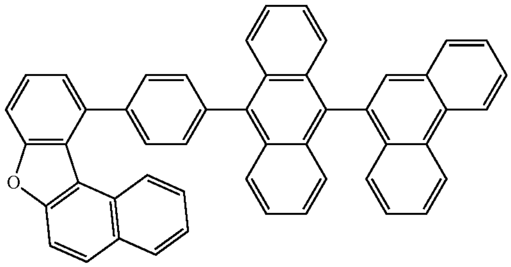

-continued
2-326
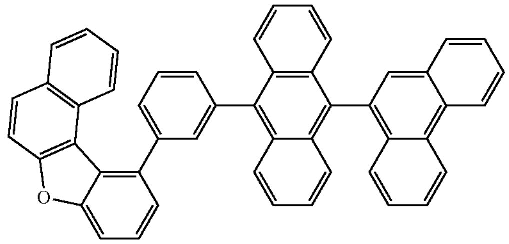
2-327
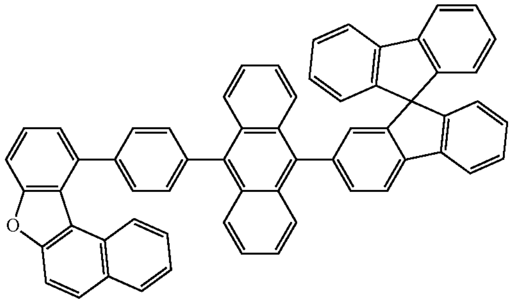
2-328
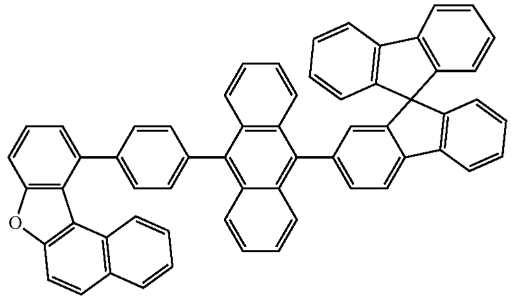
2-329
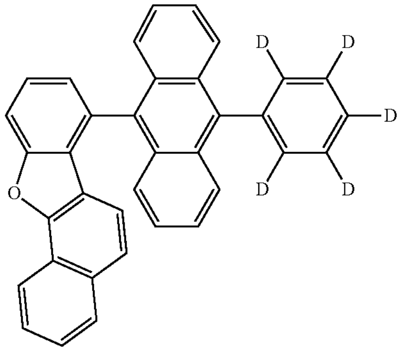
2-330
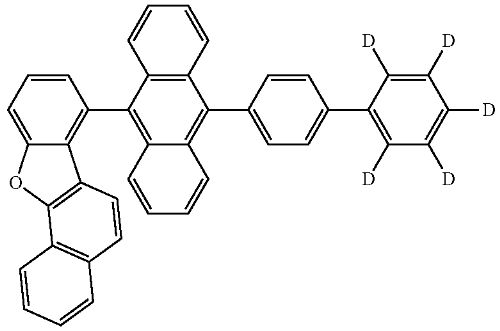
2-331
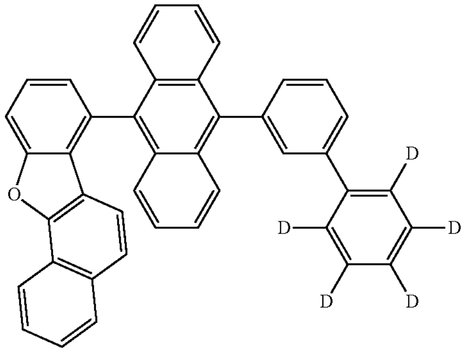
2-332
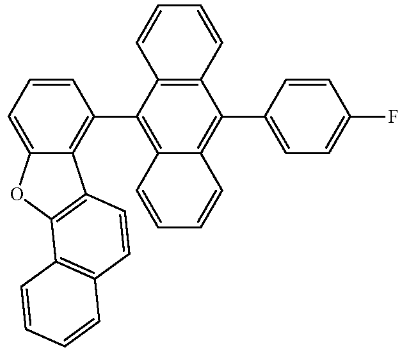
2-333
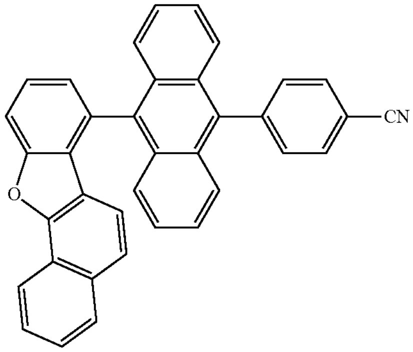

-continued
2-334
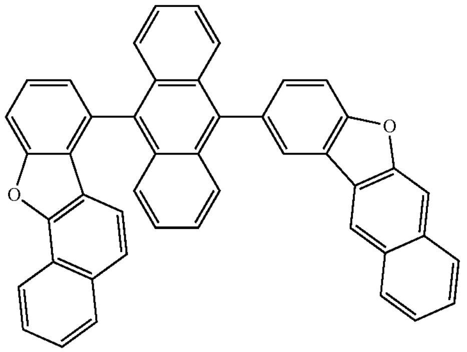
2-335
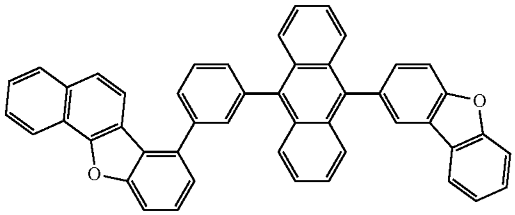
2-336
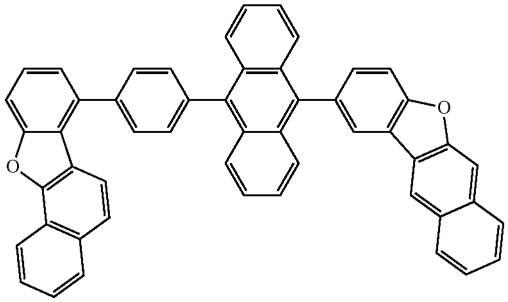
2-337
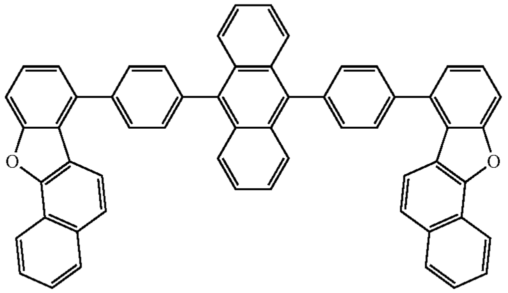
2-338
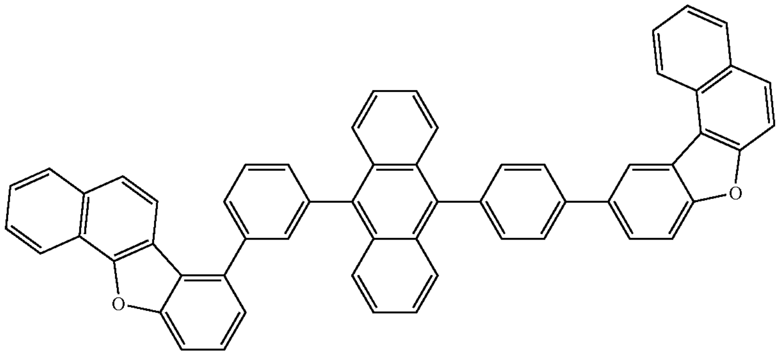
2-339
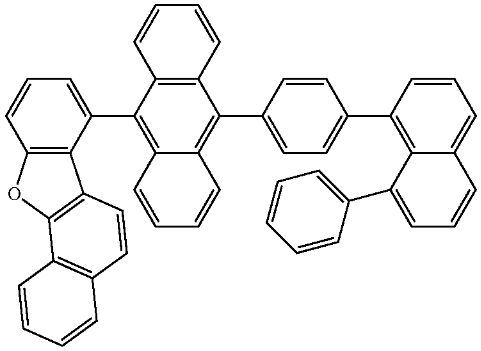
2-340
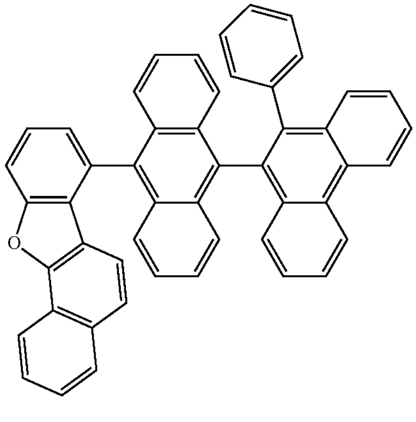

-continued
2-341
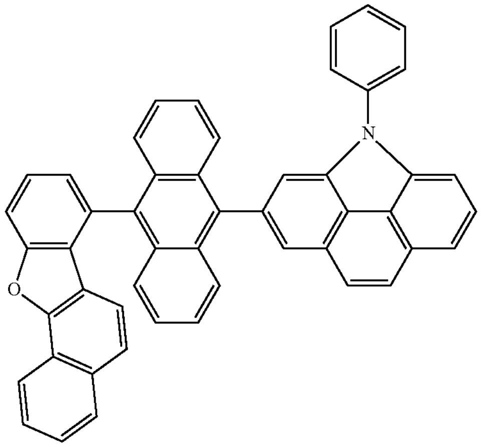
2-342
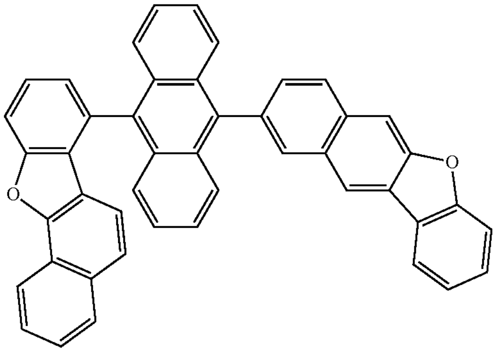
2-343
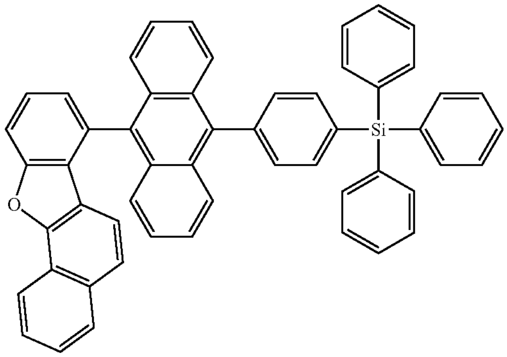
2-344
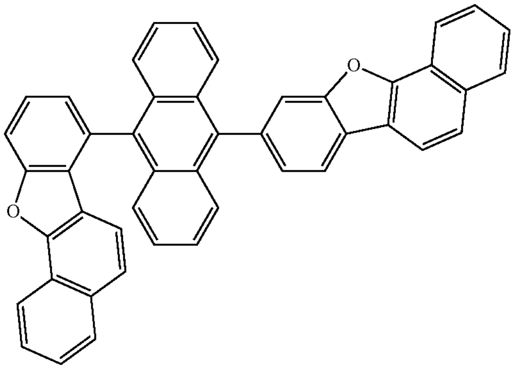
2-345
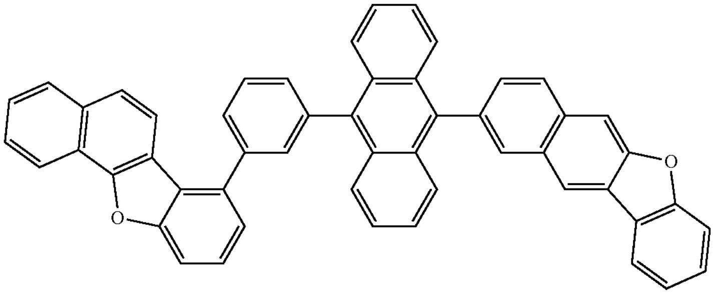
2-346
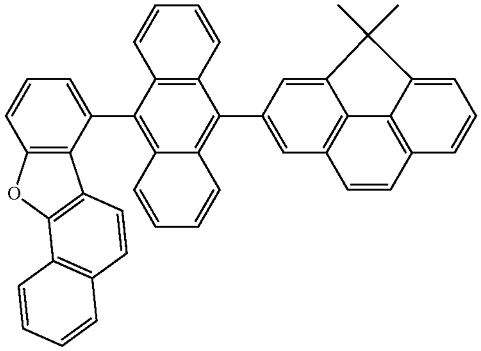
2-347
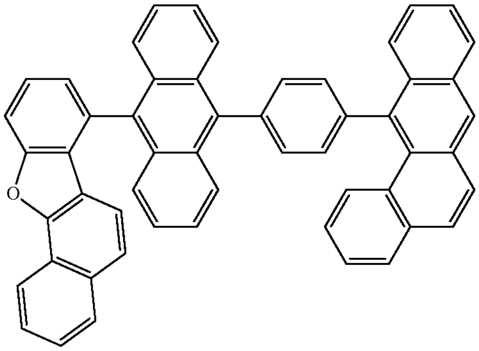

-continued
2-348
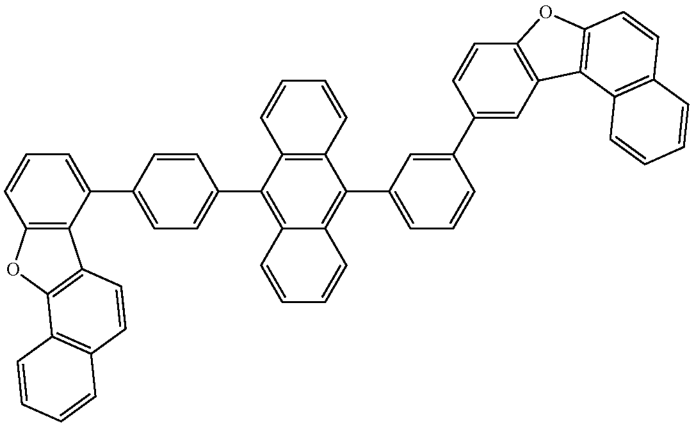
2-349
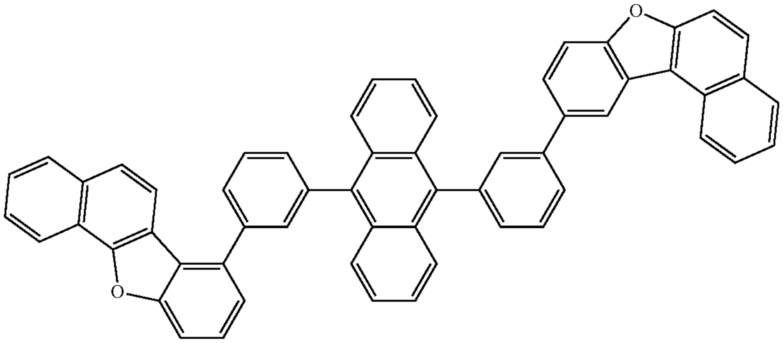
2-350
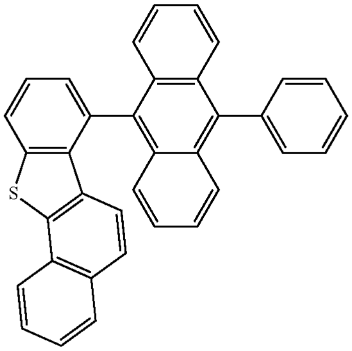
2-351
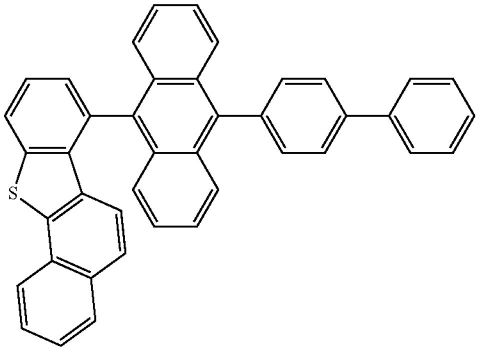
2-352
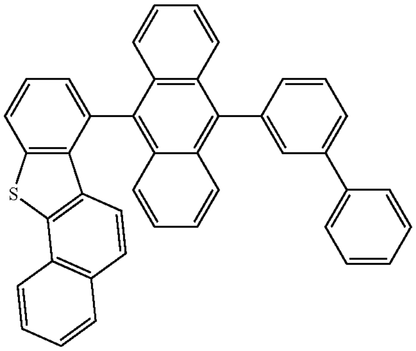
2-353
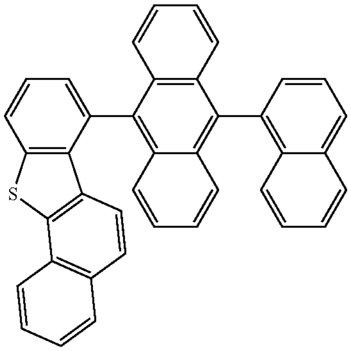

-continued
2-354
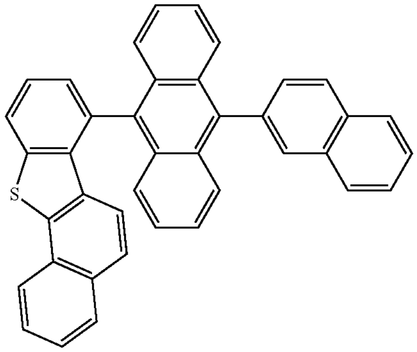
2-355
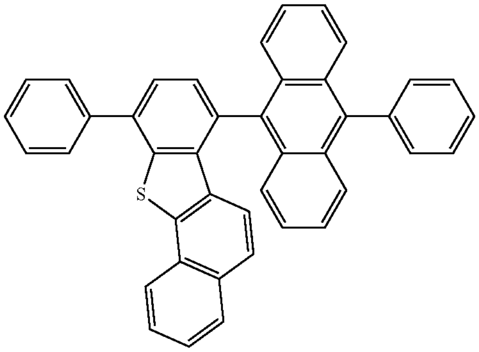
2-356
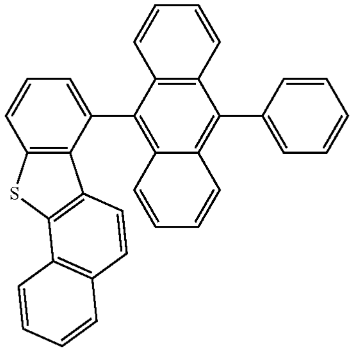
2-357
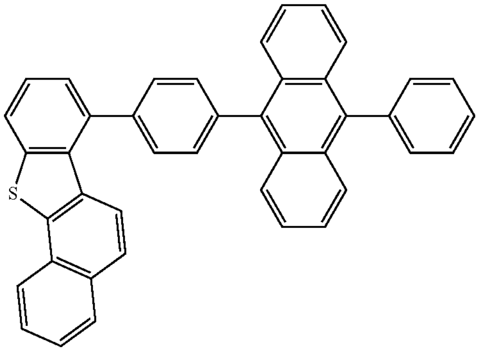
2-358
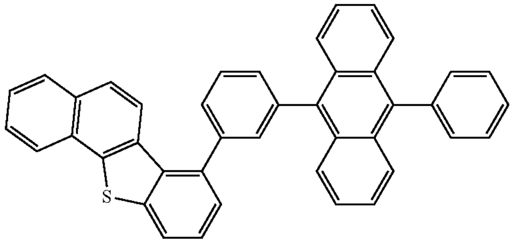
2-359
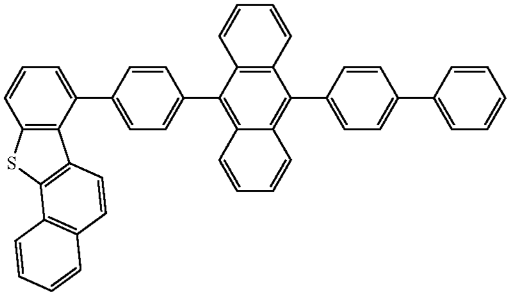
2-360
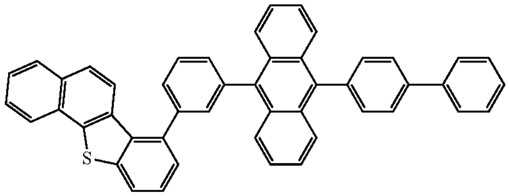
2-361
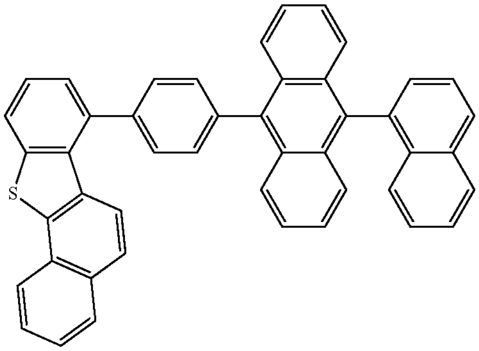

-continued
2-362
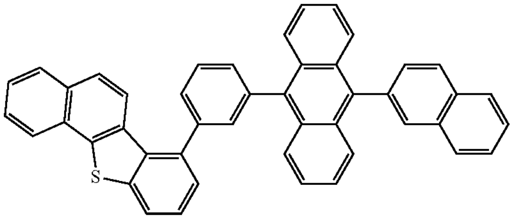
2-363
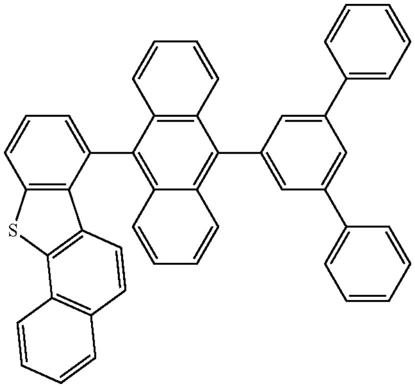
2-364
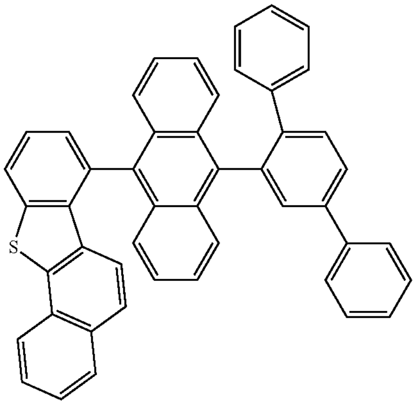
2-365
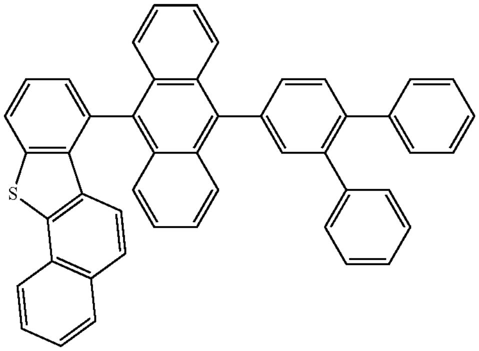
2-366
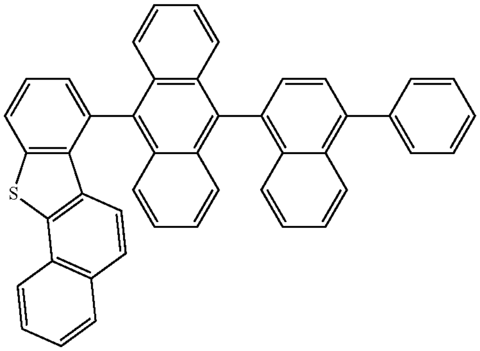
2-367
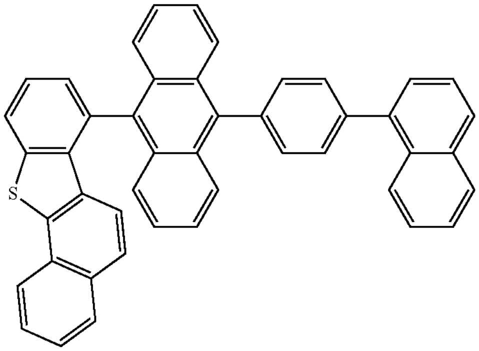
2-368
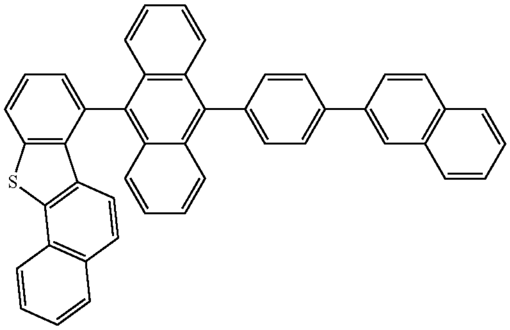
2-369
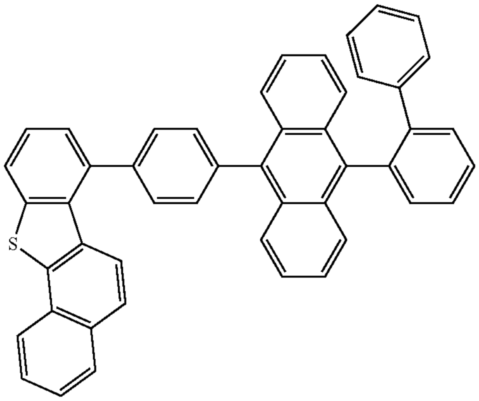

-continued
2-370
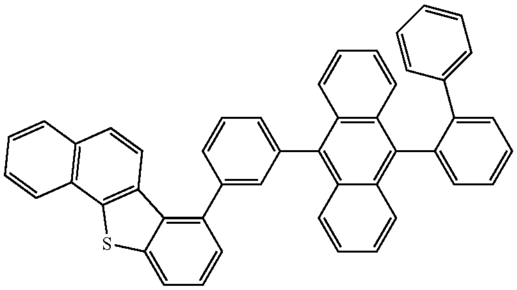
2-371
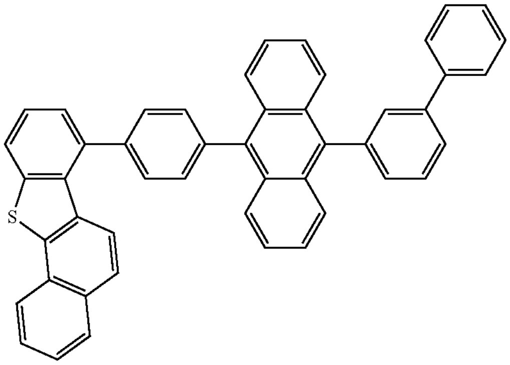
2-372
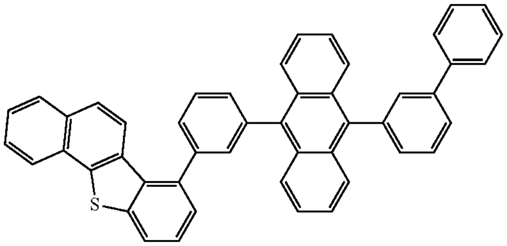
2-373
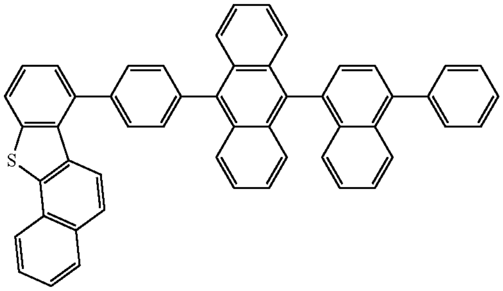
2-374
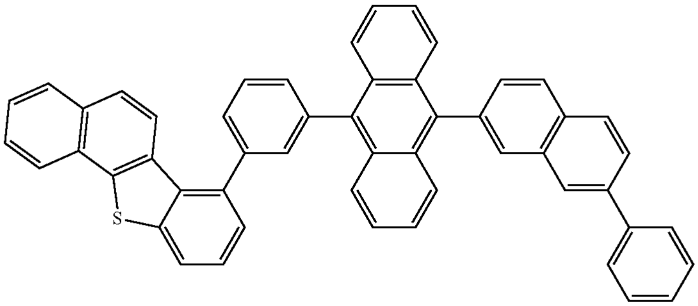
2-375
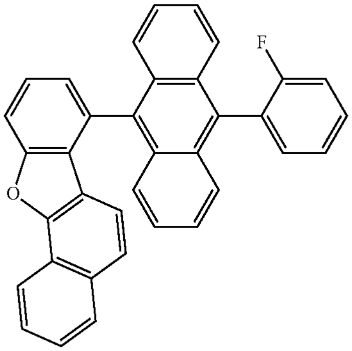
2-376
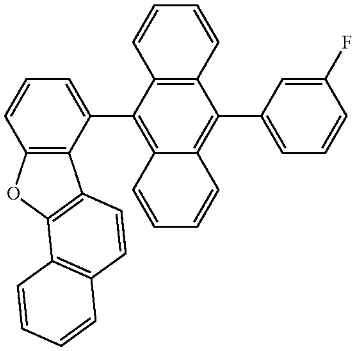

-continued
2-377
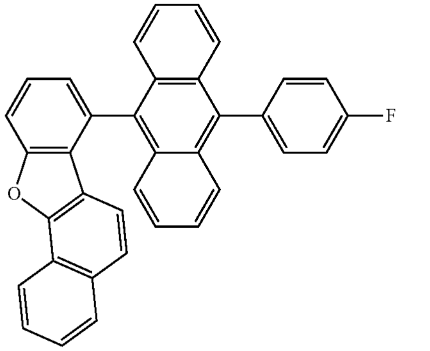
2-378
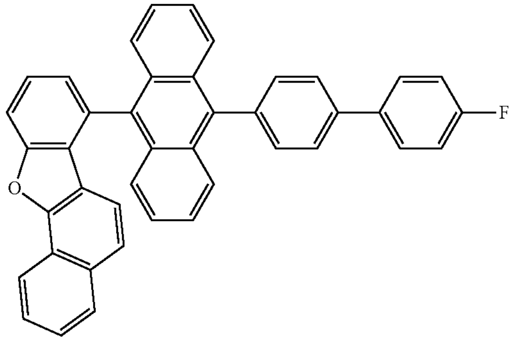
2-379
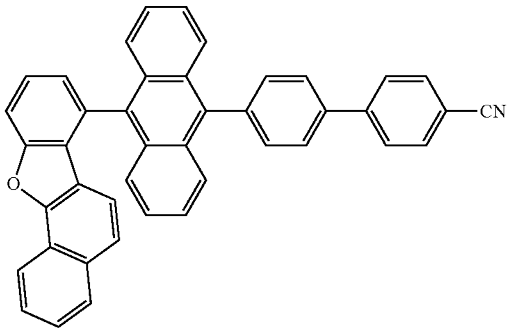
2-380
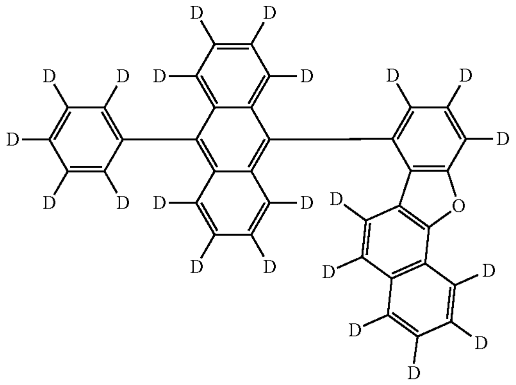
2-381
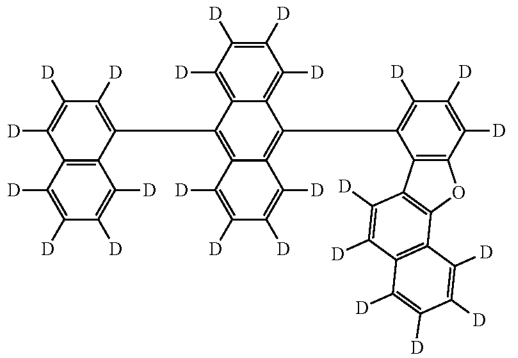
2-382
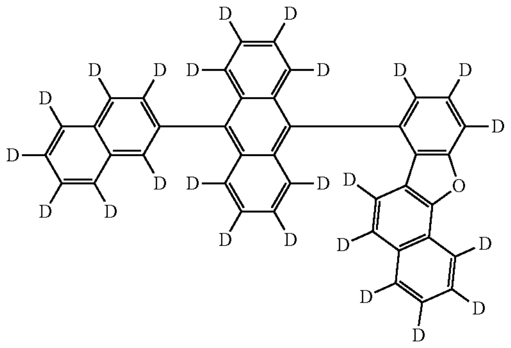
2-383
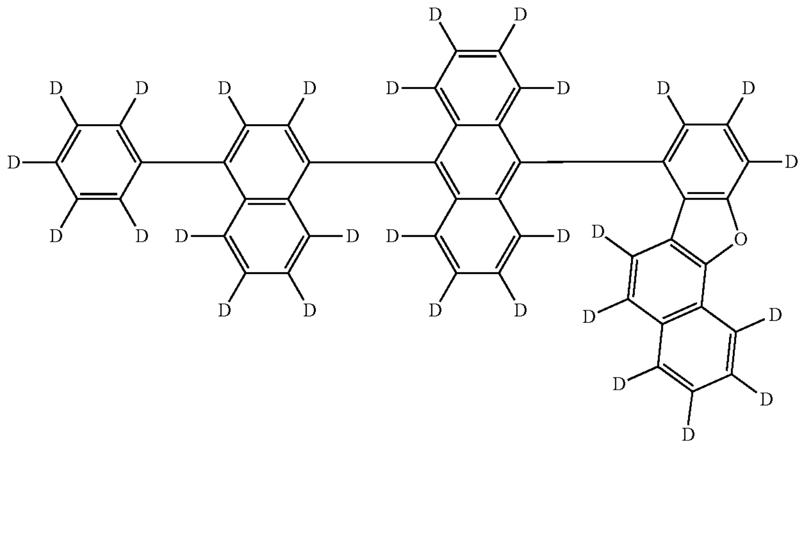

-continued
2-384
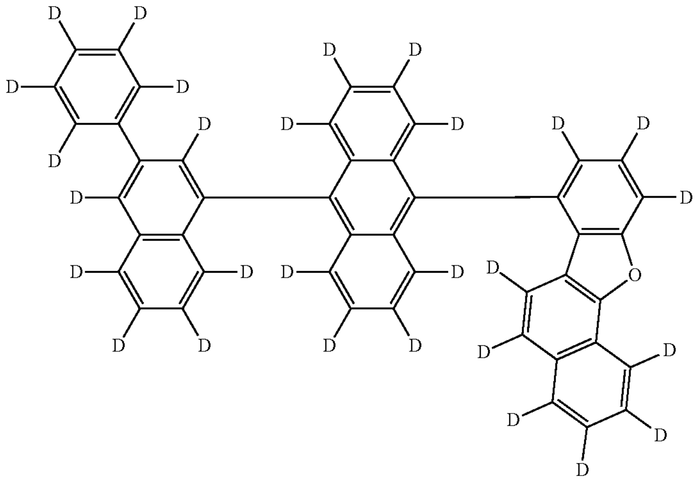
2-385
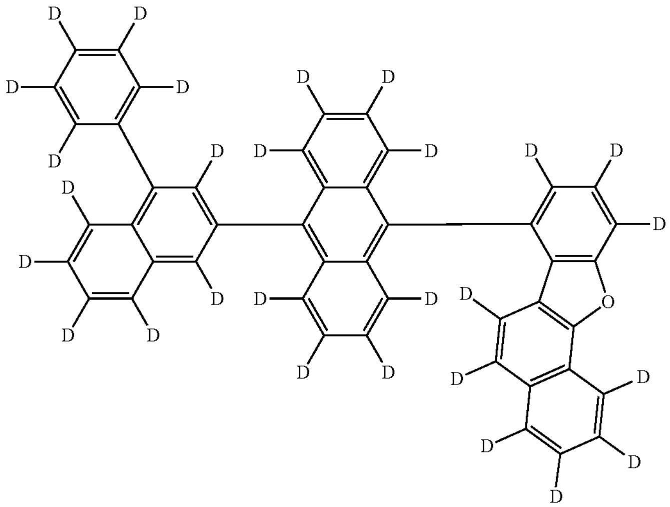
2-386
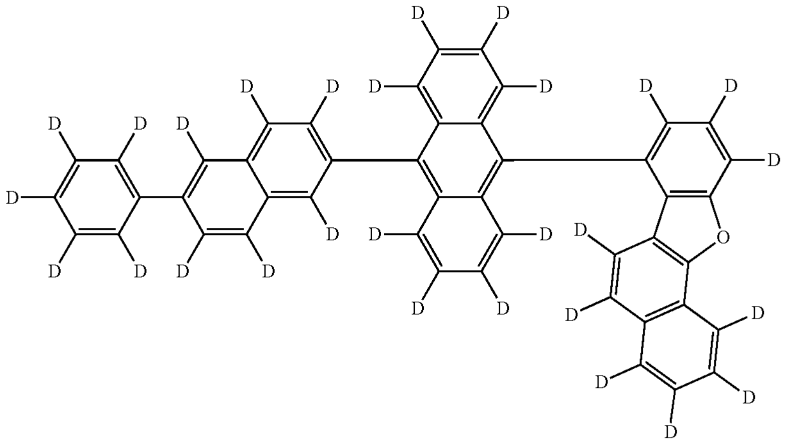

-continued
2-387
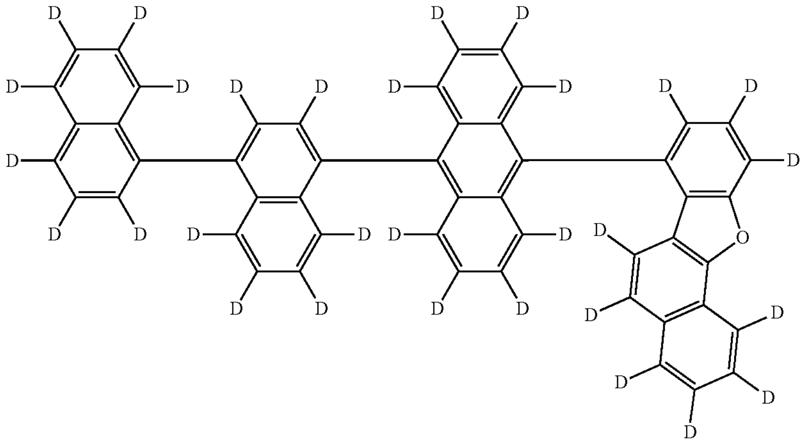
2-388
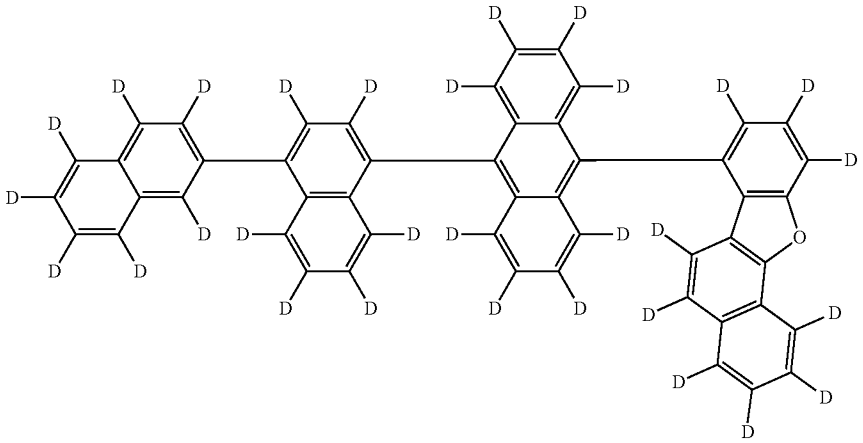
2-389
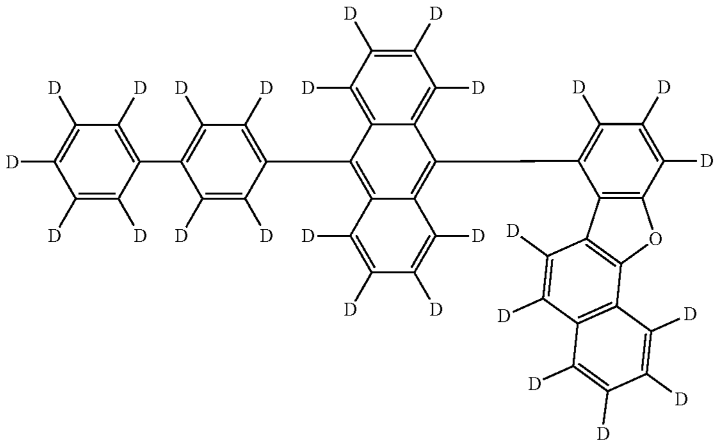

-continued
2-390
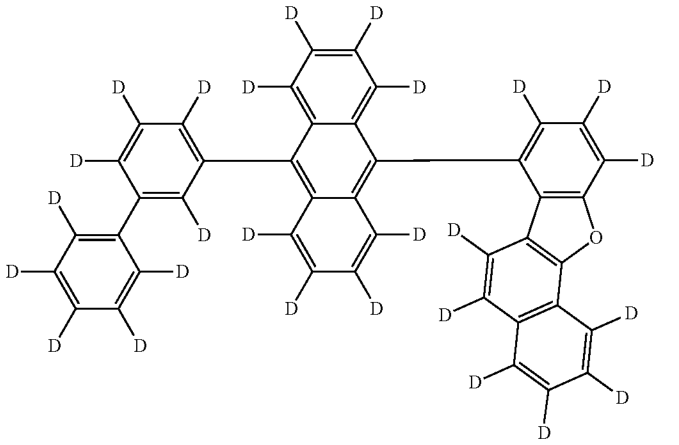
2-391
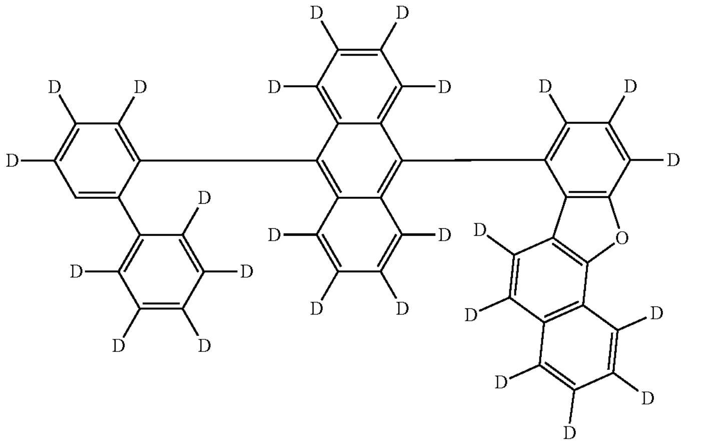
2-392
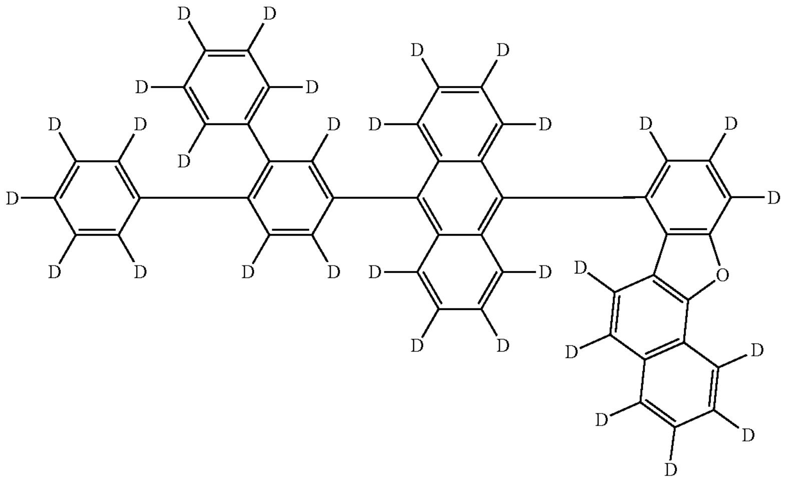

-continued
2-393
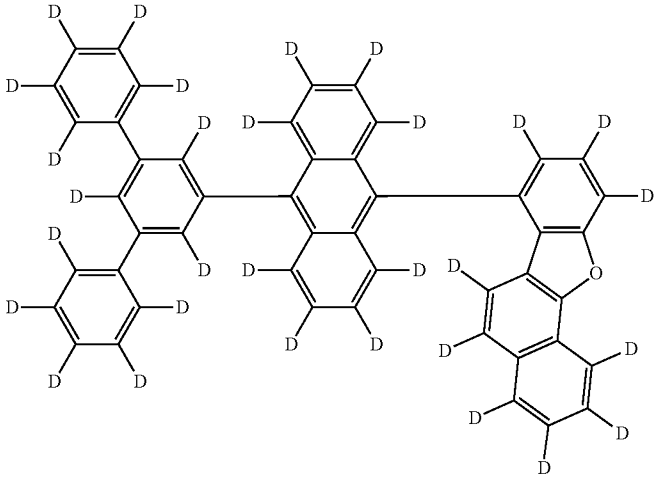
2-394
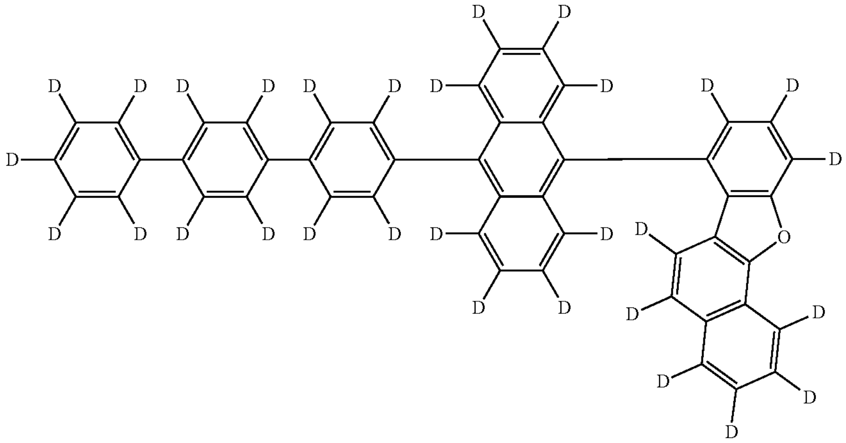
2-395
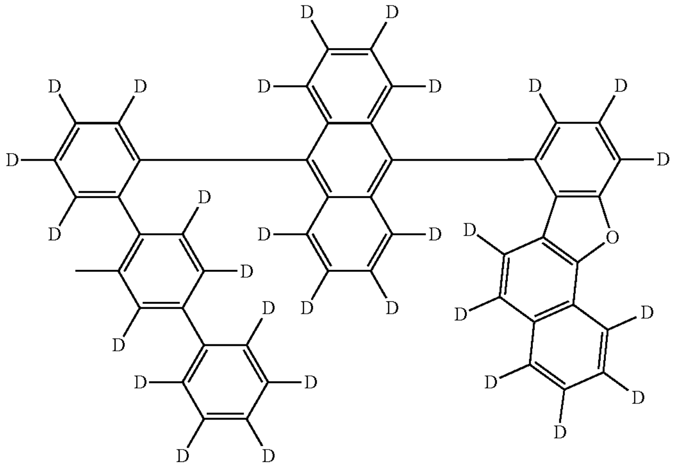

-continued
2-396
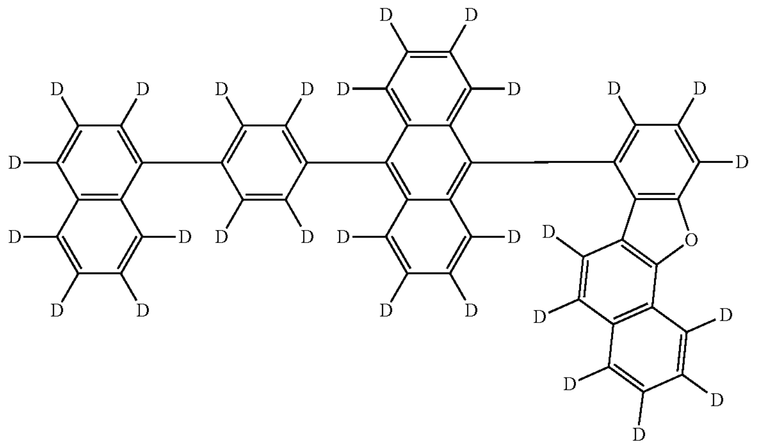
2-397
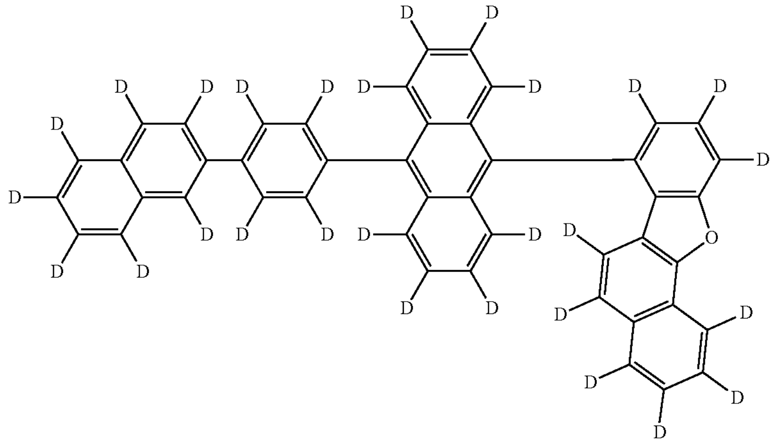
2-398
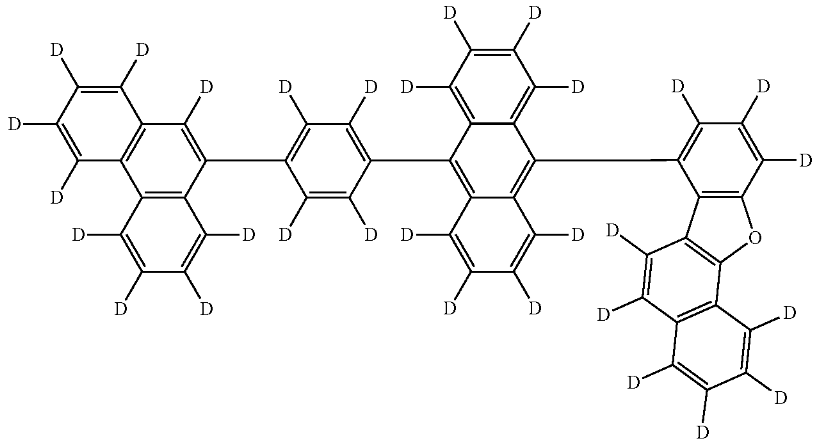

-continued
2-399
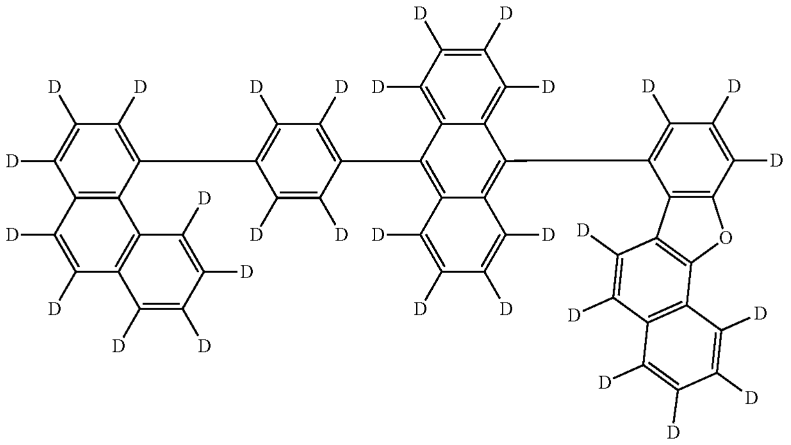
2-400
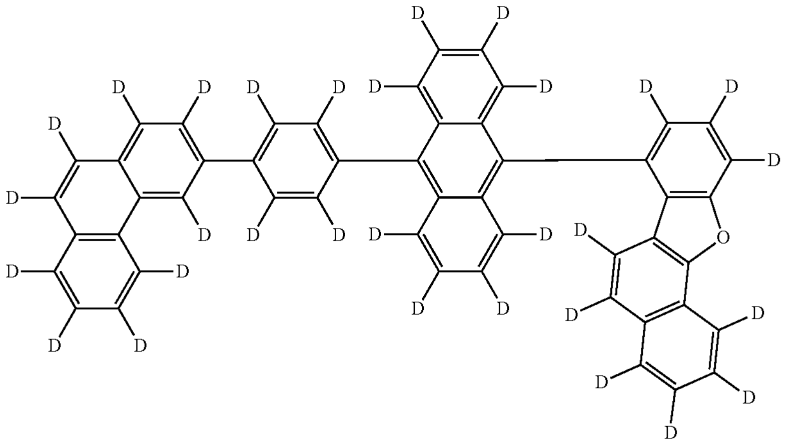
2-401
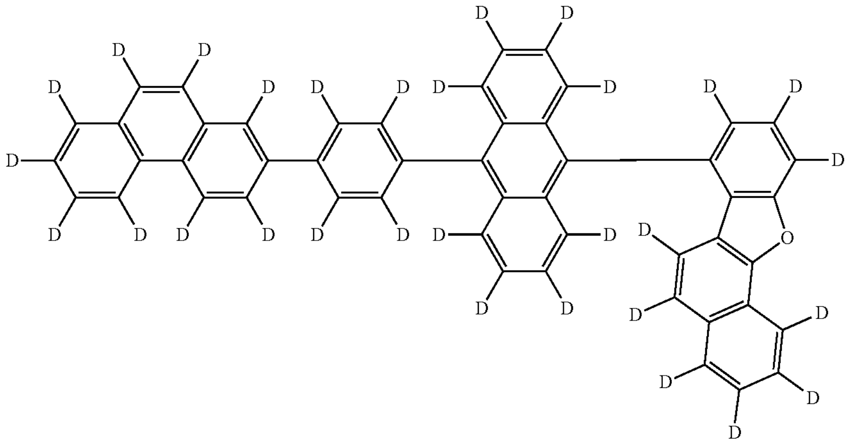

-continued
2-402
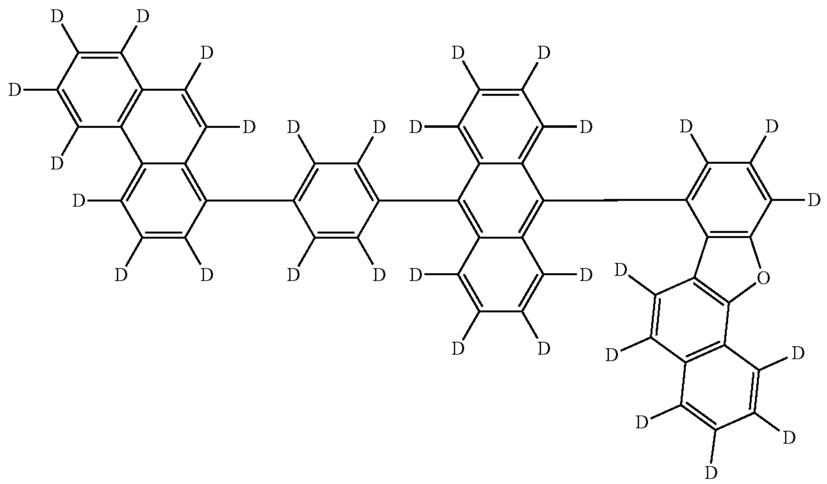
2-403
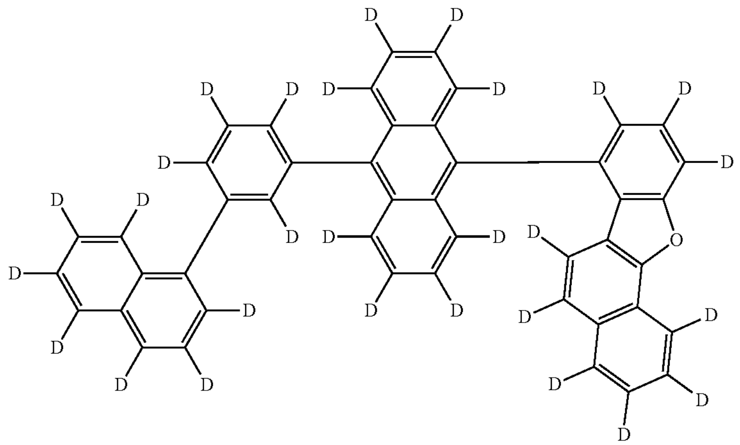
2-404
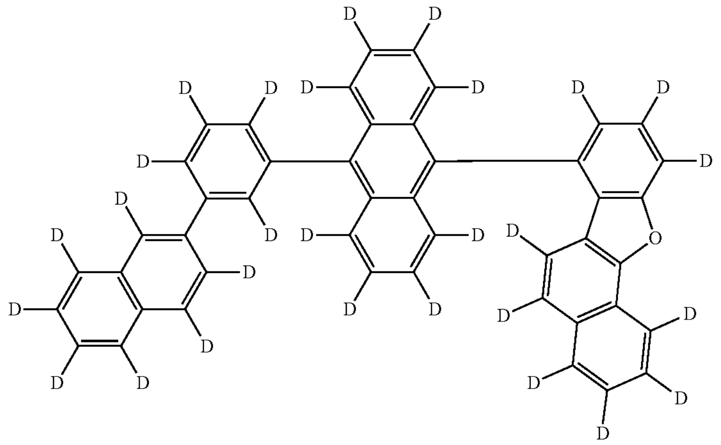

-continued
2-405
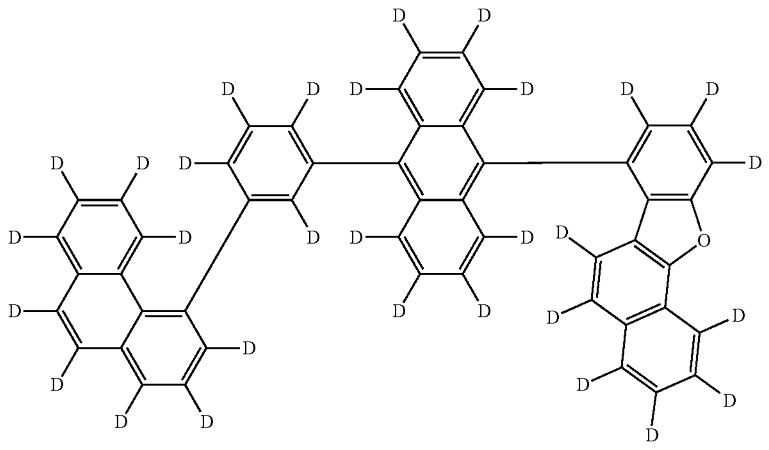
2-406
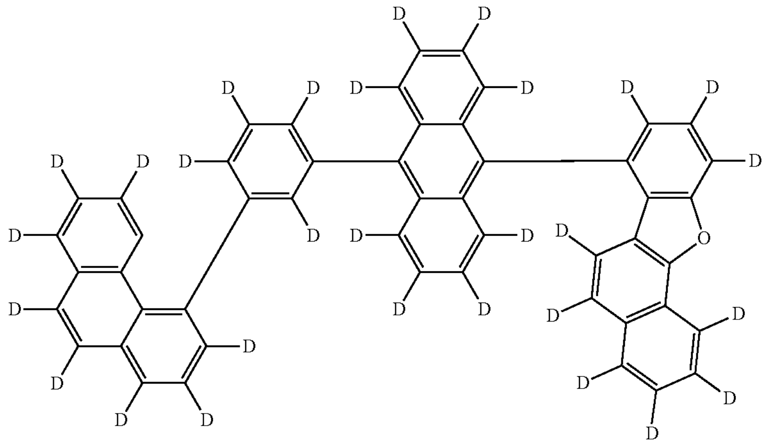
2-407
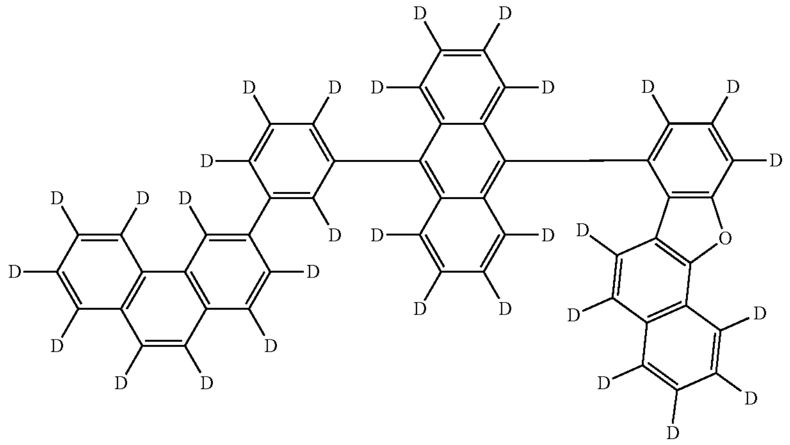

-continued
2-408
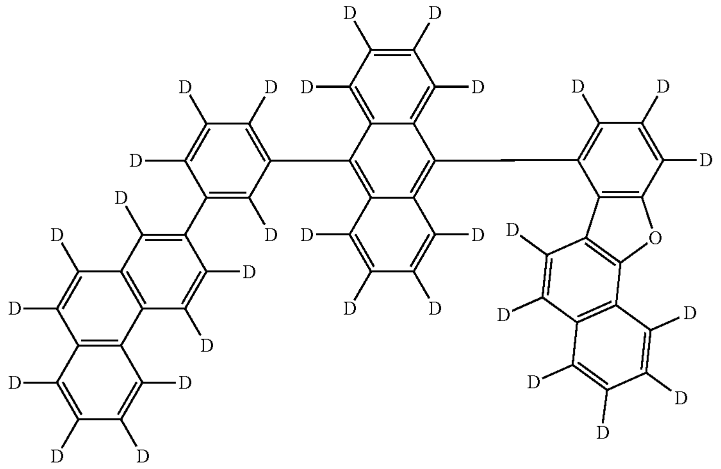
2-409
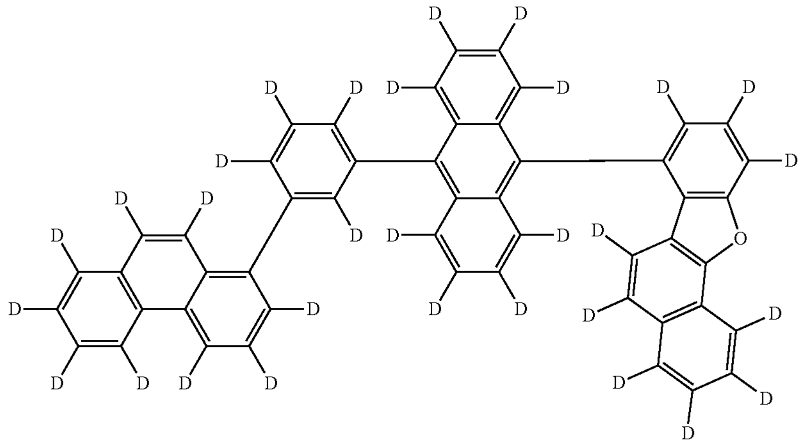
2-410
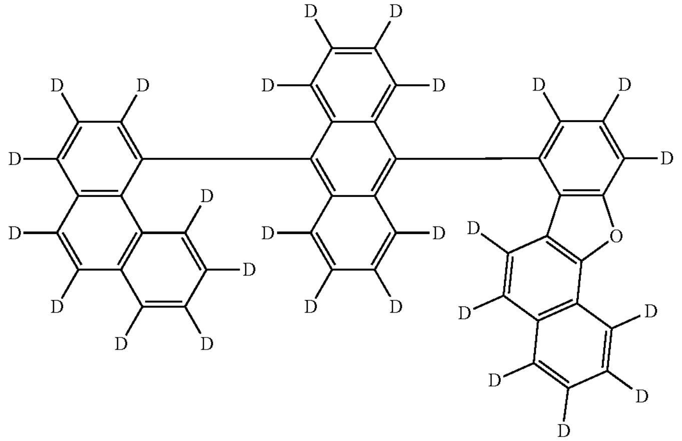

-continued
2-411
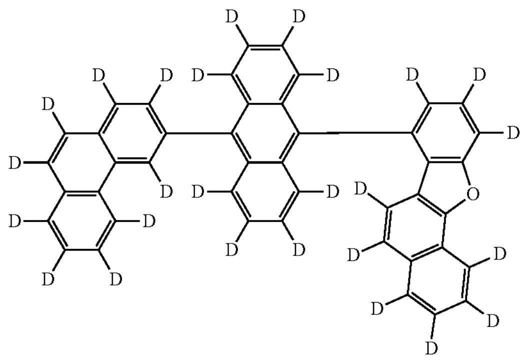
2-412
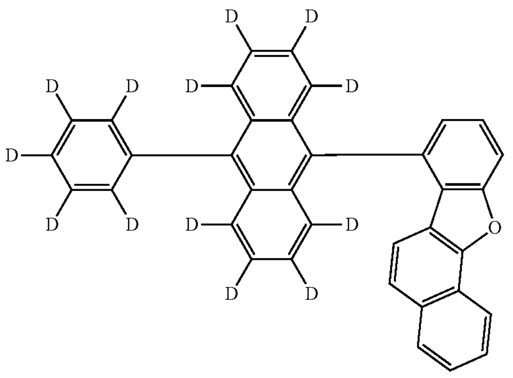
2-413
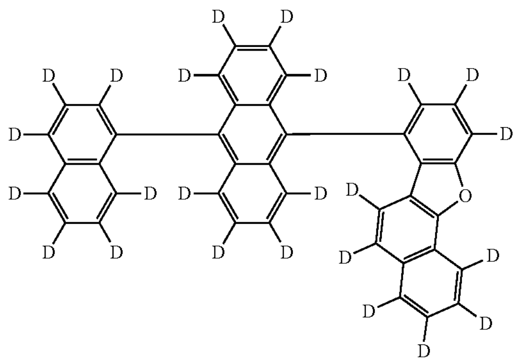
2-414
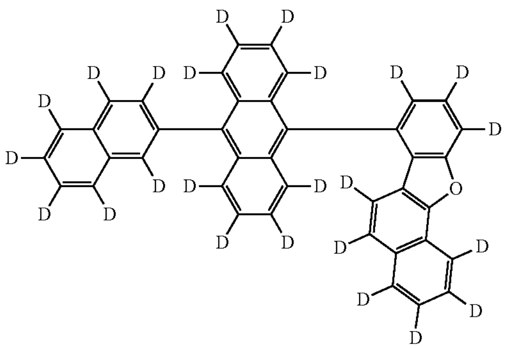
2-415
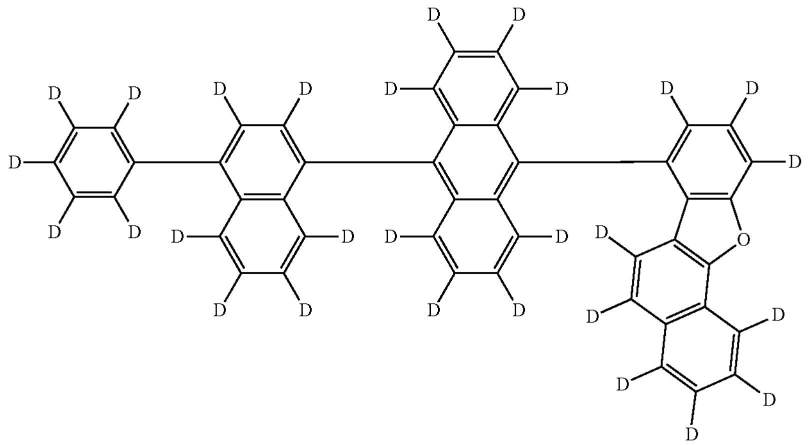

-continued
2-416
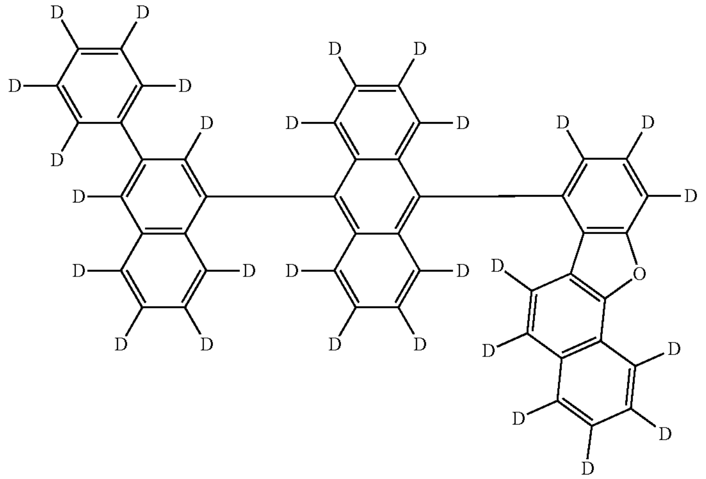
2-417
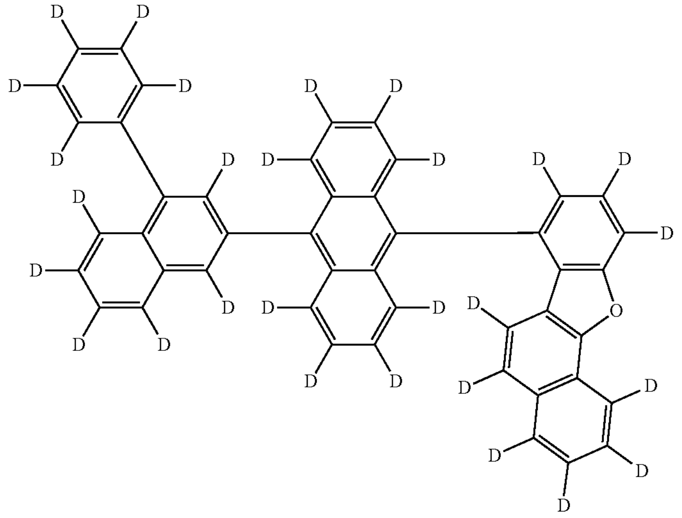
2-418
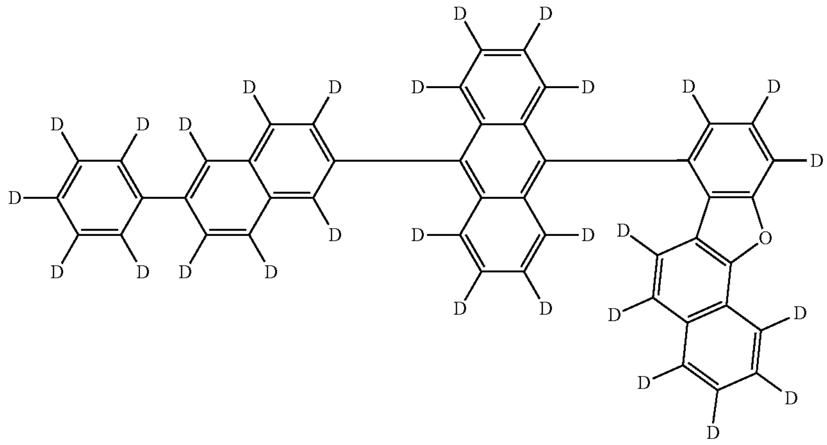

-continued
2-419
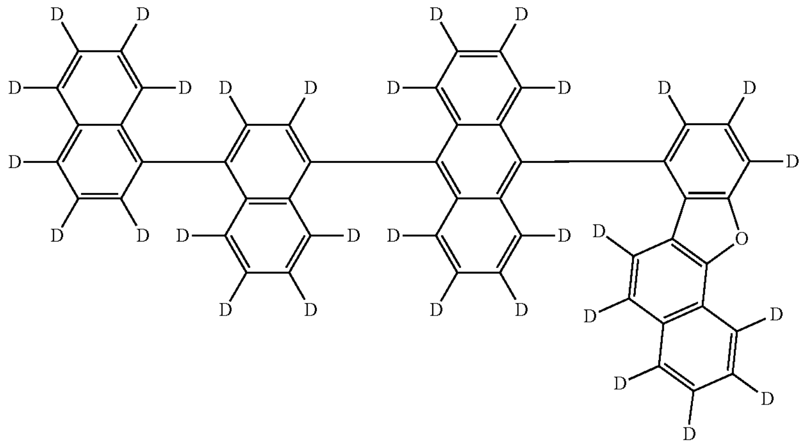
2-420
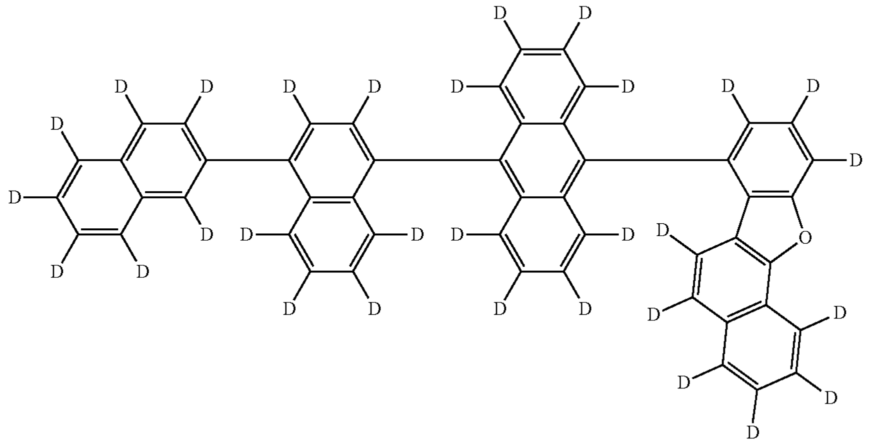
2-421
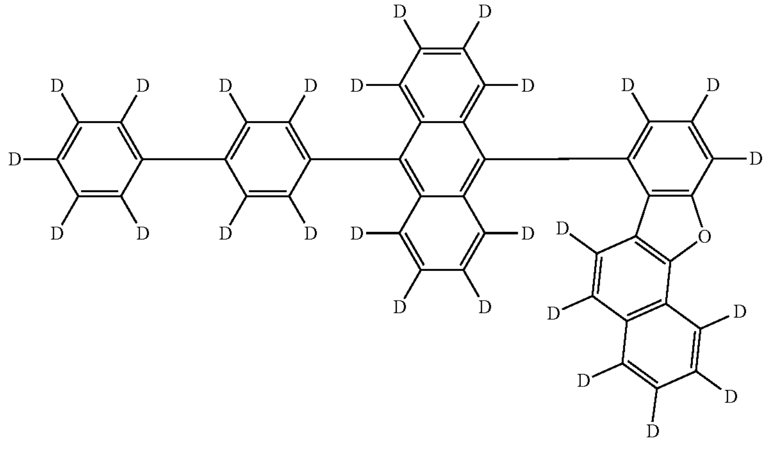

-continued
2-422
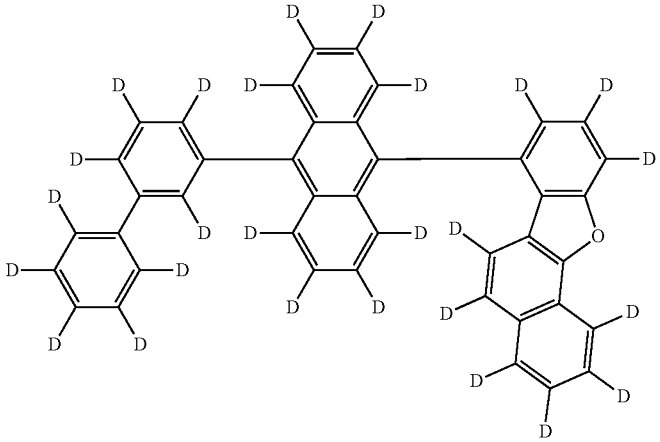
2-423
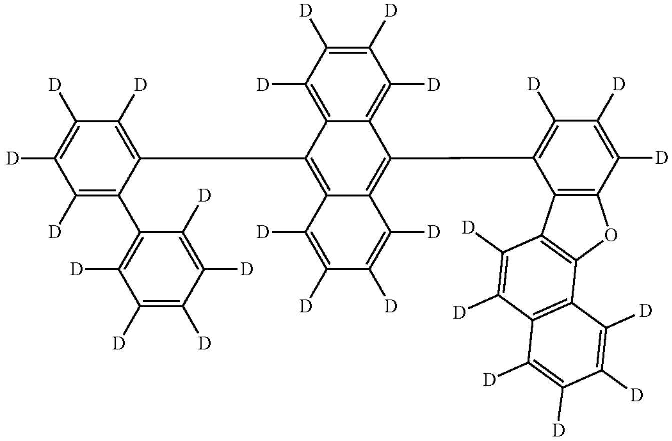
2-424
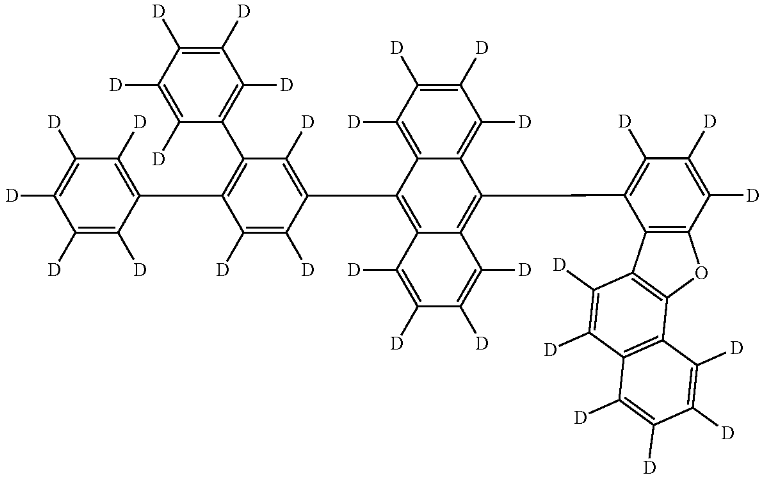

-continued
2-425
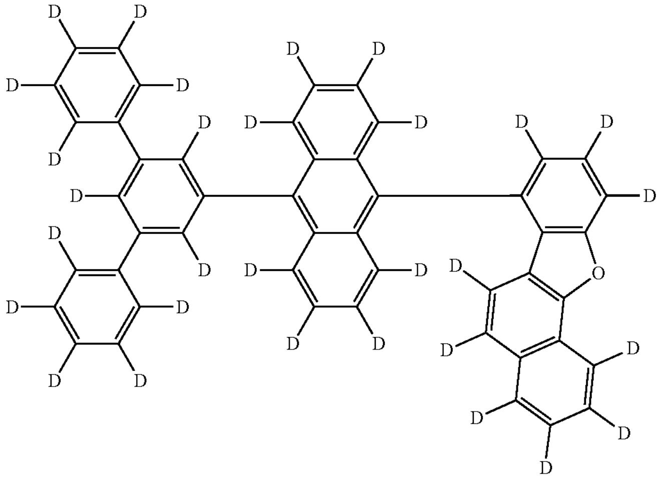
2-426
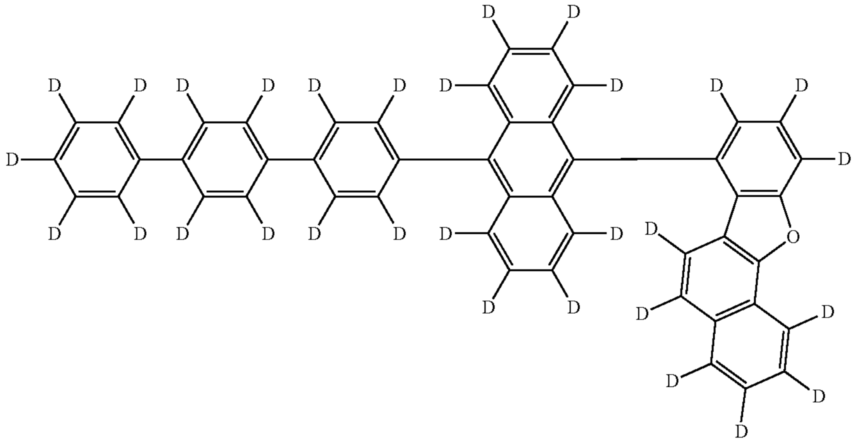
2-427
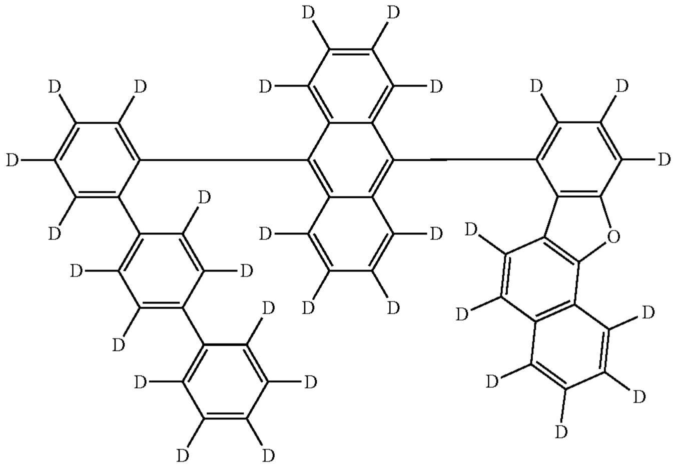

-continued
2-428
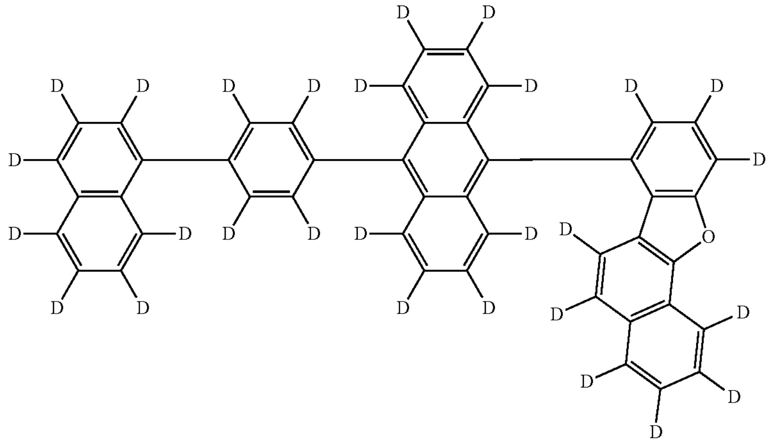
2-429
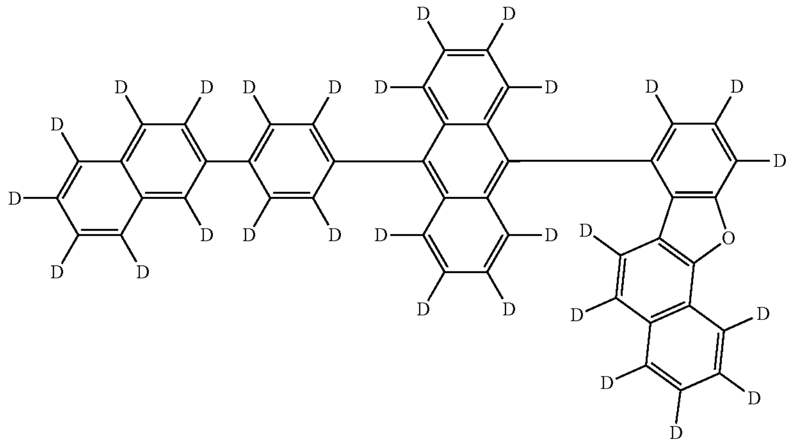
2-430
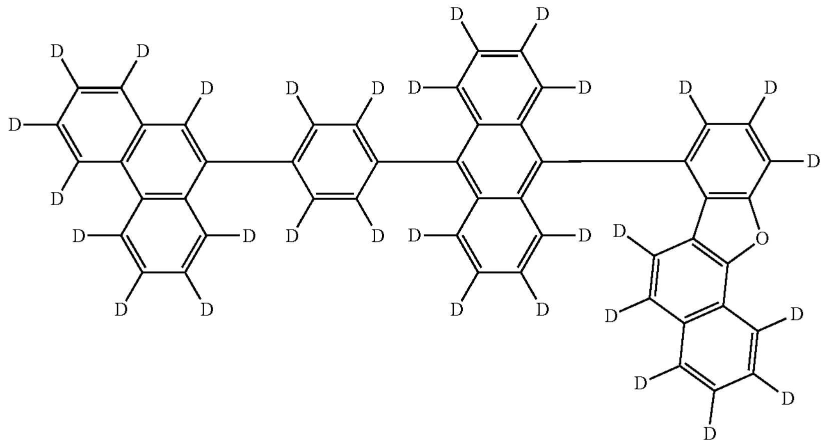

-continued
2-431
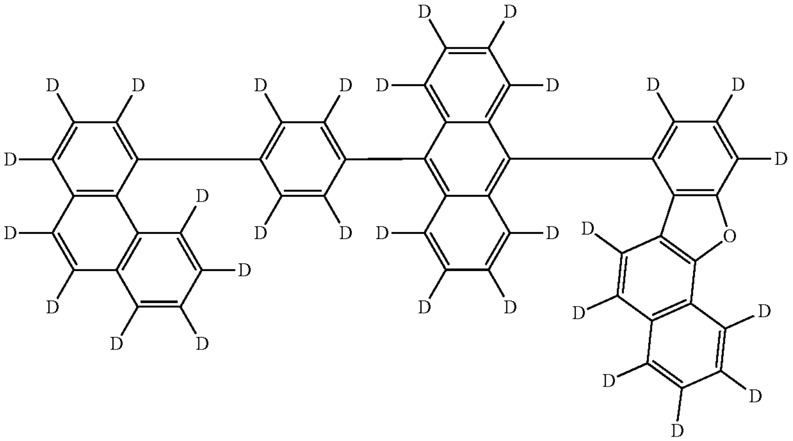
2-432
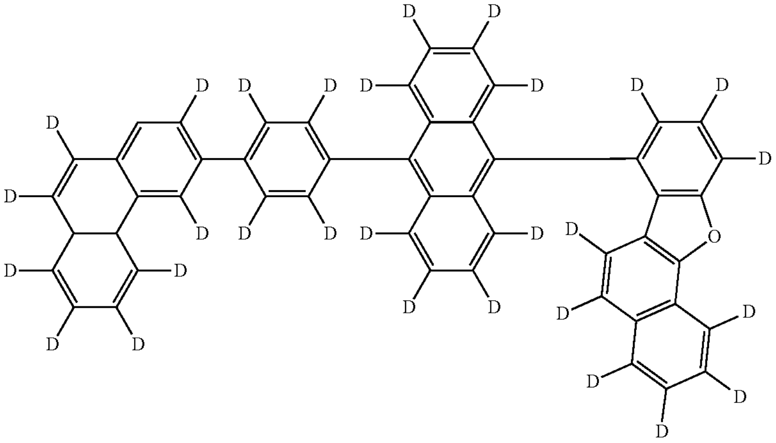
2-433
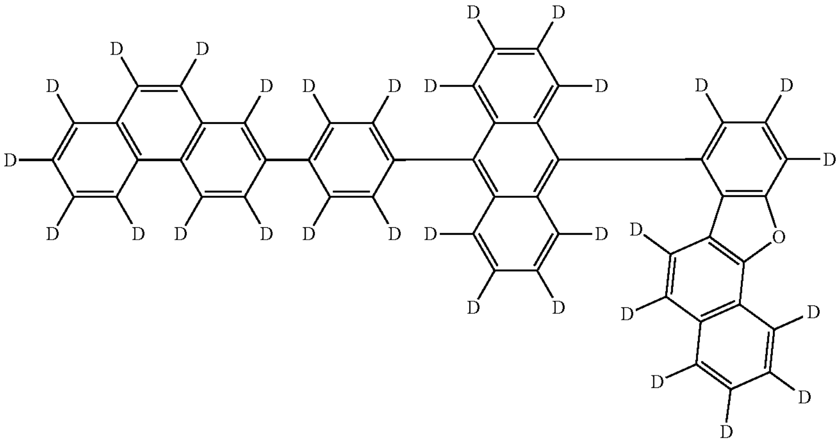

-continued
2-434
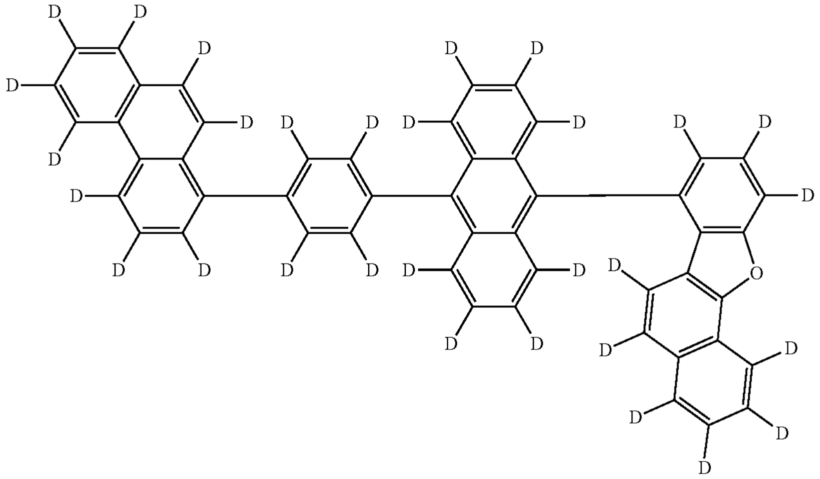
2-435
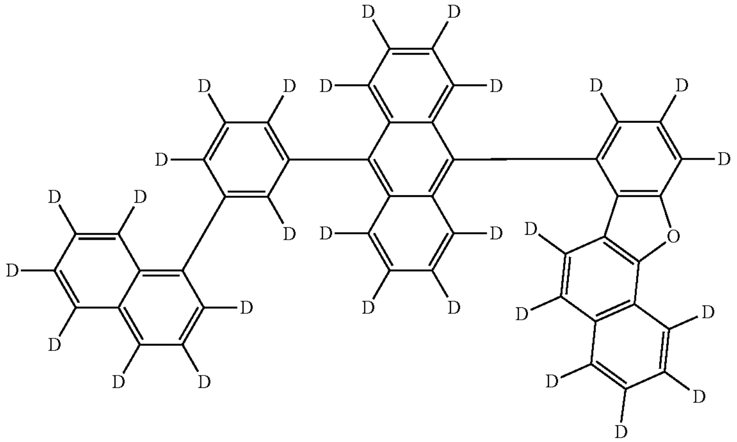
2-436
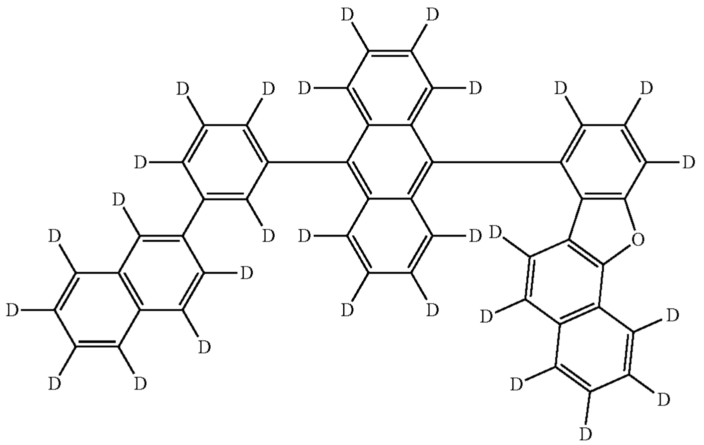

-continued
2-437
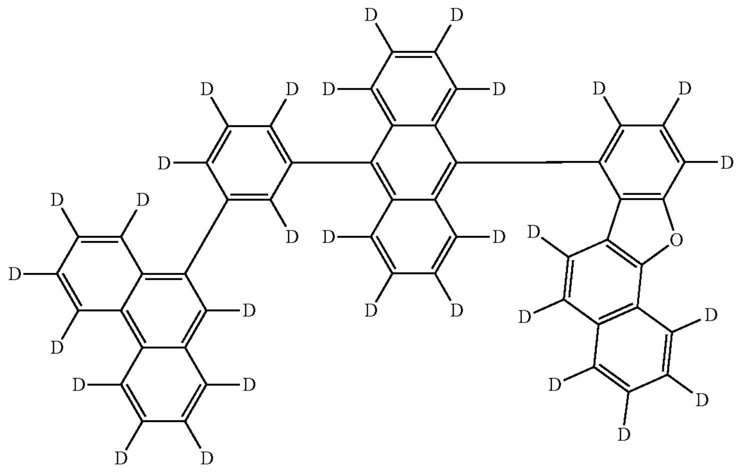
2-438
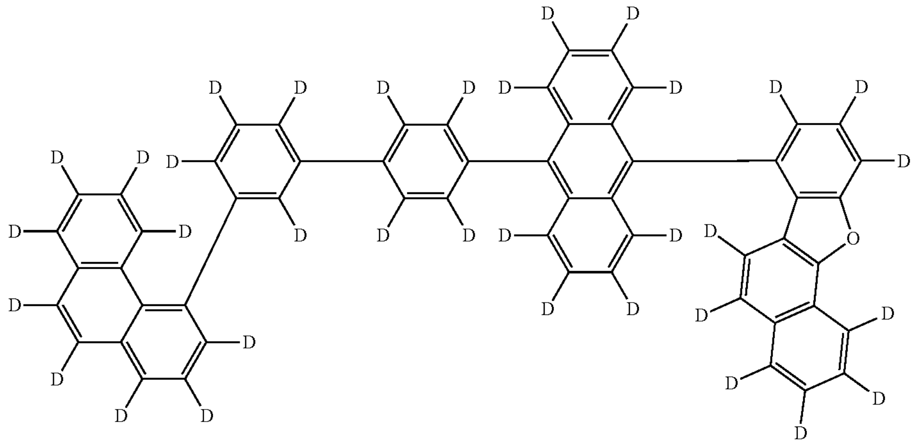
2-439
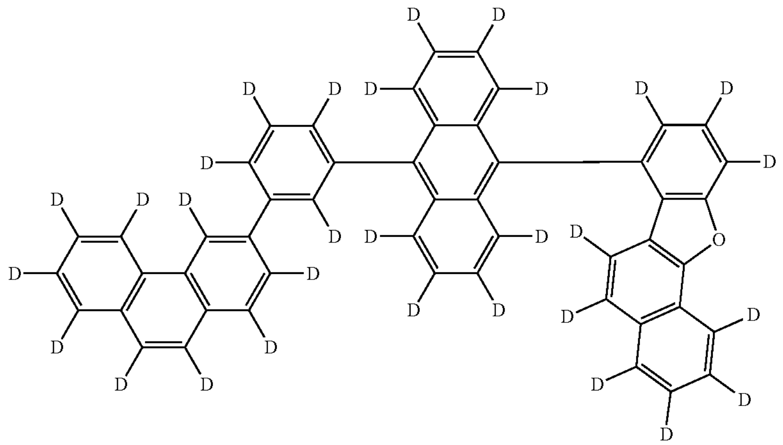

-continued
2-440
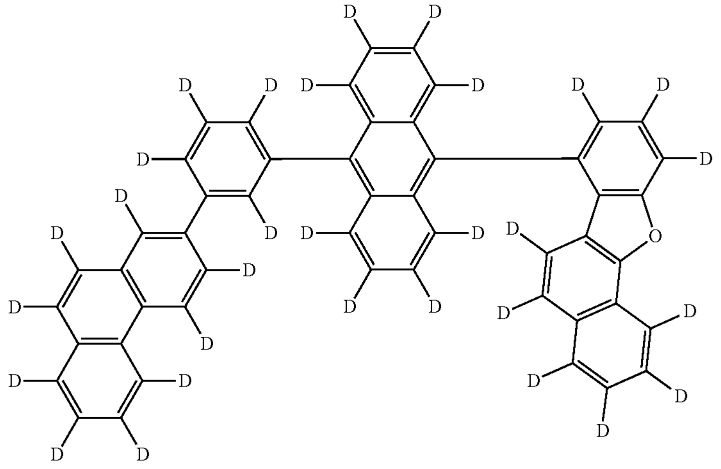
2-441
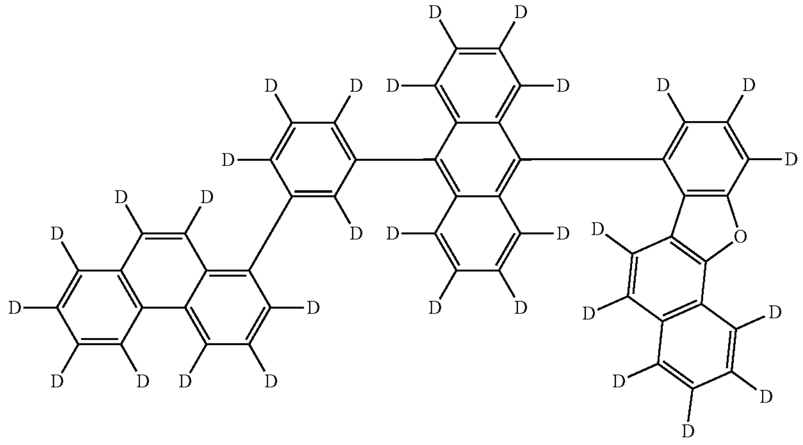
2-442
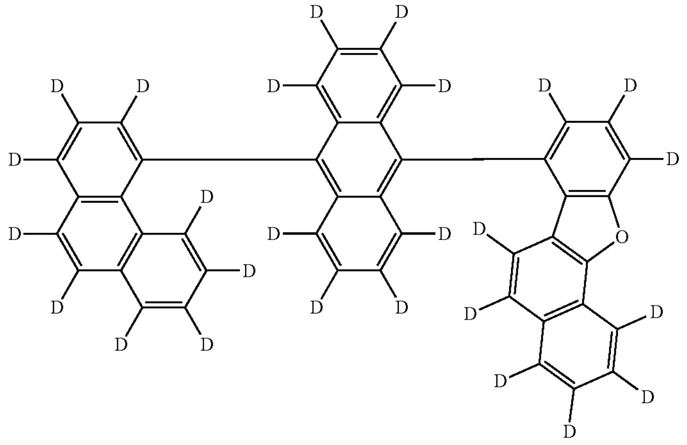

-continued
2-443
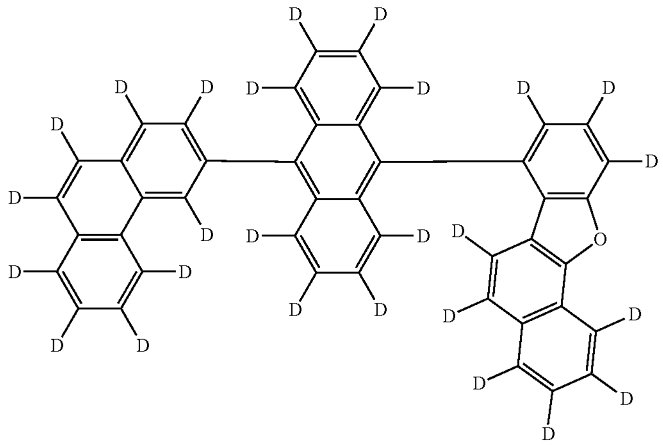
2-444
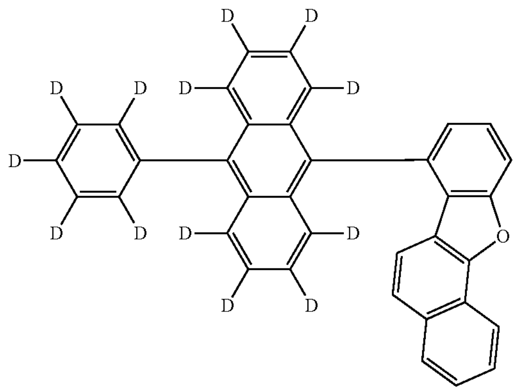
2-445
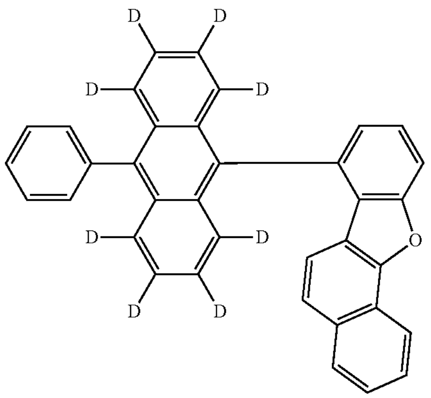
2-446
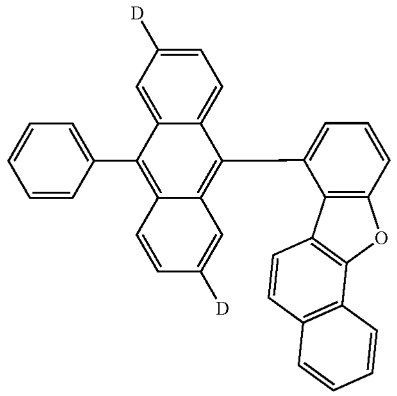
2-447
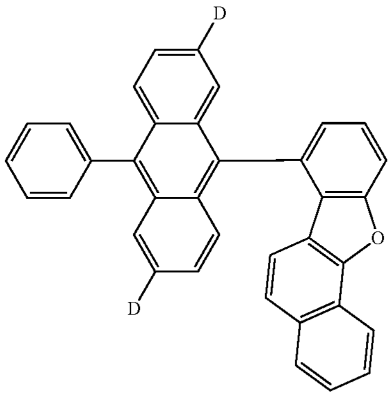
2-448
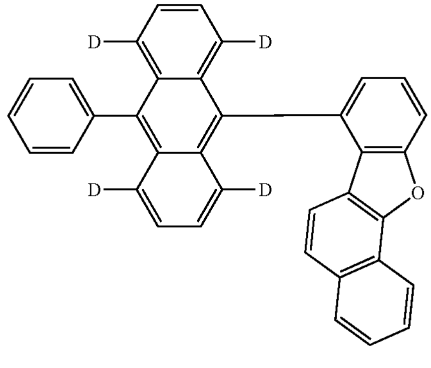
2-449
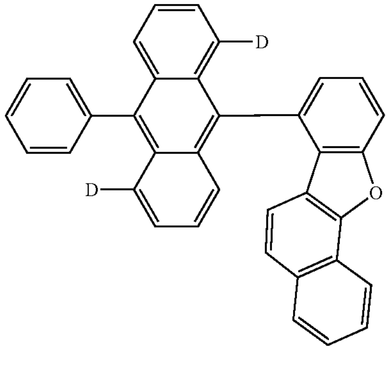

-continued
2-450
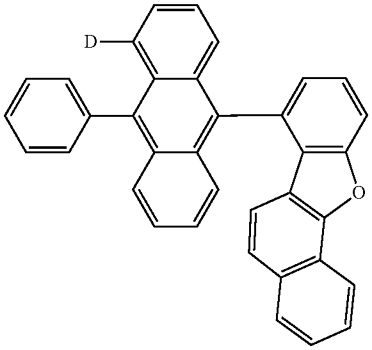
2-451
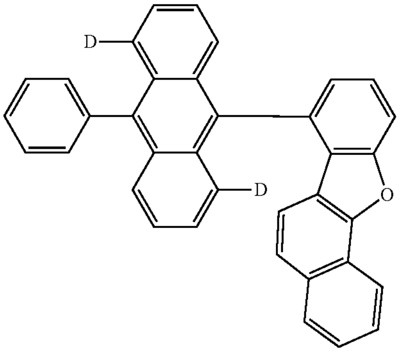
2-452
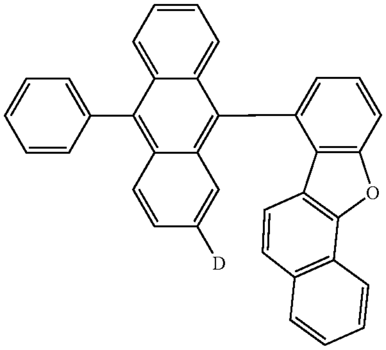
2-453
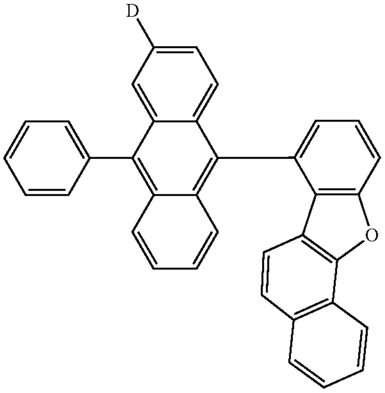
2-454
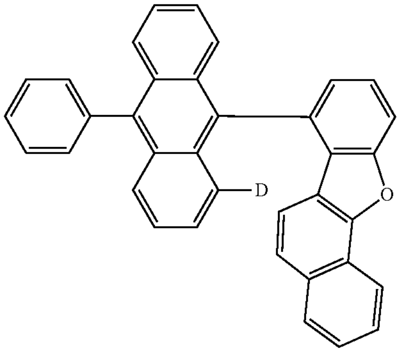
2-455
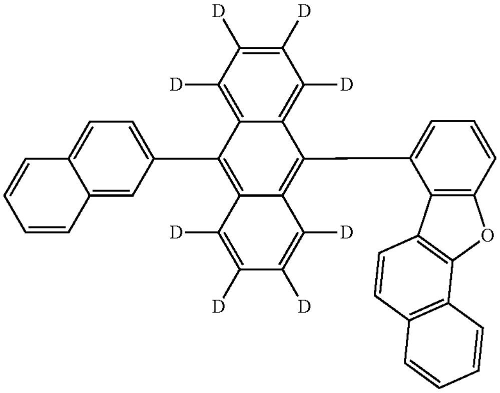
2-456
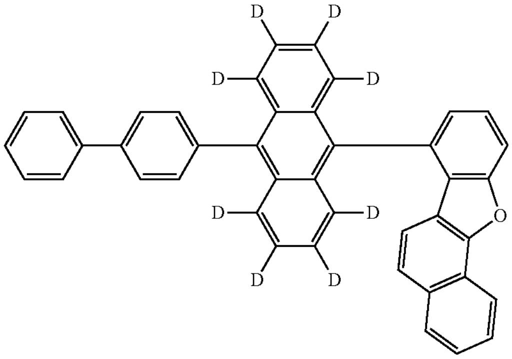
2-457
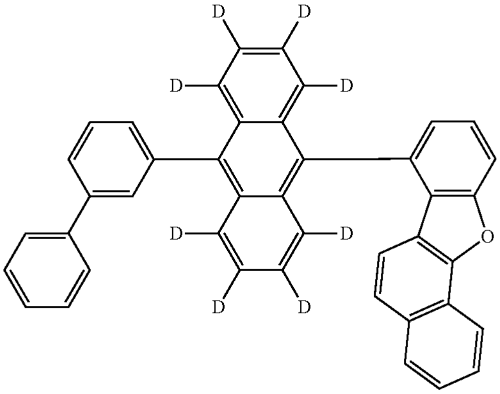

-continued
2-458
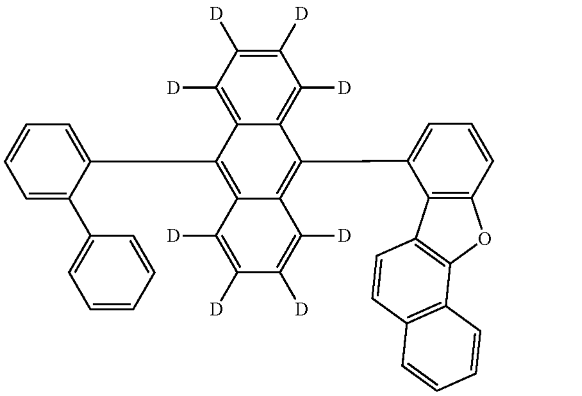
2-459
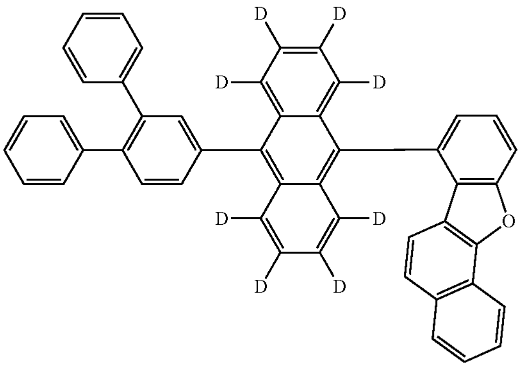
2-460
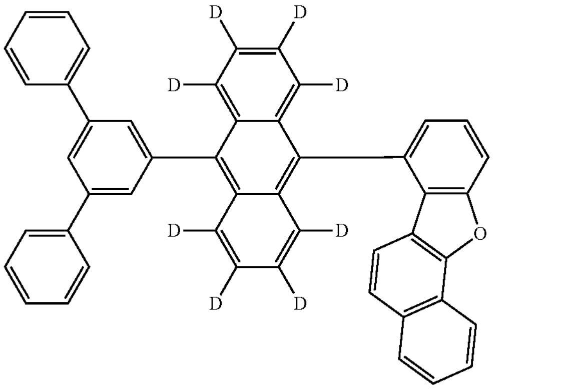
2-461
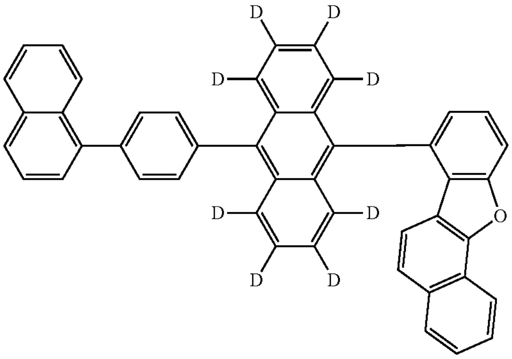
2-462
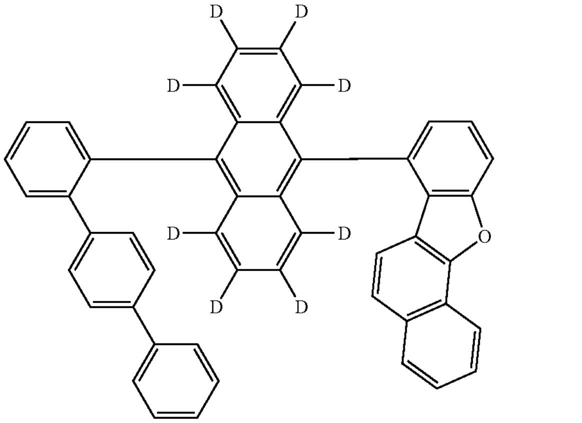

-continued
2-463
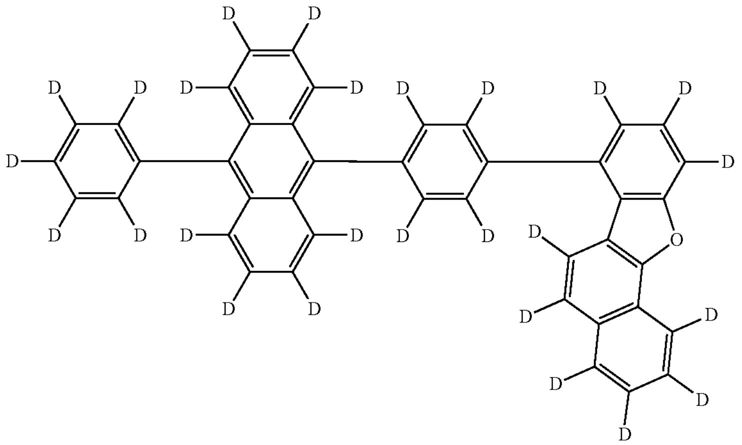
2-464
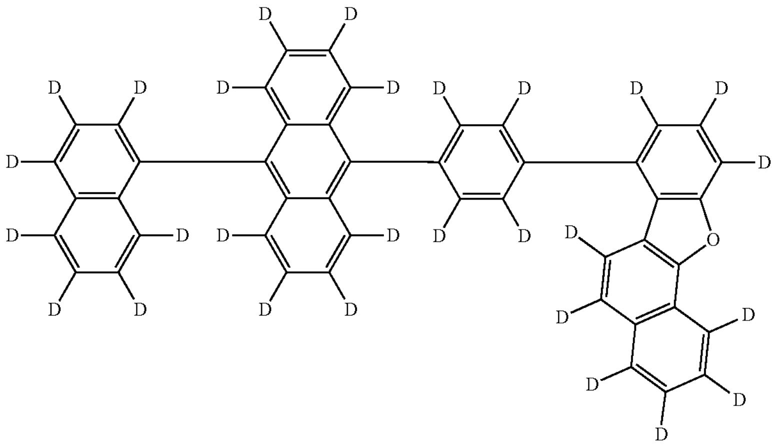
2-465
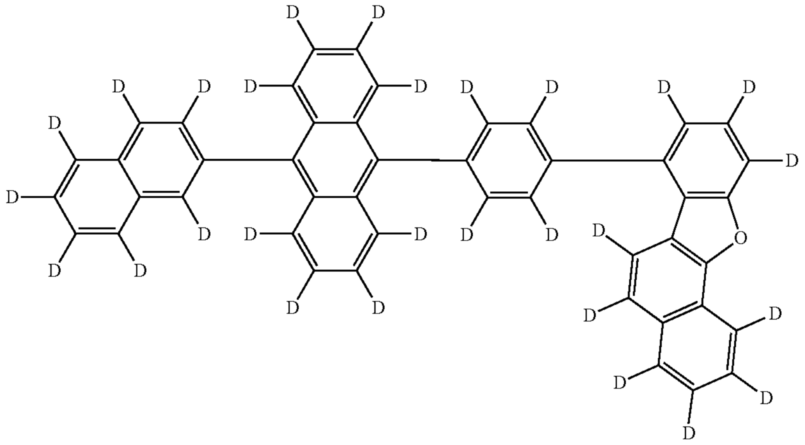

-continued
2-466
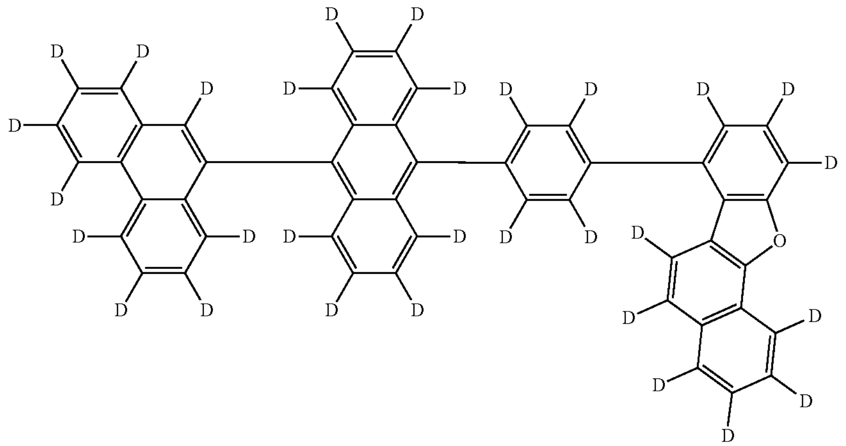
2-467
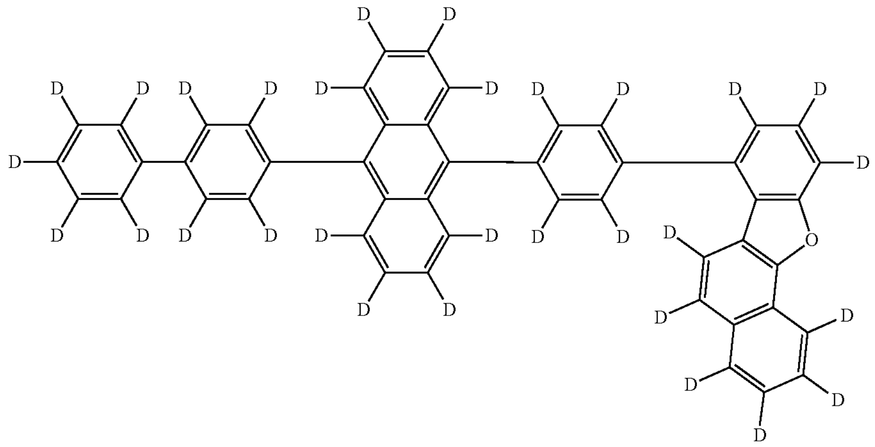
2-468
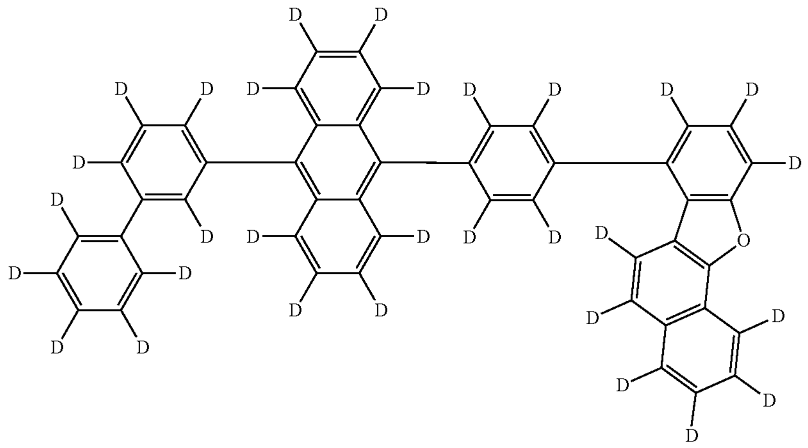

-continued
2-469
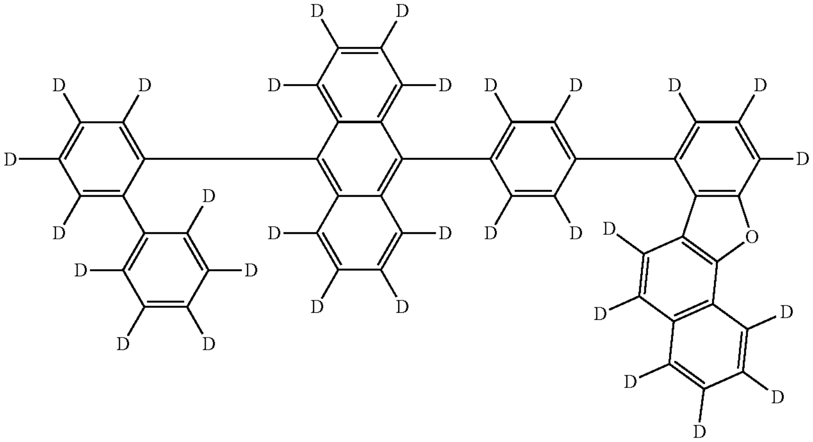
2-470
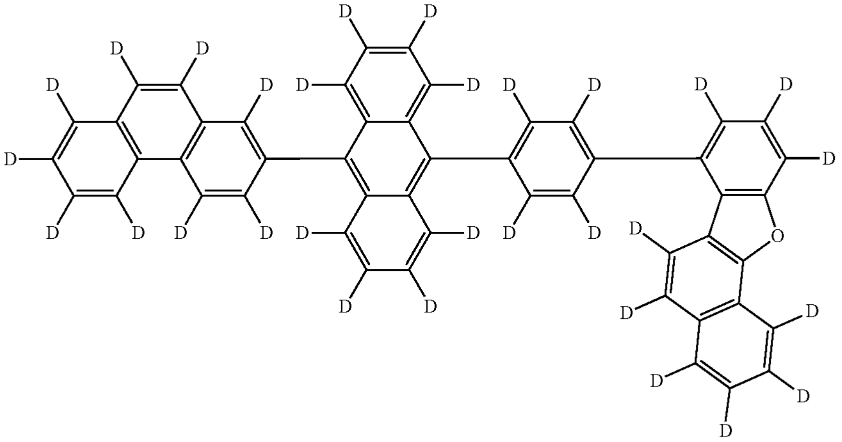
2-471
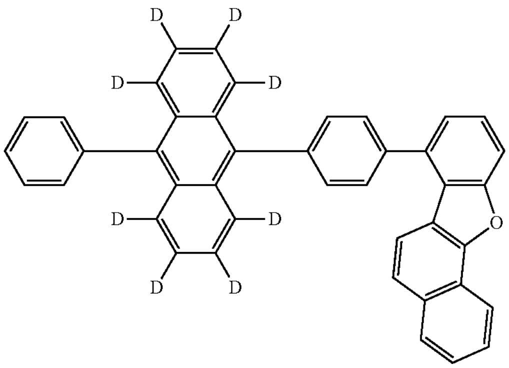
2-472
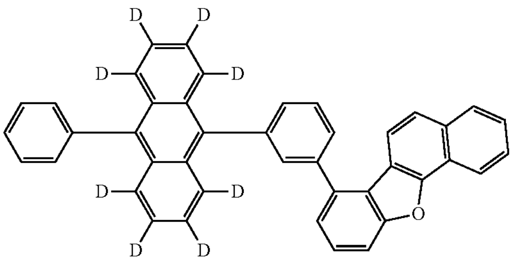

-continued 2-473

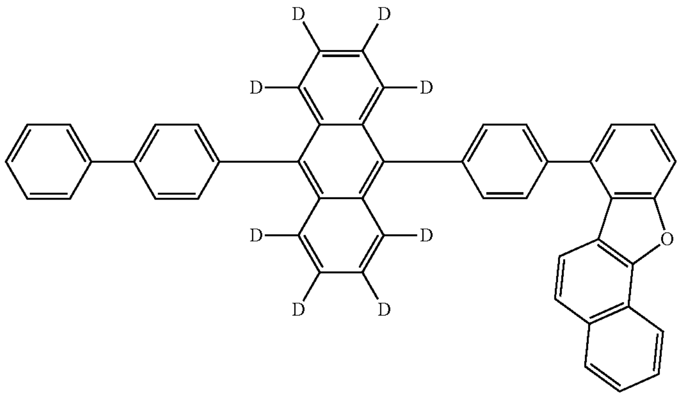

2-474

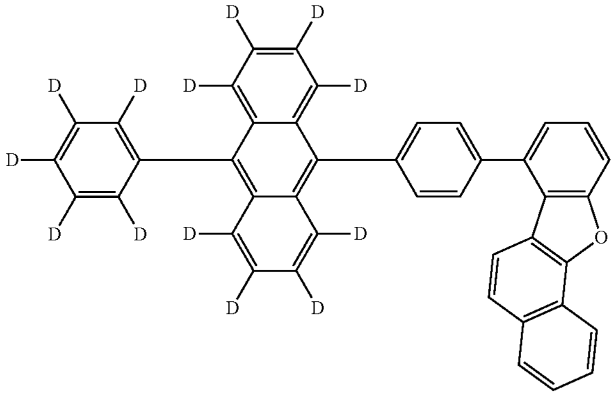

2-475

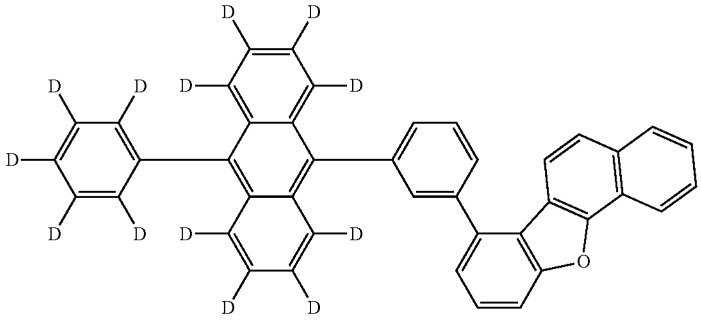

[Novel Compound]

Among the compound represented by the formula (2), a compound represented by the following formula (3-1) and a compound represented by the following formula (3-2) are novel compounds.

The compounds represented by the following formula (3-1) and the compound represented by the following formula (3-2) can be used as a second host material used in an emitting layer of an organic EL device of an aspect of the invention because naphthobenzofuran is bonded with an anthracene unit at a specific substitution position, the hole-injecting property is improved, the carrier balance is increased when used as a material for an organic EL device, and the deterioration of the emitting layer at the interface on the hole-transporting layer side is suppressed; therefore, extension of the lifetime of the device is expected. Alternatively, the compound can be used as a single host material of the emitting layer. By using the compound represented by the following formula (3-1) or the compound represented by the following formula (3-2), the lifetime of the organic EL device can be increased.

When a compound having a chemical structure represented by the following formula (3-1) or (3-2) and in which all hydrogen atoms are deuterium atoms is produced, variations in the ratio of deuteration may occur. On the other hand, in the compound of the invention, since only a specific side chain has a deuterium atom, variation in the ratio of deuteration hardly occurs. Since the compound represented by the following formula (3-1) and the compound represented by the following formula (3-2) have a uniform ratio of deuteration compared with the case where a compound in which all hydrogen atoms are deuterated is used, variation in quality of a device fabricated using the compound is reduced, and increase in yield of device fabrication can be expected.

<Compound Represented by Formula (3-1)>

The novel compound of an aspect of the invention is a compound represented by the following formula (3-1):

(3-1)

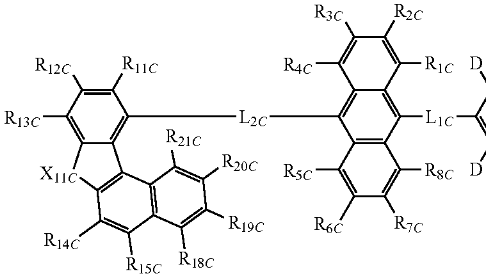

In the formula (3-1), $X_{11C}$ is an oxygen atom or a sulfur atom;

$L_{1C}$ and $L_{2C}$ are independently a single bond, a substituted or unsubstituted arylene group including 6 to 50 ring carbon atoms, or a substituted or unsubstituted divalent heterocyclic group including 5 to 50 ring atoms;

provided that hydrogen atoms possessed by $L_{1C}$ which is not a single bond may be a deuterium atom;

one or more sets of adjacent two or more of $R_{11C}$ to $R_{13C}$ form a substituted or unsubstituted, saturated or unsaturated ring by bonding with each other, or do not form a substituted or unsubstituted, saturated or unsaturated ring;

$R_{1C}$ to $R_{8C}$, $R_{14C}$, $R_{15C}$, and $R_{18C}$ to $R_{21C}$, and $R_{11C}$ to $R_{13C}$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when two or more of each of $R_{901}$ to $R_{907}$ are present, the two or more of each of $R_{901}$ to $R_{907}$ may be the same as or different from each other;

provided that in the case where $R_{1C}$ to $R_{8C}$, $R_{14C}$, $R_{15C}$, and $R_{18C}$ to $R_{21C}$, and $R_{11C}$ to $R_{13C}$ which do not form the substituted or unsubstituted, saturated or unsaturated ring are hydrogen atoms, the hydrogen atoms are not deuterium atoms;

hydrogen atoms possessed by $R_{1C}$ to $R_{8C}$, $R_{14C}$, $R_{15C}$, and $R_{18C}$ to $R_{21C}$ which are not hydrogen atoms, and $R_{11C}$ to $R_{13C}$ which do not form the substituted or unsubstituted, saturated or unsaturated ring are not deuterium atoms;

in the case where $R_{1C}$ to $R_{8C}$, $R_{14C}$, $R_{15C}$, and $R_{18C}$ to $R_{21C}$ which are not hydrogen atoms, and $R_{11C}$ to $R_{13C}$ which form a substituted or unsubstituted, saturated or unsaturated ring have an arbitrary substituent, hydrogen atoms possessed by the arbitrary substituent are not deuterium atoms;

hydrogen atoms possessed by the substituted or unsubstituted, saturated or unsaturated ring formed by bonding $R_{11C}$ to $R_{13C}$ to each other are not deuterium atoms; and in the case where the substituted or unsubstituted, saturated or unsaturated ring formed by bonding $R_{11C}$ to $R_{13C}$ to each other has an arbitrary substituent, hydrogen atoms possessed by the arbitrary substituent are not deuterium atoms.

In one embodiment, in the formula (3-1), $X_{11C}$ is an oxygen atom.

In one embodiment, in the formula (3-1), $L_{1C}$ and $L_{2C}$ are independently a single bond, a phenylene group, or a naphthylene group.

In one embodiment, in the formula (3-1), $L_{2C}$ is a single bond.

In one embodiment, in the formula (3-1), $R_{1C}$ to $R_{9C}$ are hydrogen atoms.

In one embodiment, in the formula (3-1), $R_{11C}$ to $R_{15C}$ and $R_{18C}$ to $R_{21C}$ are hydrogen atoms.

Hereinafter, specific examples of the compound represented by the formula (3-1) will be described, but are illustrative only, and the compound represented by the formula (3-1) is not limited to the following specific examples.

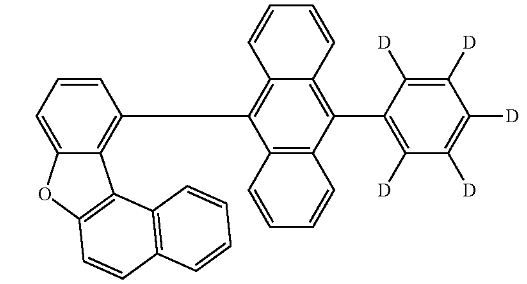

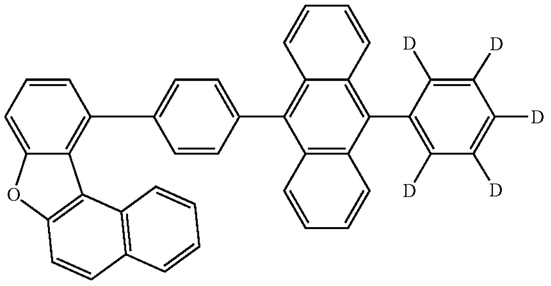

-continued
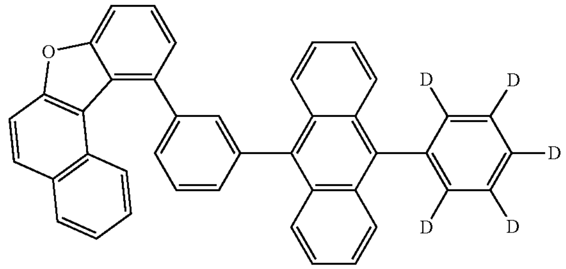
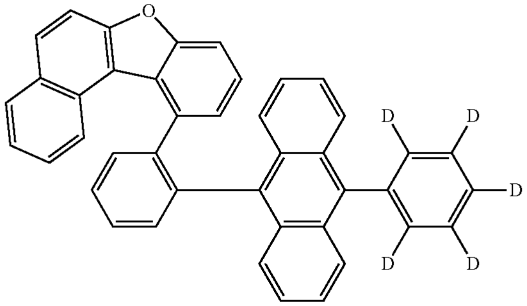
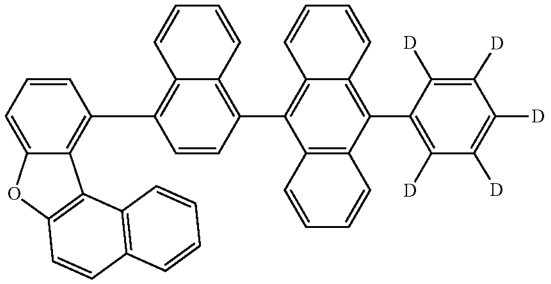
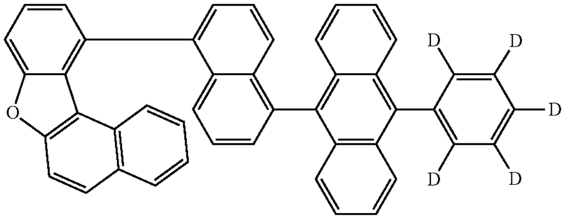
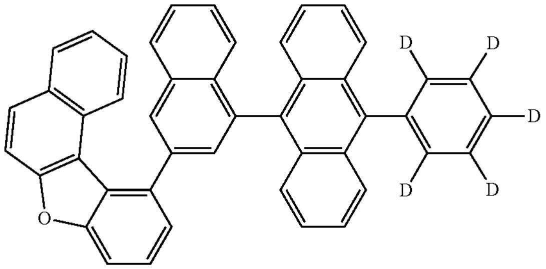
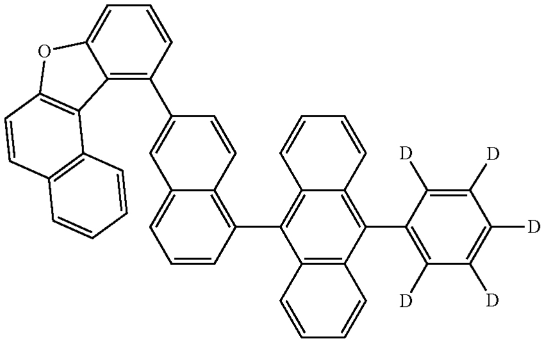
-continued
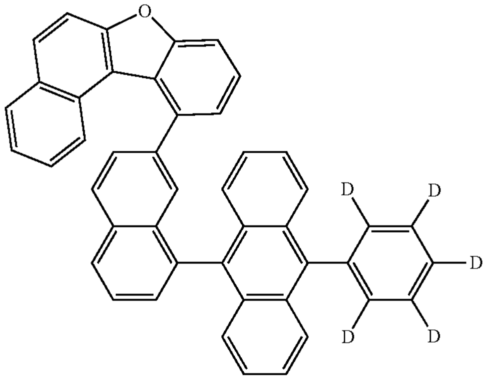
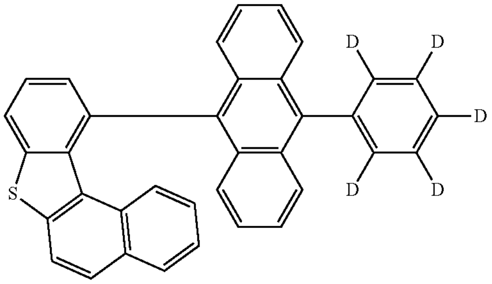
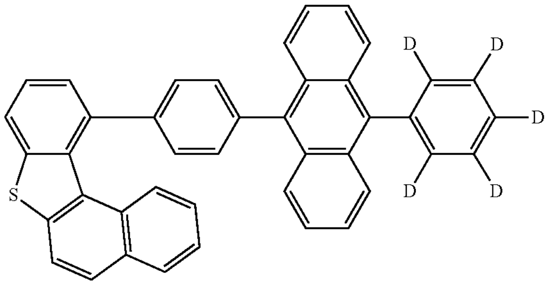
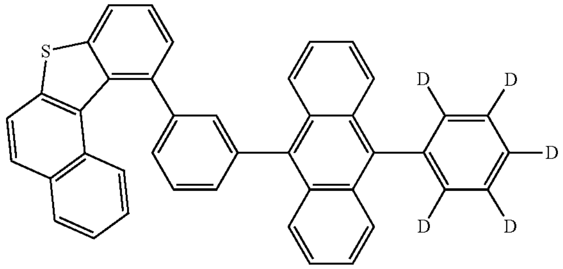
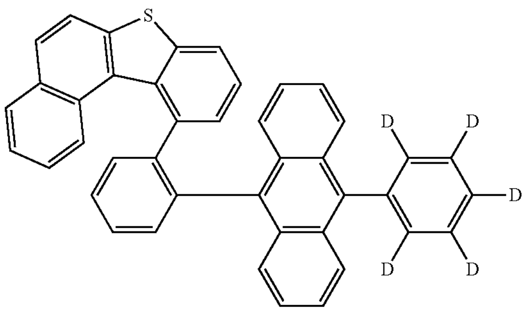

-continued

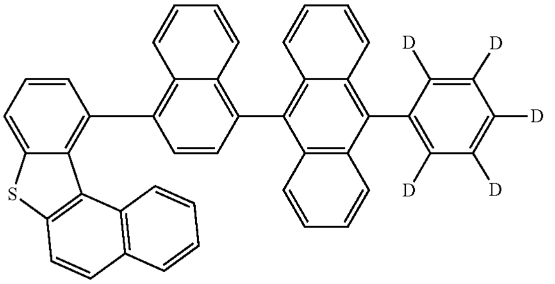

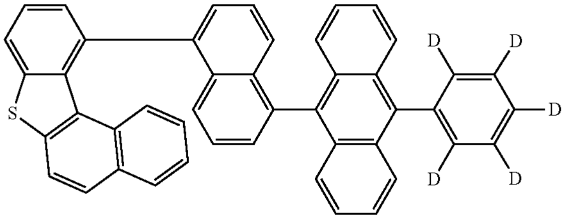

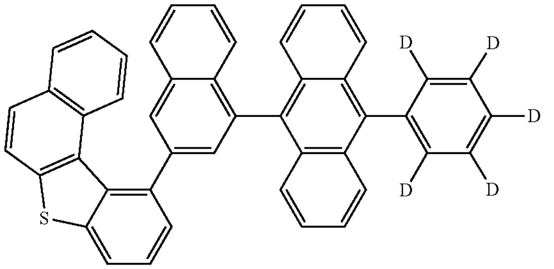

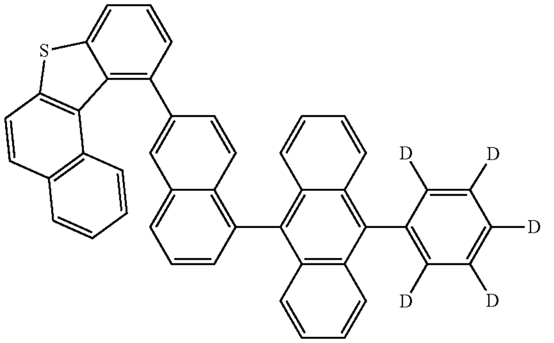

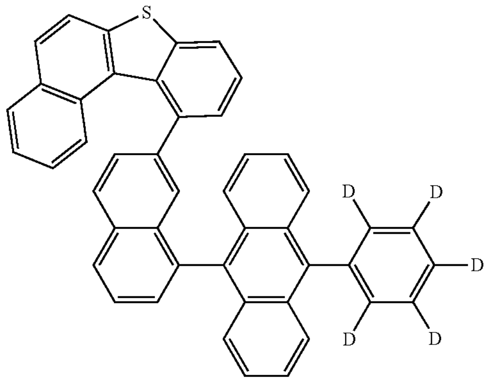

<Compound Represented by Formula (3-2)>

A novel compound of another aspect of the invention is a compound represented by the following formula (3-2):

(3-2)

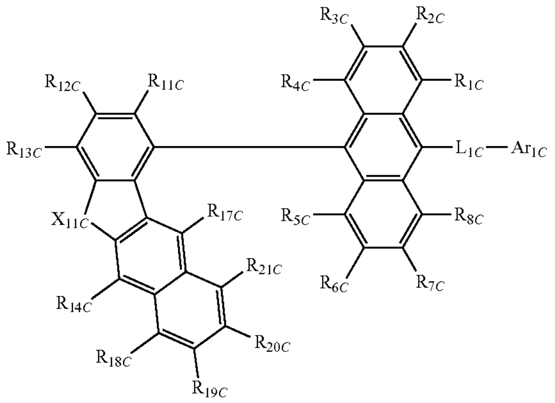

In in the formula (3-2), $X_{11C}$ is an oxygen atom or a sulfur atom;

$L_{1C}$ is a single bond, a substituted or unsubstituted arylene group including 6 to 50 ring carbon atoms, or a substituted or unsubstituted divalent heterocyclic group including 5 to 50 ring atoms;

$Ar_{1C}$ is a substituted or unsubstituted aryl group including 6 to 50 ring carbon atoms, or a substituted or unsubstituted monovalent heterocyclic group including 5 to 50 ring atoms;

provided that at least one hydrogen atom possessed by the group of $-L_{1C}-Ar_{1C}$ is a deuterium atom;

one or more sets of adjacent two or more of $R_{11C}$ to $R_{13C}$ form a substituted or unsubstituted, saturated or unsaturated ring by bonding with each other, or do not form a substituted or unsubstituted, saturated or unsaturated ring;

$R_{1C}$ to $R_{8C}$, $R_{14C}$, and $R_{17C}$ to $R_{21C}$, and $R_{11C}$ to $R_{13C}$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when two or more of each of $R_{901}$ to $R_{907}$ are present, the two or more of each of $R_{901}$ to $R_{907}$ may be the same as or different from each other;

provided that in the case where $R_{1C}$ to $R_{8C}$, $R_{14C}$, and $R_{17C}$ to $R_{21C}$, and $R_{11C}$ to $R_{13C}$ which do not form the substituted or unsubstituted, saturated or unsaturated ring are hydrogen atoms, the hydrogen atoms are not deuterium atoms;

hydrogen atoms possessed by $R_{1C}$ to $R_{8C}$, $R_{14C}$ and $R_{17C}$ to $R_{21C}$ which are not hydrogen atoms, and $R_{11C}$ to $R_{13C}$ which do not form substituted or unsubstituted, saturated or unsaturated rings, are not deuterium atoms;

in the case where $R_{1C}$ to $R_{8C}$, $R_{14C}$, and $R_{17C}$ to $R_{21C}$ which are not hydrogen atoms, and $R_{11C}$ to $R_{13C}$ which do not form the substituted or unsubstituted, saturated or unsaturated ring and have an arbitrary substituent, hydrogen atoms possessed by the arbitrary substituent are not deuterium atoms;

hydrogen atoms possessed by the substituted or unsubstituted, saturated or unsaturated ring formed by bonding $R_{11C}$ to $R_{13C}$ to each other are not deuterium atoms; and in the case where the substituted or unsubstituted, saturated or unsaturated ring formed by bonding $R_{11C}$ to $R_{13C}$ to each other has an arbitrary substituent, hydrogen atoms possessed by the arbitrary substituent are not deuterium atoms.

In one embodiment, the compound represented by the formula (3-2) is a compound represented by the following formula (3-2-1).

(3-2-1)

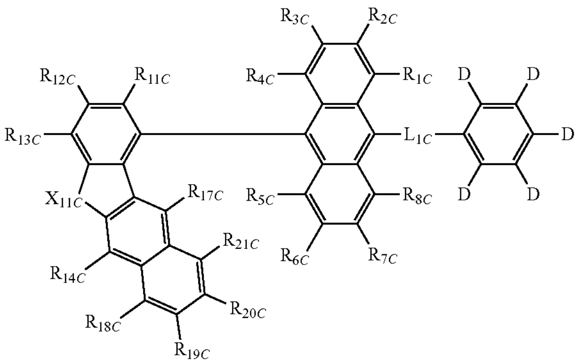

In the formula (3-2-1), $X_{11C}$, $R_{11C}$ to $R_{14C}$, $R_{17C}$ to $R_{21C}$, $R_{1C}$ to $R_{8C}$, and $L_{1C}$ are as defined in the formula (3-2).

In one embodiment, in the formula (3-2-1), $L_{1C}$ is a single bond or an unsubstituted arylene group including 6 to 50 ring carbon atoms.

In one embodiment, in the formula (3-2-1), $L_{1C}$ is a single bond, an unsubstituted phenylene group, or an unsubstituted naphthylene group.

In one embodiment, in the formula (3-2), $X_{11C}$ is an oxygen atom.

In one embodiment, the compound represented by the formula (3-2) is a compound represented by the following formula (3-2-2).

(3-2-2)

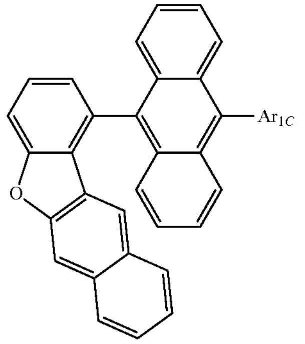

In the formula (3-2-2), $Ar_{1C}$ is as defined in the formula (3-2).

In one embodiment, $Ar_{1C}$ in the formula (3-2) is a —$C_6D_5$ group.

Hereinafter, specific examples of the compound represented by the formula (3-2) will be described, but are illustrative only, and the compound represented by the formula (3-2) is not limited to the following specific examples.

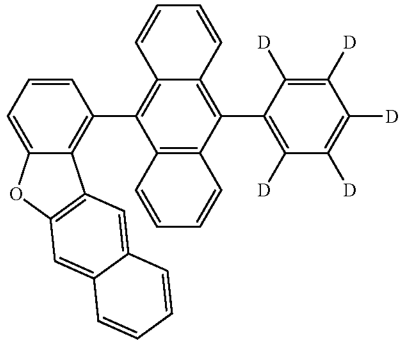

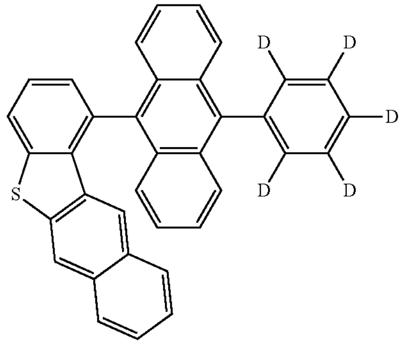

The compound represented by the formula (3-1) and the compound represented by the formula (3-2) can be synthesized in accordance with the synthetic methods described in Synthesis Examples by using known alternative reactions or raw materials tailored to the target compound.

(Dopant Material)

The dopant material used in the emitting layer of the organic EL device of an aspect of the invention is one or more compounds selected from the group consisting of a compound represented by the following formula (11), a compound represented by the following formula (21), a compound represented by the following formula (31), a compound represented by the following formula (41), a compound represented by the following formula (51), a compound represented by the following formula (61), a compound represented by the following formula (71), and a compound represented by the following formula (81).

(Compound Represented by Formula (11))

The compound represented by the formula (11) is explained below.

(11)

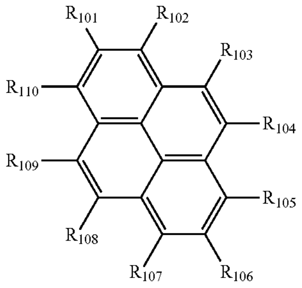

In the formula (11), one or more sets of adjacent two or more of $R_{101}$ to $R_{110}$ form a substituted or unsubstituted, saturated or unsaturated ring by bonding with each other, or do not form a substituted or unsubstituted, saturated or unsaturated ring;

at least one of $R_{101}$ to $R_{110}$ is a monovalent group represented by the following formula (12);

$R_{101}$ to $R_{110}$ that do not form the substituted or unsubstituted, saturated or unsaturated ring and that are not a monovalent group represented by the following formula (12) are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formula (1).

(12)

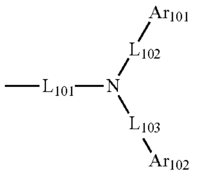

In the formula (12), $Ar_{101}$ and $Ar_{102}$ are independently a substituted or unsubstituted aryl group including 6 to 50 ring carbon atoms, or a substituted or unsubstituted monovalent heterocyclic group including 5 to 50 ring atoms; and $L_{101}$ to $L_{103}$ are independently a single bond, a substituted or unsubstituted arylene group including 6 to 30 ring carbon atoms, or a substituted or unsubstituted divalent heterocyclic group including 5 to 30 ring atoms.

In the formula (11), it is preferable that two of $R_{101}$ to $R_{110}$ are the group represented by the formula (12).

In one embodiment, the compound represented by the formula (11) is a compound represented by the following formula (13).

(13)

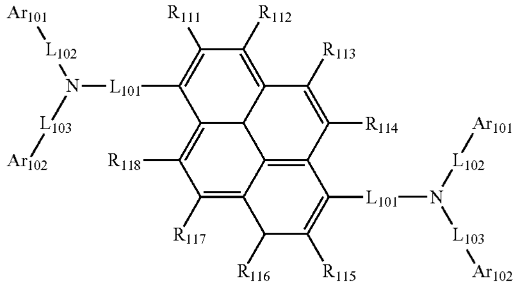

In the formula (13), $R_{111}$ to $R_{118}$ are the same as $R_{101}$ to $R_{110}$ that are not the monovalent group represented by the formula (12) in the formula (11); and $Ar_{101}$, $Ar_{102}$, $L_{101}$, $L_{102}$ and $L_{103}$ are as defined in the formula (12).

In the formula (11), $L_{101}$ is preferably a single bond and $L_{102}$ and $L_{103}$ are preferably a single bond.

In one embodiment, the compound represented by the formula (11) is a compound represented by the following formula (14) or (15).

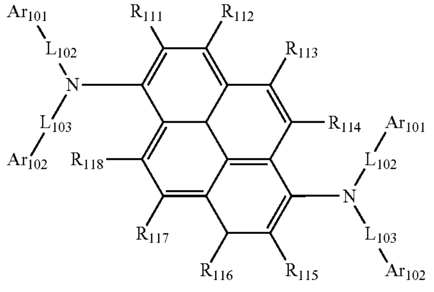

In the formula (14), $R_{111}$ to $R_{118}$ are as defined in the formula (13); and $Ar_{101}$, $Ar_{102}$, $L_{102}$ and $L_{103}$ are as defined in the formula (12).

(15)

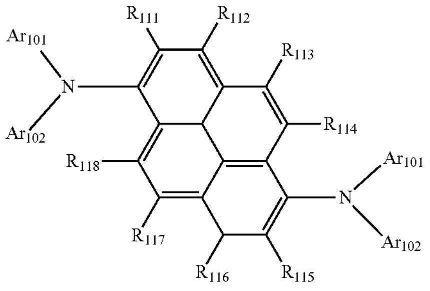

In the formula (15), $R_{111}$ to $R_{118}$ are as defined in the formula (13); and $Ar_{101}$ and $Ar_{102}$ are as defined in the formula (12).

In the formula (11) and the formula (12), it is preferable that at least one of $Ar_{101}$ and $Ar_{102}$ is a group represented by the following formula (16).

(16)

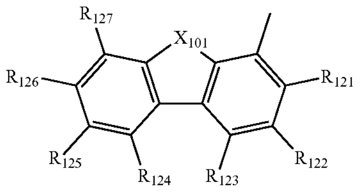

In the formula (16), $X_{101}$ is an oxygen atom or a sulfur atom;

one or more sets of adjacent two or more of $R_{121}$ to $R_{127}$ form a substituted or unsubstituted, saturated or unsaturated ring by bonding with each other, or do not form a substituted or unsubstituted, saturated or unsaturated ring:

$R_{121}$ to $R_{127}$ that do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formulas (1).

It is preferable that $X_{101}$ is an oxygen atom.

It is preferable that at least one of $R_{121}$ to $R_{127}$ is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

It is preferable that in the formula (11) and the formula (12), $Ar_{101}$ is the group represented by the formula (16) and $Ar_{102}$ is a substituted or unsubstituted aryl group including 6 to 50 ring carbon atoms.

In one embodiment, the compound represented by the formula (11) is a compound represented by the following formula (17).

(17)

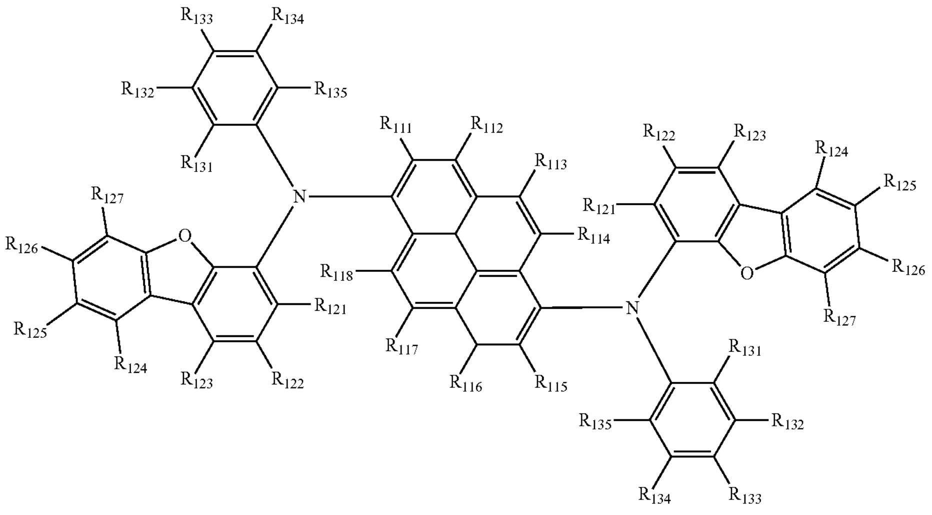

In the formula (17), $R_{111}$ to $R_{118}$ are as defined in the formula (13), and $R_{121}$ to $R_{127}$ are as defined in the formula (16);

$R_{131}$ to $R_{135}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formulas (1).

As the compound represented by the formula (11), the following compounds can be given as specific examples, for example. In the following specific examples, Me represents a methyl group.

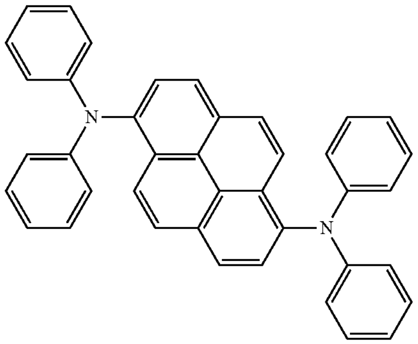

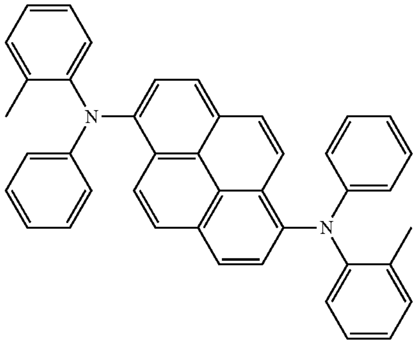

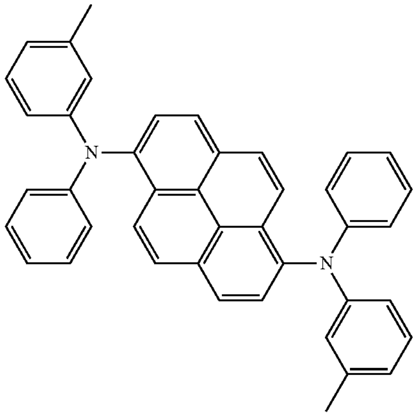

-continued

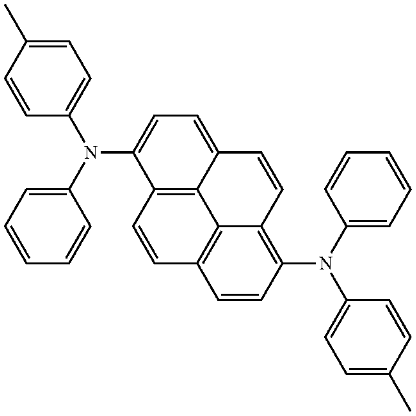

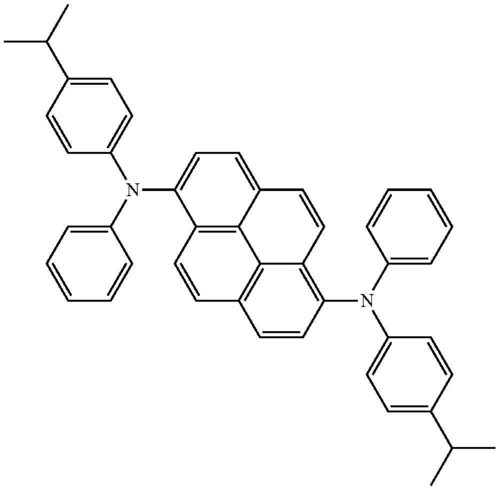

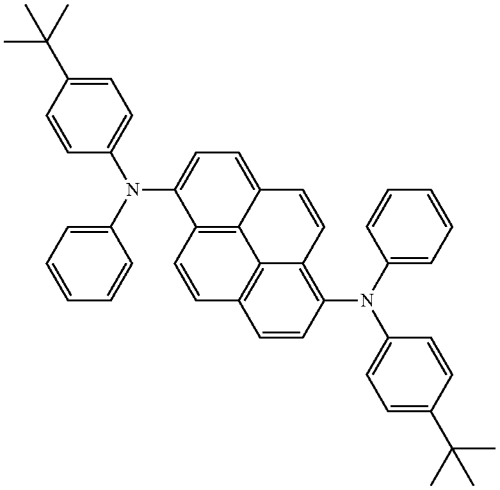

-continued
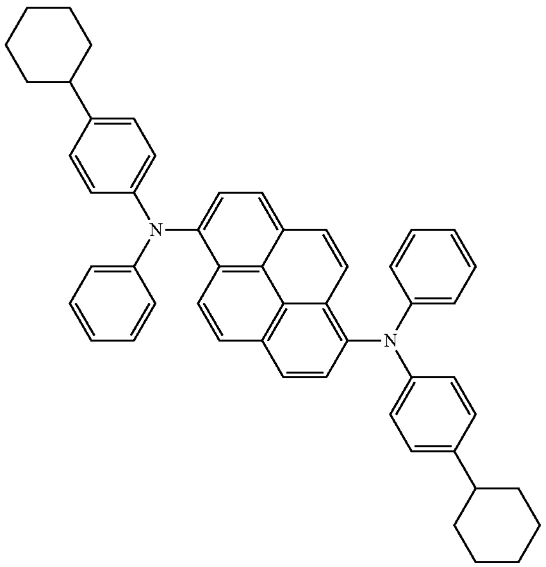
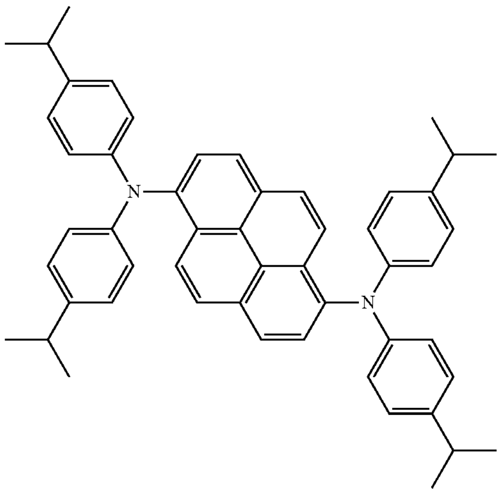
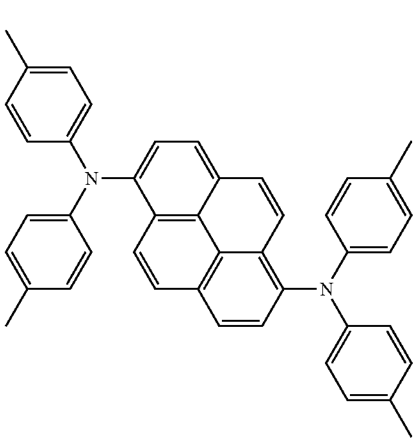
-continued
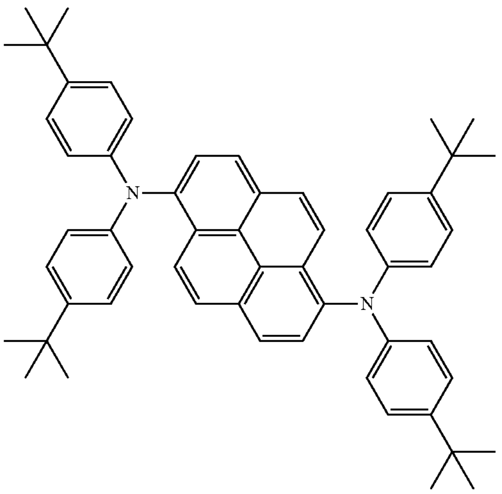
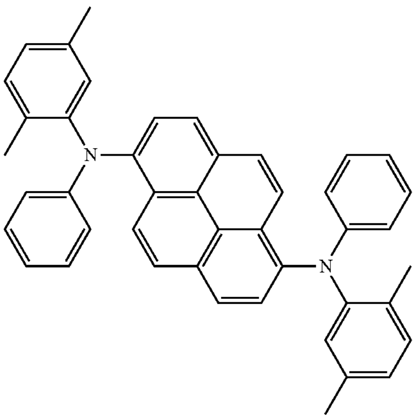
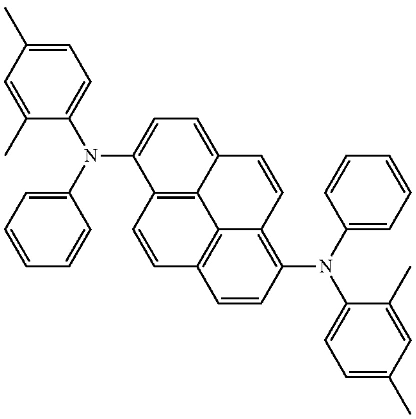

-continued
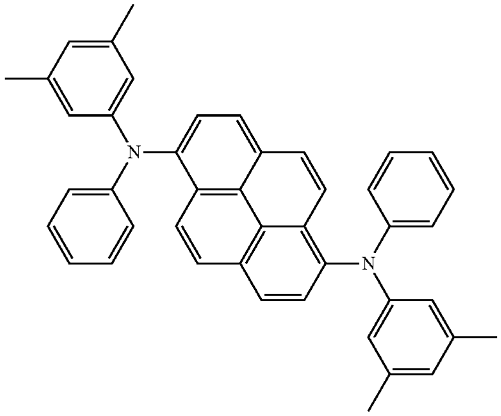
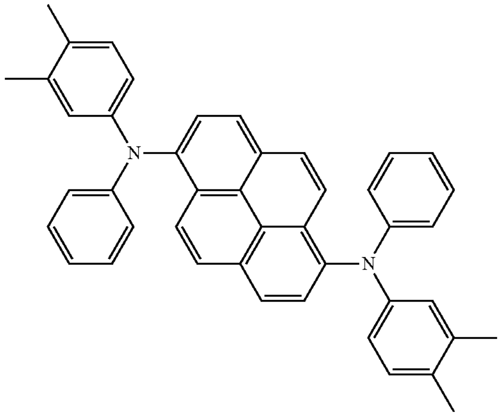
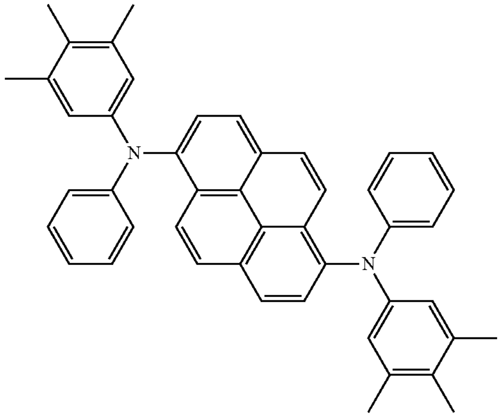
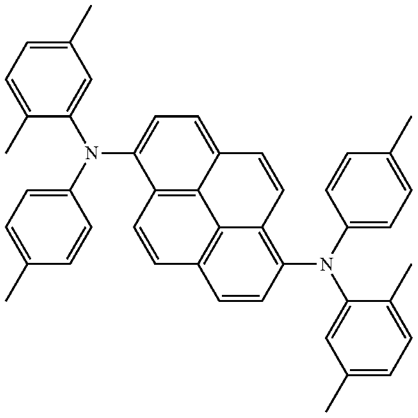
-continued
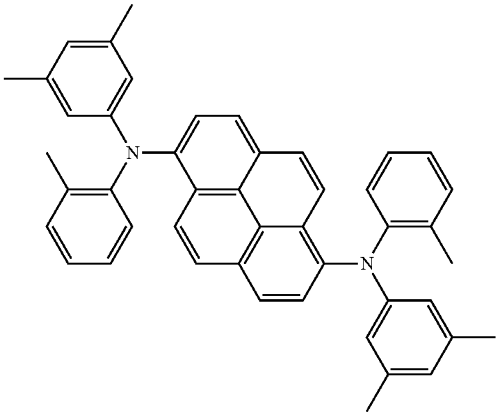
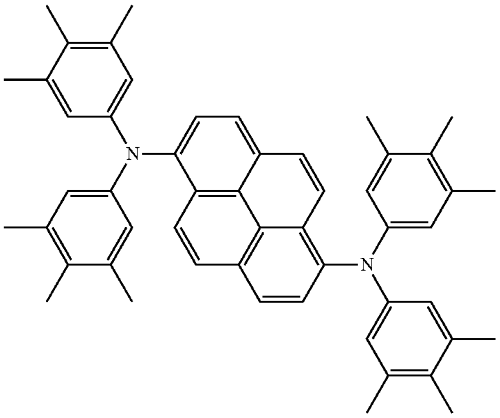
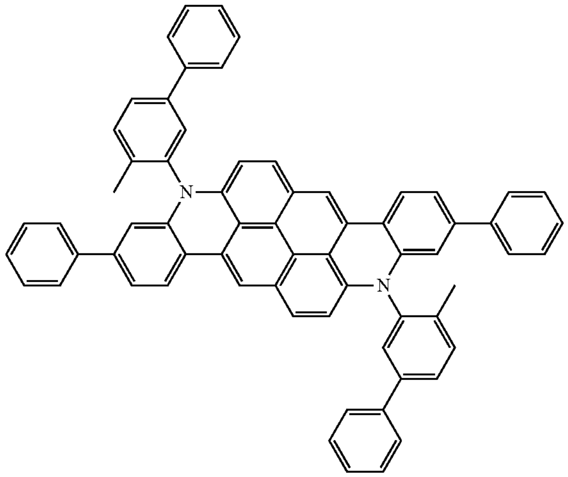

-continued
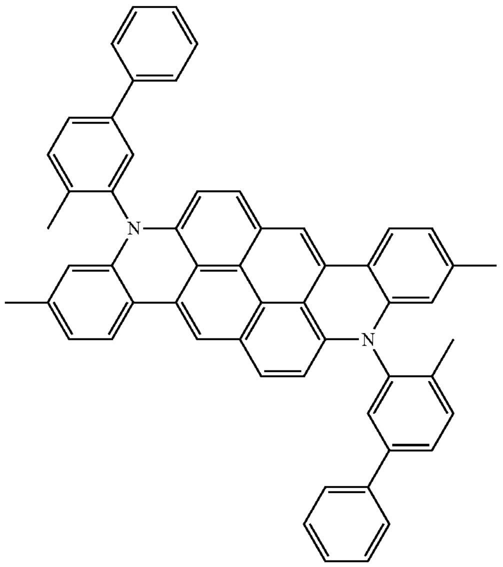
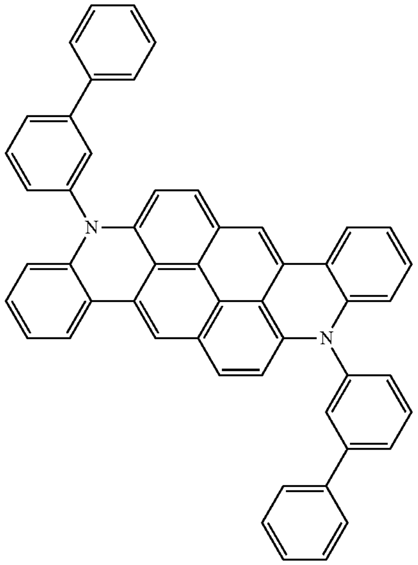
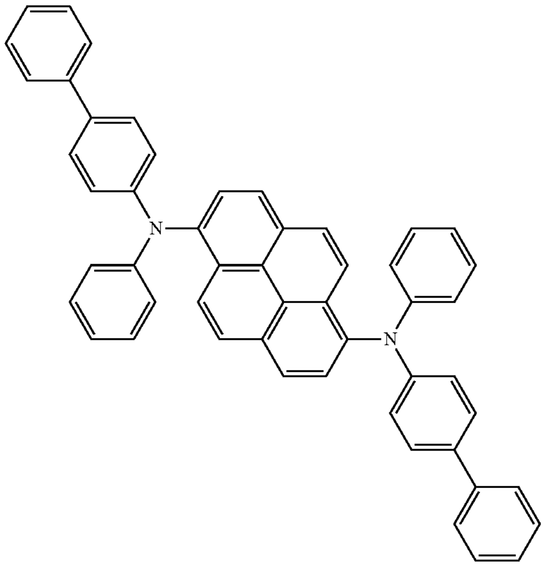
-continued
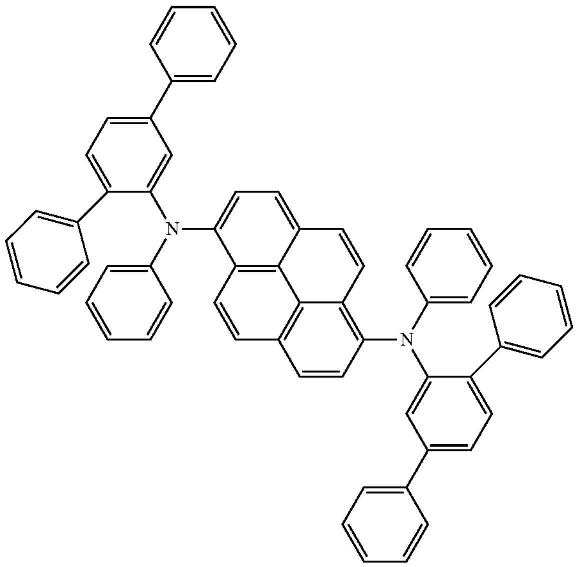
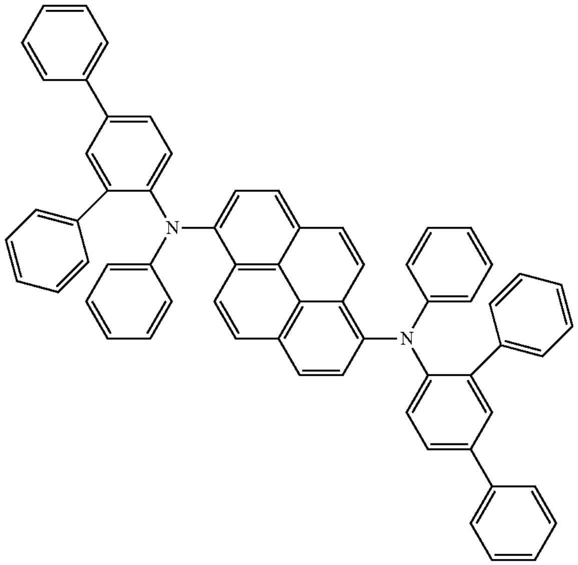
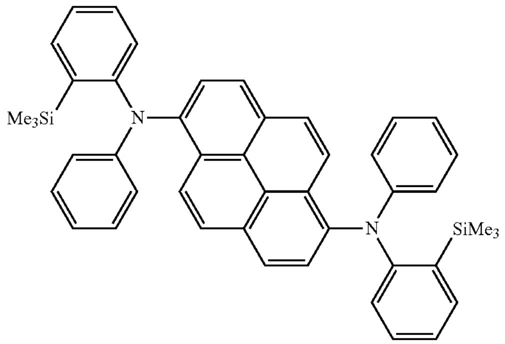

-continued
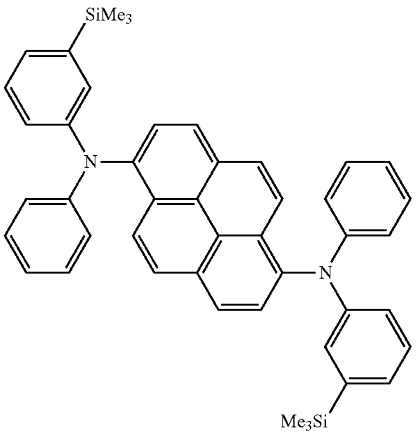
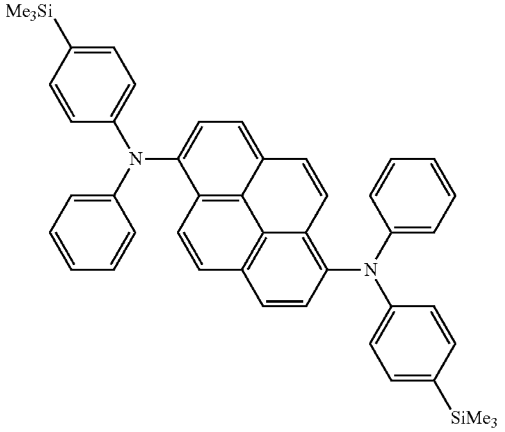
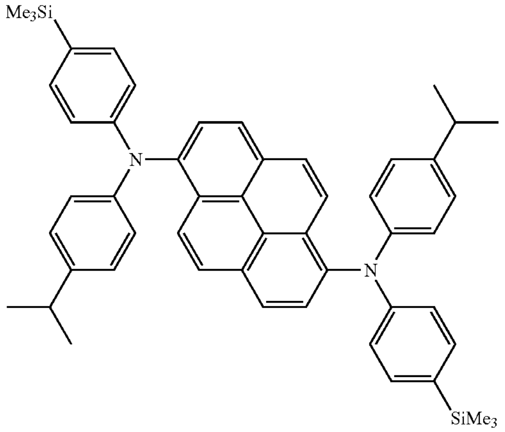
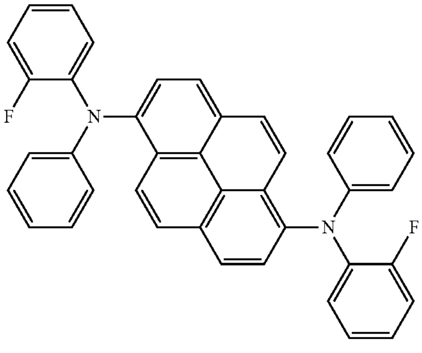
-continued
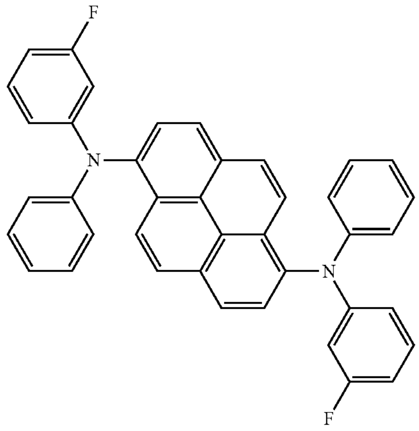
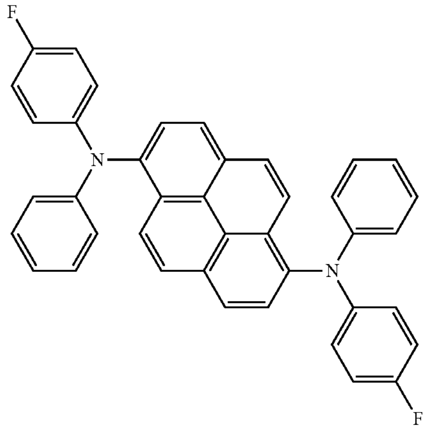
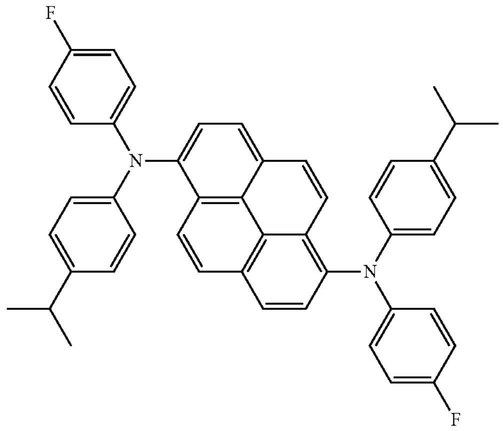
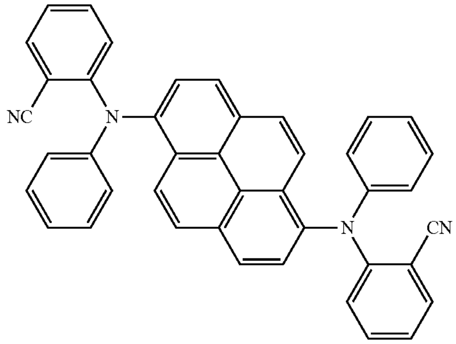

-continued
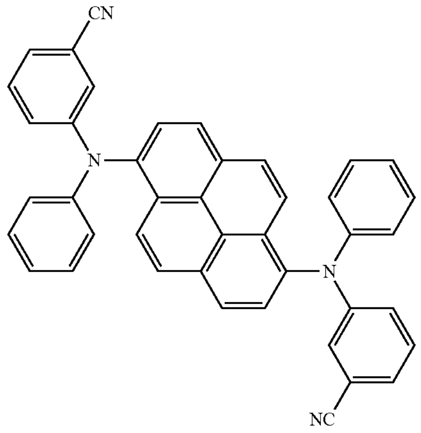
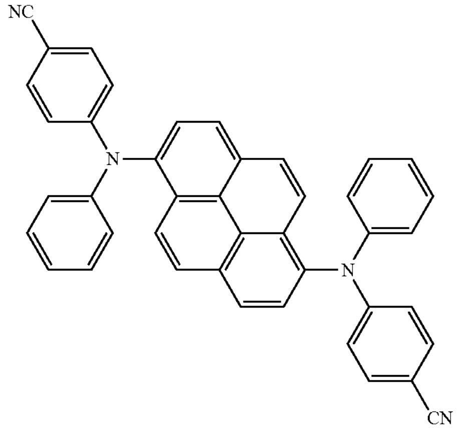
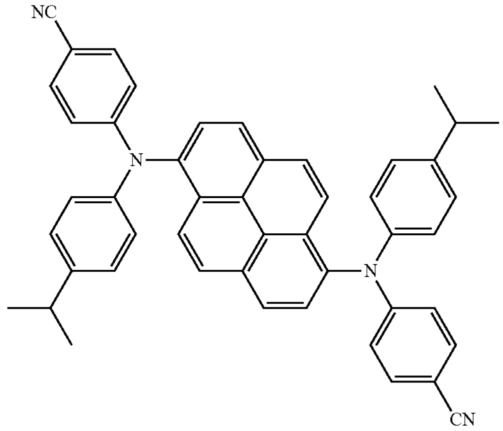
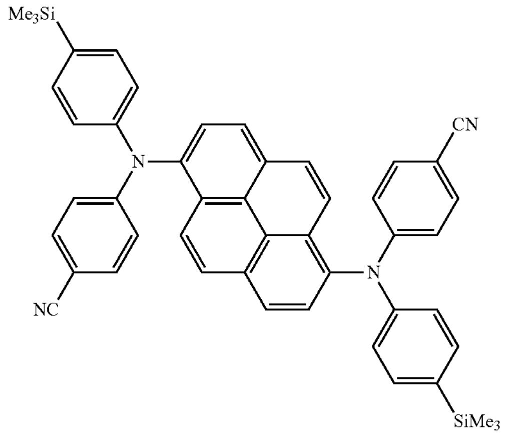
-continued
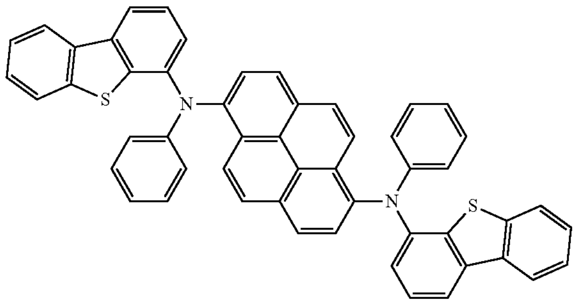
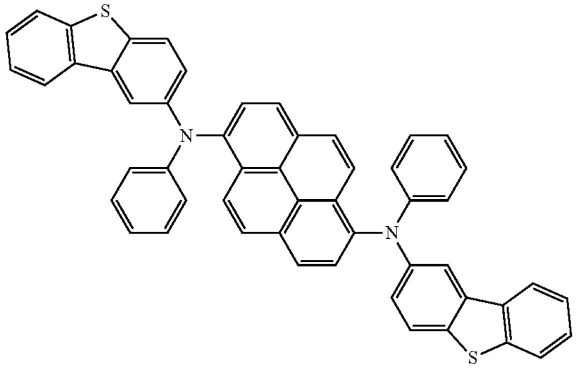
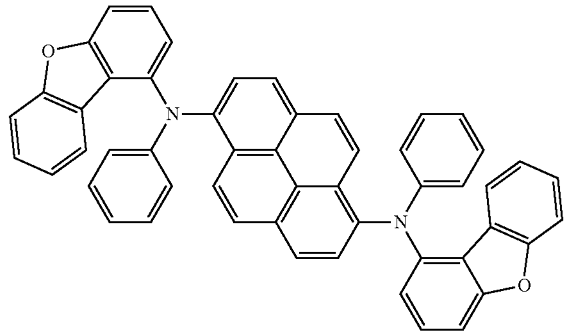
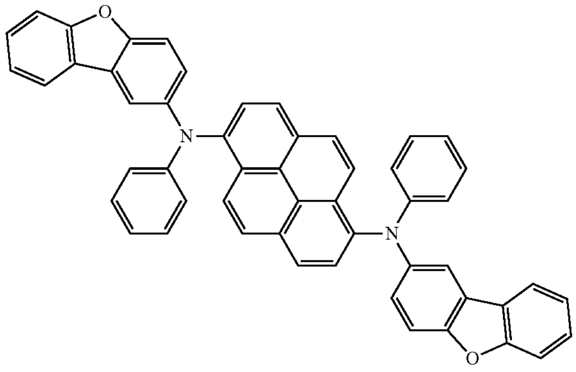
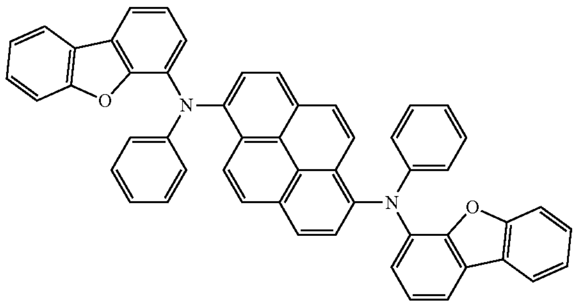

-continued
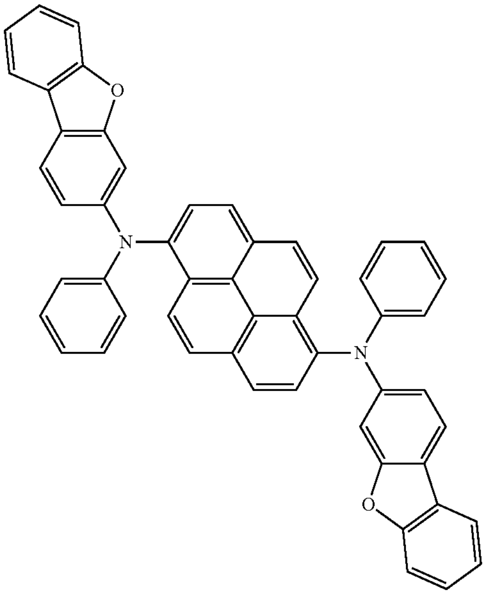
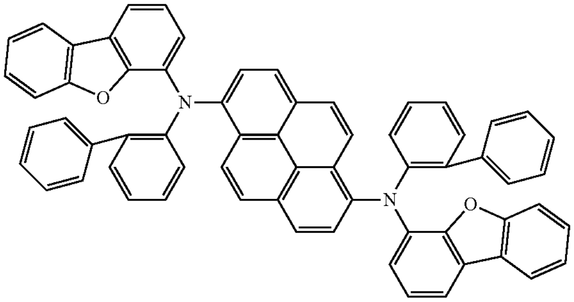
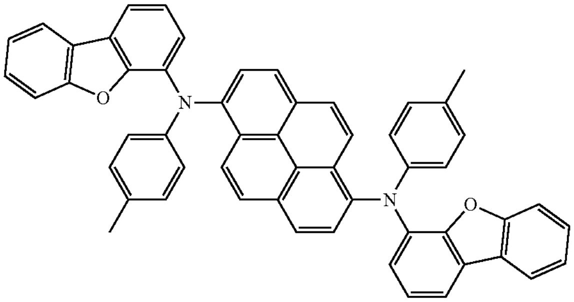
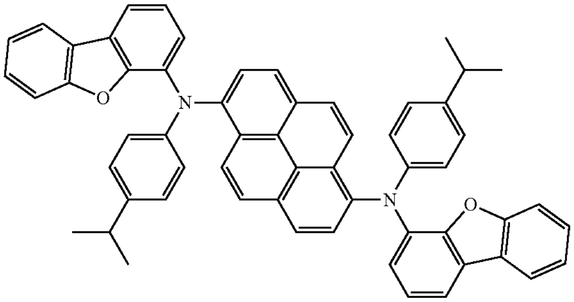
-continued
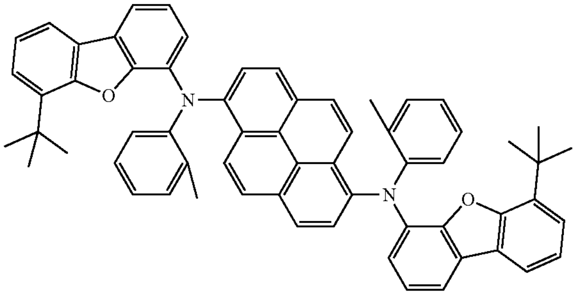
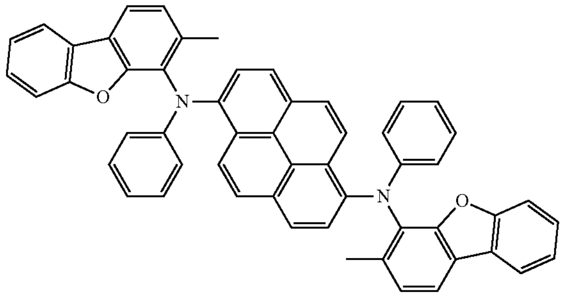
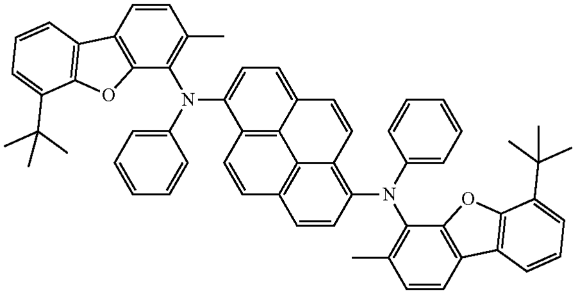
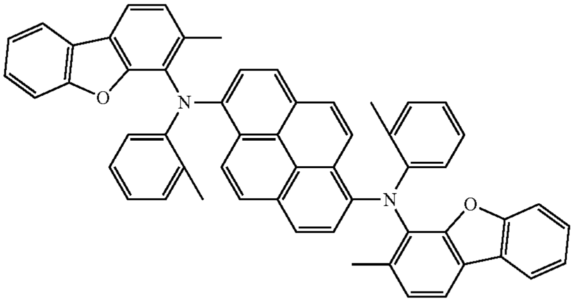
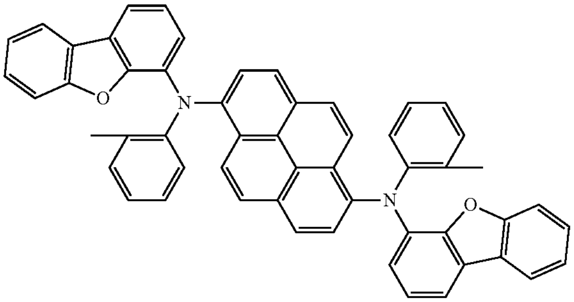

-continued
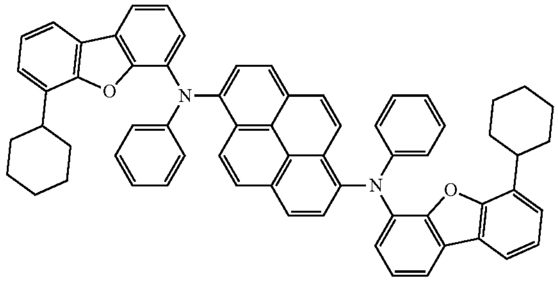
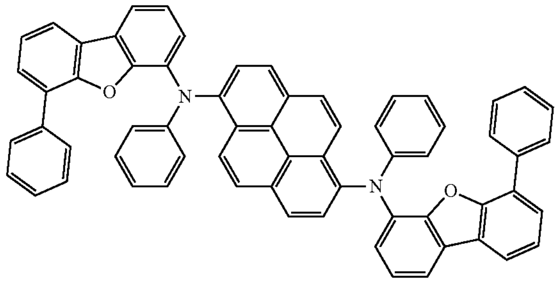
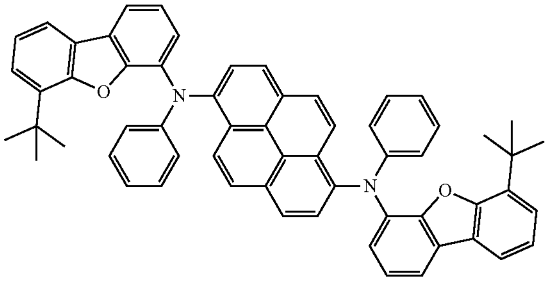
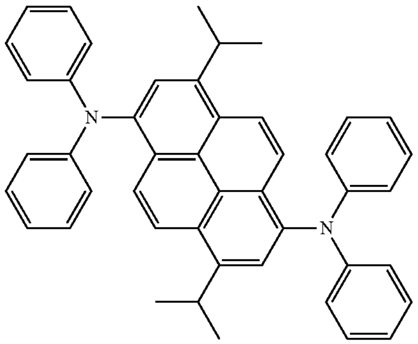
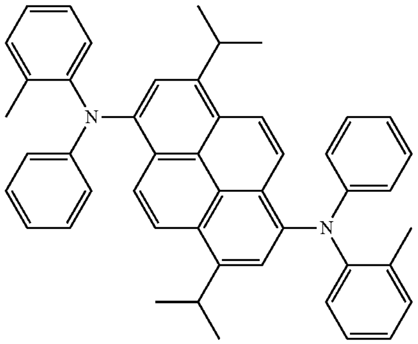
-continued
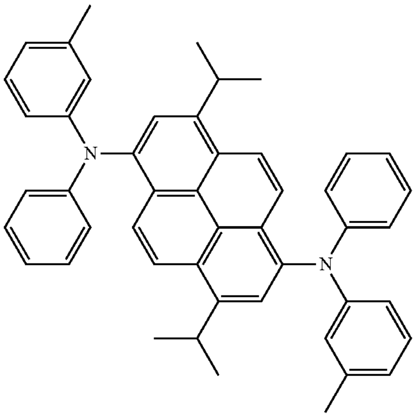
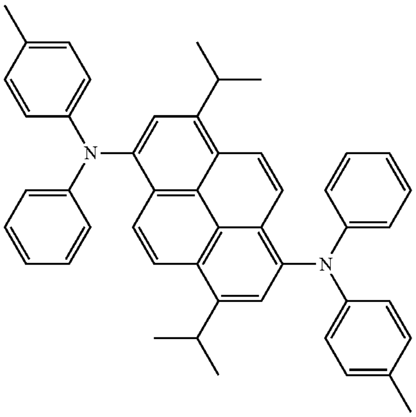
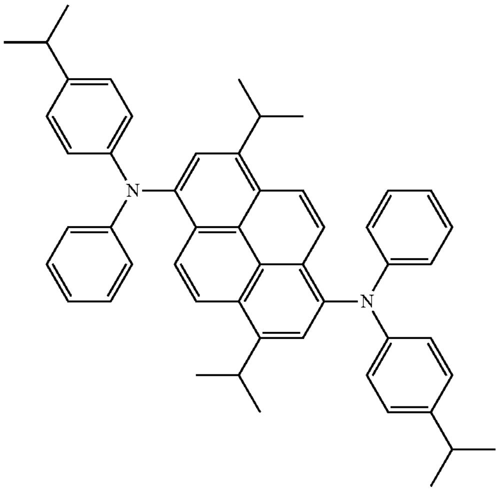

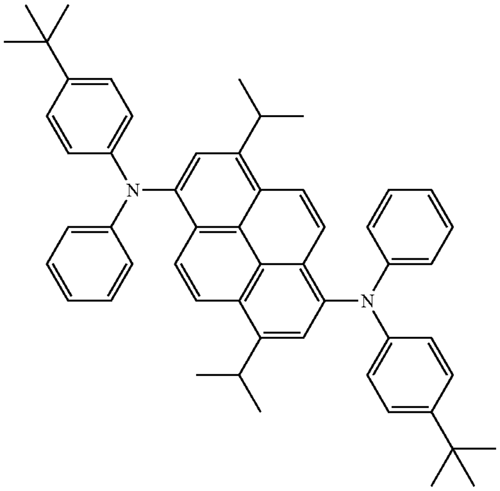
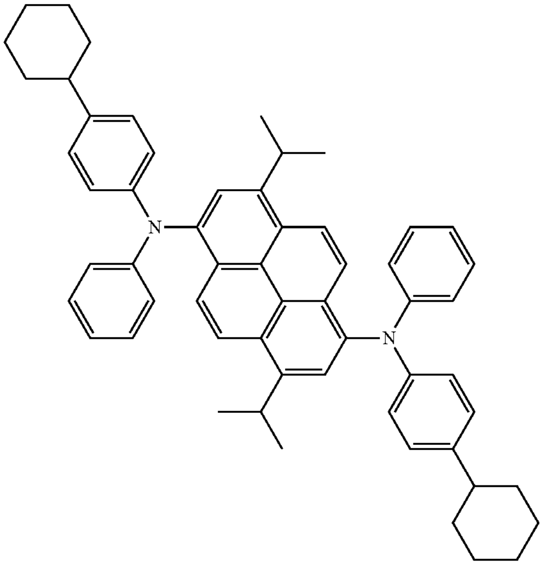
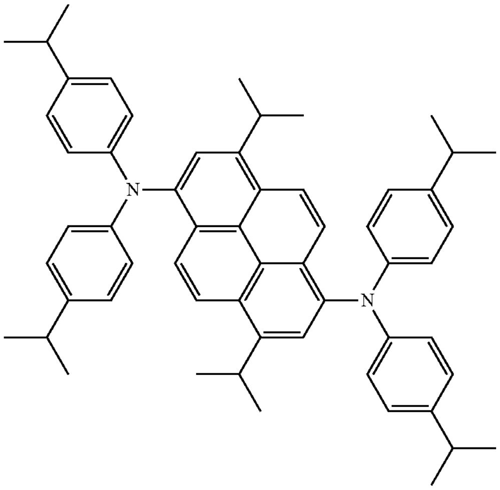
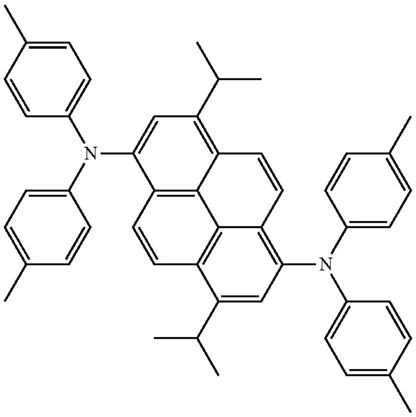
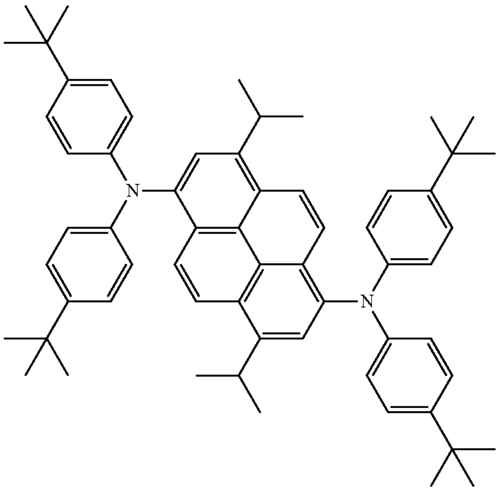
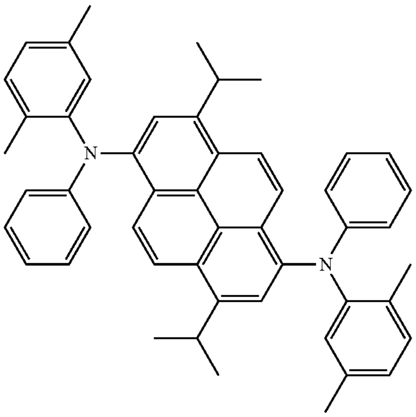

-continued
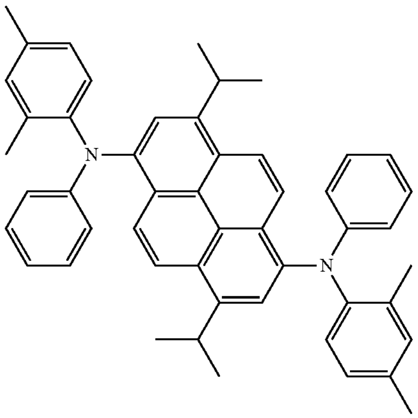
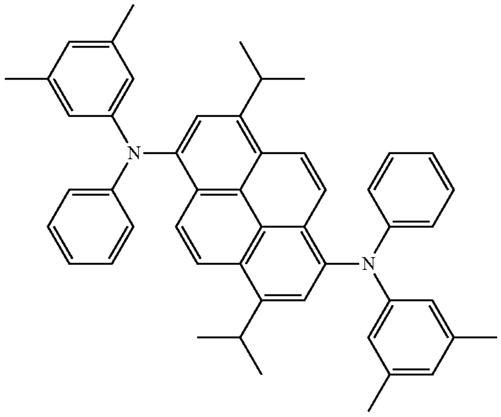
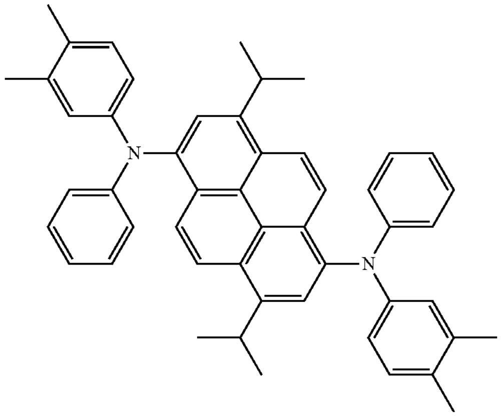
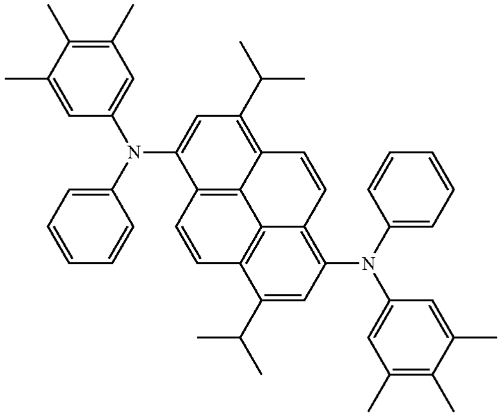
-continued
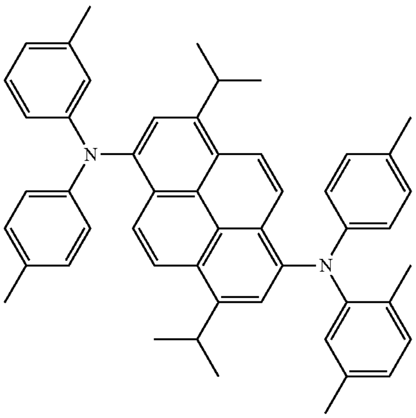
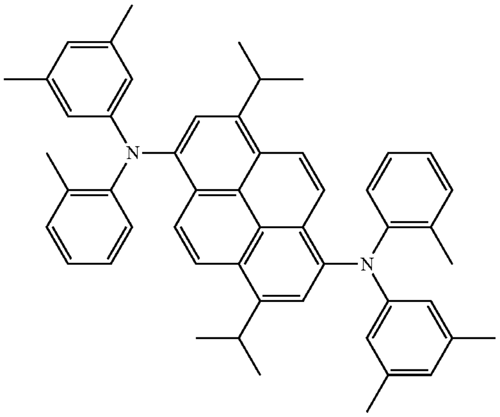
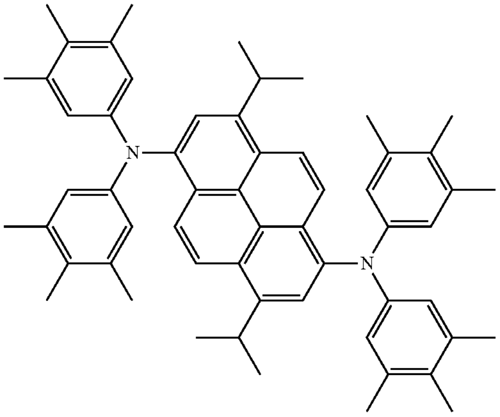
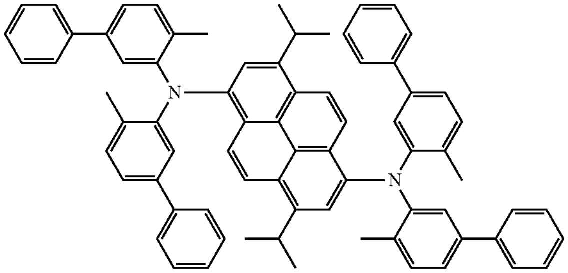

-continued
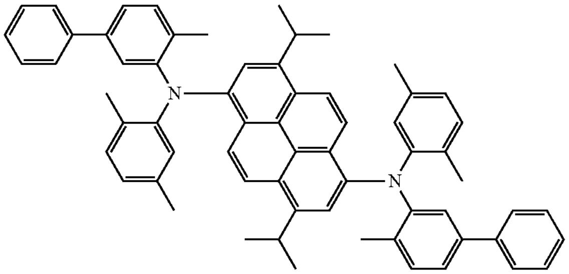
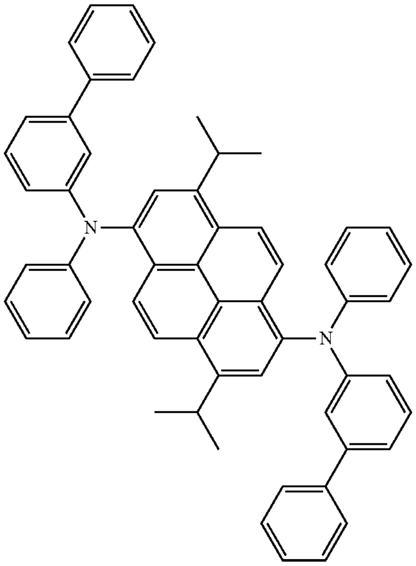
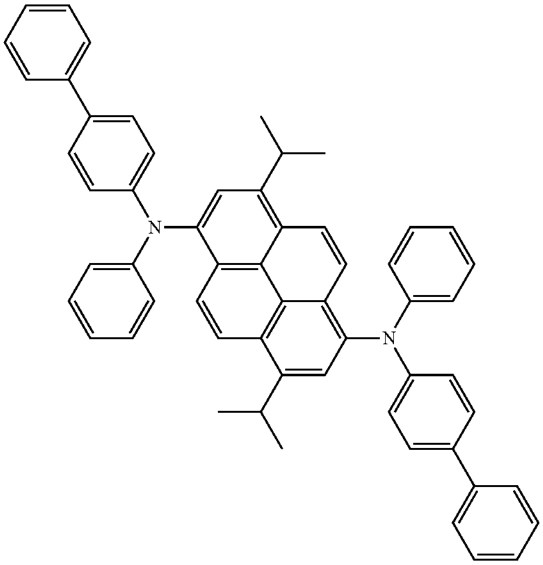
-continued
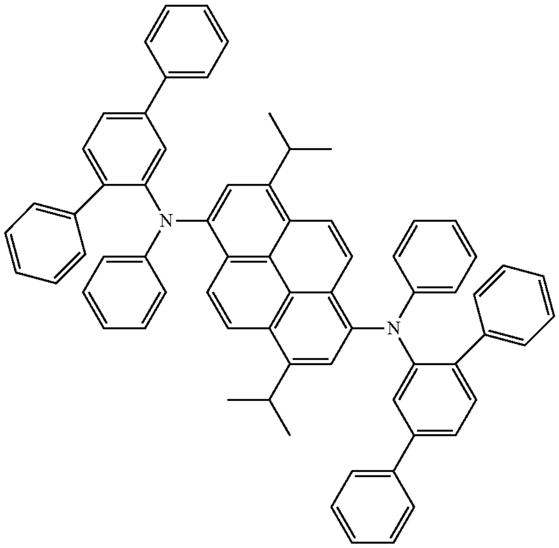
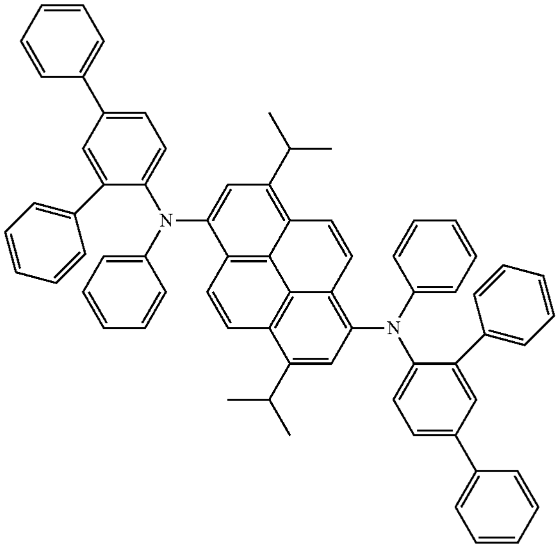
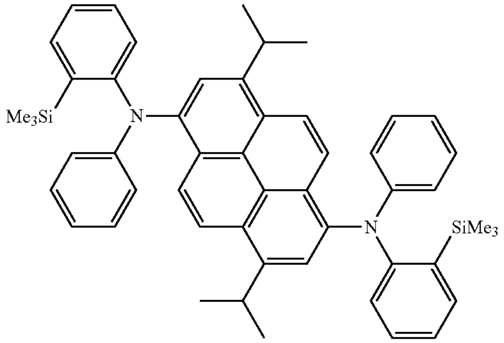

-continued
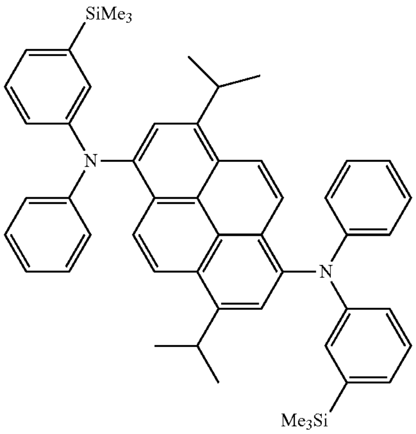
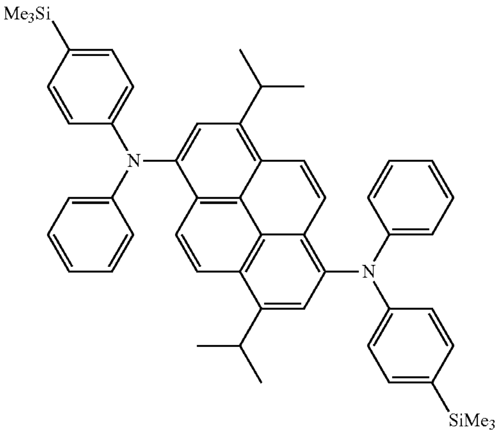
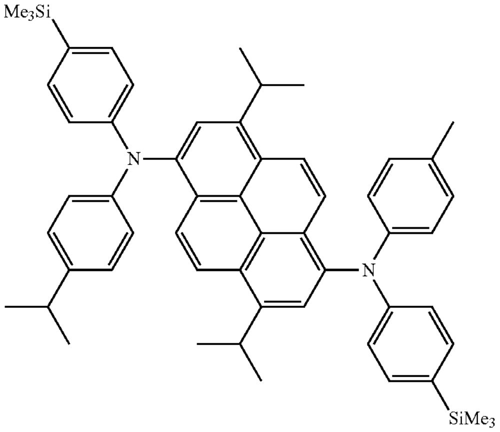
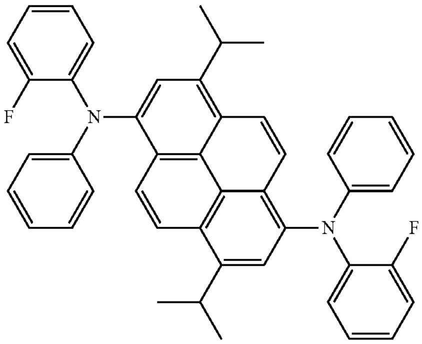
-continued
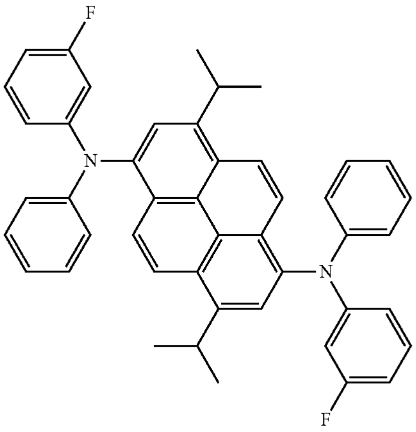
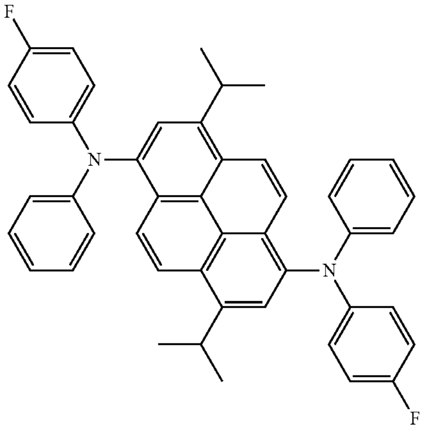
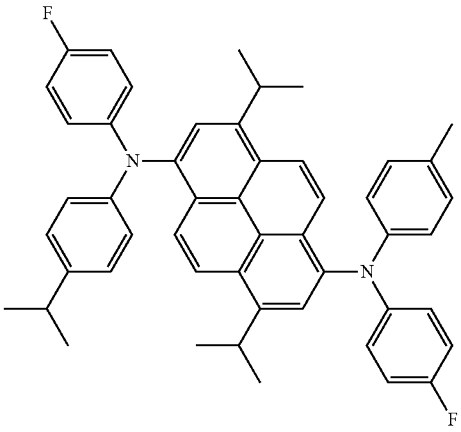
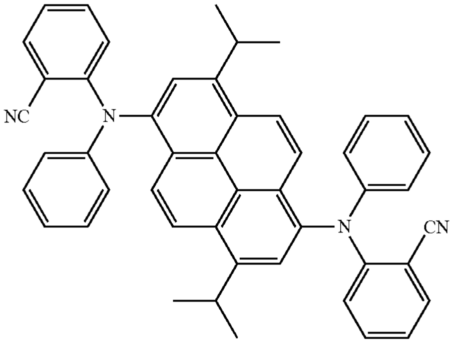

-continued
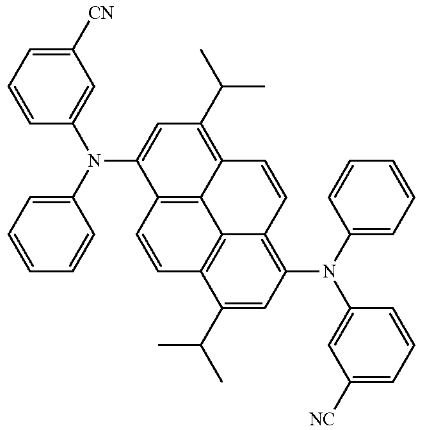
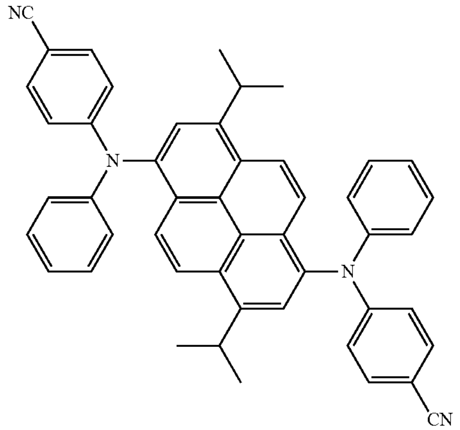
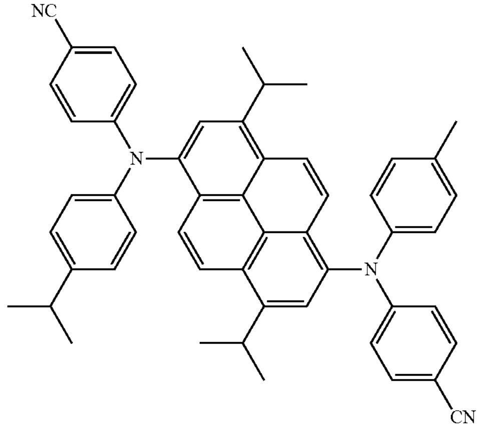
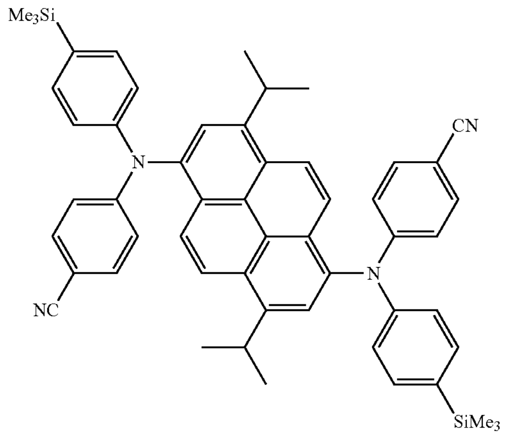
-continued
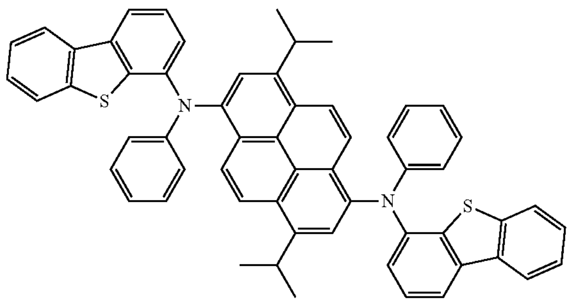
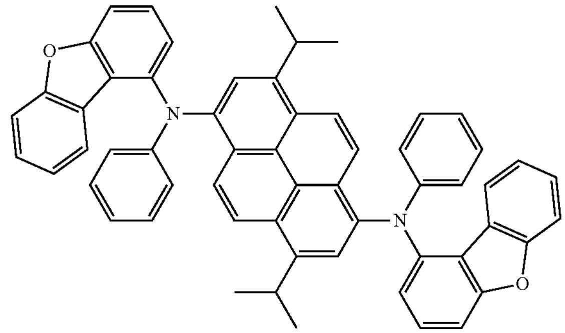
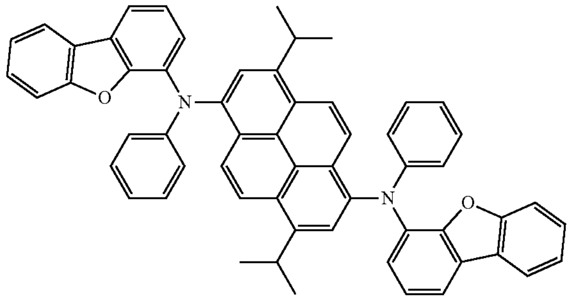
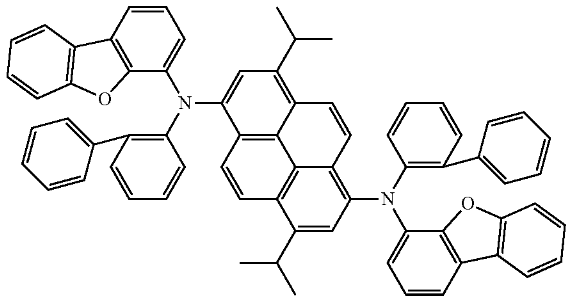
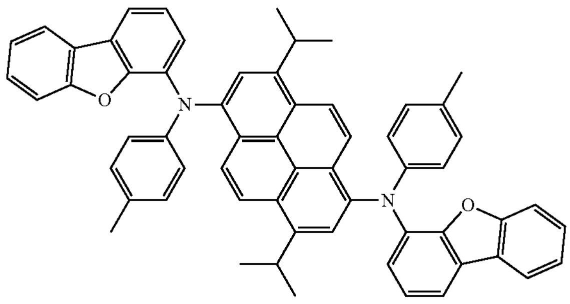

-continued
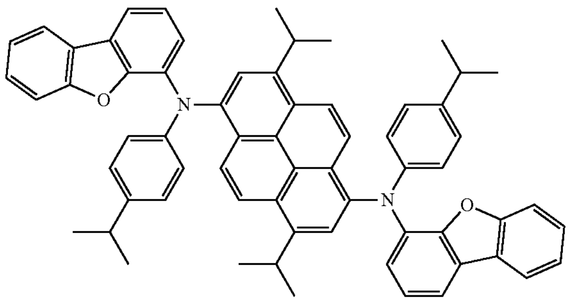
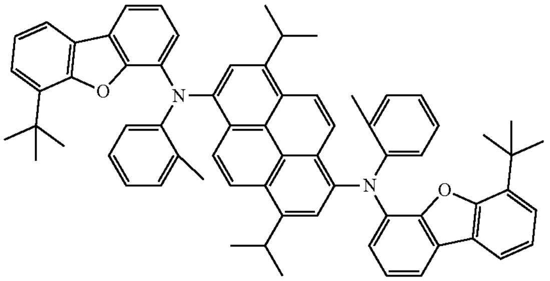
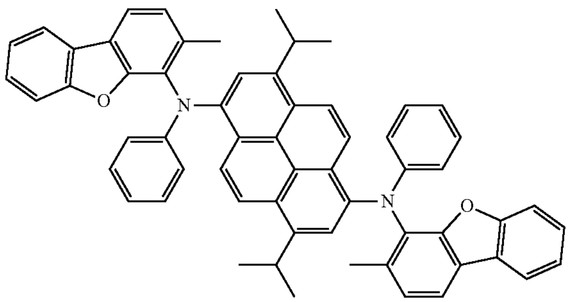
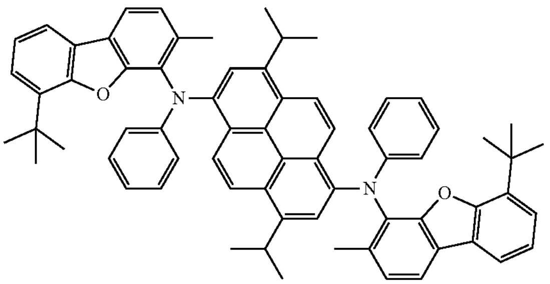
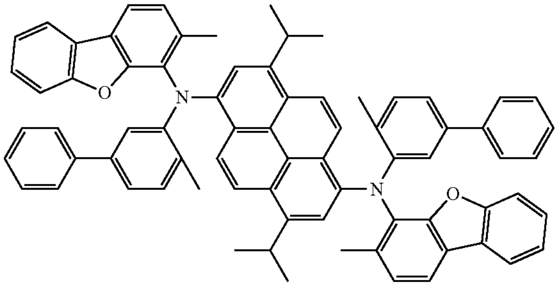
-continued
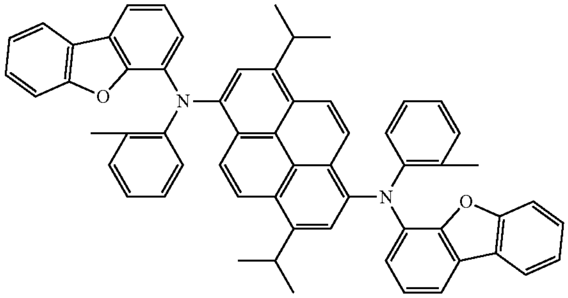
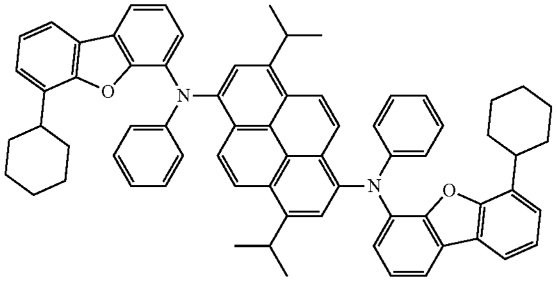
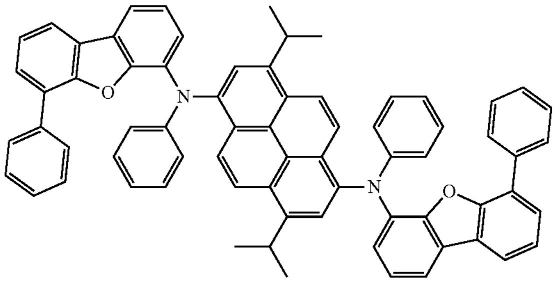
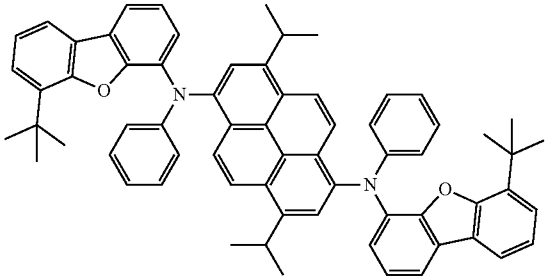
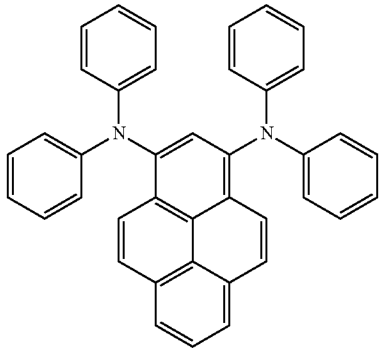

-continued
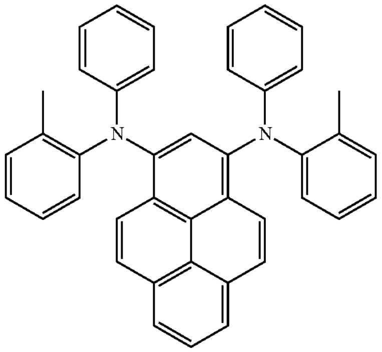
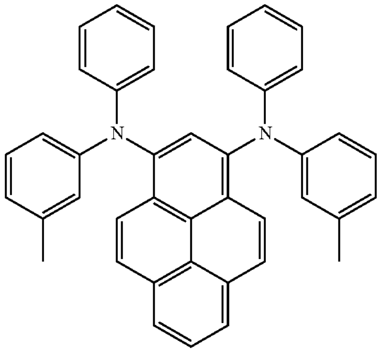
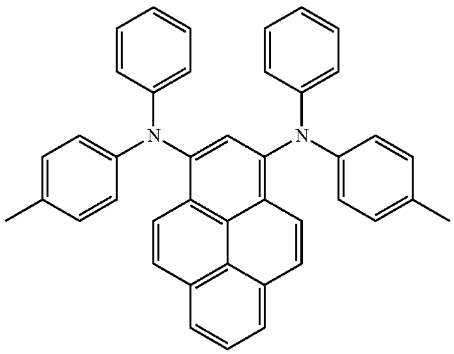
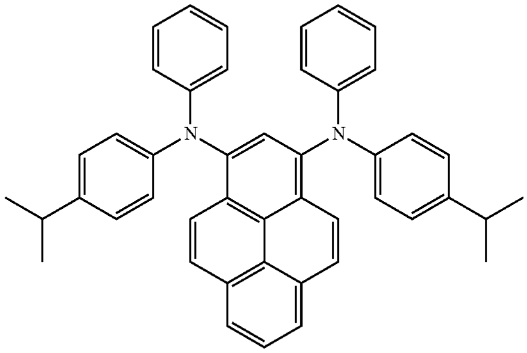
-continued
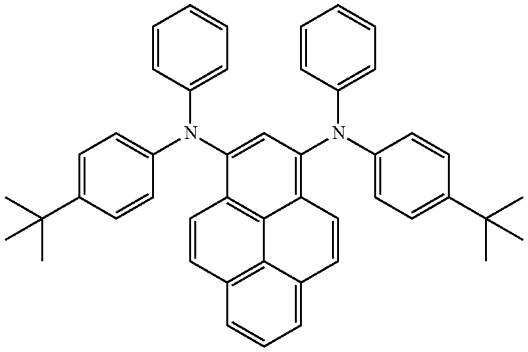
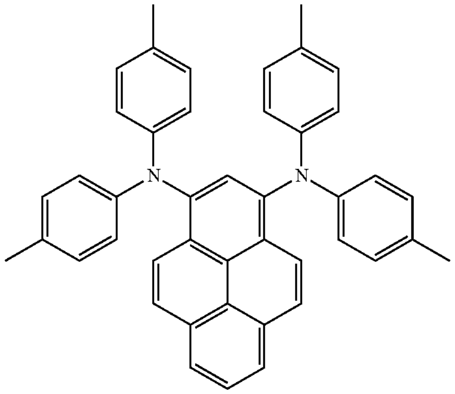
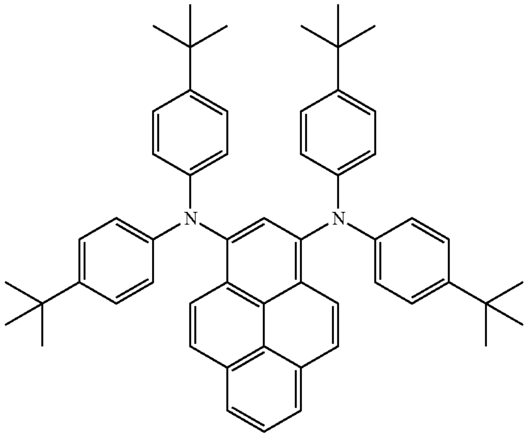
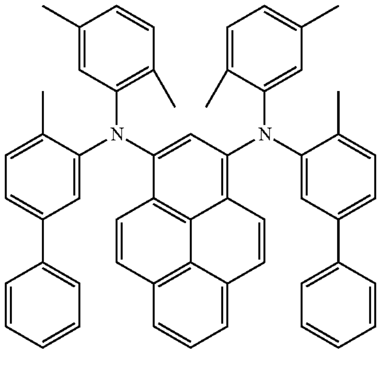

-continued
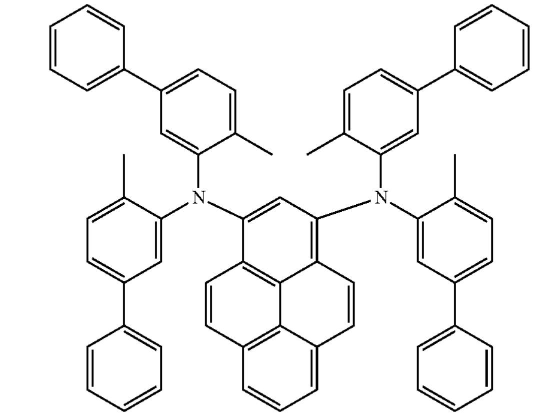
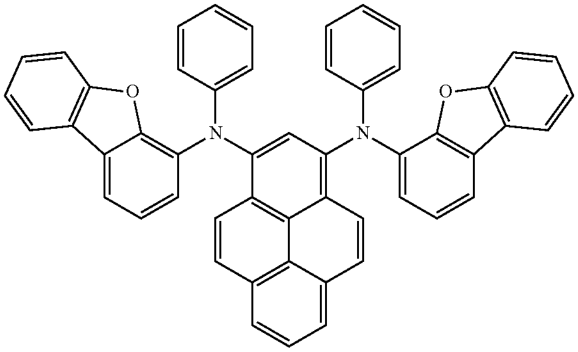
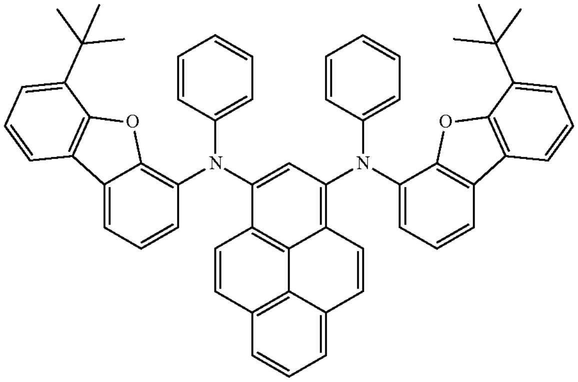
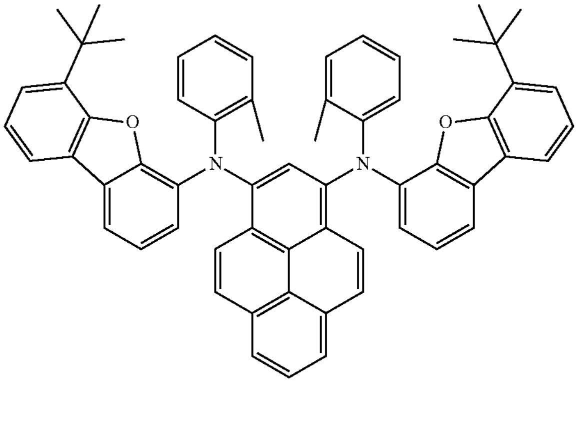
-continued
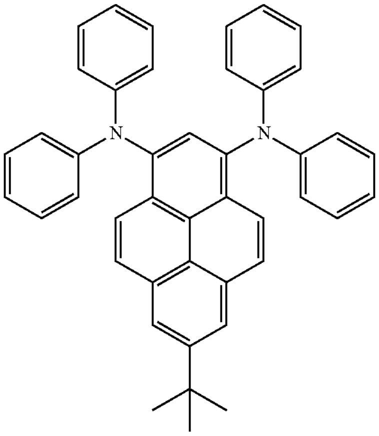
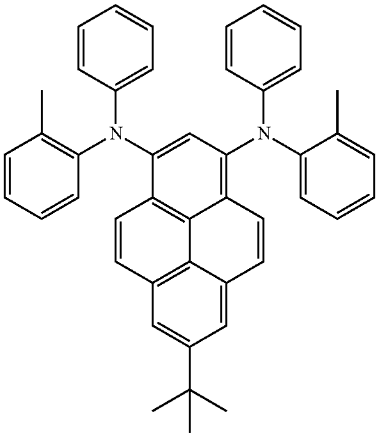
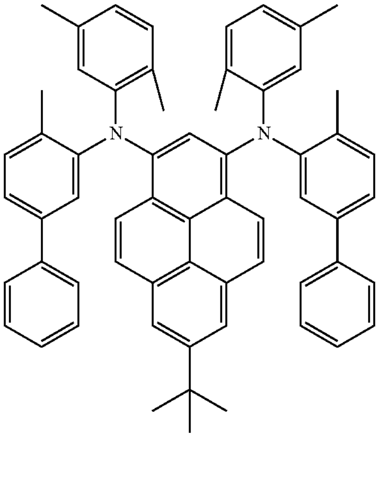

-continued
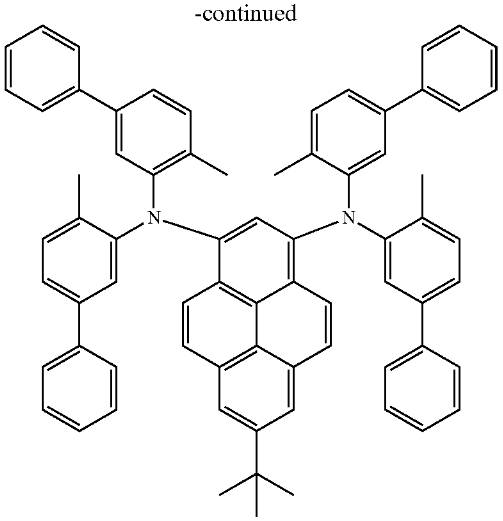
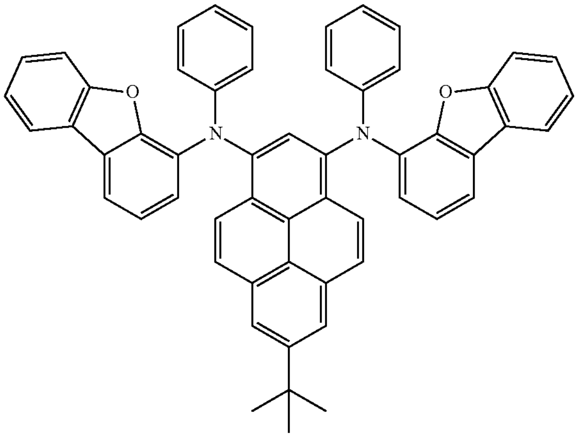
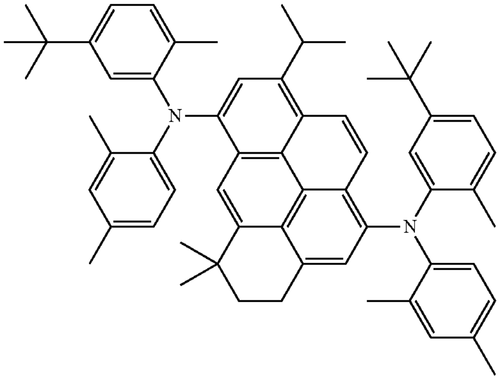
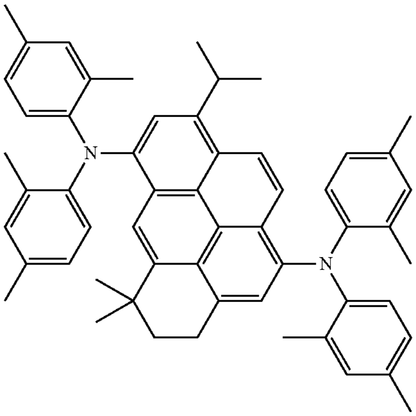
-continued
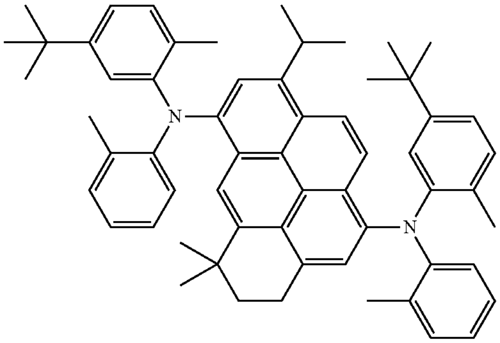
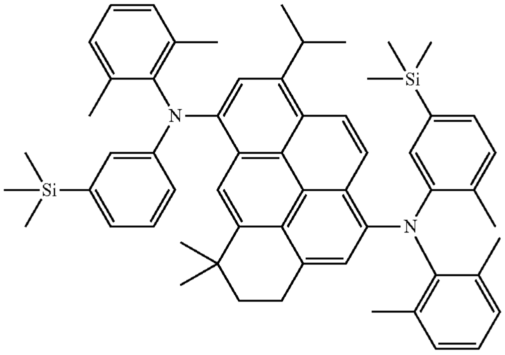
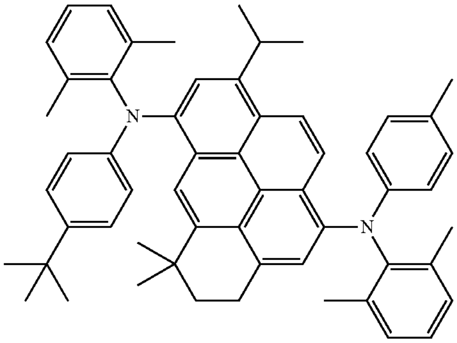
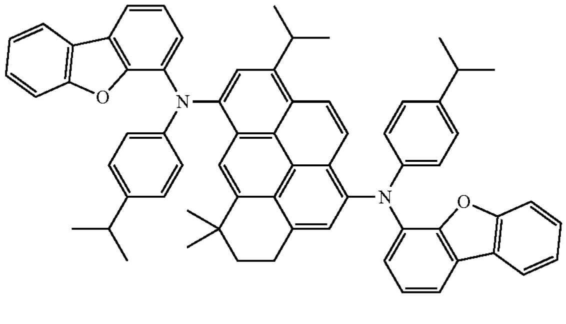

-continued
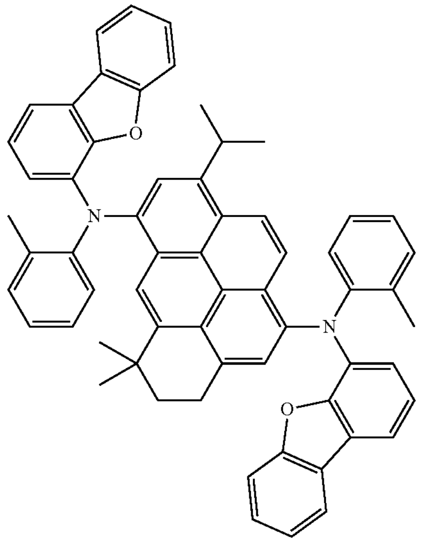
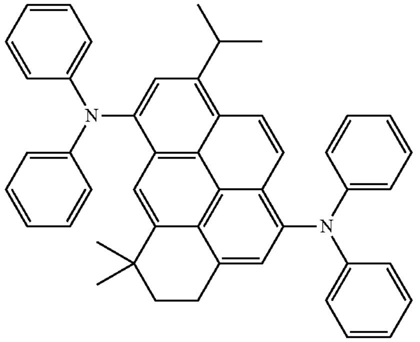
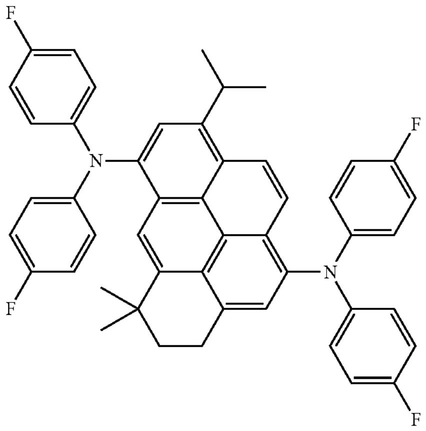
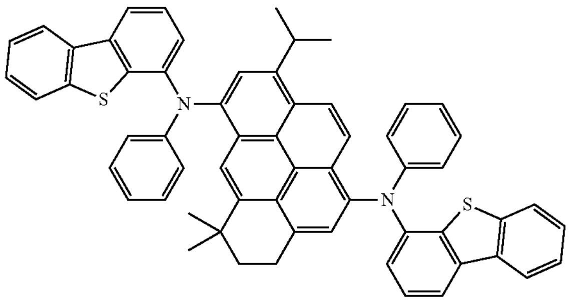
-continued
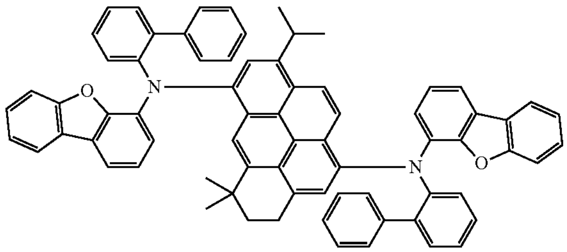
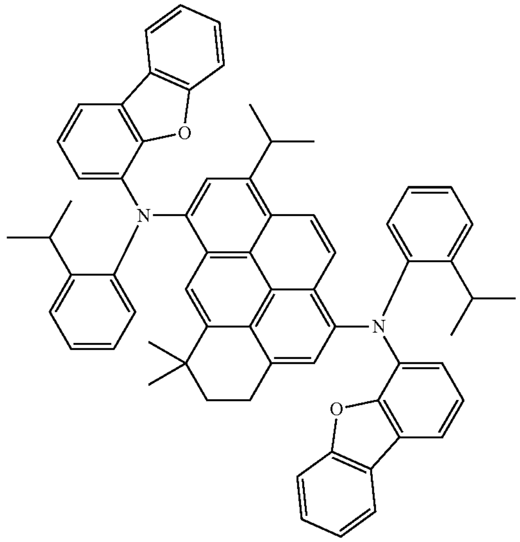
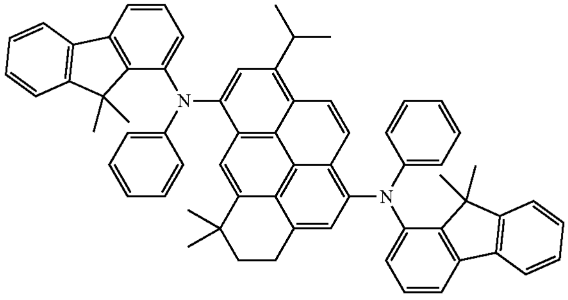
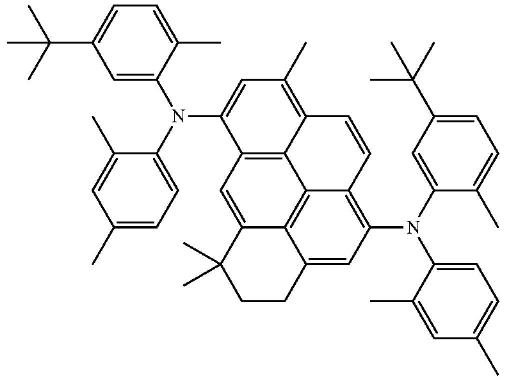

-continued

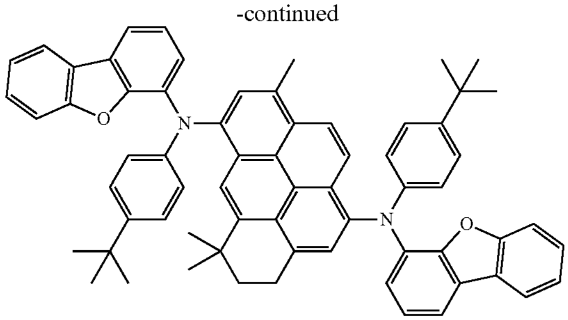

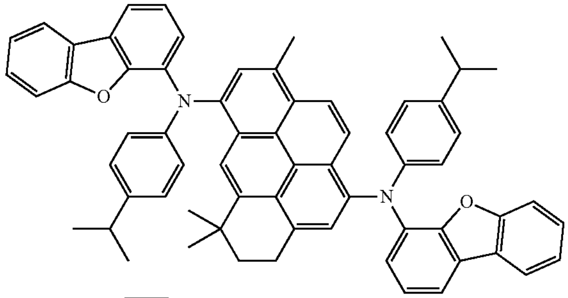

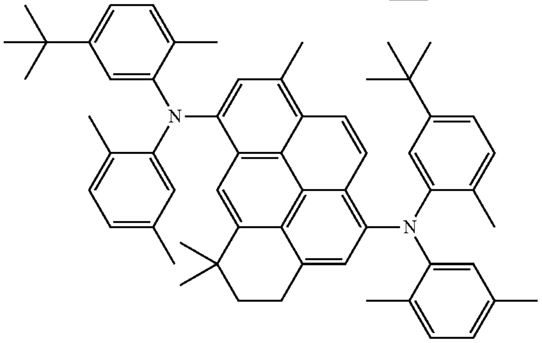

(Compound Represented by Formula (21))

The compound represented by the formula (21) is explained below.

(21)

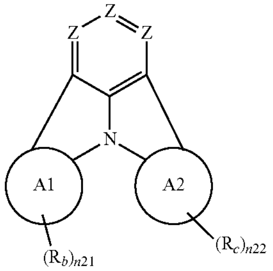

In the formula (21),

Z's are independently $CR_a$ or N;

a ring A1 and a ring A2 are independently a substituted or unsubstituted aromatic hydrocarbon ring including 6 to 50 ring carbon atoms, or a substituted or unsubstituted heterocycle including 5 to 50 ring atoms;

when a plurality of $R_a$'s exists, adjacent two or more of $R_a$'s form a substituted or unsubstituted, saturated or unsaturated ring by bonding with each other, or do not form a substituted or unsubstituted, saturated or unsaturated ring;

when a plurality of $R_b$'s exists, one or more sets of adjacent two or more of $R_b$'s form a substituted or unsubstituted, saturated or unsaturated ring by bonding with each other, or do not form a substituted or unsubstituted, saturated or unsaturated ring;

when a plurality of $R_b$'s exists, one or more sets of adjacent two or more of $R_b$'s form a substituted or unsubstituted, saturated or unsaturated ring by bonding with each other, or do not form a substituted or unsubstituted, saturated or unsaturated ring;

n21 and n22 are independently an integer of 0 to 4;

$R_a$ to R, that do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $—Si(R_{901})(R_{902})(R_{903})$, $—O—(R_{904})$, $—S—(R_{905})$, $—N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formulas (1).

The "aromatic hydrocarbon ring" for the ring A1 and the ring A2 has the structure same as the compound obtained by introducing a hydrogen atom into the "aryl group" described above. The "aromatic hydrocarbon rings" of the ring A1 and the ring A2 contain each two carbon atoms in the fused bicyclic structure at the center of the formula (21) as the ring atoms. Examples of the "substituted or unsubstituted aromatic hydrocarbon ring including 6 to 50 ring carbon atoms" include compounds in which a hydrogen atom is introduced into the "aryl group" described in the example group G1.

The "heterocycle" for the ring A1 and the ring A2 has the structure same as the compound obtained by introducing a hydrogen atom into the "heterocyclic group" described above. The "heterocycles" of the ring A1 and the ring A2 contain each two carbon atoms in the fused bicyclic structure at the center of the formula (21) as the ring atoms. Examples of the "substituted or unsubstituted heterocycle including 5 to 50 ring atoms" include compounds in which a hydrogen atom is introduced into the "heterocyclic group" described in the example group G2.

$R_b$ is bonded to one of the carbon atoms which constitute the aromatic hydrocarbon ring of the ring A1, or one of the atoms which constitute the heterocycle of the ring A1.

$R_c$ is bonded to one of the carbon atoms which constitute the aromatic hydrocarbon ring of the ring A2, or one of the atoms which constitute the heterocycle of the ring A2.

It is preferable that at least one (preferably two) of $R_a$ to R, is a group represented by the following formula (21a).

$$-L_{201}-Ar_{201} \quad (21a)$$

In the formula (21a), $L_{201}$ is a single bond, a substituted or unsubstituted arylene group including 6 to 30 ring carbon atoms, or a substituted or unsubstituted divalent heterocyclic group including 5 to 30 ring atoms; and $Ar_{201}$ is a substituted or unsubstituted aryl group including 6 to 50 ring carbon atoms, a substituted or unsubstituted monovalent heterocyclic group including 5 to 50 ring atoms, or a group represented by the following formula (21b):

(21b)

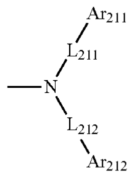

In the formula (21b), $L_{211}$ and $L_{212}$ are independently a single bond, a substituted or unsubstituted arylene group including 6 to 30 ring carbon atoms, or a substituted or unsubstituted divalent heterocyclic group including 5 to 30 ring atoms;

$Ar_{211}$ and $Ar_{212}$ form a substituted or unsubstituted, saturated or unsaturated ring by bonding with each other, or do not form a substituted or unsubstituted, saturated or unsaturated ring; and $Ar_{211}$ and $Ar_{212}$ that do not form the substituted or unsubstituted, saturated or unsaturated ring are independently a substituted or unsubstituted aryl group including 6 to 50 ring carbon atoms or a substituted or unsubstituted monovalent heterocyclic group including 5 to 50 ring atoms.

In one embodiment, the compound represented by the formula (21) is a compound represented by the following formula (22).

(22)

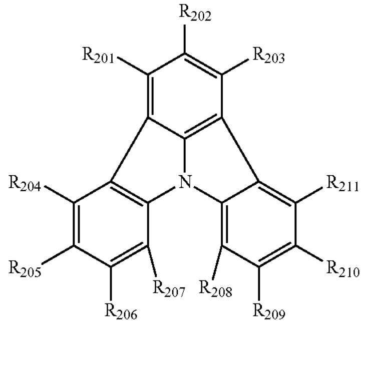

In the formula (22), one or more sets of adjacent two or more of $R_{201}$ to $R_{211}$ form a substituted or unsubstituted, saturated or unsaturated ring by bonding with each other, or do not form a substituted or unsubstituted saturated or unsaturated ring;

$R_{201}$ to $R_{211}$ that do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $—Si(R_{901})(R_{902})(R_{903})$, $—O—(R_{904})$, $—S—(R_{905})$, $—N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formulas (1).

It is preferable that at least one (preferably two) of $R_{201}$ to $R_{211}$ is the group represented by the formula (21a). It is preferable that $R_{204}$ and $R_{211}$ are the groups represented by the formula (21a).

In one embodiment, the compound represented by the formula (21) is a compound obtained by bonding a structure represented by the following formula (21-1) or (21-2) to the ring A1. In one embodiment, the compound represented by the formula (22) is a compound obtained by bonding a structure represented by the following formula (21-1) or (21-2) to the ring to which $R_{204}$ to $R_{207}$ bond.

(21-1)

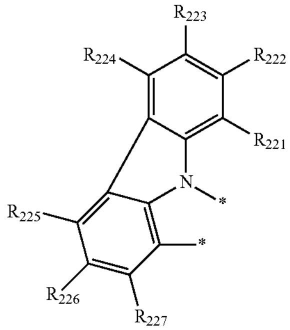

(21-2)

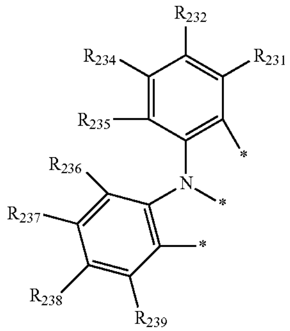

In the formula (21-1), two *'s bond, respectively to a ring carbon atom in the aromatic hydrocarbon ring or a ring atom in the heterocycle of the ring A1 in the formula (21), or bond, respectively to any of $R_{204}$ to $R_{207}$ in the formula (22);

In the formula (21-2), three *'s bond, respectively to a ring carbon atom in the aromatic hydrocarbon ring or a ring atom in the heterocycle of the A1 ring in the formula (21), or bond, respectively to one of $R_{204}$ to $R_{207}$ in the formula (22);

One or more sets of adjacent two or more of $R_{221}$ to $R_{227}$ and $R_{231}$ to $R_{239}$ form a substituted or unsubstituted, saturated or unsaturated ring with each other, or do not form a substituted or unsubstituted, saturated or unsaturated ring;

$R_{221}$ to $R_{227}$ and $R_{231}$ to $R_{239}$ that do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formulas (1).

In one embodiment, the compound represented by the formula (21) is a compound represented by the following formula (21-3), (21-4), or (21-5).

(21-3)

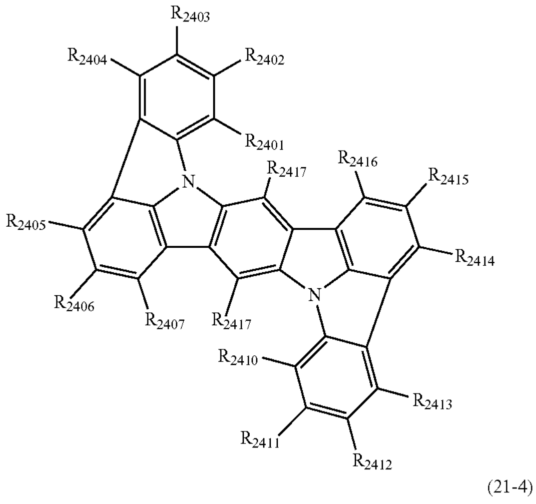

(21-4)

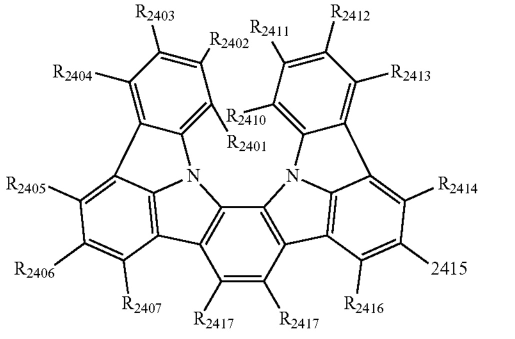

-continued (21-5)

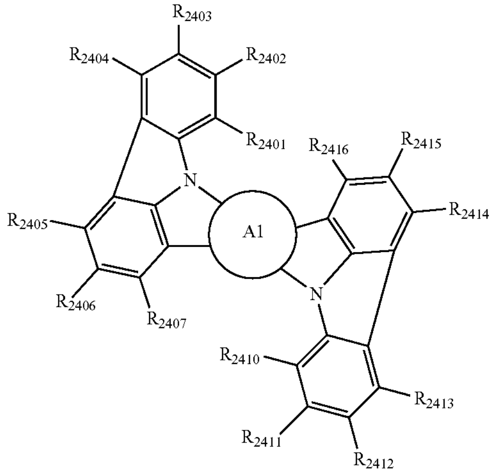

In the formulas (21-3), (21-4), and (21-5), ring A1 is as defined in the formula (21);

$R_{2401}$ to $R_{2407}$ are in the same as $R_{221}$ to $R_{227}$ in the formulas (21-1) and (21-2); $R_{2410}$ to $R_{2417}$ are in the same as $R_{201}$ to $R_{211}$ in the formula (22); and two $R_{2417}$'s may be the same as or different from each other.

In one embodiment, the substituted or unsubstituted aromatic hydrocarbon ring including 6 to 50 ring carbon atoms of the ring A1 in the formula (21-5) is a substituted or unsubstituted naphthalene ring, or a substituted or unsubstituted fluorene ring.

In one embodiment, the substituted or unsubstituted heterocycle including 5 to 50 ring atoms of the ring A1 in the formula (21-5) is a substituted or unsubstituted dibenzofuran ring, a substituted or unsubstituted carbazole ring, or a substituted or unsubstituted dibenzothiophene ring.

In one embodiment, the compound represented by the formula (21) or (22) is selected from the group consisting of compounds represented by each of the following formulas (21-6-1) to (21-6-7).

(21-6-1)

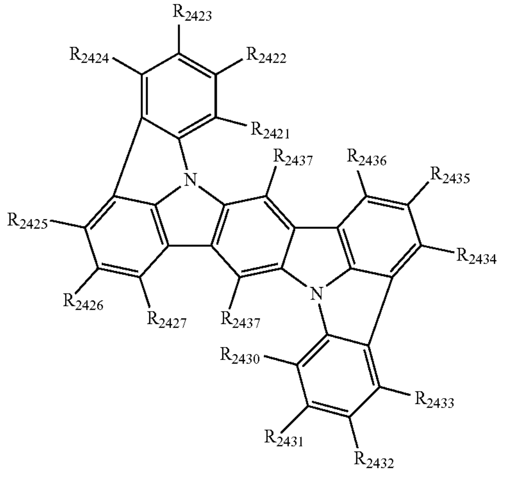

-continued (21-6-2)

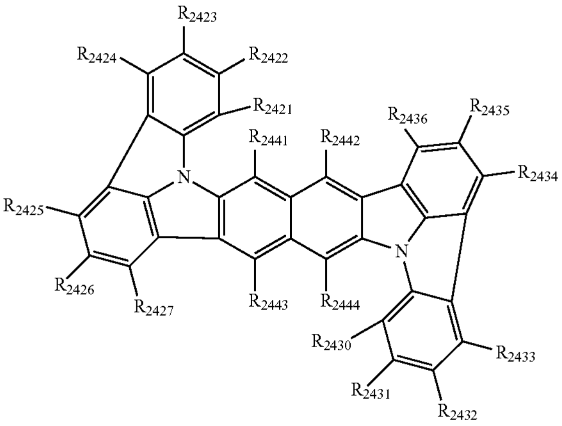

(21-6-3)

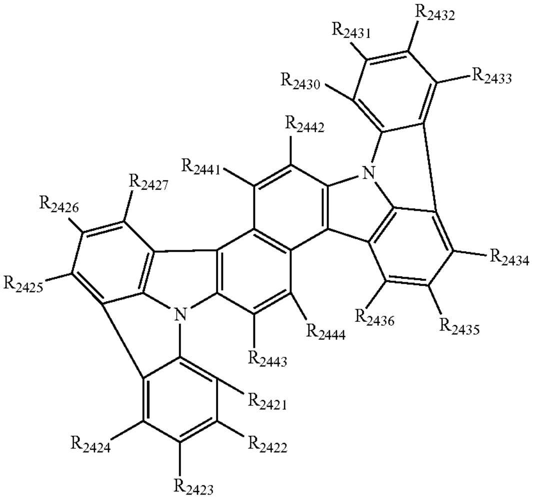

(21-6-4)

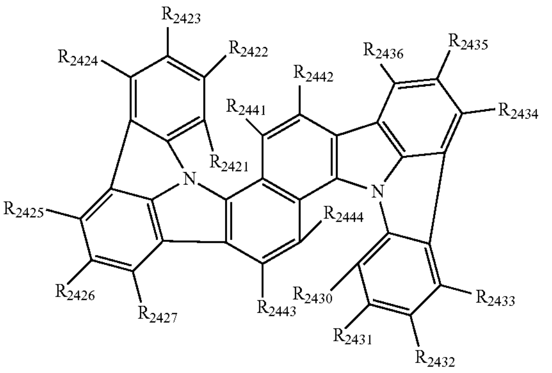

-continued (21-6-5)

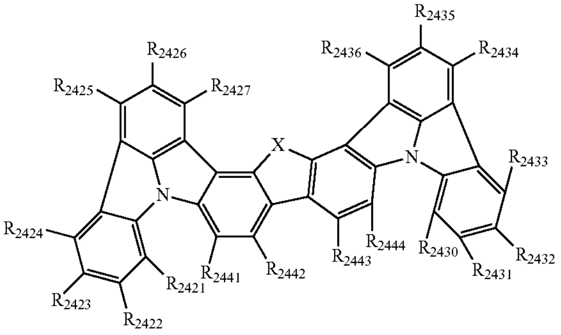

(21-6-6)

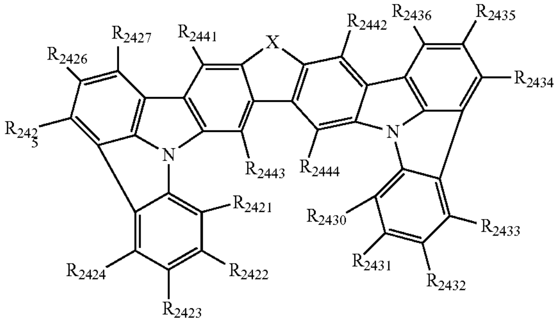

(21-6-7)

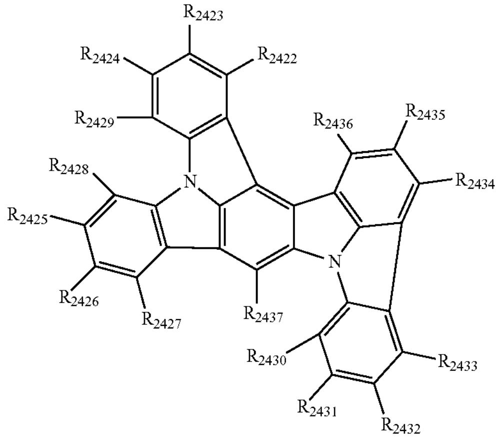

In the formulas (21-6-1) to (21-6-7), $R_{2421}$ to $R_{2427}$ are the same as $R_{221}$ to $R_{227}$ in the formulas (21-1) or (21-2);

$R_{2430}$ to $R_{2437}$ and $R_{2441}$ to $R_{2444}$ are the same as $R_{201}$ to $R_{211}$ in the formula (22);

X is O, $NR_{901}$, or $C(R_{902})(R_{903})$; and $R_{901}$ to $R_{903}$ are as defined in the formulas (1).

In one embodiment, in the compound represented by the formula (22), one or more sets of adjacent two or more of $R_{201}$ to $R_{211}$ form a substituted or unsubstituted, saturated or unsaturated ring by bonding with each other. This embodiment is described in detail as a compound represented by the following formula (25).

(Compound Represented by Formula (25))

The compound represented by the formula (25) is explained below.

(25)

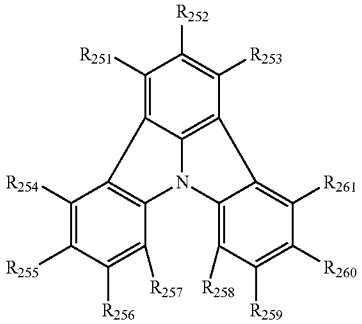

In the formula (25), two or more pairs selected from the group consisting of $R_{251}$ and $R_{252}$, $R_{252}$ and $R_{253}$, $R_{254}$ and $R_{255}$, $R_{255}$ and $R_{256}$, $R_{256}$ and $R_{257}$, $R_{257}$ and $R_{257}$, $R_{259}$ and $R_{260}$, and $R_{260}$ and $R_{261}$ form a substituted or unsubstituted, saturated or unsaturated ring by bonding with each other;

provided that the pair of $R_{251}$ and $R_{252}$ and the pair of $R_{252}$ and $R_{253}$ do not form a ring simultaneously; the pair of $R_{254}$ and $R_{255}$ and the pair of $R_{255}$ and $R_{256}$ do not form a ring simultaneously; the pair of $R_{255}$ and $R_{256}$ and the pair of $R_{256}$ and $R_{25}$ do not form a ring simultaneously; the pair of $R_{258}$ and $R_{259}$ and the pair of $R_{259}$ and $R_{260}$ do not form a ring simultaneously; and the pair of $R_{259}$ and $R_{260}$ and the pair of $R_{260}$ and $R_{261}$ do not form a ring simultaneously;

two or more rings formed by each of pairs of $R_{251}$ to $R_{261}$ may be the same as or different from each other;

$R_{251}$ to $R_{261}$ that do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, or $—Si(R_{901})(R_{902})(R_{903})$, $—O—(R_{904})$, $—S—(R_{905})$, $—N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formulas (1).

In the formula (25), $R_n$ and $R_{n+1}$ (n is a number selected from 251, 252, 254 to 256 and 258 to 260) form a substituted or unsubstituted, saturated or unsaturated ring by bonding with the two ring carbon atoms to which $R_n$ and $R_{n+1}$ are bonded. The ring is preferably configured with atoms selected from a C atom, an O atom, a S atom and a N atom, and the number of atoms is preferably 3 to 7, more preferably 5 or 6.

The number of the above-described ring structures in the compound represented by the formula (25) is, for example, 2, 3 or 4. The two or more ring structures may fused to the same benzene ring of the main skeleton in the formula (25), or may fused to different benzene rings. For example, in the case where the compound has the three ring structures fused, each one ring structure may fused to each of the three benzene rings in the formula (25).

As the above-mentioned ring structures in the compound represented by the formula (25), structures represented by each of the following formulas (251) to (260) can be given, for example.

(251)

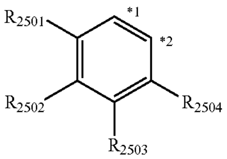

(252)

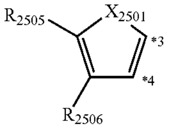

(253)

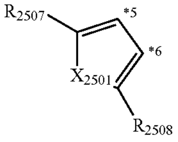

(254)

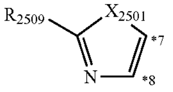

(255)

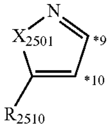

(256)

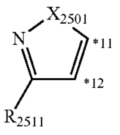

(257)

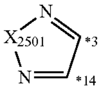

In the formulas (251) to (257), each of *1 and *2, *3 and *4, *5 and *6, *7 and *8, *9 and *10, *11 and *12, and *13 and *14 represents two ring carbon atoms to which $R_n$ and $R_{n+1}$ are bonded, and $R_n$ may bond to either one of the two ring carbon atoms of *1 and *2, *3 and *4, *5 and *6, *7 and *8, *9 and *10, *11 and *12, and *13 and *14;

$X_{2501}$ is $C(R_{2512})(R_{2513})$, $NR_{2514}$, O or S;

one or more sets of adjacent two or more of $R_{2501}$ to $R_{2506}$ and $R_{2512}$ to $R_{2513}$ form a substituted or unsubstituted, saturated or unsaturated ring by bonding with each other, or do not form a substituted or unsubstituted saturated or unsaturated ring; and $R_{2501}$ to $R_{2514}$ that do not form the substituted or unsubstituted, saturated or unsaturated ring are defined in the same as $R_{251}$ to $R_{261}$.

(258)

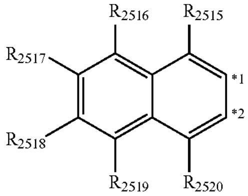

(259)

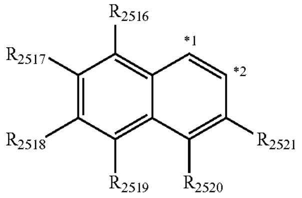

(260)

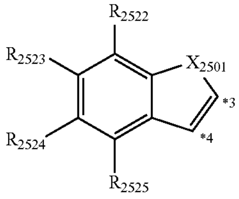

In the formulas (258) to (260), each of *1 and *2, and *3 and *4 represents two ring carbon atoms to which $R_n$ and $R_{n+1}$ are bonded, and $R_n$ may bond to either one of the two ring carbon atoms of *1 and *2, or *3 and*4;

$X_{2501}$ is $C(R_{2512})(R_{2513})$, $NR_{2514}$, O or S;

one or more sets of adjacent two or more of $R_{2515}$ to $R_{2525}$ form a substituted or unsubstituted, saturated or unsaturated ring by bonding with each other, or do not form a substituted or unsubstituted saturated or unsaturated ring; and $R_{2515}$ to $R_{2521}$ and $R_{2522}$ to $R_{2525}$ that do not form the substituted or unsubstituted saturated or unsaturated ring are defined in the same as $R_{251}$ to $R_{261}$.

In the formula (25), it is preferable that at least one of $R_{252}$, $R_{254}$, $R_{255}$, $R_{260}$ and $R_{261}$ (preferably at least one of $R_{252}$, $R_{255}$, and $R_{260}$, and more preferably $R_{252}$) is a group that does not form the ring.

(i) A substituent which the ring structure formed by $R_n$ and $R_{n+1}$ in the formula (25) has, (ii) $R_{251}$ to $R_{261}$ in the formula (25) that do not form the ring structure, and (iii) $R_{2501}$ to $R_{2514}$ and $R_{2515}$ to $R_{2525}$ in the formulas (251) to (260)

are preferably independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms,

—$N(R_{900})(R_{907})$, a substituted or unsubstituted aryl group including 6 to 50 ring carbon atoms, a substituted or unsubstituted monovalent heterocyclic group including 5 to 50 ring atoms, or a group selected from the following groups.

(261)

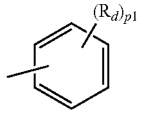

(262)

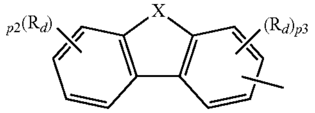

(263)

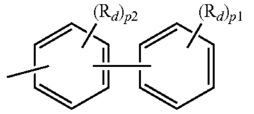

(264)

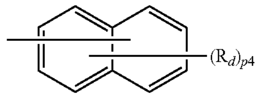

In the formulas (261) to (264), $R_d$'s are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

X is $C(R_{901})(R_{902})$, $NR_{903}$, O, or S;

$R_{901}$ to $R_{907}$ are as defined in the formulas (1); and p1's are independently an integer of 0 to 5, p2's are independently an integer of 0 to 4, p3 is an integer of 0 to 3, and p4 is an integer of 0 to 7.

In one embodiment, the compound represented by the formula (25) is a compound represented by any one of the following formulas (25-1) to (25-6).

(25-1)

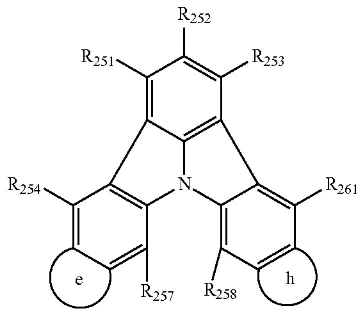

-continued
(25-2)
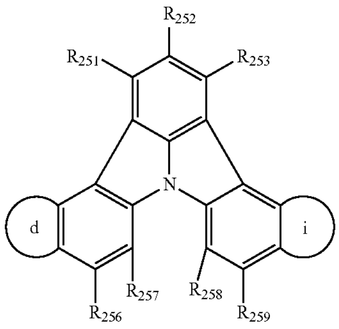
(25-3)
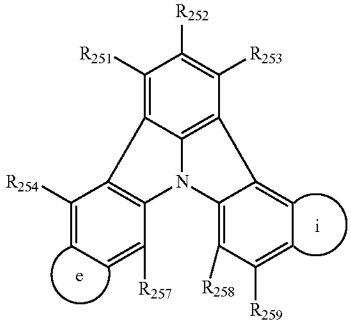
(25-4)
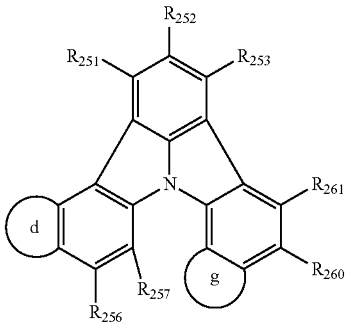
(25-5)
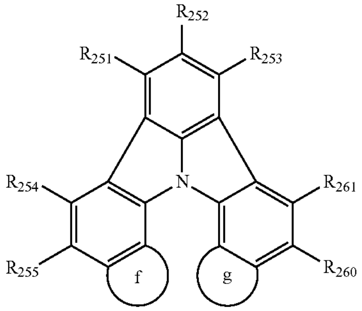
(25-6)
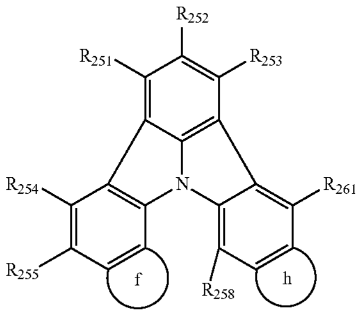
In the formulas (25-1) to (25-6), rings d to i are independently a substituted or unsubstituted, saturated or unsaturated ring; and $R_{251}$ to $R_{261}$ are as defined in the formula (25).
In one embodiment, the compound represented by the formula (25) is a compound represented by any one of the following formulas (25-7) to (25-12).
(25-7)
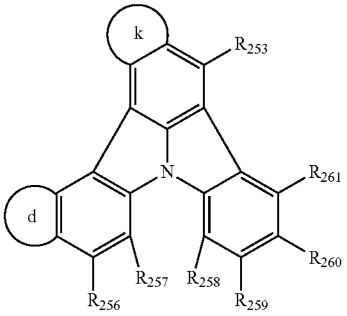
(25-8)
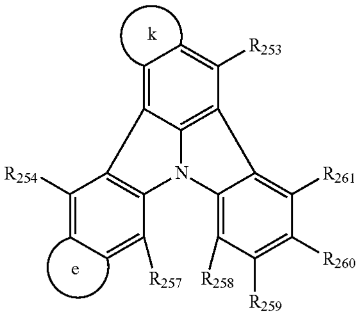
(25-9)
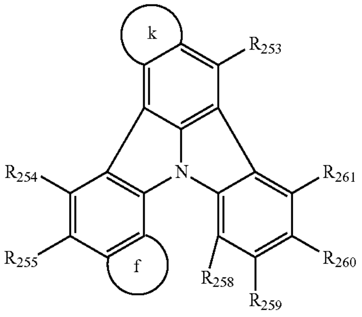
(25-10)
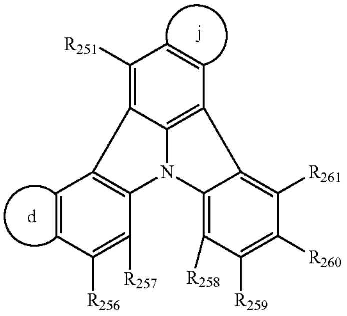

-continued
(25-11)
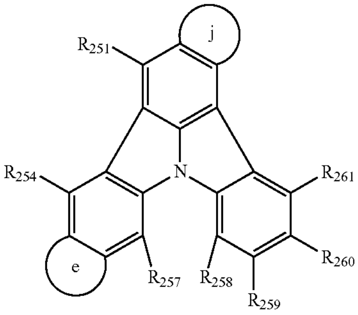
(25-12)
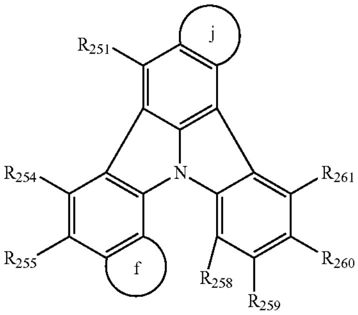
In the formulas (25-7) to (25-12), rings d to f, k, and j are independently a substituted or unsubstituted, saturated or unsaturated ring; and $R_{251}$ to $R_{261}$ are defined in the same as those in the formula (25).
In one embodiment, the compound represented by the formula (25) is a compound represented by any one of the following formulas (25-13) to (25-21).
(25-13)
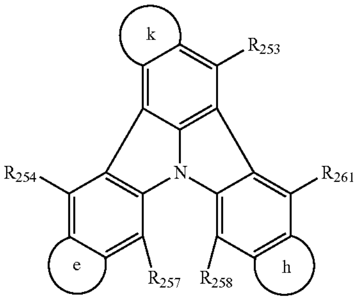
(25-14)
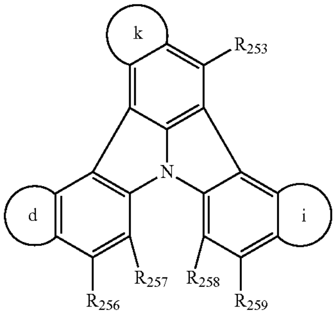
-continued
(25-15)
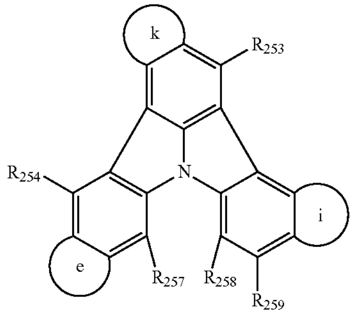
(25-16)
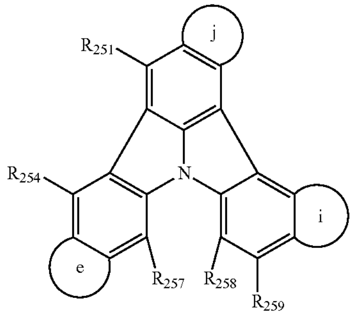
(25-17)
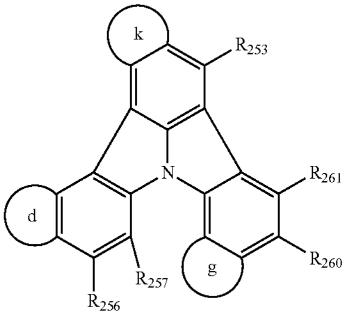
(25-18)
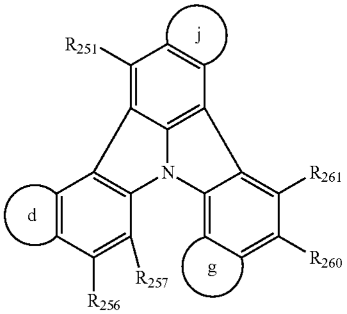
(25-19)
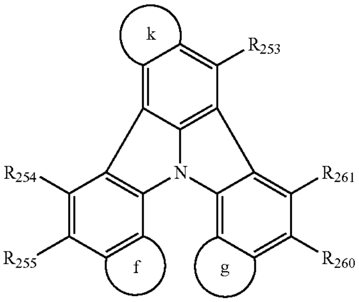

-continued (25-20)

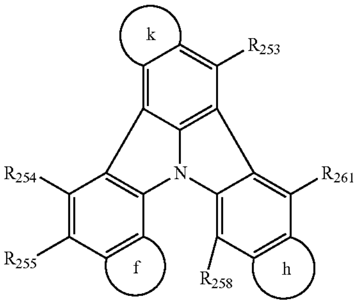

(25-21)

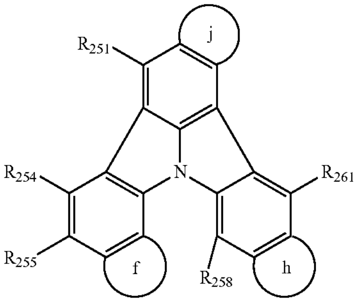

In the formulas (25-13) to (25-21), rings d to k are independently a substituted or unsubstituted, saturated or unsaturated ring; and $R_{251}$ to $R_{261}$ are as defined in the formula (25).

As a substituent which the ring g or the ring h further has, a substituted or unsubstituted alkyl group including 1 to 50 carbon atoms, a substituted or unsubstituted aryl group including 6 to 50 ring carbon atoms, and groups represented by each of the formula (261), (263) and (264) can be given, for example.

In one embodiment, the compound represented by the formula (25) is a compound represented by any one of the following formulas (25-22) to (25-25).

(25-22)

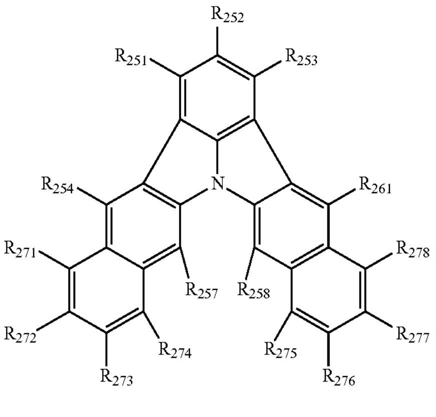

-continued (25-23)

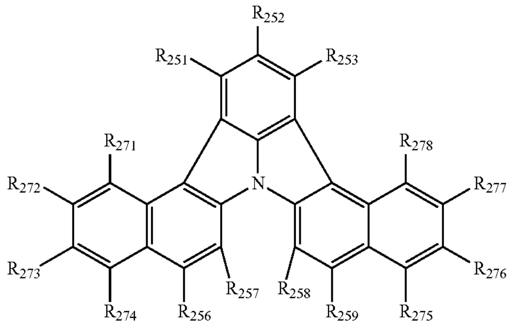

(25-24)

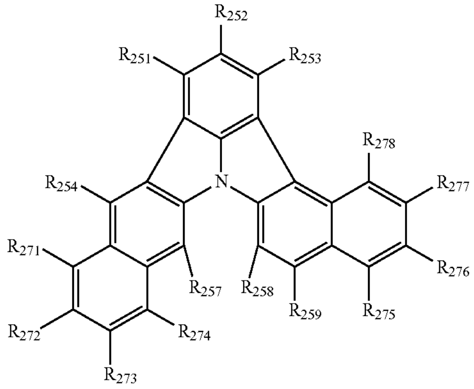

(25-25)

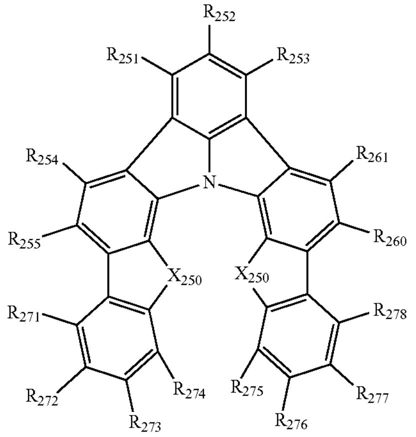

In the formulas (25-22) to (25-25), $X_{250}$'s are independently $C(R_{901})(R_{902})$, $NR_{903}$, O or S; $R_{251}$ to $R_{261}$, and $R_{271}$ to $R_{278}$ are defined in the same as $R_{251}$ to $R_{261}$ in the formula (25); and $R_{901}$ to $R_{903}$ are as defined in the formulas (1).

In one embodiment, the compound represented by the formula (25) is a compound represented by the following formula (25-26).

(25-26)
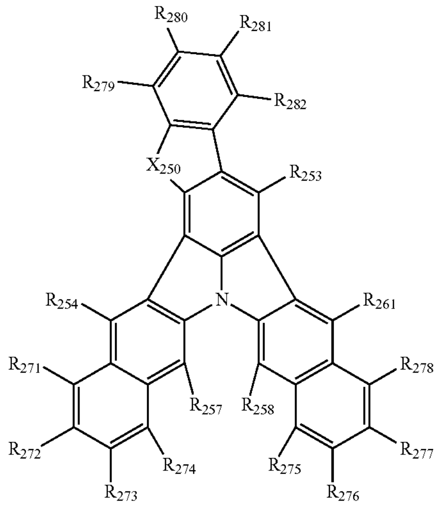
In the formula (25-26), $X_{250}$ is $C(R_{901})(R_{902})$, $NR_{903}$, O or S; $R_{253}$, $R_{254}$, $R_{257}$, $R_{258}$, $R_{261}$ and $R_{271}$ to $R_{282}$ are defined in the same as $R_{251}$ to $R_{261}$ in the formula (25); and $R_{901}$ to $R_{903}$ are as defined in the formulas (1).
As the compound represented by the formula (21), the following compounds can be shown for example. In the following examples, "Me" represents a methyl group.
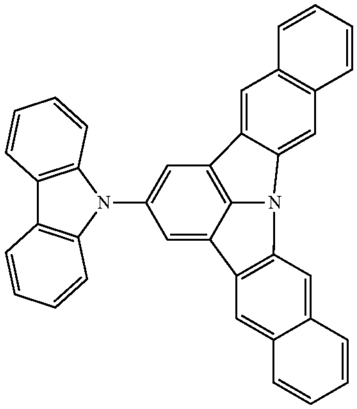
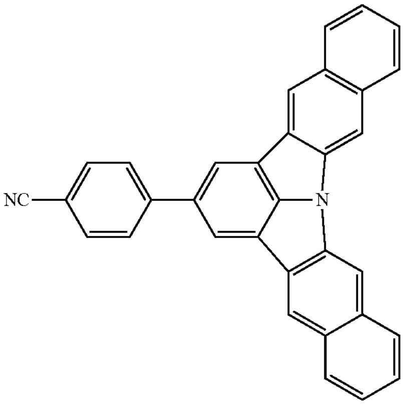
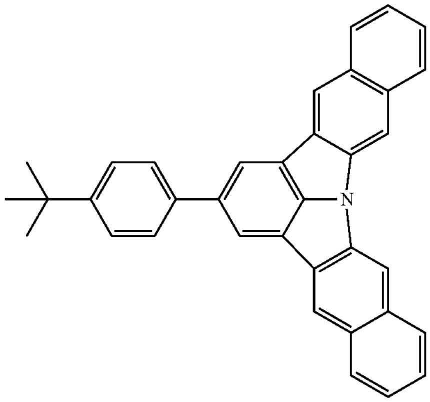
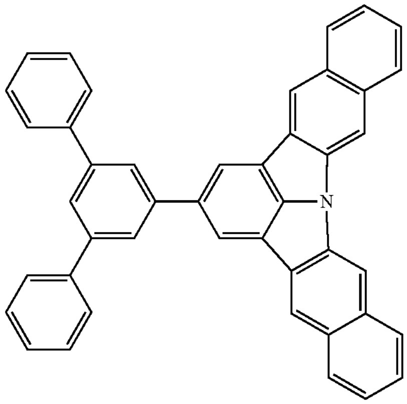

-continued
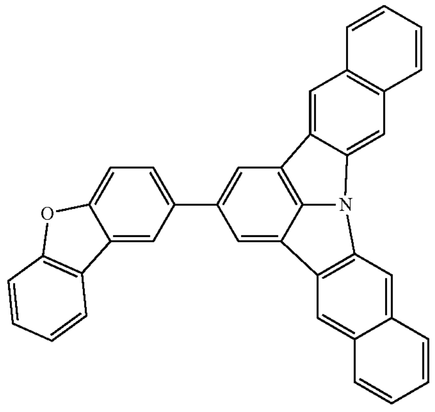
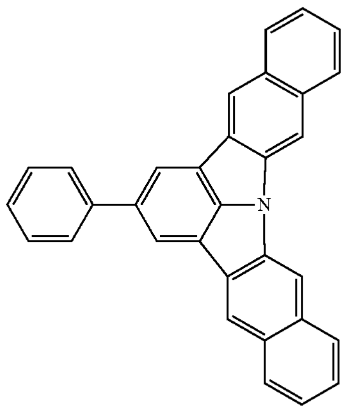
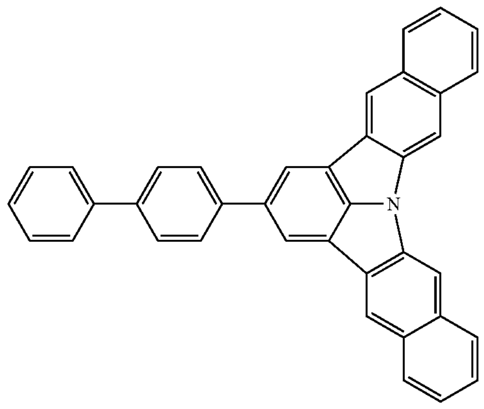
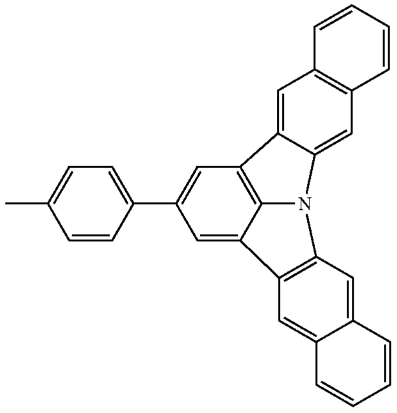
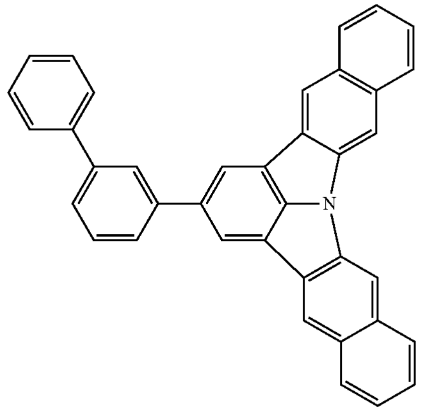
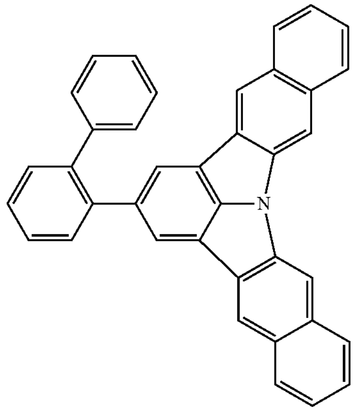

-continued
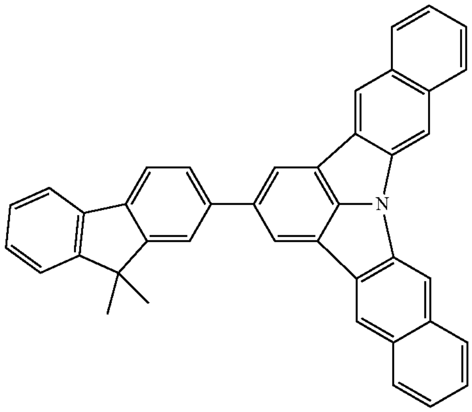
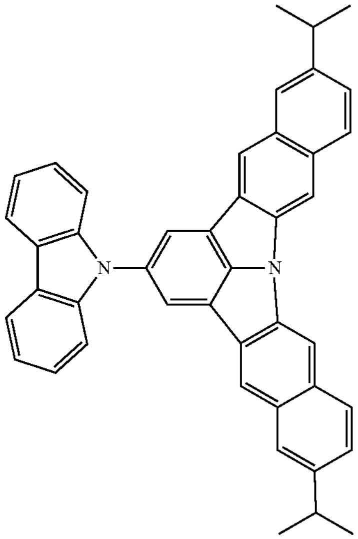
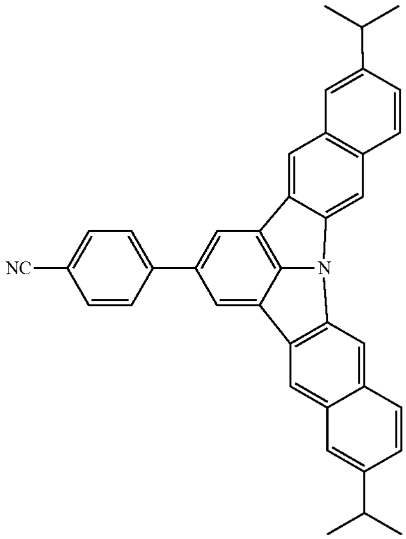
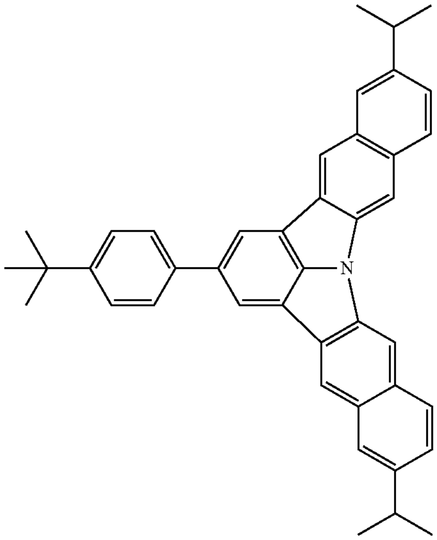
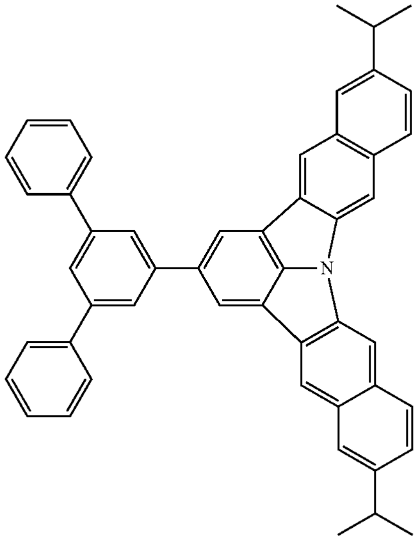
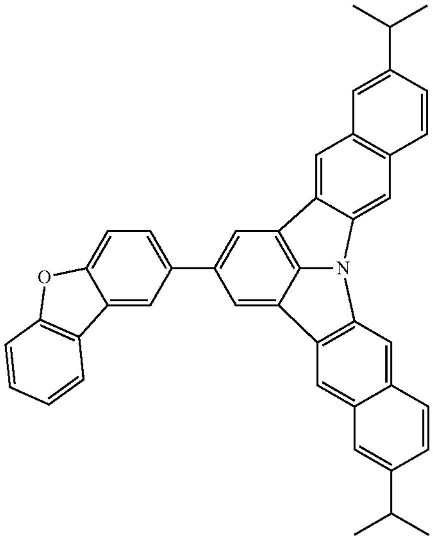

-continued
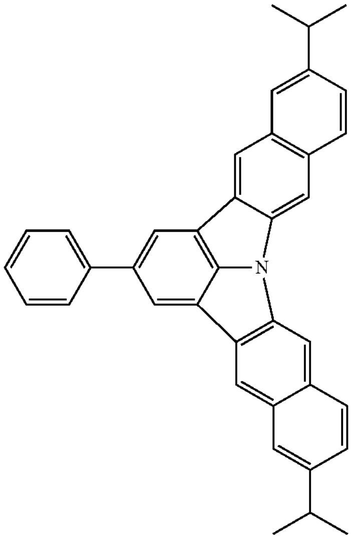
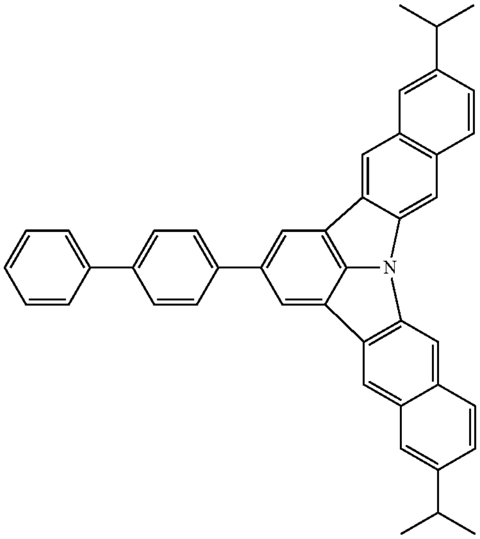
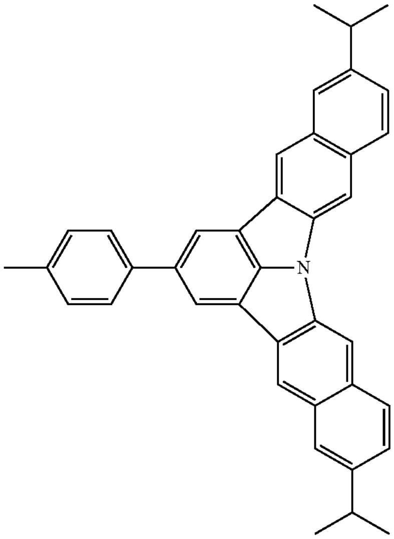
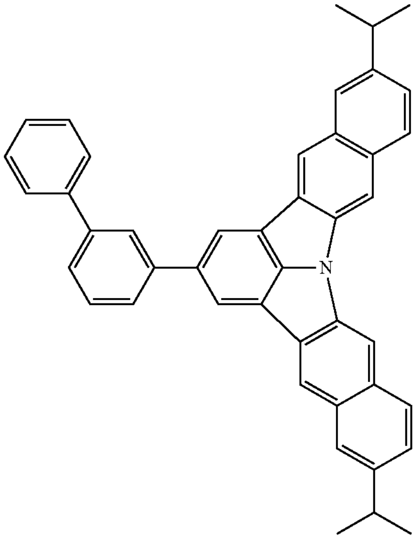
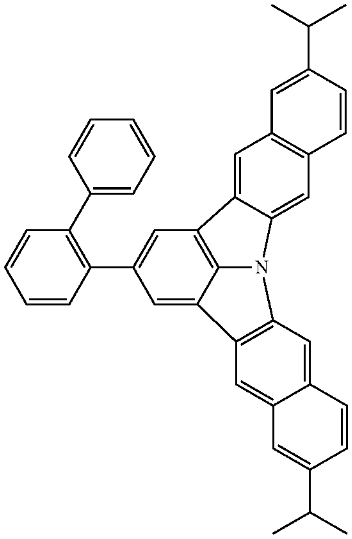
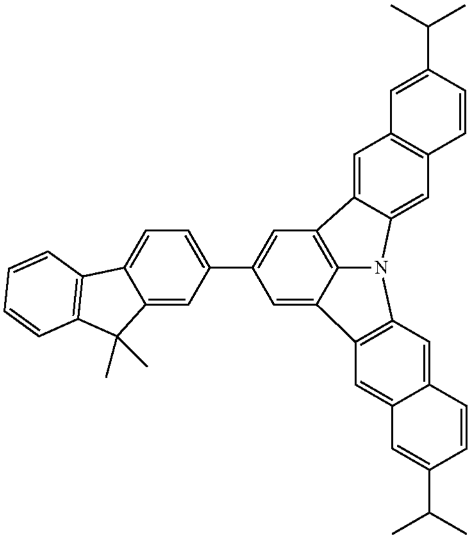

-continued
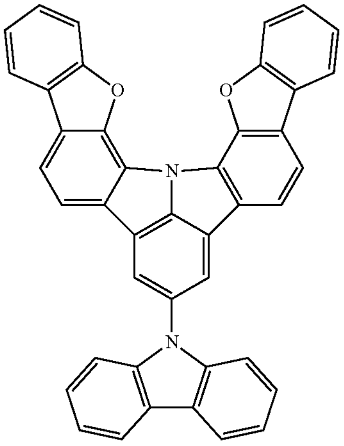
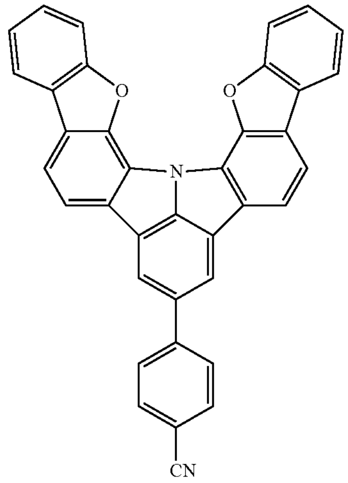
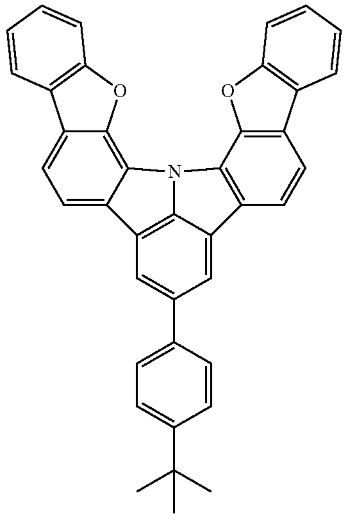
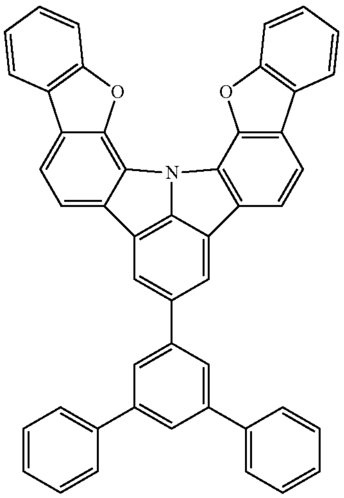
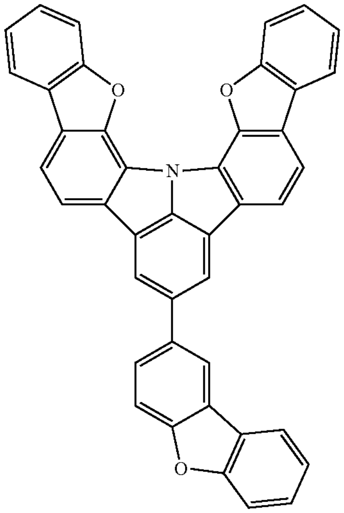
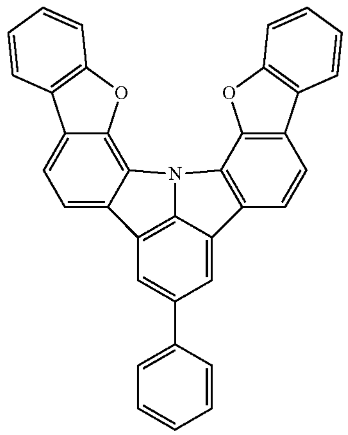
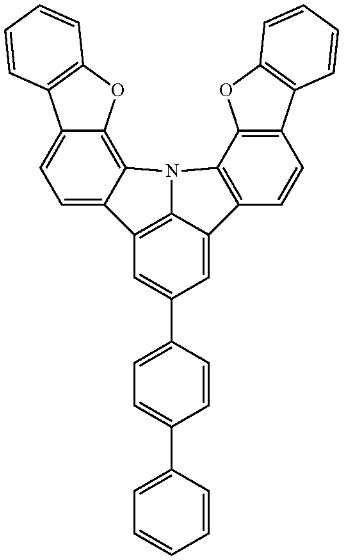
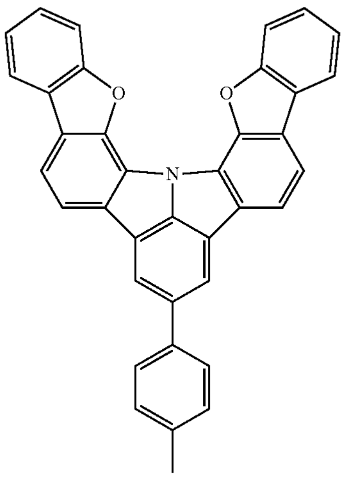
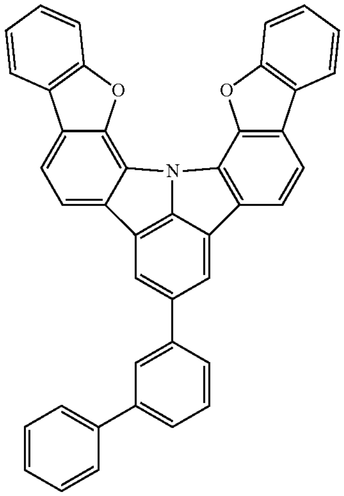

-continued
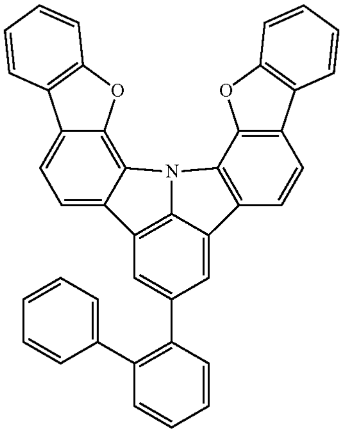
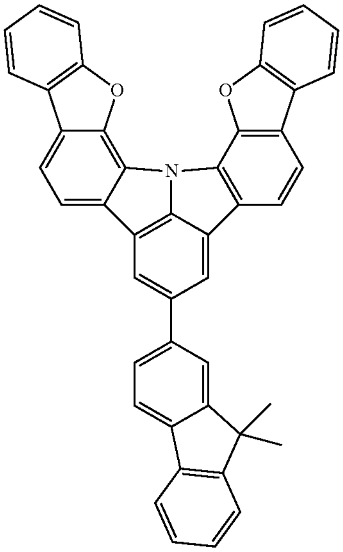
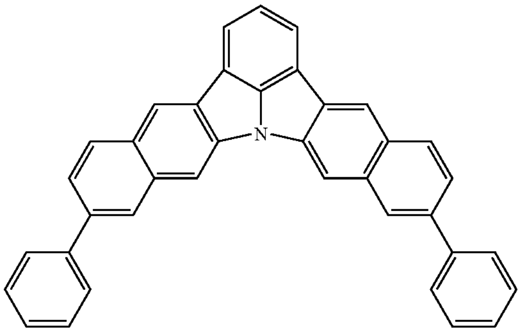
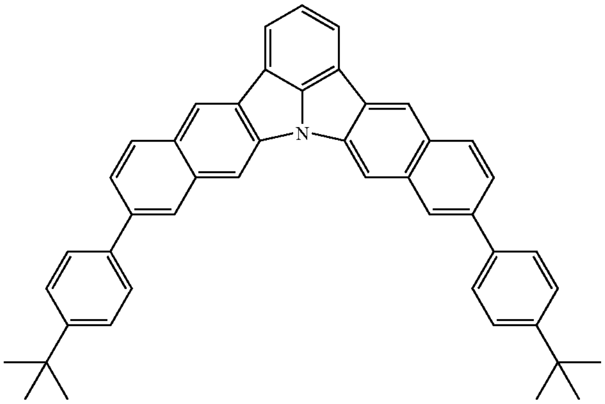
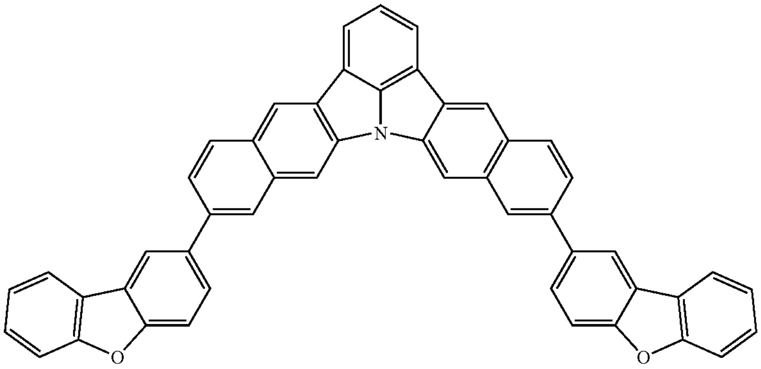
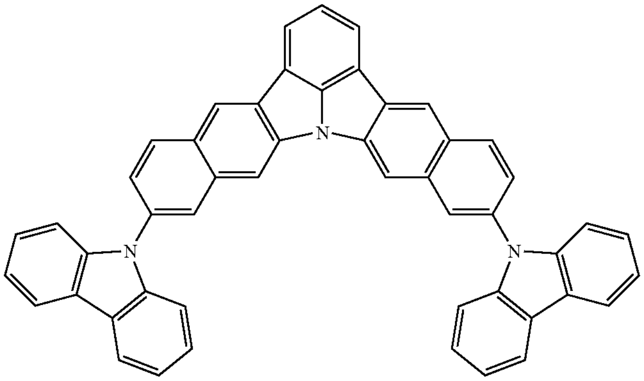

-continued
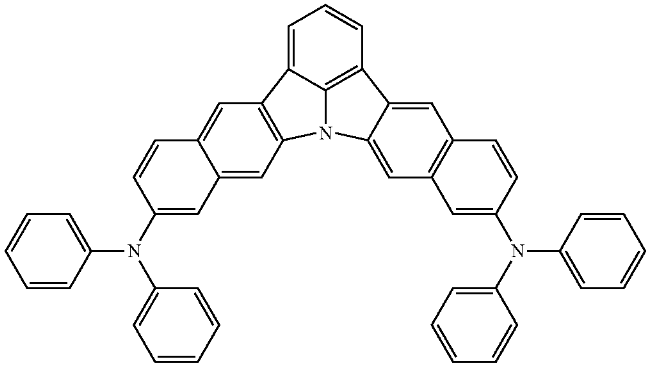
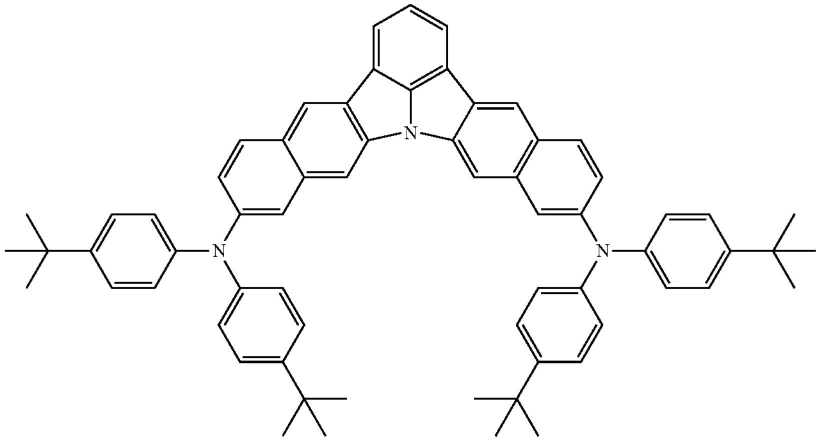
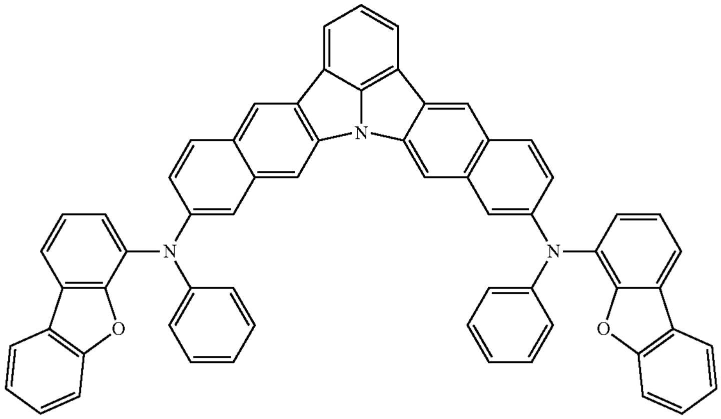
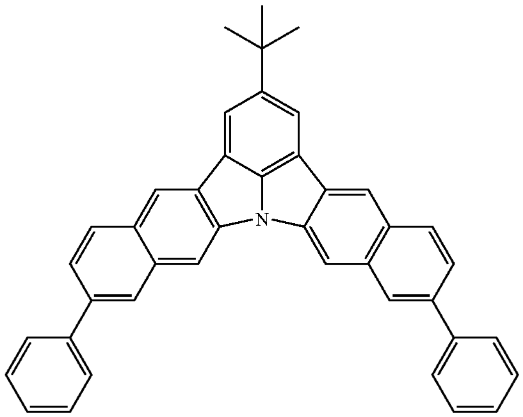
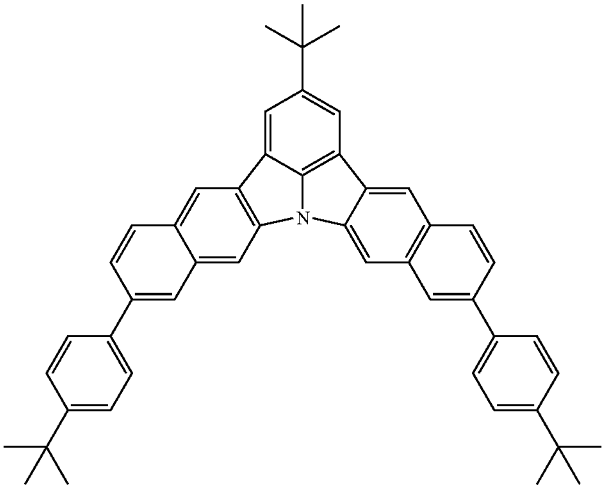

-continued
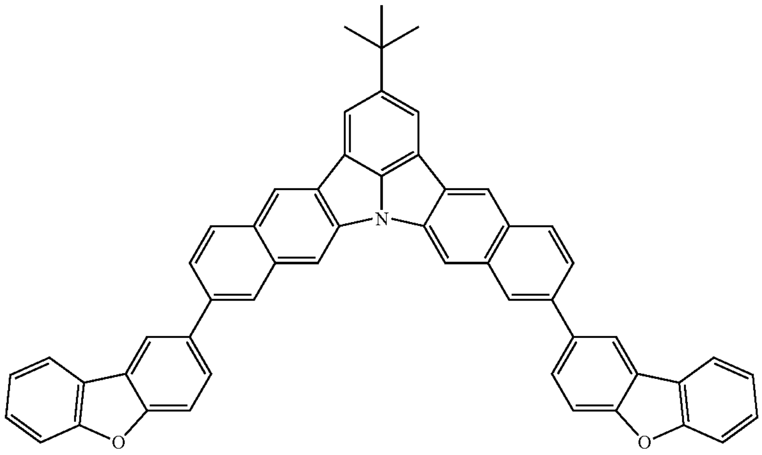
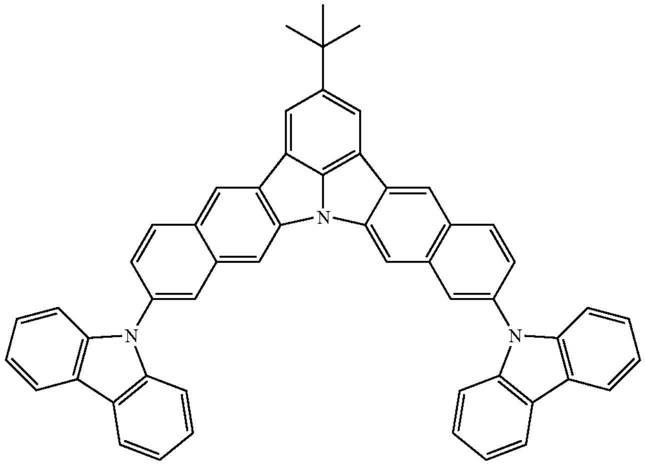
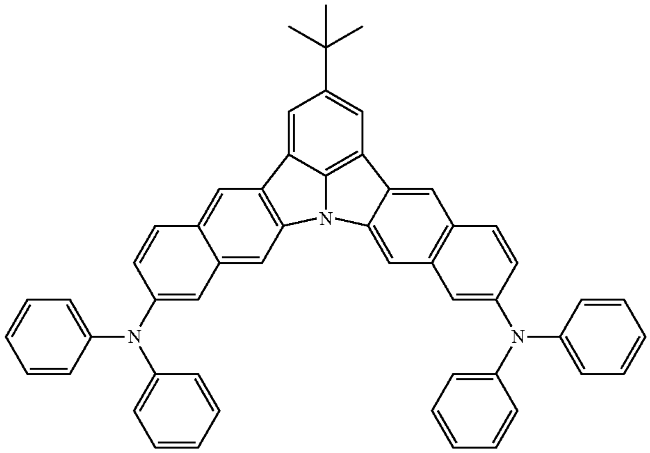

-continued
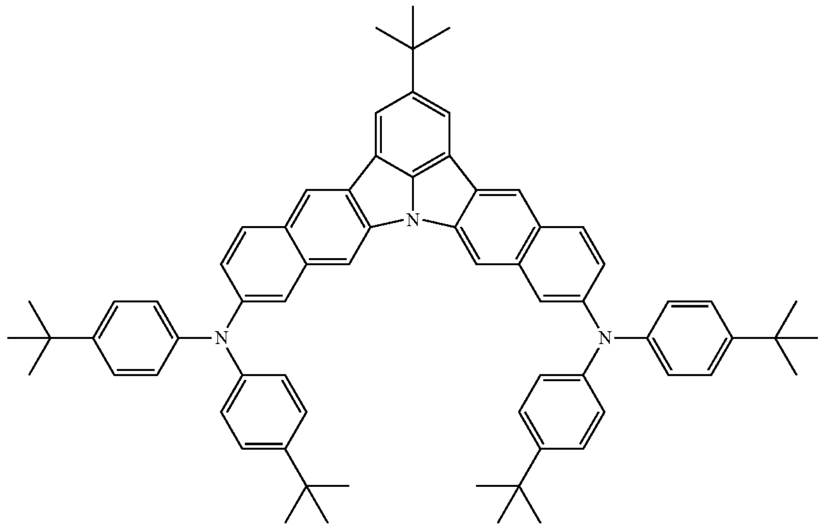
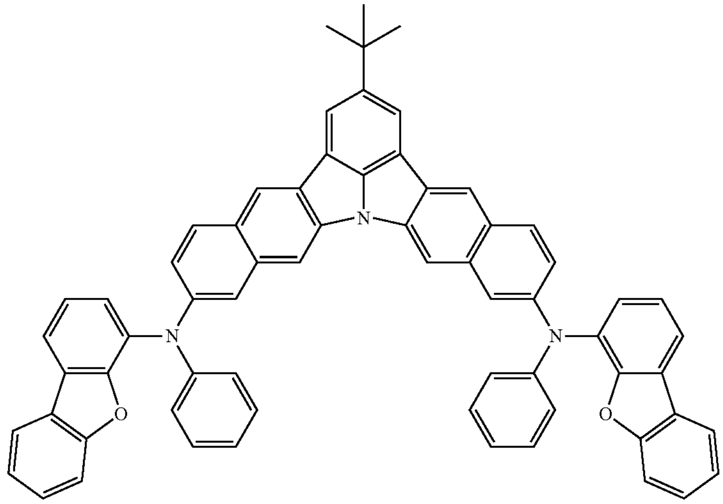
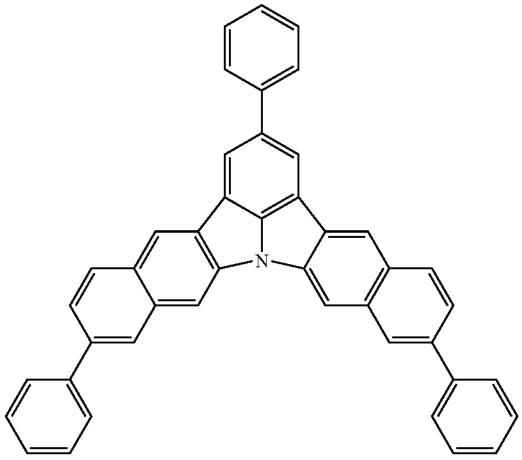

-continued
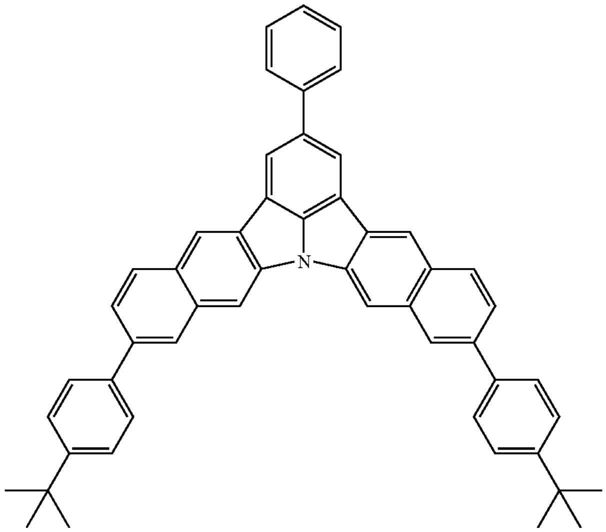
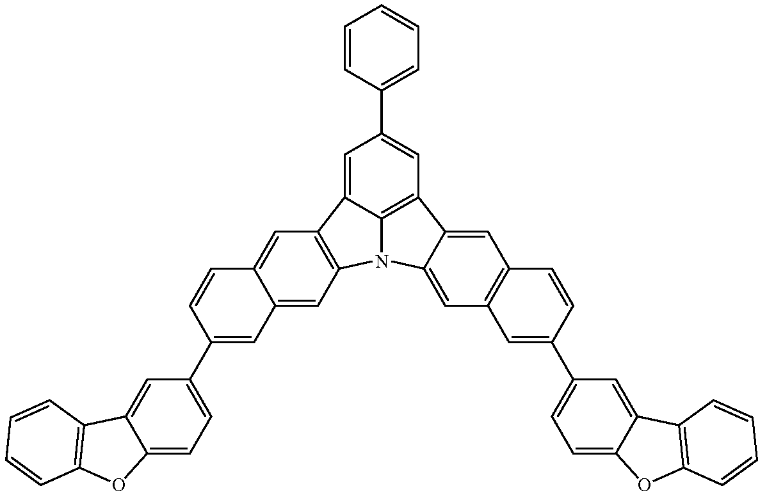
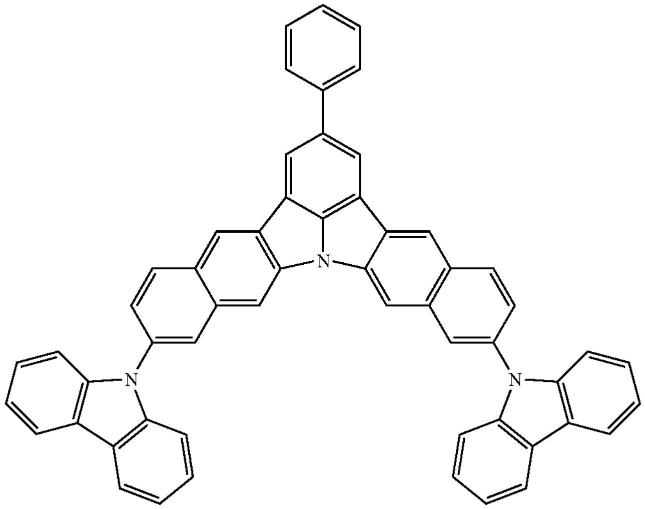

-continued
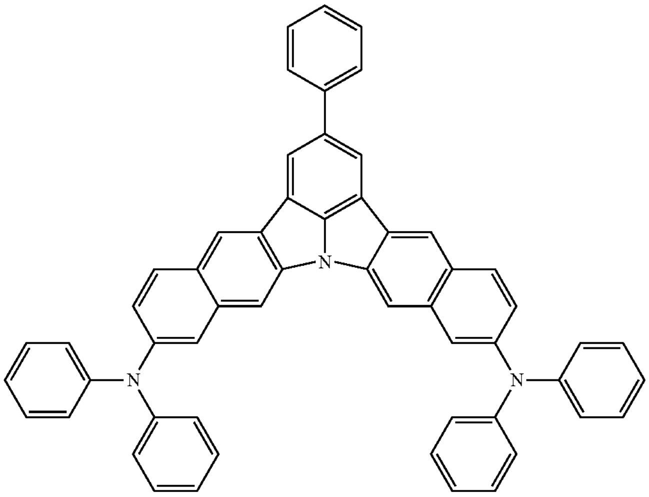
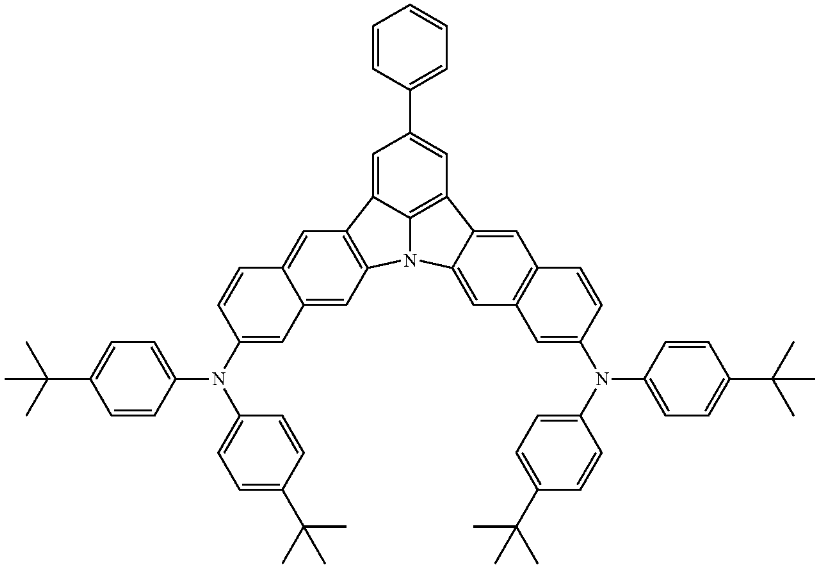
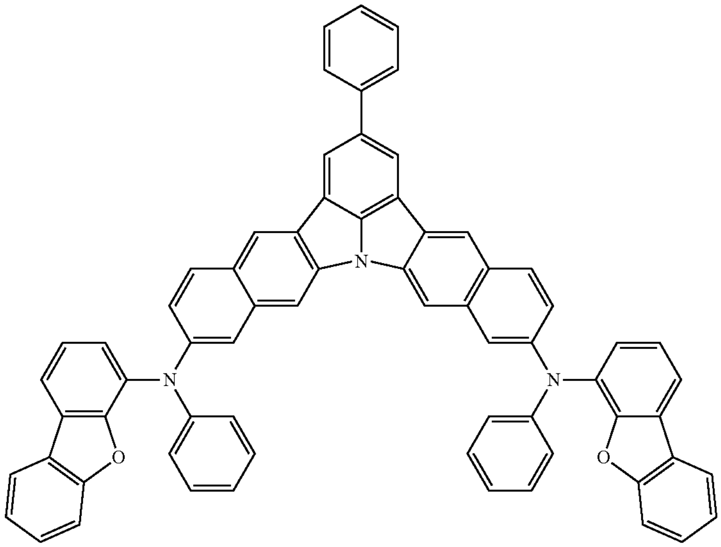

-continued
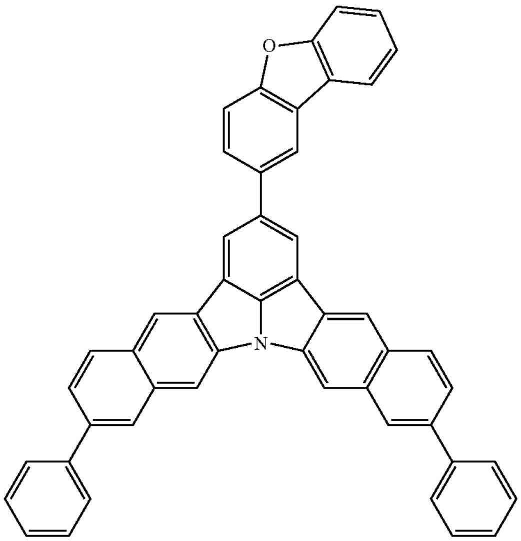
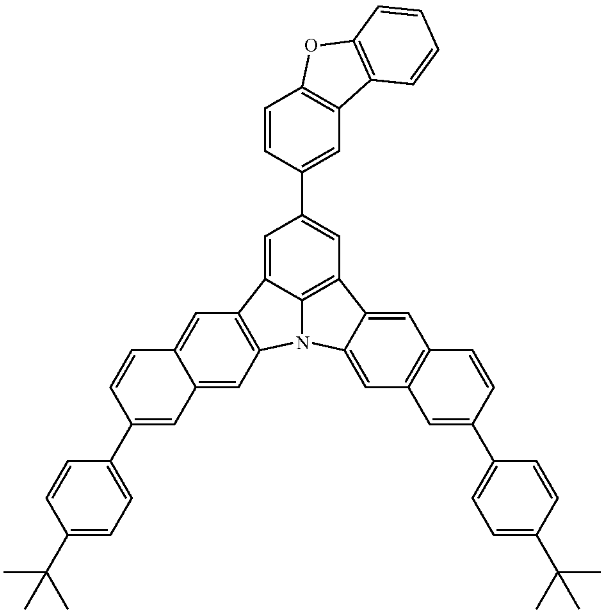
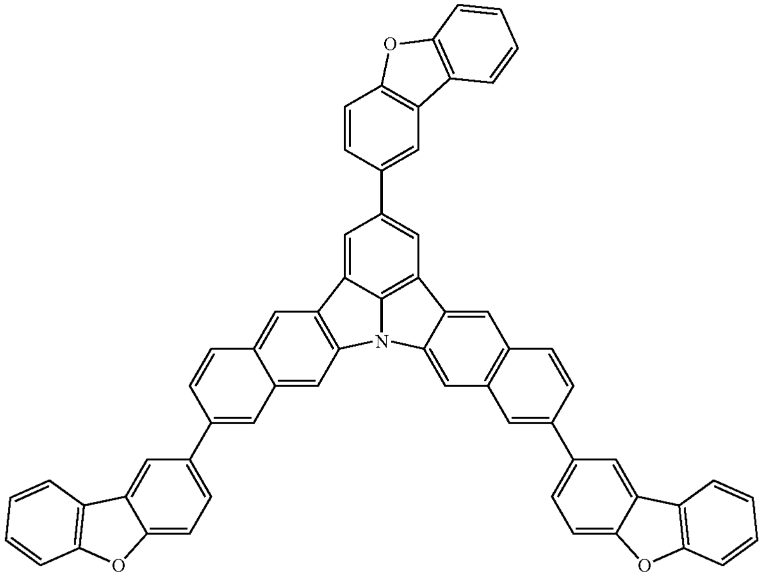

-continued
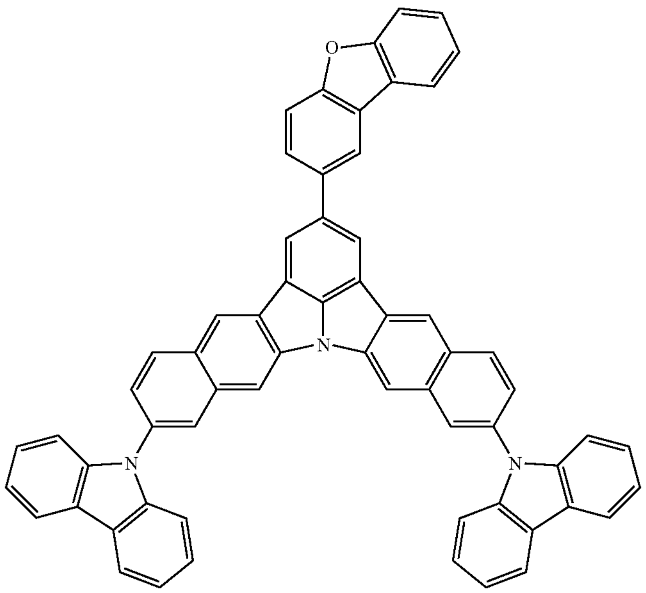
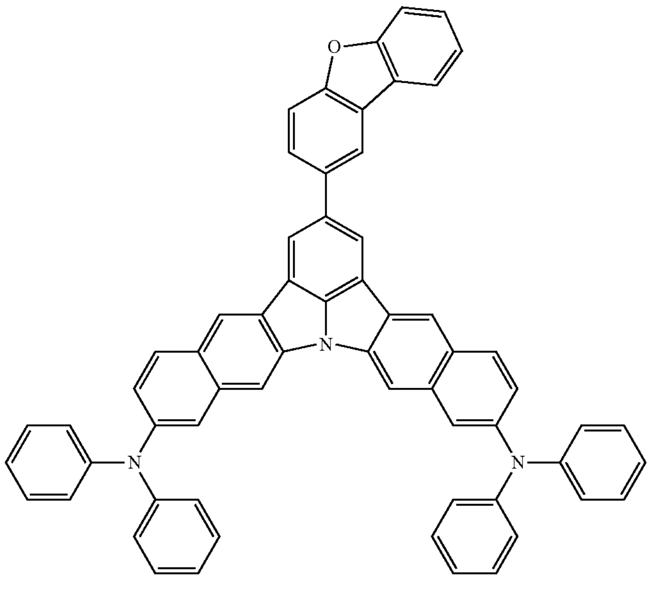

-continued
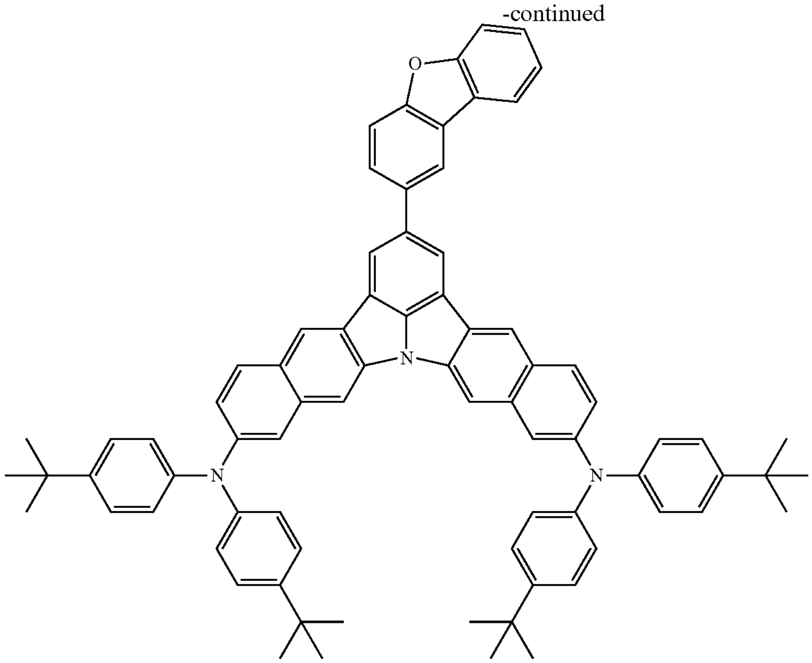
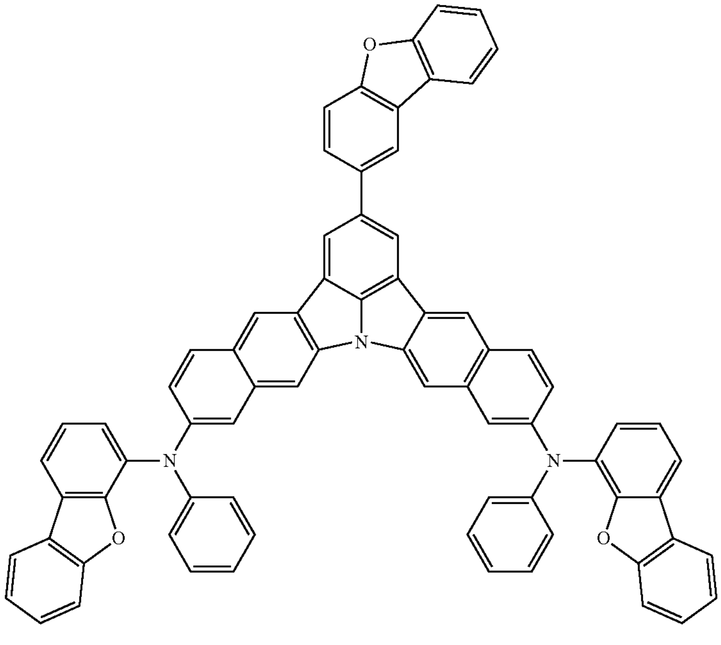

-continued
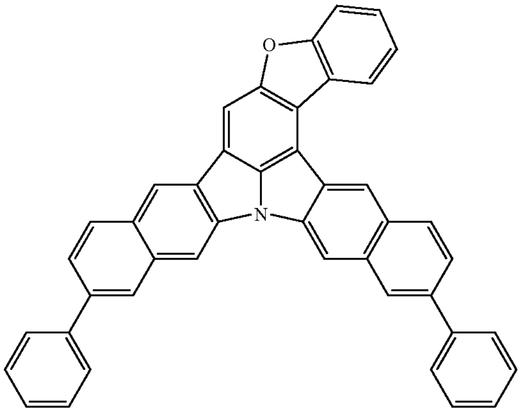
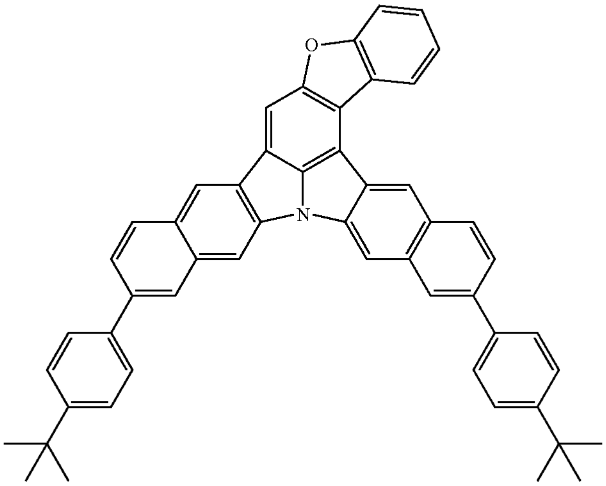
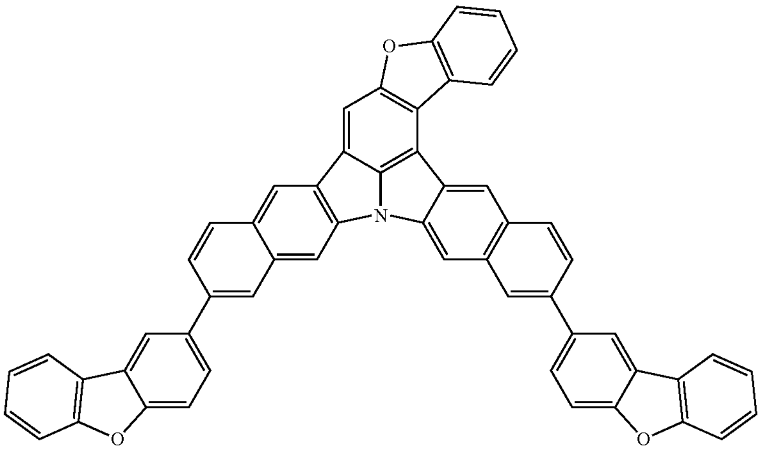
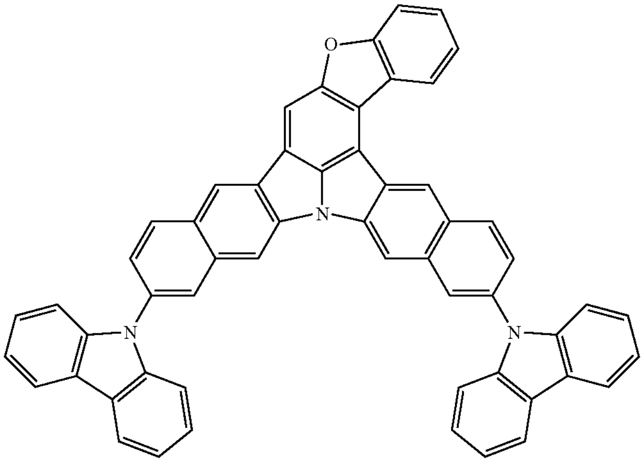

-continued
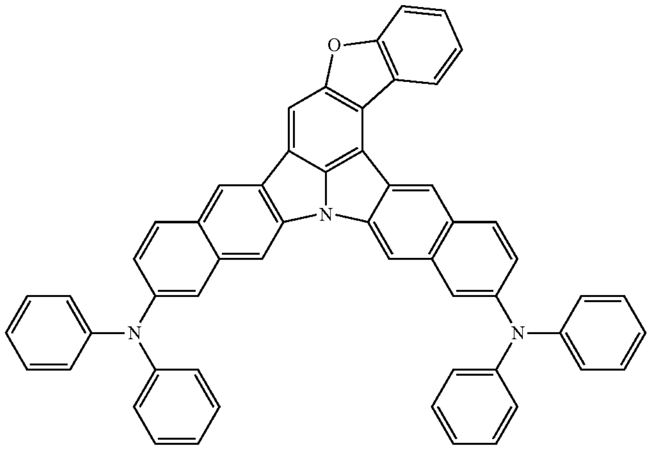
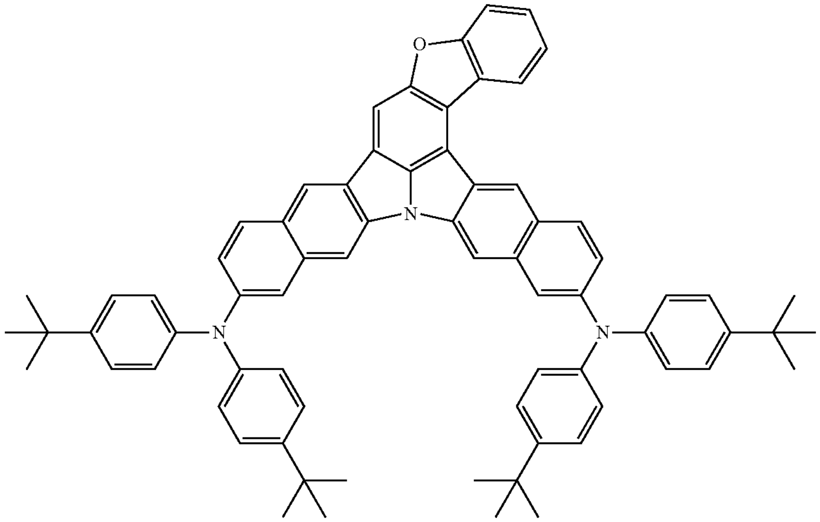
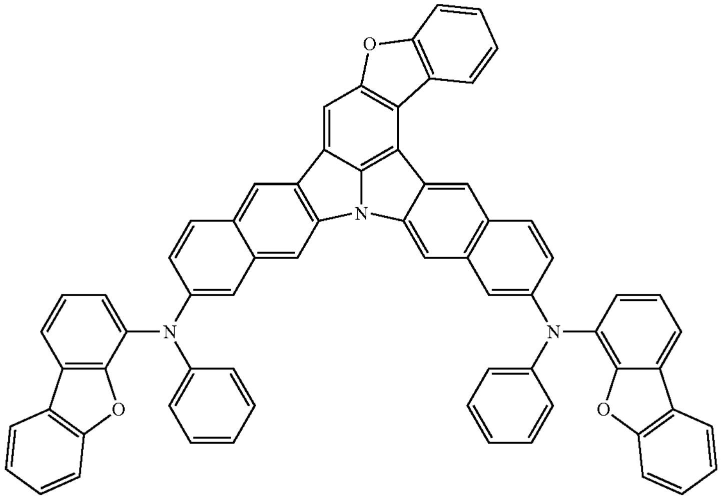

-continued
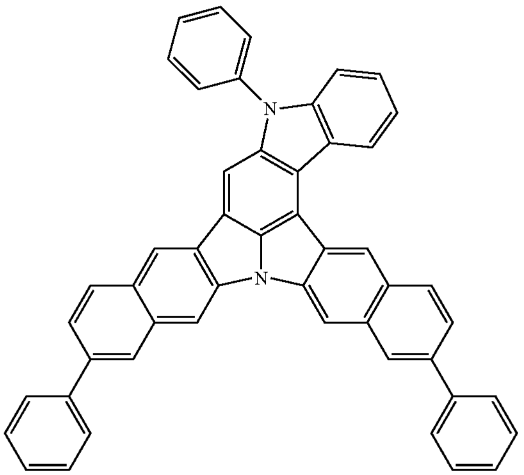
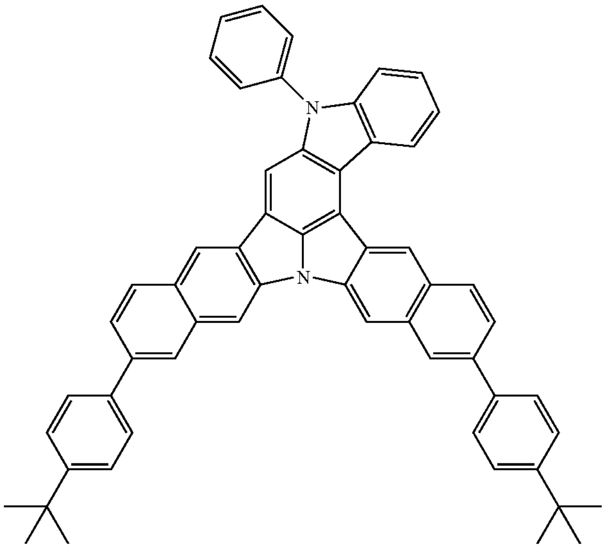
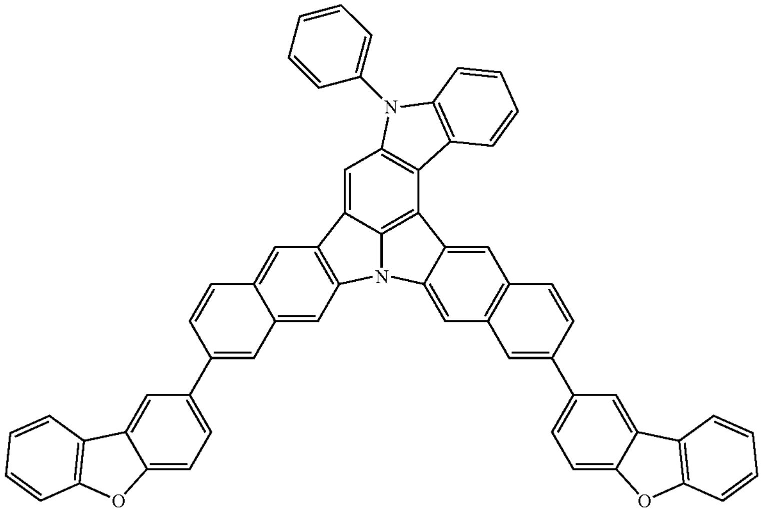
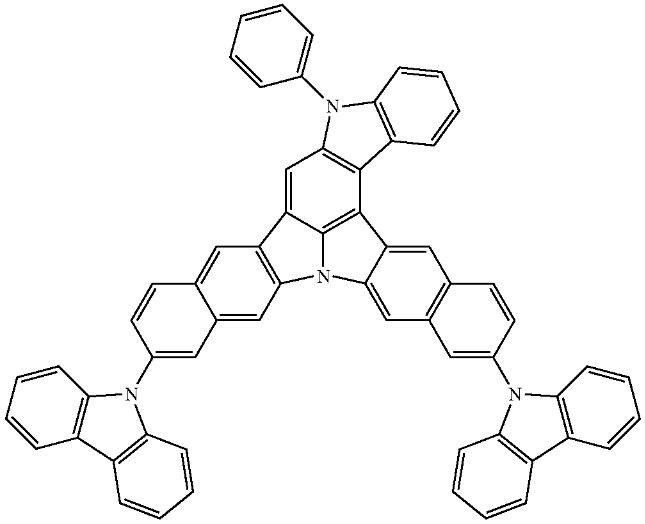

-continued
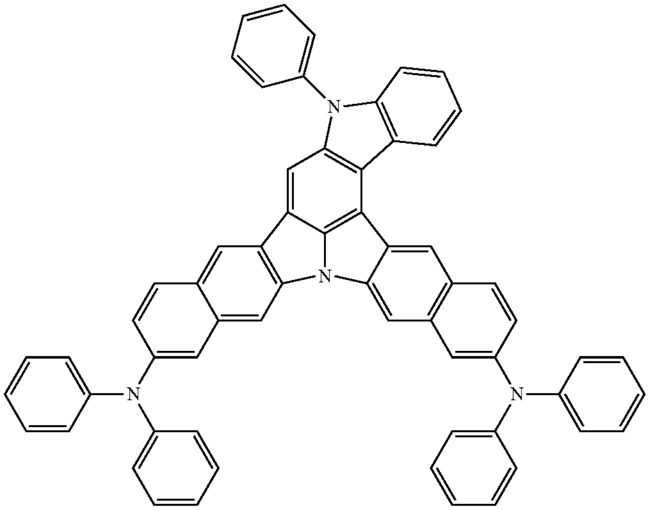
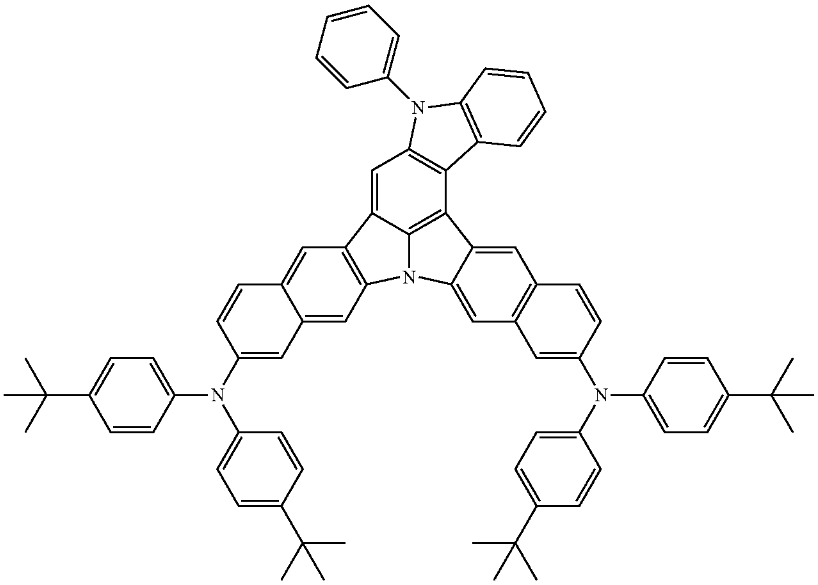
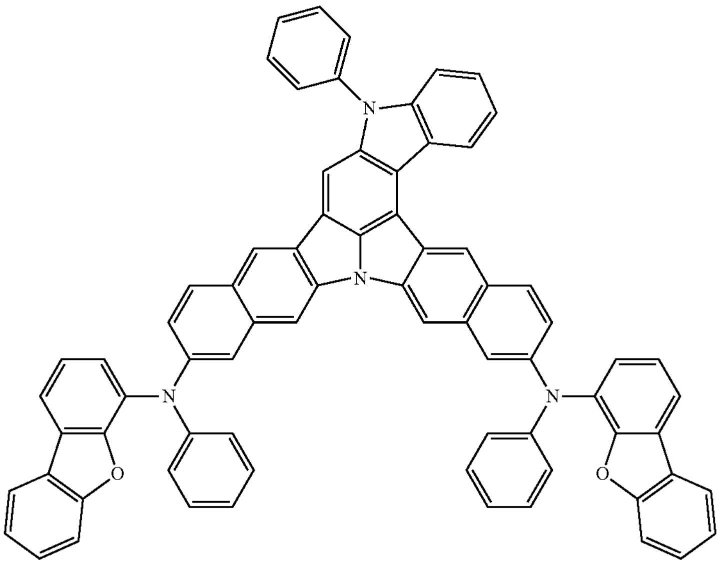

-continued
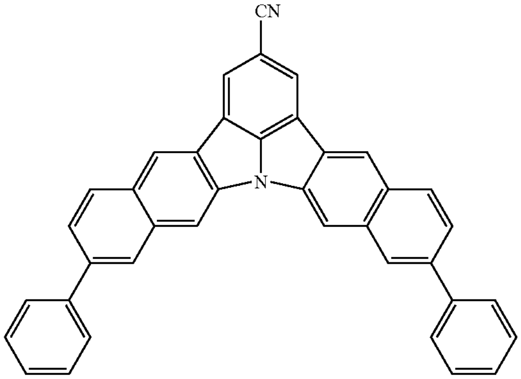
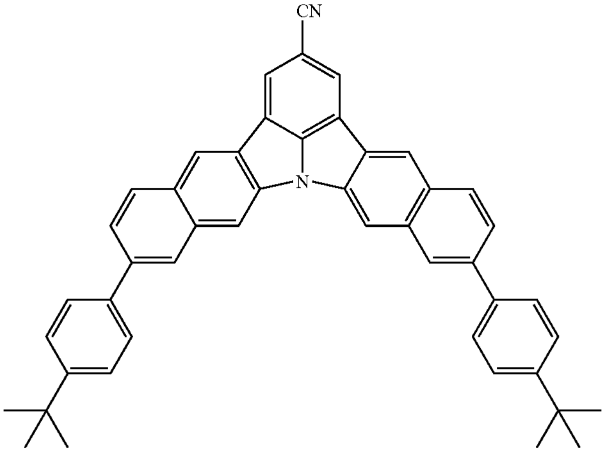
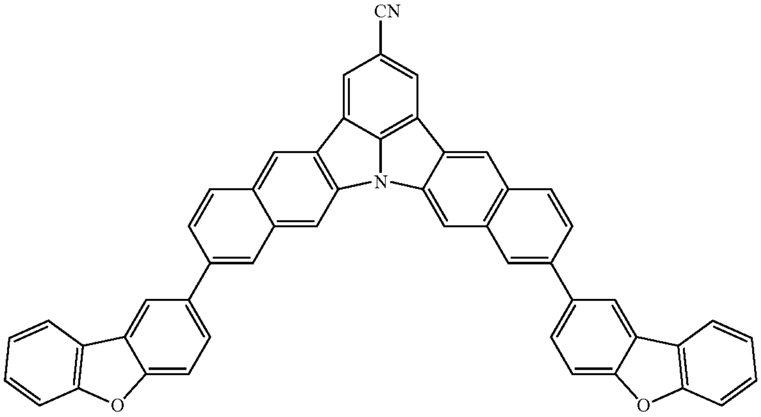
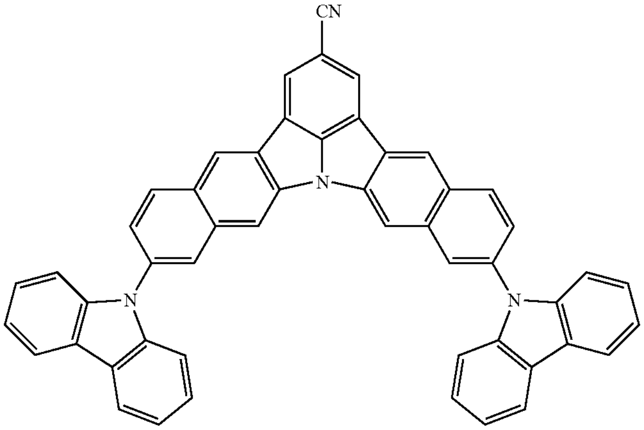
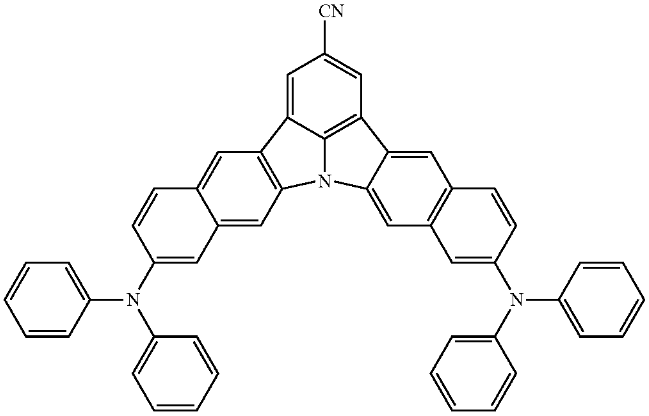

-continued
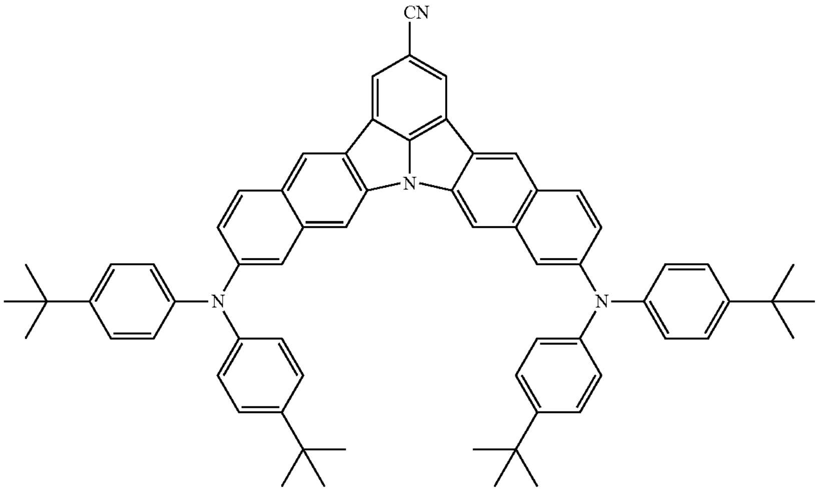
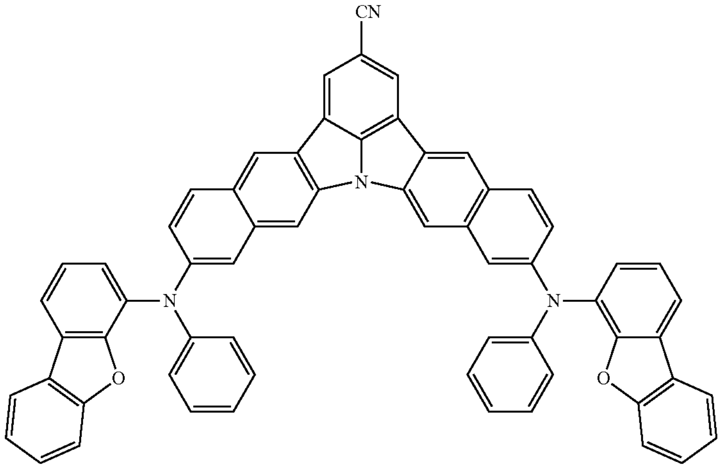
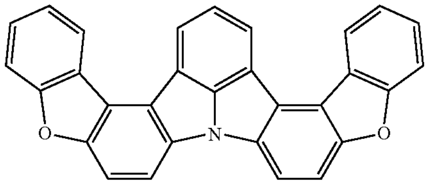
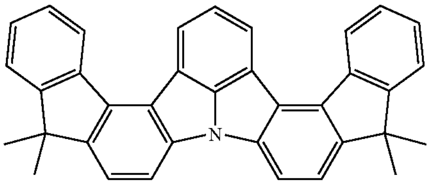
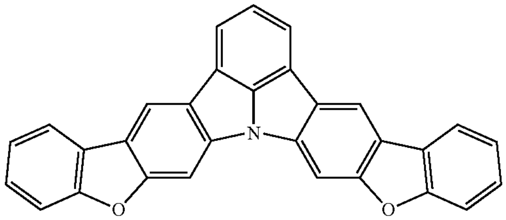
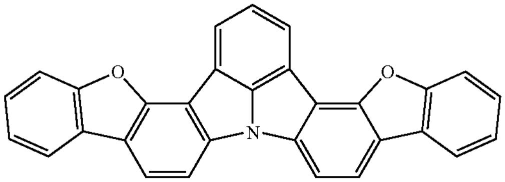
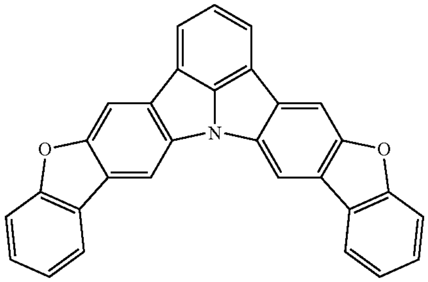
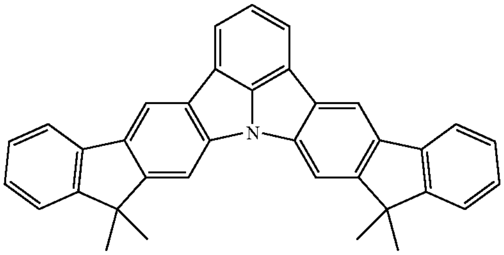

-continued
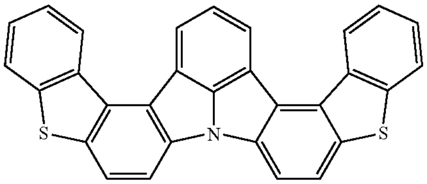
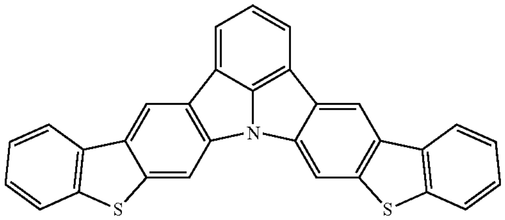
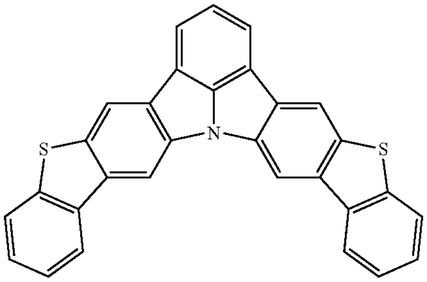
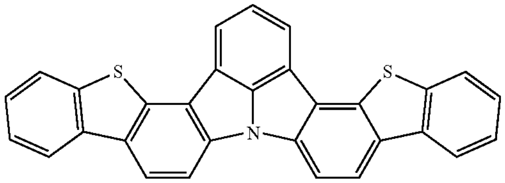
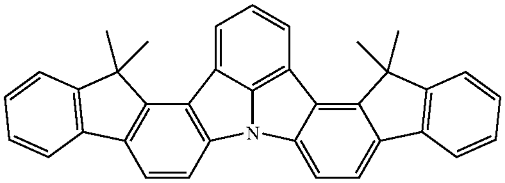
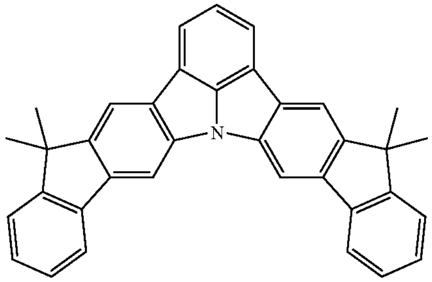
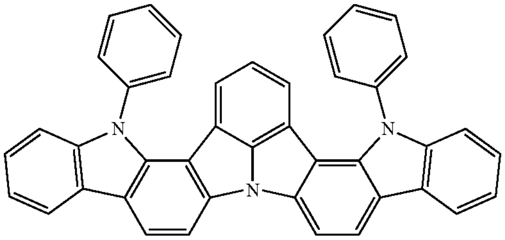
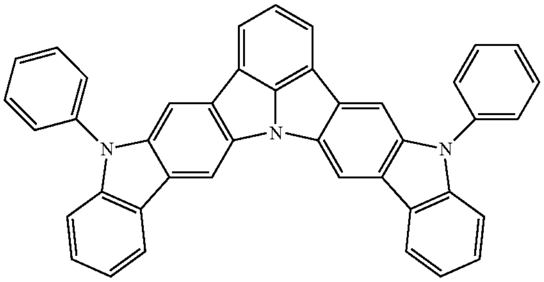
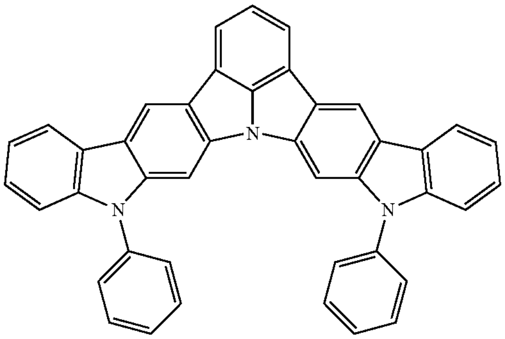
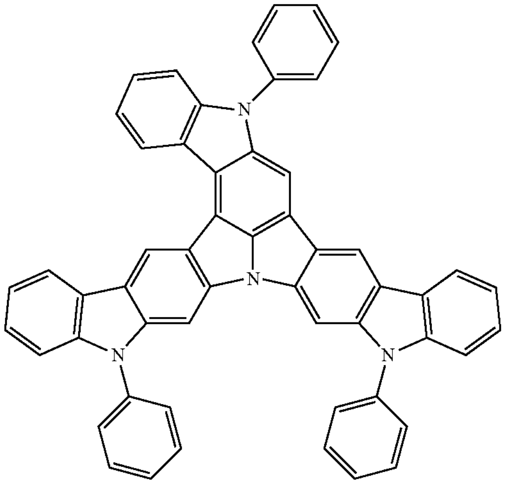

-continued
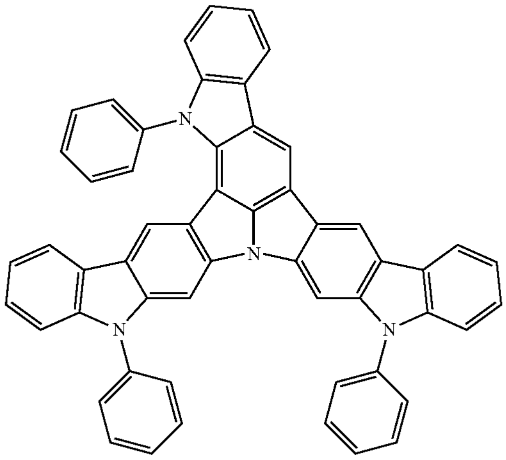
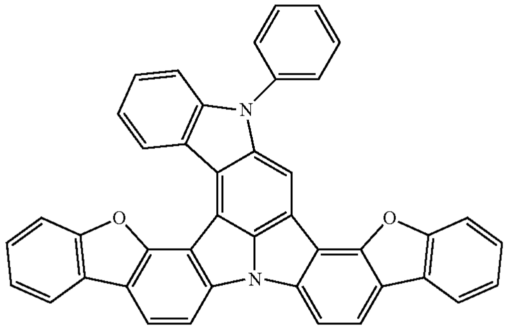
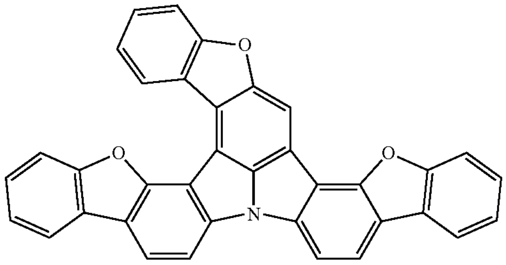
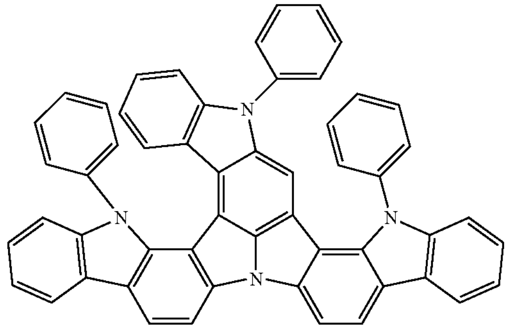
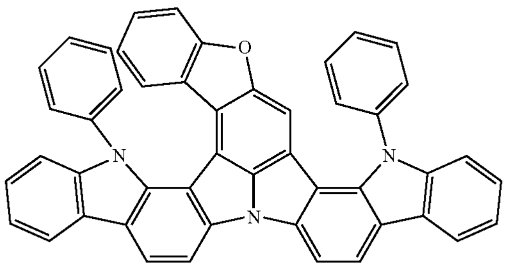
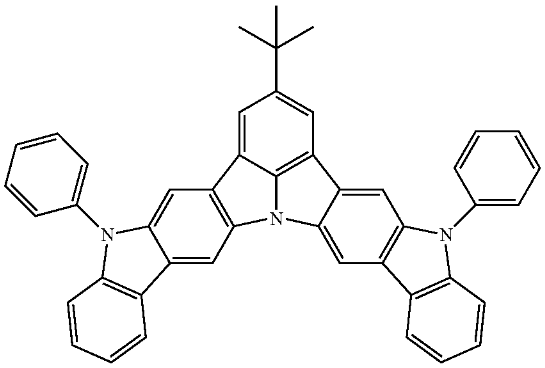
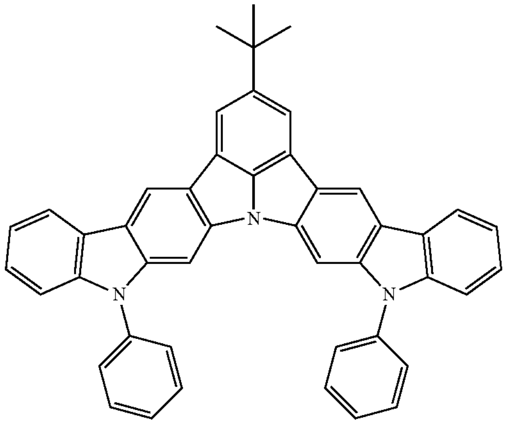
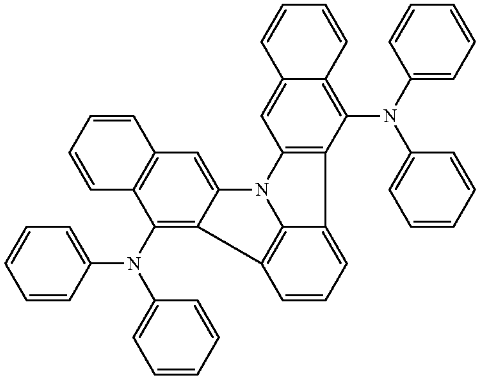

-continued
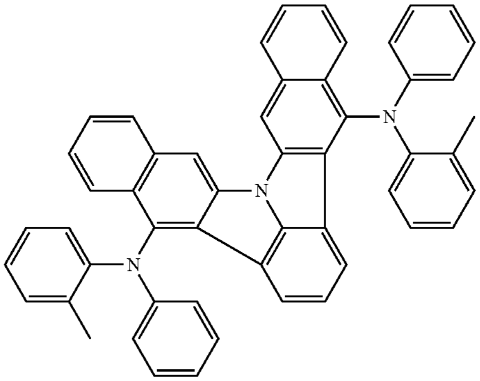
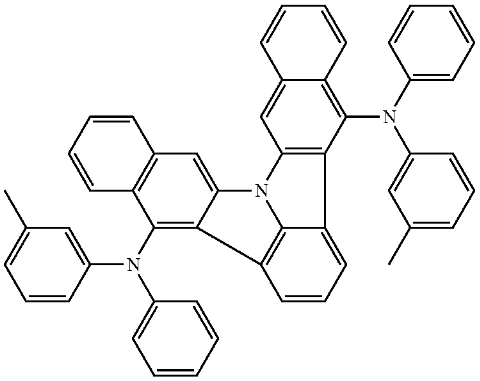
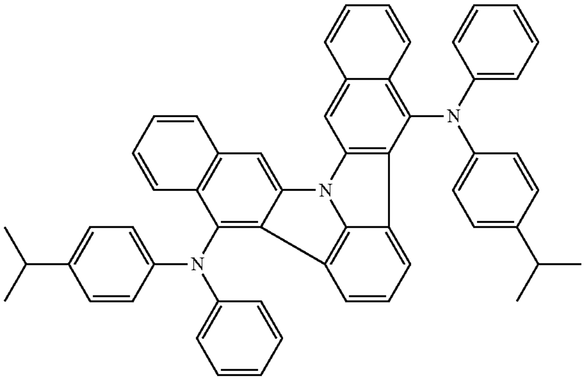
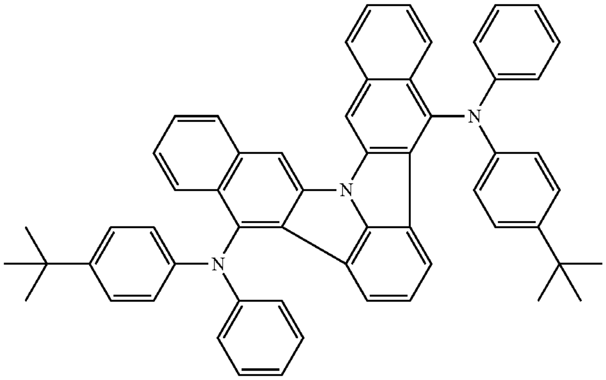
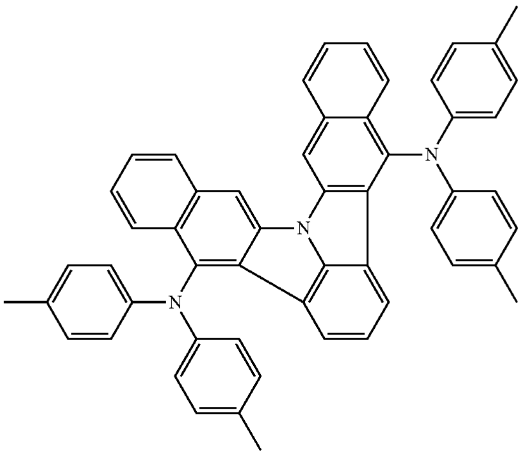
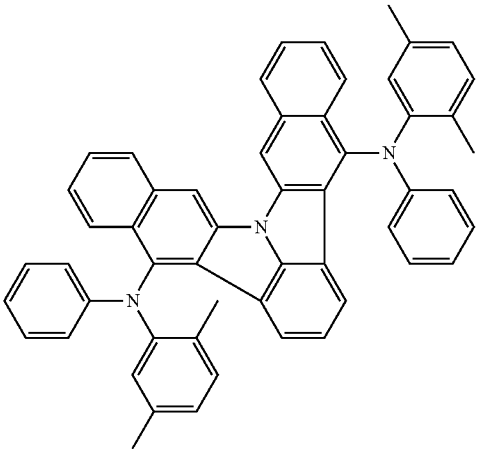

-continued
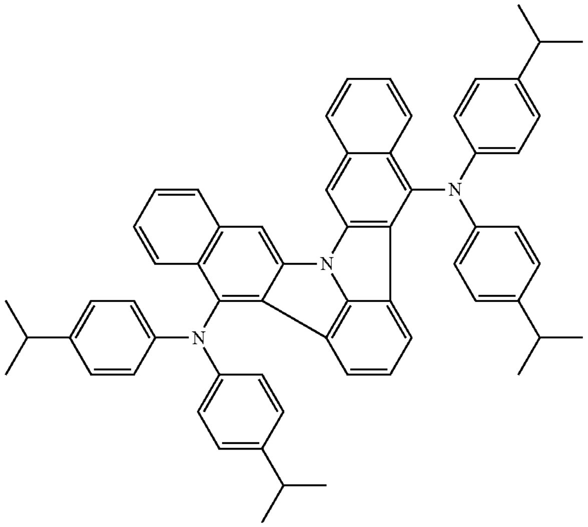
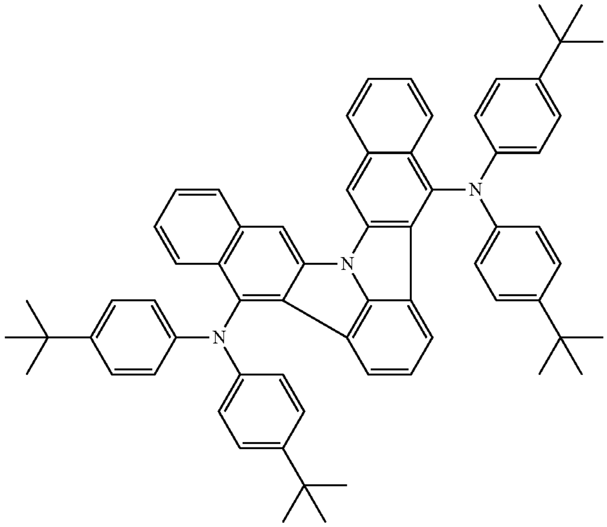
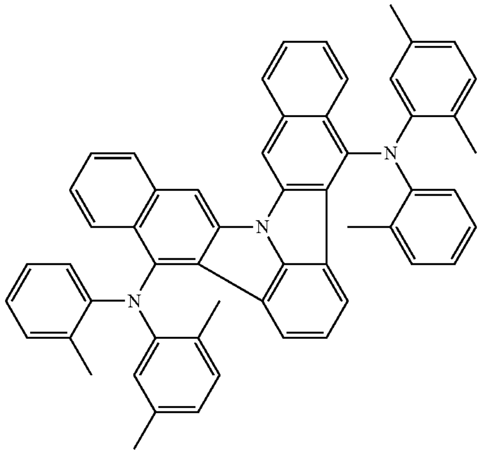
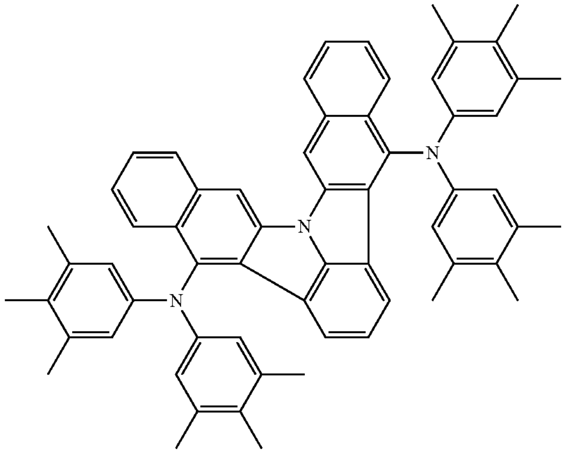

-continued
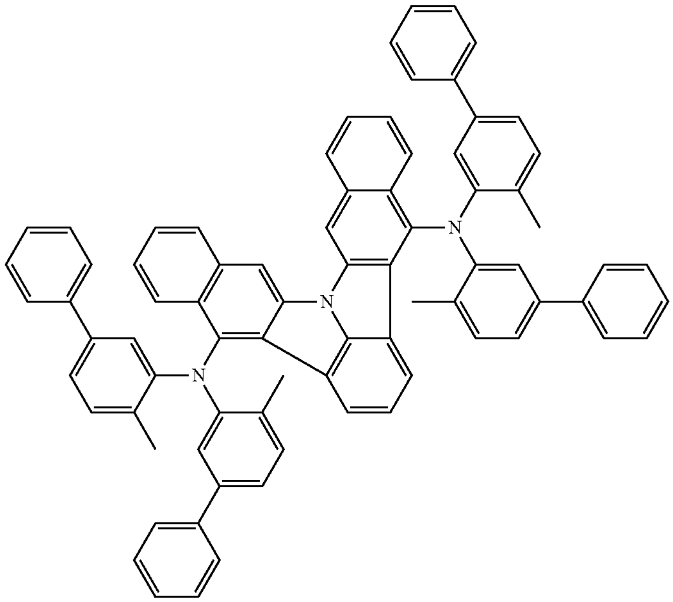
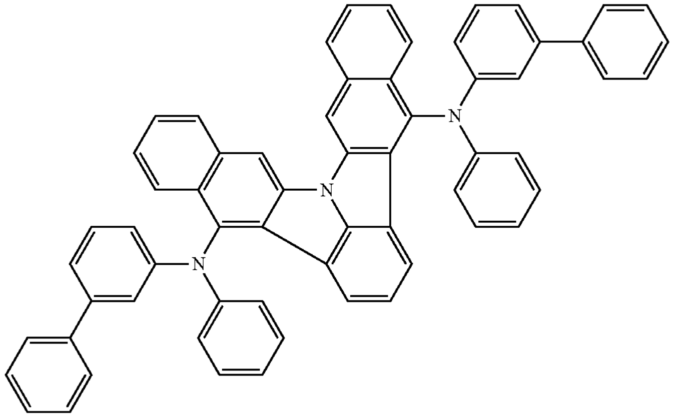
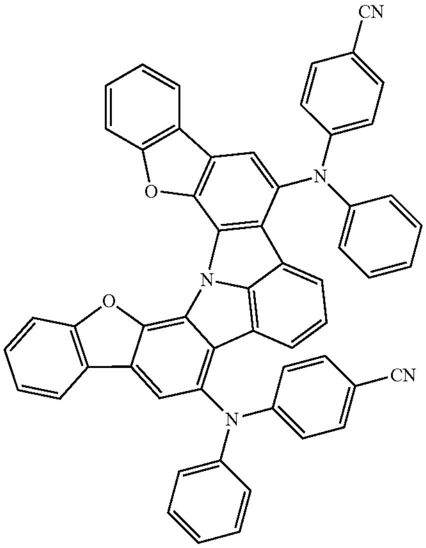

-continued
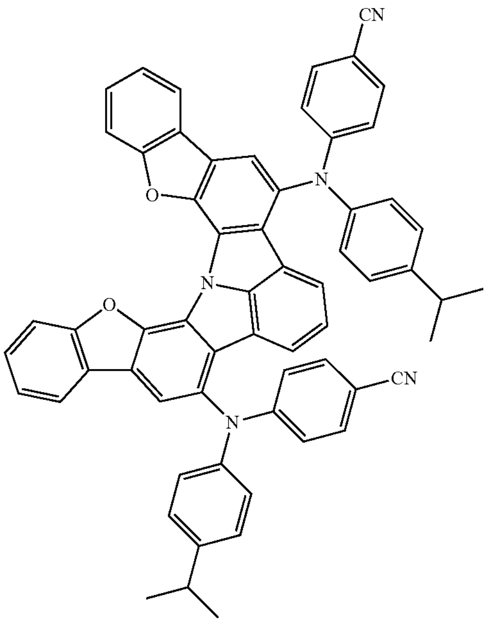
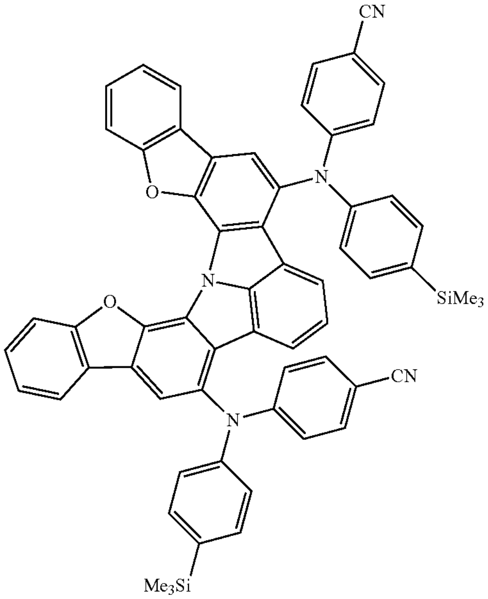
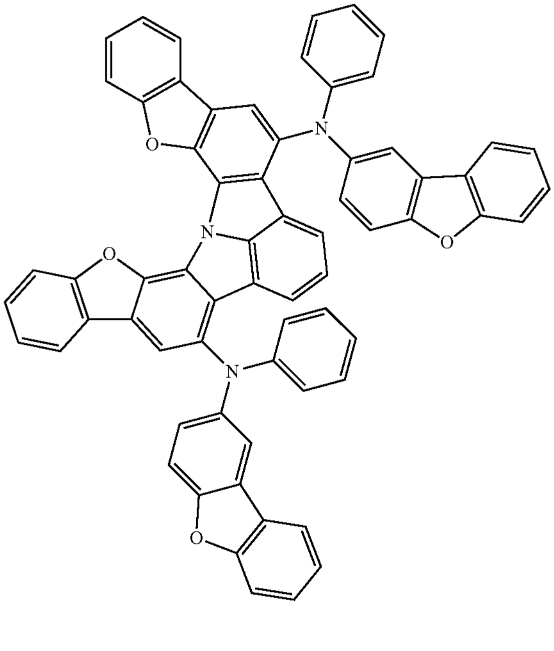
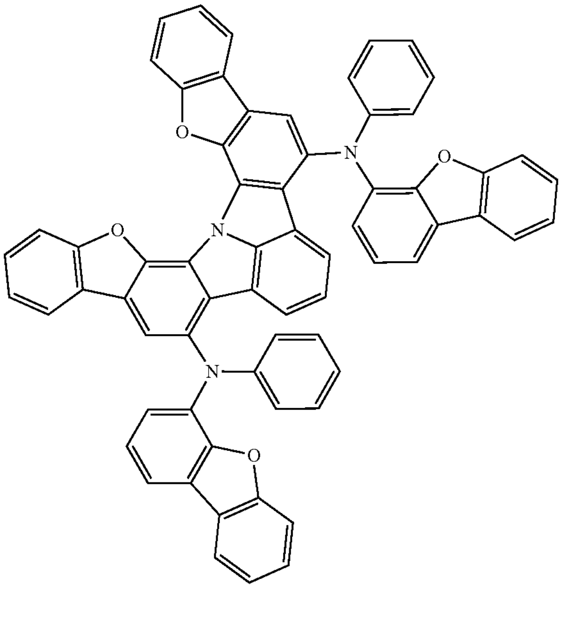

-continued
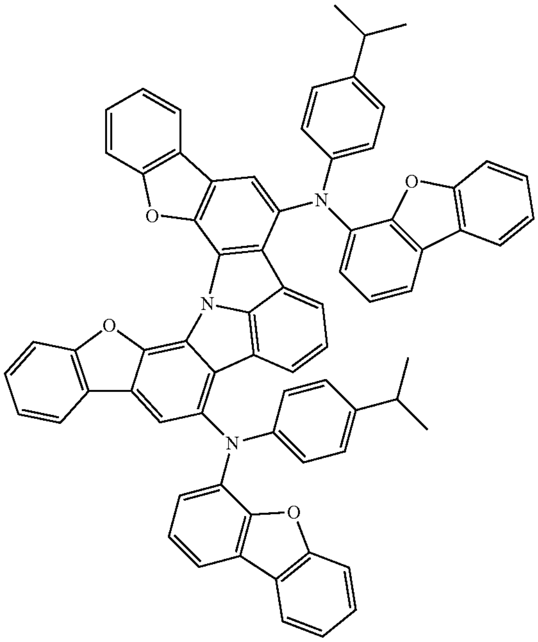
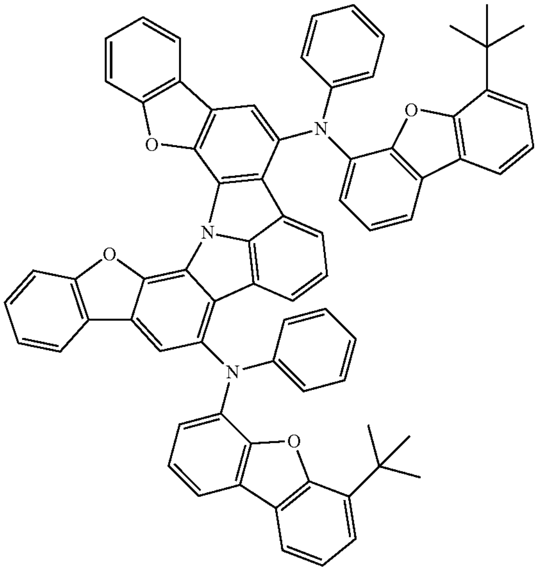
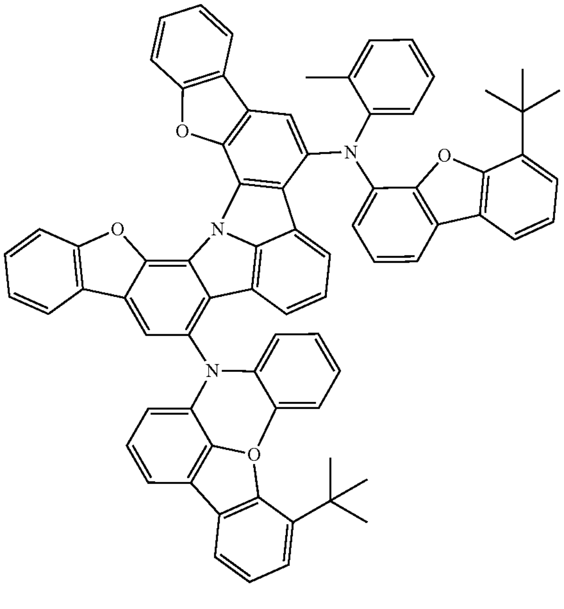

-continued
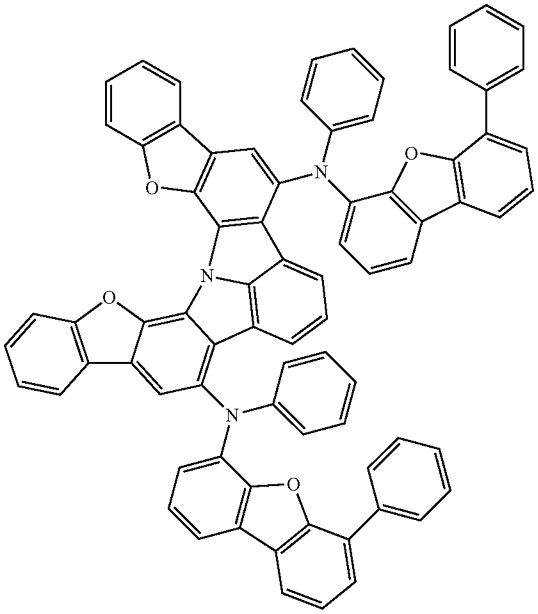
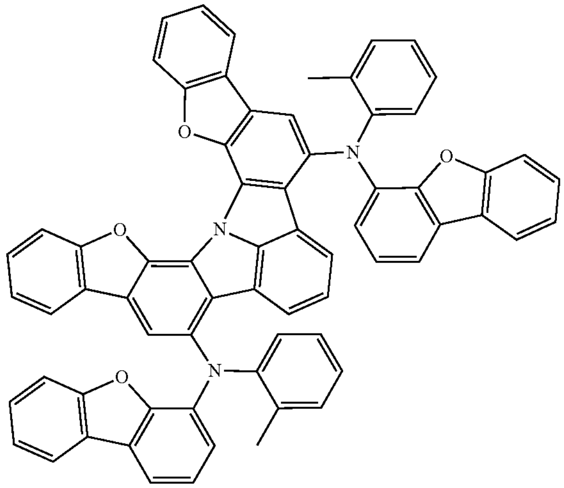
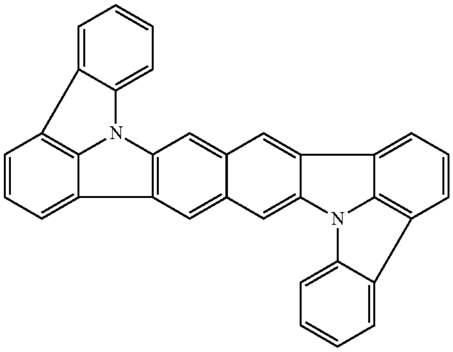
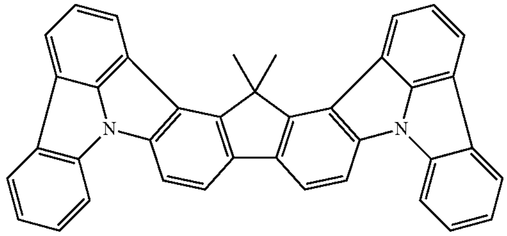
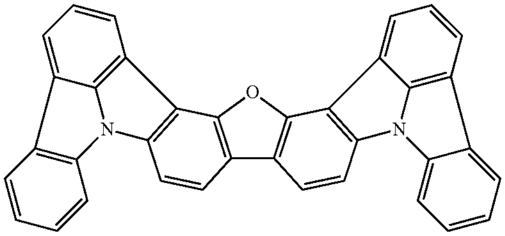
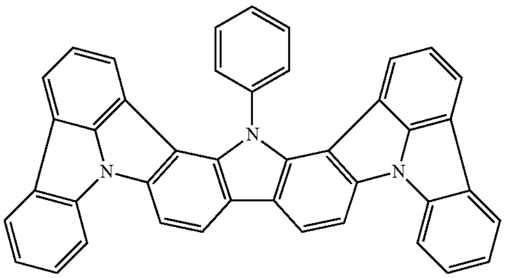
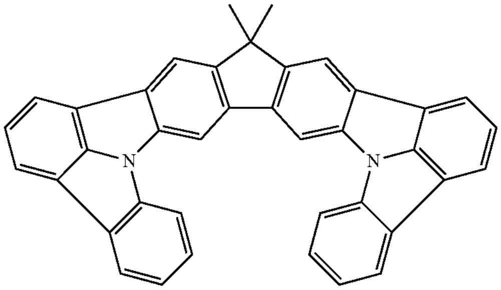
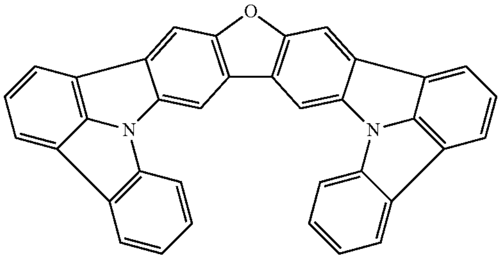

-continued
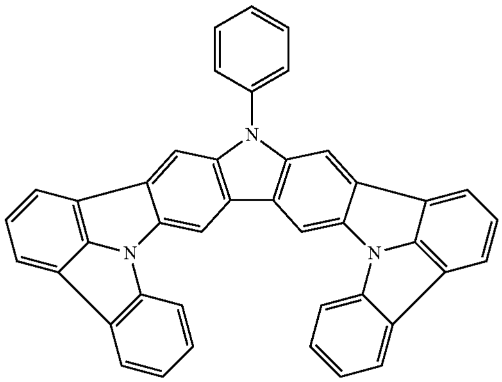
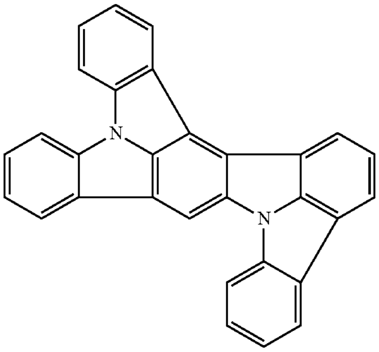
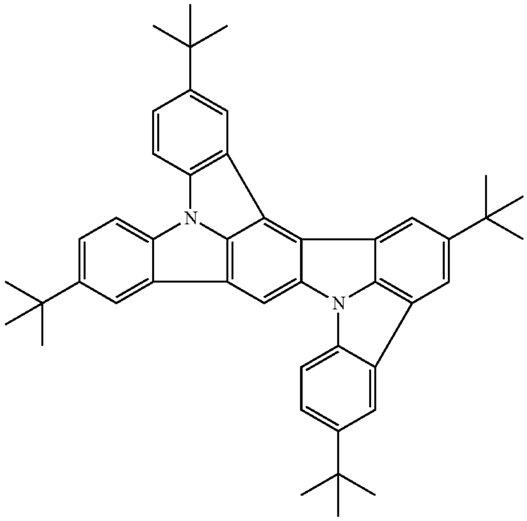
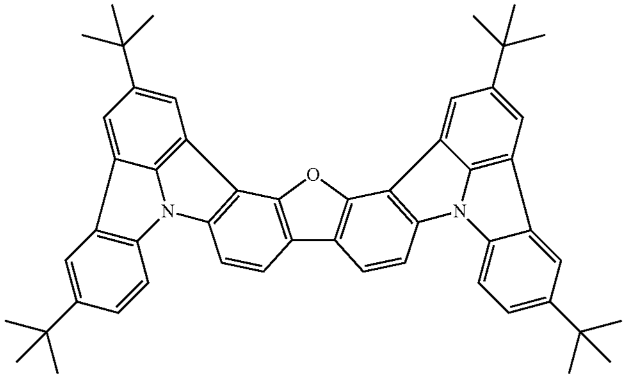 [SMILES: CC(C)(C)c1ccc2c(c1)c1cc(C(C)(C)C)cc3c4c5oc6c(ccc7c6c6cc(C(C)(C)C)cc8c9cc(C(C)(C)C)ccc9n7c86)c5ccc4n2c13]

(Compound Represented by Formula (31))

The compound represented by the formula (31) is explained below.

The compound represented by the formula (31) is a compound corresponding to the above-mentioned compound represented by the formula (21-3).

(31)

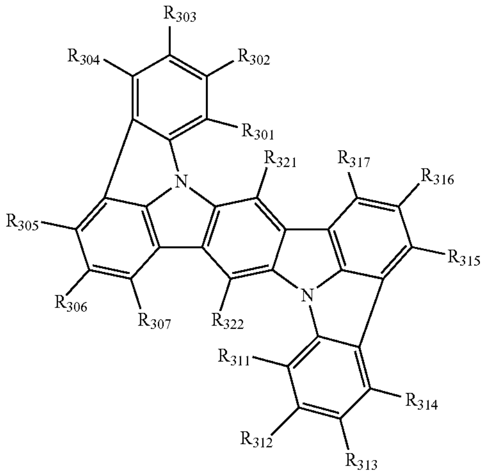

In the formula (31), one or more sets of adjacent two or more of $R_{301}$ to $R_{307}$ and $R_{311}$ to $R_{317}$ form a substituted or unsubstituted, saturated or unsaturated ring by bonding with each other, or do not form a substituted or unsubstituted, saturated or unsaturated ring;

$R_{301}$ to $R_{307}$ and $R_{311}$ to $R_{317}$ that do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{321}$ and $R_{322}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formulas (1).

Examples of "one set of adjacent two or more of $R_{301}$ to $R_{307}$ and $R_{311}$ to $R_{317}$" are sets of $R_{301}$ and $R_{302}$, $R_{302}$ and $R_{303}$, $R_{303}$ and $R_{304}$, $R_{305}$ and $R_{306}$, $R_{306}$ and $R_{307}$, $R_{301}$, $R_{302}$ and $R_{303}$, and the like.

In one embodiment, at least one, preferably two of $R_{301}$ to $R_{307}$ and $R_{311}$ to $R_{317}$ are groups represented by —$N(R_{906})(R_{907})$.

In one embodiment, $R_{301}$ to $R_{307}$ and $R_{311}$ to $R_{317}$ are independently a hydrogen atom, a substituted or unsubstituted aryl group including 6 to 50 ring carbon atoms, or a substituted or unsubstituted monovalent heterocyclic group including 5 to 50 ring atoms.

In one embodiment, the compound represented by the formula (31) is a compound represented by the following formula (32).

(32)

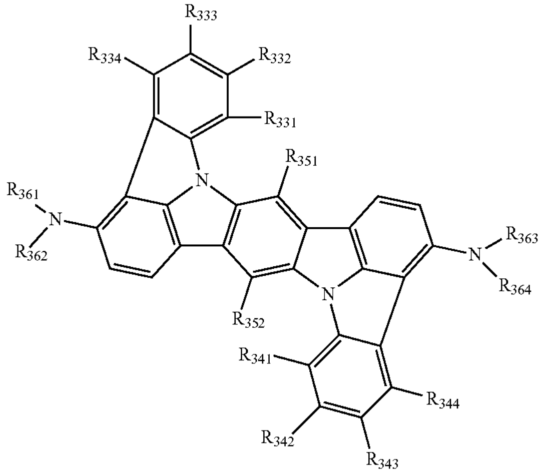

In the formula (32), one or more sets of adjacent two or more of $R_{331}$ to $R_{334}$ and $R_{341}$ to $R_{344}$ form a substituted or unsubstituted, saturated or unsaturated ring by bonding with each other, or do not form a substituted or unsubstituted saturated or unsaturated ring;

$R_{331}$ to $R_{334}$ and $R_{341}$ to $R_{344}$ that do not form the substituted or unsubstituted, saturated or unsaturated ring, and $R_{351}$ and $R_{352}$ are independently a hydrogen atom, a substituted or unsubstituted aryl group including 6 to 50 ring carbon atoms, or a substituted or unsubstituted monovalent heterocyclic group including 5 to 50 ring atoms; and $R_{361}$ to $R_{364}$ are independently a substituted or unsubstituted aryl group including 6 to 50 ring carbon atoms, or a substituted or unsubstituted monovalent heterocyclic group including 5 to 50 ring atoms.

In one embodiment, the compound represented by the formula (31) is a compound represented by the following formula (33).

(33)

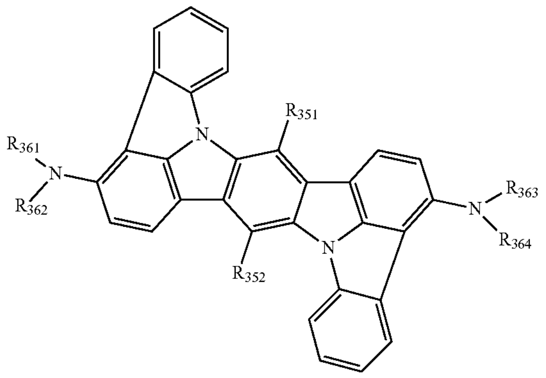

In the formula (33), $R_{351}$, $R_{352}$, and $R_{361}$ to $R_{364}$ are as defined in the formula (32).

In one embodiment, the compound represented by the formula (31) is a compound represented by the following formula (34) or (35):

(34)

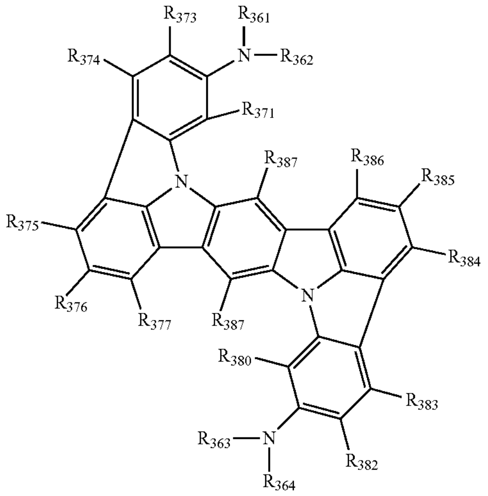

(35)

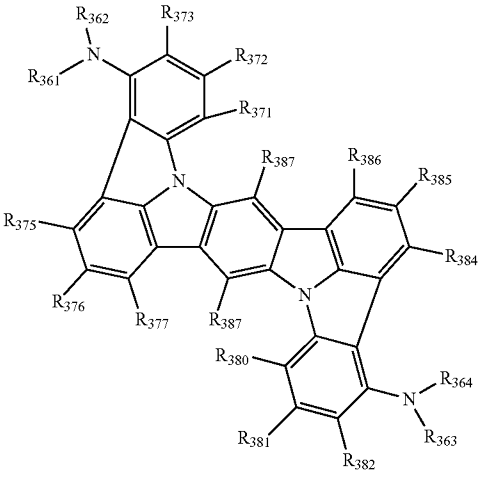

In the formulas (34) and (35), $R_{361}$ to $R_{364}$ are as defined in the formula (32);

one or more sets of adjacent two or more of $R_{371}$ to $R_{377}$ and $R_{380}$ to $R_{386}$ form a substituted or unsubstituted, saturated or unsaturated ring by bonding with each other, or do not form a substituted or unsubstituted, saturated or unsaturated ring;

$R_{371}$ to $R_{377}$ and $R_{380}$ to $R_{386}$ which do not form a substituted or unsubstituted, saturated or unsaturated ring, and $R_{387}$ are independently a hydrogen atom, a substituted or unsubstituted aryl group including 6 to 50 ring carbon atoms, or a substituted or unsubstituted monovalent heterocyclic group including 5 to 50 ring atoms; and two $R_{387}$'s may be the same as or different from each other.

In one embodiment, the compound represented by the formula (31) is a compound represented by the following formula (34-2) or (35-2):

(34-2)

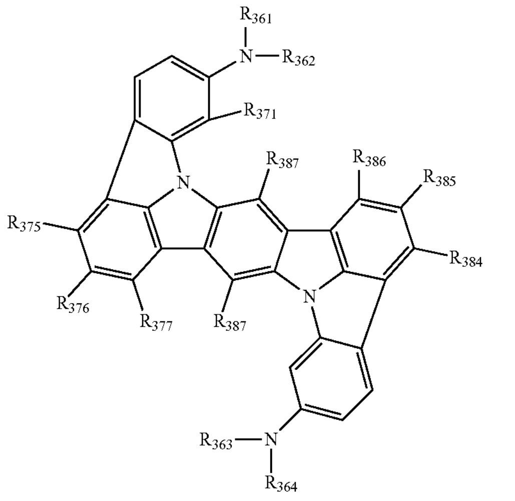

(35-2)

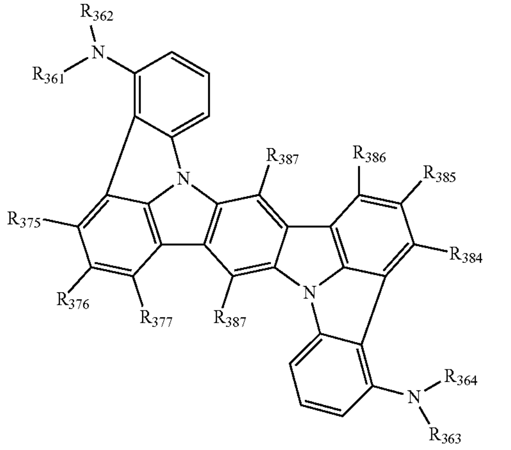

In the formulas (34-2) and (35-2), $R_{361}$ to $R_{364}$, $R_{375}$ to $R_{377}$, and $R_{384}$ to $R_{387}$ are as defined in the formulas (34) or (35).

In one embodiment, $R_{361}$ to $R_{364}$ in the formulas (32), (33), (34), (35), (34-2), and (35-2) are independently a substituted or unsubstituted aryl group including 6 to 50 ring carbon atoms (preferably a phenyl group).

In one embodiment, $R_{321}$ and $R_{322}$ in the formula (31), and $R_{351}$, $R_{352}$, and $R_{387}$ in the formulas (32), (33), (34), (35), (34-2), and (35-2) are independently a hydrogen atom or a substituted or unsubstituted aryl group including 6 to 50 ring carbon atoms (preferably a phenyl group).

In one embodiment, the compound represented by the formula (31) is one or more compounds selected from the group consisting of a compound represented by the following formula (32-11), a compound represented by the following formula (34-11), and a compound represented by the following formula (35-11):

(32-11)

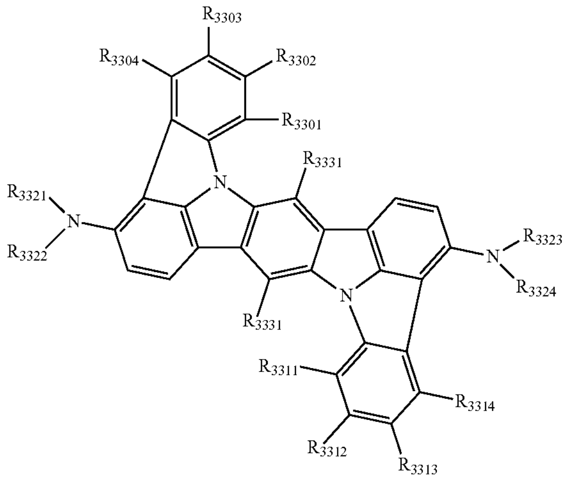

(34-11)

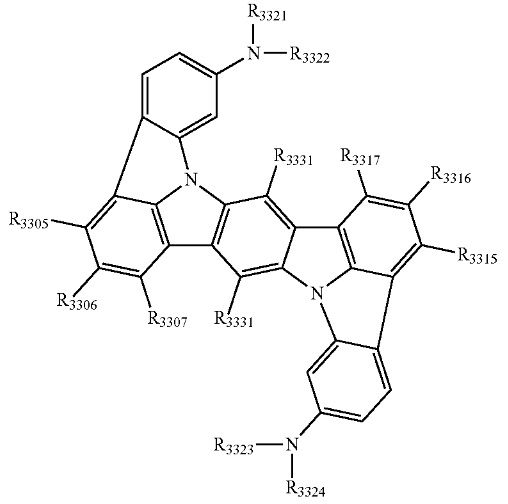

(35-11)

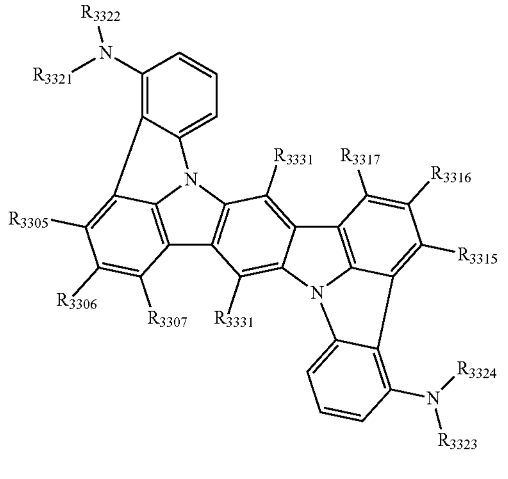

In the formulas (32-11), (34-11), and (35-11), one or more sets of adjacent two or more of $R_{3301}$ to $R_{3307}$ and $R_{3311}$ to $R_{3317}$ form a substituted or unsubstituted, saturated or unsaturated ring by bonding with each other, or do not form a substituted or unsubstituted, saturated or unsaturated ring;

$R_{3301}$ to $R_{3307}$ and $R_{3311}$ to $R_{3317}$ that do not form the substituted or unsubstituted, saturated or unsaturated ring, and $R_{3331}$ are independently a hydrogen atom, a substituted or unsubstituted aryl group including 6 to 20 ring carbon atoms, or a substituted or unsubstituted monovalent heterocyclic group including 5 to 20 ring atoms; two $R_{3331}$'s may be the same as or different from each other; and $R_{3321}$ to $R_{3324}$ are independently a substituted or unsubstituted aryl group including 6 to 20 ring carbon atoms, or a substituted or unsubstituted monovalent heterocyclic group including 5 to 20 ring atoms.

In one embodiment, one or more compounds selected from the group consisting of the compound represented by the formula (32-11), the compound represented by the formula (34-11), and the compound represented by the formula (35-11) are one or more compounds selected from the group consisting of a compound represented by the following formula (32-12), a compound represented by the following formula (34-12), and a compound represented by the following formula (35-12), respectively:

(32-12)

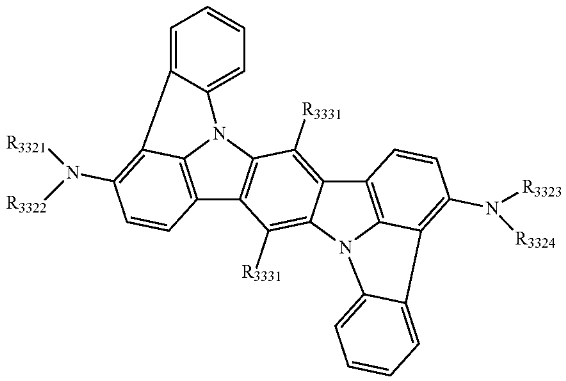

(34-12)

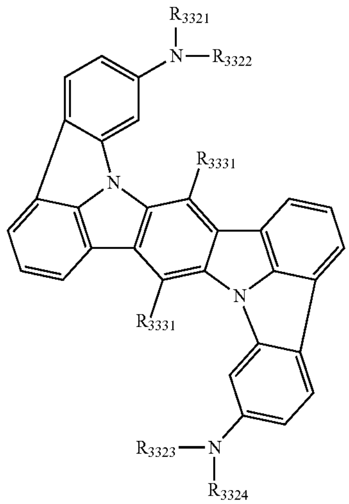

-continued (35-12)

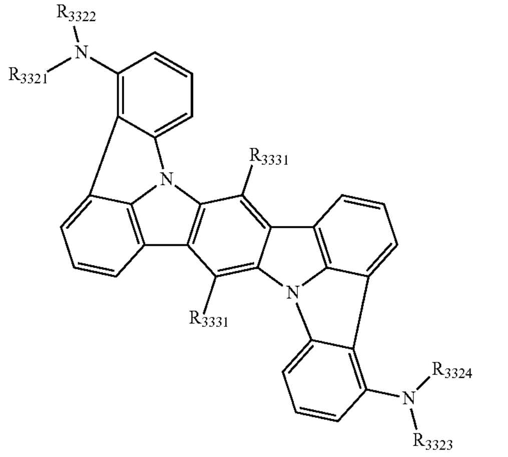

In the formulas (32-12), (34-12), and (35-12), $R_{3321}$ to $R_{3324}$ and $R_{3331}$ are as defined in the formulas (32-11), (34-11), or (35-11).

In one embodiment, in the formulas (32-11), (34-11), (35-11), (32-12), (34-12), and (35-12), $R_{3321}$ to $R_{3324}$ are independently a substituted or unsubstituted phenyl group.

In one embodiment, in the formulas (32-11), (34-11), (35-11), (32-12), (34-12), and (35-12), two $R_{3331}$'s are hydrogen atoms.

In one embodiment, in the formulas (32-11), (34-11), (35-11), (32-12), (34-12), and (35-12), the substituent in the case of "substituted or unsubstituted" is selected from the group consisting of an alkyl group including 1 to 20 carbon atoms, an aryl group including 6 to 20 ring carbon atoms, and a monovalent heterocyclic group including 5 to 20 ring atoms.

In one embodiment, in the formulas (32-11), (34-11), (35-11), (32-12), (34-12), and (35-12), the substituent in the case of "substituted or unsubstituted" is an alkyl group including 1 to 5 carbon atoms.

In one embodiment, in the formulas (32-11), (34-11), (35-11), (32-12), (34-12), and (35-12), $R_{3321}$ to $R_{3324}$ are independently a substituted or unsubstituted phenyl group and two $R_{3331}$'s are hydrogen atoms.

In one embodiment, in the formulas (32-11), (34-11), (35-11), (32-12), (34-12), and (35-12), $R_{3321}$ to $R_{3324}$ are independently a substituted or unsubstituted phenyl group, two $R_{3331}$'s are hydrogen atoms, and the substituent in the case of "substituted or unsubstituted" is selected from the group consisting of an alkyl group including 1 to 20 carbon atoms, an aryl group including 6 to 20 ring carbon atoms, and a monovalent heterocyclic group including 5 to 20 ring atoms.

In one embodiment, in the formulas (32-11), (34-11), (35-11), (32-12), (34-12), and (35-12), $R_{3321}$ to $R_{3324}$ are independently a substituted or unsubstituted phenyl group, two $R_{3331}$'s are hydrogen atoms, and the substituent in the case of "substituted or unsubstituted" is an alkyl group including 1 to 5 carbon atoms.

In one embodiment, in the compound represented by the formula (31), one or more sets of adjacent two or more of $R_{301}$ to $R_{307}$ and $R_{311}$ to $R_{317}$ form a substituted or unsubstituted, saturated or unsaturated ring by bonding with each other.

In one embodiment, the compound represented by the formula (31) is one or more compounds selected from the group consisting of compounds represented by each of the following formulas (36-1) to (36-6):

(36-1)

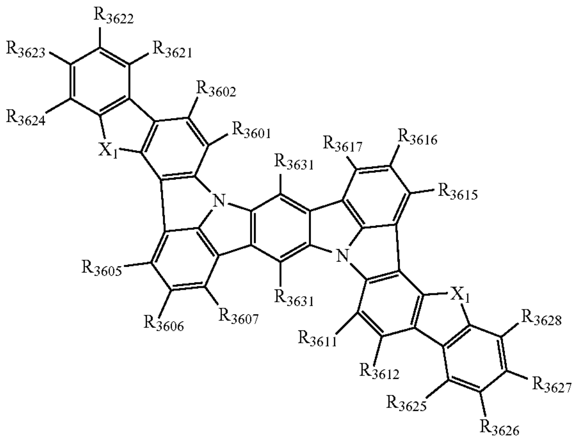

(36-2)

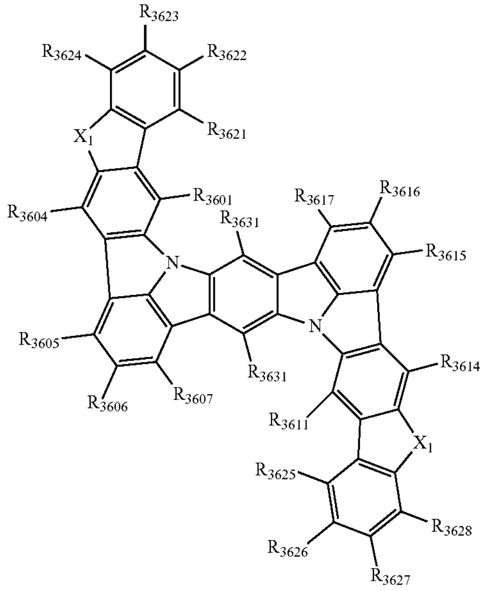

(36-3)

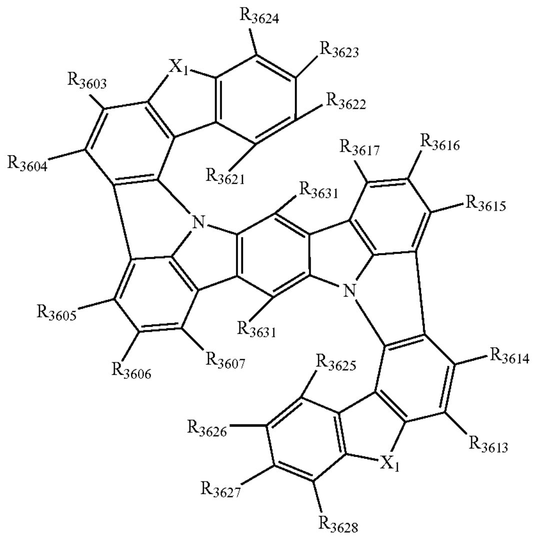

-continued (36-4)

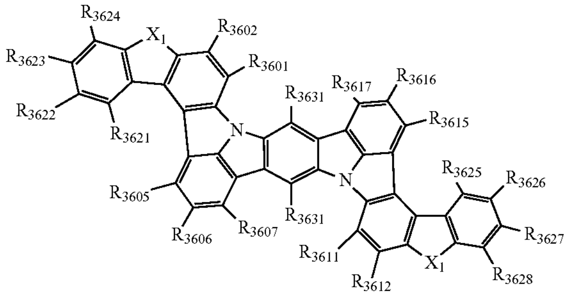

(36-5)

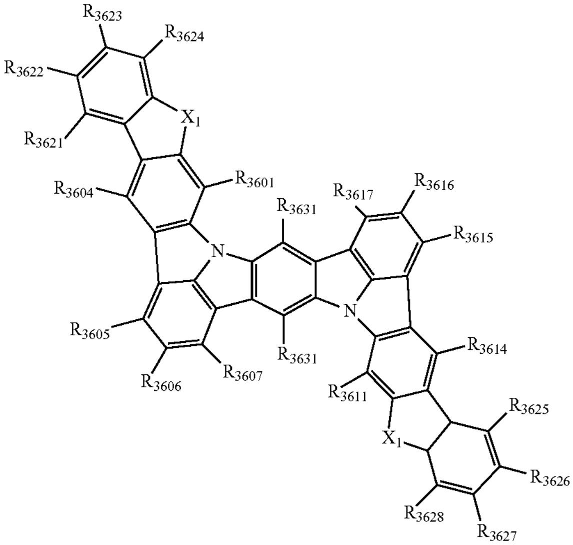

(36-6)

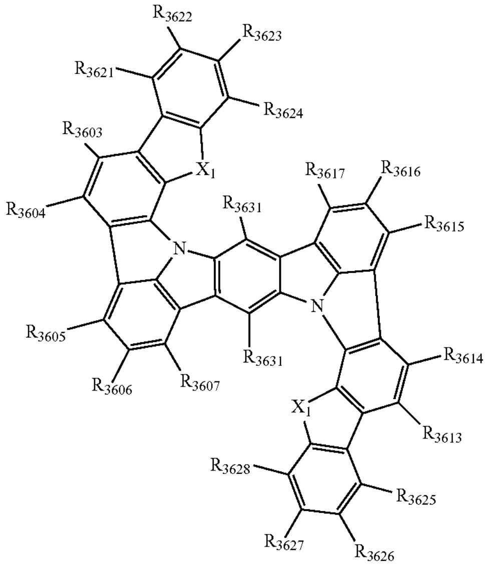

In the formulas (36-1) to (36-6), one or more sets of adjacent two or more of $R_{3605}$ to $R_{3607}$, $R_{3615}$ to $R_{3617}$, and $R_{3631}$ form a substituted or unsubstituted, saturated or unsaturated ring by bonding with each other, or do not form the ring;

one or more sets of adjacent two or more of $R_{3601}$ to $R_{3604}$, $R_{3611}$ to $R_{3614}$, and $R_{3621}$ to $R_{3628}$ form a substituted or unsubstituted, saturated or unsaturated ring by bonding with each other, or do not form the ring;

$R_{3601}$ to $R_{3607}$, $R_{3611}$ to $R_{3617}$, $R_{3621}$ to $R_{3628}$, and $R_{3631}$ that do not form the ring are independently a hydrogen atom, a halogen atom, a cyano group, a nitro group, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a substituted or unsubstituted aryl group including 6 to 50 ring carbon atoms, or a substituted or unsubstituted monovalent heterocyclic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when two or more of each of $R_{901}$ to $R_{907}$ are present, the two or more of each of $R_{901}$ to $R_{907}$ are the same as or different from each other;

$X_1$ is selected from O, S, and $N(R_{3641})$ and two $X_1$'s may be the same as or different from each other;

$R_{3641}$ forms a substituted or unsubstituted saturated or unsaturated ring by bonding with one or more selected from the group consisting of $R_{3601}$ to $R_{3604}$, $R_{3611}$ to $R_{3614}$, $R_{3624}$, and $R_{3628}$, or do not form the ring; and $R_{3641}$ which does not form the ring is a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

In one embodiment, the compound represented by the formula (31) is a compound represented by the formula (36-1) or the formula (36-2), and in one embodiment, the compound represented by the formula (31) is a compound represented by the formula (36-1).

In one embodiment, in the compounds represented by each of the formulas (36-1) to (36-6), two $R_{3631}$'s are phenyl groups.

In one embodiment, in the compounds represented by each of the formulas (36-1) to (36-6), $X_1$ is $N(R_{3641})$.

In one embodiment, in the compounds represented by each of the formulas (36-1) to (36-6), $R_{3641}$ is a substituted or unsubstituted aryl group including 6 to 50 ring carbon atoms.

In one embodiment, the compound represented by the formula (31) is a compound represented by the following formula (36-1-1).

(36-1-1)

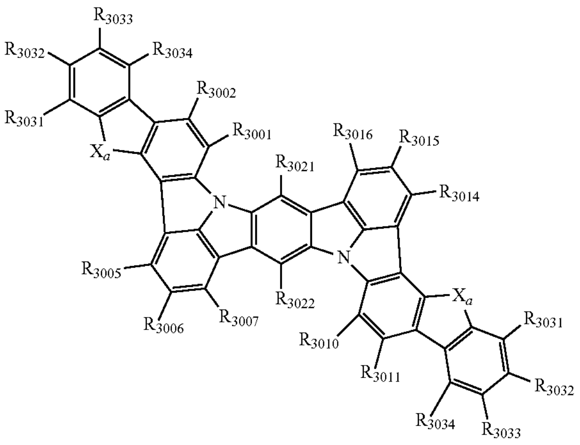

In the formula (36-1-1), one or more sets of adjacent two or more of $R_{3001}$, $R_{3002}$, $R_{3005}$ to $R_{3007}$, $R_{3010}$, $R_{3011}$, $R_{3014}$ to $R_{3016}$, and $R_{3031}$ to $R_{3034}$ form a substituted or unsubstituted, saturated or unsaturated ring by bonding with each other, or do not form a substituted or unsubstituted, saturated or unsaturated ring;

$X_a$'s are independently selected from O, S, and N($R_{3035}$);

$R_{3035}$ forms a substituted or unsubstituted, saturated or unsaturated ring by bonding with $R_{3031}$, or does not form the ring;

$R_{3001}$, $R_{3002}$, $R_{3005}$ to $R_{3007}$, $R_{3010}$, $R_{3011}$, $R_{3014}$ to $R_{3016}$, and $R_{3031}$ to $R_{3034}$ that do not form the substituted or unsubstituted, saturated or unsaturated ring, and $R_{3021}$ and $R_{3022}$ are independently a hydrogen atom, a substituted or unsubstituted aryl group including 6 to 50 ring carbon atoms, or a substituted or unsubstituted monovalent heterocyclic group including 5 to 50 ring atoms.

In one embodiment, the substituent in the case of the "substituted or unsubstituted" in the formulas (31) to (35), (34-2), (35-2), (32-11), (34-11), (35-11), (32-12), (34-12), (35-12), (36-1) to (36-6), and (36-1-1) is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

As the compound represented by the formula (31), the following compounds can be given, for example. In the following examples, "Me" represents a methyl group.

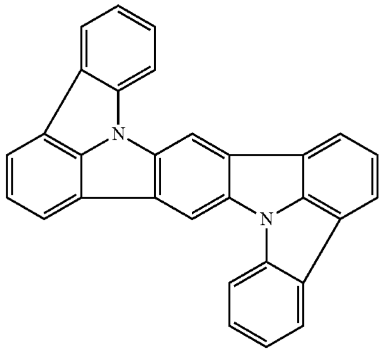

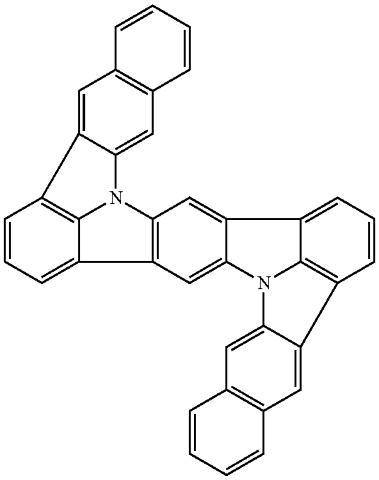

-continued
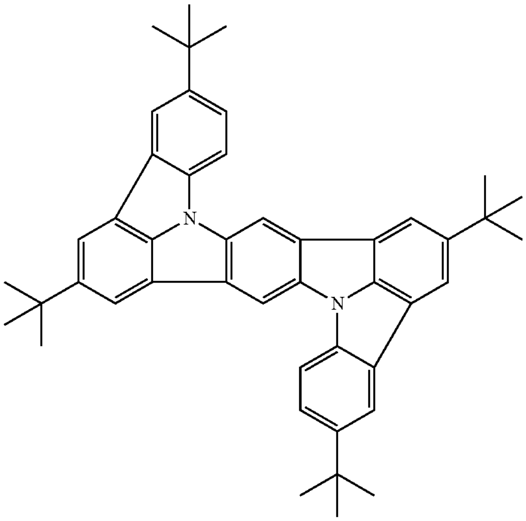
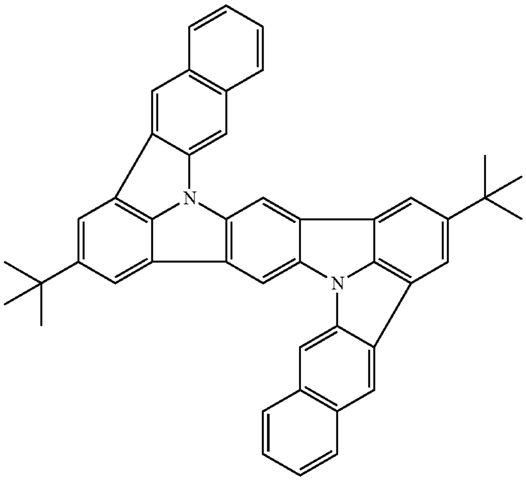
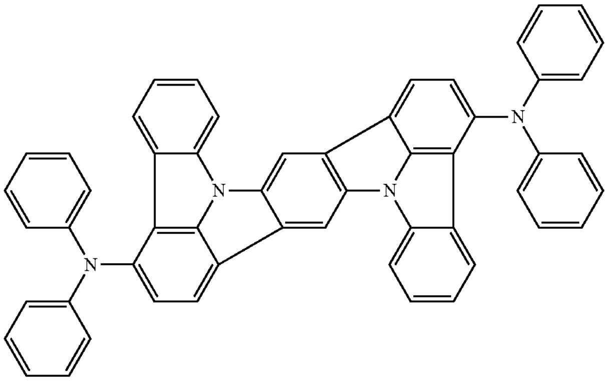
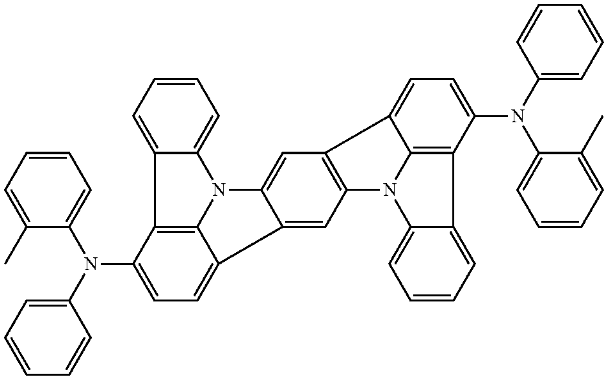
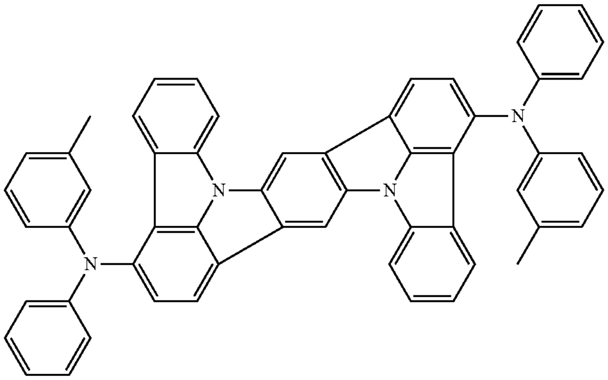

-continued
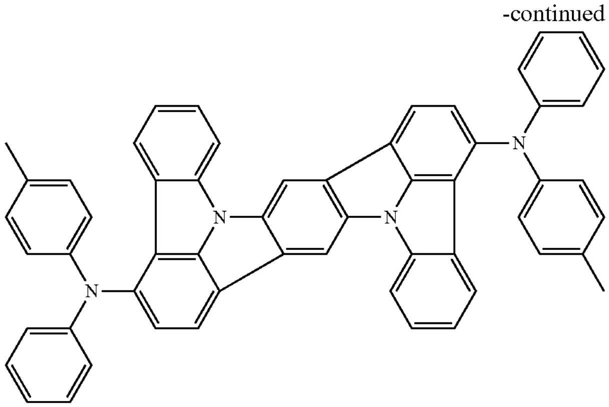
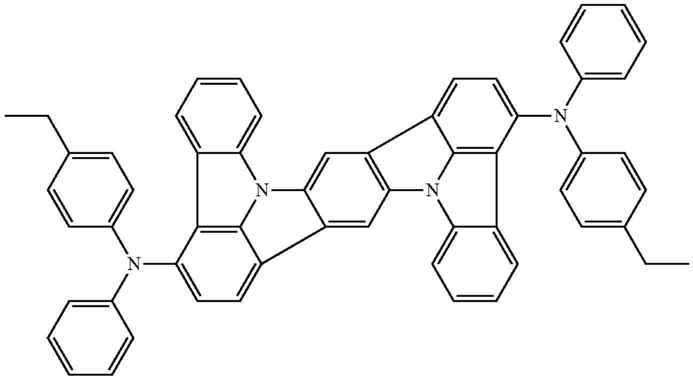
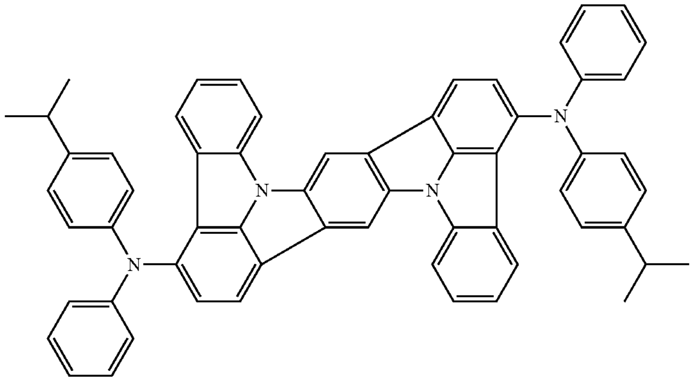
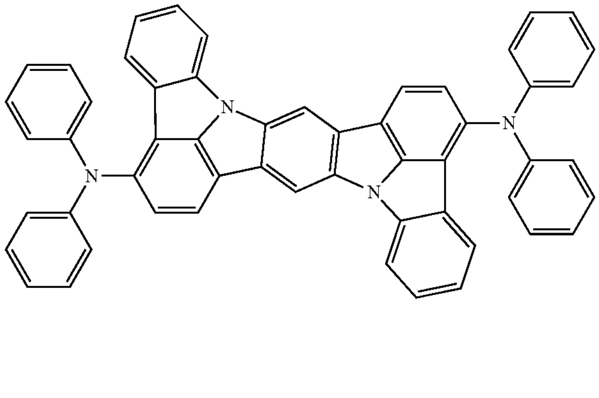

-continued
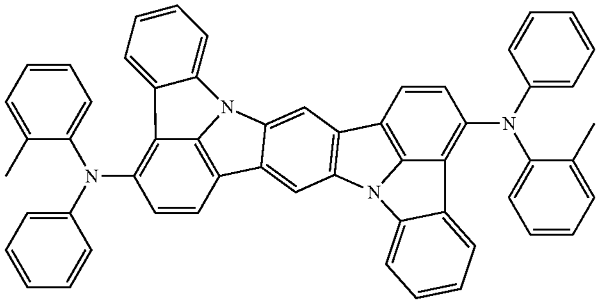
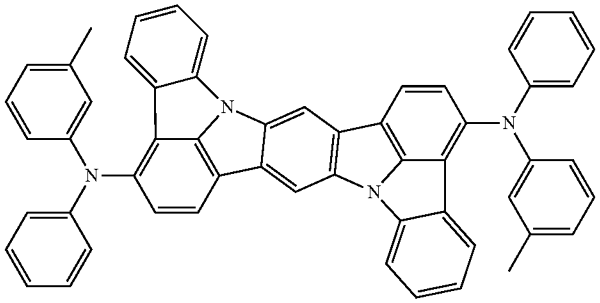
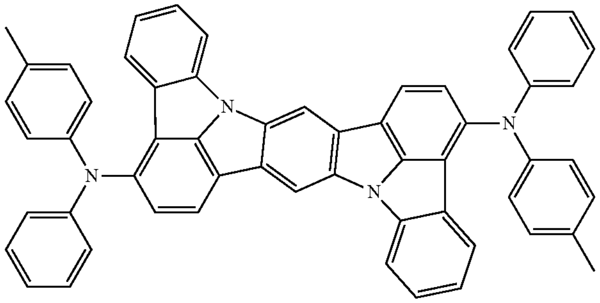
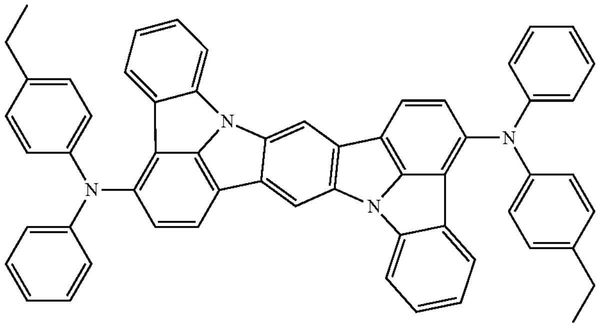
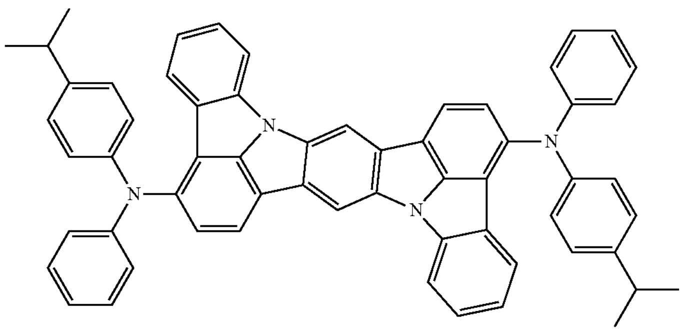

-continued
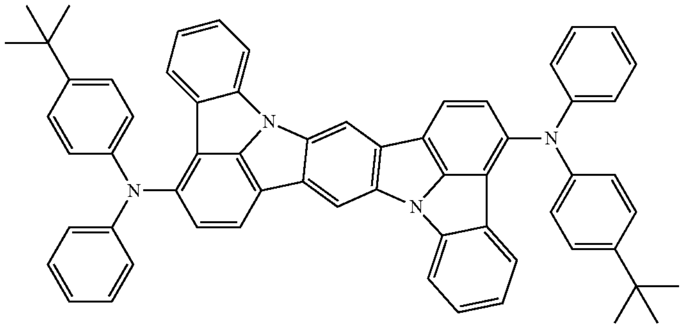
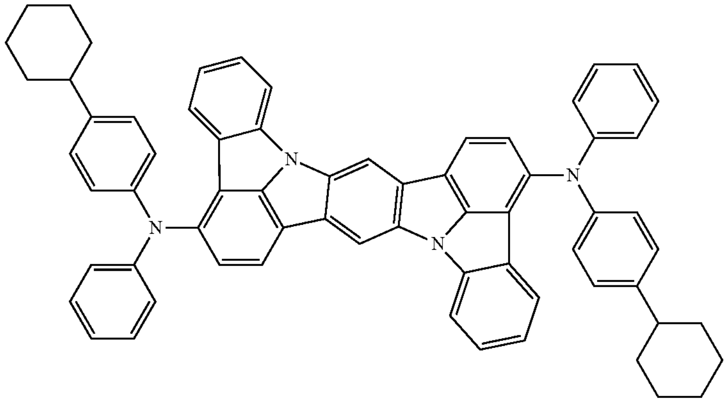
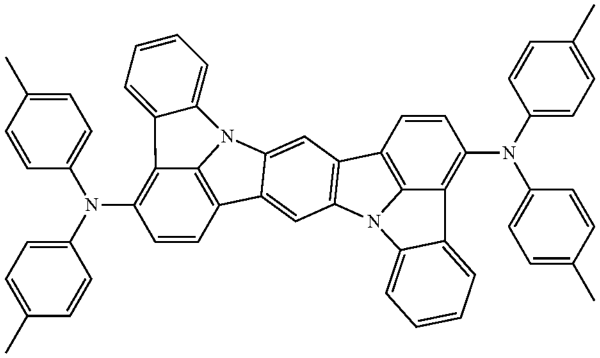
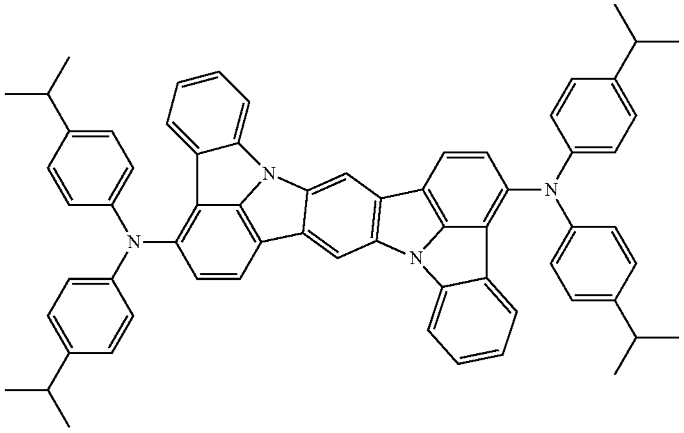

-continued
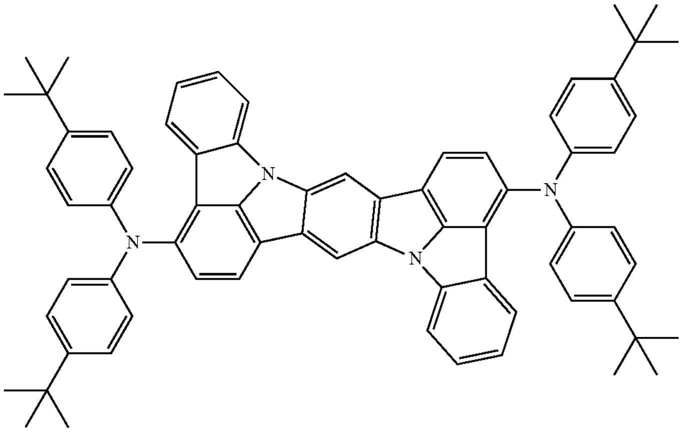
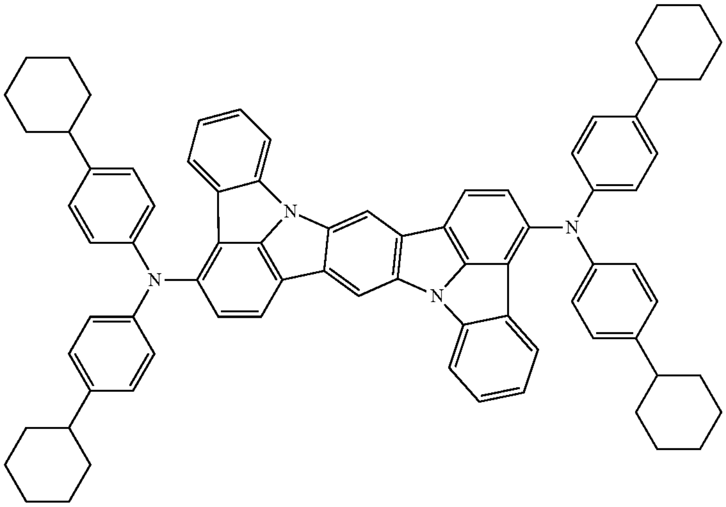
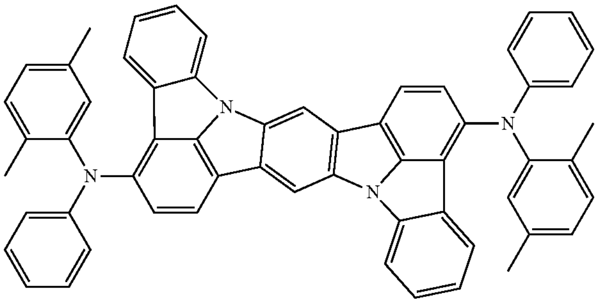
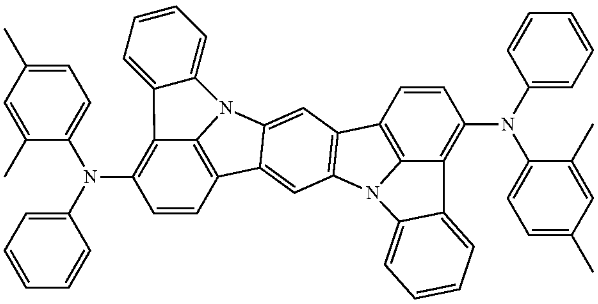

-continued
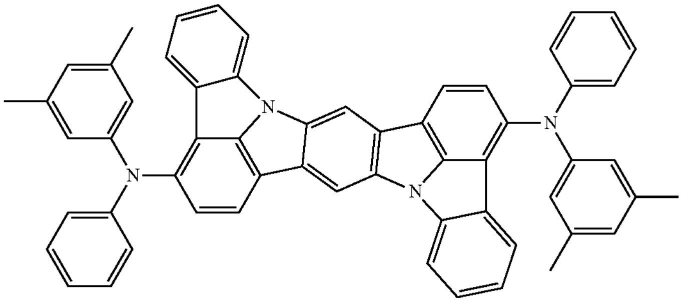
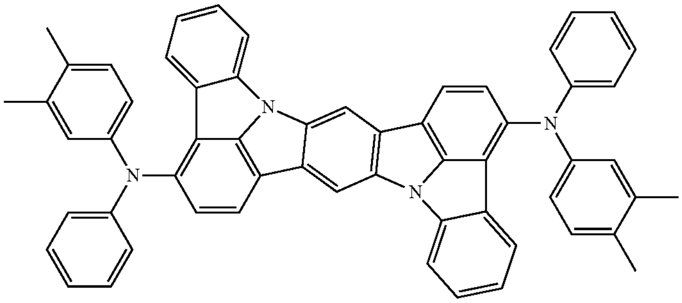
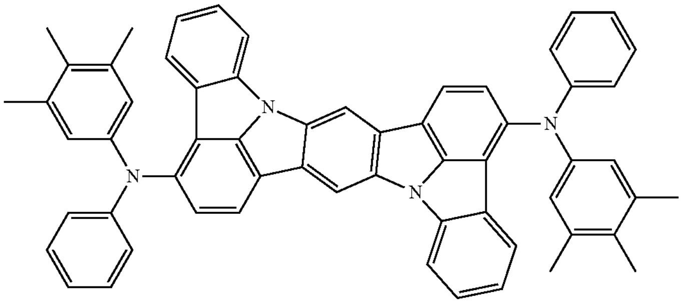
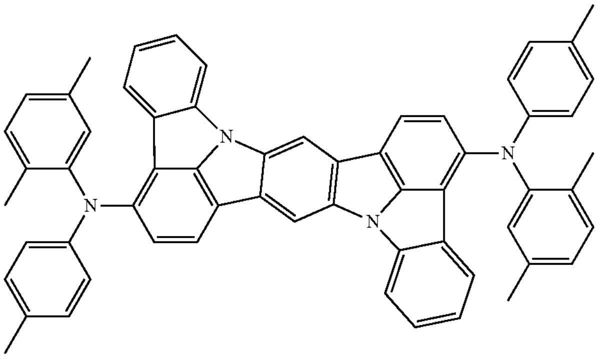
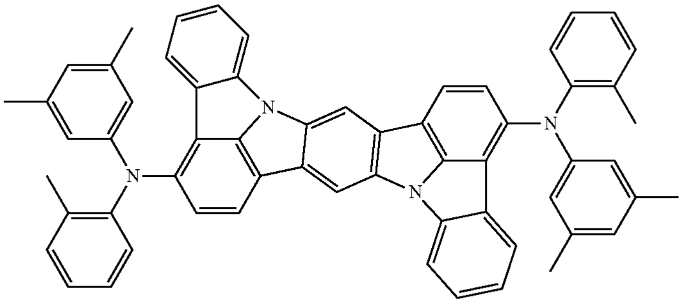

-continued
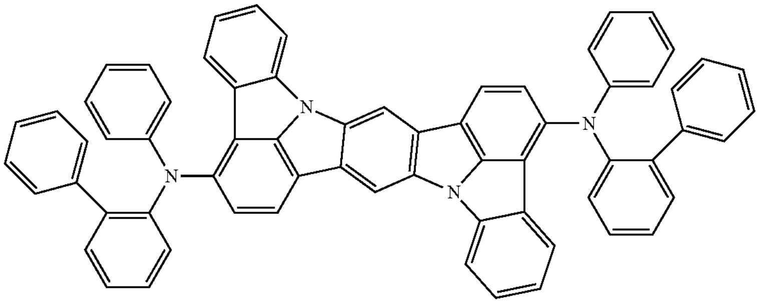
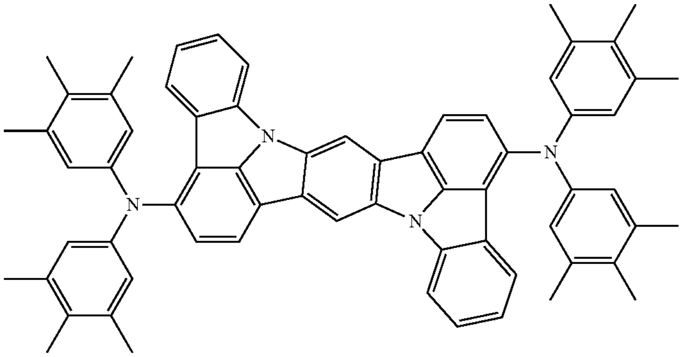
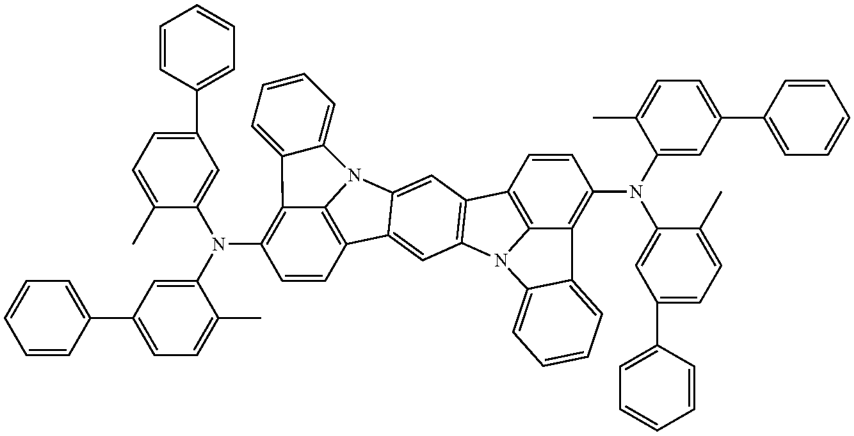
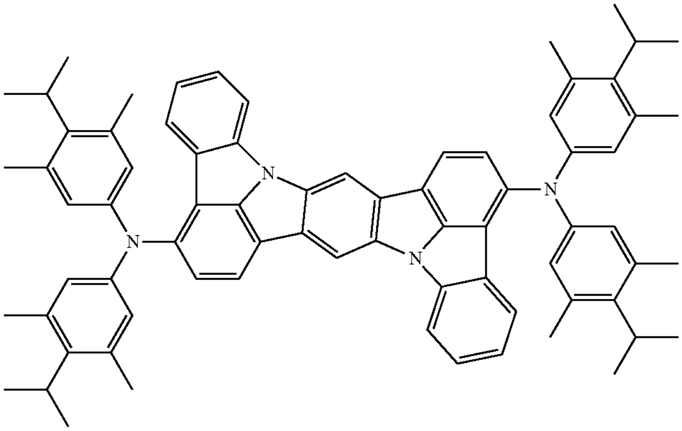

-continued
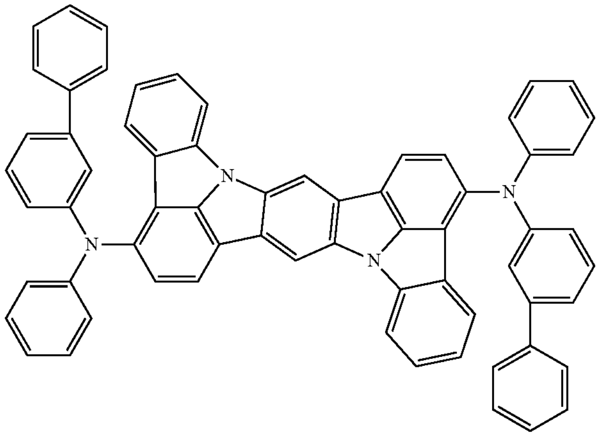
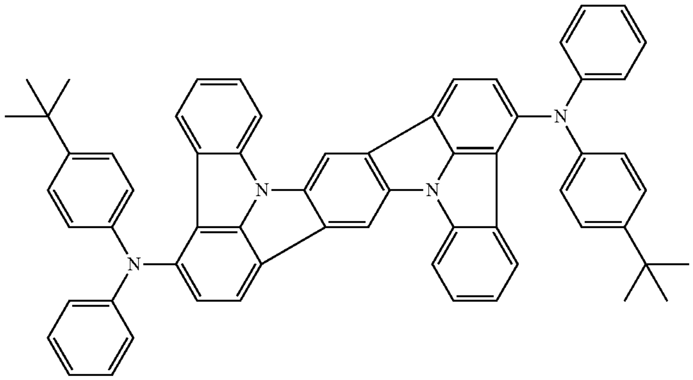
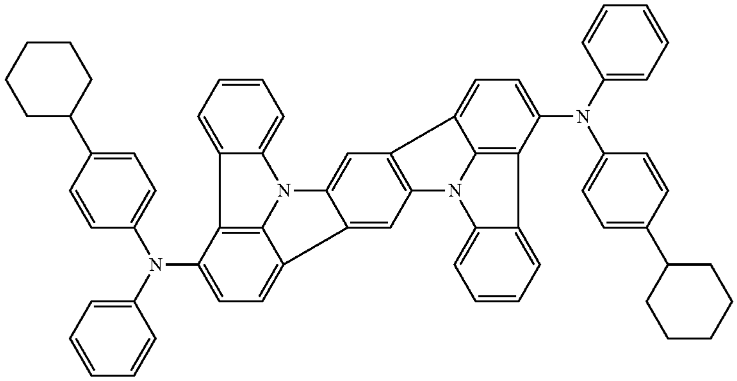
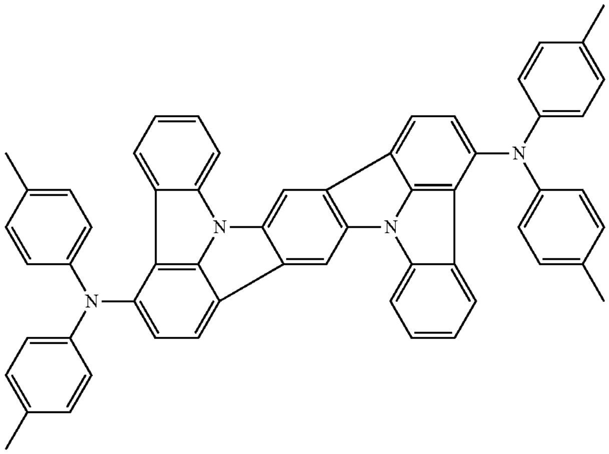

-continued
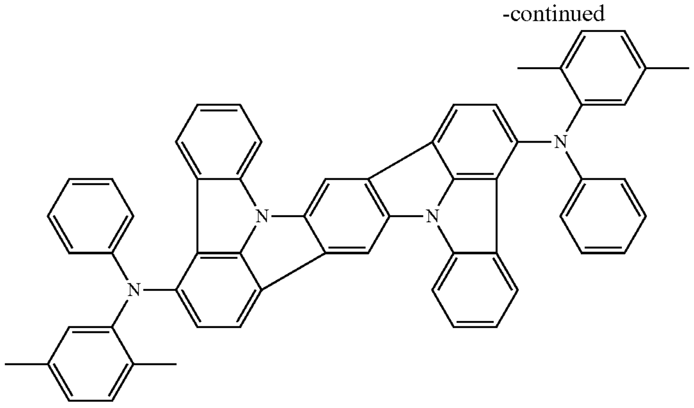
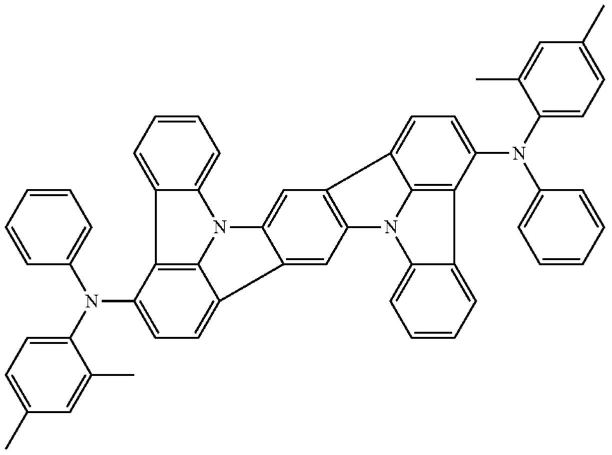
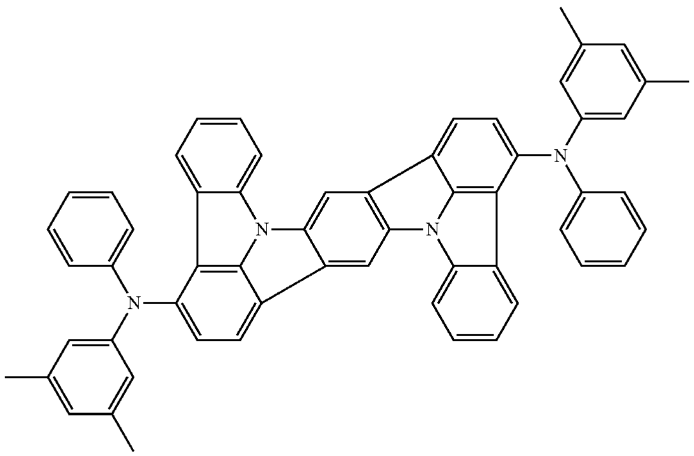

-continued
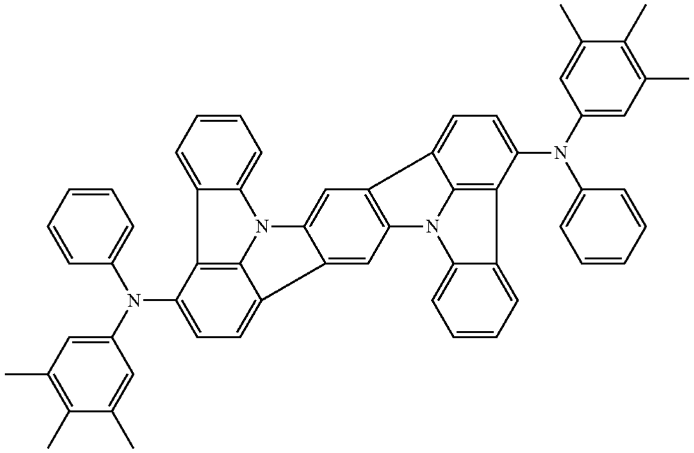
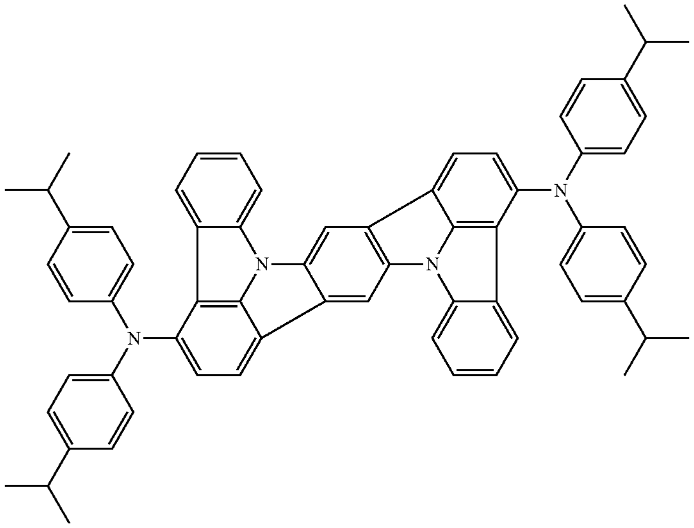
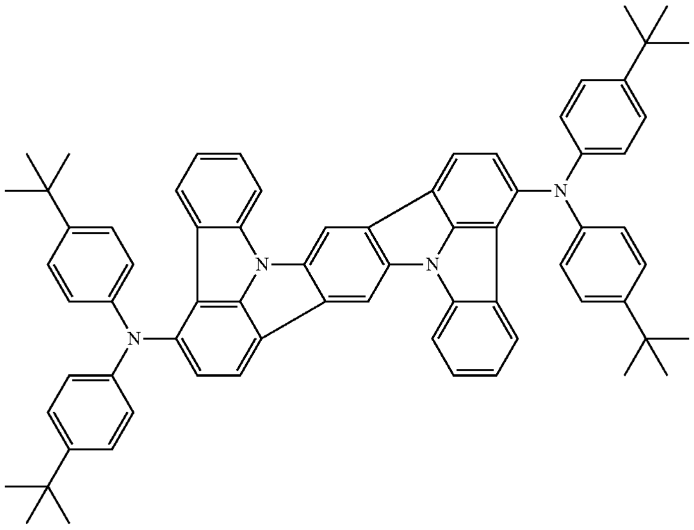

-continued
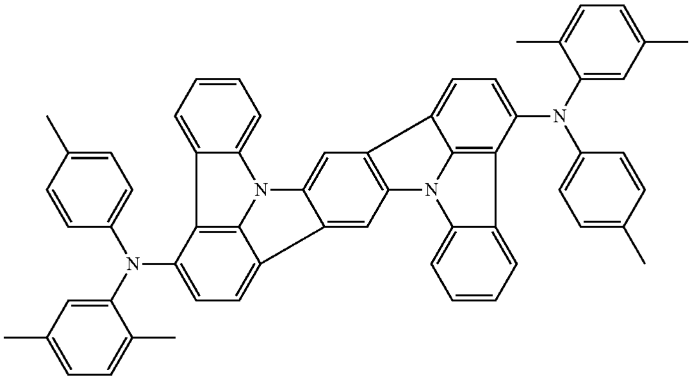
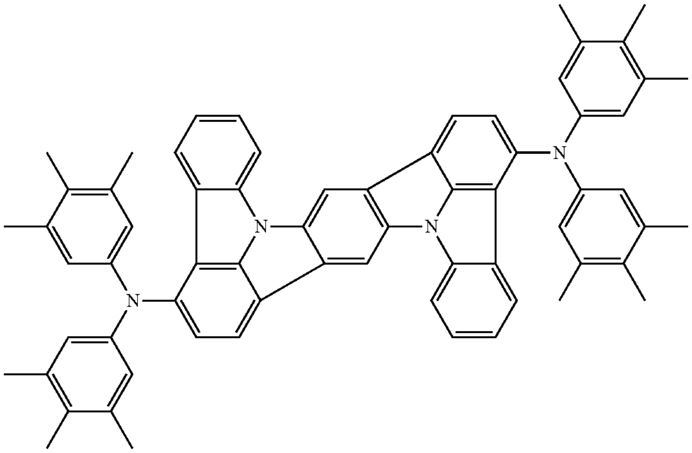
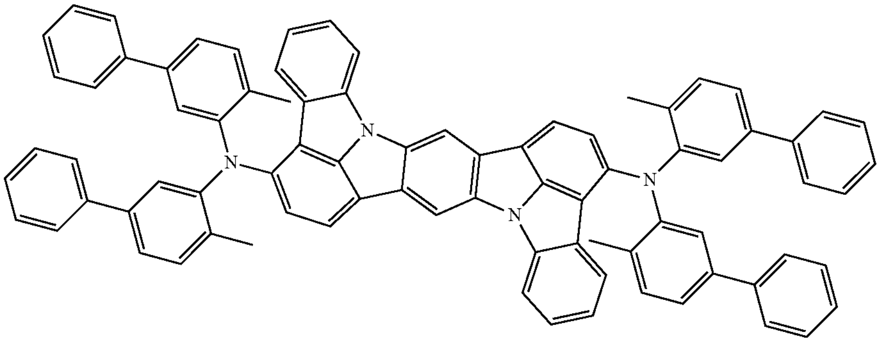
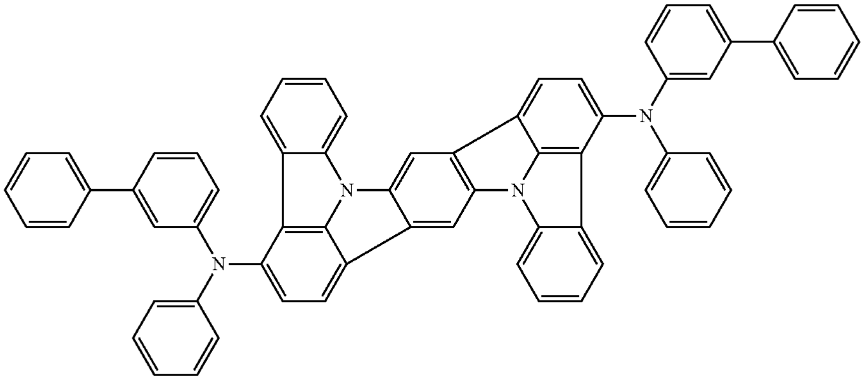

-continued
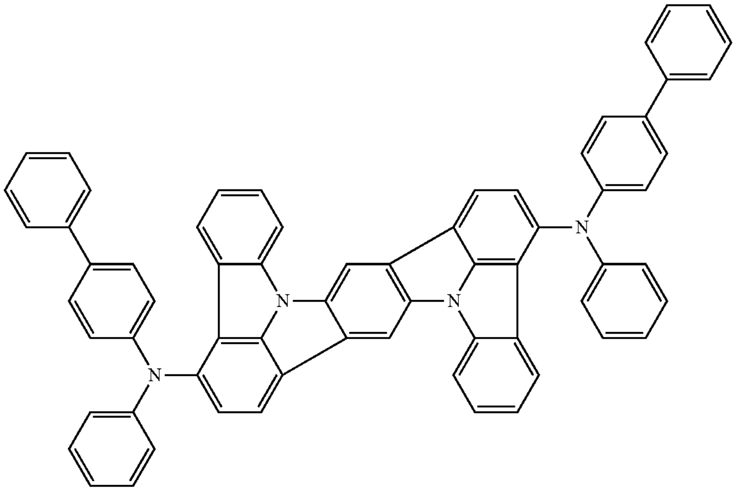
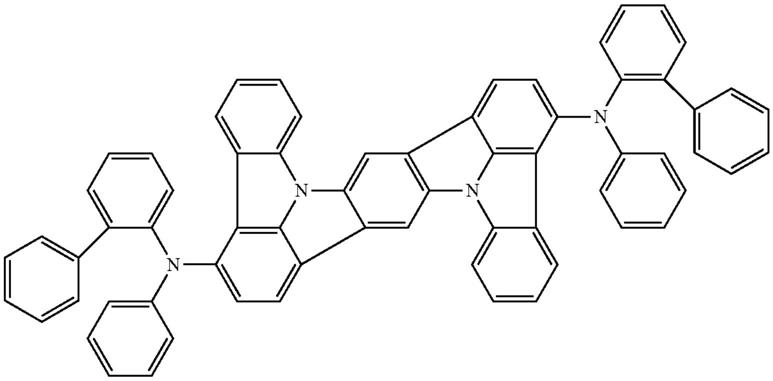
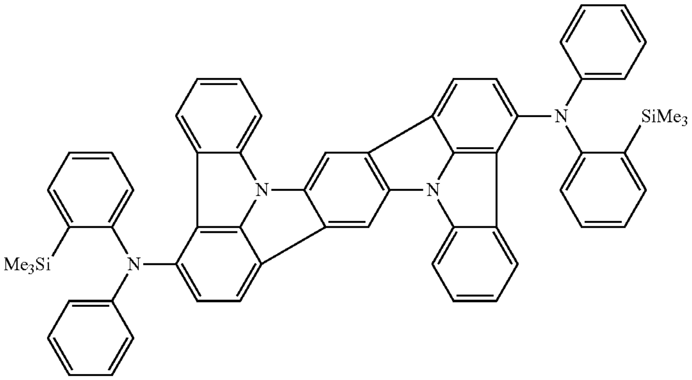
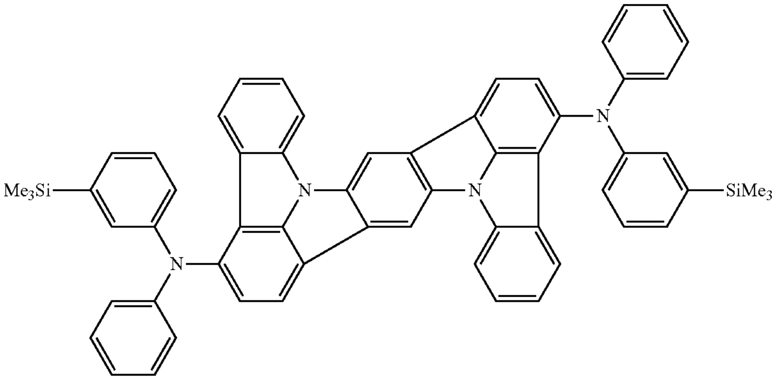

-continued
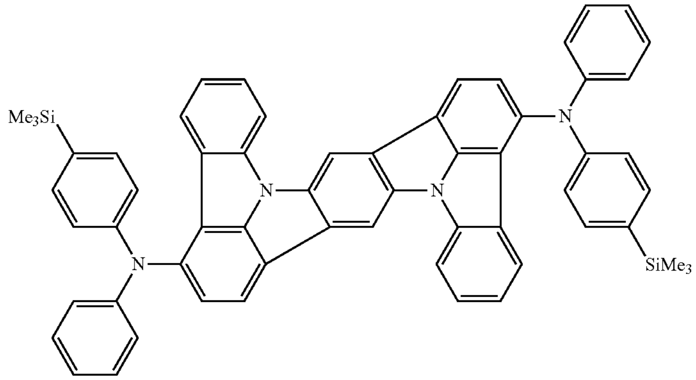
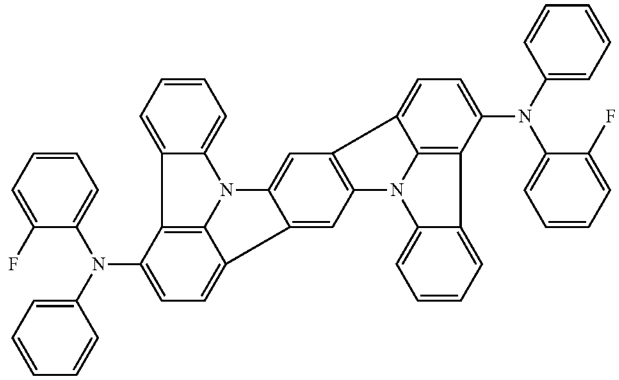
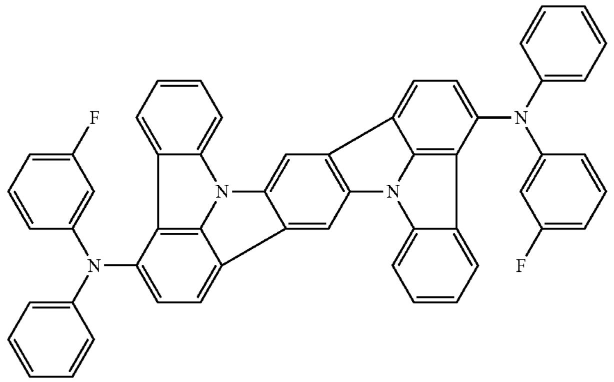
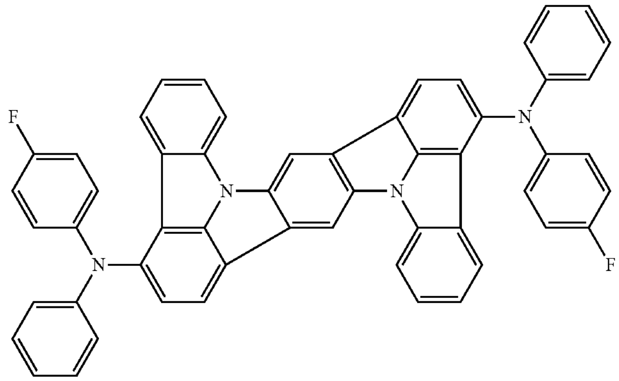

-continued
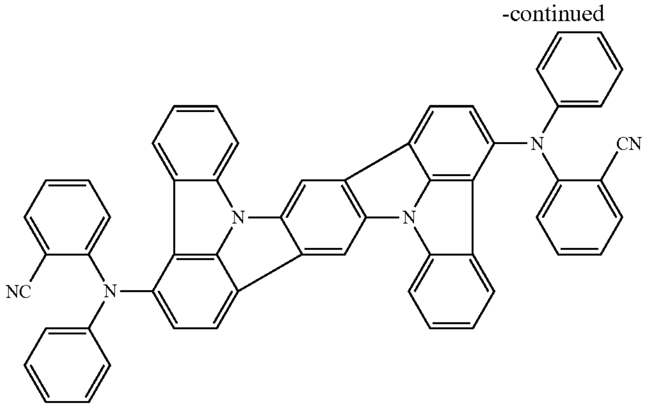
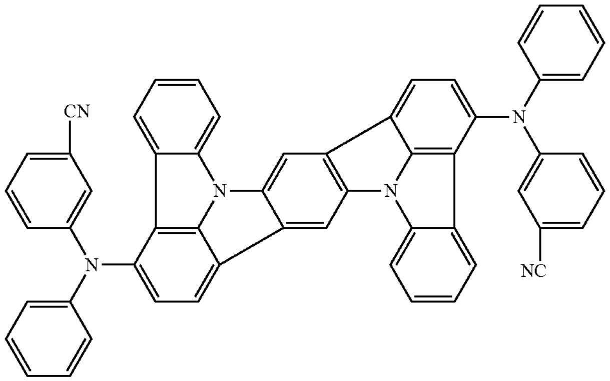
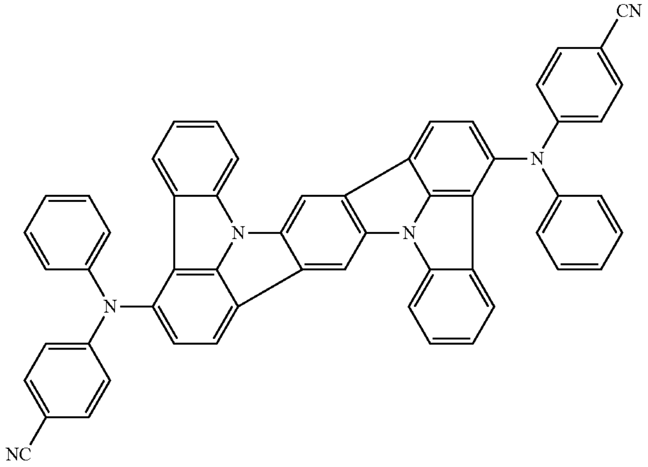
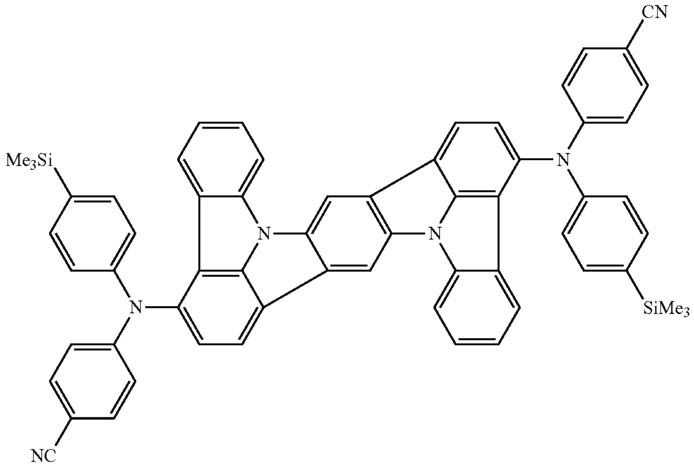

-continued
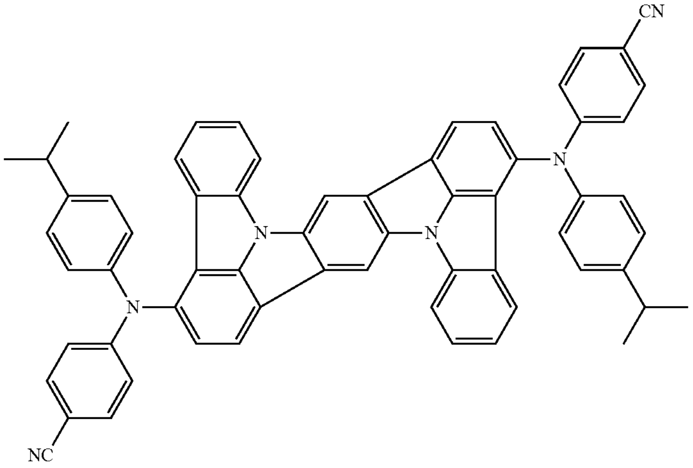
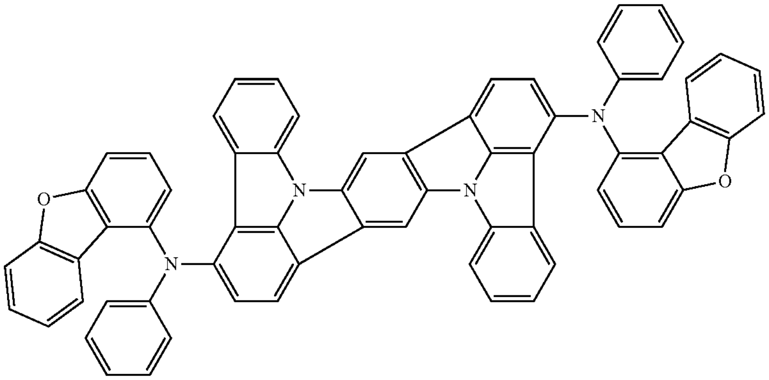
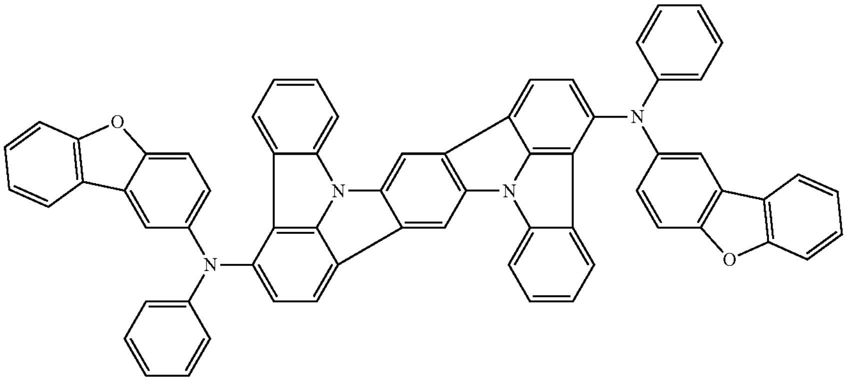
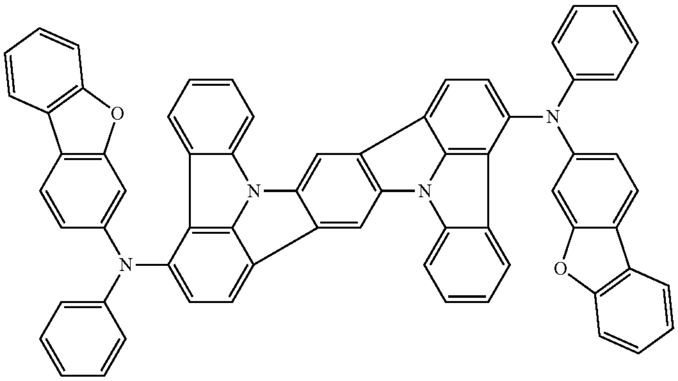

-continued
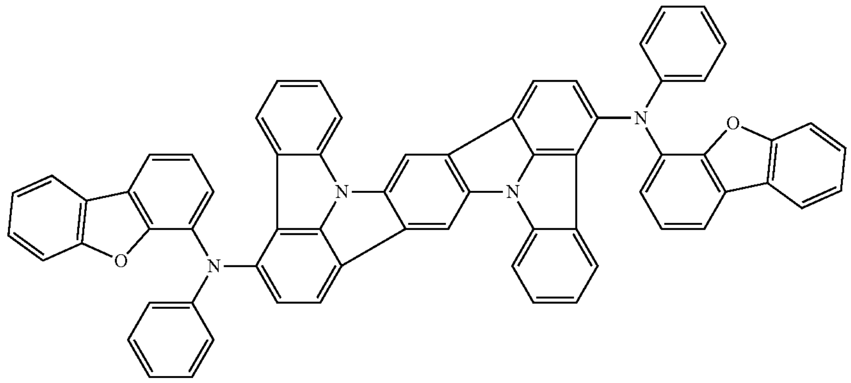
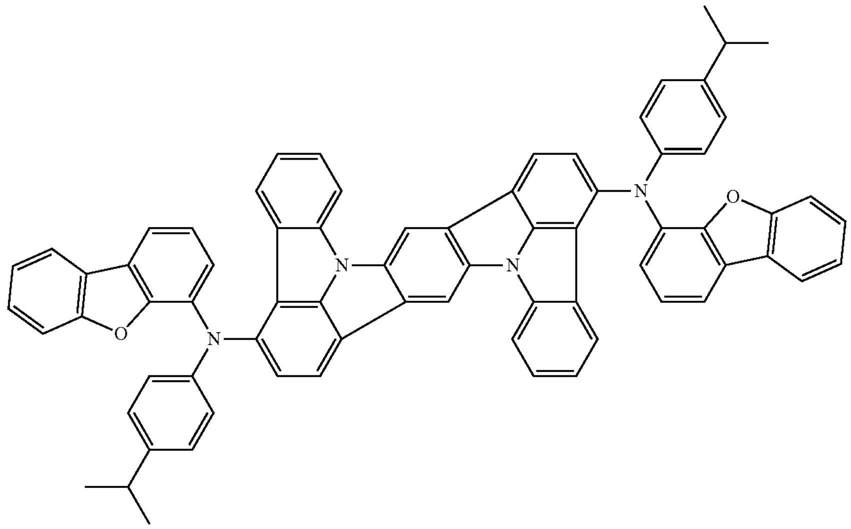
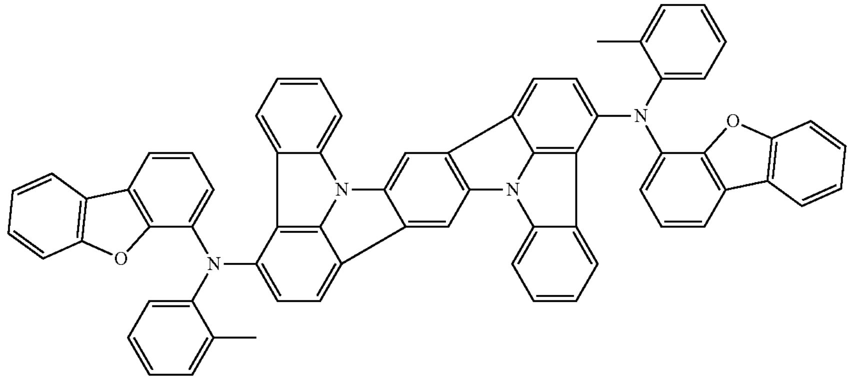

-continued
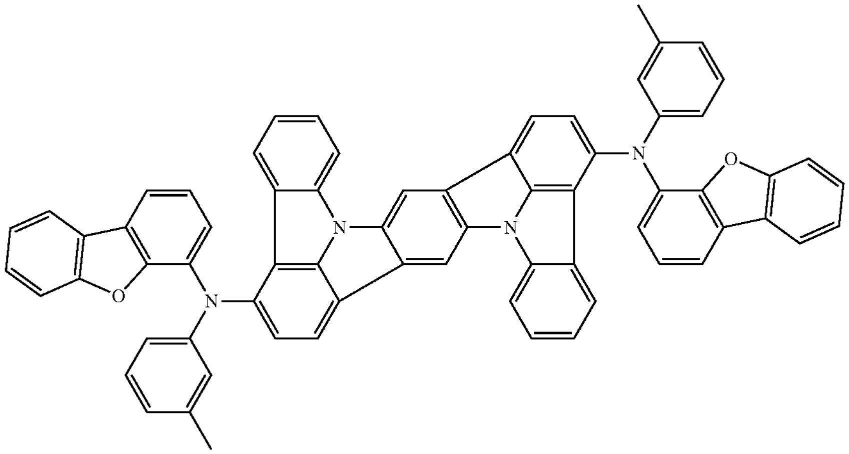
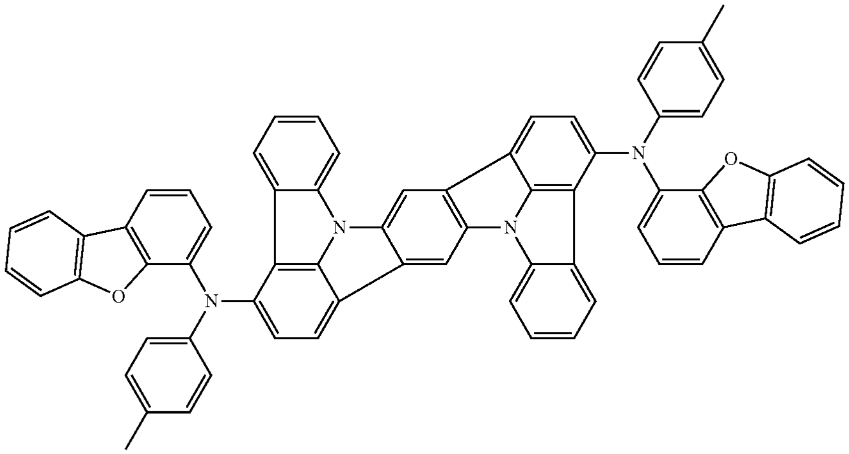
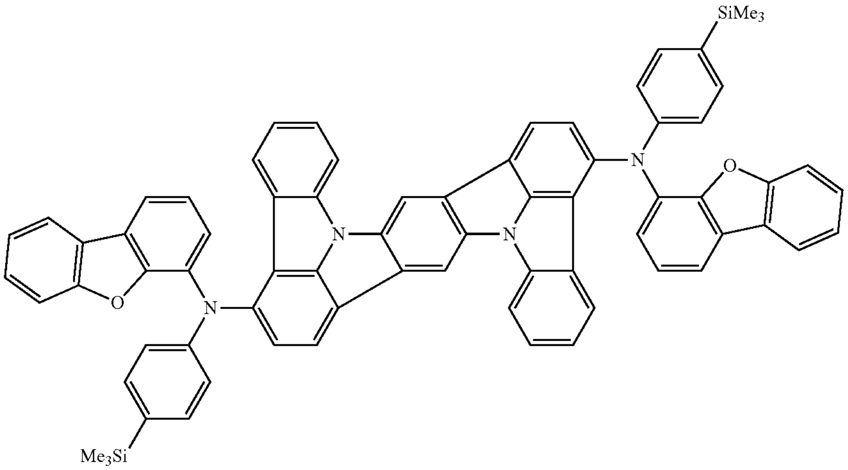

-continued
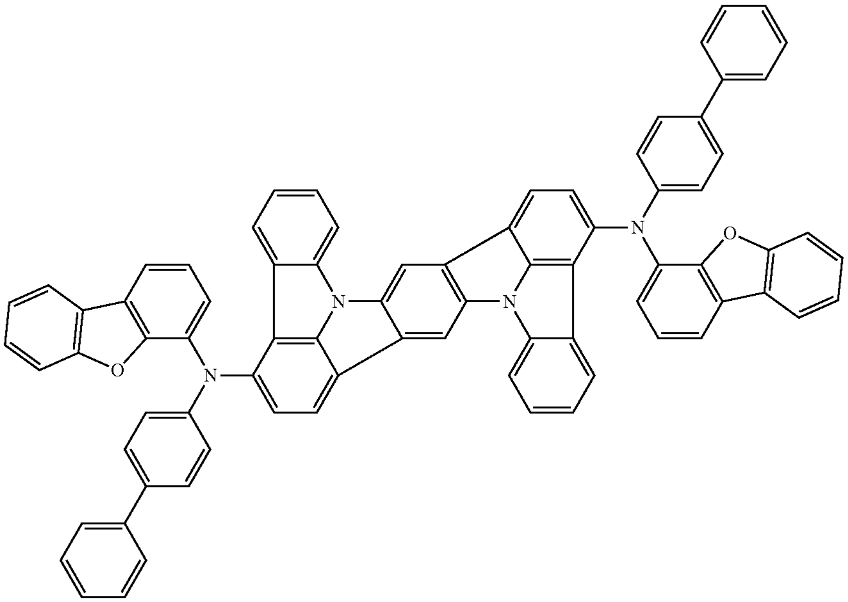
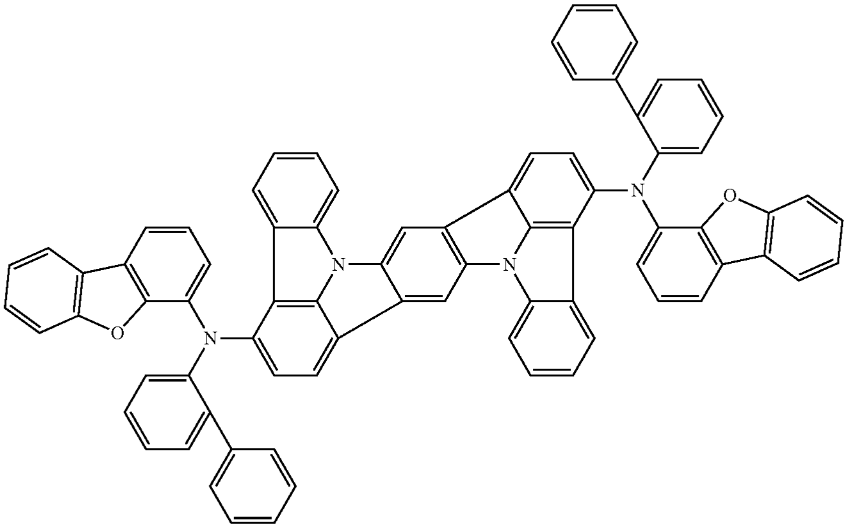
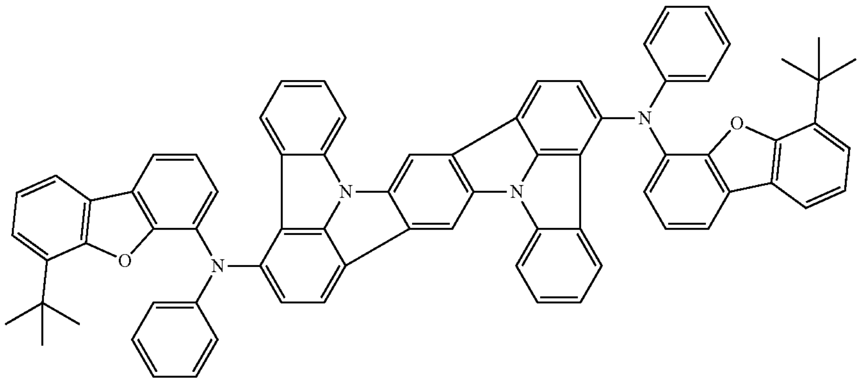

-continued
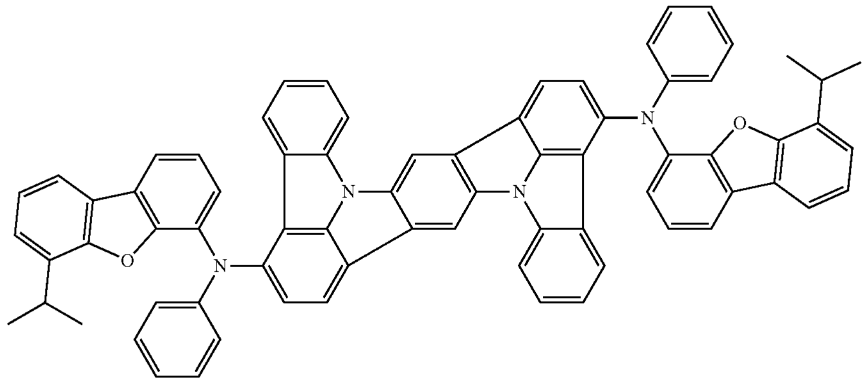
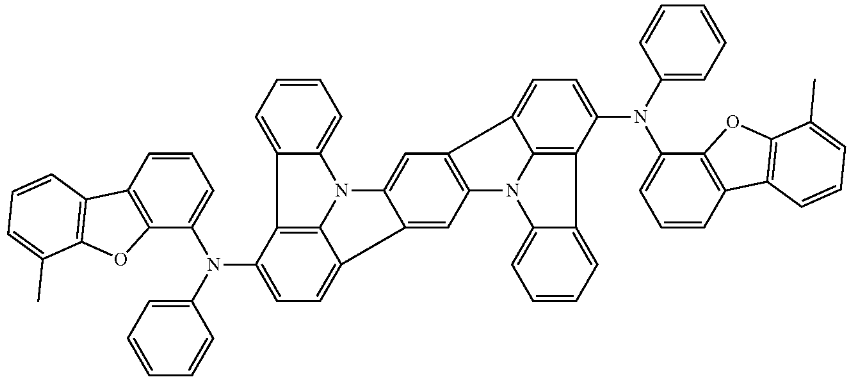
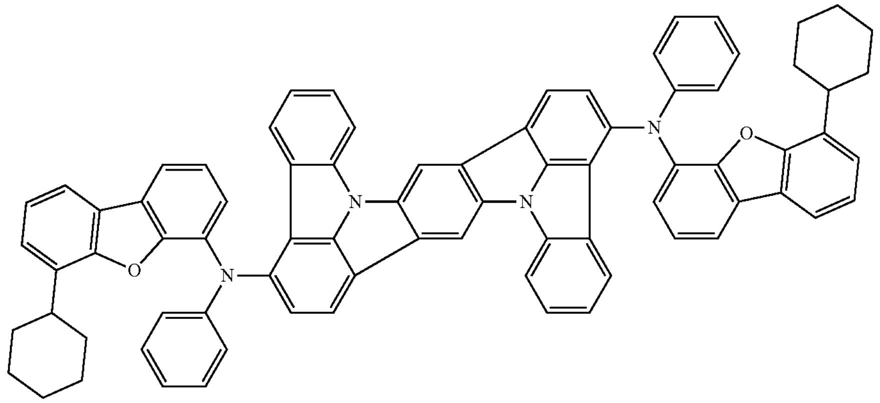
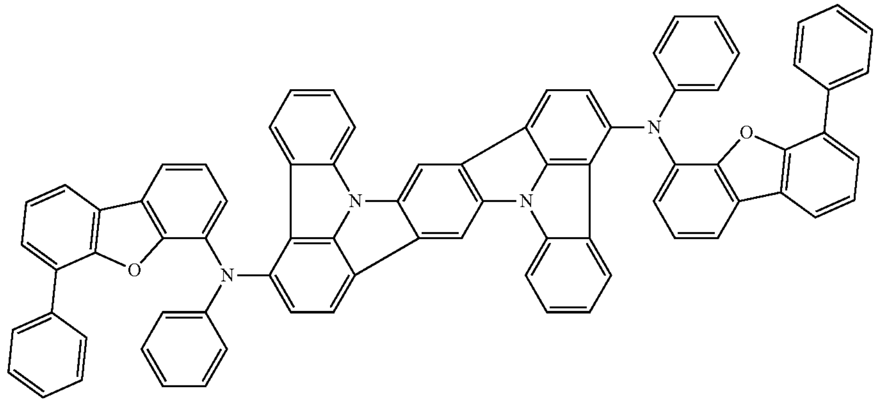

-continued
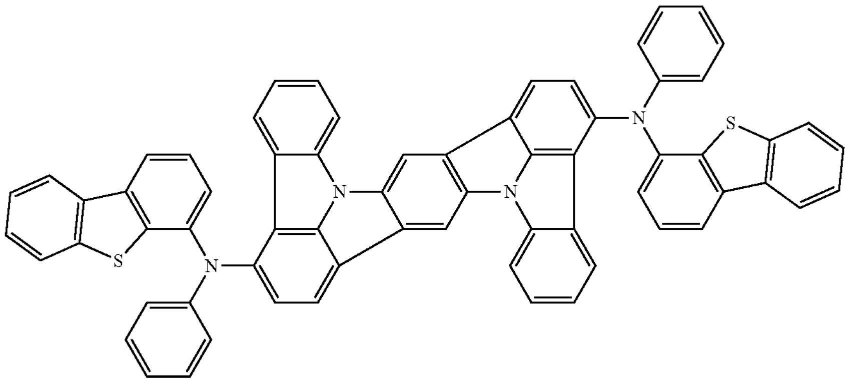
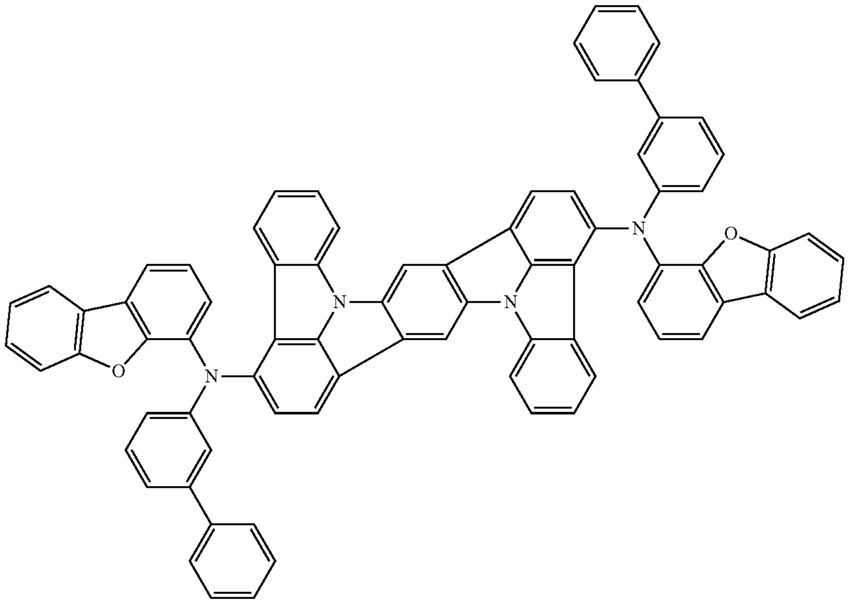
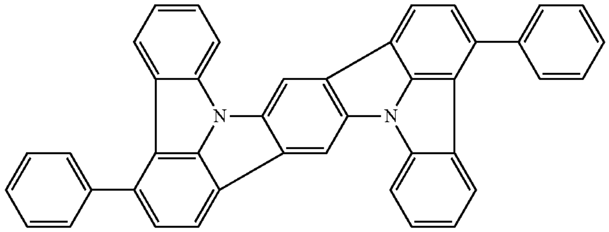
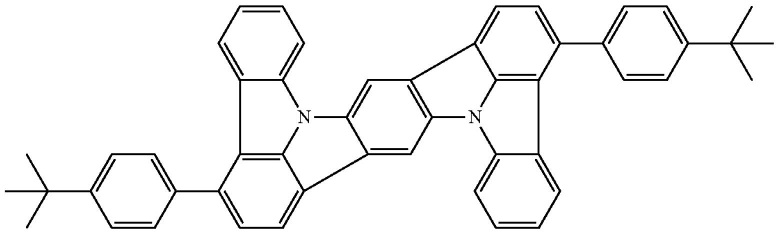
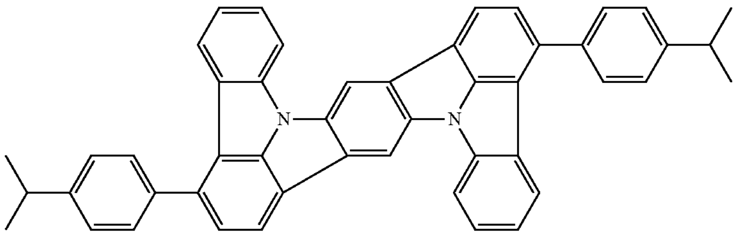

-continued
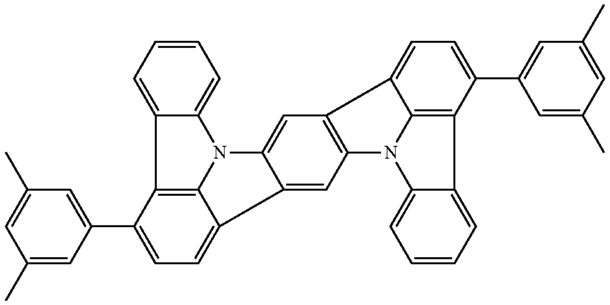
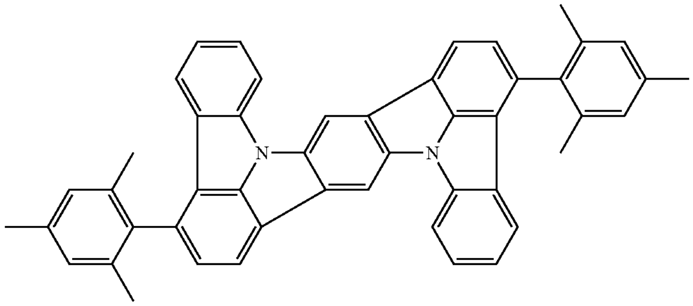
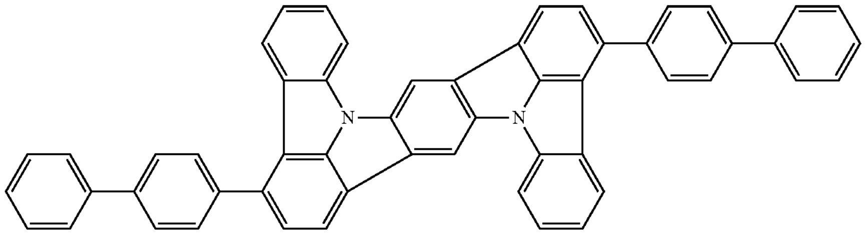
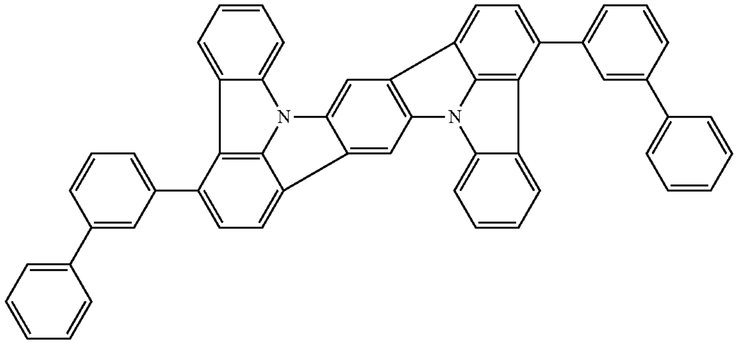
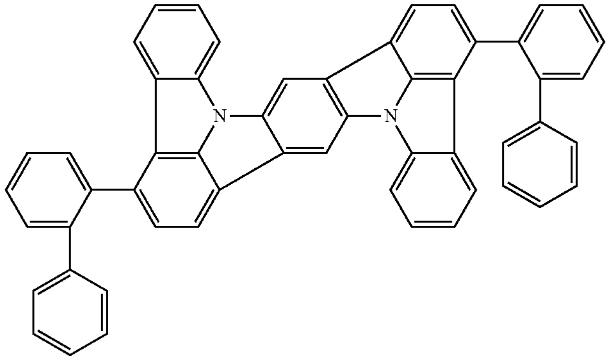

-continued
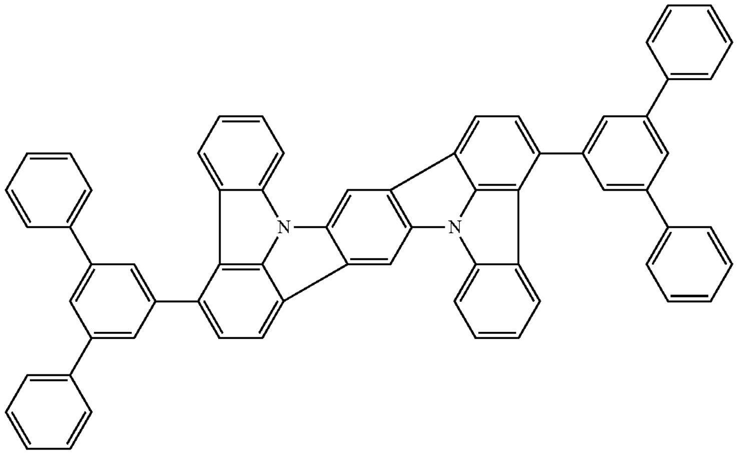
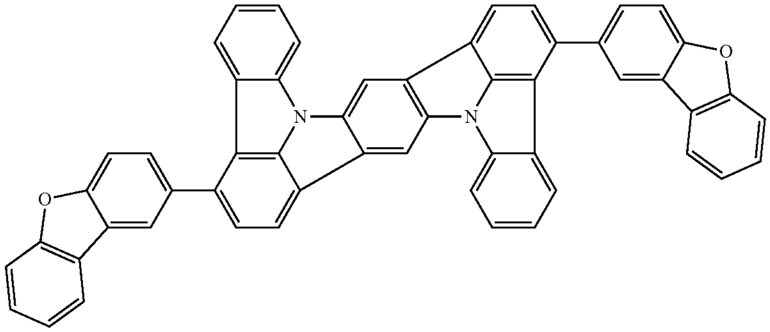
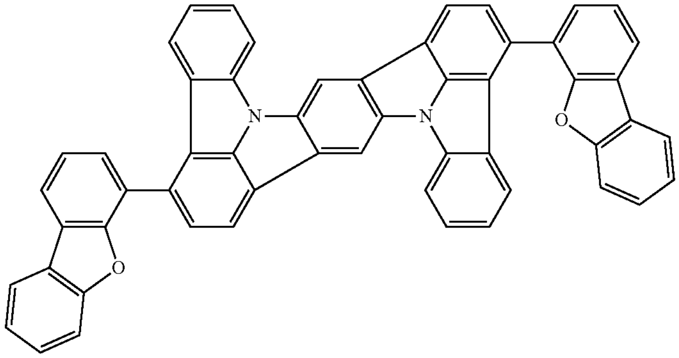
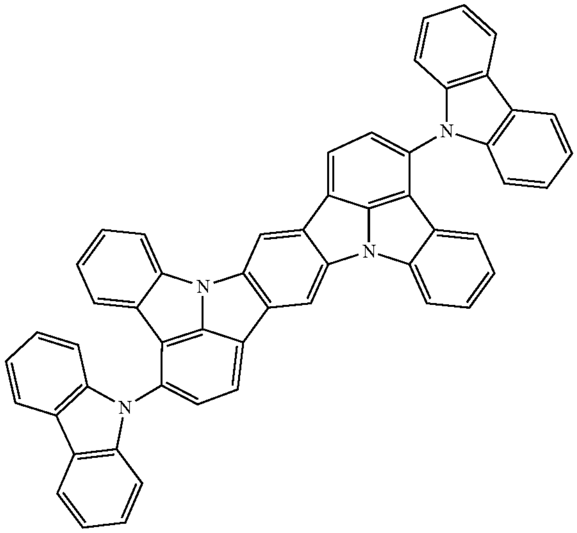

-continued
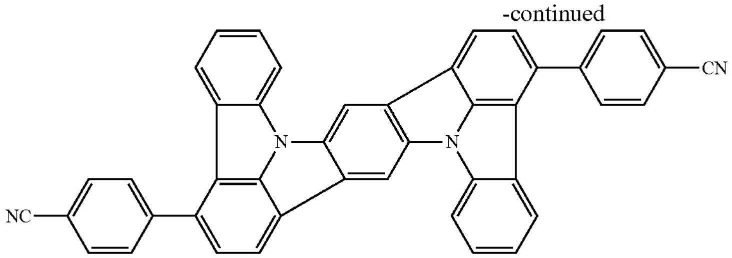
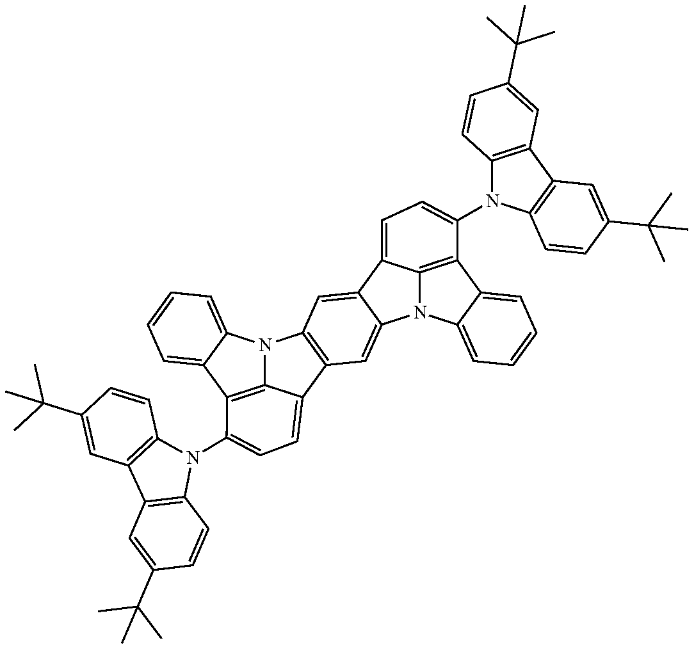
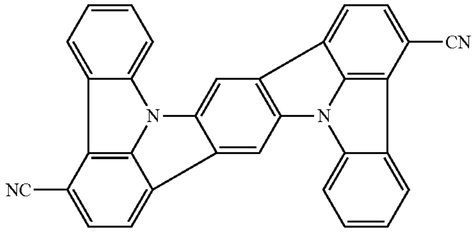
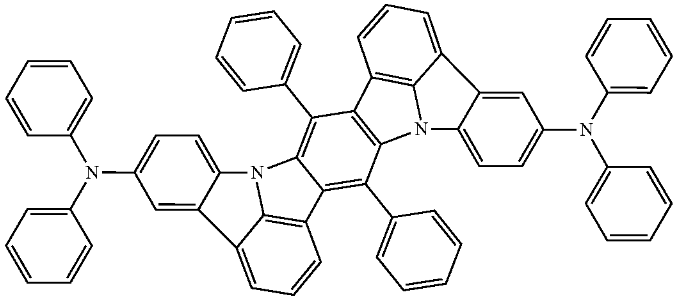
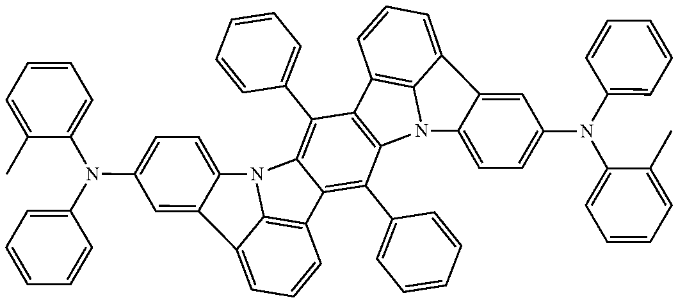

-continued
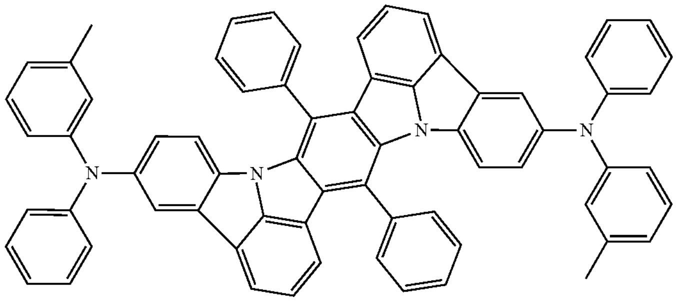
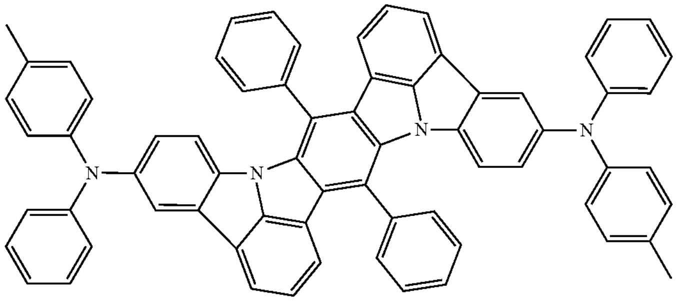
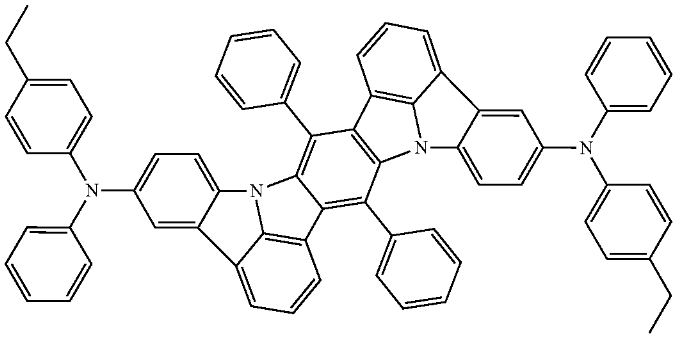
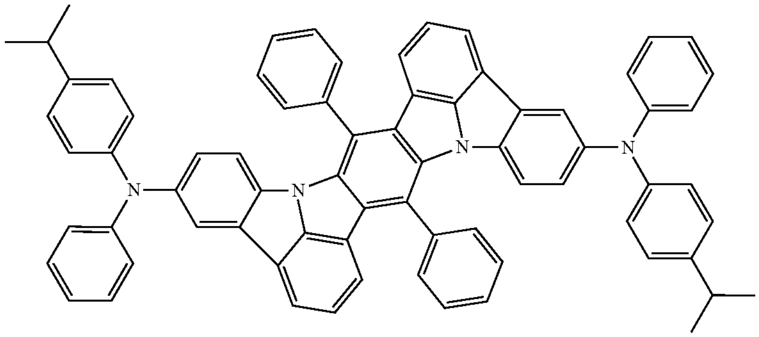
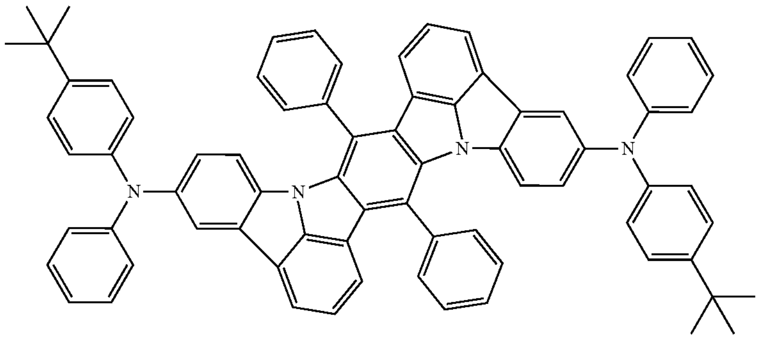

-continued
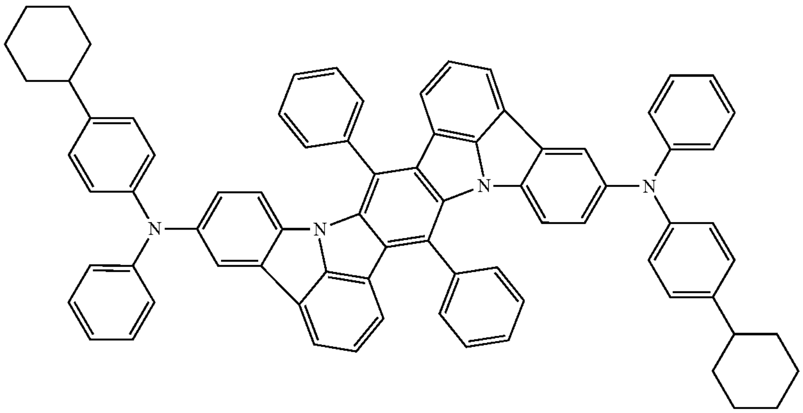
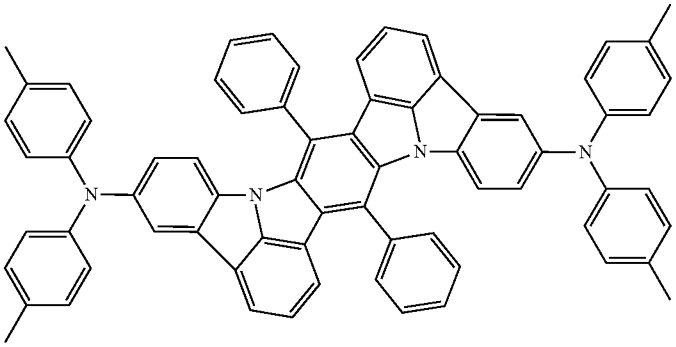
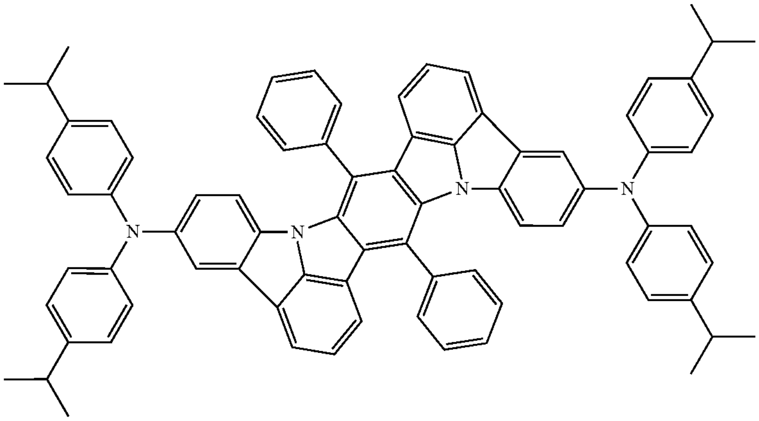
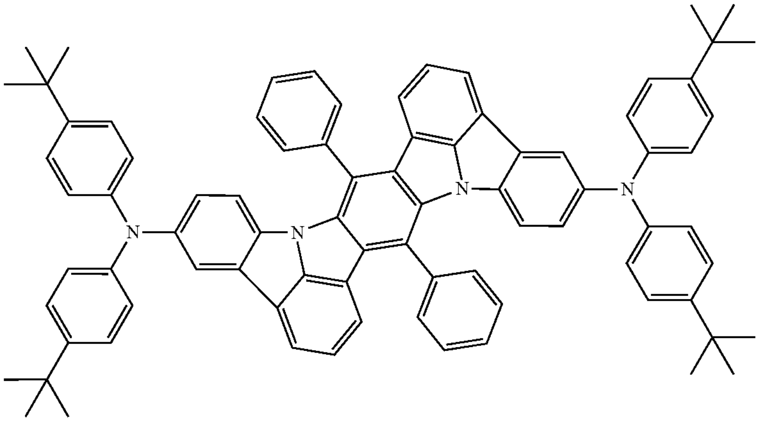

-continued
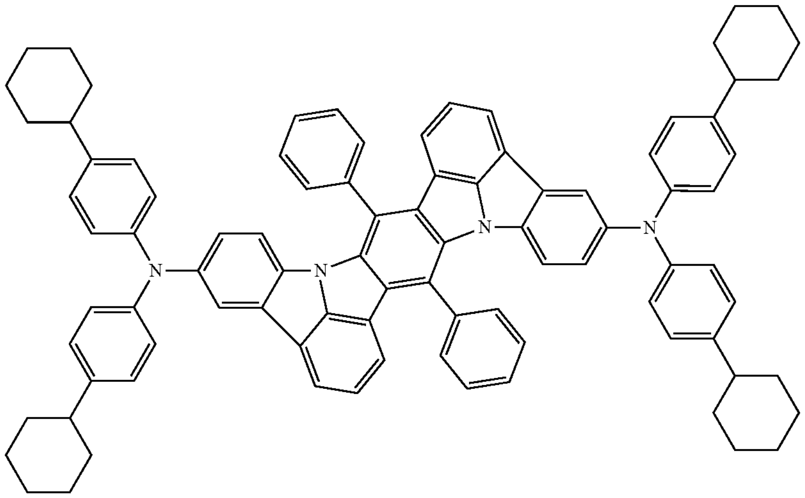
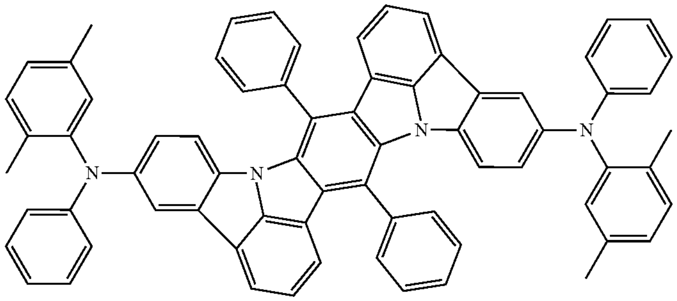
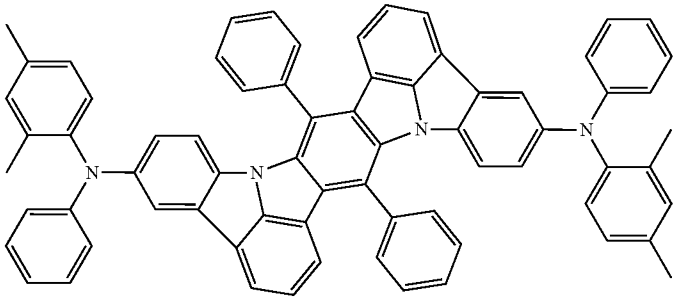
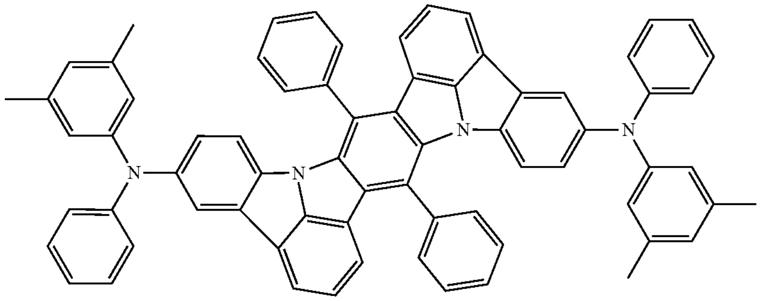
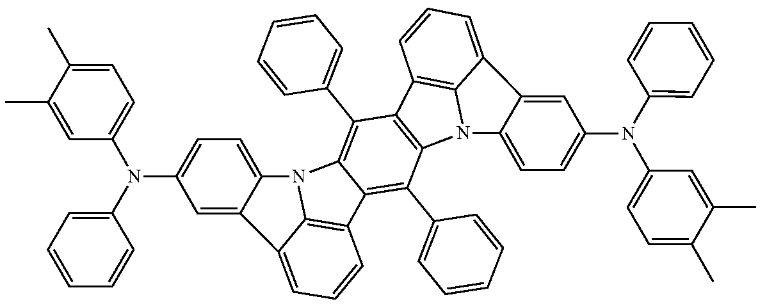

-continued
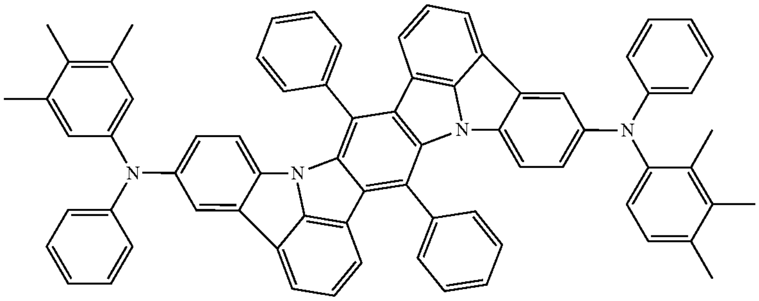
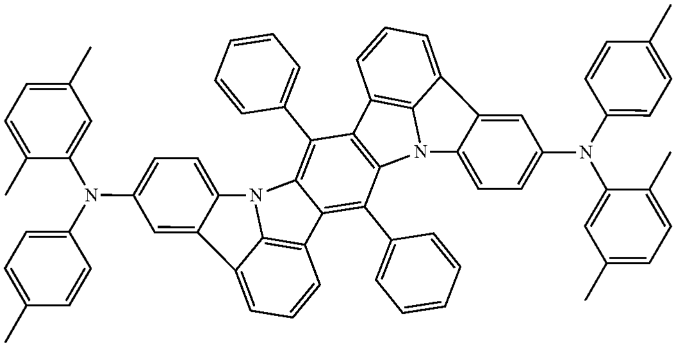
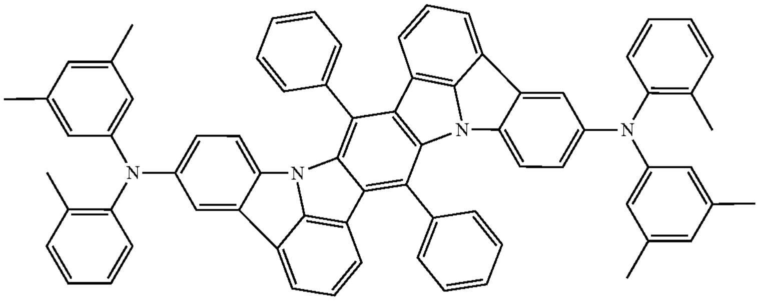
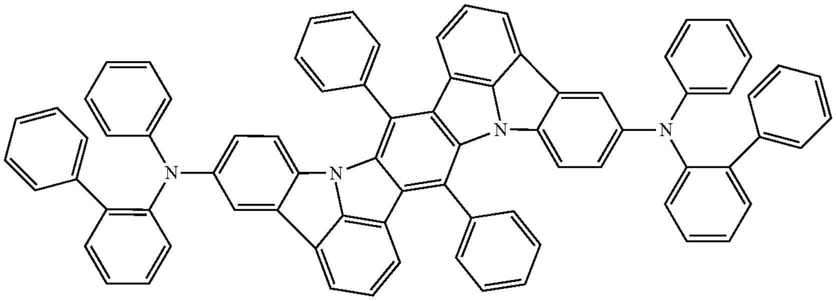
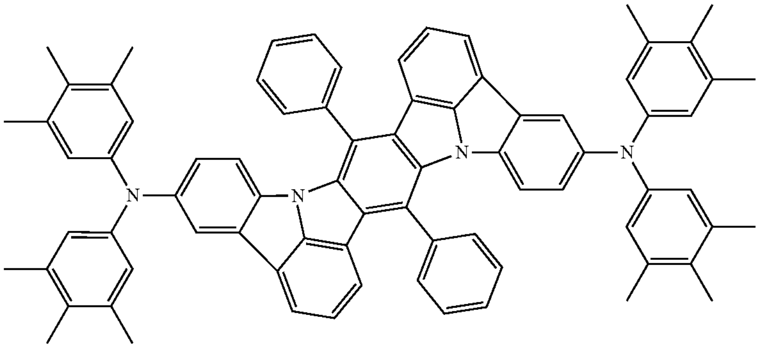

-continued
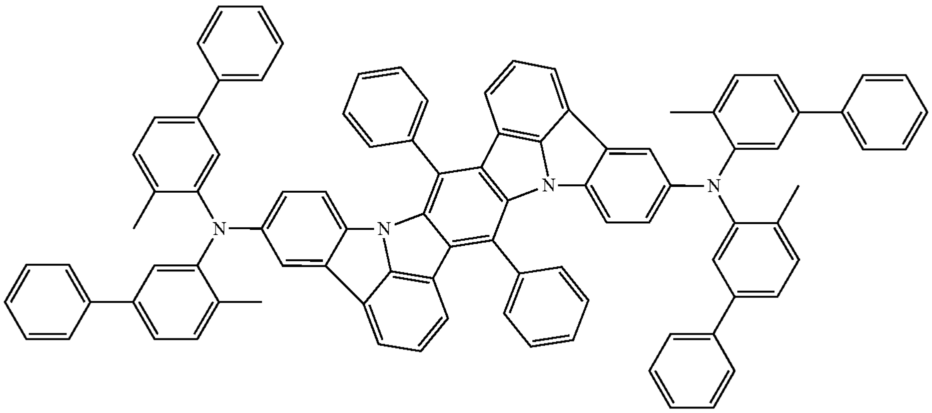
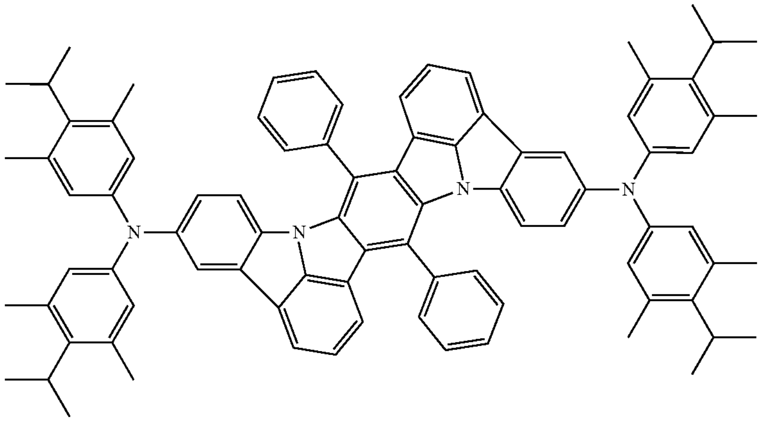
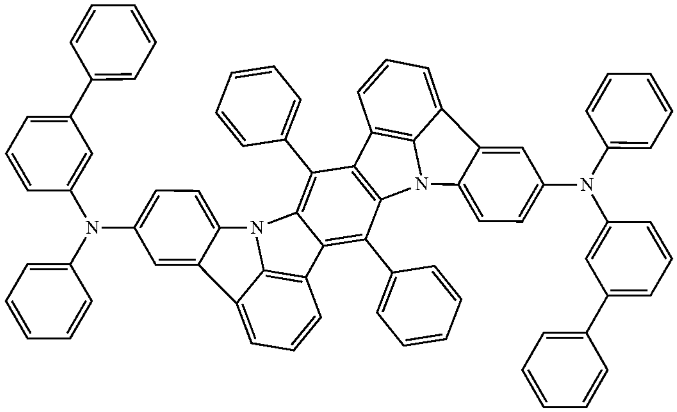
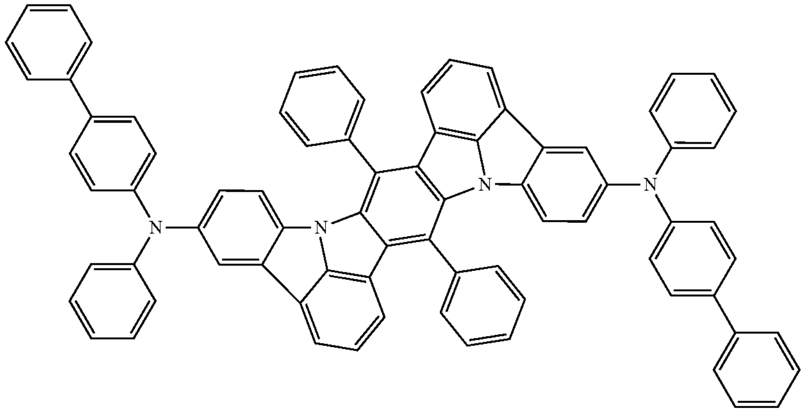

-continued
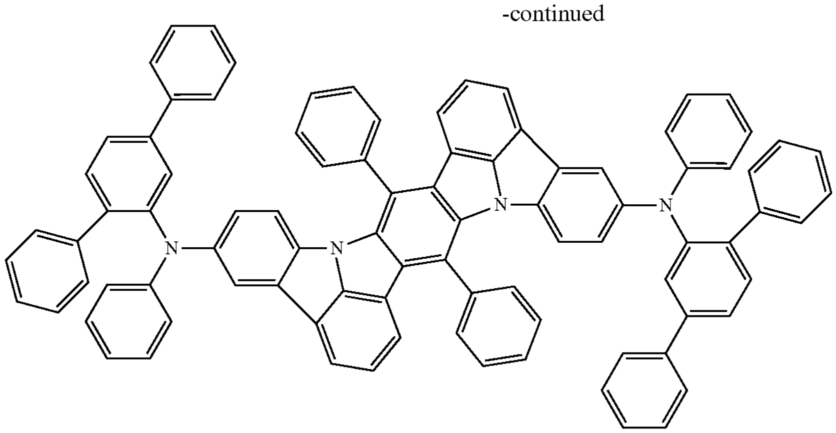
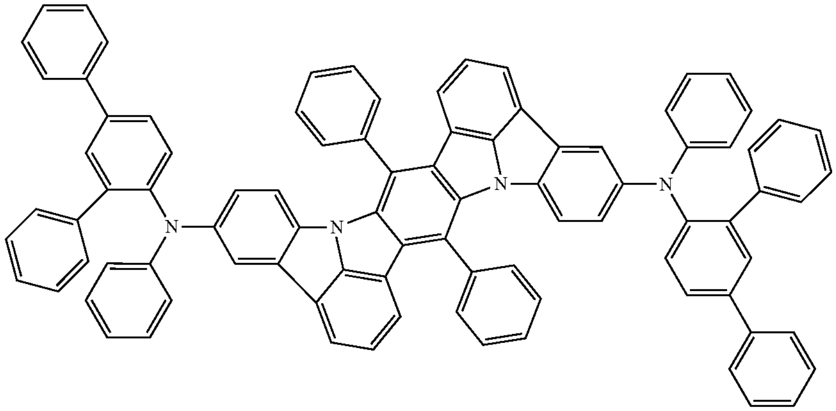
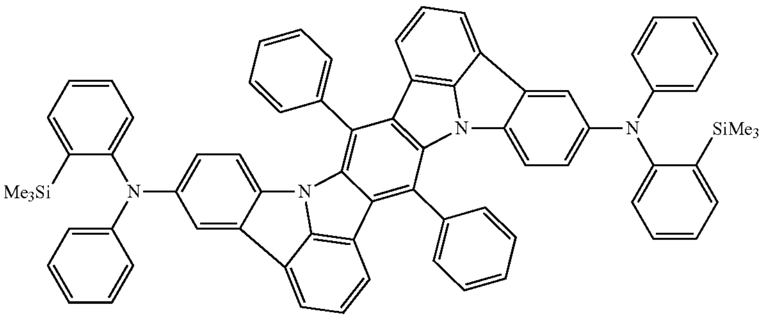
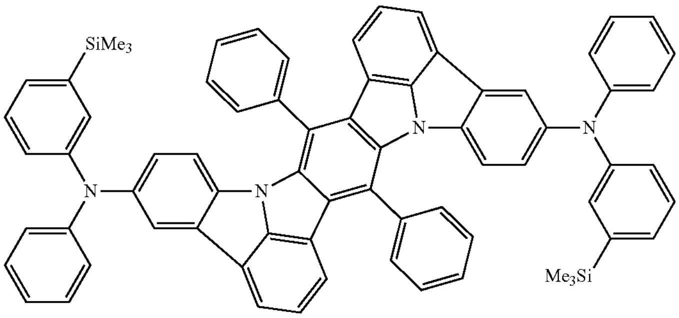

-continued
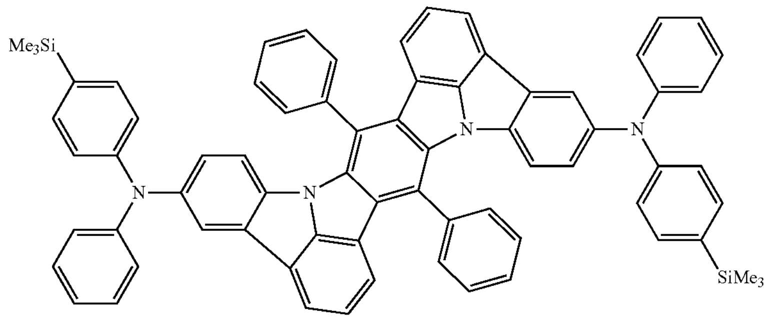
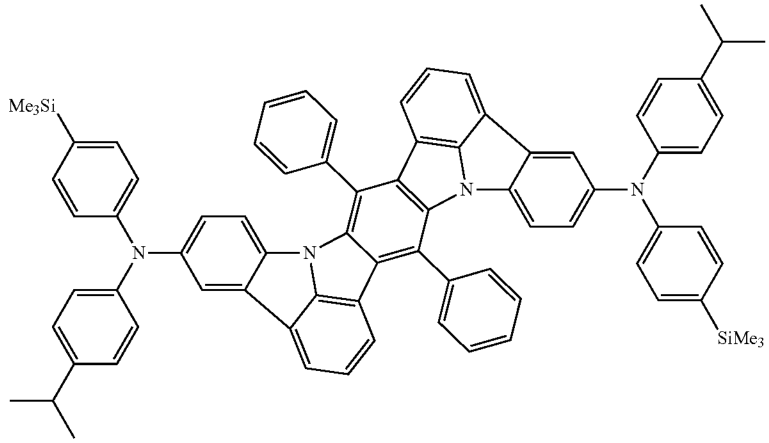
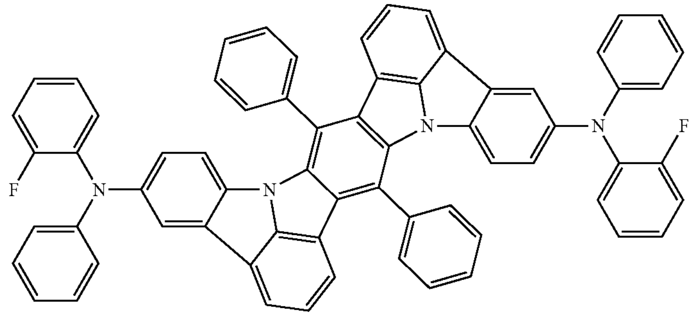
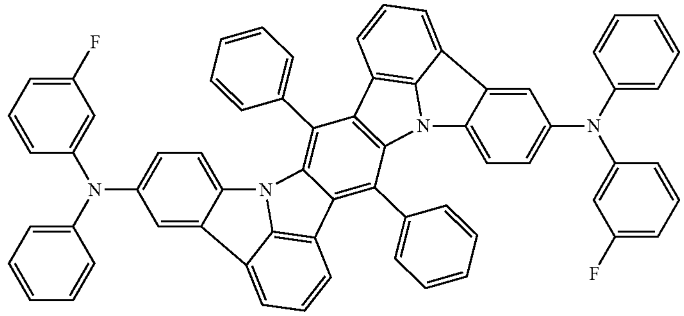

-continued
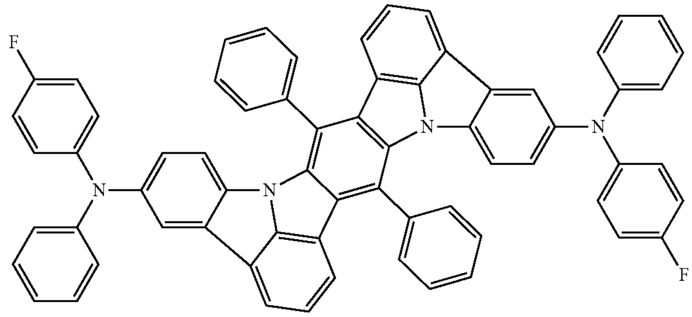
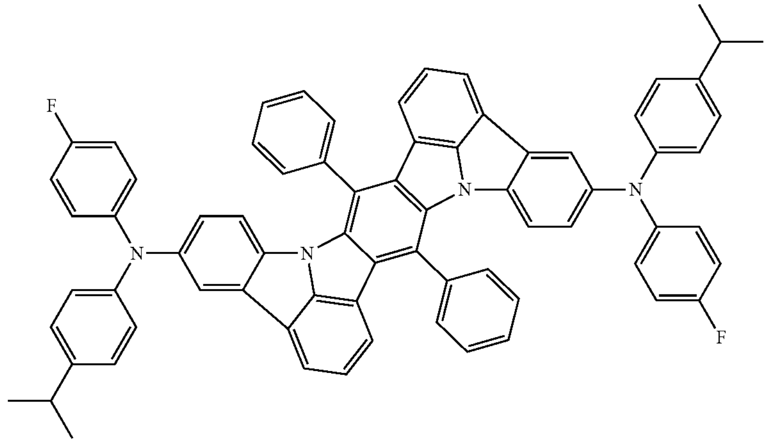
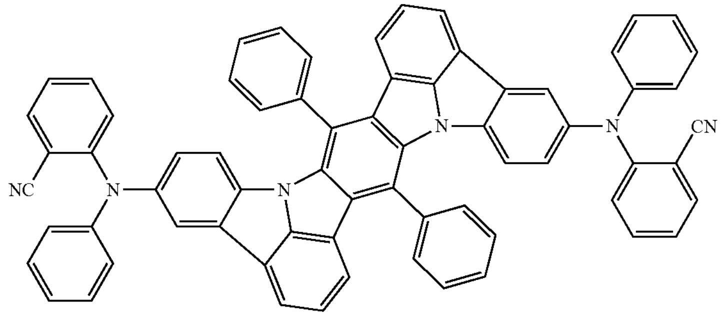
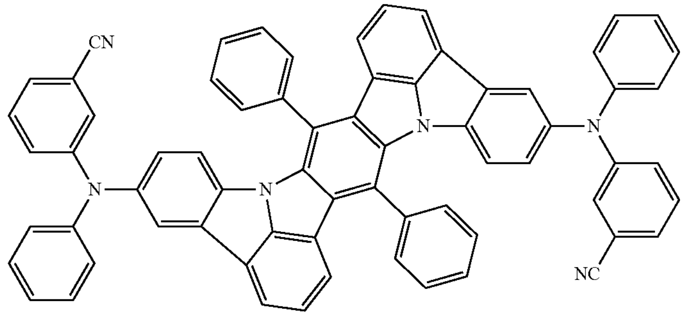
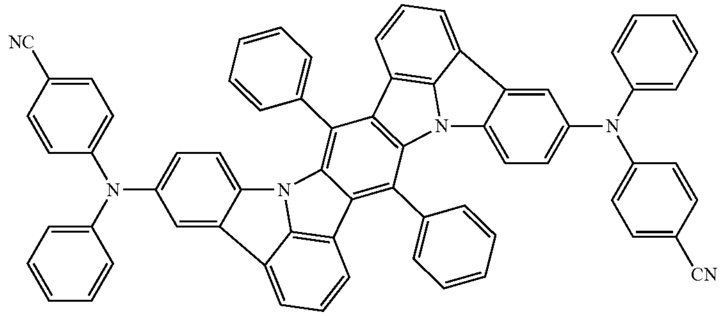

-continued
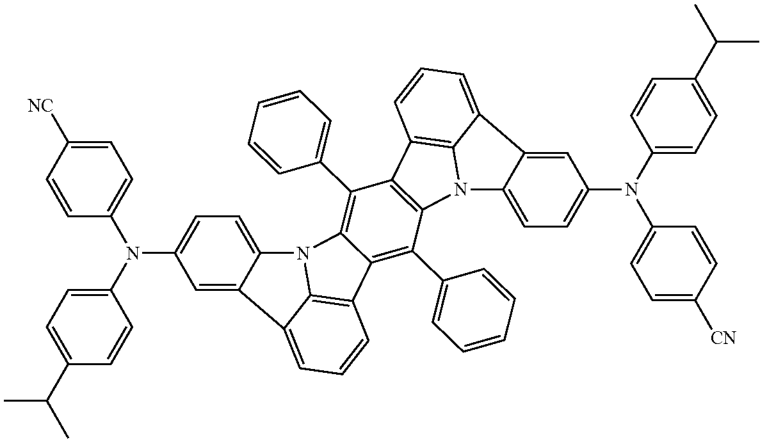
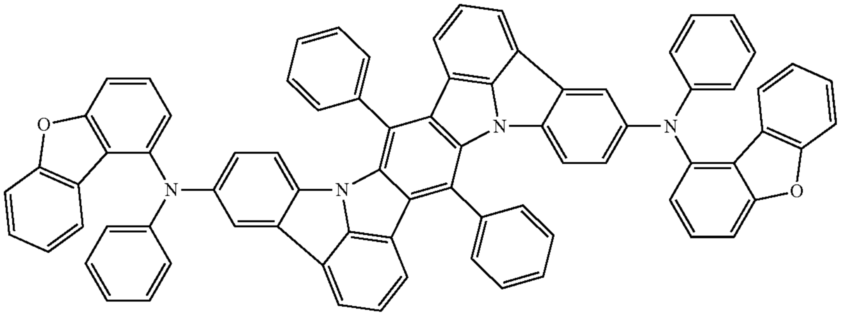
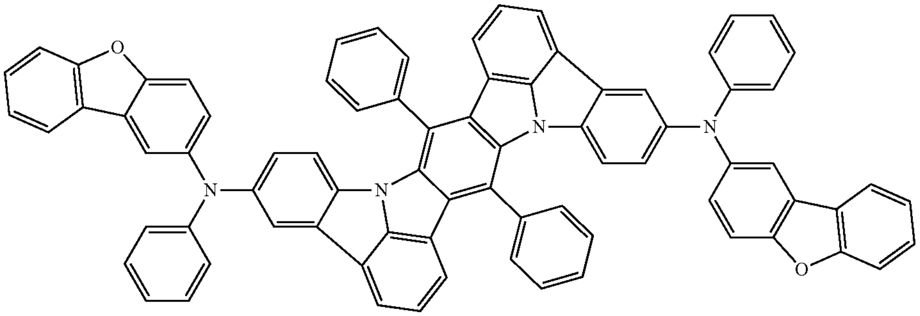
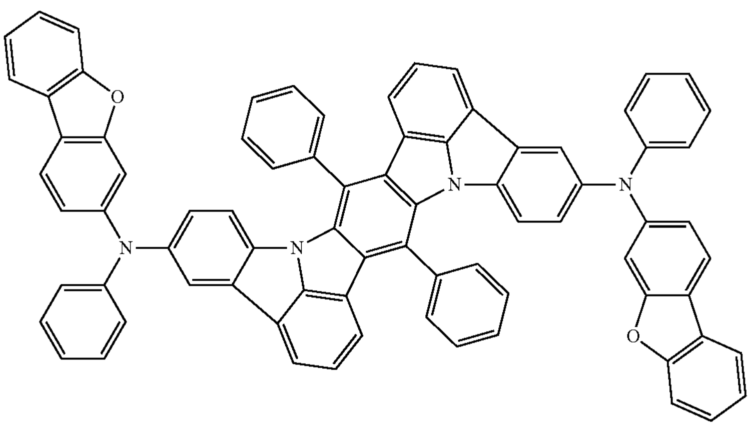

-continued
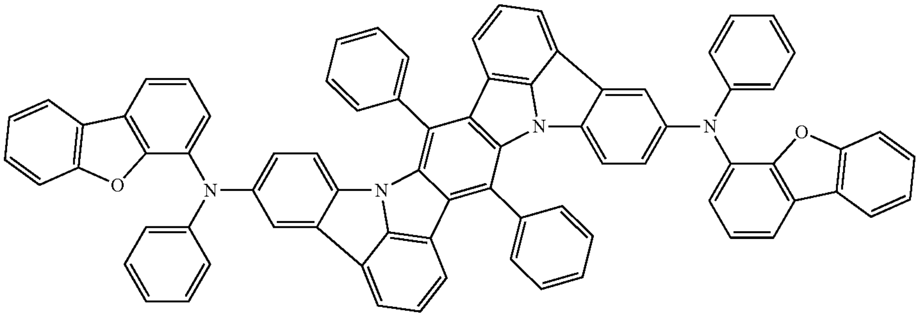
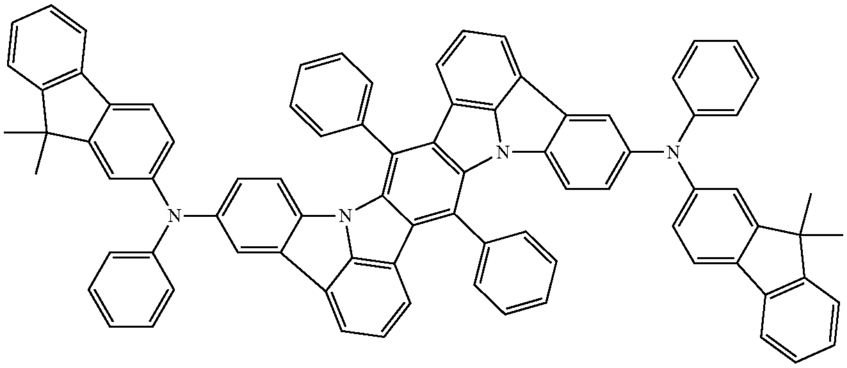
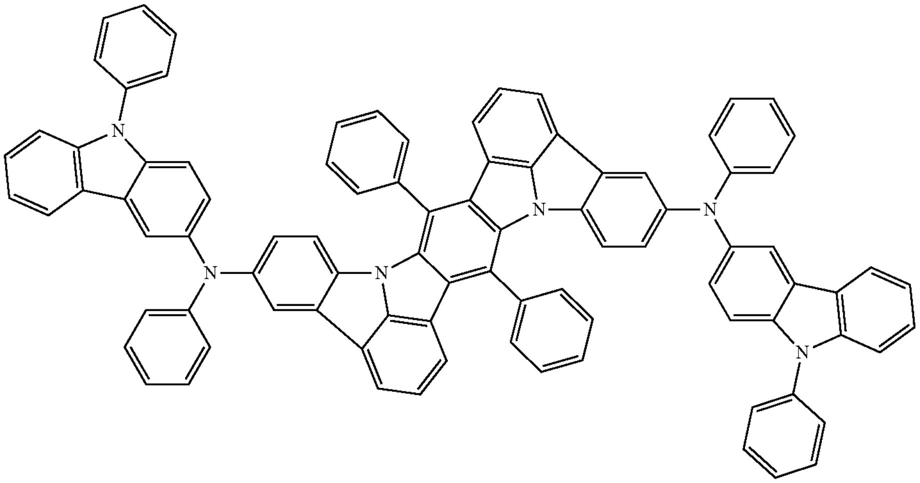
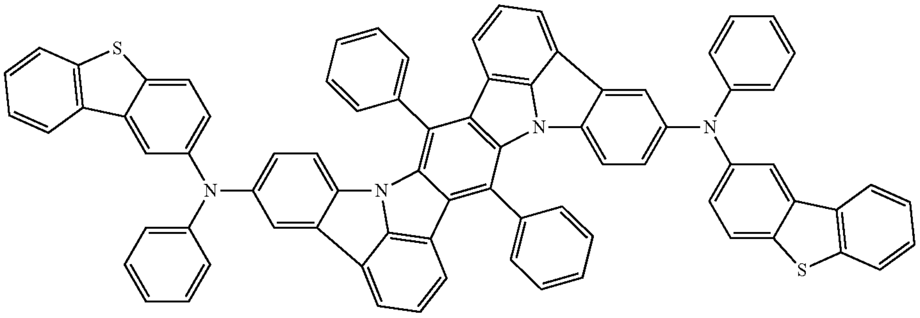

-continued
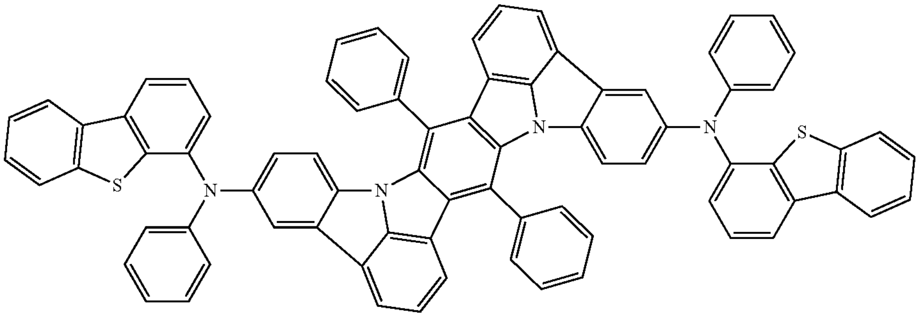
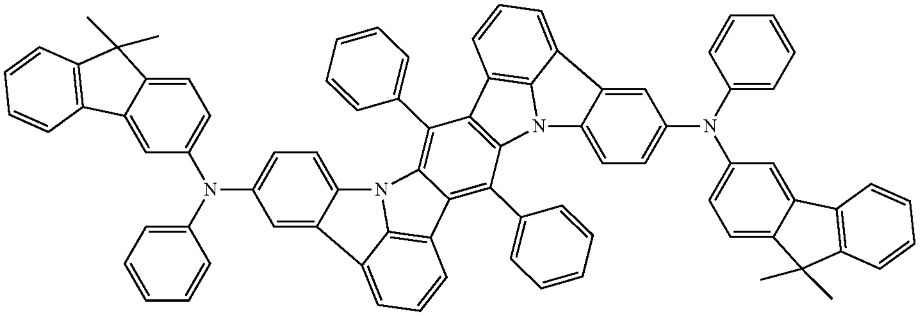
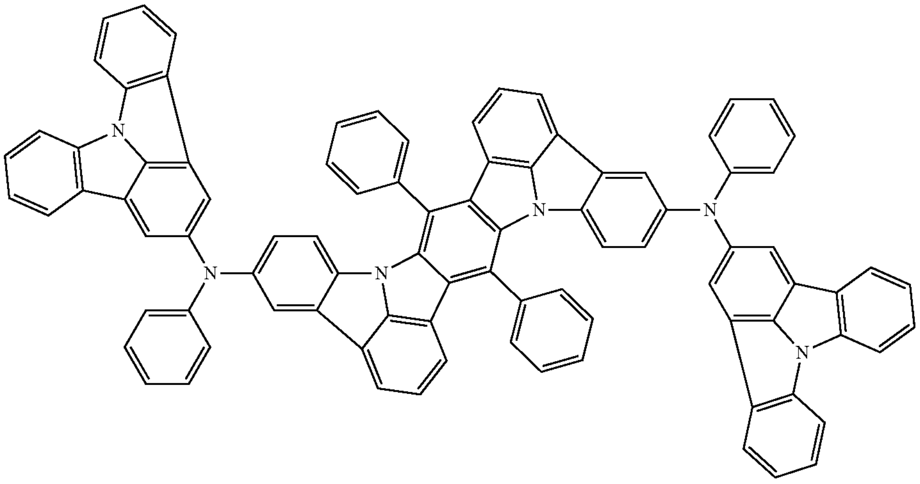
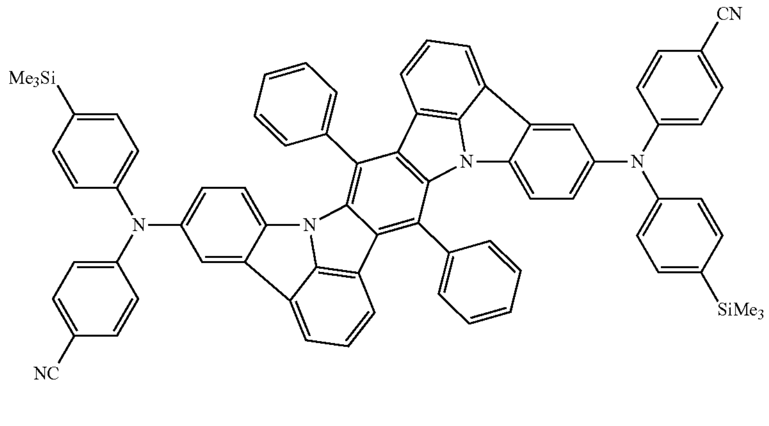

-continued
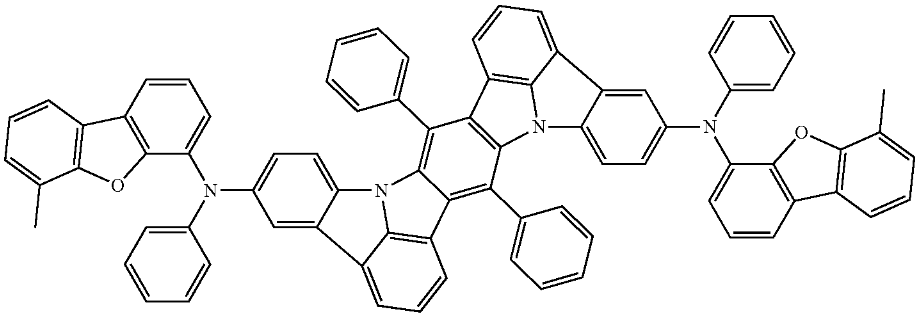
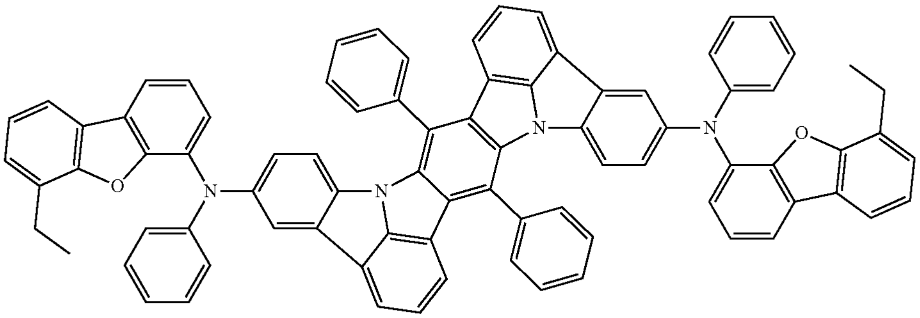
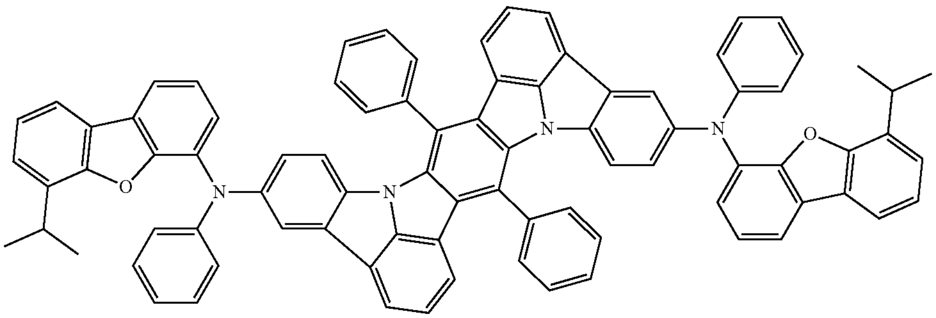
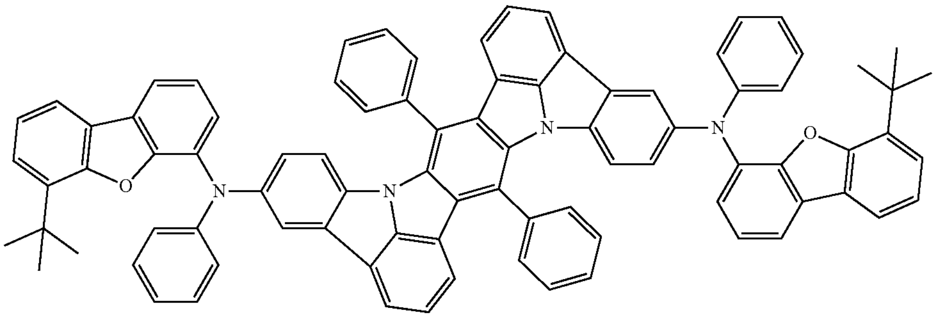
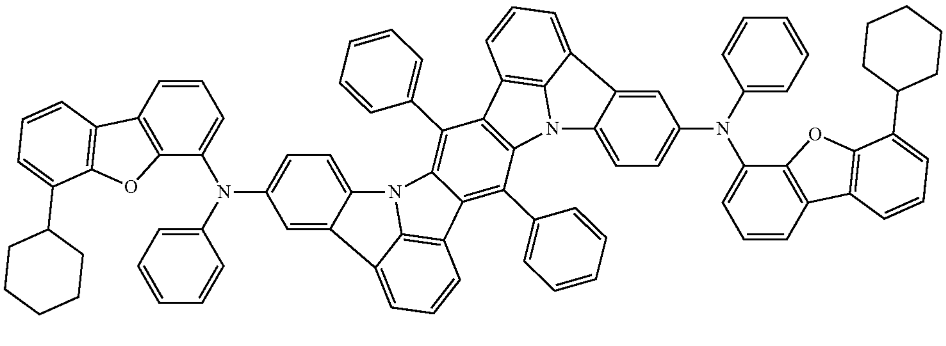

-continued
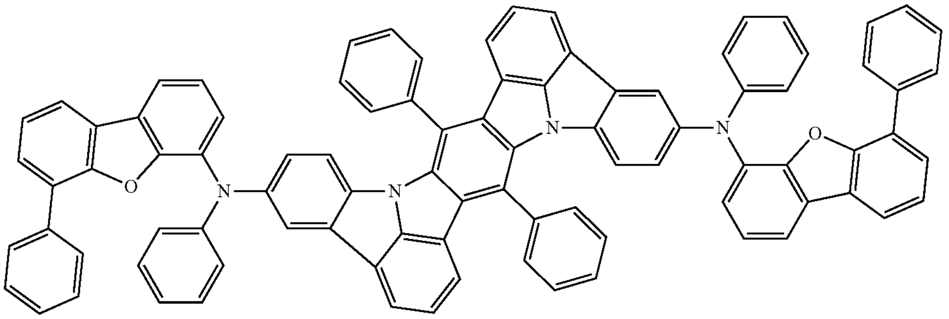
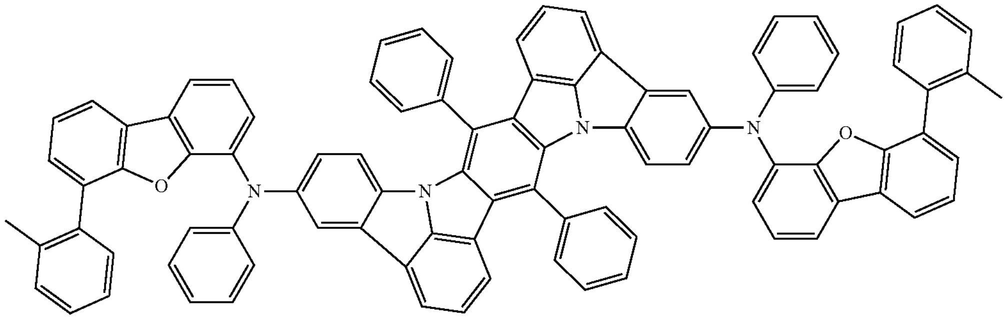
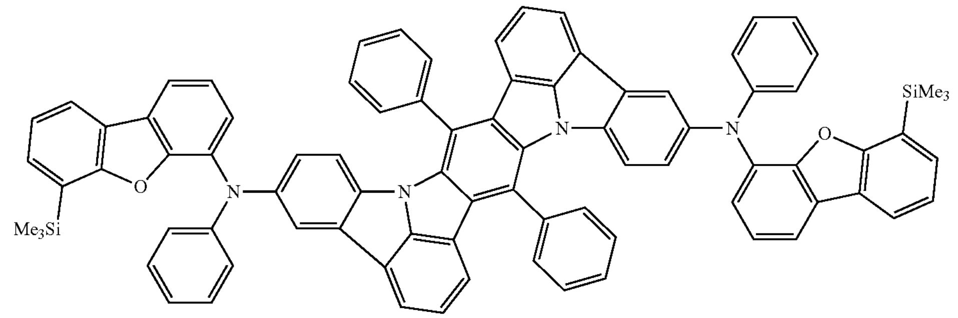
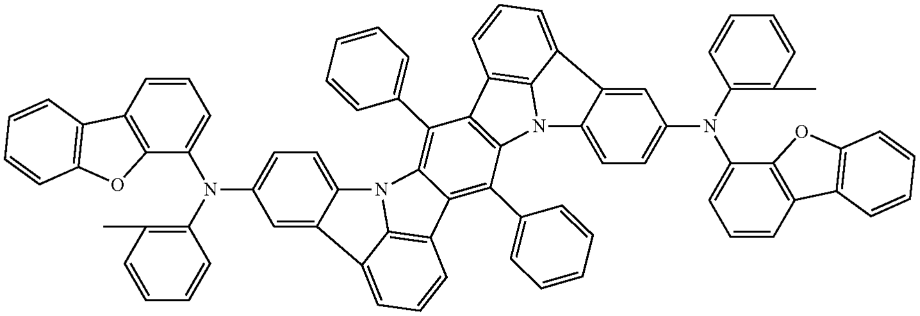
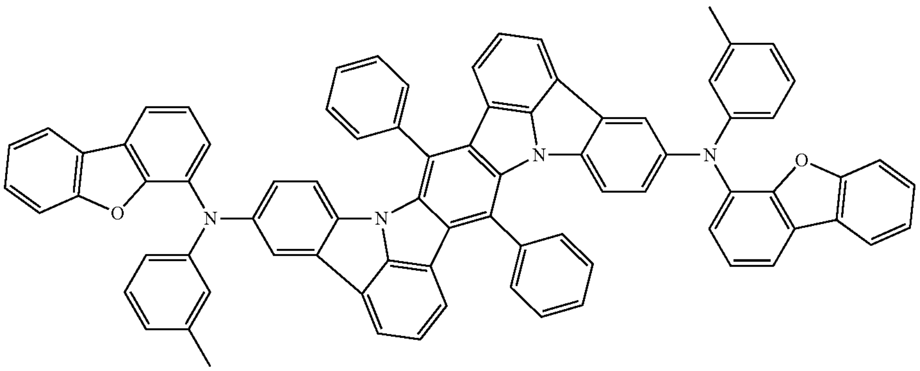

-continued
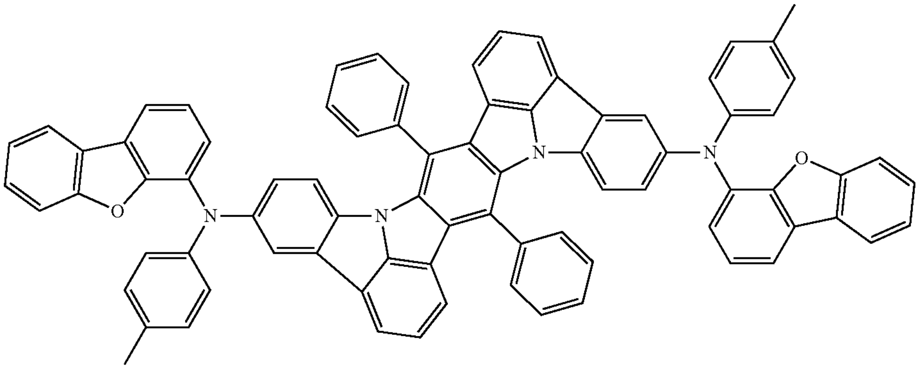
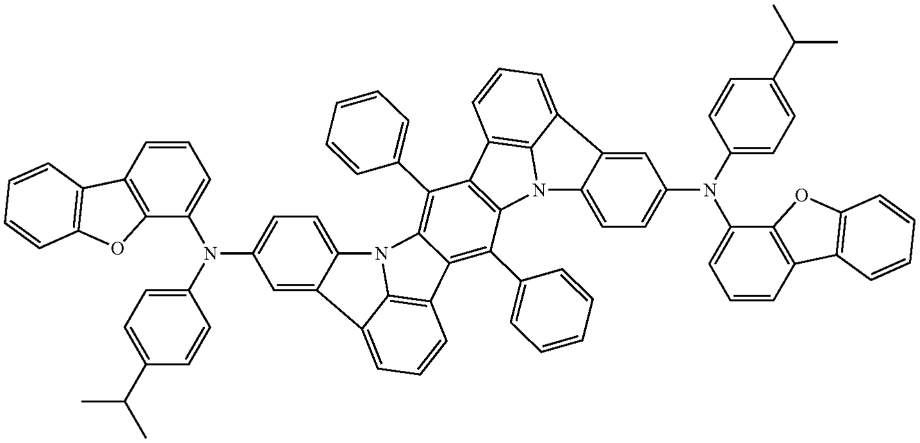
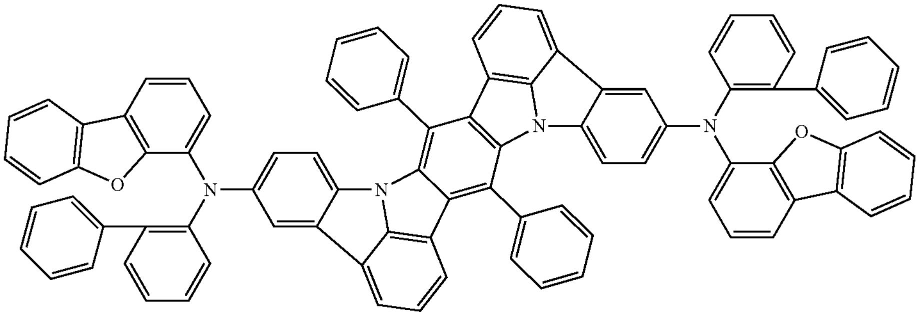
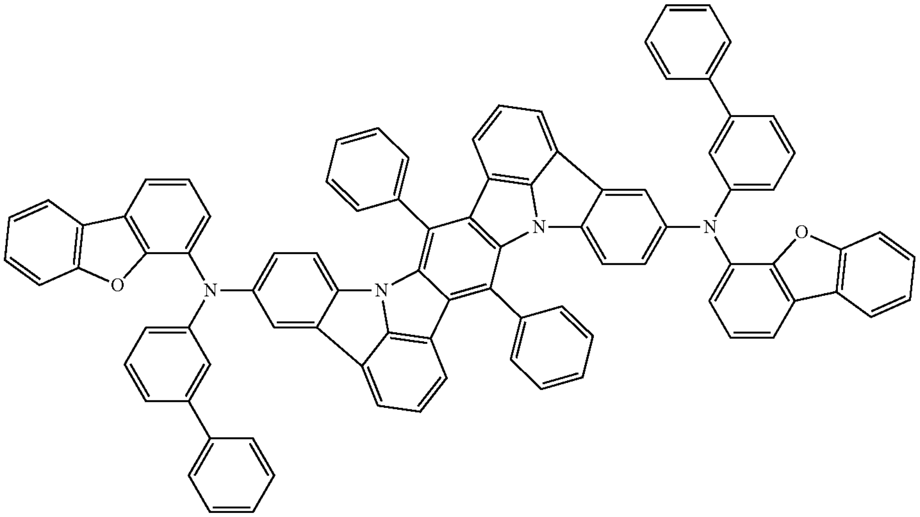

-continued
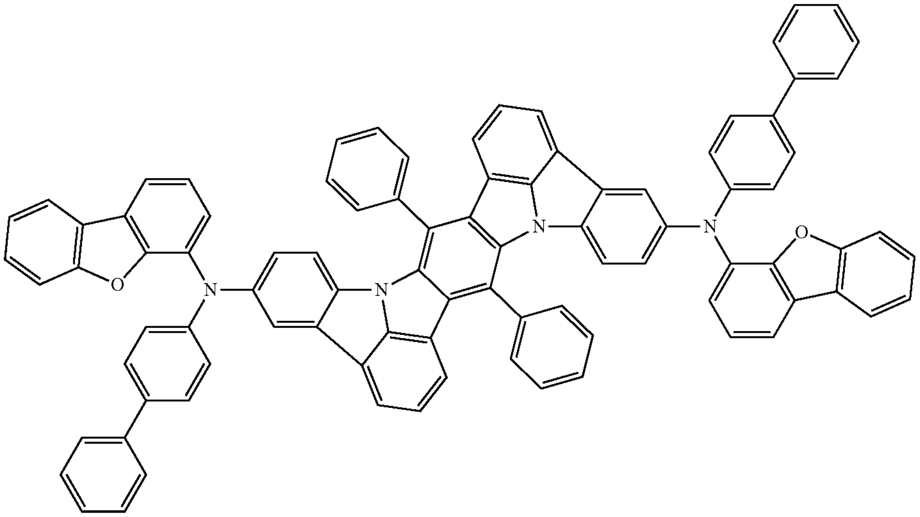
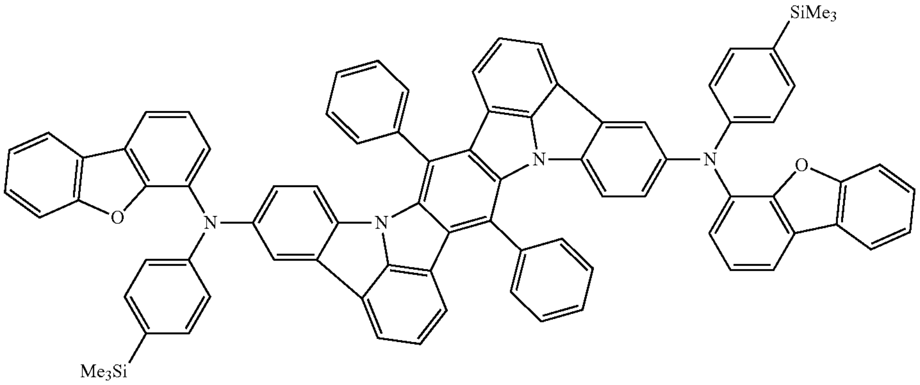
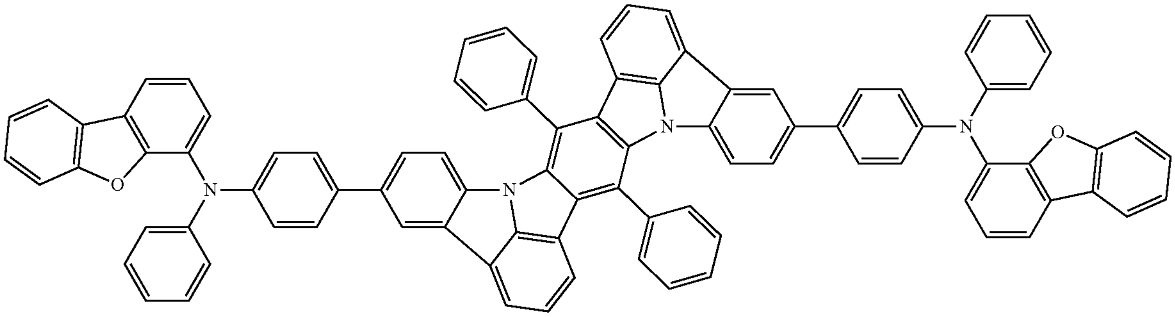
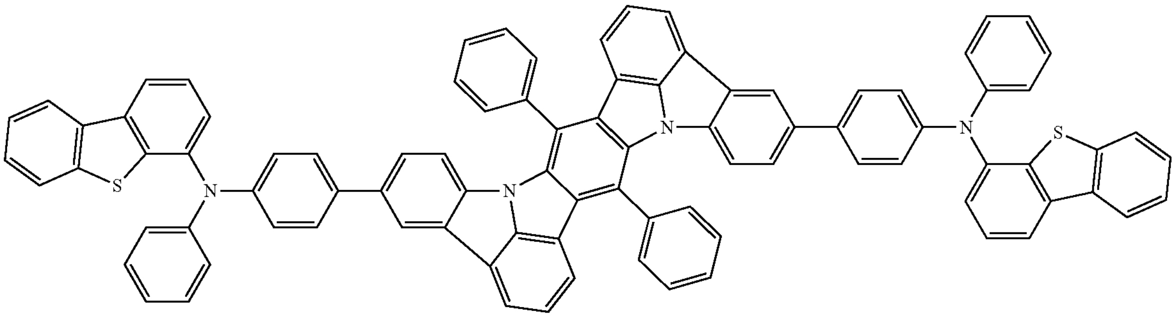

-continued
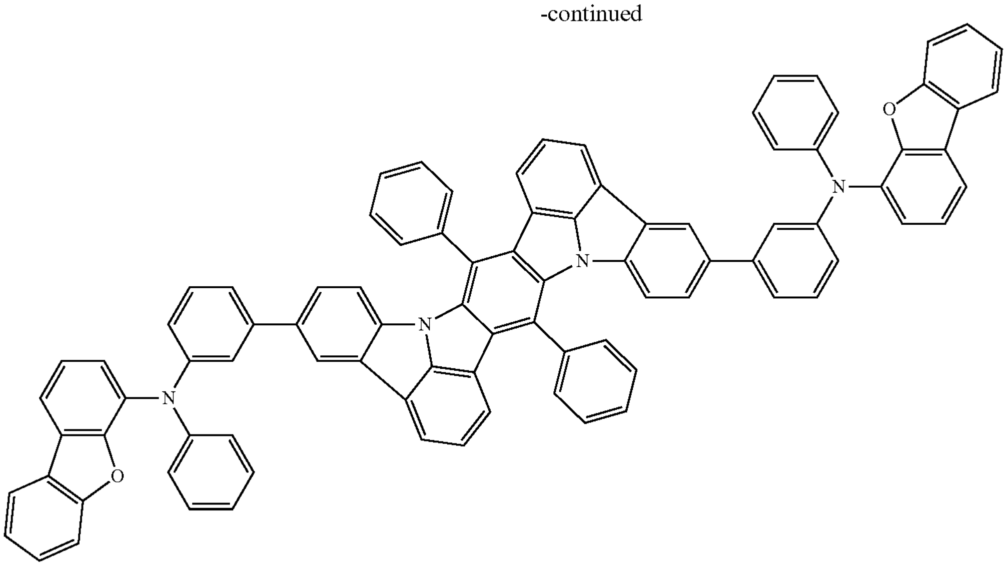
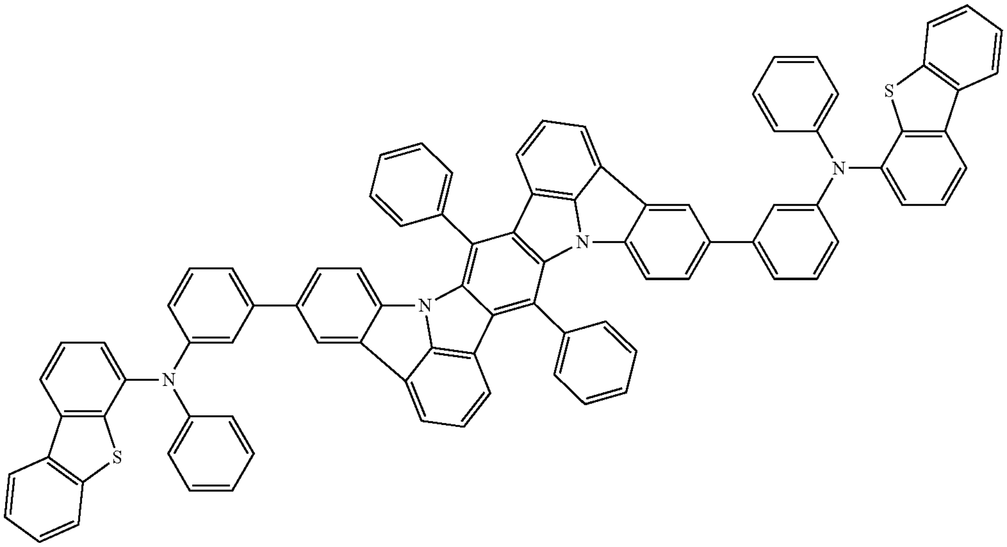
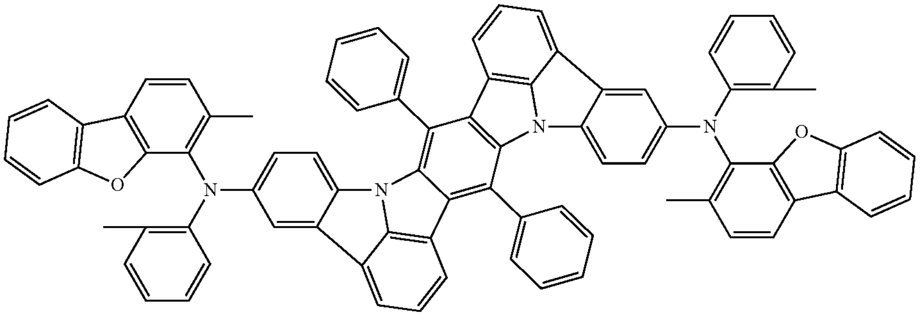
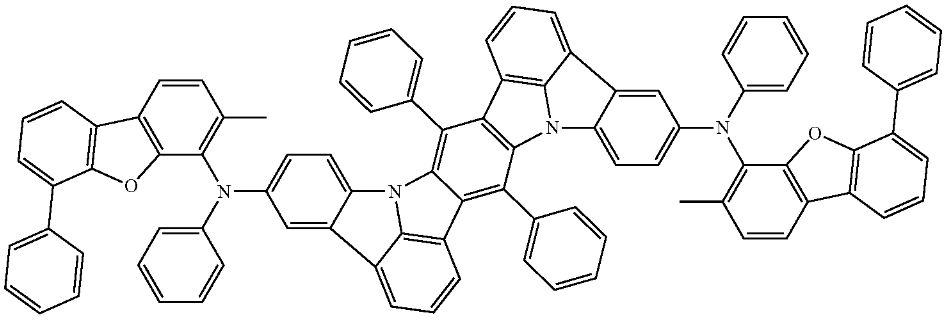

-continued
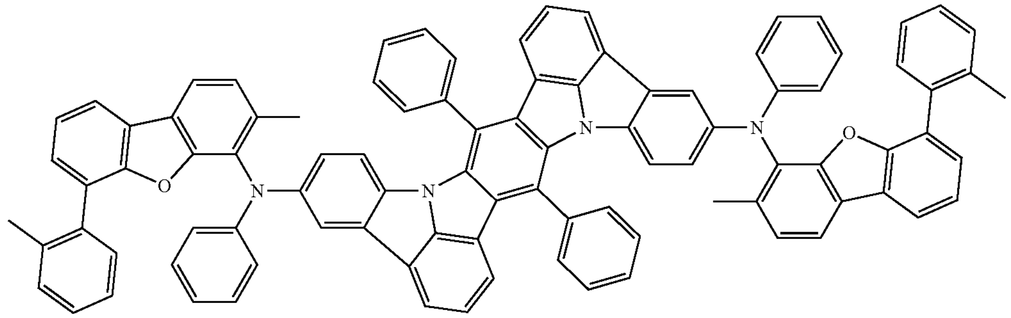
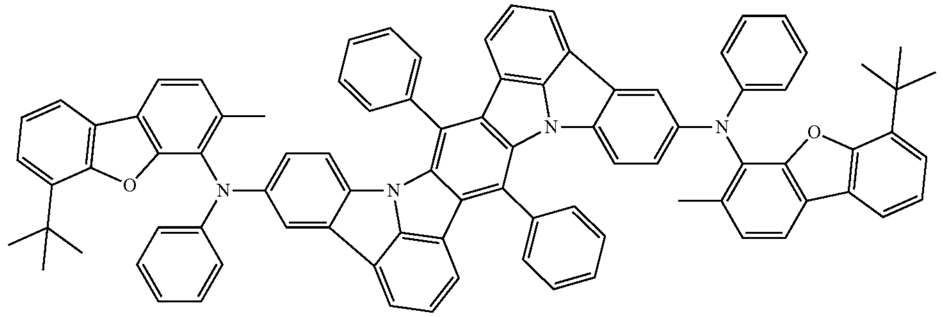
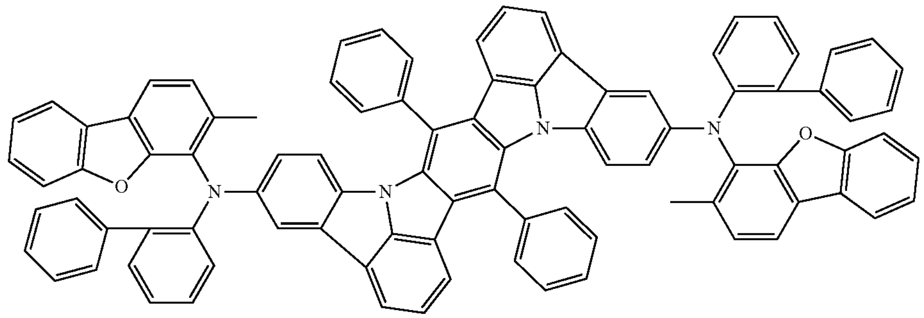
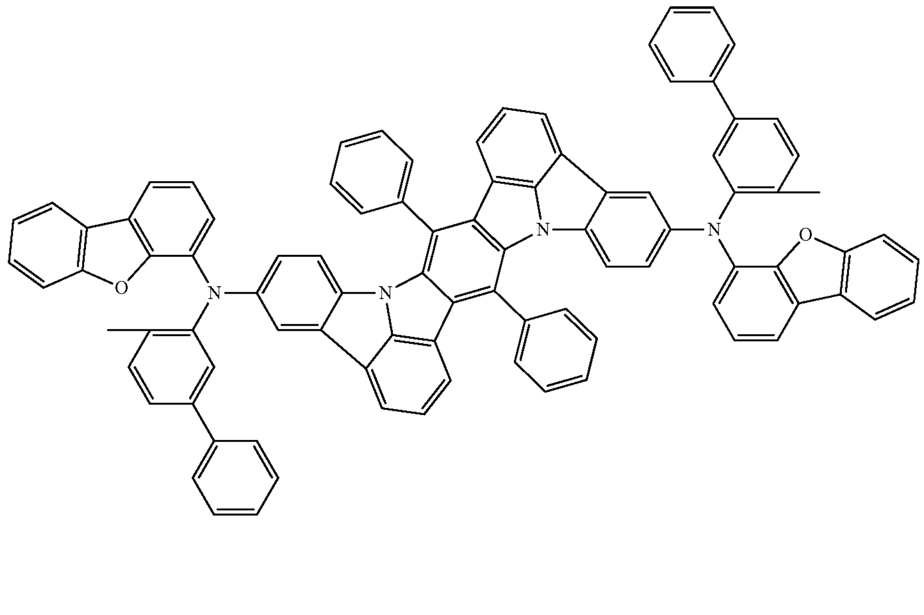

-continued
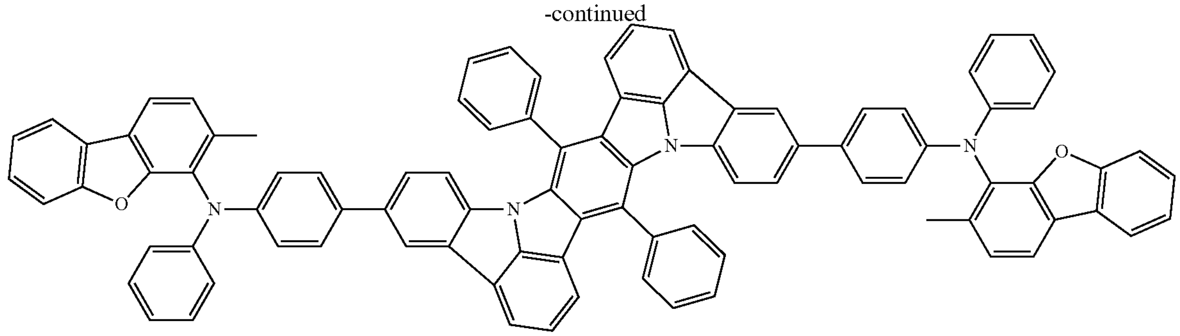
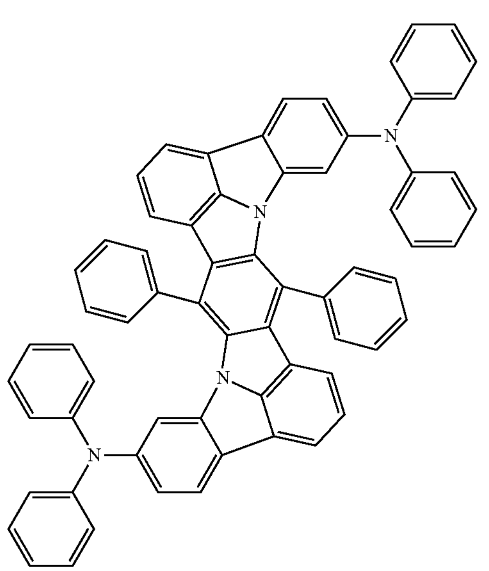
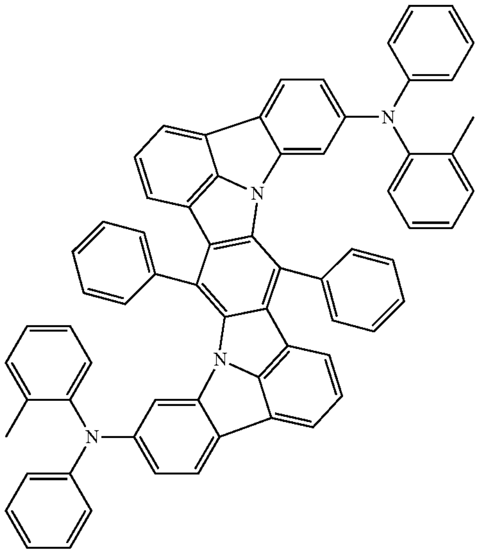
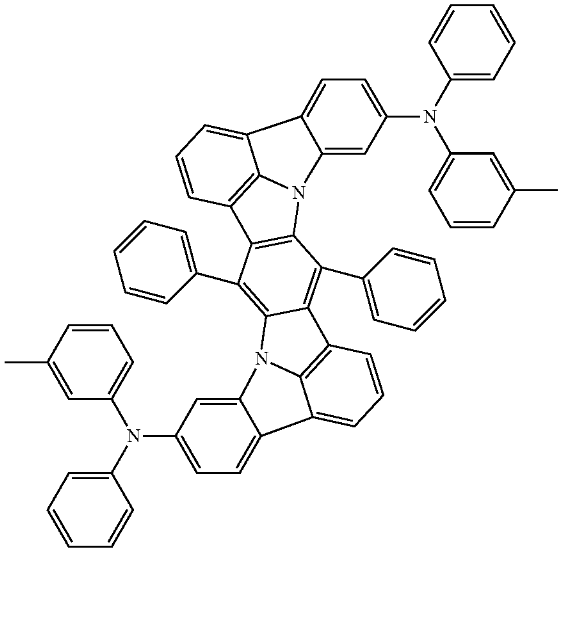
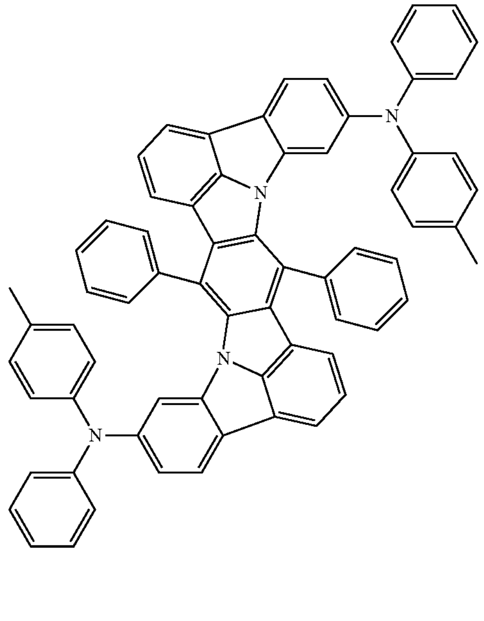

-continued
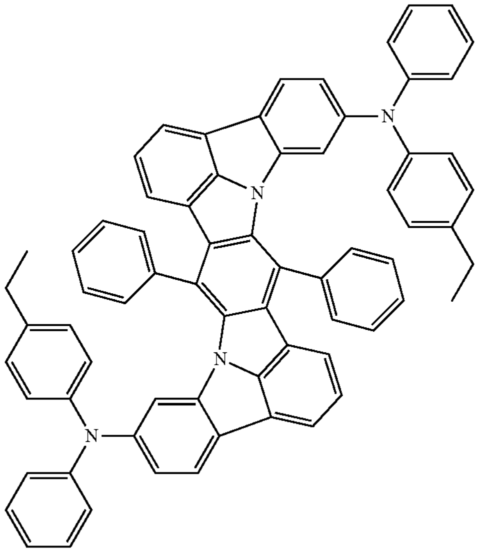
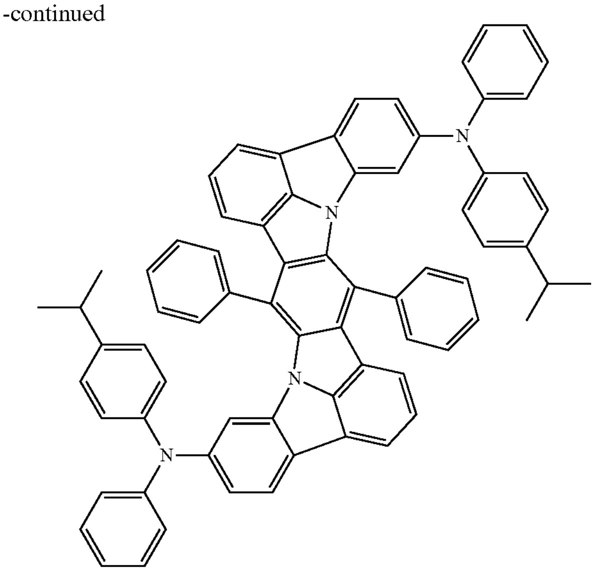
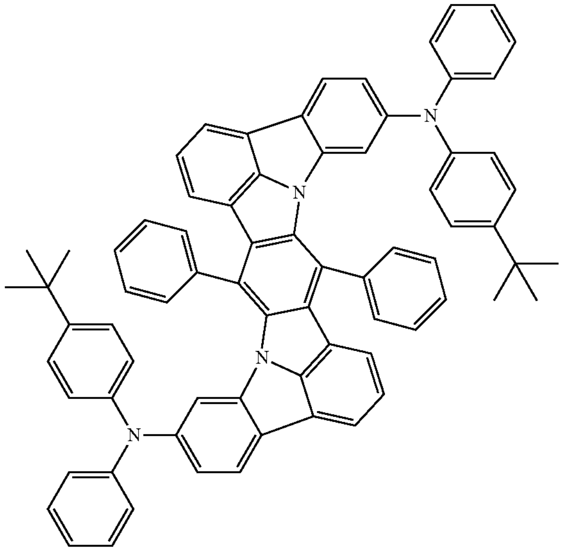
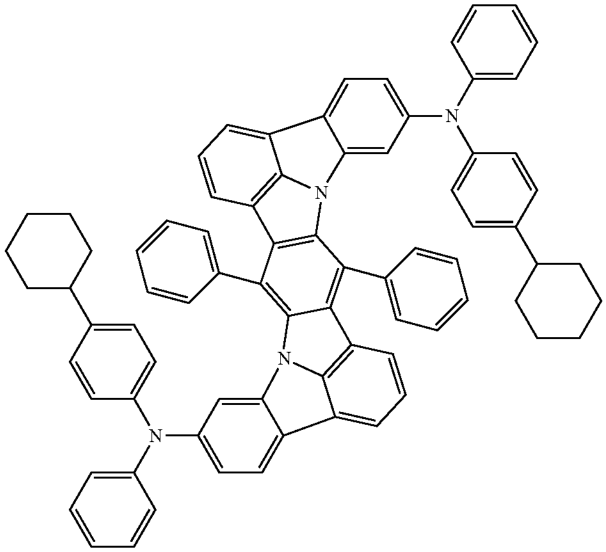
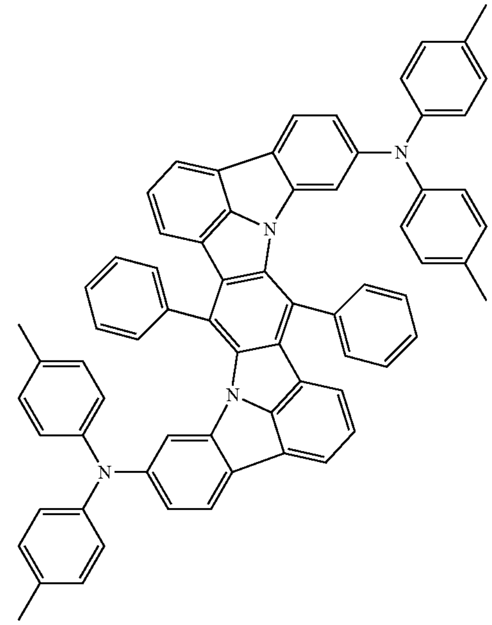

-continued
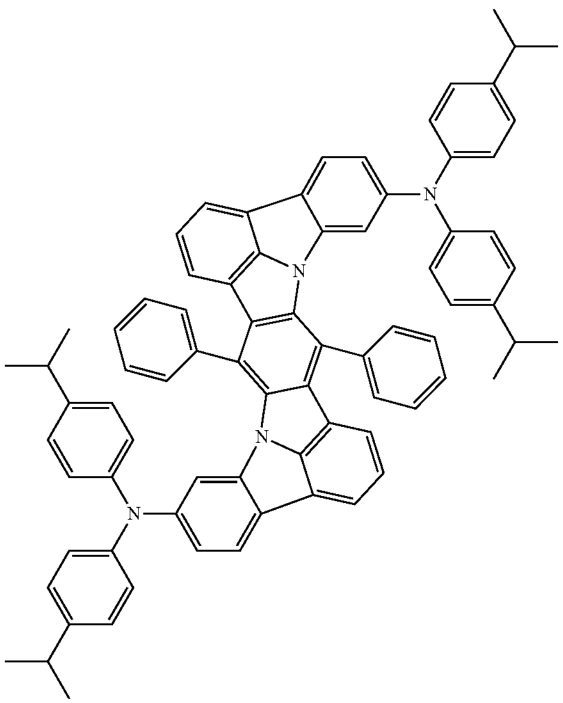
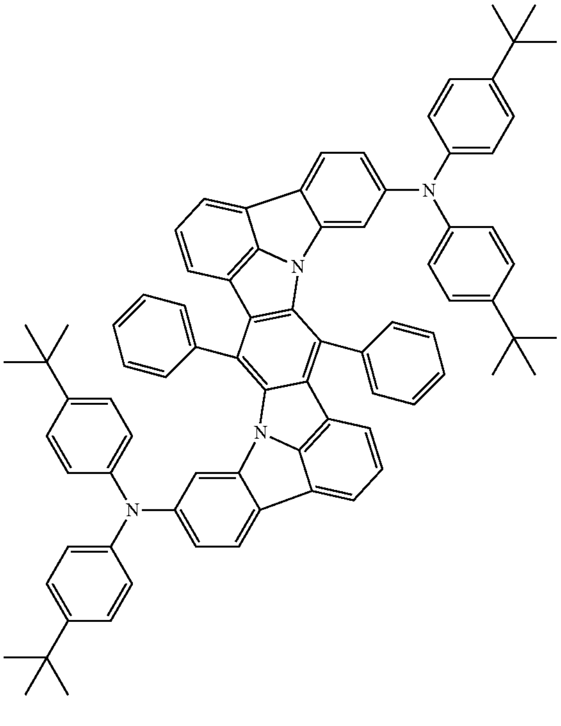
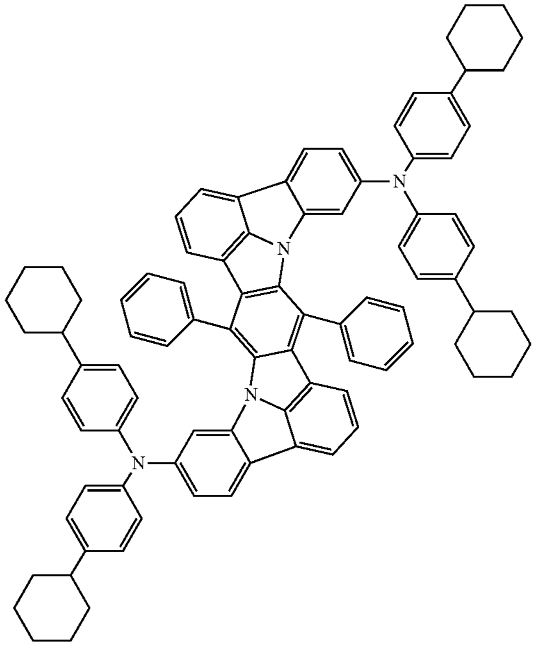

-continued
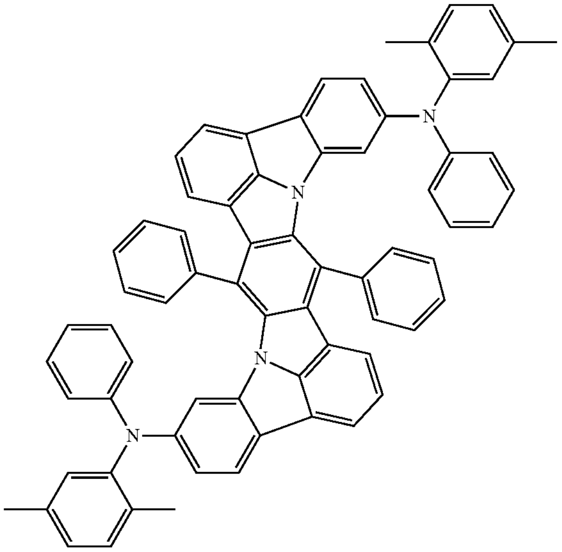
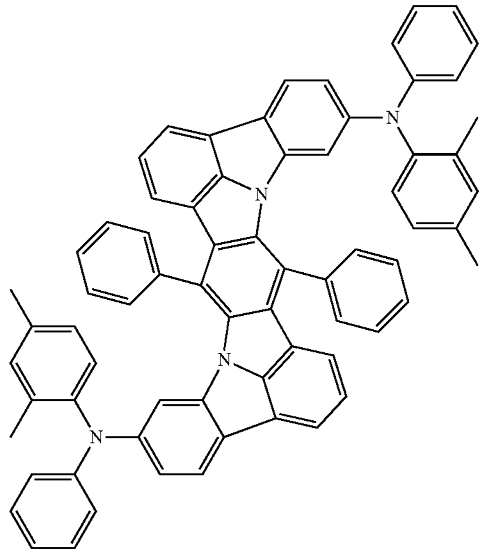
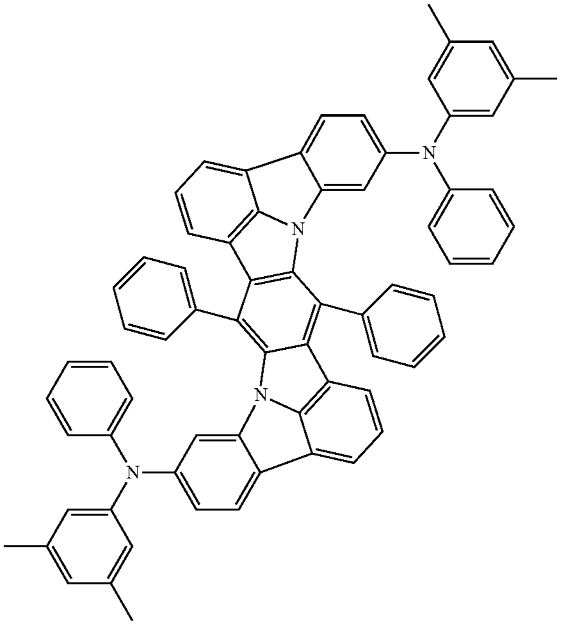
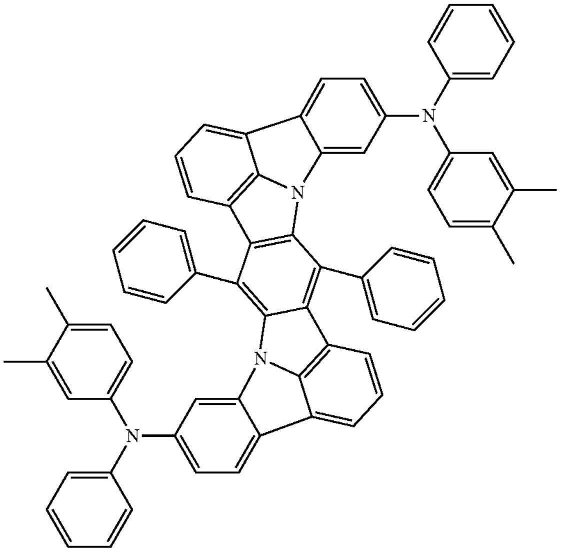

-continued
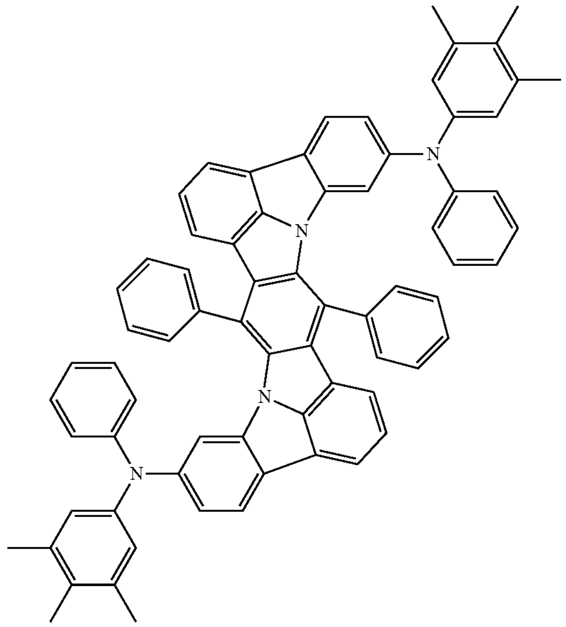
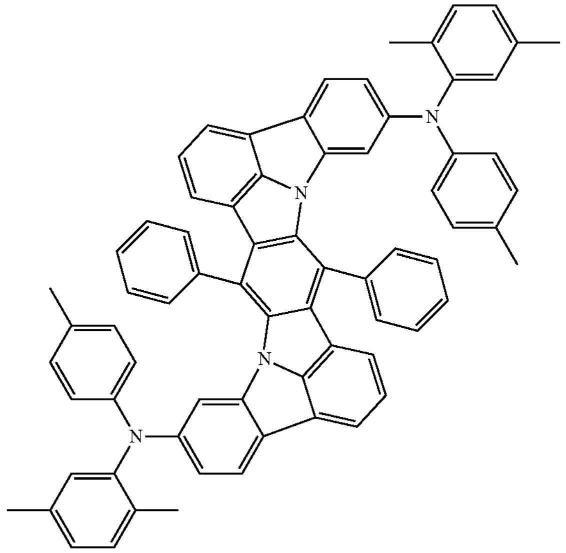
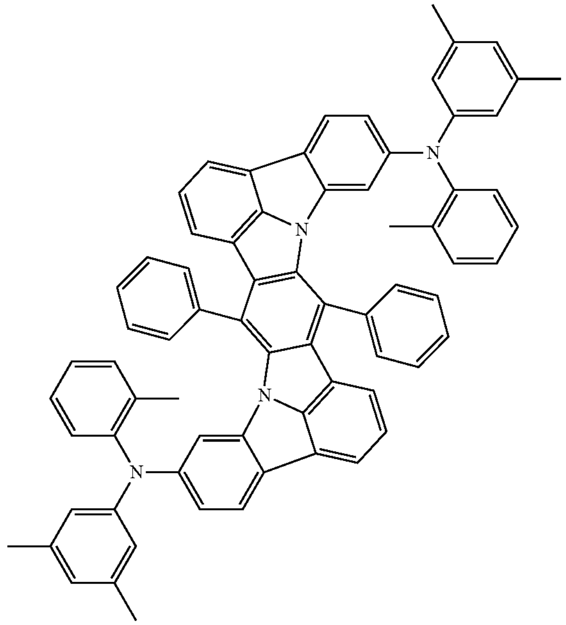

-continued
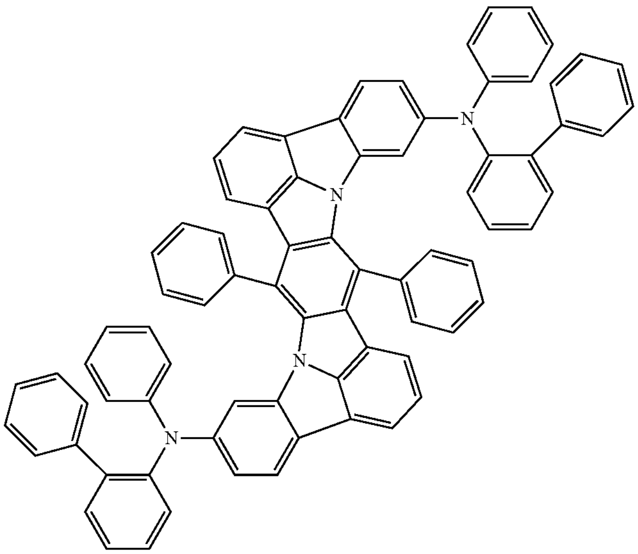
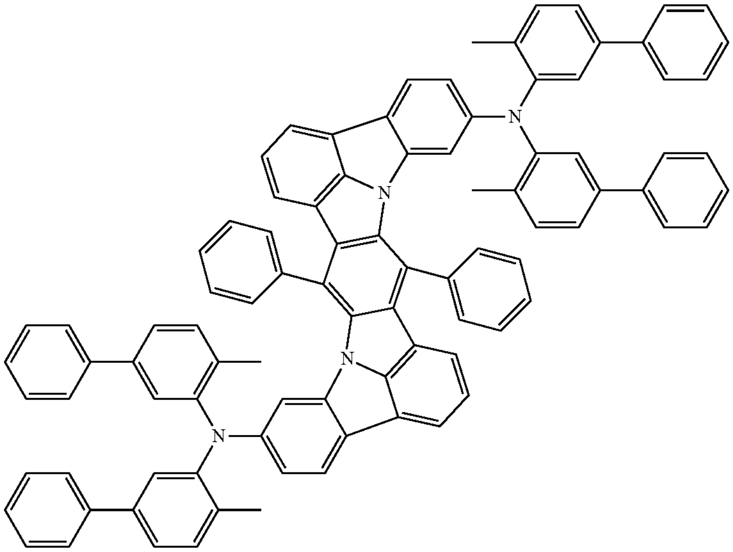
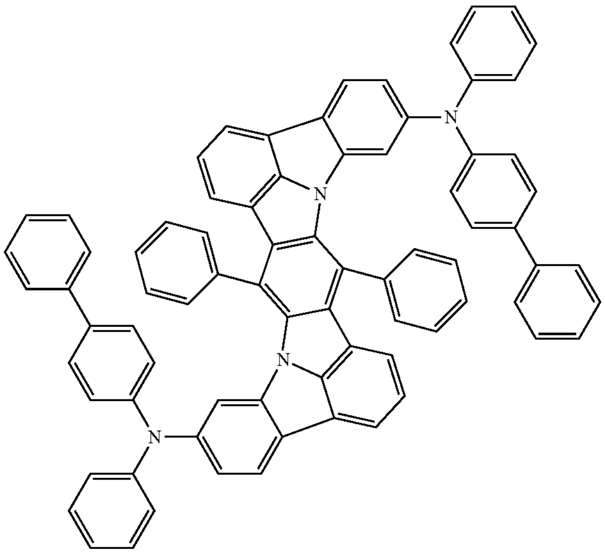

-continued
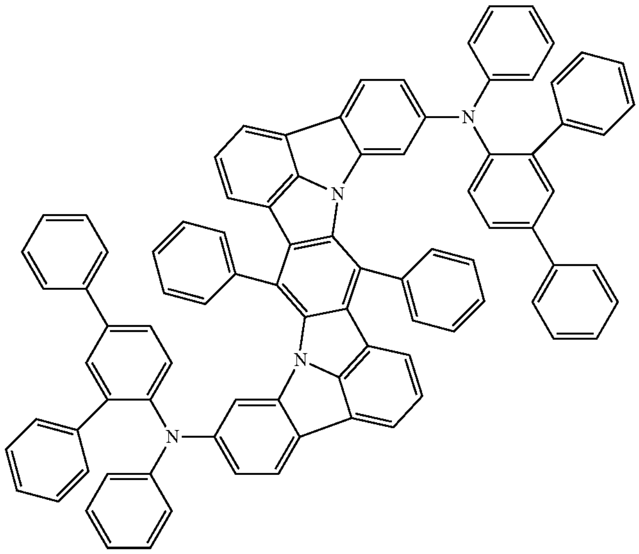
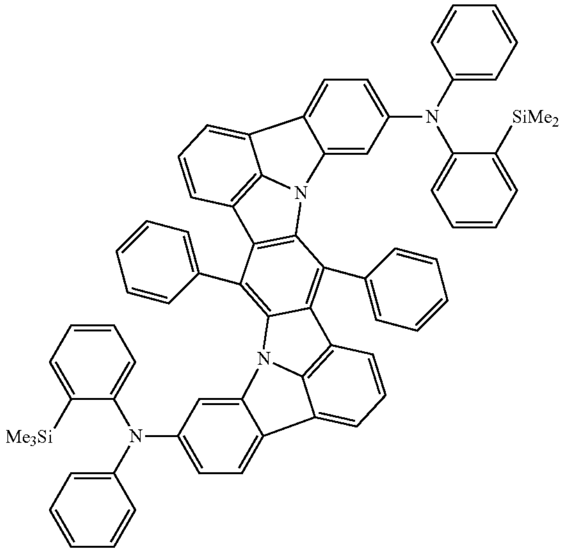
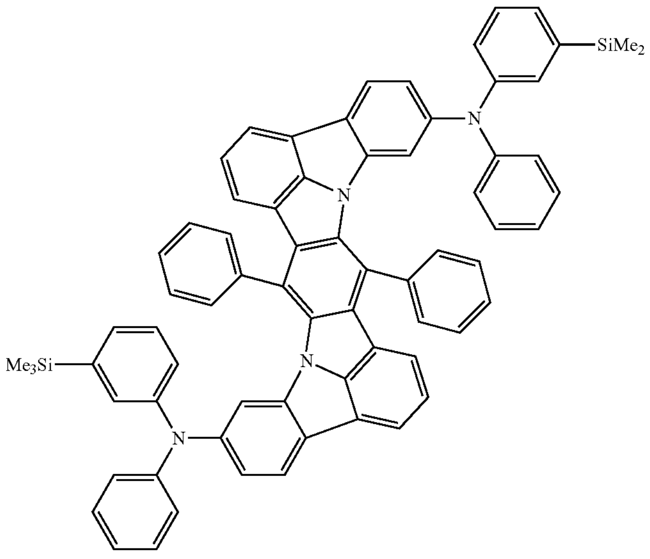

-continued
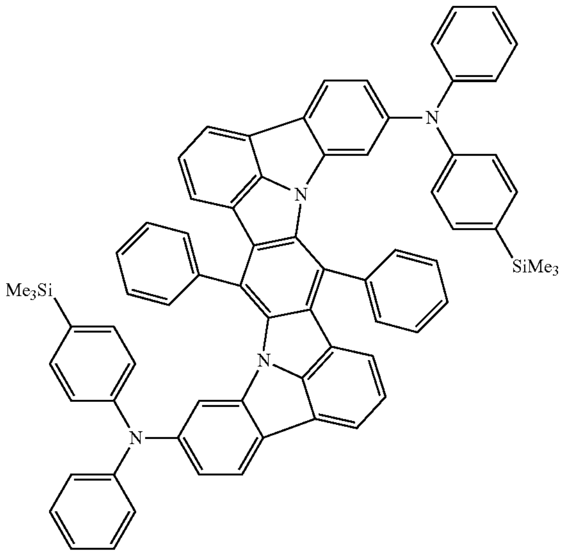
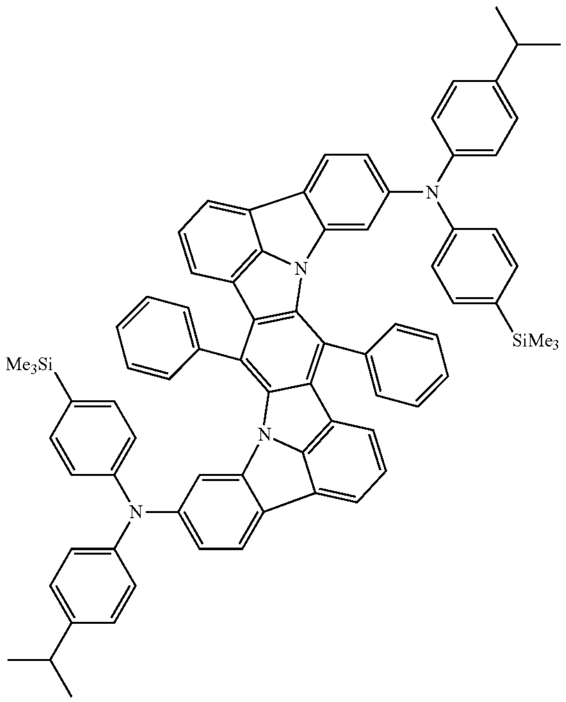
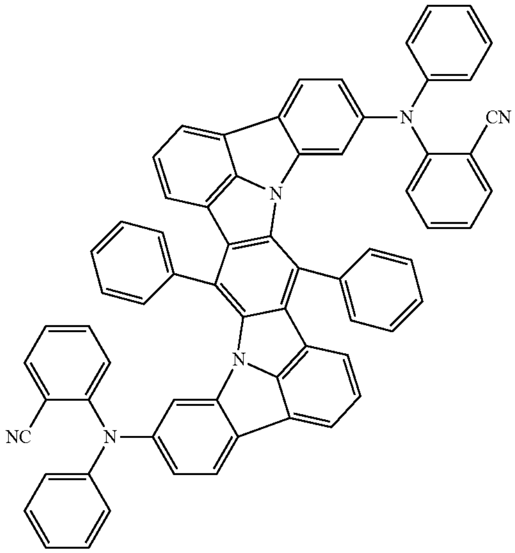
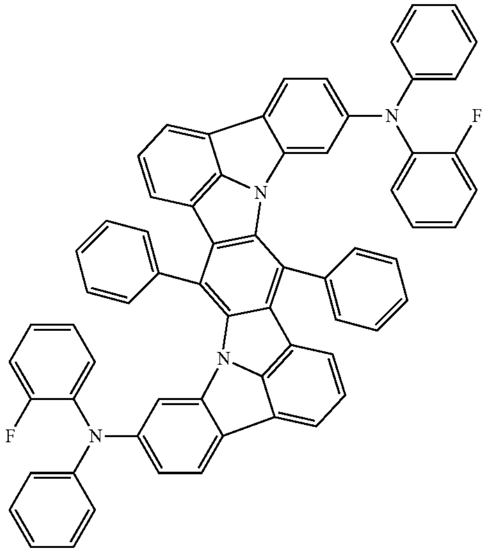

-continued
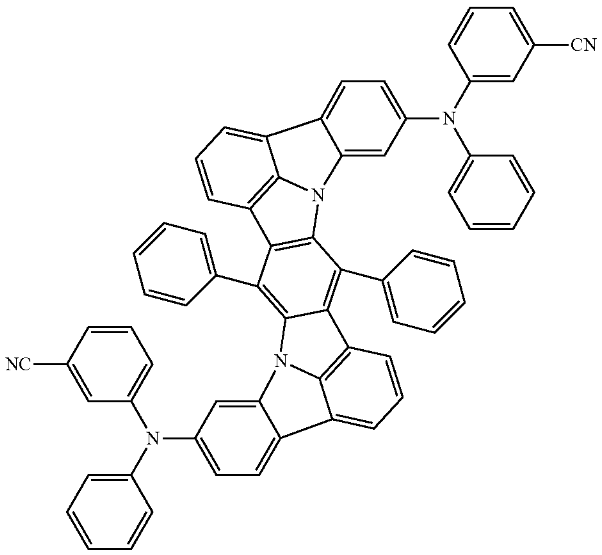
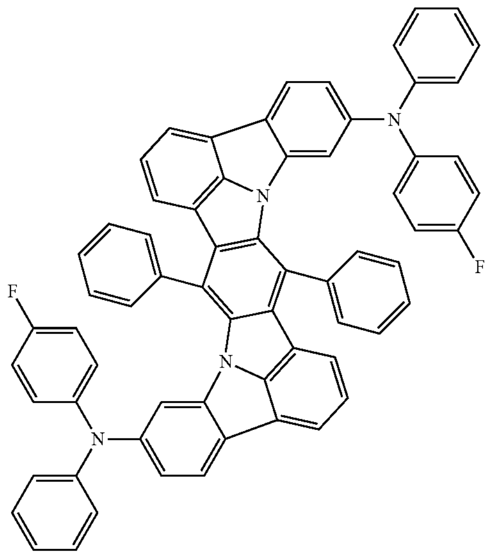
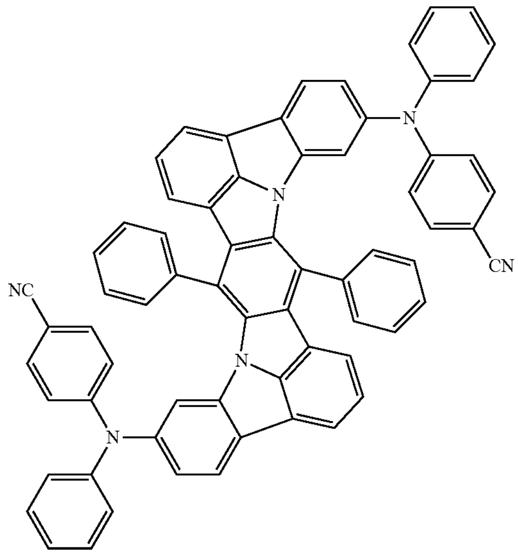
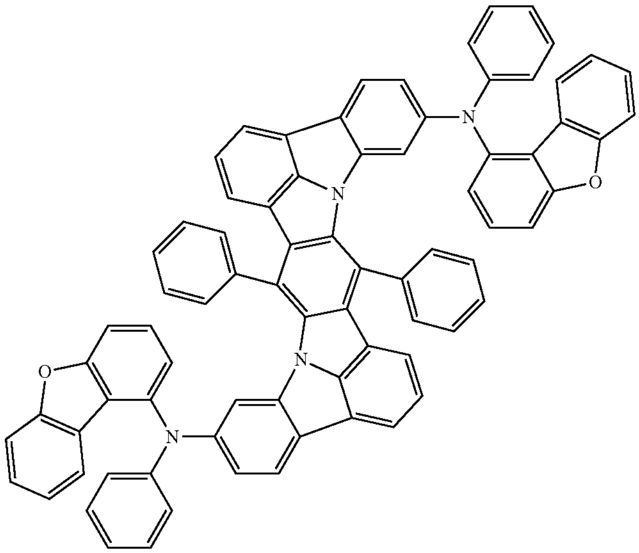

-continued
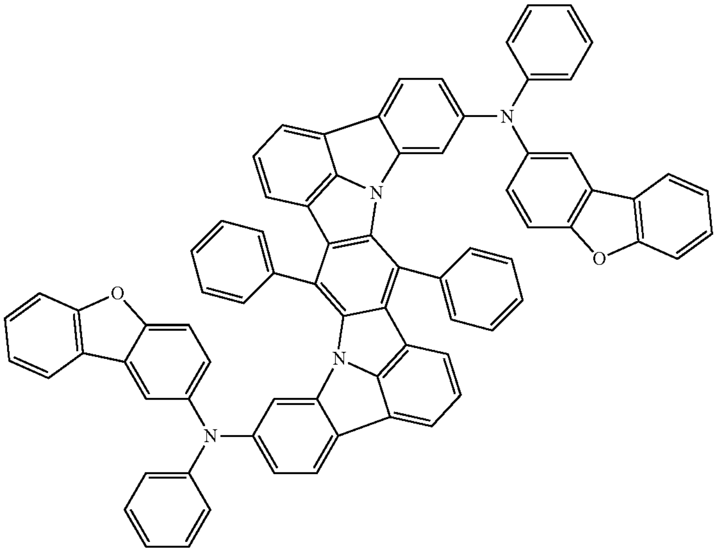
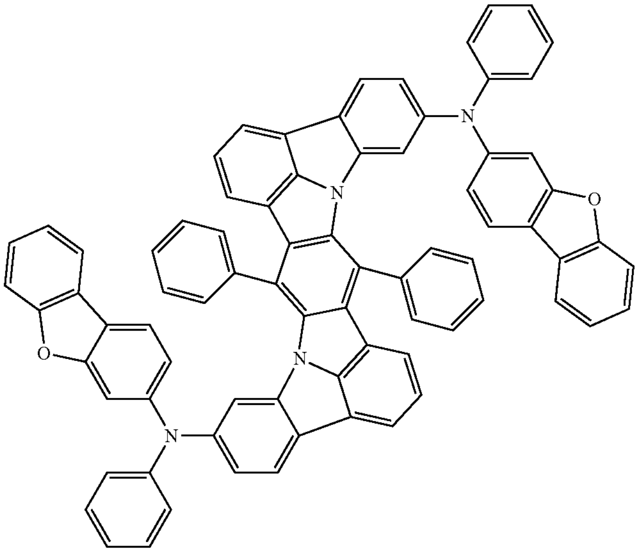
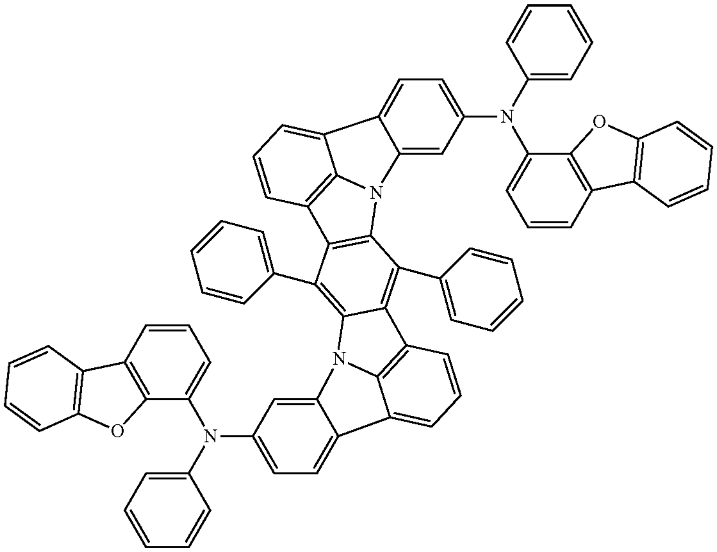

-continued
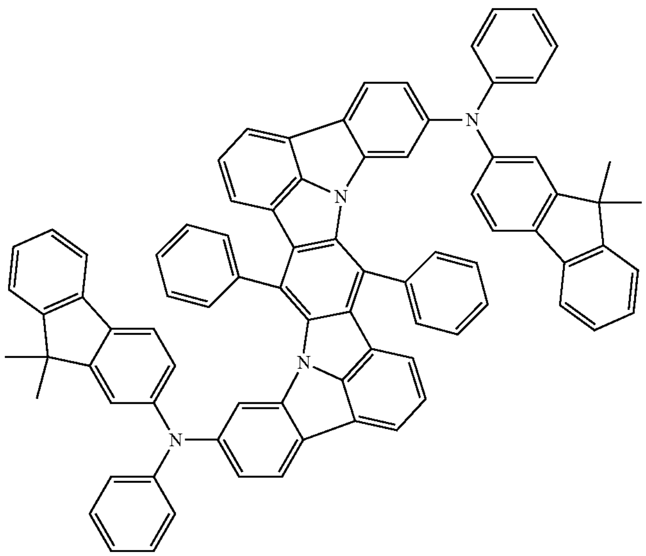
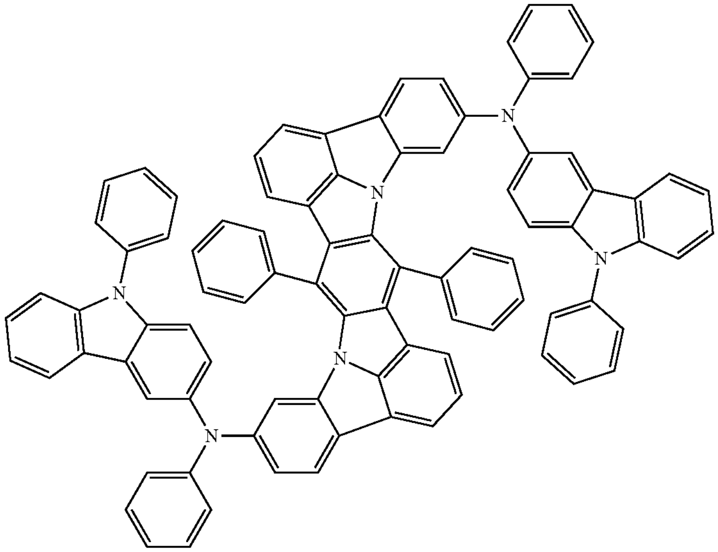
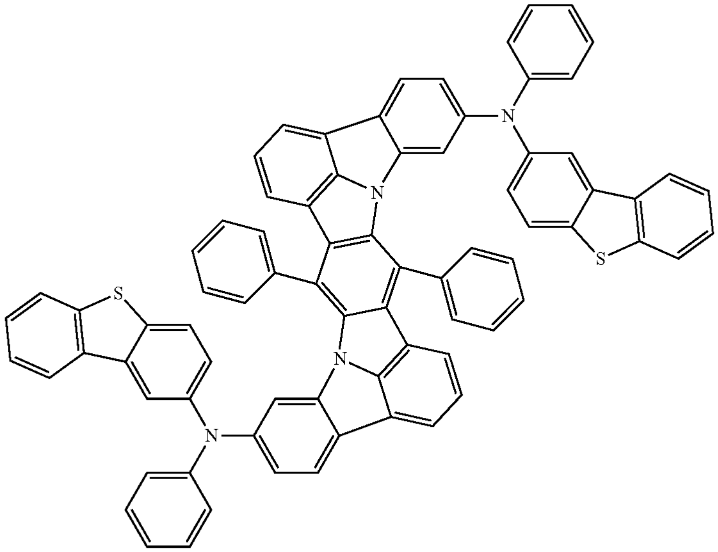

-continued
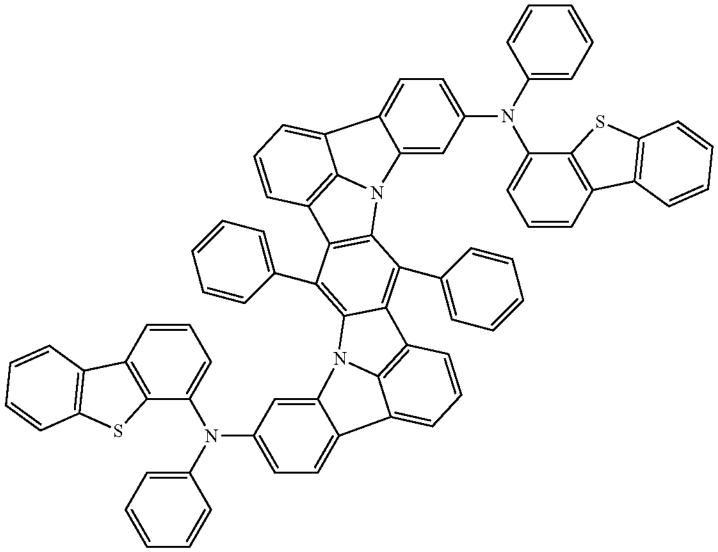
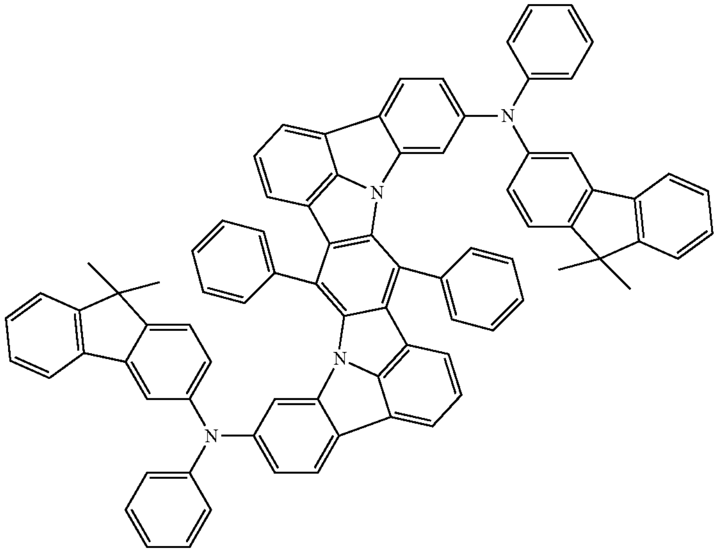
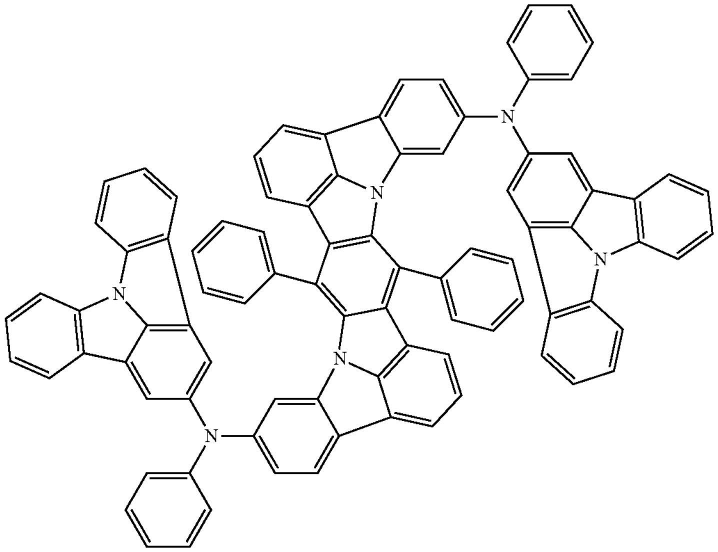

-continued
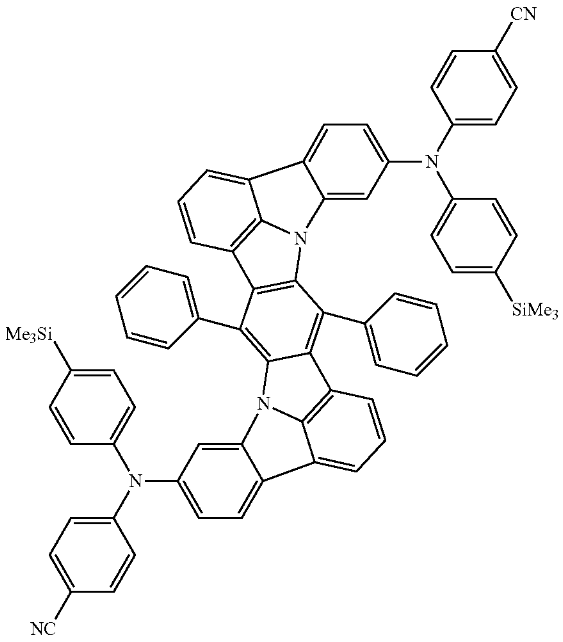
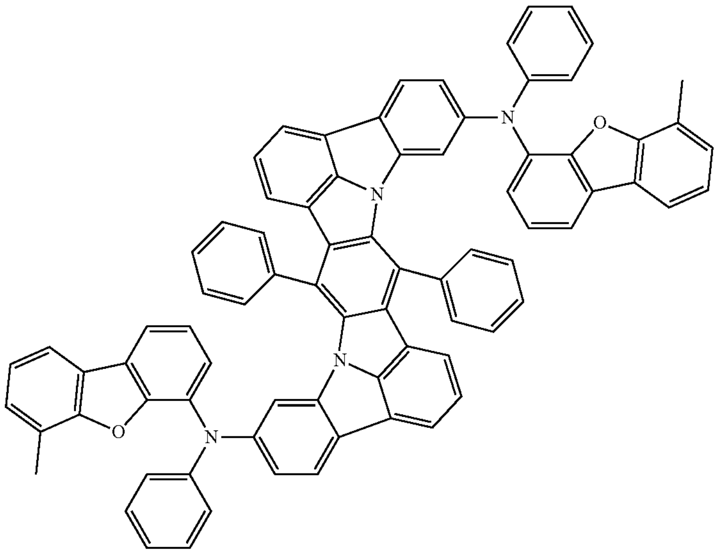

-continued
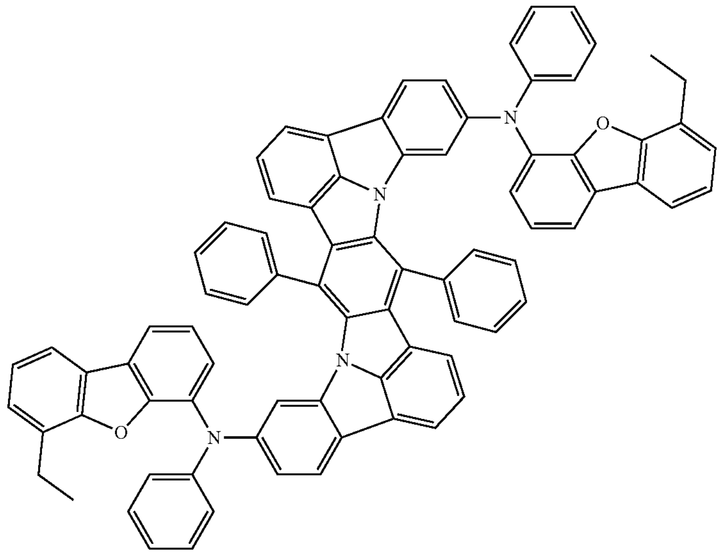
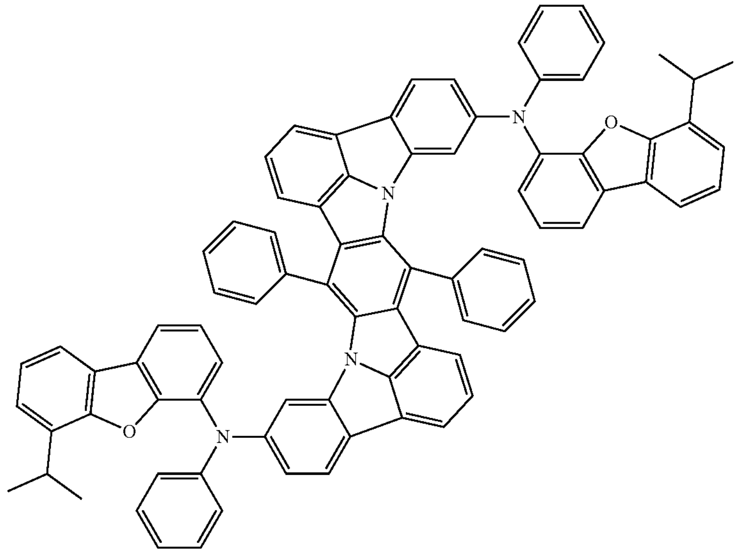
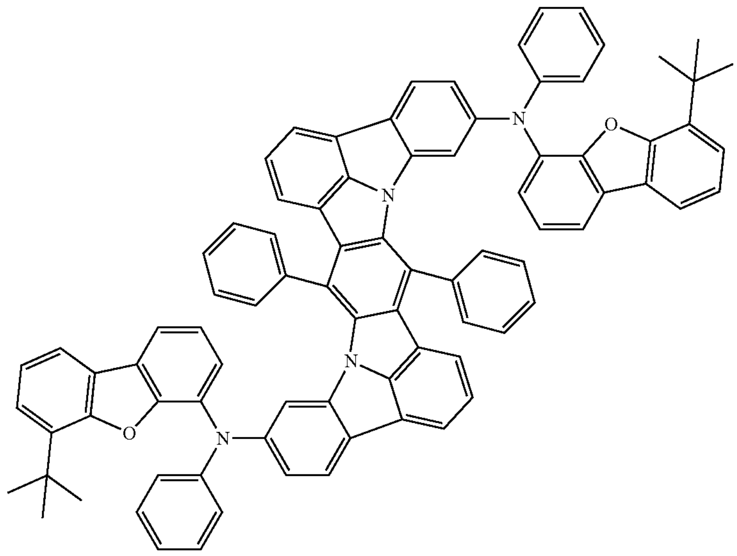

-continued
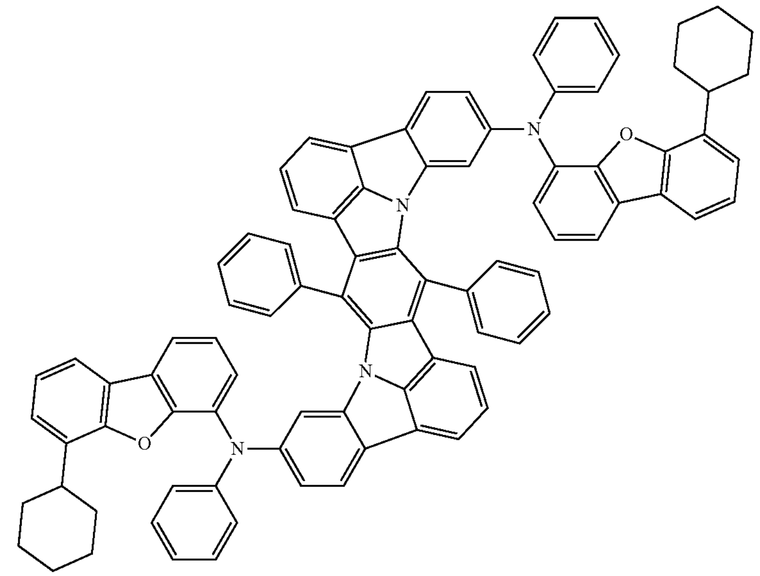
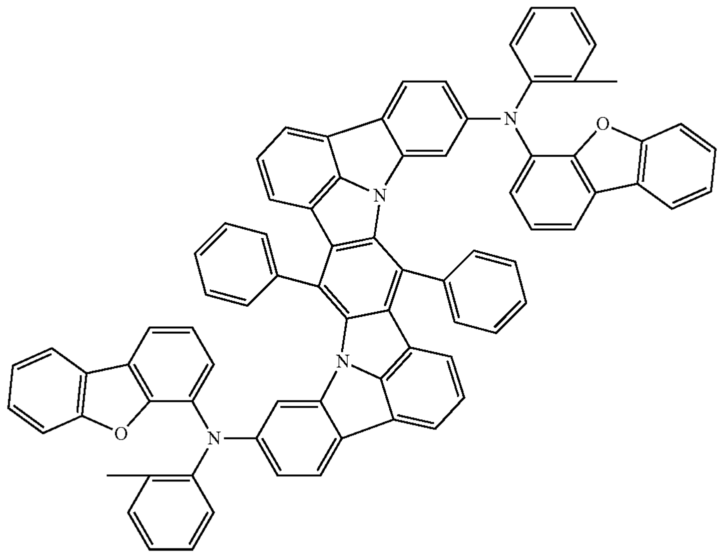
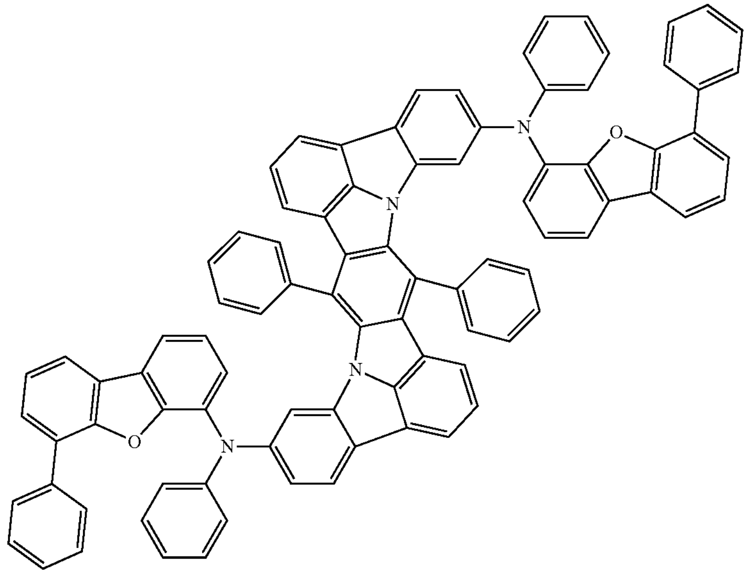

-continued
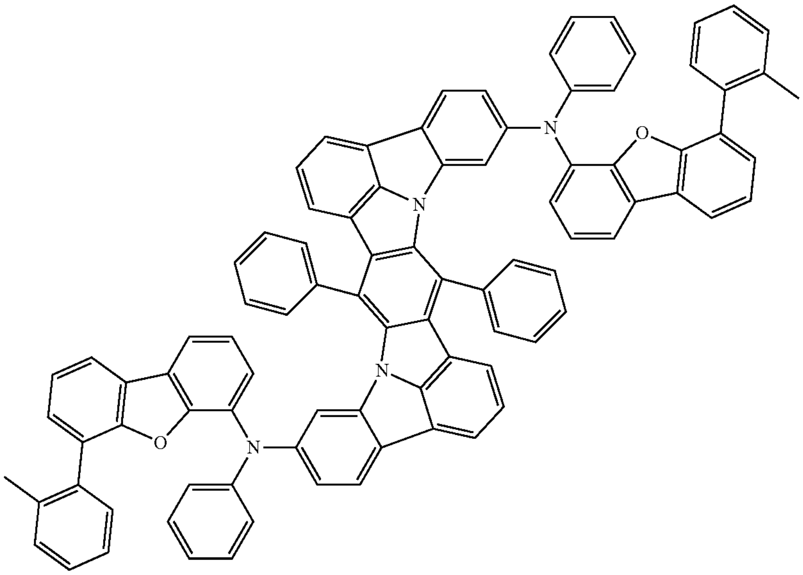
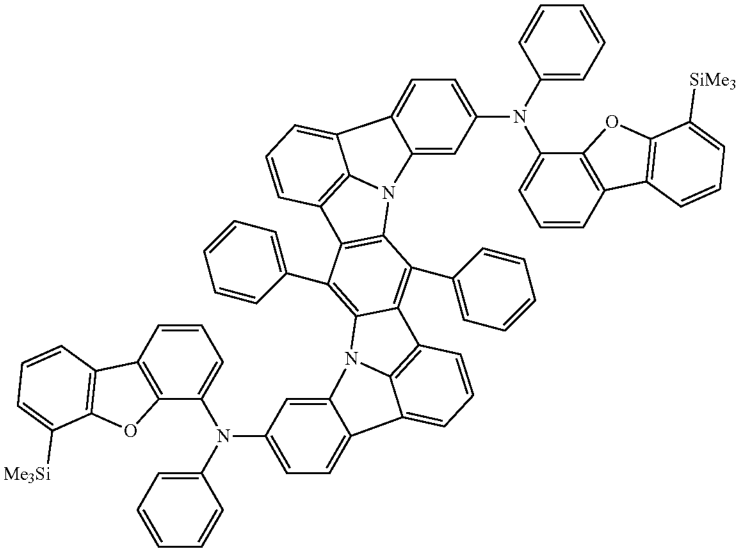
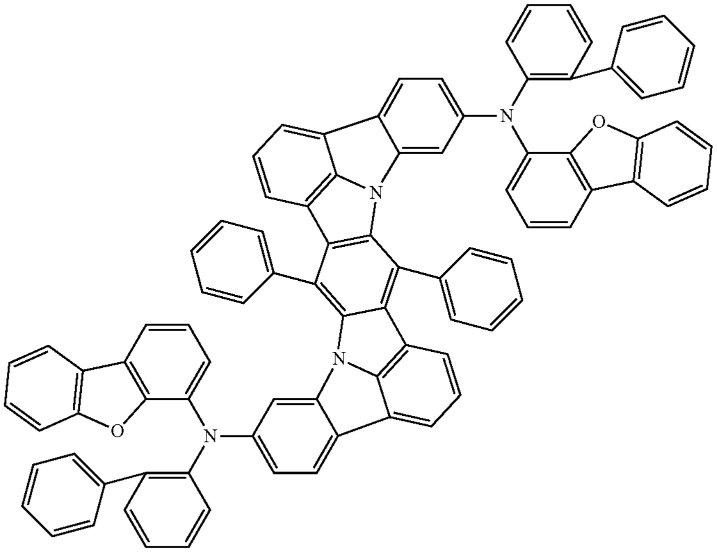

-continued
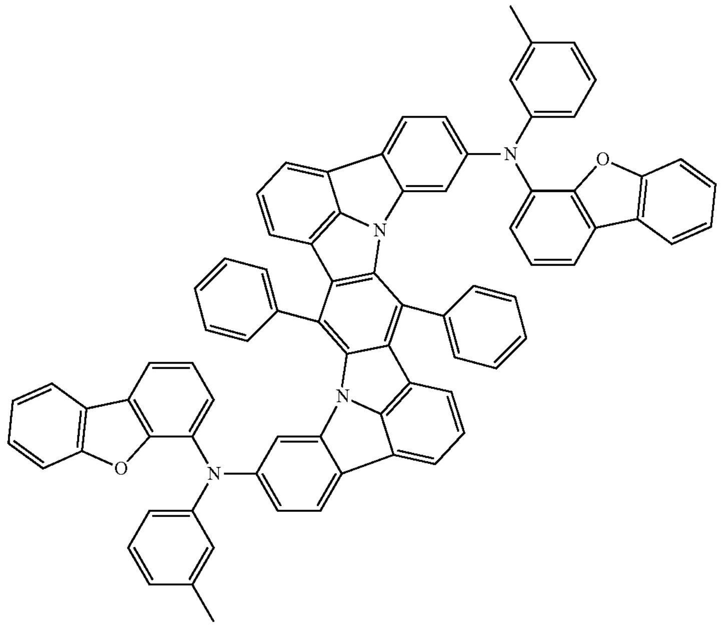
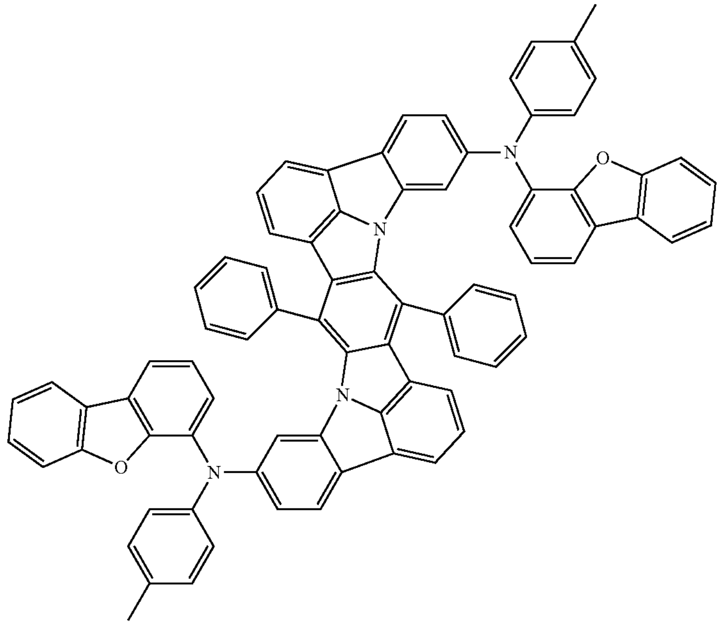

-continued
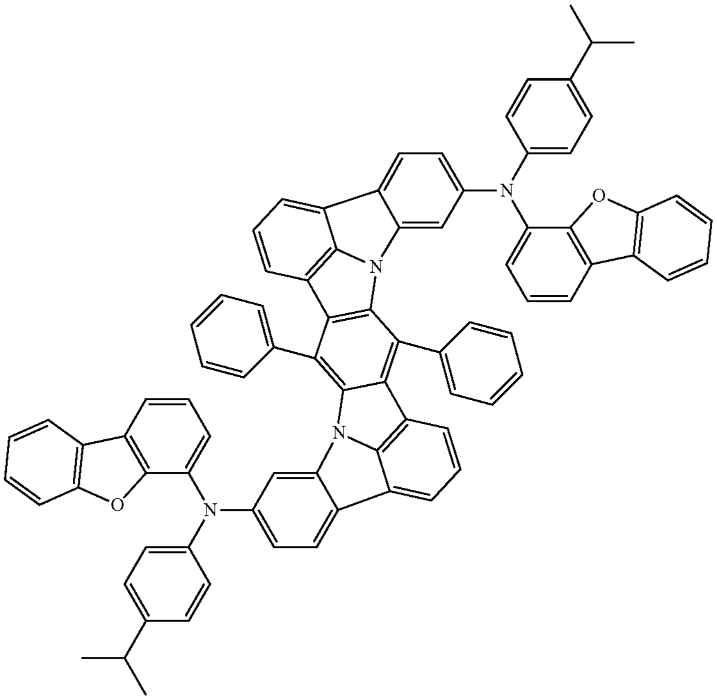
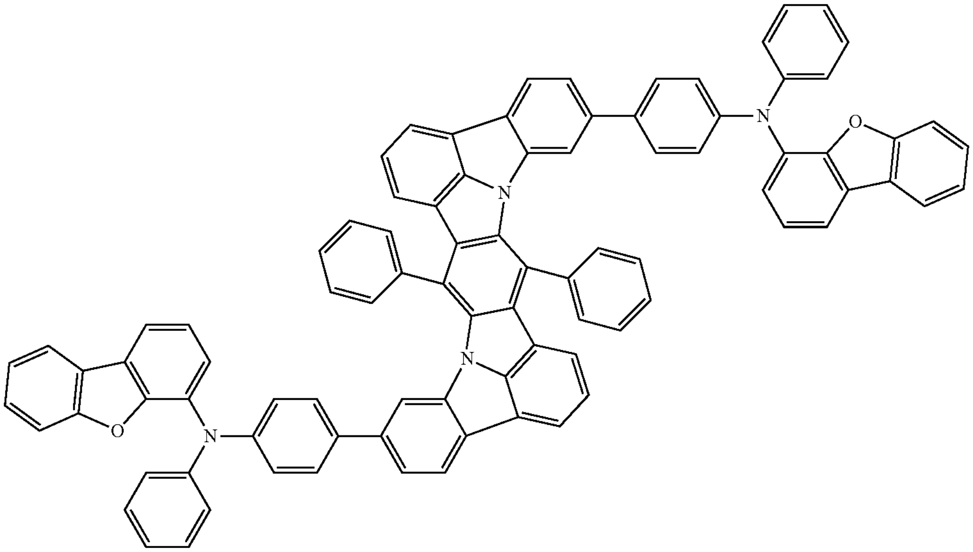

-continued
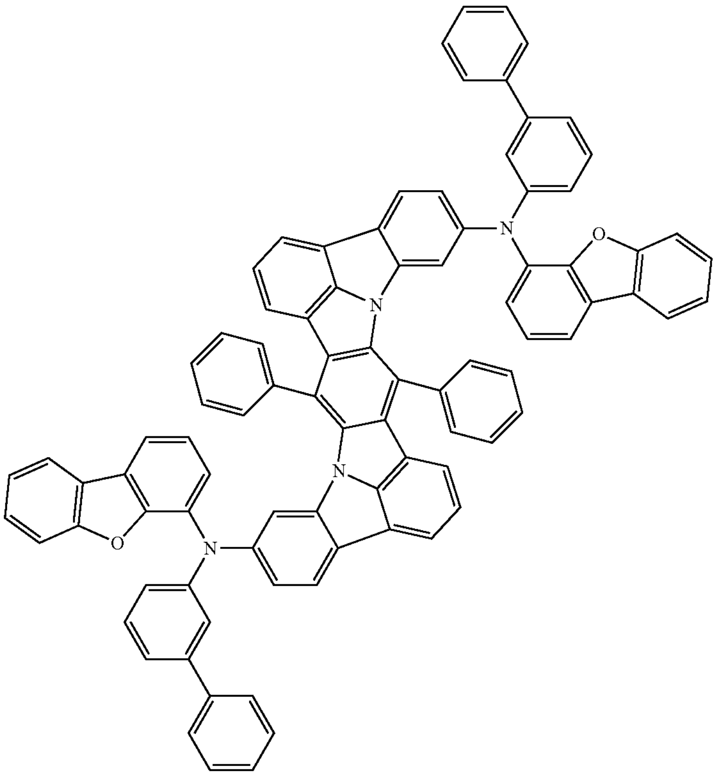
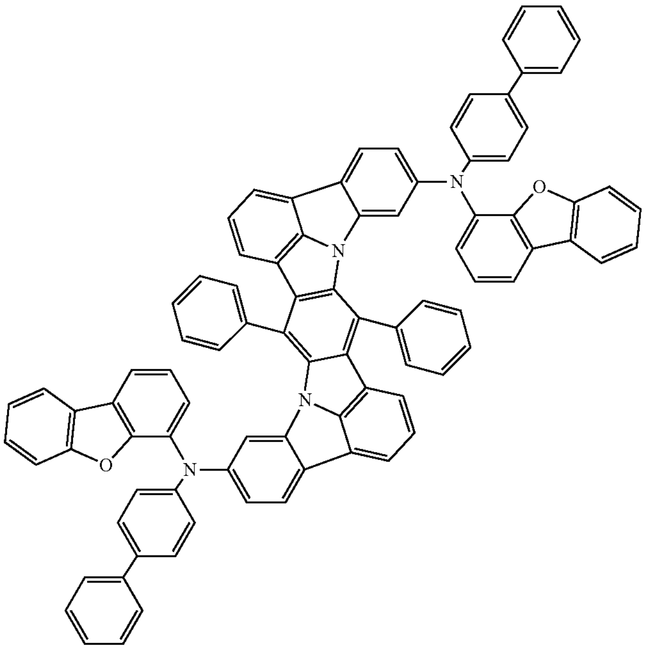

-continued
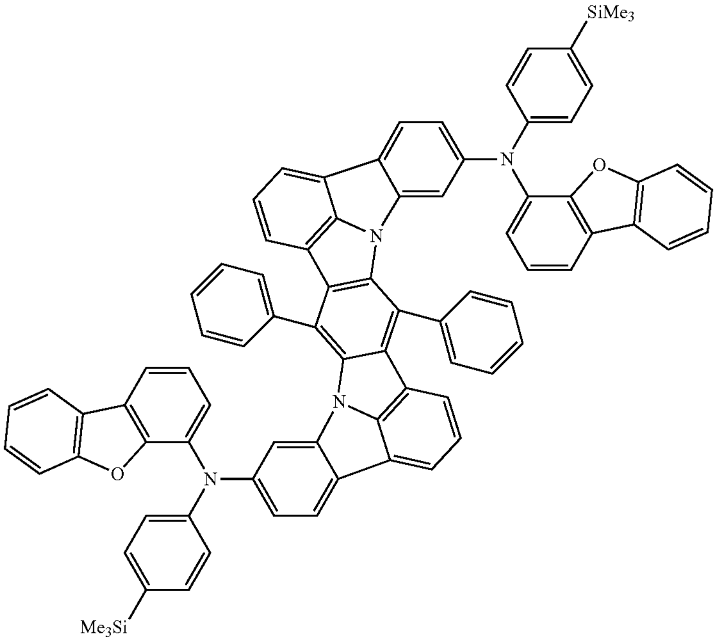
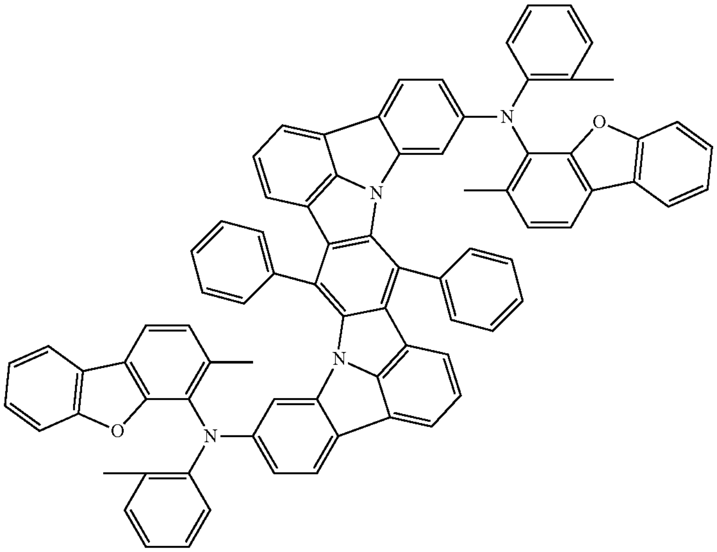

-continued
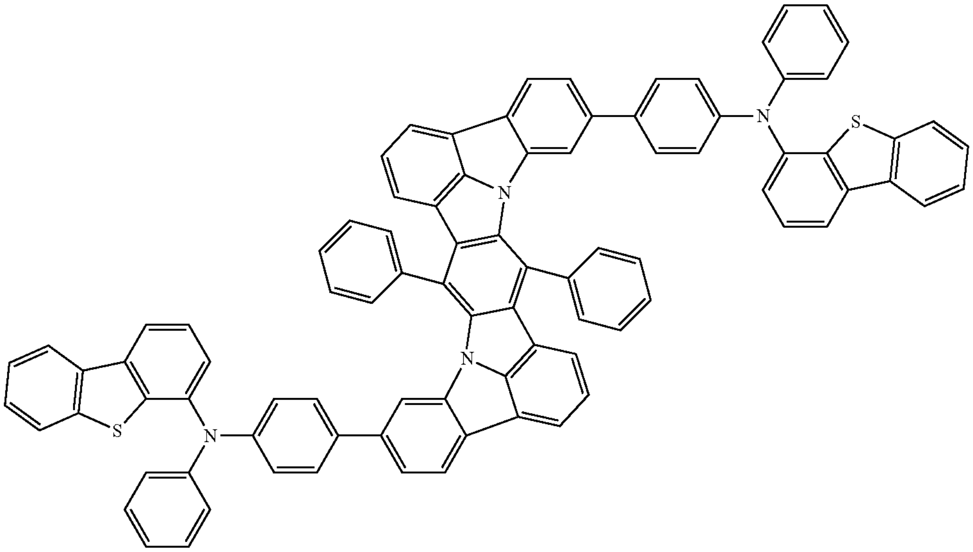
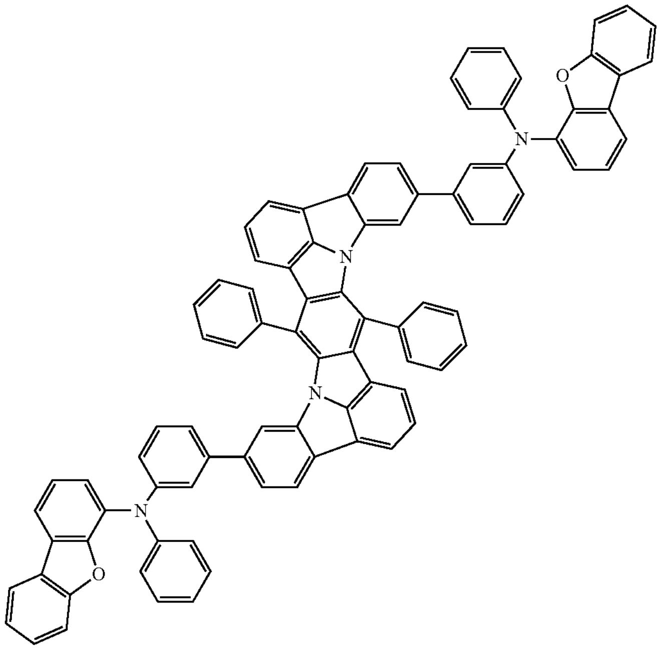

-continued
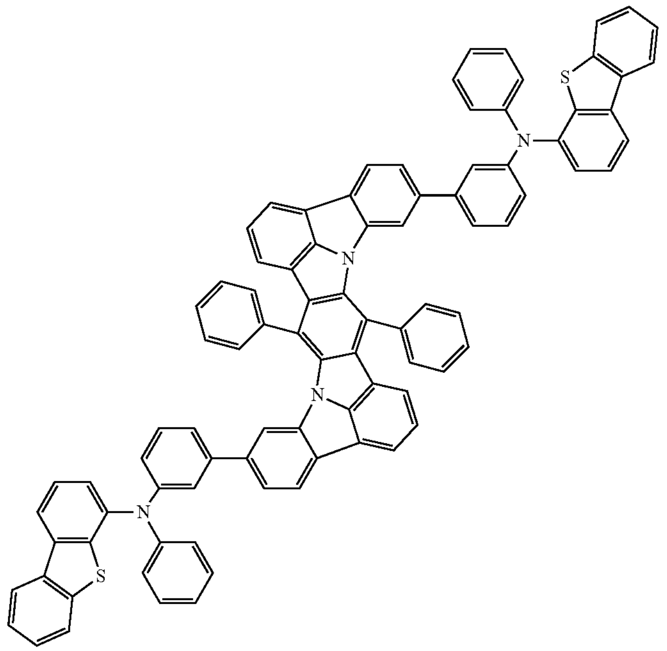
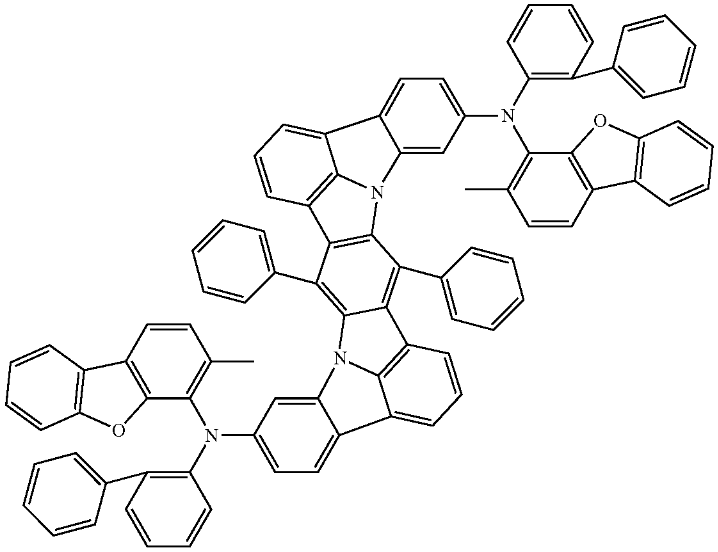

-continued
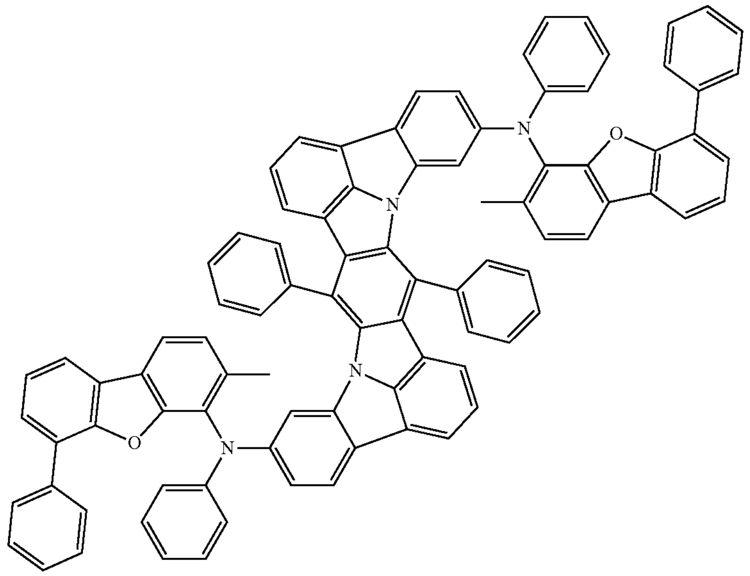
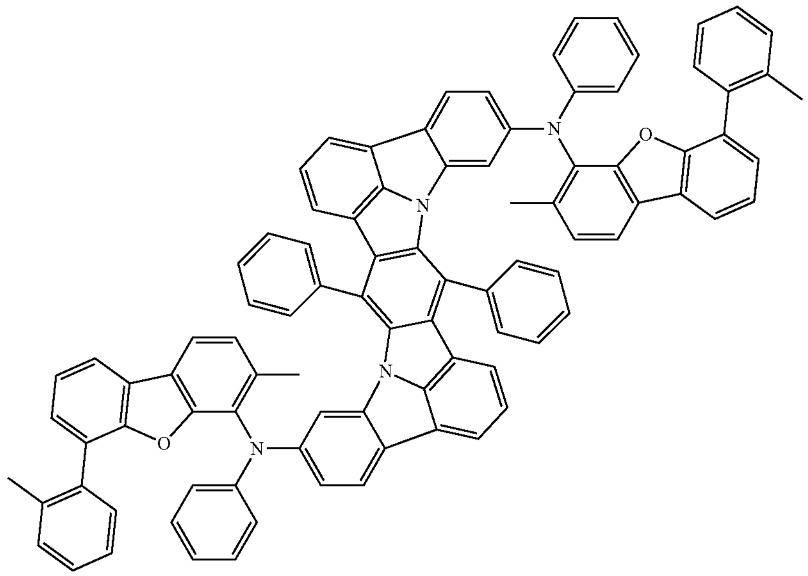
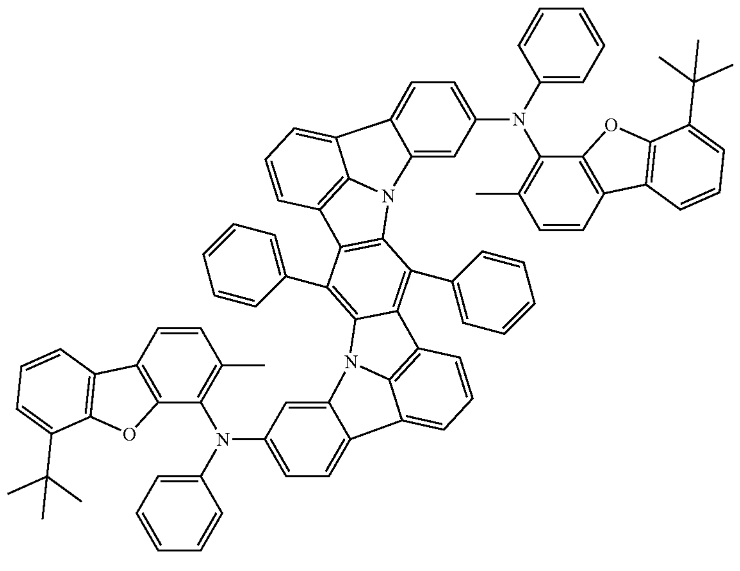

-continued
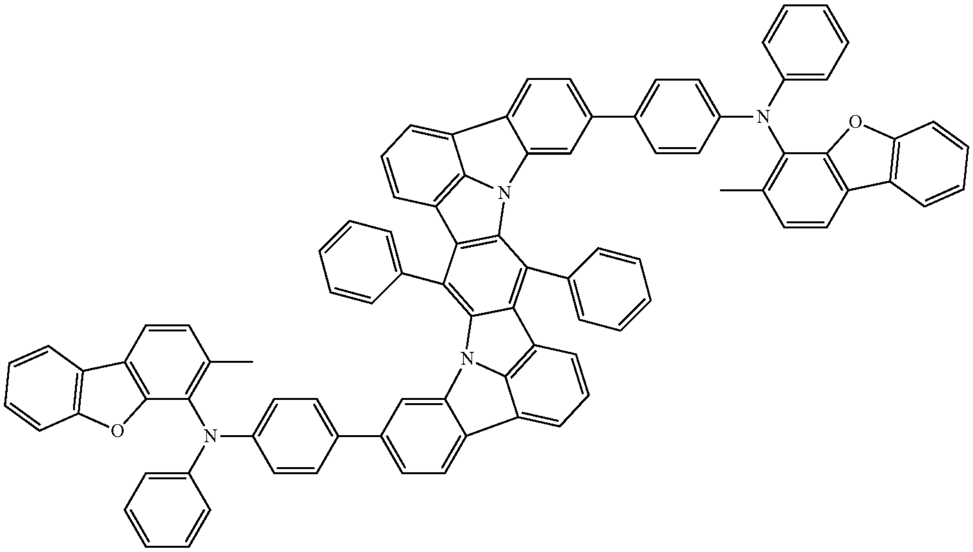
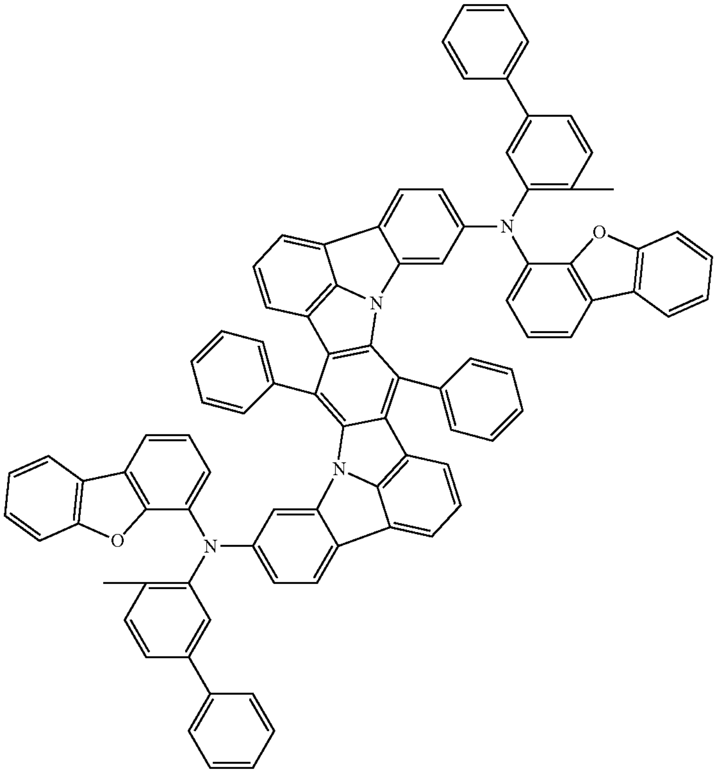

-continued
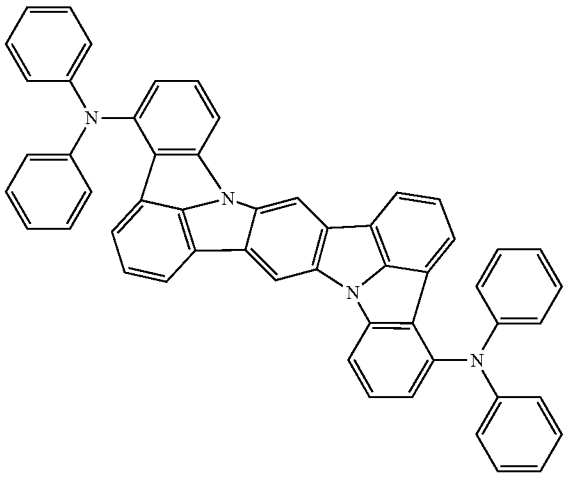
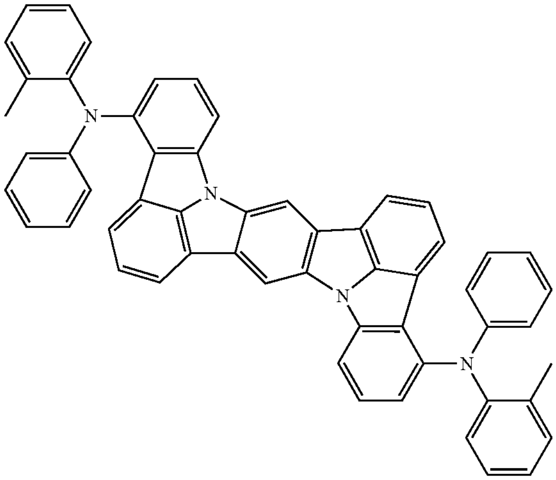
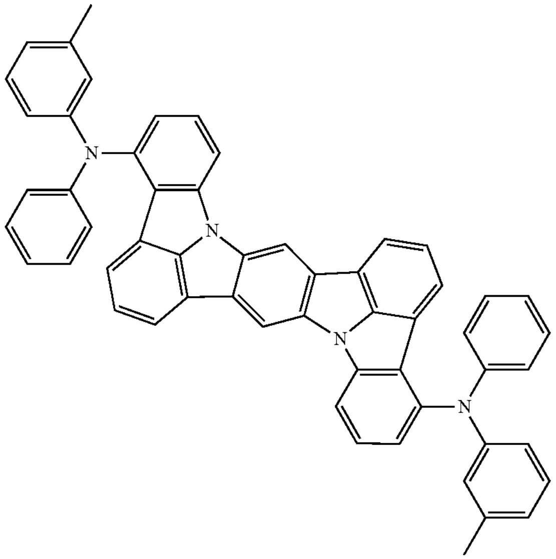
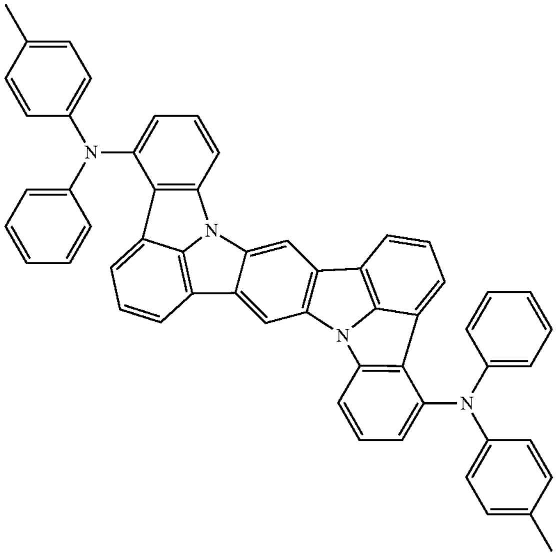
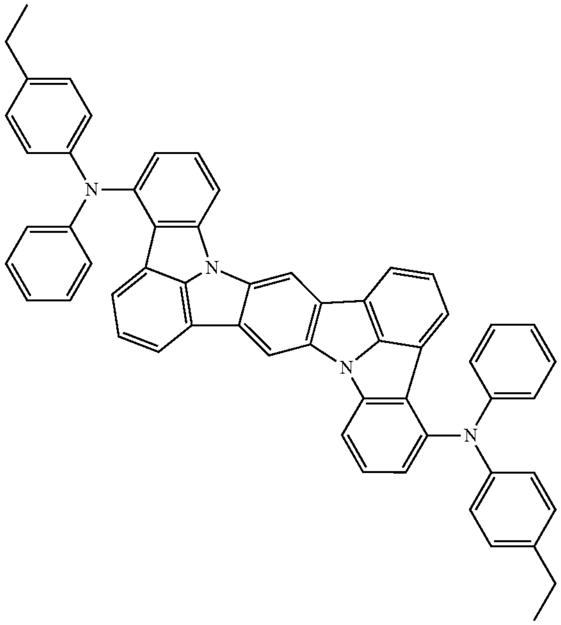

-continued
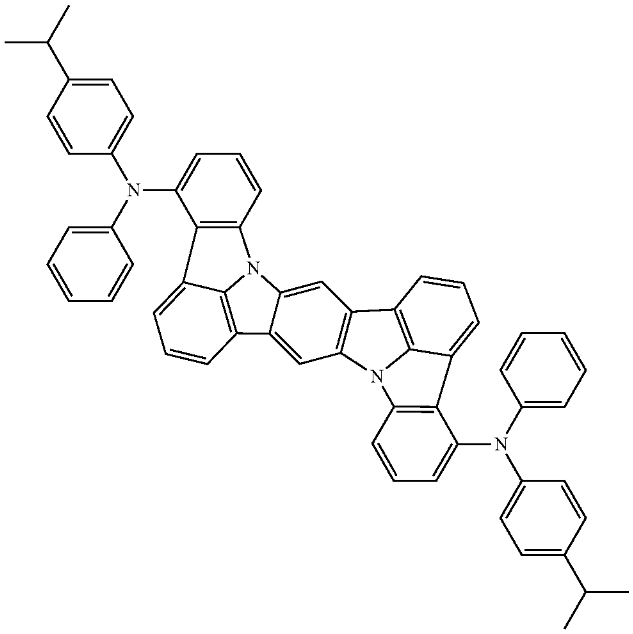 [SMILES: CC(C)c1ccc(N(c2ccccc2)c2cccc3c2c2cccc4c5cc6c(cc5n3c42)c2cccc3c4c(N(c5ccccc5)c5ccc(C(C)C)cc5)cccc4n6c23)cc1]
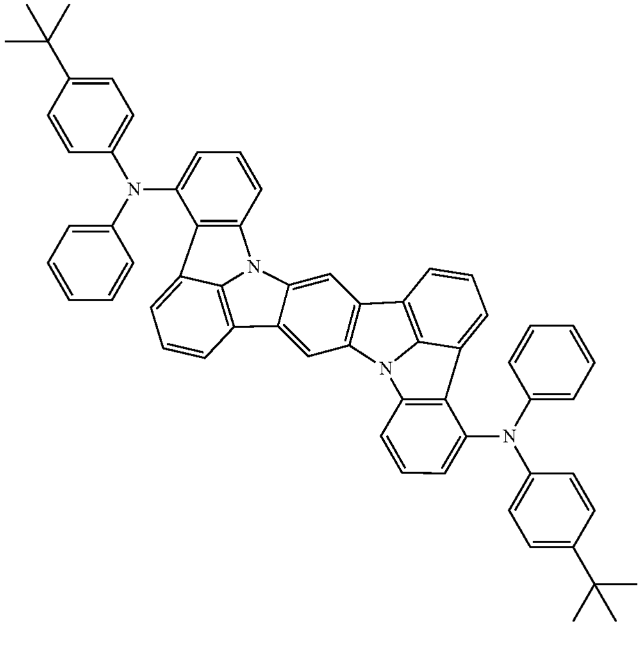

-continued
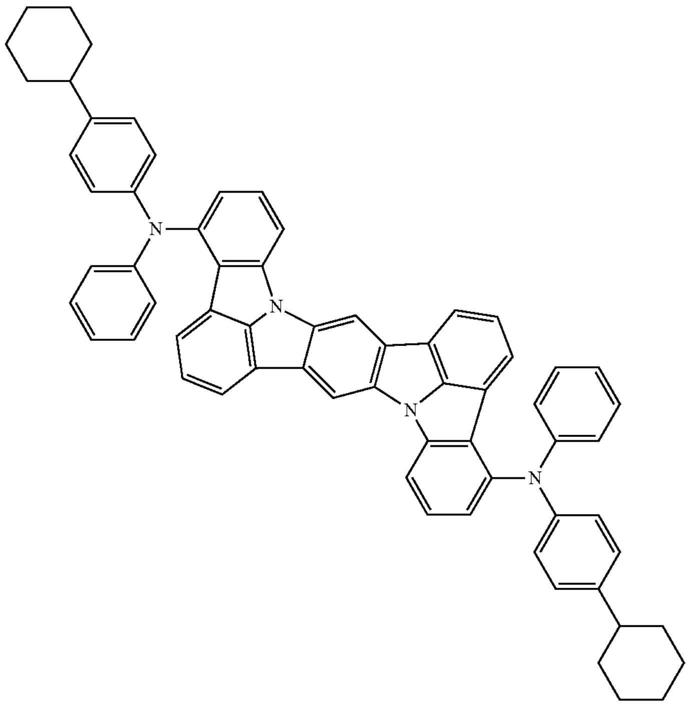
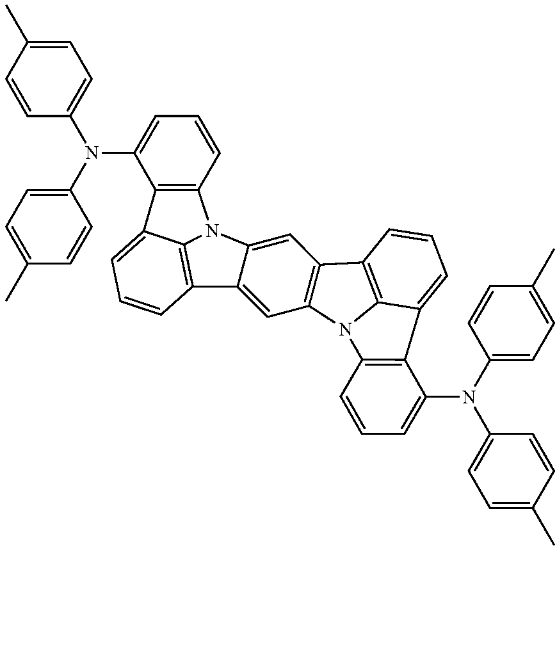

-continued
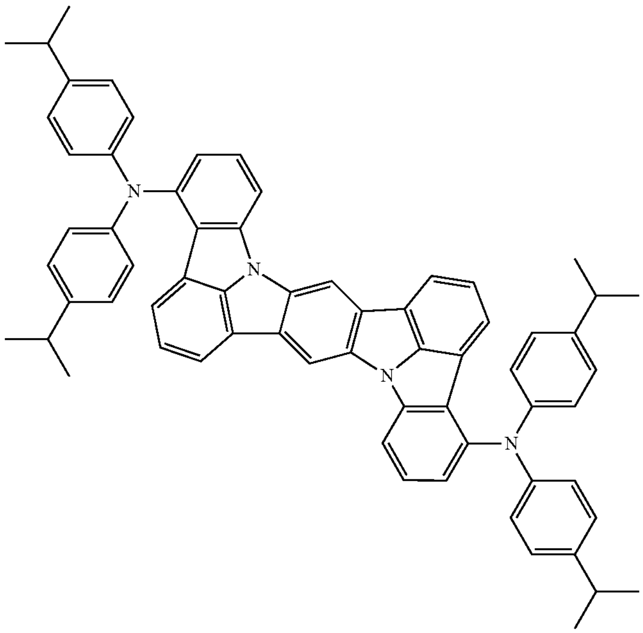
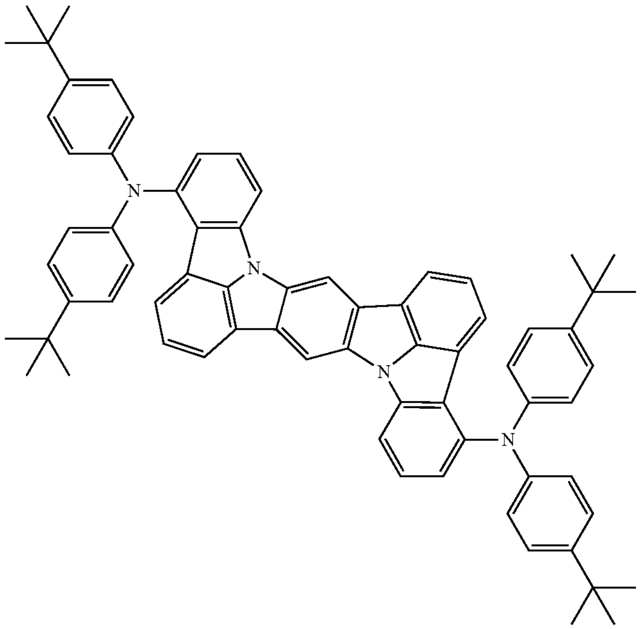

-continued
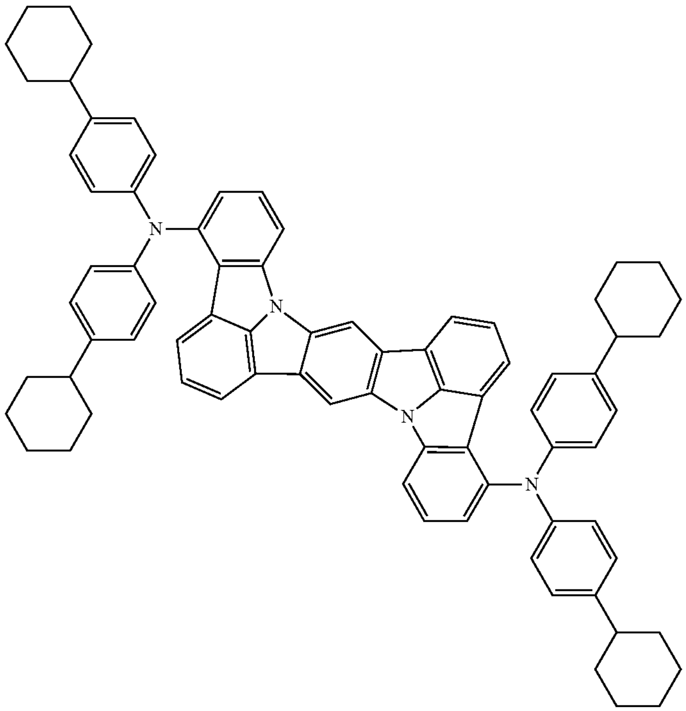
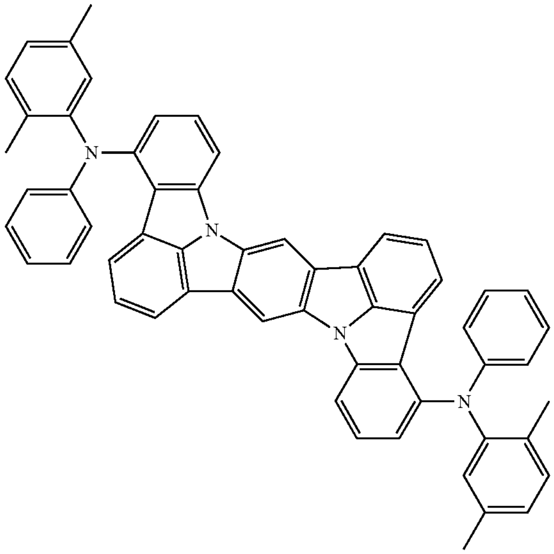
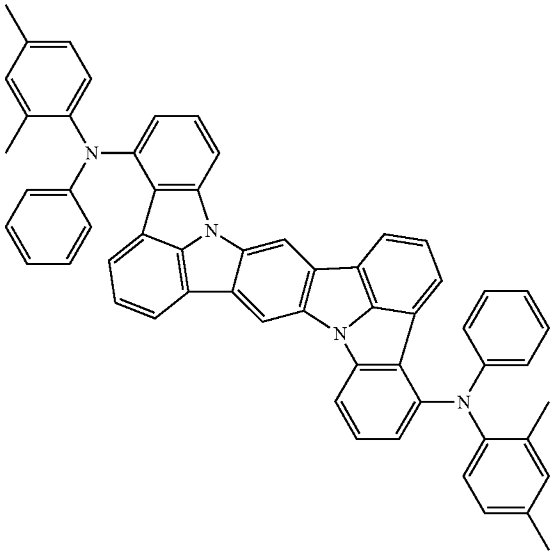

-continued
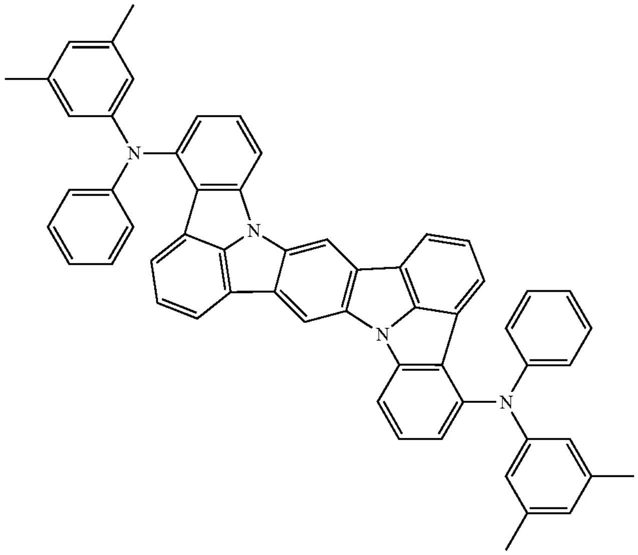
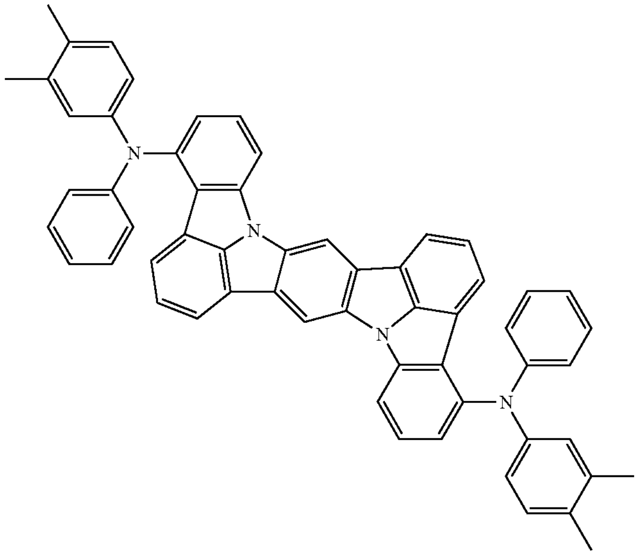
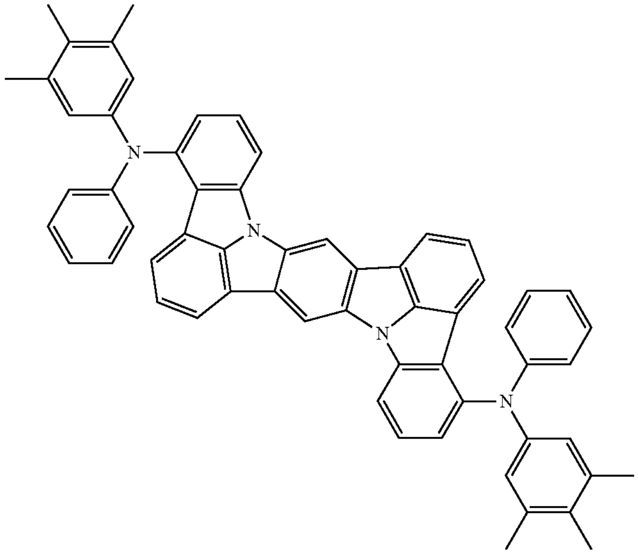

-continued
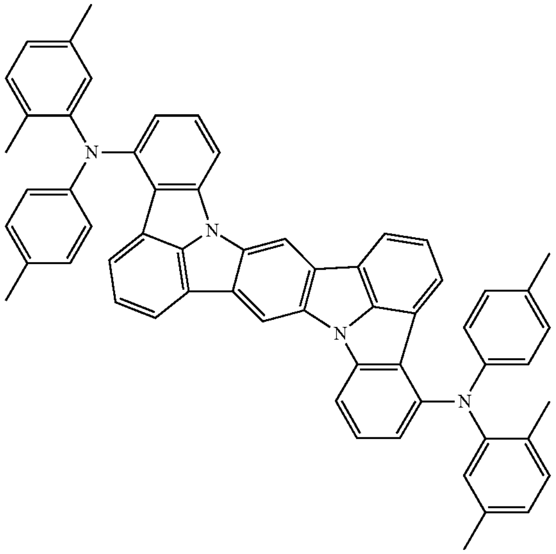
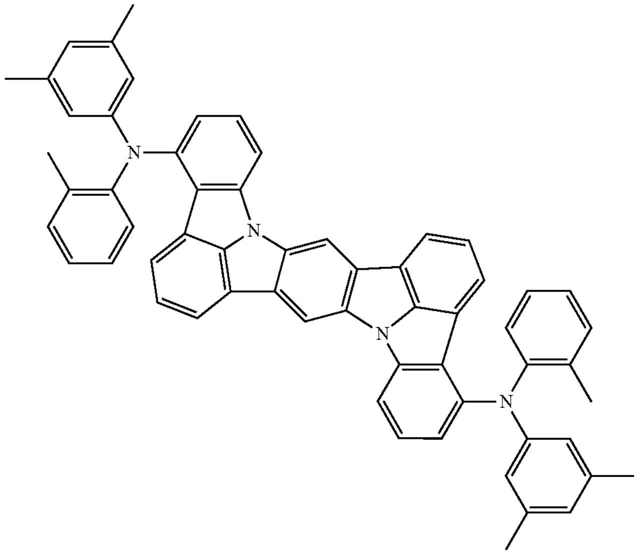
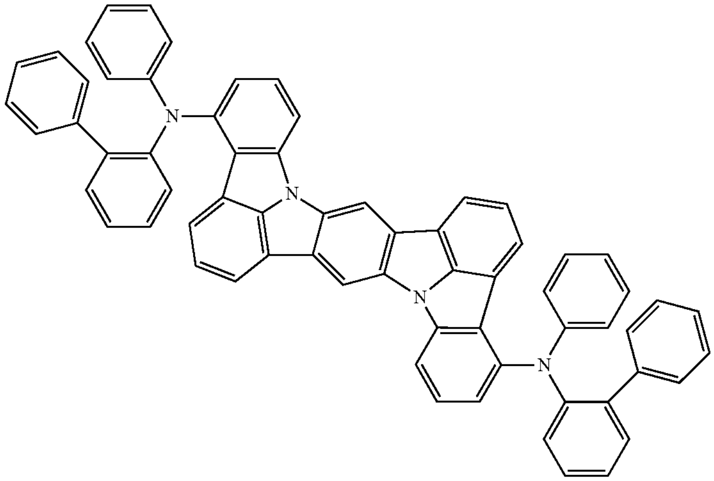

-continued
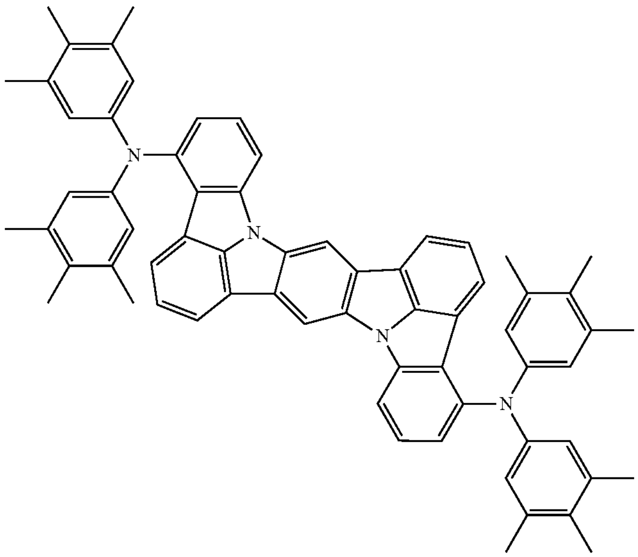
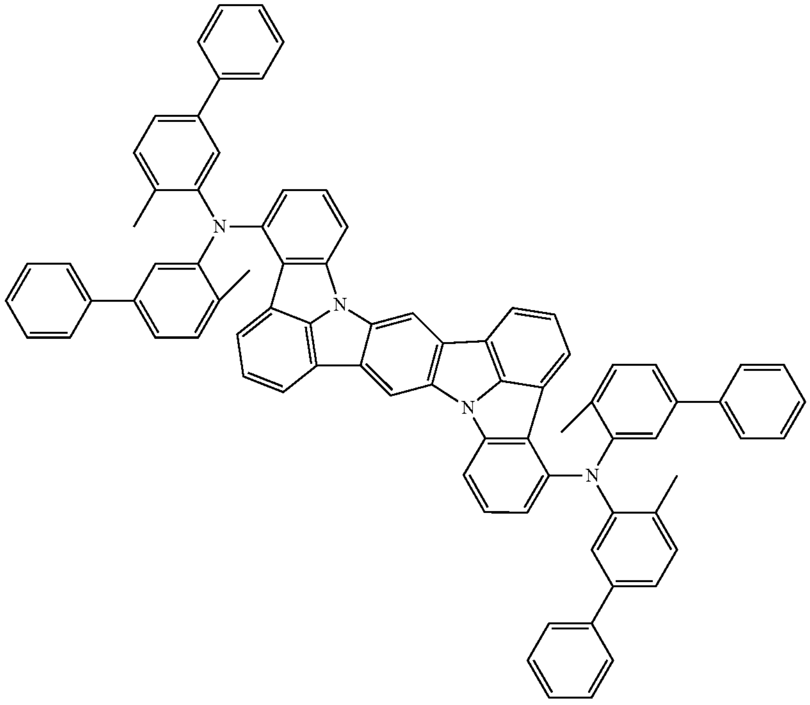

-continued
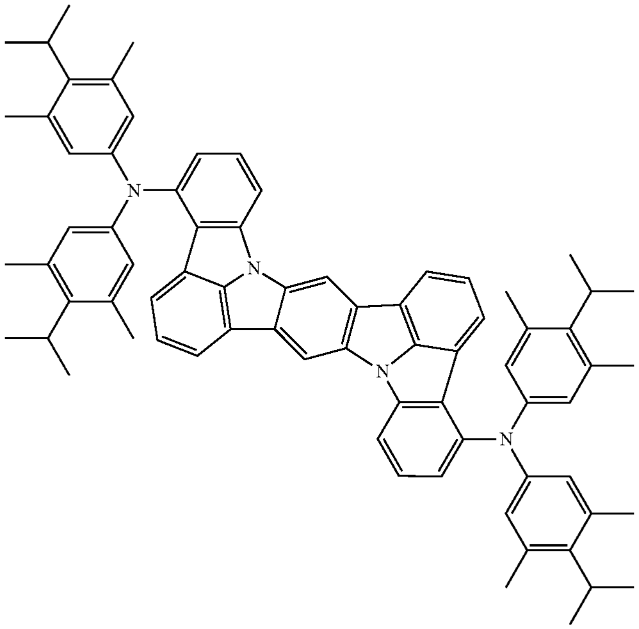
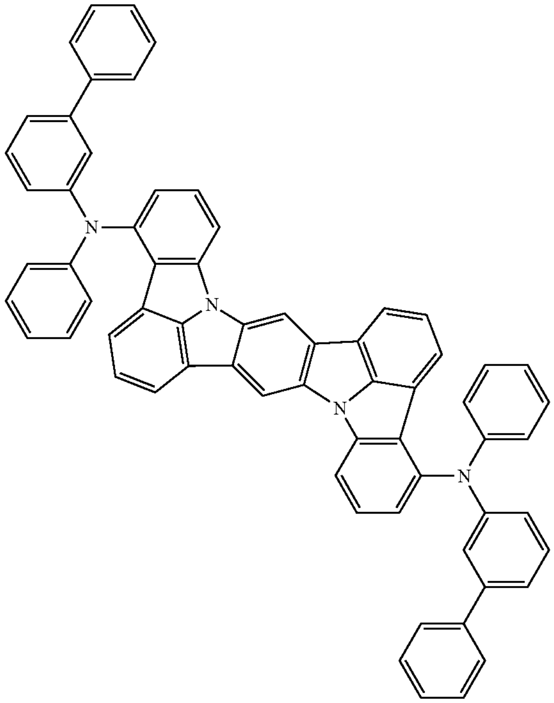

-continued
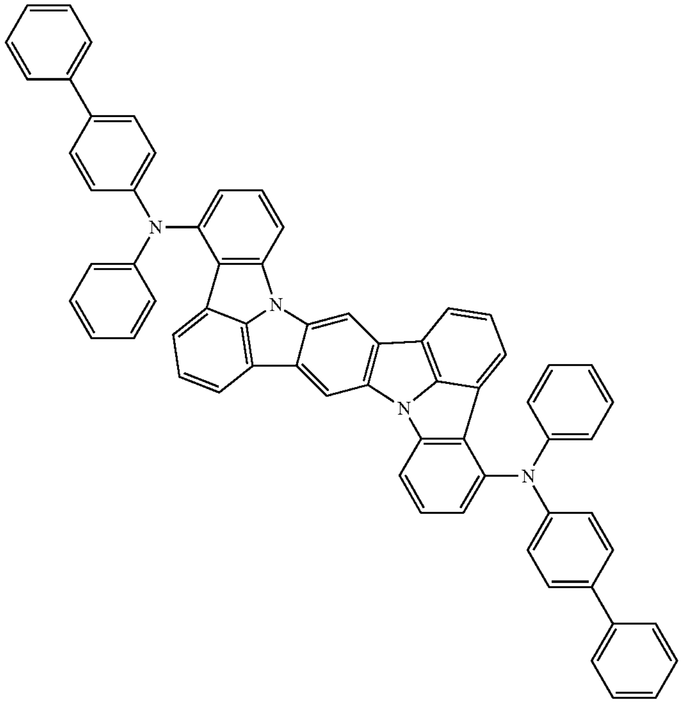
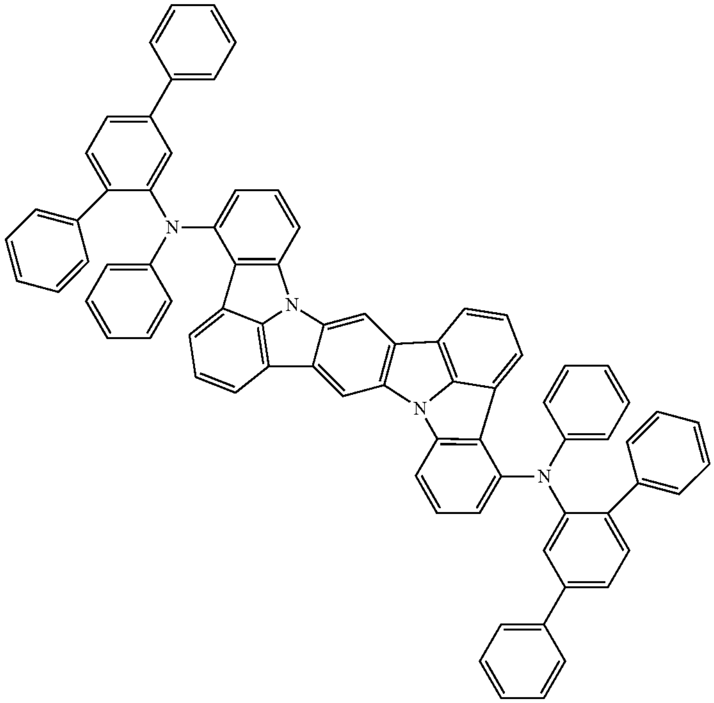

-continued
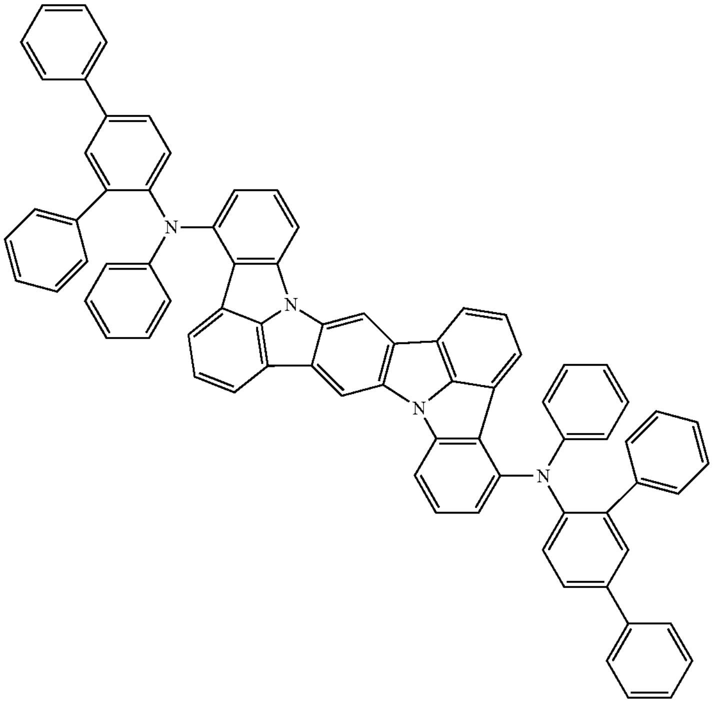
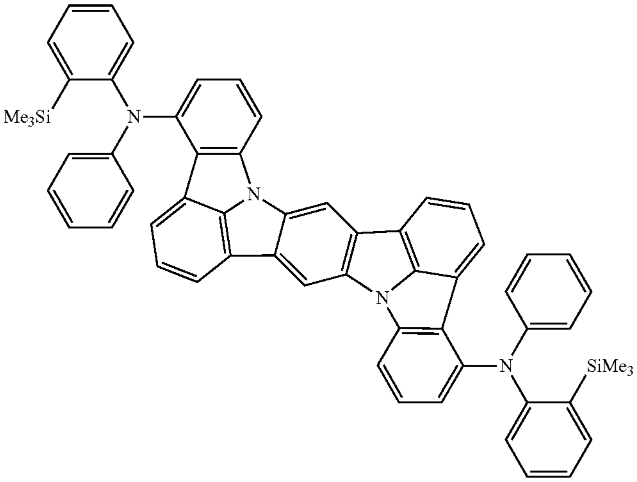

-continued
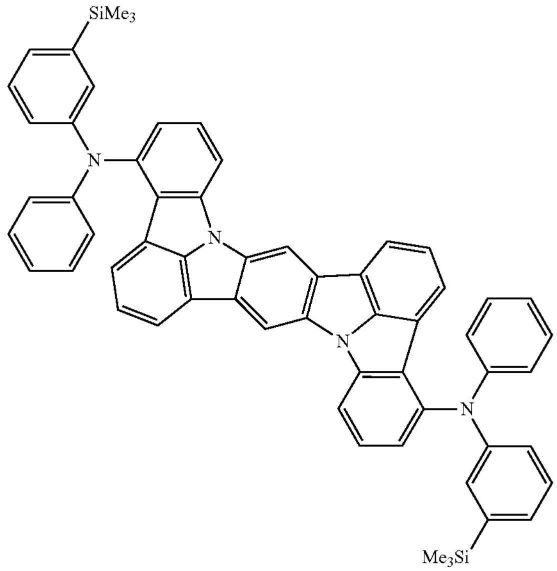
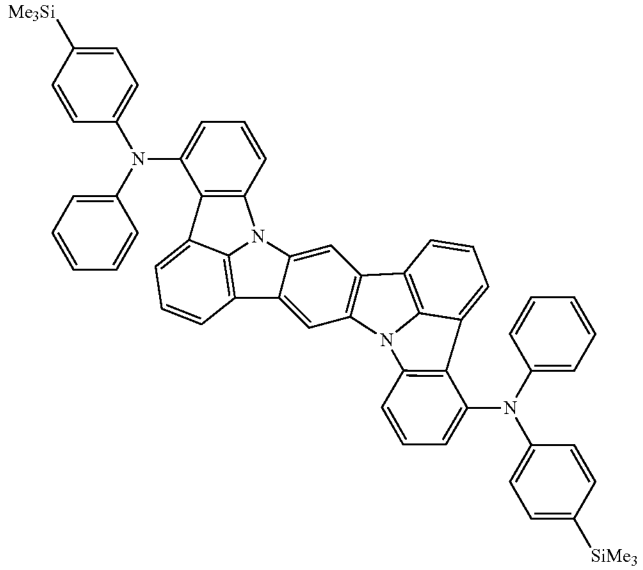
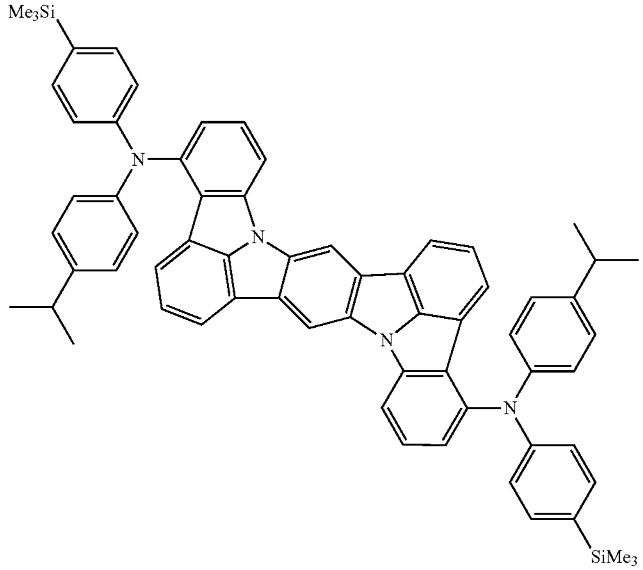

-continued
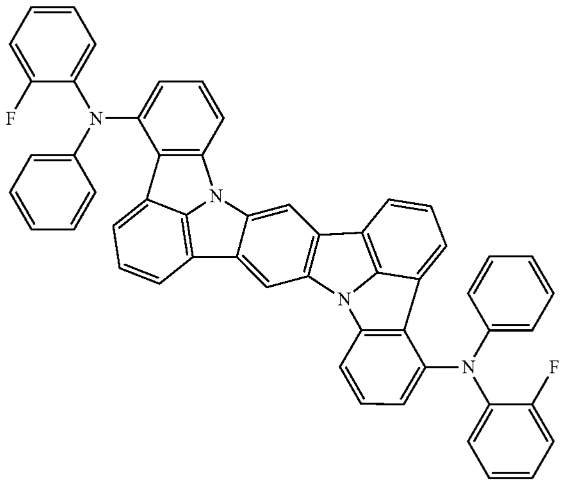
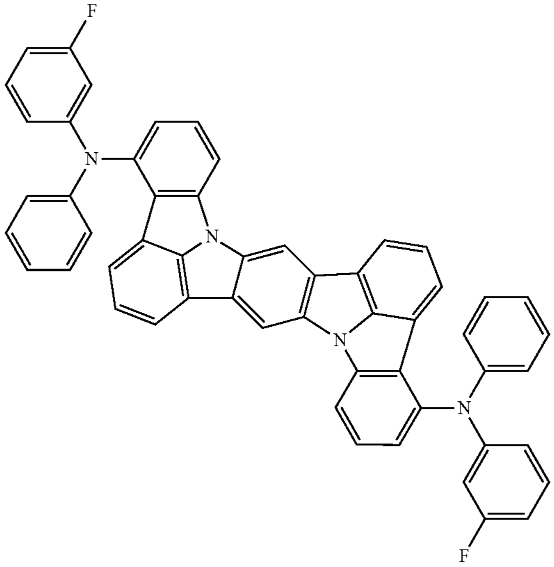
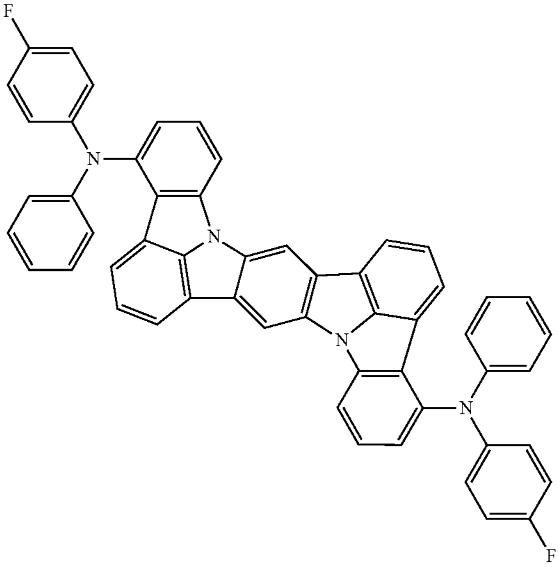
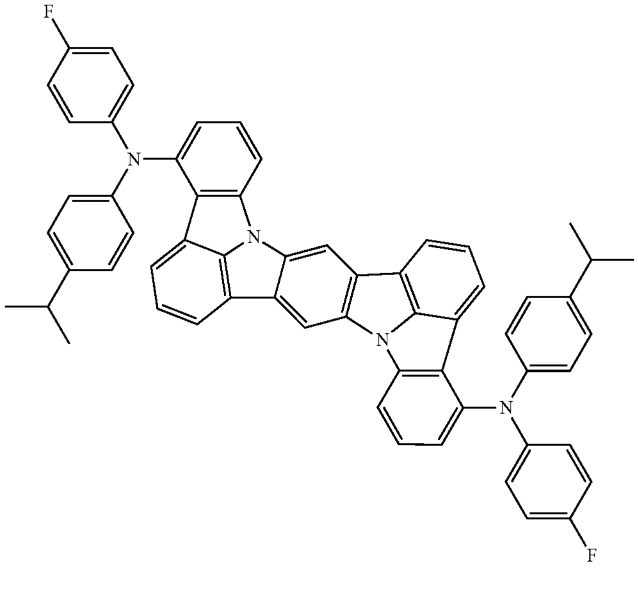

-continued
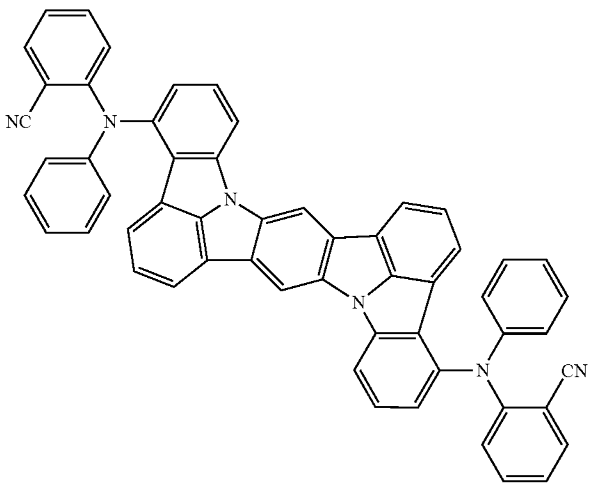
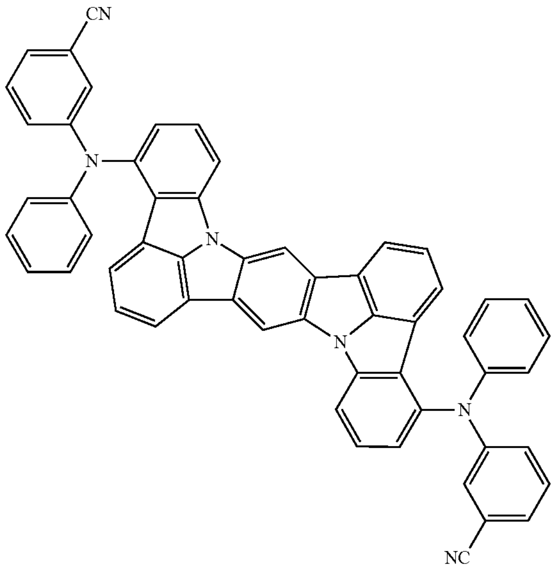
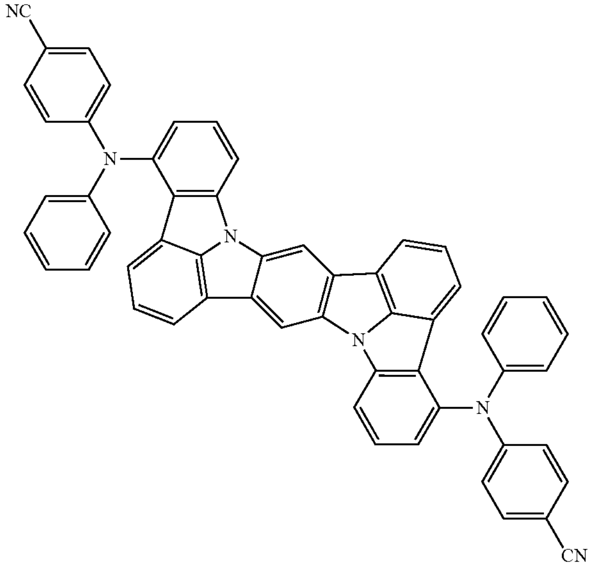
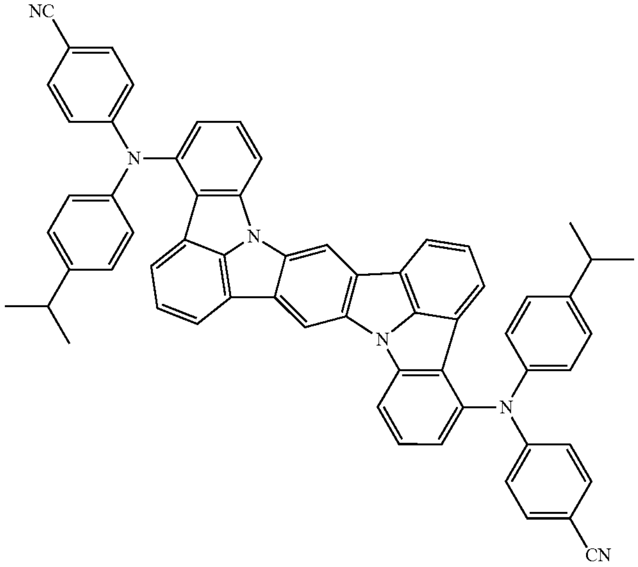

-continued
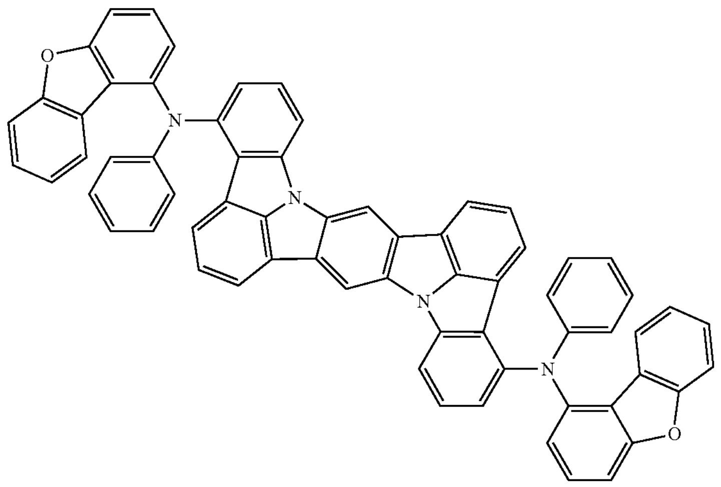
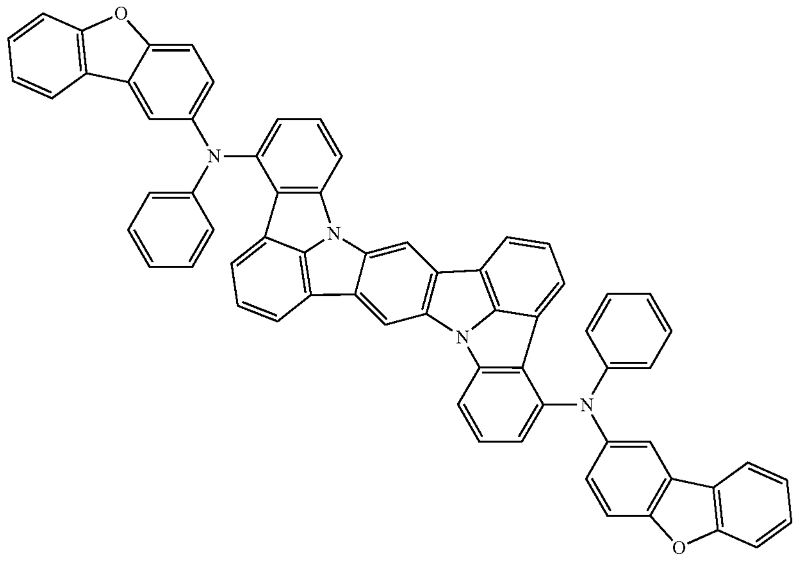

-continued
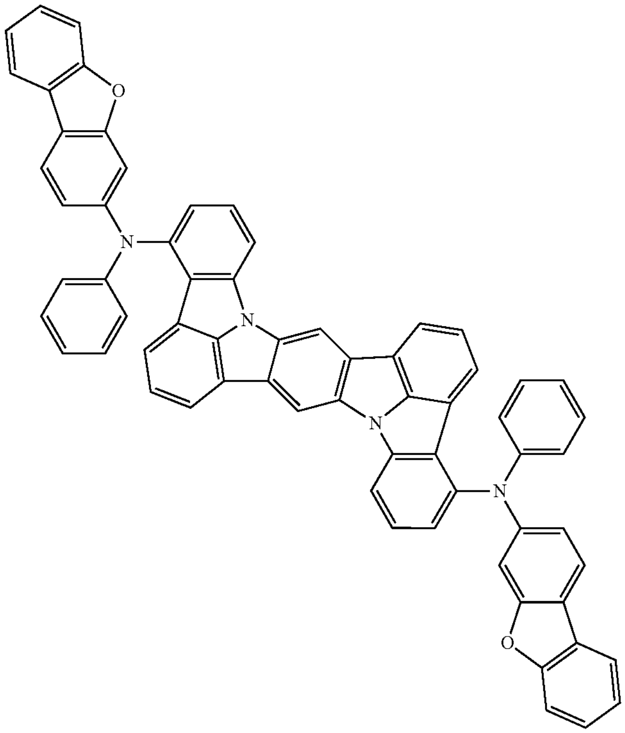
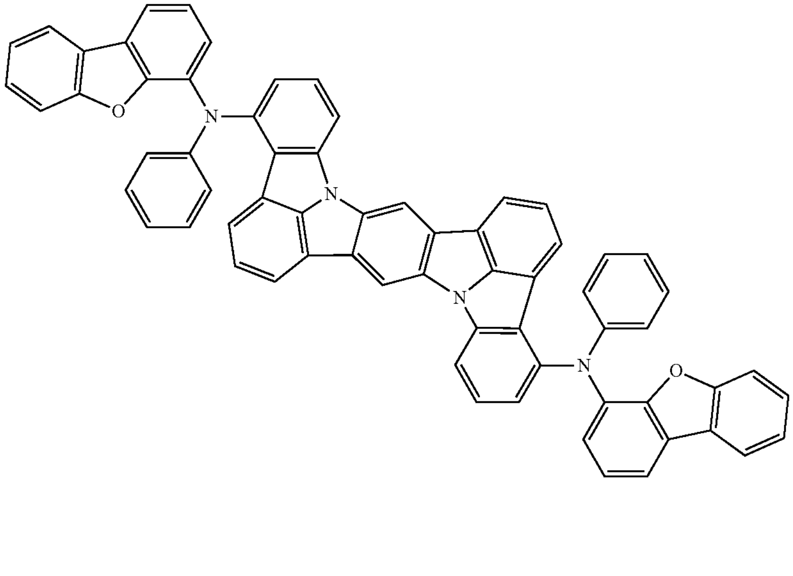

-continued
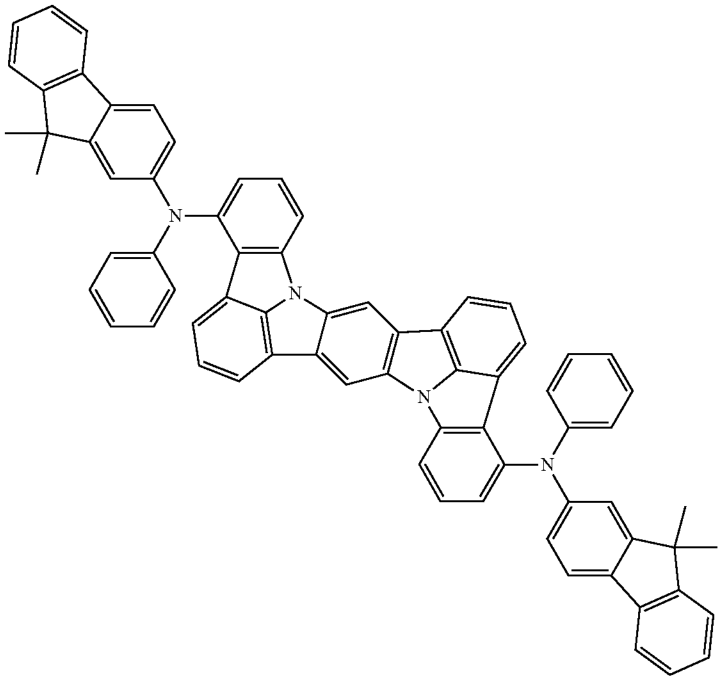
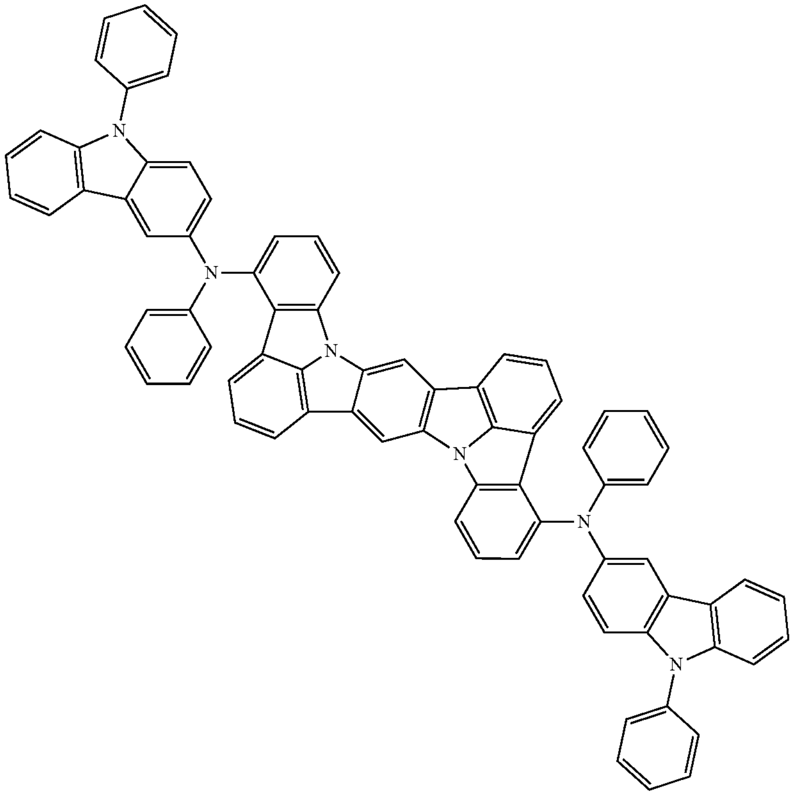

-continued
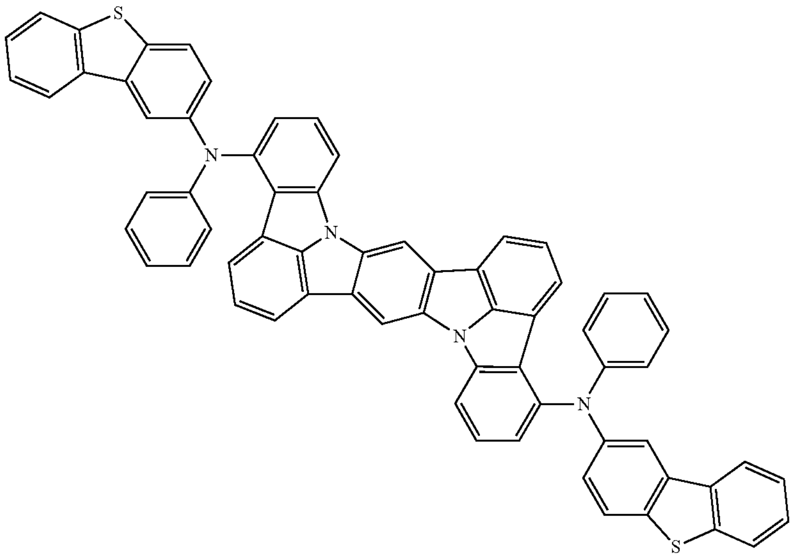
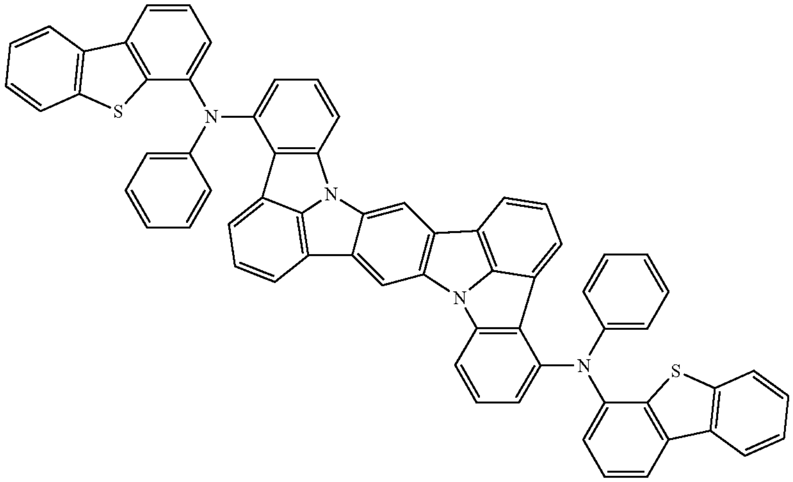
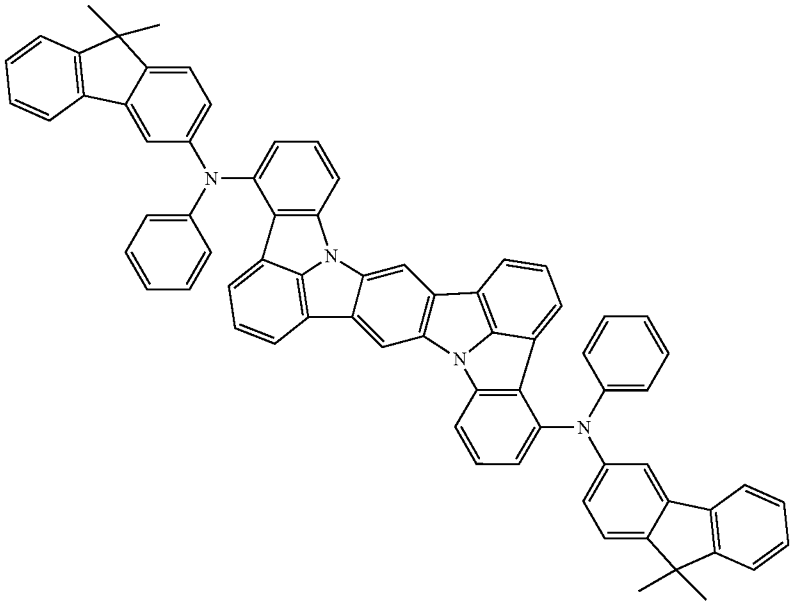

-continued
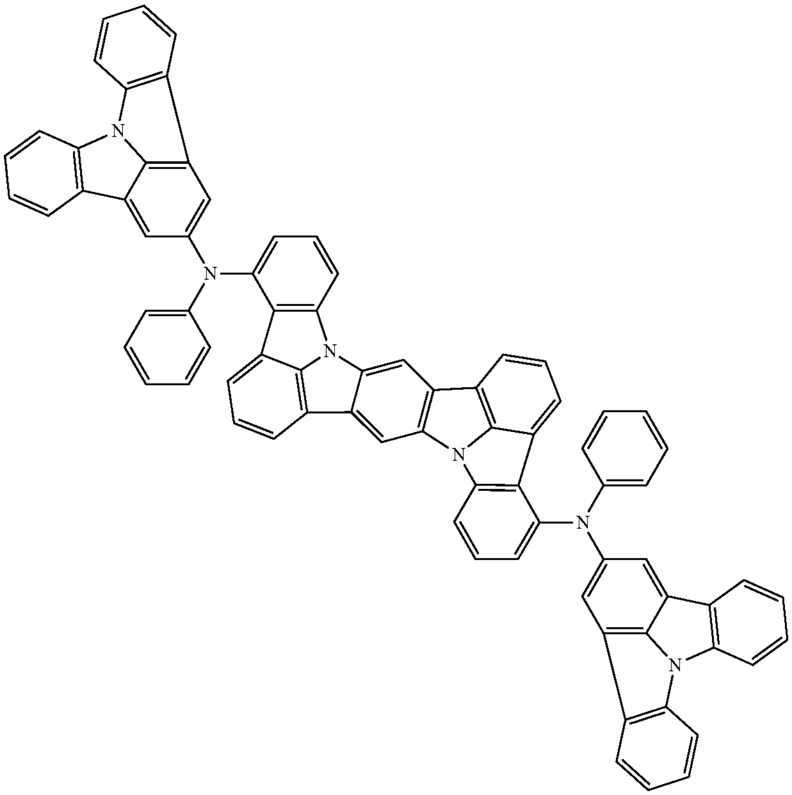 [SMILES: c1ccc(N(c2cc3c4ccccc4n4c5ccccc5c(c2)c34)c2cccc3c2c2cccc4c5cc6c(cc5n3c42)c2cccc3c4c(N(c5ccccc5)c5cc7c8ccccc8n8c9ccccc9c(c5)c78)cccc4n6c23)cc1]
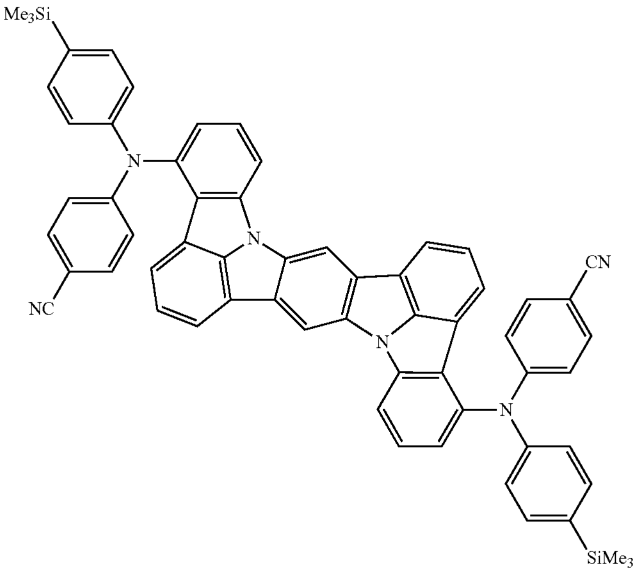

-continued
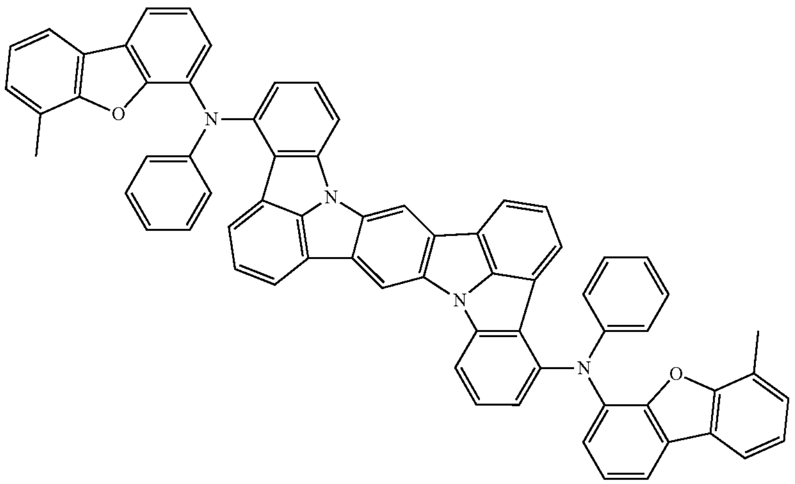
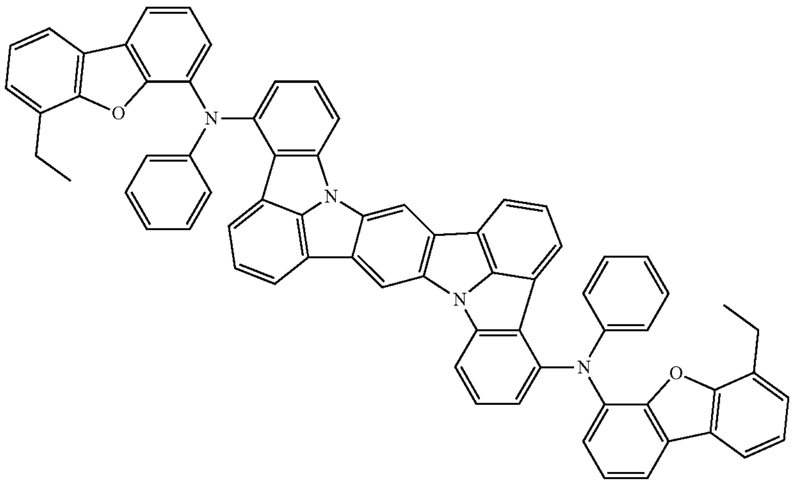
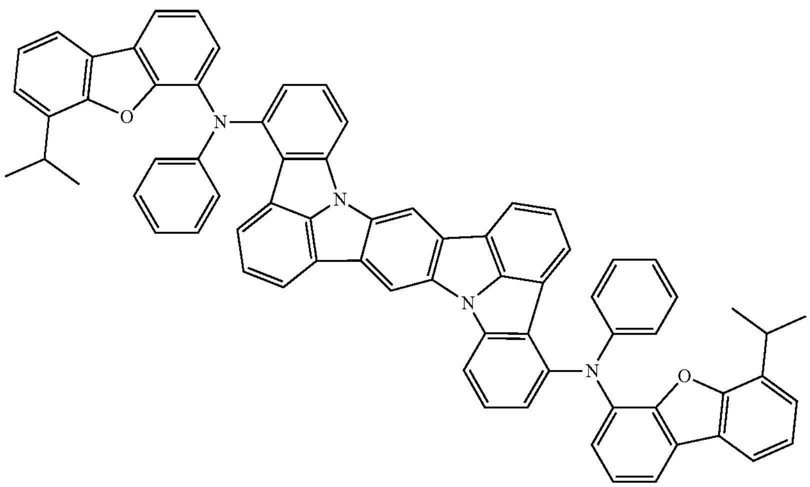

-continued
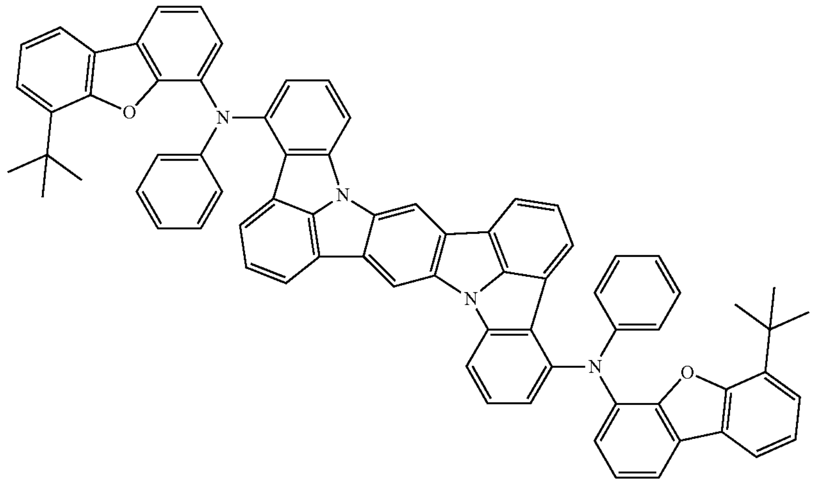
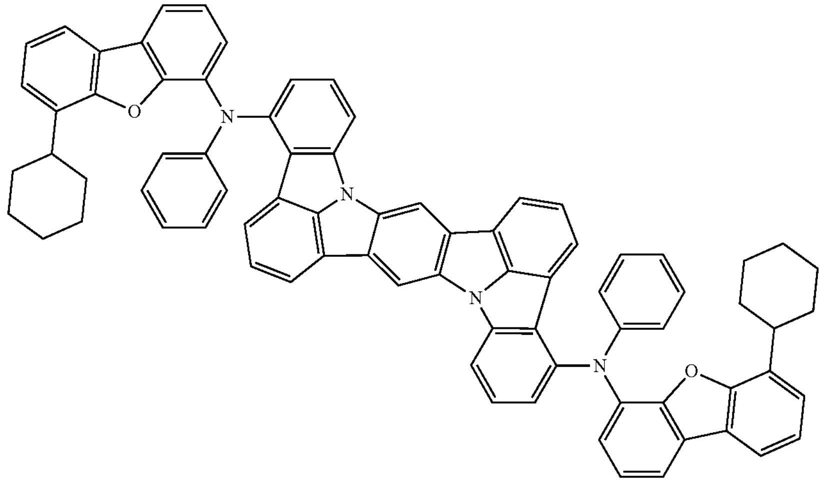
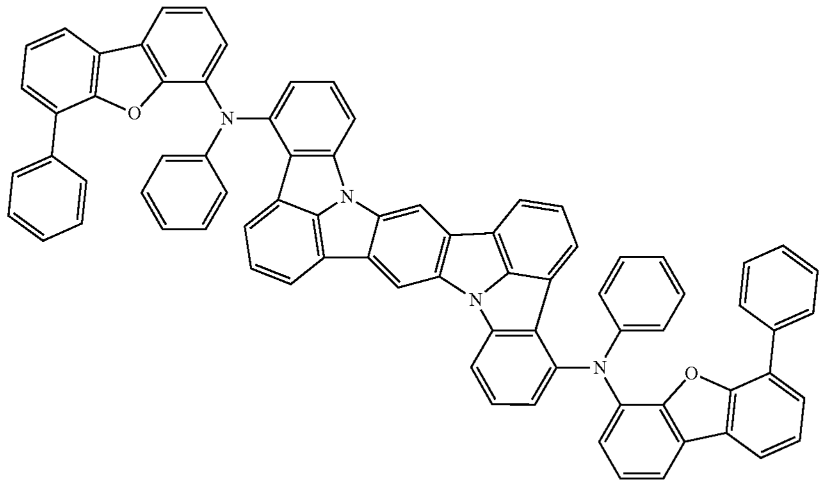

-continued
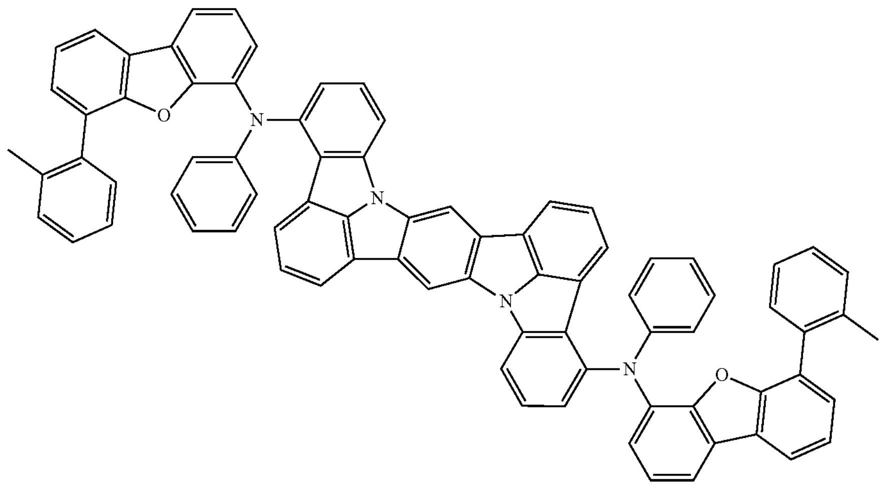
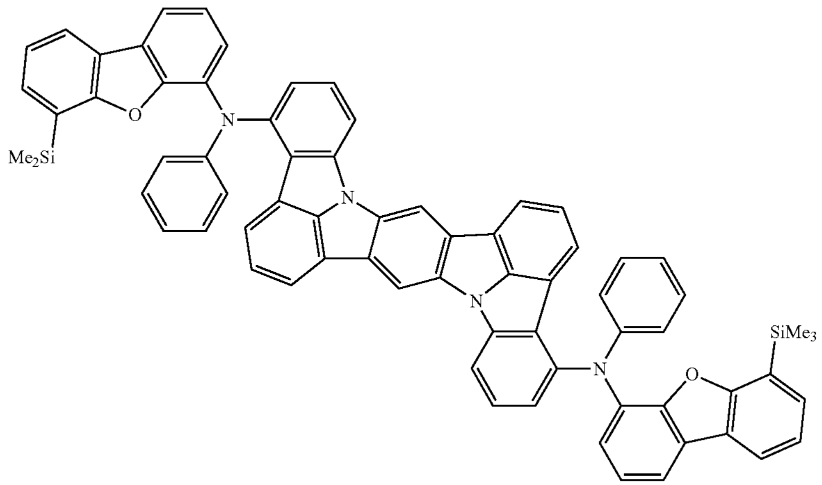
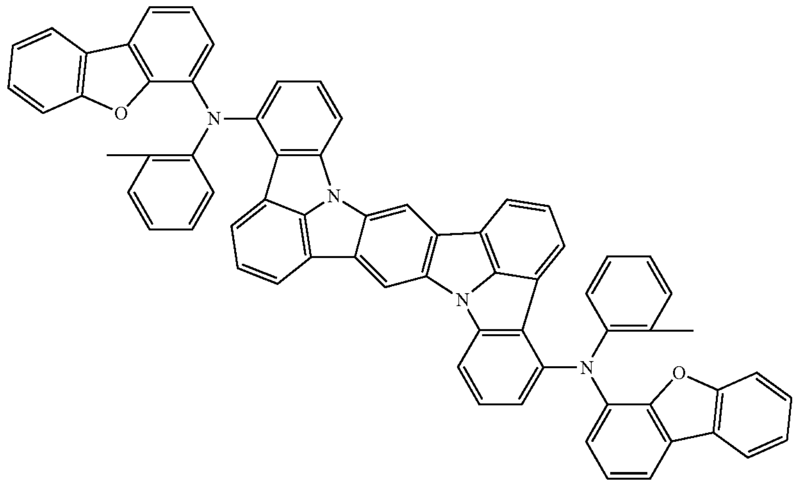

-continued
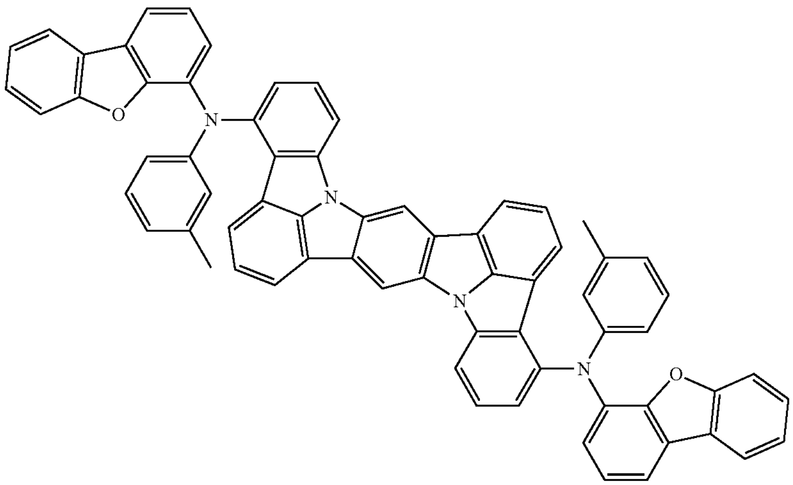
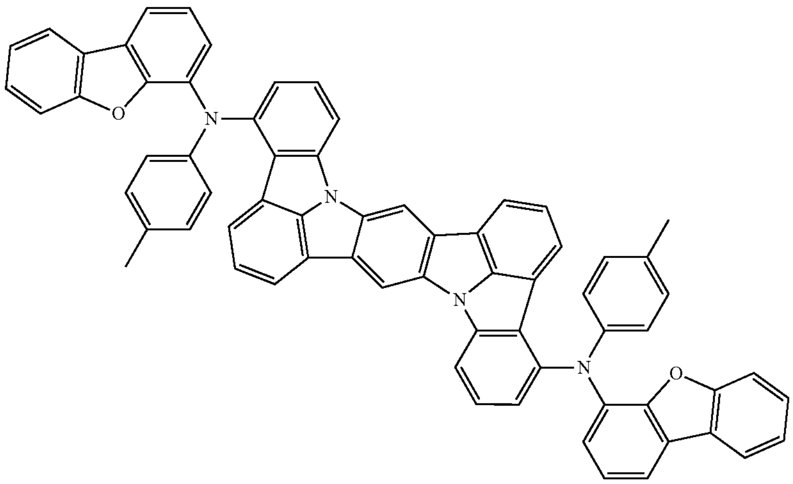
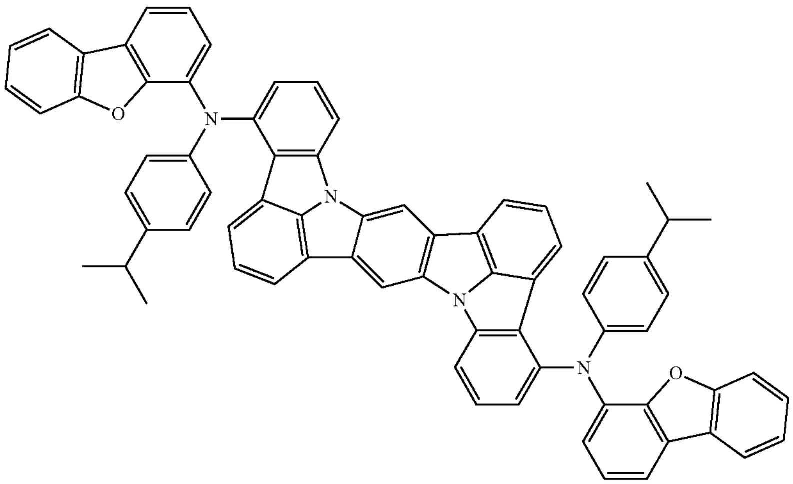

-continued
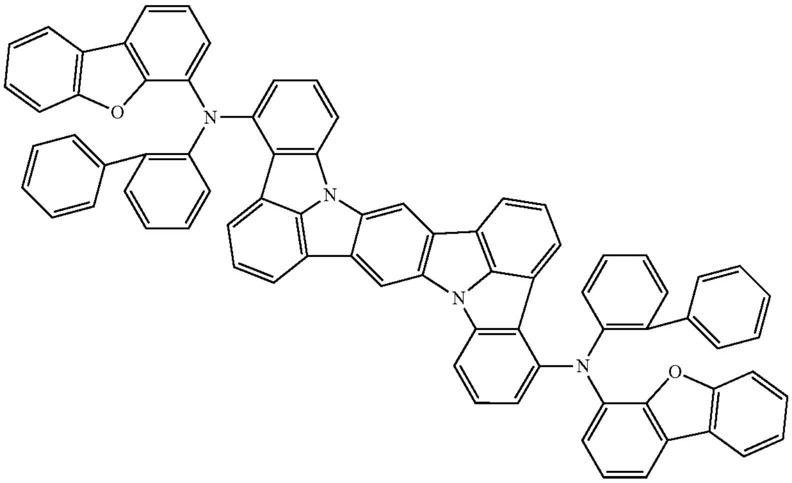
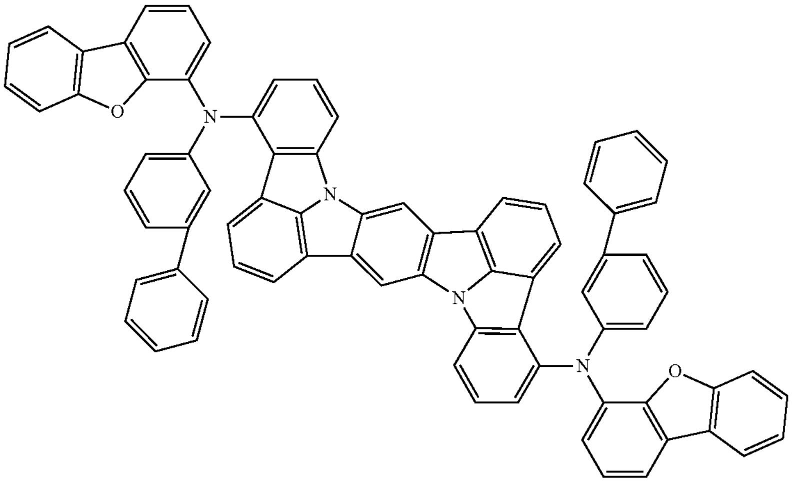
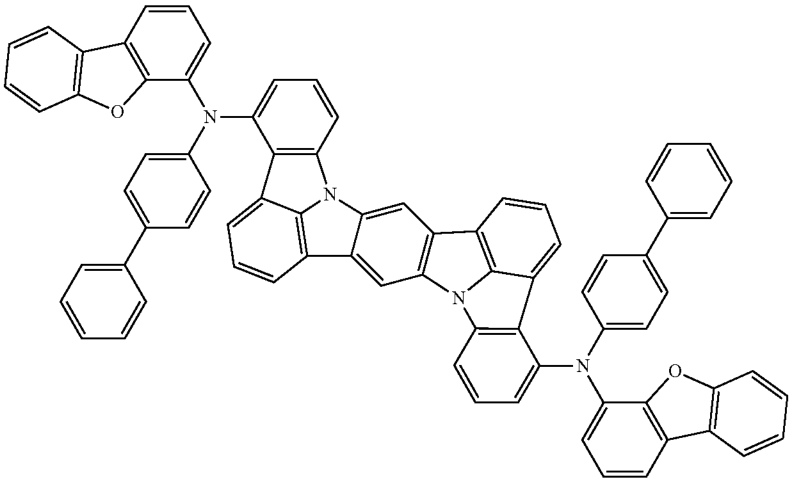

-continued
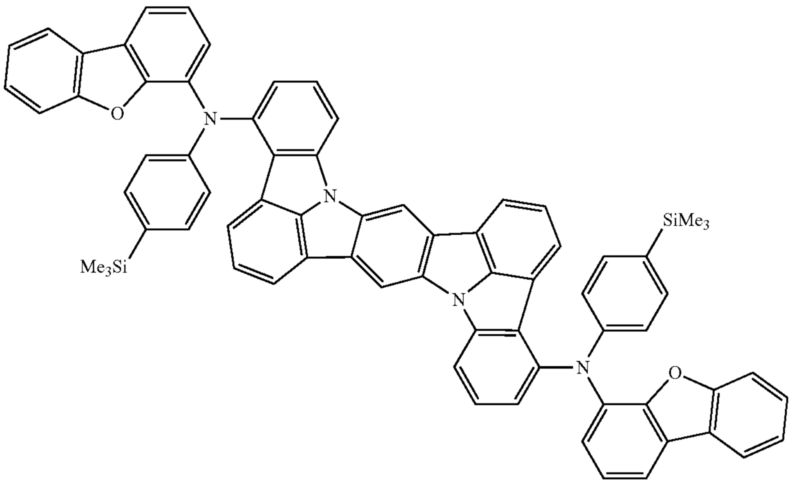
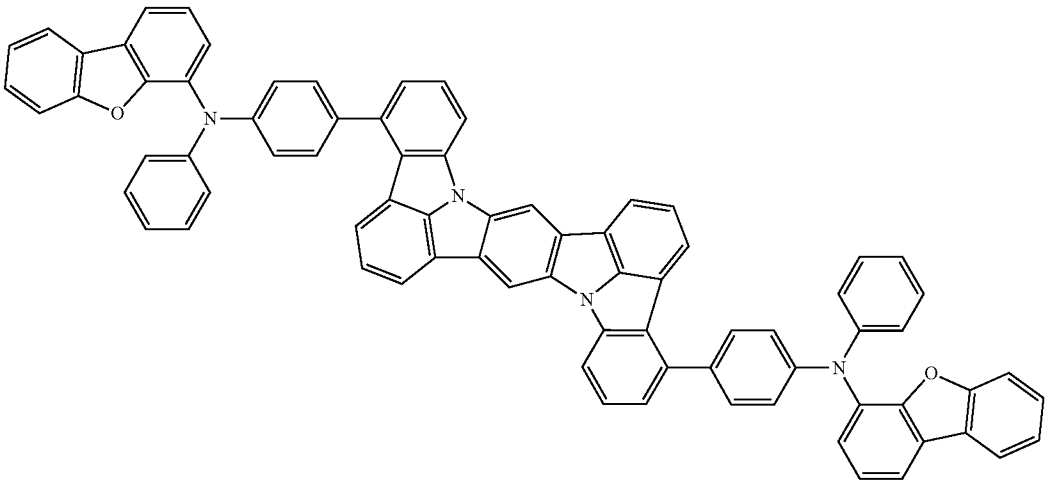
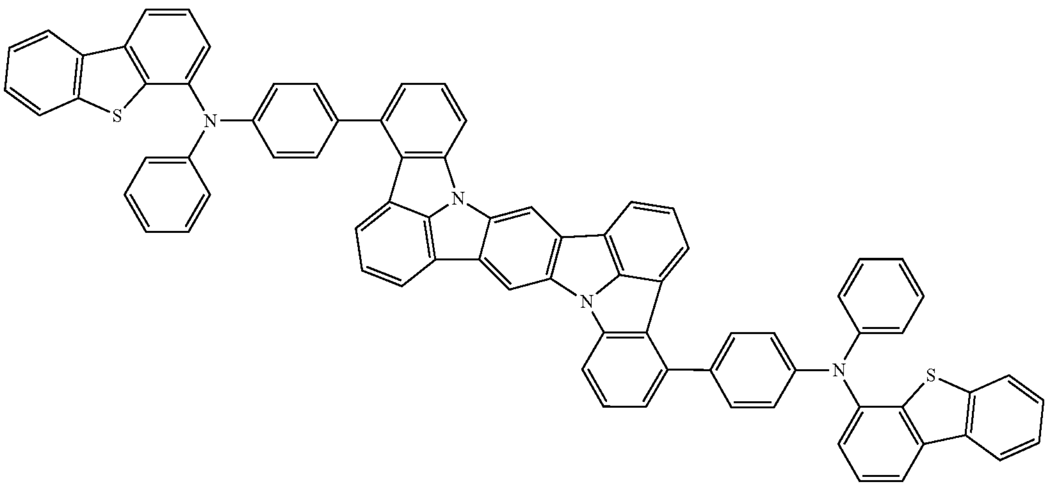

-continued
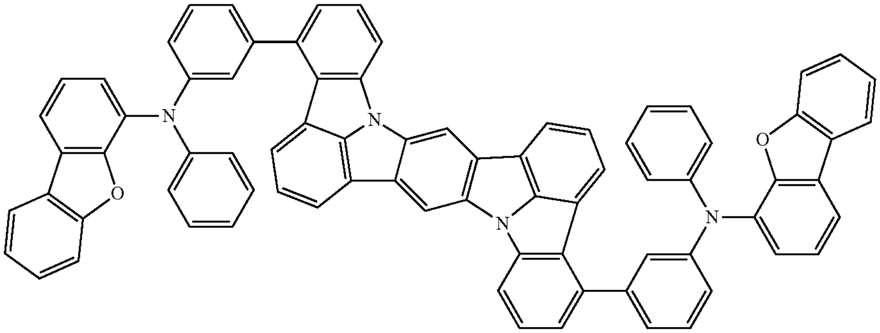
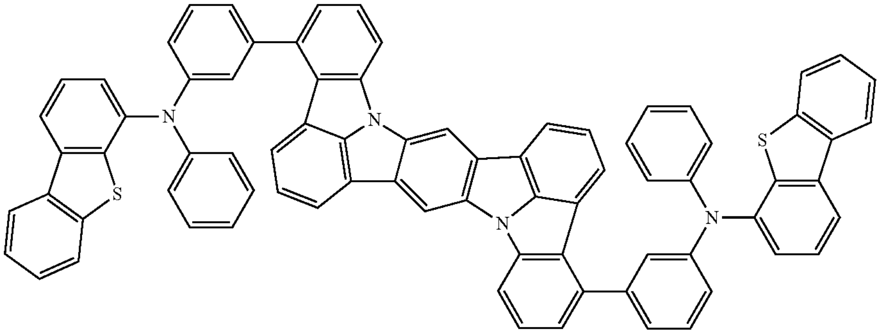
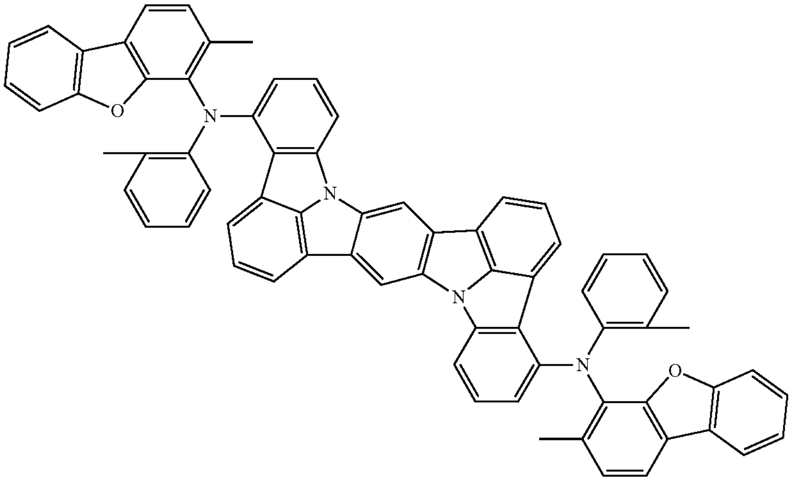
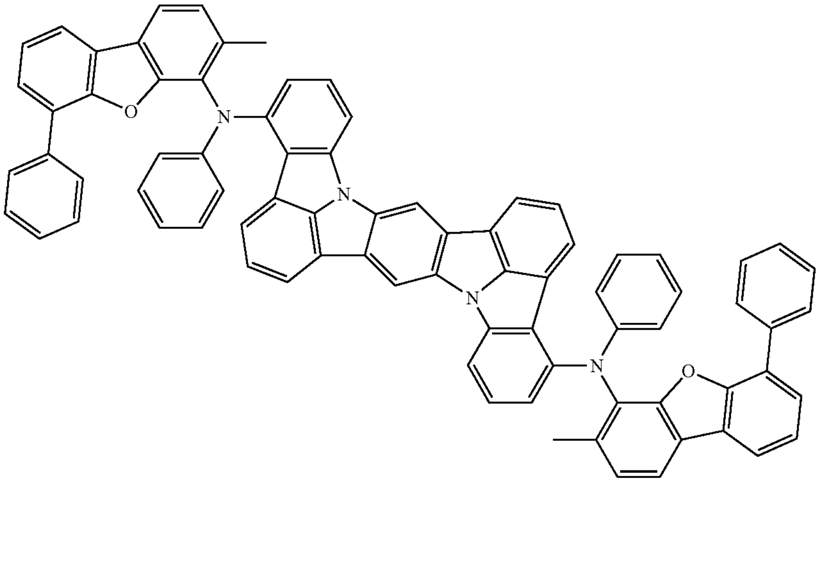

-continued
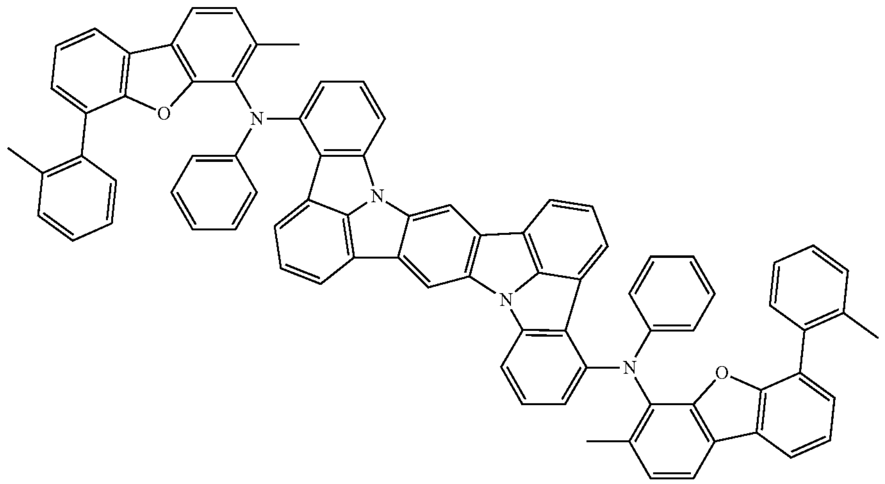
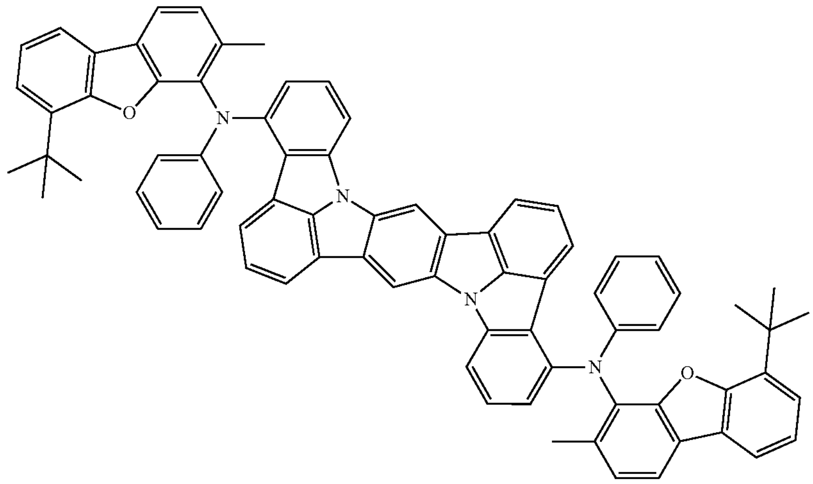
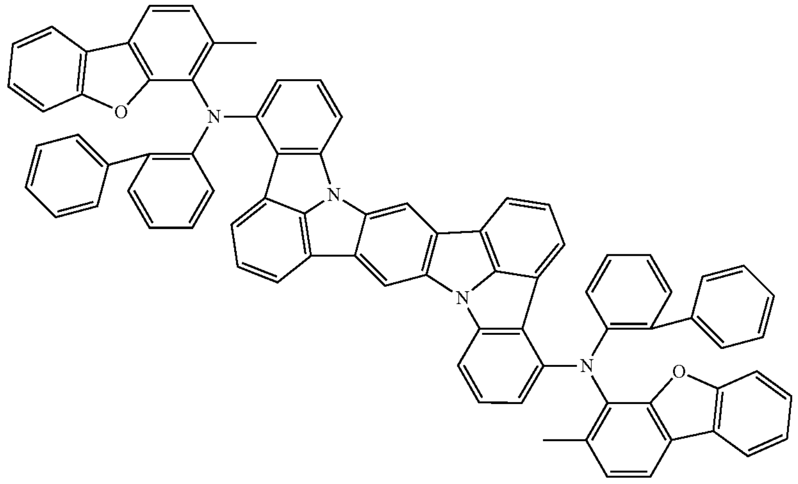

-continued
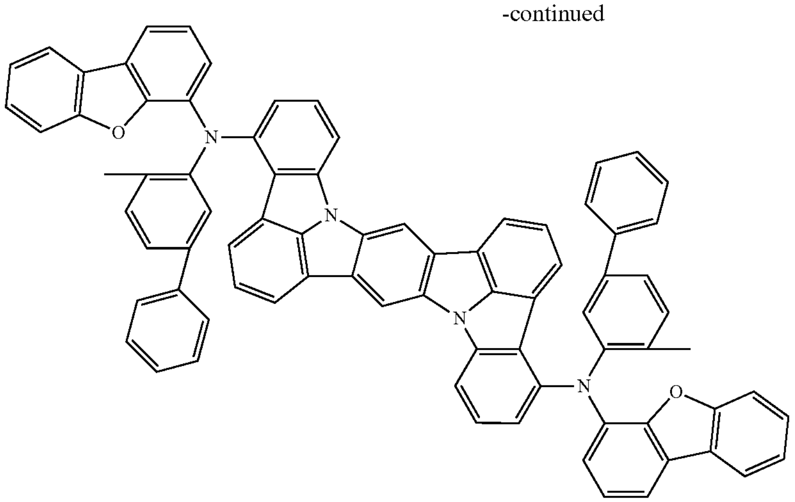
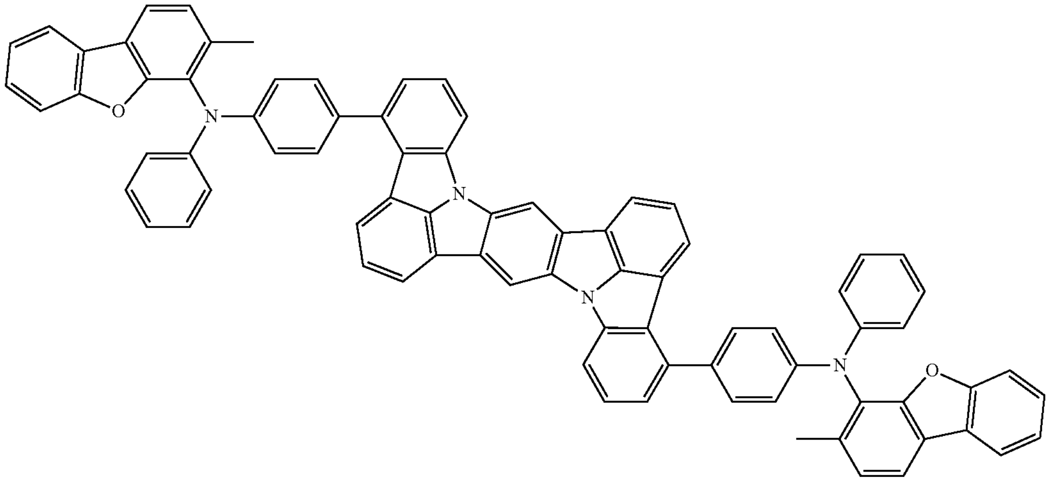
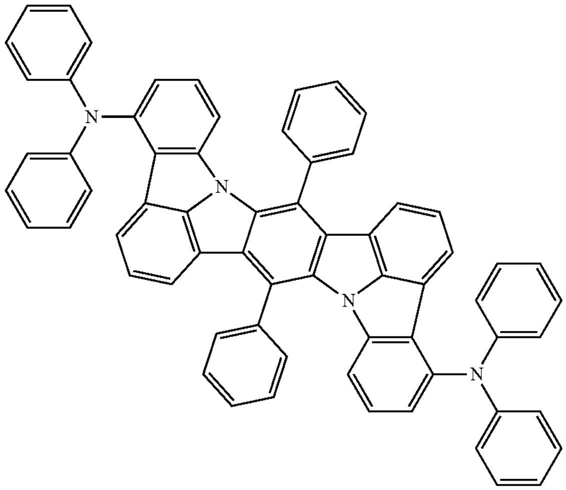

-continued
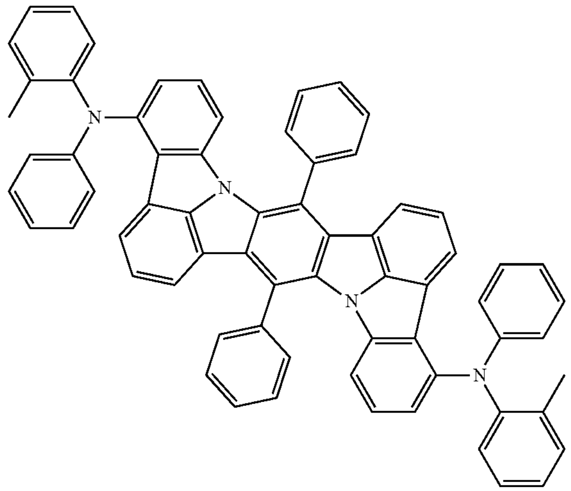
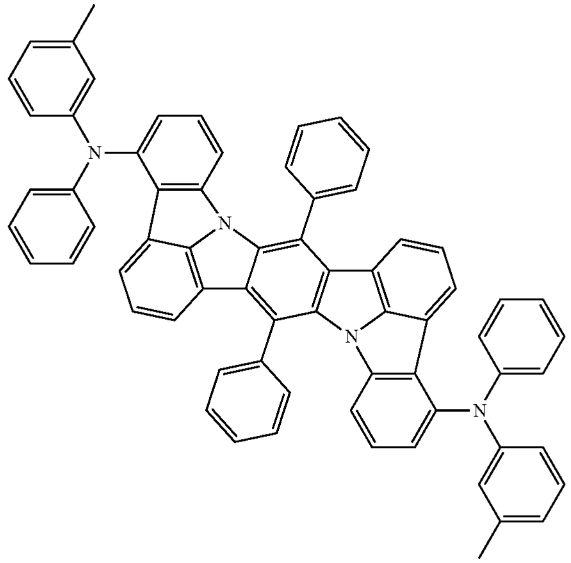
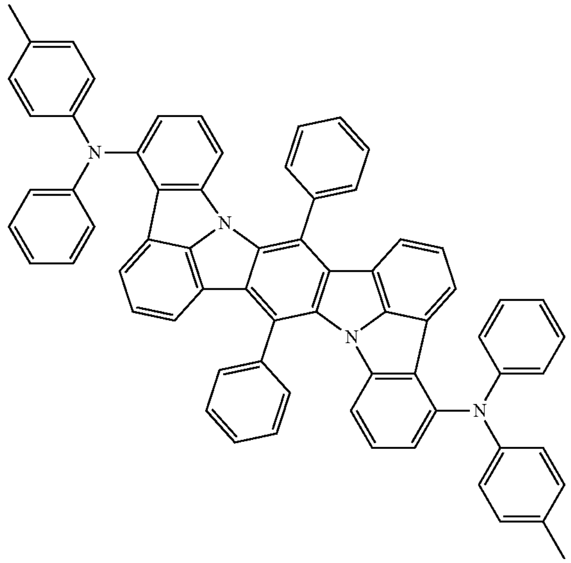

-continued
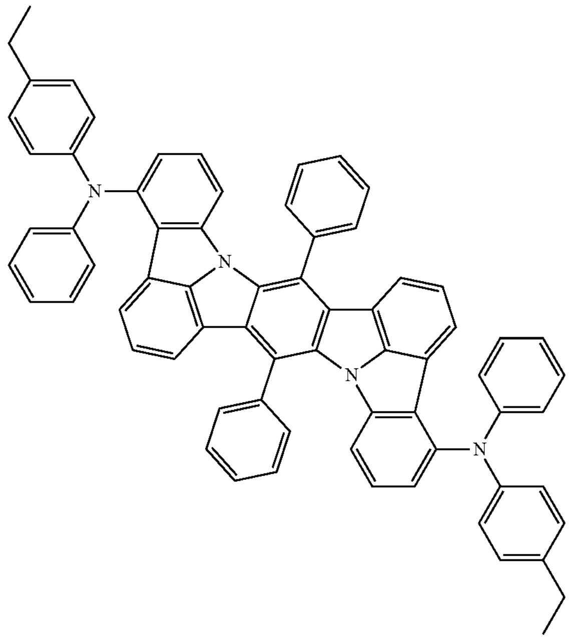
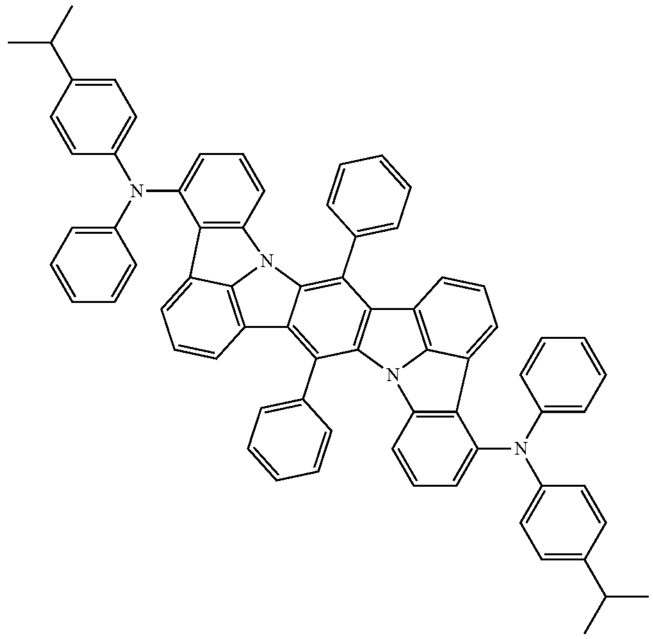

-continued
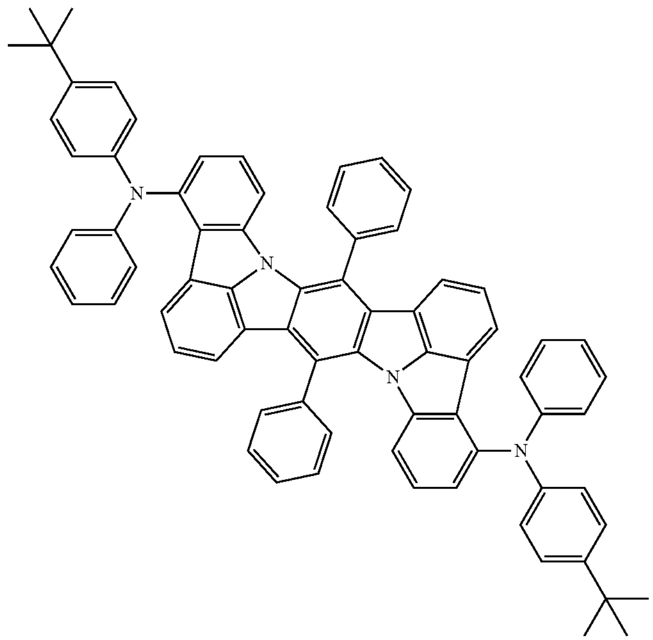
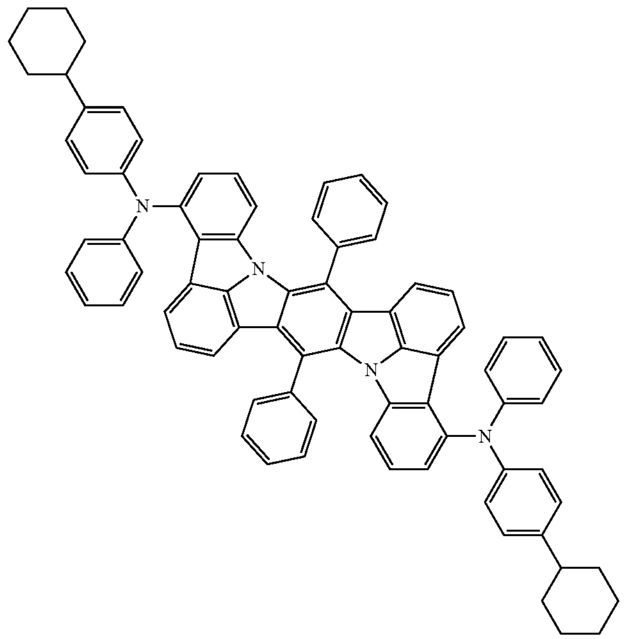

-continued
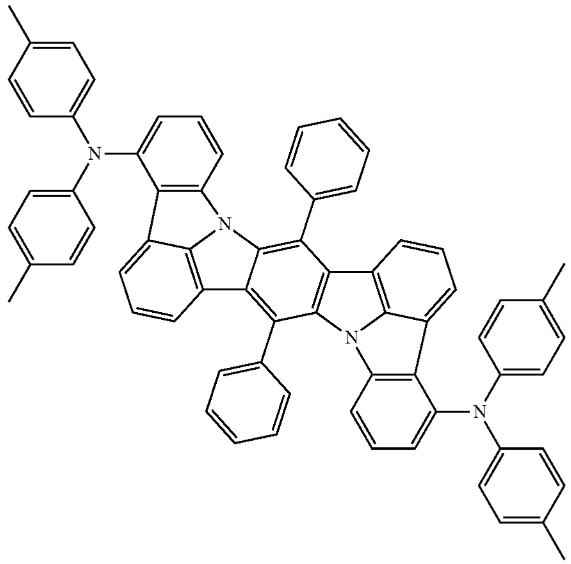
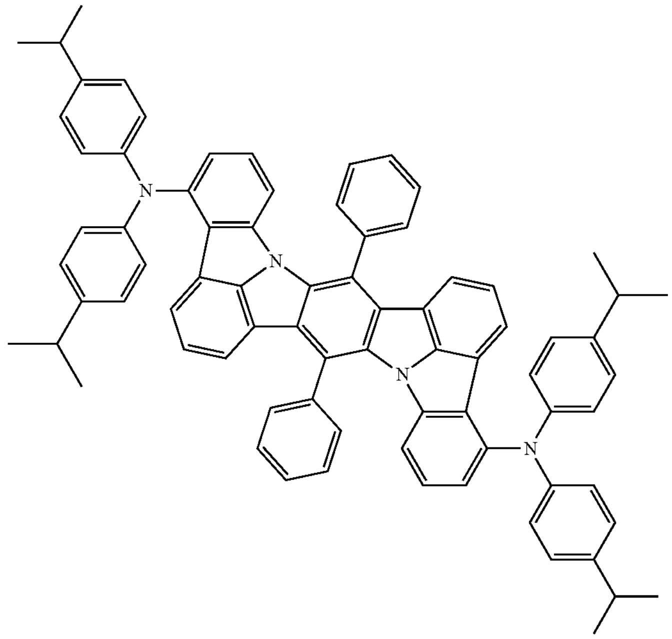

-continued
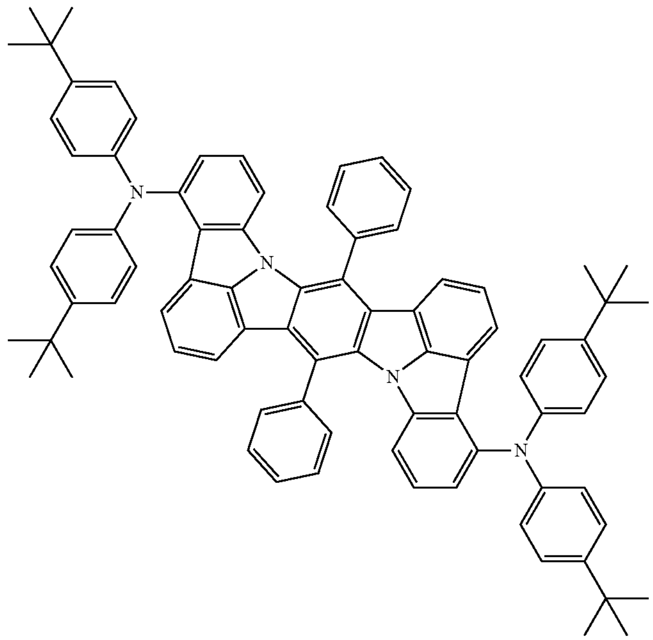
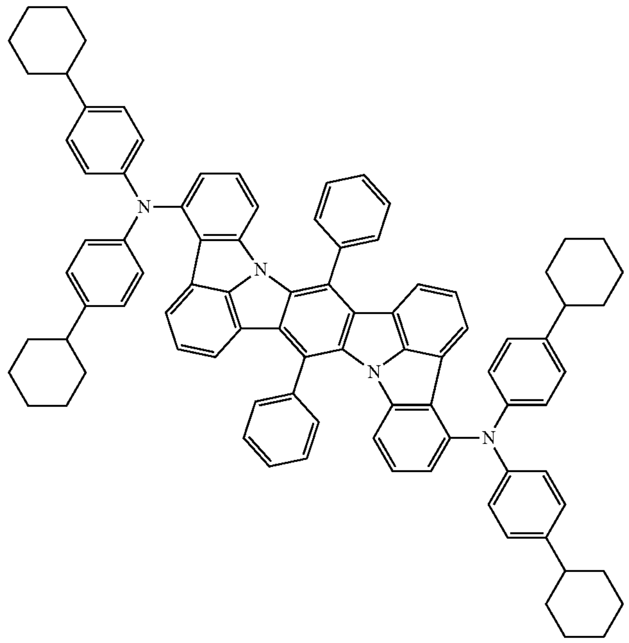

-continued
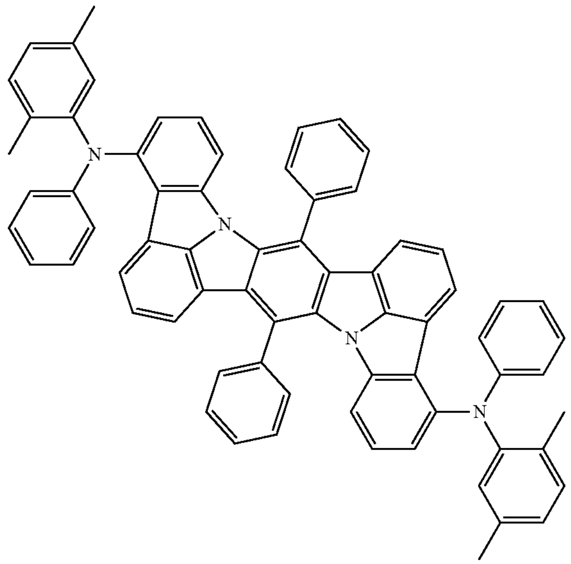
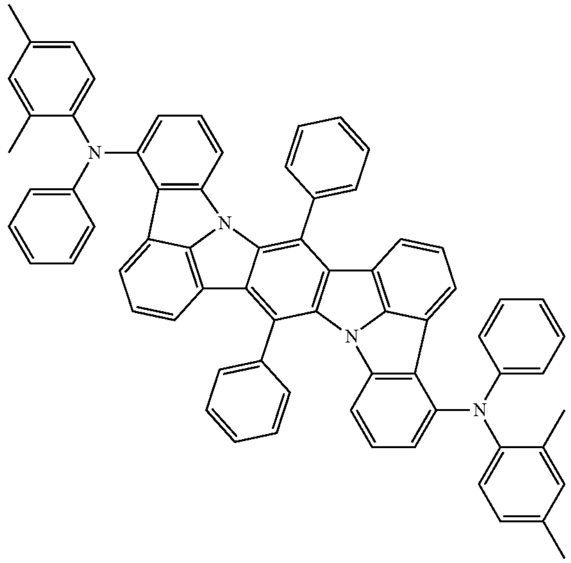
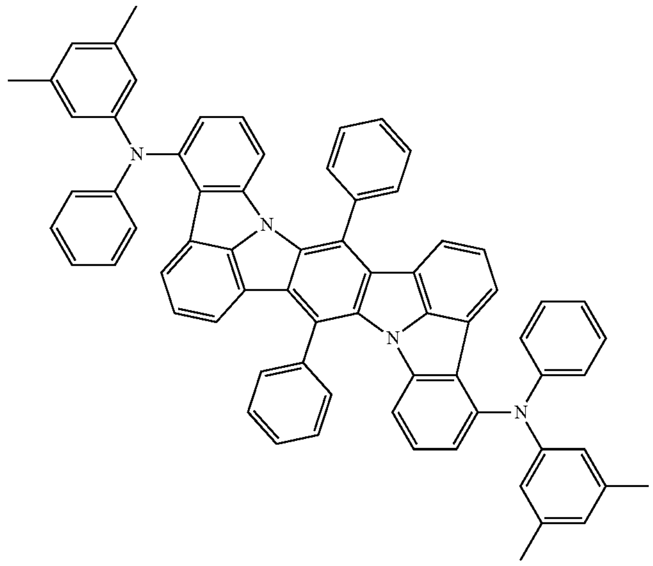

-continued
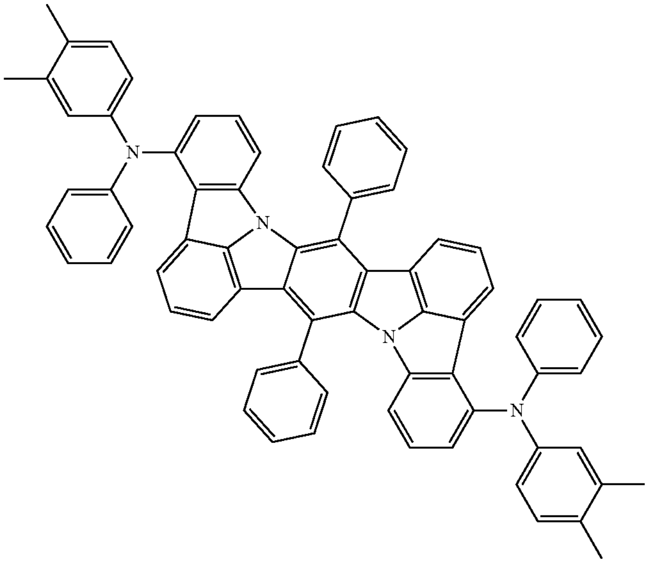
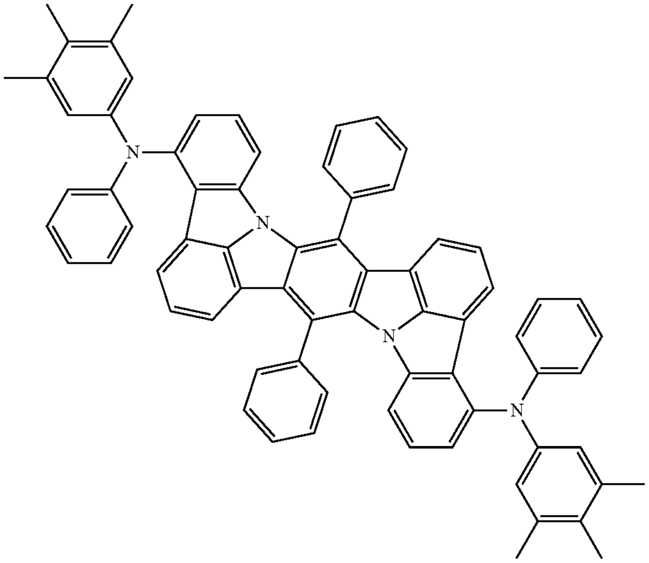
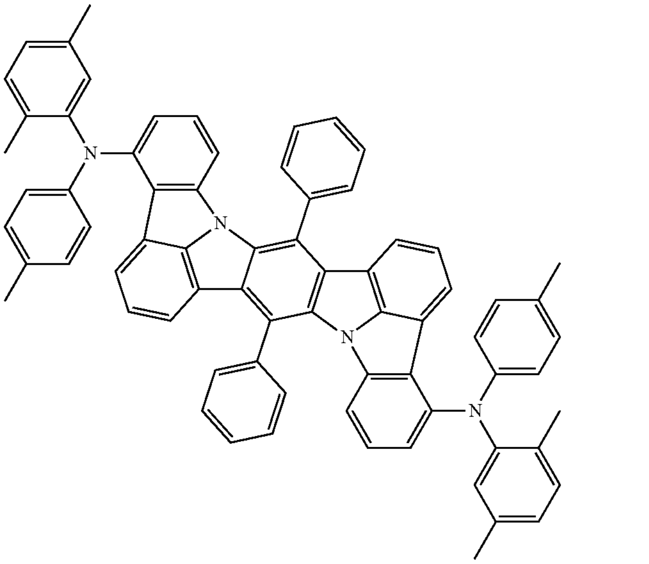

-continued
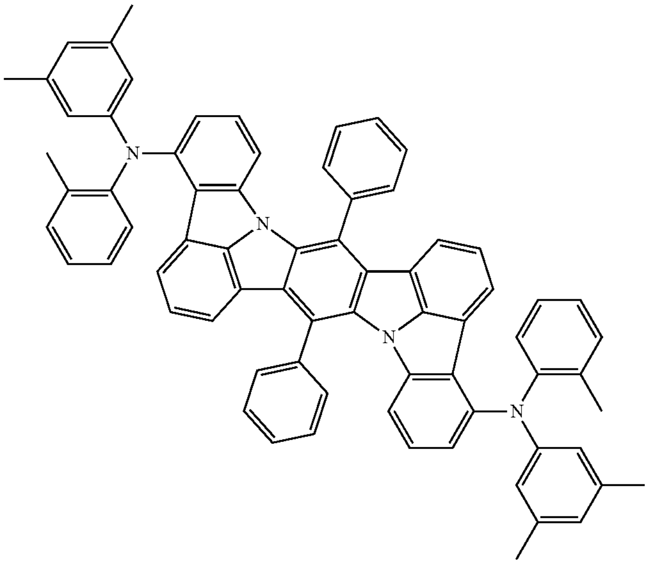
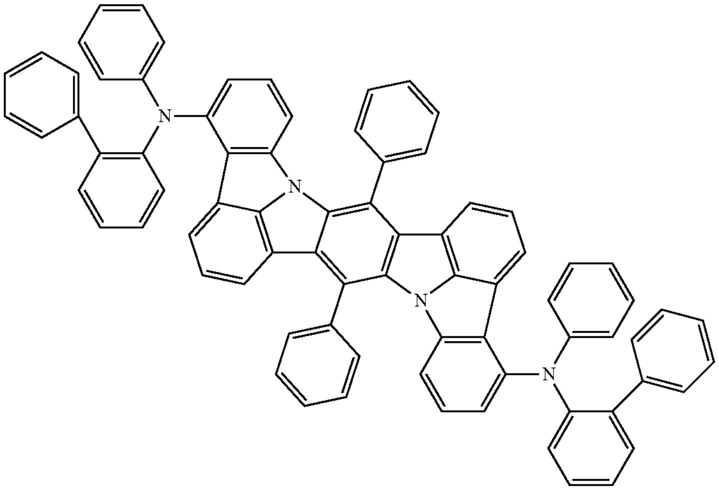
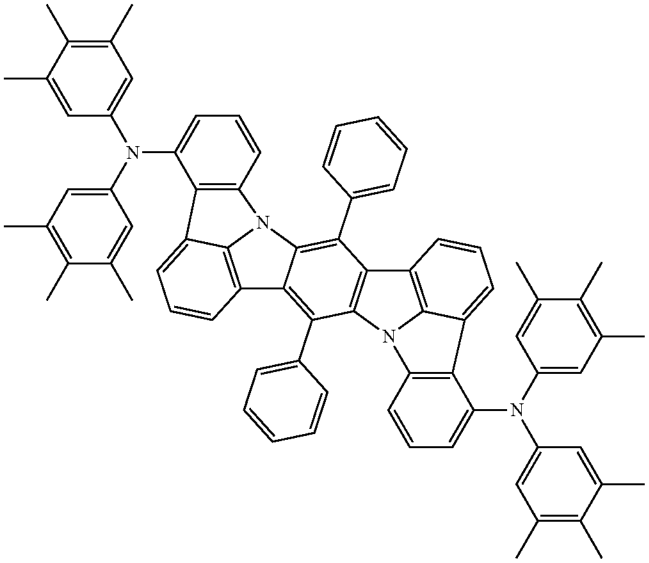

-continued
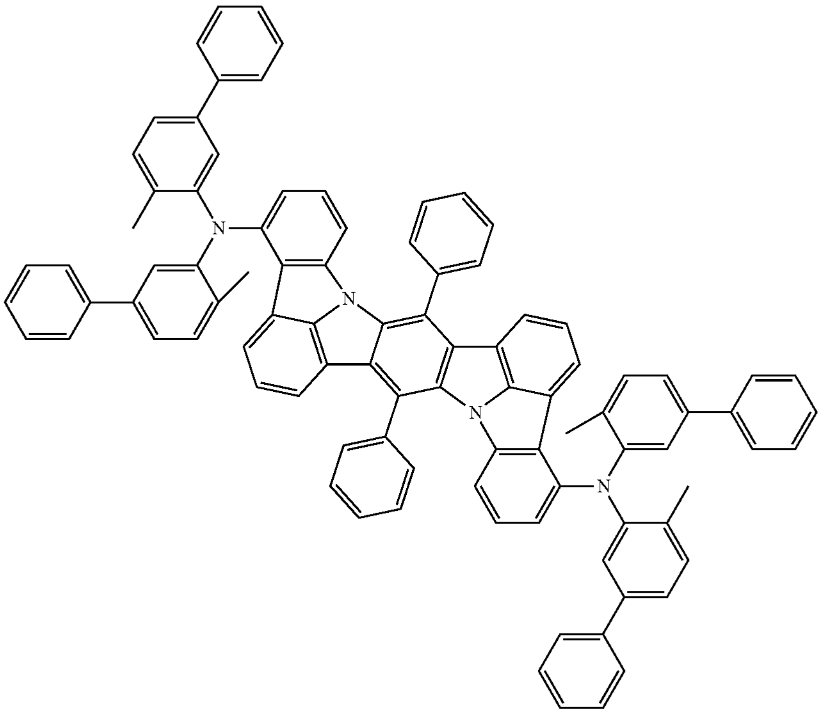
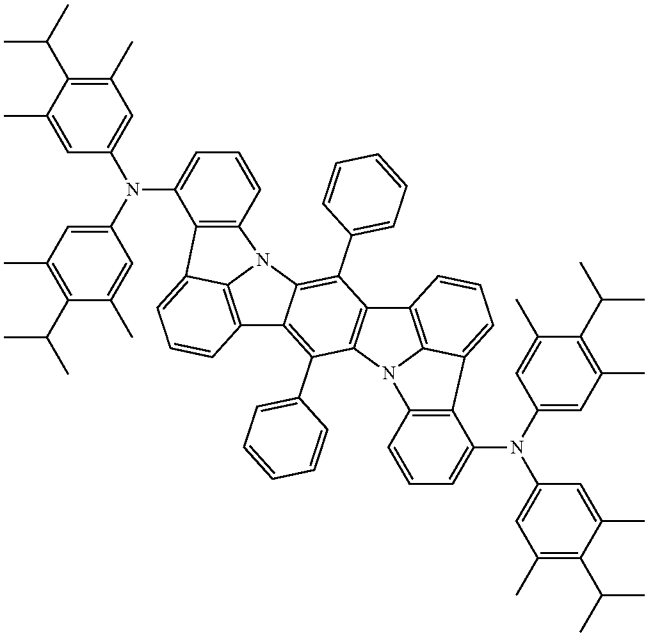

-continued
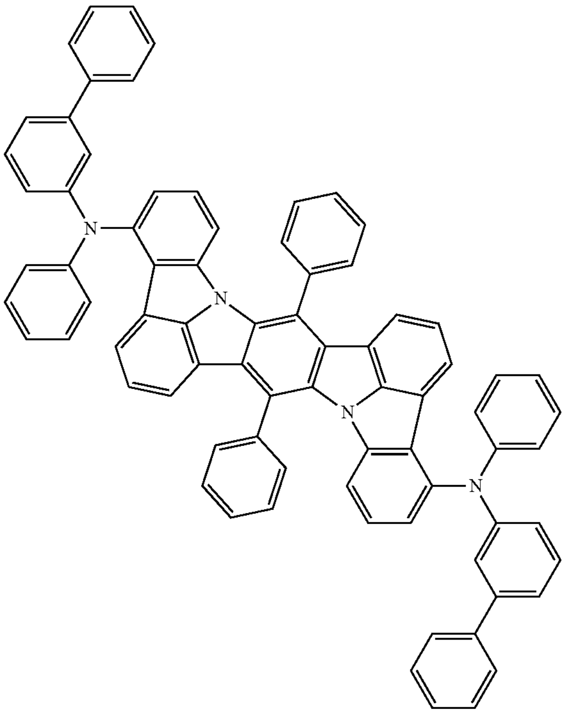
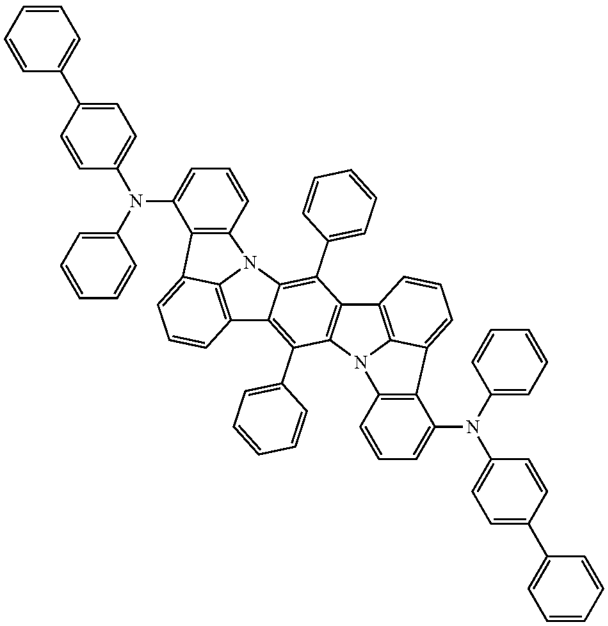

-continued
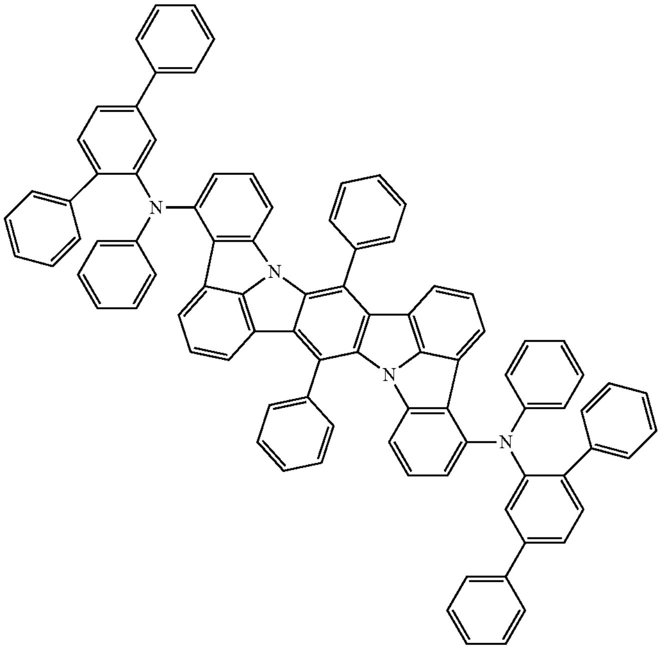
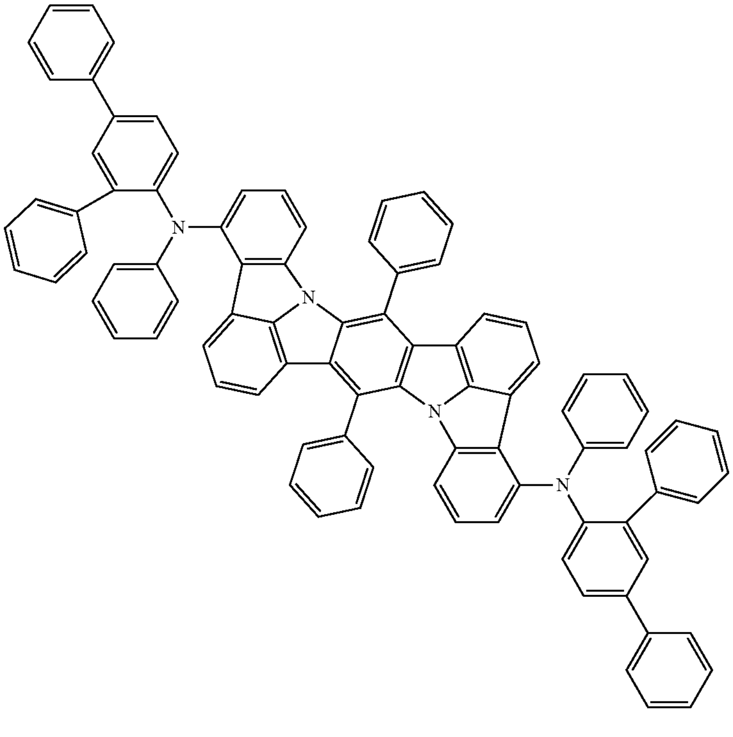

-continued
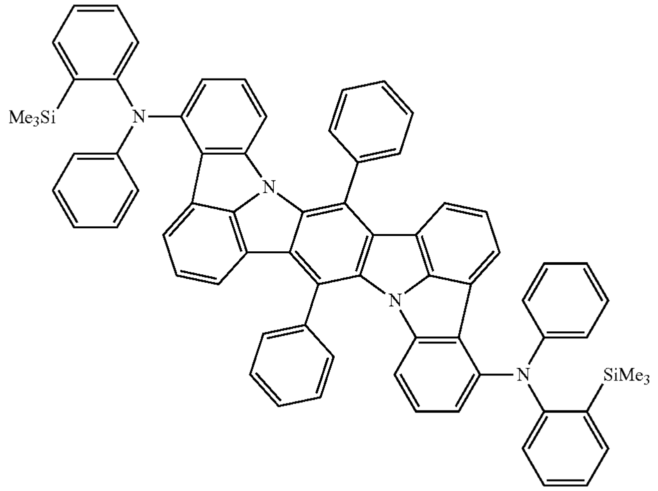
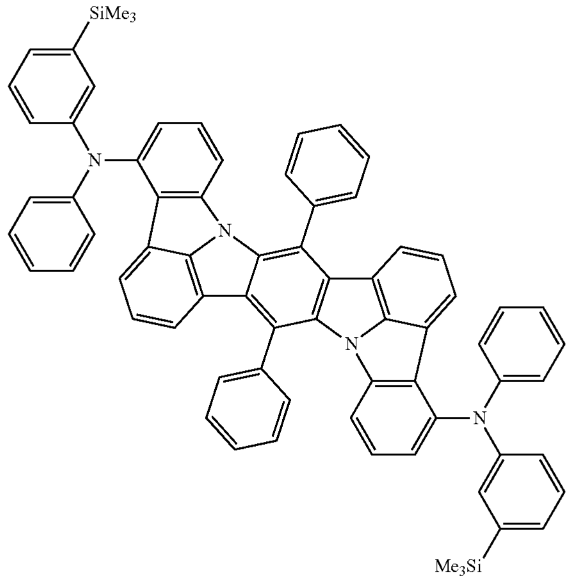
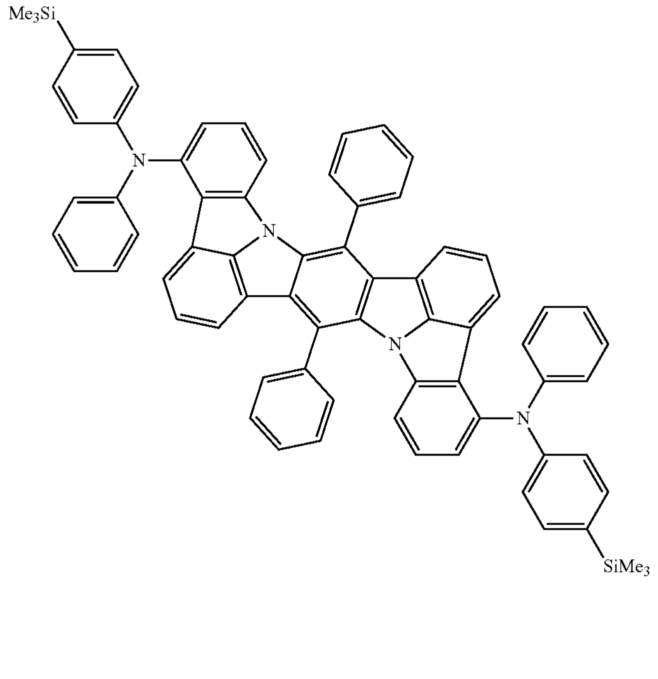

-continued
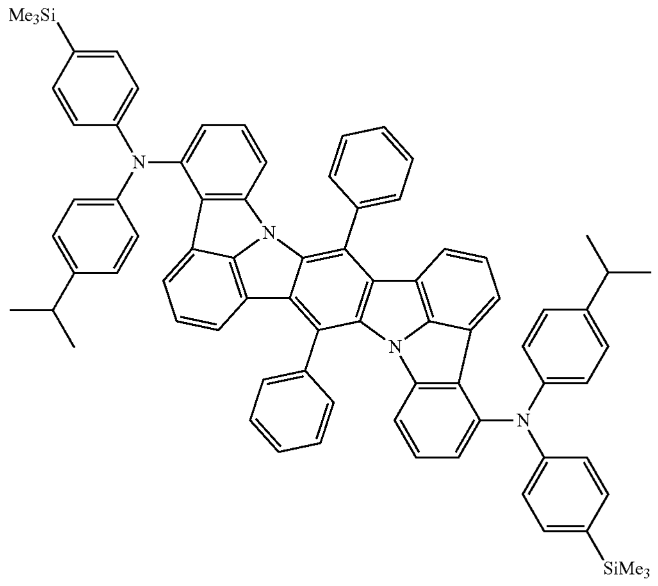
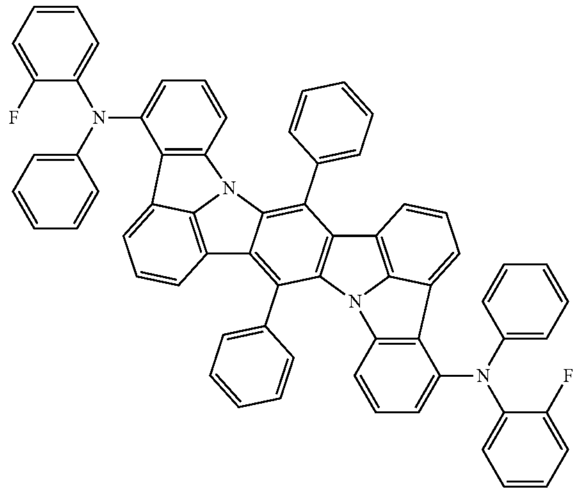
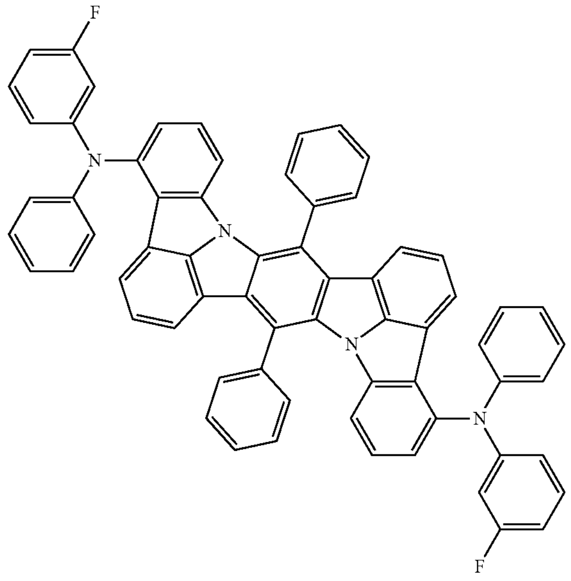

-continued
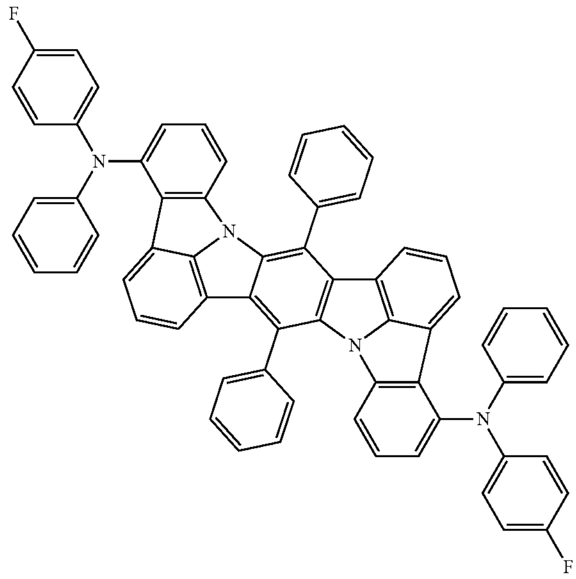
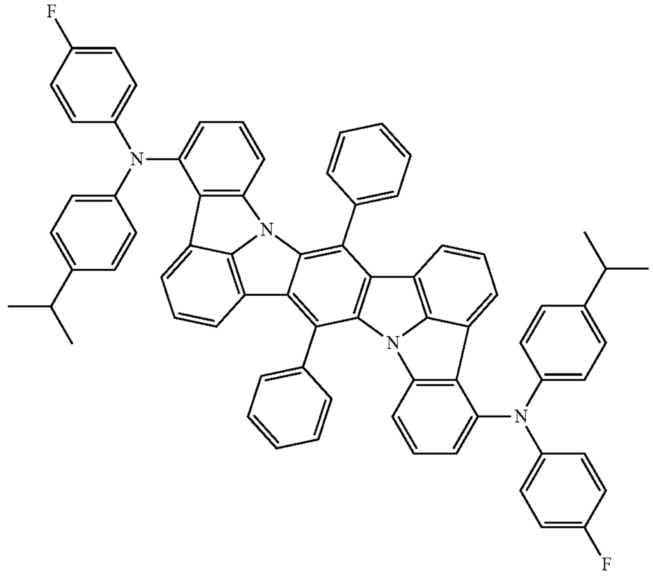
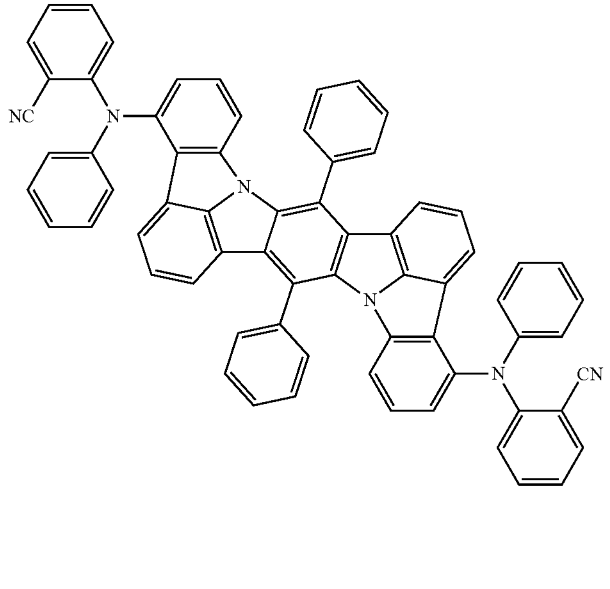

-continued
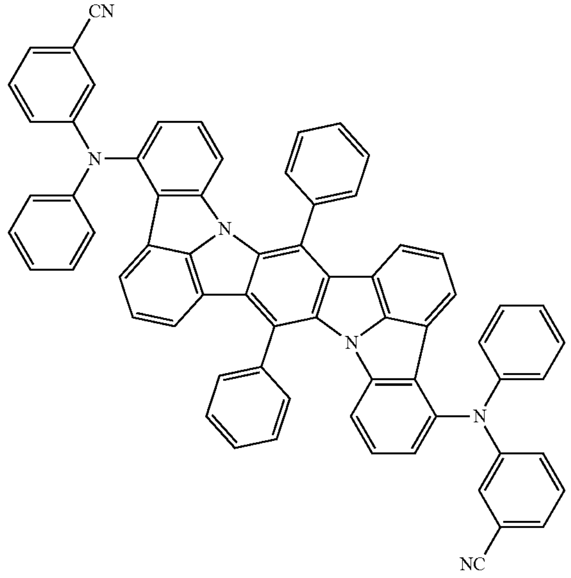
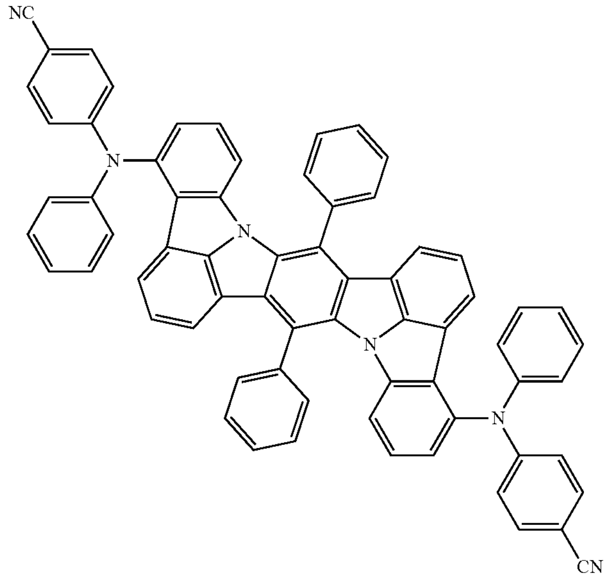
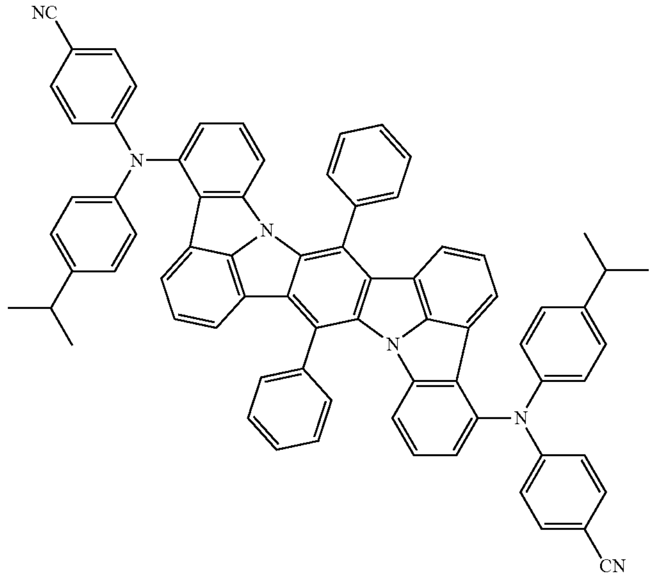

-continued
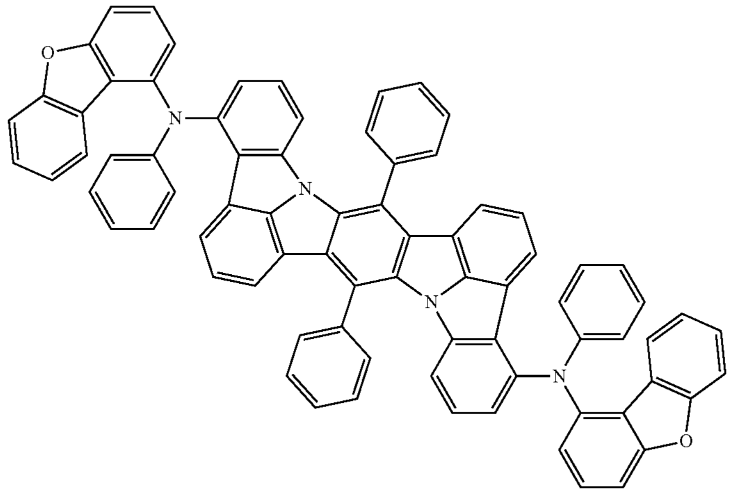
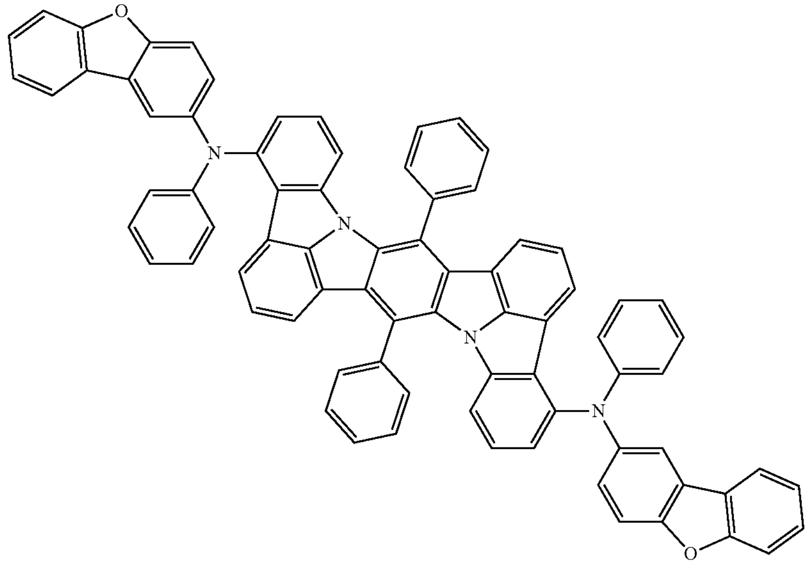

-continued
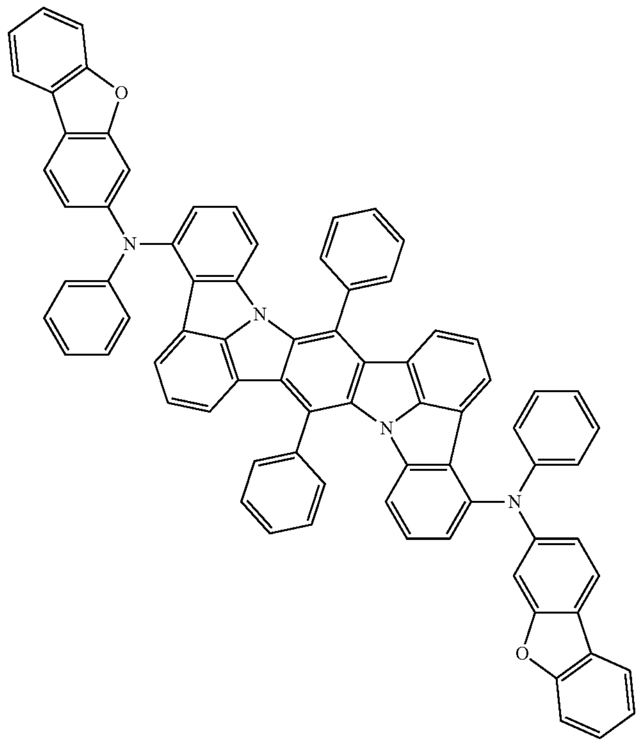
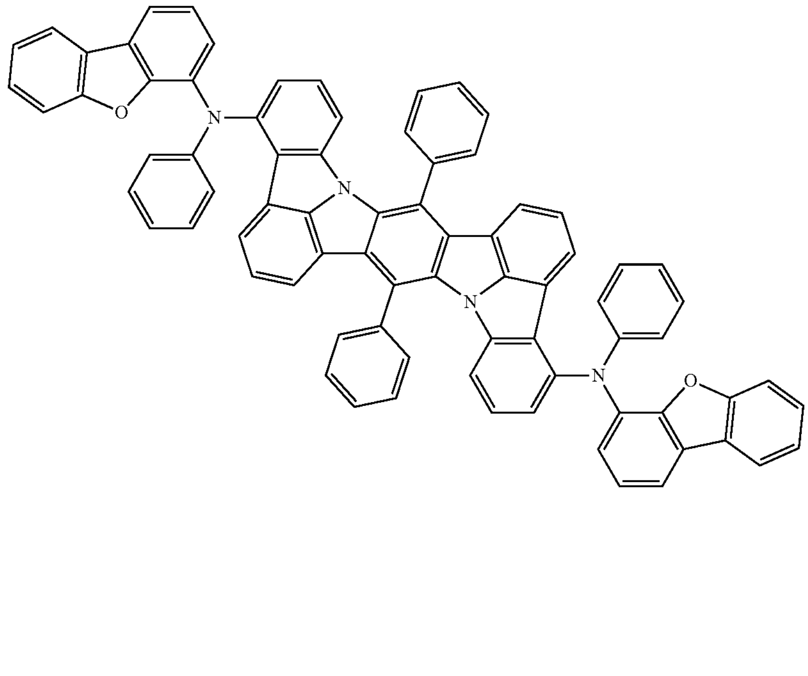

-continued
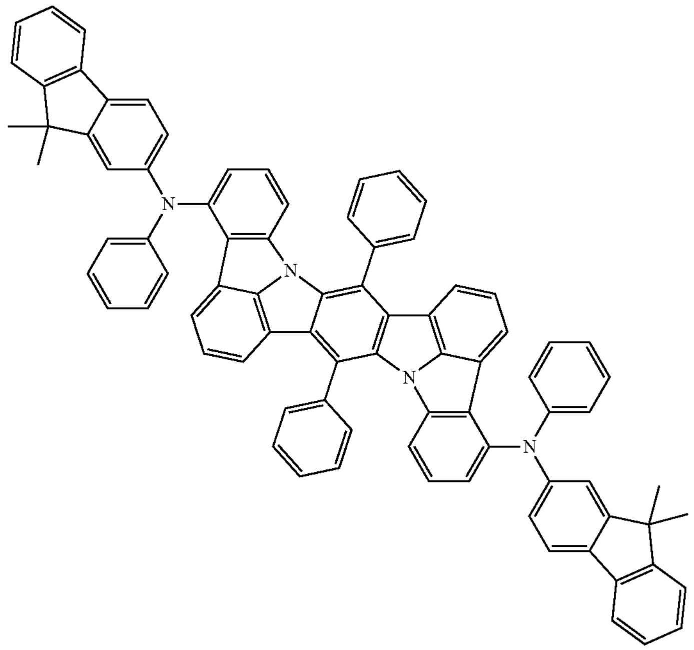
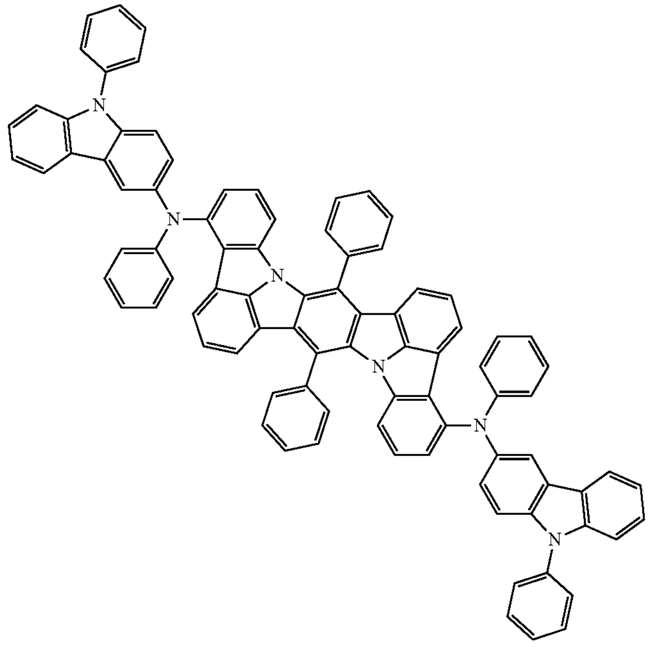

-continued
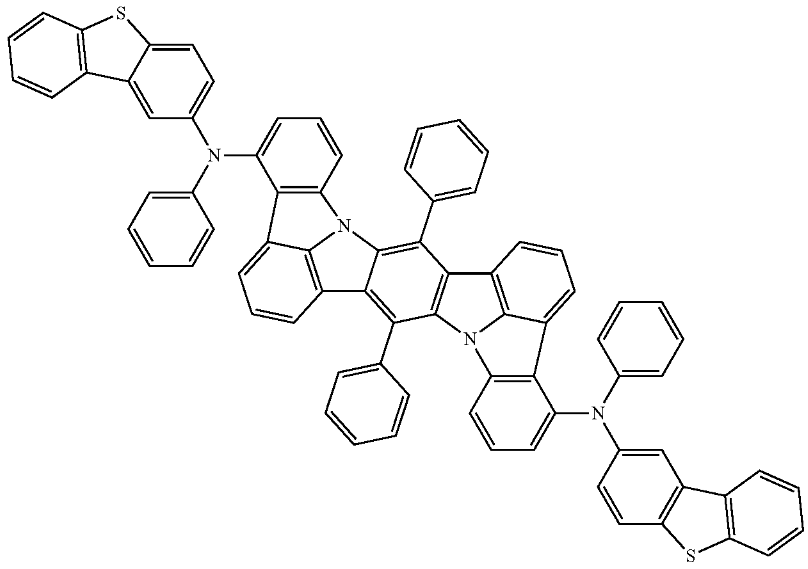
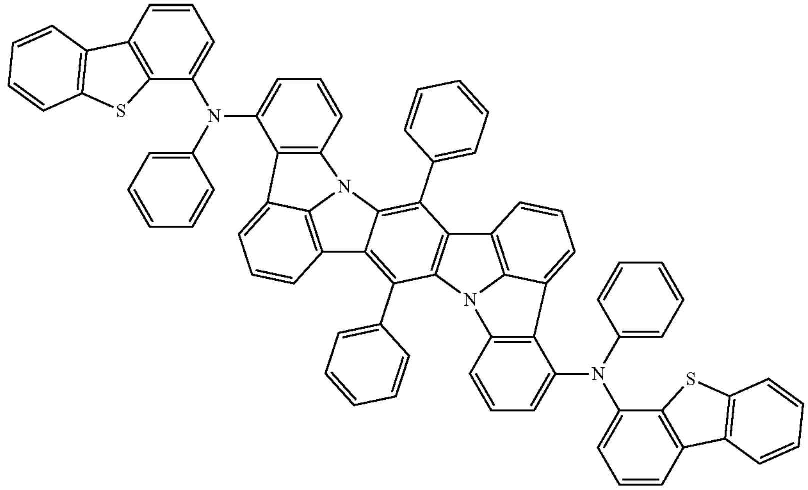
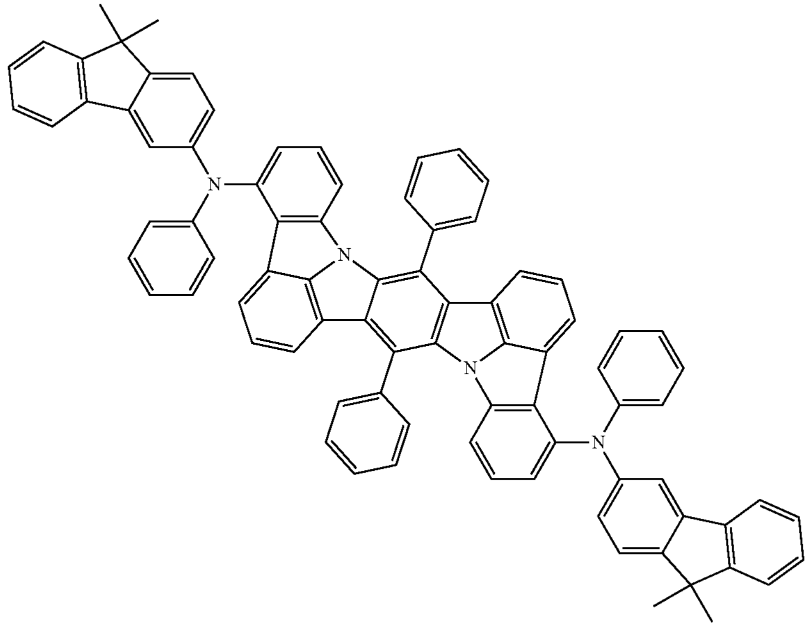

-continued
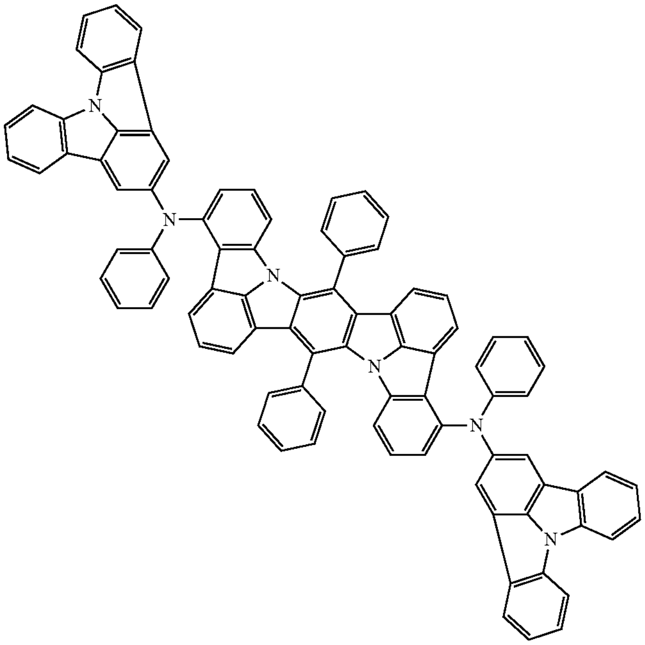
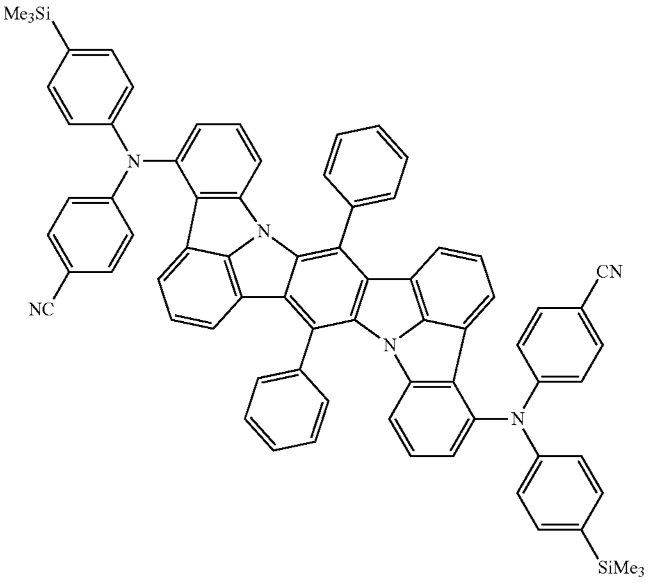
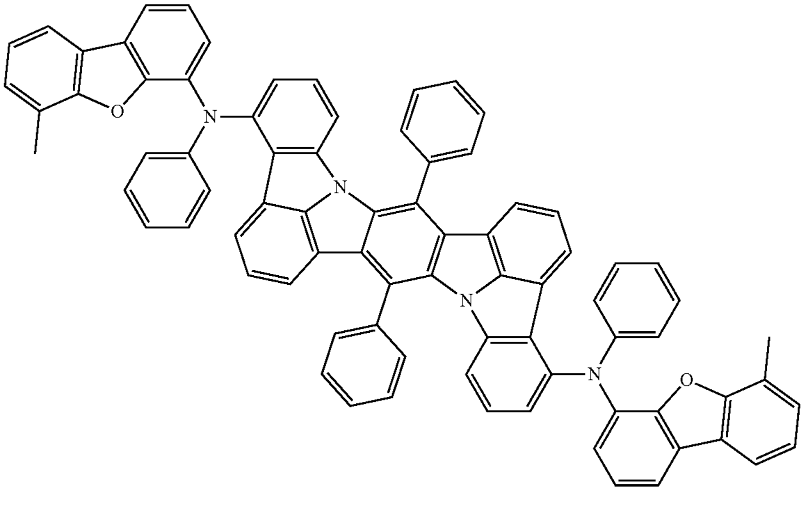

-continued
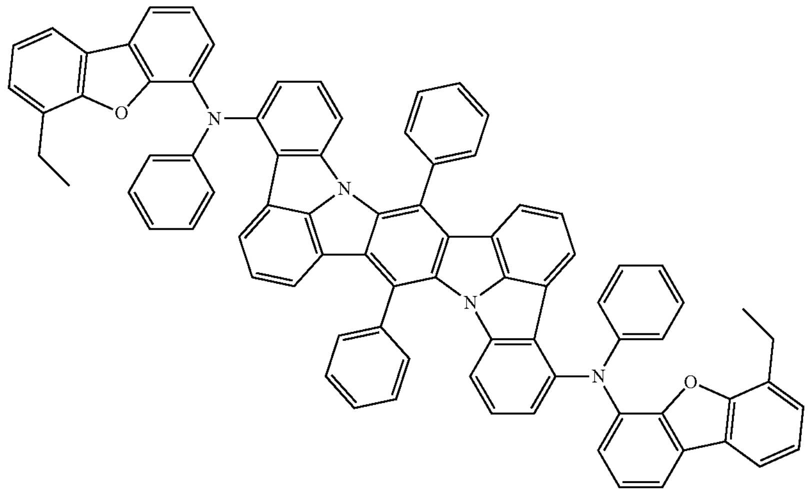
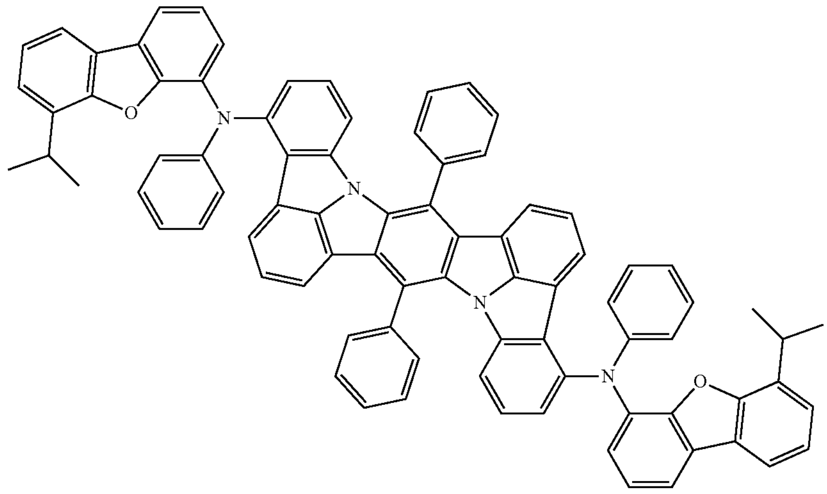
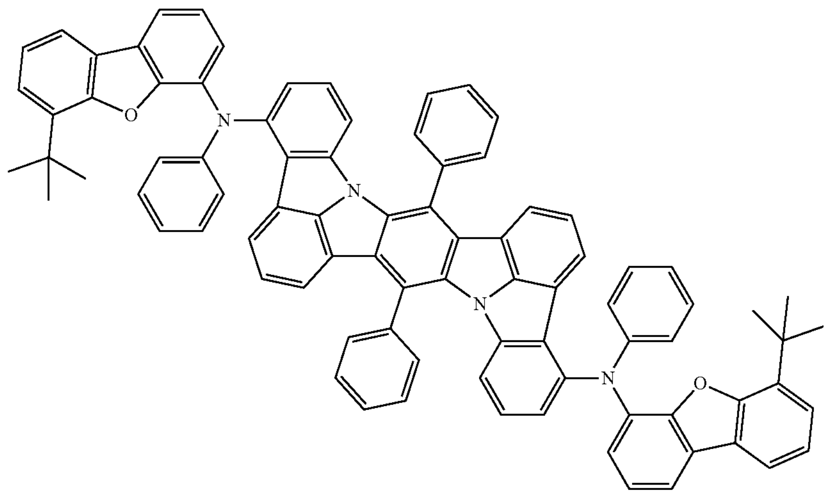

-continued
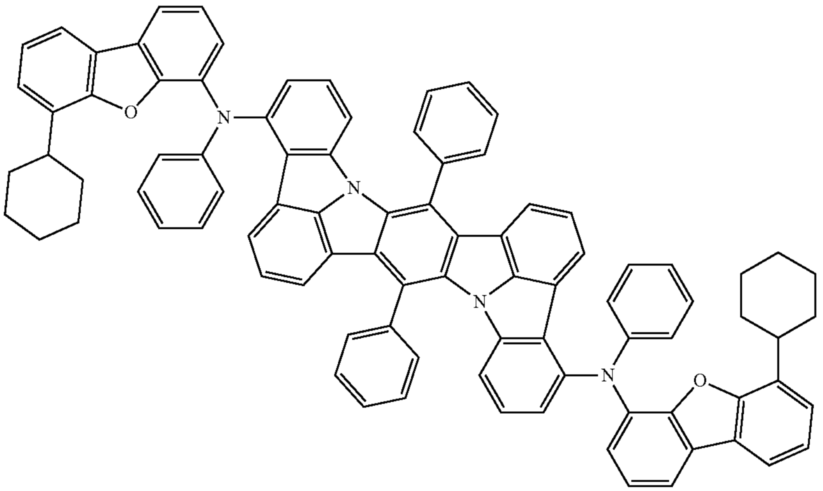
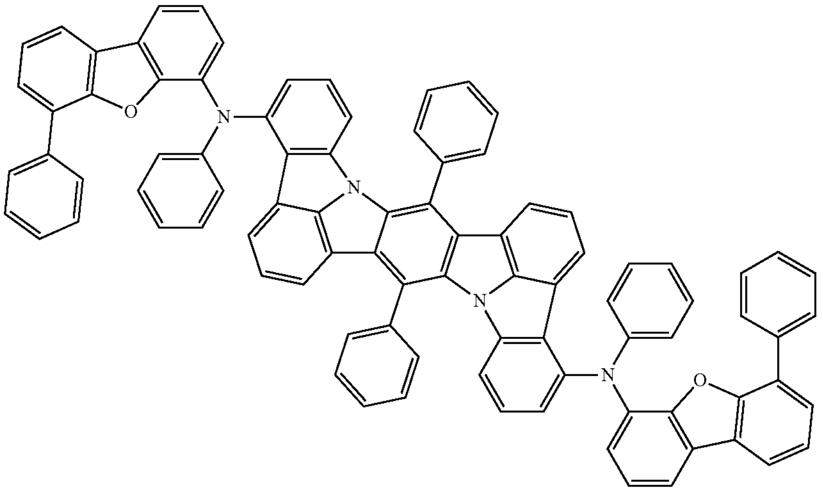
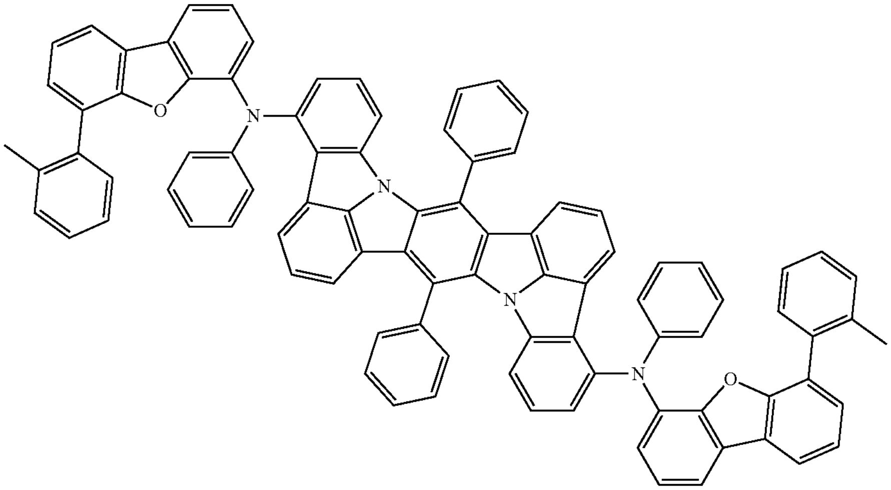

-continued
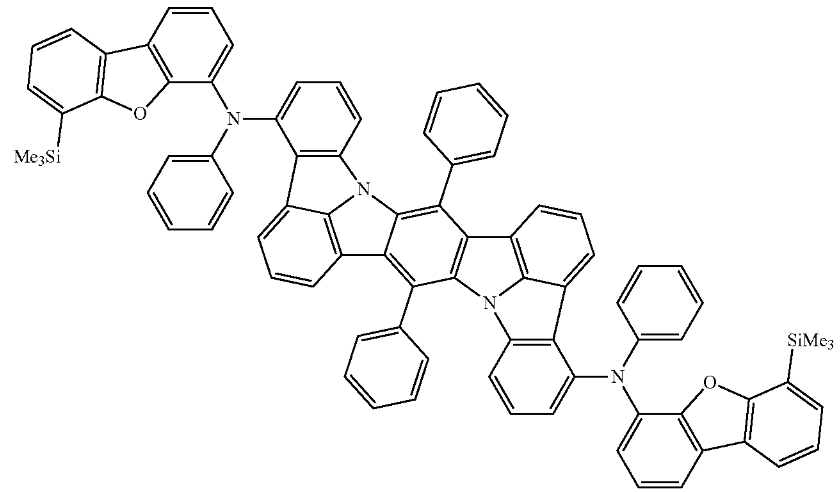
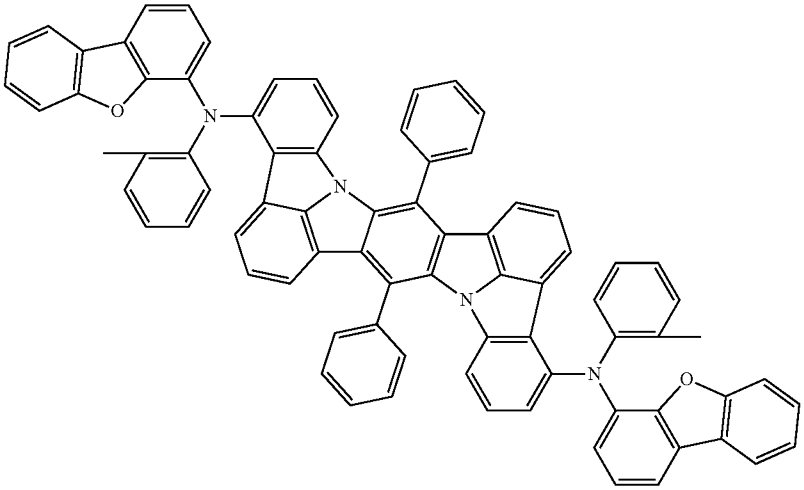
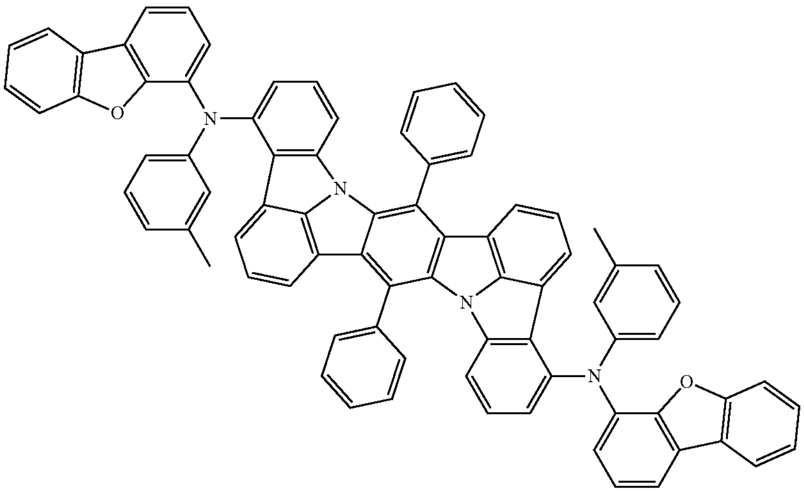

-continued
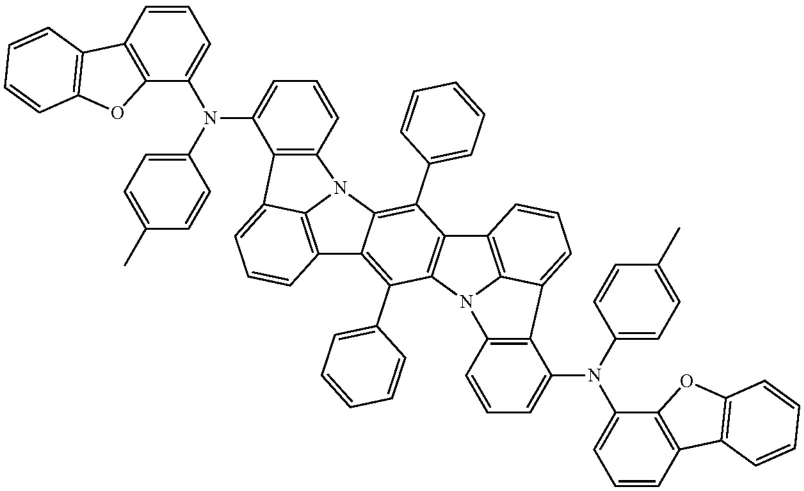
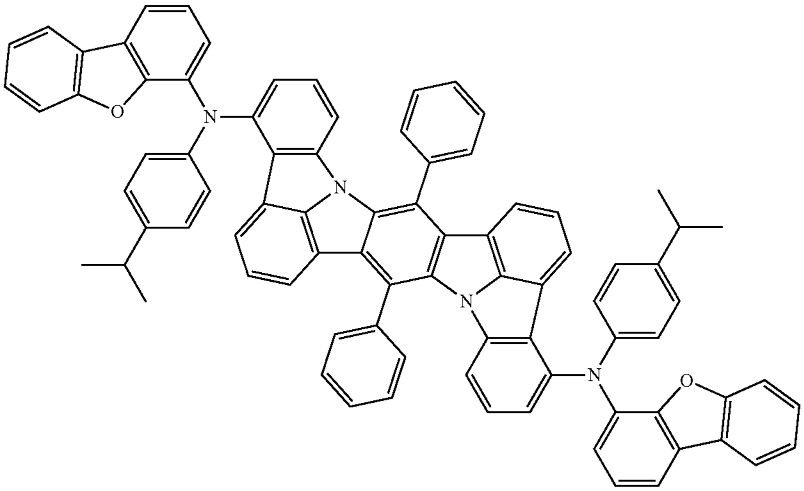
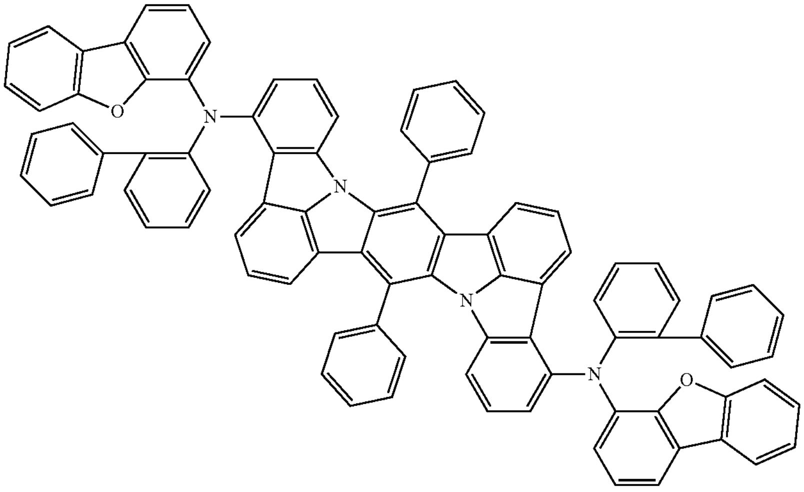

-continued
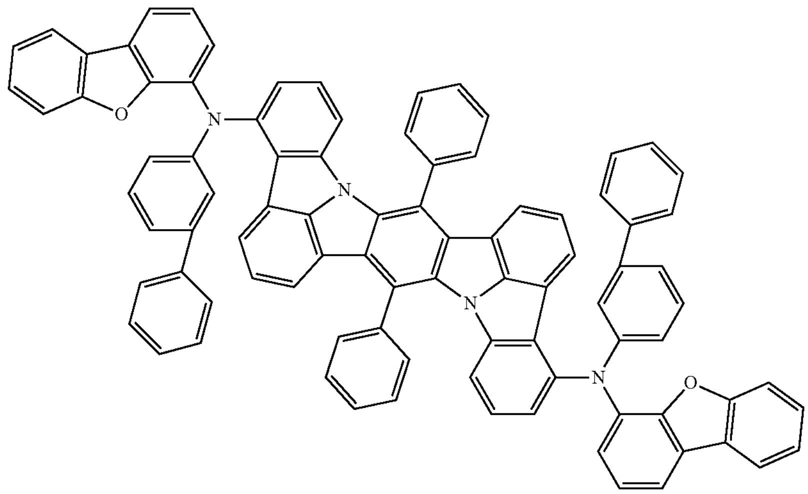
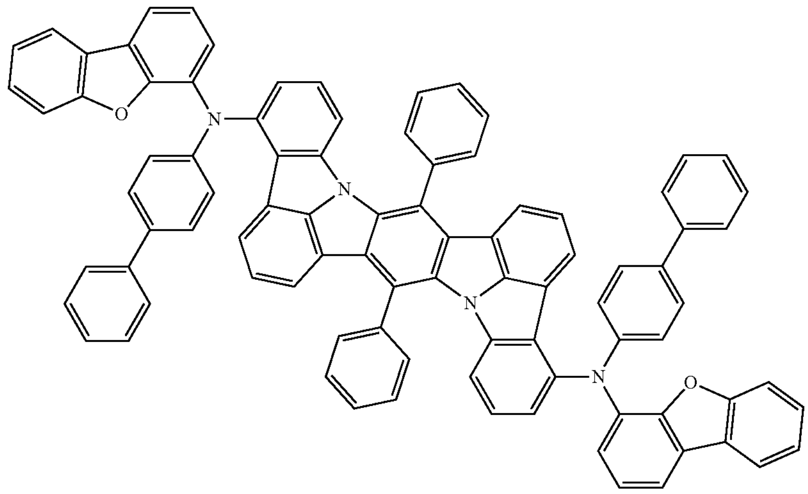
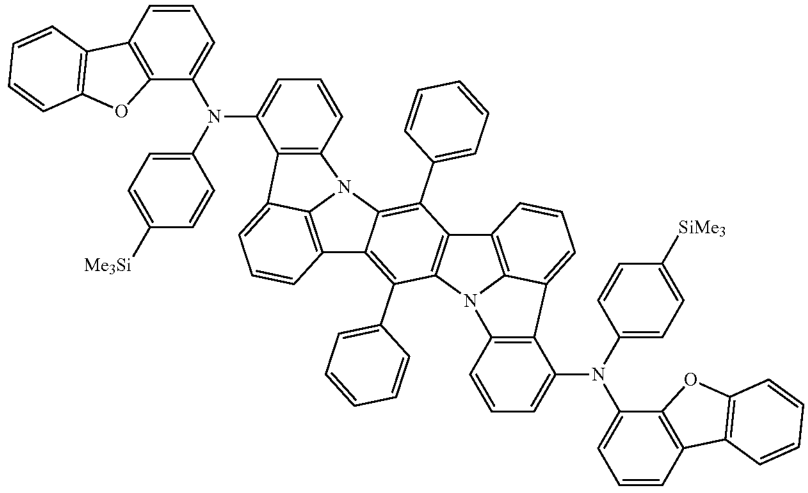

-continued
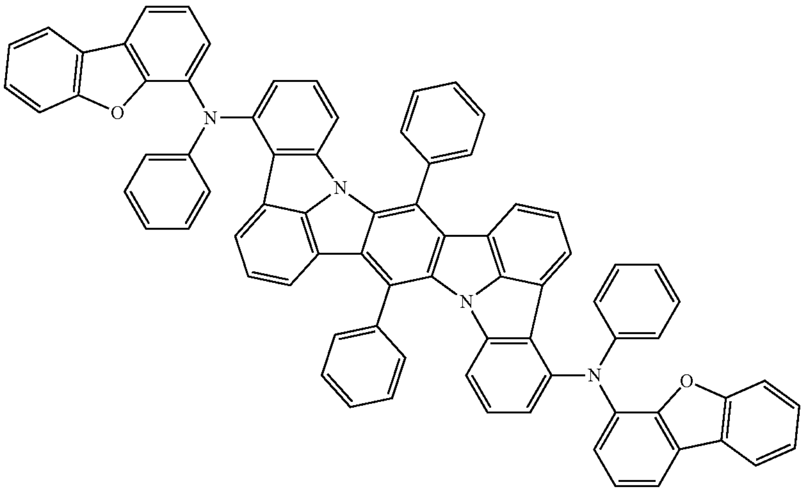
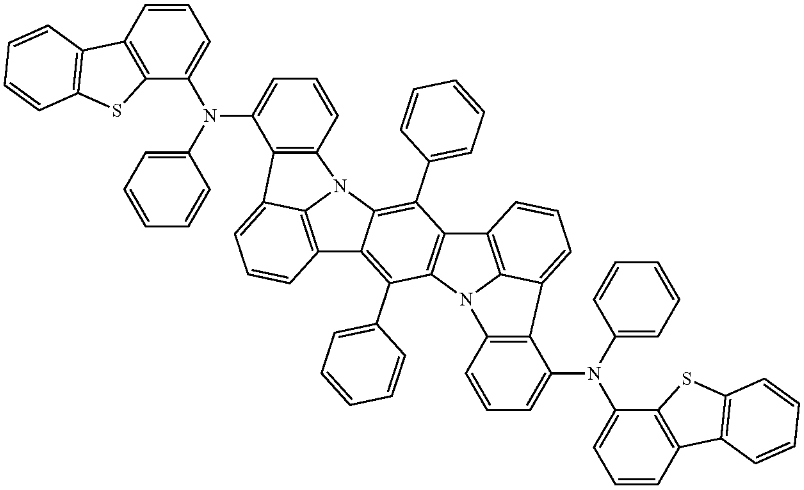
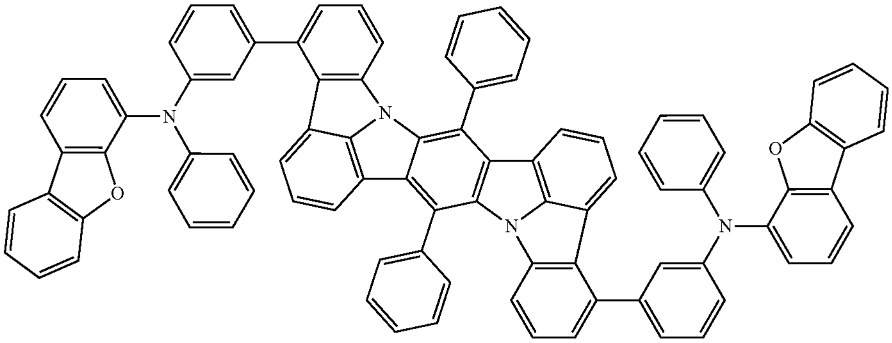
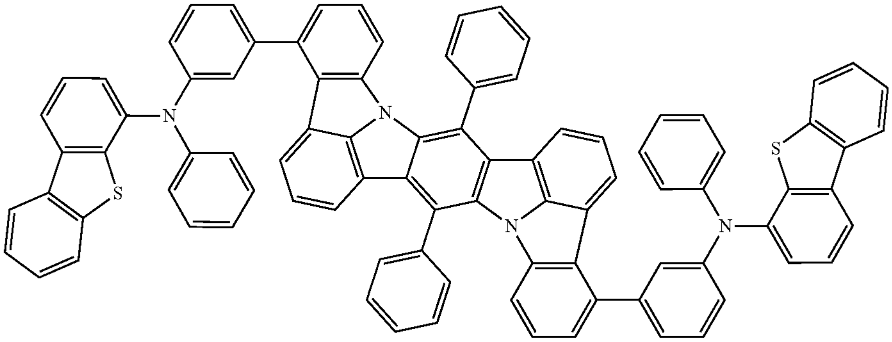

-continued
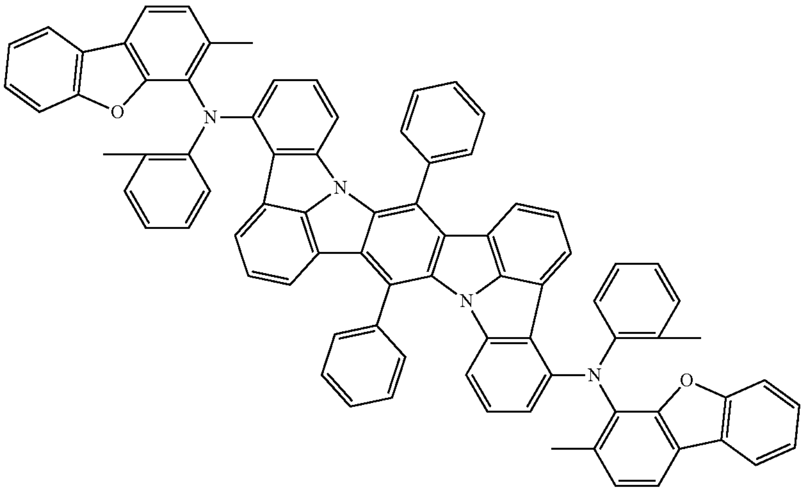
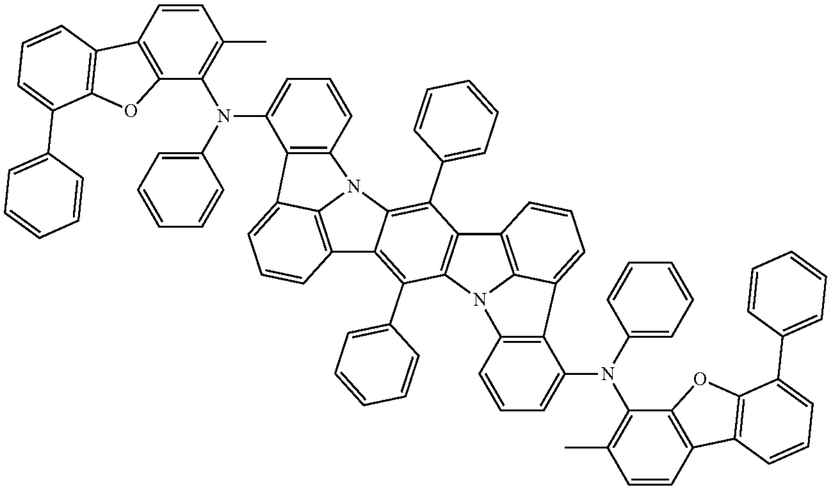
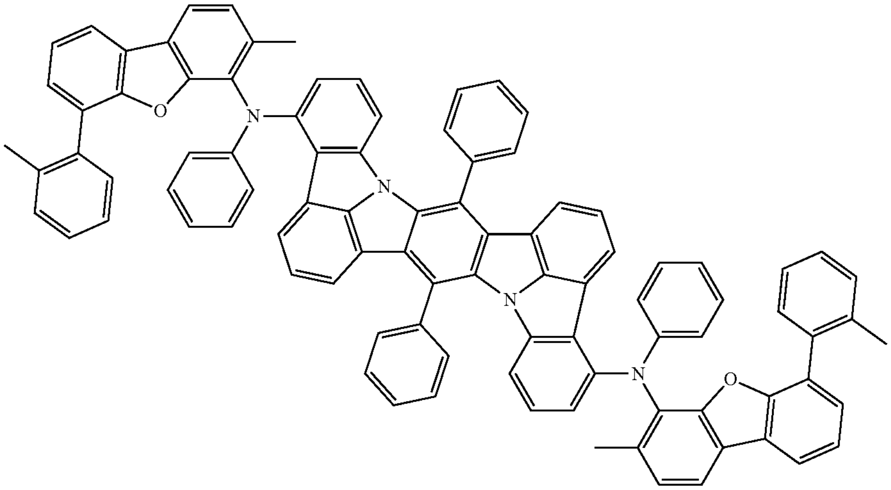

-continued
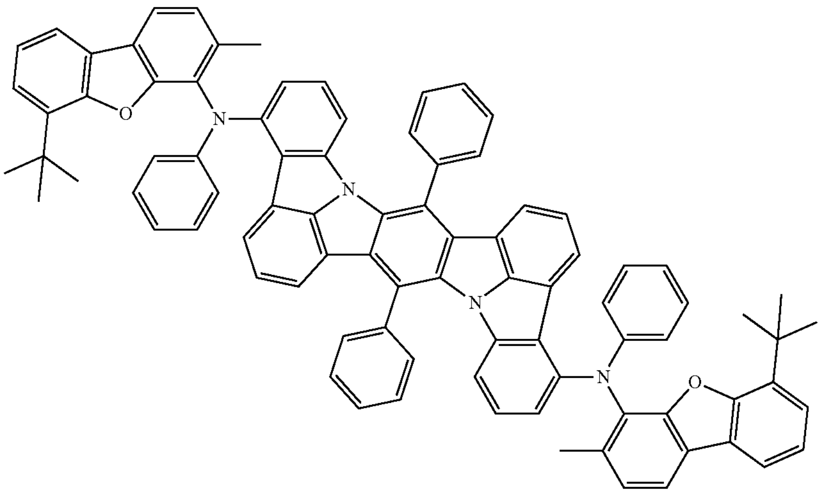
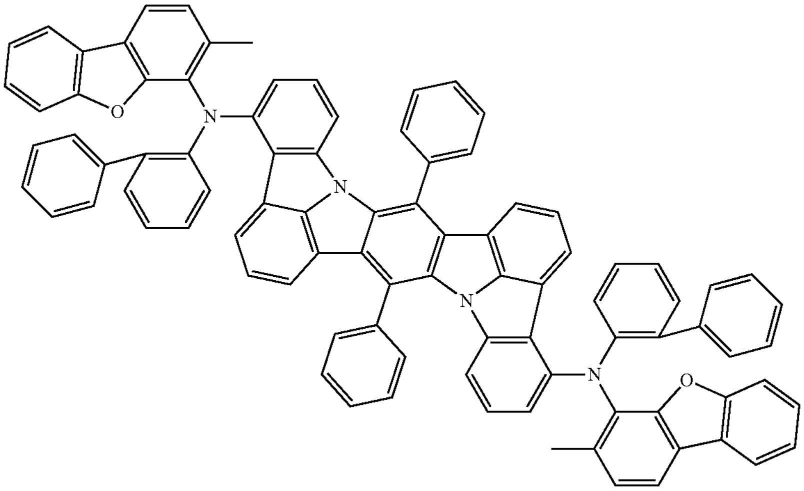
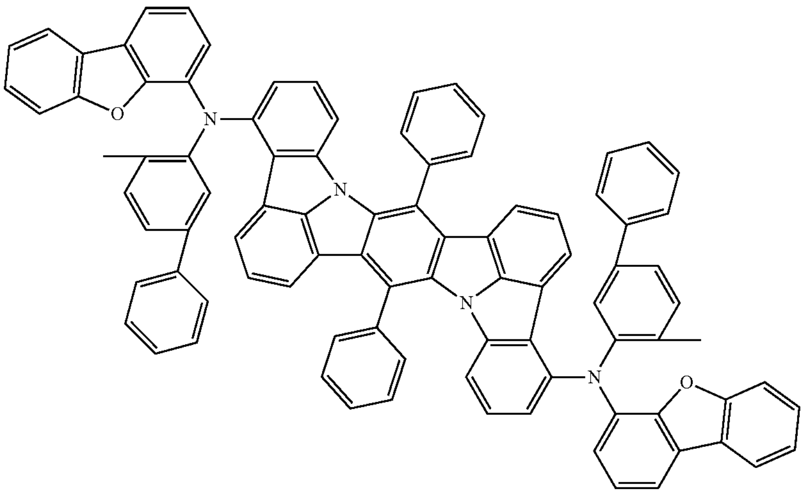

-continued
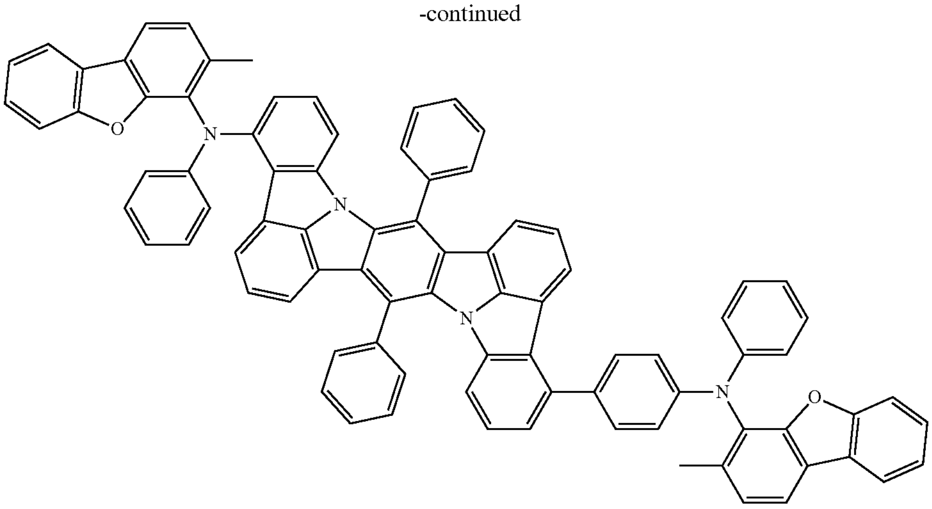
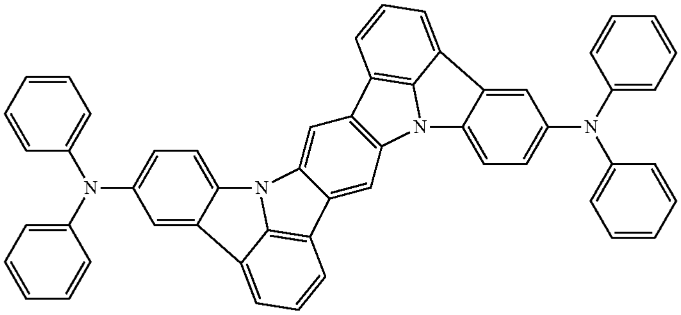
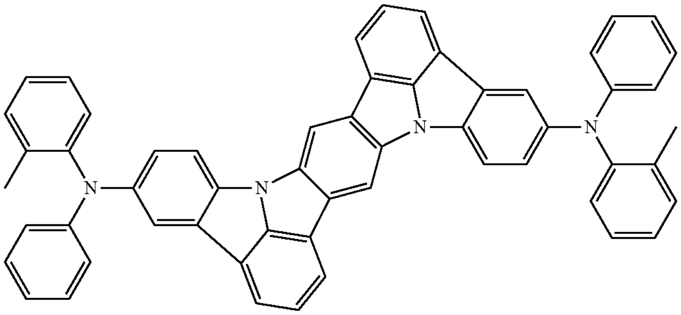
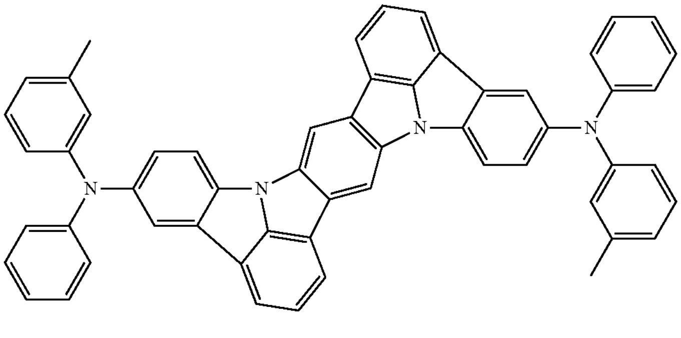

-continued
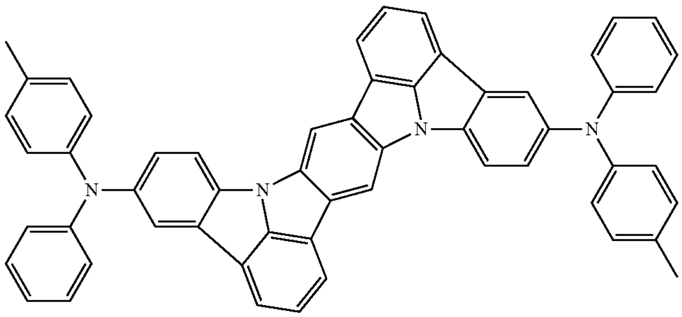
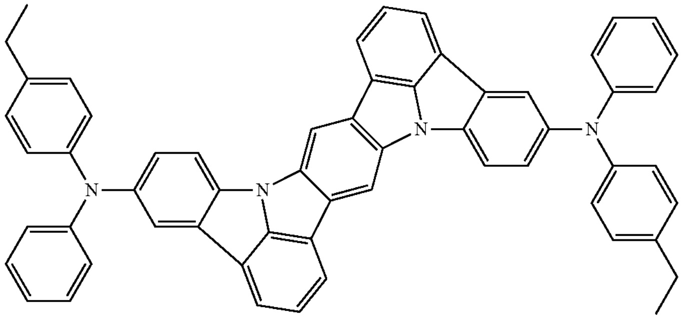
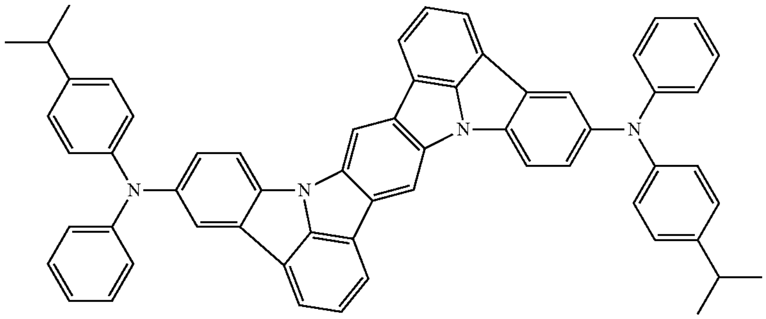
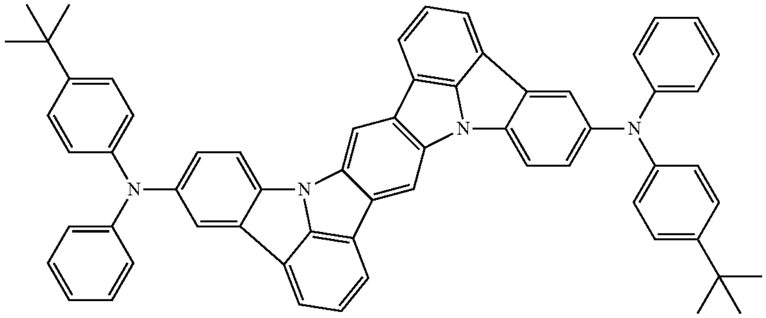
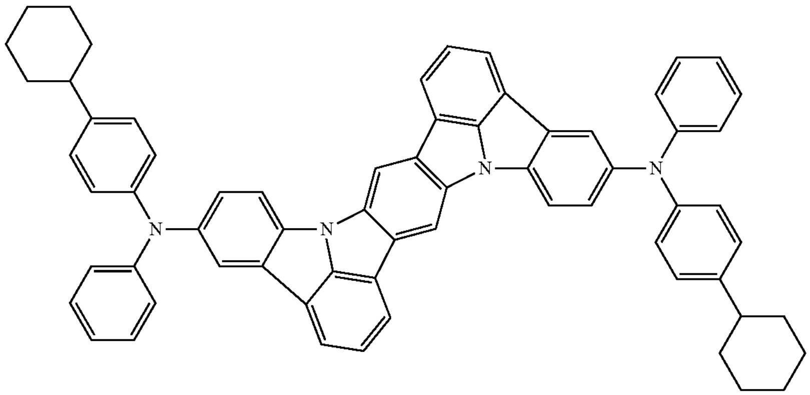

-continued
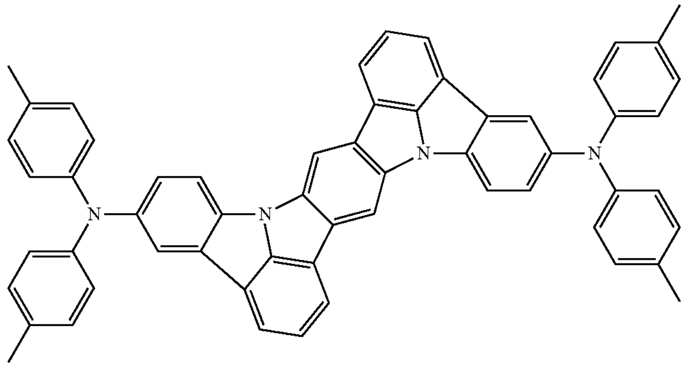
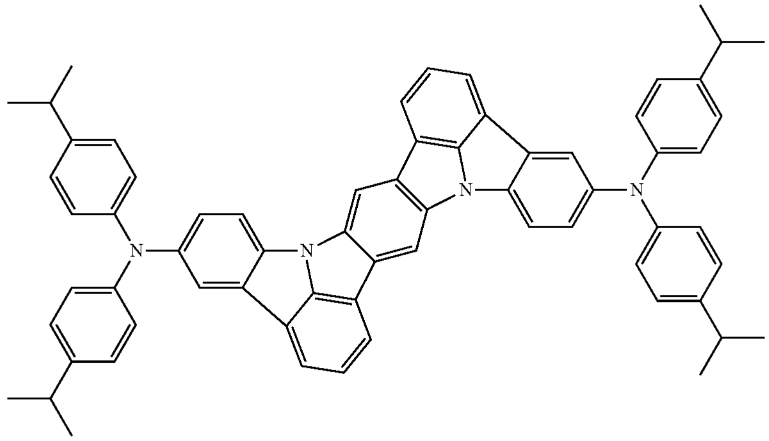
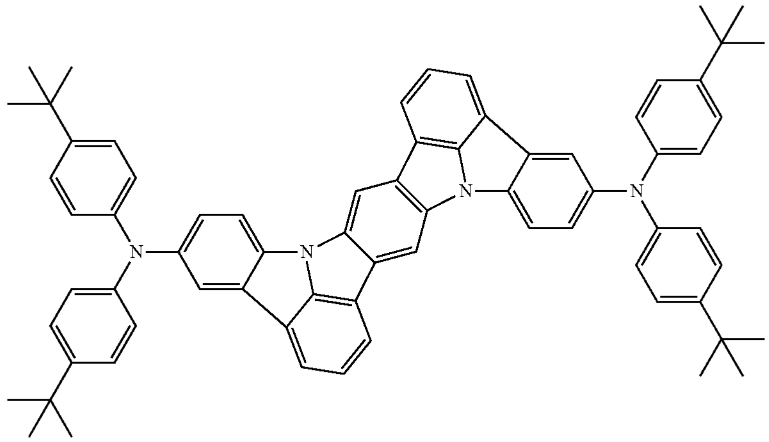

-continued
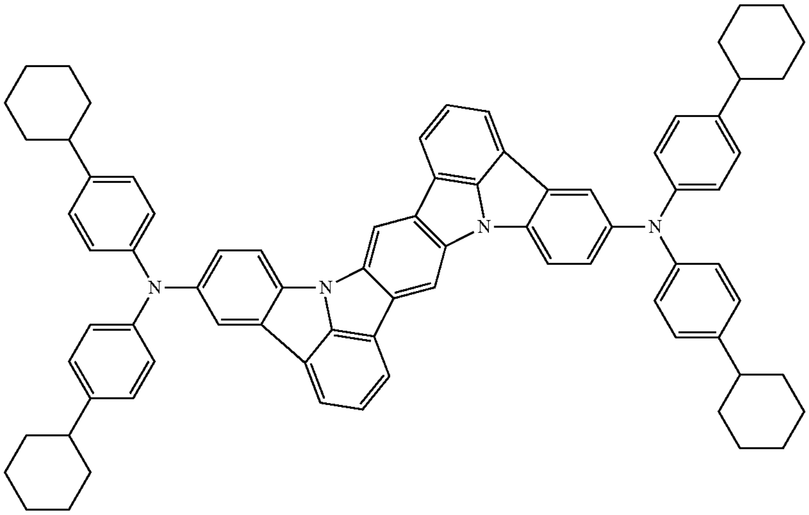
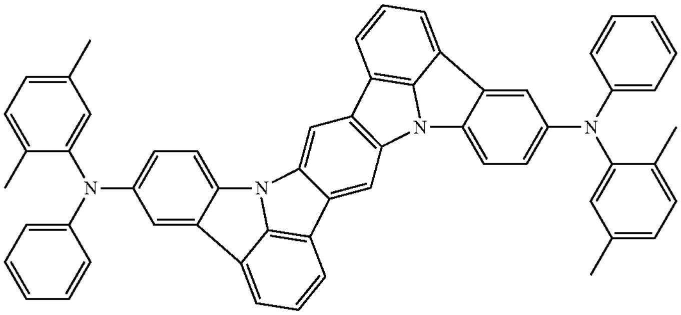
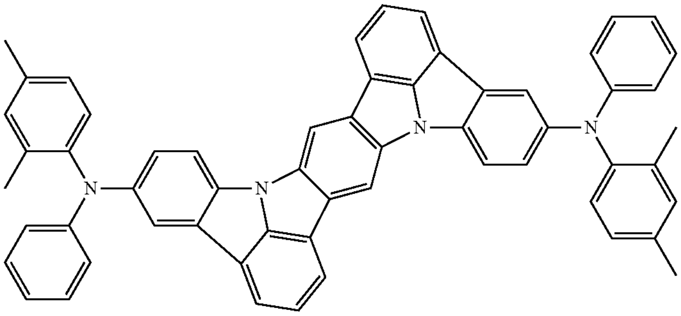
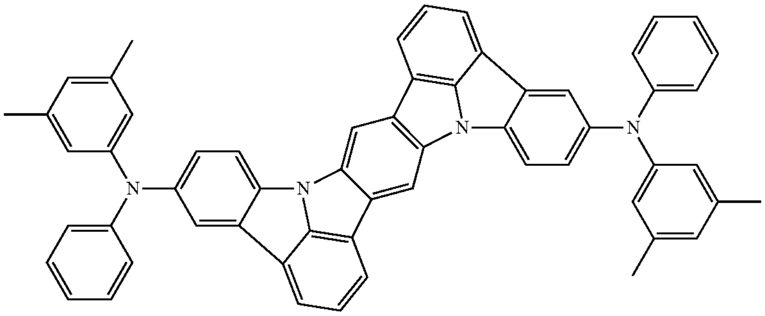

-continued
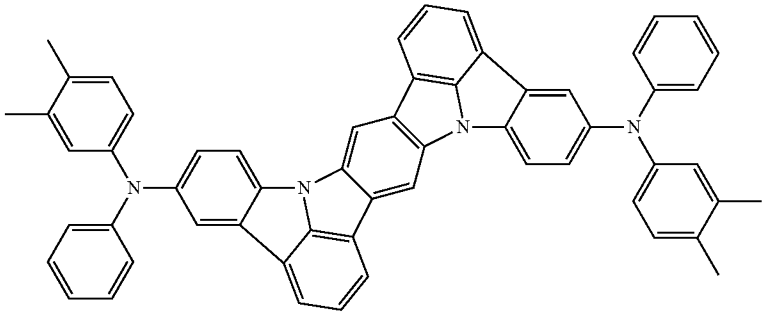
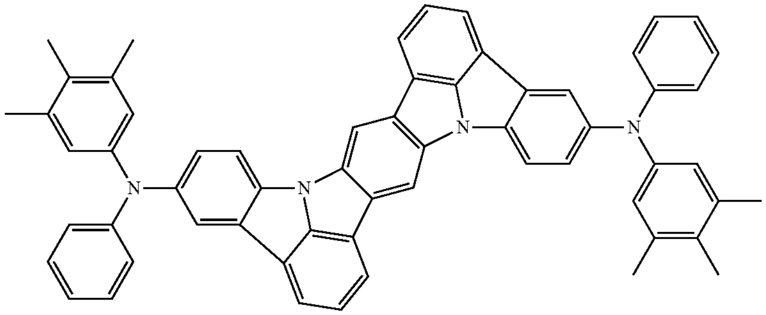
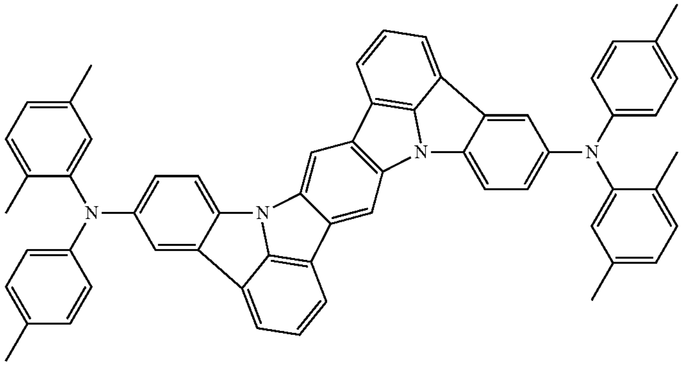
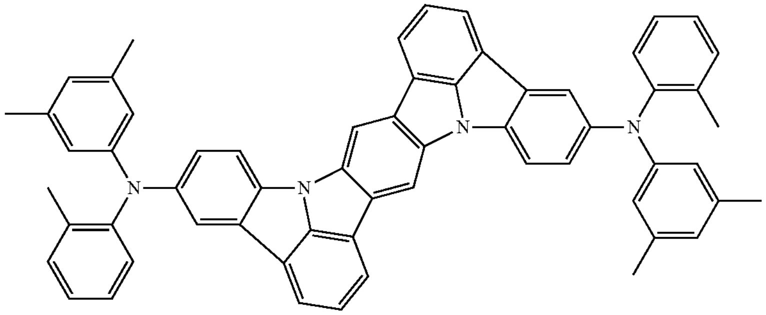
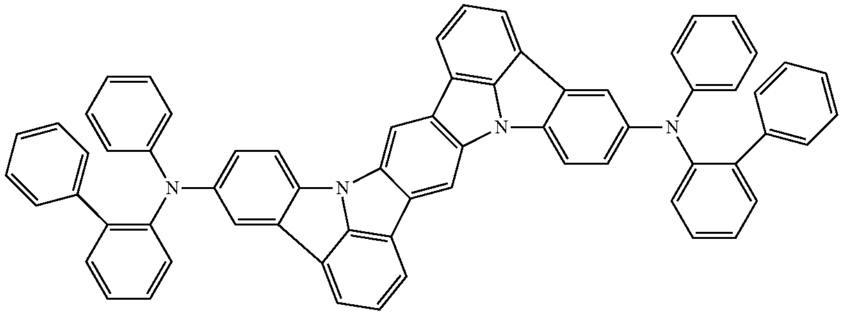

-continued
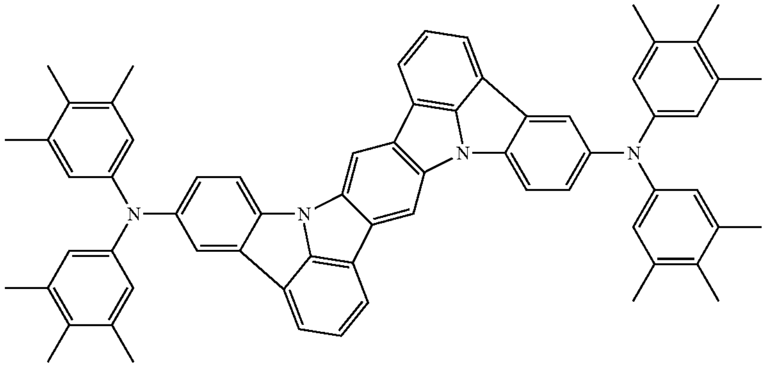
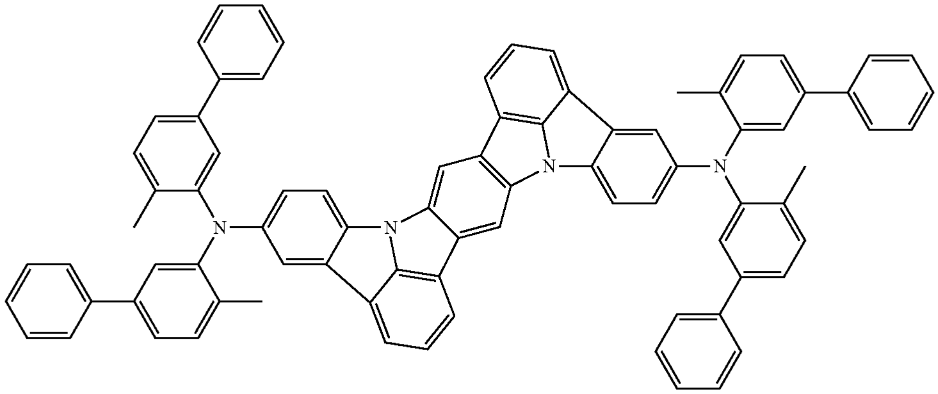
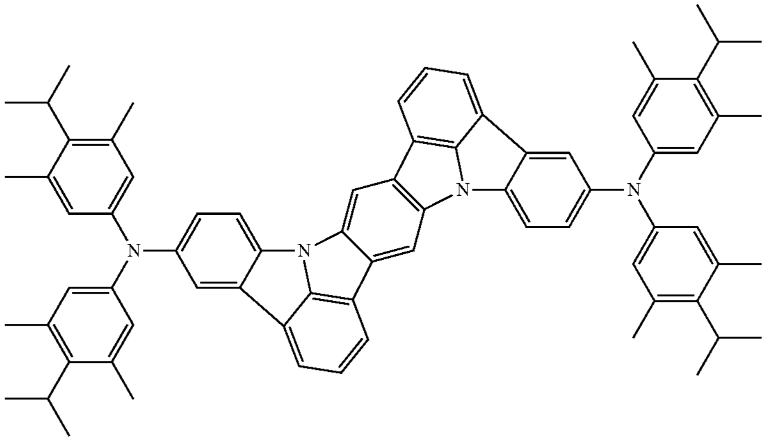
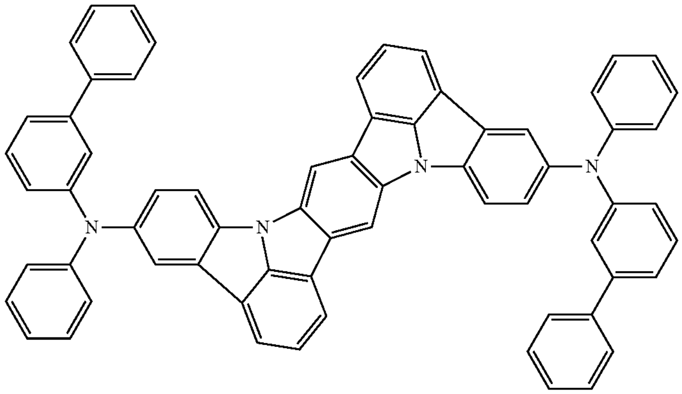

-continued
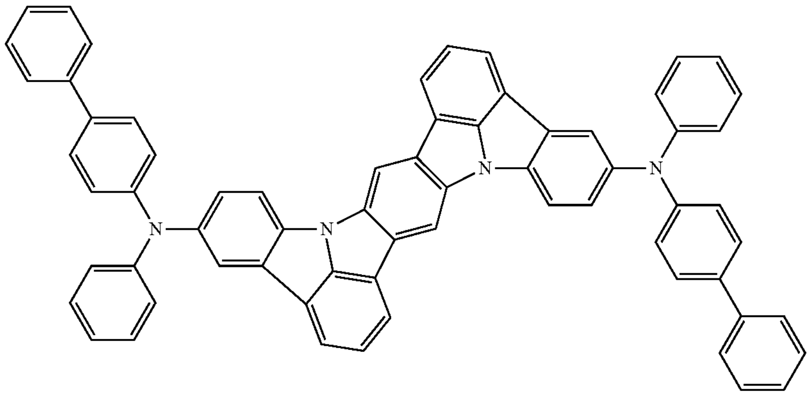
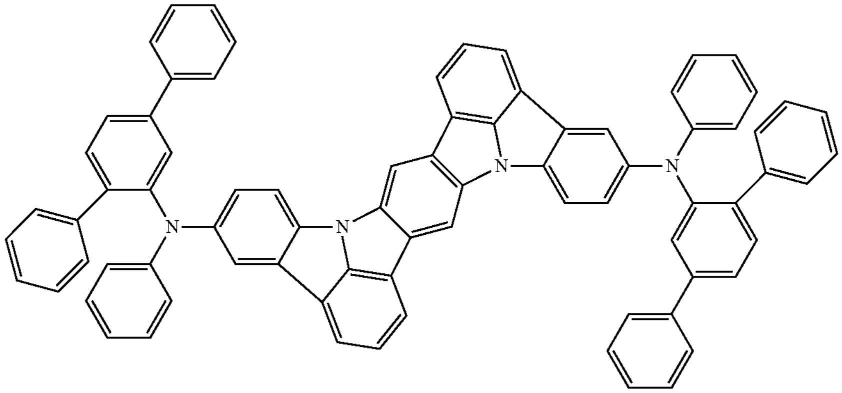
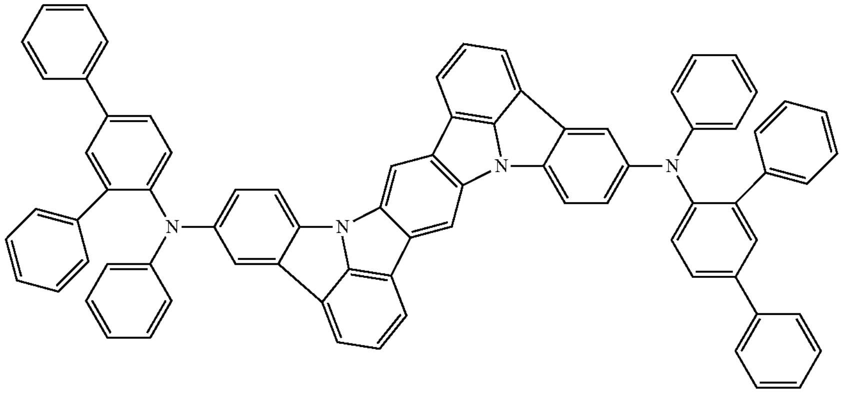
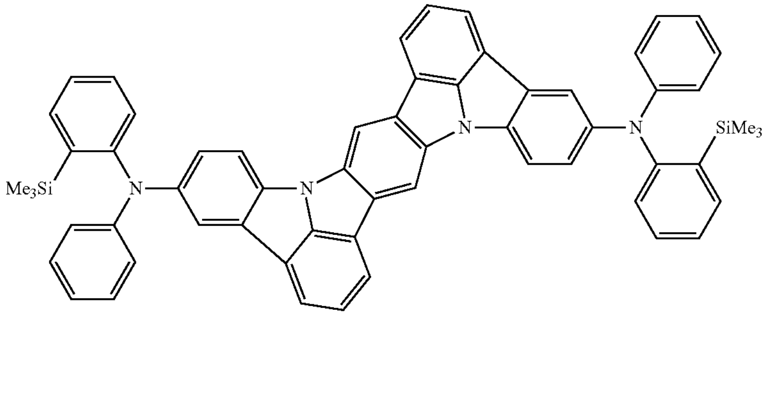

-continued
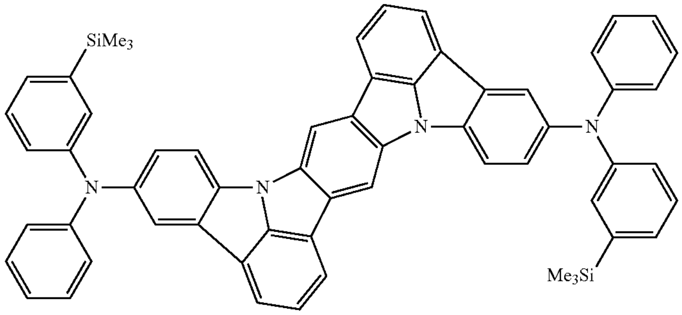
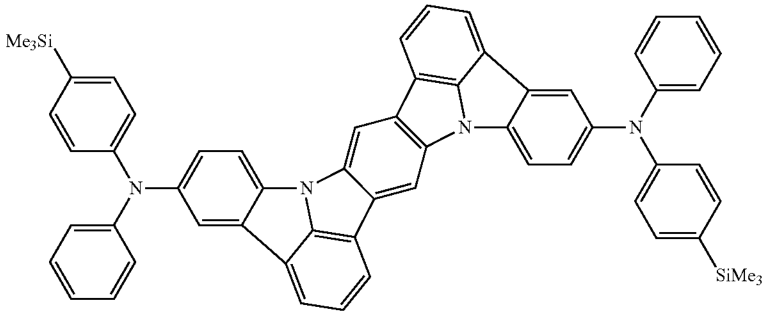
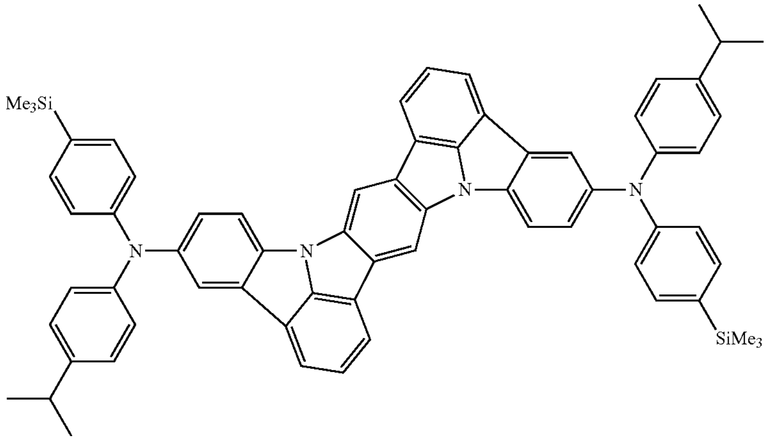
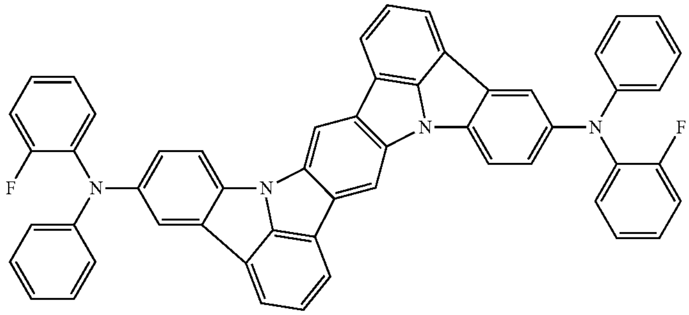
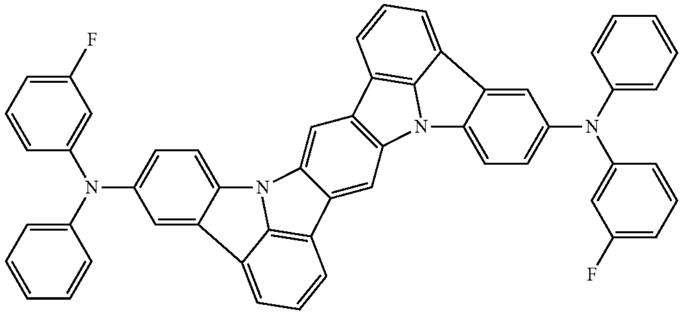

-continued
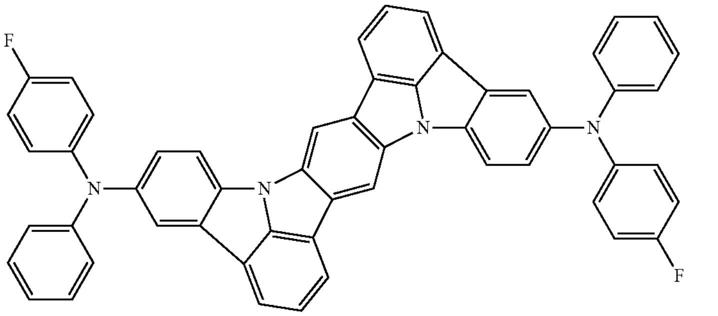
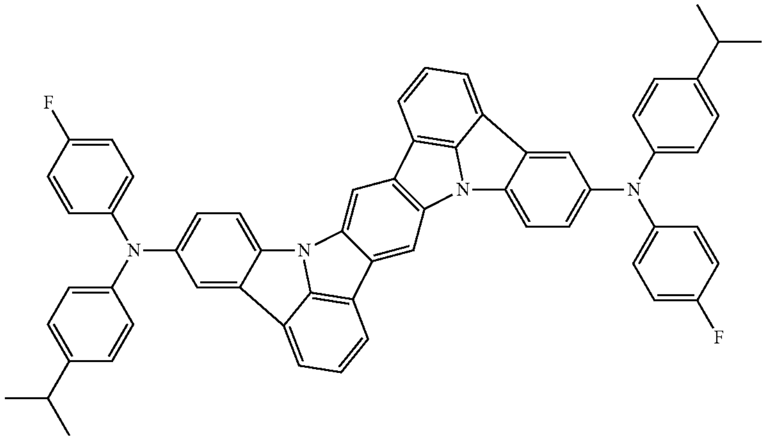
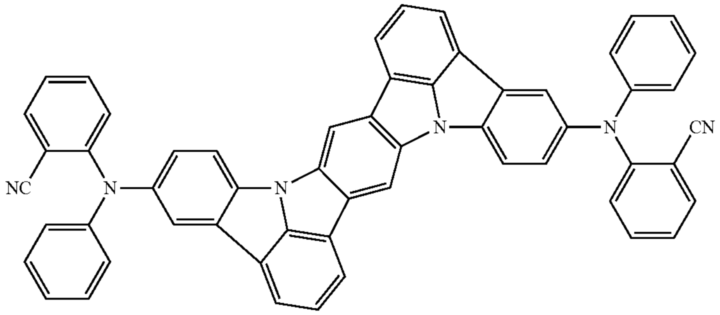
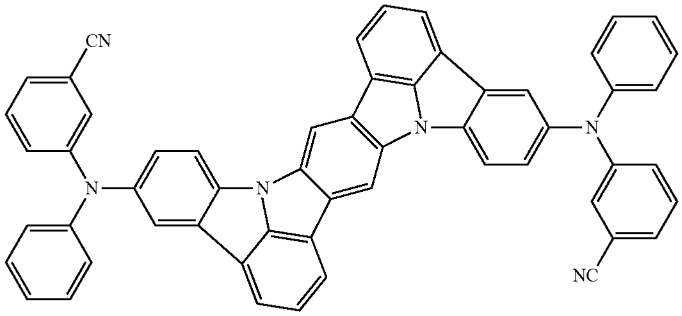
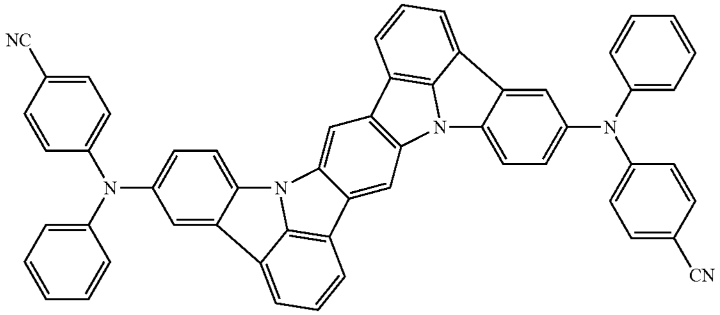

-continued
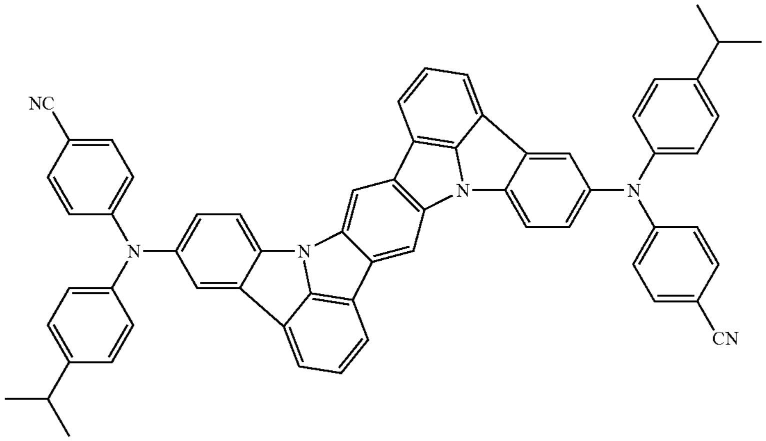
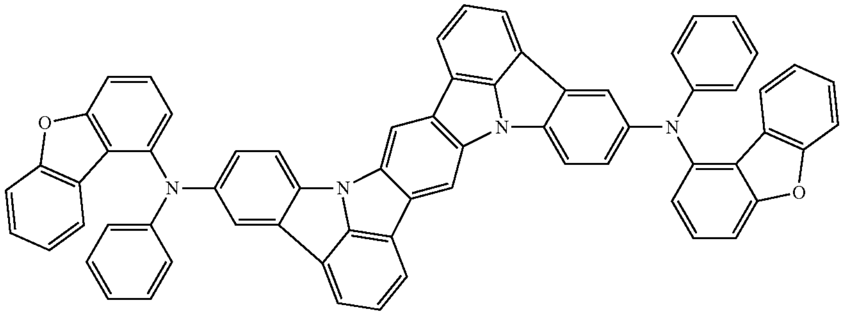
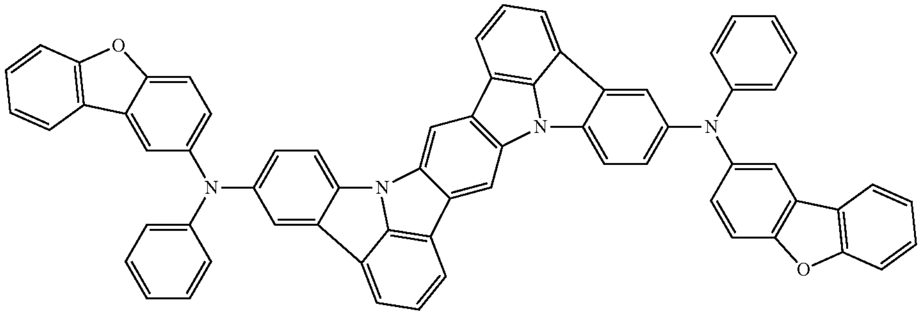
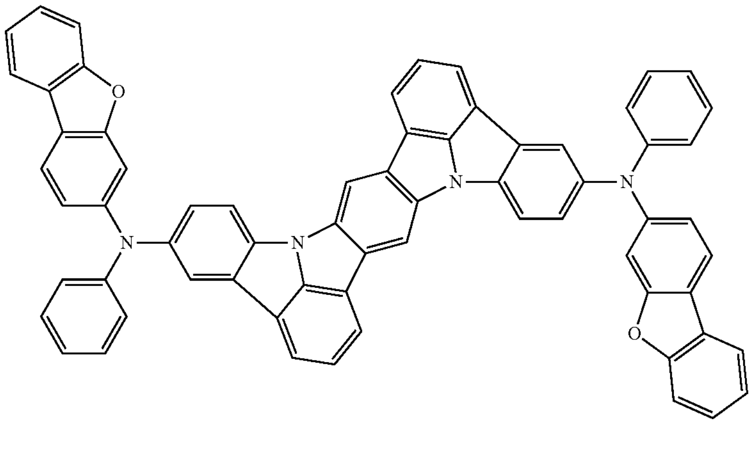

-continued
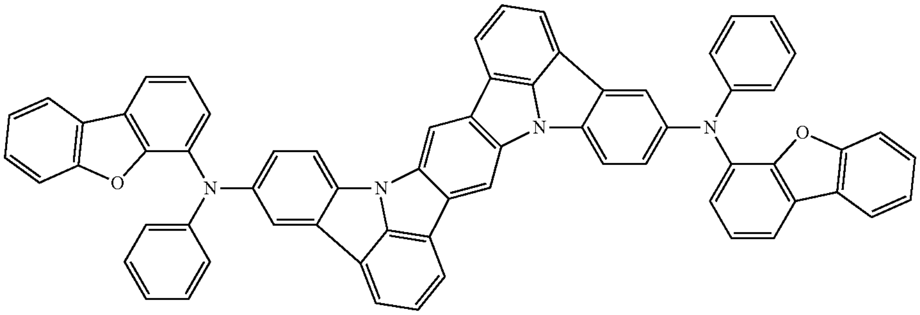
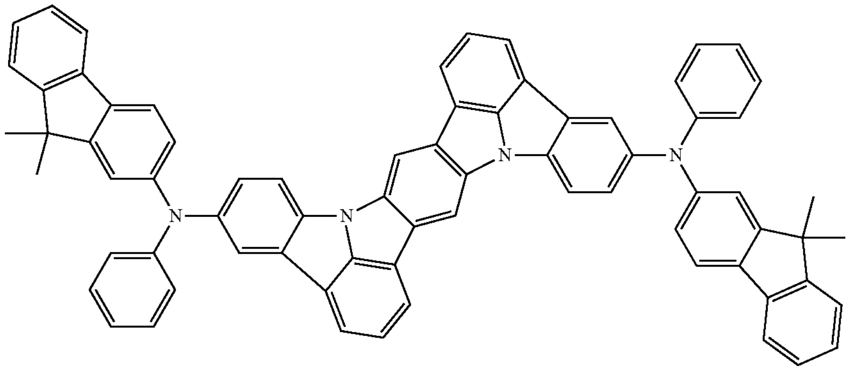
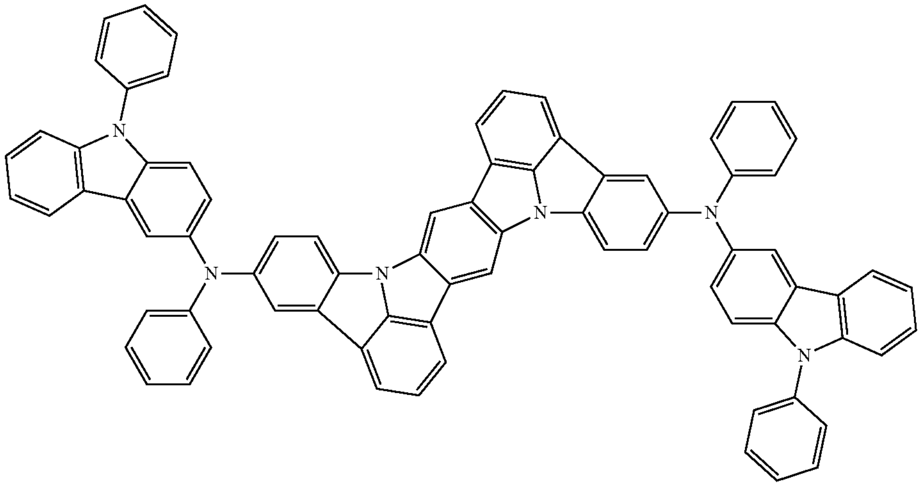
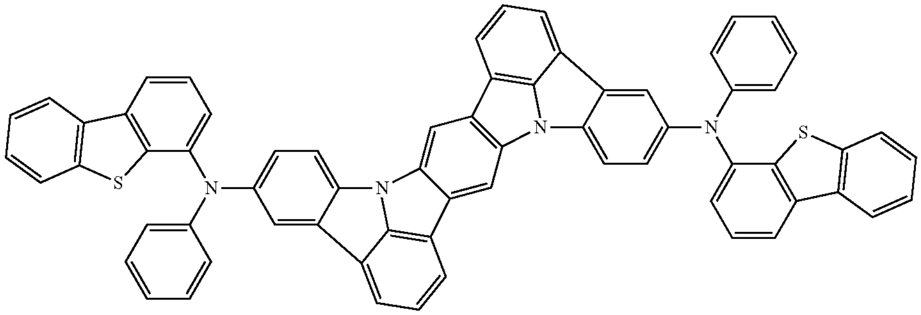

-continued
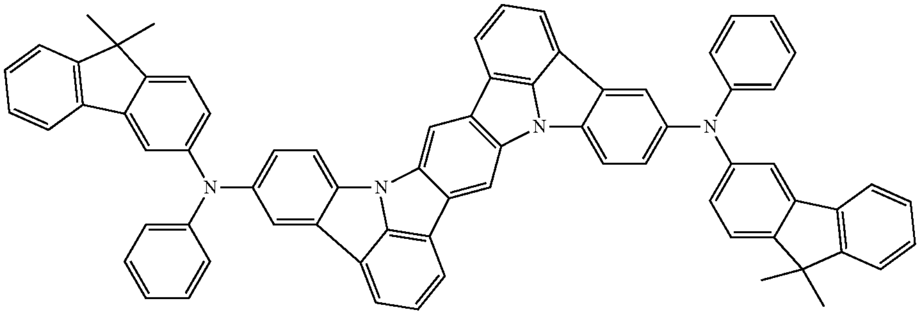
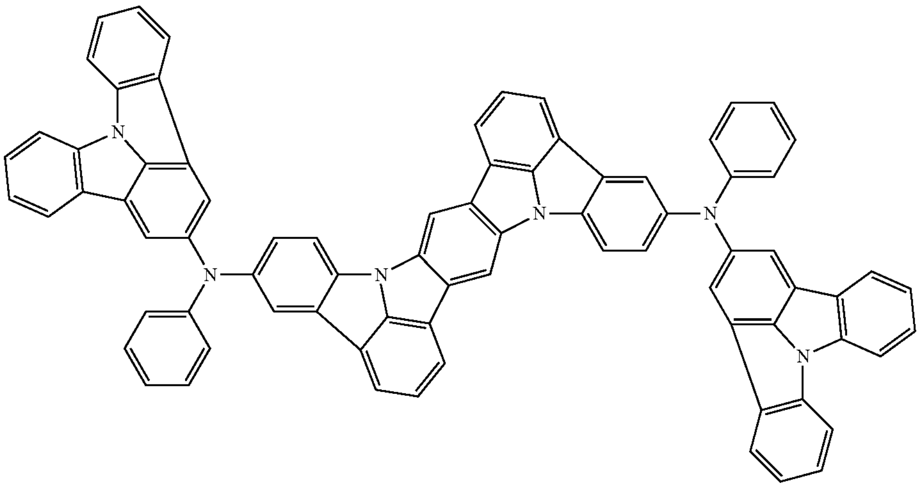
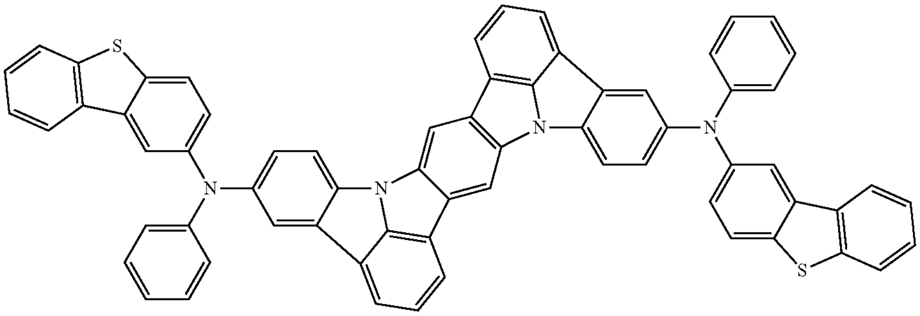
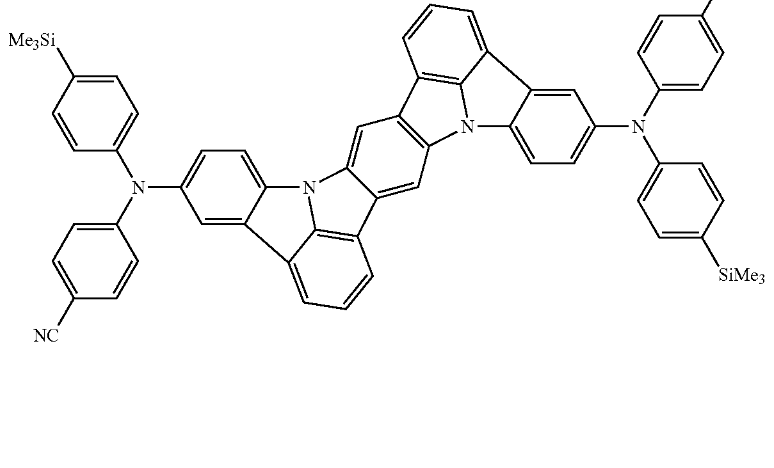

-continued
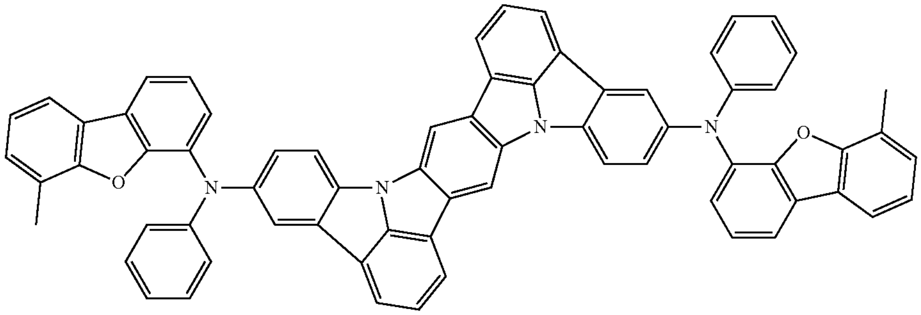
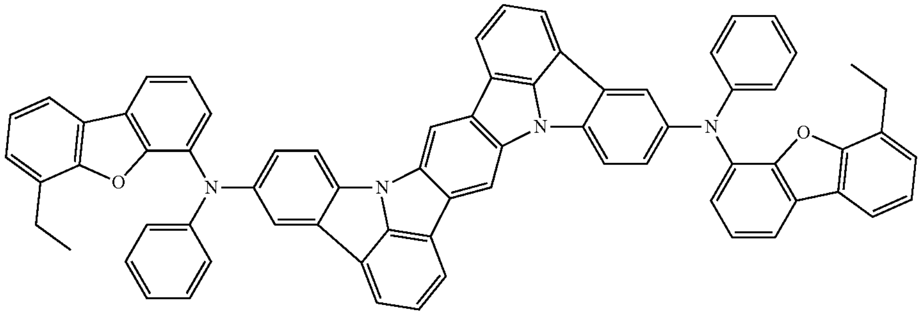
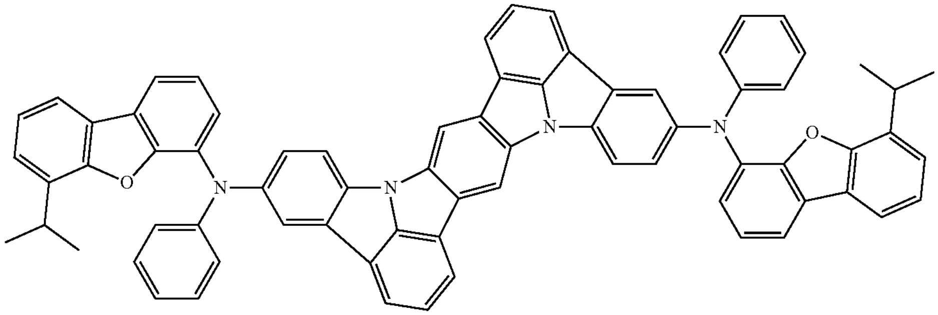
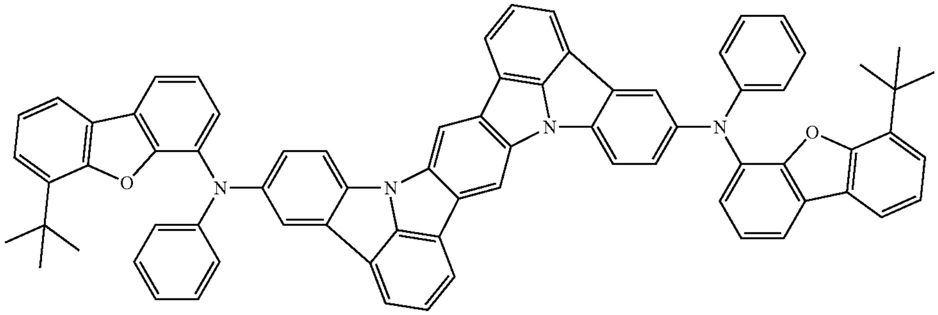
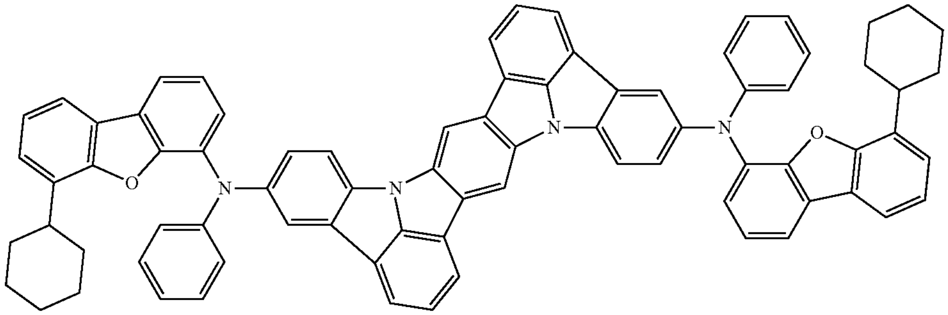

-continued
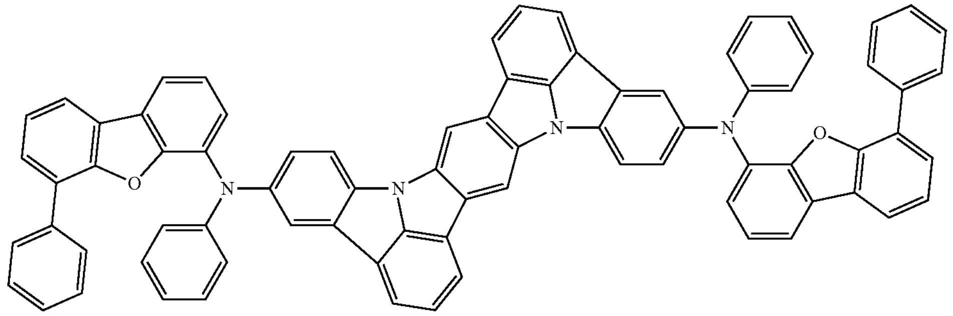
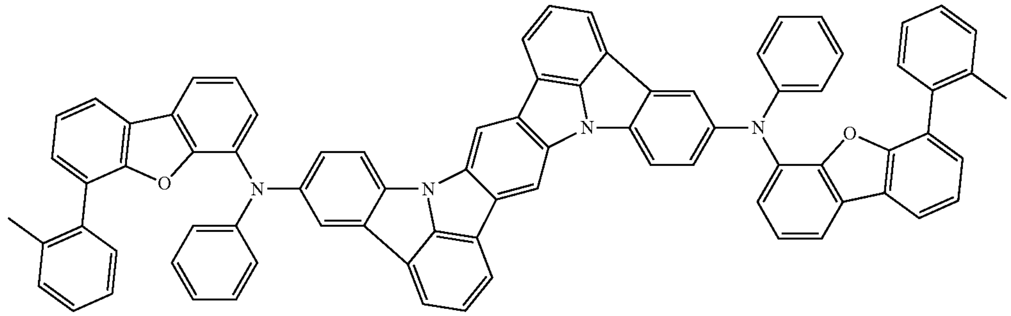
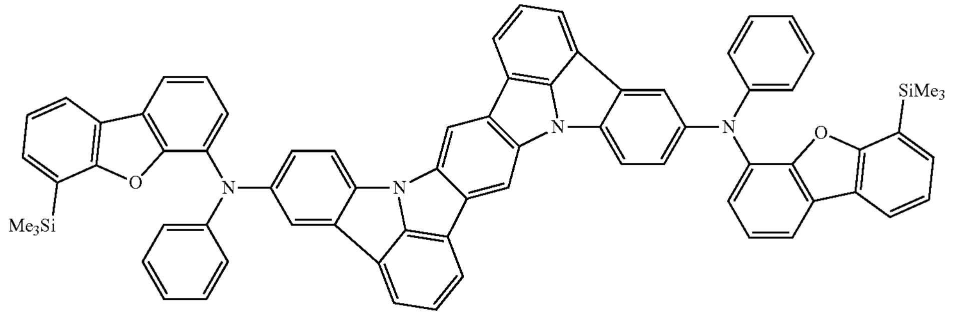
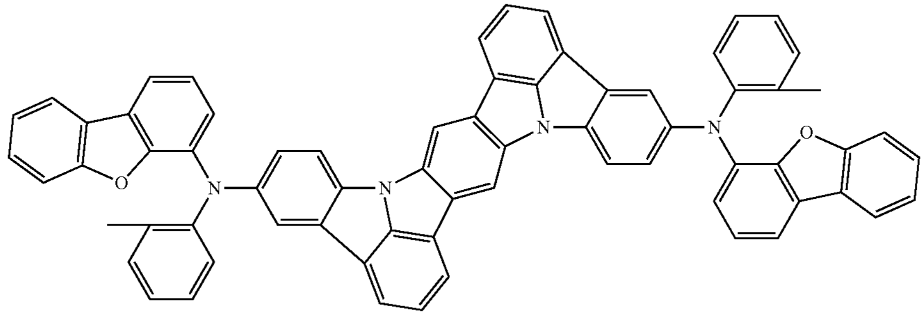
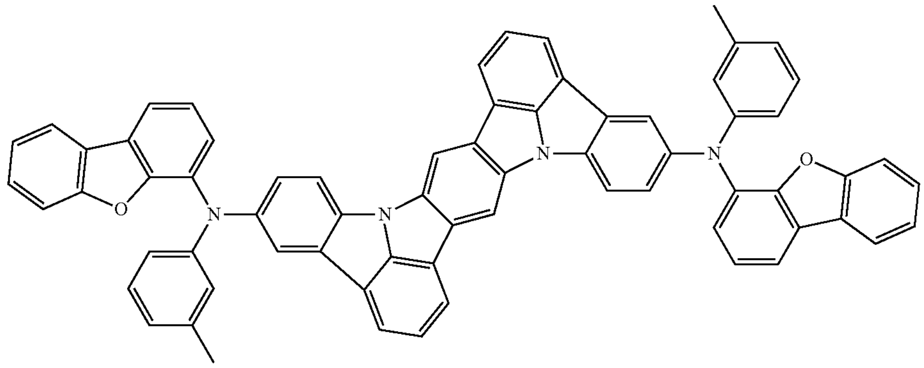

-continued
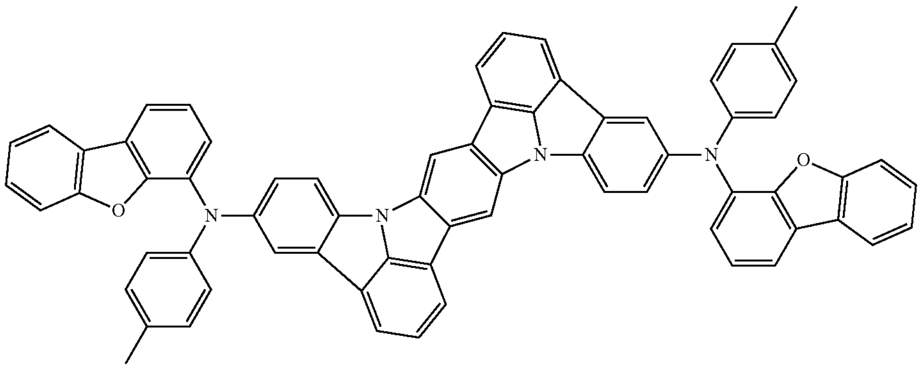
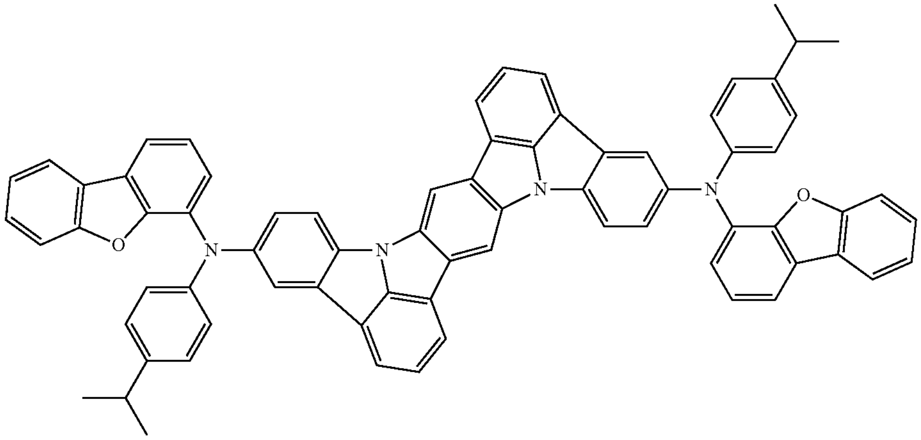
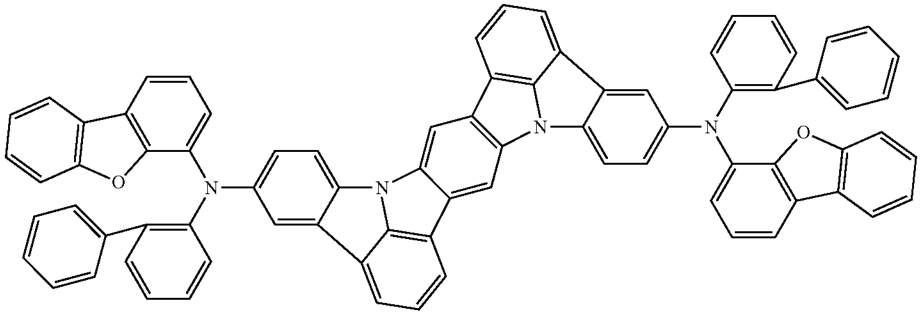
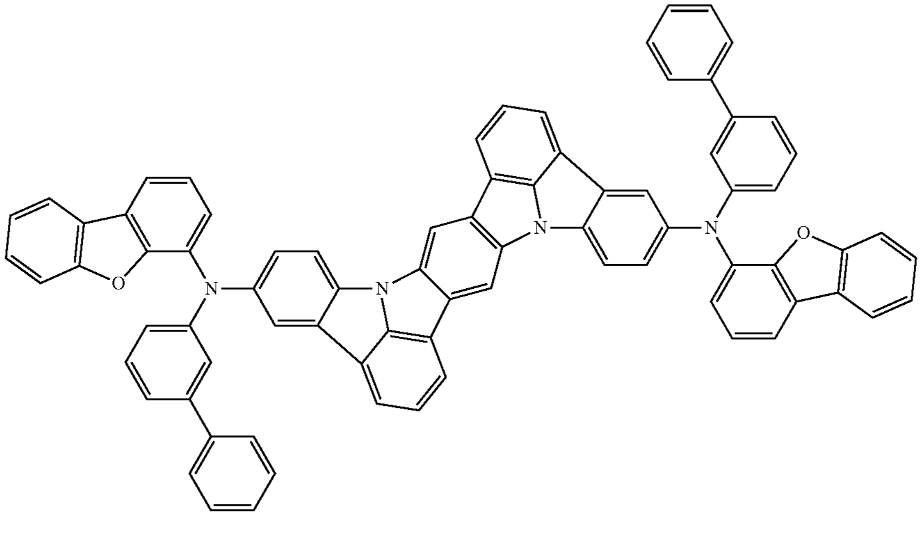

-continued
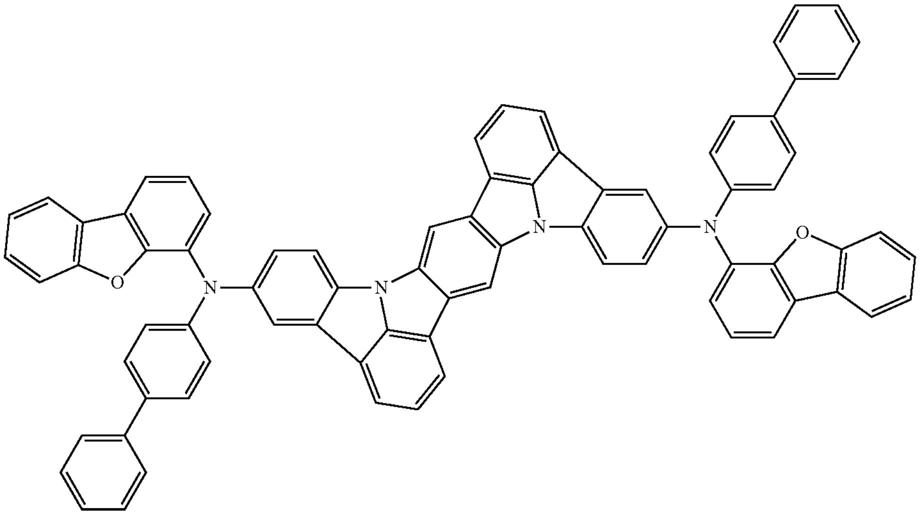
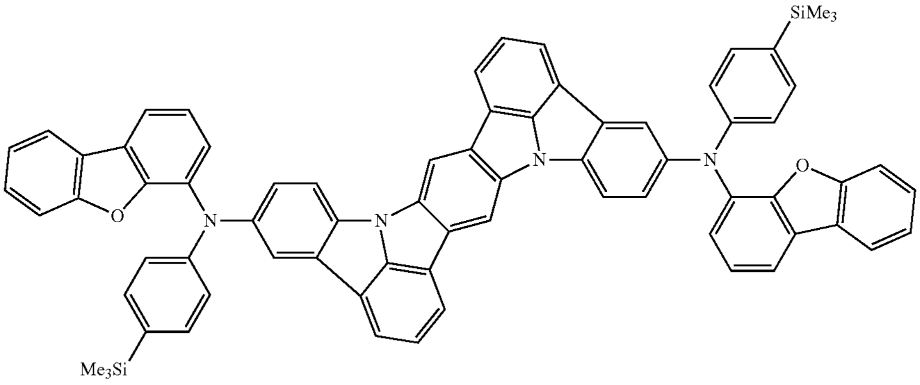
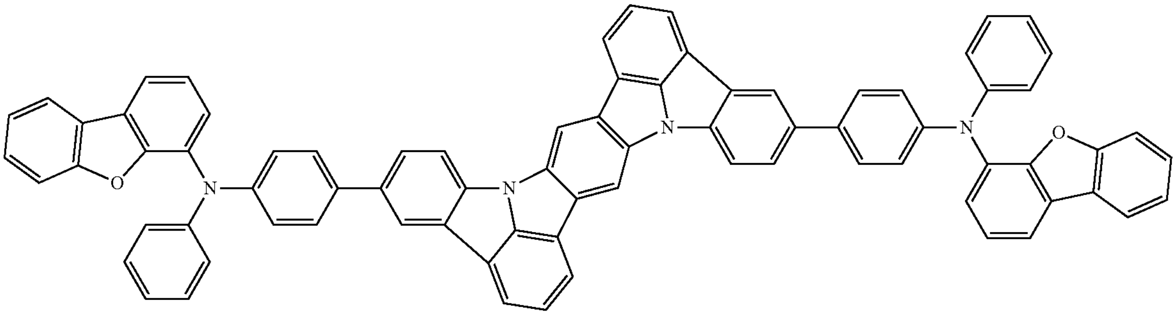
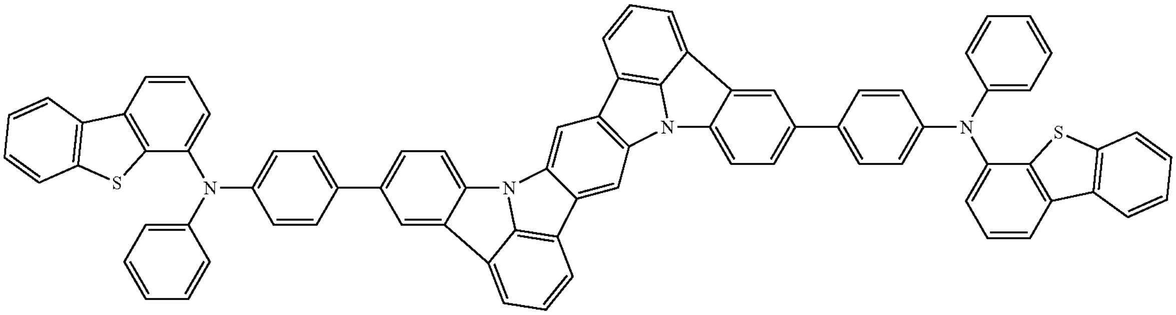

-continued
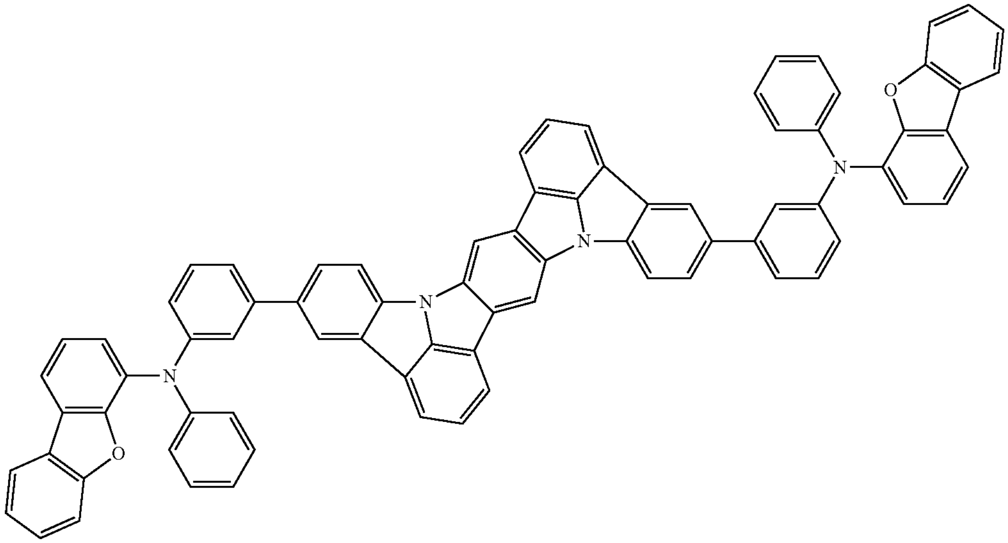
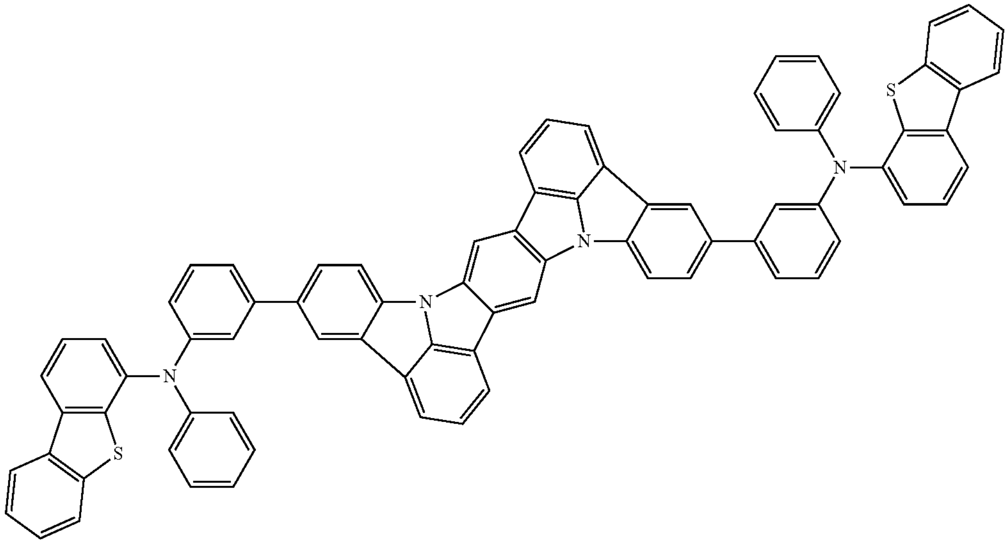
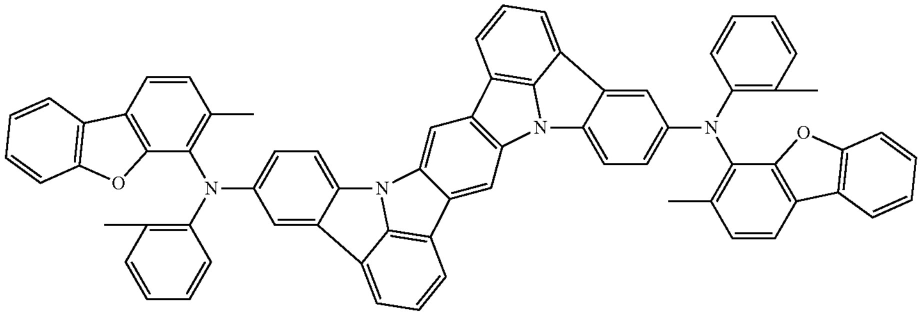
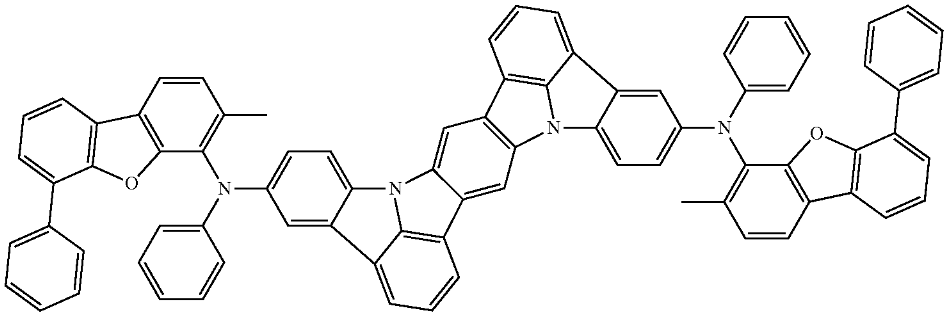

-continued
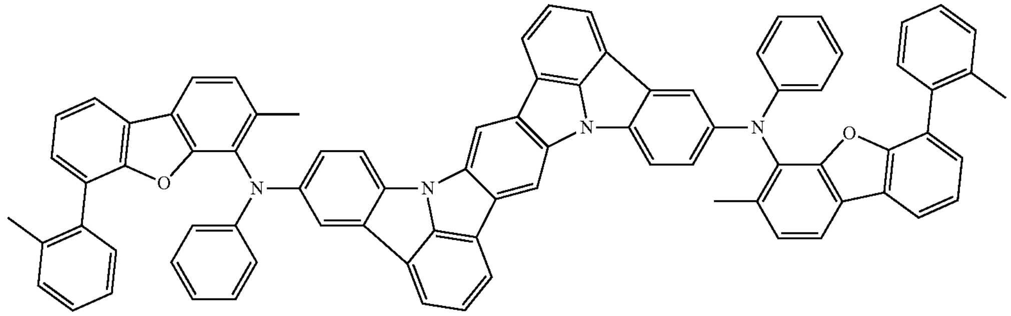
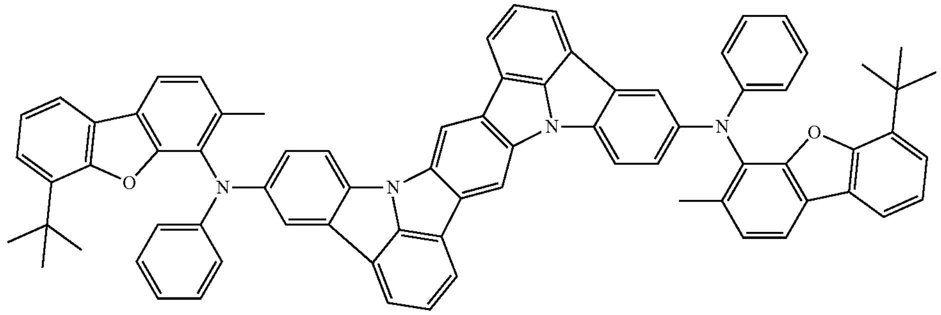
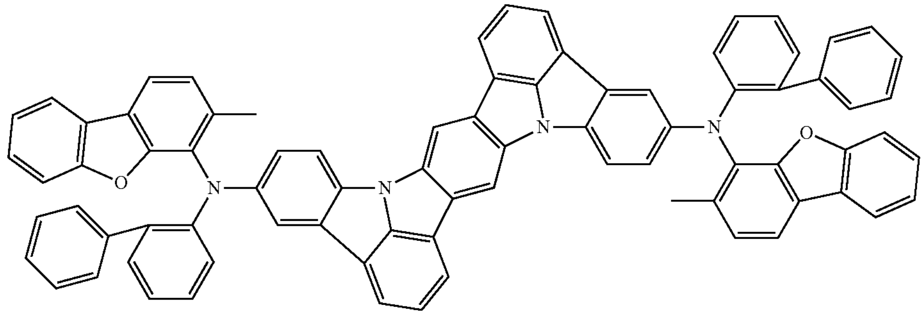
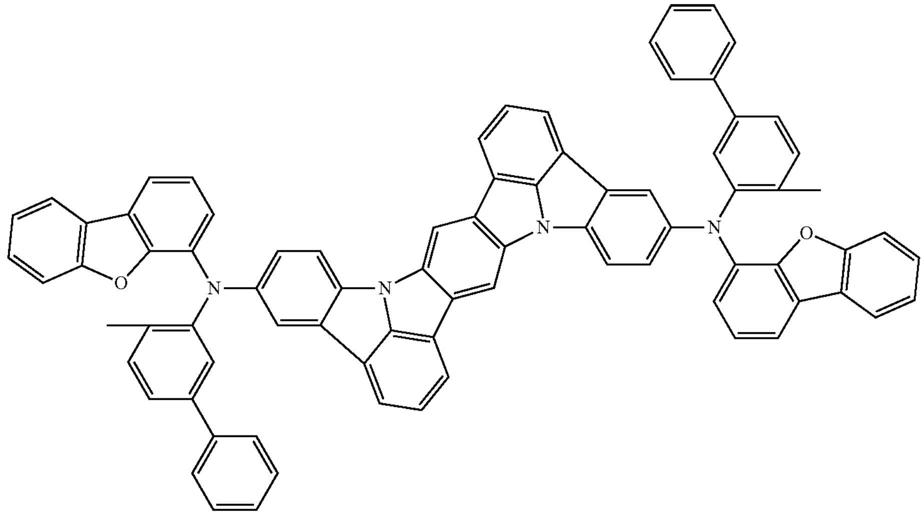

-continued
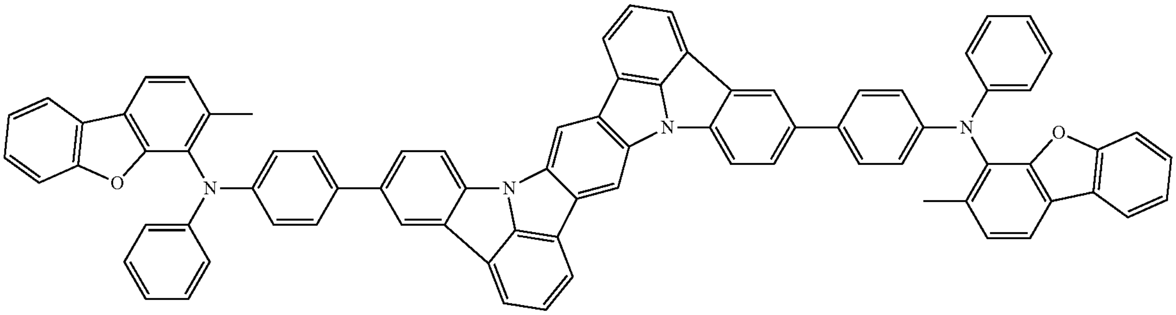
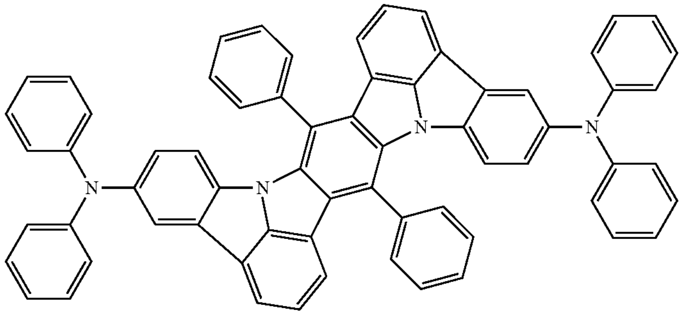
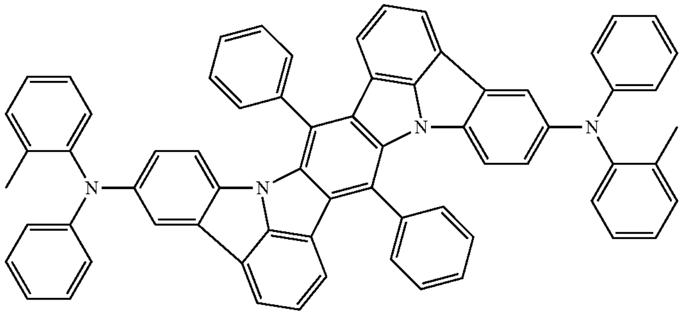
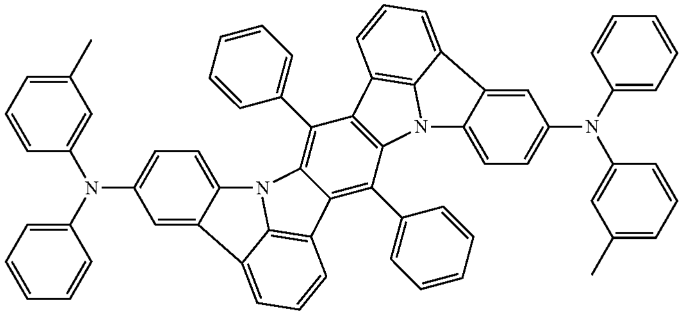
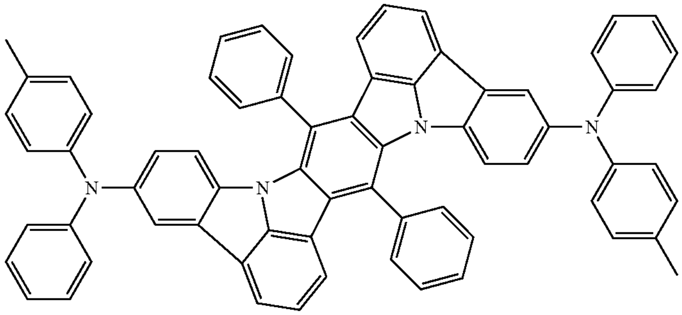

-continued
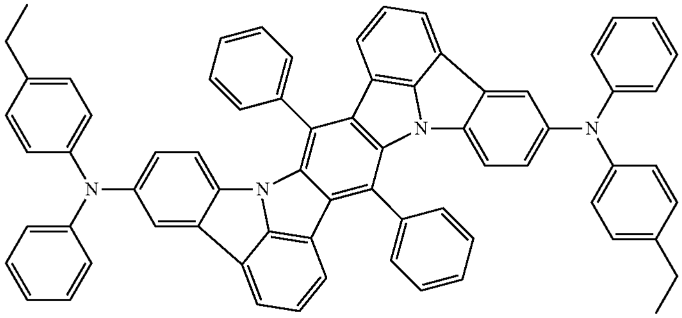
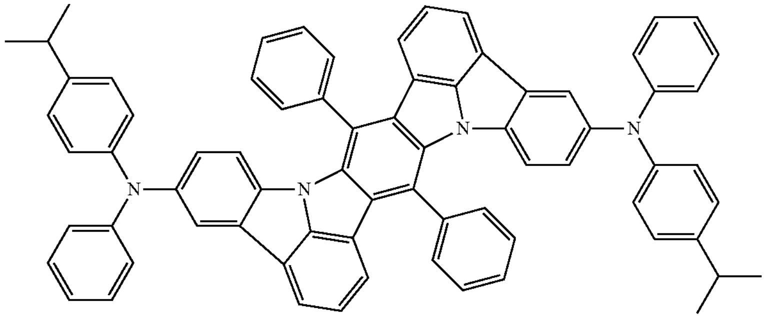
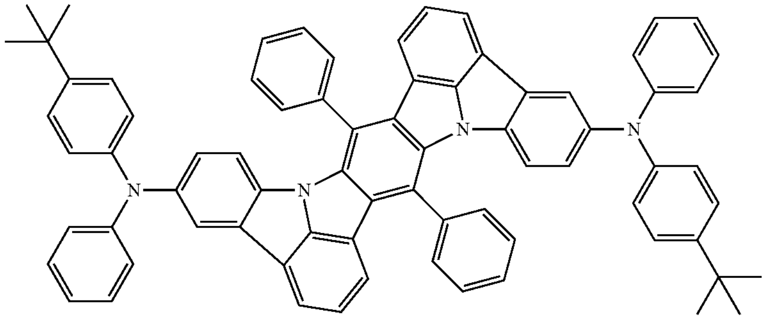
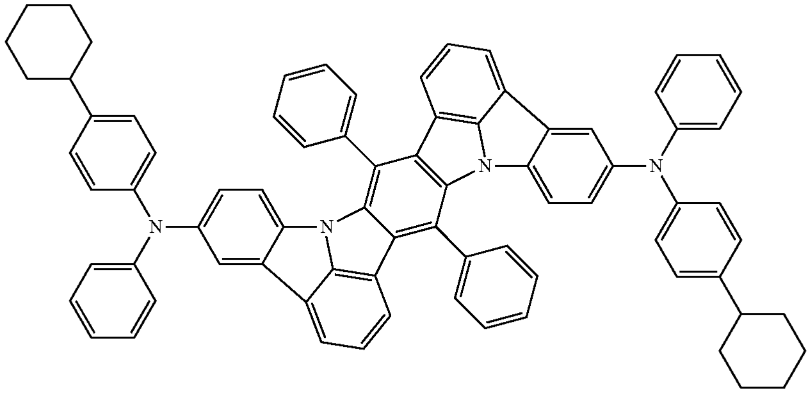
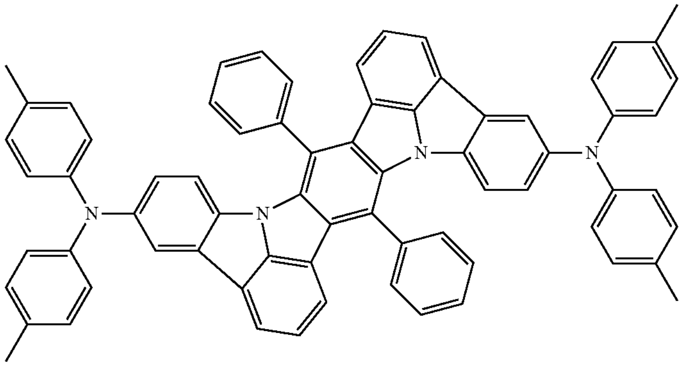

-continued
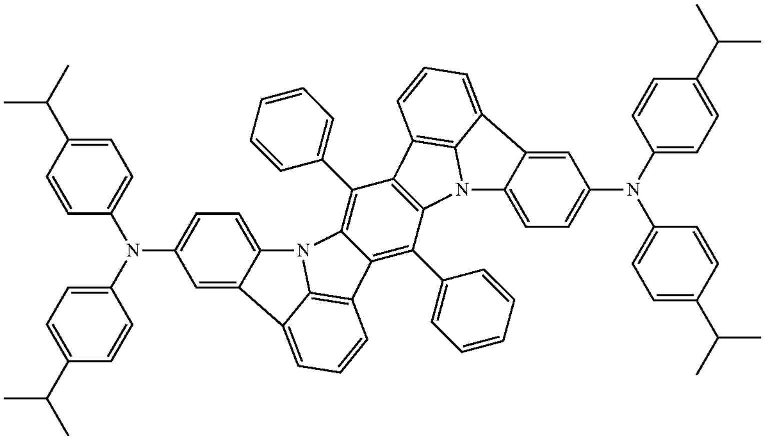
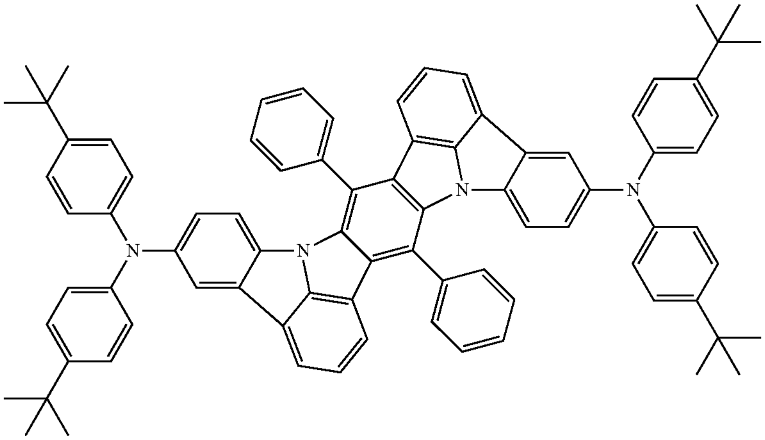
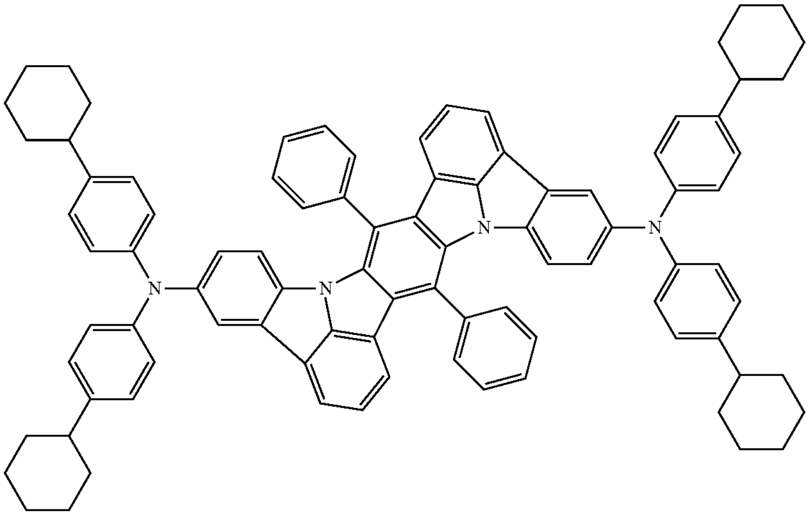
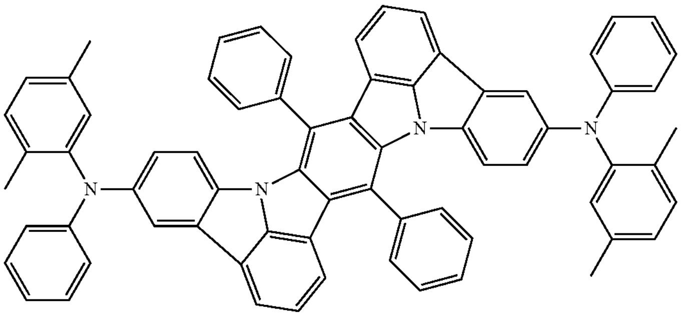

-continued
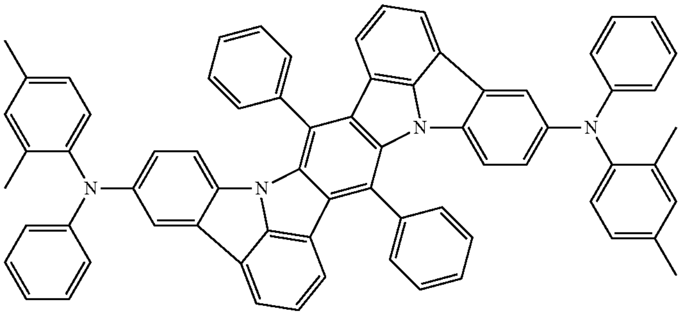
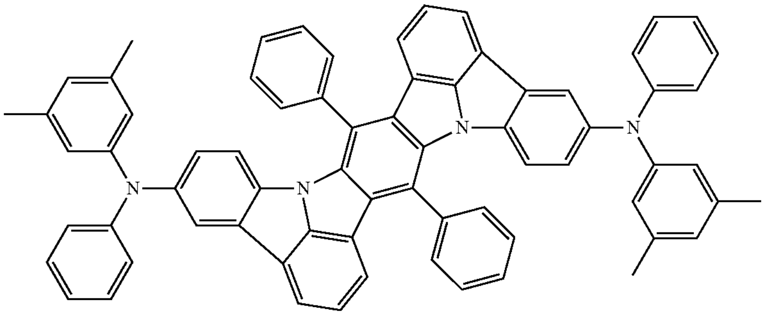
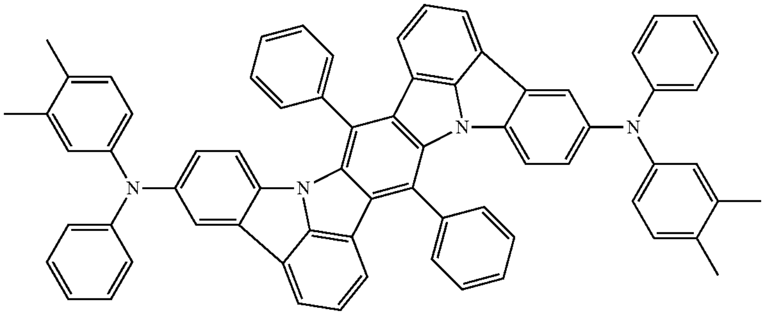
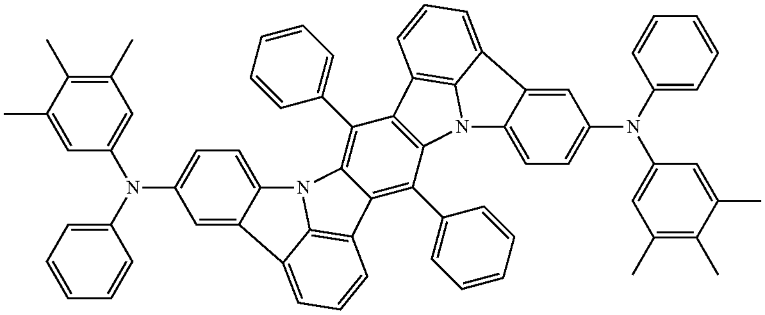
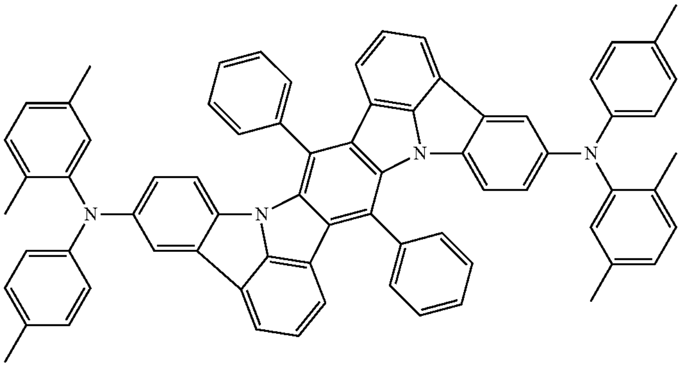

-continued
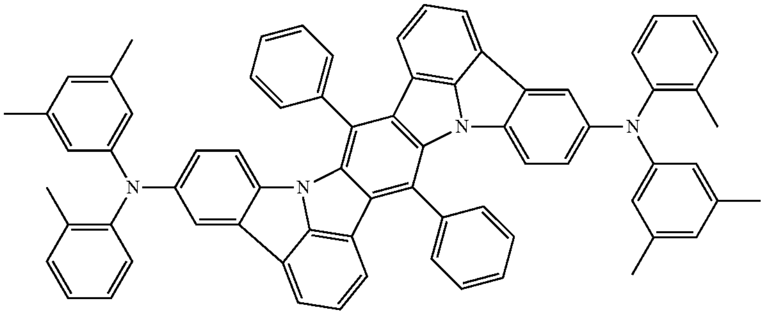
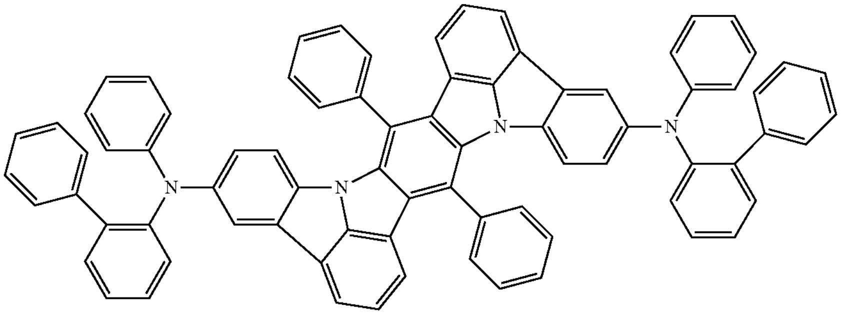
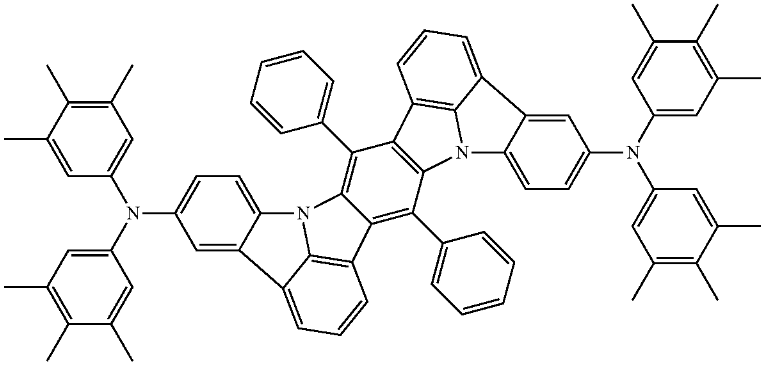
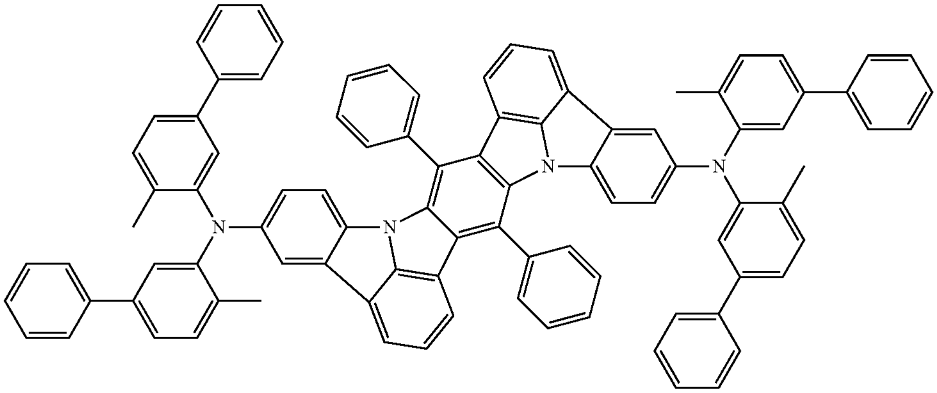

-continued
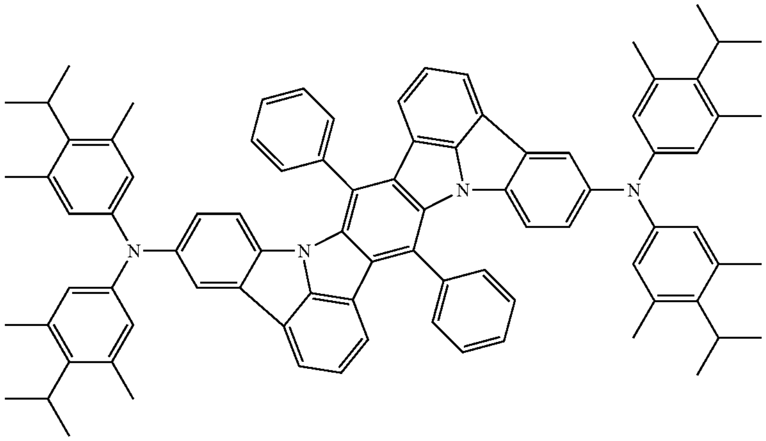
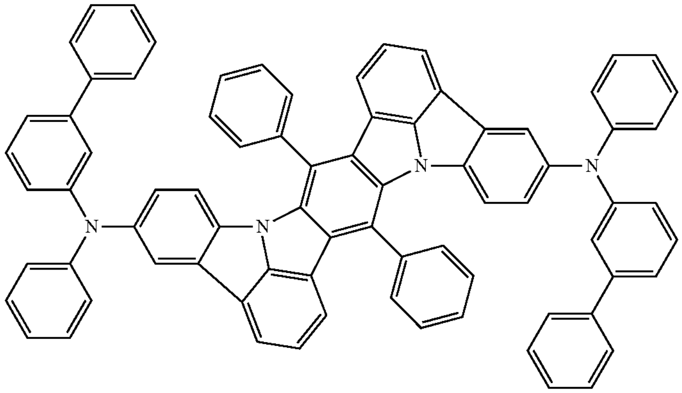
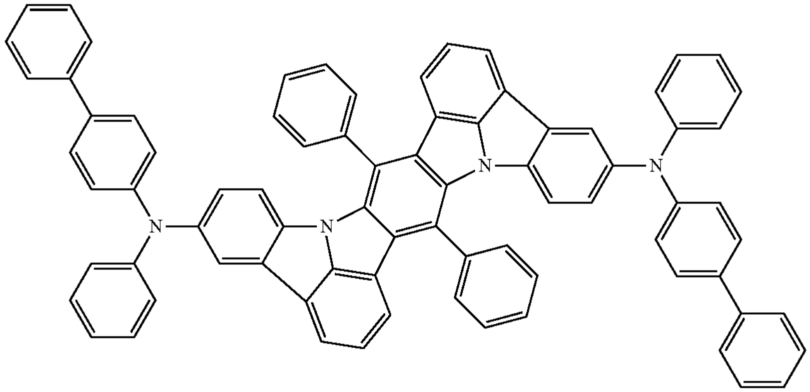
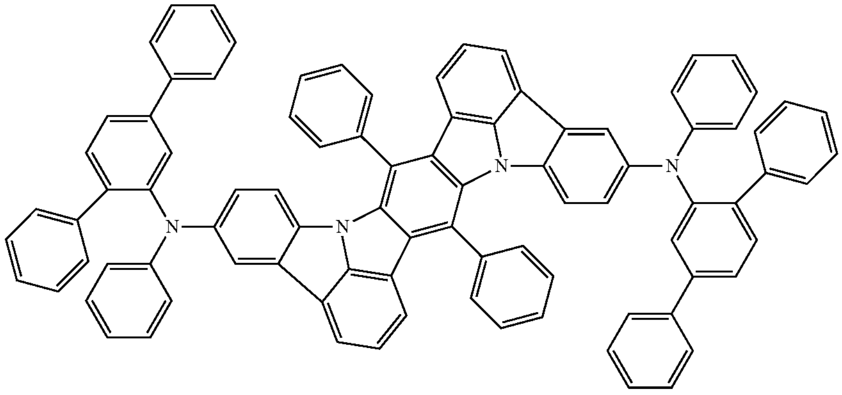

-continued
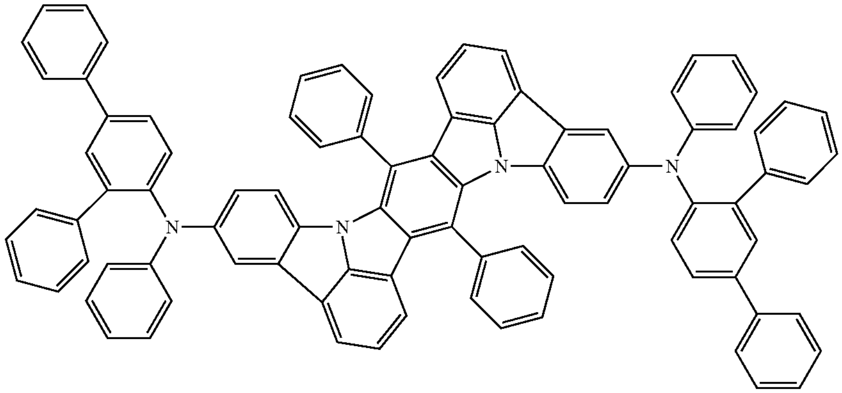
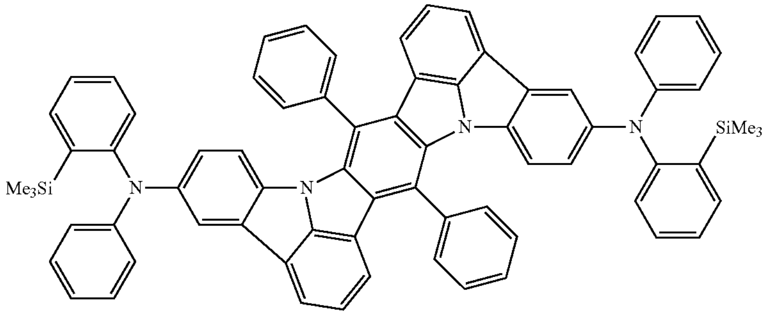
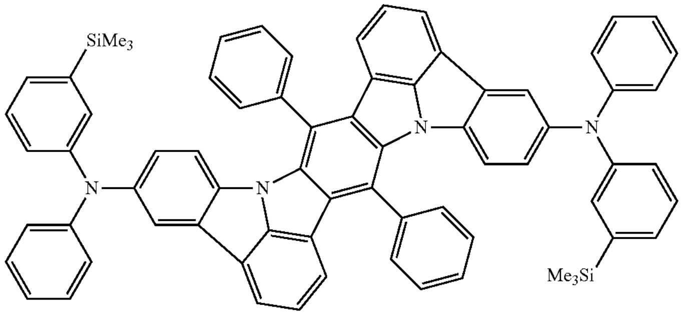
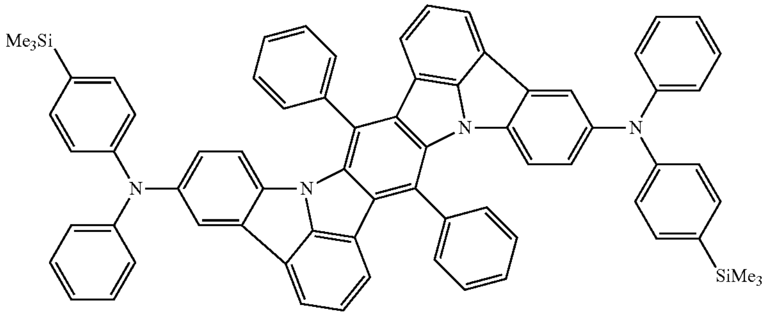

-continued
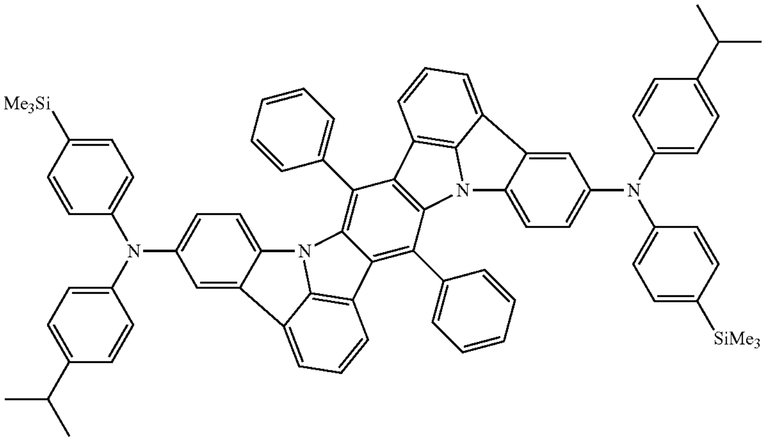
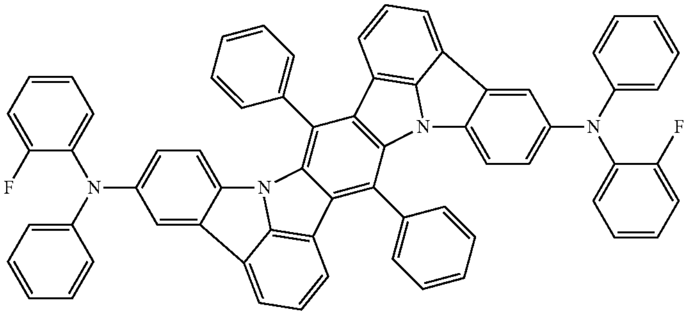
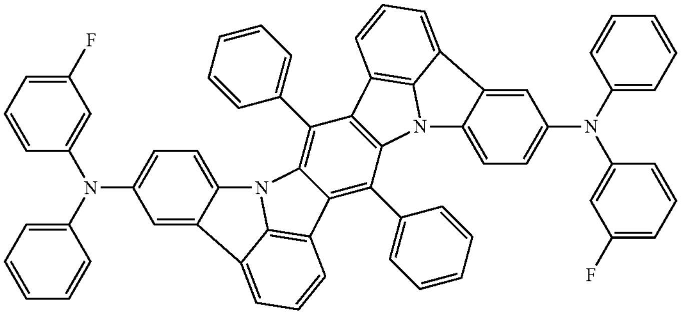
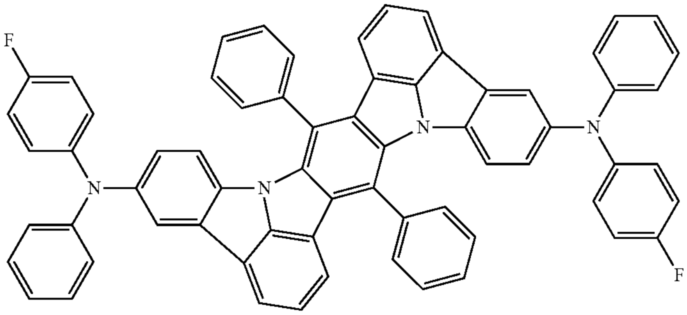

-continued
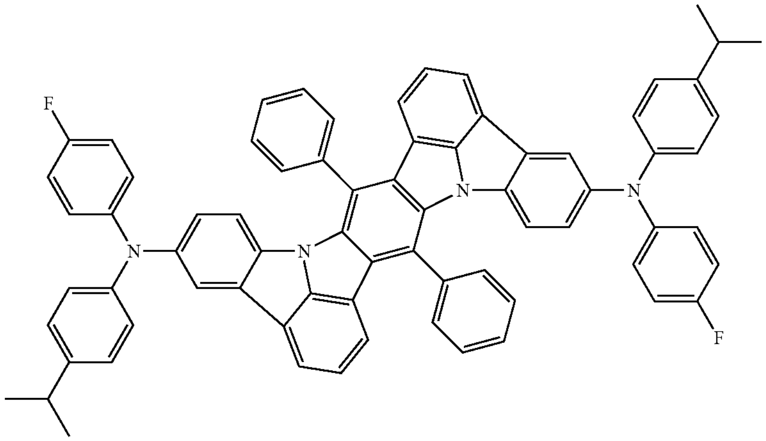
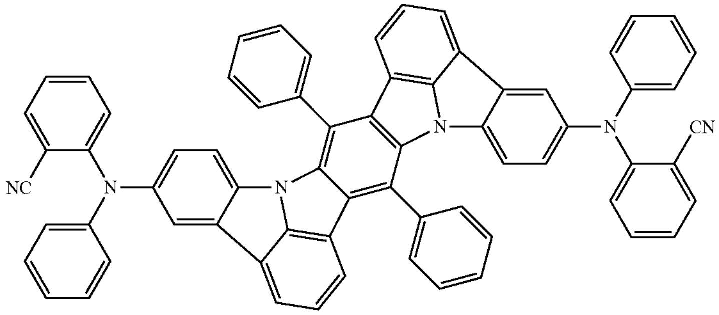
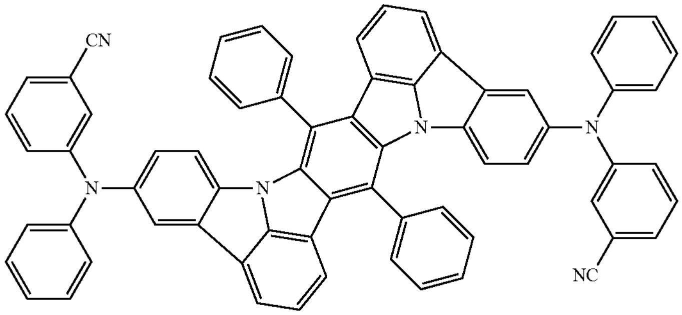
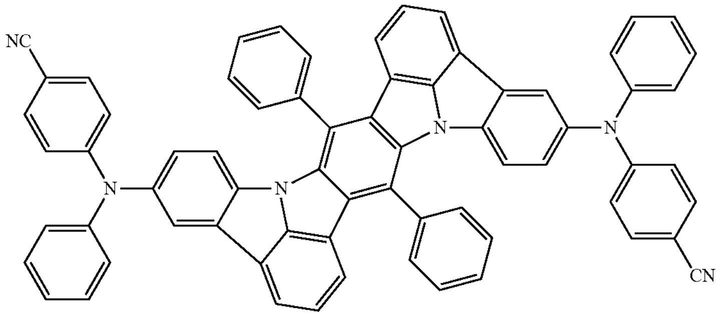

-continued
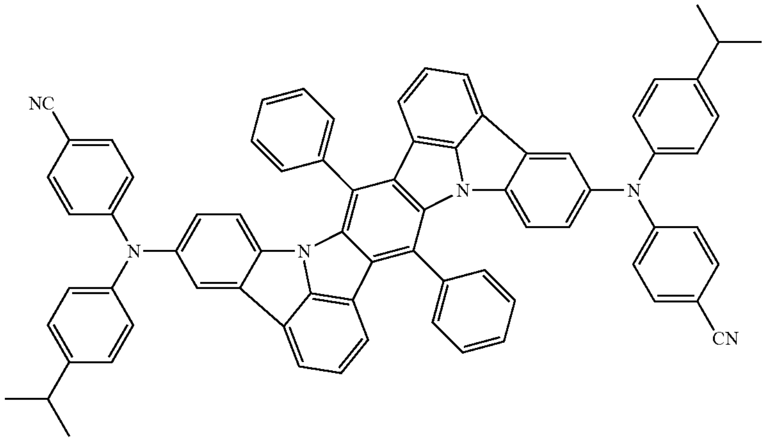
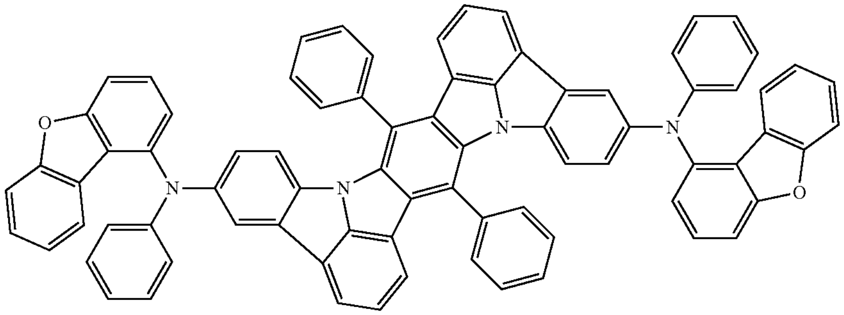
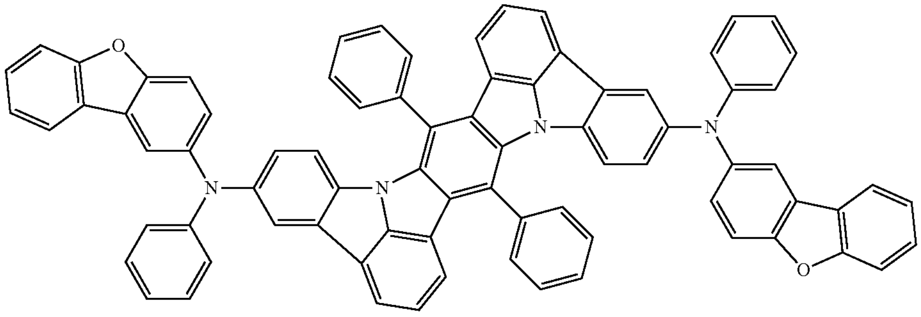
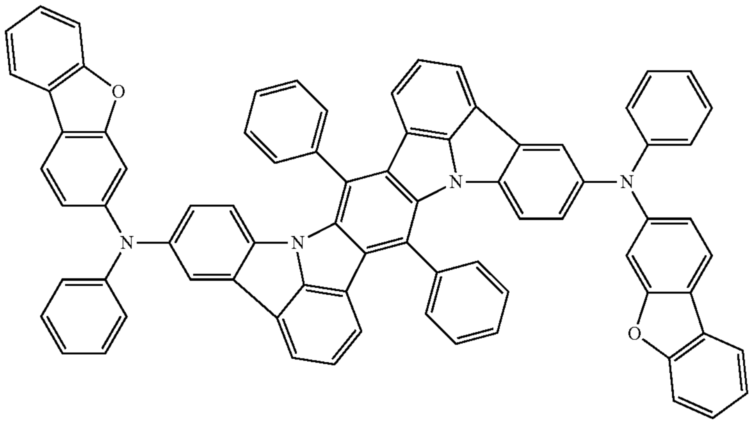

-continued
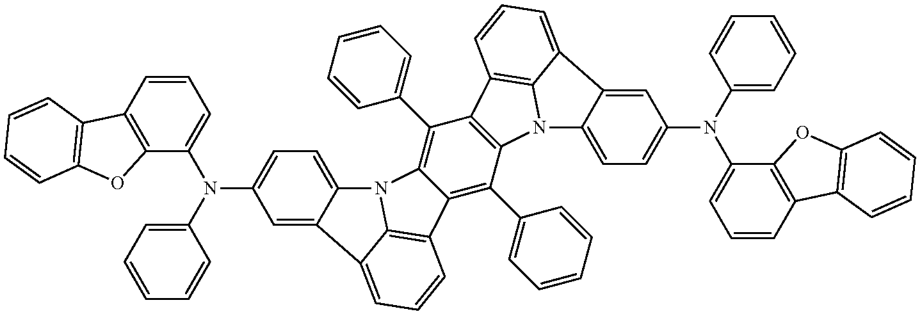
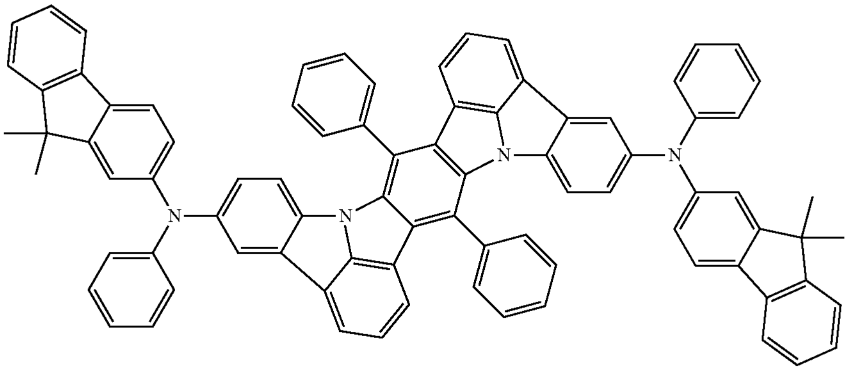
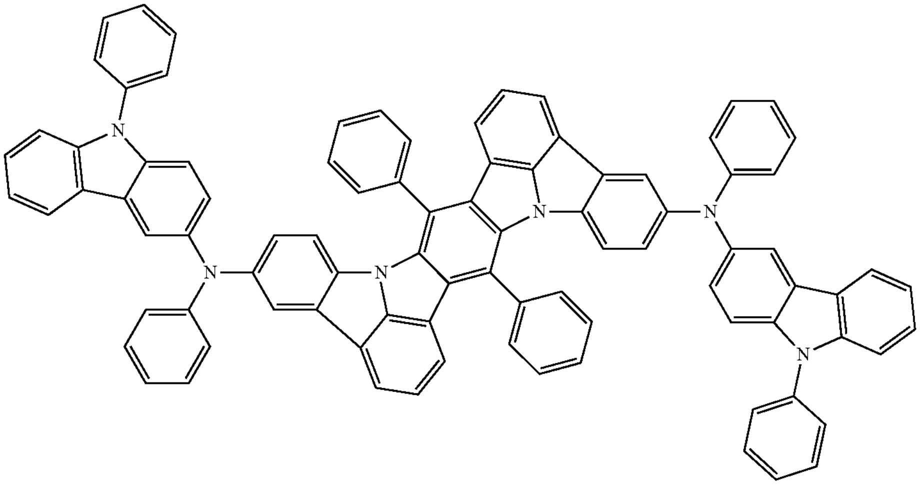
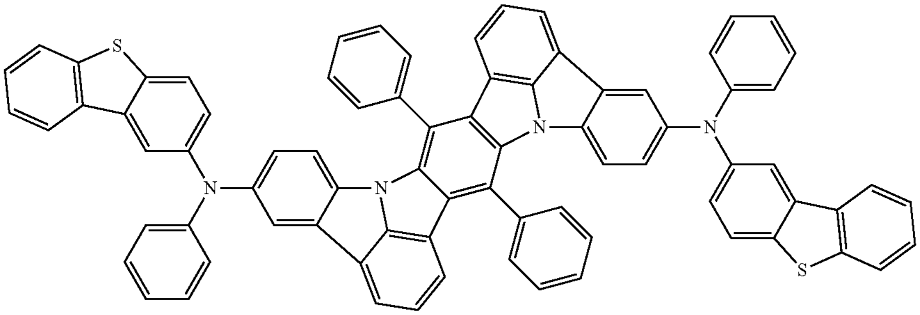

-continued
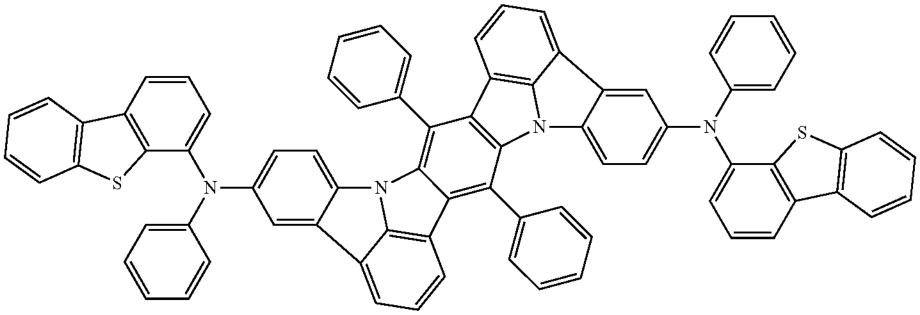
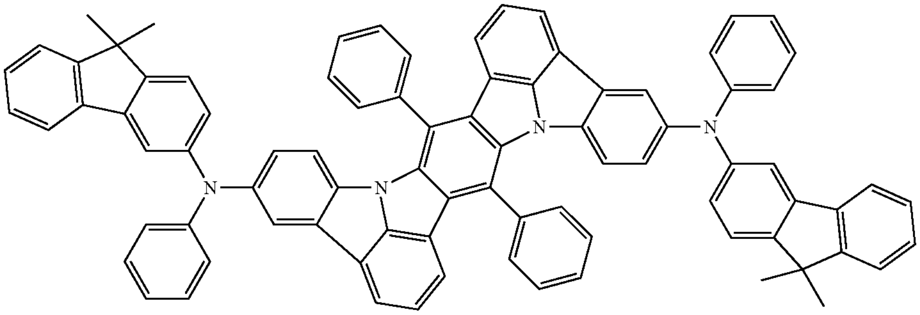
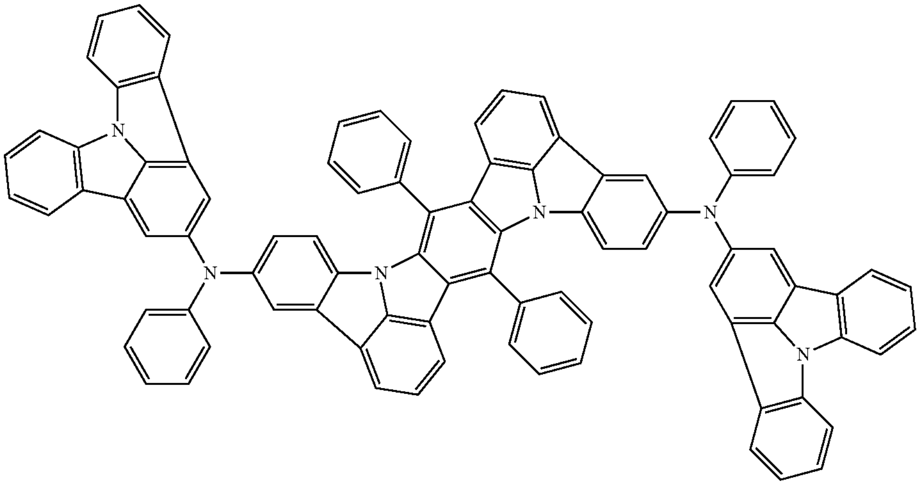
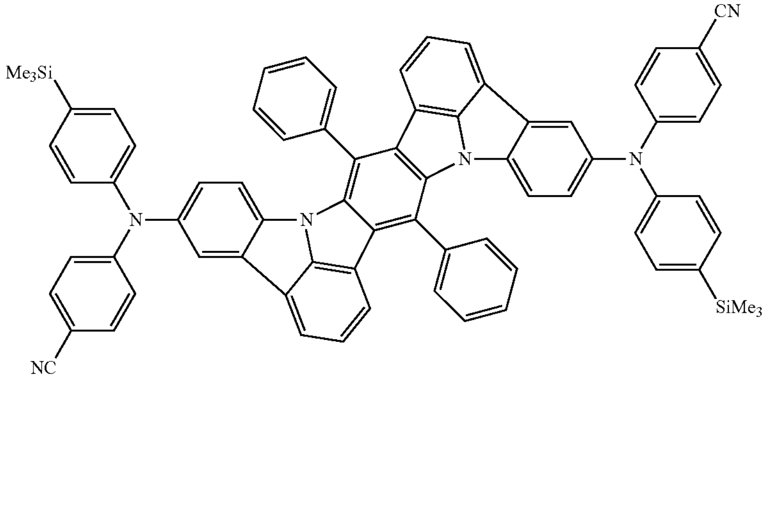

-continued
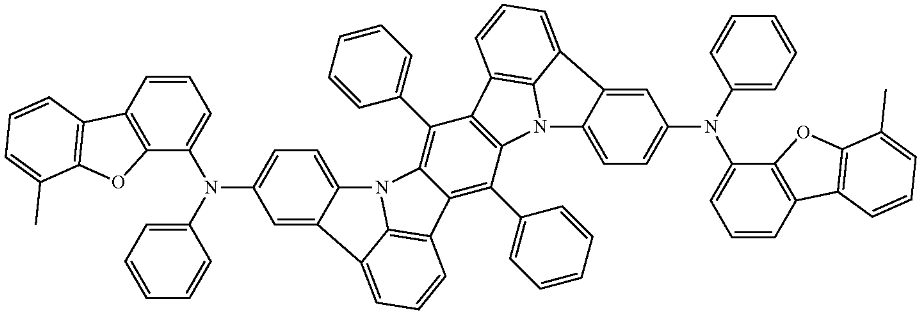
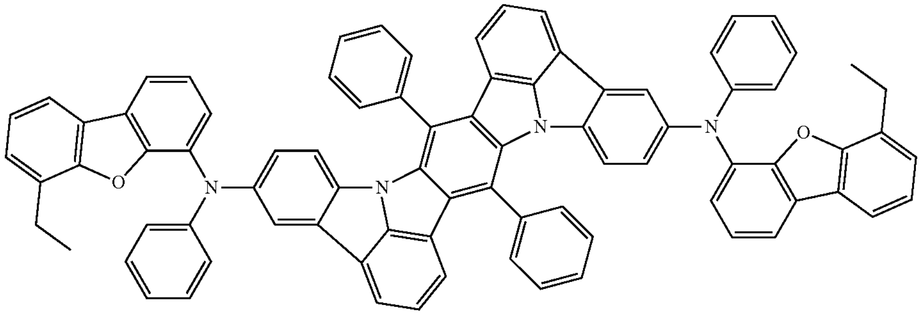
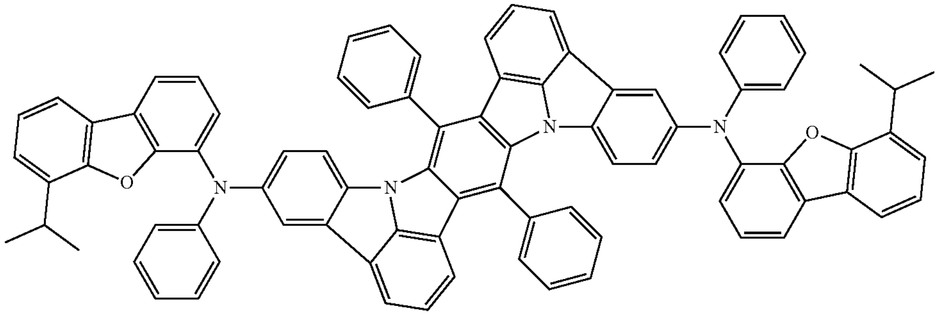
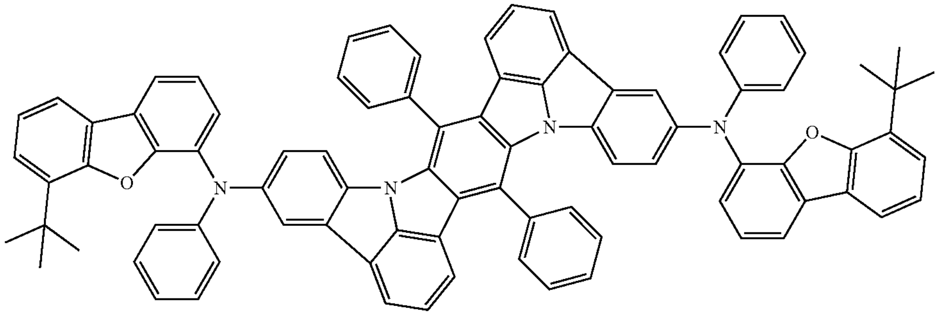
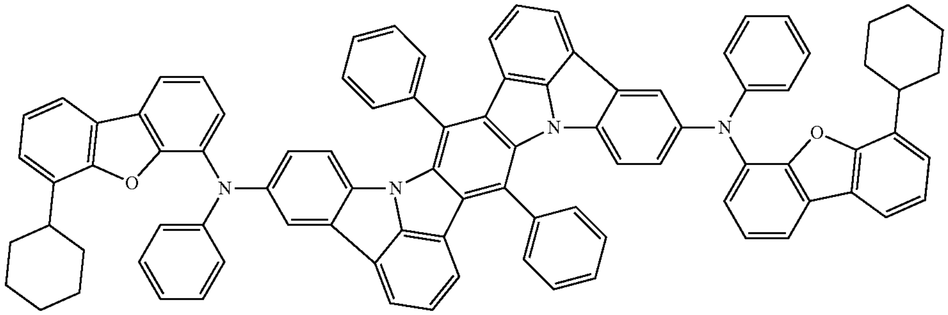

-continued
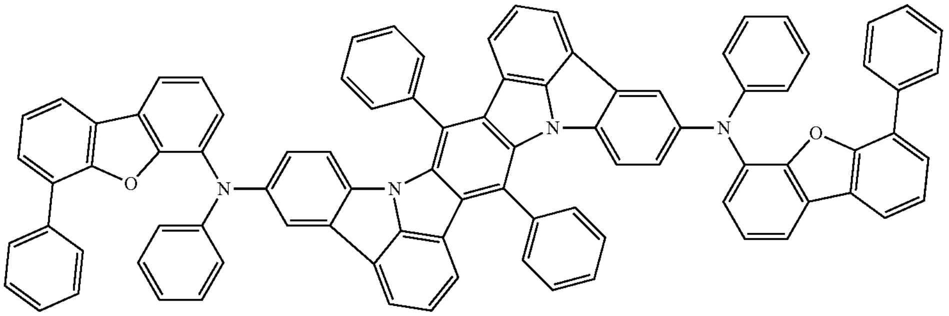
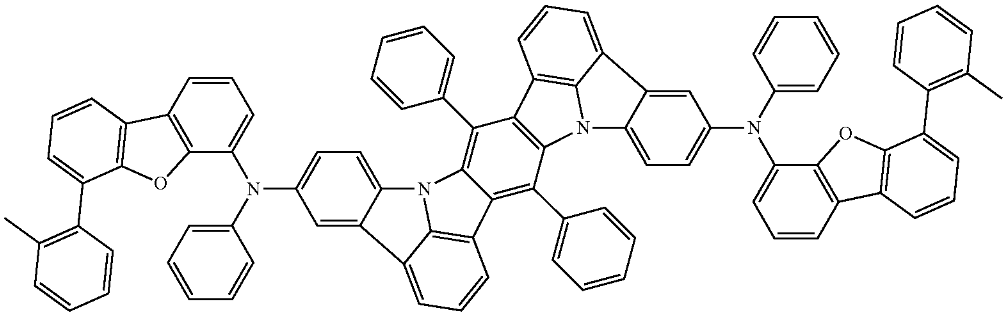
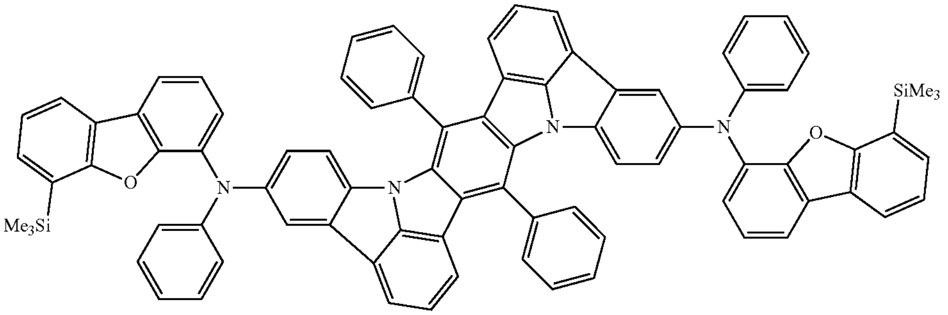
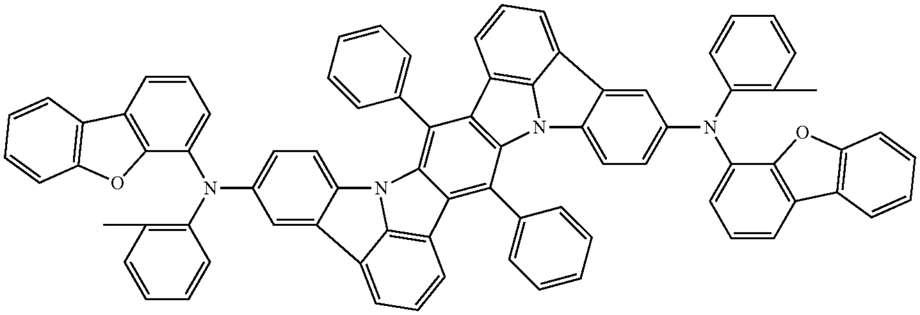
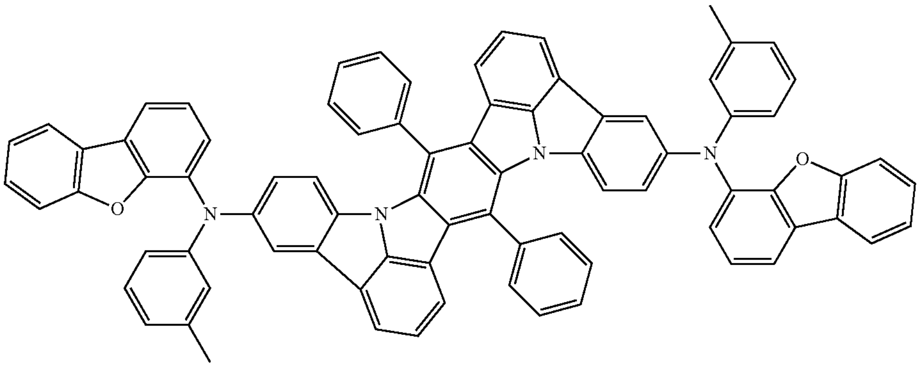

-continued
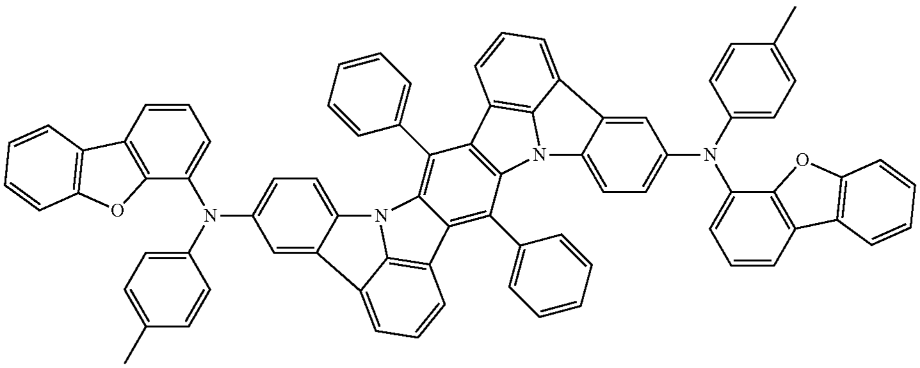
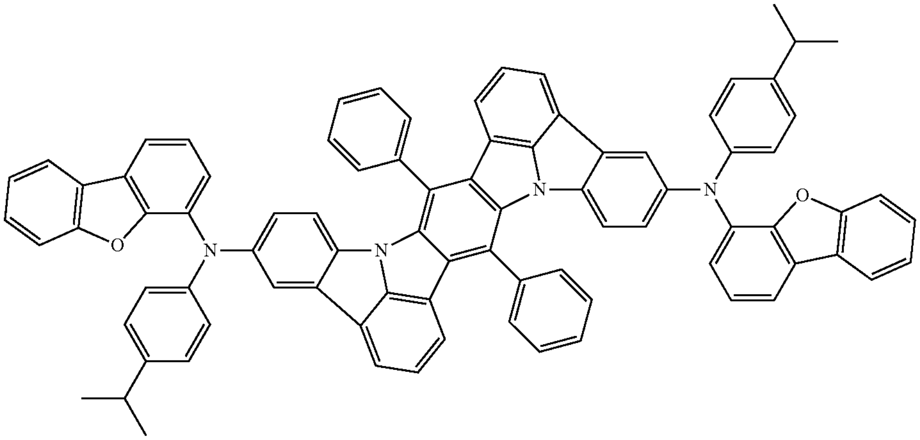
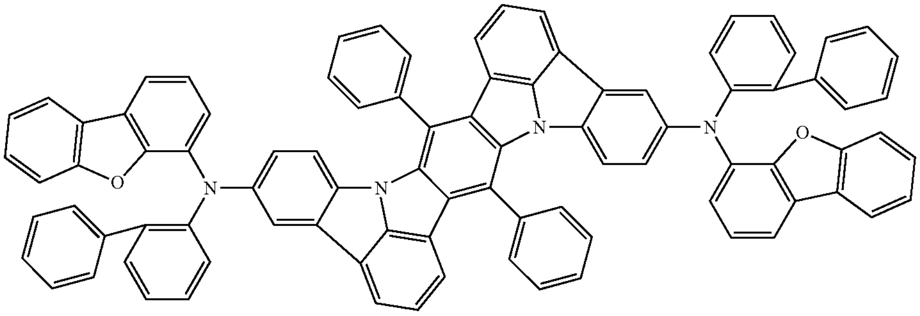
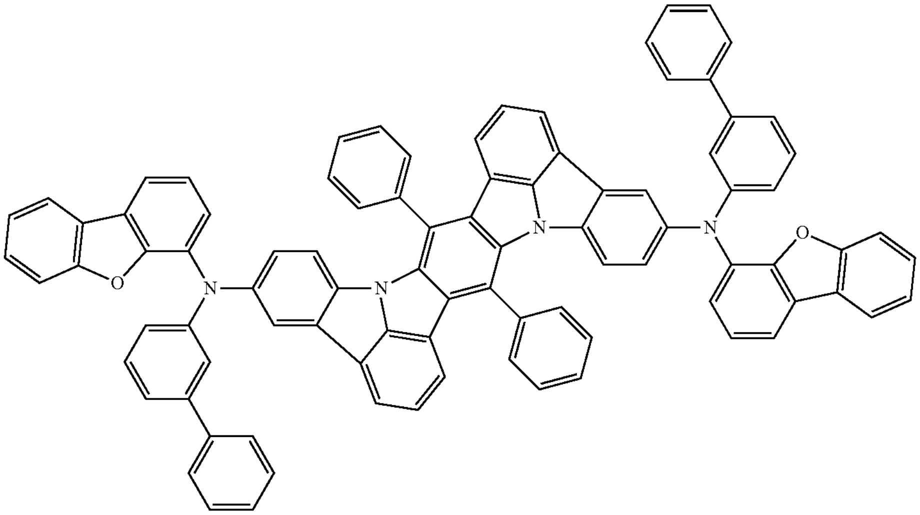

-continued
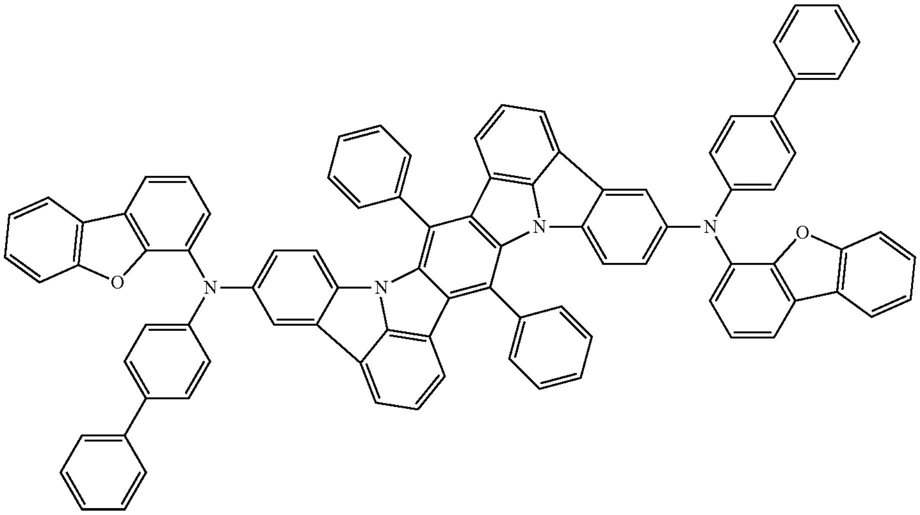
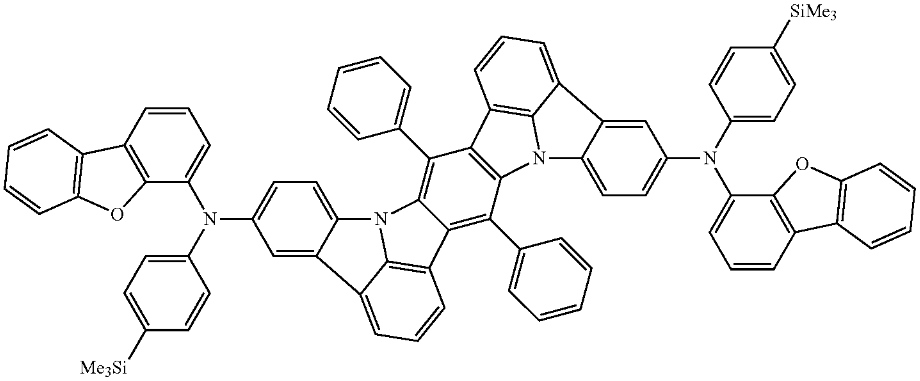
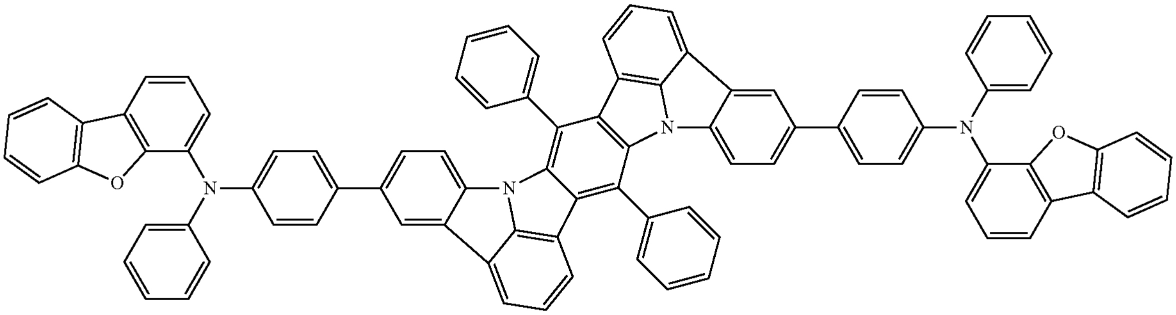
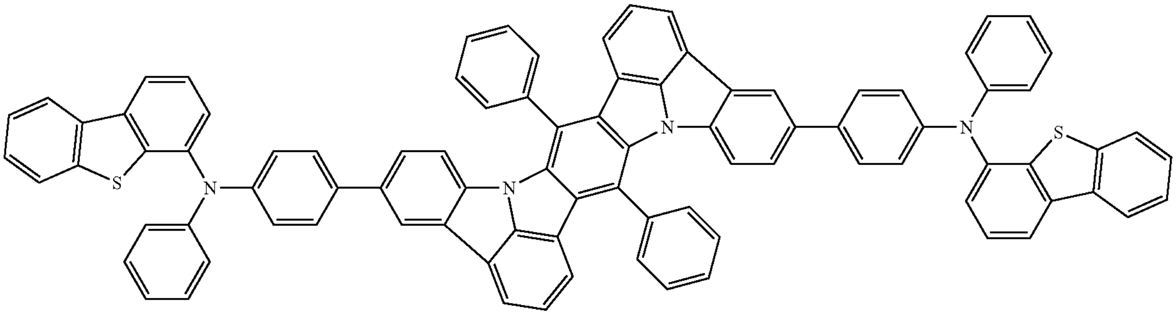

-continued
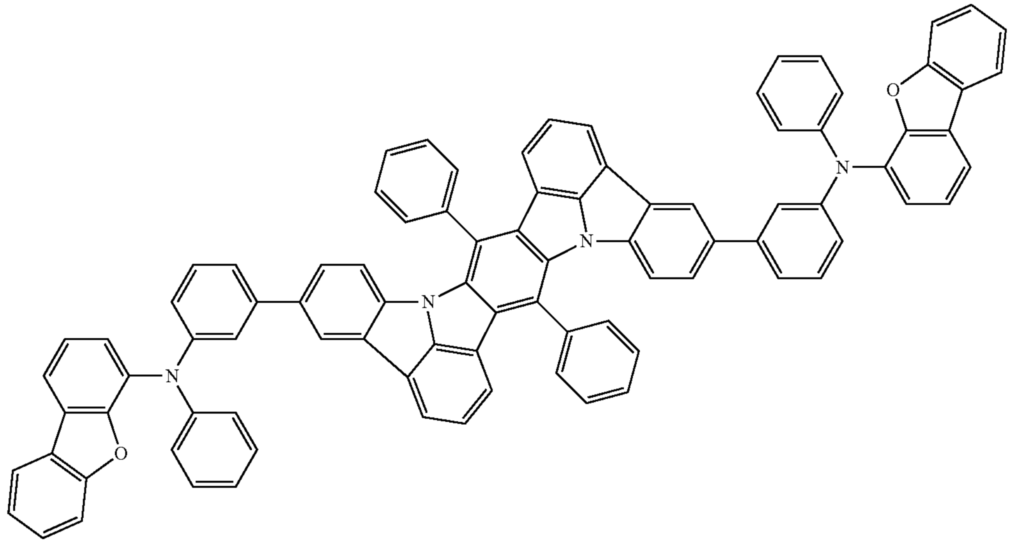
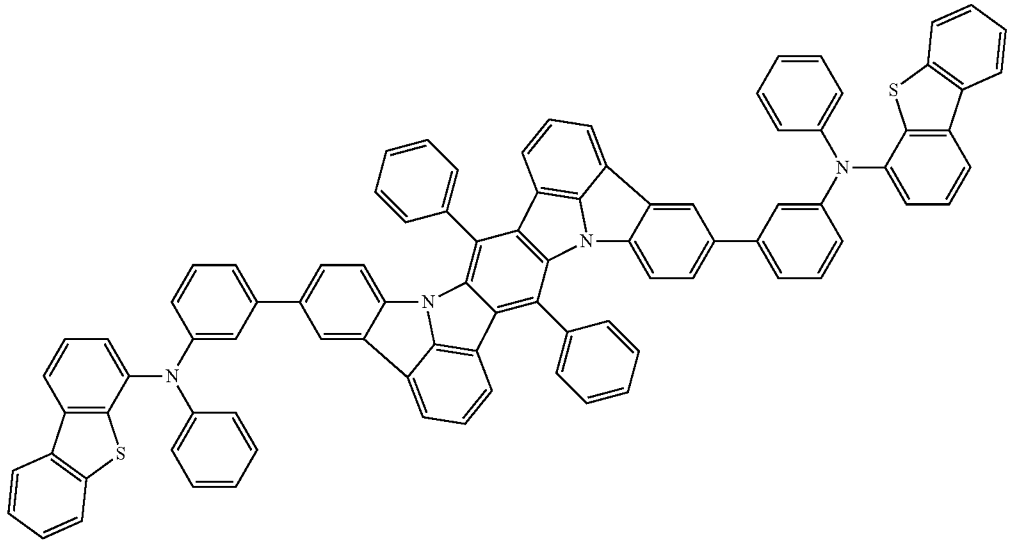
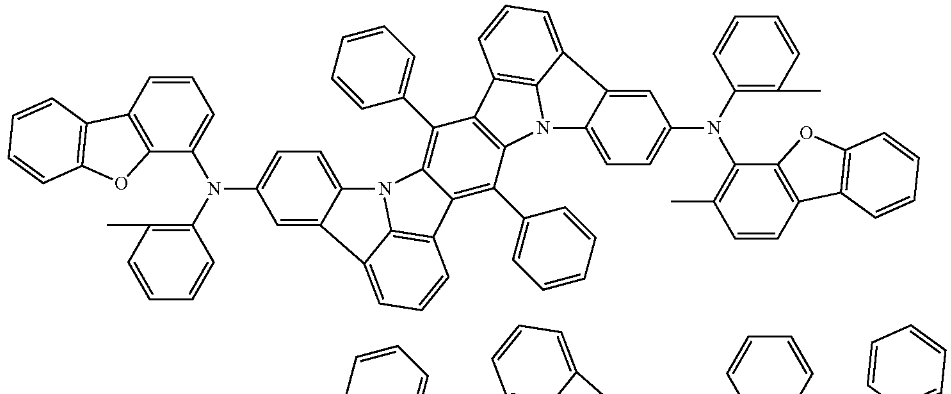
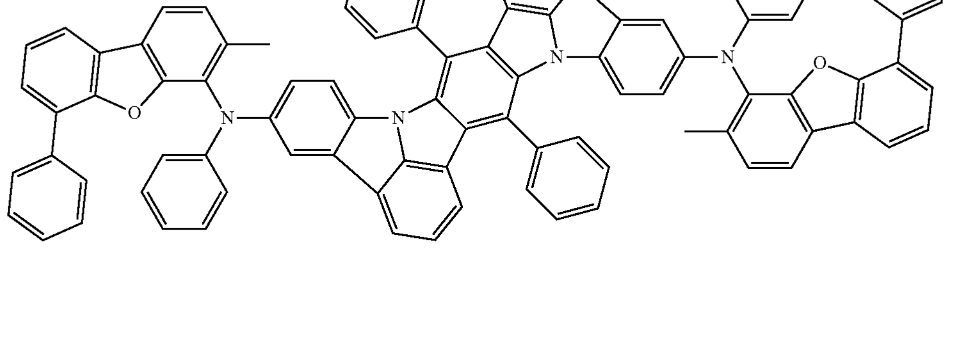

-continued
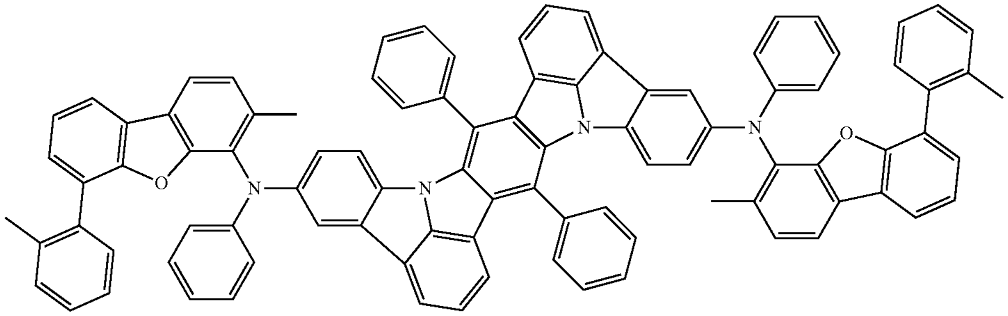
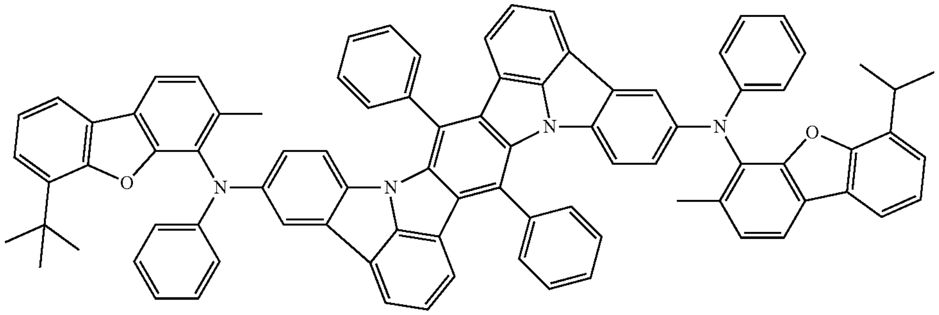
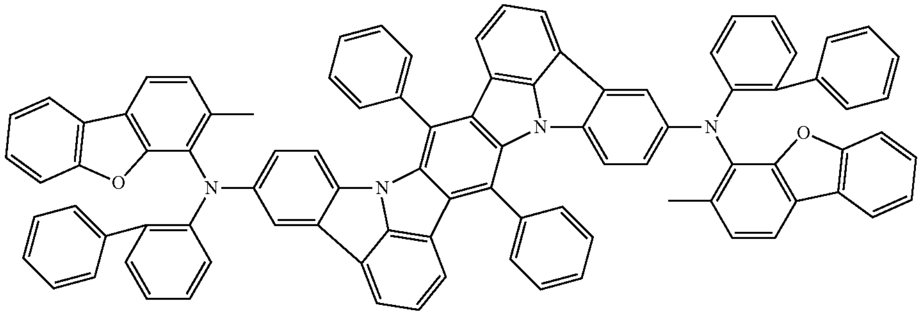
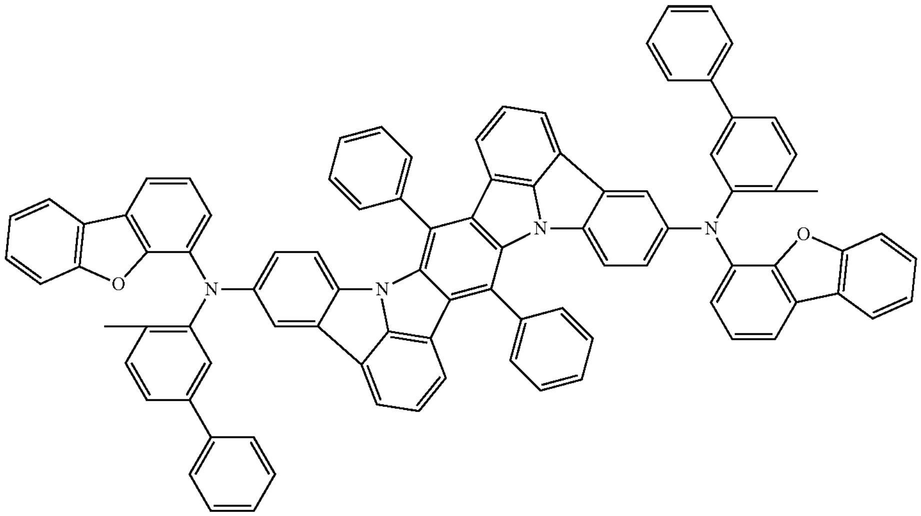

-continued
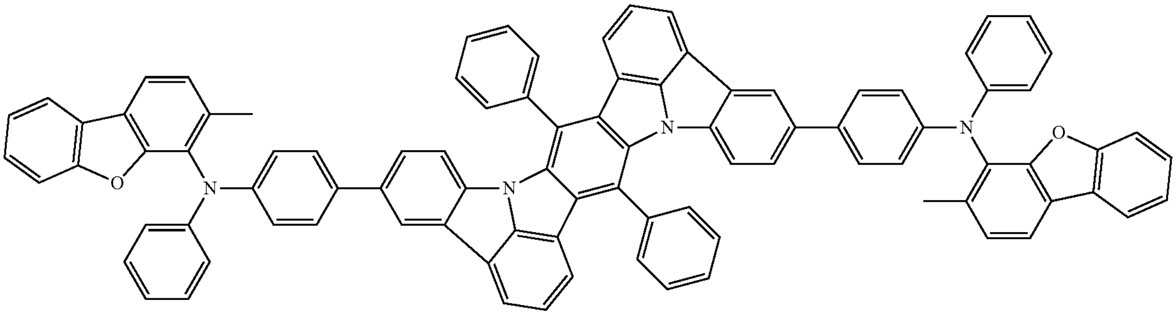
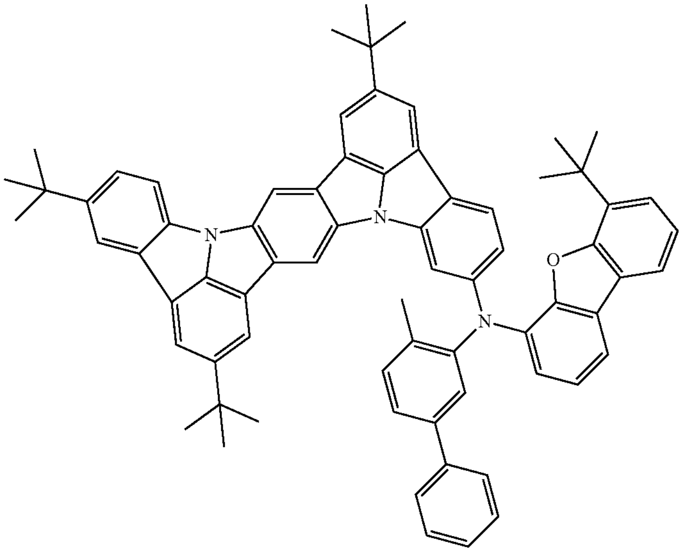
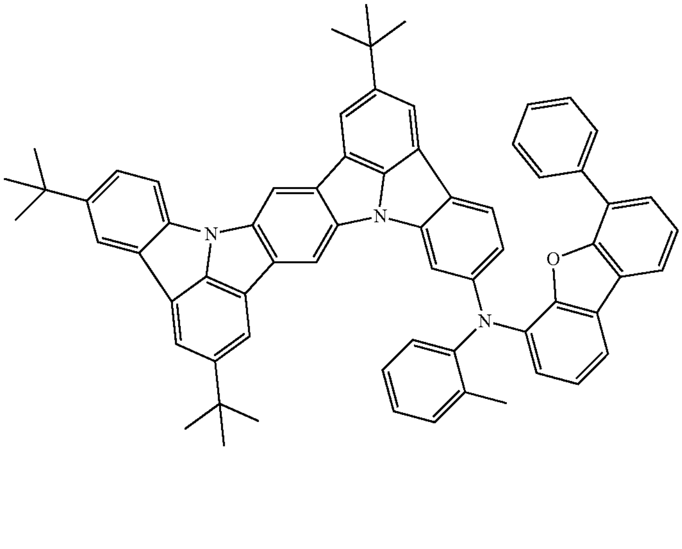

-continued
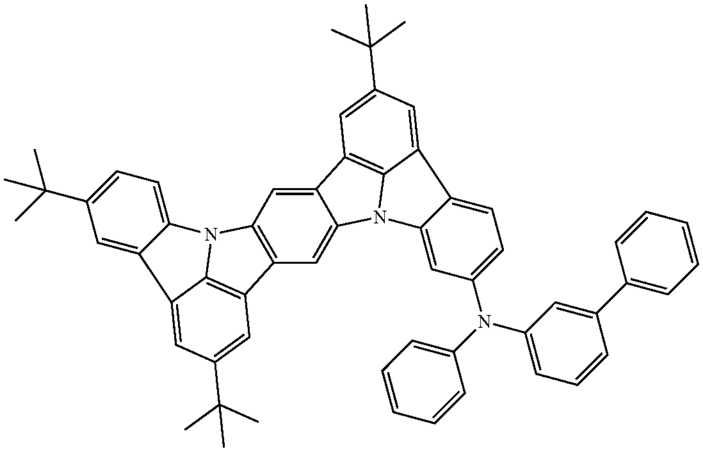
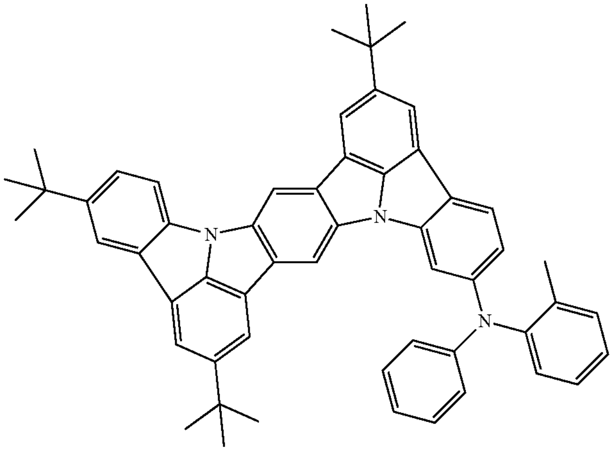
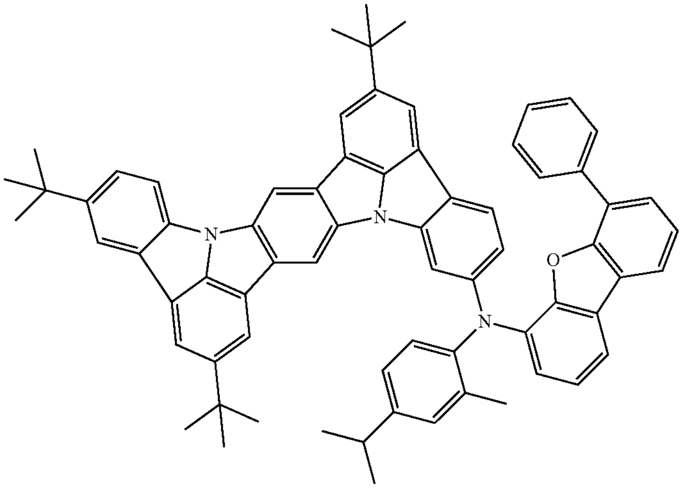

-continued
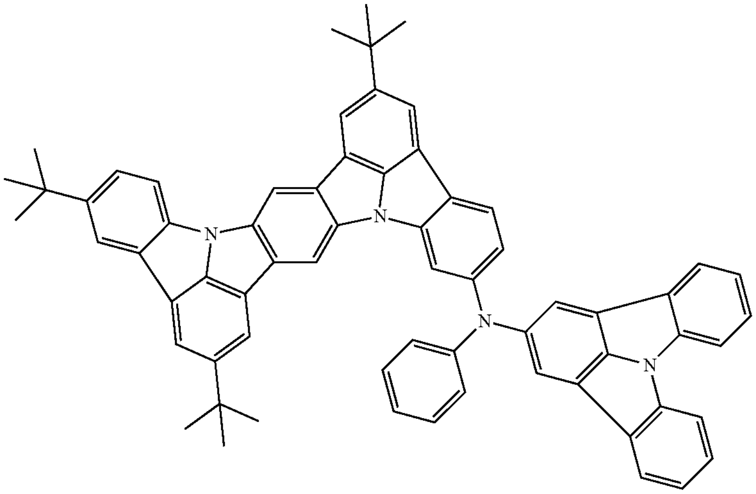
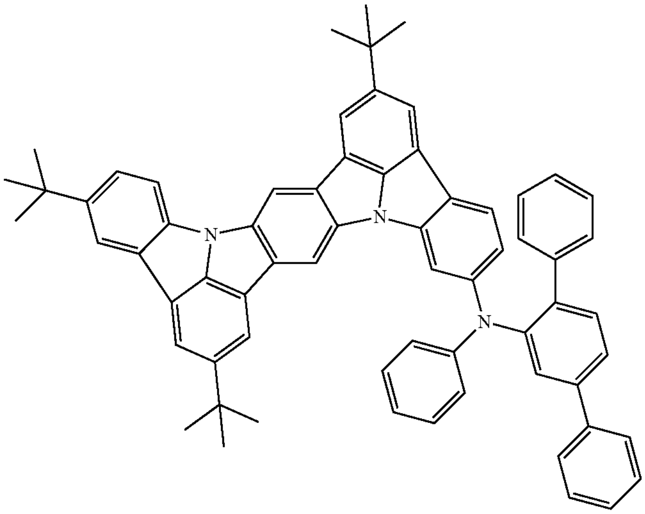
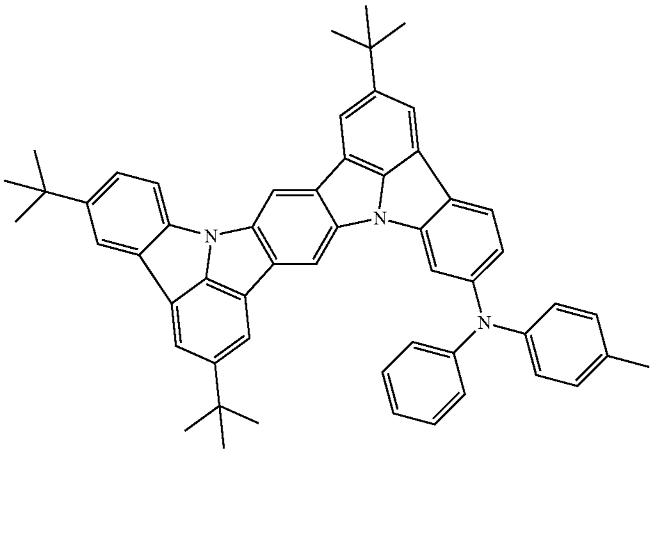

-continued
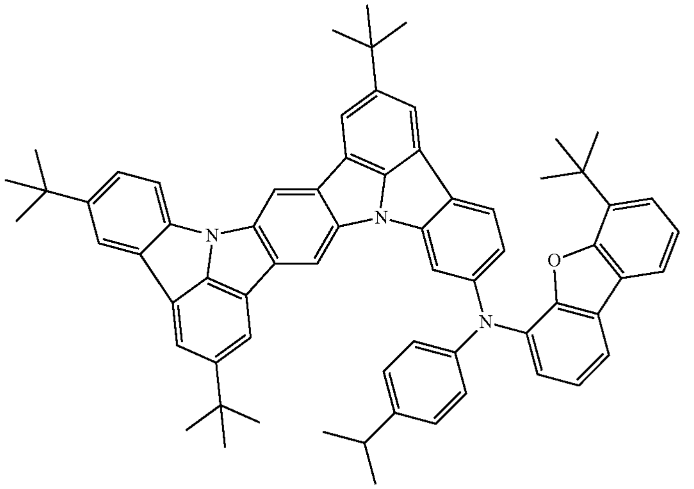
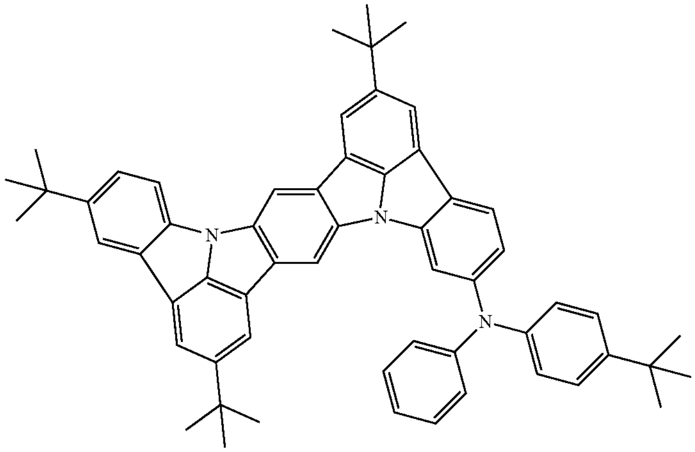
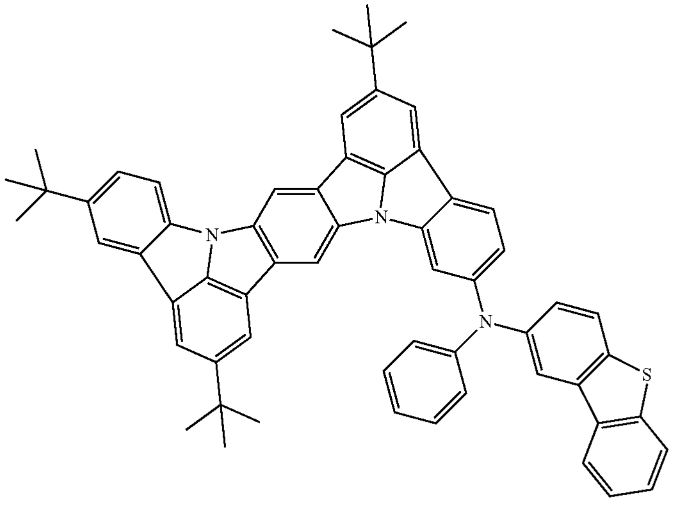

-continued
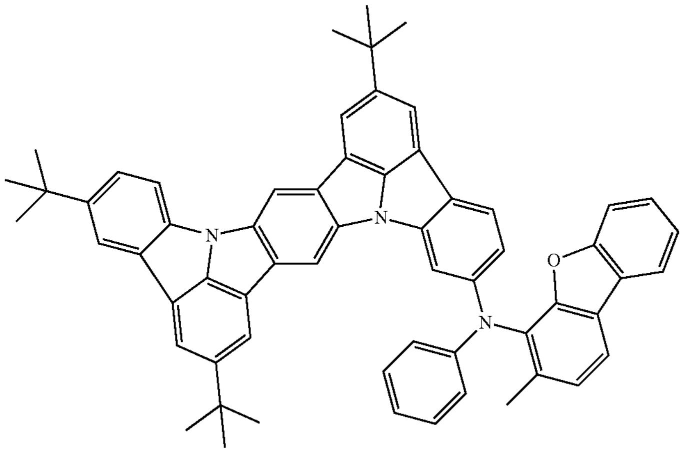
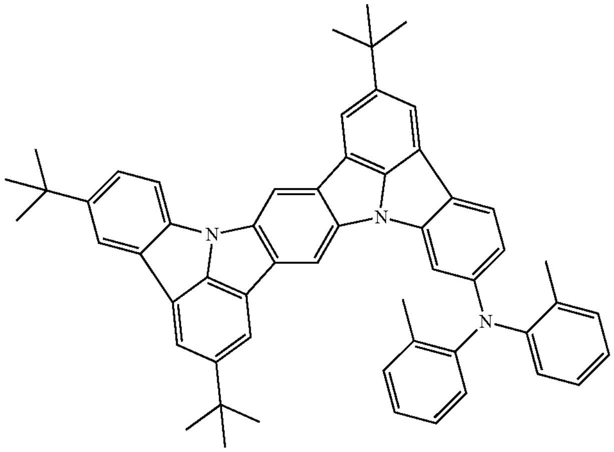
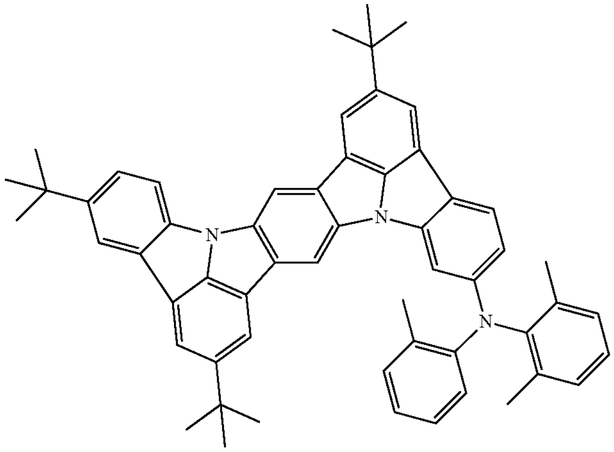

-continued
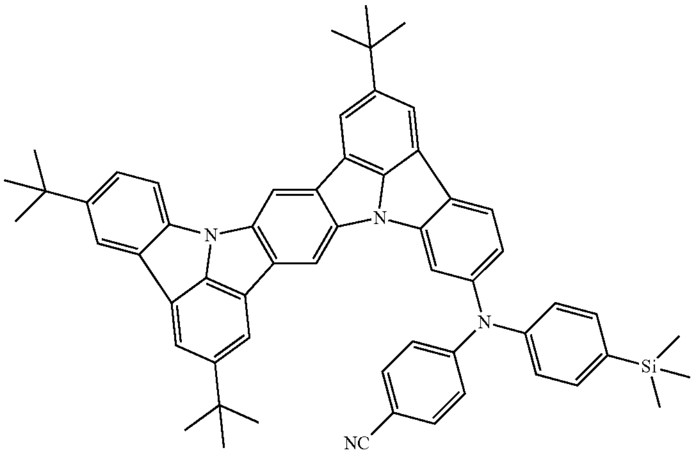
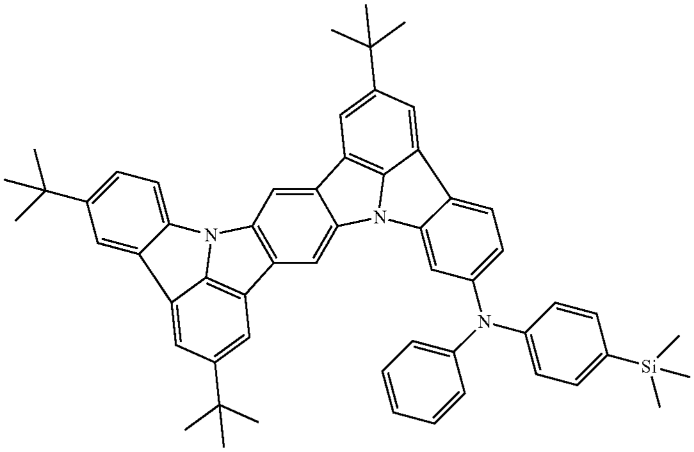
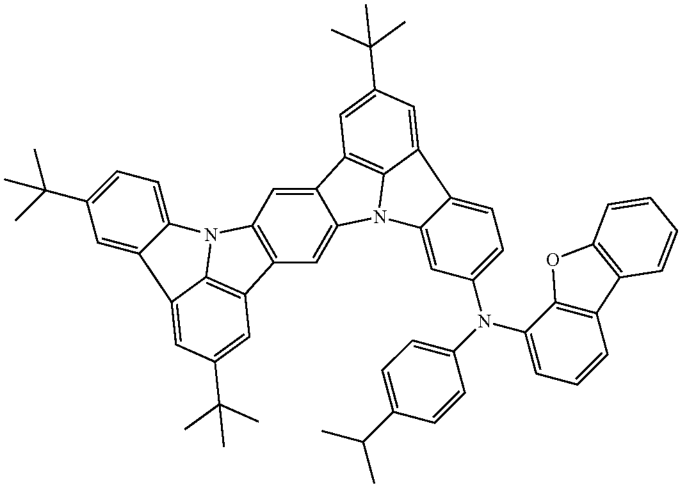

-continued
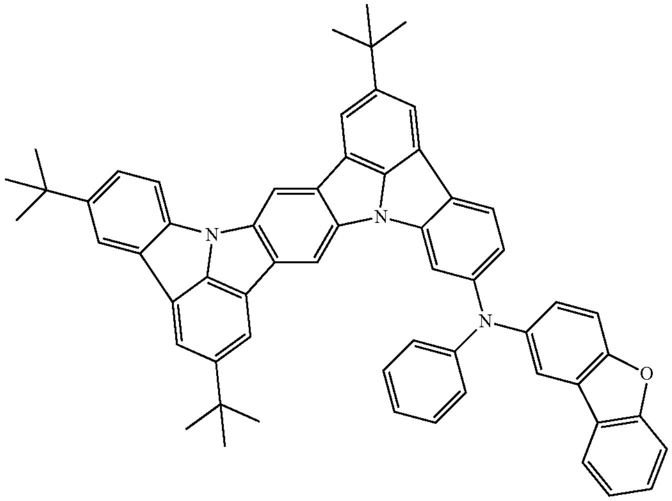
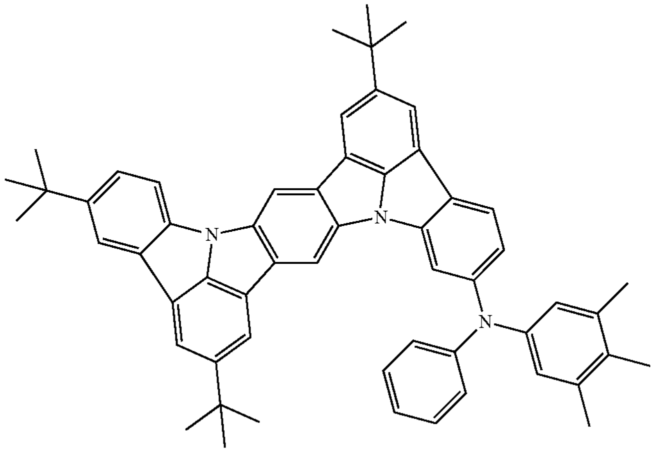
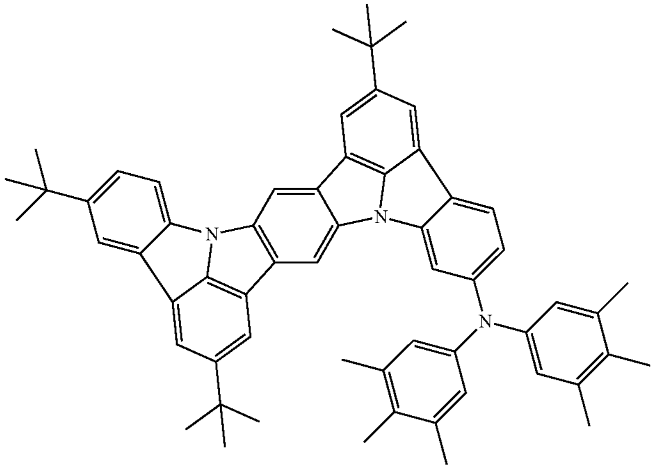

-continued
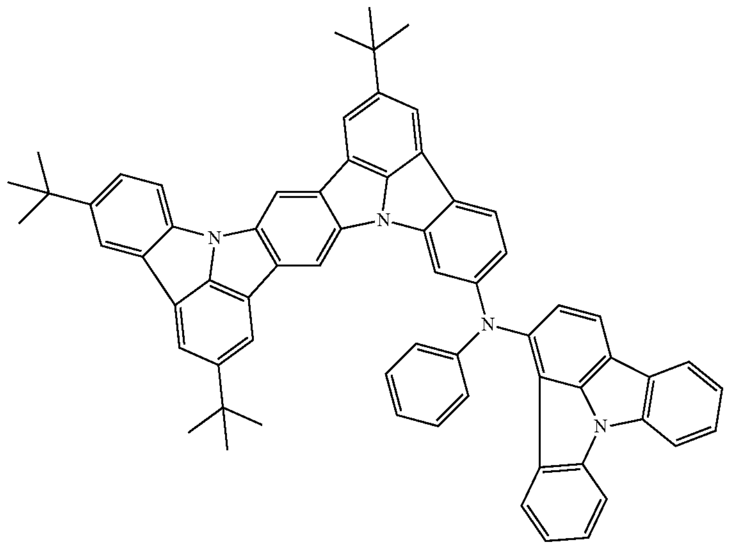
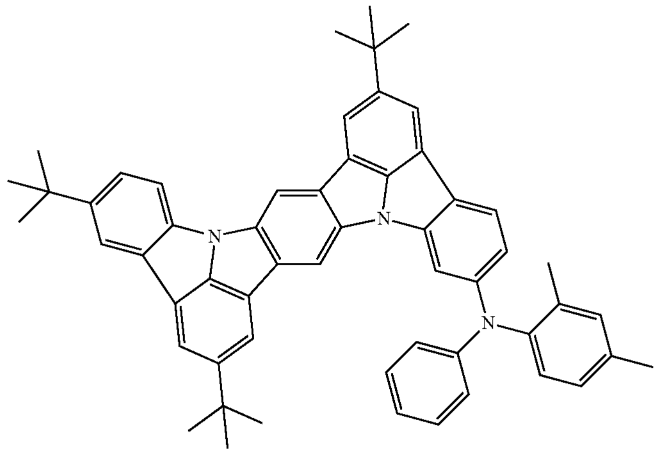
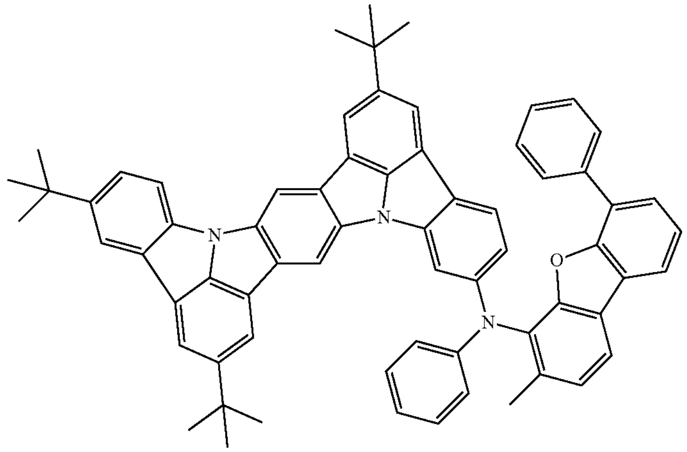

-continued
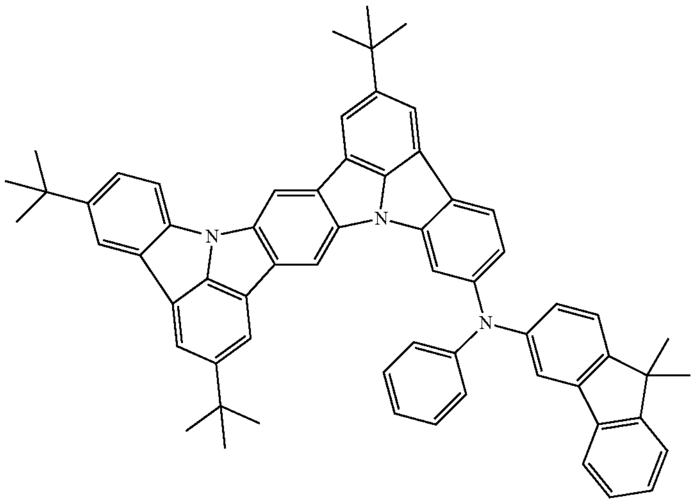
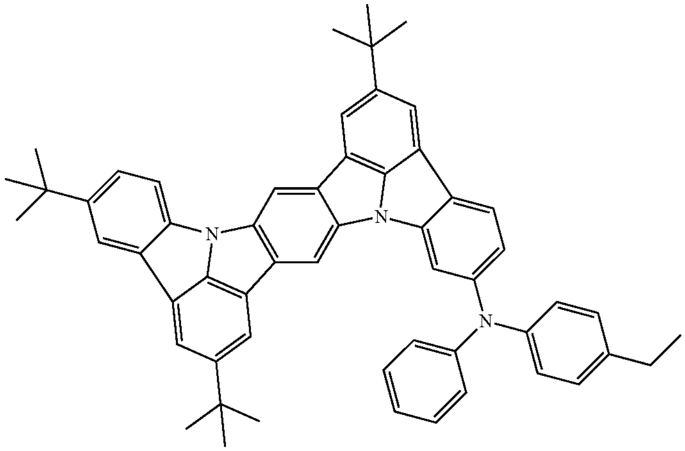
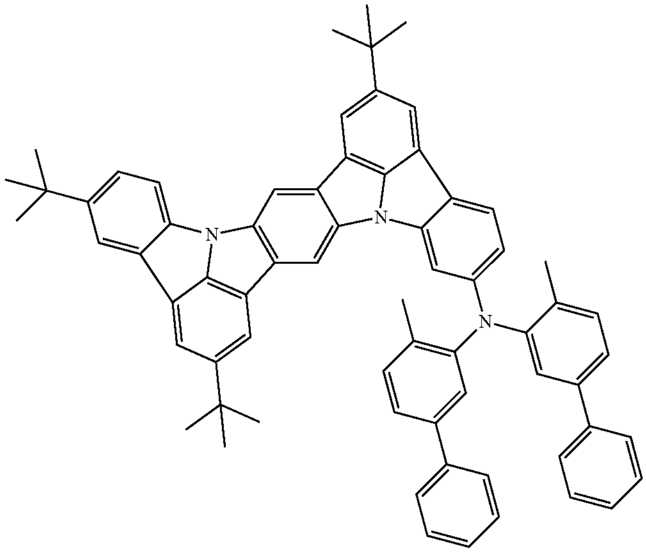

-continued
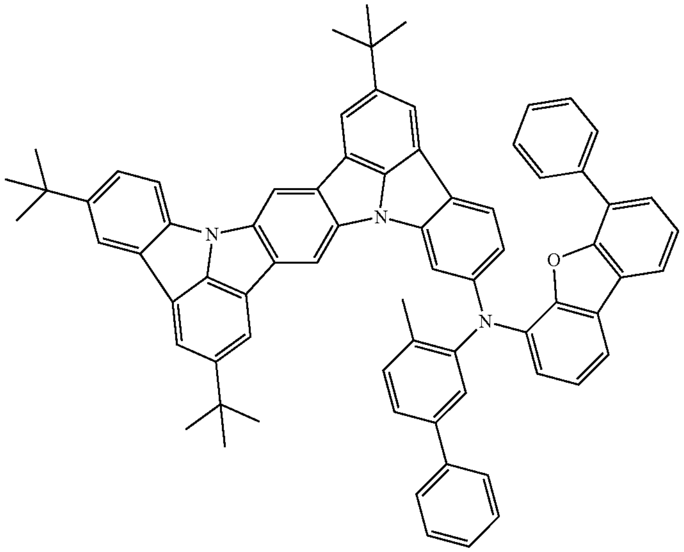
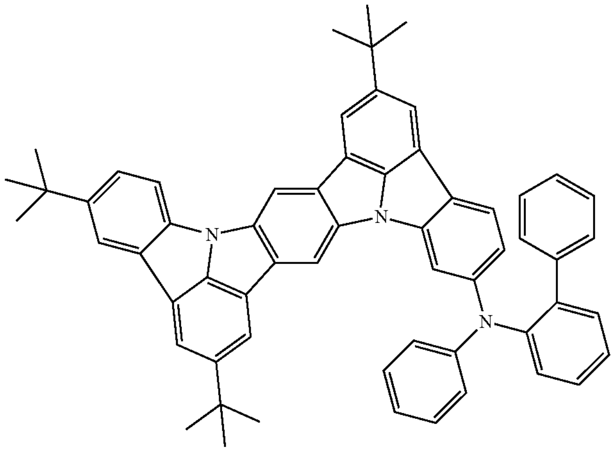
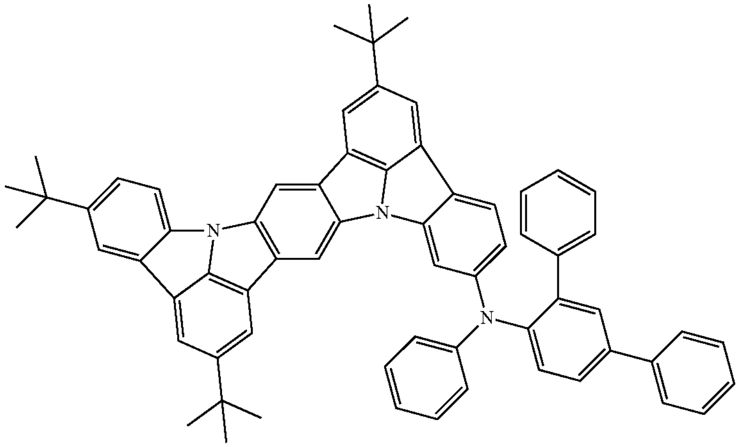

-continued
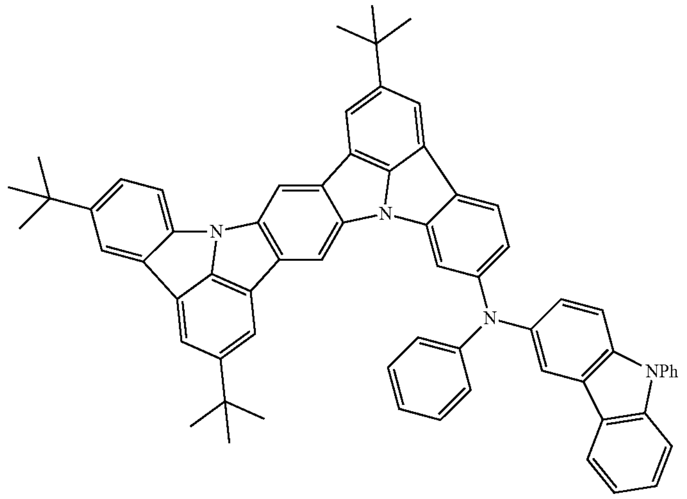
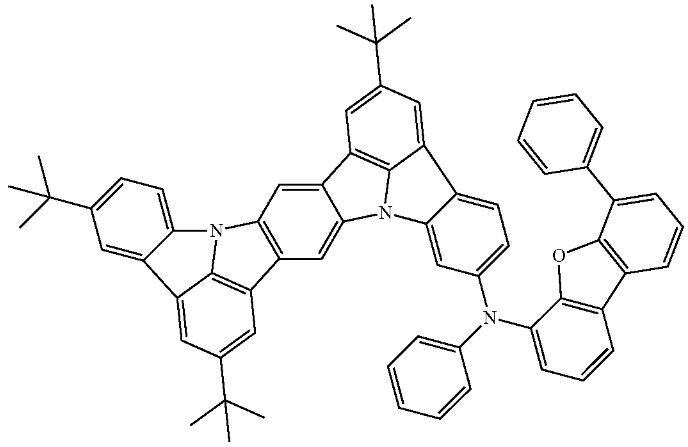
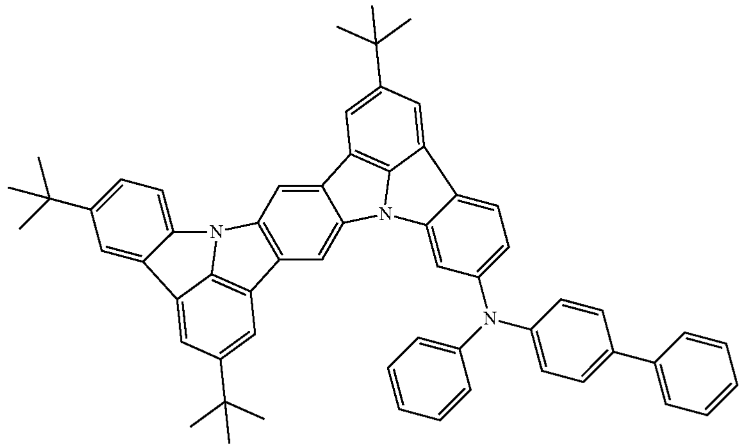

-continued
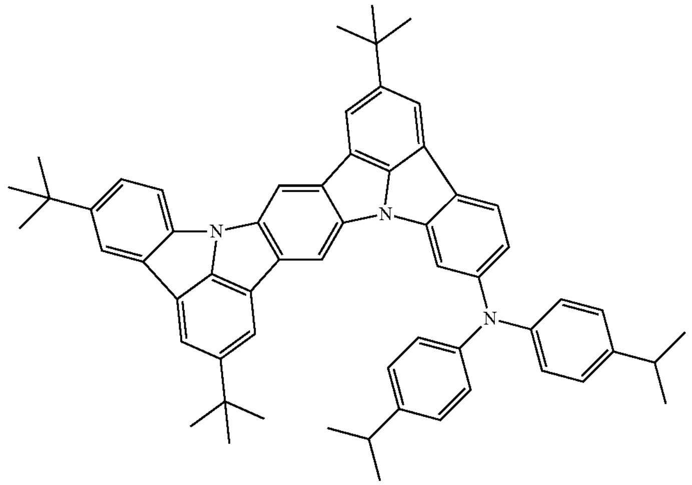
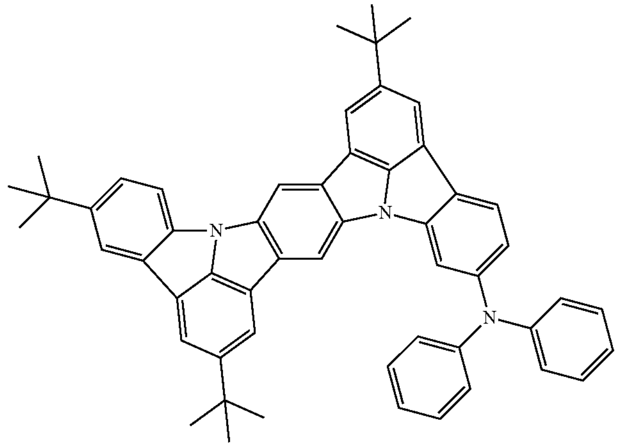
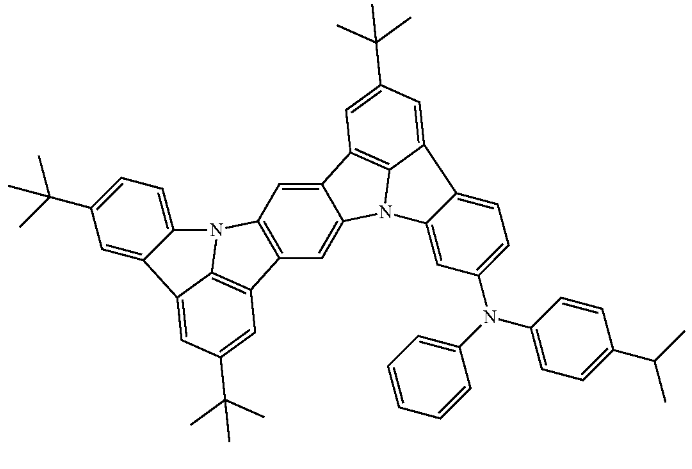

-continued
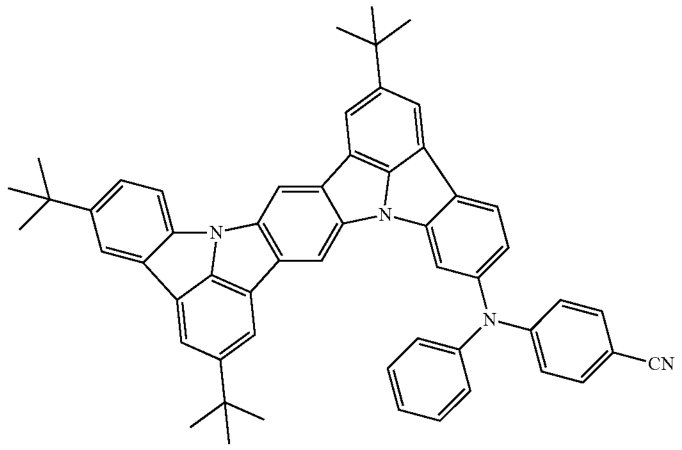
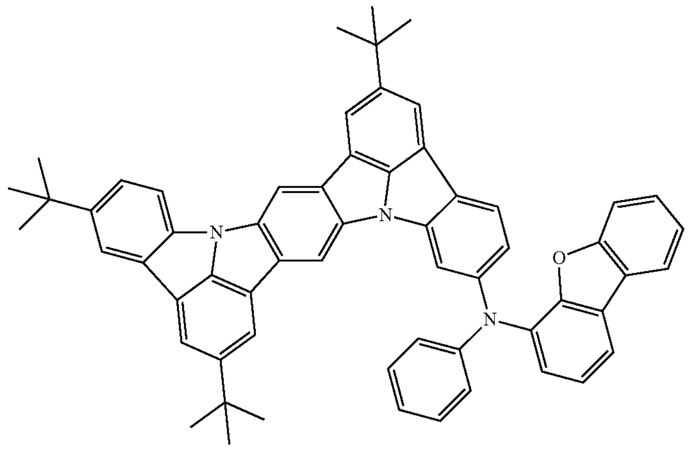
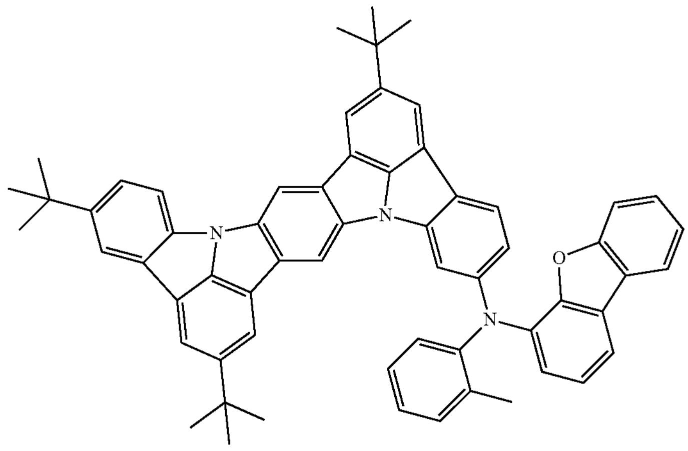

-continued
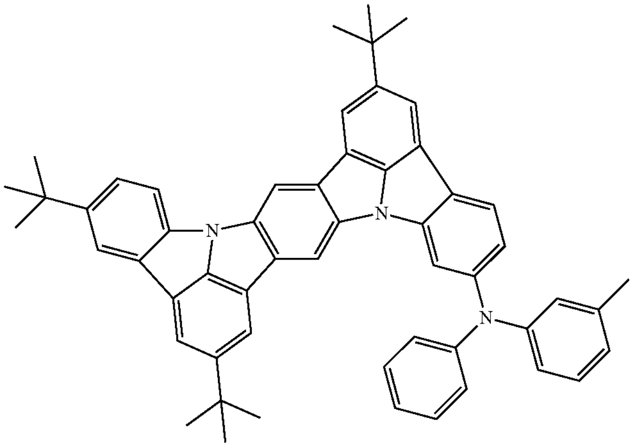
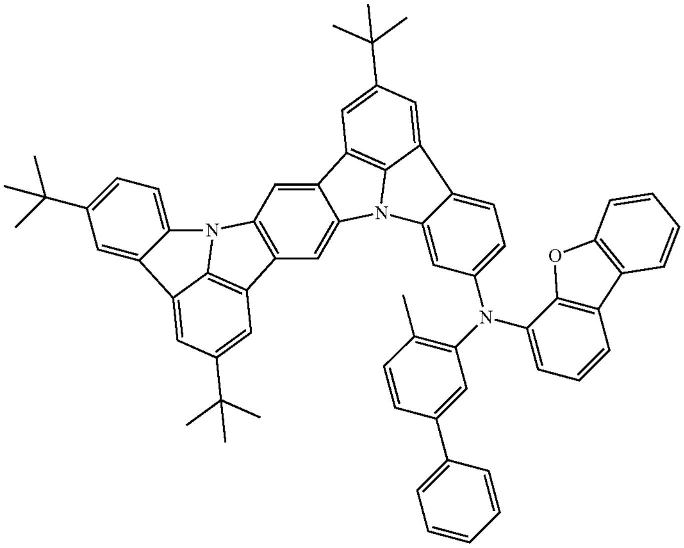
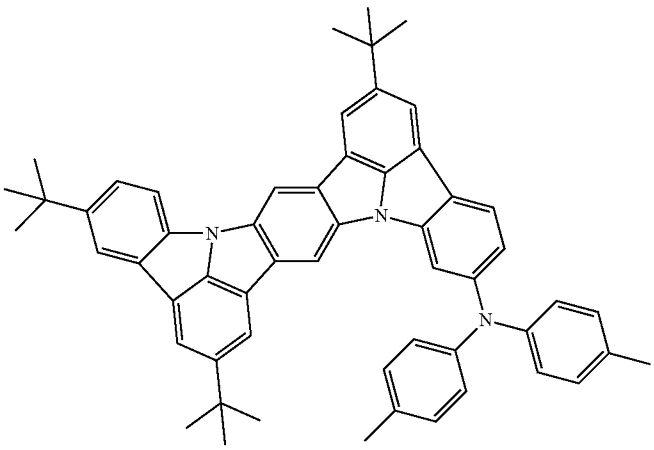

-continued
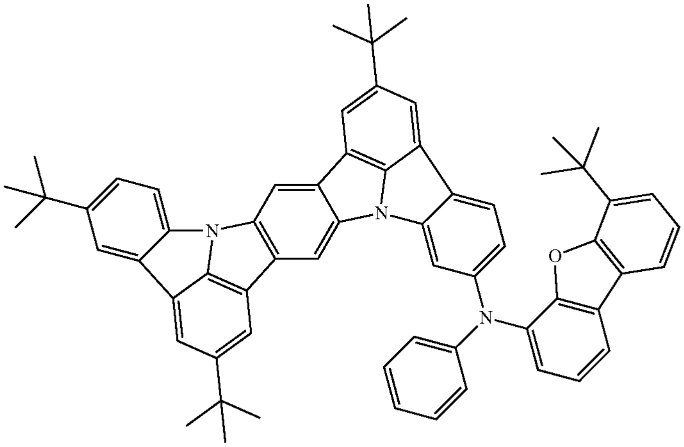
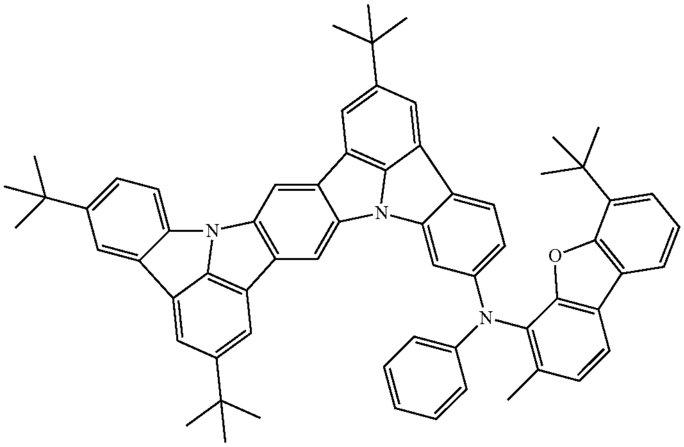
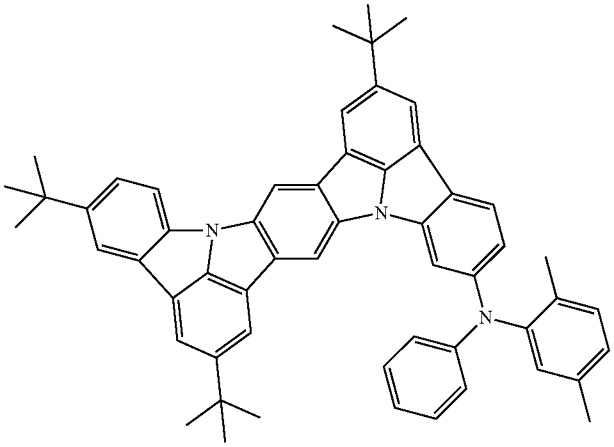

-continued
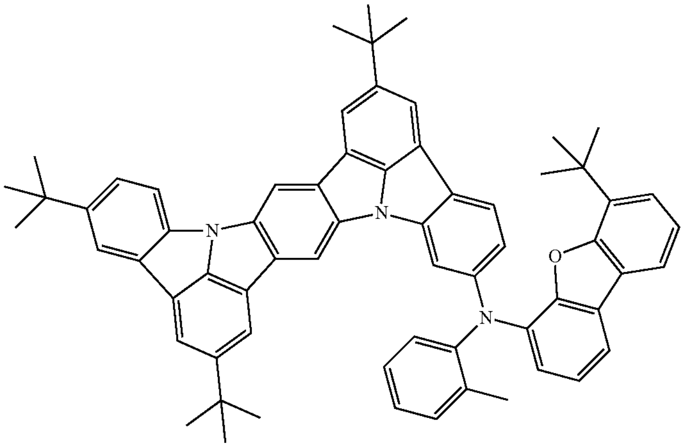
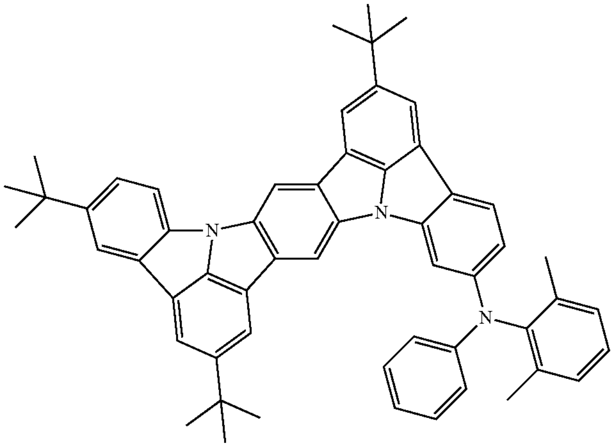
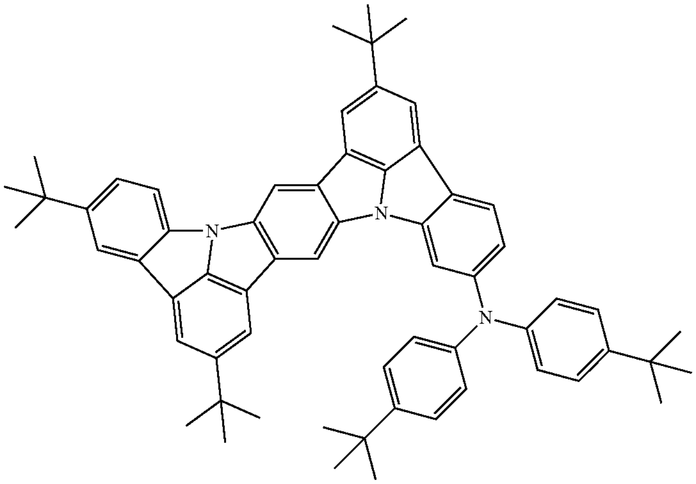

-continued
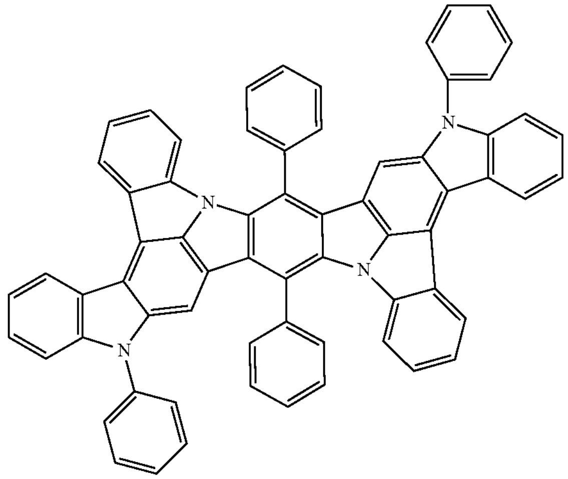
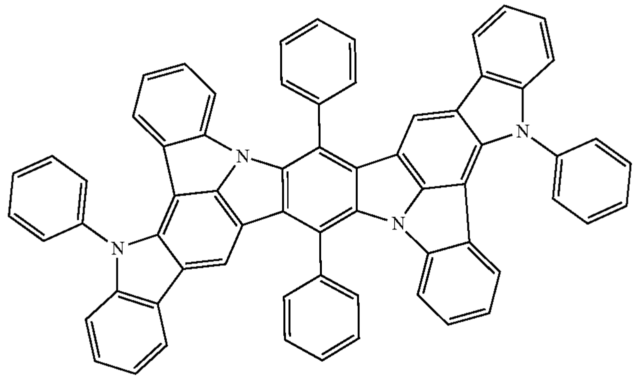
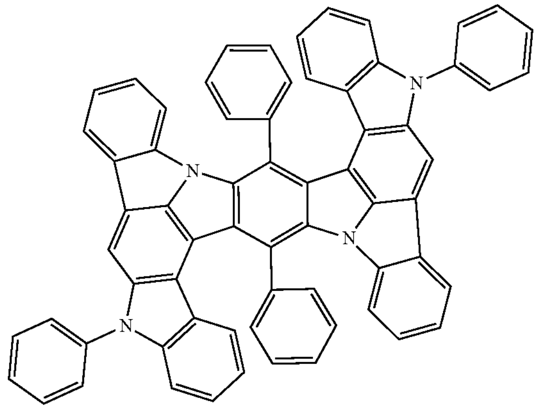
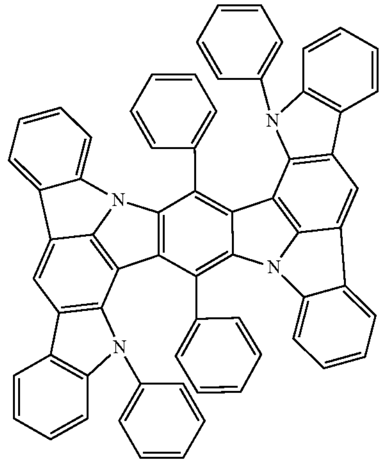

-continued
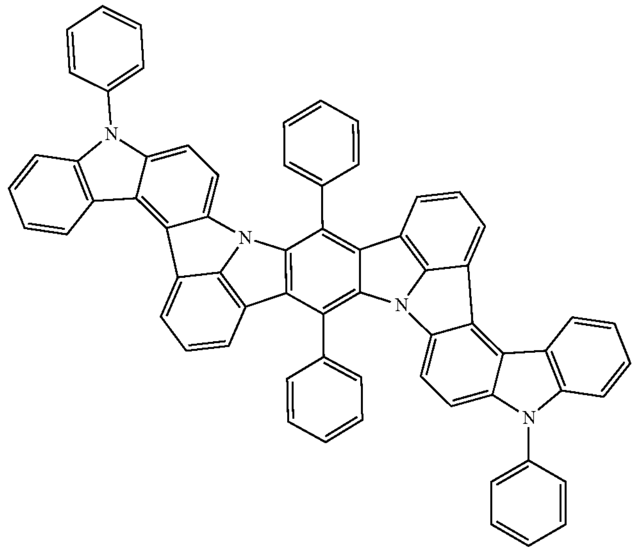
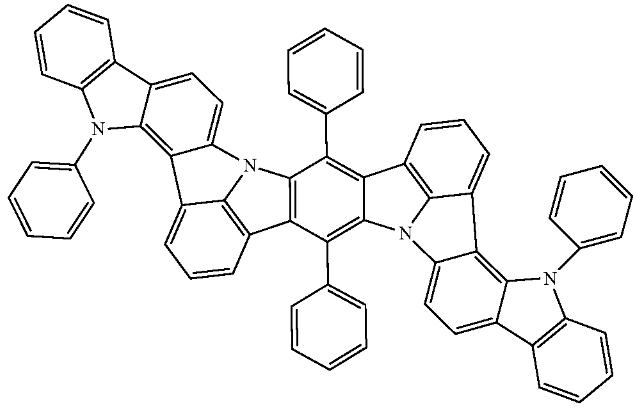
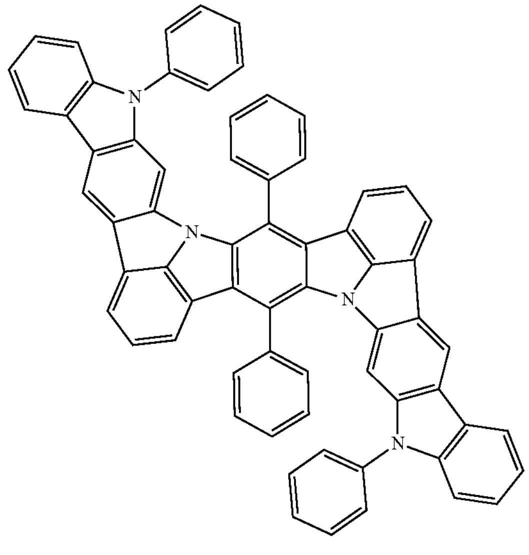

-continued
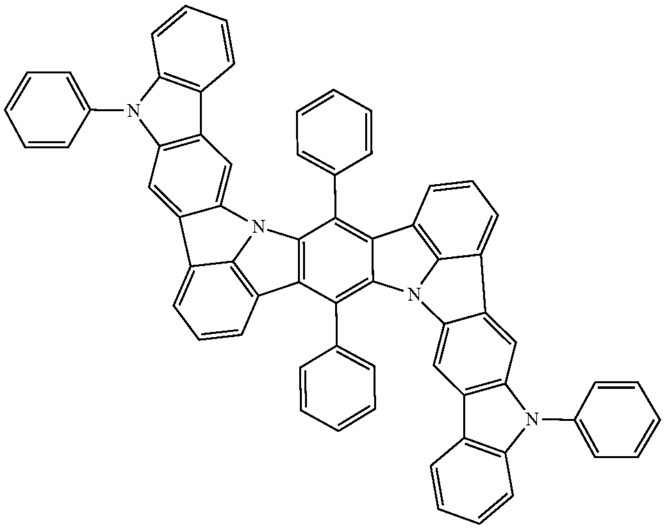
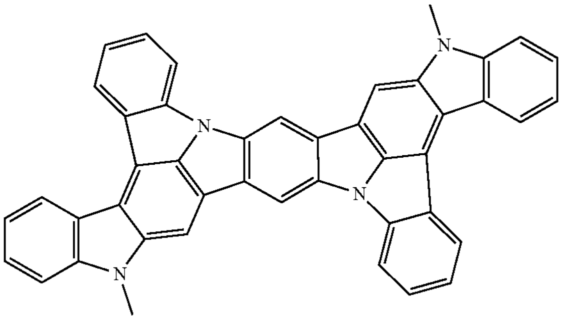
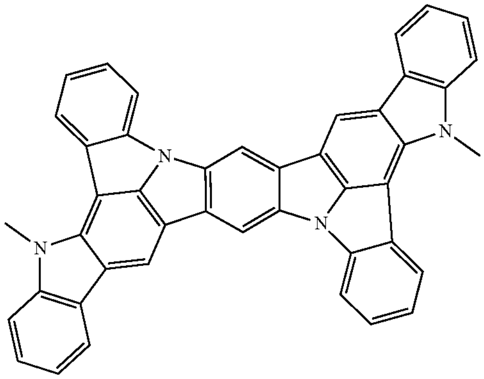
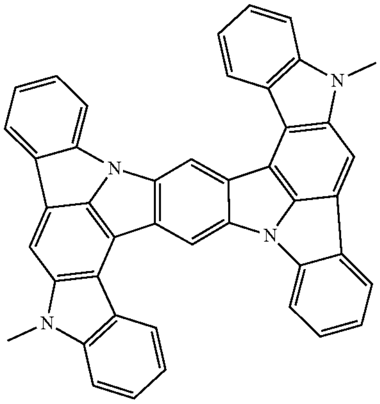
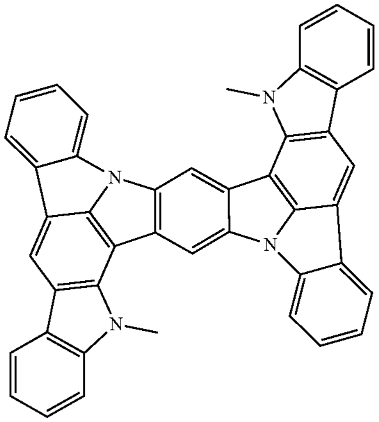
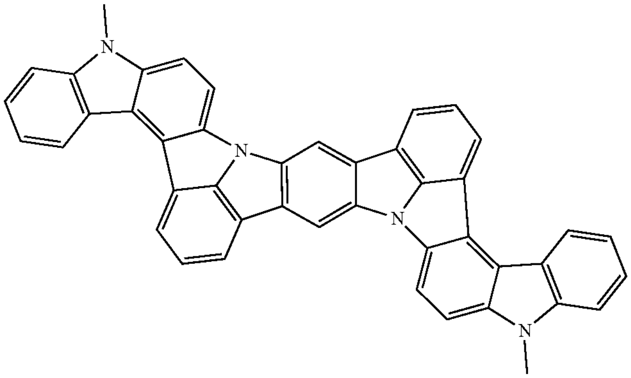

-continued
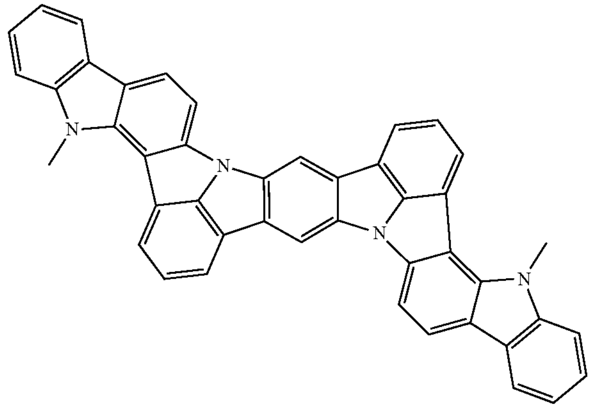
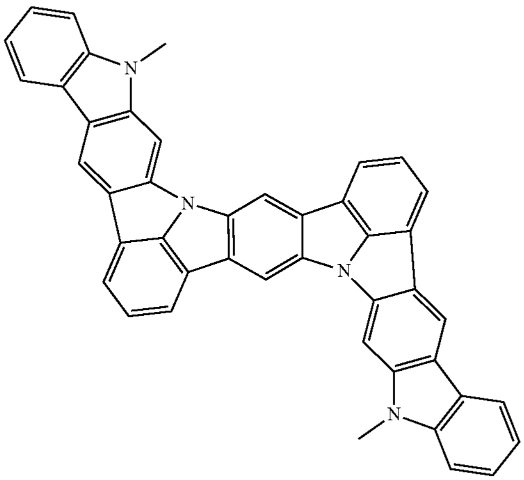
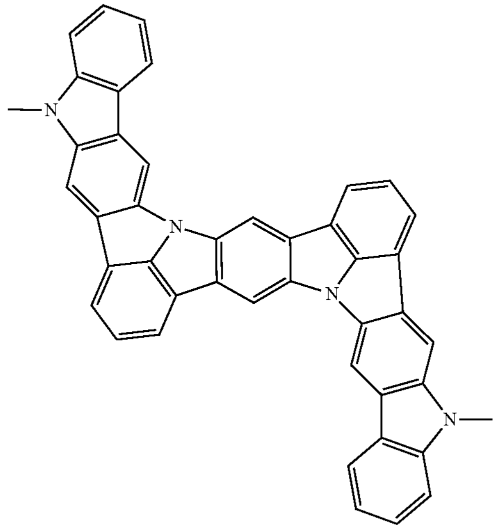
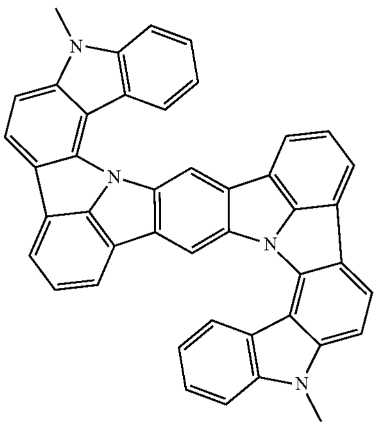
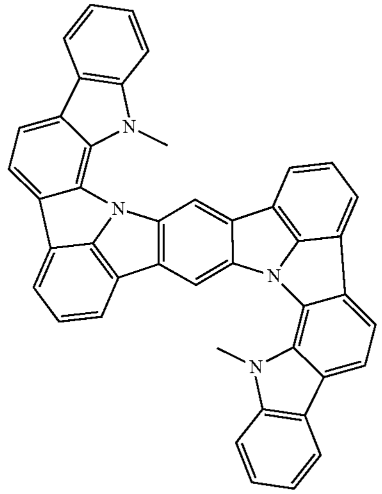

-continued
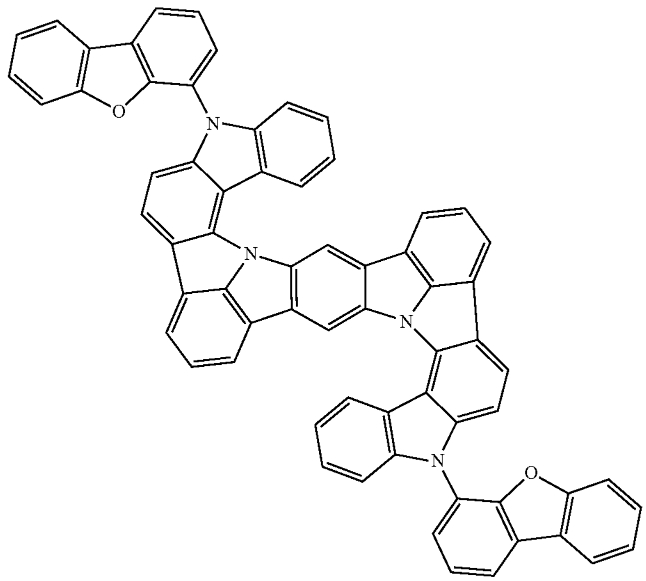
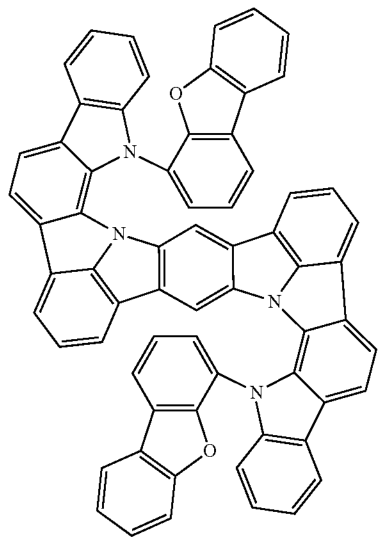
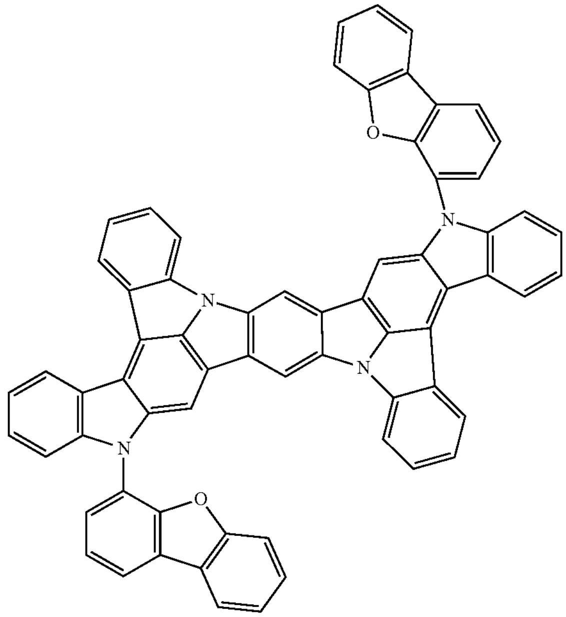
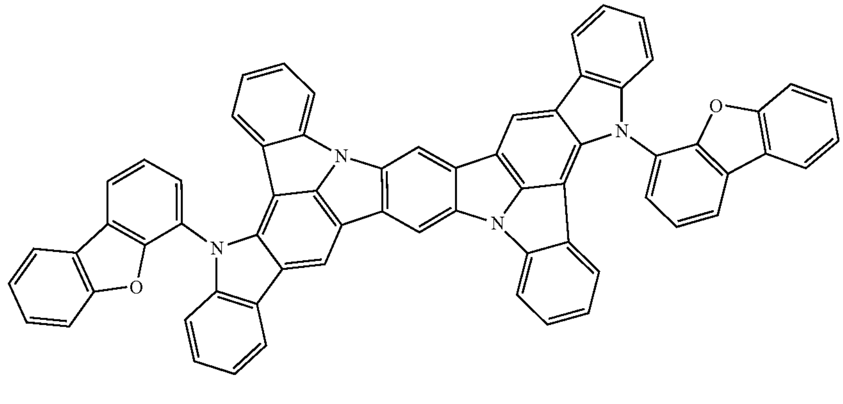

-continued
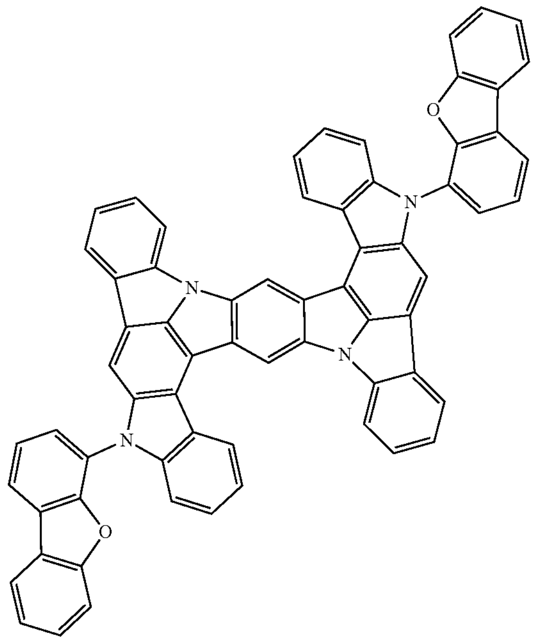
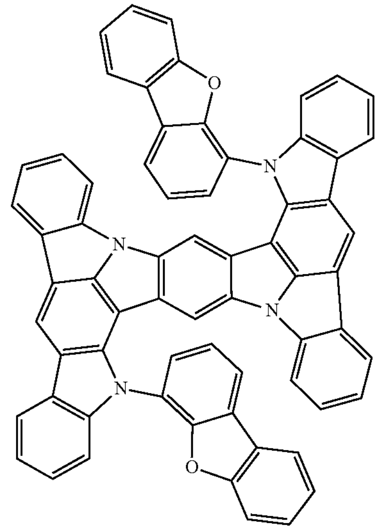
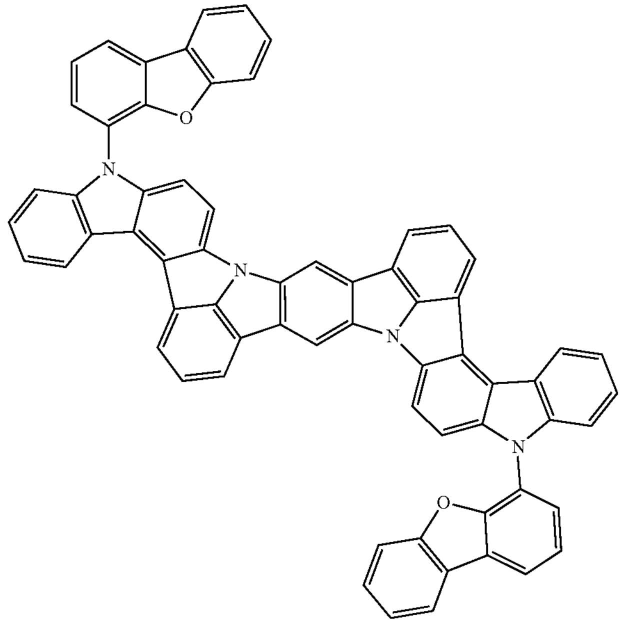
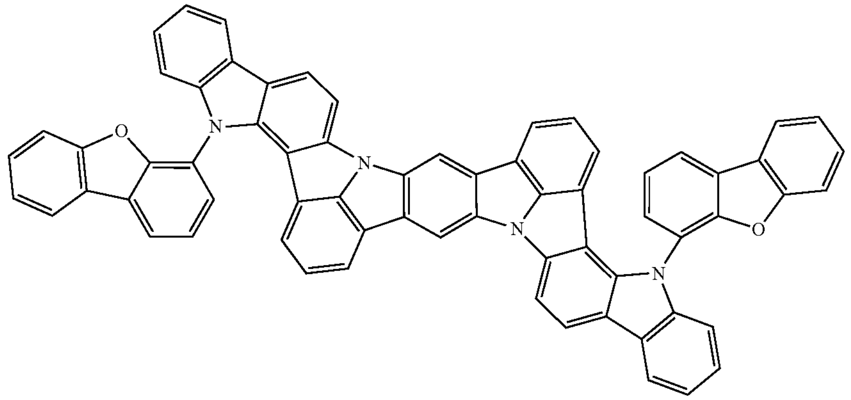

-continued
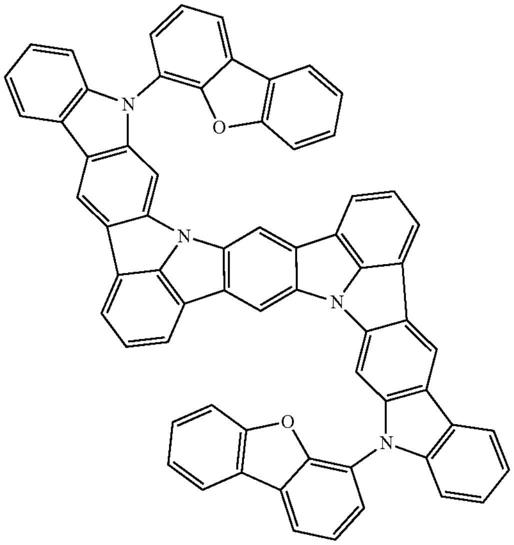
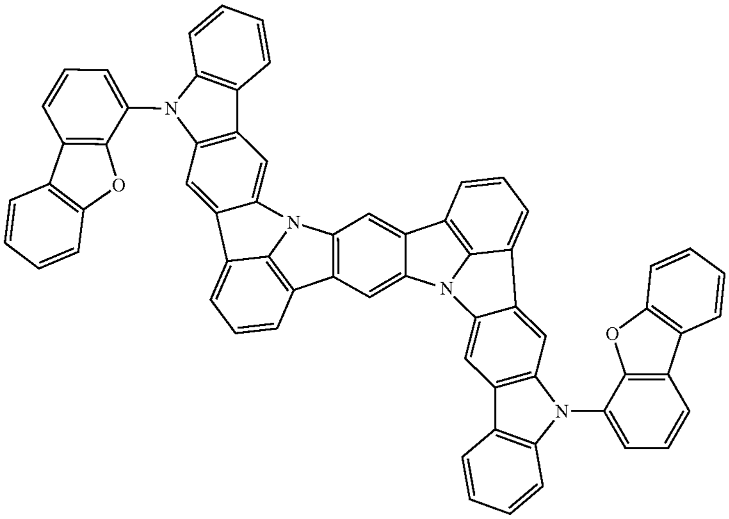
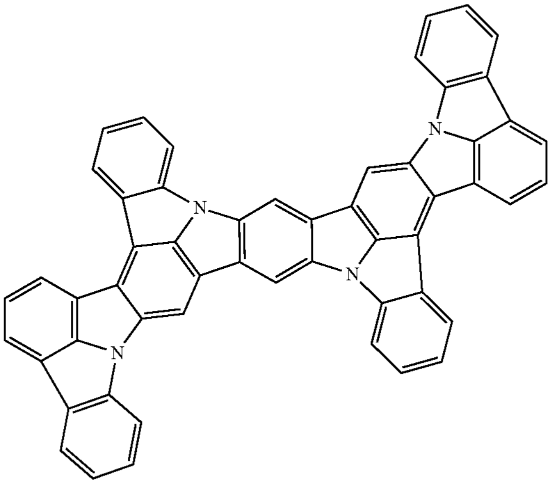

-continued
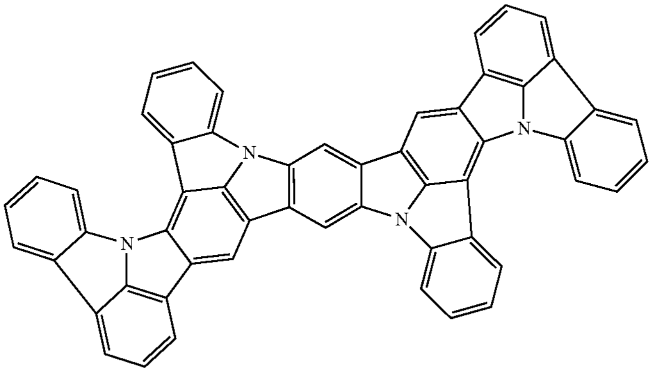
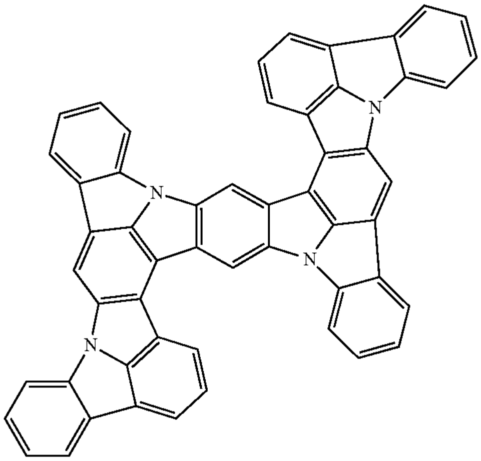
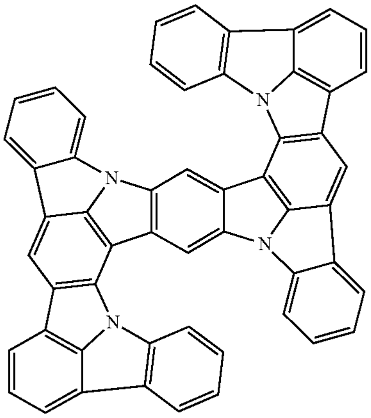
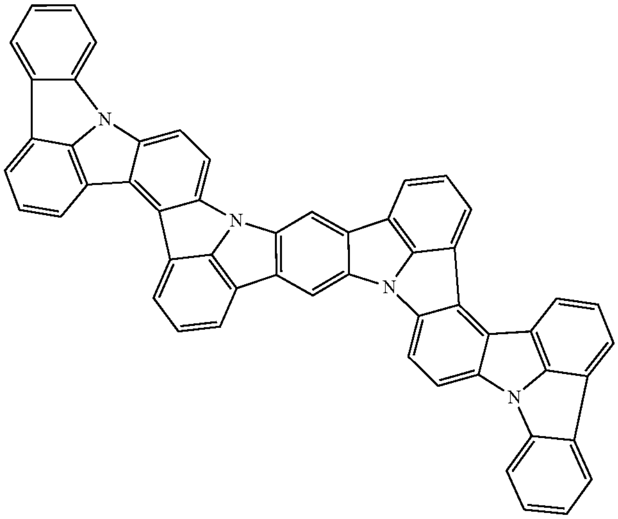

-continued
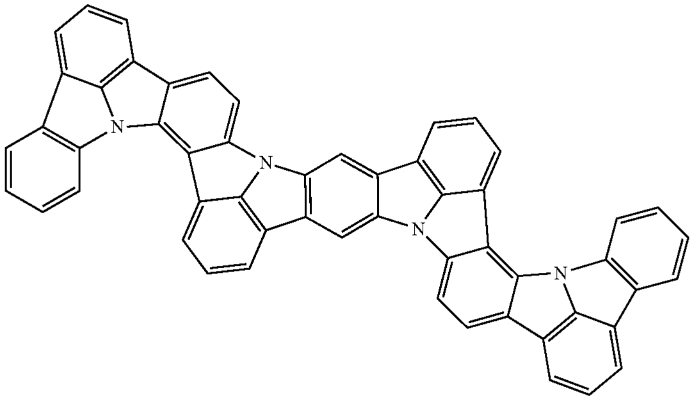
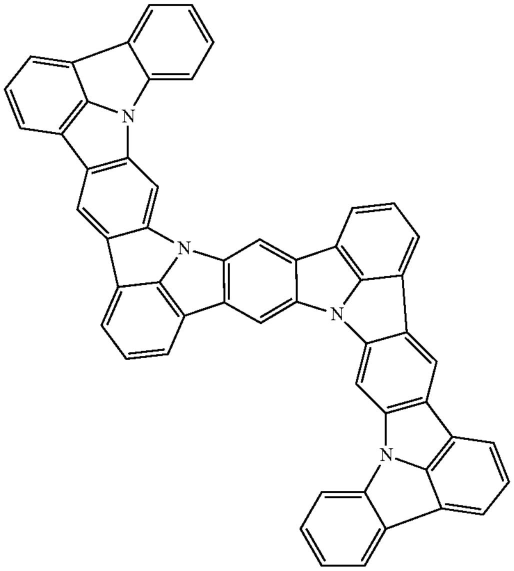
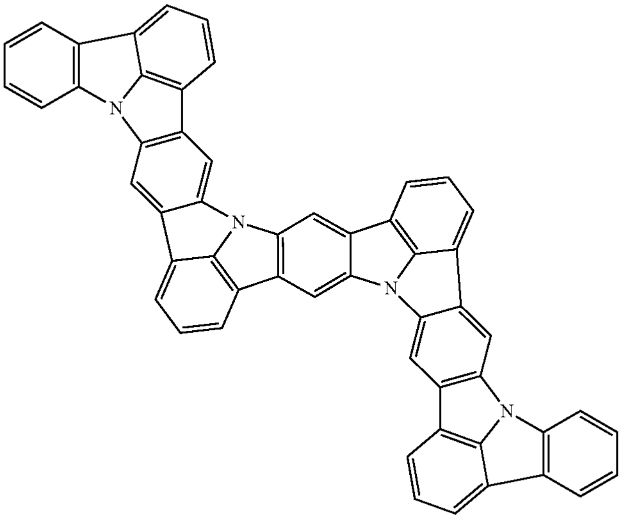
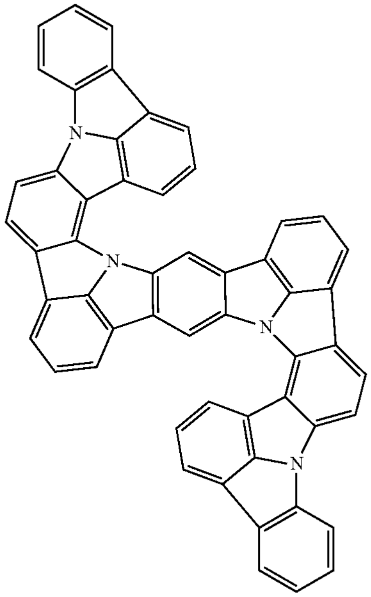
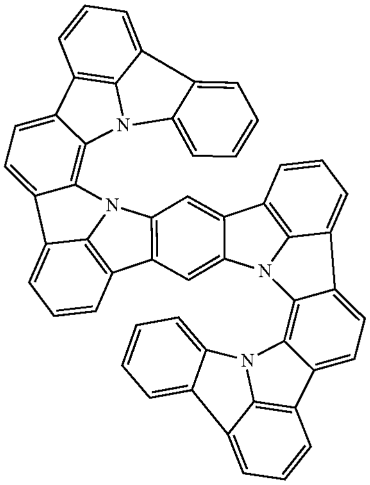

-continued
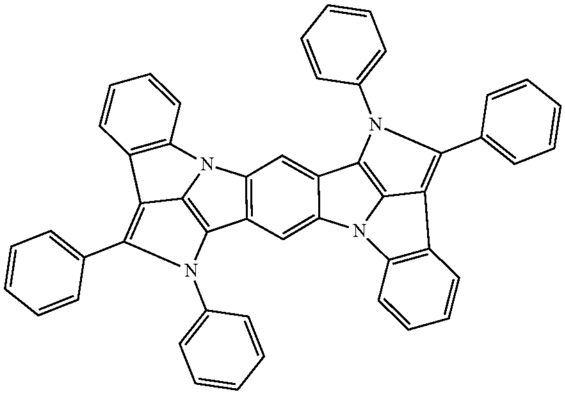
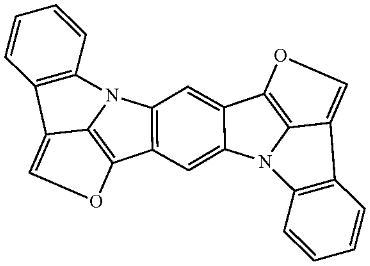
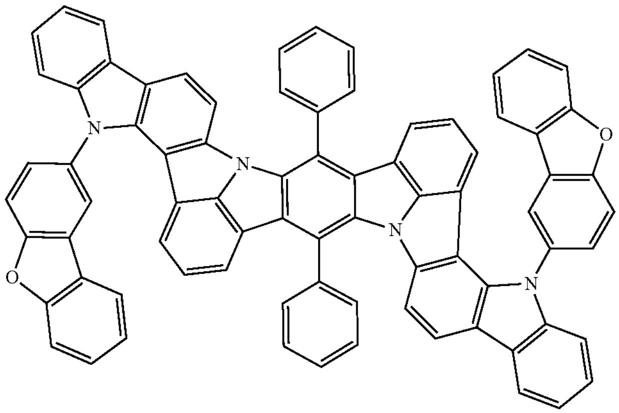
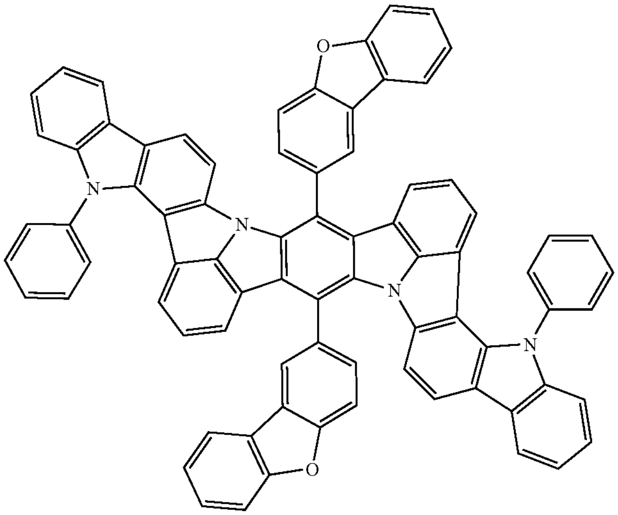
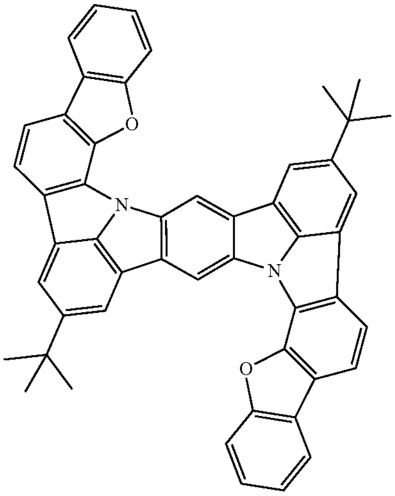

-continued

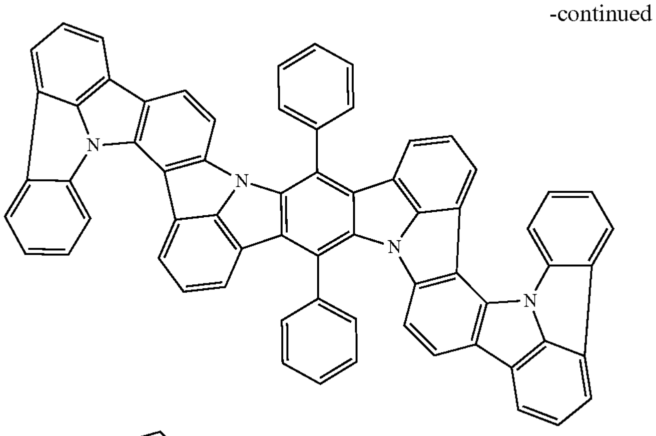

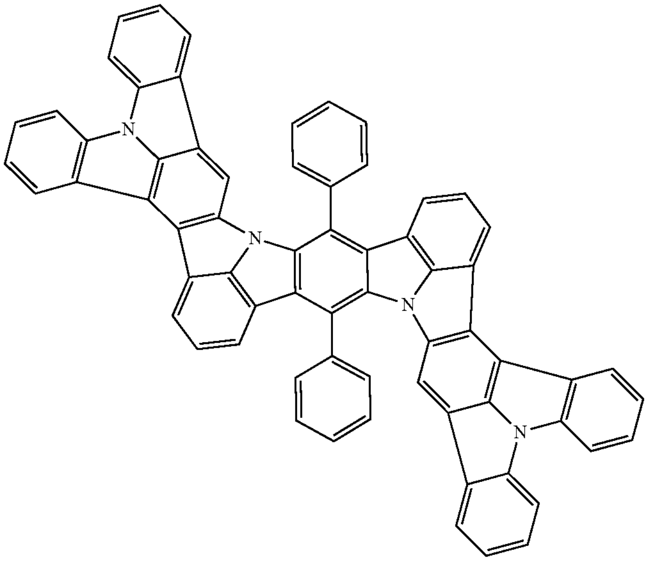

(Compound Represented by Formula (41))

The compound represented by the formula (41) is explained below.

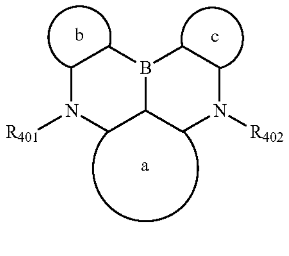

(41)

In the formula (41), a ring a, a ring b and a ring c are independently a substituted or unsubstituted aromatic hydrocarbon ring including 6 to 50 ring carbon atoms, or a substituted or unsubstituted heterocycle including 5 to 50 ring atoms;

$R_{401}$ and $R_{402}$ are independently bonded to the ring a, the ring b or the ring c to form a substituted or unsubstituted heterocycle, or do not form a substituted or unsubstituted heterocycle;

$R_{401}$ and $R_{402}$ that do not form the substituted or unsubstituted heterocycle are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

The ring a, the ring b and the ring c are a ring (a substituted or unsubstituted aromatic hydrocarbon ring including 6 to 50 ring carbon atoms or a substituted or unsubstituted heterocycle including 5 to 50 ring atoms) which is fused to the fused bicyclic structure containing one B atom and two N atoms in the center of the formula (41).

The "aromatic hydrocarbon ring" for the ring a, the ring b and the ring c has the structure same as the compound obtained by introducing a hydrogen atom into the "aryl group" described above. The "aromatic hydrocarbon ring" for the ring a contains three carbon atoms in the fused bicyclic structure in the center of the formula (41) as ring atoms. The "aromatic hydrocarbon ring" for the ring b and the ring c contain two carbon atoms in the fused bicyclic structure in the center of the formula (41) as ring atoms. As examples of the "substituted or unsubstituted aromatic hydrocarbon ring including 6 to 50 ring carbon atoms", compounds obtained by introducing a hydrogen atom into the "aryl group" described in the specific example group G1 and the like can be given.

The "heterocycle" for the ring a, the ring b and the ring c has the structure same as the compound obtained by introducing a hydrogen atom into the "heterocyclic group" described above. The "heterocycle" for the ring a contains three carbon atoms in the fused bicyclic structure in the center of the formula (41) as ring atoms. The "heterocycle" for the ring b and the ring c contains two carbon atoms in the fused bicyclic structure in the center of the formula (41) as ring atoms. As examples of the "substituted or unsubstituted heterocycle including 5 to 50 ring atoms", compounds obtained by introducing a hydrogen atom into the "heterocyclic group" described in the specific example group G2.

$R_{401}$ and $R_{402}$ may be independently bonded to the ring a, the ring b or the ring c to form a substituted or unsubstituted heterocycle. In this case, the heterocycle contains the nitrogen atom in the fused bicyclic structure in the center of the formula (41). In this case, the heterocycle may contain a heteroatom other than the nitrogen atom. "$R_{401}$ and $R_{402}$ are bonded to the ring a, the ring b or the ring c" means, specifically, an atom forming the ring a, the ring b or the ring c is bonded to an atom forming $R_{401}$ and $R_{402}$. For example, $R_{401}$ may be bonded to the ring a to form a nitrogen-containing heterocycle including a fused bicyclic structure (or a fused tricyclic or a fused more polycyclic structure) in which a ring containing $R_{401}$ and the ring a are fused. Specific examples of the nitrogen-containing heterocycle include compounds corresponding to heterocyclic groups of the fused bicyclic or more polycyclic heterocyclic groups containing a nitrogen atom among the specific example groups G2, and the like.

The same applies to the case where $R_{401}$ is bonded to the ring b, the case where $R_{402}$ is bonded to the ring a, and the case where $R_{402}$ is bonded to the ring c.

In one embodiment, the ring a, the ring b and the ring c in the formula (41) are independently a substituted or unsubstituted aromatic hydrocarbon ring including 6 to 50 ring carbon atoms.

In one embodiment, the ring a, the ring b and the ring c in the formula (41) are independently a substituted or unsubstituted benzene ring or a substituted or unsubstituted naphthalene ring.

In one embodiment, $R_{401}$ and $R_{402}$ in the formula (41) are independently a substituted or unsubstituted aryl group including 6 to 50 ring carbon atoms, or a substituted or unsubstituted monovalent heterocyclic group including 5 to 50 ring atoms, and preferably a substituted or unsubstituted aryl group including 6 to 50 ring carbon atoms.

In one embodiment, the compound represented by the formula (41) is a compound represented by the following formula (42):

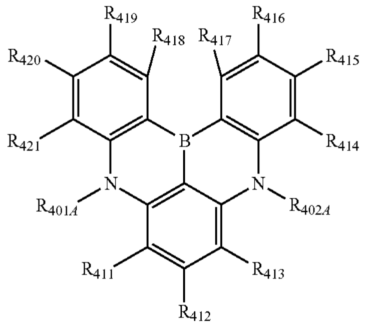

(42)

In the formula (42), $R_{401A}$ is bonded with one or more selected from the group consisting of $R_{411}$ and $R_{421}$ to form a substituted or unsubstituted heterocycle, or does not form a substituted or unsubstituted heterocycle; $R_{402A}$ is bonded with one or more selected from the group consisting of $R_{413}$ or $R_{414}$ to form a substituted or unsubstituted heterocycle, or does not form a substituted or unsubstituted heterocycle;

$R_{401A}$ and $R_{402A}$ that do not form the substituted or unsubstituted heterocycle are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

one or more sets of adjacent two or more of $R_{411}$ to $R_{421}$ form a substituted or unsubstituted, saturated or unsaturated ring by bonding with each other, or do not form a substituted or unsubstituted, saturated or unsaturated ring;

$R_{411}$ to $R_{421}$ that do not form the substituted or unsubstituted heterocycle or the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

and $R_{901}$ to $R_{907}$ are as defined in the formulas (1).

$R_{401A}$ and $R_{402A}$ in the formula (42) are groups corresponding to $R_{401}$ and $R_{402}$ in the formula (41), respectively.

$R_{401A}$ and $R_{411}$ may be bonded with each other to form a nitrogen-containing fused bicyclic (or tricyclic or more polycyclic) heterocycle formed by condensing a fused ring containing $R_{401A}$ and $R_{411}$ with the benzene ring corresponding to the ring a, for example. As examples of the nitrogen-containing heterocycle, compounds corresponding to nitrogen-containing fused bicyclic or more polycyclic heterocyclic group among the specific example group G2 can be given. The same applies to the case where $R_{401A}$ and $R_{412}$ are bonded, the case where $R_{402A}$ and $R_{413}$ are bonded, and the case where $R_{402A}$ and $R_{414}$ are bonded.

One or more sets of adjacent two or more of $R_{411}$ to $R_{421}$ may form a substituted or unsubstituted, saturated or unsaturated ring by bonding with each other. For example, $R_{411}$ and $R_{412}$ may be bonded with each other to form a structure in which a benzene ring, an indole ring, a pyrrole ring, a benzofuran ring, a benzothiophene ring or the like, is fused to the six-membered ring to which $R_{411}$ and $R_{412}$ are bonded, and the formed fused ring becomes a naphthalene ring, a carbazole ring, an indole ring, a dibenzofuran ring or a dibenzothiophene ring.

In one embodiment, $R_{411}$ to $R_{421}$ that are not involved in the formation of the ring are independently a hydrogen atom, a substituted or unsubstituted alkyl group including 1 to 50 carbon atoms, a substituted or unsubstituted aryl group including 6 to 50 ring carbon atoms, or a substituted or unsubstituted monovalent heterocyclic group including 5 to 50 ring atoms.

In one embodiment, $R_{411}$ to $R_{421}$ that are not involved in the formation of the ring are independently a hydrogen atom, a substituted or unsubstituted aryl group including 6 to 50 ring carbon atoms, or a substituted or unsubstituted monovalent heterocyclic group including 5 to 50 ring atoms.

In one embodiment, $R_{411}$ to $R_{421}$ that are not involved in the formation of the ring are independently a hydrogen atom or a substituted or unsubstituted alkyl group including 1 to 50 carbon atoms.

In one embodiment, $R_{411}$ to $R_{421}$ that are not involved in the formation of the ring are independently a hydrogen atom, or a substituted or unsubstituted alkyl group including 1 to 50 carbon atoms, and at least one of $R_{411}$ to $R_{421}$ is a substituted or unsubstituted alkyl group including 1 to 50 carbon atoms.

In one embodiment, the compound represented by the formula (42) is a compound represented by the following formula (43).

(43)

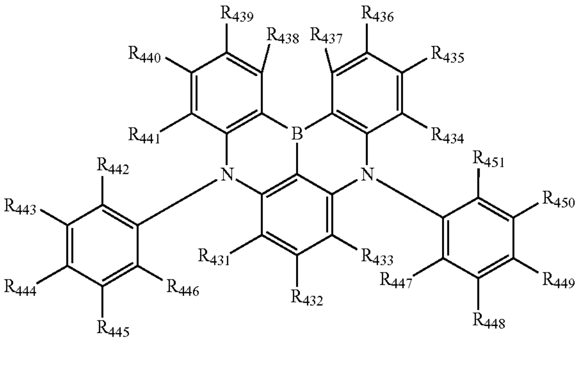

In the formula (43), $R_{431}$ is bonded with $R_{446}$ to form a substituted or unsubstituted heterocycle, or does not form a substituted or unsubstituted heterocycle; $R_{433}$ is bonded with $R_{447}$ to form a substituted or unsubstituted heterocycle, or does not form a substituted or unsubstituted heterocycle; $R_{434}$ is bonded with $R_{451}$ to form a substituted or unsubstituted heterocycle, or does not form a substituted or unsubstituted heterocycle; and $R_{441}$ is bonded with $R_{442}$ to form a substituted or unsubstituted heterocycle, or does not form a substituted or unsubstituted heterocycle;

one or more sets of adjacent two or more of $R_{431}$ to $R_{451}$ form a substituted or unsubstituted, saturated or unsaturated ring by bonding with each other, or do not form a substituted or unsubstituted, saturated or unsaturated ring;

$R_{431}$ to $R_{451}$ that do not form the substituted or unsubstituted heterocycle and do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $—Si(R_{901})(R_{902})(R_{903})$, $—O—(R_{904})$, $—S—(R_{905})$, $—N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formulas (1).

$R_{431}$ may be bonded to $R_{446}$ to form a substituted or unsubstituted heterocycle. For example, $R_{431}$ may be bonded with $R_{446}$ to form a nitrogen-containing fused tricyclic or more polycyclic heterocycle in which the benzene ring to which $R_{446}$ is bonded, a nitrogen-containing ring and the benzene ring corresponding to the ring a are condensed. As examples of such a nitrogen-containing heterocycle, compounds corresponding to nitrogen-containing heterocyclic groups including a fused tricyclic or more polycyclic structure in the specific example group G2 can be given. The same applies to the case where $R_{433}$ and $R_{447}$ are bonded, the case where $R_{434}$ and $R_{451}$ are bonded, and the case where $R_{441}$ and $R_{442}$ are bonded.

In one embodiment, $R_{431}$ to $R_{451}$ that are not involved in the formation of a ring are independently, a hydrogen atom, a substituted or unsubstituted alkyl group including 1 to 50 carbon atoms, a substituted or unsubstituted aryl group including 6 to 50 ring carbon atoms, or a substituted or unsubstituted monovalent heterocyclic group including 5 to 50 ring atoms.

In one embodiment, $R_{431}$ to $R_{451}$ that are not involved in the formation of the ring are independently, a hydrogen atom, a substituted or unsubstituted aryl group including 6 to 50 ring carbon atoms, or a substituted or unsubstituted monovalent heterocyclic group including 5 to 50 ring atoms.

In one embodiment, $R_{431}$ to $R_{451}$ that are not involved in the formation of the ring are independently a hydrogen atom or a substituted or unsubstituted alkyl group including 1 to 50 carbon atoms.

In one embodiment, $R_{431}$ to $R_{451}$ that are not involved in the formation of the ring are independently a hydrogen atom, or a substituted or unsubstituted alkyl group including 1 to 50 carbon atoms, and at least one of $R_{431}$ to $R_{451}$ is a substituted or unsubstituted alkyl group including 1 to 50 carbon atoms.

In one embodiment, the compound represented by the formula (43) is a compound represented by the following formula (43A).

(43A)

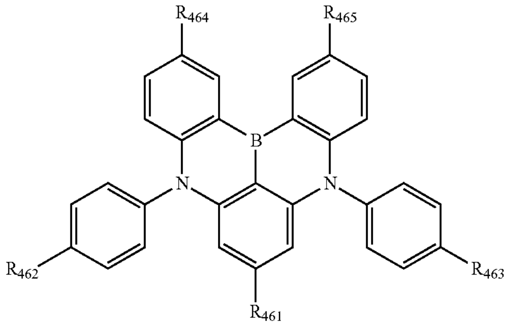

In the formula (43A), $R_{461}$ is a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, or a substituted or unsubstituted aryl group including 6 to 50 ring carbon atoms; and $R_{462}$ to $R_{465}$ are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, or a substituted or unsubstituted aryl group including 6 to 50 ring carbon atoms.

In one embodiment, $R_{461}$ to $R_{465}$ are independently a substituted or unsubstituted alkyl group including 1 to 50 carbon atoms, or a substituted or unsubstituted aryl group including 6 to 50 ring carbon atoms.

In one embodiment, $R_{461}$ and $R_{465}$ are independently a substituted or unsubstituted alkyl group including 1 to 50 carbon atoms.

In one embodiment, the compound represented by the formula (43) is a compound represented by the following formula (43B).

(43B)

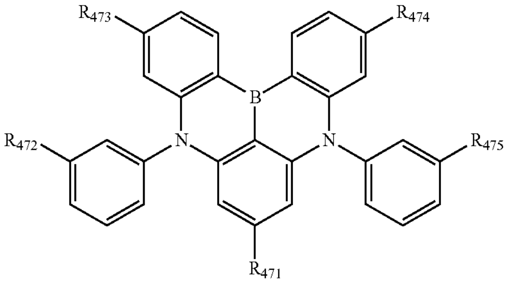

In the formula (43B), $R_{471}$ and $R_{472}$ are independently, a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$N(R_{906})(R_{907})$, or a substituted or unsubstituted aryl group including 6 to 50 ring carbon atoms;

$R_{47}$ to $R_{475}$ are independently, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$N(R_{906})(R_{907})$, or a substituted or unsubstituted aryl group including 6 to 50 ring carbon atoms; and $R_{906}$ and $R_{907}$ are as defined in the formulas (1).

In one embodiment, the compound represented by the formula (43) is a compound represented by the following formula (43B').

(43B)

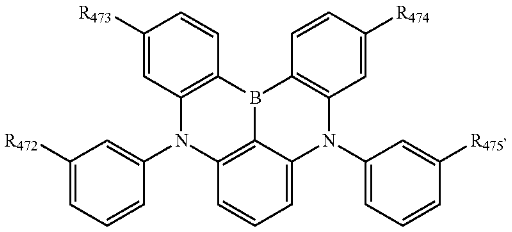

In the formula (43B'), $R_{472}$ to $R_{475}$ are as defined in the formula (43B).

In one embodiment, at least one of $R_{471}$ to $R_{475}$ is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —N($R_{906}$)($R_{907}$), or a substituted or unsubstituted aryl group including 6 to 50 ring carbon atoms.

In one embodiment, $R_{472}$ is a hydrogen atom, a substituted or unsubstituted alkyl group including 1 to 50 carbon atoms, —N($R_{906}$)($R_{907}$), or a substituted or unsubstituted aryl group including 6 to 50 ring carbon atoms; and $R_{471}$ and $R_{473}$ to $R_{475}$ are independently a substituted or unsubstituted alkyl group including 1 to 50 carbon atoms, —N($R_{906}$)($R_{907}$), or a substituted or unsubstituted aryl group including 6 to 50 ring carbon atoms.

In one embodiment, the compound represented by the formula (43) is a compound represented by the following formula (43C).

(43C)

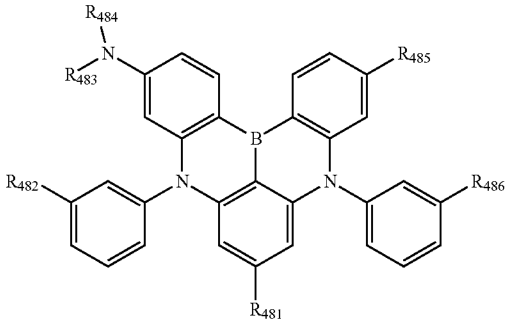

In the formula (43C), $R_{481}$ and $R_{482}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, or a substituted or unsubstituted aryl group including 6 to 50 ring carbon atoms; and $R_{483}$ to $R_{486}$ are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, or a substituted or unsubstituted aryl group including 6 to 50 ring carbon atoms.

In one embodiment, the compound represented by the formula (43) is a compound represented by the following formula (43C').

(43C)

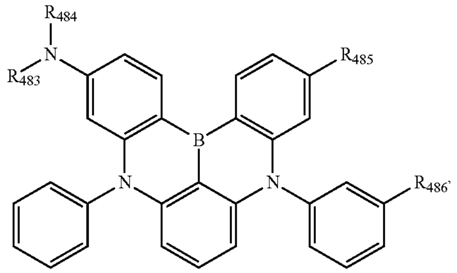

In the formula (43C'), $R_{483}$ to $R_{486}$ are as defined in the formula (43C).

In one embodiment, $R_{481}$ to $R_{486}$ are independently a substituted or unsubstituted alkyl group including 1 to 50 carbon atoms or a substituted or unsubstituted aryl group including 6 to 50 ring carbon atoms.

In one embodiment, $R_{481}$ to $R_{486}$ are independently a substituted or unsubstituted aryl group including 6 to 50 ring carbon atoms.

In one embodiment, the compound represented by the formula (43) is a compound represented by the following formula (43D).

(43D)

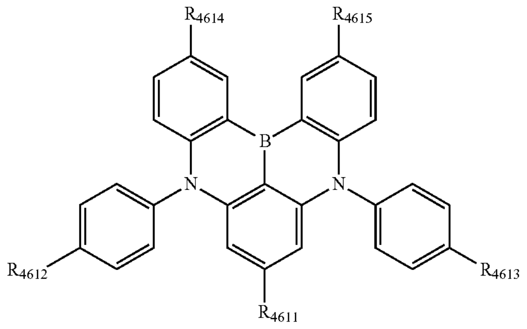

In the formula (43D), $R_{4611}$ is a hydrogen atom, an unsubstituted alkyl group including 1 to 6 carbon atoms, an unsubstituted cycloalkyl group including 3 to 10 ring carbon atoms, —Si($R_{911}$)($R_{912}$)($R_{913}$), or —N($R_{914}$)($R_{915}$);

$R_{4612}$ to $R_{4615}$ are independently an unsubstituted alkyl group including 1 to 6 carbon atoms, an unsubstituted cycloalkyl group including 3 to 10 ring carbon atoms, or —Si($R_{911}$)($R_{912}$)($R_{913}$);

$R_{911}$ to $R_{913}$ are independently an unsubstituted alkyl group including 1 to 6 carbon atoms or an unsubstituted aryl group including 6 to 18 ring carbon atoms; and $R_{914}$ to $R_{915}$ are independently an unsubstituted aryl group having 6 to 18 ring carbon atoms.

In one embodiment, in the formula (43D), $R_{4611}$ is a hydrogen atom, an unsubstituted alkyl group including 1 to 6 carbon atoms, or —N($R_{914}$)($R_{915}$).

In one embodiment, in the formula (43D), $R_{4612}$ to $R_{4615}$ are independently an unsubstituted alkyl group including 1 to 6 carbon atoms or an unsubstituted cycloalkyl group including 3 to 10 ring carbon atoms.

In one embodiment, in the formula (43D), $R_{4611}$ is —N($R_{914}$)($R_{915}$), and $R_{4612}$ to $R_{4615}$ are independently an unsubstituted alkyl group including 1 to 6 carbon atoms.

In one embodiment, in the formula (43D), $R_{4611}$ is an unsubstituted alkyl group including 1 to 6 carbon atoms, and $R_{4612}$ to $R_{4615}$ are independently an unsubstituted alkyl group including 1 to 6 carbon atoms.

In one embodiment, in the formula (43D), $R_{4611}$ is a hydrogen atom, and $R_{4612}$ to $R_{4615}$ are independently an unsubstituted alkyl group including 1 to 6 carbon atoms or an unsubstituted cycloalkyl group including 3 to 10 ring carbon atoms.

In one embodiment, in the formula (43D), at least one hydrogen atom contained in one or more selected from the group consisting of $R_{914}$ and $R_{915}$ is a deuterium atom.

The compound represented by the formula (41) can be synthesized by the following method. An intermediate is obtained by bonding the ring a, the ring b and the ring c with linking groups (a group containing N—$R_1$ and a group containing N—$R_2$) (first reaction), and a final compound is obtained by bonding the ring a, the ring b and the ring c with a linking group (a group containing B) (second reaction). In the first reaction, an amination reaction such as Buchwald-Hartwig reaction can be applied. In the second reaction, tandem hetero-Friedel-Crafts reaction or the like can be applied.

Examples of the compound represented by the formula (41) are described below. They are just exemplified compounds, and the compound represented by the formula (41) is not limited to the following examples. In the following specific examples, "Me" represents a methyl group, and "tBu" represents a tert-butyl group.

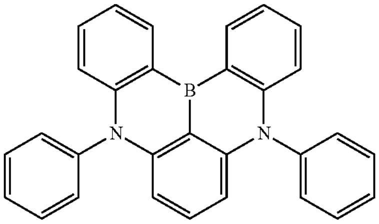

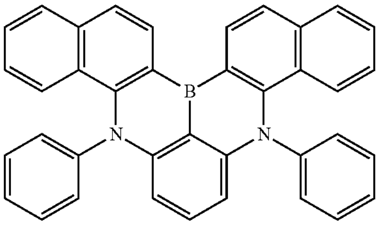

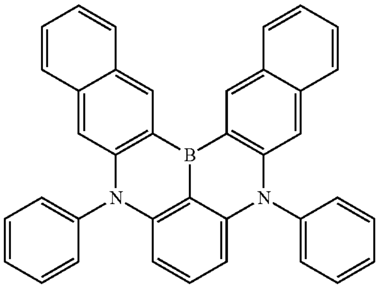

-continued

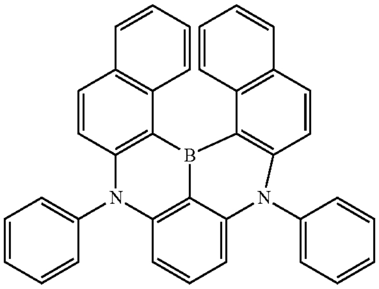

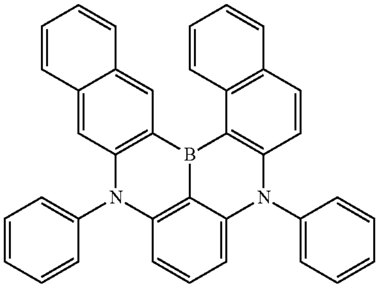

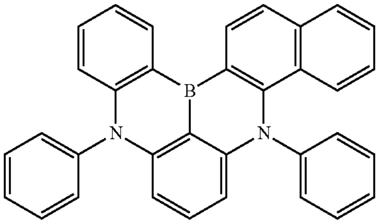

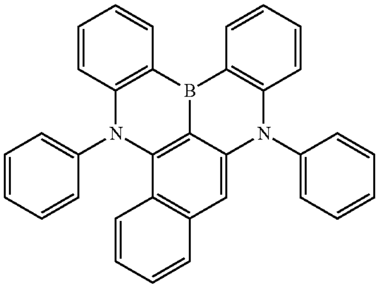

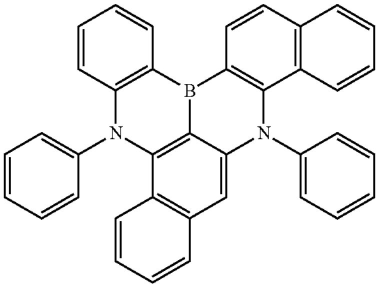

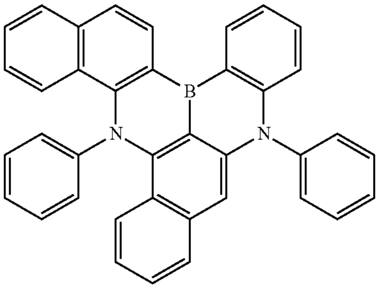

-continued
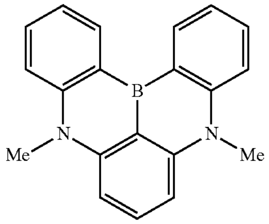
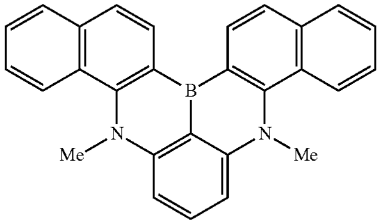
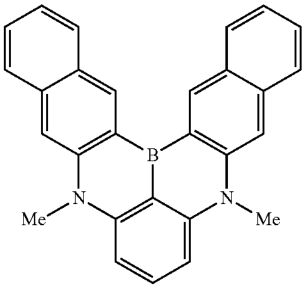
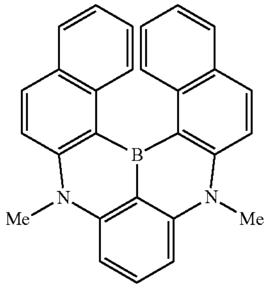
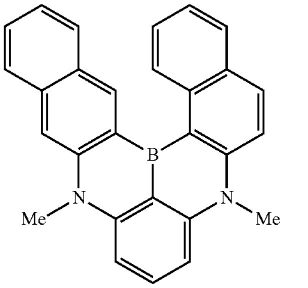
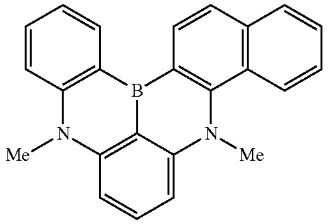
-continued
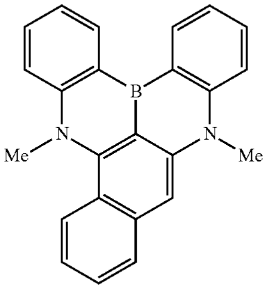
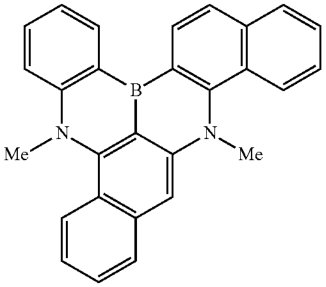
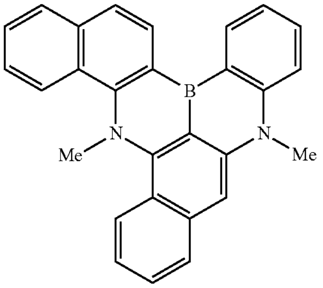
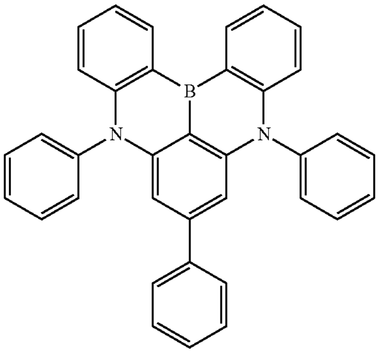
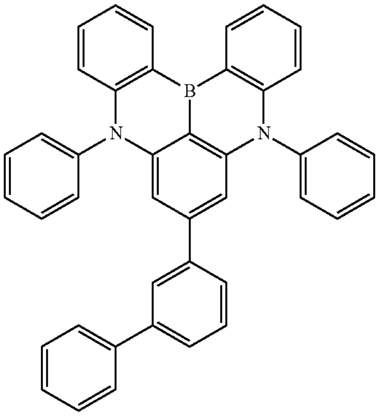

-continued
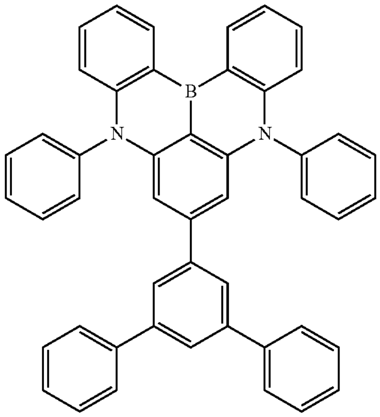
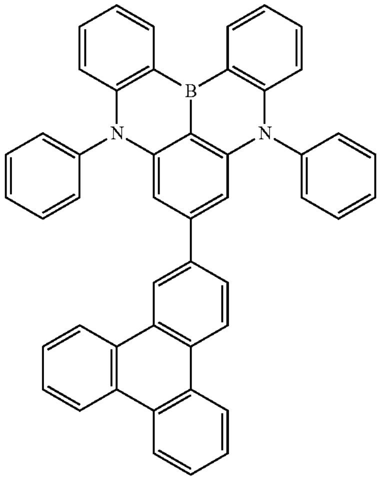
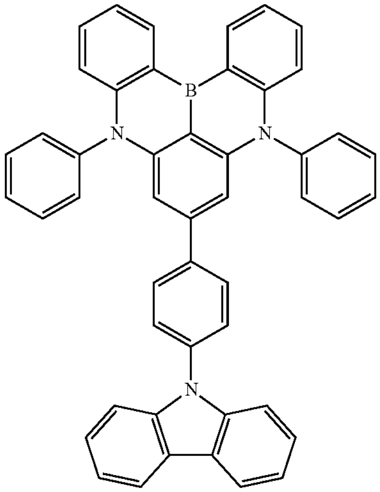
-continued
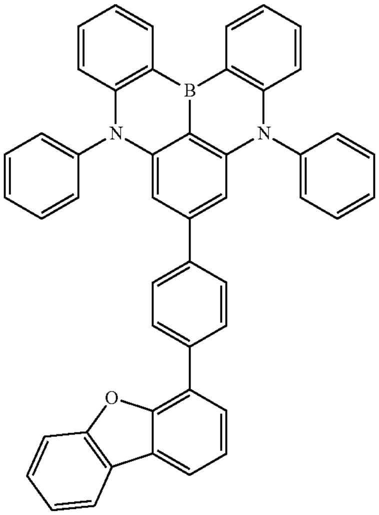
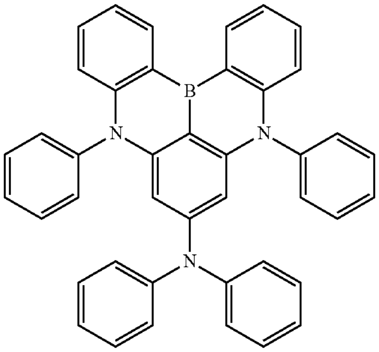
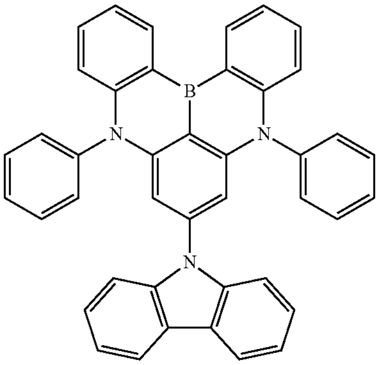
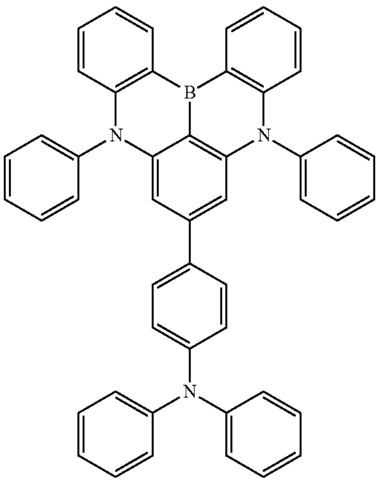

-continued
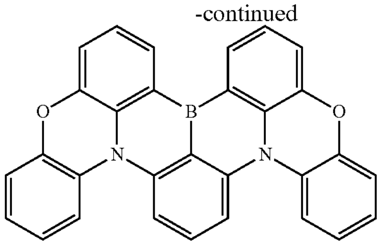
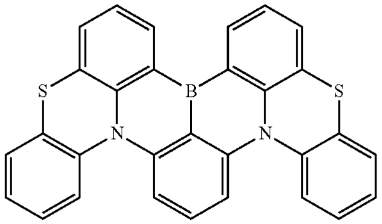
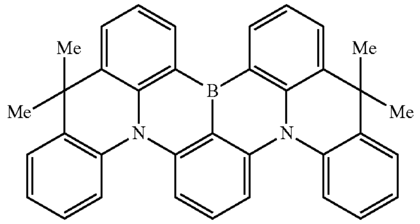
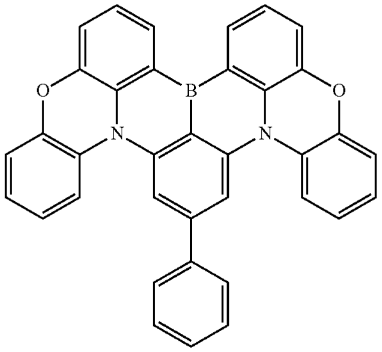
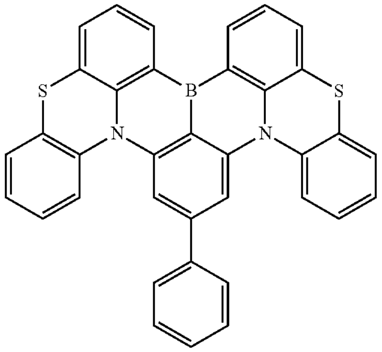
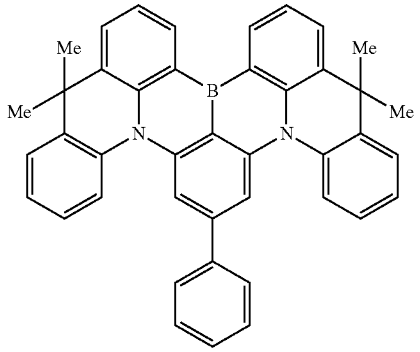
-continued
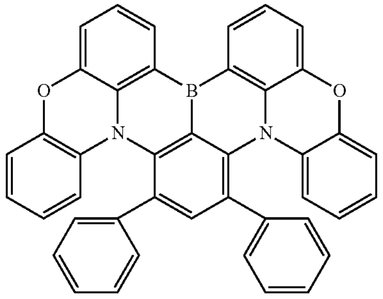
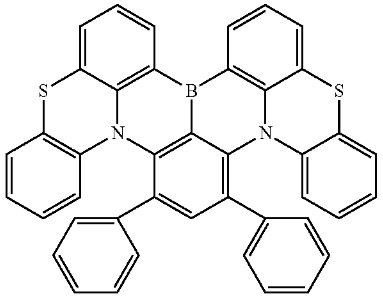
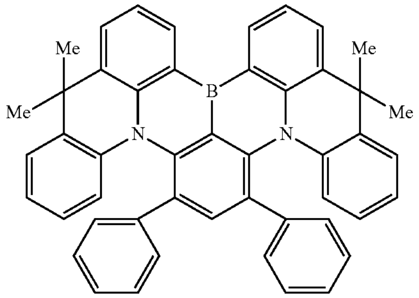
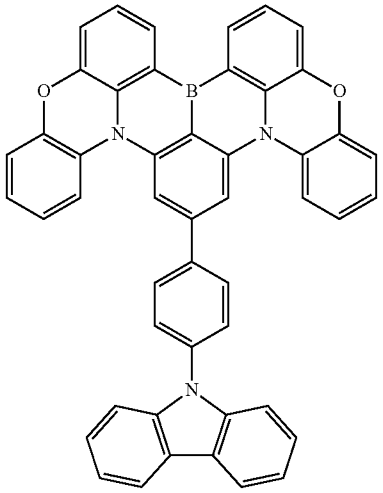

-continued
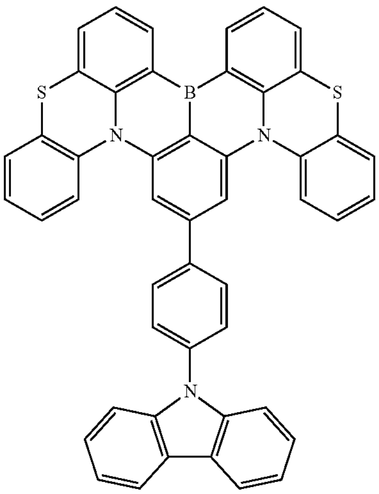
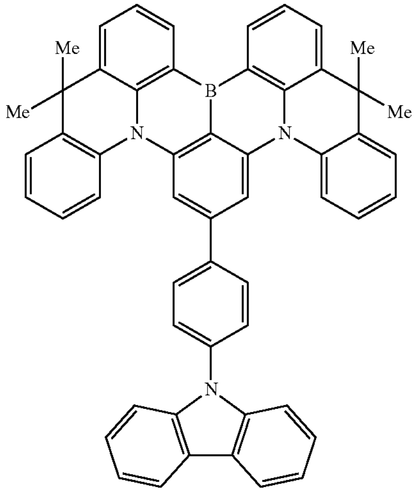
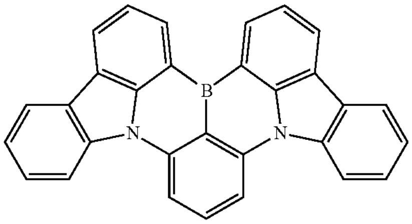
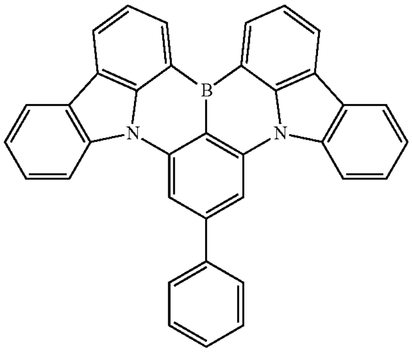
-continued
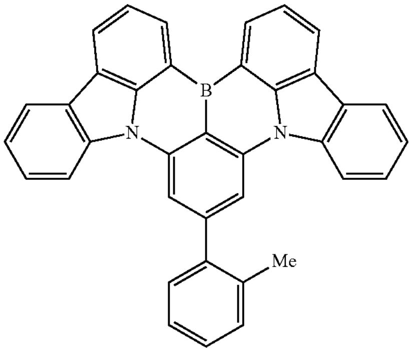
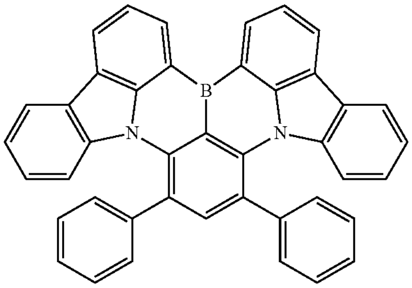
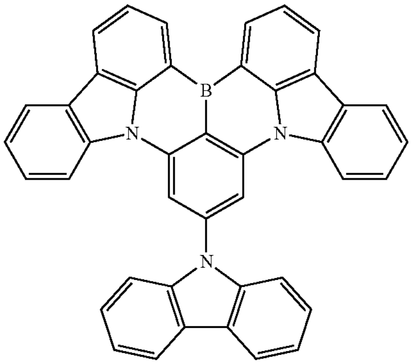
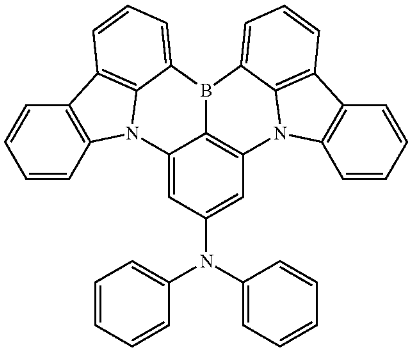
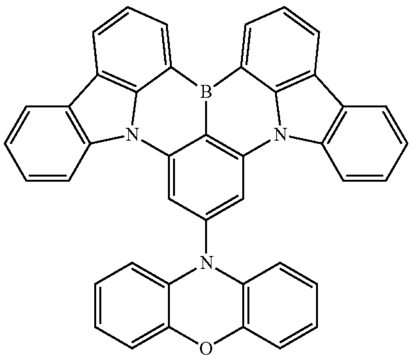

-continued
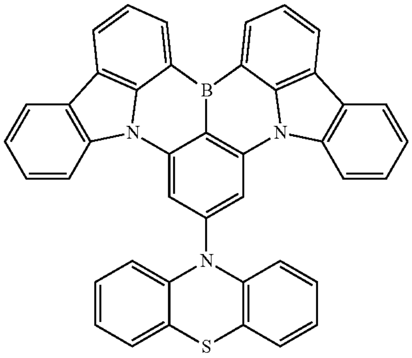
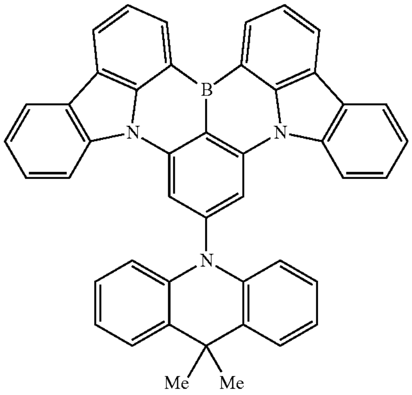
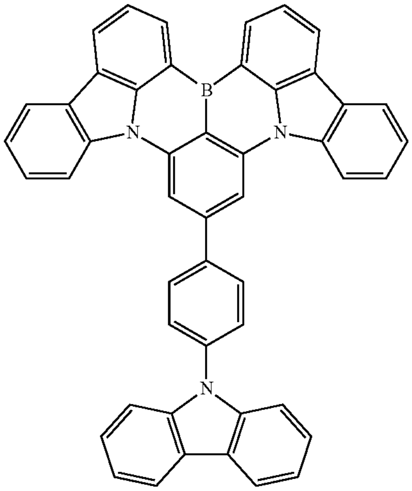
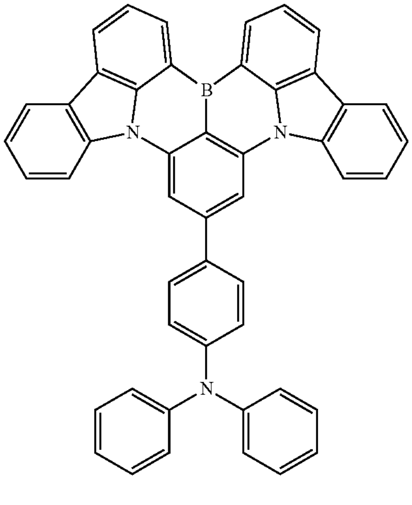
-continued
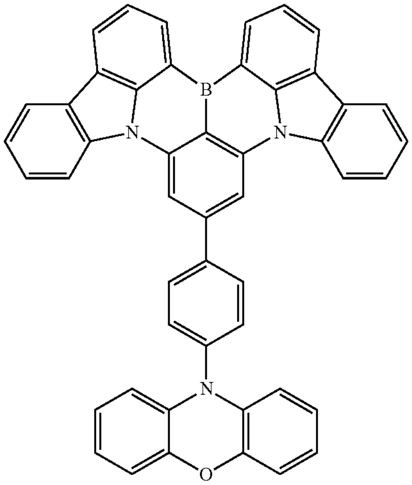
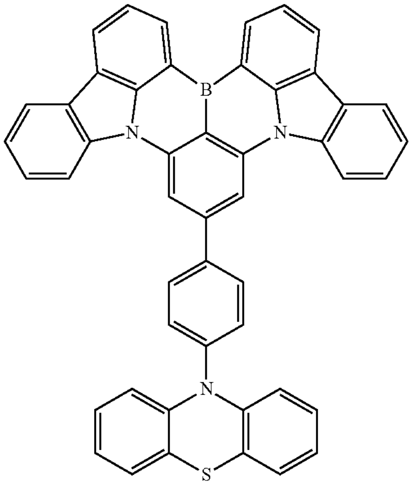
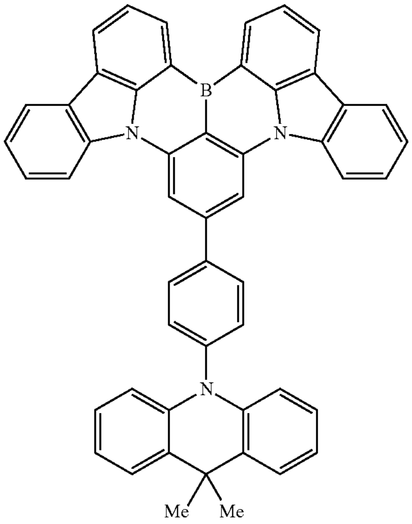

-continued
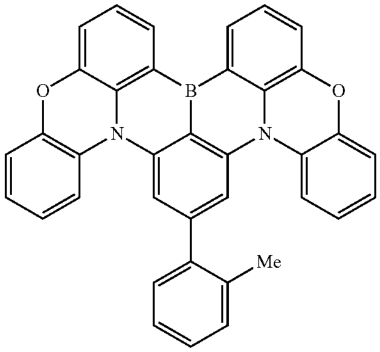
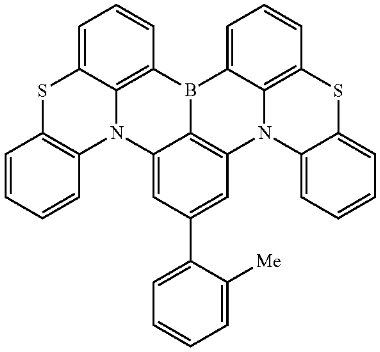
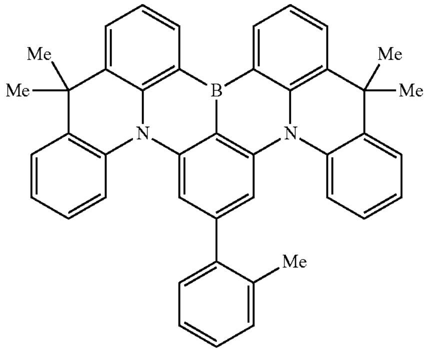
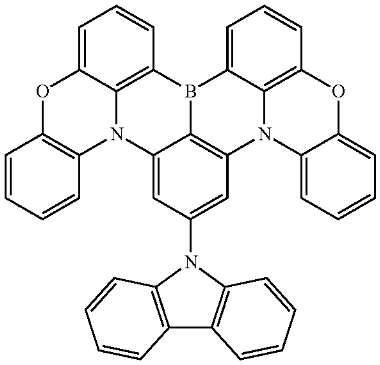
-continued
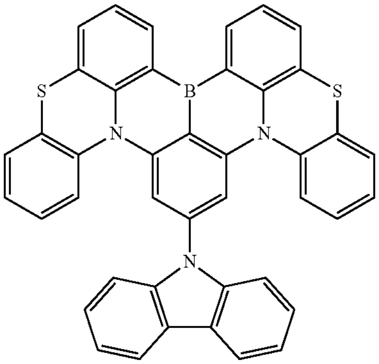
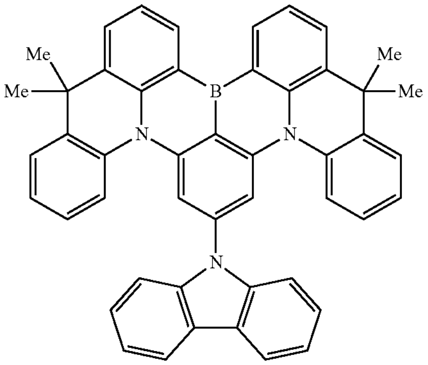
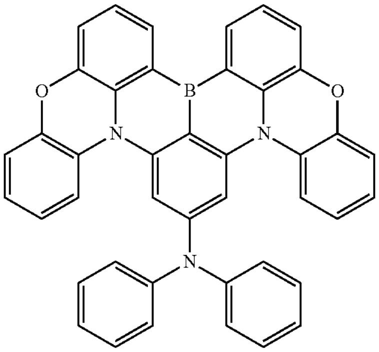
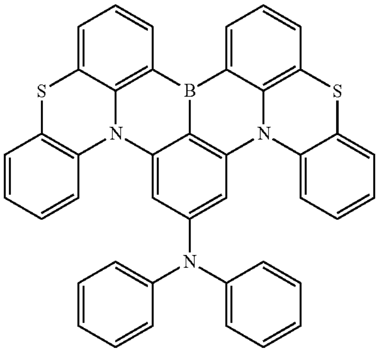

-continued
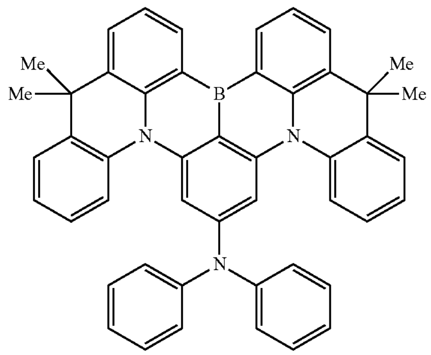
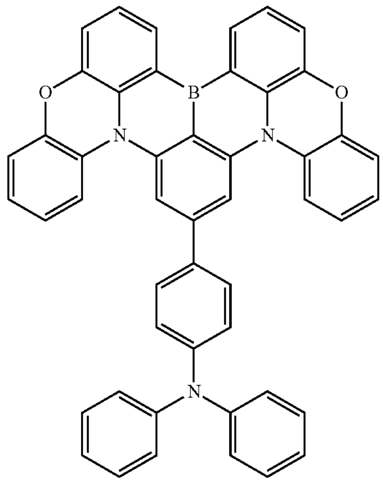
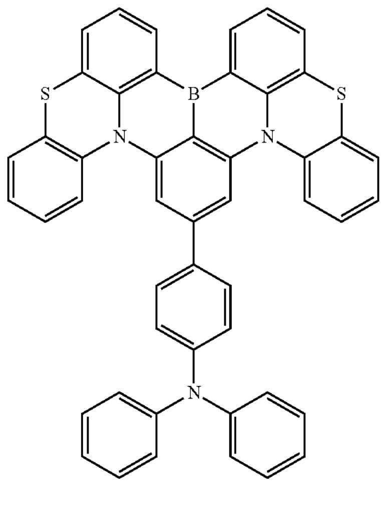
-continued
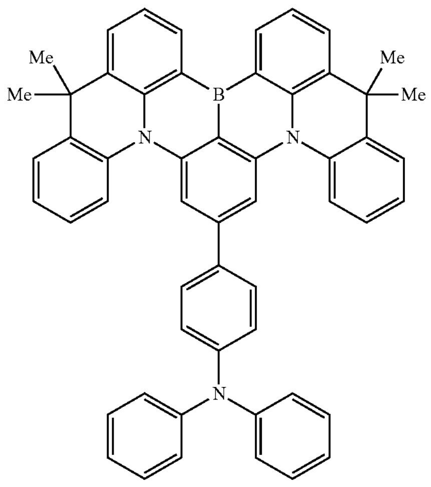
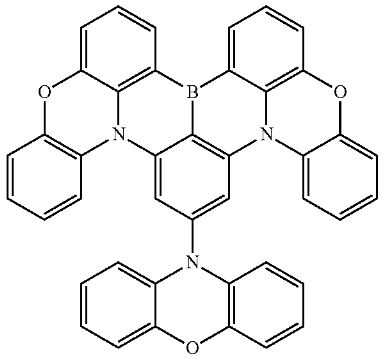
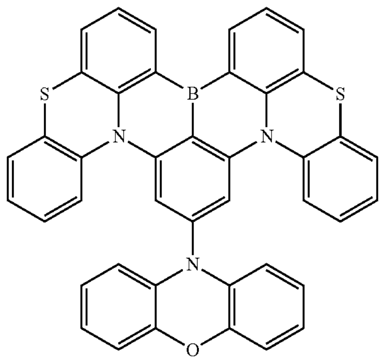
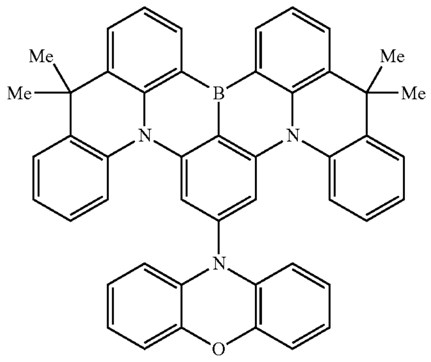

-continued
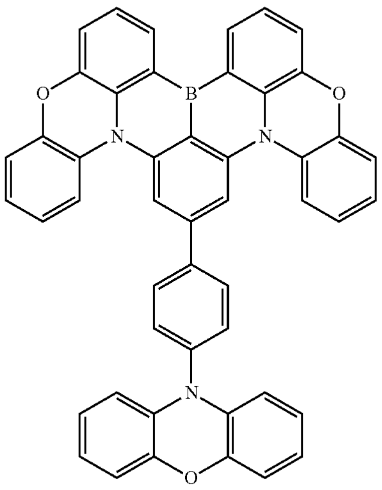
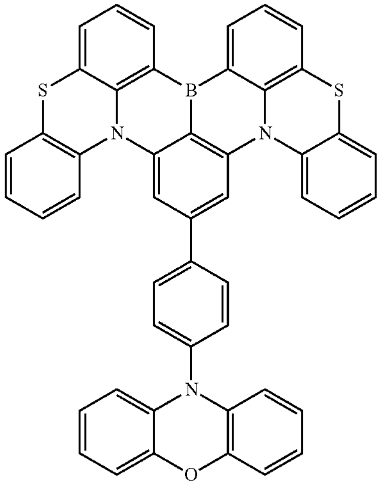
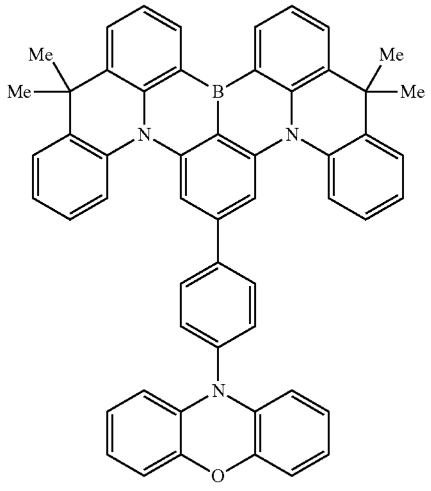
-continued
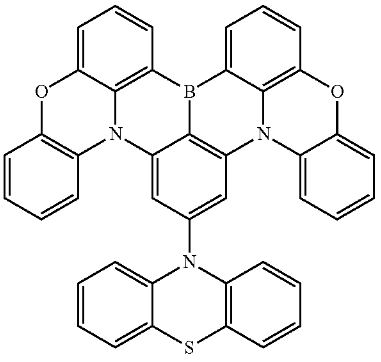
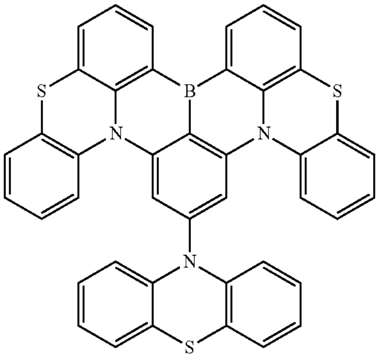
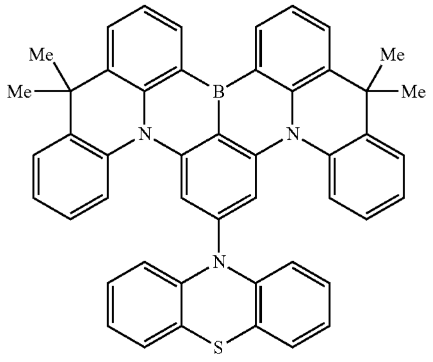
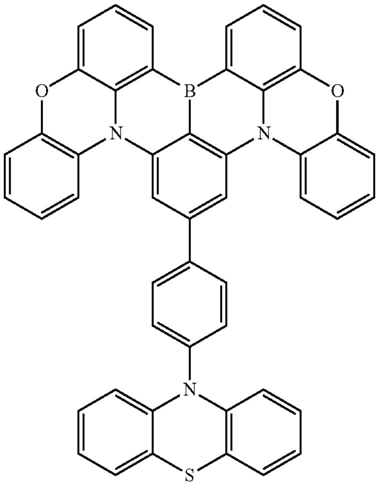

-continued
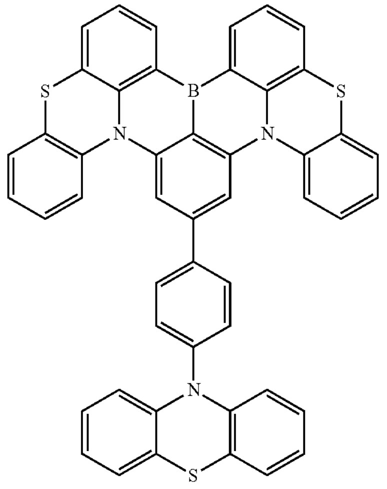
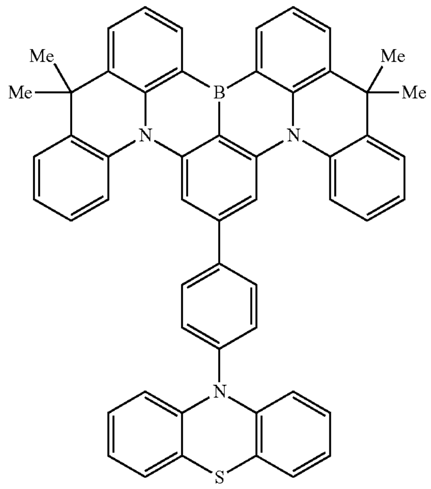
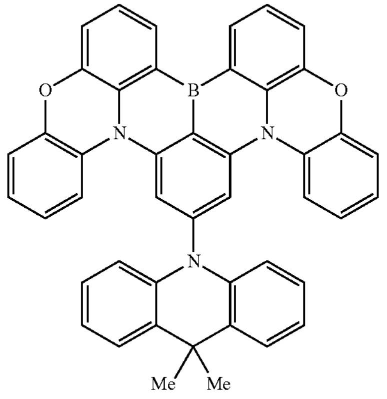
-continued
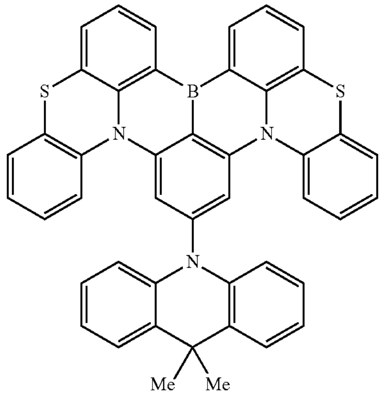
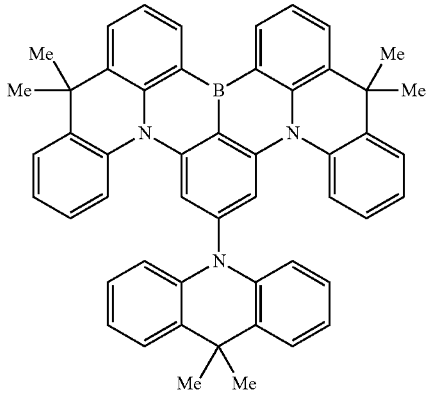
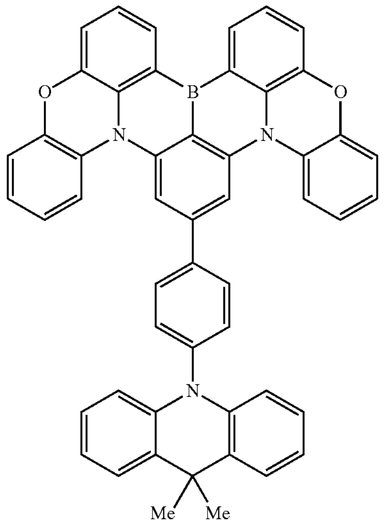

-continued
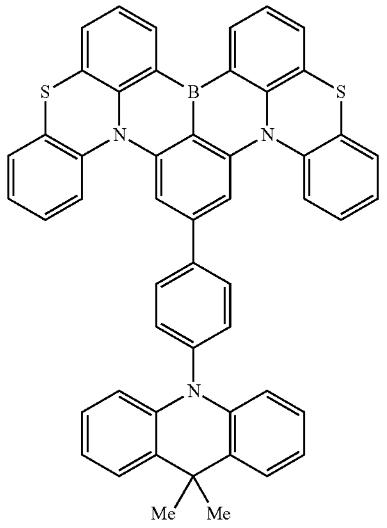
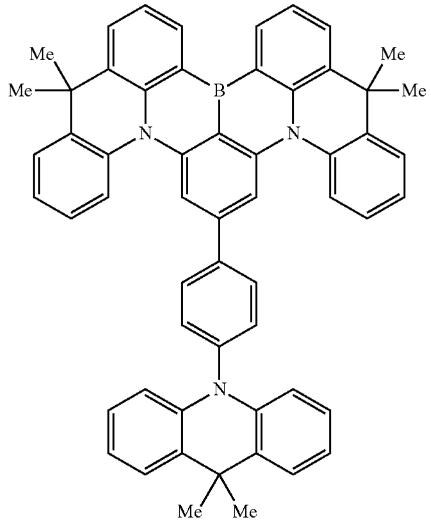
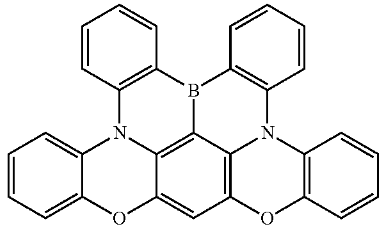
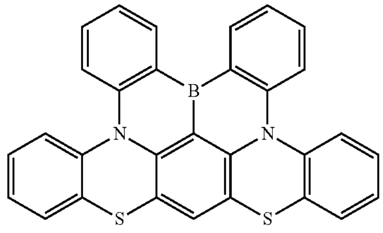
-continued
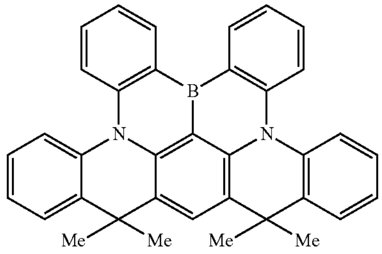
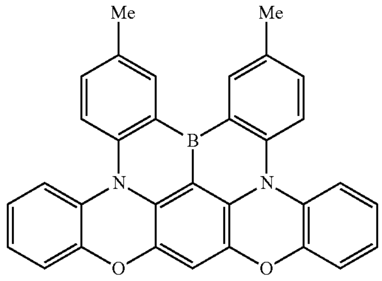
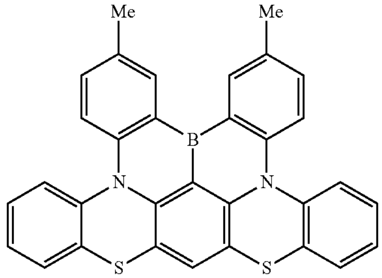
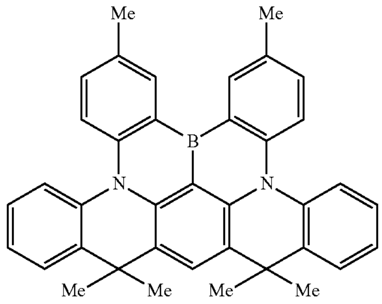
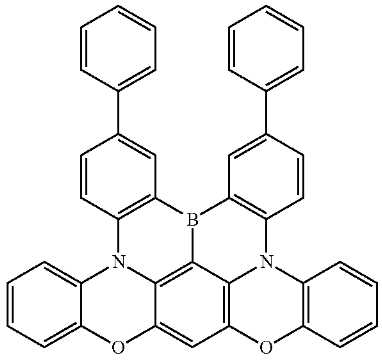

-continued
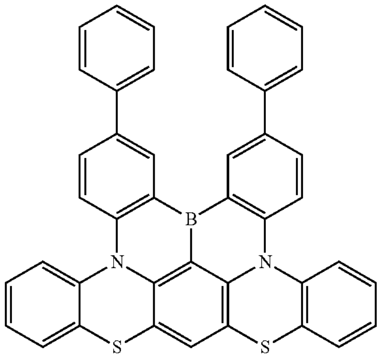
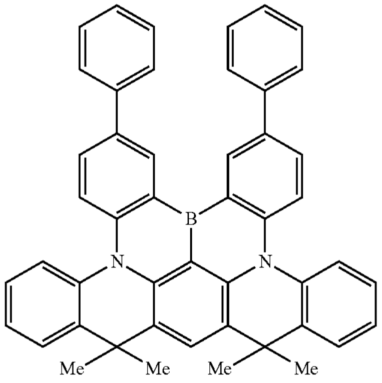
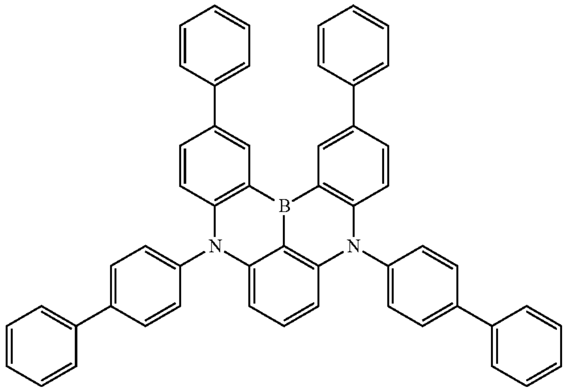
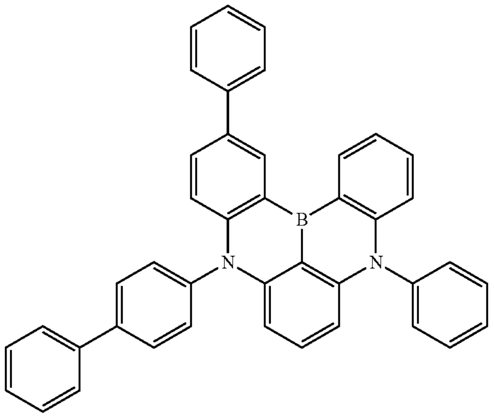
-continued
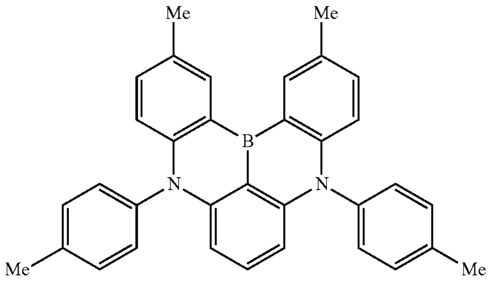
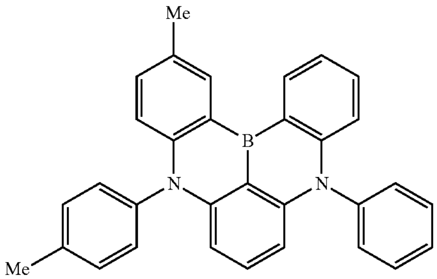
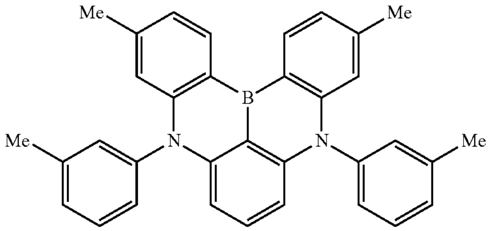
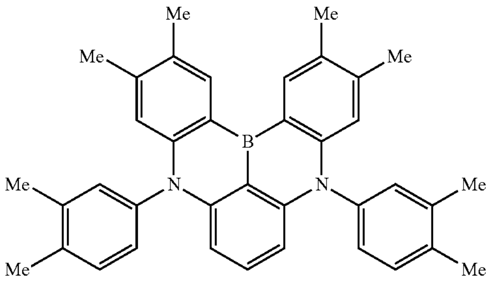
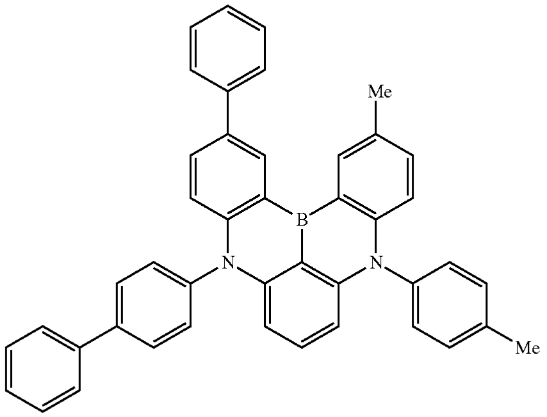

-continued
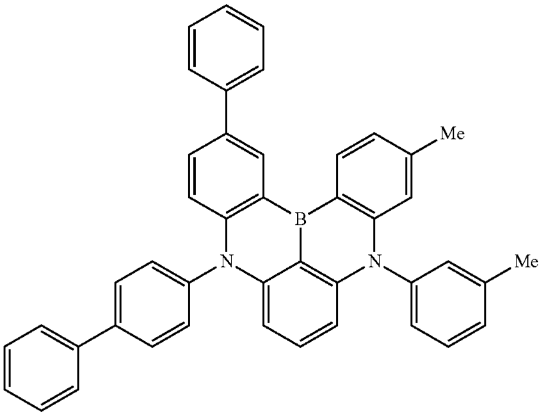
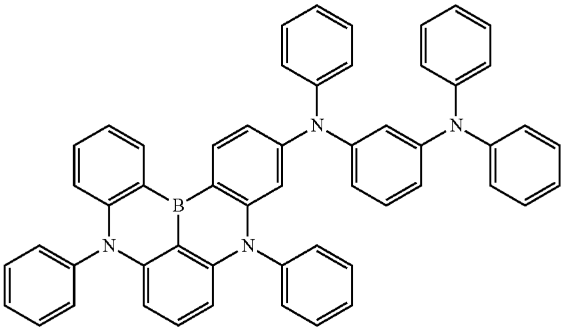
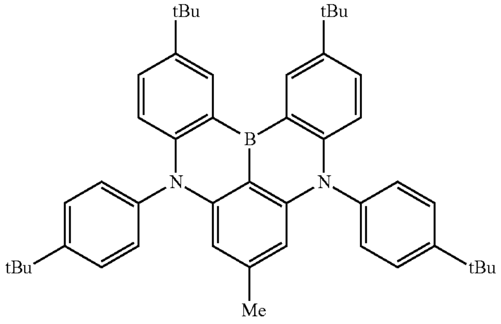
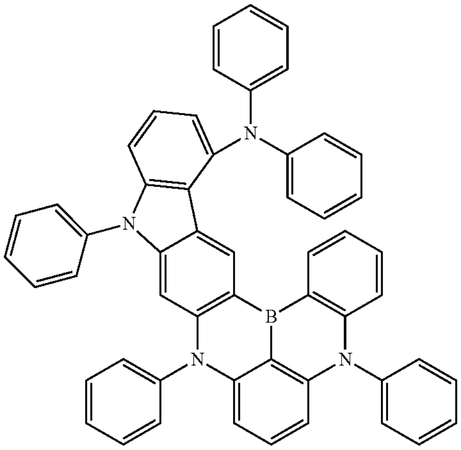
-continued
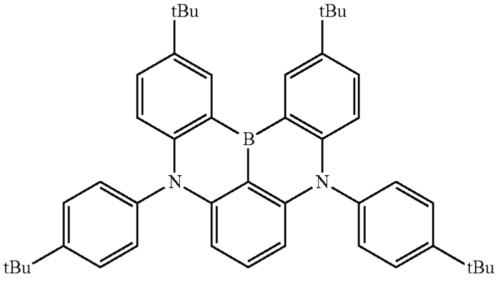
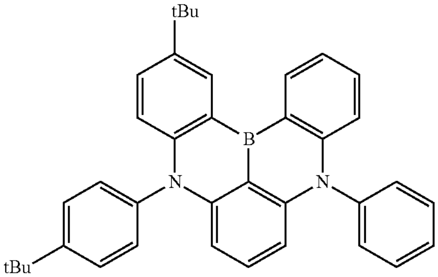
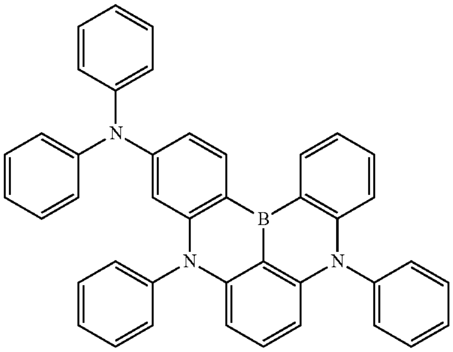
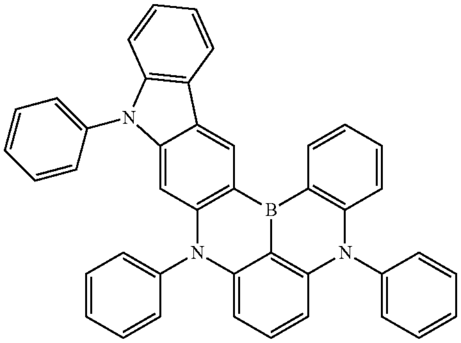
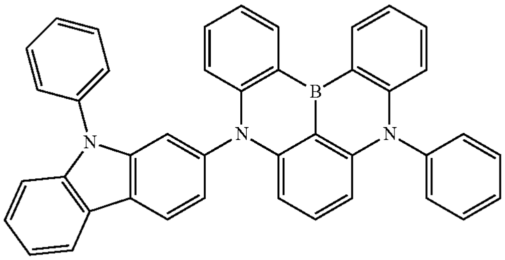

-continued
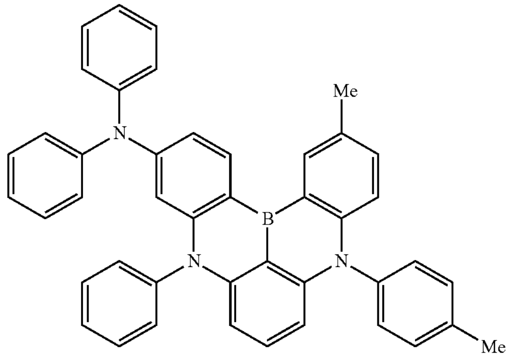
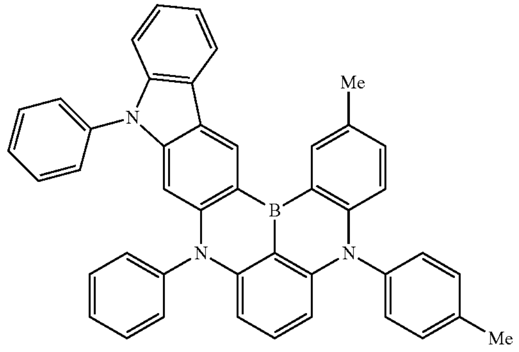
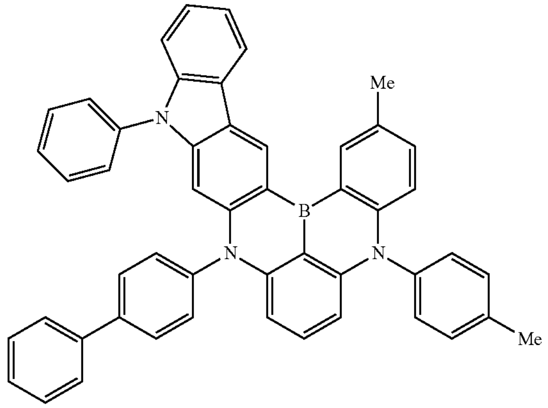
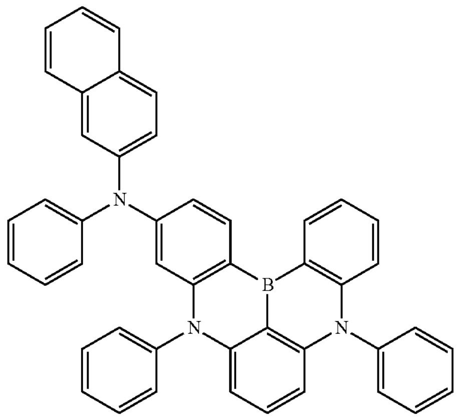
-continued
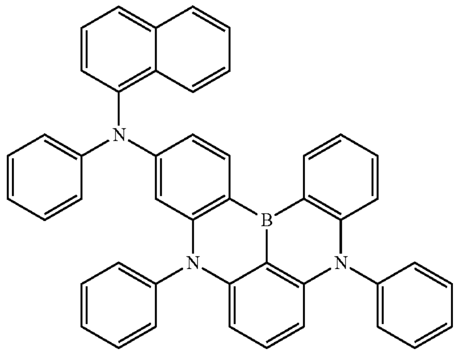
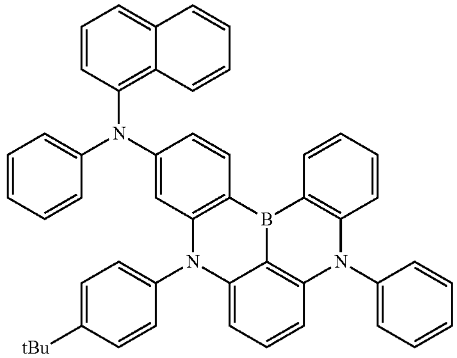
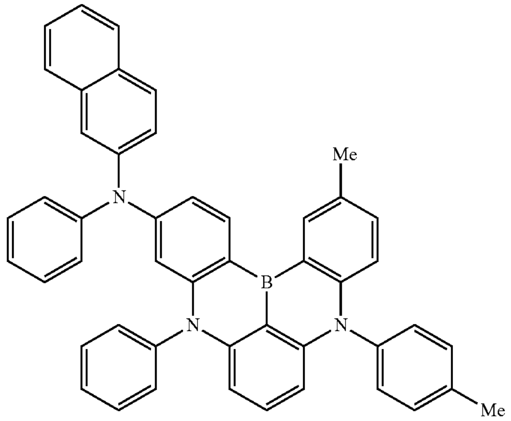
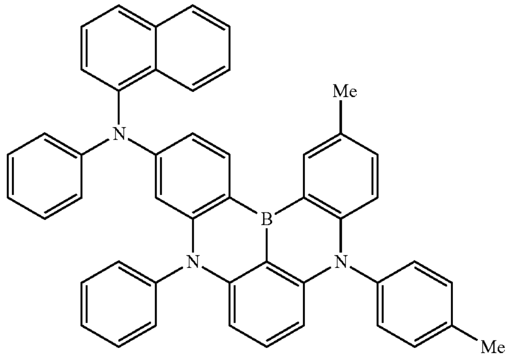

-continued
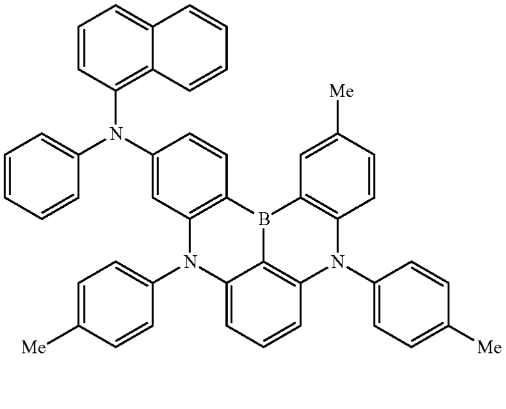
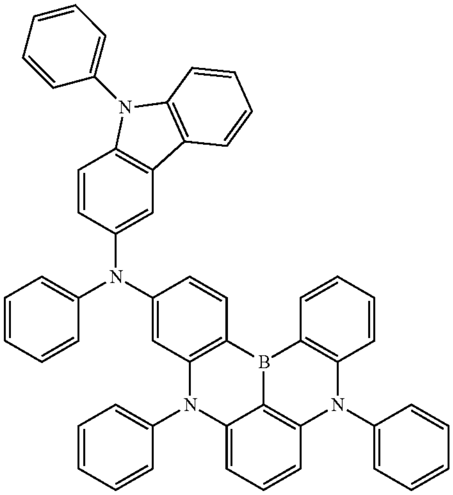
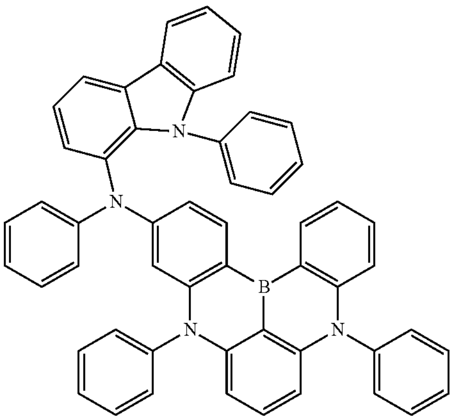
-continued
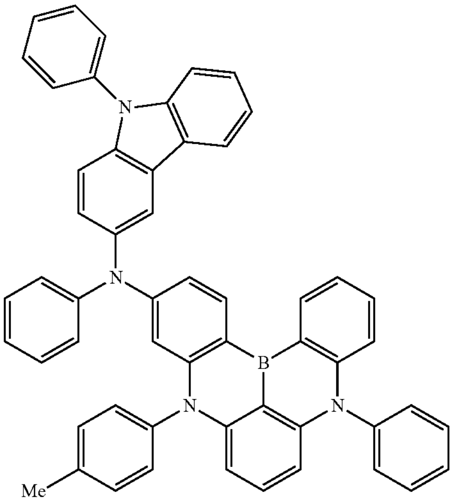
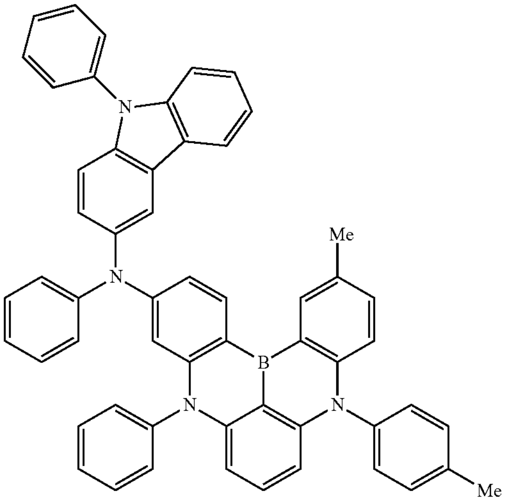
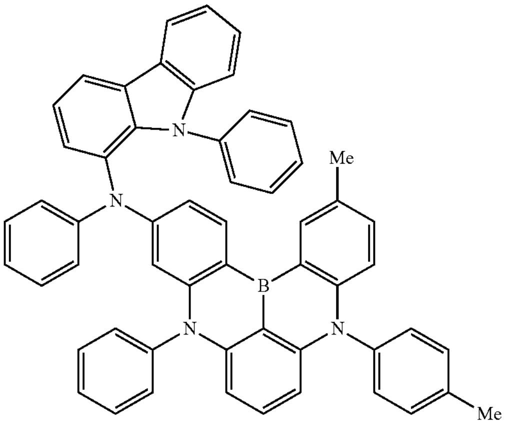

-continued
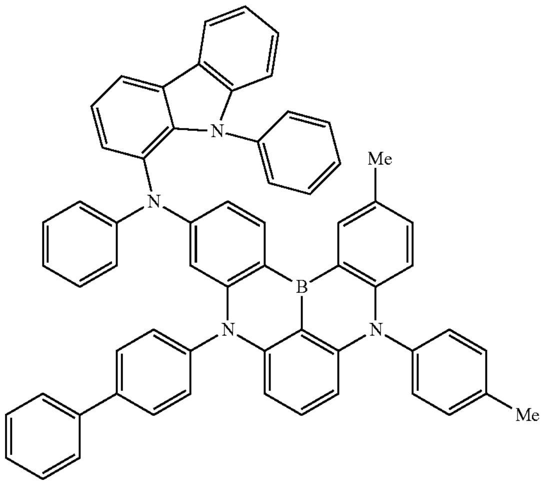
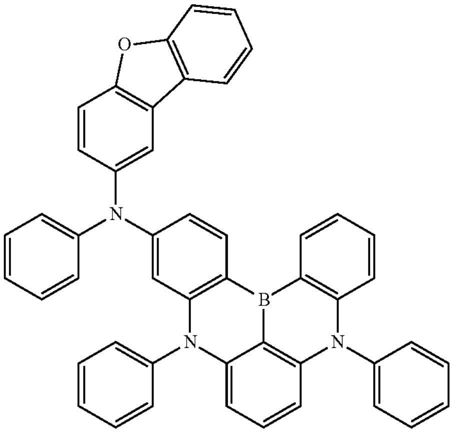
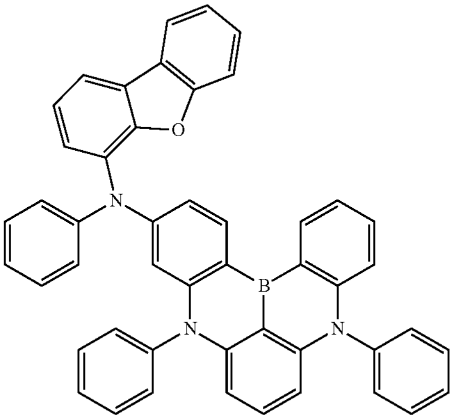
-continued
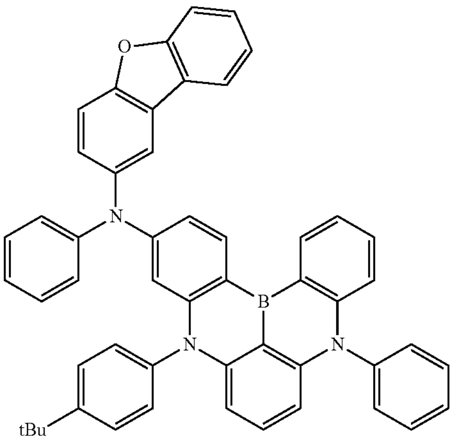
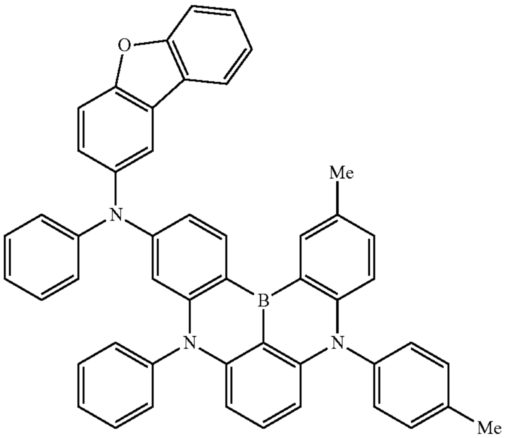
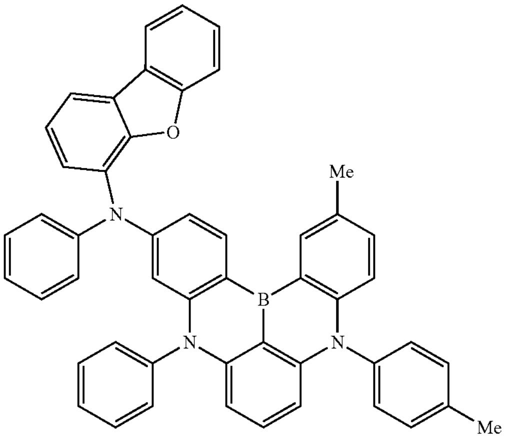

-continued
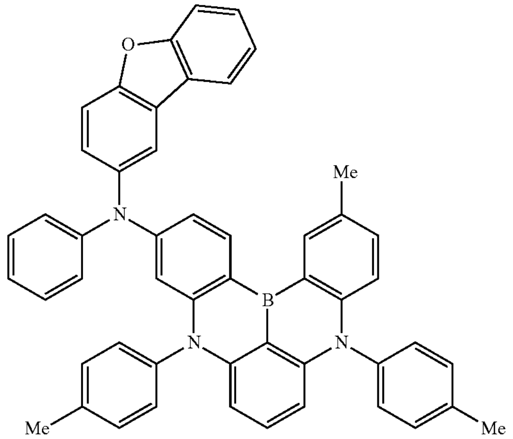
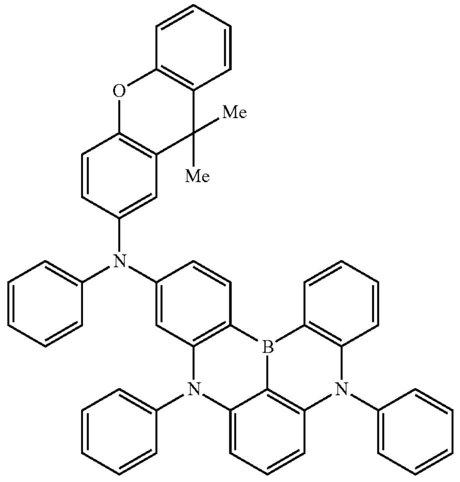
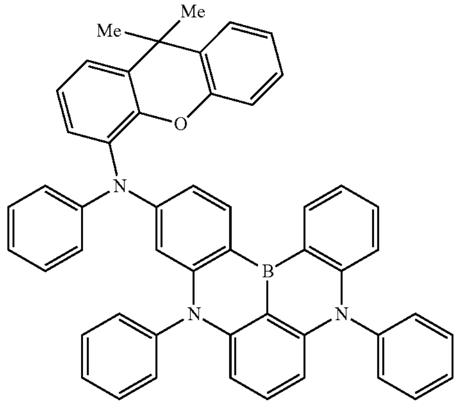
-continued
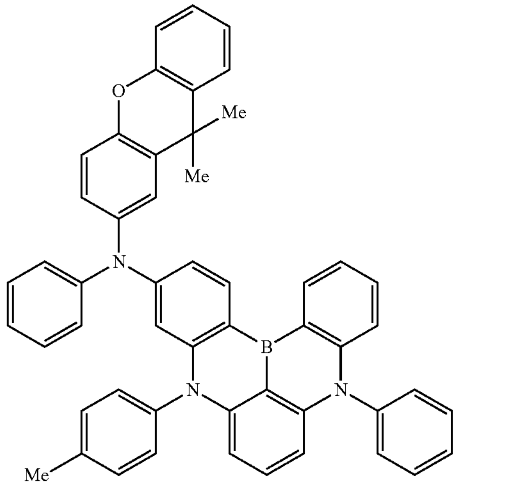
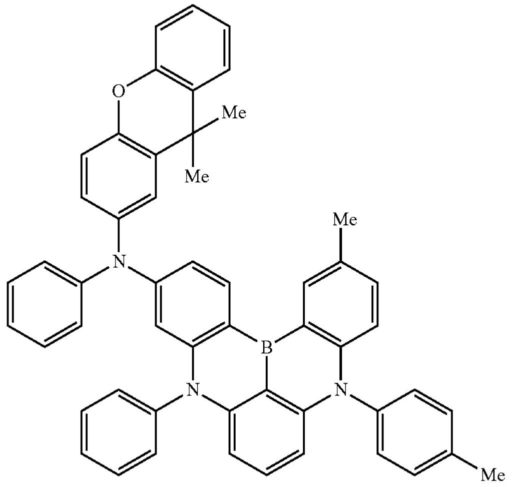
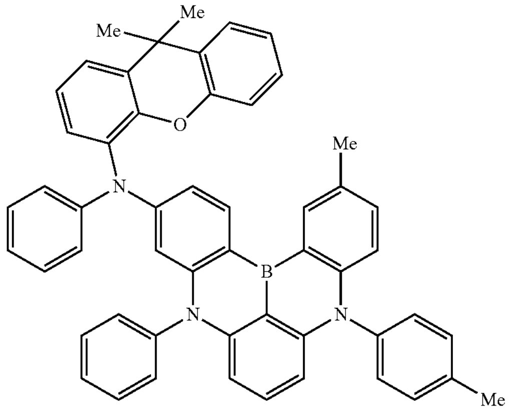

-continued
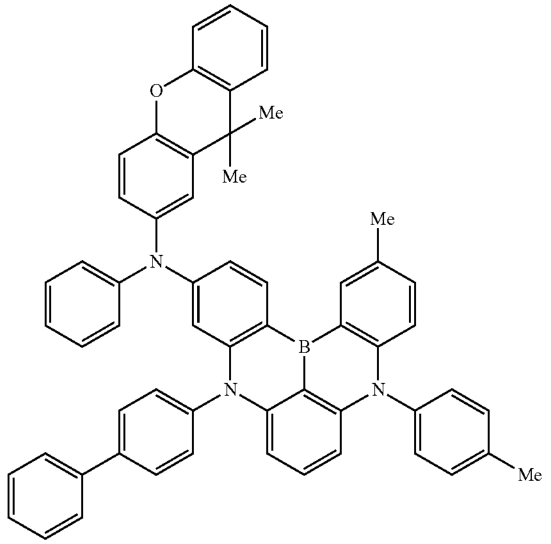
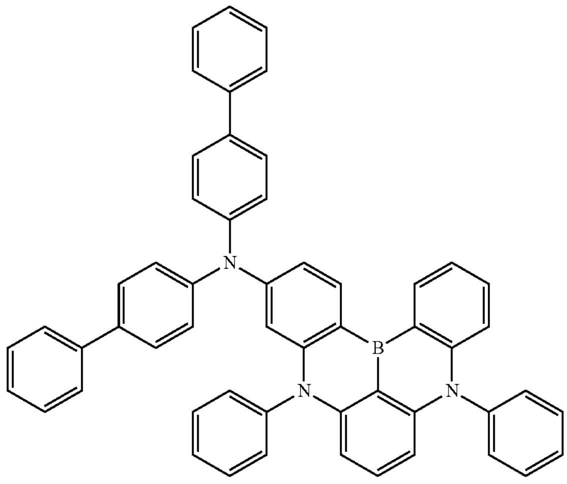
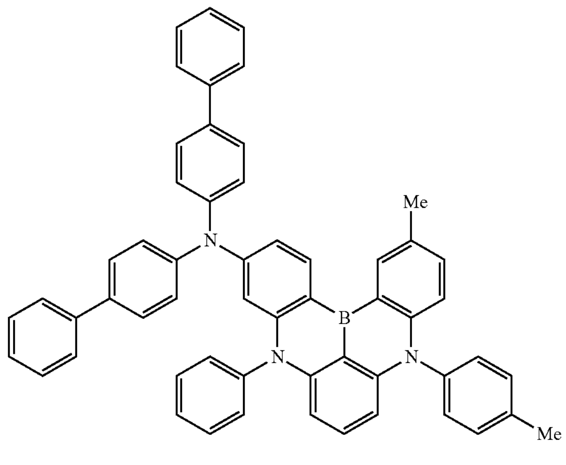
-continued
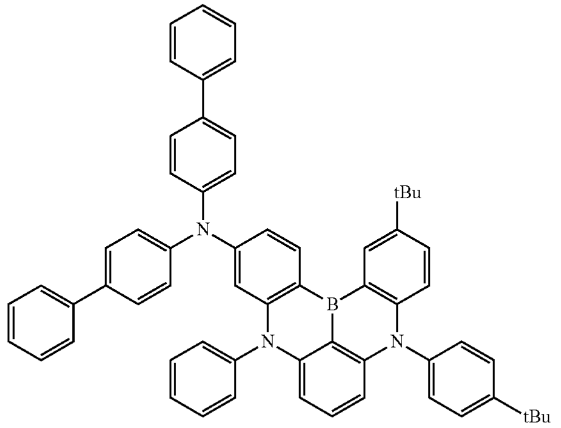
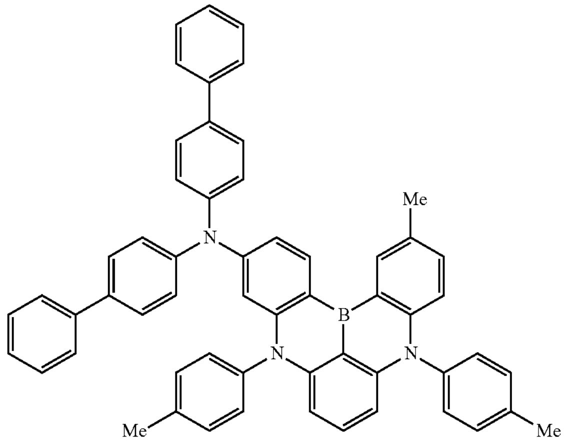
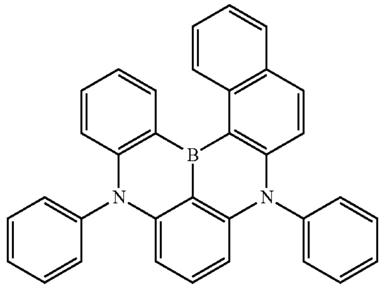
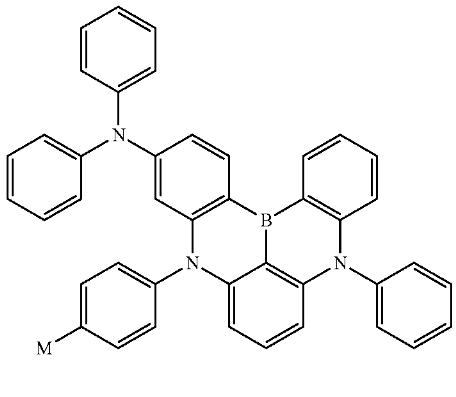

-continued
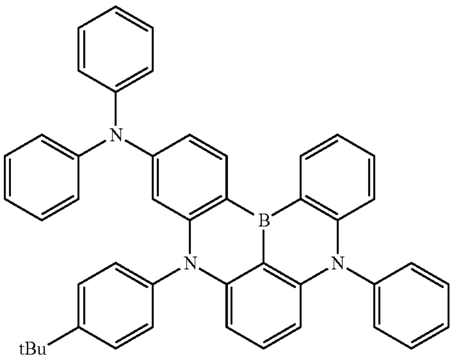
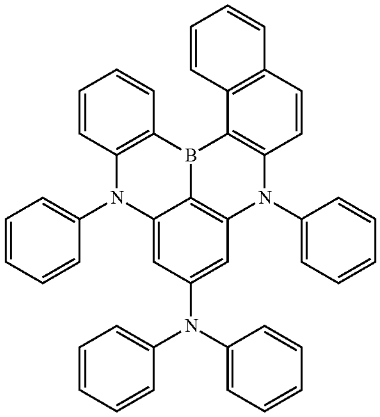
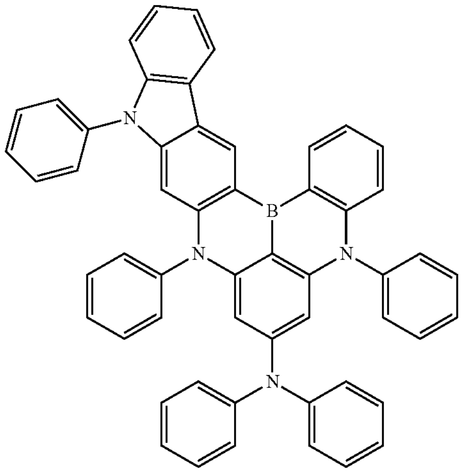
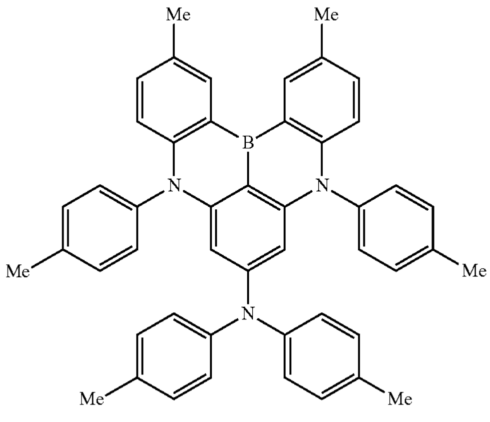
-continued
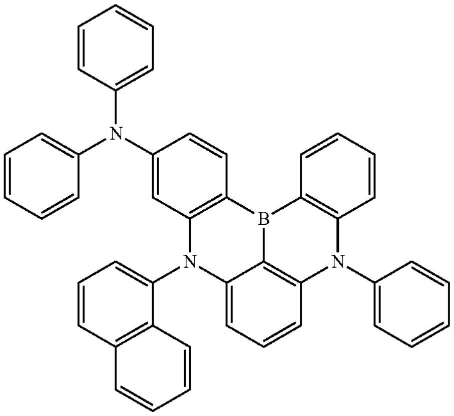
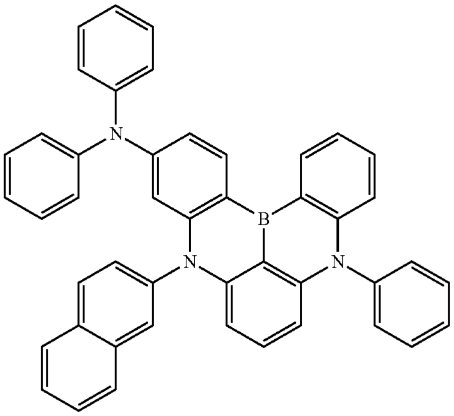
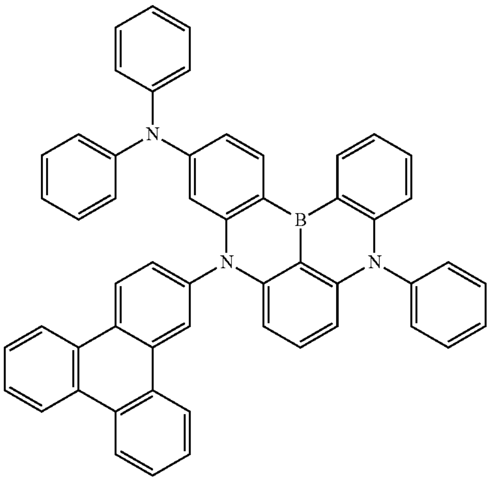

-continued
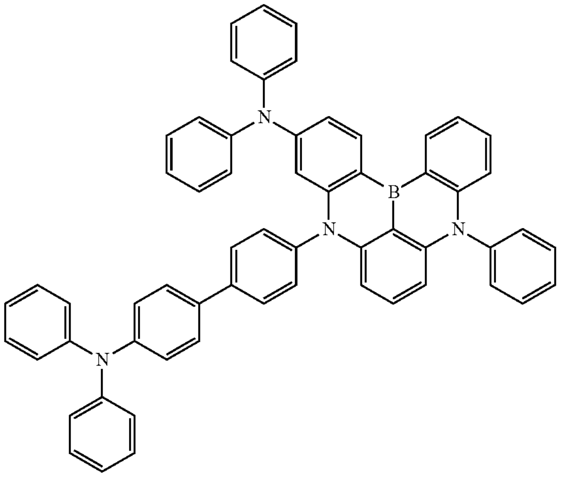
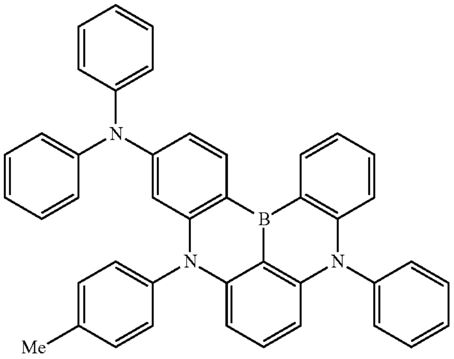
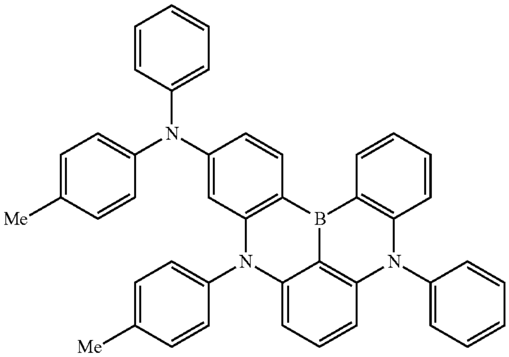
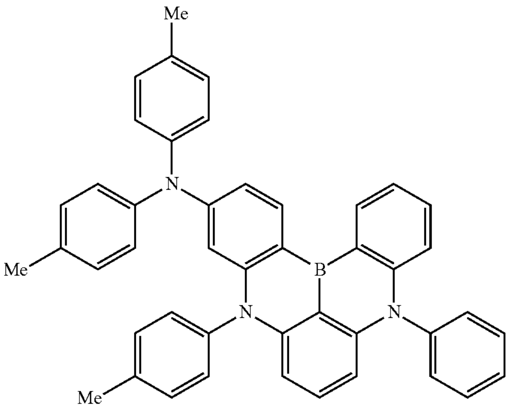
-continued
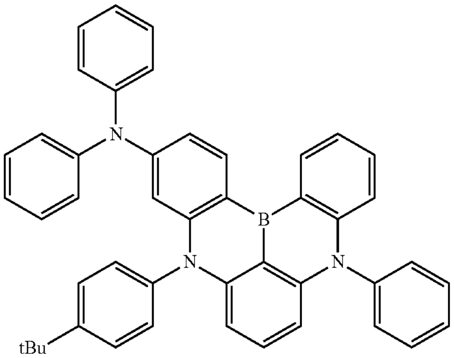
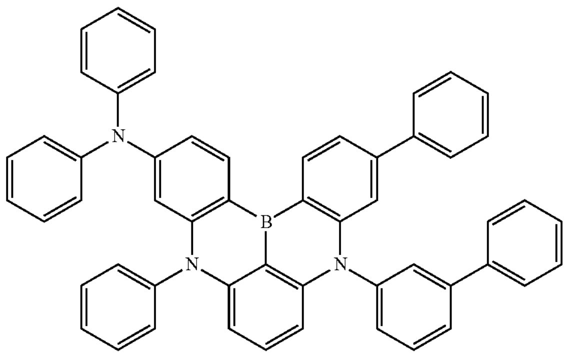
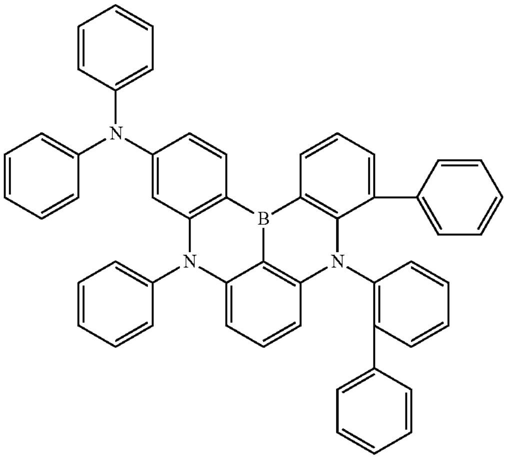
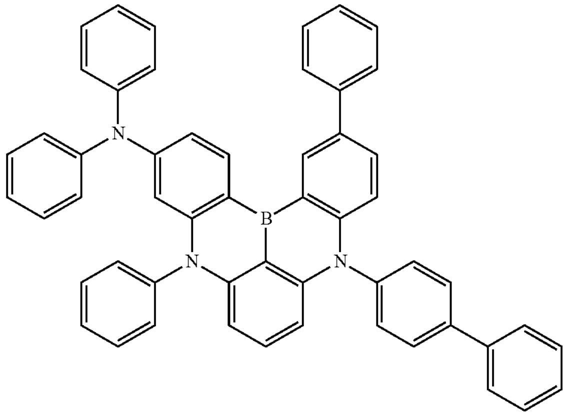

-continued
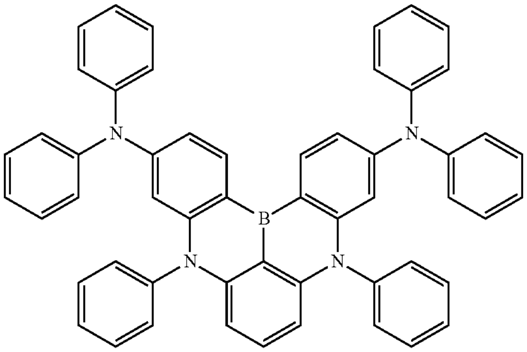
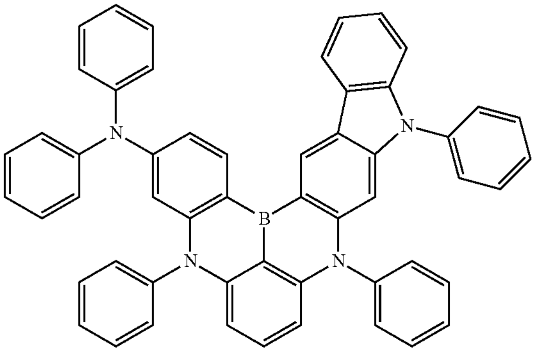
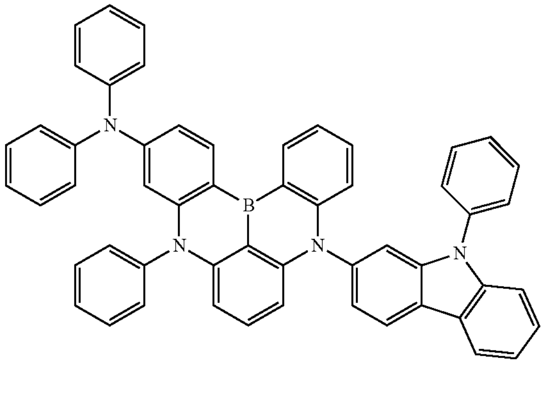
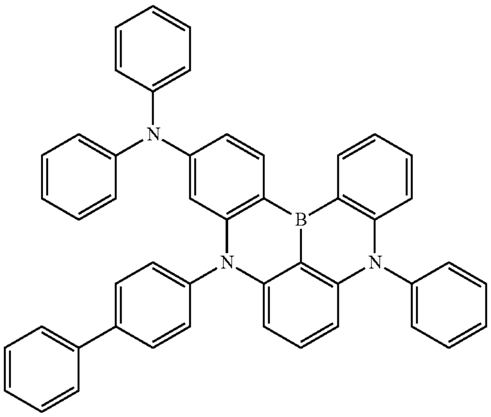
-continued
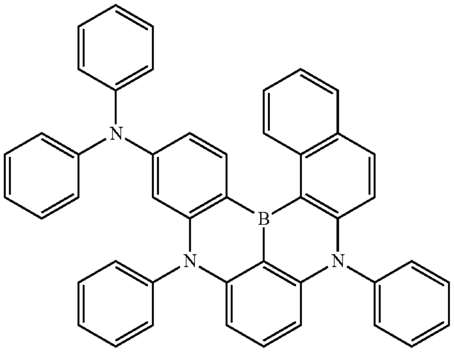
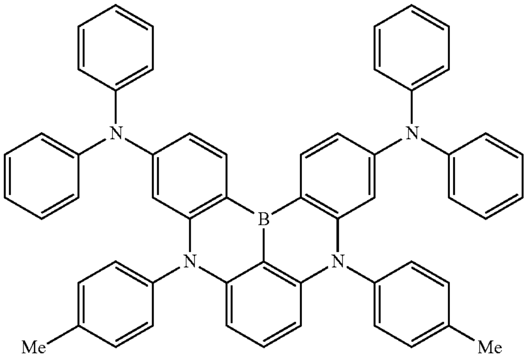
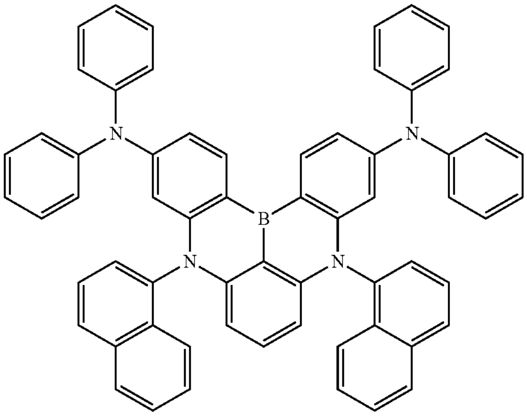
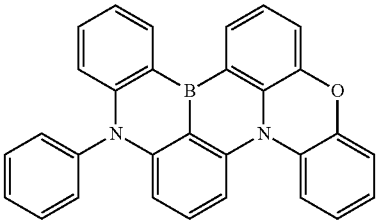
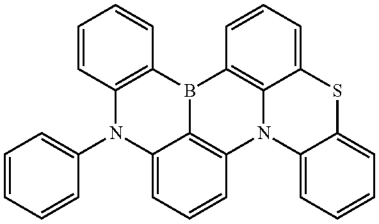

-continued
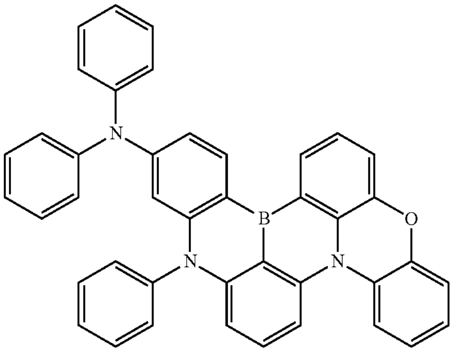
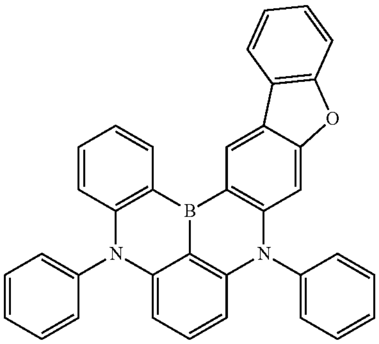
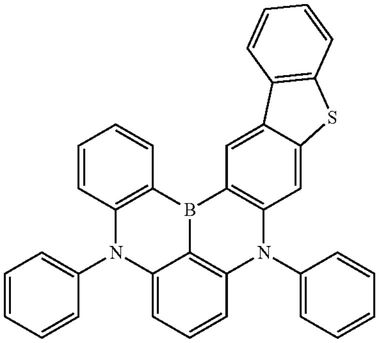
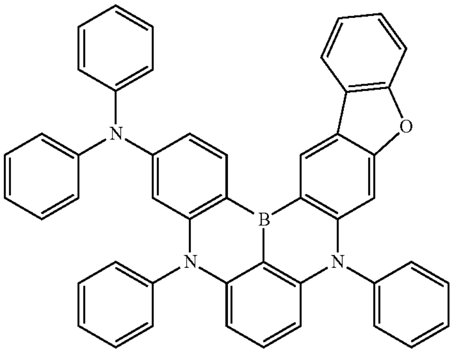
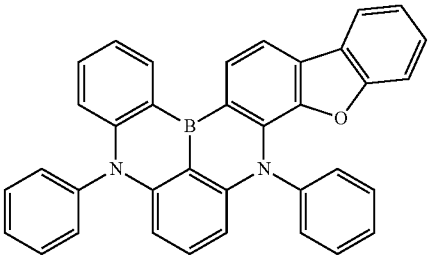
-continued
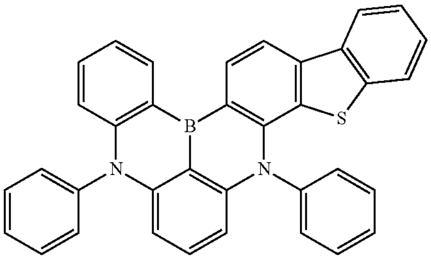
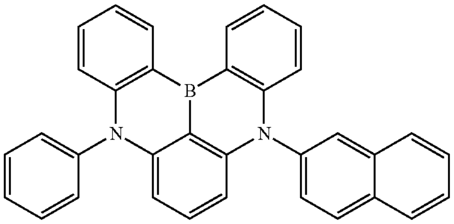
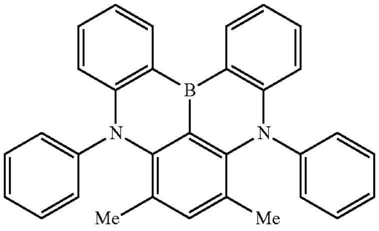
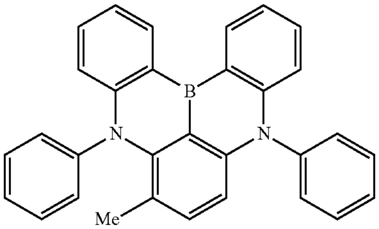
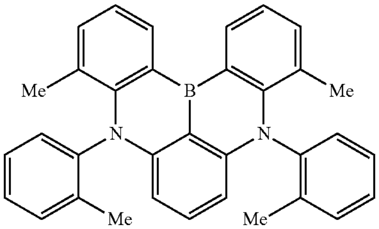
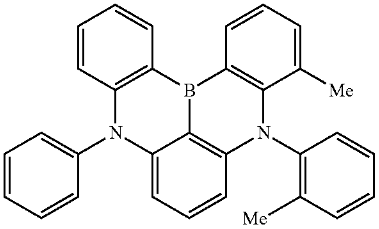
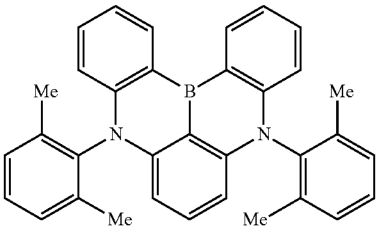

-continued
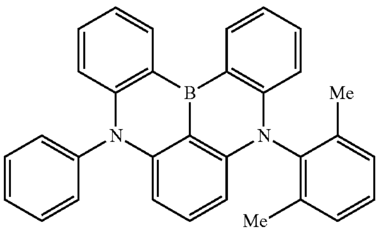
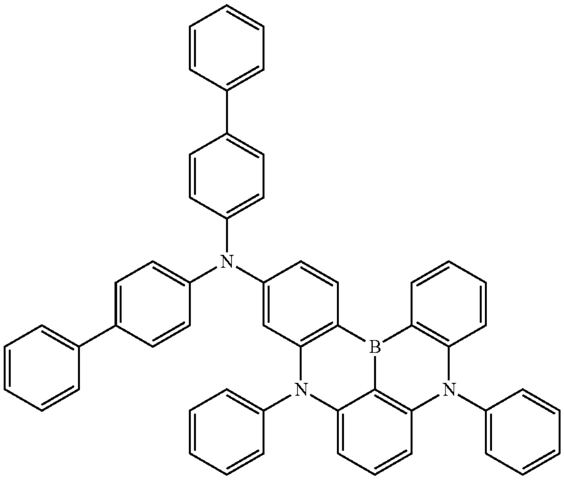
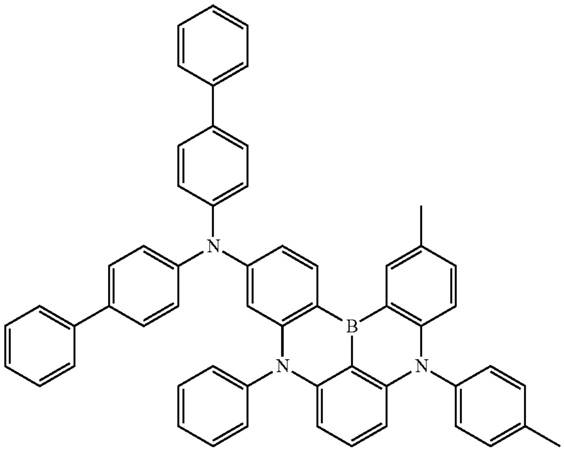
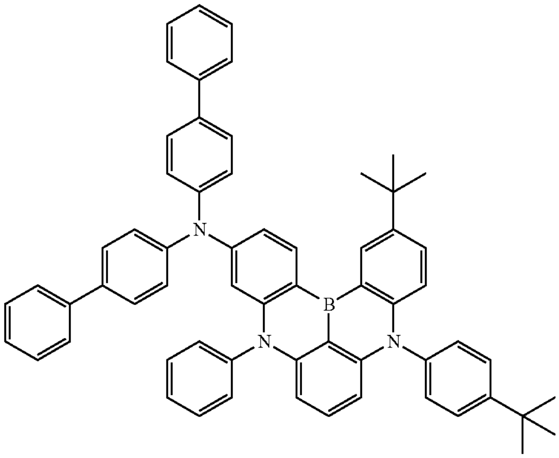
-continued
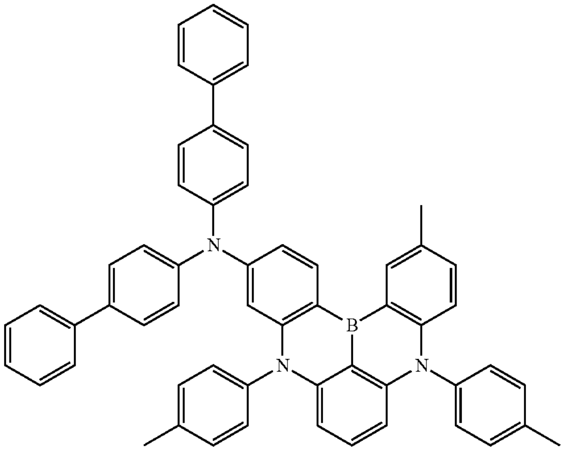
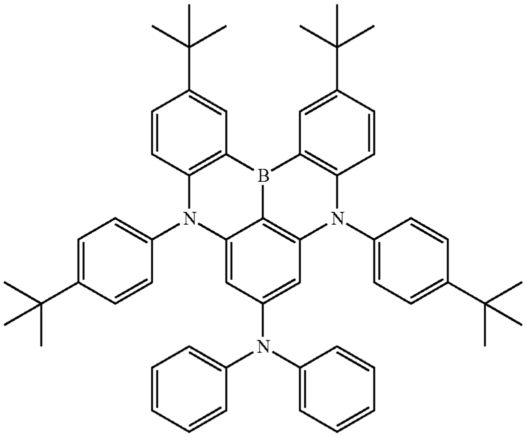
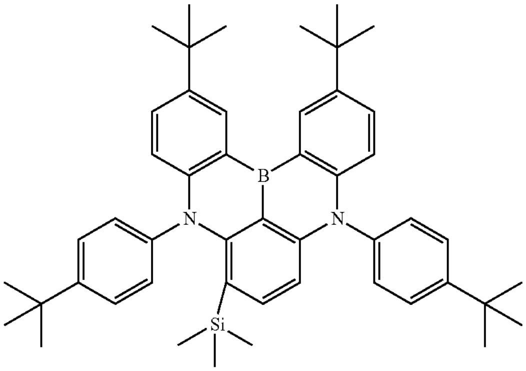
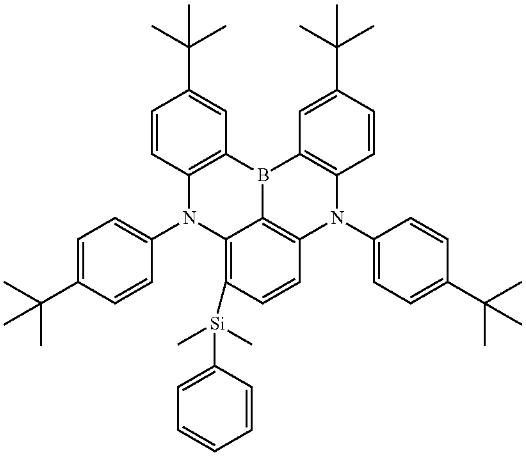

-continued
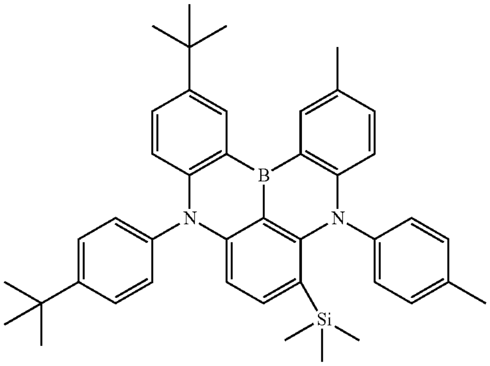
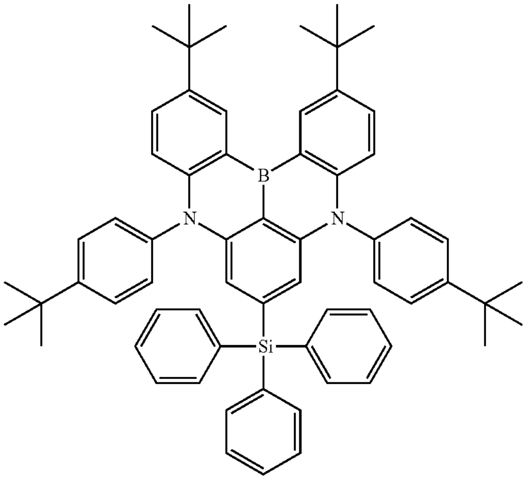
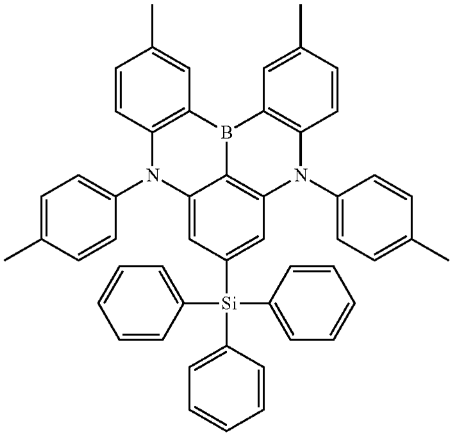
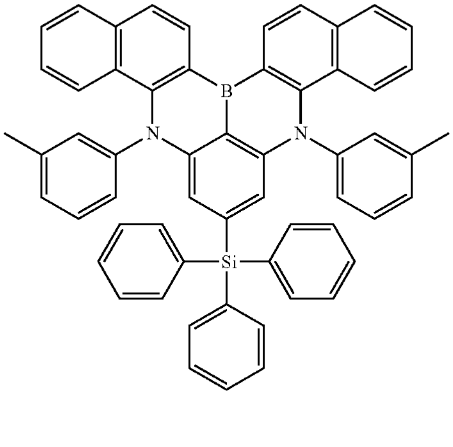
-continued
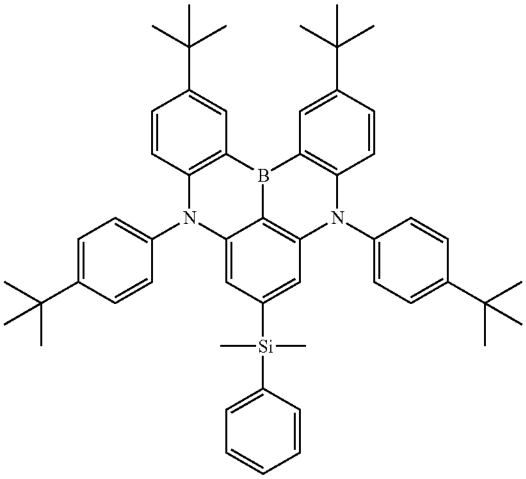
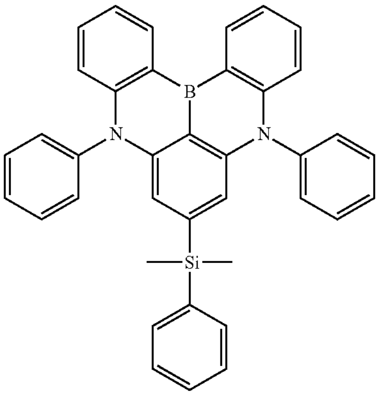
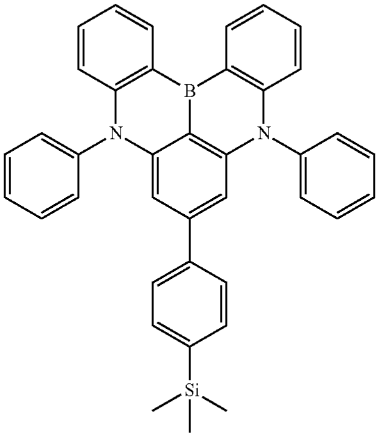

-continued
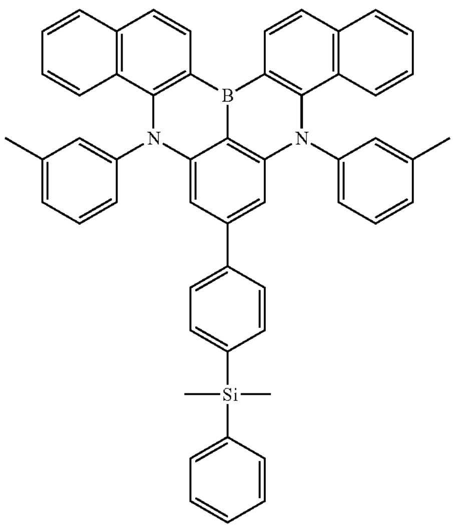
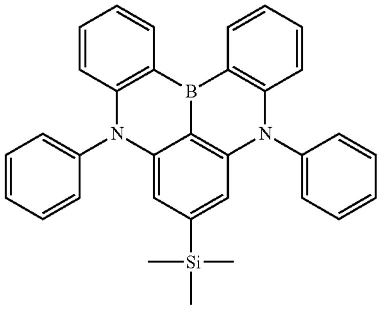
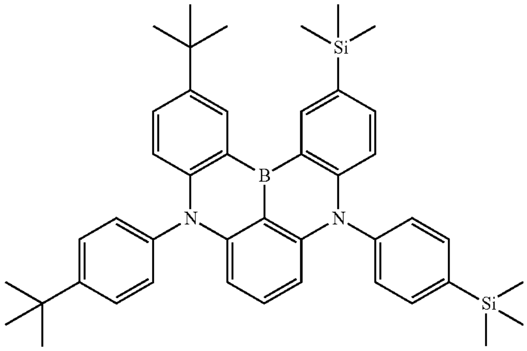
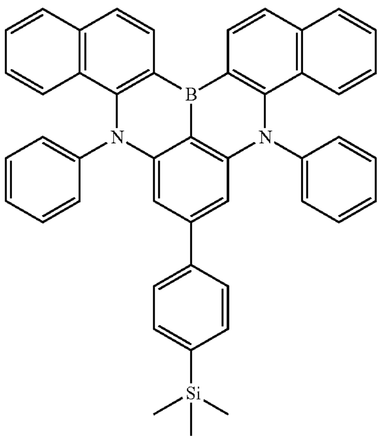
-continued
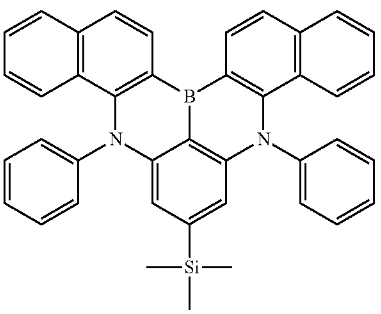
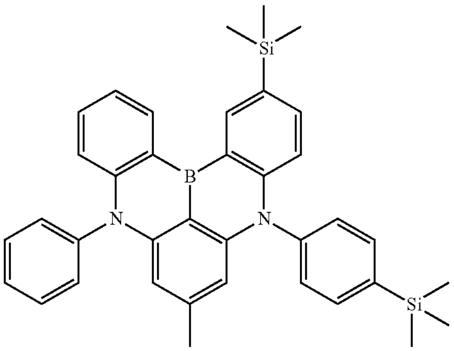
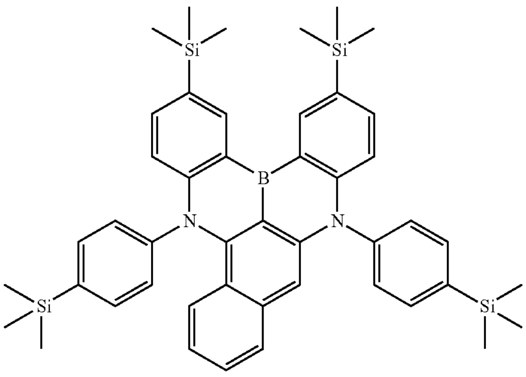
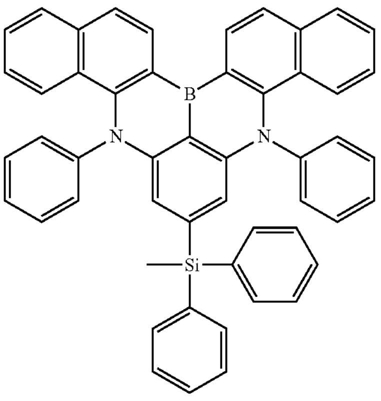

-continued
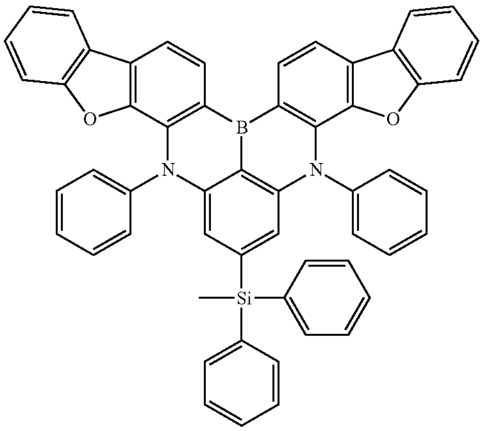
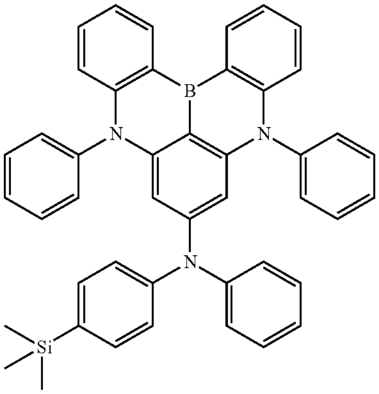
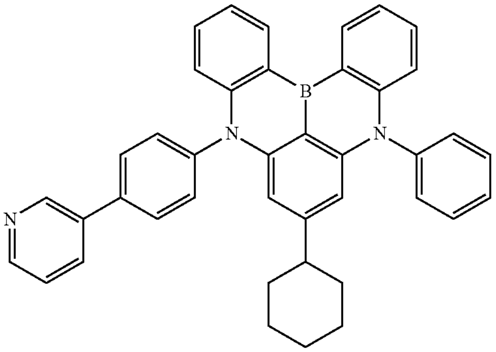
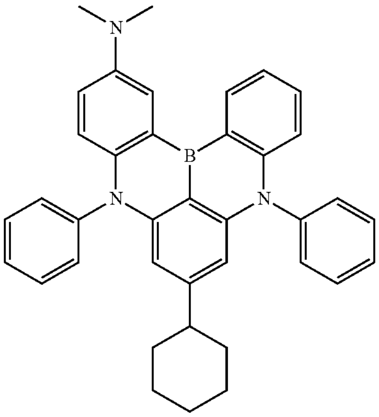
-continued
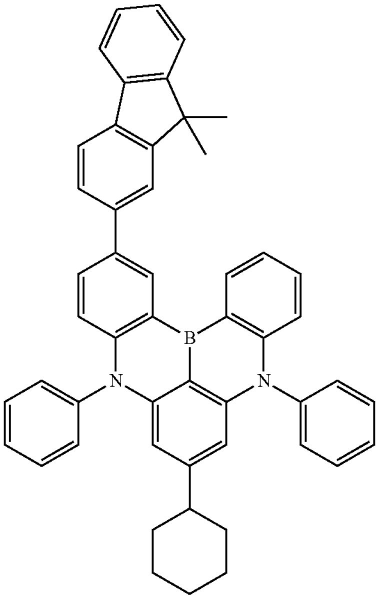
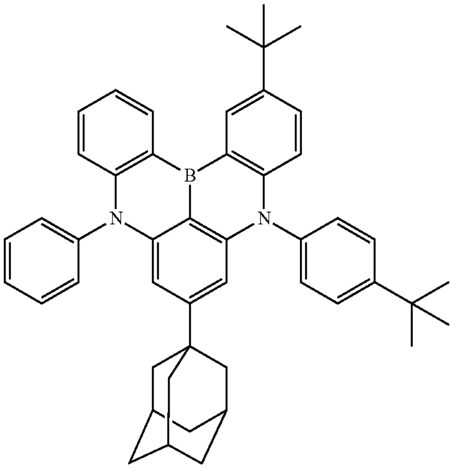
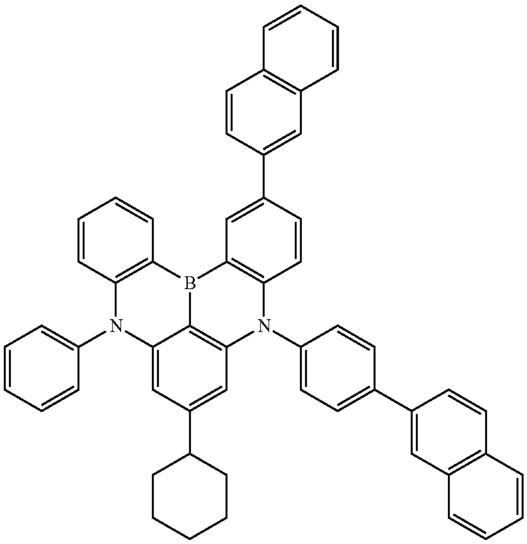

-continued
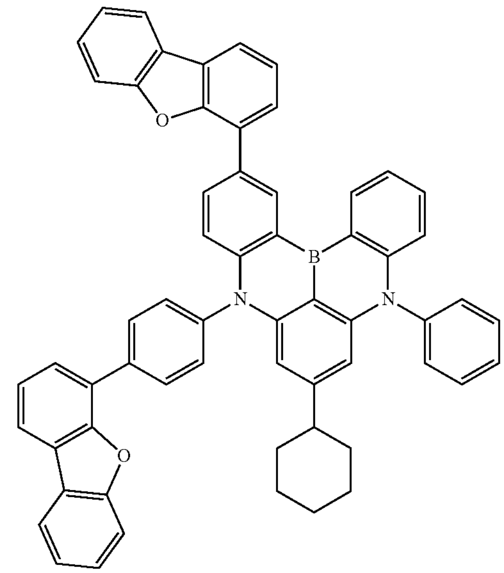
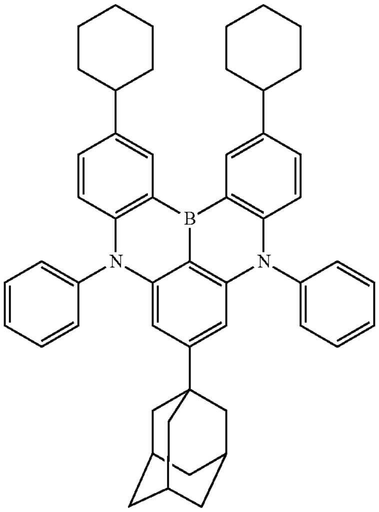
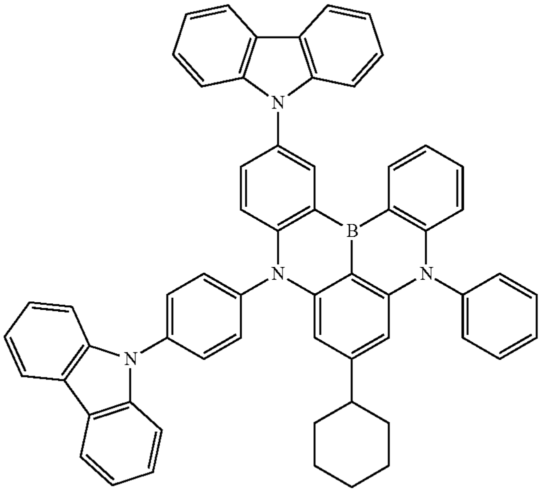
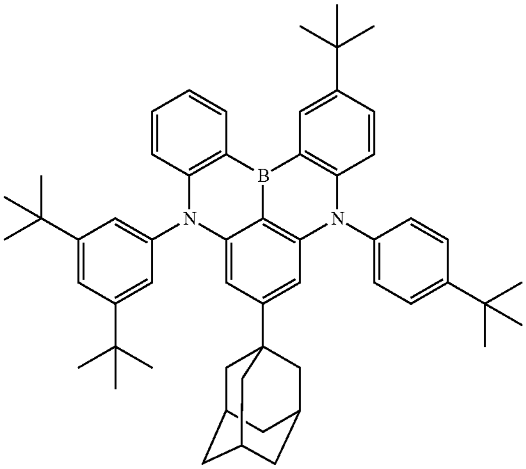
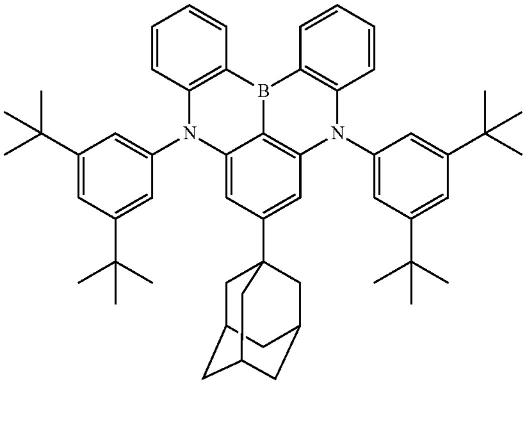
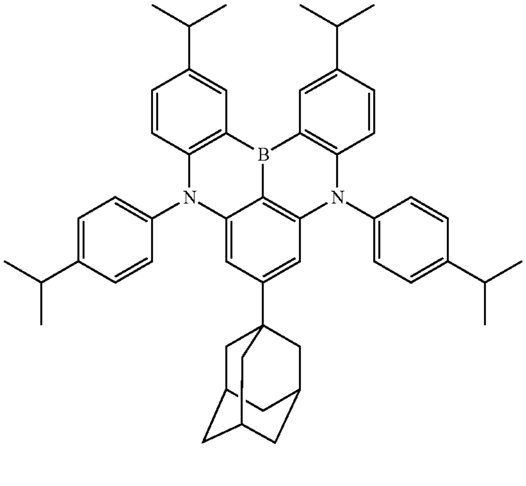
-continued -continued
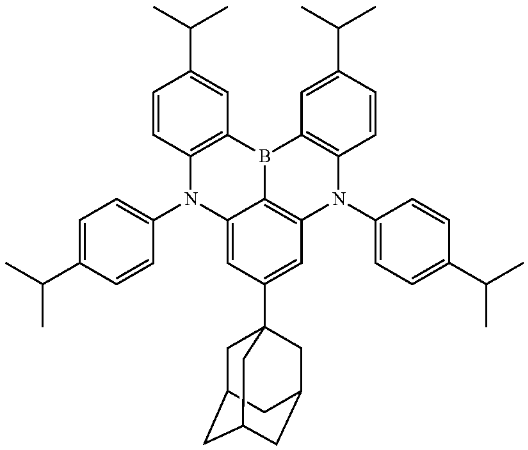
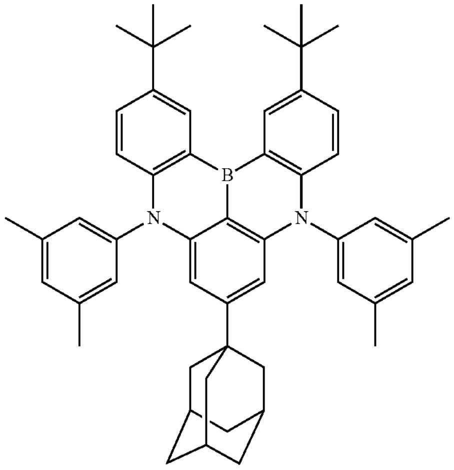
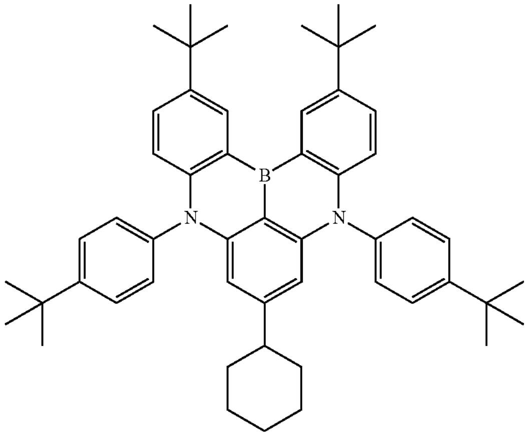
-continued
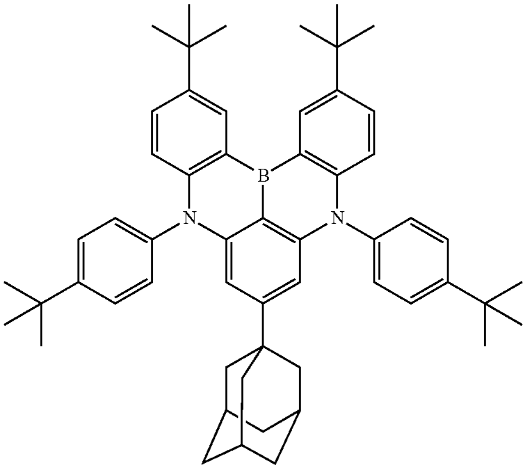
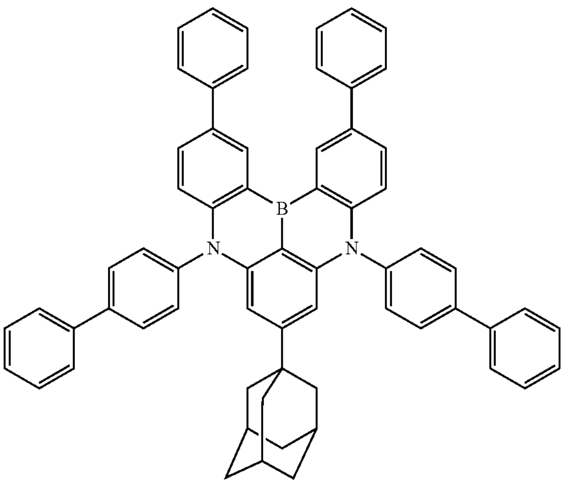
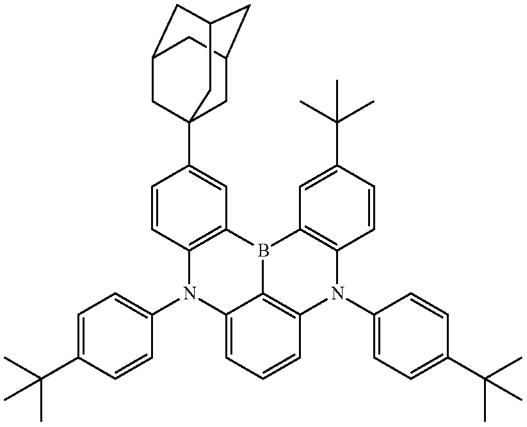

-continued
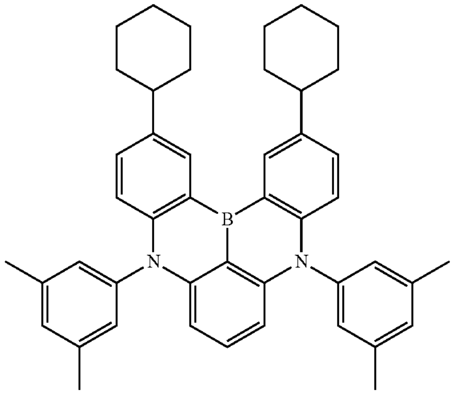
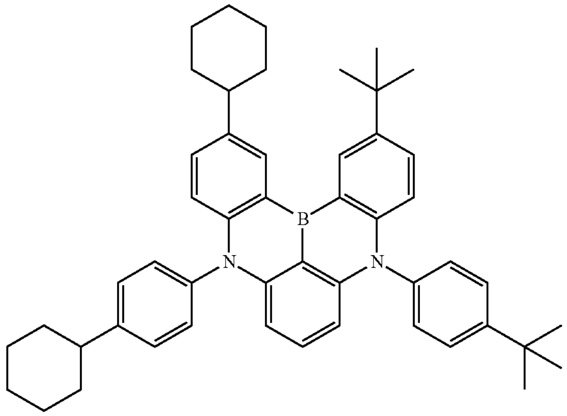
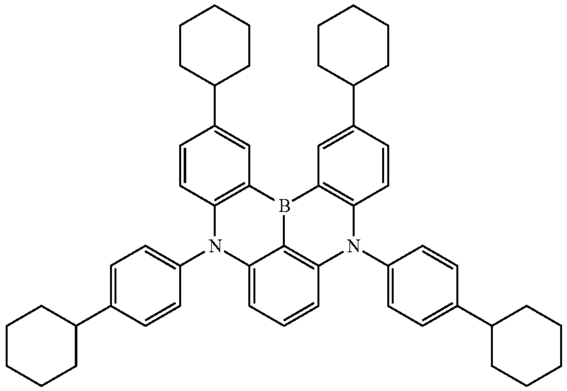
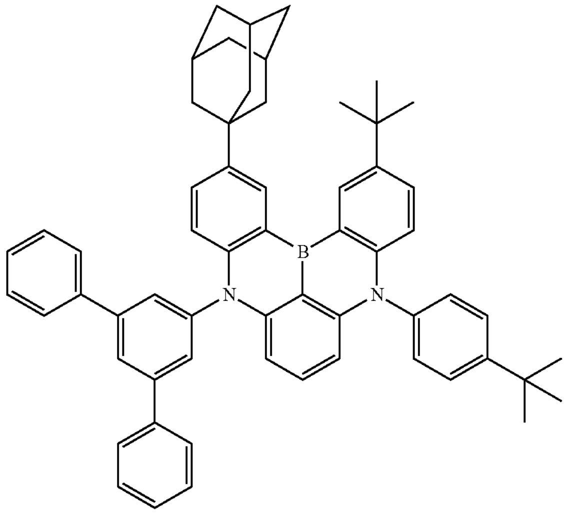
-continued
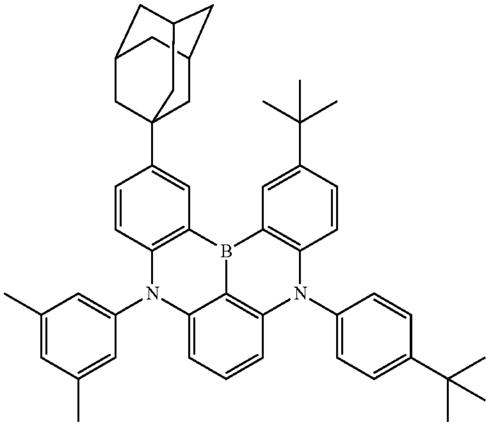
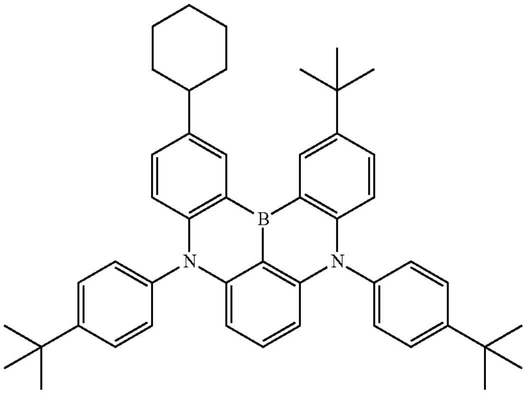
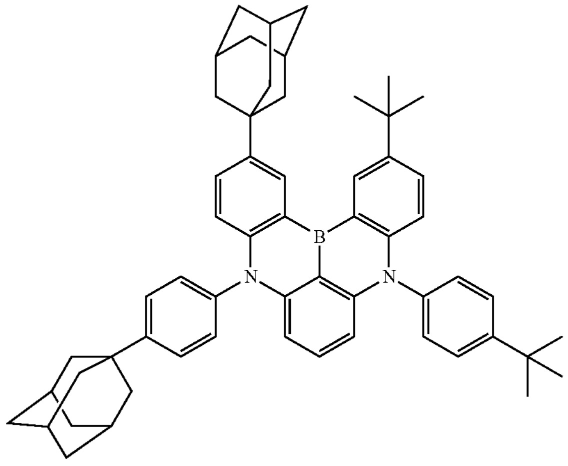
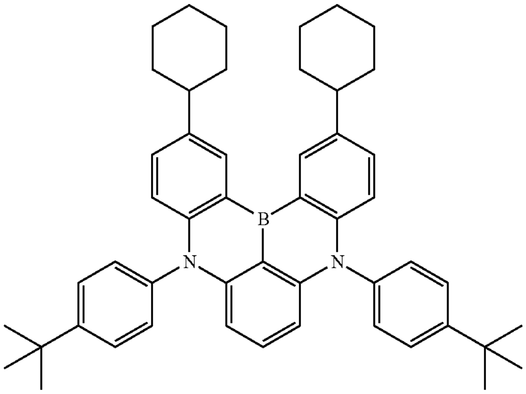

-continued

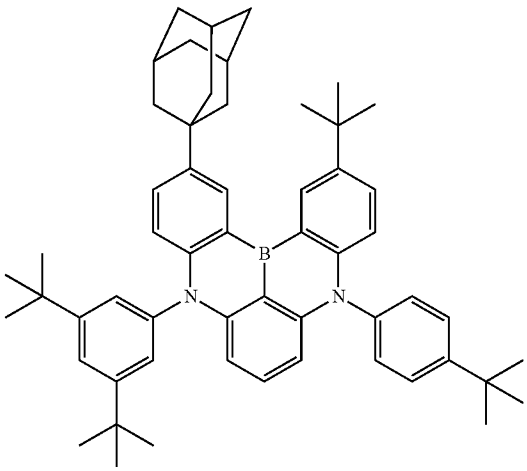

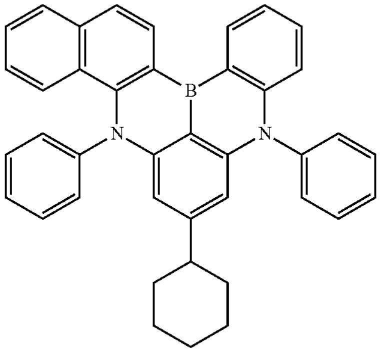

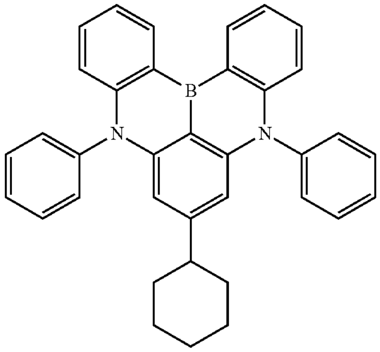

(Compound Represented by Formula (51))

The compound represented by the formula (51) is explained below.

(51)

| | | | | |
|---|---|---|---|---|
| p | q | r | s | t |

(52)

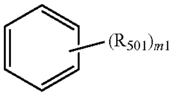

(53)

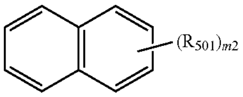

-continued (54)

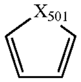

(55)

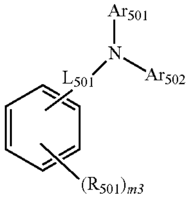

(56)

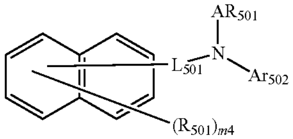

In the formula (51), a ring r is a ring represented by the formula (52) or the formula (53) which is fused to respective arbitrary positions of the adjacent rings;

a ring q and a ring s are independently a ring represented by the formula (54) which is fused to respective arbitrary positions of the adjacent rings;

a ring p and a ring t are independently a ring represented by the formula (55) or the formula (56) which is fused to an arbitrary position of the adjacent ring;

when a plurality of $R_{501}$'s exists, adjacent $R_{501}$'s form a substituted or unsubstituted, saturated or unsaturated ring by bonding with each other, or do not form a substituted or unsubstituted, saturated or unsaturated ring;

$X_{501}$ is an oxygen atom, a sulfur atom, or $NR_{502}$;

$R_{501}$ that do not form the substituted or unsubstituted saturated or unsaturated ring, and $R_{502}$ are a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{901}$ to $R_{907}$ are as defined in the formulas (1);

$Ar_{501}$ and $Ar_{502}$ are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

$L_{501}$ is a substituted or unsubstituted alkylene group including 1 to 50 carbon atoms, a substituted or unsubstituted alkenylene group including 2 to 50 carbon atoms, a substituted or unsubstituted alkynylene group including 2 to 50 carbon atoms, a substituted or unsubstituted cycloalkylene group including 3 to 50 ring carbon atoms, a substituted or unsubstituted arylene group including 6 to 50 ring carbon atoms, or a substituted or unsubstituted divalent heterocyclic group including 5 to 50 ring atoms;

m1's are independently an integer of 0 to 2, m2's are independently an integer of 0 to 4, m3 is independently an integer of 0 to 3, and m4 is independently an integer of 0 to 5; and when a plurality of $R_{501}$'s exists, the plurality of $R_{501}$'s may be the same as or different from each other.

In the formula (51), each of the ring p to the ring t is fused with the adjacent ring by sharing two carbon atoms. The fused position and the fused direction are not limited, and it can be fused at any position and direction.

In one embodiment, in the formula (52) or (53) for the r ring, $R_{501}$ is a hydrogen atom.

In one embodiment, the compound represented by the formula (51) is a compound represented by any one of the following formulas (51-1) to (51-6).

(51-1)

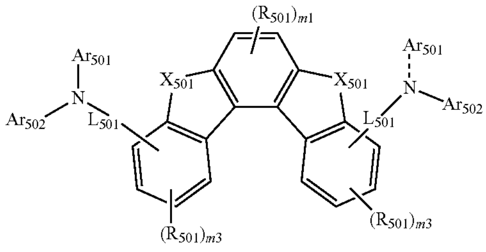

(51-2)

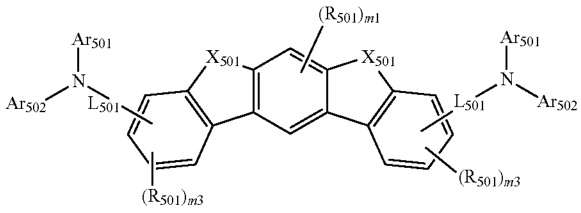

(51-3)

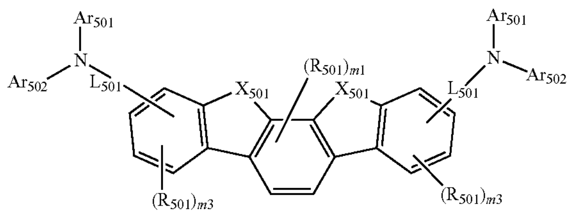

-continued (51-4)

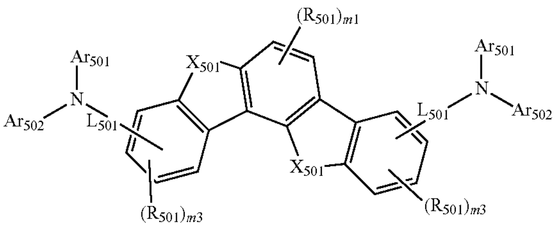

(51-5)

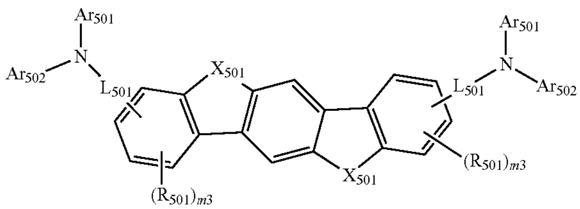

(51-6)

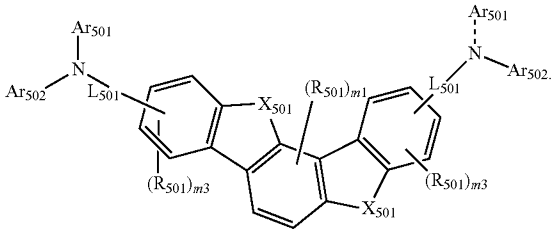

In the formulas (51-1) to (51-6), $R_{501}$, $X_{501}$, $Ar_{501}$, $Ar_{502}$, $L_{501}$, m1 and m3 are as defined in the formula (51).

In one embodiment, the compound represented by the formula (51) is a compound represented by any one of the following formulas (51-11) to (51-13).

(51-11)

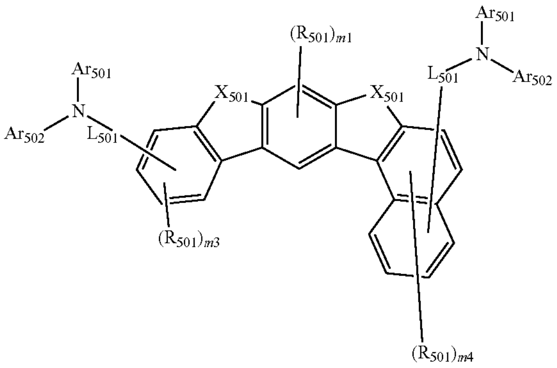

(51-12)

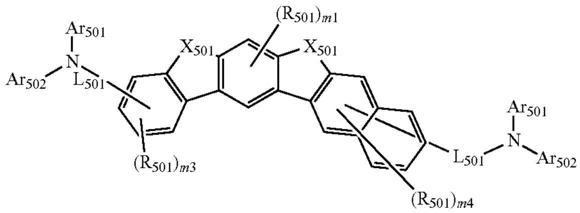

-continued
(51-13)
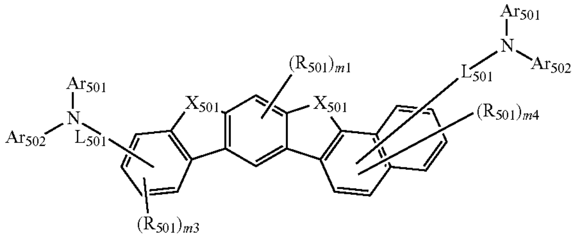
In the formulas (51-11) to (51-13), $R_{501}$, $X_{501}$, $Ar_{501}$, $Ar_{502}$, $L_{501}$, m1, m3 and m4 are as defined in the formula (51).
In one embodiment, the compound represented by the formula (51) is a compound represented by any one of the following formulas (51-21) to (51-25).
(51-21)
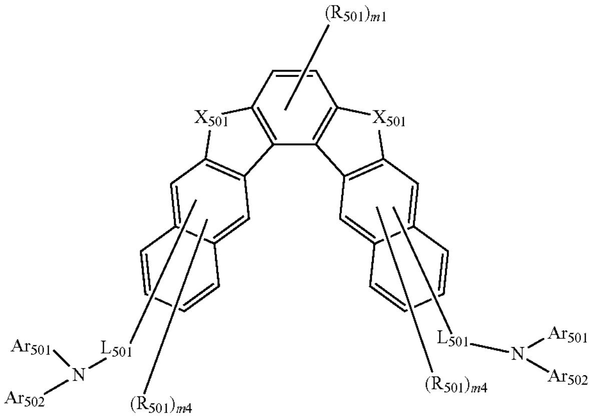
(51-22)
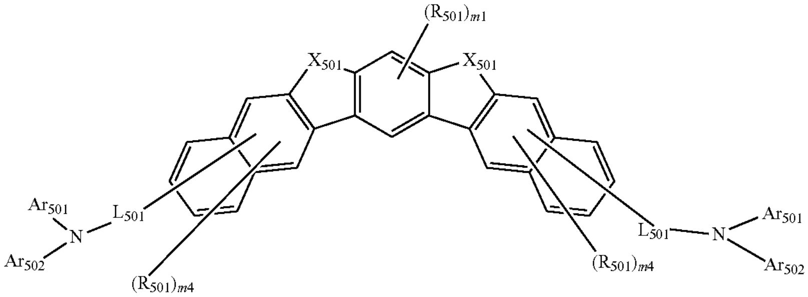
(51-23)
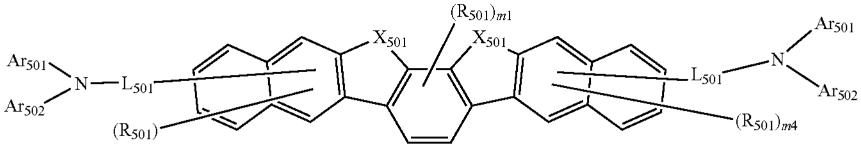
(51-24)
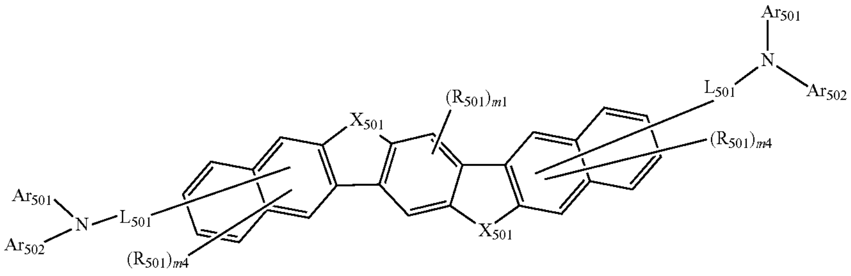

-continued (51-25)

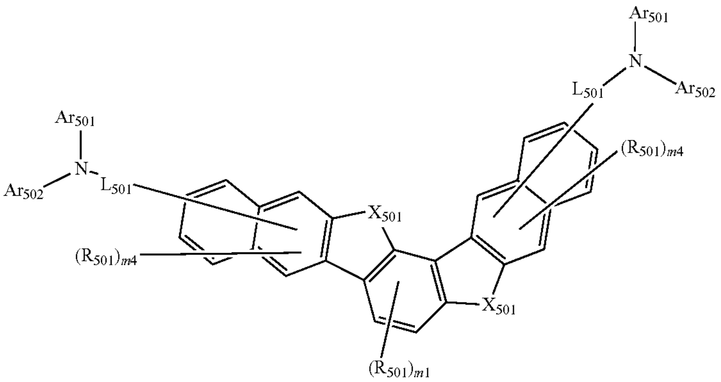

In the formulas (51-21) to (51-25), $R_{501}$, $X_{501}$, $Ar_{501}$, $Ar_{502}$, $L_{501}$, m1 and m4 are as defined in the formula (51).

In one embodiment, the compound represented by the formula (51) is a compound represented by any one of the following formulas (51-31) to (51-33).

(51-31)

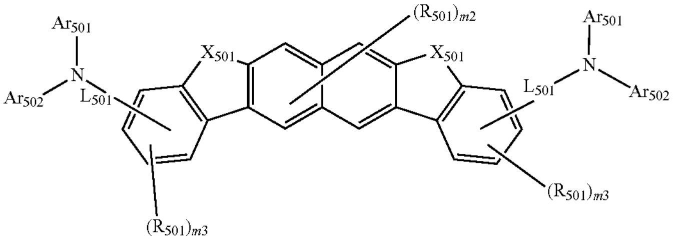

(51-32)

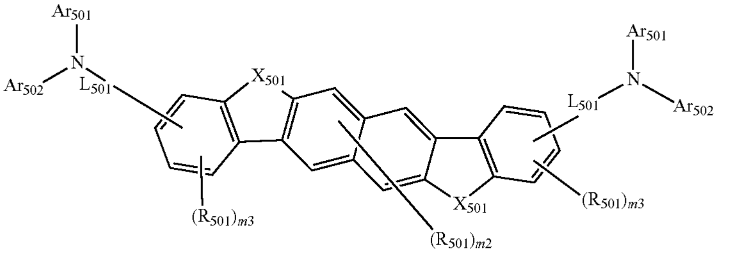

(51-33)

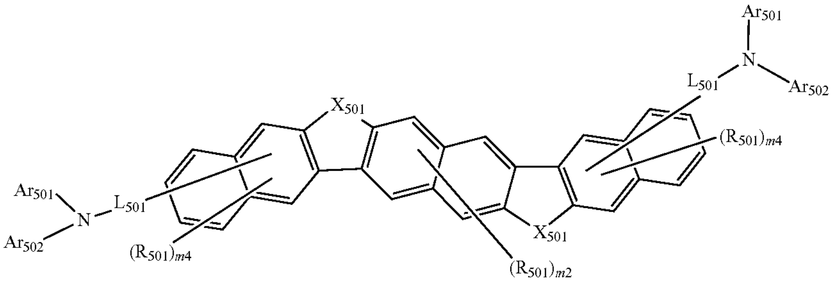

In the formulas (51-31) to (51-33), $R_{501}$, $X_{501}$, $Ar_{501}$, $Ar_{502}$, $L_{501}$, m1 to m4 are as defined in the formula (51).

In one embodiment, $Ar_{501}$ and $Ar_{502}$ are independently a substituted or unsubstituted aryl group including 6 to 50 ring carbon atoms.

In one embodiment, one of $Ar_{501}$ and $Ar_{502}$ is a substituted or unsubstituted aryl group including 6 to 50 ring carbon atoms and the other is a substituted or unsubstituted monovalent heterocyclic group including 5 to 50 ring atoms.

As examples of the compound represented by the formula (51), the following compounds can be given, for example. In the following specific examples, "Me" represents a methyl group.

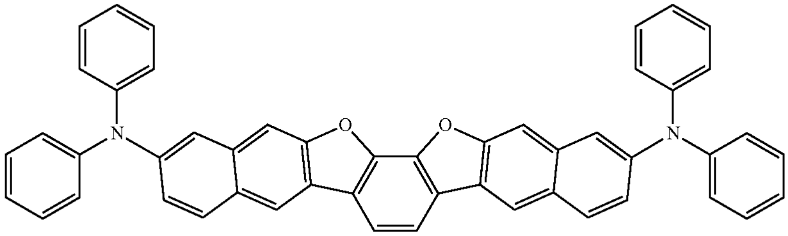
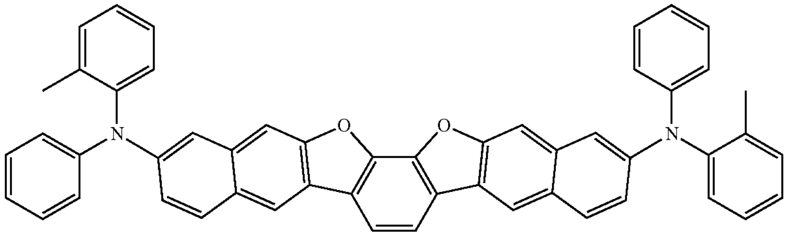
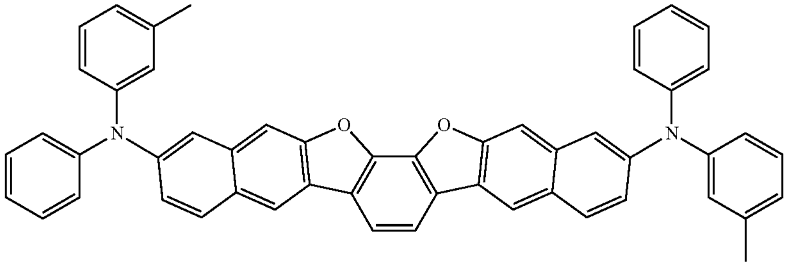
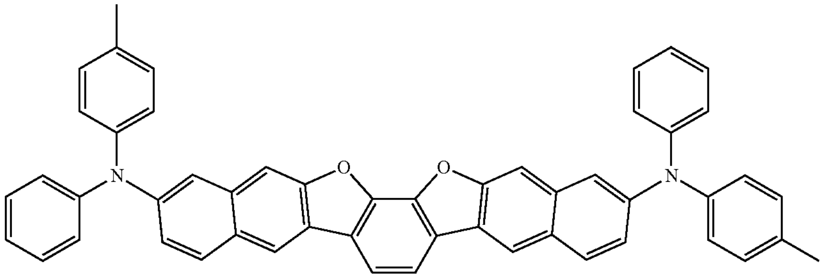
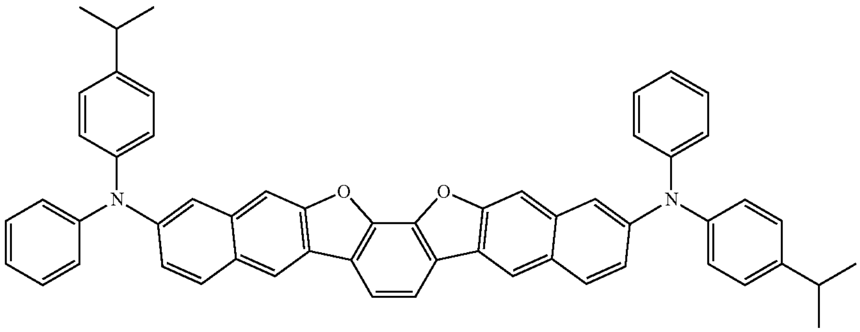
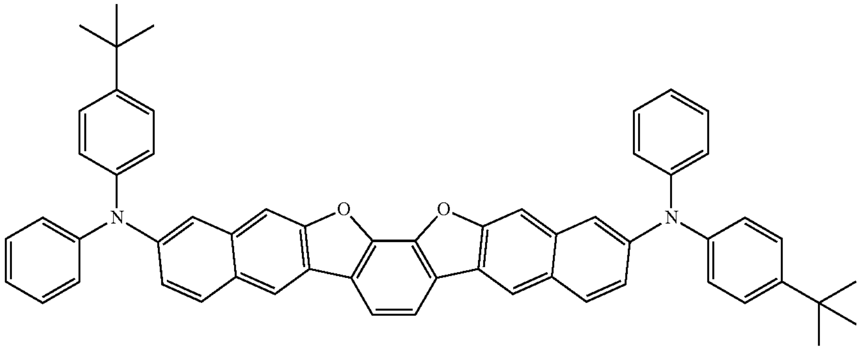

-continued
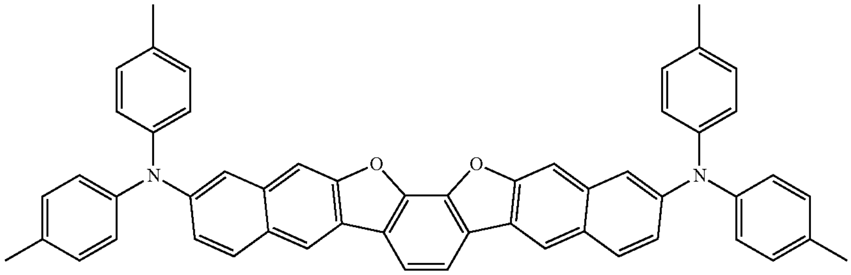
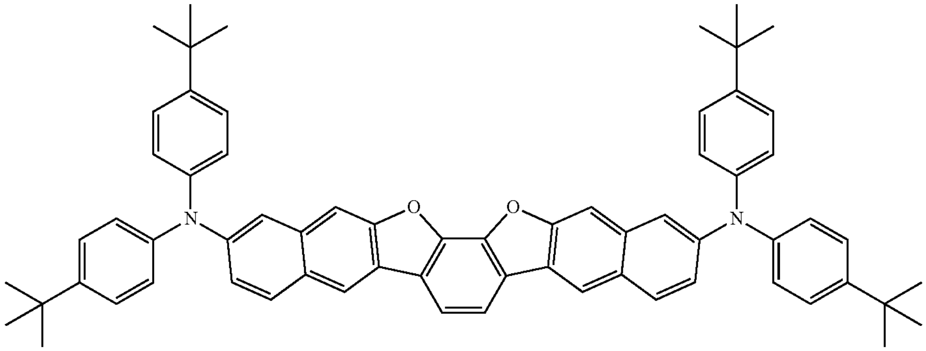
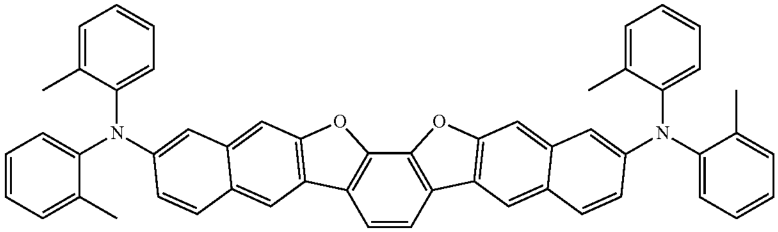
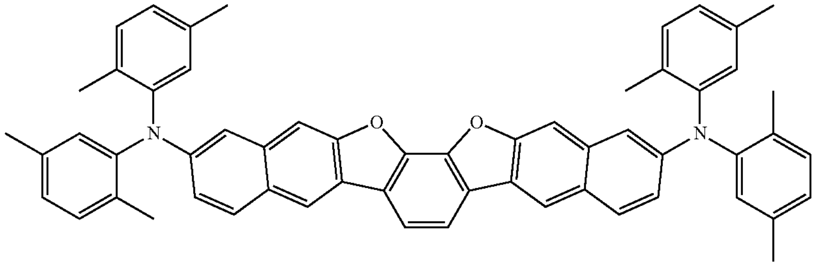
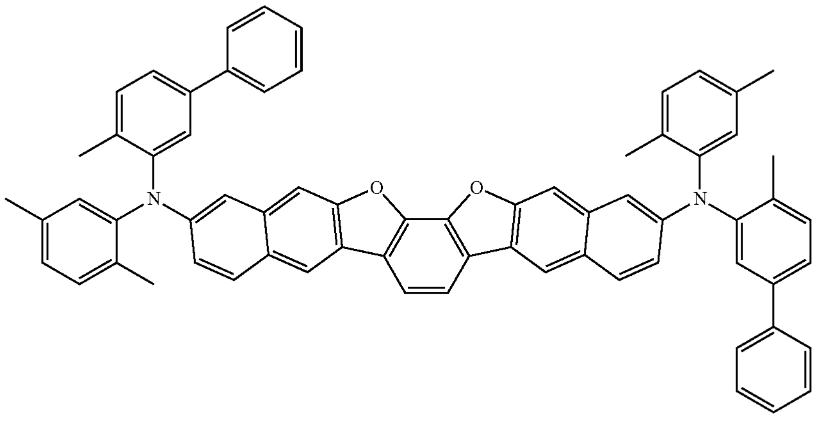

-continued
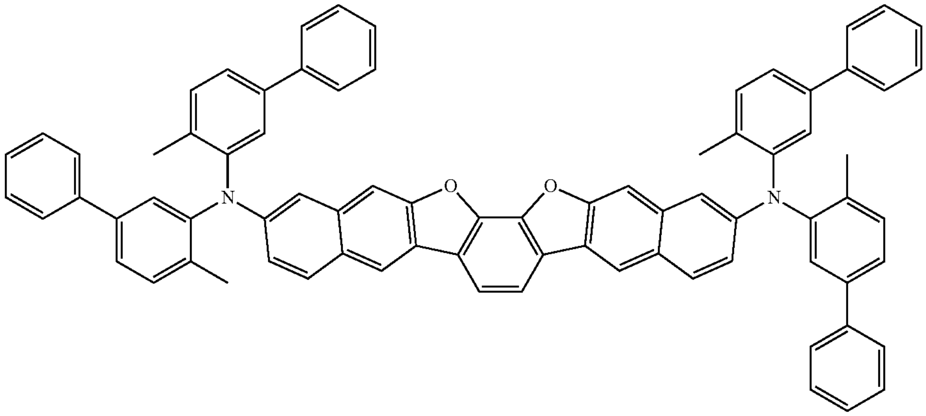
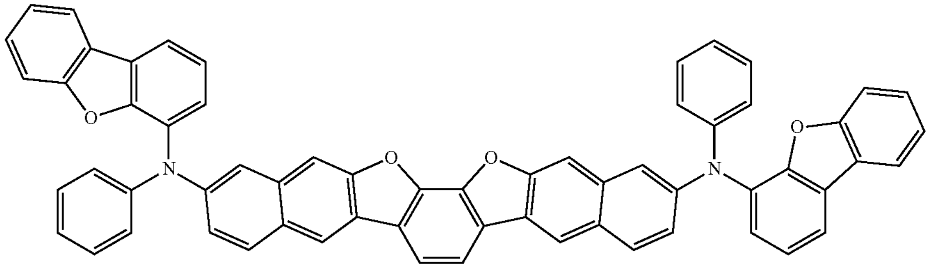
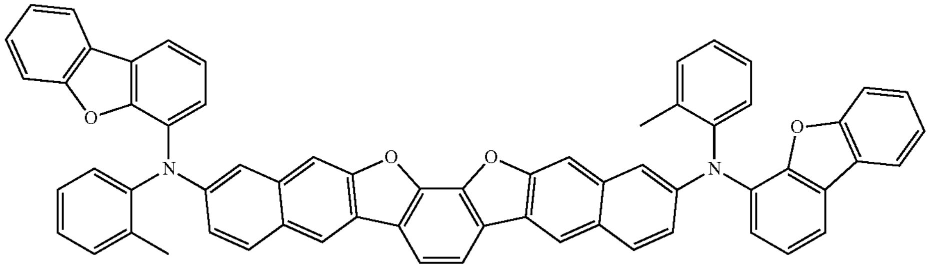
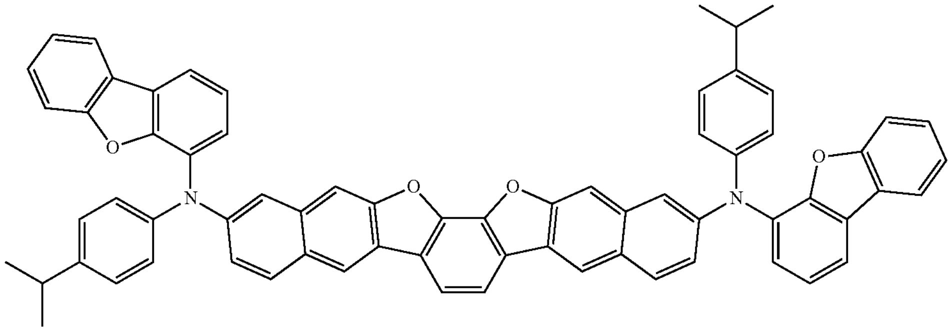
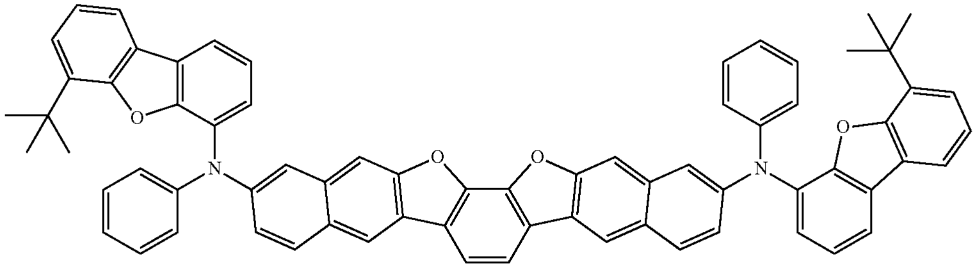

-continued
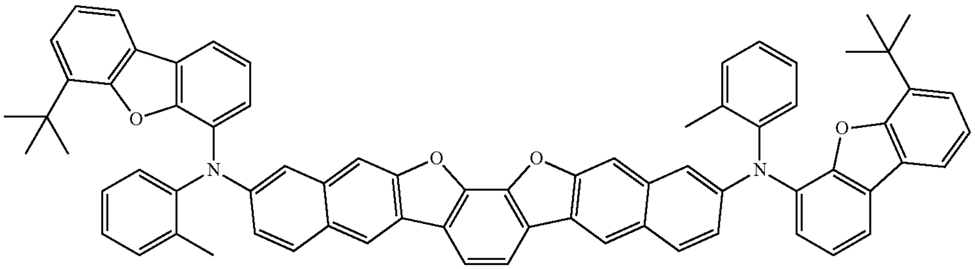
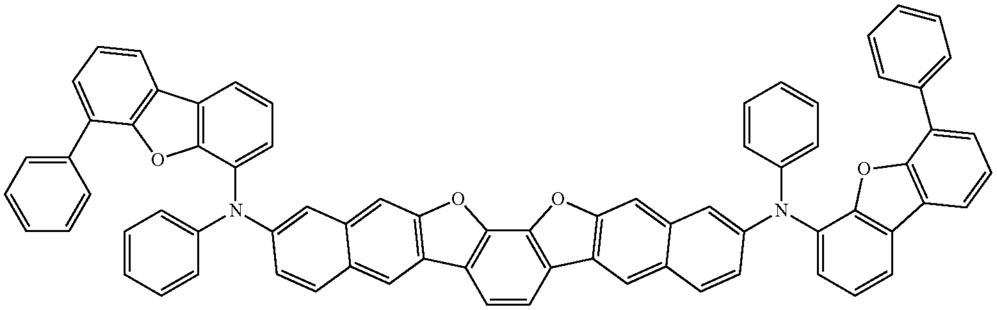
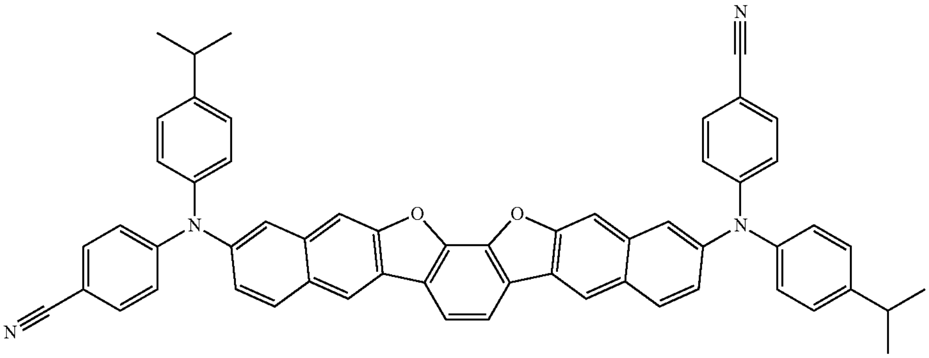
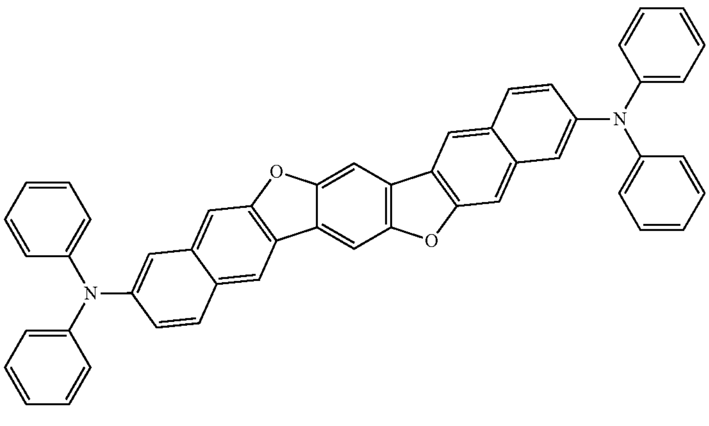

-continued
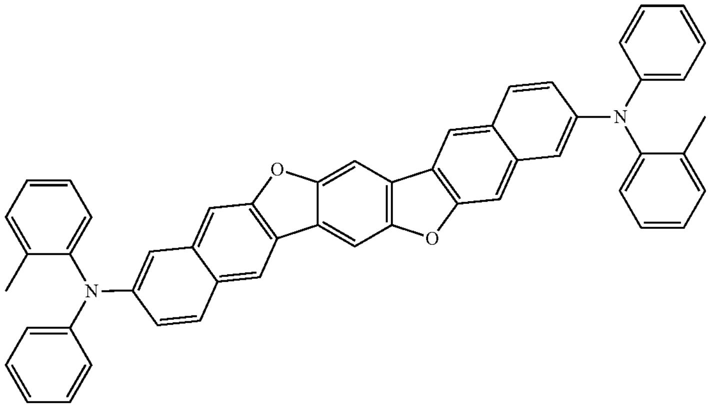
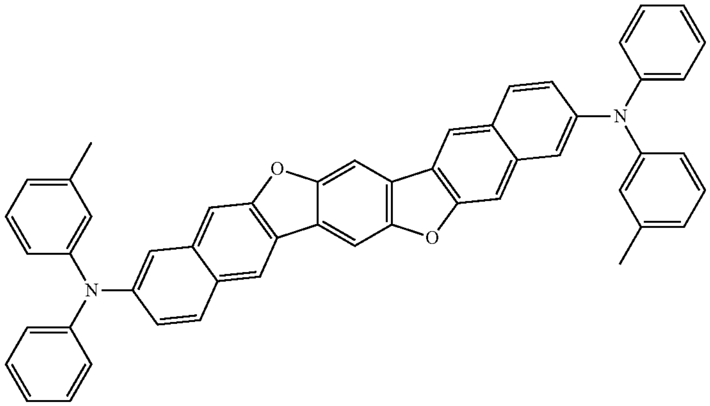
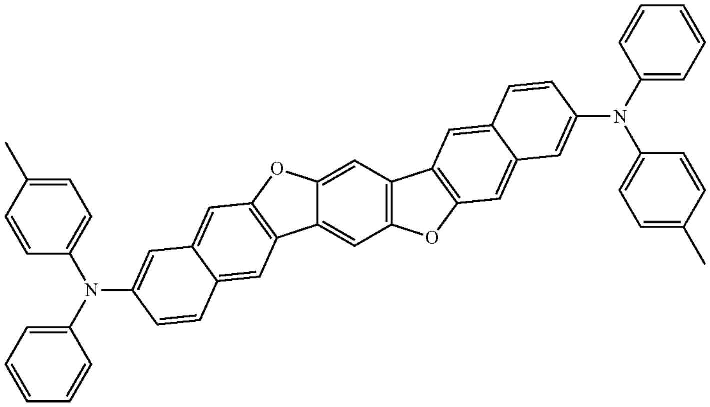
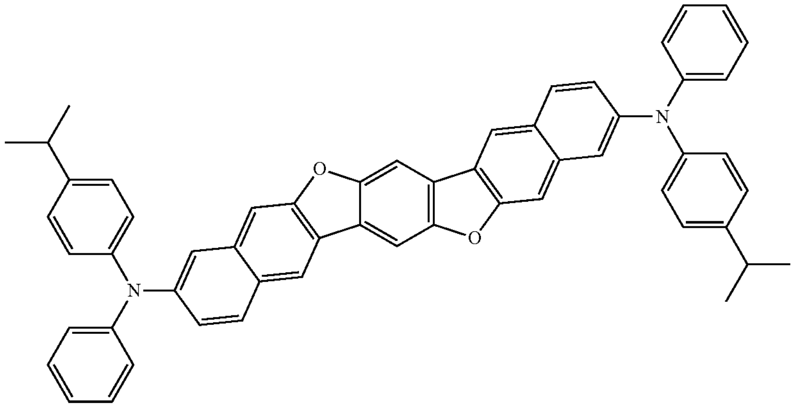

-continued
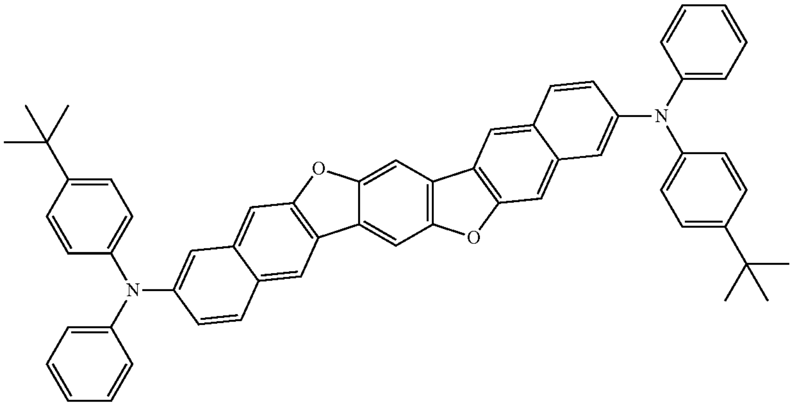
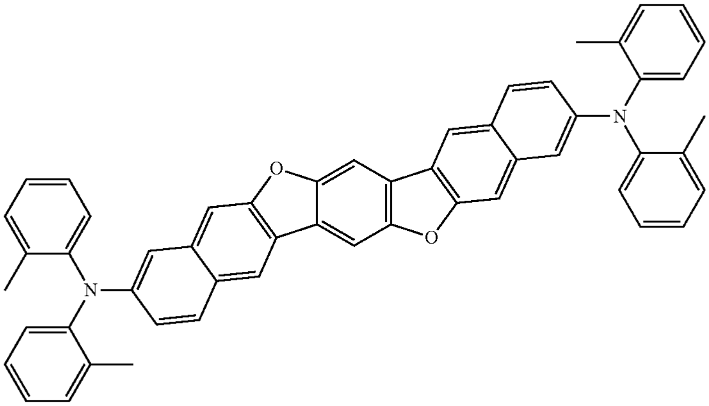
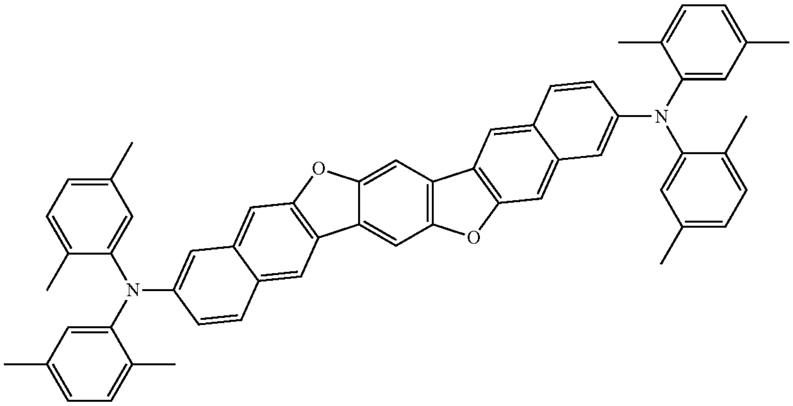
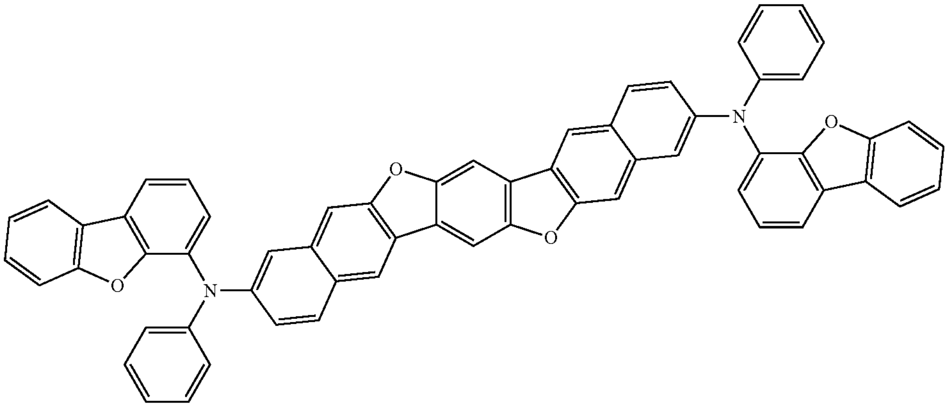

-continued
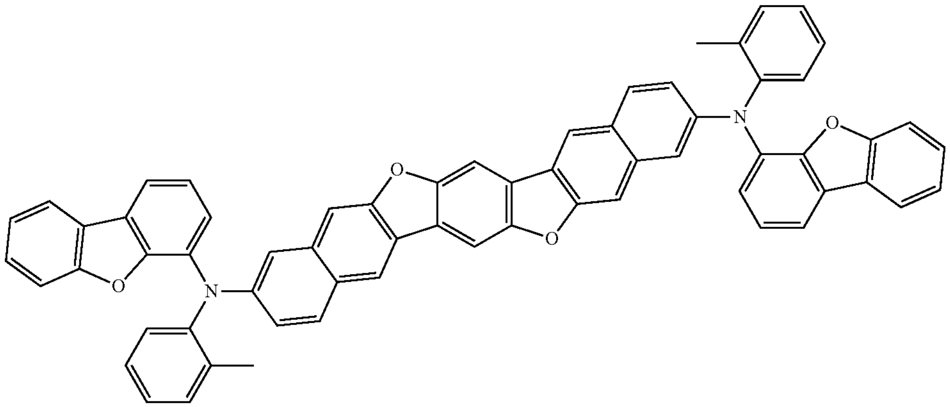
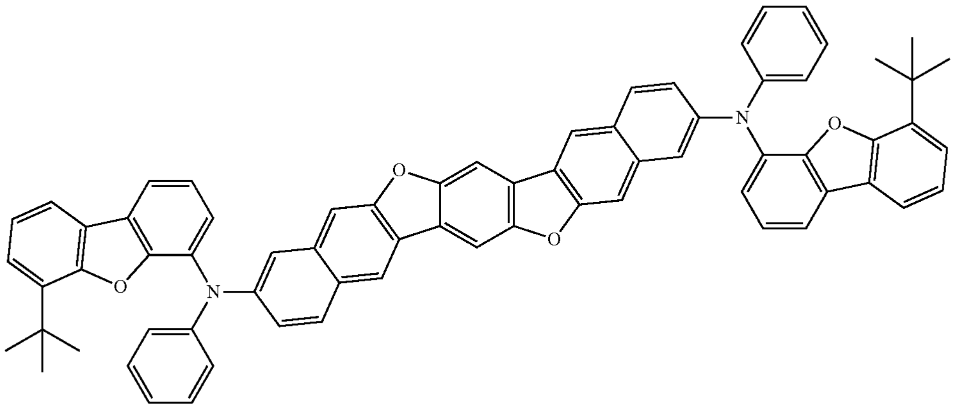
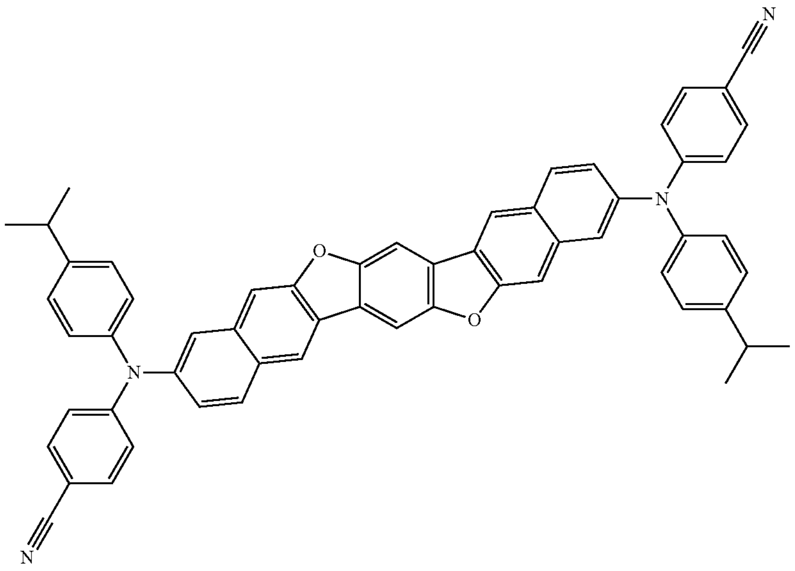

(Compound Represented by Formula (61))

The compound represented by the formula (61) is explained below.

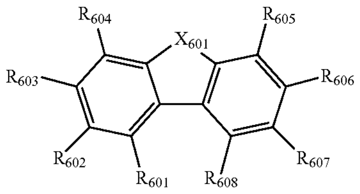
(61)

In the formula (61)

at least one set of $R_{601}$ and $R_{602}$, $R_{602}$ and $R_{603}$, and $R_{603}$ and $R_{604}$ form a divalent group represented by the following formula (62) by bonding with each other;

at least one set of $R_{605}$ and $R_{606}$, $R_{606}$ and $R_{607}$, and $R_{607}$ and $R_{608}$ form a divalent group represented by the following formula (63) by bonding with each other.

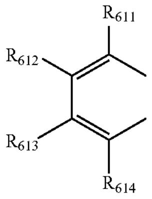
(62)

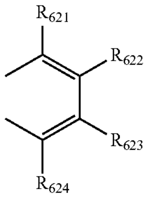
(63)

At least one of $R_{601}$ to $R_{604}$ that does not form the divalent group represented by the formula (62), and $R_{611}$ to $R_{614}$ is a monovalent group represented by the following formula (64);

at least one of $R_{605}$ to $R_{608}$ that do not form the divalent group represented by the formula (63), and $R_{621}$ to $R_{624}$ is a monovalent group represented by the following formula (64);

$X_{601}$ is an oxygen atom, a sulfur atom, or $NR_{609}$;

$R_{601}$ to $R_{608}$ that do not form the divalent group represented by the formulas (62) and (63) and that are not the monovalent group represented by the formula (64), $R_{611}$ to $R_{614}$ and $R_{621}$ to $R_{624}$ that are not the monovalent group represented by the formula (64), and $R_{609}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formulas (1).

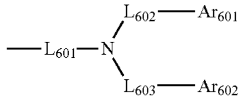
(64)

In the formula (64), $Ar_{601}$ and $Ar_{602}$ are independently a substituted or unsubstituted aryl group including 6 to 50 ring carbon atoms, or a substituted or unsubstituted monovalent heterocyclic group including 5 to 50 ring atoms; and $L_{601}$ to $L_{603}$ are independently a single bond, a substituted or unsubstituted arylene group including 6 to 30 ring carbon atoms, a substituted or unsubstituted divalent heterocyclic group including 5 to 30 ring atoms, or a divalent group formed by linking 2 to 4 of a substituted or unsubstituted arylene group including 6 to 30 ring carbon atoms, and a substituted or unsubstituted divalent heterocyclic group including 5 to 30 ring atoms.

In the formula (61), positions at which the divalent group represented by the formula (62) and the divalent group represented by the formula (63) are formed are not limited, and these groups can be formed at possible positions of $R_{601}$ to $R_{608}$.

In one embodiment, the compound represented by the formula (61) is a compound represented by any one of the following formulas (61-1) to (61-6).

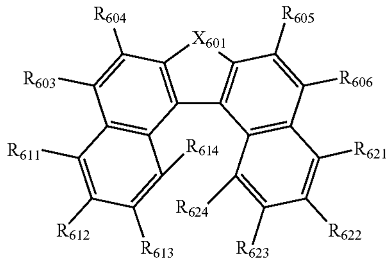
(61-1)

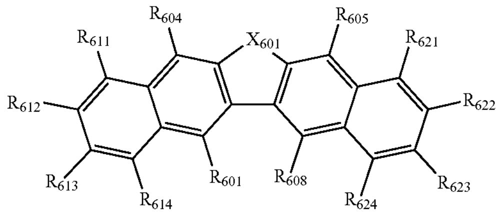
(61-2)

-continued (61-3)

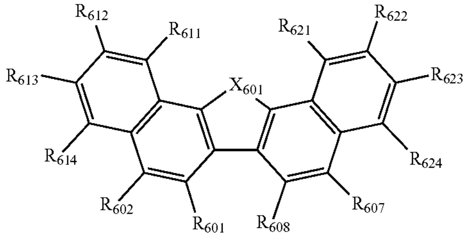

(61-4)

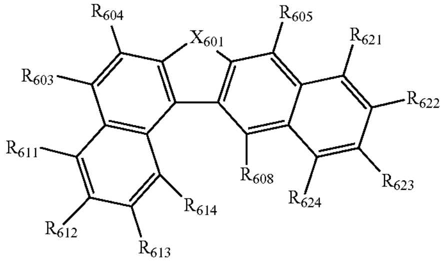

(61-5)

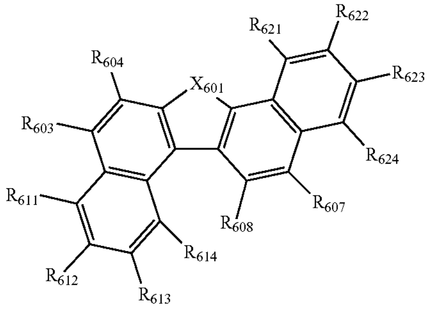

(61-6)

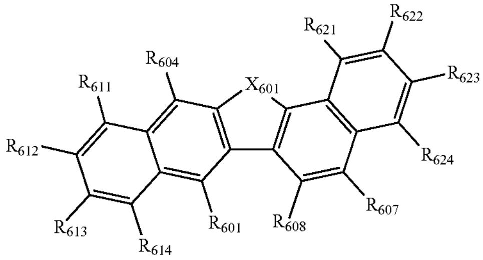

In the formulas (61-1) to (61-6), $X_{601}$ is as defined in the formula (61);

at least two of $R_{601}$ to $R_{624}$ are the monovalent groups represented by the formula (64);

$R_{601}$ to $R_{624}$ that are not the monovalent group represented by the formula (64) are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

and $R_{901}$ to $R_{907}$ are as defined in the formulas (1).

In one embodiment, the compound represented by the formula (61) is a compound represented by any one of the following formulas (61-7) to (61-18).

(61-7)

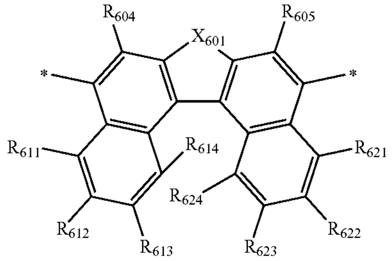

(61-8)

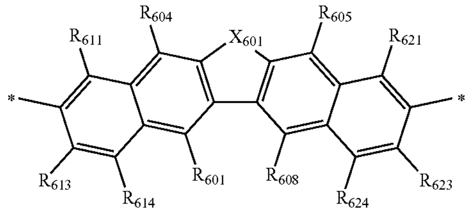

(61-9)

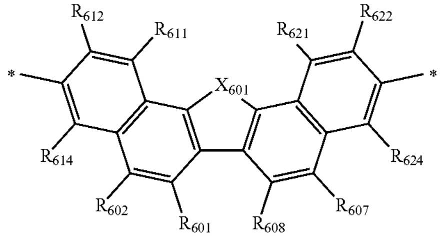

(61-10)

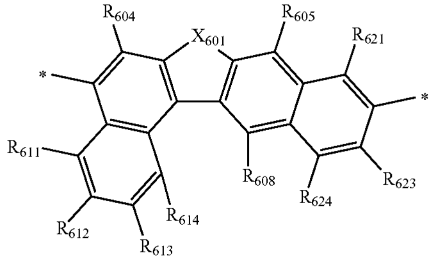

(61-11)

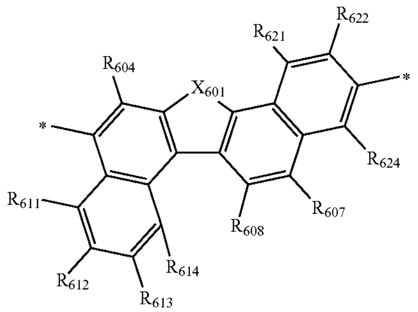

-continued (61-12)

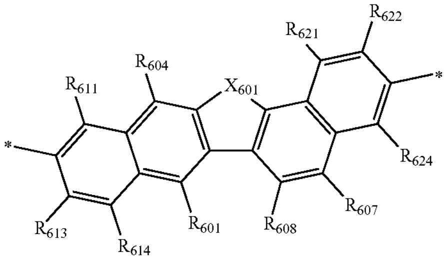

(61-13)

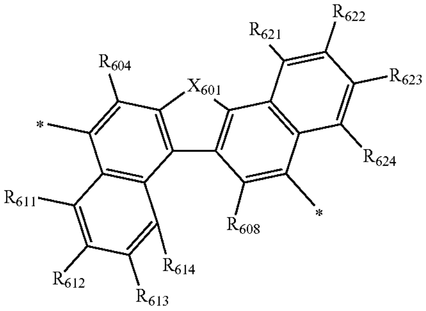

(61-14)

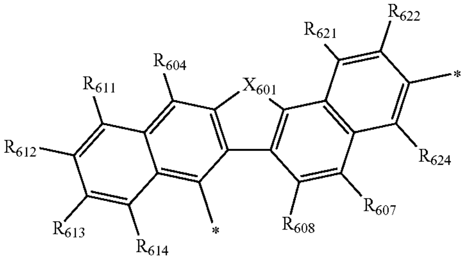

(61-15)

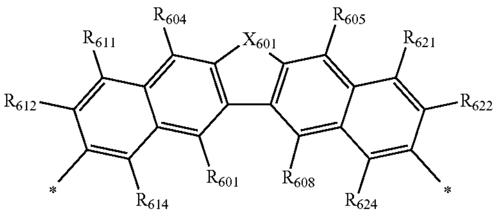

(61-16)

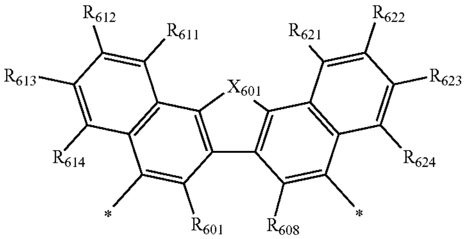

(61-17)

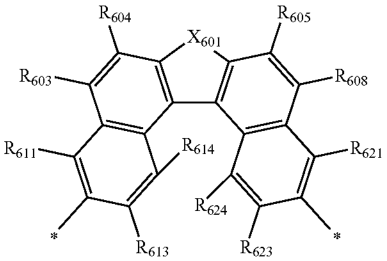

-continued (61-18)

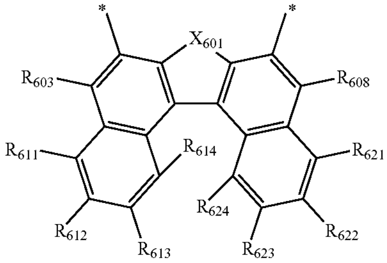

In the formulas (61-7) to (61-18), $X_{601}$ is as defined in the formula (61); * is a single bond which bonds to the monovalent group represented by the formula (64); and $R_{601}$ to $R_{624}$ are the same as $R_{601}$ to $R_{624}$ that are not the monovalent group represented by the formula (64).

$R_{601}$ to $R_{608}$ that do not form the divalent group represented by any one of the formulas (62) and (63) and that are not the monovalent group represented by the formula (64), and $R_{611}$ to $R_{614}$ and $R_{621}$ to $R_{624}$ that are not the monovalent group represented by the formula (64) are preferably independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

The monovalent group represented by the formula (64) is preferably a group represented by the following formula (65) or (66).

(65)

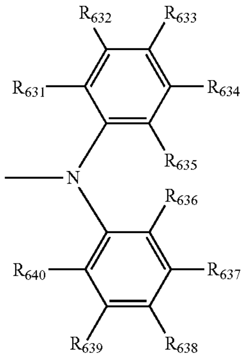

In the formula (65), $R_{631}$ to $R_{640}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formulas (1).

(66)

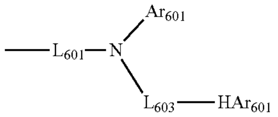

In the formula (66), $Ar_{601}$, $L_{601}$ and $L_{603}$ are as defined in the formula (64); and $HAr_{601}$ is a structure represented by the following formula (67).

(67)

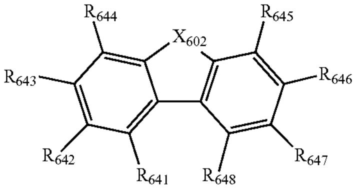

In the formula (67), $X_{602}$ is an oxygen atom or a sulfur atom;

any one of $R_{641}$ to $R_{648}$ is a single bond which bonds to $L_{603}$;

$R_{641}$ to $R_{648}$ that are not single bonds are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formulas (1).

As specific examples of the compound represented by the formula (61), the following compounds can be given, in addition to the compounds described in WO2014/104144. In the following specific examples, "Me" represents a methyl group.

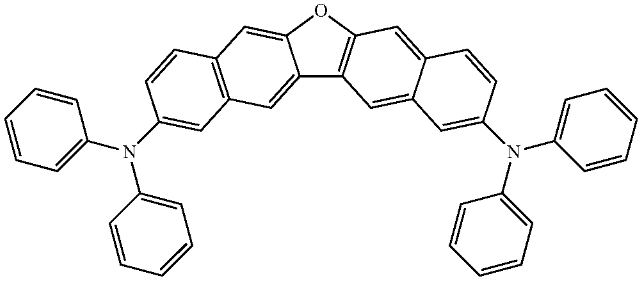

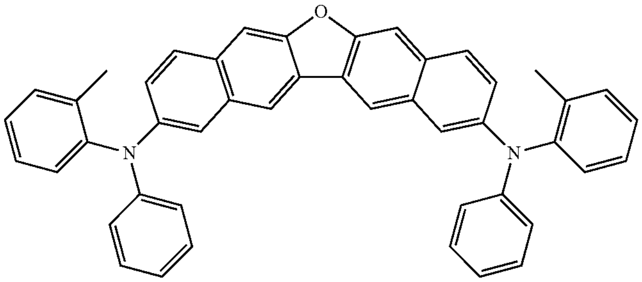

-continued
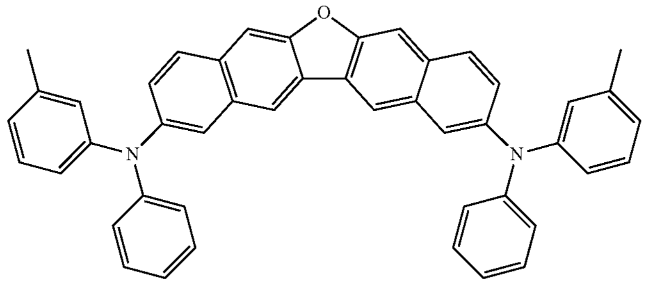
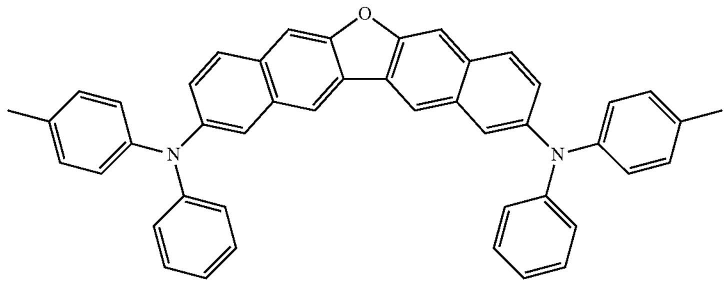
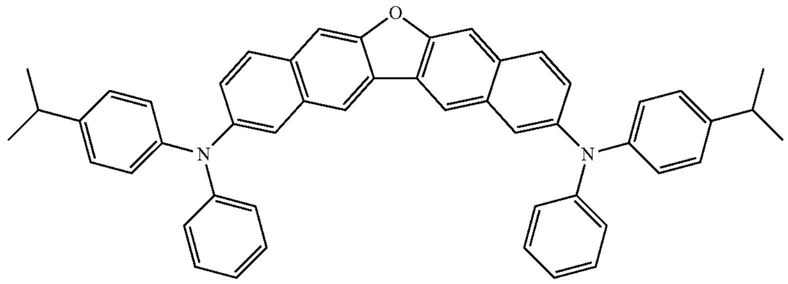
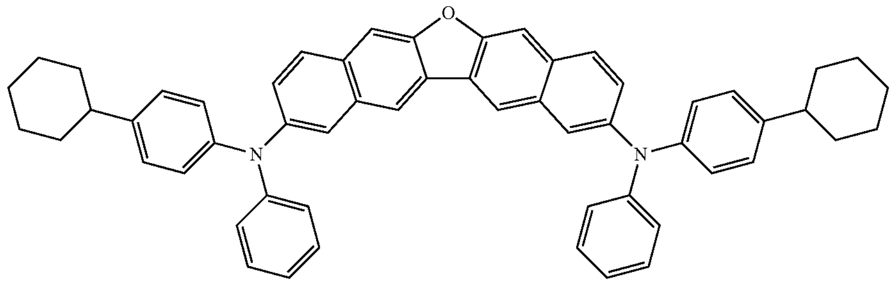
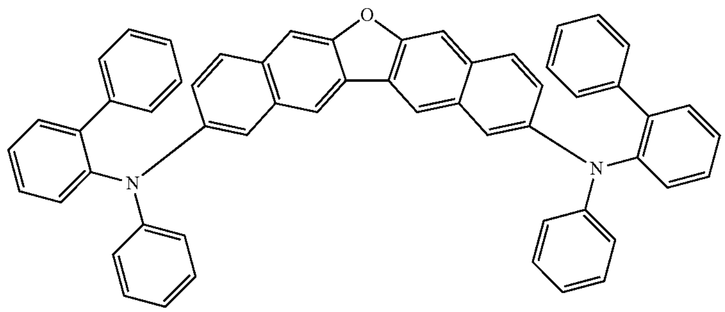

-continued
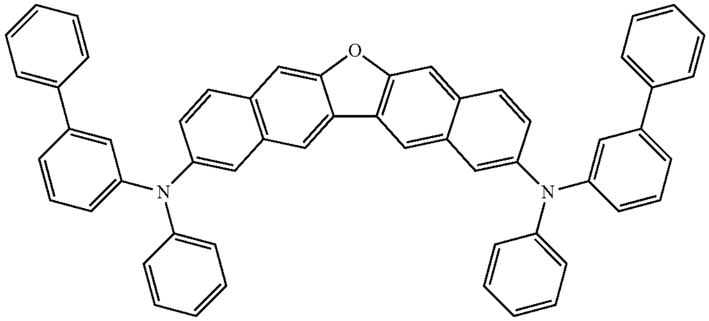
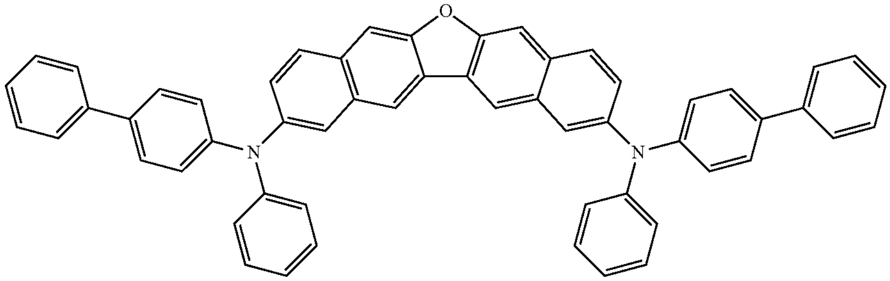
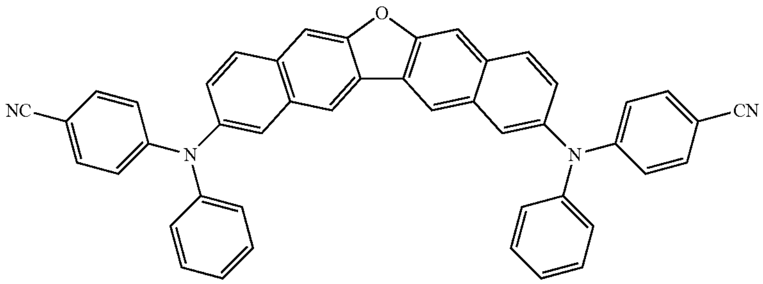
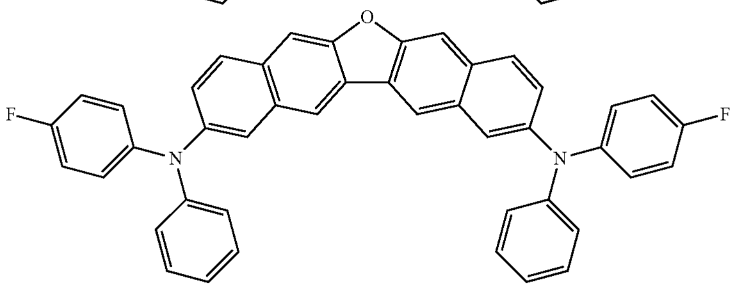
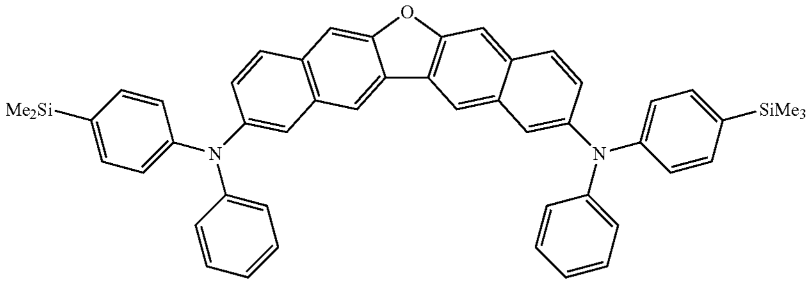
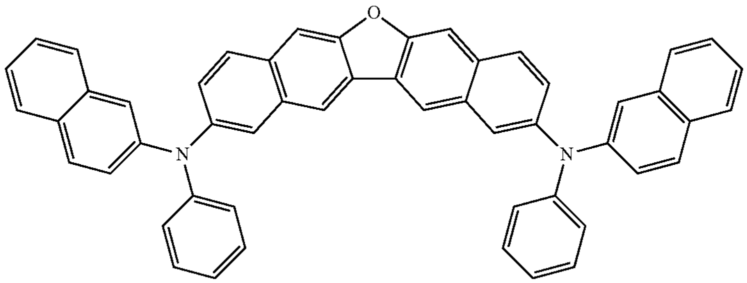

-continued
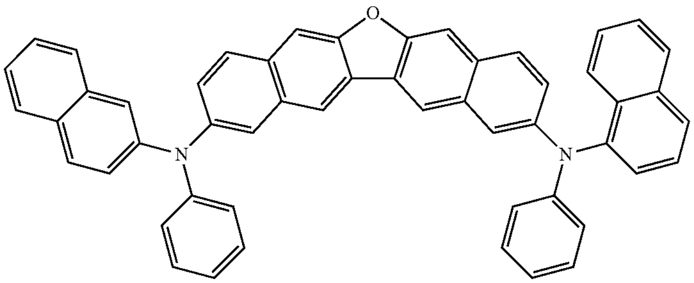
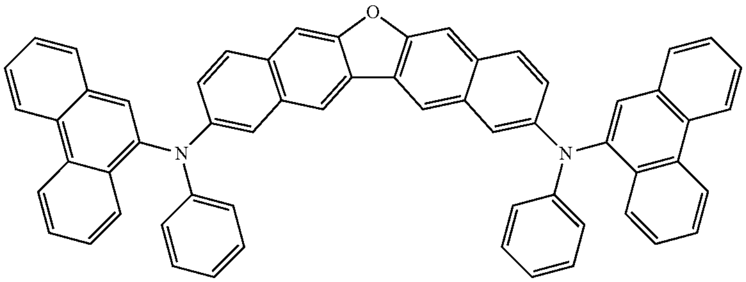
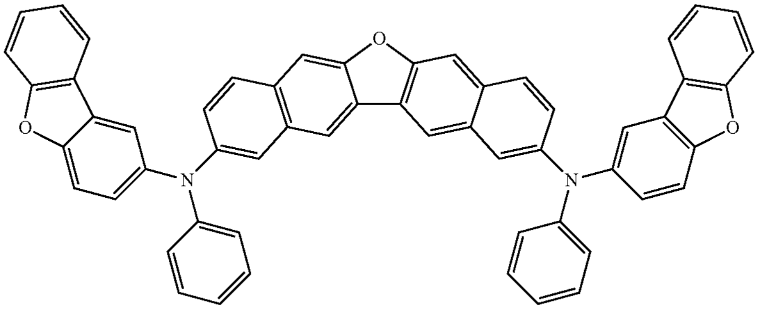
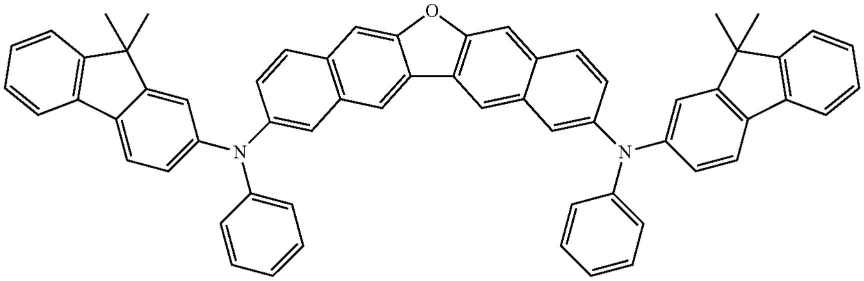
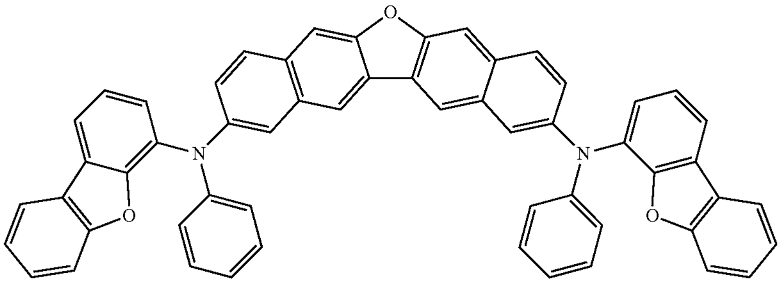
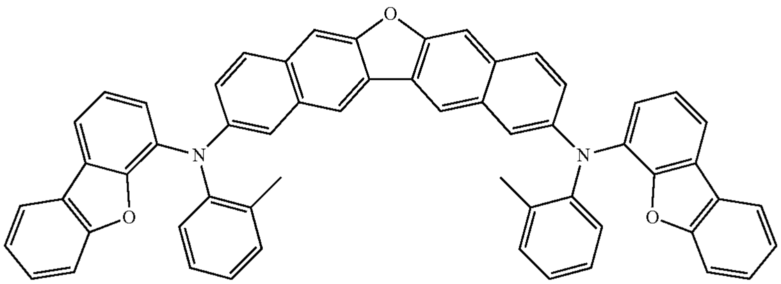

-continued
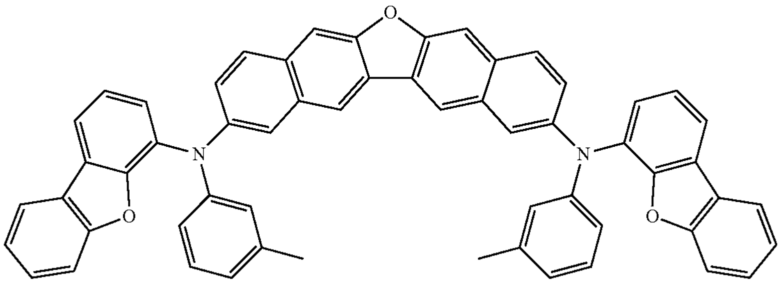
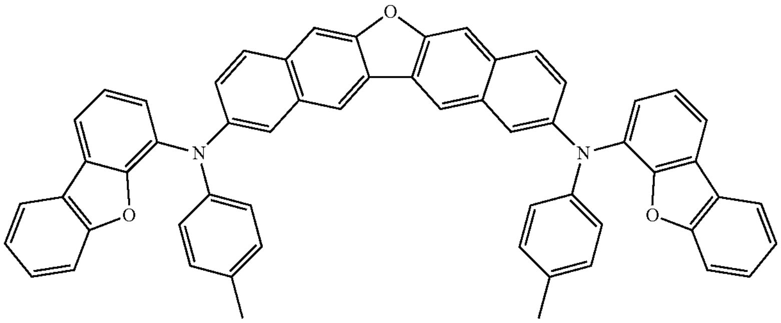
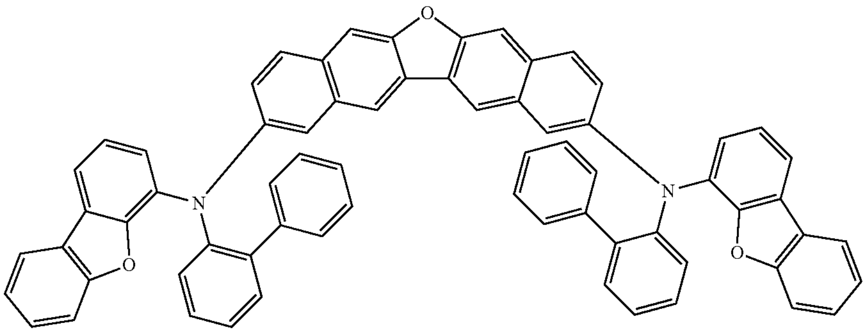
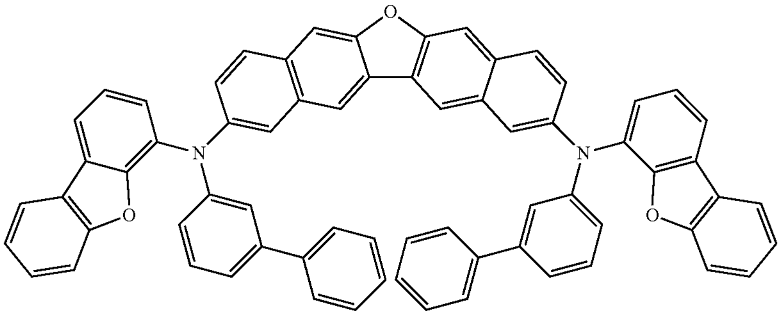
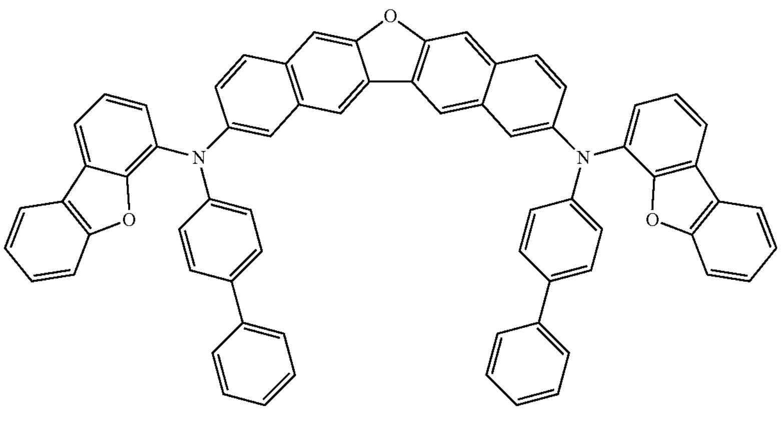

-continued
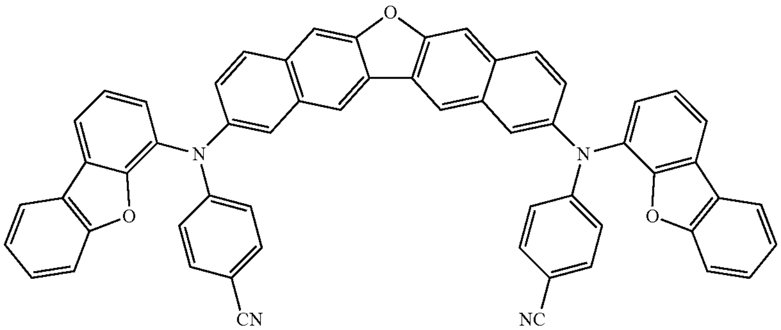
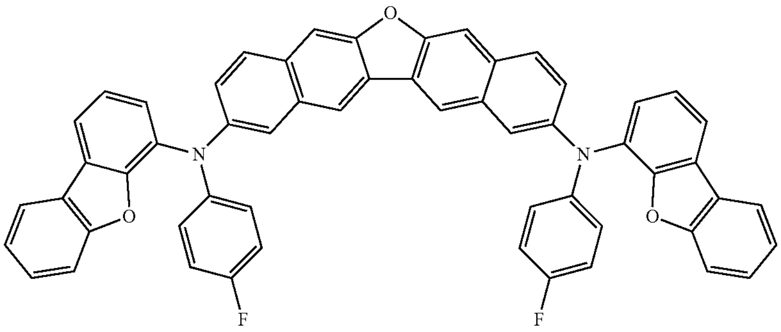
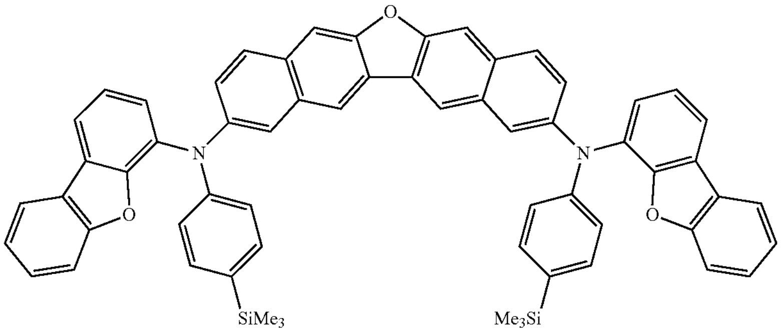
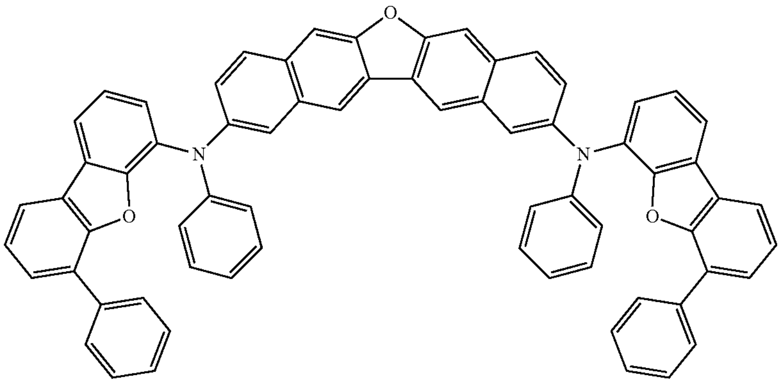

-continued
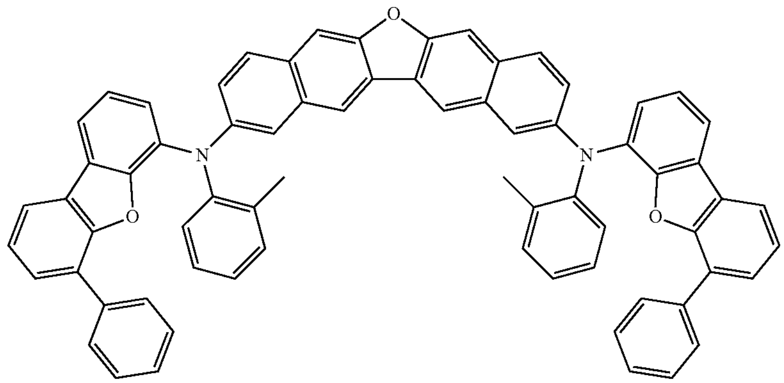
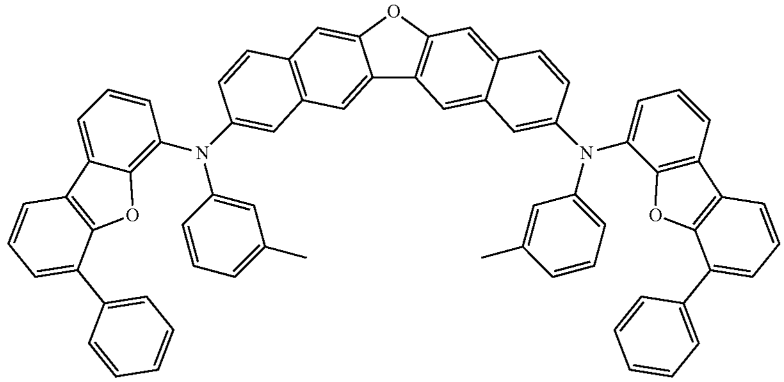
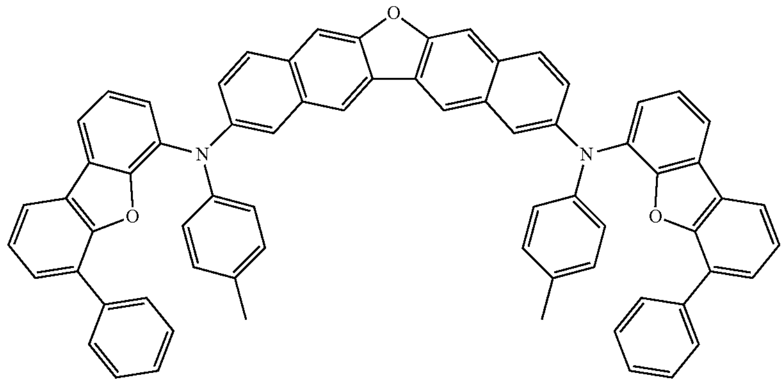
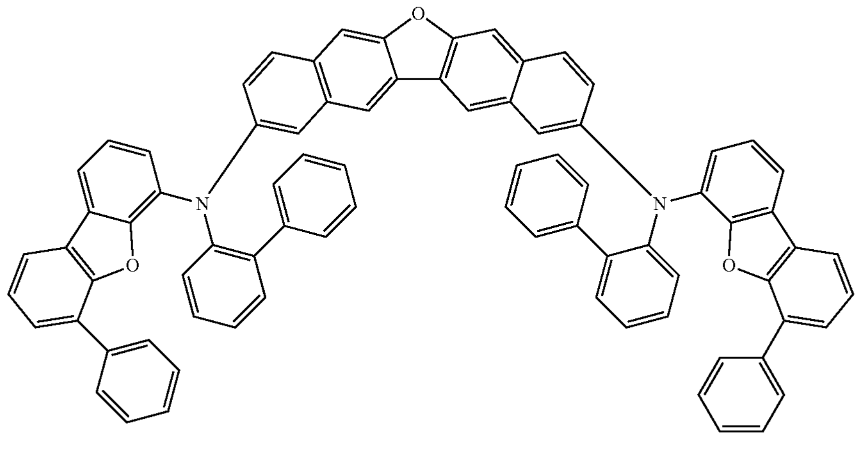

-continued
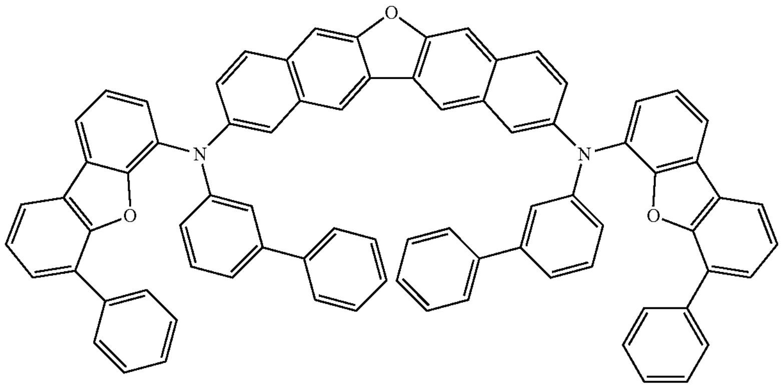
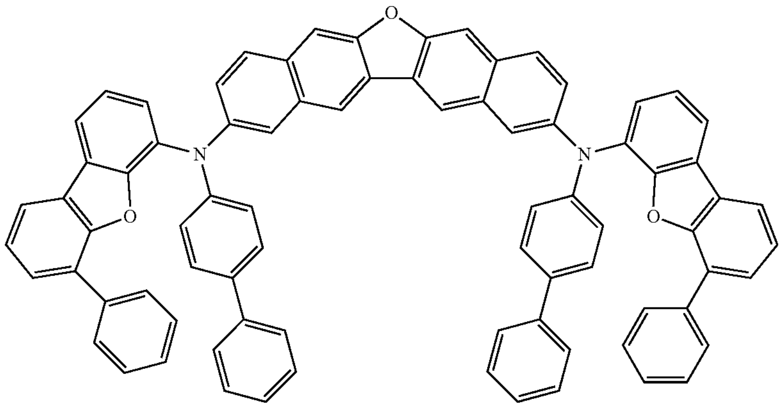
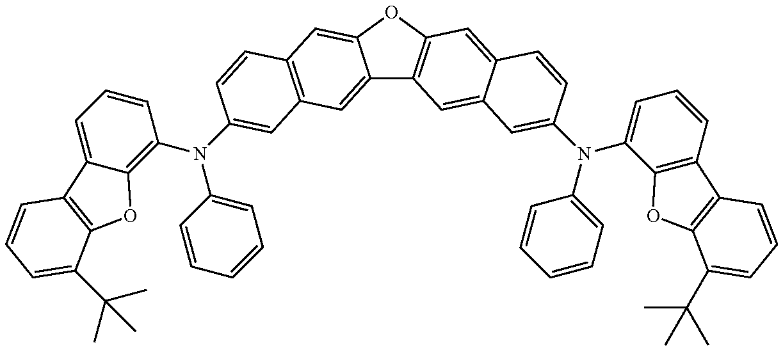
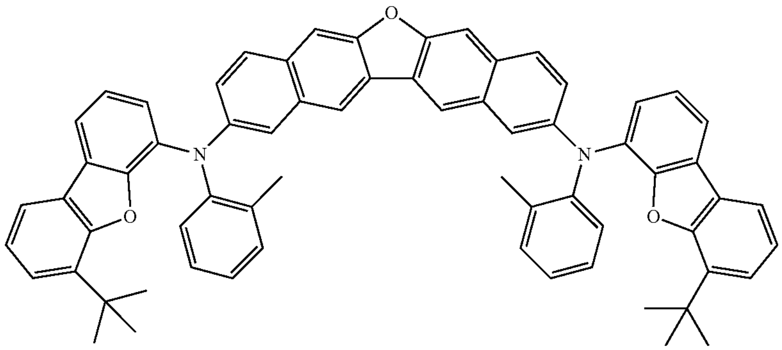

-continued
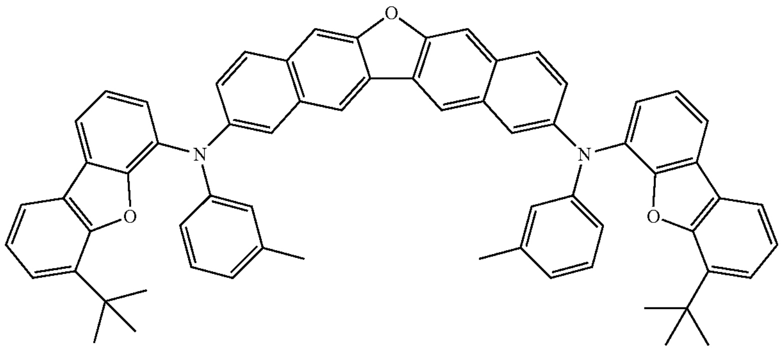
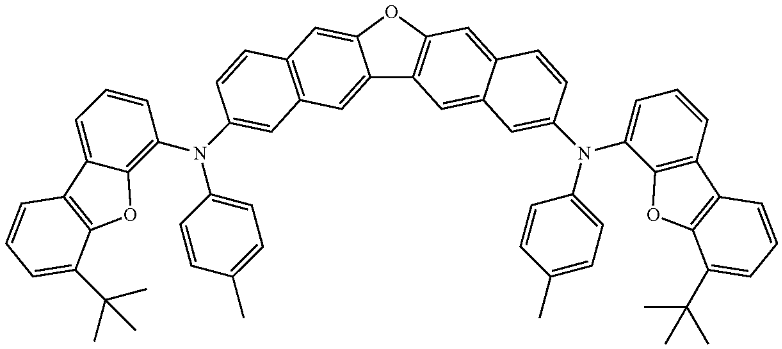
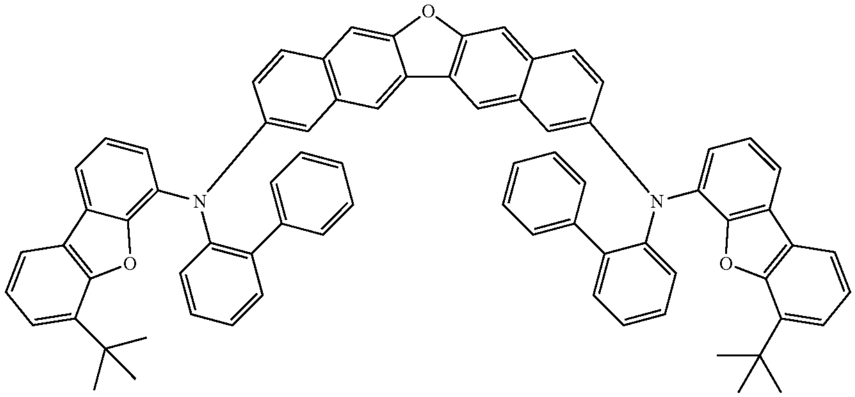
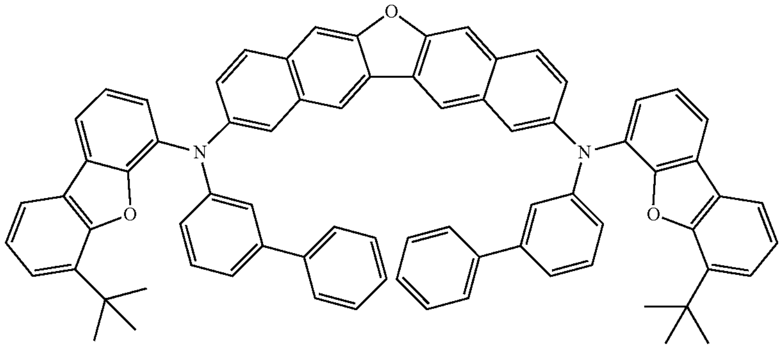

-continued
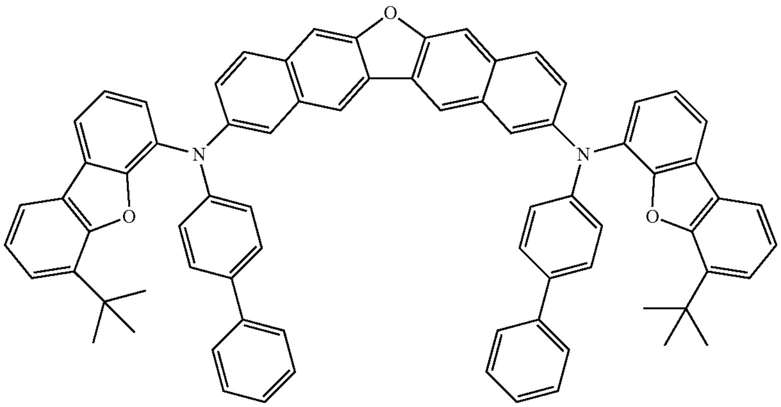
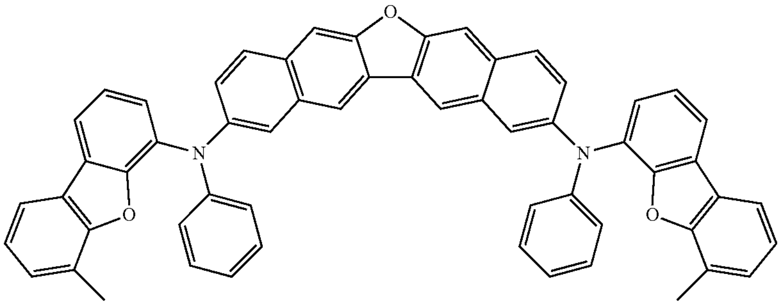
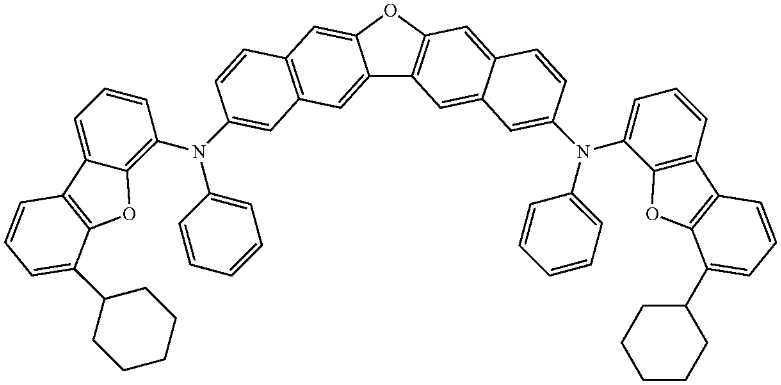
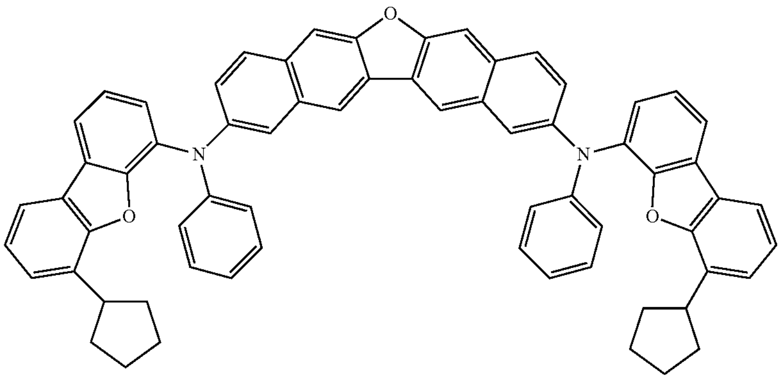

-continued
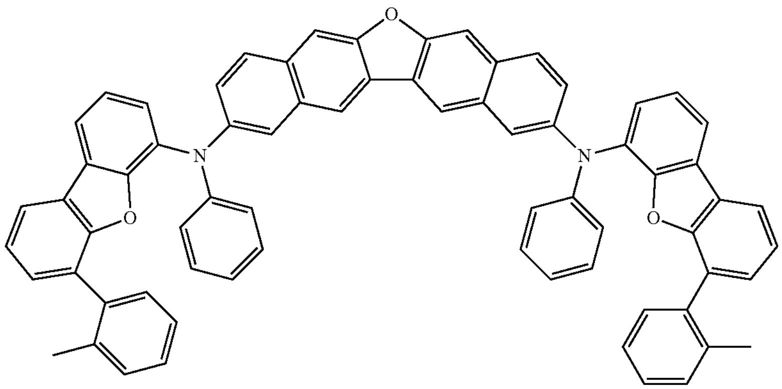
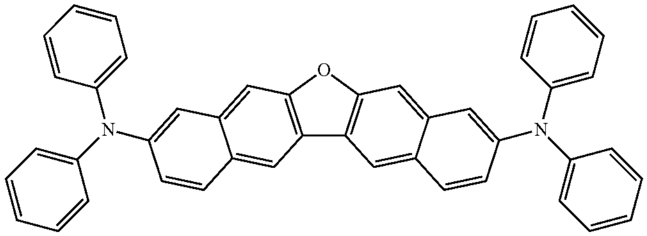
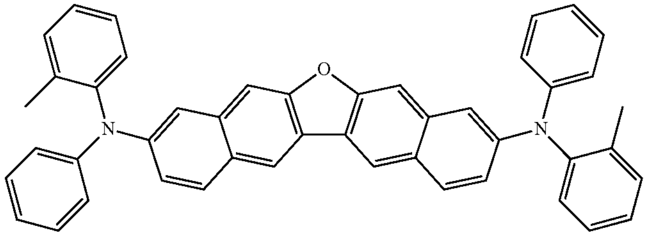
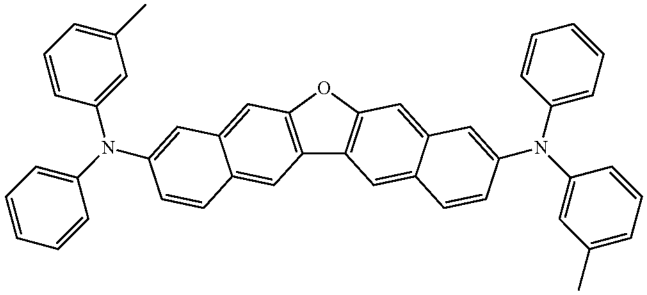
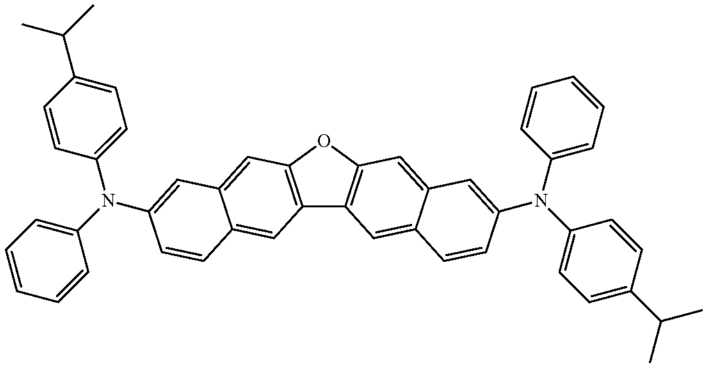

-continued
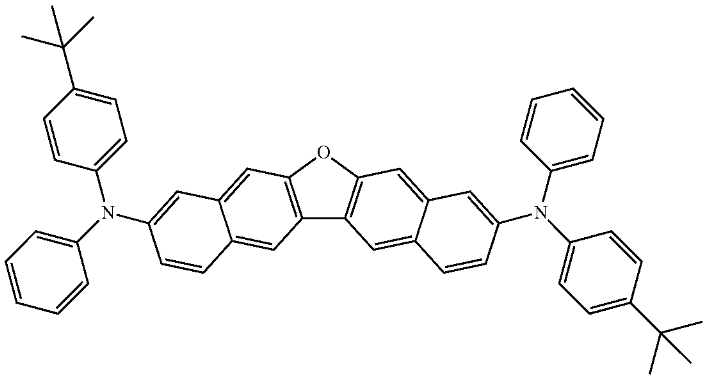
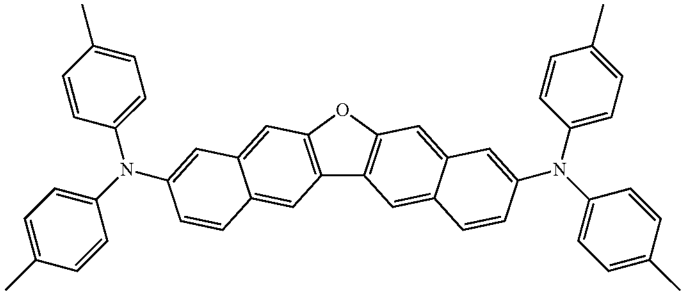
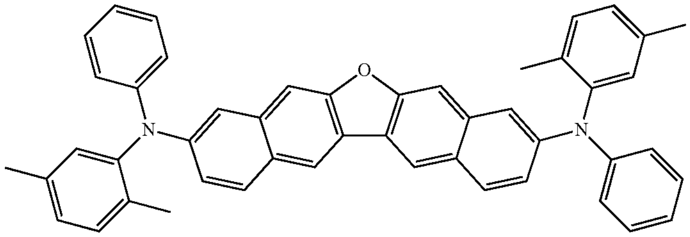
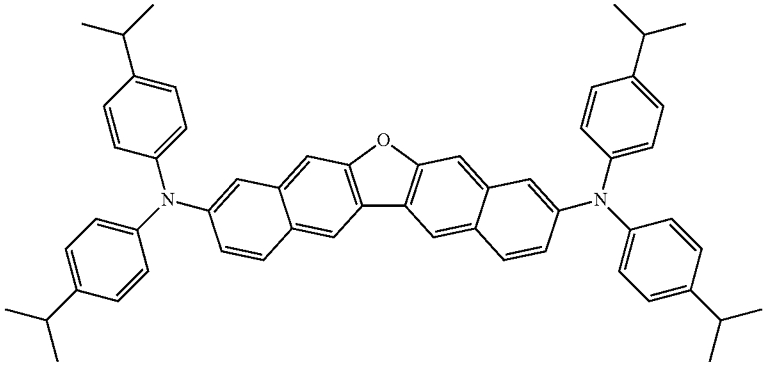
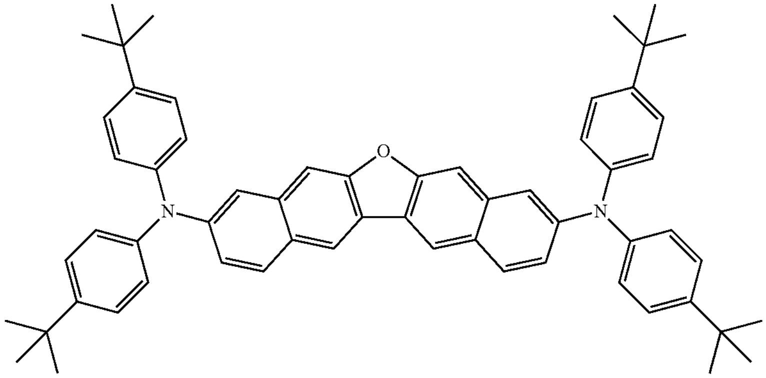

-continued
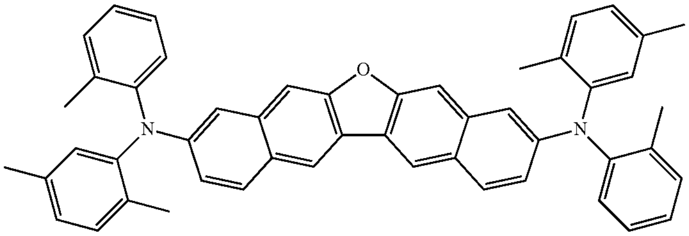
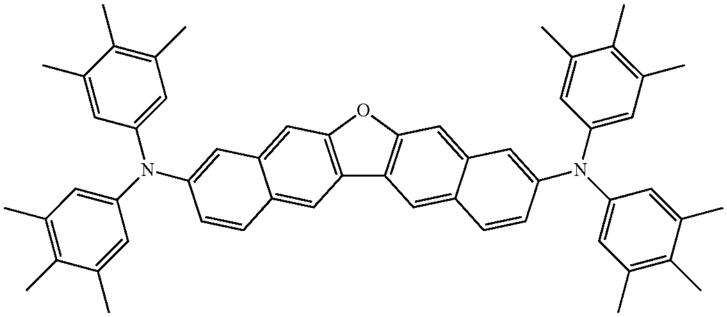
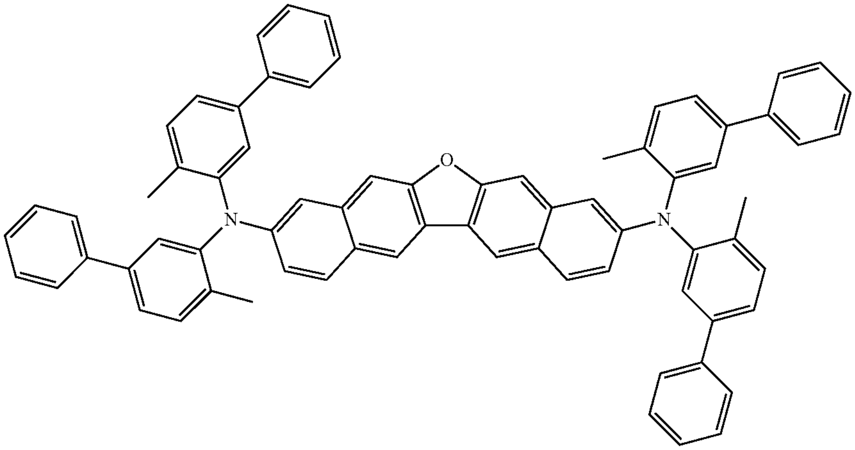
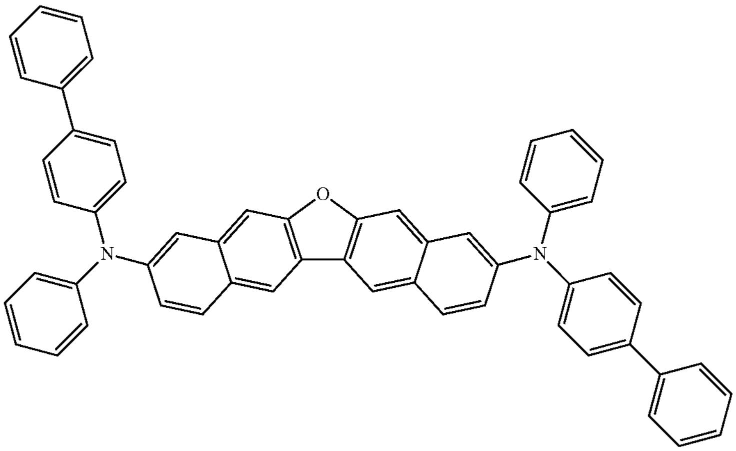
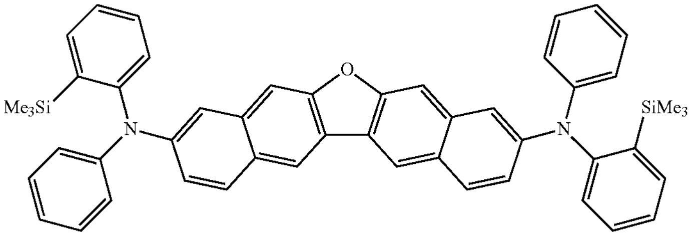

-continued
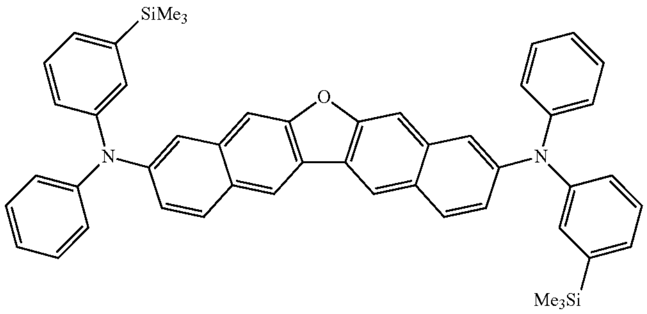
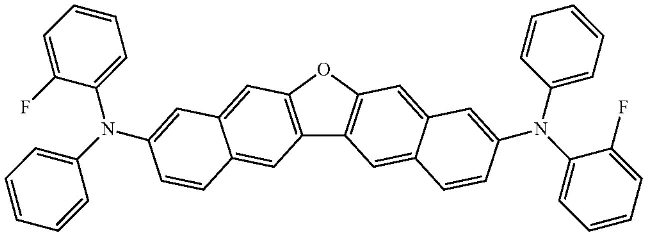
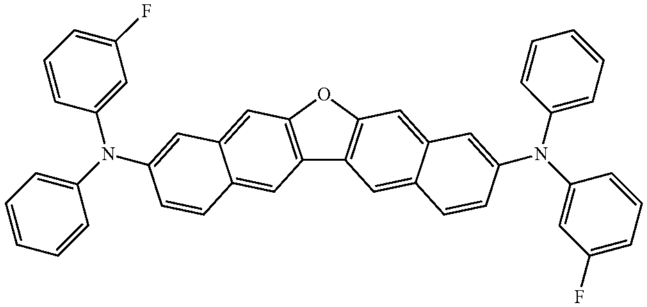
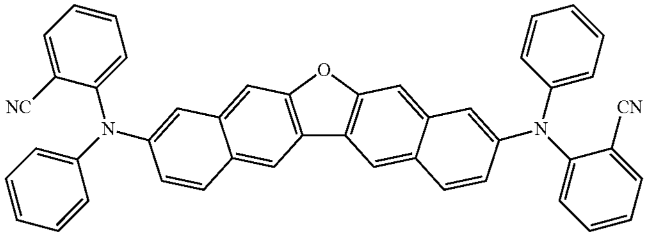
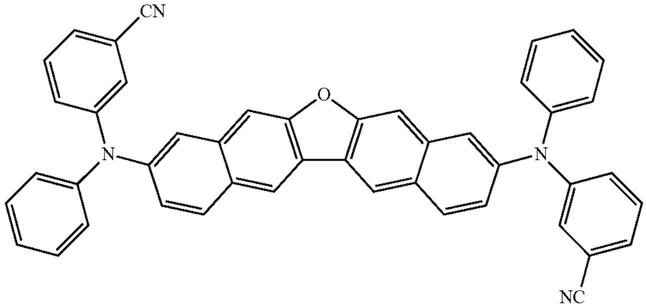
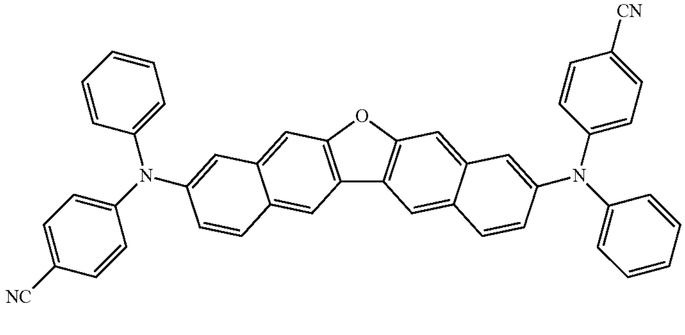

-continued
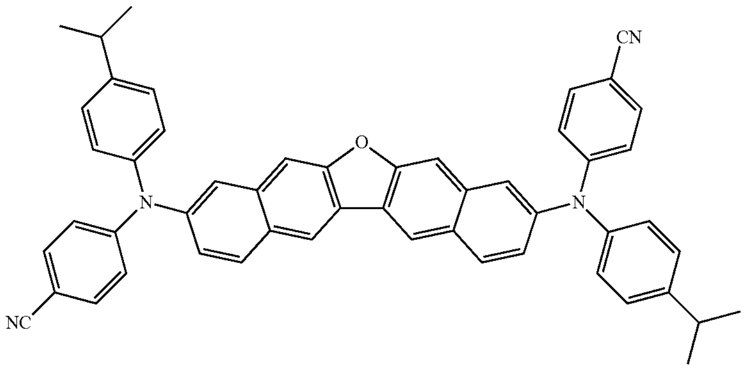
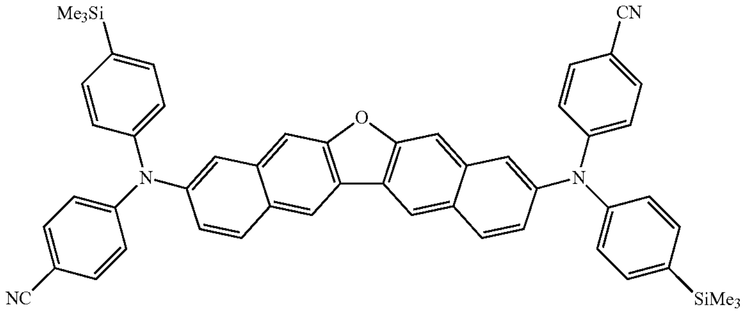
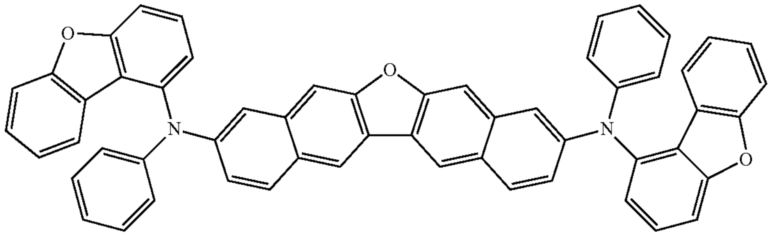
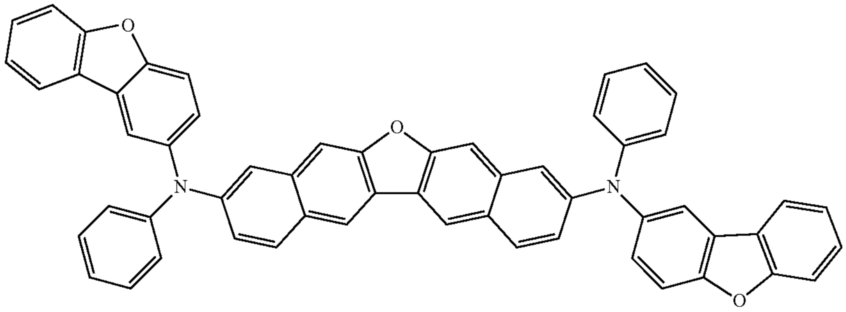
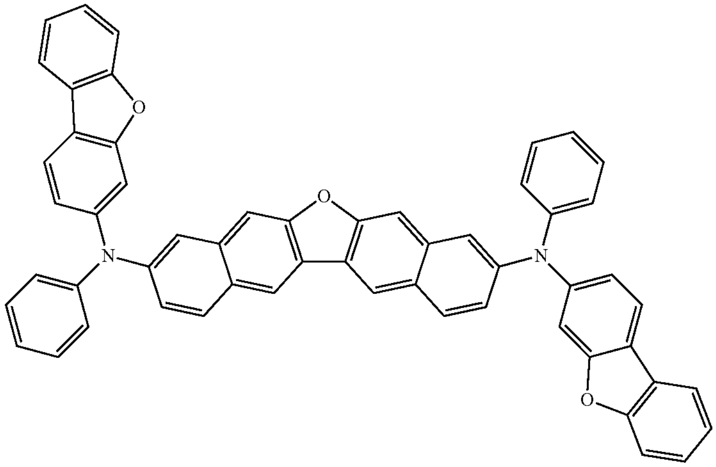

-continued

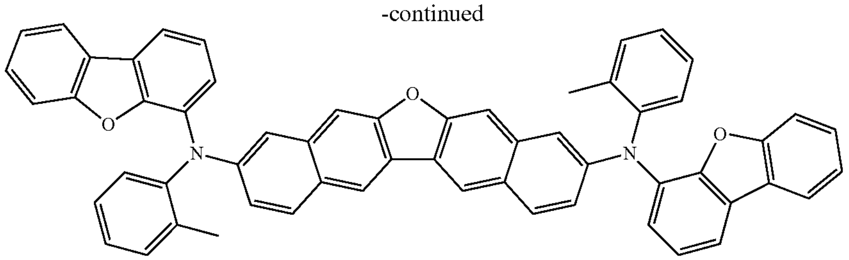

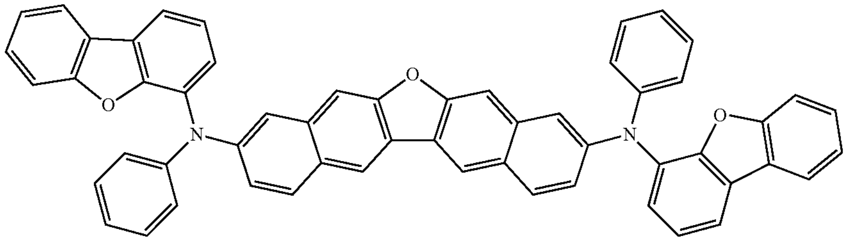

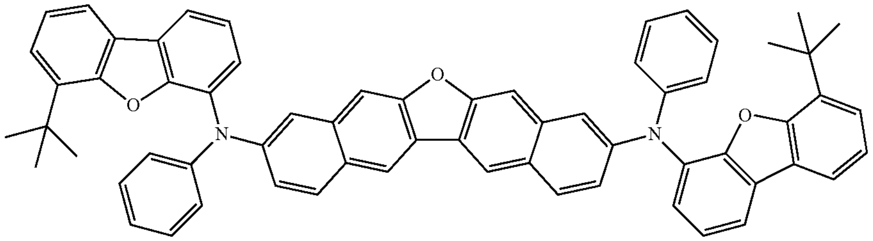

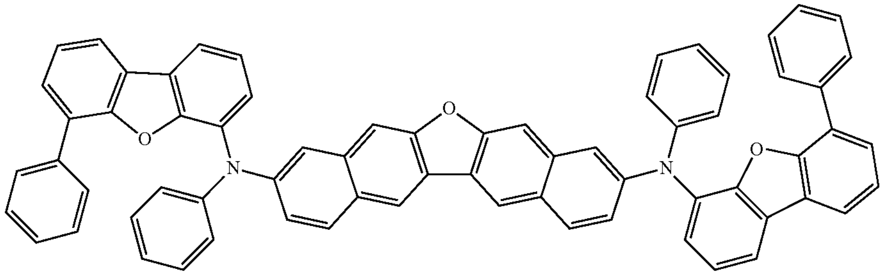

(Compound Represented by Formula (71))

The compound represented by the formula (71) is explained below.

(71)

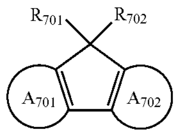

In the formula (71), a ring $A_{701}$ and a ring $A_{702}$ are independently a substituted or unsubstituted aromatic hydrocarbon ring including 6 to 50 ring carbon atoms, or a substituted or unsubstituted heterocycle including 5 to 50 ring atoms;

one or more rings selected from the group consisting of the ring $A_{701}$ and the ring $A_{702}$ are bonded to *'s in the structure represented by the following formula (72).

(72)

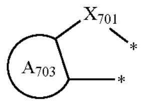

In the formula (72), a ring $A_{703}$ is a substituted or unsubstituted aromatic hydrocarbon ring including 6 to 50 ring carbon atoms, or a substituted or unsubstituted heterocycle including 5 to 50 ring atoms;

$X_{701}$ is $NR_{703}$, $C(R_{704})(R_{705})$, $Si(R_{706})(R_{707})$, $Ge(R_{708})(R_{709})$, O, S or Se;

$R_{701}$ and $R_{702}$ form a substituted or unsubstituted, saturated or unsaturated ring by bonding with each other, or do not form a substituted or unsubstituted saturated or unsaturated ring;

$R_{701}$ and $R_{702}$ that do not form the substituted or unsubstituted, saturated or unsaturated ring, and $R_{703}$ to $R_{709}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{901}$ to $R_{907}$ are as defined in the formulas (1).

One or more rings selected from the group consisting of the ring $A_{701}$ and the ring $A_{702}$ is bonded to *'s in the structure represented by the formula (72). That is, in one embodiment, the ring carbon atoms constituting the aromatic hydrocarbon ring or the ring atoms constituting the heterocycle of the ring $A_{701}$ are bonded to *'s in the structure represented by the formula (72). In one embodiment, the ring carbon atoms constituting the aromatic hydrocarbon ring or the ring atoms constituting the heterocycle of the ring $A_{702}$ are bonded to *'s in the structure represented by the formula (72).

In one embodiment, a group represented by the following formula (73) is bonded to one or both of the ring $A_{701}$ and the ring $A_{702}$:

(73)

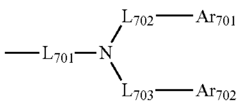

In the formula (73), $Ar_{701}$ and $Ar_{702}$ are independently a substituted or unsubstituted aryl group including 6 to 50 ring carbon atoms, or a substituted or unsubstituted monovalent heterocyclic group including 5 to 50 ring atoms; and $L_{701}$ to $L_{703}$ are independently a single bond, a substituted or unsubstituted arylene group including 6 to 30 ring carbon atoms, a substituted or unsubstituted divalent heterocyclic group including 5 to 30 ring atoms, or a divalent linking group formed by bonding 2 to 4 above mentioned groups.

In one embodiment, in addition to the ring $A_{701}$, the ring carbon atoms constituting the aromatic hydrocarbon ring or the ring atoms constituting the heterocycle of the ring $A_{702}$ are bonded to *'s in the structure represented by the formula (72). In this case, the structures represented by the formula (72) may be the same as or different from each other.

In one embodiment, $R_{701}$ and $R_{702}$ are independently a substituted or unsubstituted aryl group including 6 to 50 ring carbon atoms.

In one embodiment, $R_{701}$ and $R_{702}$ form a fluorene structure by bonding with each other.

In one embodiment, the ring $A_{701}$ and the ring $A_{702}$ are substituted or unsubstituted aromatic hydrocarbon rings including 6 to 50 ring carbon atoms, and they are substituted or unsubstituted benzene rings, for example.

In one embodiment, the ring $A_{703}$ is a substituted or unsubstituted aromatic hydrocarbon ring including 6 to 50 ring carbon atoms, and it is a substituted or unsubstituted benzene ring, for example.

In one embodiment, $X_{701}$ is O or S.

As specific examples of the compound represented by the formula (71), the following compounds can be given, for example. In the following specific examples, "Me" represents a methyl group.

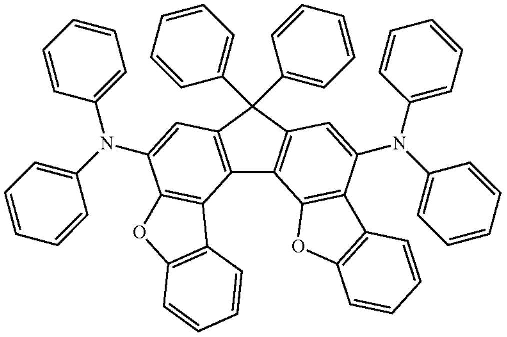

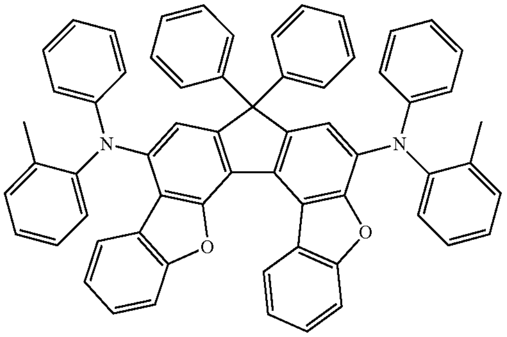

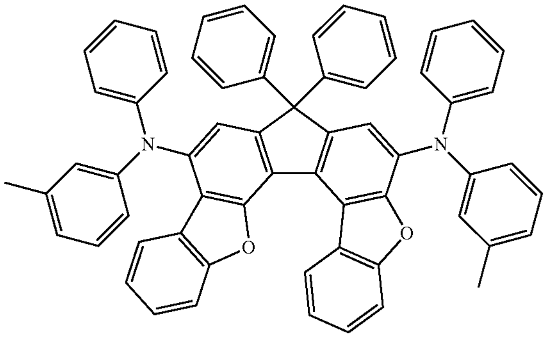

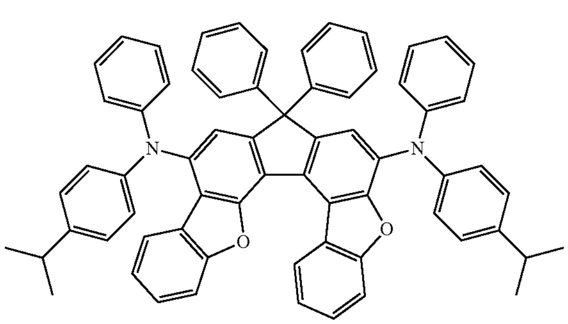

-continued
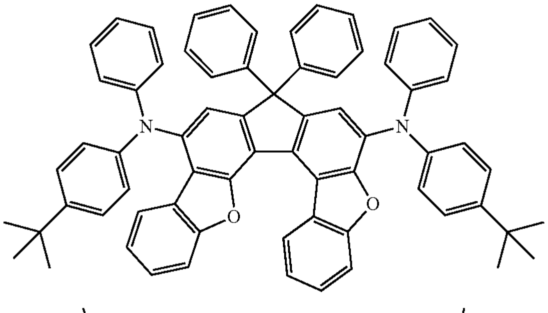
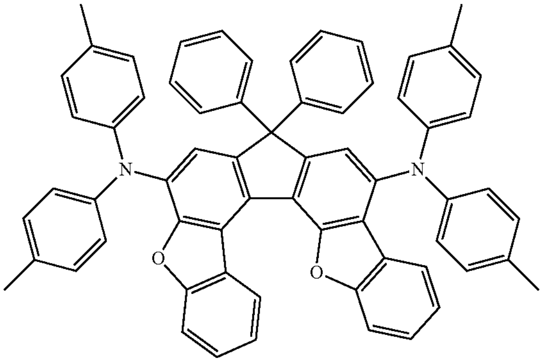
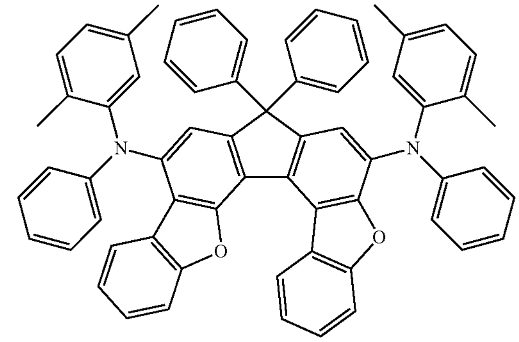
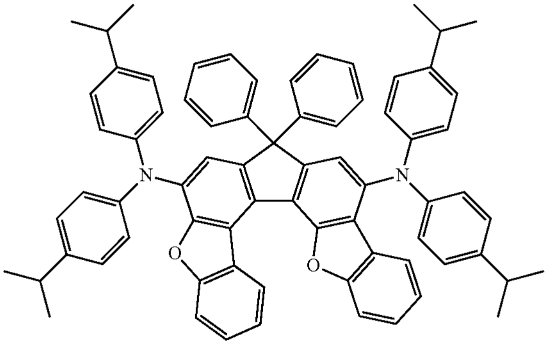
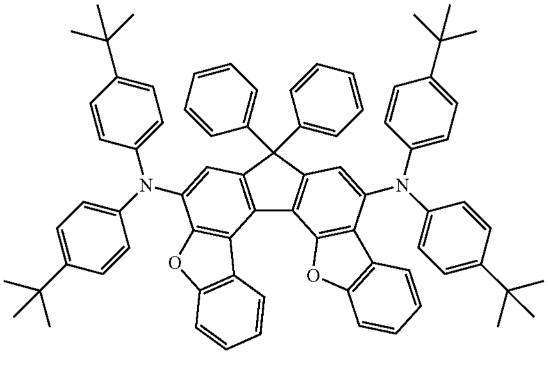
-continued
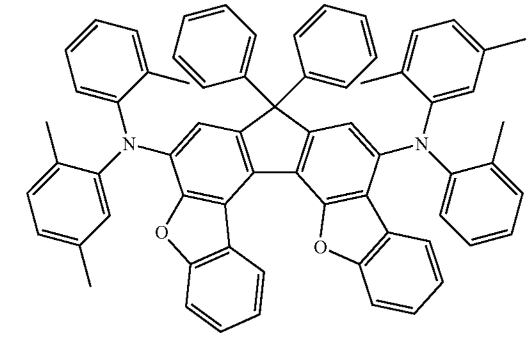
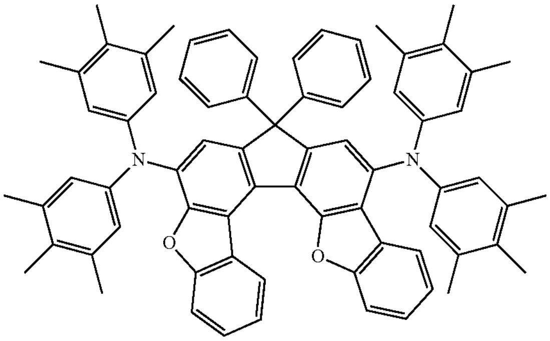
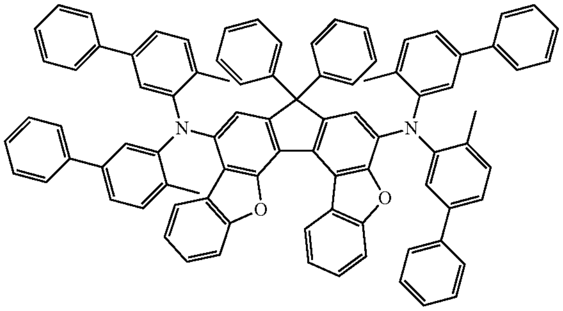
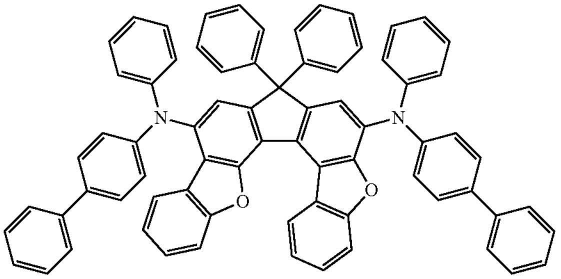
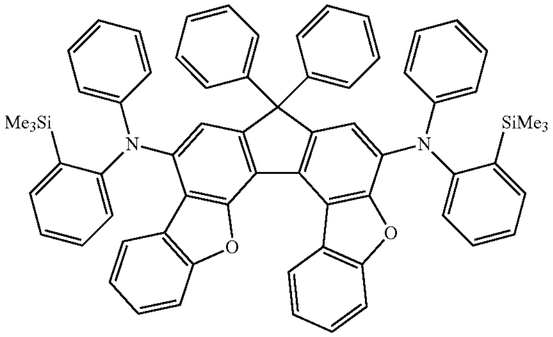

-continued
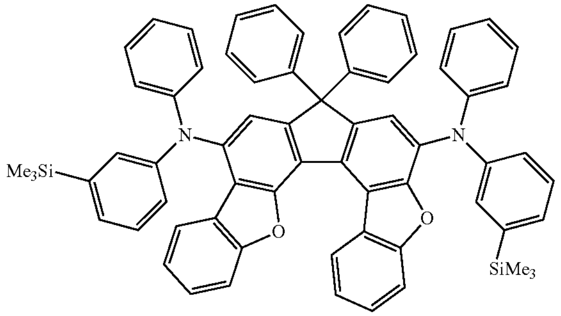
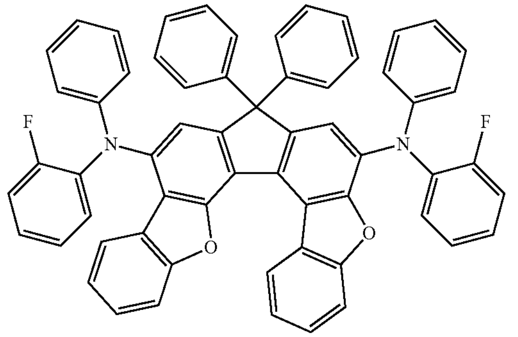
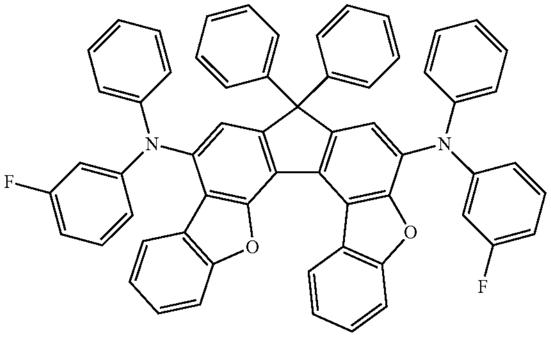
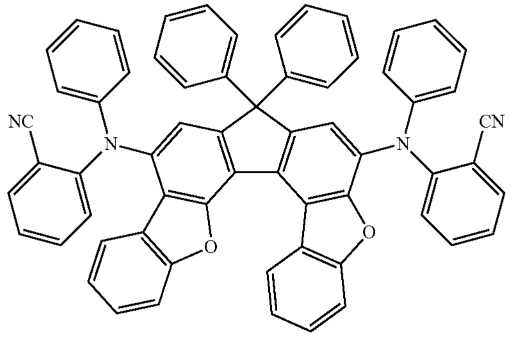
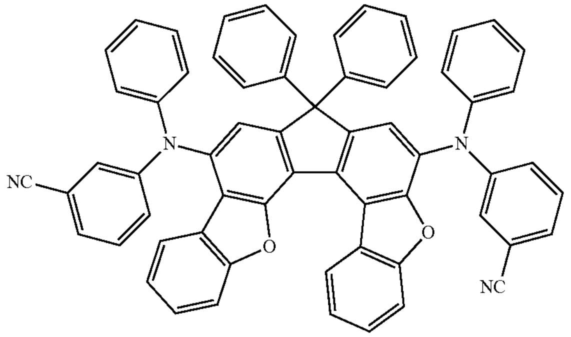
-continued
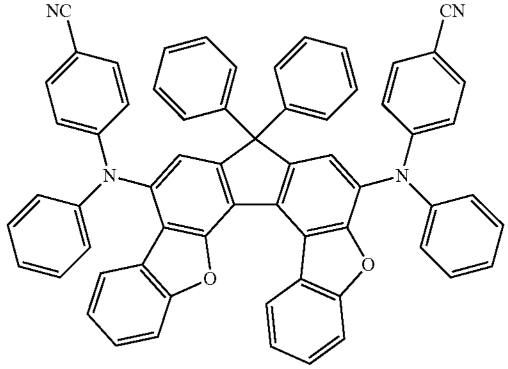
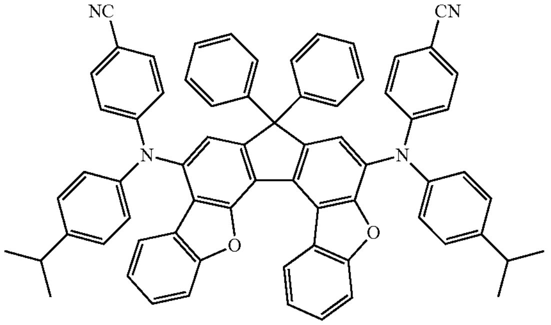
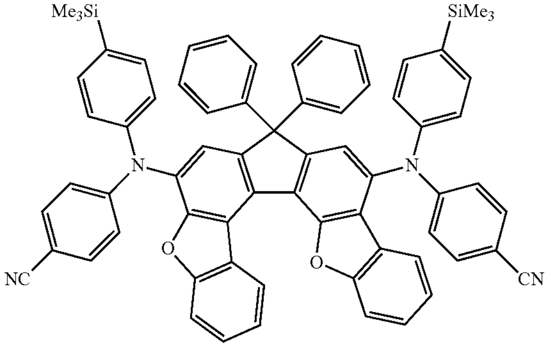
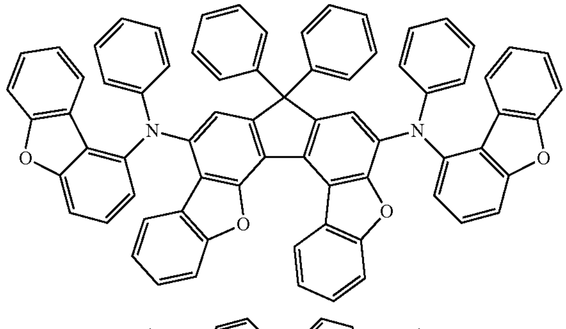
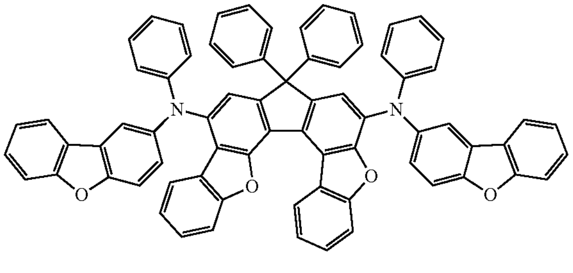

-continued
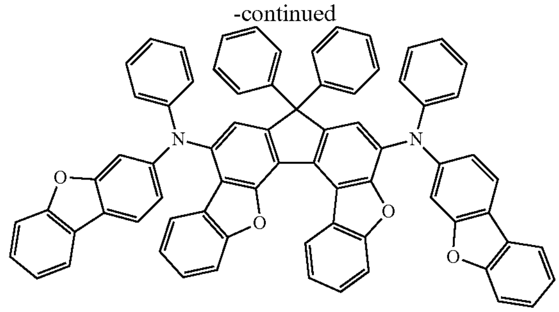
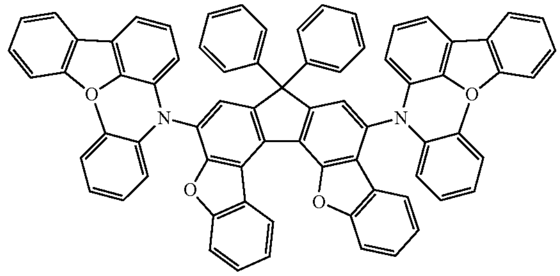
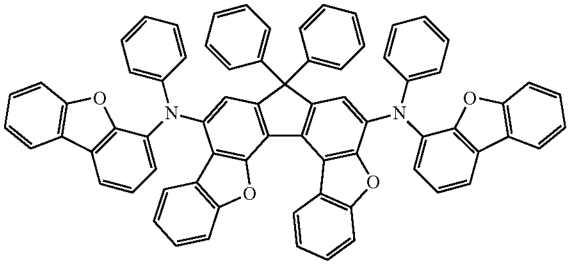
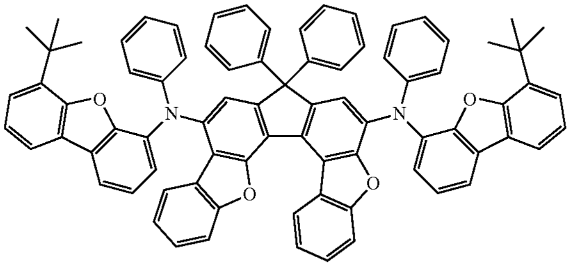
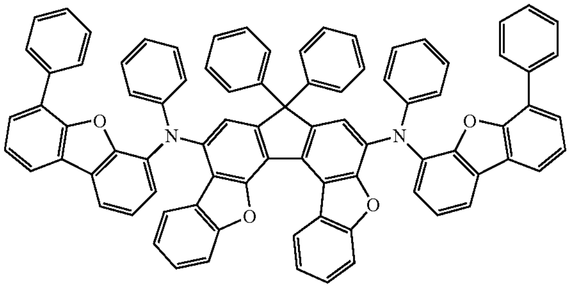
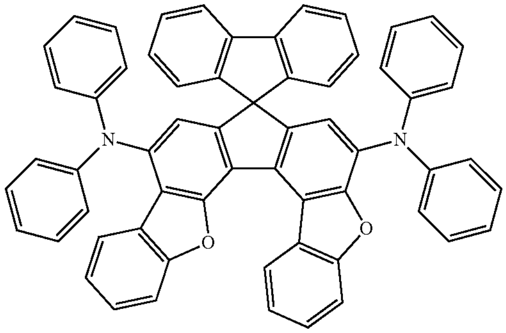
-continued
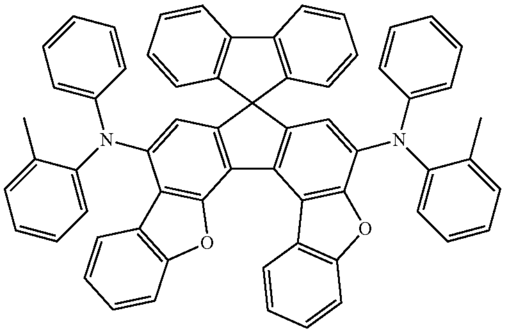
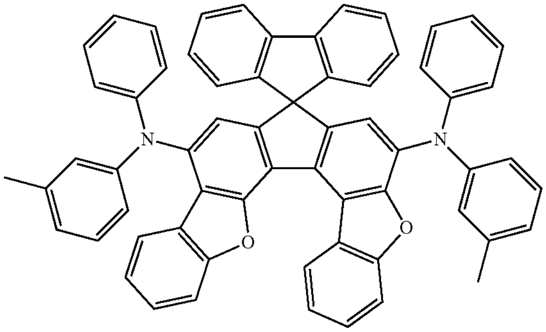
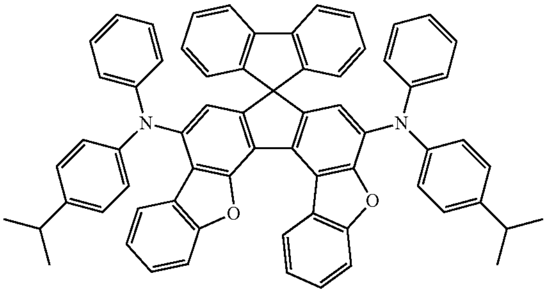
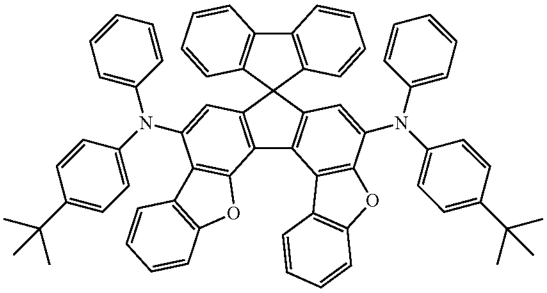
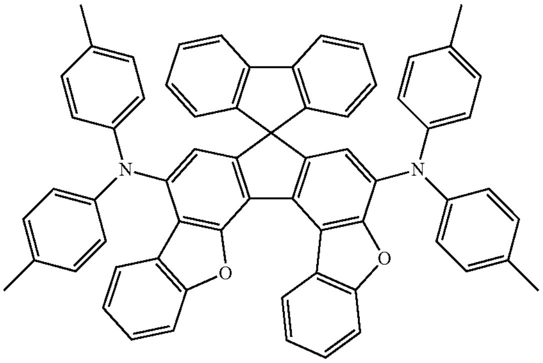

-continued
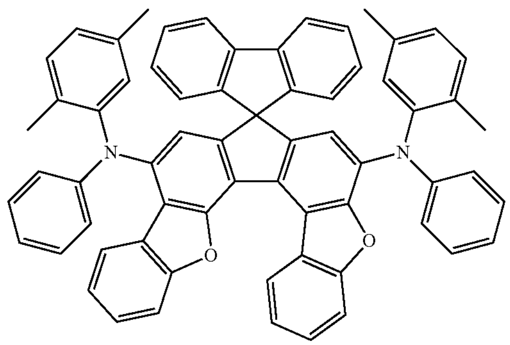
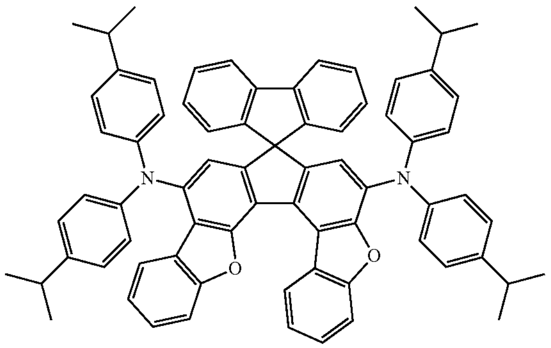
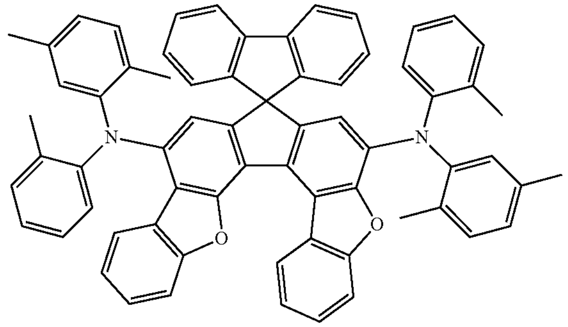
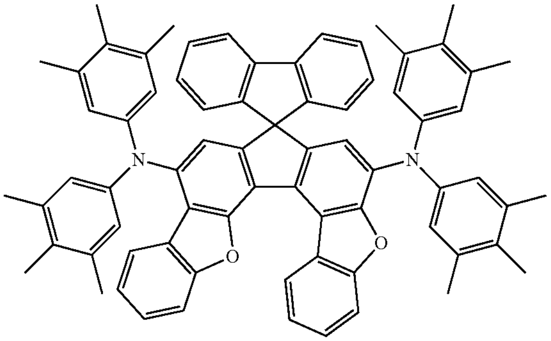
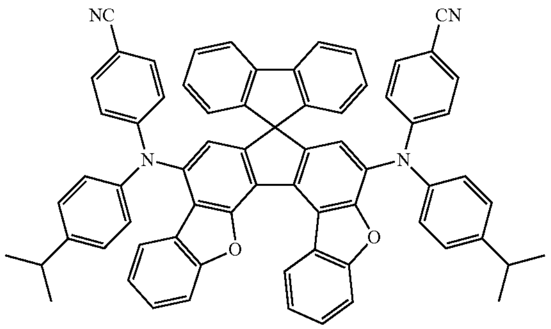
-continued
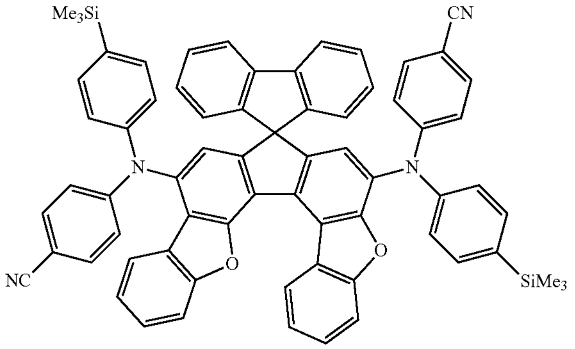
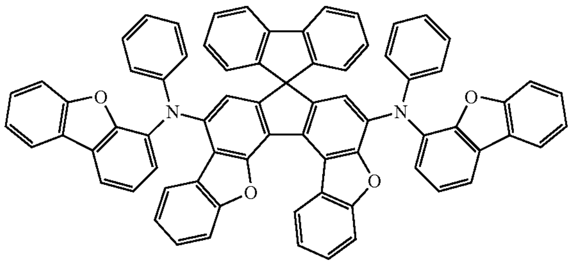
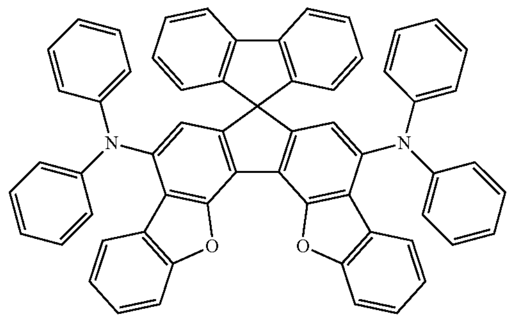
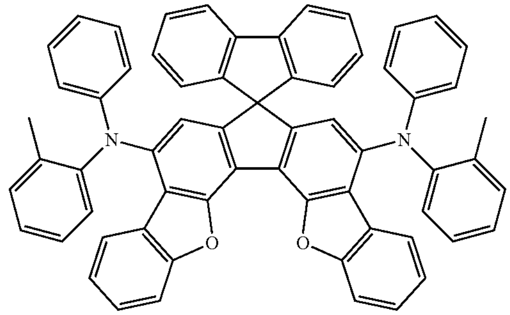
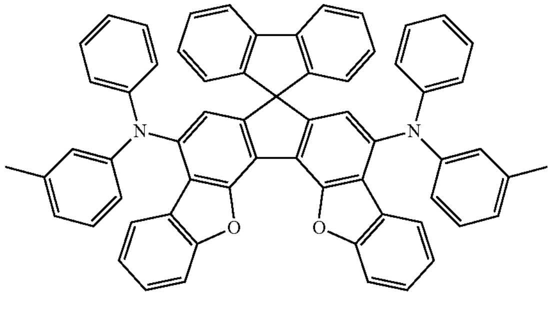

-continued

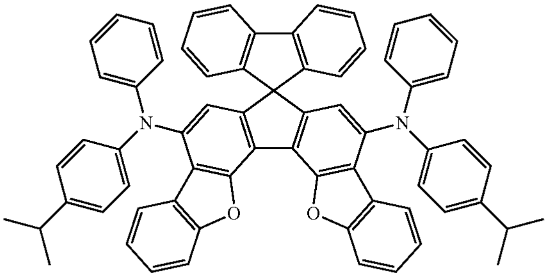

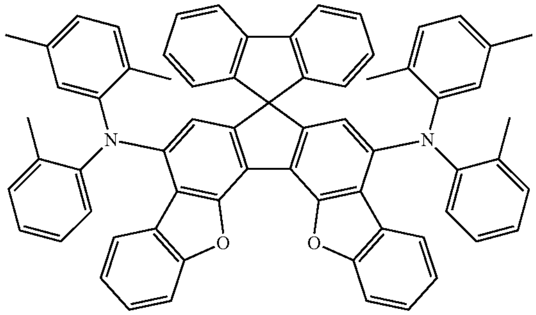

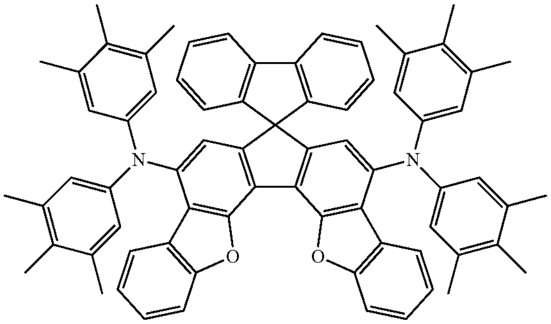

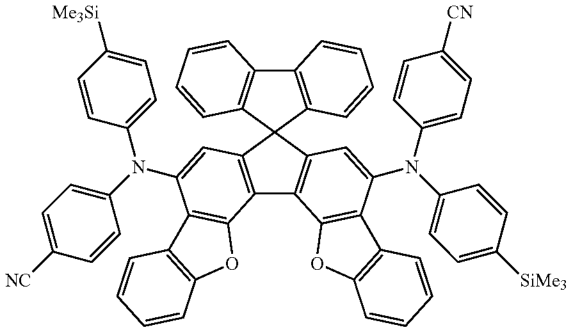

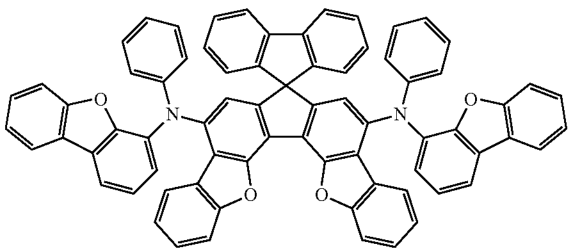

(Compound Represented by Formula (81))

The compound represented by the formula (81) is explained below.

(81)

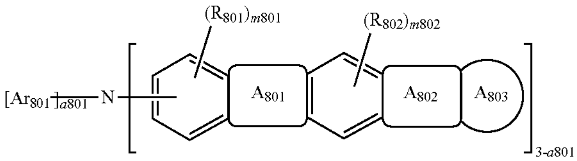

(82)

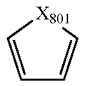

(83)

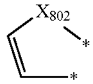

In the formula (81), a ring $A_{801}$ is a ring represented by the formula (82) which is fused to the adjacent rings at respective arbitrary positions;

a ring $A_{802}$ is a ring represented by the formula (83) which is fused to the adjacent rings at respective arbitrary positions;

two *'s bond to respective arbitrary positions of the ring $A_{803}$;

$X_{801}$ and $X_{802}$ are independently $C(R_{803})(R_{804})$, $Si(R_{805})(R_{806})$, an oxygen atom, or a sulfur atom;

a ring $A_{803}$ is a substituted or unsubstituted aromatic hydrocarbon ring including 6 to 50 ring carbon atoms, or a substituted or unsubstituted heterocycle including 5 to 50 ring atoms;

$Ar_{801}$ is a substituted or unsubstituted aryl group including 6 to 50 ring carbon atoms, or a substituted or unsubstituted monovalent heterocyclic group including 5 to 50 ring atoms;

$R_{801}$ to $R_{806}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $—Si(R_{901})(R_{902})(R_{903})$, $—O—(R_{904})$, $—S—(R_{905})$, $—N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{901}$ to $R_{907}$ are as defined in the formula (1);

m801 and m802 are independently an integer of 0 to 2; when m801 is 2, a plurality of $R_{801}$'s may be the same as or different from each other; when m802 is 2, a plurality of $R_{802}$'s may be the same as or different from each other;

a801 is an integer of 0 to 2; when a801 is 0 or 1, the structures in parentheses, which exist in number indicated by "3-a801 (3 subtract a801)" may be the same as or different from each other; and when a801 is 2, $Ar_{801}$ may be the same as or different from each other.

In one embodiment, $Ar_{801}$ is a substituted or unsubstituted aryl group including 6 to 50 ring carbon atoms.

In one embodiment, the ring $A_{803}$ is a substituted or unsubstituted aromatic hydrocarbon ring including 6 to 50 ring carbon atoms, and it is a substituted or unsubstituted benzene ring, a substituted or unsubstituted naphthalene ring, or a substituted or unsubstituted anthracene ring, for example.

In one embodiment, $R_{803}$ and $R_{804}$ are independently a substituted or unsubstituted alkyl group including 1 to 50 carbon atoms.

In one embodiment, a801 is 1.

As specific examples of the compound represented by the formula (81), the following compounds can be given, for example.

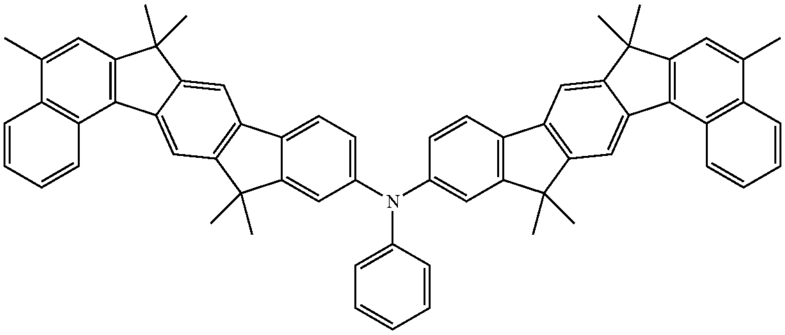

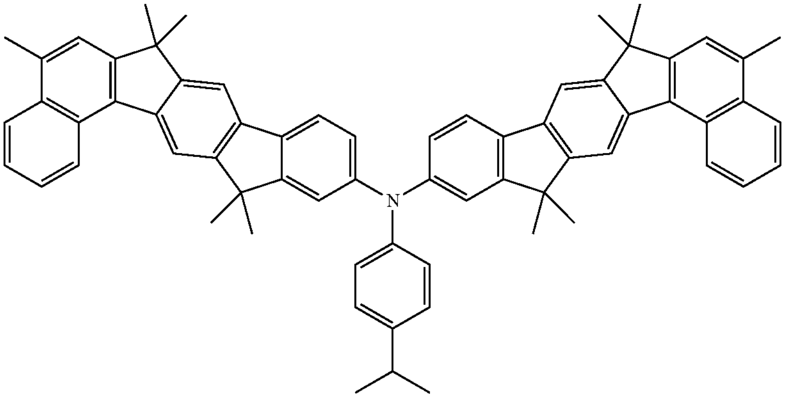

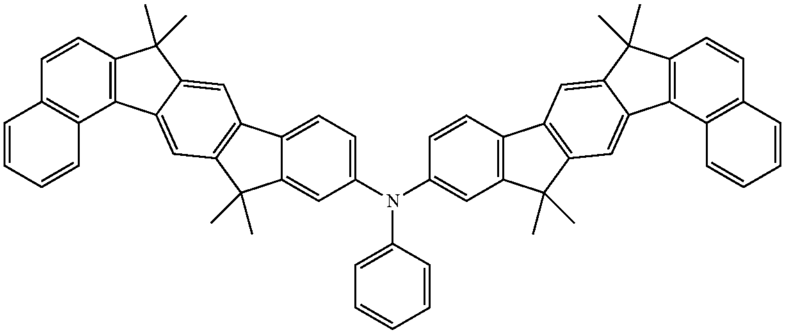

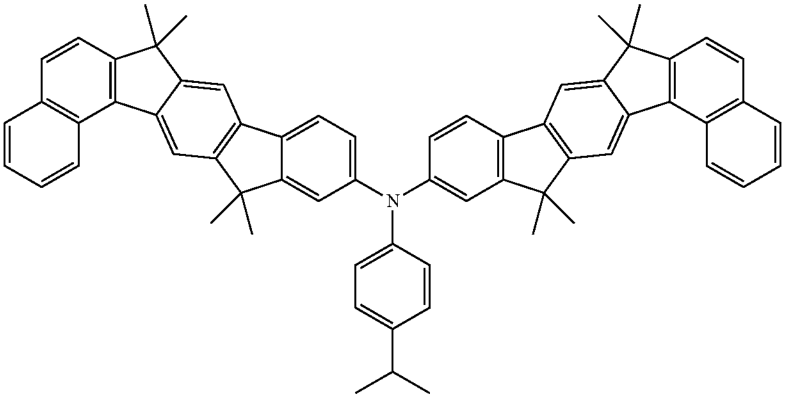

-continued

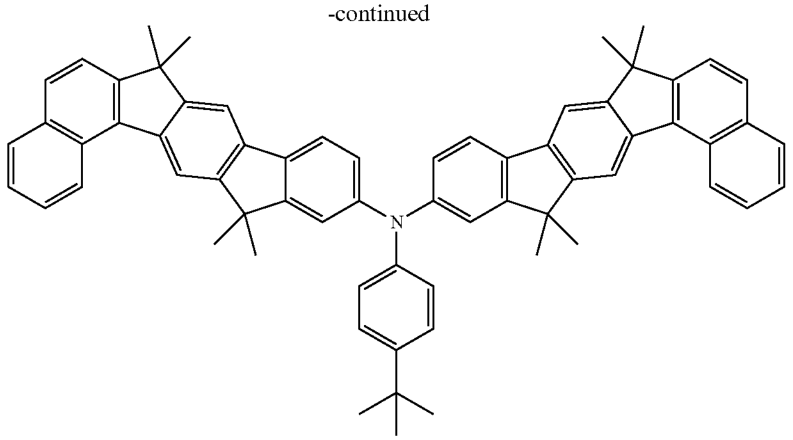

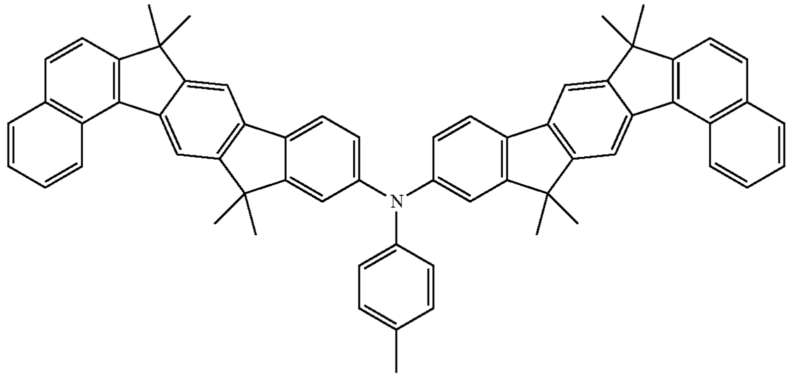

Specific examples of the above groups are as described in the section of [Definitions] of this specification.

As described above, known materials and device configurations may be applied to the organic EL device according to an aspect of the invention, as long as the device includes a cathode, an anode, and an emitting layer disposed between the cathode and the anode, and the emitting layer contains a first host material, a second host material, and a dopant material, and the effect of the invention is not impaired.

The content of the first host material and the second host material in the emitting layer is preferably 80% by mass or more and 99% by mass or less based on the total mass of the emitting layer.

The content ratio (mass ratio) of the first host material and the second host material in the emitting layer is usually 1:99 to 99:1, preferably 10:90 to 90:10, and more preferably 40:60 to 60:40.

The content of the dopant material in the emitting layer is preferably 1% by mass or more and 20% by mass or less based on the total mass of the emitting layer.

An embodiment of the organic EL device of the invention preferably includes a hole-transporting layer disposed between the anode and the emitting layer.

An embodiment of the organic EL device of the invention preferably includes an electron-transporting layer disposed between the cathode and the emitting layer.

Specific examples of typical device configurations of the organic EL device of the invention include (1) an anode/an emitting layer/a cathode, (2) an anode/a hole-injecting layer/an emitting layer/a cathode, (3) an anode/an emitting layer/an electron-injecting-transporting layer/a cathode, (4) an anode/a hole-injecting layer/an emitting layer/an electron-injecting-transporting layer/a cathode, (5) an anode/an organic semiconductor layer/an emitting layer/a cathode, (6) an anode/an organic semiconductor layer/an electron barrier layer/an emitting layer/a cathode, (7) an anode/an organic semiconductor layer/an emitting layer/an adhesion improving layer/a cathode, (8) an anode/a hole-injecting-transporting layer/an emitting layer/an electron-injecting-transporting layer/a cathode, (9) an anode/an insulating layer/an emitting layer/an insulating layer/a cathode,

(10) an anode/an inorganic semiconductor layer/an insulating layer/an emitting layer/an insulating layer/a cathode,

(11) an anode/an organic semiconductor layer/an insulating layer/an emitting layer/an insulating layer/a cathode,

(12) an anode/an insulating layer/a hole-injecting-transporting layer/an emitting layer/an insulating layer/a cathode, and

(13) an anode/an insulating layer/a hole-injecting-transporting layer/an emitting layer/an electron-injecting-transporting layer/a cathode.

and the like.

Among the above-described structures, the configuration of (8) is preferably used, but the device configuration of the organic EL device is not limited thereto.

The "hole-injecting-transporting layer" in this specification indicates "at least one of the hole-injecting layer and the hole-transporting layer," and the "electron-injecting-transporting layer" in this specification indicates "at least one of the electron-injecting layer and the electron-transporting layer."

Parts which can be used in the organic EL device according to an aspect of the invention, materials for forming respective layers, other than the above compounds, and the like, will be described below.

(Substrate)

A substrate is used as a support of an emitting device. As the substrate, glass, quartz, plastics or the like can be used, for example. Further, a flexible substrate may be used. The "flexible substrate" means a bendable (flexible) substrate, and specific examples thereof include a plastic substrate formed of polycarbonate, polyvinyl chloride, or the like.

(Anode)

For the anode formed on the substrate, metals, alloys, electrically conductive compounds, mixtures thereof, and the like, which have a large work function (specifically 4.0 eV or more) are preferably used. Specific examples thereof include indium oxide-tin oxide (ITO: Indium Tin Oxide), indium oxide-tin oxide containing silicon or silicon oxide, indium oxide-zinc oxide, tungsten oxide, indium oxide containing zinc oxide, graphene, and the like. In addition thereto, specific examples thereof include gold (Au), platinum (Pt), a nitride of a metallic material (for example, titanium nitride), and the like.

(Hole-Injecting Layer)

The hole-injecting layer is a layer containing a substance having a high hole-injecting property. As such a substance having a high hole-injecting property, molybdenum oxide, titanium oxide, vanadium oxide, rhenium oxide, ruthenium oxide, chromium oxide, zirconium oxide, hafnium oxide, tantalum oxide, silver oxide, tungsten oxide, manganese oxide, an aromatic amine compound, or a polymer compound (oligomers, dendrimers, polymers, etc.) can be given.

(Hole-Transporting Layer)

The hole-transporting layer is a layer containing a substance having a high hole-transporting property. For the hole-transporting layer, an aromatic amine compound, a carbazole derivative, an anthracene derivative, or the like can be used. A polymer compound such as poly(N-vinylcarbazole) (abbreviation: PVK) and poly(4-vinyltriphenylamine) (abbreviation: PVTPA) can also be used. However, a material other than the above-described materials may be used as long as the material has a transporting property of holes than that of electrons. It should be noted that the layer containing the material having a high hole-transporting property may be formed into not only a monolayer, but also a stacked layer in which two or more layers formed of the above-described materials are stacked.

(Guest (Dopant) Material of Emitting Layer)

The emitting layer is a layer containing a material having a high emitting property, and various materials can be used in addition to the materials used in the invention described above. For example, as the substance having a high emitting property, a fluorescent compound which emits fluorescence or a phosphorescent compound which emits phosphorescence can be used. The fluorescent compound is a compound which can emit from a singlet excited state, and the phosphorescent compound is a compound which can emit from a triplet excited state.

As a blue fluorescent emitting material which can be used for an emitting layer, pyrene derivatives, styrylamine derivatives, chrysene derivatives, fluoranthene derivatives, fluorene derivatives, diamine derivatives, triarylamine derivatives, and the like can be used. As a green fluorescent emitting material which can be used for an emitting layer, aromatic amine derivatives and the like can be used. As a red fluorescent emitting material which can be used for an emitting layer, tetracene derivatives, diamine derivatives and the like can be used.

As a blue phosphorescent emitting material which can be used for an emitting layer, metal complexes such as iridium complexes, osmium complexes, platinum complexes and the like are used. As a green phosphorescent emitting material which can be used for an emitting layer, iridium complexes and the like are used. As a red phosphorescent emitting material which can be used for an emitting layer, metal complexes such as iridium complexes, platinum complexes, terbium complexes, europium complexes and the like are used.

(Host Material for Emitting Layer)

The emitting layer may have a constitution that the above-mentioned substance having a high emitting property (guest material) is dispersed in another substance (host material). As substances for dispersing the substance having a high emitting property, a variety of substances can be used in addition to the materials used in the invention described above, and it is preferable to use a material having a lowest unoccupied orbital level (LUMO level) higher than the material having a high emitting property and a highest occupied orbital level (HOMO level) lower than the material having a high emitting property. As the material for dispersing a material having a high emitting property (host material), 1) a metal complex such as an aluminum complex, a beryllium complex, or a zinc complex, 2) a heterocyclic compound such as an oxadiazole derivative, a benzimidazole derivative, or a phenanthroline derivative, 3) a fused aromatic compound such as a carbazole derivative, an anthracene derivative, a phenanthrene derivative, a pyrene derivative, or a chrysene derivative, and 4) an aromatic amine compound such as a triarylamine derivative or a fused polycyclic aromatic amine derivative are used.

(Electron-Transporting Layer)

An electron-transporting layer is a layer which contains a substance having a high electron-transporting property. For the electron-transporting layer, 1) a metal complex such as an aluminum complex, a beryllium complex, of a zinc complex; 2) a heteroaromatic compound such as an imidazole derivative, a benzimidazole derivative, an azine derivative, a carbazole derivative, or a phenanthroline derivative; and 3) a polymer compound can be used.

(Electron-Injecting Layer)

An electron-injecting layer is a layer which contains a substance having a high electron-injecting property. For the electron-injection layer, lithium (Li), ytterbium (Yb), lithium fluoride (LiF), cesium fluoride (CsF), calcium fluoride ($CaF_2$), a metal complex compound such as 8-hydroxyquinolinolato-lithium (Liq), an alkali metal, an alkaline earth metal, or a compound thereof such as lithium oxide ($LiO_x$) can be used.

(Cathode)

For the cathode, metals, alloys, electrically conductive compounds, mixtures thereof, and the like which have a small work function (specifically, 3.8 eV or less) are preferably used. Specific examples of such a cathode material include elements belonging to Group 1 or Group 2 of the Periodic Table of the Elements, i.e., alkali metals such as lithium (Li) and cesium (Cs), and alkaline earth metals such as magnesium (Mg), calcium (Ca) and strontium (Sr), alloys containing these metals (e.g., MgAg and AlLi); rare earth metals such as europium (Eu) and ytterbium (Yb), and alloys containing these metals.

In the organic EL device according to an aspect of the invention, the methods for forming the respective layers are not particularly limited. A conventionally-known method for forming each layer by a vacuum deposition process, a spin coating process or the like can be used. Each layer such as the emitting layer can be formed by a known method such as a vacuum deposition process, a molecular beam deposition process (MBE process), or an application process such as a dipping process, a spin coating process, a casting process, a bar coating process or a roll coating process, which uses a solution prepared by dissolving the material in a solvent.

In one embodiment, a method of forming a single emitting layer by simultaneously depositing (co-depositing) the first host material, the second host material, and the dopant material from different deposition sources may be employed, or a method of premixing some of the materials (e.g., the first host material and the second host material) and co-depositing with other materials may be employed.

The former method has a problem that the fabrication process becomes complex, but since each material is formed in a layer without previously contacting with each other, there is little concern that device performance will be degraded due to interactions caused during premixing these materials.

The latter method has the advantage of simplifying the fabricating equipment and process, although there are problems such as the possibility of interaction caused between the materials due to premixing them, and the tendency for the material ratio to become unstable during deposition.

In the latter method, the composition according to an aspect of the invention described below may be used.

In the organic EL device according to an aspect of the invention, the thickness of each layer is not particularly limited, but is generally preferable that the thickness be in the range of several nm to 1 μm in order to suppress defects such as pinholes, to suppress applied voltages to be low, and to increase luminous efficiency.

[Composition]

The composition according to an aspect of the invention contains a compound represented by the formula (1) and a compound represented by the formula (2). The compound represented by the formula (1) contained in the composition is a compound different from the compound represented by the formula (2) contained in the composition. Details of each material are as described above.

The form of the composition according to an aspect of the invention is not particularly limited, and examples thereof include a solid, a powder, a solution, and a film. When the composition is in a solid form, the composition may be molded into a pellet shape.

Here, the "film" described above includes a film formed which a raw material containing the compound represented by the formula (1) and the compound represented by the formula (2) are contained. Examples of such a film include an emitting layer containing a first host material, a second host material, and a dopant material in an organic electroluminescence device according to an aspect of the invention.

Examples of the compound represented by the formula (1) and the compound represented by the formula (2) which are contained in the composition include the following compounds, for example, and a composition containing the following compounds in combination is preferred.

In one embodiment, in the formula (1), two or more $L_{1A}$'s are independently a single bond or an unsubstituted arylene group including 6 to 50 ring carbon atoms, and two or more $Ar_{1A}$'s are independently an unsubstituted aryl group including 6 to 50 ring carbon atoms.

In one embodiment, in the formula (1), one or more of $R_{1A}$ to $R_{8A}$ are independently a deuterium atom.

In one embodiment, in the formula (1), $R_{1A}$ to $R_{8A}$ are deuterium atoms.

In one embodiment, the compound represented by the formula (2) is a compound represented by any of the following formula (2-11), formula (2-12), or formula (2-13):

(2-11)

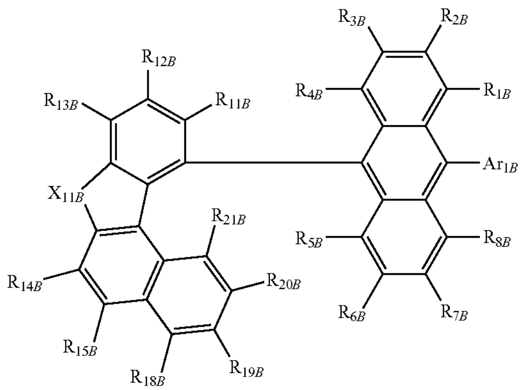

(2-12)

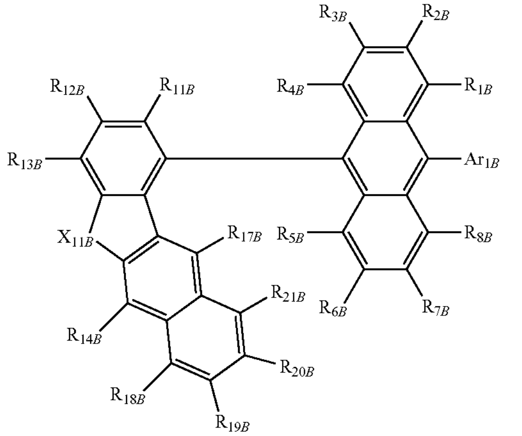

(2-13)

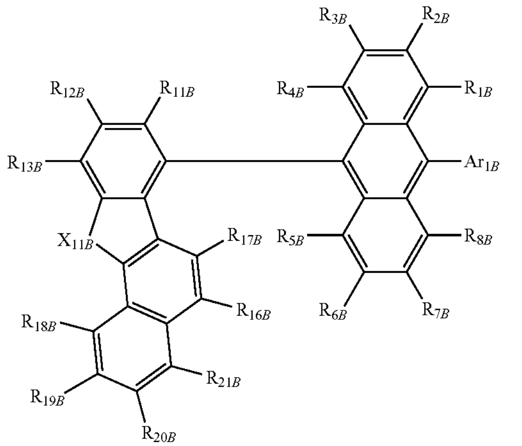

In the formulas (2-11), (2-12), and (2-13), $R_{1B}$ to $R_{8B}$, $R_{11B}$ to $R_{13B}$, $X_{11B}$, and $Ar_{1B}$ are as defined in the formula (2);

$R_{14B}$ to $R_{21B}$ are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
$—Si(R_{901})(R_{902})(R_{903})$,
$—O—(R_{904})$,
$—S—(R_{905})$,
$—N(R_{906})(R_{907})$,
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms; and $R_{901}$ to $R_{907}$ are as defined in the formula (1).

In one embodiment, in the formula (2), $X_{11B}$ is an oxygen atom.

In one embodiment, the compound represented by the formula (2) is a compound represented by any of the following formula (2-21), formula (2-22), or formula (2-23):

(2-21)

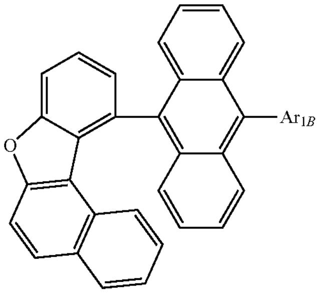

(2-22)

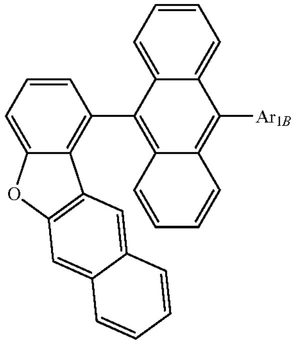

(2-23)

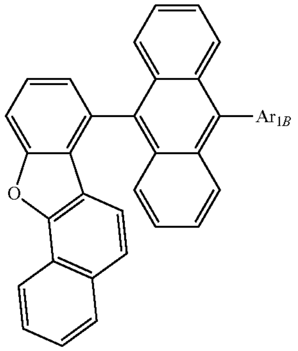

In the formulas (2-21), (2-22), and (2-23), $Ar_{1B}$ is as defined in the formula (2).

In one embodiment, in the formula (2), $Ar_{1B}$ is an unsubstituted aryl group including 6 to 50 ring carbon atoms, and the aryl group has one or more deuterium atoms.

In one embodiment, in the formula (2), $Ar_{1B}$ has a $—C_6D_5$ group.

Hereinafter, preferred combinations of a compound represented by the formula (1) and a compound represented by the formula (2) which are contained in the composition according to an aspect of the invention will be described. The combinations of the compounds described herein are combinations which are also preferred as the combinations of a first host material (a compound represented by the formula (1)) and the second host material (a compound represented by the formula (2)) used in the organic electroluminescence device according to an aspect of the invention.

In one embodiment, the composition contains:
- as the compound represented by the formula (1), one or more compounds represented by the formula (1-1); and
- as the compound represented by the formula (2), one or more compounds selected from the group consisting of a compound represented by the formula (2-1), a compound represented by the formula (2-2), and a compound represented by the formula (2-3).

In one embodiment, the composition contains:
- as the compound represented by the formula (1), one or more compounds represented by the formula (1-1); and
- as the compound represented by the formula (2), one or more compounds selected from the group consisting of a compound represented by the formula (2-11), a compound represented by the formula (2-12), and a compound represented by the formula (2-13).

In one embodiment, the composition contains:
- as the compound represented by the formula (1), one or more compounds represented by the formula (1-1); and
- as the compound represented by the formula (2), one or more compounds selected from the group consisting of a compound represented by the formula (2-21), a compound represented by the formula (2-22), and a compound represented by the formula (2-23).

In one embodiment, the composition contains:
- as the compound represented by the formula (1), one or more compounds selected from the group consisting of a compound represented by the formula (1-11), a compound represented by the formula (1-12), and a compound represented by the formula (1-13); and
- as the compound represented by the formula (2), one or more compounds selected from the group consisting of a compound represented by the formula (2-1), a compound represented by the formula (2-2), and a compound represented by the formula (2-3).

In one embodiment, the composition contains:
- as the compound represented by the formula (1), one or more compounds selected from the group consisting of a compound represented by the formula (1-11), a compound represented by the formula (1-12), and a compound represented by the formula (1-13); and
- as the compound represented by the formula (2), one or more compounds selected from the group consisting of a compound represented by the formula (2-11), a compound represented by the formula (2-12), and a compound represented by the formula (2-13).

In one embodiment, the composition contains:
- as the compound represented by the formula (1), one or more compounds selected from the group consisting of a compound represented by the formula (1-11), a compound represented by the formula (1-12), and a compound represented by the formula (1-13); and as the compound represented by the formula (2), one or more compounds selected from the group consisting of a compound represented by the formula (2-21), a compound represented by the formula (2-22), and a compound represented by the formula (2-23).

In one embodiment, the composition contains:

as the compound represented by the formula (1), one or more compounds represented by the formula (1-2); and as the compound represented by the formula (2), one or more compounds selected from the group consisting of a compound represented by the formula (2-1), a compound represented by the formula (2-2), and a compound represented by the formula (2-3).

In one embodiment, the composition contains:

as the compound represented by the formula (1), one or more compounds represented by the formula (1-2); and as the compound represented by the formula (2), one or more compounds selected from the group consisting of a compound represented by the formula (2-11), a compound represented by the formula (2-12), and a compound represented by the formula (2-13).

In one embodiment, the composition contains:

as the compound represented by the formula (1), one or more compounds represented by the formula (1-2); and as the compound represented by the formula (2), one or more compounds selected from the group consisting of a compound represented by the formula (2-21), a compound represented by the formula (2-22), and a compound represented by the formula (2-23).

In one embodiment, the composition contains:

as the compound represented by the formula (1), one or more compounds selected from the group consisting of a compound represented by the formula (1-21), a compound represented by the formula (1-22), and a compound represented by the formula (1-23); and as the compound represented by the formula (2), one or more compounds selected from the group consisting of a compound represented by the formula (2-1), a compound represented by the formula (2-2), and a compound represented by the formula (2-3).

In one embodiment, the composition contains:

as the compound represented by the formula (1), one or more compounds selected from the group consisting of a compound represented by the formula (1-21), a compound represented by the formula (1-22), and a compound represented by the formula (1-23); and as the compound represented by the formula (2), one or more compounds selected from the group consisting of a compound represented by the formula (2-11), a compound represented by the formula (2-12), and a compound represented by the formula (2-13).

In one embodiment, the composition contains:

as the compound represented by the formula (1), one or more compounds selected from the group consisting of a compound represented by the formula (1-21), a compound represented by the formula (1-22), and a compound represented by the formula (1-23); and as the compound represented by the formula (2), one or more compounds selected from the group consisting of a compound represented by the formula (2-21), a compound represented by the formula (2-22), and a compound represented by the formula (2-23).

In one embodiment, the composition contains:

as the compound represented by the formula (1), one or more compounds represented by the formula (1-1), wherein $Ar_{1A}$'s are independently selected from the group consisting of groups represented by each of the following formulas (a1) to (a4); and as the compound represented by the formula (2), one or more compounds selected from the group consisting of a compound represented by the formula (2-1), a compound represented by the formula (2-2), and a compound represented by the formula (2-3).

(a1)

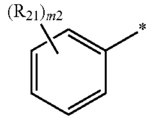

(a2)

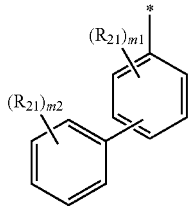

(a3)

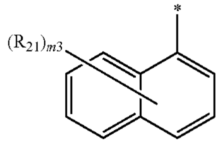

(a4)

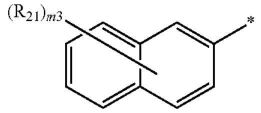

In the formulas (a1) to (a4), * is a single bond which bonds with $L_{1A}$;

$R_{21}$ is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{901}$ to $R_{907}$ are as defined in the formula (1);

m1 is an integer of 0 to 4;

m2 is an integer of 0 to 5;

m3 is an integer of 0 to 7;

when each of m1 to m3 is 2 or more, a plurality of $R_{21}$'s may be the same as or different from each other; and when each of m1 to m3 is 2 or more, a plurality of adjacent $R_{21}$'s form a substituted or unsubstituted, saturated or unsaturated ring by bonding with each other, or do not form a substituted or unsubstituted, saturated or unsaturated ring.

In one embodiment, the composition contains:

as the compound represented by the formula (1), one or more compounds represented by the formula (1-1), and $Ar_{1A}$'s are independently selected from the group consisting of groups represented by each of the formulas (a1) to (a4); and as the compound represented by the formula (2), one or more compounds selected from the group consisting of a compound represented by the formula (2-11), a compound represented by the formula (2-12), and a compound represented by the formula (2-13).

In one embodiment, the composition contains:

as the compound represented by the formula (1), one or more compounds represented by the formula (1-1), wherein $Ar_{1A}$'s are independently selected from the group consisting of groups represented by each of the formulas (a1) to (a4); and as the compound represented by the formula (2), one or more compounds selected from the group consisting of a compound represented by the formula (2-21), a compound represented by the formula (2-22), and a compound represented by the formula (2-23).

In one embodiment, the composition contains:

as the compound represented by the formula (1), one or more compounds selected from the group consisting of a compound represented by the formula (1-11), a compound represented by the formula (1-12), and a compound represented by the formula (1-13), and $Ar_{1A}$'s are independently selected from the group consisting of groups represented by each of the formulas (a1) to (a4); and as the compound represented by the formula (2), one or more compounds selected from the group consisting of a compound represented by the formula (2-1), a compound represented by the formula (2-2), and a compound represented by the formula (2-3).

In one embodiment, the composition contains:

as the compound represented by the formula (1), one or more compounds selected from the group consisting of a compound represented by the formula (1-11), a compound represented by the formula (1-12), and a compound represented by the formula (1-13), and $Ar_{1A}$'s are independently selected from the group consisting of groups represented by each of the formulas (a1) to (a4); and as the compound represented by the formula (2), one or more compounds selected from the group consisting of a compound represented by the formula (2-11), a compound represented by the formula (2-12), and a compound represented by the formula (2-13).

In one embodiment, the composition contains:

as the compound represented by the formula (1), one or more compounds selected from the group consisting of a compound represented by the formula (1-11), a compound represented by the formula (1-12), and a compound represented by the formula (1-13), and $Ar_{1A}$'s are independently selected from the group consisting of groups represented by each of the formulas (a1) to (a4); and as the compound represented by the formula (2), one or more compounds selected from the group consisting of a compound represented by the formula (2-21), a compound represented by the formula (2-22), and a compound represented by the formula (2-23).

In one embodiment, the composition contains:

as the compound represented by the formula (1), one or more compounds represented by the formula (1-2), and $Ar_{1A}$'s are independently selected from the group consisting of groups represented by each of the formulas (a1) to (a4); and as the compound represented by the formula (2), one or more compounds selected from the group consisting of a compound represented by the formula (2-1), a compound represented by the formula (2-2), and a compound represented by the formula (2-3).

In one embodiment, the composition contains:

as the compound represented by the formula (1), one or more compounds represented by the formula (1-2), and $Ar_{1A}$'s are independently selected from the group consisting of groups represented by each of the formulas (a1) to (a4); and as the compound represented by the formula (2), one or more compounds selected from the group consisting of a compound represented by the formula (2-11), a compound represented by the formula (2-12), and a compound represented by the formula (2-13).

In one embodiment, the composition contains:

as the compound represented by the formula (1), one or more compounds represented by the formula (1-2), and $Ar_{1A}$'s are independently selected from the group consisting of groups represented by each of the formulas (a1) to (a4); and as the compound represented by the formula (2), one or more compounds selected from the group consisting of a compound represented by the formula (2-21), a compound represented by the formula (2-22), and a compound represented by the formula (2-23).

In one embodiment, the composition contains:

as the compound represented by the formula (1), one or more compounds selected from the group consisting of a compound represented by the formula (1-21), a compound represented by the formula (1-22), and a compound represented by the formula (1-23), and $Ar_{1A}$'s are independently selected from the group consisting of groups represented by each of the formulas (a1) to (a4); and as the compound represented by the formula (2), one or more compounds selected from the group consisting of a compound represented by the formula (2-1), a compound represented by the formula (2-2), and a compound represented by the formula (2-3).

In one embodiment, the composition contains:

as the compound represented by the formula (1), one or more compounds selected from the group consisting of a compound represented by the formula (1-21), a compound represented by the formula (1-22), and a compound represented by the formula (1-23), and $Ar_{1A}$'s are independently selected from the group consisting of groups represented by each of the formulas (a1) to (a4); and as the compound represented by the formula (2), one or more compounds selected from the group consisting of a compound represented by the formula (2-11), a compound represented by the formula (2-12), and a compound represented by the formula (2-13).

In one embodiment, the composition contains:

as the compound represented by the formula (1), one or more compounds selected from the group consisting of a compound represented by the formula (1-21), a compound represented by the formula (1-22), and a compound represented by the formula (1-23), and $Ar_{1A}$'s are independently selected from the group consisting of groups represented by each of the formulas (a1) to (a4); and as the compound represented by the formula (2), one or more compounds selected from the group consisting of a compound represented by the formula (2-21), a compound represented by the formula (2-22), and a compound represented by the formula (2-23).

In one embodiment, the composition contains:

as the compound represented by the formula (1), one or more compounds represented by the formula (1-1); and as the compound represented by the formula (2), one or more compounds selected from the group consisting of a compound represented by the formula (2-1), a compound represented by the formula (2-2), and a compound represented by the formula (2-3), and $Ar_{1B}$ is selected from the group consisting of groups represented by each of the following formulas (a1) to (a4).

(a1)

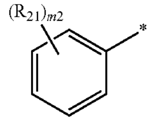

(a2)

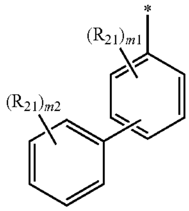

(a3)

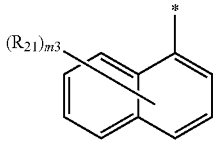

(a4)

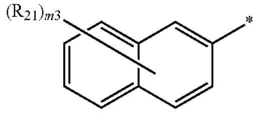

In the formulas (a1) to (a4), * is a single bond which bonds with $L_{1B}$;

$R_{21}$ is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{901}$ to $R_{907}$ are as defined in the formula (1);

m1 is an integer of 0 to 4;

m2 is an integer of 0 to 5;

m3 is an integer of 0 to 7;

when each of m1 to m3 is 2 or more, a plurality of $R_{21}$'s may be the same as or different from each other; and when each of m1 to m3 is 2 or more, a plurality of adjacent $R_{21}$'s form a substituted or unsubstituted, saturated or unsaturated ring by bonding with each other, or do not form a substituted or unsubstituted, saturated or unsaturated ring.

In one embodiment, the composition contains:

as the compound represented by the formula (1), one or more compounds represented by the formula (1-1); and as the compound represented by the formula (2), one or more compounds selected from the group consisting of a compound represented by the formula (2-11), a compound represented by the formula (2-12), and a compound represented by the formula (2-13), and $Ar_{1B}$ is selected from the group consisting of groups represented by each of the formulas (a1) to (a4).

In one embodiment, the composition contains:

as the compound represented by the formula (1), one or more compounds represented by the formula (1-1); and as the compound represented by the formula (2), one or more compounds selected from the group consisting of a compound represented by the formula (2-21), a compound represented by the formula (2-22), and a compound represented by the formula (2-23), and $Ar_{1B}$ is selected from the group consisting of groups represented by each of the formulas (a1) to (a4).

In one embodiment, the composition contains:

as the compound represented by the formula (1), one or more compounds selected from the group consisting of a compound represented by the formula (1-11), a compound represented by the formula (1-12), and a compound represented by the formula (1-13); and as the compound represented by the formula (2), one or more compounds selected from the group consisting of a compound represented by the formula (2-1), a compound represented by the formula (2-2), and a compound represented by the formula (2-3), and $Ar_{1B}$ is selected from the group consisting of groups represented by each of the formulas (a1) to (a4).

In one embodiment, the composition contains:

as the compound represented by the formula (1), one or more compounds selected from the group consisting of a compound represented by the formula (1-11), a compound represented by the formula (1-12), and a compound represented by the formula (1-13); and as the compound represented by the formula (2), one or more compounds selected from the group consisting of a compound represented by the formula (2-11), a compound represented by the formula (2-12), and a compound represented by the formula (2-13), and $Ar_{1B}$ is selected from the group consisting of groups represented by each of the formulas (a1) to (a4).

In one embodiment, the composition contains:

as the compound represented by the formula (1), one or more compounds selected from the group consisting of a compound represented by the formula (1-11), a compound represented by the formula (1-12), and a compound represented by the formula (1-13); and as the compound represented by the formula (2), one or more compounds selected from the group consisting of a compound represented by the formula (2-21), a compound represented by the formula (2-22), and a compound represented by the formula (2-23), and $Ar_{1B}$ is selected from the group consisting of groups represented by each of the formulas (a1) to (a4).

In one embodiment, the composition contains:

as the compound represented by the formula (1), one or more compounds represented by the formula (1-2); and as the compound represented by the formula (2), one or more compounds selected from the group consisting of a compound represented by the formula (2-1), a compound represented by the formula (2-2), and a compound represented by the formula (2-3), and $Ar_{1B}$ is selected from the group consisting of groups represented by each of the formulas (a1) to (a4).

In one embodiment, the composition contains:

as the compound represented by the formula (1), one or more compounds represented by the formula (1-2); and as the compound represented by the formula (2), one or more compounds selected from the group consisting of a compound represented by the formula (2-11), a compound represented by the formula (2-12), and a compound represented by the formula (2-13), and $Ar_{1B}$ is selected from the group consisting of groups represented by each of the formulas (a1) to (a4).

In one embodiment, the composition contains:

as the compound represented by the formula (1), one or more compounds represented by the formula (1-2); and as the compound represented by the formula (2), one or more compounds selected from the group consisting of a compound represented by the formula (2-21), a compound represented by the formula (2-22), and a compound represented by the formula (2-23), and $Ar_{1B}$ is selected from the group consisting of groups represented by each of the formulas (a1) to (a4).

In one embodiment, the composition contains:

as the compound represented by the formula (1), one or more compounds selected from the group consisting of a compound represented by the formula (1-21), a compound represented by the formula (1-22), and a compound represented by the formula (1-23); and as the compound represented by the formula (2), one or more compounds selected from the group consisting of a compound represented by the formula (2-1), a compound represented by the formula (2-2), and a compound represented by the formula (2-3), and $Ar_{1B}$ is selected from the group consisting of groups represented by each of the formulas (a1) to (a4).

In one embodiment, the composition contains:

as the compound represented by the formula (1), one or more compounds selected from the group consisting of a compound represented by the formula (1-21), a compound represented by the formula (1-22), and a compound represented by the formula (1-23); and as the compound represented by the formula (2), one or more compounds selected from the group consisting of a compound represented by the formula (2-11), a compound represented by the formula (2-12), and a compound represented by the formula (2-13), and $Ar_{1B}$ is selected from the group consisting of groups represented by each of the formulas (a1) to (a4).

In one embodiment, the composition contains:

as the compound represented by the formula (1), one or more compounds selected from the group consisting of a compound represented by the formula (1-21), a compound represented by the formula (1-22), and a compound represented by the formula (1-23); and as the compound represented by the formula (2), one or more compounds selected from the group consisting of a compound represented by the formula (2-21), a compound represented by the formula (2-22), and a compound represented by the formula (2-23), and $Ar_{1B}$ is selected from the group consisting of groups represented by each of the formulas (a1) to (a4).

In one embodiment, the composition contains:

as the compound represented by the formula (1), one or more compounds represented by the formula (1-1), wherein $Ar_{1A}$'s are independently selected from the group consisting of groups represented by each of the formulas (a1) to (a4); and as the compound represented by the formula (2), one or more compounds selected from the group consisting of a compound represented by the formula (2-1), a compound represented by the formula (2-2), and a compound represented by the formula (2-3), and $Ar_{1B}$ is selected from the group consisting of groups represented by each of the formulas (a1) to (a4).

In one embodiment, the composition contains:

as the compound represented by the formula (1), one or more compounds represented by the formula (1-1), wherein $Ar_{1A}$'s are independently selected from the group consisting of groups represented by each of the formulas (a1) to (a4); and as the compound represented by the formula (2), one or more compounds selected from the group consisting of a compound represented by the formula (2-11), a compound represented by the formula (2-12), and a compound represented by the formula (2-13), and $Ar_{1B}$ is selected from the group consisting of groups represented by each of the formulas (a1) to (a4).

In one embodiment, the composition contains:

as the compound represented by the formula (1), one or more compounds represented by the formula (1-1), wherein $Ar_{1A}$'s are independently selected from the group consisting of groups represented by each of the formulas (a1) to (a4); and as the compound represented by the formula (2), one or more compounds selected from the group consisting of a compound represented by the formula (2-21), a compound represented by the formula (2-22), and a compound represented by the formula (2-23), and $Ar_{1B}$ is selected from the group consisting of groups represented by each of the formulas (a1) to (a4).

In one embodiment, the composition contains:

as the compound represented by the formula (1), one or more compounds selected from the group consisting of a compound represented by the formula (1-11), a compound represented by the formula (1-12), and a compound represented by the formula (1-13), and $Ar_{1A}$'s are independently selected from the group consisting of groups represented by each of the formulas (a1) to (a4); and as the compound represented by the formula (2), one or more compounds selected from the group consisting of a compound represented by the formula (2-1), a compound represented by the formula (2-2), and a compound represented by the formula (2-3), and $Ar_{1B}$ is selected from the group consisting of groups represented by each of the formulas (a1) to (a4).

In one embodiment, the composition contains:

as the compound represented by the formula (1), one or more compounds selected from the group consisting of a compound represented by the formula (1-11), a compound represented by the formula (1-12), and a compound represented by the formula (1-13), and $Ar_{1A}$'s are independently selected from the group consisting of groups represented by each of the formulas (a1) to (a4); and as the compound represented by the formula (2), one or more compounds selected from the group consisting of a compound represented by the formula (2-11), a compound represented by the formula (2-12), and a compound represented by the formula (2-13), and $Ar_{1B}$ is selected from the group consisting of groups represented by each of the formulas (a1) to (a4).

In one embodiment, the composition contains:

as the compound represented by the formula (1), one or more compounds selected from the group consisting of a compound represented by the formula (1-11), a compound represented by the formula (1-12), and a compound represented by the formula (1-13), and $Ar_{1A}$'s are independently selected from the group consisting of groups represented by each of the formulas (a1) to (a4); and as the compound represented by the formula (2), one or more compounds selected from the group consisting of a compound represented by the formula (2-21), a compound represented by the formula (2-22), and a compound represented by the formula (2-23), and $Ar_{1B}$ is selected from the group consisting of groups represented by each of the formulas (a1) to (a4).

In one embodiment, the composition contains:

as the compound represented by the formula (1), one or more compounds represented by the formula (1-2), wherein $Ar_{1A}$'s are independently selected from the group consisting of groups represented by each of the formulas (a1) to (a4); and as the compound represented by the formula (2), one or more compounds selected from the group consisting of a compound represented by the formula (2-1), a compound represented by the formula (2-2), and a compound represented by the formula (2-3), and $Ar_{1B}$ is selected from the group consisting of groups represented by each of the formulas (a1) to (a4).

In one embodiment, the composition contains:

as the compound represented by the formula (1), one or more compounds represented by the formula (1-2), wherein $Ar_{1A}$'s are independently selected from the group consisting of groups represented by each of the formulas (a1) to (a4); and as the compound represented by the formula (2), one or more compounds selected from the group consisting of a compound represented by the formula (2-11), a compound represented by the formula (2-12), and a compound represented by the formula (2-13), and $Ar_{1B}$ is selected from the group consisting of groups represented by each of the formulas (a1) to (a4).

In one embodiment, the composition contains:

as the compound represented by the formula (1), one or more compounds represented by the formula (1-2), wherein $Ar_{1A}$'s are independently selected from the group consisting of groups represented by each of the formulas (a1) to (a4); and as the compound represented by the formula (2), one or more compounds selected from the group consisting of a compound represented by the formula (2-21), a compound represented by the formula (2-22), and a compound represented by the formula (2-23), and $Ar_{1B}$ is selected from the group consisting of groups represented by each of the formulas (a1) to (a4).

In one embodiment, the composition contains:

as the compound represented by the formula (1), one or more compounds selected from the group consisting of a compound represented by the formula (1-21), a compound represented by the formula (1-22), and a compound represented by the formula (1-23), and $Ar_{1A}$'s are independently selected from the group consisting of groups represented by each of the formulas (a1) to (a4); and as the compound represented by the formula (2), one or more compounds selected from the group consisting of a compound represented by the formula (2-1), a compound represented by the formula (2-2), and a compound represented by the formula (2-3), and $Ar_{1B}$ is selected from the group consisting of groups represented by each of the formulas (a1) to (a4).

In one embodiment, the composition contains:

as the compound represented by the formula (1), one or more compounds selected from the group consisting of a compound represented by the formula (1-21), a compound represented by the formula (1-22), and a compound represented by the formula (1-23), and $Ar_{1A}$'s are independently selected from the group consisting of groups represented by each of the formulas (a1) to (a4); and as the compound represented by the formula (2), one or more compounds selected from the group consisting of a compound represented by the formula (2-11), a compound represented by the formula (2-12), and a compound represented by the formula (2-13), and $Ar_{1B}$ is selected from the group consisting of groups represented by each of the formulas (a1) to (a4).

In one embodiment, the composition contains:

as the compound represented by the formula (1), one or more compounds selected from the group consisting of a compound represented by the formula (1-21), a compound represented by the formula (1-22), and a compound represented by the formula (1-23), and $Ar_{1A}$'s are independently selected from the group consisting of groups represented by each of the formulas (a1) to (a4); and as the compound represented by the formula (2), one or more compounds selected from the group consisting of a compound represented by the formula (2-21), a compound represented by the formula (2-22), and a compound represented by the formula (2-23), and $Ar_{1B}$ is selected from the group consisting of groups represented by each of the formulas (a1) to (a4).

In one embodiment, the composition includes combinations of the compound represented by the formula (1) and the compound represented by the formula (2) described in the following tables. In the following tables, 1-1 to 1-216 indicate the compound numbers of specific example compounds represented by the formula (1), and 2-1 to 2-475 indicate the compound numbers of specific example compounds represented by the formula (2). Combinations of a specific example compound of the formula (1) and a specific example compound of the formula (2) are each shown by the number of 1 to 102,600 in the following tables.

TABLE 1

| | | Compound represented by the formula (1) | | | | | | | | | | | | | | | | | | | | | | | | |
|---|---|---|---|---|---|---|---|---|---|---|---|---|---|---|---|---|---|---|---|---|---|---|---|---|---|---|
| | | 1-1 | 1-2 | 1-3 | 1-4 | 1-5 | 1-6 | 1-7 | 1-8 | 1-9 | 1-10 | 1-11 | 1-12 | 1-13 | 1-14 | 1-15 | 1-16 | 1-17 | 1-18 | 1-19 | 1-20 | 1-21 | 1-22 | 1-23 | 1-24 | 1-25 |
| Compound represented by the formula (2) | 2-1 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 |
| | 2-2 | 26 | 27 | 28 | 29 | 30 | 31 | 32 | 33 | 34 | 35 | 36 | 37 | 38 | 39 | 40 | 41 | 42 | 43 | 44 | 45 | 46 | 47 | 48 | 49 | 50 |
| | 2-3 | 51 | 52 | 53 | 54 | 55 | 56 | 57 | 58 | 59 | 60 | 61 | 62 | 63 | 64 | 65 | 66 | 67 | 68 | 69 | 70 | 71 | 72 | 73 | 74 | 75 |
| | 2-4 | 76 | 77 | 78 | 79 | 80 | 81 | 82 | 83 | 84 | 85 | 86 | 87 | 88 | 89 | 90 | 91 | 92 | 93 | 94 | 95 | 96 | 97 | 98 | 99 | 100 |
| | 2-5 | 101 | 102 | 103 | 104 | 105 | 106 | 107 | 108 | 109 | 110 | 111 | 112 | 113 | 114 | 115 | 116 | 117 | 118 | 119 | 120 | 121 | 122 | 123 | 124 | 125 |
| | 2-6 | 126 | 127 | 128 | 129 | 130 | 131 | 132 | 133 | 134 | 135 | 136 | 137 | 138 | 139 | 140 | 141 | 142 | 143 | 144 | 145 | 146 | 147 | 148 | 149 | 150 |
| | 2-7 | 151 | 152 | 153 | 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| | 2-8 | 176 | 177 | 178 | 179 | 180 | 181 | 182 | 183 | 184 | 185 | 186 | 187 | 188 | 189 | 190 | 191 | 192 | 193 | 194 | 195 | 196 | 197 | 198 | 199 | 200 |
| | 2-9 | 201 | 202 | 203 | 204 | 205 | 206 | 207 | 208 | 209 | 210 | 211 | 212 | 213 | 214 | 215 | 216 | 217 | 218 | 219 | 220 | 221 | 222 | 223 | 224 | 225 |
| | 2-10 | 226 | 227 | 228 | 229 | 230 | 231 | 232 | 233 | 234 | 235 | 236 | 237 | 238 | 239 | 240 | 241 | 242 | 243 | 244 | 245 | 246 | 247 | 248 | 249 | 250 |
| | 2-11 | 251 | 252 | 253 | 254 | 255 | 256 | 257 | 258 | 259 | 260 | 261 | 262 | 263 | 264 | 265 | 266 | 267 | 268 | 269 | 270 | 271 | 272 | 273 | 274 | 275 |
| | 2-12 | 276 | 277 | 278 | 279 | 280 | 281 | 282 | 283 | 284 | 285 | 286 | 287 | 288 | 289 | 290 | 291 | 292 | 293 | 294 | 295 | 296 | 297 | 298 | 299 | 300 |
| | 2-13 | 301 | 302 | 303 | 304 | 305 | 306 | 307 | 308 | 309 | 310 | 311 | 312 | 313 | 314 | 315 | 316 | 317 | 318 | 319 | 320 | 321 | 322 | 323 | 324 | 325 |
| | 2-14 | 326 | 327 | 328 | 329 | 330 | 331 | 332 | 333 | 334 | 335 | 336 | 337 | 338 | 339 | 340 | 341 | 342 | 343 | 344 | 345 | 346 | 347 | 348 | 349 | 350 |
| | 2-15 | 351 | 352 | 353 | 354 | 355 | 356 | 357 | 358 | 359 | 360 | 361 | 362 | 363 | 364 | 365 | 366 | 367 | 368 | 369 | 370 | 371 | 372 | 373 | 374 | 375 |
| | 2-16 | 376 | 377 | 378 | 379 | 380 | 381 | 382 | 383 | 384 | 385 | 386 | 387 | 388 | 389 | 390 | 391 | 392 | 393 | 394 | 395 | 396 | 397 | 398 | 399 | 400 |
| | 2-17 | 401 | 402 | 403 | 404 | 405 | 406 | 407 | 408 | 409 | 410 | 411 | 412 | 413 | 414 | 415 | 416 | 417 | 418 | 419 | 420 | 421 | 422 | 423 | 424 | 425 |
| | 2-18 | 426 | 427 | 428 | 429 | 430 | 431 | 432 | 433 | 434 | 435 | 436 | 437 | 438 | 439 | 440 | 441 | 442 | 443 | 444 | 445 | 446 | 447 | 448 | 449 | 450 |
| | 2-19 | 451 | 452 | 453 | 454 | 455 | 456 | 457 | 458 | 459 | 460 | 461 | 462 | 463 | 464 | 465 | 466 | 467 | 468 | 469 | 470 | 471 | 472 | 473 | 474 | 475 |
| | 2-20 | 476 | 477 | 478 | 479 | 480 | 481 | 482 | 483 | 484 | 485 | 486 | 487 | 488 | 489 | 490 | 491 | 492 | 493 | 494 | 495 | 496 | 497 | 498 | 499 | 500 |
| | 2-21 | 501 | 502 | 503 | 504 | 505 | 506 | 507 | 508 | 509 | 510 | 511 | 512 | 513 | 514 | 515 | 516 | 517 | 518 | 519 | 520 | 521 | 522 | 523 | 524 | 525 |
| | 2-22 | 526 | 527 | 528 | 529 | 530 | 531 | 532 | 533 | 534 | 535 | 536 | 537 | 538 | 539 | 540 | 541 | 542 | 543 | 544 | 545 | 546 | 547 | 548 | 549 | 550 |
| | 2-23 | 551 | 552 | 553 | 554 | 555 | 556 | 557 | 558 | 559 | 560 | 561 | 562 | 563 | 564 | 565 | 566 | 567 | 568 | 569 | 570 | 571 | 572 | 573 | 574 | 575 |
| | 2-24 | 576 | 577 | 578 | 579 | 580 | 581 | 582 | 583 | 584 | 585 | 586 | 587 | 588 | 589 | 590 | 591 | 592 | 593 | 594 | 595 | 596 | 597 | 598 | 599 | 600 |
| | 2-25 | 601 | 602 | 603 | 604 | 605 | 606 | 607 | 608 | 609 | 610 | 611 | 612 | 613 | 614 | 615 | 616 | 617 | 618 | 619 | 620 | 621 | 622 | 623 | 624 | 625 |
| | 2-26 | 626 | 627 | 628 | 629 | 630 | 631 | 632 | 633 | 634 | 635 | 636 | 637 | 638 | 639 | 640 | 641 | 642 | 643 | 644 | 645 | 646 | 647 | 648 | 649 | 650 |
| | 2-27 | 651 | 652 | 653 | 654 | 655 | 656 | 657 | 658 | 659 | 660 | 661 | 662 | 663 | 664 | 665 | 666 | 667 | 668 | 669 | 670 | 671 | 672 | 673 | 674 | 675 |
| | 2-28 | 676 | 677 | 678 | 679 | 680 | 681 | 682 | 683 | 684 | 685 | 686 | 687 | 688 | 689 | 690 | 691 | 692 | 693 | 694 | 695 | 696 | 697 | 698 | 699 | 700 |
| | 2-29 | 701 | 702 | 703 | 704 | 705 | 706 | 707 | 708 | 709 | 710 | 711 | 712 | 713 | 714 | 715 | 716 | 717 | 718 | 719 | 720 | 721 | 722 | 723 | 724 | 725 |
| | 2-30 | 726 | 727 | 728 | 729 | 730 | 731 | 732 | 733 | 734 | 735 | 736 | 737 | 738 | 739 | 740 | 741 | 742 | 743 | 744 | 745 | 746 | 747 | 748 | 749 | 750 |
| | 2-31 | 751 | 752 | 753 | 754 | 755 | 756 | 757 | 758 | 759 | 760 | 761 | 762 | 763 | 764 | 765 | 766 | 767 | 768 | 769 | 770 | 771 | 772 | 773 | 774 | 775 |
| | 2-32 | 776 | 777 | 778 | 779 | 780 | 781 | 782 | 783 | 784 | 785 | 786 | 787 | 788 | 789 | 790 | 791 | 792 | 793 | 794 | 795 | 796 | 797 | 798 | 799 | 800 |
| | 2-33 | 801 | 802 | 803 | 804 | 805 | 806 | 807 | 808 | 809 | 810 | 811 | 812 | 813 | 814 | 815 | 816 | 817 | 818 | 819 | 820 | 821 | 822 | 823 | 824 | 825 |
| | 2-34 | 826 | 827 | 828 | 829 | 830 | 831 | 832 | 833 | 834 | 835 | 836 | 837 | 838 | 839 | 840 | 841 | 842 | 843 | 844 | 845 | 846 | 847 | 848 | 849 | 850 |
| | 2-35 | 851 | 852 | 853 | 854 | 855 | 856 | 857 | 858 | 859 | 860 | 861 | 862 | 863 | 864 | 865 | 866 | 867 | 868 | 869 | 870 | 871 | 872 | 873 | 874 | 875 |
| | 2-36 | 876 | 877 | 878 | 879 | 880 | 881 | 882 | 883 | 884 | 885 | 886 | 887 | 888 | 889 | 890 | 891 | 892 | 893 | 894 | 895 | 896 | 897 | 898 | 899 | 900 |
| | 2-37 | 901 | 902 | 903 | 904 | 905 | 906 | 907 | 908 | 909 | 910 | 911 | 912 | 913 | 914 | 915 | 916 | 917 | 918 | 919 | 920 | 921 | 922 | 923 | 924 | 925 |
| | 2-38 | 926 | 927 | 928 | 929 | 930 | 931 | 932 | 933 | 934 | 935 | 936 | 937 | 938 | 939 | 940 | 941 | 942 | 943 | 944 | 945 | 946 | 947 | 948 | 949 | 950 |
| | 2-39 | 951 | 952 | 953 | 954 | 955 | 956 | 957 | 958 | 959 | 960 | 961 | 962 | 963 | 964 | 965 | 966 | 967 | 968 | 969 | 970 | 971 | 972 | 973 | 974 | 975 |
| | 2-40 | 976 | 977 | 978 | 979 | 980 | 981 | 982 | 983 | 984 | 985 | 986 | 987 | 988 | 989 | 990 | 991 | 992 | 993 | 994 | 995 | 996 | 997 | 998 | 999 | 1,000 |
| | 2-41 | 1,001 | 1,002 | 1,003 | 1,004 | 1,005 | 1,006 | 1,007 | 1,008 | 1,009 | 1,010 | 1,011 | 1,012 | 1,013 | 1,014 | 1,015 | 1,016 | 1,017 | 1,018 | 1,019 | 1,020 | 1,021 | 1,022 | 1,023 | 1,024 | 1,025 |
| | 2-42 | 1,026 | 1,027 | 1,028 | 1,029 | 1,030 | 1,031 | 1,032 | 1,033 | 1,034 | 1,035 | 1,036 | 1,037 | 1,038 | 1,039 | 1,040 | 1,041 | 1,042 | 1,043 | 1,044 | 1,045 | 1,046 | 1,047 | 1,048 | 1,049 | 1,050 |
| | 2-43 | 1,051 | 1,052 | 1,053 | 1,054 | 1,055 | 1,056 | 1,057 | 1,058 | 1,059 | 1,060 | 1,061 | 1,062 | 1,063 | 1,064 | 1,065 | 1,066 | 1,067 | 1,068 | 1,069 | 1,070 | 1,071 | 1,072 | 1,073 | 1,074 | 1,075 |
| | 2-44 | 1,076 | 1,077 | 1,078 | 1,079 | 1,080 | 1,081 | 1,082 | 1,083 | 1,084 | 1,085 | 1,086 | 1,087 | 1,088 | 1,089 | 1,090 | 1,091 | 1,092 | 1,093 | 1,094 | 1,095 | 1,096 | 1,097 | 1,098 | 1,099 | 1,100 |
| | 2-45 | 1,101 | 1,102 | 1,103 | 1,104 | 1,105 | 1,106 | 1,107 | 1,108 | 1,109 | 1,110 | 1,111 | 1,112 | 1,113 | 1,114 | 1,115 | 1,116 | 1,117 | 1,118 | 1,119 | 1,120 | 1,121 | 1,122 | 1,123 | 1,124 | 1,125 |
| | 2-46 | 1,126 | 1,127 | 1,128 | 1,129 | 1,130 | 1,131 | 1,132 | 1,133 | 1,134 | 1,135 | 1,136 | 1,137 | 1,138 | 1,139 | 1,140 | 1,141 | 1,142 | 1,143 | 1,144 | 1,145 | 1,146 | 1,147 | 1,148 | 1,149 | 1,150 |
| | 2-47 | 1,151 | 1,152 | 1,153 | 1,154 | 1,155 | 1,156 | 1,157 | 1,158 | 1,159 | 1,160 | 1,161 | 1,162 | 1,163 | 1,164 | 1,165 | 1,166 | 1,167 | 1,168 | 1,169 | 1,170 | 1,171 | 1,172 | 1,173 | 1,174 | 1,175 |

TABLE 1-continued

| | Compound represented by the formula (1) | | | | | | | | | | | | | | | | | | | | | | | | |
|---|---|---|---|---|---|---|---|---|---|---|---|---|---|---|---|---|---|---|---|---|---|---|---|---|---|
| | 1-1 | 1-2 | 1-3 | 1-4 | 1-5 | 1-6 | 1-7 | 1-8 | 1-9 | 1-10 | 1-11 | 1-12 | 1-13 | 1-14 | 1-15 | 1-16 | 1-17 | 1-18 | 1-19 | 1-20 | 1-21 | 1-22 | 1-23 | 1-24 | 1-25 |
| 2-48 | 1,176 | 1,177 | 1,178 | 1,179 | 1,180 | 1,181 | 1,182 | 1,183 | 1,184 | 1,185 | 1,186 | 1,187 | 1,188 | 1,189 | 1,190 | 1,191 | 1,192 | 1,193 | 1,194 | 1,195 | 1,196 | 1,197 | 1,198 | 1,199 | 1,200 |
| 2-49 | 1,201 | 1,202 | 1,203 | 1,204 | 1,205 | 1,206 | 1,207 | 1,208 | 1,209 | 1,210 | 1,211 | 1,212 | 1,213 | 1,214 | 1,215 | 1,216 | 1,217 | 1,218 | 1,219 | 1,220 | 1,221 | 1,222 | 1,223 | 1,224 | 1,225 |
| 2-50 | 1,226 | 1,227 | 1,228 | 1,229 | 1,230 | 1,231 | 1,232 | 1,233 | 1,234 | 1,235 | 1,236 | 1,237 | 1,238 | 1,239 | 1,240 | 1,241 | 1,242 | 1,243 | 1,244 | 1,245 | 1,246 | 1,247 | 1,248 | 1,249 | 1,250 |
| 2-51 | 1,251 | 1,252 | 1,253 | 1,254 | 1,255 | 1,256 | 1,257 | 1,258 | 1,259 | 1,260 | 1,261 | 1,262 | 1,263 | 1,264 | 1,265 | 1,266 | 1,267 | 1,268 | 1,269 | 1,270 | 1,271 | 1,272 | 1,273 | 1,274 | 1,275 |
| 2-52 | 1,276 | 1,277 | 1,278 | 1,279 | 1,280 | 1,281 | 1,282 | 1,283 | 1,284 | 1,285 | 1,286 | 1,287 | 1,288 | 1,289 | 1,290 | 1,291 | 1,292 | 1,293 | 1,294 | 1,295 | 1,296 | 1,297 | 1,298 | 1,299 | 1,300 |
| 2-53 | 1,301 | 1,302 | 1,303 | 1,304 | 1,305 | 1,306 | 1,307 | 1,308 | 1,309 | 1,310 | 1,311 | 1,312 | 1,313 | 1,314 | 1,315 | 1,316 | 1,317 | 1,318 | 1,319 | 1,320 | 1,321 | 1,322 | 1,323 | 1,324 | 1,325 |
| 2-54 | 1,326 | 1,327 | 1,328 | 1,329 | 1,330 | 1,331 | 1,332 | 1,333 | 1,334 | 1,335 | 1,336 | 1,337 | 1,338 | 1,339 | 1,340 | 1,341 | 1,342 | 1,343 | 1,344 | 1,345 | 1,346 | 1,347 | 1,348 | 1,349 | 1,350 |
| 2-55 | 1,351 | 1,352 | 1,353 | 1,354 | 1,355 | 1,356 | 1,357 | 1,358 | 1,359 | 1,360 | 1,361 | 1,362 | 1,363 | 1,364 | 1,365 | 1,366 | 1,367 | 1,368 | 1,369 | 1,370 | 1,371 | 1,372 | 1,373 | 1,374 | 1,375 |

TABLE 2

| Compound represented by the formula (2) | Compound represented by the formula (1) | | | | | | | | | | | | | | | | | | | | | | | | |
|---|---|---|---|---|---|---|---|---|---|---|---|---|---|---|---|---|---|---|---|---|---|---|---|---|---|
| | 1-1 | 1-2 | 1-3 | 1-4 | 1-5 | 1-6 | 1-7 | 1-8 | 1-9 | 1-10 | 1-11 | 1-12 | 1-13 | 1-14 | 1-15 | 1-16 | 1-17 | 1-18 | 1-19 | 1-20 | 1-21 | 1-22 | 1-23 | 1-24 | 1-25 |
| 2-56 | 1,376 | 1,377 | 1,378 | 1,379 | 1,380 | 1,381 | 1,382 | 1,383 | 1,384 | 1,385 | 1,386 | 1,387 | 1,388 | 1,389 | 1,390 | 1,391 | 1,392 | 1,393 | 1,394 | 1,395 | 1,396 | 1,397 | 1,398 | 1,399 | 1,400 |
| 2-57 | 1,401 | 1,402 | 1,403 | 1,404 | 1,405 | 1,406 | 1,407 | 1,408 | 1,409 | 1,410 | 1,411 | 1,412 | 1,413 | 1,414 | 1,415 | 1,416 | 1,417 | 1,418 | 1,419 | 1,420 | 1,421 | 1,422 | 1,423 | 1,424 | 1,425 |
| 2-58 | 1,426 | 1,427 | 1,428 | 1,429 | 1,430 | 1,431 | 1,432 | 1,433 | 1,434 | 1,435 | 1,436 | 1,437 | 1,438 | 1,439 | 1,440 | 1,441 | 1,442 | 1,443 | 1,444 | 1,445 | 1,446 | 1,447 | 1,448 | 1,449 | 1,450 |
| 2-59 | 1,451 | 1,452 | 1,453 | 1,454 | 1,455 | 1,456 | 1,457 | 1,458 | 1,459 | 1,460 | 1,461 | 1,462 | 1,463 | 1,464 | 1,465 | 1,466 | 1,467 | 1,468 | 1,469 | 1,470 | 1,471 | 1,472 | 1,473 | 1,474 | 1,475 |
| 2-60 | 1,476 | 1,477 | 1,478 | 1,479 | 1,480 | 1,481 | 1,482 | 1,483 | 1,484 | 1,485 | 1,486 | 1,487 | 1,488 | 1,489 | 1,490 | 1,491 | 1,492 | 1,493 | 1,494 | 1,495 | 1,496 | 1,497 | 1,498 | 1,499 | 1,500 |
| 2-61 | 1,501 | 1,502 | 1,503 | 1,504 | 1,505 | 1,506 | 1,507 | 1,508 | 1,509 | 1,510 | 1,511 | 1,512 | 1,513 | 1,514 | 1,515 | 1,516 | 1,517 | 1,518 | 1,519 | 1,520 | 1,521 | 1,522 | 1,523 | 1,524 | 1,525 |
| 2-62 | 1,526 | 1,527 | 1,528 | 1,529 | 1,530 | 1,531 | 1,532 | 1,533 | 1,534 | 1,535 | 1,536 | 1,537 | 1,538 | 1,539 | 1,540 | 1,541 | 1,542 | 1,543 | 1,544 | 1,545 | 1,546 | 1,547 | 1,548 | 1,549 | 1,550 |
| 2-63 | 1,551 | 1,552 | 1,553 | 1,554 | 1,555 | 1,556 | 1,557 | 1,558 | 1,559 | 1,560 | 1,561 | 1,562 | 1,563 | 1,564 | 1,565 | 1,566 | 1,567 | 1,568 | 1,569 | 1,570 | 1,571 | 1,572 | 1,573 | 1,574 | 1,575 |
| 2-64 | 1,576 | 1,577 | 1,578 | 1,579 | 1,580 | 1,581 | 1,582 | 1,583 | 1,584 | 1,585 | 1,586 | 1,587 | 1,588 | 1,589 | 1,590 | 1,591 | 1,592 | 1,593 | 1,594 | 1,595 | 1,596 | 1,597 | 1,598 | 1,599 | 1,600 |
| 2-65 | 1,601 | 1,602 | 1,603 | 1,604 | 1,605 | 1,606 | 1,607 | 1,608 | 1,609 | 1,610 | 1,611 | 1,612 | 1,613 | 1,614 | 1,615 | 1,616 | 1,617 | 1,618 | 1,619 | 1,620 | 1,621 | 1,622 | 1,623 | 1,624 | 1,625 |
| 2-66 | 1,626 | 1,627 | 1,628 | 1,629 | 1,630 | 1,631 | 1,632 | 1,633 | 1,634 | 1,635 | 1,636 | 1,637 | 1,638 | 1,639 | 1,640 | 1,641 | 1,642 | 1,643 | 1,644 | 1,645 | 1,646 | 1,647 | 1,648 | 1,649 | 1,650 |
| 2-67 | 1,651 | 1,652 | 1,653 | 1,654 | 1,655 | 1,656 | 1,657 | 1,658 | 1,659 | 1,660 | 1,661 | 1,662 | 1,663 | 1,664 | 1,665 | 1,666 | 1,667 | 1,668 | 1,669 | 1,670 | 1,671 | 1,672 | 1,673 | 1,674 | 1,675 |
| 2-68 | 1,676 | 1,677 | 1,678 | 1,679 | 1,680 | 1,681 | 1,682 | 1,683 | 1,684 | 1,685 | 1,686 | 1,687 | 1,688 | 1,689 | 1,690 | 1,691 | 1,692 | 1,693 | 1,694 | 1,695 | 1,696 | 1,697 | 1,698 | 1,699 | 1,700 |
| 2-69 | 1,701 | 1,702 | 1,703 | 1,704 | 1,705 | 1,706 | 1,707 | 1,708 | 1,709 | 1,710 | 1,711 | 1,712 | 1,713 | 1,714 | 1,715 | 1,716 | 1,717 | 1,718 | 1,719 | 1,720 | 1,721 | 1,722 | 1,723 | 1,724 | 1,725 |
| 2-70 | 1,726 | 1,727 | 1,728 | 1,729 | 1,730 | 1,731 | 1,732 | 1,733 | 1,734 | 1,735 | 1,736 | 1,737 | 1,738 | 1,739 | 1,740 | 1,741 | 1,742 | 1,743 | 1,744 | 1,745 | 1,746 | 1,747 | 1,748 | 1,749 | 1,750 |
| 2-71 | 1,751 | 1,752 | 1,753 | 1,754 | 1,755 | 1,756 | 1,757 | 1,758 | 1,759 | 1,760 | 1,761 | 1,762 | 1,763 | 1,764 | 1,765 | 1,766 | 1,767 | 1,768 | 1,769 | 1,770 | 1,771 | 1,772 | 1,773 | 1,774 | 1,775 |
| 2-72 | 1,776 | 1,777 | 1,778 | 1,779 | 1,780 | 1,781 | 1,782 | 1,783 | 1,784 | 1,785 | 1,786 | 1,787 | 1,788 | 1,789 | 1,790 | 1,791 | 1,792 | 1,793 | 1,794 | 1,795 | 1,796 | 1,797 | 1,798 | 1,799 | 1,800 |
| 2-73 | 1,801 | 1,802 | 1,803 | 1,804 | 1,805 | 1,806 | 1,807 | 1,808 | 1,809 | 1,810 | 1,811 | 1,812 | 1,813 | 1,814 | 1,815 | 1,816 | 1,817 | 1,818 | 1,819 | 1,820 | 1,821 | 1,822 | 1,823 | 1,824 | 1,825 |
| 2-74 | 1,826 | 1,827 | 1,828 | 1,829 | 1,830 | 1,831 | 1,832 | 1,833 | 1,834 | 1,835 | 1,836 | 1,837 | 1,838 | 1,839 | 1,840 | 1,841 | 1,842 | 1,843 | 1,844 | 1,845 | 1,846 | 1,847 | 1,848 | 1,849 | 1,850 |
| 2-75 | 1,851 | 1,852 | 1,853 | 1,854 | 1,855 | 1,856 | 1,857 | 1,858 | 1,859 | 1,860 | 1,861 | 1,862 | 1,863 | 1,864 | 1,865 | 1,866 | 1,867 | 1,868 | 1,869 | 1,870 | 1,871 | 1,872 | 1,873 | 1,874 | 1,875 |
| 2-76 | 1,876 | 1,877 | 1,878 | 1,879 | 1,880 | 1,881 | 1,882 | 1,883 | 1,884 | 1,885 | 1,886 | 1,887 | 1,888 | 1,889 | 1,890 | 1,891 | 1,892 | 1,893 | 1,894 | 1,895 | 1,896 | 1,897 | 1,898 | 1,899 | 1,900 |
| 2-77 | 1,901 | 1,902 | 1,903 | 1,904 | 1,905 | 1,906 | 1,907 | 1,908 | 1,909 | 1,910 | 1,911 | 1,912 | 1,913 | 1,914 | 1,915 | 1,916 | 1,917 | 1,918 | 1,919 | 1,920 | 1,921 | 1,922 | 1,923 | 1,924 | 1,925 |
| 2-78 | 1,926 | 1,927 | 1,928 | 1,929 | 1,930 | 1,931 | 1,932 | 1,933 | 1,934 | 1,935 | 1,936 | 1,937 | 1,938 | 1,939 | 1,940 | 1,941 | 1,942 | 1,943 | 1,944 | 1,945 | 1,946 | 1,947 | 1,948 | 1,949 | 1,950 |
| 2-79 | 1,951 | 1,952 | 1,953 | 1,954 | 1,955 | 1,956 | 1,957 | 1,958 | 1,959 | 1,960 | 1,961 | 1,962 | 1,963 | 1,964 | 1,965 | 1,966 | 1,967 | 1,968 | 1,969 | 1,970 | 1,971 | 1,972 | 1,973 | 1,974 | 1,975 |
| 2-80 | 1,976 | 1,977 | 1,978 | 1,979 | 1,980 | 1,981 | 1,982 | 1,983 | 1,984 | 1,985 | 1,986 | 1,987 | 1,988 | 1,989 | 1,990 | 1,991 | 1,992 | 1,993 | 1,994 | 1,995 | 1,996 | 1,997 | 1,998 | 1,999 | 2,000 |
| 2-81 | 2,001 | 2,002 | 2,003 | 2,004 | 2,005 | 2,006 | 2,007 | 2,008 | 2,009 | 2,010 | 2,011 | 2,012 | 2,013 | 2,014 | 2,015 | 2,016 | 2,017 | 2,018 | 2,019 | 2,020 | 2,021 | 2,022 | 2,023 | 2,024 | 2,025 |
| 2-82 | 2,026 | 2,027 | 2,028 | 2,029 | 2,030 | 2,031 | 2,032 | 2,033 | 2,034 | 2,035 | 2,036 | 2,037 | 2,038 | 2,039 | 2,040 | 2,041 | 2,042 | 2,043 | 2,044 | 2,045 | 2,046 | 2,047 | 2,048 | 2,049 | 2,050 |
| 2-83 | 2,051 | 2,052 | 2,053 | 2,054 | 2,055 | 2,056 | 2,057 | 2,058 | 2,059 | 2,060 | 2,061 | 2,062 | 2,063 | 2,064 | 2,065 | 2,066 | 2,067 | 2,068 | 2,069 | 2,070 | 2,071 | 2,072 | 2,073 | 2,074 | 2,075 |
| 2-84 | 2,076 | 2,077 | 2,078 | 2,079 | 2,080 | 2,081 | 2,082 | 2,083 | 2,084 | 2,085 | 2,086 | 2,087 | 2,088 | 2,089 | 2,090 | 2,091 | 2,092 | 2,093 | 2,094 | 2,095 | 2,096 | 2,097 | 2,098 | 2,099 | 2,100 |
| 2-85 | 2,101 | 2,102 | 2,103 | 2,104 | 2,105 | 2,106 | 2,107 | 2,108 | 2,109 | 2,110 | 2,111 | 2,112 | 2,113 | 2,114 | 2,115 | 2,116 | 2,117 | 2,118 | 2,119 | 2,120 | 2,121 | 2,122 | 2,123 | 2,124 | 2,125 |
| 2-86 | 2,126 | 2,127 | 2,128 | 2,129 | 2,130 | 2,131 | 2,132 | 2,133 | 2,134 | 2,135 | 2,136 | 2,137 | 2,138 | 2,139 | 2,140 | 2,141 | 2,142 | 2,143 | 2,144 | 2,145 | 2,146 | 2,147 | 2,148 | 2,149 | 2,150 |
| 2-87 | 2,151 | 2,152 | 2,153 | 2,154 | 2,155 | 2,156 | 2,157 | 2,158 | 2,159 | 2,160 | 2,161 | 2,162 | 2,163 | 2,164 | 2,165 | 2,166 | 2,167 | 2,168 | 2,169 | 2,170 | 2,171 | 2,172 | 2,173 | 2,174 | 2,175 |
| 2-88 | 2,176 | 2,177 | 2,178 | 2,179 | 2,180 | 2,181 | 2,182 | 2,183 | 2,184 | 2,185 | 2,186 | 2,187 | 2,188 | 2,189 | 2,190 | 2,191 | 2,192 | 2,193 | 2,194 | 2,195 | 2,196 | 2,197 | 2,198 | 2,199 | 2,200 |
| 2-89 | 2,201 | 2,202 | 2,203 | 2,204 | 2,205 | 2,206 | 2,207 | 2,208 | 2,209 | 2,210 | 2,211 | 2,212 | 2,213 | 2,214 | 2,215 | 2,216 | 2,217 | 2,218 | 2,219 | 2,220 | 2,221 | 2,222 | 2,223 | 2,224 | 2,225 |
| 2-90 | 2,226 | 2,227 | 2,228 | 2,229 | 2,230 | 2,231 | 2,232 | 2,233 | 2,234 | 2,235 | 2,236 | 2,237 | 2,238 | 2,239 | 2,240 | 2,241 | 2,242 | 2,243 | 2,244 | 2,245 | 2,246 | 2,247 | 2,248 | 2,249 | 2,250 |
| 2-91 | 2,251 | 2,252 | 2,253 | 2,254 | 2,255 | 2,256 | 2,257 | 2,258 | 2,259 | 2,260 | 2,261 | 2,262 | 2,263 | 2,264 | 2,265 | 2,266 | 2,267 | 2,268 | 2,269 | 2,270 | 2,271 | 2,272 | 2,273 | 2,274 | 2,275 |
| 2-92 | 2,276 | 2,277 | 2,278 | 2,279 | 2,280 | 2,281 | 2,282 | 2,283 | 2,284 | 2,285 | 2,286 | 2,287 | 2,288 | 2,289 | 2,290 | 2,291 | 2,292 | 2,293 | 2,294 | 2,295 | 2,296 | 2,297 | 2,298 | 2,299 | 2,300 |
| 2-93 | 2,301 | 2,302 | 2,303 | 2,304 | 2,305 | 2,306 | 2,307 | 2,308 | 2,309 | 2,310 | 2,311 | 2,312 | 2,313 | 2,314 | 2,315 | 2,316 | 2,317 | 2,318 | 2,319 | 2,320 | 2,321 | 2,322 | 2,323 | 2,324 | 2,325 |
| 2-94 | 2,326 | 2,327 | 2,328 | 2,329 | 2,330 | 2,331 | 2,332 | 2,333 | 2,334 | 2,335 | 2,336 | 2,337 | 2,338 | 2,339 | 2,340 | 2,341 | 2,342 | 2,343 | 2,344 | 2,345 | 2,346 | 2,347 | 2,348 | 2,349 | 2,350 |
| 2-95 | 2,351 | 2,352 | 2,353 | 2,354 | 2,355 | 2,356 | 2,357 | 2,358 | 2,359 | 2,360 | 2,361 | 2,362 | 2,363 | 2,364 | 2,365 | 2,366 | 2,367 | 2,368 | 2,369 | 2,370 | 2,371 | 2,372 | 2,373 | 2,374 | 2,375 |
| 2-96 | 2,376 | 2,377 | 2,378 | 2,379 | 2,380 | 2,381 | 2,382 | 2,383 | 2,384 | 2,385 | 2,386 | 2,387 | 2,388 | 2,389 | 2,390 | 2,391 | 2,392 | 2,393 | 2,394 | 2,395 | 2,396 | 2,397 | 2,398 | 2,399 | 2,400 |
| 2-97 | 2,401 | 2,402 | 2,403 | 2,404 | 2,405 | 2,406 | 2,407 | 2,408 | 2,409 | 2,410 | 2,411 | 2,412 | 2,413 | 2,414 | 2,415 | 2,416 | 2,417 | 2,418 | 2,419 | 2,420 | 2,421 | 2,422 | 2,423 | 2,424 | 2,425 |
| 2-98 | 2,426 | 2,427 | 2,428 | 2,429 | 2,430 | 2,431 | 2,432 | 2,433 | 2,434 | 2,435 | 2,436 | 2,437 | 2,438 | 2,439 | 2,440 | 2,441 | 2,442 | 2,443 | 2,444 | 2,445 | 2,446 | 2,447 | 2,448 | 2,449 | 2,450 |
| 2-99 | 2,451 | 2,452 | 2,453 | 2,454 | 2,455 | 2,456 | 2,457 | 2,458 | 2,459 | 2,460 | 2,461 | 2,462 | 2,463 | 2,464 | 2,465 | 2,466 | 2,467 | 2,468 | 2,469 | 2,470 | 2,471 | 2,472 | 2,473 | 2,474 | 2,475 |
| 2-100 | 2,476 | 2,477 | 2,478 | 2,479 | 2,480 | 2,481 | 2,482 | 2,483 | 2,484 | 2,485 | 2,486 | 2,487 | 2,488 | 2,489 | 2,490 | 2,491 | 2,492 | 2,493 | 2,494 | 2,495 | 2,496 | 2,497 | 2,498 | 2,499 | 2,500 |
| 2-101 | 2,501 | 2,502 | 2,503 | 2,504 | 2,505 | 2,506 | 2,507 | 2,508 | 2,509 | 2,510 | 2,511 | 2,512 | 2,513 | 2,514 | 2,515 | 2,516 | 2,517 | 2,518 | 2,519 | 2,520 | 2,521 | 2,522 | 2,523 | 2,524 | 2,525 |
| 2-102 | 2,526 | 2,527 | 2,528 | 2,529 | 2,530 | 2,531 | 2,532 | 2,533 | 2,534 | 2,535 | 2,536 | 2,537 | 2,538 | 2,539 | 2,540 | 2,541 | 2,542 | 2,543 | 2,544 | 2,545 | 2,546 | 2,547 | 2,548 | 2,549 | 2,550 |

TABLE 2-continued

| | Compound represented by the formula (1) | | | | | | | | | | | | | | | | | | | | | | | | |
|---|---|---|---|---|---|---|---|---|---|---|---|---|---|---|---|---|---|---|---|---|---|---|---|---|---|
| | 1-1 | 1-2 | 1-3 | 1-4 | 1-5 | 1-6 | 1-7 | 1-8 | 1-9 | 1-10 | 1-11 | 1-12 | 1-13 | 1-14 | 1-15 | 1-16 | 1-17 | 1-18 | 1-19 | 1-20 | 1-21 | 1-22 | 1-23 | 1-24 | 1-25 |
| 2-103 | 2,551 | 2,552 | 2,553 | 2,554 | 2,555 | 2,556 | 2,557 | 2,558 | 2,559 | 2,560 | 2,561 | 2,562 | 2,563 | 2,564 | 2,565 | 2,566 | 2,567 | 2,568 | 2,569 | 2,570 | 2,571 | 2,572 | 2,573 | 2,574 | 2,575 |
| 2-104 | 2,576 | 2,577 | 2,578 | 2,579 | 2,580 | 2,581 | 2,582 | 2,583 | 2,584 | 2,585 | 2,586 | 2,587 | 2,588 | 2,589 | 2,590 | 2,591 | 2,592 | 2,593 | 2,594 | 2,595 | 2,596 | 2,597 | 2,598 | 2,599 | 2,600 |
| 2-105 | 2,601 | 2,602 | 2,603 | 2,604 | 2,605 | 2,606 | 2,607 | 2,608 | 2,609 | 2,610 | 2,611 | 2,612 | 2,613 | 2,614 | 2,615 | 2,616 | 2,617 | 2,618 | 2,619 | 2,620 | 2,621 | 2,622 | 2,623 | 2,624 | 2,625 |
| 2-106 | 2,626 | 2,627 | 2,628 | 2,629 | 2,630 | 2,631 | 2,632 | 2,633 | 2,634 | 2,635 | 2,636 | 2,637 | 2,638 | 2,639 | 2,640 | 2,641 | 2,642 | 2,643 | 2,644 | 2,645 | 2,646 | 2,647 | 2,648 | 2,649 | 2,650 |
| 2-107 | 2,651 | 2,652 | 2,653 | 2,654 | 2,655 | 2,656 | 2,657 | 2,658 | 2,659 | 2,660 | 2,661 | 2,662 | 2,663 | 2,664 | 2,665 | 2,666 | 2,667 | 2,668 | 2,669 | 2,670 | 2,671 | 2,672 | 2,673 | 2,674 | 2,675 |
| 2-108 | 2,676 | 2,677 | 2,678 | 2,679 | 2,680 | 2,681 | 2,682 | 2,683 | 2,684 | 2,685 | 2,686 | 2,687 | 2,688 | 2,689 | 2,690 | 2,691 | 2,692 | 2,693 | 2,694 | 2,695 | 2,696 | 2,697 | 2,698 | 2,699 | 2,700 |
| 2-109 | 2,701 | 2,702 | 2,703 | 2,704 | 2,705 | 2,706 | 2,707 | 2,708 | 2,709 | 2,710 | 2,711 | 2,712 | 2,713 | 2,714 | 2,715 | 2,716 | 2,717 | 2,718 | 2,719 | 2,720 | 2,721 | 2,722 | 2,723 | 2,724 | 2,725 |
| 2-110 | 2,726 | 2,727 | 2,728 | 2,729 | 2,730 | 2,731 | 2,732 | 2,733 | 2,734 | 2,735 | 2,736 | 2,737 | 2,738 | 2,739 | 2,740 | 2,741 | 2,742 | 2,743 | 2,744 | 2,745 | 2,746 | 2,747 | 2,748 | 2,749 | 2,750 |

TABLE 3

| | | Compound represented by the formula (1) | | | | | | | | | | | | |
|---|---|---|---|---|---|---|---|---|---|---|---|---|---|---|
| | | 1-1 | 1-2 | 1-3 | 1-4 | 1-5 | 1-6 | 1-7 | 1-8 | 1-9 | 1-10 | 1-11 | 1-12 | 1-13 |
| Compound represented by the formula (2) | 2-111 | 2,751 | 2,752 | 2,753 | 2,754 | 2,755 | 2,756 | 2,757 | 2,758 | 2,759 | 2,760 | 2,761 | 2,762 | 2,763 |
| | 2-112 | 2,776 | 2,777 | 2,778 | 2,779 | 2,780 | 2,781 | 2,782 | 2,783 | 2,784 | 2,785 | 2,786 | 2,787 | 2,788 |
| | 2-113 | 2,801 | 2,802 | 2,803 | 2,804 | 2,805 | 2,806 | 2,807 | 2,808 | 2,809 | 2,810 | 2,811 | 2,812 | 2,813 |
| | 2-114 | 2,826 | 2,827 | 2,828 | 2,829 | 2,830 | 2,831 | 2,832 | 2,833 | 2,834 | 2,835 | 2,836 | 2,837 | 2,838 |
| | 2-115 | 2,851 | 2,852 | 2,853 | 2,854 | 2,855 | 2,856 | 2,857 | 2,858 | 2,859 | 2,860 | 2,861 | 2,862 | 2,863 |
| | 2-116 | 2,876 | 2,877 | 2,878 | 2,879 | 2,880 | 2,881 | 2,882 | 2,883 | 2,884 | 2,885 | 2,886 | 2,887 | 2,888 |
| | 2-117 | 2,901 | 2,902 | 2,903 | 2,904 | 2,905 | 2,906 | 2,907 | 2,908 | 2,909 | 2,910 | 2,911 | 2,912 | 2,913 |
| | 2-118 | 2,926 | 2,927 | 2,928 | 2,929 | 2,930 | 2,931 | 2,932 | 2,933 | 2,934 | 2,935 | 2,936 | 2,937 | 2,938 |
| | 2-119 | 2,951 | 2,952 | 2,953 | 2,954 | 2,955 | 2,956 | 2,957 | 2,958 | 2,959 | 2,960 | 2,961 | 2,962 | 2,963 |
| | 2-120 | 2,976 | 2,977 | 2,978 | 2,979 | 2,980 | 2,981 | 2,982 | 2,983 | 2,984 | 2,985 | 2,986 | 2,987 | 2,988 |
| | 2-121 | 3,001 | 3,002 | 3,003 | 3,004 | 3,005 | 3,006 | 3,007 | 3,008 | 3,009 | 3,010 | 3,011 | 3,012 | 3,013 |
| | 2-122 | 3,026 | 3,027 | 3,028 | 3,029 | 3,030 | 3,031 | 3,032 | 3,033 | 3,034 | 3,035 | 3,036 | 3,037 | 3,038 |
| | 2-123 | 3,051 | 3,052 | 3,053 | 3,054 | 3,055 | 3,056 | 3,057 | 3,058 | 3,059 | 3,060 | 3,061 | 3,062 | 3,063 |
| | 2-124 | 3,076 | 3,077 | 3,078 | 3,079 | 3,080 | 3,081 | 3,082 | 3,083 | 3,084 | 3,085 | 3,086 | 3,087 | 3,088 |
| | 2-125 | 3,101 | 3,102 | 3,103 | 3,104 | 3,105 | 3,106 | 3,107 | 3,108 | 3,109 | 3,110 | 3,111 | 3,112 | 3,113 |
| | 2-126 | 3,126 | 3,127 | 3,128 | 3,129 | 3,130 | 3,131 | 3,132 | 3,133 | 3,134 | 3,135 | 3,136 | 3,137 | 3,138 |
| | 2-127 | 3,151 | 3,152 | 3,153 | 3,154 | 3,155 | 3,156 | 3,157 | 3,158 | 3,159 | 3,160 | 3,161 | 3,162 | 3,163 |
| | 2-128 | 3,176 | 3,177 | 3,178 | 3,179 | 3,180 | 3,181 | 3,182 | 3,183 | 3,184 | 3,185 | 3,186 | 3,187 | 3,188 |
| | 2-129 | 3,201 | 3,202 | 3,203 | 3,204 | 3,205 | 3,206 | 3,207 | 3,208 | 3,209 | 3,210 | 3,211 | 3,212 | 3,213 |
| | 2-130 | 3,226 | 3,227 | 3,228 | 3,229 | 3,230 | 3,231 | 3,232 | 3,233 | 3,234 | 3,235 | 3,236 | 3,237 | 3,238 |
| | 2-131 | 3,251 | 3,252 | 3,253 | 3,254 | 3,255 | 3,256 | 3,257 | 3,258 | 3,259 | 3,260 | 3,261 | 3,262 | 3,263 |
| | 2-132 | 3,276 | 3,277 | 3,278 | 3,279 | 3,280 | 3,281 | 3,282 | 3,283 | 3,284 | 3,285 | 3,286 | 3,287 | 3,288 |
| | 2-133 | 3,301 | 3,302 | 3,303 | 3,304 | 3,305 | 3,306 | 3,307 | 3,308 | 3,309 | 3,310 | 3,311 | 3,312 | 3,313 |
| | 2-134 | 3,326 | 3,327 | 3,328 | 3,329 | 3,330 | 3,331 | 3,332 | 3,333 | 3,334 | 3,335 | 3,336 | 3,337 | 3,338 |
| | 2-135 | 3,351 | 3,352 | 3,353 | 3,354 | 3,355 | 3,356 | 3,357 | 3,358 | 3,359 | 3,360 | 3,361 | 3,362 | 3,363 |
| | 2-136 | 3,376 | 3,377 | 3,378 | 3,379 | 3,380 | 3,381 | 3,382 | 3,383 | 3,384 | 3,385 | 3,386 | 3,387 | 3,388 |
| | 2-137 | 3,401 | 3,402 | 3,403 | 3,404 | 3,405 | 3,406 | 3,407 | 3,408 | 3,409 | 3,410 | 3,411 | 3,412 | 3,413 |
| | 2-138 | 3,426 | 3,427 | 3,428 | 3,429 | 3,430 | 3,431 | 3,432 | 3,433 | 3,434 | 3,435 | 3,436 | 3,437 | 3,438 |
| | 2-139 | 3,451 | 3,452 | 3,453 | 3,454 | 3,455 | 3,456 | 3,457 | 3,458 | 3,459 | 3,460 | 3,461 | 3,462 | 3,463 |
| | 2-140 | 3,476 | 3,477 | 3,478 | 3,479 | 3,480 | 3,481 | 3,482 | 3,483 | 3,484 | 3,485 | 3,486 | 3,487 | 3,488 |
| | 2-141 | 3,501 | 3,502 | 3,503 | 3,504 | 3,505 | 3,506 | 3,507 | 3,508 | 3,509 | 3,510 | 3,511 | 3,512 | 3,513 |
| | 2-142 | 3,526 | 3,527 | 3,528 | 3,529 | 3,530 | 3,531 | 3,532 | 3,533 | 3,534 | 3,535 | 3,536 | 3,537 | 3,538 |
| | 2-143 | 3,551 | 3,552 | 3,553 | 3,554 | 3,555 | 3,556 | 3,557 | 3,558 | 3,559 | 3,560 | 3,561 | 3,562 | 3,563 |
| | 2-144 | 3,576 | 3,577 | 3,578 | 3,579 | 3,580 | 3,581 | 3,582 | 3,583 | 3,584 | 3,585 | 3,586 | 3,587 | 3,588 |
| | 2-145 | 3,601 | 3,602 | 3,603 | 3,604 | 3,605 | 3,606 | 3,607 | 3,608 | 3,609 | 3,610 | 3,611 | 3,612 | 3,613 |
| | 2-146 | 3,626 | 3,627 | 3,628 | 3,629 | 3,630 | 3,631 | 3,632 | 3,633 | 3,634 | 3,635 | 3,636 | 3,637 | 3,638 |
| | 2-147 | 3,651 | 3,652 | 3,653 | 3,654 | 3,655 | 3,656 | 3,657 | 3,658 | 3,659 | 3,660 | 3,661 | 3,662 | 3,663 |
| | 2-148 | 3,676 | 3,677 | 3,678 | 3,679 | 3,680 | 3,681 | 3,682 | 3,683 | 3,684 | 3,685 | 3,686 | 3,687 | 3,688 |
| | 2-149 | 3,701 | 3,702 | 3,703 | 3,704 | 3,705 | 3,706 | 3,707 | 3,708 | 3,709 | 3,710 | 3,711 | 3,712 | 3,713 |
| | 2-150 | 3,726 | 3,727 | 3,728 | 3,729 | 3,730 | 3,731 | 3,732 | 3,733 | 3,734 | 3,735 | 3,736 | 3,737 | 3,738 |
| | 2-151 | 3,751 | 3,752 | 3,753 | 3,754 | 3,755 | 3,756 | 3,757 | 3,758 | 3,759 | 3,760 | 3,761 | 3,762 | 3,763 |
| | 2-152 | 3,776 | 3,777 | 3,778 | 3,779 | 3,780 | 3,781 | 3,782 | 3,783 | 3,784 | 3,785 | 3,786 | 3,787 | 3,788 |
| | 2-153 | 3,801 | 3,802 | 3,803 | 3,804 | 3,805 | 3,806 | 3,807 | 3,808 | 3,809 | 3,810 | 3,811 | 3,812 | 3,813 |
| | 2-154 | 3,826 | 3,827 | 3,828 | 3,829 | 3,830 | 3,831 | 3,832 | 3,833 | 3,834 | 3,835 | 3,836 | 3,837 | 3,838 |
| | 2-155 | 3,851 | 3,852 | 3,853 | 3,854 | 3,855 | 3,856 | 3,857 | 3,858 | 3,859 | 3,860 | 3,861 | 3,862 | 3,863 |
| | 2-156 | 3,876 | 3,877 | 3,878 | 3,879 | 3,880 | 3,881 | 3,882 | 3,883 | 3,884 | 3,885 | 3,886 | 3,887 | 3,888 |
| | 2-157 | 3,901 | 3,902 | 3,903 | 3,904 | 3,905 | 3,906 | 3,907 | 3,908 | 3,909 | 3,910 | 3,911 | 3,912 | 3,913 |
| | 2-158 | 3,926 | 3,927 | 3,928 | 3,929 | 3,930 | 3,931 | 3,932 | 3,933 | 3,934 | 3,935 | 3,936 | 3,937 | 3,938 |
| | 2-159 | 3,951 | 3,952 | 3,953 | 3,954 | 3,955 | 3,956 | 3,957 | 3,958 | 3,959 | 3,960 | 3,961 | 3,962 | 3,963 |
| | 2-160 | 3,976 | 3,977 | 3,978 | 3,979 | 3,980 | 3,981 | 3,982 | 3,983 | 3,984 | 3,985 | 3,986 | 3,987 | 3,988 |
| | 2-161 | 4,001 | 4,002 | 4,003 | 4,004 | 4,005 | 4,006 | 4,007 | 4,008 | 4,009 | 4,010 | 4,011 | 4,012 | 4,013 |
| | 2-162 | 4,026 | 4,027 | 4,028 | 4,029 | 4,030 | 4,031 | 4,032 | 4,033 | 4,034 | 4,035 | 4,036 | 4,037 | 4,038 |
| | 2-163 | 4,051 | 4,052 | 4,053 | 4,054 | 4,055 | 4,056 | 4,057 | 4,058 | 4,059 | 4,060 | 4,061 | 4,062 | 4,063 |
| | 2-164 | 4,076 | 4,077 | 4,078 | 4,079 | 4,080 | 4,081 | 4,082 | 4,083 | 4,084 | 4,085 | 4,086 | 4,087 | 4,088 |
| | 2-165 | 4,101 | 4,102 | 4,103 | 4,104 | 4,105 | 4,106 | 4,107 | 4,108 | 4,109 | 4,110 | 4,111 | 4,112 | 4,113 |

| | | Compound represented by the formula (1) | | | | | | | | | | | |
|---|---|---|---|---|---|---|---|---|---|---|---|---|---|
| | | 1-14 | 1-15 | 1-16 | 1-17 | 1-18 | 1-19 | 1-20 | 1-21 | 1-22 | 1-23 | 1-24 | 1-25 |
| Compound represented by the formula (2) | 2-111 | 2,764 | 2,765 | 2,766 | 2,767 | 2,768 | 2,769 | 2,770 | 2,771 | 2,772 | 2,773 | 2,774 | 2,775 |
| | 2-112 | 2,789 | 2,790 | 2,791 | 2,792 | 2,793 | 2,794 | 2,795 | 2,796 | 2,797 | 2,798 | 2,799 | 2,800 |
| | 2-113 | 2,814 | 2,815 | 2,816 | 2,817 | 2,818 | 2,819 | 2,820 | 2,821 | 2,822 | 2,823 | 2,824 | 2,825 |
| | 2-114 | 2,839 | 2,840 | 2,841 | 2,842 | 2,843 | 2,844 | 2,845 | 2,846 | 2,847 | 2,848 | 2,849 | 2,850 |
| | 2-115 | 2,864 | 2,865 | 2,866 | 2,867 | 2,868 | 2,869 | 2,870 | 2,871 | 2,872 | 2,873 | 2,874 | 2,875 |
| | 2-116 | 2,889 | 2,890 | 2,891 | 2,892 | 2,893 | 2,894 | 2,895 | 2,896 | 2,897 | 2,898 | 2,899 | 2,900 |
| | 2-117 | 2,914 | 2,915 | 2,916 | 2,917 | 2,918 | 2,919 | 2,920 | 2,921 | 2,922 | 2,923 | 2,924 | 2,925 |
| | 2-118 | 2,939 | 2,940 | 2,941 | 2,942 | 2,943 | 2,944 | 2,945 | 2,946 | 2,947 | 2,948 | 2,949 | 2,950 |
| | 2-119 | 2,964 | 2,965 | 2,966 | 2,967 | 2,968 | 2,969 | 2,970 | 2,971 | 2,972 | 2,973 | 2,974 | 2,975 |
| | 2-120 | 2,989 | 2,990 | 2,991 | 2,992 | 2,993 | 2,994 | 2,995 | 2,996 | 2,997 | 2,998 | 2,999 | 3,000 |
| | 2-121 | 3,014 | 3,015 | 3,016 | 3,017 | 3,018 | 3,019 | 3,020 | 3,021 | 3,022 | 3,023 | 3,024 | 3,025 |
| | 2-122 | 3,039 | 3,040 | 3,041 | 3,042 | 3,043 | 3,044 | 3,045 | 3,046 | 3,047 | 3,048 | 3,049 | 3,050 |
| | 2-123 | 3,064 | 3,065 | 3,066 | 3,067 | 3,068 | 3,069 | 3,070 | 3,071 | 3,072 | 3,073 | 3,074 | 3,075 |
| | 2-124 | 3,089 | 3,090 | 3,091 | 3,092 | 3,093 | 3,094 | 3,095 | 3,096 | 3,097 | 3,098 | 3,099 | 3,100 |
| | 2-125 | 3,114 | 3,115 | 3,116 | 3,117 | 3,118 | 3,119 | 3,120 | 3,121 | 3,122 | 3,123 | 3,124 | 3,125 |
| | 2-126 | 3,139 | 3,140 | 3,141 | 3,142 | 3,143 | 3,144 | 3,145 | 3,146 | 3,147 | 3,148 | 3,149 | 3,150 |

TABLE 3-continued

| | | | | | | | | | | | | |
|---|---|---|---|---|---|---|---|---|---|---|---|---|
| 2-127 | 3,164 | 3,165 | 3,166 | 3,167 | 3,168 | 3,169 | 3,170 | 3,171 | 3,172 | 3,173 | 3,174 | 3,175 |
| 2-128 | 3,189 | 3,190 | 3,191 | 3,192 | 3,193 | 3,194 | 3,195 | 3,196 | 3,197 | 3,198 | 3,199 | 3,200 |
| 2-129 | 3,214 | 3,215 | 3,216 | 3,217 | 3,218 | 3,219 | 3,220 | 3,221 | 3,222 | 3,223 | 3,224 | 3,225 |
| 2-130 | 3,239 | 3,240 | 3,241 | 3,242 | 3,243 | 3,244 | 3,245 | 3,246 | 3,247 | 3,248 | 3,249 | 3,250 |
| 2-131 | 3,264 | 3,265 | 3,266 | 3,267 | 3,268 | 3,269 | 3,270 | 3,271 | 3,272 | 3,273 | 3,274 | 3,275 |
| 2-132 | 3,289 | 3,290 | 3,291 | 3,292 | 3,293 | 3,294 | 3,295 | 3,296 | 3,297 | 3,298 | 3,299 | 3,300 |
| 2-133 | 3,314 | 3,315 | 3,316 | 3,317 | 3,318 | 3,319 | 3,320 | 3,321 | 3,322 | 3,323 | 3,324 | 3,325 |
| 2-134 | 3,339 | 3,340 | 3,341 | 3,342 | 3,343 | 3,344 | 3,345 | 3,346 | 3,347 | 3,348 | 3,349 | 3,350 |
| 2-135 | 3,364 | 3,365 | 3,366 | 3,367 | 3,368 | 3,369 | 3,370 | 3,371 | 3,372 | 3,373 | 3,374 | 3,375 |
| 2-136 | 3,389 | 3,390 | 3,391 | 3,392 | 3,393 | 3,394 | 3,395 | 3,396 | 3,397 | 3,398 | 3,399 | 3,400 |
| 2-137 | 3,414 | 3,415 | 3,416 | 3,417 | 3,418 | 3,419 | 3,420 | 3,421 | 3,422 | 3,423 | 3,424 | 3,425 |
| 2-138 | 3,439 | 3,440 | 3,441 | 3,442 | 3,443 | 3,444 | 3,445 | 3,446 | 3,447 | 3,448 | 3,449 | 3,450 |
| 2-139 | 3,464 | 3,465 | 3,466 | 3,467 | 3,468 | 3,469 | 3,470 | 3,471 | 3,472 | 3,473 | 3,474 | 3,475 |
| 2-140 | 3,489 | 3,490 | 3,491 | 3,492 | 3,493 | 3,494 | 3,495 | 3,496 | 3,497 | 3,498 | 3,499 | 3,500 |
| 2-141 | 3,514 | 3,515 | 3,516 | 3,517 | 3,518 | 3,519 | 3,520 | 3,521 | 3,522 | 3,523 | 3,524 | 3,525 |
| 2-142 | 3,539 | 3,540 | 3,541 | 3,542 | 3,543 | 3,544 | 3,545 | 3,546 | 3,547 | 3,548 | 3,549 | 3,550 |
| 2-143 | 3,564 | 3,565 | 3,566 | 3,567 | 3,568 | 3,569 | 3,570 | 3,571 | 3,572 | 3,573 | 3,574 | 3,575 |
| 2-144 | 3,589 | 3,590 | 3,591 | 3,592 | 3,593 | 3,594 | 3,595 | 3,596 | 3,597 | 3,598 | 3,599 | 3,600 |
| 2-145 | 3,614 | 3,615 | 3,616 | 3,617 | 3,618 | 3,619 | 3,620 | 3,621 | 3,622 | 3,623 | 3,624 | 3,625 |
| 2-146 | 3,639 | 3,640 | 3,641 | 3,642 | 3,643 | 3,644 | 3,645 | 3,646 | 3,647 | 3,648 | 3,649 | 3,650 |
| 2-147 | 3,664 | 3,665 | 3,666 | 3,667 | 3,668 | 3,669 | 3,670 | 3,671 | 3,672 | 3,673 | 3,674 | 3,675 |
| 2-148 | 3,689 | 3,690 | 3,691 | 3,692 | 3,693 | 3,694 | 3,695 | 3,696 | 3,697 | 3,698 | 3,699 | 3,700 |
| 2-149 | 3,714 | 3,715 | 3,716 | 3,717 | 3,718 | 3,719 | 3,720 | 3,721 | 3,722 | 3,723 | 3,724 | 3,725 |
| 2-150 | 3,739 | 3,740 | 3,741 | 3,742 | 3,743 | 3,744 | 3,745 | 3,746 | 3,747 | 3,748 | 3,749 | 3,750 |
| 2-151 | 3,764 | 3,765 | 3,766 | 3,767 | 3,768 | 3,769 | 3,770 | 3,771 | 3,772 | 3,773 | 3,774 | 3,775 |
| 2-152 | 3,789 | 3,790 | 3,791 | 3,792 | 3,793 | 3,794 | 3,795 | 3,796 | 3,797 | 3,798 | 3,799 | 3,800 |
| 2-153 | 3,814 | 3,815 | 3,816 | 3,817 | 3,818 | 3,819 | 3,820 | 3,821 | 3,822 | 3,823 | 3,824 | 3,825 |
| 2-154 | 3,839 | 3,840 | 3,841 | 3,842 | 3,843 | 3,844 | 3,845 | 3,846 | 3,847 | 3,848 | 3,849 | 3,850 |
| 2-155 | 3,864 | 3,865 | 3,866 | 3,867 | 3,868 | 3,869 | 3,870 | 3,871 | 3,872 | 3,873 | 3,874 | 3,875 |
| 2-156 | 3,889 | 3,890 | 3,891 | 3,892 | 3,893 | 3,894 | 3,895 | 3,896 | 3,897 | 3,898 | 3,899 | 3,900 |
| 2-157 | 3,914 | 3,915 | 3,916 | 3,917 | 3,918 | 3,919 | 3,920 | 3,921 | 3,922 | 3,923 | 3,924 | 3,925 |
| 2-158 | 3,939 | 3,940 | 3,941 | 3,942 | 3,943 | 3,944 | 3,945 | 3,946 | 3,947 | 3,948 | 3,949 | 3,950 |
| 2-159 | 3,964 | 3,965 | 3,966 | 3,967 | 3,968 | 3,969 | 3,970 | 3,971 | 3,972 | 3,973 | 3,974 | 3,975 |
| 2-160 | 3,989 | 3,990 | 3,991 | 3,992 | 3,993 | 3,994 | 3,995 | 3,996 | 3,997 | 3,998 | 3,999 | 4,000 |
| 2-161 | 4,014 | 4,015 | 4,016 | 4,017 | 4,018 | 4,019 | 4,020 | 4,021 | 4,022 | 4,023 | 4,024 | 4,025 |
| 2-162 | 4,039 | 4,040 | 4,041 | 4,042 | 4,043 | 4,044 | 4,045 | 4,046 | 4,047 | 4,048 | 4,049 | 4,050 |
| 2-163 | 4,064 | 4,065 | 4,066 | 4,067 | 4,068 | 4,069 | 4,070 | 4,071 | 4,072 | 4,073 | 4,074 | 4,075 |
| 2-164 | 4,089 | 4,090 | 4,091 | 4,092 | 4,093 | 4,094 | 4,095 | 4,096 | 4,097 | 4,098 | 4,099 | 4,100 |
| 2-165 | 4,114 | 4,115 | 4,116 | 4,117 | 4,118 | 4,119 | 4,120 | 4,121 | 4,122 | 4,123 | 4,124 | 4,125 |

TABLE 4

| | | Compound represented by the formula (1) | | | | | | | | | | | | |
|---|---|---|---|---|---|---|---|---|---|---|---|---|---|---|
| | | 1-1 | 1-2 | 1-3 | 1-4 | 1-5 | 1-6 | 1-7 | 1-8 | 1-9 | 1-10 | 1-11 | 1-12 | 1-13 |
| Compound represented by the formula (2) | 2-166 | 4,126 | 4,127 | 4,128 | 4,129 | 4,130 | 4,131 | 4,132 | 4,133 | 4,134 | 4,135 | 4,136 | 4,137 | 4,138 |
| | 2-167 | 4,151 | 4,152 | 4,153 | 4,154 | 4,155 | 4,156 | 4,157 | 4,158 | 4,159 | 4,160 | 4,161 | 4,162 | 4,163 |
| | 2-168 | 4,176 | 4,177 | 4,178 | 4,179 | 4,180 | 4,181 | 4,182 | 4,183 | 4,184 | 4,185 | 4,186 | 4,187 | 4,188 |
| | 2-169 | 4,201 | 4,202 | 4,203 | 4,204 | 4,205 | 4,206 | 4,207 | 4,208 | 4,209 | 4,210 | 4,211 | 4,212 | 4,213 |
| | 2-170 | 4,226 | 4,227 | 4,228 | 4,229 | 4,230 | 4,231 | 4,232 | 4,233 | 4,234 | 4,235 | 4,236 | 4,237 | 4,238 |
| | 2-171 | 4,251 | 4,252 | 4,253 | 4,254 | 4,255 | 4,256 | 4,257 | 4,258 | 4,259 | 4,260 | 4,261 | 4,262 | 4,263 |
| | 2-172 | 4,276 | 4,277 | 4,278 | 4,279 | 4,280 | 4,281 | 4,282 | 4,283 | 4,284 | 4,285 | 4,286 | 4,287 | 4,288 |
| | 2-173 | 4,301 | 4,302 | 4,303 | 4,304 | 4,305 | 4,306 | 4,307 | 4,308 | 4,309 | 4,310 | 4,311 | 4,312 | 4,313 |
| | 2-174 | 4,326 | 4,327 | 4,328 | 4,329 | 4,330 | 4,331 | 4,332 | 4,333 | 4,334 | 4,335 | 4,336 | 4,337 | 4,338 |
| | 2-175 | 4,351 | 4,352 | 4,353 | 4,354 | 4,355 | 4,356 | 4,357 | 4,358 | 4,359 | 4,360 | 4,361 | 4,362 | 4,363 |
| | 2-176 | 4,376 | 4,377 | 4,378 | 4,379 | 4,380 | 4,381 | 4,382 | 4,383 | 4,384 | 4,385 | 4,386 | 4,387 | 4,388 |
| | 2-177 | 4,401 | 4,402 | 4,403 | 4,404 | 4,405 | 4,406 | 4,407 | 4,408 | 4,409 | 4,410 | 4,411 | 4,412 | 4,413 |
| | 2-178 | 4,426 | 4,427 | 4,428 | 4,429 | 4,430 | 4,431 | 4,432 | 4,433 | 4,434 | 4,435 | 4,436 | 4,437 | 4,438 |
| | 2-179 | 4,451 | 4,452 | 4,453 | 4,454 | 4,455 | 4,456 | 4,457 | 4,458 | 4,459 | 4,460 | 4,461 | 4,462 | 4,463 |
| | 2-180 | 4,476 | 4,477 | 4,478 | 4,479 | 4,480 | 4,481 | 4,482 | 4,483 | 4,484 | 4,485 | 4,486 | 4,487 | 4,488 |
| | 2-181 | 4,501 | 4,502 | 4,503 | 4,504 | 4,505 | 4,506 | 4,507 | 4,508 | 4,509 | 4,510 | 4,511 | 4,512 | 4,513 |
| | 2-182 | 4,526 | 4,527 | 4,528 | 4,529 | 4,530 | 4,531 | 4,532 | 4,533 | 4,534 | 4,535 | 4,536 | 4,537 | 4,538 |
| | 2-183 | 4,551 | 4,552 | 4,553 | 4,554 | 4,555 | 4,556 | 4,557 | 4,558 | 4,559 | 4,560 | 4,561 | 4,562 | 4,563 |
| | 2-184 | 4,576 | 4,577 | 4,578 | 4,579 | 4,580 | 4,581 | 4,582 | 4,583 | 4,584 | 4,585 | 4,586 | 4,587 | 4,588 |
| | 2-185 | 4,601 | 4,602 | 4,603 | 4,604 | 4,605 | 4,606 | 4,607 | 4,608 | 4,609 | 4,610 | 4,611 | 4,612 | 4,613 |
| | 2-186 | 4,626 | 4,627 | 4,628 | 4,629 | 4,630 | 4,631 | 4,632 | 4,633 | 4,634 | 4,635 | 4,636 | 4,637 | 4,638 |
| | 2-187 | 4,651 | 4,652 | 4,653 | 4,654 | 4,655 | 4,656 | 4,657 | 4,658 | 4,659 | 4,660 | 4,661 | 4,662 | 4,663 |
| | 2-188 | 4,676 | 4,677 | 4,678 | 4,679 | 4,680 | 4,681 | 4,682 | 4,683 | 4,684 | 4,685 | 4,686 | 4,687 | 4,688 |
| | 2-189 | 4,701 | 4,702 | 4,703 | 4,704 | 4,705 | 4,706 | 4,707 | 4,708 | 4,709 | 4,710 | 4,711 | 4,712 | 4,713 |
| | 2-190 | 4,726 | 4,727 | 4,728 | 4,729 | 4,730 | 4,731 | 4,732 | 4,733 | 4,734 | 4,735 | 4,736 | 4,737 | 4,738 |
| | 2-191 | 4,751 | 4,752 | 4,753 | 4,754 | 4,755 | 4,756 | 4,757 | 4,758 | 4,759 | 4,760 | 4,761 | 4,762 | 4,763 |
| | 2-192 | 4,776 | 4,777 | 4,778 | 4,779 | 4,780 | 4,781 | 4,782 | 4,783 | 4,784 | 4,785 | 4,786 | 4,787 | 4,788 |
| | 2-193 | 4,801 | 4,802 | 4,803 | 4,804 | 4,805 | 4,806 | 4,807 | 4,808 | 4,809 | 4,810 | 4,811 | 4,812 | 4,813 |
| | 2-194 | 4,826 | 4,827 | 4,828 | 4,829 | 4,830 | 4,831 | 4,832 | 4,833 | 4,834 | 4,835 | 4,836 | 4,837 | 4,838 |
| | 2-195 | 4,851 | 4,852 | 4,853 | 4,854 | 4,855 | 4,856 | 4,857 | 4,858 | 4,859 | 4,860 | 4,861 | 4,862 | 4,863 |
| | 2-196 | 4,876 | 4,877 | 4,878 | 4,879 | 4,880 | 4,881 | 4,882 | 4,883 | 4,884 | 4,885 | 4,886 | 4,887 | 4,888 |

TABLE 4-continued

| | | | | | | | | | | | | | |
|---|---|---|---|---|---|---|---|---|---|---|---|---|---|
| 2-197 | 4,901 | 4,902 | 4,903 | 4,904 | 4,905 | 4,906 | 4,907 | 4,908 | 4,909 | 4,910 | 4,911 | 4,912 | 4,913 |
| 2-198 | 4,926 | 4,927 | 4,928 | 4,929 | 4,930 | 4,931 | 4,932 | 4,933 | 4,934 | 4,935 | 4,936 | 4,937 | 4,938 |
| 2-199 | 4,951 | 4,952 | 4,953 | 4,954 | 4,955 | 4,956 | 4,957 | 4,958 | 4,959 | 4,960 | 4,961 | 4,962 | 4,963 |
| 2-200 | 4,976 | 4,977 | 4,978 | 4,979 | 4,980 | 4,981 | 4,982 | 4,983 | 4,984 | 4,985 | 4,986 | 4,987 | 4,988 |
| 2-201 | 5,001 | 5,002 | 5,003 | 5,004 | 5,005 | 5,006 | 5,007 | 5,008 | 5,009 | 5,010 | 5,011 | 5,012 | 5,013 |
| 2-202 | 5,026 | 5,027 | 5,028 | 5,029 | 5,030 | 5,031 | 5,032 | 5,033 | 5,034 | 5,035 | 5,036 | 5,037 | 5,038 |
| 2-203 | 5,051 | 5,052 | 5,053 | 5,054 | 5,055 | 5,056 | 5,057 | 5,058 | 5,059 | 5,060 | 5,061 | 5,062 | 5,063 |
| 2-204 | 5,076 | 5,077 | 5,078 | 5,079 | 5,080 | 5,081 | 5,082 | 5,083 | 5,084 | 5,085 | 5,086 | 5,087 | 5,088 |
| 2-205 | 5,101 | 5,102 | 5,103 | 5,104 | 5,105 | 5,106 | 5,107 | 5,108 | 5,109 | 5,110 | 5,111 | 5,112 | 5,113 |
| 2-206 | 5,126 | 5,127 | 5,128 | 5,129 | 5,130 | 5,131 | 5,132 | 5,133 | 5,134 | 5,135 | 5,136 | 5,137 | 5,138 |
| 2-207 | 5,151 | 5,152 | 5,153 | 5,154 | 5,155 | 5,156 | 5,157 | 5,158 | 5,159 | 5,160 | 5,161 | 5,162 | 5,163 |
| 2-208 | 5,176 | 5,177 | 5,178 | 5,179 | 5,180 | 5,181 | 5,182 | 5,183 | 5,184 | 5,185 | 5,186 | 5,187 | 5,188 |
| 2-209 | 5,201 | 5,202 | 5,203 | 5,204 | 5,205 | 5,206 | 5,207 | 5,208 | 5,209 | 5,210 | 5,211 | 5,212 | 5,213 |
| 2-210 | 5,226 | 5,227 | 5,228 | 5,229 | 5,230 | 5,231 | 5,232 | 5,233 | 5,234 | 5,235 | 5,236 | 5,237 | 5,238 |
| 2-211 | 5,251 | 5,252 | 5,253 | 5,254 | 5,255 | 5,256 | 5,257 | 5,258 | 5,259 | 5,260 | 5,261 | 5,262 | 5,263 |
| 2-212 | 5,276 | 5,277 | 5,278 | 5,279 | 5,280 | 5,281 | 5,282 | 5,283 | 5,284 | 5,285 | 5,286 | 5,287 | 5,288 |
| 2-213 | 5,301 | 5,302 | 5,303 | 5,304 | 5,305 | 5,306 | 5,307 | 5,308 | 5,309 | 5,310 | 5,311 | 5,312 | 5,313 |
| 2-214 | 5,326 | 5,327 | 5,328 | 5,329 | 5,330 | 5,331 | 5,332 | 5,333 | 5,334 | 5,335 | 5,336 | 5,337 | 5,338 |
| 2-215 | 5,351 | 5,352 | 5,353 | 5,354 | 5,355 | 5,356 | 5,357 | 5,358 | 5,359 | 5,360 | 5,361 | 5,362 | 5,363 |
| 2-216 | 5,376 | 5,377 | 5,378 | 5,379 | 5,380 | 5,381 | 5,382 | 5,383 | 5,384 | 5,385 | 5,386 | 5,387 | 5,388 |
| 2-217 | 5,401 | 5,402 | 5,403 | 5,404 | 5,405 | 5,406 | 5,407 | 5,408 | 5,409 | 5,410 | 5,411 | 5,412 | 5,413 |
| 2-218 | 5,426 | 5,427 | 5,428 | 5,429 | 5,430 | 5,431 | 5,432 | 5,433 | 5,434 | 5,435 | 5,436 | 5,437 | 5,438 |
| 2-219 | 5,451 | 5,452 | 5,453 | 5,454 | 5,455 | 5,456 | 5,457 | 5,458 | 5,459 | 5,460 | 5,461 | 5,462 | 5,463 |
| 2-220 | 5,476 | 5,477 | 5,478 | 5,479 | 5,480 | 5,481 | 5,482 | 5,483 | 5,484 | 5,485 | 5,486 | 5,487 | 5,488 |

| | | Compound represented by the formula (1) | | | | | | | | | | | |
|---|---|---|---|---|---|---|---|---|---|---|---|---|---|
| | | 1-14 | 1-15 | 1-16 | 1-17 | 1-18 | 1-19 | 1-20 | 1-21 | 1-22 | 1-23 | 1-24 | 1-25 |
| Compound represented by the formula (2) | 2-166 | 4,139 | 4,140 | 4,141 | 4,142 | 4,143 | 4,144 | 4,145 | 4,146 | 4,147 | 4,148 | 4,149 | 4,150 |
| | 2-167 | 4,164 | 4,165 | 4,166 | 4,167 | 4,168 | 4,169 | 4,170 | 4,171 | 4,172 | 4,173 | 4,174 | 4,175 |
| | 2-168 | 4,189 | 4,190 | 4,191 | 4,192 | 4,193 | 4,194 | 4,195 | 4,196 | 4,197 | 4,198 | 4,199 | 4,200 |
| | 2-169 | 4,214 | 4,215 | 4,216 | 4,217 | 4,218 | 4,219 | 4,220 | 4,221 | 4,222 | 4,223 | 4,224 | 4,225 |
| | 2-170 | 4,239 | 4,240 | 4,241 | 4,242 | 4,243 | 4,244 | 4,245 | 4,246 | 4,247 | 4,248 | 4,249 | 4,250 |
| | 2-171 | 4,264 | 4,265 | 4,266 | 4,267 | 4,268 | 4,269 | 4,270 | 4,271 | 4,272 | 4,273 | 4,274 | 4,275 |
| | 2-172 | 4,289 | 4,290 | 4,291 | 4,292 | 4,293 | 4,294 | 4,295 | 4,296 | 4,297 | 4,298 | 4,299 | 4,300 |
| | 2-173 | 4,314 | 4,315 | 4,316 | 4,317 | 4,318 | 4,319 | 4,320 | 4,321 | 4,322 | 4,323 | 4,324 | 4,325 |
| | 2-174 | 4,339 | 4,340 | 4,341 | 4,342 | 4,343 | 4,344 | 4,345 | 4,346 | 4,347 | 4,348 | 4,349 | 4,350 |
| | 2-175 | 4,364 | 4,365 | 4,366 | 4,367 | 4,368 | 4,369 | 4,370 | 4,371 | 4,372 | 4,373 | 4,374 | 4,375 |
| | 2-176 | 4,389 | 4,390 | 4,391 | 4,392 | 4,393 | 4,394 | 4,395 | 4,396 | 4,397 | 4,398 | 4,399 | 4,400 |
| | 2-177 | 4,414 | 4,415 | 4,416 | 4,417 | 4,418 | 4,419 | 4,420 | 4,421 | 4,422 | 4,423 | 4,424 | 4,425 |
| | 2-178 | 4,439 | 4,440 | 4,441 | 4,442 | 4,443 | 4,444 | 4,445 | 4,446 | 4,447 | 4,448 | 4,449 | 4,450 |
| | 2-179 | 4,464 | 4,465 | 4,466 | 4,467 | 4,468 | 4,469 | 4,470 | 4,471 | 4,472 | 4,473 | 4,474 | 4,475 |
| | 2-180 | 4,489 | 4,490 | 4,491 | 4,492 | 4,493 | 4,494 | 4,495 | 4,496 | 4,497 | 4,498 | 4,499 | 4,500 |
| | 2-181 | 4,514 | 4,515 | 4,516 | 4,517 | 4,518 | 4,519 | 4,520 | 4,521 | 4,522 | 4,523 | 4,524 | 4,525 |
| | 2-182 | 4,539 | 4,540 | 4,541 | 4,542 | 4,543 | 4,544 | 4,545 | 4,546 | 4,547 | 4,548 | 4,549 | 4,550 |
| | 2-183 | 4,564 | 4,565 | 4,566 | 4,567 | 4,568 | 4,569 | 4,570 | 4,571 | 4,572 | 4,573 | 4,574 | 4,575 |
| | 2-184 | 4,589 | 4,590 | 4,591 | 4,592 | 4,593 | 4,594 | 4,595 | 4,596 | 4,597 | 4,598 | 4,599 | 4,600 |
| | 2-185 | 4,614 | 4,615 | 4,616 | 4,617 | 4,618 | 4,619 | 4,620 | 4,621 | 4,622 | 4,623 | 4,624 | 4,625 |
| | 2-186 | 4,639 | 4,640 | 4,641 | 4,642 | 4,643 | 4,644 | 4,645 | 4,646 | 4,647 | 4,648 | 4,649 | 4,650 |
| | 2-187 | 4,664 | 4,665 | 4,666 | 4,667 | 4,668 | 4,669 | 4,670 | 4,671 | 4,672 | 4,673 | 4,674 | 4,675 |
| | 2-188 | 4,689 | 4,690 | 4,691 | 4,692 | 4,693 | 4,694 | 4,695 | 4,696 | 4,697 | 4,698 | 4,699 | 4,700 |
| | 2-189 | 4,714 | 4,715 | 4,716 | 4,717 | 4,718 | 4,719 | 4,720 | 4,721 | 4,722 | 4,723 | 4,724 | 4,725 |
| | 2-190 | 4,739 | 4,740 | 4,741 | 4,742 | 4,743 | 4,744 | 4,745 | 4,746 | 4,747 | 4,748 | 4,749 | 4,750 |
| | 2-191 | 4,764 | 4,765 | 4,766 | 4,767 | 4,768 | 4,769 | 4,770 | 4,771 | 4,772 | 4,773 | 4,774 | 4,775 |
| | 2-192 | 4,789 | 4,790 | 4,791 | 4,792 | 4,793 | 4,794 | 4,795 | 4,796 | 4,797 | 4,798 | 4,799 | 4,800 |
| | 2-193 | 4,814 | 4,815 | 4,816 | 4,817 | 4,818 | 4,819 | 4,820 | 4,821 | 4,822 | 4,823 | 4,824 | 4,825 |
| | 2-194 | 4,839 | 4,840 | 4,841 | 4,842 | 4,843 | 4,844 | 4,845 | 4,846 | 4,847 | 4,848 | 4,849 | 4,850 |
| | 2-195 | 4,864 | 4,865 | 4,866 | 4,867 | 4,868 | 4,869 | 4,870 | 4,871 | 4,872 | 4,873 | 4,874 | 4,875 |
| | 2-196 | 4,889 | 4,890 | 4,891 | 4,892 | 4,893 | 4,894 | 4,895 | 4,896 | 4,897 | 4,898 | 4,899 | 4,900 |
| | 2-197 | 4,914 | 4,915 | 4,916 | 4,917 | 4,918 | 4,919 | 4,920 | 4,921 | 4,922 | 4,923 | 4,924 | 4,925 |
| | 2-198 | 4,939 | 4,940 | 4,941 | 4,942 | 4,943 | 4,944 | 4,945 | 4,946 | 4,947 | 4,948 | 4,949 | 4,950 |
| | 2-199 | 4,964 | 4,965 | 4,966 | 4,967 | 4,968 | 4,969 | 4,970 | 4,971 | 4,972 | 4,973 | 4,974 | 4,975 |
| | 2-200 | 4,989 | 4,990 | 4,991 | 4,992 | 4,993 | 4,994 | 4,995 | 4,996 | 4,997 | 4,998 | 4,999 | 5,000 |
| | 2-201 | 5,014 | 5,015 | 5,016 | 5,017 | 5,018 | 5,019 | 5,020 | 5,021 | 5,022 | 5,023 | 5,024 | 5,025 |
| | 2-202 | 5,039 | 5,040 | 5,041 | 5,042 | 5,043 | 5,044 | 5,045 | 5,046 | 5,047 | 5,048 | 5,049 | 5,050 |
| | 2-203 | 5,064 | 5,065 | 5,066 | 5,067 | 5,068 | 5,069 | 5,070 | 5,071 | 5,072 | 5,073 | 5,074 | 5,075 |
| | 2-204 | 5,089 | 5,090 | 5,091 | 5,092 | 5,093 | 5,094 | 5,095 | 5,096 | 5,097 | 5,098 | 5,099 | 5,100 |
| | 2-205 | 5,114 | 5,115 | 5,116 | 5,117 | 5,118 | 5,119 | 5,120 | 5,121 | 5,122 | 5,123 | 5,124 | 5,125 |
| | 2-206 | 5,139 | 5,140 | 5,141 | 5,142 | 5,143 | 5,144 | 5,145 | 5,146 | 5,147 | 5,148 | 5,149 | 5,150 |
| | 2-207 | 5,164 | 5,165 | 5,166 | 5,167 | 5,168 | 5,169 | 5,170 | 5,171 | 5,172 | 5,173 | 5,174 | 5,175 |
| | 2-208 | 5,189 | 5,190 | 5,191 | 5,192 | 5,193 | 5,194 | 5,195 | 5,196 | 5,197 | 5,198 | 5,199 | 5,200 |
| | 2-209 | 5,214 | 5,215 | 5,216 | 5,217 | 5,218 | 5,219 | 5,220 | 5,221 | 5,222 | 5,223 | 5,224 | 5,225 |
| | 2-210 | 5,239 | 5,240 | 5,241 | 5,242 | 5,243 | 5,244 | 5,245 | 5,246 | 5,247 | 5,248 | 5,249 | 5,250 |
| | 2-211 | 5,264 | 5,265 | 5,266 | 5,267 | 5,268 | 5,269 | 5,270 | 5,271 | 5,272 | 5,273 | 5,274 | 5,275 |
| | 2-212 | 5,289 | 5,290 | 5,291 | 5,292 | 5,293 | 5,294 | 5,295 | 5,296 | 5,297 | 5,298 | 5,299 | 5,300 |
| | 2-213 | 5,314 | 5,315 | 5,316 | 5,317 | 5,318 | 5,319 | 5,320 | 5,321 | 5,322 | 5,323 | 5,324 | 5,325 |
| | 2-214 | 5,339 | 5,340 | 5,341 | 5,342 | 5,343 | 5,344 | 5,345 | 5,346 | 5,347 | 5,348 | 5,349 | 5,350 |
| | 2-215 | 5,364 | 5,365 | 5,366 | 5,367 | 5,368 | 5,369 | 5,370 | 5,371 | 5,372 | 5,373 | 5,374 | 5,375 |
| | 2-216 | 5,389 | 5,390 | 5,391 | 5,392 | 5,393 | 5,394 | 5,395 | 5,396 | 5,397 | 5,398 | 5,399 | 5,400 |

TABLE 4-continued

| | | | | | | | | | | | | |
|---|---|---|---|---|---|---|---|---|---|---|---|---|
| 2-217 | 5,414 | 5,415 | 5,416 | 5,417 | 5,418 | 5,419 | 5,420 | 5,421 | 5,422 | 5,423 | 5,424 | 5,425 |
| 2-218 | 5,439 | 5,440 | 5,441 | 5,442 | 5,443 | 5,444 | 5,445 | 5,446 | 5,447 | 5,448 | 5,449 | 5,450 |
| 2-219 | 5,464 | 5,465 | 5,466 | 5,467 | 5,468 | 5,469 | 5,470 | 5,471 | 5,472 | 5,473 | 5,474 | 5,475 |
| 2-220 | 5,489 | 5,490 | 5,491 | 5,492 | 5,493 | 5,494 | 5,495 | 5,496 | 5,497 | 5,498 | 5,499 | 5,500 |

TABLE 5

| | | Compound represented by the formula (1) | | | | | | | | | | | | |
|---|---|---|---|---|---|---|---|---|---|---|---|---|---|---|
| | | 1-1 | 1-2 | 1-3 | 1-4 | 1-5 | 1-6 | 1-7 | 1-8 | 1-9 | 1-10 | 1-11 | 1-12 | 1-13 |
| Compound | 2-221 | 5,501 | 5,502 | 5,503 | 5,504 | 5,505 | 5,506 | 5,507 | 5,508 | 5,509 | 5,510 | 5,511 | 5,512 | 5,513 |
| represented | 2-222 | 5,526 | 5,527 | 5,528 | 5,529 | 5,530 | 5,531 | 5,532 | 5,533 | 5,534 | 5,535 | 5,536 | 5,537 | 5,538 |
| by the | 2-223 | 5,551 | 5,552 | 5,553 | 5,554 | 5,555 | 5,556 | 5,557 | 5,558 | 5,559 | 5,560 | 5,561 | 5,562 | 5,563 |
| formula (2) | 2-224 | 5,576 | 5,577 | 5,578 | 5,579 | 5,580 | 5,581 | 5,582 | 5,583 | 5,584 | 5,585 | 5,586 | 5,587 | 5,588 |
| | 2-225 | 5,601 | 5,602 | 5,603 | 5,604 | 5,605 | 5,606 | 5,607 | 5,608 | 5,609 | 5,610 | 5,611 | 5,612 | 5,613 |
| | 2-226 | 5,626 | 5,627 | 5,628 | 5,629 | 5,630 | 5,631 | 5,632 | 5,633 | 5,634 | 5,635 | 5,636 | 5,637 | 5,638 |
| | 2-227 | 5,651 | 5,652 | 5,653 | 5,654 | 5,655 | 5,656 | 5,657 | 5,658 | 5,659 | 5,660 | 5,661 | 5,662 | 5,663 |
| | 2-228 | 5,676 | 5,677 | 5,678 | 5,679 | 5,680 | 5,681 | 5,682 | 5,683 | 5,684 | 5,685 | 5,686 | 5,687 | 5,688 |
| | 2-229 | 5,701 | 5,702 | 5,703 | 5,704 | 5,705 | 5,706 | 5,707 | 5,708 | 5,709 | 5,710 | 5,711 | 5,712 | 5,713 |
| | 2-230 | 5,726 | 5,727 | 5,728 | 5,729 | 5,730 | 5,731 | 5,732 | 5,733 | 5,734 | 5,735 | 5,736 | 5,737 | 5,738 |
| | 2-231 | 5,751 | 5,752 | 5,753 | 5,754 | 5,755 | 5,756 | 5,757 | 5,758 | 5,759 | 5,760 | 5,761 | 5,762 | 5,763 |
| | 2-232 | 5,776 | 5,777 | 5,778 | 5,779 | 5,780 | 5,781 | 5,782 | 5,783 | 5,784 | 5,785 | 5,786 | 5,787 | 5,788 |
| | 2-233 | 5,801 | 5,802 | 5,803 | 5,804 | 5,805 | 5,806 | 5,807 | 5,808 | 5,809 | 5,810 | 5,811 | 5,812 | 5,813 |
| | 2-234 | 5,826 | 5,827 | 5,828 | 5,829 | 5,830 | 5,831 | 5,832 | 5,833 | 5,834 | 5,835 | 5,836 | 5,837 | 5,838 |
| | 2-235 | 5,851 | 5,852 | 5,853 | 5,854 | 5,855 | 5,856 | 5,857 | 5,858 | 5,859 | 5,860 | 5,861 | 5,862 | 5,863 |
| | 2-236 | 5,876 | 5,877 | 5,878 | 5,879 | 5,880 | 5,881 | 5,882 | 5,883 | 5,884 | 5,885 | 5,886 | 5,887 | 5,888 |
| | 2-237 | 5,901 | 5,902 | 5,903 | 5,904 | 5,905 | 5,906 | 5,907 | 5,908 | 5,909 | 5,910 | 5,911 | 5,912 | 5,913 |
| | 2-238 | 5,926 | 5,927 | 5,928 | 5,929 | 5,930 | 5,931 | 5,932 | 5,933 | 5,934 | 5,935 | 5,936 | 5,937 | 5,938 |
| | 2-239 | 5,951 | 5,952 | 5,953 | 5,954 | 5,955 | 5,956 | 5,957 | 5,958 | 5,959 | 5,960 | 5,961 | 5,962 | 5,963 |
| | 2-240 | 5,976 | 5,977 | 5,978 | 5,979 | 5,980 | 5,981 | 5,982 | 5,983 | 5,984 | 5,985 | 5,986 | 5,987 | 5,988 |
| | 2-241 | 6,001 | 6,002 | 6,003 | 6,004 | 6,005 | 6,006 | 6,007 | 6,008 | 6,009 | 6,010 | 6,011 | 6,012 | 6,013 |
| | 2-242 | 6,026 | 6,027 | 6,028 | 6,029 | 6,030 | 6,031 | 6,032 | 6,033 | 6,034 | 6,035 | 6,036 | 6,037 | 6,038 |
| | 2-243 | 6,051 | 6,052 | 6,053 | 6,054 | 6,055 | 6,056 | 6,057 | 6,058 | 6,059 | 6,060 | 6,061 | 6,062 | 6,063 |
| | 2-244 | 6,076 | 6,077 | 6,078 | 6,079 | 6,080 | 6,081 | 6,082 | 6,083 | 6,084 | 6,085 | 6,086 | 6,087 | 6,088 |
| | 2-245 | 6,101 | 6,102 | 6,103 | 6,104 | 6,105 | 6,106 | 6,107 | 6,108 | 6,109 | 6,110 | 6,111 | 6,112 | 6,113 |
| | 2-246 | 6,126 | 6,127 | 6,128 | 6,129 | 6,130 | 6,131 | 6,132 | 6,133 | 6,134 | 6,135 | 6,136 | 6,137 | 6,138 |
| | 2-247 | 6,151 | 6,152 | 6,153 | 6,154 | 6,155 | 6,156 | 6,157 | 6,158 | 6,159 | 6,160 | 6,161 | 6,162 | 6,163 |
| | 2-248 | 6,176 | 6,177 | 6,178 | 6,179 | 6,180 | 6,181 | 6,182 | 6,183 | 6,184 | 6,185 | 6,186 | 6,187 | 6,188 |
| | 2-249 | 6,201 | 6,202 | 6,203 | 6,204 | 6,205 | 6,206 | 6,207 | 6,208 | 6,209 | 6,210 | 6,211 | 6,212 | 6,213 |
| | 2-250 | 6,226 | 6,227 | 6,228 | 6,229 | 6,230 | 6,231 | 6,232 | 6,233 | 6,234 | 6,235 | 6,236 | 6,237 | 6,238 |
| | 2-251 | 6,251 | 6,252 | 6,253 | 6,254 | 6,255 | 6,256 | 6,257 | 6,258 | 6,259 | 6,260 | 6,261 | 6,262 | 6,263 |
| | 2-252 | 6,276 | 6,277 | 6,278 | 6,279 | 6,280 | 6,281 | 6,282 | 6,283 | 6,284 | 6,285 | 6,286 | 6,287 | 6,288 |
| | 2-253 | 6,301 | 6,302 | 6,303 | 6,304 | 6,305 | 6,306 | 6,307 | 6,308 | 6,309 | 6,310 | 6,311 | 6,312 | 6,313 |
| | 2-254 | 6,326 | 6,327 | 6,328 | 6,329 | 6,330 | 6,331 | 6,332 | 6,333 | 6,334 | 6,335 | 6,336 | 6,337 | 6,338 |
| | 2-255 | 6,351 | 6,352 | 6,353 | 6,354 | 6,355 | 6,356 | 6,357 | 6,358 | 6,359 | 6,360 | 6,361 | 6,362 | 6,363 |
| | 2-256 | 6,376 | 6,377 | 6,378 | 6,379 | 6,380 | 6,381 | 6,382 | 6,383 | 6,384 | 6,385 | 6,386 | 6,387 | 6,388 |
| | 2-257 | 6,401 | 6,402 | 6,403 | 6,404 | 6,405 | 6,406 | 6,407 | 6,408 | 6,409 | 6,410 | 6,411 | 6,412 | 6,413 |
| | 2-258 | 6,426 | 6,427 | 6,428 | 6,429 | 6,430 | 6,431 | 6,432 | 6,433 | 6,434 | 6,435 | 6,436 | 6,437 | 6,438 |
| | 2-259 | 6,451 | 6,452 | 6,453 | 6,454 | 6,455 | 6,456 | 6,457 | 6,458 | 6,459 | 6,460 | 6,461 | 6,462 | 6,463 |
| | 2-260 | 6,476 | 6,477 | 6,478 | 6,479 | 6,480 | 6,481 | 6,482 | 6,483 | 6,484 | 6,485 | 6,486 | 6,487 | 6,488 |
| | 2-261 | 6,501 | 6,502 | 6,503 | 6,504 | 6,505 | 6,506 | 6,507 | 6,508 | 6,509 | 6,510 | 6,511 | 6,512 | 6,513 |
| | 2-262 | 6,526 | 6,527 | 6,528 | 6,529 | 6,530 | 6,531 | 6,532 | 6,533 | 6,534 | 6,535 | 6,536 | 6,537 | 6,538 |
| | 2-263 | 6,551 | 6,552 | 6,553 | 6,554 | 6,555 | 6,556 | 6,557 | 6,558 | 6,559 | 6,560 | 6,561 | 6,562 | 6,563 |
| | 2-264 | 6,576 | 6,577 | 6,578 | 6,579 | 6,580 | 6,581 | 6,582 | 6,583 | 6,584 | 6,585 | 6,586 | 6,587 | 6,588 |
| | 2-265 | 6,601 | 6,602 | 6,603 | 6,604 | 6,605 | 6,606 | 6,607 | 6,608 | 6,609 | 6,610 | 6,611 | 6,612 | 6,613 |
| | 2-266 | 6,626 | 6,627 | 6,628 | 6,629 | 6,630 | 6,631 | 6,632 | 6,633 | 6,634 | 6,635 | 6,636 | 6,637 | 6,638 |
| | 2-267 | 6,651 | 6,652 | 6,653 | 6,654 | 6,655 | 6,656 | 6,657 | 6,658 | 6,659 | 6,660 | 6,661 | 6,662 | 6,663 |
| | 2-268 | 6,676 | 6,677 | 6,678 | 6,679 | 6,680 | 6,681 | 6,682 | 6,683 | 6,684 | 6,685 | 6,686 | 6,687 | 6,688 |
| | 2-269 | 6,701 | 6,702 | 6,703 | 6,704 | 6,705 | 6,706 | 6,707 | 6,708 | 6,709 | 6,710 | 6,711 | 6,712 | 6,713 |
| | 2-270 | 6,726 | 6,727 | 6,728 | 6,729 | 6,730 | 6,731 | 6,732 | 6,733 | 6,734 | 6,735 | 6,736 | 6,737 | 6,738 |
| | 2-271 | 6,751 | 6,752 | 6,753 | 6,754 | 6,755 | 6,756 | 6,757 | 6,758 | 6,759 | 6,760 | 6,761 | 6,762 | 6,763 |
| | 2-272 | 6,776 | 6,777 | 6,778 | 6,779 | 6,780 | 6,781 | 6,782 | 6,783 | 6,784 | 6,785 | 6,786 | 6,787 | 6,788 |
| | 2-273 | 6,801 | 6,802 | 6,803 | 6,804 | 6,805 | 6,806 | 6,807 | 6,808 | 6,809 | 6,810 | 6,811 | 6,812 | 6,813 |
| | 2-274 | 6,826 | 6,827 | 6,828 | 6,829 | 6,830 | 6,831 | 6,832 | 6,833 | 6,834 | 6,835 | 6,836 | 6,837 | 6,838 |
| | 2-275 | 6,851 | 6,852 | 6,853 | 6,854 | 6,855 | 6,856 | 6,857 | 6,858 | 6,859 | 6,860 | 6,861 | 6,862 | 6,863 |

| | | Compound represented by the formula (1) | | | | | | | | | | | |
|---|---|---|---|---|---|---|---|---|---|---|---|---|---|
| | | 1-14 | 1-15 | 1-16 | 1-17 | 1-18 | 1-19 | 1-20 | 1-21 | 1-22 | 1-23 | 1-24 | 1-25 |
| Compound | 2-221 | 5,514 | 5,515 | 5,516 | 5,517 | 5,518 | 5,519 | 5,520 | 5,521 | 5,522 | 5,523 | 5,524 | 5,525 |
| represented | 2-222 | 5,539 | 5,540 | 5,541 | 5,542 | 5,543 | 5,544 | 5,545 | 5,546 | 5,547 | 5,548 | 5,549 | 5,550 |
| by the | 2-223 | 5,564 | 5,565 | 5,566 | 5,567 | 5,568 | 5,569 | 5,570 | 5,571 | 5,572 | 5,573 | 5,574 | 5,575 |
| formula (2) | 2-224 | 5,589 | 5,590 | 5,591 | 5,592 | 5,593 | 5,594 | 5,595 | 5,596 | 5,597 | 5,598 | 5,599 | 5,600 |
| | 2-225 | 5,614 | 5,615 | 5,616 | 5,617 | 5,618 | 5,619 | 5,620 | 5,621 | 5,622 | 5,623 | 5,624 | 5,625 |
| | 2-226 | 5,639 | 5,640 | 5,641 | 5,642 | 5,643 | 5,644 | 5,645 | 5,646 | 5,647 | 5,648 | 5,649 | 5,650 |

TABLE 5-continued

| | | | | | | | | | | | | |
|---|---|---|---|---|---|---|---|---|---|---|---|---|
| 2-227 | 5,664 | 5,665 | 5,666 | 5,667 | 5,668 | 5,669 | 5,670 | 5,671 | 5,672 | 5,673 | 5,674 | 5,675 |
| 2-228 | 5,689 | 5,690 | 5,691 | 5,692 | 5,693 | 5,694 | 5,695 | 5,696 | 5,697 | 5,698 | 5,699 | 5,700 |
| 2-229 | 5,714 | 5,715 | 5,716 | 5,717 | 5,718 | 5,719 | 5,720 | 5,721 | 5,722 | 5,723 | 5,724 | 5,725 |
| 2-230 | 5,739 | 5,740 | 5,741 | 5,742 | 5,743 | 5,744 | 5,745 | 5,746 | 5,747 | 5,748 | 5,749 | 5,750 |
| 2-231 | 5,764 | 5,765 | 5,766 | 5,767 | 5,768 | 5,769 | 5,770 | 5,771 | 5,772 | 5,773 | 5,774 | 5,775 |
| 2-232 | 5,789 | 5,790 | 5,791 | 5,792 | 5,793 | 5,794 | 5,795 | 5,796 | 5,797 | 5,798 | 5,799 | 5,800 |
| 2-233 | 5,814 | 5,815 | 5,816 | 5,817 | 5,818 | 5,819 | 5,820 | 5,821 | 5,822 | 5,823 | 5,824 | 5,825 |
| 2-234 | 5,839 | 5,840 | 5,841 | 5,842 | 5,843 | 5,844 | 5,845 | 5,846 | 5,847 | 5,848 | 5,849 | 5,850 |
| 2-235 | 5,864 | 5,865 | 5,866 | 5,867 | 5,868 | 5,869 | 5,870 | 5,871 | 5,872 | 5,873 | 5,874 | 5,875 |
| 2-236 | 5,889 | 5,890 | 5,891 | 5,892 | 5,893 | 5,894 | 5,895 | 5,896 | 5,897 | 5,898 | 5,899 | 5,900 |
| 2-237 | 5,914 | 5,915 | 5,916 | 5,917 | 5,918 | 5,919 | 5,920 | 5,921 | 5,922 | 5,923 | 5,924 | 5,925 |
| 2-238 | 5,939 | 5,940 | 5,941 | 5,942 | 5,943 | 5,944 | 5,945 | 5,946 | 5,947 | 5,948 | 5,949 | 5,950 |
| 2-239 | 5,964 | 5,965 | 5,966 | 5,967 | 5,968 | 5,969 | 5,970 | 5,971 | 5,972 | 5,973 | 5,974 | 5,975 |
| 2-240 | 5,989 | 5,990 | 5,991 | 5,992 | 5,993 | 5,994 | 5,995 | 5,996 | 5,997 | 5,998 | 5,999 | 6,000 |
| 2-241 | 6,014 | 6,015 | 6,016 | 6,017 | 6,018 | 6,019 | 6,020 | 6,021 | 6,022 | 6,023 | 6,024 | 6,025 |
| 2-242 | 6,039 | 6,040 | 6,041 | 6,042 | 6,043 | 6,044 | 6,045 | 6,046 | 6,047 | 6,048 | 6,049 | 6,050 |
| 2-243 | 6,064 | 6,065 | 6,066 | 6,067 | 6,068 | 6,069 | 6,070 | 6,071 | 6,072 | 6,073 | 6,074 | 6,075 |
| 2-244 | 6,089 | 6,090 | 6,091 | 6,092 | 6,093 | 6,094 | 6,095 | 6,096 | 6,097 | 6,098 | 6,099 | 6,100 |
| 2-245 | 6,114 | 6,115 | 6,116 | 6,117 | 6,118 | 6,119 | 6,120 | 6,121 | 6,122 | 6,123 | 6,124 | 6,125 |
| 2-246 | 6,139 | 6,140 | 6,141 | 6,142 | 6,143 | 6,144 | 6,145 | 6,146 | 6,147 | 6,148 | 6,149 | 6,150 |
| 2-247 | 6,164 | 6,165 | 6,166 | 6,167 | 6,168 | 6,169 | 6,170 | 6,171 | 6,172 | 6,173 | 6,174 | 6,175 |
| 2-248 | 6,189 | 6,190 | 6,191 | 6,192 | 6,193 | 6,194 | 6,195 | 6,196 | 6,197 | 6,198 | 6,199 | 6,200 |
| 2-249 | 6,214 | 6,215 | 6,216 | 6,217 | 6,218 | 6,219 | 6,220 | 6,221 | 6,222 | 6,223 | 6,224 | 6,225 |
| 2-250 | 6,239 | 6,240 | 6,241 | 6,242 | 6,243 | 6,244 | 6,245 | 6,246 | 6,247 | 6,248 | 6,249 | 6,250 |
| 2-251 | 6,264 | 6,265 | 6,266 | 6,267 | 6,268 | 6,269 | 6,270 | 6,271 | 6,272 | 6,273 | 6,274 | 6,275 |
| 2-252 | 6,289 | 6,290 | 6,291 | 6,292 | 6,293 | 6,294 | 6,295 | 6,296 | 6,297 | 6,298 | 6,299 | 6,300 |
| 2-253 | 6,314 | 6,315 | 6,316 | 6,317 | 6,318 | 6,319 | 6,320 | 6,321 | 6,322 | 6,323 | 6,324 | 6,325 |
| 2-254 | 6,339 | 6,340 | 6,341 | 6,342 | 6,343 | 6,344 | 6,345 | 6,346 | 6,347 | 6,348 | 6,349 | 6,350 |
| 2-255 | 6,364 | 6,365 | 6,366 | 6,367 | 6,368 | 6,369 | 6,370 | 6,371 | 6,372 | 6,373 | 6,374 | 6,375 |
| 2-256 | 6,389 | 6,390 | 6,391 | 6,392 | 6,393 | 6,394 | 6,395 | 6,396 | 6,397 | 6,398 | 6,399 | 6,400 |
| 2-257 | 6,414 | 6,415 | 6,416 | 6,417 | 6,418 | 6,419 | 6,420 | 6,421 | 6,422 | 6,423 | 6,424 | 6,425 |
| 2-258 | 6,439 | 6,440 | 6,441 | 6,442 | 6,443 | 6,444 | 6,445 | 6,446 | 6,447 | 6,448 | 6,449 | 6,450 |
| 2-259 | 6,464 | 6,465 | 6,466 | 6,467 | 6,468 | 6,469 | 6,470 | 6,471 | 6,472 | 6,473 | 6,474 | 6,475 |
| 2-260 | 6,489 | 6,490 | 6,491 | 6,492 | 6,493 | 6,494 | 6,495 | 6,496 | 6,497 | 6,498 | 6,499 | 6,500 |
| 2-261 | 6,514 | 6,515 | 6,516 | 6,517 | 6,518 | 6,519 | 6,520 | 6,521 | 6,522 | 6,523 | 6,524 | 6,525 |
| 2-262 | 6,539 | 6,540 | 6,541 | 6,542 | 6,543 | 6,544 | 6,545 | 6,546 | 6,547 | 6,548 | 6,549 | 6,550 |
| 2-263 | 6,564 | 6,565 | 6,566 | 6,567 | 6,568 | 6,569 | 6,570 | 6,571 | 6,572 | 6,573 | 6,574 | 6,575 |
| 2-264 | 6,589 | 6,590 | 6,591 | 6,592 | 6,593 | 6,594 | 6,595 | 6,596 | 6,597 | 6,598 | 6,599 | 6,600 |
| 2-265 | 6,614 | 6,615 | 6,616 | 6,617 | 6,618 | 6,619 | 6,620 | 6,621 | 6,622 | 6,623 | 6,624 | 6,625 |
| 2-266 | 6,639 | 6,640 | 6,641 | 6,642 | 6,643 | 6,644 | 6,645 | 6,646 | 6,647 | 6,648 | 6,649 | 6,650 |
| 2-267 | 6,664 | 6,665 | 6,666 | 6,667 | 6,668 | 6,669 | 6,670 | 6,671 | 6,672 | 6,673 | 6,674 | 6,675 |
| 2-268 | 6,689 | 6,690 | 6,691 | 6,692 | 6,693 | 6,694 | 6,695 | 6,696 | 6,697 | 6,698 | 6,699 | 6,700 |
| 2-269 | 6,714 | 6,715 | 6,716 | 6,717 | 6,718 | 6,719 | 6,720 | 6,721 | 6,722 | 6,723 | 6,724 | 6,725 |
| 2-270 | 6,739 | 6,740 | 6,741 | 6,742 | 6,743 | 6,744 | 6,745 | 6,746 | 6,747 | 6,748 | 6,749 | 6,750 |
| 2-271 | 6,764 | 6,765 | 6,766 | 6,767 | 6,768 | 6,769 | 6,770 | 6,771 | 6,772 | 6,773 | 6,774 | 6,775 |
| 2-272 | 6,789 | 6,790 | 6,791 | 6,792 | 6,793 | 6,794 | 6,795 | 6,796 | 6,797 | 6,798 | 6,799 | 6,800 |
| 2-273 | 6,814 | 6,815 | 6,816 | 6,817 | 6,818 | 6,819 | 6,820 | 6,821 | 6,822 | 6,823 | 6,824 | 6,825 |
| 2-274 | 6,839 | 6,840 | 6,841 | 6,842 | 6,843 | 6,844 | 6,845 | 6,846 | 6,847 | 6,848 | 6,849 | 6,850 |
| 2-275 | 6,864 | 6,865 | 6,866 | 6,867 | 6,868 | 6,869 | 6,870 | 6,871 | 6,872 | 6,873 | 6,874 | 6,875 |

TABLE 6

| | | Compound represented by the formula (1) | | | | | | | | | | | | |
|---|---|---|---|---|---|---|---|---|---|---|---|---|---|---|
| | | 1-1 | 1-2 | 1-3 | 1-4 | 1-5 | 1-6 | 1-7 | 1-8 | 1-9 | 1-10 | 1-11 | 1-12 | 1-13 |
| Compound represented by the formula (2) | 2-276 | 6,876 | 6,877 | 6,878 | 6,879 | 6,880 | 6,881 | 6,882 | 6,883 | 6,884 | 6,885 | 6,886 | 6,887 | 6,888 |
| | 2-277 | 6,901 | 6,902 | 6,903 | 6,904 | 6,905 | 6,906 | 6,907 | 6,908 | 6,909 | 6,910 | 6,911 | 6,912 | 6,913 |
| | 2-278 | 6,926 | 6,927 | 6,928 | 6,929 | 6,930 | 6,931 | 6,932 | 6,933 | 6,934 | 6,935 | 6,936 | 6,937 | 6,938 |
| | 2-279 | 6,951 | 6,952 | 6,953 | 6,954 | 6,955 | 6,956 | 6,957 | 6,958 | 6,959 | 6,960 | 6,961 | 6,962 | 6,963 |
| | 2-280 | 6,976 | 6,977 | 6,978 | 6,979 | 6,980 | 6,981 | 6,982 | 6,983 | 6,984 | 6,985 | 6,986 | 6,987 | 6,988 |
| | 2-281 | 7,001 | 7,002 | 7,003 | 7,004 | 7,005 | 7,006 | 7,007 | 7,008 | 7,009 | 7,010 | 7,011 | 7,012 | 7,013 |
| | 2-282 | 7,026 | 7,027 | 7,028 | 7,029 | 7,030 | 7,031 | 7,032 | 7,033 | 7,034 | 7,035 | 7,036 | 7,037 | 7,038 |
| | 2-283 | 7,051 | 7,052 | 7,053 | 7,054 | 7,055 | 7,056 | 7,057 | 7,058 | 7,059 | 7,060 | 7,061 | 7,062 | 7,063 |
| | 2-284 | 7,076 | 7,077 | 7,078 | 7,079 | 7,080 | 7,081 | 7,082 | 7,083 | 7,084 | 7,085 | 7,086 | 7,087 | 7,088 |
| | 2-285 | 7,101 | 7,102 | 7,103 | 7,104 | 7,105 | 7,106 | 7,107 | 7,108 | 7,109 | 7,110 | 7,111 | 7,112 | 7,113 |
| | 2-286 | 7,126 | 7,127 | 7,128 | 7,129 | 7,130 | 7,131 | 7,132 | 7,133 | 7,134 | 7,135 | 7,136 | 7,137 | 7,138 |
| | 2-287 | 7,151 | 7,152 | 7,153 | 7,154 | 7,155 | 7,156 | 7,157 | 7,158 | 7,159 | 7,160 | 7,161 | 7,162 | 7,163 |
| | 2-288 | 7,176 | 7,177 | 7,178 | 7,179 | 7,180 | 7,181 | 7,182 | 7,183 | 7,184 | 7,185 | 7,186 | 7,187 | 7,188 |
| | 2-289 | 7,201 | 7,202 | 7,203 | 7,204 | 7,205 | 7,206 | 7,207 | 7,208 | 7,209 | 7,210 | 7,211 | 7,212 | 7,213 |
| | 2-290 | 7,226 | 7,227 | 7,228 | 7,229 | 7,230 | 7,231 | 7,232 | 7,233 | 7,234 | 7,235 | 7,236 | 7,237 | 7,238 |
| | 2-291 | 7,251 | 7,252 | 7,253 | 7,254 | 7,255 | 7,256 | 7,257 | 7,258 | 7,259 | 7,260 | 7,261 | 7,262 | 7,263 |
| | 2-292 | 7,276 | 7,277 | 7,278 | 7,279 | 7,280 | 7,281 | 7,282 | 7,283 | 7,284 | 7,285 | 7,286 | 7,287 | 7,288 |
| | 2-293 | 7,301 | 7,302 | 7,303 | 7,304 | 7,305 | 7,306 | 7,307 | 7,308 | 7,309 | 7,310 | 7,311 | 7,312 | 7,313 |
| | 2-294 | 7,326 | 7,327 | 7,328 | 7,329 | 7,330 | 7,331 | 7,332 | 7,333 | 7,334 | 7,335 | 7,336 | 7,337 | 7,338 |
| | 2-295 | 7,351 | 7,352 | 7,353 | 7,354 | 7,355 | 7,356 | 7,357 | 7,358 | 7,359 | 7,360 | 7,361 | 7,362 | 7,363 |
| | 2-296 | 7,376 | 7,377 | 7,378 | 7,379 | 7,380 | 7,381 | 7,382 | 7,383 | 7,384 | 7,385 | 7,386 | 7,387 | 7,388 |

TABLE 6-continued

| | | | | | | | | | | | | | |
|---|---|---|---|---|---|---|---|---|---|---|---|---|---|
| 2-297 | 7,401 | 7,402 | 7,403 | 7,404 | 7,405 | 7,406 | 7,407 | 7,408 | 7,409 | 7,410 | 7,411 | 7,412 | 7,413 |
| 2-298 | 7,426 | 7,427 | 7,428 | 7,429 | 7,430 | 7,431 | 7,432 | 7,433 | 7,434 | 7,435 | 7,436 | 7,437 | 7,438 |
| 2-299 | 7,451 | 7,452 | 7,453 | 7,454 | 7,455 | 7,456 | 7,457 | 7,458 | 7,459 | 7,460 | 7,461 | 7,462 | 7,463 |
| 2-300 | 7,476 | 7,477 | 7,478 | 7,479 | 7,480 | 7,481 | 7,482 | 7,483 | 7,484 | 7,485 | 7,486 | 7,487 | 7,488 |
| 2-301 | 7,501 | 7,502 | 7,503 | 7,504 | 7,505 | 7,506 | 7,507 | 7,508 | 7,509 | 7,510 | 7,511 | 7,512 | 7,513 |
| 2-302 | 7,526 | 7,527 | 7,528 | 7,529 | 7,530 | 7,531 | 7,532 | 7,533 | 7,534 | 7,535 | 7,536 | 7,537 | 7,538 |
| 2-303 | 7,551 | 7,552 | 7,553 | 7,554 | 7,555 | 7,556 | 7,557 | 7,558 | 7,559 | 7,560 | 7,561 | 7,562 | 7,563 |
| 2-304 | 7,576 | 7,577 | 7,578 | 7,579 | 7,580 | 7,581 | 7,582 | 7,583 | 7,584 | 7,585 | 7,586 | 7,587 | 7,588 |
| 2-305 | 7,601 | 7,602 | 7,603 | 7,604 | 7,605 | 7,606 | 7,607 | 7,608 | 7,609 | 7,610 | 7,611 | 7,612 | 7,613 |
| 2-306 | 7,626 | 7,627 | 7,628 | 7,629 | 7,630 | 7,631 | 7,632 | 7,633 | 7,634 | 7,635 | 7,636 | 7,637 | 7,638 |
| 2-307 | 7,651 | 7,652 | 7,653 | 7,654 | 7,655 | 7,656 | 7,657 | 7,658 | 7,659 | 7,660 | 7,661 | 7,662 | 7,663 |
| 2-308 | 7,676 | 7,677 | 7,678 | 7,679 | 7,680 | 7,681 | 7,682 | 7,683 | 7,684 | 7,685 | 7,686 | 7,687 | 7,688 |
| 2-309 | 7,701 | 7,702 | 7,703 | 7,704 | 7,705 | 7,706 | 7,707 | 7,708 | 7,709 | 7,710 | 7,711 | 7,712 | 7,713 |
| 2-310 | 7,726 | 7,727 | 7,728 | 7,729 | 7,730 | 7,731 | 7,732 | 7,733 | 7,734 | 7,735 | 7,736 | 7,737 | 7,738 |
| 2-311 | 7,751 | 7,752 | 7,753 | 7,754 | 7,755 | 7,756 | 7,757 | 7,758 | 7,759 | 7,760 | 7,761 | 7,762 | 7,763 |
| 2-312 | 7,776 | 7,777 | 7,778 | 7,779 | 7,780 | 7,781 | 7,782 | 7,783 | 7,784 | 7,785 | 7,786 | 7,787 | 7,788 |
| 2-313 | 7,801 | 7,802 | 7,803 | 7,804 | 7,805 | 7,806 | 7,807 | 7,808 | 7,809 | 7,810 | 7,811 | 7,812 | 7,813 |
| 2-314 | 7,826 | 7,827 | 7,828 | 7,829 | 7,830 | 7,831 | 7,832 | 7,833 | 7,834 | 7,835 | 7,836 | 7,837 | 7,838 |
| 2-315 | 7,851 | 7,852 | 7,853 | 7,854 | 7,855 | 7,856 | 7,857 | 7,858 | 7,859 | 7,860 | 7,861 | 7,862 | 7,863 |
| 2-316 | 7,876 | 7,877 | 7,878 | 7,879 | 7,880 | 7,881 | 7,882 | 7,883 | 7,884 | 7,885 | 7,886 | 7,887 | 7,888 |
| 2-317 | 7,901 | 7,902 | 7,903 | 7,904 | 7,905 | 7,906 | 7,907 | 7,908 | 7,909 | 7,910 | 7,911 | 7,912 | 7,913 |
| 2-318 | 7,926 | 7,927 | 7,928 | 7,929 | 7,930 | 7,931 | 7,932 | 7,933 | 7,934 | 7,935 | 7,936 | 7,937 | 7,938 |
| 2-319 | 7,951 | 7,952 | 7,953 | 7,954 | 7,955 | 7,956 | 7,957 | 7,958 | 7,959 | 7,960 | 7,961 | 7,962 | 7,963 |
| 2-320 | 7,976 | 7,977 | 7,978 | 7,979 | 7,980 | 7,981 | 7,982 | 7,983 | 7,984 | 7,985 | 7,986 | 7,987 | 7,988 |
| 2-321 | 8,001 | 8,002 | 8,003 | 8,004 | 8,005 | 8,006 | 8,007 | 8,008 | 8,009 | 8,010 | 8,011 | 8,012 | 8,013 |
| 2-322 | 8,026 | 8,027 | 8,028 | 8,029 | 8,030 | 8,031 | 8,032 | 8,033 | 8,034 | 8,035 | 8,036 | 8,037 | 8,038 |
| 2-323 | 8,051 | 8,052 | 8,053 | 8,054 | 8,055 | 8,056 | 8,057 | 8,058 | 8,059 | 8,060 | 8,061 | 8,062 | 8,063 |
| 2-324 | 8,076 | 8,077 | 8,078 | 8,079 | 8,080 | 8,081 | 8,082 | 8,083 | 8,084 | 8,085 | 8,086 | 8,087 | 8,088 |
| 2-325 | 8,101 | 8,102 | 8,103 | 8,104 | 8,105 | 8,106 | 8,107 | 8,108 | 8,109 | 8,110 | 8,111 | 8,112 | 8,113 |
| 2-326 | 8,126 | 8,127 | 8,128 | 8,129 | 8,130 | 8,131 | 8,132 | 8,133 | 8,134 | 8,135 | 8,136 | 8,137 | 8,138 |
| 2-327 | 8,151 | 8,152 | 8,153 | 8,154 | 8,155 | 8,156 | 8,157 | 8,158 | 8,159 | 8,160 | 8,161 | 8,162 | 8,163 |
| 2-328 | 8,176 | 8,177 | 8,178 | 8,179 | 8,180 | 8,181 | 8,182 | 8,183 | 8,184 | 8,185 | 8,186 | 8,187 | 8,188 |
| 2-329 | 8,201 | 8,202 | 8,203 | 8,204 | 8,205 | 8,206 | 8,207 | 8,208 | 8,209 | 8,210 | 8,211 | 8,212 | 8,213 |
| 2-330 | 8,226 | 8,227 | 8,228 | 8,229 | 8,230 | 8,231 | 8,232 | 8,233 | 8,234 | 8,235 | 8,236 | 8,237 | 8,238 |

| | | Compound represented by the formula (1) | | | | | | | | | | | |
|---|---|---|---|---|---|---|---|---|---|---|---|---|---|
| | | 1-14 | 1-15 | 1-16 | 1-17 | 1-18 | 1-19 | 1-20 | 1-21 | 1-22 | 1-23 | 1-24 | 1-25 |
| Compound represented by the formula (2) | 2-276 | 6,889 | 6,890 | 6,891 | 6,892 | 6,893 | 6,894 | 6,895 | 6,896 | 6,897 | 6,898 | 6,899 | 6,900 |
| | 2-277 | 6,914 | 6,915 | 6,916 | 6,917 | 6,918 | 6,919 | 6,920 | 6,921 | 6,922 | 6,923 | 6,924 | 6,925 |
| | 2-278 | 6,939 | 6,940 | 6,941 | 6,942 | 6,943 | 6,944 | 6,945 | 6,946 | 6,947 | 6,948 | 6,949 | 6,950 |
| | 2-279 | 6,964 | 6,965 | 6,966 | 6,967 | 6,968 | 6,969 | 6,970 | 6,971 | 6,972 | 6,973 | 6,974 | 6,975 |
| | 2-280 | 6,989 | 6,990 | 6,991 | 6,992 | 6,993 | 6,994 | 6,995 | 6,996 | 6,997 | 6,998 | 6,999 | 7,000 |
| | 2-281 | 7,014 | 7,015 | 7,016 | 7,017 | 7,018 | 7,019 | 7,020 | 7,021 | 7,022 | 7,023 | 7,024 | 7,025 |
| | 2-282 | 7,039 | 7,040 | 7,041 | 7,042 | 7,043 | 7,044 | 7,045 | 7,046 | 7,047 | 7,048 | 7,049 | 7,050 |
| | 2-283 | 7,064 | 7,065 | 7,066 | 7,067 | 7,068 | 7,069 | 7,070 | 7,071 | 7,072 | 7,073 | 7,074 | 7,075 |
| | 2-284 | 7,089 | 7,090 | 7,091 | 7,092 | 7,093 | 7,094 | 7,095 | 7,096 | 7,097 | 7,098 | 7,099 | 7,100 |
| | 2-285 | 7,114 | 7,115 | 7,116 | 7,117 | 7,118 | 7,119 | 7,120 | 7,121 | 7,122 | 7,123 | 7,124 | 7,125 |
| | 2-286 | 7,139 | 7,140 | 7,141 | 7,142 | 7,143 | 7,144 | 7,145 | 7,146 | 7,147 | 7,148 | 7,149 | 7,150 |
| | 2-287 | 7,164 | 7,165 | 7,166 | 7,167 | 7,168 | 7,169 | 7,170 | 7,171 | 7,172 | 7,173 | 7,174 | 7,175 |
| | 2-288 | 7,189 | 7,190 | 7,191 | 7,192 | 7,193 | 7,194 | 7,195 | 7,196 | 7,197 | 7,198 | 7,199 | 7,200 |
| | 2-289 | 7,214 | 7,215 | 7,216 | 7,217 | 7,218 | 7,219 | 7,220 | 7,221 | 7,222 | 7,223 | 7,224 | 7,225 |
| | 2-290 | 7,239 | 7,240 | 7,241 | 7,242 | 7,243 | 7,244 | 7,245 | 7,246 | 7,247 | 7,248 | 7,249 | 7,250 |
| | 2-291 | 7,264 | 7,265 | 7,266 | 7,267 | 7,268 | 7,269 | 7,270 | 7,271 | 7,272 | 7,273 | 7,274 | 7,275 |
| | 2-292 | 7,289 | 7,290 | 7,291 | 7,292 | 7,293 | 7,294 | 7,295 | 7,296 | 7,297 | 7,298 | 7,299 | 7,300 |
| | 2-293 | 7,314 | 7,315 | 7,316 | 7,317 | 7,318 | 7,319 | 7,320 | 7,321 | 7,322 | 7,323 | 7,324 | 7,325 |
| | 2-294 | 7,339 | 7,340 | 7,341 | 7,342 | 7,343 | 7,344 | 7,345 | 7,346 | 7,347 | 7,348 | 7,349 | 7,350 |
| | 2-295 | 7,364 | 7,365 | 7,366 | 7,367 | 7,368 | 7,369 | 7,370 | 7,371 | 7,372 | 7,373 | 7,374 | 7,375 |
| | 2-296 | 7,389 | 7,390 | 7,391 | 7,392 | 7,393 | 7,394 | 7,395 | 7,396 | 7,397 | 7,398 | 7,399 | 7,400 |
| | 2-297 | 7,414 | 7,415 | 7,416 | 7,417 | 7,418 | 7,419 | 7,420 | 7,421 | 7,422 | 7,423 | 7,424 | 7,425 |
| | 2-298 | 7,439 | 7,440 | 7,441 | 7,442 | 7,443 | 7,444 | 7,445 | 7,446 | 7,447 | 7,448 | 7,449 | 7,450 |
| | 2-299 | 7,464 | 7,465 | 7,466 | 7,467 | 7,468 | 7,469 | 7,470 | 7,471 | 7,472 | 7,473 | 7,474 | 7,475 |
| | 2-300 | 7,489 | 7,490 | 7,491 | 7,492 | 7,493 | 7,494 | 7,495 | 7,496 | 7,497 | 7,498 | 7,499 | 7,500 |
| | 2-301 | 7,514 | 7,515 | 7,516 | 7,517 | 7,518 | 7,519 | 7,520 | 7,521 | 7,522 | 7,523 | 7,524 | 7,525 |
| | 2-302 | 7,539 | 7,540 | 7,541 | 7,542 | 7,543 | 7,544 | 7,545 | 7,546 | 7,547 | 7,548 | 7,549 | 7,550 |
| | 2-303 | 7,564 | 7,565 | 7,566 | 7,567 | 7,568 | 7,569 | 7,570 | 7,571 | 7,572 | 7,573 | 7,574 | 7,575 |
| | 2-304 | 7,589 | 7,590 | 7,591 | 7,592 | 7,593 | 7,594 | 7,595 | 7,596 | 7,597 | 7,598 | 7,599 | 7,600 |
| | 2-305 | 7,614 | 7,615 | 7,616 | 7,617 | 7,618 | 7,619 | 7,620 | 7,621 | 7,622 | 7,623 | 7,624 | 7,625 |
| | 2-306 | 7,639 | 7,640 | 7,641 | 7,642 | 7,643 | 7,644 | 7,645 | 7,646 | 7,647 | 7,648 | 7,649 | 7,650 |
| | 2-307 | 7,664 | 7,665 | 7,666 | 7,667 | 7,668 | 7,669 | 7,670 | 7,671 | 7,672 | 7,673 | 7,674 | 7,675 |
| | 2-308 | 7,689 | 7,690 | 7,691 | 7,692 | 7,693 | 7,694 | 7,695 | 7,696 | 7,697 | 7,698 | 7,699 | 7,700 |
| | 2-309 | 7,714 | 7,715 | 7,716 | 7,717 | 7,718 | 7,719 | 7,720 | 7,721 | 7,722 | 7,723 | 7,724 | 7,725 |
| | 2-310 | 7,739 | 7,740 | 7,741 | 7,742 | 7,743 | 7,744 | 7,745 | 7,746 | 7,747 | 7,748 | 7,749 | 7,750 |
| | 2-311 | 7,764 | 7,765 | 7,766 | 7,767 | 7,768 | 7,769 | 7,770 | 7,771 | 7,772 | 7,773 | 7,774 | 7,775 |
| | 2-312 | 7,789 | 7,790 | 7,791 | 7,792 | 7,793 | 7,794 | 7,795 | 7,796 | 7,797 | 7,798 | 7,799 | 7,800 |
| | 2-313 | 7,814 | 7,815 | 7,816 | 7,817 | 7,818 | 7,819 | 7,820 | 7,821 | 7,822 | 7,823 | 7,824 | 7,825 |
| | 2-314 | 7,839 | 7,840 | 7,841 | 7,842 | 7,843 | 7,844 | 7,845 | 7,846 | 7,847 | 7,848 | 7,849 | 7,850 |
| | 2-315 | 7,864 | 7,865 | 7,866 | 7,867 | 7,868 | 7,869 | 7,870 | 7,871 | 7,872 | 7,873 | 7,874 | 7,875 |
| | 2-316 | 7,889 | 7,890 | 7,891 | 7,892 | 7,893 | 7,894 | 7,895 | 7,896 | 7,897 | 7,898 | 7,899 | 7,900 |

TABLE 6-continued

| | | | | | | | | | | | | | | |
|---|---|---|---|---|---|---|---|---|---|---|---|---|---|---|
| | 2-317 | 7,914 | 7,915 | 7,916 | 7,917 | 7,918 | 7,919 | 7,920 | 7,921 | 7,922 | 7,923 | 7,924 | 7,925 |
| | 2-318 | 7,939 | 7,940 | 7,941 | 7,942 | 7,943 | 7,944 | 7,945 | 7,946 | 7,947 | 7,948 | 7,949 | 7,950 |
| | 2-319 | 7,964 | 7,965 | 7,966 | 7,967 | 7,968 | 7,969 | 7,970 | 7,971 | 7,972 | 7,973 | 7,974 | 7,975 |
| | 2-320 | 7,989 | 7,990 | 7,991 | 7,992 | 7,993 | 7,994 | 7,995 | 7,996 | 7,997 | 7,998 | 7,999 | 8,000 |
| | 2-321 | 8,014 | 8,015 | 8,016 | 8,017 | 8,018 | 8,019 | 8,020 | 8,021 | 8,022 | 8,023 | 8,024 | 8,025 |
| | 2-322 | 8,039 | 8,040 | 8,041 | 8,042 | 8,043 | 8,044 | 8,045 | 8,046 | 8,047 | 8,048 | 8,049 | 8,050 |
| | 2-323 | 8,064 | 8,065 | 8,066 | 8,067 | 8,068 | 8,069 | 8,070 | 8,071 | 8,072 | 8,073 | 8,074 | 8,075 |
| | 2-324 | 8,089 | 8,090 | 8,091 | 8,092 | 8,093 | 8,094 | 8,095 | 8,096 | 8,097 | 8,098 | 8,099 | 8,100 |
| | 2-325 | 8,114 | 8,115 | 8,116 | 8,117 | 8,118 | 8,119 | 8,120 | 8,121 | 8,122 | 8,123 | 8,124 | 8,125 |
| | 2-326 | 8,139 | 8,140 | 8,141 | 8,142 | 8,143 | 8,144 | 8,145 | 8,146 | 8,147 | 8,148 | 8,149 | 8,150 |
| | 2-327 | 8,164 | 8,165 | 8,166 | 8,167 | 8,168 | 8,169 | 8,170 | 8,171 | 8,172 | 8,173 | 8,174 | 8,175 |
| | 2-328 | 8,189 | 8,190 | 8,191 | 8,192 | 8,193 | 8,194 | 8,195 | 8,196 | 8,197 | 8,198 | 8,199 | 8,200 |
| | 2-329 | 8,214 | 8,215 | 8,216 | 8,217 | 8,218 | 8,219 | 8,220 | 8,221 | 8,222 | 8,223 | 8,224 | 8,225 |
| | 2-330 | 8,239 | 8,240 | 8,241 | 8,242 | 8,243 | 8,244 | 8,245 | 8,246 | 8,247 | 8,248 | 8,249 | 8,250 |

TABLE 7

| | | Compound represented by the formula (1) | | | | | | | | | | | | |
|---|---|---|---|---|---|---|---|---|---|---|---|---|---|---|
| | | 1-1 | 1-2 | 1-3 | 1-4 | 1-5 | 1-6 | 1-7 | 1-8 | 1-9 | 1-10 | 1-11 | 1-12 | 1-13 |
| Compound represented by the formula (2) | 2-331 | 8,251 | 8,252 | 8,253 | 8,254 | 8,255 | 8,256 | 8,257 | 8,258 | 8,259 | 8,260 | 8,261 | 8,262 | 8,263 |
| | 2-332 | 8,276 | 8,277 | 8,278 | 8,279 | 8,280 | 8,281 | 8,282 | 8,283 | 8,284 | 8,285 | 8,286 | 8,287 | 8,288 |
| | 2-333 | 8,301 | 8,302 | 8,303 | 8,304 | 8,305 | 8,306 | 8,307 | 8,308 | 8,309 | 8,310 | 8,311 | 8,312 | 8,313 |
| | 2-334 | 8,326 | 8,327 | 8,328 | 8,329 | 8,330 | 8,331 | 8,332 | 8,333 | 8,334 | 8,335 | 8,336 | 8,337 | 8,338 |
| | 2-335 | 8,351 | 8,352 | 8,353 | 8,354 | 8,355 | 8,356 | 8,357 | 8,358 | 8,359 | 8,360 | 8,361 | 8,362 | 8,363 |
| | 2-336 | 8,376 | 8,377 | 8,378 | 8,379 | 8,380 | 8,381 | 8,382 | 8,383 | 8,384 | 8,385 | 8,386 | 8,387 | 8,388 |
| | 2-337 | 8,401 | 8,402 | 8,403 | 8,404 | 8,405 | 8,406 | 8,407 | 8,408 | 8,409 | 8,410 | 8,411 | 8,412 | 8,413 |
| | 2-338 | 8,426 | 8,427 | 8,428 | 8,429 | 8,430 | 8,431 | 8,432 | 8,433 | 8,434 | 8,435 | 8,436 | 8,437 | 8,438 |
| | 2-339 | 8,451 | 8,452 | 8,453 | 8,454 | 8,455 | 8,456 | 8,457 | 8,458 | 8,459 | 8,460 | 8,461 | 8,462 | 8,463 |
| | 2-340 | 8,476 | 8,477 | 8,478 | 8,479 | 8,480 | 8,481 | 8,482 | 8,483 | 8,484 | 8,485 | 8,486 | 8,487 | 8,488 |
| | 2-341 | 8,501 | 8,502 | 8,503 | 8,504 | 8,505 | 8,506 | 8,507 | 8,508 | 8,509 | 8,510 | 8,511 | 8,512 | 8,513 |
| | 2-342 | 8,526 | 8,527 | 8,528 | 8,529 | 8,530 | 8,531 | 8,532 | 8,533 | 8,534 | 8,535 | 8,536 | 8,537 | 8,538 |
| | 2-343 | 8,551 | 8,552 | 8,553 | 8,554 | 8,555 | 8,556 | 8,557 | 8,558 | 8,559 | 8,560 | 8,561 | 8,562 | 8,563 |
| | 2-344 | 8,576 | 8,577 | 8,578 | 8,579 | 8,580 | 8,581 | 8,582 | 8,583 | 8,584 | 8,585 | 8,586 | 8,587 | 8,588 |
| | 2-345 | 8,601 | 8,602 | 8,603 | 8,604 | 8,605 | 8,606 | 8,607 | 8,608 | 8,609 | 8,610 | 8,611 | 8,612 | 8,613 |
| | 2-346 | 8,626 | 8,627 | 8,628 | 8,629 | 8,630 | 8,631 | 8,632 | 8,633 | 8,634 | 8,635 | 8,636 | 8,637 | 8,638 |
| | 2-347 | 8,651 | 8,652 | 8,653 | 8,654 | 8,655 | 8,656 | 8,657 | 8,658 | 8,659 | 8,660 | 8,661 | 8,662 | 8,663 |
| | 2-348 | 8,676 | 8,677 | 8,678 | 8,679 | 8,680 | 8,681 | 8,682 | 8,683 | 8,684 | 8,685 | 8,686 | 8,687 | 8,688 |
| | 2-349 | 8,701 | 8,702 | 8,703 | 8,704 | 8,705 | 8,706 | 8,707 | 8,708 | 8,709 | 8,710 | 8,711 | 8,712 | 8,713 |
| | 2-350 | 8,726 | 8,727 | 8,728 | 8,729 | 8,730 | 8,731 | 8,732 | 8,733 | 8,734 | 8,735 | 8,736 | 8,737 | 8,738 |
| | 2-351 | 8,751 | 8,752 | 8,753 | 8,754 | 8,755 | 8,756 | 8,757 | 8,758 | 8,759 | 8,760 | 8,761 | 8,762 | 8,763 |
| | 2-352 | 8,776 | 8,777 | 8,778 | 8,779 | 8,780 | 8,781 | 8,782 | 8,783 | 8,784 | 8,785 | 8,786 | 8,787 | 8,788 |
| | 2-353 | 8,801 | 8,802 | 8,803 | 8,804 | 8,805 | 8,806 | 8,807 | 8,808 | 8,809 | 8,810 | 8,811 | 8,812 | 8,813 |
| | 2-354 | 8,826 | 8,827 | 8,828 | 8,829 | 8,830 | 8,831 | 8,832 | 8,833 | 8,834 | 8,835 | 8,836 | 8,837 | 8,838 |
| | 2-355 | 8,851 | 8,852 | 8,853 | 8,854 | 8,855 | 8,856 | 8,857 | 8,858 | 8,859 | 8,860 | 8,861 | 8,862 | 8,863 |
| | 2-356 | 8,876 | 8,877 | 8,878 | 8,879 | 8,880 | 8,881 | 8,882 | 8,883 | 8,884 | 8,885 | 8,886 | 8,887 | 8,888 |
| | 2-357 | 8,901 | 8,902 | 8,903 | 8,904 | 8,905 | 8,906 | 8,907 | 8,908 | 8,909 | 8,910 | 8,911 | 8,912 | 8,913 |
| | 2-358 | 8,926 | 8,927 | 8,928 | 8,929 | 8,930 | 8,931 | 8,932 | 8,933 | 8,934 | 8,935 | 8,936 | 8,937 | 8,938 |
| | 2-359 | 8,951 | 8,952 | 8,953 | 8,954 | 8,955 | 8,956 | 8,957 | 8,958 | 8,959 | 8,960 | 8,961 | 8,962 | 8,963 |
| | 2-360 | 8,976 | 8,977 | 8,978 | 8,979 | 8,980 | 8,981 | 8,982 | 8,983 | 8,984 | 8,985 | 8,986 | 8,987 | 8,988 |
| | 2-361 | 9,001 | 9,002 | 9,003 | 9,004 | 9,005 | 9,006 | 9,007 | 9,008 | 9,009 | 9,010 | 9,011 | 9,012 | 9,013 |
| | 2-362 | 9,026 | 9,027 | 9,028 | 9,029 | 9,030 | 9,031 | 9,032 | 9,033 | 9,034 | 9,035 | 9,036 | 9,037 | 9,038 |
| | 2-363 | 9,051 | 9,052 | 9,053 | 9,054 | 9,055 | 9,056 | 9,057 | 9,058 | 9,059 | 9,060 | 9,061 | 9,062 | 9,063 |
| | 2-364 | 9,076 | 9,077 | 9,078 | 9,079 | 9,080 | 9,081 | 9,082 | 9,083 | 9,084 | 9,085 | 9,086 | 9,087 | 9,088 |
| | 2-365 | 9,101 | 9,102 | 9,103 | 9,104 | 9,105 | 9,106 | 9,107 | 9,108 | 9,109 | 9,110 | 9,111 | 9,112 | 9,113 |
| | 2-366 | 9,126 | 9,127 | 9,128 | 9,129 | 9,130 | 9,131 | 9,132 | 9,133 | 9,134 | 9,135 | 9,136 | 9,137 | 9,138 |
| | 2-367 | 9,151 | 9,152 | 9,153 | 9,154 | 9,155 | 9,156 | 9,157 | 9,158 | 9,159 | 9,160 | 9,161 | 9,162 | 9,163 |
| | 2-368 | 9,176 | 9,177 | 9,178 | 9,179 | 9,180 | 9,181 | 9,182 | 9,183 | 9,184 | 9,185 | 9,186 | 9,187 | 9,188 |
| | 2-369 | 9,201 | 9,202 | 9,203 | 9,204 | 9,205 | 9,206 | 9,207 | 9,208 | 9,209 | 9,210 | 9,211 | 9,212 | 9,213 |
| | 2-370 | 9,226 | 9,227 | 9,228 | 9,229 | 9,230 | 9,231 | 9,232 | 9,233 | 9,234 | 9,235 | 9,236 | 9,237 | 9,238 |
| | 2-371 | 9,251 | 9,252 | 9,253 | 9,254 | 9,255 | 9,256 | 9,257 | 9,258 | 9,259 | 9,260 | 9,261 | 9,262 | 9,263 |
| | 2-372 | 9,276 | 9,277 | 9,278 | 9,279 | 9,280 | 9,281 | 9,282 | 9,283 | 9,284 | 9,285 | 9,286 | 9,287 | 9,288 |
| | 2-373 | 9,301 | 9,302 | 9,303 | 9,304 | 9,305 | 9,306 | 9,307 | 9,308 | 9,309 | 9,310 | 9,311 | 9,312 | 9,313 |
| | 2-374 | 9,326 | 9,327 | 9,328 | 9,329 | 9,330 | 9,331 | 9,332 | 9,333 | 9,334 | 9,335 | 9,336 | 9,337 | 9,338 |
| | 2-375 | 9,351 | 9,352 | 9,353 | 9,354 | 9,355 | 9,356 | 9,357 | 9,358 | 9,359 | 9,360 | 9,361 | 9,362 | 9,363 |
| | 2-376 | 9,376 | 9,377 | 9,378 | 9,379 | 9,380 | 9,381 | 9,382 | 9,383 | 9,384 | 9,385 | 9,386 | 9,387 | 9,388 |
| | 2-377 | 9,401 | 9,402 | 9,403 | 9,404 | 9,405 | 9,406 | 9,407 | 9,408 | 9,409 | 9,410 | 9,411 | 9,412 | 9,413 |
| | 2-378 | 9,426 | 9,427 | 9,428 | 9,429 | 9,430 | 9,431 | 9,432 | 9,433 | 9,434 | 9,435 | 9,436 | 9,437 | 9,438 |
| | 2-379 | 9,451 | 9,452 | 9,453 | 9,454 | 9,455 | 9,456 | 9,457 | 9,458 | 9,459 | 9,460 | 9,461 | 9,462 | 9,463 |
| | 2-380 | 9,476 | 9,477 | 9,478 | 9,479 | 9,480 | 9,481 | 9,482 | 9,483 | 9,484 | 9,485 | 9,486 | 9,487 | 9,488 |
| | 2-381 | 9,501 | 9,502 | 9,503 | 9,504 | 9,505 | 9,506 | 9,507 | 9,508 | 9,509 | 9,510 | 9,511 | 9,512 | 9,513 |
| | 2-382 | 9,526 | 9,527 | 9,528 | 9,529 | 9,530 | 9,531 | 9,532 | 9,533 | 9,534 | 9,535 | 9,536 | 9,537 | 9,538 |
| | 2-383 | 9,551 | 9,552 | 9,553 | 9,554 | 9,555 | 9,556 | 9,557 | 9,558 | 9,559 | 9,560 | 9,561 | 9,562 | 9,563 |
| | 2-384 | 9,576 | 9,577 | 9,578 | 9,579 | 9,580 | 9,581 | 9,582 | 9,583 | 9,584 | 9,585 | 9,586 | 9,587 | 9,588 |
| | 2-385 | 9,601 | 9,602 | 9,603 | 9,604 | 9,605 | 9,606 | 9,607 | 9,608 | 9,609 | 9,610 | 9,611 | 9,612 | 9,613 |

TABLE 7-continued

| | | Compound represented by the formula (1) | | | | | | | | | | | |
|---|---|---|---|---|---|---|---|---|---|---|---|---|---|
| | | 1-14 | 1-15 | 1-16 | 1-17 | 1-18 | 1-19 | 1-20 | 1-21 | 1-22 | 1-23 | 1-24 | 1-25 |
| Compound represented by the formula (2) | 2-331 | 8,264 | 8,265 | 8,266 | 8,267 | 8,268 | 8,269 | 8,270 | 8,271 | 8,272 | 8,273 | 8,274 | 8,275 |
| | 2-332 | 8,289 | 8,290 | 8,291 | 8,292 | 8,293 | 8,294 | 8,295 | 8,296 | 8,297 | 8,298 | 8,299 | 8,300 |
| | 2-333 | 8,314 | 8,315 | 8,316 | 8,317 | 8,318 | 8,319 | 8,320 | 8,321 | 8,322 | 8,323 | 8,324 | 8,325 |
| | 2-334 | 8,339 | 8,340 | 8,341 | 8,342 | 8,343 | 8,344 | 8,345 | 8,346 | 8,347 | 8,348 | 8,349 | 8,350 |
| | 2-335 | 8,364 | 8,365 | 8,366 | 8,367 | 8,368 | 8,369 | 8,370 | 8,371 | 8,372 | 8,373 | 8,374 | 8,375 |
| | 2-336 | 8,389 | 8,390 | 8,391 | 8,392 | 8,393 | 8,394 | 8,395 | 8,396 | 8,397 | 8,398 | 8,399 | 8,400 |
| | 2-337 | 8,414 | 8,415 | 8,416 | 8,417 | 8,418 | 8,419 | 8,420 | 8,421 | 8,422 | 8,423 | 8,424 | 8,425 |
| | 2-338 | 8,439 | 8,440 | 8,441 | 8,442 | 8,443 | 8,444 | 8,445 | 8,446 | 8,447 | 8,448 | 8,449 | 8,450 |
| | 2-339 | 8,464 | 8,465 | 8,466 | 8,467 | 8,468 | 8,469 | 8,470 | 8,471 | 8,472 | 8,473 | 8,474 | 8,475 |
| | 2-340 | 8,489 | 8,490 | 8,491 | 8,492 | 8,493 | 8,494 | 8,495 | 8,496 | 8,497 | 8,498 | 8,499 | 8,500 |
| | 2-341 | 8,514 | 8,515 | 8,516 | 8,517 | 8,518 | 8,519 | 8,520 | 8,521 | 8,522 | 8,523 | 8,524 | 8,525 |
| | 2-342 | 8,539 | 8,540 | 8,541 | 8,542 | 8,543 | 8,544 | 8,545 | 8,546 | 8,547 | 8,548 | 8,549 | 8,550 |
| | 2-343 | 8,564 | 8,565 | 8,566 | 8,567 | 8,568 | 8,569 | 8,570 | 8,571 | 8,572 | 8,573 | 8,574 | 8,575 |
| | 2-344 | 8,589 | 8,590 | 8,591 | 8,592 | 8,593 | 8,594 | 8,595 | 8,596 | 8,597 | 8,598 | 8,599 | 8,600 |
| | 2-345 | 8,614 | 8,615 | 8,616 | 8,617 | 8,618 | 8,619 | 8,620 | 8,621 | 8,622 | 8,623 | 8,624 | 8,625 |
| | 2-346 | 8,639 | 8,640 | 8,641 | 8,642 | 8,643 | 8,644 | 8,645 | 8,646 | 8,647 | 8,648 | 8,649 | 8,650 |
| | 2-347 | 8,664 | 8,665 | 8,666 | 8,667 | 8,668 | 8,669 | 8,670 | 8,671 | 8,672 | 8,673 | 8,674 | 8,675 |
| | 2-348 | 8,689 | 8,690 | 8,691 | 8,692 | 8,693 | 8,694 | 8,695 | 8,696 | 8,697 | 8,698 | 8,699 | 8,700 |
| | 2-349 | 8,714 | 8,715 | 8,716 | 8,717 | 8,718 | 8,719 | 8,720 | 8,721 | 8,722 | 8,723 | 8,724 | 8,725 |
| | 2-350 | 8,739 | 8,740 | 8,741 | 8,742 | 8,743 | 8,744 | 8,745 | 8,746 | 8,747 | 8,748 | 8,749 | 8,750 |
| | 2-351 | 8,764 | 8,765 | 8,766 | 8,767 | 8,768 | 8,769 | 8,770 | 8,771 | 8,772 | 8,773 | 8,774 | 8,775 |
| | 2-352 | 8,789 | 8,790 | 8,791 | 8,792 | 8,793 | 8,794 | 8,795 | 8,796 | 8,797 | 8,798 | 8,799 | 8,800 |
| | 2-353 | 8,814 | 8,815 | 8,816 | 8,817 | 8,818 | 8,819 | 8,820 | 8,821 | 8,822 | 8,823 | 8,824 | 8,825 |
| | 2-354 | 8,839 | 8,840 | 8,841 | 8,842 | 8,843 | 8,844 | 8,845 | 8,846 | 8,847 | 8,848 | 8,849 | 8,850 |
| | 2-355 | 8,864 | 8,865 | 8,866 | 8,867 | 8,868 | 8,869 | 8,870 | 8,871 | 8,872 | 8,873 | 8,874 | 8,875 |
| | 2-356 | 8,889 | 8,890 | 8,891 | 8,892 | 8,893 | 8,894 | 8,895 | 8,896 | 8,897 | 8,898 | 8,899 | 8,900 |
| | 2-357 | 8,914 | 8,915 | 8,916 | 8,917 | 8,918 | 8,919 | 8,920 | 8,921 | 8,922 | 8,923 | 8,924 | 8,925 |
| | 2-358 | 8,939 | 8,940 | 8,941 | 8,942 | 8,943 | 8,944 | 8,945 | 8,946 | 8,947 | 8,948 | 8,949 | 8,950 |
| | 2-359 | 8,964 | 8,965 | 8,966 | 8,967 | 8,968 | 8,969 | 8,970 | 8,971 | 8,972 | 8,973 | 8,974 | 8,975 |
| | 2-360 | 8,989 | 8,990 | 8,991 | 8,992 | 8,993 | 8,994 | 8,995 | 8,996 | 8,997 | 8,998 | 8,999 | 9,000 |
| | 2-361 | 9,014 | 9,015 | 9,016 | 9,017 | 9,018 | 9,019 | 9,020 | 9,021 | 9,022 | 9,023 | 9,024 | 9,025 |
| | 2-362 | 9,039 | 9,040 | 9,041 | 9,042 | 9,043 | 9,044 | 9,045 | 9,046 | 9,047 | 9,048 | 9,049 | 9,050 |
| | 2-363 | 9,064 | 9,065 | 9,066 | 9,067 | 9,068 | 9,069 | 9,070 | 9,071 | 9,072 | 9,073 | 9,074 | 9,075 |
| | 2-364 | 9,089 | 9,090 | 9,091 | 9,092 | 9,093 | 9,094 | 9,095 | 9,096 | 9,097 | 9,098 | 9,099 | 9,100 |
| | 2-365 | 9,114 | 9,115 | 9,116 | 9,117 | 9,118 | 9,119 | 9,120 | 9,121 | 9,122 | 9,123 | 9,124 | 9,125 |
| | 2-366 | 9,139 | 9,140 | 9,141 | 9,142 | 9,143 | 9,144 | 9,145 | 9,146 | 9,147 | 9,148 | 9,149 | 9,150 |
| | 2-367 | 9,164 | 9,165 | 9,166 | 9,167 | 9,168 | 9,169 | 9,170 | 9,171 | 9,172 | 9,173 | 9,174 | 9,175 |
| | 2-368 | 9,189 | 9,190 | 9,191 | 9,192 | 9,193 | 9,194 | 9,195 | 9,196 | 9,197 | 9,198 | 9,199 | 9,200 |
| | 2-369 | 9,214 | 9,215 | 9,216 | 9,217 | 9,218 | 9,219 | 9,220 | 9,221 | 9,222 | 9,223 | 9,224 | 9,225 |
| | 2-370 | 9,239 | 9,240 | 9,241 | 9,242 | 9,243 | 9,244 | 9,245 | 9,246 | 9,247 | 9,248 | 9,249 | 9,250 |
| | 2-371 | 9,264 | 9,265 | 9,266 | 9,267 | 9,268 | 9,269 | 9,270 | 9,271 | 9,272 | 9,273 | 9,274 | 9,275 |
| | 2-372 | 9,289 | 9,290 | 9,291 | 9,292 | 9,293 | 9,294 | 9,295 | 9,296 | 9,297 | 9,298 | 9,299 | 9,300 |
| | 2-373 | 9,314 | 9,315 | 9,316 | 9,317 | 9,318 | 9,319 | 9,320 | 9,321 | 9,322 | 9,323 | 9,324 | 9,325 |
| | 2-374 | 9,339 | 9,340 | 9,341 | 9,342 | 9,343 | 9,344 | 9,345 | 9,346 | 9,347 | 9,348 | 9,349 | 9,350 |
| | 2-375 | 9,364 | 9,365 | 9,366 | 9,367 | 9,368 | 9,369 | 9,370 | 9,371 | 9,372 | 9,373 | 9,374 | 9,375 |
| | 2-376 | 9,389 | 9,390 | 9,391 | 9,392 | 9,393 | 9,394 | 9,395 | 9,396 | 9,397 | 9,398 | 9,399 | 9,400 |
| | 2-377 | 9,414 | 9,415 | 9,416 | 9,417 | 9,418 | 9,419 | 9,420 | 9,421 | 9,422 | 9,423 | 9,424 | 9,425 |
| | 2-378 | 9,439 | 9,440 | 9,441 | 9,442 | 9,443 | 9,444 | 9,445 | 9,446 | 9,447 | 9,448 | 9,449 | 9,450 |
| | 2-379 | 9,464 | 9,465 | 9,466 | 9,467 | 9,468 | 9,469 | 9,470 | 9,471 | 9,472 | 9,473 | 9,474 | 9,475 |
| | 2-380 | 9,489 | 9,490 | 9,491 | 9,492 | 9,493 | 9,494 | 9,495 | 9,496 | 9,497 | 9,498 | 9,499 | 9,500 |
| | 2-381 | 9,514 | 9,515 | 9,516 | 9,517 | 9,518 | 9,519 | 9,520 | 9,521 | 9,522 | 9,523 | 9,524 | 9,525 |
| | 2-382 | 9,539 | 9,540 | 9,541 | 9,542 | 9,543 | 9,544 | 9,545 | 9,546 | 9,547 | 9,548 | 9,549 | 9,550 |
| | 2-383 | 9,564 | 9,565 | 9,566 | 9,567 | 9,568 | 9,569 | 9,570 | 9,571 | 9,572 | 9,573 | 9,574 | 9,575 |
| | 2-384 | 9,589 | 9,590 | 9,591 | 9,592 | 9,593 | 9,594 | 9,595 | 9,596 | 9,597 | 9,598 | 9,599 | 9,600 |
| | 2-385 | 9,614 | 9,615 | 9,616 | 9,617 | 9,618 | 9,619 | 9,620 | 9,621 | 9,622 | 9,623 | 9,624 | 9,625 |

TABLE 8

| | | Compound represented by the formula (1) | | | | | | | | | | | | |
|---|---|---|---|---|---|---|---|---|---|---|---|---|---|---|
| | | 1-1 | 1-2 | 1-3 | 1-4 | 1-5 | 1-6 | 1-7 | 1-8 | 1-9 | 1-10 | 1-11 | 1-12 | 1-13 |
| Compound represented by the formula (2) | 2-386 | 9,626 | 9,627 | 9,628 | 9,629 | 9,630 | 9,631 | 9,632 | 9,633 | 9,634 | 9,635 | 9,636 | 9,637 | 9,638 |
| | 2-387 | 9,651 | 9,652 | 9,653 | 9,654 | 9,655 | 9,656 | 9,657 | 9,658 | 9,659 | 9,660 | 9,661 | 9,662 | 9,663 |
| | 2-388 | 9,676 | 9,677 | 9,678 | 9,679 | 9,680 | 9,681 | 9,682 | 9,683 | 9,684 | 9,685 | 9,686 | 9,687 | 9,688 |
| | 2-389 | 9,701 | 9,702 | 9,703 | 9,704 | 9,705 | 9,706 | 9,707 | 9,708 | 9,709 | 9,710 | 9,711 | 9,712 | 9,713 |
| | 2-390 | 9,726 | 9,727 | 9,728 | 9,729 | 9,730 | 9,731 | 9,732 | 9,733 | 9,734 | 9,735 | 9,736 | 9,737 | 9,738 |
| | 2-391 | 9,751 | 9,752 | 9,753 | 9,754 | 9,755 | 9,756 | 9,757 | 9,758 | 9,759 | 9,760 | 9,761 | 9,762 | 9,763 |
| | 2-392 | 9,776 | 9,777 | 9,778 | 9,779 | 9,780 | 9,781 | 9,782 | 9,783 | 9,784 | 9,785 | 9,786 | 9,787 | 9,788 |
| | 2-393 | 9,801 | 9,802 | 9,803 | 9,804 | 9,805 | 9,806 | 9,807 | 9,808 | 9,809 | 9,810 | 9,811 | 9,812 | 9,813 |
| | 2-394 | 9,826 | 9,827 | 9,828 | 9,829 | 9,830 | 9,831 | 9,832 | 9,833 | 9,834 | 9,835 | 9,836 | 9,837 | 9,838 |
| | 2-395 | 9,851 | 9,852 | 9,853 | 9,854 | 9,855 | 9,856 | 9,857 | 9,858 | 9,859 | 9,860 | 9,861 | 9,862 | 9,863 |
| | 2-396 | 9,876 | 9,877 | 9,878 | 9,879 | 9,880 | 9,881 | 9,882 | 9,883 | 9,884 | 9,885 | 9,886 | 9,887 | 9,888 |

TABLE 8-continued

| | | | | | | | | | | | | | |
|---|---|---|---|---|---|---|---|---|---|---|---|---|---|
| 2-397 | 9,901 | 9,902 | 9,903 | 9,904 | 9,905 | 9,906 | 9,907 | 9,908 | 9,909 | 9,910 | 9,911 | 9,912 | 9,913 |
| 2-398 | 9,926 | 9,927 | 9,928 | 9,929 | 9,930 | 9,931 | 9,932 | 9,933 | 9,934 | 9,935 | 9,936 | 9,937 | 9,938 |
| 2-399 | 9,951 | 9,952 | 9,953 | 9,954 | 9,955 | 9,956 | 9,957 | 9,958 | 9,959 | 9,960 | 9,961 | 9,962 | 9,963 |
| 2-400 | 9,976 | 9,977 | 9,978 | 9,979 | 9,980 | 9,981 | 9,982 | 9,983 | 9,984 | 9,985 | 9,986 | 9,987 | 9,988 |
| 2-401 | 10,001 | 10,002 | 10,003 | 10,004 | 10,005 | 10,006 | 10,007 | 10,008 | 10,009 | 10,010 | 10,011 | 10,012 | 10,013 |
| 2-402 | 10,026 | 10,027 | 10,028 | 10,029 | 10,030 | 10,031 | 10,032 | 10,033 | 10,034 | 10,035 | 10,036 | 10,037 | 10,038 |
| 2-403 | 10,051 | 10,052 | 10,053 | 10,054 | 10,055 | 10,056 | 10,057 | 10,058 | 10,059 | 10,060 | 10,061 | 10,062 | 10,063 |
| 2-404 | 10,076 | 10,077 | 10,078 | 10,079 | 10,080 | 10,081 | 10,082 | 10,083 | 10,084 | 10,085 | 10,086 | 10,087 | 10,088 |
| 2-405 | 10,101 | 10,102 | 10,103 | 10,104 | 10,105 | 10,106 | 10,107 | 10,108 | 10,109 | 10,110 | 10,111 | 10,112 | 10,113 |
| 2-406 | 10,126 | 10,127 | 10,128 | 10,129 | 10,130 | 10,131 | 10,132 | 10,133 | 10,134 | 10,135 | 10,136 | 10,137 | 10,138 |
| 2-407 | 10,151 | 10,152 | 10,153 | 10,154 | 10,155 | 10,156 | 10,157 | 10,158 | 10,159 | 10,160 | 10,161 | 10,162 | 10,163 |
| 2-408 | 10,176 | 10,177 | 10,178 | 10,179 | 10,180 | 10,181 | 10,182 | 10,183 | 10,184 | 10,185 | 10,186 | 10,187 | 10,188 |
| 2-409 | 10,201 | 10,202 | 10,203 | 10,204 | 10,205 | 10,206 | 10,207 | 10,208 | 10,209 | 10,210 | 10,211 | 10,212 | 10,213 |
| 2-410 | 10,226 | 10,227 | 10,228 | 10,229 | 10,230 | 10,231 | 10,232 | 10,233 | 10,234 | 10,235 | 10,236 | 10,237 | 10,238 |
| 2-411 | 10,251 | 10,252 | 10,253 | 10,254 | 10,255 | 10,256 | 10,257 | 10,258 | 10,259 | 10,260 | 10,261 | 10,262 | 10,263 |
| 2-412 | 10,276 | 10,277 | 10,278 | 10,279 | 10,280 | 10,281 | 10,282 | 10,283 | 10,284 | 10,285 | 10,286 | 10,287 | 10,288 |
| 2-413 | 10,301 | 10,302 | 10,303 | 10,304 | 10,305 | 10,306 | 10,307 | 10,308 | 10,309 | 10,310 | 10,311 | 10,312 | 10,313 |
| 2-414 | 10,326 | 10,327 | 10,328 | 10,329 | 10,330 | 10,331 | 10,332 | 10,333 | 10,334 | 10,335 | 10,336 | 10,337 | 10,338 |
| 2-415 | 10,351 | 10,352 | 10,353 | 10,354 | 10,355 | 10,356 | 10,357 | 10,358 | 10,359 | 10,360 | 10,361 | 10,362 | 10,363 |
| 2-416 | 10,376 | 10,377 | 10,378 | 10,379 | 10,380 | 10,381 | 10,382 | 10,383 | 10,384 | 10,385 | 10,386 | 10,387 | 10,388 |
| 2-417 | 10,401 | 10,402 | 10,403 | 10,404 | 10,405 | 10,406 | 10,407 | 10,408 | 10,409 | 10,410 | 10,411 | 10,412 | 10,413 |
| 2-418 | 10,426 | 10,427 | 10,428 | 10,429 | 10,430 | 10,431 | 10,432 | 10,433 | 10,434 | 10,435 | 10,436 | 10,437 | 10,438 |
| 2-419 | 10,451 | 10,452 | 10,453 | 10,454 | 10,455 | 10,456 | 10,457 | 10,458 | 10,459 | 10,460 | 10,461 | 10,462 | 10,463 |
| 2-420 | 10,476 | 10,477 | 10,478 | 10,479 | 10,480 | 10,481 | 10,482 | 10,483 | 10,484 | 10,485 | 10,486 | 10,487 | 10,488 |
| 2-421 | 10,501 | 10,502 | 10,503 | 10,504 | 10,505 | 10,506 | 10,507 | 10,508 | 10,509 | 10,510 | 10,511 | 10,512 | 10,513 |
| 2-422 | 10,526 | 10,527 | 10,528 | 10,529 | 10,530 | 10,531 | 10,532 | 10,533 | 10,534 | 10,535 | 10,536 | 10,537 | 10,538 |
| 2-423 | 10,551 | 10,552 | 10,553 | 10,554 | 10,555 | 10,556 | 10,557 | 10,558 | 10,559 | 10,560 | 10,561 | 10,562 | 10,563 |
| 2-424 | 10,576 | 10,577 | 10,578 | 10,579 | 10,580 | 10,581 | 10,582 | 10,583 | 10,584 | 10,585 | 10,586 | 10,587 | 10,588 |
| 2-425 | 10,601 | 10,602 | 10,603 | 10,604 | 10,605 | 10,606 | 10,607 | 10,608 | 10,609 | 10,610 | 10,611 | 10,612 | 10,613 |
| 2-426 | 10,626 | 10,627 | 10,628 | 10,629 | 10,630 | 10,631 | 10,632 | 10,633 | 10,634 | 10,635 | 10,636 | 10,637 | 10,638 |
| 2-427 | 10,651 | 10,652 | 10,653 | 10,654 | 10,655 | 10,656 | 10,657 | 10,658 | 10,659 | 10,660 | 10,661 | 10,662 | 10,663 |
| 2-428 | 10,676 | 10,677 | 10,678 | 10,679 | 10,680 | 10,681 | 10,682 | 10,683 | 10,684 | 10,685 | 10,686 | 10,687 | 10,688 |
| 2-429 | 10,701 | 10,702 | 10,703 | 10,704 | 10,705 | 10,706 | 10,707 | 10,708 | 10,709 | 10,710 | 10,711 | 10,712 | 10,713 |
| 2-430 | 10,726 | 10,727 | 10,728 | 10,729 | 10,730 | 10,731 | 10,732 | 10,733 | 10,734 | 10,735 | 10,736 | 10,737 | 10,738 |
| 2-431 | 10,751 | 10,752 | 10,753 | 10,754 | 10,755 | 10,756 | 10,757 | 10,758 | 10,759 | 10,760 | 10,761 | 10,762 | 10,763 |
| 2-432 | 10,776 | 10,777 | 10,778 | 10,779 | 10,780 | 10,781 | 10,782 | 10,783 | 10,784 | 10,785 | 10,786 | 10,787 | 10,788 |
| 2-433 | 10,801 | 10,802 | 10,803 | 10,804 | 10,805 | 10,806 | 10,807 | 10,808 | 10,809 | 10,810 | 10,811 | 10,812 | 10,813 |
| 2-434 | 10,826 | 10,827 | 10,828 | 10,829 | 10,830 | 10,831 | 10,832 | 10,833 | 10,834 | 10,835 | 10,836 | 10,837 | 10,838 |
| 2-435 | 10,851 | 10,852 | 10,853 | 10,854 | 10,855 | 10,856 | 10,857 | 10,858 | 10,859 | 10,860 | 10,861 | 10,862 | 10,863 |
| 2-436 | 10,876 | 10,877 | 10,878 | 10,879 | 10,880 | 10,881 | 10,882 | 10,883 | 10,884 | 10,885 | 10,886 | 10,887 | 10,888 |
| 2-437 | 10,901 | 10,902 | 10,903 | 10,904 | 10,905 | 10,906 | 10,907 | 10,908 | 10,909 | 10,910 | 10,911 | 10,912 | 10,913 |
| 2-438 | 10,926 | 10,927 | 10,928 | 10,929 | 10,930 | 10,931 | 10,932 | 10,933 | 10,934 | 10,935 | 10,936 | 10,937 | 10,938 |
| 2-439 | 10,951 | 10,952 | 10,953 | 10,954 | 10,955 | 10,956 | 10,957 | 10,958 | 10,959 | 10,960 | 10,961 | 10,962 | 10,963 |
| 2-440 | 10,976 | 10,977 | 10,978 | 10,979 | 10,980 | 10,981 | 10,982 | 10,983 | 10,984 | 10,985 | 10,986 | 10,987 | 10,988 |

| | | Compound represented by the formula (1) | | | | | | | | | | | |
|---|---|---|---|---|---|---|---|---|---|---|---|---|---|
| | | 1-14 | 1-15 | 1-16 | 1-17 | 1-18 | 1-19 | 1-20 | 1-21 | 1-22 | 1-23 | 1-24 | 1-25 |
| Compound represented by the formula (2) | 2-386 | 9,639 | 9,640 | 9,641 | 9,642 | 9,643 | 9,644 | 9,645 | 9,646 | 9,647 | 9,648 | 9,649 | 9,650 |
| | 2-387 | 9,664 | 9,665 | 9,666 | 9,667 | 9,668 | 9,669 | 9,670 | 9,671 | 9,672 | 9,673 | 9,674 | 9,675 |
| | 2-388 | 9,689 | 9,690 | 9,691 | 9,692 | 9,693 | 9,694 | 9,695 | 9,696 | 9,697 | 9,698 | 9,699 | 9,700 |
| | 2-389 | 9,714 | 9,715 | 9,716 | 9,717 | 9,718 | 9,719 | 9,720 | 9,721 | 9,722 | 9,723 | 9,724 | 9,725 |
| | 2-390 | 9,739 | 9,740 | 9,741 | 9,742 | 9,743 | 9,744 | 9,745 | 9,746 | 9,747 | 9,748 | 9,749 | 9,750 |
| | 2-391 | 9,764 | 9,765 | 9,766 | 9,767 | 9,768 | 9,769 | 9,770 | 9,771 | 9,772 | 9,773 | 9,774 | 9,775 |
| | 2-392 | 9,789 | 9,790 | 9,791 | 9,792 | 9,793 | 9,794 | 9,795 | 9,796 | 9,797 | 9,798 | 9,799 | 9,800 |
| | 2-393 | 9,814 | 9,815 | 9,816 | 9,817 | 9,818 | 9,819 | 9,820 | 9,821 | 9,822 | 9,823 | 9,824 | 9,825 |
| | 2-394 | 9,839 | 9,840 | 9,841 | 9,842 | 9,843 | 9,844 | 9,845 | 9,846 | 9,847 | 9,848 | 9,849 | 9,850 |
| | 2-395 | 9,864 | 9,865 | 9,866 | 9,867 | 9,868 | 9,869 | 9,870 | 9,871 | 9,872 | 9,873 | 9,874 | 9,875 |
| | 2-396 | 9,889 | 9,890 | 9,891 | 9,892 | 9,893 | 9,894 | 9,895 | 9,896 | 9,897 | 9,898 | 9,899 | 9,900 |
| | 2-397 | 9,914 | 9,915 | 9,916 | 9,917 | 9,918 | 9,919 | 9,920 | 9,921 | 9,922 | 9,923 | 9,924 | 9,925 |
| | 2-398 | 9,939 | 9,940 | 9,941 | 9,942 | 9,943 | 9,944 | 9,945 | 9,946 | 9,947 | 9,948 | 9,949 | 9,950 |
| | 2-399 | 9,964 | 9,965 | 9,966 | 9,967 | 9,968 | 9,969 | 9,970 | 9,971 | 9,972 | 9,973 | 9,974 | 9,975 |
| | 2-400 | 9,989 | 9,990 | 9,991 | 9,992 | 9,993 | 9,994 | 9,995 | 9,996 | 9,997 | 9,998 | 9,999 | 10,000 |
| | 2-401 | 10,014 | 10,015 | 10,016 | 10,017 | 10,018 | 10,019 | 10,020 | 10,021 | 10,022 | 10,023 | 10,024 | 10,025 |
| | 2-402 | 10,039 | 10,040 | 10,041 | 10,042 | 10,043 | 10,044 | 10,045 | 10,046 | 10,047 | 10,048 | 10,049 | 10,050 |
| | 2-403 | 10,064 | 10,065 | 10,066 | 10,067 | 10,068 | 10,069 | 10,070 | 10,071 | 10,072 | 10,073 | 10,074 | 10,075 |
| | 2-404 | 10,089 | 10,090 | 10,091 | 10,092 | 10,093 | 10,094 | 10,095 | 10,096 | 10,097 | 10,098 | 10,099 | 10,100 |
| | 2-405 | 10,114 | 10,115 | 10,116 | 10,117 | 10,118 | 10,119 | 10,120 | 10,121 | 10,122 | 10,123 | 10,124 | 10,125 |
| | 2-406 | 10,139 | 10,140 | 10,141 | 10,142 | 10,143 | 10,144 | 10,145 | 10,146 | 10,147 | 10,148 | 10,149 | 10,150 |
| | 2-407 | 10,164 | 10,165 | 10,166 | 10,167 | 10,168 | 10,169 | 10,170 | 10,171 | 10,172 | 10,173 | 10,174 | 10,175 |
| | 2-408 | 10,189 | 10,190 | 10,191 | 10,192 | 10,193 | 10,194 | 10,195 | 10,196 | 10,197 | 10,198 | 10,199 | 10,200 |
| | 2-409 | 10,214 | 10,215 | 10,216 | 10,217 | 10,218 | 10,219 | 10,220 | 10,221 | 10,222 | 10,223 | 10,224 | 10,225 |
| | 2-410 | 10,239 | 10,240 | 10,241 | 10,242 | 10,243 | 10,244 | 10,245 | 10,246 | 10,247 | 10,248 | 10,249 | 10,250 |
| | 2-411 | 10,264 | 10,265 | 10,266 | 10,267 | 10,268 | 10,269 | 10,270 | 10,271 | 10,272 | 10,273 | 10,274 | 10,275 |
| | 2-412 | 10,289 | 10,290 | 10,291 | 10,292 | 10,293 | 10,294 | 10,295 | 10,296 | 10,297 | 10,298 | 10,299 | 10,300 |
| | 2-413 | 10,314 | 10,315 | 10,316 | 10,317 | 10,318 | 10,319 | 10,320 | 10,321 | 10,322 | 10,323 | 10,324 | 10,325 |
| | 2-414 | 10,339 | 10,340 | 10,341 | 10,342 | 10,343 | 10,344 | 10,345 | 10,346 | 10,347 | 10,348 | 10,349 | 10,350 |
| | 2-415 | 10,364 | 10,365 | 10,366 | 10,367 | 10,368 | 10,369 | 10,370 | 10,371 | 10,372 | 10,373 | 10,374 | 10,375 |
| | 2-416 | 10,389 | 10,390 | 10,391 | 10,392 | 10,393 | 10,394 | 10,395 | 10,396 | 10,397 | 10,398 | 10,399 | 10,400 |

TABLE 8-continued

| | | | | | | | | | | | | |
|---|---|---|---|---|---|---|---|---|---|---|---|---|
| 2-417 | 10,414 | 10,415 | 10,416 | 10,417 | 10,418 | 10,419 | 10,420 | 10,421 | 10,422 | 10,423 | 10,424 | 10,425 |
| 2-418 | 10,439 | 10,440 | 10,441 | 10,442 | 10,443 | 10,444 | 10,445 | 10,446 | 10,447 | 10,448 | 10,449 | 10,450 |
| 2-419 | 10,464 | 10,465 | 10,466 | 10,467 | 10,468 | 10,469 | 10,470 | 10,471 | 10,472 | 10,473 | 10,474 | 10,475 |
| 2-420 | 10,489 | 10,490 | 10,491 | 10,492 | 10,493 | 10,494 | 10,495 | 10,496 | 10,497 | 10,498 | 10,499 | 10,500 |
| 2-421 | 10,514 | 10,515 | 10,516 | 10,517 | 10,518 | 10,519 | 10,520 | 10,521 | 10,522 | 10,523 | 10,524 | 10,525 |
| 2-422 | 10,539 | 10,540 | 10,541 | 10,542 | 10,543 | 10,544 | 10,545 | 10,546 | 10,547 | 10,548 | 10,549 | 10,550 |
| 2-423 | 10,564 | 10,565 | 10,566 | 10,567 | 10,568 | 10,569 | 10,570 | 10,571 | 10,572 | 10,573 | 10,574 | 10,575 |
| 2-424 | 10,589 | 10,590 | 10,591 | 10,592 | 10,593 | 10,594 | 10,595 | 10,596 | 10,597 | 10,598 | 10,599 | 10,600 |
| 2-425 | 10,614 | 10,615 | 10,616 | 10,617 | 10,618 | 10,619 | 10,620 | 10,621 | 10,622 | 10,623 | 10,624 | 10,625 |
| 2-426 | 10,639 | 10,640 | 10,641 | 10,642 | 10,643 | 10,644 | 10,645 | 10,646 | 10,647 | 10,648 | 10,649 | 10,650 |
| 2-427 | 10,664 | 10,665 | 10,666 | 10,667 | 10,668 | 10,669 | 10,670 | 10,671 | 10,672 | 10,673 | 10,674 | 10,675 |
| 2-428 | 10,689 | 10,690 | 10,691 | 10,692 | 10,693 | 10,694 | 10,695 | 10,696 | 10,697 | 10,698 | 10,699 | 10,700 |
| 2-429 | 10,714 | 10,715 | 10,716 | 10,717 | 10,718 | 10,719 | 10,720 | 10,721 | 10,722 | 10,723 | 10,724 | 10,725 |
| 2-430 | 10,739 | 10,740 | 10,741 | 10,742 | 10,743 | 10,744 | 10,745 | 10,746 | 10,747 | 10,748 | 10,749 | 10,750 |
| 2-431 | 10,764 | 10,765 | 10,766 | 10,767 | 10,768 | 10,769 | 10,770 | 10,771 | 10,772 | 10,773 | 10,774 | 10,775 |
| 2-432 | 10,789 | 10,790 | 10,791 | 10,792 | 10,793 | 10,794 | 10,795 | 10,796 | 10,797 | 10,798 | 10,799 | 10,800 |
| 2-433 | 10,814 | 10,815 | 10,816 | 10,817 | 10,818 | 10,819 | 10,820 | 10,821 | 10,822 | 10,823 | 10,824 | 10,825 |
| 2-434 | 10,839 | 10,840 | 10,841 | 10,842 | 10,843 | 10,844 | 10,845 | 10,846 | 10,847 | 10,848 | 10,849 | 10,850 |
| 2-435 | 10,864 | 10,865 | 10,866 | 10,867 | 10,868 | 10,869 | 10,870 | 10,871 | 10,872 | 10,873 | 10,874 | 10,875 |
| 2-436 | 10,889 | 10,890 | 10,891 | 10,892 | 10,893 | 10,894 | 10,895 | 10,896 | 10,897 | 10,898 | 10,899 | 10,900 |
| 2-437 | 10,914 | 10,915 | 10,916 | 10,917 | 10,918 | 10,919 | 10,920 | 10,921 | 10,922 | 10,923 | 10,924 | 10,925 |
| 2-438 | 10,939 | 10,940 | 10,941 | 10,942 | 10,943 | 10,944 | 10,945 | 10,946 | 10,947 | 10,948 | 10,949 | 10,950 |
| 2-439 | 10,964 | 10,965 | 10,966 | 10,967 | 10,968 | 10,969 | 10,970 | 10,971 | 10,972 | 10,973 | 10,974 | 10,975 |
| 2-440 | 10,989 | 10,990 | 10,991 | 10,992 | 10,993 | 10,994 | 10,995 | 10,996 | 10,997 | 10,998 | 10,999 | 11,000 |

TABLE 9

| | | Compound represented by the formula (1) | | | | | | | | | | | | |
|---|---|---|---|---|---|---|---|---|---|---|---|---|---|---|
| | | 1-1 | 1-2 | 1-3 | 1-4 | 1-5 | 1-6 | 1-7 | 1-8 | 1-9 | 1-10 | 1-11 | 1-12 | 1-13 |
| Compound represented by the formula (2) | 2-441 | 11,001 | 11,002 | 11,003 | 11,004 | 11,005 | 11,006 | 11,007 | 11,008 | 11,009 | 11,010 | 11,011 | 11,012 | 11,013 |
| | 2-442 | 11,026 | 11,027 | 11,028 | 11,029 | 11,030 | 11,031 | 11,032 | 11,033 | 11,034 | 11,035 | 11,036 | 11,037 | 11,038 |
| | 2-443 | 11,051 | 11,052 | 11,053 | 11,054 | 11,055 | 11,056 | 11,057 | 11,058 | 11,059 | 11,060 | 11,061 | 11,062 | 11,063 |
| | 2-444 | 11,076 | 11,077 | 11,078 | 11,079 | 11,080 | 11,081 | 11,082 | 11,083 | 11,084 | 11,085 | 11,086 | 11,087 | 11,088 |
| | 2-445 | 11,101 | 11,102 | 11,103 | 11,104 | 11,105 | 11,106 | 11,107 | 11,108 | 11,109 | 11,110 | 11,111 | 11,112 | 11,113 |
| | 2-446 | 11,126 | 11,127 | 11,128 | 11,129 | 11,130 | 11,131 | 11,132 | 11,133 | 11,134 | 11,135 | 11,136 | 11,137 | 11,138 |
| | 2-447 | 11,151 | 11,152 | 11,153 | 11,154 | 11,155 | 11,156 | 11,157 | 11,158 | 11,159 | 11,160 | 11,161 | 11,162 | 11,163 |
| | 2-448 | 11,176 | 11,177 | 11,178 | 11,179 | 11,180 | 11,181 | 11,182 | 11,183 | 11,184 | 11,185 | 11,186 | 11,187 | 11,188 |
| | 2-449 | 11,201 | 11,202 | 11,203 | 11,204 | 11,205 | 11,206 | 11,207 | 11,208 | 11,209 | 11,210 | 11,211 | 11,212 | 11,213 |
| | 2-450 | 11,226 | 11,227 | 11,228 | 11,229 | 11,230 | 11,231 | 11,232 | 11,233 | 11,234 | 11,235 | 11,236 | 11,237 | 11,238 |
| | 2-451 | 11,251 | 11,252 | 11,253 | 11,254 | 11,255 | 11,256 | 11,257 | 11,258 | 11,259 | 11,260 | 11,261 | 11,262 | 11,263 |
| | 2-452 | 11,276 | 11,277 | 11,278 | 11,279 | 11,280 | 11,281 | 11,282 | 11,283 | 11,284 | 11,285 | 11,286 | 11,287 | 11,288 |
| | 2-453 | 11,301 | 11,302 | 11,303 | 11,304 | 11,305 | 11,306 | 11,307 | 11,308 | 11,309 | 11,310 | 11,311 | 11,312 | 11,313 |
| | 2-454 | 11,326 | 11,327 | 11,328 | 11,329 | 11,330 | 11,331 | 11,332 | 11,333 | 11,334 | 11,335 | 11,336 | 11,337 | 11,338 |
| | 2-455 | 11,351 | 11,352 | 11,353 | 11,354 | 11,355 | 11,356 | 11,357 | 11,358 | 11,359 | 11,360 | 11,361 | 11,362 | 11,363 |
| | 2-456 | 11,376 | 11,377 | 11,378 | 11,379 | 11,380 | 11,381 | 11,382 | 11,383 | 11,384 | 11,385 | 11,386 | 11,387 | 11,388 |
| | 2-457 | 11,401 | 11,402 | 11,403 | 11,404 | 11,405 | 11,406 | 11,407 | 11,408 | 11,409 | 11,410 | 11,411 | 11,412 | 11,413 |
| | 2-458 | 11,426 | 11,427 | 11,428 | 11,429 | 11,430 | 11,431 | 11,432 | 11,433 | 11,434 | 11,435 | 11,436 | 11,437 | 11,438 |
| | 2-459 | 11,451 | 11,452 | 11,453 | 11,454 | 11,455 | 11,456 | 11,457 | 11,458 | 11,459 | 11,460 | 11,461 | 11,462 | 11,463 |
| | 2-460 | 11,476 | 11,477 | 11,478 | 11,479 | 11,480 | 11,481 | 11,482 | 11,483 | 11,484 | 11,485 | 11,486 | 11,487 | 11,488 |
| | 2-461 | 11,501 | 11,502 | 11,503 | 11,504 | 11,505 | 11,506 | 11,507 | 11,508 | 11,509 | 11,510 | 11,511 | 11,512 | 11,513 |
| | 2-462 | 11,526 | 11,527 | 11,528 | 11,529 | 11,530 | 11,531 | 11,532 | 11,533 | 11,534 | 11,535 | 11,536 | 11,537 | 11,538 |
| | 2-463 | 11,551 | 11,552 | 11,553 | 11,554 | 11,555 | 11,556 | 11,557 | 11,558 | 11,559 | 11,560 | 11,561 | 11,562 | 11,563 |
| | 2-464 | 11,576 | 11,577 | 11,578 | 11,579 | 11,580 | 11,581 | 11,582 | 11,583 | 11,584 | 11,585 | 11,586 | 11,587 | 11,588 |
| | 2-465 | 11,601 | 11,602 | 11,603 | 11,604 | 11,605 | 11,606 | 11,607 | 11,608 | 11,609 | 11,610 | 11,611 | 11,612 | 11,613 |
| | 2-466 | 11,626 | 11,627 | 11,628 | 11,629 | 11,630 | 11,631 | 11,632 | 11,633 | 11,634 | 11,635 | 11,636 | 11,637 | 11,638 |
| | 2-467 | 11,651 | 11,652 | 11,653 | 11,654 | 11,655 | 11,656 | 11,657 | 11,658 | 11,659 | 11,660 | 11,661 | 11,662 | 11,663 |
| | 2-468 | 11,676 | 11,677 | 11,678 | 11,679 | 11,680 | 11,681 | 11,682 | 11,683 | 11,684 | 11,685 | 11,686 | 11,687 | 11,688 |
| | 2-469 | 11,701 | 11,702 | 11,703 | 11,704 | 11,705 | 11,706 | 11,707 | 11,708 | 11,709 | 11,710 | 11,711 | 11,712 | 11,713 |
| | 2-470 | 11,726 | 11,727 | 11,728 | 11,729 | 11,730 | 11,731 | 11,732 | 11,733 | 11,734 | 11,735 | 11,736 | 11,737 | 11,738 |
| | 2-471 | 11,751 | 11,752 | 11,753 | 11,754 | 11,755 | 11,756 | 11,757 | 11,758 | 11,759 | 11,760 | 11,761 | 11,762 | 11,763 |
| | 2-472 | 11,776 | 11,777 | 11,778 | 11,779 | 11,780 | 11,781 | 11,782 | 11,783 | 11,784 | 11,785 | 11,786 | 11,787 | 11,788 |
| | 2-473 | 11,801 | 11,802 | 11,803 | 11,804 | 11,805 | 11,806 | 11,807 | 11,808 | 11,809 | 11,810 | 11,811 | 11,812 | 11,813 |
| | 2-474 | 11,826 | 11,827 | 11,828 | 11,829 | 11,830 | 11,831 | 11,832 | 11,833 | 11,834 | 11,835 | 11,836 | 11,837 | 11,838 |
| | 2-475 | 11,851 | 11,852 | 11,853 | 11,854 | 11,855 | 11,856 | 11,857 | 11,858 | 11,859 | 11,860 | 11,861 | 11,862 | 11,863 |

| | | Compound represented by the formula (1) | | | | | | | | | | | |
|---|---|---|---|---|---|---|---|---|---|---|---|---|---|
| | | 1-14 | 1-15 | 1-16 | 1-17 | 1-18 | 1-19 | 1-20 | 1-21 | 1-22 | 1-23 | 1-24 | 1-25 |
| Compound represented by the formula (2) | 2-441 | 11,014 | 11,015 | 11,016 | 11,017 | 11,018 | 11,019 | 11,020 | 11,021 | 11,022 | 11,023 | 11,024 | 11,025 |
| | 2-442 | 11,039 | 11,040 | 11,041 | 11,042 | 11,043 | 11,044 | 11,045 | 11,046 | 11,047 | 11,048 | 11,049 | 11,050 |
| | 2-443 | 11,064 | 11,065 | 11,066 | 11,067 | 11,068 | 11,069 | 11,070 | 11,071 | 11,072 | 11,073 | 11,074 | 11,075 |
| | 2-444 | 11,089 | 11,090 | 11,091 | 11,092 | 11,093 | 11,094 | 11,095 | 11,096 | 11,097 | 11,098 | 11,099 | 11,100 |
| | 2-445 | 11,114 | 11,115 | 11,116 | 11,117 | 11,118 | 11,119 | 11,120 | 11,121 | 11,122 | 11,123 | 11,124 | 11,125 |
| | 2-446 | 11,139 | 11,140 | 11,141 | 11,142 | 11,143 | 11,144 | 11,145 | 11,146 | 11,147 | 11,148 | 11,149 | 11,150 |

TABLE 9-continued

| | | | | | | | | | | | | |
|---|---|---|---|---|---|---|---|---|---|---|---|---|
| 2-447 | 11,164 | 11,165 | 11,166 | 11,167 | 11,168 | 11,169 | 11,170 | 11,171 | 11,172 | 11,173 | 11,174 | 11,175 |
| 2-448 | 11,189 | 11,190 | 11,191 | 11,192 | 11,193 | 11,194 | 11,195 | 11,196 | 11,197 | 11,198 | 11,199 | 11,200 |
| 2-449 | 11,214 | 11,215 | 11,216 | 11,217 | 11,218 | 11,219 | 11,220 | 11,221 | 11,222 | 11,223 | 11,224 | 11,225 |
| 2-450 | 11,239 | 11,240 | 11,241 | 11,242 | 11,243 | 11,244 | 11,245 | 11,246 | 11,247 | 11,248 | 11,249 | 11,250 |
| 2-451 | 11,264 | 11,265 | 11,266 | 11,267 | 11,268 | 11,269 | 11,270 | 11,271 | 11,272 | 11,273 | 11,274 | 11,275 |
| 2-452 | 11,289 | 11,290 | 11,291 | 11,292 | 11,293 | 11,294 | 11,295 | 11,296 | 11,297 | 11,298 | 11,299 | 11,300 |
| 2-453 | 11,314 | 11,315 | 11,316 | 11,317 | 11,318 | 11,319 | 11,320 | 11,321 | 11,322 | 11,323 | 11,324 | 11,325 |
| 2-454 | 11,339 | 11,340 | 11,341 | 11,342 | 11,343 | 11,344 | 11,345 | 11,346 | 11,347 | 11,348 | 11,349 | 11,350 |
| 2-455 | 11,364 | 11,365 | 11,366 | 11,367 | 11,368 | 11,369 | 11,370 | 11,371 | 11,372 | 11,373 | 11,374 | 11,375 |
| 2-456 | 11,389 | 11,390 | 11,391 | 11,392 | 11,393 | 11,394 | 11,395 | 11,396 | 11,397 | 11,398 | 11,399 | 11,400 |
| 2-457 | 11,414 | 11,415 | 11,416 | 11,417 | 11,418 | 11,419 | 11,420 | 11,421 | 11,422 | 11,423 | 11,424 | 11,425 |
| 2-458 | 11,439 | 11,440 | 11,441 | 11,442 | 11,443 | 11,444 | 11,445 | 11,446 | 11,447 | 11,448 | 11,449 | 11,450 |
| 2-459 | 11,464 | 11,465 | 11,466 | 11,467 | 11,468 | 11,469 | 11,470 | 11,471 | 11,472 | 11,473 | 11,474 | 11,475 |
| 2-460 | 11,489 | 11,490 | 11,491 | 11,492 | 11,493 | 11,494 | 11,495 | 11,496 | 11,497 | 11,498 | 11,499 | 11,500 |
| 2-461 | 11,514 | 11,515 | 11,516 | 11,517 | 11,518 | 11,519 | 11,520 | 11,521 | 11,522 | 11,523 | 11,524 | 11,525 |
| 2-462 | 11,539 | 11,540 | 11,541 | 11,542 | 11,543 | 11,544 | 11,545 | 11,546 | 11,547 | 11,548 | 11,549 | 11,550 |
| 2-463 | 11,564 | 11,565 | 11,566 | 11,567 | 11,568 | 11,569 | 11,570 | 11,571 | 11,572 | 11,573 | 11,574 | 11,575 |
| 2-464 | 11,589 | 11,590 | 11,591 | 11,592 | 11,593 | 11,594 | 11,595 | 11,596 | 11,597 | 11,598 | 11,599 | 11,600 |
| 2-465 | 11,614 | 11,615 | 11,616 | 11,617 | 11,618 | 11,619 | 11,620 | 11,621 | 11,622 | 11,623 | 11,624 | 11,625 |
| 2-466 | 11,639 | 11,640 | 11,641 | 11,642 | 11,643 | 11,644 | 11,645 | 11,646 | 11,647 | 11,648 | 11,649 | 11,650 |
| 2-467 | 11,664 | 11,665 | 11,666 | 11,667 | 11,668 | 11,669 | 11,670 | 11,671 | 11,672 | 11,673 | 11,674 | 11,675 |
| 2-468 | 11,689 | 11,690 | 11,691 | 11,692 | 11,693 | 11,694 | 11,695 | 11,696 | 11,697 | 11,698 | 11,699 | 11,700 |
| 2-469 | 11,714 | 11,715 | 11,716 | 11,717 | 11,718 | 11,719 | 11,720 | 11,721 | 11,722 | 11,723 | 11,724 | 11,725 |
| 2-470 | 11,739 | 11,740 | 11,741 | 11,742 | 11,743 | 11,744 | 11,745 | 11,746 | 11,747 | 11,748 | 11,749 | 11,750 |
| 2-471 | 11,764 | 11,765 | 11,766 | 11,767 | 11,768 | 11,769 | 11,770 | 11,771 | 11,772 | 11,773 | 11,774 | 11,775 |
| 2-472 | 11,789 | 11,790 | 11,791 | 11,792 | 11,793 | 11,794 | 11,795 | 11,796 | 11,797 | 11,798 | 11,799 | 11,800 |
| 2-473 | 11,814 | 11,815 | 11,816 | 11,817 | 11,818 | 11,819 | 11,820 | 11,821 | 11,822 | 11,823 | 11,824 | 11,825 |
| 2-474 | 11,839 | 11,840 | 11,841 | 11,842 | 11,843 | 11,844 | 11,845 | 11,846 | 11,847 | 11,848 | 11,849 | 11,850 |
| 2-475 | 11,864 | 11,865 | 11,866 | 11,867 | 11,868 | 11,869 | 11,870 | 11,871 | 11,872 | 11,873 | 11,874 | 11,875 |

TABLE 10

| | | Compound represented by the formula (1) | | | | | | | | | | | | |
|---|---|---|---|---|---|---|---|---|---|---|---|---|---|---|
| | | 1-1 | 1-2 | 1-3 | 1-4 | 1-5 | 1-6 | 1-7 | 1-8 | 1-9 | 1-10 | 1-11 | 1-12 | 1-13 |
| Compound represented by the formula (2) | 2-1 | 11,876 | 11,877 | 11,878 | 11,879 | 11,880 | 11,881 | 11,882 | 11,883 | 11,884 | 11,885 | 11,886 | 11,887 | 11,888 |
| | 2-2 | 11,901 | 11,902 | 11,903 | 11,904 | 11,905 | 11,906 | 11,907 | 11,908 | 11,909 | 11,910 | 11,911 | 11,912 | 11,913 |
| | 2-3 | 11,926 | 11,927 | 11,928 | 11,929 | 11,930 | 11,931 | 11,932 | 11,933 | 11,934 | 11,935 | 11,936 | 11,937 | 11,938 |
| | 2-4 | 11,951 | 11,952 | 11,953 | 11,954 | 11,955 | 11,956 | 11,957 | 11,958 | 11,959 | 11,960 | 11,961 | 11,962 | 11,963 |
| | 2-5 | 11,976 | 11,977 | 11,978 | 11,979 | 11,980 | 11,981 | 11,982 | 11,983 | 11,984 | 11,985 | 11,986 | 11,987 | 11,988 |
| | 2-6 | 12,001 | 12,002 | 12,003 | 12,004 | 12,005 | 12,006 | 12,007 | 12,008 | 12,009 | 12,010 | 12,011 | 12,012 | 12,013 |
| | 2-7 | 12,026 | 12,027 | 12,028 | 12,029 | 12,030 | 12,031 | 12,032 | 12,033 | 12,034 | 12,035 | 12,036 | 12,037 | 12,038 |
| | 2-8 | 12,051 | 12,052 | 12,053 | 12,054 | 12,055 | 12,056 | 12,057 | 12,058 | 12,059 | 12,060 | 12,061 | 12,062 | 12,063 |
| | 2-9 | 12,076 | 12,077 | 12,078 | 12,079 | 12,080 | 12,081 | 12,082 | 12,083 | 12,084 | 12,085 | 12,086 | 12,087 | 12,088 |
| | 2-10 | 12,101 | 12,102 | 12,103 | 12,104 | 12,105 | 12,106 | 12,107 | 12,108 | 12,109 | 12,110 | 12,111 | 12,112 | 12,113 |
| | 2-11 | 12,126 | 12,127 | 12,128 | 12,129 | 12,130 | 12,131 | 12,132 | 12,133 | 12,134 | 12,135 | 12,136 | 12,137 | 12,138 |
| | 2-12 | 12,151 | 12,152 | 12,153 | 12,154 | 12,155 | 12,156 | 12,157 | 12,158 | 12,159 | 12,160 | 12,161 | 12,162 | 12,163 |
| | 2-13 | 12,176 | 12,177 | 12,178 | 12,179 | 12,180 | 12,181 | 12,182 | 12,183 | 12,184 | 12,185 | 12,186 | 12,187 | 12,188 |
| | 2-14 | 12,201 | 12,202 | 12,203 | 12,204 | 12,205 | 12,206 | 12,207 | 12,208 | 12,209 | 12,210 | 12,211 | 12,212 | 12,213 |
| | 2-15 | 12,226 | 12,227 | 12,228 | 12,229 | 12,230 | 12,231 | 12,232 | 12,233 | 12,234 | 12,235 | 12,236 | 12,237 | 12,238 |
| | 2-16 | 12,251 | 12,252 | 12,253 | 12,254 | 12,255 | 12,256 | 12,257 | 12,258 | 12,259 | 12,260 | 12,261 | 12,262 | 12,263 |
| | 2-17 | 12,276 | 12,277 | 12,278 | 12,279 | 12,280 | 12,281 | 12,282 | 12,283 | 12,284 | 12,285 | 12,286 | 12,287 | 12,288 |
| | 2-18 | 12,301 | 12,302 | 12,303 | 12,304 | 12,305 | 12,306 | 12,307 | 12,308 | 12,309 | 12,310 | 12,311 | 12,312 | 12,313 |
| | 2-19 | 12,326 | 12,327 | 12,328 | 12,329 | 12,330 | 12,331 | 12,332 | 12,333 | 12,334 | 12,335 | 12,336 | 12,337 | 12,338 |
| | 2-20 | 12,351 | 12,352 | 12,353 | 12,354 | 12,355 | 12,356 | 12,357 | 12,358 | 12,359 | 12,360 | 12,361 | 12,362 | 12,363 |
| | 2-21 | 12,376 | 12,377 | 12,378 | 12,379 | 12,380 | 12,381 | 12,382 | 12,383 | 12,384 | 12,385 | 12,386 | 12,387 | 12,388 |
| | 2-22 | 12,401 | 12,402 | 12,403 | 12,404 | 12,405 | 12,406 | 12,407 | 12,408 | 12,409 | 12,410 | 12,411 | 12,412 | 12,413 |
| | 2-23 | 12,426 | 12,427 | 12,428 | 12,429 | 12,430 | 12,431 | 12,432 | 12,433 | 12,434 | 12,435 | 12,436 | 12,437 | 12,438 |
| | 2-24 | 12,451 | 12,452 | 12,453 | 12,454 | 12,455 | 12,456 | 12,457 | 12,458 | 12,459 | 12,460 | 12,461 | 12,462 | 12,463 |
| | 2-25 | 12,476 | 12,477 | 12,478 | 12,479 | 12,480 | 12,481 | 12,482 | 12,483 | 12,484 | 12,485 | 12,486 | 12,487 | 12,488 |
| | 2-26 | 12,501 | 12,502 | 12,503 | 12,504 | 12,505 | 12,506 | 12,507 | 12,508 | 12,509 | 12,510 | 12,511 | 12,512 | 12,513 |
| | 2-27 | 12,526 | 12,527 | 12,528 | 12,529 | 12,530 | 12,531 | 12,532 | 12,533 | 12,534 | 12,535 | 12,536 | 12,537 | 12,538 |
| | 2-28 | 12,551 | 12,552 | 12,553 | 12,554 | 12,555 | 12,556 | 12,557 | 12,558 | 12,559 | 12,560 | 12,561 | 12,562 | 12,563 |
| | 2-29 | 12,576 | 12,577 | 12,578 | 12,579 | 12,580 | 12,581 | 12,582 | 12,583 | 12,584 | 12,585 | 12,586 | 12,587 | 12,588 |
| | 2-30 | 12,601 | 12,602 | 12,603 | 12,604 | 12,605 | 12,606 | 12,607 | 12,608 | 12,609 | 12,610 | 12,611 | 12,612 | 12,613 |
| | 2-31 | 12,626 | 12,627 | 12,628 | 12,629 | 12,630 | 12,631 | 12,632 | 12,633 | 12,634 | 12,635 | 12,636 | 12,637 | 12,638 |
| | 2-32 | 12,651 | 12,652 | 12,653 | 12,654 | 12,655 | 12,656 | 12,657 | 12,658 | 12,659 | 12,660 | 12,661 | 12,662 | 12,663 |
| | 2-33 | 12,676 | 12,677 | 12,678 | 12,679 | 12,680 | 12,681 | 12,682 | 12,683 | 12,684 | 12,685 | 12,686 | 12,687 | 12,688 |
| | 2-34 | 12,701 | 12,702 | 12,703 | 12,704 | 12,705 | 12,706 | 12,707 | 12,708 | 12,709 | 12,710 | 12,711 | 12,712 | 12,713 |
| | 2-35 | 12,726 | 12,727 | 12,728 | 12,729 | 12,730 | 12,731 | 12,732 | 12,733 | 12,734 | 12,735 | 12,736 | 12,737 | 12,738 |
| | 2-36 | 12,751 | 12,752 | 12,753 | 12,754 | 12,755 | 12,756 | 12,757 | 12,758 | 12,759 | 12,760 | 12,761 | 12,762 | 12,763 |
| | 2-37 | 12,776 | 12,777 | 12,778 | 12,779 | 12,780 | 12,781 | 12,782 | 12,783 | 12,784 | 12,785 | 12,786 | 12,787 | 12,788 |
| | 2-38 | 12,801 | 12,802 | 12,803 | 12,804 | 12,805 | 12,806 | 12,807 | 12,808 | 12,809 | 12,810 | 12,811 | 12,812 | 12,813 |
| | 2-39 | 12,826 | 12,827 | 12,828 | 12,829 | 12,830 | 12,831 | 12,832 | 12,833 | 12,834 | 12,835 | 12,836 | 12,837 | 12,838 |
| | 2-40 | 12,851 | 12,852 | 12,853 | 12,854 | 12,855 | 12,856 | 12,857 | 12,858 | 12,859 | 12,860 | 12,861 | 12,862 | 12,863 |
| | 2-41 | 12,876 | 12,877 | 12,878 | 12,879 | 12,880 | 12,881 | 12,882 | 12,883 | 12,884 | 12,885 | 12,886 | 12,887 | 12,888 |

TABLE 10-continued

| | | | | | | | | | | | | | |
|---|---|---|---|---|---|---|---|---|---|---|---|---|---|
| 2-42 | 12,901 | 12,902 | 12,903 | 12,904 | 12,905 | 12,906 | 12,907 | 12,908 | 12,909 | 12,910 | 12,911 | 12,912 | 12,913 |
| 2-43 | 12,926 | 12,927 | 12,928 | 12,929 | 12,930 | 12,931 | 12,932 | 12,933 | 12,934 | 12,935 | 12,936 | 12,937 | 12,938 |
| 2-44 | 12,951 | 12,952 | 12,953 | 12,954 | 12,955 | 12,956 | 12,957 | 12,958 | 12,959 | 12,960 | 12,961 | 12,962 | 12,963 |
| 2-45 | 12,976 | 12,977 | 12,978 | 12,979 | 12,980 | 12,981 | 12,982 | 12,983 | 12,984 | 12,985 | 12,986 | 12,987 | 12,988 |
| 2-46 | 13,001 | 13,002 | 13,003 | 13,004 | 13,005 | 13,006 | 13,007 | 13,008 | 13,009 | 13,010 | 13,011 | 13,012 | 13,013 |
| 2-47 | 13,026 | 13,027 | 13,028 | 13,029 | 13,030 | 13,031 | 13,032 | 13,033 | 13,034 | 13,035 | 13,036 | 13,037 | 13,038 |
| 2-48 | 13,051 | 13,052 | 13,053 | 13,054 | 13,055 | 13,056 | 13,057 | 13,058 | 13,059 | 13,060 | 13,061 | 13,062 | 13,063 |
| 2-49 | 13,076 | 13,077 | 13,078 | 13,079 | 13,080 | 13,081 | 13,082 | 13,083 | 13,084 | 13,085 | 13,086 | 13,087 | 13,088 |
| 2-50 | 13,101 | 13,102 | 13,103 | 13,104 | 13,105 | 13,106 | 13,107 | 13,108 | 13,109 | 13,110 | 13,111 | 13,112 | 13,113 |
| 2-51 | 13,126 | 13,127 | 13,128 | 13,129 | 13,130 | 13,131 | 13,132 | 13,133 | 13,134 | 13,135 | 13,136 | 13,137 | 13,138 |
| 2-52 | 13,151 | 13,152 | 13,153 | 13,154 | 13,155 | 13,156 | 13,157 | 13,158 | 13,159 | 13,160 | 13,161 | 13,162 | 13,163 |
| 2-53 | 13,176 | 13,177 | 13,178 | 13,179 | 13,180 | 13,181 | 13,182 | 13,183 | 13,184 | 13,185 | 13,186 | 13,187 | 13,188 |
| 2-54 | 13,201 | 13,202 | 13,203 | 13,204 | 13,205 | 13,206 | 13,207 | 13,208 | 13,209 | 13,210 | 13,211 | 13,212 | 13,213 |
| 2-55 | 13,226 | 13,227 | 13,228 | 13,229 | 13,230 | 13,231 | 13,232 | 13,233 | 13,234 | 13,235 | 13,236 | 13,237 | 13,238 |

| | | Compound represented by the formula (1) | | | | | | | | | | | |
|---|---|---|---|---|---|---|---|---|---|---|---|---|---|
| | | 1-14 | 1-15 | 1-16 | 1-17 | 1-18 | 1-19 | 1-20 | 1-21 | 1-22 | 1-23 | 1-24 | 1-25 |
| Compound represented by the formula (2) | 2-1 | 11,889 | 11,890 | 11,891 | 11,892 | 11,893 | 11,894 | 11,895 | 11,896 | 11,897 | 11,898 | 11,899 | 11,900 |
| | 2-2 | 11,914 | 11,915 | 11,916 | 11,917 | 11,918 | 11,919 | 11,920 | 11,921 | 11,922 | 11,923 | 11,924 | 11,925 |
| | 2-3 | 11,939 | 11,940 | 11,941 | 11,942 | 11,943 | 11,944 | 11,945 | 11,946 | 11,947 | 11,948 | 11,949 | 11,950 |
| | 2-4 | 11,964 | 11,965 | 11,966 | 11,967 | 11,968 | 11,969 | 11,970 | 11,971 | 11,972 | 11,973 | 11,974 | 11,975 |
| | 2-5 | 11,989 | 11,990 | 11,991 | 11,992 | 11,993 | 11,994 | 11,995 | 11,996 | 11,997 | 11,998 | 11,999 | 12,000 |
| | 2-6 | 12,014 | 12,015 | 12,016 | 12,017 | 12,018 | 12,019 | 12,020 | 12,021 | 12,022 | 12,023 | 12,024 | 12,025 |
| | 2-7 | 12,039 | 12,040 | 12,041 | 12,042 | 12,043 | 12,044 | 12,045 | 12,046 | 12,047 | 12,048 | 12,049 | 12,050 |
| | 2-8 | 12,064 | 12,065 | 12,066 | 12,067 | 12,068 | 12,069 | 12,070 | 12,071 | 12,072 | 12,073 | 12,074 | 12,075 |
| | 2-9 | 12,089 | 12,090 | 12,091 | 12,092 | 12,093 | 12,094 | 12,095 | 12,096 | 12,097 | 12,098 | 12,099 | 12,100 |
| | 2-10 | 12,114 | 12,115 | 12,116 | 12,117 | 12,118 | 12,119 | 12,120 | 12,121 | 12,122 | 12,123 | 12,124 | 12,125 |
| | 2-11 | 12,139 | 12,140 | 12,141 | 12,142 | 12,143 | 12,144 | 12,145 | 12,146 | 12,147 | 12,148 | 12,149 | 12,150 |
| | 2-12 | 12,164 | 12,165 | 12,166 | 12,167 | 12,168 | 12,169 | 12,170 | 12,171 | 12,172 | 12,173 | 12,174 | 12,175 |
| | 2-13 | 12,189 | 12,190 | 12,191 | 12,192 | 12,193 | 12,194 | 12,195 | 12,196 | 12,197 | 12,198 | 12,199 | 12,200 |
| | 2-14 | 12,214 | 12,215 | 12,216 | 12,217 | 12,218 | 12,219 | 12,220 | 12,221 | 12,222 | 12,223 | 12,224 | 12,225 |
| | 2-15 | 12,239 | 12,240 | 12,241 | 12,242 | 12,243 | 12,244 | 12,245 | 12,246 | 12,247 | 12,248 | 12,249 | 12,250 |
| | 2-16 | 12,264 | 12,265 | 12,266 | 12,267 | 12,268 | 12,269 | 12,270 | 12,271 | 12,272 | 12,273 | 12,274 | 12,275 |
| | 2-17 | 12,289 | 12,290 | 12,291 | 12,292 | 12,293 | 12,294 | 12,295 | 12,296 | 12,297 | 12,298 | 12,299 | 12,300 |
| | 2-18 | 12,314 | 12,315 | 12,316 | 12,317 | 12,318 | 12,319 | 12,320 | 12,321 | 12,322 | 12,323 | 12,324 | 12,325 |
| | 2-19 | 12,339 | 12,340 | 12,341 | 12,342 | 12,343 | 12,344 | 12,345 | 12,346 | 12,347 | 12,348 | 12,349 | 12,350 |
| | 2-20 | 12,364 | 12,365 | 12,366 | 12,367 | 12,368 | 12,369 | 12,370 | 12,371 | 12,372 | 12,373 | 12,374 | 12,375 |
| | 2-21 | 12,389 | 12,390 | 12,391 | 12,392 | 12,393 | 12,394 | 12,395 | 12,396 | 12,397 | 12,398 | 12,399 | 12,400 |
| | 2-22 | 12,414 | 12,415 | 12,416 | 12,417 | 12,418 | 12,419 | 12,420 | 12,421 | 12,422 | 12,423 | 12,424 | 12,425 |
| | 2-23 | 12,439 | 12,440 | 12,441 | 12,442 | 12,443 | 12,444 | 12,445 | 12,446 | 12,447 | 12,448 | 12,449 | 12,450 |
| | 2-24 | 12,464 | 12,465 | 12,466 | 12,467 | 12,468 | 12,469 | 12,470 | 12,471 | 12,472 | 12,473 | 12,474 | 12,475 |
| | 2-25 | 12,489 | 12,490 | 12,491 | 12,492 | 12,493 | 12,494 | 12,495 | 12,496 | 12,497 | 12,498 | 12,499 | 12,500 |
| | 2-26 | 12,514 | 12,515 | 12,516 | 12,517 | 12,518 | 12,519 | 12,520 | 12,521 | 12,522 | 12,523 | 12,524 | 12,525 |
| | 2-27 | 12,539 | 12,540 | 12,541 | 12,542 | 12,543 | 12,544 | 12,545 | 12,546 | 12,547 | 12,548 | 12,549 | 12,550 |
| | 2-28 | 12,564 | 12,565 | 12,566 | 12,567 | 12,568 | 12,569 | 12,570 | 12,571 | 12,572 | 12,573 | 12,574 | 12,575 |
| | 2-29 | 12,589 | 12,590 | 12,591 | 12,592 | 12,593 | 12,594 | 12,595 | 12,596 | 12,597 | 12,598 | 12,599 | 12,600 |
| | 2-30 | 12,614 | 12,615 | 12,616 | 12,617 | 12,618 | 12,619 | 12,620 | 12,621 | 12,622 | 12,623 | 12,624 | 12,625 |
| | 2-31 | 12,639 | 12,640 | 12,641 | 12,642 | 12,643 | 12,644 | 12,645 | 12,646 | 12,647 | 12,648 | 12,649 | 12,650 |
| | 2-32 | 12,664 | 12,665 | 12,666 | 12,667 | 12,668 | 12,669 | 12,670 | 12,671 | 12,672 | 12,673 | 12,674 | 12,675 |
| | 2-33 | 12,689 | 12,690 | 12,691 | 12,692 | 12,693 | 12,694 | 12,695 | 12,696 | 12,697 | 12,698 | 12,699 | 12,700 |
| | 2-34 | 12,714 | 12,715 | 12,716 | 12,717 | 12,718 | 12,719 | 12,720 | 12,721 | 12,722 | 12,723 | 12,724 | 12,725 |
| | 2-35 | 12,739 | 12,740 | 12,741 | 12,742 | 12,743 | 12,744 | 12,745 | 12,746 | 12,747 | 12,748 | 12,749 | 12,750 |
| | 2-36 | 12,764 | 12,765 | 12,766 | 12,767 | 12,768 | 12,769 | 12,770 | 12,771 | 12,772 | 12,773 | 12,774 | 12,775 |
| | 2-37 | 12,789 | 12,790 | 12,791 | 12,792 | 12,793 | 12,794 | 12,795 | 12,796 | 12,797 | 12,798 | 12,799 | 12,800 |
| | 2-38 | 12,814 | 12,815 | 12,816 | 12,817 | 12,818 | 12,819 | 12,820 | 12,821 | 12,822 | 12,823 | 12,824 | 12,825 |
| | 2-39 | 12,839 | 12,840 | 12,841 | 12,842 | 12,843 | 12,844 | 12,845 | 12,846 | 12,847 | 12,848 | 12,849 | 12,850 |
| | 2-40 | 12,864 | 12,865 | 12,866 | 12,867 | 12,868 | 12,869 | 12,870 | 12,871 | 12,872 | 12,873 | 12,874 | 12,875 |
| | 2-41 | 12,889 | 12,890 | 12,891 | 12,892 | 12,893 | 12,894 | 12,895 | 12,896 | 12,897 | 12,898 | 12,899 | 12,900 |
| | 2-42 | 12,914 | 12,915 | 12,916 | 12,917 | 12,918 | 12,919 | 12,920 | 12,921 | 12,922 | 12,923 | 12,924 | 12,925 |
| | 2-43 | 12,939 | 12,940 | 12,941 | 12,942 | 12,943 | 12,944 | 12,945 | 12,946 | 12,947 | 12,948 | 12,949 | 12,950 |
| | 2-44 | 12,964 | 12,965 | 12,966 | 12,967 | 12,968 | 12,969 | 12,970 | 12,971 | 12,972 | 12,973 | 12,974 | 12,975 |
| | 2-45 | 12,989 | 12,990 | 12,991 | 12,992 | 12,993 | 12,994 | 12,995 | 12,996 | 12,997 | 12,998 | 12,999 | 13,000 |
| | 2-46 | 13,014 | 13,015 | 13,016 | 13,017 | 13,018 | 13,019 | 13,020 | 13,021 | 13,022 | 13,023 | 13,024 | 13,025 |
| | 2-47 | 13,039 | 13,040 | 13,041 | 13,042 | 13,043 | 13,044 | 13,045 | 13,046 | 13,047 | 13,048 | 13,049 | 13,050 |
| | 2-48 | 13,064 | 13,065 | 13,066 | 13,067 | 13,068 | 13,069 | 13,070 | 13,071 | 13,072 | 13,073 | 13,074 | 13,075 |
| | 2-49 | 13,089 | 13,090 | 13,091 | 13,092 | 13,093 | 13,094 | 13,095 | 13,096 | 13,097 | 13,098 | 13,099 | 13,100 |
| | 2-50 | 13,114 | 13,115 | 13,116 | 13,117 | 13,118 | 13,119 | 13,120 | 13,121 | 13,122 | 13,123 | 13,124 | 13,125 |
| | 2-51 | 13,139 | 13,140 | 13,141 | 13,142 | 13,143 | 13,144 | 13,145 | 13,146 | 13,147 | 13,148 | 13,149 | 13,150 |
| | 2-52 | 13,164 | 13,165 | 13,166 | 13,167 | 13,168 | 13,169 | 13,170 | 13,171 | 13,172 | 13,173 | 13,174 | 13,175 |
| | 2-53 | 13,189 | 13,190 | 13,191 | 13,192 | 13,193 | 13,194 | 13,195 | 13,196 | 13,197 | 13,198 | 13,199 | 13,200 |
| | 2-54 | 13,214 | 13,215 | 13,216 | 13,217 | 13,218 | 13,219 | 13,220 | 13,221 | 13,222 | 13,223 | 13,224 | 13,225 |
| | 2-55 | 13,239 | 13,240 | 13,241 | 13,242 | 13,243 | 13,244 | 13,245 | 13,246 | 13,247 | 13,248 | 13,249 | 13,250 |

TABLE 11

| | | Compound represented by the formula (1) | | | | | | | | | | | | |
|---|---|---|---|---|---|---|---|---|---|---|---|---|---|---|
| | | 1-1 | 1-2 | 1-3 | 1-4 | 1-5 | 1-6 | 1-7 | 1-8 | 1-9 | 1-10 | 1-11 | 1-12 | 1-13 |
| Compound represented by the formula (2) | 2-56 | 13,251 | 13,252 | 13,253 | 13,254 | 13,255 | 13,256 | 13,257 | 13,258 | 13,259 | 13,260 | 13,261 | 13,262 | 13,263 |
| | 2-57 | 13,276 | 13,277 | 13,278 | 13,279 | 13,280 | 13,281 | 13,282 | 13,283 | 13,284 | 13,285 | 13,286 | 13,287 | 13,288 |
| | 2-58 | 13,301 | 13,302 | 13,303 | 13,304 | 13,305 | 13,306 | 13,307 | 13,308 | 13,309 | 13,310 | 13,311 | 13,312 | 13,313 |
| | 2-59 | 13,326 | 13,327 | 13,328 | 13,329 | 13,330 | 13,331 | 13,332 | 13,333 | 13,334 | 13,335 | 13,336 | 13,337 | 13,338 |
| | 2-60 | 13,351 | 13,352 | 13,353 | 13,354 | 13,355 | 13,356 | 13,357 | 13,358 | 13,359 | 13,360 | 13,361 | 13,362 | 13,363 |
| | 2-61 | 13,376 | 13,377 | 13,378 | 13,379 | 13,380 | 13,381 | 13,382 | 13,383 | 13,384 | 13,385 | 13,386 | 13,387 | 13,388 |
| | 2-62 | 13,401 | 13,402 | 13,403 | 13,404 | 13,405 | 13,406 | 13,407 | 13,408 | 13,409 | 13,410 | 13,411 | 13,412 | 13,413 |
| | 2-63 | 13,426 | 13,427 | 13,428 | 13,429 | 13,430 | 13,431 | 13,432 | 13,433 | 13,434 | 13,435 | 13,436 | 13,437 | 13,438 |
| | 2-64 | 13,451 | 13,452 | 13,453 | 13,454 | 13,455 | 13,456 | 13,457 | 13,458 | 13,459 | 13,460 | 13,461 | 13,462 | 13,463 |
| | 2-65 | 13,476 | 13,477 | 13,478 | 13,479 | 13,480 | 13,481 | 13,482 | 13,483 | 13,484 | 13,485 | 13,486 | 13,487 | 13,488 |
| | 2-66 | 13,501 | 13,502 | 13,503 | 13,504 | 13,505 | 13,506 | 13,507 | 13,508 | 13,509 | 13,510 | 13,511 | 13,512 | 13,513 |
| | 2-67 | 13,526 | 13,527 | 13,528 | 13,529 | 13,530 | 13,531 | 13,532 | 13,533 | 13,534 | 13,535 | 13,536 | 13,537 | 13,538 |
| | 2-68 | 13,551 | 13,552 | 13,553 | 13,554 | 13,555 | 13,556 | 13,557 | 13,558 | 13,559 | 13,560 | 13,561 | 13,562 | 13,563 |
| | 2-69 | 13,576 | 13,577 | 13,578 | 13,579 | 13,580 | 13,581 | 13,582 | 13,583 | 13,584 | 13,585 | 13,586 | 13,587 | 13,588 |
| | 2-70 | 13,601 | 13,602 | 13,603 | 13,604 | 13,605 | 13,606 | 13,607 | 13,608 | 13,609 | 13,610 | 13,611 | 13,612 | 13,613 |
| | 2-71 | 13,626 | 13,627 | 13,628 | 13,629 | 13,630 | 13,631 | 13,632 | 13,633 | 13,634 | 13,635 | 13,636 | 13,637 | 13,638 |
| | 2-72 | 13,651 | 13,652 | 13,653 | 13,654 | 13,655 | 13,656 | 13,657 | 13,658 | 13,659 | 13,660 | 13,661 | 13,662 | 13,663 |
| | 2-73 | 13,676 | 13,677 | 13,678 | 13,679 | 13,680 | 13,681 | 13,682 | 13,683 | 13,684 | 13,685 | 13,686 | 13,687 | 13,688 |
| | 2-74 | 13,701 | 13,702 | 13,703 | 13,704 | 13,705 | 13,706 | 13,707 | 13,708 | 13,709 | 13,710 | 13,711 | 13,712 | 13,713 |
| | 2-75 | 13,726 | 13,727 | 13,728 | 13,729 | 13,730 | 13,731 | 13,732 | 13,733 | 13,734 | 13,735 | 13,736 | 13,737 | 13,738 |
| | 2-76 | 13,751 | 13,752 | 13,753 | 13,754 | 13,755 | 13,756 | 13,757 | 13,758 | 13,759 | 13,760 | 13,761 | 13,762 | 13,763 |
| | 2-77 | 13,776 | 13,777 | 13,778 | 13,779 | 13,780 | 13,781 | 13,782 | 13,783 | 13,784 | 13,785 | 13,786 | 13,787 | 13,788 |
| | 2-78 | 13,801 | 13,802 | 13,803 | 13,804 | 13,805 | 13,806 | 13,807 | 13,808 | 13,809 | 13,810 | 13,811 | 13,812 | 13,813 |
| | 2-79 | 13,826 | 13,827 | 13,828 | 13,829 | 13,830 | 13,831 | 13,832 | 13,833 | 13,834 | 13,835 | 13,836 | 13,837 | 13,838 |
| | 2-80 | 13,851 | 13,852 | 13,853 | 13,854 | 13,855 | 13,856 | 13,857 | 13,858 | 13,859 | 13,860 | 13,861 | 13,862 | 13,863 |
| | 2-81 | 13,876 | 13,877 | 13,878 | 13,879 | 13,880 | 13,881 | 13,882 | 13,883 | 13,884 | 13,885 | 13,886 | 13,887 | 13,888 |
| | 2-82 | 13,901 | 13,902 | 13,903 | 13,904 | 13,905 | 13,906 | 13,907 | 13,908 | 13,909 | 13,910 | 13,911 | 13,912 | 13,913 |
| | 2-83 | 13,926 | 13,927 | 13,928 | 13,929 | 13,930 | 13,931 | 13,932 | 13,933 | 13,934 | 13,935 | 13,936 | 13,937 | 13,938 |
| | 2-84 | 13,951 | 13,952 | 13,953 | 13,954 | 13,955 | 13,956 | 13,957 | 13,958 | 13,959 | 13,960 | 13,961 | 13,962 | 13,963 |
| | 2-85 | 13,976 | 13,977 | 13,978 | 13,979 | 13,980 | 13,981 | 13,982 | 13,983 | 13,984 | 13,985 | 13,986 | 13,987 | 13,988 |
| | 2-86 | 14,001 | 14,002 | 14,003 | 14,004 | 14,005 | 14,006 | 14,007 | 14,008 | 14,009 | 14,010 | 14,011 | 14,012 | 14,013 |
| | 2-87 | 14,026 | 14,027 | 14,028 | 14,029 | 14,030 | 14,031 | 14,032 | 14,033 | 14,034 | 14,035 | 14,036 | 14,037 | 14,038 |
| | 2-88 | 14,051 | 14,052 | 14,053 | 14,054 | 14,055 | 14,056 | 14,057 | 14,058 | 14,059 | 14,060 | 14,061 | 14,062 | 14,063 |
| | 2-89 | 14,076 | 14,077 | 14,078 | 14,079 | 14,080 | 14,081 | 14,082 | 14,083 | 14,084 | 14,085 | 14,086 | 14,087 | 14,088 |
| | 2-90 | 14,101 | 14,102 | 14,103 | 14,104 | 14,105 | 14,106 | 14,107 | 14,108 | 14,109 | 14,110 | 14,111 | 14,112 | 14,113 |
| | 2-91 | 14,126 | 14,127 | 14,128 | 14,129 | 14,130 | 14,131 | 14,132 | 14,133 | 14,134 | 14,135 | 14,136 | 14,137 | 14,138 |
| | 2-92 | 14,151 | 14,152 | 14,153 | 14,154 | 14,155 | 14,156 | 14,157 | 14,158 | 14,159 | 14,160 | 14,161 | 14,162 | 14,163 |
| | 2-93 | 14,176 | 14,177 | 14,178 | 14,179 | 14,180 | 14,181 | 14,182 | 14,183 | 14,184 | 14,185 | 14,186 | 14,187 | 14,188 |
| | 2-94 | 14,201 | 14,202 | 14,203 | 14,204 | 14,205 | 14,206 | 14,207 | 14,208 | 14,209 | 14,210 | 14,211 | 14,212 | 14,213 |
| | 2-95 | 14,226 | 14,227 | 14,228 | 14,229 | 14,230 | 14,231 | 14,232 | 14,233 | 14,234 | 14,235 | 14,236 | 14,237 | 14,238 |
| | 2-96 | 14,251 | 14,252 | 14,253 | 14,254 | 14,255 | 14,256 | 14,257 | 14,258 | 14,259 | 14,260 | 14,261 | 14,262 | 14,263 |
| | 2-97 | 14,276 | 14,277 | 14,278 | 14,279 | 14,280 | 14,281 | 14,282 | 14,283 | 14,284 | 14,285 | 14,286 | 14,287 | 14,288 |
| | 2-98 | 14,301 | 14,302 | 14,303 | 14,304 | 14,305 | 14,306 | 14,307 | 14,308 | 14,309 | 14,310 | 14,311 | 14,312 | 14,313 |
| | 2-99 | 14,326 | 14,327 | 14,328 | 14,329 | 14,330 | 14,331 | 14,332 | 14,333 | 14,334 | 14,335 | 14,336 | 14,337 | 14,338 |
| | 2-100 | 14,351 | 14,352 | 14,353 | 14,354 | 14,355 | 14,356 | 14,357 | 14,358 | 14,359 | 14,360 | 14,361 | 14,362 | 14,363 |
| | 2-101 | 14,376 | 14,377 | 14,378 | 14,379 | 14,380 | 14,381 | 14,382 | 14,383 | 14,384 | 14,385 | 14,386 | 14,387 | 14,388 |
| | 2-102 | 14,401 | 14,402 | 14,403 | 14,404 | 14,405 | 14,406 | 14,407 | 14,408 | 14,409 | 14,410 | 14,411 | 14,412 | 14,413 |
| | 2-103 | 14,426 | 14,427 | 14,428 | 14,429 | 14,430 | 14,431 | 14,432 | 14,433 | 14,434 | 14,435 | 14,436 | 14,437 | 14,438 |
| | 2-104 | 14,451 | 14,452 | 14,453 | 14,454 | 14,455 | 14,456 | 14,457 | 14,458 | 14,459 | 14,460 | 14,461 | 14,462 | 14,463 |
| | 2-105 | 14,476 | 14,477 | 14,478 | 14,479 | 14,480 | 14,481 | 14,482 | 14,483 | 14,484 | 14,485 | 14,486 | 14,487 | 14,488 |
| | 2-106 | 14,501 | 14,502 | 14,503 | 14,504 | 14,505 | 14,506 | 14,507 | 14,508 | 14,509 | 14,510 | 14,511 | 14,512 | 14,513 |
| | 2-107 | 14,526 | 14,527 | 14,528 | 14,529 | 14,530 | 14,531 | 14,532 | 14,533 | 14,534 | 14,535 | 14,536 | 14,537 | 14,538 |
| | 2-108 | 14,551 | 14,552 | 14,553 | 14,554 | 14,555 | 14,556 | 14,557 | 14,558 | 14,559 | 14,560 | 14,561 | 14,562 | 14,563 |
| | 2-109 | 14,576 | 14,577 | 14,578 | 14,579 | 14,580 | 14,581 | 14,582 | 14,583 | 14,584 | 14,585 | 14,586 | 14,587 | 14,588 |
| | 2-110 | 14,601 | 14,602 | 14,603 | 14,604 | 14,605 | 14,606 | 14,607 | 14,608 | 14,609 | 14,610 | 14,611 | 14,612 | 14,613 |

| | | Compound represented by the formula (1) | | | | | | | | | | | |
|---|---|---|---|---|---|---|---|---|---|---|---|---|---|
| | | 1-14 | 1-15 | 1-16 | 1-17 | 1-18 | 1-19 | 1-20 | 1-21 | 1-22 | 1-23 | 1-24 | 1-25 |
| Compound represented by the formula (2) | 2-56 | 13,264 | 13,265 | 13,266 | 13,267 | 13,268 | 13,269 | 13,270 | 13,271 | 13,272 | 13,273 | 13,274 | 13,275 |
| | 2-57 | 13,289 | 13,290 | 13,291 | 13,292 | 13,293 | 13,294 | 13,295 | 13,296 | 13,297 | 13,298 | 13,299 | 13,300 |
| | 2-58 | 13,314 | 13,315 | 13,316 | 13,317 | 13,318 | 13,319 | 13,320 | 13,321 | 13,322 | 13,323 | 13,324 | 13,325 |
| | 2-59 | 13,339 | 13,340 | 13,341 | 13,342 | 13,343 | 13,344 | 13,345 | 13,346 | 13,347 | 13,348 | 13,349 | 13,350 |
| | 2-60 | 13,364 | 13,365 | 13,366 | 13,367 | 13,368 | 13,369 | 13,370 | 13,371 | 13,372 | 13,373 | 13,374 | 13,375 |
| | 2-61 | 13,389 | 13,390 | 13,391 | 13,392 | 13,393 | 13,394 | 13,395 | 13,396 | 13,397 | 13,398 | 13,399 | 13,400 |
| | 2-62 | 13,414 | 13,415 | 13,416 | 13,417 | 13,418 | 13,419 | 13,420 | 13,421 | 13,422 | 13,423 | 13,424 | 13,425 |
| | 2-63 | 13,439 | 13,440 | 13,441 | 13,442 | 13,443 | 13,444 | 13,445 | 13,446 | 13,447 | 13,448 | 13,449 | 13,450 |
| | 2-64 | 13,464 | 13,465 | 13,466 | 13,467 | 13,468 | 13,469 | 13,470 | 13,471 | 13,472 | 13,473 | 13,474 | 13,475 |
| | 2-65 | 13,489 | 13,490 | 13,491 | 13,492 | 13,493 | 13,494 | 13,495 | 13,496 | 13,497 | 13,498 | 13,499 | 13,500 |
| | 2-66 | 13,514 | 13,515 | 13,516 | 13,517 | 13,518 | 13,519 | 13,520 | 13,521 | 13,522 | 13,523 | 13,524 | 13,525 |
| | 2-67 | 13,539 | 13,540 | 13,541 | 13,542 | 13,543 | 13,544 | 13,545 | 13,546 | 13,547 | 13,548 | 13,549 | 13,550 |
| | 2-68 | 13,564 | 13,565 | 13,566 | 13,567 | 13,568 | 13,569 | 13,570 | 13,571 | 13,572 | 13,573 | 13,574 | 13,575 |
| | 2-69 | 13,589 | 13,590 | 13,591 | 13,592 | 13,593 | 13,594 | 13,595 | 13,596 | 13,597 | 13,598 | 13,599 | 13,600 |
| | 2-70 | 13,614 | 13,615 | 13,616 | 13,617 | 13,618 | 13,619 | 13,620 | 13,621 | 13,622 | 13,623 | 13,624 | 13,625 |
| | 2-71 | 13,639 | 13,640 | 13,641 | 13,642 | 13,643 | 13,644 | 13,645 | 13,646 | 13,647 | 13,648 | 13,649 | 13,650 |

TABLE 11-continued

| | | | | | | | | | | | | | |
|---|---|---|---|---|---|---|---|---|---|---|---|---|---|
| 2-72 | 13,664 | 13,665 | 13,666 | 13,667 | 13,668 | 13,669 | 13,670 | 13,671 | 13,672 | 13,673 | 13,674 | 13,675 |
| 2-73 | 13,689 | 13,690 | 13,691 | 13,692 | 13,693 | 13,694 | 13,695 | 13,696 | 13,697 | 13,698 | 13,699 | 13,700 |
| 2-74 | 13,714 | 13,715 | 13,716 | 13,717 | 13,718 | 13,719 | 13,720 | 13,721 | 13,722 | 13,723 | 13,724 | 13,725 |
| 2-75 | 13,739 | 13,740 | 13,741 | 13,742 | 13,743 | 13,744 | 13,745 | 13,746 | 13,747 | 13,748 | 13,749 | 13,750 |
| 2-76 | 13,764 | 13,765 | 13,766 | 13,767 | 13,768 | 13,769 | 13,770 | 13,771 | 13,772 | 13,773 | 13,774 | 13,775 |
| 2-77 | 13,789 | 13,790 | 13,791 | 13,792 | 13,793 | 13,794 | 13,795 | 13,796 | 13,797 | 13,798 | 13,799 | 13,800 |
| 2-78 | 13,814 | 13,815 | 13,816 | 13,817 | 13,818 | 13,819 | 13,820 | 13,821 | 13,822 | 13,823 | 13,824 | 13,825 |
| 2-79 | 13,839 | 13,840 | 13,841 | 13,842 | 13,843 | 13,844 | 13,845 | 13,846 | 13,847 | 13,848 | 13,849 | 13,850 |
| 2-80 | 13,864 | 13,865 | 13,866 | 13,867 | 13,868 | 13,869 | 13,870 | 13,871 | 13,872 | 13,873 | 13,874 | 13,875 |
| 2-81 | 13,889 | 13,890 | 13,891 | 13,892 | 13,893 | 13,894 | 13,895 | 13,896 | 13,897 | 13,898 | 13,899 | 13,900 |
| 2-82 | 13,914 | 13,915 | 13,916 | 13,917 | 13,918 | 13,919 | 13,920 | 13,921 | 13,922 | 13,923 | 13,924 | 13,925 |
| 2-83 | 13,939 | 13,940 | 13,941 | 13,942 | 13,943 | 13,944 | 13,945 | 13,946 | 13,947 | 13,948 | 13,949 | 13,950 |
| 2-84 | 13,964 | 13,965 | 13,966 | 13,967 | 13,968 | 13,969 | 13,970 | 13,971 | 13,972 | 13,973 | 13,974 | 13,975 |
| 2-85 | 13,989 | 13,990 | 13,991 | 13,992 | 13,993 | 13,994 | 13,995 | 13,996 | 13,997 | 13,998 | 13,999 | 14,000 |
| 2-86 | 14,014 | 14,015 | 14,016 | 14,017 | 14,018 | 14,019 | 14,020 | 14,021 | 14,022 | 14,023 | 14,024 | 14,025 |
| 2-87 | 14,039 | 14,040 | 14,041 | 14,042 | 14,043 | 14,044 | 14,045 | 14,046 | 14,047 | 14,048 | 14,049 | 14,050 |
| 2-88 | 14,064 | 14,065 | 14,066 | 14,067 | 14,068 | 14,069 | 14,070 | 14,071 | 14,072 | 14,073 | 14,074 | 14,075 |
| 2-89 | 14,089 | 14,090 | 14,091 | 14,092 | 14,093 | 14,094 | 14,095 | 14,096 | 14,097 | 14,098 | 14,099 | 14,100 |
| 2-90 | 14,114 | 14,115 | 14,116 | 14,117 | 14,118 | 14,119 | 14,120 | 14,121 | 14,122 | 14,123 | 14,124 | 14,125 |
| 2-91 | 14,139 | 14,140 | 14,141 | 14,142 | 14,143 | 14,144 | 14,145 | 14,146 | 14,147 | 14,148 | 14,149 | 14,150 |
| 2-92 | 14,164 | 14,165 | 14,166 | 14,167 | 14,168 | 14,169 | 14,170 | 14,171 | 14,172 | 14,173 | 14,174 | 14,175 |
| 2-93 | 14,189 | 14,190 | 14,191 | 14,192 | 14,193 | 14,194 | 14,195 | 14,196 | 14,197 | 14,198 | 14,199 | 14,200 |
| 2-94 | 14,214 | 14,215 | 14,216 | 14,217 | 14,218 | 14,219 | 14,220 | 14,221 | 14,222 | 14,223 | 14,224 | 14,225 |
| 2-95 | 14,239 | 14,240 | 14,241 | 14,242 | 14,243 | 14,244 | 14,245 | 14,246 | 14,247 | 14,248 | 14,249 | 14,250 |
| 2-96 | 14,264 | 14,265 | 14,266 | 14,267 | 14,268 | 14,269 | 14,270 | 14,271 | 14,272 | 14,273 | 14,274 | 14,275 |
| 2-97 | 14,289 | 14,290 | 14,291 | 14,292 | 14,293 | 14,294 | 14,295 | 14,296 | 14,297 | 14,298 | 14,299 | 14,300 |
| 2-98 | 14,314 | 14,315 | 14,316 | 14,317 | 14,318 | 14,319 | 14,320 | 14,321 | 14,322 | 14,323 | 14,324 | 14,325 |
| 2-99 | 14,339 | 14,340 | 14,341 | 14,342 | 14,343 | 14,344 | 14,345 | 14,346 | 14,347 | 14,348 | 14,349 | 14,350 |
| 2-100 | 14,364 | 14,365 | 14,366 | 14,367 | 14,368 | 14,369 | 14,370 | 14,371 | 14,372 | 14,373 | 14,374 | 14,375 |
| 2-101 | 14,389 | 14,390 | 14,391 | 14,392 | 14,393 | 14,394 | 14,395 | 14,396 | 14,397 | 14,398 | 14,399 | 14,400 |
| 2-102 | 14,414 | 14,415 | 14,416 | 14,417 | 14,418 | 14,419 | 14,420 | 14,421 | 14,422 | 14,423 | 14,424 | 14,425 |
| 2-103 | 14,439 | 14,440 | 14,441 | 14,442 | 14,443 | 14,444 | 14,445 | 14,446 | 14,447 | 14,448 | 14,449 | 14,450 |
| 2-104 | 14,464 | 14,465 | 14,466 | 14,467 | 14,468 | 14,469 | 14,470 | 14,471 | 14,472 | 14,473 | 14,474 | 14,475 |
| 2-105 | 14,489 | 14,490 | 14,491 | 14,492 | 14,493 | 14,494 | 14,495 | 14,496 | 14,497 | 14,498 | 14,499 | 14,500 |
| 2-106 | 14,514 | 14,515 | 14,516 | 14,517 | 14,518 | 14,519 | 14,520 | 14,521 | 14,522 | 14,523 | 14,524 | 14,525 |
| 2-107 | 14,539 | 14,540 | 14,541 | 14,542 | 14,543 | 14,544 | 14,545 | 14,546 | 14,547 | 14,548 | 14,549 | 14,550 |
| 2-108 | 14,564 | 14,565 | 14,566 | 14,567 | 14,568 | 14,569 | 14,570 | 14,571 | 14,572 | 14,573 | 14,574 | 14,575 |
| 2-109 | 14,589 | 14,590 | 14,591 | 14,592 | 14,593 | 14,594 | 14,595 | 14,596 | 14,597 | 14,598 | 14,599 | 14,600 |
| 2-110 | 14,614 | 14,615 | 14,616 | 14,617 | 14,618 | 14,619 | 14,620 | 14,621 | 14,622 | 14,623 | 14,624 | 14,625 |

TABLE 12

| | | Compound represented by the formula (1) | | | | | | | | | | | | |
|---|---|---|---|---|---|---|---|---|---|---|---|---|---|---|
| | | 1-1 | 1-2 | 1-3 | 1-4 | 1-5 | 1-6 | 1-7 | 1-8 | 1-9 | 1-10 | 1-11 | 1-12 | 1-13 |
| Compound represented by the formula (2) | 2-111 | 14,626 | 14,627 | 14,628 | 14,629 | 14,630 | 14,631 | 14,632 | 14,633 | 14,634 | 14,635 | 14,636 | 14,637 | 14,638 |
| | 2-112 | 14,651 | 14,652 | 14,653 | 14,654 | 14,655 | 14,656 | 14,657 | 14,658 | 14,659 | 14,660 | 14,661 | 14,662 | 14,663 |
| | 2-113 | 14,676 | 14,677 | 14,678 | 14,679 | 14,680 | 14,681 | 14,682 | 14,683 | 14,684 | 14,685 | 14,686 | 14,687 | 14,688 |
| | 2-114 | 14,701 | 14,702 | 14,703 | 14,704 | 14,705 | 14,706 | 14,707 | 14,708 | 14,709 | 14,710 | 14,711 | 14,712 | 14,713 |
| | 2-115 | 14,726 | 14,727 | 14,728 | 14,729 | 14,730 | 14,731 | 14,732 | 14,733 | 14,734 | 14,735 | 14,736 | 14,737 | 14,738 |
| | 2-116 | 14,751 | 14,752 | 14,753 | 14,754 | 14,755 | 14,756 | 14,757 | 14,758 | 14,759 | 14,760 | 14,761 | 14,762 | 14,763 |
| | 2-117 | 14,776 | 14,777 | 14,778 | 14,779 | 14,780 | 14,781 | 14,782 | 14,783 | 14,784 | 14,785 | 14,786 | 14,787 | 14,788 |
| | 2-118 | 14,801 | 14,802 | 14,803 | 14,804 | 14,805 | 14,806 | 14,807 | 14,808 | 14,809 | 14,810 | 14,811 | 14,812 | 14,813 |
| | 2-119 | 14,826 | 14,827 | 14,828 | 14,829 | 14,830 | 14,831 | 14,832 | 14,833 | 14,834 | 14,835 | 14,836 | 14,837 | 14,838 |
| | 2-120 | 14,851 | 14,852 | 14,853 | 14,854 | 14,855 | 14,856 | 14,857 | 14,858 | 14,859 | 14,860 | 14,861 | 14,862 | 14,863 |
| | 2-121 | 14,876 | 14,877 | 14,878 | 14,879 | 14,880 | 14,881 | 14,882 | 14,883 | 14,884 | 14,885 | 14,886 | 14,887 | 14,888 |
| | 2-122 | 14,901 | 14,902 | 14,903 | 14,904 | 14,905 | 14,906 | 14,907 | 14,908 | 14,909 | 14,910 | 14,911 | 14,912 | 14,913 |
| | 2-123 | 14,926 | 14,927 | 14,928 | 14,929 | 14,930 | 14,931 | 14,932 | 14,933 | 14,934 | 14,935 | 14,936 | 14,937 | 14,938 |
| | 2-124 | 14,951 | 14,952 | 14,953 | 14,954 | 14,955 | 14,956 | 14,957 | 14,958 | 14,959 | 14,960 | 14,961 | 14,962 | 14,963 |
| | 2-125 | 14,976 | 14,977 | 14,978 | 14,979 | 14,980 | 14,981 | 14,982 | 14,983 | 14,984 | 14,985 | 14,986 | 14,987 | 14,988 |
| | 2-126 | 15,001 | 15,002 | 15,003 | 15,004 | 15,005 | 15,006 | 15,007 | 15,008 | 15,009 | 15,010 | 15,011 | 15,012 | 15,013 |
| | 2-127 | 15,026 | 15,027 | 15,028 | 15,029 | 15,030 | 15,031 | 15,032 | 15,033 | 15,034 | 15,035 | 15,036 | 15,037 | 15,038 |
| | 2-128 | 15,051 | 15,052 | 15,053 | 15,054 | 15,055 | 15,056 | 15,057 | 15,058 | 15,059 | 15,060 | 15,061 | 15,062 | 15,063 |
| | 2-129 | 15,076 | 15,077 | 15,078 | 15,079 | 15,080 | 15,081 | 15,082 | 15,083 | 15,084 | 15,085 | 15,086 | 15,087 | 15,088 |
| | 2-130 | 15,101 | 15,102 | 15,103 | 15,104 | 15,105 | 15,106 | 15,107 | 15,108 | 15,109 | 15,110 | 15,111 | 15,112 | 15,113 |
| | 2-131 | 15,126 | 15,127 | 15,128 | 15,129 | 15,130 | 15,131 | 15,132 | 15,133 | 15,134 | 15,135 | 15,136 | 15,137 | 15,138 |
| | 2-132 | 15,151 | 15,152 | 15,153 | 15,154 | 15,155 | 15,156 | 15,157 | 15,158 | 15,159 | 15,160 | 15,161 | 15,162 | 15,163 |
| | 2-133 | 15,176 | 15,177 | 15,178 | 15,179 | 15,180 | 15,181 | 15,182 | 15,183 | 15,184 | 15,185 | 15,186 | 15,187 | 15,188 |
| | 2-134 | 15,201 | 15,202 | 15,203 | 15,204 | 15,205 | 15,206 | 15,207 | 15,208 | 15,209 | 15,210 | 15,211 | 15,212 | 15,213 |
| | 2-135 | 15,226 | 15,227 | 15,228 | 15,229 | 15,230 | 15,231 | 15,232 | 15,233 | 15,234 | 15,235 | 15,236 | 15,237 | 15,238 |
| | 2-136 | 15,251 | 15,252 | 15,253 | 15,254 | 15,255 | 15,256 | 15,257 | 15,258 | 15,259 | 15,260 | 15,261 | 15,262 | 15,263 |
| | 2-137 | 15,276 | 15,277 | 15,278 | 15,279 | 15,280 | 15,281 | 15,282 | 15,283 | 15,284 | 15,285 | 15,286 | 15,287 | 15,288 |
| | 2-138 | 15,301 | 15,302 | 15,303 | 15,304 | 15,305 | 15,306 | 15,307 | 15,308 | 15,309 | 15,310 | 15,311 | 15,312 | 15,313 |
| | 2-139 | 15,326 | 15,327 | 15,328 | 15,329 | 15,330 | 15,331 | 15,332 | 15,333 | 15,334 | 15,335 | 15,336 | 15,337 | 15,338 |
| | 2-140 | 15,351 | 15,352 | 15,353 | 15,354 | 15,355 | 15,356 | 15,357 | 15,358 | 15,359 | 15,360 | 15,361 | 15,362 | 15,363 |
| | 2-141 | 15,376 | 15,377 | 15,378 | 15,379 | 15,380 | 15,381 | 15,382 | 15,383 | 15,384 | 15,385 | 15,386 | 15,387 | 15,388 |

TABLE 12-continued

| | | | | | | | | | | | | | | |
|---|---|---|---|---|---|---|---|---|---|---|---|---|---|---|
| | 2-142 | 15,401 | 15,402 | 15,403 | 15,404 | 15,405 | 15,406 | 15,407 | 15,408 | 15,409 | 15,410 | 15,411 | 15,412 | 15,413 |
| | 2-143 | 15,426 | 15,427 | 15,428 | 15,429 | 15,430 | 15,431 | 15,432 | 15,433 | 15,434 | 15,435 | 15,436 | 15,437 | 15,438 |
| | 2-144 | 15,451 | 15,452 | 15,453 | 15,454 | 15,455 | 15,456 | 15,457 | 15,458 | 15,459 | 15,460 | 15,461 | 15,462 | 15,463 |
| | 2-145 | 15,476 | 15,477 | 15,478 | 15,479 | 15,480 | 15,481 | 15,482 | 15,483 | 15,484 | 15,485 | 15,486 | 15,487 | 15,488 |
| | 2-146 | 15,501 | 15,502 | 15,503 | 15,504 | 15,505 | 15,506 | 15,507 | 15,508 | 15,509 | 15,510 | 15,511 | 15,512 | 15,513 |
| | 2-147 | 15,526 | 15,527 | 15,528 | 15,529 | 15,530 | 15,531 | 15,532 | 15,533 | 15,534 | 15,535 | 15,536 | 15,537 | 15,538 |
| | 2-148 | 15,551 | 15,552 | 15,553 | 15,554 | 15,555 | 15,556 | 15,557 | 15,558 | 15,559 | 15,560 | 15,561 | 15,562 | 15,563 |
| | 2-149 | 15,576 | 15,577 | 15,578 | 15,579 | 15,580 | 15,581 | 15,582 | 15,583 | 15,584 | 15,585 | 15,586 | 15,587 | 15,588 |
| | 2-150 | 15,601 | 15,602 | 15,603 | 15,604 | 15,605 | 15,606 | 15,607 | 15,608 | 15,609 | 15,610 | 15,611 | 15,612 | 15,613 |
| | 2-151 | 15,626 | 15,627 | 15,628 | 15,629 | 15,630 | 15,631 | 15,632 | 15,633 | 15,634 | 15,635 | 15,636 | 15,637 | 15,638 |
| | 2-152 | 15,651 | 15,652 | 15,653 | 15,654 | 15,655 | 15,656 | 15,657 | 15,658 | 15,659 | 15,660 | 15,661 | 15,662 | 15,663 |
| | 2-153 | 15,676 | 15,677 | 15,678 | 15,679 | 15,680 | 15,681 | 15,682 | 15,683 | 15,684 | 15,685 | 15,686 | 15,687 | 15,688 |
| | 2-154 | 15,701 | 15,702 | 15,703 | 15,704 | 15,705 | 15,706 | 15,707 | 15,708 | 15,709 | 15,710 | 15,711 | 15,712 | 15,713 |
| | 2-155 | 15,726 | 15,727 | 15,728 | 15,729 | 15,730 | 15,731 | 15,732 | 15,733 | 15,734 | 15,735 | 15,736 | 15,737 | 15,738 |
| | 2-156 | 15,751 | 15,752 | 15,753 | 15,754 | 15,755 | 15,756 | 15,757 | 15,758 | 15,759 | 15,760 | 15,761 | 15,762 | 15,763 |
| | 2-157 | 15,776 | 15,777 | 15,778 | 15,779 | 15,780 | 15,781 | 15,782 | 15,783 | 15,784 | 15,785 | 15,786 | 15,787 | 15,788 |
| | 2-158 | 15,801 | 15,802 | 15,803 | 15,804 | 15,805 | 15,806 | 15,807 | 15,808 | 15,809 | 15,810 | 15,811 | 15,812 | 15,813 |
| | 2-159 | 15,826 | 15,827 | 15,828 | 15,829 | 15,830 | 15,831 | 15,832 | 15,833 | 15,834 | 15,835 | 15,836 | 15,837 | 15,838 |
| | 2-160 | 15,851 | 15,852 | 15,853 | 15,854 | 15,855 | 15,856 | 15,857 | 15,858 | 15,859 | 15,860 | 15,861 | 15,862 | 15,863 |
| | 2-161 | 15,876 | 15,877 | 15,878 | 15,879 | 15,880 | 15,881 | 15,882 | 15,883 | 15,884 | 15,885 | 15,886 | 15,887 | 15,888 |
| | 2-162 | 15,901 | 15,902 | 15,903 | 15,904 | 15,905 | 15,906 | 15,907 | 15,908 | 15,909 | 15,910 | 15,911 | 15,912 | 15,913 |
| | 2-163 | 15,926 | 15,927 | 15,928 | 15,929 | 15,930 | 15,931 | 15,932 | 15,933 | 15,934 | 15,935 | 15,936 | 15,937 | 15,938 |
| | 2-164 | 15,951 | 15,952 | 15,953 | 15,954 | 15,955 | 15,956 | 15,957 | 15,958 | 15,959 | 15,960 | 15,961 | 15,962 | 15,963 |
| | 2-165 | 15,976 | 15,977 | 15,978 | 15,979 | 15,980 | 15,981 | 15,982 | 15,983 | 15,984 | 15,985 | 15,986 | 15,987 | 15,988 |

| | | Compound represented by the formula (1) | | | | | | | | | | | |
|---|---|---|---|---|---|---|---|---|---|---|---|---|---|
| | | 1-14 | 1-15 | 1-16 | 1-17 | 1-18 | 1-19 | 1-20 | 1-21 | 1-22 | 1-23 | 1-24 | 1-25 |
| Compound represented by the formula (2) | 2-111 | 14,639 | 14,640 | 14,641 | 14,642 | 14,643 | 14,644 | 14,645 | 14,646 | 14,647 | 14,648 | 14,649 | 14,650 |
| | 2-112 | 14,664 | 14,665 | 14,666 | 14,667 | 14,668 | 14,669 | 14,670 | 14,671 | 14,672 | 14,673 | 14,674 | 14,675 |
| | 2-113 | 14,689 | 14,690 | 14,691 | 14,692 | 14,693 | 14,694 | 14,695 | 14,696 | 14,697 | 14,698 | 14,699 | 14,700 |
| | 2-114 | 14,714 | 14,715 | 14,716 | 14,717 | 14,718 | 14,719 | 14,720 | 14,721 | 14,722 | 14,723 | 14,724 | 14,725 |
| | 2-115 | 14,739 | 14,740 | 14,741 | 14,742 | 14,743 | 14,744 | 14,745 | 14,746 | 14,747 | 14,748 | 14,749 | 14,750 |
| | 2-116 | 14,764 | 14,765 | 14,766 | 14,767 | 14,768 | 14,769 | 14,770 | 14,771 | 14,772 | 14,773 | 14,774 | 14,775 |
| | 2-117 | 14,789 | 14,790 | 14,791 | 14,792 | 14,793 | 14,794 | 14,795 | 14,796 | 14,797 | 14,798 | 14,799 | 14,800 |
| | 2-118 | 14,814 | 14,815 | 14,816 | 14,817 | 14,818 | 14,819 | 14,820 | 14,821 | 14,822 | 14,823 | 14,824 | 14,825 |
| | 2-119 | 14,839 | 14,840 | 14,841 | 14,842 | 14,843 | 14,844 | 14,845 | 14,846 | 14,847 | 14,848 | 14,849 | 14,850 |
| | 2-120 | 14,864 | 14,865 | 14,866 | 14,867 | 14,868 | 14,869 | 14,870 | 14,871 | 14,872 | 14,873 | 14,874 | 14,875 |
| | 2-121 | 14,889 | 14,890 | 14,891 | 14,892 | 14,893 | 14,894 | 14,895 | 14,896 | 14,897 | 14,898 | 14,899 | 14,900 |
| | 2-122 | 14,914 | 14,915 | 14,916 | 14,917 | 14,918 | 14,919 | 14,920 | 14,921 | 14,922 | 14,923 | 14,924 | 14,925 |
| | 2-123 | 14,939 | 14,940 | 14,941 | 14,942 | 14,943 | 14,944 | 14,945 | 14,946 | 14,947 | 14,948 | 14,949 | 14,950 |
| | 2-124 | 14,964 | 14,965 | 14,966 | 14,967 | 14,968 | 14,969 | 14,970 | 14,971 | 14,972 | 14,973 | 14,974 | 14,975 |
| | 2-125 | 14,989 | 14,990 | 14,991 | 14,992 | 14,993 | 14,994 | 14,995 | 14,996 | 14,997 | 14,998 | 14,999 | 15,000 |
| | 2-126 | 15,014 | 15,015 | 15,016 | 15,017 | 15,018 | 15,019 | 15,020 | 15,021 | 15,022 | 15,023 | 15,024 | 15,025 |
| | 2-127 | 15,039 | 15,040 | 15,041 | 15,042 | 15,043 | 15,044 | 15,045 | 15,046 | 15,047 | 15,048 | 15,049 | 15,050 |
| | 2-128 | 15,064 | 15,065 | 15,066 | 15,067 | 15,068 | 15,069 | 15,070 | 15,071 | 15,072 | 15,073 | 15,074 | 15,075 |
| | 2-129 | 15,089 | 15,090 | 15,091 | 15,092 | 15,093 | 15,094 | 15,095 | 15,096 | 15,097 | 15,098 | 15,099 | 15,100 |
| | 2-130 | 15,114 | 15,115 | 15,116 | 15,117 | 15,118 | 15,119 | 15,120 | 15,121 | 15,122 | 15,123 | 15,124 | 15,125 |
| | 2-131 | 15,139 | 15,140 | 15,141 | 15,142 | 15,143 | 15,144 | 15,145 | 15,146 | 15,147 | 15,148 | 15,149 | 15,150 |
| | 2-132 | 15,164 | 15,165 | 15,166 | 15,167 | 15,168 | 15,169 | 15,170 | 15,171 | 15,172 | 15,173 | 15,174 | 15,175 |
| | 2-133 | 15,189 | 15,190 | 15,191 | 15,192 | 15,193 | 15,194 | 15,195 | 15,196 | 15,197 | 15,198 | 15,199 | 15,200 |
| | 2-134 | 15,214 | 15,215 | 15,216 | 15,217 | 15,218 | 15,219 | 15,220 | 15,221 | 15,222 | 15,223 | 15,224 | 15,225 |
| | 2-135 | 15,239 | 15,240 | 15,241 | 15,242 | 15,243 | 15,244 | 15,245 | 15,246 | 15,247 | 15,248 | 15,249 | 15,250 |
| | 2-136 | 15,264 | 15,265 | 15,266 | 15,267 | 15,268 | 15,269 | 15,270 | 15,271 | 15,272 | 15,273 | 15,274 | 15,275 |
| | 2-137 | 15,289 | 15,290 | 15,291 | 15,292 | 15,293 | 15,294 | 15,295 | 15,296 | 15,297 | 15,298 | 15,299 | 15,300 |
| | 2-138 | 15,314 | 15,315 | 15,316 | 15,317 | 15,318 | 15,319 | 15,320 | 15,321 | 15,322 | 15,323 | 15,324 | 15,325 |
| | 2-139 | 15,339 | 15,340 | 15,341 | 15,342 | 15,343 | 15,344 | 15,345 | 15,346 | 15,347 | 15,348 | 15,349 | 15,350 |
| | 2-140 | 15,364 | 15,365 | 15,366 | 15,367 | 15,368 | 15,369 | 15,370 | 15,371 | 15,372 | 15,373 | 15,374 | 15,375 |
| | 2-141 | 15,389 | 15,390 | 15,391 | 15,392 | 15,393 | 15,394 | 15,395 | 15,396 | 15,397 | 15,398 | 15,399 | 15,400 |
| | 2-142 | 15,414 | 15,415 | 15,416 | 15,417 | 15,418 | 15,419 | 15,420 | 15,421 | 15,422 | 15,423 | 15,424 | 15,425 |
| | 2-143 | 15,439 | 15,440 | 15,441 | 15,442 | 15,443 | 15,444 | 15,445 | 15,446 | 15,447 | 15,448 | 15,449 | 15,450 |
| | 2-144 | 15,464 | 15,465 | 15,466 | 15,467 | 15,468 | 15,469 | 15,470 | 15,471 | 15,472 | 15,473 | 15,474 | 15,475 |
| | 2-145 | 15,489 | 15,490 | 15,491 | 15,492 | 15,493 | 15,494 | 15,495 | 15,496 | 15,497 | 15,498 | 15,499 | 15,500 |
| | 2-146 | 15,514 | 15,515 | 15,516 | 15,517 | 15,518 | 15,519 | 15,520 | 15,521 | 15,522 | 15,523 | 15,524 | 15,525 |
| | 2-147 | 15,539 | 15,540 | 15,541 | 15,542 | 15,543 | 15,544 | 15,545 | 15,546 | 15,547 | 15,548 | 15,549 | 15,550 |
| | 2-148 | 15,564 | 15,565 | 15,566 | 15,567 | 15,568 | 15,569 | 15,570 | 15,571 | 15,572 | 15,573 | 15,574 | 15,575 |
| | 2-149 | 15,589 | 15,590 | 15,591 | 15,592 | 15,593 | 15,594 | 15,595 | 15,596 | 15,597 | 15,598 | 15,599 | 15,600 |
| | 2-150 | 15,614 | 15,615 | 15,616 | 15,617 | 15,618 | 15,619 | 15,620 | 15,621 | 15,622 | 15,623 | 15,624 | 15,625 |
| | 2-151 | 15,639 | 15,640 | 15,641 | 15,642 | 15,643 | 15,644 | 15,645 | 15,646 | 15,647 | 15,648 | 15,649 | 15,650 |
| | 2-152 | 15,664 | 15,665 | 15,666 | 15,667 | 15,668 | 15,669 | 15,670 | 15,671 | 15,672 | 15,673 | 15,674 | 15,675 |
| | 2-153 | 15,689 | 15,690 | 15,691 | 15,692 | 15,693 | 15,694 | 15,695 | 15,696 | 15,697 | 15,698 | 15,699 | 15,700 |
| | 2-154 | 15,714 | 15,715 | 15,716 | 15,717 | 15,718 | 15,719 | 15,720 | 15,721 | 15,722 | 15,723 | 15,724 | 15,725 |
| | 2-155 | 15,739 | 15,740 | 15,741 | 15,742 | 15,743 | 15,744 | 15,745 | 15,746 | 15,747 | 15,748 | 15,749 | 15,750 |
| | 2-156 | 15,764 | 15,765 | 15,766 | 15,767 | 15,768 | 15,769 | 15,770 | 15,771 | 15,772 | 15,773 | 15,774 | 15,775 |
| | 2-157 | 15,789 | 15,790 | 15,791 | 15,792 | 15,793 | 15,794 | 15,795 | 15,796 | 15,797 | 15,798 | 15,799 | 15,800 |
| | 2-158 | 15,814 | 15,815 | 15,816 | 15,817 | 15,818 | 15,819 | 15,820 | 15,821 | 15,822 | 15,823 | 15,824 | 15,825 |
| | 2-159 | 15,839 | 15,840 | 15,841 | 15,842 | 15,843 | 15,844 | 15,845 | 15,846 | 15,847 | 15,848 | 15,849 | 15,850 |
| | 2-160 | 15,864 | 15,865 | 15,866 | 15,867 | 15,868 | 15,869 | 15,870 | 15,871 | 15,872 | 15,873 | 15,874 | 15,875 |
| | 2-161 | 15,889 | 15,890 | 15,891 | 15,892 | 15,893 | 15,894 | 15,895 | 15,896 | 15,897 | 15,898 | 15,899 | 15,900 |

TABLE 12-continued

| | | | | | | | | | | | | |
|---|---|---|---|---|---|---|---|---|---|---|---|---|
| 2-162 | 15,914 | 15,915 | 15,916 | 15,917 | 15,918 | 15,919 | 15,920 | 15,921 | 15,922 | 15,923 | 15,924 | 15,925 |
| 2-163 | 15,939 | 15,940 | 15,941 | 15,942 | 15,943 | 15,944 | 15,945 | 15,946 | 15,947 | 15,948 | 15,949 | 15,950 |
| 2-164 | 15,964 | 15,965 | 15,966 | 15,967 | 15,968 | 15,969 | 15,970 | 15,971 | 15,972 | 15,973 | 15,974 | 15,975 |
| 2-165 | 15,989 | 15,990 | 15,991 | 15,992 | 15,993 | 15,994 | 15,995 | 15,996 | 15,997 | 15,998 | 15,999 | 16,000 |

TABLE 13

| | | Compound represented by the formula (1) | | | | | | | | | | | | |
|---|---|---|---|---|---|---|---|---|---|---|---|---|---|---|
| | | 1-1 | 1-2 | 1-3 | 1-4 | 1-5 | 1-6 | 1-7 | 1-8 | 1-9 | 1-10 | 1-11 | 1-12 | 1-13 |
| Compound represented by the formula (2) | 2-166 | 16,001 | 16,002 | 16,003 | 16,004 | 16,005 | 16,006 | 16,007 | 16,008 | 16,009 | 16,010 | 16,011 | 16,012 | 16,013 |
| | 2-167 | 16,026 | 16,027 | 16,028 | 16,029 | 16,030 | 16,031 | 16,032 | 16,033 | 16,034 | 16,035 | 16,036 | 16,037 | 16,038 |
| | 2-168 | 16,051 | 16,052 | 16,053 | 16,054 | 16,055 | 16,056 | 16,057 | 16,058 | 16,059 | 16,060 | 16,061 | 16,062 | 16,063 |
| | 2-169 | 16,076 | 16,077 | 16,078 | 16,079 | 16,080 | 16,081 | 16,082 | 16,083 | 16,084 | 16,085 | 16,086 | 16,087 | 16,088 |
| | 2-170 | 16,101 | 16,102 | 16,103 | 16,104 | 16,105 | 16,106 | 16,107 | 16,108 | 16,109 | 16,110 | 16,111 | 16,112 | 16,113 |
| | 2-171 | 16,126 | 16,127 | 16,128 | 16,129 | 16,130 | 16,131 | 16,132 | 16,133 | 16,134 | 16,135 | 16,136 | 16,137 | 16,138 |
| | 2-172 | 16,151 | 16,152 | 16,153 | 16,154 | 16,155 | 16,156 | 16,157 | 16,158 | 16,159 | 16,160 | 16,161 | 16,162 | 16,163 |
| | 2-173 | 16,176 | 16,177 | 16,178 | 16,179 | 16,180 | 16,181 | 16,182 | 16,183 | 16,184 | 16,185 | 16,186 | 16,187 | 16,188 |
| | 2-174 | 16,201 | 16,202 | 16,203 | 16,204 | 16,205 | 16,206 | 16,207 | 16,208 | 16,209 | 16,210 | 16,211 | 16,212 | 16,213 |
| | 2-175 | 16,226 | 16,227 | 16,228 | 16,229 | 16,230 | 16,231 | 16,232 | 16,233 | 16,234 | 16,235 | 16,236 | 16,237 | 16,238 |
| | 2-176 | 16,251 | 16,252 | 16,253 | 16,254 | 16,255 | 16,256 | 16,257 | 16,258 | 16,259 | 16,260 | 16,261 | 16,262 | 16,263 |
| | 2-177 | 16,276 | 16,277 | 16,278 | 16,279 | 16,280 | 16,281 | 16,282 | 16,283 | 16,284 | 16,285 | 16,286 | 16,287 | 16,288 |
| | 2-178 | 16,301 | 16,302 | 16,303 | 16,304 | 16,305 | 16,306 | 16,307 | 16,308 | 16,309 | 16,310 | 16,311 | 16,312 | 16,313 |
| | 2-179 | 16,326 | 16,327 | 16,328 | 16,329 | 16,330 | 16,331 | 16,332 | 16,333 | 16,334 | 16,335 | 16,336 | 16,337 | 16,338 |
| | 2-180 | 16,351 | 16,352 | 16,353 | 16,354 | 16,355 | 16,356 | 16,357 | 16,358 | 16,359 | 16,360 | 16,361 | 16,362 | 16,363 |
| | 2-181 | 16,376 | 16,377 | 16,378 | 16,379 | 16,380 | 16,381 | 16,382 | 16,383 | 16,384 | 16,385 | 16,386 | 16,387 | 16,388 |
| | 2-182 | 16,401 | 16,402 | 16,403 | 16,404 | 16,405 | 16,406 | 16,407 | 16,408 | 16,409 | 16,410 | 16,411 | 16,412 | 16,413 |
| | 2-183 | 16,426 | 16,427 | 16,428 | 16,429 | 16,430 | 16,431 | 16,432 | 16,433 | 16,434 | 16,435 | 16,436 | 16,437 | 16,438 |
| | 2-184 | 16,451 | 16,452 | 16,453 | 16,454 | 16,455 | 16,456 | 16,457 | 16,458 | 16,459 | 16,460 | 16,461 | 16,462 | 16,463 |
| | 2-185 | 16,476 | 16,477 | 16,478 | 16,479 | 16,480 | 16,481 | 16,482 | 16,483 | 16,484 | 16,485 | 16,486 | 16,487 | 16,488 |
| | 2-186 | 16,501 | 16,502 | 16,503 | 16,504 | 16,505 | 16,506 | 16,507 | 16,508 | 16,509 | 16,510 | 16,511 | 16,512 | 16,513 |
| | 2-187 | 16,526 | 16,527 | 16,528 | 16,529 | 16,530 | 16,531 | 16,532 | 16,533 | 16,534 | 16,535 | 16,536 | 16,537 | 16,538 |
| | 2-188 | 16,551 | 16,552 | 16,553 | 16,554 | 16,555 | 16,556 | 16,557 | 16,558 | 16,559 | 16,560 | 16,561 | 16,562 | 16,563 |
| | 2-189 | 16,576 | 16,577 | 16,578 | 16,579 | 16,580 | 16,581 | 16,582 | 16,583 | 16,584 | 16,585 | 16,586 | 16,587 | 16,588 |
| | 2-190 | 16,601 | 16,602 | 16,603 | 16,604 | 16,605 | 16,606 | 16,607 | 16,608 | 16,609 | 16,610 | 16,611 | 16,612 | 16,613 |
| | 2-191 | 16,626 | 16,627 | 16,628 | 16,629 | 16,630 | 16,631 | 16,632 | 16,633 | 16,634 | 16,635 | 16,636 | 16,637 | 16,638 |
| | 2-192 | 16,651 | 16,652 | 16,653 | 16,654 | 16,655 | 16,656 | 16,657 | 16,658 | 16,659 | 16,660 | 16,661 | 16,662 | 16,663 |
| | 2-193 | 16,676 | 16,677 | 16,678 | 16,679 | 16,680 | 16,681 | 16,682 | 16,683 | 16,684 | 16,685 | 16,686 | 16,687 | 16,688 |
| | 2-194 | 16,701 | 16,702 | 16,703 | 16,704 | 16,705 | 16,706 | 16,707 | 16,708 | 16,709 | 16,710 | 16,711 | 16,712 | 16,713 |
| | 2-195 | 16,726 | 16,727 | 16,728 | 16,729 | 16,730 | 16,731 | 16,732 | 16,733 | 16,734 | 16,735 | 16,736 | 16,737 | 16,738 |
| | 2-196 | 16,751 | 16,752 | 16,753 | 16,754 | 16,755 | 16,756 | 16,757 | 16,758 | 16,759 | 16,760 | 16,761 | 16,762 | 16,763 |
| | 2-197 | 16,776 | 16,777 | 16,778 | 16,779 | 16,780 | 16,781 | 16,782 | 16,783 | 16,784 | 16,785 | 16,786 | 16,787 | 16,788 |
| | 2-198 | 16,801 | 16,802 | 16,803 | 16,804 | 16,805 | 16,806 | 16,807 | 16,808 | 16,809 | 16,810 | 16,811 | 16,812 | 16,813 |
| | 2-199 | 16,826 | 16,827 | 16,828 | 16,829 | 16,830 | 16,831 | 16,832 | 16,833 | 16,834 | 16,835 | 16,836 | 16,837 | 16,838 |
| | 2-200 | 16,851 | 16,852 | 16,853 | 16,854 | 16,855 | 16,856 | 16,857 | 16,858 | 16,859 | 16,860 | 16,861 | 16,862 | 16,863 |
| | 2-201 | 16,876 | 16,877 | 16,878 | 16,879 | 16,880 | 16,881 | 16,882 | 16,883 | 16,884 | 16,885 | 16,886 | 16,887 | 16,888 |
| | 2-202 | 16,901 | 16,902 | 16,903 | 16,904 | 16,905 | 16,906 | 16,907 | 16,908 | 16,909 | 16,910 | 16,911 | 16,912 | 16,913 |
| | 2-203 | 16,926 | 16,927 | 16,928 | 16,929 | 16,930 | 16,931 | 16,932 | 16,933 | 16,934 | 16,935 | 16,936 | 16,937 | 16,938 |
| | 2-204 | 16,951 | 16,952 | 16,953 | 16,954 | 16,955 | 16,956 | 16,957 | 16,958 | 16,959 | 16,960 | 16,961 | 16,962 | 16,963 |
| | 2-205 | 16,976 | 16,977 | 16,978 | 16,979 | 16,980 | 16,981 | 16,982 | 16,983 | 16,984 | 16,985 | 16,986 | 16,987 | 16,988 |
| | 2-206 | 17,001 | 17,002 | 17,003 | 17,004 | 17,005 | 17,006 | 17,007 | 17,008 | 17,009 | 17,010 | 17,011 | 17,012 | 17,013 |
| | 2-207 | 17,026 | 17,027 | 17,028 | 17,029 | 17,030 | 17,031 | 17,032 | 17,033 | 17,034 | 17,035 | 17,036 | 17,037 | 17,038 |
| | 2-208 | 17,051 | 17,052 | 17,053 | 17,054 | 17,055 | 17,056 | 17,057 | 17,058 | 17,059 | 17,060 | 17,061 | 17,062 | 17,063 |
| | 2-209 | 17,076 | 17,077 | 17,078 | 17,079 | 17,080 | 17,081 | 17,082 | 17,083 | 17,084 | 17,085 | 17,086 | 17,087 | 17,088 |
| | 2-210 | 17,101 | 17,102 | 17,103 | 17,104 | 17,105 | 17,106 | 17,107 | 17,108 | 17,109 | 17,110 | 17,111 | 17,112 | 17,113 |
| | 2-211 | 17,126 | 17,127 | 17,128 | 17,129 | 17,130 | 17,131 | 17,132 | 17,133 | 17,134 | 17,135 | 17,136 | 17,137 | 17,138 |
| | 2-212 | 17,151 | 17,152 | 17,153 | 17,154 | 17,155 | 17,156 | 17,157 | 17,158 | 17,159 | 17,160 | 17,161 | 17,162 | 17,163 |
| | 2-213 | 17,176 | 17,177 | 17,178 | 17,179 | 17,180 | 17,181 | 17,182 | 17,183 | 17,184 | 17,185 | 17,186 | 17,187 | 17,188 |
| | 2-214 | 17,201 | 17,202 | 17,203 | 17,204 | 17,205 | 17,206 | 17,207 | 17,208 | 17,209 | 17,210 | 17,211 | 17,212 | 17,213 |
| | 2-215 | 17,226 | 17,227 | 17,228 | 17,229 | 17,230 | 17,231 | 17,232 | 17,233 | 17,234 | 17,235 | 17,236 | 17,237 | 17,238 |
| | 2-216 | 17,251 | 17,252 | 17,253 | 17,254 | 17,255 | 17,256 | 17,257 | 17,258 | 17,259 | 17,260 | 17,261 | 17,262 | 17,263 |
| | 2-217 | 17,276 | 17,277 | 17,278 | 17,279 | 17,280 | 17,281 | 17,282 | 17,283 | 17,284 | 17,285 | 17,286 | 17,287 | 17,288 |
| | 2-218 | 17,301 | 17,302 | 17,303 | 17,304 | 17,305 | 17,306 | 17,307 | 17,308 | 17,309 | 17,310 | 17,311 | 17,312 | 17,313 |
| | 2-219 | 17,326 | 17,327 | 17,328 | 17,329 | 17,330 | 17,331 | 17,332 | 17,333 | 17,334 | 17,335 | 17,336 | 17,337 | 17,338 |
| | 2-220 | 17,351 | 17,352 | 17,353 | 17,354 | 17,355 | 17,356 | 17,357 | 17,358 | 17,359 | 17,360 | 17,361 | 17,362 | 17,363 |

| | | Compound represented by the formula (1) | | | | | | | | | | | |
|---|---|---|---|---|---|---|---|---|---|---|---|---|---|
| | | 1-14 | 1-15 | 1-16 | 1-17 | 1-18 | 1-19 | 1-20 | 1-21 | 1-22 | 1-23 | 1-24 | 1-25 |
| Compound represented by the formula (2) | 2-166 | 16,014 | 16,015 | 16,016 | 16,017 | 16,018 | 16,019 | 16,020 | 16,021 | 16,022 | 16,023 | 16,024 | 16,025 |
| | 2-167 | 16,039 | 16,040 | 16,041 | 16,042 | 16,043 | 16,044 | 16,045 | 16,046 | 16,047 | 16,048 | 16,049 | 16,050 |
| | 2-168 | 16,064 | 16,065 | 16,066 | 16,067 | 16,068 | 16,069 | 16,070 | 16,071 | 16,072 | 16,073 | 16,074 | 16,075 |
| | 2-169 | 16,089 | 16,090 | 16,091 | 16,092 | 16,093 | 16,094 | 16,095 | 16,096 | 16,097 | 16,098 | 16,099 | 16,100 |
| | 2-170 | 16,114 | 16,115 | 16,116 | 16,117 | 16,118 | 16,119 | 16,120 | 16,121 | 16,122 | 16,123 | 16,124 | 16,125 |
| | 2-171 | 16,139 | 16,140 | 16,141 | 16,142 | 16,143 | 16,144 | 16,145 | 16,146 | 16,147 | 16,148 | 16,149 | 16,150 |

TABLE 13-continued

| | | | | | | | | | | | | |
|---|---|---|---|---|---|---|---|---|---|---|---|---|
| 2-172 | 16,164 | 16,165 | 16,166 | 16,167 | 16,168 | 16,169 | 16,170 | 16,171 | 16,172 | 16,173 | 16,174 | 16,175 |
| 2-173 | 16,189 | 16,190 | 16,191 | 16,192 | 16,193 | 16,194 | 16,195 | 16,196 | 16,197 | 16,198 | 16,199 | 16,200 |
| 2-174 | 16,214 | 16,215 | 16,216 | 16,217 | 16,218 | 16,219 | 16,220 | 16,221 | 16,222 | 16,223 | 16,224 | 16,225 |
| 2-175 | 16,239 | 16,240 | 16,241 | 16,242 | 16,243 | 16,244 | 16,245 | 16,246 | 16,247 | 16,248 | 16,249 | 16,250 |
| 2-176 | 16,264 | 16,265 | 16,266 | 16,267 | 16,268 | 16,269 | 16,270 | 16,271 | 16,272 | 16,273 | 16,274 | 16,275 |
| 2-177 | 16,289 | 16,290 | 16,291 | 16,292 | 16,293 | 16,294 | 16,295 | 16,296 | 16,297 | 16,298 | 16,299 | 16,300 |
| 2-178 | 16,314 | 16,315 | 16,316 | 16,317 | 16,318 | 16,319 | 16,320 | 16,321 | 16,322 | 16,323 | 16,324 | 16,325 |
| 2-179 | 16,339 | 16,340 | 16,341 | 16,342 | 16,343 | 16,344 | 16,345 | 16,346 | 16,347 | 16,348 | 16,349 | 16,350 |
| 2-180 | 16,364 | 16,365 | 16,366 | 16,367 | 16,368 | 16,369 | 16,370 | 16,371 | 16,372 | 16,373 | 16,374 | 16,375 |
| 2-181 | 16,389 | 16,390 | 16,391 | 16,392 | 16,393 | 16,394 | 16,395 | 16,396 | 16,397 | 16,398 | 16,399 | 16,400 |
| 2-182 | 16,414 | 16,415 | 16,416 | 16,417 | 16,418 | 16,419 | 16,420 | 16,421 | 16,422 | 16,423 | 16,424 | 16,425 |
| 2-183 | 16,439 | 16,440 | 16,441 | 16,442 | 16,443 | 16,444 | 16,445 | 16,446 | 16,447 | 16,448 | 16,449 | 16,450 |
| 2-184 | 16,464 | 16,465 | 16,466 | 16,467 | 16,468 | 16,469 | 16,470 | 16,471 | 16,472 | 16,473 | 16,474 | 16,475 |
| 2-185 | 16,489 | 16,490 | 16,491 | 16,492 | 16,493 | 16,494 | 16,495 | 16,496 | 16,497 | 16,498 | 16,499 | 16,500 |
| 2-186 | 16,514 | 16,515 | 16,516 | 16,517 | 16,518 | 16,519 | 16,520 | 16,521 | 16,522 | 16,523 | 16,524 | 16,525 |
| 2-187 | 16,539 | 16,540 | 16,541 | 16,542 | 16,543 | 16,544 | 16,545 | 16,546 | 16,547 | 16,548 | 16,549 | 16,550 |
| 2-188 | 16,564 | 16,565 | 16,566 | 16,567 | 16,568 | 16,569 | 16,570 | 16,571 | 16,572 | 16,573 | 16,574 | 16,575 |
| 2-189 | 16,589 | 16,590 | 16,591 | 16,592 | 16,593 | 16,594 | 16,595 | 16,596 | 16,597 | 16,598 | 16,599 | 16,600 |
| 2-190 | 16,614 | 16,615 | 16,616 | 16,617 | 16,618 | 16,619 | 16,620 | 16,621 | 16,622 | 16,623 | 16,624 | 16,625 |
| 2-191 | 16,639 | 16,640 | 16,641 | 16,642 | 16,643 | 16,644 | 16,645 | 16,646 | 16,647 | 16,648 | 16,649 | 16,650 |
| 2-192 | 16,664 | 16,665 | 16,666 | 16,667 | 16,668 | 16,669 | 16,670 | 16,671 | 16,672 | 16,673 | 16,674 | 16,675 |
| 2-193 | 16,689 | 16,690 | 16,691 | 16,692 | 16,693 | 16,694 | 16,695 | 16,696 | 16,697 | 16,698 | 16,699 | 16,700 |
| 2-194 | 16,714 | 16,715 | 16,716 | 16,717 | 16,718 | 16,719 | 16,720 | 16,721 | 16,722 | 16,723 | 16,724 | 16,725 |
| 2-195 | 16,739 | 16,740 | 16,741 | 16,742 | 16,743 | 16,744 | 16,745 | 16,746 | 16,747 | 16,748 | 16,749 | 16,750 |
| 2-196 | 16,764 | 16,765 | 16,766 | 16,767 | 16,768 | 16,769 | 16,770 | 16,771 | 16,772 | 16,773 | 16,774 | 16,775 |
| 2-197 | 16,789 | 16,790 | 16,791 | 16,792 | 16,793 | 16,794 | 16,795 | 16,796 | 16,797 | 16,798 | 16,799 | 16,800 |
| 2-198 | 16,814 | 16,815 | 16,816 | 16,817 | 16,818 | 16,819 | 16,820 | 16,821 | 16,822 | 16,823 | 16,824 | 16,825 |
| 2-199 | 16,839 | 16,840 | 16,841 | 16,842 | 16,843 | 16,844 | 16,845 | 16,846 | 16,847 | 16,848 | 16,849 | 16,850 |
| 2-200 | 16,864 | 16,865 | 16,866 | 16,867 | 16,868 | 16,869 | 16,870 | 16,871 | 16,872 | 16,873 | 16,874 | 16,875 |
| 2-201 | 16,889 | 16,890 | 16,891 | 16,892 | 16,893 | 16,894 | 16,895 | 16,896 | 16,897 | 16,898 | 16,899 | 16,900 |
| 2-202 | 16,914 | 16,915 | 16,916 | 16,917 | 16,918 | 16,919 | 16,920 | 16,921 | 16,922 | 16,923 | 16,924 | 16,925 |
| 2-203 | 16,939 | 16,940 | 16,941 | 16,942 | 16,943 | 16,944 | 16,945 | 16,946 | 16,947 | 16,948 | 16,949 | 16,950 |
| 2-204 | 16,964 | 16,965 | 16,966 | 16,967 | 16,968 | 16,969 | 16,970 | 16,971 | 16,972 | 16,973 | 16,974 | 16,975 |
| 2-205 | 16,989 | 16,990 | 16,991 | 16,992 | 16,993 | 16,994 | 16,995 | 16,996 | 16,997 | 16,998 | 16,999 | 17,000 |
| 2-206 | 17,014 | 17,015 | 17,016 | 17,017 | 17,018 | 17,019 | 17,020 | 17,021 | 17,022 | 17,023 | 17,024 | 17,025 |
| 2-207 | 17,039 | 17,040 | 17,041 | 17,042 | 17,043 | 17,044 | 17,045 | 17,046 | 17,047 | 17,048 | 17,049 | 17,050 |
| 2-208 | 17,064 | 17,065 | 17,066 | 17,067 | 17,068 | 17,069 | 17,070 | 17,071 | 17,072 | 17,073 | 17,074 | 17,075 |
| 2-209 | 17,089 | 17,090 | 17,091 | 17,092 | 17,093 | 17,094 | 17,095 | 17,096 | 17,097 | 17,098 | 17,099 | 17,100 |
| 2-210 | 17,114 | 17,115 | 17,116 | 17,117 | 17,118 | 17,119 | 17,120 | 17,121 | 17,122 | 17,123 | 17,124 | 17,125 |
| 2-211 | 17,139 | 17,140 | 17,141 | 17,142 | 17,143 | 17,144 | 17,145 | 17,146 | 17,147 | 17,148 | 17,149 | 17,150 |
| 2-212 | 17,164 | 17,165 | 17,166 | 17,167 | 17,168 | 17,169 | 17,170 | 17,171 | 17,172 | 17,173 | 17,174 | 17,175 |
| 2-213 | 17,189 | 17,190 | 17,191 | 17,192 | 17,193 | 17,194 | 17,195 | 17,196 | 17,197 | 17,198 | 17,199 | 17,200 |
| 2-214 | 17,214 | 17,215 | 17,216 | 17,217 | 17,218 | 17,219 | 17,220 | 17,221 | 17,222 | 17,223 | 17,224 | 17,225 |
| 2-215 | 17,239 | 17,240 | 17,241 | 17,242 | 17,243 | 17,244 | 17,245 | 17,246 | 17,247 | 17,248 | 17,249 | 17,250 |
| 2-216 | 17,264 | 17,265 | 17,266 | 17,267 | 17,268 | 17,269 | 17,270 | 17,271 | 17,272 | 17,273 | 17,274 | 17,275 |
| 2-217 | 17,289 | 17,290 | 17,291 | 17,292 | 17,293 | 17,294 | 17,295 | 17,296 | 17,297 | 17,298 | 17,299 | 17,300 |
| 2-218 | 17,314 | 17,315 | 17,316 | 17,317 | 17,318 | 17,319 | 17,320 | 17,321 | 17,322 | 17,323 | 17,324 | 17,325 |
| 2-219 | 17,339 | 17,340 | 17,341 | 17,342 | 17,343 | 17,344 | 17,345 | 17,346 | 17,347 | 17,348 | 17,349 | 17,350 |
| 2-220 | 17,364 | 17,365 | 17,366 | 17,367 | 17,368 | 17,369 | 17,370 | 17,371 | 17,372 | 17,373 | 17,374 | 17,375 |

TABLE 14

| | | Compound represented by the formula (1) | | | | | | | | | | | | |
|---|---|---|---|---|---|---|---|---|---|---|---|---|---|---|
| | | 1-1 | 1-2 | 1-3 | 1-4 | 1-5 | 1-6 | 1-7 | 1-8 | 1-9 | 1-10 | 1-11 | 1-12 | 1-13 |
| Compound represented by the formula (2) | 2-221 | 17,376 | 17,377 | 17,378 | 17,379 | 17,380 | 17,381 | 17,382 | 17,383 | 17,384 | 17,385 | 17,386 | 17,387 | 17,388 |
| | 2-222 | 17,401 | 17,402 | 17,403 | 17,404 | 17,405 | 17,406 | 17,407 | 17,408 | 17,409 | 17,410 | 17,411 | 17,412 | 17,413 |
| | 2-223 | 17,426 | 17,427 | 17,428 | 17,429 | 17,430 | 17,431 | 17,432 | 17,433 | 17,434 | 17,435 | 17,436 | 17,437 | 17,438 |
| | 2-224 | 17,451 | 17,452 | 17,453 | 17,454 | 17,455 | 17,456 | 17,457 | 17,458 | 17,459 | 17,460 | 17,461 | 17,462 | 17,463 |
| | 2-225 | 17,476 | 17,477 | 17,478 | 17,479 | 17,480 | 17,481 | 17,482 | 17,483 | 17,484 | 17,485 | 17,486 | 17,487 | 17,488 |
| | 2-226 | 17,501 | 17,502 | 17,503 | 17,504 | 17,505 | 17,506 | 17,507 | 17,508 | 17,509 | 17,510 | 17,511 | 17,512 | 17,513 |
| | 2-227 | 17,526 | 17,527 | 17,528 | 17,529 | 17,530 | 17,531 | 17,532 | 17,533 | 17,534 | 17,535 | 17,536 | 17,537 | 17,538 |
| | 2-228 | 17,551 | 17,552 | 17,553 | 17,554 | 17,555 | 17,556 | 17,557 | 17,558 | 17,559 | 17,560 | 17,561 | 17,562 | 17,563 |
| | 2-229 | 17,576 | 17,577 | 17,578 | 17,579 | 17,580 | 17,581 | 17,582 | 17,583 | 17,584 | 17,585 | 17,586 | 17,587 | 17,588 |
| | 2-230 | 17,601 | 17,602 | 17,603 | 17,604 | 17,605 | 17,606 | 17,607 | 17,608 | 17,609 | 17,610 | 17,611 | 17,612 | 17,613 |
| | 2-231 | 17,626 | 17,627 | 17,628 | 17,629 | 17,630 | 17,631 | 17,632 | 17,633 | 17,634 | 17,635 | 17,636 | 17,637 | 17,638 |
| | 2-232 | 17,651 | 17,652 | 17,653 | 17,654 | 17,655 | 17,656 | 17,657 | 17,658 | 17,659 | 17,660 | 17,661 | 17,662 | 17,663 |
| | 2-233 | 17,676 | 17,677 | 17,678 | 17,679 | 17,680 | 17,681 | 17,682 | 17,683 | 17,684 | 17,685 | 17,686 | 17,687 | 17,688 |
| | 2-234 | 17,701 | 17,702 | 17,703 | 17,704 | 17,705 | 17,706 | 17,707 | 17,708 | 17,709 | 17,710 | 17,711 | 17,712 | 17,713 |
| | 2-235 | 17,726 | 17,727 | 17,728 | 17,729 | 17,730 | 17,731 | 17,732 | 17,733 | 17,734 | 17,735 | 17,736 | 17,737 | 17,738 |
| | 2-236 | 17,751 | 17,752 | 17,753 | 17,754 | 17,755 | 17,756 | 17,757 | 17,758 | 17,759 | 17,760 | 17,761 | 17,762 | 17,763 |
| | 2-237 | 17,776 | 17,777 | 17,778 | 17,779 | 17,780 | 17,781 | 17,782 | 17,783 | 17,784 | 17,785 | 17,786 | 17,787 | 17,788 |
| | 2-238 | 17,801 | 17,802 | 17,803 | 17,804 | 17,805 | 17,806 | 17,807 | 17,808 | 17,809 | 17,810 | 17,811 | 17,812 | 17,813 |
| | 2-239 | 17,826 | 17,827 | 17,828 | 17,829 | 17,830 | 17,831 | 17,832 | 17,833 | 17,834 | 17,835 | 17,836 | 17,837 | 17,838 |
| | 2-240 | 17,851 | 17,852 | 17,853 | 17,854 | 17,855 | 17,856 | 17,857 | 17,858 | 17,859 | 17,860 | 17,861 | 17,862 | 17,863 |
| | 2-241 | 17,876 | 17,877 | 17,878 | 17,879 | 17,880 | 17,881 | 17,882 | 17,883 | 17,884 | 17,885 | 17,886 | 17,887 | 17,888 |

TABLE 14-continued

| | | | | | | | | | | | | | |
|---|---|---|---|---|---|---|---|---|---|---|---|---|---|
| 2-242 | 17,901 | 17,902 | 17,903 | 17,904 | 17,905 | 17,906 | 17,907 | 17,908 | 17,909 | 17,910 | 17,911 | 17,912 | 17,913 |
| 2-243 | 17,926 | 17,927 | 17,928 | 17,929 | 17,930 | 17,931 | 17,932 | 17,933 | 17,934 | 17,935 | 17,936 | 17,937 | 17,938 |
| 2-244 | 17,951 | 17,952 | 17,953 | 17,954 | 17,955 | 17,956 | 17,957 | 17,958 | 17,959 | 17,960 | 17,961 | 17,962 | 17,963 |
| 2-245 | 17,976 | 17,977 | 17,978 | 17,979 | 17,980 | 17,981 | 17,982 | 17,983 | 17,984 | 17,985 | 17,986 | 17,987 | 17,988 |
| 2-246 | 18,001 | 18,002 | 18,003 | 18,004 | 18,005 | 18,006 | 18,007 | 18,008 | 18,009 | 18,010 | 18,011 | 18,012 | 18,013 |
| 2-247 | 18,026 | 18,027 | 18,028 | 18,029 | 18,030 | 18,031 | 18,032 | 18,033 | 18,034 | 18,035 | 18,036 | 18,037 | 18,038 |
| 2-248 | 18,051 | 18,052 | 18,053 | 18,054 | 18,055 | 18,056 | 18,057 | 18,058 | 18,059 | 18,060 | 18,061 | 18,062 | 18,063 |
| 2-249 | 18,076 | 18,077 | 18,078 | 18,079 | 18,080 | 18,081 | 18,082 | 18,083 | 18,084 | 18,085 | 18,086 | 18,087 | 18,088 |
| 2-250 | 18,101 | 18,102 | 18,103 | 18,104 | 18,105 | 18,106 | 18,107 | 18,108 | 18,109 | 18,110 | 18,111 | 18,112 | 18,113 |
| 2-251 | 18,126 | 18,127 | 18,128 | 18,129 | 18,130 | 18,131 | 18,132 | 18,133 | 18,134 | 18,135 | 18,136 | 18,137 | 18,138 |
| 2-252 | 18,151 | 18,152 | 18,153 | 18,154 | 18,155 | 18,156 | 18,157 | 18,158 | 18,159 | 18,160 | 18,161 | 18,162 | 18,163 |
| 2-253 | 18,176 | 18,177 | 18,178 | 18,179 | 18,180 | 18,181 | 18,182 | 18,183 | 18,184 | 18,185 | 18,186 | 18,187 | 18,188 |
| 2-254 | 18,201 | 18,202 | 18,203 | 18,204 | 18,205 | 18,206 | 18,207 | 18,208 | 18,209 | 18,210 | 18,211 | 18,212 | 18,213 |
| 2-255 | 18,226 | 18,227 | 18,228 | 18,229 | 18,230 | 18,231 | 18,232 | 18,233 | 18,234 | 18,235 | 18,236 | 18,237 | 18,238 |
| 2-256 | 18,251 | 18,252 | 18,253 | 18,254 | 18,255 | 18,256 | 18,257 | 18,258 | 18,259 | 18,260 | 18,261 | 18,262 | 18,263 |
| 2-257 | 18,276 | 18,277 | 18,278 | 18,279 | 18,280 | 18,281 | 18,282 | 18,283 | 18,284 | 18,285 | 18,286 | 18,287 | 18,288 |
| 2-258 | 18,301 | 18,302 | 18,303 | 18,304 | 18,305 | 18,306 | 18,307 | 18,308 | 18,309 | 18,310 | 18,311 | 18,312 | 18,313 |
| 2-259 | 18,326 | 18,327 | 18,328 | 18,329 | 18,330 | 18,331 | 18,332 | 18,333 | 18,334 | 18,335 | 18,336 | 18,337 | 18,338 |
| 2-260 | 18,351 | 18,352 | 18,353 | 18,354 | 18,355 | 18,356 | 18,357 | 18,358 | 18,359 | 18,360 | 18,361 | 18,362 | 18,363 |
| 2-261 | 18,376 | 18,377 | 18,378 | 18,379 | 18,380 | 18,381 | 18,382 | 18,383 | 18,384 | 18,385 | 18,386 | 18,387 | 18,388 |
| 2-262 | 18,401 | 18,402 | 18,403 | 18,404 | 18,405 | 18,406 | 18,407 | 18,408 | 18,409 | 18,410 | 18,411 | 18,412 | 18,413 |
| 2-263 | 18,426 | 18,427 | 18,428 | 18,429 | 18,430 | 18,431 | 18,432 | 18,433 | 18,434 | 18,435 | 18,436 | 18,437 | 18,438 |
| 2-264 | 18,451 | 18,452 | 18,453 | 18,454 | 18,455 | 18,456 | 18,457 | 18,458 | 18,459 | 18,460 | 18,461 | 18,462 | 18,463 |
| 2-265 | 18,476 | 18,477 | 18,478 | 18,479 | 18,480 | 18,481 | 18,482 | 18,483 | 18,484 | 18,485 | 18,486 | 18,487 | 18,488 |
| 2-266 | 18,501 | 18,502 | 18,503 | 18,504 | 18,505 | 18,506 | 18,507 | 18,508 | 18,509 | 18,510 | 18,511 | 18,512 | 18,513 |
| 2-267 | 18,526 | 18,527 | 18,528 | 18,529 | 18,530 | 18,531 | 18,532 | 18,533 | 18,534 | 18,535 | 18,536 | 18,537 | 18,538 |
| 2-268 | 18,551 | 18,552 | 18,553 | 18,554 | 18,555 | 18,556 | 18,557 | 18,558 | 18,559 | 18,560 | 18,561 | 18,562 | 18,563 |
| 2-269 | 18,576 | 18,577 | 18,578 | 18,579 | 18,580 | 18,581 | 18,582 | 18,583 | 18,584 | 18,585 | 18,586 | 18,587 | 18,588 |
| 2-270 | 18,601 | 18,602 | 18,603 | 18,604 | 18,605 | 18,606 | 18,607 | 18,608 | 18,609 | 18,610 | 18,611 | 18,612 | 18,613 |
| 2-271 | 18,626 | 18,627 | 18,628 | 18,629 | 18,630 | 18,631 | 18,632 | 18,633 | 18,634 | 18,635 | 18,636 | 18,637 | 18,638 |
| 2-272 | 18,651 | 18,652 | 18,653 | 18,654 | 18,655 | 18,656 | 18,657 | 18,658 | 18,659 | 18,660 | 18,661 | 18,662 | 18,663 |
| 2-273 | 18,676 | 18,677 | 18,678 | 18,679 | 18,680 | 18,681 | 18,682 | 18,683 | 18,684 | 18,685 | 18,686 | 18,687 | 18,688 |
| 2-274 | 18,701 | 18,702 | 18,703 | 18,704 | 18,705 | 18,706 | 18,707 | 18,708 | 18,709 | 18,710 | 18,711 | 18,712 | 18,713 |
| 2-275 | 18,726 | 18,727 | 18,728 | 18,729 | 18,730 | 18,731 | 18,732 | 18,733 | 18,734 | 18,735 | 18,736 | 18,737 | 18,738 |

| | | Compound represented by the formula (1) | | | | | | | | | | | |
|---|---|---|---|---|---|---|---|---|---|---|---|---|---|
| | | 1-14 | 1-15 | 1-16 | 1-17 | 1-18 | 1-19 | 1-20 | 1-21 | 1-22 | 1-23 | 1-24 | 1-25 |
| Compound represented by the formula (2) | 2-221 | 17,389 | 17,390 | 17,391 | 17,392 | 17,393 | 17,394 | 17,395 | 17,396 | 17,397 | 17,398 | 17,399 | 17,400 |
| | 2-222 | 17,414 | 17,415 | 17,416 | 17,417 | 17,418 | 17,419 | 17,420 | 17,421 | 17,422 | 17,423 | 17,424 | 17,425 |
| | 2-223 | 17,439 | 17,440 | 17,441 | 17,442 | 17,443 | 17,444 | 17,445 | 17,446 | 17,447 | 17,448 | 17,449 | 17,450 |
| | 2-224 | 17,464 | 17,465 | 17,466 | 17,467 | 17,468 | 17,469 | 17,470 | 17,471 | 17,472 | 17,473 | 17,474 | 17,475 |
| | 2-225 | 17,489 | 17,490 | 17,491 | 17,492 | 17,493 | 17,494 | 17,495 | 17,496 | 17,497 | 17,498 | 17,499 | 17,500 |
| | 2-226 | 17,514 | 17,515 | 17,516 | 17,517 | 17,518 | 17,519 | 17,520 | 17,521 | 17,522 | 17,523 | 17,524 | 17,525 |
| | 2-227 | 17,539 | 17,540 | 17,541 | 17,542 | 17,543 | 17,544 | 17,545 | 17,546 | 17,547 | 17,548 | 17,549 | 17,550 |
| | 2-228 | 17,564 | 17,565 | 17,566 | 17,567 | 17,568 | 17,569 | 17,570 | 17,571 | 17,572 | 17,573 | 17,574 | 17,575 |
| | 2-229 | 17,589 | 17,590 | 17,591 | 17,592 | 17,593 | 17,594 | 17,595 | 17,596 | 17,597 | 17,598 | 17,599 | 17,600 |
| | 2-230 | 17,614 | 17,615 | 17,616 | 17,617 | 17,618 | 17,619 | 17,620 | 17,621 | 17,622 | 17,623 | 17,624 | 17,625 |
| | 2-231 | 17,639 | 17,640 | 17,641 | 17,642 | 17,643 | 17,644 | 17,645 | 17,646 | 17,647 | 17,648 | 17,649 | 17,650 |
| | 2-232 | 17,664 | 17,665 | 17,666 | 17,667 | 17,668 | 17,669 | 17,670 | 17,671 | 17,672 | 17,673 | 17,674 | 17,675 |
| | 2-233 | 17,689 | 17,690 | 17,691 | 17,692 | 17,693 | 17,694 | 17,695 | 17,696 | 17,697 | 17,698 | 17,699 | 17,700 |
| | 2-234 | 17,714 | 17,715 | 17,716 | 17,717 | 17,718 | 17,719 | 17,720 | 17,721 | 17,722 | 17,723 | 17,724 | 17,725 |
| | 2-235 | 17,739 | 17,740 | 17,741 | 17,742 | 17,743 | 17,744 | 17,745 | 17,746 | 17,747 | 17,748 | 17,749 | 17,750 |
| | 2-236 | 17,764 | 17,765 | 17,766 | 17,767 | 17,768 | 17,769 | 17,770 | 17,771 | 17,772 | 17,773 | 17,774 | 17,775 |
| | 2-237 | 17,789 | 17,790 | 17,791 | 17,792 | 17,793 | 17,794 | 17,795 | 17,796 | 17,797 | 17,798 | 17,799 | 17,800 |
| | 2-238 | 17,814 | 17,815 | 17,816 | 17,817 | 17,818 | 17,819 | 17,820 | 17,821 | 17,822 | 17,823 | 17,824 | 17,825 |
| | 2-239 | 17,839 | 17,840 | 17,841 | 17,842 | 17,843 | 17,844 | 17,845 | 17,846 | 17,847 | 17,848 | 17,849 | 17,850 |
| | 2-240 | 17,864 | 17,865 | 17,866 | 17,867 | 17,868 | 17,869 | 17,870 | 17,871 | 17,872 | 17,873 | 17,874 | 17,875 |
| | 2-241 | 17,889 | 17,890 | 17,891 | 17,892 | 17,893 | 17,894 | 17,895 | 17,896 | 17,897 | 17,898 | 17,899 | 17,900 |
| | 2-242 | 17,914 | 17,915 | 17,916 | 17,917 | 17,918 | 17,919 | 17,920 | 17,921 | 17,922 | 17,923 | 17,924 | 17,925 |
| | 2-243 | 17,939 | 17,940 | 17,941 | 17,942 | 17,943 | 17,944 | 17,945 | 17,946 | 17,947 | 17,948 | 17,949 | 17,950 |
| | 2-244 | 17,964 | 17,965 | 17,966 | 17,967 | 17,968 | 17,969 | 17,970 | 17,971 | 17,972 | 17,973 | 17,974 | 17,975 |
| | 2-245 | 17,989 | 17,990 | 17,991 | 17,992 | 17,993 | 17,994 | 17,995 | 17,996 | 17,997 | 17,998 | 17,999 | 18,000 |
| | 2-246 | 18,014 | 18,015 | 18,016 | 18,017 | 18,018 | 18,019 | 18,020 | 18,021 | 18,022 | 18,023 | 18,024 | 18,025 |
| | 2-247 | 18,039 | 18,040 | 18,041 | 18,042 | 18,043 | 18,044 | 18,045 | 18,046 | 18,047 | 18,048 | 18,049 | 18,050 |
| | 2-248 | 18,064 | 18,065 | 18,066 | 18,067 | 18,068 | 18,069 | 18,070 | 18,071 | 18,072 | 18,073 | 18,074 | 18,075 |
| | 2-249 | 18,089 | 18,090 | 18,091 | 18,092 | 18,093 | 18,094 | 18,095 | 18,096 | 18,097 | 18,098 | 18,099 | 18,100 |
| | 2-250 | 18,114 | 18,115 | 18,116 | 18,117 | 18,118 | 18,119 | 18,120 | 18,121 | 18,122 | 18,123 | 18,124 | 18,125 |
| | 2-251 | 18,139 | 18,140 | 18,141 | 18,142 | 18,143 | 18,144 | 18,145 | 18,146 | 18,147 | 18,148 | 18,149 | 18,150 |
| | 2-252 | 18,164 | 18,165 | 18,166 | 18,167 | 18,168 | 18,169 | 18,170 | 18,171 | 18,172 | 18,173 | 18,174 | 18,175 |
| | 2-253 | 18,189 | 18,190 | 18,191 | 18,192 | 18,193 | 18,194 | 18,195 | 18,196 | 18,197 | 18,198 | 18,199 | 18,200 |
| | 2-254 | 18,214 | 18,215 | 18,216 | 18,217 | 18,218 | 18,219 | 18,220 | 18,221 | 18,222 | 18,223 | 18,224 | 18,225 |
| | 2-255 | 18,239 | 18,240 | 18,241 | 18,242 | 18,243 | 18,244 | 18,245 | 18,246 | 18,247 | 18,248 | 18,249 | 18,250 |
| | 2-256 | 18,264 | 18,265 | 18,266 | 18,267 | 18,268 | 18,269 | 18,270 | 18,271 | 18,272 | 18,273 | 18,274 | 18,275 |
| | 2-257 | 18,289 | 18,290 | 18,291 | 18,292 | 18,293 | 18,294 | 18,295 | 18,296 | 18,297 | 18,298 | 18,299 | 18,300 |
| | 2-258 | 18,314 | 18,315 | 18,316 | 18,317 | 18,318 | 18,319 | 18,320 | 18,321 | 18,322 | 18,323 | 18,324 | 18,325 |
| | 2-259 | 18,339 | 18,340 | 18,341 | 18,342 | 18,343 | 18,344 | 18,345 | 18,346 | 18,347 | 18,348 | 18,349 | 18,350 |
| | 2-260 | 18,364 | 18,365 | 18,366 | 18,367 | 18,368 | 18,369 | 18,370 | 18,371 | 18,372 | 18,373 | 18,374 | 18,375 |
| | 2-261 | 18,389 | 18,390 | 18,391 | 18,392 | 18,393 | 18,394 | 18,395 | 18,396 | 18,397 | 18,398 | 18,399 | 18,400 |

TABLE 14-continued

| | | | | | | | | | | | | | |
|---|---|---|---|---|---|---|---|---|---|---|---|---|---|
| 2-262 | 18,414 | 18,415 | 18,416 | 18,417 | 18,418 | 18,419 | 18,420 | 18,421 | 18,422 | 18,423 | 18,424 | 18,425 |
| 2-263 | 18,439 | 18,440 | 18,441 | 18,442 | 18,443 | 18,444 | 18,445 | 18,446 | 18,447 | 18,448 | 18,449 | 18,450 |
| 2-264 | 18,464 | 18,465 | 18,466 | 18,467 | 18,468 | 18,469 | 18,470 | 18,471 | 18,472 | 18,473 | 18,474 | 18,475 |
| 2-265 | 18,489 | 18,490 | 18,491 | 18,492 | 18,493 | 18,494 | 18,495 | 18,496 | 18,497 | 18,498 | 18,499 | 18,500 |
| 2-266 | 18,514 | 18,515 | 18,516 | 18,517 | 18,518 | 18,519 | 18,520 | 18,521 | 18,522 | 18,523 | 18,524 | 18,525 |
| 2-267 | 18,539 | 18,540 | 18,541 | 18,542 | 18,543 | 18,544 | 18,545 | 18,546 | 18,547 | 18,548 | 18,549 | 18,550 |
| 2-268 | 18,564 | 18,565 | 18,566 | 18,567 | 18,568 | 18,569 | 18,570 | 18,571 | 18,572 | 18,573 | 18,574 | 18,575 |
| 2-269 | 18,589 | 18,590 | 18,591 | 18,592 | 18,593 | 18,594 | 18,595 | 18,596 | 18,597 | 18,598 | 18,599 | 18,600 |
| 2-270 | 18,614 | 18,615 | 18,616 | 18,617 | 18,618 | 18,619 | 18,620 | 18,621 | 18,622 | 18,623 | 18,624 | 18,625 |
| 2-271 | 18,639 | 18,640 | 18,641 | 18,642 | 18,643 | 18,644 | 18,645 | 18,646 | 18,647 | 18,648 | 18,649 | 18,650 |
| 2-272 | 18,664 | 18,665 | 18,666 | 18,667 | 18,668 | 18,669 | 18,670 | 18,671 | 18,672 | 18,673 | 18,674 | 18,675 |
| 2-273 | 18,689 | 18,690 | 18,691 | 18,692 | 18,693 | 18,694 | 18,695 | 18,696 | 18,697 | 18,698 | 18,699 | 18,700 |
| 2-274 | 18,714 | 18,715 | 18,716 | 18,717 | 18,718 | 18,719 | 18,720 | 18,721 | 18,722 | 18,723 | 18,724 | 18,725 |
| 2-275 | 18,739 | 18,740 | 18,741 | 18,742 | 18,743 | 18,744 | 18,745 | 18,746 | 18,747 | 18,748 | 18,749 | 18,750 |

TABLE 15

| | | Compound represented by the formula (1) | | | | | | | | | | | | |
|---|---|---|---|---|---|---|---|---|---|---|---|---|---|---|
| | | 1-1 | 1-2 | 1-3 | 1-4 | 1-5 | 1-6 | 1-7 | 1-8 | 1-9 | 1-10 | 1-11 | 1-12 | 1-13 |
| Compound represented by the formula (2) | 2-276 | 18,751 | 18,752 | 18,753 | 18,754 | 18,755 | 18,756 | 18,757 | 18,758 | 18,759 | 18,760 | 18,761 | 18,762 | 18,763 |
| | 2-277 | 18,776 | 18,777 | 18,778 | 18,779 | 18,780 | 18,781 | 18,782 | 18,783 | 18,784 | 18,785 | 18,786 | 18,787 | 18,788 |
| | 2-278 | 18,801 | 18,802 | 18,803 | 18,804 | 18,805 | 18,806 | 18,807 | 18,808 | 18,809 | 18,810 | 18,811 | 18,812 | 18,813 |
| | 2-279 | 18,826 | 18,827 | 18,828 | 18,829 | 18,830 | 18,831 | 18,832 | 18,833 | 18,834 | 18,835 | 18,836 | 18,837 | 18,838 |
| | 2-280 | 18,851 | 18,852 | 18,853 | 18,854 | 18,855 | 18,856 | 18,857 | 18,858 | 18,859 | 18,860 | 18,861 | 18,862 | 18,863 |
| | 2-281 | 18,876 | 18,877 | 18,878 | 18,879 | 18,880 | 18,881 | 18,882 | 18,883 | 18,884 | 18,885 | 18,886 | 18,887 | 18,888 |
| | 2-282 | 18,901 | 18,902 | 18,903 | 18,904 | 18,905 | 18,906 | 18,907 | 18,908 | 18,909 | 18,910 | 18,911 | 18,912 | 18,913 |
| | 2-283 | 18,926 | 18,927 | 18,928 | 18,929 | 18,930 | 18,931 | 18,932 | 18,933 | 18,934 | 18,935 | 18,936 | 18,937 | 18,938 |
| | 2-284 | 18,951 | 18,952 | 18,953 | 18,954 | 18,955 | 18,956 | 18,957 | 18,958 | 18,959 | 18,960 | 18,961 | 18,962 | 18,963 |
| | 2-285 | 18,976 | 18,977 | 18,978 | 18,979 | 18,980 | 18,981 | 18,982 | 18,983 | 18,984 | 18,985 | 18,986 | 18,987 | 18,988 |
| | 2-286 | 19,001 | 19,002 | 19,003 | 19,004 | 19,005 | 19,006 | 19,007 | 19,008 | 19,009 | 19,010 | 19,011 | 19,012 | 19,013 |
| | 2-287 | 19,026 | 19,027 | 19,028 | 19,029 | 19,030 | 19,031 | 19,032 | 19,033 | 19,034 | 19,035 | 19,036 | 19,037 | 19,038 |
| | 2-288 | 19,051 | 19,052 | 19,053 | 19,054 | 19,055 | 19,056 | 19,057 | 19,058 | 19,059 | 19,060 | 19,061 | 19,062 | 19,063 |
| | 2-289 | 19,076 | 19,077 | 19,078 | 19,079 | 19,080 | 19,081 | 19,082 | 19,083 | 19,084 | 19,085 | 19,086 | 19,087 | 19,088 |
| | 2-290 | 19,101 | 19,102 | 19,103 | 19,104 | 19,105 | 19,106 | 19,107 | 19,108 | 19,109 | 19,110 | 19,111 | 19,112 | 19,113 |
| | 2-291 | 19,126 | 19,127 | 19,128 | 19,129 | 19,130 | 19,131 | 19,132 | 19,133 | 19,134 | 19,135 | 19,136 | 19,137 | 19,138 |
| | 2-292 | 19,151 | 19,152 | 19,153 | 19,154 | 19,155 | 19,156 | 19,157 | 19,158 | 19,159 | 19,160 | 19,161 | 19,162 | 19,163 |
| | 2-293 | 19,176 | 19,177 | 19,178 | 19,179 | 19,180 | 19,181 | 19,182 | 19,183 | 19,184 | 19,185 | 19,186 | 19,187 | 19,188 |
| | 2-294 | 19,201 | 19,102 | 19,103 | 19,104 | 19,105 | 19,106 | 19,107 | 19,108 | 19,109 | 19,110 | 19,111 | 19,112 | 19,113 |
| | 2-295 | 19,226 | 19,227 | 19,228 | 19,229 | 19,230 | 19,231 | 19,232 | 19,233 | 19,234 | 19,235 | 19,236 | 19,237 | 19,238 |
| | 2-296 | 19,251 | 19,252 | 19,253 | 19,254 | 19,255 | 19,256 | 19,257 | 19,258 | 19,259 | 19,260 | 19,261 | 19,262 | 19,263 |
| | 2-297 | 19,276 | 19,277 | 19,278 | 19,279 | 19,280 | 19,281 | 19,282 | 19,283 | 19,284 | 19,285 | 19,286 | 19,287 | 19,288 |
| | 2-298 | 19,301 | 19,302 | 19,303 | 19,304 | 19,305 | 19,306 | 19,307 | 19,308 | 19,309 | 19,310 | 19,311 | 19,312 | 19,313 |
| | 2-299 | 19,326 | 19,327 | 19,328 | 19,329 | 19,330 | 19,331 | 19,332 | 19,333 | 19,334 | 19,335 | 19,336 | 19,337 | 19,338 |
| | 2-300 | 19,351 | 19,352 | 19,353 | 19,354 | 19,355 | 19,356 | 19,357 | 19,358 | 19,359 | 19,360 | 19,361 | 19,362 | 19,363 |
| | 2-301 | 19,376 | 19,377 | 19,378 | 19,379 | 19,380 | 19,381 | 19,382 | 19,383 | 19,384 | 19,385 | 19,386 | 19,387 | 19,388 |
| | 2-302 | 19,401 | 19,402 | 19,303 | 19,304 | 19,305 | 19,306 | 19,307 | 19,308 | 19,309 | 19,310 | 19,311 | 19,312 | 19,313 |
| | 2-303 | 19,426 | 19,427 | 19,428 | 19,429 | 19,430 | 19,431 | 19,432 | 19,433 | 19,434 | 19,435 | 19,436 | 19,437 | 19,438 |
| | 2-304 | 19,451 | 19,452 | 19,453 | 19,454 | 19,455 | 19,456 | 19,457 | 19,458 | 19,459 | 19,460 | 19,461 | 19,462 | 19,463 |
| | 2-305 | 19,476 | 19,477 | 19,478 | 19,479 | 19,480 | 19,481 | 19,482 | 19,483 | 19,484 | 19,485 | 19,486 | 19,487 | 19,488 |
| | 2-306 | 19,501 | 19,502 | 19,503 | 19,504 | 19,505 | 19,506 | 19,507 | 19,508 | 19,509 | 19,510 | 19,511 | 19,512 | 19,513 |
| | 2-307 | 19,526 | 19,527 | 19,528 | 19,529 | 19,530 | 19,531 | 19,532 | 19,533 | 19,534 | 19,535 | 19,536 | 19,537 | 19,538 |
| | 2-308 | 19,551 | 19,552 | 19,553 | 19,554 | 19,555 | 19,556 | 19,557 | 19,558 | 19,559 | 19,560 | 19,561 | 19,562 | 19,563 |
| | 2-309 | 19,576 | 19,577 | 19,578 | 19,579 | 19,580 | 19,581 | 19,582 | 19,583 | 19,584 | 19,585 | 19,586 | 19,587 | 19,588 |
| | 2-310 | 19,601 | 19,602 | 19,603 | 19,604 | 19,605 | 19,606 | 19,607 | 19,608 | 19,609 | 19,610 | 19,611 | 19,612 | 19,613 |
| | 2-311 | 19,626 | 19,627 | 19,628 | 19,629 | 19,630 | 19,631 | 19,632 | 19,633 | 19,634 | 19,635 | 19,636 | 19,637 | 19,638 |
| | 2-312 | 19,651 | 19,652 | 19,653 | 19,654 | 19,655 | 19,656 | 19,657 | 19,658 | 19,659 | 19,660 | 19,661 | 19,662 | 19,663 |
| | 2-313 | 19,676 | 19,677 | 19,678 | 19,679 | 19,680 | 19,681 | 19,682 | 19,683 | 19,684 | 19,685 | 19,686 | 19,687 | 19,688 |
| | 2-314 | 19,701 | 19,702 | 19,703 | 19,704 | 19,705 | 19,706 | 19,707 | 19,708 | 19,709 | 19,710 | 19,711 | 19,712 | 19,713 |
| | 2-315 | 19,726 | 19,727 | 19,728 | 19,729 | 19,730 | 19,731 | 19,732 | 19,733 | 19,734 | 19,735 | 19,736 | 19,737 | 19,738 |
| | 2-316 | 19,751 | 19,752 | 19,753 | 19,754 | 19,755 | 19,756 | 19,757 | 19,758 | 19,759 | 19,760 | 19,761 | 19,762 | 19,763 |
| | 2-317 | 19,776 | 19,777 | 19,778 | 19,779 | 19,780 | 19,781 | 19,782 | 19,783 | 19,784 | 19,785 | 19,786 | 19,787 | 19,788 |
| | 2-318 | 19,801 | 19,802 | 19,803 | 19,804 | 19,805 | 19,806 | 19,807 | 19,808 | 19,809 | 19,810 | 19,811 | 19,812 | 19,813 |
| | 2-319 | 19,826 | 19,827 | 19,828 | 19,829 | 19,830 | 19,831 | 19,832 | 19,833 | 19,834 | 19,835 | 19,836 | 19,837 | 19,838 |
| | 2-320 | 19,851 | 19,852 | 19,853 | 19,854 | 19,855 | 19,856 | 19,857 | 19,858 | 19,859 | 19,860 | 19,861 | 19,862 | 19,863 |
| | 2-321 | 19,876 | 19,877 | 19,878 | 19,879 | 19,880 | 19,881 | 19,882 | 19,883 | 19,884 | 19,885 | 19,886 | 19,887 | 19,888 |
| | 2-322 | 19,901 | 19,902 | 19,903 | 19,904 | 19,905 | 19,906 | 19,907 | 19,908 | 19,909 | 19,910 | 19,911 | 19,912 | 19,913 |
| | 2-323 | 19,926 | 19,927 | 19,928 | 19,929 | 19,930 | 19,931 | 19,932 | 19,933 | 19,934 | 19,935 | 19,936 | 19,937 | 19,938 |
| | 2-324 | 19,951 | 19,952 | 19,953 | 19,954 | 19,955 | 19,956 | 19,957 | 19,958 | 19,959 | 19,960 | 19,961 | 19,962 | 19,963 |
| | 2-325 | 19,976 | 19,977 | 19,978 | 19,979 | 19,980 | 19,981 | 19,982 | 19,983 | 19,984 | 19,985 | 19,986 | 19,987 | 19,988 |
| | 2-326 | 20,001 | 20,002 | 20,003 | 20,004 | 20,005 | 20,006 | 20,007 | 20,008 | 20,009 | 20,010 | 20,011 | 20,012 | 20,013 |
| | 2-327 | 20,026 | 20,027 | 20,028 | 20,029 | 20,030 | 20,031 | 20,032 | 20,033 | 20,034 | 20,035 | 20,036 | 20,037 | 20,038 |
| | 2-328 | 20,051 | 20,052 | 20,053 | 20,054 | 20,055 | 20,056 | 20,057 | 20,058 | 20,059 | 20,060 | 20,061 | 20,062 | 20,063 |
| | 2-329 | 20,076 | 20,077 | 20,078 | 20,079 | 20,080 | 20,081 | 20,082 | 20,083 | 20,084 | 20,085 | 20,086 | 20,087 | 20,088 |
| | 2-330 | 20,101 | 20,102 | 20,103 | 20,104 | 20,105 | 20,106 | 20,107 | 20,108 | 20,109 | 20,110 | 20,111 | 20,112 | 20,113 |

TABLE 15-continued

| | | Compound represented by the formula (1) | | | | | | | | | | | |
|---|---|---|---|---|---|---|---|---|---|---|---|---|---|
| | | 1-14 | 1-15 | 1-16 | 1-17 | 1-18 | 1-19 | 1-20 | 1-21 | 1-22 | 1-23 | 1-24 | 1-25 |
| Compound represented by the formula (2) | 2-276 | 18,764 | 18,765 | 18,766 | 18,767 | 18,768 | 18,769 | 18,770 | 18,771 | 18,772 | 18,773 | 18,774 | 18,775 |
| | 2-277 | 18,789 | 18,790 | 18,791 | 18,792 | 18,793 | 18,794 | 18,795 | 18,796 | 18,797 | 18,798 | 18,799 | 18,800 |
| | 2-278 | 18,814 | 18,815 | 18,816 | 18,817 | 18,818 | 18,819 | 18,820 | 18,821 | 18,822 | 18,823 | 18,824 | 18,825 |
| | 2-279 | 18,839 | 18,840 | 18,841 | 18,842 | 18,843 | 18,844 | 18,845 | 18,846 | 18,847 | 18,848 | 18,849 | 18,850 |
| | 2-280 | 18,864 | 18,865 | 18,866 | 18,867 | 18,868 | 18,869 | 18,870 | 18,871 | 18,872 | 18,873 | 18,874 | 18,875 |
| | 2-281 | 18,889 | 18,890 | 18,891 | 18,892 | 18,893 | 18,894 | 18,895 | 18,896 | 18,897 | 18,898 | 18,899 | 18,900 |
| | 2-282 | 18,914 | 18,915 | 18,916 | 18,917 | 18,918 | 18,919 | 18,920 | 18,921 | 18,922 | 18,923 | 18,924 | 18,925 |
| | 2-283 | 18,939 | 18,940 | 18,941 | 18,942 | 18,943 | 18,944 | 18,945 | 18,946 | 18,947 | 18,948 | 18,949 | 18,950 |
| | 2-284 | 18,964 | 18,965 | 18,966 | 18,967 | 18,968 | 18,969 | 18,970 | 18,971 | 18,972 | 18,973 | 18,974 | 18,975 |
| | 2-285 | 18,989 | 18,990 | 18,991 | 18,992 | 18,993 | 18,994 | 18,995 | 18,996 | 18,997 | 18,998 | 18,999 | 19,000 |
| | 2-286 | 19,014 | 19,015 | 19,016 | 19,017 | 19,018 | 19,019 | 19,020 | 19,021 | 19,022 | 19,023 | 19,024 | 19,025 |
| | 2-287 | 19,039 | 19,040 | 19,041 | 19,042 | 19,043 | 19,044 | 19,045 | 19,046 | 19,047 | 19,048 | 19,049 | 19,050 |
| | 2-288 | 19,064 | 19,065 | 19,066 | 19,067 | 19,068 | 19,069 | 19,070 | 19,071 | 19,072 | 19,073 | 19,074 | 19,075 |
| | 2-289 | 19,089 | 19,090 | 19,091 | 19,092 | 19,093 | 19,094 | 19,095 | 19,096 | 19,097 | 19,098 | 19,099 | 19,100 |
| | 2-290 | 19,114 | 19,115 | 19,116 | 19,117 | 19,118 | 19,119 | 19,120 | 19,121 | 19,122 | 19,123 | 19,124 | 19,125 |
| | 2-291 | 19,139 | 19,140 | 19,141 | 19,142 | 19,143 | 19,144 | 19,145 | 19,146 | 19,147 | 19,148 | 19,149 | 19,150 |
| | 2-292 | 19,164 | 19,165 | 19,166 | 19,167 | 19,168 | 19,169 | 19,170 | 19,171 | 19,172 | 19,173 | 19,174 | 19,175 |
| | 2-293 | 19,189 | 19,190 | 19,191 | 19,192 | 19,193 | 19,194 | 19,195 | 19,196 | 19,197 | 19,198 | 19,199 | 19,200 |
| | 2-294 | 19,114 | 19,115 | 19,116 | 19,117 | 19,118 | 19,119 | 19,120 | 19,121 | 19,122 | 19,123 | 19,124 | 19,125 |
| | 2-295 | 19,239 | 19,240 | 19,241 | 19,242 | 19,243 | 19,244 | 19,245 | 19,246 | 19,247 | 19,248 | 19,249 | 19,250 |
| | 2-296 | 19,264 | 19,265 | 19,266 | 19,267 | 19,268 | 19,269 | 19,270 | 19,271 | 19,272 | 19,273 | 19,274 | 19,275 |
| | 2-297 | 19,289 | 19,290 | 19,291 | 19,292 | 19,293 | 19,294 | 19,295 | 19,296 | 19,297 | 19,298 | 19,299 | 19,300 |
| | 2-298 | 19,314 | 19,315 | 19,316 | 19,317 | 19,318 | 19,319 | 19,320 | 19,321 | 19,322 | 19,323 | 19,324 | 19,325 |
| | 2-299 | 19,339 | 19,340 | 19,341 | 19,342 | 19,343 | 19,344 | 19,345 | 19,346 | 19,347 | 19,348 | 19,349 | 19,350 |
| | 2-300 | 19,364 | 19,365 | 19,366 | 19,367 | 19,368 | 19,369 | 19,370 | 19,371 | 19,372 | 19,373 | 19,374 | 19,375 |
| | 2-301 | 19,389 | 19,390 | 19,391 | 19,392 | 19,393 | 19,394 | 19,395 | 19,396 | 19,397 | 19,398 | 19,399 | 19,400 |
| | 2-302 | 19,314 | 19,315 | 19,316 | 19,317 | 19,318 | 19,319 | 19,320 | 19,321 | 19,322 | 19,323 | 19,324 | 19,325 |
| | 2-303 | 19,439 | 19,440 | 19,441 | 19,442 | 19,443 | 19,444 | 19,445 | 19,446 | 19,447 | 19,448 | 19,449 | 19,450 |
| | 2-304 | 19,464 | 19,465 | 19,466 | 19,467 | 19,468 | 19,469 | 19,470 | 19,471 | 19,472 | 19,473 | 19,474 | 19,475 |
| | 2-305 | 19,489 | 19,490 | 19,491 | 19,492 | 19,493 | 19,494 | 19,495 | 19,496 | 19,497 | 19,498 | 19,499 | 19,500 |
| | 2-306 | 19,514 | 19,515 | 19,516 | 19,517 | 19,518 | 19,519 | 19,520 | 19,521 | 19,522 | 19,523 | 19,524 | 19,525 |
| | 2-307 | 19,539 | 19,540 | 19,541 | 19,542 | 19,543 | 19,544 | 19,545 | 19,546 | 19,547 | 19,548 | 19,549 | 19,550 |
| | 2-308 | 19,564 | 19,565 | 19,566 | 19,567 | 19,568 | 19,569 | 19,570 | 19,571 | 19,572 | 19,573 | 19,574 | 19,575 |
| | 2-309 | 19,589 | 19,590 | 19,591 | 19,592 | 19,593 | 19,594 | 19,595 | 19,596 | 19,597 | 19,598 | 19,599 | 19,600 |
| | 2-310 | 19,614 | 19,615 | 19,616 | 19,617 | 19,618 | 19,619 | 19,620 | 19,621 | 19,622 | 19,623 | 19,624 | 19,625 |
| | 2-311 | 19,639 | 19,640 | 19,641 | 19,642 | 19,643 | 19,644 | 19,645 | 19,646 | 19,647 | 19,648 | 19,649 | 19,650 |
| | 2-312 | 19,664 | 19,665 | 19,666 | 19,667 | 19,668 | 19,669 | 19,670 | 19,671 | 19,672 | 19,673 | 19,674 | 19,675 |
| | 2-313 | 19,689 | 19,690 | 19,691 | 19,692 | 19,693 | 19,694 | 19,695 | 19,696 | 19,697 | 19,698 | 19,699 | 19,700 |
| | 2-314 | 19,714 | 19,715 | 19,716 | 19,717 | 19,718 | 19,719 | 19,720 | 19,721 | 19,722 | 19,723 | 19,724 | 19,725 |
| | 2-315 | 19,739 | 19,740 | 19,741 | 19,742 | 19,743 | 19,744 | 19,745 | 19,746 | 19,747 | 19,748 | 19,749 | 19,750 |
| | 2-316 | 19,764 | 19,765 | 19,766 | 19,767 | 19,768 | 19,769 | 19,770 | 19,771 | 19,772 | 19,773 | 19,774 | 19,775 |
| | 2-317 | 19,789 | 19,790 | 19,791 | 19,792 | 19,793 | 19,794 | 19,795 | 19,796 | 19,797 | 19,798 | 19,799 | 19,800 |
| | 2-318 | 19,814 | 19,815 | 19,816 | 19,817 | 19,818 | 19,819 | 19,820 | 19,821 | 19,822 | 19,823 | 19,824 | 19,825 |
| | 2-319 | 19,839 | 19,840 | 19,841 | 19,842 | 19,843 | 19,844 | 19,845 | 19,846 | 19,847 | 19,848 | 19,849 | 19,850 |
| | 2-320 | 19,864 | 19,865 | 19,866 | 19,867 | 19,868 | 19,869 | 19,870 | 19,871 | 19,872 | 19,873 | 19,874 | 19,875 |
| | 2-321 | 19,889 | 19,890 | 19,891 | 19,892 | 19,893 | 19,894 | 19,895 | 19,896 | 19,897 | 19,898 | 19,899 | 19,900 |
| | 2-322 | 19,914 | 19,915 | 19,916 | 19,917 | 19,918 | 19,919 | 19,920 | 19,921 | 19,922 | 19,923 | 19,924 | 19,925 |
| | 2-323 | 19,939 | 19,940 | 19,941 | 19,942 | 19,943 | 19,944 | 19,945 | 19,946 | 19,947 | 19,948 | 19,949 | 19,950 |
| | 2-324 | 19,964 | 19,965 | 19,966 | 19,967 | 19,968 | 19,969 | 19,970 | 19,971 | 19,972 | 19,973 | 19,974 | 19,975 |
| | 2-325 | 19,989 | 19,990 | 19,991 | 19,992 | 19,993 | 19,994 | 19,995 | 19,996 | 19,997 | 19,998 | 19,999 | 20,000 |
| | 2-326 | 20,014 | 20,015 | 20,016 | 20,017 | 20,018 | 20,019 | 20,020 | 20,021 | 20,022 | 20,023 | 20,024 | 20,025 |
| | 2-327 | 20,039 | 20,040 | 20,041 | 20,042 | 20,043 | 20,044 | 20,045 | 20,046 | 20,047 | 20,048 | 20,049 | 20,050 |
| | 2-328 | 20,064 | 20,065 | 20,066 | 20,067 | 20,068 | 20,069 | 20,070 | 20,071 | 20,072 | 20,073 | 20,074 | 20,075 |
| | 2-329 | 20,089 | 20,090 | 20,091 | 20,092 | 20,093 | 20,094 | 20,095 | 20,096 | 20,097 | 20,098 | 20,099 | 20,100 |
| | 2-330 | 20,114 | 20,115 | 20,116 | 20,117 | 20,118 | 20,119 | 20,120 | 20,121 | 20,122 | 20,123 | 20,124 | 20,125 |

TABLE 16

| | | Compound represented by the formula (1) | | | | | | | | | | | | |
|---|---|---|---|---|---|---|---|---|---|---|---|---|---|---|
| | | 1-26 | 1-27 | 1-28 | 1-29 | 1-30 | 1-31 | 1-32 | 1-33 | 1-34 | 1-35 | 1-36 | 1-37 | 1-38 |
| Compound represented by the formula (2) | 2-331 | 20,126 | 20,127 | 20,128 | 20,129 | 20,130 | 20,131 | 20,132 | 20,133 | 20,134 | 20,135 | 20,136 | 20,137 | 20,138 |
| | 2-332 | 20,151 | 20,152 | 20,153 | 20,154 | 20,155 | 20,156 | 20,157 | 20,158 | 20,159 | 20,160 | 20,161 | 20,162 | 20,163 |
| | 2-333 | 20,176 | 20,177 | 20,178 | 20,179 | 20,180 | 20,181 | 20,182 | 20,183 | 20,184 | 20,185 | 20,186 | 20,187 | 20,188 |
| | 2-334 | 20,201 | 20,202 | 20,203 | 20,204 | 20,205 | 20,206 | 20,207 | 20,208 | 20,209 | 20,210 | 20,211 | 20,212 | 20,213 |
| | 2-335 | 20,226 | 20,227 | 20,228 | 20,229 | 20,230 | 20,231 | 20,232 | 20,233 | 20,234 | 20,235 | 20,236 | 20,237 | 20,238 |
| | 2-336 | 20,251 | 20,252 | 20,253 | 20,254 | 20,255 | 20,256 | 20,257 | 20,258 | 20,259 | 20,260 | 20,261 | 20,262 | 20,263 |
| | 2-337 | 20,276 | 20,277 | 20,278 | 20,279 | 20,280 | 20,281 | 20,282 | 20,283 | 20,284 | 20,285 | 20,286 | 20,287 | 20,288 |
| | 2-338 | 20,301 | 20,302 | 20,303 | 20,304 | 20,305 | 20,306 | 20,307 | 20,308 | 20,309 | 20,310 | 20,311 | 20,312 | 20,313 |
| | 2-339 | 20,326 | 20,327 | 20,328 | 20,329 | 20,330 | 20,331 | 20,332 | 20,333 | 20,334 | 20,335 | 20,336 | 20,337 | 20,338 |
| | 2-340 | 20,351 | 20,352 | 20,353 | 20,354 | 20,355 | 20,356 | 20,357 | 20,358 | 20,359 | 20,360 | 20,361 | 20,362 | 20,363 |
| | 2-341 | 20,376 | 20,377 | 20,378 | 20,379 | 20,380 | 20,381 | 20,382 | 20,383 | 20,384 | 20,385 | 20,386 | 20,387 | 20,388 |

TABLE 16-continued

| | | | | | | | | | | | | | |
|---|---|---|---|---|---|---|---|---|---|---|---|---|---|
| 2-342 | 20,401 | 20,402 | 20,403 | 20,404 | 20,405 | 20,406 | 20,407 | 20,408 | 20,409 | 20,410 | 20,411 | 20,412 | 20,413 |
| 2-343 | 20,426 | 20,427 | 20,428 | 20,429 | 20,430 | 20,431 | 20,432 | 20,433 | 20,434 | 20,435 | 20,436 | 20,437 | 20,438 |
| 2-344 | 20,451 | 20,452 | 20,453 | 20,454 | 20,455 | 20,456 | 20,457 | 20,458 | 20,459 | 20,460 | 20,461 | 20,462 | 20,463 |
| 2-345 | 20,476 | 20,477 | 20,478 | 20,479 | 20,480 | 20,481 | 20,482 | 20,483 | 20,484 | 20,485 | 20,486 | 20,487 | 20,488 |
| 2-346 | 20,501 | 20,502 | 20,503 | 20,504 | 20,505 | 20,506 | 20,507 | 20,508 | 20,509 | 20,510 | 20,511 | 20,512 | 20,513 |
| 2-347 | 20,526 | 20,527 | 20,528 | 20,529 | 20,530 | 20,531 | 20,532 | 20,533 | 20,534 | 20,535 | 20,536 | 20,537 | 20,538 |
| 2-348 | 20,551 | 20,552 | 20,553 | 20,554 | 20,555 | 20,556 | 20,557 | 20,558 | 20,559 | 20,560 | 20,561 | 20,562 | 20,563 |
| 2-349 | 20,576 | 20,577 | 20,578 | 20,579 | 20,580 | 20,581 | 20,582 | 20,583 | 20,584 | 20,585 | 20,586 | 20,587 | 20,588 |
| 2-350 | 20,601 | 20,602 | 20,603 | 20,604 | 20,605 | 20,606 | 20,607 | 20,608 | 20,609 | 20,610 | 20,611 | 20,612 | 20,613 |
| 2-351 | 20,626 | 20,627 | 20,628 | 20,629 | 20,630 | 20,631 | 20,632 | 20,633 | 20,634 | 20,635 | 20,636 | 20,637 | 20,638 |
| 2-352 | 20,651 | 20,652 | 20,653 | 20,654 | 20,655 | 20,656 | 20,657 | 20,658 | 20,659 | 20,660 | 20,661 | 20,662 | 20,663 |
| 2-353 | 20,676 | 20,677 | 20,678 | 20,679 | 20,680 | 20,681 | 20,682 | 20,683 | 20,684 | 20,685 | 20,686 | 20,687 | 20,688 |
| 2-354 | 20,701 | 20,702 | 20,703 | 20,704 | 20,705 | 20,706 | 20,707 | 20,708 | 20,709 | 20,710 | 20,711 | 20,712 | 20,713 |
| 2-355 | 20,726 | 20,727 | 20,728 | 20,729 | 20,730 | 20,731 | 20,732 | 20,733 | 20,734 | 20,735 | 20,736 | 20,737 | 20,738 |
| 2-356 | 20,751 | 20,752 | 20,753 | 20,754 | 20,755 | 20,756 | 20,757 | 20,758 | 20,759 | 20,760 | 20,761 | 20,762 | 20,763 |
| 2-357 | 20,776 | 20,777 | 20,778 | 20,779 | 20,780 | 20,781 | 20,782 | 20,783 | 20,784 | 20,785 | 20,786 | 20,787 | 20,788 |
| 2-358 | 20,801 | 20,802 | 20,803 | 20,804 | 20,805 | 20,806 | 20,807 | 20,808 | 20,809 | 20,810 | 20,811 | 20,812 | 20,813 |
| 2-359 | 20,826 | 20,827 | 20,828 | 20,829 | 20,830 | 20,831 | 20,832 | 20,833 | 20,834 | 20,835 | 20,836 | 20,837 | 20,838 |
| 2-360 | 20,851 | 20,852 | 20,853 | 20,854 | 20,855 | 20,856 | 20,857 | 20,858 | 20,859 | 20,860 | 20,861 | 20,862 | 20,863 |
| 2-361 | 20,876 | 20,877 | 20,878 | 20,879 | 20,880 | 20,881 | 20,882 | 20,883 | 20,884 | 20,885 | 20,886 | 20,887 | 20,888 |
| 2-362 | 20,901 | 20,902 | 20,903 | 20,904 | 20,905 | 20,906 | 20,907 | 20,908 | 20,909 | 20,910 | 20,911 | 20,912 | 20,913 |
| 2-363 | 20,926 | 20,927 | 20,928 | 20,929 | 20,930 | 20,931 | 20,932 | 20,933 | 20,934 | 20,935 | 20,936 | 20,937 | 20,938 |
| 2-364 | 20,951 | 20,952 | 20,953 | 20,954 | 20,955 | 20,956 | 20,957 | 20,958 | 20,959 | 20,960 | 20,961 | 20,962 | 20,963 |
| 2-365 | 20,976 | 20,977 | 20,978 | 20,979 | 20,980 | 20,981 | 20,982 | 20,983 | 20,984 | 20,985 | 20,986 | 20,987 | 20,988 |
| 2-366 | 21,001 | 21,002 | 21,003 | 21,004 | 21,005 | 21,006 | 21,007 | 21,008 | 21,009 | 21,110 | 21,111 | 21,112 | 21,113 |
| 2-367 | 21,026 | 21,027 | 21,028 | 21,029 | 21,030 | 21,031 | 21,032 | 21,033 | 21,034 | 21,035 | 21,036 | 21,037 | 21,038 |
| 2-368 | 21,051 | 21,052 | 21,053 | 21,054 | 21,055 | 21,056 | 21,057 | 21,058 | 21,059 | 21,060 | 21,061 | 21,062 | 21,063 |
| 2-369 | 21,076 | 21,077 | 21,078 | 21,079 | 21,080 | 21,081 | 21,082 | 21,083 | 21,084 | 21,085 | 21,086 | 21,087 | 21,088 |
| 2-370 | 21,101 | 21,102 | 21,103 | 21,104 | 21,105 | 21,106 | 21,107 | 21,108 | 21,109 | 21,110 | 21,111 | 21,112 | 21,113 |
| 2-371 | 21,126 | 21,127 | 21,128 | 21,129 | 21,130 | 21,131 | 21,132 | 21,133 | 21,134 | 21,135 | 21,136 | 21,137 | 21,138 |
| 2-372 | 21,151 | 21,152 | 21,153 | 21,154 | 21,155 | 21,156 | 21,157 | 21,158 | 21,159 | 21,160 | 21,161 | 21,162 | 21,163 |
| 2-373 | 21,176 | 21,177 | 21,178 | 21,179 | 21,180 | 21,181 | 21,182 | 21,183 | 21,184 | 21,185 | 21,186 | 21,187 | 21,188 |
| 2-374 | 21,201 | 21,202 | 21,203 | 21,204 | 21,205 | 21,206 | 21,207 | 21,208 | 21,209 | 21,210 | 21,211 | 21,212 | 21,213 |
| 2-375 | 21,226 | 21,227 | 21,228 | 21,229 | 21,230 | 21,231 | 21,232 | 21,233 | 21,234 | 21,235 | 21,236 | 21,237 | 21,238 |
| 2-376 | 21,251 | 21,252 | 21,253 | 21,254 | 21,255 | 21,256 | 21,257 | 21,258 | 21,259 | 21,260 | 21,261 | 21,262 | 21,263 |
| 2-377 | 21,276 | 21,277 | 21,278 | 21,279 | 21,280 | 21,281 | 21,282 | 21,283 | 21,284 | 21,285 | 21,286 | 21,287 | 21,288 |
| 2-378 | 21,301 | 21,302 | 21,303 | 21,304 | 21,305 | 21,306 | 21,307 | 21,308 | 21,309 | 21,310 | 21,311 | 21,312 | 21,313 |
| 2-379 | 21,326 | 21,327 | 21,328 | 21,329 | 21,330 | 21,331 | 21,332 | 21,333 | 21,334 | 21,335 | 21,336 | 21,337 | 21,338 |
| 2-380 | 21,351 | 21,352 | 21,353 | 21,354 | 21,355 | 21,356 | 21,357 | 21,358 | 21,359 | 21,360 | 21,361 | 21,362 | 21,363 |
| 2-381 | 21,376 | 21,377 | 21,378 | 21,379 | 21,380 | 21,381 | 21,382 | 21,383 | 21,384 | 21,385 | 21,386 | 21,387 | 21,388 |
| 2-382 | 21,401 | 21,402 | 21,403 | 21,404 | 21,405 | 21,406 | 21,407 | 21,408 | 21,409 | 21,410 | 21,411 | 21,412 | 21,413 |
| 2-383 | 21,426 | 21,427 | 21,428 | 21,429 | 21,430 | 21,431 | 21,432 | 21,433 | 21,434 | 21,435 | 21,436 | 21,437 | 21,438 |
| 2-384 | 21,451 | 21,452 | 21,453 | 21,454 | 21,455 | 21,456 | 21,457 | 21,458 | 21,459 | 21,460 | 21,461 | 21,462 | 21,463 |
| 2-385 | 21,476 | 21,477 | 21,478 | 21,479 | 21,480 | 21,481 | 21,482 | 21,483 | 21,484 | 21,485 | 21,486 | 21,487 | 21,488 |

| | | Compound represented by the formula (1) | | | | | | | | | | | |
|---|---|---|---|---|---|---|---|---|---|---|---|---|---|
| | | 1-39 | 1-40 | 1-41 | 1-42 | 1-43 | 1-44 | 1-45 | 1-46 | 1-47 | 1-48 | 1-49 | 1-50 |
| Compound represented by the formula (2) | 2-331 | 20,139 | 20,140 | 20,141 | 20,142 | 20,143 | 20,144 | 20,145 | 20,146 | 20,147 | 20,148 | 20,149 | 20,150 |
| | 2-332 | 20,164 | 20,165 | 20,166 | 20,167 | 20,168 | 20,169 | 20,170 | 20,171 | 20,172 | 20,173 | 20,174 | 20,175 |
| | 2-333 | 20,189 | 20,190 | 20,191 | 20,192 | 20,193 | 20,194 | 20,195 | 20,196 | 20,197 | 20,198 | 20,199 | 20,200 |
| | 2-334 | 20,214 | 20,215 | 20,216 | 20,217 | 20,218 | 20,219 | 20,220 | 20,221 | 20,222 | 20,223 | 20,224 | 20,225 |
| | 2-335 | 20,239 | 20,240 | 20,241 | 20,242 | 20,243 | 20,244 | 20,245 | 20,246 | 20,247 | 20,248 | 20,249 | 20,250 |
| | 2-336 | 20,264 | 20,265 | 20,266 | 20,267 | 20,268 | 20,269 | 20,270 | 20,271 | 20,272 | 20,273 | 20,274 | 20,275 |
| | 2-337 | 20,289 | 20,290 | 20,291 | 20,292 | 20,293 | 20,294 | 20,295 | 20,296 | 20,297 | 20,298 | 20,299 | 20,300 |
| | 2-338 | 20,314 | 20,315 | 20,316 | 20,317 | 20,318 | 20,319 | 20,320 | 20,321 | 20,322 | 20,323 | 20,324 | 20,325 |
| | 2-339 | 20,339 | 20,340 | 20,341 | 20,342 | 20,343 | 20,344 | 20,345 | 20,346 | 20,347 | 20,348 | 20,349 | 20,350 |
| | 2-340 | 20,364 | 20,365 | 20,366 | 20,367 | 20,368 | 20,369 | 20,370 | 20,371 | 20,372 | 20,373 | 20,374 | 20,375 |
| | 2-341 | 20,389 | 20,390 | 20,391 | 20,392 | 20,393 | 20,394 | 20,395 | 20,396 | 20,397 | 20,398 | 20,399 | 20,400 |
| | 2-342 | 20,414 | 20,415 | 20,416 | 20,417 | 20,418 | 20,419 | 20,420 | 20,421 | 20,422 | 20,423 | 20,424 | 20,425 |
| | 2-343 | 20,439 | 20,440 | 20,441 | 20,442 | 20,443 | 20,444 | 20,445 | 20,446 | 20,447 | 20,448 | 20,449 | 20,450 |
| | 2-344 | 20,464 | 20,465 | 20,466 | 20,467 | 20,468 | 20,469 | 20,470 | 20,471 | 20,472 | 20,473 | 20,474 | 20,475 |
| | 2-345 | 20,489 | 20,490 | 20,491 | 20,492 | 20,493 | 20,494 | 20,495 | 20,496 | 20,497 | 20,498 | 20,499 | 20,500 |
| | 2-346 | 20,514 | 20,515 | 20,516 | 20,517 | 20,518 | 20,519 | 20,520 | 20,521 | 20,522 | 20,523 | 20,524 | 20,525 |
| | 2-347 | 20,539 | 20,540 | 20,541 | 20,542 | 20,543 | 20,544 | 20,545 | 20,546 | 20,547 | 20,548 | 20,549 | 20,550 |
| | 2-348 | 20,564 | 20,565 | 20,566 | 20,567 | 20,568 | 20,569 | 20,570 | 20,571 | 20,572 | 20,573 | 20,574 | 20,575 |
| | 2-349 | 20,589 | 20,590 | 20,591 | 20,592 | 20,593 | 20,594 | 20,595 | 20,596 | 20,597 | 20,598 | 20,599 | 20,600 |
| | 2-350 | 20,614 | 20,615 | 20,616 | 20,617 | 20,618 | 20,619 | 20,620 | 20,621 | 20,622 | 20,623 | 20,624 | 20,625 |
| | 2-351 | 20,639 | 20,640 | 20,641 | 20,642 | 20,643 | 20,644 | 20,645 | 20,646 | 20,647 | 20,648 | 20,649 | 20,650 |
| | 2-352 | 20,664 | 20,665 | 20,666 | 20,667 | 20,668 | 20,669 | 20,670 | 20,671 | 20,672 | 20,673 | 20,674 | 20,675 |
| | 2-353 | 20,689 | 20,690 | 20,691 | 20,692 | 20,693 | 20,694 | 20,695 | 20,696 | 20,697 | 20,698 | 20,699 | 20,700 |
| | 2-354 | 20,714 | 20,715 | 20,716 | 20,717 | 20,718 | 20,719 | 20,720 | 20,721 | 20,722 | 20,723 | 20,724 | 20,725 |
| | 2-355 | 20,739 | 20,740 | 20,741 | 20,742 | 20,743 | 20,744 | 20,745 | 20,746 | 20,747 | 20,748 | 20,749 | 20,750 |
| | 2-356 | 20,764 | 20,765 | 20,766 | 20,767 | 20,768 | 20,769 | 20,770 | 20,771 | 20,772 | 20,773 | 20,774 | 20,775 |
| | 2-357 | 20,789 | 20,790 | 20,791 | 20,792 | 20,793 | 20,794 | 20,795 | 20,796 | 20,797 | 20,798 | 20,799 | 20,800 |
| | 2-358 | 20,814 | 20,815 | 20,816 | 20,817 | 20,818 | 20,819 | 20,820 | 20,821 | 20,822 | 20,823 | 20,824 | 20,825 |
| | 2-359 | 20,839 | 20,840 | 20,841 | 20,842 | 20,843 | 20,844 | 20,845 | 20,846 | 20,847 | 20,848 | 20,849 | 20,850 |
| | 2-360 | 20,864 | 20,865 | 20,866 | 20,867 | 20,868 | 20,869 | 20,870 | 20,871 | 20,872 | 20,873 | 20,874 | 20,875 |
| | 2-361 | 20,889 | 20,890 | 20,891 | 20,892 | 20,893 | 20,894 | 20,895 | 20,896 | 20,897 | 20,898 | 20,899 | 20,890 |

TABLE 16-continued

| | | | | | | | | | | | | | |
|---|---|---|---|---|---|---|---|---|---|---|---|---|---|
| | 2-362 | 20,914 | 20,915 | 20,916 | 20,917 | 20,918 | 20,919 | 20,920 | 20,921 | 20,922 | 20,923 | 20,924 | 20,925 |
| | 2-363 | 20,939 | 20,940 | 20,941 | 20,942 | 20,943 | 20,944 | 20,945 | 20,946 | 20,947 | 20,948 | 20,949 | 20,950 |
| | 2-364 | 20,964 | 20,965 | 20,966 | 20,967 | 20,968 | 20,969 | 20,970 | 20,971 | 20,972 | 20,973 | 20,974 | 20,975 |
| | 2-365 | 20,989 | 20,990 | 20,991 | 20,992 | 20,993 | 20,994 | 20,995 | 20,996 | 20,997 | 20,998 | 20,999 | 21,000 |
| | 2-366 | 21,114 | 21,115 | 21,116 | 21,117 | 21,118 | 21,119 | 21,120 | 21,121 | 21,122 | 21,123 | 21,124 | 21,125 |
| | 2-367 | 21,039 | 21,040 | 21,041 | 21,042 | 21,043 | 21,044 | 21,045 | 21,046 | 21,047 | 21,048 | 21,049 | 21,050 |
| | 2-368 | 21,064 | 21,065 | 21,066 | 21,067 | 21,068 | 21,069 | 21,070 | 21,071 | 21,072 | 21,073 | 21,074 | 21,075 |
| | 2-369 | 21,089 | 21,090 | 21,091 | 21,092 | 21,093 | 21,094 | 21,095 | 21,096 | 21,097 | 21,098 | 21,099 | 21,100 |
| | 2-370 | 21,114 | 21,115 | 21,116 | 21,117 | 21,118 | 21,119 | 21,120 | 21,121 | 21,122 | 21,123 | 21,124 | 21,125 |
| | 2-371 | 21,139 | 21,140 | 21,141 | 21,142 | 21,143 | 21,144 | 21,145 | 21,146 | 21,147 | 21,148 | 21,149 | 21,150 |
| | 2-372 | 21,164 | 21,165 | 21,166 | 21,167 | 21,168 | 21,169 | 21,170 | 21,171 | 21,172 | 21,173 | 21,174 | 21,175 |
| | 2-373 | 21,189 | 21,190 | 21,191 | 21,192 | 21,193 | 21,194 | 21,195 | 21,196 | 21,197 | 21,198 | 21,199 | 21,200 |
| | 2-374 | 21,214 | 21,215 | 21,216 | 21,217 | 21,218 | 21,219 | 21,220 | 21,221 | 21,222 | 21,223 | 21,224 | 21,225 |
| | 2-375 | 21,239 | 21,240 | 21,241 | 21,242 | 21,243 | 21,244 | 21,245 | 21,246 | 21,247 | 21,248 | 21,249 | 21,250 |
| | 2-376 | 21,264 | 21,265 | 21,266 | 21,267 | 21,268 | 21,269 | 21,270 | 21,271 | 21,272 | 21,273 | 21,274 | 21,275 |
| | 2-377 | 21,289 | 21,290 | 21,291 | 21,292 | 21,293 | 21,294 | 21,295 | 21,296 | 21,297 | 21,298 | 21,299 | 21,300 |
| | 2-378 | 21,314 | 21,315 | 21,316 | 21,317 | 21,318 | 21,319 | 21,320 | 21,321 | 21,322 | 21,323 | 21,324 | 21,325 |
| | 2-379 | 21,339 | 21,340 | 21,341 | 21,342 | 21,343 | 21,344 | 21,345 | 21,346 | 21,347 | 21,348 | 21,349 | 21,350 |
| | 2-380 | 21,364 | 21,365 | 21,366 | 21,367 | 21,368 | 21,369 | 21,370 | 21,371 | 21,372 | 21,373 | 21,374 | 21,375 |
| | 2-381 | 21,389 | 21,390 | 21,391 | 21,392 | 21,393 | 21,394 | 21,395 | 21,396 | 21,397 | 21,398 | 21,399 | 21,400 |
| | 2-382 | 21,414 | 21,415 | 21,416 | 21,417 | 21,418 | 21,419 | 21,420 | 21,421 | 21,422 | 21,423 | 21,424 | 21,425 |
| | 2-383 | 21,439 | 21,440 | 21,441 | 21,442 | 21,443 | 21,444 | 21,445 | 21,446 | 21,447 | 21,448 | 21,449 | 21,450 |
| | 2-384 | 21,464 | 21,465 | 21,466 | 21,467 | 21,468 | 21,469 | 21,470 | 21,471 | 21,472 | 21,473 | 21,474 | 21,475 |
| | 2-385 | 21,489 | 21,490 | 21,491 | 21,492 | 21,493 | 21,494 | 21,495 | 21,496 | 21,497 | 21,498 | 21,499 | 21,500 |

TABLE 17

| | | Compound represented by the formula (1) | | | | | | | | | | | | |
|---|---|---|---|---|---|---|---|---|---|---|---|---|---|---|
| | | 1-26 | 1-27 | 1-28 | 1-29 | 1-30 | 1-31 | 1-32 | 1-33 | 1-34 | 1-35 | 1-36 | 1-37 | 1-38 |
| Compound represented by the formula (2) | 2-386 | 21,501 | 21,502 | 21,503 | 21,504 | 21,505 | 21,506 | 21,507 | 21,508 | 21,509 | 21,510 | 21,511 | 21,512 | 21,513 |
| | 2-387 | 21,526 | 21,527 | 21,528 | 21,529 | 21,530 | 21,531 | 21,532 | 21,533 | 21,534 | 21,535 | 21,536 | 21,537 | 21,538 |
| | 2-388 | 21,551 | 21,552 | 21,553 | 21,554 | 21,555 | 21,556 | 21,557 | 21,558 | 21,559 | 21,560 | 21,561 | 21,562 | 21,563 |
| | 2-389 | 21,576 | 21,577 | 21,578 | 21,579 | 21,580 | 21,581 | 21,582 | 21,583 | 21,584 | 21,585 | 21,586 | 21,587 | 21,588 |
| | 2-390 | 21,601 | 21,602 | 21,603 | 21,604 | 21,605 | 21,606 | 21,607 | 21,608 | 21,609 | 21,610 | 21,611 | 21,612 | 21,613 |
| | 2-391 | 21,626 | 21,627 | 21,628 | 21,629 | 21,630 | 21,631 | 21,632 | 21,633 | 21,634 | 21,635 | 21,636 | 21,637 | 21,638 |
| | 2-392 | 21,651 | 21,652 | 21,653 | 21,654 | 21,655 | 21,656 | 21,657 | 21,658 | 21,659 | 21,660 | 21,661 | 21,662 | 21,663 |
| | 2-393 | 21,676 | 21,677 | 21,678 | 21,679 | 21,680 | 21,681 | 21,682 | 21,683 | 21,684 | 21,685 | 21,686 | 21,687 | 21,688 |
| | 2-394 | 21,701 | 21,702 | 21,703 | 21,704 | 21,705 | 21,706 | 21,707 | 21,708 | 21,709 | 21,710 | 21,711 | 21,712 | 21,713 |
| | 2-395 | 21,726 | 21,727 | 21,728 | 21,729 | 21,730 | 21,731 | 21,732 | 21,733 | 21,734 | 21,735 | 21,736 | 21,737 | 21,738 |
| | 2-396 | 21,751 | 21,752 | 21,753 | 21,754 | 21,755 | 21,756 | 21,757 | 21,758 | 21,759 | 21,760 | 21,761 | 21,762 | 21,763 |
| | 2-397 | 21,776 | 21,777 | 21,778 | 21,779 | 21,780 | 21,781 | 21,782 | 21,783 | 21,784 | 21,785 | 21,786 | 21,787 | 21,788 |
| | 2-398 | 21,801 | 21,802 | 21,803 | 21,804 | 21,805 | 21,806 | 21,807 | 21,808 | 21,809 | 21,810 | 21,811 | 21,812 | 21,813 |
| | 2-399 | 21,826 | 21,827 | 21,828 | 21,829 | 21,830 | 21,831 | 21,832 | 21,833 | 21,834 | 21,835 | 21,836 | 21,837 | 21,838 |
| | 2-400 | 21,851 | 21,852 | 21,853 | 21,854 | 21,855 | 21,856 | 21,857 | 21,858 | 21,859 | 21,860 | 21,861 | 21,862 | 21,863 |
| | 2-401 | 21,876 | 21,877 | 21,878 | 21,879 | 21,880 | 21,881 | 21,882 | 21,883 | 21,884 | 21,885 | 21,886 | 21,887 | 21,888 |
| | 2-402 | 21,901 | 21,902 | 21,903 | 21,904 | 21,905 | 21,906 | 21,907 | 21,908 | 21,909 | 21,910 | 21,911 | 21,912 | 21,913 |
| | 2-403 | 21,926 | 21,927 | 21,928 | 21,929 | 21,930 | 21,931 | 21,932 | 21,933 | 21,934 | 21,935 | 21,936 | 21,937 | 21,938 |
| | 2-404 | 21,951 | 21,952 | 21,953 | 21,954 | 21,955 | 21,956 | 21,957 | 21,958 | 21,959 | 21,960 | 21,961 | 21,962 | 21,963 |
| | 2-405 | 21,976 | 21,977 | 21,978 | 21,979 | 21,980 | 21,981 | 21,982 | 21,983 | 21,984 | 21,985 | 21,986 | 21,987 | 21,988 |
| | 2-406 | 22,001 | 22,002 | 22,003 | 22,004 | 22,005 | 22,006 | 22,007 | 22,008 | 22,009 | 22,010 | 22,011 | 22,012 | 22,013 |
| | 2-407 | 22,026 | 22,027 | 22,028 | 22,029 | 22,030 | 22,031 | 22,032 | 22,033 | 22,034 | 22,035 | 22,036 | 22,037 | 22,038 |
| | 2-408 | 22,051 | 22,052 | 22,053 | 22,054 | 22,055 | 22,056 | 22,057 | 22,058 | 22,059 | 22,060 | 22,061 | 22,062 | 22,063 |
| | 2-409 | 22,076 | 22,077 | 22,078 | 22,079 | 22,080 | 22,081 | 22,082 | 22,083 | 22,084 | 22,085 | 22,086 | 22,087 | 22,088 |
| | 2-410 | 22,101 | 22,102 | 22,103 | 22,104 | 22,105 | 22,106 | 22,107 | 22,108 | 22,109 | 22,110 | 22,111 | 22,112 | 22,113 |
| | 2-411 | 22,126 | 22,127 | 22,128 | 22,129 | 22,130 | 22,131 | 22,132 | 22,133 | 22,134 | 22,135 | 22,136 | 22,137 | 22,138 |
| | 2-412 | 22,151 | 22,152 | 22,153 | 22,154 | 22,155 | 22,156 | 22,157 | 22,158 | 22,159 | 22,160 | 22,161 | 22,162 | 22,163 |
| | 2-413 | 22,176 | 22,177 | 22,178 | 22,179 | 22,180 | 22,181 | 22,182 | 22,183 | 22,184 | 22,185 | 22,186 | 22,187 | 22,188 |
| | 2-414 | 22,201 | 22,202 | 22,203 | 22,204 | 22,205 | 22,206 | 22,207 | 22,208 | 22,209 | 22,210 | 22,211 | 22,212 | 22,213 |
| | 2-415 | 22,226 | 22,227 | 22,228 | 22,229 | 22,230 | 22,231 | 22,232 | 22,233 | 22,234 | 22,235 | 22,236 | 22,237 | 22,238 |
| | 2-416 | 22,251 | 22,252 | 22,253 | 22,254 | 22,255 | 22,256 | 22,257 | 22,258 | 22,259 | 22,260 | 22,261 | 22,262 | 22,263 |
| | 2-417 | 22,276 | 22,277 | 22,278 | 22,279 | 22,280 | 22,281 | 22,282 | 22,283 | 22,284 | 22,285 | 22,286 | 22,287 | 22,288 |
| | 2-418 | 22,301 | 22,302 | 22,303 | 22,304 | 22,305 | 22,306 | 22,307 | 22,308 | 22,309 | 22,310 | 22,311 | 22,312 | 22,313 |
| | 2-419 | 22,326 | 22,327 | 22,328 | 22,329 | 22,330 | 22,331 | 22,332 | 22,333 | 22,334 | 22,335 | 22,336 | 22,337 | 22,338 |
| | 2-420 | 22,351 | 22,352 | 22,353 | 22,354 | 22,355 | 22,356 | 22,357 | 22,358 | 22,359 | 22,360 | 22,361 | 22,362 | 22,363 |
| | 2-421 | 22,376 | 22,377 | 22,378 | 22,379 | 22,380 | 22,381 | 22,382 | 22,383 | 22,384 | 22,385 | 22,386 | 22,387 | 22,388 |
| | 2-422 | 22,401 | 22,402 | 22,403 | 22,404 | 22,405 | 22,406 | 22,407 | 22,408 | 22,409 | 22,410 | 22,411 | 22,412 | 22,413 |
| | 2-423 | 22,426 | 22,427 | 22,428 | 22,429 | 22,430 | 22,431 | 22,432 | 22,433 | 22,434 | 22,435 | 22,436 | 22,437 | 22,438 |
| | 2-424 | 22,451 | 22,452 | 22,453 | 22,454 | 22,455 | 22,456 | 22,457 | 22,458 | 22,459 | 22,460 | 22,461 | 22,462 | 22,463 |
| | 2-425 | 22,476 | 22,477 | 22,478 | 22,479 | 22,480 | 22,481 | 22,482 | 22,483 | 22,484 | 22,485 | 22,486 | 22,487 | 22,488 |
| | 2-426 | 22,501 | 22,502 | 22,503 | 22,504 | 22,505 | 22,506 | 22,507 | 22,508 | 22,509 | 22,510 | 22,511 | 22,512 | 22,513 |
| | 2-427 | 22,526 | 22,527 | 22,528 | 22,529 | 22,530 | 22,531 | 22,532 | 22,533 | 22,534 | 22,535 | 22,536 | 22,537 | 22,538 |
| | 2-428 | 22,551 | 22,552 | 22,553 | 22,554 | 22,555 | 22,556 | 22,557 | 22,558 | 22,559 | 22,560 | 22,561 | 22,562 | 22,563 |
| | 2-429 | 22,576 | 22,577 | 22,578 | 22,579 | 22,580 | 22,581 | 22,582 | 22,583 | 22,584 | 22,585 | 22,586 | 22,587 | 22,588 |
| | 2-430 | 22,601 | 22,602 | 22,603 | 22,604 | 22,605 | 22,606 | 22,607 | 22,608 | 22,609 | 22,610 | 22,611 | 22,612 | 22,613 |
| | 2-431 | 22,626 | 22,627 | 22,628 | 22,629 | 22,630 | 22,631 | 22,632 | 22,633 | 22,634 | 22,635 | 22,636 | 22,637 | 22,638 |

TABLE 17-continued

| | | | | | | | | | | | | | |
|---|---|---|---|---|---|---|---|---|---|---|---|---|---|
| 2-432 | 22,651 | 22,652 | 22,653 | 22,654 | 22,655 | 22,656 | 22,657 | 22,658 | 22,659 | 22,660 | 22,661 | 22,662 | 22,663 |
| 2-433 | 22,676 | 22,677 | 22,678 | 22,679 | 22,680 | 22,681 | 22,682 | 22,683 | 22,684 | 22,685 | 22,686 | 22,687 | 22,688 |
| 2-434 | 22,701 | 22,702 | 22,703 | 22,704 | 22,705 | 22,706 | 22,707 | 22,708 | 22,709 | 22,710 | 22,711 | 22,712 | 22,713 |
| 2-435 | 22,726 | 22,727 | 22,728 | 22,729 | 22,730 | 22,731 | 22,732 | 22,733 | 22,734 | 22,735 | 22,736 | 22,737 | 22,738 |
| 2-436 | 22,751 | 22,752 | 22,753 | 22,754 | 22,755 | 22,756 | 22,757 | 22,758 | 22,759 | 22,760 | 22,761 | 22,762 | 22,763 |
| 2-437 | 22,776 | 22,777 | 22,778 | 22,779 | 22,780 | 22,781 | 22,782 | 22,783 | 22,784 | 22,785 | 22,786 | 22,787 | 22,788 |
| 2-438 | 22,801 | 22,802 | 22,803 | 22,804 | 22,805 | 22,806 | 22,807 | 22,808 | 22,809 | 22,810 | 22,811 | 22,812 | 22,813 |
| 2-439 | 22,826 | 22,827 | 22,828 | 22,829 | 22,830 | 22,831 | 22,832 | 22,833 | 22,834 | 22,835 | 22,836 | 22,837 | 22,838 |
| 2-440 | 22,851 | 22,852 | 22,853 | 22,854 | 22,855 | 22,856 | 22,857 | 22,858 | 22,859 | 22,860 | 22,861 | 22,862 | 22,863 |

| | | Compound represented by the formula (1) | | | | | | | | | | | |
|---|---|---|---|---|---|---|---|---|---|---|---|---|---|
| | | 1-39 | 1-40 | 1-41 | 1-42 | 1-43 | 1-44 | 1-45 | 1-46 | 1-47 | 1-48 | 1-49 | 1-50 |
| Compound represented by the formula (2) | 2-386 | 21,514 | 21,515 | 21,516 | 21,517 | 21,518 | 21,519 | 21,520 | 21,521 | 21,522 | 21,523 | 21,524 | 21,525 |
| | 2-387 | 21,539 | 21,540 | 21,541 | 21,542 | 21,543 | 21,544 | 21,545 | 21,546 | 21,547 | 21,548 | 21,549 | 21,550 |
| | 2-388 | 21,564 | 21,565 | 21,566 | 21,567 | 21,568 | 21,569 | 21,570 | 21,571 | 21,572 | 21,573 | 21,574 | 21,575 |
| | 2-389 | 21,589 | 21,590 | 21,591 | 21,592 | 21,593 | 21,594 | 21,595 | 21,596 | 21,597 | 21,598 | 21,599 | 21,600 |
| | 2-390 | 21,614 | 21,615 | 21,616 | 21,617 | 21,618 | 21,619 | 21,620 | 21,621 | 21,622 | 21,623 | 21,624 | 21,625 |
| | 2-391 | 21,639 | 21,640 | 21,641 | 21,642 | 21,643 | 21,644 | 21,645 | 21,646 | 21,647 | 21,648 | 21,649 | 21,650 |
| | 2-392 | 21,664 | 21,665 | 21,666 | 21,667 | 21,668 | 21,669 | 21,670 | 21,671 | 21,672 | 21,673 | 21,674 | 21,675 |
| | 2-393 | 21,689 | 21,690 | 21,691 | 21,692 | 21,693 | 21,694 | 21,695 | 21,696 | 21,697 | 21,698 | 21,699 | 21,700 |
| | 2-394 | 21,714 | 21,715 | 21,716 | 21,717 | 21,718 | 21,719 | 21,720 | 21,721 | 21,722 | 21,723 | 21,724 | 21,725 |
| | 2-395 | 21,739 | 21,740 | 21,741 | 21,742 | 21,743 | 21,744 | 21,745 | 21,746 | 21,747 | 21,748 | 21,749 | 21,750 |
| | 2-396 | 21,764 | 21,765 | 21,766 | 21,767 | 21,768 | 21,769 | 21,770 | 21,771 | 21,772 | 21,773 | 21,774 | 21,775 |
| | 2-397 | 21,789 | 21,790 | 21,791 | 21,792 | 21,793 | 21,794 | 21,795 | 21,796 | 21,797 | 21,798 | 21,799 | 21,800 |
| | 2-398 | 21,814 | 21,815 | 21,816 | 21,817 | 21,818 | 21,819 | 21,820 | 21,821 | 21,822 | 21,823 | 21,824 | 21,825 |
| | 2-399 | 21,839 | 21,840 | 21,841 | 21,842 | 21,843 | 21,844 | 21,845 | 21,846 | 21,847 | 21,848 | 21,849 | 21,850 |
| | 2-400 | 21,864 | 21,865 | 21,866 | 21,867 | 21,868 | 21,869 | 21,870 | 21,871 | 21,872 | 21,873 | 21,874 | 21,875 |
| | 2-401 | 21,889 | 21,890 | 21,891 | 21,892 | 21,893 | 21,894 | 21,895 | 21,896 | 21,897 | 21,898 | 21,899 | 21,900 |
| | 2-402 | 21,914 | 21,915 | 21,916 | 21,917 | 21,918 | 21,919 | 21,920 | 21,921 | 21,922 | 21,923 | 21,924 | 21,925 |
| | 2-403 | 21,939 | 21,940 | 21,941 | 21,942 | 21,943 | 21,944 | 21,945 | 21,946 | 21,947 | 21,948 | 21,949 | 21,950 |
| | 2-404 | 21,964 | 21,965 | 21,966 | 21,967 | 21,968 | 21,969 | 21,970 | 21,971 | 21,972 | 21,973 | 21,974 | 21,975 |
| | 2-405 | 21,989 | 21,990 | 21,991 | 21,992 | 21,993 | 21,994 | 21,995 | 21,996 | 21,997 | 21,998 | 21,999 | 22,000 |
| | 2-406 | 22,014 | 22,015 | 22,016 | 22,017 | 22,018 | 22,019 | 22,020 | 22,021 | 22,022 | 22,023 | 22,024 | 22,025 |
| | 2-407 | 22,039 | 22,040 | 22,041 | 22,042 | 22,043 | 22,044 | 22,045 | 22,046 | 22,047 | 22,048 | 22,049 | 22,050 |
| | 2-408 | 22,064 | 22,065 | 22,066 | 22,067 | 22,068 | 22,069 | 22,070 | 22,071 | 22,072 | 22,073 | 22,074 | 22,075 |
| | 2-409 | 22,089 | 22,090 | 22,091 | 22,092 | 22,093 | 22,094 | 22,095 | 22,096 | 22,097 | 22,098 | 22,099 | 22,000 |
| | 2-410 | 22,114 | 22,115 | 22,116 | 22,117 | 22,118 | 22,119 | 22,120 | 22,121 | 22,122 | 22,123 | 22,124 | 22,125 |
| | 2-411 | 22,139 | 22,140 | 22,141 | 22,142 | 22,143 | 22,144 | 22,145 | 22,146 | 22,147 | 22,148 | 22,149 | 22,150 |
| | 2-412 | 22,164 | 22,165 | 22,166 | 22,167 | 22,168 | 22,169 | 22,170 | 22,171 | 22,172 | 22,173 | 22,174 | 22,175 |
| | 2-413 | 22,189 | 22,190 | 22,191 | 22,192 | 22,193 | 22,194 | 22,195 | 22,196 | 22,197 | 22,198 | 22,199 | 22,200 |
| | 2-414 | 22,214 | 22,215 | 22,216 | 22,217 | 22,218 | 22,219 | 22,220 | 22,221 | 22,222 | 22,223 | 22,224 | 22,225 |
| | 2-415 | 22,239 | 22,240 | 22,241 | 22,242 | 22,243 | 22,244 | 22,245 | 22,246 | 22,247 | 22,248 | 22,249 | 22,250 |
| | 2-416 | 22,264 | 22,265 | 22,266 | 22,267 | 22,268 | 22,269 | 22,270 | 22,271 | 22,272 | 22,273 | 22,274 | 22,275 |
| | 2-417 | 22,289 | 22,290 | 22,291 | 22,292 | 22,293 | 22,294 | 22,295 | 22,296 | 22,297 | 22,298 | 22,299 | 22,300 |
| | 2-418 | 22,314 | 22,315 | 22,316 | 22,317 | 22,318 | 22,319 | 22,320 | 22,321 | 22,322 | 22,323 | 22,324 | 22,325 |
| | 2-419 | 22,339 | 22,340 | 22,341 | 22,342 | 22,343 | 22,344 | 22,345 | 22,346 | 22,347 | 22,348 | 22,349 | 22,350 |
| | 2-420 | 22,364 | 22,365 | 22,366 | 22,367 | 22,368 | 22,369 | 22,370 | 22,371 | 22,372 | 22,373 | 22,374 | 22,375 |
| | 2-421 | 22,389 | 22,390 | 22,391 | 22,392 | 22,393 | 22,394 | 22,395 | 22,396 | 22,397 | 22,398 | 22,399 | 22,400 |
| | 2-422 | 22,414 | 22,415 | 22,416 | 22,417 | 22,418 | 22,419 | 22,420 | 22,421 | 22,422 | 22,423 | 22,424 | 22,425 |
| | 2-423 | 22,439 | 22,440 | 22,441 | 22,442 | 22,443 | 22,444 | 22,445 | 22,446 | 22,447 | 22,448 | 22,449 | 22,450 |
| | 2-424 | 22,464 | 22,465 | 22,466 | 22,467 | 22,468 | 22,469 | 22,470 | 22,471 | 22,472 | 22,473 | 22,474 | 22,475 |
| | 2-425 | 22,489 | 22,490 | 22,491 | 22,492 | 22,493 | 22,494 | 22,495 | 22,496 | 22,497 | 22,498 | 22,499 | 22,500 |
| | 2-426 | 22,514 | 22,515 | 22,516 | 22,517 | 22,518 | 22,519 | 22,520 | 22,521 | 22,522 | 22,523 | 22,524 | 22,525 |
| | 2-427 | 22,539 | 22,540 | 22,541 | 22,542 | 22,543 | 22,544 | 22,545 | 22,546 | 22,547 | 22,548 | 22,549 | 22,550 |
| | 2-428 | 22,564 | 22,565 | 22,566 | 22,567 | 22,568 | 22,569 | 22,570 | 22,571 | 22,572 | 22,573 | 22,574 | 22,575 |
| | 2-429 | 22,589 | 22,590 | 22,591 | 22,592 | 22,593 | 22,594 | 22,595 | 22,596 | 22,597 | 22,598 | 22,599 | 22,600 |
| | 2-430 | 22,614 | 22,615 | 22,616 | 22,617 | 22,618 | 22,619 | 22,620 | 22,621 | 22,622 | 22,623 | 22,624 | 22,625 |
| | 2-431 | 22,639 | 22,640 | 22,641 | 22,642 | 22,643 | 22,644 | 22,645 | 22,646 | 22,647 | 22,648 | 22,649 | 22,650 |
| | 2-432 | 22,664 | 22,665 | 22,666 | 22,667 | 22,668 | 22,669 | 22,670 | 22,671 | 22,672 | 22,673 | 22,674 | 22,675 |
| | 2-433 | 22,689 | 22,690 | 22,691 | 22,692 | 22,693 | 22,694 | 22,695 | 22,696 | 22,697 | 22,698 | 22,699 | 22,700 |
| | 2-434 | 22,714 | 22,715 | 22,716 | 22,717 | 22,718 | 22,719 | 22,720 | 22,721 | 22,722 | 22,723 | 22,724 | 22,725 |
| | 2-435 | 22,739 | 22,740 | 22,741 | 22,742 | 22,743 | 22,744 | 22,745 | 22,746 | 22,747 | 22,748 | 22,749 | 22,750 |
| | 2-436 | 22,764 | 22,765 | 22,766 | 22,767 | 22,768 | 22,769 | 22,770 | 22,771 | 22,772 | 22,773 | 22,774 | 22,775 |
| | 2-437 | 22,789 | 22,790 | 22,791 | 22,792 | 22,793 | 22,794 | 22,795 | 22,796 | 22,797 | 22,798 | 22,799 | 22,800 |
| | 2-438 | 22,814 | 22,815 | 22,816 | 22,817 | 22,818 | 22,819 | 22,820 | 22,821 | 22,822 | 22,823 | 22,824 | 22,825 |
| | 2-439 | 22,839 | 22,840 | 22,841 | 22,842 | 22,843 | 22,844 | 22,845 | 22,846 | 22,847 | 22,848 | 22,849 | 22,850 |
| | 2-440 | 22,864 | 22,865 | 22,866 | 22,867 | 22,868 | 22,869 | 22,870 | 22,871 | 22,872 | 22,873 | 22,874 | 22,875 |

TABLE 18

| | | Compound represented by the formula (1) | | | | | | | | | | | | |
|---|---|---|---|---|---|---|---|---|---|---|---|---|---|---|
| | | 1-26 | 1-27 | 1-28 | 1-29 | 1-30 | 1-31 | 1-32 | 1-33 | 1-34 | 1-35 | 1-36 | 1-37 | 1-38 |
| Compound | 2-441 | 22,876 | 22,877 | 22,878 | 22,879 | 22,880 | 22,881 | 22,882 | 22,883 | 22,884 | 22,885 | 22,886 | 22,887 | 22,888 |
| represented | 2-442 | 22,901 | 22,902 | 22,903 | 22,904 | 22,905 | 22,906 | 22,907 | 22,908 | 22,909 | 22,910 | 22,911 | 22,912 | 22,913 |
| by the | 2-443 | 22,926 | 22,927 | 22,928 | 22,929 | 22,930 | 22,931 | 22,932 | 22,933 | 22,934 | 22,935 | 22,936 | 22,937 | 22,938 |
| formula | 2-444 | 22,951 | 22,952 | 22,953 | 22,954 | 22,955 | 22,956 | 22,957 | 22,958 | 22,959 | 22,960 | 22,961 | 22,962 | 22,963 |
| (2) | 2-445 | 22,976 | 22,977 | 22,978 | 22,979 | 22,980 | 22,981 | 22,982 | 22,983 | 22,984 | 22,985 | 22,986 | 22,987 | 22,988 |
| | 2-446 | 23,001 | 23,002 | 23,003 | 23,004 | 23,005 | 23,006 | 23,007 | 23,008 | 23,009 | 23,010 | 23,011 | 23,012 | 23,013 |
| | 2-447 | 23,026 | 23,027 | 23,028 | 23,029 | 23,030 | 23,031 | 23,032 | 23,033 | 23,034 | 23,035 | 23,036 | 23,037 | 23,038 |
| | 2-448 | 23,051 | 23,052 | 23,053 | 23,054 | 23,055 | 23,056 | 23,057 | 23,058 | 23,059 | 23,060 | 23,061 | 23,062 | 23,063 |
| | 2-449 | 23,076 | 23,077 | 23,078 | 23,079 | 23,080 | 23,081 | 23,082 | 23,083 | 23,084 | 23,085 | 23,086 | 23,087 | 23,088 |
| | 2-450 | 23,101 | 23,102 | 23,103 | 23,104 | 23,105 | 23,106 | 23,107 | 23,108 | 23,109 | 23,110 | 23,111 | 23,112 | 23,113 |
| | 2-451 | 23,126 | 23,127 | 23,128 | 23,129 | 23,130 | 23,131 | 23,132 | 23,133 | 23,134 | 23,135 | 23,136 | 23,137 | 23,138 |
| | 2-452 | 23,151 | 23,152 | 23,153 | 23,154 | 23,155 | 23,156 | 23,157 | 23,158 | 23,159 | 23,160 | 23,161 | 23,162 | 23,163 |
| | 2-453 | 23,176 | 23,177 | 23,178 | 23,179 | 23,180 | 23,181 | 23,182 | 23,183 | 23,184 | 23,185 | 23,186 | 23,187 | 23,188 |
| | 2-454 | 23,201 | 23,202 | 23,203 | 23,204 | 23,205 | 23,206 | 23,207 | 23,208 | 23,209 | 23,210 | 23,211 | 23,212 | 23,213 |
| | 2-455 | 23,226 | 23,227 | 23,228 | 23,229 | 23,230 | 23,231 | 23,232 | 23,233 | 23,234 | 23,235 | 23,236 | 23,237 | 23,238 |
| | 2-456 | 23,251 | 23,252 | 23,253 | 23,254 | 23,255 | 23,256 | 23,257 | 23,258 | 23,259 | 23,260 | 23,261 | 23,262 | 23,263 |
| | 2-457 | 23,276 | 23,277 | 23,278 | 23,279 | 23,280 | 23,281 | 23,282 | 23,283 | 23,284 | 23,285 | 23,286 | 23,287 | 23,288 |
| | 2-458 | 23,301 | 23,302 | 23,303 | 23,304 | 23,305 | 23,306 | 23,307 | 23,308 | 23,309 | 23,310 | 23,311 | 23,312 | 23,313 |
| | 2-459 | 23,326 | 23,327 | 23,328 | 23,329 | 23,330 | 23,331 | 23,332 | 23,333 | 23,334 | 23,335 | 23,336 | 23,337 | 23,338 |
| | 2-460 | 23,351 | 23,352 | 23,353 | 23,354 | 23,355 | 23,356 | 23,357 | 23,358 | 23,359 | 23,360 | 23,361 | 23,362 | 23,363 |
| | 2-461 | 23,376 | 23,377 | 23,378 | 23,379 | 23,380 | 23,381 | 23,382 | 23,383 | 23,384 | 23,385 | 23,386 | 23,387 | 23,388 |
| | 2-462 | 23,401 | 23,402 | 23,403 | 23,404 | 23,405 | 23,406 | 23,407 | 23,408 | 23,409 | 23,410 | 23,411 | 23,412 | 23,413 |
| | 2-463 | 23,426 | 23,427 | 23,428 | 23,429 | 23,430 | 23,431 | 23,432 | 23,433 | 23,434 | 23,435 | 23,436 | 23,437 | 23,438 |
| | 2-464 | 23,451 | 23,452 | 23,453 | 23,454 | 23,455 | 23,456 | 23,457 | 23,458 | 23,459 | 23,460 | 23,461 | 23,462 | 23,463 |
| | 2-465 | 23,476 | 23,477 | 23,478 | 23,479 | 23,480 | 23,481 | 23,482 | 23,483 | 23,484 | 23,485 | 23,486 | 23,487 | 23,488 |
| | 2-466 | 23,501 | 23,502 | 23,503 | 23,504 | 23,505 | 23,506 | 23,507 | 23,508 | 23,509 | 23,510 | 23,511 | 23,512 | 23,513 |
| | 2-467 | 23,526 | 23,527 | 23,528 | 23,529 | 23,530 | 23,531 | 23,532 | 23,533 | 23,534 | 23,535 | 23,536 | 23,537 | 23,538 |
| | 2-468 | 23,551 | 23,552 | 23,553 | 23,554 | 23,555 | 23,556 | 23,557 | 23,558 | 23,559 | 23,560 | 23,561 | 23,562 | 23,563 |
| | 2-469 | 23,576 | 23,577 | 23,578 | 23,579 | 23,580 | 23,581 | 23,582 | 23,583 | 23,584 | 23,585 | 23,586 | 23,587 | 23,588 |
| | 2-470 | 23,601 | 23,602 | 23,603 | 23,604 | 23,605 | 23,606 | 23,607 | 23,608 | 23,609 | 23,610 | 23,611 | 23,612 | 23,613 |
| | 2-471 | 23,626 | 23,627 | 23,628 | 23,629 | 23,630 | 23,631 | 23,632 | 23,633 | 23,634 | 23,635 | 23,636 | 23,637 | 23,638 |
| | 2-472 | 23,651 | 23,652 | 23,653 | 23,654 | 23,655 | 23,656 | 23,657 | 23,658 | 23,659 | 23,660 | 23,661 | 23,662 | 23,663 |
| | 2-473 | 23,676 | 23,677 | 23,678 | 23,679 | 23,680 | 23,681 | 23,682 | 23,683 | 23,684 | 23,685 | 23,686 | 23,687 | 23,688 |
| | 2-474 | 23,701 | 23,702 | 23,703 | 23,704 | 23,705 | 23,706 | 23,707 | 23,708 | 23,709 | 23,710 | 23,711 | 23,712 | 23,713 |
| | 2-475 | 23,726 | 23,727 | 23,728 | 23,729 | 23,730 | 23,731 | 23,732 | 23,733 | 23,734 | 23,735 | 23,736 | 23,737 | 23,738 |

| | | Compound represented by the formula (1) | | | | | | | | | | | |
|---|---|---|---|---|---|---|---|---|---|---|---|---|---|
| | | 1-39 | 1-40 | 1-41 | 1-42 | 1-43 | 1-44 | 1-45 | 1-46 | 1-47 | 1-48 | 1-49 | 1-50 |
| Compound | 2-441 | 22,889 | 22,890 | 22,891 | 22,892 | 22,893 | 22,894 | 22,895 | 22,896 | 22,897 | 22,898 | 22,899 | 22,900 |
| represented | 2-442 | 22,914 | 22,915 | 22,916 | 22,917 | 22,918 | 22,919 | 22,920 | 22,921 | 22,922 | 22,923 | 22,924 | 22,925 |
| by the | 2-443 | 22,939 | 22,940 | 22,941 | 22,942 | 22,943 | 22,944 | 22,945 | 22,946 | 22,947 | 22,948 | 22,949 | 22,950 |
| formula | 2-444 | 22,964 | 22,965 | 22,966 | 22,967 | 22,968 | 22,969 | 22,970 | 22,971 | 22,972 | 22,973 | 22,974 | 22,975 |
| (2) | 2-445 | 22,989 | 22,990 | 22,991 | 22,992 | 22,993 | 22,994 | 22,995 | 22,996 | 22,997 | 22,998 | 22,999 | 23,000 |
| | 2-446 | 23,014 | 23,015 | 23,016 | 23,017 | 23,018 | 23,019 | 23,020 | 23,021 | 23,022 | 23,023 | 23,024 | 23,025 |
| | 2-447 | 23,039 | 23,040 | 23,041 | 23,042 | 23,043 | 23,044 | 23,045 | 23,046 | 23,047 | 23,048 | 23,049 | 23,050 |
| | 2-448 | 23,064 | 23,065 | 23,066 | 23,067 | 23,068 | 23,069 | 23,070 | 23,071 | 23,072 | 23,073 | 23,074 | 23,075 |
| | 2-449 | 23,089 | 23,090 | 23,091 | 23,092 | 23,093 | 23,094 | 23,095 | 23,096 | 23,097 | 23,098 | 23,099 | 23,100 |
| | 2-450 | 23,114 | 23,115 | 23,116 | 23,117 | 23,118 | 23,119 | 23,120 | 23,121 | 23,122 | 23,123 | 23,124 | 23,125 |
| | 2-451 | 23,139 | 23,140 | 23,141 | 23,142 | 23,143 | 23,144 | 23,145 | 23,146 | 23,147 | 23,148 | 23,149 | 23,150 |
| | 2-452 | 23,164 | 23,165 | 23,166 | 23,167 | 23,168 | 23,169 | 23,170 | 23,171 | 23,172 | 23,173 | 23,174 | 23,175 |
| | 2-453 | 23,189 | 23,190 | 23,191 | 23,192 | 23,193 | 23,194 | 23,195 | 23,196 | 23,197 | 23,198 | 23,199 | 23,200 |
| | 2-454 | 23,214 | 23,215 | 23,216 | 23,217 | 23,218 | 23,219 | 23,220 | 23,221 | 23,222 | 23,223 | 23,224 | 23,225 |
| | 2-455 | 23,239 | 23,240 | 23,241 | 23,242 | 23,243 | 23,244 | 23,245 | 23,246 | 23,247 | 23,248 | 23,249 | 23,250 |
| | 2-456 | 23,264 | 23,265 | 23,266 | 23,267 | 23,268 | 23,269 | 23,270 | 23,271 | 23,272 | 23,273 | 23,274 | 23,275 |
| | 2-457 | 23,289 | 23,290 | 23,291 | 23,292 | 23,293 | 23,294 | 23,295 | 23,296 | 23,297 | 23,298 | 23,299 | 23,300 |
| | 2-458 | 23,314 | 23,315 | 23,316 | 23,317 | 23,318 | 23,319 | 23,320 | 23,321 | 23,322 | 23,323 | 23,324 | 23,325 |
| | 2-459 | 23,339 | 23,340 | 23,341 | 23,342 | 23,343 | 23,344 | 23,345 | 23,346 | 23,347 | 23,348 | 23,349 | 23,350 |
| | 2-460 | 23,364 | 23,365 | 23,366 | 23,367 | 23,368 | 23,369 | 23,370 | 23,371 | 23,372 | 23,373 | 23,374 | 23,375 |
| | 2-461 | 23,389 | 23,390 | 23,391 | 23,392 | 23,393 | 23,394 | 23,395 | 23,396 | 23,397 | 23,398 | 23,399 | 23,400 |
| | 2-462 | 23,414 | 23,415 | 23,416 | 23,417 | 23,418 | 23,419 | 23,420 | 23,421 | 23,422 | 23,423 | 23,424 | 23,425 |
| | 2-463 | 23,439 | 23,440 | 23,441 | 23,442 | 23,443 | 23,444 | 23,445 | 23,446 | 23,447 | 23,448 | 23,449 | 23,450 |
| | 2-464 | 23,464 | 23,465 | 23,466 | 23,467 | 23,468 | 23,469 | 23,470 | 23,471 | 23,472 | 23,473 | 23,474 | 23,475 |
| | 2-465 | 23,489 | 23,490 | 23,491 | 23,492 | 23,493 | 23,494 | 23,495 | 23,496 | 23,497 | 23,498 | 23,499 | 23,500 |
| | 2-466 | 23,514 | 23,515 | 23,516 | 23,517 | 23,518 | 23,519 | 23,520 | 23,521 | 23,522 | 23,523 | 23,524 | 23,525 |
| | 2-467 | 23,539 | 23,540 | 23,541 | 23,542 | 23,543 | 23,544 | 23,545 | 23,546 | 23,547 | 23,548 | 23,549 | 23,550 |
| | 2-468 | 23,564 | 23,565 | 23,566 | 23,567 | 23,568 | 23,569 | 23,570 | 23,571 | 23,572 | 23,573 | 23,574 | 23,575 |
| | 2-469 | 23,589 | 23,590 | 23,591 | 23,592 | 23,593 | 23,594 | 23,595 | 23,596 | 23,597 | 23,598 | 23,599 | 23,600 |
| | 2-470 | 23,614 | 23,615 | 23,616 | 23,617 | 23,618 | 23,619 | 23,620 | 23,621 | 23,622 | 23,623 | 23,624 | 23,625 |
| | 2-471 | 23,639 | 23,640 | 23,641 | 23,642 | 23,643 | 23,644 | 23,645 | 23,646 | 23,647 | 23,648 | 23,649 | 23,650 |
| | 2-472 | 23,664 | 23,665 | 23,666 | 23,667 | 23,668 | 23,669 | 23,670 | 23,671 | 23,672 | 23,673 | 23,674 | 23,675 |
| | 2-473 | 23,689 | 23,690 | 23,691 | 23,692 | 23,693 | 23,694 | 23,695 | 23,696 | 23,697 | 23,698 | 23,699 | 23,700 |
| | 2-474 | 23,714 | 23,715 | 23,716 | 23,717 | 23,718 | 23,719 | 23,720 | 23,721 | 23,722 | 23,723 | 23,724 | 23,725 |
| | 2-475 | 23,739 | 23,740 | 23,741 | 23,742 | 23,743 | 23,744 | 23,745 | 23,746 | 23,747 | 23,748 | 23,749 | 23,750 |

TABLE 19

| | | Compound represented by the formula (1) | | | | | | | | | | | | |
|---|---|---|---|---|---|---|---|---|---|---|---|---|---|---|
| | | 1-51 | 1-52 | 1-53 | 1-54 | 1-55 | 1-56 | 1-57 | 1-58 | 1-59 | 1-60 | 1-61 | 1-62 | 1-63 |
| Compound | 2-1 | 23,751 | 23,752 | 23,753 | 23,754 | 23,755 | 23,756 | 23,757 | 23,758 | 23,759 | 23,760 | 23,761 | 23,762 | 23,763 |
| represented | 2-2 | 23,776 | 23,777 | 23,778 | 23,779 | 23,780 | 23,781 | 23,782 | 23,783 | 23,784 | 23,785 | 23,786 | 23,787 | 23,788 |
| by the | 2-3 | 23,801 | 23,802 | 23,803 | 23,804 | 23,805 | 23,806 | 23,807 | 23,808 | 23,809 | 23,810 | 23,811 | 23,812 | 23,813 |
| formula | 2-4 | 23,826 | 23,827 | 23,828 | 23,829 | 23,830 | 23,831 | 23,832 | 23,833 | 23,834 | 23,835 | 23,836 | 23,837 | 23,838 |
| (2) | 2-5 | 23,851 | 23,852 | 23,853 | 23,854 | 23,855 | 23,856 | 23,857 | 23,858 | 23,859 | 23,860 | 23,861 | 23,862 | 23,863 |
| | 2-6 | 23,876 | 23,877 | 23,878 | 23,879 | 23,880 | 23,881 | 23,882 | 23,883 | 23,884 | 23,885 | 23,886 | 23,887 | 23,888 |
| | 2-7 | 23,901 | 23,902 | 23,903 | 23,904 | 23,905 | 23,906 | 23,907 | 23,908 | 23,909 | 23,910 | 23,911 | 23,912 | 23,913 |
| | 2-8 | 23,926 | 23,927 | 23,928 | 23,929 | 23,930 | 23,931 | 23,932 | 23,933 | 23,934 | 23,935 | 23,936 | 23,937 | 23,938 |
| | 2-9 | 23,951 | 23,952 | 23,953 | 23,954 | 23,955 | 23,956 | 23,957 | 23,958 | 23,959 | 23,960 | 23,961 | 23,962 | 23,963 |
| | 2-10 | 23,976 | 23,977 | 23,978 | 23,979 | 23,980 | 23,981 | 23,982 | 23,983 | 23,984 | 23,985 | 23,986 | 23,987 | 23,988 |
| | 2-11 | 24,001 | 24,002 | 24,003 | 24,004 | 24,005 | 24,006 | 24,007 | 24,008 | 24,009 | 24,010 | 24,011 | 24,012 | 24,013 |
| | 2-12 | 24,026 | 24,027 | 24,028 | 24,029 | 24,030 | 24,031 | 24,032 | 24,033 | 24,034 | 24,035 | 24,036 | 24,037 | 24,038 |
| | 2-13 | 24,051 | 24,052 | 24,053 | 24,054 | 24,055 | 24,056 | 24,057 | 24,058 | 24,059 | 24,060 | 24,061 | 24,062 | 24,063 |
| | 2-14 | 24,076 | 24,077 | 24,078 | 24,079 | 24,080 | 24,081 | 24,082 | 24,083 | 24,084 | 24,085 | 24,086 | 24,087 | 24,088 |
| | 2-15 | 24,101 | 24,102 | 24,103 | 24,104 | 24,105 | 24,106 | 24,107 | 24,108 | 24,109 | 24,110 | 24,111 | 24,112 | 24,113 |
| | 2-16 | 24,126 | 24,127 | 24,128 | 24,129 | 24,130 | 24,131 | 24,132 | 24,133 | 24,134 | 24,135 | 24,136 | 24,137 | 24,138 |
| | 2-17 | 24,151 | 24,152 | 24,153 | 24,154 | 24,155 | 24,156 | 24,157 | 24,158 | 24,159 | 24,160 | 24,161 | 24,162 | 24,163 |
| | 2-18 | 24,176 | 24,177 | 24,178 | 24,179 | 24,180 | 24,181 | 24,182 | 24,183 | 24,184 | 24,185 | 24,186 | 24,187 | 24,188 |
| | 2-19 | 24,201 | 24,202 | 24,203 | 24,204 | 24,205 | 24,206 | 24,207 | 24,208 | 24,209 | 24,210 | 24,211 | 24,212 | 24,213 |
| | 2-20 | 24,226 | 24,227 | 24,228 | 24,229 | 24,230 | 24,231 | 24,232 | 24,233 | 24,234 | 24,235 | 24,236 | 24,237 | 24,238 |
| | 2-21 | 24,251 | 24,252 | 24,253 | 24,254 | 24,255 | 24,256 | 24,257 | 24,258 | 24,259 | 24,260 | 24,261 | 24,262 | 24,263 |
| | 2-22 | 24,276 | 24,277 | 24,278 | 24,279 | 24,280 | 24,281 | 24,282 | 24,283 | 24,284 | 24,285 | 24,286 | 24,287 | 24,288 |
| | 2-23 | 24,301 | 24,302 | 24,303 | 24,304 | 24,305 | 24,306 | 24,307 | 24,308 | 24,309 | 24,310 | 24,311 | 24,312 | 24,313 |
| | 2-24 | 24,326 | 24,327 | 24,328 | 24,329 | 24,330 | 24,331 | 24,332 | 24,333 | 24,334 | 24,335 | 24,336 | 24,337 | 24,338 |
| | 2-25 | 24,351 | 24,352 | 24,353 | 24,354 | 24,355 | 24,356 | 24,357 | 24,358 | 24,359 | 24,360 | 24,361 | 24,362 | 24,363 |
| | 2-26 | 24,376 | 24,377 | 24,378 | 24,379 | 24,380 | 24,381 | 24,382 | 24,383 | 24,384 | 24,385 | 24,386 | 24,387 | 24,388 |
| | 2-27 | 24,401 | 24,402 | 24,403 | 24,404 | 24,405 | 24,406 | 24,407 | 24,408 | 24,409 | 24,410 | 24,411 | 24,412 | 24,413 |
| | 2-28 | 24,426 | 24,427 | 24,428 | 24,429 | 24,430 | 24,431 | 24,432 | 24,433 | 24,434 | 24,435 | 24,436 | 24,437 | 24,438 |
| | 2-29 | 24,451 | 24,452 | 24,453 | 24,454 | 24,455 | 24,456 | 24,457 | 24,458 | 24,459 | 24,460 | 24,461 | 24,462 | 24,463 |
| | 2-30 | 24,476 | 24,477 | 24,478 | 24,479 | 24,480 | 24,481 | 24,482 | 24,483 | 24,484 | 24,485 | 24,486 | 24,487 | 24,488 |
| | 2-31 | 24,501 | 24,502 | 24,503 | 24,504 | 24,505 | 24,506 | 24,507 | 24,508 | 24,509 | 24,510 | 24,511 | 24,512 | 24,513 |
| | 2-32 | 24,526 | 24,527 | 24,528 | 24,529 | 24,530 | 24,531 | 24,532 | 24,533 | 24,534 | 24,535 | 24,536 | 24,537 | 24,538 |
| | 2-33 | 24,551 | 24,552 | 24,553 | 24,554 | 24,555 | 24,556 | 24,557 | 24,558 | 24,559 | 24,560 | 24,561 | 24,562 | 24,563 |
| | 2-34 | 24,576 | 24,577 | 24,578 | 24,579 | 24,580 | 24,581 | 24,582 | 24,583 | 24,584 | 24,585 | 24,586 | 24,587 | 24,588 |
| | 2-35 | 24,601 | 24,602 | 24,603 | 24,604 | 24,605 | 24,606 | 24,607 | 24,608 | 24,609 | 24,610 | 24,611 | 24,612 | 24,613 |
| | 2-36 | 24,626 | 24,627 | 24,628 | 24,629 | 24,630 | 24,631 | 24,632 | 24,633 | 24,634 | 24,635 | 24,636 | 24,637 | 24,638 |
| | 2-37 | 24,651 | 24,652 | 24,653 | 24,654 | 24,655 | 24,656 | 24,657 | 24,658 | 24,659 | 24,660 | 24,661 | 24,662 | 24,663 |
| | 2-38 | 24,676 | 24,677 | 24,678 | 24,679 | 24,680 | 24,681 | 24,682 | 24,683 | 24,684 | 24,685 | 24,686 | 24,687 | 24,688 |
| | 2-39 | 24,701 | 24,702 | 24,703 | 24,704 | 24,705 | 24,706 | 24,707 | 24,708 | 24,709 | 24,710 | 24,711 | 24,712 | 24,713 |
| | 2-40 | 24,726 | 24,727 | 24,728 | 24,729 | 24,730 | 24,731 | 24,732 | 24,733 | 24,734 | 24,735 | 24,736 | 24,737 | 24,738 |
| | 2-41 | 24,751 | 24,752 | 24,753 | 24,754 | 24,755 | 24,756 | 24,757 | 24,758 | 24,759 | 24,760 | 24,761 | 24,762 | 24,763 |
| | 2-42 | 24,776 | 24,777 | 24,778 | 24,779 | 24,780 | 24,781 | 24,782 | 24,783 | 24,784 | 24,785 | 24,786 | 24,787 | 24,788 |
| | 2-43 | 24,801 | 24,802 | 24,803 | 24,804 | 24,805 | 24,806 | 24,807 | 24,808 | 24,809 | 24,810 | 24,811 | 24,812 | 24,813 |
| | 2-44 | 24,826 | 24,827 | 24,828 | 24,829 | 24,830 | 24,831 | 24,832 | 24,833 | 24,834 | 24,835 | 24,836 | 24,837 | 24,838 |
| | 2-45 | 24,851 | 24,852 | 24,853 | 24,854 | 24,855 | 24,856 | 24,857 | 24,858 | 24,859 | 24,860 | 24,861 | 24,862 | 24,863 |
| | 2-46 | 24,876 | 24,877 | 24,878 | 24,879 | 24,880 | 24,881 | 24,882 | 24,883 | 24,884 | 24,885 | 24,886 | 24,887 | 24,888 |
| | 2-47 | 24,901 | 24,902 | 24,903 | 24,904 | 24,905 | 24,906 | 24,907 | 24,908 | 24,909 | 24,910 | 24,911 | 24,912 | 24,913 |
| | 2-48 | 24,926 | 24,927 | 24,928 | 24,929 | 24,930 | 24,931 | 24,932 | 24,933 | 24,934 | 24,935 | 24,936 | 24,937 | 24,938 |
| | 2-49 | 24,951 | 24,952 | 24,953 | 24,954 | 24,955 | 24,956 | 24,957 | 24,958 | 24,959 | 24,960 | 24,961 | 24,962 | 24,963 |
| | 2-50 | 24,976 | 24,977 | 24,978 | 24,979 | 24,980 | 24,981 | 24,982 | 24,983 | 24,984 | 24,985 | 24,986 | 24,987 | 24,988 |
| | 2-51 | 25,001 | 25,002 | 25,003 | 25,004 | 25,005 | 25,006 | 25,007 | 25,008 | 25,009 | 25,010 | 25,011 | 25,012 | 25,013 |
| | 2-52 | 25,026 | 25,027 | 25,028 | 25,029 | 25,030 | 25,031 | 25,032 | 25,033 | 25,034 | 25,035 | 25,036 | 25,037 | 25,038 |
| | 2-53 | 25,051 | 25,052 | 25,053 | 25,054 | 25,055 | 25,056 | 25,057 | 25,058 | 25,059 | 25,060 | 25,061 | 25,062 | 25,063 |
| | 2-54 | 25,076 | 25,077 | 25,078 | 25,079 | 25,080 | 25,081 | 25,082 | 25,083 | 25,084 | 25,085 | 25,086 | 25,087 | 25,088 |
| | 2-55 | 25,101 | 25,102 | 25,103 | 25,104 | 25,105 | 25,106 | 25,107 | 25,108 | 25,109 | 25,110 | 25,111 | 25,112 | 25,113 |

| | | Compound represented by the formula (1) | | | | | | | | | | | |
|---|---|---|---|---|---|---|---|---|---|---|---|---|---|
| | | 1-64 | 1-65 | 1-66 | 1-67 | 1-68 | 1-69 | 1-70 | 1-71 | 1-72 | 1-73 | 1-74 | 1-75 |
| Compound | 2-1 | 23,764 | 23,765 | 23,766 | 23,767 | 23,768 | 23,769 | 23,770 | 23,771 | 23,772 | 23,773 | 23,774 | 23,775 |
| represented | 2-2 | 23,789 | 23,790 | 23,791 | 23,792 | 23,793 | 23,794 | 23,795 | 23,796 | 23,797 | 23,798 | 23,799 | 23,800 |
| by the | 2-3 | 23,814 | 23,815 | 23,816 | 23,817 | 23,818 | 23,819 | 23,820 | 23,821 | 23,822 | 23,823 | 23,824 | 23,825 |
| formula | 2-4 | 23,839 | 23,840 | 23,841 | 23,842 | 23,843 | 23,844 | 23,845 | 23,846 | 23,847 | 23,848 | 23,849 | 23,850 |
| (2) | 2-5 | 23,864 | 23,865 | 23,866 | 23,867 | 23,868 | 23,869 | 23,870 | 23,871 | 23,872 | 23,873 | 23,874 | 23,875 |
| | 2-6 | 23,889 | 23,890 | 23,891 | 23,892 | 23,893 | 23,894 | 23,895 | 23,896 | 23,897 | 23,898 | 23,899 | 23,900 |
| | 2-7 | 23,914 | 23,915 | 23,916 | 23,917 | 23,918 | 23,919 | 23,920 | 23,921 | 23,922 | 23,923 | 23,924 | 23,925 |
| | 2-8 | 23,939 | 23,940 | 23,941 | 23,942 | 23,943 | 23,944 | 23,945 | 23,946 | 23,947 | 23,948 | 23,949 | 23,950 |
| | 2-9 | 23,964 | 23,965 | 23,966 | 23,967 | 23,968 | 23,969 | 23,970 | 23,971 | 23,972 | 23,973 | 23,974 | 23,975 |
| | 2-10 | 23,989 | 23,990 | 23,991 | 23,992 | 23,993 | 23,994 | 23,995 | 23,996 | 23,997 | 23,998 | 23,999 | 24,000 |
| | 2-11 | 24,014 | 24,015 | 24,016 | 24,017 | 24,018 | 24,019 | 24,020 | 24,021 | 24,022 | 24,023 | 24,024 | 24,025 |
| | 2-12 | 24,039 | 24,040 | 24,041 | 24,042 | 24,043 | 24,044 | 24,045 | 24,046 | 24,047 | 24,048 | 24,049 | 24,050 |
| | 2-13 | 24,064 | 24,065 | 24,066 | 24,067 | 24,068 | 24,069 | 24,070 | 24,071 | 24,072 | 24,073 | 24,074 | 24,075 |
| | 2-14 | 24,089 | 24,090 | 24,091 | 24,092 | 24,093 | 24,094 | 24,095 | 24,096 | 24,097 | 24,098 | 24,099 | 24,100 |
| | 2-15 | 24,114 | 24,115 | 24,116 | 24,117 | 24,118 | 24,119 | 24,120 | 24,121 | 24,122 | 24,123 | 24,124 | 24,125 |
| | 2-16 | 24,139 | 24,140 | 24,141 | 24,142 | 24,143 | 24,144 | 24,145 | 24,146 | 24,147 | 24,148 | 24,149 | 24,150 |

TABLE 19-continued

| | | | | | | | | | | | | |
|---|---|---|---|---|---|---|---|---|---|---|---|---|
| 2-17 | 24,164 | 24,165 | 24,166 | 24,167 | 24,168 | 24,169 | 24,170 | 24,171 | 24,172 | 24,173 | 24,174 | 24,175 |
| 2-18 | 24,189 | 24,190 | 24,191 | 24,192 | 24,193 | 24,194 | 24,195 | 24,196 | 24,197 | 24,198 | 24,199 | 24,200 |
| 2-19 | 24,214 | 24,215 | 24,216 | 24,217 | 24,218 | 24,219 | 24,220 | 24,221 | 24,222 | 24,223 | 24,224 | 24,225 |
| 2-20 | 24,239 | 24,240 | 24,241 | 24,242 | 24,243 | 24,244 | 24,245 | 24,246 | 24,247 | 24,248 | 24,249 | 24,250 |
| 2-21 | 24,264 | 24,265 | 24,266 | 24,267 | 24,268 | 24,269 | 24,270 | 24,271 | 24,272 | 24,273 | 24,274 | 24,275 |
| 2-22 | 24,289 | 24,290 | 24,291 | 24,292 | 24,293 | 24,294 | 24,295 | 24,296 | 24,297 | 24,298 | 24,299 | 24,300 |
| 2-23 | 24,314 | 24,315 | 24,316 | 24,317 | 24,318 | 24,319 | 24,320 | 24,321 | 24,322 | 24,323 | 24,324 | 24,325 |
| 2-24 | 24,339 | 24,340 | 24,341 | 24,342 | 24,343 | 24,344 | 24,345 | 24,346 | 24,347 | 24,348 | 24,349 | 24,350 |
| 2-25 | 24,364 | 24,365 | 24,366 | 24,367 | 24,368 | 24,369 | 24,370 | 24,371 | 24,372 | 24,373 | 24,374 | 24,375 |
| 2-26 | 24,389 | 24,390 | 24,391 | 24,392 | 24,393 | 24,394 | 24,395 | 24,396 | 24,397 | 24,398 | 24,399 | 24,400 |
| 2-27 | 24,414 | 24,415 | 24,416 | 24,417 | 24,418 | 24,419 | 24,420 | 24,421 | 24,422 | 24,423 | 24,424 | 24,425 |
| 2-28 | 24,439 | 24,440 | 24,441 | 24,442 | 24,443 | 24,444 | 24,445 | 24,446 | 24,447 | 24,448 | 24,449 | 24,450 |
| 2-29 | 24,464 | 24,465 | 24,466 | 24,467 | 24,468 | 24,469 | 24,470 | 24,471 | 24,472 | 24,473 | 24,474 | 24,475 |
| 2-30 | 24,489 | 24,490 | 24,491 | 24,492 | 24,493 | 24,494 | 24,495 | 24,496 | 24,497 | 24,498 | 24,499 | 24,500 |
| 2-31 | 24,514 | 24,515 | 24,516 | 24,517 | 24,518 | 24,519 | 24,520 | 24,521 | 24,522 | 24,523 | 24,524 | 24,525 |
| 2-32 | 24,539 | 24,540 | 24,541 | 24,542 | 24,543 | 24,544 | 24,545 | 24,546 | 24,547 | 24,548 | 24,549 | 24,550 |
| 2-33 | 24,564 | 24,565 | 24,566 | 24,567 | 24,568 | 24,569 | 24,570 | 24,571 | 24,572 | 24,573 | 24,574 | 24,575 |
| 2-34 | 24,589 | 24,590 | 24,591 | 24,592 | 24,593 | 24,594 | 24,595 | 24,596 | 24,597 | 24,598 | 24,599 | 24,600 |
| 2-35 | 24,614 | 24,615 | 24,616 | 24,617 | 24,618 | 24,619 | 24,620 | 24,621 | 24,622 | 24,623 | 24,624 | 24,625 |
| 2-36 | 24,639 | 24,640 | 24,641 | 24,642 | 24,643 | 24,644 | 24,645 | 24,646 | 24,647 | 24,648 | 24,649 | 24,650 |
| 2-37 | 24,664 | 24,665 | 24,666 | 24,667 | 24,668 | 24,669 | 24,670 | 24,671 | 24,672 | 24,673 | 24,674 | 24,675 |
| 2-38 | 24,689 | 24,690 | 24,691 | 24,692 | 24,693 | 24,694 | 24,695 | 24,696 | 24,697 | 24,698 | 24,699 | 24,700 |
| 2-39 | 24,714 | 24,715 | 24,716 | 24,717 | 24,718 | 24,719 | 24,720 | 24,721 | 24,722 | 24,723 | 24,724 | 24,725 |
| 2-40 | 24,739 | 24,740 | 24,741 | 24,742 | 24,743 | 24,744 | 24,745 | 24,746 | 24,747 | 24,748 | 24,749 | 24,750 |
| 2-41 | 24,764 | 24,765 | 24,766 | 24,767 | 24,768 | 24,769 | 24,770 | 24,771 | 24,772 | 24,773 | 24,774 | 24,775 |
| 2-42 | 24,789 | 24,790 | 24,791 | 24,792 | 24,793 | 24,794 | 24,795 | 24,796 | 24,797 | 24,798 | 24,799 | 24,800 |
| 2-43 | 24,814 | 24,815 | 24,816 | 24,817 | 24,818 | 24,819 | 24,820 | 24,821 | 24,822 | 24,823 | 24,824 | 24,825 |
| 2-44 | 24,839 | 24,840 | 24,841 | 24,842 | 24,843 | 24,844 | 24,845 | 24,846 | 24,847 | 24,848 | 24,849 | 24,850 |
| 2-45 | 24,864 | 24,865 | 24,866 | 24,867 | 24,868 | 24,869 | 24,870 | 24,871 | 24,872 | 24,873 | 24,874 | 24,875 |
| 2-46 | 24,889 | 24,890 | 24,891 | 24,892 | 24,893 | 24,894 | 24,895 | 24,896 | 24,897 | 24,898 | 24,899 | 24,900 |
| 2-47 | 24,914 | 24,915 | 24,916 | 24,917 | 24,918 | 24,919 | 24,920 | 24,921 | 24,922 | 24,923 | 24,924 | 24,925 |
| 2-48 | 24,939 | 24,940 | 24,941 | 24,942 | 24,943 | 24,944 | 24,945 | 24,946 | 24,947 | 24,948 | 24,949 | 24,950 |
| 2-49 | 24,964 | 24,965 | 24,966 | 24,967 | 24,968 | 24,969 | 24,970 | 24,971 | 24,972 | 24,973 | 24,974 | 24,975 |
| 2-50 | 24,989 | 24,990 | 24,991 | 24,992 | 24,993 | 24,994 | 24,995 | 24,996 | 24,997 | 24,998 | 24,999 | 25,000 |
| 2-51 | 25,014 | 25,015 | 25,016 | 25,017 | 25,018 | 25,019 | 25,020 | 25,021 | 25,022 | 25,023 | 25,024 | 25,025 |
| 2-52 | 25,039 | 25,040 | 25,041 | 25,042 | 25,043 | 25,044 | 25,045 | 25,046 | 25,047 | 25,048 | 25,049 | 25,050 |
| 2-53 | 25,064 | 25,065 | 25,066 | 25,067 | 25,068 | 25,069 | 25,070 | 25,071 | 25,072 | 25,073 | 25,074 | 25,075 |
| 2-54 | 25,089 | 25,090 | 25,091 | 25,092 | 25,093 | 25,094 | 25,095 | 25,096 | 25,097 | 25,098 | 25,099 | 25,100 |
| 2-55 | 25,114 | 25,115 | 25,116 | 25,117 | 25,118 | 25,119 | 25,120 | 25,121 | 25,122 | 25,123 | 25,124 | 25,125 |

TABLE 20

| | | Compound represented by the formula (1) | | | | | | | | | | | | |
|---|---|---|---|---|---|---|---|---|---|---|---|---|---|---|
| | | 1-51 | 1-52 | 1-53 | 1-54 | 1-55 | 1-56 | 1-57 | 1-58 | 1-59 | 1-60 | 1-61 | 1-62 | 1-63 |
| Compound represented by the formula (2) | 2-56 | 25,126 | 25,127 | 25,128 | 25,129 | 25,130 | 25,131 | 25,132 | 25,133 | 25,134 | 25,135 | 25,136 | 25,137 | 25,138 |
| | 2-57 | 25,151 | 25,152 | 25,153 | 25,154 | 25,155 | 25,156 | 25,157 | 25,158 | 25,159 | 25,160 | 25,161 | 25,162 | 25,163 |
| | 2-58 | 25,176 | 25,177 | 25,178 | 25,179 | 25,180 | 25,181 | 25,182 | 25,183 | 25,184 | 25,185 | 25,186 | 25,187 | 25,188 |
| | 2-59 | 25,201 | 25,202 | 25,203 | 25,204 | 25,205 | 25,206 | 25,207 | 25,208 | 25,209 | 25,210 | 25,211 | 25,212 | 25,213 |
| | 2-60 | 25,226 | 25,227 | 25,228 | 25,229 | 25,230 | 25,231 | 25,232 | 25,233 | 25,234 | 25,235 | 25,236 | 25,237 | 25,238 |
| | 2-61 | 25,251 | 25,252 | 25,253 | 25,254 | 25,255 | 25,256 | 25,257 | 25,258 | 25,259 | 25,260 | 25,261 | 25,262 | 25,263 |
| | 2-62 | 25,276 | 25,277 | 25,278 | 25,279 | 25,280 | 25,281 | 25,282 | 25,283 | 25,284 | 25,285 | 25,286 | 25,287 | 25,288 |
| | 2-63 | 25,301 | 25,302 | 25,303 | 25,304 | 25,305 | 25,306 | 25,307 | 25,308 | 25,309 | 25,310 | 25,311 | 25,312 | 25,313 |
| | 2-64 | 25,326 | 25,327 | 25,328 | 25,329 | 25,330 | 25,331 | 25,332 | 25,333 | 25,334 | 25,335 | 25,336 | 25,337 | 25,338 |
| | 2-65 | 25,351 | 25,352 | 25,353 | 25,354 | 25,355 | 25,356 | 25,357 | 25,358 | 25,359 | 25,360 | 25,361 | 25,362 | 25,363 |
| | 2-66 | 25,376 | 25,377 | 25,378 | 25,379 | 25,380 | 25,381 | 25,382 | 25,383 | 25,384 | 25,385 | 25,386 | 25,387 | 25,388 |
| | 2-67 | 25,401 | 25,402 | 25,403 | 25,404 | 25,405 | 25,406 | 25,407 | 25,408 | 25,409 | 25,410 | 25,411 | 25,412 | 25,413 |
| | 2-68 | 25,426 | 25,427 | 25,428 | 25,429 | 25,430 | 25,431 | 25,432 | 25,433 | 25,434 | 25,435 | 25,436 | 25,437 | 25,438 |
| | 2-69 | 25,451 | 25,452 | 25,453 | 25,454 | 25,455 | 25,456 | 25,457 | 25,458 | 25,459 | 25,460 | 25,461 | 25,462 | 25,463 |
| | 2-70 | 25,476 | 25,477 | 25,478 | 25,479 | 25,480 | 25,481 | 25,482 | 25,483 | 25,484 | 25,485 | 25,486 | 25,487 | 25,488 |
| | 2-71 | 25,501 | 25,502 | 25,503 | 25,504 | 25,505 | 25,506 | 25,507 | 25,508 | 25,509 | 25,510 | 25,511 | 25,512 | 25,513 |
| | 2-72 | 25,526 | 25,527 | 25,528 | 25,529 | 25,530 | 25,531 | 25,532 | 25,533 | 25,534 | 25,535 | 25,536 | 25,537 | 25,538 |
| | 2-73 | 25,551 | 25,552 | 25,553 | 25,554 | 25,555 | 25,556 | 25,557 | 25,558 | 25,559 | 25,560 | 25,561 | 25,562 | 25,563 |
| | 2-74 | 25,576 | 25,577 | 25,578 | 25,579 | 25,580 | 25,581 | 25,582 | 25,583 | 25,584 | 25,585 | 25,586 | 25,587 | 25,588 |
| | 2-75 | 25,601 | 25,602 | 25,603 | 25,604 | 25,605 | 25,606 | 25,607 | 25,608 | 25,609 | 25,610 | 25,611 | 25,612 | 25,613 |
| | 2-76 | 25,626 | 25,627 | 25,628 | 25,629 | 25,630 | 25,631 | 25,632 | 25,633 | 25,634 | 25,635 | 25,636 | 25,637 | 25,638 |
| | 2-77 | 25,651 | 25,652 | 25,653 | 25,654 | 25,655 | 25,656 | 25,657 | 25,658 | 25,659 | 25,660 | 25,661 | 25,662 | 25,663 |
| | 2-78 | 25,676 | 25,677 | 25,678 | 25,679 | 25,680 | 25,681 | 25,682 | 25,683 | 25,684 | 25,685 | 25,686 | 25,687 | 25,688 |
| | 2-79 | 25,701 | 25,702 | 25,703 | 25,704 | 25,705 | 25,706 | 25,707 | 25,708 | 25,709 | 25,710 | 25,711 | 25,712 | 25,713 |
| | 2-80 | 25,726 | 25,727 | 25,728 | 25,729 | 25,730 | 25,731 | 25,732 | 25,733 | 25,734 | 25,735 | 25,736 | 25,737 | 25,738 |
| | 2-81 | 25,751 | 25,752 | 25,753 | 25,754 | 25,755 | 25,756 | 25,757 | 25,758 | 25,759 | 25,760 | 25,761 | 25,762 | 25,763 |
| | 2-82 | 25,776 | 25,777 | 25,778 | 25,779 | 25,780 | 25,781 | 25,782 | 25,783 | 25,784 | 25,785 | 25,786 | 25,787 | 25,788 |
| | 2-83 | 25,801 | 25,802 | 25,803 | 25,804 | 25,805 | 25,806 | 25,807 | 25,808 | 25,809 | 25,810 | 25,811 | 25,812 | 25,813 |
| | 2-84 | 25,826 | 25,827 | 25,828 | 25,829 | 25,830 | 25,831 | 25,832 | 25,833 | 25,834 | 25,835 | 25,836 | 25,837 | 25,838 |
| | 2-85 | 25,851 | 25,852 | 25,853 | 25,854 | 25,855 | 25,856 | 25,857 | 25,858 | 25,859 | 25,860 | 25,861 | 25,862 | 25,863 |
| | 2-86 | 25,876 | 25,877 | 25,878 | 25,879 | 25,880 | 25,881 | 25,882 | 25,883 | 25,884 | 25,885 | 25,886 | 25,887 | 25,888 |

TABLE 20-continued

| | | | | | | | | | | | | | |
|---|---|---|---|---|---|---|---|---|---|---|---|---|---|
| 2-87 | 25,901 | 25,902 | 25,903 | 25,904 | 25,905 | 25,906 | 25,907 | 25,908 | 25,909 | 25,910 | 25,911 | 25,912 | 25,913 |
| 2-88 | 25,926 | 25,927 | 25,928 | 25,929 | 25,930 | 25,931 | 25,932 | 25,933 | 25,934 | 25,935 | 25,936 | 25,937 | 25,938 |
| 2-89 | 25,951 | 25,952 | 25,953 | 25,954 | 25,955 | 25,956 | 25,957 | 25,958 | 25,959 | 25,960 | 25,961 | 25,962 | 25,963 |
| 2-90 | 25,976 | 25,977 | 25,978 | 25,979 | 25,980 | 25,981 | 25,982 | 25,983 | 25,984 | 25,985 | 25,986 | 25,987 | 25,988 |
| 2-91 | 26,001 | 26,002 | 26,003 | 26,004 | 26,005 | 26,006 | 26,007 | 26,008 | 26,009 | 26,010 | 26,011 | 26,012 | 26,013 |
| 2-92 | 26,026 | 26,027 | 26,028 | 26,029 | 26,030 | 26,031 | 26,032 | 26,033 | 26,034 | 26,035 | 26,036 | 26,037 | 26,038 |
| 2-93 | 26,051 | 26,052 | 26,053 | 26,054 | 26,055 | 26,056 | 26,057 | 26,058 | 26,059 | 26,060 | 26,061 | 26,062 | 26,063 |
| 2-94 | 26,076 | 26,077 | 26,078 | 26,079 | 26,080 | 26,081 | 26,082 | 26,083 | 26,084 | 26,085 | 26,086 | 26,087 | 26,088 |
| 2-95 | 26,101 | 26,102 | 26,103 | 26,104 | 26,105 | 26,106 | 26,107 | 26,108 | 26,109 | 26,110 | 26,111 | 26,112 | 26,113 |
| 2-96 | 26,126 | 26,127 | 26,128 | 26,129 | 26,130 | 26,131 | 26,132 | 26,133 | 26,134 | 26,135 | 26,136 | 26,137 | 26,138 |
| 2-97 | 26,151 | 26,152 | 26,153 | 26,154 | 26,155 | 26,156 | 26,157 | 26,158 | 26,159 | 26,160 | 26,161 | 26,162 | 26,163 |
| 2-98 | 26,176 | 26,177 | 26,178 | 26,179 | 26,180 | 26,181 | 26,182 | 26,183 | 26,184 | 26,185 | 26,186 | 26,187 | 26,188 |
| 2-99 | 26,201 | 26,202 | 26,203 | 26,204 | 26,205 | 26,206 | 26,207 | 26,208 | 26,209 | 26,210 | 26,211 | 26,212 | 26,213 |
| 2-100 | 26,226 | 26,227 | 26,228 | 26,229 | 26,230 | 26,231 | 26,232 | 26,233 | 26,234 | 26,235 | 26,236 | 26,237 | 26,238 |
| 2-101 | 26,251 | 26,252 | 26,253 | 26,254 | 26,255 | 26,256 | 26,257 | 26,258 | 26,259 | 26,260 | 26,261 | 26,262 | 26,263 |
| 2-102 | 26,276 | 26,277 | 26,278 | 26,279 | 26,280 | 26,281 | 26,282 | 26,283 | 26,284 | 26,285 | 26,286 | 26,287 | 26,288 |
| 2-103 | 26,301 | 26,302 | 26,303 | 26,304 | 26,305 | 26,306 | 26,307 | 26,308 | 26,309 | 26,310 | 26,311 | 26,312 | 26,313 |
| 2-104 | 26,326 | 26,327 | 26,328 | 26,329 | 26,330 | 26,331 | 26,332 | 26,333 | 26,334 | 26,335 | 26,336 | 26,337 | 26,338 |
| 2-105 | 26,351 | 26,352 | 26,353 | 26,354 | 26,355 | 26,356 | 26,357 | 26,358 | 26,359 | 26,360 | 26,361 | 26,362 | 26,363 |
| 2-106 | 26,376 | 26,377 | 26,378 | 26,379 | 26,380 | 26,381 | 26,382 | 26,383 | 26,384 | 26,385 | 26,386 | 26,387 | 26,388 |
| 2-107 | 26,401 | 26,402 | 26,403 | 26,404 | 26,405 | 26,406 | 26,407 | 26,408 | 26,409 | 26,410 | 26,411 | 26,412 | 26,413 |
| 2-108 | 26,426 | 26,427 | 26,428 | 26,429 | 26,430 | 26,431 | 26,432 | 26,433 | 26,434 | 26,435 | 26,436 | 26,437 | 26,438 |
| 2-109 | 26,451 | 26,452 | 26,453 | 26,454 | 26,455 | 26,456 | 26,457 | 26,458 | 26,459 | 26,460 | 26,461 | 26,462 | 26,463 |
| 2-110 | 26,476 | 26,477 | 26,478 | 26,479 | 26,480 | 26,481 | 26,482 | 26,483 | 26,484 | 26,485 | 26,486 | 26,487 | 26,488 |

| | | Compound represented by the formula (1) | | | | | | | | | | | |
|---|---|---|---|---|---|---|---|---|---|---|---|---|---|
| | | 1-64 | 1-65 | 1-66 | 1-67 | 1-68 | 1-69 | 1-70 | 1-71 | 1-72 | 1-73 | 1-74 | 1-75 |
| Compound represented by the formula (2) | 2-56 | 25,139 | 25,140 | 25,141 | 25,142 | 25,143 | 25,144 | 25,145 | 25,146 | 25,147 | 25,148 | 25,149 | 25,150 |
| | 2-57 | 25,164 | 25,165 | 25,166 | 25,167 | 25,168 | 25,169 | 25,170 | 25,171 | 25,172 | 25,173 | 25,174 | 25,175 |
| | 2-58 | 25,189 | 25,190 | 25,191 | 25,192 | 25,193 | 25,194 | 25,195 | 25,196 | 25,197 | 25,198 | 25,199 | 25,200 |
| | 2-59 | 25,214 | 25,215 | 25,216 | 25,217 | 25,218 | 25,219 | 25,220 | 25,221 | 25,222 | 25,223 | 25,224 | 25,225 |
| | 2-60 | 25,239 | 25,240 | 25,241 | 25,242 | 25,243 | 25,244 | 25,245 | 25,246 | 25,247 | 25,248 | 25,249 | 25,250 |
| | 2-61 | 25,264 | 25,265 | 25,266 | 25,267 | 25,268 | 25,269 | 25,270 | 25,271 | 25,272 | 25,273 | 25,274 | 25,275 |
| | 2-62 | 25,289 | 25,290 | 25,291 | 25,292 | 25,293 | 25,294 | 25,295 | 25,296 | 25,297 | 25,298 | 25,299 | 25,300 |
| | 2-63 | 25,314 | 25,315 | 25,316 | 25,317 | 25,318 | 25,319 | 25,320 | 25,321 | 25,322 | 25,323 | 25,324 | 25,325 |
| | 2-64 | 25,339 | 25,340 | 25,341 | 25,342 | 25,343 | 25,344 | 25,345 | 25,346 | 25,347 | 25,348 | 25,349 | 25,350 |
| | 2-65 | 25,364 | 25,365 | 25,366 | 25,367 | 25,368 | 25,369 | 25,370 | 25,371 | 25,372 | 25,373 | 25,374 | 25,375 |
| | 2-66 | 25,389 | 25,390 | 25,391 | 25,392 | 25,393 | 25,394 | 25,395 | 25,396 | 25,397 | 25,398 | 25,399 | 25,400 |
| | 2-67 | 25,414 | 25,415 | 25,416 | 25,417 | 25,418 | 25,419 | 25,420 | 25,421 | 25,422 | 25,423 | 25,424 | 25,425 |
| | 2-68 | 25,439 | 25,440 | 25,441 | 25,442 | 25,443 | 25,444 | 25,445 | 25,446 | 25,447 | 25,448 | 25,449 | 25,450 |
| | 2-69 | 25,464 | 25,465 | 25,466 | 25,467 | 25,468 | 25,469 | 25,470 | 25,471 | 25,472 | 25,473 | 25,474 | 25,475 |
| | 2-70 | 25,489 | 25,490 | 25,491 | 25,492 | 25,493 | 25,494 | 25,495 | 25,496 | 25,497 | 25,498 | 25,499 | 25,500 |
| | 2-71 | 25,514 | 25,515 | 25,516 | 25,517 | 25,518 | 25,519 | 25,520 | 25,521 | 25,522 | 25,523 | 25,524 | 25,525 |
| | 2-72 | 25,539 | 25,540 | 25,541 | 25,542 | 25,543 | 25,544 | 25,545 | 25,546 | 25,547 | 25,548 | 25,549 | 25,550 |
| | 2-73 | 25,564 | 25,565 | 25,566 | 25,567 | 25,568 | 25,569 | 25,570 | 25,571 | 25,572 | 25,573 | 25,574 | 25,575 |
| | 2-74 | 25,589 | 25,590 | 25,591 | 25,592 | 25,593 | 25,594 | 25,595 | 25,596 | 25,597 | 25,598 | 25,599 | 25,600 |
| | 2-75 | 25,614 | 25,615 | 25,616 | 25,617 | 25,618 | 25,619 | 25,620 | 25,621 | 25,622 | 25,623 | 25,624 | 25,625 |
| | 2-76 | 25,639 | 25,640 | 25,641 | 25,642 | 25,643 | 25,644 | 25,645 | 25,646 | 25,647 | 25,648 | 25,649 | 25,650 |
| | 2-77 | 25,664 | 25,665 | 25,666 | 25,667 | 25,668 | 25,669 | 25,670 | 25,671 | 25,672 | 25,673 | 25,674 | 25,675 |
| | 2-78 | 25,689 | 25,690 | 25,691 | 25,692 | 25,693 | 25,694 | 25,695 | 25,696 | 25,697 | 25,698 | 25,699 | 25,700 |
| | 2-79 | 25,714 | 25,715 | 25,716 | 25,717 | 25,718 | 25,719 | 25,720 | 25,721 | 25,722 | 25,723 | 25,724 | 25,725 |
| | 2-80 | 25,739 | 25,740 | 25,741 | 25,742 | 25,743 | 25,744 | 25,745 | 25,746 | 25,747 | 25,748 | 25,749 | 25,750 |
| | 2-81 | 25,764 | 25,765 | 25,766 | 25,767 | 25,768 | 25,769 | 25,770 | 25,771 | 25,772 | 25,773 | 25,774 | 25,775 |
| | 2-82 | 25,789 | 25,790 | 25,791 | 25,792 | 25,793 | 25,794 | 25,795 | 25,796 | 25,797 | 25,798 | 25,799 | 25,800 |
| | 2-83 | 25,814 | 25,815 | 25,816 | 25,817 | 25,818 | 25,819 | 25,820 | 25,821 | 25,822 | 25,823 | 25,824 | 25,825 |
| | 2-84 | 25,839 | 25,840 | 25,841 | 25,842 | 25,843 | 25,844 | 25,845 | 25,846 | 25,847 | 25,848 | 25,849 | 25,850 |
| | 2-85 | 25,864 | 25,865 | 25,866 | 25,867 | 25,868 | 25,869 | 25,870 | 25,871 | 25,872 | 25,873 | 25,874 | 25,875 |
| | 2-86 | 25,889 | 25,890 | 25,891 | 25,892 | 25,893 | 25,894 | 25,895 | 25,896 | 25,897 | 25,898 | 25,899 | 25,900 |
| | 2-87 | 25,914 | 25,915 | 25,916 | 25,917 | 25,918 | 25,919 | 25,920 | 25,921 | 25,922 | 25,923 | 25,924 | 25,925 |
| | 2-88 | 25,939 | 25,940 | 25,941 | 25,942 | 25,943 | 25,944 | 25,945 | 25,946 | 25,947 | 25,948 | 25,949 | 25,950 |
| | 2-89 | 25,964 | 25,965 | 25,966 | 25,967 | 25,968 | 25,969 | 25,970 | 25,971 | 25,972 | 25,973 | 25,974 | 25,975 |
| | 2-90 | 25,989 | 25,990 | 25,991 | 25,992 | 25,993 | 25,994 | 25,995 | 25,996 | 25,997 | 25,998 | 25,999 | 26,000 |
| | 2-91 | 26,014 | 26,015 | 26,016 | 26,017 | 26,018 | 26,019 | 26,020 | 26,021 | 26,022 | 26,023 | 26,024 | 26,025 |
| | 2-92 | 26,039 | 26,040 | 26,041 | 26,042 | 26,043 | 26,044 | 26,045 | 26,046 | 26,047 | 26,048 | 26,049 | 26,050 |
| | 2-93 | 26,064 | 26,065 | 26,066 | 26,067 | 26,068 | 26,069 | 26,070 | 26,071 | 26,072 | 26,073 | 26,074 | 26,075 |
| | 2-94 | 26,089 | 26,090 | 26,091 | 26,092 | 26,093 | 26,094 | 26,095 | 26,096 | 26,097 | 26,098 | 26,099 | 26,100 |
| | 2-95 | 26,114 | 26,115 | 26,116 | 26,117 | 26,118 | 26,119 | 26,120 | 26,121 | 26,122 | 26,123 | 26,124 | 26,125 |
| | 2-96 | 26,139 | 26,140 | 26,141 | 26,142 | 26,143 | 26,144 | 26,145 | 26,146 | 26,147 | 26,148 | 26,149 | 26,150 |
| | 2-97 | 26,164 | 26,165 | 26,166 | 26,167 | 26,168 | 26,169 | 26,170 | 26,171 | 26,172 | 26,173 | 26,174 | 26,175 |
| | 2-98 | 26,189 | 26,190 | 26,191 | 26,192 | 26,193 | 26,194 | 26,195 | 26,196 | 26,197 | 26,198 | 26,199 | 26,200 |
| | 2-99 | 26,214 | 26,215 | 26,216 | 26,217 | 26,218 | 26,219 | 26,220 | 26,221 | 26,222 | 26,223 | 26,224 | 26,225 |
| | 2-100 | 26,239 | 26,240 | 26,241 | 26,242 | 26,243 | 26,244 | 26,245 | 26,246 | 26,247 | 26,248 | 26,249 | 26,250 |
| | 2-101 | 26,264 | 26,265 | 26,266 | 26,267 | 26,268 | 26,269 | 26,270 | 26,271 | 26,272 | 26,273 | 26,274 | 26,275 |
| | 2-102 | 26,289 | 26,290 | 26,291 | 26,292 | 26,293 | 26,294 | 26,295 | 26,296 | 26,297 | 26,298 | 26,299 | 26,300 |
| | 2-103 | 26,314 | 26,315 | 26,316 | 26,317 | 26,318 | 26,319 | 26,320 | 26,321 | 26,322 | 26,323 | 26,324 | 26,325 |
| | 2-104 | 26,339 | 26,340 | 26,341 | 26,342 | 26,343 | 26,344 | 26,345 | 26,346 | 26,347 | 26,348 | 26,349 | 26,350 |
| | 2-105 | 26,364 | 26,365 | 26,366 | 26,367 | 26,368 | 26,369 | 26,370 | 26,371 | 26,372 | 26,373 | 26,374 | 26,375 |
| | 2-106 | 26,389 | 26,390 | 26,391 | 26,392 | 26,393 | 26,394 | 26,395 | 26,396 | 26,397 | 26,398 | 26,399 | 26,400 |

TABLE 20-continued

| | | | | | | | | | | | | | |
|---|---|---|---|---|---|---|---|---|---|---|---|---|---|
| | 2-107 | 26,414 | 26,415 | 26,416 | 26,417 | 26,418 | 26,419 | 26,420 | 26,421 | 26,422 | 26,423 | 26,424 | 26,425 |
| | 2-108 | 26,439 | 26,440 | 26,441 | 26,442 | 26,443 | 26,444 | 26,445 | 26,446 | 26,447 | 26,448 | 26,449 | 26,450 |
| | 2-109 | 26,464 | 26,465 | 26,466 | 26,467 | 26,468 | 26,469 | 26,470 | 26,471 | 26,472 | 26,473 | 26,474 | 26,475 |
| | 2-110 | 26,489 | 26,490 | 26,491 | 26,492 | 26,493 | 26,494 | 26,495 | 26,496 | 26,497 | 26,498 | 26,499 | 26,500 |

TABLE 21

| | | Compound represented by the formula (1) | | | | | | | | | | | | |
|---|---|---|---|---|---|---|---|---|---|---|---|---|---|---|
| | | 1-51 | 1-52 | 1-53 | 1-54 | 1-55 | 1-56 | 1-57 | 1-58 | 1-59 | 1-60 | 1-61 | 1-62 | 1-63 |
| Compound | 2-111 | 26,501 | 26,502 | 26,503 | 26,504 | 26,505 | 26,506 | 26,507 | 26,508 | 26,509 | 26,510 | 26,511 | 26,512 | 26,513 |
| represented | 2-112 | 26,526 | 26,527 | 26,528 | 26,529 | 26,530 | 26,531 | 26,532 | 26,533 | 26,534 | 26,535 | 26,536 | 26,537 | 26,538 |
| by the | 2-113 | 26,551 | 26,552 | 26,553 | 26,554 | 26,555 | 26,556 | 26,557 | 26,558 | 26,559 | 26,560 | 26,561 | 26,562 | 26,563 |
| formula | 2-114 | 26,576 | 26,577 | 26,578 | 26,579 | 26,580 | 26,581 | 26,582 | 26,583 | 26,584 | 26,585 | 26,586 | 26,587 | 26,588 |
| (2) | 2-115 | 26,601 | 26,602 | 26,603 | 26,604 | 26,605 | 26,606 | 26,607 | 26,608 | 26,609 | 26,610 | 26,611 | 26,612 | 26,613 |
| | 2-116 | 26,626 | 26,627 | 26,628 | 26,629 | 26,630 | 26,631 | 26,632 | 26,633 | 26,634 | 26,635 | 26,636 | 26,637 | 26,638 |
| | 2-117 | 26,651 | 26,652 | 26,653 | 26,654 | 26,655 | 26,656 | 26,657 | 26,658 | 26,659 | 26,660 | 26,661 | 26,662 | 26,663 |
| | 2-118 | 26,676 | 26,677 | 26,678 | 26,679 | 26,680 | 26,681 | 26,682 | 26,683 | 26,684 | 26,685 | 26,686 | 26,687 | 26,688 |
| | 2-119 | 26,701 | 26,702 | 26,703 | 26,704 | 26,705 | 26,706 | 26,707 | 26,708 | 26,709 | 26,710 | 26,711 | 26,712 | 26,713 |
| | 2-120 | 26,726 | 26,727 | 26,728 | 26,729 | 26,730 | 26,731 | 26,732 | 26,733 | 26,734 | 26,735 | 26,736 | 26,737 | 26,738 |
| | 2-121 | 26,751 | 26,752 | 26,753 | 26,754 | 26,755 | 26,756 | 26,757 | 26,758 | 26,759 | 26,760 | 26,761 | 26,762 | 26,763 |
| | 2-122 | 26,776 | 26,777 | 26,778 | 26,779 | 26,780 | 26,781 | 26,782 | 26,783 | 26,784 | 26,785 | 26,786 | 26,787 | 26,788 |
| | 2-123 | 26,801 | 26,802 | 26,803 | 26,804 | 26,805 | 26,806 | 26,807 | 26,808 | 26,809 | 26,810 | 26,811 | 26,812 | 26,813 |
| | 2-124 | 26,826 | 26,827 | 26,828 | 26,829 | 26,830 | 26,831 | 26,832 | 26,833 | 26,834 | 26,835 | 26,836 | 26,837 | 26,838 |
| | 2-125 | 26,851 | 26,852 | 26,853 | 26,854 | 26,855 | 26,856 | 26,857 | 26,858 | 26,859 | 26,860 | 26,861 | 26,862 | 26,863 |
| | 2-126 | 26,876 | 26,877 | 26,878 | 26,879 | 26,880 | 26,881 | 26,882 | 26,883 | 26,884 | 26,885 | 26,886 | 26,887 | 26,888 |
| | 2-127 | 26,901 | 26,902 | 26,903 | 26,904 | 26,905 | 26,906 | 26,907 | 26,908 | 26,909 | 26,910 | 26,911 | 26,912 | 26,913 |
| | 2-128 | 26,926 | 26,927 | 26,928 | 26,929 | 26,930 | 26,931 | 26,932 | 26,933 | 26,934 | 26,935 | 26,936 | 26,937 | 26,938 |
| | 2-129 | 26,951 | 26,952 | 26,953 | 26,954 | 26,955 | 26,956 | 26,957 | 26,958 | 26,959 | 26,960 | 26,961 | 26,962 | 26,963 |
| | 2-130 | 26,976 | 26,977 | 26,978 | 26,979 | 26,980 | 26,981 | 26,982 | 26,983 | 26,984 | 26,985 | 26,986 | 26,987 | 26,988 |
| | 2-131 | 27,001 | 27,002 | 27,003 | 27,004 | 27,005 | 27,006 | 27,007 | 27,008 | 27,009 | 27,010 | 27,011 | 27,012 | 27,013 |
| | 2-132 | 27,026 | 27,027 | 27,028 | 27,029 | 27,030 | 27,031 | 27,032 | 27,033 | 27,034 | 27,035 | 27,036 | 27,037 | 27,038 |
| | 2-133 | 27,051 | 27,052 | 27,053 | 27,054 | 27,055 | 27,056 | 27,057 | 27,058 | 27,059 | 27,060 | 27,061 | 27,062 | 27,063 |
| | 2-134 | 27,076 | 27,077 | 27,078 | 27,079 | 27,080 | 27,081 | 27,082 | 27,083 | 27,084 | 27,085 | 27,086 | 27,087 | 27,088 |
| | 2-135 | 27,101 | 27,102 | 27,103 | 27,104 | 27,105 | 27,106 | 27,107 | 27,108 | 27,109 | 27,110 | 27,111 | 27,112 | 27,113 |
| | 2-136 | 27,126 | 27,127 | 27,128 | 27,129 | 27,130 | 27,131 | 27,132 | 27,133 | 27,134 | 27,135 | 27,136 | 27,137 | 27,138 |
| | 2-137 | 27,151 | 27,152 | 27,153 | 27,154 | 27,155 | 27,156 | 27,157 | 27,158 | 27,159 | 27,160 | 27,161 | 27,162 | 27,163 |
| | 2-138 | 27,176 | 27,177 | 27,178 | 27,179 | 27,180 | 27,181 | 27,182 | 27,183 | 27,184 | 27,185 | 27,186 | 27,187 | 27,188 |
| | 2-139 | 27,201 | 27,202 | 27,203 | 27,204 | 27,205 | 27,206 | 27,207 | 27,208 | 27,209 | 27,210 | 27,211 | 27,212 | 27,213 |
| | 2-140 | 27,226 | 27,227 | 27,228 | 27,229 | 27,230 | 27,231 | 27,232 | 27,233 | 27,234 | 27,235 | 27,236 | 27,237 | 27,238 |
| | 2-141 | 27,251 | 27,252 | 27,253 | 27,254 | 27,255 | 27,256 | 27,257 | 27,258 | 27,259 | 27,260 | 27,261 | 27,262 | 27,263 |
| | 2-142 | 27,276 | 27,277 | 27,278 | 27,279 | 27,280 | 27,281 | 27,282 | 27,283 | 27,284 | 27,285 | 27,286 | 27,287 | 27,288 |
| | 2-143 | 27,301 | 27,302 | 27,303 | 27,304 | 27,305 | 27,306 | 27,307 | 27,308 | 27,309 | 27,310 | 27,311 | 27,312 | 27,313 |
| | 2-144 | 27,326 | 27,327 | 27,328 | 27,329 | 27,330 | 27,331 | 27,332 | 27,333 | 27,334 | 27,335 | 27,336 | 27,337 | 27,338 |
| | 2-145 | 27,351 | 27,352 | 27,353 | 27,354 | 27,355 | 27,356 | 27,357 | 27,358 | 27,359 | 27,360 | 27,361 | 27,362 | 27,363 |
| | 2-146 | 27,376 | 27,377 | 27,378 | 27,379 | 27,380 | 27,381 | 27,382 | 27,383 | 27,384 | 27,385 | 27,386 | 27,387 | 27,388 |
| | 2-147 | 27,401 | 27,402 | 27,403 | 27,404 | 27,405 | 27,406 | 27,407 | 27,408 | 27,409 | 27,410 | 27,411 | 27,412 | 27,413 |
| | 2-148 | 27,426 | 27,427 | 27,428 | 27,429 | 27,430 | 27,431 | 27,432 | 27,433 | 27,434 | 27,435 | 27,436 | 27,437 | 27,438 |
| | 2-149 | 27,451 | 27,452 | 27,453 | 27,454 | 27,455 | 27,456 | 27,457 | 27,458 | 27,459 | 27,460 | 27,461 | 27,462 | 27,463 |
| | 2-150 | 27,476 | 27,477 | 27,478 | 27,479 | 27,480 | 27,481 | 27,482 | 27,483 | 27,484 | 27,485 | 27,486 | 27,487 | 27,488 |
| | 2-151 | 27,501 | 27,502 | 27,503 | 27,504 | 27,505 | 27,506 | 27,507 | 27,508 | 27,509 | 27,510 | 27,511 | 27,512 | 27,513 |
| | 2-152 | 27,526 | 27,527 | 27,528 | 27,529 | 27,530 | 27,531 | 27,532 | 27,533 | 27,534 | 27,535 | 27,536 | 27,537 | 27,538 |
| | 2-153 | 27,551 | 27,552 | 27,553 | 27,554 | 27,555 | 27,556 | 27,557 | 27,558 | 27,559 | 27,560 | 27,561 | 27,562 | 27,563 |
| | 2-154 | 27,576 | 27,577 | 27,578 | 27,579 | 27,580 | 27,581 | 27,582 | 27,583 | 27,584 | 27,585 | 27,586 | 27,587 | 27,588 |
| | 2-155 | 27,601 | 27,602 | 27,603 | 27,604 | 27,605 | 27,606 | 27,607 | 27,608 | 27,609 | 27,610 | 27,611 | 27,612 | 27,613 |
| | 2-156 | 27,626 | 27,627 | 27,628 | 27,629 | 27,630 | 27,631 | 27,632 | 27,633 | 27,634 | 27,635 | 27,636 | 27,637 | 27,638 |
| | 2-157 | 27,651 | 27,652 | 27,653 | 27,654 | 27,655 | 27,656 | 27,657 | 27,658 | 27,659 | 27,660 | 27,661 | 27,662 | 27,663 |
| | 2-158 | 27,676 | 27,677 | 27,678 | 27,679 | 27,680 | 27,681 | 27,682 | 27,683 | 27,684 | 27,685 | 27,686 | 27,687 | 27,688 |
| | 2-159 | 27,701 | 27,702 | 27,703 | 27,704 | 27,705 | 27,706 | 27,707 | 27,708 | 27,709 | 27,710 | 27,711 | 27,712 | 27,713 |
| | 2-160 | 27,726 | 27,727 | 27,728 | 27,729 | 27,730 | 27,731 | 27,732 | 27,733 | 27,734 | 27,735 | 27,736 | 27,737 | 27,738 |
| | 2-161 | 27,751 | 27,752 | 27,753 | 27,754 | 27,755 | 27,756 | 27,757 | 27,758 | 27,759 | 27,760 | 27,761 | 27,762 | 27,763 |
| | 2-162 | 27,776 | 27,777 | 27,778 | 27,779 | 27,780 | 27,781 | 27,782 | 27,783 | 27,784 | 27,785 | 27,786 | 27,787 | 27,788 |
| | 2-163 | 27,801 | 27,802 | 27,803 | 27,804 | 27,805 | 27,806 | 27,807 | 27,808 | 27,809 | 27,810 | 27,811 | 27,812 | 27,813 |
| | 2-164 | 27,826 | 27,827 | 27,828 | 27,829 | 27,830 | 27,831 | 27,832 | 27,833 | 27,834 | 27,835 | 27,836 | 27,837 | 27,838 |
| | 2-165 | 27,851 | 27,852 | 27,853 | 27,854 | 27,855 | 27,856 | 27,857 | 27,858 | 27,859 | 27,860 | 27,861 | 27,862 | 27,863 |

| | | Compound represented by the formula (1) | | | | | | | | | | | |
|---|---|---|---|---|---|---|---|---|---|---|---|---|---|
| | | 1-64 | 1-65 | 1-66 | 1-67 | 1-68 | 1-69 | 1-70 | 1-71 | 1-72 | 1-73 | 1-74 | 1-75 |
| Compound | 2-111 | 26,514 | 26,515 | 26,516 | 26,517 | 26,518 | 26,519 | 26,520 | 26,521 | 26,522 | 26,523 | 26,524 | 26,525 |
| represented | 2-112 | 26,539 | 26,540 | 26,541 | 26,542 | 26,543 | 26,544 | 26,545 | 26,546 | 26,547 | 26,548 | 26,549 | 26,550 |
| by the | 2-113 | 26,564 | 26,565 | 26,566 | 26,567 | 26,568 | 26,569 | 26,570 | 26,571 | 26,572 | 26,573 | 26,574 | 26,575 |
| formula | 2-114 | 26,589 | 26,590 | 26,591 | 26,592 | 26,593 | 26,594 | 26,595 | 26,596 | 26,597 | 26,598 | 26,599 | 26,600 |
| (2) | 2-115 | 26,614 | 26,615 | 26,616 | 26,617 | 26,618 | 26,619 | 26,620 | 26,621 | 26,622 | 26,623 | 26,624 | 26,625 |
| | 2-116 | 26,639 | 26,640 | 26,641 | 26,642 | 26,643 | 26,644 | 26,645 | 26,646 | 26,647 | 26,648 | 26,649 | 26,650 |

TABLE 21-continued

| | | | | | | | | | | | | |
|---|---|---|---|---|---|---|---|---|---|---|---|---|
| 2-117 | 26,664 | 26,665 | 26,666 | 26,667 | 26,668 | 26,669 | 26,670 | 26,671 | 26,672 | 26,673 | 26,674 | 26,675 |
| 2-118 | 26,689 | 26,690 | 26,691 | 26,692 | 26,693 | 26,694 | 26,695 | 26,696 | 26,697 | 26,698 | 26,699 | 26,700 |
| 2-119 | 26,714 | 26,715 | 26,716 | 26,717 | 26,718 | 26,719 | 26,720 | 26,721 | 26,722 | 26,723 | 26,724 | 26,725 |
| 2-120 | 26,739 | 26,740 | 26,741 | 26,742 | 26,743 | 26,744 | 26,745 | 26,746 | 26,747 | 26,748 | 26,749 | 26,750 |
| 2-121 | 26,764 | 26,765 | 26,766 | 26,767 | 26,768 | 26,769 | 26,770 | 26,771 | 26,772 | 26,773 | 26,774 | 26,775 |
| 2-122 | 26,789 | 26,790 | 26,791 | 26,792 | 26,793 | 26,794 | 26,795 | 26,796 | 26,797 | 26,798 | 26,799 | 26,800 |
| 2-123 | 26,814 | 26,815 | 26,816 | 26,817 | 26,818 | 26,819 | 26,820 | 26,821 | 26,822 | 26,823 | 26,824 | 26,825 |
| 2-124 | 26,839 | 26,840 | 26,841 | 26,842 | 26,843 | 26,844 | 26,845 | 26,846 | 26,847 | 26,848 | 26,849 | 26,850 |
| 2-125 | 26,864 | 26,865 | 26,866 | 26,867 | 26,868 | 26,869 | 26,870 | 26,871 | 26,872 | 26,873 | 26,874 | 26,875 |
| 2-126 | 26,889 | 26,890 | 26,891 | 26,892 | 26,893 | 26,894 | 26,895 | 26,896 | 26,897 | 26,898 | 26,899 | 26,900 |
| 2-127 | 26,914 | 26,915 | 26,916 | 26,917 | 26,918 | 26,919 | 26,920 | 26,921 | 26,922 | 26,923 | 26,924 | 26,925 |
| 2-128 | 26,939 | 26,940 | 26,941 | 26,942 | 26,943 | 26,944 | 26,945 | 26,946 | 26,947 | 26,948 | 26,949 | 26,950 |
| 2-129 | 26,964 | 26,965 | 26,966 | 26,967 | 26,968 | 26,969 | 26,970 | 26,971 | 26,972 | 26,973 | 26,974 | 26,975 |
| 2-130 | 26,989 | 26,990 | 26,991 | 26,992 | 26,993 | 26,994 | 26,995 | 26,996 | 26,997 | 26,998 | 26,999 | 27,000 |
| 2-131 | 27,014 | 27,015 | 27,016 | 27,017 | 27,018 | 27,019 | 27,020 | 27,021 | 27,022 | 27,023 | 27,024 | 27,025 |
| 2-132 | 27,039 | 27,040 | 27,041 | 27,042 | 27,043 | 27,044 | 27,045 | 27,046 | 27,047 | 27,048 | 27,049 | 27,050 |
| 2-133 | 27,064 | 27,065 | 27,066 | 27,067 | 27,068 | 27,069 | 27,070 | 27,071 | 27,072 | 27,073 | 27,074 | 27,075 |
| 2-134 | 27,089 | 27,090 | 27,091 | 27,092 | 27,093 | 27,094 | 27,095 | 27,096 | 27,097 | 27,098 | 27,099 | 27,100 |
| 2-135 | 27,114 | 27,115 | 27,116 | 27,117 | 27,118 | 27,119 | 27,120 | 27,121 | 27,122 | 27,123 | 27,124 | 27,125 |
| 2-136 | 27,139 | 27,140 | 27,141 | 27,142 | 27,143 | 27,144 | 27,145 | 27,146 | 27,147 | 27,148 | 27,149 | 27,150 |
| 2-137 | 27,164 | 27,165 | 27,166 | 27,167 | 27,168 | 27,169 | 27,170 | 27,171 | 27,172 | 27,173 | 27,174 | 27,175 |
| 2-138 | 27,189 | 27,190 | 27,191 | 27,192 | 27,193 | 27,194 | 27,195 | 27,196 | 27,197 | 27,198 | 27,199 | 27,200 |
| 2-139 | 27,214 | 27,215 | 27,216 | 27,217 | 27,218 | 27,219 | 27,220 | 27,221 | 27,222 | 27,223 | 27,224 | 27,225 |
| 2-140 | 27,239 | 27,240 | 27,241 | 27,242 | 27,243 | 27,244 | 27,245 | 27,246 | 27,247 | 27,248 | 27,249 | 27,250 |
| 2-141 | 27,264 | 27,265 | 27,266 | 27,267 | 27,268 | 27,269 | 27,270 | 27,271 | 27,272 | 27,273 | 27,274 | 27,275 |
| 2-142 | 27,289 | 27,290 | 27,291 | 27,292 | 27,293 | 27,294 | 27,295 | 27,296 | 27,297 | 27,298 | 27,299 | 27,300 |
| 2-143 | 27,314 | 27,315 | 27,316 | 27,317 | 27,318 | 27,319 | 27,320 | 27,321 | 27,322 | 27,323 | 27,324 | 27,325 |
| 2-144 | 27,339 | 27,340 | 27,341 | 27,342 | 27,343 | 27,344 | 27,345 | 27,346 | 27,347 | 27,348 | 27,349 | 27,350 |
| 2-145 | 27,364 | 27,365 | 27,366 | 27,367 | 27,368 | 27,369 | 27,370 | 27,371 | 27,372 | 27,373 | 27,374 | 27,375 |
| 2-146 | 27,389 | 27,390 | 27,391 | 27,392 | 27,393 | 27,394 | 27,395 | 27,396 | 27,397 | 27,398 | 27,399 | 27,400 |
| 2-147 | 27,414 | 27,415 | 27,416 | 27,417 | 27,418 | 27,419 | 27,420 | 27,421 | 27,422 | 27,423 | 27,424 | 27,425 |
| 2-148 | 27,439 | 27,440 | 27,441 | 27,442 | 27,443 | 27,444 | 27,445 | 27,446 | 27,447 | 27,448 | 27,449 | 27,450 |
| 2-149 | 27,464 | 27,465 | 27,466 | 27,467 | 27,468 | 27,469 | 27,470 | 27,471 | 27,472 | 27,473 | 27,474 | 27,475 |
| 2-150 | 27,489 | 27,490 | 27,491 | 27,492 | 27,493 | 27,494 | 27,495 | 27,496 | 27,497 | 27,498 | 27,499 | 27,500 |
| 2-151 | 27,514 | 27,515 | 27,516 | 27,517 | 27,518 | 27,519 | 27,520 | 27,521 | 27,522 | 27,523 | 27,524 | 27,525 |
| 2-152 | 27,539 | 27,540 | 27,541 | 27,542 | 27,543 | 27,544 | 27,545 | 27,546 | 27,547 | 27,548 | 27,549 | 27,550 |
| 2-153 | 27,564 | 27,565 | 27,566 | 27,567 | 27,568 | 27,569 | 27,570 | 27,571 | 27,572 | 27,573 | 27,574 | 27,575 |
| 2-154 | 27,589 | 27,590 | 27,591 | 27,592 | 27,593 | 27,594 | 27,595 | 27,596 | 27,597 | 27,598 | 27,599 | 27,600 |
| 2-155 | 27,614 | 27,615 | 27,616 | 27,617 | 27,618 | 27,619 | 27,620 | 27,621 | 27,622 | 27,623 | 27,624 | 27,625 |
| 2-156 | 27,639 | 27,640 | 27,641 | 27,642 | 27,643 | 27,644 | 27,645 | 27,646 | 27,647 | 27,648 | 27,649 | 27,650 |
| 2-157 | 27,664 | 27,665 | 27,666 | 27,667 | 27,668 | 27,669 | 27,670 | 27,671 | 27,672 | 27,673 | 27,674 | 27,675 |
| 2-158 | 27,689 | 27,690 | 27,691 | 27,692 | 27,693 | 27,694 | 27,695 | 27,696 | 27,697 | 27,698 | 27,699 | 27,700 |
| 2-159 | 27,714 | 27,715 | 27,716 | 27,717 | 27,718 | 27,719 | 27,720 | 27,721 | 27,722 | 27,723 | 27,724 | 27,725 |
| 2-160 | 27,739 | 27,740 | 27,741 | 27,742 | 27,743 | 27,744 | 27,745 | 27,746 | 27,747 | 27,748 | 27,749 | 27,750 |
| 2-161 | 27,764 | 27,765 | 27,766 | 27,767 | 27,768 | 27,769 | 27,770 | 27,771 | 27,772 | 27,773 | 27,774 | 27,775 |
| 2-162 | 27,789 | 27,790 | 27,791 | 27,792 | 27,793 | 27,794 | 27,795 | 27,796 | 27,797 | 27,798 | 27,799 | 27,800 |
| 2-163 | 27,814 | 27,815 | 27,816 | 27,817 | 27,818 | 27,819 | 27,820 | 27,821 | 27,822 | 27,823 | 27,824 | 27,825 |
| 2-164 | 27,839 | 27,840 | 27,841 | 27,842 | 27,843 | 27,844 | 27,845 | 27,846 | 27,847 | 27,848 | 27,849 | 27,850 |
| 2-165 | 27,864 | 27,865 | 27,866 | 27,867 | 27,868 | 27,869 | 27,870 | 27,871 | 27,872 | 27,873 | 27,874 | 27,875 |

TABLE 22

| | | Compound represented by the formula (1) | | | | | | | | | | | | |
|---|---|---|---|---|---|---|---|---|---|---|---|---|---|---|
| | | 1-51 | 1-52 | 1-53 | 1-54 | 1-55 | 1-56 | 1-57 | 1-58 | 1-59 | 1-60 | 1-61 | 1-62 | 1-63 |
| Compound represented by the formula (2) | 2-166 | 27,876 | 27,877 | 27,878 | 27,879 | 27,880 | 27,881 | 27,882 | 27,883 | 27,884 | 27,885 | 27,886 | 27,887 | 27,888 |
| | 2-167 | 27,901 | 27,902 | 27,903 | 27,904 | 27,905 | 27,906 | 27,907 | 27,908 | 27,909 | 27,910 | 27,911 | 27,912 | 27,913 |
| | 2-168 | 27,926 | 27,927 | 27,928 | 27,929 | 27,930 | 27,931 | 27,932 | 27,933 | 27,934 | 27,935 | 27,936 | 27,937 | 27,938 |
| | 2-169 | 27,951 | 27,952 | 27,953 | 27,954 | 27,955 | 27,956 | 27,957 | 27,958 | 27,959 | 27,960 | 27,961 | 27,962 | 27,963 |
| | 2-170 | 27,976 | 27,977 | 27,978 | 27,979 | 27,980 | 27,981 | 27,982 | 27,983 | 27,984 | 27,985 | 27,986 | 27,987 | 27,988 |
| | 2-171 | 28,001 | 28,002 | 28,003 | 28,004 | 28,005 | 28,006 | 28,007 | 28,008 | 28,009 | 28,010 | 28,011 | 28,012 | 28,013 |
| | 2-172 | 28,026 | 28,027 | 28,028 | 28,029 | 28,030 | 28,031 | 28,032 | 28,033 | 28,034 | 28,035 | 28,036 | 28,037 | 28,038 |
| | 2-173 | 28,051 | 28,052 | 28,053 | 28,054 | 28,055 | 28,056 | 28,057 | 28,058 | 28,059 | 28,060 | 28,061 | 28,062 | 28,063 |
| | 2-174 | 28,076 | 28,077 | 28,078 | 28,079 | 28,080 | 28,081 | 28,082 | 28,083 | 28,084 | 28,085 | 28,086 | 28,087 | 28,088 |
| | 2-175 | 28,101 | 28,102 | 28,103 | 28,104 | 28,105 | 28,106 | 28,107 | 28,108 | 28,109 | 28,110 | 28,111 | 28,112 | 28,113 |
| | 2-176 | 28,126 | 28,127 | 28,128 | 28,129 | 28,130 | 28,131 | 28,132 | 28,133 | 28,134 | 28,135 | 28,136 | 28,137 | 28,138 |
| | 2-177 | 28,151 | 28,152 | 28,153 | 28,154 | 28,155 | 28,156 | 28,157 | 28,158 | 28,159 | 28,160 | 28,161 | 28,162 | 28,163 |
| | 2-178 | 28,176 | 28,177 | 28,178 | 28,179 | 28,180 | 28,181 | 28,182 | 28,183 | 28,184 | 28,185 | 28,186 | 28,187 | 28,188 |
| | 2-179 | 28,201 | 28,202 | 28,203 | 28,204 | 28,205 | 28,206 | 28,207 | 28,208 | 28,209 | 28,210 | 28,211 | 28,212 | 28,213 |
| | 2-180 | 28,226 | 28,227 | 28,228 | 28,229 | 28,230 | 28,231 | 28,232 | 28,233 | 28,234 | 28,235 | 28,236 | 28,237 | 28,238 |
| | 2-181 | 28,251 | 28,252 | 28,253 | 28,254 | 28,255 | 28,256 | 28,257 | 28,258 | 28,259 | 28,260 | 28,261 | 28,262 | 28,263 |
| | 2-182 | 28,276 | 28,277 | 28,278 | 28,279 | 28,280 | 28,281 | 28,282 | 28,283 | 28,284 | 28,285 | 28,286 | 28,287 | 28,288 |
| | 2-183 | 28,301 | 28,302 | 28,303 | 28,304 | 28,305 | 28,306 | 28,307 | 28,308 | 28,309 | 28,310 | 28,311 | 28,312 | 28,313 |
| | 2-184 | 28,326 | 28,327 | 28,328 | 28,329 | 28,330 | 28,331 | 28,332 | 28,333 | 28,334 | 28,335 | 28,336 | 28,337 | 28,338 |
| | 2-185 | 28,351 | 28,352 | 28,353 | 28,354 | 28,355 | 28,356 | 28,357 | 28,358 | 28,359 | 28,360 | 28,361 | 28,362 | 28,363 |
| | 2-186 | 28,376 | 28,377 | 28,378 | 28,379 | 28,380 | 28,381 | 28,382 | 28,383 | 28,384 | 28,385 | 28,386 | 28,387 | 28,388 |

TABLE 22-continued

| | | | | | | | | | | | | | |
|---|---|---|---|---|---|---|---|---|---|---|---|---|---|
| 2-187 | 28,401 | 28,402 | 28,403 | 28,404 | 28,405 | 28,406 | 28,407 | 28,408 | 28,409 | 28,410 | 28,411 | 28,412 | 28,413 |
| 2-188 | 28,426 | 28,427 | 28,428 | 28,429 | 28,430 | 28,431 | 28,432 | 28,433 | 28,434 | 28,435 | 28,436 | 28,437 | 28,438 |
| 2-189 | 28,451 | 28,452 | 28,453 | 28,454 | 28,455 | 28,456 | 28,457 | 28,458 | 28,459 | 28,460 | 28,461 | 28,462 | 28,463 |
| 2-190 | 28,476 | 28,477 | 28,478 | 28,479 | 28,480 | 28,481 | 28,482 | 28,483 | 28,484 | 28,485 | 28,486 | 28,487 | 28,488 |
| 2-191 | 28,501 | 28,502 | 28,503 | 28,504 | 28,505 | 28,506 | 28,507 | 28,508 | 28,509 | 28,510 | 28,511 | 28,512 | 28,513 |
| 2-192 | 28,526 | 28,527 | 28,528 | 28,529 | 28,530 | 28,531 | 28,532 | 28,533 | 28,534 | 28,535 | 28,536 | 28,537 | 28,538 |
| 2-193 | 28,551 | 28,552 | 28,553 | 28,554 | 28,555 | 28,556 | 28,557 | 28,558 | 28,559 | 28,560 | 28,561 | 28,562 | 28,563 |
| 2-194 | 28,576 | 28,577 | 28,578 | 28,579 | 28,580 | 28,581 | 28,582 | 28,583 | 28,584 | 28,585 | 28,586 | 28,587 | 28,588 |
| 2-195 | 28,601 | 28,602 | 28,603 | 28,604 | 28,605 | 28,606 | 28,607 | 28,608 | 28,609 | 28,610 | 28,611 | 28,612 | 28,613 |
| 2-196 | 28,626 | 28,627 | 28,628 | 28,629 | 28,630 | 28,631 | 28,632 | 28,633 | 28,634 | 28,635 | 28,636 | 28,637 | 28,638 |
| 2-197 | 28,651 | 28,652 | 28,653 | 28,654 | 28,655 | 28,656 | 28,657 | 28,658 | 28,659 | 28,660 | 28,661 | 28,662 | 28,663 |
| 2-198 | 28,676 | 28,677 | 28,678 | 28,679 | 28,680 | 28,681 | 28,682 | 28,683 | 28,684 | 28,685 | 28,686 | 28,687 | 28,688 |
| 2-199 | 28,701 | 28,702 | 28,703 | 28,704 | 28,705 | 28,706 | 28,707 | 28,708 | 28,709 | 28,710 | 28,711 | 28,712 | 28,713 |
| 2-200 | 28,726 | 28,727 | 28,728 | 28,729 | 28,730 | 28,731 | 28,732 | 28,733 | 28,734 | 28,735 | 28,736 | 28,737 | 28,738 |
| 2-201 | 28,751 | 28,752 | 28,753 | 28,754 | 28,755 | 28,756 | 28,757 | 28,758 | 28,759 | 28,760 | 28,761 | 28,762 | 28,763 |
| 2-202 | 28,776 | 28,777 | 28,778 | 28,779 | 28,780 | 28,781 | 28,782 | 28,783 | 28,784 | 28,785 | 28,786 | 28,787 | 28,788 |
| 2-203 | 28,801 | 28,802 | 28,803 | 28,804 | 28,805 | 28,806 | 28,807 | 28,808 | 28,809 | 28,810 | 28,811 | 28,812 | 28,813 |
| 2-204 | 28,826 | 28,827 | 28,828 | 28,829 | 28,830 | 28,831 | 28,832 | 28,833 | 28,834 | 28,835 | 28,836 | 28,837 | 28,838 |
| 2-205 | 28,851 | 28,852 | 28,853 | 28,854 | 28,855 | 28,856 | 28,857 | 28,858 | 28,859 | 28,860 | 28,861 | 28,862 | 28,863 |
| 2-206 | 28,876 | 28,877 | 28,878 | 28,879 | 28,880 | 28,881 | 28,882 | 28,883 | 28,884 | 28,885 | 28,886 | 28,887 | 28,888 |
| 2-207 | 28,901 | 28,902 | 28,903 | 28,904 | 28,905 | 28,906 | 28,907 | 28,908 | 28,909 | 28,910 | 28,911 | 28,912 | 28,913 |
| 2-208 | 28,926 | 28,927 | 28,928 | 28,929 | 28,930 | 28,931 | 28,932 | 28,933 | 28,934 | 28,935 | 28,936 | 28,937 | 28,938 |
| 2-209 | 28,951 | 28,952 | 28,953 | 28,954 | 28,955 | 28,956 | 28,957 | 28,958 | 28,959 | 28,960 | 28,961 | 28,962 | 28,963 |
| 2-210 | 28,976 | 28,977 | 28,978 | 28,979 | 28,980 | 28,981 | 28,982 | 28,983 | 28,984 | 28,985 | 28,986 | 28,987 | 28,988 |
| 2-211 | 29,001 | 29,002 | 29,003 | 29,004 | 29,005 | 29,006 | 29,007 | 29,008 | 29,009 | 29,010 | 29,011 | 29,012 | 29,013 |
| 2-212 | 29,026 | 29,027 | 29,028 | 29,029 | 29,030 | 29,031 | 29,032 | 29,033 | 29,034 | 29,035 | 29,036 | 29,037 | 29,038 |
| 2-213 | 29,051 | 29,052 | 29,053 | 29,054 | 29,055 | 29,056 | 29,057 | 29,058 | 29,059 | 29,060 | 29,061 | 29,062 | 29,063 |
| 2-214 | 29,076 | 29,077 | 29,078 | 29,079 | 29,080 | 29,081 | 29,082 | 29,083 | 29,084 | 29,085 | 29,086 | 29,087 | 29,088 |
| 2-215 | 29,101 | 29,102 | 29,103 | 29,104 | 29,105 | 29,106 | 29,107 | 29,108 | 29,109 | 29,110 | 29,111 | 29,112 | 29,113 |
| 2-216 | 29,126 | 29,127 | 29,128 | 29,129 | 29,130 | 29,131 | 29,132 | 29,133 | 29,134 | 29,135 | 29,136 | 29,137 | 29,138 |
| 2-217 | 29,151 | 29,152 | 29,153 | 29,154 | 29,155 | 29,156 | 29,157 | 29,158 | 29,159 | 29,160 | 29,161 | 29,162 | 29,163 |
| 2-218 | 29,176 | 29,177 | 29,178 | 29,179 | 29,180 | 29,181 | 29,182 | 29,183 | 29,184 | 29,185 | 29,186 | 29,187 | 29,188 |
| 2-219 | 29,201 | 29,202 | 29,203 | 29,204 | 29,205 | 29,206 | 29,207 | 29,208 | 29,209 | 29,210 | 29,211 | 29,212 | 29,213 |
| 2-220 | 29,226 | 29,227 | 29,228 | 29,229 | 29,230 | 29,231 | 29,232 | 29,233 | 29,234 | 29,235 | 29,236 | 29,237 | 29,238 |

| | | Compound represented by the formula (1) | | | | | | | | | | | |
|---|---|---|---|---|---|---|---|---|---|---|---|---|---|
| | | 1-64 | 1-65 | 1-66 | 1-67 | 1-68 | 1-69 | 1-70 | 1-71 | 1-72 | 1-73 | 1-74 | 1-75 |
| Compound represented by the formula (2) | 2-166 | 27,889 | 27,890 | 27,891 | 27,892 | 27,893 | 27,894 | 27,895 | 27,896 | 27,897 | 27,898 | 27,899 | 27,900 |
| | 2-167 | 27,914 | 27,915 | 27,916 | 27,917 | 27,918 | 27,919 | 27,920 | 27,921 | 27,922 | 27,923 | 27,924 | 27,925 |
| | 2-168 | 27,939 | 27,940 | 27,941 | 27,942 | 27,943 | 27,944 | 27,945 | 27,946 | 27,947 | 27,948 | 27,949 | 27,950 |
| | 2-169 | 27,964 | 27,965 | 27,966 | 27,967 | 27,968 | 27,969 | 27,970 | 27,971 | 27,972 | 27,973 | 27,974 | 27,975 |
| | 2-170 | 27,989 | 27,990 | 27,991 | 27,992 | 27,993 | 27,994 | 27,995 | 27,996 | 27,997 | 27,998 | 27,999 | 28,000 |
| | 2-171 | 28,014 | 28,015 | 28,016 | 28,017 | 28,018 | 28,019 | 28,020 | 28,021 | 28,022 | 28,023 | 28,024 | 28,025 |
| | 2-172 | 28,039 | 28,040 | 28,041 | 28,042 | 28,043 | 28,044 | 28,045 | 28,046 | 28,047 | 28,048 | 28,049 | 28,050 |
| | 2-173 | 28,064 | 28,065 | 28,066 | 28,067 | 28,068 | 28,069 | 28,070 | 28,071 | 28,072 | 28,073 | 28,074 | 28,075 |
| | 2-174 | 28,089 | 28,090 | 28,091 | 28,092 | 28,093 | 28,094 | 28,095 | 28,096 | 28,097 | 28,098 | 28,099 | 28,100 |
| | 2-175 | 28,114 | 28,115 | 28,116 | 28,117 | 28,118 | 28,119 | 28,120 | 28,121 | 28,122 | 28,123 | 28,124 | 28,125 |
| | 2-176 | 28,139 | 28,140 | 28,141 | 28,142 | 28,143 | 28,144 | 28,145 | 28,146 | 28,147 | 28,148 | 28,149 | 28,150 |
| | 2-177 | 28,164 | 28,165 | 28,166 | 28,167 | 28,168 | 28,169 | 28,170 | 28,171 | 28,172 | 28,173 | 28,174 | 28,175 |
| | 2-178 | 28,189 | 28,190 | 28,191 | 28,192 | 28,193 | 28,194 | 28,195 | 28,196 | 28,197 | 28,198 | 28,199 | 28,200 |
| | 2-179 | 28,214 | 28,215 | 28,216 | 28,217 | 28,218 | 28,219 | 28,220 | 28,221 | 28,222 | 28,223 | 28,224 | 28,225 |
| | 2-180 | 28,239 | 28,240 | 28,241 | 28,242 | 28,243 | 28,244 | 28,245 | 28,246 | 28,247 | 28,248 | 28,249 | 28,250 |
| | 2-181 | 28,264 | 28,265 | 28,266 | 28,267 | 28,268 | 28,269 | 28,270 | 28,271 | 28,272 | 28,273 | 28,274 | 28,275 |
| | 2-182 | 28,289 | 28,290 | 28,291 | 28,292 | 28,293 | 28,294 | 28,295 | 28,296 | 28,297 | 28,298 | 28,299 | 28,300 |
| | 2-183 | 28,314 | 28,315 | 28,316 | 28,317 | 28,318 | 28,319 | 28,320 | 28,321 | 28,322 | 28,323 | 28,324 | 28,325 |
| | 2-184 | 28,339 | 28,340 | 28,341 | 28,342 | 28,343 | 28,344 | 28,345 | 28,346 | 28,347 | 28,348 | 28,349 | 28,350 |
| | 2-185 | 28,364 | 28,365 | 28,366 | 28,367 | 28,368 | 28,369 | 28,370 | 28,371 | 28,372 | 28,373 | 28,374 | 28,375 |
| | 2-186 | 28,389 | 28,390 | 28,391 | 28,392 | 28,393 | 28,394 | 28,395 | 28,396 | 28,397 | 28,398 | 28,399 | 28,400 |
| | 2-187 | 28,414 | 28,415 | 28,416 | 28,417 | 28,418 | 28,419 | 28,420 | 28,421 | 28,422 | 28,423 | 28,424 | 28,425 |
| | 2-188 | 28,439 | 28,440 | 28,441 | 28,442 | 28,443 | 28,444 | 28,445 | 28,446 | 28,447 | 28,448 | 28,449 | 28,450 |
| | 2-189 | 28,464 | 28,465 | 28,466 | 28,467 | 28,468 | 28,469 | 28,470 | 28,471 | 28,472 | 28,473 | 28,474 | 28,475 |
| | 2-190 | 28,489 | 28,490 | 28,491 | 28,492 | 28,493 | 28,494 | 28,495 | 28,496 | 28,497 | 28,498 | 28,499 | 28,500 |
| | 2-191 | 28,514 | 28,515 | 28,516 | 28,517 | 28,518 | 28,519 | 28,520 | 28,521 | 28,522 | 28,523 | 28,524 | 28,525 |
| | 2-192 | 28,539 | 28,540 | 28,541 | 28,542 | 28,543 | 28,544 | 28,545 | 28,546 | 28,547 | 28,548 | 28,549 | 28,550 |
| | 2-193 | 28,564 | 28,565 | 28,566 | 28,567 | 28,568 | 28,569 | 28,570 | 28,571 | 28,572 | 28,573 | 28,574 | 28,575 |
| | 2-194 | 28,589 | 28,590 | 28,591 | 28,592 | 28,593 | 28,594 | 28,595 | 28,596 | 28,597 | 28,598 | 28,599 | 28,600 |
| | 2-195 | 28,614 | 28,615 | 28,616 | 28,617 | 28,618 | 28,619 | 28,620 | 28,621 | 28,622 | 28,623 | 28,624 | 28,625 |
| | 2-196 | 28,639 | 28,640 | 28,641 | 28,642 | 28,643 | 28,644 | 28,645 | 28,646 | 28,647 | 28,648 | 28,649 | 28,650 |
| | 2-197 | 28,664 | 28,665 | 28,666 | 28,667 | 28,668 | 28,669 | 28,670 | 28,671 | 28,672 | 28,673 | 28,674 | 28,675 |
| | 2-198 | 28,689 | 28,690 | 28,691 | 28,692 | 28,693 | 28,694 | 28,695 | 28,696 | 28,697 | 28,698 | 28,699 | 28,700 |
| | 2-199 | 28,714 | 28,715 | 28,716 | 28,717 | 28,718 | 28,719 | 28,720 | 28,721 | 28,722 | 28,723 | 28,724 | 28,725 |
| | 2-200 | 28,739 | 28,740 | 28,741 | 28,742 | 28,743 | 28,744 | 28,745 | 28,746 | 28,747 | 28,748 | 28,749 | 28,750 |
| | 2-201 | 28,764 | 28,765 | 28,766 | 28,767 | 28,768 | 28,769 | 28,770 | 28,771 | 28,772 | 28,773 | 28,774 | 28,775 |
| | 2-202 | 28,789 | 28,790 | 28,791 | 28,792 | 28,793 | 28,794 | 28,795 | 28,796 | 28,797 | 28,798 | 28,799 | 28,800 |
| | 2-203 | 28,814 | 28,815 | 28,816 | 28,817 | 28,818 | 28,819 | 28,820 | 28,821 | 28,822 | 28,823 | 28,824 | 28,825 |
| | 2-204 | 28,839 | 28,840 | 28,841 | 28,842 | 28,843 | 28,844 | 28,845 | 28,846 | 28,847 | 28,848 | 28,849 | 28,850 |
| | 2-205 | 28,864 | 28,865 | 28,866 | 28,867 | 28,868 | 28,869 | 28,870 | 28,871 | 28,872 | 28,873 | 28,874 | 28,875 |
| | 2-206 | 28,889 | 28,890 | 28,891 | 28,892 | 28,893 | 28,894 | 28,895 | 28,896 | 28,897 | 28,898 | 28,899 | 28,900 |

TABLE 22-continued

| | | | | | | | | | | | | | | |
|---|---|---|---|---|---|---|---|---|---|---|---|---|---|---|
| | 2-207 | 28,914 | 28,915 | 28,916 | 28,917 | 28,918 | 28,919 | 28,920 | 28,921 | 28,922 | 28,923 | 28,924 | 28,925 |
| | 2-208 | 28,939 | 28,940 | 28,941 | 28,942 | 28,943 | 28,944 | 28,945 | 28,946 | 28,947 | 28,948 | 28,949 | 28,950 |
| | 2-209 | 28,964 | 28,965 | 28,966 | 28,967 | 28,968 | 28,969 | 28,970 | 28,971 | 28,972 | 28,973 | 28,974 | 28,975 |
| | 2-210 | 28,989 | 28,990 | 28,991 | 28,992 | 28,993 | 28,994 | 28,995 | 28,996 | 28,997 | 28,998 | 28,999 | 29,000 |
| | 2-211 | 29,014 | 29,015 | 29,016 | 29,017 | 29,018 | 29,019 | 29,020 | 29,021 | 29,022 | 29,023 | 29,024 | 29,025 |
| | 2-212 | 29,039 | 29,040 | 29,041 | 29,042 | 29,043 | 29,044 | 29,045 | 29,046 | 29,047 | 29,048 | 29,049 | 29,050 |
| | 2-213 | 29,064 | 29,065 | 29,066 | 29,067 | 29,068 | 29,069 | 29,070 | 29,071 | 29,072 | 29,073 | 29,074 | 29,075 |
| | 2-214 | 29,089 | 29,090 | 29,091 | 29,092 | 29,093 | 29,094 | 29,095 | 29,096 | 29,097 | 29,098 | 29,099 | 29,100 |
| | 2-215 | 29,114 | 29,115 | 29,116 | 29,117 | 29,118 | 29,119 | 29,120 | 29,121 | 29,122 | 29,123 | 29,124 | 29,125 |
| | 2-216 | 29,139 | 29,140 | 29,141 | 29,142 | 29,143 | 29,144 | 29,145 | 29,146 | 29,147 | 29,148 | 29,149 | 29,150 |
| | 2-217 | 29,164 | 29,165 | 29,166 | 29,167 | 29,168 | 29,169 | 29,170 | 29,171 | 29,172 | 29,173 | 29,174 | 29,175 |
| | 2-218 | 29,189 | 29,190 | 29,191 | 29,192 | 29,193 | 29,194 | 29,195 | 29,196 | 29,197 | 29,198 | 29,199 | 29,200 |
| | 2-219 | 29,214 | 29,215 | 29,216 | 29,217 | 29,218 | 29,219 | 29,220 | 29,221 | 29,222 | 29,223 | 29,224 | 29,225 |
| | 2-220 | 29,239 | 29,240 | 29,241 | 29,242 | 29,243 | 29,244 | 29,245 | 29,246 | 29,247 | 29,248 | 29,249 | 29,250 |

TABLE 23

| | | Compound represented by the formula (1) | | | | | | | | | | | | |
|---|---|---|---|---|---|---|---|---|---|---|---|---|---|---|
| | | 1-51 | 1-52 | 1-53 | 1-54 | 1-55 | 1-56 | 1-57 | 1-58 | 1-59 | 1-60 | 1-61 | 1-62 | 1-63 |
| Compound represented by the formula (2) | 2-221 | 29,251 | 29,252 | 29,253 | 29,254 | 29,255 | 29,256 | 29,257 | 29,258 | 29,259 | 29,260 | 29,261 | 29,262 | 29,263 |
| | 2-222 | 29,276 | 29,277 | 29,278 | 29,279 | 29,280 | 29,281 | 29,282 | 29,283 | 29,284 | 29,285 | 29,286 | 29,287 | 29,288 |
| | 2-223 | 29,301 | 29,302 | 29,303 | 29,304 | 29,305 | 29,306 | 29,307 | 29,308 | 29,309 | 29,310 | 29,311 | 29,312 | 29,313 |
| | 2-224 | 29,326 | 29,327 | 29,328 | 29,329 | 29,330 | 29,331 | 29,332 | 29,333 | 29,334 | 29,335 | 29,336 | 29,337 | 29,338 |
| | 2-225 | 29,351 | 29,352 | 29,353 | 29,354 | 29,355 | 29,356 | 29,357 | 29,358 | 29,359 | 29,360 | 29,361 | 29,362 | 29,363 |
| | 2-226 | 29,376 | 29,377 | 29,378 | 29,379 | 29,380 | 29,381 | 29,382 | 29,383 | 29,384 | 29,385 | 29,386 | 29,387 | 29,388 |
| | 2-227 | 29,401 | 29,402 | 29,403 | 29,404 | 29,405 | 29,406 | 29,407 | 29,408 | 29,409 | 29,410 | 29,411 | 29,412 | 29,413 |
| | 2-228 | 29,426 | 29,427 | 29,428 | 29,429 | 29,430 | 29,431 | 29,432 | 29,433 | 29,434 | 29,435 | 29,436 | 29,437 | 29,438 |
| | 2-229 | 29,451 | 29,452 | 29,453 | 29,454 | 29,455 | 29,456 | 29,457 | 29,458 | 29,459 | 29,460 | 29,461 | 29,462 | 29,463 |
| | 2-230 | 29,476 | 29,477 | 29,478 | 29,479 | 29,480 | 29,481 | 29,482 | 29,483 | 29,484 | 29,485 | 29,486 | 29,487 | 29,488 |
| | 2-231 | 29,501 | 29,502 | 29,503 | 29,504 | 29,505 | 29,506 | 29,507 | 29,508 | 29,509 | 29,510 | 29,511 | 29,512 | 29,513 |
| | 2-232 | 29,526 | 29,527 | 29,528 | 29,529 | 29,530 | 29,531 | 29,532 | 29,533 | 29,534 | 29,535 | 29,536 | 29,537 | 29,538 |
| | 2-233 | 29,551 | 29,552 | 29,553 | 29,554 | 29,555 | 29,556 | 29,557 | 29,558 | 29,559 | 29,560 | 29,561 | 29,562 | 29,563 |
| | 2-234 | 29,576 | 29,577 | 29,578 | 29,579 | 29,580 | 29,581 | 29,582 | 29,583 | 29,584 | 29,585 | 29,586 | 29,587 | 29,588 |
| | 2-235 | 29,601 | 29,602 | 29,603 | 29,604 | 29,605 | 29,606 | 29,607 | 29,608 | 29,609 | 29,610 | 29,611 | 29,612 | 29,613 |
| | 2-236 | 29,626 | 29,627 | 29,628 | 29,629 | 29,630 | 29,631 | 29,632 | 29,633 | 29,634 | 29,635 | 29,636 | 29,637 | 29,638 |
| | 2-237 | 29,651 | 29,652 | 29,653 | 29,654 | 29,655 | 29,656 | 29,657 | 29,658 | 29,659 | 29,660 | 29,661 | 29,662 | 29,663 |
| | 2-238 | 29,676 | 29,677 | 29,678 | 29,679 | 29,680 | 29,681 | 29,682 | 29,683 | 29,684 | 29,685 | 29,686 | 29,687 | 29,688 |
| | 2-239 | 29,701 | 29,702 | 29,703 | 29,704 | 29,705 | 29,706 | 29,707 | 29,708 | 29,709 | 29,710 | 29,711 | 29,712 | 29,713 |
| | 2-240 | 29,726 | 29,727 | 29,728 | 29,729 | 29,730 | 29,731 | 29,732 | 29,733 | 29,734 | 29,735 | 29,736 | 29,737 | 29,738 |
| | 2-241 | 29,751 | 29,752 | 29,753 | 29,754 | 29,755 | 29,756 | 29,757 | 29,758 | 29,759 | 29,760 | 29,761 | 29,762 | 29,763 |
| | 2-242 | 29,776 | 29,777 | 29,778 | 29,779 | 29,780 | 29,781 | 29,782 | 29,783 | 29,784 | 29,785 | 29,786 | 29,787 | 29,788 |
| | 2-243 | 29,801 | 29,802 | 29,803 | 29,804 | 29,805 | 29,806 | 29,807 | 29,808 | 29,809 | 29,810 | 29,811 | 29,812 | 29,813 |
| | 2-244 | 29,826 | 29,827 | 29,828 | 29,829 | 29,830 | 29,831 | 29,832 | 29,833 | 29,834 | 29,835 | 29,836 | 29,837 | 29,838 |
| | 2-245 | 29,851 | 29,852 | 29,853 | 29,854 | 29,855 | 29,856 | 29,857 | 29,858 | 29,859 | 29,860 | 29,861 | 29,862 | 29,863 |
| | 2-246 | 29,876 | 29,877 | 29,878 | 29,879 | 29,880 | 29,881 | 29,882 | 29,883 | 29,884 | 29,885 | 29,886 | 29,887 | 29,888 |
| | 2-247 | 29,901 | 29,902 | 29,903 | 29,904 | 29,905 | 29,906 | 29,907 | 29,908 | 29,909 | 29,910 | 29,911 | 29,912 | 29,913 |
| | 2-248 | 29,926 | 29,927 | 29,928 | 29,929 | 29,930 | 29,931 | 29,932 | 29,933 | 29,934 | 29,935 | 29,936 | 29,937 | 29,938 |
| | 2-249 | 29,951 | 29,952 | 29,953 | 29,954 | 29,955 | 29,956 | 29,957 | 29,958 | 29,959 | 29,960 | 29,961 | 29,962 | 29,963 |
| | 2-250 | 29,976 | 29,977 | 29,978 | 29,979 | 29,980 | 29,981 | 29,982 | 29,983 | 29,984 | 29,985 | 29,986 | 29,987 | 29,988 |
| | 2-251 | 30,001 | 30,002 | 30,003 | 30,004 | 30,005 | 30,006 | 30,007 | 30,008 | 30,009 | 30,010 | 30,011 | 30,012 | 30,013 |
| | 2-252 | 30,026 | 30,027 | 30,028 | 30,029 | 30,030 | 30,031 | 30,032 | 30,033 | 30,034 | 30,035 | 30,036 | 30,037 | 30,038 |
| | 2-253 | 30,051 | 30,052 | 30,053 | 30,054 | 30,055 | 30,056 | 30,057 | 30,058 | 30,059 | 30,060 | 30,061 | 30,062 | 30,063 |
| | 2-254 | 30,076 | 30,077 | 30,078 | 30,079 | 30,080 | 30,081 | 30,082 | 30,083 | 30,084 | 30,085 | 30,086 | 30,087 | 30,088 |
| | 2-255 | 30,101 | 30,102 | 30,103 | 30,104 | 30,105 | 30,106 | 30,107 | 30,108 | 30,109 | 30,110 | 30,111 | 30,112 | 30,113 |
| | 2-256 | 30,126 | 30,127 | 30,128 | 30,129 | 30,130 | 30,131 | 30,132 | 30,133 | 30,134 | 30,135 | 30,136 | 30,137 | 30,138 |
| | 2-257 | 30,151 | 30,152 | 30,153 | 30,154 | 30,155 | 30,156 | 30,157 | 30,158 | 30,159 | 30,160 | 30,161 | 30,162 | 30,163 |
| | 2-258 | 30,176 | 30,177 | 30,178 | 30,179 | 30,180 | 30,181 | 30,182 | 30,183 | 30,184 | 30,185 | 30,186 | 30,187 | 30,188 |
| | 2-259 | 30,201 | 30,202 | 30,203 | 30,204 | 30,205 | 30,206 | 30,207 | 30,208 | 30,209 | 30,210 | 30,211 | 30,212 | 30,213 |
| | 2-260 | 30,226 | 30,227 | 30,228 | 30,229 | 30,230 | 30,231 | 30,232 | 30,233 | 30,234 | 30,235 | 30,236 | 30,237 | 30,238 |
| | 2-261 | 30,251 | 30,252 | 30,253 | 30,254 | 30,255 | 30,256 | 30,257 | 30,258 | 30,259 | 30,260 | 30,261 | 30,262 | 30,263 |
| | 2-262 | 30,276 | 30,277 | 30,278 | 30,279 | 30,280 | 30,281 | 30,282 | 30,283 | 30,284 | 30,285 | 30,286 | 30,287 | 30,288 |
| | 2-263 | 30,301 | 30,302 | 30,303 | 30,304 | 30,305 | 30,306 | 30,307 | 30,308 | 30,309 | 30,310 | 30,311 | 30,312 | 30,313 |
| | 2-264 | 30,326 | 30,327 | 30,328 | 30,329 | 30,330 | 30,331 | 30,332 | 30,333 | 30,334 | 30,335 | 30,336 | 30,337 | 30,338 |
| | 2-265 | 30,351 | 30,352 | 30,353 | 30,354 | 30,355 | 30,356 | 30,357 | 30,358 | 30,359 | 30,360 | 30,361 | 30,362 | 30,363 |
| | 2-266 | 30,376 | 30,377 | 30,378 | 30,379 | 30,380 | 30,381 | 30,382 | 30,383 | 30,384 | 30,385 | 30,386 | 30,387 | 30,388 |
| | 2-267 | 30,401 | 30,402 | 30,403 | 30,404 | 30,405 | 30,406 | 30,407 | 30,408 | 30,409 | 30,410 | 30,411 | 30,412 | 30,413 |
| | 2-268 | 30,426 | 30,427 | 30,428 | 30,429 | 30,430 | 30,431 | 30,432 | 30,433 | 30,434 | 30,435 | 30,436 | 30,437 | 30,438 |
| | 2-269 | 30,451 | 30,452 | 30,453 | 30,454 | 30,455 | 30,456 | 30,457 | 30,458 | 30,459 | 30,460 | 30,461 | 30,462 | 30,463 |
| | 2-270 | 30,476 | 30,477 | 30,478 | 30,479 | 30,480 | 30,481 | 30,482 | 30,483 | 30,484 | 30,485 | 30,486 | 30,487 | 30,488 |
| | 2-271 | 30,501 | 30,502 | 30,503 | 30,504 | 30,505 | 30,506 | 30,507 | 30,508 | 30,509 | 30,510 | 30,511 | 30,512 | 30,513 |
| | 2-272 | 30,526 | 30,527 | 30,528 | 30,529 | 30,530 | 30,531 | 30,532 | 30,533 | 30,534 | 30,535 | 30,536 | 30,537 | 30,538 |
| | 2-273 | 30,551 | 30,552 | 30,553 | 30,554 | 30,555 | 30,556 | 30,557 | 30,558 | 30,559 | 30,560 | 30,561 | 30,562 | 30,563 |
| | 2-274 | 30,576 | 30,577 | 30,578 | 30,579 | 30,580 | 30,581 | 30,582 | 30,583 | 30,584 | 30,585 | 30,586 | 30,587 | 30,588 |
| | 2-275 | 30,601 | 30,602 | 30,603 | 30,604 | 30,605 | 30,606 | 30,607 | 30,608 | 30,609 | 30,610 | 30,611 | 30,612 | 30,613 |

TABLE 23-continued

| | | Compound represented by the formula (1) | | | | | | | | | | | |
|---|---|---|---|---|---|---|---|---|---|---|---|---|---|
| | | 1-64 | 1-65 | 1-66 | 1-67 | 1-68 | 1-69 | 1-70 | 1-71 | 1-72 | 1-73 | 1-74 | 1-75 |
| Compound | 2-221 | 29,264 | 29,265 | 29,266 | 29,267 | 29,268 | 29,269 | 29,270 | 29,271 | 29,272 | 29,273 | 29,274 | 29,275 |
| represented | 2-222 | 29,289 | 29,290 | 29,291 | 29,292 | 29,293 | 29,294 | 29,295 | 29,296 | 29,297 | 29,298 | 29,299 | 29,300 |
| by the | 2-223 | 29,314 | 29,315 | 29,316 | 29,317 | 29,318 | 29,319 | 29,320 | 29,321 | 29,322 | 29,323 | 29,324 | 29,325 |
| formula | 2-224 | 29,339 | 29,340 | 29,341 | 29,342 | 29,343 | 29,344 | 29,345 | 29,346 | 29,347 | 29,348 | 29,349 | 29,350 |
| (2) | 2-225 | 29,364 | 29,365 | 29,366 | 29,367 | 29,368 | 29,369 | 29,370 | 29,371 | 29,372 | 29,373 | 29,374 | 29,375 |
| | 2-226 | 29,389 | 29,390 | 29,391 | 29,392 | 29,393 | 29,394 | 29,395 | 29,396 | 29,397 | 29,398 | 29,399 | 29,400 |
| | 2-227 | 29,414 | 29,415 | 29,416 | 29,417 | 29,418 | 29,419 | 29,420 | 29,421 | 29,422 | 29,423 | 29,424 | 29,425 |
| | 2-228 | 29,439 | 29,440 | 29,441 | 29,442 | 29,443 | 29,444 | 29,445 | 29,446 | 29,447 | 29,448 | 29,449 | 29,450 |
| | 2-229 | 29,464 | 29,465 | 29,466 | 29,467 | 29,468 | 29,469 | 29,470 | 29,471 | 29,472 | 29,473 | 29,474 | 29,475 |
| | 2-230 | 29,489 | 29,490 | 29,491 | 29,492 | 29,493 | 29,494 | 29,495 | 29,496 | 29,497 | 29,498 | 29,499 | 29,500 |
| | 2-231 | 29,514 | 29,515 | 29,516 | 29,517 | 29,518 | 29,519 | 29,520 | 29,521 | 29,522 | 29,523 | 29,524 | 29,525 |
| | 2-232 | 29,539 | 29,540 | 29,541 | 29,542 | 29,543 | 29,544 | 29,545 | 29,546 | 29,547 | 29,548 | 29,549 | 29,550 |
| | 2-233 | 29,564 | 29,565 | 29,566 | 29,567 | 29,568 | 29,569 | 29,570 | 29,571 | 29,572 | 29,573 | 29,574 | 29,575 |
| | 2-234 | 29,589 | 29,590 | 29,591 | 29,592 | 29,593 | 29,594 | 29,595 | 29,596 | 29,597 | 29,598 | 29,599 | 29,600 |
| | 2-235 | 29,614 | 29,615 | 29,616 | 29,617 | 29,618 | 29,619 | 29,620 | 29,621 | 29,622 | 29,623 | 29,624 | 29,625 |
| | 2-236 | 29,639 | 29,640 | 29,641 | 29,642 | 29,643 | 29,644 | 29,645 | 29,646 | 29,647 | 29,648 | 29,649 | 29,650 |
| | 2-237 | 29,664 | 29,665 | 29,666 | 29,667 | 29,668 | 29,669 | 29,670 | 29,671 | 29,672 | 29,673 | 29,674 | 29,675 |
| | 2-238 | 29,689 | 29,690 | 29,691 | 29,692 | 29,693 | 29,694 | 29,695 | 29,696 | 29,697 | 29,698 | 29,699 | 29,700 |
| | 2-239 | 29,714 | 29,715 | 29,716 | 29,717 | 29,718 | 29,719 | 29,720 | 29,721 | 29,722 | 29,723 | 29,724 | 29,725 |
| | 2-240 | 29,739 | 29,740 | 29,741 | 29,742 | 29,743 | 29,744 | 29,745 | 29,746 | 29,747 | 29,748 | 29,749 | 29,750 |
| | 2-241 | 29,764 | 29,765 | 29,766 | 29,767 | 29,768 | 29,769 | 29,770 | 29,771 | 29,772 | 29,773 | 29,774 | 29,775 |
| | 2-242 | 29,789 | 29,790 | 29,791 | 29,792 | 29,793 | 29,794 | 29,795 | 29,796 | 29,797 | 29,798 | 29,799 | 29,800 |
| | 2-243 | 29,814 | 29,815 | 29,816 | 29,817 | 29,818 | 29,819 | 29,820 | 29,821 | 29,822 | 29,823 | 29,824 | 29,825 |
| | 2-244 | 29,839 | 29,840 | 29,841 | 29,842 | 29,843 | 29,844 | 29,845 | 29,846 | 29,847 | 29,848 | 29,849 | 29,850 |
| | 2-245 | 29,864 | 29,865 | 29,866 | 29,867 | 29,868 | 29,869 | 29,870 | 29,871 | 29,872 | 29,873 | 29,874 | 29,875 |
| | 2-246 | 29,889 | 29,890 | 29,891 | 29,892 | 29,893 | 29,894 | 29,895 | 29,896 | 29,897 | 29,898 | 29,899 | 29,900 |
| | 2-247 | 29,914 | 29,915 | 29,916 | 29,917 | 29,918 | 29,919 | 29,920 | 29,921 | 29,922 | 29,923 | 29,924 | 29,925 |
| | 2-248 | 29,939 | 29,940 | 29,941 | 29,942 | 29,943 | 29,944 | 29,945 | 29,946 | 29,947 | 29,948 | 29,949 | 29,950 |
| | 2-249 | 29,964 | 29,965 | 29,966 | 29,967 | 29,968 | 29,969 | 29,970 | 29,971 | 29,972 | 29,973 | 29,974 | 29,975 |
| | 2-250 | 29,989 | 29,990 | 29,991 | 29,992 | 29,993 | 29,994 | 29,995 | 29,996 | 29,997 | 29,998 | 29,999 | 30,000 |
| | 2-251 | 30,014 | 30,015 | 30,016 | 30,017 | 30,018 | 30,019 | 30,020 | 30,021 | 30,022 | 30,023 | 30,024 | 30,025 |
| | 2-252 | 30,039 | 30,040 | 30,041 | 30,042 | 30,043 | 30,044 | 30,045 | 30,046 | 30,047 | 30,048 | 30,049 | 30,050 |
| | 2-253 | 30,064 | 30,065 | 30,066 | 30,067 | 30,068 | 30,069 | 30,070 | 30,071 | 30,072 | 30,073 | 30,074 | 30,075 |
| | 2-254 | 30,089 | 30,090 | 30,091 | 30,092 | 30,093 | 30,094 | 30,095 | 30,096 | 30,097 | 30,098 | 30,099 | 30,100 |
| | 2-255 | 30,114 | 30,115 | 30,116 | 30,117 | 30,118 | 30,119 | 30,120 | 30,121 | 30,122 | 30,123 | 30,124 | 30,125 |
| | 2-256 | 30,139 | 30,140 | 30,141 | 30,142 | 30,143 | 30,144 | 30,145 | 30,146 | 30,147 | 30,148 | 30,149 | 30,150 |
| | 2-257 | 30,164 | 30,165 | 30,166 | 30,167 | 30,168 | 30,169 | 30,170 | 30,171 | 30,172 | 30,173 | 30,174 | 30,175 |
| | 2-258 | 30,189 | 30,190 | 30,191 | 30,192 | 30,193 | 30,194 | 30,195 | 30,196 | 30,197 | 30,198 | 30,199 | 30,200 |
| | 2-259 | 30,214 | 30,215 | 30,216 | 30,217 | 30,218 | 30,219 | 30,220 | 30,221 | 30,222 | 30,223 | 30,224 | 30,225 |
| | 2-260 | 30,239 | 30,240 | 30,241 | 30,242 | 30,243 | 30,244 | 30,245 | 30,246 | 30,247 | 30,248 | 30,249 | 30,250 |
| | 2-261 | 30,264 | 30,265 | 30,266 | 30,267 | 30,268 | 30,269 | 30,270 | 30,271 | 30,272 | 30,273 | 30,274 | 30,275 |
| | 2-262 | 30,289 | 30,290 | 30,291 | 30,292 | 30,293 | 30,294 | 30,295 | 30,296 | 30,297 | 30,298 | 30,299 | 30,300 |
| | 2-263 | 30,314 | 30,315 | 30,316 | 30,317 | 30,318 | 30,319 | 30,320 | 30,321 | 30,322 | 30,323 | 30,324 | 30,325 |
| | 2-264 | 30,339 | 30,340 | 30,341 | 30,342 | 30,343 | 30,344 | 30,345 | 30,346 | 30,347 | 30,348 | 30,349 | 30,350 |
| | 2-265 | 30,364 | 30,365 | 30,366 | 30,367 | 30,368 | 30,369 | 30,370 | 30,371 | 30,372 | 30,373 | 30,374 | 30,375 |
| | 2-266 | 30,389 | 30,390 | 30,391 | 30,392 | 30,393 | 30,394 | 30,395 | 30,396 | 30,397 | 30,398 | 30,399 | 30,400 |
| | 2-267 | 30,414 | 30,415 | 30,416 | 30,417 | 30,418 | 30,419 | 30,420 | 30,421 | 30,422 | 30,423 | 30,424 | 30,425 |
| | 2-268 | 30,439 | 30,440 | 30,441 | 30,442 | 30,443 | 30,444 | 30,445 | 30,446 | 30,447 | 30,448 | 30,449 | 30,450 |
| | 2-269 | 30,464 | 30,465 | 30,466 | 30,467 | 30,468 | 30,469 | 30,470 | 30,471 | 30,472 | 30,473 | 30,474 | 30,475 |
| | 2-270 | 30,489 | 30,490 | 30,491 | 30,492 | 30,493 | 30,494 | 30,495 | 30,496 | 30,497 | 30,498 | 30,499 | 30,500 |
| | 2-271 | 30,514 | 30,515 | 30,516 | 30,517 | 30,518 | 30,519 | 30,520 | 30,521 | 30,522 | 30,523 | 30,524 | 30,525 |
| | 2-272 | 30,539 | 30,540 | 30,541 | 30,542 | 30,543 | 30,544 | 30,545 | 30,546 | 30,547 | 30,548 | 30,549 | 30,550 |
| | 2-273 | 30,564 | 30,565 | 30,566 | 30,567 | 30,568 | 30,569 | 30,570 | 30,571 | 30,572 | 30,573 | 30,574 | 30,575 |
| | 2-274 | 30,589 | 30,590 | 30,591 | 30,592 | 30,593 | 30,594 | 30,595 | 30,596 | 30,597 | 30,598 | 30,599 | 30,600 |
| | 2-275 | 30,614 | 30,615 | 30,616 | 30,617 | 30,618 | 30,619 | 30,620 | 30,621 | 30,622 | 30,623 | 30,624 | 30,625 |

TABLE 24

| | | Compound represented by the formula (1) | | | | | | | | | | | | |
|---|---|---|---|---|---|---|---|---|---|---|---|---|---|---|
| | | 1-51 | 1-52 | 1-53 | 1-54 | 1-55 | 1-56 | 1-57 | 1-58 | 1-59 | 1-60 | 1-61 | 1-62 | 1-63 |
| Compound | 2-276 | 30,626 | 30,627 | 30,628 | 30,629 | 30,630 | 30,631 | 30,632 | 30,633 | 30,634 | 30,635 | 30,636 | 30,637 | 30,638 |
| represented | 2-277 | 30,651 | 30,652 | 30,653 | 30,654 | 30,655 | 30,656 | 30,657 | 30,658 | 30,659 | 30,660 | 30,661 | 30,662 | 30,663 |
| by the | 2-278 | 30,676 | 30,677 | 30,678 | 30,679 | 30,680 | 30,681 | 30,682 | 30,683 | 30,684 | 30,685 | 30,686 | 30,687 | 30,688 |
| formula | 2-279 | 30,701 | 30,702 | 30,703 | 30,704 | 30,705 | 30,706 | 30,707 | 30,708 | 30,709 | 30,710 | 30,711 | 30,712 | 30,713 |
| (2) | 2-280 | 30,726 | 30,727 | 30,728 | 30,729 | 30,730 | 30,731 | 30,732 | 30,733 | 30,734 | 30,735 | 30,736 | 30,737 | 30,738 |
| | 2-281 | 30,751 | 30,752 | 30,753 | 30,754 | 30,755 | 30,756 | 30,757 | 30,758 | 30,759 | 30,760 | 30,761 | 30,762 | 30,763 |
| | 2-282 | 30,776 | 30,777 | 30,778 | 30,779 | 30,780 | 30,781 | 30,782 | 30,783 | 30,784 | 30,785 | 30,786 | 30,787 | 30,788 |
| | 2-283 | 30,801 | 30,802 | 30,803 | 30,804 | 30,805 | 30,806 | 30,807 | 30,808 | 30,809 | 30,810 | 30,811 | 30,812 | 30,813 |
| | 2-284 | 30,826 | 30,827 | 30,828 | 30,829 | 30,830 | 30,831 | 30,832 | 30,833 | 30,834 | 30,835 | 30,836 | 30,837 | 30,838 |
| | 2-285 | 30,851 | 30,852 | 30,853 | 30,854 | 30,855 | 30,856 | 30,857 | 30,858 | 30,859 | 30,860 | 30,861 | 30,862 | 30,863 |
| | 2-286 | 30,876 | 30,877 | 30,878 | 30,879 | 30,880 | 30,881 | 30,882 | 30,883 | 30,884 | 30,885 | 30,886 | 30,887 | 30,888 |

TABLE 24-continued

| | | | | | | | | | | | | | |
|---|---|---|---|---|---|---|---|---|---|---|---|---|---|
| 2-287 | 30,901 | 30,902 | 30,903 | 30,904 | 30,905 | 30,906 | 30,907 | 30,908 | 30,909 | 30,910 | 30,911 | 30,912 | 30,913 |
| 2-288 | 30,926 | 30,927 | 30,928 | 30,929 | 30,930 | 30,931 | 30,932 | 30,933 | 30,934 | 30,935 | 30,936 | 30,937 | 30,938 |
| 2-289 | 30,951 | 30,952 | 30,953 | 30,954 | 30,955 | 30,956 | 30,957 | 30,958 | 30,959 | 30,960 | 30,961 | 30,962 | 30,963 |
| 2-290 | 30,976 | 30,977 | 30,978 | 30,979 | 30,980 | 30,981 | 30,982 | 30,983 | 30,984 | 30,985 | 30,986 | 30,987 | 30,988 |
| 2-291 | 31,001 | 31,002 | 31,003 | 31,004 | 31,005 | 31,006 | 31,007 | 31,008 | 31,009 | 31,010 | 31,011 | 31,012 | 31,013 |
| 2-292 | 31,026 | 31,027 | 31,028 | 31,029 | 31,030 | 31,031 | 31,032 | 31,033 | 31,034 | 31,035 | 31,036 | 31,037 | 31,038 |
| 2-293 | 31,051 | 31,052 | 31,053 | 31,054 | 31,055 | 31,056 | 31,057 | 31,058 | 31,059 | 31,060 | 31,061 | 31,062 | 31,063 |
| 2-294 | 31,076 | 31,077 | 31,078 | 31,079 | 31,080 | 31,081 | 31,082 | 31,083 | 31,084 | 31,085 | 31,086 | 31,087 | 31,088 |
| 2-295 | 31,101 | 31,102 | 31,103 | 31,104 | 31,105 | 31,106 | 31,107 | 31,108 | 31,109 | 31,110 | 31,111 | 31,112 | 31,113 |
| 2-296 | 31,126 | 31,127 | 31,128 | 31,129 | 31,130 | 31,131 | 31,132 | 31,133 | 31,134 | 31,135 | 31,136 | 31,137 | 31,138 |
| 2-297 | 31,151 | 31,152 | 31,153 | 31,154 | 31,155 | 31,156 | 31,157 | 31,158 | 31,159 | 31,160 | 31,161 | 31,162 | 31,163 |
| 2-298 | 31,176 | 31,177 | 31,178 | 31,179 | 31,180 | 31,181 | 31,182 | 31,183 | 31,184 | 31,185 | 31,186 | 31,187 | 31,188 |
| 2-299 | 31,201 | 31,202 | 31,203 | 31,204 | 31,205 | 31,206 | 31,207 | 31,208 | 31,209 | 31,210 | 31,211 | 31,212 | 31,213 |
| 2-300 | 31,226 | 31,227 | 31,228 | 31,229 | 31,230 | 31,231 | 31,232 | 31,233 | 31,234 | 31,235 | 31,236 | 31,237 | 31,238 |
| 2-301 | 31,251 | 31,252 | 31,253 | 31,254 | 31,255 | 31,256 | 31,257 | 31,258 | 31,259 | 31,260 | 31,261 | 31,262 | 31,263 |
| 2-302 | 31,276 | 31,277 | 31,278 | 31,279 | 31,280 | 31,281 | 31,282 | 31,283 | 31,284 | 31,285 | 31,286 | 31,287 | 31,288 |
| 2-303 | 31,301 | 31,302 | 31,303 | 31,304 | 31,305 | 31,306 | 31,307 | 31,308 | 31,309 | 31,310 | 31,311 | 31,312 | 31,313 |
| 2-304 | 31,326 | 31,327 | 31,328 | 31,329 | 31,330 | 31,331 | 31,332 | 31,333 | 31,334 | 31,335 | 31,336 | 31,337 | 31,338 |
| 2-305 | 31,351 | 31,352 | 31,353 | 31,354 | 31,355 | 31,356 | 31,357 | 31,358 | 31,359 | 31,360 | 31,361 | 31,362 | 31,363 |
| 2-306 | 31,376 | 31,377 | 31,378 | 31,379 | 31,380 | 31,381 | 31,382 | 31,383 | 31,384 | 31,385 | 31,386 | 31,387 | 31,388 |
| 2-307 | 31,401 | 31,402 | 31,403 | 31,404 | 31,405 | 31,406 | 31,407 | 31,408 | 31,409 | 31,410 | 31,411 | 31,412 | 31,413 |
| 2-308 | 31,426 | 31,427 | 31,428 | 31,429 | 31,430 | 31,431 | 31,432 | 31,433 | 31,434 | 31,435 | 31,436 | 31,437 | 31,438 |
| 2-309 | 31,451 | 31,452 | 31,453 | 31,454 | 31,455 | 31,456 | 31,457 | 31,458 | 31,459 | 31,460 | 31,461 | 31,462 | 31,463 |
| 2-310 | 31,476 | 31,477 | 31,478 | 31,479 | 31,480 | 31,481 | 31,482 | 31,483 | 31,484 | 31,485 | 31,486 | 31,487 | 31,488 |
| 2-311 | 31,501 | 31,502 | 31,503 | 31,504 | 31,505 | 31,506 | 31,507 | 31,508 | 31,509 | 31,510 | 31,511 | 31,512 | 31,513 |
| 2-312 | 31,526 | 31,527 | 31,528 | 31,529 | 31,530 | 31,531 | 31,532 | 31,533 | 31,534 | 31,535 | 31,536 | 31,537 | 31,538 |
| 2-313 | 31,551 | 31,552 | 31,553 | 31,554 | 31,555 | 31,556 | 31,557 | 31,558 | 31,559 | 31,560 | 31,561 | 31,562 | 31,563 |
| 2-314 | 31,576 | 31,577 | 31,578 | 31,579 | 31,580 | 31,581 | 31,582 | 31,583 | 31,584 | 31,585 | 31,586 | 31,587 | 31,588 |
| 2-315 | 31,601 | 31,602 | 31,603 | 31,604 | 31,605 | 31,606 | 31,607 | 31,608 | 31,609 | 31,610 | 31,611 | 31,612 | 31,613 |
| 2-316 | 31,626 | 31,627 | 31,628 | 31,629 | 31,630 | 31,631 | 31,632 | 31,633 | 31,634 | 31,635 | 31,636 | 31,637 | 31,638 |
| 2-317 | 31,651 | 31,652 | 31,653 | 31,654 | 31,655 | 31,656 | 31,657 | 31,658 | 31,659 | 31,660 | 31,661 | 31,662 | 31,663 |
| 2-318 | 31,676 | 31,677 | 31,678 | 31,679 | 31,680 | 31,681 | 31,682 | 31,683 | 31,684 | 31,685 | 31,686 | 31,687 | 31,688 |
| 2-319 | 31,701 | 31,702 | 31,703 | 31,704 | 31,705 | 31,706 | 31,707 | 31,708 | 31,709 | 31,710 | 31,711 | 31,712 | 31,713 |
| 2-320 | 31,726 | 31,727 | 31,728 | 31,729 | 31,730 | 31,731 | 31,732 | 31,733 | 31,734 | 31,735 | 31,736 | 31,737 | 31,738 |
| 2-321 | 31,751 | 31,752 | 31,753 | 31,754 | 31,755 | 31,756 | 31,757 | 31,758 | 31,759 | 31,760 | 31,761 | 31,762 | 31,763 |
| 2-322 | 31,776 | 31,777 | 31,778 | 31,779 | 31,780 | 31,781 | 31,782 | 31,783 | 31,784 | 31,785 | 31,786 | 31,787 | 31,788 |
| 2-323 | 31,801 | 31,802 | 31,803 | 31,804 | 31,805 | 31,806 | 31,807 | 31,808 | 31,809 | 31,810 | 31,811 | 31,812 | 31,813 |
| 2-324 | 31,826 | 31,827 | 31,828 | 31,829 | 31,830 | 31,831 | 31,832 | 31,833 | 31,834 | 31,835 | 31,836 | 31,837 | 31,838 |
| 2-325 | 31,851 | 31,852 | 31,853 | 31,854 | 31,855 | 31,856 | 31,857 | 31,858 | 31,859 | 31,860 | 31,861 | 31,862 | 31,863 |
| 2-326 | 31,876 | 31,877 | 31,878 | 31,879 | 31,880 | 31,881 | 31,882 | 31,883 | 31,884 | 31,885 | 31,886 | 31,887 | 31,888 |
| 2-327 | 31,901 | 31,902 | 31,903 | 31,904 | 31,905 | 31,906 | 31,907 | 31,908 | 31,909 | 31,910 | 31,911 | 31,912 | 31,913 |
| 2-328 | 31,926 | 31,927 | 31,928 | 31,929 | 31,930 | 31,931 | 31,932 | 31,933 | 31,934 | 31,935 | 31,936 | 31,937 | 31,938 |
| 2-329 | 31,951 | 31,952 | 31,953 | 31,954 | 31,955 | 31,956 | 31,957 | 31,958 | 31,959 | 31,960 | 31,961 | 31,962 | 31,963 |
| 2-330 | 31,976 | 31,977 | 31,978 | 31,979 | 31,980 | 31,981 | 31,982 | 31,983 | 31,984 | 31,985 | 31,986 | 31,987 | 31,988 |

| | | Compound represented by the formula (1) | | | | | | | | | | | |
|---|---|---|---|---|---|---|---|---|---|---|---|---|---|
| | | 1-64 | 1-65 | 1-66 | 1-67 | 1-68 | 1-69 | 1-70 | 1-71 | 1-72 | 1-73 | 1-74 | 1-75 |
| Compound represented by the formula (2) | 2-276 | 30,639 | 30,640 | 30,641 | 30,642 | 30,643 | 30,644 | 30,645 | 30,646 | 30,647 | 30,648 | 30,649 | 30,650 |
| | 2-277 | 30,664 | 30,665 | 30,666 | 30,667 | 30,668 | 30,669 | 30,670 | 30,671 | 30,672 | 30,673 | 30,674 | 30,675 |
| | 2-278 | 30,689 | 30,690 | 30,691 | 30,692 | 30,693 | 30,694 | 30,695 | 30,696 | 30,697 | 30,698 | 30,699 | 30,700 |
| | 2-279 | 30,714 | 30,715 | 30,716 | 30,717 | 30,718 | 30,719 | 30,720 | 30,721 | 30,722 | 30,723 | 30,724 | 30,725 |
| | 2-280 | 30,739 | 30,740 | 30,741 | 30,742 | 30,743 | 30,744 | 30,745 | 30,746 | 30,747 | 30,748 | 30,749 | 30,750 |
| | 2-281 | 30,764 | 30,765 | 30,766 | 30,767 | 30,768 | 30,769 | 30,770 | 30,771 | 30,772 | 30,773 | 30,774 | 30,775 |
| | 2-282 | 30,789 | 30,790 | 30,791 | 30,792 | 30,793 | 30,794 | 30,795 | 30,796 | 30,797 | 30,798 | 30,799 | 30,800 |
| | 2-283 | 30,814 | 30,815 | 30,816 | 30,817 | 30,818 | 30,819 | 30,820 | 30,821 | 30,822 | 30,823 | 30,824 | 30,825 |
| | 2-284 | 30,839 | 30,840 | 30,841 | 30,842 | 30,843 | 30,844 | 30,845 | 30,846 | 30,847 | 30,848 | 30,849 | 30,850 |
| | 2-285 | 30,864 | 30,865 | 30,866 | 30,867 | 30,868 | 30,869 | 30,870 | 30,871 | 30,872 | 30,873 | 30,874 | 30,875 |
| | 2-286 | 30,889 | 30,890 | 30,891 | 30,892 | 30,893 | 30,894 | 30,895 | 30,896 | 30,897 | 30,898 | 30,899 | 30,900 |
| | 2-287 | 30,914 | 30,915 | 30,916 | 30,917 | 30,918 | 30,919 | 30,920 | 30,921 | 30,922 | 30,923 | 30,924 | 30,925 |
| | 2-288 | 30,939 | 30,940 | 30,941 | 30,942 | 30,943 | 30,944 | 30,945 | 30,946 | 30,947 | 30,948 | 30,949 | 30,950 |
| | 2-289 | 30,964 | 30,965 | 30,966 | 30,967 | 30,968 | 30,969 | 30,970 | 30,971 | 30,972 | 30,973 | 30,974 | 30,975 |
| | 2-290 | 30,989 | 30,990 | 30,991 | 30,992 | 30,993 | 30,994 | 30,995 | 30,996 | 30,997 | 30,998 | 30,999 | 31,000 |
| | 2-291 | 31,014 | 31,015 | 31,016 | 31,017 | 31,018 | 31,019 | 31,020 | 31,021 | 31,022 | 31,023 | 31,024 | 31,025 |
| | 2-292 | 31,039 | 31,040 | 31,041 | 31,042 | 31,043 | 31,044 | 31,045 | 31,046 | 31,047 | 31,048 | 31,049 | 31,050 |
| | 2-293 | 31,064 | 31,065 | 31,066 | 31,067 | 31,068 | 31,069 | 31,070 | 31,071 | 31,072 | 31,073 | 31,074 | 31,075 |
| | 2-294 | 31,089 | 31,090 | 31,091 | 31,092 | 31,093 | 31,094 | 31,095 | 31,096 | 31,097 | 31,098 | 31,099 | 31,100 |
| | 2-295 | 31,114 | 31,115 | 31,116 | 31,117 | 31,118 | 31,119 | 31,120 | 31,121 | 31,122 | 31,123 | 31,124 | 31,125 |
| | 2-296 | 31,139 | 31,140 | 31,141 | 31,142 | 31,143 | 31,144 | 31,145 | 31,146 | 31,147 | 31,148 | 31,149 | 31,150 |
| | 2-297 | 31,164 | 31,165 | 31,166 | 31,167 | 31,168 | 31,169 | 31,170 | 31,171 | 31,172 | 31,173 | 31,174 | 31,175 |
| | 2-298 | 31,189 | 31,190 | 31,191 | 31,192 | 31,193 | 31,194 | 31,195 | 31,196 | 31,197 | 31,198 | 31,199 | 31,200 |
| | 2-299 | 31,214 | 31,215 | 31,216 | 31,217 | 31,218 | 31,219 | 31,220 | 31,221 | 31,222 | 31,223 | 31,224 | 31,225 |
| | 2-300 | 31,239 | 31,240 | 31,241 | 31,242 | 31,243 | 31,244 | 31,245 | 31,246 | 31,247 | 31,248 | 31,249 | 31,250 |
| | 2-301 | 31,264 | 31,265 | 31,266 | 31,267 | 31,268 | 31,269 | 31,270 | 31,271 | 31,272 | 31,273 | 31,274 | 31,275 |
| | 2-302 | 31,289 | 31,290 | 31,291 | 31,292 | 31,293 | 31,294 | 31,295 | 31,296 | 31,297 | 31,298 | 31,299 | 31,300 |
| | 2-303 | 31,314 | 31,315 | 31,316 | 31,317 | 31,318 | 31,319 | 31,320 | 31,321 | 31,322 | 31,323 | 31,324 | 31,325 |
| | 2-304 | 31,339 | 31,340 | 31,341 | 31,342 | 31,343 | 31,344 | 31,345 | 31,346 | 31,347 | 31,348 | 31,349 | 31,350 |
| | 2-305 | 31,364 | 31,365 | 31,366 | 31,367 | 31,368 | 31,369 | 31,370 | 31,371 | 31,372 | 31,373 | 31,374 | 31,375 |
| | 2-306 | 31,389 | 31,390 | 31,391 | 31,392 | 31,393 | 31,394 | 31,395 | 31,396 | 31,397 | 31,398 | 31,399 | 31,400 |

TABLE 24-continued

| | | | | | | | | | | | | |
|---|---|---|---|---|---|---|---|---|---|---|---|---|
| 2-307 | 31,414 | 31,415 | 31,416 | 31,417 | 31,418 | 31,419 | 31,420 | 31,421 | 31,422 | 31,423 | 31,424 | 31,425 |
| 2-308 | 31,439 | 31,440 | 31,441 | 31,442 | 31,443 | 31,444 | 31,445 | 31,446 | 31,447 | 31,448 | 31,449 | 31,450 |
| 2-309 | 31,464 | 31,465 | 31,466 | 31,467 | 31,468 | 31,469 | 31,470 | 31,471 | 31,472 | 31,473 | 31,474 | 31,475 |
| 2-310 | 31,489 | 31,490 | 31,491 | 31,492 | 31,493 | 31,494 | 31,495 | 31,496 | 31,497 | 31,498 | 31,499 | 31,500 |
| 2-311 | 31,514 | 31,515 | 31,516 | 31,517 | 31,518 | 31,519 | 31,520 | 31,521 | 31,522 | 31,523 | 31,524 | 31,525 |
| 2-312 | 31,539 | 31,540 | 31,541 | 31,542 | 31,543 | 31,544 | 31,545 | 31,546 | 31,547 | 31,548 | 31,549 | 31,550 |
| 2-313 | 31,564 | 31,565 | 31,566 | 31,567 | 31,568 | 31,569 | 31,570 | 31,571 | 31,572 | 31,573 | 31,574 | 31,575 |
| 2-314 | 31,589 | 31,590 | 31,591 | 31,592 | 31,593 | 31,594 | 31,595 | 31,596 | 31,597 | 31,598 | 31,599 | 31,600 |
| 2-315 | 31,614 | 31,615 | 31,616 | 31,617 | 31,618 | 31,619 | 31,620 | 31,621 | 31,622 | 31,623 | 31,624 | 31,625 |
| 2-316 | 31,639 | 31,640 | 31,641 | 31,642 | 31,643 | 31,644 | 31,645 | 31,646 | 31,647 | 31,648 | 31,649 | 31,650 |
| 2-317 | 31,664 | 31,665 | 31,666 | 31,667 | 31,668 | 31,669 | 31,670 | 31,671 | 31,672 | 31,673 | 31,674 | 31,675 |
| 2-318 | 31,689 | 31,690 | 31,691 | 31,692 | 31,693 | 31,694 | 31,695 | 31,696 | 31,697 | 31,698 | 31,699 | 31,700 |
| 2-319 | 31,714 | 31,715 | 31,716 | 31,717 | 31,718 | 31,719 | 31,720 | 31,721 | 31,722 | 31,723 | 31,724 | 31,725 |
| 2-320 | 31,739 | 31,740 | 31,741 | 31,742 | 31,743 | 31,744 | 31,745 | 31,746 | 31,747 | 31,748 | 31,749 | 31,750 |
| 2-321 | 31,764 | 31,765 | 31,766 | 31,767 | 31,768 | 31,769 | 31,770 | 31,771 | 31,772 | 31,773 | 31,774 | 31,775 |
| 2-322 | 31,789 | 31,790 | 31,791 | 31,792 | 31,793 | 31,794 | 31,795 | 31,796 | 31,797 | 31,798 | 31,799 | 31,800 |
| 2-323 | 31,814 | 31,815 | 31,816 | 31,817 | 31,818 | 31,819 | 31,820 | 31,821 | 31,822 | 31,823 | 31,824 | 31,825 |
| 2-324 | 31,839 | 31,840 | 31,841 | 31,842 | 31,843 | 31,844 | 31,845 | 31,846 | 31,847 | 31,848 | 31,849 | 31,850 |
| 2-325 | 31,864 | 31,865 | 31,866 | 31,867 | 31,868 | 31,869 | 31,870 | 31,871 | 31,872 | 31,873 | 31,874 | 31,875 |
| 2-326 | 31,889 | 31,890 | 31,891 | 31,892 | 31,893 | 31,894 | 31,895 | 31,896 | 31,897 | 31,898 | 31,899 | 31,900 |
| 2-327 | 31,914 | 31,915 | 31,916 | 31,917 | 31,918 | 31,919 | 31,920 | 31,921 | 31,922 | 31,923 | 31,924 | 31,925 |
| 2-328 | 31,939 | 31,940 | 31,941 | 31,942 | 31,943 | 31,944 | 31,945 | 31,946 | 31,947 | 31,948 | 31,949 | 31,950 |
| 2-329 | 31,964 | 31,965 | 31,966 | 31,967 | 31,968 | 31,969 | 31,970 | 31,971 | 31,972 | 31,973 | 31,974 | 31,975 |
| 2-330 | 31,989 | 31,990 | 31,991 | 31,992 | 31,993 | 31,994 | 31,995 | 31,996 | 31,997 | 31,998 | 31,999 | 32,000 |

TABLE 25

| | | Compound represented by the formula (1) | | | | | | | | | | | | |
|---|---|---|---|---|---|---|---|---|---|---|---|---|---|---|
| | | 1-51 | 1-52 | 1-53 | 1-54 | 1-55 | 1-56 | 1-57 | 1-58 | 1-59 | 1-60 | 1-61 | 1-62 | 1-63 |
| Compound represented by the formula (2) | 2-331 | 32,001 | 32,002 | 32,003 | 32,004 | 32,005 | 32,006 | 32,007 | 32,008 | 32,009 | 32,010 | 32,011 | 32,012 | 32,013 |
| | 2-332 | 32,026 | 32,027 | 32,028 | 32,029 | 32,030 | 32,031 | 32,032 | 32,033 | 32,034 | 32,035 | 32,036 | 32,037 | 32,038 |
| | 2-333 | 32,051 | 32,052 | 32,053 | 32,054 | 32,055 | 32,056 | 32,057 | 32,058 | 32,059 | 32,060 | 32,061 | 32,062 | 32,063 |
| | 2-334 | 32,076 | 32,077 | 32,078 | 32,079 | 32,080 | 32,081 | 32,082 | 32,083 | 32,084 | 32,085 | 32,086 | 32,087 | 32,088 |
| | 2-335 | 32,101 | 32,102 | 32,103 | 32,104 | 32,105 | 32,106 | 32,107 | 32,108 | 32,109 | 32,110 | 32,111 | 32,112 | 32,113 |
| | 2-336 | 32,126 | 32,127 | 32,128 | 32,129 | 32,130 | 32,131 | 32,132 | 32,133 | 32,134 | 32,135 | 32,136 | 32,137 | 32,138 |
| | 2-337 | 32,151 | 32,152 | 32,153 | 32,154 | 32,155 | 32,156 | 32,157 | 32,158 | 32,159 | 32,160 | 32,161 | 32,162 | 32,163 |
| | 2-338 | 32,176 | 32,177 | 32,178 | 32,179 | 32,180 | 32,181 | 32,182 | 32,183 | 32,184 | 32,185 | 32,186 | 32,187 | 32,188 |
| | 2-339 | 32,201 | 32,202 | 32,203 | 32,204 | 32,205 | 32,206 | 32,207 | 32,208 | 32,209 | 32,210 | 32,211 | 32,212 | 32,213 |
| | 2-340 | 32,226 | 32,227 | 32,228 | 32,229 | 32,230 | 32,231 | 32,232 | 32,233 | 32,234 | 32,235 | 32,236 | 32,237 | 32,238 |
| | 2-341 | 32,251 | 32,252 | 32,253 | 32,254 | 32,255 | 32,256 | 32,257 | 32,258 | 32,259 | 32,260 | 32,261 | 32,262 | 32,263 |
| | 2-342 | 32,276 | 32,277 | 32,278 | 32,279 | 32,280 | 32,281 | 32,282 | 32,283 | 32,284 | 32,285 | 32,286 | 32,287 | 32,288 |
| | 2-343 | 32,301 | 32,302 | 32,303 | 32,304 | 32,305 | 32,306 | 32,307 | 32,308 | 32,309 | 32,310 | 32,311 | 32,312 | 32,313 |
| | 2-344 | 32,326 | 32,327 | 32,328 | 32,329 | 32,330 | 32,331 | 32,332 | 32,333 | 32,334 | 32,335 | 32,336 | 32,337 | 32,338 |
| | 2-345 | 32,351 | 32,352 | 32,353 | 32,354 | 32,355 | 32,356 | 32,357 | 32,358 | 32,359 | 32,360 | 32,361 | 32,362 | 32,363 |
| | 2-346 | 32,376 | 32,377 | 32,378 | 32,379 | 32,380 | 32,381 | 32,382 | 32,383 | 32,384 | 32,385 | 32,386 | 32,387 | 32,388 |
| | 2-347 | 32,401 | 32,402 | 32,403 | 32,404 | 32,405 | 32,406 | 32,407 | 32,408 | 32,409 | 32,410 | 32,411 | 32,412 | 32,413 |
| | 2-348 | 32,426 | 32,427 | 32,428 | 32,429 | 32,430 | 32,431 | 32,432 | 32,433 | 32,434 | 32,435 | 32,436 | 32,437 | 32,438 |
| | 2-349 | 32,451 | 32,452 | 32,453 | 32,454 | 32,455 | 32,456 | 32,457 | 32,458 | 32,459 | 32,460 | 32,461 | 32,462 | 32,463 |
| | 2-350 | 32,476 | 32,477 | 32,478 | 32,479 | 32,480 | 32,481 | 32,482 | 32,483 | 32,484 | 32,485 | 32,486 | 32,487 | 32,488 |
| | 2-351 | 32,501 | 32,502 | 32,503 | 32,504 | 32,505 | 32,506 | 32,507 | 32,508 | 32,509 | 32,510 | 32,511 | 32,512 | 32,513 |
| | 2-352 | 32,526 | 32,527 | 32,528 | 32,529 | 32,530 | 32,531 | 32,532 | 32,533 | 32,534 | 32,535 | 32,536 | 32,537 | 32,538 |
| | 2-353 | 32,551 | 32,552 | 32,553 | 32,554 | 32,555 | 32,556 | 32,557 | 32,558 | 32,559 | 32,560 | 32,561 | 32,562 | 32,563 |
| | 2-354 | 32,576 | 32,577 | 32,578 | 32,579 | 32,580 | 32,581 | 32,582 | 32,583 | 32,584 | 32,585 | 32,586 | 32,587 | 32,588 |
| | 2-355 | 32,601 | 32,602 | 32,603 | 32,604 | 32,605 | 32,606 | 32,607 | 32,608 | 32,609 | 32,610 | 32,611 | 32,612 | 32,613 |
| | 2-356 | 32,626 | 32,627 | 32,628 | 32,629 | 32,630 | 32,631 | 32,632 | 32,633 | 32,634 | 32,635 | 32,636 | 32,637 | 32,638 |
| | 2-357 | 32,651 | 32,652 | 32,653 | 32,654 | 32,655 | 32,656 | 32,657 | 32,658 | 32,659 | 32,660 | 32,661 | 32,662 | 32,663 |
| | 2-358 | 32,676 | 32,677 | 32,678 | 32,679 | 32,680 | 32,681 | 32,682 | 32,683 | 32,684 | 32,685 | 32,686 | 32,687 | 32,688 |
| | 2-359 | 32,701 | 32,702 | 32,703 | 32,704 | 32,705 | 32,706 | 32,707 | 32,708 | 32,709 | 32,710 | 32,711 | 32,712 | 32,713 |
| | 2-360 | 32,726 | 32,727 | 32,728 | 32,729 | 32,730 | 32,731 | 32,732 | 32,733 | 32,734 | 32,735 | 32,736 | 32,737 | 32,738 |
| | 2-361 | 32,751 | 32,752 | 32,753 | 32,754 | 32,755 | 32,756 | 32,757 | 32,758 | 32,759 | 32,760 | 32,761 | 32,762 | 32,763 |
| | 2-362 | 32,776 | 32,777 | 32,778 | 32,779 | 32,780 | 32,781 | 32,782 | 32,783 | 32,784 | 32,785 | 32,786 | 32,787 | 32,788 |
| | 2-363 | 32,801 | 32,802 | 32,803 | 32,804 | 32,805 | 32,806 | 32,807 | 32,808 | 32,809 | 32,810 | 32,811 | 32,812 | 32,813 |
| | 2-364 | 32,826 | 32,827 | 32,828 | 32,829 | 32,830 | 32,831 | 32,832 | 32,833 | 32,834 | 32,835 | 32,836 | 32,837 | 32,838 |
| | 2-365 | 32,851 | 32,852 | 32,853 | 32,854 | 32,855 | 32,856 | 32,857 | 32,858 | 32,859 | 32,860 | 32,861 | 32,862 | 32,863 |
| | 2-366 | 32,876 | 32,877 | 32,878 | 32,879 | 32,880 | 32,881 | 32,882 | 32,883 | 32,884 | 32,885 | 32,886 | 32,887 | 32,888 |
| | 2-367 | 32,901 | 32,902 | 32,903 | 32,904 | 32,905 | 32,906 | 32,907 | 32,908 | 32,909 | 32,910 | 32,911 | 32,912 | 32,913 |
| | 2-368 | 32,926 | 32,927 | 32,928 | 32,929 | 32,930 | 32,931 | 32,932 | 32,933 | 32,934 | 32,935 | 32,936 | 32,937 | 32,938 |
| | 2-369 | 32,951 | 32,952 | 32,953 | 32,954 | 32,955 | 32,956 | 32,957 | 32,958 | 32,959 | 32,960 | 32,961 | 32,962 | 32,963 |
| | 2-370 | 32,976 | 32,977 | 32,978 | 32,979 | 32,980 | 32,981 | 32,982 | 32,983 | 32,984 | 32,985 | 32,986 | 32,987 | 32,988 |
| | 2-371 | 33,001 | 33,002 | 33,003 | 33,004 | 33,005 | 33,006 | 33,007 | 33,008 | 33,009 | 33,010 | 33,011 | 33,012 | 33,013 |
| | 2-372 | 33,026 | 33,027 | 33,028 | 33,029 | 33,030 | 33,031 | 33,032 | 33,033 | 33,034 | 33,035 | 33,036 | 33,037 | 33,038 |
| | 2-373 | 33,051 | 33,052 | 33,053 | 33,054 | 33,055 | 33,056 | 33,057 | 33,058 | 33,059 | 33,060 | 33,061 | 33,062 | 33,063 |
| | 2-374 | 33,076 | 33,077 | 33,078 | 33,079 | 33,080 | 33,081 | 33,082 | 33,083 | 33,084 | 33,085 | 33,086 | 33,087 | 33,088 |
| | 2-375 | 33,101 | 33,102 | 33,103 | 33,104 | 33,105 | 33,106 | 33,107 | 33,108 | 33,109 | 33,110 | 33,111 | 33,112 | 33,113 |
| | 2-376 | 33,126 | 33,127 | 33,128 | 33,129 | 33,130 | 33,131 | 33,132 | 33,133 | 33,134 | 33,135 | 33,136 | 33,137 | 33,138 |

TABLE 25-continued

| | | | | | | | | | | | | | |
|---|---|---|---|---|---|---|---|---|---|---|---|---|---|
| 2-377 | 33,151 | 33,152 | 33,153 | 33,154 | 33,155 | 33,156 | 33,157 | 33,158 | 33,159 | 33,160 | 33,161 | 33,162 | 33,163 |
| 2-378 | 33,176 | 33,177 | 33,178 | 33,179 | 33,180 | 33,181 | 33,182 | 33,183 | 33,184 | 33,185 | 33,186 | 33,187 | 33,188 |
| 2-379 | 33,201 | 33,202 | 33,203 | 33,204 | 33,205 | 33,206 | 33,207 | 33,208 | 33,209 | 33,210 | 33,211 | 33,212 | 33,213 |
| 2-380 | 33,226 | 33,227 | 33,228 | 33,229 | 33,230 | 33,231 | 33,232 | 33,233 | 33,234 | 33,235 | 33,236 | 33,237 | 33,238 |
| 2-381 | 33,251 | 33,252 | 33,253 | 33,254 | 33,255 | 33,256 | 33,257 | 33,258 | 33,259 | 33,260 | 33,261 | 33,262 | 33,263 |
| 2-382 | 33,276 | 33,277 | 33,278 | 33,279 | 33,280 | 33,281 | 33,282 | 33,283 | 33,284 | 33,285 | 33,286 | 33,287 | 33,288 |
| 2-383 | 33,301 | 33,302 | 33,303 | 33,304 | 33,305 | 33,306 | 33,307 | 33,308 | 33,309 | 33,310 | 33,311 | 33,312 | 33,313 |
| 2-384 | 33,326 | 33,327 | 33,328 | 33,329 | 33,330 | 33,331 | 33,332 | 33,333 | 33,334 | 33,335 | 33,336 | 33,337 | 33,338 |
| 2-385 | 33,351 | 33,352 | 33,353 | 33,354 | 33,355 | 33,356 | 33,357 | 33,358 | 33,359 | 33,360 | 33,361 | 33,362 | 33,363 |

| | | Compound represented by the formula (1) | | | | | | | | | | | |
|---|---|---|---|---|---|---|---|---|---|---|---|---|---|
| | | 1-64 | 1-65 | 1-66 | 1-67 | 1-68 | 1-69 | 1-70 | 1-71 | 1-72 | 1-73 | 1-74 | 1-75 |
| Compound represented by the formula (2) | 2-331 | 32,014 | 32,015 | 32,016 | 32,017 | 32,018 | 32,019 | 32,020 | 32,021 | 32,022 | 32,023 | 32,024 | 32,025 |
| | 2-332 | 32,039 | 32,040 | 32,041 | 32,042 | 32,043 | 32,044 | 32,045 | 32,046 | 32,047 | 32,048 | 32,049 | 32,050 |
| | 2-333 | 32,064 | 32,065 | 32,066 | 32,067 | 32,068 | 32,069 | 32,070 | 32,071 | 32,072 | 32,073 | 32,074 | 32,075 |
| | 2-334 | 32,089 | 32,090 | 32,091 | 32,092 | 32,093 | 32,094 | 32,095 | 32,096 | 32,097 | 32,098 | 32,099 | 32,100 |
| | 2-335 | 32,114 | 32,115 | 32,116 | 32,117 | 32,118 | 32,119 | 32,120 | 32,121 | 32,122 | 32,123 | 32,124 | 32,125 |
| | 2-336 | 32,139 | 32,140 | 32,141 | 32,142 | 32,143 | 32,144 | 32,145 | 32,146 | 32,147 | 32,148 | 32,149 | 32,150 |
| | 2-337 | 32,164 | 32,165 | 32,166 | 32,167 | 32,168 | 32,169 | 32,170 | 32,171 | 32,172 | 32,173 | 32,174 | 32,175 |
| | 2-338 | 32,189 | 32,190 | 32,191 | 32,192 | 32,193 | 32,194 | 32,195 | 32,196 | 32,197 | 32,198 | 32,199 | 32,200 |
| | 2-339 | 32,214 | 32,215 | 32,216 | 32,217 | 32,218 | 32,219 | 32,220 | 32,221 | 32,222 | 32,223 | 32,224 | 32,225 |
| | 2-340 | 32,239 | 32,240 | 32,241 | 32,242 | 32,243 | 32,244 | 32,245 | 32,246 | 32,247 | 32,248 | 32,249 | 32,250 |
| | 2-341 | 32,264 | 32,265 | 32,266 | 32,267 | 32,268 | 32,269 | 32,270 | 32,271 | 32,272 | 32,273 | 32,274 | 32,275 |
| | 2-342 | 32,289 | 32,290 | 32,291 | 32,292 | 32,293 | 32,294 | 32,295 | 32,296 | 32,297 | 32,298 | 32,299 | 32,300 |
| | 2-343 | 32,314 | 32,315 | 32,316 | 32,317 | 32,318 | 32,319 | 32,320 | 32,321 | 32,322 | 32,323 | 32,324 | 32,325 |
| | 2-344 | 32,339 | 32,340 | 32,341 | 32,342 | 32,343 | 32,344 | 32,345 | 32,346 | 32,347 | 32,348 | 32,349 | 32,350 |
| | 2-345 | 32,364 | 32,365 | 32,366 | 32,367 | 32,368 | 32,369 | 32,370 | 32,371 | 32,372 | 32,373 | 32,374 | 32,375 |
| | 2-346 | 32,389 | 32,390 | 32,391 | 32,392 | 32,393 | 32,394 | 32,395 | 32,396 | 32,397 | 32,398 | 32,399 | 32,400 |
| | 2-347 | 32,414 | 32,415 | 32,416 | 32,417 | 32,418 | 32,419 | 32,420 | 32,421 | 32,422 | 32,423 | 32,424 | 32,425 |
| | 2-348 | 32,439 | 32,440 | 32,441 | 32,442 | 32,443 | 32,444 | 32,445 | 32,446 | 32,447 | 32,448 | 32,449 | 32,450 |
| | 2-349 | 32,464 | 32,465 | 32,466 | 32,467 | 32,468 | 32,469 | 32,470 | 32,471 | 32,472 | 32,473 | 32,474 | 32,475 |
| | 2-350 | 32,489 | 32,490 | 32,491 | 32,492 | 32,493 | 32,494 | 32,495 | 32,496 | 32,497 | 32,498 | 32,499 | 32,500 |
| | 2-351 | 32,514 | 32,515 | 32,516 | 32,517 | 32,518 | 32,519 | 32,520 | 32,521 | 32,522 | 32,523 | 32,524 | 32,525 |
| | 2-352 | 32,539 | 32,540 | 32,541 | 32,542 | 32,543 | 32,544 | 32,545 | 32,546 | 32,547 | 32,548 | 32,549 | 32,550 |
| | 2-353 | 32,564 | 32,565 | 32,566 | 32,567 | 32,568 | 32,569 | 32,570 | 32,571 | 32,572 | 32,573 | 32,574 | 32,575 |
| | 2-354 | 32,589 | 32,590 | 32,591 | 32,592 | 32,593 | 32,594 | 32,595 | 32,596 | 32,597 | 32,598 | 32,599 | 32,600 |
| | 2-355 | 32,614 | 32,615 | 32,616 | 32,617 | 32,618 | 32,619 | 32,620 | 32,621 | 32,622 | 32,623 | 32,624 | 32,625 |
| | 2-356 | 32,639 | 32,640 | 32,641 | 32,642 | 32,643 | 32,644 | 32,645 | 32,646 | 32,647 | 32,648 | 32,649 | 32,650 |
| | 2-357 | 32,664 | 32,665 | 32,666 | 32,667 | 32,668 | 32,669 | 32,670 | 32,671 | 32,672 | 32,673 | 32,674 | 32,675 |
| | 2-358 | 32,689 | 32,690 | 32,691 | 32,692 | 32,693 | 32,694 | 32,695 | 32,696 | 32,697 | 32,698 | 32,699 | 32,700 |
| | 2-359 | 32,714 | 32,715 | 32,716 | 32,717 | 32,718 | 32,719 | 32,720 | 32,721 | 32,722 | 32,723 | 32,724 | 32,725 |
| | 2-360 | 32,739 | 32,740 | 32,741 | 32,742 | 32,743 | 32,744 | 32,745 | 32,746 | 32,747 | 32,748 | 32,749 | 32,750 |
| | 2-361 | 32,764 | 32,765 | 32,766 | 32,767 | 32,768 | 32,769 | 32,770 | 32,771 | 32,772 | 32,773 | 32,774 | 32,775 |
| | 2-362 | 32,789 | 32,790 | 32,791 | 32,792 | 32,793 | 32,794 | 32,795 | 32,796 | 32,797 | 32,798 | 32,799 | 32,800 |
| | 2-363 | 32,814 | 32,815 | 32,816 | 32,817 | 32,818 | 32,819 | 32,820 | 32,821 | 32,822 | 32,823 | 32,824 | 32,825 |
| | 2-364 | 32,839 | 32,840 | 32,841 | 32,842 | 32,843 | 32,844 | 32,845 | 32,846 | 32,847 | 32,848 | 32,849 | 32,850 |
| | 2-365 | 32,864 | 32,865 | 32,866 | 32,867 | 32,868 | 32,869 | 32,870 | 32,871 | 32,872 | 32,873 | 32,874 | 32,875 |
| | 2-366 | 32,889 | 32,890 | 32,891 | 32,892 | 32,893 | 32,894 | 32,895 | 32,896 | 32,897 | 32,898 | 32,899 | 32,900 |
| | 2-367 | 32,914 | 32,915 | 32,916 | 32,917 | 32,918 | 32,919 | 32,920 | 32,921 | 32,922 | 32,923 | 32,924 | 32,925 |
| | 2-368 | 32,939 | 32,940 | 32,941 | 32,942 | 32,943 | 32,944 | 32,945 | 32,946 | 32,947 | 32,948 | 32,949 | 32,950 |
| | 2-369 | 32,964 | 32,965 | 32,966 | 32,967 | 32,968 | 32,969 | 32,970 | 32,971 | 32,972 | 32,973 | 32,974 | 32,975 |
| | 2-370 | 32,989 | 32,990 | 32,991 | 32,992 | 32,993 | 32,994 | 32,995 | 32,996 | 32,997 | 32,998 | 32,999 | 33,000 |
| | 2-371 | 33,014 | 33,015 | 33,016 | 33,017 | 33,018 | 33,019 | 33,020 | 33,021 | 33,022 | 33,023 | 33,024 | 33,025 |
| | 2-372 | 33,039 | 33,040 | 33,041 | 33,042 | 33,043 | 33,044 | 33,045 | 33,046 | 33,047 | 33,048 | 33,049 | 33,050 |
| | 2-373 | 33,064 | 33,065 | 33,066 | 33,067 | 33,068 | 33,069 | 33,070 | 33,071 | 33,072 | 33,073 | 33,074 | 33,075 |
| | 2-374 | 33,089 | 33,090 | 33,091 | 33,092 | 33,093 | 33,094 | 33,095 | 33,096 | 33,097 | 33,098 | 33,099 | 33,100 |
| | 2-375 | 33,114 | 33,115 | 33,116 | 33,117 | 33,118 | 33,119 | 33,120 | 33,121 | 33,122 | 33,123 | 33,124 | 33,125 |
| | 2-376 | 33,139 | 33,140 | 33,141 | 33,142 | 33,143 | 33,144 | 33,145 | 33,146 | 33,147 | 33,148 | 33,149 | 33,150 |
| | 2-377 | 33,164 | 33,165 | 33,166 | 33,167 | 33,168 | 33,169 | 33,170 | 33,171 | 33,172 | 33,173 | 33,174 | 33,175 |
| | 2-378 | 33,189 | 33,190 | 33,191 | 33,192 | 33,193 | 33,194 | 33,195 | 33,196 | 33,197 | 33,198 | 33,199 | 33,200 |
| | 2-379 | 33,214 | 33,215 | 33,216 | 33,217 | 33,218 | 33,219 | 33,220 | 33,221 | 33,222 | 33,223 | 33,224 | 33,225 |
| | 2-380 | 33,239 | 33,240 | 33,241 | 33,242 | 33,243 | 33,244 | 33,245 | 33,246 | 33,247 | 33,248 | 33,249 | 33,250 |
| | 2-381 | 33,264 | 33,265 | 33,266 | 33,267 | 33,268 | 33,269 | 33,270 | 33,271 | 33,272 | 33,273 | 33,274 | 33,275 |
| | 2-382 | 33,289 | 33,290 | 33,291 | 33,292 | 33,293 | 33,294 | 33,295 | 33,296 | 33,297 | 33,298 | 33,299 | 33,300 |
| | 2-383 | 33,314 | 33,315 | 33,316 | 33,317 | 33,318 | 33,319 | 33,320 | 33,321 | 33,322 | 33,323 | 33,324 | 33,325 |
| | 2-384 | 33,339 | 33,340 | 33,341 | 33,342 | 33,343 | 33,344 | 33,345 | 33,346 | 33,347 | 33,348 | 33,349 | 33,350 |
| | 2-385 | 33,364 | 33,365 | 33,366 | 33,367 | 33,368 | 33,369 | 33,370 | 33,371 | 33,372 | 33,373 | 33,374 | 33,375 |

TABLE 26

| | | Compound represented by the formula (1) | | | | | | | | | | | | |
|---|---|---|---|---|---|---|---|---|---|---|---|---|---|---|
| | | 1-51 | 1-52 | 1-53 | 1-54 | 1-55 | 1-56 | 1-57 | 1-58 | 1-59 | 1-60 | 1-61 | 1-62 | 1-63 |
| Compound | 2-386 | 33,376 | 33,377 | 33,378 | 33,379 | 33,380 | 33,381 | 33,382 | 33,383 | 33,384 | 33,385 | 33,386 | 33,387 | 33,388 |
| represented | 2-387 | 33,401 | 33,402 | 33,403 | 33,404 | 33,405 | 33,406 | 33,407 | 33,408 | 33,409 | 33,410 | 33,411 | 33,412 | 33,413 |
| by the | 2-388 | 33,426 | 33,427 | 33,428 | 33,429 | 33,430 | 33,431 | 33,432 | 33,433 | 33,434 | 33,435 | 33,436 | 33,437 | 33,438 |
| formula | 2-389 | 33,451 | 33,452 | 33,453 | 33,454 | 33,455 | 33,456 | 33,457 | 33,458 | 33,459 | 33,460 | 33,461 | 33,462 | 33,463 |
| (2) | 2-390 | 33,476 | 33,477 | 33,478 | 33,479 | 33,480 | 33,481 | 33,482 | 33,483 | 33,484 | 33,485 | 33,486 | 33,487 | 33,488 |
| | 2-391 | 33,501 | 33,502 | 33,503 | 33,504 | 33,505 | 33,506 | 33,507 | 33,508 | 33,509 | 33,510 | 33,511 | 33,512 | 33,513 |
| | 2-392 | 33,526 | 33,527 | 33,528 | 33,529 | 33,530 | 33,531 | 33,532 | 33,533 | 33,534 | 33,535 | 33,536 | 33,537 | 33,538 |
| | 2-393 | 33,551 | 33,552 | 33,553 | 33,554 | 33,555 | 33,556 | 33,557 | 33,558 | 33,559 | 33,560 | 33,561 | 33,562 | 33,563 |
| | 2-394 | 33,576 | 33,577 | 33,578 | 33,579 | 33,580 | 33,581 | 33,582 | 33,583 | 33,584 | 33,585 | 33,586 | 33,587 | 33,588 |
| | 2-395 | 33,601 | 33,602 | 33,603 | 33,604 | 33,605 | 33,606 | 33,607 | 33,608 | 33,609 | 33,610 | 33,611 | 33,612 | 33,613 |
| | 2-396 | 33,626 | 33,627 | 33,628 | 33,629 | 33,630 | 33,631 | 33,632 | 33,633 | 33,634 | 33,635 | 33,636 | 33,637 | 33,638 |
| | 2-397 | 33,651 | 33,652 | 33,653 | 33,654 | 33,655 | 33,656 | 33,657 | 33,658 | 33,659 | 33,660 | 33,661 | 33,662 | 33,663 |
| | 2-398 | 33,676 | 33,677 | 33,678 | 33,679 | 33,680 | 33,681 | 33,682 | 33,683 | 33,684 | 33,685 | 33,686 | 33,687 | 33,688 |
| | 2-399 | 33,701 | 33,702 | 33,703 | 33,704 | 33,705 | 33,706 | 33,707 | 33,708 | 33,709 | 33,710 | 33,711 | 33,712 | 33,713 |
| | 2-400 | 33,726 | 33,727 | 33,728 | 33,729 | 33,730 | 33,731 | 33,732 | 33,733 | 33,734 | 33,735 | 33,736 | 33,737 | 33,738 |
| | 2-401 | 33,751 | 33,752 | 33,753 | 33,754 | 33,755 | 33,756 | 33,757 | 33,758 | 33,759 | 33,760 | 33,761 | 33,762 | 33,763 |
| | 2-402 | 33,776 | 33,777 | 33,778 | 33,779 | 33,780 | 33,781 | 33,782 | 33,783 | 33,784 | 33,785 | 33,786 | 33,787 | 33,788 |
| | 2-403 | 33,801 | 33,802 | 33,803 | 33,804 | 33,805 | 33,806 | 33,807 | 33,808 | 33,809 | 33,810 | 33,811 | 33,812 | 33,813 |
| | 2-404 | 33,826 | 33,827 | 33,828 | 33,829 | 33,830 | 33,831 | 33,832 | 33,833 | 33,834 | 33,835 | 33,836 | 33,837 | 33,838 |
| | 2-405 | 33,851 | 33,852 | 33,853 | 33,854 | 33,855 | 33,856 | 33,857 | 33,858 | 33,859 | 33,860 | 33,861 | 33,862 | 33,863 |
| | 2-406 | 33,876 | 33,877 | 33,878 | 33,879 | 33,880 | 33,881 | 33,882 | 33,883 | 33,884 | 33,885 | 33,886 | 33,887 | 33,888 |
| | 2-407 | 33,901 | 33,902 | 33,903 | 33,904 | 33,905 | 33,906 | 33,907 | 33,908 | 33,909 | 33,910 | 33,911 | 33,912 | 33,913 |
| | 2-408 | 33,926 | 33,927 | 33,928 | 33,929 | 33,930 | 33,931 | 33,932 | 33,933 | 33,934 | 33,935 | 33,936 | 33,937 | 33,938 |
| | 2-409 | 33,951 | 33,952 | 33,953 | 33,954 | 33,955 | 33,956 | 33,957 | 33,958 | 33,959 | 33,960 | 33,961 | 33,962 | 33,963 |
| | 2-410 | 33,976 | 33,977 | 33,978 | 33,979 | 33,980 | 33,981 | 33,982 | 33,983 | 33,984 | 33,985 | 33,986 | 33,987 | 33,988 |
| | 2-411 | 34,001 | 34,002 | 34,003 | 34,004 | 34,005 | 34,006 | 34,007 | 34,008 | 34,009 | 34,010 | 34,011 | 34,012 | 34,013 |
| | 2-412 | 34,026 | 34,027 | 34,028 | 34,029 | 34,030 | 34,031 | 34,032 | 34,033 | 34,034 | 34,035 | 34,036 | 34,037 | 34,038 |
| | 2-413 | 34,051 | 34,052 | 34,053 | 34,054 | 34,055 | 34,056 | 34,057 | 34,058 | 34,059 | 34,060 | 34,061 | 34,062 | 34,063 |
| | 2-414 | 34,076 | 34,077 | 34,078 | 34,079 | 34,080 | 34,081 | 34,082 | 34,083 | 34,084 | 34,085 | 34,086 | 34,087 | 34,088 |
| | 2-415 | 34,101 | 34,102 | 34,103 | 34,104 | 34,105 | 34,106 | 34,107 | 34,108 | 34,109 | 34,110 | 34,111 | 34,112 | 34,113 |
| | 2-416 | 34,126 | 34,127 | 34,128 | 34,129 | 34,130 | 34,131 | 34,132 | 34,133 | 34,134 | 34,135 | 34,136 | 34,137 | 34,138 |
| | 2-417 | 34,151 | 34,152 | 34,153 | 34,154 | 34,155 | 34,156 | 34,157 | 34,158 | 34,159 | 34,160 | 34,161 | 34,162 | 34,163 |
| | 2-418 | 34,176 | 34,177 | 34,178 | 34,179 | 34,180 | 34,181 | 34,182 | 34,183 | 34,184 | 34,185 | 34,186 | 34,187 | 34,188 |
| | 2-419 | 34,201 | 34,202 | 34,203 | 34,204 | 34,205 | 34,206 | 34,207 | 34,208 | 34,209 | 34,210 | 34,211 | 34,212 | 34,213 |
| | 2-420 | 34,226 | 34,227 | 34,228 | 34,229 | 34,230 | 34,231 | 34,232 | 34,233 | 34,234 | 34,235 | 34,236 | 34,237 | 34,238 |
| | 2-421 | 34,251 | 34,252 | 34,253 | 34,254 | 34,255 | 34,256 | 34,257 | 34,258 | 34,259 | 34,260 | 34,261 | 34,262 | 34,263 |
| | 2-422 | 34,276 | 34,277 | 34,278 | 34,279 | 34,280 | 34,281 | 34,282 | 34,283 | 34,284 | 34,285 | 34,286 | 34,287 | 34,288 |
| | 2-423 | 34,301 | 34,302 | 34,303 | 34,304 | 34,305 | 34,306 | 34,307 | 34,308 | 34,309 | 34,310 | 34,311 | 34,312 | 34,313 |
| | 2-434 | 34,326 | 34,327 | 34,328 | 34,329 | 34,330 | 34,331 | 34,332 | 34,333 | 34,334 | 34,335 | 34,336 | 34,337 | 34,338 |
| | 2-425 | 34,351 | 34,352 | 34,353 | 34,354 | 34,355 | 34,356 | 34,357 | 34,358 | 34,359 | 34,360 | 34,361 | 34,362 | 34,363 |
| | 2-426 | 34,376 | 34,377 | 34,378 | 34,379 | 34,380 | 34,381 | 34,382 | 34,383 | 34,384 | 34,385 | 34,386 | 34,387 | 34,388 |
| | 2-427 | 34,401 | 34,402 | 34,403 | 34,404 | 34,405 | 34,406 | 34,407 | 34,408 | 34,409 | 34,410 | 34,411 | 34,412 | 34,413 |
| | 2-428 | 34,426 | 34,427 | 34,428 | 34,429 | 34,430 | 34,431 | 34,432 | 34,433 | 34,434 | 34,435 | 34,436 | 34,437 | 34,438 |
| | 2-429 | 34,451 | 34,452 | 34,453 | 34,454 | 34,455 | 34,456 | 34,457 | 34,458 | 34,459 | 34,460 | 34,461 | 34,462 | 34,463 |
| | 2-430 | 34,476 | 34,477 | 34,478 | 34,479 | 34,480 | 34,481 | 34,482 | 34,483 | 34,484 | 34,485 | 34,486 | 34,487 | 34,488 |
| | 2-431 | 34,501 | 34,502 | 34,503 | 34,504 | 34,505 | 34,506 | 34,507 | 34,508 | 34,509 | 34,510 | 34,511 | 34,512 | 34,513 |
| | 2-432 | 34,526 | 34,527 | 34,528 | 34,529 | 34,530 | 34,531 | 34,532 | 34,533 | 34,534 | 34,535 | 34,536 | 34,537 | 34,538 |
| | 2-433 | 34,551 | 34,552 | 34,553 | 34,554 | 34,555 | 34,556 | 34,557 | 34,558 | 34,559 | 34,560 | 34,561 | 34,562 | 34,563 |
| | 2-434 | 34,576 | 34,577 | 34,578 | 34,579 | 34,580 | 34,581 | 34,582 | 34,583 | 34,584 | 34,585 | 34,586 | 34,587 | 34,588 |
| | 2-435 | 34,601 | 34,602 | 34,603 | 34,604 | 34,605 | 34,606 | 34,607 | 34,608 | 34,609 | 34,610 | 34,611 | 34,612 | 34,613 |
| | 2-436 | 34,626 | 34,627 | 34,628 | 34,629 | 34,630 | 34,631 | 34,632 | 34,633 | 34,634 | 34,635 | 34,636 | 34,637 | 34,638 |
| | 2-437 | 34,651 | 34,652 | 34,653 | 34,654 | 34,655 | 34,656 | 34,657 | 34,658 | 34,659 | 34,660 | 34,661 | 34,662 | 34,663 |
| | 2-438 | 34,676 | 34,677 | 34,678 | 34,679 | 34,680 | 34,681 | 34,682 | 34,683 | 34,684 | 34,685 | 34,686 | 34,687 | 34,688 |
| | 2-439 | 34,701 | 34,702 | 34,703 | 34,704 | 34,705 | 34,706 | 34,707 | 34,708 | 34,709 | 34,710 | 34,711 | 34,712 | 34,713 |
| | 2-440 | 34,726 | 34,727 | 34,728 | 34,729 | 34,730 | 34,731 | 34,732 | 34,733 | 34,734 | 34,735 | 34,736 | 34,737 | 34,738 |

| | | Compound represented by the formula (1) | | | | | | | | | | | |
|---|---|---|---|---|---|---|---|---|---|---|---|---|---|
| | | 1-64 | 1-65 | 1-66 | 1-67 | 1-68 | 1-69 | 1-70 | 1-71 | 1-72 | 1-73 | 1-74 | 1-75 |
| Compound | 2-386 | 33,389 | 33,390 | 33,391 | 33,392 | 33,393 | 33,394 | 33,395 | 33,396 | 33,397 | 33,398 | 33,399 | 33,400 |
| represented | 2-387 | 33,414 | 33,415 | 33,416 | 33,417 | 33,418 | 33,419 | 33,420 | 33,421 | 33,422 | 33,423 | 33,424 | 33,425 |
| by the | 2-388 | 33,439 | 33,440 | 33,441 | 33,442 | 33,443 | 33,444 | 33,445 | 33,446 | 33,447 | 33,448 | 33,449 | 33,450 |
| formula | 2-389 | 33,464 | 33,465 | 33,466 | 33,467 | 33,468 | 33,469 | 33,470 | 33,471 | 33,472 | 33,473 | 33,474 | 33,475 |
| (2) | 2-390 | 33,489 | 33,490 | 33,491 | 33,492 | 33,493 | 33,494 | 33,495 | 33,496 | 33,497 | 33,498 | 33,499 | 33,500 |
| | 2-391 | 33,514 | 33,515 | 33,516 | 33,517 | 33,518 | 33,519 | 33,520 | 33,521 | 33,522 | 33,523 | 33,524 | 33,525 |
| | 2-392 | 33,539 | 33,540 | 33,541 | 33,542 | 33,543 | 33,544 | 33,545 | 33,546 | 33,547 | 33,548 | 33,549 | 33,550 |
| | 2-393 | 33,564 | 33,565 | 33,566 | 33,567 | 33,568 | 33,569 | 33,570 | 33,571 | 33,572 | 33,573 | 33,574 | 33,575 |
| | 2-394 | 33,589 | 33,590 | 33,591 | 33,592 | 33,593 | 33,594 | 33,595 | 33,596 | 33,597 | 33,598 | 33,599 | 33,600 |
| | 2-395 | 33,614 | 33,615 | 33,616 | 33,617 | 33,618 | 33,619 | 33,620 | 33,621 | 33,622 | 33,623 | 33,624 | 33,625 |
| | 2-396 | 33,639 | 33,640 | 33,641 | 33,642 | 33,643 | 33,644 | 33,645 | 33,646 | 33,647 | 33,648 | 33,649 | 33,650 |
| | 2-397 | 33,664 | 33,665 | 33,666 | 33,667 | 33,668 | 33,669 | 33,670 | 33,671 | 33,672 | 33,673 | 33,674 | 33,675 |
| | 2-398 | 33,689 | 33,690 | 33,691 | 33,692 | 33,693 | 33,694 | 33,695 | 33,696 | 33,697 | 33,698 | 33,699 | 33,700 |
| | 2-399 | 33,714 | 33,715 | 33,716 | 33,717 | 33,718 | 33,719 | 33,720 | 33,721 | 33,722 | 33,723 | 33,724 | 33,725 |
| | 2-400 | 33,739 | 33,740 | 33,741 | 33,742 | 33,743 | 33,744 | 33,745 | 33,746 | 33,747 | 33,748 | 33,749 | 33,750 |
| | 2-401 | 33,764 | 33,765 | 33,766 | 33,767 | 33,768 | 33,769 | 33,770 | 33,771 | 33,772 | 33,773 | 33,774 | 33,775 |

TABLE 26-continued

| | | | | | | | | | | | | |
|---|---|---|---|---|---|---|---|---|---|---|---|---|
| 2-402 | 33,789 | 33,790 | 33,791 | 33,792 | 33,793 | 33,794 | 33,795 | 33,796 | 33,797 | 33,798 | 33,799 | 33,800 |
| 2-403 | 33,814 | 33,815 | 33,816 | 33,817 | 33,817 | 33,818 | 33,819 | 33,820 | 33,821 | 33,822 | 33,823 | 33,824 |
| 2-404 | 33,839 | 33,840 | 33,841 | 33,842 | 33,843 | 33,844 | 33,845 | 33,846 | 33,847 | 33,848 | 33,849 | 33,850 |
| 2-405 | 33,864 | 33,865 | 33,866 | 33,867 | 33,868 | 33,869 | 33,870 | 33,871 | 33,872 | 33,873 | 33,874 | 33,875 |
| 2-406 | 33,889 | 33,890 | 33,891 | 33,892 | 33,893 | 33,894 | 33,895 | 33,896 | 33,897 | 33,898 | 33,899 | 33,900 |
| 2-407 | 33,914 | 33,915 | 33,916 | 33,917 | 33,918 | 33,919 | 33,920 | 33,921 | 33,922 | 33,923 | 33,924 | 33,925 |
| 2-408 | 33,939 | 33,940 | 33,941 | 33,942 | 33,943 | 33,944 | 33,945 | 33,946 | 33,947 | 33,948 | 33,949 | 33,950 |
| 2-409 | 33,964 | 33,965 | 33,966 | 33,967 | 33,968 | 33,969 | 33,970 | 33,971 | 33,972 | 33,973 | 33,974 | 33,975 |
| 2-410 | 33,989 | 33,990 | 33,991 | 33,992 | 33,993 | 33,994 | 33,995 | 33,996 | 33,997 | 33,998 | 33,999 | 34,000 |
| 2-411 | 34,014 | 34,015 | 34,016 | 34,017 | 34,018 | 34,019 | 34,020 | 34,021 | 34,022 | 34,023 | 34,024 | 34,025 |
| 2-412 | 34,039 | 34,040 | 34,041 | 34,042 | 34,043 | 34,044 | 34,045 | 34,046 | 34,047 | 34,048 | 34,049 | 34,050 |
| 2-413 | 34,064 | 34,065 | 34,066 | 34,067 | 34,068 | 34,069 | 34,070 | 34,071 | 34,072 | 34,073 | 34,074 | 34,075 |
| 2-414 | 34,089 | 34,090 | 34,091 | 34,092 | 34,093 | 34,094 | 34,095 | 34,096 | 34,097 | 34,098 | 34,099 | 34,100 |
| 2-415 | 34,114 | 34,115 | 34,116 | 34,117 | 34,118 | 34,119 | 34,120 | 34,121 | 34,122 | 34,123 | 34,124 | 34,125 |
| 2-416 | 34,139 | 34,140 | 34,141 | 34,142 | 34,143 | 34,144 | 34,145 | 34,146 | 34,147 | 34,148 | 34,149 | 34,150 |
| 2-417 | 34,164 | 34,165 | 34,166 | 34,167 | 34,168 | 34,169 | 34,170 | 34,171 | 34,172 | 34,173 | 34,174 | 34,175 |
| 2-418 | 34,189 | 34,190 | 34,191 | 34,192 | 34,193 | 34,194 | 34,195 | 34,196 | 34,197 | 34,198 | 34,199 | 34,200 |
| 2-419 | 34,214 | 34,215 | 34,216 | 34,217 | 34,218 | 34,219 | 34,220 | 34,221 | 34,222 | 34,223 | 34,224 | 34,225 |
| 2-420 | 34,239 | 34,240 | 34,241 | 34,242 | 34,243 | 34,244 | 34,245 | 34,246 | 34,247 | 34,248 | 34,249 | 34,250 |
| 2-421 | 34,264 | 34,265 | 34,266 | 34,267 | 34,268 | 34,269 | 34,270 | 34,271 | 34,272 | 34,273 | 34,274 | 34,275 |
| 2-422 | 34,289 | 34,290 | 34,291 | 34,292 | 34,293 | 34,294 | 34,295 | 34,296 | 34,297 | 34,298 | 34,299 | 34,300 |
| 2-423 | 34,314 | 34,315 | 34,316 | 34,317 | 34,318 | 34,319 | 34,320 | 34,321 | 34,322 | 34,323 | 34,324 | 34,325 |
| 2-434 | 34,339 | 34,340 | 34,341 | 34,342 | 34,343 | 34,344 | 34,345 | 34,346 | 34,347 | 34,348 | 34,349 | 34,350 |
| 2-425 | 34,364 | 34,365 | 34,366 | 34,367 | 34,368 | 34,369 | 34,370 | 34,371 | 34,372 | 34,373 | 34,374 | 34,375 |
| 2-426 | 34,389 | 34,390 | 34,391 | 34,392 | 34,393 | 34,394 | 34,395 | 34,396 | 34,397 | 34,398 | 34,399 | 34,400 |
| 2-427 | 34,414 | 34,415 | 34,416 | 34,417 | 34,418 | 34,419 | 34,420 | 34,421 | 34,422 | 34,423 | 34,424 | 34,425 |
| 2-428 | 34,439 | 34,440 | 34,441 | 34,442 | 34,443 | 34,444 | 34,445 | 34,446 | 34,447 | 34,448 | 34,449 | 34,450 |
| 2-429 | 34,464 | 34,465 | 34,466 | 34,467 | 34,468 | 34,469 | 34,470 | 34,471 | 34,472 | 34,473 | 34,474 | 34,475 |
| 2-430 | 34,489 | 34,490 | 34,491 | 34,492 | 34,493 | 34,494 | 34,495 | 34,496 | 34,497 | 34,498 | 34,499 | 34,500 |
| 2-431 | 34,514 | 34,515 | 34,516 | 34,517 | 34,518 | 34,519 | 34,520 | 34,521 | 34,522 | 34,523 | 34,524 | 34,525 |
| 2-432 | 34,539 | 34,540 | 34,541 | 34,542 | 34,543 | 34,544 | 34,545 | 34,546 | 34,547 | 34,548 | 34,549 | 34,550 |
| 2-433 | 34,564 | 34,565 | 34,566 | 34,567 | 34,568 | 34,569 | 34,570 | 34,571 | 34,572 | 34,573 | 34,574 | 34,575 |
| 2-434 | 34,589 | 34,590 | 34,591 | 34,592 | 34,593 | 34,594 | 34,595 | 34,596 | 34,597 | 34,598 | 34,599 | 34,600 |
| 2-435 | 34,614 | 34,615 | 34,616 | 34,617 | 34,618 | 34,619 | 34,620 | 34,621 | 34,622 | 34,623 | 34,624 | 34,625 |
| 2-436 | 34,639 | 34,640 | 34,641 | 34,642 | 34,643 | 34,644 | 34,645 | 34,646 | 34,647 | 34,648 | 34,649 | 34,650 |
| 2-437 | 34,664 | 34,665 | 34,666 | 34,667 | 34,668 | 34,669 | 34,670 | 34,671 | 34,672 | 34,673 | 34,674 | 34,675 |
| 2-438 | 34,689 | 34,690 | 34,691 | 34,692 | 34,693 | 34,694 | 34,695 | 34,696 | 34,697 | 34,698 | 34,699 | 34,700 |
| 2-439 | 34,714 | 34,715 | 34,716 | 34,717 | 34,718 | 34,719 | 34,720 | 34,721 | 34,722 | 34,723 | 34,724 | 34,725 |
| 2-440 | 34,739 | 34,740 | 34,741 | 34,742 | 34,743 | 34,744 | 34,745 | 34,746 | 34,747 | 34,748 | 34,749 | 34,750 |

TABLE 27

| | | Compound represented by the formula (1) | | | | | | | | | | | | |
|---|---|---|---|---|---|---|---|---|---|---|---|---|---|---|
| | | 1-51 | 1-52 | 1-53 | 1-54 | 1-55 | 1-56 | 1-57 | 1-58 | 1-59 | 1-60 | 1-61 | 1-62 | 1-63 |
| Compound represented by the formula (2) | 2-441 | 34,751 | 34,752 | 34,753 | 34,754 | 34,755 | 34,756 | 34,757 | 34,758 | 34,759 | 34,760 | 34,761 | 34,762 | 34,763 |
| | 2-442 | 34,776 | 34,777 | 34,778 | 34,779 | 34,780 | 34,781 | 34,782 | 34,783 | 34,784 | 34,785 | 34,786 | 34,787 | 34,788 |
| | 2-443 | 34,801 | 34,802 | 34,803 | 34,804 | 34,805 | 34,806 | 34,807 | 34,808 | 34,809 | 34,810 | 34,811 | 34,812 | 34,813 |
| | 2-444 | 34,826 | 34,827 | 34,828 | 34,829 | 34,830 | 34,831 | 34,832 | 34,833 | 34,834 | 34,835 | 34,836 | 34,837 | 34,838 |
| | 2-445 | 34,851 | 34,852 | 34,853 | 34,854 | 34,855 | 34,856 | 34,857 | 34,858 | 34,859 | 34,860 | 34,861 | 34,862 | 34,863 |
| | 2-446 | 34,876 | 34,877 | 34,878 | 34,879 | 34,880 | 34,881 | 34,882 | 34,883 | 34,884 | 34,885 | 34,886 | 34,887 | 34,888 |
| | 2-447 | 34,901 | 34,902 | 34,903 | 34,904 | 34,905 | 34,906 | 34,907 | 34,908 | 34,909 | 34,910 | 34,911 | 34,912 | 34,913 |
| | 2-448 | 34,926 | 34,927 | 34,928 | 34,929 | 34,930 | 34,931 | 34,932 | 34,933 | 34,934 | 34,935 | 34,936 | 34,937 | 34,938 |
| | 2-449 | 34,951 | 34,952 | 34,953 | 34,954 | 34,955 | 34,956 | 34,957 | 34,958 | 34,959 | 34,960 | 34,961 | 34,962 | 34,963 |
| | 2-450 | 34,976 | 34,977 | 34,978 | 34,979 | 34,980 | 34,981 | 34,982 | 34,983 | 34,984 | 34,985 | 34,986 | 34,987 | 34,988 |
| | 2-451 | 35,001 | 35,002 | 35,003 | 35,004 | 35,005 | 35,006 | 35,007 | 35,008 | 35,009 | 35,010 | 35,011 | 35,012 | 35,013 |
| | 2-452 | 35,026 | 35,027 | 35,028 | 35,029 | 35,030 | 35,031 | 35,032 | 35,033 | 35,034 | 35,035 | 35,036 | 35,037 | 35,038 |
| | 2-453 | 35,051 | 35,052 | 35,053 | 35,054 | 35,055 | 35,056 | 35,057 | 35,058 | 35,059 | 35,060 | 35,061 | 35,062 | 35,063 |
| | 2-454 | 35,076 | 35,077 | 35,078 | 35,079 | 35,080 | 35,081 | 35,082 | 35,083 | 35,084 | 35,085 | 35,086 | 35,087 | 35,088 |
| | 2-455 | 35,101 | 35,102 | 35,103 | 35,104 | 35,105 | 35,106 | 35,107 | 35,108 | 35,109 | 35,110 | 35,111 | 35,112 | 35,113 |
| | 2-456 | 35,126 | 35,127 | 35,128 | 35,129 | 35,130 | 35,131 | 35,132 | 35,133 | 35,134 | 35,135 | 35,136 | 35,137 | 35,138 |
| | 2-457 | 35,151 | 35,152 | 35,153 | 35,154 | 35,155 | 35,156 | 35,157 | 35,158 | 35,159 | 35,160 | 35,161 | 35,162 | 35,163 |
| | 2-458 | 35,176 | 35,177 | 35,178 | 35,179 | 35,180 | 35,181 | 35,182 | 35,183 | 35,184 | 35,185 | 35,186 | 35,187 | 35,188 |
| | 2-459 | 35,201 | 35,202 | 35,203 | 35,204 | 35,205 | 35,206 | 35,207 | 35,208 | 35,209 | 35,210 | 35,211 | 35,212 | 35,213 |
| | 2-460 | 35,226 | 35,227 | 35,228 | 35,229 | 35,230 | 35,231 | 35,232 | 35,233 | 35,234 | 35,235 | 35,236 | 35,237 | 35,238 |
| | 2-461 | 35,251 | 35,252 | 35,253 | 35,254 | 35,255 | 35,256 | 35,257 | 35,258 | 35,259 | 35,260 | 35,261 | 35,262 | 35,263 |
| | 2-462 | 35,276 | 35,277 | 35,278 | 35,279 | 35,280 | 35,281 | 35,282 | 35,283 | 35,284 | 35,285 | 35,286 | 35,287 | 35,288 |
| | 2-463 | 35,301 | 35,302 | 35,303 | 35,304 | 35,305 | 35,306 | 35,307 | 35,308 | 35,309 | 35,310 | 35,311 | 35,312 | 35,313 |
| | 2-464 | 35,326 | 35,327 | 35,328 | 35,329 | 35,330 | 35,331 | 35,332 | 35,333 | 35,334 | 35,335 | 35,336 | 35,337 | 35,338 |
| | 2-465 | 35,351 | 35,352 | 35,353 | 35,354 | 35,355 | 35,356 | 35,357 | 35,358 | 35,359 | 35,360 | 35,361 | 35,362 | 35,363 |
| | 2-466 | 35,376 | 35,377 | 35,378 | 35,379 | 35,380 | 35,381 | 35,382 | 35,383 | 35,384 | 35,385 | 35,386 | 35,387 | 35,388 |
| | 2-467 | 35,401 | 35,402 | 35,403 | 35,404 | 35,405 | 35,406 | 35,407 | 35,408 | 35,409 | 35,410 | 35,411 | 35,412 | 35,413 |
| | 2-468 | 35,426 | 35,427 | 35,428 | 35,429 | 35,430 | 35,431 | 35,432 | 35,433 | 35,434 | 35,435 | 35,436 | 35,437 | 35,438 |
| | 2-469 | 35,451 | 35,452 | 35,453 | 35,454 | 35,455 | 35,456 | 35,457 | 35,458 | 35,459 | 35,460 | 35,461 | 35,462 | 35,463 |
| | 2-470 | 35,476 | 35,477 | 35,478 | 35,479 | 35,480 | 35,481 | 35,482 | 35,483 | 35,484 | 35,485 | 35,486 | 35,487 | 35,488 |
| | 2-471 | 35,501 | 35,502 | 35,503 | 35,504 | 35,505 | 35,506 | 35,507 | 35,508 | 35,509 | 35,510 | 35,511 | 35,512 | 35,513 |

TABLE 27-continued

| | | | | | | | | | | | | | | |
|---|---|---|---|---|---|---|---|---|---|---|---|---|---|---|
| | 2-472 | 35,526 | 35,527 | 35,528 | 35,529 | 35,530 | 35,531 | 35,532 | 35,533 | 35,534 | 35,535 | 35,536 | 35,537 | 35,538 |
| | 2-473 | 35,551 | 35,552 | 35,553 | 35,554 | 35,555 | 35,556 | 35,557 | 35,558 | 35,559 | 35,560 | 35,561 | 35,562 | 35,563 |
| | 2-474 | 35,576 | 35,577 | 35,578 | 35,579 | 35,580 | 35,581 | 35,582 | 35,583 | 35,584 | 35,585 | 35,586 | 35,587 | 35,588 |
| | 2-475 | 35,601 | 35,602 | 35,603 | 35,604 | 35,605 | 35,606 | 35,607 | 35,608 | 35,609 | 35,610 | 35,611 | 35,612 | 35,613 |

| | | Compound represented by the formula (1) | | | | | | | | | | | |
|---|---|---|---|---|---|---|---|---|---|---|---|---|---|
| | | 1-64 | 1-65 | 1-66 | 1-67 | 1-68 | 1-69 | 1-70 | 1-71 | 1-72 | 1-73 | 1-74 | 1-75 |
| Compound represented by the formula (2) | 2-441 | 34,764 | 34,765 | 34,766 | 34,767 | 34,768 | 34,769 | 34,770 | 34,771 | 34,772 | 34,773 | 34,774 | 34,775 |
| | 2-442 | 34,789 | 34,790 | 34,791 | 34,792 | 34,793 | 34,794 | 34,795 | 34,796 | 34,797 | 34,798 | 34,799 | 34,800 |
| | 2-443 | 34,814 | 34,815 | 34,816 | 34,817 | 34,818 | 34,819 | 34,820 | 34,821 | 34,822 | 34,823 | 34,824 | 34,825 |
| | 2-444 | 34,839 | 34,840 | 34,841 | 34,842 | 34,843 | 34,844 | 34,845 | 34,846 | 34,847 | 34,848 | 34,849 | 34,850 |
| | 2-445 | 34,864 | 34,865 | 34,866 | 34,867 | 34,868 | 34,869 | 34,870 | 34,871 | 34,872 | 34,873 | 34,874 | 34,875 |
| | 2-446 | 34,889 | 34,890 | 34,891 | 34,892 | 34,893 | 34,894 | 34,895 | 34,896 | 34,897 | 34,898 | 34,899 | 34,900 |
| | 2-447 | 34,914 | 34,915 | 34,916 | 34,917 | 34,918 | 34,919 | 34,920 | 34,921 | 34,922 | 34,923 | 34,924 | 34,925 |
| | 2-448 | 34,939 | 34,940 | 34,941 | 34,942 | 34,943 | 34,944 | 34,945 | 34,946 | 34,947 | 34,948 | 34,949 | 34,950 |
| | 2-449 | 34,964 | 34,965 | 34,966 | 34,967 | 34,968 | 34,969 | 34,970 | 34,971 | 34,972 | 34,973 | 34,974 | 34,975 |
| | 2-450 | 34,989 | 34,990 | 34,991 | 34,992 | 34,993 | 34,994 | 34,995 | 34,996 | 34,997 | 34,998 | 34,999 | 35,000 |
| | 2-451 | 35,014 | 35,015 | 35,016 | 35,017 | 35,018 | 35,019 | 35,020 | 35,021 | 35,022 | 35,023 | 35,024 | 35,025 |
| | 2-452 | 35,039 | 35,040 | 35,041 | 35,042 | 35,043 | 35,044 | 35,045 | 35,046 | 35,047 | 35,048 | 35,049 | 35,050 |
| | 2-453 | 35,064 | 35,065 | 35,066 | 35,067 | 35,068 | 35,069 | 35,070 | 35,071 | 35,072 | 35,073 | 35,074 | 35,075 |
| | 2-454 | 35,089 | 35,090 | 35,091 | 35,092 | 35,093 | 35,094 | 35,095 | 35,096 | 35,097 | 35,098 | 35,099 | 35,100 |
| | 2-455 | 35,114 | 35,115 | 35,116 | 35,117 | 35,118 | 35,119 | 35,120 | 35,121 | 35,122 | 35,123 | 35,124 | 35,125 |
| | 2-456 | 35,139 | 35,140 | 35,141 | 35,142 | 35,143 | 35,144 | 35,145 | 35,146 | 35,147 | 35,148 | 35,149 | 35,150 |
| | 2-457 | 35,164 | 35,165 | 35,166 | 35,167 | 35,168 | 35,169 | 35,170 | 35,171 | 35,172 | 35,173 | 35,174 | 35,175 |
| | 2-458 | 35,189 | 35,190 | 35,191 | 35,192 | 35,193 | 35,194 | 35,195 | 35,196 | 35,197 | 35,198 | 35,199 | 35,200 |
| | 2-459 | 35,214 | 35,215 | 35,216 | 35,217 | 35,218 | 35,219 | 35,220 | 35,221 | 35,222 | 35,223 | 35,224 | 35,225 |
| | 2-460 | 35,239 | 35,240 | 35,241 | 35,242 | 35,243 | 35,244 | 35,245 | 35,246 | 35,247 | 35,248 | 35,249 | 35,250 |
| | 2-461 | 35,264 | 35,265 | 35,266 | 35,267 | 35,268 | 35,269 | 35,270 | 35,271 | 35,272 | 35,273 | 35,274 | 35,275 |
| | 2-462 | 35,289 | 35,290 | 35,291 | 35,292 | 35,293 | 35,294 | 35,295 | 35,296 | 35,297 | 35,298 | 35,299 | 35,300 |
| | 2-463 | 35,314 | 35,315 | 35,316 | 35,317 | 35,318 | 35,319 | 35,320 | 35,321 | 35,322 | 35,323 | 35,324 | 35,325 |
| | 2-464 | 35,339 | 35,340 | 35,341 | 35,342 | 35,343 | 35,344 | 35,345 | 35,346 | 35,347 | 35,348 | 35,349 | 35,350 |
| | 2-465 | 35,364 | 35,365 | 35,366 | 35,367 | 35,368 | 35,369 | 35,370 | 35,371 | 35,372 | 35,373 | 35,374 | 35,375 |
| | 2-466 | 35,389 | 35,390 | 35,391 | 35,392 | 35,393 | 35,394 | 35,395 | 35,396 | 35,397 | 35,398 | 35,399 | 35,400 |
| | 2-467 | 35,414 | 35,415 | 35,416 | 35,417 | 35,418 | 35,419 | 35,420 | 35,421 | 35,422 | 35,423 | 35,424 | 35,425 |
| | 2-468 | 35,439 | 35,440 | 35,441 | 35,442 | 35,443 | 35,444 | 35,445 | 35,446 | 35,447 | 35,448 | 35,449 | 35,450 |
| | 2-469 | 35,464 | 35,465 | 35,466 | 35,467 | 35,468 | 35,469 | 35,470 | 35,471 | 35,472 | 35,473 | 35,474 | 35,475 |
| | 2-470 | 35,489 | 35,490 | 35,491 | 35,492 | 35,493 | 35,494 | 35,495 | 35,496 | 35,497 | 35,498 | 35,499 | 35,500 |
| | 2-471 | 35,514 | 35,515 | 35,516 | 35,517 | 35,518 | 35,519 | 35,520 | 35,521 | 35,522 | 35,523 | 35,524 | 35,525 |
| | 2-472 | 35,539 | 35,540 | 35,541 | 35,542 | 35,543 | 35,544 | 35,545 | 35,546 | 35,547 | 35,548 | 35,549 | 35,550 |
| | 2-473 | 35,564 | 35,565 | 35,566 | 35,567 | 35,568 | 35,569 | 35,570 | 35,571 | 35,572 | 35,573 | 35,574 | 35,575 |
| | 2-474 | 35,589 | 35,590 | 35,591 | 35,592 | 35,593 | 35,594 | 35,595 | 35,596 | 35,597 | 35,598 | 35,599 | 35,600 |
| | 2-475 | 35,614 | 35,615 | 35,616 | 35,617 | 35,618 | 35,619 | 35,620 | 35,621 | 35,622 | 35,623 | 35,624 | 35,625 |

TABLE 28

| | | Compound represented by the formula (1) | | | | | | | | | | | | |
|---|---|---|---|---|---|---|---|---|---|---|---|---|---|---|
| | | 1-76 | 1-77 | 1-78 | 1-79 | 1-80 | 1-81 | 1-82 | 1-83 | 1-84 | 1-85 | 1-86 | 1-87 | 1-88 |
| Compound represented by the formula (2) | 2-1 | 35,626 | 35,627 | 35,628 | 35,629 | 35,630 | 35,631 | 35,632 | 35,633 | 35,634 | 35,635 | 35,636 | 35,637 | 35,638 |
| | 2-2 | 35,651 | 35,652 | 35,653 | 35,654 | 35,655 | 35,656 | 35,657 | 35,658 | 35,659 | 35,660 | 35,661 | 35,662 | 35,663 |
| | 2-3 | 35,676 | 35,677 | 35,678 | 35,679 | 35,680 | 35,681 | 35,682 | 35,683 | 35,684 | 35,685 | 35,686 | 35,687 | 35,688 |
| | 2-4 | 35,701 | 35,702 | 35,703 | 35,704 | 35,705 | 35,706 | 35,707 | 35,708 | 35,709 | 35,710 | 35,711 | 35,712 | 35,713 |
| | 2-5 | 35,726 | 35,727 | 35,728 | 35,729 | 35,730 | 35,731 | 35,732 | 35,733 | 35,734 | 35,735 | 35,736 | 35,737 | 35,738 |
| | 2-6 | 35,751 | 35,752 | 35,753 | 35,754 | 35,755 | 35,756 | 35,757 | 35,758 | 35,759 | 35,760 | 35,761 | 35,762 | 35,763 |
| | 2-7 | 35,776 | 35,777 | 35,778 | 35,779 | 35,780 | 35,781 | 35,782 | 35,783 | 35,784 | 35,785 | 35,786 | 35,787 | 35,788 |
| | 2-8 | 35,801 | 35,802 | 35,803 | 35,804 | 35,805 | 35,806 | 35,807 | 35,808 | 35,809 | 35,810 | 35,811 | 35,812 | 35,813 |
| | 2-9 | 35,826 | 35,827 | 35,828 | 35,829 | 35,830 | 35,831 | 35,832 | 35,833 | 35,834 | 35,835 | 35,836 | 35,837 | 35,838 |
| | 2-10 | 35,851 | 35,852 | 35,853 | 35,854 | 35,855 | 35,856 | 35,857 | 35,858 | 35,859 | 35,860 | 35,861 | 35,862 | 35,863 |
| | 2-11 | 35,876 | 35,877 | 35,878 | 35,879 | 35,880 | 35,881 | 35,882 | 35,883 | 35,884 | 35,885 | 35,886 | 35,887 | 35,888 |
| | 2-12 | 35,901 | 35,902 | 35,903 | 35,904 | 35,905 | 35,906 | 35,907 | 35,908 | 35,909 | 35,910 | 35,911 | 35,912 | 35,913 |
| | 2-13 | 35,926 | 35,927 | 35,928 | 35,929 | 35,930 | 35,931 | 35,932 | 35,933 | 35,934 | 35,935 | 35,936 | 35,937 | 35,938 |
| | 2-14 | 35,951 | 35,952 | 35,953 | 35,954 | 35,955 | 35,956 | 35,957 | 35,958 | 35,959 | 35,960 | 35,961 | 35,962 | 35,963 |
| | 2-15 | 35,976 | 35,977 | 35,978 | 35,979 | 35,980 | 35,981 | 35,982 | 35,983 | 35,984 | 35,985 | 35,986 | 35,987 | 35,988 |
| | 2-16 | 36,001 | 36,002 | 36,003 | 36,004 | 36,005 | 36,006 | 36,007 | 36,008 | 36,009 | 36,010 | 36,011 | 36,012 | 36,013 |
| | 2-17 | 36,026 | 36,027 | 36,028 | 36,029 | 36,030 | 36,031 | 36,032 | 36,033 | 36,034 | 36,035 | 36,036 | 36,037 | 36,038 |
| | 2-18 | 36,051 | 36,052 | 36,053 | 36,054 | 36,055 | 36,056 | 36,057 | 36,058 | 36,059 | 36,060 | 36,061 | 36,062 | 36,063 |
| | 2-19 | 36,076 | 36,077 | 36,078 | 36,079 | 36,080 | 36,081 | 36,082 | 36,083 | 36,084 | 36,085 | 36,086 | 36,087 | 36,088 |
| | 2-20 | 36,101 | 36,102 | 36,103 | 36,104 | 36,105 | 36,106 | 36,107 | 36,108 | 36,109 | 36,110 | 36,111 | 36,112 | 36,113 |
| | 2-21 | 36,126 | 36,127 | 36,128 | 36,129 | 36,130 | 36,131 | 36,132 | 36,133 | 36,134 | 36,135 | 36,136 | 36,137 | 36,138 |
| | 2-22 | 36,151 | 36,152 | 36,153 | 36,154 | 36,155 | 36,156 | 36,157 | 36,158 | 36,159 | 36,160 | 36,161 | 36,162 | 36,163 |
| | 2-23 | 36,176 | 36,177 | 36,178 | 36,179 | 36,180 | 36,181 | 36,182 | 36,183 | 36,184 | 36,185 | 36,186 | 36,187 | 36,188 |
| | 2-24 | 36,201 | 36,202 | 36,203 | 36,204 | 36,205 | 36,206 | 36,207 | 36,208 | 36,209 | 36,210 | 36,211 | 36,212 | 36,213 |
| | 2-25 | 36,226 | 36,227 | 36,228 | 36,229 | 36,230 | 36,231 | 36,232 | 36,233 | 36,234 | 36,235 | 36,236 | 36,237 | 36,238 |
| | 2-26 | 36,251 | 36,252 | 36,253 | 36,254 | 36,255 | 36,256 | 36,257 | 36,258 | 36,259 | 36,260 | 36,261 | 36,262 | 36,263 |

TABLE 28-continued

| | | | | | | | | | | | | | |
|---|---|---|---|---|---|---|---|---|---|---|---|---|---|
| 2-27 | 36,276 | 36,277 | 36,278 | 36,279 | 36,280 | 36,281 | 36,282 | 36,283 | 36,284 | 36,285 | 36,286 | 36,287 | 36,288 |
| 2-28 | 36,301 | 36,302 | 36,303 | 36,304 | 36,305 | 36,306 | 36,307 | 36,308 | 36,309 | 36,310 | 36,311 | 36,312 | 36,313 |
| 2-29 | 36,326 | 36,327 | 36,328 | 36,329 | 36,330 | 36,331 | 36,332 | 36,333 | 36,334 | 36,335 | 36,336 | 36,337 | 36,338 |
| 2-30 | 36,351 | 36,352 | 36,353 | 36,354 | 36,355 | 36,356 | 36,357 | 36,358 | 36,359 | 36,360 | 36,361 | 36,362 | 36,363 |
| 2-31 | 36,376 | 36,377 | 36,378 | 36,379 | 36,380 | 36,381 | 36,382 | 36,383 | 36,384 | 36,385 | 36,386 | 36,387 | 36,388 |
| 2-32 | 36,401 | 36,402 | 36,403 | 36,404 | 36,405 | 36,406 | 36,407 | 36,408 | 36,409 | 36,410 | 36,411 | 36,412 | 36,413 |
| 2-33 | 36,426 | 36,427 | 36,428 | 36,429 | 36,430 | 36,431 | 36,432 | 36,433 | 36,434 | 36,435 | 36,436 | 36,437 | 36,438 |
| 2-34 | 36,451 | 36,452 | 36,453 | 36,454 | 36,455 | 36,456 | 36,457 | 36,458 | 36,459 | 36,460 | 36,461 | 36,462 | 36,463 |
| 2-35 | 36,476 | 36,477 | 36,478 | 36,479 | 36,480 | 36,481 | 36,482 | 36,483 | 36,484 | 36,485 | 36,486 | 36,487 | 36,488 |
| 2-36 | 36,501 | 36,502 | 36,503 | 36,504 | 36,505 | 36,506 | 36,507 | 36,508 | 36,509 | 36,510 | 36,511 | 36,512 | 36,513 |
| 2-37 | 36,526 | 36,527 | 36,528 | 36,529 | 36,530 | 36,531 | 36,532 | 36,533 | 36,534 | 36,535 | 36,536 | 36,537 | 36,538 |
| 2-38 | 36,551 | 36,552 | 36,553 | 36,554 | 36,555 | 36,556 | 36,557 | 36,558 | 36,559 | 36,560 | 36,561 | 36,562 | 36,563 |
| 2-39 | 36,576 | 36,577 | 36,578 | 36,579 | 36,580 | 36,581 | 36,582 | 36,583 | 36,584 | 36,585 | 36,586 | 36,587 | 36,588 |
| 2-40 | 36,601 | 36,602 | 36,603 | 36,604 | 36,605 | 36,606 | 36,607 | 36,608 | 36,609 | 36,610 | 36,611 | 36,612 | 36,613 |
| 2-41 | 36,626 | 36,627 | 36,628 | 36,629 | 36,630 | 36,631 | 36,632 | 36,633 | 36,634 | 36,635 | 36,636 | 36,637 | 36,638 |
| 2-42 | 36,651 | 36,652 | 36,653 | 36,654 | 36,655 | 36,656 | 36,657 | 36,658 | 36,659 | 36,660 | 36,661 | 36,662 | 36,663 |
| 2-43 | 36,676 | 36,677 | 36,678 | 36,679 | 36,680 | 36,681 | 36,682 | 36,683 | 36,684 | 36,685 | 36,686 | 36,687 | 36,688 |
| 2-44 | 36,701 | 36,702 | 36,703 | 36,704 | 36,705 | 36,706 | 36,707 | 36,708 | 36,709 | 36,710 | 36,711 | 36,712 | 36,713 |
| 2-45 | 36,726 | 36,727 | 36,728 | 36,729 | 36,730 | 36,731 | 36,732 | 36,733 | 36,734 | 36,735 | 36,736 | 36,737 | 36,738 |
| 2-46 | 36,751 | 36,752 | 36,753 | 36,754 | 36,755 | 36,756 | 36,757 | 36,758 | 36,759 | 36,760 | 36,761 | 36,762 | 36,763 |
| 2-47 | 36,776 | 36,777 | 36,778 | 36,779 | 36,780 | 36,781 | 36,782 | 36,783 | 36,784 | 36,785 | 36,786 | 36,787 | 36,788 |
| 2-48 | 36,801 | 36,802 | 36,803 | 36,804 | 36,805 | 36,806 | 36,807 | 36,808 | 36,809 | 36,810 | 36,811 | 36,812 | 36,813 |
| 2-49 | 36,826 | 36,827 | 36,828 | 36,829 | 36,830 | 36,831 | 36,832 | 36,833 | 36,834 | 36,835 | 36,836 | 36,837 | 36,838 |
| 2-50 | 36,851 | 36,852 | 36,853 | 36,854 | 36,855 | 36,856 | 36,857 | 36,858 | 36,859 | 36,860 | 36,861 | 36,862 | 36,863 |
| 2-51 | 36,876 | 36,877 | 36,878 | 36,879 | 36,880 | 36,881 | 36,882 | 36,883 | 36,884 | 36,885 | 36,886 | 36,887 | 36,888 |
| 2-52 | 36,901 | 36,902 | 36,903 | 36,904 | 36,905 | 36,906 | 36,907 | 36,908 | 36,909 | 36,910 | 36,911 | 36,912 | 36,913 |
| 2-53 | 36,926 | 36,927 | 36,928 | 36,929 | 36,930 | 36,931 | 36,932 | 36,933 | 36,934 | 36,935 | 36,936 | 36,937 | 36,938 |
| 2-54 | 36,951 | 36,952 | 36,953 | 36,954 | 36,955 | 36,956 | 36,957 | 36,958 | 36,959 | 36,960 | 36,961 | 36,962 | 36,963 |
| 2-55 | 36,976 | 36,977 | 36,978 | 36,979 | 36,980 | 36,981 | 36,982 | 36,983 | 36,984 | 36,985 | 36,986 | 36,987 | 36,988 |

| | | Compound represented by the formula (1) | | | | | | | | | | | |
|---|---|---|---|---|---|---|---|---|---|---|---|---|---|
| | | 1-89 | 1-90 | 1-91 | 1-92 | 1-93 | 1-94 | 1-95 | 1-96 | 1-97 | 1-98 | 1-99 | 1-100 |
| Compound represented by the formula (2) | 2-1 | 35,639 | 35,640 | 35,641 | 35,642 | 35,643 | 35,644 | 35,645 | 35,646 | 35,647 | 35,648 | 35,649 | 35,650 |
| | 2-2 | 35,664 | 35,665 | 35,666 | 35,667 | 35,668 | 35,669 | 35,670 | 35,671 | 35,672 | 35,673 | 35,674 | 35,675 |
| | 2-3 | 35,689 | 35,690 | 35,691 | 35,692 | 35,693 | 35,694 | 35,695 | 35,696 | 35,697 | 35,698 | 35,699 | 35,700 |
| | 2-4 | 35,714 | 35,715 | 35,716 | 35,717 | 35,718 | 35,719 | 35,720 | 35,721 | 35,722 | 35,723 | 35,724 | 35,725 |
| | 2-5 | 35,739 | 35,740 | 35,741 | 35,742 | 35,743 | 35,744 | 35,745 | 35,746 | 35,747 | 35,748 | 35,749 | 35,750 |
| | 2-6 | 35,764 | 35,765 | 35,766 | 35,767 | 35,768 | 35,769 | 35,770 | 35,771 | 35,772 | 35,773 | 35,774 | 35,775 |
| | 2-7 | 35,789 | 35,790 | 35,791 | 35,792 | 35,793 | 35,794 | 35,795 | 35,796 | 35,797 | 35,798 | 35,799 | 35,800 |
| | 2-8 | 35,814 | 35,815 | 35,816 | 35,817 | 35,818 | 35,819 | 35,820 | 35,821 | 35,822 | 35,823 | 35,824 | 35,825 |
| | 2-9 | 35,839 | 35,840 | 35,841 | 35,842 | 35,843 | 35,844 | 35,845 | 35,846 | 35,847 | 35,848 | 35,849 | 35,850 |
| | 2-10 | 35,864 | 35,865 | 35,866 | 35,867 | 35,868 | 35,869 | 35,870 | 35,871 | 35,872 | 35,873 | 35,874 | 35,875 |
| | 2-11 | 35,889 | 35,890 | 35,891 | 35,892 | 35,893 | 35,894 | 35,895 | 35,896 | 35,897 | 35,898 | 35,899 | 35,900 |
| | 2-12 | 35,914 | 35,915 | 35,916 | 35,917 | 35,918 | 35,919 | 35,920 | 35,921 | 35,922 | 35,923 | 35,924 | 35,925 |
| | 2-13 | 35,939 | 35,940 | 35,941 | 35,942 | 35,943 | 35,944 | 35,945 | 35,946 | 35,947 | 35,948 | 35,949 | 35,950 |
| | 2-14 | 35,964 | 35,965 | 35,966 | 35,967 | 35,968 | 35,969 | 35,970 | 35,971 | 35,972 | 35,973 | 35,974 | 35,975 |
| | 2-15 | 35,989 | 35,990 | 35,991 | 35,992 | 35,993 | 35,994 | 35,995 | 35,996 | 35,997 | 35,998 | 35,999 | 36,000 |
| | 2-16 | 36,014 | 36,015 | 36,016 | 36,017 | 36,018 | 36,019 | 36,020 | 36,021 | 36,022 | 36,023 | 36,024 | 36,025 |
| | 2-17 | 36,039 | 36,040 | 36,041 | 36,042 | 36,043 | 36,044 | 36,045 | 36,046 | 36,047 | 36,048 | 36,049 | 36,050 |
| | 2-18 | 36,064 | 36,065 | 36,066 | 36,067 | 36,068 | 36,069 | 36,070 | 36,071 | 36,072 | 36,073 | 36,074 | 36,075 |
| | 2-19 | 36,089 | 36,090 | 36,091 | 36,092 | 36,093 | 36,094 | 36,095 | 36,096 | 36,097 | 36,098 | 36,099 | 36,100 |
| | 2-20 | 36,114 | 36,115 | 36,116 | 36,117 | 36,118 | 36,119 | 36,120 | 36,121 | 36,122 | 36,123 | 36,124 | 36,125 |
| | 2-21 | 36,139 | 36,140 | 36,141 | 36,142 | 36,143 | 36,144 | 36,145 | 36,146 | 36,147 | 36,148 | 36,149 | 36,150 |
| | 2-22 | 36,164 | 36,165 | 36,166 | 36,167 | 36,168 | 36,169 | 36,170 | 36,171 | 36,172 | 36,173 | 36,174 | 36,175 |
| | 2-23 | 36,189 | 36,190 | 36,191 | 36,192 | 36,193 | 36,194 | 36,195 | 36,196 | 36,197 | 36,198 | 36,199 | 36,200 |
| | 2-24 | 36,214 | 36,215 | 36,216 | 36,217 | 36,218 | 36,219 | 36,220 | 36,221 | 36,222 | 36,223 | 36,224 | 36,225 |
| | 2-25 | 36,239 | 36,240 | 36,241 | 36,242 | 36,243 | 36,244 | 36,245 | 36,246 | 36,247 | 36,248 | 36,249 | 36,250 |
| | 2-26 | 36,264 | 36,265 | 36,266 | 36,267 | 36,268 | 36,269 | 36,270 | 36,271 | 36,272 | 36,273 | 36,274 | 36,275 |
| | 2-27 | 36,289 | 36,290 | 36,291 | 36,292 | 36,293 | 36,294 | 36,295 | 36,296 | 36,297 | 36,298 | 36,299 | 36,300 |
| | 2-28 | 36,314 | 36,315 | 36,316 | 36,317 | 36,318 | 36,319 | 36,320 | 36,321 | 36,322 | 36,323 | 36,324 | 36,325 |
| | 2-29 | 36,339 | 36,340 | 36,341 | 36,342 | 36,343 | 36,344 | 36,345 | 36,346 | 36,347 | 36,348 | 36,349 | 36,350 |
| | 2-30 | 36,364 | 36,365 | 36,366 | 36,367 | 36,368 | 36,369 | 36,370 | 36,371 | 36,372 | 36,373 | 36,374 | 36,375 |
| | 2-31 | 36,389 | 36,390 | 36,391 | 36,392 | 36,393 | 36,394 | 36,395 | 36,396 | 36,397 | 36,398 | 36,399 | 36,400 |
| | 2-32 | 36,414 | 36,415 | 36,416 | 36,417 | 36,418 | 36,419 | 36,420 | 36,421 | 36,422 | 36,423 | 36,424 | 36,425 |
| | 2-33 | 36,439 | 36,440 | 36,441 | 36,442 | 36,443 | 36,444 | 36,445 | 36,446 | 36,447 | 36,448 | 36,449 | 36,450 |
| | 2-34 | 36,464 | 36,465 | 36,466 | 36,467 | 36,468 | 36,469 | 36,470 | 36,471 | 36,472 | 36,473 | 36,474 | 36,475 |
| | 2-35 | 36,489 | 36,490 | 36,491 | 36,492 | 36,493 | 36,494 | 36,495 | 36,496 | 36,497 | 36,498 | 36,499 | 36,500 |
| | 2-36 | 36,514 | 36,515 | 36,516 | 36,517 | 36,518 | 36,519 | 36,520 | 36,521 | 36,522 | 36,523 | 36,524 | 36,525 |
| | 2-37 | 36,539 | 36,540 | 36,541 | 36,542 | 36,543 | 36,544 | 36,545 | 36,546 | 36,547 | 36,548 | 36,549 | 36,550 |
| | 2-38 | 36,564 | 36,565 | 36,566 | 36,567 | 36,568 | 36,569 | 36,570 | 36,571 | 36,572 | 36,573 | 36,574 | 36,575 |
| | 2-39 | 36,589 | 36,590 | 36,591 | 36,592 | 36,593 | 36,594 | 36,595 | 36,596 | 36,597 | 36,598 | 36,599 | 36,600 |
| | 2-40 | 36,614 | 36,615 | 36,616 | 36,617 | 36,618 | 36,619 | 36,620 | 36,621 | 36,622 | 36,623 | 36,624 | 36,625 |
| | 2-41 | 36,639 | 36,640 | 36,641 | 36,642 | 36,643 | 36,644 | 36,645 | 36,646 | 36,647 | 36,648 | 36,649 | 36,650 |
| | 2-42 | 36,664 | 36,665 | 36,666 | 36,667 | 36,668 | 36,669 | 36,670 | 36,671 | 36,672 | 36,673 | 36,674 | 36,675 |
| | 2-43 | 36,689 | 36,690 | 36,691 | 36,692 | 36,693 | 36,694 | 36,695 | 36,696 | 36,697 | 36,698 | 36,699 | 36,700 |
| | 2-44 | 36,714 | 36,715 | 36,716 | 36,717 | 36,718 | 36,719 | 36,720 | 36,721 | 36,722 | 36,723 | 36,724 | 36,725 |
| | 2-45 | 36,739 | 36,740 | 36,741 | 36,742 | 36,743 | 36,744 | 36,745 | 36,746 | 36,747 | 36,748 | 36,749 | 36,750 |
| | 2-46 | 36,764 | 36,765 | 36,766 | 36,767 | 36,768 | 36,769 | 36,770 | 36,771 | 36,772 | 36,773 | 36,774 | 36,775 |

TABLE 28-continued

| | | | | | | | | | | | | |
|---|---|---|---|---|---|---|---|---|---|---|---|---|
| 2-47 | 36,789 | 36,790 | 36,791 | 36,792 | 36,793 | 36,794 | 36,795 | 36,796 | 36,797 | 36,798 | 36,799 | 36,800 |
| 2-48 | 36,814 | 36,815 | 36,816 | 36,817 | 36,818 | 36,819 | 36,820 | 36,821 | 36,822 | 36,823 | 36,824 | 36,825 |
| 2-49 | 36,839 | 36,840 | 36,841 | 36,842 | 36,843 | 36,844 | 36,845 | 36,846 | 36,847 | 36,848 | 36,849 | 36,850 |
| 2-50 | 36,864 | 36,865 | 36,866 | 36,867 | 36,868 | 36,869 | 36,870 | 36,871 | 36,872 | 36,873 | 36,874 | 36,875 |
| 2-51 | 36,889 | 36,890 | 36,891 | 36,892 | 36,893 | 36,894 | 36,895 | 36,896 | 36,897 | 36,898 | 36,899 | 36,900 |
| 2-52 | 36,914 | 36,915 | 36,916 | 36,917 | 36,918 | 36,919 | 36,920 | 36,921 | 36,922 | 36,923 | 36,924 | 36,925 |
| 2-53 | 36,939 | 36,940 | 36,941 | 36,942 | 36,943 | 36,944 | 36,945 | 36,946 | 36,947 | 36,948 | 36,949 | 36,950 |
| 2-54 | 36,964 | 36,965 | 36,966 | 36,967 | 36,968 | 36,969 | 36,970 | 36,971 | 36,972 | 36,973 | 36,974 | 36,975 |
| 2-55 | 36,989 | 36,990 | 36,991 | 36,992 | 36,993 | 36,994 | 36,995 | 36,996 | 36,997 | 36,998 | 36,999 | 37,000 |

TABLE 29

| | | Compound represented by the formula (1) | | | | | | | | | | | | |
|---|---|---|---|---|---|---|---|---|---|---|---|---|---|---|
| | | 1-76 | 1-77 | 1-78 | 1-79 | 1-80 | 1-81 | 1-82 | 1-83 | 1-84 | 1-85 | 1-86 | 1-87 | 1-88 |
| Compound represented by the formula (2) | 2-56 | 37,001 | 37,002 | 37,003 | 37,004 | 37,005 | 37,006 | 37,007 | 37,008 | 37,009 | 37,010 | 37,011 | 37,012 | 37,013 |
| | 2-57 | 37,026 | 37,027 | 37,028 | 37,029 | 37,030 | 37,031 | 37,032 | 37,033 | 37,034 | 37,035 | 37,036 | 37,037 | 37,038 |
| | 2-58 | 37,051 | 37,052 | 37,053 | 37,054 | 37,055 | 37,056 | 37,057 | 37,058 | 37,059 | 37,060 | 37,061 | 37,062 | 37,063 |
| | 2-59 | 37,076 | 37,077 | 37,078 | 37,079 | 37,080 | 37,081 | 37,082 | 37,083 | 37,084 | 37,085 | 37,086 | 37,087 | 37,088 |
| | 2-60 | 37,101 | 37,102 | 37,103 | 37,104 | 37,105 | 37,106 | 37,107 | 37,108 | 37,109 | 37,110 | 37,111 | 37,112 | 37,113 |
| | 2-61 | 37,126 | 37,127 | 37,128 | 37,129 | 37,130 | 37,131 | 37,132 | 37,133 | 37,134 | 37,135 | 37,136 | 37,137 | 37,138 |
| | 2-62 | 37,151 | 37,152 | 37,153 | 37,154 | 37,155 | 37,156 | 37,157 | 37,158 | 37,159 | 37,160 | 37,161 | 37,162 | 37,163 |
| | 2-63 | 37,176 | 37,177 | 37,178 | 37,179 | 37,180 | 37,181 | 37,182 | 37,183 | 37,184 | 37,185 | 37,186 | 37,187 | 37,188 |
| | 2-64 | 37,201 | 37,202 | 37,203 | 37,204 | 37,205 | 37,206 | 37,207 | 37,208 | 37,209 | 37,210 | 37,211 | 37,212 | 37,213 |
| | 2-65 | 37,226 | 37,227 | 37,228 | 37,229 | 37,230 | 37,231 | 37,232 | 37,233 | 37,234 | 37,235 | 37,236 | 37,237 | 37,238 |
| | 2-66 | 37,251 | 37,252 | 37,253 | 37,254 | 37,255 | 37,256 | 37,257 | 37,258 | 37,259 | 37,260 | 37,261 | 37,262 | 37,263 |
| | 2-67 | 37,276 | 37,277 | 37,278 | 37,279 | 37,280 | 37,281 | 37,282 | 37,283 | 37,284 | 37,285 | 37,286 | 37,287 | 37,288 |
| | 2-68 | 37,301 | 37,302 | 37,303 | 37,304 | 37,305 | 37,306 | 37,307 | 37,308 | 37,309 | 37,310 | 37,311 | 37,312 | 37,313 |
| | 2-69 | 37,326 | 37,327 | 37,328 | 37,329 | 37,330 | 37,331 | 37,332 | 37,333 | 37,334 | 37,335 | 37,336 | 37,337 | 37,338 |
| | 2-70 | 37,351 | 37,352 | 37,353 | 37,354 | 37,355 | 37,356 | 37,357 | 37,358 | 37,359 | 37,360 | 37,361 | 37,362 | 37,363 |
| | 2-71 | 37,376 | 37,377 | 37,378 | 37,379 | 37,380 | 37,381 | 37,382 | 37,383 | 37,384 | 37,385 | 37,386 | 37,387 | 37,388 |
| | 2-72 | 37,401 | 37,402 | 37,403 | 37,404 | 37,405 | 37,406 | 37,407 | 37,408 | 37,409 | 37,410 | 37,411 | 37,412 | 37,413 |
| | 2-73 | 37,426 | 37,427 | 37,428 | 37,429 | 37,430 | 37,431 | 37,432 | 37,433 | 37,434 | 37,435 | 37,436 | 37,437 | 37,438 |
| | 2-74 | 37,451 | 37,452 | 37,453 | 37,454 | 37,455 | 37,456 | 37,457 | 37,458 | 37,459 | 37,460 | 37,461 | 37,462 | 37,463 |
| | 2-75 | 37,476 | 37,477 | 37,478 | 37,479 | 37,480 | 37,481 | 37,482 | 37,483 | 37,484 | 37,485 | 37,486 | 37,487 | 37,488 |
| | 2-76 | 37,501 | 37,502 | 37,503 | 37,504 | 37,505 | 37,506 | 37,507 | 37,508 | 37,509 | 37,510 | 37,511 | 37,512 | 37,513 |
| | 2-77 | 37,526 | 37,527 | 37,528 | 37,529 | 37,530 | 37,531 | 37,532 | 37,533 | 37,534 | 37,535 | 37,536 | 37,537 | 37,538 |
| | 2-78 | 37,551 | 37,552 | 37,553 | 37,554 | 37,555 | 37,556 | 37,557 | 37,558 | 37,559 | 37,560 | 37,561 | 37,562 | 37,563 |
| | 2-79 | 37,576 | 37,577 | 37,578 | 37,579 | 37,580 | 37,581 | 37,582 | 37,583 | 37,584 | 37,585 | 37,586 | 37,587 | 37,588 |
| | 2-80 | 37,601 | 37,602 | 37,603 | 37,604 | 37,605 | 37,606 | 37,607 | 37,608 | 37,609 | 37,610 | 37,611 | 37,612 | 37,613 |
| | 2-81 | 37,626 | 37,627 | 37,628 | 37,629 | 37,630 | 37,631 | 37,632 | 37,633 | 37,634 | 37,635 | 37,636 | 37,637 | 37,638 |
| | 2-82 | 37,651 | 37,652 | 37,653 | 37,654 | 37,655 | 37,656 | 37,657 | 37,658 | 37,659 | 37,660 | 37,661 | 37,662 | 37,663 |
| | 2-83 | 37,676 | 37,677 | 37,678 | 37,679 | 37,680 | 37,681 | 37,682 | 37,683 | 37,684 | 37,685 | 37,686 | 37,687 | 37,688 |
| | 2-84 | 37,701 | 37,702 | 37,703 | 37,704 | 37,705 | 37,706 | 37,707 | 37,708 | 37,709 | 37,710 | 37,711 | 37,712 | 37,713 |
| | 2-85 | 37,726 | 37,727 | 37,728 | 37,729 | 37,730 | 37,731 | 37,732 | 37,733 | 37,734 | 37,735 | 37,736 | 37,737 | 37,738 |
| | 2-86 | 37,751 | 37,752 | 37,753 | 37,754 | 37,755 | 37,756 | 37,757 | 37,758 | 37,759 | 37,760 | 37,761 | 37,762 | 37,763 |
| | 2-87 | 37,776 | 37,777 | 37,778 | 37,779 | 37,780 | 37,781 | 37,782 | 37,783 | 37,784 | 37,785 | 37,786 | 37,787 | 37,788 |
| | 2-88 | 37,801 | 37,802 | 37,803 | 37,804 | 37,805 | 37,806 | 37,807 | 37,808 | 37,809 | 37,810 | 37,811 | 37,812 | 37,813 |
| | 2-89 | 37,826 | 37,827 | 37,828 | 37,829 | 37,830 | 37,831 | 37,832 | 37,833 | 37,834 | 37,835 | 37,836 | 37,837 | 37,838 |
| | 2-90 | 37,851 | 37,852 | 37,853 | 37,854 | 37,855 | 37,856 | 37,857 | 37,858 | 37,859 | 37,860 | 37,861 | 37,862 | 37,863 |
| | 2-91 | 37,876 | 37,877 | 37,878 | 37,879 | 37,880 | 37,881 | 37,882 | 37,883 | 37,884 | 37,885 | 37,886 | 37,887 | 37,888 |
| | 2-92 | 37,901 | 37,902 | 37,903 | 37,904 | 37,905 | 37,906 | 37,907 | 37,908 | 37,909 | 37,910 | 37,911 | 37,912 | 37,913 |
| | 2-93 | 37,926 | 37,927 | 37,928 | 37,929 | 37,930 | 37,931 | 37,932 | 37,933 | 37,934 | 37,935 | 37,936 | 37,937 | 37,938 |
| | 2-94 | 37,951 | 37,952 | 37,953 | 37,954 | 37,955 | 37,956 | 37,957 | 37,958 | 37,959 | 37,960 | 37,961 | 37,962 | 37,963 |
| | 2-95 | 37,976 | 37,977 | 37,978 | 37,979 | 37,980 | 37,981 | 37,982 | 37,983 | 37,984 | 37,985 | 37,986 | 37,987 | 37,988 |
| | 2-96 | 38,001 | 38,002 | 38,003 | 38,004 | 38,005 | 38,006 | 38,007 | 38,008 | 38,009 | 38,010 | 38,011 | 38,012 | 38,013 |
| | 2-97 | 38,026 | 38,027 | 38,028 | 38,029 | 38,030 | 38,031 | 38,032 | 38,033 | 38,034 | 38,035 | 38,036 | 38,037 | 38,038 |
| | 2-98 | 38,051 | 38,052 | 38,053 | 38,054 | 38,055 | 38,056 | 38,057 | 38,058 | 38,059 | 38,060 | 38,061 | 38,062 | 38,063 |
| | 2-99 | 38,076 | 38,077 | 38,078 | 38,079 | 38,080 | 38,081 | 38,082 | 38,083 | 38,084 | 38,085 | 38,086 | 38,087 | 38,088 |
| | 2-100 | 38,101 | 38,102 | 38,103 | 38,104 | 38,105 | 38,106 | 38,107 | 38,108 | 38,109 | 38,110 | 38,111 | 38,112 | 38,113 |
| | 2-101 | 38,126 | 38,127 | 38,128 | 38,129 | 38,130 | 38,131 | 38,132 | 38,133 | 38,134 | 38,135 | 38,136 | 38,137 | 38,138 |
| | 2-102 | 38,151 | 38,152 | 38,153 | 38,154 | 38,155 | 38,156 | 38,157 | 38,158 | 38,159 | 38,160 | 38,161 | 38,162 | 38,163 |
| | 2-103 | 38,176 | 38,177 | 38,178 | 38,179 | 38,180 | 38,181 | 38,182 | 38,183 | 38,184 | 38,185 | 38,186 | 38,187 | 38,188 |
| | 2-104 | 38,201 | 38,202 | 38,203 | 38,204 | 38,205 | 38,206 | 38,207 | 38,208 | 38,209 | 38,210 | 38,211 | 38,212 | 38,213 |
| | 2-105 | 38,226 | 38,227 | 38,228 | 38,229 | 38,230 | 38,231 | 38,232 | 38,233 | 38,234 | 38,235 | 38,236 | 38,237 | 38,238 |
| | 2-106 | 38,251 | 38,252 | 38,253 | 38,254 | 38,255 | 38,256 | 38,257 | 38,258 | 38,259 | 38,260 | 38,261 | 38,262 | 38,263 |
| | 2-107 | 38,276 | 38,277 | 38,278 | 38,279 | 38,280 | 38,281 | 38,282 | 38,283 | 38,284 | 38,285 | 38,286 | 38,287 | 38,288 |
| | 2-108 | 38,301 | 38,302 | 38,303 | 38,304 | 38,305 | 38,306 | 38,307 | 38,308 | 38,309 | 38,310 | 38,311 | 38,312 | 38,313 |
| | 2-109 | 38,326 | 38,327 | 38,328 | 38,329 | 38,330 | 38,331 | 38,332 | 38,333 | 38,334 | 38,335 | 38,336 | 38,337 | 38,338 |
| | 2-110 | 38,351 | 38,352 | 38,353 | 38,354 | 38,355 | 38,356 | 38,357 | 38,358 | 38,359 | 38,360 | 38,361 | 38,362 | 38,363 |

TABLE 29-continued

| | | Compound represented by the formula (1) | | | | | | | | | | | |
|---|---|---|---|---|---|---|---|---|---|---|---|---|---|
| | | 1-89 | 1-90 | 1-91 | 1-92 | 1-93 | 1-94 | 1-95 | 1-96 | 1-97 | 1-98 | 1-99 | 1-100 |
| Compound represented by the formula (2) | 2-56 | 37,014 | 37,015 | 37,016 | 37,017 | 37,018 | 37,019 | 37,020 | 37,021 | 37,022 | 37,023 | 37,024 | 37,025 |
| | 2-57 | 37,039 | 37,040 | 37,041 | 37,042 | 37,043 | 37,044 | 37,045 | 37,046 | 37,047 | 37,048 | 37,049 | 37,050 |
| | 2-58 | 37,064 | 37,065 | 37,066 | 37,067 | 37,068 | 37,069 | 37,070 | 37,071 | 37,072 | 37,073 | 37,074 | 37,075 |
| | 2-59 | 37,089 | 37,090 | 37,091 | 37,092 | 37,093 | 37,094 | 37,095 | 37,096 | 37,097 | 37,098 | 37,099 | 37,100 |
| | 2-60 | 37,114 | 37,115 | 37,116 | 37,117 | 37,118 | 37,119 | 37,120 | 37,121 | 37,122 | 37,123 | 37,124 | 37,125 |
| | 2-61 | 37,139 | 37,140 | 37,141 | 37,142 | 37,143 | 37,144 | 37,145 | 37,146 | 37,147 | 37,148 | 37,149 | 37,150 |
| | 2-62 | 37,164 | 37,165 | 37,166 | 37,167 | 37,168 | 37,169 | 37,170 | 37,171 | 37,172 | 37,173 | 37,174 | 37,175 |
| | 2-63 | 37,189 | 37,190 | 37,191 | 37,192 | 37,193 | 37,194 | 37,195 | 37,196 | 37,197 | 37,198 | 37,199 | 37,200 |
| | 2-64 | 37,214 | 37,215 | 37,216 | 37,217 | 37,218 | 37,219 | 37,220 | 37,221 | 37,222 | 37,223 | 37,224 | 37,225 |
| | 2-65 | 37,239 | 37,240 | 37,241 | 37,242 | 37,243 | 37,244 | 37,245 | 37,246 | 37,247 | 37,248 | 37,249 | 37,250 |
| | 2-66 | 37,264 | 37,265 | 37,266 | 37,267 | 37,268 | 37,269 | 37,270 | 37,271 | 37,272 | 37,273 | 37,274 | 37,275 |
| | 2-67 | 37,289 | 37,290 | 37,291 | 37,292 | 37,293 | 37,294 | 37,295 | 37,296 | 37,297 | 37,298 | 37,299 | 37,300 |
| | 2-68 | 37,314 | 37,315 | 37,316 | 37,317 | 37,318 | 37,319 | 37,320 | 37,321 | 37,322 | 37,323 | 37,324 | 37,325 |
| | 2-69 | 37,339 | 37,340 | 37,341 | 37,342 | 37,343 | 37,344 | 37,345 | 37,346 | 37,347 | 37,348 | 37,349 | 37,350 |
| | 2-70 | 37,364 | 37,365 | 37,366 | 37,367 | 37,368 | 37,369 | 37,370 | 37,371 | 37,372 | 37,373 | 37,374 | 37,375 |
| | 2-71 | 37,389 | 37,390 | 37,391 | 37,392 | 37,393 | 37,394 | 37,395 | 37,396 | 37,397 | 37,398 | 37,399 | 37,400 |
| | 2-72 | 37,414 | 37,415 | 37,416 | 37,417 | 37,418 | 37,419 | 37,420 | 37,421 | 37,422 | 37,423 | 37,424 | 37,425 |
| | 2-73 | 37,439 | 37,440 | 37,441 | 37,442 | 37,443 | 37,444 | 37,445 | 37,446 | 37,447 | 37,448 | 37,449 | 37,450 |
| | 2-74 | 37,464 | 37,465 | 37,466 | 37,467 | 37,468 | 37,469 | 37,470 | 37,471 | 37,472 | 37,473 | 37,474 | 37,475 |
| | 2-75 | 37,489 | 37,490 | 37,491 | 37,492 | 37,493 | 37,494 | 37,495 | 37,496 | 37,497 | 37,498 | 37,499 | 37,500 |
| | 2-76 | 37,514 | 37,515 | 37,516 | 37,517 | 37,518 | 37,519 | 37,520 | 37,521 | 37,522 | 37,523 | 37,524 | 37,525 |
| | 2-77 | 37,539 | 37,540 | 37,541 | 37,542 | 37,543 | 37,544 | 37,545 | 37,546 | 37,547 | 37,548 | 37,549 | 37,550 |
| | 2-78 | 37,564 | 37,565 | 37,566 | 37,567 | 37,568 | 37,569 | 37,570 | 37,571 | 37,572 | 37,573 | 37,574 | 37,575 |
| | 2-79 | 37,589 | 37,590 | 37,591 | 37,592 | 37,593 | 37,594 | 37,595 | 37,596 | 37,597 | 37,598 | 37,599 | 37,600 |
| | 2-80 | 37,614 | 37,615 | 37,616 | 37,617 | 37,618 | 37,619 | 37,620 | 37,621 | 37,622 | 37,623 | 37,624 | 37,625 |
| | 2-81 | 37,639 | 37,640 | 37,641 | 37,642 | 37,643 | 37,644 | 37,645 | 37,646 | 37,647 | 37,648 | 37,649 | 37,650 |
| | 2-82 | 37,664 | 37,665 | 37,666 | 37,667 | 37,668 | 37,669 | 37,670 | 37,671 | 37,672 | 37,673 | 37,674 | 37,675 |
| | 2-83 | 37,689 | 37,690 | 37,691 | 37,692 | 37,693 | 37,694 | 37,695 | 37,696 | 37,697 | 37,698 | 37,699 | 37,700 |
| | 2-84 | 37,714 | 37,715 | 37,716 | 37,717 | 37,718 | 37,719 | 37,720 | 37,721 | 37,722 | 37,723 | 37,724 | 37,725 |
| | 2-85 | 37,739 | 37,740 | 37,741 | 37,742 | 37,743 | 37,744 | 37,745 | 37,746 | 37,747 | 37,748 | 37,749 | 37,750 |
| | 2-86 | 37,764 | 37,765 | 37,766 | 37,767 | 37,768 | 37,769 | 37,770 | 37,771 | 37,772 | 37,773 | 37,774 | 37,775 |
| | 2-87 | 37,789 | 37,790 | 37,791 | 37,792 | 37,793 | 37,794 | 37,795 | 37,796 | 37,797 | 37,798 | 37,799 | 37,800 |
| | 2-88 | 37,814 | 37,815 | 37,816 | 37,817 | 37,818 | 37,819 | 37,820 | 37,821 | 37,822 | 37,823 | 37,824 | 37,825 |
| | 2-89 | 37,839 | 37,840 | 37,841 | 37,842 | 37,843 | 37,844 | 37,845 | 37,846 | 37,847 | 37,848 | 37,849 | 37,850 |
| | 2-90 | 37,864 | 37,865 | 37,866 | 37,867 | 37,868 | 37,869 | 37,870 | 37,871 | 37,872 | 37,873 | 37,874 | 37,875 |
| | 2-91 | 37,889 | 37,890 | 37,891 | 37,892 | 37,893 | 37,894 | 37,895 | 37,896 | 37,897 | 37,898 | 37,899 | 37,900 |
| | 2-92 | 37,914 | 37,915 | 37,916 | 37,917 | 37,918 | 37,919 | 37,920 | 37,921 | 37,922 | 37,923 | 37,924 | 37,925 |
| | 2-93 | 37,939 | 37,940 | 37,941 | 37,942 | 37,943 | 37,944 | 37,945 | 37,946 | 37,947 | 37,948 | 37,949 | 37,950 |
| | 2-94 | 37,964 | 37,965 | 37,966 | 37,967 | 37,968 | 37,969 | 37,970 | 37,971 | 37,972 | 37,973 | 37,974 | 37,975 |
| | 2-95 | 37,989 | 37,990 | 37,991 | 37,992 | 37,993 | 37,994 | 37,995 | 37,996 | 37,997 | 37,998 | 37,999 | 38,000 |
| | 2-96 | 38,014 | 38,015 | 38,016 | 38,017 | 38,018 | 38,019 | 38,020 | 38,021 | 38,022 | 38,023 | 38,024 | 38,025 |
| | 2-97 | 38,039 | 38,040 | 38,041 | 38,042 | 38,043 | 38,044 | 38,045 | 38,046 | 38,047 | 38,048 | 38,049 | 38,050 |
| | 2-98 | 38,064 | 38,065 | 38,066 | 38,067 | 38,068 | 38,069 | 38,070 | 38,071 | 38,072 | 38,073 | 38,074 | 38,075 |
| | 2-99 | 38,089 | 38,090 | 38,091 | 38,092 | 38,093 | 38,094 | 38,095 | 38,096 | 38,097 | 38,098 | 38,099 | 38,100 |
| | 2-100 | 38,114 | 38,115 | 38,116 | 38,117 | 38,118 | 38,119 | 38,120 | 38,121 | 38,122 | 38,123 | 38,124 | 38,125 |
| | 2-101 | 38,139 | 38,140 | 38,141 | 38,142 | 38,143 | 38,144 | 38,145 | 38,146 | 38,147 | 38,148 | 38,149 | 38,150 |
| | 2-102 | 38,164 | 38,165 | 38,166 | 38,167 | 38,168 | 38,169 | 38,170 | 38,171 | 38,172 | 38,173 | 38,174 | 38,175 |
| | 2-103 | 38,189 | 38,190 | 38,191 | 38,192 | 38,193 | 38,194 | 38,195 | 38,196 | 38,197 | 38,198 | 38,199 | 38,200 |
| | 2-104 | 38,214 | 38,215 | 38,216 | 38,217 | 38,218 | 38,219 | 38,220 | 38,221 | 38,222 | 38,223 | 38,224 | 38,225 |
| | 2-105 | 38,239 | 38,240 | 38,241 | 38,242 | 38,243 | 38,244 | 38,245 | 38,246 | 38,247 | 38,248 | 38,249 | 38,250 |
| | 2-106 | 38,264 | 38,265 | 38,266 | 38,267 | 38,268 | 38,269 | 38,270 | 38,271 | 38,272 | 38,273 | 38,274 | 38,275 |
| | 2-107 | 38,289 | 38,290 | 38,291 | 38,292 | 38,293 | 38,294 | 38,295 | 38,296 | 38,297 | 38,298 | 38,299 | 38,300 |
| | 2-108 | 38,314 | 38,315 | 38,316 | 38,317 | 38,318 | 38,319 | 38,320 | 38,321 | 38,322 | 38,323 | 38,324 | 38,325 |
| | 2-109 | 38,339 | 38,340 | 38,341 | 38,342 | 38,343 | 38,344 | 38,345 | 38,346 | 38,347 | 38,348 | 38,349 | 38,350 |
| | 2-110 | 38,364 | 38,365 | 38,366 | 38,367 | 38,368 | 38,369 | 38,370 | 38,371 | 38,372 | 38,373 | 38,374 | 38,375 |

TABLE 30

| | | Compound represented by the formula (1) | | | | | | | | | | | | |
|---|---|---|---|---|---|---|---|---|---|---|---|---|---|---|
| | | 1-76 | 1-77 | 1-78 | 1-79 | 1-80 | 1-81 | 1-82 | 1-83 | 1-84 | 1-85 | 1-86 | 1-87 | 1-88 |
| Compound represented by the formula (2) | 2-111 | 38,376 | 38,377 | 38,378 | 38,379 | 38,380 | 38,381 | 38,382 | 38,383 | 38,384 | 38,385 | 38,386 | 38,387 | 38,388 |
| | 2-112 | 38,401 | 38,402 | 38,403 | 38,404 | 38,405 | 38,406 | 38,407 | 38,408 | 38,409 | 38,410 | 38,411 | 38,412 | 38,413 |
| | 2-113 | 38,426 | 38,427 | 38,428 | 38,429 | 38,430 | 38,431 | 38,432 | 38,433 | 38,434 | 38,435 | 38,436 | 38,437 | 38,438 |
| | 2-114 | 38,451 | 38,452 | 38,453 | 38,454 | 38,455 | 38,456 | 38,457 | 38,458 | 38,459 | 38,460 | 38,461 | 38,462 | 38,463 |
| | 2-115 | 38,476 | 38,477 | 38,478 | 38,479 | 38,480 | 38,481 | 38,482 | 38,483 | 38,484 | 38,485 | 38,486 | 38,487 | 38,488 |
| | 2-116 | 38,501 | 38,502 | 38,503 | 38,504 | 38,505 | 38,506 | 38,507 | 38,508 | 38,509 | 38,510 | 38,511 | 38,512 | 38,513 |
| | 2-117 | 38,526 | 38,527 | 38,528 | 38,529 | 38,530 | 38,531 | 38,532 | 38,533 | 38,534 | 38,535 | 38,536 | 38,537 | 38,538 |
| | 2-118 | 38,551 | 38,552 | 38,553 | 38,554 | 38,555 | 38,556 | 38,557 | 38,558 | 38,559 | 38,560 | 38,561 | 38,562 | 38,563 |
| | 2-119 | 38,576 | 38,577 | 38,578 | 38,579 | 38,580 | 38,581 | 38,582 | 38,583 | 38,584 | 38,585 | 38,586 | 38,587 | 38,588 |
| | 2-120 | 38,601 | 38,602 | 38,603 | 38,604 | 38,605 | 38,606 | 38,607 | 38,608 | 38,609 | 38,610 | 38,611 | 38,612 | 38,613 |
| | 2-121 | 38,626 | 38,627 | 38,628 | 38,629 | 38,630 | 38,631 | 38,632 | 38,633 | 38,634 | 38,635 | 38,636 | 38,637 | 38,638 |

TABLE 30-continued

| | | | | | | | | | | | | | | |
|---|---|---|---|---|---|---|---|---|---|---|---|---|---|---|
| | 2-122 | 38,651 | 38,652 | 38,653 | 38,654 | 38,655 | 38,656 | 38,657 | 38,658 | 38,659 | 38,660 | 38,661 | 38,662 | 38,663 |
| | 2-123 | 38,676 | 38,677 | 38,678 | 38,679 | 38,680 | 38,681 | 38,682 | 38,683 | 38,684 | 38,685 | 38,686 | 38,687 | 38,688 |
| | 2-124 | 38,701 | 38,702 | 38,703 | 38,704 | 38,705 | 38,706 | 38,707 | 38,708 | 38,709 | 38,710 | 38,711 | 38,712 | 38,713 |
| | 2-125 | 38,726 | 38,727 | 38,728 | 38,729 | 38,730 | 38,731 | 38,732 | 38,733 | 38,734 | 38,735 | 38,736 | 38,737 | 38,738 |
| | 2-126 | 38,751 | 38,752 | 38,753 | 38,754 | 38,755 | 38,756 | 38,757 | 38,758 | 38,759 | 38,760 | 38,761 | 38,762 | 38,763 |
| | 2-127 | 38,776 | 38,777 | 38,778 | 38,779 | 38,780 | 38,781 | 38,782 | 38,783 | 38,784 | 38,785 | 38,786 | 38,787 | 38,788 |
| | 2-128 | 38,801 | 38,802 | 38,803 | 38,804 | 38,805 | 38,806 | 38,807 | 38,808 | 38,809 | 38,810 | 38,811 | 38,812 | 38,813 |
| | 2-129 | 38,826 | 38,827 | 38,828 | 38,829 | 38,830 | 38,831 | 38,832 | 38,833 | 38,834 | 38,835 | 38,836 | 38,837 | 38,838 |
| | 2-130 | 38,851 | 38,852 | 38,853 | 38,854 | 38,855 | 38,856 | 38,857 | 38,858 | 38,859 | 38,860 | 38,861 | 38,862 | 38,863 |
| | 2-131 | 38,876 | 38,877 | 38,878 | 38,879 | 38,880 | 38,881 | 38,882 | 38,883 | 38,884 | 38,885 | 38,886 | 38,887 | 38,888 |
| | 2-132 | 38,901 | 38,902 | 38,903 | 38,904 | 38,905 | 38,906 | 38,907 | 38,908 | 38,909 | 38,910 | 38,911 | 38,912 | 38,913 |
| | 2-133 | 38,926 | 38,927 | 38,928 | 38,929 | 38,930 | 38,931 | 38,932 | 38,933 | 38,934 | 38,935 | 38,936 | 38,937 | 38,938 |
| | 2-134 | 38,951 | 38,952 | 38,953 | 38,954 | 38,955 | 38,956 | 38,957 | 38,958 | 38,959 | 38,960 | 38,961 | 38,962 | 38,963 |
| | 2-135 | 38,976 | 38,977 | 38,978 | 38,979 | 38,980 | 38,981 | 38,982 | 38,983 | 38,984 | 38,985 | 38,986 | 38,987 | 38,988 |
| | 2-136 | 39,001 | 39,002 | 39,003 | 39,004 | 39,005 | 39,006 | 39,007 | 39,008 | 39,009 | 39,010 | 39,011 | 39,012 | 39,013 |
| | 2-137 | 39,026 | 39,027 | 39,028 | 39,029 | 39,030 | 39,031 | 39,032 | 39,033 | 39,034 | 39,035 | 39,036 | 39,037 | 39,038 |
| | 2-138 | 39,051 | 39,052 | 39,053 | 39,054 | 39,055 | 39,056 | 39,057 | 39,058 | 39,059 | 39,060 | 39,061 | 39,062 | 39,063 |
| | 2-139 | 39,076 | 39,077 | 39,078 | 39,079 | 39,080 | 39,081 | 39,082 | 39,083 | 39,084 | 39,085 | 39,086 | 39,087 | 39,088 |
| | 2-140 | 39,101 | 39,102 | 39,103 | 39,104 | 39,105 | 39,106 | 39,107 | 39,108 | 39,109 | 39,110 | 39,111 | 39,112 | 39,113 |
| | 2-141 | 39,126 | 39,127 | 39,128 | 39,129 | 39,130 | 39,131 | 39,132 | 39,133 | 39,134 | 39,135 | 39,136 | 39,137 | 39,138 |
| | 2-142 | 39,151 | 39,152 | 39,153 | 39,154 | 39,155 | 39,156 | 39,157 | 39,158 | 39,159 | 39,160 | 39,161 | 39,162 | 39,163 |
| | 2-143 | 39,176 | 39,177 | 39,178 | 39,179 | 39,180 | 39,181 | 39,182 | 39,183 | 39,184 | 39,185 | 39,186 | 39,187 | 39,188 |
| | 2-144 | 39,201 | 39,202 | 39,203 | 39,204 | 39,205 | 39,206 | 39,207 | 39,208 | 39,209 | 39,210 | 39,211 | 39,212 | 39,213 |
| | 2-145 | 39,226 | 39,227 | 39,228 | 39,229 | 39,230 | 39,231 | 39,232 | 39,233 | 39,234 | 39,235 | 39,236 | 39,237 | 39,238 |
| | 2-146 | 39,251 | 39,252 | 39,253 | 39,254 | 39,255 | 39,256 | 39,257 | 39,258 | 39,259 | 39,260 | 39,261 | 39,262 | 39,263 |
| | 2-147 | 39,276 | 39,277 | 39,278 | 39,279 | 39,280 | 39,281 | 39,282 | 39,283 | 39,284 | 39,285 | 39,286 | 39,287 | 39,288 |
| | 2-148 | 39,301 | 39,302 | 39,303 | 39,304 | 39,305 | 39,306 | 39,307 | 39,308 | 39,309 | 39,310 | 39,311 | 39,312 | 39,313 |
| | 2-149 | 39,326 | 39,327 | 39,328 | 39,329 | 39,330 | 39,331 | 39,332 | 39,333 | 39,334 | 39,335 | 39,336 | 39,337 | 39,338 |
| | 2-150 | 39,351 | 39,352 | 39,353 | 39,354 | 39,355 | 39,356 | 39,357 | 39,358 | 39,359 | 39,360 | 39,361 | 39,362 | 39,363 |
| | 2-151 | 39,376 | 39,377 | 39,378 | 39,379 | 39,380 | 39,381 | 39,382 | 39,383 | 39,384 | 39,385 | 39,386 | 39,387 | 39,388 |
| | 2-152 | 39,401 | 39,402 | 39,403 | 39,404 | 39,405 | 39,406 | 39,407 | 39,408 | 39,409 | 39,410 | 39,411 | 39,412 | 39,413 |
| | 2-153 | 39,426 | 39,427 | 39,428 | 39,429 | 39,430 | 39,431 | 39,432 | 39,433 | 39,434 | 39,435 | 39,436 | 39,437 | 39,438 |
| | 2-154 | 39,451 | 39,452 | 39,453 | 39,454 | 39,455 | 39,456 | 39,457 | 39,458 | 39,459 | 39,460 | 39,461 | 39,462 | 39,463 |
| | 2-155 | 39,476 | 39,477 | 39,478 | 39,479 | 39,480 | 39,481 | 39,482 | 39,483 | 39,484 | 39,485 | 39,486 | 39,487 | 39,488 |
| | 2-156 | 39,501 | 39,502 | 39,503 | 39,504 | 39,505 | 39,506 | 39,507 | 39,508 | 39,509 | 39,510 | 39,511 | 39,512 | 39,513 |
| | 2-157 | 39,526 | 39,527 | 39,528 | 39,529 | 39,530 | 39,531 | 39,532 | 39,533 | 39,534 | 39,535 | 39,536 | 39,537 | 39,538 |
| | 2-158 | 39,551 | 39,552 | 39,553 | 39,554 | 39,555 | 39,556 | 39,557 | 39,558 | 39,559 | 39,560 | 39,561 | 39,562 | 39,563 |
| | 2-159 | 39,576 | 39,577 | 39,578 | 39,579 | 39,580 | 39,581 | 39,582 | 39,583 | 39,584 | 39,585 | 39,586 | 39,587 | 39,588 |
| | 2-160 | 39,601 | 39,602 | 39,603 | 39,604 | 39,605 | 39,606 | 39,607 | 39,608 | 39,609 | 39,610 | 39,611 | 39,612 | 39,613 |
| | 2-161 | 39,626 | 39,627 | 39,628 | 39,629 | 39,630 | 39,631 | 39,632 | 39,633 | 39,634 | 39,635 | 39,636 | 39,637 | 39,638 |
| | 2-162 | 39,651 | 39,652 | 39,653 | 39,654 | 39,655 | 39,656 | 39,657 | 39,658 | 39,659 | 39,660 | 39,661 | 39,662 | 39,663 |
| | 2-163 | 39,676 | 39,677 | 39,678 | 39,679 | 39,680 | 39,681 | 39,682 | 39,683 | 39,684 | 39,685 | 39,686 | 39,687 | 39,688 |
| | 2-164 | 39,701 | 39,702 | 39,703 | 39,704 | 39,705 | 39,706 | 39,707 | 39,708 | 39,709 | 39,710 | 39,711 | 39,712 | 39,713 |
| | 2-165 | 39,726 | 39,727 | 39,728 | 39,729 | 39,730 | 39,731 | 39,732 | 39,733 | 39,734 | 39,735 | 39,736 | 39,737 | 39,738 |

| | | Compound represented by the formula (1) | | | | | | | | | | | |
|---|---|---|---|---|---|---|---|---|---|---|---|---|---|
| | | 1-89 | 1-90 | 1-91 | 1-92 | 1-93 | 1-94 | 1-95 | 1-96 | 1-97 | 1-98 | 1-99 | 1-100 |
| Compound represented by the formula (2) | 2-111 | 38,389 | 38,390 | 38,391 | 38,392 | 38,393 | 38,394 | 38,395 | 38,396 | 38,397 | 38,398 | 38,399 | 38,400 |
| | 2-112 | 38,414 | 38,415 | 38,416 | 38,417 | 38,418 | 38,419 | 38,420 | 38,421 | 38,422 | 38,423 | 38,424 | 38,425 |
| | 2-113 | 38,439 | 38,440 | 38,441 | 38,442 | 38,443 | 38,444 | 38,445 | 38,446 | 38,447 | 38,448 | 38,449 | 38,450 |
| | 2-114 | 38,464 | 38,465 | 38,466 | 38,467 | 38,468 | 38,469 | 38,470 | 38,471 | 38,472 | 38,473 | 38,474 | 38,475 |
| | 2-115 | 38,489 | 38,490 | 38,491 | 38,492 | 38,493 | 38,494 | 38,495 | 38,496 | 38,497 | 38,498 | 38,499 | 38,500 |
| | 2-116 | 38,514 | 38,515 | 38,516 | 38,517 | 38,518 | 38,519 | 38,520 | 38,521 | 38,522 | 38,523 | 38,524 | 38,525 |
| | 2-117 | 38,539 | 38,540 | 38,541 | 38,542 | 38,543 | 38,544 | 38,545 | 38,546 | 38,547 | 38,548 | 38,549 | 38,550 |
| | 2-118 | 38,564 | 38,565 | 38,566 | 38,567 | 38,568 | 38,569 | 38,570 | 38,571 | 38,572 | 38,573 | 38,574 | 38,575 |
| | 2-119 | 38,589 | 38,590 | 38,591 | 38,592 | 38,593 | 38,594 | 38,595 | 38,596 | 38,597 | 38,598 | 38,599 | 38,600 |
| | 2-120 | 38,614 | 38,615 | 38,616 | 38,617 | 38,618 | 38,619 | 38,620 | 38,621 | 38,622 | 38,623 | 38,624 | 38,625 |
| | 2-121 | 38,639 | 38,640 | 38,641 | 38,642 | 38,643 | 38,644 | 38,645 | 38,646 | 38,647 | 38,648 | 38,649 | 38,650 |
| | 2-122 | 38,664 | 38,665 | 38,666 | 38,667 | 38,668 | 38,669 | 38,670 | 38,671 | 38,672 | 38,673 | 38,674 | 38,675 |
| | 2-123 | 38,689 | 38,690 | 38,691 | 38,692 | 38,693 | 38,694 | 38,695 | 38,696 | 38,697 | 38,698 | 38,699 | 38,700 |
| | 2-124 | 38,714 | 38,715 | 38,716 | 38,717 | 38,718 | 38,719 | 38,720 | 38,721 | 38,722 | 38,723 | 38,724 | 38,725 |
| | 2-125 | 38,739 | 38,740 | 38,741 | 38,742 | 38,743 | 38,744 | 38,745 | 38,746 | 38,747 | 38,748 | 38,749 | 38,750 |
| | 2-126 | 38,764 | 38,765 | 38,766 | 38,767 | 38,768 | 38,769 | 38,770 | 38,771 | 38,772 | 38,773 | 38,774 | 38,775 |
| | 2-127 | 38,789 | 38,790 | 38,791 | 38,792 | 38,793 | 38,794 | 38,795 | 38,796 | 38,797 | 38,798 | 38,799 | 38,800 |
| | 2-128 | 38,814 | 38,815 | 38,816 | 38,817 | 38,818 | 38,819 | 38,820 | 38,821 | 38,822 | 38,823 | 38,824 | 38,825 |
| | 2-129 | 38,839 | 38,840 | 38,841 | 38,842 | 38,843 | 38,844 | 38,845 | 38,846 | 38,847 | 38,848 | 38,849 | 38,850 |
| | 2-130 | 38,864 | 38,865 | 38,866 | 38,867 | 38,868 | 38,869 | 38,870 | 38,871 | 38,872 | 38,873 | 38,874 | 38,875 |
| | 2-131 | 38,889 | 38,890 | 38,891 | 38,892 | 38,893 | 38,894 | 38,895 | 38,896 | 38,897 | 38,898 | 38,899 | 38,900 |
| | 2-132 | 38,914 | 38,915 | 38,916 | 38,917 | 38,918 | 38,919 | 38,920 | 38,921 | 38,922 | 38,923 | 38,924 | 38,925 |
| | 2-133 | 38,939 | 38,940 | 38,941 | 38,942 | 38,943 | 38,944 | 38,945 | 38,946 | 38,947 | 38,948 | 38,949 | 38,950 |
| | 2-134 | 38,964 | 38,965 | 38,966 | 38,967 | 38,968 | 38,969 | 38,970 | 38,971 | 38,972 | 38,973 | 38,974 | 38,975 |
| | 2-135 | 38,989 | 38,990 | 38,991 | 38,992 | 38,993 | 38,994 | 38,995 | 38,996 | 38,997 | 38,998 | 38,999 | 39,000 |
| | 2-136 | 39,014 | 39,015 | 39,016 | 39,017 | 39,018 | 39,019 | 39,020 | 39,021 | 39,022 | 39,023 | 39,024 | 39,025 |
| | 2-137 | 39,039 | 39,040 | 39,041 | 39,042 | 39,043 | 39,044 | 39,045 | 39,046 | 39,047 | 39,048 | 39,049 | 39,050 |
| | 2-138 | 39,064 | 39,065 | 39,066 | 39,067 | 39,068 | 39,069 | 39,070 | 39,071 | 39,072 | 39,073 | 39,074 | 39,075 |
| | 2-139 | 39,089 | 39,090 | 39,091 | 39,092 | 39,093 | 39,094 | 39,095 | 39,096 | 39,097 | 39,098 | 39,099 | 39,100 |
| | 2-140 | 39,114 | 39,115 | 39,116 | 39,117 | 39,118 | 39,119 | 39,120 | 39,121 | 39,122 | 39,123 | 39,124 | 39,125 |
| | 2-141 | 39,139 | 39,140 | 39,141 | 39,142 | 39,143 | 39,144 | 39,145 | 39,146 | 39,147 | 39,148 | 39,149 | 39,150 |

TABLE 30-continued

| | | | | | | | | | | | | |
|---|---|---|---|---|---|---|---|---|---|---|---|---|
| 2-142 | 39,164 | 39,165 | 39,166 | 39,167 | 39,168 | 39,169 | 39,170 | 39,171 | 39,172 | 39,173 | 39,174 | 39,175 |
| 2-143 | 39,189 | 39,190 | 39,191 | 39,192 | 39,193 | 39,194 | 39,195 | 39,196 | 39,197 | 39,198 | 39,199 | 39,200 |
| 2-144 | 39,214 | 39,215 | 39,216 | 39,217 | 39,218 | 39,219 | 39,220 | 39,221 | 39,222 | 39,223 | 39,224 | 39,225 |
| 2-145 | 39,239 | 39,240 | 39,241 | 39,242 | 39,243 | 39,244 | 39,245 | 39,246 | 39,247 | 39,248 | 39,249 | 39,250 |
| 2-146 | 39,264 | 39,265 | 39,266 | 39,267 | 39,268 | 39,269 | 39,270 | 39,271 | 39,272 | 39,273 | 39,274 | 39,275 |
| 2-147 | 39,289 | 39,290 | 39,291 | 39,292 | 39,293 | 39,294 | 39,295 | 39,296 | 39,297 | 39,298 | 39,299 | 39,300 |
| 2-148 | 39,314 | 39,315 | 39,316 | 39,317 | 39,318 | 39,319 | 39,320 | 39,321 | 39,322 | 39,323 | 39,324 | 39,325 |
| 2-149 | 39,339 | 39,340 | 39,341 | 39,342 | 39,343 | 39,344 | 39,345 | 39,346 | 39,347 | 39,348 | 39,349 | 39,350 |
| 2-150 | 39,364 | 39,365 | 39,366 | 39,367 | 39,368 | 39,369 | 39,370 | 39,371 | 39,372 | 39,373 | 39,374 | 39,375 |
| 2-151 | 39,389 | 39,390 | 39,391 | 39,392 | 39,393 | 39,394 | 39,395 | 39,396 | 39,397 | 39,398 | 39,399 | 39,400 |
| 2-152 | 39,414 | 39,415 | 39,416 | 39,417 | 39,418 | 39,419 | 39,420 | 39,421 | 39,422 | 39,423 | 39,424 | 39,425 |
| 2-153 | 39,439 | 39,440 | 39,441 | 39,442 | 39,443 | 39,444 | 39,445 | 39,446 | 39,447 | 39,448 | 39,449 | 39,450 |
| 2-154 | 39,464 | 39,465 | 39,466 | 39,467 | 39,468 | 39,469 | 39,470 | 39,471 | 39,472 | 39,473 | 39,474 | 39,475 |
| 2-155 | 39,489 | 39,490 | 39,491 | 39,492 | 39,493 | 39,494 | 39,495 | 39,496 | 39,497 | 39,498 | 39,499 | 39,500 |
| 2-156 | 39,514 | 39,515 | 39,516 | 39,517 | 39,518 | 39,519 | 39,520 | 39,521 | 39,522 | 39,523 | 39,524 | 39,525 |
| 2-157 | 39,539 | 39,540 | 39,541 | 39,542 | 39,543 | 39,544 | 39,545 | 39,546 | 39,547 | 39,548 | 39,549 | 39,550 |
| 2-158 | 39,564 | 39,565 | 39,566 | 39,567 | 39,568 | 39,569 | 39,570 | 39,571 | 39,572 | 39,573 | 39,574 | 39,575 |
| 2-159 | 39,589 | 39,590 | 39,591 | 39,592 | 39,593 | 39,594 | 39,595 | 39,596 | 39,597 | 39,598 | 39,599 | 39,600 |
| 2-160 | 39,614 | 39,615 | 39,616 | 39,617 | 39,618 | 39,619 | 39,620 | 39,621 | 39,622 | 39,623 | 39,624 | 39,625 |
| 2-161 | 39,639 | 39,640 | 39,641 | 39,642 | 39,643 | 39,644 | 39,645 | 39,646 | 39,647 | 39,648 | 39,649 | 39,650 |
| 2-162 | 39,664 | 39,665 | 39,666 | 39,667 | 39,668 | 39,669 | 39,670 | 39,671 | 39,672 | 39,673 | 39,674 | 39,675 |
| 2-163 | 39,689 | 39,690 | 39,691 | 39,692 | 39,693 | 39,694 | 39,695 | 39,696 | 39,697 | 39,698 | 39,699 | 39,700 |
| 2-164 | 39,714 | 39,715 | 39,716 | 39,717 | 39,718 | 39,719 | 39,720 | 39,721 | 39,722 | 39,723 | 39,724 | 39,725 |
| 2-165 | 39,739 | 39,740 | 39,741 | 39,742 | 39,743 | 39,744 | 39,745 | 39,746 | 39,747 | 39,748 | 39,749 | 39,750 |

TABLE 31

| | | Compound represented by the formula (1) | | | | | | | | | | | | |
|---|---|---|---|---|---|---|---|---|---|---|---|---|---|---|
| | | 1-76 | 1-77 | 1-78 | 1-79 | 1-80 | 1-81 | 1-82 | 1-83 | 1-84 | 1-85 | 1-86 | 1-87 | 1-88 |
| Compound represented by the formula (2) | 2-166 | 39,751 | 39,752 | 39,753 | 39,754 | 39,755 | 39,756 | 39,757 | 39,758 | 39,759 | 39,760 | 39,761 | 39,762 | 39,763 |
| | 2-167 | 39,776 | 39,777 | 39,778 | 39,779 | 39,780 | 39,781 | 39,782 | 39,783 | 39,784 | 39,785 | 39,786 | 39,787 | 39,788 |
| | 2-168 | 39,801 | 39,802 | 39,803 | 39,804 | 39,805 | 39,806 | 39,807 | 39,808 | 39,809 | 39,810 | 39,811 | 39,812 | 39,813 |
| | 2-169 | 39,826 | 39,827 | 39,828 | 39,829 | 39,830 | 39,831 | 39,832 | 39,833 | 39,834 | 39,835 | 39,836 | 39,837 | 39,838 |
| | 2-170 | 39,851 | 39,852 | 39,853 | 39,854 | 39,855 | 39,856 | 39,857 | 39,858 | 39,859 | 39,860 | 39,861 | 39,862 | 39,863 |
| | 2-171 | 39,876 | 39,877 | 39,878 | 39,879 | 39,880 | 39,881 | 39,882 | 39,883 | 39,884 | 39,885 | 39,886 | 39,887 | 39,888 |
| | 2-172 | 39,901 | 39,902 | 39,903 | 39,904 | 39,905 | 39,906 | 39,907 | 39,908 | 39,909 | 39,910 | 39,911 | 39,912 | 39,913 |
| | 2-173 | 39,926 | 39,927 | 39,928 | 39,929 | 39,930 | 39,931 | 39,932 | 39,933 | 39,934 | 39,935 | 39,936 | 39,937 | 39,938 |
| | 2-174 | 39,951 | 39,952 | 39,953 | 39,954 | 39,955 | 39,956 | 39,957 | 39,958 | 39,959 | 39,960 | 39,961 | 39,962 | 39,963 |
| | 2-175 | 39,976 | 39,977 | 39,978 | 39,979 | 39,980 | 39,981 | 39,982 | 39,983 | 39,984 | 39,985 | 39,986 | 39,987 | 39,988 |
| | 2-176 | 40,001 | 40,002 | 40,003 | 40,004 | 40,005 | 40,006 | 40,007 | 40,008 | 40,009 | 40,010 | 40,011 | 40,012 | 40,013 |
| | 2-177 | 40,026 | 40,027 | 40,028 | 40,029 | 40,030 | 40,031 | 40,032 | 40,033 | 40,034 | 40,035 | 40,036 | 40,037 | 40,038 |
| | 2-178 | 40,051 | 40,052 | 40,053 | 40,054 | 40,055 | 40,056 | 40,057 | 40,058 | 40,059 | 40,060 | 40,061 | 40,062 | 40,063 |
| | 2-179 | 40,076 | 40,077 | 40,078 | 40,079 | 40,080 | 40,081 | 40,082 | 40,083 | 40,084 | 40,085 | 40,086 | 40,087 | 40,088 |
| | 2-180 | 40,101 | 40,102 | 40,103 | 40,104 | 40,105 | 40,106 | 40,107 | 40,108 | 40,109 | 40,110 | 40,111 | 40,112 | 40,113 |
| | 2-181 | 40,126 | 40,127 | 40,128 | 40,129 | 40,130 | 40,131 | 40,132 | 40,133 | 40,134 | 40,135 | 40,136 | 40,137 | 40,138 |
| | 2-182 | 40,151 | 40,152 | 40,153 | 40,154 | 40,155 | 40,156 | 40,157 | 40,158 | 40,159 | 40,160 | 40,161 | 40,162 | 40,163 |
| | 2-183 | 40,176 | 40,177 | 40,178 | 40,179 | 40,180 | 40,181 | 40,182 | 40,183 | 40,184 | 40,185 | 40,186 | 40,187 | 40,188 |
| | 2-184 | 40,201 | 40,202 | 40,203 | 40,204 | 40,205 | 40,206 | 40,207 | 40,208 | 40,209 | 40,210 | 40,211 | 40,212 | 40,213 |
| | 2-185 | 40,226 | 40,227 | 40,228 | 40,229 | 40,230 | 40,231 | 40,232 | 40,233 | 40,234 | 40,235 | 40,236 | 40,237 | 40,238 |
| | 2-186 | 40,251 | 40,252 | 40,253 | 40,254 | 40,255 | 40,256 | 40,257 | 40,258 | 40,259 | 40,260 | 40,261 | 40,262 | 40,263 |
| | 2-187 | 40,276 | 40,277 | 40,278 | 40,279 | 40,280 | 40,281 | 40,282 | 40,283 | 40,284 | 40,285 | 40,286 | 40,287 | 40,288 |
| | 2-188 | 40,301 | 40,302 | 40,303 | 40,304 | 40,305 | 40,306 | 40,307 | 40,308 | 40,309 | 40,310 | 40,311 | 40,312 | 40,313 |
| | 2-189 | 40,326 | 40,327 | 40,328 | 40,329 | 40,330 | 40,331 | 40,332 | 40,333 | 40,334 | 40,335 | 40,336 | 40,337 | 40,338 |
| | 2-190 | 40,351 | 40,352 | 40,353 | 40,354 | 40,355 | 40,356 | 40,357 | 40,358 | 40,359 | 40,360 | 40,361 | 40,362 | 40,363 |
| | 2-191 | 40,376 | 40,377 | 40,378 | 40,379 | 40,380 | 40,381 | 40,382 | 40,383 | 40,384 | 40,385 | 40,386 | 40,387 | 40,388 |
| | 2-192 | 40,401 | 40,402 | 40,403 | 40,404 | 40,405 | 40,406 | 40,407 | 40,408 | 40,409 | 40,410 | 40,411 | 40,412 | 40,413 |
| | 2-193 | 40,426 | 40,427 | 40,428 | 40,429 | 40,430 | 40,431 | 40,432 | 40,433 | 40,434 | 40,435 | 40,436 | 40,437 | 40,438 |
| | 2-194 | 40,451 | 40,452 | 40,453 | 40,454 | 40,455 | 40,456 | 40,457 | 40,458 | 40,459 | 40,460 | 40,461 | 40,462 | 40,463 |
| | 2-195 | 40,476 | 40,477 | 40,478 | 40,479 | 40,480 | 40,481 | 40,482 | 40,483 | 40,484 | 40,485 | 40,486 | 40,487 | 40,488 |
| | 2-196 | 40,501 | 40,502 | 40,503 | 40,504 | 40,505 | 40,506 | 40,507 | 40,508 | 40,509 | 40,510 | 40,511 | 40,512 | 40,513 |
| | 2-197 | 40,526 | 40,527 | 40,528 | 40,529 | 40,530 | 40,531 | 40,532 | 40,533 | 40,534 | 40,535 | 40,536 | 40,537 | 40,538 |
| | 2-198 | 40,551 | 40,552 | 40,553 | 40,554 | 40,555 | 40,556 | 40,557 | 40,558 | 40,559 | 40,560 | 40,561 | 40,562 | 40,563 |
| | 2-199 | 40,576 | 40,577 | 40,578 | 40,579 | 40,580 | 40,581 | 40,582 | 40,583 | 40,584 | 40,585 | 40,586 | 40,587 | 40,588 |
| | 2-200 | 40,601 | 40,602 | 40,603 | 40,604 | 40,605 | 40,606 | 40,607 | 40,608 | 40,609 | 40,610 | 40,611 | 40,612 | 40,613 |
| | 2-201 | 40,626 | 40,627 | 40,628 | 40,629 | 40,630 | 40,631 | 40,632 | 40,633 | 40,634 | 40,635 | 40,636 | 40,637 | 40,638 |
| | 2-202 | 40,651 | 40,652 | 40,653 | 40,654 | 40,655 | 40,656 | 40,657 | 40,658 | 40,659 | 40,660 | 40,661 | 40,662 | 40,663 |
| | 2-203 | 40,676 | 40,677 | 40,678 | 40,679 | 40,680 | 40,681 | 40,682 | 40,683 | 40,684 | 40,685 | 40,686 | 40,687 | 40,688 |
| | 2-204 | 40,701 | 40,702 | 40,703 | 40,704 | 40,705 | 40,706 | 40,707 | 40,708 | 40,709 | 40,710 | 40,711 | 40,712 | 40,713 |
| | 2-205 | 40,726 | 40,727 | 40,728 | 40,729 | 40,730 | 40,731 | 40,732 | 40,733 | 40,734 | 40,735 | 40,736 | 40,737 | 40,738 |
| | 2-206 | 40,751 | 40,752 | 40,753 | 40,754 | 40,755 | 40,756 | 40,757 | 40,758 | 40,759 | 40,760 | 40,761 | 40,762 | 40,763 |
| | 2-207 | 40,776 | 40,777 | 40,778 | 40,779 | 40,780 | 40,781 | 40,782 | 40,783 | 40,784 | 40,785 | 40,786 | 40,787 | 40,788 |
| | 2-208 | 40,801 | 40,802 | 40,803 | 40,804 | 40,805 | 40,806 | 40,807 | 40,808 | 40,809 | 40,810 | 40,811 | 40,812 | 40,813 |
| | 2-209 | 40,826 | 40,827 | 40,828 | 40,829 | 40,830 | 40,831 | 40,832 | 40,833 | 40,834 | 40,835 | 40,836 | 40,837 | 40,838 |
| | 2-210 | 40,851 | 40,852 | 40,853 | 40,854 | 40,855 | 40,856 | 40,857 | 40,858 | 40,859 | 40,860 | 40,861 | 40,862 | 40,863 |
| | 2-211 | 40,876 | 40,877 | 40,878 | 40,879 | 40,880 | 40,881 | 40,882 | 40,883 | 40,884 | 40,885 | 40,886 | 40,887 | 40,888 |

TABLE 31-continued

| | | | | | | | | | | | | | | |
|---|---|---|---|---|---|---|---|---|---|---|---|---|---|---|
| | 2-212 | 40,901 | 40,902 | 40,903 | 40,904 | 40,905 | 40,906 | 40,907 | 40,908 | 40,909 | 40,910 | 40,911 | 40,912 | 40,913 |
| | 2-213 | 40,926 | 40,927 | 40,928 | 40,929 | 40,930 | 40,931 | 40,932 | 40,933 | 40,934 | 40,935 | 40,936 | 40,937 | 40,938 |
| | 2-214 | 40,951 | 40,952 | 40,953 | 40,954 | 40,955 | 40,956 | 40,957 | 40,958 | 40,959 | 40,960 | 40,961 | 40,962 | 40,963 |
| | 2-215 | 40,976 | 40,977 | 40,978 | 40,979 | 40,980 | 40,981 | 40,982 | 40,983 | 40,984 | 40,985 | 40,986 | 40,987 | 40,988 |
| | 2-216 | 41,001 | 41,002 | 41,003 | 41,004 | 41,005 | 41,006 | 41,007 | 41,008 | 41,009 | 41,010 | 41,011 | 41,012 | 41,013 |
| | 2-217 | 41,026 | 41,027 | 41,028 | 41,029 | 41,030 | 41,031 | 41,032 | 41,033 | 41,034 | 41,035 | 41,036 | 41,037 | 41,038 |
| | 2-218 | 41,051 | 41,052 | 41,053 | 41,054 | 41,055 | 41,056 | 41,057 | 41,058 | 41,059 | 41,060 | 41,061 | 41,062 | 41,063 |
| | 2-219 | 41,076 | 41,077 | 41,078 | 41,079 | 41,080 | 41,081 | 41,082 | 41,083 | 41,084 | 41,085 | 41,086 | 41,087 | 41,088 |
| | 2-220 | 41,101 | 41,102 | 41,103 | 41,104 | 41,105 | 41,106 | 41,107 | 41,108 | 41,109 | 41,110 | 41,111 | 41,112 | 41,113 |

| | | Compound represented by the formula (1) | | | | | | | | | | | |
|---|---|---|---|---|---|---|---|---|---|---|---|---|---|
| | | 1-89 | 1-90 | 1-91 | 1-92 | 1-93 | 1-94 | 1-95 | 1-96 | -97 | 1-98 | 1-99 | 1-100 |
| Compound represented by the formula (2) | 2-166 | 39,764 | 39,765 | 39,766 | 39,767 | 39,768 | 39,769 | 39,770 | 39,771 | 39,772 | 39,773 | 39,774 | 39,775 |
| | 2-167 | 39,789 | 39,790 | 39,791 | 39,792 | 39,793 | 39,794 | 39,795 | 39,796 | 39,797 | 39,798 | 39,799 | 39,800 |
| | 2-168 | 39,814 | 39,815 | 39,816 | 39,817 | 39,818 | 39,819 | 39,820 | 39,821 | 39,822 | 39,823 | 39,824 | 39,825 |
| | 2-169 | 39,839 | 39,840 | 39,841 | 39,842 | 39,843 | 39,844 | 39,845 | 39,846 | 39,847 | 39,848 | 39,849 | 39,850 |
| | 2-170 | 39,864 | 39,865 | 39,866 | 39,867 | 39,868 | 39,869 | 39,870 | 39,871 | 39,872 | 39,873 | 39,874 | 39,875 |
| | 2-171 | 39,889 | 39,890 | 39,891 | 39,892 | 39,893 | 39,894 | 39,895 | 39,896 | 39,897 | 39,898 | 39,899 | 39,900 |
| | 2-172 | 39,914 | 39,915 | 39,916 | 39,917 | 39,918 | 39,919 | 39,920 | 39,921 | 39,922 | 39,923 | 39,924 | 39,925 |
| | 2-173 | 39,939 | 39,940 | 39,941 | 39,942 | 39,943 | 39,944 | 39,945 | 39,946 | 39,947 | 39,948 | 39,949 | 39,950 |
| | 2-174 | 39,964 | 39,965 | 39,966 | 39,967 | 39,968 | 39,969 | 39,970 | 39,971 | 39,972 | 39,973 | 39,974 | 39,975 |
| | 2-175 | 39,989 | 39,990 | 39,991 | 39,992 | 39,993 | 39,994 | 39,995 | 39,996 | 39,997 | 39,998 | 39,999 | 40,000 |
| | 2-176 | 40,014 | 40,015 | 40,016 | 40,017 | 40,018 | 40,019 | 40,020 | 40,021 | 40,022 | 40,023 | 40,024 | 40,025 |
| | 2-177 | 40,039 | 40,040 | 40,041 | 40,042 | 40,043 | 40,044 | 40,045 | 40,046 | 40,047 | 40,048 | 40,049 | 40,050 |
| | 2-178 | 40,064 | 40,065 | 40,066 | 40,067 | 40,068 | 40,069 | 40,070 | 40,071 | 40,072 | 40,073 | 40,074 | 40,075 |
| | 2-179 | 40,089 | 40,090 | 40,091 | 40,092 | 40,093 | 40,094 | 40,095 | 40,096 | 40,097 | 40,098 | 40,099 | 40,100 |
| | 2-180 | 40,114 | 40,115 | 40,116 | 40,117 | 40,118 | 40,119 | 40,120 | 40,121 | 40,122 | 40,123 | 40,124 | 40,125 |
| | 2-181 | 40,139 | 40,140 | 40,141 | 40,142 | 40,143 | 40,144 | 40,145 | 40,146 | 40,147 | 40,148 | 40,149 | 40,150 |
| | 2-182 | 40,164 | 40,165 | 40,166 | 40,167 | 40,168 | 40,169 | 40,170 | 40,171 | 40,172 | 40,173 | 40,174 | 40,175 |
| | 2-183 | 40,189 | 40,190 | 40,191 | 40,192 | 40,193 | 40,194 | 40,195 | 40,196 | 40,197 | 40,198 | 40,199 | 40,200 |
| | 2-184 | 40,214 | 40,215 | 40,216 | 40,217 | 40,218 | 40,219 | 40,220 | 40,221 | 40,222 | 40,223 | 40,224 | 40,225 |
| | 2-185 | 40,239 | 40,240 | 40,241 | 40,242 | 40,243 | 40,244 | 40,245 | 40,246 | 40,247 | 40,248 | 40,249 | 40,250 |
| | 2-186 | 40,264 | 40,265 | 40,266 | 40,267 | 40,268 | 40,269 | 40,270 | 40,271 | 40,272 | 40,273 | 40,274 | 40,275 |
| | 2-187 | 40,289 | 40,290 | 40,291 | 40,292 | 40,293 | 40,294 | 40,295 | 40,296 | 40,297 | 40,298 | 40,299 | 40,300 |
| | 2-188 | 40,314 | 40,315 | 40,316 | 40,317 | 40,318 | 40,319 | 40,320 | 40,321 | 40,322 | 40,323 | 40,324 | 40,325 |
| | 2-189 | 40,339 | 40,340 | 40,341 | 40,342 | 40,343 | 40,344 | 40,345 | 40,346 | 40,347 | 40,348 | 40,349 | 40,350 |
| | 2-190 | 40,364 | 40,365 | 40,366 | 40,367 | 40,368 | 40,369 | 40,370 | 40,371 | 40,372 | 40,373 | 40,374 | 40,375 |
| | 2-191 | 40,389 | 40,390 | 40,391 | 40,392 | 40,393 | 40,394 | 40,395 | 40,396 | 40,397 | 40,398 | 40,399 | 40,400 |
| | 2-192 | 40,414 | 40,415 | 40,416 | 40,417 | 40,418 | 40,419 | 40,420 | 40,421 | 40,422 | 40,423 | 40,424 | 40,425 |
| | 2-193 | 40,439 | 40,440 | 40,441 | 40,442 | 40,443 | 40,444 | 40,445 | 40,446 | 40,447 | 40,448 | 40,449 | 40,450 |
| | 2-194 | 40,464 | 40,465 | 40,466 | 40,467 | 40,468 | 40,469 | 40,470 | 40,471 | 40,472 | 40,473 | 40,474 | 40,475 |
| | 2-195 | 40,489 | 40,490 | 40,491 | 40,492 | 40,493 | 40,494 | 40,495 | 40,496 | 40,497 | 40,498 | 40,499 | 40,500 |
| | 2-196 | 40,514 | 40,515 | 40,516 | 40,517 | 40,518 | 40,519 | 40,520 | 40,521 | 40,522 | 40,523 | 40,524 | 40,525 |
| | 2-197 | 40,539 | 40,540 | 40,541 | 40,542 | 40,543 | 40,544 | 40,545 | 40,546 | 40,547 | 40,548 | 40,549 | 40,550 |
| | 2-198 | 40,564 | 40,565 | 40,566 | 40,567 | 40,568 | 40,569 | 40,570 | 40,571 | 40,572 | 40,573 | 40,574 | 40,575 |
| | 2-199 | 40,589 | 40,590 | 40,591 | 40,592 | 40,593 | 40,594 | 40,595 | 40,596 | 40,597 | 40,598 | 40,599 | 40,600 |
| | 2-200 | 40,614 | 40,615 | 40,616 | 40,617 | 40,618 | 40,619 | 40,620 | 40,621 | 40,622 | 40,623 | 40,624 | 40,625 |
| | 2-201 | 40,639 | 40,640 | 40,641 | 40,642 | 40,643 | 40,644 | 40,645 | 40,646 | 40,647 | 40,648 | 40,649 | 40,650 |
| | 2-202 | 40,664 | 40,665 | 40,666 | 40,667 | 40,668 | 40,669 | 40,670 | 40,671 | 40,672 | 40,673 | 40,674 | 40,675 |
| | 2-203 | 40,689 | 40,690 | 40,691 | 40,692 | 40,693 | 40,694 | 40,695 | 40,696 | 40,697 | 40,698 | 40,699 | 40,700 |
| | 2-204 | 40,714 | 40,715 | 40,716 | 40,717 | 40,718 | 40,719 | 40,720 | 40,721 | 40,722 | 40,723 | 40,724 | 40,725 |
| | 2-205 | 40,739 | 40,740 | 40,741 | 40,742 | 40,743 | 40,744 | 40,745 | 40,746 | 40,747 | 40,748 | 40,749 | 40,750 |
| | 2-206 | 40,764 | 40,765 | 40,766 | 40,767 | 40,768 | 40,769 | 40,770 | 40,771 | 40,772 | 40,773 | 40,774 | 40,775 |
| | 2-207 | 40,789 | 40,790 | 40,791 | 40,792 | 40,793 | 40,794 | 40,795 | 40,796 | 40,797 | 40,798 | 40,799 | 40,800 |
| | 2-208 | 40,814 | 40,815 | 40,816 | 40,817 | 40,818 | 40,819 | 40,820 | 40,821 | 40,822 | 40,823 | 40,824 | 40,825 |
| | 2-209 | 40,839 | 40,840 | 40,841 | 40,842 | 40,843 | 40,844 | 40,845 | 40,846 | 40,847 | 40,848 | 40,849 | 40,850 |
| | 2-210 | 40,864 | 40,865 | 40,866 | 40,867 | 40,868 | 40,869 | 40,870 | 40,871 | 40,872 | 40,873 | 40,874 | 40,875 |
| | 2-211 | 40,889 | 40,890 | 40,891 | 40,892 | 40,893 | 40,894 | 40,895 | 40,896 | 40,897 | 40,898 | 40,899 | 40,900 |
| | 2-212 | 40,914 | 40,915 | 40,916 | 40,917 | 40,918 | 40,919 | 40,920 | 40,921 | 40,922 | 40,923 | 40,924 | 40,925 |
| | 2-213 | 40,939 | 40,940 | 40,941 | 40,942 | 40,943 | 40,944 | 40,945 | 40,946 | 40,947 | 40,948 | 40,949 | 40,950 |
| | 2-214 | 40,964 | 40,965 | 40,966 | 40,967 | 40,968 | 40,969 | 40,970 | 40,971 | 40,972 | 40,973 | 40,974 | 40,975 |
| | 2-215 | 40,989 | 40,990 | 40,991 | 40,992 | 40,993 | 40,994 | 40,995 | 40,996 | 40,997 | 40,998 | 40,999 | 41,000 |
| | 2-216 | 41,014 | 41,015 | 41,016 | 41,017 | 41,018 | 41,019 | 41,020 | 41,021 | 41,022 | 41,023 | 41,024 | 41,025 |
| | 2-217 | 41,039 | 41,040 | 41,041 | 41,042 | 41,043 | 41,044 | 41,045 | 41,046 | 41,047 | 41,048 | 41,049 | 41,050 |
| | 2-218 | 41,064 | 41,065 | 41,066 | 41,067 | 41,068 | 41,069 | 41,070 | 41,071 | 41,072 | 41,073 | 41,074 | 41,075 |
| | 2-219 | 41,089 | 41,090 | 41,091 | 41,092 | 41,093 | 41,094 | 41,095 | 41,096 | 41,097 | 41,098 | 41,099 | 41,100 |
| | 2-220 | 41,114 | 41,115 | 41,116 | 41,117 | 41,118 | 41,119 | 41,120 | 41,121 | 41,122 | 41,123 | 41,124 | 41,125 |

TABLE 32

| | | Compound represented by the formula (1) | | | | | | | | | | | | |
|---|---|---|---|---|---|---|---|---|---|---|---|---|---|---|
| | | 1-76 | 1-77 | 1-78 | 1-79 | 1-80 | 1-81 | 1-82 | 1-83 | 1-84 | 1-85 | 1-86 | 1-87 | 1-88 |
| Compound represented by the formula (2) | 2-221 | 41,126 | 41,127 | 41,128 | 41,129 | 41,130 | 41,131 | 41,132 | 41,133 | 41,134 | 41,135 | 41,136 | 41,137 | 41,138 |
| | 2-222 | 41,151 | 41,152 | 41,153 | 41,154 | 41,155 | 41,156 | 41,157 | 41,158 | 41,159 | 41,160 | 41,161 | 41,162 | 41,163 |
| | 2-223 | 41,176 | 41,177 | 41,178 | 41,179 | 41,180 | 41,181 | 41,182 | 41,183 | 41,184 | 41,185 | 41,186 | 41,187 | 41,188 |
| | 2-224 | 41,201 | 41,202 | 41,203 | 41,204 | 41,205 | 41,206 | 41,207 | 41,208 | 41,209 | 41,210 | 41,211 | 41,212 | 41,213 |
| | 2-225 | 41,226 | 41,227 | 41,228 | 41,229 | 41,230 | 41,231 | 41,232 | 41,233 | 41,234 | 41,235 | 41,236 | 41,237 | 41,238 |
| | 2-226 | 41,251 | 41,252 | 41,253 | 41,254 | 41,255 | 41,256 | 41,257 | 41,258 | 41,259 | 41,260 | 41,261 | 41,262 | 41,263 |
| | 2-227 | 41,276 | 41,277 | 41,278 | 41,279 | 41,280 | 41,281 | 41,282 | 41,283 | 41,284 | 41,285 | 41,286 | 41,287 | 41,288 |
| | 2-228 | 41,301 | 41,302 | 41,303 | 41,304 | 41,305 | 41,306 | 41,307 | 41,308 | 41,309 | 41,310 | 41,311 | 41,312 | 41,313 |
| | 2-229 | 41,326 | 41,327 | 41,328 | 41,329 | 41,330 | 41,331 | 41,332 | 41,333 | 41,334 | 41,335 | 41,336 | 41,337 | 41,338 |
| | 2-230 | 41,351 | 41,352 | 41,353 | 41,354 | 41,355 | 41,356 | 41,357 | 41,358 | 41,359 | 41,360 | 41,361 | 41,362 | 41,363 |
| | 2-231 | 41,376 | 41,377 | 41,378 | 41,379 | 41,380 | 41,381 | 41,382 | 41,383 | 41,384 | 41,385 | 41,386 | 41,387 | 41,388 |
| | 2-232 | 41,401 | 41,402 | 41,403 | 41,404 | 41,405 | 41,406 | 41,407 | 41,408 | 41,409 | 41,410 | 41,411 | 41,412 | 41,413 |
| | 2-233 | 41,426 | 41,427 | 41,428 | 41,429 | 41,430 | 41,431 | 41,432 | 41,433 | 41,434 | 41,435 | 41,436 | 41,437 | 41,438 |
| | 2-234 | 41,451 | 41,452 | 41,453 | 41,454 | 41,455 | 41,456 | 41,457 | 41,458 | 41,459 | 41,460 | 41,461 | 41,462 | 41,463 |
| | 2-235 | 41,476 | 41,477 | 41,478 | 41,479 | 41,480 | 41,481 | 41,482 | 41,483 | 41,484 | 41,485 | 41,486 | 41,487 | 41,488 |
| | 2-236 | 41,501 | 41,502 | 41,503 | 41,504 | 41,505 | 41,506 | 41,507 | 41,508 | 41,509 | 41,510 | 41,511 | 41,512 | 41,513 |
| | 2-237 | 41,526 | 41,527 | 41,528 | 41,529 | 41,530 | 41,531 | 41,532 | 41,533 | 41,534 | 41,535 | 41,536 | 41,537 | 41,538 |
| | 2-238 | 41,551 | 41,552 | 41,553 | 41,554 | 41,555 | 41,556 | 41,557 | 41,558 | 41,559 | 41,560 | 41,561 | 41,562 | 41,563 |
| | 2-239 | 41,576 | 41,577 | 41,578 | 41,579 | 41,580 | 41,581 | 41,582 | 41,583 | 41,584 | 41,585 | 41,586 | 41,587 | 41,588 |
| | 2-240 | 41,601 | 41,602 | 41,603 | 41,604 | 41,605 | 41,606 | 41,607 | 41,608 | 41,609 | 41,610 | 41,611 | 41,612 | 41,613 |
| | 2-241 | 41,626 | 41,627 | 41,628 | 41,629 | 41,630 | 41,631 | 41,632 | 41,633 | 41,634 | 41,635 | 41,636 | 41,637 | 41,638 |
| | 2-242 | 41,651 | 41,652 | 41,653 | 41,654 | 41,655 | 41,656 | 41,657 | 41,658 | 41,659 | 41,660 | 41,661 | 41,662 | 41,663 |
| | 2-243 | 41,676 | 41,677 | 41,678 | 41,679 | 41,680 | 41,681 | 41,682 | 41,683 | 41,684 | 41,685 | 41,686 | 41,687 | 41,688 |
| | 2-244 | 41,701 | 41,702 | 41,703 | 41,704 | 41,705 | 41,706 | 41,707 | 41,708 | 41,709 | 41,710 | 41,711 | 41,712 | 41,713 |
| | 2-245 | 41,726 | 41,727 | 41,728 | 41,729 | 41,730 | 41,731 | 41,732 | 41,733 | 41,734 | 41,735 | 41,736 | 41,737 | 41,738 |
| | 2-246 | 41,751 | 41,752 | 41,753 | 41,754 | 41,755 | 41,756 | 41,757 | 41,758 | 41,759 | 41,760 | 41,761 | 41,762 | 41,763 |
| | 2-247 | 41,776 | 41,777 | 41,778 | 41,779 | 41,780 | 41,781 | 41,782 | 41,783 | 41,784 | 41,785 | 41,786 | 41,787 | 41,788 |
| | 2-248 | 41,801 | 41,802 | 41,803 | 41,804 | 41,805 | 41,806 | 41,807 | 41,808 | 41,809 | 41,810 | 41,811 | 41,812 | 41,813 |
| | 2-249 | 41,826 | 41,827 | 41,828 | 41,829 | 41,830 | 41,831 | 41,832 | 41,833 | 41,834 | 41,835 | 41,836 | 41,837 | 41,838 |
| | 2-250 | 41,851 | 41,852 | 41,853 | 41,854 | 41,855 | 41,856 | 41,857 | 41,858 | 41,859 | 41,860 | 41,861 | 41,862 | 41,863 |
| | 2-251 | 41,876 | 41,877 | 41,878 | 41,879 | 41,880 | 41,881 | 41,882 | 41,883 | 41,884 | 41,885 | 41,886 | 41,887 | 41,888 |
| | 2-252 | 41,901 | 41,902 | 41,903 | 41,904 | 41,905 | 41,906 | 41,907 | 41,908 | 41,909 | 41,910 | 41,911 | 41,912 | 41,913 |
| | 2-253 | 41,926 | 41,927 | 41,928 | 41,929 | 41,930 | 41,931 | 41,932 | 41,933 | 41,934 | 41,935 | 41,936 | 41,937 | 41,938 |
| | 2-254 | 41,951 | 41,952 | 41,953 | 41,954 | 41,955 | 41,956 | 41,957 | 41,958 | 41,959 | 41,960 | 41,961 | 41,962 | 41,963 |
| | 2-255 | 41,976 | 41,977 | 41,978 | 41,979 | 41,980 | 41,981 | 41,982 | 41,983 | 41,984 | 41,985 | 41,986 | 41,987 | 41,988 |
| | 2-256 | 42,001 | 42,002 | 42,003 | 42,004 | 42,005 | 42,006 | 42,007 | 42,008 | 42,009 | 42,010 | 42,011 | 42,012 | 42,013 |
| | 2-257 | 42,026 | 42,027 | 42,028 | 42,029 | 42,030 | 42,031 | 42,032 | 42,033 | 42,034 | 42,035 | 42,036 | 42,037 | 42,038 |
| | 2-258 | 42,051 | 42,052 | 42,053 | 42,054 | 42,055 | 42,056 | 42,057 | 42,058 | 42,059 | 42,060 | 42,061 | 42,062 | 42,063 |
| | 2-259 | 42,076 | 42,077 | 42,078 | 42,079 | 42,080 | 42,081 | 42,082 | 42,083 | 42,084 | 42,085 | 42,086 | 42,087 | 42,088 |
| | 2-260 | 42,101 | 42,102 | 42,103 | 42,104 | 42,105 | 42,106 | 42,107 | 42,108 | 42,109 | 42,110 | 42,111 | 42,112 | 42,113 |
| | 2-261 | 42,126 | 42,127 | 42,128 | 42,129 | 42,130 | 42,131 | 42,132 | 42,133 | 42,134 | 42,135 | 42,136 | 42,137 | 42,138 |
| | 2-262 | 42,151 | 42,152 | 42,153 | 42,154 | 42,155 | 42,156 | 42,157 | 42,158 | 42,159 | 42,160 | 42,161 | 42,162 | 42,163 |
| | 2-263 | 42,176 | 42,177 | 42,178 | 42,179 | 42,180 | 42,181 | 42,182 | 42,183 | 42,184 | 42,185 | 42,186 | 42,187 | 42,188 |
| | 2-264 | 42,201 | 42,202 | 42,203 | 42,204 | 42,205 | 42,206 | 42,207 | 42,208 | 42,209 | 42,210 | 42,211 | 42,212 | 42,213 |
| | 2-265 | 42,226 | 42,227 | 42,228 | 42,229 | 42,230 | 42,231 | 42,232 | 42,233 | 42,234 | 42,235 | 42,236 | 42,237 | 42,238 |
| | 2-266 | 42,251 | 42,252 | 42,253 | 42,254 | 42,255 | 42,256 | 42,257 | 42,258 | 42,259 | 42,260 | 42,261 | 42,262 | 42,263 |
| | 2-267 | 42,276 | 42,277 | 42,278 | 42,279 | 42,280 | 42,281 | 42,282 | 42,283 | 42,284 | 42,285 | 42,286 | 42,287 | 42,288 |
| | 2-268 | 42,301 | 42,302 | 42,303 | 42,304 | 42,305 | 42,306 | 42,307 | 42,308 | 42,309 | 42,310 | 42,311 | 42,312 | 42,313 |
| | 2-269 | 42,326 | 42,327 | 42,328 | 42,329 | 42,330 | 42,331 | 42,332 | 42,333 | 42,334 | 42,335 | 42,336 | 42,337 | 42,338 |
| | 2-270 | 42,351 | 42,352 | 42,353 | 42,354 | 42,355 | 42,356 | 42,357 | 42,358 | 42,359 | 42,360 | 42,361 | 42,362 | 42,363 |
| | 2-271 | 42,376 | 42,377 | 42,378 | 42,379 | 42,380 | 42,381 | 42,382 | 42,383 | 42,384 | 42,385 | 42,386 | 42,387 | 42,388 |
| | 2-272 | 42,401 | 42,402 | 42,403 | 42,404 | 42,405 | 42,406 | 42,407 | 42,408 | 42,409 | 42,410 | 42,411 | 42,412 | 42,413 |
| | 2-273 | 42,426 | 42,427 | 42,428 | 42,429 | 42,430 | 42,431 | 42,432 | 42,433 | 42,434 | 42,435 | 42,436 | 42,437 | 42,438 |
| | 2-274 | 42,451 | 42,452 | 42,453 | 42,454 | 42,455 | 42,456 | 42,457 | 42,458 | 42,459 | 42,460 | 42,461 | 42,462 | 42,463 |
| | 2-275 | 42,476 | 42,477 | 42,478 | 42,479 | 42,480 | 42,481 | 42,482 | 42,483 | 42,484 | 42,485 | 42,486 | 42,487 | 42,488 |

| | | Compound represented by the formula (1) | | | | | | | | | | | |
|---|---|---|---|---|---|---|---|---|---|---|---|---|---|
| | | 1-89 | 1-90 | 1-91 | 1-92 | 1-93 | 1-94 | 1-95 | 1-96 | 1-97 | 1-98 | 1-99 | 1-100 |
| Compound represented by the formula (2) | 2-221 | 41,139 | 41,140 | 41,141 | 41,142 | 41,143 | 41,144 | 41,145 | 41,146 | 41,147 | 41,148 | 41,149 | 41,150 |
| | 2-222 | 41,164 | 41,165 | 41,166 | 41,167 | 41,168 | 41,169 | 41,170 | 41,171 | 41,172 | 41,173 | 41,174 | 41,175 |
| | 2-223 | 41,189 | 41,190 | 41,191 | 41,192 | 41,193 | 41,194 | 41,195 | 41,196 | 41,197 | 41,198 | 41,199 | 41,200 |
| | 2-224 | 41,214 | 41,215 | 41,216 | 41,217 | 41,218 | 41,219 | 41,220 | 41,221 | 41,222 | 41,223 | 41,224 | 41,225 |
| | 2-225 | 41,239 | 41,240 | 41,241 | 41,242 | 41,243 | 41,244 | 41,245 | 41,246 | 41,247 | 41,248 | 41,249 | 41,250 |
| | 2-226 | 41,264 | 41,265 | 41,266 | 41,267 | 41,268 | 41,269 | 41,270 | 41,271 | 41,272 | 41,273 | 41,274 | 41,275 |
| | 2-227 | 41,289 | 41,290 | 41,291 | 41,292 | 41,293 | 41,294 | 41,295 | 41,296 | 41,297 | 41,298 | 41,299 | 41,300 |
| | 2-228 | 41,314 | 41,315 | 41,316 | 41,317 | 41,318 | 41,319 | 41,320 | 41,321 | 41,322 | 41,323 | 41,324 | 41,325 |
| | 2-229 | 41,339 | 41,340 | 41,341 | 41,342 | 41,343 | 41,344 | 41,345 | 41,346 | 41,347 | 41,348 | 41,349 | 41,350 |
| | 2-230 | 41,364 | 41,365 | 41,366 | 41,367 | 41,368 | 41,369 | 41,370 | 41,371 | 41,372 | 41,373 | 41,374 | 41,375 |
| | 2-231 | 41,389 | 41,390 | 41,391 | 41,392 | 41,393 | 41,394 | 41,395 | 41,396 | 41,397 | 41,398 | 41,399 | 41,400 |
| | 2-232 | 41,414 | 41,415 | 41,416 | 41,417 | 41,418 | 41,419 | 41,420 | 41,421 | 41,422 | 41,423 | 41,424 | 41,425 |
| | 2-233 | 41,439 | 41,440 | 41,441 | 41,442 | 41,443 | 41,444 | 41,445 | 41,446 | 41,447 | 41,448 | 41,449 | 41,450 |
| | 2-234 | 41,464 | 41,465 | 41,466 | 41,467 | 41,468 | 41,469 | 41,470 | 41,471 | 41,472 | 41,473 | 41,474 | 41,475 |
| | 2-235 | 41,489 | 41,490 | 41,491 | 41,492 | 41,493 | 41,494 | 41,495 | 41,496 | 41,497 | 41,498 | 41,499 | 41,500 |
| | 2-236 | 41,514 | 41,515 | 41,516 | 41,517 | 41,518 | 41,519 | 41,520 | 41,521 | 41,522 | 41,523 | 41,524 | 41,525 |

TABLE 32-continued

| | | | | | | | | | | | | |
|---|---|---|---|---|---|---|---|---|---|---|---|---|
| 2-237 | 41,539 | 41,540 | 41,541 | 41,542 | 41,543 | 41,544 | 41,545 | 41,546 | 41,547 | 41,548 | 41,549 | 41,550 |
| 2-238 | 41,564 | 41,565 | 41,566 | 41,567 | 41,568 | 41,569 | 41,570 | 41,571 | 41,572 | 41,573 | 41,574 | 41,575 |
| 2-239 | 41,589 | 41,590 | 41,591 | 41,592 | 41,593 | 41,594 | 41,595 | 41,596 | 41,597 | 41,598 | 41,599 | 41,600 |
| 2-240 | 41,614 | 41,615 | 41,616 | 41,617 | 41,618 | 41,619 | 41,620 | 41,621 | 41,622 | 41,623 | 41,624 | 41,625 |
| 2-241 | 41,639 | 41,640 | 41,641 | 41,642 | 41,643 | 41,644 | 41,645 | 41,646 | 41,647 | 41,648 | 41,649 | 41,650 |
| 2-242 | 41,664 | 41,665 | 41,666 | 41,667 | 41,668 | 41,669 | 41,670 | 41,671 | 41,672 | 41,673 | 41,674 | 41,675 |
| 2-243 | 41,689 | 41,690 | 41,691 | 41,692 | 41,693 | 41,694 | 41,695 | 41,696 | 41,697 | 41,698 | 41,699 | 41,700 |
| 2-244 | 41,714 | 41,715 | 41,716 | 41,717 | 41,718 | 41,719 | 41,720 | 41,721 | 41,722 | 41,723 | 41,724 | 41,725 |
| 2-245 | 41,739 | 41,740 | 41,741 | 41,742 | 41,743 | 41,744 | 41,745 | 41,746 | 41,747 | 41,748 | 41,749 | 41,750 |
| 2-246 | 41,764 | 41,765 | 41,766 | 41,767 | 41,768 | 41,769 | 41,770 | 41,771 | 41,772 | 41,773 | 41,774 | 41,775 |
| 2-247 | 41,789 | 41,790 | 41,791 | 41,792 | 41,793 | 41,794 | 41,795 | 41,796 | 41,797 | 41,798 | 41,799 | 41,800 |
| 2-248 | 41,814 | 41,815 | 41,816 | 41,817 | 41,818 | 41,819 | 41,820 | 41,821 | 41,822 | 41,823 | 41,824 | 41,825 |
| 2-249 | 41,839 | 41,840 | 41,841 | 41,842 | 41,843 | 41,844 | 41,845 | 41,846 | 41,847 | 41,848 | 41,849 | 41,850 |
| 2-250 | 41,864 | 41,865 | 41,866 | 41,867 | 41,868 | 41,869 | 41,870 | 41,871 | 41,872 | 41,873 | 41,874 | 41,875 |
| 2-251 | 41,889 | 41,890 | 41,891 | 41,892 | 41,893 | 41,894 | 41,895 | 41,896 | 41,897 | 41,898 | 41,899 | 41,900 |
| 2-252 | 41,914 | 41,915 | 41,916 | 41,917 | 41,918 | 41,919 | 41,920 | 41,921 | 41,922 | 41,923 | 41,924 | 41,925 |
| 2-253 | 41,939 | 41,940 | 41,941 | 41,942 | 41,943 | 41,944 | 41,945 | 41,946 | 41,947 | 41,948 | 41,949 | 41,950 |
| 2-254 | 41,964 | 41,965 | 41,966 | 41,967 | 41,968 | 41,969 | 41,970 | 41,971 | 41,972 | 41,973 | 41,974 | 41,975 |
| 2-255 | 41,989 | 41,990 | 41,991 | 41,992 | 41,993 | 41,994 | 41,995 | 41,996 | 41,997 | 41,998 | 41,999 | 42,000 |
| 2-256 | 42,014 | 42,015 | 42,016 | 42,017 | 42,018 | 42,019 | 42,020 | 42,021 | 42,022 | 42,023 | 42,024 | 42,025 |
| 2-257 | 42,039 | 42,040 | 42,041 | 42,042 | 42,043 | 42,044 | 42,045 | 42,046 | 42,047 | 42,048 | 42,049 | 42,050 |
| 2-258 | 42,064 | 42,065 | 42,066 | 42,067 | 42,068 | 42,069 | 42,070 | 42,071 | 42,072 | 42,073 | 42,074 | 42,075 |
| 2-259 | 42,089 | 42,090 | 42,091 | 42,092 | 42,093 | 42,094 | 42,095 | 42,096 | 42,097 | 42,098 | 42,099 | 42,100 |
| 2-260 | 42,114 | 42,115 | 42,116 | 42,117 | 42,118 | 42,119 | 42,120 | 42,121 | 42,122 | 42,123 | 42,124 | 42,125 |
| 2-261 | 42,139 | 42,140 | 42,141 | 42,142 | 42,143 | 42,144 | 42,145 | 42,146 | 42,147 | 42,148 | 42,149 | 42,150 |
| 2-262 | 42,164 | 42,165 | 42,166 | 42,167 | 42,168 | 42,169 | 42,170 | 42,171 | 42,172 | 42,173 | 42,174 | 42,175 |
| 2-263 | 42,189 | 42,190 | 42,191 | 42,192 | 42,193 | 42,194 | 42,195 | 42,196 | 42,197 | 42,198 | 42,199 | 42,200 |
| 2-264 | 42,214 | 42,215 | 42,216 | 42,217 | 42,218 | 42,219 | 42,220 | 42,221 | 42,222 | 42,223 | 42,224 | 42,225 |
| 2-265 | 42,239 | 42,240 | 42,241 | 42,242 | 42,243 | 42,244 | 42,245 | 42,246 | 42,247 | 42,248 | 42,249 | 42,250 |
| 2-266 | 42,264 | 42,265 | 42,266 | 42,267 | 42,268 | 42,269 | 42,270 | 42,271 | 42,272 | 42,273 | 42,274 | 42,275 |
| 2-267 | 42,289 | 42,290 | 42,291 | 42,292 | 42,293 | 42,294 | 42,295 | 42,296 | 42,297 | 42,298 | 42,299 | 42,300 |
| 2-268 | 42,314 | 42,315 | 42,316 | 42,317 | 42,318 | 42,319 | 42,320 | 42,321 | 42,322 | 42,323 | 42,324 | 42,325 |
| 2-269 | 42,339 | 42,340 | 42,341 | 42,342 | 42,343 | 42,344 | 42,345 | 42,346 | 42,347 | 42,348 | 42,349 | 42,350 |
| 2-270 | 42,364 | 42,365 | 42,366 | 42,367 | 42,368 | 42,369 | 42,370 | 42,371 | 42,372 | 42,373 | 42,374 | 42,375 |
| 2-271 | 42,389 | 42,390 | 42,391 | 42,392 | 42,393 | 42,394 | 42,395 | 42,396 | 42,397 | 42,398 | 42,399 | 42,400 |
| 2-272 | 42,414 | 42,415 | 42,416 | 42,417 | 42,418 | 42,419 | 42,420 | 42,421 | 42,422 | 42,423 | 42,424 | 42,425 |
| 2-273 | 42,439 | 42,440 | 42,441 | 42,442 | 42,443 | 42,444 | 42,445 | 42,446 | 42,447 | 42,448 | 42,449 | 42,450 |
| 2-274 | 42,464 | 42,465 | 42,466 | 42,467 | 42,468 | 42,469 | 42,470 | 42,471 | 42,472 | 42,473 | 42,474 | 42,475 |
| 2-275 | 42,489 | 42,490 | 42,491 | 42,492 | 42,493 | 42,494 | 42,495 | 42,496 | 42,497 | 42,498 | 42,499 | 42,500 |

TABLE 33

| | | Compound represented by the formula (1) | | | | | | | | | | | | |
|---|---|---|---|---|---|---|---|---|---|---|---|---|---|---|
| | | 1-76 | 1-77 | 1-78 | 1-79 | 1-80 | 1-81 | 1-82 | 1-83 | 1-84 | 1-85 | 1-86 | 1-87 | 1-88 |
| Compound represented by the formula (2) | 2-276 | 42,501 | 42,502 | 42,503 | 42,504 | 42,505 | 42,506 | 42,507 | 42,508 | 42,509 | 42,510 | 42,511 | 42,512 | 42,513 |
| | 2-277 | 42,526 | 42,527 | 42,528 | 42,529 | 42,530 | 42,531 | 42,532 | 42,533 | 42,534 | 42,535 | 42,536 | 42,537 | 42,538 |
| | 2-278 | 42,551 | 42,552 | 42,553 | 42,554 | 42,555 | 42,556 | 42,557 | 42,558 | 42,559 | 42,560 | 42,561 | 42,562 | 42,563 |
| | 2-279 | 42,576 | 42,577 | 42,578 | 42,579 | 42,580 | 42,581 | 42,582 | 42,583 | 42,584 | 42,585 | 42,586 | 42,587 | 42,588 |
| | 2-280 | 42,601 | 42,602 | 42,603 | 42,604 | 42,605 | 42,606 | 42,607 | 42,608 | 42,609 | 42,610 | 42,611 | 42,612 | 42,613 |
| | 2-281 | 42,626 | 42,627 | 42,628 | 42,629 | 42,630 | 42,631 | 42,632 | 42,633 | 42,634 | 42,635 | 42,636 | 42,637 | 42,638 |
| | 2-282 | 42,651 | 42,652 | 42,653 | 42,654 | 42,655 | 42,656 | 42,657 | 42,658 | 42,659 | 42,660 | 42,661 | 42,662 | 42,663 |
| | 2-283 | 42,676 | 42,677 | 42,678 | 42,679 | 42,680 | 42,681 | 42,682 | 42,683 | 42,684 | 42,685 | 42,686 | 42,687 | 42,688 |
| | 2-284 | 42,701 | 42,702 | 42,703 | 42,704 | 42,705 | 42,706 | 42,707 | 42,708 | 42,709 | 42,710 | 42,711 | 42,712 | 42,713 |
| | 2-285 | 42,726 | 42,727 | 42,728 | 42,729 | 42,730 | 42,731 | 42,732 | 42,733 | 42,734 | 42,735 | 42,736 | 42,737 | 42,738 |
| | 2-286 | 42,751 | 42,752 | 42,753 | 42,754 | 42,755 | 42,756 | 42,757 | 42,758 | 42,759 | 42,760 | 42,761 | 42,762 | 42,763 |
| | 2-287 | 42,776 | 42,777 | 42,778 | 42,779 | 42,780 | 42,781 | 42,782 | 42,783 | 42,784 | 42,785 | 42,786 | 42,787 | 42,788 |
| | 2-288 | 42,801 | 42,802 | 42,803 | 42,804 | 42,805 | 42,806 | 42,807 | 42,808 | 42,809 | 42,810 | 42,811 | 42,812 | 42,813 |
| | 2-289 | 42,826 | 42,827 | 42,828 | 42,829 | 42,830 | 42,831 | 42,832 | 42,833 | 42,834 | 42,835 | 42,836 | 42,837 | 42,838 |
| | 2-290 | 42,851 | 42,852 | 42,853 | 42,854 | 42,855 | 42,856 | 42,857 | 42,858 | 42,859 | 42,860 | 42,861 | 42,862 | 42,863 |
| | 2-291 | 42,876 | 42,877 | 42,878 | 42,879 | 42,880 | 42,881 | 42,882 | 42,883 | 42,884 | 42,885 | 42,886 | 42,887 | 42,888 |
| | 2-292 | 42,901 | 42,902 | 42,903 | 42,904 | 42,905 | 42,906 | 42,907 | 42,908 | 42,909 | 42,910 | 42,911 | 42,912 | 42,913 |
| | 2-293 | 42,926 | 42,927 | 42,928 | 42,929 | 42,930 | 42,931 | 42,932 | 42,933 | 42,934 | 42,935 | 42,936 | 42,937 | 42,938 |
| | 2-294 | 42,951 | 42,952 | 42,953 | 42,954 | 42,955 | 42,956 | 42,957 | 42,958 | 42,959 | 42,960 | 42,961 | 42,962 | 42,963 |
| | 2-295 | 42,976 | 42,977 | 42,978 | 42,979 | 42,980 | 42,981 | 42,982 | 42,983 | 42,984 | 42,985 | 42,986 | 42,987 | 42,988 |
| | 2-296 | 43,001 | 43,002 | 43,003 | 43,004 | 43,005 | 43,006 | 43,007 | 43,008 | 43,009 | 43,010 | 43,011 | 43,012 | 43,013 |
| | 2-297 | 43,026 | 43,027 | 43,028 | 43,029 | 43,030 | 43,031 | 43,032 | 43,033 | 43,034 | 43,035 | 43,036 | 43,037 | 43,038 |
| | 2-298 | 43,051 | 43,052 | 43,053 | 43,054 | 43,055 | 43,056 | 43,057 | 43,058 | 43,059 | 43,060 | 43,061 | 43,062 | 43,063 |
| | 2-299 | 43,076 | 43,077 | 43,078 | 43,079 | 43,080 | 43,081 | 43,082 | 43,083 | 43,084 | 43,085 | 43,086 | 43,087 | 43,088 |
| | 2-300 | 43,101 | 43,102 | 43,103 | 43,104 | 43,105 | 43,106 | 43,107 | 43,108 | 43,109 | 43,110 | 43,111 | 43,112 | 43,113 |
| | 2-301 | 43,126 | 43,127 | 43,128 | 43,129 | 43,130 | 43,131 | 43,132 | 43,133 | 43,134 | 43,135 | 43,136 | 43,137 | 43,138 |
| | 2-302 | 43,151 | 43,152 | 43,153 | 43,154 | 43,155 | 43,156 | 43,157 | 43,158 | 43,159 | 43,160 | 43,161 | 43,162 | 43,163 |
| | 2-303 | 43,176 | 43,177 | 43,178 | 43,179 | 43,180 | 43,181 | 43,182 | 43,183 | 43,184 | 43,185 | 43,186 | 43,187 | 43,188 |
| | 2-304 | 43,201 | 43,202 | 43,203 | 43,204 | 43,205 | 43,206 | 43,207 | 43,208 | 43,209 | 43,210 | 43,211 | 43,212 | 43,213 |
| | 2-305 | 43,226 | 43,227 | 43,228 | 43,229 | 43,230 | 43,231 | 43,232 | 43,233 | 43,234 | 43,235 | 43,236 | 43,237 | 43,238 |
| | 2-306 | 43,251 | 43,252 | 43,253 | 43,254 | 43,255 | 43,256 | 43,257 | 43,258 | 43,259 | 43,260 | 43,261 | 43,262 | 43,263 |

TABLE 33-continued

| | | | | | | | | | | | | | | |
|---|---|---|---|---|---|---|---|---|---|---|---|---|---|---|
| | 2-307 | 43,276 | 43,277 | 43,278 | 43,279 | 43,280 | 43,281 | 43,282 | 43,283 | 43,284 | 43,285 | 43,286 | 43,287 | 43,288 |
| | 2-308 | 43,301 | 43,302 | 43,303 | 43,304 | 43,305 | 43,306 | 43,307 | 43,308 | 43,309 | 43,310 | 43,311 | 43,312 | 43,313 |
| | 2-309 | 43,326 | 43,327 | 43,328 | 43,329 | 43,330 | 43,331 | 43,332 | 43,333 | 43,334 | 43,335 | 43,336 | 43,337 | 43,338 |
| | 2-310 | 43,351 | 43,352 | 43,353 | 43,354 | 43,355 | 43,356 | 43,357 | 43,358 | 43,359 | 43,360 | 43,361 | 43,362 | 43,363 |
| | 2-311 | 43,376 | 43,377 | 43,378 | 43,379 | 43,380 | 43,381 | 43,382 | 43,383 | 43,384 | 43,385 | 43,386 | 43,387 | 43,388 |
| | 2-312 | 43,401 | 43,402 | 43,403 | 43,404 | 43,405 | 43,406 | 43,407 | 43,408 | 43,409 | 43,410 | 43,411 | 43,412 | 43,413 |
| | 2-313 | 43,426 | 43,427 | 43,428 | 43,429 | 43,430 | 43,431 | 43,432 | 43,433 | 43,434 | 43,435 | 43,436 | 43,437 | 43,438 |
| | 2-314 | 43,451 | 43,452 | 43,453 | 43,454 | 43,455 | 43,456 | 43,457 | 43,458 | 43,459 | 43,460 | 43,461 | 43,462 | 43,463 |
| | 2-315 | 43,476 | 43,477 | 43,478 | 43,479 | 43,480 | 43,481 | 43,482 | 43,483 | 43,484 | 43,485 | 43,486 | 43,487 | 43,488 |
| | 2-316 | 43,501 | 43,502 | 43,503 | 43,504 | 43,505 | 43,506 | 43,507 | 43,508 | 43,509 | 43,510 | 43,511 | 43,512 | 43,513 |
| | 2-317 | 43,526 | 43,527 | 43,528 | 43,529 | 43,530 | 43,531 | 43,532 | 43,533 | 43,534 | 43,535 | 43,536 | 43,537 | 43,538 |
| | 2-318 | 43,551 | 43,552 | 43,553 | 43,554 | 43,555 | 43,556 | 43,557 | 43,558 | 43,559 | 43,560 | 43,561 | 43,562 | 43,563 |
| | 2-319 | 43,576 | 43,577 | 43,578 | 43,579 | 43,580 | 43,581 | 43,582 | 43,583 | 43,584 | 43,585 | 43,586 | 43,587 | 43,588 |
| | 2-320 | 43,601 | 43,602 | 43,603 | 43,604 | 43,605 | 43,606 | 43,607 | 43,608 | 43,609 | 43,610 | 43,611 | 43,612 | 43,613 |
| | 2-321 | 43,626 | 43,627 | 43,628 | 43,629 | 43,630 | 43,631 | 43,632 | 43,633 | 43,634 | 43,635 | 43,636 | 43,637 | 43,638 |
| | 2-322 | 43,651 | 43,652 | 43,653 | 43,654 | 43,655 | 43,656 | 43,657 | 43,658 | 43,659 | 43,660 | 43,661 | 43,662 | 43,663 |
| | 2-323 | 43,676 | 43,677 | 43,678 | 43,679 | 43,680 | 43,681 | 43,682 | 43,683 | 43,684 | 43,685 | 43,686 | 43,687 | 43,688 |
| | 2-324 | 43,701 | 43,702 | 43,703 | 43,704 | 43,705 | 43,706 | 43,707 | 43,708 | 43,709 | 43,710 | 43,711 | 43,712 | 43,713 |
| | 2-325 | 43,726 | 43,727 | 43,728 | 43,729 | 43,730 | 43,731 | 43,732 | 43,733 | 43,734 | 43,735 | 43,736 | 43,737 | 43,738 |
| | 2-326 | 43,751 | 43,752 | 43,753 | 43,754 | 43,755 | 43,756 | 43,757 | 43,758 | 43,759 | 43,760 | 43,761 | 43,762 | 43,763 |
| | 2-327 | 43,776 | 43,777 | 43,778 | 43,779 | 43,780 | 43,781 | 43,782 | 43,783 | 43,784 | 43,785 | 43,786 | 43,787 | 43,788 |
| | 2-328 | 43,801 | 43,802 | 43,803 | 43,804 | 43,805 | 43,806 | 43,807 | 43,808 | 43,809 | 43,810 | 43,811 | 43,812 | 43,813 |
| | 2-329 | 43,826 | 43,827 | 43,828 | 43,829 | 43,830 | 43,831 | 43,832 | 43,833 | 43,834 | 43,835 | 43,836 | 43,837 | 43,838 |
| | 2-330 | 43,851 | 43,852 | 43,853 | 43,854 | 43,855 | 43,856 | 43,857 | 43,858 | 43,859 | 43,860 | 43,861 | 43,862 | 43,863 |

| | | Compound represented by the formula (1) | | | | | | | | | | | |
|---|---|---|---|---|---|---|---|---|---|---|---|---|---|
| | | 1-89 | 1-90 | 1-91 | 1-92 | 1-93 | 1-94 | 1-95 | 1-96 | 1-97 | 1-98 | 1-99 | 1-100 |
| Compound represented by the formula (2) | 2-276 | 42,514 | 42,515 | 42,516 | 42,517 | 42,518 | 42,519 | 42,520 | 42,521 | 42,522 | 42,523 | 42,524 | 42,525 |
| | 2-277 | 42,539 | 42,540 | 42,541 | 42,542 | 42,543 | 42,544 | 42,545 | 42,546 | 42,547 | 42,548 | 42,549 | 42,550 |
| | 2-278 | 42,564 | 42,565 | 42,566 | 42,567 | 42,568 | 42,569 | 42,570 | 42,571 | 42,572 | 42,573 | 42,574 | 42,575 |
| | 2-279 | 42,589 | 42,590 | 42,591 | 42,592 | 42,593 | 42,594 | 42,595 | 42,596 | 42,597 | 42,598 | 42,599 | 42,600 |
| | 2-280 | 42,614 | 42,615 | 42,616 | 42,617 | 42,618 | 42,619 | 42,620 | 42,621 | 42,622 | 42,623 | 42,624 | 42,625 |
| | 2-281 | 42,639 | 42,640 | 42,641 | 42,642 | 42,643 | 42,644 | 42,645 | 42,646 | 42,647 | 42,648 | 42,649 | 42,650 |
| | 2-282 | 42,664 | 42,665 | 42,666 | 42,667 | 42,668 | 42,669 | 42,670 | 42,671 | 42,672 | 42,673 | 42,674 | 42,675 |
| | 2-283 | 42,689 | 42,690 | 42,691 | 42,692 | 42,693 | 42,694 | 42,695 | 42,696 | 42,697 | 42,698 | 42,699 | 42,700 |
| | 2-284 | 42,714 | 42,715 | 42,716 | 42,717 | 42,718 | 42,719 | 42,720 | 42,721 | 42,722 | 42,723 | 42,724 | 42,725 |
| | 2-285 | 42,739 | 42,740 | 42,741 | 42,742 | 42,743 | 42,744 | 42,745 | 42,746 | 42,747 | 42,748 | 42,749 | 42,750 |
| | 2-286 | 42,764 | 42,765 | 42,766 | 42,767 | 42,768 | 42,769 | 42,770 | 42,771 | 42,772 | 42,773 | 42,774 | 42,775 |
| | 2-287 | 42,789 | 42,790 | 42,791 | 42,792 | 42,793 | 42,794 | 42,795 | 42,796 | 42,797 | 42,798 | 42,799 | 42,800 |
| | 2-288 | 42,814 | 42,815 | 42,816 | 42,817 | 42,818 | 42,819 | 42,820 | 42,821 | 42,822 | 42,823 | 42,824 | 42,825 |
| | 2-289 | 42,839 | 42,840 | 42,841 | 42,842 | 42,843 | 42,844 | 42,845 | 42,846 | 42,847 | 42,848 | 42,849 | 42,850 |
| | 2-290 | 42,864 | 42,865 | 42,866 | 42,867 | 42,868 | 42,869 | 42,870 | 42,871 | 42,872 | 42,873 | 42,874 | 42,875 |
| | 2-291 | 42,889 | 42,890 | 42,891 | 42,892 | 42,893 | 42,894 | 42,895 | 42,896 | 42,897 | 42,898 | 42,899 | 42,900 |
| | 2-292 | 42,914 | 42,915 | 42,916 | 42,917 | 42,918 | 42,919 | 42,920 | 42,921 | 42,922 | 42,923 | 42,924 | 42,925 |
| | 2-293 | 42,939 | 42,940 | 42,941 | 42,942 | 42,943 | 42,944 | 42,945 | 42,946 | 42,947 | 42,948 | 42,949 | 42,950 |
| | 2-294 | 42,964 | 42,965 | 42,966 | 42,967 | 42,968 | 42,969 | 42,970 | 42,971 | 42,972 | 42,973 | 42,974 | 42,975 |
| | 2-295 | 42,989 | 42,990 | 42,991 | 42,992 | 42,993 | 42,994 | 42,995 | 42,996 | 42,997 | 42,998 | 42,999 | 43,000 |
| | 2-296 | 43,014 | 43,015 | 43,016 | 43,017 | 43,018 | 43,019 | 43,020 | 43,021 | 43,022 | 43,023 | 43,024 | 43,025 |
| | 2-297 | 43,039 | 43,040 | 43,041 | 43,042 | 43,043 | 43,044 | 43,045 | 43,046 | 43,047 | 43,048 | 43,049 | 43,050 |
| | 2-298 | 43,064 | 43,065 | 43,066 | 43,067 | 43,068 | 43,069 | 43,070 | 43,071 | 43,072 | 43,073 | 43,074 | 43,075 |
| | 2-299 | 43,089 | 43,090 | 43,091 | 43,092 | 43,093 | 43,094 | 43,095 | 43,096 | 43,097 | 43,098 | 43,099 | 43,100 |
| | 2-300 | 43,114 | 43,115 | 43,116 | 43,117 | 43,118 | 43,119 | 43,120 | 43,121 | 43,122 | 43,123 | 43,124 | 43,125 |
| | 2-301 | 43,139 | 43,140 | 43,141 | 43,142 | 43,143 | 43,144 | 43,145 | 43,146 | 43,147 | 43,148 | 43,149 | 43,150 |
| | 2-302 | 43,164 | 43,165 | 43,166 | 43,167 | 43,168 | 43,169 | 43,170 | 43,171 | 43,172 | 43,173 | 43,174 | 43,175 |
| | 2-303 | 43,189 | 43,190 | 43,191 | 43,192 | 43,193 | 43,194 | 43,195 | 43,196 | 43,197 | 43,198 | 43,199 | 43,200 |
| | 2-304 | 43,214 | 43,215 | 43,216 | 43,217 | 43,218 | 43,219 | 43,220 | 43,221 | 43,222 | 43,223 | 43,224 | 43,225 |
| | 2-305 | 43,239 | 43,240 | 43,241 | 43,242 | 43,243 | 43,244 | 43,245 | 43,246 | 43,247 | 43,248 | 43,249 | 43,250 |
| | 2-306 | 43,264 | 43,265 | 43,266 | 43,267 | 43,268 | 43,269 | 43,270 | 43,271 | 43,272 | 43,273 | 43,274 | 43,275 |
| | 2-307 | 43,289 | 43,290 | 43,291 | 43,292 | 43,293 | 43,294 | 43,295 | 43,296 | 43,297 | 43,298 | 43,299 | 43,300 |
| | 2-308 | 43,314 | 43,315 | 43,316 | 43,317 | 43,318 | 43,319 | 43,320 | 43,321 | 43,322 | 43,323 | 43,324 | 43,325 |
| | 2-309 | 43,339 | 43,340 | 43,341 | 43,342 | 43,343 | 43,344 | 43,345 | 43,346 | 43,347 | 43,348 | 43,349 | 43,350 |
| | 2-310 | 43,364 | 43,365 | 43,366 | 43,367 | 43,368 | 43,369 | 43,370 | 43,371 | 43,372 | 43,373 | 43,374 | 43,375 |
| | 2-311 | 43,389 | 43,390 | 43,391 | 43,392 | 43,393 | 43,394 | 43,395 | 43,396 | 43,397 | 43,398 | 43,399 | 43,400 |
| | 2-312 | 43,414 | 43,415 | 43,416 | 43,417 | 43,418 | 43,419 | 43,420 | 43,421 | 43,422 | 43,423 | 43,424 | 43,425 |
| | 2-313 | 43,439 | 43,440 | 43,441 | 43,442 | 43,443 | 43,444 | 43,445 | 43,446 | 43,447 | 43,448 | 43,449 | 43,450 |
| | 2-314 | 43,464 | 43,465 | 43,466 | 43,467 | 43,468 | 43,469 | 43,470 | 43,471 | 43,472 | 43,473 | 43,474 | 43,475 |
| | 2-315 | 43,489 | 43,490 | 43,491 | 43,492 | 43,493 | 43,494 | 43,495 | 43,496 | 43,497 | 43,498 | 43,499 | 43,500 |
| | 2-316 | 43,514 | 43,515 | 43,516 | 43,517 | 43,518 | 43,519 | 43,520 | 43,521 | 43,522 | 43,523 | 43,524 | 43,525 |
| | 2-317 | 43,539 | 43,540 | 43,541 | 43,542 | 43,543 | 43,544 | 43,545 | 43,546 | 43,547 | 43,548 | 43,549 | 43,550 |
| | 2-318 | 43,564 | 43,565 | 43,566 | 43,567 | 43,568 | 43,569 | 43,570 | 43,571 | 43,572 | 43,573 | 43,574 | 43,575 |
| | 2-319 | 43,589 | 43,590 | 43,591 | 43,592 | 43,593 | 43,594 | 43,595 | 43,596 | 43,597 | 43,598 | 43,599 | 43,600 |
| | 2-320 | 43,614 | 43,615 | 43,616 | 43,617 | 43,618 | 43,619 | 43,620 | 43,621 | 43,622 | 43,623 | 43,624 | 43,625 |
| | 2-321 | 43,639 | 43,640 | 43,641 | 43,642 | 43,643 | 43,644 | 43,645 | 43,646 | 43,647 | 43,648 | 43,649 | 43,650 |
| | 2-322 | 43,664 | 43,665 | 43,666 | 43,667 | 43,668 | 43,669 | 43,670 | 43,671 | 43,672 | 43,673 | 43,674 | 43,675 |
| | 2-323 | 43,689 | 43,690 | 43,691 | 43,692 | 43,693 | 43,694 | 43,695 | 43,696 | 43,697 | 43,698 | 43,699 | 43,700 |
| | 2-324 | 43,714 | 43,715 | 43,716 | 43,717 | 43,718 | 43,719 | 43,720 | 43,721 | 43,722 | 43,723 | 43,724 | 43,725 |
| | 2-325 | 43,739 | 43,740 | 43,741 | 43,742 | 43,743 | 43,744 | 43,745 | 43,746 | 43,747 | 43,748 | 43,749 | 43,750 |
| | 2-326 | 43,764 | 43,765 | 43,766 | 43,767 | 43,768 | 43,769 | 43,770 | 43,771 | 43,772 | 43,773 | 43,774 | 43,775 |

TABLE 33-continued

| | | | | | | | | | | | | | |
|---|---|---|---|---|---|---|---|---|---|---|---|---|---|
| | 2-327 | 43,789 | 43,790 | 43,791 | 43,792 | 43,793 | 43,794 | 43,795 | 43,796 | 43,797 | 43,798 | 43,799 | 43,800 |
| | 2-328 | 43,814 | 43,815 | 43,816 | 43,817 | 43,818 | 43,819 | 43,820 | 43,821 | 43,822 | 43,823 | 43,824 | 43,825 |
| | 2-329 | 43,839 | 43,840 | 43,841 | 43,842 | 43,843 | 43,844 | 43,845 | 43,846 | 43,847 | 43,848 | 43,849 | 43,850 |
| | 2-330 | 43,864 | 43,865 | 43,866 | 43,867 | 43,868 | 43,869 | 43,870 | 43,871 | 43,872 | 43,873 | 43,874 | 43,875 |

TABLE 34

| | | Compound represented by the formula (1) | | | | | | | | | | | | |
|---|---|---|---|---|---|---|---|---|---|---|---|---|---|---|
| | | 1-76 | 1-77 | 1-78 | 1-79 | 1-80 | 1-81 | 1-82 | 1-83 | 1-84 | 1-85 | 1-86 | 1-87 | 1-88 |
| Compound represented by the formula (2) | 2-331 | 43,876 | 43,877 | 43,878 | 43,879 | 43,880 | 43,881 | 43,882 | 43,883 | 43,884 | 43,885 | 43,886 | 43,887 | 43,888 |
| | 2-332 | 43,901 | 43,902 | 43,903 | 43,904 | 43,905 | 43,906 | 43,907 | 43,908 | 43,909 | 43,910 | 43,911 | 43,912 | 43,913 |
| | 2-333 | 43,926 | 43,927 | 43,928 | 43,929 | 43,930 | 43,931 | 43,932 | 43,933 | 43,934 | 43,935 | 43,936 | 43,937 | 43,938 |
| | 2-334 | 43,951 | 43,952 | 43,953 | 43,954 | 43,955 | 43,956 | 43,957 | 43,958 | 43,959 | 43,960 | 43,961 | 43,962 | 43,963 |
| | 2-335 | 43,976 | 43,977 | 43,978 | 43,979 | 43,980 | 43,981 | 43,982 | 43,983 | 43,984 | 43,985 | 43,986 | 43,987 | 43,988 |
| | 2-336 | 44,001 | 44,002 | 44,003 | 44,004 | 44,005 | 44,006 | 44,007 | 44,008 | 44,009 | 44,010 | 44,011 | 44,012 | 44,013 |
| | 2-337 | 44,026 | 44,027 | 44,028 | 44,029 | 44,030 | 44,031 | 44,032 | 44,033 | 44,034 | 44,035 | 44,036 | 44,037 | 44,038 |
| | 2-338 | 44,051 | 44,052 | 44,053 | 44,054 | 44,055 | 44,056 | 44,057 | 44,058 | 44,059 | 44,060 | 44,061 | 44,062 | 44,063 |
| | 2-339 | 44,076 | 44,077 | 44,078 | 44,079 | 44,080 | 44,081 | 44,082 | 44,083 | 44,084 | 44,085 | 44,086 | 44,087 | 44,088 |
| | 2-340 | 44,101 | 44,102 | 44,103 | 44,104 | 44,105 | 44,106 | 44,107 | 44,108 | 44,109 | 44,110 | 44,111 | 44,112 | 44,113 |
| | 2-341 | 44,126 | 44,127 | 44,128 | 44,129 | 44,130 | 44,131 | 44,132 | 44,133 | 44,134 | 44,135 | 44,136 | 44,137 | 44,138 |
| | 2-342 | 44,151 | 44,152 | 44,153 | 44,154 | 44,155 | 44,156 | 44,157 | 44,158 | 44,159 | 44,160 | 44,161 | 44,162 | 44,163 |
| | 2-343 | 44,176 | 44,177 | 44,178 | 44,179 | 44,180 | 44,181 | 44,182 | 44,183 | 44,184 | 44,185 | 44,186 | 44,187 | 44,188 |
| | 2-344 | 44,201 | 44,202 | 44,203 | 44,204 | 44,205 | 44,206 | 44,207 | 44,208 | 44,209 | 44,210 | 44,211 | 44,212 | 44,213 |
| | 2-345 | 44,226 | 44,227 | 44,228 | 44,229 | 44,230 | 44,231 | 44,232 | 44,233 | 44,234 | 44,235 | 44,236 | 44,237 | 44,238 |
| | 2-346 | 44,251 | 44,252 | 44,253 | 44,254 | 44,255 | 44,256 | 44,257 | 44,258 | 44,259 | 44,260 | 44,261 | 44,262 | 44,263 |
| | 2-347 | 44,276 | 44,277 | 44,278 | 44,279 | 44,280 | 44,281 | 44,282 | 44,283 | 44,284 | 44,285 | 44,286 | 44,287 | 44,288 |
| | 2-348 | 44,301 | 44,302 | 44,303 | 44,304 | 44,305 | 44,306 | 44,307 | 44,308 | 44,309 | 44,310 | 44,311 | 44,312 | 44,313 |
| | 2-349 | 44,326 | 44,327 | 44,328 | 44,329 | 44,330 | 44,331 | 44,332 | 44,333 | 44,334 | 44,335 | 44,336 | 44,337 | 44,338 |
| | 2-340 | 44,351 | 44,352 | 44,353 | 44,354 | 44,355 | 44,356 | 44,357 | 44,358 | 44,359 | 44,360 | 44,361 | 44,362 | 44,363 |
| | 2-351 | 44,376 | 44,377 | 44,378 | 44,379 | 44,380 | 44,381 | 44,382 | 44,383 | 44,384 | 44,385 | 44,386 | 44,387 | 44,388 |
| | 2-352 | 44,401 | 44,402 | 44,403 | 44,404 | 44,405 | 44,406 | 44,407 | 44,408 | 44,409 | 44,410 | 44,411 | 44,412 | 44,413 |
| | 2-353 | 44,426 | 44,427 | 44,428 | 44,429 | 44,430 | 44,431 | 44,432 | 44,433 | 44,434 | 44,435 | 44,436 | 44,437 | 44,438 |
| | 2-354 | 44,451 | 44,452 | 44,453 | 44,454 | 44,455 | 44,456 | 44,457 | 44,458 | 44,459 | 44,460 | 44,461 | 44,462 | 44,463 |
| | 2-355 | 44,476 | 44,477 | 44,478 | 44,479 | 44,480 | 44,481 | 44,482 | 44,483 | 44,484 | 44,485 | 44,486 | 44,487 | 44,488 |
| | 2-356 | 44,501 | 44,502 | 44,503 | 44,504 | 44,505 | 44,506 | 44,507 | 44,508 | 44,509 | 44,510 | 44,511 | 44,512 | 44,513 |
| | 2-357 | 44,526 | 44,527 | 44,528 | 44,529 | 44,530 | 44,531 | 44,532 | 44,533 | 44,534 | 44,535 | 44,536 | 44,537 | 44,538 |
| | 2-358 | 44,551 | 44,552 | 44,553 | 44,554 | 44,555 | 44,556 | 44,557 | 44,558 | 44,559 | 44,560 | 44,561 | 44,562 | 44,563 |
| | 2-359 | 44,576 | 44,577 | 44,578 | 44,579 | 44,580 | 44,581 | 44,582 | 44,583 | 44,584 | 44,585 | 44,586 | 44,587 | 44,588 |
| | 2-360 | 44,601 | 44,602 | 44,603 | 44,604 | 44,605 | 44,606 | 44,607 | 44,608 | 44,609 | 44,610 | 44,611 | 44,612 | 44,613 |
| | 2-361 | 44,626 | 44,627 | 44,628 | 44,629 | 44,630 | 44,631 | 44,632 | 44,633 | 44,634 | 44,635 | 44,636 | 44,637 | 44,638 |
| | 2-362 | 44,651 | 44,652 | 44,653 | 44,654 | 44,655 | 44,656 | 44,657 | 44,658 | 44,659 | 44,660 | 44,661 | 44,662 | 44,663 |
| | 2-363 | 44,676 | 44,677 | 44,678 | 44,679 | 44,680 | 44,681 | 44,682 | 44,683 | 44,684 | 44,685 | 44,686 | 44,687 | 44,688 |
| | 2-364 | 44,701 | 44,702 | 44,703 | 44,704 | 44,705 | 44,706 | 44,707 | 44,708 | 44,709 | 44,710 | 44,711 | 44,712 | 44,713 |
| | 2-365 | 44,726 | 44,727 | 44,728 | 44,729 | 44,730 | 44,731 | 44,732 | 44,733 | 44,734 | 44,735 | 44,736 | 44,737 | 44,738 |
| | 2-366 | 44,751 | 44,752 | 44,753 | 44,754 | 44,755 | 44,756 | 44,757 | 44,758 | 44,759 | 44,760 | 44,761 | 44,762 | 44,763 |
| | 2-367 | 44,776 | 44,777 | 44,778 | 44,779 | 44,780 | 44,781 | 44,782 | 44,783 | 44,784 | 44,785 | 44,786 | 44,787 | 44,788 |
| | 2-368 | 44,801 | 44,802 | 44,803 | 44,804 | 44,805 | 44,806 | 44,807 | 44,808 | 44,809 | 44,810 | 44,811 | 44,812 | 44,813 |
| | 2-369 | 44,826 | 44,827 | 44,828 | 44,829 | 44,830 | 44,831 | 44,832 | 44,833 | 44,834 | 44,835 | 44,836 | 44,837 | 44,838 |
| | 2-370 | 44,851 | 44,852 | 44,853 | 44,854 | 44,855 | 44,856 | 44,857 | 44,858 | 44,859 | 44,860 | 44,861 | 44,862 | 44,863 |
| | 2-371 | 44,876 | 44,877 | 44,878 | 44,879 | 44,880 | 44,881 | 44,882 | 44,883 | 44,884 | 44,885 | 44,886 | 44,887 | 44,888 |
| | 2-372 | 44,901 | 44,902 | 44,903 | 44,904 | 44,905 | 44,906 | 44,907 | 44,908 | 44,909 | 44,910 | 44,911 | 44,912 | 44,913 |
| | 2-373 | 44,926 | 44,927 | 44,928 | 44,929 | 44,930 | 44,931 | 44,932 | 44,933 | 44,934 | 44,935 | 44,936 | 44,937 | 44,938 |
| | 2-374 | 44,951 | 44,952 | 44,953 | 44,954 | 44,955 | 44,956 | 44,957 | 44,958 | 44,959 | 44,960 | 44,961 | 44,962 | 44,963 |
| | 2-375 | 44,976 | 44,977 | 44,978 | 44,979 | 44,980 | 44,981 | 44,982 | 44,983 | 44,984 | 44,985 | 44,986 | 44,987 | 44,988 |
| | 2-376 | 45,001 | 45,002 | 45,003 | 45,004 | 45,005 | 45,006 | 45,007 | 45,008 | 45,009 | 45,010 | 45,011 | 45,012 | 45,013 |
| | 2-377 | 45,026 | 45,027 | 45,028 | 45,029 | 45,030 | 45,031 | 45,032 | 45,033 | 45,034 | 45,035 | 45,036 | 45,037 | 45,038 |
| | 2-378 | 45,051 | 45,052 | 45,053 | 45,054 | 45,055 | 45,056 | 45,057 | 45,058 | 45,059 | 45,060 | 45,061 | 45,062 | 45,063 |
| | 2-379 | 45,076 | 45,077 | 45,078 | 45,079 | 45,080 | 45,081 | 45,082 | 45,083 | 45,084 | 45,085 | 45,086 | 45,087 | 45,088 |
| | 2-380 | 45,101 | 45,102 | 45,103 | 45,104 | 45,105 | 45,106 | 45,107 | 45,108 | 45,109 | 45,110 | 45,111 | 45,112 | 45,113 |
| | 2-381 | 45,126 | 45,127 | 45,128 | 45,129 | 45,130 | 45,131 | 45,132 | 45,133 | 45,134 | 45,135 | 45,136 | 45,137 | 45,138 |
| | 2-382 | 45,151 | 45,152 | 45,153 | 45,154 | 45,155 | 45,156 | 45,157 | 45,158 | 45,159 | 45,160 | 45,161 | 45,162 | 45,163 |
| | 2-383 | 45,176 | 45,177 | 45,178 | 45,179 | 45,180 | 45,181 | 45,182 | 45,183 | 45,184 | 45,185 | 45,186 | 45,187 | 45,188 |
| | 2-384 | 45,201 | 45,202 | 45,203 | 45,204 | 45,205 | 45,206 | 45,207 | 45,208 | 45,209 | 45,210 | 45,211 | 45,212 | 45,213 |
| | 2-385 | 45,226 | 45,227 | 45,228 | 45,229 | 45,230 | 45,231 | 45,232 | 45,233 | 45,234 | 45,235 | 45,236 | 45,237 | 45,238 |

| | | Compound represented by the formula (1) | | | | | | | | | | | |
|---|---|---|---|---|---|---|---|---|---|---|---|---|---|
| | | 1-89 | 1-90 | 1-91 | 1-92 | 1-93 | 1-94 | 1-95 | 1-96 | 1-97 | 1-98 | 1-99 | 1-100 |
| Compound represented by the formula (2) | 2-331 | 43,889 | 43,890 | 43,891 | 43,892 | 43,893 | 43,894 | 43,895 | 43,896 | 43,897 | 43,898 | 43,899 | 43,900 |
| | 2-332 | 43,914 | 43,915 | 43,916 | 43,917 | 43,918 | 43,919 | 43,920 | 43,921 | 43,922 | 43,923 | 43,924 | 43,925 |
| | 2-333 | 43,939 | 43,940 | 43,941 | 43,942 | 43,943 | 43,944 | 43,945 | 43,946 | 43,947 | 43,948 | 43,949 | 43,950 |
| | 2-334 | 43,964 | 43,965 | 43,966 | 43,967 | 43,968 | 43,969 | 43,970 | 43,971 | 43,972 | 43,973 | 43,974 | 43,975 |
| | 2-335 | 43,989 | 43,990 | 43,991 | 43,992 | 43,993 | 43,994 | 43,995 | 43,996 | 43,997 | 43,998 | 43,999 | 44,000 |
| | 2-336 | 44,014 | 44,015 | 44,016 | 44,017 | 44,018 | 44,019 | 44,020 | 44,021 | 44,022 | 44,023 | 44,024 | 44,025 |

TABLE 34-continued

| | | | | | | | | | | | | |
|---|---|---|---|---|---|---|---|---|---|---|---|---|
| 2-337 | 44,039 | 44,040 | 44,041 | 44,042 | 44,043 | 44,044 | 44,045 | 44,046 | 44,047 | 44,048 | 44,049 | 44,050 |
| 2-338 | 44,064 | 44,065 | 44,066 | 44,067 | 44,068 | 44,069 | 44,070 | 44,071 | 44,072 | 44,073 | 44,074 | 44,075 |
| 2-339 | 44,089 | 44,090 | 44,091 | 44,092 | 44,093 | 44,094 | 44,095 | 44,096 | 44,097 | 44,098 | 44,099 | 44,100 |
| 2-340 | 44,114 | 44,115 | 44,116 | 44,117 | 44,118 | 44,119 | 44,120 | 44,121 | 44,122 | 44,123 | 44,124 | 44,125 |
| 2-341 | 44,139 | 44,140 | 44,141 | 44,142 | 44,143 | 44,144 | 44,145 | 44,146 | 44,147 | 44,148 | 44,149 | 44,150 |
| 2-342 | 44,164 | 44,165 | 44,166 | 44,167 | 44,168 | 44,169 | 44,170 | 44,171 | 44,172 | 44,173 | 44,174 | 44,175 |
| 2-343 | 44,189 | 44,190 | 44,191 | 44,192 | 44,193 | 44,194 | 44,195 | 44,196 | 44,197 | 44,198 | 44,199 | 44,200 |
| 2-344 | 44,214 | 44,215 | 44,216 | 44,217 | 44,218 | 44,219 | 44,220 | 44,221 | 44,222 | 44,223 | 44,224 | 44,225 |
| 2-345 | 44,239 | 44,240 | 44,241 | 44,242 | 44,243 | 44,244 | 44,245 | 44,246 | 44,247 | 44,248 | 44,249 | 44,250 |
| 2-346 | 44,264 | 44,265 | 44,266 | 44,267 | 44,268 | 44,269 | 44,270 | 44,271 | 44,272 | 44,273 | 44,274 | 44,275 |
| 2-347 | 44,289 | 44,290 | 44,291 | 44,292 | 44,293 | 44,294 | 44,295 | 44,296 | 44,297 | 44,298 | 44,299 | 44,300 |
| 2-348 | 44,314 | 44,315 | 44,316 | 44,317 | 44,318 | 44,319 | 44,320 | 44,321 | 44,322 | 44,323 | 44,324 | 44,325 |
| 2-349 | 44,339 | 44,340 | 44,341 | 44,342 | 44,343 | 44,344 | 44,345 | 44,346 | 44,347 | 44,348 | 44,349 | 44,350 |
| 2-340 | 44,364 | 44,365 | 44,366 | 44,367 | 44,368 | 44,369 | 44,370 | 44,371 | 44,372 | 44,373 | 44,374 | 44,375 |
| 2-351 | 44,389 | 44,390 | 44,391 | 44,392 | 44,393 | 44,394 | 44,395 | 44,396 | 44,397 | 44,398 | 44,399 | 44,400 |
| 2-352 | 44,414 | 44,415 | 44,416 | 44,417 | 44,418 | 44,419 | 44,420 | 44,421 | 44,422 | 44,423 | 44,424 | 44,425 |
| 2-353 | 44,439 | 44,440 | 44,441 | 44,442 | 44,443 | 44,444 | 44,445 | 44,446 | 44,447 | 44,448 | 44,449 | 44,450 |
| 2-354 | 44,464 | 44,465 | 44,466 | 44,467 | 44,468 | 44,469 | 44,470 | 44,471 | 44,472 | 44,473 | 44,474 | 44,475 |
| 2-355 | 44,489 | 44,490 | 44,491 | 44,492 | 44,493 | 44,494 | 44,495 | 44,496 | 44,497 | 44,498 | 44,499 | 44,500 |
| 2-356 | 44,514 | 44,515 | 44,516 | 44,517 | 44,518 | 44,519 | 44,520 | 44,521 | 44,522 | 44,523 | 44,524 | 44,525 |
| 2-357 | 44,539 | 44,540 | 44,541 | 44,542 | 44,543 | 44,544 | 44,545 | 44,546 | 44,547 | 44,548 | 44,549 | 44,550 |
| 2-358 | 44,564 | 44,565 | 44,566 | 44,567 | 44,568 | 44,569 | 44,570 | 44,571 | 44,572 | 44,573 | 44,574 | 44,575 |
| 2-359 | 44,589 | 44,590 | 44,591 | 44,592 | 44,593 | 44,594 | 44,595 | 44,596 | 44,597 | 44,598 | 44,599 | 44,600 |
| 2-360 | 44,614 | 44,615 | 44,616 | 44,617 | 44,618 | 44,619 | 44,620 | 44,621 | 44,622 | 44,623 | 44,624 | 44,625 |
| 2-361 | 44,639 | 44,640 | 44,641 | 44,642 | 44,643 | 44,644 | 44,645 | 44,646 | 44,647 | 44,648 | 44,649 | 44,650 |
| 2-362 | 44,664 | 44,665 | 44,666 | 44,667 | 44,668 | 44,669 | 44,670 | 44,671 | 44,672 | 44,673 | 44,674 | 44,675 |
| 2-363 | 44,689 | 44,690 | 44,691 | 44,692 | 44,693 | 44,694 | 44,695 | 44,696 | 44,697 | 44,698 | 44,699 | 44,700 |
| 2-364 | 44,714 | 44,715 | 44,716 | 44,717 | 44,718 | 44,719 | 44,720 | 44,721 | 44,722 | 44,723 | 44,724 | 44,725 |
| 2-365 | 44,739 | 44,740 | 44,741 | 44,742 | 44,743 | 44,744 | 44,745 | 44,746 | 44,747 | 44,748 | 44,749 | 44,750 |
| 2-366 | 44,764 | 44,765 | 44,766 | 44,767 | 44,768 | 44,769 | 44,770 | 44,771 | 44,772 | 44,773 | 44,774 | 44,775 |
| 2-367 | 44,789 | 44,790 | 44,791 | 44,792 | 44,793 | 44,794 | 44,795 | 44,796 | 44,797 | 44,798 | 44,799 | 44,800 |
| 2-368 | 44,814 | 44,815 | 44,816 | 44,817 | 44,818 | 44,819 | 44,820 | 44,821 | 44,822 | 44,823 | 44,824 | 44,825 |
| 2-369 | 44,839 | 44,840 | 44,841 | 44,842 | 44,843 | 44,844 | 44,845 | 44,846 | 44,847 | 44,848 | 44,849 | 44,850 |
| 2-370 | 44,864 | 44,865 | 44,866 | 44,867 | 44,868 | 44,869 | 44,870 | 44,871 | 44,872 | 44,873 | 44,874 | 44,875 |
| 2-371 | 44,889 | 44,890 | 44,891 | 44,892 | 44,893 | 44,894 | 44,895 | 44,896 | 44,897 | 44,898 | 44,899 | 44,900 |
| 2-372 | 44,914 | 44,915 | 44,916 | 44,917 | 44,918 | 44,919 | 44,920 | 44,921 | 44,922 | 44,923 | 44,924 | 44,925 |
| 2-373 | 44,939 | 44,940 | 44,941 | 44,942 | 44,943 | 44,944 | 44,945 | 44,946 | 44,947 | 44,948 | 44,949 | 44,950 |
| 2-374 | 44,964 | 44,965 | 44,966 | 44,967 | 44,968 | 44,969 | 44,970 | 44,971 | 44,972 | 44,973 | 44,974 | 44,975 |
| 2-375 | 44,989 | 44,990 | 44,991 | 44,992 | 44,993 | 44,994 | 44,995 | 44,996 | 44,997 | 44,998 | 44,999 | 45,000 |
| 2-376 | 45,014 | 45,015 | 45,016 | 45,017 | 45,018 | 45,019 | 45,020 | 45,021 | 45,022 | 45,023 | 45,024 | 45,025 |
| 2-377 | 45,039 | 45,040 | 45,041 | 45,042 | 45,043 | 45,044 | 45,045 | 45,046 | 45,047 | 45,048 | 45,049 | 45,050 |
| 2-378 | 45,064 | 45,065 | 45,066 | 45,067 | 45,068 | 45,069 | 45,070 | 45,071 | 45,072 | 45,073 | 45,074 | 45,075 |
| 2-379 | 45,089 | 45,090 | 45,091 | 45,092 | 45,093 | 45,094 | 45,095 | 45,096 | 45,097 | 45,098 | 45,099 | 45,100 |
| 2-380 | 45,114 | 45,115 | 45,116 | 45,117 | 45,118 | 45,119 | 45,120 | 45,121 | 45,122 | 45,123 | 45,124 | 45,125 |
| 2-381 | 45,139 | 45,140 | 45,141 | 45,142 | 45,143 | 45,144 | 45,145 | 45,146 | 45,147 | 45,148 | 45,149 | 45,150 |
| 2-382 | 45,164 | 45,165 | 45,166 | 45,167 | 45,168 | 45,169 | 45,170 | 45,171 | 45,172 | 45,173 | 45,174 | 45,175 |
| 2-383 | 45,189 | 45,190 | 45,191 | 45,192 | 45,193 | 45,194 | 45,195 | 45,196 | 45,197 | 45,198 | 45,199 | 45,200 |
| 2-384 | 45,214 | 45,215 | 45,216 | 45,217 | 45,218 | 45,219 | 45,220 | 45,221 | 45,222 | 45,223 | 45,224 | 45,225 |
| 2-385 | 45,239 | 45,240 | 45,241 | 45,242 | 45,243 | 45,244 | 45,245 | 45,246 | 45,247 | 45,248 | 45,249 | 45,250 |

TABLE 35

| | | Compound represented by the formula (1) | | | | | | | | | | | | |
|---|---|---|---|---|---|---|---|---|---|---|---|---|---|---|
| | | 1-76 | 1-77 | 1-78 | 1-79 | 1-80 | 1-81 | 1-82 | 1-83 | 1-84 | 1-85 | 1-86 | 1-87 | 1-88 |
| Compound represented by the formula (2) | 2-386 | 45,251 | 45,252 | 45,253 | 45,254 | 45,255 | 45,256 | 45,257 | 45,258 | 45,259 | 45,260 | 45,261 | 45,262 | 45,263 |
| | 2-387 | 45,276 | 45,277 | 45,278 | 45,279 | 45,280 | 45,281 | 45,282 | 45,283 | 45,284 | 45,285 | 45,286 | 45,287 | 45,288 |
| | 2-388 | 45,301 | 45,302 | 45,303 | 45,304 | 45,305 | 45,306 | 45,307 | 45,308 | 45,309 | 45,310 | 45,311 | 45,312 | 45,313 |
| | 2-389 | 45,326 | 45,327 | 45,328 | 45,329 | 45,330 | 45,331 | 45,332 | 45,333 | 45,334 | 45,335 | 45,336 | 45,337 | 45,338 |
| | 2-390 | 45,351 | 45,352 | 45,353 | 45,354 | 45,355 | 45,356 | 45,357 | 45,358 | 45,359 | 45,360 | 45,361 | 45,362 | 45,363 |
| | 2-391 | 45,376 | 45,377 | 45,378 | 45,379 | 45,380 | 45,381 | 45,382 | 45,383 | 45,384 | 45,385 | 45,386 | 45,387 | 45,388 |
| | 2-392 | 45,401 | 45,402 | 45,403 | 45,404 | 45,405 | 45,406 | 45,407 | 45,408 | 45,409 | 45,410 | 45,411 | 45,412 | 45,413 |
| | 2-393 | 45,426 | 45,427 | 45,428 | 45,429 | 45,430 | 45,431 | 45,432 | 45,433 | 45,434 | 45,435 | 45,436 | 45,437 | 45,438 |
| | 2-394 | 45,451 | 45,452 | 45,453 | 45,454 | 45,455 | 45,456 | 45,457 | 45,458 | 45,459 | 45,460 | 45,461 | 45,462 | 45,463 |
| | 2-395 | 45,476 | 45,477 | 45,478 | 45,479 | 45,480 | 45,481 | 45,482 | 45,483 | 45,484 | 45,485 | 45,486 | 45,487 | 45,488 |
| | 2-396 | 45,501 | 45,502 | 45,503 | 45,504 | 45,505 | 45,506 | 45,507 | 45,508 | 45,509 | 45,510 | 45,511 | 45,512 | 45,513 |
| | 2-397 | 45,526 | 45,527 | 45,528 | 45,529 | 45,530 | 45,531 | 45,532 | 45,533 | 45,534 | 45,535 | 45,536 | 45,537 | 45,538 |
| | 2-398 | 45,551 | 45,552 | 45,553 | 45,554 | 45,555 | 45,556 | 45,557 | 45,558 | 45,559 | 45,560 | 45,561 | 45,562 | 45,563 |
| | 2-399 | 45,576 | 45,577 | 45,578 | 45,579 | 45,580 | 45,581 | 45,582 | 45,583 | 45,584 | 45,585 | 45,586 | 45,587 | 45,588 |
| | 2-400 | 45,601 | 45,602 | 45,603 | 45,604 | 45,605 | 45,606 | 45,607 | 45,608 | 45,609 | 45,610 | 45,611 | 45,612 | 45,613 |
| | 2-401 | 45,626 | 45,627 | 45,628 | 45,629 | 45,630 | 45,631 | 45,632 | 45,633 | 45,634 | 45,635 | 45,636 | 45,637 | 45,638 |
| | 2-402 | 45,651 | 45,652 | 45,653 | 45,654 | 45,655 | 45,656 | 45,657 | 45,658 | 45,659 | 45,660 | 45,661 | 45,662 | 45,663 |
| | 2-403 | 45,676 | 45,677 | 45,678 | 45,679 | 45,680 | 45,681 | 45,682 | 45,683 | 45,684 | 45,685 | 45,686 | 45,687 | 45,688 |
| | 2-404 | 45,701 | 45,702 | 45,703 | 45,704 | 45,705 | 45,706 | 45,707 | 45,708 | 45,709 | 45,710 | 45,711 | 45,712 | 45,713 |
| | 2-405 | 45,726 | 45,727 | 45,728 | 45,729 | 45,730 | 45,731 | 45,732 | 45,733 | 45,734 | 45,735 | 45,736 | 45,737 | 45,738 |
| | 2-406 | 45,751 | 45,752 | 45,753 | 45,754 | 45,755 | 45,756 | 45,757 | 45,758 | 45,759 | 45,760 | 45,761 | 45,762 | 45,763 |

TABLE 35-continued

| | | | | | | | | | | | | | |
|---|---|---|---|---|---|---|---|---|---|---|---|---|---|
| 2-407 | 45,776 | 45,777 | 45,778 | 45,779 | 45,780 | 45,781 | 45,782 | 45,783 | 45,784 | 45,785 | 45,786 | 45,787 | 45,788 |
| 2-408 | 45,801 | 45,802 | 45,803 | 45,804 | 45,805 | 45,806 | 45,807 | 45,808 | 45,809 | 45,810 | 45,811 | 45,812 | 45,813 |
| 2-409 | 45,826 | 45,827 | 45,828 | 45,829 | 45,830 | 45,831 | 45,832 | 45,833 | 45,834 | 45,835 | 45,836 | 45,837 | 45,838 |
| 2-410 | 45,851 | 45,852 | 45,853 | 45,854 | 45,855 | 45,856 | 45,857 | 45,858 | 45,859 | 45,860 | 45,861 | 45,862 | 45,863 |
| 2-411 | 45,876 | 45,877 | 45,878 | 45,879 | 45,880 | 45,881 | 45,882 | 45,883 | 45,884 | 45,885 | 45,886 | 45,887 | 45,888 |
| 2-412 | 45,901 | 45,902 | 45,903 | 45,904 | 45,905 | 45,906 | 45,907 | 45,908 | 45,909 | 45,910 | 45,911 | 45,912 | 45,913 |
| 2-413 | 45,926 | 45,927 | 45,928 | 45,929 | 45,930 | 45,931 | 45,932 | 45,933 | 45,934 | 45,935 | 45,936 | 45,937 | 45,938 |
| 2-414 | 45,951 | 45,952 | 45,953 | 45,954 | 45,955 | 45,956 | 45,957 | 45,958 | 45,959 | 45,960 | 45,961 | 45,962 | 45,963 |
| 2-415 | 45,976 | 45,977 | 45,978 | 45,979 | 45,980 | 45,981 | 45,982 | 45,983 | 45,984 | 45,985 | 45,986 | 45,987 | 45,988 |
| 2-416 | 46,001 | 46,002 | 46,003 | 46,004 | 46,005 | 46,006 | 46,007 | 46,008 | 46,009 | 46,010 | 46,011 | 46,012 | 46,013 |
| 2-417 | 46,026 | 46,027 | 46,028 | 46,029 | 46,030 | 46,031 | 46,032 | 46,033 | 46,034 | 46,035 | 46,036 | 46,037 | 46,038 |
| 2-418 | 46,051 | 46,052 | 46,053 | 46,054 | 46,055 | 46,056 | 46,057 | 46,058 | 46,059 | 46,060 | 46,061 | 46,062 | 46,063 |
| 2-419 | 46,076 | 46,077 | 46,078 | 46,079 | 46,080 | 46,081 | 46,082 | 46,083 | 46,084 | 46,085 | 46,086 | 46,087 | 46,088 |
| 2-420 | 46,101 | 46,102 | 46,103 | 46,104 | 46,105 | 46,106 | 46,107 | 46,108 | 46,109 | 46,110 | 46,111 | 46,112 | 46,113 |
| 2-421 | 46,126 | 46,127 | 46,128 | 46,129 | 46,130 | 46,131 | 46,132 | 46,133 | 46,134 | 46,135 | 46,136 | 46,137 | 46,138 |
| 2-422 | 46,151 | 46,152 | 46,153 | 46,154 | 46,155 | 46,156 | 46,157 | 46,158 | 46,159 | 46,160 | 46,161 | 46,162 | 46,163 |
| 2-423 | 46,176 | 46,177 | 46,178 | 46,179 | 46,180 | 46,181 | 46,182 | 46,183 | 46,184 | 46,185 | 46,186 | 46,187 | 46,188 |
| 2-424 | 46,201 | 46,202 | 46,203 | 46,204 | 46,205 | 46,206 | 46,207 | 46,208 | 46,209 | 46,210 | 46,211 | 46,212 | 46,213 |
| 2-425 | 46,226 | 46,227 | 46,228 | 46,229 | 46,230 | 46,231 | 46,232 | 46,233 | 46,234 | 46,235 | 46,236 | 46,237 | 46,238 |
| 2-426 | 46,251 | 46,252 | 46,253 | 46,254 | 46,255 | 46,256 | 46,257 | 46,258 | 46,259 | 46,260 | 46,261 | 46,262 | 46,263 |
| 2-427 | 46,276 | 46,277 | 46,278 | 46,279 | 46,280 | 46,281 | 46,282 | 46,283 | 46,284 | 46,285 | 46,286 | 46,287 | 46,288 |
| 2-428 | 46,301 | 46,302 | 46,303 | 46,304 | 46,305 | 46,306 | 46,307 | 46,308 | 46,309 | 46,310 | 46,311 | 46,312 | 46,313 |
| 2-429 | 46,326 | 46,327 | 46,328 | 46,329 | 46,330 | 46,331 | 46,332 | 46,333 | 46,334 | 46,335 | 46,336 | 46,337 | 46,338 |
| 2-430 | 46,351 | 46,352 | 46,353 | 46,354 | 46,355 | 46,356 | 46,357 | 46,358 | 46,359 | 46,360 | 46,361 | 46,362 | 46,363 |
| 2-431 | 46,376 | 46,377 | 46,378 | 46,379 | 46,380 | 46,381 | 46,382 | 46,383 | 46,384 | 46,385 | 46,386 | 46,387 | 46,388 |
| 2-432 | 46,401 | 46,402 | 46,403 | 46,404 | 46,405 | 46,406 | 46,407 | 46,408 | 46,409 | 46,410 | 46,411 | 46,412 | 46,413 |
| 2-433 | 46,426 | 46,427 | 46,428 | 46,429 | 46,430 | 46,431 | 46,432 | 46,433 | 46,434 | 46,435 | 46,436 | 46,437 | 46,438 |
| 2-434 | 46,451 | 46,452 | 46,453 | 46,454 | 46,455 | 46,456 | 46,457 | 46,458 | 46,459 | 46,460 | 46,461 | 46,462 | 46,463 |
| 2-435 | 46,476 | 46,477 | 46,478 | 46,479 | 46,480 | 46,481 | 46,482 | 46,483 | 46,484 | 46,485 | 46,486 | 46,487 | 46,488 |
| 2-436 | 46,501 | 46,502 | 46,503 | 46,504 | 46,505 | 46,506 | 46,507 | 46,508 | 46,509 | 46,510 | 46,511 | 46,512 | 46,513 |
| 2-437 | 46,526 | 46,527 | 46,528 | 46,529 | 46,530 | 46,531 | 46,532 | 46,533 | 46,534 | 46,535 | 46,536 | 46,537 | 46,538 |
| 2-438 | 46,551 | 46,552 | 46,553 | 46,554 | 46,555 | 46,556 | 46,557 | 46,558 | 46,559 | 46,560 | 46,561 | 46,562 | 46,563 |
| 2-439 | 46,576 | 46,577 | 46,578 | 46,579 | 46,580 | 46,581 | 46,582 | 46,583 | 46,584 | 46,585 | 46,586 | 46,587 | 46,588 |
| 2-440 | 46,601 | 46,602 | 46,603 | 46,604 | 46,605 | 46,606 | 46,607 | 46,608 | 46,609 | 46,610 | 46,611 | 46,612 | 46,613 |

| | | Compound represented by the formula (1) | | | | | | | | | | | |
|---|---|---|---|---|---|---|---|---|---|---|---|---|---|
| | | 1-89 | 1-90 | 1-91 | 1-92 | 1-93 | 1-94 | 1-95 | 1-96 | 1-97 | 1-98 | 1-99 | 1-100 |
| Compound represented by the formula (2) | 2-386 | 45,264 | 45,265 | 45,266 | 45,267 | 45,268 | 45,269 | 45,270 | 45,271 | 45,272 | 45,273 | 45,274 | 45,275 |
| | 2-387 | 45,289 | 45,290 | 45,291 | 45,292 | 45,293 | 45,294 | 45,295 | 45,296 | 45,297 | 45,298 | 45,299 | 45,300 |
| | 2-388 | 45,314 | 45,315 | 45,316 | 45,317 | 45,318 | 45,319 | 45,320 | 45,321 | 45,322 | 45,323 | 45,324 | 45,325 |
| | 2-389 | 45,339 | 45,340 | 45,341 | 45,342 | 45,343 | 45,344 | 45,345 | 45,346 | 45,347 | 45,348 | 45,349 | 45,350 |
| | 2-390 | 45,364 | 45,365 | 45,366 | 45,367 | 45,368 | 45,369 | 45,370 | 45,371 | 45,372 | 45,373 | 45,374 | 45,375 |
| | 2-391 | 45,389 | 45,390 | 45,391 | 45,392 | 45,393 | 45,394 | 45,395 | 45,396 | 45,397 | 45,398 | 45,399 | 45,400 |
| | 2-392 | 45,414 | 45,415 | 45,416 | 45,417 | 45,418 | 45,419 | 45,420 | 45,421 | 45,422 | 45,423 | 45,424 | 45,425 |
| | 2-393 | 45,439 | 45,440 | 45,441 | 45,442 | 45,443 | 45,444 | 45,445 | 45,446 | 45,447 | 45,448 | 45,449 | 45,450 |
| | 2-394 | 45,464 | 45,465 | 45,466 | 45,467 | 45,468 | 45,469 | 45,470 | 45,471 | 45,472 | 45,473 | 45,474 | 45,475 |
| | 2-395 | 45,489 | 45,490 | 45,491 | 45,492 | 45,493 | 45,494 | 45,495 | 45,496 | 45,497 | 45,498 | 45,499 | 45,500 |
| | 2-396 | 45,514 | 45,515 | 45,516 | 45,517 | 45,518 | 45,519 | 45,520 | 45,521 | 45,522 | 45,523 | 45,524 | 45,525 |
| | 2-397 | 45,539 | 45,540 | 45,541 | 45,542 | 45,543 | 45,544 | 45,545 | 45,546 | 45,547 | 45,548 | 45,549 | 45,550 |
| | 2-398 | 45,564 | 45,565 | 45,566 | 45,567 | 45,568 | 45,569 | 45,570 | 45,571 | 45,572 | 45,573 | 45,574 | 45,575 |
| | 2-399 | 45,589 | 45,590 | 45,591 | 45,592 | 45,593 | 45,594 | 45,595 | 45,596 | 45,597 | 45,598 | 45,599 | 45,600 |
| | 2-400 | 45,614 | 45,615 | 45,616 | 45,617 | 45,618 | 45,619 | 45,620 | 45,621 | 45,622 | 45,623 | 45,624 | 45,625 |
| | 2-401 | 45,639 | 45,640 | 45,641 | 45,642 | 45,643 | 45,644 | 45,645 | 45,646 | 45,647 | 45,648 | 45,649 | 45,650 |
| | 2-402 | 45,664 | 45,665 | 45,666 | 45,667 | 45,668 | 45,669 | 45,670 | 45,671 | 45,672 | 45,673 | 45,674 | 45,675 |
| | 2-403 | 45,689 | 45,690 | 45,691 | 45,692 | 45,693 | 45,694 | 45,695 | 45,696 | 45,697 | 45,698 | 45,699 | 45,700 |
| | 2-404 | 45,714 | 45,715 | 45,716 | 45,717 | 45,718 | 45,719 | 45,720 | 45,721 | 45,722 | 45,723 | 45,724 | 45,725 |
| | 2-405 | 45,739 | 45,740 | 45,741 | 45,742 | 45,743 | 45,744 | 45,745 | 45,746 | 45,747 | 45,748 | 45,749 | 45,750 |
| | 2-406 | 45,764 | 45,765 | 45,766 | 45,767 | 45,768 | 45,769 | 45,770 | 45,771 | 45,772 | 45,773 | 45,774 | 45,775 |
| | 2-407 | 45,789 | 45,790 | 45,791 | 45,792 | 45,793 | 45,794 | 45,795 | 45,796 | 45,797 | 45,798 | 45,799 | 45,800 |
| | 2-408 | 45,814 | 45,815 | 45,816 | 45,817 | 45,818 | 45,819 | 45,820 | 45,821 | 45,822 | 45,823 | 45,824 | 45,825 |
| | 2-409 | 45,839 | 45,840 | 45,841 | 45,842 | 45,843 | 45,844 | 45,845 | 45,846 | 45,847 | 45,848 | 45,849 | 45,850 |
| | 2-410 | 45,864 | 45,865 | 45,866 | 45,867 | 45,868 | 45,869 | 45,870 | 45,871 | 45,872 | 45,873 | 45,874 | 45,875 |
| | 2-411 | 45,889 | 45,890 | 45,891 | 45,892 | 45,893 | 45,894 | 45,895 | 45,896 | 45,897 | 45,898 | 45,899 | 45,900 |
| | 2-412 | 45,914 | 45,915 | 45,916 | 45,917 | 45,918 | 45,919 | 45,920 | 45,921 | 45,922 | 45,923 | 45,924 | 45,925 |
| | 2-413 | 45,939 | 45,940 | 45,941 | 45,942 | 45,943 | 45,944 | 45,945 | 45,946 | 45,947 | 45,948 | 45,949 | 45,950 |
| | 2-414 | 45,964 | 45,965 | 45,966 | 45,967 | 45,968 | 45,969 | 45,970 | 45,971 | 45,972 | 45,973 | 45,974 | 45,975 |
| | 2-415 | 45,989 | 45,990 | 45,991 | 45,992 | 45,993 | 45,994 | 45,995 | 45,996 | 45,997 | 45,998 | 45,999 | 46,000 |
| | 2-416 | 46,014 | 46,015 | 46,016 | 46,017 | 46,018 | 46,019 | 46,020 | 46,021 | 46,022 | 46,023 | 46,024 | 46,025 |
| | 2-417 | 46,039 | 46,040 | 46,041 | 46,042 | 46,043 | 46,044 | 46,045 | 46,046 | 46,047 | 46,048 | 46,049 | 46,050 |
| | 2-418 | 46,064 | 46,065 | 46,066 | 46,067 | 46,068 | 46,069 | 46,070 | 46,071 | 46,072 | 46,073 | 46,074 | 46,075 |
| | 2-419 | 46,089 | 46,090 | 46,091 | 46,092 | 46,093 | 46,094 | 46,095 | 46,096 | 46,097 | 46,098 | 46,099 | 46,100 |
| | 2-420 | 46,114 | 46,115 | 46,116 | 46,117 | 46,118 | 46,119 | 46,120 | 46,121 | 46,122 | 46,123 | 46,124 | 46,125 |
| | 2-421 | 46,139 | 46,140 | 46,141 | 46,142 | 46,143 | 46,144 | 46,145 | 46,146 | 46,147 | 46,148 | 46,149 | 46,150 |
| | 2-422 | 46,164 | 46,165 | 46,166 | 46,167 | 46,168 | 46,169 | 46,170 | 46,171 | 46,172 | 46,173 | 46,174 | 46,175 |
| | 2-423 | 46,189 | 46,190 | 46,191 | 46,192 | 46,193 | 46,194 | 46,195 | 46,196 | 46,197 | 46,198 | 46,199 | 46,200 |
| | 2-424 | 46,214 | 46,215 | 46,216 | 46,217 | 46,218 | 46,219 | 46,220 | 46,221 | 46,222 | 46,223 | 46,224 | 46,225 |
| | 2-425 | 46,239 | 46,240 | 46,241 | 46,242 | 46,243 | 46,244 | 46,245 | 46,246 | 46,247 | 46,248 | 46,249 | 46,250 |
| | 2-426 | 46,264 | 46,265 | 46,266 | 46,267 | 46,268 | 46,269 | 46,270 | 46,271 | 46,272 | 46,273 | 46,274 | 46,275 |

TABLE 35-continued

| | | | | | | | | | | | | |
|---|---|---|---|---|---|---|---|---|---|---|---|---|
| 2-427 | 46,289 | 46,290 | 46,291 | 46,292 | 46,293 | 46,294 | 46,295 | 46,296 | 46,297 | 46,298 | 46,299 | 46,300 |
| 2-428 | 46,314 | 46,315 | 46,316 | 46,317 | 46,318 | 46,319 | 46,320 | 46,321 | 46,322 | 46,323 | 46,324 | 46,325 |
| 2-429 | 46,339 | 46,340 | 46,341 | 46,342 | 46,343 | 46,344 | 46,345 | 46,346 | 46,347 | 46,348 | 46,349 | 46,350 |
| 2-430 | 46,364 | 46,365 | 46,366 | 46,367 | 46,368 | 46,369 | 46,370 | 46,371 | 46,372 | 46,373 | 46,374 | 46,375 |
| 2-431 | 46,389 | 46,390 | 46,391 | 46,392 | 46,393 | 46,394 | 46,395 | 46,396 | 46,397 | 46,398 | 46,399 | 46,400 |
| 2-432 | 46,414 | 46,415 | 46,416 | 46,417 | 46,418 | 46,419 | 46,420 | 46,421 | 46,422 | 46,423 | 46,424 | 46,425 |
| 2-433 | 46,439 | 46,440 | 46,441 | 46,442 | 46,443 | 46,444 | 46,445 | 46,446 | 46,447 | 46,448 | 46,449 | 46,450 |
| 2-434 | 46,464 | 46,465 | 46,466 | 46,467 | 46,468 | 46,469 | 46,470 | 46,471 | 46,472 | 46,473 | 46,474 | 46,475 |
| 2-435 | 46,489 | 46,490 | 46,491 | 46,492 | 46,493 | 46,494 | 46,495 | 46,496 | 46,497 | 46,498 | 46,499 | 46,500 |
| 2-436 | 46,514 | 46,515 | 46,516 | 46,517 | 46,518 | 46,519 | 46,520 | 46,521 | 46,522 | 46,523 | 46,524 | 46,525 |
| 2-437 | 46,539 | 46,540 | 46,541 | 46,542 | 46,543 | 46,544 | 46,545 | 46,546 | 46,547 | 46,548 | 46,549 | 46,550 |
| 2-438 | 46,564 | 46,565 | 46,566 | 46,567 | 46,568 | 46,569 | 46,570 | 46,571 | 46,572 | 46,573 | 46,574 | 46,575 |
| 2-439 | 46,589 | 46,590 | 46,591 | 46,592 | 46,593 | 46,594 | 46,595 | 46,596 | 46,597 | 46,598 | 46,599 | 46,600 |
| 2-440 | 46,614 | 46,615 | 46,616 | 46,617 | 46,618 | 46,619 | 46,620 | 46,621 | 46,622 | 46,623 | 46,624 | 46,625 |

TABLE 36

| | | Compound represented by the formula (1) | | | | | | | | | | | | |
|---|---|---|---|---|---|---|---|---|---|---|---|---|---|---|
| | | 1-76 | 1-77 | 1-78 | 1-79 | 1-80 | 1-81 | 1-82 | 1-83 | 1-84 | 1-85 | 1-86 | 1-87 | 1-88 |
| Compound represented by the formula (2) | 2-441 | 46,626 | 46,627 | 46,628 | 46,629 | 46,630 | 46,631 | 46,632 | 46,633 | 46,634 | 46,635 | 46,636 | 46,637 | 46,638 |
| | 2-442 | 46,651 | 46,652 | 46,653 | 46,654 | 46,655 | 46,656 | 46,657 | 46,658 | 46,659 | 46,660 | 46,661 | 46,662 | 46,663 |
| | 2-443 | 46,676 | 46,677 | 46,678 | 46,679 | 46,680 | 46,681 | 46,682 | 46,683 | 46,684 | 46,685 | 46,686 | 46,687 | 46,688 |
| | 2-444 | 46,701 | 46,702 | 46,703 | 46,704 | 46,705 | 46,706 | 46,707 | 46,708 | 46,709 | 46,710 | 46,711 | 46,712 | 46,713 |
| | 2-445 | 46,726 | 46,727 | 46,728 | 46,729 | 46,730 | 46,731 | 46,732 | 46,733 | 46,734 | 46,735 | 46,736 | 46,737 | 46,738 |
| | 2-446 | 46,751 | 46,752 | 46,753 | 46,754 | 46,755 | 46,756 | 46,757 | 46,758 | 46,759 | 46,760 | 46,761 | 46,762 | 46,763 |
| | 2-447 | 46,776 | 46,777 | 46,778 | 46,779 | 46,780 | 46,781 | 46,782 | 46,783 | 46,784 | 46,785 | 46,786 | 46,787 | 46,788 |
| | 2-448 | 46,801 | 46,802 | 46,803 | 46,804 | 46,805 | 46,806 | 46,807 | 46,808 | 46,809 | 46,810 | 46,811 | 46,812 | 46,813 |
| | 2-449 | 46,826 | 46,827 | 46,828 | 46,829 | 46,830 | 46,831 | 46,832 | 46,833 | 46,834 | 46,835 | 46,836 | 46,837 | 46,838 |
| | 2-440 | 46,851 | 46,852 | 46,853 | 46,854 | 46,855 | 46,856 | 46,857 | 46,858 | 46,859 | 46,860 | 46,861 | 46,862 | 46,863 |
| | 2-451 | 46,876 | 46,877 | 46,878 | 46,879 | 46,880 | 46,881 | 46,882 | 46,883 | 46,884 | 46,885 | 46,886 | 46,887 | 46,888 |
| | 2-452 | 46,901 | 46,902 | 46,903 | 46,904 | 46,905 | 46,906 | 46,907 | 46,908 | 46,909 | 46,910 | 46,911 | 46,912 | 46,913 |
| | 2-453 | 46,926 | 46,927 | 46,928 | 46,929 | 46,930 | 46,931 | 46,932 | 46,933 | 46,934 | 46,935 | 46,936 | 46,937 | 46,938 |
| | 2-454 | 46,951 | 46,952 | 46,953 | 46,954 | 46,955 | 46,956 | 46,957 | 46,958 | 46,959 | 46,960 | 46,961 | 46,962 | 46,963 |
| | 2-455 | 46,976 | 46,977 | 46,978 | 46,979 | 46,980 | 46,981 | 46,982 | 46,983 | 46,984 | 46,985 | 46,986 | 46,987 | 46,988 |
| | 2-456 | 47,001 | 47,002 | 47,003 | 47,004 | 47,005 | 47,006 | 47,007 | 47,008 | 47,009 | 47,010 | 47,011 | 47,012 | 47,013 |
| | 2-457 | 47,026 | 47,027 | 47,028 | 47,029 | 47,030 | 47,031 | 47,032 | 47,033 | 47,034 | 47,035 | 47,036 | 47,037 | 47,038 |
| | 2-458 | 47,051 | 47,052 | 47,053 | 47,054 | 47,055 | 47,056 | 47,057 | 47,058 | 47,059 | 47,060 | 47,061 | 47,062 | 47,063 |
| | 2-459 | 47,076 | 47,077 | 47,078 | 47,079 | 47,080 | 47,081 | 47,082 | 47,083 | 47,084 | 47,085 | 47,086 | 47,087 | 47,088 |
| | 2-460 | 47,101 | 47,102 | 47,103 | 47,104 | 47,105 | 47,106 | 47,107 | 47,108 | 47,109 | 47,110 | 47,111 | 47,112 | 47,113 |
| | 2-461 | 47,126 | 47,127 | 47,128 | 47,129 | 47,130 | 47,131 | 47,132 | 47,133 | 47,134 | 47,135 | 47,136 | 47,137 | 47,138 |
| | 2-462 | 47,151 | 47,152 | 47,153 | 47,154 | 47,155 | 47,156 | 47,157 | 47,158 | 47,159 | 47,160 | 47,161 | 47,162 | 47,163 |
| | 2-463 | 47,176 | 47,177 | 47,178 | 47,179 | 47,180 | 47,181 | 47,182 | 47,183 | 47,184 | 47,185 | 47,186 | 47,187 | 47,188 |
| | 2-464 | 47,201 | 47,202 | 47,203 | 47,204 | 47,205 | 47,206 | 47,207 | 47,208 | 47,209 | 47,210 | 47,211 | 47,212 | 47,213 |
| | 2-465 | 47,226 | 47,227 | 47,228 | 47,229 | 47,230 | 47,231 | 47,232 | 47,233 | 47,234 | 47,235 | 47,236 | 47,237 | 47,238 |
| | 2-466 | 47,251 | 47,252 | 47,253 | 47,254 | 47,255 | 47,256 | 47,257 | 47,258 | 47,259 | 47,260 | 47,261 | 47,262 | 47,263 |
| | 2-467 | 47,276 | 47,277 | 47,278 | 47,279 | 47,280 | 47,281 | 47,282 | 47,283 | 47,284 | 47,285 | 47,286 | 47,287 | 47,288 |
| | 2-468 | 47,301 | 47,302 | 47,303 | 47,304 | 47,305 | 47,306 | 47,307 | 47,308 | 47,309 | 47,310 | 47,311 | 47,312 | 47,313 |
| | 2-469 | 47,326 | 47,327 | 47,328 | 47,329 | 47,330 | 47,331 | 47,332 | 47,333 | 47,334 | 47,335 | 47,336 | 47,337 | 47,338 |
| | 2-470 | 47,351 | 47,352 | 47,353 | 47,354 | 47,355 | 47,356 | 47,357 | 47,358 | 47,359 | 47,360 | 47,361 | 47,362 | 47,363 |
| | 2-471 | 47,376 | 47,377 | 47,378 | 47,379 | 47,380 | 47,381 | 47,382 | 47,383 | 47,384 | 47,385 | 47,386 | 47,387 | 47,388 |
| | 2-472 | 47,401 | 47,402 | 47,403 | 47,404 | 47,405 | 47,406 | 47,407 | 47,408 | 47,409 | 47,410 | 47,411 | 47,412 | 47,413 |
| | 2-473 | 47,426 | 47,427 | 47,428 | 47,429 | 47,430 | 47,431 | 47,432 | 47,433 | 47,434 | 47,435 | 47,436 | 47,437 | 47,438 |
| | 2-474 | 47,451 | 47,452 | 47,453 | 47,454 | 47,455 | 47,456 | 47,457 | 47,458 | 47,459 | 47,460 | 47,461 | 47,462 | 47,463 |
| | 2-475 | 47,476 | 47,477 | 47,478 | 47,479 | 47,480 | 47,481 | 47,482 | 47,483 | 47,484 | 47,485 | 47,486 | 47,487 | 47,488 |

| | | Compound represented by the formula (1) | | | | | | | | | | | |
|---|---|---|---|---|---|---|---|---|---|---|---|---|---|
| | | 1-89 | 1-90 | 1-91 | 1-92 | 1-93 | 1-94 | 1-95 | 1-96 | 1-97 | 1-98 | 1-99 | 1-100 |
| Compound represented by the formula (2) | 2-441 | 46,639 | 46,640 | 46,641 | 46,642 | 46,643 | 46,644 | 46,645 | 46,646 | 46,647 | 46,648 | 46,649 | 46,650 |
| | 2-442 | 46,664 | 46,665 | 46,666 | 46,667 | 46,668 | 46,669 | 46,670 | 46,671 | 46,672 | 46,673 | 46,674 | 46,675 |
| | 2-443 | 46,689 | 46,690 | 46,691 | 46,692 | 46,693 | 46,694 | 46,695 | 46,696 | 46,697 | 46,698 | 46,699 | 46,700 |
| | 2-444 | 46,714 | 46,715 | 46,716 | 46,717 | 46,718 | 46,719 | 46,720 | 46,721 | 46,722 | 46,723 | 46,724 | 46,725 |
| | 2-445 | 46,739 | 46,740 | 46,741 | 46,742 | 46,743 | 46,744 | 46,745 | 46,746 | 46,747 | 46,748 | 46,749 | 46,750 |
| | 2-446 | 46,764 | 46,765 | 46,766 | 46,767 | 46,768 | 46,769 | 46,770 | 46,771 | 46,772 | 46,773 | 46,774 | 46,775 |
| | 2-447 | 46,789 | 46,790 | 46,791 | 46,792 | 46,793 | 46,794 | 46,795 | 46,796 | 46,797 | 46,798 | 46,799 | 46,800 |
| | 2-448 | 46,814 | 46,815 | 46,816 | 46,817 | 46,818 | 46,819 | 46,820 | 46,821 | 46,822 | 46,823 | 46,824 | 46,825 |
| | 2-449 | 46,839 | 46,840 | 46,841 | 46,842 | 46,843 | 46,844 | 46,845 | 46,846 | 46,847 | 46,848 | 46,849 | 46,850 |
| | 2-440 | 46,864 | 46,865 | 46,866 | 46,867 | 46,868 | 46,869 | 46,870 | 46,871 | 46,872 | 46,873 | 46,874 | 46,875 |
| | 2-451 | 46,889 | 46,890 | 46,891 | 46,892 | 46,893 | 46,894 | 46,895 | 46,896 | 46,897 | 46,898 | 46,899 | 46,900 |
| | 2-452 | 46,914 | 46,915 | 46,916 | 46,917 | 46,918 | 46,919 | 46,920 | 46,921 | 46,922 | 46,923 | 46,924 | 46,925 |
| | 2-453 | 46,939 | 46,940 | 46,941 | 46,942 | 46,943 | 46,944 | 46,945 | 46,946 | 46,947 | 46,948 | 46,949 | 46,950 |
| | 2-454 | 46,964 | 46,965 | 46,966 | 46,967 | 46,968 | 46,969 | 46,970 | 46,971 | 46,972 | 46,973 | 46,974 | 46,975 |
| | 2-455 | 46,989 | 46,990 | 46,991 | 46,992 | 46,993 | 46,994 | 46,995 | 46,996 | 46,997 | 46,998 | 46,999 | 47,000 |
| | 2-456 | 47,014 | 47,015 | 47,016 | 47,017 | 47,018 | 47,019 | 47,020 | 47,021 | 47,022 | 47,023 | 47,024 | 47,025 |

TABLE 36-continued

| | | | | | | | | | | | | |
|---|---|---|---|---|---|---|---|---|---|---|---|---|
| 2-457 | 47,039 | 47,040 | 47,041 | 47,042 | 47,043 | 47,044 | 47,045 | 47,046 | 47,047 | 47,048 | 47,049 | 47,050 |
| 2-458 | 47,064 | 47,065 | 47,066 | 47,067 | 47,068 | 47,069 | 47,070 | 47,071 | 47,072 | 47,073 | 47,074 | 47,075 |
| 2-459 | 47,089 | 47,090 | 47,091 | 47,092 | 47,093 | 47,094 | 47,095 | 47,096 | 47,097 | 47,098 | 47,099 | 47,100 |
| 2-460 | 47,114 | 47,115 | 47,116 | 47,117 | 47,118 | 47,119 | 47,120 | 47,121 | 47,122 | 47,123 | 47,124 | 47,125 |
| 2-461 | 47,139 | 47,140 | 47,141 | 47,142 | 47,143 | 47,144 | 47,145 | 47,146 | 47,147 | 47,148 | 47,149 | 47,150 |
| 2-462 | 47,164 | 47,165 | 47,166 | 47,167 | 47,168 | 47,169 | 47,170 | 47,171 | 47,172 | 47,173 | 47,174 | 47,175 |
| 2-463 | 47,189 | 47,190 | 47,191 | 47,192 | 47,193 | 47,194 | 47,195 | 47,196 | 47,197 | 47,198 | 47,199 | 47,200 |
| 2-464 | 47,214 | 47,215 | 47,216 | 47,217 | 47,218 | 47,219 | 47,220 | 47,221 | 47,222 | 47,223 | 47,224 | 47,225 |
| 2-465 | 47,239 | 47,240 | 47,241 | 47,242 | 47,243 | 47,244 | 47,245 | 47,246 | 47,247 | 47,248 | 47,249 | 47,250 |
| 2-466 | 47,264 | 47,265 | 47,266 | 47,267 | 47,268 | 47,269 | 47,270 | 47,271 | 47,272 | 47,273 | 47,274 | 47,275 |
| 2-467 | 47,289 | 47,290 | 47,291 | 47,292 | 47,293 | 47,294 | 47,295 | 47,296 | 47,297 | 47,298 | 47,299 | 47,300 |
| 2-468 | 47,314 | 47,315 | 47,316 | 47,317 | 47,318 | 47,319 | 47,320 | 47,321 | 47,322 | 47,323 | 47,324 | 47,325 |
| 2-469 | 47,339 | 47,340 | 47,341 | 47,342 | 47,343 | 47,344 | 47,345 | 47,346 | 47,347 | 47,348 | 47,349 | 47,350 |
| 2-470 | 47,364 | 47,365 | 47,366 | 47,367 | 47,368 | 47,369 | 47,370 | 47,371 | 47,372 | 47,373 | 47,374 | 47,375 |
| 2-471 | 47,389 | 47,390 | 47,391 | 47,392 | 47,393 | 47,394 | 47,395 | 47,396 | 47,397 | 47,398 | 47,399 | 47,400 |
| 2-472 | 47,414 | 47,415 | 47,416 | 47,417 | 47,418 | 47,419 | 47,420 | 47,421 | 47,422 | 47,423 | 47,424 | 47,425 |
| 2-473 | 47,439 | 47,440 | 47,441 | 47,442 | 47,443 | 47,444 | 47,445 | 47,446 | 47,447 | 47,448 | 47,449 | 47,450 |
| 2-474 | 47,464 | 47,465 | 47,466 | 47,467 | 47,468 | 47,469 | 47,470 | 47,471 | 47,472 | 47,473 | 47,474 | 47,475 |
| 2-475 | 47,489 | 47,490 | 47,491 | 47,492 | 47,493 | 47,494 | 47,495 | 47,496 | 47,497 | 47,498 | 47,499 | 47,500 |

TABLE 37

| | | Compound represented by the formula (1) | | | | | | | | | | | | |
|---|---|---|---|---|---|---|---|---|---|---|---|---|---|---|
| | | 1-101 | 1-102 | 1-103 | 1-104 | 1-105 | 1-106 | 1-107 | 1-108 | 1-109 | 1-110 | 1-111 | 1-112 | 1-113 |
| Compound represented by the formula (2) | 2-1 | 47,501 | 47,502 | 47,503 | 47,504 | 47,505 | 47,506 | 47,507 | 47,508 | 47,509 | 47,510 | 47,511 | 47,512 | 47,513 |
| | 2-2 | 47,526 | 47,527 | 47,528 | 47,529 | 47,530 | 47,531 | 47,532 | 47,533 | 47,534 | 47,535 | 47,536 | 47,537 | 47,538 |
| | 2-3 | 47,551 | 47,552 | 47,553 | 47,554 | 47,555 | 47,556 | 47,557 | 47,558 | 47,559 | 47,560 | 47,561 | 47,562 | 47,563 |
| | 2-4 | 47,576 | 47,577 | 47,578 | 47,579 | 47,580 | 47,581 | 47,582 | 47,583 | 47,584 | 47,585 | 47,586 | 47,587 | 47,588 |
| | 2-5 | 47,601 | 47,602 | 47,603 | 47,604 | 47,605 | 47,606 | 47,607 | 47,608 | 47,609 | 47,610 | 47,611 | 47,612 | 47,613 |
| | 2-6 | 47,626 | 47,627 | 47,628 | 47,629 | 47,630 | 47,631 | 47,632 | 47,633 | 47,634 | 47,635 | 47,636 | 47,637 | 47,638 |
| | 2-7 | 47,651 | 47,652 | 47,653 | 47,654 | 47,655 | 47,656 | 47,657 | 47,658 | 47,659 | 47,660 | 47,661 | 47,662 | 47,663 |
| | 2-8 | 47,676 | 47,677 | 47,678 | 47,679 | 47,680 | 47,681 | 47,682 | 47,683 | 47,684 | 47,685 | 47,686 | 47,687 | 47,688 |
| | 2-9 | 47,701 | 47,702 | 47,703 | 47,704 | 47,705 | 47,706 | 47,707 | 47,708 | 47,709 | 47,710 | 47,711 | 47,712 | 47,713 |
| | 2-10 | 47,726 | 47,727 | 47,728 | 47,729 | 47,730 | 47,731 | 47,732 | 47,733 | 47,734 | 47,735 | 47,736 | 47,737 | 47,738 |
| | 2-11 | 47,751 | 47,752 | 47,753 | 47,754 | 47,755 | 47,756 | 47,757 | 47,758 | 47,759 | 47,760 | 47,761 | 47,762 | 47,763 |
| | 2-12 | 47,776 | 47,777 | 47,778 | 47,779 | 47,780 | 47,781 | 47,782 | 47,783 | 47,784 | 47,785 | 47,786 | 47,787 | 47,788 |
| | 2-13 | 47,801 | 47,802 | 47,803 | 47,804 | 47,805 | 47,806 | 47,807 | 47,808 | 47,809 | 47,810 | 47,811 | 47,812 | 47,813 |
| | 2-14 | 47,826 | 47,827 | 47,828 | 47,829 | 47,830 | 47,831 | 47,832 | 47,833 | 47,834 | 47,835 | 47,836 | 47,837 | 47,838 |
| | 2-15 | 47,851 | 47,852 | 47,853 | 47,854 | 47,855 | 47,856 | 47,857 | 47,858 | 47,859 | 47,860 | 47,861 | 47,862 | 47,863 |
| | 2-16 | 47,876 | 47,877 | 47,878 | 47,879 | 47,880 | 47,881 | 47,882 | 47,883 | 47,884 | 47,885 | 47,886 | 47,887 | 47,888 |
| | 2-17 | 47,901 | 47,902 | 47,903 | 47,904 | 47,905 | 47,906 | 47,907 | 47,908 | 47,909 | 47,910 | 47,911 | 47,912 | 47,913 |
| | 2-18 | 47,926 | 47,927 | 47,928 | 47,929 | 47,930 | 47,931 | 47,932 | 47,933 | 47,934 | 47,935 | 47,936 | 47,937 | 47,938 |
| | 2-19 | 47,951 | 47,952 | 47,953 | 47,954 | 47,955 | 47,956 | 47,957 | 47,958 | 47,959 | 47,960 | 47,961 | 47,962 | 47,963 |
| | 2-20 | 47,976 | 47,977 | 47,978 | 47,979 | 47,980 | 47,981 | 47,982 | 47,983 | 47,984 | 47,985 | 47,986 | 47,987 | 47,988 |
| | 2-21 | 48,001 | 48,002 | 48,003 | 48,004 | 48,005 | 48,006 | 48,007 | 48,008 | 48,009 | 48,010 | 48,011 | 48,012 | 48,013 |
| | 2-22 | 48,026 | 48,027 | 48,028 | 48,029 | 48,030 | 48,031 | 48,032 | 48,033 | 48,034 | 48,035 | 48,036 | 48,037 | 48,038 |
| | 2-23 | 48,051 | 48,052 | 48,053 | 48,054 | 48,055 | 48,056 | 48,057 | 48,058 | 48,059 | 48,060 | 48,061 | 48,062 | 48,063 |
| | 2-24 | 48,076 | 48,077 | 48,078 | 48,079 | 48,080 | 48,081 | 48,082 | 48,083 | 48,084 | 48,085 | 48,086 | 48,087 | 48,088 |
| | 2-25 | 48,101 | 48,102 | 48,103 | 48,104 | 48,105 | 48,106 | 48,107 | 48,108 | 48,109 | 48,110 | 48,111 | 48,112 | 48,113 |
| | 2-26 | 48,126 | 48,127 | 48,128 | 48,129 | 48,130 | 48,131 | 48,132 | 48,133 | 48,134 | 48,135 | 48,136 | 48,137 | 48,138 |
| | 2-27 | 48,151 | 48,152 | 48,153 | 48,154 | 48,155 | 48,156 | 48,157 | 48,158 | 48,159 | 48,160 | 48,161 | 48,162 | 48,163 |
| | 2-28 | 48,176 | 48,177 | 48,178 | 48,179 | 48,180 | 48,181 | 48,182 | 48,183 | 48,184 | 48,185 | 48,186 | 48,187 | 48,188 |
| | 2-29 | 48,201 | 48,202 | 48,203 | 48,204 | 48,205 | 48,206 | 48,207 | 48,208 | 48,209 | 48,210 | 48,211 | 48,212 | 48,213 |
| | 2-30 | 48,226 | 48,227 | 48,228 | 48,229 | 48,230 | 48,231 | 48,232 | 48,233 | 48,234 | 48,235 | 48,236 | 48,237 | 48,238 |
| | 2-31 | 48,251 | 48,252 | 48,253 | 48,254 | 48,255 | 48,256 | 48,257 | 48,258 | 48,259 | 48,260 | 48,261 | 48,262 | 48,263 |
| | 2-32 | 48,276 | 48,277 | 48,278 | 48,279 | 48,280 | 48,281 | 48,282 | 48,283 | 48,284 | 48,285 | 48,286 | 48,287 | 48,288 |
| | 2-33 | 48,301 | 48,302 | 48,303 | 48,304 | 48,305 | 48,306 | 48,307 | 48,308 | 48,309 | 48,310 | 48,311 | 48,312 | 48,313 |
| | 2-34 | 48,326 | 48,327 | 48,328 | 48,329 | 48,330 | 48,331 | 48,332 | 48,333 | 48,334 | 48,335 | 48,336 | 48,337 | 48,338 |
| | 2-35 | 48,351 | 48,352 | 48,353 | 48,354 | 48,355 | 48,356 | 48,357 | 48,358 | 48,359 | 48,360 | 48,361 | 48,362 | 48,363 |
| | 2-36 | 48,376 | 48,377 | 48,378 | 48,379 | 48,380 | 48,381 | 48,382 | 48,383 | 48,384 | 48,385 | 48,386 | 48,387 | 48,388 |
| | 2-37 | 48,401 | 48,402 | 48,403 | 48,404 | 48,405 | 48,406 | 48,407 | 48,408 | 48,409 | 48,410 | 48,411 | 48,412 | 48,413 |
| | 2-38 | 48,426 | 48,427 | 48,428 | 48,429 | 48,430 | 48,431 | 48,432 | 48,433 | 48,434 | 48,435 | 48,436 | 48,437 | 48,438 |
| | 2-39 | 48,451 | 48,452 | 48,453 | 48,454 | 48,455 | 48,456 | 48,457 | 48,458 | 48,459 | 48,460 | 48,461 | 48,462 | 48,463 |
| | 2-40 | 48,476 | 48,477 | 48,478 | 48,479 | 48,480 | 48,481 | 48,482 | 48,483 | 48,484 | 48,485 | 48,486 | 48,487 | 48,488 |
| | 2-41 | 48,501 | 48,502 | 48,503 | 48,504 | 48,505 | 48,506 | 48,507 | 48,508 | 48,509 | 48,510 | 48,511 | 48,512 | 48,513 |
| | 2-42 | 48,526 | 48,527 | 48,528 | 48,529 | 48,530 | 48,531 | 48,532 | 48,533 | 48,534 | 48,535 | 48,536 | 48,537 | 48,538 |
| | 2-43 | 48,551 | 48,552 | 48,553 | 48,554 | 48,555 | 48,556 | 48,557 | 48,558 | 48,559 | 48,560 | 48,561 | 48,562 | 48,563 |
| | 2-44 | 48,576 | 48,577 | 48,578 | 48,579 | 48,580 | 48,581 | 48,582 | 48,583 | 48,584 | 48,585 | 48,586 | 48,587 | 48,588 |
| | 2-45 | 48,601 | 48,602 | 48,603 | 48,604 | 48,605 | 48,606 | 48,607 | 48,608 | 48,609 | 48,610 | 48,611 | 48,612 | 48,613 |
| | 2-46 | 48,626 | 48,627 | 48,628 | 48,629 | 48,630 | 48,631 | 48,632 | 48,633 | 48,634 | 48,635 | 48,636 | 48,637 | 48,638 |
| | 2-47 | 48,651 | 48,652 | 48,653 | 48,654 | 48,655 | 48,656 | 48,657 | 48,658 | 48,659 | 48,660 | 48,661 | 48,662 | 48,663 |
| | 2-48 | 48,676 | 48,677 | 48,678 | 48,679 | 48,680 | 48,681 | 48,682 | 48,683 | 48,684 | 48,685 | 48,686 | 48,687 | 48,688 |
| | 2-49 | 48,701 | 48,702 | 48,703 | 48,704 | 48,705 | 48,706 | 48,707 | 48,708 | 48,709 | 48,710 | 48,711 | 48,712 | 48,713 |
| | 2-50 | 48,726 | 48,727 | 48,728 | 48,729 | 48,730 | 48,731 | 48,732 | 48,733 | 48,734 | 48,735 | 48,736 | 48,737 | 48,738 |
| | 2-51 | 48,751 | 48,752 | 48,753 | 48,754 | 48,755 | 48,756 | 48,757 | 48,758 | 48,759 | 48,760 | 48,761 | 48,762 | 48,763 |

TABLE 37-continued

| | | | | | | | | | | | | | | |
|---|---|---|---|---|---|---|---|---|---|---|---|---|---|---|
| | 2-52 | 48,776 | 48,777 | 48,778 | 48,779 | 48,780 | 48,781 | 48,782 | 48,783 | 48,784 | 48,785 | 48,786 | 48,787 | 48,788 |
| | 2-53 | 48,801 | 48,802 | 48,803 | 48,804 | 48,805 | 48,806 | 48,807 | 48,808 | 48,809 | 48,810 | 48,811 | 48,812 | 48,813 |
| | 2-54 | 48,826 | 48,827 | 48,828 | 48,829 | 48,830 | 48,831 | 48,832 | 48,833 | 48,834 | 48,835 | 48,836 | 48,837 | 48,838 |
| | 2-55 | 48,851 | 48,852 | 48,853 | 48,854 | 48,855 | 48,856 | 48,857 | 48,858 | 48,859 | 48,860 | 48,861 | 48,862 | 48,863 |

| | | Compound represented by the formula (1) | | | | | | | | | | | |
|---|---|---|---|---|---|---|---|---|---|---|---|---|---|
| | | 1-114 | 1-115 | 1-116 | 1-117 | 1-118 | 1-119 | 1-120 | 1-121 | 1-122 | 1-123 | 1-124 | 1-125 |
| Compound represented by the formula (2) | 2-1 | 47,514 | 47,515 | 47,516 | 47,517 | 47,518 | 47,519 | 47,520 | 47,521 | 47,522 | 47,523 | 47,524 | 47,525 |
| | 2-2 | 47,539 | 47,540 | 47,541 | 47,542 | 47,543 | 47,544 | 47,545 | 47,546 | 47,547 | 47,548 | 47,549 | 47,550 |
| | 2-3 | 47,564 | 47,565 | 47,566 | 47,567 | 47,568 | 47,569 | 47,570 | 47,571 | 47,572 | 47,573 | 47,574 | 47,575 |
| | 2-4 | 47,589 | 47,590 | 47,591 | 47,592 | 47,593 | 47,594 | 47,595 | 47,596 | 47,597 | 47,598 | 47,599 | 47,600 |
| | 2-5 | 47,614 | 47,615 | 47,616 | 47,617 | 47,618 | 47,619 | 47,620 | 47,621 | 47,622 | 47,623 | 47,624 | 47,625 |
| | 2-6 | 47,639 | 47,640 | 47,641 | 47,642 | 47,643 | 47,644 | 47,645 | 47,646 | 47,647 | 47,648 | 47,649 | 47,650 |
| | 2-7 | 47,664 | 47,665 | 47,666 | 47,667 | 47,668 | 47,669 | 47,670 | 47,671 | 47,672 | 47,673 | 47,674 | 47,675 |
| | 2-8 | 47,689 | 47,690 | 47,691 | 47,692 | 47,693 | 47,694 | 47,695 | 47,696 | 47,697 | 47,698 | 47,699 | 47,700 |
| | 2-9 | 47,714 | 47,715 | 47,716 | 47,717 | 47,718 | 47,719 | 47,720 | 47,721 | 47,722 | 47,723 | 47,724 | 47,725 |
| | 2-10 | 47,739 | 47,740 | 47,741 | 47,742 | 47,743 | 47,744 | 47,745 | 47,746 | 47,747 | 47,748 | 47,749 | 47,750 |
| | 2-11 | 47,764 | 47,765 | 47,766 | 47,767 | 47,768 | 47,769 | 47,770 | 47,771 | 47,772 | 47,773 | 47,774 | 47,775 |
| | 2-12 | 47,789 | 47,790 | 47,791 | 47,792 | 47,793 | 47,794 | 47,795 | 47,796 | 47,797 | 47,798 | 47,799 | 47,800 |
| | 2-13 | 47,814 | 47,815 | 47,816 | 47,817 | 47,818 | 47,819 | 47,820 | 47,821 | 47,822 | 47,823 | 47,824 | 47,825 |
| | 2-14 | 47,839 | 47,840 | 47,841 | 47,842 | 47,843 | 47,844 | 47,845 | 47,846 | 47,847 | 47,848 | 47,849 | 47,850 |
| | 2-15 | 47,864 | 47,865 | 47,866 | 47,867 | 47,868 | 47,869 | 47,870 | 47,871 | 47,872 | 47,873 | 47,874 | 47,875 |
| | 2-16 | 47,889 | 47,890 | 47,891 | 47,892 | 47,893 | 47,894 | 47,895 | 47,896 | 47,897 | 47,898 | 47,899 | 47,900 |
| | 2-17 | 47,914 | 47,915 | 47,916 | 47,917 | 47,918 | 47,919 | 47,920 | 47,921 | 47,922 | 47,923 | 47,924 | 47,925 |
| | 2-18 | 47,939 | 47,940 | 47,941 | 47,942 | 47,943 | 47,944 | 47,945 | 47,946 | 47,947 | 47,948 | 47,949 | 47,950 |
| | 2-19 | 47,964 | 47,965 | 47,966 | 47,967 | 47,968 | 47,969 | 47,970 | 47,971 | 47,972 | 47,973 | 47,974 | 47,975 |
| | 2-20 | 47,989 | 47,990 | 47,991 | 47,992 | 47,993 | 47,994 | 47,995 | 47,996 | 47,997 | 47,998 | 47,999 | 48,000 |
| | 2-21 | 48,014 | 48,015 | 48,016 | 48,017 | 48,018 | 48,019 | 48,020 | 48,021 | 48,022 | 48,023 | 48,024 | 48,025 |
| | 2-22 | 48,039 | 48,040 | 48,041 | 48,042 | 48,043 | 48,044 | 48,045 | 48,046 | 48,047 | 48,048 | 48,049 | 48,050 |
| | 2-23 | 48,064 | 48,065 | 48,066 | 48,067 | 48,068 | 48,069 | 48,070 | 48,071 | 48,072 | 48,073 | 48,074 | 48,075 |
| | 2-24 | 48,089 | 48,090 | 48,091 | 48,092 | 48,093 | 48,094 | 48,095 | 48,096 | 48,097 | 48,098 | 48,099 | 48,100 |
| | 2-25 | 48,114 | 48,115 | 48,116 | 48,117 | 48,118 | 48,119 | 48,120 | 48,121 | 48,122 | 48,123 | 48,124 | 48,125 |
| | 2-26 | 48,139 | 48,140 | 48,141 | 48,142 | 48,143 | 48,144 | 48,145 | 48,146 | 48,147 | 48,148 | 48,149 | 48,150 |
| | 2-27 | 48,164 | 48,165 | 48,166 | 48,167 | 48,168 | 48,169 | 48,170 | 48,171 | 48,172 | 48,173 | 48,174 | 48,175 |
| | 2-28 | 48,189 | 48,190 | 48,191 | 48,192 | 48,193 | 48,194 | 48,195 | 48,196 | 48,197 | 48,198 | 48,199 | 48,200 |
| | 2-29 | 48,214 | 48,215 | 48,216 | 48,217 | 48,218 | 48,219 | 48,220 | 48,221 | 48,222 | 48,223 | 48,224 | 48,225 |
| | 2-30 | 48,239 | 48,240 | 48,241 | 48,242 | 48,243 | 48,244 | 48,245 | 48,246 | 48,247 | 48,248 | 48,249 | 48,250 |
| | 2-31 | 48,264 | 48,265 | 48,266 | 48,267 | 48,268 | 48,269 | 48,270 | 48,271 | 48,272 | 48,273 | 48,274 | 48,275 |
| | 2-32 | 48,289 | 48,290 | 48,291 | 48,292 | 48,293 | 48,294 | 48,295 | 48,296 | 48,297 | 48,298 | 48,299 | 48,300 |
| | 2-33 | 48,314 | 48,315 | 48,316 | 48,317 | 48,318 | 48,319 | 48,320 | 48,321 | 48,322 | 48,323 | 48,324 | 48,325 |
| | 2-34 | 48,339 | 48,340 | 48,341 | 48,342 | 48,343 | 48,344 | 48,345 | 48,346 | 48,347 | 48,348 | 48,349 | 48,350 |
| | 2-35 | 48,364 | 48,365 | 48,366 | 48,367 | 48,368 | 48,369 | 48,370 | 48,371 | 48,372 | 48,373 | 48,374 | 48,375 |
| | 2-36 | 48,389 | 48,390 | 48,391 | 48,392 | 48,393 | 48,394 | 48,395 | 48,396 | 48,397 | 48,398 | 48,399 | 48,400 |
| | 2-37 | 48,414 | 48,415 | 48,416 | 48,417 | 48,418 | 48,419 | 48,420 | 48,421 | 48,422 | 48,423 | 48,424 | 48,425 |
| | 2-38 | 48,439 | 48,440 | 48,441 | 48,442 | 48,443 | 48,444 | 48,445 | 48,446 | 48,447 | 48,448 | 48,449 | 48,450 |
| | 2-39 | 48,464 | 48,465 | 48,466 | 48,467 | 48,468 | 48,469 | 48,470 | 48,471 | 48,472 | 48,473 | 48,474 | 48,475 |
| | 2-40 | 48,489 | 48,490 | 48,491 | 48,492 | 48,493 | 48,494 | 48,495 | 48,496 | 48,497 | 48,498 | 48,499 | 48,500 |
| | 2-41 | 48,514 | 48,515 | 48,516 | 48,517 | 48,518 | 48,519 | 48,520 | 48,521 | 48,522 | 48,523 | 48,524 | 48,525 |
| | 2-42 | 48,539 | 48,540 | 48,541 | 48,542 | 48,543 | 48,544 | 48,545 | 48,546 | 48,547 | 48,548 | 48,549 | 48,550 |
| | 2-43 | 48,564 | 48,565 | 48,566 | 48,567 | 48,568 | 48,569 | 48,570 | 48,571 | 48,572 | 48,573 | 48,574 | 48,575 |
| | 2-44 | 48,589 | 48,590 | 48,591 | 48,592 | 48,593 | 48,594 | 48,595 | 48,596 | 48,597 | 48,598 | 48,599 | 48,600 |
| | 2-45 | 48,614 | 48,615 | 48,616 | 48,617 | 48,618 | 48,619 | 48,620 | 48,621 | 48,622 | 48,623 | 48,624 | 48,625 |
| | 2-46 | 48,639 | 48,640 | 48,641 | 48,642 | 48,643 | 48,644 | 48,645 | 48,646 | 48,647 | 48,648 | 48,649 | 48,650 |
| | 2-47 | 48,664 | 48,665 | 48,666 | 48,667 | 48,668 | 48,669 | 48,670 | 48,671 | 48,672 | 48,673 | 48,674 | 48,675 |
| | 2-48 | 48,689 | 48,690 | 48,691 | 48,692 | 48,693 | 48,694 | 48,695 | 48,696 | 48,697 | 48,698 | 48,699 | 48,700 |
| | 2-49 | 48,714 | 48,715 | 48,716 | 48,717 | 48,718 | 48,719 | 48,720 | 48,721 | 48,722 | 48,723 | 48,724 | 48,725 |
| | 2-50 | 48,739 | 48,740 | 48,741 | 48,742 | 48,743 | 48,744 | 48,745 | 48,746 | 48,747 | 48,748 | 48,749 | 48,750 |
| | 2-51 | 48,764 | 48,765 | 48,766 | 48,767 | 48,768 | 48,769 | 48,770 | 48,771 | 48,772 | 48,773 | 48,774 | 48,775 |
| | 2-52 | 48,789 | 48,790 | 48,791 | 48,792 | 48,793 | 48,794 | 48,795 | 48,796 | 48,797 | 48,798 | 48,799 | 48,800 |
| | 2-53 | 48,814 | 48,815 | 48,816 | 48,817 | 48,818 | 48,819 | 48,820 | 48,821 | 48,822 | 48,823 | 48,824 | 48,825 |
| | 2-54 | 48,839 | 48,840 | 48,841 | 48,842 | 48,843 | 48,844 | 48,845 | 48,846 | 48,847 | 48,848 | 48,849 | 48,850 |
| | 2-55 | 48,864 | 48,865 | 48,866 | 48,867 | 48,868 | 48,869 | 48,870 | 48,871 | 48,872 | 48,873 | 48,874 | 48,875 |

TABLE 38

| | | Compound represented by the formula (1) | | | | | | | | | | | | |
|---|---|---|---|---|---|---|---|---|---|---|---|---|---|---|
| | | 1-101 | 1-102 | 1-103 | 1-104 | 1-105 | 1-106 | 1-107 | 1-108 | 1-109 | 1-110 | 1-111 | 1-112 | 1-113 |
| Compound represented by the formula (2) | 2-56 | 48,876 | 48,877 | 48,878 | 48,879 | 48,880 | 48,881 | 48,882 | 48,883 | 48,884 | 48,885 | 48,886 | 48,887 | 48,888 |
| | 2-57 | 48,901 | 48,902 | 48,903 | 48,904 | 48,905 | 48,906 | 48,907 | 48,908 | 48,909 | 48,910 | 48,911 | 48,912 | 48,913 |
| | 2-58 | 48,926 | 48,927 | 48,928 | 48,929 | 48,930 | 48,931 | 48,932 | 48,933 | 48,934 | 48,935 | 48,936 | 48,937 | 48,938 |
| | 2-59 | 48,951 | 48,952 | 48,953 | 48,954 | 48,955 | 48,956 | 48,957 | 48,958 | 48,959 | 48,960 | 48,961 | 48,962 | 48,963 |
| | 2-60 | 48,976 | 48,977 | 48,978 | 48,979 | 48,980 | 48,981 | 48,982 | 48,983 | 48,984 | 48,985 | 48,986 | 48,987 | 48,988 |
| | 2-61 | 49,001 | 49,002 | 49,003 | 49,004 | 49,005 | 49,006 | 49,007 | 49,008 | 49,009 | 49,010 | 49,011 | 49,012 | 49,013 |

TABLE 38-continued

| | | | | | | | | | | | | | |
|---|---|---|---|---|---|---|---|---|---|---|---|---|---|
| 2-62 | 49,026 | 49,027 | 49,028 | 49,029 | 49,030 | 49,031 | 49,032 | 49,033 | 49,034 | 49,035 | 49,036 | 49,037 | 49,038 |
| 2-63 | 49,051 | 49,052 | 49,053 | 49,054 | 49,055 | 49,056 | 49,057 | 49,058 | 49,059 | 49,060 | 49,061 | 49,062 | 49,063 |
| 2-64 | 49,076 | 49,077 | 49,078 | 49,079 | 49,080 | 49,081 | 49,082 | 49,083 | 49,084 | 49,085 | 49,086 | 49,087 | 49,088 |
| 2-65 | 49,101 | 49,102 | 49,103 | 49,104 | 49,105 | 49,106 | 49,107 | 49,108 | 49,109 | 49,110 | 49,111 | 49,112 | 49,113 |
| 2-66 | 49,126 | 49,127 | 49,128 | 49,129 | 49,130 | 49,131 | 49,132 | 49,133 | 49,134 | 49,135 | 49,136 | 49,137 | 49,138 |
| 2-67 | 49,151 | 49,152 | 49,153 | 49,154 | 49,155 | 49,156 | 49,157 | 49,158 | 49,159 | 49,160 | 49,161 | 49,162 | 49,163 |
| 2-68 | 49,176 | 49,177 | 49,178 | 49,179 | 49,180 | 49,181 | 49,182 | 49,183 | 49,184 | 49,185 | 49,186 | 49,187 | 49,188 |
| 2-69 | 49,201 | 49,202 | 49,203 | 49,204 | 49,205 | 49,206 | 49,207 | 49,208 | 49,209 | 49,210 | 49,211 | 49,212 | 49,213 |
| 2-70 | 49,226 | 49,227 | 49,228 | 49,229 | 49,230 | 49,231 | 49,232 | 49,233 | 49,234 | 49,235 | 49,236 | 49,237 | 49,238 |
| 2-71 | 49,251 | 49,252 | 49,253 | 49,254 | 49,255 | 49,256 | 49,257 | 49,258 | 49,259 | 49,260 | 49,261 | 49,262 | 49,263 |
| 2-72 | 49,276 | 49,277 | 49,278 | 49,279 | 49,280 | 49,281 | 49,282 | 49,283 | 49,284 | 49,285 | 49,286 | 49,287 | 49,288 |
| 2-73 | 49,301 | 49,302 | 49,303 | 49,304 | 49,305 | 49,306 | 49,307 | 49,308 | 49,309 | 49,310 | 49,311 | 49,312 | 49,313 |
| 2-74 | 49,326 | 49,327 | 49,328 | 49,329 | 49,330 | 49,331 | 49,332 | 49,333 | 49,334 | 49,335 | 49,336 | 49,337 | 49,338 |
| 2-75 | 49,351 | 49,352 | 49,353 | 49,354 | 49,355 | 49,356 | 49,357 | 49,358 | 49,359 | 49,360 | 49,361 | 49,362 | 49,363 |
| 2-76 | 49,376 | 49,377 | 49,378 | 49,379 | 49,380 | 49,381 | 49,382 | 49,383 | 49,384 | 49,385 | 49,386 | 49,387 | 49,388 |
| 2-77 | 49,401 | 49,402 | 49,403 | 49,404 | 49,405 | 49,406 | 49,407 | 49,408 | 49,409 | 49,410 | 49,411 | 49,412 | 49,413 |
| 2-78 | 49,426 | 49,427 | 49,428 | 49,429 | 49,430 | 49,431 | 49,432 | 49,433 | 49,434 | 49,435 | 49,436 | 49,437 | 49,438 |
| 2-79 | 49,451 | 49,452 | 49,453 | 49,454 | 49,455 | 49,456 | 49,457 | 49,458 | 49,459 | 49,460 | 49,461 | 49,462 | 49,463 |
| 2-80 | 49,476 | 49,477 | 49,478 | 49,479 | 49,480 | 49,481 | 49,482 | 49,483 | 49,484 | 49,485 | 49,486 | 49,487 | 49,488 |
| 2-81 | 49,501 | 49,502 | 49,503 | 49,504 | 49,505 | 49,506 | 49,507 | 49,508 | 49,509 | 49,510 | 49,511 | 49,512 | 49,513 |
| 2-82 | 49,526 | 49,527 | 49,528 | 49,529 | 49,530 | 49,531 | 49,532 | 49,533 | 49,534 | 49,535 | 49,536 | 49,537 | 49,538 |
| 2-83 | 49,551 | 49,552 | 49,553 | 49,554 | 49,555 | 49,556 | 49,557 | 49,558 | 49,559 | 49,560 | 49,561 | 49,562 | 49,563 |
| 2-84 | 49,576 | 49,577 | 49,578 | 49,579 | 49,580 | 49,581 | 49,582 | 49,583 | 49,584 | 49,585 | 49,586 | 49,587 | 49,588 |
| 2-85 | 49,601 | 49,602 | 49,603 | 49,604 | 49,605 | 49,606 | 49,607 | 49,608 | 49,609 | 49,610 | 49,611 | 49,612 | 49,613 |
| 2-86 | 49,626 | 49,627 | 49,628 | 49,629 | 49,630 | 49,631 | 49,632 | 49,633 | 49,634 | 49,635 | 49,636 | 49,637 | 49,638 |
| 2-87 | 49,651 | 49,652 | 49,653 | 49,654 | 49,655 | 49,656 | 49,657 | 49,658 | 49,659 | 49,660 | 49,661 | 49,662 | 49,663 |
| 2-88 | 49,676 | 49,677 | 49,678 | 49,679 | 49,680 | 49,681 | 49,682 | 49,683 | 49,684 | 49,685 | 49,686 | 49,687 | 49,688 |
| 2-89 | 49,701 | 49,702 | 49,703 | 49,704 | 49,705 | 49,706 | 49,707 | 49,708 | 49,709 | 49,710 | 49,711 | 49,712 | 49,713 |
| 2-90 | 49,726 | 49,727 | 49,728 | 49,729 | 49,730 | 49,731 | 49,732 | 49,733 | 49,734 | 49,735 | 49,736 | 49,737 | 49,738 |
| 2-91 | 49,751 | 49,752 | 49,753 | 49,754 | 49,755 | 49,756 | 49,757 | 49,758 | 49,759 | 49,760 | 49,761 | 49,762 | 49,763 |
| 2-92 | 49,776 | 49,777 | 49,778 | 49,779 | 49,780 | 49,781 | 49,782 | 49,783 | 49,784 | 49,785 | 49,786 | 49,787 | 49,788 |
| 2-93 | 49,801 | 49,802 | 49,803 | 49,804 | 49,805 | 49,806 | 49,807 | 49,808 | 49,809 | 49,810 | 49,811 | 49,812 | 49,813 |
| 2-94 | 49,826 | 49,827 | 49,828 | 49,829 | 49,830 | 49,831 | 49,832 | 49,833 | 49,834 | 49,835 | 49,836 | 49,837 | 49,838 |
| 2-95 | 49,851 | 49,852 | 49,853 | 49,854 | 49,855 | 49,856 | 49,857 | 49,858 | 49,859 | 49,860 | 49,861 | 49,862 | 49,863 |
| 2-96 | 49,876 | 49,877 | 49,878 | 49,879 | 49,880 | 49,881 | 49,882 | 49,883 | 49,884 | 49,885 | 49,886 | 49,887 | 49,888 |
| 2-97 | 49,901 | 49,902 | 49,903 | 49,904 | 49,905 | 49,906 | 49,907 | 49,908 | 49,909 | 49,910 | 49,911 | 49,912 | 49,913 |
| 2-98 | 49,926 | 49,927 | 49,928 | 49,929 | 49,930 | 49,931 | 49,932 | 49,933 | 49,934 | 49,935 | 49,936 | 49,937 | 49,938 |
| 2-99 | 49,951 | 49,952 | 49,953 | 49,954 | 49,955 | 49,956 | 49,957 | 49,958 | 49,959 | 49,960 | 49,961 | 49,962 | 49,963 |
| 2-100 | 49,976 | 49,977 | 49,978 | 49,979 | 49,980 | 49,981 | 49,982 | 49,983 | 49,984 | 49,985 | 49,986 | 49,987 | 49,988 |
| 2-101 | 50,001 | 50,002 | 50,003 | 50,004 | 50,005 | 50,006 | 50,007 | 50,008 | 50,009 | 50,010 | 50,011 | 50,012 | 50,013 |
| 2-102 | 50,026 | 50,027 | 50,028 | 50,029 | 50,030 | 50,031 | 50,032 | 50,033 | 50,034 | 50,035 | 50,036 | 50,037 | 50,038 |
| 2-103 | 50,051 | 50,052 | 50,053 | 50,054 | 50,055 | 50,056 | 50,057 | 50,058 | 50,059 | 50,060 | 50,061 | 50,062 | 50,063 |
| 2-104 | 50,076 | 50,077 | 50,078 | 50,079 | 50,080 | 50,081 | 50,082 | 50,083 | 50,084 | 50,085 | 50,086 | 50,087 | 50,088 |
| 2-105 | 50,101 | 50,102 | 50,103 | 50,104 | 50,105 | 50,106 | 50,107 | 50,108 | 50,109 | 50,110 | 50,111 | 50,112 | 50,113 |
| 2-106 | 50,126 | 50,127 | 50,128 | 50,129 | 50,130 | 50,131 | 50,132 | 50,133 | 50,134 | 50,135 | 50,136 | 50,137 | 50,138 |
| 2-107 | 50,151 | 50,152 | 50,153 | 50,154 | 50,155 | 50,156 | 50,157 | 50,158 | 50,159 | 50,160 | 50,161 | 50,162 | 50,163 |
| 2-108 | 50,176 | 50,177 | 50,178 | 50,179 | 50,180 | 50,181 | 50,182 | 50,183 | 50,184 | 50,185 | 50,186 | 50,187 | 50,188 |
| 2-109 | 50,201 | 50,202 | 50,203 | 50,204 | 50,205 | 50,206 | 50,207 | 50,208 | 50,209 | 50,210 | 50,211 | 50,212 | 50,213 |
| 2-110 | 50,226 | 50,227 | 50,228 | 50,229 | 50,230 | 50,231 | 50,232 | 50,233 | 50,234 | 50,235 | 50,236 | 50,237 | 50,238 |

| | | Compound represented by the formula (1) | | | | | | | | | | | |
|---|---|---|---|---|---|---|---|---|---|---|---|---|---|
| | | 1-114 | 1-115 | 1-116 | 1-117 | 1-118 | 1-119 | 1-120 | 1-121 | 1-122 | 1-123 | 1-124 | 1-125 |
| Compound represented by the formula (2) | 2-56 | 48,889 | 48,890 | 48,891 | 48,892 | 48,893 | 48,894 | 48,895 | 48,896 | 48,897 | 48,898 | 48,899 | 48,900 |
| | 2-57 | 48,914 | 48,915 | 48,916 | 48,917 | 48,918 | 48,919 | 48,920 | 48,921 | 48,922 | 48,923 | 48,924 | 48,925 |
| | 2-58 | 48,939 | 48,940 | 48,941 | 48,942 | 48,943 | 48,944 | 48,945 | 48,946 | 48,947 | 48,948 | 48,949 | 48,950 |
| | 2-59 | 48,964 | 48,965 | 48,966 | 48,967 | 48,968 | 48,969 | 48,970 | 48,971 | 48,972 | 48,973 | 48,974 | 48,975 |
| | 2-60 | 48,989 | 48,990 | 48,991 | 48,992 | 48,993 | 48,994 | 48,995 | 48,996 | 48,997 | 48,998 | 48,999 | 49,000 |
| | 2-61 | 49,014 | 49,015 | 49,016 | 49,017 | 49,018 | 49,019 | 49,020 | 49,021 | 49,022 | 49,023 | 49,024 | 49,025 |
| | 2-62 | 49,039 | 49,040 | 49,041 | 49,042 | 49,043 | 49,044 | 49,045 | 49,046 | 49,047 | 49,048 | 49,049 | 49,050 |
| | 2-63 | 49,064 | 49,065 | 49,066 | 49,067 | 49,068 | 49,069 | 49,070 | 49,071 | 49,072 | 49,073 | 49,074 | 49,075 |
| | 2-64 | 49,089 | 49,090 | 49,091 | 49,092 | 49,093 | 49,094 | 49,095 | 49,096 | 49,097 | 49,098 | 49,099 | 49,100 |
| | 2-65 | 49,114 | 49,115 | 49,116 | 49,117 | 49,118 | 49,119 | 49,120 | 49,121 | 49,122 | 49,123 | 49,124 | 49,125 |
| | 2-66 | 49,139 | 49,140 | 49,141 | 49,142 | 49,143 | 49,144 | 49,145 | 49,146 | 49,147 | 49,148 | 49,149 | 49,150 |
| | 2-67 | 49,164 | 49,165 | 49,166 | 49,167 | 49,168 | 49,169 | 49,170 | 49,171 | 49,172 | 49,173 | 49,174 | 49,175 |
| | 2-68 | 49,189 | 49,190 | 49,191 | 49,192 | 49,193 | 49,194 | 49,195 | 49,196 | 49,197 | 49,198 | 49,199 | 49,200 |
| | 2-69 | 49,214 | 49,215 | 49,216 | 49,217 | 49,218 | 49,219 | 49,220 | 49,221 | 49,222 | 49,223 | 49,224 | 49,225 |
| | 2-70 | 49,239 | 49,240 | 49,241 | 49,242 | 49,243 | 49,244 | 49,245 | 49,246 | 49,247 | 49,248 | 49,249 | 49,250 |
| | 2-71 | 49,264 | 49,265 | 49,266 | 49,267 | 49,268 | 49,269 | 49,270 | 49,271 | 49,272 | 49,273 | 49,274 | 49,275 |
| | 2-72 | 49,289 | 49,290 | 49,291 | 49,292 | 49,293 | 49,294 | 49,295 | 49,296 | 49,297 | 49,298 | 49,299 | 49,300 |
| | 2-73 | 49,314 | 49,315 | 49,316 | 49,317 | 49,318 | 49,319 | 49,320 | 49,321 | 49,322 | 49,323 | 49,324 | 49,325 |
| | 2-74 | 49,339 | 49,340 | 49,341 | 49,342 | 49,343 | 49,344 | 49,345 | 49,346 | 49,347 | 49,348 | 49,349 | 49,350 |
| | 2-75 | 49,364 | 49,365 | 49,366 | 49,367 | 49,368 | 49,369 | 49,370 | 49,371 | 49,372 | 49,373 | 49,374 | 49,375 |
| | 2-76 | 49,389 | 49,390 | 49,391 | 49,392 | 49,393 | 49,394 | 49,395 | 49,396 | 49,397 | 49,398 | 49,399 | 49,400 |
| | 2-77 | 49,414 | 49,415 | 49,416 | 49,417 | 49,418 | 49,419 | 49,420 | 49,421 | 49,422 | 49,423 | 49,424 | 49,425 |
| | 2-78 | 49,439 | 49,440 | 49,441 | 49,442 | 49,443 | 49,444 | 49,445 | 49,446 | 49,447 | 49,448 | 49,449 | 49,450 |
| | 2-79 | 49,464 | 49,465 | 49,466 | 49,467 | 49,468 | 49,469 | 49,470 | 49,471 | 49,472 | 49,473 | 49,474 | 49,475 |
| | 2-80 | 49,489 | 49,490 | 49,491 | 49,492 | 49,493 | 49,494 | 49,495 | 49,496 | 49,497 | 49,498 | 49,499 | 49,500 |
| | 2-81 | 49,514 | 49,515 | 49,516 | 49,517 | 49,518 | 49,519 | 49,520 | 49,521 | 49,522 | 49,523 | 49,524 | 49,525 |

TABLE 38-continued

| | | | | | | | | | | | | |
|---|---|---|---|---|---|---|---|---|---|---|---|---|
| 2-82 | 49,539 | 49,540 | 49,541 | 49,542 | 49,543 | 49,544 | 49,545 | 49,546 | 49,547 | 49,548 | 49,549 | 49,550 |
| 2-83 | 49,564 | 49,565 | 49,566 | 49,567 | 49,568 | 49,569 | 49,570 | 49,571 | 49,572 | 49,573 | 49,574 | 49,575 |
| 2-84 | 49,589 | 49,590 | 49,591 | 49,592 | 49,593 | 49,594 | 49,595 | 49,596 | 49,597 | 49,598 | 49,599 | 49,600 |
| 2-85 | 49,614 | 49,615 | 49,616 | 49,617 | 49,618 | 49,619 | 49,620 | 49,621 | 49,622 | 49,623 | 49,624 | 49,625 |
| 2-86 | 49,639 | 49,640 | 49,641 | 49,642 | 49,643 | 49,644 | 49,645 | 49,646 | 49,647 | 49,648 | 49,649 | 49,650 |
| 2-87 | 49,664 | 49,665 | 49,666 | 49,667 | 49,668 | 49,669 | 49,670 | 49,671 | 49,672 | 49,673 | 49,674 | 49,675 |
| 2-88 | 49,689 | 49,690 | 49,691 | 49,692 | 49,693 | 49,694 | 49,695 | 49,696 | 49,697 | 49,698 | 49,699 | 49,700 |
| 2-89 | 49,714 | 49,715 | 49,716 | 49,717 | 49,718 | 49,719 | 49,720 | 49,721 | 49,722 | 49,723 | 49,724 | 49,725 |
| 2-90 | 49,739 | 49,740 | 49,741 | 49,742 | 49,743 | 49,744 | 49,745 | 49,746 | 49,747 | 49,748 | 49,749 | 49,750 |
| 2-91 | 49,764 | 49,765 | 49,766 | 49,767 | 49,768 | 49,769 | 49,770 | 49,771 | 49,772 | 49,773 | 49,774 | 49,775 |
| 2-92 | 49,789 | 49,790 | 49,791 | 49,792 | 49,793 | 49,794 | 49,795 | 49,796 | 49,797 | 49,798 | 49,799 | 49,800 |
| 2-93 | 49,814 | 49,815 | 49,816 | 49,817 | 49,818 | 49,819 | 49,820 | 49,821 | 49,822 | 49,823 | 49,824 | 49,825 |
| 2-94 | 49,839 | 49,840 | 49,841 | 49,842 | 49,843 | 49,844 | 49,845 | 49,846 | 49,847 | 49,848 | 49,849 | 49,850 |
| 2-95 | 49,864 | 49,865 | 49,866 | 49,867 | 49,868 | 49,869 | 49,870 | 49,871 | 49,872 | 49,873 | 49,874 | 49,875 |
| 2-96 | 49,889 | 49,890 | 49,891 | 49,892 | 49,893 | 49,894 | 49,895 | 49,896 | 49,897 | 49,898 | 49,899 | 49,900 |
| 2-97 | 49,914 | 49,915 | 49,916 | 49,917 | 49,918 | 49,919 | 49,920 | 49,921 | 49,922 | 49,923 | 49,924 | 49,925 |
| 2-98 | 49,939 | 49,940 | 49,941 | 49,942 | 49,943 | 49,944 | 49,945 | 49,946 | 49,947 | 49,948 | 49,949 | 49,950 |
| 2-99 | 49,964 | 49,965 | 49,966 | 49,967 | 49,968 | 49,969 | 49,970 | 49,971 | 49,972 | 49,973 | 49,974 | 49,975 |
| 2-100 | 49,989 | 49,990 | 49,991 | 49,992 | 49,993 | 49,994 | 49,995 | 49,996 | 49,997 | 49,998 | 49,999 | 50,000 |
| 2-101 | 50,014 | 50,015 | 50,016 | 50,017 | 50,018 | 50,019 | 50,020 | 50,021 | 50,022 | 50,023 | 50,024 | 50,025 |
| 2-102 | 50,039 | 50,040 | 50,041 | 50,042 | 50,043 | 50,044 | 50,045 | 50,046 | 50,047 | 50,048 | 50,049 | 50,050 |
| 2-103 | 50,064 | 50,065 | 50,066 | 50,067 | 50,068 | 50,069 | 50,070 | 50,071 | 50,072 | 50,073 | 50,074 | 50,075 |
| 2-104 | 50,089 | 50,090 | 50,091 | 50,092 | 50,093 | 50,094 | 50,095 | 50,096 | 50,097 | 50,098 | 50,099 | 50,100 |
| 2-105 | 50,114 | 50,115 | 50,116 | 50,117 | 50,118 | 50,119 | 50,120 | 50,121 | 50,122 | 50,123 | 50,124 | 50,125 |
| 2-106 | 50,139 | 50,140 | 50,141 | 50,142 | 50,143 | 50,144 | 50,145 | 50,146 | 50,147 | 50,148 | 50,149 | 50,150 |
| 2-107 | 50,164 | 50,165 | 50,166 | 50,167 | 50,168 | 50,169 | 50,170 | 50,171 | 50,172 | 50,173 | 50,174 | 50,175 |
| 2-108 | 50,189 | 50,190 | 50,191 | 50,192 | 50,193 | 50,194 | 50,195 | 50,196 | 50,197 | 50,198 | 50,199 | 50,200 |
| 2-109 | 50,214 | 50,215 | 50,216 | 50,217 | 50,218 | 50,219 | 50,220 | 50,221 | 50,222 | 50,223 | 50,224 | 50,225 |
| 2-110 | 50,239 | 50,240 | 50,241 | 50,242 | 50,243 | 50,244 | 50,245 | 50,246 | 50,247 | 50,248 | 50,249 | 50,250 |

TABLE 39

| | | Compound represented by the formula (1) | | | | | | | | | | | | |
|---|---|---|---|---|---|---|---|---|---|---|---|---|---|---|
| | | 1-101 | 1-102 | 1-103 | 1-104 | 1-105 | 1-106 | 1-107 | 1-108 | 1-109 | 1-110 | 1-111 | 1-112 | 1-113 |
| Compound represented by the formula (2) | 2-111 | 50,251 | 50,252 | 50,253 | 50,254 | 50,255 | 50,256 | 50,257 | 50,258 | 50,259 | 50,260 | 50,261 | 50,262 | 50,263 |
| | 2-112 | 50,276 | 50,277 | 50,278 | 50,279 | 50,280 | 50,281 | 50,282 | 50,283 | 50,284 | 50,285 | 50,286 | 50,287 | 50,288 |
| | 2-113 | 50,301 | 50,302 | 50,303 | 50,304 | 50,305 | 50,306 | 50,307 | 50,308 | 50,309 | 50,310 | 50,311 | 50,312 | 50,313 |
| | 2-114 | 50,326 | 50,327 | 50,328 | 50,329 | 50,330 | 50,331 | 50,332 | 50,333 | 50,334 | 50,335 | 50,336 | 50,337 | 50,338 |
| | 2-115 | 50,351 | 50,352 | 50,353 | 50,354 | 50,355 | 50,356 | 50,357 | 50,358 | 50,359 | 50,360 | 50,361 | 50,362 | 50,363 |
| | 2-116 | 50,376 | 50,377 | 50,378 | 50,379 | 50,380 | 50,381 | 50,382 | 50,383 | 50,384 | 50,385 | 50,386 | 50,387 | 50,388 |
| | 2-117 | 50,401 | 50,402 | 50,403 | 50,404 | 50,405 | 50,406 | 50,407 | 50,408 | 50,409 | 50,410 | 50,411 | 50,412 | 50,413 |
| | 2-118 | 50,426 | 50,427 | 50,428 | 50,429 | 50,430 | 50,431 | 50,432 | 50,433 | 50,434 | 50,435 | 50,436 | 50,437 | 50,438 |
| | 2-119 | 50,451 | 50,452 | 50,453 | 50,454 | 50,455 | 50,456 | 50,457 | 50,458 | 50,459 | 50,460 | 50,461 | 50,462 | 50,463 |
| | 2-120 | 50,476 | 50,477 | 50,478 | 50,479 | 50,480 | 50,481 | 50,482 | 50,483 | 50,484 | 50,485 | 50,486 | 50,487 | 50,488 |
| | 2-121 | 50,501 | 50,502 | 50,503 | 50,504 | 50,505 | 50,506 | 50,507 | 50,508 | 50,509 | 50,510 | 50,511 | 50,512 | 50,513 |
| | 2-122 | 50,526 | 50,527 | 50,528 | 50,529 | 50,530 | 50,531 | 50,532 | 50,533 | 50,534 | 50,535 | 50,536 | 50,537 | 50,538 |
| | 2-123 | 50,551 | 50,552 | 50,553 | 50,554 | 50,555 | 50,556 | 50,557 | 50,558 | 50,559 | 50,560 | 50,561 | 50,562 | 50,563 |
| | 2-124 | 50,576 | 50,577 | 50,578 | 50,579 | 50,580 | 50,581 | 50,582 | 50,583 | 50,584 | 50,585 | 50,586 | 50,587 | 50,588 |
| | 2-125 | 50,601 | 50,602 | 50,603 | 50,604 | 50,605 | 50,606 | 50,607 | 50,608 | 50,609 | 50,610 | 50,611 | 50,612 | 50,613 |
| | 2-126 | 50,626 | 50,627 | 50,628 | 50,629 | 50,630 | 50,631 | 50,632 | 50,633 | 50,634 | 50,635 | 50,636 | 50,637 | 50,638 |
| | 2-127 | 50,651 | 50,652 | 50,653 | 50,654 | 50,655 | 50,656 | 50,657 | 50,658 | 50,659 | 50,660 | 50,661 | 50,662 | 50,663 |
| | 2-128 | 50,676 | 50,677 | 50,678 | 50,679 | 50,680 | 50,681 | 50,682 | 50,683 | 50,684 | 50,685 | 50,686 | 50,687 | 50,688 |
| | 2-129 | 50,701 | 50,702 | 50,703 | 50,704 | 50,705 | 50,706 | 50,707 | 50,708 | 50,709 | 50,710 | 50,711 | 50,712 | 50,713 |
| | 2-130 | 50,726 | 50,727 | 50,728 | 50,729 | 50,730 | 50,731 | 50,732 | 50,733 | 50,734 | 50,735 | 50,736 | 50,737 | 50,738 |
| | 2-131 | 50,751 | 50,752 | 50,753 | 50,754 | 50,755 | 50,756 | 50,757 | 50,758 | 50,759 | 50,760 | 50,761 | 50,762 | 50,763 |
| | 2-132 | 50,776 | 50,777 | 50,778 | 50,779 | 50,780 | 50,781 | 50,782 | 50,783 | 50,784 | 50,785 | 50,786 | 50,787 | 50,788 |
| | 2-133 | 50,801 | 50,802 | 50,803 | 50,804 | 50,805 | 50,806 | 50,807 | 50,808 | 50,809 | 50,810 | 50,811 | 50,812 | 50,813 |
| | 2-134 | 50,826 | 50,827 | 50,828 | 50,829 | 50,830 | 50,831 | 50,832 | 50,833 | 50,834 | 50,835 | 50,836 | 50,837 | 50,838 |
| | 2-135 | 50,851 | 50,852 | 50,853 | 50,854 | 50,855 | 50,856 | 50,857 | 50,858 | 50,859 | 50,860 | 50,861 | 50,862 | 50,863 |
| | 2-136 | 50,876 | 50,877 | 50,878 | 50,879 | 50,880 | 50,881 | 50,882 | 50,883 | 50,884 | 50,885 | 50,886 | 50,887 | 50,888 |
| | 2-137 | 50,901 | 50,902 | 50,903 | 50,904 | 50,905 | 50,906 | 50,907 | 50,908 | 50,909 | 50,910 | 50,911 | 50,912 | 50,913 |
| | 2-138 | 50,926 | 50,927 | 50,928 | 50,929 | 50,930 | 50,931 | 50,932 | 50,933 | 50,934 | 50,935 | 50,936 | 50,937 | 50,938 |
| | 2-139 | 50,951 | 50,952 | 50,953 | 50,954 | 50,955 | 50,956 | 50,957 | 50,958 | 50,959 | 50,960 | 50,961 | 50,962 | 50,963 |
| | 2-140 | 50,976 | 50,977 | 50,978 | 50,979 | 50,980 | 50,981 | 50,982 | 50,983 | 50,984 | 50,985 | 50,986 | 50,987 | 50,988 |
| | 2-141 | 51,001 | 51,002 | 51,003 | 51,004 | 51,005 | 51,006 | 51,007 | 51,008 | 51,009 | 51,010 | 51,011 | 51,012 | 51,013 |
| | 2-142 | 51,026 | 51,027 | 51,028 | 51,029 | 51,030 | 51,031 | 51,032 | 51,033 | 51,034 | 51,035 | 51,036 | 51,037 | 51,038 |
| | 2-143 | 51,051 | 51,052 | 51,053 | 51,054 | 51,055 | 51,056 | 51,057 | 51,058 | 51,059 | 51,060 | 51,061 | 51,062 | 51,063 |
| | 2-144 | 51,076 | 51,077 | 51,078 | 51,079 | 51,080 | 51,081 | 51,082 | 51,083 | 51,084 | 51,085 | 51,086 | 51,087 | 51,088 |
| | 2-145 | 51,101 | 51,102 | 51,103 | 51,104 | 51,105 | 51,106 | 51,107 | 51,108 | 51,109 | 51,110 | 51,111 | 51,112 | 51,113 |
| | 2-146 | 51,126 | 51,127 | 51,128 | 51,129 | 51,130 | 51,131 | 51,132 | 51,133 | 51,134 | 51,135 | 51,136 | 51,137 | 51,138 |
| | 2-147 | 51,151 | 51,152 | 51,153 | 51,154 | 51,155 | 51,156 | 51,157 | 51,158 | 51,159 | 51,160 | 51,161 | 51,162 | 51,163 |
| | 2-148 | 51,176 | 51,177 | 51,178 | 51,179 | 51,180 | 51,181 | 51,182 | 51,183 | 51,184 | 51,185 | 51,186 | 51,187 | 51,188 |
| | 2-149 | 51,201 | 51,202 | 51,203 | 51,204 | 51,205 | 51,206 | 51,207 | 51,208 | 51,209 | 51,210 | 51,211 | 51,212 | 51,213 |
| | 2-150 | 51,226 | 51,227 | 51,228 | 51,229 | 51,230 | 51,231 | 51,232 | 51,233 | 51,234 | 51,235 | 51,236 | 51,237 | 51,238 |
| | 2-151 | 51,251 | 51,252 | 51,253 | 51,254 | 51,255 | 51,256 | 51,257 | 51,258 | 51,259 | 51,260 | 51,261 | 51,262 | 51,263 |

TABLE 39-continued

| | | | | | | | | | | | | | |
|---|---|---|---|---|---|---|---|---|---|---|---|---|---|
| 2-152 | 51,276 | 51,277 | 51,278 | 51,279 | 51,280 | 51,281 | 51,282 | 51,283 | 51,284 | 51,285 | 51,286 | 51,287 | 51,288 |
| 2-153 | 51,301 | 51,302 | 51,303 | 51,304 | 51,305 | 51,306 | 51,307 | 51,308 | 51,309 | 51,310 | 51,311 | 51,312 | 51,313 |
| 2-154 | 51,326 | 51,327 | 51,328 | 51,329 | 51,330 | 51,331 | 51,332 | 51,333 | 51,334 | 51,335 | 51,336 | 51,337 | 51,338 |
| 2-155 | 51,351 | 51,352 | 51,353 | 51,354 | 51,355 | 51,356 | 51,357 | 51,358 | 51,359 | 51,360 | 51,361 | 51,362 | 51,363 |
| 2-156 | 51,376 | 51,377 | 51,378 | 51,379 | 51,380 | 51,381 | 51,382 | 51,383 | 51,384 | 51,385 | 51,386 | 51,387 | 51,388 |
| 2-157 | 51,401 | 51,402 | 51,403 | 51,404 | 51,405 | 51,406 | 51,407 | 51,408 | 51,409 | 51,410 | 51,411 | 51,412 | 51,413 |
| 2-158 | 51,426 | 51,427 | 51,428 | 51,429 | 51,430 | 51,431 | 51,432 | 51,433 | 51,434 | 51,435 | 51,436 | 51,437 | 51,438 |
| 2-159 | 51,451 | 51,452 | 51,453 | 51,454 | 51,455 | 51,456 | 51,457 | 51,458 | 51,459 | 51,460 | 51,461 | 51,462 | 51,463 |
| 2-160 | 51,476 | 51,477 | 51,478 | 51,479 | 51,480 | 51,481 | 51,482 | 51,483 | 51,484 | 51,485 | 51,486 | 51,487 | 51,488 |
| 2-161 | 51,501 | 51,502 | 51,503 | 51,504 | 51,505 | 51,506 | 51,507 | 51,508 | 51,509 | 51,510 | 51,511 | 51,512 | 51,513 |
| 2-162 | 51,526 | 51,527 | 51,528 | 51,529 | 51,530 | 51,531 | 51,532 | 51,533 | 51,534 | 51,535 | 51,536 | 51,537 | 51,538 |
| 2-163 | 51,551 | 51,552 | 51,553 | 51,554 | 51,555 | 51,556 | 51,557 | 51,558 | 51,559 | 51,560 | 51,561 | 51,562 | 51,563 |
| 2-164 | 51,576 | 51,577 | 51,578 | 51,579 | 51,580 | 51,581 | 51,582 | 51,583 | 51,584 | 51,585 | 51,586 | 51,587 | 51,588 |
| 2-165 | 51,601 | 51,602 | 51,603 | 51,604 | 51,605 | 51,606 | 51,607 | 51,608 | 51,609 | 51,610 | 51,611 | 51,612 | 51,613 |

| | | Compound represented by the formula (1) | | | | | | | | | | | |
|---|---|---|---|---|---|---|---|---|---|---|---|---|---|
| | | 1-114 | 1-115 | 1-116 | 1-117 | 1-118 | 1-119 | 1-120 | 1-121 | 1-122 | 1-123 | 1-124 | 1-125 |
| Compound represented by the formula (2) | 2-111 | 50,264 | 50,265 | 50,266 | 50,267 | 50,268 | 50,269 | 50,270 | 50,271 | 50,272 | 50,273 | 50,274 | 50,275 |
| | 2-112 | 50,289 | 50,290 | 50,291 | 50,292 | 50,293 | 50,294 | 50,295 | 50,296 | 50,297 | 50,298 | 50,299 | 50,300 |
| | 2-113 | 50,314 | 50,315 | 50,316 | 50,317 | 50,318 | 50,319 | 50,320 | 50,321 | 50,322 | 50,323 | 50,324 | 50,325 |
| | 2-114 | 50,339 | 50,340 | 50,341 | 50,342 | 50,343 | 50,344 | 50,345 | 50,346 | 50,347 | 50,348 | 50,349 | 50,350 |
| | 2-115 | 50,364 | 50,365 | 50,366 | 50,367 | 50,368 | 50,369 | 50,370 | 50,371 | 50,372 | 50,373 | 50,374 | 50,375 |
| | 2-116 | 50,389 | 50,390 | 50,391 | 50,392 | 50,393 | 50,394 | 50,395 | 50,396 | 50,397 | 50,398 | 50,399 | 50,400 |
| | 2-117 | 50,414 | 50,415 | 50,416 | 50,417 | 50,418 | 50,419 | 50,420 | 50,421 | 50,422 | 50,423 | 50,424 | 50,425 |
| | 2-118 | 50,439 | 50,440 | 50,441 | 50,442 | 50,443 | 50,444 | 50,445 | 50,446 | 50,447 | 50,448 | 50,449 | 50,450 |
| | 2-119 | 50,464 | 50,465 | 50,466 | 50,467 | 50,468 | 50,469 | 50,470 | 50,471 | 50,472 | 50,473 | 50,474 | 50,475 |
| | 2-120 | 50,489 | 50,490 | 50,491 | 50,492 | 50,493 | 50,494 | 50,495 | 50,496 | 50,497 | 50,498 | 50,499 | 50,500 |
| | 2-121 | 50,514 | 50,515 | 50,516 | 50,517 | 50,518 | 50,519 | 50,520 | 50,521 | 50,522 | 50,523 | 50,524 | 50,525 |
| | 2-122 | 50,539 | 50,540 | 50,541 | 50,542 | 50,543 | 50,544 | 50,545 | 50,546 | 50,547 | 50,548 | 50,549 | 50,550 |
| | 2-123 | 50,564 | 50,565 | 50,566 | 50,567 | 50,568 | 50,569 | 50,570 | 50,571 | 50,572 | 50,573 | 50,574 | 50,575 |
| | 2-124 | 50,589 | 50,590 | 50,591 | 50,592 | 50,593 | 50,594 | 50,595 | 50,596 | 50,597 | 50,598 | 50,599 | 50,600 |
| | 2-125 | 50,614 | 50,615 | 50,616 | 50,617 | 50,618 | 50,619 | 50,620 | 50,621 | 50,622 | 50,623 | 50,624 | 50,625 |
| | 2-126 | 50,639 | 50,640 | 50,641 | 50,642 | 50,643 | 50,644 | 50,645 | 50,646 | 50,647 | 50,648 | 50,649 | 50,650 |
| | 2-127 | 50,664 | 50,665 | 50,666 | 50,667 | 50,668 | 50,669 | 50,670 | 50,671 | 50,672 | 50,673 | 50,674 | 50,675 |
| | 2-128 | 50,689 | 50,690 | 50,691 | 50,692 | 50,693 | 50,694 | 50,695 | 50,696 | 50,697 | 50,698 | 50,699 | 50,700 |
| | 2-129 | 50,714 | 50,715 | 50,716 | 50,717 | 50,718 | 50,719 | 50,720 | 50,721 | 50,722 | 50,723 | 50,724 | 50,725 |
| | 2-130 | 50,739 | 50,740 | 50,741 | 50,742 | 50,743 | 50,744 | 50,745 | 50,746 | 50,747 | 50,748 | 50,749 | 50,750 |
| | 2-131 | 50,764 | 50,765 | 50,766 | 50,767 | 50,768 | 50,769 | 50,770 | 50,771 | 50,772 | 50,773 | 50,774 | 50,775 |
| | 2-132 | 50,789 | 50,790 | 50,791 | 50,792 | 50,793 | 50,794 | 50,795 | 50,796 | 50,797 | 50,798 | 50,799 | 50,800 |
| | 2-133 | 50,814 | 50,815 | 50,816 | 50,817 | 50,818 | 50,819 | 50,820 | 50,821 | 50,822 | 50,823 | 50,824 | 50,825 |
| | 2-134 | 50,839 | 50,840 | 50,841 | 50,842 | 50,843 | 50,844 | 50,845 | 50,846 | 50,847 | 50,848 | 50,849 | 50,850 |
| | 2-135 | 50,864 | 50,865 | 50,866 | 50,867 | 50,868 | 50,869 | 50,870 | 50,871 | 50,872 | 50,873 | 50,874 | 50,875 |
| | 2-136 | 50,889 | 50,890 | 50,891 | 50,892 | 50,893 | 50,894 | 50,895 | 50,896 | 50,897 | 50,898 | 50,899 | 50,900 |
| | 2-137 | 50,914 | 50,915 | 50,916 | 50,917 | 50,918 | 50,919 | 50,920 | 50,921 | 50,922 | 50,923 | 50,924 | 50,925 |
| | 2-138 | 50,939 | 50,940 | 50,941 | 50,942 | 50,943 | 50,944 | 50,945 | 50,946 | 50,947 | 50,948 | 50,949 | 50,950 |
| | 2-139 | 50,964 | 50,965 | 50,966 | 50,967 | 50,968 | 50,969 | 50,970 | 50,971 | 50,972 | 50,973 | 50,974 | 50,975 |
| | 2-140 | 50,989 | 50,990 | 50,991 | 50,992 | 50,993 | 50,994 | 50,995 | 50,996 | 50,997 | 50,998 | 50,999 | 51,000 |
| | 2-141 | 51,014 | 51,015 | 51,016 | 51,017 | 51,018 | 51,019 | 51,020 | 51,021 | 51,022 | 51,023 | 51,024 | 51,025 |
| | 2-142 | 51,039 | 51,040 | 51,041 | 51,042 | 51,043 | 51,044 | 51,045 | 51,046 | 51,047 | 51,048 | 51,049 | 51,050 |
| | 2-143 | 51,064 | 51,065 | 51,066 | 51,067 | 51,068 | 51,069 | 51,070 | 51,071 | 51,072 | 51,073 | 51,074 | 51,075 |
| | 2-144 | 51,089 | 51,090 | 51,091 | 51,092 | 51,093 | 51,094 | 51,095 | 51,096 | 51,097 | 51,098 | 51,099 | 51,100 |
| | 2-145 | 51,114 | 51,115 | 51,116 | 51,117 | 51,118 | 51,119 | 51,120 | 51,121 | 51,122 | 51,123 | 51,124 | 51,125 |
| | 2-146 | 51,139 | 51,140 | 51,141 | 51,142 | 51,143 | 51,144 | 51,145 | 51,146 | 51,147 | 51,148 | 51,149 | 51,150 |
| | 2-147 | 51,164 | 51,165 | 51,166 | 51,167 | 51,168 | 51,169 | 51,170 | 51,171 | 51,172 | 51,173 | 51,174 | 51,175 |
| | 2-148 | 51,189 | 51,190 | 51,191 | 51,192 | 51,193 | 51,194 | 51,195 | 51,196 | 51,197 | 51,198 | 51,199 | 51,200 |
| | 2-149 | 51,214 | 51,215 | 51,216 | 51,217 | 51,218 | 51,219 | 51,220 | 51,221 | 51,222 | 51,223 | 51,224 | 51,225 |
| | 2-150 | 51,239 | 51,240 | 51,241 | 51,242 | 51,243 | 51,244 | 51,245 | 51,246 | 51,247 | 51,248 | 51,249 | 51,250 |
| | 2-151 | 51,264 | 51,265 | 51,266 | 51,267 | 51,268 | 51,269 | 51,270 | 51,271 | 51,272 | 51,273 | 51,274 | 51,275 |
| | 2-152 | 51,289 | 51,290 | 51,291 | 51,292 | 51,293 | 51,294 | 51,295 | 51,296 | 51,297 | 51,298 | 51,299 | 51,300 |
| | 2-153 | 51,314 | 51,315 | 51,316 | 51,317 | 51,318 | 51,319 | 51,320 | 51,321 | 51,322 | 51,323 | 51,324 | 51,325 |
| | 2-154 | 51,339 | 51,340 | 51,341 | 51,342 | 51,343 | 51,344 | 51,345 | 51,346 | 51,347 | 51,348 | 51,349 | 51,350 |
| | 2-155 | 51,364 | 51,365 | 51,366 | 51,367 | 51,368 | 51,369 | 51,370 | 51,371 | 51,372 | 51,373 | 51,374 | 51,375 |
| | 2-156 | 51,389 | 51,390 | 51,391 | 51,392 | 51,393 | 51,394 | 51,395 | 51,396 | 51,397 | 51,398 | 51,399 | 51,400 |
| | 2-157 | 51,414 | 51,415 | 51,416 | 51,417 | 51,418 | 51,419 | 51,420 | 51,421 | 51,422 | 51,423 | 51,424 | 51,425 |
| | 2-158 | 51,439 | 51,440 | 51,441 | 51,442 | 51,443 | 51,444 | 51,445 | 51,446 | 51,447 | 51,448 | 51,449 | 51,450 |
| | 2-159 | 51,464 | 51,465 | 51,466 | 51,467 | 51,468 | 51,469 | 51,470 | 51,471 | 51,472 | 51,473 | 51,474 | 51,475 |
| | 2-160 | 51,489 | 51,490 | 51,491 | 51,492 | 51,493 | 51,494 | 51,495 | 51,496 | 51,497 | 51,498 | 51,499 | 51,500 |
| | 2-161 | 51,514 | 51,515 | 51,516 | 51,517 | 51,518 | 51,519 | 51,520 | 51,521 | 51,522 | 51,523 | 51,524 | 51,525 |
| | 2-162 | 51,539 | 51,540 | 51,541 | 51,542 | 51,543 | 51,544 | 51,545 | 51,546 | 51,547 | 51,548 | 51,549 | 51,550 |
| | 2-163 | 51,564 | 51,565 | 51,566 | 51,567 | 51,568 | 51,569 | 51,570 | 51,571 | 51,572 | 51,573 | 51,574 | 51,575 |
| | 2-164 | 51,589 | 51,590 | 51,591 | 51,592 | 51,593 | 51,594 | 51,595 | 51,596 | 51,597 | 51,598 | 51,599 | 51,600 |
| | 2-165 | 51,614 | 51,615 | 51,616 | 51,617 | 51,618 | 51,619 | 51,620 | 51,621 | 51,622 | 51,623 | 51,624 | 51,625 |

TABLE 40

| | | Compound represented by the formula (1) | | | | | | | | | | | | |
|---|---|---|---|---|---|---|---|---|---|---|---|---|---|---|
| | | 1-101 | 1-102 | 1-103 | 1-104 | 1-105 | 1-106 | 1-107 | 1-108 | 1-109 | 1-110 | 1-111 | 1-112 | 1-113 |
| Compound | 2-166 | 51,626 | 51,627 | 51,628 | 51,629 | 51,630 | 51,631 | 51,632 | 51,633 | 51,634 | 51,635 | 51,636 | 51,637 | 51,638 |
| represented | 2-167 | 51,651 | 51,652 | 51,653 | 51,654 | 51,655 | 51,656 | 51,657 | 51,658 | 51,659 | 51,660 | 51,661 | 51,662 | 51,663 |
| by the | 2-168 | 51,676 | 51,677 | 51,678 | 51,679 | 51,680 | 51,681 | 51,682 | 51,683 | 51,684 | 51,685 | 51,686 | 51,687 | 51,688 |
| formula (2) | 2-169 | 51,701 | 51,702 | 51,703 | 51,704 | 51,705 | 51,706 | 51,707 | 51,708 | 51,709 | 51,710 | 51,711 | 51,712 | 51,713 |
| | 2-170 | 51,726 | 51,727 | 51,728 | 51,729 | 51,730 | 51,731 | 51,732 | 51,733 | 51,734 | 51,735 | 51,736 | 51,737 | 51,738 |
| | 2-171 | 51,751 | 51,752 | 51,753 | 51,754 | 51,755 | 51,756 | 51,757 | 51,758 | 51,759 | 51,760 | 51,761 | 51,762 | 51,763 |
| | 2-172 | 51,776 | 51,777 | 51,778 | 51,779 | 51,780 | 51,781 | 51,782 | 51,783 | 51,784 | 51,785 | 51,786 | 51,787 | 51,788 |
| | 2-173 | 51,801 | 51,802 | 51,803 | 51,804 | 51,805 | 51,806 | 51,807 | 51,808 | 51,809 | 51,810 | 51,811 | 51,812 | 51,813 |
| | 2-174 | 51,826 | 51,827 | 51,828 | 51,829 | 51,830 | 51,831 | 51,832 | 51,833 | 51,834 | 51,835 | 51,836 | 51,837 | 51,838 |
| | 2-175 | 51,851 | 51,852 | 51,853 | 51,854 | 51,855 | 51,856 | 51,857 | 51,858 | 51,859 | 51,860 | 51,861 | 51,862 | 51,863 |
| | 2-176 | 51,876 | 51,877 | 51,878 | 51,879 | 51,880 | 51,881 | 51,882 | 51,883 | 51,884 | 51,885 | 51,886 | 51,887 | 51,888 |
| | 2-177 | 51,901 | 51,902 | 51,903 | 51,904 | 51,905 | 51,906 | 51,907 | 51,908 | 51,909 | 51,910 | 51,911 | 51,912 | 51,913 |
| | 2-178 | 51,926 | 51,927 | 51,928 | 51,929 | 51,930 | 51,931 | 51,932 | 51,933 | 51,934 | 51,935 | 51,936 | 51,937 | 51,938 |
| | 2-179 | 51,951 | 51,952 | 51,953 | 51,954 | 51,955 | 51,956 | 51,957 | 51,958 | 51,959 | 51,960 | 51,961 | 51,962 | 51,963 |
| | 2-180 | 51,976 | 51,977 | 51,978 | 51,979 | 51,980 | 51,981 | 51,982 | 51,983 | 51,984 | 51,985 | 51,986 | 51,987 | 51,988 |
| | 2-181 | 52,001 | 52,002 | 52,003 | 52,004 | 52,005 | 52,006 | 52,007 | 52,008 | 52,009 | 52,010 | 52,011 | 52,012 | 52,013 |
| | 2-182 | 52,026 | 52,027 | 52,028 | 52,029 | 52,030 | 52,031 | 52,032 | 52,033 | 52,034 | 52,035 | 52,036 | 52,037 | 52,038 |
| | 2-183 | 52,051 | 52,052 | 52,053 | 52,054 | 52,055 | 52,056 | 52,057 | 52,058 | 52,059 | 52,060 | 52,061 | 52,062 | 52,063 |
| | 2-184 | 52,076 | 52,077 | 52,078 | 52,079 | 52,080 | 52,081 | 52,082 | 52,083 | 52,084 | 52,085 | 52,086 | 52,087 | 52,088 |
| | 2-185 | 52,101 | 52,102 | 52,103 | 52,104 | 52,105 | 52,106 | 52,107 | 52,108 | 52,109 | 52,110 | 52,111 | 52,112 | 52,113 |
| | 2-186 | 52,126 | 52,127 | 52,128 | 52,129 | 52,130 | 52,131 | 52,132 | 52,133 | 52,134 | 52,135 | 52,136 | 52,137 | 52,138 |
| | 2-187 | 52,151 | 52,152 | 52,153 | 52,154 | 52,155 | 52,156 | 52,157 | 52,158 | 52,159 | 52,160 | 52,161 | 52,162 | 52,163 |
| | 2-188 | 52,176 | 52,177 | 52,178 | 52,179 | 52,180 | 52,181 | 52,182 | 52,183 | 52,184 | 52,185 | 52,186 | 52,187 | 52,188 |
| | 2-189 | 52,201 | 52,202 | 52,203 | 52,204 | 52,205 | 52,206 | 52,207 | 52,208 | 52,209 | 52,210 | 52,211 | 52,212 | 52,213 |
| | 2-190 | 52,226 | 52,227 | 52,228 | 52,229 | 52,230 | 52,231 | 52,232 | 52,233 | 52,234 | 52,235 | 52,236 | 52,237 | 52,238 |
| | 2-191 | 52,251 | 52,252 | 52,253 | 52,254 | 52,255 | 52,256 | 52,257 | 52,258 | 52,259 | 52,260 | 52,261 | 52,262 | 52,263 |
| | 2-192 | 52,276 | 52,277 | 52,278 | 52,279 | 52,280 | 52,281 | 52,282 | 52,283 | 52,284 | 52,285 | 52,286 | 52,287 | 52,288 |
| | 2-193 | 52,301 | 52,302 | 52,303 | 52,304 | 52,305 | 52,306 | 52,307 | 52,308 | 52,309 | 52,310 | 52,311 | 52,312 | 52,313 |
| | 2-194 | 52,326 | 52,327 | 52,328 | 52,329 | 52,330 | 52,331 | 52,332 | 52,333 | 52,334 | 52,335 | 52,336 | 52,337 | 52,338 |
| | 2-195 | 52,351 | 52,352 | 52,353 | 52,354 | 52,355 | 52,356 | 52,357 | 52,358 | 52,359 | 52,360 | 52,361 | 52,362 | 52,363 |
| | 2-196 | 52,376 | 52,377 | 52,378 | 52,379 | 52,380 | 52,381 | 52,382 | 52,383 | 52,384 | 52,385 | 52,386 | 52,387 | 52,388 |
| | 2-197 | 52,401 | 52,402 | 52,403 | 52,404 | 52,405 | 52,406 | 52,407 | 52,408 | 52,409 | 52,410 | 52,411 | 52,412 | 52,413 |
| | 2-198 | 52,426 | 52,427 | 52,428 | 52,429 | 52,430 | 52,431 | 52,432 | 52,433 | 52,434 | 52,435 | 52,436 | 52,437 | 52,438 |
| | 2-199 | 52,451 | 52,452 | 52,453 | 52,454 | 52,455 | 52,456 | 52,457 | 52,458 | 52,459 | 52,460 | 52,461 | 52,462 | 52,463 |
| | 2-200 | 52,476 | 52,477 | 52,478 | 52,479 | 52,480 | 52,481 | 52,482 | 52,483 | 52,484 | 52,485 | 52,486 | 52,487 | 52,488 |
| | 2-201 | 52,501 | 52,502 | 52,503 | 52,504 | 52,505 | 52,506 | 52,507 | 52,508 | 52,509 | 52,510 | 52,511 | 52,512 | 52,513 |
| | 2-202 | 52,526 | 52,527 | 52,528 | 52,529 | 52,530 | 52,531 | 52,532 | 52,533 | 52,534 | 52,535 | 52,536 | 52,537 | 52,538 |
| | 2-203 | 52,551 | 52,552 | 52,553 | 52,554 | 52,555 | 52,556 | 52,557 | 52,558 | 52,559 | 52,560 | 52,561 | 52,562 | 52,563 |
| | 2-204 | 52,576 | 52,577 | 52,578 | 52,579 | 52,580 | 52,581 | 52,582 | 52,583 | 52,584 | 52,585 | 52,586 | 52,587 | 52,588 |
| | 2-205 | 52,601 | 52,602 | 52,603 | 52,604 | 52,605 | 52,606 | 52,607 | 52,608 | 52,609 | 52,610 | 52,611 | 52,612 | 52,613 |
| | 2-206 | 52,626 | 52,627 | 52,628 | 52,629 | 52,630 | 52,631 | 52,632 | 52,633 | 52,634 | 52,635 | 52,636 | 52,637 | 52,638 |
| | 2-207 | 52,651 | 52,652 | 52,653 | 52,654 | 52,655 | 52,656 | 52,657 | 52,658 | 52,659 | 52,660 | 52,661 | 52,662 | 52,663 |
| | 2-208 | 52,676 | 52,677 | 52,678 | 52,679 | 52,680 | 52,681 | 52,682 | 52,683 | 52,684 | 52,685 | 52,686 | 52,687 | 52,688 |
| | 2-209 | 52,701 | 52,702 | 52,703 | 52,704 | 52,705 | 52,706 | 52,707 | 52,708 | 52,709 | 52,710 | 52,711 | 52,712 | 52,713 |
| | 2-210 | 52,726 | 52,727 | 52,728 | 52,729 | 52,730 | 52,731 | 52,732 | 52,733 | 52,734 | 52,735 | 52,736 | 52,737 | 52,738 |
| | 2-211 | 52,751 | 52,752 | 52,753 | 52,754 | 52,755 | 52,756 | 52,757 | 52,758 | 52,759 | 52,760 | 52,761 | 52,762 | 52,763 |
| | 2-212 | 52,776 | 52,777 | 52,778 | 52,779 | 52,780 | 52,781 | 52,782 | 52,783 | 52,784 | 52,785 | 52,786 | 52,787 | 52,788 |
| | 2-213 | 52,801 | 52,802 | 52,803 | 52,804 | 52,805 | 52,806 | 52,807 | 52,808 | 52,809 | 52,810 | 52,811 | 52,812 | 52,813 |
| | 2-214 | 52,826 | 52,827 | 52,828 | 52,829 | 52,830 | 52,831 | 52,832 | 52,833 | 52,834 | 52,835 | 52,836 | 52,837 | 52,838 |
| | 2-215 | 52,851 | 52,852 | 52,853 | 52,854 | 52,855 | 52,856 | 52,857 | 52,858 | 52,859 | 52,860 | 52,861 | 52,862 | 52,863 |
| | 2-216 | 52,876 | 52,877 | 52,878 | 52,879 | 52,880 | 52,881 | 52,882 | 52,883 | 52,884 | 52,885 | 52,886 | 52,887 | 52,888 |
| | 2-217 | 52,901 | 52,902 | 52,903 | 52,904 | 52,905 | 52,906 | 52,907 | 52,908 | 52,909 | 52,910 | 52,911 | 52,912 | 52,913 |
| | 2-218 | 52,926 | 52,927 | 52,928 | 52,929 | 52,930 | 52,931 | 52,932 | 52,933 | 52,934 | 52,935 | 52,936 | 52,937 | 52,938 |
| | 2-219 | 52,951 | 52,952 | 52,953 | 52,954 | 52,955 | 52,956 | 52,957 | 52,958 | 52,959 | 52,960 | 52,961 | 52,962 | 52,963 |
| | 2-220 | 52,976 | 52,977 | 52,978 | 52,979 | 52,980 | 52,981 | 52,982 | 52,983 | 52,984 | 52,985 | 52,986 | 52,987 | 52,988 |

| | | Compound represented by the formula (1) | | | | | | | | | | | |
|---|---|---|---|---|---|---|---|---|---|---|---|---|---|
| | | 1-114 | 1-115 | 1-116 | 1-117 | 1-118 | 1-119 | 1-120 | 1-121 | 1-122 | 1-123 | 1-124 | 1-125 |
| Compound | 2-166 | 51,639 | 51,640 | 51,641 | 51,642 | 51,643 | 51,644 | 51,645 | 51,646 | 51,647 | 51,648 | 51,649 | 51,650 |
| represented by the | 2-167 | 51,664 | 51,665 | 51,666 | 51,667 | 51,668 | 51,669 | 51,670 | 51,671 | 51,672 | 51,673 | 51,674 | 51,675 |
| formula (2) | 2-168 | 51,689 | 51,690 | 51,691 | 51,692 | 51,693 | 51,694 | 51,695 | 51,696 | 51,697 | 51,698 | 51,699 | 51,700 |
| | 2-169 | 51,714 | 51,715 | 51,716 | 51,717 | 51,718 | 51,719 | 51,720 | 51,721 | 51,722 | 51,723 | 51,724 | 51,725 |
| | 2-170 | 51,739 | 51,740 | 51,741 | 51,742 | 51,743 | 51,744 | 51,745 | 51,746 | 51,747 | 51,748 | 51,749 | 51,750 |
| | 2-171 | 51,764 | 51,765 | 51,766 | 51,767 | 51,768 | 51,769 | 51,770 | 51,771 | 51,772 | 51,773 | 51,774 | 51,775 |
| | 2-172 | 51,789 | 51,790 | 51,791 | 51,792 | 51,793 | 51,794 | 51,795 | 51,796 | 51,797 | 51,798 | 51,799 | 51,800 |
| | 2-173 | 51,814 | 51,815 | 51,816 | 51,817 | 51,818 | 51,819 | 51,820 | 51,821 | 51,822 | 51,823 | 51,824 | 51,825 |
| | 2-174 | 51,839 | 51,840 | 51,841 | 51,842 | 51,843 | 51,844 | 51,845 | 51,846 | 51,847 | 51,848 | 51,849 | 51,850 |
| | 2-175 | 51,864 | 51,865 | 51,866 | 51,867 | 51,868 | 51,869 | 51,870 | 51,871 | 51,872 | 51,873 | 51,874 | 51,875 |
| | 2-176 | 51,889 | 51,890 | 51,891 | 51,892 | 51,893 | 51,894 | 51,895 | 51,896 | 51,897 | 51,898 | 51,899 | 51,900 |
| | 2-177 | 51,914 | 51,915 | 51,916 | 51,917 | 51,918 | 51,919 | 51,920 | 51,921 | 51,922 | 51,923 | 51,924 | 51,925 |
| | 2-178 | 51,939 | 51,940 | 51,941 | 51,942 | 51,943 | 51,944 | 51,945 | 51,946 | 51,947 | 51,948 | 51,949 | 51,950 |
| | 2-179 | 51,964 | 51,965 | 51,966 | 51,967 | 51,968 | 51,969 | 51,970 | 51,971 | 51,972 | 51,973 | 51,974 | 51,975 |
| | 2-180 | 51,989 | 51,990 | 51,991 | 51,992 | 51,993 | 51,994 | 51,995 | 51,996 | 51,997 | 51,998 | 51,999 | 52,000 |
| | 2-181 | 52,014 | 52,015 | 52,016 | 52,017 | 52,018 | 52,019 | 52,020 | 52,021 | 52,022 | 52,023 | 52,024 | 52,025 |

TABLE 40-continued

| | | | | | | | | | | | | |
|---|---|---|---|---|---|---|---|---|---|---|---|---|
| 2-182 | 52,039 | 52,040 | 52,041 | 52,042 | 52,043 | 52,044 | 52,045 | 52,046 | 52,047 | 52,048 | 52,049 | 52,050 |
| 2-183 | 52,064 | 52,065 | 52,066 | 52,067 | 52,068 | 52,069 | 52,070 | 52,071 | 52,072 | 52,073 | 52,074 | 52,075 |
| 2-184 | 52,089 | 52,090 | 52,091 | 52,092 | 52,093 | 52,094 | 52,095 | 52,096 | 52,097 | 52,098 | 52,099 | 52,100 |
| 2-185 | 52,114 | 52,115 | 52,116 | 52,117 | 52,118 | 52,119 | 52,120 | 52,121 | 52,122 | 52,123 | 52,124 | 52,125 |
| 2-186 | 52,139 | 52,140 | 52,141 | 52,142 | 52,143 | 52,144 | 52,145 | 52,146 | 52,147 | 52,148 | 52,149 | 52,150 |
| 2-187 | 52,164 | 52,165 | 52,166 | 52,167 | 52,168 | 52,169 | 52,170 | 52,171 | 52,172 | 52,173 | 52,174 | 52,175 |
| 2-188 | 52,189 | 52,190 | 52,191 | 52,192 | 52,193 | 52,194 | 52,195 | 52,196 | 52,197 | 52,198 | 52,199 | 52,200 |
| 2-189 | 52,214 | 52,215 | 52,216 | 52,217 | 52,218 | 52,219 | 52,220 | 52,221 | 52,222 | 52,223 | 52,224 | 52,225 |
| 2-190 | 52,239 | 52,240 | 52,241 | 52,242 | 52,243 | 52,244 | 52,245 | 52,246 | 52,247 | 52,248 | 52,249 | 52,250 |
| 2-191 | 52,264 | 52,265 | 52,266 | 52,267 | 52,268 | 52,269 | 52,270 | 52,271 | 52,272 | 52,273 | 52,274 | 52,275 |
| 2-192 | 52,289 | 52,290 | 52,291 | 52,292 | 52,293 | 52,294 | 52,295 | 52,296 | 52,297 | 52,298 | 52,299 | 52,300 |
| 2-193 | 52,314 | 52,315 | 52,316 | 52,317 | 52,318 | 52,319 | 52,320 | 52,321 | 52,322 | 52,323 | 52,324 | 52,325 |
| 2-194 | 52,339 | 52,340 | 52,341 | 52,342 | 52,343 | 52,344 | 52,345 | 52,346 | 52,347 | 52,348 | 52,349 | 52,350 |
| 2-195 | 52,364 | 52,365 | 52,366 | 52,367 | 52,368 | 52,369 | 52,370 | 52,371 | 52,372 | 52,373 | 52,374 | 52,375 |
| 2-196 | 52,389 | 52,390 | 52,391 | 52,392 | 52,393 | 52,394 | 52,395 | 52,396 | 52,397 | 52,398 | 52,399 | 52,400 |
| 2-197 | 52,414 | 52,415 | 52,416 | 52,417 | 52,418 | 52,419 | 52,420 | 52,421 | 52,422 | 52,423 | 52,424 | 52,425 |
| 2-198 | 52,439 | 52,440 | 52,441 | 52,442 | 52,443 | 52,444 | 52,445 | 52,446 | 52,447 | 52,448 | 52,449 | 52,450 |
| 2-199 | 52,464 | 52,465 | 52,466 | 52,467 | 52,468 | 52,469 | 52,470 | 52,471 | 52,472 | 52,473 | 52,474 | 52,475 |
| 2-200 | 52,489 | 52,490 | 52,491 | 52,492 | 52,493 | 52,494 | 52,495 | 52,496 | 52,497 | 52,498 | 52,499 | 52,500 |
| 2-201 | 52,514 | 52,515 | 52,516 | 52,517 | 52,518 | 52,519 | 52,520 | 52,521 | 52,522 | 52,523 | 52,524 | 52,525 |
| 2-202 | 52,539 | 52,540 | 52,541 | 52,542 | 52,543 | 52,544 | 52,545 | 52,546 | 52,547 | 52,548 | 52,549 | 52,550 |
| 2-203 | 52,564 | 52,565 | 52,566 | 52,567 | 52,568 | 52,569 | 52,570 | 52,571 | 52,572 | 52,573 | 52,574 | 52,575 |
| 2-204 | 52,589 | 52,590 | 52,591 | 52,592 | 52,593 | 52,594 | 52,595 | 52,596 | 52,597 | 52,598 | 52,599 | 52,600 |
| 2-205 | 52,614 | 52,615 | 52,616 | 52,617 | 52,618 | 52,619 | 52,620 | 52,621 | 52,622 | 52,623 | 52,624 | 52,625 |
| 2-206 | 52,639 | 52,640 | 52,641 | 52,642 | 52,643 | 52,644 | 52,645 | 52,646 | 52,647 | 52,648 | 52,649 | 52,650 |
| 2-207 | 52,664 | 52,665 | 52,666 | 52,667 | 52,668 | 52,669 | 52,670 | 52,671 | 52,672 | 52,673 | 52,674 | 52,675 |
| 2-208 | 52,689 | 52,690 | 52,691 | 52,692 | 52,693 | 52,694 | 52,695 | 52,696 | 52,697 | 52,698 | 52,699 | 52,700 |
| 2-209 | 52,714 | 52,715 | 52,716 | 52,717 | 52,718 | 52,719 | 52,720 | 52,721 | 52,722 | 52,723 | 52,724 | 52,725 |
| 2-210 | 52,739 | 52,740 | 52,741 | 52,742 | 52,743 | 52,744 | 52,745 | 52,746 | 52,747 | 52,748 | 52,749 | 52,750 |
| 2-211 | 52,764 | 52,765 | 52,766 | 52,767 | 52,768 | 52,769 | 52,770 | 52,771 | 52,772 | 52,773 | 52,774 | 52,775 |
| 2-212 | 52,789 | 52,790 | 52,791 | 52,792 | 52,793 | 52,794 | 52,795 | 52,796 | 52,797 | 52,798 | 52,799 | 52,800 |
| 2-213 | 52,814 | 52,815 | 52,816 | 52,817 | 52,818 | 52,819 | 52,820 | 52,821 | 52,822 | 52,823 | 52,824 | 52,825 |
| 2-214 | 52,839 | 52,840 | 52,841 | 52,842 | 52,843 | 52,844 | 52,845 | 52,846 | 52,847 | 52,848 | 52,849 | 52,850 |
| 2-215 | 52,864 | 52,865 | 52,866 | 52,867 | 52,868 | 52,869 | 52,870 | 52,871 | 52,872 | 52,873 | 52,874 | 52,875 |
| 2-216 | 52,889 | 52,890 | 52,891 | 52,892 | 52,893 | 52,894 | 52,895 | 52,896 | 52,897 | 52,898 | 52,899 | 52,900 |
| 2-217 | 52,914 | 52,915 | 52,916 | 52,917 | 52,918 | 52,919 | 52,920 | 52,921 | 52,922 | 52,923 | 52,924 | 52,925 |
| 2-218 | 52,939 | 52,940 | 52,941 | 52,942 | 52,943 | 52,944 | 52,945 | 52,946 | 52,947 | 52,948 | 52,949 | 52,950 |
| 2-219 | 52,964 | 52,965 | 52,966 | 52,967 | 52,968 | 52,969 | 52,970 | 52,971 | 52,972 | 52,973 | 52,974 | 52,975 |
| 2-220 | 52,989 | 52,990 | 52,991 | 52,992 | 52,993 | 52,994 | 52,995 | 52,996 | 52,997 | 52,998 | 52,999 | 53,000 |

TABLE 41

| | | Compound represented by the formula (1) | | | | | | | | | | | | |
|---|---|---|---|---|---|---|---|---|---|---|---|---|---|---|
| | | 1-101 | 1-102 | 1-103 | 1-104 | 1-105 | 1-106 | 1-107 | 1-108 | 1-109 | 1-110 | 1-111 | 1-112 | 1-113 |
| Compound represented by the formula (2) | 2-221 | 53,001 | 53,002 | 53,003 | 53,004 | 53,005 | 53,006 | 53,007 | 53,008 | 53,009 | 53,010 | 53,011 | 53,012 | 53,013 |
| | 2-222 | 53,026 | 53,027 | 53,028 | 53,029 | 53,030 | 53,031 | 53,032 | 53,033 | 53,034 | 53,035 | 53,036 | 53,037 | 53,038 |
| | 2-223 | 53,051 | 53,052 | 53,053 | 53,054 | 53,055 | 53,056 | 53,057 | 53,058 | 53,059 | 53,060 | 53,061 | 53,062 | 53,063 |
| | 2-224 | 53,076 | 53,077 | 53,078 | 53,079 | 53,080 | 53,081 | 53,082 | 53,083 | 53,084 | 53,085 | 53,086 | 53,087 | 53,088 |
| | 2-225 | 53,101 | 53,102 | 53,103 | 53,104 | 53,105 | 53,106 | 53,107 | 53,108 | 53,109 | 53,110 | 53,111 | 53,112 | 53,113 |
| | 2-226 | 53,126 | 53,127 | 53,128 | 53,129 | 53,130 | 53,131 | 53,132 | 53,133 | 53,134 | 53,135 | 53,136 | 53,137 | 53,138 |
| | 2-227 | 53,151 | 53,152 | 53,153 | 53,154 | 53,155 | 53,156 | 53,157 | 53,158 | 53,159 | 53,160 | 53,161 | 53,162 | 53,163 |
| | 2-228 | 53,176 | 53,177 | 53,178 | 53,179 | 53,180 | 53,181 | 53,182 | 53,183 | 53,184 | 53,185 | 53,186 | 53,187 | 53,188 |
| | 2-229 | 53,201 | 53,202 | 53,203 | 53,204 | 53,205 | 53,206 | 53,207 | 53,208 | 53,209 | 53,210 | 53,211 | 53,212 | 53,213 |
| | 2-230 | 53,226 | 53,227 | 53,228 | 53,229 | 53,230 | 53,231 | 53,232 | 53,233 | 53,234 | 53,235 | 53,236 | 53,237 | 53,238 |
| | 2-231 | 53,251 | 53,252 | 53,253 | 53,254 | 53,255 | 53,256 | 53,257 | 53,258 | 53,259 | 53,260 | 53,261 | 53,262 | 53,263 |
| | 2-232 | 53,276 | 53,277 | 53,278 | 53,279 | 53,280 | 53,281 | 53,282 | 53,283 | 53,284 | 53,285 | 53,286 | 53,287 | 53,288 |
| | 2-233 | 53,301 | 53,302 | 53,303 | 53,304 | 53,305 | 53,306 | 53,307 | 53,308 | 53,309 | 53,310 | 53,311 | 53,312 | 53,313 |
| | 2-234 | 53,326 | 53,327 | 53,328 | 53,329 | 53,330 | 53,331 | 53,332 | 53,333 | 53,334 | 53,335 | 53,336 | 53,337 | 53,338 |
| | 2-235 | 53,351 | 53,352 | 53,353 | 53,354 | 53,355 | 53,356 | 53,357 | 53,358 | 53,359 | 53,360 | 53,361 | 53,362 | 53,363 |
| | 2-236 | 53,376 | 53,377 | 53,378 | 53,379 | 53,380 | 53,381 | 53,382 | 53,383 | 53,384 | 53,385 | 53,386 | 53,387 | 53,388 |
| | 2-237 | 53,401 | 53,402 | 53,403 | 53,404 | 53,405 | 53,406 | 53,407 | 53,408 | 53,409 | 53,410 | 53,411 | 53,412 | 53,413 |
| | 2-238 | 53,426 | 53,427 | 53,428 | 53,429 | 53,430 | 53,431 | 53,432 | 53,433 | 53,434 | 53,435 | 53,436 | 53,437 | 53,438 |
| | 2-239 | 53,451 | 53,452 | 53,453 | 53,454 | 53,455 | 53,456 | 53,457 | 53,458 | 53,459 | 53,460 | 53,461 | 53,462 | 53,463 |
| | 2-240 | 53,476 | 53,477 | 53,478 | 53,479 | 53,480 | 53,481 | 53,482 | 53,483 | 53,484 | 53,485 | 53,486 | 53,487 | 53,488 |
| | 2-241 | 53,501 | 53,502 | 53,503 | 53,504 | 53,505 | 53,506 | 53,507 | 53,508 | 53,509 | 53,510 | 53,511 | 53,512 | 53,513 |
| | 2-242 | 53,526 | 53,527 | 53,528 | 53,529 | 53,530 | 53,531 | 53,532 | 53,533 | 53,534 | 53,535 | 53,536 | 53,537 | 53,538 |
| | 2-243 | 53,551 | 53,552 | 53,553 | 53,554 | 53,555 | 53,556 | 53,557 | 53,558 | 53,559 | 53,560 | 53,561 | 53,562 | 53,563 |
| | 2-244 | 53,576 | 53,577 | 53,578 | 53,579 | 53,580 | 53,581 | 53,582 | 53,583 | 53,584 | 53,585 | 53,586 | 53,587 | 53,588 |
| | 2-245 | 53,601 | 53,602 | 53,603 | 53,604 | 53,605 | 53,606 | 53,607 | 53,608 | 53,609 | 53,610 | 53,611 | 53,612 | 53,613 |
| | 2-246 | 53,626 | 53,627 | 53,628 | 53,629 | 53,630 | 53,631 | 53,632 | 53,633 | 53,634 | 53,635 | 53,636 | 53,637 | 53,638 |
| | 2-247 | 53,651 | 53,652 | 53,653 | 53,654 | 53,655 | 53,656 | 53,657 | 53,658 | 53,659 | 53,660 | 53,661 | 53,662 | 53,663 |
| | 2-248 | 53,676 | 53,677 | 53,678 | 53,679 | 53,680 | 53,681 | 53,682 | 53,683 | 53,684 | 53,685 | 53,686 | 53,687 | 53,688 |
| | 2-249 | 53,701 | 53,702 | 53,703 | 53,704 | 53,705 | 53,706 | 53,707 | 53,708 | 53,709 | 53,710 | 53,711 | 53,712 | 53,713 |
| | 2-250 | 53,726 | 53,727 | 53,728 | 53,729 | 53,730 | 53,731 | 53,732 | 53,733 | 53,734 | 53,735 | 53,736 | 53,737 | 53,738 |
| | 2-251 | 53,751 | 53,752 | 53,753 | 53,754 | 53,755 | 53,756 | 53,757 | 53,758 | 53,759 | 53,760 | 53,761 | 53,762 | 53,763 |

TABLE 41-continued

| | | | | | | | | | | | | | |
|---|---|---|---|---|---|---|---|---|---|---|---|---|---|
| 2-252 | 53,776 | 53,777 | 53,778 | 53,779 | 53,780 | 53,781 | 53,782 | 53,783 | 53,784 | 53,785 | 53,786 | 53,787 | 53,788 |
| 2-253 | 53,801 | 53,802 | 53,803 | 53,804 | 53,805 | 53,806 | 53,807 | 53,808 | 53,809 | 53,810 | 53,811 | 53,812 | 53,813 |
| 2-254 | 53,826 | 53,827 | 53,828 | 53,829 | 53,830 | 53,831 | 53,832 | 53,833 | 53,834 | 53,835 | 53,836 | 53,837 | 53,838 |
| 2-255 | 53,851 | 53,852 | 53,853 | 53,854 | 53,855 | 53,856 | 53,857 | 53,858 | 53,859 | 53,860 | 53,861 | 53,862 | 53,863 |
| 2-256 | 53,876 | 53,877 | 53,878 | 53,879 | 53,880 | 53,881 | 53,882 | 53,883 | 53,884 | 53,885 | 53,886 | 53,887 | 53,888 |
| 2-257 | 53,901 | 53,902 | 53,903 | 53,904 | 53,905 | 53,906 | 53,907 | 53,908 | 53,909 | 53,910 | 53,911 | 53,912 | 53,913 |
| 2-258 | 53,926 | 53,927 | 53,928 | 53,929 | 53,930 | 53,931 | 53,932 | 53,933 | 53,934 | 53,935 | 53,936 | 53,937 | 53,938 |
| 2-259 | 53,951 | 53,952 | 53,953 | 53,954 | 53,955 | 53,956 | 53,957 | 53,958 | 53,959 | 53,960 | 53,961 | 53,962 | 53,963 |
| 2-260 | 53,976 | 53,977 | 53,978 | 53,979 | 53,980 | 53,981 | 53,982 | 53,983 | 53,984 | 53,985 | 53,986 | 53,987 | 53,988 |
| 2-261 | 54,001 | 54,002 | 54,003 | 54,004 | 54,005 | 54,006 | 54,007 | 54,008 | 54,009 | 54,010 | 54,011 | 54,012 | 54,013 |
| 2-262 | 54,026 | 54,027 | 54,028 | 54,029 | 54,030 | 54,031 | 54,032 | 54,033 | 54,034 | 54,035 | 54,036 | 54,037 | 54,038 |
| 2-263 | 54,051 | 54,052 | 54,053 | 54,054 | 54,055 | 54,056 | 54,057 | 54,058 | 54,059 | 54,060 | 54,061 | 54,062 | 54,063 |
| 2-264 | 54,076 | 54,077 | 54,078 | 54,079 | 54,080 | 54,081 | 54,082 | 54,083 | 54,084 | 54,085 | 54,086 | 54,087 | 54,088 |
| 2-265 | 54,101 | 54,102 | 54,103 | 54,104 | 54,105 | 54,106 | 54,107 | 54,108 | 54,109 | 54,110 | 54,111 | 54,112 | 54,113 |
| 2-266 | 54,126 | 54,127 | 54,128 | 54,129 | 54,130 | 54,131 | 54,132 | 54,133 | 54,134 | 54,135 | 54,136 | 54,137 | 54,138 |
| 2-267 | 54,151 | 54,152 | 54,153 | 54,154 | 54,155 | 54,156 | 54,157 | 54,158 | 54,159 | 54,160 | 54,161 | 54,162 | 54,163 |
| 2-268 | 54,176 | 54,177 | 54,178 | 54,179 | 54,180 | 54,181 | 54,182 | 54,183 | 54,184 | 54,185 | 54,186 | 54,187 | 54,188 |
| 2-269 | 54,201 | 54,202 | 54,203 | 54,204 | 54,205 | 54,206 | 54,207 | 54,208 | 54,209 | 54,210 | 54,211 | 54,212 | 54,213 |
| 2-270 | 54,226 | 54,227 | 54,228 | 54,229 | 54,230 | 54,231 | 54,232 | 54,233 | 54,234 | 54,235 | 54,236 | 54,237 | 54,238 |
| 2-271 | 54,251 | 54,252 | 54,253 | 54,254 | 54,255 | 54,256 | 54,257 | 54,258 | 54,259 | 54,260 | 54,261 | 54,262 | 54,263 |
| 2-272 | 54,276 | 54,277 | 54,278 | 54,279 | 54,280 | 54,281 | 54,282 | 54,283 | 54,284 | 54,285 | 54,286 | 54,287 | 54,288 |
| 2-273 | 54,301 | 54,302 | 54,303 | 54,304 | 54,305 | 54,306 | 54,307 | 54,308 | 54,309 | 54,310 | 54,311 | 54,312 | 54,313 |
| 2-274 | 54,326 | 54,327 | 54,328 | 54,329 | 54,330 | 54,331 | 54,332 | 54,333 | 54,334 | 54,335 | 54,336 | 54,337 | 54,338 |
| 2-275 | 54,351 | 54,352 | 54,353 | 54,354 | 54,355 | 54,356 | 54,357 | 54,358 | 54,359 | 54,360 | 54,361 | 54,362 | 54,363 |

| | | Compound represented by the formula (1) | | | | | | | | | | | |
|---|---|---|---|---|---|---|---|---|---|---|---|---|---|
| | | 1-114 | 1-115 | 1-116 | 1-117 | 1-118 | 1-119 | 1-120 | 1-121 | 1-122 | 1-123 | 1-124 | 1-125 |
| Compound represented by the formula (2) | 2-221 | 53,014 | 53,015 | 53,016 | 53,017 | 53,018 | 53,019 | 53,020 | 53,021 | 53,022 | 53,023 | 53,024 | 53,025 |
| | 2-222 | 53,039 | 53,040 | 53,041 | 53,042 | 53,043 | 53,044 | 53,045 | 53,046 | 53,047 | 53,048 | 53,049 | 53,050 |
| | 2-223 | 53,064 | 53,065 | 53,066 | 53,067 | 53,068 | 53,069 | 53,070 | 53,071 | 53,072 | 53,073 | 53,074 | 53,075 |
| | 2-224 | 53,089 | 53,090 | 53,091 | 53,092 | 53,093 | 53,094 | 53,095 | 53,096 | 53,097 | 53,098 | 53,099 | 53,100 |
| | 2-225 | 53,114 | 53,115 | 53,116 | 53,117 | 53,118 | 53,119 | 53,120 | 53,121 | 53,122 | 53,123 | 53,124 | 53,125 |
| | 2-226 | 53,139 | 53,140 | 53,141 | 53,142 | 53,143 | 53,144 | 53,145 | 53,146 | 53,147 | 53,148 | 53,149 | 53,150 |
| | 2-227 | 53,164 | 53,165 | 53,166 | 53,167 | 53,168 | 53,169 | 53,170 | 53,171 | 53,172 | 53,173 | 53,174 | 53,175 |
| | 2-228 | 53,189 | 53,190 | 53,191 | 53,192 | 53,193 | 53,194 | 53,195 | 53,196 | 53,197 | 53,198 | 53,199 | 53,200 |
| | 2-229 | 53,214 | 53,215 | 53,216 | 53,217 | 53,218 | 53,219 | 53,220 | 53,221 | 53,222 | 53,223 | 53,224 | 53,225 |
| | 2-230 | 53,239 | 53,240 | 53,241 | 53,242 | 53,243 | 53,244 | 53,245 | 53,246 | 53,247 | 53,248 | 53,249 | 53,250 |
| | 2-231 | 53,264 | 53,265 | 53,266 | 53,267 | 53,268 | 53,269 | 53,270 | 53,271 | 53,272 | 53,273 | 53,274 | 53,275 |
| | 2-232 | 53,289 | 53,290 | 53,291 | 53,292 | 53,293 | 53,294 | 53,295 | 53,296 | 53,297 | 53,298 | 53,299 | 53,300 |
| | 2-233 | 53,314 | 53,315 | 53,316 | 53,317 | 53,318 | 53,319 | 53,320 | 53,321 | 53,322 | 53,323 | 53,324 | 53,325 |
| | 2-234 | 53,339 | 53,340 | 53,341 | 53,342 | 53,343 | 53,344 | 53,345 | 53,346 | 53,347 | 53,348 | 53,349 | 53,350 |
| | 2-235 | 53,364 | 53,365 | 53,366 | 53,367 | 53,368 | 53,369 | 53,370 | 53,371 | 53,372 | 53,373 | 53,374 | 53,375 |
| | 2-236 | 53,389 | 53,390 | 53,391 | 53,392 | 53,393 | 53,394 | 53,395 | 53,396 | 53,397 | 53,398 | 53,399 | 53,400 |
| | 2-237 | 53,414 | 53,415 | 53,416 | 53,417 | 53,418 | 53,419 | 53,420 | 53,421 | 53,422 | 53,423 | 53,424 | 53,425 |
| | 2-238 | 53,439 | 53,440 | 53,441 | 53,442 | 53,443 | 53,444 | 53,445 | 53,446 | 53,447 | 53,448 | 53,449 | 53,450 |
| | 2-239 | 53,464 | 53,465 | 53,466 | 53,467 | 53,468 | 53,469 | 53,470 | 53,471 | 53,472 | 53,473 | 53,474 | 53,475 |
| | 2-240 | 53,489 | 53,490 | 53,491 | 53,492 | 53,493 | 53,494 | 53,495 | 53,496 | 53,497 | 53,498 | 53,499 | 53,500 |
| | 2-241 | 53,514 | 53,515 | 53,516 | 53,517 | 53,518 | 53,519 | 53,520 | 53,521 | 53,522 | 53,523 | 53,524 | 53,525 |
| | 2-242 | 53,539 | 53,540 | 53,541 | 53,542 | 53,543 | 53,544 | 53,545 | 53,546 | 53,547 | 53,548 | 53,549 | 53,550 |
| | 2-243 | 53,564 | 53,565 | 53,566 | 53,567 | 53,568 | 53,569 | 53,570 | 53,571 | 53,572 | 53,573 | 53,574 | 53,575 |
| | 2-244 | 53,589 | 53,590 | 53,591 | 53,592 | 53,593 | 53,594 | 53,595 | 53,596 | 53,597 | 53,598 | 53,599 | 53,600 |
| | 2-245 | 53,614 | 53,615 | 53,616 | 53,617 | 53,618 | 53,619 | 53,620 | 53,621 | 53,622 | 53,623 | 53,624 | 53,625 |
| | 2-246 | 53,639 | 53,640 | 53,641 | 53,642 | 53,643 | 53,644 | 53,645 | 53,646 | 53,647 | 53,648 | 53,649 | 53,650 |
| | 2-247 | 53,664 | 53,665 | 53,666 | 53,667 | 53,668 | 53,669 | 53,670 | 53,671 | 53,672 | 53,673 | 53,674 | 53,675 |
| | 2-248 | 53,689 | 53,690 | 53,691 | 53,692 | 53,693 | 53,694 | 53,695 | 53,696 | 53,697 | 53,698 | 53,699 | 53,700 |
| | 2-249 | 53,714 | 53,715 | 53,716 | 53,717 | 53,718 | 53,719 | 53,720 | 53,721 | 53,722 | 53,723 | 53,724 | 53,725 |
| | 2-250 | 53,739 | 53,740 | 53,741 | 53,742 | 53,743 | 53,744 | 53,745 | 53,746 | 53,747 | 53,748 | 53,749 | 53,750 |
| | 2-251 | 53,764 | 53,765 | 53,766 | 53,767 | 53,768 | 53,769 | 53,770 | 53,771 | 53,772 | 53,773 | 53,774 | 53,775 |
| | 2-252 | 53,789 | 53,790 | 53,791 | 53,792 | 53,793 | 53,794 | 53,795 | 53,796 | 53,797 | 53,798 | 53,799 | 53,800 |
| | 2-253 | 53,814 | 53,815 | 53,816 | 53,817 | 53,818 | 53,819 | 53,820 | 53,821 | 53,822 | 53,823 | 53,824 | 53,825 |
| | 2-254 | 53,839 | 53,840 | 53,841 | 53,842 | 53,843 | 53,844 | 53,845 | 53,846 | 53,847 | 53,848 | 53,849 | 53,850 |
| | 2-255 | 53,864 | 53,865 | 53,866 | 53,867 | 53,868 | 53,869 | 53,870 | 53,871 | 53,872 | 53,873 | 53,874 | 53,875 |
| | 2-256 | 53,889 | 53,890 | 53,891 | 53,892 | 53,893 | 53,894 | 53,895 | 53,896 | 53,897 | 53,898 | 53,899 | 53,900 |
| | 2-257 | 53,914 | 53,915 | 53,916 | 53,917 | 53,918 | 53,919 | 53,920 | 53,921 | 53,922 | 53,923 | 53,924 | 53,925 |
| | 2-258 | 53,939 | 53,940 | 53,941 | 53,942 | 53,943 | 53,944 | 53,945 | 53,946 | 53,947 | 53,948 | 53,949 | 53,950 |
| | 2-259 | 53,964 | 53,965 | 53,966 | 53,967 | 53,968 | 53,969 | 53,970 | 53,971 | 53,972 | 53,973 | 53,974 | 53,975 |
| | 2-260 | 53,989 | 53,990 | 53,991 | 53,992 | 53,993 | 53,994 | 53,995 | 53,996 | 53,997 | 53,998 | 53,999 | 54,000 |
| | 2-261 | 54,014 | 54,015 | 54,016 | 54,017 | 54,018 | 54,019 | 54,020 | 54,021 | 54,022 | 54,023 | 54,024 | 54,025 |
| | 2-262 | 54,039 | 54,040 | 54,041 | 54,042 | 54,043 | 54,044 | 54,045 | 54,046 | 54,047 | 54,048 | 54,049 | 54,050 |
| | 2-263 | 54,064 | 54,065 | 54,066 | 54,067 | 54,068 | 54,069 | 54,070 | 54,071 | 54,072 | 54,073 | 54,074 | 54,075 |
| | 2-264 | 54,089 | 54,090 | 54,091 | 54,092 | 54,093 | 54,094 | 54,095 | 54,096 | 54,097 | 54,098 | 54,099 | 54,100 |
| | 2-265 | 54,114 | 54,115 | 54,116 | 54,117 | 54,118 | 54,119 | 54,120 | 54,121 | 54,122 | 54,123 | 54,124 | 54,125 |
| | 2-266 | 54,139 | 54,140 | 54,141 | 54,142 | 54,143 | 54,144 | 54,145 | 54,146 | 54,147 | 54,148 | 54,149 | 54,150 |
| | 2-267 | 54,164 | 54,165 | 54,166 | 54,167 | 54,168 | 54,169 | 54,170 | 54,171 | 54,172 | 54,173 | 54,174 | 54,175 |
| | 2-268 | 54,189 | 54,190 | 54,191 | 54,192 | 54,193 | 54,194 | 54,195 | 54,196 | 54,197 | 54,198 | 54,199 | 54,200 |
| | 2-269 | 54,214 | 54,215 | 54,216 | 54,217 | 54,218 | 54,219 | 54,220 | 54,221 | 54,222 | 54,223 | 54,224 | 54,225 |
| | 2-270 | 54,239 | 54,240 | 54,241 | 54,242 | 54,243 | 54,244 | 54,245 | 54,246 | 54,247 | 54,248 | 54,249 | 54,250 |
| | 2-271 | 54,264 | 54,265 | 54,266 | 54,267 | 54,268 | 54,269 | 54,270 | 54,271 | 54,272 | 54,273 | 54,274 | 54,275 |

TABLE 41-continued

| | | | | | | | | | | | | |
|---|---|---|---|---|---|---|---|---|---|---|---|---|
| 2-272 | 54,289 | 54,290 | 54,291 | 54,292 | 54,293 | 54,294 | 54,295 | 54,296 | 54,297 | 54,298 | 54,299 | 54,300 |
| 2-273 | 54,314 | 54,315 | 54,316 | 54,317 | 54,318 | 54,319 | 54,320 | 54,321 | 54,322 | 54,323 | 54,324 | 54,325 |
| 2-274 | 54,339 | 54,340 | 54,341 | 54,342 | 54,343 | 54,344 | 54,345 | 54,346 | 54,347 | 54,348 | 54,349 | 54,350 |
| 2-275 | 54,364 | 54,365 | 54,366 | 54,367 | 54,368 | 54,369 | 54,370 | 54,371 | 54,372 | 54,373 | 54,374 | 54,375 |

TABLE 42

| | | Compound represented by the formula (1) | | | | | | | | | | | | |
|---|---|---|---|---|---|---|---|---|---|---|---|---|---|---|
| | | 1-101 | 1-102 | 1-103 | 1-104 | 1-105 | 1-106 | 1-107 | 1-108 | 1-109 | 1-110 | 1-111 | 1-112 | 1-113 |
| Compound | 2-276 | 54,376 | 54,377 | 54,378 | 54,379 | 54,380 | 54,381 | 54,382 | 54,383 | 54,384 | 54,385 | 54,386 | 54,387 | 54,388 |
| represented | 2-277 | 54,401 | 54,402 | 54,403 | 54,404 | 54,405 | 54,406 | 54,407 | 54,408 | 54,409 | 54,410 | 54,411 | 54,412 | 54,413 |
| by the | 2-278 | 54,426 | 54,427 | 54,428 | 54,429 | 54,430 | 54,431 | 54,432 | 54,433 | 54,434 | 54,435 | 54,436 | 54,437 | 54,438 |
| formula (2) | 2-279 | 54,451 | 54,452 | 54,453 | 54,454 | 54,455 | 54,456 | 54,457 | 54,458 | 54,459 | 54,460 | 54,461 | 54,462 | 54,463 |
| | 2-280 | 54,476 | 54,477 | 54,478 | 54,479 | 54,480 | 54,481 | 54,482 | 54,483 | 54,484 | 54,485 | 54,486 | 54,487 | 54,488 |
| | 2-281 | 54,501 | 54,502 | 54,503 | 54,504 | 54,505 | 54,506 | 54,507 | 54,508 | 54,509 | 54,510 | 54,511 | 54,512 | 54,513 |
| | 2-282 | 54,526 | 54,527 | 54,528 | 54,529 | 54,530 | 54,531 | 54,532 | 54,533 | 54,534 | 54,535 | 54,536 | 54,537 | 54,538 |
| | 2-283 | 54,551 | 54,552 | 54,553 | 54,554 | 54,555 | 54,556 | 54,557 | 54,558 | 54,559 | 54,560 | 54,561 | 54,562 | 54,563 |
| | 2-284 | 54,576 | 54,577 | 54,578 | 54,579 | 54,580 | 54,581 | 54,582 | 54,583 | 54,584 | 54,585 | 54,586 | 54,587 | 54,588 |
| | 2-285 | 54,601 | 54,602 | 54,603 | 54,604 | 54,605 | 54,606 | 54,607 | 54,608 | 54,609 | 54,610 | 54,611 | 54,612 | 54,613 |
| | 2-286 | 54,626 | 54,627 | 54,628 | 54,629 | 54,630 | 54,631 | 54,632 | 54,633 | 54,634 | 54,635 | 54,636 | 54,637 | 54,638 |
| | 2-287 | 54,651 | 54,652 | 54,653 | 54,654 | 54,655 | 54,656 | 54,657 | 54,658 | 54,659 | 54,660 | 54,661 | 54,662 | 54,663 |
| | 2-288 | 54,676 | 54,677 | 54,678 | 54,679 | 54,680 | 54,681 | 54,682 | 54,683 | 54,684 | 54,685 | 54,686 | 54,687 | 54,688 |
| | 2-289 | 54,701 | 54,702 | 54,703 | 54,704 | 54,705 | 54,706 | 54,707 | 54,708 | 54,709 | 54,710 | 54,711 | 54,712 | 54,713 |
| | 2-290 | 54,726 | 54,727 | 54,728 | 54,729 | 54,730 | 54,731 | 54,732 | 54,733 | 54,734 | 54,735 | 54,736 | 54,737 | 54,738 |
| | 2-291 | 54,751 | 54,752 | 54,753 | 54,754 | 54,755 | 54,756 | 54,757 | 54,758 | 54,759 | 54,760 | 54,761 | 54,762 | 54,763 |
| | 2-292 | 54,776 | 54,777 | 54,778 | 54,779 | 54,780 | 54,781 | 54,782 | 54,783 | 54,784 | 54,785 | 54,786 | 54,787 | 54,788 |
| | 2-293 | 54,801 | 54,802 | 54,803 | 54,804 | 54,805 | 54,806 | 54,807 | 54,808 | 54,809 | 54,810 | 54,811 | 54,812 | 54,813 |
| | 2-294 | 54,826 | 54,827 | 54,828 | 54,829 | 54,830 | 54,831 | 54,832 | 54,833 | 54,834 | 54,835 | 54,836 | 54,837 | 54,838 |
| | 2-295 | 54,851 | 54,852 | 54,853 | 54,854 | 54,855 | 54,856 | 54,857 | 54,858 | 54,859 | 54,860 | 54,861 | 54,862 | 54,863 |
| | 2-296 | 54,876 | 54,877 | 54,878 | 54,879 | 54,880 | 54,881 | 54,882 | 54,883 | 54,884 | 54,885 | 54,886 | 54,887 | 54,888 |
| | 2-297 | 54,901 | 54,902 | 54,903 | 54,904 | 54,905 | 54,906 | 54,907 | 54,908 | 54,909 | 54,910 | 54,911 | 54,912 | 54,913 |
| | 2-298 | 54,926 | 54,927 | 54,928 | 54,929 | 54,930 | 54,931 | 54,932 | 54,933 | 54,934 | 54,935 | 54,936 | 54,937 | 54,938 |
| | 2-299 | 54,951 | 54,952 | 54,953 | 54,954 | 54,955 | 54,956 | 54,957 | 54,958 | 54,959 | 54,960 | 54,961 | 54,962 | 54,963 |
| | 2-300 | 54,976 | 54,977 | 54,978 | 54,979 | 54,980 | 54,981 | 54,982 | 54,983 | 54,984 | 54,985 | 54,986 | 54,987 | 54,988 |
| | 2-301 | 55,001 | 55,002 | 55,003 | 55,004 | 55,005 | 55,006 | 55,007 | 55,008 | 55,009 | 55,010 | 55,011 | 55,012 | 55,013 |
| | 2-302 | 55,026 | 55,027 | 55,028 | 55,029 | 55,030 | 55,031 | 55,032 | 55,033 | 55,034 | 55,035 | 55,036 | 55,037 | 55,038 |
| | 2-303 | 55,051 | 55,052 | 55,053 | 55,054 | 55,055 | 55,056 | 55,057 | 55,058 | 55,059 | 55,060 | 55,061 | 55,062 | 55,063 |
| | 2-304 | 55,076 | 55,077 | 55,078 | 55,079 | 55,080 | 55,081 | 55,082 | 55,083 | 55,084 | 55,085 | 55,086 | 55,087 | 55,088 |
| | 2-305 | 55,101 | 55,102 | 55,103 | 55,104 | 55,105 | 55,106 | 55,107 | 55,108 | 55,109 | 55,110 | 55,111 | 55,112 | 55,113 |
| | 2-306 | 55,126 | 55,127 | 55,128 | 55,129 | 55,130 | 55,131 | 55,132 | 55,133 | 55,134 | 55,135 | 55,136 | 55,137 | 55,138 |
| | 2-307 | 55,151 | 55,152 | 55,153 | 55,154 | 55,155 | 55,156 | 55,157 | 55,158 | 55,159 | 55,160 | 55,161 | 55,162 | 55,163 |
| | 2-308 | 55,176 | 55,177 | 55,178 | 55,179 | 55,180 | 55,181 | 55,182 | 55,183 | 55,184 | 55,185 | 55,186 | 55,187 | 55,188 |
| | 2-309 | 55,201 | 55,202 | 55,203 | 55,204 | 55,205 | 55,206 | 55,207 | 55,208 | 55,209 | 55,210 | 55,211 | 55,212 | 55,213 |
| | 2-310 | 55,226 | 55,227 | 55,228 | 55,229 | 55,230 | 55,231 | 55,232 | 55,233 | 55,234 | 55,235 | 55,236 | 55,237 | 55,238 |
| | 2-311 | 55,251 | 55,252 | 55,253 | 55,254 | 55,255 | 55,256 | 55,257 | 55,253 | 55,259 | 55,260 | 55,261 | 55,262 | 55,263 |
| | 2-312 | 55,276 | 55,277 | 55,278 | 55,279 | 55,280 | 55,281 | 55,282 | 55,283 | 55,284 | 55,285 | 55,286 | 55,287 | 55,288 |
| | 2-313 | 55,301 | 55,302 | 55,303 | 55,304 | 55,305 | 55,306 | 55,307 | 55,308 | 55,309 | 55,310 | 55,311 | 55,312 | 55,313 |
| | 2-314 | 55,326 | 55,327 | 55,328 | 55,329 | 55,330 | 55,331 | 55,332 | 55,333 | 55,334 | 55,335 | 55,336 | 55,337 | 55,338 |
| | 2-315 | 55,351 | 55,352 | 55,353 | 55,354 | 55,355 | 55,356 | 55,357 | 55,353 | 55,359 | 55,360 | 55,361 | 55,362 | 55,363 |
| | 2-316 | 55,376 | 55,377 | 55,378 | 55,379 | 55,380 | 55,381 | 55,382 | 55,383 | 55,384 | 55,385 | 55,386 | 55,387 | 55,388 |
| | 2-317 | 55,401 | 55,402 | 55,403 | 55,404 | 55,405 | 55,406 | 55,407 | 55,408 | 55,409 | 55,410 | 55,411 | 55,412 | 55,413 |
| | 2-318 | 55,426 | 55,427 | 55,428 | 55,429 | 55,430 | 55,431 | 55,432 | 55,433 | 55,434 | 55,435 | 55,436 | 55,437 | 55,438 |
| | 2-319 | 55,451 | 55,452 | 55,453 | 55,454 | 55,455 | 55,456 | 55,457 | 55,453 | 55,459 | 55,460 | 55,461 | 55,462 | 55,463 |
| | 2-320 | 55,476 | 55,477 | 55,478 | 55,479 | 55,480 | 55,481 | 55,482 | 55,483 | 55,484 | 55,485 | 55,486 | 55,487 | 55,488 |
| | 2-321 | 55,501 | 55,502 | 55,503 | 55,504 | 55,505 | 55,506 | 55,507 | 55,508 | 55,509 | 55,510 | 55,511 | 55,512 | 55,513 |
| | 2-322 | 55,526 | 55,527 | 55,528 | 55,529 | 55,530 | 55,531 | 55,532 | 55,533 | 55,534 | 55,535 | 55,536 | 55,537 | 55,538 |
| | 2-323 | 55,551 | 55,552 | 55,553 | 55,554 | 55,555 | 55,556 | 55,557 | 55,553 | 55,559 | 55,560 | 55,561 | 55,562 | 55,563 |
| | 2-324 | 55,576 | 55,577 | 55,578 | 55,579 | 55,580 | 55,581 | 55,582 | 55,583 | 55,584 | 55,585 | 55,586 | 55,587 | 55,588 |
| | 2-325 | 55,601 | 55,602 | 55,603 | 55,604 | 55,605 | 55,606 | 55,607 | 55,608 | 55,609 | 55,610 | 55,611 | 55,612 | 55,613 |
| | 2-326 | 55,626 | 55,627 | 55,628 | 55,629 | 55,630 | 55,631 | 55,632 | 55,633 | 55,634 | 55,635 | 55,636 | 55,637 | 55,638 |
| | 2-327 | 55,651 | 55,652 | 55,653 | 55,654 | 55,655 | 55,656 | 55,657 | 55,653 | 55,659 | 55,660 | 55,661 | 55,662 | 55,663 |
| | 2-328 | 55,676 | 55,677 | 55,678 | 55,679 | 55,680 | 55,681 | 55,682 | 55,683 | 55,684 | 55,685 | 55,686 | 55,687 | 55,688 |
| | 2-329 | 55,701 | 55,702 | 55,703 | 55,704 | 55,705 | 55,706 | 55,707 | 55,708 | 55,709 | 55,710 | 55,711 | 55,712 | 55,713 |
| | 2-330 | 55,726 | 55,727 | 55,728 | 55,729 | 55,730 | 55,731 | 55,732 | 55,733 | 55,734 | 55,735 | 55,736 | 55,737 | 55,738 |

| | | Compound represented by the formula (1) | | | | | | | | | | | |
|---|---|---|---|---|---|---|---|---|---|---|---|---|---|
| | | 1-114 | 1-115 | 1-116 | 1-117 | 1-118 | 1-119 | 1-120 | 1-121 | 1-122 | 1-123 | 1-124 | 1-125 |
| Compound | 2-276 | 54,389 | 54,390 | 54,391 | 54,392 | 54,393 | 54,394 | 54,395 | 54,396 | 54,397 | 54,398 | 54,399 | 54,400 |
| represented | 2-277 | 54,414 | 54,415 | 54,416 | 54,417 | 54,418 | 54,419 | 54,420 | 54,421 | 54,422 | 54,423 | 54,424 | 54,425 |
| by the | 2-278 | 54,439 | 54,440 | 54,441 | 54,442 | 54,443 | 54,444 | 54,445 | 54,446 | 54,447 | 54,448 | 54,449 | 54,450 |
| formula (2) | 2-279 | 54,464 | 54,465 | 54,466 | 54,467 | 54,468 | 54,469 | 54,470 | 54,471 | 54,472 | 54,473 | 54,474 | 54,475 |
| | 2-280 | 54,489 | 54,490 | 54,491 | 54,492 | 54,493 | 54,494 | 54,495 | 54,496 | 54,497 | 54,498 | 54,499 | 54,500 |
| | 2-281 | 54,514 | 54,515 | 54,516 | 54,517 | 54,518 | 54,519 | 54,520 | 54,521 | 54,522 | 54,523 | 54,524 | 54,525 |

TABLE 42-continued

| | | | | | | | | | | | | | |
|---|---|---|---|---|---|---|---|---|---|---|---|---|---|
| | 2-282 | 54,539 | 54,540 | 54,541 | 54,542 | 54,543 | 54,544 | 54,545 | 54,546 | 54,547 | 54,548 | 54,549 | 54,550 |
| | 2-283 | 54,564 | 54,565 | 54,566 | 54,567 | 54,568 | 54,569 | 54,570 | 54,571 | 54,572 | 54,573 | 54,574 | 54,575 |
| | 2-284 | 54,589 | 54,590 | 54,591 | 54,592 | 54,593 | 54,594 | 54,595 | 54,596 | 54,597 | 54,598 | 54,599 | 54,600 |
| | 2-285 | 54,614 | 54,615 | 54,616 | 54,617 | 54,618 | 54,619 | 54,620 | 54,621 | 54,622 | 54,623 | 54,624 | 54,625 |
| | 2-286 | 54,639 | 54,640 | 54,641 | 54,642 | 54,643 | 54,644 | 54,645 | 54,646 | 54,647 | 54,648 | 54,649 | 54,650 |
| | 2-287 | 54,664 | 54,665 | 54,666 | 54,667 | 54,668 | 54,669 | 54,670 | 54,671 | 54,672 | 54,673 | 54,674 | 54,675 |
| | 2-288 | 54,689 | 54,690 | 54,691 | 54,692 | 54,693 | 54,694 | 54,695 | 54,696 | 54,697 | 54,698 | 54,699 | 54,700 |
| | 2-289 | 54,714 | 54,715 | 54,716 | 54,717 | 54,718 | 54,719 | 54,720 | 54,721 | 54,722 | 54,723 | 54,724 | 54,725 |
| | 2-290 | 54,739 | 54,740 | 54,741 | 54,742 | 54,743 | 54,744 | 54,745 | 54,746 | 54,747 | 54,748 | 54,749 | 54,750 |
| | 2-291 | 54,764 | 54,765 | 54,766 | 54,767 | 54,768 | 54,769 | 54,770 | 54,771 | 54,772 | 54,773 | 54,774 | 54,775 |
| | 2-292 | 54,789 | 54,790 | 54,791 | 54,792 | 54,793 | 54,794 | 54,795 | 54,796 | 54,797 | 54,798 | 54,799 | 54,800 |
| | 2-293 | 54,814 | 54,815 | 54,816 | 54,817 | 54,818 | 54,819 | 54,820 | 54,821 | 54,822 | 54,823 | 54,824 | 54,825 |
| | 2-294 | 54,839 | 54,840 | 54,841 | 54,842 | 54,843 | 54,844 | 54,845 | 54,846 | 54,847 | 54,848 | 54,849 | 54,850 |
| | 2-295 | 54,864 | 54,865 | 54,866 | 54,867 | 54,868 | 54,869 | 54,870 | 54,871 | 54,872 | 54,873 | 54,874 | 54,875 |
| | 2-296 | 54,889 | 54,890 | 54,891 | 54,892 | 54,893 | 54,894 | 54,895 | 54,896 | 54,897 | 54,898 | 54,899 | 54,900 |
| | 2-297 | 54,914 | 54,915 | 54,916 | 54,917 | 54,918 | 54,919 | 54,920 | 54,921 | 54,922 | 54,923 | 54,924 | 54,925 |
| | 2-298 | 54,939 | 54,940 | 54,941 | 54,942 | 54,943 | 54,944 | 54,945 | 54,946 | 54,947 | 54,948 | 54,949 | 54,950 |
| | 2-299 | 54,964 | 54,965 | 54,966 | 54,967 | 54,968 | 54,969 | 54,970 | 54,971 | 54,972 | 54,973 | 54,974 | 54,975 |
| | 2-300 | 54,989 | 54,990 | 54,991 | 54,992 | 54,993 | 54,994 | 54,995 | 54,996 | 54,997 | 54,998 | 54,999 | 55,000 |
| | 2-301 | 55,014 | 55,015 | 55,016 | 55,017 | 55,018 | 55,019 | 55,020 | 55,021 | 55,022 | 55,023 | 55,024 | 55,025 |
| | 2-302 | 55,039 | 55,040 | 55,041 | 55,042 | 55,043 | 55,044 | 55,045 | 55,046 | 55,047 | 55,048 | 55,049 | 55,050 |
| | 2-303 | 55,064 | 55,065 | 55,066 | 55,067 | 55,068 | 55,069 | 55,070 | 55,071 | 55,072 | 55,073 | 55,074 | 55,075 |
| | 2-304 | 55,089 | 55,090 | 55,091 | 55,092 | 55,093 | 55,094 | 55,095 | 55,096 | 55,097 | 55,098 | 55,099 | 55,100 |
| | 2-305 | 55,114 | 55,115 | 55,116 | 55,117 | 55,118 | 55,119 | 55,120 | 55,121 | 55,122 | 55,123 | 55,124 | 55,125 |
| | 2-306 | 55,139 | 55,140 | 55,141 | 55,142 | 55,143 | 55,144 | 55,145 | 55,146 | 55,147 | 55,148 | 55,149 | 55,150 |
| | 2-307 | 55,164 | 55,165 | 55,166 | 55,167 | 55,168 | 55,169 | 55,170 | 55,171 | 55,172 | 55,173 | 55,174 | 55,175 |
| | 2-308 | 55,189 | 55,190 | 55,191 | 55,192 | 55,193 | 55,194 | 55,195 | 55,196 | 55,197 | 55,198 | 55,199 | 55,200 |
| | 2-309 | 55,214 | 55,215 | 55,216 | 55,217 | 55,218 | 55,219 | 55,220 | 55,221 | 55,222 | 55,223 | 55,224 | 55,225 |
| | 2-310 | 55,239 | 55,240 | 55,241 | 55,242 | 55,243 | 55,244 | 55,245 | 55,246 | 55,247 | 55,248 | 55,249 | 55,250 |
| | 2-311 | 55,264 | 55,265 | 55,266 | 55,267 | 55,268 | 55,269 | 55,270 | 55,271 | 55,272 | 55,273 | 55,274 | 55,275 |
| | 2-312 | 55,289 | 55,290 | 55,291 | 55,292 | 55,293 | 55,294 | 55,295 | 55,296 | 55,297 | 55,298 | 55,299 | 55,300 |
| | 2-313 | 55,314 | 55,315 | 55,316 | 55,317 | 55,318 | 55,319 | 55,320 | 55,321 | 55,322 | 55,323 | 55,324 | 55,325 |
| | 2-314 | 55,339 | 55,340 | 55,341 | 55,342 | 55,343 | 55,344 | 55,345 | 55,346 | 55,347 | 55,348 | 55,349 | 55,350 |
| | 2-315 | 55,364 | 55,365 | 55,366 | 55,367 | 55,368 | 55,369 | 55,370 | 55,371 | 55,372 | 55,373 | 55,374 | 55,375 |
| | 2-316 | 55,389 | 55,390 | 55,391 | 55,392 | 55,393 | 55,394 | 55,395 | 55,396 | 55,397 | 55,398 | 55,399 | 55,400 |
| | 2-317 | 55,414 | 55,415 | 55,416 | 55,417 | 55,418 | 55,419 | 55,420 | 55,421 | 55,422 | 55,423 | 55,424 | 55,425 |
| | 2-318 | 55,439 | 55,440 | 55,441 | 55,442 | 55,443 | 55,444 | 55,445 | 55,446 | 55,447 | 55,448 | 55,449 | 55,450 |
| | 2-319 | 55,464 | 55,465 | 55,466 | 55,467 | 55,468 | 55,469 | 55,470 | 55,471 | 55,472 | 55,473 | 55,474 | 55,475 |
| | 2-320 | 55,489 | 55,490 | 55,491 | 55,492 | 55,493 | 55,494 | 55,495 | 55,496 | 55,497 | 55,498 | 55,499 | 55,500 |
| | 2-321 | 55,514 | 55,515 | 55,516 | 55,517 | 55,518 | 55,519 | 55,520 | 55,521 | 55,522 | 55,523 | 55,524 | 55,525 |
| | 2-322 | 55,539 | 55,540 | 55,541 | 55,542 | 55,543 | 55,544 | 55,545 | 55,546 | 55,547 | 55,548 | 55,549 | 55,550 |
| | 2-323 | 55,564 | 55,565 | 55,566 | 55,567 | 55,568 | 55,569 | 55,570 | 55,571 | 55,572 | 55,573 | 55,574 | 55,575 |
| | 2-324 | 55,589 | 55,590 | 55,591 | 55,592 | 55,593 | 55,594 | 55,595 | 55,596 | 55,597 | 55,598 | 55,599 | 55,600 |
| | 2-325 | 55,614 | 55,615 | 55,616 | 55,617 | 55,618 | 55,619 | 55,620 | 55,621 | 55,622 | 55,623 | 55,624 | 55,625 |
| | 2-326 | 55,639 | 55,640 | 55,641 | 55,642 | 55,643 | 55,644 | 55,645 | 55,646 | 55,647 | 55,648 | 55,649 | 55,650 |
| | 2-327 | 55,664 | 55,665 | 55,666 | 55,667 | 55,668 | 55,669 | 55,670 | 55,671 | 55,672 | 55,673 | 55,674 | 55,675 |
| | 2-328 | 55,689 | 55,690 | 55,691 | 55,692 | 55,693 | 55,694 | 55,695 | 55,696 | 55,697 | 55,698 | 55,699 | 55,700 |
| | 2-329 | 55,714 | 55,715 | 55,716 | 55,717 | 55,718 | 55,719 | 55,720 | 55,721 | 55,722 | 55,723 | 55,724 | 55,725 |
| | 2-330 | 55,739 | 55,740 | 55,741 | 55,742 | 55,743 | 55,744 | 55,745 | 55,746 | 55,747 | 55,748 | 55,749 | 55,750 |

TABLE 43

| | | Compound represented by the formula (1) | | | | | | | | | | | | |
|---|---|---|---|---|---|---|---|---|---|---|---|---|---|---|
| | | 1-101 | 1-102 | 1-103 | 1-104 | 1-105 | 1-106 | 1-107 | 1-108 | 1-109 | 1-110 | 1-111 | 1-112 | 1-113 |
| Compound represented by the formula (2) | 2-331 | 55,751 | 55,752 | 55,753 | 55,754 | 55,755 | 55,756 | 55,757 | 55,758 | 55,759 | 55,760 | 55,761 | 55,762 | 55,763 |
| | 2-332 | 55,776 | 55,777 | 55,778 | 55,779 | 55,780 | 55,781 | 55,782 | 55,783 | 55,784 | 55,785 | 55,786 | 55,787 | 55,788 |
| | 2-333 | 55,801 | 55,802 | 55,803 | 55,804 | 55,805 | 55,806 | 55,807 | 55,808 | 55,809 | 55,810 | 55,811 | 55,812 | 55,813 |
| | 2-334 | 55,826 | 55,827 | 55,828 | 55,829 | 55,830 | 55,831 | 55,832 | 55,833 | 55,834 | 55,835 | 55,836 | 55,837 | 55,838 |
| | 2-335 | 55,851 | 55,852 | 55,853 | 55,854 | 55,855 | 55,856 | 55,857 | 55,858 | 55,859 | 55,860 | 55,861 | 55,862 | 55,863 |
| | 2-336 | 55,876 | 55,877 | 55,878 | 55,879 | 55,880 | 55,881 | 55,882 | 55,883 | 55,884 | 55,885 | 55,886 | 55,887 | 55,888 |
| | 2-337 | 55,901 | 55,902 | 55,903 | 55,904 | 55,905 | 55,906 | 55,907 | 55,908 | 55,909 | 55,910 | 55,911 | 55,912 | 55,913 |
| | 2-338 | 55,926 | 55,927 | 55,928 | 55,929 | 55,930 | 55,931 | 55,932 | 55,933 | 55,934 | 55,935 | 55,936 | 55,937 | 55,938 |
| | 2-339 | 55,951 | 55,952 | 55,953 | 55,954 | 55,955 | 55,956 | 55,957 | 55,958 | 55,959 | 55,960 | 55,961 | 55,962 | 55,963 |
| | 2-340 | 55,976 | 55,977 | 55,978 | 55,979 | 55,980 | 55,981 | 55,982 | 55,983 | 55,984 | 55,985 | 55,986 | 55,987 | 55,988 |
| | 2-341 | 56,001 | 56,002 | 56,003 | 56,004 | 56,005 | 56,006 | 56,007 | 56,008 | 56,009 | 56,010 | 56,011 | 56,012 | 56,013 |
| | 2-342 | 56,026 | 56,027 | 56,028 | 56,029 | 56,030 | 56,031 | 56,032 | 56,033 | 56,034 | 56,035 | 56,036 | 56,037 | 56,038 |
| | 2-343 | 56,051 | 56,052 | 56,053 | 56,054 | 56,055 | 56,056 | 56,057 | 56,058 | 56,059 | 56,060 | 56,061 | 56,062 | 56,063 |
| | 2-344 | 56,076 | 56,077 | 56,078 | 56,079 | 56,080 | 56,081 | 56,082 | 56,083 | 56,084 | 56,085 | 56,086 | 56,087 | 56,088 |
| | 2-345 | 56,101 | 56,102 | 56,103 | 56,104 | 56,105 | 56,106 | 56,107 | 56,108 | 56,109 | 56,110 | 56,111 | 56,112 | 56,113 |
| | 2-346 | 56,126 | 56,127 | 56,128 | 56,129 | 56,130 | 56,131 | 56,132 | 56,133 | 56,134 | 56,135 | 56,136 | 56,137 | 56,138 |
| | 2-347 | 56,151 | 56,152 | 56,153 | 56,154 | 56,155 | 56,156 | 56,157 | 56,158 | 56,159 | 56,160 | 56,161 | 56,162 | 56,163 |
| | 2-348 | 56,176 | 56,177 | 56,178 | 56,179 | 56,180 | 56,181 | 56,182 | 56,183 | 56,184 | 56,185 | 56,186 | 56,187 | 56,188 |
| | 2-349 | 56,201 | 56,202 | 56,203 | 56,204 | 56,205 | 56,206 | 56,207 | 56,208 | 56,209 | 56,210 | 56,211 | 56,212 | 56,213 |
| | 2-350 | 56,226 | 56,227 | 56,228 | 56,229 | 56,230 | 56,231 | 56,232 | 56,233 | 56,234 | 56,235 | 56,236 | 56,237 | 56,238 |
| | 2-351 | 56,251 | 56,252 | 56,253 | 56,254 | 56,255 | 56,256 | 56,257 | 56,258 | 56,259 | 56,260 | 56,261 | 56,262 | 56,263 |

TABLE 43-continued

| | | | | | | | | | | | | | |
|---|---|---|---|---|---|---|---|---|---|---|---|---|---|
| 2-352 | 56,276 | 56,277 | 56,278 | 56,279 | 56,280 | 56,281 | 56,282 | 56,283 | 56,284 | 56,285 | 56,286 | 56,287 | 56,288 |
| 2-353 | 56,301 | 56,302 | 56,303 | 56,304 | 56,305 | 56,306 | 56,307 | 56,308 | 56,309 | 56,310 | 56,311 | 56,312 | 56,313 |
| 2-354 | 56,326 | 56,327 | 56,328 | 56,329 | 56,330 | 56,331 | 56,332 | 56,333 | 56,334 | 56,335 | 56,336 | 56,337 | 56,338 |
| 2-355 | 56,351 | 56,352 | 56,353 | 56,354 | 56,355 | 56,356 | 56,357 | 56,358 | 56,359 | 56,360 | 56,361 | 56,362 | 56,363 |
| 2-356 | 56,376 | 56,377 | 56,378 | 56,379 | 56,380 | 56,381 | 56,382 | 56,383 | 56,384 | 56,385 | 56,386 | 56,387 | 56,388 |
| 2-357 | 56,401 | 56,402 | 56,403 | 56,404 | 56,405 | 56,406 | 56,407 | 56,408 | 56,409 | 56,410 | 56,411 | 56,412 | 56,413 |
| 2-358 | 56,426 | 56,427 | 56,428 | 56,429 | 56,430 | 56,431 | 56,432 | 56,433 | 56,434 | 56,435 | 56,436 | 56,437 | 56,438 |
| 2-359 | 56,451 | 56,452 | 56,453 | 56,454 | 56,455 | 56,456 | 56,457 | 56,458 | 56,459 | 56,460 | 56,461 | 56,462 | 56,463 |
| 2-360 | 56,476 | 56,477 | 56,478 | 56,479 | 56,480 | 56,481 | 56,482 | 56,483 | 56,484 | 56,485 | 56,486 | 56,487 | 56,488 |
| 2-361 | 56,501 | 56,502 | 56,503 | 56,504 | 56,505 | 56,506 | 56,507 | 56,508 | 56,509 | 56,510 | 56,511 | 56,512 | 56,513 |
| 2-362 | 56,526 | 56,527 | 56,528 | 56,529 | 56,530 | 56,531 | 56,532 | 56,533 | 56,534 | 56,535 | 56,536 | 56,537 | 56,538 |
| 2-363 | 56,551 | 56,552 | 56,553 | 56,554 | 56,555 | 56,556 | 56,557 | 56,558 | 56,559 | 56,560 | 56,561 | 56,562 | 56,563 |
| 2-364 | 56,576 | 56,577 | 56,578 | 56,579 | 56,580 | 56,581 | 56,582 | 56,583 | 56,584 | 56,585 | 56,586 | 56,587 | 56,588 |
| 2-365 | 56,601 | 56,602 | 56,603 | 56,604 | 56,605 | 56,606 | 56,607 | 56,608 | 56,609 | 56,610 | 56,611 | 56,612 | 56,613 |
| 2-366 | 56,626 | 56,627 | 56,628 | 56,629 | 56,630 | 56,631 | 56,632 | 56,633 | 56,634 | 56,635 | 56,636 | 56,637 | 56,638 |
| 2-367 | 56,651 | 56,652 | 56,653 | 56,654 | 56,655 | 56,656 | 56,657 | 56,658 | 56,659 | 56,660 | 56,661 | 56,662 | 56,663 |
| 2-368 | 56,676 | 56,677 | 56,678 | 56,679 | 56,680 | 56,681 | 56,682 | 56,683 | 56,684 | 56,685 | 56,686 | 56,687 | 56,688 |
| 2-369 | 56,701 | 56,702 | 56,703 | 56,704 | 56,705 | 56,706 | 56,707 | 56,708 | 56,709 | 56,710 | 56,711 | 56,712 | 56,713 |
| 2-370 | 56,726 | 56,727 | 56,728 | 56,729 | 56,730 | 56,731 | 56,732 | 56,733 | 56,734 | 56,735 | 56,736 | 56,737 | 56,738 |
| 2-371 | 56,751 | 56,752 | 56,753 | 56,754 | 56,755 | 56,756 | 56,757 | 56,758 | 56,759 | 56,760 | 56,761 | 56,762 | 56,763 |
| 2-372 | 56,776 | 56,777 | 56,778 | 56,779 | 56,780 | 56,781 | 56,782 | 56,783 | 56,784 | 56,785 | 56,786 | 56,787 | 56,788 |
| 2-373 | 56,801 | 56,802 | 56,803 | 56,804 | 56,805 | 56,806 | 56,807 | 56,808 | 56,809 | 56,810 | 56,811 | 56,812 | 56,813 |
| 2-374 | 56,826 | 56,827 | 56,828 | 56,829 | 56,830 | 56,831 | 56,832 | 56,833 | 56,834 | 56,835 | 56,836 | 56,837 | 56,838 |
| 2-375 | 56,851 | 56,852 | 56,853 | 56,854 | 56,855 | 56,856 | 56,857 | 56,858 | 56,859 | 56,860 | 56,861 | 56,862 | 56,863 |
| 2-376 | 56,876 | 56,877 | 56,878 | 56,879 | 56,880 | 56,881 | 56,882 | 56,883 | 56,884 | 56,885 | 56,886 | 56,887 | 56,888 |
| 2-377 | 56,901 | 56,902 | 56,903 | 56,904 | 56,905 | 56,906 | 56,907 | 56,908 | 56,909 | 56,910 | 56,911 | 56,912 | 56,913 |
| 2-378 | 56,926 | 56,927 | 56,928 | 56,929 | 56,930 | 56,931 | 56,932 | 56,933 | 56,934 | 56,935 | 56,936 | 56,937 | 56,938 |
| 2-379 | 56,951 | 56,952 | 56,953 | 56,954 | 56,955 | 56,956 | 56,957 | 56,958 | 56,959 | 56,960 | 56,961 | 56,962 | 56,963 |
| 2-380 | 56,976 | 56,977 | 56,978 | 56,979 | 56,980 | 56,981 | 56,982 | 56,983 | 56,984 | 56,985 | 56,986 | 56,987 | 56,988 |
| 2-381 | 57,001 | 57,002 | 57,003 | 57,004 | 57,005 | 57,006 | 57,007 | 57,008 | 57,009 | 57,010 | 57,011 | 57,012 | 57,013 |
| 2-382 | 57,026 | 57,027 | 57,028 | 57,029 | 57,030 | 57,031 | 57,032 | 57,033 | 57,034 | 57,035 | 57,036 | 57,037 | 57,038 |
| 2-383 | 57,051 | 57,052 | 57,053 | 57,054 | 57,055 | 57,056 | 57,057 | 57,058 | 57,059 | 57,060 | 57,061 | 57,062 | 57,063 |
| 2-384 | 57,076 | 57,077 | 57,078 | 57,079 | 57,080 | 57,081 | 57,082 | 57,083 | 57,084 | 57,085 | 57,086 | 57,087 | 57,088 |
| 2-385 | 57,101 | 57,102 | 57,103 | 57,104 | 57,105 | 57,106 | 57,107 | 57,108 | 57,109 | 57,110 | 57,111 | 57,112 | 57,113 |

| | | Compound represented by the formula (1) | | | | | | | | | | | |
|---|---|---|---|---|---|---|---|---|---|---|---|---|---|
| | | 1-114 | 1-115 | 1-116 | 1-117 | 1-118 | 1-119 | 1-120 | 1-121 | 1-122 | 1-123 | 1-124 | 1-125 |
| Compound represented by the formula (2) | 2-331 | 55,764 | 55,765 | 55,766 | 55,767 | 55,768 | 55,769 | 55,770 | 55,771 | 55,772 | 55,773 | 55,774 | 55,775 |
| | 2-332 | 55,789 | 55,790 | 55,791 | 55,792 | 55,793 | 55,794 | 55,795 | 55,796 | 55,797 | 55,798 | 55,799 | 55,800 |
| | 2-333 | 55,814 | 55,815 | 55,816 | 55,817 | 55,818 | 55,819 | 55,820 | 55,821 | 55,822 | 55,823 | 55,824 | 55,825 |
| | 2-334 | 55,839 | 55,840 | 55,841 | 55,842 | 55,843 | 55,844 | 55,845 | 55,846 | 55,847 | 55,848 | 55,849 | 55,850 |
| | 2-335 | 55,864 | 55,865 | 55,866 | 55,867 | 55,868 | 55,869 | 55,870 | 55,871 | 55,872 | 55,873 | 55,874 | 55,875 |
| | 2-336 | 55,889 | 55,890 | 55,891 | 55,892 | 55,893 | 55,894 | 55,895 | 55,896 | 55,897 | 55,898 | 55,899 | 55,900 |
| | 2-337 | 55,914 | 55,915 | 55,916 | 55,917 | 55,918 | 55,919 | 55,920 | 55,921 | 55,922 | 55,923 | 55,924 | 55,925 |
| | 2-338 | 55,939 | 55,940 | 55,941 | 55,942 | 55,943 | 55,944 | 55,945 | 55,946 | 55,947 | 55,948 | 55,949 | 55,950 |
| | 2-339 | 55,964 | 55,965 | 55,966 | 55,967 | 55,968 | 55,969 | 55,970 | 55,971 | 55,972 | 55,973 | 55,974 | 55,975 |
| | 2-340 | 55,989 | 55,990 | 55,991 | 55,992 | 55,993 | 55,994 | 55,995 | 55,996 | 55,997 | 55,998 | 55,999 | 56,000 |
| | 2-341 | 56,014 | 56,015 | 56,016 | 56,017 | 56,018 | 56,019 | 56,020 | 56,021 | 56,022 | 56,023 | 56,024 | 56,025 |
| | 2-342 | 56,039 | 56,040 | 56,041 | 56,042 | 56,043 | 56,044 | 56,045 | 56,046 | 56,047 | 56,048 | 56,049 | 56,050 |
| | 2-343 | 56,064 | 56,065 | 56,066 | 56,067 | 56,068 | 56,069 | 56,070 | 56,071 | 56,072 | 56,073 | 56,074 | 56,075 |
| | 2-344 | 56,089 | 56,090 | 56,091 | 56,092 | 56,093 | 56,094 | 56,095 | 56,096 | 56,097 | 56,098 | 56,099 | 56,100 |
| | 2-345 | 56,114 | 56,115 | 56,116 | 56,117 | 56,118 | 56,119 | 56,120 | 56,121 | 56,122 | 56,123 | 56,124 | 56,125 |
| | 2-346 | 56,139 | 56,140 | 56,141 | 56,142 | 56,143 | 56,144 | 56,145 | 56,146 | 56,147 | 56,148 | 56,149 | 56,150 |
| | 2-347 | 56,164 | 56,165 | 56,166 | 56,167 | 56,168 | 56,169 | 56,170 | 56,171 | 56,172 | 56,173 | 56,174 | 56,175 |
| | 2-348 | 56,189 | 56,190 | 56,191 | 56,192 | 56,193 | 56,194 | 56,195 | 56,196 | 56,197 | 56,198 | 56,199 | 56,200 |
| | 2-349 | 56,214 | 56,215 | 56,216 | 56,217 | 56,218 | 56,219 | 56,220 | 56,221 | 56,222 | 56,223 | 56,224 | 56,225 |
| | 2-350 | 56,239 | 56,240 | 56,241 | 56,242 | 56,243 | 56,244 | 56,245 | 56,246 | 56,247 | 56,248 | 56,249 | 56,250 |
| | 2-351 | 56,264 | 56,265 | 56,266 | 56,267 | 56,268 | 56,269 | 56,270 | 56,271 | 56,272 | 56,273 | 56,274 | 56,275 |
| | 2-352 | 56,289 | 56,290 | 56,291 | 56,292 | 56,293 | 56,294 | 56,295 | 56,296 | 56,297 | 56,298 | 56,299 | 56,300 |
| | 2-353 | 56,314 | 56,315 | 56,316 | 56,317 | 56,318 | 56,319 | 56,320 | 56,321 | 56,322 | 56,323 | 56,324 | 56,325 |
| | 2-354 | 56,339 | 56,340 | 56,341 | 56,342 | 56,343 | 56,344 | 56,345 | 56,346 | 56,347 | 56,348 | 56,349 | 56,350 |
| | 2-355 | 56,364 | 56,365 | 56,366 | 56,367 | 56,368 | 56,369 | 56,370 | 56,371 | 56,372 | 56,373 | 56,374 | 56,375 |
| | 2-356 | 56,389 | 56,390 | 56,391 | 56,392 | 56,393 | 56,394 | 56,395 | 56,396 | 56,397 | 56,398 | 56,399 | 56,400 |
| | 2-357 | 56,414 | 56,415 | 56,416 | 56,417 | 56,418 | 56,419 | 56,420 | 56,421 | 56,422 | 56,423 | 56,424 | 56,425 |
| | 2-358 | 56,439 | 56,440 | 56,441 | 56,442 | 56,443 | 56,444 | 56,445 | 56,446 | 56,447 | 56,448 | 56,449 | 56,450 |
| | 2-359 | 56,464 | 56,465 | 56,466 | 56,467 | 56,468 | 56,469 | 56,470 | 56,471 | 56,472 | 56,473 | 56,474 | 56,475 |
| | 2-360 | 56,489 | 56,490 | 56,491 | 56,492 | 56,493 | 56,494 | 56,495 | 56,496 | 56,497 | 56,498 | 56,499 | 56,500 |
| | 2-361 | 56,514 | 56,515 | 56,516 | 56,517 | 56,518 | 56,519 | 56,520 | 56,521 | 56,522 | 56,523 | 56,524 | 56,525 |
| | 2-362 | 56,539 | 56,540 | 56,541 | 56,542 | 56,543 | 56,544 | 56,545 | 56,546 | 56,547 | 56,548 | 56,549 | 56,550 |
| | 2-363 | 56,564 | 56,565 | 56,566 | 56,567 | 56,568 | 56,569 | 56,570 | 56,571 | 56,572 | 56,573 | 56,574 | 56,575 |
| | 2-364 | 56,589 | 56,590 | 56,591 | 56,592 | 56,593 | 56,594 | 56,595 | 56,596 | 56,597 | 56,598 | 56,599 | 56,600 |
| | 2-365 | 56,614 | 56,615 | 56,616 | 56,617 | 56,618 | 56,619 | 56,620 | 56,621 | 56,622 | 56,623 | 56,624 | 56,625 |
| | 2-366 | 56,639 | 56,640 | 56,641 | 56,642 | 56,643 | 56,644 | 56,645 | 56,646 | 56,647 | 56,648 | 56,649 | 56,650 |
| | 2-367 | 56,664 | 56,665 | 56,666 | 56,667 | 56,668 | 56,669 | 56,670 | 56,671 | 56,672 | 56,673 | 56,674 | 56,675 |
| | 2-368 | 56,689 | 56,690 | 56,691 | 56,692 | 56,693 | 56,694 | 56,695 | 56,696 | 56,697 | 56,698 | 56,699 | 56,700 |
| | 2-369 | 56,714 | 56,715 | 56,716 | 56,717 | 56,718 | 56,719 | 56,720 | 56,721 | 56,722 | 56,723 | 56,724 | 56,725 |
| | 2-370 | 56,739 | 56,740 | 56,741 | 56,742 | 56,743 | 56,744 | 56,745 | 56,746 | 56,747 | 56,748 | 56,749 | 56,750 |
| | 2-371 | 56,764 | 56,765 | 56,766 | 56,767 | 56,768 | 56,769 | 56,770 | 56,771 | 56,772 | 56,773 | 56,774 | 56,775 |

TABLE 43-continued

| | | | | | | | | | | | | |
|---|---|---|---|---|---|---|---|---|---|---|---|---|
| 2-372 | 56,789 | 56,790 | 56,791 | 56,792 | 56,793 | 56,794 | 56,795 | 56,796 | 56,797 | 56,798 | 56,799 | 56,800 |
| 2-373 | 56,814 | 56,815 | 56,816 | 56,817 | 56,818 | 56,819 | 56,820 | 56,821 | 56,822 | 56,823 | 56,824 | 56,825 |
| 2-374 | 56,839 | 56,840 | 56,841 | 56,842 | 56,843 | 56,844 | 56,845 | 56,846 | 56,847 | 56,848 | 56,849 | 56,850 |
| 2-375 | 56,864 | 56,865 | 56,866 | 56,867 | 56,868 | 56,869 | 56,870 | 56,871 | 56,872 | 56,873 | 56,874 | 56,875 |
| 2-376 | 56,889 | 56,890 | 56,891 | 56,892 | 56,893 | 56,894 | 56,895 | 56,896 | 56,897 | 56,898 | 56,899 | 56,900 |
| 2-377 | 56,914 | 56,915 | 56,916 | 56,917 | 56,918 | 56,919 | 56,920 | 56,921 | 56,922 | 56,923 | 56,924 | 56,925 |
| 2-378 | 56,939 | 56,940 | 56,941 | 56,942 | 56,943 | 56,944 | 56,945 | 56,946 | 56,947 | 56,948 | 56,949 | 56,950 |
| 2-379 | 56,964 | 56,965 | 56,966 | 56,967 | 56,968 | 56,969 | 56,970 | 56,971 | 56,972 | 56,973 | 56,974 | 56,975 |
| 2-380 | 56,989 | 56,990 | 56,991 | 56,992 | 56,993 | 56,994 | 56,995 | 56,996 | 56,997 | 56,998 | 56,999 | 57,000 |
| 2-381 | 57,014 | 57,015 | 57,016 | 57,017 | 57,018 | 57,019 | 57,020 | 57,021 | 57,022 | 57,023 | 57,024 | 57,025 |
| 2-382 | 57,039 | 57,040 | 57,041 | 57,042 | 57,043 | 57,044 | 57,045 | 57,046 | 57,047 | 57,048 | 57,049 | 57,050 |
| 2-383 | 57,064 | 57,065 | 57,066 | 57,067 | 57,068 | 57,069 | 57,070 | 57,071 | 57,072 | 57,073 | 57,074 | 57,075 |
| 2-384 | 57,089 | 57,090 | 57,091 | 57,092 | 57,093 | 57,094 | 57,095 | 57,096 | 57,097 | 57,098 | 57,099 | 57,100 |
| 2-385 | 57,114 | 57,115 | 57,116 | 57,117 | 57,118 | 57,119 | 57,120 | 57,121 | 57,122 | 57,123 | 57,124 | 57,125 |

TABLE 44

| | | Compound represented by the formula (1) | | | | | | | | | | | | |
|---|---|---|---|---|---|---|---|---|---|---|---|---|---|---|
| | | 1-101 | 1-102 | 1-103 | 1-104 | 1-105 | 1-106 | 1-107 | 1-108 | 1-109 | 1-110 | 1-111 | 1-112 | 1-113 |
| Compound represented by the formula (2) | 2-386 | 57,126 | 57,127 | 57,128 | 57,129 | 57,130 | 57,131 | 57,132 | 57,133 | 57,134 | 57,135 | 57,136 | 57,137 | 57,138 |
| | 2-387 | 57,151 | 57,152 | 57,153 | 57,154 | 57,155 | 57,156 | 57,157 | 57,158 | 57,159 | 57,160 | 57,161 | 57,162 | 57,163 |
| | 2-388 | 57,176 | 57,177 | 57,178 | 57,179 | 57,180 | 57,181 | 57,182 | 57,183 | 57,184 | 57,185 | 57,186 | 57,187 | 57,188 |
| | 2-389 | 57,201 | 57,202 | 57,203 | 57,204 | 57,205 | 57,206 | 57,207 | 57,208 | 57,209 | 57,210 | 57,211 | 57,212 | 57,213 |
| | 2-390 | 57,226 | 57,227 | 57,228 | 57,229 | 57,230 | 57,231 | 57,232 | 57,233 | 57,234 | 57,235 | 57,236 | 57,237 | 57,238 |
| | 2-391 | 57,251 | 57,252 | 57,253 | 57,254 | 57,255 | 57,256 | 57,257 | 57,258 | 57,259 | 57,260 | 57,261 | 57,262 | 57,263 |
| | 2-392 | 57,276 | 57,277 | 57,278 | 57,279 | 57,280 | 57,281 | 57,282 | 57,283 | 57,284 | 57,285 | 57,286 | 57,287 | 57,288 |
| | 2-393 | 57,301 | 57,302 | 57,303 | 57,304 | 57,305 | 57,306 | 57,307 | 57,308 | 57,309 | 57,310 | 57,311 | 57,312 | 57,313 |
| | 2-394 | 57,326 | 57,327 | 57,328 | 57,329 | 57,330 | 57,331 | 57,332 | 57,333 | 57,334 | 57,335 | 57,336 | 57,337 | 57,338 |
| | 2-395 | 57,351 | 57,352 | 57,353 | 57,354 | 57,355 | 57,356 | 57,357 | 57,358 | 57,359 | 57,360 | 57,361 | 57,362 | 57,363 |
| | 2-396 | 57,376 | 57,377 | 57,378 | 57,379 | 57,380 | 57,381 | 57,382 | 57,383 | 57,384 | 57,385 | 57,386 | 57,387 | 57,388 |
| | 2-397 | 57,401 | 57,402 | 57,403 | 57,404 | 57,405 | 57,406 | 57,407 | 57,408 | 57,409 | 57,410 | 57,411 | 57,412 | 57,413 |
| | 2-398 | 57,426 | 57,427 | 57,428 | 57,429 | 57,430 | 57,431 | 57,432 | 57,433 | 57,434 | 57,435 | 57,436 | 57,437 | 57,438 |
| | 2-399 | 57,451 | 57,452 | 57,453 | 57,454 | 57,455 | 57,456 | 57,457 | 57,458 | 57,459 | 57,460 | 57,461 | 57,462 | 57,463 |
| | 2-400 | 57,476 | 57,477 | 57,478 | 57,479 | 57,480 | 57,481 | 57,482 | 57,483 | 57,484 | 57,485 | 57,486 | 57,487 | 57,488 |
| | 2-401 | 57,501 | 57,502 | 57,503 | 57,504 | 57,505 | 57,506 | 57,507 | 57,508 | 57,509 | 57,510 | 57,511 | 57,512 | 57,513 |
| | 2-402 | 57,526 | 57,527 | 57,528 | 57,529 | 57,530 | 57,531 | 57,532 | 57,533 | 57,534 | 57,535 | 57,536 | 57,537 | 57,538 |
| | 2-403 | 57,551 | 57,552 | 57,553 | 57,554 | 57,555 | 57,556 | 57,557 | 57,558 | 57,559 | 57,560 | 57,561 | 57,562 | 57,563 |
| | 2-404 | 57,576 | 57,577 | 57,578 | 57,579 | 57,580 | 57,581 | 57,582 | 57,583 | 57,584 | 57,585 | 57,586 | 57,587 | 57,588 |
| | 2-405 | 57,601 | 57,602 | 57,603 | 57,604 | 57,605 | 57,606 | 57,607 | 57,608 | 57,609 | 57,610 | 57,611 | 57,612 | 57,613 |
| | 2-406 | 57,626 | 57,627 | 57,628 | 57,629 | 57,630 | 57,631 | 57,632 | 57,633 | 57,634 | 57,635 | 57,636 | 57,637 | 57,638 |
| | 2-407 | 57,651 | 57,652 | 57,653 | 57,654 | 57,655 | 57,656 | 57,657 | 57,658 | 57,659 | 57,660 | 57,661 | 57,662 | 57,663 |
| | 2-408 | 57,676 | 57,677 | 57,678 | 57,679 | 57,680 | 57,681 | 57,682 | 57,683 | 57,684 | 57,685 | 57,686 | 57,687 | 57,688 |
| | 2-409 | 57,701 | 57,702 | 57,703 | 57,704 | 57,705 | 57,706 | 57,707 | 57,708 | 57,709 | 57,710 | 57,711 | 57,712 | 57,713 |
| | 2-410 | 57,726 | 57,727 | 57,728 | 57,729 | 57,730 | 57,731 | 57,732 | 57,733 | 57,734 | 57,735 | 57,736 | 57,737 | 57,738 |
| | 2-411 | 57,751 | 57,752 | 57,753 | 57,754 | 57,755 | 57,756 | 57,757 | 57,758 | 57,759 | 57,760 | 57,761 | 57,762 | 57,763 |
| | 2-412 | 57,776 | 57,777 | 57,778 | 57,779 | 57,780 | 57,781 | 57,782 | 57,783 | 57,784 | 57,785 | 57,786 | 57,787 | 57,788 |
| | 2-413 | 57,801 | 57,802 | 57,803 | 57,804 | 57,805 | 57,806 | 57,807 | 57,808 | 57,809 | 57,810 | 57,811 | 57,812 | 57,813 |
| | 2-414 | 57,826 | 57,827 | 57,828 | 57,829 | 57,830 | 57,831 | 57,832 | 57,833 | 57,834 | 57,835 | 57,836 | 57,837 | 57,838 |
| | 2-415 | 57,851 | 57,852 | 57,853 | 57,854 | 57,855 | 57,856 | 57,857 | 57,858 | 57,859 | 57,860 | 57,861 | 57,862 | 57,863 |
| | 2-416 | 57,876 | 57,877 | 57,878 | 57,879 | 57,880 | 57,881 | 57,882 | 57,883 | 57,884 | 57,885 | 57,886 | 57,887 | 57,888 |
| | 2-417 | 57,901 | 57,902 | 57,903 | 57,904 | 57,905 | 57,906 | 57,907 | 57,908 | 57,909 | 57,910 | 57,911 | 57,912 | 57,913 |
| | 2-418 | 57,926 | 57,927 | 57,928 | 57,929 | 57,930 | 57,931 | 57,932 | 57,933 | 57,934 | 57,935 | 57,936 | 57,937 | 57,938 |
| | 2-419 | 57,951 | 57,952 | 57,953 | 57,954 | 57,955 | 57,956 | 57,957 | 57,958 | 57,959 | 57,960 | 57,961 | 57,962 | 57,963 |
| | 2-420 | 57,976 | 57,977 | 57,978 | 57,979 | 57,980 | 57,981 | 57,982 | 57,983 | 57,984 | 57,985 | 57,986 | 57,987 | 57,988 |
| | 2-421 | 58,001 | 58,002 | 58,003 | 58,004 | 58,005 | 58,006 | 58,007 | 58,008 | 58,009 | 58,010 | 58,011 | 58,012 | 58,013 |
| | 2-422 | 58,026 | 58,027 | 58,028 | 58,029 | 58,030 | 58,031 | 58,032 | 58,033 | 58,034 | 58,035 | 58,036 | 58,037 | 58,038 |
| | 2-423 | 58,051 | 58,052 | 58,053 | 58,054 | 58,055 | 58,056 | 58,057 | 58,058 | 58,059 | 58,060 | 58,061 | 58,062 | 58,063 |
| | 2-424 | 58,076 | 58,077 | 58,078 | 58,079 | 58,080 | 58,081 | 58,082 | 58,083 | 58,084 | 58,085 | 58,086 | 58,087 | 58,088 |
| | 2-425 | 58,101 | 58,102 | 58,103 | 58,104 | 58,105 | 58,106 | 58,107 | 58,108 | 58,109 | 58,110 | 58,111 | 58,112 | 58,113 |
| | 2-426 | 58,126 | 58,127 | 58,128 | 58,129 | 58,130 | 58,131 | 58,132 | 58,133 | 58,134 | 58,135 | 58,136 | 58,137 | 58,138 |
| | 2-427 | 58,151 | 58,152 | 58,153 | 58,154 | 58,155 | 58,156 | 58,157 | 58,158 | 58,159 | 58,160 | 58,161 | 58,162 | 58,163 |
| | 2-428 | 58,176 | 58,177 | 58,178 | 58,179 | 58,180 | 58,181 | 58,182 | 58,183 | 58,184 | 58,185 | 58,186 | 58,187 | 58,188 |
| | 2-429 | 58,201 | 58,202 | 58,203 | 58,204 | 58,205 | 58,206 | 58,207 | 58,208 | 58,209 | 58,210 | 58,211 | 58,212 | 58,213 |
| | 2-430 | 58,226 | 58,227 | 58,228 | 58,229 | 58,230 | 58,231 | 58,232 | 58,233 | 58,234 | 58,235 | 58,236 | 58,237 | 58,238 |
| | 2-431 | 58,251 | 58,252 | 58,253 | 58,254 | 58,255 | 58,256 | 58,257 | 58,258 | 58,259 | 58,260 | 58,261 | 58,262 | 58,263 |
| | 2-432 | 58,276 | 58,277 | 58,278 | 58,279 | 58,280 | 58,281 | 58,282 | 58,283 | 58,284 | 58,285 | 58,286 | 58,287 | 58,288 |
| | 2-433 | 58,301 | 58,302 | 58,303 | 58,304 | 58,305 | 58,306 | 58,307 | 58,308 | 58,309 | 58,310 | 58,311 | 58,312 | 58,313 |
| | 2-434 | 58,326 | 58,327 | 58,328 | 58,329 | 58,330 | 58,331 | 58,332 | 58,333 | 58,334 | 58,335 | 58,336 | 58,337 | 58,338 |
| | 2-435 | 58,351 | 58,352 | 58,353 | 58,354 | 58,355 | 58,356 | 58,357 | 58,358 | 58,359 | 58,360 | 58,361 | 58,362 | 58,363 |
| | 2-436 | 58,376 | 58,377 | 58,378 | 58,379 | 58,380 | 58,381 | 58,382 | 58,383 | 58,384 | 58,385 | 58,386 | 58,387 | 58,388 |
| | 2-437 | 58,401 | 58,402 | 58,403 | 58,404 | 58,405 | 58,406 | 58,407 | 58,408 | 58,409 | 58,410 | 58,411 | 58,412 | 58,413 |
| | 2-438 | 58,426 | 58,427 | 58,428 | 58,429 | 58,430 | 58,431 | 58,432 | 58,433 | 58,434 | 58,435 | 58,436 | 58,437 | 58,438 |
| | 2-439 | 58,451 | 58,452 | 58,453 | 58,454 | 58,455 | 58,456 | 58,457 | 58,458 | 58,459 | 58,460 | 58,461 | 58,462 | 58,463 |
| | 2-440 | 58,476 | 58,477 | 58,478 | 58,479 | 58,480 | 58,481 | 58,482 | 58,483 | 58,484 | 58,485 | 58,486 | 58,487 | 58,488 |

TABLE 44-continued

| | | Compound represented by the formula (1) | | | | | | | | | | | |
|---|---|---|---|---|---|---|---|---|---|---|---|---|---|
| | | 1-114 | 1-115 | 1-116 | 1-117 | 1-118 | 1-119 | 1-120 | 1-121 | 1-122 | 1-123 | 1-124 | 1-125 |
| Compound represented by the formula (2) | 2-386 | 57,139 | 57,140 | 57,141 | 57,142 | 57,143 | 57,144 | 57,145 | 57,146 | 57,147 | 57,148 | 57,149 | 57,150 |
| | 2-387 | 57,164 | 57,165 | 57,166 | 57,167 | 57,168 | 57,169 | 57,170 | 57,171 | 57,172 | 57,173 | 57,174 | 57,175 |
| | 2-388 | 57,189 | 57,190 | 57,191 | 57,192 | 57,193 | 57,194 | 57,195 | 57,196 | 57,197 | 57,198 | 57,199 | 57,200 |
| | 2-389 | 57,214 | 57,215 | 57,216 | 57,217 | 57,218 | 57,219 | 57,220 | 57,221 | 57,222 | 57,223 | 57,224 | 57,225 |
| | 2-390 | 57,239 | 57,240 | 57,241 | 57,242 | 57,243 | 57,244 | 57,245 | 57,246 | 57,247 | 57,248 | 57,249 | 57,250 |
| | 2-391 | 57,264 | 57,265 | 57,266 | 57,267 | 57,268 | 57,269 | 57,270 | 57,271 | 57,272 | 57,273 | 57,274 | 57,275 |
| | 2-392 | 57,289 | 57,290 | 57,291 | 57,292 | 57,293 | 57,294 | 57,295 | 57,296 | 57,297 | 57,298 | 57,299 | 57,300 |
| | 2-393 | 57,314 | 57,315 | 57,316 | 57,317 | 57,318 | 57,319 | 57,320 | 57,321 | 57,322 | 57,323 | 57,324 | 57,325 |
| | 2-394 | 57,339 | 57,340 | 57,341 | 57,342 | 57,343 | 57,344 | 57,345 | 57,346 | 57,347 | 57,348 | 57,349 | 57,350 |
| | 2-395 | 57,364 | 57,365 | 57,366 | 57,367 | 57,368 | 57,369 | 57,370 | 57,371 | 57,372 | 57,373 | 57,374 | 57,375 |
| | 2-396 | 57,389 | 57,390 | 57,391 | 57,392 | 57,393 | 57,394 | 57,395 | 57,396 | 57,397 | 57,398 | 57,399 | 57,400 |
| | 2-397 | 57,414 | 57,415 | 57,416 | 57,417 | 57,418 | 57,419 | 57,420 | 57,421 | 57,422 | 57,423 | 57,424 | 57,425 |
| | 2-398 | 57,439 | 57,440 | 57,441 | 57,442 | 57,443 | 57,444 | 57,445 | 57,446 | 57,447 | 57,448 | 57,449 | 57,450 |
| | 2-399 | 57,464 | 57,465 | 57,466 | 57,467 | 57,468 | 57,469 | 57,470 | 57,471 | 57,472 | 57,473 | 57,474 | 57,475 |
| | 2-400 | 57,489 | 57,490 | 57,491 | 57,492 | 57,493 | 57,494 | 57,495 | 57,496 | 57,497 | 57,498 | 57,499 | 57,500 |
| | 2-401 | 57,514 | 57,515 | 57,516 | 57,517 | 57,518 | 57,519 | 57,520 | 57,521 | 57,522 | 57,523 | 57,524 | 57,525 |
| | 2-402 | 57,539 | 57,540 | 57,541 | 57,542 | 57,543 | 57,544 | 57,545 | 57,546 | 57,547 | 57,548 | 57,549 | 57,550 |
| | 2-403 | 57,564 | 57,565 | 57,566 | 57,567 | 57,568 | 57,569 | 57,570 | 57,571 | 57,572 | 57,573 | 57,574 | 57,575 |
| | 2-404 | 57,589 | 57,590 | 57,591 | 57,592 | 57,593 | 57,594 | 57,595 | 57,596 | 57,597 | 57,598 | 57,599 | 57,600 |
| | 2-405 | 57,614 | 57,615 | 57,616 | 57,617 | 57,618 | 57,619 | 57,620 | 57,621 | 57,622 | 57,623 | 57,624 | 57,625 |
| | 2-406 | 57,639 | 57,640 | 57,641 | 57,642 | 57,643 | 57,644 | 57,645 | 57,646 | 57,647 | 57,648 | 57,649 | 57,650 |
| | 2-407 | 57,664 | 57,665 | 57,666 | 57,667 | 57,668 | 57,669 | 57,670 | 57,671 | 57,672 | 57,673 | 57,674 | 57,675 |
| | 2-408 | 57,689 | 57,690 | 57,691 | 57,692 | 57,693 | 57,694 | 57,695 | 57,696 | 57,697 | 57,698 | 57,699 | 57,700 |
| | 2-409 | 57,714 | 57,715 | 57,716 | 57,717 | 57,718 | 57,719 | 57,720 | 57,721 | 57,722 | 57,723 | 57,724 | 57,725 |
| | 2-410 | 57,739 | 57,740 | 57,741 | 57,742 | 57,743 | 57,744 | 57,745 | 57,746 | 57,747 | 57,748 | 57,749 | 57,750 |
| | 2-411 | 57,764 | 57,765 | 57,766 | 57,767 | 57,768 | 57,769 | 57,770 | 57,771 | 57,772 | 57,773 | 57,774 | 57,775 |
| | 2-412 | 57,789 | 57,790 | 57,791 | 57,792 | 57,793 | 57,794 | 57,795 | 57,796 | 57,797 | 57,798 | 57,799 | 57,800 |
| | 2-413 | 57,814 | 57,815 | 57,816 | 57,817 | 57,818 | 57,819 | 57,820 | 57,821 | 57,822 | 57,823 | 57,824 | 57,825 |
| | 2-414 | 57,839 | 57,840 | 57,841 | 57,842 | 57,843 | 57,844 | 57,845 | 57,846 | 57,847 | 57,848 | 57,849 | 57,850 |
| | 2-415 | 57,864 | 57,865 | 57,866 | 57,867 | 57,868 | 57,869 | 57,870 | 57,871 | 57,872 | 57,873 | 57,874 | 57,875 |
| | 2-416 | 57,889 | 57,890 | 57,891 | 57,892 | 57,893 | 57,894 | 57,895 | 57,896 | 57,897 | 57,898 | 57,899 | 57,900 |
| | 2-417 | 57,914 | 57,915 | 57,916 | 57,917 | 57,918 | 57,919 | 57,920 | 57,921 | 57,922 | 57,923 | 57,924 | 57,925 |
| | 2-418 | 57,939 | 57,940 | 57,941 | 57,942 | 57,943 | 57,944 | 57,945 | 57,946 | 57,947 | 57,948 | 57,949 | 57,950 |
| | 2-419 | 57,964 | 57,965 | 57,966 | 57,967 | 57,968 | 57,969 | 57,970 | 57,971 | 57,972 | 57,973 | 57,974 | 57,975 |
| | 2-420 | 57,989 | 57,990 | 57,991 | 57,992 | 57,993 | 57,994 | 57,995 | 57,996 | 57,997 | 57,998 | 57,999 | 58,000 |
| | 2-421 | 58,014 | 58,015 | 58,016 | 58,017 | 58,018 | 58,019 | 58,020 | 58,021 | 58,022 | 58,023 | 58,024 | 58,025 |
| | 2-422 | 58,039 | 58,040 | 58,041 | 58,042 | 58,043 | 58,044 | 58,045 | 58,046 | 58,047 | 58,048 | 58,049 | 58,050 |
| | 2-423 | 58,064 | 58,065 | 58,066 | 58,067 | 58,068 | 58,069 | 58,070 | 58,071 | 58,072 | 58,073 | 58,074 | 58,075 |
| | 2-424 | 58,089 | 58,090 | 58,091 | 58,092 | 58,093 | 58,094 | 58,095 | 58,096 | 58,097 | 58,098 | 58,099 | 58,100 |
| | 2-425 | 58,114 | 58,115 | 58,116 | 58,117 | 58,118 | 58,119 | 58,120 | 58,121 | 58,122 | 58,123 | 58,124 | 58,125 |
| | 2-426 | 58,139 | 58,140 | 58,141 | 58,142 | 58,143 | 58,144 | 58,145 | 58,146 | 58,147 | 58,148 | 58,149 | 58,150 |
| | 2-427 | 58,164 | 58,165 | 58,166 | 58,167 | 58,168 | 58,169 | 58,170 | 58,171 | 58,172 | 58,173 | 58,174 | 58,175 |
| | 2-428 | 58,189 | 58,190 | 58,191 | 58,192 | 58,193 | 58,194 | 58,195 | 58,196 | 58,197 | 58,198 | 58,199 | 58,200 |
| | 2-429 | 58,214 | 58,215 | 58,216 | 58,217 | 58,218 | 58,219 | 58,220 | 58,221 | 58,222 | 58,223 | 58,224 | 58,225 |
| | 2-430 | 58,239 | 58,240 | 58,241 | 58,242 | 58,243 | 58,244 | 58,245 | 58,246 | 58,247 | 58,248 | 58,249 | 58,250 |
| | 2-431 | 58,264 | 58,265 | 58,266 | 58,267 | 58,268 | 58,269 | 58,270 | 58,271 | 58,272 | 58,273 | 58,274 | 58,275 |
| | 2-432 | 58,289 | 58,290 | 58,291 | 58,292 | 58,293 | 58,294 | 58,295 | 58,296 | 58,297 | 58,298 | 58,299 | 58,300 |
| | 2-433 | 58,314 | 58,315 | 58,316 | 58,317 | 58,318 | 58,319 | 58,320 | 58,321 | 58,322 | 58,323 | 58,324 | 58,325 |
| | 2-434 | 58,339 | 58,340 | 58,341 | 58,342 | 58,343 | 58,344 | 58,345 | 58,346 | 58,347 | 58,348 | 58,349 | 58,350 |
| | 2-435 | 58,364 | 58,365 | 58,366 | 58,367 | 58,368 | 58,369 | 58,370 | 58,371 | 58,372 | 58,373 | 58,374 | 58,375 |
| | 2-436 | 58,389 | 58,390 | 58,391 | 58,392 | 58,393 | 58,394 | 58,395 | 58,396 | 58,397 | 58,398 | 58,399 | 58,400 |
| | 2-437 | 58,414 | 58,415 | 58,416 | 58,417 | 58,418 | 58,419 | 58,420 | 58,421 | 58,422 | 58,423 | 58,424 | 58,425 |
| | 2-438 | 58,439 | 58,440 | 58,441 | 58,442 | 58,443 | 58,444 | 58,445 | 58,446 | 58,447 | 58,448 | 58,449 | 58,450 |
| | 2-439 | 58,464 | 58,465 | 58,466 | 58,467 | 58,468 | 58,469 | 58,470 | 58,471 | 58,472 | 58,473 | 58,474 | 58,475 |
| | 2-440 | 58,489 | 58,490 | 58,491 | 58,492 | 58,493 | 58,494 | 58,495 | 58,496 | 58,497 | 58,498 | 58,499 | 58,500 |

TABLE 45

| | | Compound represented by the formula (1) | | | | | | | | | | | | |
|---|---|---|---|---|---|---|---|---|---|---|---|---|---|---|
| | | 1-101 | 1-102 | 1-103 | 1-104 | 1-105 | 1-106 | 1-107 | 1-108 | 1-109 | 1-110 | 1-111 | 1-112 | 1-113 |
| Compound represented by the formula (2) | 2-441 | 58,501 | 58,502 | 58,503 | 58,504 | 58,505 | 58,506 | 58,507 | 58,508 | 58,509 | 58,510 | 58,511 | 58,512 | 58,513 |
| | 2-442 | 58,526 | 58,527 | 58,528 | 58,529 | 58,530 | 58,531 | 58,532 | 58,533 | 58,534 | 58,535 | 58,536 | 58,537 | 58,538 |
| | 2-443 | 58,551 | 58,552 | 58,553 | 58,554 | 58,555 | 58,556 | 58,557 | 58,558 | 58,559 | 58,560 | 58,561 | 58,562 | 58,563 |
| | 2-444 | 58,576 | 58,577 | 58,578 | 58,579 | 58,580 | 58,581 | 58,582 | 58,583 | 58,584 | 58,585 | 58,586 | 58,587 | 58,588 |
| | 2-445 | 58,601 | 58,602 | 58,603 | 58,604 | 58,605 | 58,606 | 58,607 | 58,608 | 58,609 | 58,610 | 58,611 | 58,612 | 58,613 |
| | 2-446 | 58,626 | 58,627 | 58,628 | 58,629 | 58,630 | 58,631 | 58,632 | 58,633 | 58,634 | 58,635 | 58,636 | 58,637 | 58,638 |
| | 2-447 | 58,651 | 58,652 | 58,653 | 58,654 | 58,655 | 58,656 | 58,657 | 58,658 | 58,659 | 58,660 | 58,661 | 58,662 | 58,663 |
| | 2-448 | 58,676 | 58,677 | 58,678 | 58,679 | 58,680 | 58,681 | 58,682 | 58,683 | 58,684 | 58,685 | 58,686 | 58,687 | 58,688 |
| | 2-449 | 58,701 | 58,702 | 58,703 | 58,704 | 58,705 | 58,706 | 58,707 | 58,708 | 58,709 | 58,710 | 58,711 | 58,712 | 58,713 |
| | 2-450 | 58,726 | 58,727 | 58,728 | 58,729 | 58,730 | 58,731 | 58,732 | 58,733 | 58,734 | 58,735 | 58,736 | 58,737 | 58,738 |
| | 2-451 | 58,751 | 58,752 | 58,753 | 58,754 | 58,755 | 58,756 | 58,757 | 58,758 | 58,759 | 58,760 | 58,761 | 58,762 | 58,763 |

TABLE 45-continued

| | | | | | | | | | | | | | |
|---|---|---|---|---|---|---|---|---|---|---|---|---|---|
| 2-452 | 58,776 | 58,777 | 58,778 | 58,779 | 58,780 | 58,781 | 58,782 | 58,783 | 58,784 | 58,785 | 58,786 | 58,787 | 58,788 |
| 2-453 | 58,801 | 58,802 | 58,803 | 58,804 | 58,805 | 58,806 | 58,807 | 58,808 | 58,809 | 58,810 | 58,811 | 58,812 | 58,813 |
| 2-454 | 58,826 | 58,827 | 58,828 | 58,829 | 58,830 | 58,831 | 58,832 | 58,833 | 58,834 | 58,835 | 58,836 | 58,837 | 58,838 |
| 2-455 | 58,851 | 58,852 | 58,853 | 58,854 | 58,855 | 58,856 | 58,857 | 58,858 | 58,859 | 58,860 | 58,861 | 58,862 | 58,863 |
| 2-456 | 58,876 | 58,877 | 58,878 | 58,879 | 58,880 | 58,881 | 58,882 | 58,883 | 58,884 | 58,885 | 58,886 | 58,887 | 58,888 |
| 2-457 | 58,901 | 58,902 | 58,903 | 58,904 | 58,905 | 58,906 | 58,907 | 58,908 | 58,909 | 58,910 | 58,911 | 58,912 | 58,913 |
| 2-458 | 58,926 | 58,927 | 58,928 | 58,929 | 58,930 | 58,931 | 58,932 | 58,933 | 58,934 | 58,935 | 58,936 | 58,937 | 58,938 |
| 2-459 | 58,951 | 58,952 | 58,953 | 58,954 | 58,955 | 58,956 | 58,957 | 58,958 | 58,959 | 58,960 | 58,961 | 58,962 | 58,963 |
| 2-460 | 58,976 | 58,977 | 58,978 | 58,979 | 58,980 | 58,981 | 58,982 | 58,983 | 858,94 | 58,985 | 58,986 | 58,987 | 58,988 |
| 2-461 | 59,001 | 59,002 | 59,003 | 59,004 | 59,005 | 59,006 | 59,007 | 59,008 | 59,009 | 59,010 | 59,011 | 59,012 | 59,013 |
| 2-462 | 59,026 | 59,027 | 59,028 | 59,029 | 59,030 | 59,031 | 59,032 | 59,033 | 59,034 | 59,035 | 59,036 | 59,037 | 59,038 |
| 2-463 | 59,051 | 59,052 | 59,053 | 59,054 | 59,055 | 59,056 | 59,057 | 59,058 | 59,059 | 59,060 | 59,061 | 59,062 | 59,063 |
| 2-464 | 59,076 | 59,077 | 59,078 | 59,079 | 59,080 | 59,081 | 59,082 | 59,083 | 59,084 | 59,085 | 59,086 | 59,087 | 59,088 |
| 2-465 | 59,101 | 59,102 | 59,103 | 59,104 | 59,105 | 59,106 | 59,107 | 59,108 | 59,109 | 59,110 | 59,111 | 59,112 | 59,113 |
| 2-466 | 59,126 | 59,127 | 59,128 | 59,129 | 59,130 | 59,131 | 59,132 | 59,133 | 59,134 | 59,135 | 59,136 | 59,137 | 59,138 |
| 2-467 | 59,151 | 59,152 | 59,153 | 59,154 | 59,155 | 59,156 | 59,157 | 59,158 | 59,159 | 59,160 | 59,161 | 59,162 | 59,163 |
| 2-468 | 59,176 | 59,177 | 59,178 | 59,179 | 59,180 | 59,181 | 59,182 | 59,183 | 59,184 | 59,185 | 59,186 | 59,187 | 59,188 |
| 2-469 | 59,201 | 59,202 | 59,203 | 59,204 | 59,205 | 59,206 | 59,207 | 59,208 | 59,209 | 59,210 | 59,211 | 59,212 | 59,213 |
| 2-470 | 59,226 | 59,227 | 59,228 | 59,229 | 59,230 | 59,231 | 59,232 | 59,233 | 59,234 | 59,235 | 59,236 | 59,237 | 59,238 |
| 2-471 | 59,251 | 59,252 | 59,253 | 59,254 | 59,255 | 59,256 | 59,257 | 59,258 | 59,259 | 59,260 | 59,261 | 59,262 | 59,263 |
| 2-472 | 59,276 | 59,277 | 59,278 | 59,279 | 59,280 | 59,281 | 59,282 | 59,283 | 59,284 | 59,285 | 59,286 | 59,287 | 59,288 |
| 2-473 | 59,301 | 59,302 | 59,303 | 59,304 | 59,305 | 59,306 | 59,307 | 59,308 | 59,309 | 59,310 | 59,311 | 59,312 | 59,313 |
| 2-474 | 59,326 | 59,327 | 59,328 | 59,329 | 59,330 | 59,331 | 59,332 | 59,333 | 59,334 | 59,335 | 59,336 | 59,337 | 59,338 |
| 2-475 | 59,351 | 59,352 | 59,353 | 59,354 | 59,355 | 59,356 | 59,357 | 59,358 | 59,359 | 59,360 | 59,361 | 59,362 | 59,363 |

| | | Compound represented by the formula (1) | | | | | | | | | | | |
|---|---|---|---|---|---|---|---|---|---|---|---|---|---|
| | | 1-114 | 1-115 | 1-116 | 1-117 | 1-118 | 1-119 | 1-120 | 1-121 | 1-122 | 1-123 | 1-124 | 1-125 |
| Compound represented by the formula (2) | 2-441 | 58,514 | 58,515 | 58,516 | 58,517 | 58,518 | 58,519 | 58,520 | 58,521 | 58,522 | 58,523 | 58,524 | 58,525 |
| | 2-442 | 58,539 | 58,540 | 58,541 | 58,542 | 58,543 | 58,544 | 58,545 | 58,546 | 58,547 | 58,548 | 58,549 | 58,550 |
| | 2-443 | 58,564 | 58,565 | 58,566 | 58,567 | 58,568 | 58,569 | 58,570 | 58,571 | 58,572 | 58,573 | 58,574 | 58,575 |
| | 2-444 | 58,589 | 58,590 | 58,591 | 58,592 | 58,593 | 58,594 | 58,595 | 58,596 | 58,597 | 58,598 | 58,599 | 58,600 |
| | 2-445 | 58,614 | 58,615 | 58,616 | 58,617 | 58,618 | 58,619 | 58,620 | 58,621 | 58,622 | 58,623 | 58,624 | 58,625 |
| | 2-446 | 58,639 | 58,640 | 58,641 | 58,642 | 58,643 | 58,644 | 58,645 | 58,646 | 58,647 | 58,648 | 58,649 | 58,650 |
| | 2-447 | 58,664 | 58,665 | 58,666 | 58,667 | 58,668 | 58,669 | 58,670 | 58,671 | 58,672 | 58,673 | 58,674 | 58,675 |
| | 2-448 | 58,689 | 58,690 | 58,691 | 58,692 | 58,693 | 58,694 | 58,695 | 58,696 | 58,697 | 58,698 | 58,699 | 58,700 |
| | 2-449 | 58,714 | 58,715 | 58,716 | 58,717 | 58,718 | 58,719 | 58,720 | 58,721 | 58,722 | 58,723 | 58,724 | 58,725 |
| | 2-450 | 58,739 | 58,740 | 58,741 | 58,742 | 58,743 | 58,744 | 58,745 | 58,746 | 58,747 | 58,748 | 58,749 | 58,750 |
| | 2-451 | 58,764 | 58,765 | 58,766 | 58,767 | 58,768 | 58,769 | 58,770 | 58,771 | 58,772 | 58,773 | 58,774 | 58,775 |
| | 2-452 | 58,789 | 58,790 | 58,791 | 58,792 | 58,793 | 58,794 | 58,795 | 58,796 | 58,797 | 58,798 | 58,799 | 58,800 |
| | 2-453 | 58,814 | 58,815 | 58,816 | 58,817 | 58,818 | 58,819 | 58,820 | 58,821 | 58,822 | 58,823 | 58,824 | 58,825 |
| | 2-454 | 58,839 | 58,840 | 58,841 | 58,842 | 58,843 | 58,844 | 58,845 | 58,846 | 58,847 | 58,848 | 58,849 | 58,850 |
| | 2-455 | 58,864 | 58,865 | 58,866 | 58,867 | 58,868 | 58,869 | 58,870 | 58,871 | 58,872 | 58,873 | 58,874 | 58,875 |
| | 2-456 | 58,889 | 58,890 | 58,891 | 58,892 | 58,893 | 58,894 | 58,895 | 58,896 | 58,897 | 58,898 | 58,899 | 58,900 |
| | 2-457 | 58,914 | 58,915 | 58,916 | 58,917 | 58,918 | 58,919 | 58,920 | 58,921 | 58,922 | 58,923 | 58,924 | 58,925 |
| | 2-458 | 58,939 | 58,940 | 58,941 | 58,942 | 58,943 | 58,944 | 58,945 | 58,946 | 58,947 | 58,948 | 58,949 | 58,950 |
| | 2-459 | 58,964 | 58,965 | 58,966 | 58,967 | 58,968 | 58,969 | 58,970 | 58,971 | 58,972 | 58,973 | 58,974 | 58,975 |
| | 2-460 | 58,989 | 58,990 | 58,991 | 58,992 | 58,993 | 58,994 | 58,995 | 58,996 | 58,997 | 58,998 | 58,999 | 59,000 |
| | 2-461 | 59,014 | 59,015 | 59,016 | 59,017 | 59,018 | 59,019 | 59,020 | 59,021 | 59,022 | 59,023 | 59,024 | 59,025 |
| | 2-462 | 59,039 | 59,040 | 59,041 | 59,042 | 59,043 | 59,044 | 59,045 | 59,046 | 59,047 | 59,048 | 59,049 | 59,050 |
| | 2-463 | 59,064 | 59,065 | 59,066 | 59,067 | 59,068 | 59,069 | 59,070 | 59,071 | 59,072 | 59,073 | 59,074 | 59,075 |
| | 2-464 | 59,089 | 59,090 | 59,091 | 59,092 | 59,093 | 59,094 | 59,095 | 59,096 | 59,097 | 59,098 | 59,099 | 59,100 |
| | 2-465 | 59,114 | 59,115 | 59,116 | 59,117 | 59,118 | 59,119 | 59,120 | 59,121 | 59,122 | 59,123 | 59,124 | 59,125 |
| | 2-466 | 59,139 | 59,140 | 59,141 | 59,142 | 59,143 | 59,144 | 59,145 | 59,146 | 59,147 | 59,148 | 59,149 | 59,150 |
| | 2-467 | 59,164 | 59,165 | 59,166 | 59,167 | 59,168 | 59,169 | 59,170 | 59,171 | 59,172 | 59,173 | 59,174 | 59,175 |
| | 2-468 | 59,189 | 59,190 | 59,191 | 59,192 | 59,193 | 59,194 | 59,195 | 59,196 | 59,197 | 59,198 | 59,199 | 59,200 |
| | 2-469 | 59,214 | 59,215 | 59,216 | 59,217 | 59,218 | 59,219 | 59,220 | 59,221 | 59,222 | 59,223 | 59,224 | 59,225 |
| | 2-470 | 59,239 | 59,240 | 59,241 | 59,242 | 59,243 | 59,244 | 59,245 | 59,246 | 59,247 | 59,248 | 59,249 | 59,250 |
| | 2-471 | 59,264 | 59,265 | 59,266 | 59,267 | 59,268 | 59,269 | 59,270 | 59,271 | 59,272 | 59,273 | 59,274 | 59,275 |
| | 2-472 | 59,289 | 59,290 | 59,291 | 59,292 | 59,293 | 59,294 | 59,295 | 59,296 | 59,297 | 59,298 | 59,299 | 59,300 |
| | 2-473 | 59,314 | 59,315 | 59,316 | 59,317 | 59,318 | 59,319 | 59,320 | 59,321 | 59,322 | 59,323 | 59,324 | 59,325 |
| | 2-474 | 59,339 | 59,340 | 59,341 | 59,342 | 59,343 | 59,344 | 59,345 | 59,346 | 59,347 | 59,348 | 59,349 | 59,350 |
| | 2-475 | 59,364 | 59,365 | 59,366 | 59,367 | 59,368 | 59,369 | 59,370 | 59,371 | 59,372 | 59,373 | 59,374 | 59,375 |

TABLE 46

| | | Compound represented by the formula (1) | | | | | | | | | | | | |
|---|---|---|---|---|---|---|---|---|---|---|---|---|---|---|
| | | 1-126 | 1-127 | 1-128 | 1-129 | 1-130 | 1-131 | 1-132 | 1-133 | 1-134 | 1-135 | 1-136 | 1-137 | 1-138 |
| Compound represented by the formula (2) | 2-1 | 59,376 | 59,377 | 59,378 | 59,379 | 59,380 | 59,381 | 59,382 | 59,383 | 59,384 | 59,385 | 59,386 | 59,387 | 59,388 |
| | 2-2 | 59,401 | 59,402 | 59,403 | 59,404 | 59,405 | 59,406 | 59,407 | 59,408 | 59,409 | 59,410 | 59,411 | 59,412 | 59,413 |
| | 2-3 | 59,426 | 59,427 | 59,428 | 59,429 | 59,430 | 59,431 | 59,432 | 59,433 | 59,434 | 59,435 | 59,436 | 59,437 | 59,438 |
| | 2-4 | 59,451 | 59,452 | 59,453 | 59,454 | 59,455 | 59,456 | 59,457 | 59,458 | 59,459 | 59,460 | 59,461 | 59,462 | 59,463 |
| | 2-5 | 59,476 | 59,477 | 59,478 | 59,479 | 59,480 | 59,481 | 59,482 | 59,483 | 59,484 | 59,485 | 59,486 | 59,487 | 59,488 |
| | 2-6 | 59,501 | 59,502 | 59,503 | 59,504 | 59,505 | 59,506 | 59,507 | 59,508 | 59,509 | 59,510 | 59,511 | 59,512 | 59,513 |

TABLE 46-continued

| | | | | | | | | | | | | | |
|---|---|---|---|---|---|---|---|---|---|---|---|---|---|
| 2-7 | 59,526 | 59,527 | 59,528 | 59,529 | 59,530 | 59,531 | 59,532 | 59,533 | 59,534 | 59,535 | 59,536 | 59,537 | 59,538 |
| 2-8 | 59,551 | 59,552 | 59,553 | 59,554 | 59,555 | 59,556 | 59,557 | 59,558 | 59,559 | 59,560 | 59,561 | 59,562 | 59,563 |
| 2-9 | 59,576 | 59,577 | 59,578 | 59,579 | 59,580 | 59,581 | 59,582 | 59,583 | 59,584 | 59,585 | 59,586 | 59,587 | 59,588 |
| 2-10 | 59,601 | 59,602 | 59,603 | 59,604 | 59,605 | 59,606 | 59,607 | 59,608 | 59,609 | 59,610 | 59,611 | 59,612 | 59,613 |
| 2-11 | 59,626 | 59,627 | 59,628 | 59,629 | 59,630 | 59,631 | 59,632 | 59,633 | 59,634 | 59,635 | 59,636 | 59,637 | 59,638 |
| 2-12 | 59,651 | 59,652 | 59,653 | 59,654 | 59,655 | 59,656 | 59,657 | 59,658 | 59,659 | 59,660 | 59,661 | 59,662 | 59,663 |
| 2-13 | 59,676 | 59,677 | 59,678 | 59,679 | 59,680 | 59,681 | 59,682 | 59,683 | 59,684 | 59,685 | 59,686 | 59,687 | 59,688 |
| 2-14 | 59,701 | 59,702 | 59,703 | 59,704 | 59,705 | 59,706 | 59,707 | 59,708 | 59,709 | 59,710 | 59,711 | 59,712 | 59,713 |
| 2-15 | 59,726 | 59,727 | 59,728 | 59,729 | 59,730 | 59,731 | 59,732 | 59,733 | 59,734 | 59,735 | 59,736 | 59,737 | 59,738 |
| 2-16 | 59,751 | 59,752 | 59,753 | 59,754 | 59,755 | 59,756 | 59,757 | 59,758 | 59,759 | 59,760 | 59,761 | 59,762 | 59,763 |
| 2-17 | 59,776 | 59,777 | 59,778 | 59,779 | 59,780 | 59,781 | 59,782 | 59,783 | 59,784 | 59,785 | 59,786 | 59,787 | 59,788 |
| 2-18 | 59,801 | 59,802 | 59,803 | 59,804 | 59,805 | 59,806 | 59,807 | 59,808 | 59,809 | 59,810 | 59,811 | 59,812 | 59,813 |
| 2-19 | 59,826 | 59,827 | 59,828 | 59,829 | 59,830 | 59,831 | 59,832 | 59,833 | 59,834 | 59,835 | 59,836 | 59,837 | 59,838 |
| 2-20 | 59,851 | 59,852 | 59,853 | 59,854 | 59,855 | 59,856 | 59,857 | 59,858 | 59,859 | 59,860 | 59,861 | 59,862 | 59,863 |
| 2-21 | 59,876 | 59,877 | 59,878 | 59,879 | 59,880 | 59,881 | 59,882 | 59,883 | 59,884 | 59,885 | 59,886 | 59,887 | 59,888 |
| 2-22 | 59,901 | 59,902 | 59,903 | 59,904 | 59,905 | 59,906 | 59,907 | 59,908 | 59,909 | 59,910 | 59,911 | 59,912 | 59,913 |
| 2-23 | 59,926 | 59,927 | 59,928 | 59,929 | 59,930 | 59,931 | 59,932 | 59,933 | 59,934 | 59,935 | 59,936 | 59,937 | 59,938 |
| 2-24 | 59,951 | 59,952 | 59,953 | 59,954 | 59,955 | 59,956 | 59,957 | 59,958 | 59,959 | 59,960 | 59,961 | 59,962 | 59,963 |
| 2-25 | 59,976 | 59,977 | 59,978 | 59,979 | 59,980 | 59,981 | 59,982 | 59,983 | 59,984 | 59,985 | 59,986 | 59,987 | 59,988 |
| 2-26 | 60,001 | 60,002 | 60,003 | 60,004 | 60,005 | 60,006 | 60,007 | 60,008 | 60,009 | 60,010 | 60,011 | 60,012 | 60,013 |
| 2-27 | 60,026 | 60,027 | 60,028 | 60,029 | 60,030 | 60,031 | 60,032 | 60,033 | 60,034 | 60,035 | 60,036 | 60,037 | 60,038 |
| 2-28 | 60,051 | 60,052 | 60,053 | 60,054 | 60,055 | 60,056 | 60,057 | 60,058 | 60,059 | 60,060 | 60,061 | 60,062 | 60,063 |
| 2-29 | 60,076 | 60,077 | 60,078 | 60,079 | 60,080 | 60,081 | 60,082 | 60,083 | 60,084 | 60,085 | 60,086 | 60,087 | 60,088 |
| 2-30 | 60,101 | 60,102 | 60,103 | 60,104 | 60,105 | 60,106 | 60,107 | 60,108 | 60,109 | 60,110 | 60,111 | 60,112 | 60,113 |
| 2-31 | 60,126 | 60,127 | 60,128 | 60,129 | 60,130 | 60,131 | 60,132 | 60,133 | 60,134 | 60,135 | 60,136 | 60,137 | 60,138 |
| 2-32 | 60,151 | 60,152 | 60,153 | 60,154 | 60,155 | 60,156 | 60,157 | 60,158 | 60,159 | 60,160 | 60,161 | 60,162 | 60,163 |
| 2-33 | 60,176 | 60,177 | 60,178 | 60,179 | 60,180 | 60,181 | 60,182 | 60,183 | 60,184 | 60,185 | 60,186 | 60,187 | 60,188 |
| 2-34 | 60,201 | 60,202 | 60,203 | 60,204 | 60,205 | 60,206 | 60,207 | 60,208 | 60,209 | 60,210 | 60,211 | 60,212 | 60,213 |
| 2-35 | 60,226 | 60,227 | 60,228 | 60,229 | 60,230 | 60,231 | 60,232 | 60,233 | 60,234 | 60,235 | 60,236 | 60,237 | 60,238 |
| 2-36 | 60,251 | 60,252 | 60,253 | 60,254 | 60,255 | 60,256 | 60,257 | 60,258 | 60,259 | 60,260 | 60,261 | 60,262 | 60,263 |
| 2-37 | 60,276 | 60,277 | 60,278 | 60,279 | 60,280 | 60,281 | 60,282 | 60,283 | 60,284 | 60,285 | 60,286 | 60,287 | 60,288 |
| 2-38 | 60,301 | 60,302 | 60,303 | 60,304 | 60,305 | 60,306 | 60,307 | 60,308 | 60,309 | 60,310 | 60,311 | 60,312 | 60,313 |
| 2-39 | 60,326 | 60,327 | 60,328 | 60,329 | 60,330 | 60,331 | 60,332 | 60,333 | 60,334 | 60,335 | 60,336 | 60,337 | 60,338 |
| 2-40 | 60,351 | 60,352 | 60,353 | 60,354 | 60,355 | 60,356 | 60,357 | 60,358 | 60,359 | 60,360 | 60,361 | 60,362 | 60,363 |
| 2-41 | 60,376 | 60,377 | 60,378 | 60,379 | 60,380 | 60,381 | 60,382 | 60,383 | 60,384 | 60,385 | 60,386 | 60,387 | 60,388 |
| 2-42 | 60,401 | 60,402 | 60,403 | 60,404 | 60,405 | 60,406 | 60,407 | 60,408 | 60,409 | 60,410 | 60,411 | 60,412 | 60,413 |
| 2-43 | 60,426 | 60,427 | 60,428 | 60,429 | 60,430 | 60,431 | 60,432 | 60,433 | 60,434 | 60,435 | 60,436 | 60,437 | 60,438 |
| 2-44 | 60,451 | 60,452 | 60,453 | 60,454 | 60,455 | 60,456 | 60,457 | 60,458 | 60,459 | 60,460 | 60,461 | 60,462 | 60,463 |
| 2-45 | 60,476 | 60,477 | 60,478 | 60,479 | 60,480 | 60,481 | 60,482 | 60,483 | 60,484 | 60,485 | 60,486 | 60,487 | 60,488 |
| 2-46 | 60,501 | 60,502 | 60,503 | 60,504 | 60,505 | 60,506 | 60,507 | 60,508 | 60,509 | 60,510 | 60,511 | 60,512 | 60,513 |
| 2-47 | 60,526 | 60,527 | 60,528 | 60,529 | 60,530 | 60,531 | 60,532 | 60,533 | 60,534 | 60,535 | 60,536 | 60,537 | 60,538 |
| 2-48 | 60,551 | 60,552 | 60,553 | 60,554 | 60,555 | 60,556 | 60,557 | 60,558 | 60,559 | 60,560 | 60,561 | 60,562 | 60,563 |
| 2-49 | 60,576 | 60,577 | 60,578 | 60,579 | 60,580 | 60,581 | 60,582 | 60,583 | 60,584 | 60,585 | 60,586 | 60,587 | 60,588 |
| 2-50 | 60,601 | 60,602 | 60,603 | 60,604 | 60,605 | 60,606 | 60,607 | 60,608 | 60,609 | 60,610 | 60,611 | 60,612 | 60,613 |
| 2-51 | 60,626 | 60,627 | 60,628 | 60,629 | 60,630 | 60,631 | 60,632 | 60,633 | 60,634 | 60,635 | 60,636 | 60,637 | 60,638 |
| 2-52 | 60,651 | 60,652 | 60,653 | 60,654 | 60,655 | 60,656 | 60,657 | 60,658 | 60,659 | 60,660 | 60,661 | 60,662 | 60,663 |
| 2-53 | 60,676 | 60,677 | 60,678 | 60,679 | 60,680 | 60,681 | 60,682 | 60,683 | 60,684 | 60,685 | 60,686 | 60,687 | 60,688 |
| 2-54 | 60,701 | 60,702 | 60,703 | 60,704 | 60,705 | 60,706 | 60,707 | 60,708 | 60,709 | 60,710 | 60,711 | 60,712 | 60,713 |
| 2-55 | 60,726 | 60,727 | 60,728 | 60,729 | 60,730 | 60,731 | 60,732 | 60,733 | 60,734 | 60,735 | 60,736 | 60,737 | 60,738 |

| | | Compound represented by the formula (1) | | | | | | | | | | | |
|---|---|---|---|---|---|---|---|---|---|---|---|---|---|
| | | 1-139 | 1-140 | 1-141 | 1-142 | 1-143 | 1-144 | 1-145 | 1-146 | 1-147 | 1-148 | 1-149 | 1-150 |
| Compound represented by the formula (2) | 2-1 | 59,389 | 59,390 | 59,391 | 59,392 | 59,393 | 59,394 | 59,395 | 59,396 | 59,397 | 59,398 | 59,399 | 59,400 |
| | 2-2 | 59,414 | 59,415 | 59,416 | 59,417 | 59,418 | 59,419 | 59,420 | 59,421 | 59,422 | 59,423 | 59,424 | 59,425 |
| | 2-3 | 59,439 | 59,440 | 59,441 | 59,442 | 59,443 | 59,444 | 59,445 | 59,446 | 59,447 | 59,448 | 59,449 | 59,450 |
| | 2-4 | 59,464 | 59,465 | 59,466 | 59,467 | 59,468 | 59,469 | 59,470 | 59,471 | 59,472 | 59,473 | 59,474 | 59,475 |
| | 2-5 | 59,489 | 59,490 | 59,491 | 59,492 | 59,493 | 59,494 | 59,495 | 59,496 | 59,497 | 59,498 | 59,499 | 59,500 |
| | 2-6 | 59,514 | 59,515 | 59,516 | 59,517 | 59,518 | 59,519 | 59,520 | 59,521 | 59,522 | 59,523 | 59,524 | 59,525 |
| | 2-7 | 59,539 | 59,540 | 59,541 | 59,542 | 59,543 | 59,544 | 59,545 | 59,546 | 59,547 | 59,548 | 59,549 | 59,550 |
| | 2-8 | 59,564 | 59,565 | 59,566 | 59,567 | 59,568 | 59,569 | 59,570 | 59,571 | 59,572 | 59,573 | 59,574 | 59,575 |
| | 2-9 | 59,589 | 59,590 | 59,591 | 59,592 | 59,593 | 59,594 | 59,595 | 59,596 | 59,597 | 59,598 | 59,599 | 59,600 |
| | 2-10 | 59,614 | 59,615 | 59,616 | 59,617 | 59,618 | 59,619 | 59,620 | 59,621 | 59,622 | 59,623 | 59,624 | 59,625 |
| | 2-11 | 59,639 | 59,640 | 59,641 | 59,642 | 59,643 | 59,644 | 59,645 | 59,646 | 59,647 | 59,648 | 59,649 | 59,650 |
| | 2-12 | 59,664 | 59,665 | 59,666 | 59,667 | 59,668 | 59,669 | 59,670 | 59,671 | 59,672 | 59,673 | 59,674 | 59,675 |
| | 2-13 | 59,689 | 59,690 | 59,691 | 59,692 | 59,693 | 59,694 | 59,695 | 59,696 | 59,697 | 59,698 | 59,699 | 59,700 |
| | 2-14 | 59,714 | 59,715 | 59,716 | 59,717 | 59,718 | 59,719 | 59,720 | 59,721 | 59,722 | 59,723 | 59,724 | 59,725 |
| | 2-15 | 59,739 | 59,740 | 59,741 | 59,742 | 59,743 | 59,744 | 59,745 | 59,746 | 59,747 | 59,748 | 59,749 | 59,750 |
| | 2-16 | 59,764 | 59,765 | 59,766 | 59,767 | 59,768 | 59,769 | 59,770 | 59,771 | 59,772 | 59,773 | 59,774 | 59,775 |
| | 2-17 | 59,789 | 59,790 | 59,791 | 59,792 | 59,793 | 59,794 | 59,795 | 59,796 | 59,797 | 59,798 | 59,799 | 59,800 |
| | 2-18 | 59,814 | 59,815 | 59,816 | 59,817 | 59,818 | 59,819 | 59,820 | 59,821 | 59,822 | 59,823 | 59,824 | 59,825 |
| | 2-19 | 59,839 | 59,840 | 59,841 | 59,842 | 59,843 | 59,844 | 59,845 | 59,846 | 59,847 | 59,848 | 59,849 | 59,850 |
| | 2-20 | 59,864 | 59,865 | 59,866 | 59,867 | 59,868 | 59,869 | 59,870 | 59,871 | 59,872 | 59,873 | 59,874 | 59,875 |
| | 2-21 | 59,889 | 59,890 | 59,891 | 59,892 | 59,893 | 59,894 | 59,895 | 59,896 | 59,897 | 59,898 | 59,899 | 59,900 |
| | 2-22 | 59,914 | 59,915 | 59,916 | 59,917 | 59,918 | 59,919 | 59,920 | 59,921 | 59,922 | 59,923 | 59,924 | 59,925 |
| | 2-23 | 59,939 | 59,940 | 59,941 | 59,942 | 59,943 | 59,944 | 59,945 | 59,946 | 59,947 | 59,948 | 59,949 | 59,950 |
| | 2-24 | 59,964 | 59,965 | 59,966 | 59,967 | 59,968 | 59,969 | 59,970 | 59,971 | 59,972 | 59,973 | 59,974 | 59,975 |
| | 2-25 | 59,989 | 59,990 | 59,991 | 59,992 | 59,993 | 59,994 | 59,995 | 59,996 | 59,997 | 59,998 | 59,999 | 60,000 |
| | 2-26 | 60,014 | 60,015 | 60,016 | 60,017 | 60,018 | 60,019 | 60,020 | 60,021 | 60,022 | 60,023 | 60,024 | 60,025 |

TABLE 46-continued

| | | | | | | | | | | | | | |
|---|---|---|---|---|---|---|---|---|---|---|---|---|---|
| | 2-27 | 60,039 | 60,040 | 60,041 | 60,042 | 60,043 | 60,044 | 60,045 | 60,046 | 60,047 | 60,048 | 60,049 | 60,050 |
| | 2-28 | 60,064 | 60,065 | 60,066 | 60,067 | 60,068 | 60,069 | 60,070 | 60,071 | 60,072 | 60,073 | 60,074 | 60,075 |
| | 2-29 | 60,089 | 60,090 | 60,091 | 60,092 | 60,093 | 60,094 | 60,095 | 60,096 | 60,097 | 60,098 | 60,099 | 60,100 |
| | 2-30 | 60,114 | 60,115 | 60,116 | 60,117 | 60,118 | 60,119 | 60,120 | 60,121 | 60,122 | 60,123 | 60,124 | 60,125 |
| | 2-31 | 60,139 | 60,140 | 60,141 | 60,142 | 60,143 | 60,144 | 60,145 | 60,146 | 60,147 | 60,148 | 60,149 | 60,150 |
| | 2-32 | 60,164 | 60,165 | 60,166 | 60,167 | 60,168 | 60,169 | 60,170 | 60,171 | 60,172 | 60,173 | 60,174 | 60,175 |
| | 2-33 | 60,189 | 60,190 | 60,191 | 60,192 | 60,193 | 60,194 | 60,195 | 60,196 | 60,197 | 60,198 | 60,199 | 60,200 |
| | 2-34 | 60,214 | 60,215 | 60,216 | 60,217 | 60,218 | 60,219 | 60,220 | 60,221 | 60,222 | 60,223 | 60,224 | 60,225 |
| | 2-35 | 60,239 | 60,240 | 60,241 | 60,242 | 60,243 | 60,244 | 60,245 | 60,246 | 60,247 | 60,248 | 60,249 | 60,250 |
| | 2-36 | 60,264 | 60,265 | 60,266 | 60,267 | 60,268 | 60,269 | 60,270 | 60,271 | 60,272 | 60,273 | 60,274 | 60,275 |
| | 2-37 | 60,289 | 60,290 | 60,291 | 60,292 | 60,293 | 60,294 | 60,295 | 60,296 | 60,297 | 60,298 | 60,299 | 60,300 |
| | 2-38 | 60,314 | 60,315 | 60,316 | 60,317 | 60,318 | 60,319 | 60,320 | 60,321 | 60,322 | 60,323 | 60,324 | 60,325 |
| | 2-39 | 60,339 | 60,340 | 60,341 | 60,342 | 60,343 | 60,344 | 60,345 | 60,346 | 60,347 | 60,348 | 60,349 | 60,350 |
| | 2-40 | 60,364 | 60,365 | 60,366 | 60,367 | 60,368 | 60,369 | 60,370 | 60,371 | 60,372 | 60,373 | 60,374 | 60,375 |
| | 2-41 | 60,389 | 60,390 | 60,391 | 60,392 | 60,393 | 60,394 | 60,395 | 60,396 | 60,397 | 60,398 | 60,399 | 60,400 |
| | 2-42 | 60,414 | 60,415 | 60,416 | 60,417 | 60,418 | 60,419 | 60,420 | 60,421 | 60,422 | 60,423 | 60,424 | 60,425 |
| | 2-43 | 60,439 | 60,440 | 60,441 | 60,442 | 60,443 | 60,444 | 60,445 | 60,446 | 60,447 | 60,448 | 60,449 | 60,450 |
| | 2-44 | 60,464 | 60,465 | 60,466 | 60,467 | 60,468 | 60,469 | 60,470 | 60,471 | 60,472 | 60,473 | 60,474 | 60,475 |
| | 2-45 | 60,489 | 60,490 | 60,491 | 60,492 | 60,493 | 60,494 | 60,495 | 60,496 | 60,497 | 60,498 | 60,499 | 60,500 |
| | 2-46 | 60,514 | 60,515 | 60,516 | 60,517 | 60,518 | 60,519 | 60,520 | 60,521 | 60,522 | 60,523 | 60,524 | 60,525 |
| | 2-47 | 60,539 | 60,540 | 60,541 | 60,542 | 60,543 | 60,544 | 60,545 | 60,546 | 60,547 | 60,548 | 60,549 | 60,550 |
| | 2-48 | 60,564 | 60,565 | 60,566 | 60,567 | 60,568 | 60,569 | 60,570 | 60,571 | 60,572 | 60,573 | 60,574 | 60,575 |
| | 2-49 | 60,589 | 60,590 | 60,591 | 60,592 | 60,593 | 60,594 | 60,595 | 60,596 | 60,597 | 60,598 | 60,599 | 60,600 |
| | 2-50 | 60,614 | 60,615 | 60,616 | 60,617 | 60,618 | 60,619 | 60,620 | 60,621 | 60,622 | 60,623 | 60,624 | 60,625 |
| | 2-51 | 60,639 | 60,640 | 60,641 | 60,642 | 60,643 | 60,644 | 60,645 | 60,646 | 60,647 | 60,648 | 60,649 | 60,650 |
| | 2-52 | 60,664 | 60,665 | 60,666 | 60,667 | 60,668 | 60,669 | 60,670 | 60,671 | 60,672 | 60,673 | 60,674 | 60,675 |
| | 2-53 | 60,689 | 60,690 | 60,691 | 60,692 | 60,693 | 60,694 | 60,695 | 60,696 | 60,697 | 60,698 | 60,699 | 60,700 |
| | 2-54 | 60,714 | 60,715 | 60,716 | 60,717 | 60,718 | 60,719 | 60,720 | 60,721 | 60,722 | 60,723 | 60,724 | 60,725 |
| | 2-55 | 60,739 | 60,740 | 60,741 | 60,742 | 60,743 | 60,744 | 60,745 | 60,746 | 60,747 | 60,748 | 60,749 | 60,750 |

TABLE 47

| | | Compound represented by the formula (1) | | | | | | | | | | | | |
|---|---|---|---|---|---|---|---|---|---|---|---|---|---|---|
| | | 1-126 | 1-127 | 1-128 | 1-129 | 1-130 | 1-131 | 1-132 | 1-133 | 1-134 | 1-135 | 1-136 | 1-137 | 1-138 |
| Compound represented by the formula (2) | 2-56 | 60,751 | 60,752 | 60,753 | 60,754 | 60,755 | 60,756 | 60,757 | 60,758 | 60,759 | 60,760 | 60,761 | 60,762 | 60,763 |
| | 2-57 | 60,776 | 60,777 | 60,778 | 60,779 | 60,780 | 60,781 | 60,782 | 60,783 | 60,784 | 60,785 | 60,786 | 60,787 | 60,788 |
| | 2-58 | 60,801 | 60,802 | 60,803 | 60,804 | 60,805 | 60,806 | 60,807 | 60,808 | 60,809 | 60,810 | 60,811 | 60,812 | 60,813 |
| | 2-59 | 60,826 | 60,827 | 60,828 | 60,829 | 60,830 | 60,831 | 60,832 | 60,833 | 60,834 | 60,835 | 60,836 | 60,837 | 60,838 |
| | 2-60 | 60,851 | 60,852 | 60,853 | 60,854 | 60,855 | 60,856 | 60,857 | 60,858 | 60,859 | 60,860 | 60,861 | 60,862 | 60,863 |
| | 2-61 | 60,876 | 60,877 | 60,878 | 60,879 | 60,880 | 60,881 | 60,882 | 60,883 | 60,884 | 60,885 | 60,886 | 60,887 | 60,888 |
| | 2-62 | 60,901 | 60,902 | 60,903 | 60,904 | 60,905 | 60,906 | 60,907 | 60,908 | 60,909 | 60,910 | 60,911 | 60,912 | 60,913 |
| | 2-63 | 60,926 | 60,927 | 60,928 | 60,929 | 60,930 | 60,931 | 60,932 | 60,933 | 60,934 | 60,935 | 60,936 | 60,937 | 60,938 |
| | 2-64 | 60,951 | 60,952 | 60,953 | 60,954 | 60,955 | 60,956 | 60,957 | 60,958 | 60,959 | 60,960 | 60,961 | 60,962 | 60,963 |
| | 2-65 | 60,976 | 60,977 | 60,978 | 60,979 | 60,980 | 60,981 | 60,982 | 60,983 | 60,984 | 60,985 | 60,986 | 60,987 | 60,988 |
| | 2-66 | 61,001 | 61,002 | 61,003 | 61,004 | 61,005 | 61,006 | 61,007 | 61,008 | 61,009 | 61,010 | 61,011 | 61,012 | 61,013 |
| | 2-67 | 61,026 | 61,027 | 61,028 | 61,029 | 61,030 | 61,031 | 61,032 | 61,033 | 61,034 | 61,035 | 61,036 | 61,037 | 61,038 |
| | 2-68 | 61,051 | 61,052 | 61,053 | 61,054 | 61,055 | 61,056 | 61,057 | 61,058 | 61,059 | 61,060 | 61,061 | 61,062 | 61,063 |
| | 2-69 | 61,076 | 61,077 | 61,078 | 61,079 | 61,080 | 61,081 | 61,082 | 61,083 | 61,084 | 61,085 | 61,086 | 61,087 | 61,088 |
| | 2-70 | 61,101 | 61,102 | 61,103 | 61,104 | 61,105 | 61,106 | 61,107 | 61,108 | 61,109 | 61,110 | 61,111 | 61,112 | 61,113 |
| | 2-71 | 61,126 | 61,127 | 61,128 | 61,129 | 61,130 | 61,131 | 61,132 | 61,133 | 61,134 | 61,135 | 61,136 | 61,137 | 61,138 |
| | 2-72 | 61,151 | 61,152 | 61,153 | 61,154 | 61,155 | 61,156 | 61,157 | 61,158 | 61,159 | 61,160 | 61,161 | 61,162 | 61,163 |
| | 2-73 | 61,176 | 61,177 | 61,178 | 61,179 | 61,180 | 61,181 | 61,182 | 61,183 | 61,184 | 61,185 | 61,186 | 61,187 | 61,188 |
| | 2-74 | 61,201 | 61,202 | 61,203 | 61,204 | 61,205 | 61,206 | 61,207 | 61,208 | 61,209 | 61,210 | 61,211 | 61,212 | 61,213 |
| | 2-75 | 61,226 | 61,227 | 61,228 | 61,229 | 61,230 | 61,231 | 61,232 | 61,233 | 61,234 | 61,235 | 61,236 | 61,237 | 61,238 |
| | 2-76 | 61,251 | 61,252 | 61,253 | 61,254 | 61,255 | 61,256 | 61,257 | 61,258 | 61,259 | 61,260 | 61,261 | 61,262 | 61,263 |
| | 2-77 | 61,276 | 61,277 | 61,278 | 61,279 | 61,280 | 61,281 | 61,282 | 61,283 | 61,284 | 61,285 | 61,286 | 61,287 | 61,288 |
| | 2-78 | 61,301 | 61,302 | 61,303 | 61,304 | 61,305 | 61,306 | 61,307 | 61,308 | 61,309 | 61,310 | 61,311 | 61,312 | 61,313 |
| | 2-79 | 61,326 | 61,327 | 61,328 | 61,329 | 61,330 | 61,331 | 61,332 | 61,333 | 61,334 | 61,335 | 61,336 | 61,337 | 61,338 |
| | 2-80 | 61,351 | 61,352 | 61,353 | 61,354 | 61,355 | 61,356 | 61,357 | 61,358 | 61,359 | 61,360 | 61,361 | 61,362 | 61,363 |
| | 2-81 | 61,376 | 61,377 | 61,378 | 61,379 | 61,380 | 61,381 | 61,382 | 61,383 | 61,384 | 61,385 | 61,386 | 61,387 | 61,388 |
| | 2-82 | 61,401 | 61,402 | 61,403 | 61,404 | 61,405 | 61,406 | 61,407 | 61,408 | 61,409 | 61,410 | 61,411 | 61,412 | 61,413 |
| | 2-83 | 61,426 | 61,427 | 61,428 | 61,429 | 61,430 | 61,431 | 61,432 | 61,433 | 61,434 | 61,435 | 61,436 | 61,437 | 61,438 |
| | 2-84 | 61,451 | 61,452 | 61,453 | 61,454 | 61,455 | 61,456 | 61,457 | 61,458 | 61,459 | 61,460 | 61,461 | 61,462 | 61,463 |
| | 2-85 | 61,476 | 61,477 | 61,478 | 61,479 | 61,480 | 61,481 | 61,482 | 61,483 | 61,484 | 61,485 | 61,486 | 61,487 | 61,488 |
| | 2-86 | 61,501 | 61,502 | 61,503 | 61,504 | 61,505 | 61,506 | 61,507 | 61,508 | 61,509 | 61,510 | 61,511 | 61,512 | 61,513 |
| | 2-87 | 61,526 | 61,527 | 61,528 | 61,529 | 61,530 | 61,531 | 61,532 | 61,533 | 61,534 | 61,535 | 61,536 | 61,537 | 61,538 |
| | 2-88 | 61,551 | 61,552 | 61,553 | 61,554 | 61,555 | 61,556 | 61,557 | 61,558 | 61,559 | 61,560 | 61,561 | 61,562 | 61,563 |
| | 2-89 | 61,576 | 61,577 | 61,578 | 61,579 | 61,580 | 61,581 | 61,582 | 61,583 | 61,584 | 61,585 | 61,586 | 61,587 | 61,588 |
| | 2-90 | 61,601 | 61,602 | 61,603 | 61,604 | 61,605 | 61,606 | 61,607 | 61,608 | 61,609 | 61,610 | 61,611 | 61,612 | 61,613 |
| | 2-91 | 61,626 | 61,627 | 61,628 | 61,629 | 61,630 | 61,631 | 61,632 | 61,633 | 61,634 | 61,635 | 61,636 | 61,637 | 61,638 |
| | 2-92 | 61,651 | 61,652 | 61,653 | 61,654 | 61,655 | 61,656 | 61,657 | 61,658 | 61,659 | 61,660 | 61,661 | 61,662 | 61,663 |
| | 2-93 | 61,676 | 61,677 | 61,678 | 61,679 | 61,680 | 61,681 | 61,682 | 61,683 | 61,684 | 61,685 | 61,686 | 61,687 | 61,688 |
| | 2-94 | 61,701 | 61,702 | 61,703 | 61,704 | 61,705 | 61,706 | 61,707 | 61,708 | 61,709 | 61,710 | 61,711 | 61,712 | 61,713 |
| | 2-95 | 61,726 | 61,727 | 61,728 | 61,729 | 61,730 | 61,731 | 61,732 | 61,733 | 61,734 | 61,735 | 61,736 | 61,737 | 61,738 |
| | 2-96 | 61,751 | 61,752 | 61,753 | 61,754 | 61,755 | 61,756 | 61,757 | 61,758 | 61,759 | 61,760 | 61,761 | 61,762 | 61,763 |

TABLE 47-continued

| | | | | | | | | | | | | | |
|---|---|---|---|---|---|---|---|---|---|---|---|---|---|
| 2-97 | 61,776 | 61,777 | 61,778 | 61,779 | 61,780 | 61,781 | 61,782 | 61,783 | 61,784 | 61,785 | 61,786 | 61,787 | 61,788 |
| 2-98 | 61,801 | 61,802 | 61,803 | 61,804 | 61,805 | 61,806 | 61,807 | 61,808 | 61,809 | 61,810 | 61,811 | 61,812 | 61,813 |
| 2-99 | 61,826 | 61,827 | 61,828 | 61,829 | 61,830 | 61,831 | 61,832 | 61,833 | 61,834 | 61,835 | 61,836 | 61,837 | 61,838 |
| 2-100 | 61,851 | 61,852 | 61,853 | 61,854 | 61,855 | 61,856 | 61,857 | 61,858 | 61,859 | 61,860 | 61,861 | 61,862 | 61,863 |
| 2-101 | 61,876 | 61,877 | 61,878 | 61,879 | 61,880 | 61,881 | 61,882 | 61,883 | 61,884 | 61,885 | 61,886 | 61,887 | 61,888 |
| 2-102 | 61,901 | 61,902 | 61,903 | 61,904 | 61,905 | 61,906 | 61,907 | 61,908 | 61,909 | 61,910 | 61,911 | 61,912 | 61,913 |
| 2-103 | 61,926 | 61,927 | 61,928 | 61,929 | 61,930 | 61,931 | 61,932 | 61,933 | 61,934 | 61,935 | 61,936 | 61,937 | 61,938 |
| 2-104 | 61,951 | 61,952 | 61,953 | 61,954 | 61,955 | 61,956 | 61,957 | 61,958 | 61,959 | 61,960 | 61,961 | 61,962 | 61,963 |
| 2-105 | 61,976 | 61,977 | 61,978 | 61,979 | 61,980 | 61,981 | 61,982 | 61,983 | 61,984 | 61,985 | 61,986 | 61,987 | 61,988 |
| 2-106 | 62,001 | 62,002 | 62,003 | 62,004 | 62,005 | 62,006 | 62,007 | 62,008 | 62,009 | 62,010 | 62,011 | 62,012 | 62,013 |
| 2-107 | 62,026 | 62,027 | 62,028 | 62,029 | 62,030 | 62,031 | 62,032 | 62,033 | 62,034 | 62,035 | 62,036 | 62,037 | 62,038 |
| 2-108 | 62,051 | 62,052 | 62,053 | 62,054 | 62,055 | 62,056 | 62,057 | 62,058 | 62,059 | 62,060 | 62,061 | 62,062 | 62,063 |
| 2-109 | 62,076 | 62,077 | 62,078 | 62,079 | 62,080 | 62,081 | 62,082 | 62,083 | 62,084 | 62,085 | 62,086 | 62,087 | 62,088 |
| 2-110 | 62,101 | 62,102 | 62,103 | 62,104 | 62,105 | 62,106 | 62,107 | 62,108 | 62,109 | 62,110 | 62,111 | 62,112 | 62,113 |

| | | Compound represented by the formula (1) | | | | | | | | | | | |
|---|---|---|---|---|---|---|---|---|---|---|---|---|---|
| | | 1-139 | 1-140 | 1-141 | 1-142 | 1-143 | 1-144 | 1-145 | 1-146 | 1-147 | 1-148 | 1-149 | 1-150 |
| Compound represented by the formula (2) | 2-56 | 60,764 | 60,765 | 60,766 | 60,767 | 60,768 | 60,769 | 60,770 | 60,771 | 60,772 | 60,773 | 60,774 | 60,775 |
| | 2-57 | 60,789 | 60,790 | 60,791 | 60,792 | 60,793 | 60,794 | 60,795 | 60,796 | 60,797 | 60,798 | 60,799 | 60,800 |
| | 2-58 | 60,814 | 60,815 | 60,816 | 60,817 | 60,818 | 60,819 | 60,820 | 60,821 | 60,822 | 60,823 | 60,824 | 60,825 |
| | 2-59 | 60,839 | 60,840 | 60,841 | 60,842 | 60,843 | 60,844 | 60,845 | 60,846 | 60,847 | 60,848 | 60,849 | 60,850 |
| | 2-60 | 60,864 | 60,865 | 60,866 | 60,867 | 60,868 | 60,869 | 60,870 | 60,871 | 60,872 | 60,873 | 60,874 | 60,875 |
| | 2-61 | 60,889 | 60,890 | 60,891 | 60,892 | 60,893 | 60,894 | 60,895 | 60,896 | 60,897 | 60,898 | 60,899 | 60,900 |
| | 2-62 | 60,914 | 60,915 | 60,916 | 60,917 | 60,918 | 60,919 | 60,920 | 60,921 | 60,922 | 60,923 | 60,924 | 60,925 |
| | 2-63 | 60,939 | 60,940 | 60,941 | 60,942 | 60,943 | 60,944 | 60,945 | 60,946 | 60,947 | 60,948 | 60,949 | 60,950 |
| | 2-64 | 60,964 | 60,965 | 60,966 | 60,967 | 60,968 | 60,969 | 60,970 | 60,971 | 60,972 | 60,973 | 60,974 | 60,975 |
| | 2-65 | 60,989 | 60,990 | 60,991 | 60,992 | 60,993 | 60,994 | 60,995 | 60,996 | 60,997 | 60,998 | 60,999 | 61,000 |
| | 2-66 | 61,014 | 61,015 | 61,016 | 61,017 | 61,018 | 61,019 | 61,020 | 61,021 | 61,022 | 61,023 | 61,024 | 61,025 |
| | 2-67 | 61,039 | 61,040 | 61,041 | 61,042 | 61,043 | 61,044 | 61,045 | 61,046 | 61,047 | 61,048 | 61,049 | 61,050 |
| | 2-68 | 61,064 | 61,065 | 61,066 | 61,067 | 61,068 | 61,069 | 61,070 | 61,071 | 61,072 | 61,073 | 61,074 | 61,075 |
| | 2-69 | 61,089 | 61,090 | 61,091 | 61,092 | 61,093 | 61,094 | 61,095 | 61,096 | 61,097 | 61,098 | 61,099 | 61,100 |
| | 2-70 | 61,114 | 61,115 | 61,116 | 61,117 | 61,118 | 61,119 | 61,120 | 61,121 | 61,122 | 61,123 | 61,124 | 61,125 |
| | 2-71 | 61,139 | 61,140 | 61,141 | 61,142 | 61,143 | 61,144 | 61,145 | 61,146 | 61,147 | 61,148 | 61,149 | 61,150 |
| | 2-72 | 61,164 | 61,165 | 61,166 | 61,167 | 61,168 | 61,169 | 61,170 | 61,171 | 61,172 | 61,173 | 61,174 | 61,175 |
| | 2-73 | 61,189 | 61,190 | 61,191 | 61,192 | 61,193 | 61,194 | 61,195 | 61,196 | 61,197 | 61,198 | 61,199 | 61,200 |
| | 2-74 | 61,214 | 61,215 | 61,216 | 61,217 | 61,218 | 61,219 | 61,220 | 61,221 | 61,222 | 61,223 | 61,224 | 61,225 |
| | 2-75 | 61,239 | 61,240 | 61,241 | 61,242 | 61,243 | 61,244 | 61,245 | 61,246 | 61,247 | 61,248 | 61,249 | 61,250 |
| | 2-76 | 61,264 | 61,265 | 61,266 | 61,267 | 61,268 | 61,269 | 61,270 | 61,271 | 61,272 | 61,273 | 61,274 | 61,275 |
| | 2-77 | 61,289 | 61,290 | 61,291 | 61,292 | 61,293 | 61,294 | 61,295 | 61,296 | 61,297 | 61,298 | 61,299 | 61,300 |
| | 2-78 | 61,314 | 61,315 | 61,316 | 61,317 | 61,318 | 61,319 | 61,320 | 61,321 | 61,322 | 61,323 | 61,324 | 61,325 |
| | 2-79 | 61,339 | 61,340 | 61,341 | 61,342 | 61,343 | 61,344 | 61,345 | 61,346 | 61,347 | 61,348 | 61,349 | 61,350 |
| | 2-80 | 61,364 | 61,365 | 61,366 | 61,367 | 61,368 | 61,369 | 61,370 | 61,371 | 61,372 | 61,373 | 61,374 | 61,375 |
| | 2-81 | 61,389 | 61,390 | 61,391 | 61,392 | 61,393 | 61,394 | 61,395 | 61,396 | 61,397 | 61,398 | 61,399 | 61,400 |
| | 2-82 | 61,414 | 61,415 | 61,416 | 61,417 | 61,418 | 61,419 | 61,420 | 61,421 | 61,422 | 61,423 | 61,424 | 61,425 |
| | 2-83 | 61,439 | 61,440 | 61,441 | 61,442 | 61,443 | 61,444 | 61,445 | 61,446 | 61,447 | 61,448 | 61,449 | 61,450 |
| | 2-84 | 61,464 | 61,465 | 61,466 | 61,467 | 61,468 | 61,469 | 61,470 | 61,471 | 61,472 | 61,473 | 61,474 | 61,475 |
| | 2-85 | 61,489 | 61,490 | 61,491 | 61,492 | 61,493 | 61,494 | 61,495 | 61,496 | 61,497 | 61,498 | 61,499 | 61,500 |
| | 2-86 | 61,514 | 61,515 | 61,516 | 61,517 | 61,518 | 61,519 | 61,520 | 61,521 | 61,522 | 61,523 | 61,524 | 61,525 |
| | 2-87 | 61,539 | 61,540 | 61,541 | 61,542 | 61,543 | 61,544 | 61,545 | 61,546 | 61,547 | 61,548 | 61,549 | 61,550 |
| | 2-88 | 61,564 | 61,565 | 61,566 | 61,567 | 61,568 | 61,569 | 61,570 | 61,571 | 61,572 | 61,573 | 61,574 | 61,575 |
| | 2-89 | 61,589 | 61,590 | 61,591 | 61,592 | 61,593 | 61,594 | 61,595 | 61,596 | 61,597 | 61,598 | 61,599 | 61,600 |
| | 2-90 | 61,614 | 61,615 | 61,616 | 61,617 | 61,618 | 61,619 | 61,620 | 61,621 | 61,622 | 61,623 | 61,624 | 61,625 |
| | 2-91 | 61,639 | 61,640 | 61,641 | 61,642 | 61,643 | 61,644 | 61,645 | 61,646 | 61,647 | 61,648 | 61,649 | 61,650 |
| | 2-92 | 61,664 | 61,665 | 61,666 | 61,667 | 61,668 | 61,669 | 61,670 | 61,671 | 61,672 | 61,673 | 61,674 | 61,675 |
| | 2-93 | 61,689 | 61,690 | 61,691 | 61,692 | 61,693 | 61,694 | 61,695 | 61,696 | 61,697 | 61,698 | 61,699 | 61,700 |
| | 2-94 | 61,714 | 61,715 | 61,716 | 61,717 | 61,718 | 61,719 | 61,720 | 61,721 | 61,722 | 61,723 | 61,724 | 61,725 |
| | 2-95 | 61,739 | 61,740 | 61,741 | 61,742 | 61,743 | 61,744 | 61,745 | 61,746 | 61,747 | 61,748 | 61,749 | 61,750 |
| | 2-96 | 61,764 | 61,765 | 61,766 | 61,767 | 61,768 | 61,769 | 61,770 | 61,771 | 61,772 | 61,773 | 61,774 | 61,775 |
| | 2-97 | 61,789 | 61,790 | 61,791 | 61,792 | 61,793 | 61,794 | 61,795 | 61,796 | 61,797 | 61,798 | 61,799 | 61,800 |
| | 2-98 | 61,814 | 61,815 | 61,816 | 61,817 | 61,818 | 61,819 | 61,820 | 61,821 | 61,822 | 61,823 | 61,824 | 61,825 |
| | 2-99 | 61,839 | 61,840 | 61,841 | 61,842 | 61,843 | 61,844 | 61,845 | 61,846 | 61,847 | 61,848 | 61,849 | 61,850 |
| | 2-100 | 61,864 | 61,865 | 61,866 | 61,867 | 61,868 | 61,869 | 61,870 | 61,871 | 61,872 | 61,873 | 61,874 | 61,875 |
| | 2-101 | 61,889 | 61,890 | 61,891 | 61,892 | 61,893 | 61,894 | 61,895 | 61,896 | 61,897 | 61,898 | 61,899 | 61,900 |
| | 2-102 | 61,914 | 61,915 | 61,916 | 61,917 | 61,918 | 61,919 | 61,920 | 61,921 | 61,922 | 61,923 | 61,924 | 61,925 |
| | 2-103 | 61,939 | 61,940 | 61,941 | 61,942 | 61,943 | 61,944 | 61,945 | 61,946 | 61,947 | 61,948 | 61,949 | 61,950 |
| | 2-104 | 61,964 | 61,965 | 61,966 | 61,967 | 61,968 | 61,969 | 61,970 | 61,971 | 61,972 | 61,973 | 61,974 | 61,975 |
| | 2-105 | 61,989 | 61,990 | 61,991 | 61,992 | 61,993 | 61,994 | 61,995 | 61,996 | 61,997 | 61,998 | 61,999 | 62,000 |
| | 2-106 | 62,014 | 62,015 | 62,016 | 62,017 | 62,018 | 62,019 | 62,020 | 62,021 | 62,022 | 62,023 | 62,024 | 62,025 |
| | 2-107 | 62,039 | 62,040 | 62,041 | 62,042 | 62,043 | 62,044 | 62,045 | 62,046 | 62,047 | 62,048 | 62,049 | 62,050 |
| | 2-108 | 62,064 | 62,065 | 62,066 | 62,067 | 62,068 | 62,069 | 62,070 | 62,071 | 62,072 | 62,073 | 62,074 | 62,075 |
| | 2-109 | 62,089 | 62,090 | 62,091 | 62,092 | 62,093 | 62,094 | 62,095 | 62,096 | 62,097 | 62,098 | 62,099 | 62,100 |
| | 2-110 | 62,114 | 62,115 | 62,116 | 62,117 | 62,118 | 62,119 | 62,120 | 62,121 | 62,122 | 62,123 | 62,124 | 62,125 |

TABLE 48

| | | Compound represented by the formula (1) | | | | | | | | | | | | |
|---|---|---|---|---|---|---|---|---|---|---|---|---|---|---|
| | | 1-126 | 1-127 | 1-128 | 1-129 | 1-130 | 1-131 | 1-132 | 1-133 | 1-134 | 1-135 | 1-136 | 1-137 | 1-138 |
| Compound represented by the formula (2) | 2-111 | 62,126 | 62,127 | 62,128 | 62,129 | 62,130 | 62,131 | 62,132 | 62,133 | 62,134 | 62,135 | 62,136 | 62,137 | 62,138 |
| | 2-112 | 62,151 | 62,152 | 62,153 | 62,154 | 62,155 | 62,156 | 62,157 | 62,158 | 62,159 | 62,160 | 62,161 | 62,162 | 62,163 |
| | 2-113 | 62,176 | 62,177 | 62,178 | 62,179 | 62,180 | 62,181 | 62,182 | 62,183 | 62,184 | 62,185 | 62,186 | 62,187 | 62,188 |
| | 2-114 | 62,201 | 62,202 | 62,203 | 62,204 | 62,205 | 62,206 | 62,207 | 62,208 | 62,209 | 62,210 | 62,211 | 62,212 | 62,213 |
| | 2-115 | 62,226 | 62,227 | 62,228 | 62,229 | 62,230 | 62,231 | 62,232 | 62,233 | 62,234 | 62,235 | 62,236 | 62,237 | 62,238 |
| | 2-116 | 62,251 | 62,252 | 62,253 | 62,254 | 62,255 | 62,256 | 62,257 | 62,258 | 62,259 | 62,260 | 62,261 | 62,262 | 62,263 |
| | 2-117 | 62,276 | 62,277 | 62,278 | 62,279 | 62,280 | 62,281 | 62,282 | 62,283 | 62,284 | 62,285 | 62,286 | 62,287 | 62,288 |
| | 2-118 | 62,301 | 62,302 | 62,303 | 62,304 | 62,305 | 62,306 | 62,307 | 62,308 | 62,309 | 62,310 | 62,311 | 62,312 | 62,313 |
| | 2-119 | 62,326 | 62,327 | 62,328 | 62,329 | 62,330 | 62,331 | 62,332 | 62,333 | 62,334 | 62,335 | 62,336 | 62,337 | 62,338 |
| | 2-120 | 62,351 | 62,352 | 62,353 | 62,354 | 62,355 | 62,356 | 62,357 | 62,358 | 62,359 | 62,360 | 62,361 | 62,362 | 62,363 |
| | 2-121 | 62,376 | 62,377 | 62,378 | 62,379 | 62,380 | 62,381 | 62,382 | 62,383 | 62,384 | 62,385 | 62,386 | 62,387 | 62,388 |
| | 2-122 | 62,401 | 62,402 | 62,403 | 62,404 | 62,405 | 62,406 | 62,407 | 62,408 | 62,409 | 62,410 | 62,411 | 62,412 | 62,413 |
| | 2-123 | 62,426 | 62,427 | 62,428 | 62,429 | 62,430 | 62,431 | 62,432 | 62,433 | 62,434 | 62,435 | 62,436 | 62,437 | 62,438 |
| | 2-124 | 62,451 | 62,452 | 62,453 | 62,454 | 62,455 | 62,456 | 62,457 | 62,458 | 62,459 | 62,460 | 62,461 | 62,462 | 62,463 |
| | 2-125 | 62,476 | 62,477 | 62,478 | 62,479 | 62,480 | 62,481 | 62,482 | 62,483 | 62,484 | 62,485 | 62,486 | 62,487 | 62,488 |
| | 2-126 | 62,501 | 62,502 | 62,503 | 62,504 | 62,505 | 62,506 | 62,507 | 62,508 | 62,509 | 62,510 | 62,511 | 62,512 | 62,513 |
| | 2-127 | 62,526 | 62,527 | 62,528 | 62,529 | 62,530 | 62,531 | 62,532 | 62,533 | 62,534 | 62,535 | 62,536 | 62,537 | 62,538 |
| | 2-128 | 62,551 | 62,552 | 62,553 | 62,554 | 62,555 | 62,556 | 62,557 | 62,558 | 62,559 | 62,560 | 62,561 | 62,562 | 62,563 |
| | 2-129 | 62,576 | 62,577 | 62,578 | 62,579 | 62,580 | 62,581 | 62,582 | 62,583 | 62,584 | 62,585 | 62,586 | 62,587 | 62,588 |
| | 2-130 | 62,601 | 62,602 | 62,603 | 62,604 | 62,605 | 62,606 | 62,607 | 62,608 | 62,609 | 62,610 | 62,611 | 62,612 | 62,613 |
| | 2-131 | 62,626 | 62,627 | 62,628 | 62,629 | 62,630 | 62,631 | 62,632 | 62,633 | 62,634 | 62,635 | 62,636 | 62,637 | 62,638 |
| | 2-132 | 62,651 | 62,652 | 62,653 | 62,654 | 62,655 | 62,656 | 62,657 | 62,658 | 62,659 | 62,660 | 62,661 | 62,662 | 62,663 |
| | 2-133 | 62,676 | 62,677 | 62,678 | 62,679 | 62,680 | 62,681 | 62,682 | 62,683 | 62,684 | 62,685 | 62,686 | 62,687 | 62,688 |
| | 2-134 | 62,701 | 62,702 | 62,703 | 62,704 | 62,705 | 62,706 | 62,707 | 62,708 | 62,709 | 62,710 | 62,711 | 62,712 | 62,713 |
| | 2-135 | 62,726 | 62,727 | 62,728 | 62,729 | 62,730 | 62,731 | 62,732 | 62,733 | 62,734 | 62,735 | 62,736 | 62,737 | 62,738 |
| | 2-136 | 62,751 | 62,752 | 62,753 | 62,754 | 62,755 | 62,756 | 62,757 | 62,758 | 62,759 | 62,760 | 62,761 | 62,762 | 62,763 |
| | 2-137 | 62,776 | 62,777 | 62,778 | 62,779 | 62,780 | 62,781 | 62,782 | 62,783 | 62,784 | 62,785 | 62,786 | 62,787 | 62,788 |
| | 2-138 | 62,801 | 62,802 | 62,803 | 62,804 | 62,805 | 62,806 | 62,807 | 62,808 | 62,809 | 62,810 | 62,811 | 62,812 | 62,813 |
| | 2-139 | 62,826 | 62,827 | 62,828 | 62,829 | 62,830 | 62,831 | 62,832 | 62,833 | 62,834 | 62,835 | 62,836 | 62,837 | 62,838 |
| | 2-140 | 62,851 | 62,852 | 62,853 | 62,854 | 62,855 | 62,856 | 62,857 | 62,858 | 62,859 | 62,860 | 62,861 | 62,862 | 62,863 |
| | 2-141 | 62,876 | 62,877 | 62,878 | 62,879 | 62,880 | 62,881 | 62,882 | 62,883 | 62,884 | 62,885 | 62,886 | 62,887 | 62,888 |
| | 2-142 | 62,901 | 62,902 | 62,903 | 62,904 | 62,905 | 62,906 | 62,907 | 62,908 | 62,909 | 62,910 | 62,911 | 62,912 | 62,913 |
| | 2-143 | 62,926 | 62,927 | 62,928 | 62,929 | 62,930 | 62,931 | 62,932 | 62,933 | 62,934 | 62,935 | 62,936 | 62,937 | 62,938 |
| | 2-144 | 62,951 | 62,952 | 62,953 | 62,954 | 62,955 | 62,956 | 62,957 | 62,958 | 62,959 | 62,960 | 62,961 | 62,962 | 62,963 |
| | 2-145 | 62,976 | 62,977 | 62,978 | 62,979 | 62,980 | 62,981 | 62,982 | 62,983 | 62,984 | 62,985 | 62,986 | 62,987 | 62,988 |
| | 2-146 | 63,001 | 63,002 | 63,003 | 63,004 | 63,005 | 63,006 | 63,007 | 63,008 | 63,009 | 63,010 | 63,011 | 63,012 | 63,013 |
| | 2-147 | 63,026 | 63,027 | 63,028 | 63,029 | 63,030 | 63,031 | 63,032 | 63,033 | 63,034 | 63,035 | 63,036 | 63,037 | 63,038 |
| | 2-148 | 63,051 | 63,052 | 63,053 | 63,054 | 63,055 | 63,056 | 63,057 | 63,058 | 63,059 | 63,060 | 63,061 | 63,062 | 63,063 |
| | 2-149 | 63,076 | 63,077 | 63,078 | 63,079 | 63,080 | 63,081 | 63,082 | 63,083 | 63,084 | 63,085 | 63,086 | 63,087 | 63,088 |
| | 2-150 | 63,101 | 63,102 | 63,103 | 63,104 | 63,105 | 63,106 | 63,107 | 63,108 | 63,109 | 63,110 | 63,111 | 63,112 | 63,113 |
| | 2-151 | 63,126 | 63,127 | 63,128 | 63,129 | 63,130 | 63,131 | 63,132 | 63,133 | 63,134 | 63,135 | 63,136 | 63,137 | 63,138 |
| | 2-152 | 63,151 | 63,152 | 63,153 | 63,154 | 63,155 | 63,156 | 63,157 | 63,158 | 63,159 | 63,160 | 63,161 | 63,162 | 63,163 |
| | 2-153 | 63,176 | 63,177 | 63,178 | 63,179 | 63,180 | 63,181 | 63,182 | 63,183 | 63,184 | 63,185 | 63,186 | 63,187 | 63,188 |
| | 2-154 | 63,201 | 63,202 | 63,203 | 63,204 | 63,205 | 63,206 | 63,207 | 63,208 | 63,209 | 63,210 | 63,211 | 63,212 | 63,213 |
| | 2-155 | 63,226 | 63,227 | 63,228 | 63,229 | 63,230 | 63,231 | 63,232 | 63,233 | 63,234 | 63,235 | 63,236 | 63,237 | 63,238 |
| | 2-156 | 63,251 | 63,252 | 63,253 | 63,254 | 63,255 | 63,256 | 63,257 | 63,258 | 63,259 | 63,260 | 63,261 | 63,262 | 63,263 |
| | 2-157 | 63,276 | 63,277 | 63,278 | 63,279 | 63,280 | 63,281 | 63,282 | 63,283 | 63,284 | 63,285 | 63,286 | 63,287 | 63,288 |
| | 2-158 | 63,301 | 63,302 | 63,303 | 63,304 | 63,305 | 63,306 | 63,307 | 63,308 | 63,309 | 63,310 | 63,311 | 63,312 | 63,313 |
| | 2-159 | 63,326 | 63,327 | 63,328 | 63,329 | 63,330 | 63,331 | 63,332 | 63,333 | 63,334 | 63,335 | 63,336 | 63,337 | 63,338 |
| | 2-160 | 63,351 | 63,352 | 63,353 | 63,354 | 63,355 | 63,356 | 63,357 | 63,358 | 63,359 | 63,360 | 63,361 | 63,362 | 63,363 |
| | 2-161 | 63,376 | 63,377 | 63,378 | 63,379 | 63,380 | 63,381 | 63,382 | 63,383 | 63,384 | 63,385 | 63,386 | 63,387 | 63,388 |
| | 2-162 | 63,401 | 63,402 | 63,403 | 63,404 | 63,405 | 63,406 | 63,407 | 63,408 | 63,409 | 63,410 | 63,411 | 63,412 | 63,413 |
| | 2-163 | 63,426 | 63,427 | 63,428 | 63,429 | 63,430 | 63,431 | 63,432 | 63,433 | 63,434 | 63,435 | 63,436 | 63,437 | 63,438 |
| | 2-164 | 63,451 | 63,452 | 63,453 | 63,454 | 63,455 | 63,456 | 63,457 | 63,458 | 63,459 | 63,460 | 63,461 | 63,462 | 63,463 |
| | 2-165 | 63,476 | 63,477 | 63,478 | 63,479 | 63,480 | 63,481 | 63,482 | 63,483 | 63,484 | 63,485 | 63,486 | 63,487 | 63,488 |

| | | Compound represented by the formula (1) | | | | | | | | | | | |
|---|---|---|---|---|---|---|---|---|---|---|---|---|---|
| | | 1-139 | 1-140 | 1-141 | 1-142 | 1-143 | 1-144 | 1-145 | 1-146 | 1-147 | 1-148 | 1-149 | 1-150 |
| Compound represented by the formula (2) | 2-111 | 62,139 | 62,140 | 62,141 | 62,142 | 62,143 | 62,144 | 62,145 | 62,146 | 62,147 | 62,148 | 62,149 | 62,150 |
| | 2-112 | 62,164 | 62,165 | 62,166 | 62,167 | 62,168 | 62,169 | 62,170 | 62,171 | 62,172 | 62,173 | 62,174 | 62,175 |
| | 2-113 | 62,189 | 62,190 | 62,191 | 62,192 | 62,193 | 62,194 | 62,195 | 62,196 | 62,197 | 62,198 | 62,199 | 62,200 |
| | 2-114 | 62,214 | 62,215 | 62,216 | 62,217 | 62,218 | 62,219 | 62,220 | 62,221 | 62,222 | 62,223 | 62,224 | 62,225 |
| | 2-115 | 62,239 | 62,240 | 62,241 | 62,242 | 62,243 | 62,244 | 62,245 | 62,246 | 62,247 | 62,248 | 62,249 | 62,250 |
| | 2-116 | 62,264 | 62,265 | 62,266 | 62,267 | 62,268 | 62,269 | 62,270 | 62,271 | 62,272 | 62,273 | 62,274 | 62,275 |
| | 2-117 | 62,289 | 62,290 | 62,291 | 62,292 | 62,293 | 62,294 | 62,295 | 62,296 | 62,297 | 62,298 | 62,299 | 62,300 |
| | 2-118 | 62,314 | 62,315 | 62,316 | 62,317 | 62,318 | 62,319 | 62,320 | 62,321 | 62,322 | 62,323 | 62,324 | 62,325 |
| | 2-119 | 62,339 | 62,340 | 62,341 | 62,342 | 62,343 | 62,344 | 62,345 | 62,346 | 62,347 | 62,348 | 62,349 | 62,350 |
| | 2-120 | 62,364 | 62,365 | 62,366 | 62,367 | 62,368 | 62,369 | 62,370 | 62,371 | 62,372 | 62,373 | 62,374 | 62,375 |
| | 2-121 | 62,389 | 62,390 | 62,391 | 62,392 | 62,393 | 62,394 | 62,395 | 62,396 | 62,397 | 62,398 | 62,399 | 62,400 |
| | 2-122 | 62,414 | 62,415 | 62,416 | 62,417 | 62,418 | 62,419 | 62,420 | 62,421 | 62,422 | 62,423 | 62,424 | 62,425 |
| | 2-123 | 62,439 | 62,440 | 62,441 | 62,442 | 62,443 | 62,444 | 62,445 | 62,446 | 62,447 | 62,448 | 62,449 | 62,450 |
| | 2-124 | 62,464 | 62,465 | 62,466 | 62,467 | 62,468 | 62,469 | 62,470 | 62,471 | 62,472 | 62,473 | 62,474 | 62,475 |
| | 2-125 | 62,489 | 62,490 | 62,491 | 62,492 | 62,493 | 62,494 | 62,495 | 62,496 | 62,497 | 62,498 | 62,499 | 62,500 |
| | 2-126 | 62,514 | 62,515 | 62,516 | 62,517 | 62,518 | 62,519 | 62,520 | 62,521 | 62,522 | 62,523 | 62,524 | 62,525 |

TABLE 48-continued

| | | | | | | | | | | | | | |
|---|---|---|---|---|---|---|---|---|---|---|---|---|---|
| | 2-127 | 62,539 | 62,540 | 62,541 | 62,542 | 62,543 | 62,544 | 62,545 | 62,546 | 62,547 | 62,548 | 62,549 | 62,550 |
| | 2-128 | 62,564 | 62,565 | 62,566 | 62,567 | 62,568 | 62,569 | 62,570 | 62,571 | 62,572 | 62,573 | 62,574 | 62,575 |
| | 2-129 | 62,589 | 62,590 | 62,591 | 62,592 | 62,593 | 62,594 | 62,595 | 62,596 | 62,597 | 62,598 | 62,599 | 62,600 |
| | 2-130 | 62,614 | 62,615 | 62,616 | 62,617 | 62,618 | 62,619 | 62,620 | 62,621 | 62,622 | 62,623 | 62,624 | 62,625 |
| | 2-131 | 62,639 | 62,640 | 62,641 | 62,642 | 62,643 | 62,644 | 62,645 | 62,646 | 62,647 | 62,648 | 62,649 | 62,650 |
| | 2-132 | 62,664 | 62,665 | 62,666 | 62,667 | 62,668 | 62,669 | 62,670 | 62,671 | 62,672 | 62,673 | 62,674 | 62,675 |
| | 2-133 | 62,689 | 62,690 | 62,691 | 62,692 | 62,693 | 62,694 | 62,695 | 62,696 | 62,697 | 62,698 | 62,699 | 62,700 |
| | 2-134 | 62,714 | 62,715 | 62,716 | 62,717 | 62,718 | 62,719 | 62,720 | 62,721 | 62,722 | 62,723 | 62,724 | 62,725 |
| | 2-135 | 62,739 | 62,740 | 62,741 | 62,742 | 62,743 | 62,744 | 62,745 | 62,746 | 62,747 | 62,748 | 62,749 | 62,750 |
| | 2-136 | 62,764 | 62,765 | 62,766 | 62,767 | 62,768 | 62,769 | 62,770 | 62,771 | 62,772 | 62,773 | 62,774 | 62,775 |
| | 2-137 | 62,789 | 62,790 | 62,791 | 62,792 | 62,793 | 62,794 | 62,795 | 62,796 | 62,797 | 62,798 | 62,799 | 62,800 |
| | 2-138 | 62,814 | 62,815 | 62,816 | 62,817 | 62,818 | 62,819 | 62,820 | 62,821 | 62,822 | 62,823 | 62,824 | 62,825 |
| | 2-139 | 62,839 | 62,840 | 62,841 | 62,842 | 62,843 | 62,844 | 62,845 | 62,846 | 62,847 | 62,848 | 62,849 | 62,850 |
| | 2-140 | 62,864 | 62,865 | 62,866 | 62,867 | 62,868 | 62,869 | 62,870 | 62,871 | 62,872 | 62,873 | 62,874 | 62,875 |
| | 2-141 | 62,889 | 62,890 | 62,891 | 62,892 | 62,893 | 62,894 | 62,895 | 62,896 | 62,897 | 62,898 | 62,899 | 62,900 |
| | 2-142 | 62,914 | 62,915 | 62,916 | 62,917 | 62,918 | 62,919 | 62,920 | 62,921 | 62,922 | 62,923 | 62,924 | 62,925 |
| | 2-143 | 62,939 | 62,940 | 62,941 | 62,942 | 62,943 | 62,944 | 62,945 | 62,946 | 62,947 | 62,948 | 62,949 | 62,950 |
| | 2-144 | 62,964 | 62,965 | 62,966 | 62,967 | 62,968 | 62,969 | 62,970 | 62,971 | 62,972 | 62,973 | 62,974 | 62,975 |
| | 2-145 | 62,989 | 62,990 | 62,991 | 62,992 | 62,993 | 62,994 | 62,995 | 62,996 | 62,997 | 62,998 | 62,999 | 63,000 |
| | 2-146 | 63,014 | 63,015 | 63,016 | 63,017 | 63,018 | 63,019 | 63,020 | 63,021 | 63,022 | 63,023 | 63,024 | 63,025 |
| | 2-147 | 63,039 | 63,040 | 63,041 | 63,042 | 63,043 | 63,044 | 63,045 | 63,046 | 63,047 | 63,048 | 63,049 | 63,050 |
| | 2-148 | 63,064 | 63,065 | 63,066 | 63,067 | 63,068 | 63,069 | 63,070 | 63,071 | 63,072 | 63,073 | 63,074 | 63,075 |
| | 2-149 | 63,089 | 63,090 | 63,091 | 63,092 | 63,093 | 63,094 | 63,095 | 63,096 | 63,097 | 63,098 | 63,099 | 63,100 |
| | 2-150 | 63,114 | 63,115 | 63,116 | 63,117 | 63,118 | 63,119 | 63,120 | 63,121 | 63,122 | 63,123 | 63,124 | 63,125 |
| | 2-151 | 63,139 | 63,140 | 63,141 | 63,142 | 63,143 | 63,144 | 63,145 | 63,146 | 63,147 | 63,148 | 63,149 | 63,150 |
| | 2-152 | 63,164 | 63,165 | 63,166 | 63,167 | 63,168 | 63,169 | 63,170 | 63,171 | 63,172 | 63,173 | 63,174 | 63,175 |
| | 2-153 | 63,189 | 63,190 | 63,191 | 63,192 | 63,193 | 63,194 | 63,195 | 63,196 | 63,197 | 63,198 | 63,199 | 63,200 |
| | 2-154 | 63,214 | 63,215 | 63,216 | 63,217 | 63,218 | 63,219 | 63,220 | 63,221 | 63,222 | 63,223 | 63,224 | 63,225 |
| | 2-155 | 63,239 | 63,240 | 63,241 | 63,242 | 63,243 | 63,244 | 63,245 | 63,246 | 63,247 | 63,248 | 63,249 | 63,250 |
| | 2-156 | 63,264 | 63,265 | 63,266 | 63,267 | 63,268 | 63,269 | 63,270 | 63,271 | 63,272 | 63,273 | 63,274 | 63,275 |
| | 2-157 | 63,289 | 63,290 | 63,291 | 63,292 | 63,293 | 63,294 | 63,295 | 63,296 | 63,297 | 63,298 | 63,299 | 63,300 |
| | 2-158 | 63,314 | 63,315 | 63,316 | 63,317 | 63,318 | 63,319 | 63,320 | 63,321 | 63,322 | 63,323 | 63,324 | 63,325 |
| | 2-159 | 63,339 | 63,340 | 63,341 | 63,342 | 63,343 | 63,344 | 63,345 | 63,346 | 63,347 | 63,348 | 63,349 | 63,350 |
| | 2-160 | 63,364 | 63,365 | 63,366 | 63,367 | 63,368 | 63,369 | 63,370 | 63,371 | 63,372 | 63,373 | 63,374 | 63,375 |
| | 2-161 | 63,389 | 63,390 | 63,391 | 63,392 | 63,393 | 63,394 | 63,395 | 63,396 | 63,397 | 63,398 | 63,399 | 63,400 |
| | 2-162 | 63,414 | 63,415 | 63,416 | 63,417 | 63,418 | 63,419 | 63,420 | 63,421 | 63,422 | 63,423 | 63,424 | 63,425 |
| | 2-163 | 63,439 | 63,440 | 63,441 | 63,442 | 63,443 | 63,444 | 63,445 | 63,446 | 63,447 | 63,448 | 63,449 | 63,450 |
| | 2-164 | 63,464 | 63,465 | 63,466 | 63,467 | 63,468 | 63,469 | 63,470 | 63,471 | 63,472 | 63,473 | 63,474 | 63,475 |
| | 2-165 | 63,489 | 63,490 | 63,491 | 63,492 | 63,493 | 63,494 | 63,495 | 63,496 | 63,497 | 63,498 | 63,499 | 63,500 |

TABLE 49

| | | Compound represented by the formula (1) | | | | | | | | | | | | |
|---|---|---|---|---|---|---|---|---|---|---|---|---|---|---|
| | | 1-126 | 1-127 | 1-128 | 1-129 | 1-130 | 1-131 | 1-132 | 1-133 | 1-134 | 1-135 | 1-136 | 1-137 | 1-138 |
| Compound represented by the formula (2) | 2-166 | 63,501 | 63,502 | 63,503 | 63,504 | 63,505 | 63,506 | 63,507 | 63,508 | 63,509 | 63,510 | 63,511 | 63,512 | 63,513 |
| | 2-167 | 63,526 | 63,527 | 63,528 | 63,529 | 63,530 | 63,531 | 63,532 | 63,533 | 63,534 | 63,535 | 63,536 | 63,537 | 63,538 |
| | 2-168 | 63,551 | 63,552 | 63,553 | 63,554 | 63,555 | 63,556 | 63,557 | 63,558 | 63,559 | 63,560 | 63,561 | 63,562 | 63,563 |
| | 2-169 | 63,576 | 63,577 | 63,578 | 63,579 | 63,580 | 63,581 | 63,582 | 63,583 | 63,584 | 63,585 | 63,586 | 63,587 | 63,588 |
| | 2-170 | 63,601 | 63,602 | 63,603 | 63,604 | 63,605 | 63,606 | 63,607 | 63,608 | 63,609 | 63,610 | 63,611 | 63,612 | 63,613 |
| | 2-171 | 63,626 | 63,627 | 63,628 | 63,629 | 63,630 | 63,631 | 63,632 | 63,633 | 63,634 | 63,635 | 63,636 | 63,637 | 63,638 |
| | 2-172 | 63,651 | 63,652 | 63,653 | 63,654 | 63,655 | 63,656 | 63,657 | 63,658 | 63,659 | 63,660 | 63,661 | 63,662 | 63,663 |
| | 2-173 | 63,676 | 63,677 | 63,678 | 63,679 | 63,680 | 63,681 | 63,682 | 63,683 | 63,684 | 63,685 | 63,686 | 63,687 | 63,688 |
| | 2-174 | 63,701 | 63,702 | 63,703 | 63,704 | 63,705 | 63,706 | 63,707 | 63,708 | 63,709 | 63,710 | 63,711 | 63,712 | 63,713 |
| | 2-175 | 63,726 | 63,727 | 63,728 | 63,729 | 63,730 | 63,731 | 63,732 | 63,733 | 63,734 | 63,735 | 63,736 | 63,737 | 63,738 |
| | 2-176 | 63,751 | 63,752 | 63,753 | 63,754 | 63,755 | 63,756 | 63,757 | 63,758 | 63,759 | 63,760 | 63,761 | 63,762 | 63,763 |
| | 2-177 | 63,776 | 63,777 | 63,778 | 63,779 | 63,780 | 63,781 | 63,782 | 63,783 | 63,784 | 63,785 | 63,786 | 63,787 | 63,788 |
| | 2-178 | 63,801 | 63,802 | 63,803 | 63,804 | 63,805 | 63,806 | 63,807 | 63,808 | 63,809 | 63,810 | 63,811 | 63,812 | 63,813 |
| | 2-179 | 63,826 | 63,827 | 63,828 | 63,829 | 63,830 | 63,831 | 63,832 | 63,833 | 63,834 | 63,835 | 63,836 | 63,837 | 63,838 |
| | 2-180 | 63,851 | 63,852 | 63,853 | 63,854 | 63,855 | 63,856 | 63,857 | 63,858 | 63,859 | 63,860 | 63,861 | 63,862 | 63,863 |
| | 2-181 | 63,876 | 63,877 | 63,878 | 63,879 | 63,880 | 63,881 | 63,882 | 63,883 | 63,884 | 63,885 | 63,886 | 63,887 | 63,888 |
| | 2-182 | 63,901 | 63,902 | 63,903 | 63,904 | 63,905 | 63,906 | 63,907 | 63,908 | 63,909 | 63,910 | 63,911 | 63,912 | 63,913 |
| | 2-183 | 63,926 | 63,927 | 63,928 | 63,929 | 63,930 | 63,931 | 63,932 | 63,933 | 63,934 | 63,935 | 63,936 | 63,937 | 63,938 |
| | 2-184 | 63,951 | 63,952 | 63,953 | 63,954 | 63,955 | 63,956 | 63,957 | 63,958 | 63,959 | 63,960 | 63,961 | 63,962 | 63,963 |
| | 2-185 | 63,976 | 63,977 | 63,978 | 63,979 | 63,980 | 63,981 | 63,982 | 63,983 | 63,984 | 63,985 | 63,986 | 63,987 | 63,988 |
| | 2-186 | 64,001 | 64,002 | 64,003 | 64,004 | 64,005 | 64,006 | 64,007 | 64,008 | 64,009 | 64,010 | 64,011 | 64,012 | 64,013 |
| | 2-187 | 64,026 | 64,027 | 64,028 | 64,029 | 64,030 | 64,031 | 64,032 | 64,033 | 64,034 | 64,035 | 64,036 | 64,037 | 64,038 |
| | 2-188 | 64,051 | 64,052 | 64,053 | 64,054 | 64,055 | 64,056 | 64,057 | 64,058 | 64,059 | 64,060 | 64,061 | 64,062 | 64,063 |
| | 2-189 | 64,076 | 64,077 | 64,078 | 64,079 | 64,080 | 64,081 | 64,082 | 64,083 | 64,084 | 64,085 | 64,086 | 64,087 | 64,088 |
| | 2-190 | 64,101 | 64,102 | 64,103 | 64,104 | 64,105 | 64,106 | 64,107 | 64,108 | 64,109 | 64,110 | 64,111 | 64,112 | 64,113 |
| | 2-191 | 64,126 | 64,127 | 64,128 | 64,129 | 64,130 | 64,131 | 64,132 | 64,133 | 64,134 | 64,135 | 64,136 | 64,137 | 64,138 |
| | 2-192 | 64,151 | 64,152 | 64,153 | 64,154 | 64,155 | 64,156 | 64,157 | 64,158 | 64,159 | 64,160 | 64,161 | 64,162 | 64,163 |
| | 2-193 | 64,176 | 64,177 | 64,178 | 64,179 | 64,180 | 64,181 | 64,182 | 64,183 | 64,184 | 64,185 | 64,186 | 64,187 | 64,188 |
| | 2-194 | 64,201 | 64,202 | 64,203 | 64,204 | 64,205 | 64,206 | 64,207 | 64,208 | 64,209 | 64,210 | 64,211 | 64,212 | 64,213 |
| | 2-195 | 64,226 | 64,227 | 64,228 | 64,229 | 64,230 | 64,231 | 64,232 | 64,233 | 64,234 | 64,235 | 64,236 | 64,237 | 64,238 |
| | 2-196 | 64,251 | 64,252 | 64,253 | 64,254 | 64,255 | 64,256 | 64,257 | 64,258 | 64,259 | 64,260 | 64,261 | 64,262 | 64,263 |

TABLE 49-continued

| | | | | | | | | | | | | | | |
|---|---|---|---|---|---|---|---|---|---|---|---|---|---|---|
| | 2-197 | 64,276 | 64,277 | 64,278 | 64,279 | 64,280 | 64,281 | 64,282 | 64,283 | 64,284 | 64,285 | 64,286 | 64,287 | 64,288 |
| | 2-198 | 64,301 | 64,302 | 64,303 | 64,304 | 64,305 | 64,306 | 64,307 | 64,308 | 64,309 | 64,310 | 64,311 | 64,312 | 64,313 |
| | 2-199 | 64,326 | 64,327 | 64,328 | 64,329 | 64,330 | 64,331 | 64,332 | 64,333 | 64,334 | 64,335 | 64,336 | 64,337 | 64,338 |
| | 2-200 | 64,351 | 64,352 | 64,353 | 64,354 | 64,355 | 64,356 | 64,357 | 64,358 | 64,359 | 64,360 | 64,361 | 64,362 | 64,363 |
| | 2-201 | 64,376 | 64,377 | 64,378 | 64,379 | 64,380 | 64,381 | 64,382 | 64,383 | 64,384 | 64,385 | 64,386 | 64,387 | 64,388 |
| | 2-202 | 64,401 | 64,402 | 64,403 | 64,404 | 64,405 | 64,406 | 64,407 | 64,408 | 64,409 | 64,410 | 64,411 | 64,412 | 64,413 |
| | 2-203 | 64,426 | 64,427 | 64,428 | 64,429 | 64,430 | 64,431 | 64,432 | 64,433 | 64,434 | 64,435 | 64,436 | 64,437 | 64,438 |
| | 2-204 | 64,451 | 64,452 | 64,453 | 64,454 | 64,455 | 64,456 | 64,457 | 64,458 | 64,459 | 64,460 | 64,461 | 64,462 | 64,463 |
| | 2-205 | 64,476 | 64,477 | 64,478 | 64,479 | 64,480 | 64,481 | 64,482 | 64,483 | 64,484 | 64,485 | 64,486 | 64,487 | 64,488 |
| | 2-206 | 64,501 | 64,502 | 64,503 | 64,504 | 64,505 | 64,506 | 64,507 | 64,508 | 64,509 | 64,510 | 64,511 | 64,512 | 64,513 |
| | 2-207 | 64,526 | 64,527 | 64,528 | 64,529 | 64,530 | 64,531 | 64,532 | 64,533 | 64,534 | 64,535 | 64,536 | 64,537 | 64,538 |
| | 2-208 | 64,551 | 64,552 | 64,553 | 64,554 | 64,555 | 64,556 | 64,557 | 64,558 | 64,559 | 64,560 | 64,561 | 64,562 | 64,563 |
| | 2-209 | 64,576 | 64,577 | 64,578 | 64,579 | 64,580 | 64,581 | 64,582 | 64,583 | 64,584 | 64,585 | 64,586 | 64,587 | 64,588 |
| | 2-210 | 64,601 | 64,602 | 64,603 | 64,604 | 64,605 | 64,606 | 64,607 | 64,608 | 64,609 | 64,610 | 64,611 | 64,612 | 64,613 |
| | 2-211 | 64,626 | 64,627 | 64,628 | 64,629 | 64,630 | 64,631 | 64,632 | 64,633 | 64,634 | 64,635 | 64,636 | 64,637 | 64,638 |
| | 2-212 | 64,651 | 64,652 | 64,653 | 64,654 | 64,655 | 64,656 | 64,657 | 64,658 | 64,659 | 64,660 | 64,661 | 64,662 | 64,663 |
| | 2-213 | 64,676 | 64,677 | 64,678 | 64,679 | 64,680 | 64,681 | 64,682 | 64,683 | 64,684 | 64,685 | 64,686 | 64,687 | 64,688 |
| | 2-214 | 64,701 | 64,702 | 64,703 | 64,704 | 64,705 | 64,706 | 64,707 | 64,708 | 64,709 | 64,710 | 64,711 | 64,712 | 64,713 |
| | 2-215 | 64,726 | 64,727 | 64,728 | 64,729 | 64,730 | 64,731 | 64,732 | 64,733 | 64,734 | 64,735 | 64,736 | 64,737 | 64,738 |
| | 2-216 | 64,751 | 64,752 | 64,753 | 64,754 | 64,755 | 64,756 | 64,757 | 64,758 | 64,759 | 64,760 | 64,761 | 64,762 | 64,763 |
| | 2-217 | 64,776 | 64,777 | 64,778 | 64,779 | 64,780 | 64,781 | 64,782 | 64,783 | 64,784 | 64,785 | 64,786 | 64,787 | 64,788 |
| | 2-218 | 64,801 | 64,802 | 64,803 | 64,804 | 64,805 | 64,806 | 64,807 | 64,808 | 64,809 | 64,810 | 64,811 | 64,812 | 64,813 |
| | 2-219 | 64,826 | 64,827 | 64,828 | 64,829 | 64,830 | 64,831 | 64,832 | 64,833 | 64,834 | 64,835 | 64,836 | 64,837 | 64,838 |
| | 2-220 | 64,851 | 64,852 | 64,853 | 64,854 | 64,855 | 64,856 | 64,857 | 64,858 | 64,859 | 64,860 | 64,861 | 64,862 | 64,863 |

| | | Compound represented by the formula (1) | | | | | | | | | | | |
|---|---|---|---|---|---|---|---|---|---|---|---|---|---|
| | | 1-139 | 1-140 | 1-141 | 1-142 | 1-143 | 1-144 | 1-145 | 1-146 | 1-147 | 1-148 | 1-149 | 1-150 |
| Compound represented by the formula (2) | 2-166 | 63,514 | 63,515 | 63,516 | 63,517 | 63,518 | 63,519 | 63,520 | 63,521 | 63,522 | 63,523 | 63,524 | 63,525 |
| | 2-167 | 63,539 | 63,540 | 63,541 | 63,542 | 63,543 | 63,544 | 63,545 | 63,546 | 63,547 | 63,548 | 63,549 | 63,550 |
| | 2-168 | 63,564 | 63,565 | 63,566 | 63,567 | 63,568 | 63,569 | 63,570 | 63,571 | 63,572 | 63,573 | 63,574 | 63,575 |
| | 2-169 | 63,589 | 63,590 | 63,591 | 63,592 | 63,593 | 63,594 | 63,595 | 63,596 | 63,597 | 63,598 | 63,599 | 63,600 |
| | 2-170 | 63,614 | 63,615 | 63,616 | 63,617 | 63,618 | 63,619 | 63,620 | 63,621 | 63,622 | 63,623 | 63,624 | 63,625 |
| | 2-171 | 63,639 | 63,640 | 63,641 | 63,642 | 63,643 | 63,644 | 63,645 | 63,646 | 63,647 | 63,648 | 63,649 | 63,650 |
| | 2-172 | 63,664 | 63,665 | 63,666 | 63,667 | 63,668 | 63,669 | 63,670 | 63,671 | 63,672 | 63,673 | 63,674 | 63,675 |
| | 2-173 | 63,689 | 63,690 | 63,691 | 63,692 | 63,693 | 63,694 | 63,695 | 63,696 | 63,697 | 63,698 | 63,699 | 63,700 |
| | 2-174 | 63,714 | 63,715 | 63,716 | 63,717 | 63,718 | 63,719 | 63,720 | 63,721 | 63,722 | 63,723 | 63,724 | 63,725 |
| | 2-175 | 63,739 | 63,740 | 63,741 | 63,742 | 63,743 | 63,744 | 63,745 | 63,746 | 63,747 | 63,748 | 63,749 | 63,750 |
| | 2-176 | 63,764 | 63,765 | 63,766 | 63,767 | 63,768 | 63,769 | 63,770 | 63,771 | 63,772 | 63,773 | 63,774 | 63,775 |
| | 2-177 | 63,789 | 63,790 | 63,791 | 63,792 | 63,793 | 63,794 | 63,795 | 63,796 | 63,797 | 63,798 | 63,799 | 63,800 |
| | 2-178 | 63,814 | 63,815 | 63,816 | 63,817 | 63,818 | 63,819 | 63,820 | 63,821 | 63,822 | 63,823 | 63,824 | 63,825 |
| | 2-179 | 63,839 | 63,840 | 63,841 | 63,842 | 63,843 | 63,844 | 63,845 | 63,846 | 63,847 | 63,848 | 63,849 | 63,850 |
| | 2-180 | 63,864 | 63,865 | 63,866 | 63,867 | 63,868 | 63,869 | 63,870 | 63,871 | 63,872 | 63,873 | 63,874 | 63,875 |
| | 2-181 | 63,889 | 63,890 | 63,891 | 63,892 | 63,893 | 63,894 | 63,895 | 63,896 | 63,897 | 63,898 | 63,899 | 63,900 |
| | 2-182 | 63,914 | 63,915 | 63,916 | 63,917 | 63,918 | 63,919 | 63,920 | 63,921 | 63,922 | 63,923 | 63,924 | 63,925 |
| | 2-183 | 63,939 | 63,940 | 63,941 | 63,942 | 63,943 | 63,944 | 63,945 | 63,946 | 63,947 | 63,948 | 63,949 | 63,950 |
| | 2-184 | 63,964 | 63,965 | 63,966 | 63,967 | 63,968 | 63,969 | 63,970 | 63,971 | 63,972 | 63,973 | 63,974 | 63,975 |
| | 2-185 | 63,989 | 63,990 | 63,991 | 63,992 | 63,993 | 63,994 | 63,995 | 63,996 | 63,997 | 63,998 | 63,999 | 64,000 |
| | 2-186 | 64,014 | 64,015 | 64,016 | 64,017 | 64,018 | 64,019 | 64,020 | 64,021 | 64,022 | 64,023 | 64,024 | 64,025 |
| | 2-187 | 64,039 | 64,040 | 64,041 | 64,042 | 64,043 | 64,044 | 64,045 | 64,046 | 64,047 | 64,048 | 64,049 | 64,050 |
| | 2-188 | 64,064 | 64,065 | 64,066 | 64,067 | 64,068 | 64,069 | 64,070 | 64,071 | 64,072 | 64,073 | 64,074 | 64,075 |
| | 2-189 | 64,089 | 64,090 | 64,091 | 64,092 | 64,093 | 64,094 | 64,095 | 64,096 | 64,097 | 64,098 | 64,099 | 64,100 |
| | 2-190 | 64,114 | 64,115 | 64,116 | 64,117 | 64,118 | 64,119 | 64,120 | 64,121 | 64,122 | 64,123 | 64,124 | 64,125 |
| | 2-191 | 64,139 | 64,140 | 64,141 | 64,142 | 64,143 | 64,144 | 64,145 | 64,146 | 64,147 | 64,148 | 64,149 | 64,150 |
| | 2-192 | 64,164 | 64,165 | 64,166 | 64,167 | 64,168 | 64,169 | 64,170 | 64,171 | 64,172 | 64,173 | 64,174 | 64,175 |
| | 2-193 | 64,189 | 64,190 | 64,191 | 64,192 | 64,193 | 64,194 | 64,195 | 64,196 | 64,197 | 64,198 | 64,199 | 64,200 |
| | 2-194 | 64,214 | 64,215 | 64,216 | 64,217 | 64,218 | 64,219 | 64,220 | 64,221 | 64,222 | 64,223 | 64,224 | 64,225 |
| | 2-195 | 64,239 | 64,240 | 64,241 | 64,242 | 64,243 | 64,244 | 64,245 | 64,246 | 64,247 | 64,248 | 64,249 | 64,250 |
| | 2-196 | 64,264 | 64,265 | 64,266 | 64,267 | 64,268 | 64,269 | 64,270 | 64,271 | 64,272 | 64,273 | 64,274 | 64,275 |
| | 2-197 | 64,289 | 64,290 | 64,291 | 64,292 | 64,293 | 64,294 | 64,295 | 64,296 | 64,297 | 64,298 | 64,299 | 64,300 |
| | 2-198 | 64,314 | 64,315 | 64,316 | 64,317 | 64,318 | 64,319 | 64,320 | 64,321 | 64,322 | 64,323 | 64,324 | 64,325 |
| | 2-199 | 64,339 | 64,340 | 64,341 | 64,342 | 64,343 | 64,344 | 64,345 | 64,346 | 64,347 | 64,348 | 64,349 | 64,350 |
| | 2-200 | 64,364 | 64,365 | 64,366 | 64,367 | 64,368 | 64,369 | 64,370 | 64,371 | 64,372 | 64,373 | 64,374 | 64,375 |
| | 2-201 | 64,389 | 64,390 | 64,391 | 64,392 | 64,393 | 64,394 | 64,395 | 64,396 | 64,397 | 64,398 | 64,399 | 64,400 |
| | 2-202 | 64,414 | 64,415 | 64,416 | 64,417 | 64,418 | 64,419 | 64,420 | 64,421 | 64,422 | 64,423 | 64,424 | 64,425 |
| | 2-203 | 64,439 | 64,440 | 64,441 | 64,442 | 64,443 | 64,444 | 64,445 | 64,446 | 64,447 | 64,448 | 64,449 | 64,450 |
| | 2-204 | 64,464 | 64,465 | 64,466 | 64,467 | 64,468 | 64,469 | 64,470 | 64,471 | 64,472 | 64,473 | 64,474 | 64,475 |
| | 2-205 | 64,489 | 64,490 | 64,491 | 64,492 | 64,493 | 64,494 | 64,495 | 64,496 | 64,497 | 64,498 | 64,499 | 64,500 |
| | 2-206 | 64,514 | 64,515 | 64,516 | 64,517 | 64,518 | 64,519 | 64,520 | 64,521 | 64,522 | 64,523 | 64,524 | 64,525 |
| | 2-207 | 64,539 | 64,540 | 64,541 | 64,542 | 64,543 | 64,544 | 64,545 | 64,546 | 64,547 | 64,548 | 64,549 | 64,550 |
| | 2-208 | 64,564 | 64,565 | 64,566 | 64,567 | 64,568 | 64,569 | 64,570 | 64,571 | 64,572 | 64,573 | 64,574 | 64,575 |
| | 2-209 | 64,589 | 64,590 | 64,591 | 64,592 | 64,593 | 64,594 | 64,595 | 64,596 | 64,597 | 64,598 | 64,599 | 64,600 |
| | 2-210 | 64,614 | 64,615 | 64,616 | 64,617 | 64,618 | 64,619 | 64,620 | 64,621 | 64,622 | 64,623 | 64,624 | 64,625 |
| | 2-211 | 64,639 | 64,640 | 64,641 | 64,642 | 64,643 | 64,644 | 64,645 | 64,646 | 64,647 | 64,648 | 64,649 | 64,650 |
| | 2-212 | 64,664 | 64,665 | 64,666 | 64,667 | 64,668 | 64,669 | 64,670 | 64,671 | 64,672 | 64,673 | 64,674 | 64,675 |
| | 2-213 | 64,689 | 64,690 | 64,691 | 64,692 | 64,693 | 64,694 | 64,695 | 64,696 | 64,697 | 64,698 | 64,699 | 64,700 |
| | 2-214 | 64,714 | 64,715 | 64,716 | 64,717 | 64,718 | 64,719 | 64,720 | 64,721 | 64,722 | 64,723 | 64,724 | 64,725 |
| | 2-215 | 64,739 | 64,740 | 64,741 | 64,742 | 64,743 | 64,744 | 64,745 | 64,746 | 64,747 | 64,748 | 64,749 | 64,750 |
| | 2-216 | 64,764 | 64,765 | 64,766 | 64,767 | 64,768 | 64,769 | 64,770 | 64,771 | 64,772 | 64,773 | 64,774 | 64,775 |

TABLE 49-continued

| | | | | | | | | | | | | | |
|---|---|---|---|---|---|---|---|---|---|---|---|---|---|
| | 2-217 | 64,789 | 64,790 | 64,791 | 64,792 | 64,793 | 64,794 | 64,795 | 64,796 | 64,797 | 64,798 | 64,799 | 64,800 |
| | 2-218 | 64,814 | 64,815 | 64,816 | 64,817 | 64,818 | 64,819 | 64,820 | 64,821 | 64,822 | 64,823 | 64,824 | 64,825 |
| | 2-219 | 64,839 | 64,840 | 64,841 | 64,842 | 64,843 | 64,844 | 64,845 | 64,846 | 64,847 | 64,848 | 64,849 | 64,850 |
| | 2-220 | 64,864 | 64,865 | 64,866 | 64,867 | 64,868 | 64,869 | 64,870 | 64,871 | 64,872 | 64,873 | 64,874 | 64,875 |

TABLE 50

| | | Compound represented by the formula (1) | | | | | | | | | | | | |
|---|---|---|---|---|---|---|---|---|---|---|---|---|---|---|
| | | 1-126 | 1-127 | 1-128 | 1-129 | 1-130 | 1-131 | 1-132 | 1-133 | 1-134 | 1-135 | 1-136 | 1-137 | 1-138 |
| Compound represented by the formula (2) | 2-221 | 64,876 | 64,877 | 64,878 | 64,879 | 64,880 | 64,881 | 64,882 | 64,883 | 64,884 | 64,885 | 64,886 | 64,887 | 64,888 |
| | 2-222 | 64,901 | 64,902 | 64,903 | 64,904 | 64,905 | 64,906 | 64,907 | 64,908 | 64,909 | 64,910 | 64,911 | 64,912 | 64,913 |
| | 2-223 | 64,926 | 64,927 | 64,928 | 64,929 | 64,930 | 64,931 | 64,932 | 64,933 | 64,934 | 64,935 | 64,936 | 64,937 | 64,938 |
| | 2-224 | 64,951 | 64,952 | 64,953 | 64,954 | 64,955 | 64,956 | 64,957 | 64,958 | 64,959 | 64,960 | 64,961 | 64,962 | 64,963 |
| | 2-225 | 64,976 | 64,977 | 64,978 | 64,979 | 64,980 | 64,981 | 64,982 | 64,983 | 64,984 | 64,985 | 64,986 | 64,987 | 64,988 |
| | 2-226 | 65,001 | 65,002 | 65,003 | 65,004 | 65,005 | 65,006 | 65,007 | 65,008 | 65,009 | 65,010 | 65,011 | 65,012 | 65,013 |
| | 2-227 | 65,026 | 65,027 | 65,028 | 65,029 | 65,030 | 65,031 | 65,032 | 65,033 | 65,034 | 65,035 | 65,036 | 65,037 | 65,038 |
| | 2-228 | 65,051 | 65,052 | 65,053 | 65,054 | 65,055 | 65,056 | 65,057 | 65,058 | 65,059 | 65,060 | 65,061 | 65,062 | 65,063 |
| | 2-229 | 65,076 | 65,077 | 65,078 | 65,079 | 65,080 | 65,081 | 65,082 | 65,083 | 65,084 | 65,085 | 65,086 | 65,087 | 65,088 |
| | 2-230 | 65,101 | 65,102 | 65,103 | 65,104 | 65,105 | 65,106 | 65,107 | 65,108 | 65,109 | 65,110 | 65,111 | 65,112 | 65,113 |
| | 2-231 | 65,126 | 65,127 | 65,128 | 65,129 | 65,130 | 65,131 | 65,132 | 65,133 | 65,134 | 65,135 | 65,136 | 65,137 | 65,138 |
| | 2-232 | 65,151 | 65,152 | 65,153 | 65,154 | 65,155 | 65,156 | 65,157 | 65,158 | 65,159 | 65,160 | 65,161 | 65,162 | 65,163 |
| | 2-233 | 65,176 | 65,177 | 65,178 | 65,179 | 65,180 | 65,181 | 65,182 | 65,183 | 65,184 | 65,185 | 65,186 | 65,187 | 65,188 |
| | 2-234 | 65,201 | 65,202 | 65,203 | 65,204 | 65,205 | 65,206 | 65,207 | 65,208 | 65,209 | 65,210 | 65,211 | 65,212 | 65,213 |
| | 2-235 | 65,226 | 65,227 | 65,228 | 65,229 | 65,230 | 65,231 | 65,232 | 65,233 | 65,234 | 65,235 | 65,236 | 65,237 | 65,238 |
| | 2-236 | 65,251 | 65,252 | 65,253 | 65,254 | 65,255 | 65,256 | 65,257 | 65,258 | 65,259 | 65,260 | 65,261 | 65,262 | 65,263 |
| | 2-237 | 65,276 | 65,277 | 65,278 | 65,279 | 65,280 | 65,281 | 65,282 | 65,283 | 65,284 | 65,285 | 65,286 | 65,287 | 65,288 |
| | 2-238 | 65,301 | 65,302 | 65,303 | 65,304 | 65,305 | 65,306 | 65,307 | 65,308 | 65,309 | 65,310 | 65,311 | 65,312 | 65,313 |
| | 2-239 | 65,326 | 65,327 | 65,328 | 65,329 | 65,330 | 65,331 | 65,332 | 65,333 | 65,334 | 65,335 | 65,336 | 65,337 | 65,338 |
| | 2-240 | 65,351 | 65,352 | 65,353 | 65,354 | 65,355 | 65,356 | 65,357 | 65,358 | 65,359 | 65,360 | 65,361 | 65,362 | 65,363 |
| | 2-241 | 65,376 | 65,377 | 65,378 | 65,379 | 65,380 | 65,381 | 65,382 | 65,383 | 65,384 | 65,385 | 65,386 | 65,387 | 65,388 |
| | 2-242 | 65,401 | 65,402 | 65,403 | 65,404 | 65,405 | 65,406 | 65,407 | 65,408 | 65,409 | 65,410 | 65,411 | 65,412 | 65,413 |
| | 2-243 | 65,426 | 65,427 | 65,428 | 65,429 | 65,430 | 65,431 | 65,432 | 65,433 | 65,434 | 65,435 | 65,436 | 65,437 | 65,438 |
| | 2-244 | 65,451 | 65,452 | 65,453 | 65,454 | 65,455 | 65,456 | 65,457 | 65,458 | 65,459 | 65,460 | 65,461 | 65,462 | 65,463 |
| | 2-245 | 65,476 | 65,477 | 65,478 | 65,479 | 65,480 | 65,481 | 65,482 | 65,483 | 65,484 | 65,485 | 65,486 | 65,487 | 65,488 |
| | 2-246 | 65,501 | 65,502 | 65,503 | 65,504 | 65,505 | 65,506 | 65,507 | 65,508 | 65,509 | 65,510 | 65,511 | 65,512 | 65,513 |
| | 2-247 | 65,526 | 65,527 | 65,528 | 65,529 | 65,530 | 65,531 | 65,532 | 65,533 | 65,534 | 65,535 | 65,536 | 65,537 | 65,538 |
| | 2-248 | 65,551 | 65,552 | 65,553 | 65,554 | 65,555 | 65,556 | 65,557 | 65,558 | 65,559 | 65,560 | 65,561 | 65,562 | 65,563 |
| | 2-249 | 65,576 | 65,577 | 65,578 | 65,579 | 65,580 | 65,581 | 65,582 | 65,583 | 65,584 | 65,585 | 65,586 | 65,587 | 65,588 |
| | 2-250 | 65,601 | 65,602 | 65,603 | 65,604 | 65,605 | 65,606 | 65,607 | 65,608 | 65,609 | 65,610 | 65,611 | 65,612 | 65,613 |
| | 2-251 | 65,626 | 65,627 | 65,628 | 65,629 | 65,630 | 65,631 | 65,632 | 65,633 | 65,634 | 65,635 | 65,636 | 65,637 | 65,638 |
| | 2-252 | 65,651 | 65,652 | 65,653 | 65,654 | 65,655 | 65,656 | 65,657 | 65,658 | 65,659 | 65,660 | 65,661 | 65,662 | 65,663 |
| | 2-253 | 65,676 | 65,677 | 65,678 | 65,679 | 65,680 | 65,681 | 65,682 | 65,683 | 65,684 | 65,685 | 65,686 | 65,687 | 65,688 |
| | 2-254 | 65,701 | 65,702 | 65,703 | 65,704 | 65,705 | 65,706 | 65,707 | 65,708 | 65,709 | 65,710 | 65,711 | 65,712 | 65,713 |
| | 2-255 | 65,726 | 65,727 | 65,728 | 65,729 | 65,730 | 65,731 | 65,732 | 65,733 | 65,734 | 65,735 | 65,736 | 65,737 | 65,738 |
| | 2-256 | 65,751 | 65,752 | 65,753 | 65,754 | 65,755 | 65,756 | 65,757 | 65,758 | 65,759 | 65,760 | 65,761 | 65,762 | 65,763 |
| | 2-257 | 65,776 | 65,777 | 65,778 | 65,779 | 65,780 | 65,781 | 65,782 | 65,783 | 65,784 | 65,785 | 65,786 | 65,787 | 65,788 |
| | 2-258 | 65,801 | 65,802 | 65,803 | 65,804 | 65,805 | 65,806 | 65,807 | 65,808 | 65,809 | 65,810 | 65,811 | 65,812 | 65,813 |
| | 2-259 | 65,826 | 65,827 | 65,828 | 65,829 | 65,830 | 65,831 | 65,832 | 65,833 | 65,834 | 65,835 | 65,836 | 65,837 | 65,838 |
| | 2-260 | 65,851 | 65,852 | 65,853 | 65,854 | 65,855 | 65,856 | 65,857 | 65,858 | 65,859 | 65,860 | 65,861 | 65,862 | 65,863 |
| | 2-261 | 65,876 | 65,877 | 65,878 | 65,879 | 65,880 | 65,881 | 65,882 | 65,883 | 65,884 | 65,885 | 65,886 | 65,887 | 65,888 |
| | 2-262 | 65,901 | 65,902 | 65,903 | 65,904 | 65,905 | 65,906 | 65,907 | 65,908 | 65,909 | 65,910 | 65,911 | 65,912 | 65,913 |
| | 2-263 | 65,926 | 65,927 | 65,928 | 65,929 | 65,930 | 65,931 | 65,932 | 65,933 | 65,934 | 65,935 | 65,936 | 65,937 | 65,938 |
| | 2-264 | 65,951 | 65,952 | 65,953 | 65,954 | 65,955 | 65,956 | 65,957 | 65,958 | 65,959 | 65,960 | 65,961 | 65,962 | 65,963 |
| | 2-265 | 65,976 | 65,977 | 65,978 | 65,979 | 65,980 | 65,981 | 65,982 | 65,983 | 65,984 | 65,985 | 65,986 | 65,987 | 65,988 |
| | 2-266 | 66,001 | 66,002 | 66,003 | 66,004 | 66,005 | 66,006 | 66,007 | 66,008 | 66,009 | 66,010 | 66,011 | 66,012 | 66,013 |
| | 2-267 | 66,026 | 66,027 | 66,028 | 66,029 | 66,030 | 66,031 | 66,032 | 66,033 | 66,034 | 66,035 | 66,036 | 66,037 | 66,038 |
| | 2-268 | 66,051 | 66,052 | 66,053 | 66,054 | 66,055 | 66,056 | 66,057 | 66,058 | 66,059 | 66,060 | 66,061 | 66,062 | 66,063 |
| | 2-269 | 66,076 | 66,077 | 66,078 | 66,079 | 66,080 | 66,081 | 66,082 | 66,083 | 66,084 | 66,085 | 66,086 | 66,087 | 66,088 |
| | 2-270 | 66,101 | 66,102 | 66,103 | 66,104 | 66,105 | 66,106 | 66,107 | 66,108 | 66,109 | 66,110 | 66,111 | 66,112 | 66,113 |
| | 2-271 | 66,126 | 66,127 | 66,128 | 66,129 | 66,130 | 66,131 | 66,132 | 66,133 | 66,134 | 66,135 | 66,136 | 66,137 | 66,138 |
| | 2-272 | 66,151 | 66,152 | 66,153 | 66,154 | 66,155 | 66,156 | 66,157 | 66,158 | 66,159 | 66,160 | 66,161 | 66,162 | 66,163 |
| | 2-273 | 66,176 | 66,177 | 66,178 | 66,179 | 66,180 | 66,181 | 66,182 | 66,183 | 66,184 | 66,185 | 66,186 | 66,187 | 66,188 |
| | 2-274 | 66,201 | 66,202 | 66,203 | 66,204 | 66,205 | 66,206 | 66,207 | 66,208 | 66,209 | 66,210 | 66,211 | 66,212 | 66,213 |
| | 2-275 | 66,226 | 66,227 | 66,228 | 66,229 | 66,230 | 66,231 | 66,232 | 66,233 | 66,234 | 66,235 | 66,236 | 66,237 | 66,238 |

| | | Compound represented by the formula (1) | | | | | | | | | | | |
|---|---|---|---|---|---|---|---|---|---|---|---|---|---|
| | | 1-139 | 1-140 | 1-141 | 1-142 | 1-143 | 1-144 | 1-145 | 1-146 | 1-147 | 1-148 | 1-149 | 1-150 |
| Compound represented by the formula (2) | 2-221 | 64,889 | 64,890 | 64,891 | 64,892 | 64,893 | 64,894 | 64,895 | 64,896 | 64,897 | 64,898 | 64,899 | 64,900 |
| | 2-222 | 64,914 | 64,915 | 64,916 | 64,917 | 64,918 | 64,919 | 64,920 | 64,921 | 64,922 | 64,923 | 64,924 | 64,925 |
| | 2-223 | 64,939 | 64,940 | 64,941 | 64,942 | 64,943 | 64,944 | 64,945 | 64,946 | 64,947 | 64,948 | 64,949 | 64,950 |
| | 2-224 | 64,964 | 64,965 | 64,966 | 64,967 | 64,968 | 64,969 | 64,970 | 64,971 | 64,972 | 64,973 | 64,974 | 64,975 |
| | 2-225 | 64,989 | 64,990 | 64,991 | 64,992 | 64,993 | 64,994 | 64,995 | 64,996 | 64,997 | 64,998 | 64,999 | 65,000 |
| | 2-226 | 65,014 | 65,015 | 65,016 | 65,017 | 65,018 | 65,019 | 65,020 | 65,021 | 65,022 | 65,023 | 65,024 | 65,025 |

TABLE 50-continued

| | | | | | | | | | | | | |
|---|---|---|---|---|---|---|---|---|---|---|---|---|---|
| 2-227 | 65,039 | 65,040 | 65,041 | 65,042 | 65,043 | 65,044 | 65,045 | 65,046 | 65,047 | 65,048 | 65,049 | 65,050 |
| 2-228 | 65,064 | 65,065 | 65,066 | 65,067 | 65,068 | 65,069 | 65,070 | 65,071 | 65,072 | 65,073 | 65,074 | 65,075 |
| 2-229 | 65,089 | 65,090 | 65,091 | 65,092 | 65,093 | 65,094 | 65,095 | 65,096 | 65,097 | 65,098 | 65,099 | 65,100 |
| 2-230 | 65,114 | 65,115 | 65,116 | 65,117 | 65,118 | 65,119 | 65,120 | 65,121 | 65,122 | 65,123 | 65,124 | 65,125 |
| 2-231 | 65,139 | 65,140 | 65,141 | 65,142 | 65,143 | 65,144 | 65,145 | 65,146 | 65,147 | 65,148 | 65,149 | 65,150 |
| 2-232 | 65,164 | 65,165 | 65,166 | 65,167 | 65,168 | 65,169 | 65,170 | 65,171 | 65,172 | 65,173 | 65,174 | 65,175 |
| 2-233 | 65,189 | 65,190 | 65,191 | 65,192 | 65,193 | 65,194 | 65,195 | 65,196 | 65,197 | 65,198 | 65,199 | 65,200 |
| 2-234 | 65,214 | 65,215 | 65,216 | 65,217 | 65,218 | 65,219 | 65,220 | 65,221 | 65,222 | 65,223 | 65,224 | 65,225 |
| 2-235 | 65,239 | 65,240 | 65,241 | 65,242 | 65,243 | 65,244 | 65,245 | 65,246 | 65,247 | 65,248 | 65,249 | 65,250 |
| 2-236 | 65,264 | 65,265 | 65,266 | 65,267 | 65,268 | 65,269 | 65,270 | 65,271 | 65,272 | 65,273 | 65,274 | 65,275 |
| 2-237 | 65,289 | 65,290 | 65,291 | 65,292 | 65,293 | 65,294 | 65,295 | 65,296 | 65,297 | 65,298 | 65,299 | 65,300 |
| 2-238 | 65,314 | 65,315 | 65,316 | 65,317 | 65,318 | 65,319 | 65,320 | 65,321 | 65,322 | 65,323 | 65,324 | 65,325 |
| 2-239 | 65,339 | 65,340 | 65,341 | 65,342 | 65,343 | 65,344 | 65,345 | 65,346 | 65,347 | 65,348 | 65,349 | 65,350 |
| 2-240 | 65,364 | 65,365 | 65,366 | 65,367 | 65,368 | 65,369 | 65,370 | 65,371 | 65,372 | 65,373 | 65,374 | 65,375 |
| 2-241 | 65,389 | 65,390 | 65,391 | 65,392 | 65,393 | 65,394 | 65,395 | 65,396 | 65,397 | 65,398 | 65,399 | 65,400 |
| 2-242 | 65,414 | 65,415 | 65,416 | 65,417 | 65,418 | 65,419 | 65,420 | 65,421 | 65,422 | 65,423 | 65,424 | 65,425 |
| 2-243 | 65,439 | 65,440 | 65,441 | 65,442 | 65,443 | 65,444 | 65,445 | 65,446 | 65,447 | 65,448 | 65,449 | 65,450 |
| 2-244 | 65,464 | 65,465 | 65,466 | 65,467 | 65,468 | 65,469 | 65,470 | 65,471 | 65,472 | 65,473 | 65,474 | 65,475 |
| 2-245 | 65,489 | 65,490 | 65,491 | 65,492 | 65,493 | 65,494 | 65,495 | 65,496 | 65,497 | 65,498 | 65,499 | 65,500 |
| 2-246 | 65,514 | 65,515 | 65,516 | 65,517 | 65,518 | 65,519 | 65,520 | 65,521 | 65,522 | 65,523 | 65,524 | 65,525 |
| 2-247 | 65,539 | 65,540 | 65,541 | 65,542 | 65,543 | 65,544 | 65,545 | 65,546 | 65,547 | 65,548 | 65,549 | 65,550 |
| 2-248 | 65,564 | 65,565 | 65,566 | 65,567 | 65,568 | 65,569 | 65,570 | 65,571 | 65,572 | 65,573 | 65,574 | 65,575 |
| 2-249 | 65,589 | 65,590 | 65,591 | 65,592 | 65,593 | 65,594 | 65,595 | 65,596 | 65,597 | 65,598 | 65,599 | 65,600 |
| 2-250 | 65,614 | 65,615 | 65,616 | 65,617 | 65,618 | 65,619 | 65,620 | 65,621 | 65,622 | 65,623 | 65,624 | 65,625 |
| 2-251 | 65,639 | 65,640 | 65,641 | 65,642 | 65,643 | 65,644 | 65,645 | 65,646 | 65,647 | 65,648 | 65,649 | 65,650 |
| 2-252 | 65,664 | 65,665 | 65,666 | 65,667 | 65,668 | 65,669 | 65,670 | 65,671 | 65,672 | 65,673 | 65,674 | 65,675 |
| 2-253 | 65,689 | 65,690 | 65,691 | 65,692 | 65,693 | 65,694 | 65,695 | 65,696 | 65,697 | 65,698 | 65,699 | 65,700 |
| 2-254 | 65,714 | 65,715 | 65,716 | 65,717 | 65,718 | 65,719 | 65,720 | 65,721 | 65,722 | 65,723 | 65,724 | 65,725 |
| 2-255 | 65,739 | 65,740 | 65,741 | 65,742 | 65,743 | 65,744 | 65,745 | 65,746 | 65,747 | 65,748 | 65,749 | 65,750 |
| 2-256 | 65,764 | 65,765 | 65,766 | 65,767 | 65,768 | 65,769 | 65,770 | 65,771 | 65,772 | 65,773 | 65,774 | 65,775 |
| 2-257 | 65,789 | 65,790 | 65,791 | 65,792 | 65,793 | 65,794 | 65,795 | 65,796 | 65,797 | 65,798 | 65,799 | 65,800 |
| 2-258 | 65,814 | 65,815 | 65,816 | 65,817 | 65,818 | 65,819 | 65,820 | 65,821 | 65,822 | 65,823 | 65,824 | 65,825 |
| 2-259 | 65,839 | 65,840 | 65,841 | 65,842 | 65,843 | 65,844 | 65,845 | 65,846 | 65,847 | 65,848 | 65,849 | 65,850 |
| 2-260 | 65,864 | 65,865 | 65,866 | 65,867 | 65,868 | 65,869 | 65,870 | 65,871 | 65,872 | 65,873 | 65,874 | 65,875 |
| 2-261 | 65,889 | 65,890 | 65,891 | 65,892 | 65,893 | 65,894 | 65,895 | 65,896 | 65,897 | 65,898 | 65,899 | 65,900 |
| 2-262 | 65,914 | 65,915 | 65,916 | 65,917 | 65,918 | 65,919 | 65,920 | 65,921 | 65,922 | 65,923 | 65,924 | 65,925 |
| 2-263 | 65,939 | 65,940 | 65,941 | 65,942 | 65,943 | 65,944 | 65,945 | 65,946 | 65,947 | 65,948 | 65,949 | 65,950 |
| 2-264 | 65,964 | 65,965 | 65,966 | 65,967 | 65,968 | 65,969 | 65,970 | 65,971 | 65,972 | 65,973 | 65,974 | 65,975 |
| 2-265 | 65,989 | 65,990 | 65,991 | 65,992 | 65,993 | 65,994 | 65,995 | 65,996 | 65,997 | 65,998 | 65,999 | 66,000 |
| 2-266 | 66,014 | 66,015 | 66,016 | 66,017 | 66,018 | 66,019 | 66,020 | 66,021 | 66,022 | 66,023 | 66,024 | 66,025 |
| 2-267 | 66,039 | 66,040 | 66,041 | 66,042 | 66,043 | 66,044 | 66,045 | 66,046 | 66,047 | 66,048 | 66,049 | 66,050 |
| 2-268 | 66,064 | 66,065 | 66,066 | 66,067 | 66,068 | 66,069 | 66,070 | 66,071 | 66,072 | 66,073 | 66,074 | 66,075 |
| 2-269 | 66,089 | 66,090 | 66,091 | 66,092 | 66,093 | 66,094 | 66,095 | 66,096 | 66,097 | 66,098 | 66,099 | 66,100 |
| 2-270 | 66,114 | 66,115 | 66,116 | 66,117 | 66,118 | 66,119 | 66,120 | 66,121 | 66,122 | 66,123 | 66,124 | 66,125 |
| 2-271 | 66,139 | 66,140 | 66,141 | 66,142 | 66,143 | 66,144 | 66,145 | 66,146 | 66,147 | 66,148 | 66,149 | 66,150 |
| 2-272 | 66,164 | 66,165 | 66,166 | 66,167 | 66,168 | 66,169 | 66,170 | 66,171 | 66,172 | 66,173 | 66,174 | 66,175 |
| 2-273 | 66,189 | 66,190 | 66,191 | 66,192 | 66,193 | 66,194 | 66,195 | 66,196 | 66,197 | 66,198 | 66,199 | 66,200 |
| 2-274 | 66,214 | 66,215 | 66,216 | 66,217 | 66,218 | 66,219 | 66,220 | 66,221 | 66,222 | 66,223 | 66,224 | 66,225 |
| 2-275 | 66,239 | 66,240 | 66,241 | 66,242 | 66,243 | 66,244 | 66,245 | 66,246 | 66,247 | 66,248 | 66,249 | 66,250 |

TABLE 51

| | | Compound represented by the formula (1) | | | | | | | | | | | | |
|---|---|---|---|---|---|---|---|---|---|---|---|---|---|---|
| | | 1-126 | 1-127 | 1-128 | 1-129 | 1-130 | 1-131 | 1-132 | 1-133 | 1-134 | 1-135 | 1-136 | 1-137 | 1-138 |
| Compound represented by the formula (2) | 2-276 | 66,251 | 66,252 | 66,253 | 66,254 | 66,255 | 66,256 | 66,257 | 66,258 | 66,259 | 66,260 | 66,261 | 66,262 | 66,263 |
| | 2-277 | 66,276 | 66,277 | 66,278 | 66,279 | 66,280 | 66,281 | 66,282 | 66,283 | 66,284 | 66,285 | 66,286 | 66,287 | 66,288 |
| | 2-278 | 66,301 | 66,302 | 66,303 | 66,304 | 66,305 | 66,306 | 66,307 | 66,308 | 66,309 | 66,310 | 66,311 | 66,312 | 66,313 |
| | 2-279 | 66,326 | 66,327 | 66,328 | 66,329 | 66,330 | 66,331 | 66,332 | 66,333 | 66,334 | 66,335 | 66,336 | 66,337 | 66,338 |
| | 2-280 | 66,351 | 66,352 | 66,353 | 66,354 | 66,355 | 66,356 | 66,357 | 66,358 | 66,359 | 66,360 | 66,361 | 66,362 | 66,363 |
| | 2-281 | 66,376 | 66,377 | 66,378 | 66,379 | 66,380 | 66,381 | 66,382 | 66,383 | 66,384 | 66,385 | 66,386 | 66,387 | 66,388 |
| | 2-282 | 66,401 | 66,402 | 66,403 | 66,404 | 66,405 | 66,406 | 66,407 | 66,408 | 66,409 | 66,410 | 66,411 | 66,412 | 66,413 |
| | 2-283 | 66,426 | 66,427 | 66,428 | 66,429 | 66,430 | 66,431 | 66,432 | 66,433 | 66,434 | 66,435 | 66,436 | 66,437 | 66,438 |
| | 2-284 | 66,451 | 66,452 | 66,453 | 66,454 | 66,455 | 66,456 | 66,457 | 66,458 | 66,459 | 66,460 | 66,461 | 66,462 | 66,463 |
| | 2-285 | 66,476 | 66,477 | 66,478 | 66,479 | 66,480 | 66,481 | 66,482 | 66,483 | 66,484 | 66,485 | 66,486 | 66,487 | 66,488 |
| | 2-286 | 66,501 | 66,502 | 66,503 | 66,504 | 66,505 | 66,506 | 66,507 | 66,508 | 66,509 | 66,510 | 66,511 | 66,512 | 66,513 |
| | 2-287 | 66,526 | 66,527 | 66,528 | 66,529 | 66,530 | 66,531 | 66,532 | 66,533 | 66,534 | 66,535 | 66,536 | 66,537 | 66,538 |
| | 2-288 | 66,551 | 66,552 | 66,553 | 66,554 | 66,555 | 66,556 | 66,557 | 66,558 | 66,559 | 66,560 | 66,561 | 66,562 | 66,563 |
| | 2-289 | 66,576 | 66,577 | 66,578 | 66,579 | 66,580 | 66,581 | 66,582 | 66,583 | 66,584 | 66,585 | 66,586 | 66,587 | 66,588 |
| | 2-290 | 66,601 | 66,602 | 66,603 | 66,604 | 66,605 | 66,606 | 66,607 | 66,608 | 66,609 | 66,610 | 66,611 | 66,612 | 66,613 |
| | 2-291 | 66,626 | 66,627 | 66,628 | 66,629 | 66,630 | 66,631 | 66,632 | 66,633 | 66,634 | 66,635 | 66,636 | 66,637 | 66,638 |
| | 2-292 | 66,651 | 66,652 | 66,653 | 66,654 | 66,655 | 66,656 | 66,657 | 66,658 | 66,659 | 66,660 | 66,661 | 66,662 | 66,663 |
| | 2-293 | 66,676 | 66,677 | 66,678 | 66,679 | 66,680 | 66,681 | 66,682 | 66,683 | 66,684 | 66,685 | 66,686 | 66,687 | 66,688 |
| | 2-294 | 66,701 | 66,702 | 66,703 | 66,704 | 66,705 | 66,706 | 66,707 | 66,708 | 66,709 | 66,710 | 66,711 | 66,712 | 66,713 |
| | 2-295 | 66,726 | 66,727 | 66,728 | 66,729 | 66,730 | 66,731 | 66,732 | 66,733 | 66,734 | 66,735 | 66,736 | 66,737 | 66,738 |
| | 2-296 | 66,751 | 66,752 | 66,753 | 66,754 | 66,755 | 66,756 | 66,757 | 66,758 | 66,759 | 66,760 | 66,761 | 66,762 | 66,763 |

TABLE 51-continued

| | | | | | | | | | | | | | |
|---|---|---|---|---|---|---|---|---|---|---|---|---|---|
| 2-297 | 66,776 | 66,777 | 66,778 | 66,779 | 66,780 | 66,781 | 66,782 | 66,783 | 66,784 | 66,785 | 66,786 | 66,787 | 66,788 |
| 2-298 | 66,801 | 66,802 | 66,803 | 66,804 | 66,805 | 66,806 | 66,807 | 66,808 | 66,809 | 66,810 | 66,811 | 66,812 | 66,813 |
| 2-299 | 66,826 | 66,827 | 66,828 | 66,829 | 66,830 | 66,831 | 66,832 | 66,833 | 66,834 | 66,835 | 66,836 | 66,837 | 66,838 |
| 2-300 | 66,851 | 66,852 | 66,853 | 66,854 | 66,855 | 66,856 | 66,857 | 66,858 | 66,859 | 66,860 | 66,861 | 66,862 | 66,863 |
| 2-301 | 66,876 | 66,877 | 66,878 | 66,879 | 66,880 | 66,881 | 66,882 | 66,883 | 66,884 | 66,885 | 66,886 | 66,887 | 66,888 |
| 2-302 | 66,901 | 66,902 | 66,903 | 66,904 | 66,905 | 66,906 | 66,907 | 66,908 | 66,909 | 66,910 | 66,911 | 66,912 | 66,913 |
| 2-303 | 66,926 | 66,927 | 66,928 | 66,929 | 66,930 | 66,931 | 66,932 | 66,933 | 66,934 | 66,935 | 66,936 | 66,937 | 66,938 |
| 2-304 | 66,951 | 66,952 | 66,953 | 66,954 | 66,955 | 66,956 | 66,957 | 66,958 | 66,959 | 66,960 | 66,961 | 66,962 | 66,963 |
| 2-305 | 66,976 | 66,977 | 66,978 | 66,979 | 66,980 | 66,981 | 66,982 | 66,983 | 66,984 | 66,985 | 66,986 | 66,987 | 66,988 |
| 2-306 | 67,001 | 67,002 | 67,003 | 67,004 | 67,005 | 67,006 | 67,007 | 67,008 | 67,009 | 67,010 | 67,011 | 67,012 | 67,013 |
| 2-307 | 67,026 | 67,027 | 67,028 | 67,029 | 67,030 | 67,031 | 67,032 | 67,033 | 67,034 | 67,035 | 67,036 | 67,037 | 67,038 |
| 2-308 | 67,051 | 67,052 | 67,053 | 67,054 | 67,055 | 67,056 | 67,057 | 67,058 | 67,059 | 67,060 | 67,061 | 67,062 | 67,063 |
| 2-309 | 67,076 | 67,077 | 67,078 | 67,079 | 67,080 | 67,081 | 67,082 | 67,083 | 67,084 | 67,085 | 67,086 | 67,087 | 67,088 |
| 2-310 | 67,101 | 67,102 | 67,103 | 67,104 | 67,105 | 67,106 | 67,107 | 67,108 | 67,109 | 67,110 | 67,111 | 67,112 | 67,113 |
| 2-311 | 67,126 | 67,127 | 67,128 | 67,129 | 67,130 | 67,131 | 67,132 | 67,133 | 67,134 | 67,135 | 67,136 | 67,137 | 67,138 |
| 2-312 | 67,151 | 67,152 | 67,153 | 67,154 | 67,155 | 67,156 | 67,157 | 67,158 | 67,159 | 67,160 | 67,161 | 67,162 | 67,163 |
| 2-313 | 67,176 | 67,177 | 67,178 | 67,179 | 67,180 | 67,181 | 67,182 | 67,183 | 67,184 | 67,185 | 67,186 | 67,187 | 67,188 |
| 2-314 | 67,201 | 67,202 | 67,203 | 67,204 | 67,205 | 67,206 | 67,207 | 67,208 | 67,209 | 67,210 | 67,211 | 67,212 | 67,213 |
| 2-315 | 67,226 | 67,227 | 67,228 | 67,229 | 67,230 | 67,231 | 67,232 | 67,233 | 67,234 | 67,235 | 67,236 | 67,237 | 67,238 |
| 2-316 | 67,251 | 67,252 | 67,253 | 67,254 | 67,255 | 67,256 | 67,257 | 67,258 | 67,259 | 67,260 | 67,261 | 67,262 | 67,263 |
| 2-317 | 67,276 | 67,277 | 67,278 | 67,279 | 67,280 | 67,281 | 67,282 | 67,283 | 67,284 | 67,285 | 67,286 | 67,287 | 67,288 |
| 2-318 | 67,301 | 67,302 | 67,303 | 67,304 | 67,305 | 67,306 | 67,307 | 67,308 | 67,309 | 67,310 | 67,311 | 67,312 | 67,313 |
| 2-319 | 67,326 | 67,327 | 67,328 | 67,329 | 67,330 | 67,331 | 67,332 | 67,333 | 67,334 | 67,335 | 67,336 | 67,337 | 67,338 |
| 2-320 | 67,351 | 67,352 | 67,353 | 67,354 | 67,355 | 67,356 | 67,357 | 67,358 | 67,359 | 67,360 | 67,361 | 67,362 | 67,363 |
| 2-321 | 67,376 | 67,377 | 67,378 | 67,379 | 67,380 | 67,381 | 67,382 | 67,383 | 67,384 | 67,385 | 67,386 | 67,387 | 67,388 |
| 2-322 | 67,401 | 67,402 | 67,403 | 67,404 | 67,405 | 67,406 | 67,407 | 67,408 | 67,409 | 67,410 | 67,411 | 67,412 | 67,413 |
| 2-323 | 67,426 | 67,427 | 67,428 | 67,429 | 67,430 | 67,431 | 67,432 | 67,433 | 67,434 | 67,435 | 67,436 | 67,437 | 67,438 |
| 2-324 | 67,451 | 67,452 | 67,453 | 67,454 | 67,455 | 67,456 | 67,457 | 67,458 | 67,459 | 67,460 | 67,461 | 67,462 | 67,463 |
| 2-325 | 67,476 | 67,477 | 67,478 | 67,479 | 67,480 | 67,481 | 67,482 | 67,483 | 67,484 | 67,485 | 67,486 | 67,487 | 67,488 |
| 2-326 | 67,501 | 67,502 | 67,503 | 67,504 | 67,505 | 67,506 | 67,507 | 67,508 | 67,509 | 67,510 | 67,511 | 67,512 | 67,513 |
| 2-327 | 67,526 | 67,527 | 67,528 | 67,529 | 67,530 | 67,531 | 67,532 | 67,533 | 67,534 | 67,535 | 67,536 | 67,537 | 67,538 |
| 2-328 | 67,551 | 67,552 | 67,553 | 67,554 | 67,555 | 67,556 | 67,557 | 67,558 | 67,559 | 67,560 | 67,561 | 67,562 | 67,563 |
| 2-329 | 67,576 | 67,577 | 67,578 | 67,579 | 67,580 | 67,581 | 67,582 | 67,583 | 67,584 | 67,585 | 67,586 | 67,587 | 67,588 |
| 2-330 | 67,601 | 67,602 | 67,603 | 67,604 | 67,605 | 67,606 | 67,607 | 67,608 | 67,609 | 67,610 | 67,611 | 67,612 | 67,613 |

| | | Compound represented by the formula (1) | | | | | | | | | | | |
|---|---|---|---|---|---|---|---|---|---|---|---|---|---|
| | | 1-139 | 1-140 | 1-141 | 1-142 | 1-143 | 1-144 | 1-145 | 1-146 | 1-147 | 1-148 | 1-149 | 1-150 |
| Compound represented by the formula (2) | 2-276 | 66,264 | 66,265 | 66,266 | 66,267 | 66,268 | 66,269 | 66,270 | 66,271 | 66,272 | 66,273 | 66,274 | 66,275 |
| | 2-277 | 66,289 | 66,290 | 66,291 | 66,292 | 66,293 | 66,294 | 66,295 | 66,296 | 66,297 | 66,298 | 66,299 | 66,300 |
| | 2-278 | 66,314 | 66,315 | 66,316 | 66,317 | 66,318 | 66,319 | 66,320 | 66,321 | 66,322 | 66,323 | 66,324 | 66,325 |
| | 2-279 | 66,339 | 66,340 | 66,341 | 66,342 | 66,343 | 66,344 | 66,345 | 66,346 | 66,347 | 66,348 | 66,349 | 66,350 |
| | 2-280 | 66,364 | 66,365 | 66,366 | 66,367 | 66,368 | 66,369 | 66,370 | 66,371 | 66,372 | 66,373 | 66,374 | 66,375 |
| | 2-281 | 66,389 | 66,390 | 66,391 | 66,392 | 66,393 | 66,394 | 66,395 | 66,396 | 66,397 | 66,398 | 66,399 | 66,400 |
| | 2-282 | 66,414 | 66,415 | 66,416 | 66,417 | 66,418 | 66,419 | 66,420 | 66,421 | 66,422 | 66,423 | 66,424 | 66,425 |
| | 2-283 | 66,439 | 66,440 | 66,441 | 66,442 | 66,443 | 66,444 | 66,445 | 66,446 | 66,447 | 66,448 | 66,449 | 66,450 |
| | 2-284 | 66,464 | 66,465 | 66,466 | 66,467 | 66,468 | 66,469 | 66,470 | 66,471 | 66,472 | 66,473 | 66,474 | 66,475 |
| | 2-285 | 66,489 | 66,490 | 66,491 | 66,492 | 66,493 | 66,494 | 66,495 | 66,496 | 66,497 | 66,498 | 66,499 | 66,500 |
| | 2-286 | 66,514 | 66,515 | 66,516 | 66,517 | 66,518 | 66,519 | 66,520 | 66,521 | 66,522 | 66,523 | 66,524 | 66,525 |
| | 2-287 | 66,539 | 66,540 | 66,541 | 66,542 | 66,543 | 66,544 | 66,545 | 66,546 | 66,547 | 66,548 | 66,549 | 66,550 |
| | 2-288 | 66,564 | 66,565 | 66,566 | 66,567 | 66,568 | 66,569 | 66,570 | 66,571 | 66,572 | 66,573 | 66,574 | 66,575 |
| | 2-289 | 66,589 | 66,590 | 66,591 | 66,592 | 66,593 | 66,594 | 66,595 | 66,596 | 66,597 | 66,598 | 66,599 | 66,600 |
| | 2-290 | 66,614 | 66,615 | 66,616 | 66,617 | 66,618 | 66,619 | 66,620 | 66,621 | 66,622 | 66,623 | 66,624 | 66,625 |
| | 2-291 | 66,639 | 66,640 | 66,641 | 66,642 | 66,643 | 66,644 | 66,645 | 66,646 | 66,647 | 66,648 | 66,649 | 66,650 |
| | 2-292 | 66,664 | 66,665 | 66,666 | 66,667 | 66,668 | 66,669 | 66,670 | 66,671 | 66,672 | 66,673 | 66,674 | 66,675 |
| | 2-293 | 66,689 | 66,690 | 66,691 | 66,692 | 66,693 | 66,694 | 66,695 | 66,696 | 66,697 | 66,698 | 66,699 | 66,700 |
| | 2-294 | 66,714 | 66,715 | 66,716 | 66,717 | 66,718 | 66,719 | 66,720 | 66,721 | 66,722 | 66,723 | 66,724 | 66,725 |
| | 2-295 | 66,739 | 66,740 | 66,741 | 66,742 | 66,743 | 66,744 | 66,745 | 66,746 | 66,747 | 66,748 | 66,749 | 66,750 |
| | 2-296 | 66,764 | 66,765 | 66,766 | 66,767 | 66,768 | 66,769 | 66,770 | 66,771 | 66,772 | 66,773 | 66,774 | 66,775 |
| | 2-297 | 66,789 | 66,790 | 66,791 | 66,792 | 66,793 | 66,794 | 66,795 | 66,796 | 66,797 | 66,798 | 66,799 | 66,800 |
| | 2-298 | 66,814 | 66,815 | 66,816 | 66,817 | 66,818 | 66,819 | 66,820 | 66,821 | 66,822 | 66,823 | 66,824 | 66,825 |
| | 2-299 | 66,839 | 66,840 | 66,841 | 66,842 | 66,843 | 66,844 | 66,845 | 66,846 | 66,847 | 66,848 | 66,849 | 66,850 |
| | 2-300 | 66,864 | 66,865 | 66,866 | 66,867 | 66,868 | 66,869 | 66,870 | 66,871 | 66,872 | 66,873 | 66,874 | 66,875 |
| | 2-301 | 66,889 | 66,890 | 66,891 | 66,892 | 66,893 | 66,894 | 66,895 | 66,896 | 66,897 | 66,898 | 66,899 | 66,900 |
| | 2-302 | 66,914 | 66,915 | 66,916 | 66,917 | 66,918 | 66,919 | 66,920 | 66,921 | 66,922 | 66,923 | 66,924 | 66,925 |
| | 2-303 | 66,939 | 66,940 | 66,941 | 66,942 | 66,943 | 66,944 | 66,945 | 66,946 | 66,947 | 66,948 | 66,949 | 66,950 |
| | 2-304 | 66,964 | 66,965 | 66,966 | 66,967 | 66,968 | 66,969 | 66,970 | 66,971 | 66,972 | 66,973 | 66,974 | 66,975 |
| | 2-305 | 66,989 | 66,990 | 66,991 | 66,992 | 66,993 | 66,994 | 66,995 | 66,996 | 66,997 | 66,998 | 66,999 | 67,000 |
| | 2-306 | 67,014 | 67,015 | 67,016 | 67,017 | 67,018 | 67,019 | 67,020 | 67,021 | 67,022 | 67,023 | 67,024 | 67,025 |
| | 2-307 | 67,039 | 67,040 | 67,041 | 67,042 | 67,043 | 67,044 | 67,045 | 67,046 | 67,047 | 67,048 | 67,049 | 67,050 |
| | 2-308 | 67,064 | 67,065 | 67,066 | 67,067 | 67,068 | 67,069 | 67,070 | 67,071 | 67,072 | 67,073 | 67,074 | 67,075 |
| | 2-309 | 67,089 | 67,090 | 67,091 | 67,092 | 67,093 | 67,094 | 67,095 | 67,096 | 67,097 | 67,098 | 67,099 | 67,100 |
| | 2-310 | 67,114 | 67,115 | 67,116 | 67,117 | 67,118 | 67,119 | 67,120 | 67,121 | 67,122 | 67,123 | 67,124 | 67,125 |
| | 2-311 | 67,139 | 67,140 | 67,141 | 67,142 | 67,143 | 67,144 | 67,145 | 67,146 | 67,147 | 67,148 | 67,149 | 67,150 |
| | 2-312 | 67,164 | 67,165 | 67,166 | 67,167 | 67,168 | 67,169 | 67,170 | 67,171 | 67,172 | 67,173 | 67,174 | 67,175 |
| | 2-313 | 67,189 | 67,190 | 67,191 | 67,192 | 67,193 | 67,194 | 67,195 | 67,196 | 67,197 | 67,198 | 67,199 | 67,200 |
| | 2-314 | 67,214 | 67,215 | 67,216 | 67,217 | 67,218 | 67,219 | 67,220 | 67,221 | 67,222 | 67,223 | 67,224 | 67,225 |
| | 2-315 | 67,239 | 67,240 | 67,241 | 67,242 | 67,243 | 67,244 | 67,245 | 67,246 | 67,247 | 67,248 | 67,249 | 67,250 |
| | 2-316 | 67,264 | 67,265 | 67,266 | 67,267 | 67,268 | 67,269 | 67,270 | 67,271 | 67,272 | 67,273 | 67,274 | 67,275 |

TABLE 51-continued

| | | | | | | | | | | | | | |
|---|---|---|---|---|---|---|---|---|---|---|---|---|---|
| | 2-317 | 67,289 | 67,290 | 67,291 | 67,292 | 67,293 | 67,294 | 67,295 | 67,296 | 67,297 | 67,298 | 67,299 | 67,300 |
| | 2-318 | 67,314 | 67,315 | 67,316 | 67,317 | 67,318 | 67,319 | 67,320 | 67,321 | 67,322 | 67,323 | 67,324 | 67,325 |
| | 2-319 | 67,339 | 67,340 | 67,341 | 67,342 | 67,343 | 67,344 | 67,345 | 67,346 | 67,347 | 67,348 | 67,349 | 67,350 |
| | 2-320 | 67,364 | 67,365 | 67,366 | 67,367 | 67,368 | 67,369 | 67,370 | 67,371 | 67,372 | 67,373 | 67,374 | 67,375 |
| | 2-321 | 67,389 | 67,390 | 67,391 | 67,392 | 67,393 | 67,394 | 67,395 | 67,396 | 67,397 | 67,398 | 67,399 | 67,400 |
| | 2-322 | 67,414 | 67,415 | 67,416 | 67,417 | 67,418 | 67,419 | 67,420 | 67,421 | 67,422 | 67,423 | 67,424 | 67,425 |
| | 2-323 | 67,439 | 67,440 | 67,441 | 67,442 | 67,443 | 67,444 | 67,445 | 67,446 | 67,447 | 67,448 | 67,449 | 67,450 |
| | 2-324 | 67,464 | 67,465 | 67,466 | 67,467 | 67,468 | 67,469 | 67,470 | 67,471 | 67,472 | 67,473 | 67,474 | 67,475 |
| | 2-325 | 67,489 | 67,490 | 67,491 | 67,492 | 67,493 | 67,494 | 67,495 | 67,496 | 67,497 | 67,498 | 67,499 | 67,500 |
| | 2-326 | 67,514 | 67,515 | 67,516 | 67,517 | 67,518 | 67,519 | 67,520 | 67,521 | 67,522 | 67,523 | 67,524 | 67,525 |
| | 2-327 | 67,539 | 67,540 | 67,541 | 67,542 | 67,543 | 67,544 | 67,545 | 67,546 | 67,547 | 67,548 | 67,549 | 67,550 |
| | 2-328 | 67,564 | 67,565 | 67,566 | 67,567 | 67,568 | 67,569 | 67,570 | 67,571 | 67,572 | 67,573 | 67,574 | 67,575 |
| | 2-329 | 67,589 | 67,590 | 67,591 | 67,592 | 67,593 | 67,594 | 67,595 | 67,596 | 67,597 | 67,598 | 67,599 | 67,600 |
| | 2-330 | 67,614 | 67,615 | 67,616 | 67,617 | 67,618 | 67,619 | 67,620 | 67,621 | 67,622 | 67,623 | 67,624 | 67,625 |

TABLE 52

| | | Compound represented by the formula (1) | | | | | | | | | | | | |
|---|---|---|---|---|---|---|---|---|---|---|---|---|---|---|
| | | 1-126 | 1-127 | 1-128 | 1-129 | 1-130 | 1-131 | 1-132 | 1-133 | 1-134 | 1-135 | 1-136 | 1-137 | 1-138 |
| Compound represented by the formula (2) | 2-331 | 67,626 | 67,627 | 67,628 | 67,629 | 67,630 | 67,631 | 67,632 | 67,633 | 67,634 | 67,635 | 67,636 | 67,637 | 67,638 |
| | 2-332 | 67,651 | 67,652 | 67,653 | 67,654 | 67,655 | 67,656 | 67,657 | 67,658 | 67,659 | 67,660 | 67,661 | 67,662 | 67,663 |
| | 2-333 | 67,676 | 67,677 | 67,678 | 67,679 | 67,680 | 67,681 | 67,682 | 67,683 | 67,684 | 67,685 | 67,686 | 67,687 | 67,688 |
| | 2-334 | 67,701 | 67,702 | 67,703 | 67,704 | 67,705 | 67,706 | 67,707 | 67,708 | 67,709 | 67,710 | 67,711 | 67,712 | 67,713 |
| | 2-335 | 67,726 | 67,727 | 67,728 | 67,729 | 67,730 | 67,731 | 67,732 | 67,733 | 67,734 | 67,735 | 67,736 | 67,737 | 67,738 |
| | 2-336 | 67,751 | 67,752 | 67,753 | 67,754 | 67,755 | 67,756 | 67,757 | 67,758 | 67,759 | 67,760 | 67,761 | 67,762 | 67,763 |
| | 2-337 | 67,776 | 67,777 | 67,778 | 67,779 | 67,780 | 67,781 | 67,782 | 67,783 | 67,784 | 67,785 | 67,786 | 67,787 | 67,788 |
| | 2-338 | 67,801 | 67,802 | 67,803 | 67,804 | 67,805 | 67,806 | 67,807 | 67,808 | 67,809 | 67,810 | 67,811 | 67,812 | 67,813 |
| | 2-339 | 67,826 | 67,827 | 67,828 | 67,829 | 67,830 | 67,831 | 67,832 | 67,833 | 67,834 | 67,835 | 67,836 | 67,837 | 67,838 |
| | 2-340 | 67,851 | 67,852 | 67,853 | 67,854 | 67,855 | 67,856 | 67,857 | 67,858 | 67,859 | 67,860 | 67,861 | 67,862 | 67,863 |
| | 2-341 | 67,876 | 67,877 | 67,878 | 67,879 | 67,880 | 67,881 | 67,882 | 67,883 | 67,884 | 67,885 | 67,886 | 67,887 | 67,888 |
| | 2-342 | 67,901 | 67,902 | 67,903 | 67,904 | 67,905 | 67,906 | 67,907 | 67,908 | 67,909 | 67,910 | 67,911 | 67,912 | 67,913 |
| | 2-343 | 67,926 | 67,927 | 67,928 | 67,929 | 67,930 | 67,931 | 67,932 | 67,933 | 67,934 | 67,935 | 67,936 | 67,937 | 67,938 |
| | 2-344 | 67,951 | 67,952 | 67,953 | 67,954 | 67,955 | 67,956 | 67,957 | 67,958 | 67,959 | 67,960 | 67,961 | 67,962 | 67,963 |
| | 2-345 | 67,976 | 67,977 | 67,978 | 67,979 | 67,980 | 67,981 | 67,982 | 67,983 | 67,984 | 67,985 | 67,986 | 67,987 | 67,988 |
| | 2-346 | 68,001 | 68,002 | 68,003 | 68,004 | 68,005 | 68,006 | 68,007 | 68,008 | 68,009 | 68,010 | 68,011 | 68,012 | 68,013 |
| | 2-347 | 68,026 | 68,027 | 68,028 | 68,029 | 68,030 | 68,031 | 68,032 | 68,033 | 68,034 | 68,035 | 68,036 | 68,037 | 68,038 |
| | 2-348 | 68,051 | 68,052 | 68,053 | 68,054 | 68,055 | 68,056 | 68,057 | 68,058 | 68,059 | 68,060 | 68,061 | 68,062 | 68,063 |
| | 2-349 | 68,076 | 68,077 | 68,078 | 68,079 | 68,080 | 68,081 | 68,082 | 68,083 | 68,084 | 68,085 | 68,086 | 68,087 | 68,088 |
| | 2-350 | 68,101 | 68,102 | 68,103 | 68,104 | 68,105 | 68,106 | 68,107 | 68,108 | 68,109 | 68,110 | 68,111 | 68,112 | 68,113 |
| | 2-351 | 68,126 | 68,127 | 68,128 | 68,129 | 68,130 | 68,131 | 68,132 | 68,133 | 68,134 | 68,135 | 68,136 | 68,137 | 68,138 |
| | 2-352 | 68,151 | 68,152 | 68,153 | 68,154 | 68,155 | 68,156 | 68,157 | 68,158 | 68,159 | 68,160 | 68,161 | 68,162 | 68,163 |
| | 2-353 | 68,176 | 68,177 | 68,178 | 68,179 | 68,180 | 68,181 | 68,182 | 68,183 | 68,184 | 68,185 | 68,186 | 68,187 | 68,188 |
| | 2-354 | 68,201 | 68,202 | 68,203 | 68,204 | 68,205 | 68,206 | 68,207 | 68,208 | 68,209 | 68,210 | 68,211 | 68,212 | 68,213 |
| | 2-355 | 68,226 | 68,227 | 68,228 | 68,229 | 68,230 | 68,231 | 68,232 | 68,233 | 68,234 | 68,235 | 68,236 | 68,237 | 68,238 |
| | 2-356 | 68,251 | 68,252 | 68,253 | 68,254 | 68,255 | 68,256 | 68,257 | 68,258 | 68,259 | 68,260 | 68,261 | 68,262 | 68,263 |
| | 2-357 | 68,276 | 68,277 | 68,278 | 68,279 | 68,280 | 68,281 | 68,282 | 68,283 | 68,284 | 68,285 | 68,286 | 68,287 | 68,288 |
| | 2-358 | 68,301 | 68,302 | 68,303 | 68,304 | 68,305 | 68,306 | 68,307 | 68,308 | 68,309 | 68,310 | 68,311 | 68,312 | 68,313 |
| | 2-359 | 68,326 | 68,327 | 68,328 | 68,329 | 68,330 | 68,331 | 68,332 | 68,333 | 68,334 | 68,335 | 68,336 | 68,337 | 68,338 |
| | 2-360 | 68,351 | 68,352 | 68,353 | 68,354 | 68,355 | 68,356 | 68,357 | 68,358 | 68,359 | 68,360 | 68,361 | 68,362 | 68,363 |
| | 2-361 | 68,376 | 68,377 | 68,378 | 68,379 | 68,380 | 68,381 | 68,382 | 68,383 | 68,384 | 68,385 | 68,386 | 68,387 | 68,388 |
| | 2-362 | 68,401 | 68,402 | 68,403 | 68,404 | 68,405 | 68,406 | 68,407 | 68,408 | 68,409 | 68,410 | 68,411 | 68,412 | 68,413 |
| | 2-363 | 68,426 | 68,427 | 68,428 | 68,429 | 68,430 | 68,431 | 68,432 | 68,433 | 68,434 | 68,435 | 68,436 | 68,437 | 68,438 |
| | 2-364 | 68,451 | 68,452 | 68,453 | 68,454 | 68,455 | 68,456 | 68,457 | 68,458 | 68,459 | 68,460 | 68,461 | 68,462 | 68,463 |
| | 2-365 | 68,476 | 68,477 | 68,478 | 68,479 | 68,480 | 68,481 | 68,482 | 68,483 | 68,484 | 68,485 | 68,486 | 68,487 | 68,488 |
| | 2-366 | 68,501 | 68,502 | 68,503 | 68,504 | 68,505 | 68,506 | 68,507 | 68,508 | 68,509 | 68,510 | 68,511 | 68,512 | 68,513 |
| | 2-367 | 68,526 | 68,527 | 68,528 | 68,529 | 68,530 | 68,531 | 68,532 | 68,533 | 68,534 | 68,535 | 68,536 | 68,537 | 68,538 |
| | 2-368 | 68,551 | 68,552 | 68,553 | 68,554 | 68,555 | 68,556 | 68,557 | 68,558 | 68,559 | 68,560 | 68,561 | 68,562 | 68,563 |
| | 2-369 | 68,576 | 68,577 | 68,578 | 68,579 | 68,580 | 68,581 | 68,582 | 68,583 | 68,584 | 68,585 | 68,586 | 68,587 | 68,588 |
| | 2-370 | 68,601 | 68,602 | 68,603 | 68,604 | 68,605 | 68,606 | 68,607 | 68,608 | 68,609 | 68,610 | 68,611 | 68,612 | 68,613 |
| | 2-371 | 68,626 | 68,627 | 68,628 | 68,629 | 68,630 | 68,631 | 68,632 | 68,633 | 68,634 | 68,635 | 68,636 | 68,637 | 68,638 |
| | 2-372 | 68,651 | 68,652 | 68,653 | 68,654 | 68,655 | 68,656 | 68,657 | 68,658 | 68,659 | 68,660 | 68,661 | 68,662 | 68,663 |
| | 2-373 | 68,676 | 68,677 | 68,678 | 68,679 | 68,680 | 68,681 | 68,682 | 68,683 | 68,684 | 68,685 | 68,686 | 68,687 | 68,688 |
| | 2-374 | 68,701 | 68,702 | 68,703 | 68,704 | 68,705 | 68,706 | 68,707 | 68,708 | 68,709 | 68,710 | 68,711 | 68,712 | 68,713 |
| | 2-375 | 68,726 | 68,727 | 68,728 | 68,729 | 68,730 | 68,731 | 68,732 | 68,733 | 68,734 | 68,735 | 68,736 | 68,737 | 68,738 |
| | 2-376 | 68,751 | 68,752 | 68,753 | 68,754 | 68,755 | 68,756 | 68,757 | 68,758 | 68,759 | 68,760 | 68,761 | 68,762 | 68,763 |
| | 2-377 | 68,776 | 68,777 | 68,778 | 68,779 | 68,780 | 68,781 | 68,782 | 68,783 | 68,784 | 68,785 | 68,786 | 68,787 | 68,788 |
| | 2-378 | 68,801 | 68,802 | 68,803 | 68,804 | 68,805 | 68,806 | 68,807 | 68,808 | 68,809 | 68,810 | 68,811 | 68,812 | 68,813 |
| | 2-379 | 68,826 | 68,827 | 68,828 | 68,829 | 68,830 | 68,831 | 68,832 | 68,833 | 68,834 | 68,835 | 68,836 | 68,837 | 68,838 |
| | 2-380 | 68,851 | 68,852 | 68,853 | 68,854 | 68,855 | 68,856 | 68,857 | 68,858 | 68,859 | 68,860 | 68,861 | 68,862 | 68,863 |
| | 2-381 | 68,876 | 68,877 | 68,878 | 68,879 | 68,880 | 68,881 | 68,882 | 68,883 | 68,884 | 68,885 | 68,886 | 68,887 | 68,888 |
| | 2-382 | 68,901 | 68,902 | 68,903 | 68,904 | 68,905 | 68,906 | 68,907 | 68,908 | 68,909 | 68,910 | 68,911 | 68,912 | 68,913 |
| | 2-383 | 68,926 | 68,927 | 68,928 | 68,929 | 68,930 | 68,931 | 68,932 | 68,933 | 68,934 | 68,935 | 68,936 | 68,937 | 68,938 |
| | 2-384 | 68,951 | 68,952 | 68,953 | 68,954 | 68,955 | 68,956 | 68,957 | 68,958 | 68,959 | 68,960 | 68,961 | 68,962 | 68,963 |
| | 2-385 | 68,976 | 68,977 | 68,978 | 68,979 | 68,980 | 68,981 | 68,982 | 68,983 | 68,984 | 68,985 | 68,986 | 68,987 | 68,988 |

TABLE 52-continued

| | | Compound represented by the formula (1) | | | | | | | | | | | |
|---|---|---|---|---|---|---|---|---|---|---|---|---|---|
| | | 1-139 | 1-140 | 1-141 | 1-142 | 1-143 | 1-144 | 1-145 | 1-146 | 1-147 | 1-148 | 1-149 | 1-150 |
| Compound represented by the formula (2) | 2-331 | 67,639 | 67,640 | 67,641 | 67,642 | 67,643 | 67,644 | 67,645 | 67,646 | 67,647 | 67,648 | 67,649 | 67,650 |
| | 2-332 | 67,664 | 67,665 | 67,666 | 67,667 | 67,668 | 67,669 | 67,670 | 67,671 | 67,672 | 67,673 | 67,674 | 67,675 |
| | 2-333 | 67,689 | 67,690 | 67,691 | 67,692 | 67,693 | 67,694 | 67,695 | 67,696 | 67,697 | 67,698 | 67,699 | 67,700 |
| | 2-334 | 67,714 | 67,715 | 67,716 | 67,717 | 67,718 | 67,719 | 67,720 | 67,721 | 67,722 | 67,723 | 67,724 | 67,725 |
| | 2-335 | 67,739 | 67,740 | 67,741 | 67,742 | 67,743 | 67,744 | 67,745 | 67,746 | 67,747 | 67,748 | 67,749 | 67,750 |
| | 2-336 | 67,764 | 67,765 | 67,766 | 67,767 | 67,768 | 67,769 | 67,770 | 67,771 | 67,772 | 67,773 | 67,774 | 67,775 |
| | 2-337 | 67,789 | 67,790 | 67,791 | 67,792 | 67,793 | 67,794 | 67,795 | 67,796 | 67,797 | 67,798 | 67,799 | 67,800 |
| | 2-338 | 67,814 | 67,815 | 67,816 | 67,817 | 67,818 | 67,819 | 67,820 | 67,821 | 67,822 | 67,823 | 67,824 | 67,825 |
| | 2-339 | 67,839 | 67,840 | 67,841 | 67,842 | 67,843 | 67,844 | 67,845 | 67,846 | 67,847 | 67,848 | 67,849 | 67,850 |
| | 2-340 | 67,864 | 67,865 | 67,866 | 67,867 | 67,868 | 67,869 | 67,870 | 67,871 | 67,872 | 67,873 | 67,874 | 67,875 |
| | 2-341 | 67,889 | 67,890 | 67,891 | 67,892 | 67,893 | 67,894 | 67,895 | 67,896 | 67,897 | 67,898 | 67,899 | 67,900 |
| | 2-342 | 67,914 | 67,915 | 67,916 | 67,917 | 67,918 | 67,919 | 67,920 | 67,921 | 67,922 | 67,923 | 67,924 | 67,925 |
| | 2-343 | 67,939 | 67,940 | 67,941 | 67,942 | 67,943 | 67,944 | 67,945 | 67,946 | 67,947 | 67,948 | 67,949 | 67,950 |
| | 2-344 | 67,964 | 67,965 | 67,966 | 67,967 | 67,968 | 67,969 | 67,970 | 67,971 | 67,972 | 67,973 | 67,974 | 67,975 |
| | 2-345 | 67,989 | 67,990 | 67,991 | 67,992 | 67,993 | 67,994 | 67,995 | 67,996 | 67,997 | 67,998 | 67,999 | 68,000 |
| | 2-346 | 68,014 | 68,015 | 68,016 | 68,017 | 68,018 | 68,019 | 68,020 | 68,021 | 68,022 | 68,023 | 68,024 | 68,025 |
| | 2-347 | 68,039 | 68,040 | 68,041 | 68,042 | 68,043 | 68,044 | 68,045 | 68,046 | 68,047 | 68,048 | 68,049 | 68,050 |
| | 2-348 | 68,064 | 68,065 | 68,066 | 68,067 | 68,068 | 68,069 | 68,070 | 68,071 | 68,072 | 68,073 | 68,074 | 68,075 |
| | 2-349 | 68,089 | 68,090 | 68,091 | 68,092 | 68,093 | 68,094 | 68,095 | 68,096 | 68,097 | 68,098 | 68,099 | 68,100 |
| | 2-350 | 68,114 | 68,115 | 68,116 | 68,117 | 68,118 | 68,119 | 68,120 | 68,121 | 68,122 | 68,123 | 68,124 | 68,125 |
| | 2-351 | 68,139 | 68,140 | 68,141 | 68,142 | 68,143 | 68,144 | 68,145 | 68,146 | 68,147 | 68,148 | 68,149 | 68,150 |
| | 2-352 | 68,164 | 68,165 | 68,166 | 68,167 | 68,168 | 68,169 | 68,170 | 68,171 | 68,172 | 68,173 | 68,174 | 68,175 |
| | 2-353 | 68,189 | 68,190 | 68,191 | 68,192 | 68,193 | 68,194 | 68,195 | 68,196 | 68,197 | 68,198 | 68,199 | 68,200 |
| | 2-354 | 68,214 | 68,215 | 68,216 | 68,217 | 68,218 | 68,219 | 68,220 | 68,221 | 68,222 | 68,223 | 68,224 | 68,225 |
| | 2-355 | 68,239 | 68,240 | 68,241 | 68,242 | 68,243 | 68,244 | 68,245 | 68,246 | 68,247 | 68,248 | 68,249 | 68,250 |
| | 2-356 | 68,264 | 68,265 | 68,266 | 68,267 | 68,268 | 68,269 | 68,270 | 68,271 | 68,272 | 68,273 | 68,274 | 68,275 |
| | 2-357 | 68,289 | 68,290 | 68,291 | 68,292 | 68,293 | 68,294 | 68,295 | 68,296 | 68,297 | 68,298 | 68,299 | 68,300 |
| | 2-358 | 68,314 | 68,315 | 68,316 | 68,317 | 68,318 | 68,319 | 68,320 | 68,321 | 68,322 | 68,323 | 68,324 | 68,325 |
| | 2-359 | 68,339 | 68,340 | 68,341 | 68,342 | 68,343 | 68,344 | 68,345 | 68,346 | 68,347 | 68,348 | 68,349 | 68,350 |
| | 2-360 | 68,364 | 68,365 | 68,366 | 68,367 | 68,368 | 68,369 | 68,370 | 68,371 | 68,372 | 68,373 | 68,374 | 68,375 |
| | 2-361 | 68,389 | 68,390 | 68,391 | 68,392 | 68,393 | 68,394 | 68,395 | 68,396 | 68,397 | 68,398 | 68,399 | 68,400 |
| | 2-362 | 68,414 | 68,415 | 68,416 | 68,417 | 68,418 | 68,419 | 68,420 | 68,421 | 68,422 | 68,423 | 68,424 | 68,425 |
| | 2-363 | 68,439 | 68,440 | 68,441 | 68,442 | 68,443 | 68,444 | 68,445 | 68,446 | 68,447 | 68,448 | 68,449 | 68,450 |
| | 2-364 | 68,464 | 68,465 | 68,466 | 68,467 | 68,468 | 68,469 | 68,470 | 68,471 | 68,472 | 68,473 | 68,474 | 68,475 |
| | 2-365 | 68,489 | 68,490 | 68,491 | 68,492 | 68,493 | 68,494 | 68,495 | 68,496 | 68,497 | 68,498 | 68,499 | 68,500 |
| | 2-366 | 68,514 | 68,515 | 68,516 | 68,517 | 68,518 | 68,519 | 68,520 | 68,521 | 68,522 | 68,523 | 68,524 | 68,525 |
| | 2-367 | 68,539 | 68,540 | 68,541 | 68,542 | 68,543 | 68,544 | 68,545 | 68,546 | 68,547 | 68,548 | 68,549 | 68,550 |
| | 2-368 | 68,564 | 68,565 | 68,566 | 68,567 | 68,568 | 68,569 | 68,570 | 68,571 | 68,572 | 68,573 | 68,574 | 68,575 |
| | 2-369 | 68,589 | 68,590 | 68,591 | 68,592 | 68,593 | 68,594 | 68,595 | 68,596 | 68,597 | 68,598 | 68,599 | 68,600 |
| | 2-370 | 68,614 | 68,615 | 68,616 | 68,617 | 68,618 | 68,619 | 68,620 | 68,621 | 68,622 | 68,623 | 68,624 | 68,625 |
| | 2-371 | 68,639 | 68,640 | 68,641 | 68,642 | 68,643 | 68,644 | 68,645 | 68,646 | 68,647 | 68,648 | 68,649 | 68,650 |
| | 2-372 | 68,664 | 68,665 | 68,666 | 68,667 | 68,668 | 68,669 | 68,670 | 68,671 | 68,672 | 68,673 | 68,674 | 68,675 |
| | 2-373 | 68,689 | 68,690 | 68,691 | 68,692 | 68,693 | 68,694 | 68,695 | 68,696 | 68,697 | 68,698 | 68,699 | 68,700 |
| | 2-374 | 68,714 | 68,715 | 68,716 | 68,717 | 68,718 | 68,719 | 68,720 | 68,721 | 68,722 | 68,723 | 68,724 | 68,725 |
| | 2-375 | 68,739 | 68,740 | 68,741 | 68,742 | 68,743 | 68,744 | 68,745 | 68,746 | 68,747 | 68,748 | 68,749 | 68,750 |
| | 2-376 | 68,764 | 68,765 | 68,766 | 68,767 | 68,768 | 68,769 | 68,770 | 68,771 | 68,772 | 68,773 | 68,774 | 68,775 |
| | 2-377 | 68,789 | 68,790 | 68,791 | 68,792 | 68,793 | 68,794 | 68,795 | 68,796 | 68,797 | 68,798 | 68,799 | 68,800 |
| | 2-378 | 68,814 | 68,815 | 68,816 | 68,817 | 68,818 | 68,819 | 68,820 | 68,821 | 68,822 | 68,823 | 68,824 | 68,825 |
| | 2-379 | 68,839 | 68,840 | 68,841 | 68,842 | 68,843 | 68,844 | 68,845 | 68,846 | 68,847 | 68,848 | 68,849 | 68,850 |
| | 2-380 | 68,864 | 68,865 | 68,866 | 68,867 | 68,868 | 68,869 | 68,870 | 68,871 | 68,872 | 68,873 | 68,874 | 68,875 |
| | 2-381 | 68,889 | 68,890 | 68,891 | 68,892 | 68,893 | 68,894 | 68,895 | 68,896 | 68,897 | 68,898 | 68,899 | 68,900 |
| | 2-382 | 68,914 | 68,915 | 68,916 | 68,917 | 68,918 | 68,919 | 68,920 | 68,921 | 68,922 | 68,923 | 68,924 | 68,925 |
| | 2-383 | 68,939 | 68,940 | 68,941 | 68,942 | 68,943 | 68,944 | 68,945 | 68,946 | 68,947 | 68,948 | 68,949 | 68,950 |
| | 2-384 | 68,964 | 68,965 | 68,966 | 68,967 | 68,968 | 68,969 | 68,970 | 68,971 | 68,972 | 68,973 | 68,974 | 68,975 |
| | 2-385 | 68,989 | 68,990 | 68,991 | 68,992 | 68,993 | 68,994 | 68,995 | 68,996 | 68,997 | 68,998 | 68,999 | 69,000 |

TABLE 53

| | | Compound represented by the formula (1) | | | | | | | | | | | | |
|---|---|---|---|---|---|---|---|---|---|---|---|---|---|---|
| | | 1-126 | 1-127 | 1-128 | 1-129 | 1-130 | 1-131 | 1-132 | 1-133 | 1-134 | 1-135 | 1-136 | 1-137 | 1-138 |
| Compound represented by the formula (2) | 2-386 | 69,001 | 69,002 | 69,003 | 69,004 | 69,005 | 69,006 | 69,007 | 69,008 | 69,009 | 69,010 | 69,011 | 69,012 | 69,013 |
| | 2-387 | 69,026 | 69,027 | 69,028 | 69,029 | 69,030 | 69,031 | 69,032 | 69,033 | 69,034 | 69,035 | 69,036 | 69,037 | 69,038 |
| | 2-388 | 69,051 | 69,052 | 69,053 | 69,054 | 69,055 | 69,056 | 69,057 | 69,058 | 69,059 | 69,060 | 69,061 | 69,062 | 69,063 |
| | 2-389 | 69,076 | 69,077 | 69,078 | 69,079 | 69,080 | 69,081 | 69,082 | 69,083 | 69,084 | 69,085 | 69,086 | 69,087 | 69,088 |
| | 2-390 | 69,101 | 69,102 | 69,103 | 69,104 | 69,105 | 69,106 | 69,107 | 69,108 | 69,109 | 69,110 | 69,111 | 69,112 | 69,113 |
| | 2-391 | 69,126 | 69,127 | 69,128 | 69,129 | 69,130 | 69,131 | 69,132 | 69,133 | 69,134 | 69,135 | 69,136 | 69,137 | 69,138 |
| | 2-392 | 69,151 | 69,152 | 69,153 | 69,154 | 69,155 | 69,156 | 69,157 | 69,158 | 69,159 | 69,160 | 69,161 | 69,162 | 69,163 |
| | 2-393 | 69,176 | 69,177 | 69,178 | 69,179 | 69,180 | 69,181 | 69,182 | 69,183 | 69,184 | 69,185 | 69,186 | 69,187 | 69,188 |
| | 2-394 | 69,201 | 69,202 | 69,203 | 69,204 | 69,205 | 69,206 | 69,207 | 69,208 | 69,209 | 69,210 | 69,211 | 69,212 | 69,213 |
| | 2-395 | 69,226 | 69,227 | 69,228 | 69,229 | 69,230 | 69,231 | 69,232 | 69,233 | 69,234 | 69,235 | 69,236 | 69,237 | 69,238 |
| | 2-396 | 69,251 | 69,252 | 69,253 | 69,254 | 69,255 | 69,256 | 69,257 | 69,258 | 69,259 | 69,260 | 69,261 | 69,262 | 69,263 |

TABLE 53-continued

| | | | | | | | | | | | | | |
|---|---|---|---|---|---|---|---|---|---|---|---|---|---|
| 2-397 | 69,276 | 69,277 | 69,278 | 69,279 | 69,280 | 69,281 | 69,282 | 69,283 | 69,284 | 69,285 | 69,286 | 69,287 | 69,288 |
| 2-398 | 69,301 | 69,302 | 69,303 | 69,304 | 69,305 | 69,306 | 69,307 | 69,308 | 69,309 | 69,310 | 69,311 | 69,312 | 69,313 |
| 2-399 | 69,326 | 69,327 | 69,328 | 69,329 | 69,330 | 69,331 | 69,332 | 69,333 | 69,334 | 69,335 | 69,336 | 69,337 | 69,338 |
| 2-400 | 69,351 | 69,352 | 69,353 | 69,354 | 69,355 | 69,356 | 69,357 | 69,358 | 69,359 | 69,360 | 69,361 | 69,362 | 69,363 |
| 2-401 | 69,376 | 69,377 | 69,378 | 69,379 | 69,380 | 69,381 | 69,382 | 69,383 | 69,384 | 69,385 | 69,386 | 69,387 | 69,388 |
| 2-402 | 69,401 | 69,402 | 69,403 | 69,404 | 69,405 | 69,406 | 69,407 | 69,408 | 69,409 | 69,410 | 69,411 | 69,412 | 69,413 |
| 2-403 | 69,426 | 69,427 | 69,428 | 69,429 | 69,430 | 69,431 | 69,432 | 69,433 | 69,434 | 69,435 | 69,436 | 69,437 | 69,438 |
| 2-404 | 69,451 | 69,452 | 69,453 | 69,454 | 69,455 | 69,456 | 69,457 | 69,458 | 69,459 | 69,460 | 69,461 | 69,462 | 69,463 |
| 2-405 | 69,476 | 69,477 | 69,478 | 69,479 | 69,480 | 69,481 | 69,482 | 69,483 | 69,484 | 69,485 | 69,486 | 69,487 | 69,488 |
| 2-406 | 69,501 | 69,502 | 69,503 | 69,504 | 69,505 | 69,506 | 69,507 | 69,508 | 69,509 | 69,510 | 69,511 | 69,512 | 69,513 |
| 2-407 | 69,526 | 69,527 | 69,528 | 69,529 | 69,530 | 69,531 | 69,532 | 69,533 | 69,534 | 69,535 | 69,536 | 69,537 | 69,538 |
| 2-408 | 69,551 | 69,552 | 69,553 | 69,554 | 69,555 | 69,556 | 69,557 | 69,558 | 69,559 | 69,560 | 69,561 | 69,562 | 69,563 |
| 2-409 | 69,576 | 69,577 | 69,578 | 69,579 | 69,580 | 69,581 | 69,582 | 69,583 | 69,584 | 69,585 | 69,586 | 69,587 | 69,588 |
| 2-410 | 69,601 | 69,602 | 69,603 | 69,604 | 69,605 | 69,606 | 69,607 | 69,608 | 69,609 | 69,610 | 69,611 | 69,612 | 69,613 |
| 2-411 | 69,626 | 69,627 | 69,628 | 69,629 | 69,630 | 69,631 | 69,632 | 69,633 | 69,634 | 69,635 | 69,636 | 69,637 | 69,638 |
| 2-412 | 69,651 | 69,652 | 69,653 | 69,654 | 69,655 | 69,656 | 69,657 | 69,658 | 69,659 | 69,660 | 69,661 | 69,662 | 69,663 |
| 2-413 | 69,676 | 69,677 | 69,678 | 69,679 | 69,680 | 69,681 | 69,682 | 69,683 | 69,684 | 69,685 | 69,686 | 69,687 | 69,688 |
| 2-414 | 69,701 | 69,702 | 69,703 | 69,704 | 69,705 | 69,706 | 69,707 | 69,708 | 69,709 | 69,710 | 69,711 | 69,712 | 69,713 |
| 2-415 | 69,726 | 69,727 | 69,728 | 69,729 | 69,730 | 69,731 | 69,732 | 69,733 | 69,734 | 69,735 | 69,736 | 69,737 | 69,738 |
| 2-416 | 69,751 | 69,752 | 69,753 | 69,754 | 69,755 | 69,756 | 69,757 | 69,758 | 69,759 | 69,760 | 69,761 | 69,762 | 69,763 |
| 2-417 | 69,776 | 69,777 | 69,778 | 69,779 | 69,780 | 69,781 | 69,782 | 69,783 | 69,784 | 69,785 | 69,786 | 69,787 | 69,788 |
| 2-418 | 69,801 | 69,802 | 69,803 | 69,804 | 69,805 | 69,806 | 69,807 | 69,808 | 69,809 | 69,810 | 69,811 | 69,812 | 69,813 |
| 2-419 | 69,826 | 69,827 | 69,828 | 69,829 | 69,830 | 69,831 | 69,832 | 69,833 | 69,834 | 69,835 | 69,836 | 69,837 | 69,838 |
| 2-420 | 69,851 | 69,852 | 69,853 | 69,854 | 69,855 | 69,856 | 69,857 | 69,858 | 69,859 | 69,860 | 69,861 | 69,862 | 69,863 |
| 2-421 | 69,876 | 69,877 | 69,878 | 69,879 | 69,880 | 69,881 | 69,882 | 69,883 | 69,884 | 69,885 | 69,886 | 69,887 | 69,888 |
| 2-422 | 69,901 | 69,902 | 69,903 | 69,904 | 69,905 | 69,906 | 69,907 | 69,908 | 69,909 | 69,910 | 69,911 | 69,912 | 69,913 |
| 2-423 | 69,926 | 69,927 | 69,928 | 69,929 | 69,930 | 69,931 | 69,932 | 69,933 | 69,934 | 69,935 | 69,936 | 69,937 | 69,938 |
| 2-424 | 69,951 | 69,952 | 69,953 | 69,954 | 69,955 | 69,956 | 69,957 | 69,958 | 69,959 | 69,960 | 69,961 | 69,962 | 69,963 |
| 2-425 | 69,976 | 69,977 | 69,978 | 69,979 | 69,980 | 69,981 | 69,982 | 69,983 | 69,984 | 69,985 | 69,986 | 69,987 | 69,988 |
| 2-426 | 70,001 | 70,002 | 70,003 | 70,004 | 70,005 | 70,006 | 70,007 | 70,008 | 70,009 | 70,010 | 70,011 | 70,012 | 70,013 |
| 2-427 | 70,026 | 70,027 | 70,028 | 70,029 | 70,030 | 70,031 | 70,032 | 70,033 | 70,034 | 70,035 | 70,036 | 70,037 | 70,038 |
| 2-428 | 70,051 | 70,052 | 70,053 | 70,054 | 70,055 | 70,056 | 70,057 | 70,058 | 70,059 | 70,060 | 70,061 | 70,062 | 70,063 |
| 2-429 | 70,076 | 70,077 | 70,078 | 70,079 | 70,080 | 70,081 | 70,082 | 70,083 | 70,084 | 70,085 | 70,086 | 70,087 | 70,088 |
| 2-430 | 70,101 | 70,102 | 70,103 | 70,104 | 70,105 | 70,106 | 70,107 | 70,108 | 70,109 | 70,110 | 70,111 | 70,112 | 70,113 |
| 2-431 | 70,126 | 70,127 | 70,128 | 70,129 | 70,130 | 70,131 | 70,132 | 70,133 | 70,134 | 70,135 | 70,136 | 70,137 | 70,138 |
| 2-432 | 70,151 | 70,152 | 70,153 | 70,154 | 70,155 | 70,156 | 70,157 | 70,158 | 70,159 | 70,160 | 70,161 | 70,162 | 70,163 |
| 2-433 | 70,176 | 70,177 | 70,178 | 70,179 | 70,180 | 70,181 | 70,182 | 70,183 | 70,184 | 70,185 | 70,186 | 70,187 | 70,188 |
| 2-434 | 70,201 | 70,202 | 70,203 | 70,204 | 70,205 | 70,206 | 70,207 | 70,208 | 70,209 | 70,210 | 70,211 | 70,212 | 70,213 |
| 2-435 | 70,226 | 70,227 | 70,228 | 70,229 | 70,230 | 70,231 | 70,232 | 70,233 | 70,234 | 70,235 | 70,236 | 70,237 | 70,238 |
| 2-436 | 70,251 | 70,252 | 70,253 | 70,254 | 70,255 | 70,256 | 70,257 | 70,258 | 70,259 | 70,260 | 70,261 | 70,262 | 70,263 |
| 2-437 | 70,276 | 70,277 | 70,278 | 70,279 | 70,280 | 70,281 | 70,282 | 70,283 | 70,284 | 70,285 | 70,286 | 70,287 | 70,288 |
| 2-438 | 70,301 | 70,302 | 70,303 | 70,304 | 70,305 | 70,306 | 70,307 | 70,308 | 70,309 | 70,310 | 70,311 | 70,312 | 70,313 |
| 2-439 | 70,326 | 70,327 | 70,328 | 70,329 | 70,330 | 70,331 | 70,332 | 70,333 | 70,334 | 70,335 | 70,336 | 70,337 | 70,338 |
| 2-440 | 70,351 | 70,352 | 70,353 | 70,354 | 70,355 | 70,356 | 70,357 | 70,358 | 70,359 | 70,360 | 70,361 | 70,362 | 70,363 |

| | | Compound represented by the formula (1) | | | | | | | | | | | |
|---|---|---|---|---|---|---|---|---|---|---|---|---|---|
| | | 1-139 | 1-140 | 1-141 | 1-142 | 1-143 | 1-144 | 1-145 | 1-146 | 1-147 | 1-148 | 1-149 | 1-150 |
| Compound represented by the formula (2) | 2-386 | 69,014 | 69,015 | 69,016 | 69,017 | 69,018 | 69,019 | 69,020 | 69,021 | 69,022 | 69,023 | 69,024 | 69,025 |
| | 2-387 | 69,039 | 69,040 | 69,041 | 69,042 | 69,043 | 69,044 | 69,045 | 69,046 | 69,047 | 69,048 | 69,049 | 69,050 |
| | 2-388 | 69,064 | 69,065 | 69,066 | 69,067 | 69,068 | 69,069 | 69,070 | 69,071 | 69,072 | 69,073 | 69,074 | 69,075 |
| | 2-389 | 69,089 | 69,090 | 69,091 | 69,092 | 69,093 | 69,094 | 69,095 | 69,096 | 69,097 | 69,098 | 69,099 | 69,100 |
| | 2-390 | 69,114 | 69,115 | 69,116 | 69,117 | 69,118 | 69,119 | 69,120 | 69,121 | 69,122 | 69,123 | 69,124 | 69,125 |
| | 2-391 | 69,139 | 69,140 | 69,141 | 69,142 | 69,143 | 69,144 | 69,145 | 69,146 | 69,147 | 69,148 | 69,149 | 69,150 |
| | 2-392 | 69,164 | 69,165 | 69,166 | 69,167 | 69,168 | 69,169 | 69,170 | 69,171 | 69,172 | 69,173 | 69,174 | 69,175 |
| | 2-393 | 69,189 | 69,190 | 69,191 | 69,192 | 69,193 | 69,194 | 69,195 | 69,196 | 69,197 | 69,198 | 69,199 | 69,200 |
| | 2-394 | 69,214 | 69,215 | 69,216 | 69,217 | 69,218 | 69,219 | 69,220 | 69,221 | 69,222 | 69,223 | 69,224 | 69,225 |
| | 2-395 | 69,239 | 69,240 | 69,241 | 69,242 | 69,243 | 69,244 | 69,245 | 69,246 | 69,247 | 69,248 | 69,249 | 69,250 |
| | 2-396 | 69,264 | 69,265 | 69,266 | 69,267 | 69,268 | 69,269 | 69,270 | 69,271 | 69,272 | 69,273 | 69,274 | 69,275 |
| | 2-397 | 69,289 | 69,290 | 69,291 | 69,292 | 69,293 | 69,294 | 69,295 | 69,296 | 69,297 | 69,298 | 69,299 | 69,300 |
| | 2-398 | 69,314 | 69,315 | 69,316 | 69,317 | 69,318 | 69,319 | 69,320 | 69,321 | 69,322 | 69,323 | 69,324 | 69,325 |
| | 2-399 | 69,339 | 69,340 | 69,341 | 69,342 | 69,343 | 69,344 | 69,345 | 69,346 | 69,347 | 69,348 | 69,349 | 69,350 |
| | 2-400 | 69,364 | 69,365 | 69,366 | 69,367 | 69,368 | 69,369 | 69,370 | 69,371 | 69,372 | 69,373 | 69,374 | 69,375 |
| | 2-401 | 69,389 | 69,390 | 69,391 | 69,392 | 69,393 | 69,394 | 69,395 | 69,396 | 69,397 | 69,398 | 69,399 | 69,400 |
| | 2-402 | 69,414 | 69,415 | 69,416 | 69,417 | 69,418 | 69,419 | 69,420 | 69,421 | 69,422 | 69,423 | 69,424 | 69,425 |
| | 2-403 | 69,439 | 69,440 | 69,441 | 69,442 | 69,443 | 69,444 | 69,445 | 69,446 | 69,447 | 69,448 | 69,449 | 69,450 |
| | 2-404 | 69,464 | 69,465 | 69,466 | 69,467 | 69,468 | 69,469 | 69,470 | 69,471 | 69,472 | 69,473 | 69,474 | 69,475 |
| | 2-405 | 69,489 | 69,490 | 69,491 | 69,492 | 69,493 | 69,494 | 69,495 | 69,496 | 69,497 | 69,498 | 69,499 | 69,500 |
| | 2-406 | 69,514 | 69,515 | 69,516 | 69,517 | 69,518 | 69,519 | 69,520 | 69,521 | 69,522 | 69,523 | 69,524 | 69,525 |
| | 2-407 | 69,539 | 69,540 | 69,541 | 69,542 | 69,543 | 69,544 | 69,545 | 69,546 | 69,547 | 69,548 | 69,549 | 69,550 |
| | 2-408 | 69,564 | 69,565 | 69,566 | 69,567 | 69,568 | 69,569 | 69,570 | 69,571 | 69,572 | 69,573 | 69,574 | 69,575 |
| | 2-409 | 69,589 | 69,590 | 69,591 | 69,592 | 69,593 | 69,594 | 69,595 | 69,596 | 69,597 | 69,598 | 69,599 | 69,600 |
| | 2-410 | 69,614 | 69,615 | 69,616 | 69,617 | 69,618 | 69,619 | 69,620 | 69,621 | 69,622 | 69,623 | 69,624 | 69,625 |
| | 2-411 | 69,639 | 69,640 | 69,641 | 69,642 | 69,643 | 69,644 | 69,645 | 69,646 | 69,647 | 69,648 | 69,649 | 69,650 |
| | 2-412 | 69,664 | 69,665 | 69,666 | 69,667 | 69,668 | 69,669 | 69,670 | 69,671 | 69,672 | 69,673 | 69,674 | 69,675 |
| | 2-413 | 69,689 | 69,690 | 69,691 | 69,692 | 69,693 | 69,694 | 69,695 | 69,696 | 69,697 | 69,698 | 69,699 | 69,700 |
| | 2-414 | 69,714 | 69,715 | 69,716 | 69,717 | 69,718 | 69,719 | 69,720 | 69,721 | 69,722 | 69,723 | 69,724 | 69,725 |
| | 2-415 | 69,739 | 69,740 | 69,741 | 69,742 | 69,743 | 69,744 | 69,745 | 69,746 | 69,747 | 69,748 | 69,749 | 69,750 |
| | 2-416 | 69,764 | 69,765 | 69,766 | 69,767 | 69,768 | 69,769 | 69,770 | 69,771 | 69,772 | 69,773 | 69,774 | 69,775 |

TABLE 53-continued

| | | | | | | | | | | | | | |
|---|---|---|---|---|---|---|---|---|---|---|---|---|---|
| | 2-417 | 69,789 | 69,790 | 69,791 | 69,792 | 69,793 | 69,794 | 69,795 | 69,796 | 69,797 | 69,798 | 69,799 | 69,800 |
| | 2-418 | 69,814 | 69,815 | 69,816 | 69,817 | 69,818 | 69,819 | 69,820 | 69,821 | 69,822 | 69,823 | 69,824 | 69,825 |
| | 2-419 | 69,839 | 69,840 | 69,841 | 69,842 | 69,843 | 69,844 | 69,845 | 69,846 | 69,847 | 69,848 | 69,849 | 69,850 |
| | 2-420 | 69,864 | 69,865 | 69,866 | 69,867 | 69,868 | 69,869 | 69,870 | 69,871 | 69,872 | 69,873 | 69,874 | 69,875 |
| | 2-421 | 69,889 | 69,890 | 69,891 | 69,892 | 69,893 | 69,894 | 69,895 | 69,896 | 69,897 | 69,898 | 69,899 | 69,900 |
| | 2-422 | 69,914 | 69,915 | 69,916 | 69,917 | 69,918 | 69,919 | 69,920 | 69,921 | 69,922 | 69,923 | 69,924 | 69,925 |
| | 2-423 | 69,939 | 69,940 | 69,941 | 69,942 | 69,943 | 69,944 | 69,945 | 69,946 | 69,947 | 69,948 | 69,949 | 69,950 |
| | 2-424 | 69,964 | 69,965 | 69,966 | 69,967 | 69,968 | 69,969 | 69,970 | 69,971 | 69,972 | 69,973 | 69,974 | 69,975 |
| | 2-425 | 69,989 | 69,990 | 69,991 | 69,992 | 69,993 | 69,994 | 69,995 | 69,996 | 69,997 | 69,998 | 69,999 | 70,000 |
| | 2-426 | 70,014 | 70,015 | 70,016 | 70,017 | 70,018 | 70,019 | 70,020 | 70,021 | 70,022 | 70,023 | 70,024 | 70,025 |
| | 2-427 | 70,039 | 70,040 | 70,041 | 70,042 | 70,043 | 70,044 | 70,045 | 70,046 | 70,047 | 70,048 | 70,049 | 70,050 |
| | 2-428 | 70,064 | 70,065 | 70,066 | 70,067 | 70,068 | 70,069 | 70,070 | 70,071 | 70,072 | 70,073 | 70,074 | 70,075 |
| | 2-429 | 70,089 | 70,090 | 70,091 | 70,092 | 70,093 | 70,094 | 70,095 | 70,096 | 70,097 | 70,098 | 70,099 | 70,100 |
| | 2-430 | 70,114 | 70,115 | 70,116 | 70,117 | 70,118 | 70,119 | 70,120 | 70,121 | 70,122 | 70,123 | 70,124 | 70,125 |
| | 2-431 | 70,139 | 70,140 | 70,141 | 70,142 | 70,143 | 70,144 | 70,145 | 70,146 | 70,147 | 70,148 | 70,149 | 70,150 |
| | 2-432 | 70,164 | 70,165 | 70,166 | 70,167 | 70,168 | 70,169 | 70,170 | 70,171 | 70,172 | 70,173 | 70,174 | 70,175 |
| | 2-433 | 70,189 | 70,190 | 70,191 | 70,192 | 70,193 | 70,194 | 70,195 | 70,196 | 70,197 | 70,198 | 70,199 | 70,200 |
| | 2-434 | 70,214 | 70,215 | 70,216 | 70,217 | 70,218 | 70,219 | 70,220 | 70,221 | 70,222 | 70,223 | 70,224 | 70,225 |
| | 2-435 | 70,239 | 70,240 | 70,241 | 70,242 | 70,243 | 70,244 | 70,245 | 70,246 | 70,247 | 70,248 | 70,249 | 70,250 |
| | 2-436 | 70,264 | 70,265 | 70,266 | 70,267 | 70,268 | 70,269 | 70,270 | 70,271 | 70,272 | 70,273 | 70,274 | 70,275 |
| | 2-437 | 70,289 | 70,290 | 70,291 | 70,292 | 70,293 | 70,294 | 70,295 | 70,296 | 70,297 | 70,298 | 70,299 | 70,300 |
| | 2-438 | 70,314 | 70,315 | 70,316 | 70,317 | 70,318 | 70,319 | 70,320 | 70,321 | 70,322 | 70,323 | 70,324 | 70,325 |
| | 2-439 | 70,339 | 70,340 | 70,341 | 70,342 | 70,343 | 70,344 | 70,345 | 70,346 | 70,347 | 70,348 | 70,349 | 70,350 |
| | 2-440 | 70,364 | 70,365 | 70,366 | 70,367 | 70,368 | 70,369 | 70,370 | 70,371 | 70,372 | 70,373 | 70,374 | 70,375 |

TABLE 54

| | | Compound represented by the formula (1) | | | | | | | | | | | | |
|---|---|---|---|---|---|---|---|---|---|---|---|---|---|---|
| | | 1-126 | 1-127 | 1-128 | 1-129 | 1-130 | 1-131 | 1-132 | 1-133 | 1-134 | 1-135 | 1-136 | 1-137 | 1-138 |
| Compound represented by the formula (2) | 2-441 | 70,376 | 70,377 | 70,378 | 70,379 | 70,380 | 70,381 | 70,382 | 70,383 | 70,384 | 70,385 | 70,386 | 70,387 | 70,388 |
| | 2-442 | 70,401 | 70,402 | 70,403 | 70,404 | 70,405 | 70,406 | 70,407 | 70,408 | 70,409 | 70,410 | 70,411 | 70,412 | 70,413 |
| | 2-443 | 70,426 | 70,427 | 70,428 | 70,429 | 70,430 | 70,431 | 70,432 | 70,433 | 70,434 | 70,435 | 70,436 | 70,437 | 70,438 |
| | 2-444 | 70,451 | 70,452 | 70,453 | 70,454 | 70,455 | 70,456 | 70,457 | 70,458 | 70,459 | 70,460 | 70,461 | 70,462 | 70,463 |
| | 2-445 | 70,476 | 70,477 | 70,478 | 70,479 | 70,480 | 70,481 | 70,482 | 70,483 | 70,484 | 70,485 | 70,486 | 70,487 | 70,488 |
| | 2-446 | 70,501 | 70,502 | 70,503 | 70,504 | 70,505 | 70,506 | 70,507 | 70,508 | 70,509 | 70,510 | 70,511 | 70,512 | 70,513 |
| | 2-447 | 70,526 | 70,527 | 70,528 | 70,529 | 70,530 | 70,531 | 70,532 | 70,533 | 70,534 | 70,535 | 70,536 | 70,537 | 70,538 |
| | 2-448 | 70,551 | 70,552 | 70,553 | 70,554 | 70,555 | 70,556 | 70,557 | 70,558 | 70,559 | 70,560 | 70,561 | 70,562 | 70,563 |
| | 2-449 | 70,576 | 70,577 | 70,578 | 70,579 | 70,580 | 70,581 | 70,582 | 70,583 | 70,584 | 70,585 | 70,586 | 70,587 | 70,588 |
| | 2-450 | 70,601 | 70,602 | 70,603 | 70,604 | 70,605 | 70,606 | 70,607 | 70,608 | 70,609 | 70,610 | 70,611 | 70,612 | 70,613 |
| | 2-451 | 70,626 | 70,627 | 70,628 | 70,629 | 70,630 | 70,631 | 70,632 | 70,633 | 70,634 | 70,635 | 70,636 | 70,637 | 70,638 |
| | 2-452 | 70,651 | 70,652 | 70,653 | 70,654 | 70,655 | 70,656 | 70,657 | 70,658 | 70,659 | 70,660 | 70,661 | 70,662 | 70,663 |
| | 2-453 | 70,676 | 70,677 | 70,678 | 70,679 | 70,680 | 70,681 | 70,682 | 70,683 | 70,684 | 70,685 | 70,686 | 70,687 | 70,688 |
| | 2-454 | 70,701 | 70,702 | 70,703 | 70,704 | 70,705 | 70,706 | 70,707 | 70,708 | 70,709 | 70,710 | 70,711 | 70,712 | 70,713 |
| | 2-455 | 70,726 | 70,727 | 70,728 | 70,729 | 70,730 | 70,731 | 70,732 | 70,733 | 70,734 | 70,735 | 70,736 | 70,737 | 70,738 |
| | 2-456 | 70,751 | 70,752 | 70,753 | 70,754 | 70,755 | 70,756 | 70,757 | 70,758 | 70,759 | 70,760 | 70,761 | 70,762 | 70,763 |
| | 2-457 | 70,776 | 70,777 | 70,778 | 70,779 | 70,780 | 70,781 | 70,782 | 70,783 | 70,784 | 70,785 | 70,786 | 70,787 | 70,788 |
| | 2-458 | 70,801 | 70,802 | 70,803 | 70,804 | 70,805 | 70,806 | 70,807 | 70,808 | 70,809 | 70,810 | 70,811 | 70,812 | 70,813 |
| | 2-459 | 70,826 | 70,827 | 70,828 | 70,829 | 70,830 | 70,831 | 70,832 | 70,833 | 70,834 | 70,835 | 70,836 | 70,837 | 70,838 |
| | 2-460 | 70,851 | 70,852 | 70,853 | 70,854 | 70,855 | 70,856 | 70,857 | 70,858 | 70,859 | 70,860 | 70,861 | 70,862 | 70,863 |
| | 2-461 | 70,876 | 70,877 | 70,878 | 70,879 | 70,880 | 70,881 | 70,882 | 70,883 | 70,884 | 70,885 | 70,886 | 70,887 | 70,888 |
| | 2-462 | 70,901 | 70,902 | 70,903 | 70,904 | 70,905 | 70,906 | 70,907 | 70,908 | 70,909 | 70,910 | 70,911 | 70,912 | 70,913 |
| | 2-463 | 70,926 | 70,927 | 70,928 | 70,929 | 70,930 | 70,931 | 70,932 | 70,933 | 70,934 | 70,935 | 70,936 | 70,937 | 70,938 |
| | 2-464 | 70,951 | 70,952 | 70,953 | 70,954 | 70,955 | 70,956 | 70,957 | 70,958 | 70,959 | 70,960 | 70,961 | 70,962 | 70,963 |
| | 2-465 | 70,976 | 70,977 | 70,978 | 70,979 | 70,980 | 70,981 | 70,982 | 70,983 | 70,984 | 70,985 | 70,986 | 70,987 | 70,988 |
| | 2-466 | 71,001 | 71,002 | 71,003 | 71,004 | 71,005 | 71,006 | 71,007 | 71,008 | 71,009 | 71,010 | 71,011 | 71,012 | 71,013 |
| | 2-467 | 71,026 | 71,027 | 71,028 | 71,029 | 71,030 | 71,031 | 71,032 | 71,033 | 71,034 | 71,035 | 71,036 | 71,037 | 71,038 |
| | 2-468 | 71,051 | 71,052 | 71,053 | 71,054 | 71,055 | 71,056 | 71,057 | 71,058 | 71,059 | 71,060 | 71,061 | 71,062 | 71,063 |
| | 2-469 | 71,076 | 71,077 | 71,078 | 71,079 | 71,080 | 71,081 | 71,082 | 71,083 | 71,084 | 71,085 | 71,086 | 71,087 | 71,088 |
| | 2-470 | 71,101 | 71,102 | 71,103 | 71,104 | 71,105 | 71,106 | 71,107 | 71,108 | 71,109 | 71,110 | 71,111 | 71,112 | 71,113 |
| | 2-471 | 71,126 | 71,127 | 71,128 | 71,129 | 71,130 | 71,131 | 71,132 | 71,133 | 71,134 | 71,135 | 71,136 | 71,137 | 71,138 |
| | 2-472 | 71,151 | 71,152 | 71,153 | 71,154 | 71,155 | 71,156 | 71,157 | 71,158 | 71,159 | 71,160 | 71,161 | 71,162 | 71,163 |
| | 2-473 | 71,176 | 71,177 | 71,178 | 71,179 | 71,180 | 71,181 | 71,182 | 71,183 | 71,184 | 71,185 | 71,186 | 71,187 | 71,188 |
| | 2-474 | 71,201 | 71,202 | 71,203 | 71,204 | 71,205 | 71,206 | 71,207 | 71,208 | 71,209 | 71,210 | 71,211 | 71,212 | 71,213 |
| | 2-475 | 71,226 | 71,227 | 71,228 | 71,229 | 71,230 | 71,231 | 71,232 | 71,233 | 71,234 | 71,235 | 71,236 | 71,237 | 71,238 |

| | | Compound represented by the formula (1) | | | | | | | | | | | |
|---|---|---|---|---|---|---|---|---|---|---|---|---|---|
| | | 1-139 | 1-140 | 1-141 | 1-142 | 1-143 | 1-144 | 1-145 | 1-146 | 1-147 | 1-148 | 1-149 | 1-150 |
| Compound represented by the formula (2) | 2-441 | 70,389 | 70,390 | 70,391 | 70,392 | 70,393 | 70,394 | 70,395 | 70,396 | 70,397 | 70,398 | 70,399 | 70,400 |
| | 2-442 | 70,414 | 70,415 | 70,416 | 70,417 | 70,418 | 70,419 | 70,420 | 70,421 | 70,422 | 70,423 | 70,424 | 70,425 |
| | 2-443 | 70,439 | 70,440 | 70,441 | 70,442 | 70,443 | 70,444 | 70,445 | 70,446 | 70,447 | 70,448 | 70,449 | 70,450 |
| | 2-444 | 70,464 | 70,465 | 70,466 | 70,467 | 70,468 | 70,469 | 70,470 | 70,471 | 70,472 | 70,473 | 70,474 | 70,475 |
| | 2-445 | 70,489 | 70,490 | 70,491 | 70,492 | 70,493 | 70,494 | 70,495 | 70,496 | 70,497 | 70,498 | 70,499 | 70,500 |
| | 2-446 | 70,514 | 70,515 | 70,516 | 70,517 | 70,518 | 70,519 | 70,520 | 70,521 | 70,522 | 70,523 | 70,524 | 70,525 |

TABLE 54-continued

| | | | | | | | | | | | | |
|---|---|---|---|---|---|---|---|---|---|---|---|---|
| 2-447 | 70,539 | 70,540 | 70,541 | 70,542 | 70,543 | 70,544 | 70,545 | 70,546 | 70,547 | 70,548 | 70,549 | 70,550 |
| 2-448 | 70,564 | 70,565 | 70,566 | 70,567 | 70,568 | 70,569 | 70,570 | 70,571 | 70,572 | 70,573 | 70,574 | 70,575 |
| 2-449 | 70,589 | 70,590 | 70,591 | 70,592 | 70,593 | 70,594 | 70,595 | 70,596 | 70,597 | 70,598 | 70,599 | 70,600 |
| 2-450 | 70,614 | 70,615 | 70,616 | 70,617 | 70,618 | 70,619 | 70,620 | 70,621 | 70,622 | 70,623 | 70,624 | 70,625 |
| 2-451 | 70,639 | 70,640 | 70,641 | 70,642 | 70,643 | 70,644 | 70,645 | 70,646 | 70,647 | 70,648 | 70,649 | 70,650 |
| 2-452 | 70,664 | 70,665 | 70,666 | 70,667 | 70,668 | 70,669 | 70,670 | 70,671 | 70,672 | 70,673 | 70,674 | 70,675 |
| 2-453 | 70,689 | 70,690 | 70,691 | 70,692 | 70,693 | 70,694 | 70,695 | 70,696 | 70,697 | 70,698 | 70,699 | 70,700 |
| 2-454 | 70,714 | 70,715 | 70,716 | 70,717 | 70,718 | 70,719 | 70,720 | 70,721 | 70,722 | 70,723 | 70,724 | 70,725 |
| 2-455 | 70,739 | 70,740 | 70,741 | 70,742 | 70,743 | 70,744 | 70,745 | 70,746 | 70,747 | 70,748 | 70,749 | 70,750 |
| 2-456 | 70,764 | 70,765 | 70,766 | 70,767 | 70,768 | 70,769 | 70,770 | 70,771 | 70,772 | 70,773 | 70,774 | 70,775 |
| 2-457 | 70,789 | 70,790 | 70,791 | 70,792 | 70,793 | 70,794 | 70,795 | 70,796 | 70,797 | 70,798 | 70,799 | 70,800 |
| 2-458 | 70,814 | 70,815 | 70,816 | 70,817 | 70,818 | 70,819 | 70,820 | 70,821 | 70,822 | 70,823 | 70,824 | 70,825 |
| 2-459 | 70,839 | 70,840 | 70,841 | 70,842 | 70,843 | 70,844 | 70,845 | 70,846 | 70,847 | 70,848 | 70,849 | 70,850 |
| 2-460 | 70,864 | 70,865 | 70,866 | 70,867 | 70,868 | 70,869 | 70,870 | 70,871 | 70,872 | 70,873 | 70,874 | 70,875 |
| 2-461 | 70,889 | 70,890 | 70,891 | 70,892 | 70,893 | 70,894 | 70,895 | 70,896 | 70,897 | 70,898 | 70,899 | 70,900 |
| 2-462 | 70,914 | 70,915 | 70,916 | 70,917 | 70,918 | 70,919 | 70,920 | 70,921 | 70,922 | 70,923 | 70,924 | 70,925 |
| 2-463 | 70,939 | 70,940 | 70,941 | 70,942 | 70,943 | 70,944 | 70,945 | 70,946 | 70,947 | 70,948 | 70,949 | 70,950 |
| 2-464 | 70,964 | 70,965 | 70,966 | 70,967 | 70,968 | 70,969 | 70,970 | 70,971 | 70,972 | 70,973 | 70,974 | 70,975 |
| 2-465 | 70,989 | 70,990 | 70,991 | 70,992 | 70,993 | 70,994 | 70,995 | 70,996 | 70,997 | 70,998 | 70,999 | 71,000 |
| 2-466 | 71,014 | 71,015 | 71,016 | 71,017 | 71,018 | 71,019 | 71,020 | 71,021 | 71,022 | 71,023 | 71,024 | 71,025 |
| 2-467 | 71,039 | 71,040 | 71,041 | 71,042 | 71,043 | 71,044 | 71,045 | 71,046 | 71,047 | 71,048 | 71,049 | 71,050 |
| 2-468 | 71,064 | 71,065 | 71,066 | 71,067 | 71,068 | 71,069 | 71,070 | 71,071 | 71,072 | 71,073 | 71,074 | 71,075 |
| 2-469 | 71,089 | 71,090 | 71,091 | 71,092 | 71,093 | 71,094 | 71,095 | 71,096 | 71,097 | 71,098 | 71,099 | 71,100 |
| 2-470 | 71,114 | 71,115 | 71,116 | 71,117 | 71,118 | 71,119 | 71,120 | 71,121 | 71,122 | 71,123 | 71,124 | 71,125 |
| 2-471 | 71,139 | 71,140 | 71,141 | 71,142 | 71,143 | 71,144 | 71,145 | 71,146 | 71,147 | 71,148 | 71,149 | 71,150 |
| 2-472 | 71,164 | 71,165 | 71,166 | 71,167 | 71,168 | 71,169 | 71,170 | 71,171 | 71,172 | 71,173 | 71,174 | 71,175 |
| 2-473 | 71,189 | 71,190 | 71,191 | 71,192 | 71,193 | 71,194 | 71,195 | 71,196 | 71,197 | 71,198 | 71,199 | 71,200 |
| 2-474 | 71,214 | 71,215 | 71,216 | 71,217 | 71,218 | 71,219 | 71,220 | 71,221 | 71,222 | 71,223 | 71,224 | 71,225 |
| 2-475 | 71,239 | 71,240 | 71,241 | 71,242 | 71,243 | 71,244 | 71,245 | 71,246 | 71,247 | 71,248 | 71,249 | 71,250 |

TABLE 55

| | | Compound represented by the formula (1) | | | | | | | | | | | | |
|---|---|---|---|---|---|---|---|---|---|---|---|---|---|---|
| | | 1-151 | 1-152 | 1-153 | 1-154 | 1-155 | 1-156 | 1-157 | 1-158 | 1-159 | 1-160 | 1-161 | 1-162 | 1-163 |
| Compound represented by the formula (2) | 2-1 | 71,251 | 71,252 | 71,253 | 71,254 | 71,255 | 71,256 | 71,257 | 71,258 | 71,259 | 71,260 | 71,261 | 71,262 | 71,263 |
| | 2-2 | 71,276 | 71,277 | 71,278 | 71,279 | 71,280 | 71,281 | 71,282 | 71,283 | 71,284 | 71,285 | 71,286 | 71,287 | 71,288 |
| | 2-3 | 71,301 | 71,302 | 71,303 | 71,304 | 71,305 | 71,306 | 71,307 | 71,308 | 71,309 | 71,310 | 71,311 | 71,312 | 71,313 |
| | 2-4 | 71,326 | 71,327 | 71,328 | 71,329 | 71,330 | 71,331 | 71,332 | 71,333 | 71,334 | 71,335 | 71,336 | 71,337 | 71,338 |
| | 2-5 | 71,351 | 71,352 | 71,353 | 71,354 | 71,355 | 71,356 | 71,357 | 71,358 | 71,359 | 71,360 | 71,361 | 71,362 | 71,363 |
| | 2-6 | 71,376 | 71,377 | 71,378 | 71,379 | 71,380 | 71,381 | 71,382 | 71,383 | 71,384 | 71,385 | 71,386 | 71,387 | 71,388 |
| | 2-7 | 71,401 | 71,402 | 71,403 | 71,404 | 71,405 | 71,406 | 71,407 | 71,408 | 71,409 | 71,410 | 71,411 | 71,412 | 71,413 |
| | 2-8 | 71,426 | 71,427 | 71,428 | 71,429 | 71,430 | 71,431 | 71,432 | 71,433 | 71,434 | 71,435 | 71,436 | 71,437 | 71,438 |
| | 2-9 | 71,451 | 71,452 | 71,453 | 71,454 | 71,455 | 71,456 | 71,457 | 71,458 | 71,459 | 71,460 | 71,461 | 71,462 | 71,463 |
| | 2-10 | 71,476 | 71,477 | 71,478 | 71,479 | 71,480 | 71,481 | 71,482 | 71,483 | 71,484 | 71,485 | 71,486 | 71,487 | 71,488 |
| | 2-11 | 71,501 | 71,502 | 71,503 | 71,504 | 71,505 | 71,506 | 71,507 | 71,508 | 71,509 | 71,510 | 71,511 | 71,512 | 71,513 |
| | 2-12 | 71,526 | 71,527 | 71,528 | 71,529 | 71,530 | 71,531 | 71,532 | 71,533 | 71,534 | 71,535 | 71,536 | 71,537 | 71,538 |
| | 2-13 | 71,551 | 71,552 | 71,553 | 71,554 | 71,555 | 71,556 | 71,557 | 71,558 | 71,559 | 71,560 | 71,561 | 71,562 | 71,563 |
| | 2-14 | 71,576 | 71,577 | 71,578 | 71,579 | 71,580 | 71,581 | 71,582 | 71,583 | 71,584 | 71,585 | 71,586 | 71,587 | 71,588 |
| | 2-15 | 71,601 | 71,602 | 71,603 | 71,604 | 71,605 | 71,606 | 71,607 | 71,608 | 71,609 | 71,610 | 71,611 | 71,612 | 71,613 |
| | 2-16 | 71,626 | 71,627 | 71,628 | 71,629 | 71,630 | 71,631 | 71,632 | 71,633 | 71,634 | 71,635 | 71,636 | 71,637 | 71,638 |
| | 2-17 | 71,651 | 71,652 | 71,653 | 71,654 | 71,655 | 71,656 | 71,657 | 71,658 | 71,659 | 71,660 | 71,661 | 71,662 | 71,663 |
| | 2-18 | 71,676 | 71,677 | 71,678 | 71,679 | 71,680 | 71,681 | 71,682 | 71,683 | 71,684 | 71,685 | 71,686 | 71,687 | 71,688 |
| | 2-19 | 71,701 | 71,702 | 71,703 | 71,704 | 71,705 | 71,706 | 71,707 | 71,708 | 71,709 | 71,710 | 71,711 | 71,712 | 71,713 |
| | 2-20 | 71,726 | 71,727 | 71,728 | 71,729 | 71,730 | 71,731 | 71,732 | 71,733 | 71,734 | 71,735 | 71,736 | 71,737 | 71,738 |
| | 2-21 | 71,751 | 71,752 | 71,753 | 71,754 | 71,755 | 71,756 | 71,757 | 71,758 | 71,759 | 71,760 | 71,761 | 71,762 | 71,763 |
| | 2-22 | 71,776 | 71,777 | 71,778 | 71,779 | 71,780 | 71,781 | 71,782 | 71,783 | 71,784 | 71,785 | 71,786 | 71,787 | 71,788 |
| | 2-23 | 71,801 | 71,802 | 71,803 | 71,804 | 71,805 | 71,806 | 71,807 | 71,808 | 71,809 | 71,810 | 71,811 | 71,812 | 71,813 |
| | 2-24 | 71,826 | 71,827 | 71,828 | 71,829 | 71,830 | 71,831 | 71,832 | 71,833 | 71,834 | 71,835 | 71,836 | 71,837 | 71,838 |
| | 2-25 | 71,851 | 71,852 | 71,853 | 71,854 | 71,855 | 71,856 | 71,857 | 71,858 | 71,859 | 71,860 | 71,861 | 71,862 | 71,863 |
| | 2-26 | 71,876 | 71,877 | 71,878 | 71,879 | 71,880 | 71,881 | 71,882 | 71,883 | 71,884 | 71,885 | 71,886 | 71,887 | 71,888 |
| | 2-27 | 71,901 | 71,902 | 71,903 | 71,904 | 71,905 | 71,906 | 71,907 | 71,908 | 71,909 | 71,910 | 71,911 | 71,912 | 71,913 |
| | 2-28 | 71,926 | 71,927 | 71,928 | 71,929 | 71,930 | 71,931 | 71,932 | 71,933 | 71,934 | 71,935 | 71,936 | 71,937 | 71,938 |
| | 2-29 | 71,951 | 71,952 | 71,953 | 71,954 | 71,955 | 71,956 | 71,957 | 71,958 | 71,959 | 71,960 | 71,961 | 71,962 | 71,963 |
| | 2-30 | 71,976 | 71,977 | 71,978 | 71,979 | 71,980 | 71,981 | 71,982 | 71,983 | 71,984 | 71,985 | 71,986 | 71,987 | 71,988 |
| | 2-31 | 72,001 | 72,002 | 72,003 | 72,004 | 72,005 | 72,006 | 72,007 | 72,008 | 72,009 | 72,010 | 72,011 | 72,012 | 72,013 |
| | 2-32 | 72,026 | 72,027 | 72,028 | 72,029 | 72,030 | 72,031 | 72,032 | 72,033 | 72,034 | 72,035 | 72,036 | 72,037 | 72,038 |
| | 2-33 | 72,051 | 72,052 | 72,053 | 72,054 | 72,055 | 72,056 | 72,057 | 72,058 | 72,059 | 72,060 | 72,061 | 72,062 | 72,063 |
| | 2-34 | 72,076 | 72,077 | 72,078 | 72,079 | 72,080 | 72,081 | 72,082 | 72,083 | 72,084 | 72,085 | 72,086 | 72,087 | 72,088 |
| | 2-35 | 72,101 | 72,102 | 72,103 | 72,104 | 72,105 | 72,106 | 72,107 | 72,108 | 72,109 | 72,110 | 72,111 | 72,112 | 72,113 |
| | 2-36 | 72,126 | 72,127 | 72,128 | 72,129 | 72,130 | 72,131 | 72,132 | 72,133 | 72,134 | 72,135 | 72,136 | 72,137 | 72,138 |
| | 2-37 | 72,151 | 72,152 | 72,153 | 72,154 | 72,155 | 72,156 | 72,157 | 72,158 | 72,159 | 72,160 | 72,161 | 72,162 | 72,163 |
| | 2-38 | 72,176 | 72,177 | 72,178 | 72,179 | 72,180 | 72,181 | 72,182 | 72,183 | 72,184 | 72,185 | 72,186 | 72,187 | 72,188 |
| | 2-39 | 72,201 | 72,202 | 72,203 | 72,204 | 72,205 | 72,206 | 72,207 | 72,208 | 72,209 | 72,210 | 72,211 | 72,212 | 72,213 |
| | 2-40 | 72,226 | 72,227 | 72,228 | 72,229 | 72,230 | 72,231 | 72,232 | 72,233 | 72,234 | 72,235 | 72,236 | 72,237 | 72,238 |
| | 2-41 | 72,251 | 72,252 | 72,253 | 72,254 | 72,255 | 72,256 | 72,257 | 72,258 | 72,259 | 72,260 | 72,261 | 72,262 | 72,263 |

TABLE 55-continued

| | | | | | | | | | | | | | | |
|---|---|---|---|---|---|---|---|---|---|---|---|---|---|---|
| | 2-42 | 72,276 | 72,277 | 72,278 | 72,279 | 72,280 | 72,281 | 72,282 | 72,283 | 72,284 | 72,285 | 72,286 | 72,287 | 72,288 |
| | 2-43 | 72,301 | 72,302 | 72,303 | 72,304 | 72,305 | 72,306 | 72,307 | 72,308 | 72,309 | 72,310 | 72,311 | 72,312 | 72,313 |
| | 2-44 | 72,326 | 72,327 | 72,328 | 72,329 | 72,330 | 72,331 | 72,332 | 72,333 | 72,334 | 72,335 | 72,336 | 72,337 | 72,338 |
| | 2-45 | 72,351 | 72,352 | 72,353 | 72,354 | 72,355 | 72,356 | 72,357 | 72,358 | 72,359 | 72,360 | 72,361 | 72,362 | 72,363 |
| | 2-46 | 72,376 | 72,377 | 72,378 | 72,379 | 72,380 | 72,381 | 72,382 | 72,383 | 72,384 | 72,385 | 72,386 | 72,387 | 72,388 |
| | 2-47 | 72,401 | 72,402 | 72,403 | 72,404 | 72,405 | 72,406 | 72,407 | 72,408 | 72,409 | 72,410 | 72,411 | 72,412 | 72,413 |
| | 2-48 | 72,426 | 72,427 | 72,428 | 72,429 | 72,430 | 72,431 | 72,432 | 72,433 | 72,434 | 72,435 | 72,436 | 72,437 | 72,438 |
| | 2-49 | 72,451 | 72,452 | 72,453 | 72,454 | 72,455 | 72,456 | 72,457 | 72,458 | 72,459 | 72,460 | 72,461 | 72,462 | 72,463 |
| | 2-50 | 72,476 | 72,477 | 72,478 | 72,479 | 72,480 | 72,481 | 72,482 | 72,483 | 72,484 | 72,485 | 72,486 | 72,487 | 72,488 |
| | 2-51 | 72,501 | 72,502 | 72,503 | 72,504 | 72,505 | 72,506 | 72,507 | 72,508 | 72,509 | 72,510 | 72,511 | 72,512 | 72,513 |
| | 2-52 | 72,526 | 72,527 | 72,528 | 72,529 | 72,530 | 72,531 | 72,532 | 72,533 | 72,534 | 72,535 | 72,536 | 72,537 | 72,538 |
| | 2-53 | 72,551 | 72,552 | 72,553 | 72,554 | 72,555 | 72,556 | 72,557 | 72,558 | 72,559 | 72,560 | 72,561 | 72,562 | 72,563 |
| | 2-54 | 72,576 | 72,577 | 72,578 | 72,579 | 72,580 | 72,581 | 72,582 | 72,583 | 72,584 | 72,585 | 72,586 | 72,587 | 72,588 |
| | 2-55 | 72,601 | 72,602 | 72,603 | 72,604 | 72,605 | 72,606 | 72,607 | 72,608 | 72,609 | 72,610 | 72,611 | 72,612 | 72,613 |

| | | Compound represented by the formula (1) | | | | | | | | | | | |
|---|---|---|---|---|---|---|---|---|---|---|---|---|---|
| | | 1-164 | 1-165 | 1-166 | 1-167 | 1-168 | 1-169 | 1-170 | 1-171 | 1-172 | 1-173 | 1-174 | 1-175 |
| Compound represented by the formula (2) | 2-1 | 71,264 | 71,265 | 71,266 | 71,267 | 71,268 | 71,269 | 71,270 | 71,271 | 71,272 | 71,273 | 71,274 | 71,275 |
| | 2-2 | 71,289 | 71,290 | 71,291 | 71,292 | 71,293 | 71,294 | 71,295 | 71,296 | 71,297 | 71,298 | 71,299 | 71,300 |
| | 2-3 | 71,314 | 71,315 | 71,316 | 71,317 | 71,318 | 71,319 | 71,320 | 71,321 | 71,322 | 71,323 | 71,324 | 71,325 |
| | 2-4 | 71,339 | 71,340 | 71,341 | 71,342 | 71,343 | 71,344 | 71,345 | 71,346 | 71,347 | 71,348 | 71,349 | 71,350 |
| | 2-5 | 71,364 | 71,365 | 71,366 | 71,367 | 71,368 | 71,369 | 71,370 | 71,371 | 71,372 | 71,373 | 71,374 | 71,375 |
| | 2-6 | 71,389 | 71,390 | 71,391 | 71,392 | 71,393 | 71,394 | 71,395 | 71,396 | 71,397 | 71,398 | 71,399 | 71,400 |
| | 2-7 | 71,414 | 71,415 | 71,416 | 71,417 | 71,418 | 71,419 | 71,420 | 71,421 | 71,422 | 71,423 | 71,424 | 71,425 |
| | 2-8 | 71,439 | 71,440 | 71,441 | 71,442 | 71,443 | 71,444 | 71,445 | 71,446 | 71,447 | 71,448 | 71,449 | 71,450 |
| | 2-9 | 71,464 | 71,465 | 71,466 | 71,467 | 71,468 | 71,469 | 71,470 | 71,471 | 71,472 | 71,473 | 71,474 | 71,475 |
| | 2-10 | 71,489 | 71,490 | 71,491 | 71,492 | 71,493 | 71,494 | 71,495 | 71,496 | 71,497 | 71,498 | 71,499 | 71,500 |
| | 2-11 | 71,514 | 71,515 | 71,516 | 71,517 | 71,518 | 71,519 | 71,520 | 71,521 | 71,522 | 71,523 | 71,524 | 71,525 |
| | 2-12 | 71,539 | 71,540 | 71,541 | 71,542 | 71,543 | 71,544 | 71,545 | 71,546 | 71,547 | 71,548 | 71,549 | 71,550 |
| | 2-13 | 71,564 | 71,565 | 71,566 | 71,567 | 71,568 | 71,569 | 71,570 | 71,571 | 71,572 | 71,573 | 71,574 | 71,575 |
| | 2-14 | 71,589 | 71,590 | 71,591 | 71,592 | 71,593 | 71,594 | 71,595 | 71,596 | 71,597 | 71,598 | 71,599 | 71,600 |
| | 2-15 | 71,614 | 71,615 | 71,616 | 71,617 | 71,618 | 71,619 | 71,620 | 71,621 | 71,622 | 71,623 | 71,624 | 71,625 |
| | 2-16 | 71,639 | 71,640 | 71,641 | 71,642 | 71,643 | 71,644 | 71,645 | 71,646 | 71,647 | 71,648 | 71,649 | 71,650 |
| | 2-17 | 71,664 | 71,665 | 71,666 | 71,667 | 71,668 | 71,669 | 71,670 | 71,671 | 71,672 | 71,673 | 71,674 | 71,675 |
| | 2-18 | 71,689 | 71,690 | 71,691 | 71,692 | 71,693 | 71,694 | 71,695 | 71,696 | 71,697 | 71,698 | 71,699 | 71,700 |
| | 2-19 | 71,714 | 71,715 | 71,716 | 71,717 | 71,718 | 71,719 | 71,720 | 71,721 | 71,722 | 71,723 | 71,724 | 71,725 |
| | 2-20 | 71,739 | 71,740 | 71,741 | 71,742 | 71,743 | 71,744 | 71,745 | 71,746 | 71,747 | 71,748 | 71,749 | 71,750 |
| | 2-21 | 71,764 | 71,765 | 71,766 | 71,767 | 71,768 | 71,769 | 71,770 | 71,771 | 71,772 | 71,773 | 71,774 | 71,775 |
| | 2-22 | 71,789 | 71,790 | 71,791 | 71,792 | 71,793 | 71,794 | 71,795 | 71,796 | 71,797 | 71,798 | 71,799 | 71,800 |
| | 2-23 | 71,814 | 71,815 | 71,816 | 71,817 | 71,818 | 71,819 | 71,820 | 71,821 | 71,822 | 71,823 | 71,824 | 71,825 |
| | 2-24 | 71,839 | 71,840 | 71,841 | 71,842 | 71,843 | 71,844 | 71,845 | 71,846 | 71,847 | 71,848 | 71,849 | 71,850 |
| | 2-25 | 71,864 | 71,865 | 71,866 | 71,867 | 71,868 | 71,869 | 71,870 | 71,871 | 71,872 | 71,873 | 71,874 | 71,875 |
| | 2-26 | 71,889 | 71,890 | 71,891 | 71,892 | 71,893 | 71,894 | 71,895 | 71,896 | 71,897 | 71,898 | 71,899 | 71,900 |
| | 2-27 | 71,914 | 71,915 | 71,916 | 71,917 | 71,918 | 71,919 | 71,920 | 71,921 | 71,922 | 71,923 | 71,924 | 71,925 |
| | 2-28 | 71,939 | 71,940 | 71,941 | 71,942 | 71,943 | 71,944 | 71,945 | 71,946 | 71,947 | 71,948 | 71,949 | 71,950 |
| | 2-29 | 71,964 | 71,965 | 71,966 | 71,967 | 71,968 | 71,969 | 71,970 | 71,971 | 71,972 | 71,973 | 71,974 | 71,975 |
| | 2-30 | 71,989 | 71,990 | 71,991 | 71,992 | 71,993 | 71,994 | 71,995 | 71,996 | 71,997 | 71,998 | 71,999 | 72,000 |
| | 2-31 | 72,014 | 72,015 | 72,016 | 72,017 | 72,018 | 72,019 | 72,020 | 72,021 | 72,022 | 72,023 | 72,024 | 72,025 |
| | 2-32 | 72,039 | 72,040 | 72,041 | 72,042 | 72,043 | 72,044 | 72,045 | 72,046 | 72,047 | 72,048 | 72,049 | 72,050 |
| | 2-33 | 72,064 | 72,065 | 72,066 | 72,067 | 72,068 | 72,069 | 72,070 | 72,071 | 72,072 | 72,073 | 72,074 | 72,075 |
| | 2-34 | 72,089 | 72,090 | 72,091 | 72,092 | 72,093 | 72,094 | 72,095 | 72,096 | 72,097 | 72,098 | 72,099 | 72,100 |
| | 2-35 | 72,114 | 72,115 | 72,116 | 72,117 | 72,118 | 72,119 | 72,120 | 72,121 | 72,122 | 72,123 | 72,124 | 72,125 |
| | 2-36 | 72,139 | 72,140 | 72,141 | 72,142 | 72,143 | 72,144 | 72,145 | 72,146 | 72,147 | 72,148 | 72,149 | 72,150 |
| | 2-37 | 72,164 | 72,165 | 72,166 | 72,167 | 72,168 | 72,169 | 72,170 | 72,171 | 72,172 | 72,173 | 72,174 | 72,175 |
| | 2-38 | 72,189 | 72,190 | 72,191 | 72,192 | 72,193 | 72,194 | 72,195 | 72,196 | 72,197 | 72,198 | 72,199 | 72,200 |
| | 2-39 | 72,214 | 72,215 | 72,216 | 72,217 | 72,218 | 72,219 | 72,220 | 72,221 | 72,222 | 72,223 | 72,224 | 72,225 |
| | 2-40 | 72,239 | 72,240 | 72,241 | 72,242 | 72,243 | 72,244 | 72,245 | 72,246 | 72,247 | 72,248 | 72,249 | 72,250 |
| | 2-41 | 72,264 | 72,265 | 72,266 | 72,267 | 72,268 | 72,269 | 72,270 | 72,271 | 72,272 | 72,273 | 72,274 | 72,275 |
| | 2-42 | 72,289 | 72,290 | 72,291 | 72,292 | 72,293 | 72,294 | 72,295 | 72,296 | 72,297 | 72,298 | 72,299 | 72,300 |
| | 2-43 | 72,314 | 72,315 | 72,316 | 72,317 | 72,318 | 72,319 | 72,320 | 72,321 | 72,322 | 72,323 | 72,324 | 72,325 |
| | 2-44 | 72,339 | 72,340 | 72,341 | 72,342 | 72,343 | 72,344 | 72,345 | 72,346 | 72,347 | 72,348 | 72,349 | 72,350 |
| | 2-45 | 72,364 | 72,365 | 72,366 | 72,367 | 72,368 | 72,369 | 72,370 | 72,371 | 72,372 | 72,373 | 72,374 | 72,375 |
| | 2-46 | 72,389 | 72,390 | 72,391 | 72,392 | 72,393 | 72,394 | 72,395 | 72,396 | 72,397 | 72,398 | 72,399 | 72,400 |
| | 2-47 | 72,414 | 72,415 | 72,416 | 72,417 | 72,418 | 72,419 | 72,420 | 72,421 | 72,422 | 72,423 | 72,424 | 72,425 |
| | 2-48 | 72,439 | 72,440 | 72,441 | 72,442 | 72,443 | 72,444 | 72,445 | 72,446 | 72,447 | 72,448 | 72,449 | 72,450 |
| | 2-49 | 72,464 | 72,465 | 72,466 | 72,467 | 72,468 | 72,469 | 72,470 | 72,471 | 72,472 | 72,473 | 72,474 | 72,475 |
| | 2-50 | 72,489 | 72,490 | 72,491 | 72,492 | 72,493 | 72,494 | 72,495 | 72,496 | 72,497 | 72,498 | 72,499 | 72,500 |
| | 2-51 | 72,514 | 72,515 | 72,516 | 72,517 | 72,518 | 72,519 | 72,520 | 72,521 | 72,522 | 72,523 | 72,524 | 72,525 |
| | 2-52 | 72,539 | 72,540 | 72,541 | 72,542 | 72,543 | 72,544 | 72,545 | 72,546 | 72,547 | 72,548 | 72,549 | 72,550 |
| | 2-53 | 72,564 | 72,565 | 72,566 | 72,567 | 72,568 | 72,569 | 72,570 | 72,571 | 72,572 | 72,573 | 72,574 | 72,575 |
| | 2-54 | 72,589 | 72,590 | 72,591 | 72,592 | 72,593 | 72,594 | 72,595 | 72,596 | 72,597 | 72,598 | 72,599 | 72,600 |
| | 2-55 | 72,614 | 72,615 | 72,616 | 72,617 | 72,618 | 72,619 | 72,620 | 72,621 | 72,622 | 72,623 | 72,624 | 72,625 |

TABLE 56

| | | Compound represented by the formula (1) | | | | | | | | | | | | |
|---|---|---|---|---|---|---|---|---|---|---|---|---|---|---|
| | | 1-151 | 1-152 | 1-153 | 1-154 | 1-155 | 1-156 | 1-157 | 1-158 | 1-159 | 1-160 | 1-161 | 1-162 | 1-163 |
| Compound represented by the formula (2) | 2-56 | 72,626 | 72,627 | 72,628 | 72,629 | 72,630 | 72,631 | 72,632 | 72,633 | 72,634 | 72,635 | 72,636 | 72,637 | 72,638 |
| | 2-57 | 72,651 | 72,652 | 72,653 | 72,654 | 72,655 | 72,656 | 72,657 | 72,658 | 72,659 | 72,660 | 72,661 | 72,662 | 72,663 |
| | 2-58 | 72,676 | 72,677 | 72,678 | 72,679 | 72,680 | 72,681 | 72,682 | 72,683 | 72,684 | 72,685 | 72,686 | 72,687 | 72,688 |
| | 2-59 | 72,701 | 72,702 | 72,703 | 72,704 | 72,705 | 72,706 | 72,707 | 72,708 | 72,709 | 72,710 | 72,711 | 72,712 | 72,713 |
| | 2-60 | 72,726 | 72,727 | 72,728 | 72,729 | 72,730 | 72,731 | 72,732 | 72,733 | 72,734 | 72,735 | 72,736 | 72,737 | 72,738 |
| | 2-61 | 72,751 | 72,752 | 72,753 | 72,754 | 72,755 | 72,756 | 72,757 | 72,758 | 72,759 | 72,760 | 72,761 | 72,762 | 72,763 |
| | 2-62 | 72,776 | 72,777 | 72,778 | 72,779 | 72,780 | 72,781 | 72,782 | 72,783 | 72,784 | 72,785 | 72,786 | 72,787 | 72,788 |
| | 2-63 | 72,801 | 72,802 | 72,803 | 72,804 | 72,805 | 72,806 | 72,807 | 72,808 | 72,809 | 72,810 | 72,811 | 72,812 | 72,813 |
| | 2-64 | 72,826 | 72,827 | 72,828 | 72,829 | 72,830 | 72,831 | 72,832 | 72,833 | 72,834 | 72,835 | 72,836 | 72,837 | 72,838 |
| | 2-65 | 72,851 | 72,852 | 72,853 | 72,854 | 72,855 | 72,856 | 72,857 | 72,858 | 72,859 | 72,860 | 72,861 | 72,862 | 72,863 |
| | 2-66 | 72,876 | 72,877 | 72,878 | 72,879 | 72,880 | 72,881 | 72,882 | 72,883 | 72,884 | 72,885 | 72,886 | 72,887 | 72,888 |
| | 2-67 | 72,901 | 72,902 | 72,903 | 72,904 | 72,905 | 72,906 | 72,907 | 72,908 | 72,909 | 72,910 | 72,911 | 72,912 | 72,913 |
| | 2-68 | 72,926 | 72,927 | 72,928 | 72,929 | 72,930 | 72,931 | 72,932 | 72,933 | 72,934 | 72,935 | 72,936 | 72,937 | 72,938 |
| | 2-69 | 72,951 | 72,952 | 72,953 | 72,954 | 72,955 | 72,956 | 72,957 | 72,958 | 72,959 | 72,960 | 72,961 | 72,962 | 72,963 |
| | 2-70 | 72,976 | 72,977 | 72,978 | 72,979 | 72,980 | 72,981 | 72,982 | 72,983 | 72,984 | 72,985 | 72,986 | 72,987 | 72,988 |
| | 2-71 | 73,001 | 73,002 | 73,003 | 73,004 | 73,005 | 73,006 | 73,007 | 73,008 | 73,009 | 73,010 | 73,011 | 73,012 | 73,013 |
| | 2-72 | 73,026 | 73,027 | 73,028 | 73,029 | 73,030 | 73,031 | 73,032 | 73,033 | 73,034 | 73,035 | 73,036 | 73,037 | 73,038 |
| | 2-73 | 73,051 | 73,052 | 73,053 | 73,054 | 73,055 | 73,056 | 73,057 | 73,058 | 73,059 | 73,060 | 73,061 | 73,062 | 73,063 |
| | 2-74 | 73,076 | 73,077 | 73,078 | 73,079 | 73,080 | 73,081 | 73,082 | 73,083 | 73,084 | 73,085 | 73,086 | 73,087 | 73,088 |
| | 2-75 | 73,101 | 73,102 | 73,103 | 73,104 | 73,105 | 73,106 | 73,107 | 73,108 | 73,109 | 73,110 | 73,111 | 73,112 | 73,113 |
| | 2-76 | 73,126 | 73,127 | 73,128 | 73,129 | 73,130 | 73,131 | 73,132 | 73,133 | 73,134 | 73,135 | 73,136 | 73,137 | 73,138 |
| | 2-77 | 73,151 | 73,152 | 73,153 | 73,154 | 73,155 | 73,156 | 73,157 | 73,158 | 73,159 | 73,160 | 73,161 | 73,162 | 73,163 |
| | 2-78 | 73,176 | 73,177 | 73,178 | 73,179 | 73,180 | 73,181 | 73,182 | 73,183 | 73,184 | 73,185 | 73,186 | 73,187 | 73,188 |
| | 2-79 | 73,201 | 73,202 | 73,203 | 73,204 | 73,205 | 73,206 | 73,207 | 73,208 | 73,209 | 73,210 | 73,211 | 73,212 | 73,213 |
| | 2-80 | 73,226 | 73,227 | 73,228 | 73,229 | 73,230 | 73,231 | 73,232 | 73,233 | 73,234 | 73,235 | 73,236 | 73,237 | 73,238 |
| | 2-81 | 73,251 | 73,252 | 73,253 | 73,254 | 73,255 | 73,256 | 73,257 | 73,258 | 73,259 | 73,260 | 73,261 | 73,262 | 73,263 |
| | 2-82 | 73,276 | 73,277 | 73,278 | 73,279 | 73,280 | 73,281 | 73,282 | 73,283 | 73,284 | 73,285 | 73,286 | 73,287 | 73,288 |
| | 2-83 | 73,301 | 73,302 | 73,303 | 73,304 | 73,305 | 73,306 | 73,307 | 73,308 | 73,309 | 73,310 | 73,311 | 73,312 | 73,313 |
| | 2-84 | 73,326 | 73,327 | 73,328 | 73,329 | 73,330 | 73,331 | 73,332 | 73,333 | 73,334 | 73,335 | 73,336 | 73,337 | 73,338 |
| | 2-85 | 73,351 | 73,352 | 73,353 | 73,354 | 73,355 | 73,356 | 73,357 | 73,358 | 73,359 | 73,360 | 73,361 | 73,362 | 73,363 |
| | 2-86 | 73,376 | 73,377 | 73,378 | 73,379 | 73,380 | 73,381 | 73,382 | 73,383 | 73,384 | 73,385 | 73,386 | 73,387 | 73,388 |
| | 2-87 | 73,401 | 73,402 | 73,403 | 73,404 | 73,405 | 73,406 | 73,407 | 73,408 | 73,409 | 73,410 | 73,411 | 73,412 | 73,413 |
| | 2-88 | 73,426 | 73,427 | 73,428 | 73,429 | 73,430 | 73,431 | 73,432 | 73,433 | 73,434 | 73,435 | 73,436 | 73,437 | 73,438 |
| | 2-89 | 73,451 | 73,452 | 73,453 | 73,454 | 73,455 | 73,456 | 73,457 | 73,458 | 73,459 | 73,460 | 73,461 | 73,462 | 73,463 |
| | 2-90 | 73,476 | 73,477 | 73,478 | 73,479 | 73,480 | 73,481 | 73,482 | 73,483 | 73,484 | 73,485 | 73,486 | 73,487 | 73,488 |
| | 2-91 | 73,501 | 73,502 | 73,503 | 73,504 | 73,505 | 73,506 | 73,507 | 73,508 | 73,509 | 73,510 | 73,511 | 73,512 | 73,513 |
| | 2-92 | 73,526 | 73,527 | 73,528 | 73,529 | 73,530 | 73,531 | 73,532 | 73,533 | 73,534 | 73,535 | 73,536 | 73,537 | 73,538 |
| | 2-93 | 73,551 | 73,552 | 73,553 | 73,554 | 73,555 | 73,556 | 73,557 | 73,558 | 73,559 | 73,560 | 73,561 | 73,562 | 73,563 |
| | 2-94 | 73,576 | 73,577 | 73,578 | 73,579 | 73,580 | 73,581 | 73,582 | 73,583 | 73,584 | 73,585 | 73,586 | 73,587 | 73,588 |
| | 2-95 | 73,601 | 73,602 | 73,603 | 73,604 | 73,605 | 73,606 | 73,607 | 73,608 | 73,609 | 73,610 | 73,611 | 73,612 | 73,613 |
| | 2-96 | 73,626 | 73,627 | 73,628 | 73,629 | 73,630 | 73,631 | 73,632 | 73,633 | 73,634 | 73,635 | 73,636 | 73,637 | 73,638 |
| | 2-97 | 73,651 | 73,652 | 73,653 | 73,654 | 73,655 | 73,656 | 73,657 | 73,658 | 73,659 | 73,660 | 73,661 | 73,662 | 73,663 |
| | 2-98 | 73,676 | 73,677 | 73,678 | 73,679 | 73,680 | 73,681 | 73,682 | 73,683 | 73,684 | 73,685 | 73,686 | 73,687 | 73,688 |
| | 2-99 | 73,701 | 73,702 | 73,703 | 73,704 | 73,705 | 73,706 | 73,707 | 73,708 | 73,709 | 73,710 | 73,711 | 73,712 | 73,713 |
| | 2-100 | 73,726 | 73,727 | 73,728 | 73,729 | 73,730 | 73,731 | 73,732 | 73,733 | 73,734 | 73,735 | 73,736 | 73,737 | 73,738 |
| | 2-101 | 73,751 | 73,752 | 73,753 | 73,754 | 73,755 | 73,756 | 73,757 | 73,758 | 73,759 | 73,760 | 73,761 | 73,762 | 73,763 |
| | 2-102 | 73,776 | 73,777 | 73,778 | 73,779 | 73,780 | 73,781 | 73,782 | 73,783 | 73,784 | 73,785 | 73,786 | 73,787 | 73,788 |
| | 2-103 | 73,801 | 73,802 | 73,803 | 73,804 | 73,805 | 73,806 | 73,807 | 73,808 | 73,809 | 73,810 | 73,811 | 73,812 | 73,813 |
| | 2-104 | 73,826 | 73,827 | 73,828 | 73,829 | 73,830 | 73,831 | 73,832 | 73,833 | 73,834 | 73,835 | 73,836 | 73,837 | 73,838 |
| | 2-105 | 73,851 | 73,852 | 73,853 | 73,854 | 73,855 | 73,856 | 73,857 | 73,858 | 73,859 | 73,860 | 73,861 | 73,862 | 73,863 |
| | 2-106 | 73,876 | 73,877 | 73,878 | 73,879 | 73,880 | 73,881 | 73,882 | 73,883 | 73,884 | 73,885 | 73,886 | 73,887 | 73,888 |
| | 2-107 | 73,901 | 73,902 | 73,903 | 73,904 | 73,905 | 73,906 | 73,907 | 73,908 | 73,909 | 73,910 | 73,911 | 73,912 | 73,913 |
| | 2-108 | 73,926 | 73,927 | 73,928 | 73,929 | 73,930 | 73,931 | 73,932 | 73,933 | 73,934 | 73,935 | 73,936 | 73,937 | 73,938 |
| | 2-109 | 73,951 | 73,952 | 73,953 | 73,954 | 73,955 | 73,956 | 73,957 | 73,958 | 73,959 | 73,960 | 73,961 | 73,962 | 73,963 |
| | 2-110 | 73,976 | 73,977 | 73,978 | 73,979 | 73,980 | 73,981 | 73,982 | 73,983 | 73,984 | 73,985 | 73,986 | 73,987 | 73,988 |

| | | Compound represented by the formula (1) | | | | | | | | | | | |
|---|---|---|---|---|---|---|---|---|---|---|---|---|---|
| | | 1-164 | 1-165 | 1-166 | 1-167 | 1-168 | 1-169 | 1-170 | 1-171 | 1-172 | 1-173 | 1-174 | 1-175 |
| Compound represented by the formula (2) | 2-56 | 72,639 | 72,640 | 72,641 | 72,642 | 72,643 | 72,644 | 72,645 | 72,646 | 72,647 | 72,648 | 72,649 | 72,650 |
| | 2-57 | 72,664 | 72,665 | 72,666 | 72,667 | 72,668 | 72,669 | 72,670 | 72,671 | 72,672 | 72,673 | 72,674 | 72,675 |
| | 2-58 | 72,689 | 72,690 | 72,691 | 72,692 | 72,693 | 72,694 | 72,695 | 72,696 | 72,697 | 72,698 | 72,699 | 72,700 |
| | 2-59 | 72,714 | 72,715 | 72,716 | 72,717 | 72,718 | 72,719 | 72,720 | 72,721 | 72,722 | 72,723 | 72,724 | 72,725 |
| | 2-60 | 72,739 | 72,740 | 72,741 | 72,742 | 72,743 | 72,744 | 72,745 | 72,746 | 72,747 | 72,748 | 72,749 | 72,750 |
| | 2-61 | 72,764 | 72,765 | 72,766 | 72,767 | 72,768 | 72,769 | 72,770 | 72,771 | 72,772 | 72,773 | 72,774 | 72,775 |
| | 2-62 | 72,789 | 72,790 | 72,791 | 72,792 | 72,793 | 72,794 | 72,795 | 72,796 | 72,797 | 72,798 | 72,799 | 72,800 |
| | 2-63 | 72,814 | 72,815 | 72,816 | 72,817 | 72,818 | 72,819 | 72,820 | 72,821 | 72,822 | 72,823 | 72,824 | 72,825 |
| | 2-64 | 72,839 | 72,840 | 72,841 | 72,842 | 72,843 | 72,844 | 72,845 | 72,846 | 72,847 | 72,848 | 72,849 | 72,850 |
| | 2-65 | 72,864 | 72,865 | 72,866 | 72,867 | 72,868 | 72,869 | 72,870 | 72,871 | 72,872 | 72,873 | 72,874 | 72,875 |
| | 2-66 | 72,889 | 72,890 | 72,891 | 72,892 | 72,893 | 72,894 | 72,895 | 72,896 | 72,897 | 72,898 | 72,899 | 72,900 |
| | 2-67 | 72,914 | 72,915 | 72,916 | 72,917 | 72,918 | 72,919 | 72,920 | 72,921 | 72,922 | 72,923 | 72,924 | 72,925 |
| | 2-68 | 72,939 | 72,940 | 72,941 | 72,942 | 72,943 | 72,944 | 72,945 | 72,946 | 72,947 | 72,948 | 72,949 | 72,950 |
| | 2-69 | 72,964 | 72,965 | 72,966 | 72,967 | 72,968 | 72,969 | 72,970 | 72,971 | 72,972 | 72,973 | 72,974 | 72,975 |
| | 2-70 | 72,989 | 72,990 | 72,991 | 72,992 | 72,993 | 72,994 | 72,995 | 72,996 | 72,997 | 72,998 | 72,999 | 73,000 |
| | 2-71 | 73,014 | 73,015 | 73,016 | 73,017 | 73,018 | 73,019 | 73,020 | 73,021 | 73,022 | 73,023 | 73,024 | 73,025 |

TABLE 56-continued

| | | | | | | | | | | | | |
|---|---|---|---|---|---|---|---|---|---|---|---|---|
| 2-72 | 73,039 | 73,040 | 73,041 | 73,042 | 73,043 | 73,044 | 73,045 | 73,046 | 73,047 | 73,048 | 73,049 | 73,050 |
| 2-73 | 73,064 | 73,065 | 73,066 | 73,067 | 73,068 | 73,069 | 73,070 | 73,071 | 73,072 | 73,073 | 73,074 | 73,075 |
| 2-74 | 73,089 | 73,090 | 73,091 | 73,092 | 73,093 | 73,094 | 73,095 | 73,096 | 73,097 | 73,098 | 73,099 | 73,100 |
| 2-75 | 73,114 | 73,115 | 73,116 | 73,117 | 73,118 | 73,119 | 73,120 | 73,121 | 73,122 | 73,123 | 73,124 | 73,125 |
| 2-76 | 73,139 | 73,140 | 73,141 | 73,142 | 73,143 | 73,144 | 73,145 | 73,146 | 73,147 | 73,148 | 73,149 | 73,150 |
| 2-77 | 73,164 | 73,165 | 73,166 | 73,167 | 73,168 | 73,169 | 73,170 | 73,171 | 73,172 | 73,173 | 73,174 | 73,175 |
| 2-78 | 73,189 | 73,190 | 73,191 | 73,192 | 73,193 | 73,194 | 73,195 | 73,196 | 73,197 | 73,198 | 73,199 | 73,200 |
| 2-79 | 73,214 | 73,215 | 73,216 | 73,217 | 73,218 | 73,219 | 73,220 | 73,221 | 73,222 | 73,223 | 73,224 | 73,225 |
| 2-80 | 73,239 | 73,240 | 73,241 | 73,242 | 73,243 | 73,244 | 73,245 | 73,246 | 73,247 | 73,248 | 73,249 | 73,250 |
| 2-81 | 73,264 | 73,265 | 73,266 | 73,267 | 73,268 | 73,269 | 73,270 | 73,271 | 73,272 | 73,273 | 73,274 | 73,275 |
| 2-82 | 73,289 | 73,290 | 73,291 | 73,292 | 73,293 | 73,294 | 73,295 | 73,296 | 73,297 | 73,298 | 73,299 | 73,300 |
| 2-83 | 73,314 | 73,315 | 73,316 | 73,317 | 73,318 | 73,319 | 73,320 | 73,321 | 73,322 | 73,323 | 73,324 | 73,325 |
| 2-84 | 73,339 | 73,340 | 73,341 | 73,342 | 73,343 | 73,344 | 73,345 | 73,346 | 73,347 | 73,348 | 73,349 | 73,350 |
| 2-85 | 73,364 | 73,365 | 73,366 | 73,367 | 73,368 | 73,369 | 73,370 | 73,371 | 73,372 | 73,373 | 73,374 | 73,375 |
| 2-86 | 73,389 | 73,390 | 73,391 | 73,392 | 73,393 | 73,394 | 73,395 | 73,396 | 73,397 | 73,398 | 73,399 | 73,400 |
| 2-87 | 73,414 | 73,415 | 73,416 | 73,417 | 73,418 | 73,419 | 73,420 | 73,421 | 73,422 | 73,423 | 73,424 | 73,425 |
| 2-88 | 73,439 | 73,440 | 73,441 | 73,442 | 73,443 | 73,444 | 73,445 | 73,446 | 73,447 | 73,448 | 73,449 | 73,450 |
| 2-89 | 73,464 | 73,465 | 73,466 | 73,467 | 73,468 | 73,469 | 73,470 | 73,471 | 73,472 | 73,473 | 73,474 | 73,475 |
| 2-90 | 73,489 | 73,490 | 73,491 | 73,492 | 73,493 | 73,494 | 73,495 | 73,496 | 73,497 | 73,498 | 73,499 | 73,500 |
| 2-91 | 73,514 | 73,515 | 73,516 | 73,517 | 73,518 | 73,519 | 73,520 | 73,521 | 73,522 | 73,523 | 73,524 | 73,525 |
| 2-92 | 73,539 | 73,540 | 73,541 | 73,542 | 73,543 | 73,544 | 73,545 | 73,546 | 73,547 | 73,548 | 73,549 | 73,550 |
| 2-93 | 73,564 | 73,565 | 73,566 | 73,567 | 73,568 | 73,569 | 73,570 | 73,571 | 73,572 | 73,573 | 73,574 | 73,575 |
| 2-94 | 73,589 | 73,590 | 73,591 | 73,592 | 73,593 | 73,594 | 73,595 | 73,596 | 73,597 | 73,598 | 73,599 | 73,600 |
| 2-95 | 73,614 | 73,615 | 73,616 | 73,617 | 73,618 | 73,619 | 73,620 | 73,621 | 73,622 | 73,623 | 73,624 | 73,625 |
| 2-96 | 73,639 | 73,640 | 73,641 | 73,642 | 73,643 | 73,644 | 73,645 | 73,646 | 73,647 | 73,648 | 73,649 | 73,650 |
| 2-97 | 73,664 | 73,665 | 73,666 | 73,667 | 73,668 | 73,669 | 73,670 | 73,671 | 73,672 | 73,673 | 73,674 | 73,675 |
| 2-98 | 73,689 | 73,690 | 73,691 | 73,692 | 73,693 | 73,694 | 73,695 | 73,696 | 73,697 | 73,698 | 73,699 | 73,700 |
| 2-99 | 73,714 | 73,715 | 73,716 | 73,717 | 73,718 | 73,719 | 73,720 | 73,721 | 73,722 | 73,723 | 73,724 | 73,725 |
| 2-100 | 73,739 | 73,740 | 73,741 | 73,742 | 73,743 | 73,744 | 73,745 | 73,746 | 73,747 | 73,748 | 73,749 | 73,750 |
| 2-101 | 73,764 | 73,765 | 73,766 | 73,767 | 73,768 | 73,769 | 73,770 | 73,771 | 73,772 | 73,773 | 73,774 | 73,775 |
| 2-102 | 73,789 | 73,790 | 73,791 | 73,792 | 73,793 | 73,794 | 73,795 | 73,796 | 73,797 | 73,798 | 73,799 | 73,800 |
| 2-103 | 73,814 | 73,815 | 73,816 | 73,817 | 73,818 | 73,819 | 73,820 | 73,821 | 73,822 | 73,823 | 73,824 | 73,825 |
| 2-104 | 73,839 | 73,840 | 73,841 | 73,842 | 73,843 | 73,844 | 73,845 | 73,846 | 73,847 | 73,848 | 73,849 | 73,850 |
| 2-105 | 73,864 | 73,865 | 73,866 | 73,867 | 73,868 | 73,869 | 73,870 | 73,871 | 73,872 | 73,873 | 73,874 | 73,875 |
| 2-106 | 73,889 | 73,890 | 73,891 | 73,892 | 73,893 | 73,894 | 73,895 | 73,896 | 73,897 | 73,898 | 73,899 | 73,900 |
| 2-107 | 73,914 | 73,915 | 73,916 | 73,917 | 73,918 | 73,919 | 73,920 | 73,921 | 73,922 | 73,923 | 73,924 | 73,925 |
| 2-108 | 73,939 | 73,940 | 73,941 | 73,942 | 73,943 | 73,944 | 73,945 | 73,946 | 73,947 | 73,948 | 73,949 | 73,950 |
| 2-109 | 73,964 | 73,965 | 73,966 | 73,967 | 73,968 | 73,969 | 73,970 | 73,971 | 73,972 | 73,973 | 73,974 | 73,975 |
| 2-110 | 73,989 | 73,990 | 73,991 | 73,992 | 73,993 | 73,994 | 73,995 | 73,996 | 73,997 | 73,998 | 73,999 | 74,000 |

TABLE 57

| | | Compound represented by the formula (1) | | | | | | | | | | | | |
|---|---|---|---|---|---|---|---|---|---|---|---|---|---|---|
| | | 1-151 | 1-152 | 1-153 | 1-154 | 1-155 | 1-156 | 1-157 | 1-158 | 1-159 | 1-160 | 1-161 | 1-162 | 1-163 |
| Compound represented by the formula (2) | 2-111 | 74,001 | 74,002 | 74,003 | 74,004 | 74,005 | 74,006 | 74,007 | 74,008 | 74,009 | 74,010 | 74,011 | 74,012 | 74,013 |
| | 2-112 | 74,026 | 74,027 | 74,028 | 74,029 | 74,030 | 74,031 | 74,032 | 74,033 | 74,034 | 74,035 | 74,036 | 74,037 | 74,038 |
| | 2-113 | 74,051 | 74,052 | 74,053 | 74,054 | 74,055 | 74,056 | 74,057 | 74,058 | 74,059 | 74,060 | 74,061 | 74,062 | 74,063 |
| | 2-114 | 74,076 | 74,077 | 74,078 | 74,079 | 74,080 | 74,081 | 74,082 | 74,083 | 74,084 | 74,085 | 74,086 | 74,087 | 74,088 |
| | 2-115 | 74,101 | 74,102 | 74,103 | 74,104 | 74,105 | 74,106 | 74,107 | 74,108 | 74,109 | 74,110 | 74,111 | 74,112 | 74,113 |
| | 2-116 | 74,126 | 74,127 | 74,128 | 74,129 | 74,130 | 74,131 | 74,132 | 74,133 | 74,134 | 74,135 | 74,136 | 74,137 | 74,138 |
| | 2-117 | 74,151 | 74,152 | 74,153 | 74,154 | 74,155 | 74,156 | 74,157 | 74,158 | 74,159 | 74,160 | 74,161 | 74,162 | 74,163 |
| | 2-118 | 74,176 | 74,177 | 74,178 | 74,179 | 74,180 | 74,181 | 74,182 | 74,183 | 74,184 | 74,185 | 74,186 | 74,187 | 74,188 |
| | 2-119 | 74,201 | 74,202 | 74,203 | 74,204 | 74,205 | 74,206 | 74,207 | 74,208 | 74,209 | 74,210 | 74,211 | 74,212 | 74,213 |
| | 2-120 | 74,226 | 74,227 | 74,228 | 74,229 | 74,230 | 74,231 | 74,232 | 74,233 | 74,234 | 74,235 | 74,236 | 74,237 | 74,238 |
| | 2-121 | 74,251 | 74,252 | 74,253 | 74,254 | 74,255 | 74,256 | 74,257 | 74,258 | 74,259 | 74,260 | 74,261 | 74,262 | 74,263 |
| | 2-122 | 74,276 | 74,277 | 74,278 | 74,279 | 74,280 | 74,281 | 74,282 | 74,283 | 74,284 | 74,285 | 74,286 | 74,287 | 74,288 |
| | 2-123 | 74,301 | 74,302 | 74,303 | 74,304 | 74,305 | 74,306 | 74,307 | 74,308 | 74,309 | 74,310 | 74,311 | 74,312 | 74,313 |
| | 2-124 | 74,326 | 74,327 | 74,328 | 74,329 | 74,330 | 74,331 | 74,332 | 74,333 | 74,334 | 74,335 | 74,336 | 74,337 | 74,338 |
| | 2-125 | 74,351 | 74,352 | 74,353 | 74,354 | 74,355 | 74,356 | 74,357 | 74,358 | 74,359 | 74,360 | 74,361 | 74,362 | 74,363 |
| | 2-126 | 74,376 | 74,377 | 74,378 | 74,379 | 74,380 | 74,381 | 74,382 | 74,383 | 74,384 | 74,385 | 74,386 | 74,387 | 74,388 |
| | 2-127 | 74,401 | 74,402 | 74,403 | 74,404 | 74,405 | 74,406 | 74,407 | 74,408 | 74,409 | 74,410 | 74,411 | 74,412 | 74,413 |
| | 2-128 | 74,426 | 74,427 | 74,428 | 74,429 | 74,430 | 74,431 | 74,432 | 74,433 | 74,434 | 74,435 | 74,436 | 74,437 | 74,438 |
| | 2-129 | 74,451 | 74,452 | 74,453 | 74,454 | 74,455 | 74,456 | 74,457 | 74,458 | 74,459 | 74,460 | 74,461 | 74,462 | 74,463 |
| | 2-130 | 74,476 | 74,477 | 74,478 | 74,479 | 74,480 | 74,481 | 74,482 | 74,483 | 74,484 | 74,485 | 74,486 | 74,487 | 74,488 |
| | 2-131 | 74,501 | 74,502 | 74,503 | 74,504 | 74,505 | 74,506 | 74,507 | 74,508 | 74,509 | 74,510 | 74,511 | 74,512 | 74,513 |
| | 2-132 | 74,526 | 74,527 | 74,528 | 74,529 | 74,530 | 74,531 | 74,532 | 74,533 | 74,534 | 74,535 | 74,536 | 74,537 | 74,538 |
| | 2-133 | 74,551 | 74,552 | 74,553 | 74,554 | 74,555 | 74,556 | 74,557 | 74,558 | 74,559 | 74,560 | 74,561 | 74,562 | 74,563 |
| | 2-134 | 74,576 | 74,577 | 74,578 | 74,579 | 74,580 | 74,581 | 74,582 | 74,583 | 74,584 | 74,585 | 74,586 | 74,587 | 74,588 |
| | 2-135 | 74,601 | 74,602 | 74,603 | 74,604 | 74,605 | 74,606 | 74,607 | 74,608 | 74,609 | 74,610 | 74,611 | 74,612 | 74,613 |
| | 2-136 | 74,626 | 74,627 | 74,628 | 74,629 | 74,630 | 74,631 | 74,632 | 74,633 | 74,634 | 74,635 | 74,636 | 74,637 | 74,638 |
| | 2-137 | 74,651 | 74,652 | 74,653 | 74,654 | 74,655 | 74,656 | 74,657 | 74,658 | 74,659 | 74,660 | 74,661 | 74,662 | 74,663 |
| | 2-138 | 74,676 | 74,677 | 74,678 | 74,679 | 74,680 | 74,681 | 74,682 | 74,683 | 74,684 | 74,685 | 74,686 | 74,687 | 74,688 |
| | 2-139 | 74,701 | 74,702 | 74,703 | 74,704 | 74,705 | 74,706 | 74,707 | 74,708 | 74,709 | 74,710 | 74,711 | 74,712 | 74,713 |
| | 2-140 | 74,726 | 74,727 | 74,728 | 74,729 | 74,730 | 74,731 | 74,732 | 74,733 | 74,734 | 74,735 | 74,736 | 74,737 | 74,738 |
| | 2-141 | 74,751 | 74,752 | 74,753 | 74,754 | 74,755 | 74,756 | 74,757 | 74,758 | 74,759 | 74,760 | 74,761 | 74,762 | 74,763 |

TABLE 57-continued

| | | | | | | | | | | | | | |
|---|---|---|---|---|---|---|---|---|---|---|---|---|---|
| 2-142 | 74,776 | 74,777 | 74,778 | 74,779 | 74,780 | 74,781 | 74,782 | 74,783 | 74,784 | 74,785 | 74,786 | 74,787 | 74,788 |
| 2-143 | 74,801 | 74,802 | 74,803 | 74,804 | 74,805 | 74,806 | 74,807 | 74,808 | 74,809 | 74,810 | 74,811 | 74,812 | 74,813 |
| 2-144 | 74,826 | 74,827 | 74,828 | 74,829 | 74,830 | 74,831 | 74,832 | 74,833 | 74,834 | 74,835 | 74,836 | 74,837 | 74,838 |
| 2-145 | 74,851 | 74,852 | 74,853 | 74,854 | 74,855 | 74,856 | 74,857 | 74,858 | 74,859 | 74,860 | 74,861 | 74,862 | 74,863 |
| 2-146 | 74,876 | 74,877 | 74,878 | 74,879 | 74,880 | 74,881 | 74,882 | 74,883 | 74,884 | 74,885 | 74,886 | 74,887 | 74,888 |
| 2-147 | 74,901 | 74,902 | 74,903 | 74,904 | 74,905 | 74,906 | 74,907 | 74,908 | 74,909 | 74,910 | 74,911 | 74,912 | 74,913 |
| 2-148 | 74,926 | 74,927 | 74,928 | 74,929 | 74,930 | 74,931 | 74,932 | 74,933 | 74,934 | 74,935 | 74,936 | 74,937 | 74,938 |
| 2-149 | 74,951 | 74,952 | 74,953 | 74,954 | 74,955 | 74,956 | 74,957 | 74,958 | 74,959 | 74,960 | 74,961 | 74,962 | 74,963 |
| 2-150 | 74,976 | 74,977 | 74,978 | 74,979 | 74,980 | 74,981 | 74,982 | 74,983 | 74,984 | 74,985 | 74,986 | 74,987 | 74,988 |
| 2-151 | 75,001 | 75,002 | 75,003 | 75,004 | 75,005 | 75,006 | 75,007 | 75,008 | 75,009 | 75,010 | 75,011 | 75,012 | 75,013 |
| 2-152 | 75,026 | 75,027 | 75,028 | 75,029 | 75,030 | 75,031 | 75,032 | 75,033 | 75,034 | 75,035 | 75,036 | 75,037 | 75,038 |
| 2-153 | 75,051 | 75,052 | 75,053 | 75,054 | 75,055 | 75,056 | 75,057 | 75,058 | 75,059 | 75,060 | 75,061 | 75,062 | 75,063 |
| 2-154 | 75,076 | 75,077 | 75,078 | 75,079 | 75,080 | 75,081 | 75,082 | 75,083 | 75,084 | 75,085 | 75,086 | 75,087 | 75,088 |
| 2-155 | 75,101 | 75,102 | 75,103 | 75,104 | 75,105 | 75,106 | 75,107 | 75,108 | 75,109 | 75,110 | 75,111 | 75,112 | 75,113 |
| 2-156 | 75,126 | 75,127 | 75,128 | 75,129 | 75,130 | 75,131 | 75,132 | 75,133 | 75,134 | 75,135 | 75,136 | 75,137 | 75,138 |
| 2-157 | 75,151 | 75,152 | 75,153 | 75,154 | 75,155 | 75,156 | 75,157 | 75,158 | 75,159 | 75,160 | 75,161 | 75,162 | 75,163 |
| 2-158 | 75,176 | 75,177 | 75,178 | 75,179 | 75,180 | 75,181 | 75,182 | 75,183 | 75,184 | 75,185 | 75,186 | 75,187 | 75,188 |
| 2-159 | 75,201 | 75,202 | 75,203 | 75,204 | 75,205 | 75,206 | 75,207 | 75,208 | 75,209 | 75,210 | 75,211 | 75,212 | 75,213 |
| 2-160 | 75,226 | 75,227 | 75,228 | 75,229 | 75,230 | 75,231 | 75,232 | 75,233 | 75,234 | 75,235 | 75,236 | 75,237 | 75,238 |
| 2-161 | 75,251 | 75,252 | 75,253 | 75,254 | 75,255 | 75,256 | 75,257 | 75,258 | 75,259 | 75,260 | 75,261 | 75,262 | 75,263 |
| 2-162 | 75,276 | 75,277 | 75,278 | 75,279 | 75,280 | 75,281 | 75,282 | 75,283 | 75,284 | 75,285 | 75,286 | 75,287 | 75,288 |
| 2-163 | 75,301 | 75,302 | 75,303 | 75,304 | 75,305 | 75,306 | 75,307 | 75,308 | 75,309 | 75,310 | 75,311 | 75,312 | 75,313 |
| 2-164 | 75,326 | 75,327 | 75,328 | 75,329 | 75,330 | 75,331 | 75,332 | 75,333 | 75,334 | 75,335 | 75,336 | 75,337 | 75,338 |
| 2-165 | 75,351 | 75,352 | 75,353 | 75,354 | 75,355 | 75,356 | 75,357 | 75,358 | 75,359 | 75,360 | 75,361 | 75,362 | 75,363 |

| | | Compound represented by the formula (1) | | | | | | | | | | | |
|---|---|---|---|---|---|---|---|---|---|---|---|---|---|
| | | 1-164 | 1-165 | 1-166 | 1-167 | 1-168 | 1-169 | 1-170 | 1-171 | 1-172 | 1-173 | 1-174 | 1-175 |
| Compound represented by the formula (2) | 2-111 | 74,014 | 74,015 | 74,016 | 74,017 | 74,018 | 74,019 | 74,020 | 74,021 | 74,022 | 74,023 | 74,024 | 74,025 |
| | 2-112 | 74,039 | 74,040 | 74,041 | 74,042 | 74,043 | 74,044 | 74,045 | 74,046 | 74,047 | 74,048 | 74,049 | 74,050 |
| | 2-113 | 74,064 | 74,065 | 74,066 | 74,067 | 74,068 | 74,069 | 74,070 | 74,071 | 74,072 | 74,073 | 74,074 | 74,075 |
| | 2-114 | 74,089 | 74,090 | 74,091 | 74,092 | 74,093 | 74,094 | 74,095 | 74,096 | 74,097 | 74,098 | 74,099 | 74,100 |
| | 2-115 | 74,114 | 74,115 | 74,116 | 74,117 | 74,118 | 74,119 | 74,120 | 74,121 | 74,122 | 74,123 | 74,124 | 74,125 |
| | 2-116 | 74,139 | 74,140 | 74,141 | 74,142 | 74,143 | 74,144 | 74,145 | 74,146 | 74,147 | 74,148 | 74,149 | 74,150 |
| | 2-117 | 74,164 | 74,165 | 74,166 | 74,167 | 74,168 | 74,169 | 74,170 | 74,171 | 74,172 | 74,173 | 74,174 | 74,175 |
| | 2-118 | 74,189 | 74,190 | 74,191 | 74,192 | 74,193 | 74,194 | 74,195 | 74,196 | 74,197 | 74,198 | 74,199 | 74,200 |
| | 2-119 | 74,214 | 74,215 | 74,216 | 74,217 | 74,218 | 74,219 | 74,220 | 74,221 | 74,222 | 74,223 | 74,224 | 74,225 |
| | 2-120 | 74,239 | 74,240 | 74,241 | 74,242 | 74,243 | 74,244 | 74,245 | 74,246 | 74,247 | 74,248 | 74,249 | 74,250 |
| | 2-121 | 74,264 | 74,265 | 74,266 | 74,267 | 74,268 | 74,269 | 74,270 | 74,271 | 74,272 | 74,273 | 74,274 | 74,275 |
| | 2-122 | 74,289 | 74,290 | 74,291 | 74,292 | 74,293 | 74,294 | 74,295 | 74,296 | 74,297 | 74,298 | 74,299 | 74,300 |
| | 2-123 | 74,314 | 74,315 | 74,316 | 74,317 | 74,318 | 74,319 | 74,320 | 74,321 | 74,322 | 74,323 | 74,324 | 74,325 |
| | 2-124 | 74,339 | 74,340 | 74,341 | 74,342 | 74,343 | 74,344 | 74,345 | 74,346 | 74,347 | 74,348 | 74,349 | 74,350 |
| | 2-125 | 74,364 | 74,365 | 74,366 | 74,367 | 74,368 | 74,369 | 74,370 | 74,371 | 74,372 | 74,373 | 74,374 | 74,375 |
| | 2-126 | 74,389 | 74,390 | 74,391 | 74,392 | 74,393 | 74,394 | 74,395 | 74,396 | 74,397 | 74,398 | 74,399 | 74,400 |
| | 2-127 | 74,414 | 74,415 | 74,416 | 74,417 | 74,418 | 74,419 | 74,420 | 74,421 | 74,422 | 74,423 | 74,424 | 74,425 |
| | 2-128 | 74,439 | 74,440 | 74,441 | 74,442 | 74,443 | 74,444 | 74,445 | 74,446 | 74,447 | 74,448 | 74,449 | 74,450 |
| | 2-129 | 74,464 | 74,465 | 74,466 | 74,467 | 74,468 | 74,469 | 74,470 | 74,471 | 74,472 | 74,473 | 74,474 | 74,475 |
| | 2-130 | 74,489 | 74,490 | 74,491 | 74,492 | 74,493 | 74,494 | 74,495 | 74,496 | 74,497 | 74,498 | 74,499 | 74,500 |
| | 2-131 | 74,514 | 74,515 | 74,516 | 74,517 | 74,518 | 74,519 | 74,520 | 74,521 | 74,522 | 74,523 | 74,524 | 74,525 |
| | 2-132 | 74,539 | 74,540 | 74,541 | 74,542 | 74,543 | 74,544 | 74,545 | 74,546 | 74,547 | 74,548 | 74,549 | 74,550 |
| | 2-133 | 74,564 | 74,565 | 74,566 | 74,567 | 74,568 | 74,569 | 74,570 | 74,571 | 74,572 | 74,573 | 74,574 | 74,575 |
| | 2-134 | 74,589 | 74,590 | 74,591 | 74,592 | 74,593 | 74,594 | 74,595 | 74,596 | 74,597 | 74,598 | 74,599 | 74,600 |
| | 2-135 | 74,614 | 74,615 | 74,616 | 74,617 | 74,618 | 74,619 | 74,620 | 74,621 | 74,622 | 74,623 | 74,624 | 74,625 |
| | 2-136 | 74,639 | 74,640 | 74,641 | 74,642 | 74,643 | 74,644 | 74,645 | 74,646 | 74,647 | 74,648 | 74,649 | 74,650 |
| | 2-137 | 74,664 | 74,665 | 74,666 | 74,667 | 74,668 | 74,669 | 74,670 | 74,671 | 74,672 | 74,673 | 74,674 | 74,675 |
| | 2-138 | 74,689 | 74,690 | 74,691 | 74,692 | 74,693 | 74,694 | 74,695 | 74,696 | 74,697 | 74,698 | 74,699 | 74,700 |
| | 2-139 | 74,714 | 74,715 | 74,716 | 74,717 | 74,718 | 74,719 | 74,720 | 74,721 | 74,722 | 74,723 | 74,724 | 74,725 |
| | 2-140 | 74,739 | 74,740 | 74,741 | 74,742 | 74,743 | 74,744 | 74,745 | 74,746 | 74,747 | 74,748 | 74,749 | 74,750 |
| | 2-141 | 74,764 | 74,765 | 74,766 | 74,767 | 74,768 | 74,769 | 74,770 | 74,771 | 74,772 | 74,773 | 74,774 | 74,775 |
| | 2-142 | 74,789 | 74,790 | 74,791 | 74,792 | 74,793 | 74,794 | 74,795 | 74,796 | 74,797 | 74,798 | 74,799 | 74,800 |
| | 2-143 | 74,814 | 74,815 | 74,816 | 74,817 | 74,818 | 74,819 | 74,820 | 74,821 | 74,822 | 74,823 | 74,824 | 74,825 |
| | 2-144 | 74,839 | 74,840 | 74,841 | 74,842 | 74,843 | 74,844 | 74,845 | 74,846 | 74,847 | 74,848 | 74,849 | 74,850 |
| | 2-145 | 74,864 | 74,865 | 74,866 | 74,867 | 74,868 | 74,869 | 74,870 | 74,871 | 74,872 | 74,873 | 74,874 | 74,875 |
| | 2-146 | 74,889 | 74,890 | 74,891 | 74,892 | 74,893 | 74,894 | 74,895 | 74,896 | 74,897 | 74,898 | 74,899 | 74,900 |
| | 2-147 | 74,914 | 74,915 | 74,916 | 74,917 | 74,918 | 74,919 | 74,920 | 74,921 | 74,922 | 74,923 | 74,924 | 74,925 |
| | 2-148 | 74,939 | 74,940 | 74,941 | 74,942 | 74,943 | 74,944 | 74,945 | 74,946 | 74,947 | 74,948 | 74,949 | 74,950 |
| | 2-149 | 74,964 | 74,965 | 74,966 | 74,967 | 74,968 | 74,969 | 74,970 | 74,971 | 74,972 | 74,973 | 74,974 | 74,975 |
| | 2-150 | 74,989 | 74,990 | 74,991 | 74,992 | 74,993 | 74,994 | 74,995 | 74,996 | 74,997 | 74,998 | 74,999 | 75,000 |
| | 2-151 | 75,014 | 75,015 | 75,016 | 75,017 | 75,018 | 75,019 | 75,020 | 75,021 | 75,022 | 75,023 | 75,024 | 75,025 |
| | 2-152 | 75,039 | 75,040 | 75,041 | 75,042 | 75,043 | 75,044 | 75,045 | 75,046 | 75,047 | 75,048 | 75,049 | 75,050 |
| | 2-153 | 75,064 | 75,065 | 75,066 | 75,067 | 75,068 | 75,069 | 75,070 | 75,071 | 75,072 | 75,073 | 75,074 | 75,075 |
| | 2-154 | 75,089 | 75,090 | 75,091 | 75,092 | 75,093 | 75,094 | 75,095 | 75,096 | 75,097 | 75,098 | 75,099 | 75,100 |
| | 2-155 | 75,114 | 75,115 | 75,116 | 75,117 | 75,118 | 75,119 | 75,120 | 75,121 | 75,122 | 75,123 | 75,124 | 75,125 |
| | 2-156 | 75,139 | 75,140 | 75,141 | 75,142 | 75,143 | 75,144 | 75,145 | 75,146 | 75,147 | 75,148 | 75,149 | 75,150 |
| | 2-157 | 75,164 | 75,165 | 75,166 | 75,167 | 75,168 | 75,169 | 75,170 | 75,171 | 75,172 | 75,173 | 75,174 | 75,175 |
| | 2-158 | 75,189 | 75,190 | 75,191 | 75,192 | 75,193 | 75,194 | 75,195 | 75,196 | 75,197 | 75,198 | 75,199 | 75,200 |
| | 2-159 | 75,214 | 75,215 | 75,216 | 75,217 | 75,218 | 75,219 | 75,220 | 75,221 | 75,222 | 75,223 | 75,224 | 75,225 |
| | 2-160 | 75,239 | 75,240 | 75,241 | 75,242 | 75,243 | 75,244 | 75,245 | 75,246 | 75,247 | 75,248 | 75,249 | 75,250 |
| | 2-161 | 75,264 | 75,265 | 75,266 | 75,267 | 75,268 | 75,269 | 75,270 | 75,271 | 75,272 | 75,273 | 75,274 | 75,275 |

TABLE 57-continued

| | | | | | | | | | | | | | |
|---|---|---|---|---|---|---|---|---|---|---|---|---|---|
| | 2-162 | 75,289 | 75,290 | 75,291 | 75,292 | 75,293 | 75,294 | 75,295 | 75,296 | 75,297 | 75,298 | 75,299 | 75,300 |
| | 2-163 | 75,314 | 75,315 | 75,316 | 75,317 | 75,318 | 75,319 | 75,320 | 75,321 | 75,322 | 75,323 | 75,324 | 75,325 |
| | 2-164 | 75,339 | 75,340 | 75,341 | 75,342 | 75,343 | 75,344 | 75,345 | 75,346 | 75,347 | 75,348 | 75,349 | 75,350 |
| | 2-165 | 75,364 | 75,365 | 75,366 | 75,367 | 75,368 | 75,369 | 75,370 | 75,371 | 75,372 | 75,373 | 75,374 | 75,375 |

TABLE 58

| | | Compound represented by the formula (1) | | | | | | | | | | | | |
|---|---|---|---|---|---|---|---|---|---|---|---|---|---|---|
| | | 1-151 | 1-152 | 1-153 | 1-154 | 1-155 | 1-156 | 1-157 | 1-158 | 1-159 | 1-160 | 1-161 | 1-162 | 1-163 |
| Compound represented by the formula (2) | 2-166 | 75,376 | 75,377 | 75,378 | 75,379 | 75,380 | 75,381 | 75,382 | 75,383 | 75,384 | 75,385 | 75,386 | 75,387 | 75,388 |
| | 2-167 | 75,401 | 75,402 | 75,403 | 75,404 | 75,405 | 75,406 | 75,407 | 75,408 | 75,409 | 75,410 | 75,411 | 75,412 | 75,413 |
| | 2-168 | 75,426 | 75,427 | 75,428 | 75,429 | 75,430 | 75,431 | 75,432 | 75,433 | 75,434 | 75,435 | 75,436 | 75,437 | 75,438 |
| | 2-169 | 75,451 | 75,452 | 75,453 | 75,454 | 75,455 | 75,456 | 75,457 | 75,458 | 75,459 | 75,460 | 75,461 | 75,462 | 75,463 |
| | 2-170 | 75,476 | 75,477 | 75,478 | 75,479 | 75,480 | 75,481 | 75,482 | 75,483 | 75,484 | 75,485 | 75,486 | 75,487 | 75,488 |
| | 2-171 | 75,501 | 75,502 | 75,503 | 75,504 | 75,505 | 75,506 | 75,507 | 75,508 | 75,509 | 75,510 | 75,511 | 75,512 | 75,513 |
| | 2-172 | 75,526 | 75,527 | 75,528 | 75,529 | 75,530 | 75,531 | 75,532 | 75,533 | 75,534 | 75,535 | 75,536 | 75,537 | 75,538 |
| | 2-173 | 75,551 | 75,552 | 75,553 | 75,554 | 75,555 | 75,556 | 75,557 | 75,558 | 75,559 | 75,560 | 75,561 | 75,562 | 75,563 |
| | 2-174 | 75,576 | 75,577 | 75,578 | 75,579 | 75,580 | 75,581 | 75,582 | 75,583 | 75,584 | 75,585 | 75,586 | 75,587 | 75,588 |
| | 2-175 | 75,601 | 75,602 | 75,603 | 75,604 | 75,605 | 75,606 | 75,607 | 75,608 | 75,609 | 75,610 | 75,611 | 75,612 | 75,613 |
| | 2-176 | 75,626 | 75,627 | 75,628 | 75,629 | 75,630 | 75,631 | 75,632 | 75,633 | 75,634 | 75,635 | 75,636 | 75,637 | 75,638 |
| | 2-177 | 75,651 | 75,652 | 75,653 | 75,654 | 75,655 | 75,656 | 75,657 | 75,658 | 75,659 | 75,660 | 75,661 | 75,662 | 75,663 |
| | 2-178 | 75,676 | 75,677 | 75,678 | 75,679 | 75,680 | 75,681 | 75,682 | 75,683 | 75,684 | 75,685 | 75,686 | 75,687 | 75,688 |
| | 2-179 | 75,701 | 75,702 | 75,703 | 75,704 | 75,705 | 75,706 | 75,707 | 75,708 | 75,709 | 75,710 | 75,711 | 75,712 | 75,713 |
| | 2-180 | 75,726 | 75,727 | 75,728 | 75,729 | 75,730 | 75,731 | 75,732 | 75,733 | 75,734 | 75,735 | 75,736 | 75,737 | 75,738 |
| | 2-181 | 75,751 | 75,752 | 75,753 | 75,754 | 75,755 | 75,756 | 75,757 | 75,758 | 75,759 | 75,760 | 75,761 | 75,762 | 75,763 |
| | 2-182 | 75,776 | 75,777 | 75,778 | 75,779 | 75,780 | 75,781 | 75,782 | 75,783 | 75,784 | 75,785 | 75,786 | 75,787 | 75,788 |
| | 2-183 | 75,801 | 75,802 | 75,803 | 75,804 | 75,805 | 75,806 | 75,807 | 75,808 | 75,809 | 75,810 | 75,811 | 75,812 | 75,813 |
| | 2-184 | 75,826 | 75,827 | 75,828 | 75,829 | 75,830 | 75,831 | 75,832 | 75,833 | 75,834 | 75,835 | 75,836 | 75,837 | 75,838 |
| | 2-185 | 75,851 | 75,852 | 75,853 | 75,854 | 75,855 | 75,856 | 75,857 | 75,858 | 75,859 | 75,860 | 75,861 | 75,862 | 75,863 |
| | 2-186 | 75,876 | 75,877 | 75,878 | 75,879 | 75,880 | 75,881 | 75,882 | 75,883 | 75,884 | 75,885 | 75,886 | 75,887 | 75,888 |
| | 2-187 | 75,901 | 75,902 | 75,903 | 75,904 | 75,905 | 75,906 | 75,907 | 75,908 | 75,909 | 75,910 | 75,911 | 75,912 | 75,913 |
| | 2-188 | 75,926 | 75,927 | 75,928 | 75,929 | 75,930 | 75,931 | 75,932 | 75,933 | 75,934 | 75,935 | 75,936 | 75,937 | 75,938 |
| | 2-189 | 75,951 | 75,952 | 75,953 | 75,954 | 75,955 | 75,956 | 75,957 | 75,958 | 75,959 | 75,960 | 75,961 | 75,962 | 75,963 |
| | 2-190 | 75,976 | 75,977 | 75,978 | 75,979 | 75,980 | 75,981 | 75,982 | 75,983 | 75,984 | 75,985 | 75,986 | 75,987 | 75,988 |
| | 2-191 | 76,001 | 76,002 | 76,003 | 76,004 | 76,005 | 76,006 | 76,007 | 76,008 | 76,009 | 76,010 | 76,011 | 76,012 | 76,013 |
| | 2-192 | 76,026 | 76,027 | 76,028 | 76,029 | 76,030 | 76,031 | 76,032 | 76,033 | 76,034 | 76,035 | 76,036 | 76,037 | 76,038 |
| | 2-193 | 76,051 | 76,052 | 76,053 | 76,054 | 76,055 | 76,056 | 76,057 | 76,058 | 76,059 | 76,060 | 76,061 | 76,062 | 76,063 |
| | 2-194 | 76,076 | 76,077 | 76,078 | 76,079 | 76,080 | 76,081 | 76,082 | 76,083 | 76,084 | 76,085 | 76,086 | 76,087 | 76,088 |
| | 2-195 | 76,101 | 76,102 | 76,103 | 76,104 | 76,105 | 76,106 | 76,107 | 76,108 | 76,109 | 76,110 | 76,111 | 76,112 | 76,113 |
| | 2-196 | 76,126 | 76,127 | 76,128 | 76,129 | 76,130 | 76,131 | 76,132 | 76,133 | 76,134 | 76,135 | 76,136 | 76,137 | 76,138 |
| | 2-197 | 76,151 | 76,152 | 76,153 | 76,154 | 76,155 | 76,156 | 76,157 | 76,158 | 76,159 | 76,160 | 76,161 | 76,162 | 76,163 |
| | 2-198 | 76,176 | 76,177 | 76,178 | 76,179 | 76,180 | 76,181 | 76,182 | 76,183 | 76,184 | 76,185 | 76,186 | 76,187 | 76,188 |
| | 2-199 | 76,201 | 76,202 | 76,203 | 76,204 | 76,205 | 76,206 | 76,207 | 76,208 | 76,209 | 76,210 | 76,211 | 76,212 | 76,213 |
| | 2-200 | 76,226 | 76,227 | 76,228 | 76,229 | 76,230 | 76,231 | 76,232 | 76,233 | 76,234 | 76,235 | 76,236 | 76,237 | 76,238 |
| | 2-201 | 76,251 | 76,252 | 76,253 | 76,254 | 76,255 | 76,256 | 76,257 | 76,258 | 76,259 | 76,260 | 76,261 | 76,262 | 76,263 |
| | 2-202 | 76,276 | 76,277 | 76,278 | 76,279 | 76,280 | 76,281 | 76,282 | 76,283 | 76,284 | 76,285 | 76,286 | 76,287 | 76,288 |
| | 2-203 | 76,301 | 76,302 | 76,303 | 76,304 | 76,305 | 76,306 | 76,307 | 76,308 | 76,309 | 76,310 | 76,311 | 76,312 | 76,313 |
| | 2-204 | 76,326 | 76,327 | 76,328 | 76,329 | 76,330 | 76,331 | 76,332 | 76,333 | 76,334 | 76,335 | 76,336 | 76,337 | 76,338 |
| | 2-205 | 76,351 | 76,352 | 76,353 | 76,354 | 76,355 | 76,356 | 76,357 | 76,358 | 76,359 | 76,360 | 76,361 | 76,362 | 76,363 |
| | 2-206 | 76,376 | 76,377 | 76,378 | 76,379 | 76,380 | 76,381 | 76,382 | 76,383 | 76,384 | 76,385 | 76,386 | 76,387 | 76,388 |
| | 2-207 | 76,401 | 76,402 | 76,403 | 76,404 | 76,405 | 76,406 | 76,407 | 76,408 | 76,409 | 76,410 | 76,411 | 76,412 | 76,413 |
| | 2-208 | 76,426 | 76,427 | 76,428 | 76,429 | 76,430 | 76,431 | 76,432 | 76,433 | 76,434 | 76,435 | 76,436 | 76,437 | 76,438 |
| | 2-209 | 76,451 | 76,452 | 76,453 | 76,454 | 76,455 | 76,456 | 76,457 | 76,458 | 76,459 | 76,460 | 76,461 | 76,462 | 76,463 |
| | 2-210 | 76,476 | 76,477 | 76,478 | 76,479 | 76,480 | 76,481 | 76,482 | 76,483 | 76,484 | 76,485 | 76,486 | 76,487 | 76,488 |
| | 2-211 | 76,501 | 76,502 | 76,503 | 76,504 | 76,505 | 76,506 | 76,507 | 76,508 | 76,509 | 76,510 | 76,511 | 76,512 | 76,513 |
| | 2-212 | 76,526 | 76,527 | 76,528 | 76,529 | 76,530 | 76,531 | 76,532 | 76,533 | 76,534 | 76,535 | 76,536 | 76,537 | 76,538 |
| | 2-213 | 76,551 | 76,552 | 76,553 | 76,554 | 76,555 | 76,556 | 76,557 | 76,558 | 76,559 | 76,560 | 76,561 | 76,562 | 76,563 |
| | 2-214 | 76,576 | 76,577 | 76,578 | 76,579 | 76,580 | 76,581 | 76,582 | 76,583 | 76,584 | 76,585 | 76,586 | 76,587 | 76,588 |
| | 2-215 | 76,601 | 76,602 | 76,603 | 76,604 | 76,605 | 76,606 | 76,607 | 76,608 | 76,609 | 76,610 | 76,611 | 76,612 | 76,613 |
| | 2-216 | 76,626 | 76,627 | 76,628 | 76,629 | 76,630 | 76,631 | 76,632 | 76,633 | 76,634 | 76,635 | 76,636 | 76,637 | 76,638 |
| | 2-217 | 76,651 | 76,652 | 76,653 | 76,654 | 76,655 | 76,656 | 76,657 | 76,658 | 76,659 | 76,660 | 76,661 | 76,662 | 76,663 |
| | 2-218 | 76,676 | 76,677 | 76,678 | 76,679 | 76,680 | 76,681 | 76,682 | 76,683 | 76,684 | 76,685 | 76,686 | 76,687 | 76,688 |
| | 2-219 | 76,701 | 76,702 | 76,703 | 76,704 | 76,705 | 76,706 | 76,707 | 76,708 | 76,709 | 76,710 | 76,711 | 76,712 | 76,713 |
| | 2-220 | 76,726 | 76,727 | 76,728 | 76,729 | 76,730 | 76,731 | 76,732 | 76,733 | 76,734 | 76,735 | 76,736 | 76,737 | 76,738 |

| | | Compound represented by the formula (1) | | | | | | | | | | | |
|---|---|---|---|---|---|---|---|---|---|---|---|---|---|
| | | 1-164 | 1-165 | 1-166 | 1-167 | 1-168 | 1-169 | 1-170 | 1-171 | 1-172 | 1-173 | 1-174 | 1-175 |
| Compound represented by the formula (2) | 2-166 | 75,389 | 75,390 | 75,391 | 75,392 | 75,393 | 75,394 | 75,395 | 75,396 | 75,397 | 75,398 | 75,399 | 75,400 |
| | 2-167 | 75,414 | 75,415 | 75,416 | 75,417 | 75,418 | 75,419 | 75,420 | 75,421 | 75,422 | 75,423 | 75,424 | 75,425 |
| | 2-168 | 75,439 | 75,440 | 75,441 | 75,442 | 75,443 | 75,444 | 75,445 | 75,446 | 75,447 | 75,448 | 75,449 | 75,450 |
| | 2-169 | 75,464 | 75,465 | 75,466 | 75,467 | 75,468 | 75,469 | 75,470 | 75,471 | 75,472 | 75,473 | 75,474 | 75,475 |
| | 2-170 | 75,489 | 75,490 | 75,491 | 75,492 | 75,493 | 75,494 | 75,495 | 75,496 | 75,497 | 75,498 | 75,499 | 75,500 |
| | 2-171 | 75,514 | 75,515 | 75,516 | 75,517 | 75,518 | 75,519 | 75,520 | 75,521 | 75,522 | 75,523 | 75,524 | 75,525 |

TABLE 58-continued

| | | | | | | | | | | | | |
|---|---|---|---|---|---|---|---|---|---|---|---|---|
| 2-172 | 75,539 | 75,540 | 75,541 | 75,542 | 75,543 | 75,544 | 75,545 | 75,546 | 75,547 | 75,548 | 75,549 | 75,550 |
| 2-173 | 75,564 | 75,565 | 75,566 | 75,567 | 75,568 | 75,569 | 75,570 | 75,571 | 75,572 | 75,573 | 75,574 | 75,575 |
| 2-174 | 75,589 | 75,590 | 75,591 | 75,592 | 75,593 | 75,594 | 75,595 | 75,596 | 75,597 | 75,598 | 75,599 | 75,600 |
| 2-175 | 75,614 | 75,615 | 75,616 | 75,617 | 75,618 | 75,619 | 75,620 | 75,621 | 75,622 | 75,623 | 75,624 | 75,625 |
| 2-176 | 75,639 | 75,640 | 75,641 | 75,642 | 75,643 | 75,644 | 75,645 | 75,646 | 75,647 | 75,648 | 75,649 | 75,650 |
| 2-177 | 75,664 | 75,665 | 75,666 | 75,667 | 75,668 | 75,669 | 75,670 | 75,671 | 75,672 | 75,673 | 75,674 | 75,675 |
| 2-178 | 75,689 | 75,690 | 75,691 | 75,692 | 75,693 | 75,694 | 75,695 | 75,696 | 75,697 | 75,698 | 75,699 | 75,700 |
| 2-179 | 75,714 | 75,715 | 75,716 | 75,717 | 75,718 | 75,719 | 75,720 | 75,721 | 75,722 | 75,723 | 75,724 | 75,725 |
| 2-180 | 75,739 | 75,740 | 75,741 | 75,742 | 75,743 | 75,744 | 75,745 | 75,746 | 75,747 | 75,748 | 75,749 | 75,750 |
| 2-181 | 75,764 | 75,765 | 75,766 | 75,767 | 75,768 | 75,769 | 75,770 | 75,771 | 75,772 | 75,773 | 75,774 | 75,775 |
| 2-182 | 75,789 | 75,790 | 75,791 | 75,792 | 75,793 | 75,794 | 75,795 | 75,796 | 75,797 | 75,798 | 75,799 | 75,800 |
| 2-183 | 75,814 | 75,815 | 75,816 | 75,817 | 75,818 | 75,819 | 75,820 | 75,821 | 75,822 | 75,823 | 75,824 | 75,825 |
| 2-184 | 75,839 | 75,840 | 75,841 | 75,842 | 75,843 | 75,844 | 75,845 | 75,846 | 75,847 | 75,848 | 75,849 | 75,850 |
| 2-185 | 75,864 | 75,865 | 75,866 | 75,867 | 75,868 | 75,869 | 75,870 | 75,871 | 75,872 | 75,873 | 75,874 | 75,875 |
| 2-186 | 75,889 | 75,890 | 75,891 | 75,892 | 75,893 | 75,894 | 75,895 | 75,896 | 75,897 | 75,898 | 75,899 | 75,900 |
| 2-187 | 75,914 | 75,915 | 75,916 | 75,917 | 75,918 | 75,919 | 75,920 | 75,921 | 75,922 | 75,923 | 75,924 | 75,925 |
| 2-188 | 75,939 | 75,940 | 75,941 | 75,942 | 75,943 | 75,944 | 75,945 | 75,946 | 75,947 | 75,948 | 75,949 | 75,950 |
| 2-189 | 75,964 | 75,965 | 75,966 | 75,967 | 75,968 | 75,969 | 75,970 | 75,971 | 75,972 | 75,973 | 75,974 | 75,975 |
| 2-190 | 75,989 | 75,990 | 75,991 | 75,992 | 75,993 | 75,994 | 75,995 | 75,996 | 75,997 | 75,998 | 75,999 | 76,000 |
| 2-191 | 76,014 | 76,015 | 76,016 | 76,017 | 76,018 | 76,019 | 76,020 | 76,021 | 76,022 | 76,023 | 76,024 | 76,025 |
| 2-192 | 76,039 | 76,040 | 76,041 | 76,042 | 76,043 | 76,044 | 76,045 | 76,046 | 76,047 | 76,048 | 76,049 | 76,050 |
| 2-193 | 76,064 | 76,065 | 76,066 | 76,067 | 76,068 | 76,069 | 76,070 | 76,071 | 76,072 | 76,073 | 76,074 | 76,075 |
| 2-194 | 76,089 | 76,090 | 76,091 | 76,092 | 76,093 | 76,094 | 76,095 | 76,096 | 76,097 | 76,098 | 76,099 | 76,100 |
| 2-195 | 76,114 | 76,115 | 76,116 | 76,117 | 76,118 | 76,119 | 76,120 | 76,121 | 76,122 | 76,123 | 76,124 | 76,125 |
| 2-196 | 76,139 | 76,140 | 76,141 | 76,142 | 76,143 | 76,144 | 76,145 | 76,146 | 76,147 | 76,148 | 76,149 | 76,150 |
| 2-197 | 76,164 | 76,165 | 76,166 | 76,167 | 76,168 | 76,169 | 76,170 | 76,171 | 76,172 | 76,173 | 76,174 | 76,175 |
| 2-198 | 76,189 | 76,190 | 76,191 | 76,192 | 76,193 | 76,194 | 76,195 | 76,196 | 76,197 | 76,198 | 76,199 | 76,200 |
| 2-199 | 76,214 | 76,215 | 76,216 | 76,217 | 76,218 | 76,219 | 76,220 | 76,221 | 76,222 | 76,223 | 76,224 | 76,225 |
| 2-200 | 76,239 | 76,240 | 76,241 | 76,242 | 76,243 | 76,244 | 76,245 | 76,246 | 76,247 | 76,248 | 76,249 | 76,250 |
| 2-201 | 76,264 | 76,265 | 76,266 | 76,267 | 76,268 | 76,269 | 76,270 | 76,271 | 76,272 | 76,273 | 76,274 | 76,275 |
| 2-202 | 76,289 | 76,290 | 76,291 | 76,292 | 76,293 | 76,294 | 76,295 | 76,296 | 76,297 | 76,298 | 76,299 | 76,300 |
| 2-203 | 76,314 | 76,315 | 76,316 | 76,317 | 76,318 | 76,319 | 76,320 | 76,321 | 76,322 | 76,323 | 76,324 | 76,325 |
| 2-204 | 76,339 | 76,340 | 76,341 | 76,342 | 76,343 | 76,344 | 76,345 | 76,346 | 76,347 | 76,348 | 76,349 | 76,350 |
| 2-205 | 76,364 | 76,365 | 76,366 | 76,367 | 76,368 | 76,369 | 76,370 | 76,371 | 76,372 | 76,373 | 76,374 | 76,375 |
| 2-206 | 76,389 | 76,390 | 76,391 | 76,392 | 76,393 | 76,394 | 76,395 | 76,396 | 76,397 | 76,398 | 76,399 | 76,400 |
| 2-207 | 76,414 | 76,415 | 76,416 | 76,417 | 76,418 | 76,419 | 76,420 | 76,421 | 76,422 | 76,423 | 76,424 | 76,425 |
| 2-208 | 76,439 | 76,440 | 76,441 | 76,442 | 76,443 | 76,444 | 76,445 | 76,446 | 76,447 | 76,448 | 76,449 | 76,450 |
| 2-209 | 76,464 | 76,465 | 76,466 | 76,467 | 76,468 | 76,469 | 76,470 | 76,471 | 76,472 | 76,473 | 76,474 | 76,475 |
| 2-210 | 76,489 | 76,490 | 76,491 | 76,492 | 76,493 | 76,494 | 76,495 | 76,496 | 76,497 | 76,498 | 76,499 | 76,500 |
| 2-211 | 76,514 | 76,515 | 76,516 | 76,517 | 76,518 | 76,519 | 76,520 | 76,521 | 76,522 | 76,523 | 76,524 | 76,525 |
| 2-212 | 76,539 | 76,540 | 76,541 | 76,542 | 76,543 | 76,544 | 76,545 | 76,546 | 76,547 | 76,548 | 76,549 | 76,550 |
| 2-213 | 76,564 | 76,565 | 76,566 | 76,567 | 76,568 | 76,569 | 76,570 | 76,571 | 76,572 | 76,573 | 76,574 | 76,575 |
| 2-214 | 76,589 | 76,590 | 76,591 | 76,592 | 76,593 | 76,594 | 76,595 | 76,596 | 76,597 | 76,598 | 76,599 | 76,600 |
| 2-215 | 76,614 | 76,615 | 76,616 | 76,617 | 76,618 | 76,619 | 76,620 | 76,621 | 76,622 | 76,623 | 76,624 | 76,625 |
| 2-216 | 76,639 | 76,640 | 76,641 | 76,642 | 76,643 | 76,644 | 76,645 | 76,646 | 76,647 | 76,648 | 76,649 | 76,650 |
| 2-217 | 76,664 | 76,665 | 76,666 | 76,667 | 76,668 | 76,669 | 76,670 | 76,671 | 76,672 | 76,673 | 76,674 | 76,675 |
| 2-218 | 76,689 | 76,690 | 76,691 | 76,692 | 76,693 | 76,694 | 76,695 | 76,696 | 76,697 | 76,698 | 76,699 | 76,700 |
| 2-219 | 76,714 | 76,715 | 76,716 | 76,717 | 76,718 | 76,719 | 76,720 | 76,721 | 76,722 | 76,723 | 76,724 | 76,725 |
| 2-220 | 76,739 | 76,740 | 76,741 | 76,742 | 76,743 | 76,744 | 76,745 | 76,746 | 76,747 | 76,748 | 76,749 | 76,750 |

TABLE 59

| | | Compound represented by the formula (1) | | | | | | | | | | | | |
|---|---|---|---|---|---|---|---|---|---|---|---|---|---|---|
| | | 1-151 | 1-152 | 1-153 | 1-154 | 1-155 | 1-156 | 1-157 | 1-158 | 1-159 | 1-160 | 1-161 | 1-162 | 1-163 |
| Compound represented by the formula (2) | 2-221 | 76,751 | 76,752 | 76,753 | 76,754 | 76,755 | 76,756 | 76,757 | 76,758 | 76,759 | 76,760 | 76,761 | 76,762 | 76,763 |
| | 2-222 | 76,776 | 76,777 | 76,778 | 76,779 | 76,780 | 76,781 | 76,782 | 76,783 | 76,784 | 76,785 | 76,786 | 76,787 | 76,788 |
| | 2-223 | 76,801 | 76,802 | 76,803 | 76,804 | 76,805 | 76,806 | 76,807 | 76,808 | 76,809 | 76,810 | 76,811 | 76,812 | 76,813 |
| | 2-224 | 76,826 | 76,827 | 76,828 | 76,829 | 76,830 | 76,831 | 76,832 | 76,833 | 76,834 | 76,835 | 76,836 | 76,837 | 76,838 |
| | 2-225 | 76,851 | 76,852 | 76,853 | 76,854 | 76,855 | 76,856 | 76,857 | 76,858 | 76,859 | 76,860 | 76,861 | 76,862 | 76,863 |
| | 2-226 | 76,876 | 76,877 | 76,878 | 76,879 | 76,880 | 76,881 | 76,882 | 76,883 | 76,884 | 76,885 | 76,886 | 76,887 | 76,888 |
| | 2-227 | 76,901 | 76,902 | 76,903 | 76,904 | 76,905 | 76,906 | 76,907 | 76,908 | 76,909 | 76,910 | 76,911 | 76,912 | 76,913 |
| | 2-228 | 76,926 | 76,927 | 76,928 | 76,929 | 76,930 | 76,931 | 76,932 | 76,933 | 76,934 | 76,935 | 76,936 | 76,937 | 76,938 |
| | 2-229 | 76,951 | 76,952 | 76,953 | 76,954 | 76,955 | 76,956 | 76,957 | 76,958 | 76,959 | 76,960 | 76,961 | 76,962 | 76,963 |
| | 2-230 | 76,976 | 76,977 | 76,978 | 76,979 | 76,980 | 76,981 | 76,982 | 76,983 | 76,984 | 76,985 | 76,986 | 76,987 | 76,988 |
| | 2-231 | 77,001 | 77,002 | 77,003 | 77,004 | 77,005 | 77,006 | 77,007 | 77,008 | 77,009 | 77,010 | 77,011 | 77,012 | 77,013 |
| | 2-232 | 77,026 | 77,027 | 77,028 | 77,029 | 77,030 | 77,031 | 77,032 | 77,033 | 77,034 | 77,035 | 77,036 | 77,037 | 77,038 |
| | 2-233 | 77,051 | 77,052 | 77,053 | 77,054 | 77,055 | 77,056 | 77,057 | 77,058 | 77,059 | 77,060 | 77,061 | 77,062 | 77,063 |
| | 2-234 | 77,076 | 77,077 | 77,078 | 77,079 | 77,080 | 77,081 | 77,082 | 77,083 | 77,084 | 77,085 | 77,086 | 77,087 | 77,088 |
| | 2-235 | 77,101 | 77,102 | 77,103 | 77,104 | 77,105 | 77,106 | 77,107 | 77,108 | 77,109 | 77,110 | 77,111 | 77,112 | 77,113 |
| | 2-236 | 77,126 | 77,127 | 77,128 | 77,129 | 77,130 | 77,131 | 77,132 | 77,133 | 77,134 | 77,135 | 77,136 | 77,137 | 77,138 |
| | 2-237 | 77,151 | 77,152 | 77,153 | 77,154 | 77,155 | 77,156 | 77,157 | 77,158 | 77,159 | 77,160 | 77,161 | 77,162 | 77,163 |
| | 2-238 | 77,176 | 77,177 | 77,178 | 77,179 | 77,180 | 77,181 | 77,182 | 77,183 | 77,184 | 77,185 | 77,186 | 77,187 | 77,188 |
| | 2-239 | 77,201 | 77,202 | 77,203 | 77,204 | 77,205 | 77,206 | 77,207 | 77,208 | 77,209 | 77,210 | 77,211 | 77,212 | 77,213 |
| | 2-240 | 77,226 | 77,227 | 77,228 | 77,229 | 77,230 | 77,231 | 77,232 | 77,233 | 77,234 | 77,235 | 77,236 | 77,237 | 77,238 |
| | 2-241 | 77,251 | 77,252 | 77,253 | 77,254 | 77,255 | 77,256 | 77,257 | 77,258 | 77,259 | 77,260 | 77,261 | 77,262 | 77,263 |

TABLE 59-continued

| | | | | | | | | | | | | | |
|---|---|---|---|---|---|---|---|---|---|---|---|---|---|
| 2-242 | 77,276 | 77,277 | 77,278 | 77,279 | 77,280 | 77,281 | 77,282 | 77,283 | 77,284 | 77,285 | 77,286 | 77,287 | 77,288 |
| 2-243 | 77,301 | 77,302 | 77,303 | 77,304 | 77,305 | 77,306 | 77,307 | 77,308 | 77,309 | 77,310 | 77,311 | 77,312 | 77,313 |
| 2-244 | 77,326 | 77,327 | 77,328 | 77,329 | 77,330 | 77,331 | 77,332 | 77,333 | 77,334 | 77,335 | 77,336 | 77,337 | 77,338 |
| 2-245 | 77,351 | 77,352 | 77,353 | 77,354 | 77,355 | 77,356 | 77,357 | 77,358 | 77,359 | 77,360 | 77,361 | 77,362 | 77,363 |
| 2-246 | 77,376 | 77,377 | 77,378 | 77,379 | 77,380 | 77,381 | 77,382 | 77,383 | 77,384 | 77,385 | 77,386 | 77,387 | 77,388 |
| 2-247 | 77,401 | 77,402 | 77,403 | 77,404 | 77,405 | 77,406 | 77,407 | 77,408 | 77,409 | 77,410 | 77,411 | 77,412 | 77,413 |
| 2-248 | 77,426 | 77,427 | 77,428 | 77,429 | 77,430 | 77,431 | 77,432 | 77,433 | 77,434 | 77,435 | 77,436 | 77,437 | 77,438 |
| 2-249 | 77,451 | 77,452 | 77,453 | 77,454 | 77,455 | 77,456 | 77,457 | 77,458 | 77,459 | 77,460 | 77,461 | 77,462 | 77,463 |
| 2-250 | 77,476 | 77,477 | 77,478 | 77,479 | 77,480 | 77,481 | 77,482 | 77,483 | 77,484 | 77,485 | 77,486 | 77,487 | 77,488 |
| 2-251 | 77,501 | 77,502 | 77,503 | 77,504 | 77,505 | 77,506 | 77,507 | 77,508 | 77,509 | 77,510 | 77,511 | 77,512 | 77,513 |
| 2-252 | 77,526 | 77,527 | 77,528 | 77,529 | 77,530 | 77,531 | 77,532 | 77,533 | 77,534 | 77,535 | 77,536 | 77,537 | 77,538 |
| 2-253 | 77,551 | 77,552 | 77,553 | 77,554 | 77,555 | 77,556 | 77,557 | 77,558 | 77,559 | 77,560 | 77,561 | 77,562 | 77,563 |
| 2-254 | 77,576 | 77,577 | 77,578 | 77,579 | 77,580 | 77,581 | 77,582 | 77,583 | 77,584 | 77,585 | 77,586 | 77,587 | 77,588 |
| 2-255 | 77,601 | 77,602 | 77,603 | 77,604 | 77,605 | 77,606 | 77,607 | 77,608 | 77,609 | 77,610 | 77,611 | 77,612 | 77,613 |
| 2-256 | 77,626 | 77,627 | 77,628 | 77,629 | 77,630 | 77,631 | 77,632 | 77,633 | 77,634 | 77,635 | 77,636 | 77,637 | 77,638 |
| 2-257 | 77,651 | 77,652 | 77,653 | 77,654 | 77,655 | 77,656 | 77,657 | 77,658 | 77,659 | 77,660 | 77,661 | 77,662 | 77,663 |
| 2-258 | 77,676 | 77,677 | 77,678 | 77,679 | 77,680 | 77,681 | 77,682 | 77,683 | 77,684 | 77,685 | 77,686 | 77,687 | 77,688 |
| 2-259 | 77,701 | 77,702 | 77,703 | 77,704 | 77,705 | 77,706 | 77,707 | 77,708 | 77,709 | 77,710 | 77,711 | 77,712 | 77,713 |
| 2-260 | 77,726 | 77,727 | 77,728 | 77,729 | 77,730 | 77,731 | 77,732 | 77,733 | 77,734 | 77,735 | 77,736 | 77,737 | 77,738 |
| 2-261 | 77,751 | 77,752 | 77,753 | 77,754 | 77,755 | 77,756 | 77,757 | 77,758 | 77,759 | 77,760 | 77,761 | 77,762 | 77,763 |
| 2-262 | 77,776 | 77,777 | 77,778 | 77,779 | 77,780 | 77,781 | 77,782 | 77,783 | 77,784 | 77,785 | 77,786 | 77,787 | 77,788 |
| 2-263 | 77,801 | 77,802 | 77,803 | 77,804 | 77,805 | 77,806 | 77,807 | 77,808 | 77,809 | 77,810 | 77,811 | 77,812 | 77,813 |
| 2-264 | 77,826 | 77,827 | 77,828 | 77,829 | 77,830 | 77,831 | 77,832 | 77,833 | 77,834 | 77,835 | 77,836 | 77,837 | 77,838 |
| 2-265 | 77,851 | 77,852 | 77,853 | 77,854 | 77,855 | 77,856 | 77,857 | 77,858 | 77,859 | 77,860 | 77,861 | 77,862 | 77,863 |
| 2-266 | 77,876 | 77,877 | 77,878 | 77,879 | 77,880 | 77,881 | 77,882 | 77,883 | 77,884 | 77,885 | 77,886 | 77,887 | 77,888 |
| 2-267 | 77,901 | 77,902 | 77,903 | 77,904 | 77,905 | 77,906 | 77,907 | 77,908 | 77,909 | 77,910 | 77,911 | 77,912 | 77,913 |
| 2-268 | 77,926 | 77,927 | 77,928 | 77,929 | 77,930 | 77,931 | 77,932 | 77,933 | 77,934 | 77,935 | 77,936 | 77,937 | 77,938 |
| 2-269 | 77,951 | 77,952 | 77,953 | 77,954 | 77,955 | 77,956 | 77,957 | 77,958 | 77,959 | 77,960 | 77,961 | 77,962 | 77,963 |
| 2-270 | 77,976 | 77,977 | 77,978 | 77,979 | 77,980 | 77,981 | 77,982 | 77,983 | 77,984 | 77,985 | 77,986 | 77,987 | 77,988 |
| 2-271 | 78,001 | 78,002 | 78,003 | 78,004 | 78,005 | 78,006 | 78,007 | 78,008 | 78,009 | 78,010 | 78,011 | 78,012 | 78,013 |
| 2-272 | 78,026 | 78,027 | 78,028 | 78,029 | 78,030 | 78,031 | 78,032 | 78,033 | 78,034 | 78,035 | 78,036 | 78,037 | 78,038 |
| 2-273 | 78,051 | 78,052 | 78,053 | 78,054 | 78,055 | 78,056 | 78,057 | 78,058 | 78,059 | 78,060 | 78,061 | 78,062 | 78,063 |
| 2-274 | 78,076 | 78,077 | 78,078 | 78,079 | 78,080 | 78,081 | 78,082 | 78,083 | 78,084 | 78,085 | 78,086 | 78,087 | 78,088 |
| 2-275 | 78,101 | 78,102 | 78,103 | 78,104 | 78,105 | 78,106 | 78,107 | 78,108 | 78,109 | 78,110 | 78,111 | 78,112 | 78,113 |

| | | Compound represented by the formula (1) | | | | | | | | | | | |
|---|---|---|---|---|---|---|---|---|---|---|---|---|---|
| | | 1-164 | 1-165 | 1-166 | 1-167 | 1-168 | 1-169 | 1-170 | 1-171 | 1-172 | 1-173 | 1-174 | 1-175 |
| Compound represented by the formula (2) | 2-221 | 76,764 | 76,765 | 76,766 | 76,767 | 76,768 | 76,769 | 76,770 | 76,771 | 76,772 | 76,773 | 76,774 | 76,775 |
| | 2-222 | 76,789 | 76,790 | 76,791 | 76,792 | 76,793 | 76,794 | 76,795 | 76,796 | 76,797 | 76,798 | 76,799 | 76,800 |
| | 2-223 | 76,814 | 76,815 | 76,816 | 76,817 | 76,818 | 76,819 | 76,820 | 76,821 | 76,822 | 76,823 | 76,824 | 76,825 |
| | 2-224 | 76,839 | 76,840 | 76,841 | 76,842 | 76,843 | 76,844 | 76,845 | 76,846 | 76,847 | 76,848 | 76,849 | 76,850 |
| | 2-225 | 76,864 | 76,865 | 76,866 | 76,867 | 76,868 | 76,869 | 76,870 | 76,871 | 76,872 | 76,873 | 76,874 | 76,875 |
| | 2-226 | 76,889 | 76,890 | 76,891 | 76,892 | 76,893 | 76,894 | 76,895 | 76,896 | 76,897 | 76,898 | 76,899 | 76,900 |
| | 2-227 | 76,914 | 76,915 | 76,916 | 76,917 | 76,918 | 76,919 | 76,920 | 76,921 | 76,922 | 76,923 | 76,924 | 76,925 |
| | 2-228 | 76,939 | 76,940 | 76,941 | 76,942 | 76,943 | 76,944 | 76,945 | 76,946 | 76,947 | 76,948 | 76,949 | 76,950 |
| | 2-229 | 76,964 | 76,965 | 76,966 | 76,967 | 76,968 | 76,969 | 76,970 | 76,971 | 76,972 | 76,973 | 76,974 | 76,975 |
| | 2-230 | 76,989 | 76,990 | 76,991 | 76,992 | 76,993 | 76,994 | 76,995 | 76,996 | 76,997 | 76,998 | 76,999 | 77,000 |
| | 2-231 | 77,014 | 77,015 | 77,016 | 77,017 | 77,018 | 77,019 | 77,020 | 77,021 | 77,022 | 77,023 | 77,024 | 77,025 |
| | 2-232 | 77,039 | 77,040 | 77,041 | 77,042 | 77,043 | 77,044 | 77,045 | 77,046 | 77,047 | 77,048 | 77,049 | 77,050 |
| | 2-233 | 77,064 | 77,065 | 77,066 | 77,067 | 77,068 | 77,069 | 77,070 | 77,071 | 77,072 | 77,073 | 77,074 | 77,075 |
| | 2-234 | 77,089 | 77,090 | 77,091 | 77,092 | 77,093 | 77,094 | 77,095 | 77,096 | 77,097 | 77,098 | 77,099 | 77,100 |
| | 2-235 | 77,114 | 77,115 | 77,116 | 77,117 | 77,118 | 77,119 | 77,120 | 77,121 | 77,122 | 77,123 | 77,124 | 77,125 |
| | 2-236 | 77,139 | 77,140 | 77,141 | 77,142 | 77,143 | 77,144 | 77,145 | 77,146 | 77,147 | 77,148 | 77,149 | 77,150 |
| | 2-237 | 77,164 | 77,165 | 77,166 | 77,167 | 77,168 | 77,169 | 77,170 | 77,171 | 77,172 | 77,173 | 77,174 | 77,175 |
| | 2-238 | 77,189 | 77,190 | 77,191 | 77,192 | 77,193 | 77,194 | 77,195 | 77,196 | 77,197 | 77,198 | 77,199 | 77,200 |
| | 2-239 | 77,214 | 77,215 | 77,216 | 77,217 | 77,218 | 77,219 | 77,220 | 77,221 | 77,222 | 77,223 | 77,224 | 77,225 |
| | 2-240 | 77,239 | 77,240 | 77,241 | 77,242 | 77,243 | 77,244 | 77,245 | 77,246 | 77,247 | 77,248 | 77,249 | 77,250 |
| | 2-241 | 77,264 | 77,265 | 77,266 | 77,267 | 77,268 | 77,269 | 77,270 | 77,271 | 77,272 | 77,273 | 77,274 | 77,275 |
| | 2-242 | 77,289 | 77,290 | 77,291 | 77,292 | 77,293 | 77,294 | 77,295 | 77,296 | 77,297 | 77,298 | 77,299 | 77,300 |
| | 2-243 | 77,314 | 77,315 | 77,316 | 77,317 | 77,318 | 77,319 | 77,320 | 77,321 | 77,322 | 77,323 | 77,324 | 77,325 |
| | 2-244 | 77,339 | 77,340 | 77,341 | 77,342 | 77,343 | 77,344 | 77,345 | 77,346 | 77,347 | 77,348 | 77,349 | 77,350 |
| | 2-245 | 77,364 | 77,365 | 77,366 | 77,367 | 77,368 | 77,369 | 77,370 | 77,371 | 77,372 | 77,373 | 77,374 | 77,375 |
| | 2-246 | 77,389 | 77,390 | 77,391 | 77,392 | 77,393 | 77,394 | 77,395 | 77,396 | 77,397 | 77,398 | 77,399 | 77,400 |
| | 2-247 | 77,414 | 77,415 | 77,416 | 77,417 | 77,418 | 77,419 | 77,420 | 77,421 | 77,422 | 77,423 | 77,424 | 77,425 |
| | 2-248 | 77,439 | 77,440 | 77,441 | 77,442 | 77,443 | 77,444 | 77,445 | 77,446 | 77,447 | 77,448 | 77,449 | 77,450 |
| | 2-249 | 77,464 | 77,465 | 77,466 | 77,467 | 77,468 | 77,469 | 77,470 | 77,471 | 77,472 | 77,473 | 77,474 | 77,475 |
| | 2-250 | 77,489 | 77,490 | 77,491 | 77,492 | 77,493 | 77,494 | 77,495 | 77,496 | 77,497 | 77,498 | 77,499 | 77,500 |
| | 2-251 | 77,514 | 77,515 | 77,516 | 77,517 | 77,518 | 77,519 | 77,520 | 77,521 | 77,522 | 77,523 | 77,524 | 77,525 |
| | 2-252 | 77,539 | 77,540 | 77,541 | 77,542 | 77,543 | 77,544 | 77,545 | 77,546 | 77,547 | 77,548 | 77,549 | 77,550 |
| | 2-253 | 77,564 | 77,565 | 77,566 | 77,567 | 77,568 | 77,569 | 77,570 | 77,571 | 77,572 | 77,573 | 77,574 | 77,575 |
| | 2-254 | 77,589 | 77,590 | 77,591 | 77,592 | 77,593 | 77,594 | 77,595 | 77,596 | 77,597 | 77,598 | 77,599 | 77,600 |
| | 2-255 | 77,614 | 77,615 | 77,616 | 77,617 | 77,618 | 77,619 | 77,620 | 77,621 | 77,622 | 77,623 | 77,624 | 77,625 |
| | 2-256 | 77,639 | 77,640 | 77,641 | 77,642 | 77,643 | 77,644 | 77,645 | 77,646 | 77,647 | 77,648 | 77,649 | 77,650 |
| | 2-257 | 77,664 | 77,665 | 77,666 | 77,667 | 77,668 | 77,669 | 77,670 | 77,671 | 77,672 | 77,673 | 77,674 | 77,675 |
| | 2-258 | 77,689 | 77,690 | 77,691 | 77,692 | 77,693 | 77,694 | 77,695 | 77,696 | 77,697 | 77,698 | 77,699 | 77,700 |
| | 2-259 | 77,714 | 77,715 | 77,716 | 77,717 | 77,718 | 77,719 | 77,720 | 77,721 | 77,722 | 77,723 | 77,724 | 77,725 |
| | 2-260 | 77,739 | 77,740 | 77,741 | 77,742 | 77,743 | 77,744 | 77,745 | 77,746 | 77,747 | 77,748 | 77,749 | 77,750 |
| | 2-261 | 77,764 | 77,765 | 77,766 | 77,767 | 77,768 | 77,769 | 77,770 | 77,771 | 77,772 | 77,773 | 77,774 | 77,775 |

TABLE 59-continued

| | | | | | | | | | | | | |
|---|---|---|---|---|---|---|---|---|---|---|---|---|
| 2-262 | 77,789 | 77,790 | 77,791 | 77,792 | 77,793 | 77,794 | 77,795 | 77,796 | 77,797 | 77,798 | 77,799 | 77,800 |
| 2-263 | 77,814 | 77,815 | 77,816 | 77,817 | 77,818 | 77,819 | 77,820 | 77,821 | 77,822 | 77,823 | 77,824 | 77,825 |
| 2-264 | 77,839 | 77,840 | 77,841 | 77,842 | 77,843 | 77,844 | 77,845 | 77,846 | 77,847 | 77,848 | 77,849 | 77,850 |
| 2-265 | 77,864 | 77,865 | 77,866 | 77,867 | 77,868 | 77,869 | 77,870 | 77,871 | 77,872 | 77,873 | 77,874 | 77,875 |
| 2-266 | 77,889 | 77,890 | 77,891 | 77,892 | 77,893 | 77,894 | 77,895 | 77,896 | 77,897 | 77,898 | 77,899 | 77,900 |
| 2-267 | 77,914 | 77,915 | 77,916 | 77,917 | 77,918 | 77,919 | 77,920 | 77,921 | 77,922 | 77,923 | 77,924 | 77,925 |
| 2-268 | 77,939 | 77,940 | 77,941 | 77,942 | 77,943 | 77,944 | 77,945 | 77,946 | 77,947 | 77,948 | 77,949 | 77,950 |
| 2-269 | 77,964 | 77,965 | 77,966 | 77,967 | 77,968 | 77,969 | 77,970 | 77,971 | 77,972 | 77,973 | 77,974 | 77,975 |
| 2-270 | 77,989 | 77,990 | 77,991 | 77,992 | 77,993 | 77,994 | 77,995 | 77,996 | 77,997 | 77,998 | 77,999 | 78,000 |
| 2-271 | 78,014 | 78,015 | 78,016 | 78,017 | 78,018 | 78,019 | 78,020 | 78,021 | 78,022 | 78,023 | 78,024 | 78,025 |
| 2-272 | 78,039 | 78,040 | 78,041 | 78,042 | 78,043 | 78,044 | 78,045 | 78,046 | 78,047 | 78,048 | 78,049 | 78,050 |
| 2-273 | 78,064 | 78,065 | 78,066 | 78,067 | 78,068 | 78,069 | 78,070 | 78,071 | 78,072 | 78,073 | 78,074 | 78,075 |
| 2-274 | 78,089 | 78,090 | 78,091 | 78,092 | 78,093 | 78,094 | 78,095 | 78,096 | 78,097 | 78,098 | 78,099 | 78,100 |
| 2-275 | 78,114 | 78,115 | 78,116 | 78,117 | 78,118 | 78,119 | 78,120 | 78,121 | 78,122 | 78,123 | 78,124 | 78,125 |

TABLE 60

| | | Compound represented by the formula (1) | | | | | | | | | | | | |
|---|---|---|---|---|---|---|---|---|---|---|---|---|---|---|
| | | 1-151 | 1-152 | 1-153 | 1-154 | 1-155 | 1-156 | 1-157 | 1-158 | 1-159 | 1-160 | 1-161 | 1-162 | 1-163 |
| Compound represented by the formula (2) | 2-276 | 78,126 | 78,127 | 78,128 | 78,129 | 78,130 | 78,131 | 78,132 | 78,133 | 78,134 | 78,135 | 78,136 | 78,137 | 78,138 |
| | 2-277 | 78,151 | 78,152 | 78,153 | 78,154 | 78,155 | 78,156 | 78,157 | 78,158 | 78,159 | 78,160 | 78,161 | 78,162 | 78,163 |
| | 2-278 | 78,176 | 78,177 | 78,178 | 78,179 | 78,180 | 78,181 | 78,182 | 78,183 | 78,184 | 78,185 | 78,186 | 78,187 | 78,188 |
| | 2-279 | 78,201 | 78,202 | 78,203 | 78,204 | 78,205 | 78,206 | 78,207 | 78,208 | 78,209 | 78,210 | 78,211 | 78,212 | 78,213 |
| | 2-280 | 78,226 | 78,227 | 78,228 | 78,229 | 78,230 | 78,231 | 78,232 | 78,233 | 78,234 | 78,235 | 78,236 | 78,237 | 78,238 |
| | 2-281 | 78,251 | 78,252 | 78,253 | 78,254 | 78,255 | 78,256 | 78,257 | 78,258 | 78,259 | 78,260 | 78,261 | 78,262 | 78,263 |
| | 2-282 | 78,276 | 78,277 | 78,278 | 78,279 | 78,280 | 78,281 | 78,282 | 78,283 | 78,284 | 78,285 | 78,286 | 78,287 | 78,288 |
| | 2-283 | 78,301 | 78,302 | 78,303 | 78,304 | 78,305 | 78,306 | 78,307 | 78,308 | 78,309 | 78,310 | 78,311 | 78,312 | 78,313 |
| | 2-284 | 78,326 | 78,327 | 78,328 | 78,329 | 78,330 | 78,331 | 78,332 | 78,333 | 78,334 | 78,335 | 78,336 | 78,337 | 78,338 |
| | 2-285 | 78,351 | 78,352 | 78,353 | 78,354 | 78,355 | 78,356 | 78,357 | 78,358 | 78,359 | 78,360 | 78,361 | 78,362 | 78,363 |
| | 2-286 | 78,376 | 78,377 | 78,378 | 78,379 | 78,380 | 78,381 | 78,382 | 78,383 | 78,384 | 78,385 | 78,386 | 78,387 | 78,388 |
| | 2-287 | 78,401 | 78,402 | 78,403 | 78,404 | 78,405 | 78,406 | 78,407 | 78,408 | 78,409 | 78,410 | 78,411 | 78,412 | 78,413 |
| | 2-288 | 78,426 | 78,427 | 78,428 | 78,429 | 78,430 | 78,431 | 78,432 | 78,433 | 78,434 | 78,435 | 78,436 | 78,437 | 78,438 |
| | 2-289 | 78,451 | 78,452 | 78,453 | 78,454 | 78,455 | 78,456 | 78,457 | 78,458 | 78,459 | 78,460 | 78,461 | 78,462 | 78,463 |
| | 2-290 | 78,476 | 78,477 | 78,478 | 78,479 | 78,480 | 78,481 | 78,482 | 78,483 | 78,484 | 78,485 | 78,486 | 78,487 | 78,488 |
| | 2-291 | 78,501 | 78,502 | 78,503 | 78,504 | 78,505 | 78,506 | 78,507 | 78,508 | 78,509 | 78,510 | 78,511 | 78,512 | 78,513 |
| | 2-292 | 78,526 | 78,527 | 78,528 | 78,529 | 78,530 | 78,531 | 78,532 | 78,533 | 78,534 | 78,535 | 78,536 | 78,537 | 78,538 |
| | 2-293 | 78,551 | 78,552 | 78,553 | 78,554 | 78,555 | 78,556 | 78,557 | 78,558 | 78,559 | 78,560 | 78,561 | 78,562 | 78,563 |
| | 2-294 | 78,576 | 78,577 | 78,578 | 78,579 | 78,580 | 78,581 | 78,582 | 78,583 | 78,584 | 78,585 | 78,586 | 78,587 | 78,588 |
| | 2-295 | 78,601 | 78,602 | 78,603 | 78,604 | 78,605 | 78,606 | 78,607 | 78,608 | 78,609 | 78,610 | 78,611 | 78,612 | 78,613 |
| | 2-296 | 78,626 | 78,627 | 78,628 | 78,629 | 78,630 | 78,631 | 78,632 | 78,633 | 78,634 | 78,635 | 78,636 | 78,637 | 78,638 |
| | 2-297 | 78,651 | 78,652 | 78,653 | 78,654 | 78,655 | 78,656 | 78,657 | 78,658 | 78,659 | 78,660 | 78,661 | 78,662 | 78,663 |
| | 2-298 | 78,676 | 78,677 | 78,678 | 78,679 | 78,680 | 78,681 | 78,682 | 78,683 | 78,684 | 78,685 | 78,686 | 78,687 | 78,688 |
| | 2-299 | 78,701 | 78,702 | 78,703 | 78,704 | 78,705 | 78,706 | 78,707 | 78,708 | 78,709 | 78,710 | 78,711 | 78,712 | 78,713 |
| | 2-300 | 78,726 | 78,727 | 78,728 | 78,729 | 78,730 | 78,731 | 78,732 | 78,733 | 78,734 | 78,735 | 78,736 | 78,737 | 78,738 |
| | 2-301 | 78,751 | 78,752 | 78,753 | 78,754 | 78,755 | 78,756 | 78,757 | 78,758 | 78,759 | 78,760 | 78,761 | 78,762 | 78,763 |
| | 2-302 | 78,776 | 78,777 | 78,778 | 78,779 | 78,780 | 78,781 | 78,782 | 78,783 | 78,784 | 78,785 | 78,786 | 78,787 | 78,788 |
| | 2-303 | 78,801 | 78,802 | 78,803 | 78,804 | 78,805 | 78,806 | 78,807 | 78,808 | 78,809 | 78,810 | 78,811 | 78,812 | 78,813 |
| | 2-304 | 78,826 | 78,827 | 78,828 | 78,829 | 78,830 | 78,831 | 78,832 | 78,833 | 78,834 | 78,835 | 78,836 | 78,837 | 78,838 |
| | 2-305 | 78,851 | 78,852 | 78,853 | 78,854 | 78,855 | 78,856 | 78,857 | 78,858 | 78,859 | 78,860 | 78,861 | 78,862 | 78,863 |
| | 2-306 | 78,876 | 78,877 | 78,878 | 78,879 | 78,880 | 78,881 | 78,882 | 78,883 | 78,884 | 78,885 | 78,886 | 78,887 | 78,888 |
| | 2-307 | 78,901 | 78,902 | 78,903 | 78,904 | 78,905 | 78,906 | 78,907 | 78,908 | 78,909 | 78,910 | 78,911 | 78,912 | 78,913 |
| | 2-308 | 78,926 | 78,927 | 78,928 | 78,929 | 78,930 | 78,931 | 78,932 | 78,933 | 78,934 | 78,935 | 78,936 | 78,937 | 78,938 |
| | 2-309 | 78,951 | 78,952 | 78,953 | 78,954 | 78,955 | 78,956 | 78,957 | 78,958 | 78,959 | 78,960 | 78,961 | 78,962 | 78,963 |
| | 2-310 | 78,976 | 78,977 | 78,978 | 78,979 | 78,980 | 78,981 | 78,982 | 78,983 | 78,984 | 78,985 | 78,986 | 78,987 | 78,988 |
| | 2-311 | 79,001 | 79,002 | 79,003 | 79,004 | 79,005 | 79,006 | 79,007 | 79,008 | 79,009 | 79,010 | 79,011 | 79,012 | 79,013 |
| | 2-312 | 79,026 | 79,027 | 79,028 | 79,029 | 79,030 | 79,031 | 79,032 | 79,033 | 79,034 | 79,035 | 79,036 | 79,037 | 79,038 |
| | 2-313 | 79,051 | 79,052 | 79,053 | 79,054 | 79,055 | 79,056 | 79,057 | 79,058 | 79,059 | 79,060 | 79,061 | 79,062 | 79,063 |
| | 2-314 | 79,076 | 79,077 | 79,078 | 79,079 | 79,080 | 79,081 | 79,082 | 79,083 | 79,084 | 79,085 | 79,086 | 79,087 | 79,088 |
| | 2-315 | 79,101 | 79,102 | 79,103 | 79,104 | 79,105 | 79,106 | 79,107 | 79,108 | 79,109 | 79,110 | 79,111 | 79,112 | 79,113 |
| | 2-316 | 79,126 | 79,127 | 79,128 | 79,129 | 79,130 | 79,131 | 79,132 | 79,133 | 79,134 | 79,135 | 79,136 | 79,137 | 79,138 |
| | 2-317 | 79,151 | 79,152 | 79,153 | 79,154 | 79,155 | 79,156 | 79,157 | 79,158 | 79,159 | 79,160 | 79,161 | 79,162 | 79,163 |
| | 2-318 | 79,176 | 79,177 | 79,178 | 79,179 | 79,180 | 79,181 | 79,182 | 79,183 | 79,184 | 79,185 | 79,186 | 79,187 | 79,188 |
| | 2-319 | 79,201 | 79,202 | 79,203 | 79,204 | 79,205 | 79,206 | 79,207 | 79,208 | 79,209 | 79,210 | 79,211 | 79,212 | 79,213 |
| | 2-320 | 79,226 | 79,227 | 79,228 | 79,229 | 79,230 | 79,231 | 79,232 | 79,233 | 79,234 | 79,235 | 79,236 | 79,237 | 79,238 |
| | 2-321 | 79,251 | 79,252 | 79,253 | 79,254 | 79,255 | 79,256 | 79,257 | 79,258 | 79,259 | 79,260 | 79,261 | 79,262 | 79,263 |
| | 2-322 | 79,276 | 79,277 | 79,278 | 79,279 | 79,280 | 79,281 | 79,282 | 79,283 | 79,284 | 79,285 | 79,286 | 79,287 | 79,288 |
| | 2-323 | 79,301 | 79,302 | 79,303 | 79,304 | 79,305 | 79,306 | 79,307 | 79,308 | 79,309 | 79,310 | 79,311 | 79,312 | 79,313 |
| | 2-324 | 79,326 | 79,327 | 79,328 | 79,329 | 79,330 | 79,331 | 79,332 | 79,333 | 79,334 | 79,335 | 79,336 | 79,337 | 79,338 |
| | 2-325 | 79,351 | 79,352 | 79,353 | 79,354 | 79,355 | 79,356 | 79,357 | 79,358 | 79,359 | 79,360 | 79,361 | 79,362 | 79,363 |
| | 2-326 | 79,376 | 79,377 | 79,378 | 79,379 | 79,380 | 79,381 | 79,382 | 79,383 | 79,384 | 79,385 | 79,386 | 79,387 | 79,388 |
| | 2-327 | 79,401 | 79,402 | 79,403 | 79,404 | 79,405 | 79,406 | 79,407 | 79,408 | 79,409 | 79,410 | 79,411 | 79,412 | 79,413 |
| | 2-328 | 79,426 | 79,427 | 79,428 | 79,429 | 79,430 | 79,431 | 79,432 | 79,433 | 79,434 | 79,435 | 79,436 | 79,437 | 79,438 |
| | 2-329 | 79,451 | 79,452 | 79,453 | 79,454 | 79,455 | 79,456 | 79,457 | 79,458 | 79,459 | 79,460 | 79,461 | 79,462 | 79,463 |
| | 2-330 | 79,476 | 79,477 | 79,478 | 79,479 | 79,480 | 79,481 | 79,482 | 79,483 | 79,484 | 79,485 | 79,486 | 79,487 | 79,488 |

TABLE 60-continued

| | | Compound represented by the formula (1) | | | | | | | | | | | |
|---|---|---|---|---|---|---|---|---|---|---|---|---|---|
| | | 1-164 | 1-165 | 1-166 | 1-167 | 1-168 | 1-169 | 1-170 | 1-171 | 1-172 | 1-173 | 1-174 | 1-175 |
| Compound | 2-276 | 78,139 | 78,140 | 78,141 | 78,142 | 78,143 | 78,144 | 78,145 | 78,146 | 78,147 | 78,148 | 78,149 | 78,150 |
| represented | 2-277 | 78,164 | 78,165 | 78,166 | 78,167 | 78,168 | 78,169 | 78,170 | 78,171 | 78,172 | 78,173 | 78,174 | 78,175 |
| by the | 2-278 | 78,189 | 78,190 | 78,191 | 78,192 | 78,193 | 78,194 | 78,195 | 78,196 | 78,197 | 78,198 | 78,199 | 78,200 |
| formula (2) | 2-279 | 78,214 | 78,215 | 78,216 | 78,217 | 78,218 | 78,219 | 78,220 | 78,221 | 78,222 | 78,223 | 78,224 | 78,225 |
| | 2-280 | 78,239 | 78,240 | 78,241 | 78,242 | 78,243 | 78,244 | 78,245 | 78,246 | 78,247 | 78,248 | 78,249 | 78,250 |
| | 2-281 | 78,264 | 78,265 | 78,266 | 78,267 | 78,268 | 78,269 | 78,270 | 78,271 | 78,272 | 78,273 | 78,274 | 78,275 |
| | 2-282 | 78,289 | 78,290 | 78,291 | 78,292 | 78,293 | 78,294 | 78,295 | 78,296 | 78,297 | 78,298 | 78,299 | 78,300 |
| | 2-283 | 78,314 | 78,315 | 78,316 | 78,317 | 78,318 | 78,319 | 78,320 | 78,321 | 78,322 | 78,323 | 78,324 | 78,325 |
| | 2-284 | 78,339 | 78,340 | 78,341 | 78,342 | 78,343 | 78,344 | 78,345 | 78,346 | 78,347 | 78,348 | 78,349 | 78,350 |
| | 2-285 | 78,364 | 78,365 | 78,366 | 78,367 | 78,368 | 78,369 | 78,370 | 78,371 | 78,372 | 78,373 | 78,374 | 78,375 |
| | 2-286 | 78,389 | 78,390 | 78,391 | 78,392 | 78,393 | 78,394 | 78,395 | 78,396 | 78,397 | 78,398 | 78,399 | 78,400 |
| | 2-287 | 78,414 | 78,415 | 78,416 | 78,417 | 78,418 | 78,419 | 78,420 | 78,421 | 78,422 | 78,423 | 78,424 | 78,425 |
| | 2-288 | 78,439 | 78,440 | 78,441 | 78,442 | 78,443 | 78,444 | 78,445 | 78,446 | 78,447 | 78,448 | 78,449 | 78,450 |
| | 2-289 | 78,464 | 78,465 | 78,466 | 78,467 | 78,468 | 78,469 | 78,470 | 78,471 | 78,472 | 78,473 | 78,474 | 78,475 |
| | 2-290 | 78,489 | 78,490 | 78,491 | 78,492 | 78,493 | 78,494 | 78,495 | 78,496 | 78,497 | 78,498 | 78,499 | 78,500 |
| | 2-291 | 78,514 | 78,515 | 78,516 | 78,517 | 78,518 | 78,519 | 78,520 | 78,521 | 78,522 | 78,523 | 78,524 | 78,525 |
| | 2-292 | 78,539 | 78,540 | 78,541 | 78,542 | 78,543 | 78,544 | 78,545 | 78,546 | 78,547 | 78,548 | 78,549 | 78,550 |
| | 2-293 | 78,564 | 78,565 | 78,566 | 78,567 | 78,568 | 78,569 | 78,570 | 78,571 | 78,572 | 78,573 | 78,574 | 78,575 |
| | 2-294 | 78,589 | 78,590 | 78,591 | 78,592 | 78,593 | 78,594 | 78,595 | 78,596 | 78,597 | 78,598 | 78,599 | 78,600 |
| | 2-295 | 78,614 | 78,615 | 78,616 | 78,617 | 78,618 | 78,619 | 78,620 | 78,621 | 78,622 | 78,623 | 78,624 | 78,625 |
| | 2-296 | 78,639 | 78,640 | 78,641 | 78,642 | 78,643 | 78,644 | 78,645 | 78,646 | 78,647 | 78,648 | 78,649 | 78,650 |
| | 2-297 | 78,664 | 78,665 | 78,666 | 78,667 | 78,668 | 78,669 | 78,670 | 78,671 | 78,672 | 78,673 | 78,674 | 78,675 |
| | 2-298 | 78,689 | 78,690 | 78,691 | 78,692 | 78,693 | 78,694 | 78,695 | 78,696 | 78,697 | 78,698 | 78,699 | 78,700 |
| | 2-299 | 78,714 | 78,715 | 78,716 | 78,717 | 78,718 | 78,719 | 78,720 | 78,721 | 78,722 | 78,723 | 78,724 | 78,725 |
| | 2-300 | 78,739 | 78,740 | 78,741 | 78,742 | 78,743 | 78,744 | 78,745 | 78,746 | 78,747 | 78,748 | 78,749 | 78,750 |
| | 2-301 | 78,764 | 78,765 | 78,766 | 78,767 | 78,768 | 78,769 | 78,770 | 78,771 | 78,772 | 78,773 | 78,774 | 78,775 |
| | 2-302 | 78,789 | 78,790 | 78,791 | 78,792 | 78,793 | 78,794 | 78,795 | 78,796 | 78,797 | 78,798 | 78,799 | 78,800 |
| | 2-303 | 78,814 | 78,815 | 78,816 | 78,817 | 78,818 | 78,819 | 78,820 | 78,821 | 78,822 | 78,823 | 78,824 | 78,825 |
| | 2-304 | 78,839 | 78,840 | 78,841 | 78,842 | 78,843 | 78,844 | 78,845 | 78,846 | 78,847 | 78,848 | 78,849 | 78,850 |
| | 2-305 | 78,864 | 78,865 | 78,866 | 78,867 | 78,868 | 78,869 | 78,870 | 78,871 | 78,872 | 78,873 | 78,874 | 78,875 |
| | 2-306 | 78,889 | 78,890 | 78,891 | 78,892 | 78,893 | 78,894 | 78,895 | 78,896 | 78,897 | 78,898 | 78,899 | 78,900 |
| | 2-307 | 78,914 | 78,915 | 78,916 | 78,917 | 78,918 | 78,919 | 78,920 | 78,921 | 78,922 | 78,923 | 78,924 | 78,925 |
| | 2-308 | 78,939 | 78,940 | 78,941 | 78,942 | 78,943 | 78,944 | 78,945 | 78,946 | 78,947 | 78,948 | 78,949 | 78,950 |
| | 2-309 | 78,964 | 78,965 | 78,966 | 78,967 | 78,968 | 78,969 | 78,970 | 78,971 | 78,972 | 78,973 | 78,974 | 78,975 |
| | 2-310 | 78,989 | 78,990 | 78,991 | 78,992 | 78,993 | 78,994 | 78,995 | 78,996 | 78,997 | 78,998 | 78,999 | 79,000 |
| | 2-311 | 79,014 | 79,015 | 79,016 | 79,017 | 79,018 | 79,019 | 79,020 | 79,021 | 79,022 | 79,023 | 79,024 | 79,025 |
| | 2-312 | 79,039 | 79,040 | 79,041 | 79,042 | 79,043 | 79,044 | 79,045 | 79,046 | 79,047 | 79,048 | 79,049 | 79,050 |
| | 2-313 | 79,064 | 79,065 | 79,066 | 79,067 | 79,068 | 79,069 | 79,070 | 79,071 | 79,072 | 79,073 | 79,074 | 79,075 |
| | 2-314 | 79,089 | 79,090 | 79,091 | 79,092 | 79,093 | 79,094 | 79,095 | 79,096 | 79,097 | 79,098 | 79,099 | 79,100 |
| | 2-315 | 79,114 | 79,115 | 79,116 | 79,117 | 79,118 | 79,119 | 79,120 | 79,121 | 79,122 | 79,123 | 79,124 | 79,125 |
| | 2-316 | 79,139 | 79,140 | 79,141 | 79,142 | 79,143 | 79,144 | 79,145 | 79,146 | 79,147 | 79,148 | 79,149 | 79,150 |
| | 2-317 | 79,164 | 79,165 | 79,166 | 79,167 | 79,168 | 79,169 | 79,170 | 79,171 | 79,172 | 79,173 | 79,174 | 79,175 |
| | 2-318 | 79,189 | 79,190 | 79,191 | 79,192 | 79,193 | 79,194 | 79,195 | 79,196 | 79,197 | 79,198 | 79,199 | 79,200 |
| | 2-319 | 79,214 | 79,215 | 79,216 | 79,217 | 79,218 | 79,219 | 79,220 | 79,221 | 79,222 | 79,223 | 79,224 | 79,225 |
| | 2-320 | 79,239 | 79,240 | 79,241 | 79,242 | 79,243 | 79,244 | 79,245 | 79,246 | 79,247 | 79,248 | 79,249 | 79,250 |
| | 2-321 | 79,264 | 79,265 | 79,266 | 79,267 | 79,268 | 79,269 | 79,270 | 79,271 | 79,272 | 79,273 | 79,274 | 79,275 |
| | 2-322 | 79,289 | 79,290 | 79,291 | 79,292 | 79,293 | 79,294 | 79,295 | 79,296 | 79,297 | 79,298 | 79,299 | 79,300 |
| | 2-323 | 79,314 | 79,315 | 79,316 | 79,317 | 79,318 | 79,319 | 79,320 | 79,321 | 79,322 | 79,323 | 79,324 | 79,325 |
| | 2-324 | 79,339 | 79,340 | 79,341 | 79,342 | 79,343 | 79,344 | 79,345 | 79,346 | 79,347 | 79,348 | 79,349 | 79,350 |
| | 2-325 | 79,364 | 79,365 | 79,366 | 79,367 | 79,368 | 79,369 | 79,370 | 79,371 | 79,372 | 79,373 | 79,374 | 79,375 |
| | 2-326 | 79,389 | 79,390 | 79,391 | 79,392 | 79,393 | 79,394 | 79,395 | 79,396 | 79,397 | 79,398 | 79,399 | 79,400 |
| | 2-327 | 79,414 | 79,415 | 79,416 | 79,417 | 79,418 | 79,419 | 79,420 | 79,421 | 79,422 | 79,423 | 79,424 | 79,425 |
| | 2-328 | 79,439 | 79,440 | 79,441 | 79,442 | 79,443 | 79,444 | 79,445 | 79,446 | 79,447 | 79,448 | 79,449 | 79,450 |
| | 2-329 | 79,464 | 79,465 | 79,466 | 79,467 | 79,468 | 79,469 | 79,470 | 79,471 | 79,472 | 79,473 | 79,474 | 79,475 |
| | 2-330 | 79,489 | 79,490 | 79,491 | 79,492 | 79,493 | 79,494 | 79,495 | 79,496 | 79,497 | 79,498 | 79,499 | 79,500 |

TABLE 61

| | | Compound represented by the formula (1) | | | | | | | | | | | | |
|---|---|---|---|---|---|---|---|---|---|---|---|---|---|---|
| | | 1-151 | 1-152 | 1-153 | 1-154 | 1-155 | 1-156 | 1-157 | 1-158 | 1-159 | 1-160 | 1-161 | 1-162 | 1-163 |
| Compound | 2-331 | 79,501 | 79,502 | 79,503 | 79,504 | 79,505 | 79,506 | 79,507 | 79,508 | 79,509 | 79,510 | 79,511 | 79,512 | 79,513 |
| represented | 2-332 | 79,526 | 79,527 | 79,528 | 79,529 | 79,530 | 79,531 | 79,532 | 79,533 | 79,534 | 79,535 | 79,536 | 79,537 | 79,538 |
| by the | 2-333 | 79,551 | 79,552 | 79,553 | 79,554 | 79,555 | 79,556 | 79,557 | 79,558 | 79,559 | 79,560 | 79,561 | 79,562 | 79,563 |
| formula (2) | 2-334 | 79,576 | 79,577 | 79,578 | 79,579 | 79,580 | 79,581 | 79,582 | 79,583 | 79,584 | 79,585 | 79,586 | 79,587 | 79,588 |
| | 2-335 | 79,601 | 79,602 | 79,603 | 79,604 | 79,605 | 79,606 | 79,607 | 79,608 | 79,609 | 79,610 | 79,611 | 79,612 | 79,613 |
| | 2-336 | 79,626 | 79,627 | 79,628 | 79,629 | 79,630 | 79,631 | 79,632 | 79,633 | 79,634 | 79,635 | 79,636 | 79,637 | 79,638 |
| | 2-337 | 79,651 | 79,652 | 79,653 | 79,654 | 79,655 | 79,656 | 79,657 | 79,658 | 79,659 | 79,660 | 79,661 | 79,662 | 79,663 |
| | 2-338 | 79,676 | 79,677 | 79,678 | 79,679 | 79,680 | 79,681 | 79,682 | 79,683 | 79,684 | 79,685 | 79,686 | 79,687 | 79,688 |
| | 2-339 | 79,701 | 79,702 | 79,703 | 79,704 | 79,705 | 79,706 | 79,707 | 79,708 | 79,709 | 79,710 | 79,711 | 79,712 | 79,713 |
| | 2-340 | 79,726 | 79,727 | 79,728 | 79,729 | 79,730 | 79,731 | 79,732 | 79,733 | 79,734 | 79,735 | 79,736 | 79,737 | 79,738 |
| | 2-341 | 79,751 | 79,752 | 79,753 | 79,754 | 79,755 | 79,756 | 79,757 | 79,758 | 79,759 | 79,760 | 79,761 | 79,762 | 79,763 |

TABLE 61-continued

| | | | | | | | | | | | | | |
|---|---|---|---|---|---|---|---|---|---|---|---|---|---|
| 2-342 | 79,776 | 79,777 | 79,778 | 79,779 | 79,780 | 79,781 | 79,782 | 79,783 | 79,784 | 79,785 | 79,786 | 79,787 | 79,788 |
| 2-343 | 79,801 | 79,802 | 79,803 | 79,804 | 79,805 | 79,806 | 79,807 | 79,808 | 79,809 | 79,810 | 79,811 | 79,812 | 79,813 |
| 2-344 | 79,826 | 79,827 | 79,828 | 79,829 | 79,830 | 79,831 | 79,832 | 79,833 | 79,834 | 79,835 | 79,836 | 79,837 | 79,838 |
| 2-345 | 79,851 | 79,852 | 79,853 | 79,854 | 79,855 | 79,856 | 79,857 | 79,858 | 79,859 | 79,860 | 79,861 | 79,862 | 79,863 |
| 2-346 | 79,876 | 79,877 | 79,878 | 79,879 | 79,880 | 79,881 | 79,882 | 79,883 | 79,884 | 79,885 | 79,886 | 79,887 | 79,888 |
| 2-347 | 79,901 | 79,902 | 79,903 | 79,904 | 79,905 | 79,906 | 79,907 | 79,908 | 79,909 | 79,910 | 79,911 | 79,912 | 79,913 |
| 2-348 | 79,926 | 79,927 | 79,928 | 79,929 | 79,930 | 79,931 | 79,932 | 79,933 | 79,934 | 79,935 | 79,936 | 79,937 | 79,938 |
| 2-349 | 79,951 | 79,952 | 79,953 | 79,954 | 79,955 | 79,956 | 79,957 | 79,958 | 79,959 | 79,960 | 79,961 | 79,962 | 79,963 |
| 2-350 | 79,976 | 79,977 | 79,978 | 79,979 | 79,980 | 79,981 | 79,982 | 79,983 | 79,984 | 79,985 | 79,986 | 79,987 | 79,988 |
| 2-351 | 80,001 | 80,002 | 80,003 | 80,004 | 80,005 | 80,006 | 80,007 | 80,008 | 80,009 | 80,010 | 80,011 | 80,012 | 80,013 |
| 2-352 | 80,026 | 80,027 | 80,028 | 80,029 | 80,030 | 80,031 | 80,032 | 80,033 | 80,034 | 80,035 | 80,036 | 80,037 | 80,038 |
| 2-353 | 80,051 | 80,052 | 80,053 | 80,054 | 80,055 | 80,056 | 80,057 | 80,058 | 80,059 | 80,060 | 80,061 | 80,062 | 80,063 |
| 2-354 | 80,076 | 80,077 | 80,078 | 80,079 | 80,080 | 80,081 | 80,082 | 80,083 | 80,084 | 80,085 | 80,086 | 80,087 | 80,088 |
| 2-355 | 80,101 | 80,102 | 80,103 | 80,104 | 80,105 | 80,106 | 80,107 | 80,108 | 80,109 | 80,110 | 80,111 | 80,112 | 80,113 |
| 2-356 | 80,126 | 80,127 | 80,128 | 80,129 | 80,130 | 80,131 | 80,132 | 80,133 | 80,134 | 80,135 | 80,136 | 80,137 | 80,138 |
| 2-357 | 80,151 | 80,152 | 80,153 | 80,154 | 80,155 | 80,156 | 80,157 | 80,158 | 80,159 | 80,160 | 80,161 | 80,162 | 80,163 |
| 2-358 | 80,176 | 80,177 | 80,178 | 80,179 | 80,180 | 80,181 | 80,182 | 80,183 | 80,184 | 80,185 | 80,186 | 80,187 | 80,188 |
| 2-359 | 80,201 | 80,202 | 80,203 | 80,204 | 80,205 | 80,206 | 80,207 | 80,208 | 80,209 | 80,210 | 80,211 | 80,212 | 80,213 |
| 2-360 | 80,226 | 80,227 | 80,228 | 80,229 | 80,230 | 80,231 | 80,232 | 80,233 | 80,234 | 80,235 | 80,236 | 80,237 | 80,238 |
| 2-361 | 80,251 | 80,252 | 80,253 | 80,254 | 80,255 | 80,256 | 80,257 | 80,258 | 80,259 | 80,260 | 80,261 | 80,262 | 80,263 |
| 2-362 | 80,276 | 80,277 | 80,278 | 80,279 | 80,280 | 80,281 | 80,282 | 80,283 | 80,284 | 80,285 | 80,286 | 80,287 | 80,288 |
| 2-363 | 80,301 | 80,302 | 80,303 | 80,304 | 80,305 | 80,306 | 80,307 | 80,308 | 80,309 | 80,310 | 80,311 | 80,312 | 80,313 |
| 2-364 | 80,326 | 80,327 | 80,328 | 80,329 | 80,330 | 80,331 | 80,332 | 80,333 | 80,334 | 80,335 | 80,336 | 80,337 | 80,338 |
| 2-365 | 80,351 | 80,352 | 80,353 | 80,354 | 80,355 | 80,356 | 80,357 | 80,358 | 80,359 | 80,360 | 80,361 | 80,362 | 80,363 |
| 2-366 | 80,376 | 80,377 | 80,378 | 80,379 | 80,380 | 80,381 | 80,382 | 80,383 | 80,384 | 80,385 | 80,386 | 80,387 | 80,388 |
| 2-367 | 80,401 | 80,402 | 80,403 | 80,404 | 80,405 | 80,406 | 80,407 | 80,408 | 80,409 | 80,410 | 80,411 | 80,412 | 80,413 |
| 2-368 | 80,426 | 80,427 | 80,428 | 80,429 | 80,430 | 80,431 | 80,432 | 80,433 | 80,434 | 80,435 | 80,436 | 80,437 | 80,438 |
| 2-369 | 80,451 | 80,452 | 80,453 | 80,454 | 80,455 | 80,456 | 80,457 | 80,458 | 80,459 | 80,460 | 80,461 | 80,462 | 80,463 |
| 2-370 | 80,476 | 80,477 | 80,478 | 80,479 | 80,480 | 80,481 | 80,482 | 80,483 | 80,484 | 80,485 | 80,486 | 80,487 | 80,488 |
| 2-371 | 80,501 | 80,502 | 80,503 | 80,504 | 80,505 | 80,506 | 80,507 | 80,508 | 80,509 | 80,510 | 80,511 | 80,512 | 80,513 |
| 2-372 | 80,526 | 80,527 | 80,528 | 80,529 | 80,530 | 80,531 | 80,532 | 80,533 | 80,534 | 80,535 | 80,536 | 80,537 | 80,538 |
| 2-373 | 80,551 | 80,552 | 80,553 | 80,554 | 80,555 | 80,556 | 80,557 | 80,558 | 80,559 | 80,560 | 80,561 | 80,562 | 80,563 |
| 2-374 | 80,576 | 80,577 | 80,578 | 80,579 | 80,580 | 80,581 | 80,582 | 80,583 | 80,584 | 80,585 | 80,586 | 80,587 | 80,588 |
| 2-375 | 80,601 | 80,602 | 80,603 | 80,604 | 80,605 | 80,606 | 80,607 | 80,608 | 80,609 | 80,610 | 80,611 | 80,612 | 80,613 |
| 2-376 | 80,626 | 80,627 | 80,628 | 80,629 | 80,630 | 80,631 | 80,632 | 80,633 | 80,634 | 80,635 | 80,636 | 80,637 | 80,638 |
| 2-377 | 80,651 | 80,652 | 80,653 | 80,654 | 80,655 | 80,656 | 80,657 | 80,658 | 80,659 | 80,660 | 80,661 | 80,662 | 80,663 |
| 2-378 | 80,676 | 80,677 | 80,678 | 80,679 | 80,680 | 80,681 | 80,682 | 80,683 | 80,684 | 80,685 | 80,686 | 80,687 | 80,688 |
| 2-379 | 80,701 | 80,702 | 80,703 | 80,704 | 80,705 | 80,706 | 80,707 | 80,708 | 80,709 | 80,710 | 80,711 | 80,712 | 80,713 |
| 2-380 | 80,726 | 80,727 | 80,728 | 80,729 | 80,730 | 80,731 | 80,732 | 80,733 | 80,734 | 80,735 | 80,736 | 80,737 | 80,738 |
| 2-381 | 80,751 | 80,752 | 80,753 | 80,754 | 80,755 | 80,756 | 80,757 | 80,758 | 80,759 | 80,760 | 80,761 | 80,762 | 80,763 |
| 2-382 | 80,776 | 80,777 | 80,778 | 80,779 | 80,780 | 80,781 | 80,782 | 80,783 | 80,784 | 80,785 | 80,786 | 80,787 | 80,788 |
| 2-383 | 80,801 | 80,802 | 80,803 | 80,804 | 80,805 | 80,806 | 80,807 | 80,808 | 80,809 | 80,810 | 80,811 | 80,812 | 80,813 |
| 2-384 | 80,826 | 80,827 | 80,828 | 80,829 | 80,830 | 80,831 | 80,832 | 80,833 | 80,834 | 80,835 | 80,836 | 80,837 | 80,838 |
| 2-385 | 80,851 | 80,852 | 80,853 | 80,854 | 80,855 | 80,856 | 80,857 | 80,858 | 80,859 | 80,860 | 80,861 | 80,862 | 80,863 |

| | | Compound represented by the formula (1) | | | | | | | | | | | |
|---|---|---|---|---|---|---|---|---|---|---|---|---|---|
| | | 1-164 | 1-165 | 1-166 | 1-167 | 1-168 | 1-169 | 1-170 | 1-171 | 1-172 | 1-173 | 1-174 | 1-175 |
| Compound represented by the formula (2) | 2-331 | 79,514 | 79,515 | 79,516 | 79,517 | 79,518 | 79,519 | 79,520 | 79,521 | 79,522 | 79,523 | 79,524 | 79,525 |
| | 2-332 | 79,539 | 79,540 | 79,541 | 79,542 | 79,543 | 79,544 | 79,545 | 79,546 | 79,547 | 79,548 | 79,549 | 79,550 |
| | 2-333 | 79,564 | 79,565 | 79,566 | 79,567 | 79,568 | 79,569 | 79,570 | 79,571 | 79,572 | 79,573 | 79,574 | 79,575 |
| | 2-334 | 79,589 | 79,590 | 79,591 | 79,592 | 79,593 | 79,594 | 79,595 | 79,596 | 79,597 | 79,598 | 79,599 | 79,600 |
| | 2-335 | 79,614 | 79,615 | 79,616 | 79,617 | 79,618 | 79,619 | 79,620 | 79,621 | 79,622 | 79,623 | 79,624 | 79,625 |
| | 2-336 | 79,639 | 79,640 | 79,641 | 79,642 | 79,643 | 79,644 | 79,645 | 79,646 | 79,647 | 79,648 | 79,649 | 79,650 |
| | 2-337 | 79,664 | 79,665 | 79,666 | 79,667 | 79,668 | 79,669 | 79,670 | 79,671 | 79,672 | 79,673 | 79,674 | 79,675 |
| | 2-338 | 79,689 | 79,690 | 79,691 | 79,692 | 79,693 | 79,694 | 79,695 | 79,696 | 79,697 | 79,698 | 79,699 | 79,700 |
| | 2-339 | 79,714 | 79,715 | 79,716 | 79,717 | 79,718 | 79,719 | 79,720 | 79,721 | 79,722 | 79,723 | 79,724 | 79,725 |
| | 2-340 | 79,739 | 79,740 | 79,741 | 79,742 | 79,743 | 79,744 | 79,745 | 79,746 | 79,747 | 79,748 | 79,749 | 79,750 |
| | 2-341 | 79,764 | 79,765 | 79,766 | 79,767 | 79,768 | 79,769 | 79,770 | 79,771 | 79,772 | 79,773 | 79,774 | 79,775 |
| | 2-342 | 79,789 | 79,790 | 79,791 | 79,792 | 79,793 | 79,794 | 79,795 | 79,796 | 79,797 | 79,798 | 79,799 | 79,800 |
| | 2-343 | 79,814 | 79,815 | 79,816 | 79,817 | 79,818 | 79,819 | 79,820 | 79,821 | 79,822 | 79,823 | 79,824 | 79,825 |
| | 2-344 | 79,839 | 79,840 | 79,841 | 79,842 | 79,843 | 79,844 | 79,845 | 79,846 | 79,847 | 79,848 | 79,849 | 79,850 |
| | 2-345 | 79,864 | 79,865 | 79,866 | 79,867 | 79,868 | 79,869 | 79,870 | 79,871 | 79,872 | 79,873 | 79,874 | 79,875 |
| | 2-346 | 79,889 | 79,890 | 79,891 | 79,892 | 79,893 | 79,894 | 79,895 | 79,896 | 79,897 | 79,898 | 79,899 | 79,900 |
| | 2-347 | 79,914 | 79,915 | 79,916 | 79,917 | 79,918 | 79,919 | 79,920 | 79,921 | 79,922 | 79,923 | 79,924 | 79,925 |
| | 2-348 | 79,939 | 79,940 | 79,941 | 79,942 | 79,943 | 79,944 | 79,945 | 79,946 | 79,947 | 79,948 | 79,949 | 79,950 |
| | 2-349 | 79,964 | 79,965 | 79,966 | 79,967 | 79,968 | 79,969 | 79,970 | 79,971 | 79,972 | 79,973 | 79,974 | 79,975 |
| | 2-350 | 79,989 | 79,990 | 79,991 | 79,992 | 79,993 | 79,994 | 79,995 | 79,996 | 79,997 | 79,998 | 79,999 | 80,000 |
| | 2-351 | 80,014 | 80,015 | 80,016 | 80,017 | 80,018 | 80,019 | 80,020 | 80,021 | 80,022 | 80,023 | 80,024 | 80,025 |
| | 2-352 | 80,039 | 80,040 | 80,041 | 80,042 | 80,043 | 80,044 | 80,045 | 80,046 | 80,047 | 80,048 | 80,049 | 80,050 |
| | 2-353 | 80,064 | 80,065 | 80,066 | 80,067 | 80,068 | 80,069 | 80,070 | 80,071 | 80,072 | 80,073 | 80,074 | 80,075 |
| | 2-354 | 80,089 | 80,090 | 80,091 | 80,092 | 80,093 | 80,094 | 80,095 | 80,096 | 80,097 | 80,098 | 80,099 | 80,100 |
| | 2-355 | 80,114 | 80,115 | 80,116 | 80,117 | 80,118 | 80,119 | 80,120 | 80,121 | 80,122 | 80,123 | 80,124 | 80,125 |
| | 2-356 | 80,139 | 80,140 | 80,141 | 80,142 | 80,143 | 80,144 | 80,145 | 80,146 | 80,147 | 80,148 | 80,149 | 80,150 |
| | 2-357 | 80,164 | 80,165 | 80,166 | 80,167 | 80,168 | 80,169 | 80,170 | 80,171 | 80,172 | 80,173 | 80,174 | 80,175 |
| | 2-358 | 80,189 | 80,190 | 80,191 | 80,192 | 80,193 | 80,194 | 80,195 | 80,196 | 80,197 | 80,198 | 80,199 | 80,200 |
| | 2-359 | 80,214 | 80,215 | 80,216 | 80,217 | 80,218 | 80,219 | 80,220 | 80,221 | 80,222 | 80,223 | 80,224 | 80,225 |
| | 2-360 | 80,239 | 80,240 | 80,241 | 80,242 | 80,243 | 80,244 | 80,245 | 80,246 | 80,247 | 80,248 | 80,249 | 80,250 |
| | 2-361 | 80,264 | 80,265 | 80,266 | 80,267 | 80,268 | 80,269 | 80,270 | 80,271 | 80,272 | 80,273 | 80,274 | 80,275 |

TABLE 61-continued

| | | | | | | | | | | | | |
|---|---|---|---|---|---|---|---|---|---|---|---|---|
| 2-362 | 80,289 | 80,290 | 80,291 | 80,292 | 80,293 | 80,294 | 80,295 | 80,296 | 80,297 | 80,298 | 80,299 | 80,300 |
| 2-363 | 80,314 | 80,315 | 80,316 | 80,317 | 80,318 | 80,319 | 80,320 | 80,321 | 80,322 | 80,323 | 80,324 | 80,325 |
| 2-364 | 80,339 | 80,340 | 80,341 | 80,342 | 80,343 | 80,344 | 80,345 | 80,346 | 80,347 | 80,348 | 80,349 | 80,350 |
| 2-365 | 80,364 | 80,365 | 80,366 | 80,367 | 80,368 | 80,369 | 80,370 | 80,371 | 80,372 | 80,373 | 80,374 | 80,375 |
| 2-366 | 80,389 | 80,390 | 80,391 | 80,392 | 80,393 | 80,394 | 80,395 | 80,396 | 80,397 | 80,398 | 80,399 | 80,400 |
| 2-367 | 80,414 | 80,415 | 80,416 | 80,417 | 80,418 | 80,419 | 80,420 | 80,421 | 80,422 | 80,423 | 80,424 | 80,425 |
| 2-368 | 80,439 | 80,440 | 80,441 | 80,442 | 80,443 | 80,444 | 80,445 | 80,446 | 80,447 | 80,448 | 80,449 | 80,450 |
| 2-369 | 80,464 | 80,465 | 80,466 | 80,467 | 80,468 | 80,469 | 80,470 | 80,471 | 80,472 | 80,473 | 80,474 | 80,475 |
| 2-370 | 80,489 | 80,490 | 80,491 | 80,492 | 80,493 | 80,494 | 80,495 | 80,496 | 80,497 | 80,498 | 80,499 | 80,500 |
| 2-371 | 80,514 | 80,515 | 80,516 | 80,517 | 80,518 | 80,519 | 80,520 | 80,521 | 80,522 | 80,523 | 80,524 | 80,525 |
| 2-372 | 80,539 | 80,540 | 80,541 | 80,542 | 80,543 | 80,544 | 80,545 | 80,546 | 80,547 | 80,548 | 80,549 | 80,550 |
| 2-373 | 80,564 | 80,565 | 80,566 | 80,567 | 80,568 | 80,569 | 80,570 | 80,571 | 80,572 | 80,573 | 80,574 | 80,575 |
| 2-374 | 80,589 | 80,590 | 80,591 | 80,592 | 80,593 | 80,594 | 80,595 | 80,596 | 80,597 | 80,598 | 80,599 | 80,600 |
| 2-375 | 80,614 | 80,615 | 80,616 | 80,617 | 80,618 | 80,619 | 80,620 | 80,621 | 80,622 | 80,623 | 80,624 | 80,625 |
| 2-376 | 80,639 | 80,640 | 80,641 | 80,642 | 80,643 | 80,644 | 80,645 | 80,646 | 80,647 | 80,648 | 80,649 | 80,650 |
| 2-377 | 80,664 | 80,665 | 80,666 | 80,667 | 80,668 | 80,669 | 80,670 | 80,671 | 80,672 | 80,673 | 80,674 | 80,675 |
| 2-378 | 80,689 | 80,690 | 80,691 | 80,692 | 80,693 | 80,694 | 80,695 | 80,696 | 80,697 | 80,698 | 80,699 | 80,700 |
| 2-379 | 80,714 | 80,715 | 80,716 | 80,717 | 80,718 | 80,719 | 80,720 | 80,721 | 80,722 | 80,723 | 80,724 | 80,725 |
| 2-380 | 80,739 | 80,740 | 80,741 | 80,742 | 80,743 | 80,744 | 80,745 | 80,746 | 80,747 | 80,748 | 80,749 | 80,750 |
| 2-381 | 80,764 | 80,765 | 80,766 | 80,767 | 80,768 | 80,769 | 80,770 | 80,771 | 80,772 | 80,773 | 80,774 | 80,775 |
| 2-382 | 80,789 | 80,790 | 80,791 | 80,792 | 80,793 | 80,794 | 80,795 | 80,796 | 80,797 | 80,798 | 80,799 | 80,800 |
| 2-383 | 80,814 | 80,815 | 80,816 | 80,817 | 80,818 | 80,819 | 80,820 | 80,821 | 80,822 | 80,823 | 80,824 | 80,825 |
| 2-384 | 80,839 | 80,840 | 80,841 | 80,842 | 80,843 | 80,844 | 80,845 | 80,846 | 80,847 | 80,848 | 80,849 | 80,850 |
| 2-385 | 80,864 | 80,865 | 80,866 | 80,867 | 80,868 | 80,869 | 80,870 | 80,871 | 80,872 | 80,873 | 80,874 | 80,875 |

TABLE 62

| | | Compound represented by the formula (1) | | | | | | | | | | | | |
|---|---|---|---|---|---|---|---|---|---|---|---|---|---|---|
| | | 1-151 | 1-152 | 1-153 | 1-154 | 1-155 | 1-156 | 1-157 | 1-158 | 1-159 | 1-160 | 1-161 | 1-162 | 1-163 |
| Compound represented by the formula (2) | 2-386 | 80,876 | 80,877 | 80,878 | 80,879 | 80,880 | 80,881 | 80,882 | 80,883 | 80,884 | 80,885 | 80,886 | 80,887 | 80,888 |
| | 2-387 | 80,901 | 80,902 | 80,903 | 80,904 | 80,905 | 80,906 | 80,907 | 80,908 | 80,909 | 80,910 | 80,911 | 80,912 | 80,913 |
| | 2-388 | 80,926 | 80,927 | 80,928 | 80,929 | 80,930 | 80,931 | 80,932 | 80,933 | 80,934 | 80,935 | 80,936 | 80,937 | 80,938 |
| | 2-389 | 80,951 | 80,952 | 80,953 | 80,954 | 80,955 | 80,956 | 80,957 | 80,958 | 80,959 | 80,960 | 80,961 | 80,962 | 80,963 |
| | 2-390 | 80,976 | 80,977 | 80,978 | 80,979 | 80,980 | 80,981 | 80,982 | 80,983 | 80,984 | 80,985 | 80,986 | 80,987 | 80,988 |
| | 2-391 | 81,001 | 81,002 | 81,003 | 81,004 | 81,005 | 81,006 | 81,007 | 81,008 | 81,009 | 81,010 | 81,011 | 81,012 | 81,013 |
| | 2-392 | 81,026 | 81,027 | 81,028 | 81,029 | 81,030 | 81,031 | 81,032 | 81,033 | 81,034 | 81,035 | 81,036 | 81,037 | 81,038 |
| | 2-393 | 81,051 | 81,052 | 81,053 | 81,054 | 81,055 | 81,056 | 81,057 | 81,058 | 81,059 | 81,060 | 81,061 | 81,062 | 81,063 |
| | 2-394 | 81,076 | 81,077 | 81,078 | 81,079 | 81,080 | 81,081 | 81,082 | 81,083 | 81,084 | 81,085 | 81,086 | 81,087 | 81,088 |
| | 2-395 | 81,101 | 81,102 | 81,103 | 81,104 | 81,105 | 81,106 | 81,107 | 81,108 | 81,109 | 81,110 | 81,111 | 81,112 | 81,113 |
| | 2-396 | 81,126 | 81,127 | 81,128 | 81,129 | 81,130 | 81,131 | 81,132 | 81,133 | 81,134 | 81,135 | 81,136 | 81,137 | 81,138 |
| | 2-397 | 81,151 | 81,152 | 81,153 | 81,154 | 81,155 | 81,156 | 81,157 | 81,158 | 81,159 | 81,160 | 81,161 | 81,162 | 81,163 |
| | 2-398 | 81,176 | 81,177 | 81,178 | 81,179 | 81,180 | 81,181 | 81,182 | 81,183 | 81,184 | 81,185 | 81,186 | 81,187 | 81,188 |
| | 2-399 | 81,201 | 81,202 | 81,203 | 81,204 | 81,205 | 81,206 | 81,207 | 81,208 | 81,209 | 81,210 | 81,211 | 81,212 | 81,213 |
| | 2-400 | 81,226 | 81,227 | 81,228 | 81,229 | 81,230 | 81,231 | 81,232 | 81,233 | 81,234 | 81,235 | 81,236 | 81,237 | 81,238 |
| | 2-401 | 81,251 | 81,252 | 81,253 | 81,254 | 81,255 | 81,256 | 81,257 | 81,258 | 81,259 | 81,260 | 81,261 | 81,262 | 81,263 |
| | 2-402 | 81,276 | 81,277 | 81,278 | 81,279 | 81,280 | 81,281 | 81,282 | 81,283 | 81,284 | 81,285 | 81,286 | 81,287 | 81,288 |
| | 2-403 | 81,301 | 81,302 | 81,303 | 81,304 | 81,305 | 81,306 | 81,307 | 81,308 | 81,309 | 81,310 | 81,311 | 81,312 | 81,313 |
| | 2-404 | 81,326 | 81,327 | 81,328 | 81,329 | 81,330 | 81,331 | 81,332 | 81,333 | 81,334 | 81,335 | 81,336 | 81,337 | 81,338 |
| | 2-405 | 81,351 | 81,352 | 81,353 | 81,354 | 81,355 | 81,356 | 81,357 | 81,358 | 81,359 | 81,360 | 81,361 | 81,362 | 81,363 |
| | 2-406 | 81,376 | 81,377 | 81,378 | 81,379 | 81,380 | 81,381 | 81,382 | 81,383 | 81,384 | 81,385 | 81,386 | 81,387 | 81,388 |
| | 2-407 | 81,401 | 81,402 | 81,403 | 81,404 | 81,405 | 81,406 | 81,407 | 81,408 | 81,409 | 81,410 | 81,411 | 81,412 | 81,413 |
| | 2-408 | 81,426 | 81,427 | 81,428 | 81,429 | 81,430 | 81,431 | 81,432 | 81,433 | 81,434 | 81,435 | 81,436 | 81,437 | 81,438 |
| | 2-409 | 81,451 | 81,452 | 81,453 | 81,454 | 81,455 | 81,456 | 81,457 | 81,458 | 81,459 | 81,460 | 81,461 | 81,462 | 81,463 |
| | 2-410 | 81,476 | 81,477 | 81,478 | 81,479 | 81,480 | 81,481 | 81,482 | 81,483 | 81,484 | 81,485 | 81,486 | 81,487 | 81,488 |
| | 2-411 | 81,501 | 81,502 | 81,503 | 81,504 | 81,505 | 81,506 | 81,507 | 81,508 | 81,509 | 81,510 | 81,511 | 81,512 | 81,513 |
| | 2-412 | 81,526 | 81,527 | 81,528 | 81,529 | 81,530 | 81,531 | 81,532 | 81,533 | 81,534 | 81,535 | 81,536 | 81,537 | 81,538 |
| | 2-413 | 81,551 | 81,552 | 81,553 | 81,554 | 81,555 | 81,556 | 81,557 | 81,558 | 81,559 | 81,560 | 81,561 | 81,562 | 81,563 |
| | 2-414 | 81,576 | 81,577 | 81,578 | 81,579 | 81,580 | 81,581 | 81,582 | 81,583 | 81,584 | 81,585 | 81,586 | 81,587 | 81,588 |
| | 2-415 | 81,601 | 81,602 | 81,603 | 81,604 | 81,605 | 81,606 | 81,607 | 81,608 | 81,609 | 81,610 | 81,611 | 81,612 | 81,613 |
| | 2-416 | 81,626 | 81,627 | 81,628 | 81,629 | 81,630 | 81,631 | 81,632 | 81,633 | 81,634 | 81,635 | 81,636 | 81,637 | 81,638 |
| | 2-417 | 81,651 | 81,652 | 81,653 | 81,654 | 81,655 | 81,656 | 81,657 | 81,658 | 81,659 | 81,660 | 81,661 | 81,662 | 81,663 |
| | 2-418 | 81,676 | 81,677 | 81,678 | 81,679 | 81,680 | 81,681 | 81,682 | 81,683 | 81,684 | 81,685 | 81,686 | 81,687 | 81,688 |
| | 2-419 | 81,701 | 81,702 | 81,703 | 81,704 | 81,705 | 81,706 | 81,707 | 81,708 | 81,709 | 81,710 | 81,711 | 81,712 | 81,713 |
| | 2-420 | 81,726 | 81,727 | 81,728 | 81,729 | 81,730 | 81,731 | 81,732 | 81,733 | 81,734 | 81,735 | 81,736 | 81,737 | 81,738 |
| | 2-421 | 81,751 | 81,752 | 81,753 | 81,754 | 81,755 | 81,756 | 81,757 | 81,758 | 81,759 | 81,760 | 81,761 | 81,762 | 81,763 |
| | 2-422 | 81,776 | 81,777 | 81,778 | 81,779 | 81,780 | 81,781 | 81,782 | 81,783 | 81,784 | 81,785 | 81,786 | 81,787 | 81,788 |
| | 2-423 | 81,801 | 81,802 | 81,803 | 81,804 | 81,805 | 81,806 | 81,807 | 81,808 | 81,809 | 81,810 | 81,811 | 81,812 | 81,813 |
| | 2-424 | 81,826 | 81,827 | 81,828 | 81,829 | 81,830 | 81,831 | 81,832 | 81,833 | 81,834 | 81,835 | 81,836 | 81,837 | 81,838 |
| | 2-425 | 81,851 | 81,852 | 81,853 | 81,854 | 81,855 | 81,856 | 81,857 | 81,858 | 81,859 | 81,860 | 81,861 | 81,862 | 81,863 |
| | 2-426 | 81,876 | 81,877 | 81,878 | 81,879 | 81,880 | 81,881 | 81,882 | 81,883 | 81,884 | 81,885 | 81,886 | 81,887 | 81,888 |
| | 2-427 | 81,901 | 81,902 | 81,903 | 81,904 | 81,905 | 81,906 | 81,907 | 81,908 | 81,909 | 81,910 | 81,911 | 81,912 | 81,913 |
| | 2-428 | 81,926 | 81,927 | 81,928 | 81,929 | 81,930 | 81,931 | 81,932 | 81,933 | 81,934 | 81,935 | 81,936 | 81,937 | 81,938 |
| | 2-429 | 81,951 | 81,952 | 81,953 | 81,954 | 81,955 | 81,956 | 81,957 | 81,958 | 81,959 | 81,960 | 81,961 | 81,962 | 81,963 |
| | 2-430 | 81,976 | 81,977 | 81,978 | 81,979 | 81,980 | 81,981 | 81,982 | 81,983 | 81,984 | 81,985 | 81,986 | 81,987 | 81,988 |
| | 2-431 | 82,001 | 82,002 | 82,003 | 82,004 | 82,005 | 82,006 | 82,007 | 82,008 | 82,009 | 82,010 | 82,011 | 82,012 | 82,013 |

TABLE 62-continued

| | | | | | | | | | | | | | |
|---|---|---|---|---|---|---|---|---|---|---|---|---|---|
| 2-432 | 82,026 | 82,027 | 82,028 | 82,029 | 82,030 | 82,031 | 82,032 | 82,033 | 82,034 | 82,035 | 82,036 | 82,037 | 82,038 |
| 2-433 | 82,051 | 82,052 | 82,053 | 82,054 | 82,055 | 82,056 | 82,057 | 82,058 | 82,059 | 82,060 | 82,061 | 82,062 | 82,063 |
| 2-434 | 82,076 | 82,077 | 82,078 | 82,079 | 82,080 | 82,081 | 82,082 | 82,083 | 82,084 | 82,085 | 82,086 | 82,087 | 82,088 |
| 2-435 | 82,101 | 82,102 | 82,103 | 82,104 | 82,105 | 82,106 | 82,107 | 82,108 | 82,109 | 82,110 | 82,111 | 82,112 | 82,113 |
| 2-436 | 82,126 | 82,127 | 82,128 | 82,129 | 82,130 | 82,131 | 82,132 | 82,133 | 82,134 | 82,135 | 82,136 | 82,137 | 82,138 |
| 2-437 | 82,151 | 82,152 | 82,153 | 82,154 | 82,155 | 82,156 | 82,157 | 82,158 | 82,159 | 82,160 | 82,161 | 82,162 | 82,163 |
| 2-438 | 82,176 | 82,177 | 82,178 | 82,179 | 82,180 | 82,181 | 82,182 | 82,183 | 82,184 | 82,185 | 82,186 | 82,187 | 82,188 |
| 2-439 | 82,201 | 82,202 | 82,203 | 82,204 | 82,205 | 82,206 | 82,207 | 82,208 | 82,209 | 82,210 | 82,211 | 82,212 | 82,213 |
| 2-440 | 82,226 | 82,227 | 82,228 | 82,229 | 82,230 | 82,231 | 82,232 | 82,233 | 82,234 | 82,235 | 82,236 | 82,237 | 82,238 |

| | | Compound represented by the formula (1) | | | | | | | | | | | |
|---|---|---|---|---|---|---|---|---|---|---|---|---|---|
| | | 1-164 | 1-165 | 1-166 | 1-167 | 1-168 | 1-169 | 1-170 | 1-171 | 1-172 | 1-173 | 1-174 | 1-175 |
| Compound represented by the formula (2) | 2-386 | 80,889 | 80,890 | 80,891 | 80,892 | 80,893 | 80,894 | 80,895 | 80,896 | 80,897 | 80,898 | 80,899 | 80,900 |
| | 2-387 | 80,914 | 80,915 | 80,916 | 80,917 | 80,918 | 80,919 | 80,920 | 80,921 | 80,922 | 80,923 | 80,924 | 80,925 |
| | 2-388 | 80,939 | 80,940 | 80,941 | 80,942 | 80,943 | 80,944 | 80,945 | 80,946 | 80,947 | 80,948 | 80,949 | 80,950 |
| | 2-389 | 80,964 | 80,965 | 80,966 | 80,967 | 80,968 | 80,969 | 80,970 | 80,971 | 80,972 | 80,973 | 80,974 | 80,975 |
| | 2-390 | 80,989 | 80,990 | 80,991 | 80,992 | 80,993 | 80,994 | 80,995 | 80,996 | 80,997 | 80,998 | 80,999 | 81,000 |
| | 2-391 | 81,014 | 81,015 | 81,016 | 81,017 | 81,018 | 81,019 | 81,020 | 81,021 | 81,022 | 81,023 | 81,024 | 81,025 |
| | 2-392 | 81,039 | 81,040 | 81,041 | 81,042 | 81,043 | 81,044 | 81,045 | 81,046 | 81,047 | 81,048 | 81,049 | 81,050 |
| | 2-393 | 81,064 | 81,065 | 81,066 | 81,067 | 81,068 | 81,069 | 81,070 | 81,071 | 81,072 | 81,073 | 81,074 | 81,075 |
| | 2-394 | 81,089 | 81,090 | 81,091 | 81,092 | 81,093 | 81,094 | 81,095 | 81,096 | 81,097 | 81,098 | 81,099 | 81,100 |
| | 2-395 | 81,114 | 81,115 | 81,116 | 81,117 | 81,118 | 81,119 | 81,120 | 81,121 | 81,122 | 81,123 | 81,124 | 81,125 |
| | 2-396 | 81,139 | 81,140 | 81,141 | 81,142 | 81,143 | 81,144 | 81,145 | 81,146 | 81,147 | 81,148 | 81,149 | 81,150 |
| | 2-397 | 81,164 | 81,165 | 81,166 | 81,167 | 81,168 | 81,169 | 81,170 | 81,171 | 81,172 | 81,173 | 81,174 | 81,175 |
| | 2-398 | 81,189 | 81,190 | 81,191 | 81,192 | 81,193 | 81,194 | 81,195 | 81,196 | 81,197 | 81,198 | 81,199 | 81,200 |
| | 2-399 | 81,214 | 81,215 | 81,216 | 81,217 | 81,218 | 81,219 | 81,220 | 81,221 | 81,222 | 81,223 | 81,224 | 81,225 |
| | 2-400 | 81,239 | 81,240 | 81,241 | 81,242 | 81,243 | 81,244 | 81,245 | 81,246 | 81,247 | 81,248 | 81,249 | 81,250 |
| | 2-401 | 81,264 | 81,265 | 81,266 | 81,267 | 81,268 | 81,269 | 81,270 | 81,271 | 81,272 | 81,273 | 81,274 | 81,275 |
| | 2-402 | 81,289 | 81,290 | 81,291 | 81,292 | 81,293 | 81,294 | 81,295 | 81,296 | 81,297 | 81,298 | 81,299 | 81,300 |
| | 2-403 | 81,314 | 81,315 | 81,316 | 81,317 | 81,318 | 81,319 | 81,320 | 81,321 | 81,322 | 81,323 | 81,324 | 81,325 |
| | 2-404 | 81,339 | 81,340 | 81,341 | 81,342 | 81,343 | 81,344 | 81,345 | 81,346 | 81,347 | 81,348 | 81,349 | 81,350 |
| | 2-405 | 81,364 | 81,365 | 81,366 | 81,367 | 81,368 | 81,369 | 81,370 | 81,371 | 81,372 | 81,373 | 81,374 | 81,375 |
| | 2-406 | 81,389 | 81,390 | 81,391 | 81,392 | 81,393 | 81,394 | 81,395 | 81,396 | 81,397 | 81,398 | 81,399 | 81,400 |
| | 2-407 | 81,414 | 81,415 | 81,416 | 81,417 | 81,418 | 81,419 | 81,420 | 81,421 | 81,422 | 81,423 | 81,424 | 81,425 |
| | 2-408 | 81,439 | 81,440 | 81,441 | 81,442 | 81,443 | 81,444 | 81,445 | 81,446 | 81,447 | 81,448 | 81,449 | 81,450 |
| | 2-409 | 81,464 | 81,465 | 81,466 | 81,467 | 81,468 | 81,469 | 81,470 | 81,471 | 81,472 | 81,473 | 81,474 | 81,475 |
| | 2-410 | 81,489 | 81,490 | 81,491 | 81,492 | 81,493 | 81,494 | 81,495 | 81,496 | 81,497 | 81,498 | 81,499 | 81,500 |
| | 2-411 | 81,514 | 81,515 | 81,516 | 81,517 | 81,518 | 81,519 | 81,520 | 81,521 | 81,522 | 81,523 | 81,524 | 81,525 |
| | 2-412 | 81,539 | 81,540 | 81,541 | 81,542 | 81,543 | 81,544 | 81,545 | 81,546 | 81,547 | 81,548 | 81,549 | 81,550 |
| | 2-413 | 81,564 | 81,565 | 81,566 | 81,567 | 81,568 | 81,569 | 81,570 | 81,571 | 81,572 | 81,573 | 81,574 | 81,575 |
| | 2-414 | 81,589 | 81,590 | 81,591 | 81,592 | 81,593 | 81,594 | 81,595 | 81,596 | 81,597 | 81,598 | 81,599 | 81,600 |
| | 2-415 | 81,614 | 81,615 | 81,616 | 81,617 | 81,618 | 81,619 | 81,620 | 81,621 | 81,622 | 81,623 | 81,624 | 81,625 |
| | 2-416 | 81,639 | 81,640 | 81,641 | 81,642 | 81,643 | 81,644 | 81,645 | 81,646 | 81,647 | 81,648 | 81,649 | 81,650 |
| | 2-417 | 81,664 | 81,665 | 81,666 | 81,667 | 81,668 | 81,669 | 81,670 | 81,671 | 81,672 | 81,673 | 81,674 | 81,675 |
| | 2-418 | 81,689 | 81,690 | 81,691 | 81,692 | 81,693 | 81,694 | 81,695 | 81,696 | 81,697 | 81,698 | 81,699 | 81,700 |
| | 2-419 | 81,714 | 81,715 | 81,716 | 81,717 | 81,718 | 81,719 | 81,720 | 81,721 | 81,722 | 81,723 | 81,724 | 81,725 |
| | 2-420 | 81,739 | 81,740 | 81,741 | 81,742 | 81,743 | 81,744 | 81,745 | 81,746 | 81,747 | 81,748 | 81,749 | 81,750 |
| | 2-421 | 81,764 | 81,765 | 81,766 | 81,767 | 81,768 | 81,769 | 81,770 | 81,771 | 81,772 | 81,773 | 81,774 | 81,775 |
| | 2-422 | 81,789 | 81,790 | 81,791 | 81,792 | 81,793 | 81,794 | 81,795 | 81,796 | 81,797 | 81,798 | 81,799 | 81,800 |
| | 2-423 | 81,814 | 81,815 | 81,816 | 81,817 | 81,818 | 81,819 | 81,820 | 81,821 | 81,822 | 81,823 | 81,824 | 81,825 |
| | 2-424 | 81,839 | 81,840 | 81,841 | 81,842 | 81,843 | 81,844 | 81,845 | 81,846 | 81,847 | 81,848 | 81,849 | 81,850 |
| | 2-425 | 81,864 | 81,865 | 81,866 | 81,867 | 81,868 | 81,869 | 81,870 | 81,871 | 81,872 | 81,873 | 81,874 | 81,875 |
| | 2-426 | 81,889 | 81,890 | 81,891 | 81,892 | 81,893 | 81,894 | 81,895 | 81,896 | 81,897 | 81,898 | 81,899 | 81,900 |
| | 2-427 | 81,914 | 81,915 | 81,916 | 81,917 | 81,918 | 81,919 | 81,920 | 81,921 | 81,922 | 81,923 | 81,924 | 81,925 |
| | 2-428 | 81,939 | 81,940 | 81,941 | 81,942 | 81,943 | 81,944 | 81,945 | 81,946 | 81,947 | 81,948 | 81,949 | 81,950 |
| | 2-429 | 81,964 | 81,965 | 81,966 | 81,967 | 81,968 | 81,969 | 81,970 | 81,971 | 81,972 | 81,973 | 81,974 | 81,975 |
| | 2-430 | 81,989 | 81,990 | 81,991 | 81,992 | 81,993 | 81,994 | 81,995 | 81,996 | 81,997 | 81,998 | 81,999 | 82,000 |
| | 2-431 | 82,014 | 82,015 | 82,016 | 82,017 | 82,018 | 82,019 | 82,020 | 82,021 | 82,022 | 82,023 | 82,024 | 82,025 |
| | 2-432 | 82,039 | 82,040 | 82,041 | 82,042 | 82,043 | 82,044 | 82,045 | 82,046 | 82,047 | 82,048 | 82,049 | 82,050 |
| | 2-433 | 82,064 | 82,065 | 82,066 | 82,067 | 82,068 | 82,069 | 82,070 | 82,071 | 82,072 | 82,073 | 82,074 | 82,075 |
| | 2-434 | 82,089 | 82,090 | 82,091 | 82,092 | 82,093 | 82,094 | 82,095 | 82,096 | 82,097 | 82,098 | 82,099 | 82,100 |
| | 2-435 | 82,114 | 82,115 | 82,116 | 82,117 | 82,118 | 82,119 | 82,120 | 82,121 | 82,122 | 82,123 | 82,124 | 82,125 |
| | 2-436 | 82,139 | 82,140 | 82,141 | 82,142 | 82,143 | 82,144 | 82,145 | 82,146 | 82,147 | 82,148 | 82,149 | 82,150 |
| | 2-437 | 82,164 | 82,165 | 82,166 | 82,167 | 82,168 | 82,169 | 82,170 | 82,171 | 82,172 | 82,173 | 82,174 | 82,175 |
| | 2-438 | 82,189 | 82,190 | 82,191 | 82,192 | 82,193 | 82,194 | 82,195 | 82,196 | 82,197 | 82,198 | 82,199 | 82,200 |
| | 2-439 | 82,214 | 82,215 | 82,216 | 82,217 | 82,218 | 82,219 | 82,220 | 82,221 | 82,222 | 82,223 | 82,224 | 82,225 |
| | 2-440 | 82,239 | 82,240 | 82,241 | 82,242 | 82,243 | 82,244 | 82,245 | 82,246 | 82,247 | 82,248 | 82,249 | 82,250 |

TABLE 63

| | | Compound represented by the formula (1) | | | | | | | | | | | | |
|---|---|---|---|---|---|---|---|---|---|---|---|---|---|---|
| | | 1-151 | 1-152 | 1-153 | 1-154 | 1-155 | 1-156 | 1-157 | 1-158 | 1-159 | 1-160 | 1-161 | 1-162 | 1-163 |
| Compound represented by the formula (2) | 2-441 | 82,251 | 82,252 | 82,253 | 82,254 | 82,255 | 82,256 | 82,257 | 82,258 | 82,259 | 82,260 | 82,261 | 82,262 | 82,263 |
| | 2-442 | 82,276 | 82,277 | 82,278 | 82,279 | 82,280 | 82,281 | 82,282 | 82,283 | 82,284 | 82,285 | 82,286 | 82,287 | 82,288 |
| | 2-443 | 82,301 | 82,302 | 82,303 | 82,304 | 82,305 | 82,306 | 82,307 | 82,308 | 82,309 | 82,310 | 82,311 | 82,312 | 82,313 |
| | 2-444 | 82,326 | 82,327 | 82,328 | 82,329 | 82,330 | 82,331 | 82,332 | 82,333 | 82,334 | 82,335 | 82,336 | 82,337 | 82,338 |
| | 2-445 | 82,351 | 82,352 | 82,353 | 82,354 | 82,355 | 82,356 | 82,357 | 82,358 | 82,359 | 82,360 | 82,361 | 82,362 | 82,363 |
| | 2-446 | 82,376 | 82,377 | 82,378 | 82,379 | 82,380 | 82,381 | 82,382 | 82,383 | 82,384 | 82,385 | 82,386 | 82,387 | 82,388 |
| | 2-447 | 82,401 | 82,402 | 82,403 | 82,404 | 82,405 | 82,406 | 82,407 | 82,408 | 82,409 | 82,410 | 82,411 | 82,412 | 82,413 |
| | 2-448 | 82,426 | 82,427 | 82,428 | 82,429 | 82,430 | 82,431 | 82,432 | 82,433 | 82,434 | 82,435 | 82,436 | 82,437 | 82,438 |
| | 2-449 | 82,451 | 82,452 | 82,453 | 82,454 | 82,455 | 82,456 | 82,457 | 82,458 | 82,459 | 82,460 | 82,461 | 82,462 | 82,463 |
| | 2-450 | 82,476 | 82,477 | 82,478 | 82,479 | 82,480 | 82,481 | 82,482 | 82,483 | 82,484 | 82,485 | 82,486 | 82,487 | 82,488 |
| | 2-451 | 82,501 | 82,502 | 82,503 | 82,504 | 82,505 | 82,506 | 82,507 | 82,508 | 82,509 | 82,510 | 82,511 | 82,512 | 82,513 |
| | 2-452 | 82,526 | 82,527 | 82,528 | 82,529 | 82,530 | 82,531 | 82,532 | 82,533 | 82,534 | 82,535 | 82,536 | 82,537 | 82,538 |
| | 2-453 | 82,551 | 82,552 | 82,553 | 82,554 | 82,555 | 82,556 | 82,557 | 82,558 | 82,559 | 82,560 | 82,561 | 82,562 | 82,563 |
| | 2-454 | 82,576 | 82,577 | 82,578 | 82,579 | 82,580 | 82,581 | 82,582 | 82,583 | 82,584 | 82,585 | 82,586 | 82,587 | 82,588 |
| | 2-455 | 82,601 | 82,602 | 82,603 | 82,604 | 82,605 | 82,606 | 82,607 | 82,608 | 82,609 | 82,610 | 82,611 | 82,612 | 82,613 |
| | 2-456 | 82,626 | 82,627 | 82,628 | 82,629 | 82,630 | 82,631 | 82,632 | 82,633 | 82,634 | 82,635 | 82,636 | 82,637 | 82,638 |
| | 2-457 | 82,651 | 82,652 | 82,653 | 82,654 | 82,655 | 82,656 | 82,657 | 82,658 | 82,659 | 82,660 | 82,661 | 82,662 | 82,663 |
| | 2-458 | 82,676 | 82,677 | 82,678 | 82,679 | 82,680 | 82,681 | 82,682 | 82,683 | 82,684 | 82,685 | 82,686 | 82,687 | 82,688 |
| | 2-459 | 82,701 | 82,702 | 82,703 | 82,704 | 82,705 | 82,706 | 82,707 | 82,708 | 82,709 | 82,710 | 82,711 | 82,712 | 82,713 |
| | 2-460 | 82,726 | 82,727 | 82,728 | 82,729 | 82,730 | 82,731 | 82,732 | 82,733 | 82,734 | 82,735 | 82,736 | 82,737 | 82,738 |
| | 2-461 | 82,751 | 82,752 | 82,753 | 82,754 | 82,755 | 82,756 | 82,757 | 82,758 | 82,759 | 82,760 | 82,761 | 82,762 | 82,763 |
| | 2-462 | 82,776 | 82,777 | 82,778 | 82,779 | 82,780 | 82,781 | 82,782 | 82,783 | 82,784 | 82,785 | 82,786 | 82,787 | 82,788 |
| | 2-463 | 82,801 | 82,802 | 82,803 | 82,804 | 82,805 | 82,806 | 82,807 | 82,808 | 82,809 | 82,810 | 82,811 | 82,812 | 82,813 |
| | 2-464 | 82,826 | 82,827 | 82,828 | 82,829 | 82,830 | 82,831 | 82,832 | 82,833 | 82,834 | 82,835 | 82,836 | 82,837 | 82,838 |
| | 2-465 | 82,851 | 82,852 | 82,853 | 82,854 | 82,855 | 82,856 | 82,857 | 82,858 | 82,859 | 82,860 | 82,861 | 82,862 | 82,863 |
| | 2-466 | 82,876 | 82,877 | 82,878 | 82,879 | 82,880 | 82,881 | 82,882 | 82,883 | 82,884 | 82,885 | 82,886 | 82,887 | 82,888 |
| | 2-467 | 82,901 | 82,902 | 82,903 | 82,904 | 82,905 | 82,906 | 82,907 | 82,908 | 82,909 | 82,910 | 82,911 | 82,912 | 82,913 |
| | 2-468 | 82,926 | 82,927 | 82,928 | 82,929 | 82,930 | 82,931 | 82,932 | 82,933 | 82,934 | 82,935 | 82,936 | 82,937 | 82,938 |
| | 2-469 | 82,951 | 82,952 | 82,953 | 82,954 | 82,955 | 82,956 | 82,957 | 82,958 | 82,959 | 82,960 | 82,961 | 82,962 | 82,963 |
| | 2-470 | 82,976 | 82,977 | 82,978 | 82,979 | 82,980 | 82,981 | 82,982 | 82,983 | 82,984 | 82,985 | 82,986 | 82,987 | 82,988 |
| | 2-471 | 83,001 | 83,002 | 83,003 | 83,004 | 83,005 | 83,006 | 83,007 | 83,008 | 83,009 | 83,010 | 83,011 | 83,012 | 83,013 |
| | 2-472 | 83,026 | 83,027 | 83,028 | 83,029 | 83,030 | 83,031 | 83,032 | 83,033 | 83,034 | 83,035 | 83,036 | 83,037 | 83,038 |
| | 2-473 | 83,051 | 83,052 | 83,053 | 83,054 | 83,055 | 83,056 | 83,057 | 83,058 | 83,059 | 83,060 | 83,061 | 83,062 | 83,063 |
| | 2-474 | 83,076 | 83,077 | 83,078 | 83,079 | 83,080 | 83,081 | 83,082 | 83,083 | 83,084 | 83,085 | 83,086 | 83,087 | 83,088 |
| | 2-475 | 83,101 | 83,102 | 83,103 | 83,104 | 83,105 | 83,106 | 83,107 | 83,108 | 83,109 | 83,110 | 83,111 | 83,112 | 83,113 |

| | | Compound represented by the formula (1) | | | | | | | | | | | |
|---|---|---|---|---|---|---|---|---|---|---|---|---|---|
| | | 1-164 | 1-165 | 1-166 | 1-167 | 1-168 | 1-169 | 1-170 | 1-171 | 1-172 | 1-173 | 1-174 | 1-175 |
| Compound represented by the formula (2) | 2-441 | 82,264 | 82,265 | 82,266 | 82,267 | 82,268 | 82,269 | 82,270 | 82,271 | 82,272 | 82,273 | 82,274 | 82,275 |
| | 2-442 | 82,289 | 82,290 | 82,291 | 82,292 | 82,293 | 82,294 | 82,295 | 82,296 | 82,297 | 82,298 | 82,299 | 82,300 |
| | 2-443 | 82,314 | 82,315 | 82,316 | 82,317 | 82,318 | 82,319 | 82,320 | 82,321 | 82,322 | 82,323 | 82,324 | 82,325 |
| | 2-444 | 82,339 | 82,340 | 82,341 | 82,342 | 82,343 | 82,344 | 82,345 | 82,346 | 82,347 | 82,348 | 82,349 | 82,350 |
| | 2-445 | 82,364 | 82,365 | 82,366 | 82,367 | 82,368 | 82,369 | 82,370 | 82,371 | 82,372 | 82,373 | 82,374 | 82,375 |
| | 2-446 | 82,389 | 82,390 | 82,391 | 82,392 | 82,393 | 82,394 | 82,395 | 82,396 | 82,397 | 82,398 | 82,399 | 82,400 |
| | 2-447 | 82,414 | 82,415 | 82,416 | 82,417 | 82,418 | 82,419 | 82,420 | 82,421 | 82,422 | 82,423 | 82,424 | 82,425 |
| | 2-448 | 82,439 | 82,440 | 82,441 | 82,442 | 82,443 | 82,444 | 82,445 | 82,446 | 82,447 | 82,448 | 82,449 | 82,450 |
| | 2-449 | 82,464 | 82,465 | 82,466 | 82,467 | 82,468 | 82,469 | 82,470 | 82,471 | 82,472 | 82,473 | 82,474 | 82,475 |
| | 2-450 | 82,489 | 82,490 | 82,491 | 82,492 | 82,493 | 82,494 | 82,495 | 82,496 | 82,497 | 82,498 | 82,499 | 82,500 |
| | 2-451 | 82,514 | 82,515 | 82,516 | 82,517 | 82,518 | 82,519 | 82,520 | 82,521 | 82,522 | 82,523 | 82,524 | 82,525 |
| | 2-452 | 82,539 | 82,540 | 82,541 | 82,542 | 82,543 | 82,544 | 82,545 | 82,546 | 82,547 | 82,548 | 82,549 | 82,550 |
| | 2-453 | 82,564 | 82,565 | 82,566 | 82,567 | 82,568 | 82,569 | 82,570 | 82,571 | 82,572 | 82,573 | 82,574 | 82,575 |
| | 2-454 | 82,589 | 82,590 | 82,591 | 82,592 | 82,593 | 82,594 | 82,595 | 82,596 | 82,597 | 82,598 | 82,599 | 82,600 |
| | 2-455 | 82,614 | 82,615 | 82,616 | 82,617 | 82,618 | 82,619 | 82,620 | 82,621 | 82,622 | 82,623 | 82,624 | 82,625 |
| | 2-456 | 82,639 | 82,640 | 82,641 | 82,642 | 82,643 | 82,644 | 82,645 | 82,646 | 82,647 | 82,648 | 82,649 | 82,650 |
| | 2-457 | 82,664 | 82,665 | 82,666 | 82,667 | 82,668 | 82,669 | 82,670 | 82,671 | 82,672 | 82,673 | 82,674 | 82,675 |
| | 2-458 | 82,689 | 82,690 | 82,691 | 82,692 | 82,693 | 82,694 | 82,695 | 82,696 | 82,697 | 82,698 | 82,699 | 82,700 |
| | 2-459 | 82,714 | 82,715 | 82,716 | 82,717 | 82,718 | 82,719 | 82,720 | 82,721 | 82,722 | 82,723 | 82,724 | 82,725 |
| | 2-460 | 82,739 | 82,740 | 82,741 | 82,742 | 82,743 | 82,744 | 82,745 | 82,746 | 82,747 | 82,748 | 82,749 | 82,750 |
| | 2-461 | 82,764 | 82,765 | 82,766 | 82,767 | 82,768 | 82,769 | 82,770 | 82,771 | 82,772 | 82,773 | 82,774 | 82,775 |
| | 2-462 | 82,789 | 82,790 | 82,791 | 82,792 | 82,793 | 82,794 | 82,795 | 82,796 | 82,797 | 82,798 | 82,799 | 82,800 |
| | 2-463 | 82,814 | 82,815 | 82,816 | 82,817 | 82,818 | 82,819 | 82,820 | 82,821 | 82,822 | 82,823 | 82,824 | 82,825 |
| | 2-464 | 82,839 | 82,840 | 82,841 | 82,842 | 82,843 | 82,844 | 82,845 | 82,846 | 82,847 | 82,848 | 82,849 | 82,850 |
| | 2-465 | 82,864 | 82,865 | 82,866 | 82,867 | 82,868 | 82,869 | 82,870 | 82,871 | 82,872 | 82,873 | 82,874 | 82,875 |
| | 2-466 | 82,889 | 82,890 | 82,891 | 82,892 | 82,893 | 82,894 | 82,895 | 82,896 | 82,897 | 82,898 | 82,899 | 82,900 |
| | 2-467 | 82,914 | 82,915 | 82,916 | 82,917 | 82,918 | 82,919 | 82,920 | 82,921 | 82,922 | 82,923 | 82,924 | 82,925 |
| | 2-468 | 82,939 | 82,940 | 82,941 | 82,942 | 82,943 | 82,944 | 82,945 | 82,946 | 82,947 | 82,948 | 82,949 | 82,950 |
| | 2-469 | 82,964 | 82,965 | 82,966 | 82,967 | 82,968 | 82,969 | 82,970 | 82,971 | 82,972 | 82,973 | 82,974 | 82,975 |
| | 2-470 | 82,989 | 82,990 | 82,991 | 82,992 | 82,993 | 82,994 | 82,995 | 82,996 | 82,997 | 82,998 | 82,999 | 83,000 |
| | 2-471 | 83,014 | 83,015 | 83,016 | 83,017 | 83,018 | 83,019 | 83,020 | 83,021 | 83,022 | 83,023 | 83,024 | 83,025 |
| | 2-472 | 83,039 | 83,040 | 83,041 | 83,042 | 83,043 | 83,044 | 83,045 | 83,046 | 83,047 | 83,048 | 83,049 | 83,050 |
| | 2-473 | 83,064 | 83,065 | 83,066 | 83,067 | 83,068 | 83,069 | 83,070 | 83,071 | 83,072 | 83,073 | 83,074 | 83,075 |
| | 2-474 | 83,089 | 83,090 | 83,091 | 83,092 | 83,093 | 83,094 | 83,095 | 83,096 | 83,097 | 83,098 | 83,099 | 83,100 |
| | 2-475 | 83,114 | 83,115 | 83,116 | 83,117 | 83,118 | 83,119 | 83,120 | 83,121 | 83,122 | 83,123 | 83,124 | 83,125 |

TABLE 64

| | | Compound represented by the formula (1) | | | | | | | | | | | | |
|---|---|---|---|---|---|---|---|---|---|---|---|---|---|---|
| | | 1-176 | 1-177 | 1-178 | 1-179 | 1-180 | 1-181 | 1-182 | 1-183 | 1-184 | 1-185 | 1-186 | 1-187 | 1-188 |
| Compound represented by the formula (2) | 2-1 | 83,126 | 83,127 | 83,128 | 83,129 | 83,130 | 83,131 | 83,132 | 83,133 | 83,134 | 83,135 | 83,136 | 83,137 | 83,138 |
| | 2-2 | 83,151 | 83,152 | 83,153 | 83,154 | 83,155 | 83,156 | 83,157 | 83,158 | 83,159 | 83,160 | 83,161 | 83,162 | 83,163 |
| | 2-3 | 83,176 | 83,177 | 83,178 | 83,179 | 83,180 | 83,181 | 83,182 | 83,183 | 83,184 | 83,185 | 83,186 | 83,187 | 83,188 |
| | 2-4 | 83,201 | 83,202 | 83,203 | 83,204 | 83,205 | 83,206 | 83,207 | 83,208 | 83,209 | 83,210 | 83,211 | 83,212 | 83,213 |
| | 2-5 | 83,226 | 83,227 | 83,228 | 83,229 | 83,230 | 83,231 | 83,232 | 83,233 | 83,234 | 83,235 | 83,236 | 83,237 | 83,238 |
| | 2-6 | 83,251 | 83,252 | 83,253 | 83,254 | 83,255 | 83,256 | 83,257 | 83,258 | 83,259 | 83,260 | 83,261 | 83,262 | 83,263 |
| | 2-7 | 83,276 | 83,277 | 83,278 | 83,279 | 83,280 | 83,281 | 83,282 | 83,283 | 83,284 | 83,285 | 83,286 | 83,287 | 83,288 |
| | 2-8 | 83,301 | 83,302 | 83,303 | 83,304 | 83,305 | 83,306 | 83,307 | 83,308 | 83,309 | 83,310 | 83,311 | 83,312 | 83,313 |
| | 2-9 | 83,326 | 83,327 | 83,328 | 83,329 | 83,330 | 83,331 | 83,332 | 83,333 | 83,334 | 83,335 | 83,336 | 83,337 | 83,338 |
| | 2-10 | 83,351 | 83,352 | 83,353 | 83,354 | 83,355 | 83,356 | 83,357 | 83,358 | 83,359 | 83,360 | 83,361 | 83,362 | 83,363 |
| | 2-11 | 83,376 | 83,377 | 83,378 | 83,379 | 83,380 | 83,381 | 83,382 | 83,383 | 83,384 | 83,385 | 83,386 | 83,387 | 83,388 |
| | 2-12 | 83,401 | 83,402 | 83,403 | 83,404 | 83,405 | 83,406 | 83,407 | 83,408 | 83,409 | 83,410 | 83,411 | 83,412 | 83,413 |
| | 2-13 | 83,426 | 83,427 | 83,428 | 83,429 | 83,430 | 83,431 | 83,432 | 83,433 | 83,434 | 83,435 | 83,436 | 83,437 | 83,438 |
| | 2-14 | 83,451 | 83,452 | 83,453 | 83,454 | 83,455 | 83,456 | 83,457 | 83,458 | 83,459 | 83,460 | 83,461 | 83,462 | 83,463 |
| | 2-15 | 83,476 | 83,477 | 83,478 | 83,479 | 83,480 | 83,481 | 83,482 | 83,483 | 83,484 | 83,485 | 83,486 | 83,487 | 83,488 |
| | 2-16 | 83,501 | 83,502 | 83,503 | 83,504 | 83,505 | 83,506 | 83,507 | 83,508 | 83,509 | 83,510 | 83,511 | 83,512 | 83,513 |
| | 2-17 | 83,526 | 83,527 | 83,528 | 83,529 | 83,530 | 83,531 | 83,532 | 83,533 | 83,534 | 83,535 | 83,536 | 83,537 | 83,538 |
| | 2-18 | 83,551 | 83,552 | 83,553 | 83,554 | 83,555 | 83,556 | 83,557 | 83,558 | 83,559 | 83,560 | 83,561 | 83,562 | 83,563 |
| | 2-19 | 83,576 | 83,577 | 83,578 | 83,579 | 83,580 | 83,581 | 83,582 | 83,583 | 83,584 | 83,585 | 83,586 | 83,587 | 83,588 |
| | 2-20 | 83,601 | 83,602 | 83,603 | 83,604 | 83,605 | 83,606 | 83,607 | 83,608 | 83,609 | 83,610 | 83,611 | 83,612 | 83,613 |
| | 2-21 | 83,626 | 83,627 | 83,628 | 83,629 | 83,630 | 83,631 | 83,632 | 83,633 | 83,634 | 83,635 | 83,636 | 83,637 | 83,638 |
| | 2-22 | 83,651 | 83,652 | 83,653 | 83,654 | 83,655 | 83,656 | 83,657 | 83,658 | 83,659 | 83,660 | 83,661 | 83,662 | 83,663 |
| | 2-23 | 83,676 | 83,677 | 83,678 | 83,679 | 83,680 | 83,681 | 83,682 | 83,683 | 83,684 | 83,685 | 83,686 | 83,687 | 83,688 |
| | 2-24 | 83,701 | 83,702 | 83,703 | 83,704 | 83,705 | 83,706 | 83,707 | 83,708 | 83,709 | 83,710 | 83,711 | 83,712 | 83,713 |
| | 2-25 | 83,726 | 83,727 | 83,728 | 83,729 | 83,730 | 83,731 | 83,732 | 83,733 | 83,734 | 83,735 | 83,736 | 83,737 | 83,738 |
| | 2-26 | 83,751 | 83,752 | 83,753 | 83,754 | 83,755 | 83,756 | 83,757 | 83,758 | 83,759 | 83,760 | 83,761 | 83,762 | 83,763 |
| | 2-27 | 83,776 | 83,777 | 83,778 | 83,779 | 83,780 | 83,781 | 83,782 | 83,783 | 83,784 | 83,785 | 83,786 | 83,787 | 83,788 |
| | 2-28 | 83,801 | 83,802 | 83,803 | 83,804 | 83,805 | 83,806 | 83,807 | 83,808 | 83,809 | 83,810 | 83,811 | 83,812 | 83,813 |
| | 2-29 | 83,826 | 83,827 | 83,828 | 83,829 | 83,830 | 83,831 | 83,832 | 83,833 | 83,834 | 83,835 | 83,836 | 83,837 | 83,838 |
| | 2-30 | 83,851 | 83,852 | 83,853 | 83,854 | 83,855 | 83,856 | 83,857 | 83,858 | 83,859 | 83,860 | 83,861 | 83,862 | 83,863 |
| | 2-31 | 83,876 | 83,877 | 83,878 | 83,879 | 83,880 | 83,881 | 83,882 | 83,883 | 83,884 | 83,885 | 83,886 | 83,887 | 83,888 |
| | 2-32 | 83,901 | 83,902 | 83,903 | 83,904 | 83,905 | 83,906 | 83,907 | 83,908 | 83,909 | 83,910 | 83,911 | 83,912 | 83,913 |
| | 2-33 | 83,926 | 83,927 | 83,928 | 83,929 | 83,930 | 83,931 | 83,932 | 83,933 | 83,934 | 83,935 | 83,936 | 83,937 | 83,938 |
| | 2-34 | 83,951 | 83,952 | 83,953 | 83,954 | 83,955 | 83,956 | 83,957 | 83,958 | 83,959 | 83,960 | 83,961 | 83,962 | 83,963 |
| | 2-35 | 83,976 | 83,977 | 83,978 | 83,979 | 83,980 | 83,981 | 83,982 | 83,983 | 83,984 | 83,985 | 83,986 | 83,987 | 83,988 |
| | 2-36 | 84,001 | 84,002 | 84,003 | 84,004 | 84,005 | 84,006 | 84,007 | 84,008 | 84,009 | 84,010 | 84,011 | 84,012 | 84,013 |
| | 2-37 | 84,026 | 84,027 | 84,028 | 84,029 | 84,030 | 84,031 | 84,032 | 84,033 | 84,034 | 84,035 | 84,036 | 84,037 | 84,038 |
| | 2-38 | 84,051 | 84,052 | 84,053 | 84,054 | 84,055 | 84,056 | 84,057 | 84,058 | 84,059 | 84,060 | 84,061 | 84,062 | 84,063 |
| | 2-39 | 84,076 | 84,077 | 84,078 | 84,079 | 84,080 | 84,081 | 84,082 | 84,083 | 84,084 | 84,085 | 84,086 | 84,087 | 84,088 |
| | 2-40 | 84,101 | 84,102 | 84,103 | 84,104 | 84,105 | 84,106 | 84,107 | 84,108 | 84,109 | 84,110 | 84,111 | 84,112 | 84,113 |
| | 2-41 | 84,126 | 84,127 | 84,128 | 84,129 | 84,130 | 84,131 | 84,132 | 84,133 | 84,134 | 84,135 | 84,136 | 84,137 | 84,138 |
| | 2-42 | 84,151 | 84,152 | 84,153 | 84,154 | 84,155 | 84,156 | 84,157 | 84,158 | 84,159 | 84,160 | 84,161 | 84,162 | 84,163 |
| | 2-43 | 84,176 | 84,177 | 84,178 | 84,179 | 84,180 | 84,181 | 84,182 | 84,183 | 84,184 | 84,185 | 84,186 | 84,187 | 84,188 |
| | 2-44 | 84,201 | 84,202 | 84,203 | 84,204 | 84,205 | 84,206 | 84,207 | 84,208 | 84,209 | 84,210 | 84,211 | 84,212 | 84,213 |
| | 2-45 | 84,226 | 84,227 | 84,228 | 84,229 | 84,230 | 84,231 | 84,232 | 84,233 | 84,234 | 84,235 | 84,236 | 84,237 | 84,238 |
| | 2-46 | 84,251 | 84,252 | 84,253 | 84,254 | 84,255 | 84,256 | 84,257 | 84,258 | 84,259 | 84,260 | 84,261 | 84,262 | 84,263 |
| | 2-47 | 84,276 | 84,277 | 84,278 | 84,279 | 84,280 | 84,281 | 84,282 | 84,283 | 84,284 | 84,285 | 84,286 | 84,287 | 84,288 |
| | 2-48 | 84,301 | 84,302 | 84,303 | 84,304 | 84,305 | 84,306 | 84,307 | 84,308 | 84,309 | 84,310 | 84,311 | 84,312 | 84,313 |
| | 2-49 | 84,326 | 84,327 | 84,328 | 84,329 | 84,330 | 84,331 | 84,332 | 84,333 | 84,334 | 84,335 | 84,336 | 84,337 | 84,338 |
| | 2-50 | 84,351 | 84,352 | 84,353 | 84,354 | 84,355 | 84,356 | 84,357 | 84,358 | 84,359 | 84,360 | 84,361 | 84,362 | 84,363 |
| | 2-51 | 84,376 | 84,377 | 84,378 | 84,379 | 84,380 | 84,381 | 84,382 | 84,383 | 84,384 | 84,385 | 84,386 | 84,387 | 84,388 |
| | 2-52 | 84,401 | 84,402 | 84,403 | 84,404 | 84,405 | 84,406 | 84,407 | 84,408 | 84,409 | 84,410 | 84,411 | 84,412 | 84,413 |
| | 2-53 | 84,426 | 84,427 | 84,428 | 84,429 | 84,430 | 84,431 | 84,432 | 84,433 | 84,434 | 84,435 | 84,436 | 84,437 | 84,438 |
| | 2-54 | 84,451 | 84,452 | 84,453 | 84,454 | 84,455 | 84,456 | 84,457 | 84,458 | 84,459 | 84,460 | 84,461 | 84,462 | 84,463 |
| | 2-55 | 84,476 | 84,477 | 84,478 | 84,479 | 84,480 | 84,481 | 84,482 | 84,483 | 84,484 | 84,485 | 84,486 | 84,487 | 84,488 |

| | | Compound represented by the formula (1) | | | | | | | | | | | |
|---|---|---|---|---|---|---|---|---|---|---|---|---|---|
| | | 1-189 | 1-190 | 1-191 | 1-192 | 1-193 | 1-194 | 1-195 | 1-196 | 1-197 | 1-198 | 1-199 | 1-200 |
| Compound represented by the formula (2) | 2-1 | 83,139 | 83,140 | 83,141 | 83,142 | 83,143 | 83,144 | 83,145 | 83,146 | 83,147 | 83,148 | 83,149 | 83,150 |
| | 2-2 | 83,164 | 83,165 | 83,166 | 83,167 | 83,168 | 83,169 | 83,170 | 83,171 | 83,172 | 83,173 | 83,174 | 83,175 |
| | 2-3 | 83,189 | 83,190 | 83,191 | 83,192 | 83,193 | 83,194 | 83,195 | 83,196 | 83,197 | 83,198 | 83,199 | 83,200 |
| | 2-4 | 83,214 | 83,215 | 83,216 | 83,217 | 83,218 | 83,219 | 83,220 | 83,221 | 83,222 | 83,223 | 83,224 | 83,225 |
| | 2-5 | 83,239 | 83,240 | 83,241 | 83,242 | 83,243 | 83,244 | 83,245 | 83,246 | 83,247 | 83,248 | 83,249 | 83,250 |
| | 2-6 | 83,264 | 83,265 | 83,266 | 83,267 | 83,268 | 83,269 | 83,270 | 83,271 | 83,272 | 83,273 | 83,274 | 83,275 |
| | 2-7 | 83,289 | 83,290 | 83,291 | 83,292 | 83,293 | 83,294 | 83,295 | 83,296 | 83,297 | 83,298 | 83,299 | 83,300 |
| | 2-8 | 83,314 | 83,315 | 83,316 | 83,317 | 83,318 | 83,319 | 83,320 | 83,321 | 83,322 | 83,323 | 83,324 | 83,325 |
| | 2-9 | 83,339 | 83,340 | 83,341 | 83,342 | 83,343 | 83,344 | 83,345 | 83,346 | 83,347 | 83,348 | 83,349 | 83,350 |
| | 2-10 | 83,364 | 83,365 | 83,366 | 83,367 | 83,368 | 83,369 | 83,370 | 83,371 | 83,372 | 83,373 | 83,374 | 83,375 |
| | 2-11 | 83,389 | 83,390 | 83,391 | 83,392 | 83,393 | 83,394 | 83,395 | 83,396 | 83,397 | 83,398 | 83,399 | 83,400 |
| | 2-12 | 83,414 | 83,415 | 83,416 | 83,417 | 83,418 | 83,419 | 83,420 | 83,421 | 83,422 | 83,423 | 83,424 | 83,425 |
| | 2-13 | 83,439 | 83,440 | 83,441 | 83,442 | 83,443 | 83,444 | 83,445 | 83,446 | 83,447 | 83,448 | 83,449 | 83,450 |
| | 2-14 | 83,464 | 83,465 | 83,466 | 83,467 | 83,468 | 83,469 | 83,470 | 83,471 | 83,472 | 83,473 | 83,474 | 83,475 |
| | 2-15 | 83,489 | 83,490 | 83,491 | 83,492 | 83,493 | 83,494 | 83,495 | 83,496 | 83,497 | 83,498 | 83,499 | 83,500 |
| | 2-16 | 83,514 | 83,515 | 83,516 | 83,517 | 83,518 | 83,519 | 83,520 | 83,521 | 83,522 | 83,523 | 83,524 | 83,525 |

TABLE 64-continued

| | | | | | | | | | | | | |
|---|---|---|---|---|---|---|---|---|---|---|---|---|
| 2-17 | 83,539 | 83,540 | 83,541 | 83,542 | 83,543 | 83,544 | 83,545 | 83,546 | 83,547 | 83,548 | 83,549 | 83,550 |
| 2-18 | 83,564 | 83,565 | 83,566 | 83,567 | 83,568 | 83,569 | 83,570 | 83,571 | 83,572 | 83,573 | 83,574 | 83,575 |
| 2-19 | 83,589 | 83,590 | 83,591 | 83,592 | 83,593 | 83,594 | 83,595 | 83,596 | 83,597 | 83,598 | 83,599 | 83,600 |
| 2-20 | 83,614 | 83,615 | 83,616 | 83,617 | 83,618 | 83,619 | 83,620 | 83,621 | 83,622 | 83,623 | 83,624 | 83,625 |
| 2-21 | 83,639 | 83,640 | 83,641 | 83,642 | 83,643 | 83,644 | 83,645 | 83,646 | 83,647 | 83,648 | 83,649 | 83,650 |
| 2-22 | 83,664 | 83,665 | 83,666 | 83,667 | 83,668 | 83,669 | 83,670 | 83,671 | 83,672 | 83,673 | 83,674 | 83,675 |
| 2-23 | 83,689 | 83,690 | 83,691 | 83,692 | 83,693 | 83,694 | 83,695 | 83,696 | 83,697 | 83,698 | 83,699 | 83,700 |
| 2-24 | 83,714 | 83,715 | 83,716 | 83,717 | 83,718 | 83,719 | 83,720 | 83,721 | 83,722 | 83,723 | 83,724 | 83,725 |
| 2-25 | 83,739 | 83,740 | 83,741 | 83,742 | 83,743 | 83,744 | 83,745 | 83,746 | 83,747 | 83,748 | 83,749 | 83,750 |
| 2-26 | 83,764 | 83,765 | 83,766 | 83,767 | 83,768 | 83,769 | 83,770 | 83,771 | 83,772 | 83,773 | 83,774 | 83,775 |
| 2-27 | 83,789 | 83,790 | 83,791 | 83,792 | 83,793 | 83,794 | 83,795 | 83,796 | 83,797 | 83,798 | 83,799 | 83,800 |
| 2-28 | 83,814 | 83,815 | 83,816 | 83,817 | 83,818 | 83,819 | 83,820 | 83,821 | 83,822 | 83,823 | 83,824 | 83,825 |
| 2-29 | 83,839 | 83,840 | 83,841 | 83,842 | 83,843 | 83,844 | 83,845 | 83,846 | 83,847 | 83,848 | 83,849 | 83,850 |
| 2-30 | 83,864 | 83,865 | 83,866 | 83,867 | 83,868 | 83,869 | 83,870 | 83,871 | 83,872 | 83,873 | 83,874 | 83,875 |
| 2-31 | 83,889 | 83,890 | 83,891 | 83,892 | 83,893 | 83,894 | 83,895 | 83,896 | 83,897 | 83,898 | 83,899 | 83,900 |
| 2-32 | 83,914 | 83,915 | 83,916 | 83,917 | 83,918 | 83,919 | 83,920 | 83,921 | 83,922 | 83,923 | 83,924 | 83,925 |
| 2-33 | 83,939 | 83,940 | 83,941 | 83,942 | 83,943 | 83,944 | 83,945 | 83,946 | 83,947 | 83,948 | 83,949 | 83,950 |
| 2-34 | 83,964 | 83,965 | 83,966 | 83,967 | 83,968 | 83,969 | 83,970 | 83,971 | 83,972 | 83,973 | 83,974 | 83,975 |
| 2-35 | 83,989 | 83,990 | 83,991 | 83,992 | 83,993 | 83,994 | 83,995 | 83,996 | 83,997 | 83,998 | 83,999 | 84,000 |
| 2-36 | 84,014 | 84,015 | 84,016 | 84,017 | 84,018 | 84,019 | 84,020 | 84,021 | 84,022 | 84,023 | 84,024 | 84,025 |
| 2-37 | 84,039 | 84,040 | 84,041 | 84,042 | 84,043 | 84,044 | 84,045 | 84,046 | 84,047 | 84,048 | 84,049 | 84,050 |
| 2-38 | 84,064 | 84,065 | 84,066 | 84,067 | 84,068 | 84,069 | 84,070 | 84,071 | 84,072 | 84,073 | 84,074 | 84,075 |
| 2-39 | 84,089 | 84,090 | 84,091 | 84,092 | 84,093 | 84,094 | 84,095 | 84,096 | 84,097 | 84,098 | 84,099 | 84,100 |
| 2-40 | 84,114 | 84,115 | 84,116 | 84,117 | 84,118 | 84,119 | 84,120 | 84,121 | 84,122 | 84,123 | 84,124 | 84,125 |
| 2-41 | 84,139 | 84,140 | 84,141 | 84,142 | 84,143 | 84,144 | 84,145 | 84,146 | 84,147 | 84,148 | 84,149 | 84,150 |
| 2-42 | 84,164 | 84,165 | 84,166 | 84,167 | 84,168 | 84,169 | 84,170 | 84,171 | 84,172 | 84,173 | 84,174 | 84,175 |
| 2-43 | 84,189 | 84,190 | 84,191 | 84,192 | 84,193 | 84,194 | 84,195 | 84,196 | 84,197 | 84,198 | 84,199 | 84,200 |
| 2-44 | 84,214 | 84,215 | 84,216 | 84,217 | 84,218 | 84,219 | 84,220 | 84,221 | 84,222 | 84,223 | 84,224 | 84,225 |
| 2-45 | 84,239 | 84,240 | 84,241 | 84,242 | 84,243 | 84,244 | 84,245 | 84,246 | 84,247 | 84,248 | 84,249 | 84,250 |
| 2-46 | 84,264 | 84,265 | 84,266 | 84,267 | 84,268 | 84,269 | 84,270 | 84,271 | 84,272 | 84,273 | 84,274 | 84,275 |
| 2-47 | 84,289 | 84,290 | 84,291 | 84,292 | 84,293 | 84,294 | 84,295 | 84,296 | 84,297 | 84,298 | 84,299 | 84,300 |
| 2-48 | 84,314 | 84,315 | 84,316 | 84,317 | 84,318 | 84,319 | 84,320 | 84,321 | 84,322 | 84,323 | 84,324 | 84,325 |
| 2-49 | 84,339 | 84,340 | 84,341 | 84,342 | 84,343 | 84,344 | 84,345 | 84,346 | 84,347 | 84,348 | 84,349 | 84,350 |
| 2-50 | 84,364 | 84,365 | 84,366 | 84,367 | 84,368 | 84,369 | 84,370 | 84,371 | 84,372 | 84,373 | 84,374 | 84,375 |
| 2-51 | 84,389 | 84,390 | 84,391 | 84,392 | 84,393 | 84,394 | 84,395 | 84,396 | 84,397 | 84,398 | 84,399 | 84,400 |
| 2-52 | 84,414 | 84,415 | 84,416 | 84,417 | 84,418 | 84,419 | 84,420 | 84,421 | 84,422 | 84,423 | 84,424 | 84,425 |
| 2-53 | 84,439 | 84,440 | 84,441 | 84,442 | 84,443 | 84,444 | 84,445 | 84,446 | 84,447 | 84,448 | 84,449 | 84,450 |
| 2-54 | 84,464 | 84,465 | 84,466 | 84,467 | 84,468 | 84,469 | 84,470 | 84,471 | 84,472 | 84,473 | 84,474 | 84,475 |
| 2-55 | 84,489 | 84,490 | 84,491 | 84,492 | 84,493 | 84,494 | 84,495 | 84,496 | 84,497 | 84,498 | 84,499 | 84,500 |

TABLE 65

| | | Compound represented by the formula (1) | | | | | | | | | | | | |
|---|---|---|---|---|---|---|---|---|---|---|---|---|---|---|
| | | 1-176 | 1-177 | 1-178 | 1-179 | 1-180 | 1-181 | 1-182 | 1-183 | 1-184 | 1-185 | 1-186 | 1-187 | 1-188 |
| Compound represented by the formula (2) | 2-56 | 84,501 | 84,502 | 84,503 | 84,504 | 84,505 | 84,506 | 84,507 | 84,508 | 84,509 | 84,510 | 84,511 | 84,512 | 84,513 |
| | 2-57 | 84,526 | 84,527 | 84,528 | 84,529 | 84,530 | 84,531 | 84,532 | 84,533 | 84,534 | 84,535 | 84,536 | 84,537 | 84,538 |
| | 2-58 | 84,551 | 84,552 | 84,553 | 84,554 | 84,555 | 84,556 | 84,557 | 84,558 | 84,559 | 84,560 | 84,561 | 84,562 | 84,563 |
| | 2-59 | 84,576 | 84,577 | 84,578 | 84,579 | 84,580 | 84,581 | 84,582 | 84,583 | 84,584 | 84,585 | 84,586 | 84,587 | 84,588 |
| | 2-60 | 84,601 | 84,602 | 84,603 | 84,604 | 84,605 | 84,606 | 84,607 | 84,608 | 84,609 | 84,610 | 84,611 | 84,612 | 84,613 |
| | 2-61 | 84,626 | 84,627 | 84,628 | 84,629 | 84,630 | 84,631 | 84,632 | 84,633 | 84,634 | 84,635 | 84,636 | 84,637 | 84,638 |
| | 2-62 | 84,651 | 84,652 | 84,653 | 84,654 | 84,655 | 84,656 | 84,657 | 84,658 | 84,659 | 84,660 | 84,661 | 84,662 | 84,663 |
| | 2-63 | 84,676 | 84,677 | 84,678 | 84,679 | 84,680 | 84,681 | 84,682 | 84,683 | 84,684 | 84,685 | 84,686 | 84,687 | 84,688 |
| | 2-64 | 84,701 | 84,702 | 84,703 | 84,704 | 84,705 | 84,706 | 84,707 | 84,708 | 84,709 | 84,710 | 84,711 | 84,712 | 84,713 |
| | 2-65 | 84,726 | 84,727 | 84,728 | 84,729 | 84,730 | 84,731 | 84,732 | 84,733 | 84,734 | 84,735 | 84,736 | 84,737 | 84,738 |
| | 2-66 | 84,751 | 84,752 | 84,753 | 84,754 | 84,755 | 84,756 | 84,757 | 84,758 | 84,759 | 84,760 | 84,761 | 84,762 | 84,763 |
| | 2-67 | 84,776 | 84,777 | 84,778 | 84,779 | 84,780 | 84,781 | 84,782 | 84,783 | 84,784 | 84,785 | 84,786 | 84,787 | 84,788 |
| | 2-68 | 84,801 | 84,802 | 84,803 | 84,804 | 84,805 | 84,806 | 84,807 | 84,808 | 84,809 | 84,810 | 84,811 | 84,812 | 84,813 |
| | 2-69 | 84,826 | 84,827 | 84,828 | 84,829 | 84,830 | 84,831 | 84,832 | 84,833 | 84,834 | 84,835 | 84,836 | 84,837 | 84,838 |
| | 2-70 | 84,851 | 84,852 | 84,853 | 84,854 | 84,855 | 84,856 | 84,857 | 84,858 | 84,859 | 84,860 | 84,861 | 84,862 | 84,863 |
| | 2-71 | 84,876 | 84,877 | 84,878 | 84,879 | 84,880 | 84,881 | 84,882 | 84,883 | 84,884 | 84,885 | 84,886 | 84,887 | 84,888 |
| | 2-72 | 84,901 | 84,902 | 84,903 | 84,904 | 84,905 | 84,906 | 84,907 | 84,908 | 84,909 | 84,910 | 84,911 | 84,912 | 84,913 |
| | 2-73 | 84,926 | 84,927 | 84,928 | 84,929 | 84,930 | 84,931 | 84,932 | 84,933 | 84,934 | 84,935 | 84,936 | 84,937 | 84,938 |
| | 2-74 | 84,951 | 84,952 | 84,953 | 84,954 | 84,955 | 84,956 | 84,957 | 84,958 | 84,959 | 84,960 | 84,961 | 84,962 | 84,963 |
| | 2-75 | 84,976 | 84,977 | 84,978 | 84,979 | 84,980 | 84,981 | 84,982 | 84,983 | 84,984 | 84,985 | 84,986 | 84,987 | 84,988 |
| | 2-76 | 85,001 | 85,002 | 85,003 | 85,004 | 85,005 | 85,006 | 85,007 | 85,008 | 85,009 | 85,010 | 85,011 | 85,012 | 85,013 |
| | 2-77 | 85,026 | 85,027 | 85,028 | 85,029 | 85,030 | 85,031 | 85,032 | 85,033 | 85,034 | 85,035 | 85,036 | 85,037 | 85,038 |
| | 2-78 | 85,051 | 85,052 | 85,053 | 85,054 | 85,055 | 85,056 | 85,057 | 85,058 | 85,059 | 85,060 | 85,061 | 85,062 | 85,063 |
| | 2-79 | 85,076 | 85,077 | 85,078 | 85,079 | 85,080 | 85,081 | 85,082 | 85,083 | 85,084 | 85,085 | 85,086 | 85,087 | 85,088 |
| | 2-80 | 85,101 | 85,102 | 85,103 | 85,104 | 85,105 | 85,106 | 85,107 | 85,108 | 85,109 | 85,110 | 85,111 | 85,112 | 85,113 |
| | 2-81 | 85,126 | 85,127 | 85,128 | 85,129 | 85,130 | 85,131 | 85,132 | 85,133 | 85,134 | 85,135 | 85,136 | 85,137 | 85,138 |
| | 2-82 | 85,151 | 85,152 | 85,153 | 85,154 | 85,155 | 85,156 | 85,157 | 85,158 | 85,159 | 85,160 | 85,161 | 85,162 | 85,163 |
| | 2-83 | 85,176 | 85,177 | 85,178 | 85,179 | 85,180 | 85,181 | 85,182 | 85,183 | 85,184 | 85,185 | 85,186 | 85,187 | 85,188 |
| | 2-84 | 85,201 | 85,202 | 85,203 | 85,204 | 85,205 | 85,206 | 85,207 | 85,208 | 85,209 | 85,210 | 85,211 | 85,212 | 85,213 |
| | 2-85 | 85,226 | 85,227 | 85,228 | 85,229 | 85,230 | 85,231 | 85,232 | 85,233 | 85,234 | 85,235 | 85,236 | 85,237 | 85,238 |
| | 2-86 | 85,251 | 85,252 | 85,253 | 85,254 | 85,255 | 85,256 | 85,257 | 85,258 | 85,259 | 85,260 | 85,261 | 85,262 | 85,263 |

TABLE 65-continued

| | | | | | | | | | | | | | |
|---|---|---|---|---|---|---|---|---|---|---|---|---|---|
| 2-87 | 85,276 | 85,277 | 85,278 | 85,279 | 85,280 | 85,281 | 85,282 | 85,283 | 85,284 | 85,285 | 85,286 | 85,287 | 85,288 |
| 2-88 | 85,301 | 85,302 | 85,303 | 85,304 | 85,305 | 85,306 | 85,307 | 85,308 | 85,309 | 85,310 | 85,311 | 85,312 | 85,313 |
| 2-89 | 85,326 | 85,327 | 85,328 | 85,329 | 85,330 | 85,331 | 85,332 | 85,333 | 85,334 | 85,335 | 85,336 | 85,337 | 85,338 |
| 2-90 | 85,351 | 85,352 | 85,353 | 85,354 | 85,355 | 85,356 | 85,357 | 85,358 | 85,359 | 85,360 | 85,361 | 85,362 | 85,363 |
| 2-91 | 85,376 | 85,377 | 85,378 | 85,379 | 85,380 | 85,381 | 85,382 | 85,383 | 85,384 | 85,385 | 85,386 | 85,387 | 85,388 |
| 2-92 | 85,401 | 85,402 | 85,403 | 85,404 | 85,405 | 85,406 | 85,407 | 85,408 | 85,409 | 85,410 | 85,411 | 85,412 | 85,413 |
| 2-93 | 85,426 | 85,427 | 85,428 | 85,429 | 85,430 | 85,431 | 85,432 | 85,433 | 85,434 | 85,435 | 85,436 | 85,437 | 85,438 |
| 2-94 | 85,451 | 85,452 | 85,453 | 85,454 | 85,455 | 85,456 | 85,457 | 85,458 | 85,459 | 85,460 | 85,461 | 85,462 | 85,463 |
| 2-95 | 85,476 | 85,477 | 85,478 | 85,479 | 85,480 | 85,481 | 85,482 | 85,483 | 85,484 | 85,485 | 85,486 | 85,487 | 85,488 |
| 2-96 | 85,501 | 85,502 | 85,503 | 85,504 | 85,505 | 85,506 | 85,507 | 85,508 | 85,509 | 85,510 | 85,511 | 85,512 | 85,513 |
| 2-97 | 85,526 | 85,527 | 85,528 | 85,529 | 85,530 | 85,531 | 85,532 | 85,533 | 85,534 | 85,535 | 85,536 | 85,537 | 85,538 |
| 2-98 | 85,551 | 85,552 | 85,553 | 85,554 | 85,555 | 85,556 | 85,557 | 85,558 | 85,559 | 85,560 | 85,561 | 85,562 | 85,563 |
| 2-99 | 85,576 | 85,577 | 85,578 | 85,579 | 85,580 | 85,581 | 85,582 | 85,583 | 85,584 | 85,585 | 85,586 | 85,587 | 85,588 |
| 2-100 | 85,601 | 85,602 | 85,603 | 85,604 | 85,605 | 85,606 | 85,607 | 85,608 | 85,609 | 85,610 | 85,611 | 85,612 | 85,613 |
| 2-101 | 85,626 | 85,627 | 85,628 | 85,629 | 85,630 | 85,631 | 85,632 | 85,633 | 85,634 | 85,635 | 85,636 | 85,637 | 85,638 |
| 2-102 | 85,651 | 85,652 | 85,653 | 85,654 | 85,655 | 85,656 | 85,657 | 85,658 | 85,659 | 85,660 | 85,661 | 85,662 | 85,663 |
| 2-103 | 85,676 | 85,677 | 85,678 | 85,679 | 85,680 | 85,681 | 85,682 | 85,683 | 85,684 | 85,685 | 85,686 | 85,687 | 85,688 |
| 2-104 | 85,701 | 85,702 | 85,703 | 85,704 | 85,705 | 85,706 | 85,707 | 85,708 | 85,709 | 85,710 | 85,711 | 85,712 | 85,713 |
| 2-105 | 85,726 | 85,727 | 85,728 | 85,729 | 85,730 | 85,731 | 85,732 | 85,733 | 85,734 | 85,735 | 85,736 | 85,737 | 85,738 |
| 2-106 | 85,751 | 85,752 | 85,753 | 85,754 | 85,755 | 85,756 | 85,757 | 85,758 | 85,759 | 85,760 | 85,761 | 85,762 | 85,763 |
| 2-107 | 85,776 | 85,777 | 85,778 | 85,779 | 85,780 | 85,781 | 85,782 | 85,783 | 85,784 | 85,785 | 85,786 | 85,787 | 85,788 |
| 2-108 | 85,801 | 85,802 | 85,803 | 85,804 | 85,805 | 85,806 | 85,807 | 85,808 | 85,809 | 85,810 | 85,811 | 85,812 | 85,813 |
| 2-109 | 85,826 | 85,827 | 85,828 | 85,829 | 85,830 | 85,831 | 85,832 | 85,833 | 85,834 | 85,835 | 85,836 | 85,837 | 85,838 |
| 2-110 | 85,851 | 85,852 | 85,853 | 85,854 | 85,855 | 85,856 | 85,857 | 85,858 | 85,859 | 85,860 | 85,861 | 85,862 | 85,863 |

| | | Compound represented by the formula (1) | | | | | | | | | | | |
|---|---|---|---|---|---|---|---|---|---|---|---|---|---|
| | | 1-189 | 1-190 | 1-191 | 1-192 | 1-193 | 1-194 | 1-195 | 1-196 | 1-197 | 1-198 | 1-199 | 1-200 |
| Compound represented by the formula (2) | 2-56 | 84,514 | 84,515 | 84,516 | 84,517 | 84,518 | 84,519 | 84,520 | 84,521 | 84,522 | 84,523 | 84,524 | 84,525 |
| | 2-57 | 84,539 | 84,540 | 84,541 | 84,542 | 84,543 | 84,544 | 84,545 | 84,546 | 84,547 | 84,548 | 84,549 | 84,550 |
| | 2-58 | 84,564 | 84,565 | 84,566 | 84,567 | 84,568 | 84,569 | 84,570 | 84,571 | 84,572 | 84,573 | 84,574 | 84,575 |
| | 2-59 | 84,589 | 84,590 | 84,591 | 84,592 | 84,593 | 84,594 | 84,595 | 84,596 | 84,597 | 84,598 | 84,599 | 84,600 |
| | 2-60 | 84,614 | 84,615 | 84,616 | 84,617 | 84,618 | 84,619 | 84,620 | 84,621 | 84,622 | 84,623 | 84,624 | 84,625 |
| | 2-61 | 84,639 | 84,640 | 84,641 | 84,642 | 84,643 | 84,644 | 84,645 | 84,646 | 84,647 | 84,648 | 84,649 | 84,650 |
| | 2-62 | 84,664 | 84,665 | 84,666 | 84,667 | 84,668 | 84,669 | 84,670 | 84,671 | 84,672 | 84,673 | 84,674 | 84,675 |
| | 2-63 | 84,689 | 84,690 | 84,691 | 84,692 | 84,693 | 84,694 | 84,695 | 84,696 | 84,697 | 84,698 | 84,699 | 84,700 |
| | 2-64 | 84,714 | 84,715 | 84,716 | 84,717 | 84,718 | 84,719 | 84,720 | 84,721 | 84,722 | 84,723 | 84,724 | 84,725 |
| | 2-65 | 84,739 | 84,740 | 84,741 | 84,742 | 84,743 | 84,744 | 84,745 | 84,746 | 84,747 | 84,748 | 84,749 | 84,750 |
| | 2-66 | 84,764 | 84,765 | 84,766 | 84,767 | 84,768 | 84,769 | 84,770 | 84,771 | 84,772 | 84,773 | 84,774 | 84,775 |
| | 2-67 | 84,789 | 84,790 | 84,791 | 84,792 | 84,793 | 84,794 | 84,795 | 84,796 | 84,797 | 84,798 | 84,799 | 84,800 |
| | 2-68 | 84,814 | 84,815 | 84,816 | 84,817 | 84,818 | 84,819 | 84,820 | 84,821 | 84,822 | 84,823 | 84,824 | 84,825 |
| | 2-69 | 84,839 | 84,840 | 84,841 | 84,842 | 84,843 | 84,844 | 84,845 | 84,846 | 84,847 | 84,848 | 84,849 | 84,850 |
| | 2-70 | 84,864 | 84,865 | 84,866 | 84,867 | 84,868 | 84,869 | 84,870 | 84,871 | 84,872 | 84,873 | 84,874 | 84,875 |
| | 2-71 | 84,889 | 84,890 | 84,891 | 84,892 | 84,893 | 84,894 | 84,895 | 84,896 | 84,897 | 84,898 | 84,899 | 84,900 |
| | 2-72 | 84,914 | 84,915 | 84,916 | 84,917 | 84,918 | 84,919 | 84,920 | 84,921 | 84,922 | 84,923 | 84,924 | 84,925 |
| | 2-73 | 84,939 | 84,940 | 84,941 | 84,942 | 84,943 | 84,944 | 84,945 | 84,946 | 84,947 | 84,948 | 84,949 | 84,950 |
| | 2-74 | 84,964 | 84,965 | 84,966 | 84,967 | 84,968 | 84,969 | 84,970 | 84,971 | 84,972 | 84,973 | 84,974 | 84,975 |
| | 2-75 | 84,989 | 84,990 | 84,991 | 84,992 | 84,993 | 84,994 | 84,995 | 84,996 | 84,997 | 84,998 | 84,999 | 85,000 |
| | 2-76 | 85,014 | 85,015 | 85,016 | 85,017 | 85,018 | 85,019 | 85,020 | 85,021 | 85,022 | 85,023 | 85,024 | 85,025 |
| | 2-77 | 85,039 | 85,040 | 85,041 | 85,042 | 85,043 | 85,044 | 85,045 | 85,046 | 85,047 | 85,048 | 85,049 | 85,050 |
| | 2-78 | 85,064 | 85,065 | 85,066 | 85,067 | 85,068 | 85,069 | 85,070 | 85,071 | 85,072 | 85,073 | 85,074 | 85,075 |
| | 2-79 | 85,089 | 85,090 | 85,091 | 85,092 | 85,093 | 85,094 | 85,095 | 85,096 | 85,097 | 85,098 | 85,099 | 85,100 |
| | 2-80 | 85,114 | 85,115 | 85,116 | 85,117 | 85,118 | 85,119 | 85,120 | 85,121 | 85,122 | 85,123 | 85,124 | 85,125 |
| | 2-81 | 85,139 | 85,140 | 85,141 | 85,142 | 85,143 | 85,144 | 85,145 | 85,146 | 85,147 | 85,148 | 85,149 | 85,150 |
| | 2-82 | 85,164 | 85,165 | 85,166 | 85,167 | 85,168 | 85,169 | 85,170 | 85,171 | 85,172 | 85,173 | 85,174 | 85,175 |
| | 2-83 | 85,189 | 85,190 | 85,191 | 85,192 | 85,193 | 85,194 | 85,195 | 85,196 | 85,197 | 85,198 | 85,199 | 85,200 |
| | 2-84 | 85,214 | 85,215 | 85,216 | 85,217 | 85,218 | 85,219 | 85,220 | 85,221 | 85,222 | 85,223 | 85,224 | 85,225 |
| | 2-85 | 85,239 | 85,240 | 85,241 | 85,242 | 85,243 | 85,244 | 85,245 | 85,246 | 85,247 | 85,248 | 85,249 | 85,250 |
| | 2-86 | 85,264 | 85,265 | 85,266 | 85,267 | 85,268 | 85,269 | 85,270 | 85,271 | 85,272 | 85,273 | 85,274 | 85,275 |
| | 2-87 | 85,289 | 85,290 | 85,291 | 85,292 | 85,293 | 85,294 | 85,295 | 85,296 | 85,297 | 85,298 | 85,299 | 85,300 |
| | 2-88 | 85,314 | 85,315 | 85,316 | 85,317 | 85,318 | 85,319 | 85,320 | 85,321 | 85,322 | 85,323 | 85,324 | 85,325 |
| | 2-89 | 85,339 | 85,340 | 85,341 | 85,342 | 85,343 | 85,344 | 85,345 | 85,346 | 85,347 | 85,348 | 85,349 | 85,350 |
| | 2-90 | 85,364 | 85,365 | 85,366 | 85,367 | 85,368 | 85,369 | 85,370 | 85,371 | 85,372 | 85,373 | 85,374 | 85,375 |
| | 2-91 | 85,389 | 85,390 | 85,391 | 85,392 | 85,393 | 85,394 | 85,395 | 85,396 | 85,397 | 85,398 | 85,399 | 85,400 |
| | 2-92 | 85,414 | 85,415 | 85,416 | 85,417 | 85,418 | 85,419 | 85,420 | 85,421 | 85,422 | 85,423 | 85,424 | 85,425 |
| | 2-93 | 85,439 | 85,440 | 85,441 | 85,442 | 85,443 | 85,444 | 85,445 | 85,446 | 85,447 | 85,448 | 85,449 | 85,450 |
| | 2-94 | 85,464 | 85,465 | 85,466 | 85,467 | 85,468 | 85,469 | 85,470 | 85,471 | 85,472 | 85,473 | 85,474 | 85,475 |
| | 2-95 | 85,489 | 85,490 | 85,491 | 85,492 | 85,493 | 85,494 | 85,495 | 85,496 | 85,497 | 85,498 | 85,499 | 85,500 |
| | 2-96 | 85,514 | 85,515 | 85,516 | 85,517 | 85,518 | 85,519 | 85,520 | 85,521 | 85,522 | 85,523 | 85,524 | 85,525 |
| | 2-97 | 85,539 | 85,540 | 85,541 | 85,542 | 85,543 | 85,544 | 85,545 | 85,546 | 85,547 | 85,548 | 85,549 | 85,550 |
| | 2-98 | 85,564 | 85,565 | 85,566 | 85,567 | 85,568 | 85,569 | 85,570 | 85,571 | 85,572 | 85,573 | 85,574 | 85,575 |
| | 2-99 | 85,589 | 85,590 | 85,591 | 85,592 | 85,593 | 85,594 | 85,595 | 85,596 | 85,597 | 85,598 | 85,599 | 85,600 |
| | 2-100 | 85,614 | 85,615 | 85,616 | 85,617 | 85,618 | 85,619 | 85,620 | 85,621 | 85,622 | 85,623 | 85,624 | 85,625 |
| | 2-101 | 85,639 | 85,640 | 85,641 | 85,642 | 85,643 | 85,644 | 85,645 | 85,646 | 85,647 | 85,648 | 85,649 | 85,650 |
| | 2-102 | 85,664 | 85,665 | 85,666 | 85,667 | 85,668 | 85,669 | 85,670 | 85,671 | 85,672 | 85,673 | 85,674 | 85,675 |
| | 2-103 | 85,689 | 85,690 | 85,691 | 85,692 | 85,693 | 85,694 | 85,695 | 85,696 | 85,697 | 85,698 | 85,699 | 85,700 |
| | 2-104 | 85,714 | 85,715 | 85,716 | 85,717 | 85,718 | 85,719 | 85,720 | 85,721 | 85,722 | 85,723 | 85,724 | 85,725 |
| | 2-105 | 85,739 | 85,740 | 85,741 | 85,742 | 85,743 | 85,744 | 85,745 | 85,746 | 85,747 | 85,748 | 85,749 | 85,750 |
| | 2-106 | 85,764 | 85,765 | 85,766 | 85,767 | 85,768 | 85,769 | 85,770 | 85,771 | 85,772 | 85,773 | 85,774 | 85,775 |

TABLE 65-continued

| | | | | | | | | | | | | |
|---|---|---|---|---|---|---|---|---|---|---|---|---|
| 2-107 | 85,789 | 85,790 | 85,791 | 85,792 | 85,793 | 85,794 | 85,795 | 85,796 | 85,797 | 85,798 | 85,799 | 85,800 |
| 2-108 | 85,814 | 85,815 | 85,816 | 85,817 | 85,818 | 85,819 | 85,820 | 85,821 | 85,822 | 85,823 | 85,824 | 85,825 |
| 2-109 | 85,839 | 85,840 | 85,841 | 85,842 | 85,843 | 85,844 | 85,845 | 85,846 | 85,847 | 85,848 | 85,849 | 85,850 |
| 2-110 | 85,864 | 85,865 | 85,866 | 85,867 | 85,868 | 85,869 | 85,870 | 85,871 | 85,872 | 85,873 | 85,874 | 85,875 |

TABLE 66

| | | Compound represented by the formula (1) | | | | | | | | | | | | |
|---|---|---|---|---|---|---|---|---|---|---|---|---|---|---|
| | | 1-176 | 1-177 | 1-178 | 1-179 | 1-180 | 1-181 | 1-182 | 1-183 | 1-184 | 1-185 | 1-186 | 1-187 | 1-188 |
| Compound represented by the formula (2) | 2-111 | 85,876 | 85,877 | 85,878 | 85,879 | 85,880 | 85,881 | 85,882 | 85,883 | 85,884 | 85,885 | 85,886 | 85,887 | 85,888 |
| | 2-112 | 85,901 | 85,902 | 85,903 | 85,904 | 85,905 | 85,906 | 85,907 | 85,908 | 85,909 | 85,910 | 85,911 | 85,912 | 85,913 |
| | 2-113 | 85,926 | 85,927 | 85,928 | 85,929 | 85,930 | 85,931 | 85,932 | 85,933 | 85,934 | 85,935 | 85,936 | 85,937 | 85,938 |
| | 2-114 | 85,951 | 85,952 | 85,953 | 85,954 | 85,955 | 85,956 | 85,957 | 85,958 | 85,959 | 85,960 | 85,961 | 85,962 | 85,963 |
| | 2-115 | 85,976 | 85,977 | 85,978 | 85,979 | 85,980 | 85,981 | 85,982 | 85,983 | 85,984 | 85,985 | 85,986 | 85,987 | 85,988 |
| | 2-116 | 86,001 | 86,002 | 86,003 | 86,004 | 86,005 | 86,006 | 86,007 | 86,008 | 86,009 | 86,010 | 86,011 | 86,012 | 86,013 |
| | 2-117 | 86,026 | 86,027 | 86,028 | 86,029 | 86,030 | 86,031 | 86,032 | 86,033 | 86,034 | 86,035 | 86,036 | 86,037 | 86,038 |
| | 2-118 | 86,051 | 86,052 | 86,053 | 86,054 | 86,055 | 86,056 | 86,057 | 86,058 | 86,059 | 86,060 | 86,061 | 86,062 | 86,063 |
| | 2-119 | 86,076 | 86,077 | 86,078 | 86,079 | 86,080 | 86,081 | 86,082 | 86,083 | 86,084 | 86,085 | 86,086 | 86,087 | 86,088 |
| | 2-120 | 86,101 | 86,102 | 86,103 | 86,104 | 86,105 | 86,106 | 86,107 | 86,108 | 86,109 | 86,110 | 86,111 | 86,112 | 86,113 |
| | 2-121 | 86,126 | 86,127 | 86,128 | 86,129 | 86,130 | 86,131 | 86,132 | 86,133 | 86,134 | 86,135 | 86,136 | 86,137 | 86,138 |
| | 2-122 | 86,151 | 86,152 | 86,153 | 86,154 | 86,155 | 86,156 | 86,157 | 86,158 | 86,159 | 86,160 | 86,161 | 86,162 | 86,163 |
| | 2-123 | 86,176 | 86,177 | 86,178 | 86,179 | 86,180 | 86,181 | 86,182 | 86,183 | 86,184 | 86,185 | 86,186 | 86,187 | 86,188 |
| | 2-124 | 86,201 | 86,202 | 86,203 | 86,204 | 86,205 | 86,206 | 86,207 | 86,208 | 86,209 | 86,210 | 86,211 | 86,212 | 86,213 |
| | 2-125 | 86,226 | 86,227 | 86,228 | 86,229 | 86,230 | 86,231 | 86,232 | 86,233 | 86,234 | 86,235 | 86,236 | 86,237 | 86,238 |
| | 2-126 | 86,251 | 86,252 | 86,253 | 86,254 | 86,255 | 86,256 | 86,257 | 86,258 | 86,259 | 86,260 | 86,261 | 86,262 | 86,263 |
| | 2-127 | 86,276 | 86,277 | 86,278 | 86,279 | 86,280 | 86,281 | 86,282 | 86,283 | 86,284 | 86,285 | 86,286 | 86,287 | 86,288 |
| | 2-128 | 86,301 | 86,302 | 86,303 | 86,304 | 86,305 | 86,306 | 86,307 | 86,308 | 86,309 | 86,310 | 86,311 | 86,312 | 86,313 |
| | 2-129 | 86,326 | 86,327 | 86,328 | 86,329 | 86,330 | 86,331 | 86,332 | 86,333 | 86,334 | 86,335 | 86,336 | 86,337 | 86,338 |
| | 2-130 | 86,351 | 86,352 | 86,353 | 86,354 | 86,355 | 86,356 | 86,357 | 86,358 | 86,359 | 86,360 | 86,361 | 86,362 | 86,363 |
| | 2-131 | 86,376 | 86,377 | 86,378 | 86,379 | 86,380 | 86,381 | 86,382 | 86,383 | 86,384 | 86,385 | 86,386 | 86,387 | 86,388 |
| | 2-132 | 86,401 | 86,402 | 86,403 | 86,404 | 86,405 | 86,406 | 86,407 | 86,408 | 86,409 | 86,410 | 86,411 | 86,412 | 86,413 |
| | 2-133 | 86,426 | 86,427 | 86,428 | 86,429 | 86,430 | 86,431 | 86,432 | 86,433 | 86,434 | 86,435 | 86,436 | 86,437 | 86,438 |
| | 2-134 | 86,451 | 86,452 | 86,453 | 86,454 | 86,455 | 86,456 | 86,457 | 86,458 | 86,459 | 86,460 | 86,461 | 86,462 | 86,463 |
| | 2-135 | 86,476 | 86,477 | 86,478 | 86,479 | 86,480 | 86,481 | 86,482 | 86,483 | 86,484 | 86,485 | 86,486 | 86,487 | 86,488 |
| | 2-136 | 86,501 | 86,502 | 86,503 | 86,504 | 86,505 | 86,506 | 86,507 | 86,508 | 86,509 | 86,510 | 86,511 | 86,512 | 86,513 |
| | 2-137 | 86,526 | 86,527 | 86,528 | 86,529 | 86,530 | 86,531 | 86,532 | 86,533 | 86,534 | 86,535 | 86,536 | 86,537 | 86,538 |
| | 2-138 | 86,551 | 86,552 | 86,553 | 86,554 | 86,555 | 86,556 | 86,557 | 86,558 | 86,559 | 86,560 | 86,561 | 86,562 | 86,563 |
| | 2-139 | 86,576 | 86,577 | 86,578 | 86,579 | 86,580 | 86,581 | 86,582 | 86,583 | 86,584 | 86,585 | 86,586 | 86,587 | 86,588 |
| | 2-140 | 86,601 | 86,602 | 86,603 | 86,604 | 86,605 | 86,606 | 86,607 | 86,608 | 86,609 | 86,610 | 86,611 | 86,612 | 86,613 |
| | 2-141 | 86,626 | 86,627 | 86,628 | 86,629 | 86,630 | 86,631 | 86,632 | 86,633 | 86,634 | 86,635 | 86,636 | 86,637 | 86,638 |
| | 2-142 | 86,651 | 86,652 | 86,653 | 86,654 | 86,655 | 86,656 | 86,657 | 86,658 | 86,659 | 86,660 | 86,661 | 86,662 | 86,663 |
| | 2-143 | 86,676 | 86,677 | 86,678 | 86,679 | 86,680 | 86,681 | 86,682 | 86,683 | 86,684 | 86,685 | 86,686 | 86,687 | 86,688 |
| | 2-144 | 86,701 | 86,702 | 86,703 | 86,704 | 86,705 | 86,706 | 86,707 | 86,708 | 86,709 | 86,710 | 86,711 | 86,712 | 86,713 |
| | 2-145 | 86,726 | 86,727 | 86,728 | 86,729 | 86,730 | 86,731 | 86,732 | 86,733 | 86,734 | 86,735 | 86,736 | 86,737 | 86,738 |
| | 2-146 | 86,751 | 86,752 | 86,753 | 86,754 | 86,755 | 86,756 | 86,757 | 86,758 | 86,759 | 86,760 | 86,761 | 86,762 | 86,763 |
| | 2-147 | 86,776 | 86,777 | 86,778 | 86,779 | 86,780 | 86,781 | 86,782 | 86,783 | 86,784 | 86,785 | 86,786 | 86,787 | 86,788 |
| | 2-148 | 86,801 | 86,802 | 86,803 | 86,804 | 86,805 | 86,806 | 86,807 | 86,808 | 86,809 | 86,810 | 86,811 | 86,812 | 86,813 |
| | 2-149 | 86,826 | 86,827 | 86,828 | 86,829 | 86,830 | 86,831 | 86,832 | 86,833 | 86,834 | 86,835 | 86,836 | 86,837 | 86,838 |
| | 2-150 | 86,851 | 86,852 | 86,853 | 86,854 | 86,855 | 86,856 | 86,857 | 86,858 | 86,859 | 86,860 | 86,861 | 86,862 | 86,863 |
| | 2-151 | 86,876 | 86,877 | 86,878 | 86,879 | 86,880 | 86,881 | 86,882 | 86,883 | 86,884 | 86,885 | 86,886 | 86,887 | 86,888 |
| | 2-152 | 86,901 | 86,902 | 86,903 | 86,904 | 86,905 | 86,906 | 86,907 | 86,908 | 86,909 | 86,910 | 86,911 | 86,912 | 86,913 |
| | 2-153 | 86,926 | 86,927 | 86,928 | 86,929 | 86,930 | 86,931 | 86,932 | 86,933 | 86,934 | 86,935 | 86,936 | 86,937 | 86,938 |
| | 2-154 | 86,951 | 86,952 | 86,953 | 86,954 | 86,955 | 86,956 | 86,957 | 86,958 | 86,959 | 86,960 | 86,961 | 86,962 | 86,963 |
| | 2-155 | 86,976 | 86,977 | 86,978 | 86,979 | 86,980 | 86,981 | 86,982 | 86,983 | 86,984 | 86,985 | 86,986 | 86,987 | 86,988 |
| | 2-156 | 87,001 | 87,002 | 87,003 | 87,004 | 87,005 | 87,006 | 87,007 | 87,008 | 87,009 | 87,010 | 87,011 | 87,012 | 87,013 |
| | 2-157 | 87,026 | 87,027 | 87,028 | 87,029 | 87,030 | 87,031 | 87,032 | 87,033 | 87,034 | 87,035 | 87,036 | 87,037 | 87,038 |
| | 2-158 | 87,051 | 87,052 | 87,053 | 87,054 | 87,055 | 87,056 | 87,057 | 87,058 | 87,059 | 87,060 | 87,061 | 87,062 | 87,063 |
| | 2-159 | 87,076 | 87,077 | 87,078 | 87,079 | 87,080 | 87,081 | 87,082 | 87,083 | 87,084 | 87,085 | 87,086 | 87,087 | 87,088 |
| | 2-160 | 87,101 | 87,102 | 87,103 | 87,104 | 87,105 | 87,106 | 87,107 | 87,108 | 87,109 | 87,110 | 87,111 | 87,112 | 87,113 |
| | 2-161 | 87,126 | 87,127 | 87,128 | 87,129 | 87,130 | 87,131 | 87,132 | 87,133 | 87,134 | 87,135 | 87,136 | 87,137 | 87,138 |
| | 2-162 | 87,151 | 87,152 | 87,153 | 87,154 | 87,155 | 87,156 | 87,157 | 87,158 | 87,159 | 87,160 | 87,161 | 87,162 | 87,163 |
| | 2-163 | 87,176 | 87,177 | 87,178 | 87,179 | 87,180 | 87,181 | 87,182 | 87,183 | 87,184 | 87,185 | 87,186 | 87,187 | 87,188 |
| | 2-164 | 87,201 | 87,202 | 87,203 | 87,204 | 87,205 | 87,206 | 87,207 | 87,208 | 87,209 | 87,210 | 87,211 | 87,212 | 87,213 |
| | 2-165 | 87,226 | 87,227 | 87,228 | 87,229 | 87,230 | 87,231 | 87,232 | 87,233 | 87,234 | 87,235 | 87,236 | 87,237 | 87,238 |

| | | Compound represented by the formula (1) | | | | | | | | | | | |
|---|---|---|---|---|---|---|---|---|---|---|---|---|---|
| | | 1-189 | 1-190 | 1-191 | 1-192 | 1-193 | 1-194 | 1-195 | 1-196 | 1-197 | 1-198 | 1-199 | 1-200 |
| Compound represented by the formula (2) | 2-111 | 85,889 | 85,890 | 85,891 | 85,892 | 85,893 | 85,894 | 85,895 | 85,896 | 85,897 | 85,898 | 85,899 | 85,900 |
| | 2-112 | 85,914 | 85,915 | 85,916 | 85,917 | 85,918 | 85,919 | 85,920 | 85,921 | 85,922 | 85,923 | 85,924 | 85,925 |
| | 2-113 | 85,939 | 85,940 | 85,941 | 85,942 | 85,943 | 85,944 | 85,945 | 85,946 | 85,947 | 85,948 | 85,949 | 85,950 |
| | 2-114 | 85,964 | 85,965 | 85,966 | 85,967 | 85,968 | 85,969 | 85,970 | 85,971 | 85,972 | 85,973 | 85,974 | 85,975 |
| | 2-115 | 85,989 | 85,990 | 85,991 | 85,992 | 85,993 | 85,994 | 85,995 | 85,996 | 85,997 | 85,998 | 85,999 | 86,000 |
| | 2-116 | 86,014 | 86,015 | 86,016 | 86,017 | 86,018 | 86,019 | 86,020 | 86,021 | 86,022 | 86,023 | 86,024 | 86,025 |

TABLE 66-continued

| | | | | | | | | | | | | |
|---|---|---|---|---|---|---|---|---|---|---|---|---|
| 2-117 | 86,039 | 86,040 | 86,041 | 86,042 | 86,043 | 86,044 | 86,045 | 86,046 | 86,047 | 86,048 | 86,049 | 86,050 |
| 2-118 | 86,064 | 86,065 | 86,066 | 86,067 | 86,068 | 86,069 | 86,070 | 86,071 | 86,072 | 86,073 | 86,074 | 86,075 |
| 2-119 | 86,089 | 86,090 | 86,091 | 86,092 | 86,093 | 86,094 | 86,095 | 86,096 | 86,097 | 86,098 | 86,099 | 86,100 |
| 2-120 | 86,114 | 86,115 | 86,116 | 86,117 | 86,118 | 86,119 | 86,120 | 86,121 | 86,122 | 86,123 | 86,124 | 86,125 |
| 2-121 | 86,139 | 86,140 | 86,141 | 86,142 | 86,143 | 86,144 | 86,145 | 86,146 | 86,147 | 86,148 | 86,149 | 86,150 |
| 2-122 | 86,164 | 86,165 | 86,166 | 86,167 | 86,168 | 86,169 | 86,170 | 86,171 | 86,172 | 86,173 | 86,174 | 86,175 |
| 2-123 | 86,189 | 86,190 | 86,191 | 86,192 | 86,193 | 86,194 | 86,195 | 86,196 | 86,197 | 86,198 | 86,199 | 86,200 |
| 2-124 | 86,214 | 86,215 | 86,216 | 86,217 | 86,218 | 86,219 | 86,220 | 86,221 | 86,222 | 86,223 | 86,224 | 86,225 |
| 2-125 | 86,239 | 86,240 | 86,241 | 86,242 | 86,243 | 86,244 | 86,245 | 86,246 | 86,247 | 86,248 | 86,249 | 86,250 |
| 2-126 | 86,264 | 86,265 | 86,266 | 86,267 | 86,268 | 86,269 | 86,270 | 86,271 | 86,272 | 86,273 | 86,274 | 86,275 |
| 2-127 | 86,289 | 86,290 | 86,291 | 86,292 | 86,293 | 86,294 | 86,295 | 86,296 | 86,297 | 86,298 | 86,299 | 86,300 |
| 2-128 | 86,314 | 86,315 | 86,316 | 86,317 | 86,318 | 86,319 | 86,320 | 86,321 | 86,322 | 86,323 | 86,324 | 86,325 |
| 2-129 | 86,339 | 86,340 | 86,341 | 86,342 | 86,343 | 86,344 | 86,345 | 86,346 | 86,347 | 86,348 | 86,349 | 86,350 |
| 2-130 | 86,364 | 86,365 | 86,366 | 86,367 | 86,368 | 86,369 | 86,370 | 86,371 | 86,372 | 86,373 | 86,374 | 86,375 |
| 2-131 | 86,389 | 86,390 | 86,391 | 86,392 | 86,393 | 86,394 | 86,395 | 86,396 | 86,397 | 86,398 | 86,399 | 86,400 |
| 2-132 | 86,414 | 86,415 | 86,416 | 86,417 | 86,418 | 86,419 | 86,420 | 86,421 | 86,422 | 86,423 | 86,424 | 86,425 |
| 2-133 | 86,439 | 86,440 | 86,441 | 86,442 | 86,443 | 86,444 | 86,445 | 86,446 | 86,447 | 86,448 | 86,449 | 86,450 |
| 2-134 | 86,464 | 86,465 | 86,466 | 86,467 | 86,468 | 86,469 | 86,470 | 86,471 | 86,472 | 86,473 | 86,474 | 86,475 |
| 2-135 | 86,489 | 86,490 | 86,491 | 86,492 | 86,493 | 86,494 | 86,495 | 86,496 | 86,497 | 86,498 | 86,499 | 86,500 |
| 2-136 | 86,514 | 86,515 | 86,516 | 86,517 | 86,518 | 86,519 | 86,520 | 86,521 | 86,522 | 86,523 | 86,524 | 86,525 |
| 2-137 | 86,539 | 86,540 | 86,541 | 86,542 | 86,543 | 86,544 | 86,545 | 86,546 | 86,547 | 86,548 | 86,549 | 86,550 |
| 2-138 | 86,564 | 86,565 | 86,566 | 86,567 | 86,568 | 86,569 | 86,570 | 86,571 | 86,572 | 86,573 | 86,574 | 86,575 |
| 2-139 | 86,589 | 86,590 | 86,591 | 86,592 | 86,593 | 86,594 | 86,595 | 86,596 | 86,597 | 86,598 | 86,599 | 86,600 |
| 2-140 | 86,614 | 86,615 | 86,616 | 86,617 | 86,618 | 86,619 | 86,620 | 86,621 | 86,622 | 86,623 | 86,624 | 86,625 |
| 2-141 | 86,639 | 86,640 | 86,641 | 86,642 | 86,643 | 86,644 | 86,645 | 86,646 | 86,647 | 86,648 | 86,649 | 86,650 |
| 2-142 | 86,664 | 86,665 | 86,666 | 86,667 | 86,668 | 86,669 | 86,670 | 86,671 | 86,672 | 86,673 | 86,674 | 86,675 |
| 2-143 | 86,689 | 86,690 | 86,691 | 86,692 | 86,693 | 86,694 | 86,695 | 86,696 | 86,697 | 86,698 | 86,699 | 86,700 |
| 2-144 | 86,714 | 86,715 | 86,716 | 86,717 | 86,718 | 86,719 | 86,720 | 86,721 | 86,722 | 86,723 | 86,724 | 86,725 |
| 2-145 | 86,739 | 86,740 | 86,741 | 86,742 | 86,743 | 86,744 | 86,745 | 86,746 | 86,747 | 86,748 | 86,749 | 86,750 |
| 2-146 | 86,764 | 86,765 | 86,766 | 86,767 | 86,768 | 86,769 | 86,770 | 86,771 | 86,772 | 86,773 | 86,774 | 86,775 |
| 2-147 | 86,789 | 86,790 | 86,791 | 86,792 | 86,793 | 86,794 | 86,795 | 86,796 | 86,797 | 86,798 | 86,799 | 86,800 |
| 2-148 | 86,814 | 86,815 | 86,816 | 86,817 | 86,818 | 86,819 | 86,820 | 86,821 | 86,822 | 86,823 | 86,824 | 86,825 |
| 2-149 | 86,839 | 86,840 | 86,841 | 86,842 | 86,843 | 86,844 | 86,845 | 86,846 | 86,847 | 86,848 | 86,849 | 86,850 |
| 2-150 | 86,864 | 86,865 | 86,866 | 86,867 | 86,868 | 86,869 | 86,870 | 86,871 | 86,872 | 86,873 | 86,874 | 86,875 |
| 2-151 | 86,889 | 86,890 | 86,891 | 86,892 | 86,893 | 86,894 | 86,895 | 86,896 | 86,897 | 86,898 | 86,899 | 86,900 |
| 2-152 | 86,914 | 86,915 | 86,916 | 86,917 | 86,918 | 86,919 | 86,920 | 86,921 | 86,922 | 86,923 | 86,924 | 86,925 |
| 2-153 | 86,939 | 86,940 | 86,941 | 86,942 | 86,943 | 86,944 | 86,945 | 86,946 | 86,947 | 86,948 | 86,949 | 86,950 |
| 2-154 | 86,964 | 86,965 | 86,966 | 86,967 | 86,968 | 86,969 | 86,970 | 86,971 | 86,972 | 86,973 | 86,974 | 86,975 |
| 2-155 | 86,989 | 86,990 | 86,991 | 86,992 | 86,993 | 86,994 | 86,995 | 86,996 | 86,997 | 86,998 | 86,999 | 87,000 |
| 2-156 | 87,014 | 87,015 | 87,016 | 87,017 | 87,018 | 87,019 | 87,020 | 87,021 | 87,022 | 87,023 | 87,024 | 87,025 |
| 2-157 | 87,039 | 87,040 | 87,041 | 87,042 | 87,043 | 87,044 | 87,045 | 87,046 | 87,047 | 87,048 | 87,049 | 87,050 |
| 2-158 | 87,064 | 87,065 | 87,066 | 87,067 | 87,068 | 87,069 | 87,070 | 87,071 | 87,072 | 87,073 | 87,074 | 87,075 |
| 2-159 | 87,089 | 87,090 | 87,091 | 87,092 | 87,093 | 87,094 | 87,095 | 87,096 | 87,097 | 87,098 | 87,099 | 87,100 |
| 2-160 | 87,114 | 87,115 | 87,116 | 87,117 | 87,118 | 87,119 | 87,120 | 87,121 | 87,122 | 87,123 | 87,124 | 87,125 |
| 2-161 | 87,139 | 87,140 | 87,141 | 87,142 | 87,143 | 87,144 | 87,145 | 87,146 | 87,147 | 87,148 | 87,149 | 87,150 |
| 2-162 | 87,164 | 87,165 | 87,166 | 87,167 | 87,168 | 87,169 | 87,170 | 87,171 | 87,172 | 87,173 | 87,174 | 87,175 |
| 2-163 | 87,189 | 87,190 | 87,191 | 87,192 | 87,193 | 87,194 | 87,195 | 87,196 | 87,197 | 87,198 | 87,199 | 87,200 |
| 2-164 | 87,214 | 87,215 | 87,216 | 87,217 | 87,218 | 87,219 | 87,220 | 87,221 | 87,222 | 87,223 | 87,224 | 87,225 |
| 2-165 | 87,239 | 87,240 | 87,241 | 87,242 | 87,243 | 87,244 | 87,245 | 87,246 | 87,247 | 87,248 | 87,249 | 87,250 |

TABLE 67

| | | Compound represented by the formula (1) | | | | | | | | | | | | |
|---|---|---|---|---|---|---|---|---|---|---|---|---|---|---|
| | | 1-176 | 1-177 | 1-178 | 1-179 | 1-180 | 1-181 | 1-182 | 1-183 | 1-184 | 1-185 | 1-186 | 1-187 | 1-188 |
| Compound represented by the formula (2) | 2-166 | 87,251 | 87,252 | 87,253 | 87,254 | 87,255 | 87,256 | 87,257 | 87,258 | 87,259 | 87,260 | 87,261 | 87,262 | 87,263 |
| | 2-167 | 87,276 | 87,277 | 87,278 | 87,279 | 87,280 | 87,281 | 87,282 | 87,283 | 87,284 | 87,285 | 87,286 | 87,287 | 87,288 |
| | 2-168 | 87,301 | 87,302 | 87,303 | 87,304 | 87,305 | 87,306 | 87,307 | 87,308 | 87,309 | 87,310 | 87,311 | 87,312 | 87,313 |
| | 2-169 | 87,326 | 87,327 | 87,328 | 87,329 | 87,330 | 87,331 | 87,332 | 87,333 | 87,334 | 87,335 | 87,336 | 87,337 | 87,338 |
| | 2-170 | 87,351 | 87,352 | 87,353 | 87,354 | 87,355 | 87,356 | 87,357 | 87,358 | 87,359 | 87,360 | 87,361 | 87,362 | 87,363 |
| | 2-171 | 87,376 | 87,377 | 87,378 | 87,379 | 87,380 | 87,381 | 87,382 | 87,383 | 87,384 | 87,385 | 87,386 | 87,387 | 87,388 |
| | 2-172 | 87,401 | 87,402 | 87,403 | 87,404 | 87,405 | 87,406 | 87,407 | 87,408 | 87,409 | 87,410 | 87,411 | 87,412 | 87,413 |
| | 2-173 | 87,426 | 87,427 | 87,428 | 87,429 | 87,430 | 87,431 | 87,432 | 87,433 | 87,434 | 87,435 | 87,436 | 87,437 | 87,438 |
| | 2-174 | 87,451 | 87,452 | 87,453 | 87,454 | 87,455 | 87,456 | 87,457 | 87,458 | 87,459 | 87,460 | 87,461 | 87,462 | 87,463 |
| | 2-175 | 87,476 | 87,477 | 87,478 | 87,479 | 87,480 | 87,481 | 87,482 | 87,483 | 87,484 | 87,485 | 87,486 | 87,487 | 87,488 |
| | 2-176 | 87,501 | 87,502 | 87,503 | 87,504 | 87,505 | 87,506 | 87,507 | 87,508 | 87,509 | 87,510 | 87,511 | 87,512 | 87,513 |
| | 2-177 | 87,526 | 87,527 | 87,528 | 87,529 | 87,530 | 87,531 | 87,532 | 87,533 | 87,534 | 87,535 | 87,536 | 87,537 | 87,538 |
| | 2-178 | 87,551 | 87,552 | 87,553 | 87,554 | 87,555 | 87,556 | 87,557 | 87,558 | 87,559 | 87,560 | 87,561 | 87,562 | 87,563 |
| | 2-179 | 87,576 | 87,577 | 87,578 | 87,579 | 87,580 | 87,581 | 87,582 | 87,583 | 87,584 | 87,585 | 87,586 | 87,587 | 87,588 |
| | 2-180 | 87,601 | 87,602 | 87,603 | 87,604 | 87,605 | 87,606 | 87,607 | 87,608 | 87,609 | 87,610 | 87,611 | 87,612 | 87,613 |
| | 2-181 | 87,626 | 87,627 | 87,628 | 87,629 | 87,630 | 87,631 | 87,632 | 87,633 | 87,634 | 87,635 | 87,636 | 87,637 | 87,638 |
| | 2-182 | 87,651 | 87,652 | 87,653 | 87,654 | 87,655 | 87,656 | 87,657 | 87,658 | 87,659 | 87,660 | 87,661 | 87,662 | 87,663 |
| | 2-183 | 87,676 | 87,677 | 87,678 | 87,679 | 87,680 | 87,681 | 87,682 | 87,683 | 87,684 | 87,685 | 87,686 | 87,687 | 87,688 |
| | 2-184 | 87,701 | 87,702 | 87,703 | 87,704 | 87,705 | 87,706 | 87,707 | 87,708 | 87,709 | 87,710 | 87,711 | 87,712 | 87,713 |
| | 2-185 | 87,726 | 87,727 | 87,728 | 87,729 | 87,730 | 87,731 | 87,732 | 87,733 | 87,734 | 87,735 | 87,736 | 87,737 | 87,738 |
| | 2-186 | 87,751 | 87,752 | 87,753 | 87,754 | 87,755 | 87,756 | 87,757 | 87,758 | 87,759 | 87,760 | 87,761 | 87,762 | 87,763 |

TABLE 67-continued

| | | | | | | | | | | | | | |
|---|---|---|---|---|---|---|---|---|---|---|---|---|---|
| 2-187 | 87,776 | 87,777 | 87,778 | 87,779 | 87,780 | 87,781 | 87,782 | 87,783 | 87,784 | 87,785 | 87,786 | 87,787 | 87,788 |
| 2-188 | 87,801 | 87,802 | 87,803 | 87,804 | 87,805 | 87,806 | 87,807 | 87,808 | 87,809 | 87,810 | 87,811 | 87,812 | 87,813 |
| 2-189 | 87,826 | 87,827 | 87,828 | 87,829 | 87,830 | 87,831 | 87,832 | 87,833 | 87,834 | 87,835 | 87,836 | 87,837 | 87,838 |
| 2-190 | 87,851 | 87,852 | 87,853 | 87,854 | 87,855 | 87,856 | 87,857 | 87,858 | 87,859 | 87,860 | 87,861 | 87,862 | 87,863 |
| 2-191 | 87,876 | 87,877 | 87,878 | 87,879 | 87,880 | 87,881 | 87,882 | 87,883 | 87,884 | 87,885 | 87,886 | 87,887 | 87,888 |
| 2-192 | 87,901 | 87,902 | 87,903 | 87,904 | 87,905 | 87,906 | 87,907 | 87,908 | 87,909 | 87,910 | 87,911 | 87,912 | 87,913 |
| 2-193 | 87,926 | 87,927 | 87,928 | 87,929 | 87,930 | 87,931 | 87,932 | 87,933 | 87,934 | 87,935 | 87,936 | 87,937 | 87,938 |
| 2-194 | 87,951 | 87,952 | 87,953 | 87,954 | 87,955 | 87,956 | 87,957 | 87,958 | 87,959 | 87,960 | 87,961 | 87,962 | 87,963 |
| 2-195 | 87,976 | 87,977 | 87,978 | 87,979 | 87,980 | 87,981 | 87,982 | 87,983 | 87,984 | 87,985 | 87,986 | 87,987 | 87,988 |
| 2-196 | 88,001 | 88,002 | 88,003 | 88,004 | 88,005 | 88,006 | 88,007 | 88,008 | 88,009 | 88,010 | 88,011 | 88,012 | 88,013 |
| 2-197 | 88,026 | 88,027 | 88,028 | 88,029 | 88,030 | 88,031 | 88,032 | 88,033 | 88,034 | 88,035 | 88,036 | 88,037 | 88,038 |
| 2-198 | 88,051 | 88,052 | 88,053 | 88,054 | 88,055 | 88,056 | 88,057 | 88,058 | 88,059 | 88,060 | 88,061 | 88,062 | 88,063 |
| 2-199 | 88,076 | 88,077 | 88,078 | 88,079 | 88,080 | 88,081 | 88,082 | 88,083 | 88,084 | 88,085 | 88,086 | 88,087 | 88,088 |
| 2-200 | 88,101 | 88,102 | 88,103 | 88,104 | 88,105 | 88,106 | 88,107 | 88,108 | 88,109 | 88,110 | 88,111 | 88,112 | 88,113 |
| 2-201 | 88,126 | 88,127 | 88,128 | 88,129 | 88,130 | 88,131 | 88,132 | 88,133 | 88,134 | 88,135 | 88,136 | 88,137 | 88,138 |
| 2-202 | 88,151 | 88,152 | 88,153 | 88,154 | 88,155 | 88,156 | 88,157 | 88,158 | 88,159 | 88,160 | 88,161 | 88,162 | 88,163 |
| 2-203 | 88,176 | 88,177 | 88,178 | 88,179 | 88,180 | 88,181 | 88,182 | 88,183 | 88,184 | 88,185 | 88,186 | 88,187 | 88,188 |
| 2-204 | 88,201 | 88,202 | 88,203 | 88,204 | 88,205 | 88,206 | 88,207 | 88,208 | 88,209 | 88,210 | 88,211 | 88,212 | 88,213 |
| 2-205 | 88,226 | 88,227 | 88,228 | 88,229 | 88,230 | 88,231 | 88,232 | 88,233 | 88,234 | 88,235 | 88,236 | 88,237 | 88,238 |
| 2-206 | 88,251 | 88,252 | 88,253 | 88,254 | 88,255 | 88,256 | 88,257 | 88,258 | 88,259 | 88,260 | 88,261 | 88,262 | 88,263 |
| 2-207 | 88,276 | 88,277 | 88,278 | 88,279 | 88,280 | 88,281 | 88,282 | 88,283 | 88,284 | 88,285 | 88,286 | 88,287 | 88,288 |
| 2-208 | 88,301 | 88,302 | 88,303 | 88,304 | 88,305 | 88,306 | 88,307 | 88,308 | 88,309 | 88,310 | 88,311 | 88,312 | 88,313 |
| 2-209 | 88,326 | 88,327 | 88,328 | 88,329 | 88,330 | 88,331 | 88,332 | 88,333 | 88,334 | 88,335 | 88,336 | 88,337 | 88,338 |
| 2-210 | 88,351 | 88,352 | 88,353 | 88,354 | 88,355 | 88,356 | 88,357 | 88,358 | 88,359 | 88,360 | 88,361 | 88,362 | 88,363 |
| 2-211 | 88,376 | 88,377 | 88,378 | 88,379 | 88,380 | 88,381 | 88,382 | 88,383 | 88,384 | 88,385 | 88,386 | 88,387 | 88,388 |
| 2-212 | 88,401 | 88,402 | 88,403 | 88,404 | 88,405 | 88,406 | 88,407 | 88,408 | 88,409 | 88,410 | 88,411 | 88,412 | 88,413 |
| 2-213 | 88,426 | 88,427 | 88,428 | 88,429 | 88,430 | 88,431 | 88,432 | 88,433 | 88,434 | 88,435 | 88,436 | 88,437 | 88,438 |
| 2-214 | 88,451 | 88,452 | 88,453 | 88,454 | 88,455 | 88,456 | 88,457 | 88,458 | 88,459 | 88,460 | 88,461 | 88,462 | 88,463 |
| 2-215 | 88,476 | 88,477 | 88,478 | 88,479 | 88,480 | 88,481 | 88,482 | 88,483 | 88,484 | 88,485 | 88,486 | 88,487 | 88,488 |
| 2-216 | 88,501 | 88,502 | 88,503 | 88,504 | 88,505 | 88,506 | 88,507 | 88,508 | 88,509 | 88,510 | 88,511 | 88,512 | 88,513 |
| 2-217 | 88,526 | 88,527 | 88,528 | 88,529 | 88,530 | 88,531 | 88,532 | 88,533 | 88,534 | 88,535 | 88,536 | 88,537 | 88,538 |
| 2-218 | 88,551 | 88,552 | 88,553 | 88,554 | 88,555 | 88,556 | 88,557 | 88,558 | 88,559 | 88,560 | 88,561 | 88,562 | 88,563 |
| 2-219 | 88,576 | 88,577 | 88,578 | 88,579 | 88,580 | 88,581 | 88,582 | 88,583 | 88,584 | 88,585 | 88,586 | 88,587 | 88,588 |
| 2-220 | 88,601 | 88,602 | 88,603 | 88,604 | 88,605 | 88,606 | 88,607 | 88,608 | 88,609 | 88,610 | 88,611 | 88,612 | 88,613 |

| | | Compound represented by the formula (1) | | | | | | | | | | | |
|---|---|---|---|---|---|---|---|---|---|---|---|---|---|
| | | 1-189 | 1-190 | 1-191 | 1-192 | 1-193 | 1-194 | 1-195 | 1-196 | 1-197 | 1-198 | 1-199 | 1-200 |
| Compound represented by the formula (2) | 2-166 | 87,264 | 87,265 | 87,266 | 87,267 | 87,268 | 87,269 | 87,270 | 87,271 | 87,272 | 87,273 | 87,274 | 87,275 |
| | 2-167 | 87,289 | 87,290 | 87,291 | 87,292 | 87,293 | 87,294 | 87,295 | 87,296 | 87,297 | 87,298 | 87,299 | 87,300 |
| | 2-168 | 87,314 | 87,315 | 87,316 | 87,317 | 87,318 | 87,319 | 87,320 | 87,321 | 87,322 | 87,323 | 87,324 | 87,325 |
| | 2-169 | 87,339 | 87,340 | 87,341 | 87,342 | 87,343 | 87,344 | 87,345 | 87,346 | 87,347 | 87,348 | 87,349 | 87,350 |
| | 2-170 | 87,364 | 87,365 | 87,366 | 87,367 | 87,368 | 87,369 | 87,370 | 87,371 | 87,372 | 87,373 | 87,374 | 87,375 |
| | 2-171 | 87,389 | 87,390 | 87,391 | 87,392 | 87,393 | 87,394 | 87,395 | 87,396 | 87,397 | 87,398 | 87,399 | 87,400 |
| | 2-172 | 87,414 | 87,415 | 87,416 | 87,417 | 87,418 | 87,419 | 87,420 | 87,421 | 87,422 | 87,423 | 87,424 | 87,425 |
| | 2-173 | 87,439 | 87,440 | 87,441 | 87,442 | 87,443 | 87,444 | 87,445 | 87,446 | 87,447 | 87,448 | 87,449 | 87,450 |
| | 2-174 | 87,464 | 87,465 | 87,466 | 87,467 | 87,468 | 87,469 | 87,470 | 87,471 | 87,472 | 87,473 | 87,474 | 87,475 |
| | 2-175 | 87,489 | 87,490 | 87,491 | 87,492 | 87,493 | 87,494 | 87,495 | 87,496 | 87,497 | 87,498 | 87,499 | 87,500 |
| | 2-176 | 87,514 | 87,515 | 87,516 | 87,517 | 87,518 | 87,519 | 87,520 | 87,521 | 87,522 | 87,523 | 87,524 | 87,525 |
| | 2-177 | 87,539 | 87,540 | 87,541 | 87,542 | 87,543 | 87,544 | 87,545 | 87,546 | 87,547 | 87,548 | 87,549 | 87,550 |
| | 2-178 | 87,564 | 87,565 | 87,566 | 87,567 | 87,568 | 87,569 | 87,570 | 87,571 | 87,572 | 87,573 | 87,574 | 87,575 |
| | 2-179 | 87,589 | 87,590 | 87,591 | 87,592 | 87,593 | 87,594 | 87,595 | 87,596 | 87,597 | 87,598 | 87,599 | 87,600 |
| | 2-180 | 87,614 | 87,615 | 87,616 | 87,617 | 87,618 | 87,619 | 87,620 | 87,621 | 87,622 | 87,623 | 87,624 | 87,625 |
| | 2-181 | 87,639 | 87,640 | 87,641 | 87,642 | 87,643 | 87,644 | 87,645 | 87,646 | 87,647 | 87,648 | 87,649 | 87,650 |
| | 2-182 | 87,664 | 87,665 | 87,666 | 87,667 | 87,668 | 87,669 | 87,670 | 87,671 | 87,672 | 87,673 | 87,674 | 87,675 |
| | 2-183 | 87,689 | 87,690 | 87,691 | 87,692 | 87,693 | 87,694 | 87,695 | 87,696 | 87,697 | 87,698 | 87,699 | 87,700 |
| | 2-184 | 87,714 | 87,715 | 87,716 | 87,717 | 87,718 | 87,719 | 87,720 | 87,721 | 87,722 | 87,723 | 87,724 | 87,725 |
| | 2-185 | 87,739 | 87,740 | 87,741 | 87,742 | 87,743 | 87,744 | 87,745 | 87,746 | 87,747 | 87,748 | 87,749 | 87,750 |
| | 2-186 | 87,764 | 87,765 | 87,766 | 87,767 | 87,768 | 87,769 | 87,770 | 87,771 | 87,772 | 87,773 | 87,774 | 87,775 |
| | 2-187 | 87,789 | 87,790 | 87,791 | 87,792 | 87,793 | 87,794 | 87,795 | 87,796 | 87,797 | 87,798 | 87,799 | 87,800 |
| | 2-188 | 87,814 | 87,815 | 87,816 | 87,817 | 87,818 | 87,819 | 87,820 | 87,821 | 87,822 | 87,823 | 87,824 | 87,825 |
| | 2-189 | 87,839 | 87,840 | 87,841 | 87,842 | 87,843 | 87,844 | 87,845 | 87,846 | 87,847 | 87,848 | 87,849 | 87,850 |
| | 2-190 | 87,864 | 87,865 | 87,866 | 87,867 | 87,868 | 87,869 | 87,870 | 87,871 | 87,872 | 87,873 | 87,874 | 87,875 |
| | 2-191 | 87,889 | 87,890 | 87,891 | 87,892 | 87,893 | 87,894 | 87,895 | 87,896 | 87,897 | 87,898 | 87,899 | 87,900 |
| | 2-192 | 87,914 | 87,915 | 87,916 | 87,917 | 87,918 | 87,919 | 87,920 | 87,921 | 87,922 | 87,923 | 87,924 | 87,925 |
| | 2-193 | 87,939 | 87,940 | 87,941 | 87,942 | 87,943 | 87,944 | 87,945 | 87,946 | 87,947 | 87,948 | 87,949 | 87,950 |
| | 2-194 | 87,964 | 87,965 | 87,966 | 87,967 | 87,968 | 87,969 | 87,970 | 87,971 | 87,972 | 87,973 | 87,974 | 87,975 |
| | 2-195 | 87,989 | 87,990 | 87,991 | 87,992 | 87,993 | 87,994 | 87,995 | 87,996 | 87,997 | 87,998 | 87,999 | 88,000 |
| | 2-196 | 88,014 | 88,015 | 88,016 | 88,017 | 88,018 | 88,019 | 88,020 | 88,021 | 88,022 | 88,023 | 88,024 | 88,025 |
| | 2-197 | 88,039 | 88,040 | 88,041 | 88,042 | 88,043 | 88,044 | 88,045 | 88,046 | 88,047 | 88,048 | 88,049 | 88,050 |
| | 2-198 | 88,064 | 88,065 | 88,066 | 88,067 | 88,068 | 88,069 | 88,070 | 88,071 | 88,072 | 88,073 | 88,074 | 88,075 |
| | 2-199 | 88,089 | 88,090 | 88,091 | 88,092 | 88,093 | 88,094 | 88,095 | 88,096 | 88,097 | 88,098 | 88,099 | 88,100 |
| | 2-200 | 88,114 | 88,115 | 88,116 | 88,117 | 88,118 | 88,119 | 88,120 | 88,121 | 88,122 | 88,123 | 88,124 | 88,125 |
| | 2-201 | 88,139 | 88,140 | 88,141 | 88,142 | 88,143 | 88,144 | 88,145 | 88,146 | 88,147 | 88,148 | 88,149 | 88,150 |
| | 2-202 | 88,164 | 88,165 | 88,166 | 88,167 | 88,168 | 88,169 | 88,170 | 88,171 | 88,172 | 88,173 | 88,174 | 88,175 |
| | 2-203 | 88,189 | 88,190 | 88,191 | 88,192 | 88,193 | 88,194 | 88,195 | 88,196 | 88,197 | 88,198 | 88,199 | 88,200 |
| | 2-204 | 88,214 | 88,215 | 88,216 | 88,217 | 88,218 | 88,219 | 88,220 | 88,221 | 88,222 | 88,223 | 88,224 | 88,225 |
| | 2-205 | 88,239 | 88,240 | 88,241 | 88,242 | 88,243 | 88,244 | 88,245 | 88,246 | 88,247 | 88,248 | 88,249 | 88,250 |
| | 2-206 | 88,264 | 88,265 | 88,266 | 88,267 | 88,268 | 88,269 | 88,270 | 88,271 | 88,272 | 88,273 | 88,274 | 88,275 |

TABLE 67-continued

| | | | | | | | | | | | | | |
|---|---|---|---|---|---|---|---|---|---|---|---|---|---|
| 2-207 | 88,289 | 88,290 | 88,291 | 88,292 | 88,293 | 88,294 | 88,295 | 88,296 | 88,297 | 88,298 | 88,299 | 88,300 |
| 2-208 | 88,314 | 88,315 | 88,316 | 88,317 | 88,318 | 88,319 | 88,320 | 88,321 | 88,322 | 88,323 | 88,324 | 88,325 |
| 2-209 | 88,339 | 88,340 | 88,341 | 88,342 | 88,343 | 88,344 | 88,345 | 88,346 | 88,347 | 88,348 | 88,349 | 88,350 |
| 2-210 | 88,364 | 88,365 | 88,366 | 88,367 | 88,368 | 88,369 | 88,370 | 88,371 | 88,372 | 88,373 | 88,374 | 88,375 |
| 2-211 | 88,389 | 88,390 | 88,391 | 88,392 | 88,393 | 88,394 | 88,395 | 88,396 | 88,397 | 88,398 | 88,399 | 88,400 |
| 2-212 | 88,414 | 88,415 | 88,416 | 88,417 | 88,418 | 88,419 | 88,420 | 88,421 | 88,422 | 88,423 | 88,424 | 88,425 |
| 2-213 | 88,439 | 88,440 | 88,441 | 88,442 | 88,443 | 88,444 | 88,445 | 88,446 | 88,447 | 88,448 | 88,449 | 88,450 |
| 2-214 | 88,464 | 88,465 | 88,466 | 88,467 | 88,468 | 88,469 | 88,470 | 88,471 | 88,472 | 88,473 | 88,474 | 88,475 |
| 2-215 | 88,489 | 88,490 | 88,491 | 88,492 | 88,493 | 88,494 | 88,495 | 88,496 | 88,497 | 88,498 | 88,499 | 88,500 |
| 2-216 | 88,514 | 88,515 | 88,516 | 88,517 | 88,518 | 88,519 | 88,520 | 88,521 | 88,522 | 88,523 | 88,524 | 88,525 |
| 2-217 | 88,539 | 88,540 | 88,541 | 88,542 | 88,543 | 88,544 | 88,545 | 88,546 | 88,547 | 88,548 | 88,549 | 88,550 |
| 2-218 | 88,564 | 88,565 | 88,566 | 88,567 | 88,568 | 88,569 | 88,570 | 88,571 | 88,572 | 88,573 | 88,574 | 88,575 |
| 2-219 | 88,589 | 88,590 | 88,591 | 88,592 | 88,593 | 88,594 | 88,595 | 88,596 | 88,597 | 88,598 | 88,599 | 88,600 |
| 2-220 | 88,614 | 88,615 | 88,616 | 88,617 | 88,618 | 88,619 | 88,620 | 88,621 | 88,622 | 88,623 | 88,624 | 88,625 |

TABLE 68

| | | Compound represented by the formula (1) | | | | | | | | | | | | |
|---|---|---|---|---|---|---|---|---|---|---|---|---|---|---|
| | | 1-176 | 1-177 | 1-178 | 1-179 | 1-180 | 1-181 | 1-182 | 1-183 | 1-184 | 1-185 | 1-186 | 1-187 | 1-188 |
| Compound represented by the formula (2) | 2-221 | 88,626 | 88,627 | 88,628 | 88,629 | 88,630 | 88,631 | 88,632 | 88,633 | 88,634 | 88,635 | 88,636 | 88,637 | 88,638 |
| | 2-222 | 88,651 | 88,652 | 88,653 | 88,654 | 88,655 | 88,656 | 88,657 | 88,658 | 88,659 | 88,660 | 88,661 | 88,662 | 88,663 |
| | 2-223 | 88,676 | 88,677 | 88,678 | 88,679 | 88,680 | 88,681 | 88,682 | 88,683 | 88,684 | 88,685 | 88,686 | 88,687 | 88,688 |
| | 2-224 | 88,701 | 88,702 | 88,703 | 88,704 | 88,705 | 88,706 | 88,707 | 88,708 | 88,709 | 88,710 | 88,711 | 88,712 | 88,713 |
| | 2-225 | 88,726 | 88,727 | 88,728 | 88,729 | 88,730 | 88,731 | 88,732 | 88,733 | 88,734 | 88,735 | 88,736 | 88,737 | 88,738 |
| | 2-226 | 88,751 | 88,752 | 88,753 | 88,754 | 88,755 | 88,756 | 88,757 | 88,758 | 88,759 | 88,760 | 88,761 | 88,762 | 88,763 |
| | 2-227 | 88,776 | 88,777 | 88,778 | 88,779 | 88,780 | 88,781 | 88,782 | 88,783 | 88,784 | 88,785 | 88,786 | 88,787 | 88,788 |
| | 2-228 | 88,801 | 88,802 | 88,803 | 88,804 | 88,805 | 88,806 | 88,807 | 88,808 | 88,809 | 88,810 | 88,811 | 88,812 | 88,813 |
| | 2-229 | 88,826 | 88,827 | 88,828 | 88,829 | 88,830 | 88,831 | 88,832 | 88,833 | 88,834 | 88,835 | 88,836 | 88,837 | 88,838 |
| | 2-230 | 88,851 | 88,852 | 88,853 | 88,854 | 88,855 | 88,856 | 88,857 | 88,858 | 88,859 | 88,860 | 88,861 | 88,862 | 88,863 |
| | 2-231 | 88,876 | 88,877 | 88,878 | 88,879 | 88,880 | 88,881 | 88,882 | 88,883 | 88,884 | 88,885 | 88,886 | 88,887 | 88,888 |
| | 2-232 | 88,901 | 88,902 | 88,903 | 88,904 | 88,905 | 88,906 | 88,907 | 88,908 | 88,909 | 88,910 | 88,911 | 88,912 | 88,913 |
| | 2-233 | 88,926 | 88,927 | 88,928 | 88,929 | 88,930 | 88,931 | 88,932 | 88,933 | 88,934 | 88,935 | 88,936 | 88,937 | 88,938 |
| | 2-234 | 88,951 | 88,952 | 88,953 | 88,954 | 88,955 | 88,956 | 88,957 | 88,958 | 88,959 | 88,960 | 88,961 | 88,962 | 88,963 |
| | 2-235 | 88,976 | 88,977 | 88,978 | 88,979 | 88,980 | 88,981 | 88,982 | 88,983 | 88,984 | 88,985 | 88,986 | 88,987 | 88,988 |
| | 2-236 | 89,001 | 89,002 | 89,003 | 89,004 | 89,005 | 89,006 | 89,007 | 89,008 | 89,009 | 89,010 | 89,011 | 89,012 | 89,013 |
| | 2-237 | 89,026 | 89,027 | 89,028 | 89,029 | 89,030 | 89,031 | 89,032 | 89,033 | 89,034 | 89,035 | 89,036 | 89,037 | 89,038 |
| | 2-238 | 89,051 | 89,052 | 89,053 | 89,054 | 89,055 | 89,056 | 89,057 | 89,058 | 89,059 | 89,060 | 89,061 | 89,062 | 89,063 |
| | 2-239 | 89,076 | 89,077 | 89,078 | 89,079 | 89,080 | 89,081 | 89,082 | 89,083 | 89,084 | 89,085 | 89,086 | 89,087 | 89,088 |
| | 2-240 | 89,101 | 89,102 | 89,103 | 89,104 | 89,105 | 89,106 | 89,107 | 89,108 | 89,109 | 89,110 | 89,111 | 89,112 | 89,113 |
| | 2-241 | 89,126 | 89,127 | 89,128 | 89,129 | 89,130 | 89,131 | 89,132 | 89,133 | 89,134 | 89,135 | 89,136 | 89,137 | 89,138 |
| | 2-242 | 89,151 | 89,152 | 89,153 | 89,154 | 89,155 | 89,156 | 89,157 | 89,158 | 89,159 | 89,160 | 89,161 | 89,162 | 89,163 |
| | 2-243 | 89,176 | 89,177 | 89,178 | 89,179 | 89,180 | 89,181 | 89,182 | 89,183 | 89,184 | 89,185 | 89,186 | 89,187 | 89,188 |
| | 2-244 | 89,201 | 89,202 | 89,203 | 89,204 | 89,205 | 89,206 | 89,207 | 89,208 | 89,209 | 89,210 | 89,211 | 89,212 | 89,213 |
| | 2-245 | 89,226 | 89,227 | 89,228 | 89,229 | 89,230 | 89,231 | 89,232 | 89,233 | 89,234 | 89,235 | 89,236 | 89,237 | 89,238 |
| | 2-246 | 89,251 | 89,252 | 89,253 | 89,254 | 89,255 | 89,256 | 89,257 | 89,258 | 89,259 | 89,260 | 89,261 | 89,262 | 89,263 |
| | 2-247 | 89,276 | 89,277 | 89,278 | 89,279 | 89,280 | 89,281 | 89,282 | 89,283 | 89,284 | 89,285 | 89,286 | 89,287 | 89,288 |
| | 2-248 | 89,301 | 89,302 | 89,303 | 89,304 | 89,305 | 89,306 | 89,307 | 89,308 | 89,309 | 89,310 | 89,311 | 89,312 | 89,313 |
| | 2-249 | 89,326 | 89,327 | 89,328 | 89,329 | 89,330 | 89,331 | 89,332 | 89,333 | 89,334 | 89,335 | 89,336 | 89,337 | 89,338 |
| | 2-250 | 89,351 | 89,352 | 89,353 | 89,354 | 89,355 | 89,356 | 89,357 | 89,358 | 89,359 | 89,360 | 89,361 | 89,362 | 89,363 |
| | 2-251 | 89,376 | 89,377 | 89,378 | 89,379 | 89,380 | 89,381 | 89,382 | 89,383 | 89,384 | 89,385 | 89,386 | 89,387 | 89,388 |
| | 2-252 | 89,401 | 89,402 | 89,403 | 89,404 | 89,405 | 89,406 | 89,407 | 89,408 | 89,409 | 89,410 | 89,411 | 89,412 | 89,413 |
| | 2-253 | 89,426 | 89,427 | 89,428 | 89,429 | 89,430 | 89,431 | 89,432 | 89,433 | 89,434 | 89,435 | 89,436 | 89,437 | 89,438 |
| | 2-254 | 89,451 | 89,452 | 89,453 | 89,454 | 89,455 | 89,456 | 89,457 | 89,458 | 89,459 | 89,460 | 89,461 | 89,462 | 89,463 |
| | 2-255 | 89,476 | 89,477 | 89,478 | 89,479 | 89,480 | 89,481 | 89,482 | 89,483 | 89,484 | 89,485 | 89,486 | 89,487 | 89,488 |
| | 2-256 | 89,501 | 89,502 | 89,503 | 89,504 | 89,505 | 89,506 | 89,507 | 89,508 | 89,509 | 89,510 | 89,511 | 89,512 | 89,513 |
| | 2-257 | 89,526 | 89,527 | 89,528 | 89,529 | 89,530 | 89,531 | 89,532 | 89,533 | 89,534 | 89,535 | 89,536 | 89,537 | 89,538 |
| | 2-258 | 89,551 | 89,552 | 89,553 | 89,554 | 89,555 | 89,556 | 89,557 | 89,558 | 89,559 | 89,560 | 89,561 | 89,562 | 89,563 |
| | 2-259 | 89,576 | 89,577 | 89,578 | 89,579 | 89,580 | 89,581 | 89,582 | 89,583 | 89,584 | 89,585 | 89,586 | 89,587 | 89,588 |
| | 2-260 | 89,601 | 89,602 | 89,603 | 89,604 | 89,605 | 89,606 | 89,607 | 89,608 | 89,609 | 89,610 | 89,611 | 89,612 | 89,613 |
| | 2-261 | 89,626 | 89,627 | 89,628 | 89,629 | 89,630 | 89,631 | 89,632 | 89,633 | 89,634 | 89,635 | 89,636 | 89,637 | 89,638 |
| | 2-262 | 89,651 | 89,652 | 89,653 | 89,654 | 89,655 | 89,656 | 89,657 | 89,658 | 89,659 | 89,660 | 89,661 | 89,662 | 89,663 |
| | 2-263 | 89,676 | 89,677 | 89,678 | 89,679 | 89,680 | 89,681 | 89,682 | 89,683 | 89,684 | 89,685 | 89,686 | 89,687 | 89,688 |
| | 2-264 | 89,701 | 89,702 | 89,703 | 89,704 | 89,705 | 89,706 | 89,707 | 89,708 | 89,709 | 89,710 | 89,711 | 89,712 | 89,713 |
| | 2-265 | 89,726 | 89,727 | 89,728 | 89,729 | 89,730 | 89,731 | 89,732 | 89,733 | 89,734 | 89,735 | 89,736 | 89,737 | 89,738 |
| | 2-266 | 89,751 | 89,752 | 89,753 | 89,754 | 89,755 | 89,756 | 89,757 | 89,758 | 89,759 | 89,760 | 89,761 | 89,762 | 89,763 |
| | 2-267 | 89,776 | 89,777 | 89,778 | 89,779 | 89,780 | 89,781 | 89,782 | 89,783 | 89,784 | 89,785 | 89,786 | 89,787 | 89,788 |
| | 2-268 | 89,801 | 89,802 | 89,803 | 89,804 | 89,805 | 89,806 | 89,807 | 89,808 | 89,809 | 89,810 | 89,811 | 89,812 | 89,813 |
| | 2-269 | 89,826 | 89,827 | 89,828 | 89,829 | 89,730 | 89,831 | 89,832 | 89,833 | 89,834 | 89,835 | 89,836 | 89,837 | 89,838 |
| | 2-270 | 89,851 | 89,852 | 89,853 | 89,854 | 89,855 | 89,856 | 89,857 | 89,858 | 89,859 | 89,860 | 89,861 | 89,862 | 89,863 |
| | 2-271 | 89,876 | 89,877 | 89,878 | 89,879 | 89,880 | 89,881 | 89,882 | 89,883 | 89,884 | 89,885 | 89,886 | 89,887 | 89,888 |
| | 2-272 | 89,901 | 89,902 | 89,903 | 89,904 | 89,905 | 89,906 | 89,907 | 89,908 | 89,909 | 89,910 | 89,911 | 89,912 | 89,913 |
| | 2-273 | 89,926 | 89,927 | 89,928 | 89,929 | 89,930 | 89,931 | 89,932 | 89,933 | 89,934 | 89,935 | 89,936 | 89,937 | 89,938 |
| | 2-274 | 89,951 | 89,952 | 89,953 | 89,954 | 89,955 | 89,956 | 89,957 | 89,958 | 89,959 | 89,960 | 89,961 | 89,962 | 89,963 |
| | 2-275 | 89,976 | 89,977 | 89,978 | 89,979 | 89,980 | 89,981 | 89,982 | 89,983 | 89,984 | 89,985 | 89,986 | 89,987 | 89,988 |

TABLE 68-continued

| | | Compound represented by the formula (1) | | | | | | | | | | | |
|---|---|---|---|---|---|---|---|---|---|---|---|---|---|
| | | 1-189 | 1-190 | 1-191 | 1-192 | 1-193 | 1-194 | 1-195 | 1-196 | 1-197 | 1-198 | 1-199 | 1-200 |
| Compound | 2-221 | 88,639 | 88,640 | 88,641 | 88,642 | 88,643 | 88,644 | 88,645 | 88,646 | 88,647 | 88,648 | 88,649 | 88,650 |
| represented | 2-222 | 88,664 | 88,665 | 88,666 | 88,667 | 88,668 | 88,669 | 88,670 | 88,671 | 88,672 | 88,673 | 88,674 | 88,675 |
| by the | 2-223 | 88,689 | 88,690 | 88,691 | 88,692 | 88,693 | 88,694 | 88,695 | 88,696 | 88,697 | 88,698 | 88,699 | 88,700 |
| formula | 2-224 | 88,714 | 88,715 | 88,716 | 88,717 | 88,718 | 88,719 | 88,720 | 88,721 | 88,722 | 88,723 | 88,724 | 88,725 |
| (2) | 2-225 | 88,739 | 88,740 | 88,741 | 88,742 | 88,743 | 88,744 | 88,745 | 88,746 | 88,747 | 88,748 | 88,749 | 88,750 |
| | 2-226 | 88,764 | 88,765 | 88,766 | 88,767 | 88,768 | 88,769 | 88,770 | 88,771 | 88,772 | 88,773 | 88,774 | 88,775 |
| | 2-227 | 88,789 | 88,790 | 88,791 | 88,792 | 88,793 | 88,794 | 88,795 | 88,796 | 88,797 | 88,798 | 88,799 | 88,800 |
| | 2-228 | 88,814 | 88,815 | 88,816 | 88,817 | 88,818 | 88,819 | 88,820 | 88,821 | 88,822 | 88,823 | 88,824 | 88,825 |
| | 2-229 | 88,839 | 88,840 | 88,841 | 88,842 | 88,843 | 88,844 | 88,845 | 88,846 | 88,847 | 88,848 | 88,849 | 88,850 |
| | 2-230 | 88,864 | 88,865 | 88,866 | 88,867 | 88,868 | 88,869 | 88,870 | 88,871 | 88,872 | 88,873 | 88,874 | 88,875 |
| | 2-231 | 88,889 | 88,890 | 88,891 | 88,892 | 88,893 | 88,894 | 88,895 | 88,896 | 88,897 | 88,898 | 88,899 | 88,900 |
| | 2-232 | 88,914 | 88,915 | 88,916 | 88,917 | 88,918 | 88,919 | 88,920 | 88,921 | 88,922 | 88,923 | 88,924 | 88,925 |
| | 2-233 | 88,939 | 88,940 | 88,941 | 88,942 | 88,943 | 88,944 | 88,945 | 88,946 | 88,947 | 88,948 | 88,949 | 88,950 |
| | 2-234 | 88,964 | 88,965 | 88,966 | 88,967 | 88,968 | 88,969 | 88,970 | 88,971 | 88,972 | 88,973 | 88,974 | 88,975 |
| | 2-235 | 88,989 | 88,990 | 88,991 | 88,992 | 88,993 | 88,994 | 88,995 | 88,996 | 88,997 | 88,998 | 88,999 | 89,000 |
| | 2-236 | 89,014 | 89,015 | 89,016 | 89,017 | 89,018 | 89,019 | 89,020 | 89,021 | 89,022 | 89,023 | 89,024 | 89,025 |
| | 2-237 | 89,039 | 89,040 | 89,041 | 89,042 | 89,043 | 89,044 | 89,045 | 89,046 | 89,047 | 89,048 | 89,049 | 89,050 |
| | 2-238 | 89,064 | 89,065 | 89,066 | 89,067 | 89,068 | 89,069 | 89,070 | 89,071 | 89,072 | 89,073 | 89,074 | 89,075 |
| | 2-239 | 89,089 | 89,090 | 89,091 | 89,092 | 89,093 | 89,094 | 89,095 | 89,096 | 89,097 | 89,098 | 89,099 | 89,100 |
| | 2-240 | 89,114 | 89,115 | 89,116 | 89,117 | 89,118 | 89,119 | 89,120 | 89,121 | 89,122 | 89,123 | 89,124 | 89,125 |
| | 2-241 | 89,139 | 89,140 | 89,141 | 89,142 | 89,143 | 89,144 | 89,145 | 89,146 | 89,147 | 89,148 | 89,149 | 89,150 |
| | 2-242 | 89,164 | 89,165 | 89,166 | 89,167 | 89,168 | 89,169 | 89,170 | 89,171 | 89,172 | 89,173 | 89,174 | 89,175 |
| | 2-243 | 89,189 | 89,190 | 89,191 | 89,192 | 89,193 | 89,194 | 89,195 | 89,196 | 89,197 | 89,198 | 89,199 | 89,200 |
| | 2-244 | 89,214 | 89,215 | 89,216 | 89,217 | 89,218 | 89,219 | 89,220 | 89,221 | 89,222 | 89,223 | 89,224 | 89,225 |
| | 2-245 | 89,239 | 89,240 | 89,241 | 89,242 | 89,243 | 89,244 | 89,245 | 89,246 | 89,247 | 89,248 | 89,249 | 89,250 |
| | 2-246 | 89,264 | 89,265 | 89,266 | 89,267 | 89,268 | 89,269 | 89,270 | 89,271 | 89,272 | 89,273 | 89,274 | 89,275 |
| | 2-247 | 89,289 | 89,290 | 89,291 | 89,292 | 89,293 | 89,294 | 89,295 | 89,296 | 89,297 | 89,298 | 89,299 | 89,300 |
| | 2-248 | 89,314 | 89,315 | 89,316 | 89,317 | 89,318 | 89,319 | 89,320 | 89,321 | 89,322 | 89,323 | 89,324 | 89,325 |
| | 2-249 | 89,339 | 89,340 | 89,341 | 89,342 | 89,343 | 89,344 | 89,345 | 89,346 | 89,347 | 89,348 | 89,349 | 89,350 |
| | 2-250 | 89,364 | 89,365 | 89,366 | 89,367 | 89,368 | 89,369 | 89,370 | 89,371 | 89,372 | 89,373 | 89,374 | 89,375 |
| | 2-251 | 89,389 | 89,390 | 89,391 | 89,392 | 89,393 | 89,394 | 89,395 | 89,396 | 89,397 | 89,398 | 89,399 | 89,400 |
| | 2-252 | 89,414 | 89,415 | 89,416 | 89,417 | 89,418 | 89,419 | 89,420 | 89,421 | 89,422 | 89,423 | 89,424 | 89,425 |
| | 2-253 | 89,439 | 89,440 | 89,441 | 89,442 | 89,443 | 89,444 | 89,445 | 89,446 | 89,447 | 89,448 | 89,449 | 89,450 |
| | 2-254 | 89,464 | 89,465 | 89,466 | 89,467 | 89,468 | 89,469 | 89,470 | 89,471 | 89,472 | 89,473 | 89,474 | 89,475 |
| | 2-255 | 89,489 | 89,490 | 89,491 | 89,492 | 89,493 | 89,494 | 89,495 | 89,496 | 89,497 | 89,498 | 89,499 | 89,500 |
| | 2-256 | 89,514 | 89,515 | 89,516 | 89,517 | 89,518 | 89,519 | 89,420 | 89,521 | 89,522 | 89,523 | 89,524 | 89,525 |
| | 2-257 | 89,539 | 89,540 | 89,541 | 89,542 | 89,543 | 89,544 | 89,545 | 89,546 | 89,547 | 89,548 | 89,549 | 89,550 |
| | 2-258 | 89,564 | 89,565 | 89,566 | 89,567 | 89,568 | 89,569 | 89,570 | 89,571 | 89,572 | 89,573 | 89,574 | 89,575 |
| | 2-259 | 89,589 | 89,590 | 89,591 | 89,592 | 89,593 | 89,594 | 89,595 | 89,596 | 89,597 | 89,598 | 89,599 | 89,600 |
| | 2-260 | 89,614 | 89,615 | 89,616 | 89,617 | 89,618 | 89,619 | 89,620 | 89,621 | 89,622 | 89,623 | 89,624 | 89,625 |
| | 2-261 | 89,639 | 89,640 | 89,641 | 89,642 | 89,643 | 89,644 | 89,645 | 89,646 | 89,647 | 89,648 | 89,649 | 89,650 |
| | 2-262 | 89,664 | 89,665 | 89,666 | 89,667 | 89,668 | 89,669 | 89,670 | 89,671 | 89,672 | 89,673 | 89,674 | 89,675 |
| | 2-263 | 89,689 | 89,690 | 89,691 | 89,692 | 89,693 | 89,694 | 89,695 | 89,696 | 89,697 | 89,698 | 89,699 | 89,700 |
| | 2-264 | 89,714 | 89,715 | 89,716 | 89,717 | 89,718 | 89,719 | 89,720 | 89,721 | 89,722 | 89,723 | 89,724 | 89,725 |
| | 2-265 | 89,739 | 89,740 | 89,741 | 89,742 | 89,743 | 89,744 | 89,745 | 89,746 | 89,747 | 89,748 | 89,749 | 89,750 |
| | 2-266 | 89,764 | 89,765 | 89,766 | 89,767 | 89,768 | 89,769 | 89,770 | 89,771 | 89,772 | 89,773 | 89,774 | 89,775 |
| | 2-267 | 89,789 | 89,790 | 89,791 | 89,792 | 89,793 | 89,794 | 89,795 | 89,796 | 89,797 | 89,798 | 89,799 | 89,800 |
| | 2-268 | 89,814 | 89,815 | 89,816 | 89,817 | 89,818 | 89,819 | 89,820 | 89,821 | 89,822 | 89,823 | 89,824 | 89,825 |
| | 2-269 | 89,839 | 89,840 | 89,841 | 89,842 | 89,843 | 89,844 | 89,845 | 89,846 | 89,847 | 89,848 | 89,849 | 89,850 |
| | 2-270 | 89,864 | 89,865 | 89,866 | 89,867 | 89,868 | 89,869 | 89,870 | 89,871 | 89,872 | 89,873 | 89,874 | 89,875 |
| | 2-271 | 89,889 | 89,890 | 89,891 | 89,892 | 89,893 | 89,894 | 89,895 | 89,896 | 89,897 | 89,898 | 89,899 | 89,900 |
| | 2-272 | 89,914 | 89,915 | 89,916 | 89,917 | 89,918 | 89,919 | 89,920 | 89,921 | 89,922 | 89,923 | 89,924 | 89,925 |
| | 2-273 | 89,939 | 89,940 | 89,941 | 89,942 | 89,943 | 89,944 | 89,945 | 89,946 | 89,947 | 89,948 | 89,949 | 89,950 |
| | 2-274 | 89,964 | 89,965 | 89,966 | 89,967 | 89,969 | 89,969 | 89,970 | 89,971 | 89,972 | 89,973 | 89,974 | 89,975 |
| | 2-275 | 89,989 | 89,990 | 89,991 | 89,992 | 89,993 | 89,994 | 89,995 | 89,996 | 89,997 | 89,998 | 89,999 | 89,000 |

TABLE 69

| | | Compound represented by the formula (1) | | | | | | | | | | | | |
|---|---|---|---|---|---|---|---|---|---|---|---|---|---|---|
| | | 1-176 | 1-177 | 1-178 | 1-179 | 1-180 | 1-181 | 1-182 | 1-183 | 1-184 | 1-185 | 1-186 | 1-187 | 1-188 |
| Compound | 2-276 | 90,001 | 90,002 | 90,003 | 90,004 | 90,005 | 90,006 | 90,007 | 90,008 | 90,009 | 90,010 | 90,011 | 90,012 | 90,013 |
| represented | 2-277 | 90,026 | 90,027 | 90,028 | 90,029 | 90,030 | 90,031 | 90,032 | 90,033 | 90,034 | 90,035 | 90,036 | 90,037 | 90,038 |
| by the | 2-278 | 90,051 | 90,052 | 90,053 | 90,054 | 90,055 | 90,056 | 90,057 | 90,058 | 90,059 | 90,060 | 90,061 | 90,062 | 90,063 |
| formula | 2-279 | 90,076 | 90,077 | 90,078 | 90,079 | 90,080 | 90,081 | 90,082 | 90,083 | 90,084 | 90,085 | 90,086 | 90,087 | 90,088 |
| (2) | 2-280 | 90,101 | 90,102 | 90,103 | 90,104 | 90,105 | 90,106 | 90,107 | 90,108 | 90,109 | 90,110 | 90,111 | 90,112 | 90,113 |
| | 2-281 | 90,126 | 90,127 | 90,128 | 90,129 | 90,130 | 90,131 | 90,132 | 90,133 | 90,134 | 90,135 | 90,136 | 90,137 | 90,138 |
| | 2-282 | 90,151 | 90,152 | 90,153 | 90,154 | 90,155 | 90,156 | 90,157 | 90,158 | 90,159 | 90,160 | 90,161 | 90,162 | 90,163 |
| | 2-283 | 90,176 | 90,177 | 90,178 | 90,179 | 90,180 | 90,181 | 90,182 | 90,183 | 90,184 | 90,185 | 90,186 | 90,187 | 90,188 |
| | 2-284 | 90,201 | 90,202 | 90,203 | 90,204 | 90,205 | 90,206 | 90,207 | 90,208 | 90,209 | 90,210 | 90,211 | 90,212 | 90,213 |
| | 2-285 | 90,226 | 90,227 | 90,228 | 90,229 | 90,230 | 90,231 | 90,232 | 90,233 | 90,234 | 90,235 | 90,236 | 90,237 | 90,238 |
| | 2-286 | 90,251 | 90,252 | 90,253 | 90,254 | 90,255 | 90,256 | 90,257 | 90,258 | 90,259 | 90,260 | 90,261 | 90,262 | 90,263 |

TABLE 69-continued

| | | | | | | | | | | | | | | |
|---|---|---|---|---|---|---|---|---|---|---|---|---|---|---|
| | 2-287 | 90,276 | 90,277 | 90,278 | 90,279 | 90,280 | 90,281 | 90,282 | 90,283 | 90,284 | 90,285 | 90,286 | 90,287 | 90,288 |
| | 2-288 | 90,301 | 90,302 | 90,303 | 90,304 | 90,305 | 90,306 | 90,307 | 90,308 | 90,309 | 90,310 | 90,311 | 90,312 | 90,313 |
| | 2-289 | 90,326 | 90,327 | 90,328 | 90,329 | 90,330 | 90,331 | 90,332 | 90,333 | 90,334 | 90,335 | 90,336 | 90,337 | 90,338 |
| | 2-290 | 90,351 | 90,352 | 90,353 | 90,354 | 90,355 | 90,356 | 90,357 | 90,358 | 90,359 | 90,360 | 90,361 | 90,362 | 90,363 |
| | 2-291 | 90,376 | 90,377 | 90,378 | 90,379 | 90,380 | 90,381 | 90,382 | 90,383 | 90,384 | 90,385 | 90,386 | 90,387 | 90,388 |
| | 2-292 | 90,401 | 90,402 | 90,403 | 90,404 | 90,405 | 90,406 | 90,407 | 90,408 | 90,409 | 90,410 | 90,411 | 90,412 | 90,413 |
| | 2-293 | 90,426 | 90,427 | 90,428 | 90,429 | 90,430 | 90,431 | 90,432 | 90,433 | 90,434 | 90,435 | 90,436 | 90,437 | 90,438 |
| | 2-294 | 90,451 | 90,452 | 90,453 | 90,454 | 90,455 | 90,456 | 90,457 | 90,458 | 90,459 | 90,460 | 90,461 | 90,462 | 90,463 |
| | 2-295 | 90,476 | 90,477 | 90,478 | 90,479 | 90,480 | 90,481 | 90,482 | 90,483 | 90,484 | 90,485 | 90,486 | 90,487 | 90,488 |
| | 2-296 | 90,501 | 90,502 | 90,503 | 90,504 | 90,505 | 90,506 | 90,507 | 90,508 | 90,509 | 90,510 | 90,511 | 90,512 | 90,513 |
| | 2-297 | 90,526 | 90,527 | 90,528 | 90,529 | 90,530 | 90,531 | 90,532 | 90,533 | 90,534 | 90,535 | 90,536 | 90,537 | 90,538 |
| | 2-298 | 90,551 | 90,552 | 90,553 | 90,554 | 90,555 | 90,556 | 90,557 | 90,558 | 90,559 | 90,560 | 90,561 | 90,562 | 90,563 |
| | 2-299 | 90,576 | 90,577 | 90,578 | 90,579 | 90,580 | 90,581 | 90,582 | 90,583 | 90,584 | 90,585 | 90,586 | 90,587 | 90,588 |
| | 2-300 | 90,601 | 90,602 | 90,603 | 90,604 | 90,605 | 90,606 | 90,607 | 90,608 | 90,609 | 90,610 | 90,611 | 90,612 | 90,613 |
| | 2-301 | 90,626 | 90,627 | 90,628 | 90,629 | 90,630 | 90,631 | 90,632 | 90,633 | 90,634 | 90,635 | 90,636 | 90,637 | 90,638 |
| | 2-302 | 90,651 | 90,652 | 90,653 | 90,654 | 90,655 | 90,656 | 90,657 | 90,658 | 90,659 | 90,660 | 90,661 | 90,662 | 90,663 |
| | 2-303 | 90,676 | 90,677 | 90,678 | 90,679 | 90,680 | 90,681 | 90,682 | 90,683 | 90,684 | 90,685 | 90,686 | 90,687 | 90,688 |
| | 2-304 | 90,701 | 90,702 | 90,703 | 90,704 | 90,705 | 90,706 | 90,707 | 90,708 | 90,709 | 90,710 | 90,711 | 90,712 | 90,713 |
| | 2-305 | 90,726 | 90,727 | 90,728 | 90,729 | 90,730 | 90,731 | 90,732 | 90,733 | 90,734 | 90,735 | 90,736 | 90,737 | 90,738 |
| | 2-306 | 90,751 | 90,752 | 90,753 | 90,754 | 90,755 | 90,756 | 90,757 | 90,758 | 90,759 | 90,760 | 90,761 | 90,762 | 90,763 |
| | 2-307 | 90,776 | 90,777 | 90,778 | 90,779 | 90,780 | 90,781 | 90,782 | 90,783 | 90,784 | 90,785 | 90,786 | 90,787 | 90,788 |
| | 2-308 | 90,801 | 90,802 | 90,803 | 90,804 | 90,805 | 90,806 | 90,807 | 90,808 | 90,809 | 90,810 | 90,811 | 90,812 | 90,813 |
| | 2-309 | 90,826 | 90,827 | 90,828 | 90,829 | 90,830 | 90,831 | 90,832 | 90,833 | 90,834 | 90,835 | 90,836 | 90,837 | 90,838 |
| | 2-310 | 90,851 | 90,852 | 90,853 | 90,854 | 90,855 | 90,856 | 90,857 | 90,858 | 90,859 | 90,860 | 90,861 | 90,862 | 90,863 |
| | 2-311 | 90,876 | 90,877 | 90,878 | 90,879 | 90,880 | 90,881 | 90,882 | 90,883 | 90,884 | 90,885 | 90,886 | 90,887 | 90,888 |
| | 2-312 | 90,901 | 90,902 | 90,903 | 90,904 | 90,905 | 90,906 | 90,907 | 90,908 | 90,909 | 90,910 | 90,911 | 90,912 | 90,913 |
| | 2-313 | 90,926 | 90,927 | 90,928 | 90,929 | 90,930 | 90,931 | 90,932 | 90,933 | 90,934 | 90,935 | 90,936 | 90,937 | 90,938 |
| | 2-314 | 90,951 | 90,952 | 90,953 | 90,954 | 90,955 | 90,956 | 90,957 | 90,958 | 90,959 | 90,960 | 90,961 | 90,962 | 90,963 |
| | 2-315 | 90,976 | 90,977 | 90,978 | 90,979 | 90,980 | 90,981 | 90,982 | 90,983 | 90,984 | 90,985 | 90,986 | 90,987 | 90,988 |
| | 2-316 | 91,001 | 91,002 | 91,003 | 91,004 | 91,005 | 91,006 | 91,007 | 91,008 | 91,009 | 91,010 | 91,011 | 91,012 | 91,013 |
| | 2-317 | 91,026 | 91,027 | 91,028 | 91,029 | 91,030 | 91,031 | 91,032 | 91,033 | 91,034 | 91,035 | 91,036 | 91,037 | 91,038 |
| | 2-318 | 91,051 | 91,052 | 91,053 | 91,054 | 91,055 | 91,056 | 91,057 | 91,058 | 91,059 | 91,060 | 91,061 | 91,062 | 91,063 |
| | 2-319 | 91,076 | 91,077 | 91,078 | 91,079 | 91,080 | 91,081 | 91,082 | 91,083 | 91,084 | 91,085 | 91,086 | 91,087 | 91,088 |
| | 2-320 | 91,101 | 91,102 | 91,103 | 91,104 | 91,105 | 91,106 | 91,107 | 91,108 | 91,109 | 91,110 | 91,111 | 91,112 | 91,113 |
| | 2-321 | 91,126 | 91,127 | 91,128 | 91,129 | 91,130 | 91,131 | 91,132 | 91,133 | 91,134 | 91,135 | 91,136 | 91,137 | 91,138 |
| | 2-322 | 91,151 | 91,152 | 91,153 | 91,154 | 91,155 | 91,156 | 91,157 | 91,158 | 91,159 | 91,160 | 91,161 | 91,162 | 91,163 |
| | 2-323 | 91,176 | 91,177 | 91,178 | 91,179 | 91,180 | 91,181 | 91,182 | 91,183 | 91,184 | 91,185 | 91,186 | 91,187 | 91,188 |
| | 2-324 | 91,201 | 91,202 | 91,203 | 91,204 | 91,205 | 91,206 | 91,207 | 91,208 | 91,209 | 91,210 | 91,211 | 91,212 | 91,213 |
| | 2-325 | 91,226 | 91,227 | 91,228 | 91,229 | 91,230 | 91,231 | 91,232 | 91,233 | 91,234 | 91,235 | 91,236 | 91,237 | 91,238 |
| | 2-326 | 91,251 | 91,252 | 91,253 | 91,254 | 91,255 | 91,256 | 91,257 | 91,258 | 91,259 | 91,260 | 91,261 | 91,262 | 91,263 |
| | 2-327 | 91,276 | 91,277 | 91,278 | 91,279 | 91,280 | 91,281 | 91,282 | 91,283 | 91,284 | 91,285 | 91,286 | 91,287 | 91,288 |
| | 2-328 | 91,301 | 91,302 | 91,303 | 91,304 | 91,305 | 91,306 | 91,307 | 91,308 | 91,309 | 91,310 | 91,311 | 91,312 | 91,313 |
| | 2-329 | 91,326 | 91,327 | 91,328 | 91,329 | 91,330 | 91,331 | 91,332 | 91,333 | 91,334 | 91,335 | 91,336 | 91,337 | 91,338 |
| | 2-330 | 91,351 | 91,352 | 91,353 | 91,354 | 91,355 | 91,356 | 91,357 | 91,358 | 91,359 | 91,360 | 91,361 | 91,362 | 91,363 |

| | | Compound represented by the formula (1) | | | | | | | | | | | |
|---|---|---|---|---|---|---|---|---|---|---|---|---|---|
| | | 1-189 | 1-190 | 1-191 | 1-192 | 1-193 | 1-194 | 1-195 | 1-196 | 1-197 | 1-198 | 1-199 | 1-200 |
| Compound represented by the formula (2) | 2-276 | 90,014 | 90,015 | 90,016 | 90,017 | 90,018 | 90,019 | 90,020 | 90,021 | 90,022 | 90,023 | 90,024 | 90,025 |
| | 2-277 | 90,039 | 90,040 | 90,041 | 90,042 | 90,043 | 90,044 | 90,045 | 90,046 | 90,047 | 90,048 | 90,049 | 90,050 |
| | 2-278 | 90,064 | 90,065 | 90,066 | 90,067 | 90,068 | 90,069 | 90,070 | 90,071 | 90,072 | 90,073 | 90,074 | 90,075 |
| | 2-279 | 90,089 | 90,090 | 90,091 | 90,092 | 90,093 | 90,094 | 90,095 | 90,096 | 90,097 | 90,098 | 90,099 | 90,100 |
| | 2-280 | 90,114 | 90,115 | 90,116 | 90,117 | 90,118 | 90,119 | 90,120 | 90,121 | 90,122 | 90,123 | 90,124 | 90,125 |
| | 2-281 | 90,139 | 90,140 | 90,141 | 90,142 | 90,143 | 90,144 | 90,145 | 90,146 | 90,147 | 90,148 | 90,149 | 90,150 |
| | 2-282 | 90,164 | 90,165 | 90,166 | 90,167 | 90,168 | 90,169 | 90,170 | 90,171 | 90,172 | 90,173 | 90,174 | 90,175 |
| | 2-283 | 90,189 | 90,190 | 90,191 | 90,192 | 90,193 | 90,194 | 90,195 | 90,196 | 90,197 | 90,198 | 90,199 | 90,200 |
| | 2-284 | 90,214 | 90,215 | 90,216 | 90,217 | 90,218 | 90,219 | 90,220 | 90,221 | 90,222 | 90,223 | 90,224 | 90,225 |
| | 2-285 | 90,239 | 90,240 | 90,241 | 90,242 | 90,243 | 90,244 | 90,245 | 90,246 | 90,247 | 90,248 | 90,249 | 90,250 |
| | 2-286 | 90,264 | 90,265 | 90,266 | 90,267 | 90,268 | 90,269 | 90,270 | 90,271 | 90,272 | 90,273 | 90,274 | 90,275 |
| | 2-287 | 90,289 | 90,290 | 90,291 | 90,292 | 90,293 | 90,294 | 90,295 | 90,296 | 90,297 | 90,298 | 90,299 | 90,300 |
| | 2-288 | 90,314 | 90,315 | 90,316 | 90,317 | 90,318 | 90,319 | 90,320 | 90,321 | 90,322 | 90,323 | 90,324 | 90,325 |
| | 2-289 | 90,339 | 90,340 | 90,341 | 90,342 | 90,343 | 90,344 | 90,345 | 90,346 | 90,347 | 90,348 | 90,349 | 90,350 |
| | 2-290 | 90,364 | 90,365 | 90,366 | 90,367 | 90,368 | 90,369 | 90,370 | 90,371 | 90,372 | 90,373 | 90,374 | 90,375 |
| | 2-291 | 90,389 | 90,390 | 90,391 | 90,392 | 90,393 | 90,394 | 90,395 | 90,396 | 90,397 | 90,398 | 90,399 | 90,400 |
| | 2-292 | 90,414 | 90,415 | 90,416 | 90,417 | 90,418 | 90,419 | 90,420 | 90,421 | 90,422 | 90,423 | 90,424 | 90,425 |
| | 2-293 | 90,439 | 90,440 | 90,441 | 90,442 | 90,443 | 90,444 | 90,445 | 90,446 | 90,447 | 90,448 | 90,449 | 90,450 |
| | 2-294 | 90,464 | 90,465 | 90,466 | 90,467 | 90,468 | 90,469 | 90,470 | 90,471 | 90,472 | 90,473 | 90,474 | 90,475 |
| | 2-295 | 90,489 | 90,490 | 90,491 | 90,492 | 90,493 | 90,494 | 90,495 | 90,496 | 90,497 | 90,498 | 90,499 | 90,500 |
| | 2-296 | 90,514 | 90,515 | 90,516 | 90,517 | 90,518 | 90,519 | 90,520 | 90,521 | 90,522 | 90,523 | 90,524 | 90,525 |
| | 2-297 | 90,539 | 90,540 | 90,541 | 90,542 | 90,543 | 90,544 | 90,545 | 90,546 | 90,547 | 90,548 | 90,549 | 90,550 |
| | 2-298 | 90,564 | 90,565 | 90,566 | 90,567 | 90,568 | 90,569 | 90,570 | 90,571 | 90,572 | 90,573 | 90,574 | 90,575 |
| | 2-299 | 90,589 | 90,590 | 90,591 | 90,592 | 90,593 | 90,594 | 90,595 | 90,596 | 90,597 | 90,598 | 90,599 | 90,600 |
| | 2-300 | 90,614 | 90,615 | 90,616 | 90,617 | 90,618 | 90,619 | 90,620 | 90,621 | 90,622 | 90,623 | 90,624 | 90,625 |
| | 2-301 | 90,639 | 90,640 | 90,641 | 90,642 | 90,643 | 90,644 | 90,645 | 90,646 | 90,647 | 90,648 | 90,649 | 90,650 |
| | 2-302 | 90,664 | 90,665 | 90,666 | 90,667 | 90,668 | 90,669 | 90,670 | 90,671 | 90,672 | 90,673 | 90,674 | 90,675 |
| | 2-303 | 90,689 | 90,690 | 90,691 | 90,692 | 90,693 | 90,694 | 90,695 | 90,696 | 90,697 | 90,698 | 90,699 | 90,700 |
| | 2-304 | 90,714 | 90,715 | 90,716 | 90,717 | 90,718 | 90,719 | 90,720 | 90,721 | 90,722 | 90,723 | 90,724 | 90,725 |
| | 2-305 | 90,739 | 90,740 | 90,741 | 90,742 | 90,743 | 90,744 | 90,745 | 90,746 | 90,747 | 90,748 | 90,749 | 90,750 |
| | 2-306 | 90,764 | 90,765 | 90,766 | 90,767 | 90,768 | 90,769 | 90,770 | 90,771 | 90,772 | 90,773 | 90,774 | 90,775 |

TABLE 69-continued

| | | | | | | | | | | | | |
|---|---|---|---|---|---|---|---|---|---|---|---|---|
| 2-307 | 90,789 | 90,790 | 90,791 | 90,792 | 90,793 | 90,794 | 90,795 | 90,796 | 90,797 | 90,798 | 90,799 | 90,800 |
| 2-308 | 90,814 | 90,815 | 90,816 | 90,817 | 90,818 | 90,819 | 90,820 | 90,821 | 90,822 | 90,823 | 90,824 | 90,825 |
| 2-309 | 90,839 | 90,840 | 90,841 | 90,842 | 90,843 | 90,844 | 90,845 | 90,846 | 90,847 | 90,848 | 90,849 | 90,850 |
| 2-310 | 90,864 | 90,865 | 90,866 | 90,867 | 90,868 | 90,869 | 90,870 | 90,871 | 90,872 | 90,873 | 90,874 | 90,875 |
| 2-311 | 90,889 | 90,890 | 90,891 | 90,892 | 90,893 | 90,894 | 90,895 | 90,896 | 90,897 | 90,898 | 90,899 | 90,900 |
| 2-312 | 90,914 | 90,915 | 90,916 | 90,917 | 90,918 | 90,919 | 90,920 | 90,921 | 90,922 | 90,923 | 90,924 | 90,925 |
| 2-313 | 90,939 | 90,940 | 90,941 | 90,942 | 90,943 | 90,944 | 90,945 | 90,946 | 90,947 | 90,948 | 90,949 | 90,950 |
| 2-314 | 90,964 | 90,965 | 90,966 | 90,967 | 90,968 | 90,969 | 90,970 | 90,971 | 90,972 | 90,973 | 90,974 | 90,975 |
| 2-315 | 90,989 | 90,990 | 90,991 | 90,992 | 90,993 | 90,994 | 90,995 | 90,996 | 90,997 | 90,998 | 90,999 | 91,000 |
| 2-316 | 91,014 | 91,015 | 91,016 | 91,017 | 91,018 | 91,019 | 91,020 | 91,021 | 91,022 | 91,023 | 91,024 | 91,025 |
| 2-317 | 91,039 | 91,040 | 91,041 | 91,042 | 91,043 | 91,044 | 91,045 | 91,046 | 91,047 | 91,048 | 91,049 | 91,050 |
| 2-318 | 91,064 | 91,065 | 91,066 | 91,067 | 91,068 | 91,069 | 91,070 | 91,071 | 91,072 | 91,073 | 91,074 | 91,075 |
| 2-319 | 91,089 | 91,090 | 91,091 | 91,092 | 91,093 | 91,094 | 91,095 | 91,096 | 91,097 | 91,098 | 91,099 | 91,100 |
| 2-320 | 91,114 | 91,115 | 91,116 | 91,117 | 91,118 | 91,119 | 91,120 | 91,121 | 91,122 | 91,123 | 91,124 | 91,125 |
| 2-321 | 91,139 | 91,140 | 91,141 | 91,142 | 91,143 | 91,144 | 91,145 | 91,146 | 91,147 | 91,148 | 91,149 | 91,150 |
| 2-322 | 91,164 | 91,165 | 91,166 | 91,167 | 91,168 | 91,169 | 91,170 | 91,171 | 91,172 | 91,173 | 91,174 | 91,175 |
| 2-323 | 91,189 | 91,190 | 91,191 | 91,192 | 91,193 | 91,194 | 91,195 | 91,196 | 91,197 | 91,198 | 91,199 | 91,200 |
| 2-324 | 91,214 | 91,215 | 91,216 | 91,217 | 91,218 | 91,219 | 91,220 | 91,221 | 91,222 | 91,223 | 91,224 | 91,225 |
| 2-325 | 91,239 | 91,240 | 91,241 | 91,242 | 91,243 | 91,244 | 91,245 | 91,246 | 91,247 | 91,248 | 91,249 | 91,250 |
| 2-326 | 91,264 | 91,265 | 91,266 | 91,267 | 91,268 | 91,269 | 91,270 | 91,271 | 91,272 | 91,273 | 91,274 | 91,275 |
| 2-327 | 91,289 | 91,290 | 91,291 | 91,292 | 91,293 | 91,294 | 91,295 | 91,296 | 91,297 | 91,298 | 91,299 | 91,300 |
| 2-328 | 91,314 | 91,315 | 91,316 | 91,317 | 91,318 | 91,319 | 91,320 | 91,321 | 91,322 | 91,323 | 91,324 | 91,325 |
| 2-329 | 91,339 | 91,340 | 91,341 | 91,342 | 91,343 | 91,344 | 91,345 | 91,346 | 91,347 | 91,348 | 91,349 | 91,350 |
| 2-330 | 91,364 | 91,365 | 91,366 | 91,367 | 91,368 | 91,369 | 91,370 | 91,371 | 91,372 | 91,373 | 91,374 | 91,375 |

TABLE 70

| | | Compound represented by the formula (1) | | | | | | | | | | | | |
|---|---|---|---|---|---|---|---|---|---|---|---|---|---|---|
| | | 1-176 | 1-177 | 1-178 | 1-179 | 1-180 | 1-181 | 1-182 | 1-183 | 1-184 | 1-185 | 1-186 | 1-187 | 1-188 |
| Compound represented by the formula (2) | 2-331 | 91,376 | 91,377 | 91,378 | 91,379 | 91,380 | 91,381 | 91,382 | 91,383 | 91,384 | 91,385 | 91,386 | 91,387 | 91,388 |
| | 2-332 | 91,401 | 91,402 | 91,403 | 91,404 | 91,405 | 91,406 | 91,407 | 91,408 | 91,409 | 91,410 | 91,411 | 91,412 | 91,413 |
| | 2-333 | 91,426 | 91,427 | 91,428 | 91,429 | 91,430 | 91,431 | 91,432 | 91,433 | 91,434 | 91,435 | 91,436 | 91,437 | 91,438 |
| | 2-334 | 91,451 | 91,452 | 91,453 | 91,454 | 91,455 | 91,456 | 91,457 | 91,458 | 91,459 | 91,460 | 91,461 | 91,462 | 91,463 |
| | 2-335 | 91,476 | 91,477 | 91,478 | 91,479 | 91,480 | 91,481 | 91,482 | 91,483 | 91,484 | 91,485 | 91,486 | 91,487 | 91,488 |
| | 2-336 | 91,501 | 91,502 | 91,503 | 91,504 | 91,505 | 91,506 | 91,507 | 91,508 | 91,509 | 91,510 | 91,511 | 91,512 | 91,513 |
| | 2-337 | 91,526 | 91,527 | 91,528 | 91,529 | 91,530 | 91,531 | 91,532 | 91,533 | 91,534 | 91,535 | 91,536 | 91,537 | 91,538 |
| | 2-338 | 91,551 | 91,552 | 91,553 | 91,554 | 91,555 | 91,556 | 91,557 | 91,558 | 91,559 | 91,560 | 91,561 | 91,562 | 91,563 |
| | 2-339 | 91,576 | 91,577 | 91,578 | 91,579 | 91,580 | 91,581 | 91,582 | 91,583 | 91,584 | 91,585 | 91,586 | 91,587 | 91,588 |
| | 2-340 | 91,601 | 91,602 | 91,603 | 91,604 | 91,605 | 91,606 | 91,607 | 91,608 | 91,609 | 91,610 | 91,611 | 91,612 | 91,613 |
| | 2-341 | 91,626 | 91,627 | 91,628 | 91,629 | 91,630 | 91,631 | 91,632 | 91,633 | 91,634 | 91,635 | 91,636 | 91,637 | 91,638 |
| | 2-342 | 91,651 | 91,652 | 91,653 | 91,654 | 91,655 | 91,656 | 91,657 | 91,658 | 91,659 | 91,660 | 91,661 | 91,662 | 91,663 |
| | 2-343 | 91,676 | 91,677 | 91,678 | 91,679 | 91,680 | 91,681 | 91,682 | 91,683 | 91,684 | 91,685 | 91,686 | 91,687 | 91,688 |
| | 2-344 | 91,701 | 91,702 | 91,703 | 91,704 | 91,705 | 91,706 | 91,707 | 91,708 | 91,709 | 91,710 | 91,711 | 91,712 | 91,713 |
| | 2-345 | 91,726 | 91,727 | 91,728 | 91,729 | 91,730 | 91,731 | 91,732 | 91,733 | 91,734 | 91,735 | 91,736 | 91,737 | 91,738 |
| | 2-346 | 91,751 | 91,752 | 91,753 | 91,754 | 91,755 | 91,756 | 91,757 | 91,758 | 91,759 | 91,760 | 91,761 | 91,762 | 91,763 |
| | 2-347 | 91,776 | 91,777 | 91,778 | 91,779 | 91,780 | 91,781 | 91,782 | 91,783 | 91,784 | 91,785 | 91,786 | 91,787 | 91,788 |
| | 2-348 | 91,801 | 91,802 | 91,803 | 91,804 | 91,805 | 91,806 | 91,807 | 91,808 | 91,809 | 91,810 | 91,811 | 91,812 | 91,813 |
| | 2-349 | 91,826 | 91,827 | 91,828 | 91,829 | 91,830 | 91,831 | 91,832 | 91,833 | 91,834 | 91,835 | 91,836 | 91,837 | 91,838 |
| | 2-350 | 91,851 | 91,852 | 91,853 | 91,854 | 91,855 | 91,856 | 91,857 | 91,858 | 91,859 | 91,860 | 91,861 | 91,862 | 91,863 |
| | 2-351 | 91,876 | 91,877 | 91,878 | 91,879 | 91,880 | 91,881 | 91,882 | 91,883 | 91,884 | 91,885 | 91,886 | 91,887 | 91,888 |
| | 2-352 | 91,901 | 91,902 | 91,903 | 91,904 | 91,905 | 91,906 | 91,907 | 91,908 | 91,909 | 91,910 | 91,911 | 91,912 | 91,913 |
| | 2-353 | 91,926 | 91,927 | 91,928 | 91,929 | 91,930 | 91,931 | 91,932 | 91,933 | 91,934 | 91,935 | 91,836 | 91,937 | 91,938 |
| | 2-354 | 91,951 | 91,952 | 91,953 | 91,954 | 91,955 | 91,956 | 91,957 | 91,958 | 91,959 | 91,960 | 91,861 | 91,962 | 91,963 |
| | 2-355 | 91,976 | 91,977 | 91,978 | 91,979 | 91,980 | 91,981 | 91,982 | 91,983 | 91,984 | 91,985 | 91,986 | 91,987 | 91,988 |
| | 2-356 | 92,001 | 92,002 | 92,003 | 92,004 | 92,005 | 92,006 | 92,007 | 92,008 | 92,009 | 92,010 | 92,011 | 92,012 | 92,013 |
| | 2-357 | 92,026 | 92,027 | 92,028 | 92,029 | 92,030 | 92,031 | 92,032 | 92,033 | 92,034 | 92,035 | 92,036 | 92,037 | 92,038 |
| | 2-358 | 92,051 | 92,052 | 92,053 | 92,054 | 92,055 | 92,056 | 92,057 | 92,058 | 92,059 | 92,060 | 92,061 | 92,062 | 92,063 |
| | 2-359 | 92,076 | 92,077 | 92,078 | 92,079 | 92,080 | 92,081 | 92,082 | 92,083 | 92,084 | 92,085 | 92,086 | 92,087 | 92,088 |
| | 2-360 | 92,101 | 92,102 | 92,103 | 92,104 | 92,105 | 92,106 | 92,107 | 92,108 | 92,109 | 92,110 | 92,111 | 92,112 | 92,113 |
| | 2-361 | 92,126 | 92,127 | 92,128 | 92,129 | 92,130 | 92,131 | 92,132 | 92,133 | 92,134 | 92,135 | 92,136 | 92,137 | 92,138 |
| | 2-362 | 92,151 | 92,152 | 92,153 | 92,154 | 92,155 | 92,156 | 92,157 | 92,158 | 92,159 | 92,160 | 92,161 | 92,162 | 92,163 |
| | 2-363 | 92,176 | 92,177 | 92,178 | 92,179 | 92,180 | 92,181 | 92,182 | 92,183 | 92,184 | 92,185 | 92,186 | 92,187 | 92,188 |
| | 2-364 | 92,201 | 92,202 | 92,203 | 92,204 | 92,205 | 92,206 | 92,207 | 92,208 | 92,209 | 92,210 | 92,211 | 92,212 | 92,213 |
| | 2-365 | 92,226 | 92,227 | 92,228 | 92,229 | 92,230 | 92,231 | 92,232 | 92,233 | 92,234 | 92,235 | 92,236 | 92,237 | 92,238 |
| | 2-366 | 92,251 | 92,252 | 92,253 | 92,254 | 92,255 | 92,256 | 92,257 | 92,258 | 92,259 | 92,260 | 92,261 | 92,262 | 92,263 |
| | 2-367 | 92,276 | 92,277 | 92,278 | 92,279 | 92,280 | 92,281 | 92,282 | 92,283 | 92,284 | 92,285 | 92,286 | 92,287 | 92,288 |
| | 2-368 | 92,301 | 92,302 | 92,303 | 92,304 | 92,305 | 92,306 | 92,307 | 92,308 | 92,309 | 92,310 | 92,311 | 92,312 | 92,313 |
| | 2-369 | 92,326 | 92,327 | 92,328 | 92,329 | 92,330 | 92,331 | 92,332 | 92,333 | 92,334 | 92,335 | 92,336 | 92,337 | 92,338 |
| | 2-370 | 92,351 | 92,352 | 92,353 | 92,354 | 92,355 | 92,356 | 92,357 | 92,358 | 92,359 | 92,360 | 92,361 | 92,362 | 92,363 |
| | 2-371 | 92,376 | 92,377 | 92,378 | 92,379 | 92,380 | 92,381 | 92,382 | 92,383 | 92,384 | 92,385 | 92,386 | 92,387 | 92,388 |
| | 2-372 | 92,401 | 92,402 | 92,403 | 92,404 | 92,405 | 92,406 | 92,407 | 92,408 | 92,409 | 92,410 | 92,411 | 92,412 | 92,413 |
| | 2-373 | 92,426 | 92,427 | 92,428 | 92,429 | 92,430 | 92,431 | 92,432 | 92,433 | 92,434 | 92,435 | 92,436 | 92,437 | 92,438 |
| | 2-374 | 92,451 | 92,452 | 92,453 | 92,454 | 92,455 | 92,456 | 92,457 | 92,458 | 92,459 | 92,460 | 92,461 | 92,462 | 92,463 |
| | 2-375 | 92,476 | 92,477 | 92,478 | 92,479 | 92,480 | 92,481 | 92,482 | 92,483 | 92,484 | 92,485 | 92,486 | 92,487 | 92,488 |
| | 2-376 | 92,501 | 92,502 | 92,503 | 92,504 | 92,505 | 92,506 | 92,507 | 92,508 | 92,509 | 92,510 | 92,511 | 92,512 | 92,513 |

TABLE 70-continued

| | | | | | | | | | | | | | |
|---|---|---|---|---|---|---|---|---|---|---|---|---|---|
| 2-377 | 92,526 | 92,527 | 92,528 | 92,529 | 92,530 | 92,531 | 92,532 | 92,533 | 92,534 | 92,535 | 92,536 | 92,537 | 92,538 |
| 2-378 | 92,551 | 92,552 | 92,553 | 92,554 | 92,555 | 92,556 | 92,557 | 92,558 | 92,559 | 92,560 | 92,561 | 92,562 | 92,563 |
| 2-379 | 92,576 | 92,577 | 92,578 | 92,579 | 92,580 | 92,581 | 92,582 | 92,583 | 92,584 | 92,585 | 92,586 | 92,587 | 92,588 |
| 2-380 | 92,601 | 92,602 | 92,603 | 92,604 | 92,605 | 92,606 | 92,607 | 92,608 | 92,609 | 92,610 | 92,611 | 92,612 | 92,613 |
| 2-381 | 92,626 | 92,627 | 92,628 | 92,629 | 92,630 | 92,631 | 92,632 | 92,633 | 92,634 | 92,635 | 92,636 | 92,637 | 92,638 |
| 2-382 | 92,651 | 92,652 | 92,653 | 92,654 | 92,655 | 92,656 | 92,657 | 92,658 | 92,659 | 92,660 | 92,661 | 92,662 | 92,663 |
| 2-383 | 92,676 | 92,677 | 92,678 | 92,679 | 92,680 | 92,681 | 92,682 | 92,683 | 92,684 | 92,685 | 92,686 | 92,687 | 92,688 |
| 2-384 | 92,701 | 92,702 | 92,703 | 92,704 | 92,705 | 92,706 | 92,707 | 92,708 | 92,709 | 92,710 | 92,711 | 92,712 | 92,713 |
| 2-385 | 92,726 | 92,727 | 92,728 | 92,729 | 92,730 | 92,731 | 92,732 | 92,733 | 92,734 | 92,735 | 92,736 | 92,737 | 92,738 |

| | | Compound represented by the formula (1) | | | | | | | | | | | |
|---|---|---|---|---|---|---|---|---|---|---|---|---|---|
| | | 1-189 | 1-190 | 1-191 | 1-192 | 1-193 | 1-194 | 1-195 | 1-196 | 1-197 | 1-198 | 1-199 | 1-200 |
| Compound represented by the formula (2) | 2-331 | 91,389 | 91,390 | 91,391 | 91,392 | 91,393 | 91,394 | 91,395 | 91,396 | 91,397 | 91,398 | 91,399 | 91,400 |
| | 2-332 | 91,414 | 91,415 | 91,416 | 91,417 | 91,418 | 91,419 | 91,420 | 91,421 | 91,422 | 91,423 | 91,424 | 91,425 |
| | 2-333 | 91,439 | 91,440 | 91,441 | 91,442 | 91,443 | 91,444 | 91,445 | 91,446 | 91,447 | 91,448 | 91,449 | 91,450 |
| | 2-334 | 91,464 | 91,465 | 91,466 | 91,467 | 91,468 | 91,469 | 91,470 | 91,471 | 91,472 | 91,473 | 91,474 | 91,475 |
| | 2-335 | 91,489 | 91,490 | 91,491 | 91,492 | 91,493 | 91,494 | 91,495 | 91,496 | 91,497 | 91,498 | 91,499 | 91,500 |
| | 2-336 | 91,514 | 91,515 | 91,516 | 91,517 | 91,518 | 91,519 | 91,520 | 91,521 | 91,522 | 91,523 | 91,524 | 91,525 |
| | 2-337 | 91,539 | 91,540 | 91,541 | 91,542 | 91,543 | 91,544 | 91,545 | 91,546 | 91,547 | 91,548 | 91,549 | 91,550 |
| | 2-338 | 91,564 | 91,565 | 91,566 | 91,567 | 91,568 | 91,569 | 91,570 | 91,571 | 91,572 | 91,573 | 91,574 | 91,575 |
| | 2-339 | 91,589 | 91,590 | 91,591 | 91,592 | 91,593 | 91,594 | 91,595 | 91,596 | 91,597 | 91,598 | 91,599 | 91,600 |
| | 2-340 | 91,614 | 91,615 | 91,616 | 91,617 | 91,618 | 91,619 | 91,620 | 91,621 | 91,622 | 91,623 | 91,624 | 91,625 |
| | 2-341 | 91,639 | 91,640 | 91,641 | 91,642 | 91,643 | 91,644 | 91,645 | 91,646 | 91,647 | 91,648 | 91,649 | 91,650 |
| | 2-342 | 91,664 | 91,665 | 91,666 | 91,667 | 91,668 | 91,669 | 91,670 | 91,671 | 91,672 | 91,673 | 91,674 | 91,675 |
| | 2-343 | 91,689 | 91,690 | 91,691 | 91,692 | 91,693 | 91,694 | 91,695 | 91,696 | 91,697 | 91,698 | 91,699 | 91,700 |
| | 2-344 | 91,714 | 91,715 | 91,716 | 91,717 | 91,718 | 91,719 | 91,720 | 91,721 | 91,722 | 91,723 | 91,724 | 91,725 |
| | 2-345 | 91,739 | 91,740 | 91,741 | 91,742 | 91,743 | 91,744 | 91,745 | 91,746 | 91,747 | 91,748 | 91,749 | 91,750 |
| | 2-346 | 91,764 | 91,765 | 91,766 | 91,767 | 91,768 | 91,769 | 91,770 | 91,771 | 91,772 | 91,773 | 91,774 | 91,775 |
| | 2-347 | 91,789 | 91,790 | 91,791 | 91,792 | 91,793 | 91,794 | 91,795 | 91,796 | 91,797 | 91,798 | 91,799 | 91,800 |
| | 2-348 | 91,814 | 91,815 | 91,816 | 91,817 | 91,818 | 91,819 | 91,820 | 91,821 | 91,822 | 91,823 | 91,824 | 91,825 |
| | 2-349 | 91,839 | 91,840 | 91,841 | 91,842 | 91,843 | 91,844 | 91,845 | 91,846 | 91,847 | 91,848 | 91,849 | 91,850 |
| | 2-350 | 91,864 | 91,865 | 91,866 | 91,867 | 91,868 | 91,869 | 91,870 | 91,871 | 91,872 | 91,873 | 91,874 | 91,875 |
| | 2-351 | 91,889 | 91,890 | 91,891 | 91,892 | 91,893 | 91,894 | 91,895 | 91,896 | 91,897 | 91,898 | 91,899 | 91,900 |
| | 2-352 | 91,914 | 91,915 | 91,916 | 91,917 | 91,918 | 91,919 | 91,920 | 91,921 | 91,922 | 91,923 | 91,924 | 91,925 |
| | 2-353 | 91,939 | 91,940 | 91,941 | 91,942 | 91,943 | 91,944 | 91,945 | 91,946 | 91,947 | 91,948 | 91,949 | 91,950 |
| | 2-354 | 91,964 | 91,965 | 91,966 | 91,967 | 91,968 | 91,969 | 91,970 | 91,971 | 91,972 | 91,973 | 91,974 | 91,975 |
| | 2-355 | 91,989 | 91,990 | 91,991 | 91,992 | 91,993 | 91,994 | 91,995 | 91,996 | 91,997 | 91,998 | 91,999 | 92,000 |
| | 2-356 | 92,014 | 92,015 | 92,016 | 92,017 | 92,018 | 92,019 | 92,020 | 92,021 | 92,022 | 92,023 | 92,024 | 92,025 |
| | 2-357 | 92,039 | 92,040 | 92,041 | 92,042 | 92,043 | 92,044 | 92,045 | 92,046 | 92,047 | 92,048 | 92,049 | 92,050 |
| | 2-358 | 92,064 | 92,065 | 92,066 | 92,067 | 92,068 | 92,069 | 92,070 | 92,071 | 92,072 | 92,073 | 92,074 | 92,075 |
| | 2-359 | 92,089 | 92,090 | 92,091 | 92,092 | 92,093 | 92,094 | 92,095 | 92,096 | 92,097 | 92,098 | 92,099 | 92,100 |
| | 2-360 | 92,114 | 92,115 | 92,116 | 92,117 | 92,118 | 92,119 | 92,120 | 92,121 | 92,122 | 92,123 | 92,124 | 92,125 |
| | 2-361 | 92,139 | 92,140 | 92,141 | 92,142 | 92,143 | 92,144 | 92,145 | 92,146 | 92,147 | 92,148 | 92,149 | 92,150 |
| | 2-362 | 92,164 | 92,165 | 92,166 | 92,167 | 92,168 | 92,169 | 92,170 | 92,171 | 92,172 | 92,173 | 92,174 | 92,175 |
| | 2-363 | 92,189 | 92,190 | 92,191 | 92,192 | 92,193 | 92,194 | 92,195 | 92,196 | 92,197 | 92,198 | 92,199 | 92,200 |
| | 2-364 | 92,214 | 92,215 | 92,216 | 92,217 | 92,218 | 92,219 | 92,220 | 92,221 | 92,222 | 92,223 | 92,224 | 92,225 |
| | 2-365 | 92,239 | 92,240 | 92,241 | 92,242 | 92,243 | 92,244 | 92,245 | 92,246 | 92,247 | 92,248 | 92,249 | 92,250 |
| | 2-366 | 92,264 | 92,265 | 92,266 | 92,267 | 92,268 | 92,269 | 92,270 | 92,271 | 92,272 | 92,273 | 92,274 | 92,275 |
| | 2-367 | 92,289 | 92,290 | 92,291 | 92,292 | 92,293 | 92,294 | 92,295 | 92,296 | 92,297 | 92,298 | 92,299 | 92,300 |
| | 2-368 | 92,314 | 92,315 | 92,316 | 92,317 | 92,318 | 92,319 | 92,320 | 92,321 | 92,322 | 92,323 | 92,324 | 92,325 |
| | 2-369 | 92,339 | 92,340 | 92,341 | 92,342 | 92,343 | 92,344 | 92,345 | 92,346 | 92,347 | 92,348 | 92,349 | 92,350 |
| | 2-370 | 92,364 | 92,365 | 92,366 | 92,367 | 92,368 | 92,369 | 92,370 | 92,371 | 92,372 | 92,373 | 92,374 | 92,375 |
| | 2-371 | 92,389 | 92,390 | 92,391 | 92,392 | 92,393 | 92,394 | 92,395 | 92,396 | 92,397 | 92,398 | 92,399 | 92,400 |
| | 2-372 | 92,414 | 92,415 | 92,416 | 92,417 | 92,418 | 92,419 | 92,420 | 92,421 | 92,422 | 92,423 | 92,424 | 92,425 |
| | 2-373 | 92,439 | 92,440 | 92,441 | 92,442 | 92,443 | 92,444 | 92,445 | 92,446 | 92,447 | 92,448 | 92,449 | 92,450 |
| | 2-374 | 92,464 | 92,465 | 92,46 | 92,467 | 92,468 | 92,469 | 92,470 | 92,471 | 92,472 | 92,473 | 92,474 | 92,475 |
| | 2-375 | 92,489 | 92,490 | 92,491 | 92,492 | 92,493 | 92,494 | 92,495 | 92,496 | 92,497 | 92,498 | 92,499 | 92,500 |
| | 2-376 | 92,514 | 92,515 | 92,516 | 92,517 | 92,518 | 92,519 | 92,520 | 92,521 | 92,522 | 92,523 | 92,524 | 92,525 |
| | 2-377 | 92,539 | 92,540 | 92,541 | 92,542 | 92,543 | 92,544 | 92,545 | 92546 | 92,547 | 92,548 | 92,549 | 92,550 |
| | 2-378 | 92,564 | 92,565 | 92,566 | 92,567 | 92,568 | 92,568 | 92,570 | 92,571 | 92,572 | 92,573 | 92,574 | 92,575 |
| | 2-379 | 92,589 | 92,590 | 92,591 | 92,592 | 92,593 | 92,594 | 92,595 | 92,596 | 92,597 | 92,598 | 92,599 | 92,600 |
| | 2-380 | 92,614 | 92,615 | 92,616 | 92,617 | 92,618 | 92,619 | 92,620 | 92,621 | 92,622 | 92,623 | 92,624 | 92,625 |
| | 2-381 | 92,639 | 92,640 | 92,641 | 92,642 | 92,643 | 92,644 | 92,645 | 92,646 | 92,647 | 92,648 | 92,649 | 92,650 |
| | 2-382 | 92,664 | 92,665 | 92,666 | 92,667 | 92,668 | 92,669 | 92,670 | 92,671 | 92,672 | 92,673 | 92,674 | 92,675 |
| | 2-383 | 92,689 | 92,690 | 92,691 | 92,692 | 92,693 | 92,694 | 92,595 | 92,696 | 92,697 | 92,698 | 92,699 | 92,700 |
| | 2-384 | 92,714 | 92,715 | 92,716 | 92,717 | 92,718 | 92,719 | 92,720 | 92,721 | 92,722 | 92,723 | 92,724 | 92,725 |
| | 2-385 | 92,739 | 92,740 | 92,741 | 92,742 | 92,743 | 92,744 | 92,745 | 92,746 | 92,747 | 92,748 | 92,749 | 92,750 |

TABLE 71

| | | Compound represented by the formula (1) | | | | | | | | | | | | |
|---|---|---|---|---|---|---|---|---|---|---|---|---|---|---|
| | | 1-176 | 1-177 | 1-178 | 1-179 | 1-180 | 1-181 | 1-182 | 1-183 | 1-184 | 1-185 | 1-186 | 1-187 | 1-188 |
| Compound | 2-386 | 92,751 | 92,752 | 92,753 | 92,754 | 92,755 | 92,756 | 92,757 | 92,758 | 92,759 | 92,760 | 92,761 | 92,762 | 92,763 |
| represented | 2-387 | 92,776 | 92,777 | 92,778 | 92,779 | 92,780 | 92,781 | 92,782 | 92,783 | 92,784 | 92,785 | 92,786 | 92,787 | 92,788 |
| by the | 2-388 | 92,801 | 92,802 | 92,803 | 92,804 | 92,805 | 92,806 | 92,807 | 92,808 | 92,809 | 92,810 | 92,811 | 92,812 | 92,813 |
| formula | 2-389 | 92,826 | 92,827 | 92,828 | 92,829 | 92,830 | 92,831 | 92,832 | 92,833 | 92,834 | 92,835 | 92,836 | 92,837 | 92,838 |
| (2) | 2-390 | 92,851 | 92,852 | 92,853 | 92,854 | 92,855 | 92,856 | 92,857 | 92,858 | 92,859 | 92,860 | 92,861 | 92,862 | 92,863 |
| | 2-391 | 92,876 | 92,877 | 92,878 | 92,879 | 92,880 | 92,881 | 92,882 | 92,883 | 92,884 | 92,885 | 92,886 | 92,887 | 92,888 |
| | 2-392 | 92,901 | 92,902 | 92,903 | 92,904 | 92,905 | 92,906 | 92,907 | 92,908 | 92,909 | 92,910 | 92,911 | 92,912 | 92,913 |
| | 2-393 | 92,926 | 92,927 | 92,928 | 92,929 | 92,930 | 92,931 | 92,932 | 92,933 | 92,934 | 92,935 | 92,936 | 92,937 | 92,938 |
| | 2-394 | 92,951 | 92,952 | 92,953 | 92,954 | 92,955 | 92,956 | 92,957 | 92,958 | 92,959 | 92,960 | 92,961 | 92,962 | 92,963 |
| | 2-395 | 92,976 | 92,977 | 92,978 | 92,979 | 92,980 | 92,981 | 92,982 | 92,983 | 92,984 | 92,985 | 92,986 | 92,987 | 92,988 |
| | 2-396 | 93,001 | 93,002 | 93,003 | 93,004 | 93,005 | 93,006 | 93,007 | 93,008 | 93,009 | 93,010 | 93,011 | 93,012 | 93,013 |
| | 2-397 | 93,026 | 93,027 | 93,028 | 93,029 | 93,030 | 93,031 | 93,032 | 93,033 | 93,034 | 93,035 | 93,036 | 93,037 | 93,038 |
| | 2-398 | 93,051 | 93,052 | 93,053 | 93,054 | 93,055 | 93,056 | 93,057 | 93,058 | 93,059 | 93,060 | 93,061 | 93,062 | 93,063 |
| | 2-399 | 93,076 | 93,077 | 93,078 | 93,079 | 93,080 | 93,081 | 93,082 | 93,083 | 93,084 | 93,085 | 93,086 | 93,087 | 93,088 |
| | 2-400 | 93,101 | 93,102 | 93,103 | 93,104 | 93,105 | 93,106 | 93,107 | 93,108 | 93,109 | 93,110 | 93,111 | 93,112 | 93,113 |
| | 2-401 | 93,126 | 93,127 | 93,128 | 93,129 | 93,130 | 93,131 | 93,132 | 93,133 | 93,134 | 93,135 | 93,136 | 93,137 | 93,138 |
| | 2-402 | 93,151 | 93,152 | 93,153 | 93,154 | 93,155 | 93,156 | 93,157 | 93,158 | 93,159 | 93,160 | 93,161 | 93,162 | 93,163 |
| | 2-403 | 93,176 | 93,177 | 93,178 | 93,179 | 93,180 | 93,181 | 93,182 | 93,183 | 93,184 | 93,185 | 93,186 | 93,187 | 93,188 |
| | 2-404 | 93,201 | 93,202 | 93,203 | 93,204 | 93,205 | 93,206 | 93,207 | 93,208 | 93,209 | 93,210 | 93,211 | 93,212 | 93,213 |
| | 2-405 | 93,226 | 93,227 | 93,228 | 93,229 | 93,230 | 93,231 | 93,232 | 93,233 | 93,234 | 93,235 | 93,236 | 93,237 | 93,238 |
| | 2-406 | 93,251 | 93,252 | 93,253 | 93,254 | 93,255 | 93,256 | 93,257 | 93,258 | 93,259 | 93,260 | 93,261 | 93,262 | 93,263 |
| | 2-407 | 93,276 | 93,277 | 93,278 | 93,279 | 93,280 | 93,281 | 93,282 | 93,283 | 93,284 | 93,285 | 93,286 | 93,287 | 93,288 |
| | 2-408 | 93,301 | 93,302 | 93,303 | 93,304 | 93,305 | 93,306 | 93,307 | 93,308 | 93,309 | 93,310 | 93,311 | 93,312 | 93,313 |
| | 2-409 | 93,326 | 93,327 | 93,328 | 93,329 | 93,330 | 93,331 | 93,332 | 93,333 | 93,334 | 93,335 | 93,336 | 93,337 | 93,338 |
| | 2-410 | 93,351 | 93,352 | 93,353 | 93,354 | 93,355 | 93,356 | 93,357 | 93,358 | 93,359 | 93,360 | 93,361 | 93,362 | 93,363 |
| | 2-411 | 93,376 | 93,377 | 93,378 | 93,379 | 93,380 | 93,381 | 93,382 | 93,383 | 93,384 | 93,385 | 93,386 | 93,387 | 93,388 |
| | 2-412 | 93,401 | 93,402 | 93,403 | 93,404 | 93,405 | 93,406 | 93,407 | 93,408 | 93,409 | 93,410 | 93,411 | 93,412 | 93,413 |
| | 2-413 | 93,426 | 93,427 | 93,428 | 93,429 | 93,430 | 93,431 | 93,432 | 93,433 | 93,434 | 93,435 | 93,436 | 93,437 | 93,438 |
| | 2-414 | 93,451 | 93,452 | 93,453 | 93,454 | 93,455 | 93,456 | 93,457 | 93,458 | 93,459 | 93,460 | 93,461 | 93,462 | 93,463 |
| | 2-415 | 93,476 | 93,477 | 93,478 | 93,479 | 93,480 | 93,481 | 93,482 | 93,483 | 93,484 | 93,485 | 93,486 | 93,487 | 93,488 |
| | 2-416 | 93,501 | 93,502 | 93,503 | 93,504 | 93,505 | 93,506 | 93,507 | 93,508 | 93,509 | 93,510 | 93,511 | 93,512 | 93,513 |
| | 2-417 | 93,526 | 93,527 | 93,528 | 93,529 | 93,530 | 93,531 | 93,532 | 93,533 | 93,534 | 93,535 | 93,536 | 93,537 | 93,538 |
| | 2-418 | 93,551 | 93,552 | 93,553 | 93,554 | 93,555 | 93,556 | 93,557 | 93,558 | 93,559 | 93,560 | 93,561 | 93,562 | 93,563 |
| | 2-419 | 93,576 | 93,577 | 93,578 | 93,579 | 93,580 | 93,581 | 93,582 | 93,583 | 93,584 | 93,585 | 93,586 | 93,587 | 93,588 |
| | 2-420 | 93,601 | 93,602 | 93,603 | 93,604 | 93,605 | 93,606 | 93,607 | 93,608 | 93,609 | 93,610 | 93,611 | 93,612 | 93,613 |
| | 2-421 | 93,626 | 93,627 | 93,628 | 93,629 | 93,630 | 93,631 | 93,632 | 93,633 | 93,634 | 93,635 | 93,636 | 93,637 | 93,638 |
| | 2-422 | 93,651 | 93,652 | 93,653 | 93,654 | 93,655 | 93,656 | 93,657 | 93,658 | 93,659 | 93,660 | 93,661 | 93,662 | 93,663 |
| | 2-423 | 93,676 | 93,677 | 93,678 | 93,679 | 93,680 | 93,681 | 93,685 | 93,683 | 93,684 | 93,685 | 93,686 | 93,687 | 93,688 |
| | 2-424 | 93,701 | 93,702 | 93,703 | 93,704 | 93,705 | 93,706 | 93,707 | 93,708 | 93,709 | 93,710 | 93,711 | 93,712 | 93,713 |
| | 2-425 | 93,726 | 93,727 | 93,728 | 93,729 | 93,730 | 93,731 | 93,732 | 93,733 | 93,734 | 93,735 | 93,736 | 93,737 | 93,738 |
| | 2-426 | 93,751 | 93,752 | 93,753 | 93,754 | 93,755 | 93,756 | 93,757 | 93,758 | 93,759 | 93,760 | 93,761 | 93,762 | 93,763 |
| | 2-427 | 93,776 | 93,777 | 93,778 | 93,779 | 93,780 | 93,781 | 93,782 | 93,783 | 93,784 | 93,785 | 93,786 | 93,787 | 93,788 |
| | 2-428 | 93,801 | 93,802 | 93,803 | 93,804 | 93,805 | 93,806 | 93,807 | 93,808 | 93,809 | 93,810 | 93,811 | 93,812 | 93,813 |
| | 2-429 | 93,826 | 93,827 | 93,828 | 93,829 | 93,830 | 93,831 | 93,832 | 93,833 | 93,834 | 93,835 | 93,836 | 93,837 | 93,838 |
| | 2-430 | 93,851 | 93,852 | 93,853 | 93,854 | 93,855 | 93,856 | 93,857 | 93,858 | 93,859 | 93,860 | 93,861 | 93,862 | 93,863 |
| | 2-431 | 93,876 | 93,877 | 93,878 | 93,879 | 93,880 | 93,881 | 93,882 | 93,883 | 93,884 | 93,885 | 93,886 | 93,887 | 93,888 |
| | 2-432 | 93,901 | 93,902 | 93,903 | 93,904 | 93,905 | 93,906 | 93,907 | 93,908 | 93,909 | 93,910 | 93,911 | 93,912 | 93,913 |
| | 2-433 | 93,926 | 93,927 | 93,928 | 93,929 | 93,930 | 93,931 | 93,932 | 93,933 | 93,934 | 93,935 | 93,936 | 93,937 | 93,938 |
| | 2-434 | 93,951 | 93,952 | 93,953 | 93,954 | 93,955 | 93,956 | 93,957 | 93,958 | 93,959 | 93,960 | 93,961 | 93,962 | 93,963 |
| | 2-435 | 94,976 | 93,977 | 93,978 | 93,979 | 93,980 | 93,981 | 93,982 | 93,983 | 93,984 | 93,985 | 93,986 | 93,987 | 93,988 |
| | 2-436 | 94,001 | 94,002 | 94,003 | 94,004 | 94,005 | 94,006 | 94,007 | 94,008 | 94,009 | 94,010 | 94,011 | 94,012 | 94,013 |
| | 2-437 | 94,026 | 94,027 | 94,028 | 94,029 | 94,030 | 94,031 | 94,032 | 94,033 | 94,034 | 94,035 | 94,036 | 94,037 | 94,038 |
| | 2-438 | 94,051 | 94,052 | 94,053 | 94,054 | 94,055 | 94,056 | 94,057 | 94,058 | 94,059 | 94,060 | 94,061 | 94,062 | 94,063 |
| | 2-439 | 94,076 | 94,077 | 94,078 | 94,079 | 94,080 | 94,081 | 94,082 | 94,083 | 94,084 | 94,085 | 94,086 | 94,087 | 94,088 |
| | 2-440 | 94,101 | 94,102 | 94,103 | 94,104 | 94,105 | 94,106 | 94,107 | 94,108 | 94,109 | 94,110 | 94,111 | 94,112 | 94,113 |

| | | 1-189 | 1-190 | 1-191 | 1-192 | 1-193 | 1-194 | 1-195 | 1-196 | 1-197 | 1-198 | 1-199 | 1-200 |
|---|---|---|---|---|---|---|---|---|---|---|---|---|---|
| Compound | 2-386 | 92,764 | 92,765 | 92,766 | 92,767 | 92,768 | 92,769 | 92,770 | 92,771 | 92,772 | 92,773 | 92,774 | 92,775 |
| represented | 2-387 | 92,789 | 92,790 | 92,791 | 92,792 | 92,793 | 92,794 | 92,795 | 92,796 | 92,797 | 92,798 | 92,799 | 92,800 |
| by the | 2-388 | 92,814 | 92,815 | 92,816 | 92,817 | 92,818 | 92,819 | 92,820 | 92,821 | 92,822 | 92,823 | 92,824 | 92,825 |
| formula | 2-389 | 92,839 | 92,840 | 92,841 | 92,842 | 92,843 | 92,844 | 92,845 | 92,846 | 92,847 | 92,848 | 92,849 | 92,850 |
| (2) | 2-390 | 92,864 | 92,865 | 92,866 | 92,867 | 92,868 | 92,869 | 92,870 | 92,871 | 92,872 | 92,873 | 92,874 | 92,875 |
| | 2-391 | 92,889 | 92,890 | 92,891 | 92,892 | 92,893 | 92,894 | 92,895 | 92,896 | 92,897 | 92,898 | 92,899 | 92,900 |
| | 2-392 | 92,914 | 92,915 | 92,916 | 92,917 | 92,918 | 92,919 | 92,920 | 92,921 | 92,922 | 92,923 | 92,924 | 92,925 |
| | 2-393 | 92,939 | 92,940 | 92,941 | 92,942 | 92,943 | 92,944 | 92,945 | 92,946 | 92,947 | 92,948 | 92,949 | 92,950 |
| | 2-394 | 92,964 | 92,965 | 92,966 | 92,967 | 92,968 | 92,969 | 92,970 | 92,971 | 92,972 | 92,973 | 92,974 | 92,975 |
| | 2-395 | 92,989 | 92,990 | 92,991 | 92,992 | 92,993 | 92,994 | 92,995 | 92,996 | 92,997 | 92,998 | 92,999 | 93,000 |
| | 2-396 | 93,014 | 93,015 | 93,016 | 93,017 | 93,018 | 93,019 | 93,020 | 93,021 | 93,022 | 93,023 | 93,024 | 93,025 |
| | 2-397 | 93,039 | 93,040 | 93,041 | 93,042 | 93,043 | 93,044 | 93,045 | 93,046 | 93,047 | 93,048 | 93,049 | 93,050 |
| | 2-398 | 93,064 | 93,065 | 93,066 | 93,067 | 93,068 | 93,069 | 93,070 | 93,071 | 93,072 | 93,073 | 93,074 | 93,075 |
| | 2-399 | 93,089 | 93,090 | 93,091 | 93,092 | 93,093 | 93,094 | 93,095 | 93,096 | 93,097 | 93,098 | 93,099 | 93,100 |
| | 2-400 | 93,114 | 93,115 | 93,116 | 93,117 | 93,118 | 93,119 | 93,120 | 93,121 | 93,122 | 93,123 | 93,124 | 93,125 |
| | 2-401 | 93,139 | 93,140 | 93,141 | 93,142 | 93,143 | 93,144 | 93,145 | 93,146 | 93,147 | 93,148 | 93,149 | 93,150 |
| | 2-402 | 93,164 | 93,165 | 93,166 | 93,167 | 93,168 | 93,169 | 93,170 | 93,171 | 93,172 | 93,173 | 93,174 | 93,175 |

TABLE 71-continued

| | | | | | | | | | | | | |
|---|---|---|---|---|---|---|---|---|---|---|---|---|
| 2-403 | 93,189 | 93,190 | 93,191 | 93,192 | 93,193 | 93,194 | 93,195 | 93,196 | 93,197 | 93,198 | 93,199 | 93,200 |
| 2-404 | 93,214 | 93,215 | 93,216 | 93,217 | 93,218 | 93,219 | 93,220 | 93,221 | 93,222 | 93,223 | 93,224 | 93,225 |
| 2-405 | 93,239 | 93,240 | 93,241 | 93,242 | 93,243 | 93,244 | 93,245 | 93,246 | 93,247 | 93,248 | 93,249 | 93,250 |
| 2-406 | 93,264 | 93,265 | 93,266 | 93,267 | 93,268 | 93,269 | 93,270 | 93,271 | 93,272 | 93,273 | 93,274 | 93,275 |
| 2-407 | 93,289 | 93,290 | 93,291 | 93,292 | 93,293 | 93,294 | 93,295 | 93,296 | 93,297 | 93,298 | 93,299 | 93,300 |
| 2-408 | 93,314 | 93,315 | 93,316 | 93,317 | 93,318 | 93,319 | 93,320 | 93,321 | 93,322 | 93,323 | 93,324 | 93,325 |
| 2-409 | 93,339 | 93,340 | 93,341 | 93,342 | 93,343 | 93,344 | 93,345 | 93,346 | 93,347 | 93,348 | 93,349 | 93,350 |
| 2-410 | 93,364 | 93,365 | 93,366 | 93,367 | 93,368 | 93,369 | 93,370 | 93,371 | 93,372 | 93,373 | 93,374 | 93,375 |
| 2-411 | 93,389 | 93,390 | 93,391 | 93,392 | 93,393 | 93,394 | 93,395 | 93,396 | 93,397 | 93,398 | 93,399 | 93,400 |
| 2-412 | 93,414 | 93,415 | 93,416 | 93,417 | 93,418 | 93,419 | 93,420 | 93,421 | 93,422 | 93,423 | 93,424 | 93,425 |
| 2-413 | 93,439 | 93,440 | 93,441 | 93,442 | 93,443 | 93,444 | 93,445 | 93,446 | 93,447 | 93,448 | 93,449 | 93,450 |
| 2-414 | 93,464 | 93,465 | 93,466 | 93,467 | 93,468 | 93,469 | 93,470 | 93,471 | 93,472 | 93,473 | 93,474 | 93,475 |
| 2-415 | 93,489 | 93,490 | 93,491 | 93,492 | 93,493 | 93,494 | 93,495 | 93,496 | 93,497 | 93,498 | 93,499 | 93,500 |
| 2-416 | 93,514 | 93,515 | 93,516 | 93,517 | 93,518 | 93,519 | 93,520 | 93,521 | 93,522 | 93,523 | 93,524 | 93,525 |
| 2-417 | 93,539 | 93,540 | 93,541 | 93,542 | 93,543 | 93,544 | 93,545 | 93,546 | 93,547 | 93,548 | 93,549 | 93,550 |
| 2-418 | 93,564 | 93,565 | 93,566 | 93,567 | 93,568 | 93,569 | 93,570 | 93,571 | 93,572 | 93,573 | 93,574 | 93,575 |
| 2-419 | 93,589 | 93,590 | 93,591 | 93,592 | 93,593 | 93,594 | 93,595 | 93,596 | 93,597 | 93,598 | 93,599 | 93,600 |
| 2-420 | 93,614 | 93,615 | 93,616 | 93,617 | 93,618 | 93,619 | 93,620 | 93,621 | 93,622 | 93,623 | 93,624 | 93,625 |
| 2-421 | 93,639 | 93,640 | 93,641 | 93,642 | 93,643 | 93,644 | 93,645 | 93,646 | 93,647 | 93,648 | 93,649 | 93,650 |
| 2-422 | 93,664 | 93,665 | 93,666 | 93,667 | 93,668 | 93,669 | 93,670 | 93,671 | 93,672 | 93,673 | 93,674 | 93,675 |
| 2-423 | 93,689 | 93,690 | 93,691 | 93,692 | 93,693 | 93,694 | 93,695 | 93,696 | 93,697 | 93,698 | 93,699 | 93,700 |
| 2-424 | 93,714 | 93,715 | 93,716 | 93,717 | 93,718 | 93,719 | 93,720 | 93,721 | 93,722 | 93,723 | 93,724 | 93,725 |
| 2-425 | 93,739 | 93,740 | 93,741 | 93,742 | 93,743 | 93,744 | 93,745 | 93,746 | 93,747 | 93,748 | 93,749 | 93,750 |
| 2-426 | 93,764 | 93,765 | 93,766 | 93,767 | 93,768 | 93,769 | 93,770 | 93,771 | 93,772 | 93,773 | 93,774 | 93,775 |
| 2-427 | 93,789 | 93,790 | 93,791 | 93,792 | 93,793 | 93,794 | 93,795 | 93,796 | 93,797 | 93,798 | 93,799 | 93,800 |
| 2-428 | 93,814 | 93,815 | 93,816 | 93,817 | 93,818 | 93,819 | 93,820 | 93,821 | 93,822 | 93,823 | 93,824 | 93,825 |
| 2-429 | 93,839 | 93,840 | 93,841 | 93,842 | 93,843 | 93,844 | 93,845 | 93,846 | 93,847 | 93,848 | 93,849 | 93,850 |
| 2-430 | 93,864 | 93,865 | 93,866 | 93,867 | 93,868 | 93,869 | 93,870 | 93,871 | 93,872 | 93,873 | 93,874 | 93,875 |
| 2-431 | 93,889 | 93,890 | 93,891 | 93,892 | 93,893 | 93,894 | 93,895 | 93,896 | 93,897 | 93,898 | 93,899 | 93,900 |
| 2-432 | 93,914 | 93,915 | 93,916 | 93,917 | 93,918 | 93,919 | 93,920 | 93,921 | 93,922 | 93,923 | 93,924 | 93,925 |
| 2-433 | 93,939 | 93,940 | 93,941 | 93,942 | 93,943 | 93,944 | 93,945 | 93,946 | 93,947 | 93,948 | 93,949 | 93,950 |
| 2-434 | 93,964 | 93,965 | 93,966 | 93,967 | 93,968 | 93,969 | 93,970 | 93,971 | 93,972 | 93,973 | 93,974 | 93,975 |
| 2-435 | 93,989 | 93,990 | 93,991 | 93,992 | 93,993 | 93,994 | 93,995 | 93,996 | 93,997 | 93,998 | 93,999 | 94,000 |
| 2-436 | 94,014 | 94,015 | 94,016 | 94,017 | 94,018 | 94,019 | 94,020 | 94,021 | 94,022 | 94,023 | 94,024 | 94,025 |
| 2-437 | 94,039 | 94,040 | 94,041 | 94,042 | 94,043 | 94,044 | 94,045 | 94,046 | 94,047 | 94,048 | 94,049 | 94,050 |
| 2-438 | 94,064 | 94,065 | 94,066 | 94,067 | 94,068 | 94,069 | 94,070 | 94,071 | 94,072 | 94,073 | 94,074 | 94,075 |
| 2-439 | 94,089 | 94,090 | 94,091 | 94,092 | 94,093 | 94,094 | 94,095 | 94,096 | 94,097 | 94,098 | 94,099 | 94,100 |
| 2-440 | 94,114 | 94,115 | 94,116 | 94,117 | 94,118 | 94,119 | 94,120 | 94,121 | 94,122 | 94,123 | 94,124 | 94,125 |

TABLE 72

| | | Compound represented by the formula (1) | | | | | | | | | | | | |
|---|---|---|---|---|---|---|---|---|---|---|---|---|---|---|
| | | 1-176 | 1-177 | 1-178 | 1-179 | 1-180 | 1-181 | 1-182 | 1-183 | 1-184 | 1-185 | 1-186 | 1-187 | 1-188 |
| Compound represented by the formula (2) | 2-441 | 94,126 | 94,127 | 94,128 | 94,129 | 94,130 | 94,131 | 94,132 | 94,133 | 94,134 | 94,135 | 94,136 | 94,137 | 94,138 |
| | 2-442 | 94,151 | 94,152 | 94,153 | 94,154 | 94,155 | 94,156 | 94,157 | 94,158 | 94,159 | 94,160 | 94,161 | 94,162 | 94,163 |
| | 2-443 | 94,176 | 94,177 | 94,178 | 94,179 | 94,180 | 94,181 | 94,182 | 94,183 | 94,184 | 94,185 | 94,186 | 94,187 | 94,188 |
| | 2-444 | 94,201 | 94,202 | 94,203 | 94,204 | 94,205 | 94,206 | 94,207 | 94,208 | 94,209 | 94,210 | 94,211 | 94,212 | 94,213 |
| | 2-445 | 94,226 | 94,227 | 94,228 | 94,229 | 94,230 | 94,231 | 94,232 | 94,233 | 94,234 | 94,235 | 94,236 | 94,237 | 94,238 |
| | 2-446 | 94,251 | 94,252 | 94,253 | 94,254 | 94,255 | 94,256 | 94,257 | 94,258 | 94,259 | 94,260 | 94,261 | 94,262 | 94,263 |
| | 2-447 | 94,276 | 94,277 | 94,278 | 94,279 | 94,280 | 94,281 | 94,282 | 94,283 | 94,284 | 94,285 | 94,286 | 94,287 | 94,288 |
| | 2-448 | 94,301 | 94,302 | 94,303 | 94,304 | 94,305 | 94,306 | 94,307 | 94,308 | 94,309 | 94,310 | 94,311 | 94,312 | 94,313 |
| | 2-449 | 94,326 | 94,327 | 94,328 | 94,329 | 94,330 | 94,331 | 94,332 | 94,333 | 94,334 | 94,335 | 94,336 | 94,337 | 94,338 |
| | 2-450 | 94,351 | 94,352 | 94,353 | 94,354 | 94,355 | 94,356 | 94,357 | 94,358 | 94,359 | 94,360 | 94,361 | 94,362 | 94,363 |
| | 2-451 | 94,376 | 94,377 | 94,378 | 94,379 | 94,380 | 94,381 | 94,382 | 94,383 | 94,384 | 94,385 | 94,386 | 94,387 | 94,388 |
| | 2-452 | 94,401 | 94,402 | 94,403 | 94,404 | 94,405 | 94,406 | 94,407 | 94,408 | 94,409 | 94,410 | 94,411 | 94,412 | 94,413 |
| | 2-453 | 94,426 | 94,427 | 94,428 | 94,429 | 94,430 | 94,431 | 94,432 | 94,433 | 94,434 | 94,435 | 94,436 | 94,437 | 94,438 |
| | 2-454 | 94,451 | 94,452 | 94,453 | 94,454 | 94,455 | 94,456 | 94,457 | 94,458 | 94,459 | 94,460 | 94,461 | 94,462 | 94,463 |
| | 2-455 | 94,476 | 94,477 | 94,478 | 94,479 | 94,480 | 94,481 | 94,482 | 94,483 | 94,484 | 94,485 | 94,486 | 94,487 | 94,488 |
| | 2-456 | 94,501 | 94,502 | 94,503 | 94,504 | 94,505 | 94,506 | 94,507 | 94,508 | 94,509 | 94,510 | 94,511 | 94,512 | 94,513 |
| | 2-457 | 94,526 | 94,527 | 94,528 | 94,529 | 94,530 | 94,531 | 94,532 | 94,533 | 94,534 | 94,535 | 94,536 | 94,537 | 94,538 |
| | 2-458 | 94,551 | 94,552 | 94,553 | 94,554 | 94,555 | 94,556 | 94,557 | 94,558 | 94,559 | 94,560 | 94,561 | 94,562 | 94,563 |
| | 2-459 | 94,576 | 94,577 | 94,578 | 94,579 | 94,580 | 94,581 | 94,582 | 94,583 | 94,584 | 94,585 | 94,586 | 94,587 | 94,588 |
| | 2-460 | 94,601 | 94,602 | 94,603 | 94,604 | 94,605 | 94,606 | 94,607 | 94,608 | 94,609 | 94,610 | 94,611 | 94,612 | 94,613 |
| | 2-461 | 94,626 | 94,627 | 94,628 | 94,629 | 94,630 | 94,631 | 94,632 | 94,633 | 94,634 | 94,635 | 94,636 | 94,637 | 94,638 |
| | 2-462 | 94,651 | 94,652 | 94,653 | 94,654 | 94,655 | 94,656 | 94,657 | 94,658 | 94,659 | 94,660 | 94,661 | 94,662 | 94,663 |
| | 2-463 | 94,676 | 94,677 | 94,678 | 94,679 | 94,680 | 94,681 | 94,682 | 94,683 | 94,684 | 94,685 | 94,686 | 94,687 | 94,688 |
| | 2-464 | 94,701 | 94,702 | 94,703 | 94,704 | 94,705 | 94,706 | 94,707 | 94,708 | 94,709 | 94,710 | 94,711 | 94,712 | 94,713 |
| | 2-465 | 94,726 | 94,727 | 94,728 | 94,729 | 94,730 | 94,731 | 94,732 | 94,733 | 94,734 | 94,735 | 94,736 | 94,737 | 94,738 |
| | 2-466 | 94,751 | 94,752 | 94,753 | 94,754 | 94,755 | 94,756 | 94,757 | 94,758 | 94,759 | 94,760 | 94,761 | 94,762 | 94,763 |
| | 2-467 | 94,776 | 94,777 | 94,778 | 94,779 | 94,780 | 94,781 | 94,782 | 94,783 | 94,784 | 94,785 | 94,786 | 94,787 | 94,788 |
| | 2-468 | 94,801 | 94,802 | 94,803 | 94,804 | 94,805 | 94,806 | 94,807 | 94,808 | 94,809 | 94,810 | 94,811 | 94,812 | 94,813 |
| | 2-469 | 94,826 | 94,827 | 94,828 | 94,829 | 94,830 | 94,831 | 94,832 | 94,833 | 94,834 | 94,835 | 94,836 | 94,837 | 94,838 |
| | 2-470 | 94,851 | 94,852 | 94,853 | 94,854 | 94,855 | 94,856 | 94,857 | 94,858 | 94,859 | 94,860 | 94,861 | 94,862 | 94,863 |
| | 2-471 | 94,876 | 94,877 | 94,878 | 94,879 | 94,880 | 94,881 | 94,882 | 94,883 | 94,884 | 94,885 | 94,886 | 94,887 | 94,888 |
| | 2-472 | 94,901 | 94,902 | 94,903 | 94,904 | 94,905 | 94,906 | 94,907 | 94,908 | 94,909 | 94,910 | 94,911 | 94,912 | 94,913 |

TABLE 72-continued

| | | | | | | | | | | | | | |
|---|---|---|---|---|---|---|---|---|---|---|---|---|---|
| 2-473 | 94,926 | 94,927 | 94,928 | 94,929 | 94,930 | 94,931 | 94,932 | 94,933 | 94,934 | 94,935 | 94,936 | 94,937 | 94,938 |
| 2-474 | 94,951 | 94,952 | 94,953 | 94,954 | 94,955 | 94,956 | 94,957 | 94,958 | 94,959 | 94,960 | 94,961 | 94,962 | 94,963 |
| 2-475 | 94,976 | 94,977 | 94,978 | 94,979 | 94,980 | 94,981 | 94,982 | 94,983 | 94,984 | 94,985 | 94,986 | 94,987 | 94,988 |

| | | Compound represented by the formula (1) | | | | | | | | | | | |
|---|---|---|---|---|---|---|---|---|---|---|---|---|---|
| | | 1-189 | 1-190 | 1-191 | 1-192 | 1-193 | 1-194 | 1-195 | 1-196 | 1-197 | 1-198 | 1-199 | 1-200 |
| Compound represented by the formula (2) | 2-441 | 94,139 | 94,140 | 94,141 | 94,142 | 94,143 | 94,144 | 94,145 | 94,146 | 94,147 | 94,148 | 94,149 | 94,150 |
| | 2-442 | 94,164 | 94,165 | 94,166 | 94,167 | 94,168 | 94,169 | 94,170 | 94,171 | 94,172 | 94,173 | 94,174 | 94,175 |
| | 2-443 | 94,189 | 94,190 | 94,191 | 94,192 | 94,193 | 94,194 | 94,195 | 94,196 | 94,197 | 94,198 | 94,199 | 94,200 |
| | 2-444 | 94,214 | 94,215 | 94,216 | 94,217 | 94,218 | 94,219 | 94,220 | 94,221 | 94,222 | 94,223 | 94,224 | 94,225 |
| | 2-445 | 94,239 | 94,240 | 94,241 | 94,242 | 94,243 | 94,244 | 94,245 | 94,246 | 94,247 | 94,248 | 94,249 | 94,250 |
| | 2-446 | 94,264 | 94,265 | 94,266 | 94,267 | 94,268 | 94,269 | 94,270 | 94,271 | 94,272 | 94,273 | 94,274 | 94,275 |
| | 2-447 | 94,289 | 94,290 | 94,291 | 94,292 | 94,293 | 94,294 | 94,295 | 94,296 | 94,297 | 94,298 | 94,299 | 94,300 |
| | 2-448 | 94,314 | 94,315 | 94,316 | 94,317 | 94,318 | 94,319 | 94,320 | 94,321 | 94,322 | 94,323 | 94,324 | 94,325 |
| | 2-449 | 94,339 | 94,340 | 94,341 | 94,342 | 94,343 | 94,344 | 94,345 | 94,346 | 94,347 | 94,348 | 94,349 | 94,350 |
| | 2-450 | 94,364 | 94,365 | 94,366 | 94,367 | 94,368 | 94,369 | 94,370 | 94,371 | 94,372 | 94,373 | 94,374 | 94,375 |
| | 2-451 | 94,389 | 94,390 | 94,391 | 94,392 | 94,393 | 94,394 | 94,395 | 94,396 | 94,397 | 94,398 | 94,399 | 94,400 |
| | 2-452 | 94,414 | 94,415 | 94,416 | 94,417 | 94,418 | 94,419 | 94,420 | 94,421 | 94,422 | 94,423 | 94,424 | 94,425 |
| | 2-453 | 94,439 | 94,440 | 94,441 | 94,442 | 94,443 | 94,444 | 94,445 | 94,446 | 94,447 | 94,448 | 94,449 | 94,450 |
| | 2-454 | 94,464 | 94,465 | 94,466 | 94,467 | 94,468 | 94,469 | 94,470 | 94,471 | 94,472 | 94,473 | 94,474 | 94,475 |
| | 2-455 | 94,489 | 94,490 | 94,491 | 94,492 | 94,493 | 94,494 | 94,495 | 94,496 | 94,497 | 94,498 | 94,499 | 94,500 |
| | 2-456 | 94,514 | 94,515 | 94,516 | 94,517 | 94,518 | 94,519 | 94,520 | 94,521 | 94,522 | 94,523 | 94,524 | 94,525 |
| | 2-457 | 94,539 | 94,540 | 94,541 | 94,542 | 94,543 | 94,544 | 94,545 | 94,546 | 94,547 | 94,548 | 94,549 | 94,550 |
| | 2-458 | 94,564 | 94,565 | 94,566 | 94,567 | 94,568 | 94,569 | 94,570 | 94,571 | 94,572 | 94,573 | 94,574 | 94,575 |
| | 2-459 | 94,589 | 94,590 | 94,591 | 94,592 | 94,593 | 94,594 | 94,595 | 94,596 | 94,597 | 94,598 | 94,599 | 94,600 |
| | 2-460 | 94,614 | 94,615 | 94,616 | 94,617 | 94,618 | 94,619 | 94,620 | 94,621 | 94,622 | 94,623 | 94,624 | 94,625 |
| | 2-461 | 94,639 | 94,640 | 94,641 | 94,642 | 94,643 | 94,644 | 94,645 | 94,646 | 94,647 | 94,648 | 94,649 | 94,650 |
| | 2-462 | 94,664 | 94,665 | 94,666 | 94,667 | 94,668 | 94,669 | 94,670 | 94,671 | 94,672 | 94,673 | 94,674 | 94,675 |
| | 2-463 | 94,689 | 94,690 | 94,691 | 94,692 | 94,693 | 94,694 | 94,695 | 94,696 | 94,697 | 94,698 | 94,699 | 94,700 |
| | 2-464 | 94,714 | 94,715 | 94,716 | 94,717 | 94,718 | 94,719 | 94,720 | 94,721 | 94,722 | 94,723 | 94,724 | 94,725 |
| | 2-465 | 94,739 | 94,740 | 94,741 | 94,742 | 94,743 | 94,744 | 94,745 | 94,746 | 94,747 | 94,748 | 94,749 | 94,750 |
| | 2-466 | 94,764 | 94,765 | 94,766 | 94,767 | 94,768 | 94,769 | 94,770 | 94,771 | 94,772 | 94,773 | 94,774 | 94,775 |
| | 2-467 | 94,789 | 94,790 | 94,791 | 94,792 | 94,793 | 94,794 | 94,795 | 94,796 | 94,797 | 94,798 | 94,799 | 94,800 |
| | 2-468 | 94,814 | 94,815 | 94,816 | 94,817 | 94,818 | 94,819 | 94,820 | 94,821 | 94,822 | 94,823 | 94,824 | 94,825 |
| | 2-469 | 94,839 | 94,840 | 94,841 | 94,842 | 94,843 | 94,844 | 94,845 | 94,846 | 94,847 | 94,848 | 94,849 | 94,850 |
| | 2-470 | 94,864 | 94,865 | 94,866 | 94,867 | 94,868 | 94,869 | 94,870 | 94,871 | 94,872 | 94,873 | 94,874 | 94,875 |
| | 2-471 | 94,889 | 94,890 | 94,891 | 94,892 | 94,893 | 94,894 | 94,895 | 94,896 | 94,897 | 94,898 | 94,899 | 94,900 |
| | 2-472 | 94,914 | 94,915 | 94,916 | 94,917 | 94,918 | 94,919 | 94,920 | 94,921 | 94,922 | 94,923 | 94,924 | 94,925 |
| | 2-473 | 94,939 | 94,940 | 94,941 | 94,942 | 94,943 | 94,944 | 94,945 | 94,946 | 94,947 | 94,948 | 94,949 | 94,950 |
| | 2-474 | 94,964 | 94,965 | 94,966 | 94,967 | 94,968 | 94,969 | 94,970 | 94,971 | 94,972 | 94,973 | 94,974 | 94,975 |
| | 2-475 | 94,989 | 94,990 | 94,991 | 94,992 | 94,993 | 94,994 | 94,995 | 94,996 | 94,997 | 94,998 | 94,999 | 95,000 |

TABLE 73

| | | Compound represented by the formula (1) | | | | | | | |
|---|---|---|---|---|---|---|---|---|---|
| | | 1-201 | 1-202 | 1-203 | 1-204 | 1-205 | 1-206 | 1-207 | 1-208 |
| Compound represented by the formula (2) | 2-1 | 95,001 | 95,002 | 95,003 | 95,004 | 95,005 | 95,006 | 95,007 | 95,008 |
| | 2-2 | 95,017 | 95,018 | 95,019 | 95,020 | 95,021 | 95,022 | 95,023 | 95,024 |
| | 2-3 | 95,033 | 95,034 | 95,035 | 95,036 | 95,037 | 95,038 | 95,039 | 95,040 |
| | 2-4 | 95,049 | 95,050 | 95,051 | 95,052 | 95,053 | 95,054 | 95,055 | 95,056 |
| | 2-5 | 95,065 | 95,066 | 95,067 | 95,068 | 95,069 | 95,070 | 95,071 | 95,072 |
| | 2-6 | 95,081 | 95,082 | 95,083 | 95,084 | 95,085 | 95,086 | 95,087 | 95,088 |
| | 2-7 | 95,097 | 95,098 | 95,099 | 95,100 | 95,101 | 95,102 | 95,103 | 95,104 |
| | 2-8 | 95,113 | 95,114 | 95,115 | 95,116 | 95,117 | 95,118 | 95,119 | 95,120 |
| | 2-9 | 95,129 | 95,130 | 95,131 | 95,132 | 95,133 | 95,134 | 95,135 | 95,136 |
| | 2-10 | 95,145 | 95,146 | 95,147 | 95,148 | 95,149 | 95,150 | 95,151 | 95,152 |
| | 2-11 | 95,161 | 95,162 | 95,163 | 95,164 | 95,165 | 95,166 | 95,167 | 95,168 |
| | 2-12 | 95,177 | 95,178 | 95,179 | 95,180 | 95,181 | 95,182 | 95,183 | 95,184 |
| | 2-13 | 95,193 | 95,194 | 95,195 | 95,196 | 95,197 | 95,198 | 95,199 | 95,200 |
| | 2-14 | 95,209 | 95,210 | 95,211 | 95,212 | 95,213 | 95,214 | 95,215 | 95,216 |
| | 2-15 | 95,225 | 95,226 | 95,227 | 95,228 | 95,229 | 95,230 | 95,231 | 95,232 |
| | 2-16 | 95,241 | 95,242 | 95,243 | 95,244 | 95,245 | 95,246 | 95,247 | 95,248 |
| | 2-17 | 95,257 | 95,258 | 95,259 | 95,260 | 95,261 | 95,262 | 95,263 | 95,264 |
| | 2-18 | 95,273 | 95,274 | 95,275 | 95,276 | 95,277 | 95,278 | 95,279 | 95,280 |
| | 2-19 | 95,289 | 95,290 | 95,291 | 95,292 | 95,293 | 95,294 | 95,295 | 95,296 |
| | 2-20 | 95,305 | 95,306 | 95,307 | 95,308 | 95,309 | 95,310 | 95,311 | 95,312 |
| | 2-21 | 95,321 | 95,322 | 95,323 | 95,324 | 95,325 | 95,326 | 95,327 | 95,328 |
| | 2-22 | 95,337 | 95,338 | 95,339 | 95,340 | 95,341 | 95,342 | 95,343 | 95,344 |
| | 2-23 | 95,353 | 95,354 | 95,355 | 95,356 | 95,357 | 95,358 | 95,359 | 95,360 |
| | 2-24 | 95,369 | 95,370 | 95,371 | 95,372 | 95,373 | 95,374 | 95,375 | 95,376 |
| | 2-25 | 95,385 | 95,386 | 95,387 | 95,388 | 95,389 | 95,390 | 95,391 | 95,392 |
| | 2-26 | 95,401 | 95,402 | 95,403 | 95,404 | 95,405 | 95,406 | 95,407 | 95,408 |
| | 2-27 | 95,417 | 95,418 | 95,419 | 95,420 | 95,421 | 95,422 | 95,423 | 95,424 |

TABLE 73-continued

| | | | | | | | | | |
|---|---|---|---|---|---|---|---|---|---|
| | 2-28 | 95,433 | 95,434 | 95,435 | 95,436 | 95,437 | 95,438 | 95,439 | 95,440 |
| | 2-29 | 95,449 | 95,450 | 95,451 | 95,452 | 95,453 | 95,454 | 95,455 | 95,456 |
| | 2-30 | 95,465 | 95,466 | 95,467 | 95,468 | 95,469 | 95,470 | 95,471 | 95,472 |
| | 2-31 | 95,481 | 95,482 | 95,483 | 95,484 | 95,485 | 95,486 | 95,487 | 95,488 |
| | 2-32 | 95,497 | 95,498 | 95,499 | 95,500 | 95,501 | 95,502 | 95,503 | 95,504 |
| | 2-33 | 95,513 | 95,514 | 95,515 | 95,516 | 95,517 | 95,518 | 95,519 | 95,520 |
| | 2-34 | 95,529 | 95,530 | 95,531 | 95,532 | 95,533 | 95,534 | 95,535 | 95,536 |
| | 2-35 | 95,545 | 95,546 | 95,547 | 95,548 | 95,549 | 95,550 | 95,551 | 95,552 |
| | 2-36 | 95,561 | 95,562 | 95,563 | 95,564 | 95,565 | 95,566 | 95,567 | 95,568 |
| | 2-37 | 95,577 | 95,578 | 95,579 | 95,580 | 95,581 | 95,582 | 95,583 | 95,584 |
| | 2-38 | 95,593 | 95,594 | 95,595 | 95,596 | 95,597 | 95,598 | 95,599 | 95,600 |
| | 2-39 | 95,609 | 95,610 | 95,611 | 95,612 | 95,613 | 95,614 | 95,615 | 95,616 |
| | 2-40 | 95,625 | 95,626 | 95,627 | 95,628 | 95,629 | 95,630 | 95,631 | 95,632 |
| | 2-41 | 95,641 | 95,642 | 95,643 | 95,644 | 95,645 | 95,646 | 95,647 | 95,648 |
| | 2-42 | 95,657 | 95,658 | 95,659 | 95,660 | 95,661 | 95,662 | 95,663 | 95,664 |
| | 2-43 | 95,673 | 95,674 | 95,675 | 95,676 | 95,677 | 95,678 | 95,679 | 95,680 |
| | 2-44 | 95,689 | 95,690 | 95,691 | 95,692 | 95,693 | 95,694 | 95,695 | 95,696 |
| | 2-45 | 95,705 | 95,706 | 95,707 | 95,708 | 95,709 | 95,710 | 95,711 | 95,712 |
| | 2-46 | 95,721 | 95,722 | 95,723 | 95,724 | 95,725 | 95,726 | 95,727 | 95,728 |
| | 2-47 | 95,737 | 95,738 | 95,739 | 95,740 | 95,741 | 95,742 | 95,743 | 95,744 |
| | 2-48 | 95,753 | 95,754 | 95,755 | 95,756 | 95,757 | 95,758 | 95,759 | 95,760 |
| | 2-49 | 95,769 | 95,770 | 95,771 | 95,772 | 95,773 | 95,774 | 95,775 | 95,776 |
| | 2-50 | 95,785 | 95,786 | 95,787 | 95,788 | 95,789 | 95,790 | 95,791 | 95,792 |
| | 2-51 | 95,801 | 95,802 | 95,803 | 95,804 | 95,805 | 95,806 | 95,807 | 95,808 |
| | 2-52 | 95,817 | 95,818 | 95,819 | 95,820 | 95,821 | 95,822 | 95,823 | 95,824 |
| | 2-53 | 95,833 | 95,834 | 95,835 | 95,836 | 95,837 | 95,838 | 95,839 | 95,840 |
| | 2-54 | 95,849 | 95,850 | 95,851 | 95,852 | 95,853 | 95,854 | 95,855 | 95,856 |
| | 2-55 | 95,865 | 95,866 | 95,867 | 95,868 | 95,869 | 95,870 | 95,871 | 95,872 |
| | 2-56 | 95,881 | 95,882 | 95,883 | 95,884 | 95,885 | 95,886 | 95,887 | 95,888 |
| | 2-57 | 95,897 | 95,898 | 95,899 | 95,900 | 95,901 | 95,902 | 95,903 | 95,904 |
| | 2-58 | 95,913 | 95,914 | 95,915 | 95,916 | 95,917 | 95,918 | 95,919 | 95,920 |
| | 2-59 | 95,929 | 95,930 | 95,931 | 95,932 | 95,933 | 95,934 | 95,935 | 95,936 |
| | 2-60 | 95,945 | 95,946 | 95,947 | 95,948 | 95,949 | 95,950 | 95,951 | 95,952 |
| | 2-61 | 95,961 | 95,962 | 95,963 | 95,964 | 95,965 | 95,966 | 95,967 | 95,968 |
| | 2-62 | 95,977 | 95,978 | 95,979 | 95,980 | 95,981 | 95,982 | 95,983 | 95,984 |
| | 2-63 | 95,993 | 95,994 | 95,995 | 95,996 | 95,997 | 95,998 | 95,999 | 96,000 |
| | 2-64 | 96,009 | 96,010 | 96,011 | 96,012 | 96,013 | 96,014 | 96,015 | 96,016 |
| | 2-65 | 96,025 | 96,026 | 96,027 | 96,028 | 96,029 | 96,030 | 96,031 | 96,032 |
| | 2-66 | 96,041 | 96,042 | 96,043 | 96,044 | 96,045 | 96,046 | 96,047 | 96,048 |
| | 2-67 | 96,057 | 96,058 | 96,059 | 96,060 | 96,061 | 96,062 | 96,063 | 96,064 |
| | 2-68 | 96,073 | 96,074 | 96,075 | 96,076 | 96,077 | 96,078 | 96,079 | 96,080 |
| | 2-69 | 96,089 | 96,090 | 96,091 | 96,092 | 96,093 | 96,094 | 96,095 | 96,096 |
| | 2-70 | 96,105 | 96,106 | 96,107 | 96,108 | 96,109 | 96,110 | 96,111 | 96,112 |
| | 2-71 | 96,121 | 96,122 | 96,123 | 96,124 | 96,125 | 96,126 | 96,127 | 96,128 |
| | 2-72 | 96,137 | 96,138 | 96,139 | 96,140 | 96,141 | 96,142 | 96,143 | 96,144 |
| | 2-73 | 96,153 | 96,154 | 96,155 | 96,156 | 96,157 | 96,158 | 96,159 | 96,160 |
| | 2-74 | 96,169 | 96,170 | 96,171 | 96,172 | 96,173 | 96,174 | 96,175 | 96,176 |
| | 2-75 | 96,185 | 96,186 | 96,187 | 96,188 | 96,189 | 96,190 | 96,191 | 96,192 |

| | | Compound represented by the formula (1) | | | | | | | |
|---|---|---|---|---|---|---|---|---|---|
| | | 1-209 | 1-210 | 1-211 | 1-212 | 1-213 | 1-214 | 1-215 | 1-216 |
| Compound represented by the formula (2) | 2-1 | 95,009 | 95,010 | 95,011 | 95,012 | 95,013 | 95,014 | 95,015 | 95,016 |
| | 2-2 | 95,025 | 95,026 | 95,027 | 95,028 | 95,029 | 95,030 | 95,031 | 95,032 |
| | 2-3 | 95,041 | 95,042 | 95,043 | 95,044 | 95,045 | 95,046 | 95,047 | 95,048 |
| | 2-4 | 95,057 | 95,058 | 95,059 | 95,060 | 95,061 | 95,062 | 95,063 | 95,064 |
| | 2-5 | 95,073 | 95,074 | 95,075 | 95,076 | 95,077 | 95,078 | 95,079 | 95,080 |
| | 2-6 | 95,089 | 95,090 | 95,091 | 95,092 | 95,093 | 95,094 | 95,095 | 95,096 |
| | 2-7 | 95,105 | 95,106 | 95,107 | 95,108 | 95,109 | 95,110 | 95,111 | 95,112 |
| | 2-8 | 95,121 | 95,122 | 95,123 | 95,124 | 95,125 | 95,126 | 95,127 | 95,128 |
| | 2-9 | 95,137 | 95,138 | 95,139 | 95,140 | 95,141 | 95,142 | 95,143 | 95,144 |
| | 2-10 | 95,153 | 95,154 | 95,155 | 95,156 | 95,157 | 95,158 | 95,159 | 95,160 |
| | 2-11 | 95,169 | 95,170 | 95,171 | 95,172 | 95,173 | 95,174 | 95,175 | 95,176 |
| | 2-12 | 95,185 | 95,186 | 95,187 | 95,188 | 95,189 | 95,190 | 95,191 | 95,192 |
| | 2-13 | 95,201 | 95,202 | 95,203 | 95,204 | 95,205 | 95,206 | 95,207 | 95,208 |
| | 2-14 | 95,217 | 95,218 | 95,219 | 95,220 | 95,221 | 95,222 | 95,223 | 95,224 |
| | 2-15 | 95,233 | 95,234 | 95,235 | 95,236 | 95,237 | 95,238 | 95,239 | 95,240 |
| | 2-16 | 95,249 | 95,250 | 95,251 | 95,252 | 95,253 | 95,254 | 95,255 | 95,256 |
| | 2-17 | 95,265 | 95,266 | 95,267 | 95,268 | 95,269 | 95,270 | 95,271 | 95,272 |
| | 2-18 | 95,281 | 95,282 | 95,283 | 95,284 | 95,285 | 95,286 | 95,287 | 95,288 |
| | 2-19 | 95,297 | 95,298 | 95,299 | 95,300 | 95,301 | 95,302 | 95,303 | 95,304 |
| | 2-20 | 95,313 | 95,314 | 95,315 | 95,316 | 95,317 | 95,318 | 95,319 | 95,320 |
| | 2-21 | 95,329 | 95,330 | 95,331 | 95,332 | 95,333 | 95,334 | 95,335 | 95,336 |
| | 2-22 | 95,345 | 95,346 | 95,347 | 95,348 | 95,349 | 95,350 | 95,351 | 95,352 |
| | 2-23 | 95,361 | 95,362 | 95,363 | 95,364 | 95,365 | 95,366 | 95,367 | 95,368 |
| | 2-24 | 95,377 | 95,378 | 95,379 | 95,380 | 95,381 | 95,382 | 95,383 | 95,384 |
| | 2-25 | 95,393 | 95,394 | 95,395 | 95,396 | 95,397 | 95,398 | 95,399 | 95,400 |
| | 2-26 | 95,409 | 95,410 | 95,411 | 95,412 | 95,413 | 95,414 | 95,415 | 95,416 |
| | 2-27 | 95,425 | 95,426 | 95,427 | 95,428 | 95,429 | 95,430 | 95,431 | 95,432 |

TABLE 73-continued

| | | | | | | | | |
|---|---|---|---|---|---|---|---|---|
| 2-28 | 95,441 | 95,442 | 95,443 | 95,444 | 95,445 | 95,446 | 95,447 | 95,448 |
| 2-29 | 95,457 | 95,458 | 95,459 | 95,460 | 95,461 | 95,462 | 95,463 | 95,464 |
| 2-30 | 95,473 | 95,474 | 95,475 | 95,476 | 95,477 | 95,478 | 95,479 | 95,480 |
| 2-31 | 95,489 | 95,490 | 95,491 | 95,492 | 95,493 | 95,494 | 95,495 | 95,496 |
| 2-32 | 95,505 | 95,506 | 95,507 | 95,508 | 95,509 | 95,510 | 95,511 | 95,512 |
| 2-33 | 95,521 | 95,522 | 95,523 | 95,524 | 95,525 | 95,526 | 95,527 | 95,528 |
| 2-34 | 95,537 | 95,538 | 95,539 | 95,540 | 95,541 | 95,542 | 95,543 | 95,544 |
| 2-35 | 95,553 | 95,554 | 95,555 | 95,556 | 95,557 | 95,558 | 95,559 | 95,560 |
| 2-36 | 95,569 | 95,570 | 95,571 | 95,572 | 95,573 | 95,574 | 95,575 | 95,576 |
| 2-37 | 95,585 | 95,586 | 95,587 | 95,588 | 95,589 | 95,590 | 95,591 | 95,592 |
| 2-38 | 95,601 | 95,602 | 95,603 | 95,604 | 95,605 | 95,606 | 95,607 | 95,608 |
| 2-39 | 95,617 | 95,618 | 95,619 | 95,620 | 95,621 | 95,622 | 95,623 | 95,624 |
| 2-40 | 95,633 | 95,634 | 95,635 | 95,636 | 95,637 | 95,638 | 95,639 | 95,640 |
| 2-41 | 95,649 | 95,650 | 95,651 | 95,652 | 95,653 | 95,654 | 95,655 | 95,656 |
| 2-42 | 95,665 | 95,666 | 95,667 | 95,668 | 95,669 | 95,670 | 95,671 | 95,672 |
| 2-43 | 95,681 | 95,682 | 95,683 | 95,684 | 95,685 | 95,686 | 95,687 | 95,688 |
| 2-44 | 95,697 | 95,698 | 95,699 | 95,700 | 95,701 | 95,702 | 95,703 | 95,704 |
| 2-45 | 95,713 | 95,714 | 95,715 | 95,716 | 95,717 | 95,718 | 95,719 | 95,720 |
| 2-46 | 95,729 | 95,730 | 95,731 | 95,732 | 95,733 | 95,734 | 95,735 | 95,736 |
| 2-47 | 95,745 | 95,746 | 95,747 | 95,748 | 95,749 | 95,750 | 95,751 | 95,752 |
| 2-48 | 95,761 | 95,762 | 95,763 | 95,764 | 95,765 | 95,766 | 95,767 | 95,768 |
| 2-49 | 95,777 | 95,778 | 95,779 | 95,780 | 95,781 | 95,782 | 95,783 | 95,784 |
| 2-50 | 95,793 | 95,794 | 95,795 | 95,796 | 95,797 | 95,798 | 95,799 | 95,800 |
| 2-51 | 95,809 | 95,810 | 95,811 | 95,812 | 95,813 | 95,814 | 95,815 | 95,816 |
| 2-52 | 95,825 | 95,826 | 95,827 | 95,828 | 95,829 | 95,830 | 95,831 | 95,832 |
| 2-53 | 95,841 | 95,842 | 95,843 | 95,844 | 95,845 | 95,846 | 95,847 | 95,848 |
| 2-54 | 95,857 | 95,858 | 95,859 | 95,860 | 95,861 | 95,862 | 95,863 | 95,864 |
| 2-55 | 95,873 | 95,874 | 95,875 | 95,876 | 95,877 | 95,878 | 95,879 | 95,880 |
| 2-56 | 95,889 | 95,890 | 95,891 | 95,892 | 95,893 | 95,894 | 95,895 | 95,896 |
| 2-57 | 95,905 | 95,906 | 95,907 | 95,908 | 95,909 | 95,910 | 95,911 | 95,912 |
| 2-58 | 95,921 | 95,922 | 95,923 | 95,924 | 95,925 | 95,926 | 95,927 | 95,928 |
| 2-59 | 95,937 | 95,938 | 95,939 | 95,940 | 95,941 | 95,942 | 95,943 | 95,944 |
| 2-60 | 95,953 | 95,954 | 95,955 | 95,956 | 95,957 | 95,958 | 95,959 | 95,960 |
| 2-61 | 95,969 | 95,970 | 95,971 | 95,972 | 95,973 | 95,974 | 95,975 | 95,976 |
| 2-62 | 95,985 | 95,986 | 95,987 | 95,988 | 95,989 | 95,990 | 95,991 | 95,992 |
| 2-63 | 96,001 | 96,002 | 96,003 | 96,004 | 96,005 | 96,006 | 96,007 | 96,008 |
| 2-64 | 96,017 | 96,018 | 96,019 | 96,020 | 96,021 | 96,022 | 96,023 | 96,024 |
| 2-65 | 96,033 | 96,034 | 96,035 | 96,036 | 96,037 | 96,038 | 96,039 | 96,040 |
| 2-66 | 96,049 | 96,050 | 96,051 | 96,052 | 96,053 | 96,054 | 96,055 | 96,056 |
| 2-67 | 96,065 | 96,066 | 96,067 | 96,068 | 96,069 | 96,070 | 96,071 | 96,072 |
| 2-68 | 96,081 | 96,082 | 96,083 | 96,084 | 96,085 | 96,086 | 96,087 | 96,088 |
| 2-69 | 96,097 | 96,098 | 96,099 | 96,100 | 96,101 | 96,102 | 96,103 | 96,104 |
| 2-70 | 96,113 | 96,114 | 96,115 | 96,116 | 96,117 | 96,118 | 96,119 | 96,120 |
| 2-71 | 96,129 | 96,130 | 96,131 | 96,132 | 96,133 | 96,134 | 96,135 | 96,136 |
| 2-72 | 96,145 | 96,146 | 96,147 | 96,148 | 96,149 | 96,150 | 96,151 | 96,152 |
| 2-73 | 96,161 | 96,162 | 96,163 | 96,164 | 96,165 | 96,166 | 96,167 | 96,168 |
| 2-74 | 96,177 | 96,178 | 96,179 | 96,180 | 96,181 | 96,182 | 96,183 | 96,184 |
| 2-75 | 96,193 | 96,194 | 96,195 | 96,196 | 96,197 | 96,198 | 96,199 | 96,200 |

TABLE 74

| | | Compound represented by the formula (1) | | | | | | | |
|---|---|---|---|---|---|---|---|---|---|
| | | 1-201 | 1-202 | 1-203 | 1-204 | 1-205 | 1-206 | 1-207 | 1-208 |
| Compound represented by the formula (2) | 2-76 | 96,201 | 96,202 | 96,203 | 96,204 | 96,205 | 96,206 | 96,207 | 96,208 |
| | 2-77 | 96,217 | 96,218 | 96,219 | 96,220 | 96,221 | 96,222 | 96,223 | 96,224 |
| | 2-78 | 96,233 | 96,234 | 96,235 | 96,236 | 96,237 | 96,238 | 96,239 | 96,240 |
| | 2-79 | 96,249 | 96,250 | 96,251 | 96,252 | 96,253 | 96,254 | 96,255 | 96,256 |
| | 2-80 | 96,265 | 96,266 | 96,267 | 96,268 | 96,269 | 96,270 | 96,271 | 96,272 |
| | 2-81 | 96,281 | 96,282 | 96,283 | 96,284 | 96,285 | 96,286 | 96,287 | 96,288 |
| | 2-82 | 96,297 | 96,298 | 96,299 | 96,300 | 96,301 | 96,302 | 96,303 | 96,304 |
| | 2-83 | 96,313 | 96,314 | 96,315 | 96,316 | 96,317 | 96,318 | 96,319 | 96,320 |
| | 2-84 | 96,329 | 96,330 | 96,331 | 96,332 | 96,333 | 96,334 | 96,335 | 96,336 |
| | 2-85 | 96,345 | 96,346 | 96,347 | 96,348 | 96,349 | 96,350 | 96,351 | 96,352 |
| | 2-86 | 96,361 | 96,362 | 96,363 | 96,364 | 96,365 | 96,366 | 96,367 | 96,368 |
| | 2-87 | 96,377 | 96,378 | 96,379 | 96,380 | 96,381 | 96,382 | 96,383 | 96,384 |
| | 2-88 | 96,393 | 96,394 | 96,395 | 96,396 | 96,397 | 96,398 | 96,399 | 96,400 |
| | 2-89 | 96,409 | 96,410 | 96,411 | 96,412 | 96,413 | 96,414 | 96,415 | 96,416 |
| | 2-90 | 96,425 | 96,426 | 96,427 | 96,428 | 96,429 | 96,430 | 96,431 | 96,432 |
| | 2-91 | 96,441 | 96,442 | 96,443 | 96,444 | 96,445 | 96,446 | 96,447 | 96,448 |
| | 2-92 | 96,457 | 96,458 | 96,459 | 96,460 | 96,461 | 96,462 | 96,463 | 96,464 |
| | 2-93 | 96,473 | 96,474 | 96,475 | 96,476 | 96,477 | 96,478 | 96,479 | 96,480 |
| | 2-94 | 96,489 | 96,490 | 96,491 | 96,492 | 96,493 | 96,494 | 96,495 | 96,496 |
| | 2-95 | 96,505 | 96,506 | 96,507 | 96,508 | 96,509 | 96,510 | 96,511 | 96,512 |
| | 2-96 | 96,521 | 96,522 | 96,523 | 96,524 | 96,525 | 96,526 | 96,527 | 96,528 |
| | 2-97 | 96,537 | 96,538 | 96,539 | 96,540 | 96,541 | 96,542 | 96,543 | 96,544 |

TABLE 74-continued

| | | | | | | | | | |
|---|---|---|---|---|---|---|---|---|---|
| | 2-98 | 96,553 | 96,554 | 96,555 | 96,556 | 96,557 | 96,558 | 96,559 | 96,560 |
| | 2-99 | 96,569 | 96,570 | 96,571 | 96,572 | 96,573 | 96,574 | 96,575 | 96,576 |
| | 2-100 | 96,585 | 96,586 | 96,587 | 96,588 | 96,589 | 96,590 | 96,591 | 96,592 |
| | 2-101 | 96,601 | 96,602 | 96,603 | 96,604 | 96,605 | 96,606 | 96,607 | 96,608 |
| | 2-102 | 96,617 | 96,618 | 96,619 | 96,620 | 96,621 | 96,622 | 96,623 | 96,624 |
| | 2-103 | 96,633 | 96,634 | 96,635 | 96,636 | 96,637 | 96,638 | 96,639 | 96,640 |
| | 2-104 | 96,649 | 96,650 | 96,651 | 96,652 | 96,653 | 96,654 | 96,655 | 96,656 |
| | 2-105 | 96,665 | 96,666 | 96,667 | 96,668 | 96,669 | 96,670 | 96,671 | 96,672 |
| | 2-106 | 96,681 | 96,682 | 96,683 | 96,684 | 96,685 | 96,686 | 96,687 | 96,688 |
| | 2-107 | 96,697 | 96,698 | 96,699 | 96,700 | 96,701 | 96,702 | 96,703 | 96,704 |
| | 2-108 | 96,713 | 96,714 | 96,715 | 96,716 | 96,717 | 96,718 | 96,719 | 96,720 |
| | 2-109 | 96,729 | 96,730 | 96,731 | 96,732 | 96,733 | 96,734 | 96,735 | 96,736 |
| | 2-110 | 96,745 | 96,746 | 96,747 | 96,748 | 96,749 | 96,750 | 96,751 | 96,752 |
| | 2-111 | 96,761 | 96,762 | 96,763 | 96,764 | 96,765 | 96,766 | 96,767 | 96,768 |
| | 2-112 | 96,777 | 96,778 | 96,779 | 96,780 | 96,781 | 96,782 | 96,783 | 96,784 |
| | 2-113 | 96,793 | 96,794 | 96,795 | 96,796 | 96,797 | 96,798 | 96,799 | 96,800 |
| | 2-114 | 96,809 | 96,810 | 96,811 | 96,812 | 96,813 | 96,814 | 96,815 | 96,816 |
| | 2-115 | 96,825 | 96,826 | 96,827 | 96,828 | 96,829 | 96,830 | 96,831 | 96,832 |
| | 2-116 | 96,841 | 96,842 | 96,843 | 96,844 | 96,845 | 96,846 | 96,847 | 96,848 |
| | 2-117 | 96,857 | 96,858 | 96,859 | 96,860 | 96,861 | 96,862 | 96,863 | 96,864 |
| | 2-118 | 96,873 | 96,874 | 96,875 | 96,876 | 96,877 | 96,878 | 96,879 | 96,880 |
| | 2-119 | 96,889 | 96,890 | 96,891 | 96,892 | 96,893 | 96,894 | 96,895 | 96,896 |
| | 2-120 | 96,905 | 96,906 | 96,907 | 96,908 | 96,909 | 96,910 | 96,911 | 96,912 |
| | 2-121 | 96,921 | 96,922 | 96,923 | 96,924 | 96,925 | 96,926 | 96,927 | 96,928 |
| | 2-122 | 96,937 | 96,938 | 96,939 | 96,940 | 96,941 | 96,942 | 96,943 | 96,944 |
| | 2-123 | 96,953 | 96,954 | 96,955 | 96,956 | 96,957 | 96,958 | 96,959 | 96,960 |
| | 2-124 | 96,969 | 96,970 | 96,971 | 96,972 | 96,973 | 96,974 | 96,975 | 96,976 |
| | 2-125 | 96,985 | 96,986 | 96,987 | 96,988 | 96,989 | 96,990 | 96,991 | 96,992 |
| | 2-126 | 97,001 | 97,002 | 97,003 | 97,004 | 97,005 | 97,006 | 97,007 | 97,008 |
| | 2-127 | 97,017 | 97,018 | 97,019 | 97,020 | 97,021 | 97,022 | 97,023 | 97,024 |
| | 2-128 | 97,033 | 97,034 | 97,035 | 97,036 | 97,037 | 97,038 | 97,039 | 97,040 |
| | 2-129 | 97,049 | 97,050 | 97,051 | 97,052 | 97,053 | 97,054 | 97,055 | 97,056 |
| | 2-130 | 97,065 | 97,066 | 97,067 | 97,068 | 97,069 | 97,070 | 97,071 | 97,072 |
| | 2-131 | 97,081 | 97,082 | 97,083 | 97,084 | 97,085 | 97,086 | 97,087 | 97,088 |
| | 2-132 | 97,097 | 97,098 | 97,099 | 97,100 | 97,101 | 97,102 | 97,103 | 97,104 |
| | 2-133 | 97,113 | 97,114 | 97,115 | 97,116 | 97,117 | 97,118 | 97,119 | 97,120 |
| | 2-134 | 97,129 | 97,130 | 97,131 | 97,132 | 97,133 | 97,134 | 97,135 | 97,136 |
| | 2-135 | 97,145 | 97,146 | 97,147 | 97,148 | 97,149 | 97,150 | 97,151 | 97,152 |
| | 2-136 | 97,161 | 97,162 | 97,163 | 97,164 | 97,165 | 97,166 | 97,167 | 97,168 |
| | 2-137 | 97,177 | 97,178 | 97,179 | 97,180 | 97,181 | 97,182 | 97,183 | 97,184 |
| | 2-138 | 97,193 | 97,194 | 97,195 | 97,196 | 97,197 | 97,198 | 97,199 | 97,200 |
| | 2-139 | 97,209 | 97,210 | 97,211 | 97,212 | 97,213 | 97,214 | 97,215 | 97,216 |
| | 2-140 | 97,225 | 97,226 | 97,227 | 97,228 | 97,229 | 97,230 | 97,231 | 97,232 |
| | 2-141 | 97,241 | 97,242 | 97,243 | 97,244 | 97,245 | 97,246 | 97,247 | 97,248 |
| | 2-142 | 97,257 | 97,258 | 97,259 | 97,260 | 97,261 | 97,262 | 97,263 | 97,264 |
| | 2-143 | 97,273 | 97,274 | 97,275 | 97,276 | 97,277 | 97,278 | 97,279 | 97,280 |
| | 2-144 | 97,289 | 97,290 | 97,291 | 97,292 | 97,293 | 97,294 | 97,295 | 97,296 |
| | 2-145 | 97,305 | 97,306 | 97,307 | 97,308 | 97,309 | 97,310 | 97,311 | 97,312 |
| | 2-146 | 97,321 | 97,322 | 97,323 | 97,324 | 97,325 | 97,326 | 97,327 | 97,328 |
| | 2-147 | 97,337 | 97,338 | 97,339 | 97,340 | 97,341 | 97,342 | 97,343 | 97,344 |
| | 2-148 | 97,353 | 97,354 | 97,355 | 97,356 | 97,357 | 97,358 | 97,359 | 97,360 |
| | 2-149 | 97,369 | 97,370 | 97,371 | 97,372 | 97,373 | 97,374 | 97,375 | 97,376 |
| | 2-150 | 97,385 | 97,386 | 97,387 | 97,388 | 97,389 | 97,390 | 97,391 | 97,392 |

| | | Compound represented by the formula (1) | | | | | | | |
|---|---|---|---|---|---|---|---|---|---|
| | | 1-209 | 1-210 | 1-211 | 1-212 | 1-213 | 1-214 | 1-215 | 1-216 |
| Compound represented by the formula (2) | 2-76 | 96,209 | 96,210 | 96,211 | 96,212 | 96,213 | 96,214 | 96,215 | 96,216 |
| | 2-77 | 96,225 | 96,226 | 96,227 | 96,228 | 96,229 | 96,230 | 96,231 | 96,232 |
| | 2-78 | 96,241 | 96,242 | 96,243 | 96,244 | 96,245 | 96,246 | 96,247 | 96,248 |
| | 2-79 | 96,257 | 96,258 | 96,259 | 96,260 | 96,261 | 96,262 | 96,263 | 96,264 |
| | 2-80 | 96,273 | 96,274 | 96,275 | 96,276 | 96,277 | 96,278 | 96,279 | 96,280 |
| | 2-81 | 96,289 | 96,290 | 96,291 | 96,292 | 96,293 | 96,294 | 96,295 | 96,296 |
| | 2-82 | 96,305 | 96,306 | 96,307 | 96,308 | 96,309 | 96,310 | 96,311 | 96,312 |
| | 2-83 | 96,321 | 96,322 | 96,323 | 96,324 | 96,325 | 96,326 | 96,327 | 96,328 |
| | 2-84 | 96,337 | 96,338 | 96,339 | 96,340 | 96,341 | 96,342 | 96,343 | 96,344 |
| | 2-85 | 96,353 | 96,354 | 96,355 | 96,356 | 96,357 | 96,358 | 96,359 | 96,360 |
| | 2-86 | 96,369 | 96,370 | 96,371 | 96,372 | 96,373 | 96,374 | 96,375 | 96,376 |
| | 2-87 | 96,385 | 96,386 | 96,387 | 96,388 | 96,389 | 96,390 | 96,391 | 96,392 |
| | 2-88 | 96,401 | 96,402 | 96,403 | 96,404 | 96,405 | 96,406 | 96,407 | 96,408 |
| | 2-89 | 96,417 | 96,418 | 96,419 | 96,420 | 96,421 | 96,422 | 96,423 | 96,424 |
| | 2-90 | 96,433 | 96,434 | 96,435 | 96,436 | 96,437 | 96,438 | 96,439 | 96,440 |
| | 2-91 | 96,449 | 96,450 | 96,451 | 96,452 | 96,453 | 96,454 | 96,455 | 96,456 |
| | 2-92 | 96,465 | 96,466 | 96,467 | 96,468 | 96,469 | 96,470 | 96,471 | 96,472 |
| | 2-93 | 96,481 | 96,482 | 96,483 | 96,484 | 96,485 | 96,486 | 96,487 | 96,488 |
| | 2-94 | 96,497 | 96,498 | 96,499 | 96,500 | 96,501 | 96,502 | 96,503 | 96,504 |
| | 2-95 | 96,513 | 96,514 | 96,515 | 96,516 | 96,517 | 96,518 | 96,519 | 96,520 |
| | 2-96 | 96,529 | 96,530 | 96,531 | 96,532 | 96,533 | 96,534 | 96,535 | 96,536 |
| | 2-97 | 96,545 | 96,546 | 96,547 | 96,548 | 96,549 | 96,550 | 96,551 | 96,552 |

TABLE 74-continued

| | | | | | | | | |
|---|---|---|---|---|---|---|---|---|
| 2-98 | 96,561 | 96,562 | 96,563 | 96,564 | 96,565 | 96,566 | 96,567 | 96,568 |
| 2-99 | 96,577 | 96,578 | 96,579 | 96,580 | 96,581 | 96,582 | 96,583 | 96,584 |
| 2-100 | 96,593 | 96,594 | 96,595 | 96,596 | 96,597 | 96,598 | 96,599 | 96,600 |
| 2-101 | 96,609 | 96,610 | 96,611 | 96,612 | 96,613 | 96,614 | 96,615 | 96,616 |
| 2-102 | 96,625 | 96,626 | 96,627 | 96,628 | 96,629 | 96,630 | 96,631 | 96,632 |
| 2-103 | 96,641 | 96,642 | 96,643 | 96,644 | 96,645 | 96,646 | 96,647 | 96,648 |
| 2-104 | 96,657 | 96,658 | 96,659 | 96,660 | 96,661 | 96,662 | 96,663 | 96,664 |
| 2-105 | 96,673 | 96,674 | 96,675 | 96,676 | 96,677 | 96,678 | 96,679 | 96,680 |
| 2-106 | 96,689 | 96,690 | 96,691 | 96,692 | 96,693 | 96,694 | 96,695 | 96,696 |
| 2-107 | 96,705 | 96,706 | 96,707 | 96,708 | 96,709 | 96,710 | 96,711 | 96,712 |
| 2-108 | 96,721 | 96,722 | 96,723 | 96,724 | 96,725 | 96,726 | 96,727 | 96,728 |
| 2-109 | 96,737 | 96,738 | 96,739 | 96,740 | 96,741 | 96,742 | 96,743 | 96,744 |
| 2-110 | 96,753 | 96,754 | 96,755 | 96,756 | 96,757 | 96,758 | 96,759 | 96,760 |
| 2-111 | 96,769 | 96,770 | 96,771 | 96,772 | 96,773 | 96,774 | 96,775 | 96,776 |
| 2-112 | 96,785 | 96,786 | 96,787 | 96,788 | 96,789 | 96,790 | 96,791 | 96,792 |
| 2-113 | 96,801 | 96,802 | 96,803 | 96,804 | 96,805 | 96,806 | 96,807 | 96,808 |
| 2-114 | 96,817 | 96,818 | 96,819 | 96,820 | 96,821 | 96,822 | 96,823 | 96,824 |
| 2-115 | 96,833 | 96,834 | 96,835 | 96,836 | 96,837 | 96,838 | 96,839 | 96,840 |
| 2-116 | 96,849 | 96,850 | 96,851 | 96,852 | 96,853 | 96,854 | 96,855 | 96,856 |
| 2-117 | 96,865 | 96,866 | 96,867 | 96,868 | 96,869 | 96,870 | 96,871 | 96,872 |
| 2-118 | 96,881 | 96,882 | 96,883 | 96,884 | 96,885 | 96,886 | 96,887 | 96,888 |
| 2-119 | 96,897 | 96,898 | 96,899 | 96,900 | 96,901 | 96,902 | 96,903 | 96,904 |
| 2-120 | 96,913 | 96,914 | 96,915 | 96,916 | 96,917 | 96,918 | 96,919 | 96,920 |
| 2-121 | 96,929 | 96,930 | 96,931 | 96,932 | 96,933 | 96,934 | 96,935 | 96,936 |
| 2-122 | 96,945 | 96,946 | 96,947 | 96,948 | 96,949 | 96,950 | 96,951 | 96,952 |
| 2-123 | 96,961 | 96,962 | 96,963 | 96,964 | 96,965 | 96,966 | 96,967 | 96,968 |
| 2-124 | 96,977 | 96,978 | 96,979 | 96,980 | 96,981 | 96,982 | 96,983 | 96,984 |
| 2-125 | 96,993 | 96,994 | 96,995 | 96,996 | 96,997 | 96,998 | 96,999 | 97,000 |
| 2-126 | 97,009 | 97,010 | 97,011 | 97,012 | 97,013 | 97,014 | 97,015 | 97,016 |
| 2-127 | 97,025 | 97,026 | 97,027 | 97,028 | 97,029 | 97,030 | 97,031 | 97,032 |
| 2-128 | 97,041 | 97,042 | 97,043 | 97,044 | 97,045 | 97,046 | 97,047 | 97,048 |
| 2-129 | 97,057 | 97,058 | 97,059 | 97,060 | 97,061 | 97,062 | 97,063 | 97,064 |
| 2-130 | 97,073 | 97,074 | 97,075 | 97,076 | 97,077 | 97,078 | 97,079 | 97,080 |
| 2-131 | 97,089 | 97,090 | 97,091 | 97,092 | 97,093 | 97,094 | 97,095 | 97,096 |
| 2-132 | 97,105 | 97,106 | 97,107 | 97,108 | 97,109 | 97,110 | 97,111 | 97,112 |
| 2-133 | 97,121 | 97,122 | 97,123 | 97,124 | 97,125 | 97,126 | 97,127 | 97,128 |
| 2-134 | 97,137 | 97,138 | 97,139 | 97,140 | 97,141 | 97,142 | 97,143 | 97,144 |
| 2-135 | 97,153 | 97,154 | 97,155 | 97,156 | 97,157 | 97,158 | 97,159 | 97,160 |
| 2-136 | 97,169 | 97,170 | 97,171 | 97,172 | 97,173 | 97,174 | 97,175 | 97,176 |
| 2-137 | 97,185 | 97,186 | 97,187 | 97,188 | 97,189 | 97,190 | 97,191 | 97,192 |
| 2-138 | 97,201 | 97,202 | 97,203 | 97,204 | 97,205 | 97,206 | 97,207 | 97,208 |
| 2-139 | 97,217 | 97,218 | 97,219 | 97,220 | 97,221 | 97,222 | 97,223 | 97,224 |
| 2-140 | 97,233 | 97,234 | 97,235 | 97,236 | 97,237 | 97,238 | 97,239 | 97,240 |
| 2-141 | 97,249 | 97,250 | 97,251 | 97,252 | 97,253 | 97,254 | 97,255 | 97,256 |
| 2-142 | 97,265 | 97,266 | 97,267 | 97,268 | 97,269 | 97,270 | 97,271 | 97,272 |
| 2-143 | 97,281 | 97,282 | 97,283 | 97,284 | 97,285 | 97,286 | 97,287 | 97,288 |
| 2-144 | 97,297 | 97,298 | 97,299 | 97,300 | 97,301 | 97,302 | 97,303 | 97,304 |
| 2-145 | 97,313 | 97,314 | 97,315 | 97,316 | 97,317 | 97,318 | 97,319 | 97,320 |
| 2-146 | 97,329 | 97,330 | 97,331 | 97,332 | 97,333 | 97,334 | 97,335 | 97,336 |
| 2-147 | 97,345 | 97,346 | 97,347 | 97,348 | 97,349 | 97,350 | 97,351 | 97,352 |
| 2-148 | 97,361 | 97,362 | 97,363 | 97,364 | 97,365 | 97,366 | 97,367 | 97,368 |
| 2-149 | 97,377 | 97,378 | 97,379 | 97,380 | 97,381 | 97,382 | 97,383 | 97,384 |
| 2-150 | 97,393 | 97,394 | 97,395 | 97,396 | 97,397 | 97,398 | 97,399 | 97,400 |

TABLE 75

| | | Compound represented by the formula (1) | | | | | | | |
|---|---|---|---|---|---|---|---|---|---|
| | | 1-201 | 1-202 | 1-203 | 1-204 | 1-205 | 1-206 | 1-207 | 1-208 |
| Compound represented by the formula (2) | 2-151 | 97,401 | 97,402 | 97,403 | 97,404 | 97,405 | 97,406 | 97,407 | 97,408 |
| | 2-152 | 97,417 | 97,418 | 97,419 | 97,420 | 97,421 | 97,422 | 97,423 | 97,424 |
| | 2-153 | 97,433 | 97,434 | 97,435 | 97,436 | 97,437 | 97,438 | 97,439 | 97,440 |
| | 2-154 | 97,449 | 97,450 | 97,451 | 97,452 | 97,453 | 97,454 | 97,455 | 97,456 |
| | 2-155 | 97,465 | 97,466 | 97,467 | 97,468 | 97,469 | 97,470 | 97,471 | 97,472 |
| | 2-156 | 97,481 | 97,482 | 97,483 | 97,484 | 97,485 | 97,486 | 97,487 | 97,488 |
| | 2-157 | 97,497 | 97,498 | 97,499 | 97,500 | 97,501 | 97,502 | 97,503 | 97,504 |
| | 2-158 | 97,513 | 97,514 | 97,515 | 97,516 | 97,517 | 97,518 | 97,519 | 97,520 |
| | 2-159 | 97,529 | 97,530 | 97,531 | 97,532 | 97,533 | 97,534 | 97,535 | 97,536 |
| | 2-160 | 97,545 | 97,546 | 97,547 | 97,548 | 97,549 | 97,550 | 97,551 | 97,552 |
| | 2-161 | 97,561 | 97,562 | 97,563 | 97,564 | 97,565 | 97,566 | 97,567 | 97,568 |
| | 2-162 | 97,577 | 97,578 | 97,579 | 97,580 | 97,581 | 97,582 | 97,583 | 97,584 |
| | 2-163 | 97,593 | 97,594 | 97,595 | 97,596 | 97,597 | 97,598 | 97,599 | 97,600 |
| | 2-164 | 97,609 | 97,610 | 97,611 | 97,612 | 97,613 | 97,614 | 97,615 | 97,616 |
| | 2-165 | 97,625 | 97,626 | 97,627 | 97,628 | 97,629 | 97,630 | 97,631 | 97,632 |
| | 2-166 | 97,641 | 97,642 | 97,643 | 97,644 | 97,645 | 97,646 | 97,647 | 97,648 |
| | 2-167 | 97,657 | 97,658 | 97,659 | 97,660 | 97,661 | 97,662 | 97,663 | 97,664 |

TABLE 75-continued

| | | | | | | | | | |
|---|---|---|---|---|---|---|---|---|---|
| | 2-168 | 97,673 | 97,674 | 97,675 | 97,676 | 97,677 | 97,678 | 97,679 | 97,680 |
| | 2-169 | 97,689 | 97,690 | 97,691 | 97,692 | 97,693 | 97,694 | 97,695 | 97,696 |
| | 2-170 | 97,705 | 97,706 | 97,707 | 97,708 | 97,709 | 97,710 | 97,711 | 97,712 |
| | 2-171 | 97,721 | 97,722 | 97,723 | 97,724 | 97,725 | 97,726 | 97,727 | 97,728 |
| | 2-172 | 97,737 | 97,738 | 97,739 | 97,740 | 97,741 | 97,742 | 97,743 | 97,744 |
| | 2-173 | 97,753 | 97,754 | 97,755 | 97,756 | 97,757 | 97,758 | 97,759 | 97,760 |
| | 2-174 | 97,769 | 97,770 | 97,771 | 97,772 | 97,773 | 97,774 | 97,775 | 97,776 |
| | 2-175 | 97,785 | 97,786 | 97,787 | 97,788 | 97,789 | 97,790 | 97,791 | 97,792 |
| | 2-176 | 97,801 | 97,802 | 97,803 | 97,804 | 97,805 | 97,806 | 97,807 | 97,808 |
| | 2-177 | 97,817 | 97,818 | 97,819 | 97,820 | 97,821 | 97,822 | 97,823 | 97,824 |
| | 2-178 | 97,833 | 97,834 | 97,835 | 97,836 | 97,837 | 97,838 | 97,839 | 97,840 |
| | 2-179 | 97,849 | 97,850 | 97,851 | 97,852 | 97,853 | 97,854 | 97,855 | 97,856 |
| | 2-180 | 97,865 | 97,866 | 97,867 | 97,868 | 97,869 | 97,870 | 97,871 | 97,872 |
| | 2-181 | 97,881 | 97,882 | 97,883 | 97,884 | 97,885 | 97,886 | 97,887 | 97,888 |
| | 2-182 | 97,897 | 97,898 | 97,899 | 97,900 | 97,901 | 97,902 | 97,903 | 97,904 |
| | 2-183 | 97,913 | 97,914 | 97,915 | 97,916 | 97,917 | 97,918 | 97,919 | 97,920 |
| | 2-184 | 97,929 | 97,930 | 97,931 | 97,932 | 97,933 | 97,934 | 97,935 | 97,936 |
| | 2-185 | 97,945 | 97,946 | 97,947 | 97,948 | 97,949 | 97,950 | 97,951 | 97,952 |
| | 2-186 | 97,961 | 97,962 | 97,963 | 97,964 | 97,965 | 97,966 | 97,967 | 97,968 |
| | 2-187 | 97,977 | 97,978 | 97,979 | 97,980 | 97,981 | 97,982 | 97,983 | 97,984 |
| | 2-188 | 97,993 | 97,994 | 97,995 | 97,996 | 97,997 | 97,998 | 97,999 | 98,000 |
| | 2-189 | 98,009 | 98,010 | 98,011 | 98,012 | 98,013 | 98,014 | 98,015 | 98,016 |
| | 2-190 | 98,025 | 98,026 | 98,027 | 98,028 | 98,029 | 98,030 | 98,031 | 98,032 |
| | 2-191 | 98,041 | 98,042 | 98,043 | 98,044 | 98,045 | 98,046 | 98,047 | 98,048 |
| | 2-192 | 98,057 | 98,058 | 98,059 | 98,060 | 98,061 | 98,062 | 98,063 | 98,064 |
| | 2-193 | 98,073 | 98,074 | 98,075 | 98,076 | 98,077 | 98,078 | 98,079 | 98,080 |
| | 2-194 | 98,089 | 98,090 | 98,091 | 98,092 | 98,093 | 98,094 | 98,095 | 98,096 |
| | 2-195 | 98,105 | 98,106 | 98,107 | 98,108 | 98,109 | 98,110 | 98,111 | 98,112 |
| | 2-196 | 98,121 | 98,122 | 98,123 | 98,124 | 98,125 | 98,126 | 98,127 | 98,128 |
| | 2-197 | 98,137 | 98,138 | 98,139 | 98,140 | 98,141 | 98,142 | 98,143 | 98,144 |
| | 2-198 | 98,153 | 98,154 | 98,155 | 98,156 | 98,157 | 98,158 | 98,159 | 98,160 |
| | 2-199 | 98,169 | 98,170 | 98,171 | 98,172 | 98,173 | 98,174 | 98,175 | 98,176 |
| | 2-200 | 98,185 | 98,186 | 98,187 | 98,188 | 98,189 | 98,190 | 98,191 | 98,192 |
| | 2-201 | 98,201 | 98,202 | 98,203 | 98,204 | 98,205 | 98,206 | 98,207 | 98,208 |
| | 2-202 | 98,217 | 98,218 | 98,219 | 98,220 | 98,221 | 98,222 | 98,223 | 98,224 |
| | 2-203 | 98,233 | 98,234 | 98,235 | 98,236 | 98,237 | 98,238 | 98,239 | 98,240 |
| | 2-204 | 98,249 | 98,250 | 98,251 | 98,252 | 98,253 | 98,254 | 98,255 | 98,256 |
| | 2-205 | 98,265 | 98,266 | 98,267 | 98,268 | 98,269 | 98,270 | 98,271 | 98,272 |
| | 2-206 | 98,281 | 98,282 | 98,283 | 98,284 | 98,285 | 98,286 | 98,287 | 98,288 |
| | 2-207 | 98,297 | 98,298 | 98,299 | 98,300 | 98,301 | 98,302 | 98,303 | 98,304 |
| | 2-208 | 98,313 | 98,314 | 98,315 | 98,316 | 98,317 | 98,318 | 98,319 | 98,320 |
| | 2-209 | 98,329 | 98,330 | 98,331 | 98,332 | 98,333 | 98,334 | 98,335 | 98,336 |
| | 2-210 | 98,345 | 98,346 | 98,347 | 98,348 | 98,349 | 98,350 | 98,351 | 98,352 |
| | 2-211 | 98,361 | 98,362 | 98,363 | 98,364 | 98,365 | 98,366 | 98,367 | 98,368 |
| | 2-212 | 98,377 | 98,378 | 98,379 | 98,380 | 98,381 | 98,382 | 98,383 | 98,384 |
| | 2-213 | 98,393 | 98,394 | 98,395 | 98,396 | 98,397 | 98,398 | 98,399 | 98,400 |
| | 2-214 | 98,409 | 98,410 | 98,411 | 98,412 | 98,413 | 98,414 | 98,415 | 98,416 |
| | 2-215 | 98,425 | 98,426 | 98,427 | 98,428 | 98,429 | 98,430 | 98,431 | 98,432 |
| | 2-216 | 98,441 | 98,442 | 98,443 | 98,444 | 98,445 | 98,446 | 98,447 | 98,448 |
| | 2-217 | 98,457 | 98,458 | 98,459 | 98,460 | 98,461 | 98,462 | 98,463 | 98,464 |
| | 2-218 | 98,473 | 98,474 | 98,475 | 98,476 | 98,477 | 98,478 | 98,479 | 98,480 |
| | 2-219 | 98,489 | 98,490 | 98,491 | 98,492 | 98,493 | 98,494 | 98,495 | 98,496 |
| | 2-220 | 98,505 | 98,506 | 98,507 | 98,508 | 98,509 | 98,510 | 98,511 | 98,512 |
| | 2-221 | 98,521 | 98,522 | 98,523 | 98,524 | 98,525 | 98,526 | 98,527 | 98,528 |
| | 2-222 | 98,537 | 98,538 | 98,539 | 98,540 | 98,541 | 98,542 | 98,543 | 98,544 |
| | 2-223 | 98,553 | 98,554 | 98,555 | 98,556 | 98,557 | 98,558 | 98,559 | 98,560 |
| | 2-224 | 98,569 | 98,570 | 98,571 | 98,572 | 98,573 | 98,574 | 98,575 | 98,576 |
| | 2-225 | 98,585 | 98,586 | 98,587 | 98,588 | 98,589 | 98,590 | 98,591 | 98,592 |

| | | Compound represented by the formula (1) | | | | | | | |
|---|---|---|---|---|---|---|---|---|---|
| | | 1-209 | 1-210 | 1-211 | 1-212 | 1-213 | 1-214 | 1-215 | 1-216 |
| Compound represented by the formula (2) | 2-151 | 97,409 | 97,410 | 97,411 | 97,412 | 97,413 | 97,414 | 97,415 | 97,416 |
| | 2-152 | 97,425 | 97,426 | 97,427 | 97,428 | 97,429 | 97,430 | 97,431 | 97,432 |
| | 2-153 | 97,441 | 97,442 | 97,443 | 97,444 | 97,445 | 97,446 | 97,447 | 97,448 |
| | 2-154 | 97,457 | 97,458 | 97,459 | 97,460 | 97,461 | 97,462 | 97,463 | 97,464 |
| | 2-155 | 97,473 | 97,474 | 97,475 | 97,476 | 97,477 | 97,478 | 97,479 | 97,480 |
| | 2-156 | 97,489 | 97,490 | 97,491 | 97,492 | 97,493 | 97,494 | 97,495 | 97,496 |
| | 2-157 | 97,505 | 97,506 | 97,507 | 97,508 | 97,509 | 97,510 | 97,511 | 97,512 |
| | 2-158 | 97,521 | 97,522 | 97,523 | 97,524 | 97,525 | 97,526 | 97,527 | 97,528 |
| | 2-159 | 97,537 | 97,538 | 97,539 | 97,540 | 97,541 | 97,542 | 97,543 | 97,544 |
| | 2-160 | 97,553 | 97,554 | 97,555 | 97,556 | 97,557 | 97,558 | 97,559 | 97,560 |
| | 2-161 | 97,569 | 97,570 | 97,571 | 97,572 | 97,573 | 97,574 | 97,575 | 97,576 |
| | 2-162 | 97,585 | 97,586 | 97,587 | 97,588 | 97,589 | 97,590 | 97,591 | 97,592 |
| | 2-163 | 97,601 | 97,602 | 97,603 | 97,604 | 97,605 | 97,606 | 97,607 | 97,608 |
| | 2-164 | 97,617 | 97,618 | 97,619 | 97,620 | 97,621 | 97,622 | 97,623 | 97,624 |
| | 2-165 | 97,633 | 97,634 | 97,635 | 97,636 | 97,637 | 97,638 | 97,639 | 97,640 |
| | 2-166 | 97,649 | 97,650 | 97,651 | 97,652 | 97,653 | 97,654 | 97,655 | 97,656 |
| | 2-167 | 97,665 | 97,666 | 97,667 | 97,668 | 97,669 | 97,670 | 97,671 | 97,672 |

TABLE 75-continued

| | | | | | | | | | |
|---|---|---|---|---|---|---|---|---|---|
| | 2-168 | 97,681 | 97,682 | 97,683 | 97,684 | 97,685 | 97,686 | 97,687 | 97,688 |
| | 2-169 | 97,697 | 97,698 | 97,699 | 97,700 | 97,701 | 97,702 | 97,703 | 97,704 |
| | 2-170 | 97,713 | 97,714 | 97,715 | 97,716 | 97,717 | 97,718 | 97,719 | 97,720 |
| | 2-171 | 97,729 | 97,730 | 97,731 | 97,732 | 97,733 | 97,734 | 97,735 | 97,736 |
| | 2-172 | 97,745 | 97,746 | 97,747 | 97,748 | 97,749 | 97,750 | 97,751 | 97,752 |
| | 2-173 | 97,761 | 97,762 | 97,763 | 97,764 | 97,765 | 97,766 | 97,767 | 97,768 |
| | 2-174 | 97,777 | 97,778 | 97,779 | 97,780 | 97,781 | 97,782 | 97,783 | 97,784 |
| | 2-175 | 97,793 | 97,794 | 97,795 | 97,796 | 97,797 | 97,798 | 97,799 | 97,800 |
| | 2-176 | 97,809 | 97,810 | 97,811 | 97,812 | 97,813 | 97,814 | 97,815 | 97,816 |
| | 2-177 | 97,825 | 97,826 | 97,827 | 97,828 | 97,829 | 97,830 | 97,831 | 97,832 |
| | 2-178 | 97,841 | 97,842 | 97,843 | 97,844 | 97,845 | 97,846 | 97,847 | 97,848 |
| | 2-179 | 97,857 | 97,858 | 97,859 | 97,860 | 97,861 | 97,862 | 97,863 | 97,864 |
| | 2-180 | 97,873 | 97,874 | 97,875 | 97,876 | 97,877 | 97,878 | 97,879 | 97,880 |
| | 2-181 | 97,889 | 97,890 | 97,891 | 97,892 | 97,893 | 97,894 | 97,895 | 97,896 |
| | 2-182 | 97,905 | 97,906 | 97,907 | 97,908 | 97,909 | 97,910 | 97,911 | 97,912 |
| | 2-183 | 97,921 | 97,922 | 97,923 | 97,924 | 97,925 | 97,926 | 97,927 | 97,928 |
| | 2-184 | 97,937 | 97,938 | 97,939 | 97,940 | 97,941 | 97,942 | 97,943 | 97,944 |
| | 2-185 | 97,953 | 97,954 | 97,955 | 97,956 | 97,957 | 97,958 | 97,959 | 97,960 |
| | 2-186 | 97,969 | 97,970 | 97,971 | 97,972 | 97,973 | 97,974 | 97,975 | 97,976 |
| | 2-187 | 97,985 | 97,986 | 97,987 | 97,988 | 97,989 | 97,990 | 97,991 | 97,992 |
| | 2-188 | 98,001 | 98,002 | 98,003 | 98,004 | 98,005 | 98,006 | 98,007 | 98,008 |
| | 2-189 | 98,017 | 98,018 | 98,019 | 98,020 | 98,021 | 98,022 | 98,023 | 98,024 |
| | 2-190 | 98,033 | 98,034 | 98,035 | 98,036 | 98,037 | 98,038 | 98,039 | 98,040 |
| | 2-191 | 98,049 | 98,050 | 98,051 | 98,052 | 98,053 | 98,054 | 98,055 | 98,056 |
| | 2-192 | 98,065 | 98,066 | 98,067 | 98,068 | 98,069 | 98,070 | 98,071 | 98,072 |
| | 2-193 | 98,081 | 98,082 | 98,083 | 98,084 | 98,085 | 98,086 | 98,087 | 98,088 |
| | 2-194 | 98,097 | 98,098 | 98,099 | 98,100 | 98,101 | 98,102 | 98,103 | 98,104 |
| | 2-195 | 98,113 | 98,114 | 98,115 | 98,116 | 98,117 | 98,118 | 98,119 | 98,120 |
| | 2-196 | 98,129 | 98,130 | 98,131 | 98,132 | 98,133 | 98,134 | 98,135 | 98,136 |
| | 2-197 | 98,145 | 98,146 | 98,147 | 98,148 | 98,149 | 98,150 | 98,151 | 98,152 |
| | 2-198 | 98,161 | 98,162 | 98,163 | 98,164 | 98,165 | 98,166 | 98,167 | 98,168 |
| | 2-199 | 98,177 | 98,178 | 98,179 | 98,180 | 98,181 | 98,182 | 98,183 | 98,184 |
| | 2-200 | 98,193 | 98,194 | 98,195 | 98,196 | 98,197 | 98,198 | 98,199 | 98,200 |
| | 2-201 | 98,209 | 98,210 | 98,211 | 98,212 | 98,213 | 98,214 | 98,215 | 98,216 |
| | 2-202 | 98,225 | 98,226 | 98,227 | 98,228 | 98,229 | 98,230 | 98,231 | 98,232 |
| | 2-203 | 98,241 | 98,242 | 98,243 | 98,244 | 98,245 | 98,246 | 98,247 | 98,248 |
| | 2-204 | 98,257 | 98,258 | 98,259 | 98,260 | 98,261 | 98,262 | 98,263 | 98,264 |
| | 2-205 | 98,273 | 98,274 | 98,275 | 98,276 | 98,277 | 98,278 | 98,279 | 98,280 |
| | 2-206 | 98,289 | 98,290 | 98,291 | 98,292 | 98,293 | 98,294 | 98,295 | 98,296 |
| | 2-207 | 98,305 | 98,306 | 98,307 | 98,308 | 98,309 | 98,310 | 98,311 | 98,312 |
| | 2-208 | 98,321 | 98,322 | 98,323 | 98,324 | 98,325 | 98,326 | 98,327 | 98,328 |
| | 2-209 | 98,337 | 98,338 | 98,339 | 98,340 | 98,341 | 98,342 | 98,343 | 98,344 |
| | 2-210 | 98,353 | 98,354 | 98,355 | 98,356 | 98,357 | 98,358 | 98,359 | 98,360 |
| | 2-211 | 98,369 | 98,370 | 98,371 | 98,372 | 98,373 | 98,374 | 98,375 | 98,376 |
| | 2-212 | 98,385 | 98,386 | 98,387 | 98,388 | 98,389 | 98,390 | 98,391 | 98,392 |
| | 2-213 | 98,401 | 98,402 | 98,403 | 98,404 | 98,405 | 98,406 | 98,407 | 98,408 |
| | 2-214 | 98,417 | 98,418 | 98,419 | 98,420 | 98,421 | 98,422 | 98,423 | 98,424 |
| | 2-215 | 98,433 | 98,434 | 98,435 | 98,436 | 98,437 | 98,438 | 98,439 | 98,440 |
| | 2-216 | 98,449 | 98,450 | 98,451 | 98,452 | 98,453 | 98,454 | 98,455 | 98,456 |
| | 2-217 | 98,465 | 98,466 | 98,467 | 98,468 | 98,469 | 98,470 | 98,471 | 98,472 |
| | 2-218 | 98,481 | 98,482 | 98,483 | 98,484 | 98,485 | 98,486 | 98,487 | 98,488 |
| | 2-219 | 98,497 | 98,498 | 98,499 | 98,500 | 98,501 | 98,502 | 98,503 | 98,504 |
| | 2-220 | 98,513 | 98,514 | 98,515 | 98,516 | 98,517 | 98,518 | 98,519 | 98,520 |
| | 2-221 | 98,529 | 98,530 | 98,531 | 98,532 | 98,533 | 98,534 | 98,535 | 98,536 |
| | 2-222 | 98,545 | 98,546 | 98,547 | 98,548 | 98,549 | 98,550 | 98,551 | 98,552 |
| | 2-223 | 98,561 | 98,562 | 98,563 | 98,564 | 98,565 | 98,566 | 98,567 | 98,568 |
| | 2-224 | 98,577 | 98,578 | 98,579 | 98,580 | 98,581 | 98,582 | 98,583 | 98,584 |
| | 2-225 | 98,593 | 98,594 | 98,595 | 98,596 | 98,597 | 98,598 | 98,599 | 98,600 |

TABLE 76

| | | Compound represented by the formula (1) | | | | | | | |
|---|---|---|---|---|---|---|---|---|---|
| | | 1-201 | 1-202 | 1-203 | 1-204 | 1-205 | 1-206 | 1-207 | 1-208 |
| Compound represented by the formula (2) | 2-226 | 98,601 | 98,602 | 98,603 | 98,604 | 98,605 | 98,606 | 98,607 | 98,608 |
| | 2-227 | 98,617 | 98,618 | 98,619 | 98,620 | 98,621 | 98,622 | 98,623 | 98,624 |
| | 2-228 | 98,633 | 98,634 | 98,635 | 98,636 | 98,637 | 98,638 | 98,639 | 98,640 |
| | 2-229 | 98,649 | 98,650 | 98,651 | 98,652 | 98,653 | 98,654 | 98,655 | 98,656 |
| | 2-230 | 98,665 | 98,666 | 98,667 | 98,668 | 98,669 | 98,670 | 98,671 | 98,672 |
| | 2-231 | 98,681 | 98,682 | 98,683 | 98,684 | 98,685 | 98,686 | 98,687 | 98,688 |
| | 2-232 | 98,697 | 98,698 | 98,699 | 98,700 | 98,701 | 98,702 | 98,703 | 98,704 |
| | 2-233 | 98,713 | 98,714 | 98,715 | 98,716 | 98,717 | 98,718 | 98,719 | 98,720 |
| | 2-234 | 98,729 | 98,730 | 98,731 | 98,732 | 98,733 | 98,734 | 98,735 | 98,736 |
| | 2-235 | 98,745 | 98,746 | 98,747 | 98,748 | 98,749 | 98,750 | 98,751 | 98,752 |
| | 2-236 | 98,761 | 98,762 | 98,763 | 98,764 | 98,765 | 98,766 | 98,767 | 98,768 |
| | 2-237 | 98,777 | 98,778 | 98,779 | 98,780 | 98,781 | 98,782 | 98,783 | 98,784 |

TABLE 76-continued

| | | | | | | | | | |
|---|---|---|---|---|---|---|---|---|---|
| | 2-238 | 98,793 | 98,794 | 98,795 | 98,796 | 98,797 | 98,798 | 98,799 | 98,800 |
| | 2-239 | 98,809 | 98,810 | 98,811 | 98,812 | 98,813 | 98,814 | 98,815 | 98,816 |
| | 2-240 | 98,825 | 98,826 | 98,827 | 98,828 | 98,829 | 98,830 | 98,831 | 98,832 |
| | 2-241 | 98,841 | 98,842 | 98,843 | 98,844 | 98,845 | 98,846 | 98,847 | 98,848 |
| | 2-242 | 98,857 | 98,858 | 98,859 | 98,860 | 98,861 | 98,862 | 98,863 | 98,864 |
| | 2-243 | 98,873 | 98,874 | 98,875 | 98,876 | 98,877 | 98,878 | 98,879 | 98,880 |
| | 2-244 | 98,889 | 98,890 | 98,891 | 98,892 | 98,893 | 98,894 | 98,895 | 98,896 |
| | 2-245 | 98,905 | 98,906 | 98,907 | 98,908 | 98,909 | 98,910 | 98,911 | 98,912 |
| | 2-246 | 98,921 | 98,922 | 98,923 | 98,924 | 98,925 | 98,926 | 98,927 | 98,928 |
| | 2-247 | 98,937 | 98,938 | 98,939 | 98,940 | 98,941 | 98,942 | 98,943 | 98,944 |
| | 2-248 | 98,953 | 98,954 | 98,955 | 98,956 | 98,957 | 98,958 | 98,959 | 98,960 |
| | 2-249 | 98,969 | 98,970 | 98,971 | 98,972 | 98,973 | 98,974 | 98,975 | 98,976 |
| | 2-250 | 98,985 | 98,986 | 98,987 | 98,988 | 98,989 | 98,990 | 98,991 | 98,992 |
| | 2-251 | 99,001 | 99,002 | 99,003 | 99,004 | 99,005 | 99,006 | 99,007 | 99,008 |
| | 2-252 | 99,017 | 99,018 | 99,019 | 99,020 | 99,021 | 99,022 | 99,023 | 99,024 |
| | 2-253 | 99,033 | 99,034 | 99,035 | 99,036 | 99,037 | 99,038 | 99,039 | 99,040 |
| | 2-254 | 99,049 | 99,050 | 99,051 | 99,052 | 99,053 | 99,054 | 99,055 | 99,056 |
| | 2-255 | 99,065 | 99,066 | 99,067 | 99,068 | 99,069 | 99,070 | 99,071 | 99,072 |
| | 2-256 | 99,081 | 99,082 | 99,083 | 99,084 | 99,085 | 99,086 | 99,087 | 99,088 |
| | 2-257 | 99,097 | 99,098 | 99,099 | 99,100 | 99,101 | 99,102 | 99,103 | 99,104 |
| | 2-258 | 99,113 | 99,114 | 99,115 | 99,116 | 99,117 | 99,118 | 99,119 | 99,120 |
| | 2-259 | 99,129 | 99,130 | 99,131 | 99,132 | 99,133 | 99,134 | 99,135 | 99,136 |
| | 2-260 | 99,145 | 99,146 | 99,147 | 99,148 | 99,149 | 99,150 | 99,151 | 99,152 |
| | 2-261 | 99,161 | 99,162 | 99,163 | 99,164 | 99,165 | 99,166 | 99,167 | 99,168 |
| | 2-262 | 99,177 | 99,178 | 99,179 | 99,180 | 99,181 | 99,182 | 99,183 | 99,184 |
| | 2-263 | 99,193 | 99,194 | 99,195 | 99,196 | 99,197 | 99,198 | 99,199 | 99,200 |
| | 2-264 | 99,209 | 99,210 | 99,211 | 99,212 | 99,213 | 99,214 | 99,215 | 99,216 |
| | 2-265 | 99,225 | 99,226 | 99,227 | 99,228 | 99,229 | 99,230 | 99,231 | 99,232 |
| | 2-266 | 99,241 | 99,242 | 99,243 | 99,244 | 99,245 | 99,246 | 99,247 | 99,248 |
| | 2-267 | 99,257 | 99,258 | 99,259 | 99,260 | 99,261 | 99,262 | 99,263 | 99,264 |
| | 2-268 | 99,273 | 99,274 | 99,275 | 99,276 | 99,277 | 99,278 | 99,279 | 99,280 |
| | 2-269 | 99,289 | 99,290 | 99,291 | 99,292 | 99,293 | 99,294 | 99,295 | 99,296 |
| | 2-270 | 99,305 | 99,306 | 99,307 | 99,308 | 99,309 | 99,310 | 99,311 | 99,312 |
| | 2-271 | 99,321 | 99,322 | 99,323 | 99,324 | 99,325 | 99,326 | 99,327 | 99,328 |
| | 2-272 | 99,337 | 99,338 | 99,339 | 99,340 | 99,341 | 99,342 | 99,343 | 99,344 |
| | 2-273 | 99,353 | 99,354 | 99,355 | 99,356 | 99,357 | 99,358 | 99,359 | 99,360 |
| | 2-274 | 99,369 | 99,370 | 99,371 | 99,372 | 99,373 | 99,374 | 99,375 | 99,376 |
| | 2-275 | 99,385 | 99,386 | 99,387 | 99,388 | 99,389 | 99,390 | 99,391 | 99,392 |
| | 2-276 | 99,401 | 99,402 | 99,403 | 99,404 | 99,405 | 99,406 | 99,407 | 99,408 |
| | 2-277 | 99,417 | 99,418 | 99,419 | 99,420 | 99,421 | 99,422 | 99,423 | 99,424 |
| | 2-278 | 99,433 | 99,434 | 99,435 | 99,436 | 99,437 | 99,438 | 99,439 | 99,440 |
| | 2-279 | 99,449 | 99,450 | 99,451 | 99,452 | 99,453 | 99,454 | 99,455 | 99,456 |
| | 2-280 | 99,465 | 99,466 | 99,467 | 99,468 | 99,469 | 99,470 | 99,471 | 99,472 |
| | 2-281 | 99,481 | 99,482 | 99,483 | 99,484 | 99,485 | 99,486 | 99,487 | 99,488 |
| | 2-282 | 99,497 | 99,498 | 99,499 | 99,500 | 99,501 | 99,502 | 99,503 | 99,504 |
| | 2-283 | 99,513 | 99,514 | 99,515 | 99,516 | 99,517 | 99,518 | 99,519 | 99,520 |
| | 2-284 | 99,529 | 99,530 | 99,531 | 99,532 | 99,533 | 99,534 | 99,535 | 99,536 |
| | 2-285 | 99,545 | 99,546 | 99,547 | 99,548 | 99,549 | 99,550 | 99,551 | 99,552 |
| | 2-286 | 99,561 | 99,562 | 99,563 | 99,564 | 99,565 | 99,566 | 99,567 | 99,568 |
| | 2-287 | 99,577 | 99,578 | 99,579 | 99,580 | 99,581 | 99,582 | 99,583 | 99,584 |
| | 2-288 | 99,593 | 99,594 | 99,595 | 99,596 | 99,597 | 99,598 | 99,599 | 99,600 |
| | 2-289 | 99,609 | 99,610 | 99,611 | 99,612 | 99,613 | 99,614 | 99,615 | 99,616 |
| | 2-290 | 99,625 | 99,626 | 99,627 | 99,628 | 99,629 | 99,630 | 99,631 | 99,632 |
| | 2-291 | 99,641 | 99,642 | 99,643 | 99,644 | 99,645 | 99,646 | 99,647 | 99,648 |
| | 2-292 | 99,657 | 99,658 | 99,659 | 99,660 | 99,661 | 99,662 | 99,663 | 99,664 |
| | 2-293 | 99,673 | 99,674 | 99,675 | 99,676 | 99,677 | 99,678 | 99,679 | 99,680 |
| | 2-294 | 99,689 | 99,690 | 99,691 | 99,692 | 99,693 | 99,694 | 99,695 | 99,696 |
| | 2-295 | 99,705 | 99,706 | 99,707 | 99,708 | 99,709 | 99,710 | 99,711 | 99,712 |
| | 2-296 | 99,721 | 99,722 | 99,723 | 99,724 | 99,725 | 99,726 | 99,727 | 99,728 |
| | 2-297 | 99,737 | 99,738 | 99,739 | 99,740 | 99,741 | 99,742 | 99,743 | 99,744 |
| | 2-298 | 99,753 | 99,754 | 99,755 | 99,756 | 99,757 | 99,758 | 99,759 | 99,760 |
| | 2-299 | 99,769 | 99,770 | 99,771 | 99,772 | 99,773 | 99,774 | 99,775 | 99,776 |
| | 2-300 | 99,785 | 99,786 | 99,787 | 99,788 | 99,789 | 99,790 | 99,791 | 99,792 |

| | | Compound represented by the formula (1) | | | | | | | |
|---|---|---|---|---|---|---|---|---|---|
| | | 1-209 | 1-210 | 1-211 | 1-212 | 1-213 | 1-214 | 1-215 | 1-216 |
| Compound represented by the formula (2) | 2-226 | 98,609 | 98,610 | 98,611 | 98,612 | 98,613 | 98,614 | 98,615 | 98,616 |
| | 2-227 | 98,625 | 98,626 | 98,627 | 98,628 | 98,629 | 98,630 | 98,631 | 98,632 |
| | 2-228 | 98,641 | 98,642 | 98,643 | 98,644 | 98,645 | 98,646 | 98,647 | 98,648 |
| | 2-229 | 98,657 | 98,658 | 98,659 | 98,660 | 98,661 | 98,662 | 98,663 | 98,664 |
| | 2-230 | 98,673 | 98,674 | 98,675 | 98,676 | 98,677 | 98,678 | 98,679 | 98,680 |
| | 2-231 | 98,689 | 98,690 | 98,691 | 98,692 | 98,693 | 98,694 | 98,695 | 98,696 |
| | 2-232 | 98,705 | 98,706 | 98,707 | 98,708 | 98,709 | 98,710 | 98,711 | 98,712 |
| | 2-233 | 98,721 | 98,722 | 98,723 | 98,724 | 98,725 | 98,726 | 98,727 | 98,728 |
| | 2-234 | 98,737 | 98,738 | 98,739 | 98,740 | 98,741 | 98,742 | 98,743 | 98,744 |
| | 2-235 | 98,753 | 98,754 | 98,755 | 98,756 | 98,757 | 98,758 | 98,759 | 98,760 |
| | 2-236 | 98,769 | 98,770 | 98,771 | 98,772 | 98,773 | 98,774 | 98,775 | 98,776 |
| | 2-237 | 98,785 | 98,786 | 98,787 | 98,788 | 98,789 | 98,790 | 98,791 | 98,792 |

TABLE 76-continued

| | | | | | | | | |
|---|---|---|---|---|---|---|---|---|
| 2-238 | 98,801 | 98,802 | 98,803 | 98,804 | 98,805 | 98,806 | 98,807 | 98,808 |
| 2-239 | 98,817 | 98,818 | 98,819 | 98,820 | 98,821 | 98,822 | 98,823 | 98,824 |
| 2-240 | 98,833 | 98,834 | 98,835 | 98,836 | 98,837 | 98,838 | 98,839 | 98,840 |
| 2-241 | 98,849 | 98,850 | 98,851 | 98,852 | 98,853 | 98,854 | 98,855 | 98,856 |
| 2-242 | 98,865 | 98,866 | 98,867 | 98,868 | 98,869 | 98,870 | 98,871 | 98,872 |
| 2-243 | 98,881 | 98,882 | 98,883 | 98,884 | 98,885 | 98,886 | 98,887 | 98,888 |
| 2-244 | 98,897 | 98,898 | 98,899 | 98,900 | 98,901 | 98,902 | 98,903 | 98,904 |
| 2-245 | 98,913 | 98,914 | 98,915 | 98,916 | 98,917 | 98,918 | 98,919 | 98,920 |
| 2-246 | 98,929 | 98,930 | 98,931 | 98,932 | 98,933 | 98,934 | 98,935 | 98,936 |
| 2-247 | 98,945 | 98,946 | 98,947 | 98,948 | 98,949 | 98,950 | 98,951 | 98,952 |
| 2-248 | 98,961 | 98,962 | 98,963 | 98,964 | 98,965 | 98,966 | 98,967 | 98,968 |
| 2-249 | 98,977 | 98,978 | 98,979 | 98,980 | 98,981 | 98,982 | 98,983 | 98,984 |
| 2-250 | 98,993 | 98,994 | 98,995 | 98,996 | 98,997 | 98,998 | 98,999 | 99,000 |
| 2-251 | 99,009 | 99,010 | 99,011 | 99,012 | 99,013 | 99,014 | 99,015 | 99,016 |
| 2-252 | 99,025 | 99,026 | 99,027 | 99,028 | 99,029 | 99,030 | 99,031 | 99,032 |
| 2-253 | 99,041 | 99,042 | 99,043 | 99,044 | 99,045 | 99,046 | 99,047 | 99,048 |
| 2-254 | 99,057 | 99,058 | 99,059 | 99,060 | 99,061 | 99,062 | 99,063 | 99,064 |
| 2-255 | 99,073 | 99,074 | 99,075 | 99,076 | 99,077 | 99,078 | 99,079 | 99,080 |
| 2-256 | 99,089 | 99,090 | 99,091 | 99,092 | 99,093 | 99,094 | 99,095 | 99,096 |
| 2-257 | 99,105 | 99,106 | 99,107 | 99,108 | 99,109 | 99,110 | 99,111 | 99,112 |
| 2-258 | 99,121 | 99,122 | 99,123 | 99,124 | 99,125 | 99,126 | 99,127 | 99,128 |
| 2-259 | 99,137 | 99,138 | 99,139 | 99,140 | 99,141 | 99,142 | 99,143 | 99,144 |
| 2-260 | 99,153 | 99,154 | 99,155 | 99,156 | 99,157 | 99,158 | 99,159 | 99,160 |
| 2-261 | 99,169 | 99,170 | 99,171 | 99,172 | 99,173 | 99,174 | 99,175 | 99,176 |
| 2-262 | 99,185 | 99,186 | 99,187 | 99,188 | 99,189 | 99,190 | 99,191 | 99,192 |
| 2-263 | 99,201 | 99,202 | 99,203 | 99,204 | 99,205 | 99,206 | 99,207 | 99,208 |
| 2-264 | 99,217 | 99,218 | 99,219 | 99,220 | 99,221 | 99,222 | 99,223 | 99,224 |
| 2-265 | 99,233 | 99,234 | 99,235 | 99,236 | 99,237 | 99,238 | 99,239 | 99,240 |
| 2-266 | 99,249 | 99,250 | 99,251 | 99,252 | 99,253 | 99,254 | 99,255 | 99,256 |
| 2-267 | 99,265 | 99,266 | 99,267 | 99,268 | 99,269 | 99,270 | 99,271 | 99,272 |
| 2-268 | 99,281 | 99,282 | 99,283 | 99,284 | 99,285 | 99,286 | 99,287 | 99,288 |
| 2-269 | 99,297 | 99,298 | 99,299 | 99,300 | 99,301 | 99,302 | 99,303 | 99,304 |
| 2-270 | 99,313 | 99,314 | 99,315 | 99,316 | 99,317 | 99,318 | 99,319 | 99,320 |
| 2-271 | 99,329 | 99,330 | 99,331 | 99,332 | 99,333 | 99,334 | 99,335 | 99,336 |
| 2-272 | 99,345 | 99,346 | 99,347 | 99,348 | 99,349 | 99,350 | 99,351 | 99,352 |
| 2-273 | 99,361 | 99,362 | 99,363 | 99,364 | 99,365 | 99,366 | 99,367 | 99,368 |
| 2-274 | 99,377 | 99,378 | 99,379 | 99,380 | 99,381 | 99,382 | 99,383 | 99,384 |
| 2-275 | 99,393 | 99,394 | 99,395 | 99,396 | 99,397 | 99,398 | 99,399 | 99,400 |
| 2-276 | 99,409 | 99,410 | 99,411 | 99,412 | 99,413 | 99,414 | 99,415 | 99,416 |
| 2-277 | 99,425 | 99,426 | 99,427 | 99,428 | 99,429 | 99,430 | 99,431 | 99,432 |
| 2-278 | 99,441 | 99,442 | 99,443 | 99,444 | 99,445 | 99,446 | 99,447 | 99,448 |
| 2-279 | 99,457 | 99,458 | 99,459 | 99,460 | 99,461 | 99,462 | 99,463 | 99,464 |
| 2-280 | 99,473 | 99,474 | 99,475 | 99,476 | 99,477 | 99,478 | 99,479 | 99,480 |
| 2-281 | 99,489 | 99,490 | 99,491 | 99,492 | 99,493 | 99,494 | 99,495 | 99,496 |
| 2-282 | 99,505 | 99,506 | 99,507 | 99,508 | 99,509 | 99,510 | 99,511 | 99,512 |
| 2-283 | 99,521 | 99,522 | 99,523 | 99,524 | 99,525 | 99,526 | 99,527 | 99,528 |
| 2-284 | 99,537 | 99,538 | 99,539 | 99,540 | 99,541 | 99,542 | 99,543 | 99,544 |
| 2-285 | 99,553 | 99,554 | 99,555 | 99,556 | 99,557 | 99,558 | 99,559 | 99,560 |
| 2-286 | 99,569 | 99,570 | 99,571 | 99,572 | 99,573 | 99,574 | 99,575 | 99,576 |
| 2-287 | 99,585 | 99,586 | 99,587 | 99,588 | 99,589 | 99,590 | 99,591 | 99,592 |
| 2-288 | 99,601 | 99,602 | 99,603 | 99,604 | 99,605 | 99,606 | 99,607 | 99,608 |
| 2-289 | 99,617 | 99,618 | 99,619 | 99,620 | 99,621 | 99,622 | 99,623 | 99,624 |
| 2-290 | 99,633 | 99,634 | 99,635 | 99,636 | 99,637 | 99,638 | 99,639 | 99,640 |
| 2-291 | 99,649 | 99,650 | 99,651 | 99,652 | 99,653 | 99,654 | 99,655 | 99,656 |
| 2-292 | 99,665 | 99,666 | 99,667 | 99,668 | 99,669 | 99,670 | 99,671 | 99,672 |
| 2-293 | 99,681 | 99,682 | 99,683 | 99,684 | 99,685 | 99,686 | 99,687 | 99,688 |
| 2-294 | 99,697 | 99,698 | 99,699 | 99,700 | 99,701 | 99,702 | 99,703 | 99,704 |
| 2-295 | 99,713 | 99,714 | 99,715 | 99,716 | 99,717 | 99,718 | 99,719 | 99,720 |
| 2-296 | 99,729 | 99,730 | 99,731 | 99,732 | 99,733 | 99,734 | 99,735 | 99,736 |
| 2-297 | 99,745 | 99,746 | 99,747 | 99,748 | 99,749 | 99,750 | 99,751 | 99,752 |
| 2-298 | 99,761 | 99,762 | 99,763 | 99,764 | 99,765 | 99,766 | 99,767 | 99,768 |
| 2-299 | 99,777 | 99,778 | 99,779 | 99,780 | 99,781 | 99,782 | 99,783 | 99,784 |
| 2-300 | 99,793 | 99,794 | 99,795 | 99,796 | 99,797 | 99,798 | 99,799 | 99,800 |

TABLE 77

| | | Compound represented by the formula (1) | | | | | | | |
|---|---|---|---|---|---|---|---|---|---|
| | | 1-201 | 1-202 | 1-203 | 1-204 | 1-205 | 1-206 | 1-207 | 1-208 |
| Compound represented by the formula (2) | 2-301 | 99,801 | 99,802 | 99,803 | 99,804 | 99,805 | 99,806 | 99,807 | 99,808 |
| | 2-302 | 99,817 | 99,818 | 99,819 | 99,820 | 99,821 | 99,822 | 99,823 | 99,824 |
| | 2-303 | 99,833 | 99,834 | 99,835 | 99,836 | 99,837 | 99,838 | 99,839 | 99,840 |
| | 2-304 | 99,849 | 99,850 | 99,851 | 99,852 | 99,853 | 99,854 | 99,855 | 99,856 |
| | 2-305 | 99,865 | 99,866 | 99,867 | 99,868 | 99,869 | 99,870 | 99,871 | 99,872 |
| | 2-306 | 99,881 | 99,882 | 99,883 | 99,884 | 99,885 | 99,886 | 99,887 | 99,888 |
| | 2-307 | 99,897 | 99,898 | 99,899 | 99,900 | 99,901 | 99,902 | 99,903 | 99,904 |

TABLE 77-continued

| | | | | | | | | |
|---|---|---|---|---|---|---|---|---|
| 2-308 | 99,913 | 99,914 | 99,915 | 99,916 | 99,917 | 99,918 | 99,919 | 99,920 |
| 2-309 | 99,929 | 99,930 | 99,931 | 99,932 | 99,933 | 99,934 | 99,935 | 99,936 |
| 2-310 | 99,945 | 99,946 | 99,947 | 99,948 | 99,949 | 99,950 | 99,951 | 99,952 |
| 2-311 | 99,961 | 99,962 | 99,963 | 99,964 | 99,965 | 99,966 | 99,967 | 99,968 |
| 2-312 | 99,977 | 99,978 | 99,979 | 99,980 | 99,981 | 99,982 | 99,983 | 99,984 |
| 2-313 | 99,993 | 99,994 | 99,995 | 99,996 | 99,997 | 99,998 | 99,999 | 100,000 |
| 2-314 | 100,009 | 100,010 | 100,011 | 100,012 | 100,013 | 100,014 | 100,015 | 100,016 |
| 2-315 | 100,025 | 100,026 | 100,027 | 100,028 | 100,029 | 100,030 | 100,031 | 100,032 |
| 2-316 | 100,041 | 100,042 | 100,043 | 100,044 | 100,045 | 100,046 | 100,047 | 100,048 |
| 2-317 | 100,057 | 100,058 | 100,059 | 100,060 | 100,061 | 100,062 | 100,063 | 100,064 |
| 2-318 | 100,073 | 100,074 | 100,075 | 100,076 | 100,077 | 100,078 | 100,079 | 100,080 |
| 2-319 | 100,089 | 100,090 | 100,091 | 100,092 | 100,093 | 100,094 | 100,095 | 100,096 |
| 2-320 | 100,105 | 100,106 | 100,107 | 100,108 | 100,109 | 100,110 | 100,111 | 100,112 |
| 2-321 | 100,121 | 100,122 | 100,123 | 100,124 | 100,125 | 100,126 | 100,127 | 100,128 |
| 2-322 | 100,137 | 100,138 | 100,139 | 100,140 | 100,141 | 100,142 | 100,143 | 100,144 |
| 2-323 | 100,153 | 100,154 | 100,155 | 100,156 | 100,157 | 100,158 | 100,159 | 100,160 |
| 2-324 | 100,169 | 100,170 | 100,171 | 100,172 | 100,173 | 100,174 | 100,175 | 100,176 |
| 2-325 | 100,185 | 100,186 | 100,187 | 100,188 | 100,189 | 100,190 | 100,191 | 100,192 |
| 2-326 | 100,201 | 100,202 | 100,203 | 100,204 | 100,205 | 100,206 | 100,207 | 100,208 |
| 2-327 | 100,217 | 100,218 | 100,219 | 100,220 | 100,221 | 100,222 | 100,223 | 100,224 |
| 2-328 | 100,233 | 100,234 | 100,235 | 100,236 | 100,237 | 100,238 | 100,239 | 100,240 |
| 2-329 | 100,249 | 100,250 | 100,251 | 100,252 | 100,253 | 100,254 | 100,255 | 100,256 |
| 2-330 | 100,265 | 100,266 | 100,267 | 100,268 | 100,269 | 100,270 | 100,271 | 100,272 |
| 2-331 | 100,281 | 100,282 | 100,283 | 100,284 | 100,285 | 100,286 | 100,287 | 100,288 |
| 2-332 | 100,297 | 100,298 | 100,299 | 100,300 | 100,301 | 100,302 | 100,303 | 100,304 |
| 2-333 | 100,313 | 100,314 | 100,315 | 100,316 | 100,317 | 100,318 | 100,319 | 100,320 |
| 2-334 | 100,329 | 100,330 | 100,331 | 100,332 | 100,333 | 100,334 | 100,335 | 100,336 |
| 2-335 | 100,345 | 100,346 | 100,347 | 100,348 | 100,349 | 100,350 | 100,351 | 100,352 |
| 2-336 | 100,361 | 100,362 | 100,363 | 100,364 | 100,365 | 100,366 | 100,367 | 100,368 |
| 2-337 | 100,377 | 100,378 | 100,379 | 100,380 | 100,381 | 100,382 | 100,383 | 100,384 |
| 2-338 | 100,393 | 100,394 | 100,395 | 100,396 | 100,397 | 100,398 | 100,399 | 100,400 |
| 2-339 | 100,409 | 100,410 | 100,411 | 100,412 | 100,413 | 100,414 | 100,415 | 100,416 |
| 2-340 | 100,425 | 100,426 | 100,427 | 100,428 | 100,429 | 100,430 | 100,431 | 100,432 |
| 2-341 | 100,441 | 100,442 | 100,443 | 100,444 | 100,445 | 100,446 | 100,447 | 100,448 |
| 2-342 | 100,457 | 100,458 | 100,459 | 100,460 | 100,461 | 100,462 | 100,463 | 100,464 |
| 2-343 | 100,473 | 100,474 | 100,475 | 100,476 | 100,477 | 100,478 | 100,479 | 100,480 |
| 2-344 | 100,489 | 100,490 | 100,491 | 100,492 | 100,493 | 100,494 | 100,495 | 100,496 |
| 2-345 | 100,505 | 100,506 | 100,507 | 100,508 | 100,509 | 100,510 | 100,511 | 100,512 |
| 2-346 | 100,521 | 100,522 | 100,523 | 100,524 | 100,525 | 100,526 | 100,527 | 100,528 |
| 2-347 | 100,537 | 100,538 | 100,539 | 100,540 | 100,541 | 100,542 | 100,543 | 100,544 |
| 2-348 | 100,553 | 100,554 | 100,555 | 100,556 | 100,557 | 100,558 | 100,559 | 100,560 |
| 2-349 | 100,569 | 100,570 | 100,571 | 100,572 | 100,573 | 100,574 | 100,575 | 100,576 |
| 2-350 | 100,585 | 100,586 | 100,587 | 100,588 | 100,589 | 100,590 | 100,591 | 100,592 |
| 2-351 | 100,601 | 100,602 | 100,603 | 100,604 | 100,605 | 100,606 | 100,607 | 100,608 |
| 2-352 | 100,617 | 100,618 | 100,619 | 100,620 | 100,621 | 100,622 | 100,623 | 100,624 |
| 2-353 | 100,633 | 100,634 | 100,635 | 100,636 | 100,637 | 100,638 | 100,639 | 100,640 |
| 2-354 | 100,649 | 100,650 | 100,651 | 100,652 | 100,653 | 100,654 | 100,655 | 100,656 |
| 2-355 | 100,665 | 100,666 | 100,667 | 100,668 | 100,669 | 100,670 | 100,671 | 100,672 |
| 2-356 | 100,681 | 100,682 | 100,683 | 100,684 | 100,685 | 100,686 | 100,687 | 100,688 |
| 2-357 | 100,697 | 100,698 | 100,699 | 100,700 | 100,701 | 100,702 | 100,703 | 100,704 |
| 2-358 | 100,713 | 100,714 | 100,715 | 100,716 | 100,717 | 100,718 | 100,719 | 100,720 |
| 2-359 | 100,729 | 100,730 | 100,731 | 100,732 | 100,733 | 100,734 | 100,735 | 100,736 |
| 2-360 | 100,745 | 100,746 | 100,747 | 100,748 | 100,749 | 100,750 | 100,751 | 100,752 |
| 2-361 | 100,761 | 100,762 | 100,763 | 100,764 | 100,765 | 100,766 | 100,767 | 100,768 |
| 2-362 | 100,777 | 100,778 | 100,779 | 100,780 | 100,781 | 100,782 | 100,783 | 100,784 |
| 2-363 | 100,793 | 100,794 | 100,795 | 100,796 | 100,797 | 100,798 | 100,799 | 100,800 |
| 2-364 | 100,809 | 100,810 | 100,811 | 100,812 | 100,813 | 100,814 | 100,815 | 100,816 |
| 2-365 | 100,825 | 100,826 | 100,827 | 100,828 | 100,829 | 100,830 | 100,831 | 100,832 |
| 2-366 | 100,841 | 100,842 | 100,843 | 100,844 | 100,845 | 100,846 | 100,847 | 100,848 |
| 2-367 | 100,857 | 100,858 | 100,859 | 100,860 | 100,861 | 100,862 | 100,863 | 100,864 |
| 2-368 | 100,873 | 100,874 | 100,875 | 100,876 | 100,877 | 100,878 | 100,879 | 100,880 |
| 2-369 | 100,889 | 100,890 | 100,891 | 100,892 | 100,893 | 100,894 | 100,895 | 100,896 |
| 2-370 | 100,905 | 100,906 | 100,907 | 100,908 | 100,909 | 100,910 | 100,911 | 100,912 |
| 2-371 | 100,921 | 100,922 | 100,923 | 100,924 | 100,925 | 100,926 | 100,927 | 100,928 |
| 2-372 | 100,937 | 100,938 | 100,939 | 100,940 | 100,941 | 100,942 | 100,943 | 100,944 |
| 2-373 | 100,953 | 100,954 | 100,955 | 100,956 | 100,957 | 100,958 | 100,959 | 100,960 |
| 2-374 | 100,969 | 100,970 | 100,971 | 100,972 | 100,973 | 100,974 | 100,975 | 100,976 |
| 2-375 | 100,985 | 100,986 | 100,987 | 100,988 | 100,989 | 100,990 | 100,991 | 100,992 |

| | | Compound represented by the formula (1) | | | | | | | |
|---|---|---|---|---|---|---|---|---|---|
| | | 1-209 | 1-210 | 1-211 | 1-212 | 1-213 | 1-214 | 1-215 | 1-216 |
| Compound represented by the formula (2) | 2-301 | 99,809 | 99,810 | 99,811 | 99,812 | 99,813 | 99,814 | 99,815 | 99,816 |
| | 2-302 | 99,825 | 99,826 | 99,827 | 99,828 | 99,829 | 99,830 | 99,831 | 99,832 |
| | 2-303 | 99,841 | 99,842 | 99,843 | 99,844 | 99,845 | 99,846 | 99,847 | 99,848 |
| | 2-304 | 99,857 | 99,858 | 99,859 | 99,860 | 99,861 | 99,862 | 99,863 | 99,864 |
| | 2-305 | 99,873 | 99,874 | 99,875 | 99,876 | 99,877 | 99,878 | 99,879 | 99,880 |
| | 2-306 | 99,889 | 99,890 | 99,891 | 99,892 | 99,893 | 99,894 | 99,895 | 99,896 |
| | 2-307 | 99,905 | 99,906 | 99,907 | 99,908 | 99,909 | 99,910 | 99,911 | 99,912 |

TABLE 77-continued

| | | | | | | | | |
|---|---|---|---|---|---|---|---|---|
| 2-308 | 99,921 | 99,922 | 99,923 | 99,924 | 99,925 | 99,926 | 99,927 | 99,928 |
| 2-309 | 99,937 | 99,938 | 99,939 | 99,940 | 99,941 | 99,942 | 99,943 | 99,944 |
| 2-310 | 99,953 | 99,954 | 99,955 | 99,956 | 99,957 | 99,958 | 99,959 | 99,960 |
| 2-311 | 99,969 | 99,970 | 99,971 | 99,972 | 99,973 | 99,974 | 99,975 | 99,976 |
| 2-312 | 99,985 | 99,986 | 99,987 | 99,988 | 99,989 | 99,990 | 99,991 | 99,992 |
| 2-313 | 100,001 | 100,002 | 100,003 | 100,004 | 100,005 | 100,006 | 100,007 | 100,008 |
| 2-314 | 100,017 | 100,018 | 100,019 | 100,020 | 100,021 | 100,022 | 100,023 | 100,024 |
| 2-315 | 100,033 | 100,034 | 100,035 | 100,036 | 100,037 | 100,038 | 100,039 | 100,040 |
| 2-316 | 100,049 | 100,050 | 100,051 | 100,052 | 100,053 | 100,054 | 100,055 | 100,056 |
| 2-317 | 100,065 | 100,066 | 100,067 | 100,068 | 100,069 | 100,070 | 100,071 | 100,072 |
| 2-318 | 100,081 | 100,082 | 100,083 | 100,084 | 100,085 | 100,086 | 100,087 | 100,088 |
| 2-319 | 100,097 | 100,098 | 100,099 | 100,100 | 100,101 | 100,102 | 100,103 | 100,104 |
| 2-320 | 100,113 | 100,114 | 100,115 | 100,116 | 100,117 | 100,118 | 100,119 | 100,120 |
| 2-321 | 100,129 | 100,130 | 100,131 | 100,132 | 100,133 | 100,134 | 100,135 | 100,136 |
| 2-322 | 100,145 | 100,146 | 100,147 | 100,148 | 100,149 | 100,150 | 100,151 | 100,152 |
| 2-323 | 100,161 | 100,162 | 100,163 | 100,164 | 100,165 | 100,166 | 100,167 | 100,168 |
| 2-324 | 100,177 | 100,178 | 100,179 | 100,180 | 100,181 | 100,182 | 100,183 | 100,184 |
| 2-325 | 100,193 | 100,194 | 100,195 | 100,196 | 100,197 | 100,198 | 100,199 | 100,200 |
| 2-326 | 100,209 | 100,210 | 100,211 | 100,212 | 100,213 | 100,214 | 100,215 | 100,216 |
| 2-327 | 100,225 | 100,226 | 100,227 | 100,228 | 100,229 | 100,230 | 100,231 | 100,232 |
| 2-328 | 100,241 | 100,242 | 100,243 | 100,244 | 100,245 | 100,246 | 100,247 | 100,248 |
| 2-329 | 100,257 | 100,258 | 100,259 | 100,260 | 100,261 | 100,262 | 100,263 | 100,264 |
| 2-330 | 100,273 | 100,274 | 100,275 | 100,276 | 100,277 | 100,278 | 100,279 | 100,280 |
| 2-331 | 100,289 | 100,290 | 100,291 | 100,292 | 100,293 | 100,294 | 100,295 | 100,296 |
| 2-332 | 100,305 | 100,306 | 100,307 | 100,308 | 100,309 | 100,310 | 100,311 | 100,312 |
| 2-333 | 100,321 | 100,322 | 100,323 | 100,324 | 100,325 | 100,326 | 100,327 | 100,328 |
| 2-334 | 100,337 | 100,338 | 100,339 | 100,340 | 100,341 | 100,342 | 100,343 | 100,344 |
| 2-335 | 100,353 | 100,354 | 100,355 | 100,356 | 100,357 | 100,358 | 100,359 | 100,360 |
| 2-336 | 100,369 | 100,370 | 100,371 | 100,372 | 100,373 | 100,374 | 100,375 | 100,376 |
| 2-337 | 100,385 | 100,386 | 100,387 | 100,388 | 100,389 | 100,390 | 100,391 | 100,392 |
| 2-338 | 100,401 | 100,402 | 100,403 | 100,404 | 100,405 | 100,406 | 100,407 | 100,408 |
| 2-339 | 100,417 | 100,418 | 100,419 | 100,420 | 100,421 | 100,422 | 100,423 | 100,424 |
| 2-340 | 100,433 | 100,434 | 100,435 | 100,436 | 100,437 | 100,438 | 100,439 | 100,440 |
| 2-341 | 100,449 | 100,450 | 100,451 | 100,452 | 100,453 | 100,454 | 100,455 | 100,456 |
| 2-342 | 100,465 | 100,466 | 100,467 | 100,468 | 100,469 | 100,470 | 100,471 | 100,472 |
| 2-343 | 100,481 | 100,482 | 100,483 | 100,484 | 100,485 | 100,486 | 100,487 | 100,488 |
| 2-344 | 100,497 | 100,498 | 100,499 | 100,500 | 100,501 | 100,502 | 100,503 | 100,504 |
| 2-345 | 100,513 | 100,514 | 100,515 | 100,516 | 100,517 | 100,518 | 100,519 | 100,520 |
| 2-346 | 100,529 | 100,530 | 100,531 | 100,532 | 100,533 | 100,534 | 100,535 | 100,536 |
| 2-347 | 100,545 | 100,546 | 100,547 | 100,548 | 100,549 | 100,550 | 100,551 | 100,552 |
| 2-348 | 100,561 | 100,562 | 100,563 | 100,564 | 100,565 | 100,566 | 100,567 | 100,568 |
| 2-349 | 100,577 | 100,578 | 100,579 | 100,580 | 100,581 | 100,582 | 100,583 | 100,584 |
| 2-350 | 100,593 | 100,594 | 100,595 | 100,596 | 100,597 | 100,598 | 100,599 | 100,600 |
| 2-351 | 100,609 | 100,610 | 100,611 | 100,612 | 100,613 | 100,614 | 100,615 | 100,616 |
| 2-352 | 100,625 | 100,626 | 100,627 | 100,628 | 100,629 | 100,630 | 100,631 | 100,632 |
| 2-353 | 100,641 | 100,642 | 100,643 | 100,644 | 100,645 | 100,646 | 100,647 | 100,648 |
| 2-354 | 100,657 | 100,658 | 100,659 | 100,660 | 100,661 | 100,662 | 100,663 | 100,664 |
| 2-355 | 100,673 | 100,674 | 100,675 | 100,676 | 100,677 | 100,678 | 100,679 | 100,680 |
| 2-356 | 100,689 | 100,690 | 100,691 | 100,692 | 100,693 | 100,694 | 100,695 | 100,696 |
| 2-357 | 100,705 | 100,706 | 100,707 | 100,708 | 100,709 | 100,710 | 100,711 | 100,712 |
| 2-358 | 100,721 | 100,722 | 100,723 | 100,724 | 100,725 | 100,726 | 100,727 | 100,728 |
| 2-359 | 100,737 | 100,738 | 100,739 | 100,740 | 100,741 | 100,742 | 100,743 | 100,744 |
| 2-360 | 100,753 | 100,754 | 100,755 | 100,756 | 100,757 | 100,758 | 100,759 | 100,760 |
| 2-361 | 100,769 | 100,770 | 100,771 | 100,772 | 100,773 | 100,774 | 100,775 | 100,776 |
| 2-362 | 100,785 | 100,786 | 100,787 | 100,788 | 100,789 | 100,790 | 100,791 | 100,792 |
| 2-363 | 100,801 | 100,802 | 100,803 | 100,804 | 100,805 | 100,806 | 100,807 | 100,808 |
| 2-364 | 100,817 | 100,818 | 100,819 | 100,820 | 100,821 | 100,822 | 100,823 | 100,824 |
| 2-365 | 100,833 | 100,834 | 100,835 | 100,836 | 100,837 | 100,838 | 100,839 | 100,840 |
| 2-366 | 100,849 | 100,850 | 100,851 | 100,852 | 100,853 | 100,854 | 100,855 | 100,856 |
| 2-367 | 100,865 | 100,866 | 100,867 | 100,868 | 100,869 | 100,870 | 100,871 | 100,872 |
| 2-368 | 100,881 | 100,882 | 100,883 | 100,884 | 100,885 | 100,886 | 100,887 | 100,888 |
| 2-369 | 100,897 | 100,898 | 100,899 | 100,900 | 100,901 | 100,902 | 100,903 | 100,904 |
| 2-370 | 100,913 | 100,914 | 100,915 | 100,916 | 100,917 | 100,918 | 100,919 | 100,920 |
| 2-371 | 100,929 | 100,930 | 100,931 | 100,932 | 100,933 | 100,934 | 100,935 | 100,936 |
| 2-372 | 100,945 | 100,946 | 100,947 | 100,948 | 100,949 | 100,950 | 100,951 | 100,952 |
| 2-373 | 100,961 | 100,962 | 100,963 | 100,964 | 100,965 | 100,966 | 100,967 | 100,968 |
| 2-374 | 100,977 | 100,978 | 100,979 | 100,980 | 100,981 | 100,982 | 100,983 | 100,984 |
| 2-375 | 100,993 | 100,994 | 100,995 | 100,996 | 100,997 | 100,998 | 100,999 | 101,000 |

TABLE 78

| | | Compound represented by the formula (1) | | | | | | | |
|---|---|---|---|---|---|---|---|---|---|
| | | 1-201 | 1-202 | 1-203 | 1-204 | 1-205 | 1-206 | 1-207 | 1-208 |
| Compound | 2-376 | 101,001 | 101,002 | 101,003 | 101,004 | 101,005 | 101,006 | 101,007 | 101,008 |
| represented | 2-377 | 101,017 | 101,018 | 101,019 | 101,020 | 101,021 | 101,022 | 101,023 | 101,024 |

TABLE 78-continued

| | | | | | | | | | |
|---|---|---|---|---|---|---|---|---|---|
| by the | 2-378 | 101,033 | 101,034 | 101,035 | 101,036 | 101,037 | 101,038 | 101,039 | 101,040 |
| formula | 2-379 | 101,049 | 101,050 | 101,051 | 101,052 | 101,053 | 101,054 | 101,055 | 101,056 |
| (2) | 2-380 | 101,065 | 101,066 | 101,067 | 101,068 | 101,069 | 101,070 | 101,071 | 101,072 |
| | 2-381 | 101,081 | 101,082 | 101,083 | 101,084 | 101,085 | 101,086 | 101,087 | 101,088 |
| | 2-382 | 101,097 | 101,098 | 101,099 | 101,100 | 101,101 | 101,102 | 101,103 | 101,104 |
| | 2-383 | 101,113 | 101,114 | 101,115 | 101,116 | 101,117 | 101,118 | 101,119 | 101,120 |
| | 2-384 | 101,129 | 101,130 | 101,131 | 101,132 | 101,133 | 101,134 | 101,135 | 101,136 |
| | 2-385 | 101,145 | 101,146 | 101,147 | 101,148 | 101,149 | 101,150 | 101,151 | 101,152 |
| | 2-386 | 101,161 | 101,162 | 101,163 | 101,164 | 101,165 | 101,166 | 101,167 | 101,168 |
| | 2-387 | 101,177 | 101,178 | 101,179 | 101,180 | 101,181 | 101,182 | 101,183 | 101,184 |
| | 2-388 | 101,193 | 101,194 | 101,195 | 101,196 | 101,197 | 101,198 | 101,199 | 101,200 |
| | 2-389 | 101,209 | 101,210 | 101,211 | 101,212 | 101,213 | 101,214 | 101,215 | 101,216 |
| | 2-390 | 101,225 | 101,226 | 101,227 | 101,228 | 101,229 | 101,230 | 101,231 | 101,232 |
| | 2-391 | 101,241 | 101,242 | 101,243 | 101,244 | 101,245 | 101,246 | 101,247 | 101,248 |
| | 2-392 | 101,257 | 101,258 | 101,259 | 101,260 | 101,261 | 101,262 | 101,263 | 101,264 |
| | 2-393 | 101,273 | 101,274 | 101,275 | 101,276 | 101,277 | 101,278 | 101,279 | 101,280 |
| | 2-394 | 101,289 | 101,290 | 101,291 | 101,292 | 101,293 | 101,294 | 101,295 | 101,296 |
| | 2-395 | 101,305 | 101,306 | 101,307 | 101,308 | 101,309 | 101,310 | 101,311 | 101,312 |
| | 2-396 | 101,321 | 101,322 | 101,323 | 101,324 | 101,325 | 101,326 | 101,327 | 101,328 |
| | 2-397 | 101,337 | 101,338 | 101,339 | 101,340 | 101,341 | 101,342 | 101,343 | 101,344 |
| | 2-398 | 101,353 | 101,354 | 101,355 | 101,356 | 101,357 | 101,358 | 101,359 | 101,360 |
| | 2-399 | 101,369 | 101,370 | 101,371 | 101,372 | 101,373 | 101,374 | 101,375 | 101,376 |
| | 2-400 | 101,385 | 101,386 | 101,387 | 101,388 | 101,389 | 101,390 | 101,391 | 101,392 |
| | 2-401 | 101,401 | 101,402 | 101,403 | 101,404 | 101,405 | 101,406 | 101,407 | 101,408 |
| | 2-402 | 101,417 | 101,418 | 101,419 | 101,420 | 101,421 | 101,422 | 101,423 | 101,424 |
| | 2-403 | 101,433 | 101,434 | 101,435 | 101,436 | 101,437 | 101,438 | 101,439 | 101,440 |
| | 2-404 | 101,449 | 101,450 | 101,451 | 101,452 | 101,453 | 101,454 | 101,455 | 101,456 |
| | 2-405 | 101,465 | 101,466 | 101,467 | 101,468 | 101,469 | 101,470 | 101,471 | 101,472 |
| | 2-406 | 101,481 | 101,482 | 101,483 | 101,484 | 101,485 | 101,486 | 101,487 | 101,488 |
| | 2-407 | 101,497 | 101,498 | 101,499 | 101,500 | 101,501 | 101,502 | 101,503 | 101,504 |
| | 2-408 | 101,513 | 101,514 | 101,515 | 101,516 | 101,517 | 101,518 | 101,519 | 101,520 |
| | 2-409 | 101,529 | 101,530 | 101,531 | 101,532 | 101,533 | 101,534 | 101,535 | 101,536 |
| | 2-410 | 101,545 | 101,546 | 101,547 | 101,548 | 101,549 | 101,550 | 101,551 | 101,552 |
| | 2-411 | 101,561 | 101,562 | 101,563 | 101,564 | 101,565 | 101,566 | 101,567 | 101,568 |
| | 2-412 | 101,577 | 101,578 | 101,579 | 101,580 | 101,581 | 101,582 | 101,583 | 101,584 |
| | 2-413 | 101,593 | 101,594 | 101,595 | 101,596 | 101,597 | 101,598 | 101,599 | 101,600 |
| | 2-414 | 101,609 | 101,610 | 101,611 | 101,612 | 101,613 | 101,614 | 101,615 | 101,616 |
| | 2-415 | 101,625 | 101,626 | 101,627 | 101,628 | 101,629 | 101,630 | 101,631 | 101,632 |
| | 2-416 | 101,641 | 101,642 | 101,643 | 101,644 | 101,645 | 101,646 | 101,647 | 101,648 |
| | 2-417 | 101,657 | 101,658 | 101,659 | 101,660 | 101,661 | 101,662 | 101,663 | 101,664 |
| | 2-418 | 101,673 | 101,674 | 101,675 | 101,676 | 101,677 | 101,678 | 101,679 | 101,680 |
| | 2-419 | 101,689 | 101,690 | 101,691 | 101,692 | 101,693 | 101,694 | 101,695 | 101,696 |
| | 2-420 | 101,705 | 101,706 | 101,707 | 101,708 | 101,709 | 101,710 | 101,711 | 101,712 |
| | 2-421 | 101,721 | 101,722 | 101,723 | 101,724 | 101,725 | 101,726 | 101,727 | 101,728 |
| | 2-422 | 101,737 | 101,738 | 101,739 | 101,740 | 101,741 | 101,742 | 101,743 | 101,744 |
| | 2-423 | 101,753 | 101,754 | 101,755 | 101,756 | 101,757 | 101,758 | 101,759 | 101,760 |
| | 2-424 | 101,769 | 101,770 | 101,771 | 101,772 | 101,773 | 101,774 | 101,775 | 101,776 |
| | 2-425 | 101,785 | 101,786 | 101,787 | 101,788 | 101,789 | 101,790 | 101,791 | 101,792 |
| | 2-426 | 101,801 | 101,802 | 101,803 | 101,804 | 101,805 | 101,806 | 101,807 | 101,808 |
| | 2-427 | 101,817 | 101,818 | 101,819 | 101,820 | 101,821 | 101,822 | 101,823 | 101,824 |
| | 2-428 | 101,833 | 101,834 | 101,835 | 101,836 | 101,837 | 101,838 | 101,839 | 101,840 |
| | 2-429 | 101,849 | 101,850 | 101,851 | 101,852 | 101,853 | 101,854 | 101,855 | 101,856 |
| | 2-430 | 101,865 | 101,866 | 101,867 | 101,868 | 101,869 | 101,870 | 101,871 | 101,872 |
| | 2-431 | 101,881 | 101,882 | 101,883 | 101,884 | 101,885 | 101,886 | 101,887 | 101,888 |
| | 2-432 | 101,897 | 101,898 | 101,899 | 101,900 | 101,901 | 101,902 | 101,903 | 101,904 |
| | 2-433 | 101,913 | 101,914 | 101,915 | 101,916 | 101,917 | 101,918 | 101,919 | 101,920 |
| | 2-434 | 101,929 | 101,930 | 101,931 | 101,932 | 101,933 | 101,934 | 101,935 | 101,936 |
| | 2-435 | 101,945 | 101,946 | 101,947 | 101,948 | 101,949 | 101,950 | 101,951 | 101,952 |
| | 2-436 | 101,961 | 101,962 | 101,963 | 101,964 | 101,965 | 101,966 | 101,967 | 101,968 |
| | 2-437 | 101,977 | 101,978 | 101,979 | 101,980 | 101,981 | 101,982 | 101,983 | 101,984 |
| | 2-438 | 101,993 | 101,994 | 101,995 | 101,996 | 101,997 | 101,998 | 101,999 | 102,000 |
| | 2-439 | 102,009 | 102,010 | 102,011 | 102,012 | 102,013 | 102,014 | 102,015 | 102,016 |
| | 2-440 | 102,025 | 102,026 | 102,027 | 102,028 | 102,029 | 102,030 | 102,031 | 102,032 |
| | 2-441 | 102,041 | 102,042 | 102,043 | 102,044 | 102,045 | 102,046 | 102,047 | 102,048 |
| | 2-442 | 102,057 | 102,058 | 102,059 | 102,060 | 102,061 | 102,062 | 102,063 | 102,064 |
| | 2-443 | 102,073 | 102,074 | 102,075 | 102,076 | 102,077 | 102,078 | 102,079 | 102,080 |
| | 2-444 | 102,089 | 102,090 | 102,091 | 102,092 | 102,093 | 102,094 | 102,095 | 102,096 |
| | 2-445 | 102,105 | 102,106 | 102,107 | 102,108 | 102,109 | 102,110 | 102,111 | 102,112 |
| | 2-446 | 102,121 | 102,122 | 102,123 | 102,124 | 102,125 | 102,126 | 102,127 | 102,128 |
| | 2-447 | 102,137 | 102,138 | 102,139 | 102,140 | 102,141 | 102,142 | 102,143 | 102,144 |
| | 2-448 | 102,153 | 102,154 | 102,155 | 102,156 | 102,157 | 102,158 | 102,159 | 102,160 |
| | 2-449 | 102,169 | 102,170 | 102,171 | 102,172 | 102,173 | 102,174 | 102,175 | 102,176 |
| | 2-450 | 102,185 | 102,186 | 102,187 | 102,188 | 102,189 | 102,190 | 102,191 | 102,192 |

| | | Compound represented by the formula (1) | | | | | | | |
|---|---|---|---|---|---|---|---|---|---|
| | | 1-209 | 1-210 | 1-211 | 1-212 | 1-213 | 1-214 | 1-215 | 1-216 |
| Compound | 2-376 | 101,009 | 101,010 | 101,011 | 101,012 | 101,013 | 101,014 | 101,015 | 101,016 |
| represented | 2-377 | 101,025 | 101,026 | 101,027 | 101,028 | 101,029 | 101,030 | 101,031 | 101,032 |

TABLE 78-continued

| | | | | | | | | | |
|---|---|---|---|---|---|---|---|---|---|
| by the formula (2) | 2-378 | 101,041 | 101,042 | 101,043 | 101,044 | 101,045 | 101,046 | 101,047 | 101,048 |
| | 2-379 | 101,057 | 101,058 | 101,059 | 101,060 | 101,061 | 101,062 | 101,063 | 101,064 |
| | 2-380 | 101,073 | 101,074 | 101,075 | 101,076 | 101,077 | 101,078 | 101,079 | 101,080 |
| | 2-381 | 101,089 | 101,090 | 101,091 | 101,092 | 101,093 | 101,094 | 101,095 | 101,096 |
| | 2-382 | 101,105 | 101,106 | 101,107 | 101,108 | 101,109 | 101,110 | 101,111 | 101,112 |
| | 2-383 | 101,121 | 101,122 | 101,123 | 101,124 | 101,125 | 101,126 | 101,127 | 101,128 |
| | 2-384 | 101,137 | 101,138 | 101,139 | 101,140 | 101,141 | 101,142 | 101,143 | 101,144 |
| | 2-385 | 101,153 | 101,154 | 101,155 | 101,156 | 101,157 | 101,158 | 101,159 | 101,160 |
| | 2-386 | 101,169 | 101,170 | 101,171 | 101,172 | 101,173 | 101,174 | 101,175 | 101,176 |
| | 2-387 | 101,185 | 101,186 | 101,187 | 101,188 | 101,189 | 101,190 | 101,191 | 101,192 |
| | 2-388 | 101,201 | 101,202 | 101,203 | 101,204 | 101,205 | 101,206 | 101,207 | 101,208 |
| | 2-389 | 101,217 | 101,218 | 101,219 | 101,220 | 101,221 | 101,222 | 101,223 | 101,224 |
| | 2-390 | 101,233 | 101,234 | 101,235 | 101,236 | 101,237 | 101,238 | 101,239 | 101,240 |
| | 2-391 | 101,249 | 101,250 | 101,251 | 101,252 | 101,253 | 101,254 | 101,255 | 101,256 |
| | 2-392 | 101,265 | 101,266 | 101,267 | 101,268 | 101,269 | 101,270 | 101,271 | 101,272 |
| | 2-393 | 101,281 | 101,282 | 101,283 | 101,284 | 101,285 | 101,286 | 101,287 | 101,288 |
| | 2-394 | 101,297 | 101,298 | 101,299 | 101,300 | 101,301 | 101,302 | 101,303 | 101,304 |
| | 2-395 | 101,313 | 101,314 | 101,315 | 101,316 | 101,317 | 101,318 | 101,319 | 101,320 |
| | 2-396 | 101,329 | 101,330 | 101,331 | 101,332 | 101,333 | 101,334 | 101,335 | 101,336 |
| | 2-397 | 101,345 | 101,346 | 101,347 | 101,348 | 101,349 | 101,350 | 101,351 | 101,352 |
| | 2-398 | 101,361 | 101,362 | 101,363 | 101,364 | 101,365 | 101,366 | 101,367 | 101,368 |
| | 2-399 | 101,377 | 101,378 | 101,379 | 101,380 | 101,381 | 101,382 | 101,383 | 101,384 |
| | 2-400 | 101,393 | 101,394 | 101,395 | 101,396 | 101,397 | 101,398 | 101,399 | 101,400 |
| | 2-401 | 101,409 | 101,410 | 101,411 | 101,412 | 101,413 | 101,414 | 101,415 | 101,416 |
| | 2-402 | 101,425 | 101,426 | 101,427 | 101,428 | 101,429 | 101,430 | 101,431 | 101,432 |
| | 2-403 | 101,441 | 101,442 | 101,443 | 101,444 | 101,445 | 101,446 | 101,447 | 101,448 |
| | 2-404 | 101,457 | 101,458 | 101,459 | 101,460 | 101,461 | 101,462 | 101,463 | 101,464 |
| | 2-405 | 101,473 | 101,474 | 101,475 | 101,476 | 101,477 | 101,478 | 101,479 | 101,480 |
| | 2-406 | 101,489 | 101,490 | 101,491 | 101,492 | 101,493 | 101,494 | 101,495 | 101,496 |
| | 2-407 | 101,505 | 101,506 | 101,507 | 101,508 | 101,509 | 101,510 | 101,511 | 101,512 |
| | 2-408 | 101,521 | 101,522 | 101,523 | 101,524 | 101,525 | 101,526 | 101,527 | 101,528 |
| | 2-409 | 101,537 | 101,538 | 101,539 | 101,540 | 101,541 | 101,542 | 101,543 | 101,544 |
| | 2-410 | 101,553 | 101,554 | 101,555 | 101,556 | 101,557 | 101,558 | 101,559 | 101,560 |
| | 2-411 | 101,569 | 101,570 | 101,571 | 101,572 | 101,573 | 101,574 | 101,575 | 101,576 |
| | 2-412 | 101,585 | 101,586 | 101,587 | 101,588 | 101,589 | 101,590 | 101,591 | 101,592 |
| | 2-413 | 101,601 | 101,602 | 101,603 | 101,604 | 101,605 | 101,606 | 101,607 | 101,608 |
| | 2-414 | 101,617 | 101,618 | 101,619 | 101,620 | 101,621 | 101,622 | 101,623 | 101,624 |
| | 2-415 | 101,633 | 101,634 | 101,635 | 101,636 | 101,637 | 101,638 | 101,639 | 101,640 |
| | 2-416 | 101,649 | 101,650 | 101,651 | 101,652 | 101,653 | 101,654 | 101,655 | 101,656 |
| | 2-417 | 101,665 | 101,666 | 101,667 | 101,668 | 101,669 | 101,670 | 101,671 | 101,672 |
| | 2-418 | 101,681 | 101,682 | 101,683 | 101,684 | 101,685 | 101,686 | 101,687 | 101,688 |
| | 2-419 | 101,697 | 101,698 | 101,699 | 101,700 | 101,701 | 101,702 | 101,703 | 101,704 |
| | 2-420 | 101,713 | 101,714 | 101,715 | 101,716 | 101,717 | 101,718 | 101,719 | 101,720 |
| | 2-421 | 101,729 | 101,730 | 101,731 | 101,732 | 101,733 | 101,734 | 101,735 | 101,736 |
| | 2-422 | 101,745 | 101,746 | 101,747 | 101,748 | 101,749 | 101,750 | 101,751 | 101,752 |
| | 2-423 | 101,761 | 101,762 | 101,763 | 101,764 | 101,765 | 101,766 | 101,767 | 101,768 |
| | 2-424 | 101,777 | 101,778 | 101,779 | 101,780 | 101,781 | 101,782 | 101,783 | 101,784 |
| | 2-425 | 101,793 | 101,794 | 101,795 | 101,796 | 101,797 | 101,798 | 101,799 | 101,800 |
| | 2-426 | 101,809 | 101,810 | 101,811 | 101,812 | 101,813 | 101,814 | 101,815 | 101,816 |
| | 2-427 | 101,825 | 101,826 | 101,827 | 101,828 | 101,829 | 101,830 | 101,831 | 101,832 |
| | 2-428 | 101,841 | 101,842 | 101,843 | 101,844 | 101,845 | 101,846 | 101,847 | 101,848 |
| | 2-429 | 101,857 | 101,858 | 101,859 | 101,860 | 101,861 | 101,862 | 101,863 | 101,864 |
| | 2-430 | 101,873 | 101,874 | 101,875 | 101,876 | 101,877 | 101,878 | 101,879 | 101,880 |
| | 2-431 | 101,889 | 101,890 | 101,891 | 101,892 | 101,893 | 101,894 | 101,895 | 101,896 |
| | 2-432 | 101,905 | 101,906 | 101,907 | 101,908 | 101,909 | 101,910 | 101,911 | 101,912 |
| | 2-433 | 101,921 | 101,922 | 101,923 | 101,924 | 101,925 | 101,926 | 101,927 | 101,928 |
| | 2-434 | 101,937 | 101,938 | 101,939 | 101,940 | 101,941 | 101,942 | 101,943 | 101,944 |
| | 2-435 | 101,953 | 101,954 | 101,955 | 101,956 | 101,957 | 101,958 | 101,959 | 101,960 |
| | 2-436 | 101,969 | 101,970 | 101,971 | 101,972 | 101,973 | 101,974 | 101,975 | 101,976 |
| | 2-437 | 101,985 | 101,986 | 101,987 | 101,988 | 101,989 | 101,990 | 101,991 | 101,992 |
| | 2-438 | 102,001 | 102,002 | 102,003 | 102,004 | 102,005 | 102,006 | 102,007 | 102,008 |
| | 2-439 | 102,017 | 102,018 | 102,019 | 102,020 | 102,021 | 102,022 | 102,023 | 102,024 |
| | 2-440 | 102,033 | 102,034 | 102,035 | 102,036 | 102,037 | 102,038 | 102,039 | 102,040 |
| | 2-441 | 102,049 | 102,050 | 102,051 | 102,052 | 102,053 | 102,054 | 102,055 | 102,056 |
| | 2-442 | 102,065 | 102,066 | 102,067 | 102,068 | 102,069 | 102,070 | 102,071 | 102,072 |
| | 2-443 | 102,081 | 102,082 | 102,083 | 102,084 | 102,085 | 102,086 | 102,087 | 102,088 |
| | 2-444 | 102,097 | 102,098 | 102,099 | 102,100 | 102,101 | 102,102 | 102,103 | 102,104 |
| | 2-445 | 102,113 | 102,114 | 102,115 | 102,116 | 102,117 | 102,118 | 102,119 | 102,120 |
| | 2-446 | 102,129 | 102,130 | 102,131 | 102,132 | 102,133 | 102,134 | 102,135 | 102,136 |
| | 2-447 | 102,145 | 102,146 | 102,147 | 102,148 | 102,149 | 102,150 | 102,151 | 102,152 |
| | 2-448 | 102,161 | 102,162 | 102,163 | 102,164 | 102,165 | 102,166 | 102,167 | 102,168 |
| | 2-449 | 102,177 | 102,178 | 102,179 | 102,180 | 102,181 | 102,182 | 102,183 | 102,184 |
| | 2-450 | 102,193 | 102,194 | 102,195 | 102,196 | 102,197 | 102,198 | 102,199 | 102,200 |

TABLE 79

| | | Compound represented by the formula (1) | | | | | | | |
|---|---|---|---|---|---|---|---|---|---|
| | | 1-201 | 1-202 | 1-203 | 1-204 | 1-205 | 1-206 | 1-207 | 1-208 |
| Compound represented by the formula (2) | 2-451 | 102,201 | 102,202 | 102203 | 102,204 | 102,205 | 102,206 | 102,207 | 102,208 |
| | 2-452 | 102,217 | 102,218 | 102,219 | 102,220 | 102,221 | 102,222 | 102,223 | 102,224 |
| | 2-453 | 102,233 | 102,234 | 102,235 | 102,236 | 102,237 | 102,238 | 102,239 | 102,240 |
| | 2-454 | 102,249 | 102,250 | 102,251 | 102,252 | 102,253 | 102,254 | 102,255 | 102,256 |
| | 2-455 | 102,265 | 102,266 | 102,267 | 102,268 | 102,269 | 102,270 | 102,271 | 102,272 |
| | 2-456 | 102,281 | 102,282 | 102,283 | 102,284 | 102,285 | 102,286 | 102,287 | 102,288 |
| | 2-457 | 102,297 | 102,298 | 102,299 | 102,300 | 102,301 | 102,302 | 102,303 | 102,304 |
| | 2-458 | 102,313 | 102,314 | 102,315 | 102,316 | 102,317 | 102,318 | 102,319 | 102,320 |
| | 2-459 | 102,329 | 102,330 | 102,331 | 102,332 | 102,333 | 102,334 | 102,335 | 102,336 |
| | 2-460 | 102,345 | 102,346 | 102,347 | 102,348 | 102,349 | 102,350 | 102,351 | 102,352 |
| | 2-461 | 102,361 | 102,362 | 102,363 | 102,364 | 102,365 | 102,366 | 102,367 | 102,368 |
| | 2-462 | 102,377 | 102,378 | 102,379 | 102,380 | 102,381 | 102,382 | 102,383 | 102,384 |
| | 2-463 | 102,393 | 102,394 | 102,395 | 102,396 | 102,397 | 102,398 | 102,399 | 102,400 |
| | 2-464 | 102,409 | 102,410 | 102,411 | 102,412 | 102,413 | 102,414 | 102,415 | 102,416 |
| | 2-465 | 102,425 | 102,426 | 102,427 | 102,428 | 102,429 | 102,430 | 102,431 | 102,432 |
| | 2-466 | 102,441 | 102,442 | 102,443 | 102,444 | 102,445 | 102,446 | 102,447 | 102,448 |
| | 2-467 | 102,457 | 102,458 | 102,459 | 102,460 | 102,461 | 102,462 | 102,463 | 102,464 |
| | 2-468 | 102,473 | 102,474 | 102,475 | 102,476 | 102,477 | 102,478 | 102,479 | 102,480 |
| | 2-469 | 102,489 | 102,490 | 102,491 | 102,492 | 102,493 | 102,494 | 102,495 | 102,496 |
| | 2-470 | 102,505 | 102,506 | 102,507 | 102,508 | 102,509 | 102,510 | 102,511 | 102,512 |
| | 2-471 | 102,521 | 102,522 | 102,523 | 102,524 | 102,525 | 102,526 | 102,527 | 102,528 |
| | 2-472 | 102,537 | 102,538 | 102,539 | 102,540 | 102,541 | 102,542 | 102,543 | 102,544 |
| | 2-473 | 102,553 | 102,554 | 102,555 | 102,556 | 102,557 | 102,558 | 102,559 | 102,560 |
| | 2-474 | 102,569 | 102,570 | 102,571 | 102,572 | 102,573 | 102,574 | 102,575 | 102,576 |
| | 2-475 | 102,585 | 102,586 | 102,587 | 102,588 | 102,589 | 102,590 | 102,591 | 102,592 |

| | | Compound represented by the formula (1) | | | | | | | |
|---|---|---|---|---|---|---|---|---|---|
| | | 1-209 | 1-210 | 1-211 | 1-212 | 1-213 | 1-214 | 1-215 | 1-216 |
| Compound represented by the formula (2) | 2-451 | 102,209 | 102,210 | 102,211 | 102,212 | 102,213 | 102,214 | 102,215 | 102,216 |
| | 2-452 | 102,225 | 102,226 | 102,227 | 102,228 | 102,229 | 102,230 | 102,231 | 102,232 |
| | 2-453 | 102,241 | 102,242 | 102,243 | 102,244 | 102,245 | 102,246 | 102,247 | 102,248 |
| | 2-454 | 102,257 | 102,258 | 102,259 | 102,260 | 102,261 | 102,262 | 102,263 | 102,264 |
| | 2-455 | 102,273 | 102,274 | 102,275 | 102,276 | 102,277 | 102,278 | 102,279 | 102,280 |
| | 2-456 | 102,289 | 102,290 | 102,291 | 102,292 | 102,293 | 102,294 | 102,295 | 102,296 |
| | 2-457 | 102,305 | 102,306 | 102,307 | 102,308 | 102,309 | 102,310 | 102,311 | 102,312 |
| | 2-458 | 102,321 | 102,322 | 102,323 | 102,324 | 102,325 | 102,326 | 102,327 | 102,328 |
| | 2-459 | 102,337 | 102,338 | 102,339 | 102,340 | 102,341 | 102,342 | 102,343 | 102,344 |
| | 2-460 | 102,353 | 102,354 | 102,355 | 102,356 | 102,357 | 102,358 | 102,359 | 102,360 |
| | 2-461 | 102,369 | 102,370 | 102,371 | 102,372 | 102,373 | 102,374 | 102,375 | 102,376 |
| | 2-462 | 102,385 | 102,386 | 102,387 | 102,388 | 102,389 | 102,390 | 102,391 | 102,392 |
| | 2-463 | 102,401 | 102,402 | 102,403 | 102,404 | 102,405 | 102,406 | 102,407 | 102,408 |
| | 2-464 | 102,417 | 102,418 | 102,419 | 102,420 | 102,421 | 102,422 | 102,423 | 102,424 |
| | 2-465 | 102,433 | 102,434 | 102,435 | 102,436 | 102,437 | 102,438 | 102,439 | 102,440 |
| | 2-466 | 102,449 | 102,450 | 102,451 | 102,452 | 102,453 | 102,454 | 102,455 | 102,456 |
| | 2-467 | 102,465 | 102,466 | 102,467 | 102,468 | 102,469 | 102,470 | 102,471 | 102,472 |
| | 2-468 | 102,481 | 102,482 | 102,483 | 102,484 | 102,485 | 102,486 | 102,487 | 102,488 |
| | 2-469 | 102,497 | 102,498 | 102,499 | 102,500 | 102,501 | 102,502 | 102,503 | 102,504 |
| | 2-470 | 102,513 | 102,514 | 102,515 | 102,516 | 102,517 | 102,518 | 102,519 | 102,520 |
| | 2-471 | 102,529 | 102,530 | 102,531 | 102,532 | 102,533 | 102,534 | 102,535 | 102,536 |
| | 2-472 | 102,545 | 102,546 | 102,547 | 102,548 | 102,549 | 102,550 | 102,551 | 102,552 |
| | 2-473 | 102,561 | 102,562 | 102,563 | 102,564 | 102,565 | 102,566 | 102,567 | 102,568 |
| | 2-474 | 102,577 | 102,578 | 102,579 | 102,580 | 102,581 | 102,582 | 102,583 | 102,584 |
| | 2-475 | 102,593 | 102,594 | 102,595 | 102,596 | 102,597 | 102,598 | 102,599 | 102,600 |

More specifically, the composition contains:
as the compound represented by the formula (1), one or more compounds selected from the following group A; and
as the compound represented by the formula (2), one or more compounds selected from the following group B.
Group A:
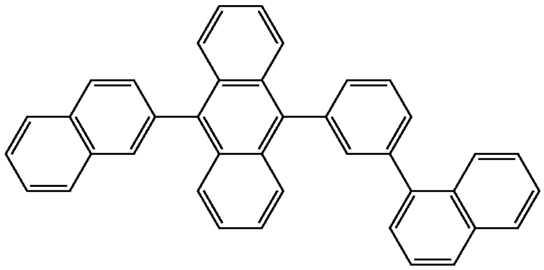
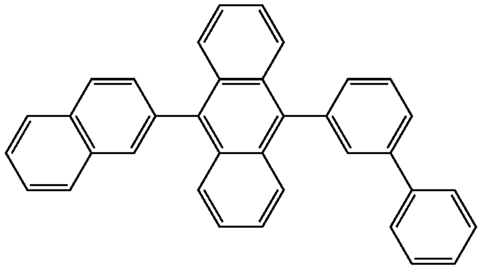
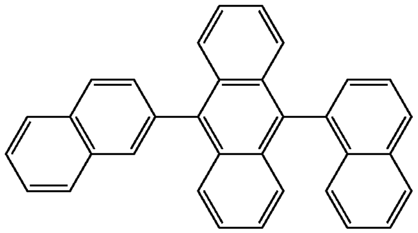
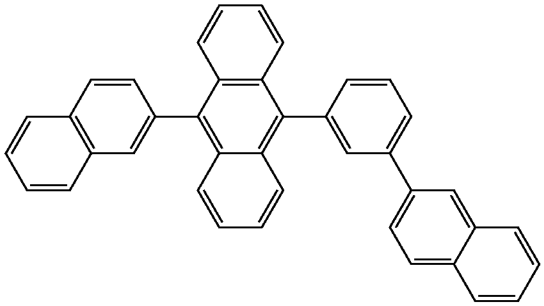
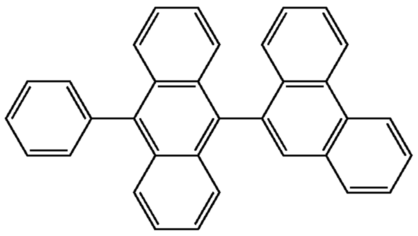
-continued
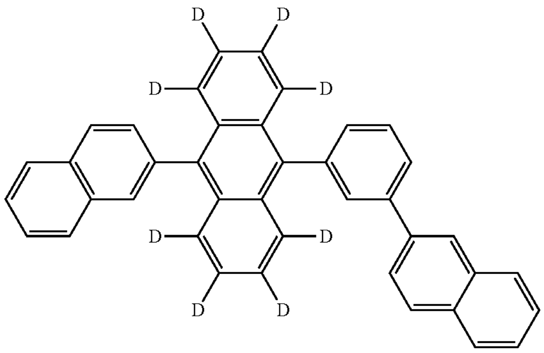
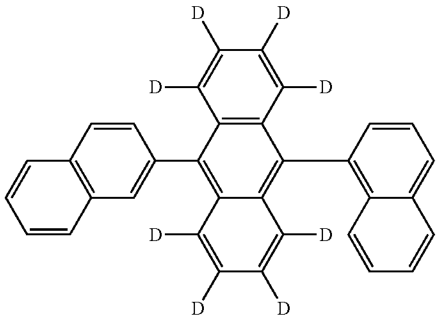
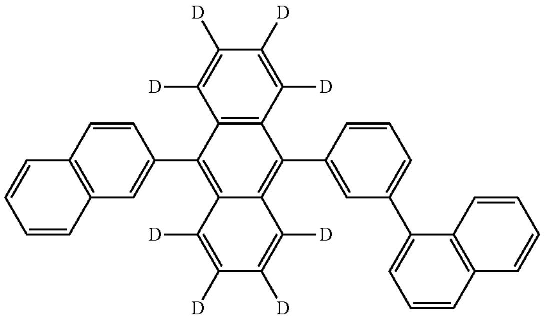
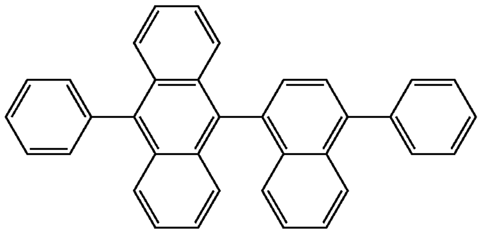
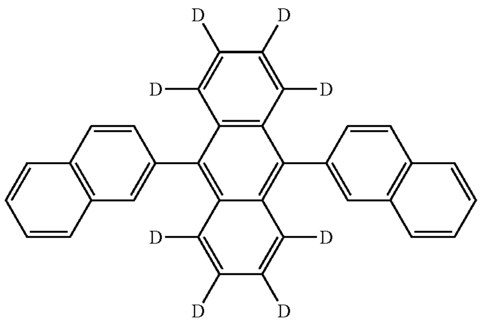

-continued
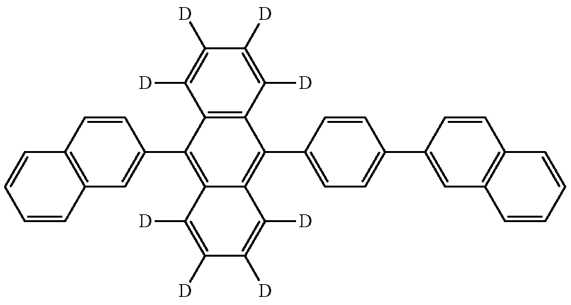
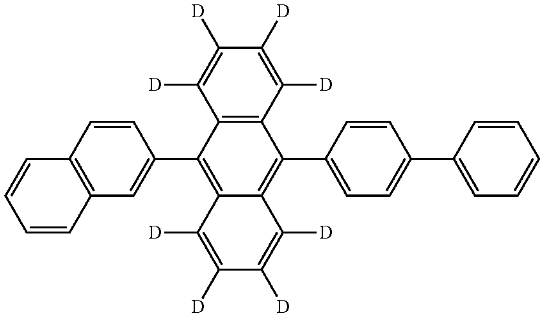
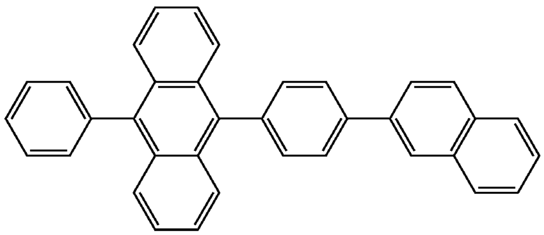
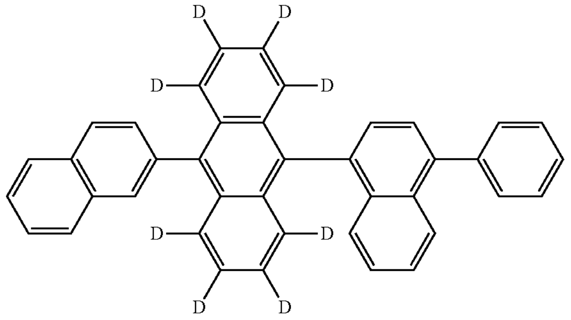
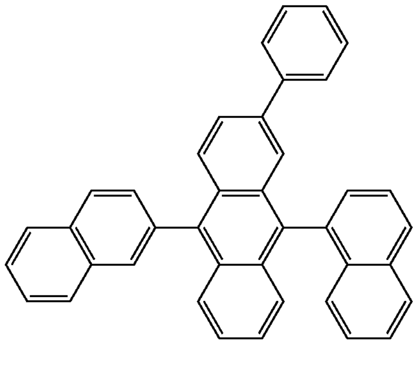
-continued
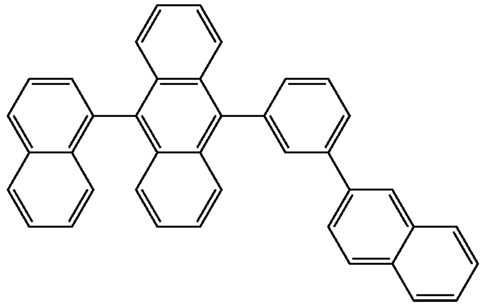
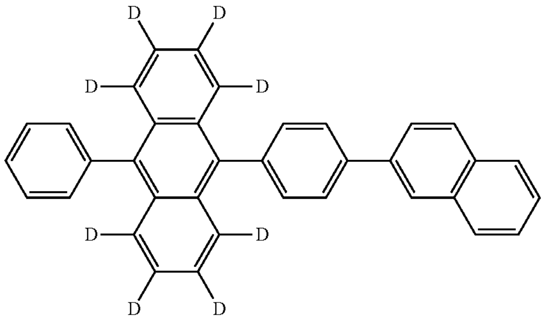
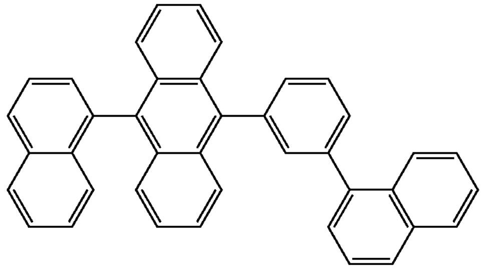
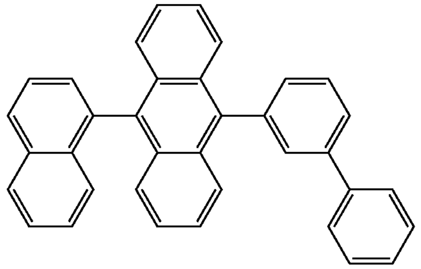
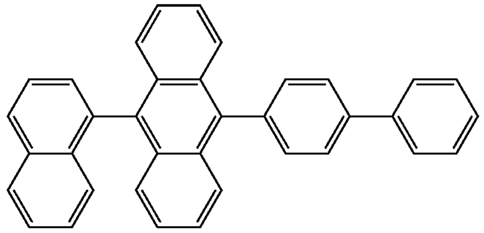
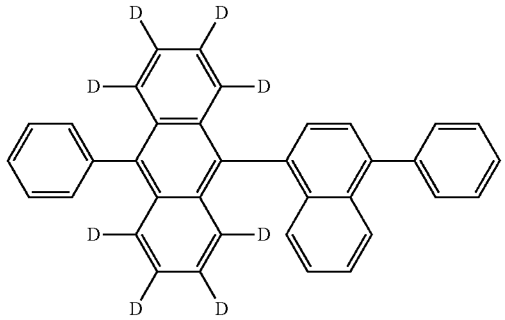

-continued
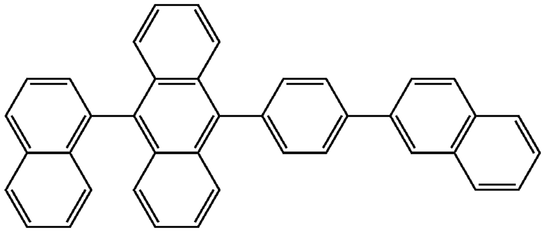
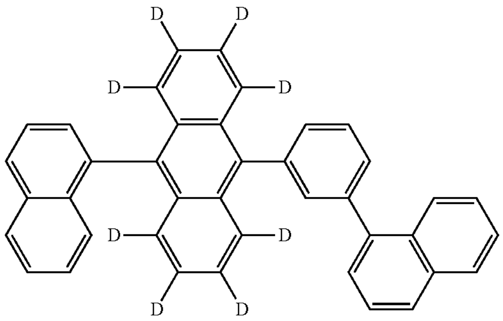
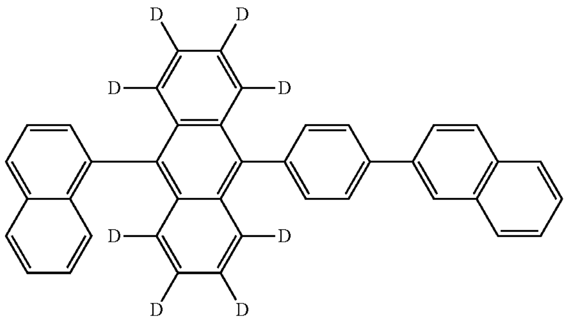
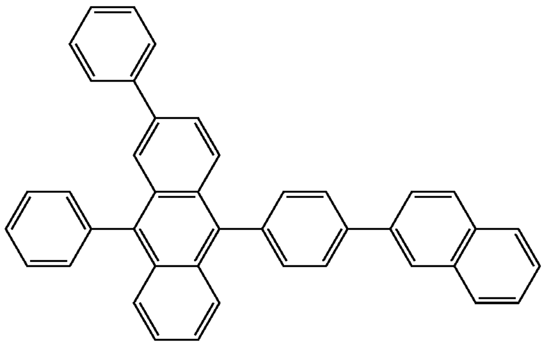
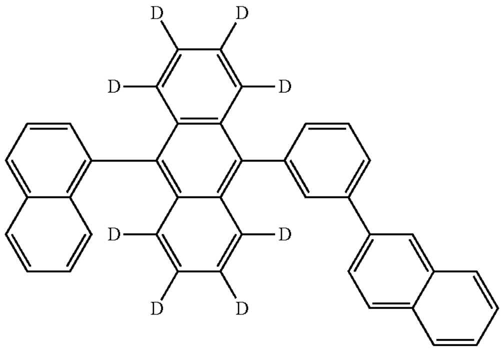
-continued
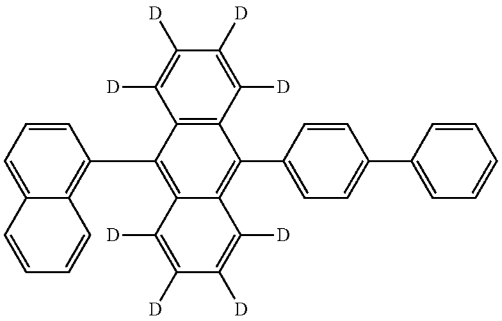
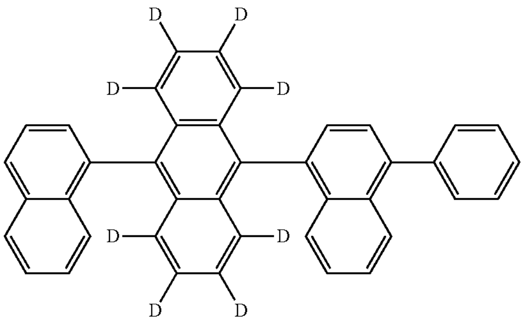
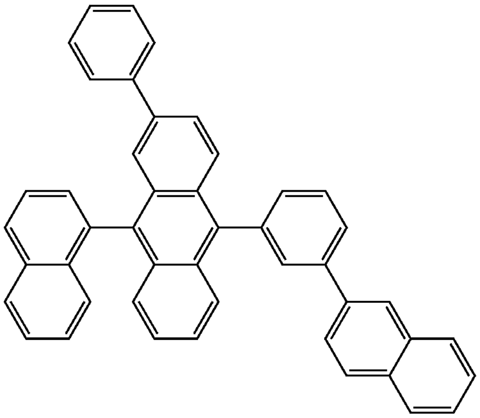
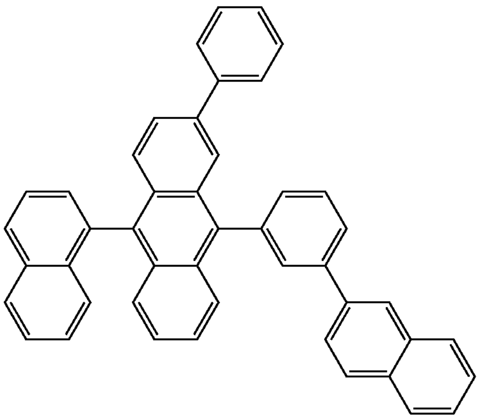

-continued
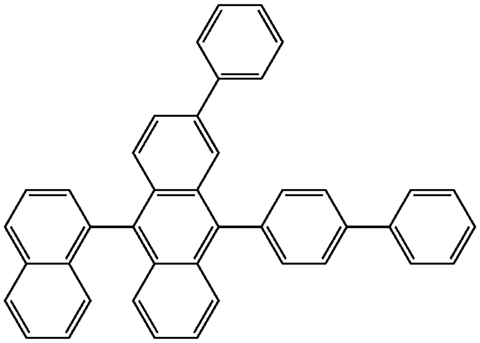
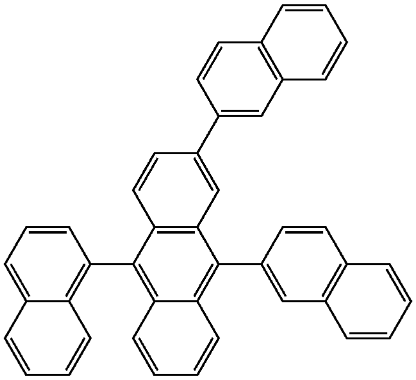
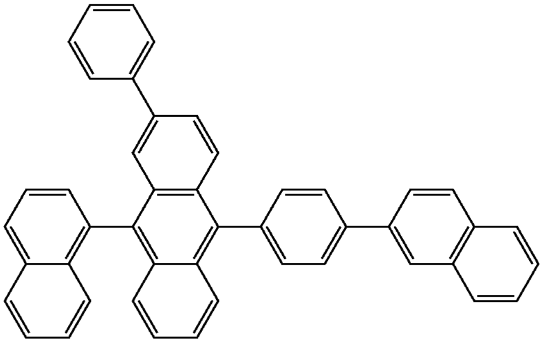
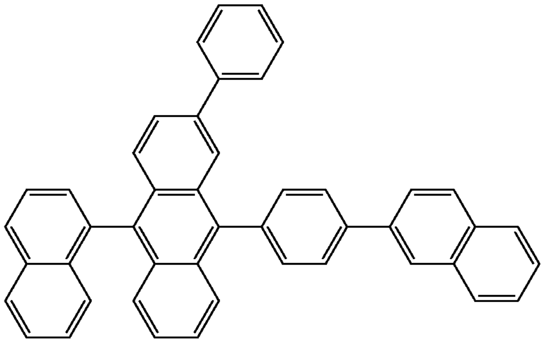
-continued
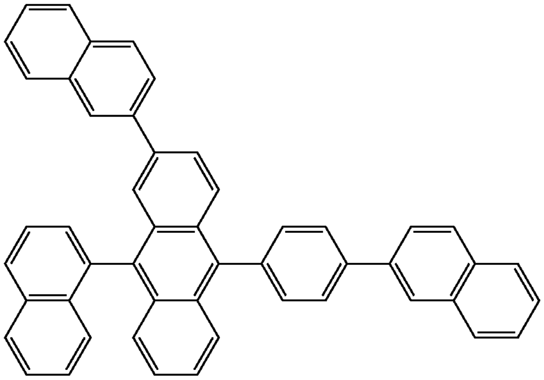
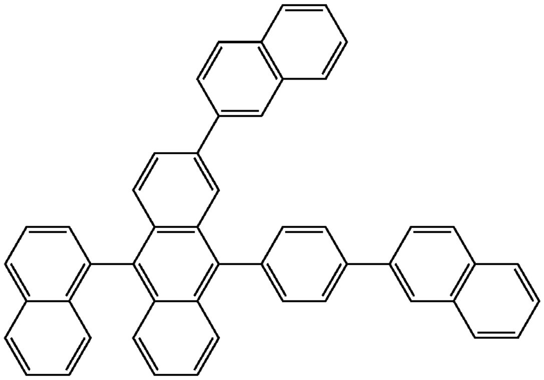
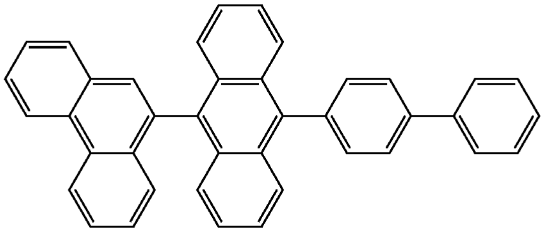
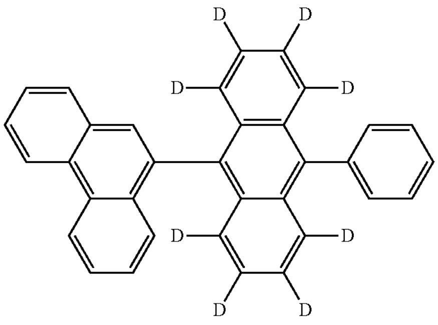
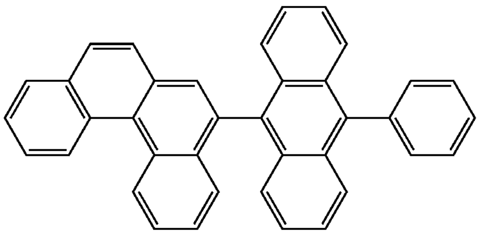

-continued
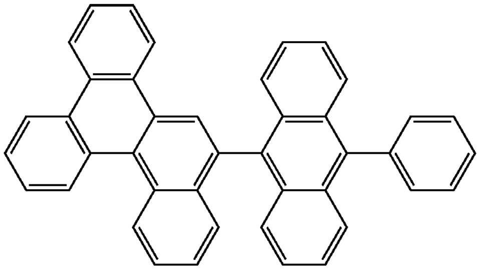
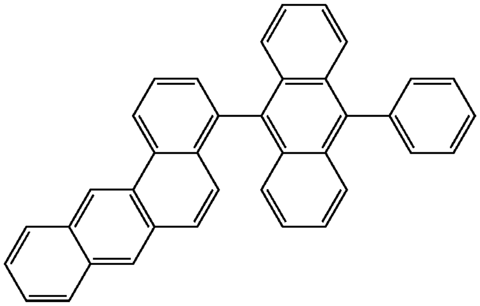
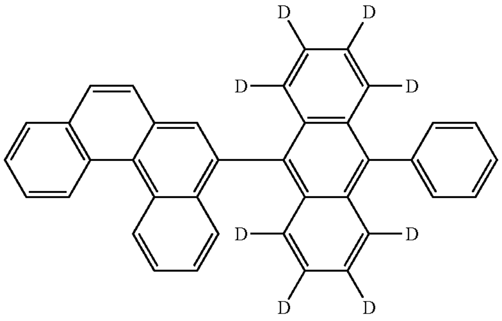
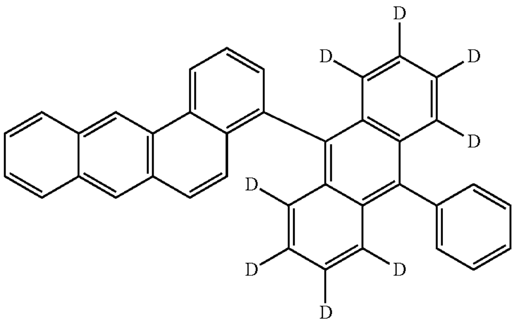
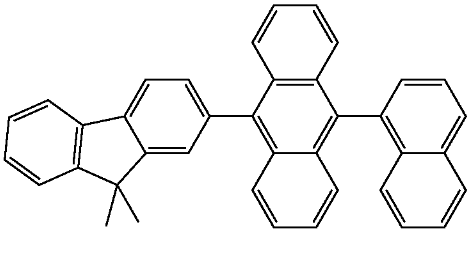
-continued
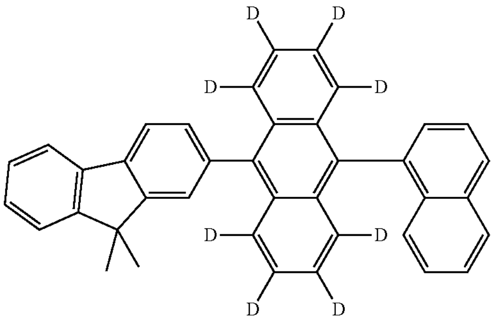
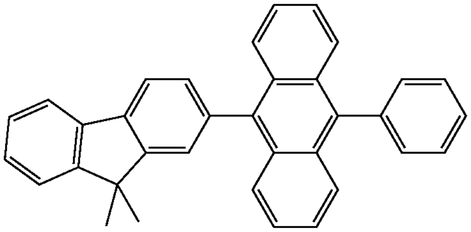
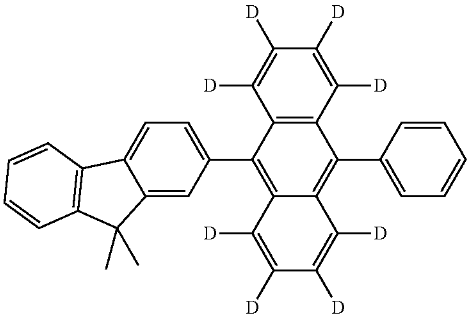
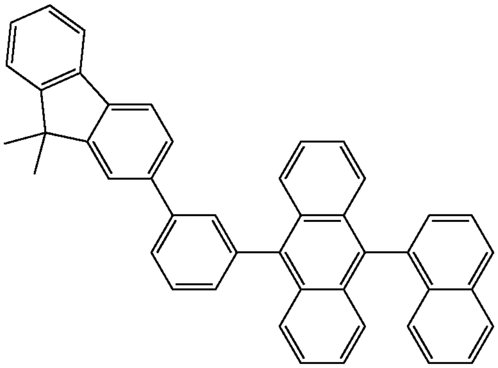
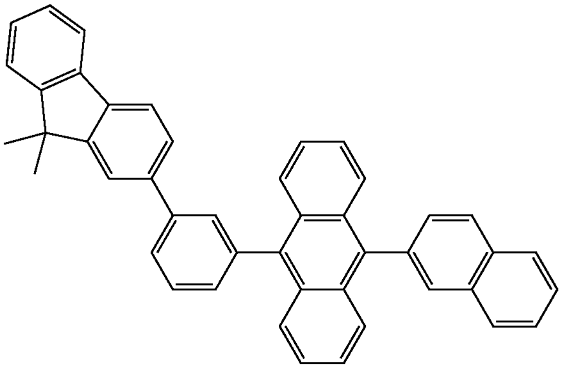

-continued
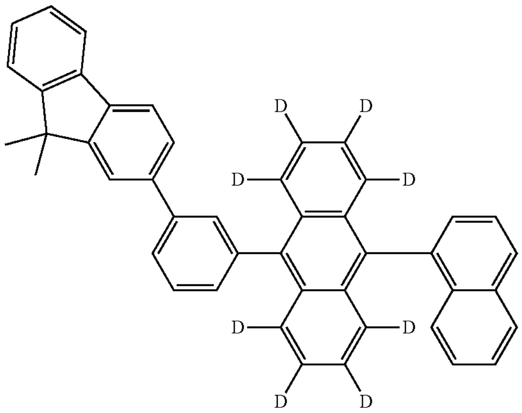
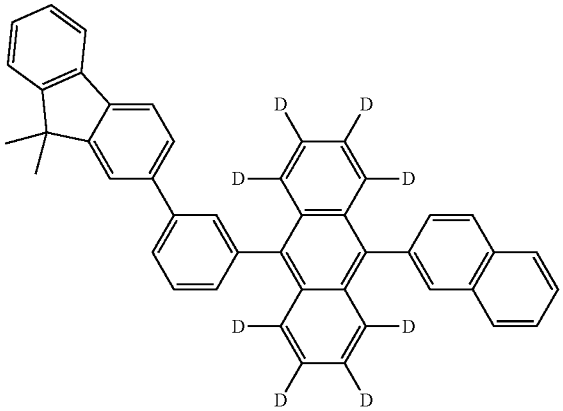
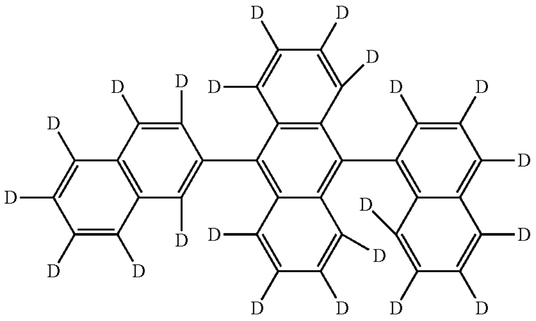
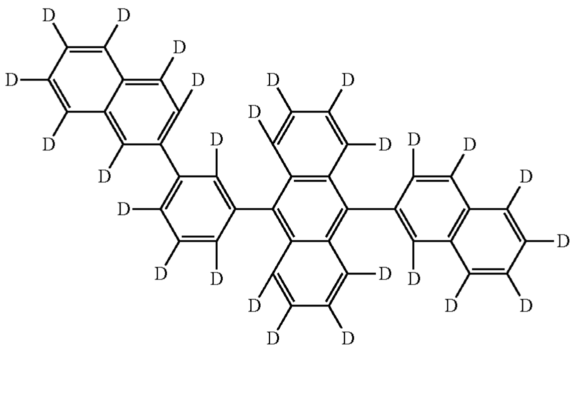
-continued
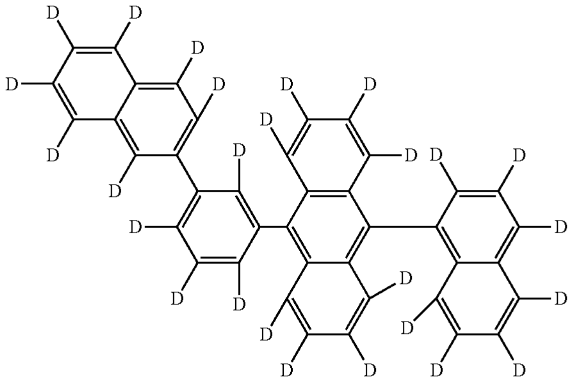
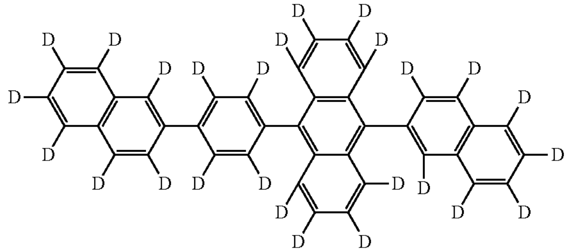
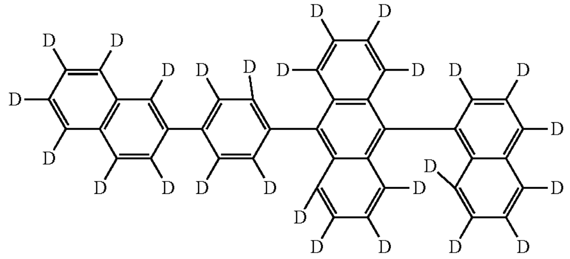
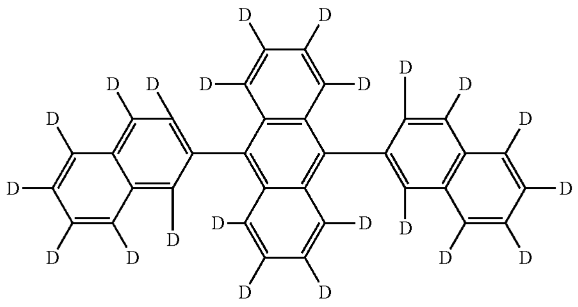
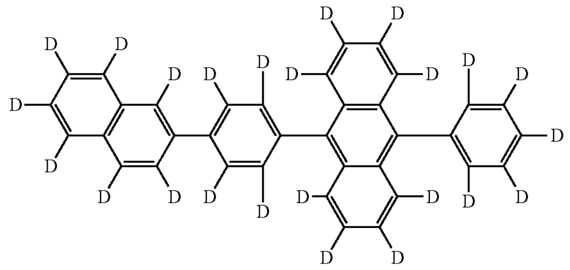

Group B:
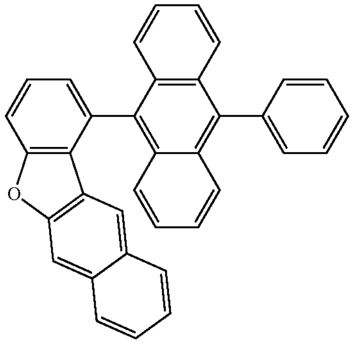
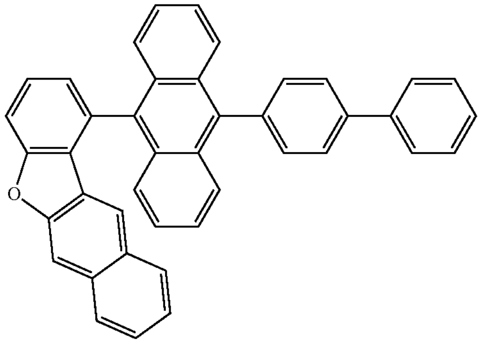
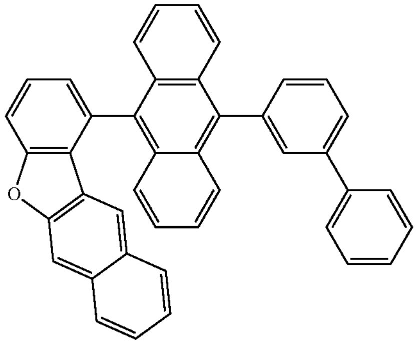
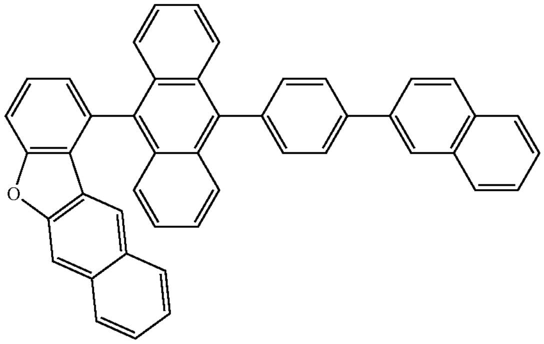
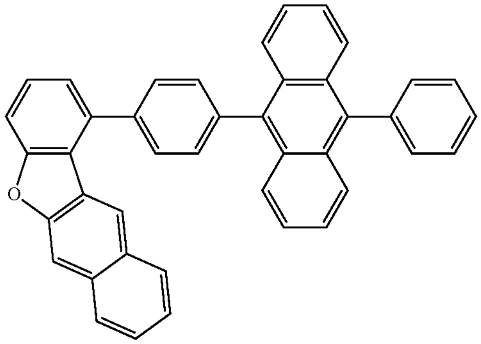
-continued
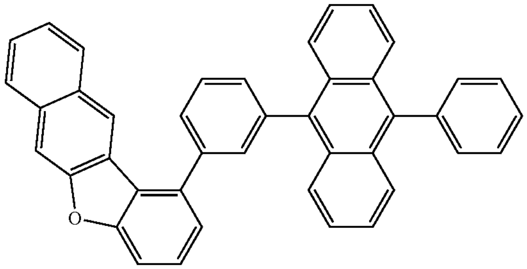
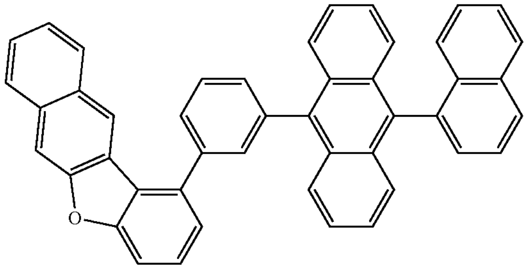
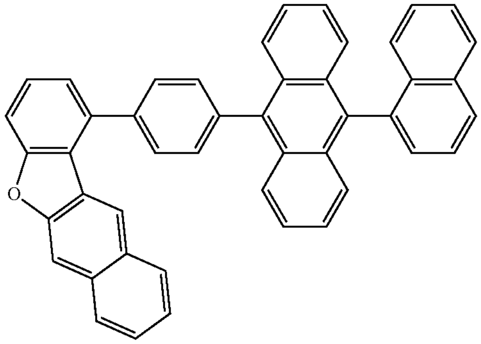
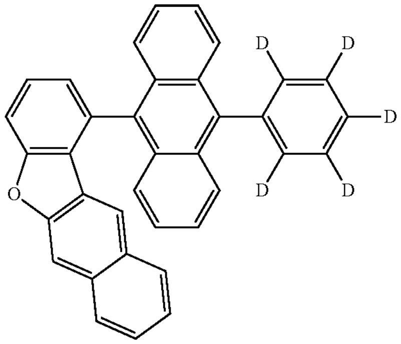
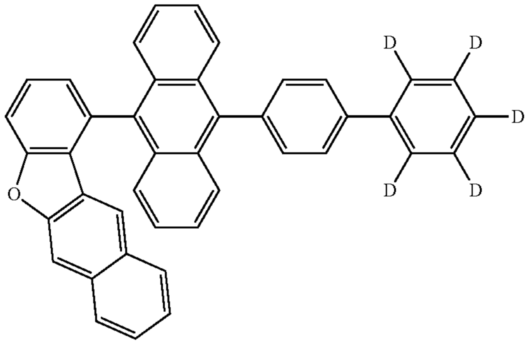

-continued
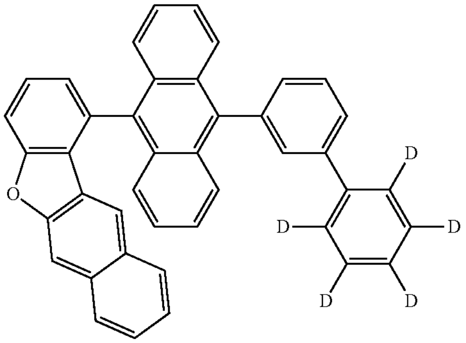
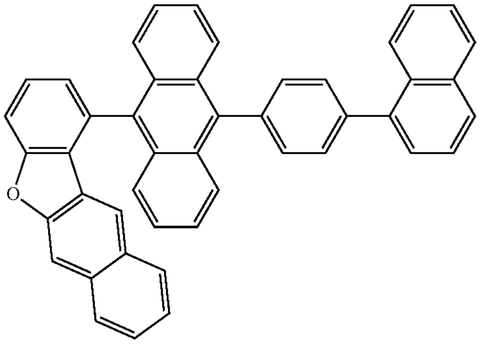
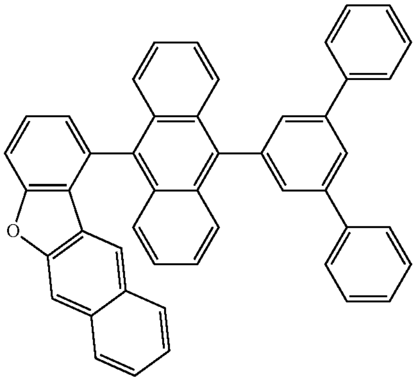
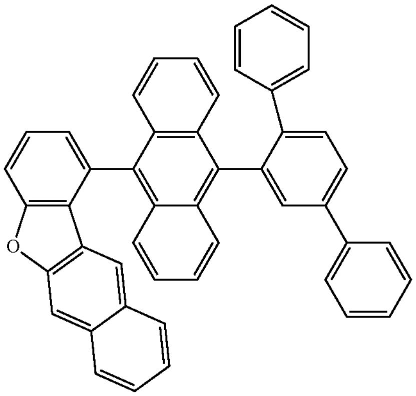
-continued
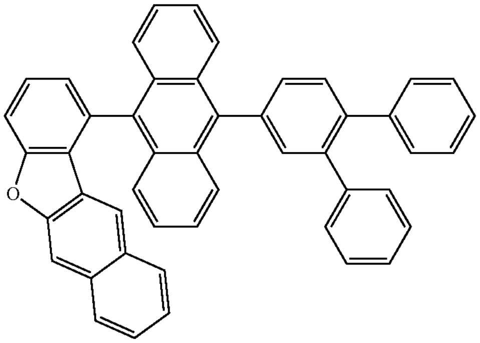
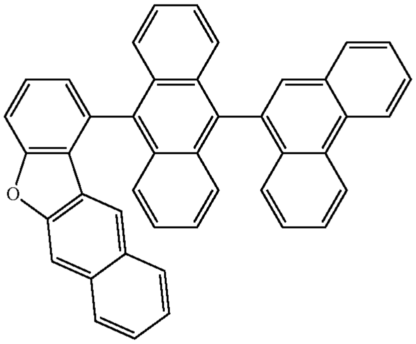
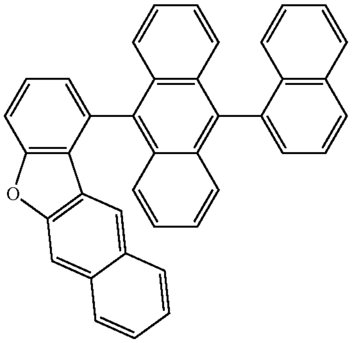
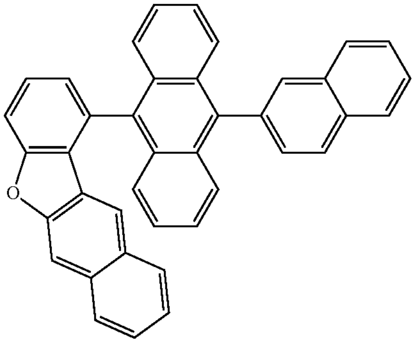
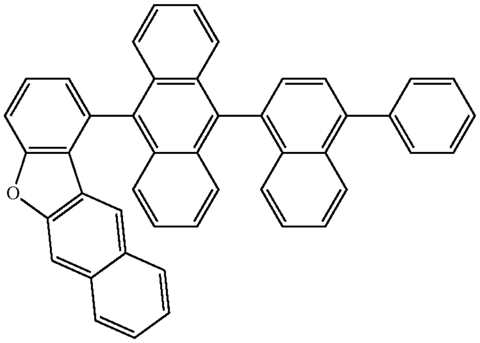

-continued
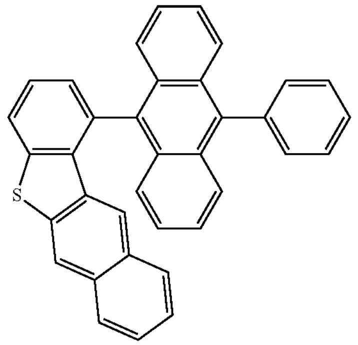
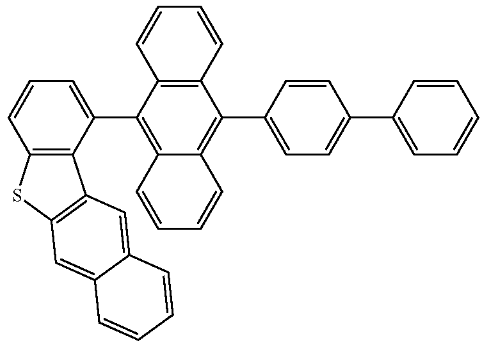
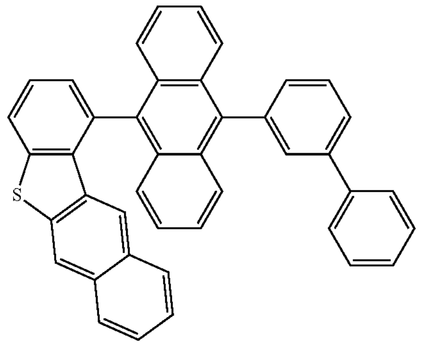
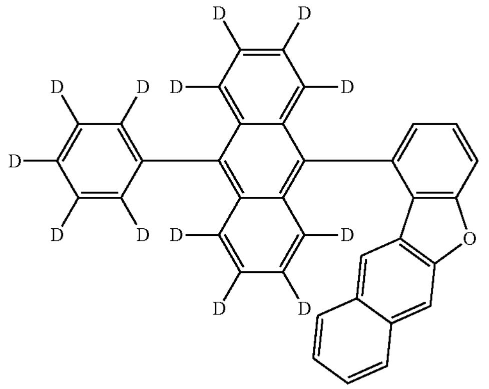
-continued
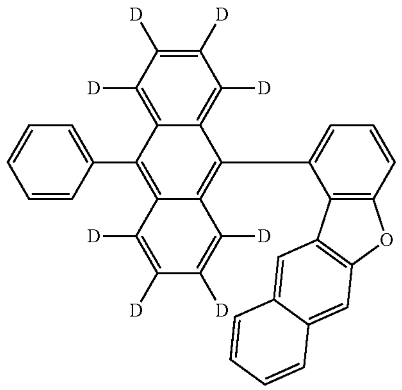
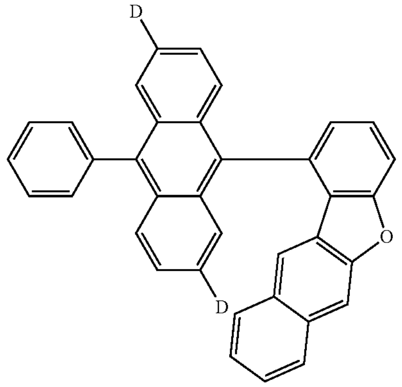
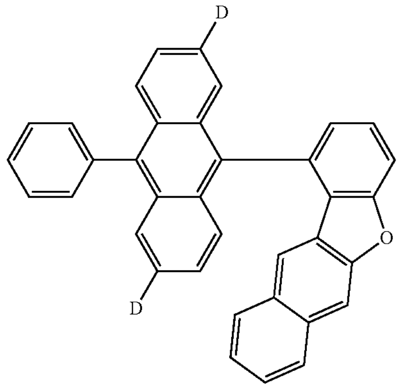
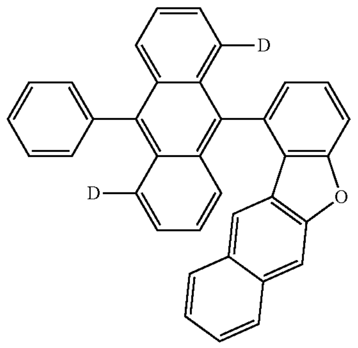

-continued
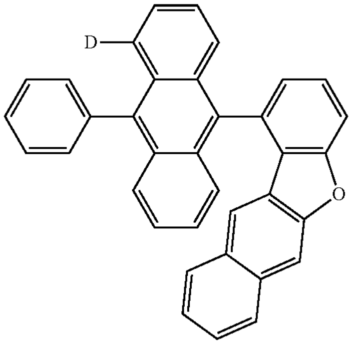
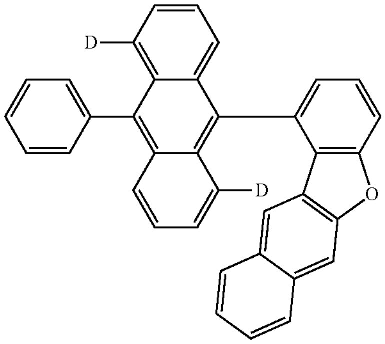
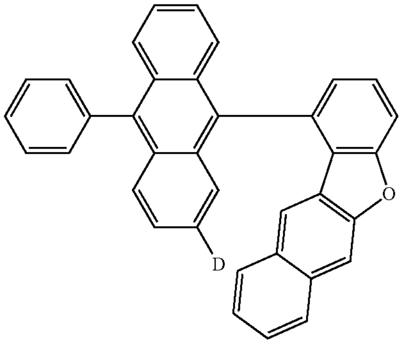
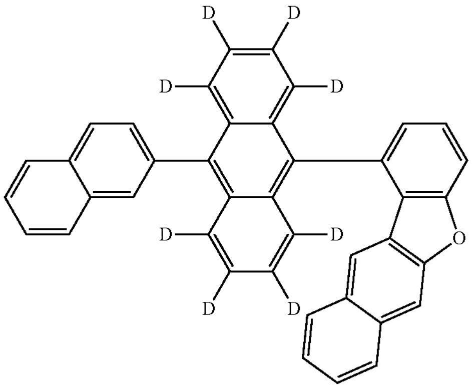
-continued
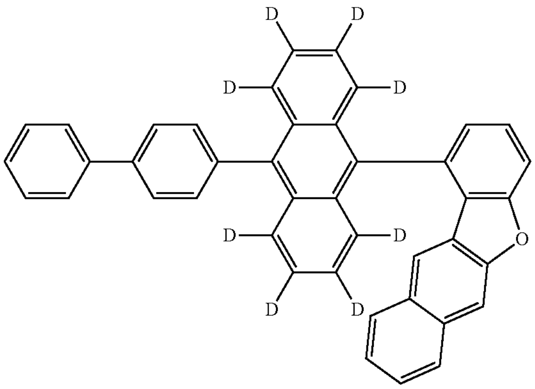
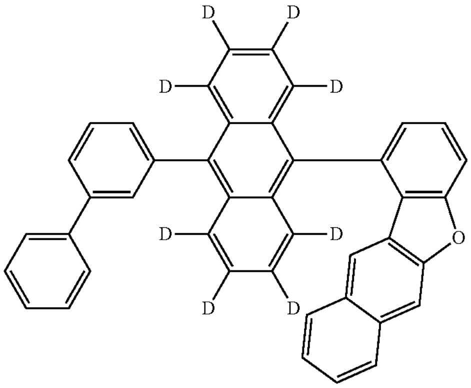
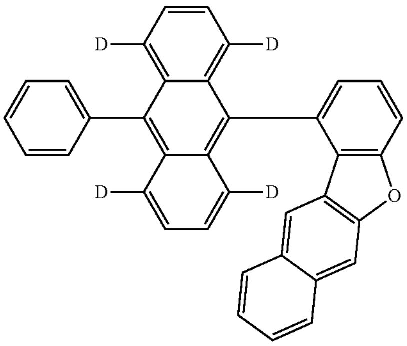
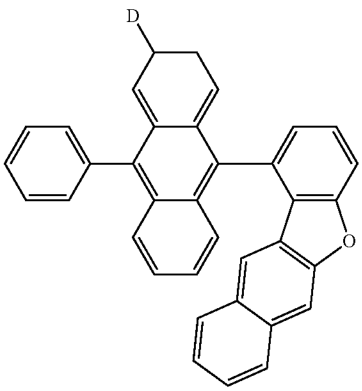

-continued
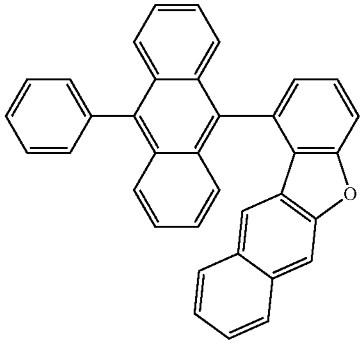
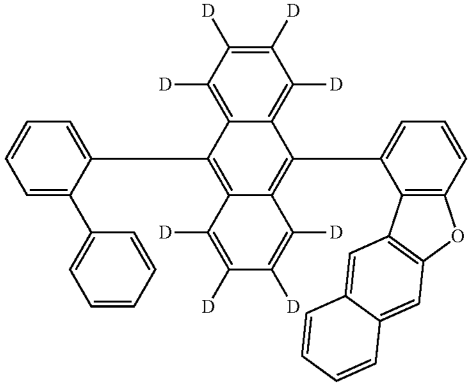
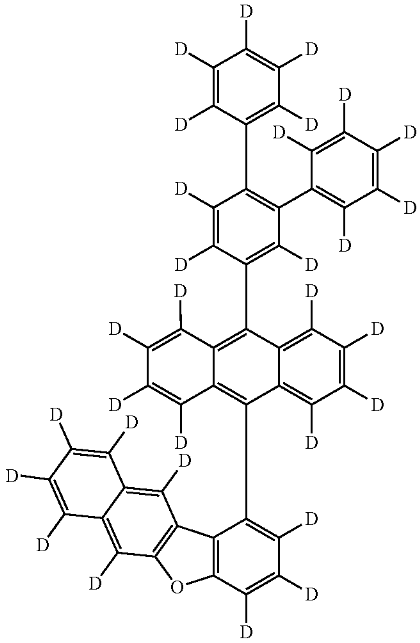
-continued
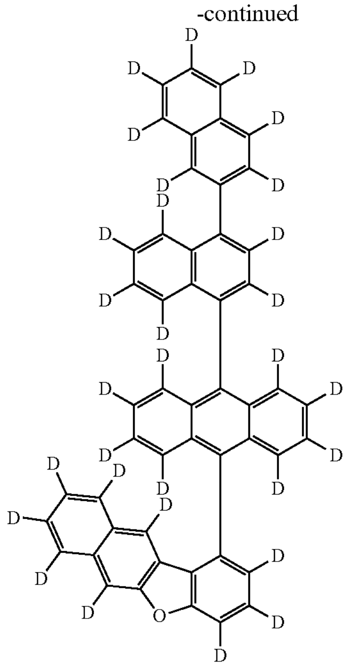
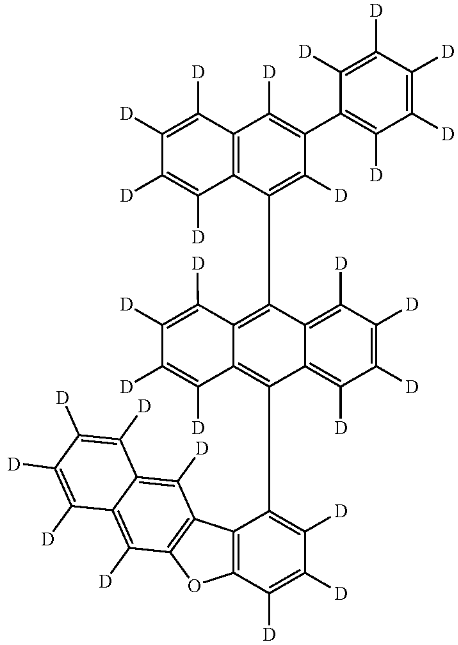

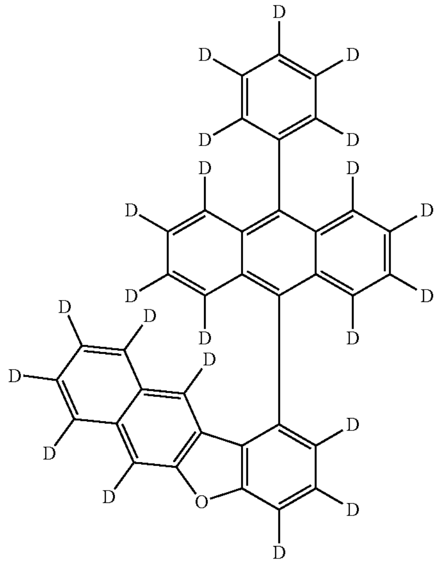
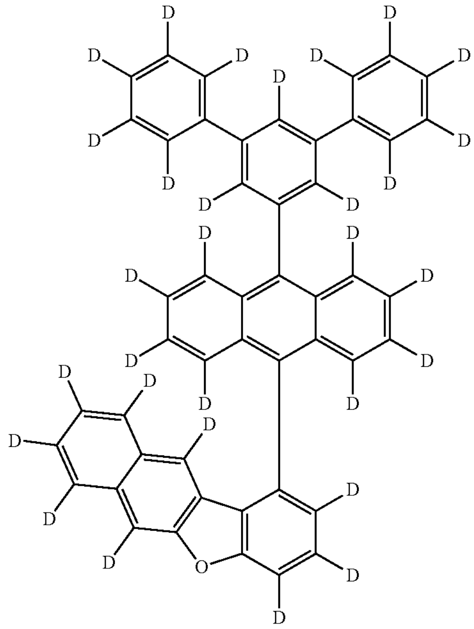
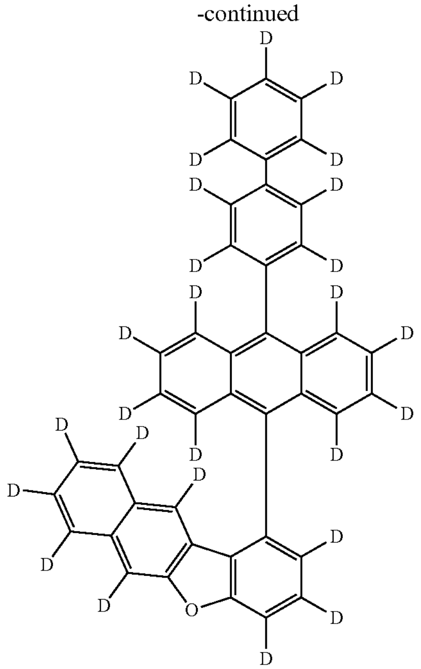
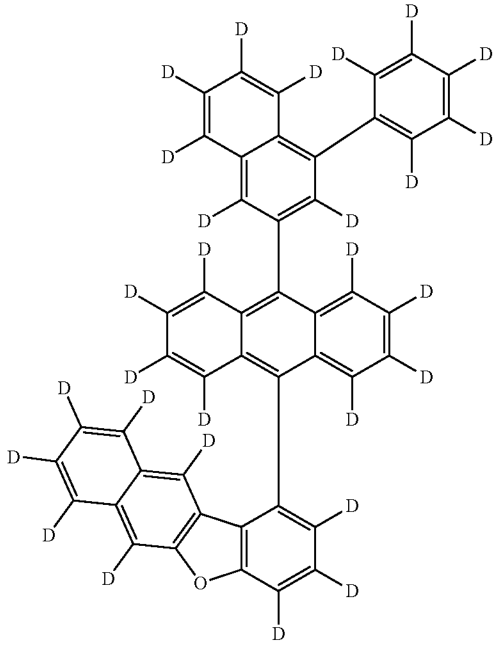

-continued
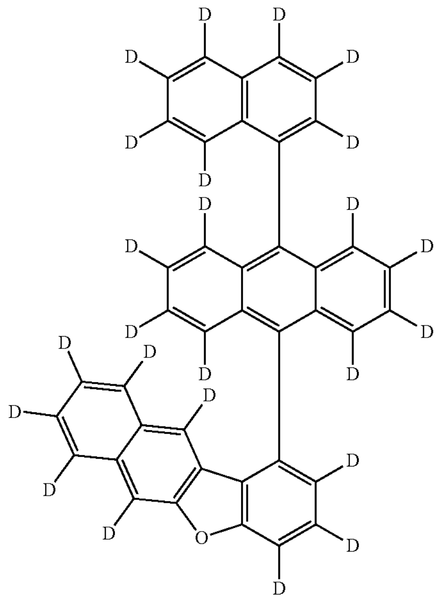
-continued
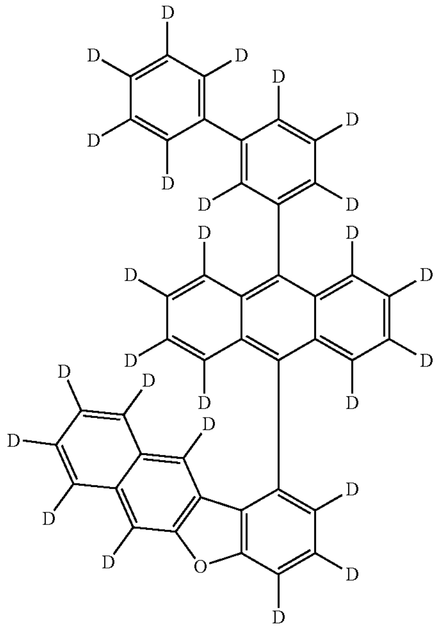
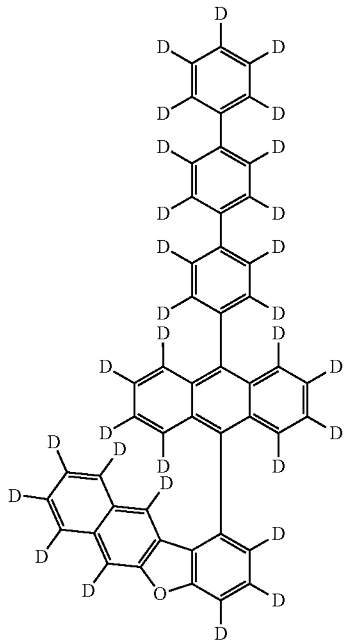
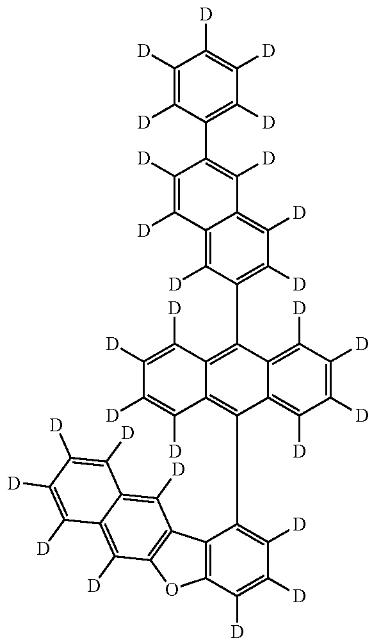

-continued
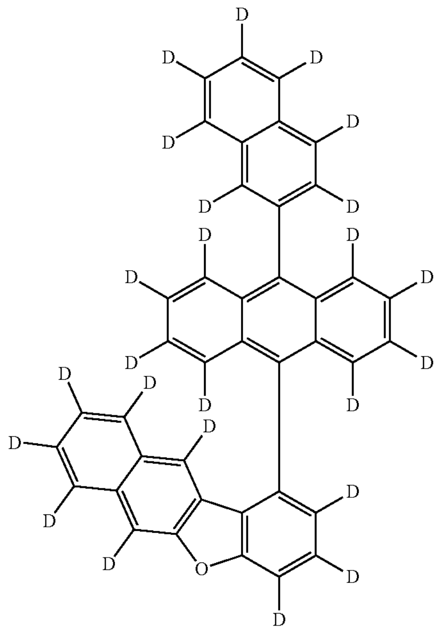
-continued
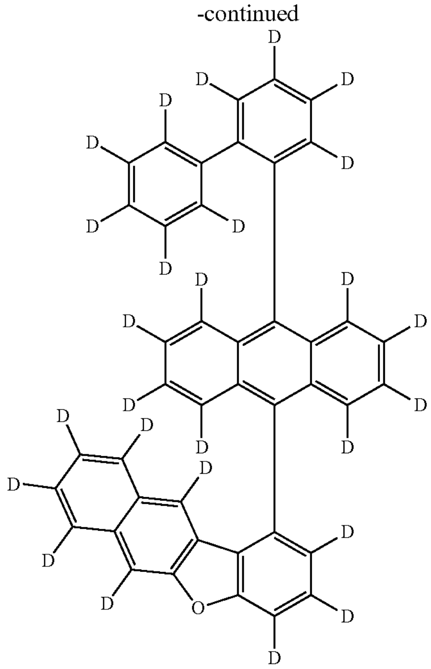
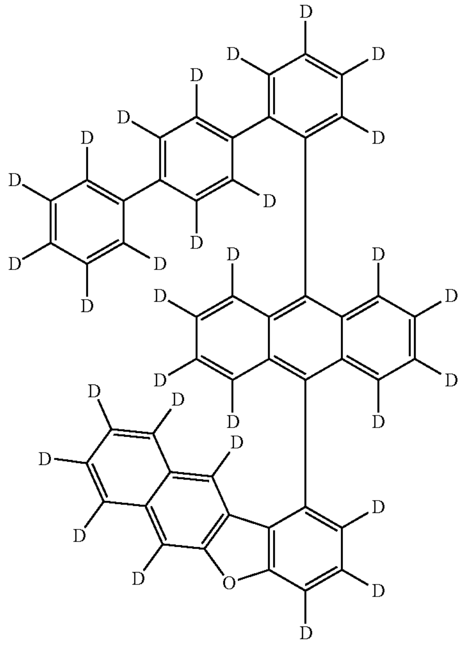
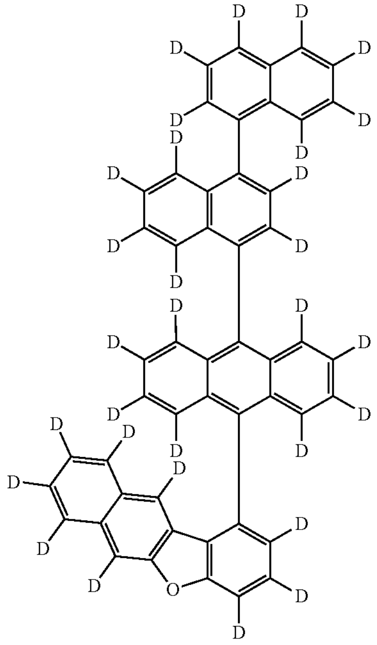

-continued
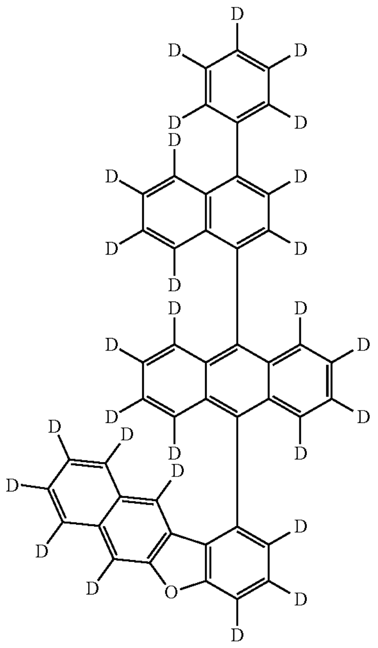
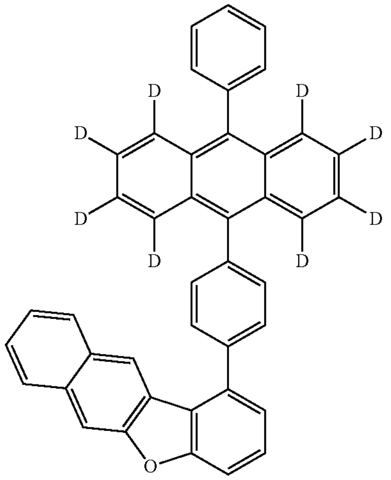
-continued
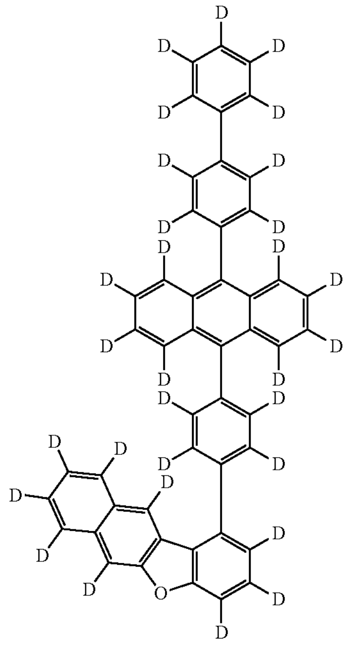
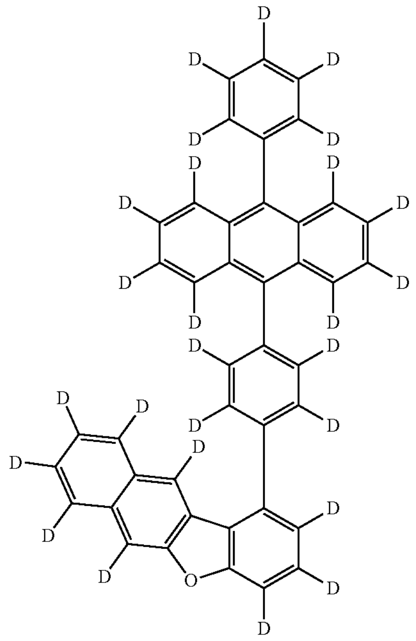

-continued
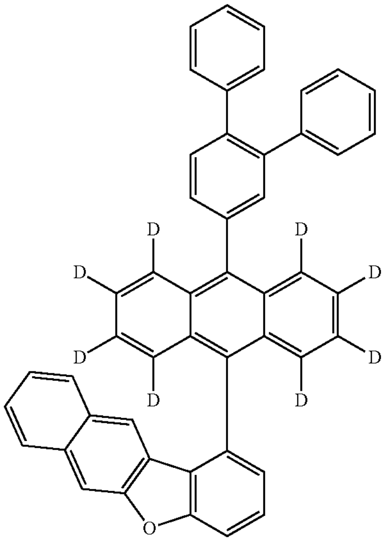
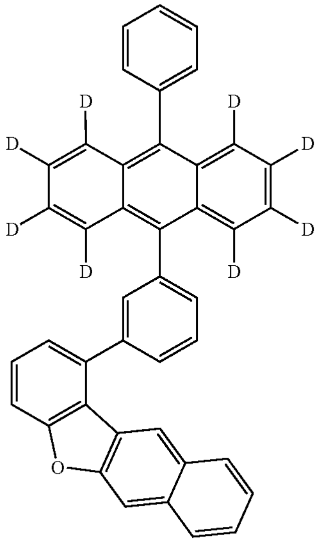
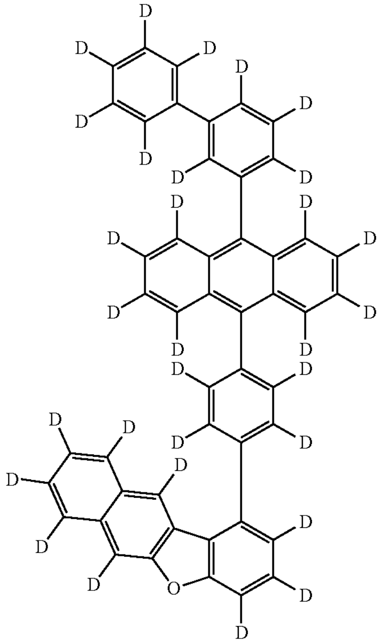
-continued
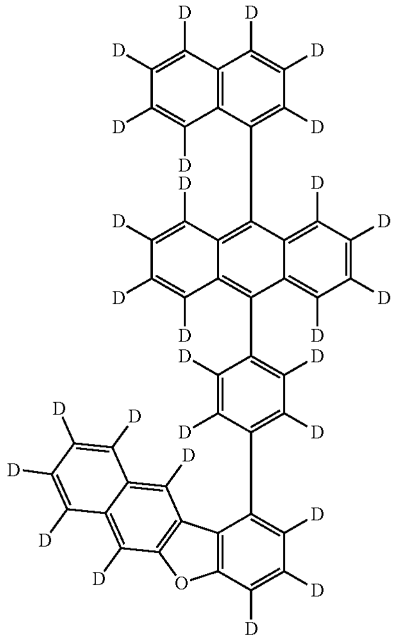
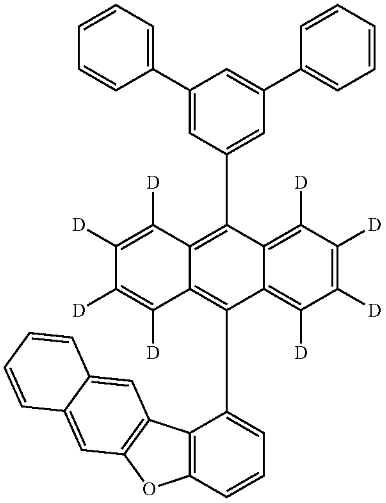
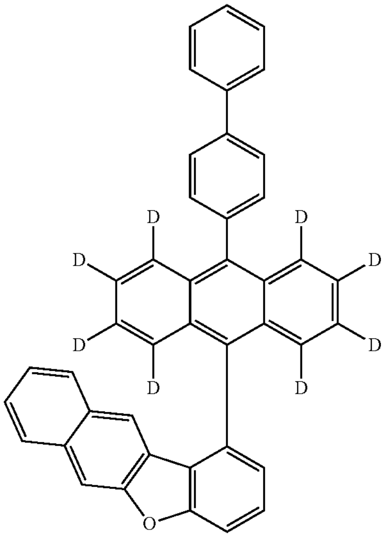

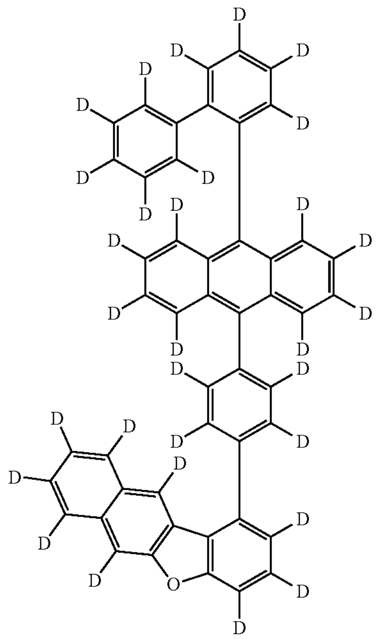
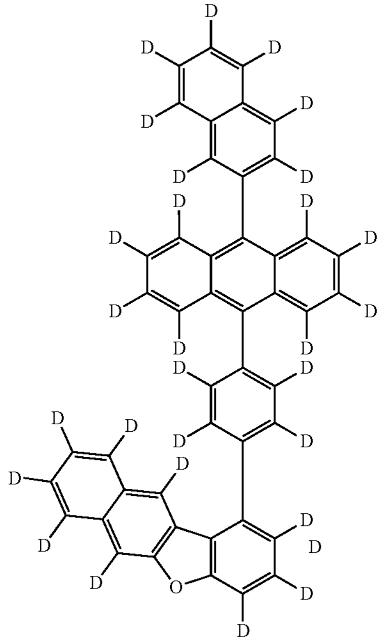
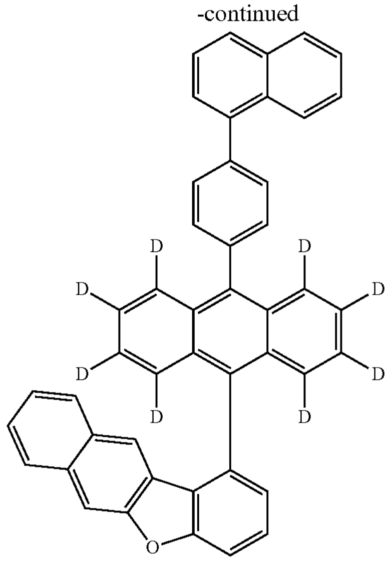
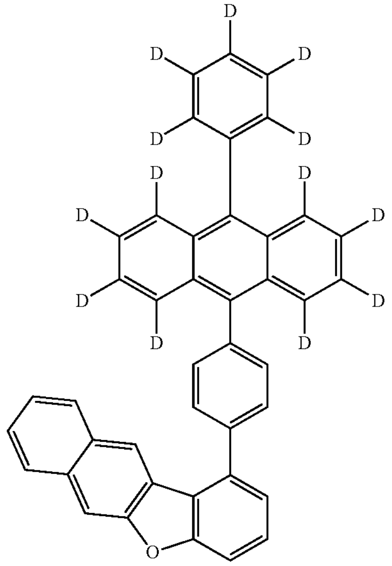
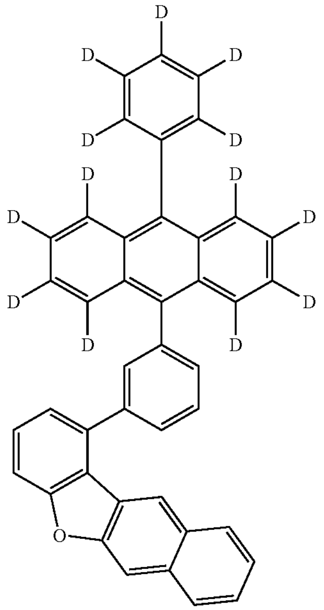

-continued
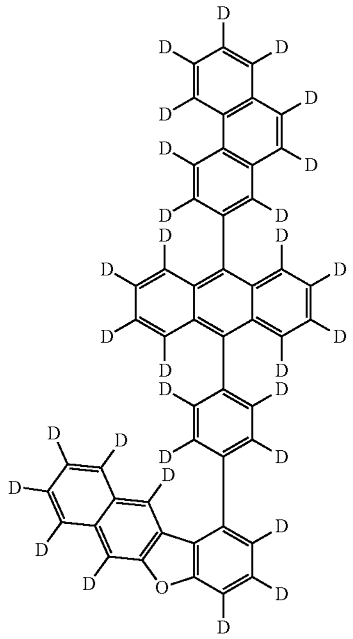
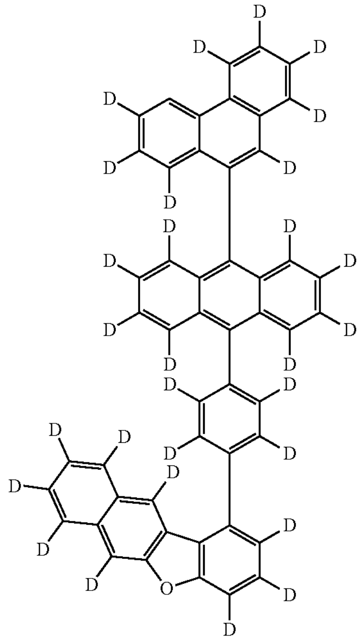
-continued
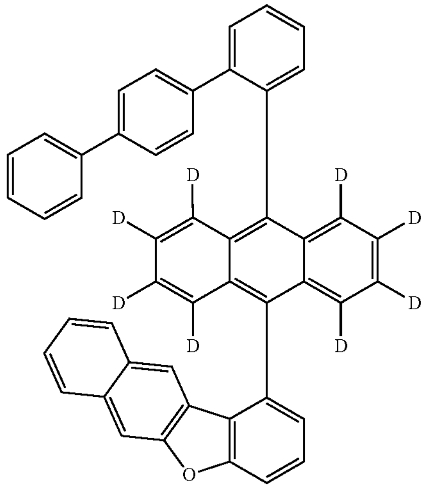
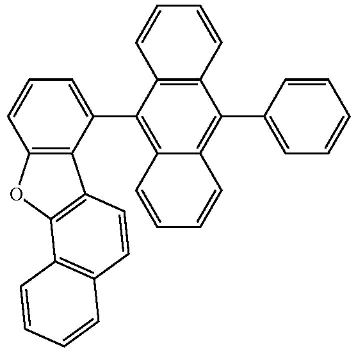
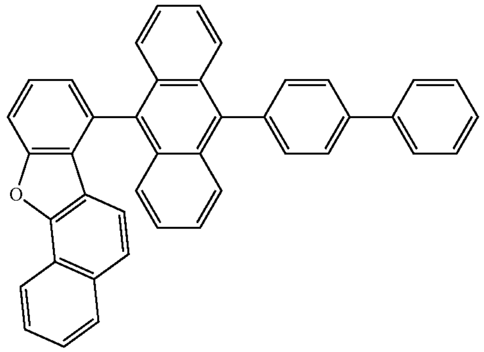
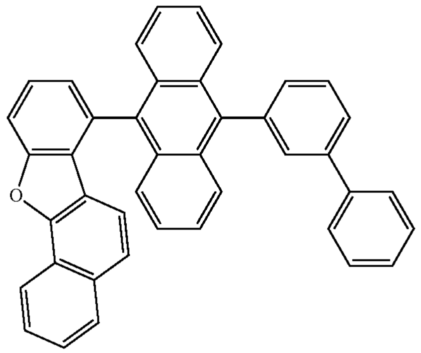

-continued
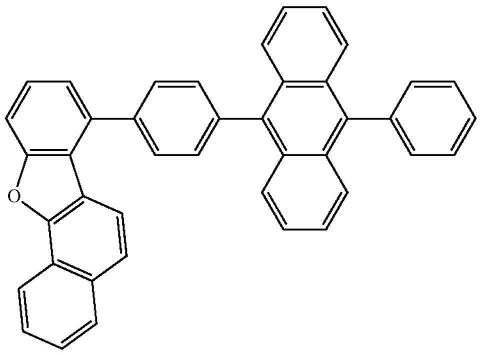
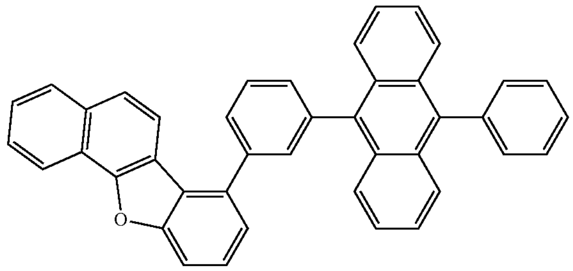
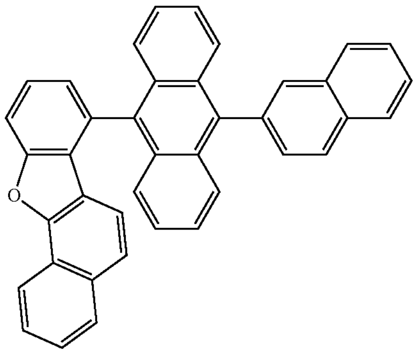
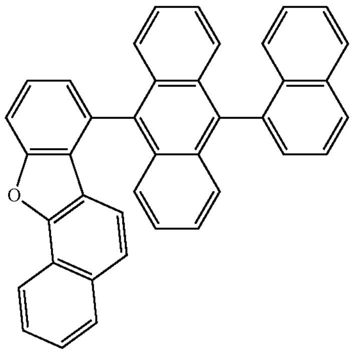
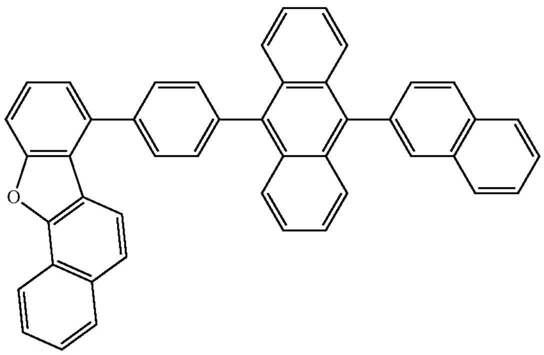
-continued
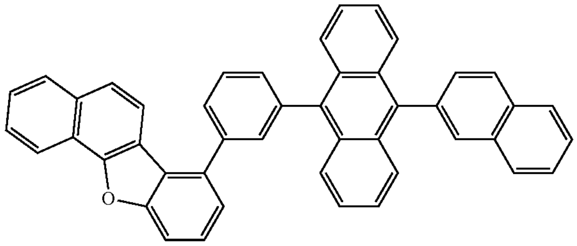
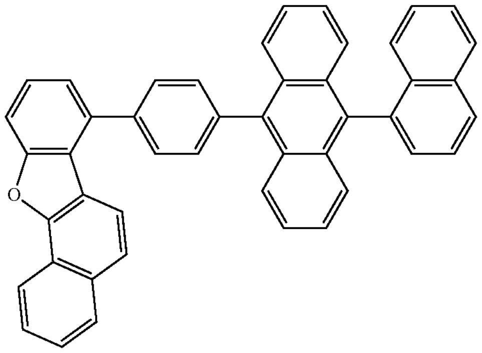
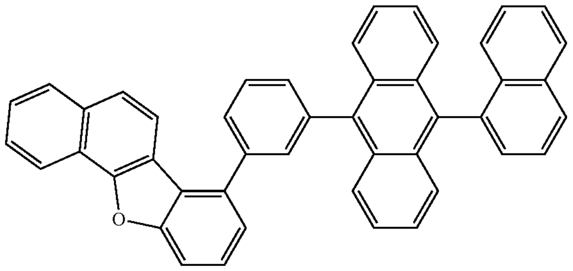
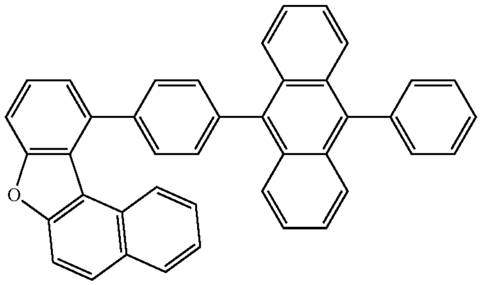
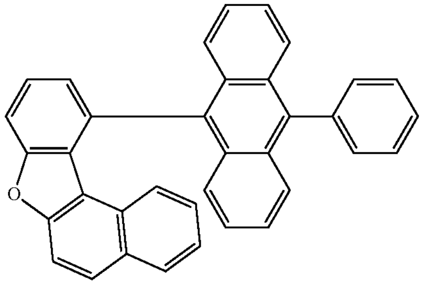
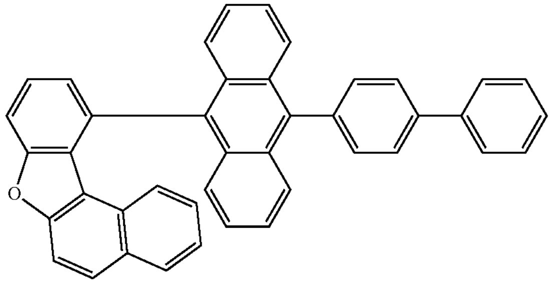

-continued
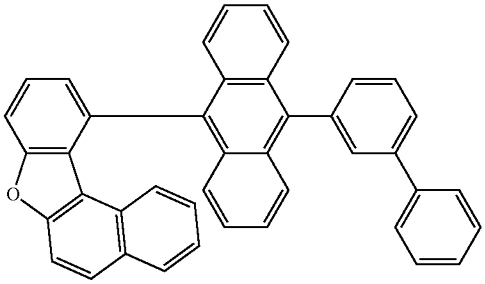
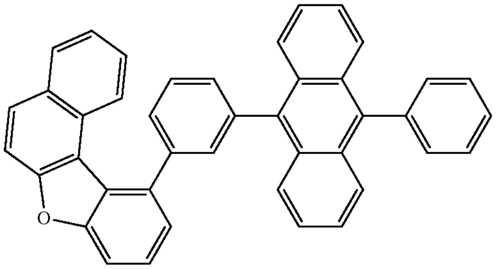
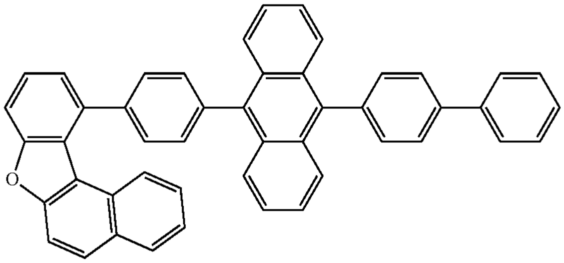
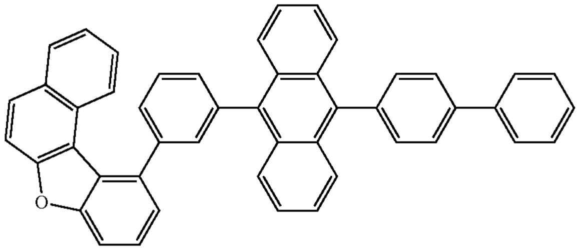
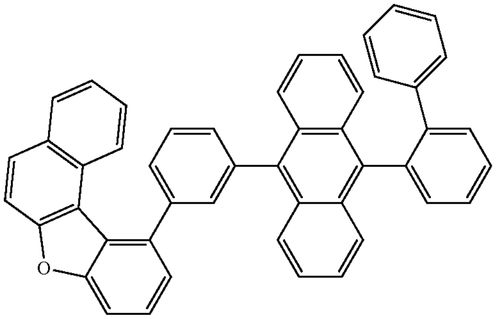
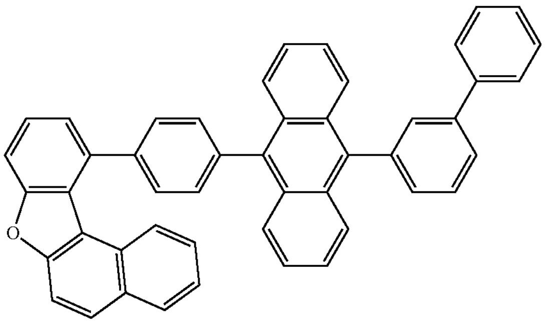
-continued
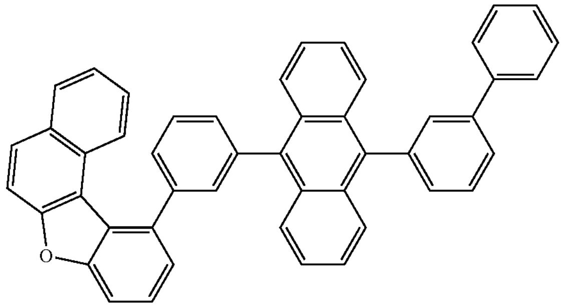
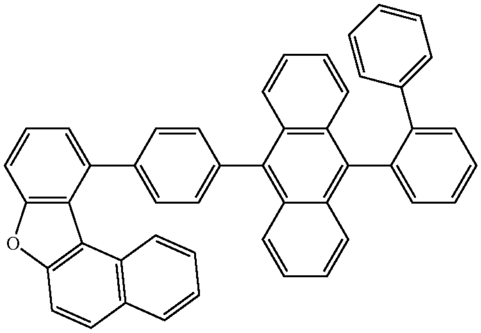
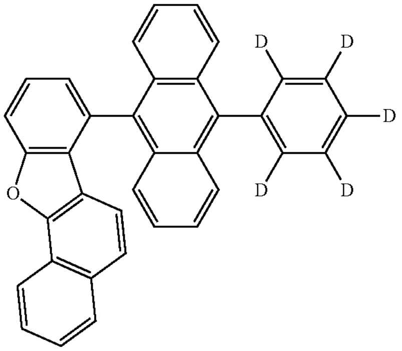
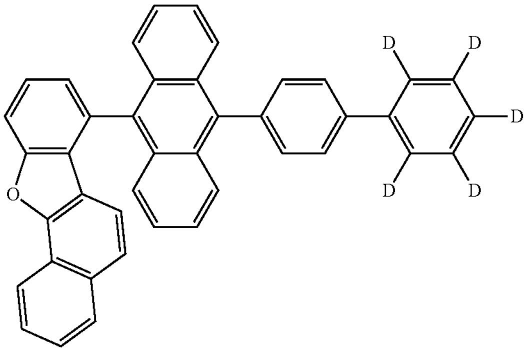
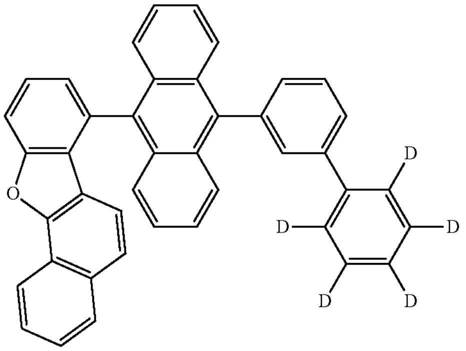

-continued
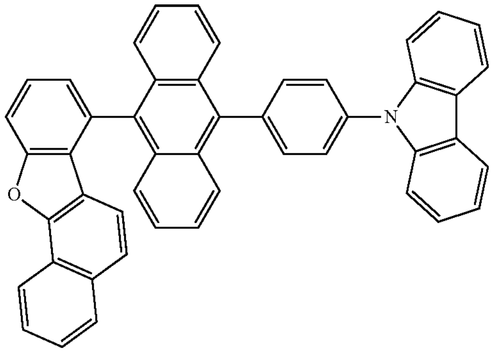
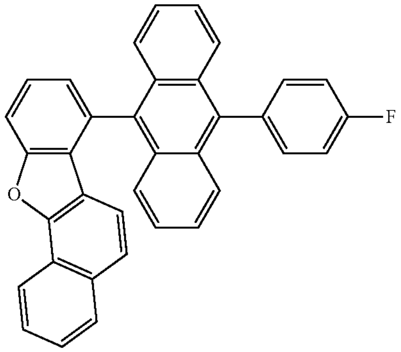
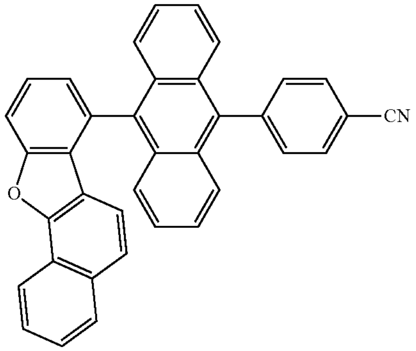
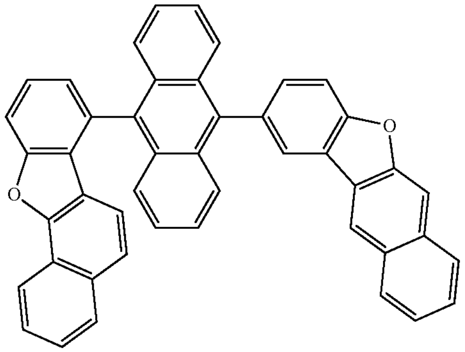
-continued
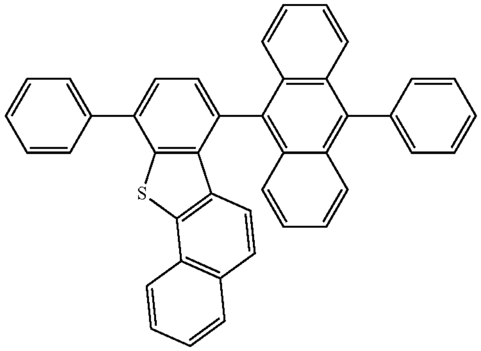
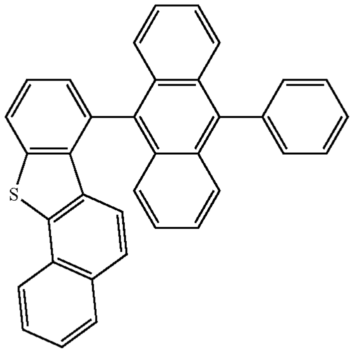
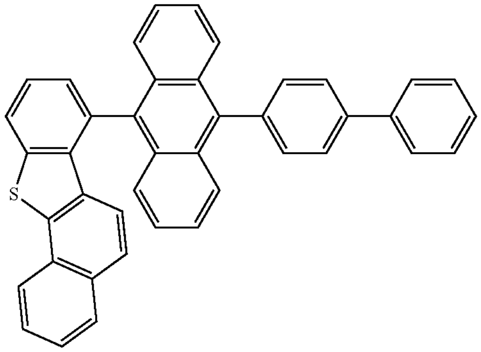
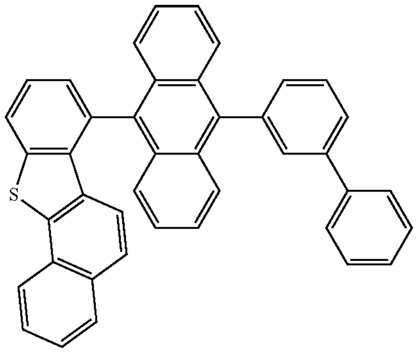

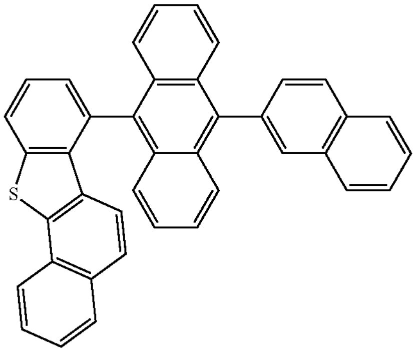
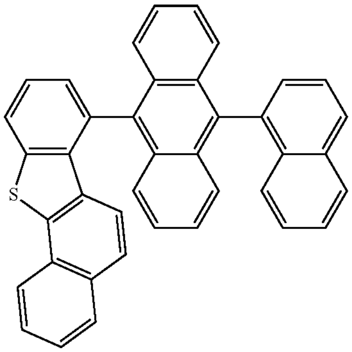
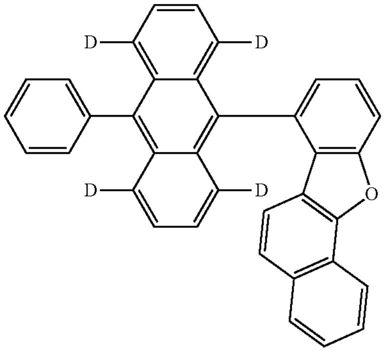
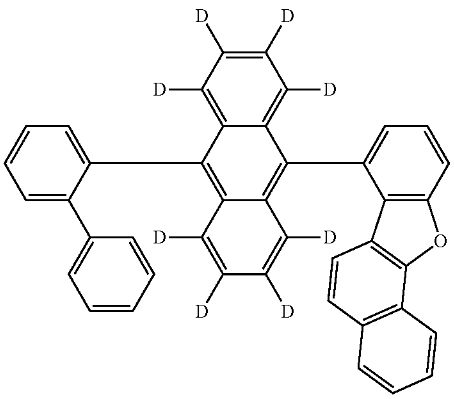
-continued
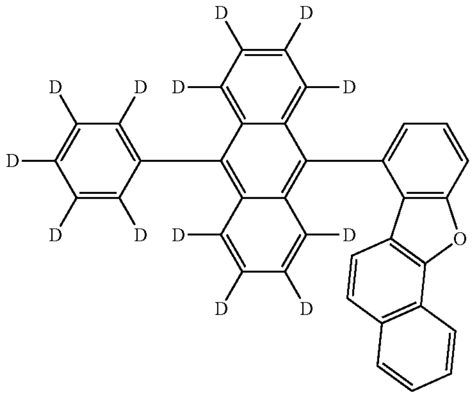
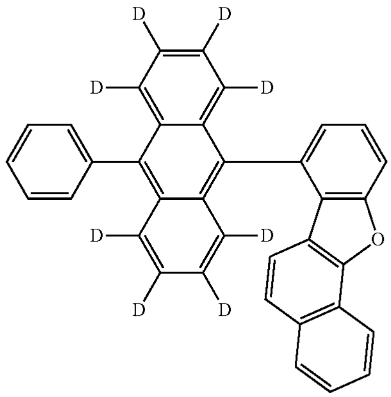
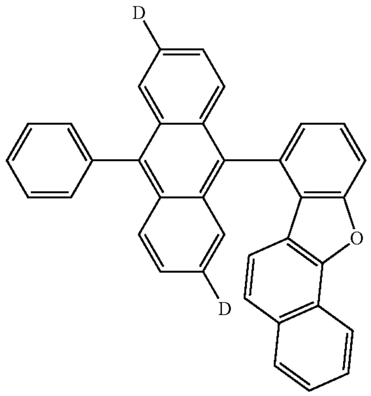
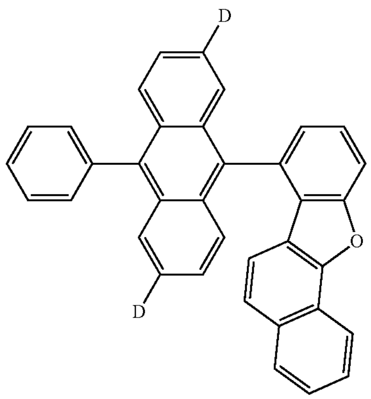

-continued
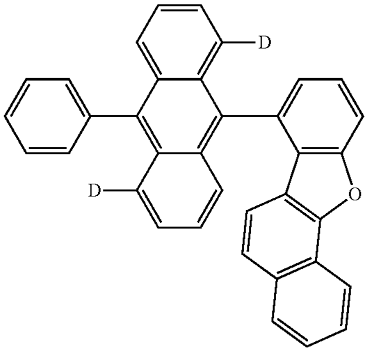
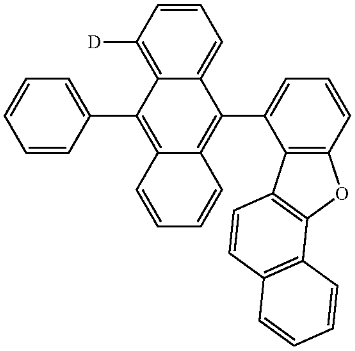
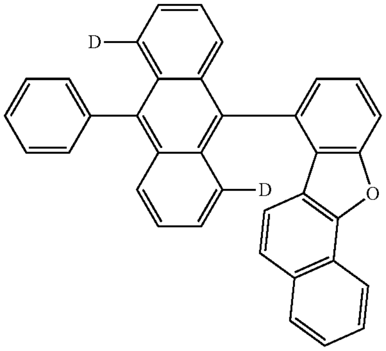
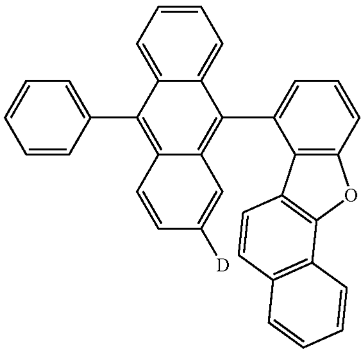
-continued
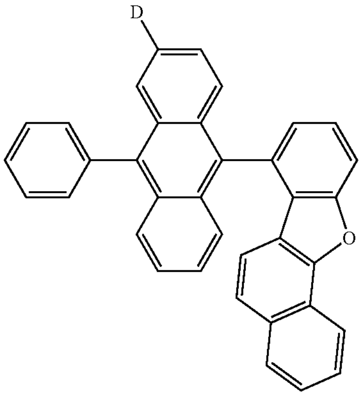
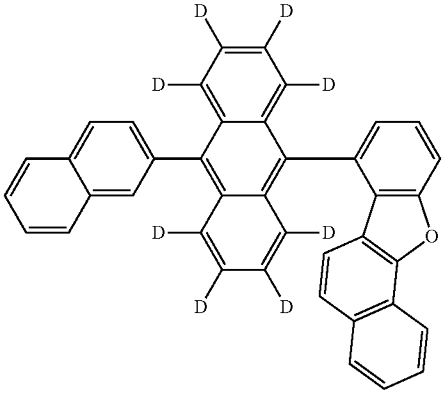
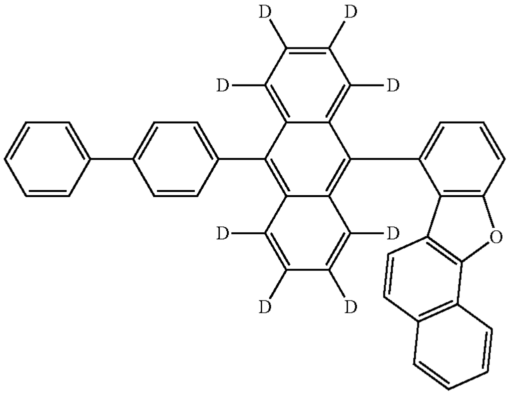
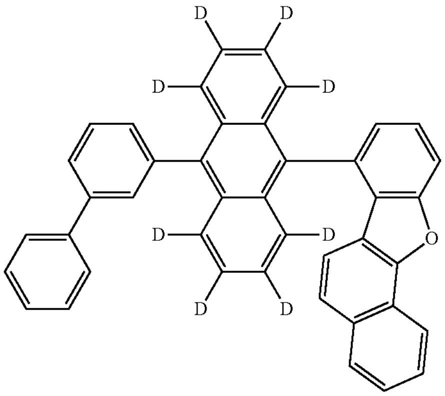

-continued
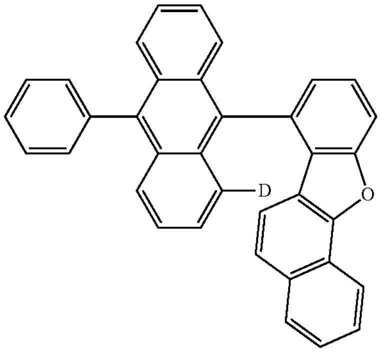
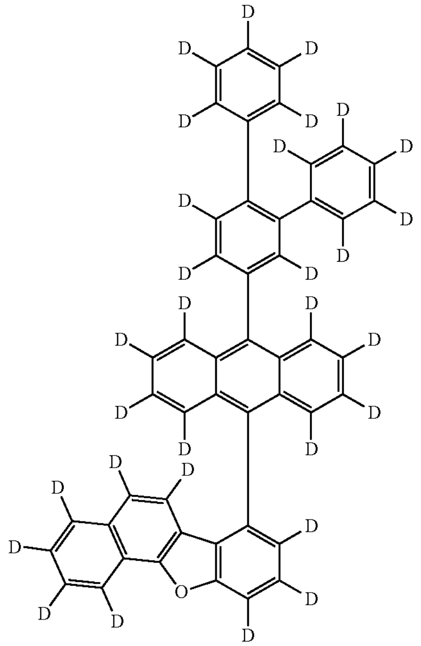
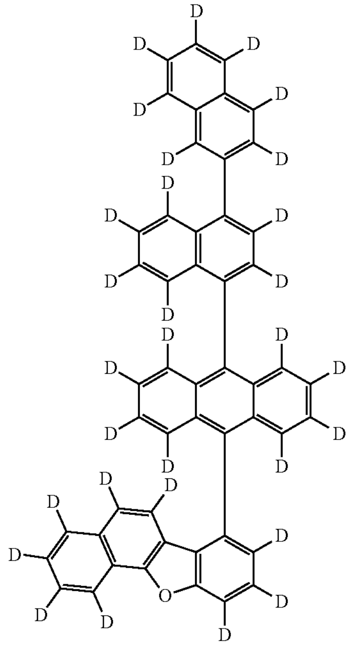
-continued
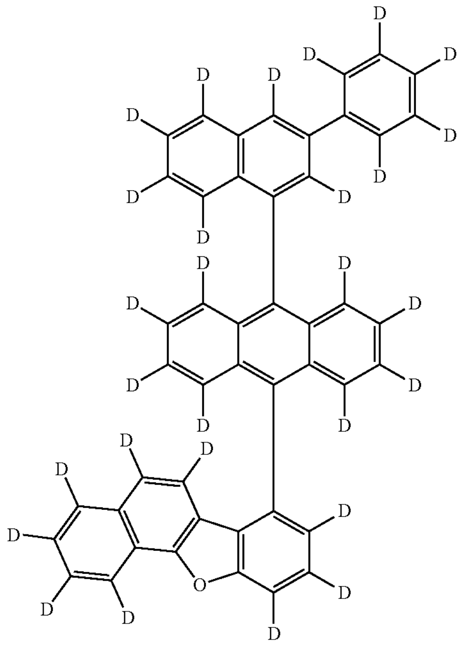
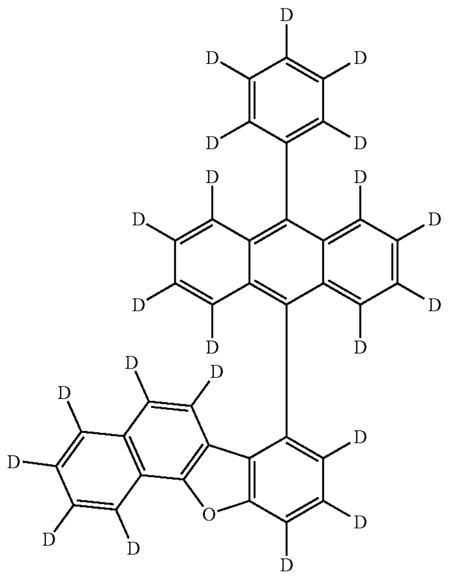

-continued
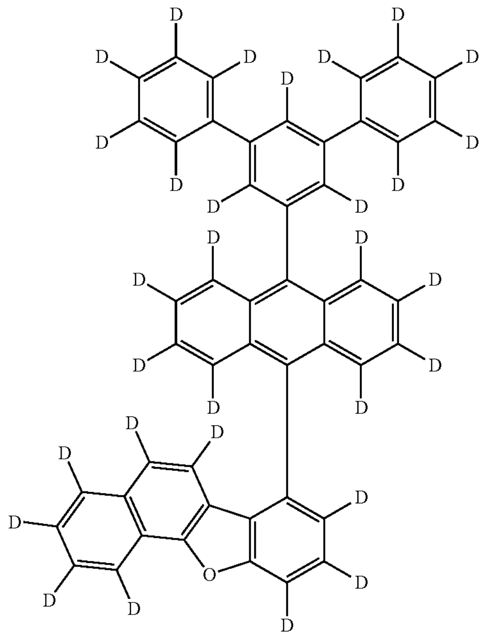
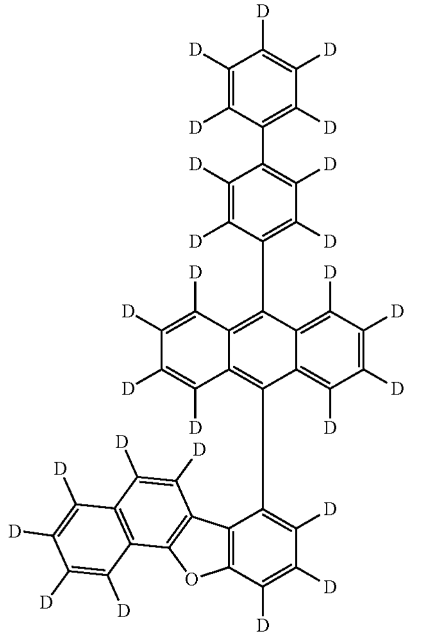
-continued
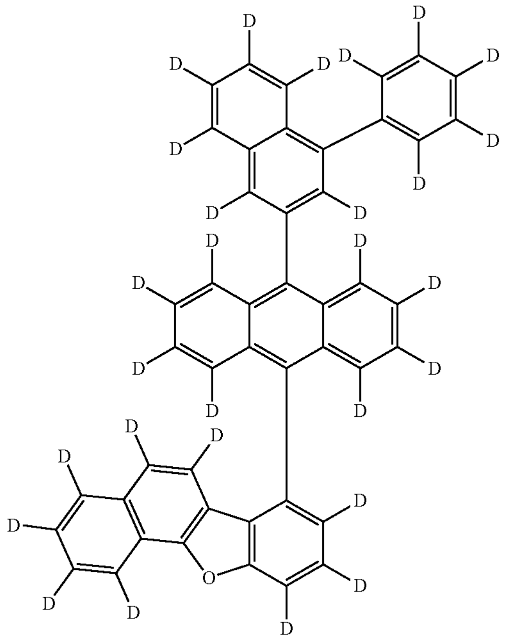
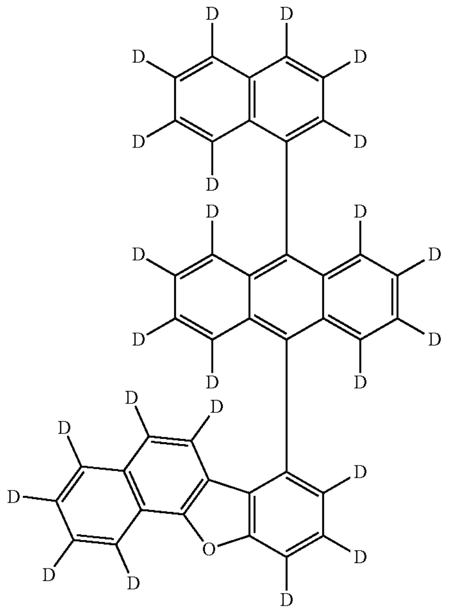

-continued
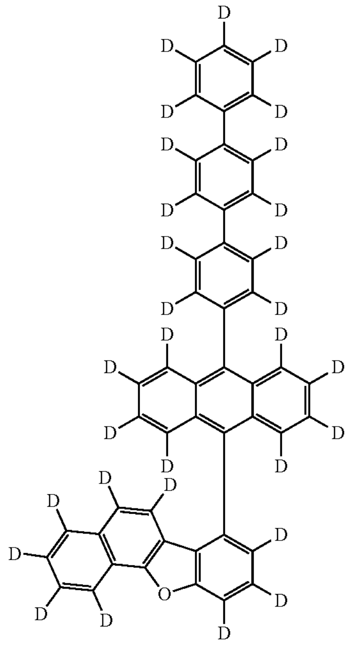
-continued
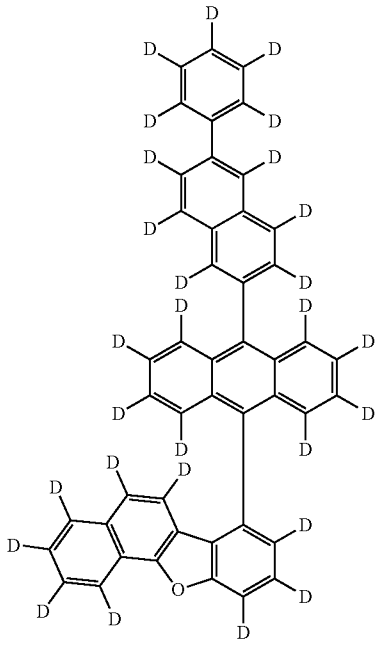
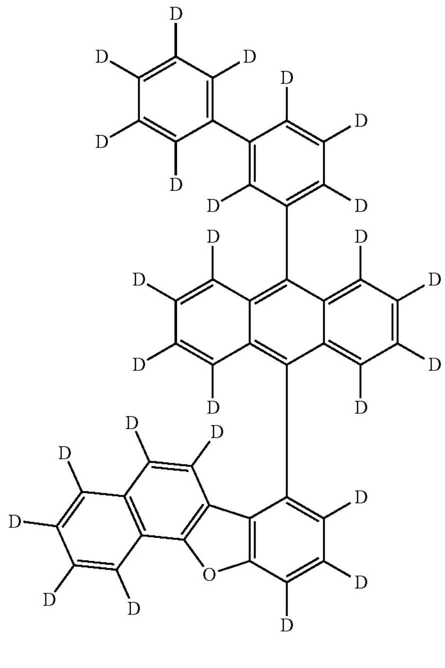
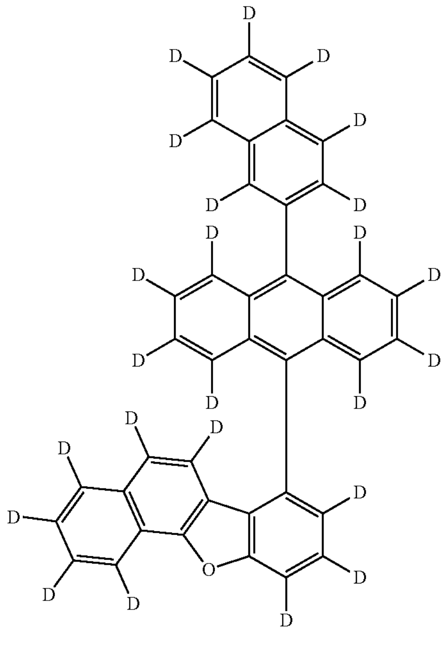

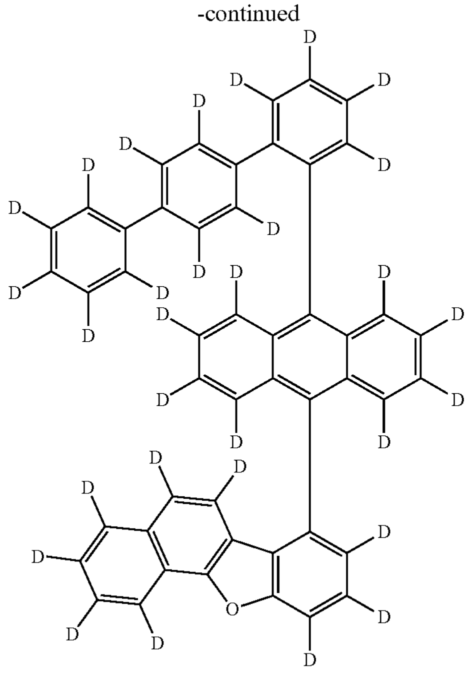
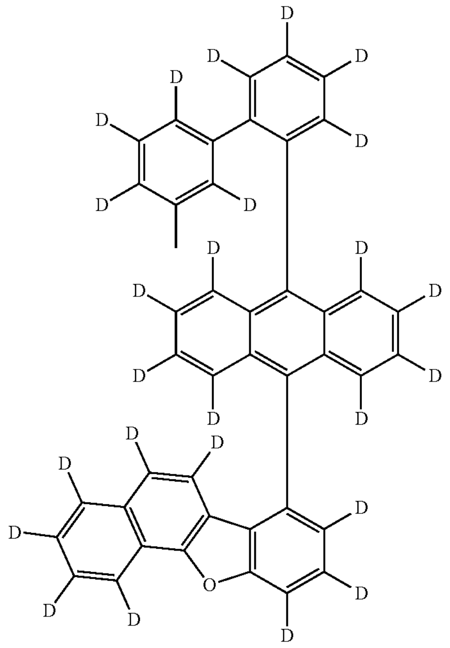
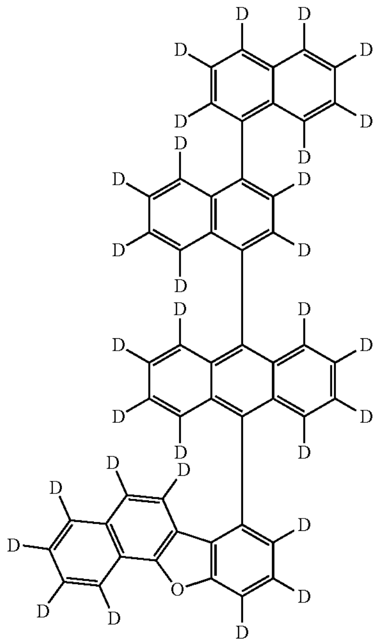
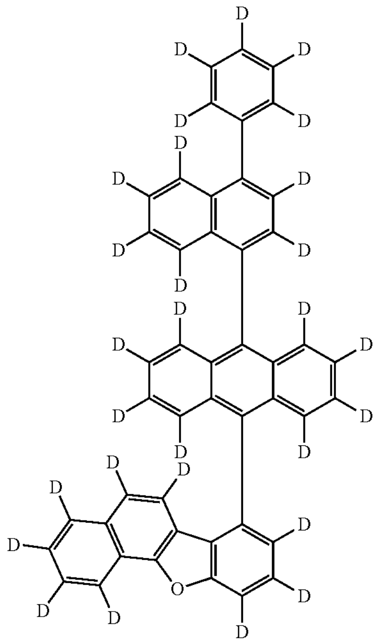

-continued
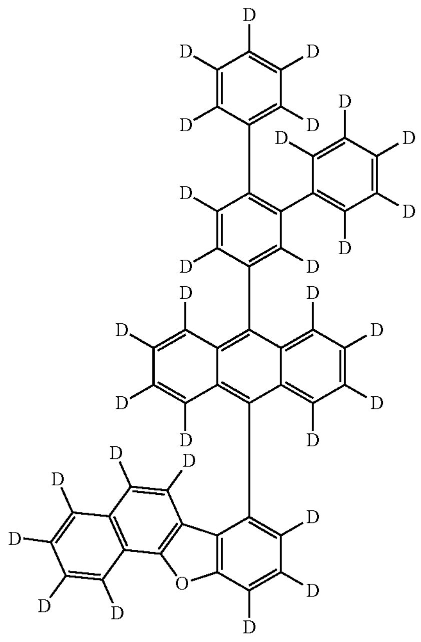
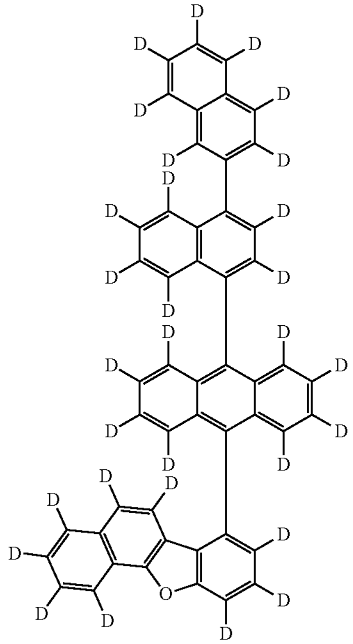
-continued
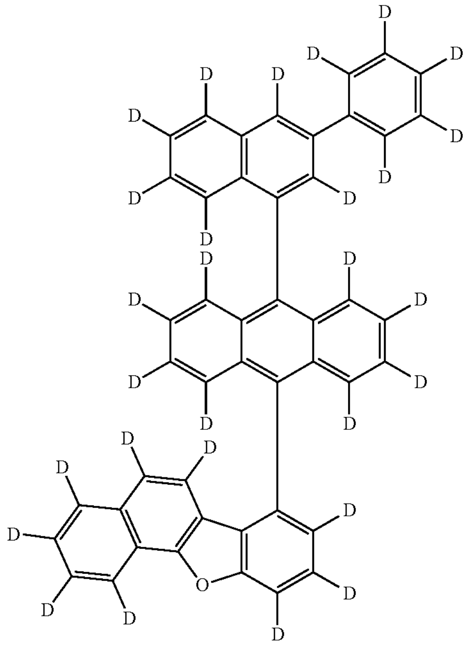
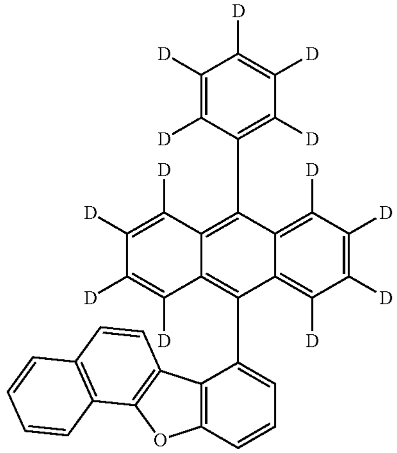
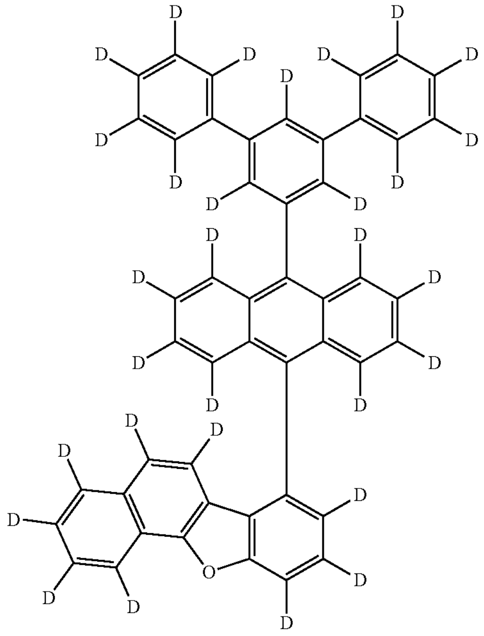

-continued
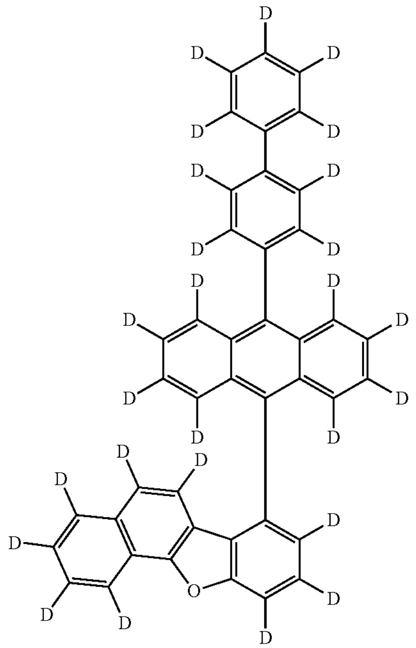
-continued
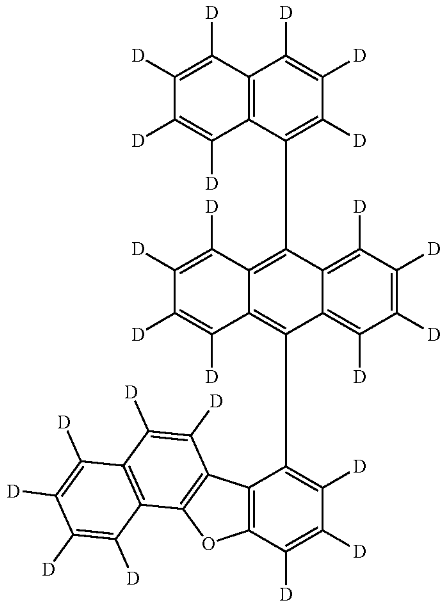
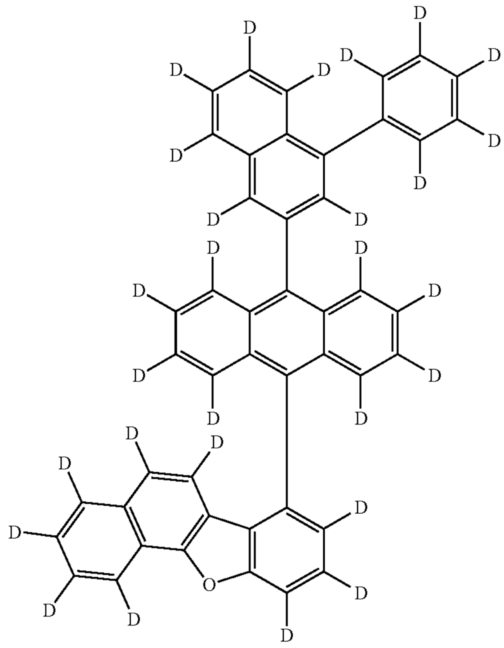
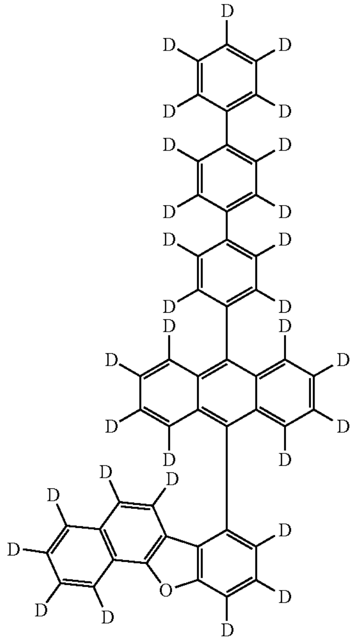

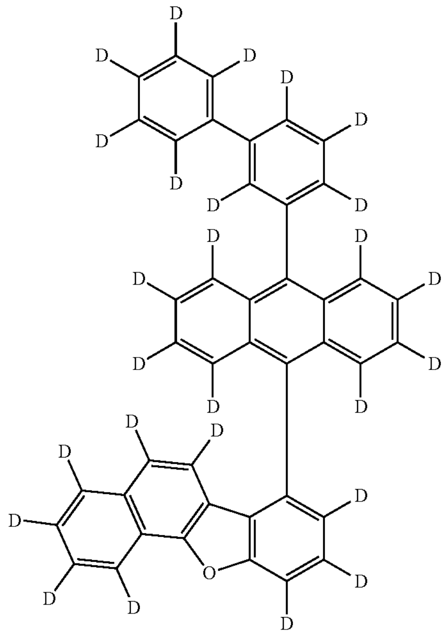
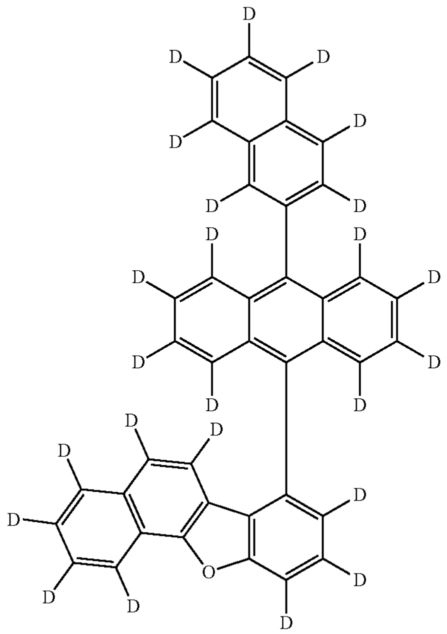
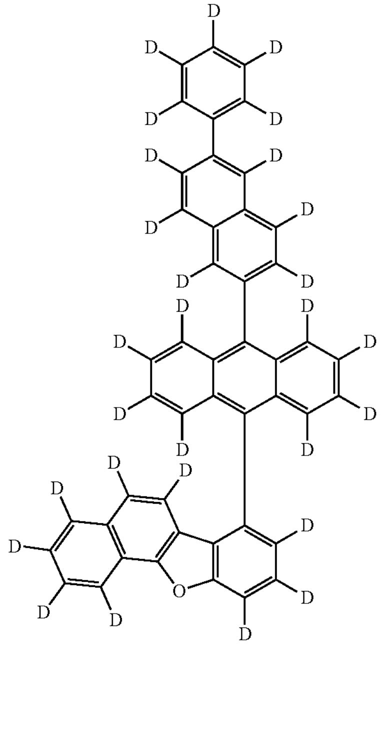
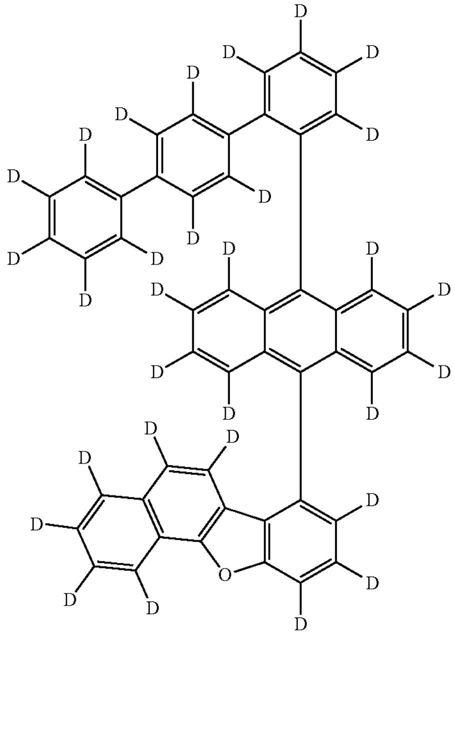

-continued
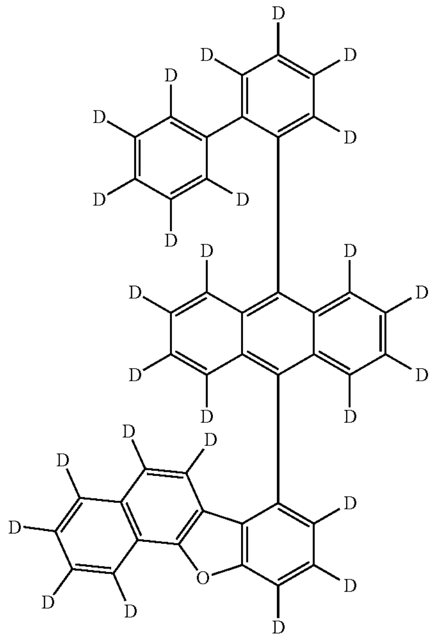
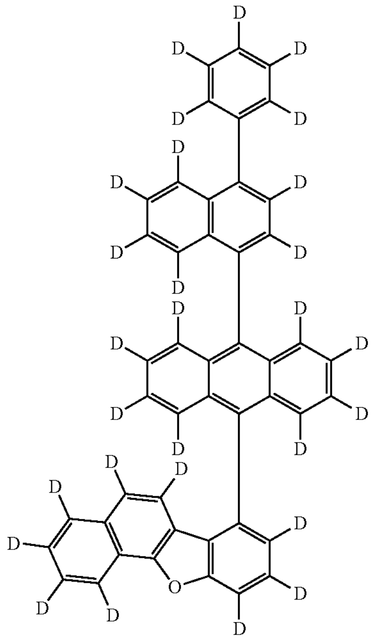
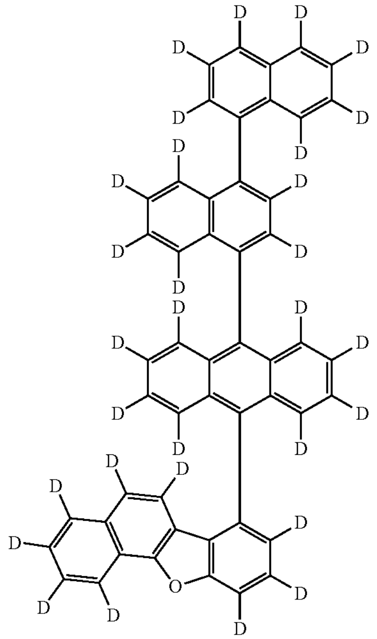
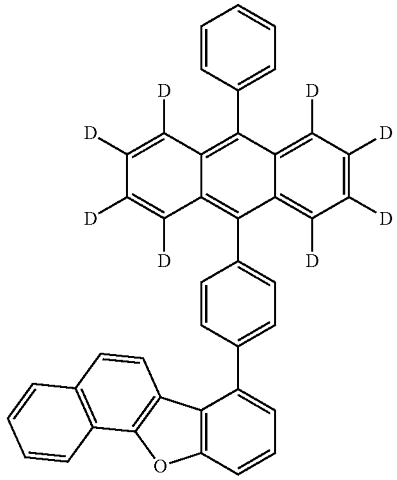

-continued
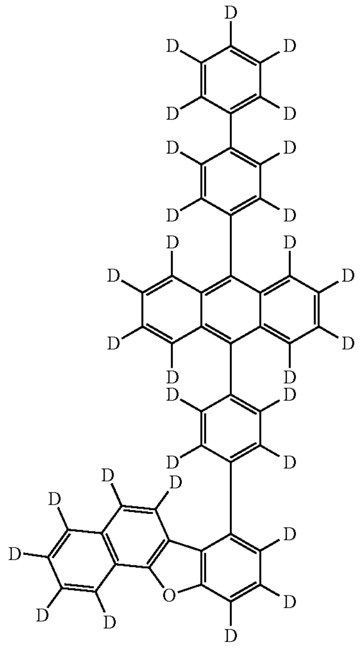
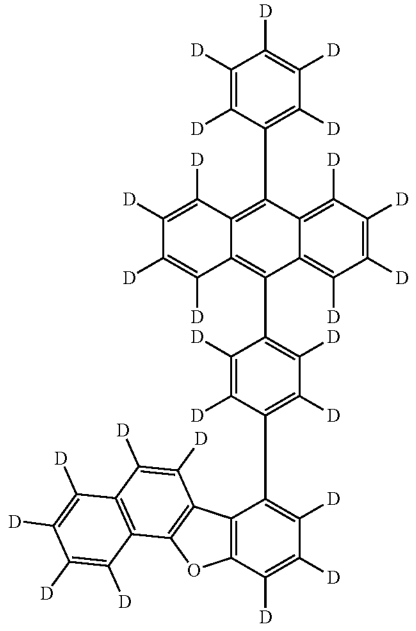
-continued
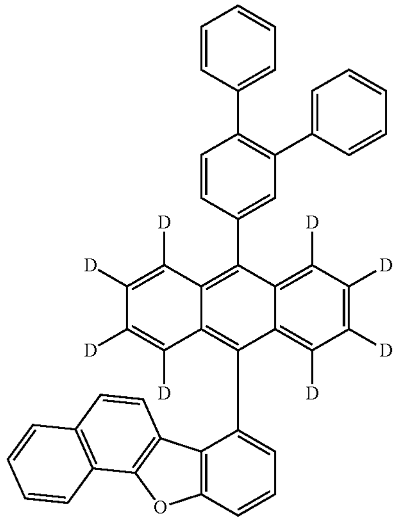
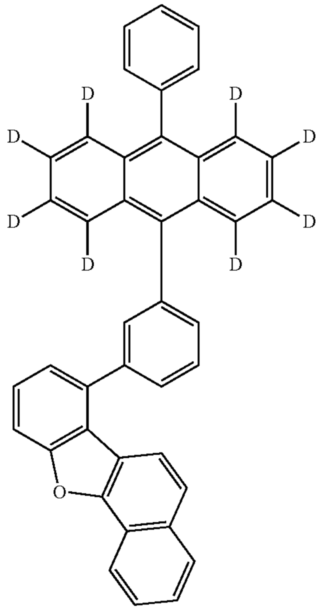

-continued
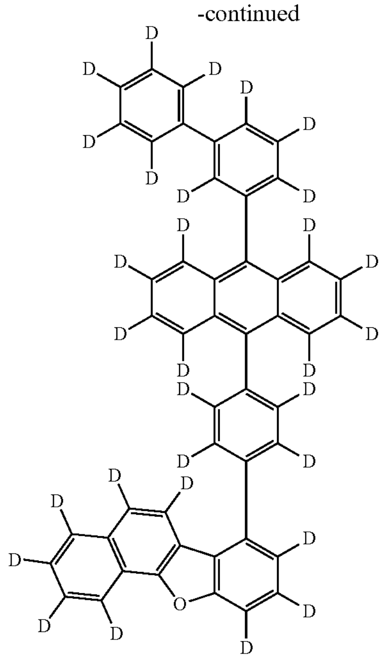
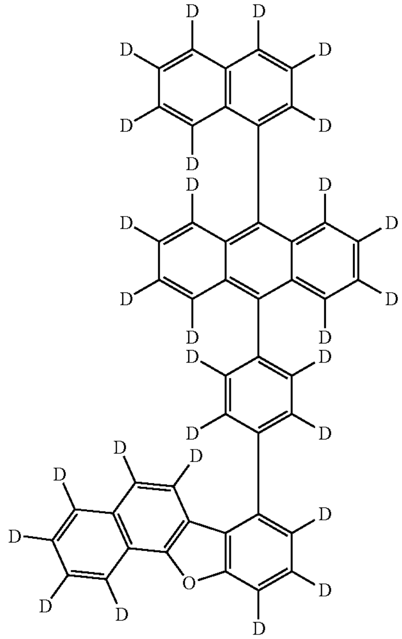
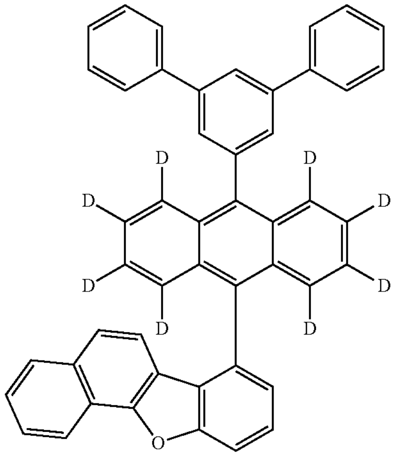
-continued
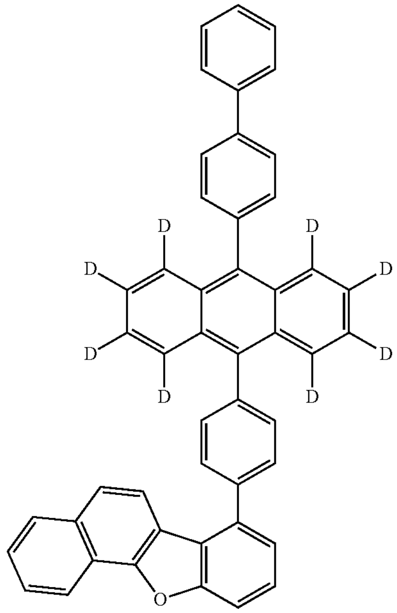
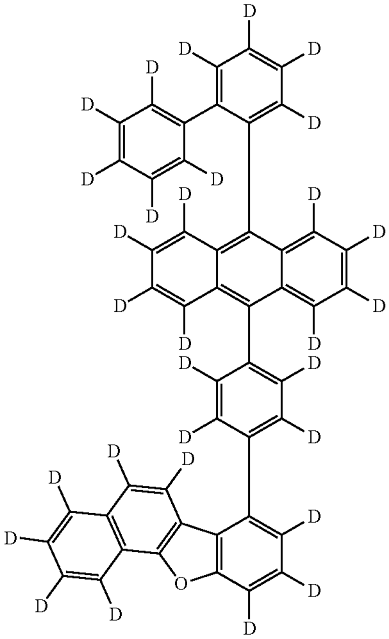

-continued
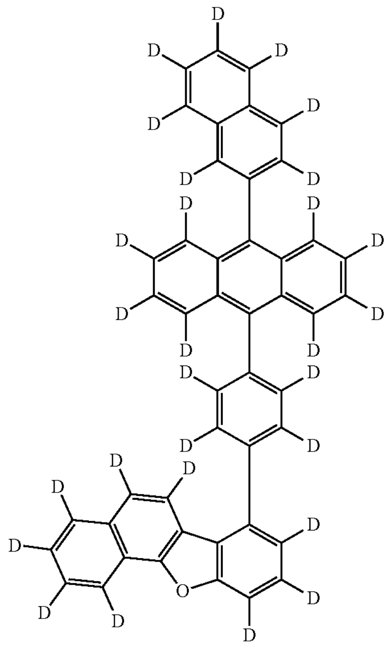
-continued
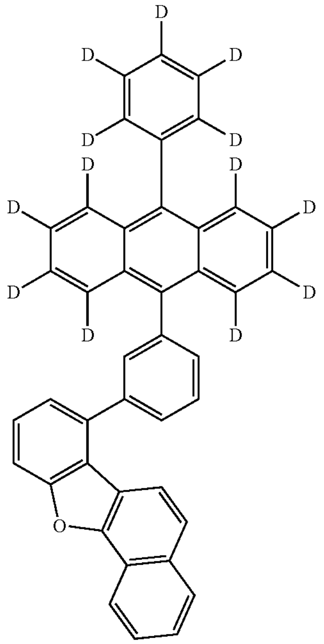
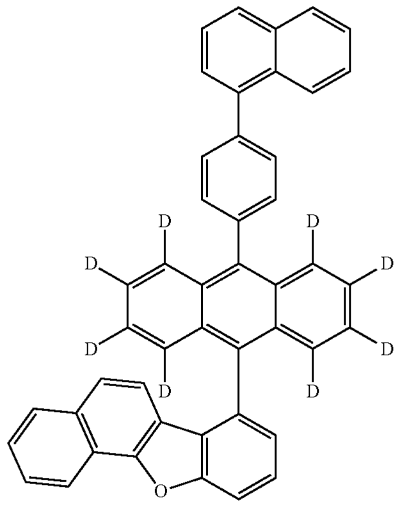
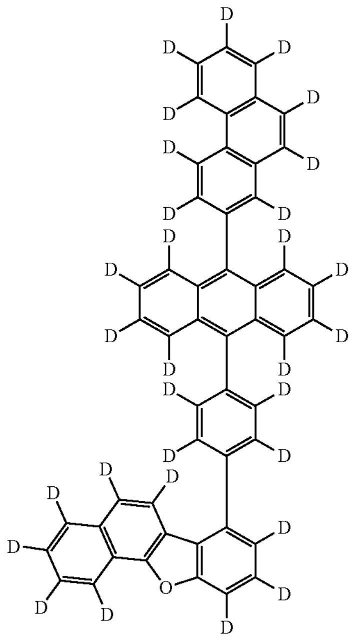

-continued

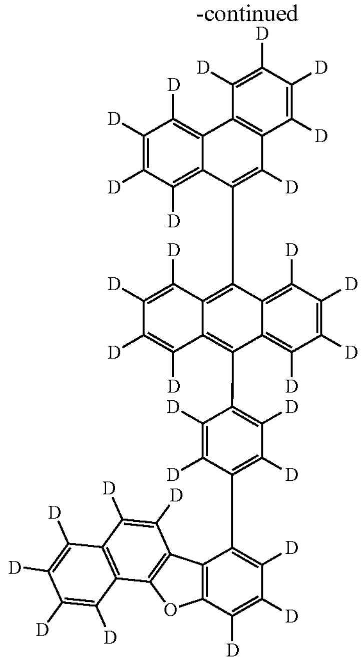

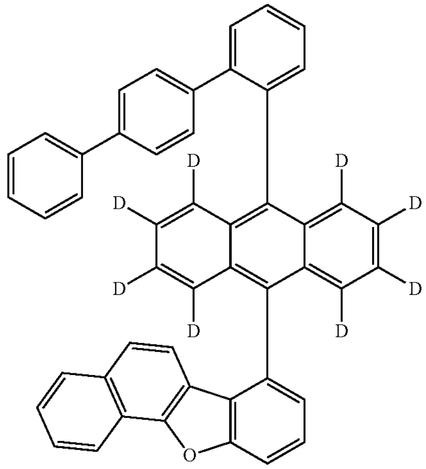

Combinations of the compound represented by the formula (1) and the compound represented by the formula (2) which are contained in the composition are more specifically shown below.

Combination 1

The compound represented by the formula (1) is BH1-A, and the compound represented by the formula (2) is BH2-A.

BH1-A

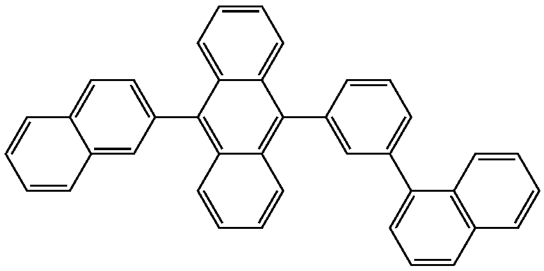

-continued

BH2-A

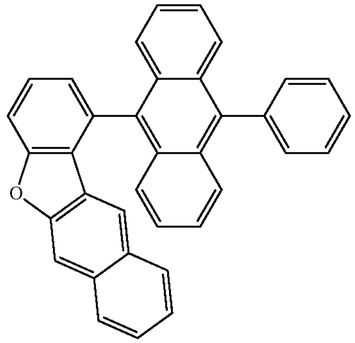

Combination 2

The compound represented by the formula (1) is BH1-A, and the compound represented by the formula (2) is BH2-B.

BH1-A

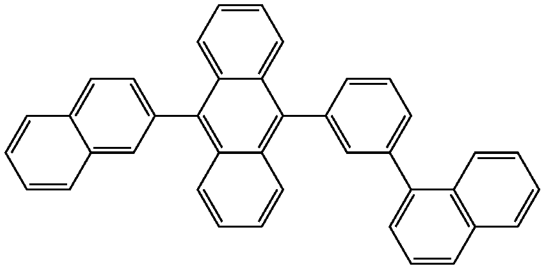

BH2-B

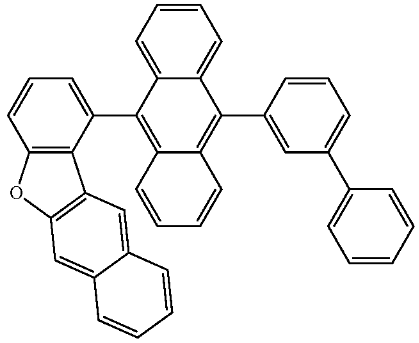

Combination 3

The compound represented by the formula (1) is BH1-A, and the compound represented by the formula (2) is BH2-C.

BH1-A

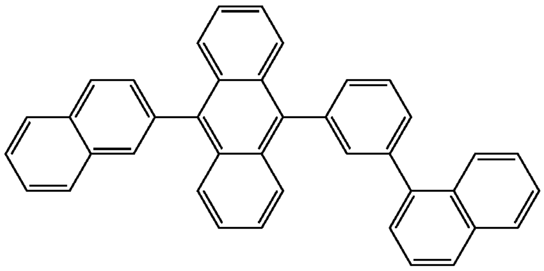

-continued

BH2-C

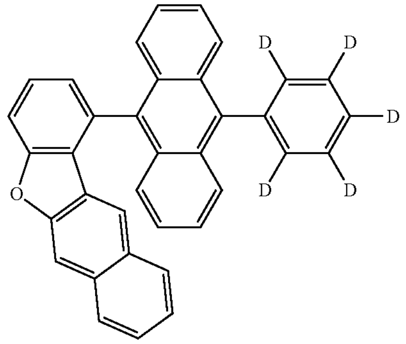

Combination 4

The compound represented by the formula (1) is BH1-A, and the compound represented by the formula (2) is BH2-D.

BH1-A

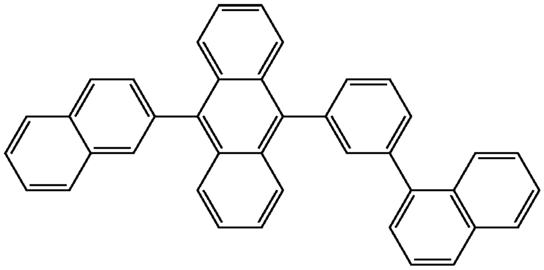

BH2-D

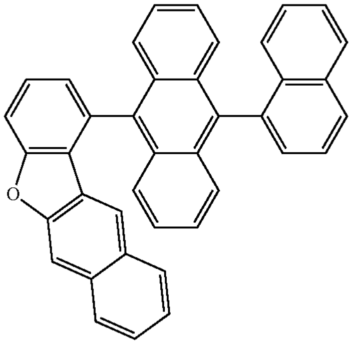

Combination 5

The compound represented by the formula (1) is BH1-A, and the compound represented by the formula (2) is BH2-E.

BH1-A

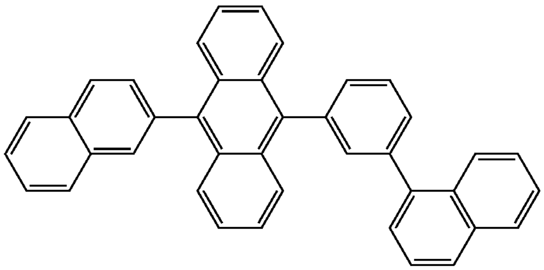

-continued

BH2-E

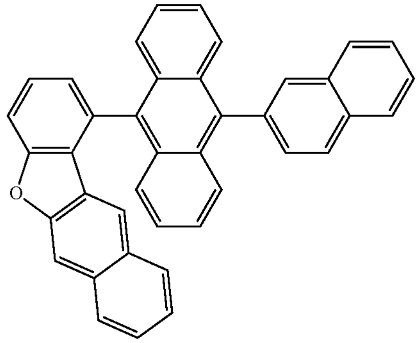

Combination 6

The compound represented by the formula (1) is BH1-A, and the compound represented by the formula (2) is BH2-F.

BH1-A

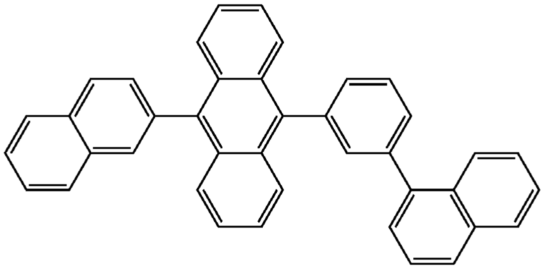

BH2-F

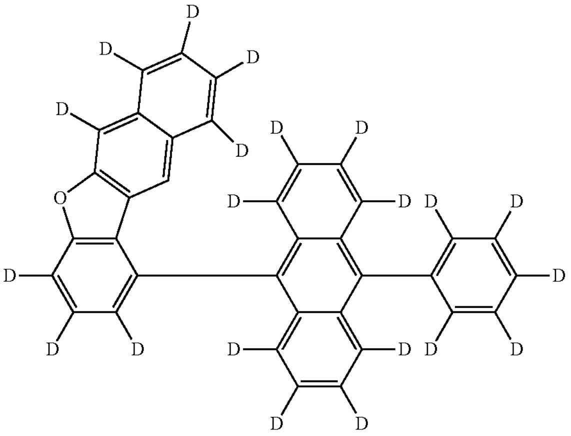

Combination 7

The compound represented by the formula (1) is BH1-A, and the compound represented by the formula (2) is BH2-G.

BH1-A

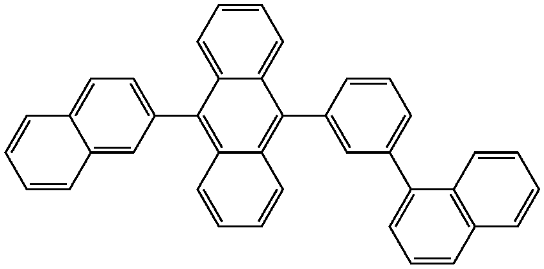

BH2-G

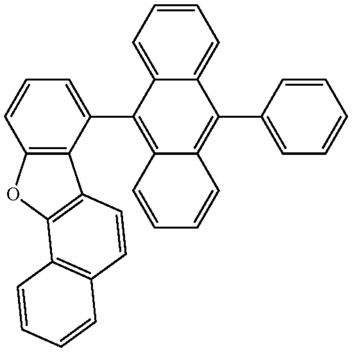

Combination 8

The compound represented by the formula (1) is BH1-A, and the compound represented by the formula (2) is BH2-H.

BH1-A

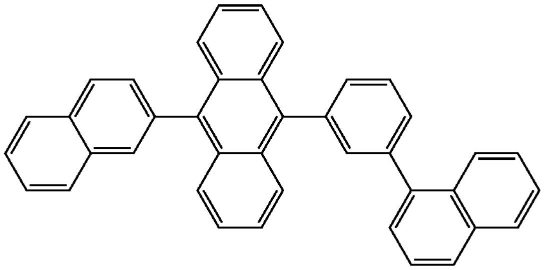

BH2-H

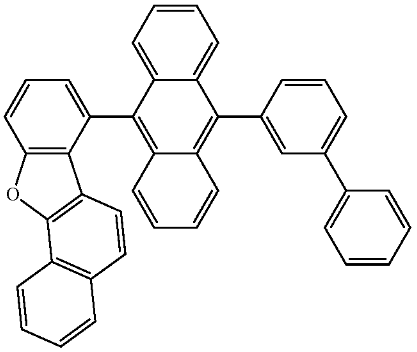

Combination 9

The compound represented by the formula (1) is BH1-A, and the compound represented by the formula (2) is BH2-1.

BH1-A

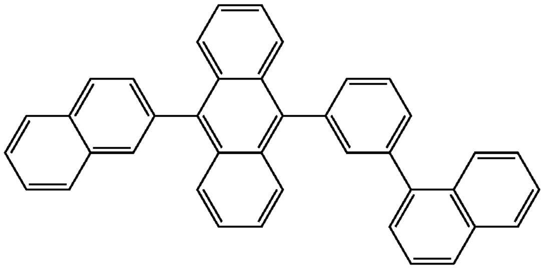

BH2-I

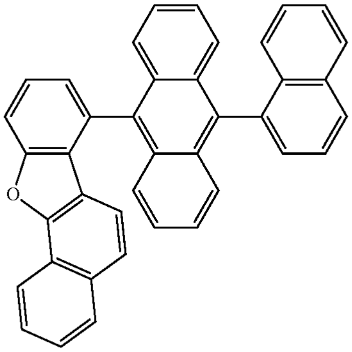

Combination 10

The compound represented by the formula (1) is BH1-A, and the compound represented by the formula (2) is BH2-J.

BH1-A

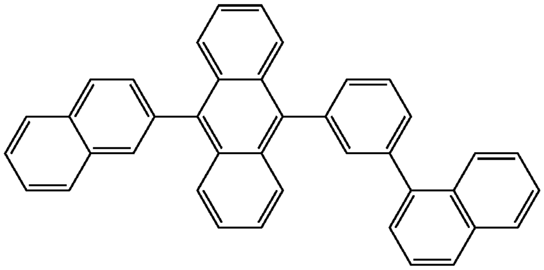

BH2-J

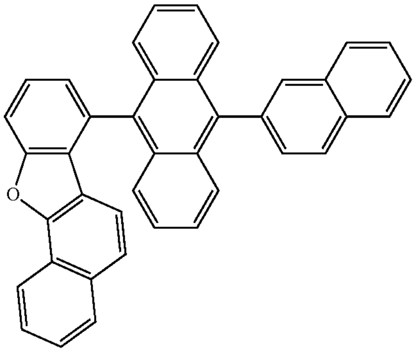

Combination 11

The compound represented by the formula (1) is BH1-A, and the compound represented by the formula (2) is BH2-K.

BH1-A

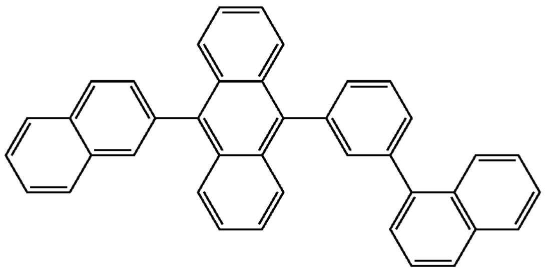

BH2-K

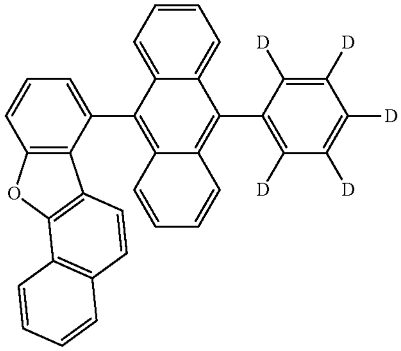

Combination 12

The compound represented by the formula (1) is BH1-A, and the compound represented by the formula (2) is BH2-L.

BH1-A

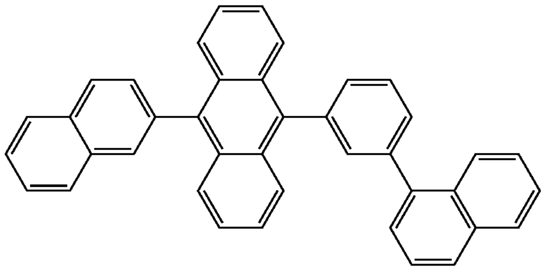

BH2-L

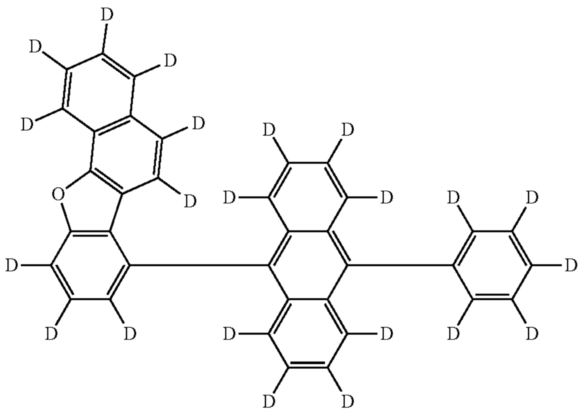

Combination 13

The compound represented by the formula (1) is BH1-A, and the compound represented by the formula (2) is BH2-M.

BH1-A

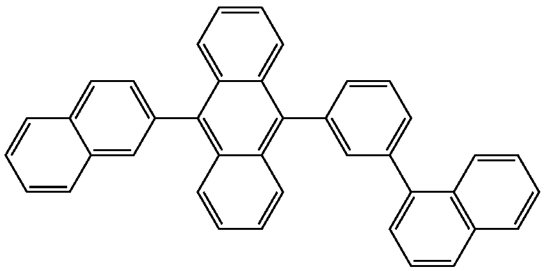

BH2-M

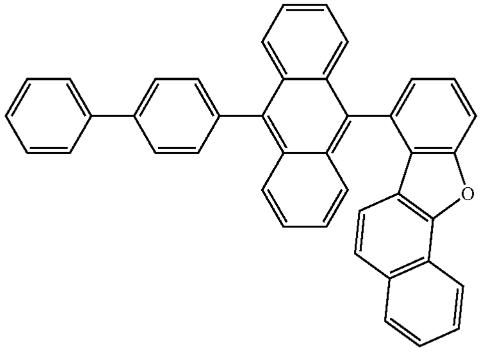

Combination 14

The compound represented by the formula (1) is BH1-B, and the compound represented by the formula (2) is BH2-A.

BH1-B

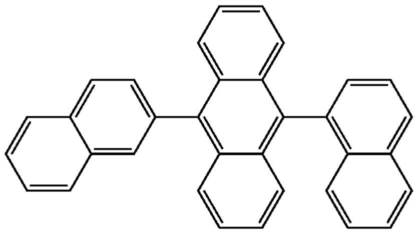

BH2-A

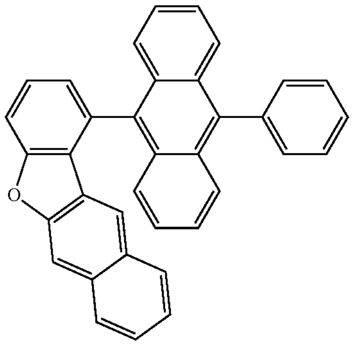

Combination 15

The compound represented by the formula (1) is BH1-B, and the compound represented by the formula (2) is BH2-B.

BH1-B

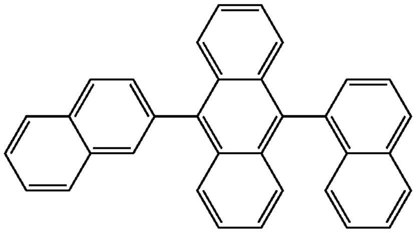

BH2-B

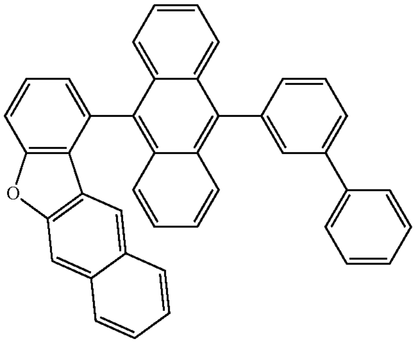

Combination 16

The compound represented by the formula (1) is BH1-B, and the compound represented by the formula (2) is BH2-C.

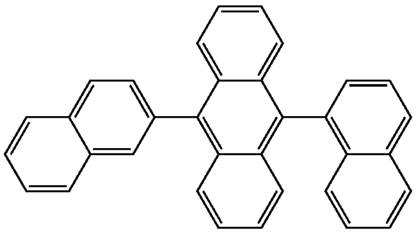

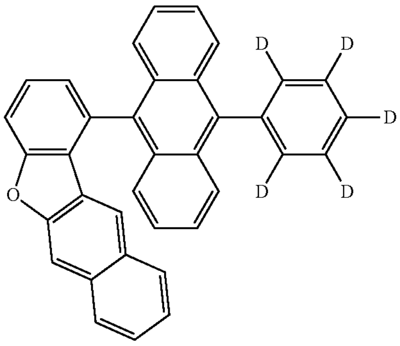

Combination 17

The compound represented by the formula (1) is BH1-B, and the compound represented by the formula (2) is BH2-D.

BH1-B

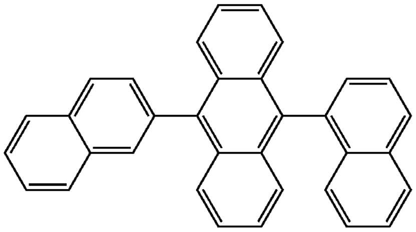

BH2-D

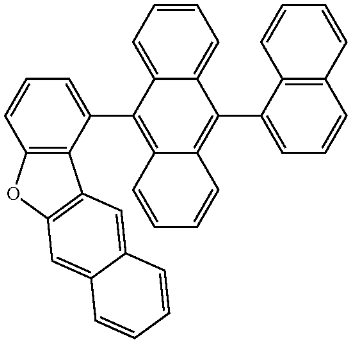

Combination 18

The compound represented by the formula (1) is BH1-B, and the compound represented by the formula (2) is BH2-E.

BH1-B

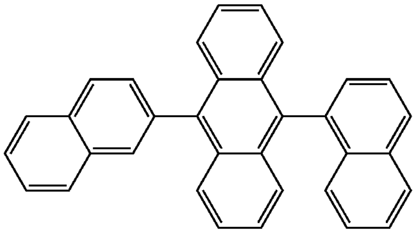

BH2-E

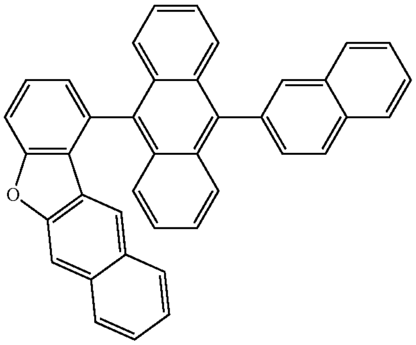

Combination 19

The compound represented by the formula (1) is BH1-B, and the compound represented by the formula (2) is BH2-F.

BH1-B

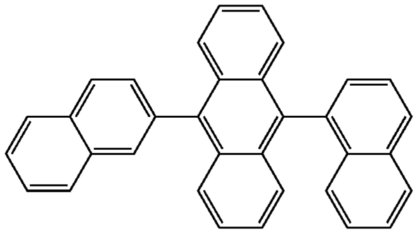

BH2-F

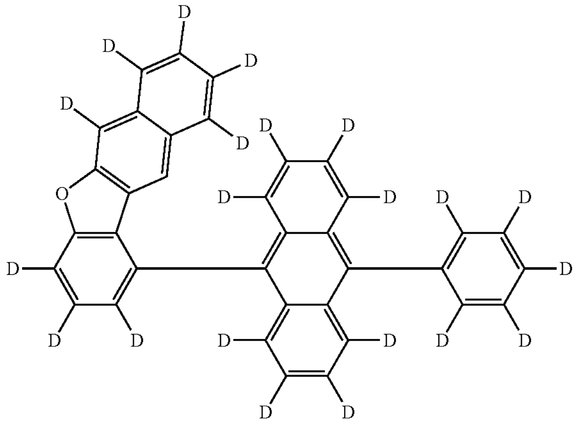

Combination 20

The compound represented by the formula (1) is BH1-B, and the compound represented by the formula (2) is BH2-G.

BH1-B

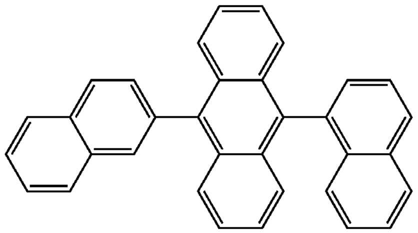

BH2-G

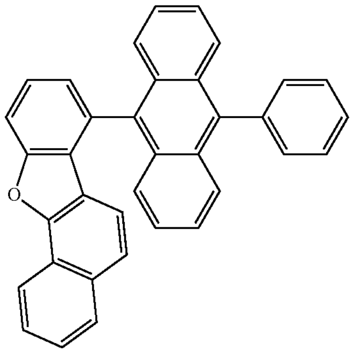

Combination 21

The compound represented by the formula (1) is BH1-B, and the compound represented by the formula (2) is BH2-H.

BH1-B

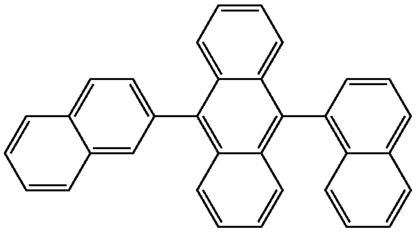

BH2-H

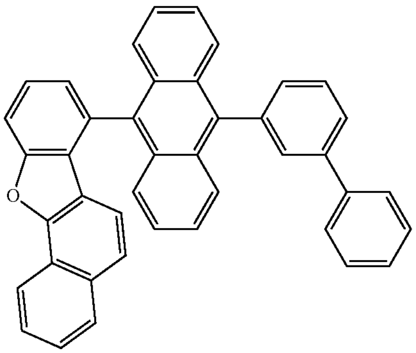

Combination 22

The compound represented by the formula (1) is BH1-B, and the compound represented by the formula (2) is BH2-1.

BH1-B

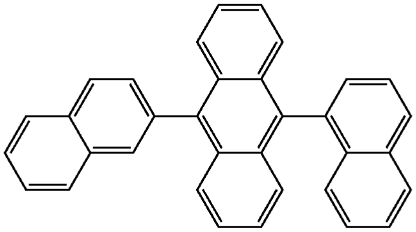

BH2-I

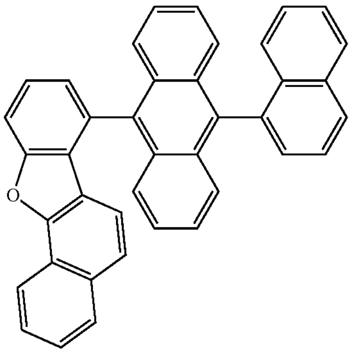

Combination 23

The compound represented by the formula (1) is BH1-B, and the compound represented by the formula (2) is BH2-J.

BH1-B

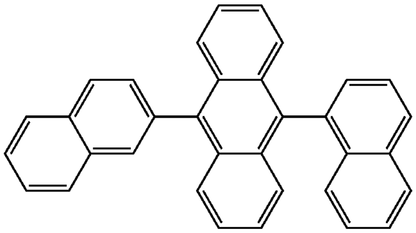

BH2-J

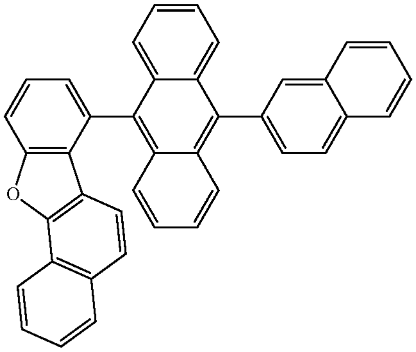

Combination 24

The compound represented by the formula (1) is BH1-B, and the compound represented by the formula (2) is BH2-K.

BH1-B

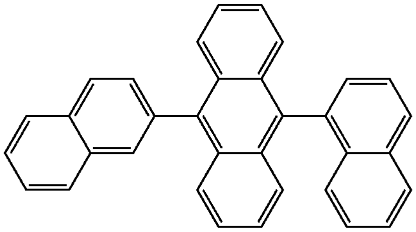

BH2-K

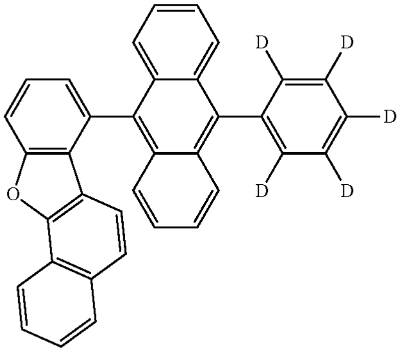

Combination 25

The compound represented by the formula (1) is BH1-B, and the compound represented by the formula (2) is BH2-L.

BH1-B

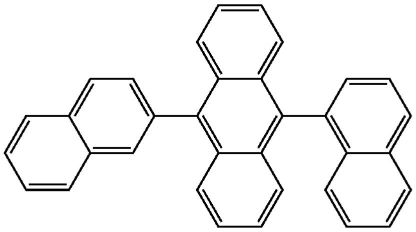

BH2-L

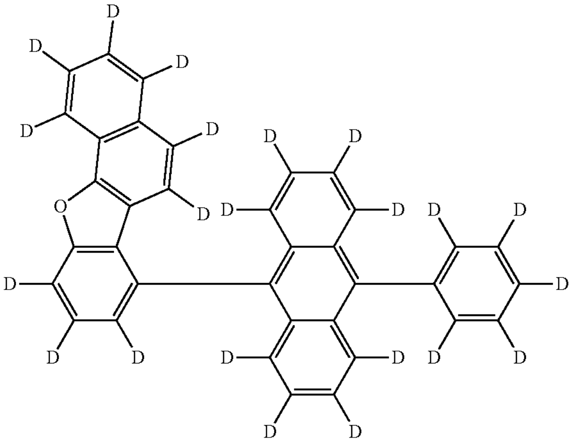

Combination 26

The compound represented by the formula (1) is BH1-B, and the compound represented by the formula (2) is BH2-M.

BH1-B

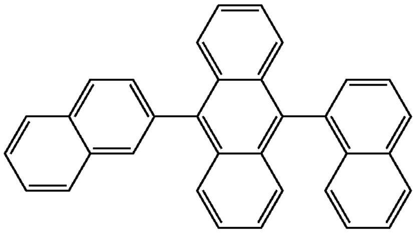

BH2-M

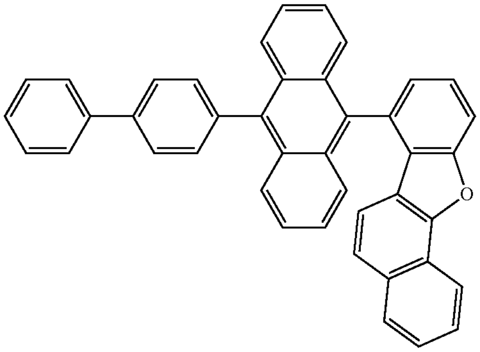

Combination 27

The compound represented by the formula (1) is BH1-C, and the compound represented by the formula (2) is BH2-A.

BH1-C

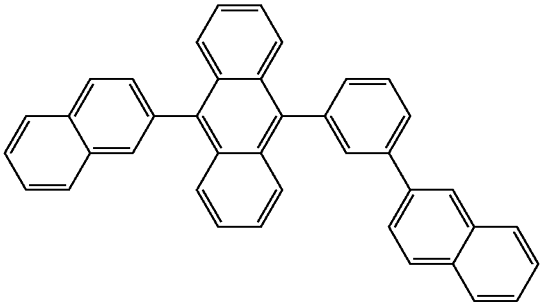

BH2-A

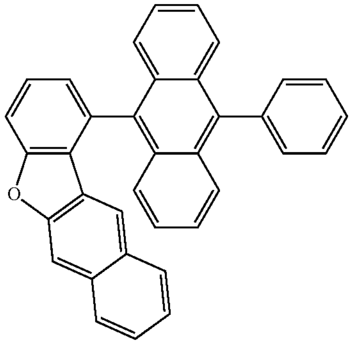

Combination 28

The compound represented by the formula (1) is BH1-C, and the compound represented by the formula (2) is BH2-B.

BH1-C

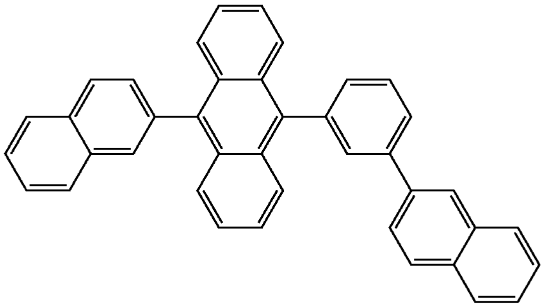

BH2-B

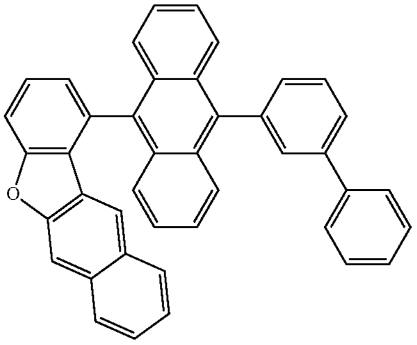

Combination 29

The compound represented by the formula (1) is BH1-C, and the compound represented by the formula (2) is BH2-C.

BH1-C

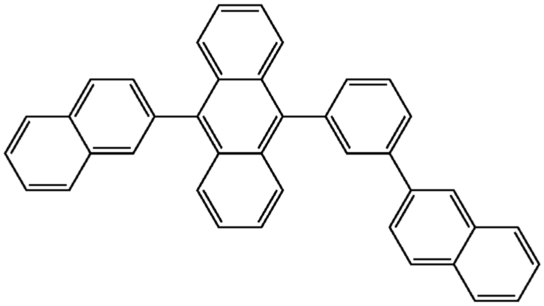

BH2-C

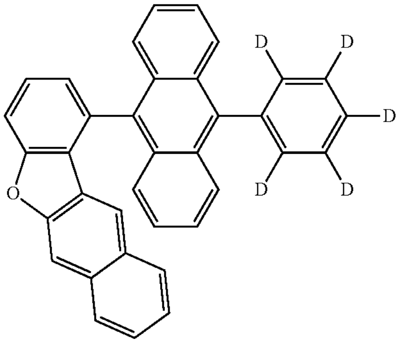

Combination 30

The compound represented by the formula (1) is BH1-C, and the compound represented by the formula (2) is BH2-D.

BH1-C

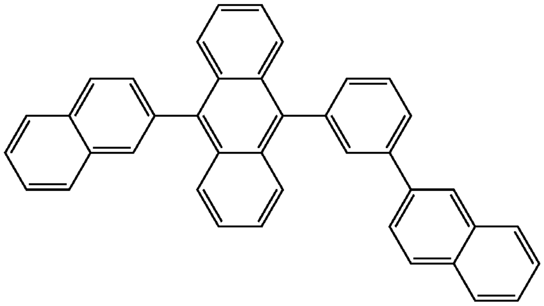

BH2-D

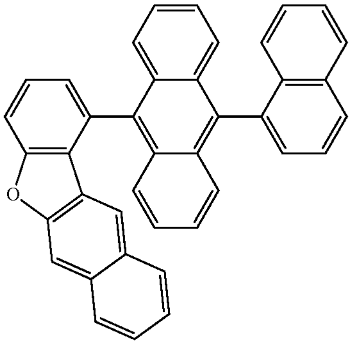

Combination 31

The compound represented by the formula (1) is BH1-C, and the compound represented by the formula (2) is BH2-E.

BH1-C

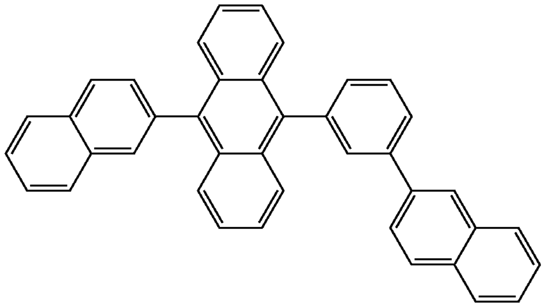

BH2-E

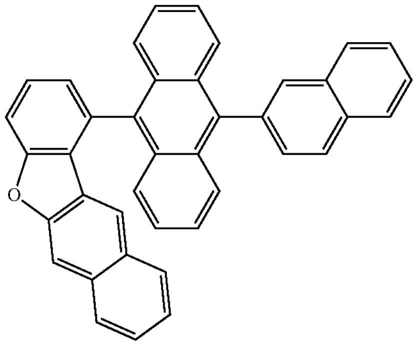

Combination 32

The compound represented by the formula (1) is BH1-C, and the compound represented by the formula (2) is BH2-F.

BH1-C

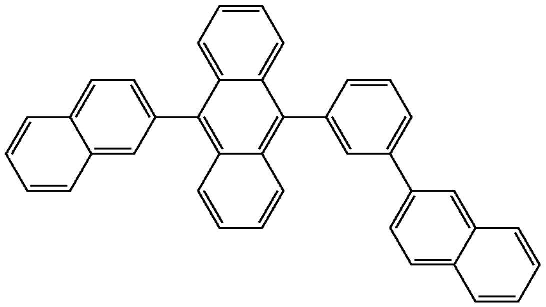

BH2-F

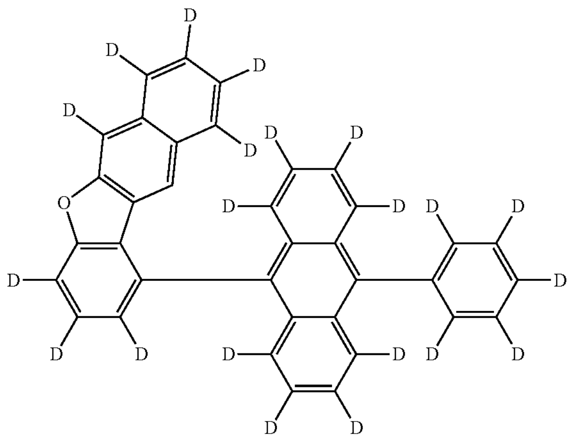

Combination 33

The compound represented by the formula (1) is BH1-C, and the compound represented by the formula (2) is BH2-G.

BH1-C

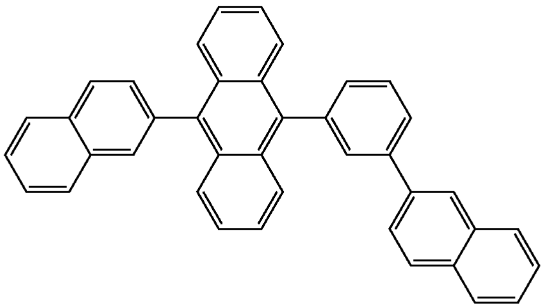

BH2-G

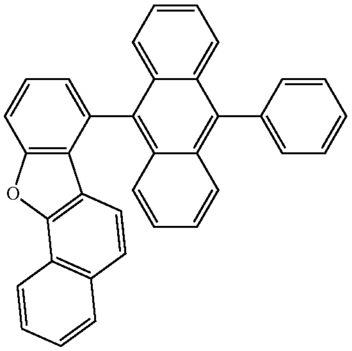

Combination 34

The compound represented by the formula (1) is BH1-C, and the compound represented by the formula (2) is BH2-H.

BH1-C

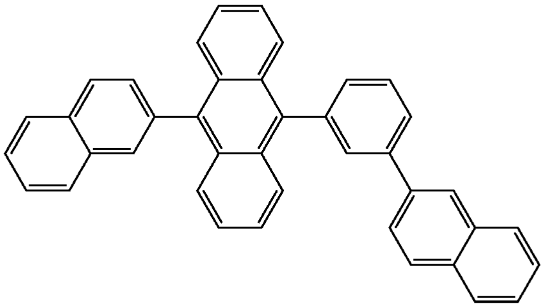

BH2-H

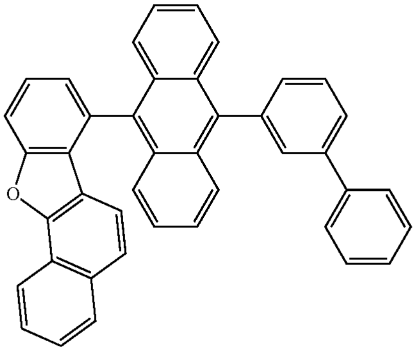

Combination 35

The compound represented by the formula (1) is BH1-C, and the compound represented by the formula (2) is BH2-I.

BH1-C

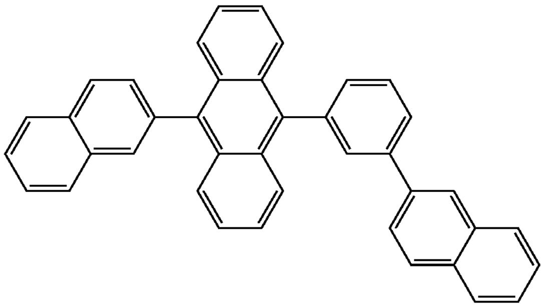

BH2-I

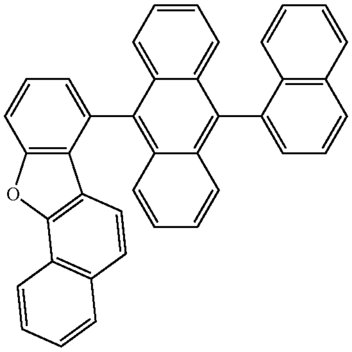

Combination 36

The compound represented by the formula (1) is BH1-C, and the compound represented by the formula (2) is BH2-J.

BH1-C

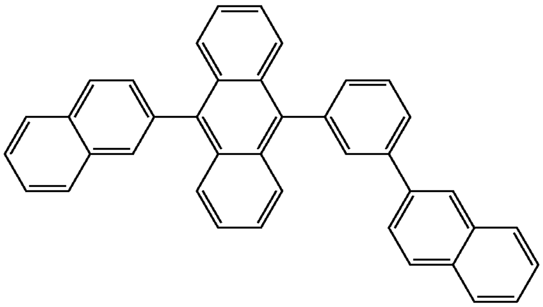

BH2-J

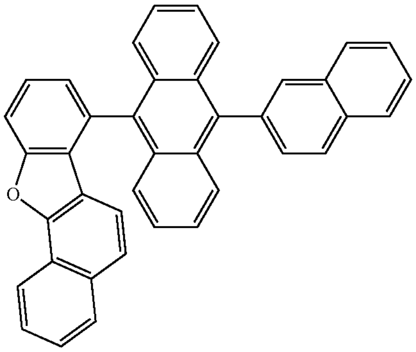

Combination 37

The compound represented by the formula (1) is BH1-C, and the compound represented by the formula (2) is BH2-K.

BH1-C

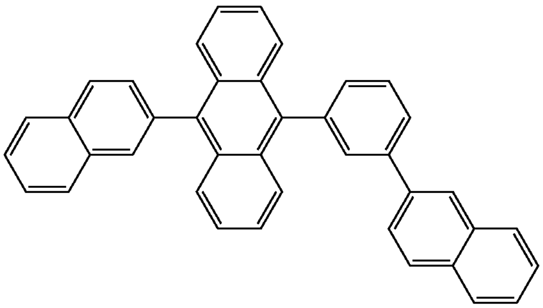

BH2-K

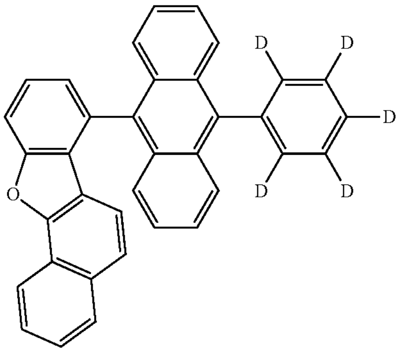

Combination 38

The compound represented by the formula (1) is BH1-C, and the compound represented by the formula (2) is BH2-L.

BH1-C

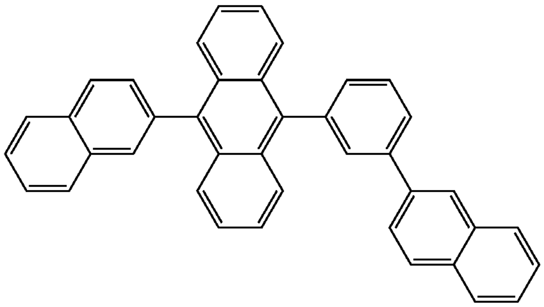

-continued

BH2-L

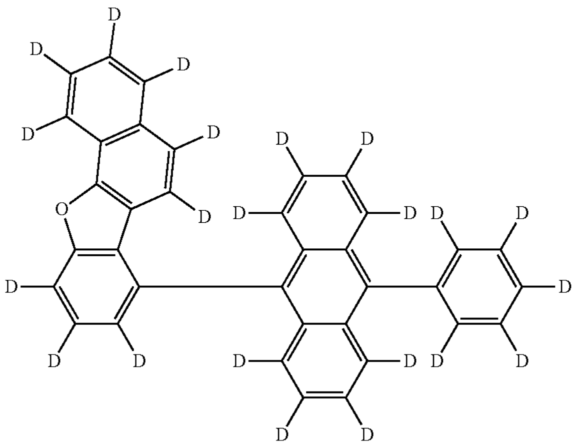

Combination 39

The compound represented by the formula (1) is BH1-C, and the compound represented by the formula (2) is BH2-M.

BH1-C

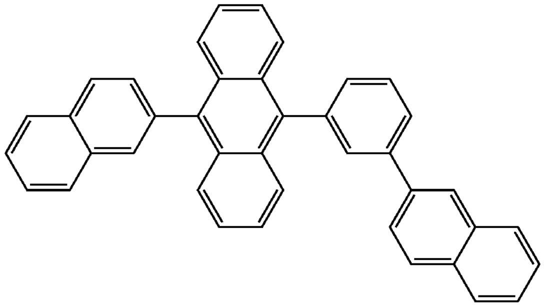

BH2-M

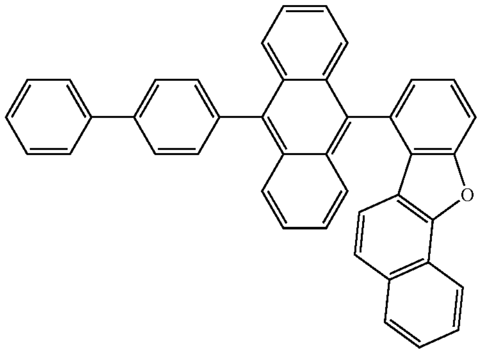

Combination 40

The compound represented by the formula (1) is BH1-D, and the compound represented by the formula (2) is BH2-A.

BH1-D

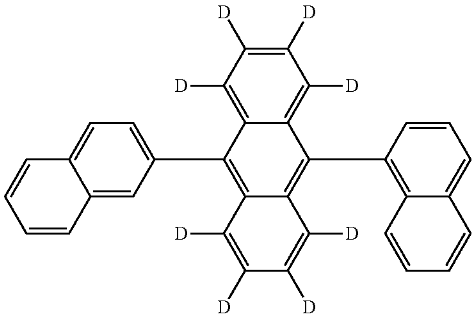

BH2-A

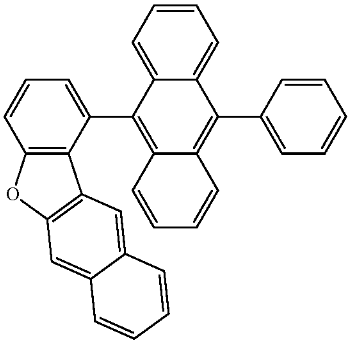

Combination 41

The compound represented by the formula (1) is BH1-D, and the compound represented by the formula (2) is BH2-B.

BH1-D

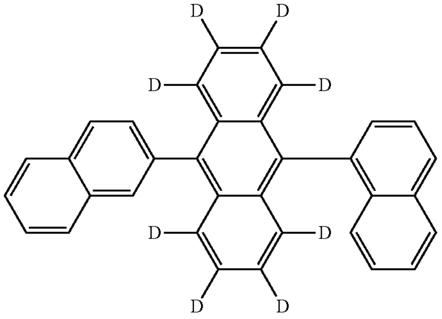

BH2-B

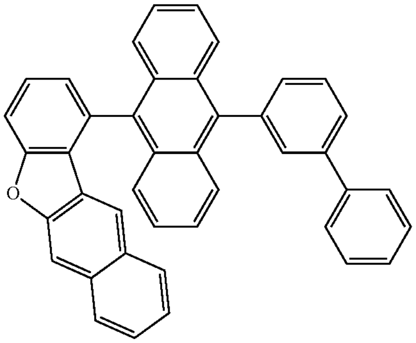

Combination 42

The compound represented by the formula (1) is BH1-D, and the compound represented by the formula (2) is BH2-C.

BH1-D

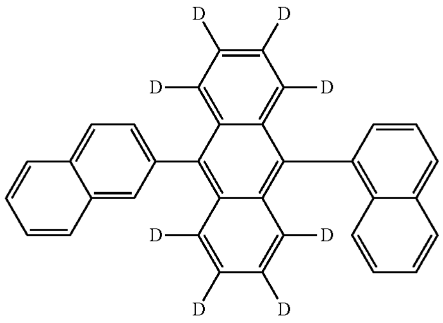

BH2-C

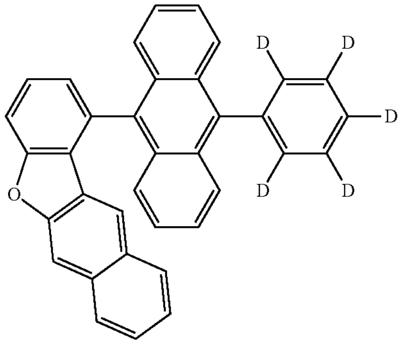

Combination 43

The compound represented by the formula (1) is BH1-D, and the compound represented by the formula (2) is BH2-D.

BH1-D

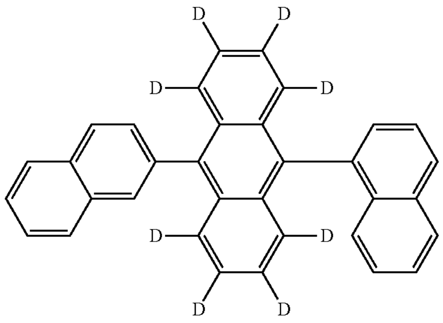

BH2-D

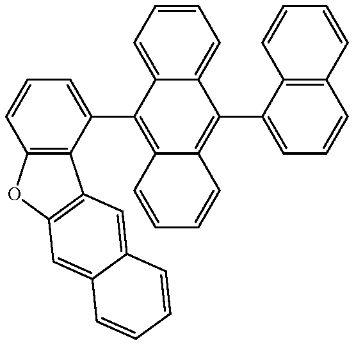

Combination 44

The compound represented by the formula (1) is BH1-D, and the compound represented by the formula (2) is BH2-E.

BH1-D

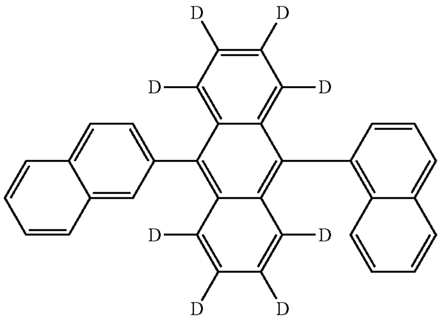

BH2-E

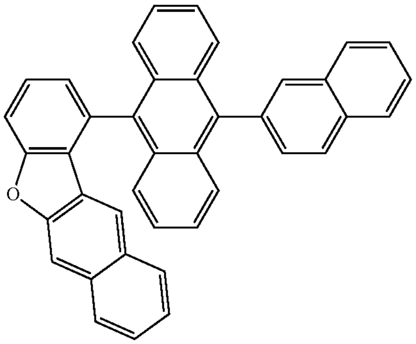

Combination 45

The compound represented by the formula (1) is BH1-D, and the compound represented by the formula (2) is BH2-F.

BH1-D

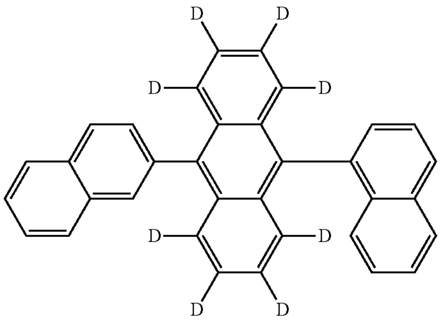

BH2-F

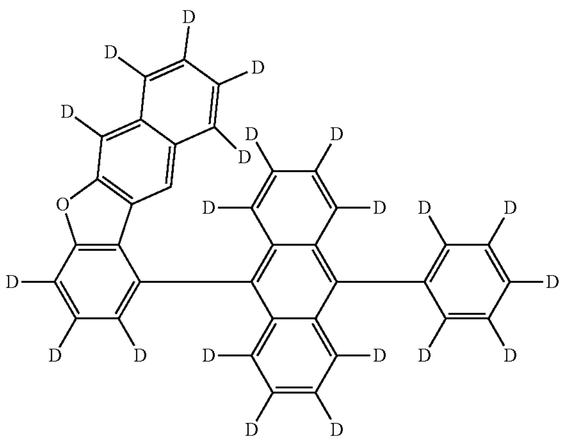

Combination 46

The compound represented by the formula (1) is BH1-D, and the compound represented by the formula (2) is BH2-G.

BH1-D

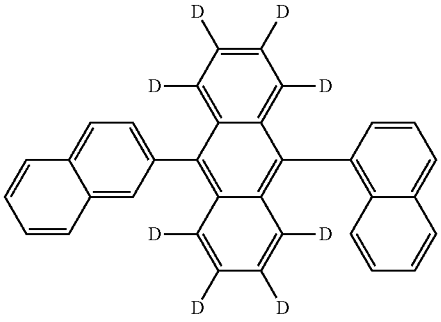

BH2-G

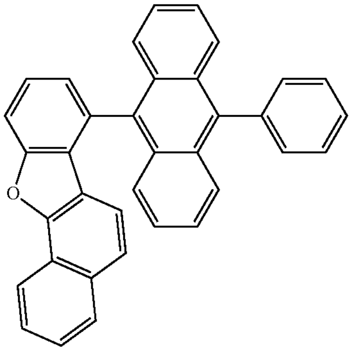

Combination 47

The compound represented by the formula (1) is BH1-D, and the compound represented by the formula (2) is BH2-H.

BH1-D

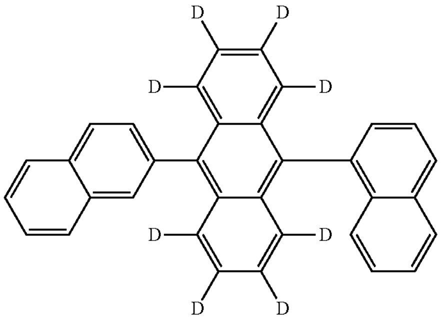

BH2-H

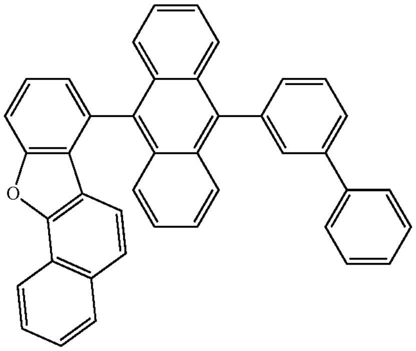

Combination 48

The compound represented by the formula (1) is BH1-D, and the compound represented by the formula (2) is BH2-1.

BH1-D

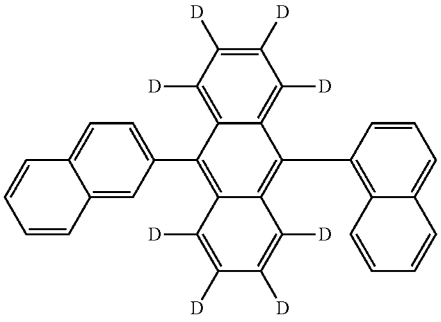

BH2-I

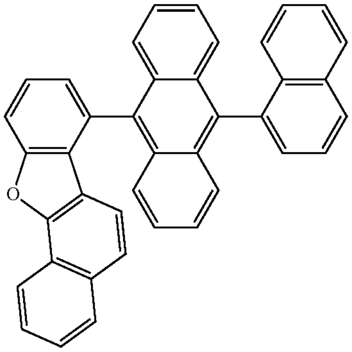

Combination 49

The compound represented by the formula (1) is BH1-D, and the compound represented by the formula (2) is BH2-J.

BH1-D

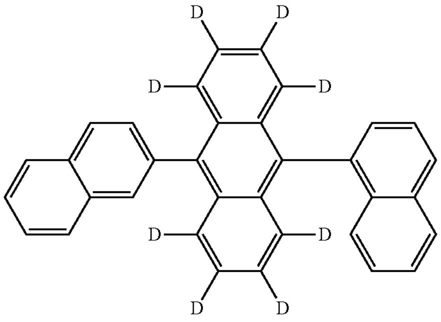

BH2-J

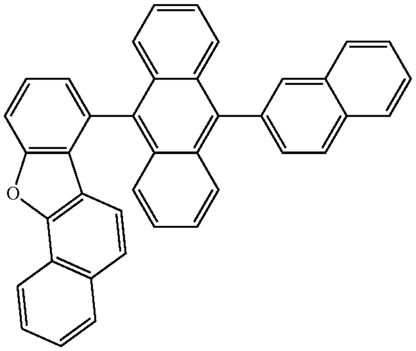

Combination 50

The compound represented by the formula (1) is BH1-D, and the compound represented by the formula (2) is BH2-K.

BH1-D

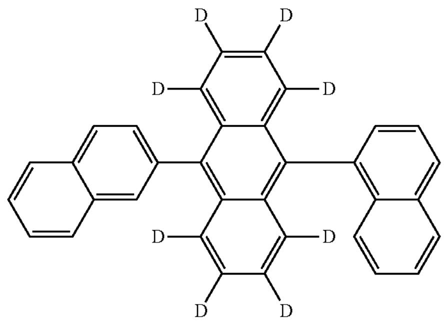

BH2-K

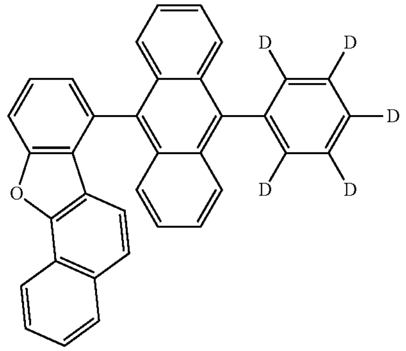

Combination 51

The compound represented by the formula (1) is BH1-D, and the compound represented by the formula (2) is BH2-L.

BH1-D

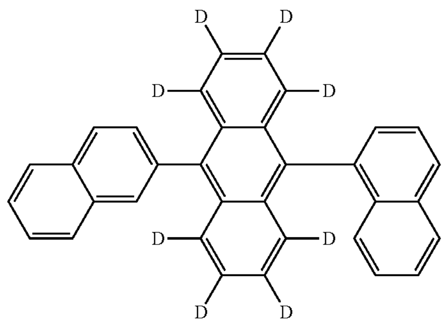

-continued

BH2-L

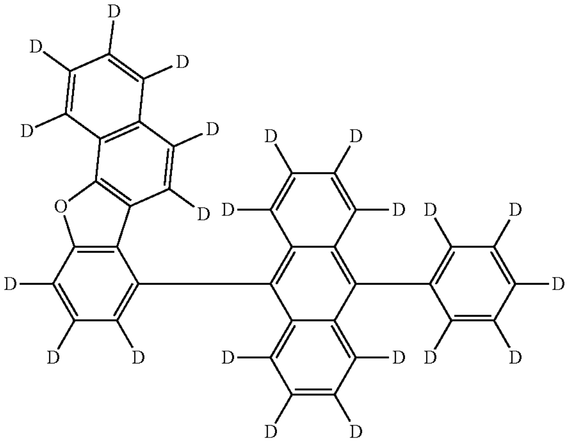

Combination 52

The compound represented by the formula (1) is BH1-D, and the compound represented by the formula (2) is BH2-M.

BH1-D

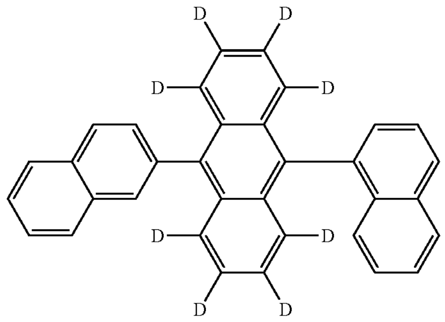

BH2-M

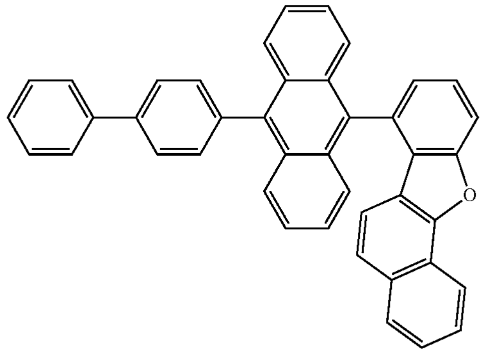

Combination 53

The compound represented by the formula (1) is BH1-E, and the compound represented by the formula (2) is BH2-A.

BH1-E

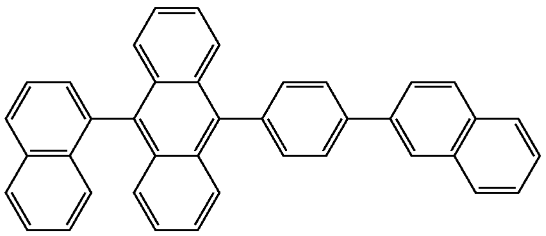

BH2-A

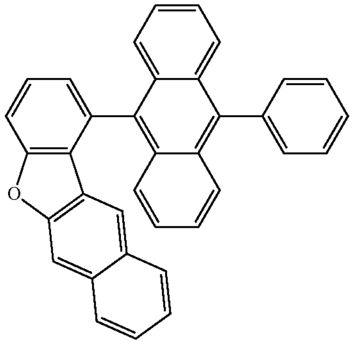

Combination 54

The compound represented by the formula (1) is BH1-E, and the compound represented by the formula (2) is BH2-B.

BH1-E

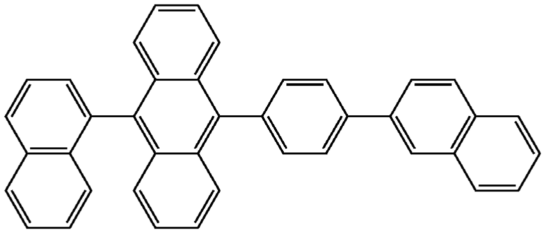

BH2-B

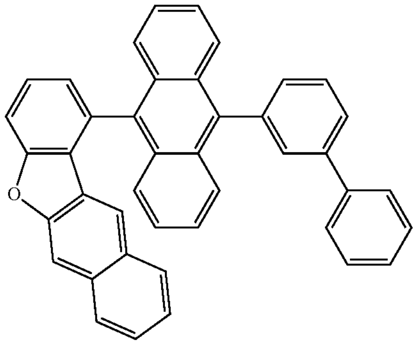

Combination 55

The compound represented by the formula (1) is BH1-E, and the compound represented by the formula (2) is BH2-C.

BH1-E

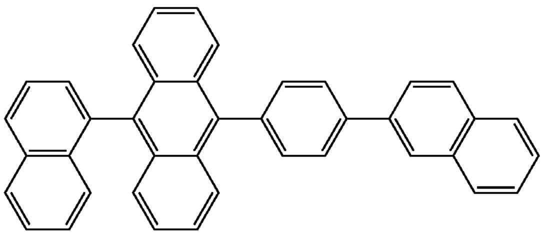

BH2-C

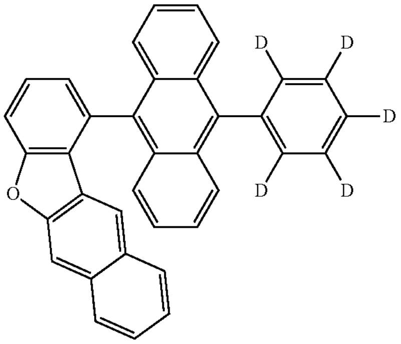

Combination 56

The compound represented by the formula (1) is BH1-E, and the compound represented by the formula (2) is BH2-D.

BH1-E

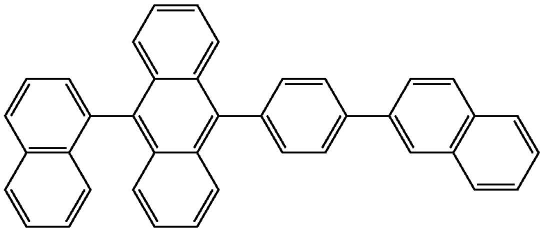

BH2-D

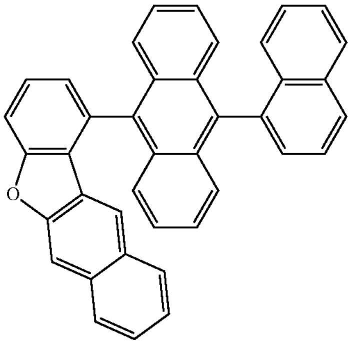

Combination 57

The compound represented by the formula (1) is BH1-E, and the compound represented by the formula (2) is BH2-E.

BH1-E

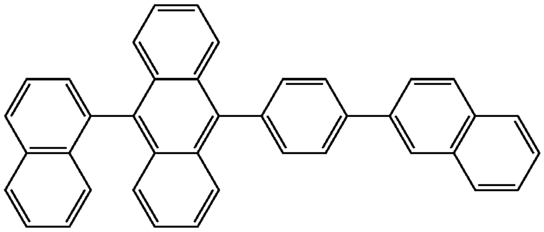

BH2-E

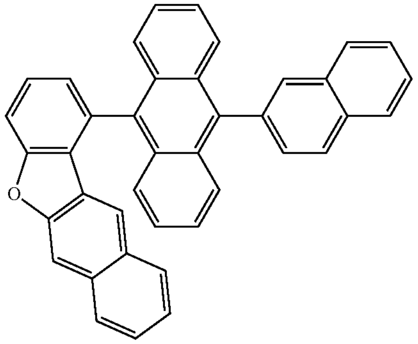

Combination 58

The compound represented by the formula (1) is BH1-E, and the compound represented by the formula (2) is BH2-F.

BH1-E

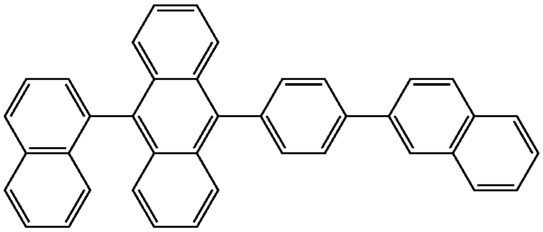

BH2-F

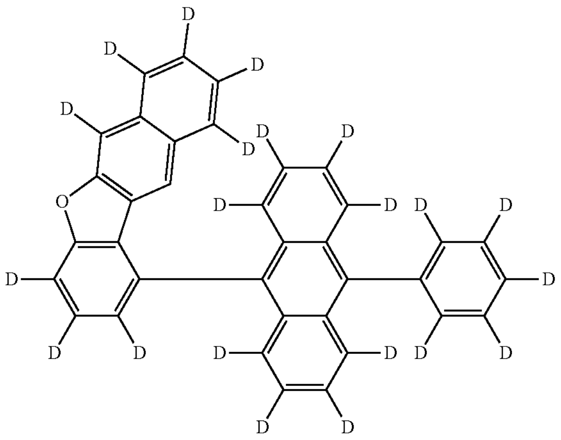

Combination 59

The compound represented by the formula (1) is BH1-E, and the compound represented by the formula (2) is BH2-G.

BH1-E

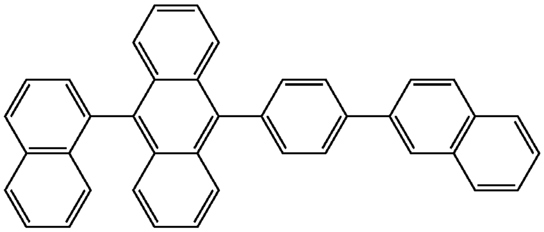

BH2-G

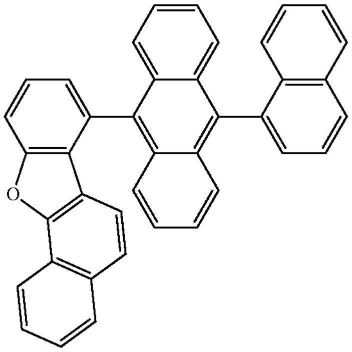

Combination 60

The compound represented by the formula (1) is BH1-E, and the compound represented by the formula (2) is BH2-H.

BH1-E

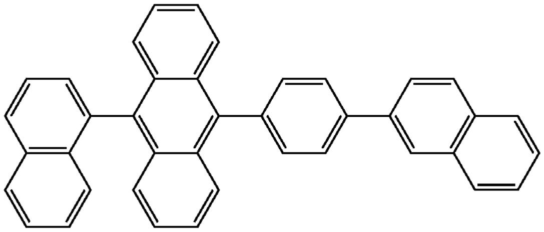

BH2-H

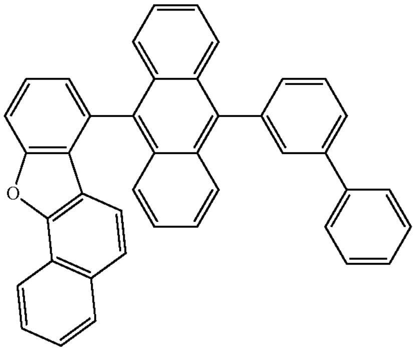

Combination 61

The compound represented by the formula (1) is BH1-E, and the compound represented by the formula (2) is BH2-1.

BH1-E

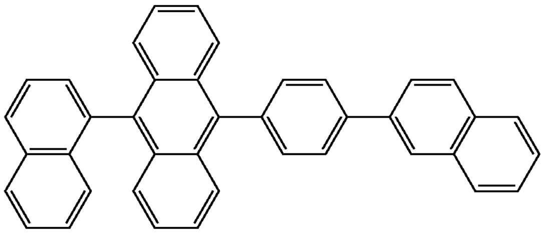

BH2-I

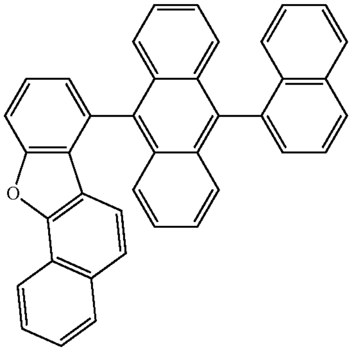

Combination 62

The compound represented by the formula (1) is BH1-E, and the compound represented by the formula (2) is BH2-J.

BH1-E

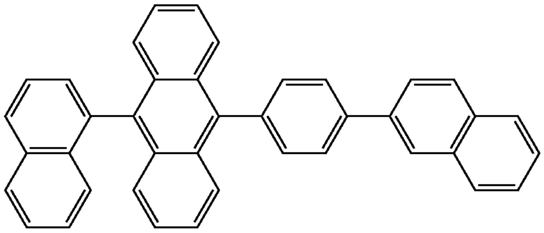

BH2-J

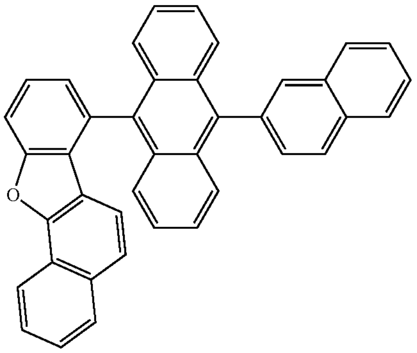

Combination 63

The compound represented by the formula (1) is BH1-E, and the compound represented by the formula (2) is BH2-K.

BH1-E

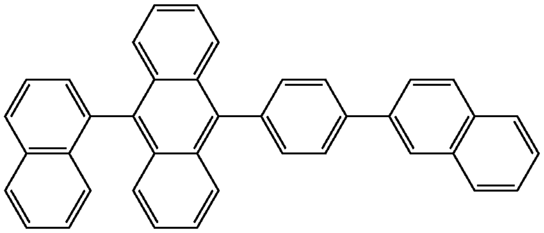

BH2-K

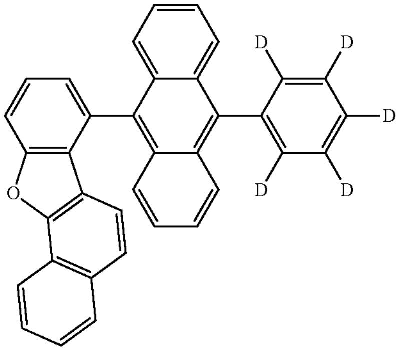

Combination 64

The compound represented by the formula (1) is BH1-E, and the compound represented by the formula (2) is BH2-L.

BH1-E

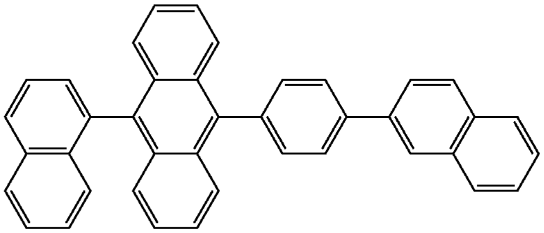

BH2-L

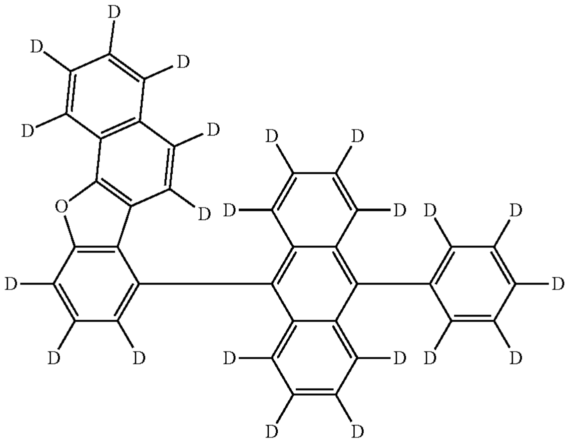

Combination 65

The compound represented by the formula (1) is BH1-E, and the compound represented by the formula (2) is BH2-M.

BH1-E

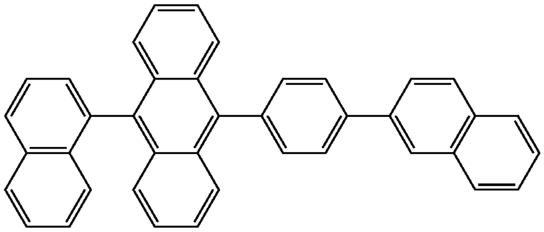

BH2-M

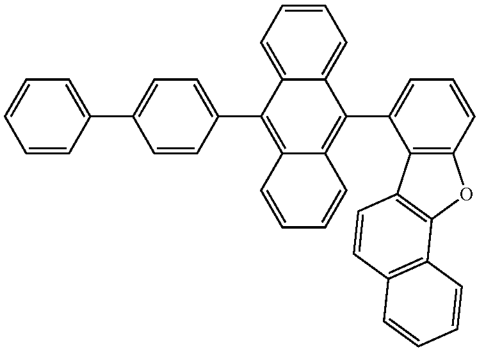

Combination 66

The compound represented by the formula (1) is BH1-F, and the compound represented by the formula (2) is BH2-A.

BH1-F

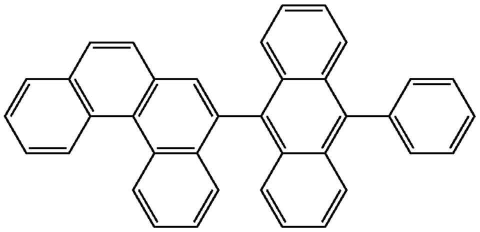

BH2-A

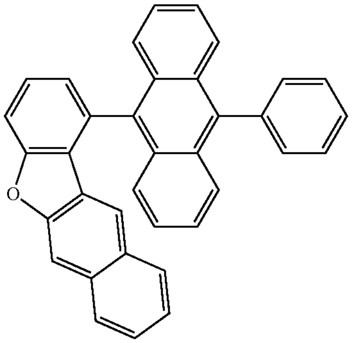

Combination 67

The compound represented by the formula (1) is BH1-F, and the compound represented by the formula (2) is BH2-B.

BH1-F

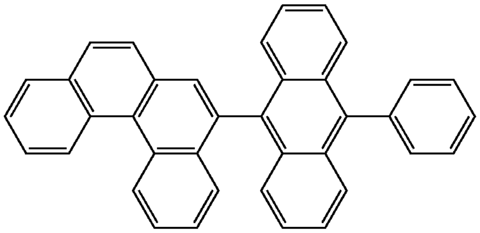

BH2-B

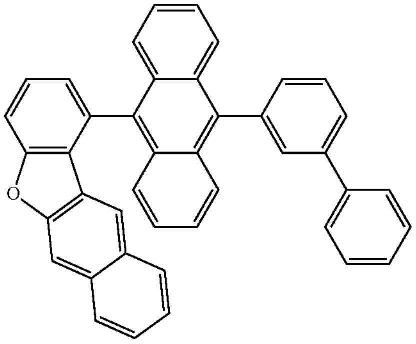

Combination 68

The compound represented by the formula (1) is BH1-F, and the compound represented by the formula (2) is BH2-C.

BH1-F

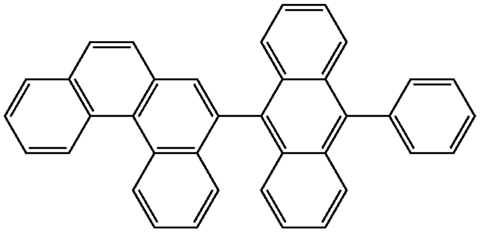

BH2-C

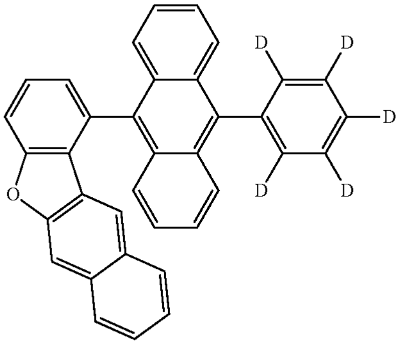

Combination 69

The compound represented by the formula (1) is BH1-F, and the compound represented by the formula (2) is BH2-D.

BH1-F

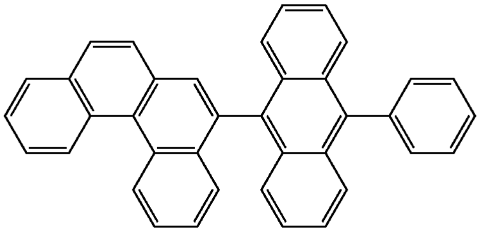

BH2-D

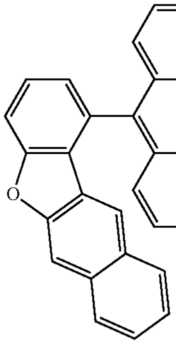

Combination 70

The compound represented by the formula (1) is BH1-F, and the compound represented by the formula (2) is BH2-E.

BH1-F

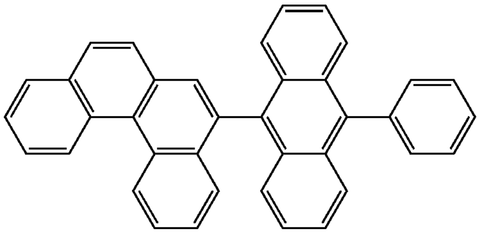

BH2-E

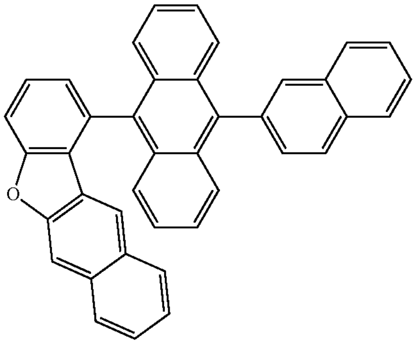

Combination 71

The compound represented by the formula (1) is BH1-F, and the compound represented by the formula (2) is BH2-F.

BH1-F

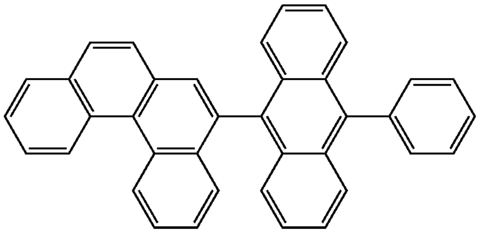

BH2-F

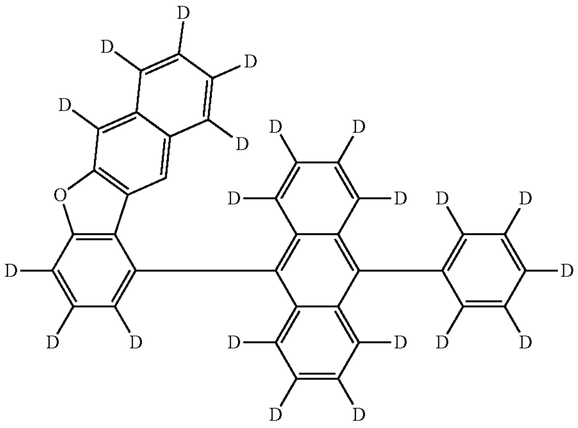

Combination 72

The compound represented by the formula (1) is BH1-F, and the compound represented by the formula (2) is BH2-G.

BH1-F

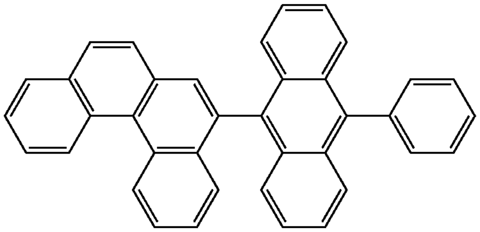

BH2-G

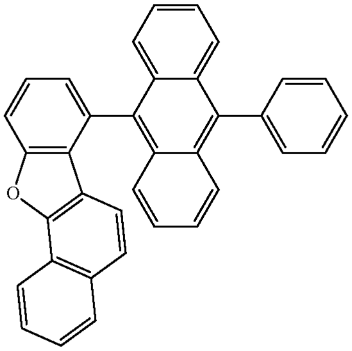

Combination 73

The compound represented by the formula (1) is BH1-F, and the compound represented by the formula (2) is BH2-H.

BH1-F

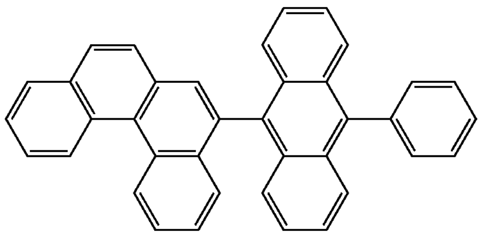

BH2-H

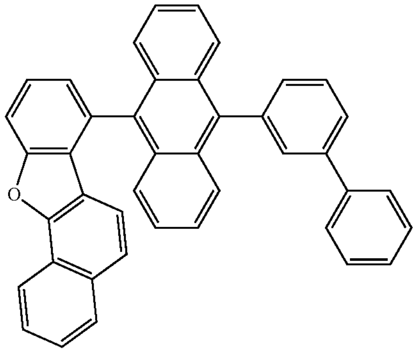

Combination 74

The compound represented by the formula (1) is BH1-F, and the compound represented by the formula (2) is BH2-1.

BH1-F

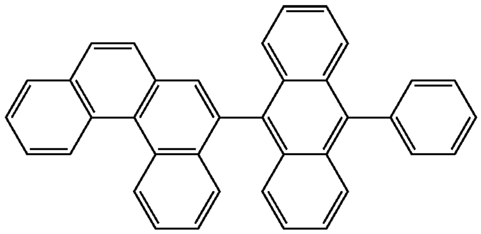

BH2-I

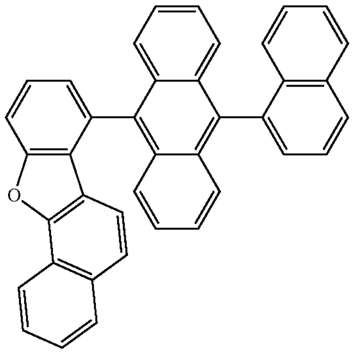

Combination 75

The compound represented by the formula (1) is BH1-F, and the compound represented by the formula (2) is BH2-J.

BH1-F

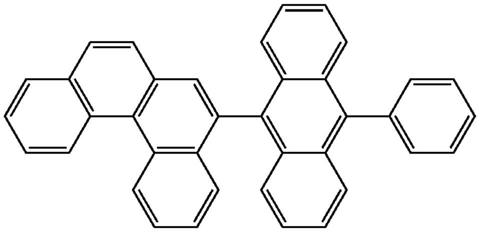

BH2-J

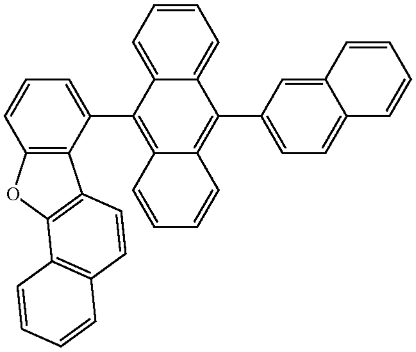

Combination 76

The compound represented by the formula (1) is BH1-F, and the compound represented by the formula (2) is BH2-K.

BH1-F

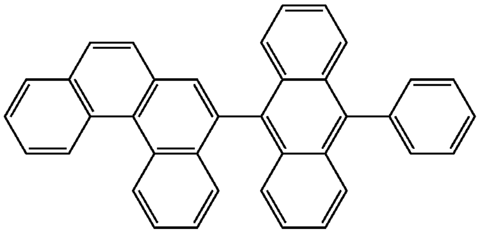

BH2-K

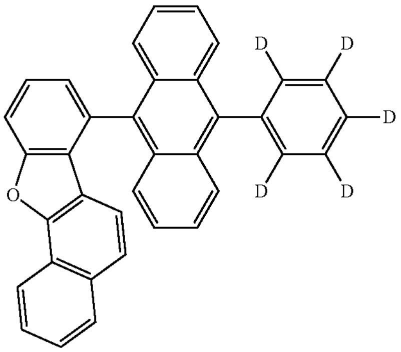

Combination 77

The compound represented by the formula (1) is BH1-F, and the compound represented by the formula (2) is BH2-L.

BH1-F

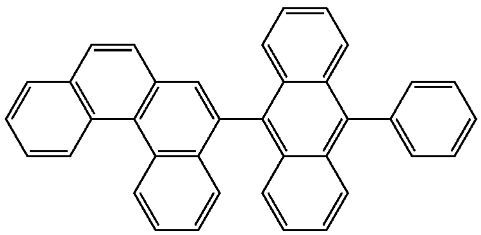

BH2-L

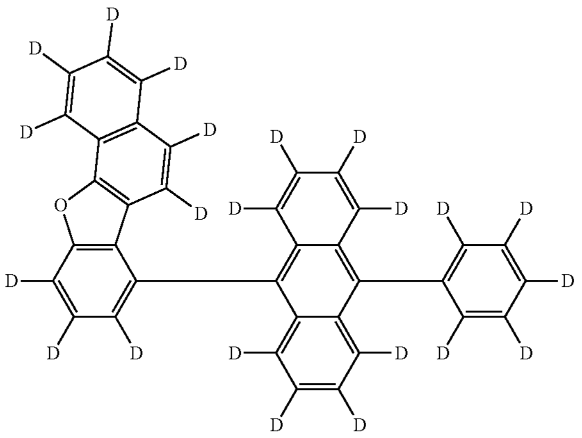

Combination 78

The compound represented by the formula (1) is BH1-F, and the compound represented by the formula (2) is BH2-M.

BH1-F

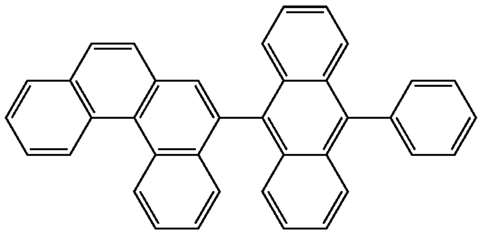

BH2-M

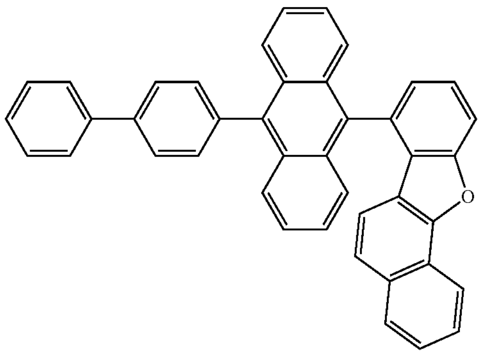

Combination 79

The compound represented by the formula (1) is BH1-G, and the compound represented by the formula (2) is BH2-A.

BH1-G

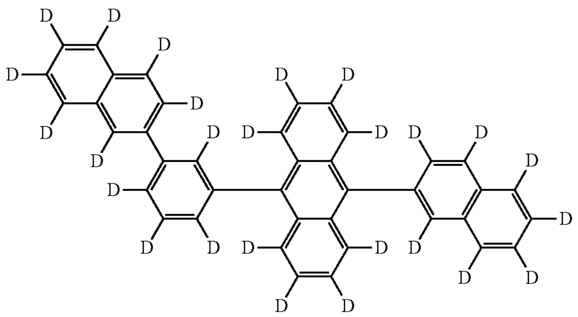

BH2-A

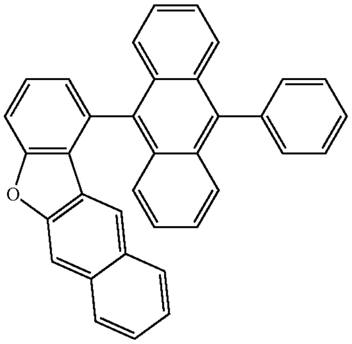

Combination 80

The compound represented by the formula (1) is BH1-G, and the compound represented by the formula (2) is BH2-B.

BH1-G

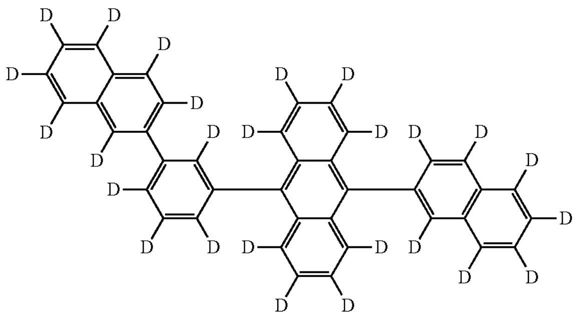

BH2-B

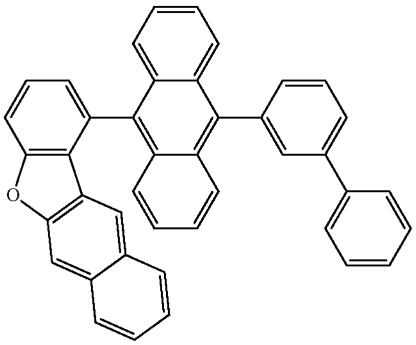

Combination 81

The compound represented by the formula (1) is BH1-G, and the compound represented by the formula (2) is BH2-C.

BH1-G

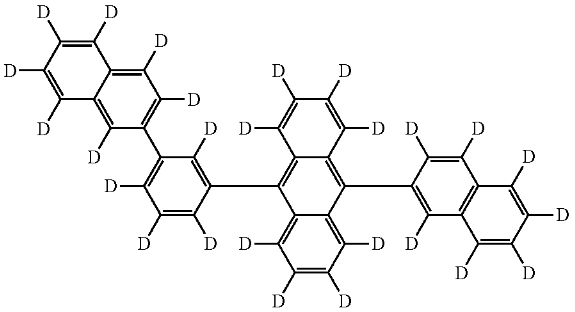

BH2-C

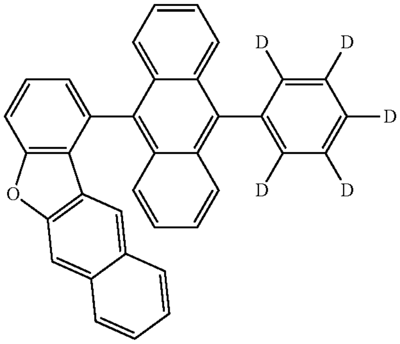

Combination 81

The compound represented by the formula (1) is BH1-G, and the compound represented by the formula (2) is BH2-D.

BH1-G

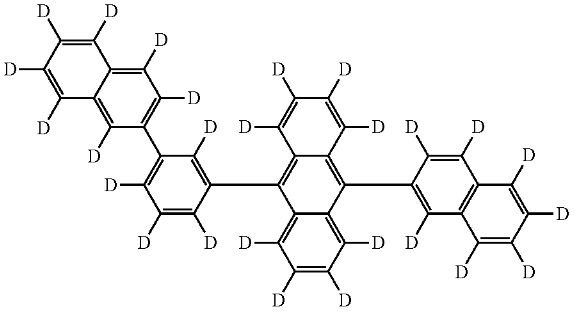

BH2-D

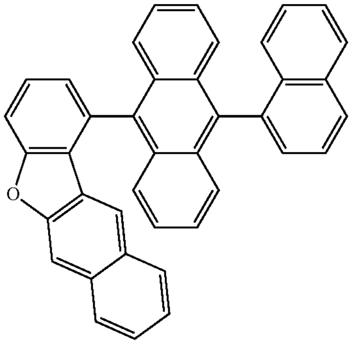

Combination 83

The compound represented by the formula (1) is BH1-G, and the compound represented by the formula (2) is BH2-E.

BH1-G

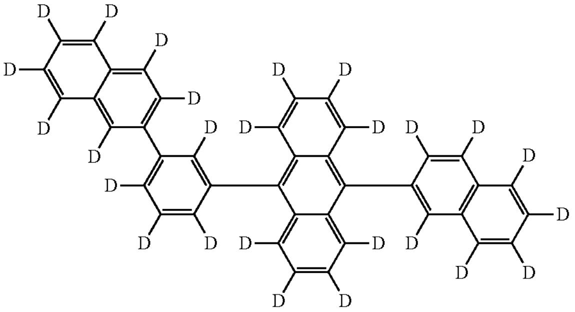

BH2-E

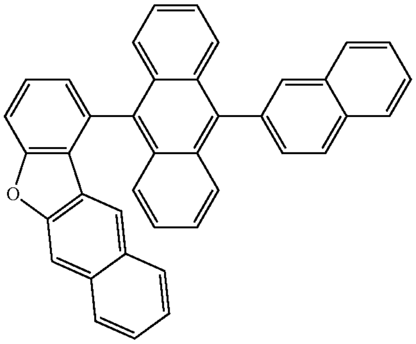

Combination 84

The compound represented by the formula (1) is BH1-G, and the compound represented by the formula (2) is BH2-F.

BH1-G

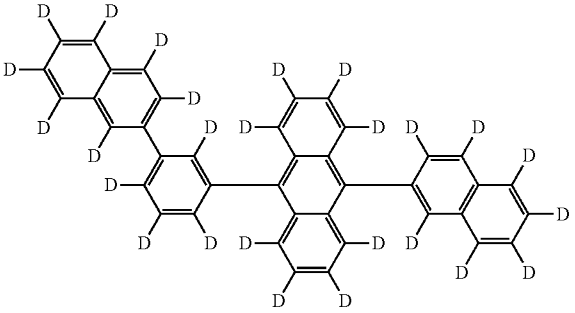

BH2-F

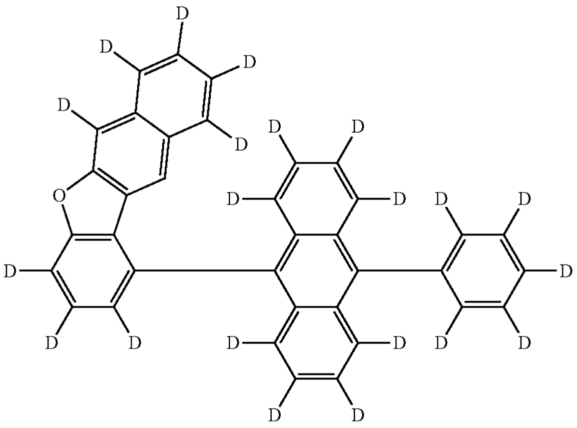

Combination 85

The compound represented by the formula (1) is BH1-G, and the compound represented by the formula (2) is BH2-G.

BH1-G

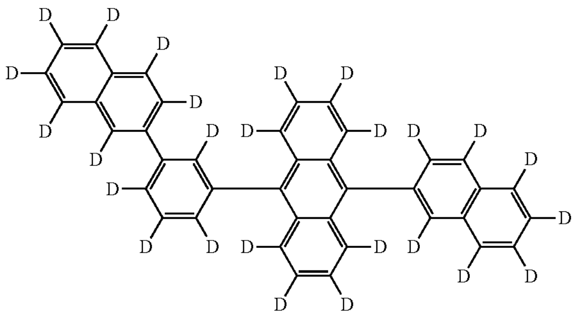

BH2-G

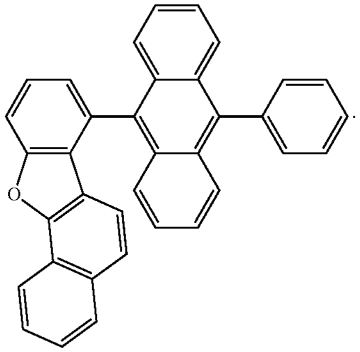

Combination 86

The compound represented by the formula (1) is BH1-G, and the compound represented by the formula (2) is BH2-H.

BH1-G

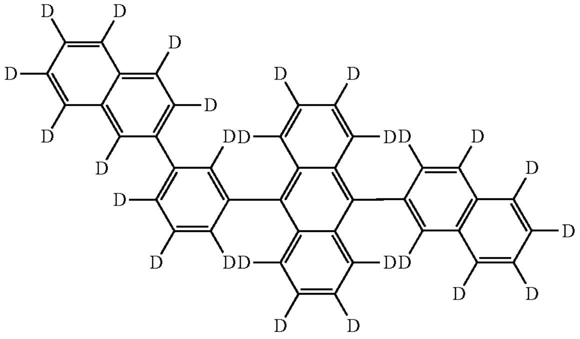

-continued

BH2-H

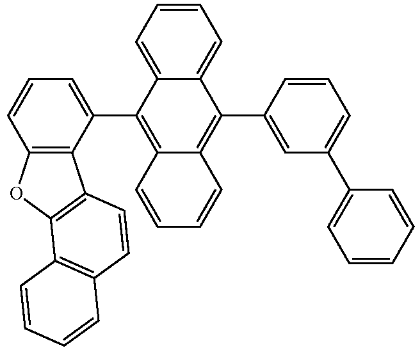

Combination 87

The compound represented by the formula (1) is BH1-G, and the compound represented by the formula (2) is BH2-1.

BH1-G

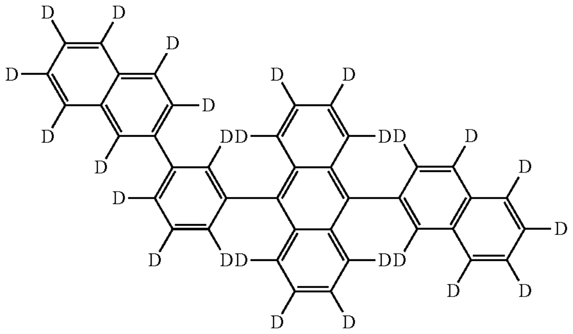

BH2-I

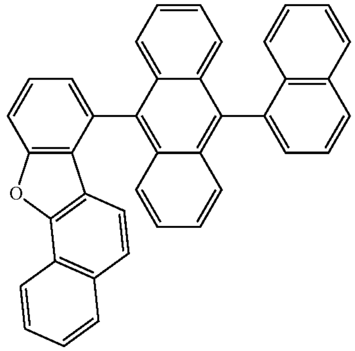

Combination 88

The compound represented by the formula (1) is BH1-G, and the compound represented by the formula (2) is BH2-J.

BH1-G
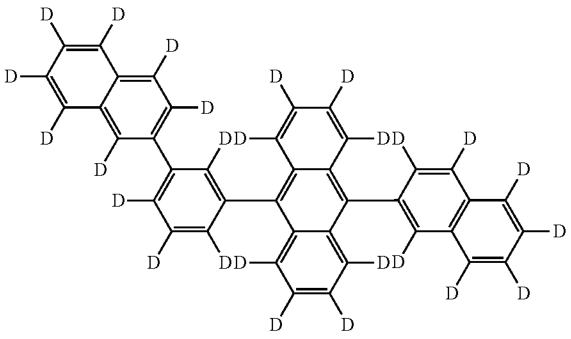
BH2-J
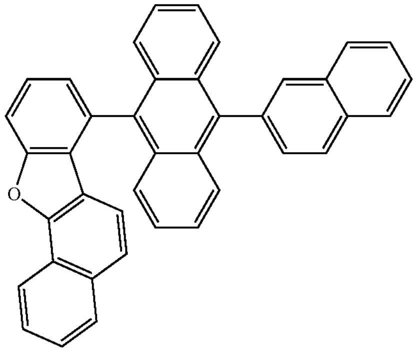
Combination 89
The compound represented by the formula (1) is BH1-G, and the compound represented by the formula (2) is BH2-K.
BH1-G
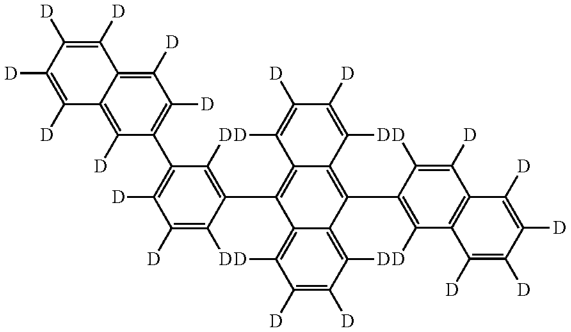
BH2-K
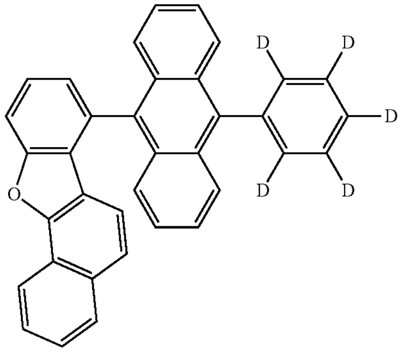
Combination 90
The compound represented by the formula (1) is BH1-G, and the compound represented by the formula (2) is BH2-L.
BH1-G
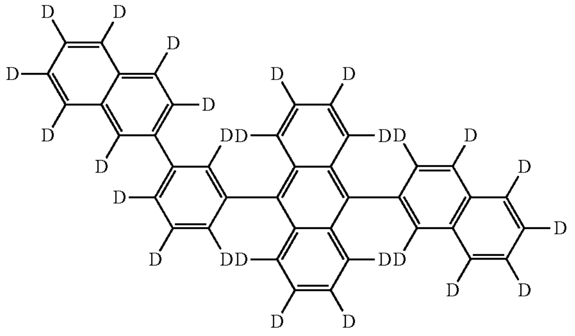
BH2-L
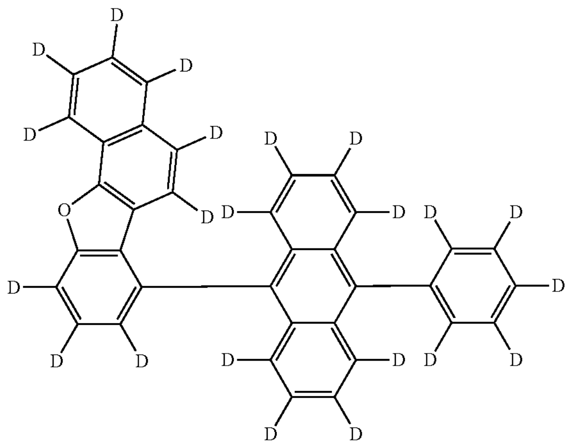
Combination 91
The compound represented by the formula (1) is BH1-G, and the compound represented by the formula (2) is BH2-M.
BH1-G
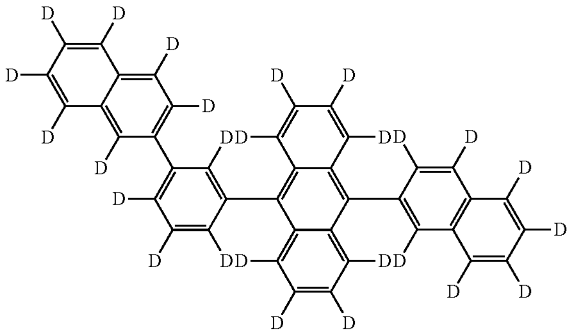

-continued

BH2-M

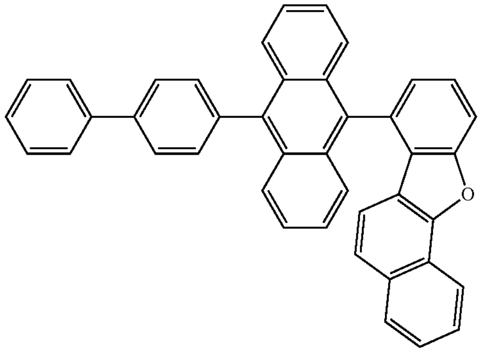

Combination 92

The compound represented by the formula (1) is BH1-H, and the compound represented by the formula (2) is BH2-A.

BH1-H

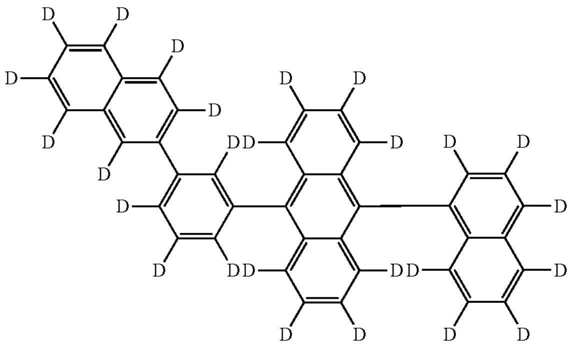

BH2-A

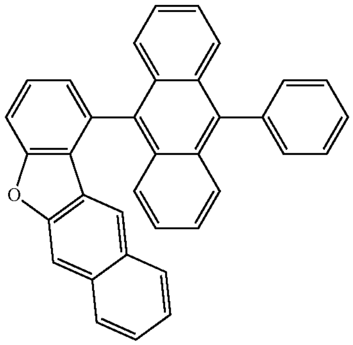

Combination 93

The compound represented by the formula (1) is BH1-H, and the compound represented by the formula (2) is BH2-B.

BH1-H

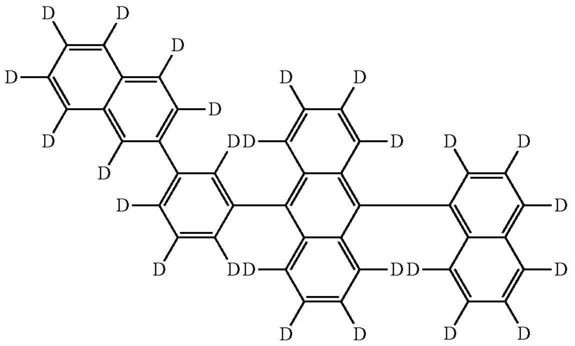

BH2-B

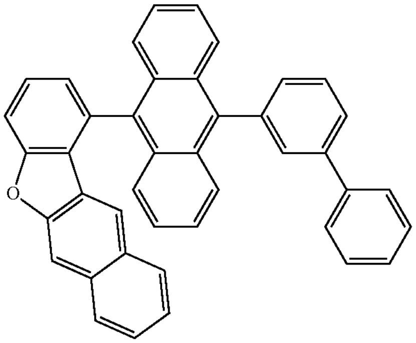

Combination 94

The compound represented by the formula (1) is BH1-H, and the compound represented by the formula (2) is BH2-C.

BH1-H

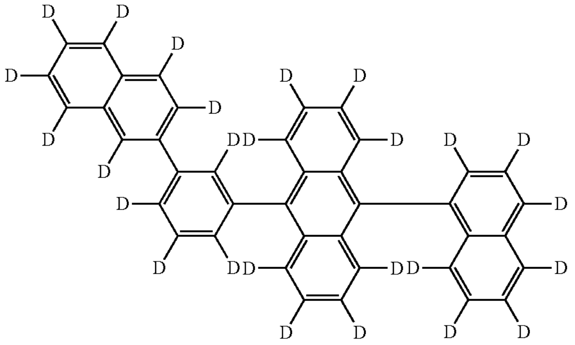

BH2-C

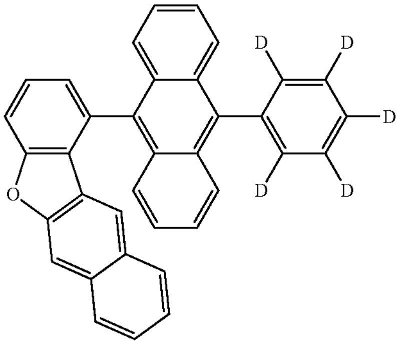

Combination 95

The compound represented by the formula (1) is BH1-H, and the compound represented by the formula (2) is BH2-D.

BH1-H

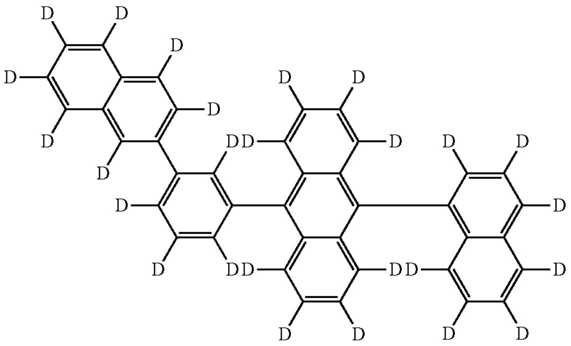

BH2-D

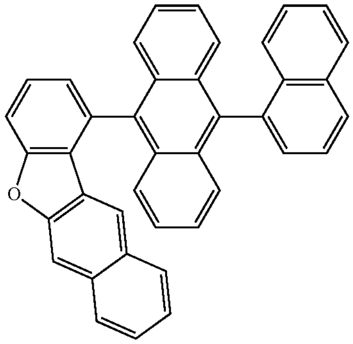

Combination 96

The compound represented by the formula (1) is BH1-H, and the compound represented by the formula (2) is BH2-E.

BH1-H

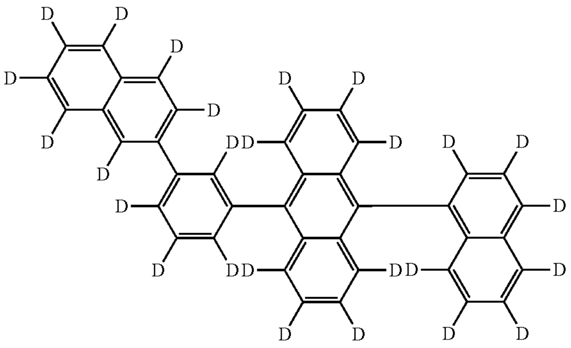

-continued

BH2-E

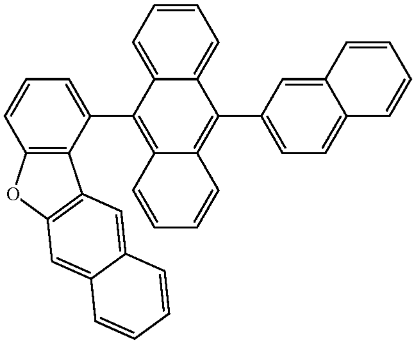

Combination 97

The compound represented by the formula (1) is BH1-H, and the compound represented by the formula (2) is BH2-F.

BH1-H

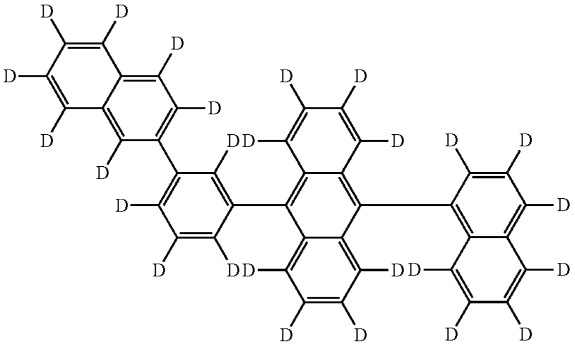

BH2-F

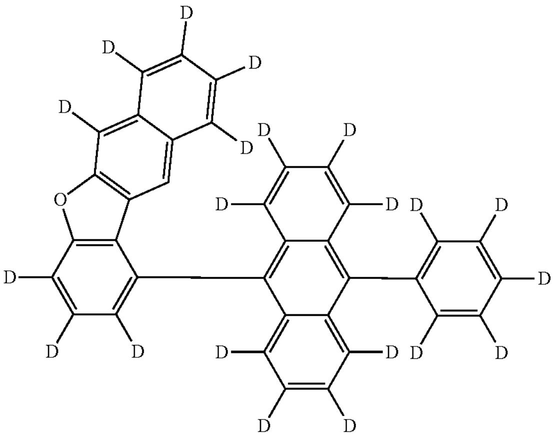

Combination 98

The compound represented by the formula (1) is BH1-H, and the compound represented by the formula (2) is BH2-G.

BH1-H
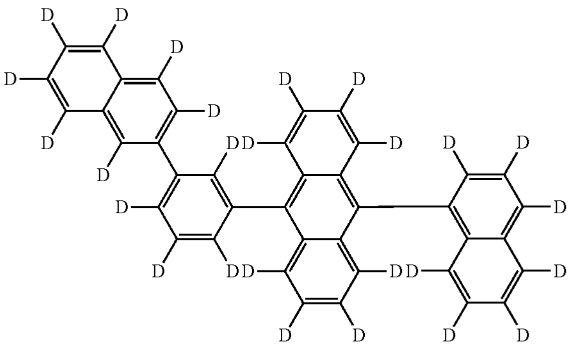
BH2-G
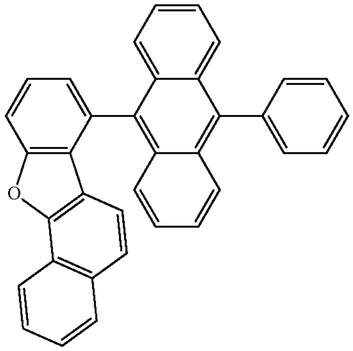
Combination 99
The compound represented by the formula (1) is BH1-H, and the compound represented by the formula (2) is BH2-H.
BH1-H
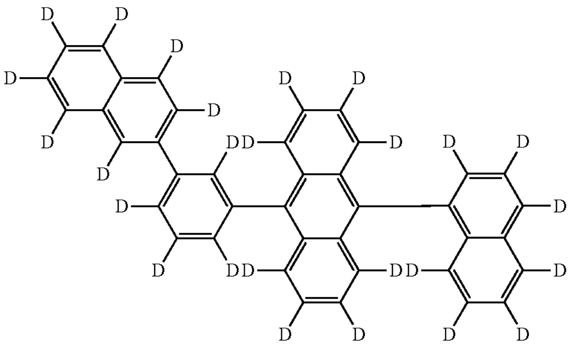
BH2-H
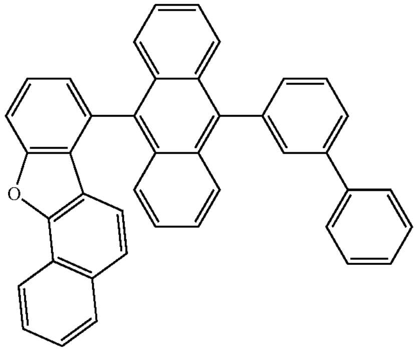
Combination 100
The compound represented by the formula (1) is BH1-H, and the compound represented by the formula (2) is BH2-1.
BH1-H
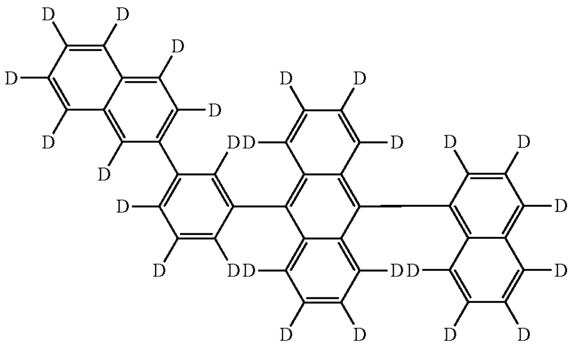
BH2-I
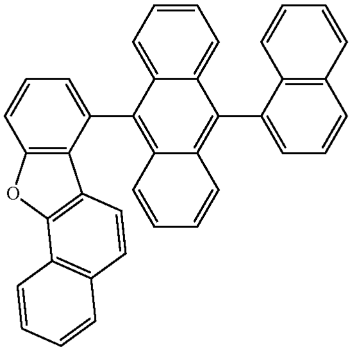
Combination 101
The compound represented by the formula (1) is BH1-H, and the compound represented by the formula (2) is BH2-J.
BH1-H
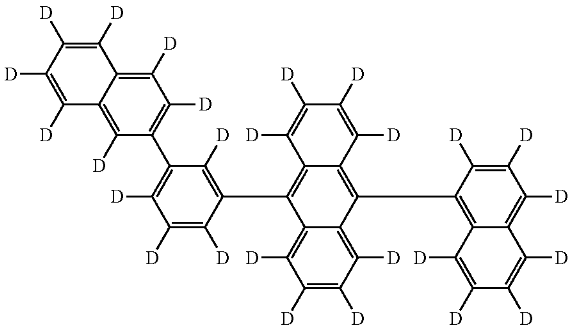

-continued

BH2-J

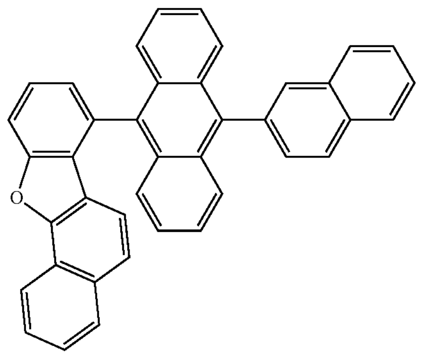

BH1-H

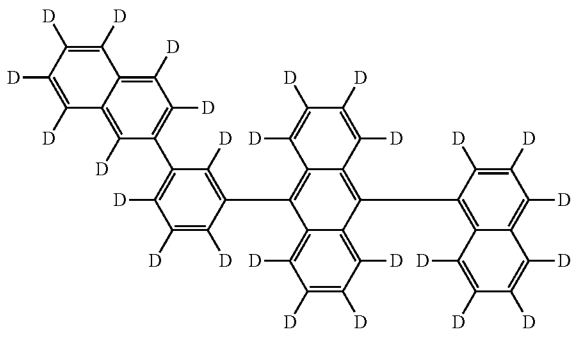

Combination 102

The compound represented by the formula (1) is BH1-H, and the compound represented by the formula (2) is BH2-K.

BH1-H

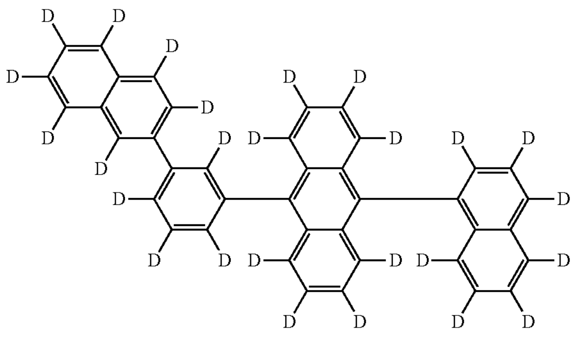

BH2-K

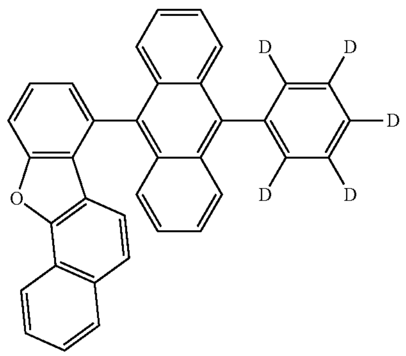

Combination 103

The compound represented by the formula (1) is BH1-H, and the compound represented by the formula (2) is BH2-L.

BH2-L

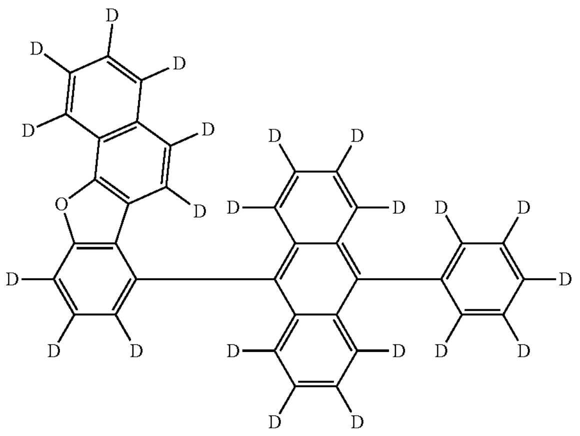

Combination 104

The compound represented by the formula (1) is BH1-H, and the compound represented by the formula (2) is BH2-M.

BH1-H

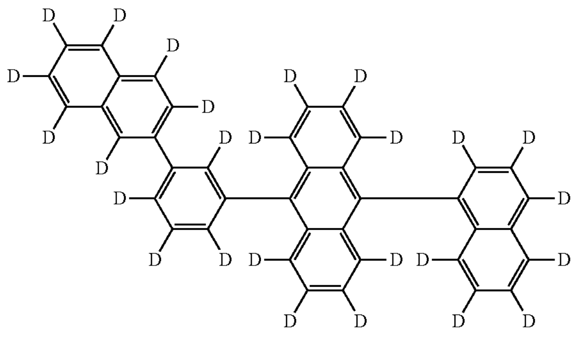

-continued

BH2-M

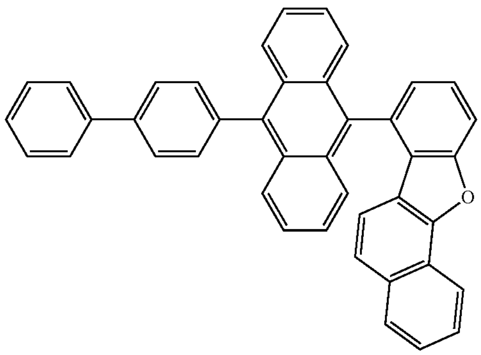

Combination 105

The compound represented by the formula (1) is BH1-I, and the compound represented by the formula (2) is BH2-A.

BH1-I

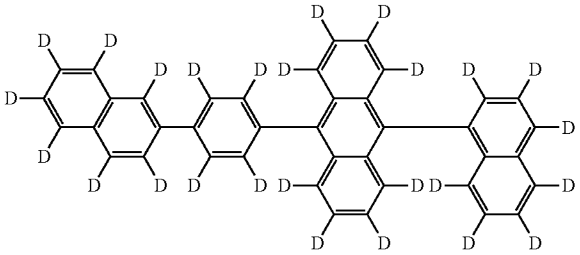

BH2-A

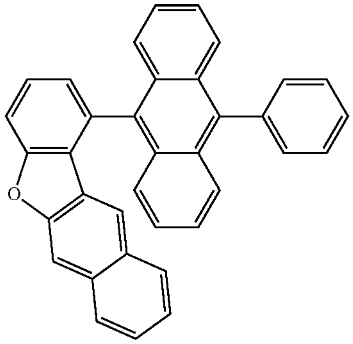

Combination 106

The compound represented by the formula (1) is BH1-I, and the compound represented by the formula (2) is BH2-B.

BH1-I

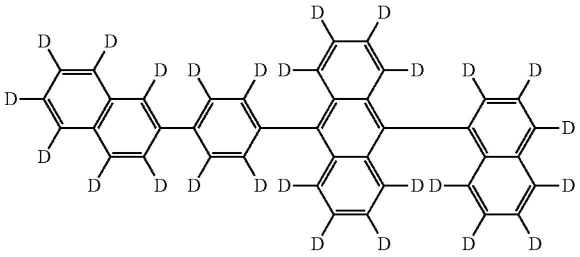

-continued

BH2-B

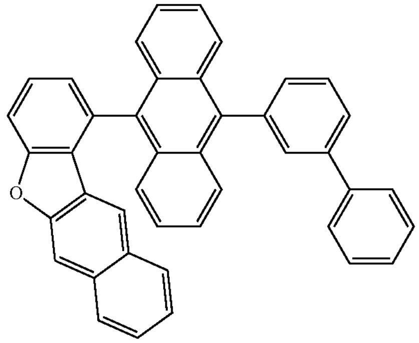

Combination 107

The compound represented by the formula (1) is BH1-I, and the compound represented by the formula (2) is BH2-C.

BH1-I

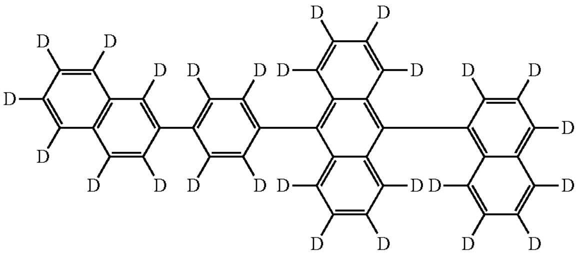

BH2-C

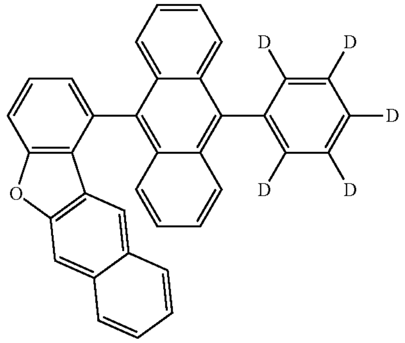

Combination 108

The compound represented by the formula (1) is BH1-I, and the compound represented by the formula (2) is BH2-D.

BH1-I

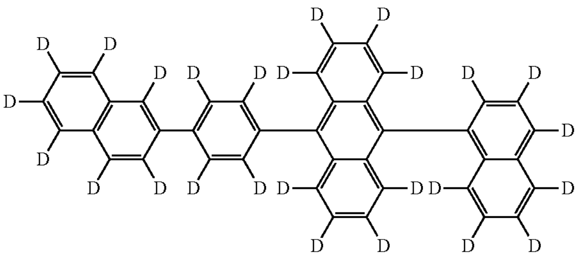

-continued

BH2-D

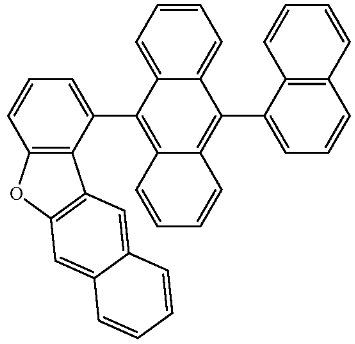

Combination 109

The compound represented by the formula (1) is BH1-I, and the compound represented by the formula (2) is BH2-E.

BH1-I

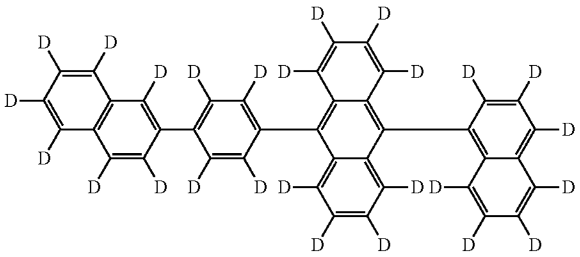

BH2-E

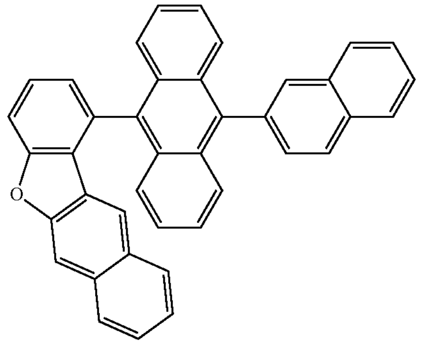

Combination 110

The compound represented by the formula (1) is BH1-I, and the compound represented by the formula (2) is BH2-F.

BH1-I

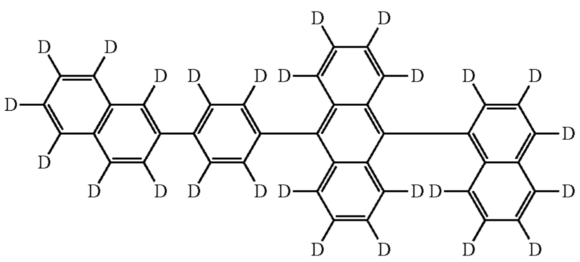

-continued

BH2-F

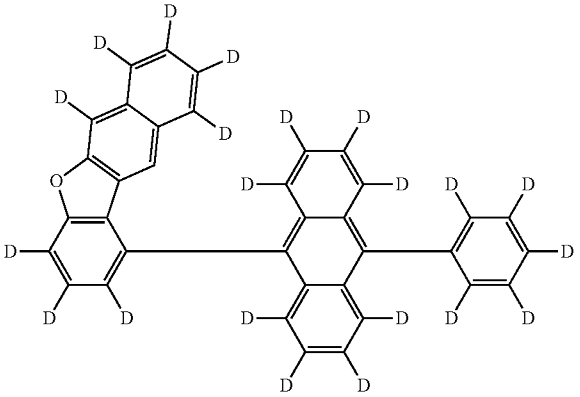

Combination 111

The compound represented by the formula (1) is BH1-I, and the compound represented by the formula (2) is BH2-G.

BH1-I

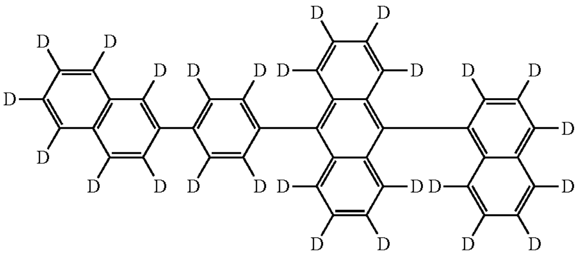

BH2-G

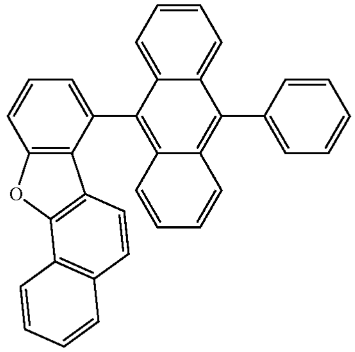

Combination 112

The compound represented by the formula (1) is BH1-I, and the compound represented by the formula (2) is BH2-H.

BH1-I

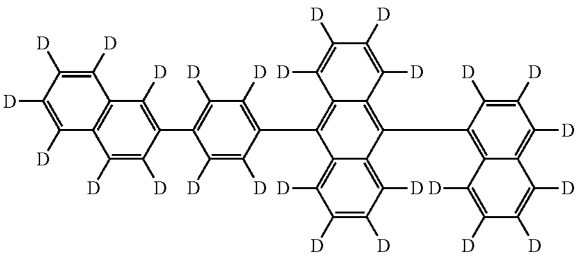

-continued

BH2-H

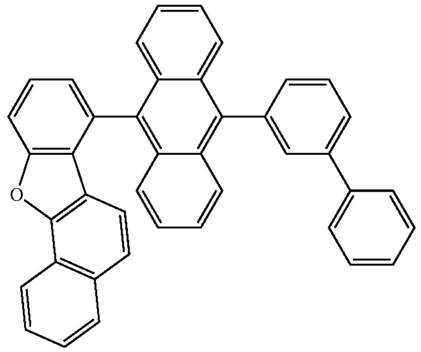

Combination 113

The compound represented by the formula (1) is BH1-I, and the compound represented by the formula (2) is BH2-1.

BH1-I

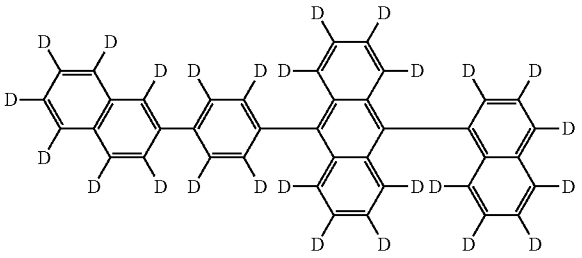

BH2-I

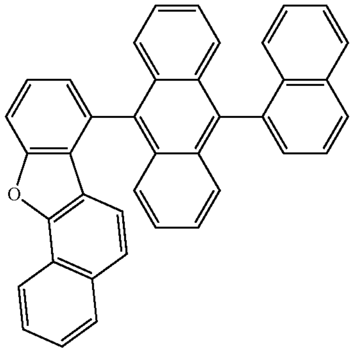

Combination 114

The compound represented by the formula (1) is BH1-I, and the compound represented by the formula (2) is BH2-J.

BH1-I

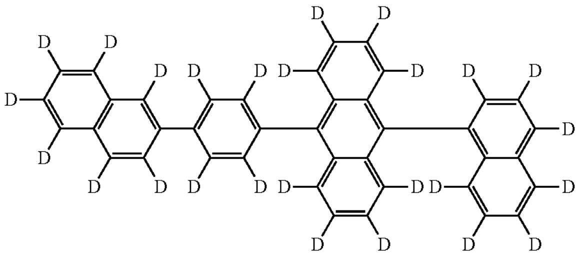

-continued

BH2-J

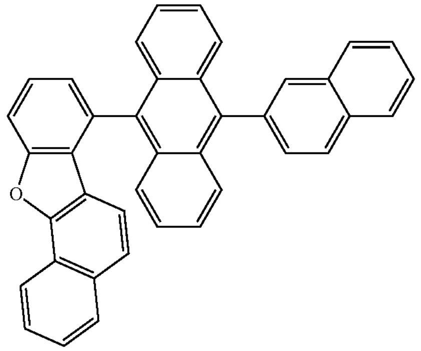

Combination 115

The compound represented by the formula (1) is BH1-I, and the compound represented by the formula (2) is BH2-K.

BH1-I

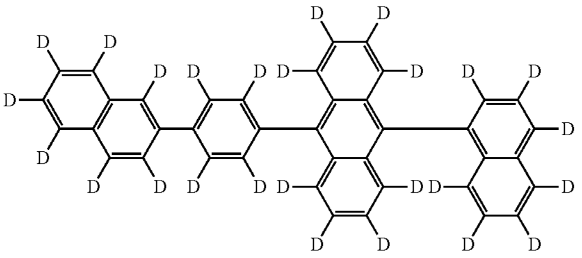

BH2-K

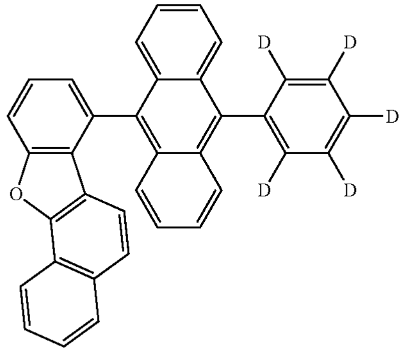

Combination 116

The compound represented by the formula (1) is BH1-I, and the compound represented by the formula (2) is BH2-L.

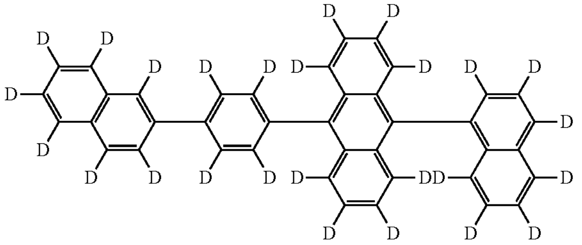

BH1-I

-continued

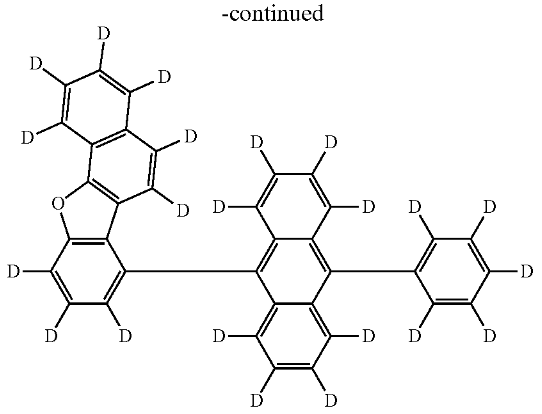

BH2-L

Combination 117

The compound represented by the formula (1) is BH1-I, and the compound represented by the formula (2) is BH2-M.

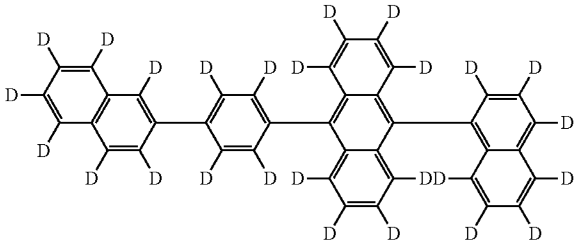

BH1-I

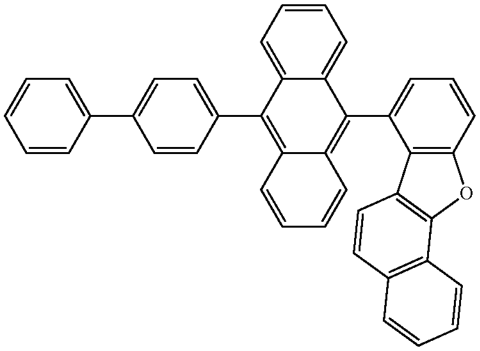

BH2-M

Combination 118

The compound represented by the formula (1) is BH1-J, and the compound represented by the formula (2) is BH2-A.

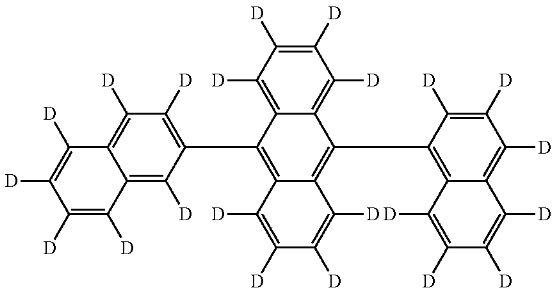

BH1-J

-continued

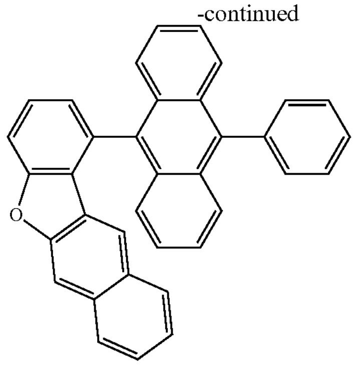

BH2-A

Combination 119

The compound represented by the formula (1) is BH1-J, and the compound represented by the formula (2) is BH2-B.

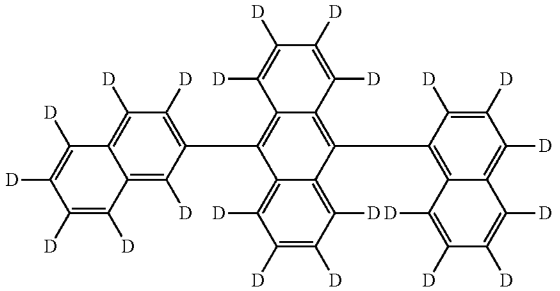

BH1-J

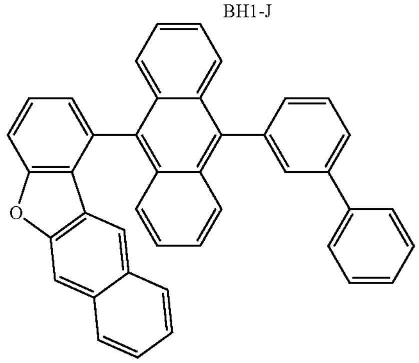

BH2-B

Combination 120

The compound represented by the formula (1) is BH1-J, and the compound represented by the formula (2) is BH2-C.

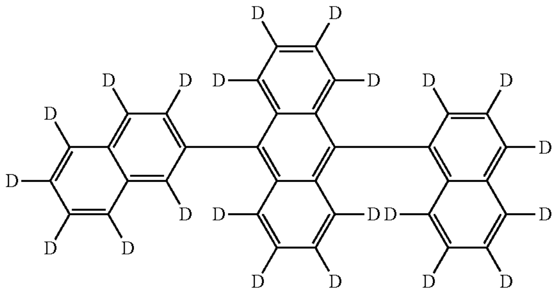

BH1-J

-continued

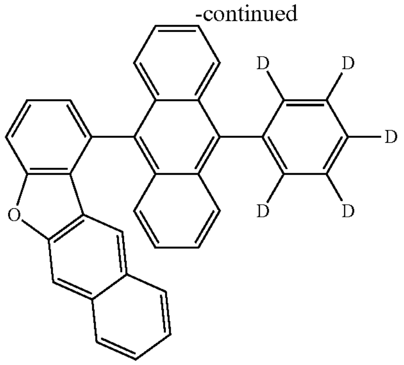

BH2-C

Combination 121

The compound represented by the formula (1) is BH1-J, and the compound represented by the formula (2) is BH2-D.

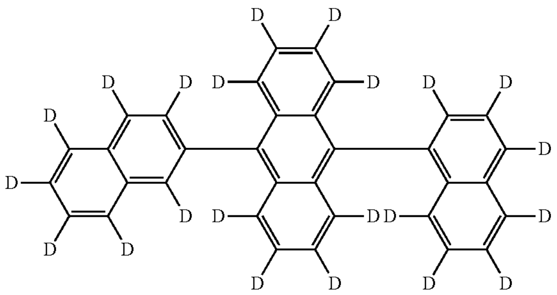

BH1-J

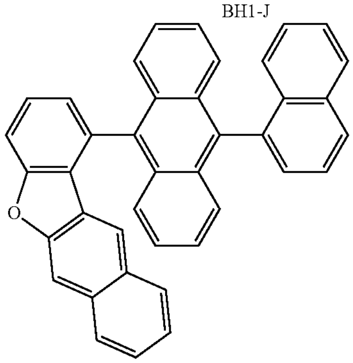

BH2-D

Combination 122

The compound represented by the formula (1) is BH1-J, and the compound represented by the formula (2) is BH2-E.

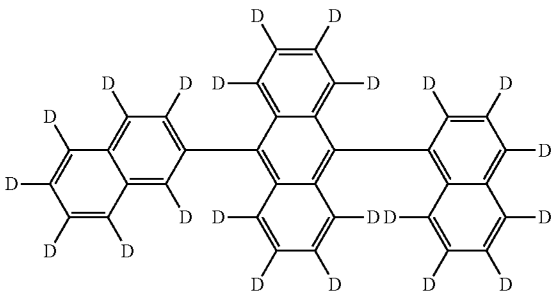

BH1-J

-continued

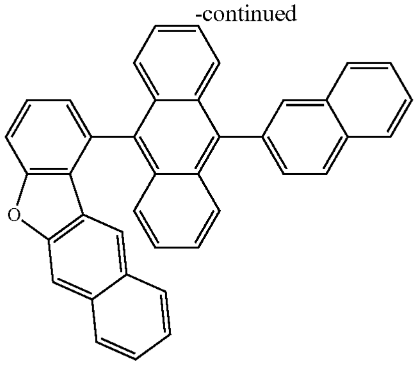

BH2-E

Combination 123

The compound represented by the formula (1) is BH1-J, and the compound represented by the formula (2) is BH2-F.

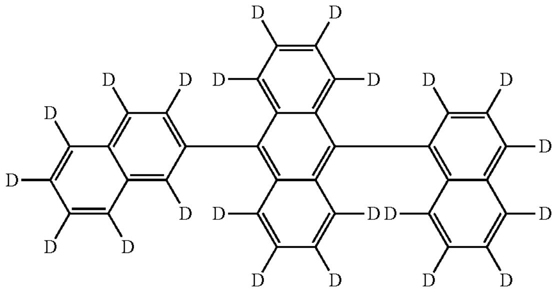

BH1-J

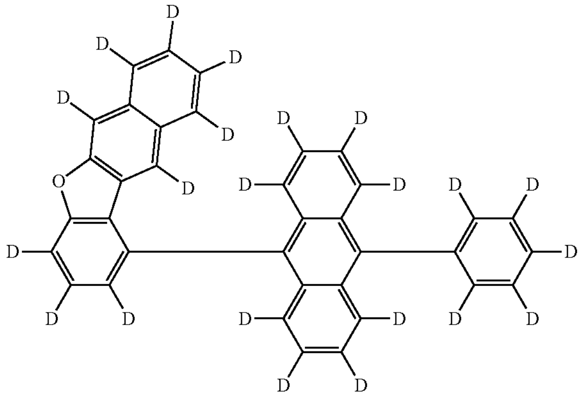

BH2-F

Combination 124

The compound represented by the formula (1) is BH1-J, and the compound represented by the formula (2) is BH2-G.

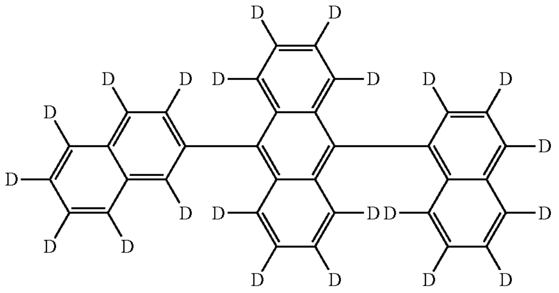

BH1-J

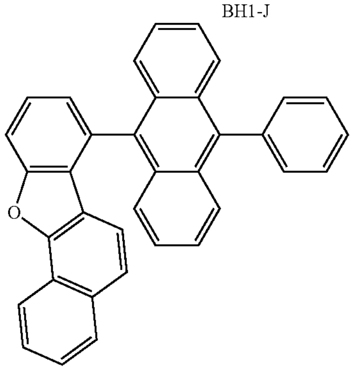

BH2-G

Combination 125

The compound represented by the formula (1) is BH1-J, and the compound represented by the formula (2) is BH2-H.

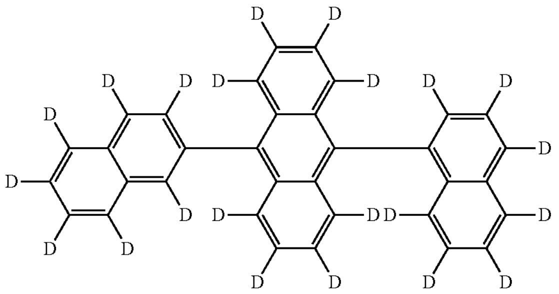

BH1-J

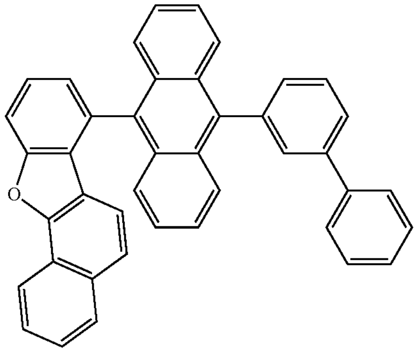

BH2-H

Combination 126

The compound represented by the formula (1) is BH1-J, and the compound represented by the formula (2) is BH2-1.

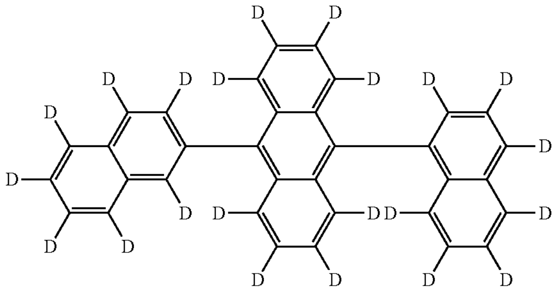

BH1-J

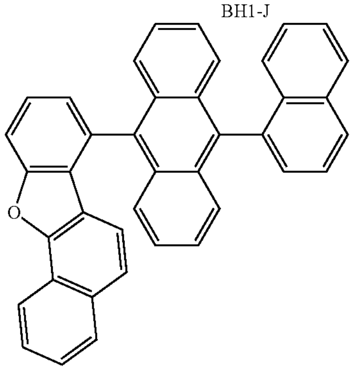

BH2-I

Combination 127

The compound represented by the formula (1) is BH1-J, and the compound represented by the formula (2) is BH2-J.

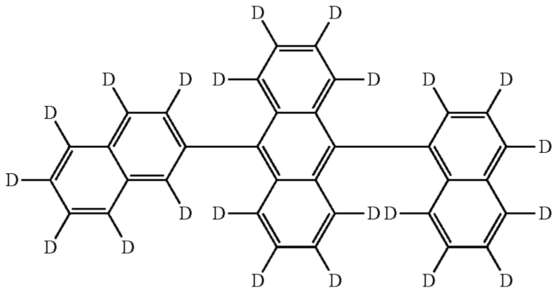

BH1-J

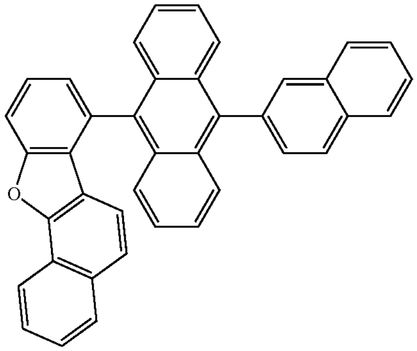

BH2-J

Combination 128

The compound represented by the formula (1) is BH1-J, and the compound represented by the formula (2) is BH2-K.

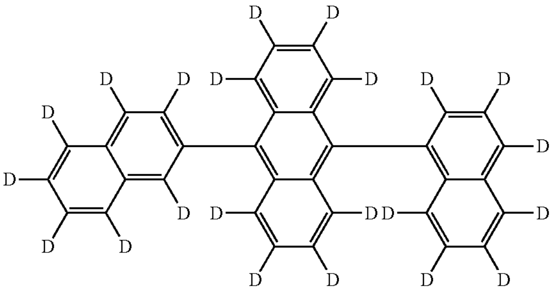

BH1-J

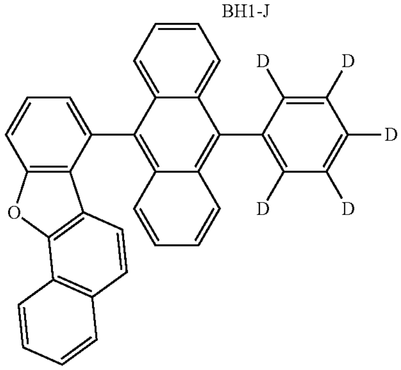

BH2-K

Combination 129

The compound represented by the formula (1) is BH1-J, and the compound represented by the formula (2) is BH2-L.

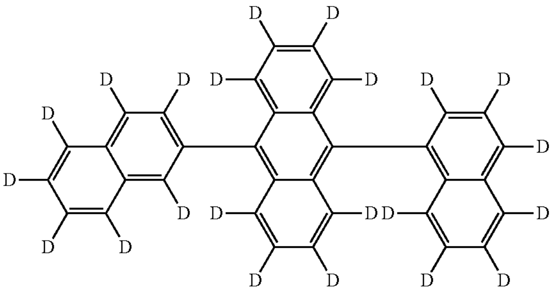

BH1-J

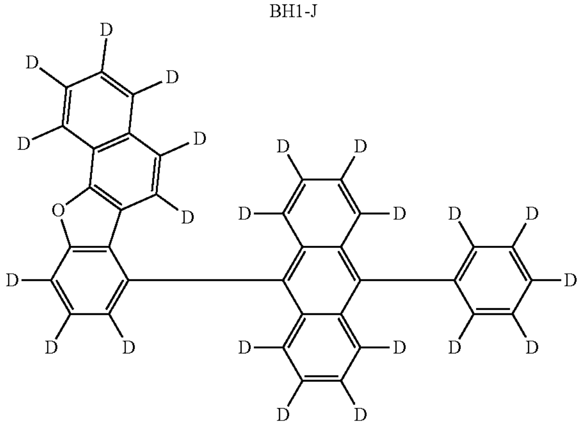

BH2-L

Combination 130

The compound represented by the formula (1) is BH1-J, and the compound represented by the formula (2) is BH2-M.

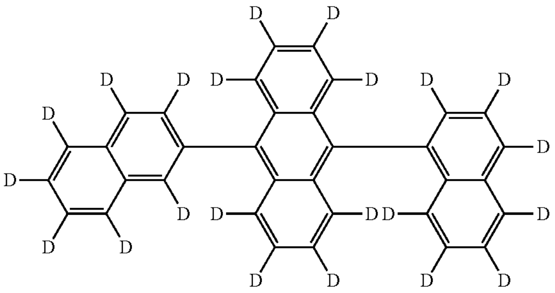

BH1-J

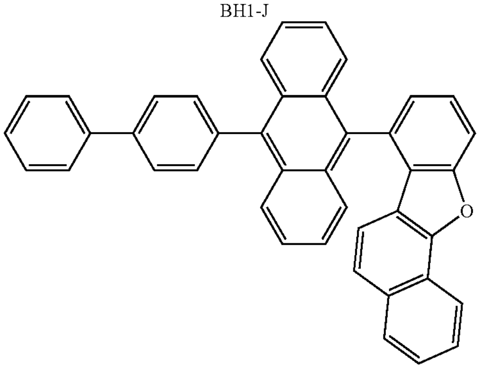

BH2-M

Combination 131

The compound represented by the formula (1) is BH1-K, and the compound represented by the formula (2) is BH2-A.

BH1-K

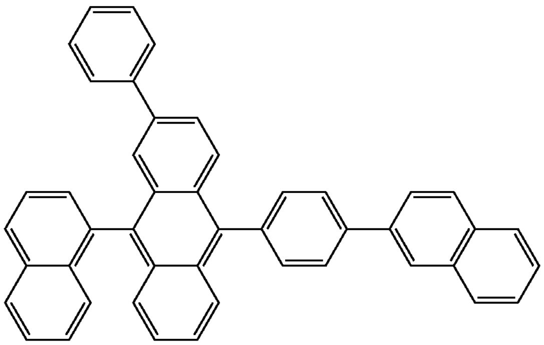

BH2-A

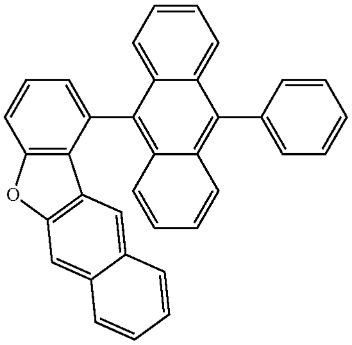

Combination 132

The compound represented by the formula (1) is BH1-K, and the compound represented by the formula (2) is BH2-B.

BH1-K
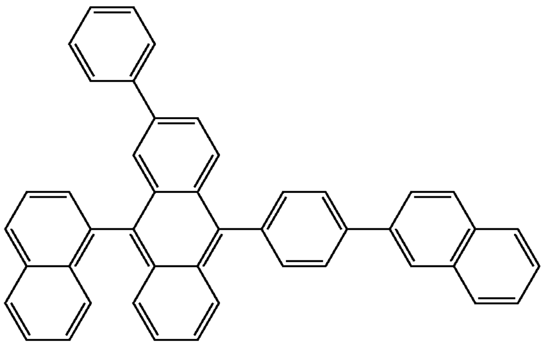
BH2-B
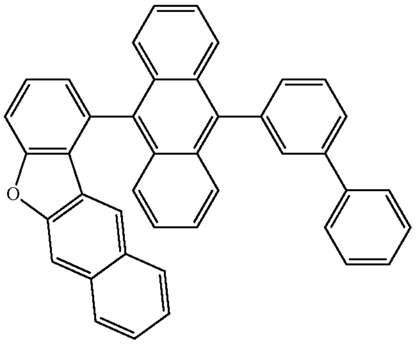
Combination 133
The compound represented by the formula (1) is BH1-K, and the compound represented by the formula (2) is BH2-C.
BH1-K
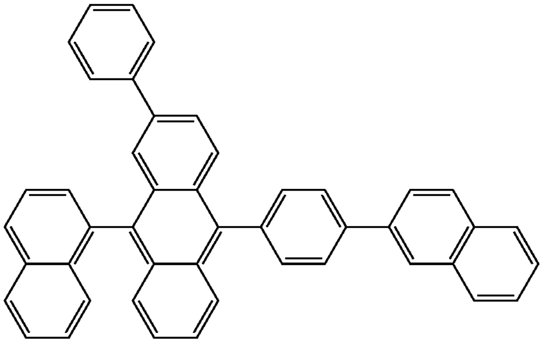
BH2-C
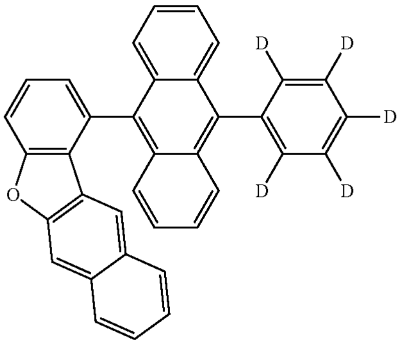
Combination 134
The compound represented by the formula (1) is BH1-K, and the compound represented by the formula (2) is BH2-D.
BH1-K
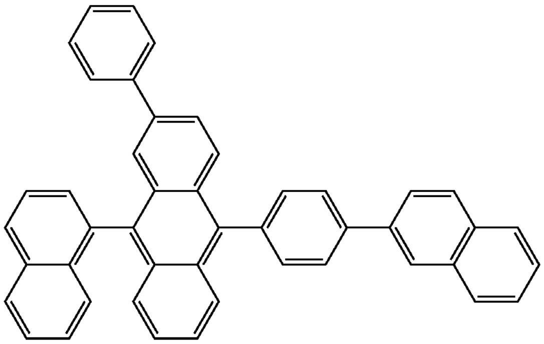
BH2-D
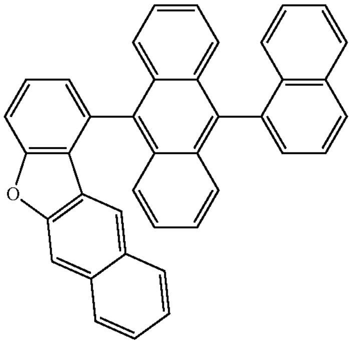
Combination 135
The compound represented by the formula (1) is BH1-K, and the compound represented by the formula (2) is BH2-E.
BH1-K
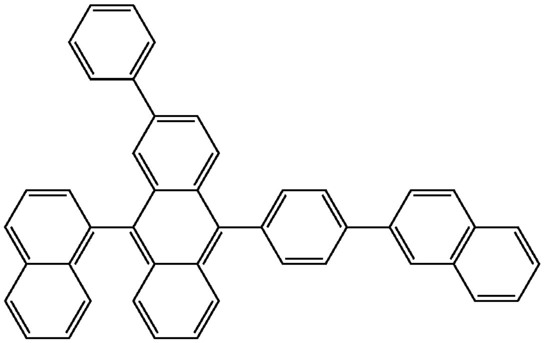

-continued

BH2-E

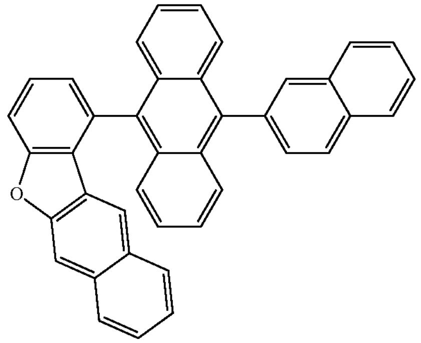

Combination 136

The compound represented by the formula (1) is BH1-K, and the compound represented by the formula (2) is BH2-F.

BH1-K

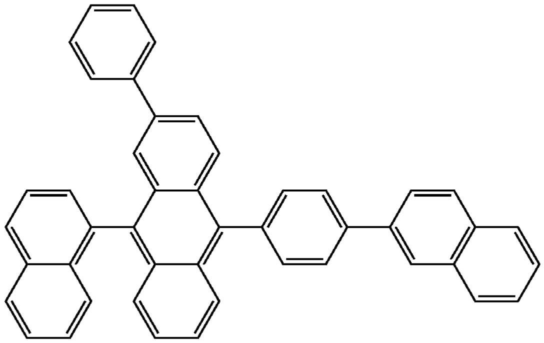

BH2-F

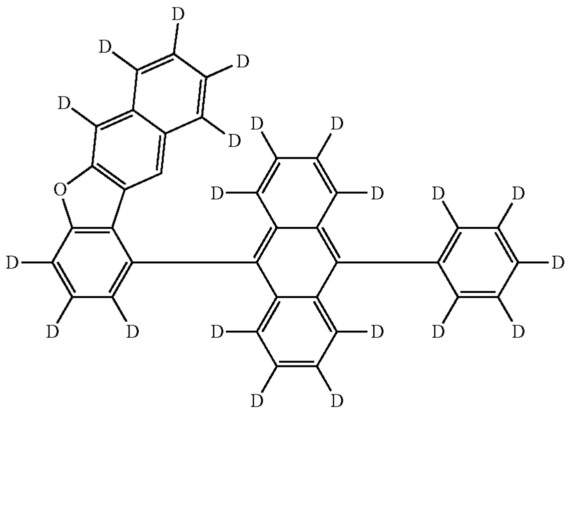

Combination 137

The compound represented by the formula (1) is BH1-K, and the compound represented by the formula (2) is BH2-G.

BH1-K

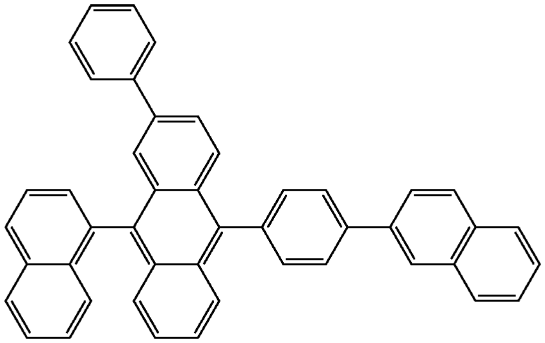

BH2-G

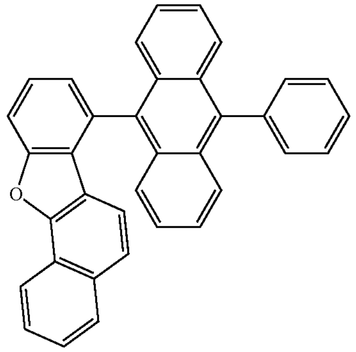

Combination 138

The compound represented by the formula (1) is BH1-K, and the compound represented by the formula (2) is BH2-H.

BH1-K

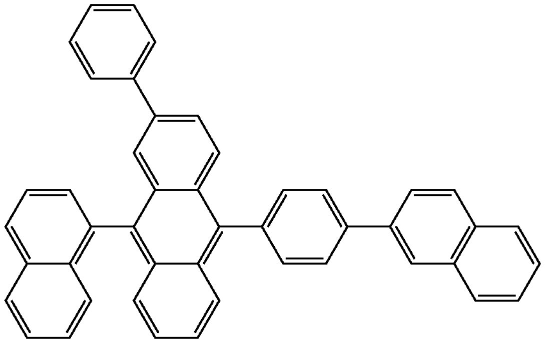

BH2-H

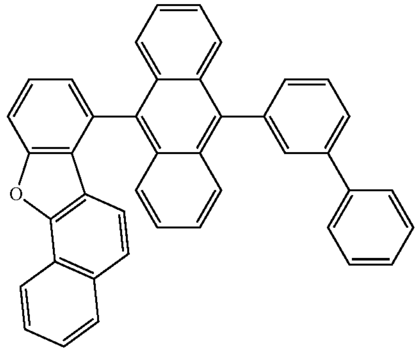

Combination 139

The compound represented by the formula (1) is BH1-K, and the compound represented by the formula (2) is BH2-1.

BH1-K

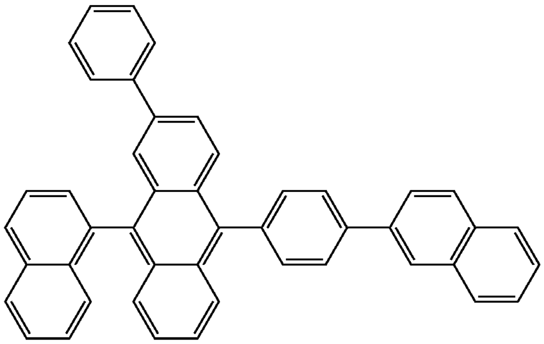

BH2-I

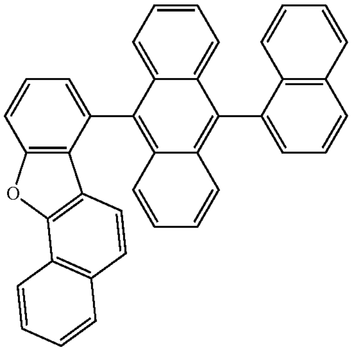

Combination 140

The compound represented by the formula (1) is BH1-K, and the compound represented by the formula (2) is BH2-J.

BH1-K

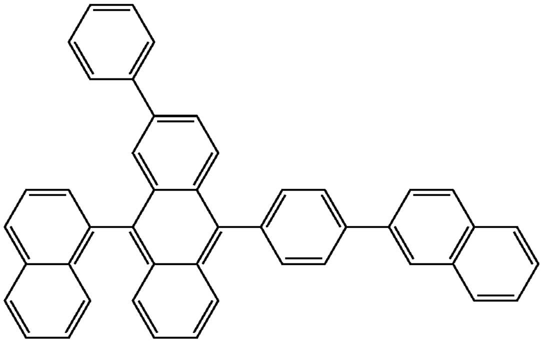

-continued

BH2-J

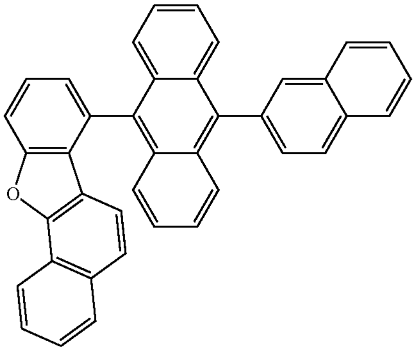

Combination 141

The compound represented by the formula (1) is BH1-K, and the compound represented by the formula (2) is BH2-K.

BH1-K

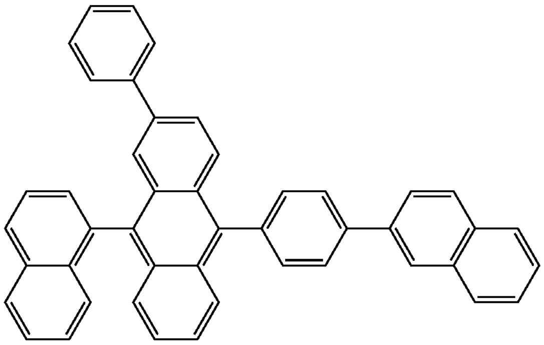

BH2-K

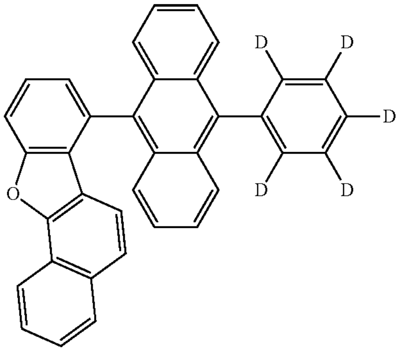

Combination 142

The compound represented by the formula (1) is BH1-K, and the compound represented by the formula (2) is BH2-L.

BH1-K

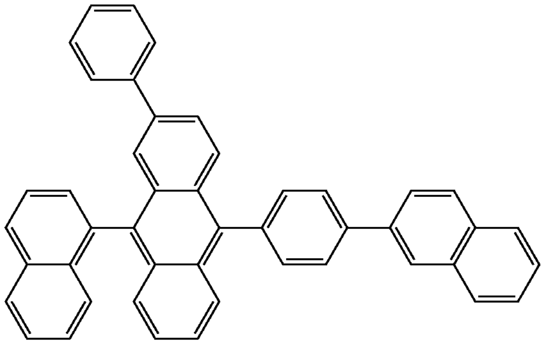

BH2-L

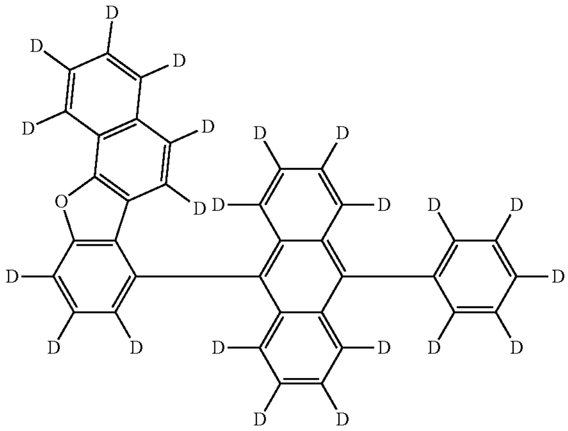

Combination 143

The compound represented by the formula (1) is BH1-K, and the compound represented by the formula (2) is BH2-M.

BH1-K

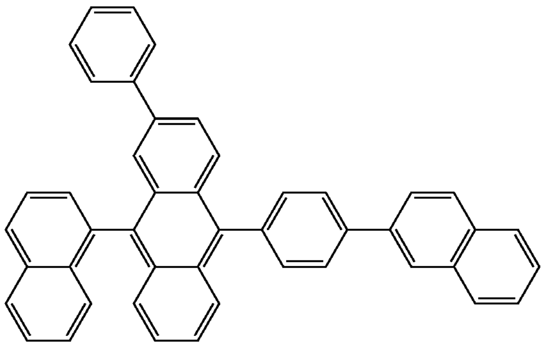

-continued

BH2-M

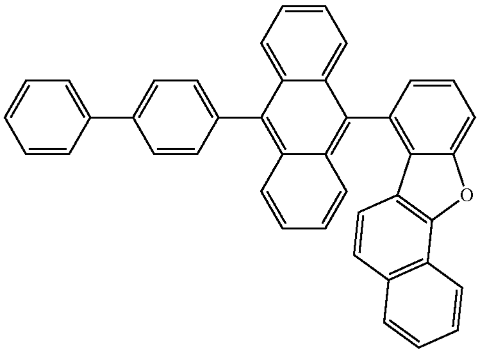

Combination 144

The compound represented by the formula (1) is BH1-L, and the compound represented by the formula (2) is BH2-A.

BH1-L

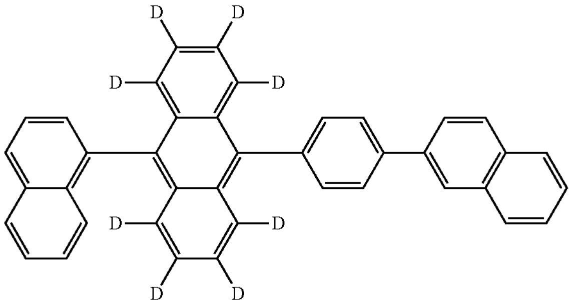

BH2-A

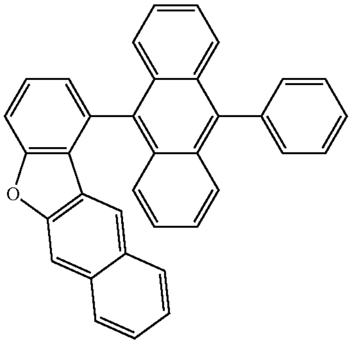

Combination 145

The compound represented by the formula (1) is BH1-L, and the compound represented by the formula (2) is BH2-B.

BH1-L

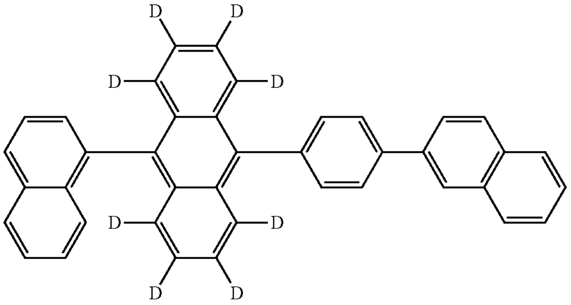

BH2-B

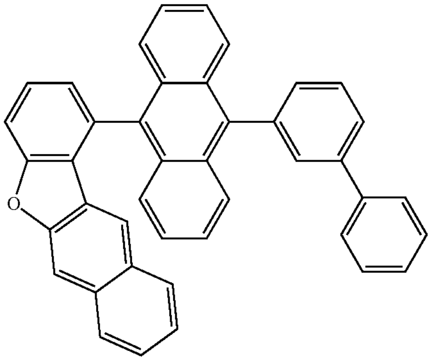

Combination 146

The compound represented by the formula (1) is BH1-L, and the compound represented by the formula (2) is BH2-C.

BH1-L

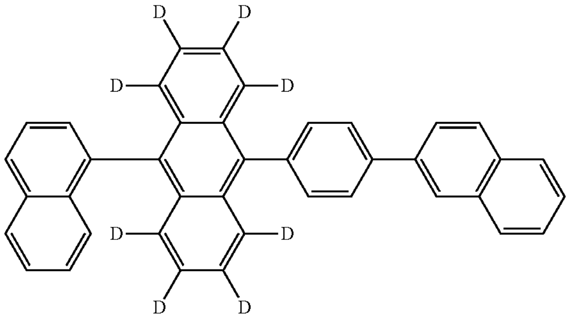

BH2-C

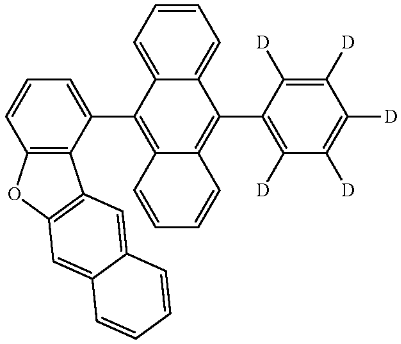

Combination 147

The compound represented by the formula (1) is BH1-L, and the compound represented by the formula (2) is BH2-D.

BH1-L

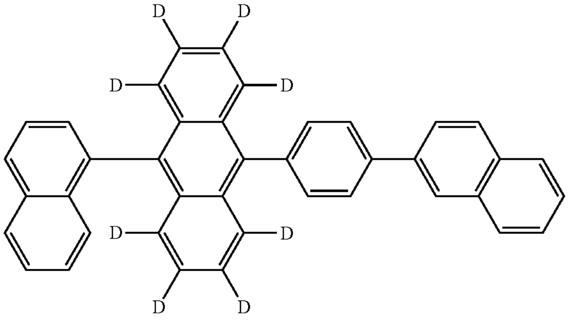

BH2-D

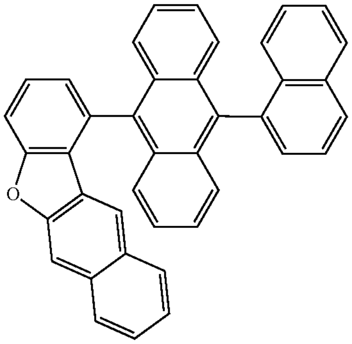

Combination 148

The compound represented by the formula (1) is BH1-L, and the compound represented by the formula (2) is BH2-E.

BH1-L

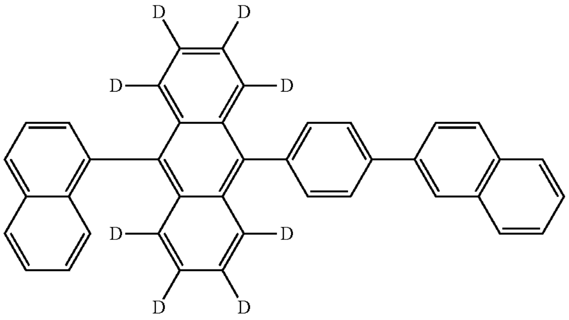

BH2-E

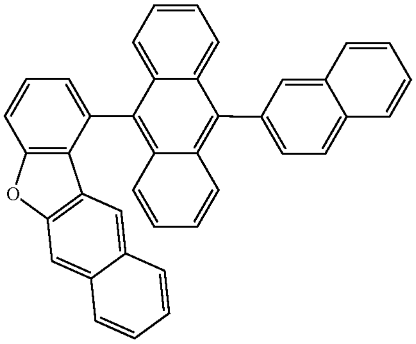

Combination 149

The compound represented by the formula (1) is BH1-L, and the compound represented by the formula (2) is BH2-F.

BH1-L

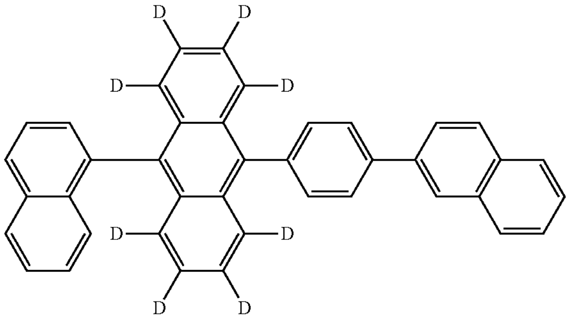

BH2-F

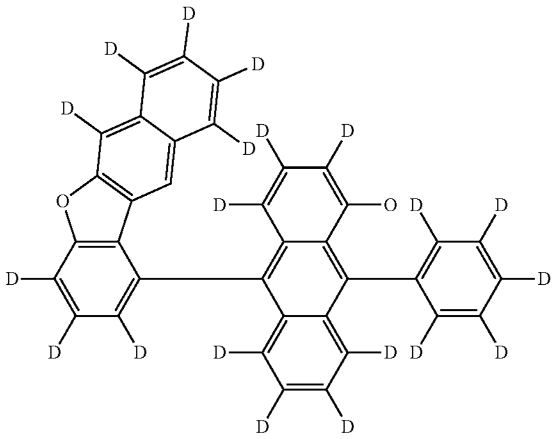

Combination 150

The compound represented by the formula (1) is BH1-L, and the compound represented by the formula (2) is BH2-G.

BH1-L

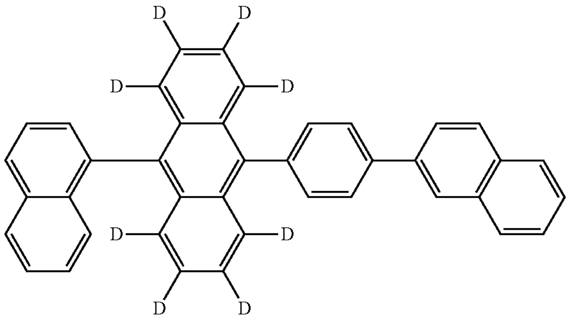

-continued

BH2-G

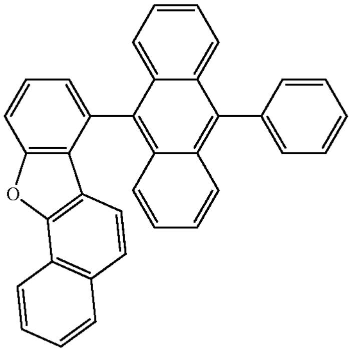

Combination 151

The compound represented by the formula (1) is BH1-L, and the compound represented by the formula (2) is BH2-H.

BH1-L

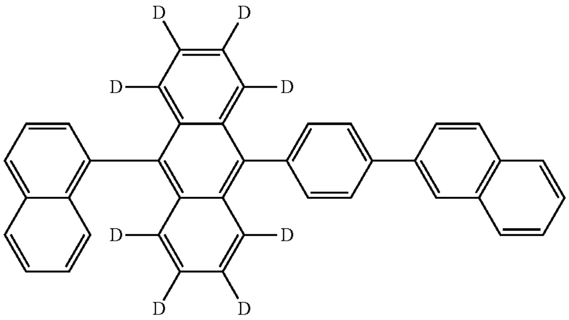

BH2-H

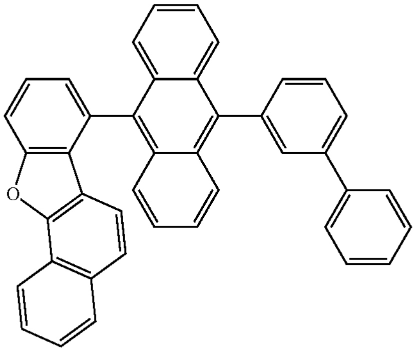

Combination 152

The compound represented by the formula (1) is BH1-L, and the compound represented by the formula (2) is BH2-1.

BH1-L
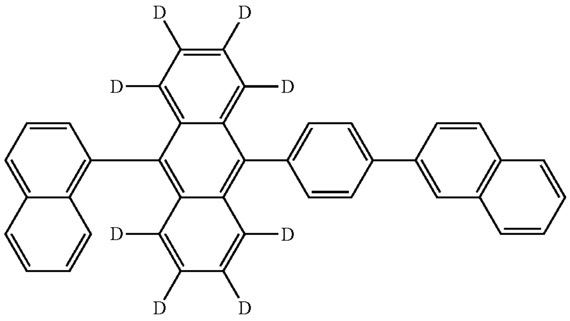
BH2-I
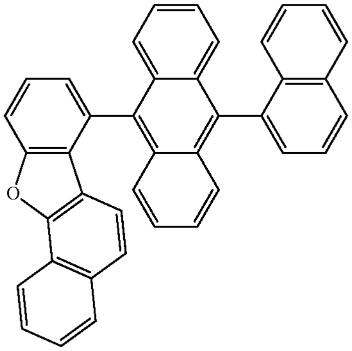
Combination 153
The compound represented by the formula (1) is BH1-L, and the compound represented by the formula (2) is BH2-J.
BH1-L
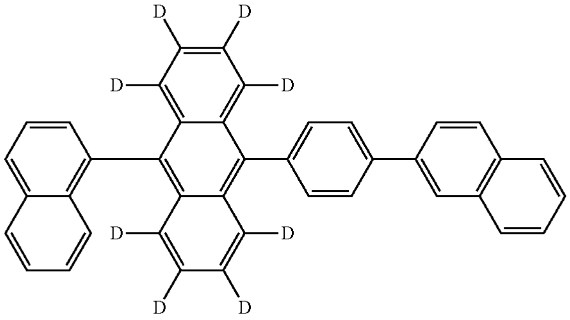
BH2-J
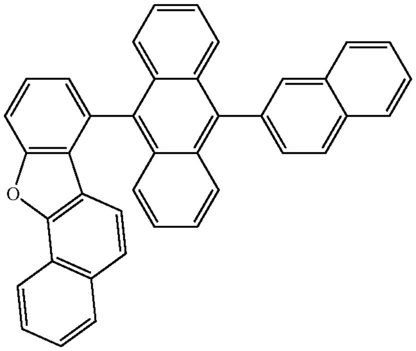
Combination 154
The compound represented by the formula (1) is BH1-L, and the compound represented by the formula (2) is BH2-K.
BH1-L
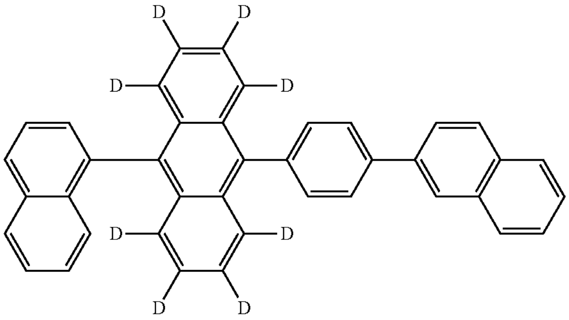
BH2-K
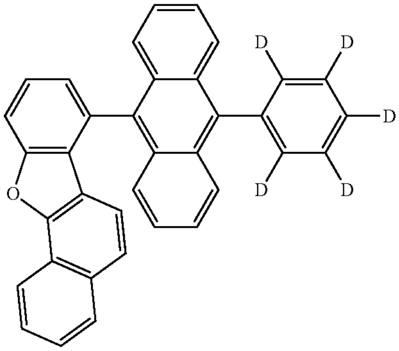
Combination 155
The compound represented by the formula (1) is BH1-L, and the compound represented by the formula (2) is BH2-L.
BH1-L
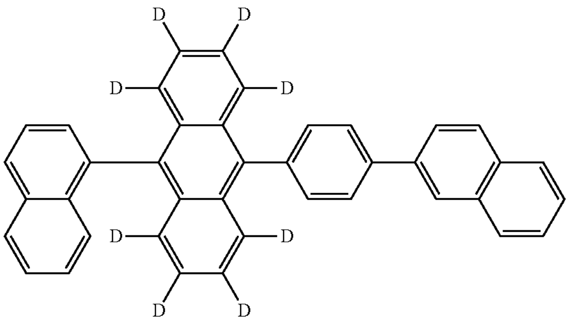

-continued

BH2-L

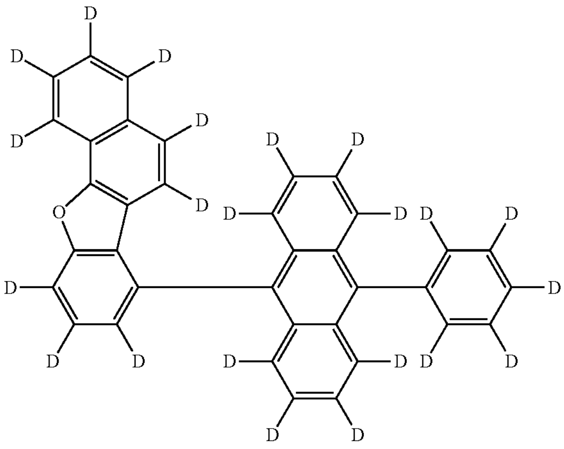

Combination 156

The compound represented by the formula (1) is BH1-L, and the compound represented by the formula (2) is BH2-M.

BH1-L

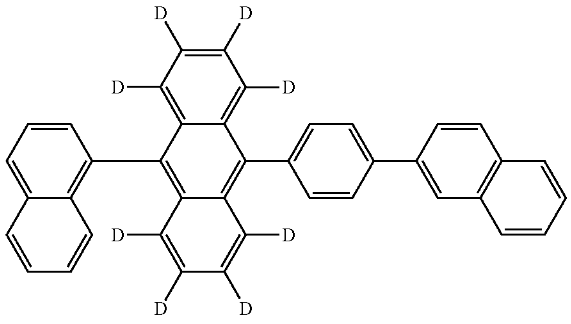

BH2-M

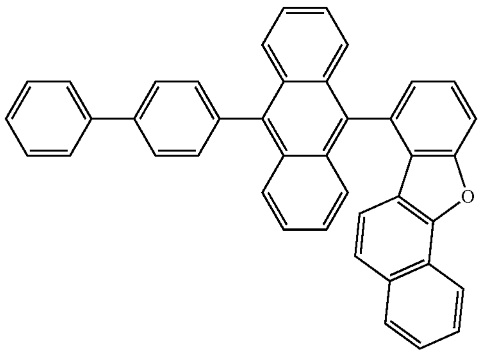

Combination 156

The compound represented by the formula (1) is BH1-A, and the compound represented by the formula (2) is BH2-N.

BH1-A

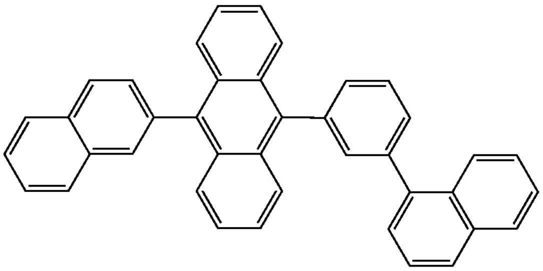

BH2-N

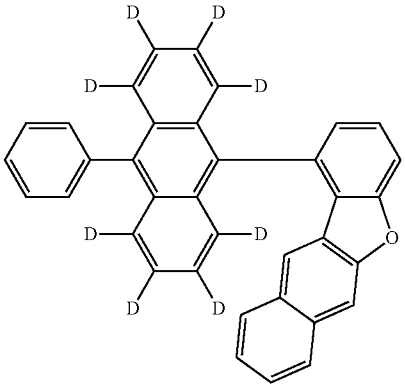

Combination 157

The compound represented by the formula (1) is BH1-A, and the compound represented by the formula (2) is BH2-O.

BH1-A

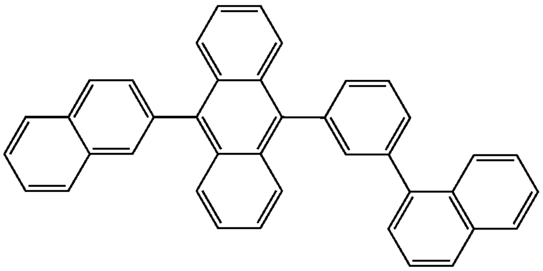

BH2-O

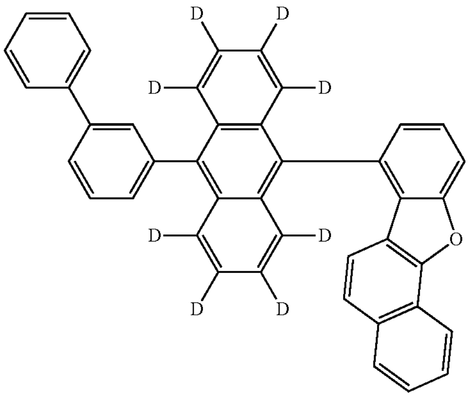

Combination 158

The compound represented by the formula (1) is BH1-B, and the compound represented by the formula (2) is BH2-N.

BH1-B

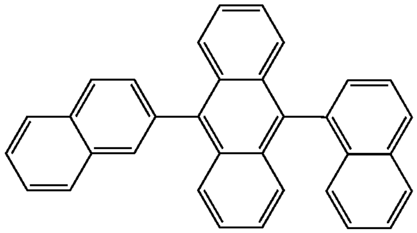

BH2-N

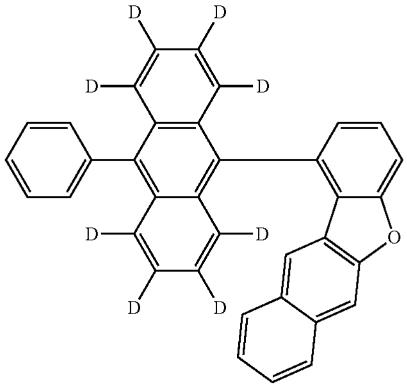

Combination 159

The compound represented by the formula (1) is BH1-B, and the compound represented by the formula (2) is BH2-O.

BH1-B

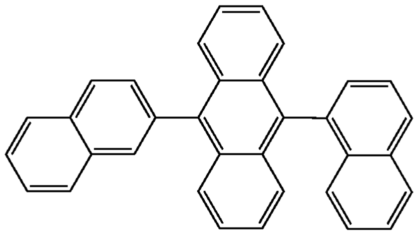

BH2-O

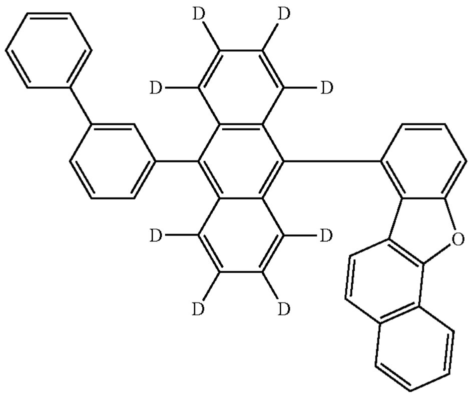

Combination 160

The compound represented by the formula (1) is BH1-C, and the compound represented by the formula (2) is BH2-N.

BH1-C

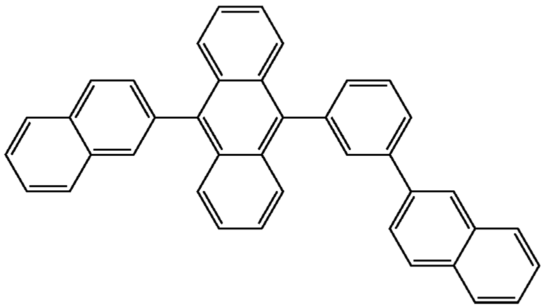

BH2-N

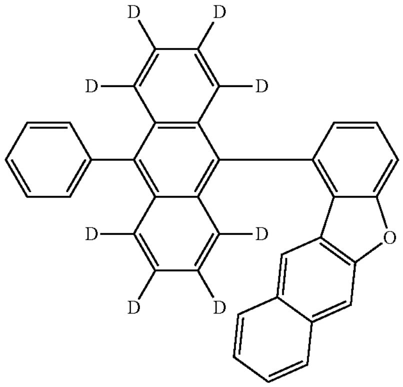

Combination 161

The compound represented by the formula (1) is BH1-C, and the compound represented by the formula (2) is BH2-O.

BH1-C

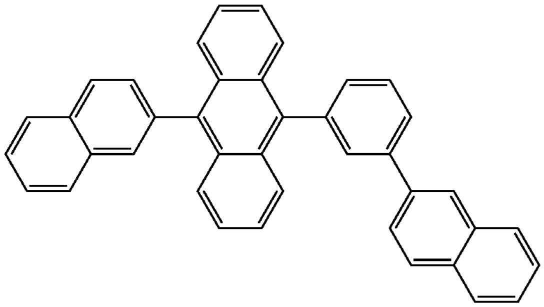

BH2-O

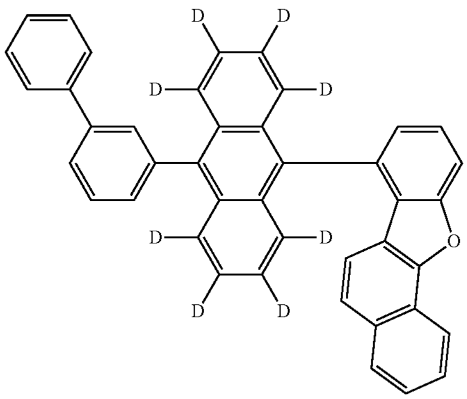

Combination 162

The compound represented by the formula (1) is BH1-D, and the compound represented by the formula (2) is BH2-N.

BH1-D

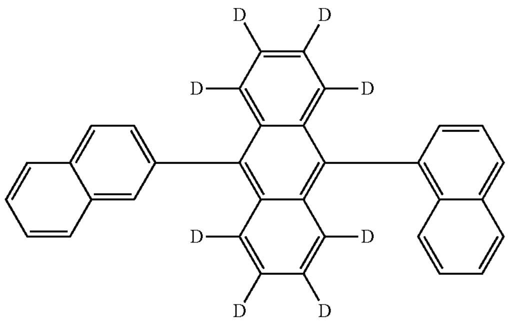

BH2-N

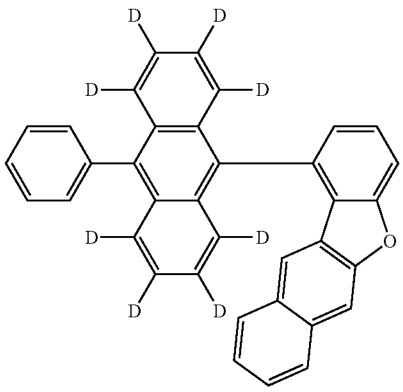

Combination 163

The compound represented by the formula (1) is BH1-D, and the compound represented by the formula (2) is BH2-O.

BH1-D

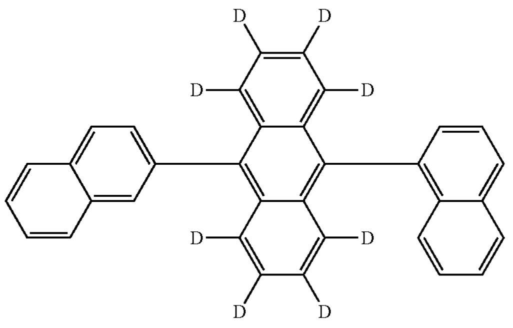

-continued

BH2-O

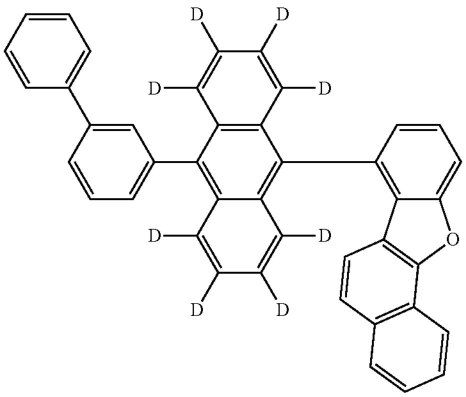

Combination 164

The compound represented by the formula (1) is BH1-E, and the compound represented by the formula (2) is BH2-N.

BH1-E

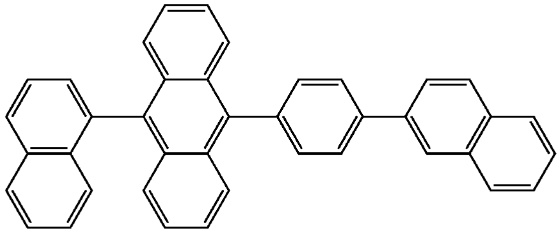

BH2-N

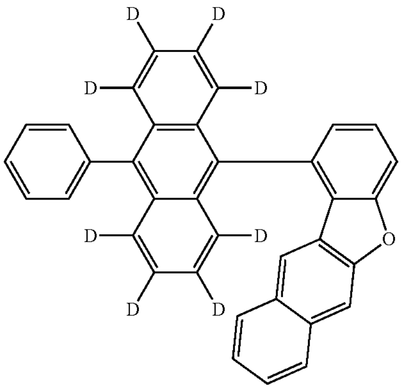

Combination 165

The compound represented by the formula (1) is BH1-E, and the compound represented by the formula (2) is BH2-O.

BH1-E

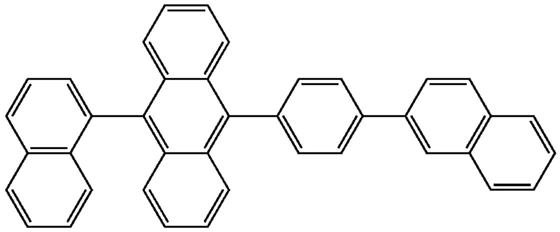

-continued

BH2-O

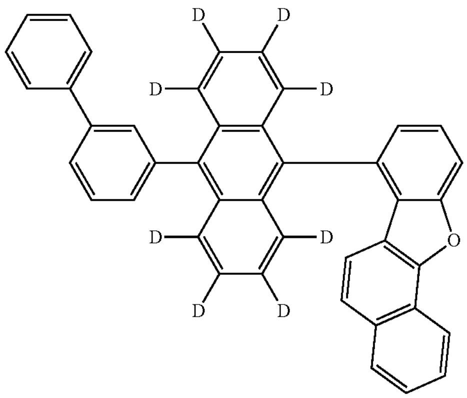

Combination 166

The compound represented by the formula (1) is BH1-F, and the compound represented by the formula (2) is BH2-N.

BH1-F

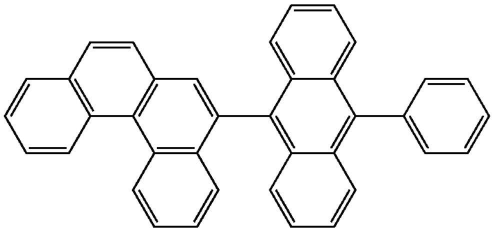

BH2-N

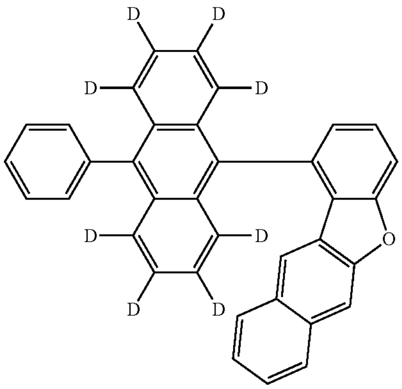

Combination 167

The compound represented by the formula (1) is BH1-F, and the compound represented by the formula (2) is BH2-O.

BH1-F

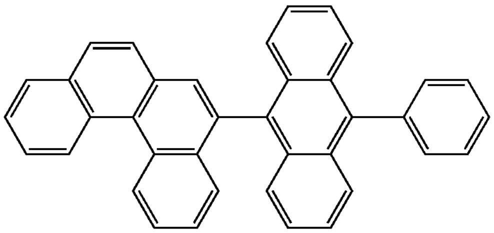

-continued

BH2-O

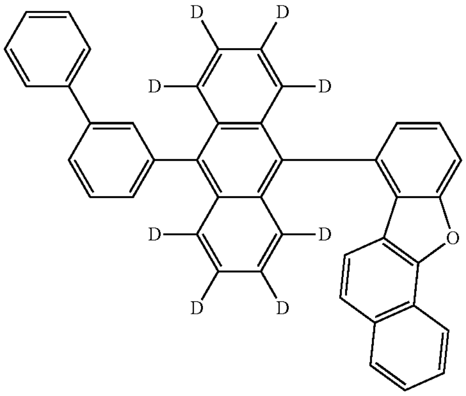

Combination 168

The compound represented by the formula (1) is BH1-G, and the compound represented by the formula (2) is BH2-N.

BH1-G

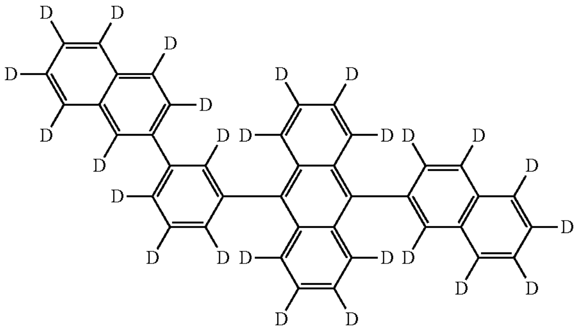

BH2-N

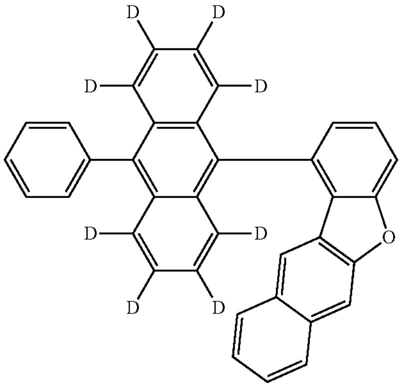

Combination 169

The compound represented by the formula (1) is BH1-G, and the compound represented by the formula (2) is BH2-O.

BH1-G

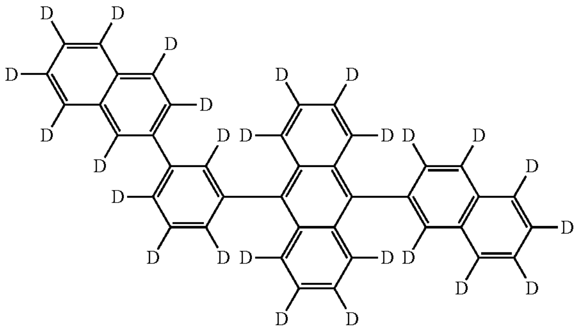

BH2-O

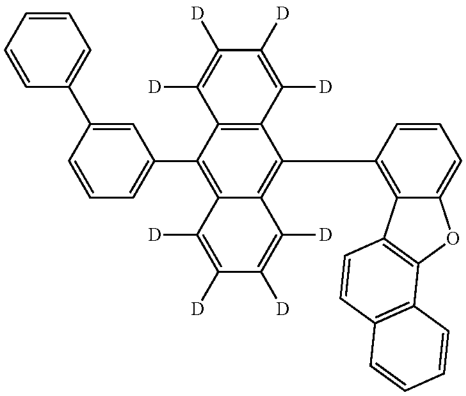

Combination 170

The compound represented by the formula (1) is BH1-H, and the compound represented by the formula (2) is BH2-N.

BH1-H

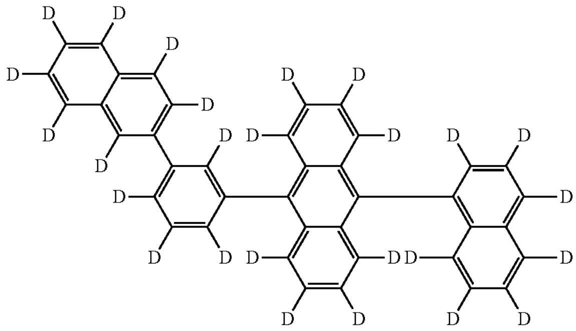

-continued

BH2-N

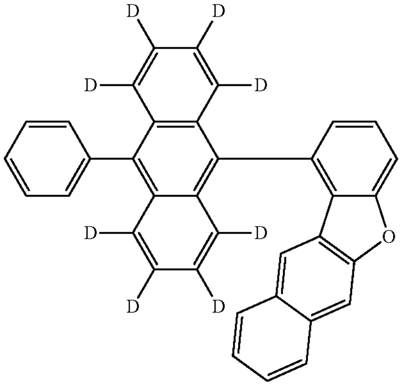

Combination 171

The compound represented by the formula (1) is BH1-H, and the compound represented by the formula (2) is BH2-O.

BH1-H

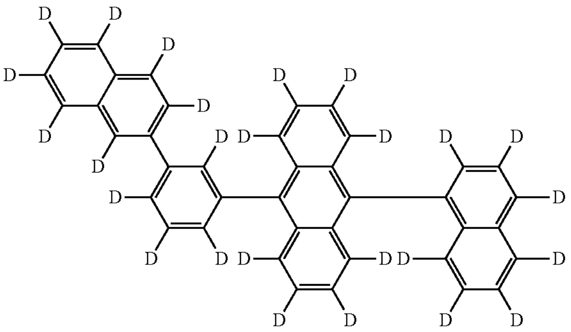

BH2-O

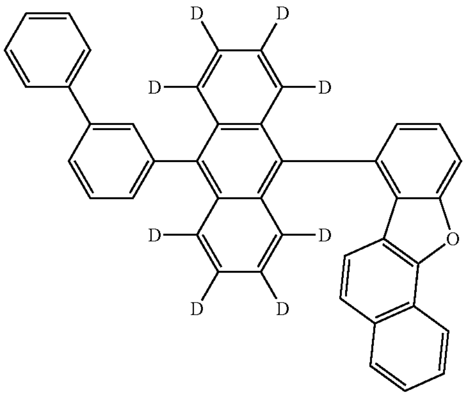

Combination 172

The compound represented by the formula (1) is BH1-I, and the compound represented by the formula (2) is BH2-N.

BH1-I
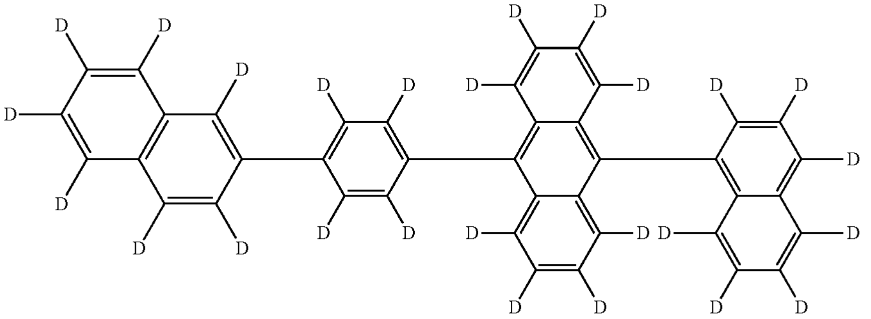
BH2-N
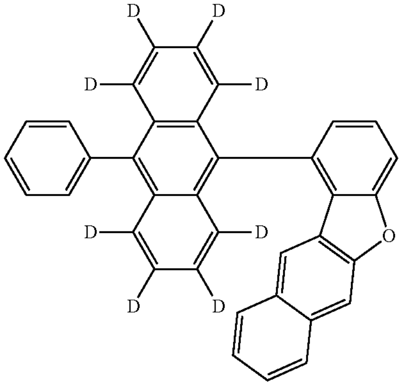
Combination 173
The compound represented by the formula (1) is BH1-I, and the compound represented by the formula (2) is BH2-O.
Combination 174
The compound represented by the formula (1) is BH1-J, and the compound represented by the formula (2) is BH2-N.
BH1-I
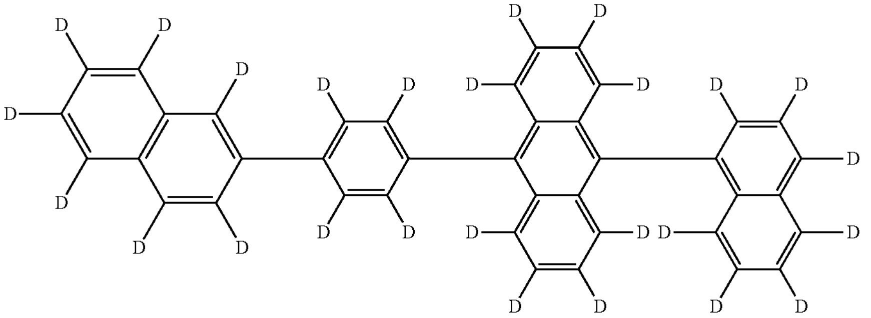
BH2-O
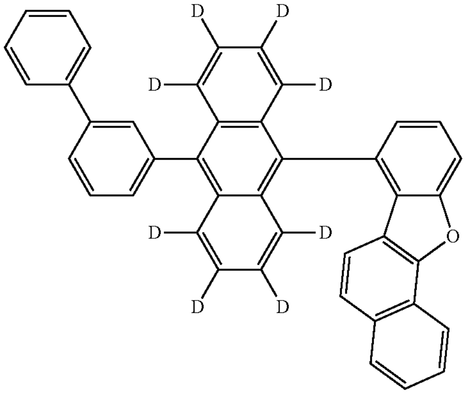

BH1-J
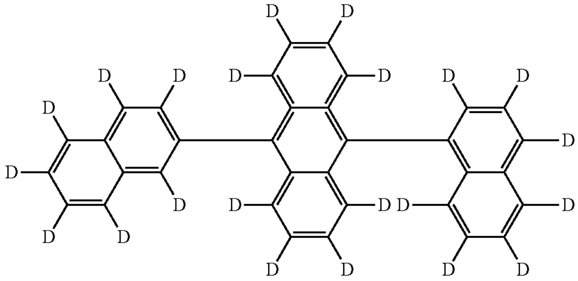
BH2-N
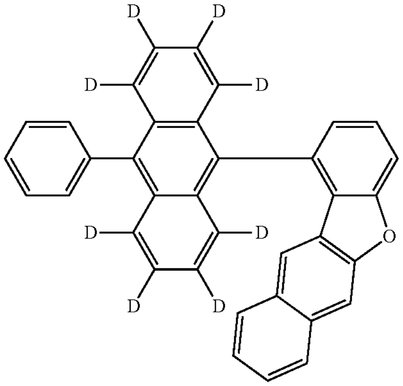
Combination 175
The compound represented by the formula (1) is BH1-J, and the compound represented by the formula (2) is BH2-O.
BH1-J
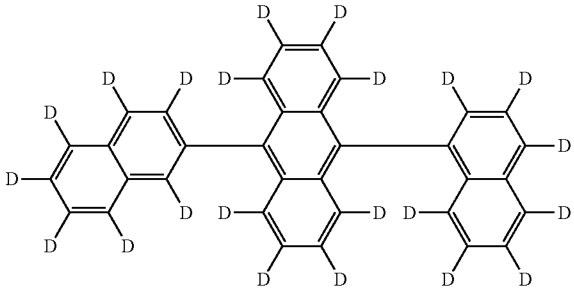
BH2-O
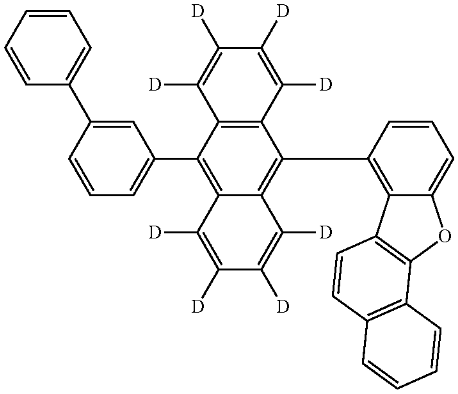
Combination 176
The compound represented by the formula (1) is BH1-K, and the compound represented by the formula (2) is BH2-N.
BH1-K
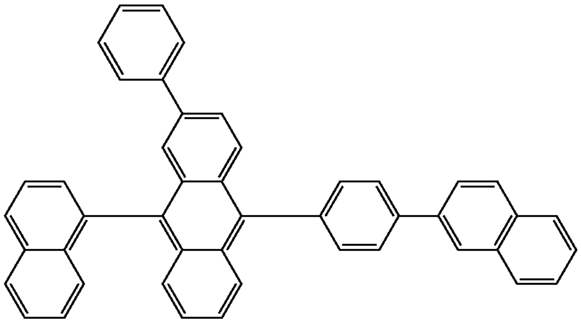
BH2-N
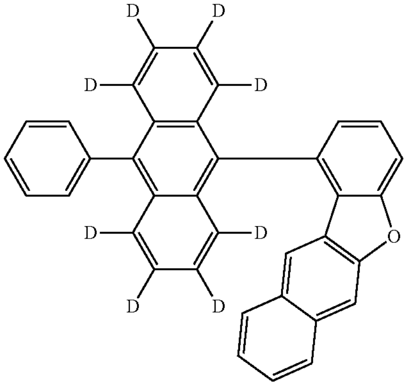
Combination 177
The compound represented by the formula (1) is BH1-K, and the compound represented by the formula (2) is BH2-O.
BH1-K
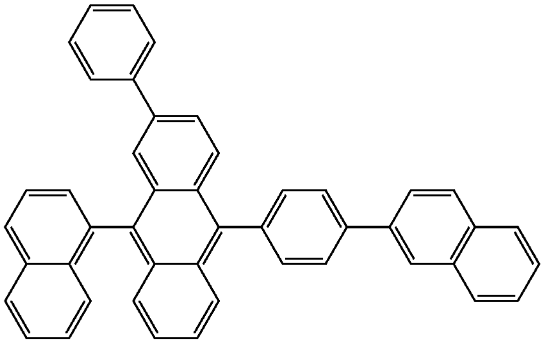

-continued

BH2-O

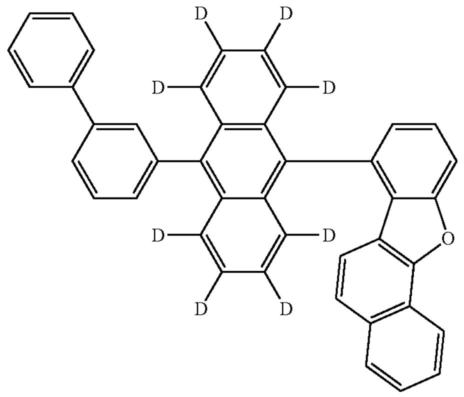

Combination 178

The compound represented by the formula (1) is BH1-L, and the compound represented by the formula (2) is BH2-N.

BH1-L

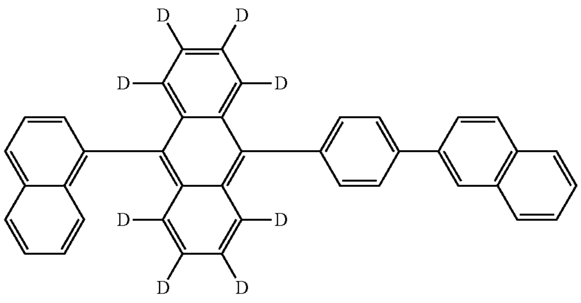

BH2-N

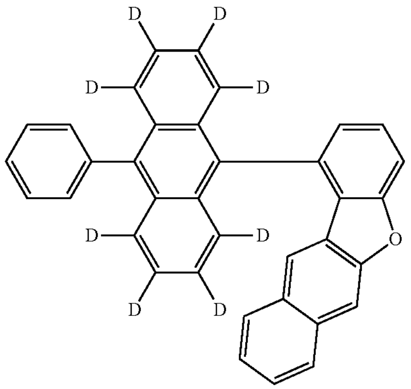

Combination 179

The compound represented by the formula (1) is BH1-L, and the compound represented by the formula (2) is BH2-O.

BH1-L

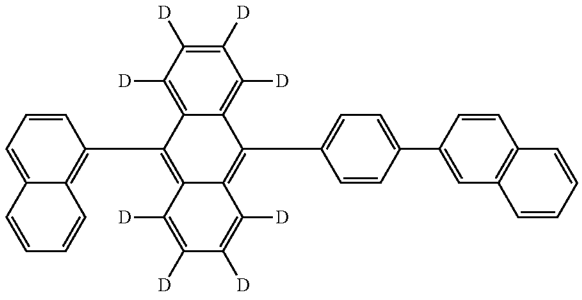

BH2-O

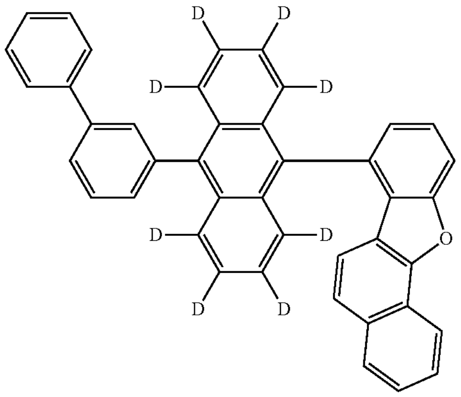

The blending ratio of the compound represented by the formula (1) and the compound represented by the formula (2) is not particularly limited. Depending on the desired effect of the composition, the blending ratio of the materials may be appropriately determined.

The blending ratio (mass ratio) of the compound represented by the formula (1) and the compound represented by the formula (2) is usually from 1:99 to 99:1, preferably from 10:90 to 90:10, and more preferably from 40:60 to 60:40.

In one embodiment, the composition is a powder, and the powder consists of a composition containing a compound represented by the formula (1) and a compound represented by the formula (2).

The composition according to an aspect of the invention may be in a powder form. In the powder, both of a compound represented by the formula (1) and a compound represented by the formula (2) may be contained in one powder particle, or the powder may be a mixture of powder particles composed of a compound represented by the formula (1) and powder particles composed of a compound represented by the formula (2). The blending ratio of the compound represented by the formula (1) and the compound represented by the formula (2) in the powder is not particularly limited, and is as described above for the composition. The powder may be also referred to as "premix".

The composition according to an aspect of the invention may contain component other than the compound represented by the formula (1) and the compound represented by the formula (2). Examples of other components include the above-described dopant material and the like. Details of the dopant materials are as described above.

[Electronic Apparatus]

The electronic apparatus according to an aspect of the invention is characterized in that the organic EL device according to an aspect of the invention is equipped with.

Specific examples of the electronic apparatus include display components such as an organic EL panel module; display devices for a television, a cellular phone, and a personal computer; and emitting devices such as a light, and a vehicular lamp.

EXAMPLES

Hereinafter, Examples according to the invention will be described. The invention is not limited in any way by these Examples.

<Compound>

Compounds represented by the formula (1) (first host material) used in Examples and Comparative Examples are shown below.

BH1-1

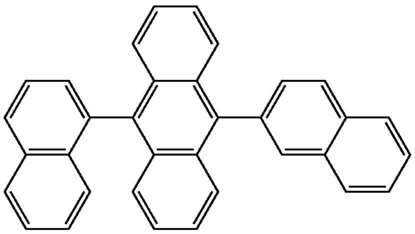

BH1-2

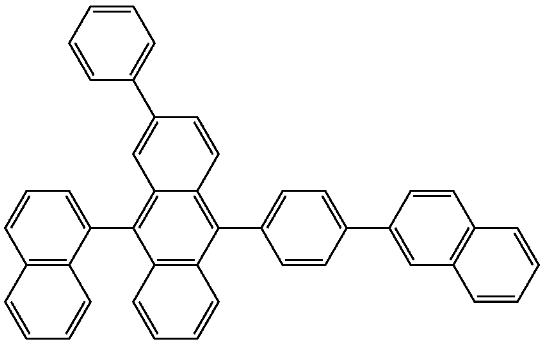

BH1-3

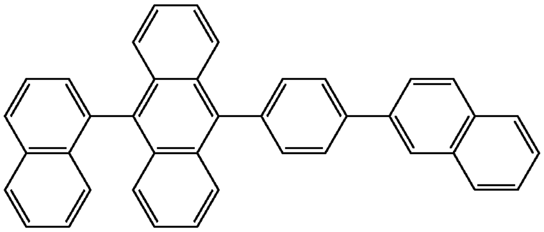

BH1-4

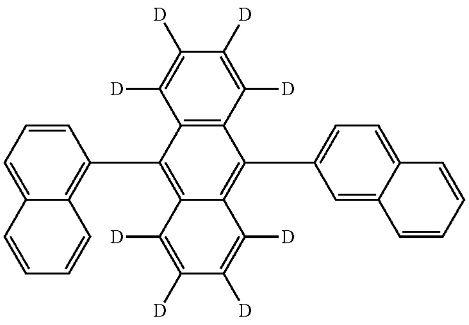

-continued
BH1-5
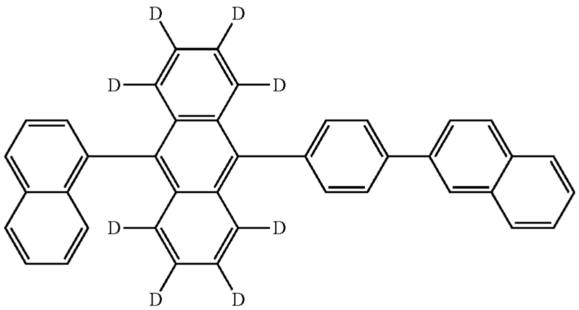
BH1-6
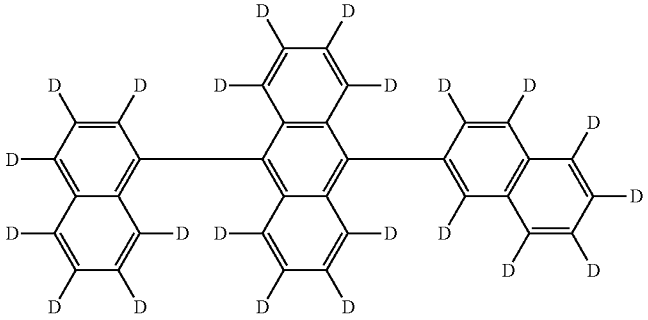
BH1-7
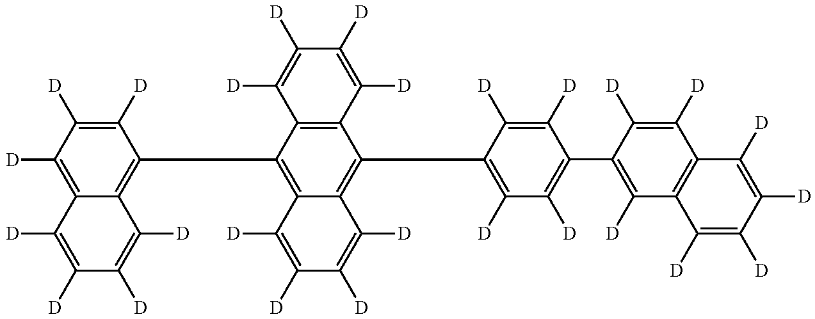
Compounds represented by the formula (2) (second host material) used in Examples and Comparative Examples are shown below.
BH2-1
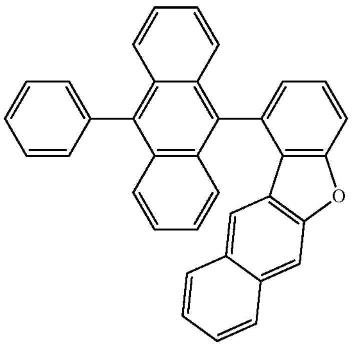
-continued
BH2-2
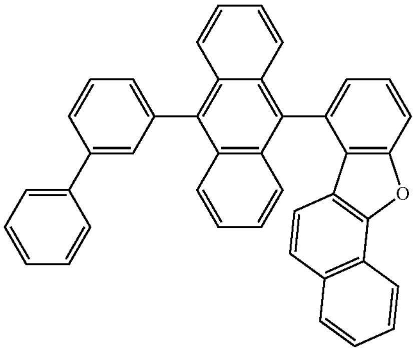

-continued
BH2-1D
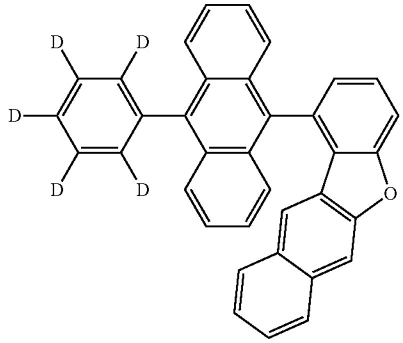
BH2-3
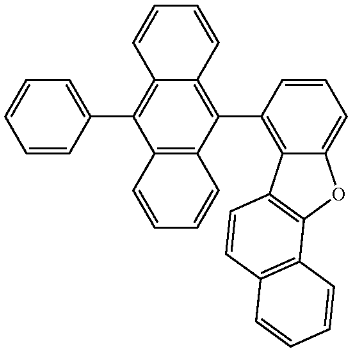
BH2-3D
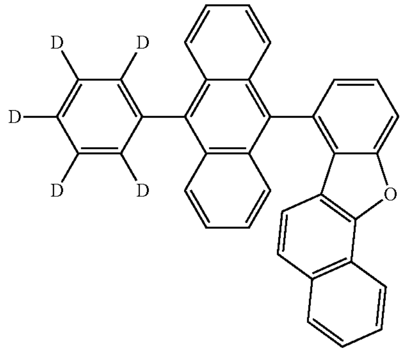
BH2-5
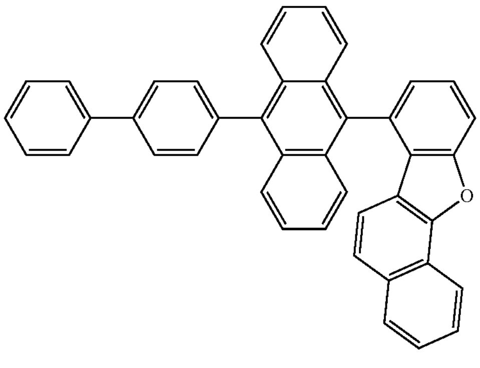
-continued
BH2-6
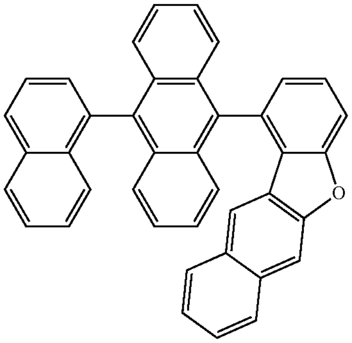
BH2-7
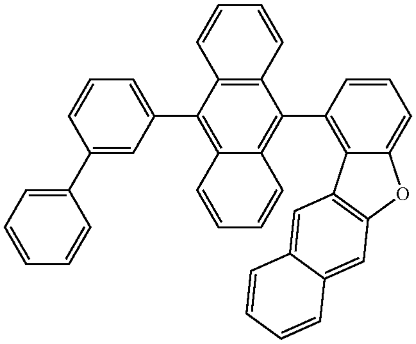
BH2-8
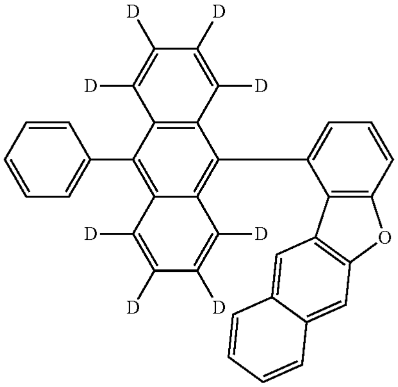
BH2-9
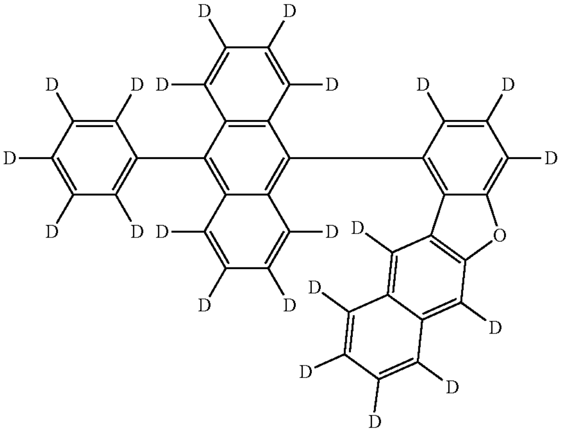

-continued
BH2-10
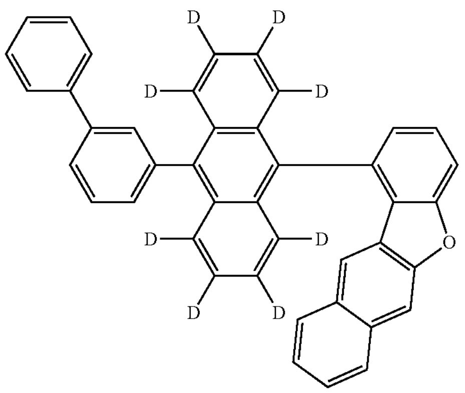
A compound used in Comparative Example B is shown below.
Ref. BH2-4D
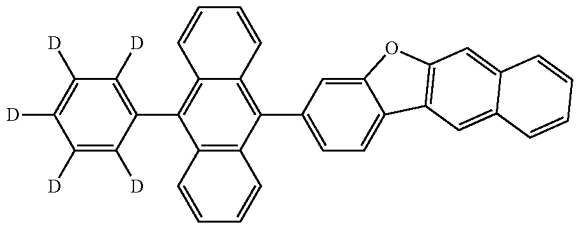
Dopant materials used in Examples and Comparative Examples are shown below.
BD-1
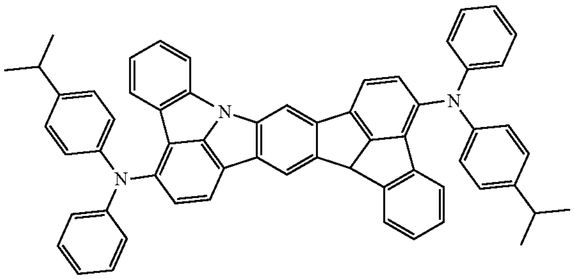
BD-2
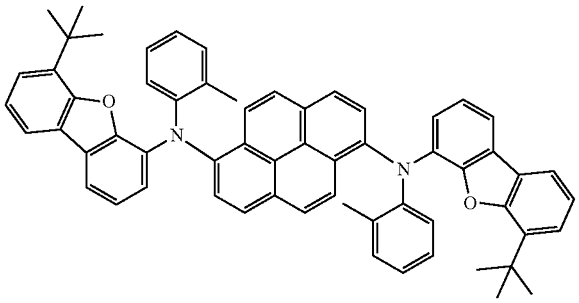
Other compounds used in Examples and Comparative Examples are shown below.
HT-1
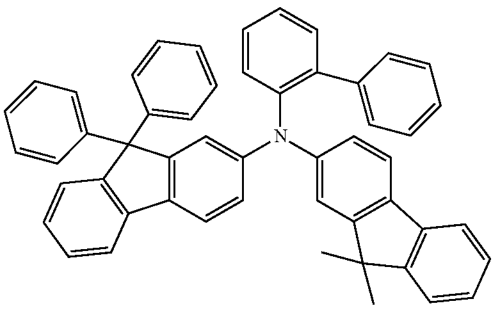
HT-2
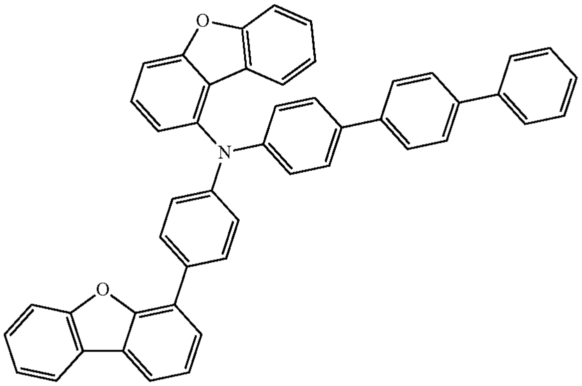
HT-3
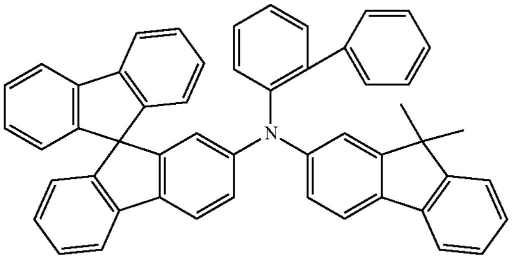
HT-4
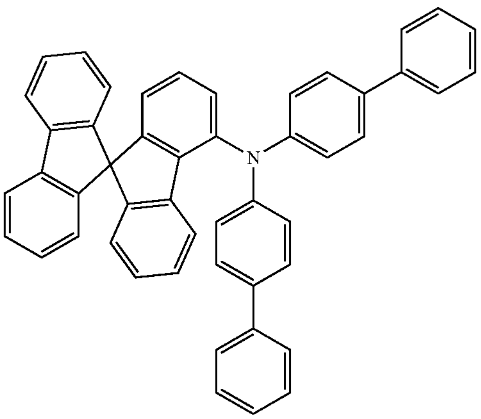

-continued
HT-5
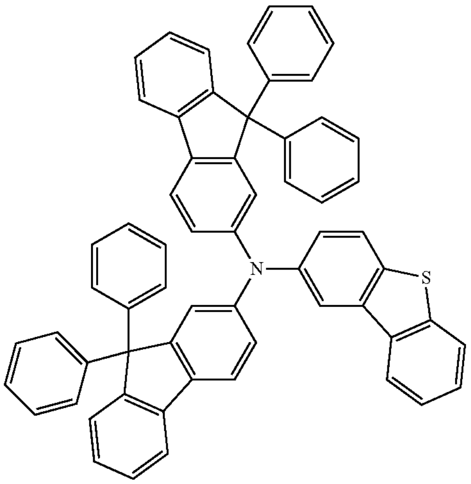
HT-6
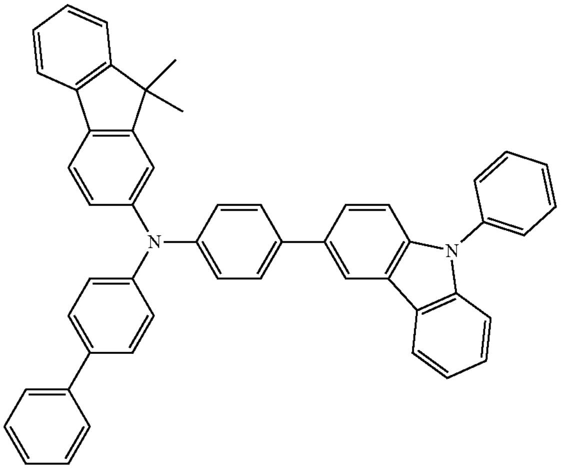
HT-7
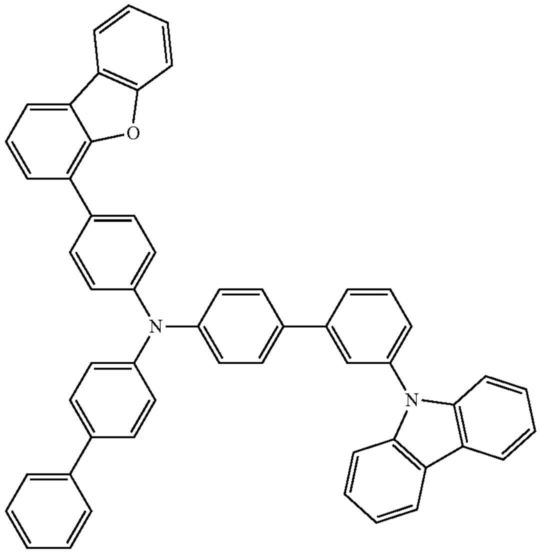
-continued
HI-1
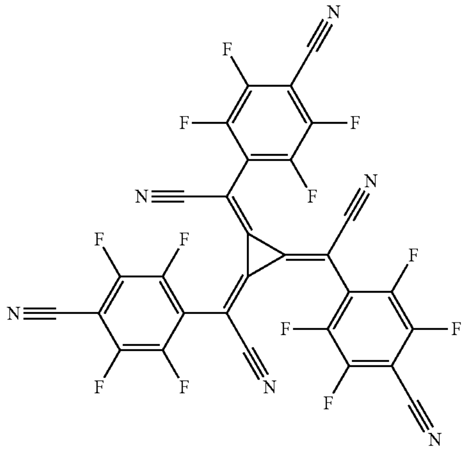
HI-2
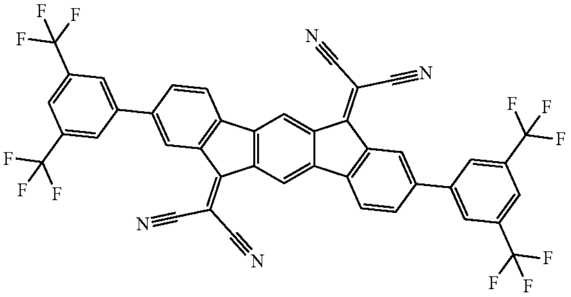
ET-1
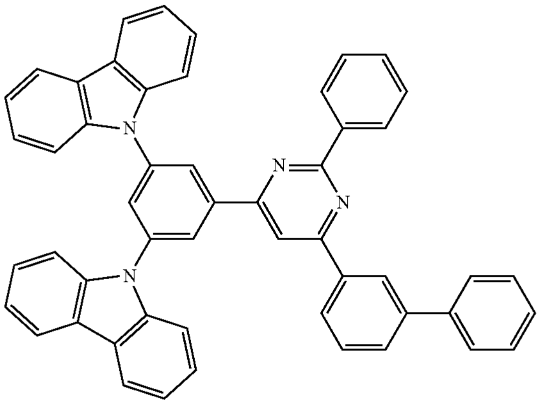
ET-2
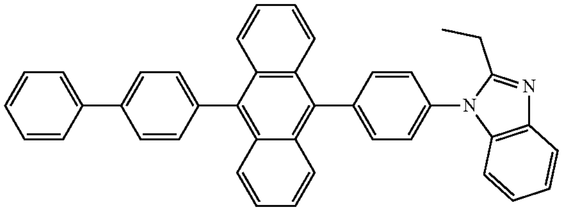

-continued

ET-3

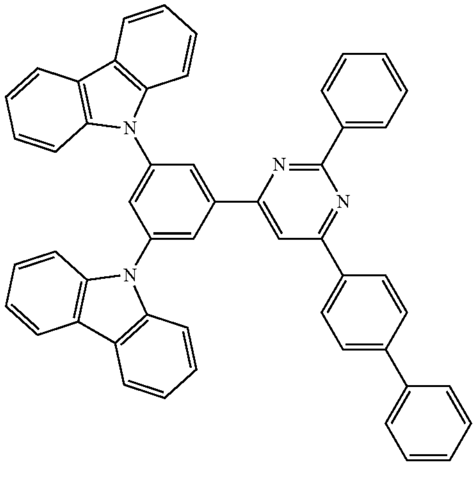

ET-4

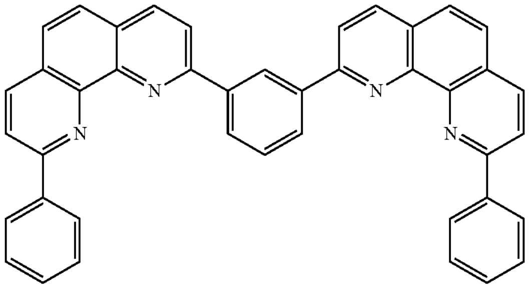

ET-5

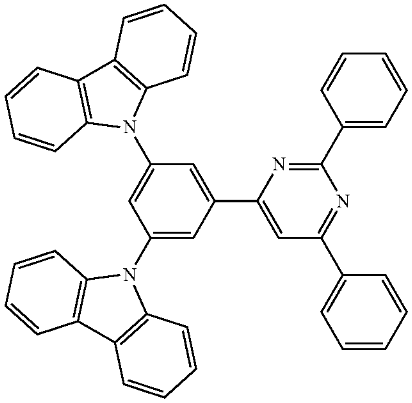

Example 1

<Fabrication of Organic EL Device>

A 25 mm×75 mm×1.1 mm-thick glass substrate with an ITO transparent electrode (anode) (manufactured by GEOMATEC Co., Ltd.) was subjected to ultrasonic cleaning in isopropyl alcohol for 5 minutes, and then subjected to UV-ozone cleaning for 30 minutes. The thickness of the ITO film was 130 nm.

The glass substrate with the transparent electrode after being cleaned was mounted onto a substrate holder in a vacuum vapor deposition apparatus. First, a compound HI-1 and a compound HT-1 were co-deposited on a surface on the side on which the transparent electrode was formed to be 3% by mass in a proportion of the compound HI-1 so as to cover the transparent electrode to form a hole-injecting layer having a thickness of 10 nm.

Next, the compound HT-1 was deposited on the hole-injecting layer to form an HT-1 film having a thickness of 75 nm. The HT-1 film functions as a hole-transporting layer (first hole-transporting layer).

Following the formation of the HT-1 film, a compound HT-2 was deposited on the HT-1 film to form an HT-2 film having a thickness of 15 nm. The HT-2 film functions as an electron-blocking layer (second hole-transporting layer).

A compound BH1-1 (first host material), a compound BH2-1 (second host material), and a compound BD-1 (dopant material) were co-deposited on the HT-2 film to form a BH1-1:BH2-1:BD-1 film having a thickness of 20 nm. The BH1-1:BH2-1:BD-1 film functions as an emitting layer. The mass ratio of the compounds BH1-1 and BH2-1 contained in the emitting layer are 1:1, and the concentration of the compound BD-1 is 2% by mass based on the total mass of the emitting layer.

A compound ET-1 was deposited on the emitting layer to form an ET-1 film having a thickness of 3 nm. The ET-1 film functions as a hole barrier layer (first electron-transporting layer).

A compound ET-2 and (8-quinolinolato)lithium (hereinafter also referred to as Liq) were co-deposited to form an ET-2:Liq film having a Liq proportion of 33% by mass and a thickness of 30 nm. The ET-2:Liq film functions as an electron-transporting layer (second electron-transporting layer). On the ET-2:Liq film, LiF and Yb were co-evaporated to form an LiF:Yb film having a Yb proportion of 50% and a thickness of 1 nm. Metal Al was deposited on the LiF:Yb film to form a metal cathode having a thickness of 50 nm to complete the fabrication of an organic EL device.

The device configuration of the organic EL device of Example 1 is schematically shown as follows.

ITO(130)/HT-1:HI-1(10; 3%)/HT-1(75)/HT-2(15)/BH1-1:BH2-1:BD-1(20; 2%)/ET-1(3)/ET-2:Liq(30; 33%)/LiF:Yb (1; 50%)/Al(50) The first values in each parentheses represent the film thickness (unit: nm) and the % values represent the mass % of the last described compound based on the total mass of the layer.

<Evaluation of Organic EL Device>

Initial characteristics of the obtained organic EL device was measured by DC (direct current)-constant current driving of 10 $mA/cm^2$ at room temperature. Voltage was applied to the obtained organic EL device so as to be 10 $mA/cm^2$ in the current density, and an EL emission spectrum was measured by using Spectroradiometer "CS-1000" (manufactured by Konica Minolta, Inc.). External quantum efficiency (EQE (unit: %)) was calculated from the resulting spectral radiance spectrum.

Voltage was applied to the obtained organic EL device so as to be 50 $mA/cm^2$ in the current density, and the time until the luminance decreased 95% of the initial luminance (LT95 (unit: hours)) was measured.

Evaluation results are shown in Table 1. The values in each parentheses represent a difference from Comparative Example 1 for the voltage, and the relative values with the results of Comparative Example 1 being 100% for the EQE and the LT95.

Example 2

An organic EL device was fabricated and evaluated in the same manner as in Example 1, except that the first host material and the second host material were mixed in advance (premixed) to prepare a composition, and then the composition and the dopant material were co-deposited to form an emitting layer. The results are shown in Table 1. The two materials (the first host material and the second host material) can be stably deposited from a single deposition source, and desired device performance can be obtained.

Examples 2-2 to 2-4

Organic EL devices were fabricated and evaluated in the same manner as in Example 2 (premix), except that the compounds described in Table 1 were used as the host materials of an emitting layer. The results are shown in Table 1.

Comparative Example 1 to 2

Organic EL devices were fabricated and evaluated in the same manner as in Example 1, except that the compounds described in Table 1 were used as the host materials of the emitting layer. The results are shown in Table 1.

TABLE 80

| | First host material | Second host material | Voltage (V) @ 10 mA/cm $^2$ | EQE (%) | LT95 (hr) |
|---|---|---|---|---|---|
| Ex. 1 | BH1-1 | BH2-1 | 3.50 (−0.35) | 10.0 (98%) | 100 (100%) |
| Ex. 2 (premix) | BH1-1 | BH2-1 | 3.52 (−0.33) | 10.0 (98%) | 100 (100%) |
| Comp. Ex. 1 | BH1-1 | | 3.85 (0.00) | 10.2 (100%) | 100 (100%) |
| Comp. Ex. 2 | | BH2-1 | 3.30 (−0.55) | 8.9 (87%) | 86 (86%) |
| Ex. 2-2 (premix) | BH1-1 | BH2-8 | 3.50 (−0.35) | 10.0 (98%) | 140 (140%) |
| Ex. 2-3 (premix) | BH1-1 | BH2-9 | 3.50 (−0.35) | 10.0 (98%) | 145 (145%) |
| Ex. 2-4 (premix) | BH1-6 | BH2-3D | 3.60 (−0.25) | 10.0 (98%) | 160 (160%) |

Example 3

<Fabrication of Organic EL Device>

A 25 mm×75 mm×1.1 mm-thick glass substrate with an ITO transparent electrode (anode) (manufactured by GEOMATEC Co., Ltd.) was subjected to ultrasonic cleaning in isopropyl alcohol for 5 minutes, and then subjected to UV-ozone cleaning for 30 minutes. The thickness of the ITO film was 130 nm.

The glass substrate with the transparent electrode after being cleaned was mounted onto a substrate holder in a vacuum vapor deposition apparatus. First, a compound HI-2 was deposited on a surface on the side on which the transparent electrode was formed so as to cover the transparent electrode to form a hole-injecting layer having a thickness of 5 nm.

Next, a compound HT-3 was deposited on the hole-injecting layer of the HI-2 layer to form an HT-3 film having a thickness of 80 nm. The HT-3 film functions as a hole-transporting layer (first hole-transporting layer).

Following the formation of the HT-3 film, a compound HT-4 was deposited on the HT-3 film to form an HT-4 film having a thickness of 10 nm. The HT-4 film functions as an electron-blocking layer (second hole-transporting layer).

A compound BH1-2 (first host material), a compound BH2-1 (second host material), and a compound BD-1 (dopant material) were co-deposited on the HT-4 film to form a BH1-2:BH2-1:BD-1 film having a thickness of 25 nm. The BH1-2:BH2-1:BD-1 film functions as an emitting layer. The mass ratio of the compounds BH1-2 and BH2-1 contained in the emitting layer are 1:1, and the concentration of the compound BD-1 is 2% by mass based on the total mass of the emitting layer.

A compound ET-3 was deposited on the emitting layer to form an ET-3 film having a thickness of 10 nm. The ET-3 film functions as a hole barrier layer (first electron-transporting layer).

Co-deposition of a compound ET-4 and Li were carried out to form an ET-4:Li film having a Li proportion of 4% by mass and a thickness of 15 nm. The ET-4:LI film functions as an electron-transporting layer.

Metal Al was deposited on the ET-4:Li film to form a metal cathode having a thickness of 50 nm to complete the fabrication of an organic EL device.

The device configuration of the organic EL device of Example 3 is schematically shown as follows.

ITO(130)/HI-2(5)/HT-3(80)/HT-4(10)/BH1-2:BH2-1:BD-1(25; 2%)/ET-3(10)/ET-4:Li(15; 4%)/Al(50)

The first values in each parentheses represent the film thickness (unit: nm) and the % values represent the mass % of the last described compound based on the total mass of the layer.

<Evaluation of Organic EL Device>

The obtained organic EL device was evaluated in the same manner as in Example 1. Evaluation results are shown in Table 2.

The values in each parentheses in Table 2 represent a difference from Comparative Example 3 for the voltage, and relative values with the result of Comparative Example 3 being 100% for the EQE and the LT95.

Comparative Examples 3 to 4

Organic EL devices were fabricated and evaluated in the same manner as in Example 3, except that the compounds described in Table 2 were used as the host materials of the emitting layer. The results are shown in Table 2.

TABLE 81

| | First host material | Second host material | Voltage (V) @ 10 mA/cm $^2$ | EQE (%) | LT95 (hr) |
|---|---|---|---|---|---|
| Ex. 3 | BH1-2 | BH2-1 | 3.52 (−0.20) | 9.9 (100%) | 125 (236%) |
| Comp. Ex. 3 | BH1-2 | | 3.72 (0.00) | 9.9 (100%) | 53 (100%) |
| Comp. Ex. 4 | | BH2-1 | 3.46 (−0.26) | 8.3 (83%) | 163 (294%) |

Example 4

An organic EL device was fabricated and evaluated in the same manner as in Example 1, except that the compounds described in Table 3 were used as the host materials of the emitting layer. The results are shown in Table 3. The values in each parentheses in Table 3 represent a difference from Comparative Example 5 for the voltage, and relative values with the result of Comparative Example 5 being 100% for the EQE and the LT95.

Comparative Example 5

An organic EL device was fabricated and evaluated in the same manner as in Example 1, except that the compounds described in Table 3 were used as the host materials of the emitting layer. The results are shown in Table 3.

Examples 2-5 and 2-6

Organic EL devices were fabricated and evaluated in the same manner as in Example 2 (premix), except that the compounds described in Table 3 were used as the host materials of an emitting layer. The results are shown in Table 3.

TABLE 82

| | First host material | Second host material | Voltage (V) @ 10 m A/cm 2 | EQE (%) | LT95 (hr) |
|---|---|---|---|---|---|
| Ex. 4 | BH1-3 | BH2-2 | 3.52 (−0.13) | 10.2 (101%) | 105 (117%) |
| Comp. Ex. 5 | BH1-3 | | 3.65 (0.00) | 10.1 (100%) | 90 (100%) |
| Ex. 2-5 (premix) | BH1-3 | BH2-10 | 3.52 (−0.13) | 10.2 (101%) | 120 (133%) |
| Ex. 2-6 (premix) | BH1-7 | BH2-10 | 3.52 (−0.13) | 10.2 (101%) | 140 (156%) |

Example 5

An organic EL device was fabricated and evaluated in the same manner as in Example 1, except that the compounds described in Table 4 were used as the host materials of the emitting layer. The results are shown in Table 4. The values in each parentheses in Table 4 represent a difference from Comparative Example 6 for the voltage, and relative values with the result of Comparative Example 6 being 100% for the EQE and the LT95.

Comparative Example 6 to 7

Organic EL devices were fabricated and evaluated in the same manner as in Example 1, except that the compounds described in Table 4 were used as the host materials of the emitting layer. The results are shown in Table 4.

TABLE 83

| | First host material | Second host material | Voltage (V) @ 10 m A/cm 2 | EQE (%) | LT95 (hr) |
|---|---|---|---|---|---|
| Ex. 5 | BH1-4 | BH2-1 | 3.48 (−0.35) | 10.0 (100%) | 125 (100%) |
| Comp. Ex. 6 | BH1-4 | | 3.83 (0.00) | 10.0 (100%) | 125 (100%) |
| Comp. Ex. 7 | | BH2-1 | 3.27 (−0.56) | 8.6 (86%) | 80 (64%) |

Example 6

An organic EL device was fabricated and evaluated in the same manner as in Example 1, except that the compounds described in Table 5 were used as the host materials of the emitting layer. The results are shown in Table 5. The values in each parentheses in Table 5 represent a difference from Comparative Example 8 for the voltage, and relative values with the result of Comparative Example 8 being 100% for the EQE and the LT95.

Comparative Example 8

An organic EL device was fabricated and evaluated in the same manner as in Example 1, except that the compounds described in Table 5 were used as the host materials of the emitting layer. The results are shown in Table 5.

TABLE 84

| | First host material | Second host material | Voltage (V) @ 10 m A/cm 2 | EQE (%) | LT95 (hr) |
|---|---|---|---|---|---|
| Ex. 6 | BH1-5 | BH2-2 | 3.54 (−0.14) | 10.2 (101%) | 115 (105%) |
| Comp. Ex. 8 | BH1-5 | | 3.68 (0.00) | 10.1 (100%) | 110 (100%) |

Example 7

<Fabrication of Organic EL Device>

A 25 mm×75 mm×1.1 mm-thick glass substrate with an ITO transparent electrode (anode) (manufactured by GEOMATEC Co., Ltd.) was subjected to ultrasonic cleaning in isopropyl alcohol for 5 minutes, and then subjected to UV-ozone cleaning for 30 minutes. The thickness of the ITO film was 130 nm.

The glass substrate with the transparent electrode after being cleaned was mounted onto a substrate holder in a vacuum vapor deposition apparatus. First, a compound HI-1 and a compound HT-5 were co-deposited on a surface on the side on which the transparent electrode was formed so as to be 3% by mass in a proportion of the compound HI-1 so as to cover the transparent electrode to form a hole-injecting layer having a thickness of 10 nm.

Next, a compound HT-5 was deposited on the hole-injecting layer to form an HT-5 film having a thickness of 75 nm. The HT-5 film functions as a hole-transporting layer (first hole-transporting layer).

Following the formation of the HT-5 film, a compound HT-2 was deposited on the HT-5 film to form an HT-2 film having a thickness of 15 nm. The HT-2 film functions as an electron-blocking layer (second hole-transporting layer).

A compound BH1-1 (first host material), a compound BH2-1 (second host material), and a compound BD-1 (dopant material) were co-deposited on the HT-2 film to form a BH1-1:BH2-1:BD-1 film having a thickness of 20 nm. The BH1-1:BH2-1:BD-1 film functions as an emitting layer. The concentrations of BH1-1, BH2-1, and BD-1 contained in the emitting layer are 58.8% by mass, 39.2% by mass, and 2% by mass, respectively, based on the total mass of the emitting layer. The mass ratio of the compounds BH1-1:BH2-1 contained in the emitting layer is 6:4.

Note that the above-described emitting layer was formed by using a composition in which the first host material BH1-1 and the second host material BH2-1 were mixed in advance (premixed), and co-depositing the composition and the dopant material BD-1. The two materials (the first host material and the second host material) can be stably deposited from a single deposition source.

A compound ET-5 was deposited on the emitting layer to form an ET-5 film having a thickness of 3 nm. The ET-5 film functions as a hole barrier layer (first electron-transporting layer).

Co-deposition of a compound ET-2 and (8-quinolinolato) lithium (hereinafter also referred to as Liq) were carried out to form an ET-2:Liq film having a Liq proportion of 33% by mass and a thickness of 30 nm. The ET-2:Liq film functions as an electron-transporting layer (second electron-transporting layer). On the ET-2:Liq film, LiF and Yb were co-evaporated to form an LiF:Yb film having a Yb proportion of 50% and a thickness of 1 nm. Metal Al was deposited on the LiF:Yb film to form a metal cathode having a thickness of 50 nm to complete the fabrication of an organic EL device.

The device configuration of the organic EL device of Example 7 is schematically shown as follows.

ITO(130)/HT-5:HI-1(10; 3%)/HT-5(75)/HT-2(15)/BH1-1:BH2-1:BD-1(20; 58.8%:39.2%:2%)/ET-5(3)/ET-2:Liq (30; 33%)/LiF:Yb(1; 50%)/Al(50) The first values in each parentheses represent the film thickness (unit: nm) and the % value represent the mass % of the last described compound based on the total mass of the layer, or the mass % of each compound contained in the layer.

<Evaluation of Organic EL Device>

Voltage was applied to the obtained organic EL device so that the current density became 50 mA/cm$^2$, and the time until the luminance decreased 90% of the initial luminance (LT90 (unit: hours)) was measured. Evaluation results are shown in Table 6.

Examples 8 to 10

Organic EL devices were fabricated and evaluated in the same manner as in Example 7, except that the compounds described in Table 6 were used as the host materials of the emitting layer. The results are shown in Table 6.

TABLE 85

| | First host material | Second host material | LT90 (hr) |
|---|---|---|---|
| Ex. 7 (premix) | BH1-1 | BH2-1 | 269 |
| Ex. 8 (premix) | BH1-1 | BH2-1D | 285 |
| Ex. 9 (premix) | BH1-1 | BH2-3 | 280 |
| Ex. 10 (premix) | BH1-1 | BH2-3D | 301 |

Examples 11 and 12

Organic EL devices were fabricated in the same manner as in Example 7, except that the first host material and the second host material described in Table 7 were used as the host material of the emitting layer in the proportions described in Table 7, and evaluated in the same manner as in Example 1. The results are shown in Table 7.

TABLE 86

| | First host material | Second host material | Mass ratio of first and second host material | Voltage (V) @ 10 mA/cm$^2$ | EQE (%) | LT95 (hr) |
|---|---|---|---|---|---|---|
| Ex. 11 (premix) | BH 1-3 | BH 2-5 | 5:5 | 3.52 | 9.77 | 80 |
| Ex. 12 (premix) | BH 1-3 | BH 2-6 | 5:5 | 3.51 | 9.7 | 71 |

Examples 13 to 15

Organic EL devices were fabricated in the same manner as in Example 7, except that the first host material and the second host material described in Table 8 were used as the host material of the emitting layer in the proportions described in Table 8, and evaluated in the same manner as in Example 1. The results are shown in Table 8.

TABLE 87

| | First host material | Second host material | Mass ratio of first and second host material | Voltage (V) @ 10 mA/cm$^2$ | EQE (%) | LT95 (hr) |
|---|---|---|---|---|---|---|
| Ex. 13 (premix) | BH 1-3 | BH 2-7 | 7:3 | 3.48 | 9.56 | 111 |
| Ex. 14 (premix) | BH 1-3 | BH 2-7 | 5:5 | 3.39 | 9.55 | 102 |
| Ex. 15 (premix) | BH 1-3 | BH 2-7 | 3:7 | 3.34 | 9.10 | 104 |

Example A

<Fabrication of an Organic EL Device Using a Compound Represented by the Formula (3-2) as a Single Host Material>

A 25 mm×75 mm×1.1 mm-thick glass substrate with an ITO transparent electrode (anode) (manufactured by GEOMATEC Co., Ltd.) was subjected to ultrasonic cleaning in isopropyl alcohol for 5 minutes, and then subjected to UV-ozone cleaning for 30 minutes. The thickness of the ITO film was 130 nm.

The glass substrate with the transparent electrode after being cleaned was mounted onto a substrate holder in a vacuum vapor deposition apparatus. First, a compound HI-2 was deposited on a surface on the side on which the transparent electrode was formed so as to cover the transparent electrode to form a hole-injecting layer having a thickness of 5 nm.

Next, a compound HT-6 was deposited on the hole-injecting layer to form an HT-6 film having a thickness of 80 nm. The HT-6 film functions as a hole-transporting layer (first hole-transporting layer).

Following the formation of the HT-6 film, a compound HT-7 was deposited on the HT-6 film to form an HT-7 film having a thickness of 10 nm. The HT-7 film functions as an electron-blocking layer (second hole-transporting layer).

A compound BH2-1 D (host material) and a compound BD-2 (dopant material) were co-deposited on the HT-7 film to form a BH2-1D:BD-2 film having a thickness of 25 nm. The BH2-1D:BD-2 film functions as an emitting layer. The concentration of BD-2 contained in the emitting layer was 4% by mass based on the total mass of the emitting layer.

A compound ET-5 was deposited on the emitting layer to form an ET-5 film having a thickness of 10 nm. The ET-5 film functions as a hole barrier layer (first electron-transporting layer).

A compound ET-2 was deposited to form an ET-2 film having a thickness of 15 nm. The ET-2 film functions as an electron-transporting layer (second electron-transporting layer). LiF was deposited on the ET-2 film to form a LiF film having a thickness of 1 nm. Metal Al was deposited on the LiF film to form a metal cathode having a thickness of 80 nm to complete the fabrication of an organic EL device.

The device configuration of the organic EL device of Example A is schematically shown as follows.

ITO(130)/HI-2(5)/HT-6(80)/HT-7(10)/BH2-1 D:BD-2 (25; 4%)/ET-5(10)/ET-2(15)/LiF(1)/Al(80)

The first values in each parentheses represent the film thickness (unit: nm) and the % values represent the mass % of the last described compound based on the total mass of the layer.

<Evaluation of Organic EL Device>

Voltage was applied to the obtained organic EL device so that the current density became 50 mA/cm$^2$, and the time until the luminance decreased 90% of the initial luminance (LT90 (unit: hours)) was measured. Evaluation results are shown in Table 9.

Comparative Example B

An organic EL device was fabricated and evaluated in the same manner as in Example A, except that the compound described in Table 88 was used as a host material of the emitting layer. The results are shown in Table 88.

TABLE 88

| | Host material | LT90 (hr) |
|---|---|---|
| Ex. A | BH2-1D | 222 |
| Comp. Ex. B | Ref. BH2-4D | 125 |

From the results shown in Table 88, it can be seen that Comparative Example B using the compound Ref. BH2-4D in which the bonding position of naphthobenzofuran to the anthracene unit differs from the compound BH2-1 D has inferior device lifetime as compared with Example A.

Synthesis of Compounds

Synthesis Example 1: Synthesis of Compound BH2-2

A compound BH2-2 was synthesized in accordance with the following synthetic scheme.

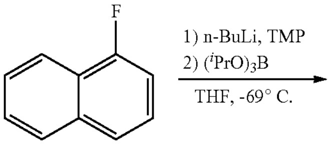

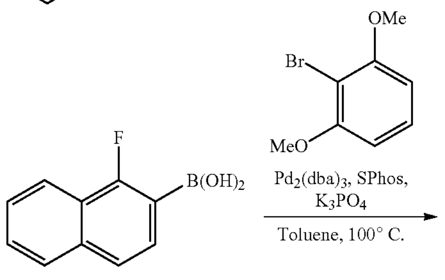

Intermediate 1

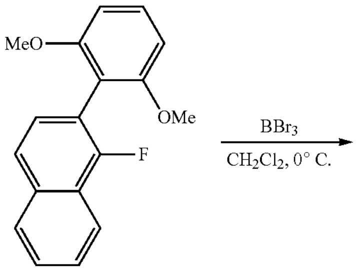

Intermediate 2

-continued

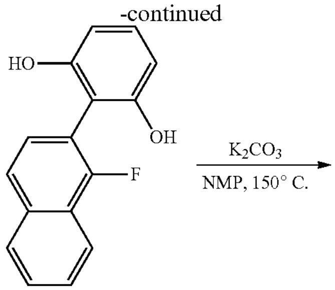

Intermediate 3

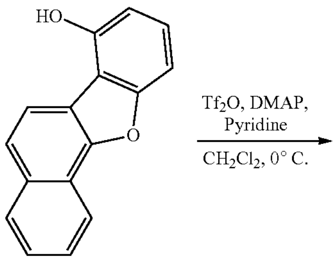

Intermediate 4

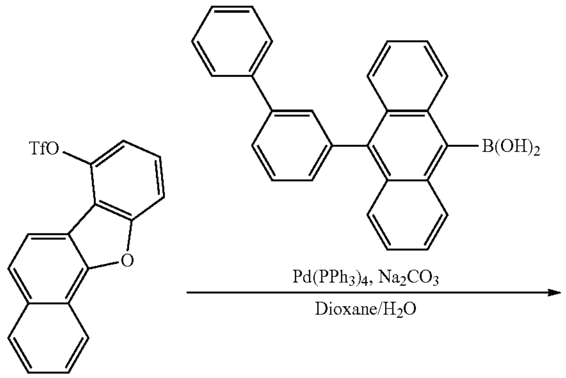

Intermediate 5

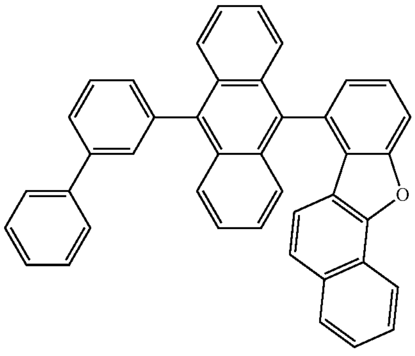

BH2-2

(1) Synthesis of (1-fluoronaphthalen-2-yl)boronic acid (Intermediate 1)

Under an argon atmosphere, 7.2 g of 2,2,6,6-tetramethylpiperidine and 60 mL of tetrahydrofuran (dehydrated) were placed in a flask and cooled to −43° C. Then 33 mL of n-BuLi (1.55 M in hexane) was added thereto, and the mixture was stirred at −40° C. for 30 minutes. The mixture was then cooled to −69° C., 16.0 mL of ($^i$PrO)$_3$B was added, and the mixture was stirred at −78° C. for 5 minutes, then 20 mL of a THF solution in which 5.00 g of 1-fluoronaphthalene was dissolved was added dropwise thereto, and the mixture was stirred in an ice bath for 10 hours. After completion of the reaction, 1 N HCl aq. (100 mL) was added thereto and the mixture was stirred at room temperature for 1 hours. The mixture was then transferred to a separatory funnel and extracted with ethyl acetate. The ethyl acetate solution was dried over anhydrous magnesium sulfate, concentrated, and washed with hexane to obtain 6.13 g (yield: 71%) of a white solid of (1-fluoronaphthalen-2-yl)boronic acid (Intermediate 1).

(2) Synthesis of 2-(2,6-dimethoxyphenyl)-1-fluoronaphthalene (Intermediate 2)

Under an argon atmosphere, 4.52 g of (1-fluoronaphthalen-2-yl)boronic acid (Intermediate 1), 4.30 g of 2-bromo-1,3-dimethoxybenzene, 0.91 g of tris(dibenzylideneacetone) dipaladium(0), 0.81 g of 2-dicyclohexylphosphino-2',6'-dimethoxybiphenyl (SPhos), 12.6 g of tripotassium phosphate, and 10 mL of toluene (dehydrated) were placed in a flask and the mixture was refluxed with heating and stirring for 7 hours. After cooling to room temperature, the reaction solution was extracted using toluene, and after removing the aqueous phase, the organic phase was washed with saturated brine. The organic phase was dried over anhydrous sodium sulfate, then concentrated, and the residue was purified by silica gel column chromatography to obtain 4.70 g (yield: 84%) of 2-(2,6-dimethoxyphenyl)-1-fluoronaphthalene (Intermediate 2).

(3) Synthesis of 2-(1-fluoronaphthalen-2-yl)benzene-1,3-diol (Intermediate 3)

Under an argon atmosphere, 4.70 g of 2-(2,6-dimethoxyphenyl)-1-fluoronaphthalene (Intermediate 2) and 210 mL of dichloromethane (dehydrated) were placed in a flask and cooled to 0° C. 41 mL of a 1.0 mol/L solution of boron tribromide in dichloromethane was added to the mixture, and the mixture was stirred at room temperature for 4 hours. After completion of the reaction, the solution was cooled to −78° C., carefully deactivated with methanol, and further deactivated with a sufficient amount of water. The solution was transferred to a separatory funnel, extracted with dichloromethane, and dried over anhydrous sodium sulfate, followed by removal of the origin impurity through a silica gel short column. The solution was concentrated, and the obtained sample was dried under vacuum at room temperature for 3 hours to obtain 4.00 g (94%) of a transparent oil of 2-(3-fluoronaphthalen-2-yl)benzen-1,3-diol (Intermediate 3).

(4) Synthesis of naphtho[1,2-b]benzofuran-7-ol (Intermediate 4)

Under an argon-atmosphere, 4.00 g of 2-(3-fluoronaphthalen-2-yl)benzene-1,3-diol (Intermediate 3), 15 mL of N-methyl-2-pyrrolidinone (dehydrated), and 3.26 g of $K_2CO_3$ were placed in a flask and then stirred at 150° C. for 2 hours. After completion of the reaction, the solution was cooled to room temperature, ethyl acetate (200 mL) was added thereto, and the solution was transferred to a separatory funnel and washed with water. This solution was dried over anhydrous sodium sulfate, and then purified by silica gel column chromatography to obtain 1.25 g (yield: 34%) of a white solid of naphtho[1,2-b]benzofuran-7-ol (Intermediate 4).

(5) Synthesis of naphtho[1,2-b]benzofuran-7-yl trifluoromethanesulfonate (Intermediate 5)

Under an argon atmosphere, 1.25 g of naphtho[1,2-b]benzofuran-7-ol (Intermediate 4), 65 mg of N,N-dimethyl-4-aminopyridine, 1.08 mL of trifluoromethanesulfonic anhydride, and 27 mL of dichloromethane (dehydrated) were placed in a flask and cooled to 0° C. 10.6 mL of pyridine (dehydrated) was added dropwise thereto, and then the mixture was stirred at room temperature for 2 hours. After completion of the reaction, the mixture was deactivated with a sufficient amount of water. The solution was transferred to a separatory funnel, extracted with dichloromethane, dried over anhydrous sodium sulfate, and then passed through a silica gel short column to remove the origin impurities. The solution was concentrated, and the obtained sample was dried under vacuum at room temperature for 3 hours to obtain 1.50 g (77%) of a white solid of naphtho[1,2-b]benzofuran-7-yl trifluoromethanesulfonate (Intermediate 5).

(5) Synthesis of anthracene derivative (Compound BH2-2)

Under an argon atmosphere, 4.09 g of [1,2-b]benzofuran-7-yl trifluoromethanesulfonate (Intermediate 5), 4.09 g of (3-(10-phenylanthracen-9-yl)phenyl)boronic acid synthesized by a known method, 0.19 g of tetrakis(triphenylphosphine)palladium(0), 0.87 g of sodium carbonate, 30 mL of 1,4-dioxane, and 10 mL of ion-exchanged water were placed in a flask, and the mixture was refluxed with stirring for 4 hours. After cooling to room temperature, precipitated solid was collected by filtration. The resulting solid was washed with water and then acetone, followed by recrystallization with a mixed solvent of acetonitrile and hexane to obtain 1.41 g of a white solid.

As the result of the mass spectrum analysis, this white solid has an m/e of 546, thereby it was confirmed to be a compound BH2-2 having a molecular weight of 546.20.

Synthesis Example 2: Synthesis of Compound BH2-1 D

A compound BH2-1D (a compound represented by the formula (3-2)) was synthesized in accordance with the following synthetic scheme.

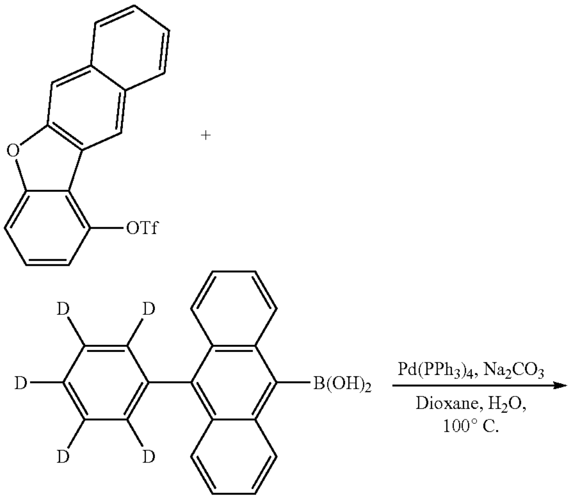

-continued

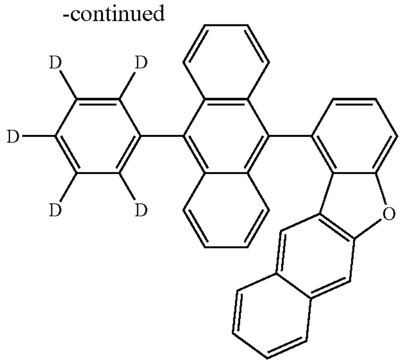

BH2-1D

Under an argon atmosphere, 0.97 g of naphtho[2,3-b] benzofuran-1-yl trifluoromethanesulfonate, 0.80 g of (10-(phenyl-$d_5$)anthracen-9-yl)boronic acid synthesized by a known method, 0.12 g of tetrakis(triphenylphosphine)palladium(0) ($Pd(PPh_3)_4$), 2.11 g of sodium carbonate, 25 mL of 1,4-dioxane, and 10 mL of ion-exchanged water were placed in a flask, and the mixture was refluxed with stirring at 100° C. for 18 hours. After cooling the reaction solution to room temperature, a precipitated solid was collected by filtration. The resulting solid was washed with water and then acetone, followed by recrystallization with a mixed solvent of toluene and cyclohexane to obtain 0.82 (66%) of a pale yellow solid. As the result of the mass spectrum analysis, this pale yellow solid has an m/e of 476, thereby it was confirmed to be a compound BH2-1 D having a molecular weight of 475.60.

Synthesis Example 3: Synthesis of Compound BH2-5D

A compound BH2-5D (a compound represented by the formula (3-1)) was synthesized in accordance with the following synthetic scheme.

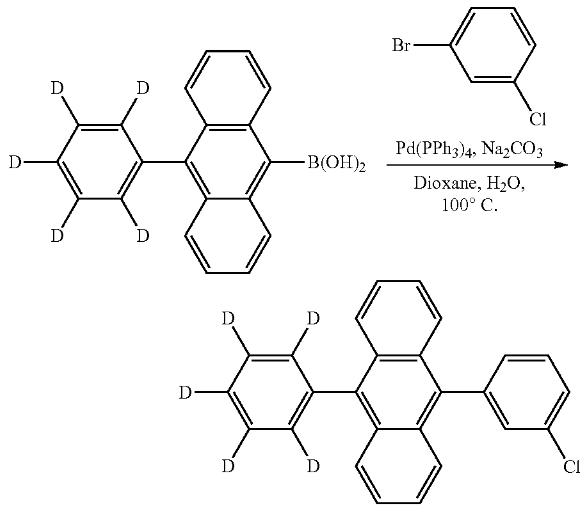

Intermediate 6

(1) Synthesis of 9-(3-chlorophenyl)-10-(phenyl-$d_5$) anthracene (Intermediate 6)

Under an argon atmosphere, 5.00 g of (10-(phenyl-$d_5$) anthracen-9-yl)boronic acid synthesized by a known method, 0.95 g of tetrakis(triphenylphosphine)palladium(0), 2.62 g of sodium carbonate, 80 mL of 1.4-dioxane, and 15 mL of ion-exchanged water were placed in a flask, and the mixture was refluxed with stirring at 100° C. for 8 hours. Water was added to the reaction solution, followed by extraction using toluene. The extract was dried over anhydrous sodium sulfate, and then the solvent was distilled off under reduced pressure. The residue was purified by silica gel column chromatography (hexane/toluene=3/1-1/1) to obtain 4.39 g (72%) of a pale yellow solid. As the result of the mass spectral analysis, this pale yellow solid has an m/e of 370, thereby it was confirmed to be an Intermediate 6 having a molecular weight of 369.90.

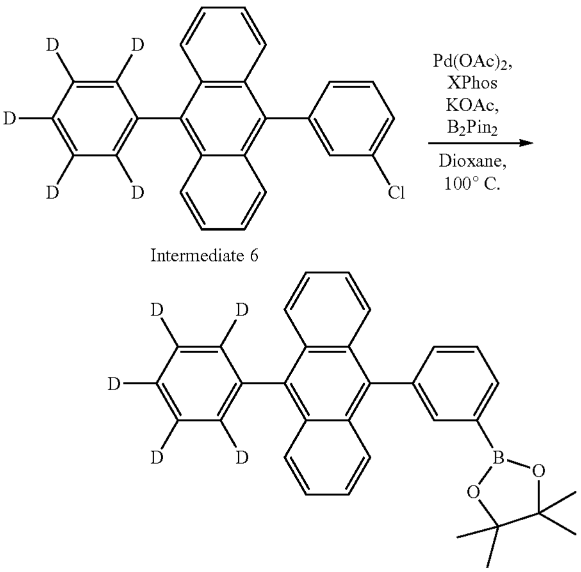

Intermediate 6

Intermediate 7

(2) Synthesis of 4,4,5,5-tetramethyl-2-(3-(10-(phenyl-d5)anthracen-9-yl)-1,3,2-dioxaborane (Intermediate 7)

Under an argon atmosphere, 5.00 g of 9-(3-chlorophenyl)-10-(phenyl-d5)anthracene (Intermediate 6) synthesized in (1) above, 0.13 g of palladium acetate (2), 0.29 g of Xphos, 2.33 g of potassium acetate, 3.62 g of bis(pinacolate)diboron, and 60 mL of 1,4-dioxane were refluxed with stirring at 100° C. for 8 hours. Water was added to the reaction solution, followed by extraction using toluene. The extract was dried over anhydrous sodium sulfate, and then the solvent was distilled off under reduced pressure. The residue was purified by silica gel column chromatography (hexane/toluene=1/1 to 1/2) to obtain 3.72 g (68%) of a pale yellow solid. As the result of the mass spectral analysis, this pale yellow solid has an m/e of 462, thereby it was confirmed to be an Intermediate 7 having a molecular weight of 461.42.

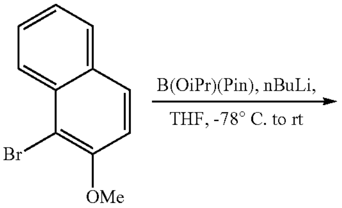

-continued

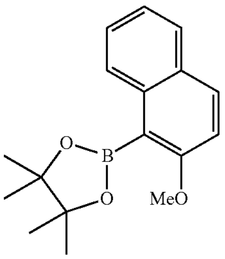

Intermediate 8

(3) Synthesis of 2-(2-methoxynaphthalene)-4,4,5,5-tetramethyl-1,3,2-dioxaborane (Intermediate 8)

Under an argon atmosphere, 800 mL of a solution of 20.0 g of 1-bromo-2-methoxynaphthalene in THF was cooled to −78° C., and 56.0 mL of n-butyllithium (1.6 M hexane solution) was added thereto dropwise over 10 minutes. Then, the mixture was stirred at the same temperature for 30 minutes. To this solution, 20.0 mL of 2-isopropoxy-4,4,5,5-tetramethyl-1,3,2-dioxaborolane (B(OiPr)(Pin)) was added, and the mixture was stirred at room temperature for 4 hours. Water was added to the reaction solution, followed by extraction using ethyl acetate. The extract was dried over anhydrous sodium sulfate, and then the solvent was distilled off under reduced pressure. The residue was purified by silica gel column chromatography (hexane/ethyl acetate=30/1 to 3/1) to obtain 16.3 g (54%) of a pale yellow solid. As the result of the mass spectral analysis, this pale yellow solid has an m/e of 285, thereby it was confirmed to be an Intermediate 8 having a molecular weight of 284.16.

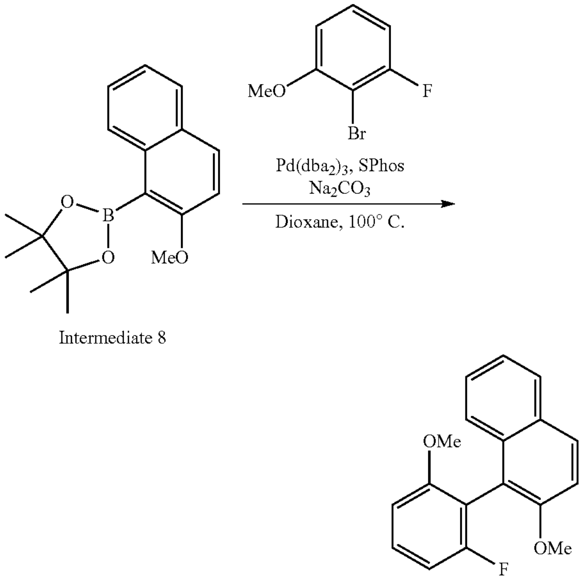

Intermediate 8

Intermediate 9

(4) Synthesis of 1-(2-fluoro-6-methoxyphenyl)-2-methoxynaphthalene (Intermediate 9)

Under an argon atmosphere, 13.2 g of 2-(2-methoxynaphthalene)-4,4,5,5-tetramethyl-1,3,2-dioxaborane (Intermediate 8), 9.00 g of 2-bromo-1-fluoro-3-methoxybenzene, 2.00 g of tris(dibenzylideneacetone)dipalladium(0), 2.0 g of Sphos, 7.00 g of sodium carbonate, 400 mL of 1,4-dioxane, and 40 mL of ion-exchanged water were placed in a flask, and the mixture was refluxed with stirring at 100° C. for 12 hours. Water was added to the reaction solution, followed by extraction using ethyl acetate. The extract was dried over anhydrous sodium sulfate, and then the solvent was distilled off under reduced pressure. The residue was purified by silica gel column chromatography (hexane/ethyl acetate=1/1) to obtain 5.81 g (47%) of a white solid. As the result of the mass spectral analysis, this white solid has an m/e of 283, thereby it was confirmed to be an Intermediate 9 having a molecular weight of 282.31.

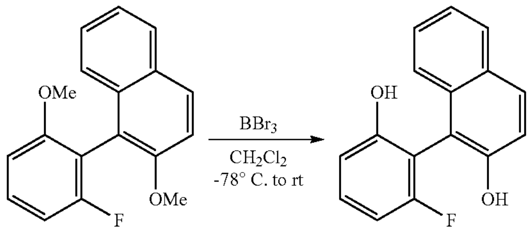

Intermediate 9 Intermediate 10

(5) Synthesis of 1-(2-fluoro-6-hydroxyphenyl)-2-hydroxynaphthalene (Intermediate 10)

Under an argon atmosphere, 150 mL of a solution of 4.00 g of 1-(2-fluoro-6-methoxyphenyl)-2-methoxynaphthalene (Intermediate 9) in dichloromethane was cooled to −78° C., and 30 mL of boron tribromide (1.0 M dichloromethane solution) was added thereto dropwise over 30 minutes, and the mixture was stirred at room temperature for 2 hours. A saturated solution of sodium bicarbonate was added thereto, and the mixture was stirring for 10 minutes. The organic phase was separated by Phase separator and concentrated under reduced pressure. The residue was purified by silica gel column chromatography (hexane/ethyl acetate=9/1-0/10) to obtain 3.23 g (93%) of a white solid. As the result of the mass spectrum analysis, this white solid has an m/e of 255, thereby it was confirmed to be an Intermediate 10 having a molecular weight of 254.16.

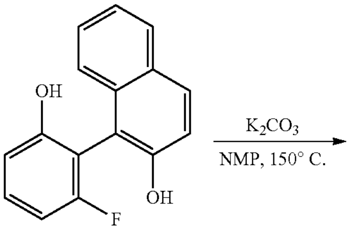

Intermediate 10

-continued

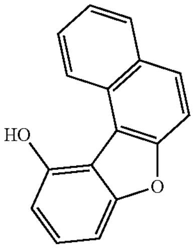

Intermediate 11

(6) Synthesis of naphtho[2,1-b]benzofuran-11-ol (Intermediate 11)

Under an argon atmosphere, 3.23 g of 1-(2-fluoro-6-hydroxyphenyl)-2-hydroxynaphthalene (Intermediate 10) and 420 mL of a solution of 1.74 g of potassium carbonate in MNP were placed in a flask, and the mixture was refluxed with stirring at 150° C. for 12 hours. Water was added to the reaction solution, followed by extraction using ethyl acetate. The extract was dried over sodium sulfate, and then the solvent was distilled off under reduced pressure. The residue was purified by silica gel column chromatography (hexane/ethyl acetate=3/1-1/1) to obtain 2.56 g (87%) of a white solid. As the result of the mass spectrum analysis, this white solid has an m/e of 235, thereby it was confirmed to be an Intermediate 11 having a molecular weight of 234.25.

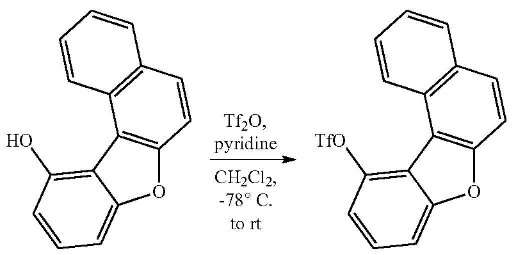

Intermediate 11 Intermediate 12

(7) Synthesis of naphtho[2,1-b]benzofuran-11-trifluoromethanesulfonate (Intermediate 12)

Under an argon atmosphere, 55 mL of a solution of 2.56 g of naphtho[2,1-b]benzofuran-11-ol (Intermediate 11) in dichloromethane was cooled to −78° C., 1.1 mL of pyridine and 3.70 g of trifluoromethanesulfonic anhydride ($Tf_2O$) were added thereto, and the mixture was stirred at room temperature for 2 hours. A solution of saturated sodium bicarbonate was added thereto, followed by stirring for 10 minutes. The organic phase was separated by Phase separator and concentrated under reduced pressure. The residue was purified by silica gel column chromatography (hexane/ethyl acetate=9/1) to obtain 3.80 g (95%) of a white solid of an Intermediate 12. As the result of the mass spectrum analysis, this white solid has an m/e of 366, thereby it was confirmed to be an Intermediate 12 having a molecular weight of 366.31.

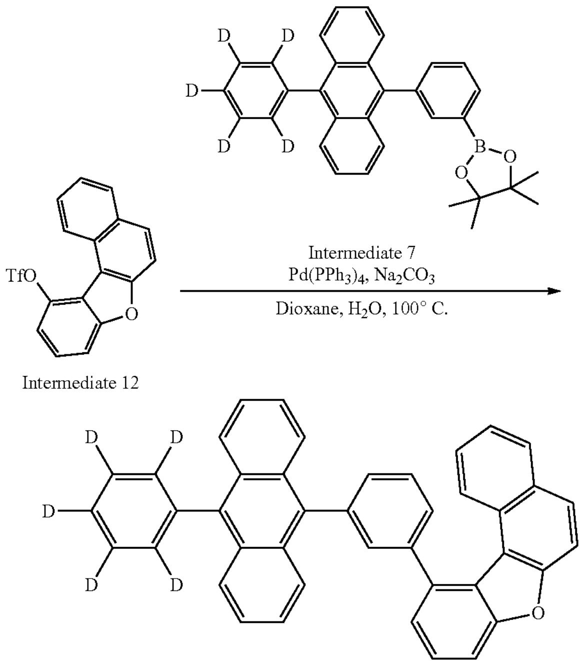

Intermediate 12

BH2-5D (8) Synthesis of an anthracene derivative (Compound BH2-5D)

Under an argon atmosphere, 2.00 g of naphtho[2,1-b]benzofuran-11-trifluoromethanesulfonate (Intermediate 12), 2.52 g of 4,4,5,5-tetramethyl-2-(3-(10-(phenyl-d5)anthracen-9-yl)-1,3,2-dioxaborane (Intermediate 7), 0.32 g of tetrakis(triphenylphosphine)palladium(0), 1.73 g of sodium carbonate, 30 mL of 1.4-dioxane, and 10 mL of ion-exchanged water were placed in a flask, and the mixture was refluxed with stirring at 100° C. for 18 hours. After cooling the reaction solution to room temperature, a precipitated solid was collected by filtration. The resulting solid was washed with water and then acetone, followed by recrystallization with a mixed solvent of toluene and cyclohexane to obtain 2.02 g (67%) of a pale yellow solid. As the result of the mass spectral analysis, this pale yellow solid has an m/e of 552, thereby it was confirmed to be a Compound BH2-5D having a molecular weight of 551.70.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The invention claimed is:

1. An organic electroluminescence device comprising:

a cathode;

an anode; and at least one emitting layer disposed between the cathode and the anode, wherein the emitting layer comprises a first host material, a second host material, and a dopant material, the first host material is a compound represented by the following formula (1), the second host material is a compound represented by the following formula (2), and the first host material and the second host material are different compounds:

(1)

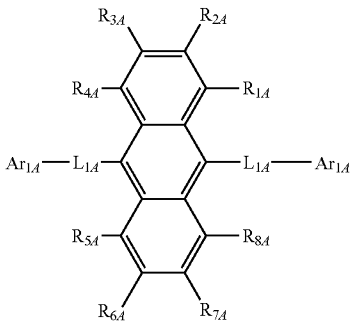

wherein in the formula (1), $R_{1A}$ to $R_{8A}$ are independently a hydrogen atom, a substituent R, or a group represented by the following formula (1A);

the substituent R is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—($R_{904}$),

—S—($R_{905}$),

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

when two or more of the substituents R are present, the two or more of the substituents R may be the same as or different from each other;

$L_{1A}$'s are independently a single bond, a substituted or unsubstituted arylene group including 6 to 50 ring carbon atoms, or a substituted or unsubstituted divalent heterocyclic group including 5 to 50 ring atoms;

$Ar_{1A}$'s are independently a substituted or unsubstituted aryl group including 6 to 50 ring carbon atoms, or a substituted or unsubstituted monovalent heterocyclic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when two or more of each of $R_{901}$ to $R_{907}$ are present, the two or more of each of $R_{901}$ to $R_{907}$ are the same as or different from each other;

$$L_{1A}\text{-}Ar_{1A} \quad (1A)$$

wherein in the formula (1A), $L_{1A}$ and $Ar_{1A}$ are as defined in the formula (1); and when two or more groups represented by the formula (1A) are present, the two or more of the groups represented by the formula (1A) may be the same as or different from each other, (2)

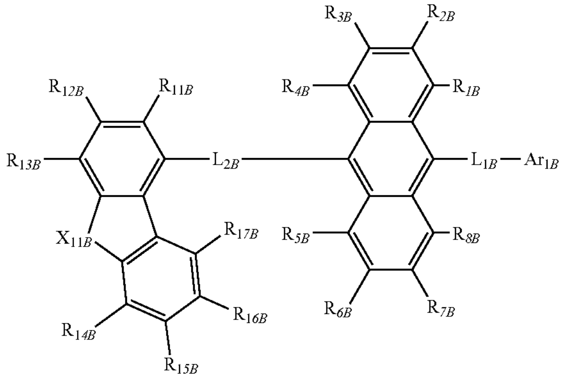

wherein in the formula (2), $X_{11B}$ is an oxygen atom or a sulfur atom;

one or more sets of adjacent two or more of $R_{14B}$ to $R_{17B}$ form a substituted or unsubstituted, saturated or unsaturated ring by bonding with each other;

one or more sets of adjacent two or more of $R_{11B}$ to $R_{13B}$ form a substituted or unsubstituted, saturated or unsaturated ring by bonding with each other, or do not form a substituted or unsubstituted, saturated or unsaturated ring;

$R_{1B}$ to $R_{8B}$, and $R_{11B}$ to $R_{17B}$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—($R_{904}$),

—S—($R_{905}$),

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$L_{1B}$ and $L_{2B}$ are independently a single bond, a substituted or unsubstituted arylene group including 6 to 50 ring carbon atoms, or a substituted or unsubstituted divalent heterocyclic group including 5 to 50 ring atoms;

$Ar_{1B}$ is a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formula (1), wherein the dopant material comprises a compound represented by the following formula (31):

(31)

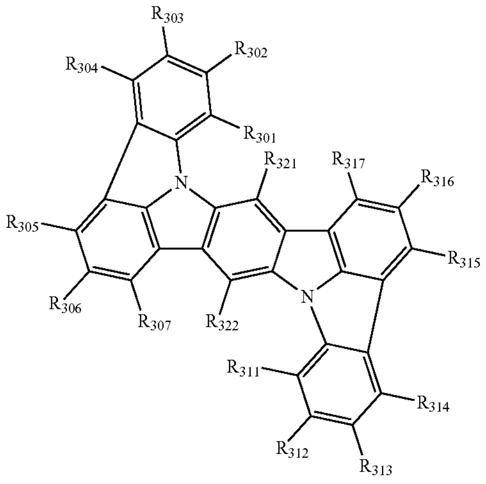

wherein in the formula (31), one or more sets of adjacent two or more of $R_{301}$ to $R_{307}$ and $R_{311}$ to $R_{317}$ form a substituted or unsubstituted, saturated or unsaturated ring by bonding with each other, or do not form a substituted or unsubstituted, saturated or unsaturated ring;

$R_{301}$ to $R_{307}$ and $R_{311}$ to $R_{317}$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{321}$ and $R_{322}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formula (1).

2. The organic electroluminescence device according to claim 1, wherein in the formula (31), at least one of $R_{301}$ to $R_{307}$ and $R_{311}$ to $R_{317}$ is a group represented by —$N(R_{906})(R_{907})$.

3. The organic electroluminescence device according to claim 1, wherein in the formula (31), at least two of $R_{301}$ to $R_{307}$ and $R_{311}$ to $R_{317}$ are groups represented by —$N(R_{906})(R_{907})$.

4. The organic electroluminescence device according to claim 1, wherein the compound represented by the formula (31) is one or more selected from the group consisting of a compound represented by the following formula (32), a compound represented by the following formula (34-2), and a compound represented by the following formula (35-2):

(32)

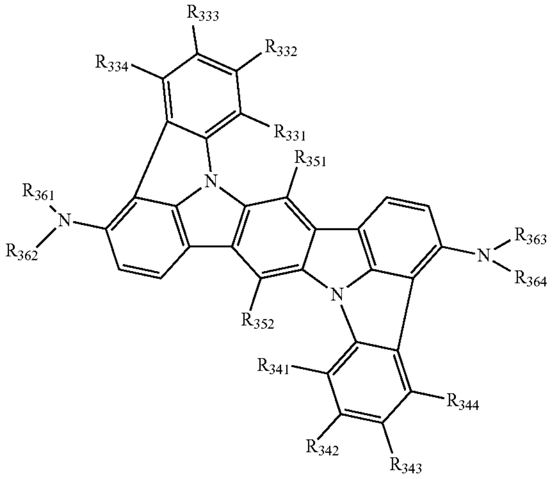

-continued (34-2)

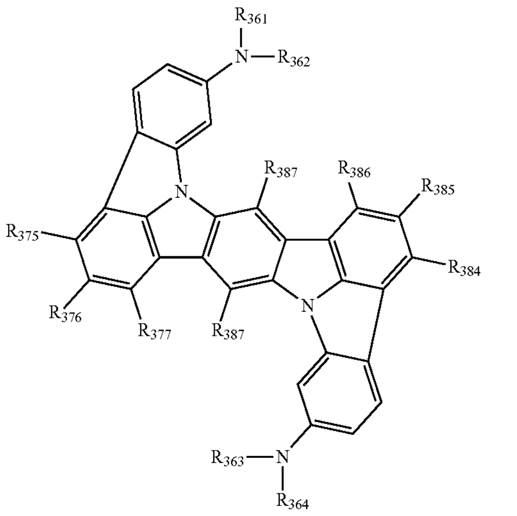

(35-2)

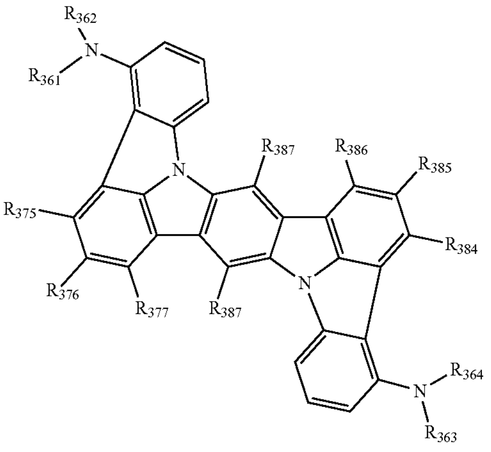

wherein in the formula (32), one or more sets of adjacent two or more of $R_{331}$ to $R_{334}$ and $R_{341}$ to $R_{344}$ form a substituted or unsubstituted, saturated or unsaturated ring by bonding with each other, or do not form a substituted or unsubstituted, saturated or unsaturated ring;

$R_{331}$ to $R_{334}$, and $R_{341}$ to $R_{344}$ which do not form the substituted or unsubstituted, saturated or unsaturated ring, and $R_{351}$ and $R_{352}$ are independently a hydrogen atom, a substituted or unsubstituted aryl group including 6 to 50 ring carbon atoms, or a substituted or unsubstituted monovalent heterocyclic group including 5 to 50 ring atoms;

$R_{361}$ to $R_{364}$ are independently a substituted or unsubstituted aryl group including 6 to 50 ring carbon atoms, or a substituted or unsubstituted monovalent heterocyclic group including 5 to 50 ring atoms;

wherein in the formulas (34-2) and (35-2), $R_{361}$ to $R_{364}$ are as defined in the formula (32);

one or more sets of adjacent two or more of $R_{375}$ to $R_{377}$ and $R_{384}$ to $R_{386}$ form a substituted or unsubstituted, saturated or unsaturated ring by bonding with each other, or do not form a substituted or unsubstituted, saturated or unsaturated ring; and $R_{375}$ to $R_{377}$ and $R_{384}$ to $R_{386}$ which do not form the substituted or unsubstituted, saturated or unsaturated ring, and $R_{387}$ are independently a hydrogen atom, a substituted or unsubstituted aryl group including 6 to 50 ring carbon atoms, or a substituted or unsubstituted monovalent heterocyclic group including 5 to 50 ring atoms.

5. The organic electroluminescence device according claim 1, wherein the compound represented by the formula (31) is one or more compounds selected from the group consisting of a compound represented by the following formula (32-11), a compound represented by the following formula (34-11), and a compound represented by the following formula (35-11):

(32-11)

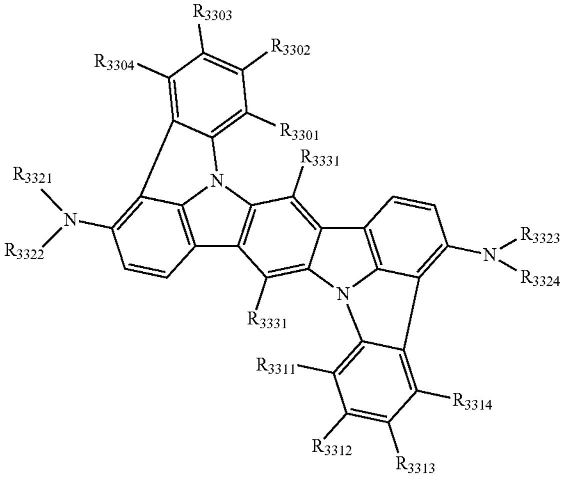

(34-11)

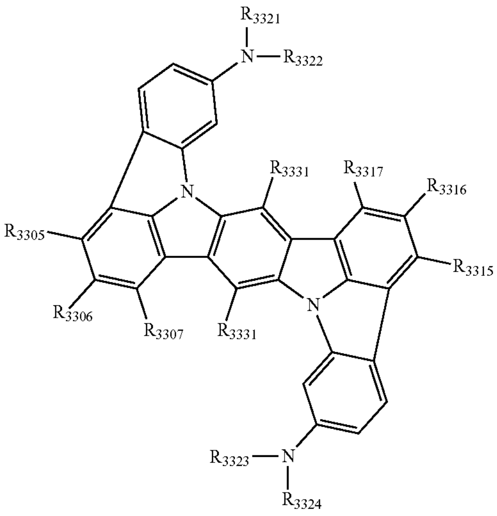

-continued (35-11)

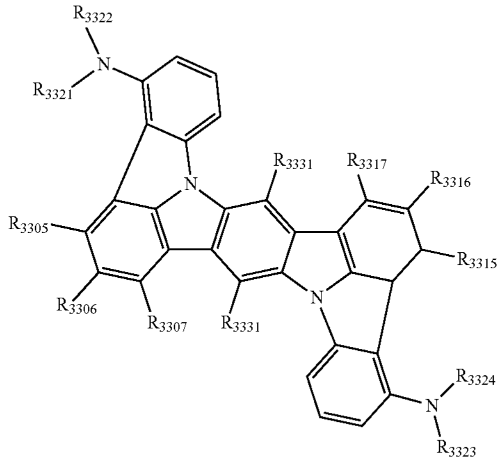

wherein in the formulas (32-11), (34-11), and (35-11), one or more sets of adjacent two or more of $R_{3301}$ to $R_{3307}$ and $R_{3311}$ to $R_{3317}$ form a substituted or unsubstituted, saturated or unsaturated ring by bonding with each other, or do not form a substituted or unsubstituted, saturated or unsaturated ring;

$R_{3301}$ to $R_{3307}$ and $R_{3311}$ to $R_{3317}$ which do not form the substituted or unsubstituted, saturated or unsaturated ring, and $R_{3331}$ are independently a hydrogen atom, a substituted or unsubstituted aryl group including 6 to 20 ring carbon atoms, or a substituted or unsubstituted monovalent heterocyclic group including 5 to 20 ring atoms; two $R_{3331}$'s may be the same as or different from each other; and $R_{3321}$ to $R_{3324}$ are independently a substituted or unsubstituted aryl group including 6 to 20 ring carbon atoms, or a substituted or unsubstituted monovalent heterocyclic group including 5 to 20 ring atoms.

6. A compound represented by the following formula (3-2):

(3-2)

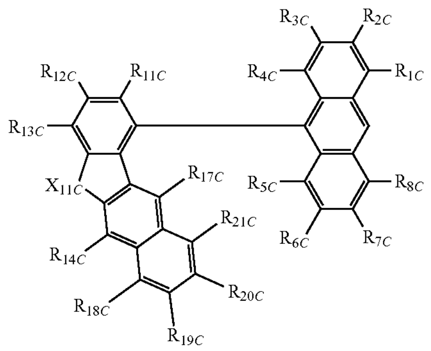

wherein in the formula (3-2), $X_{11C}$ is an oxygen atom or a sulfur atom;

$L_{1C}$ is a single bond, a substituted or unsubstituted arylene group including 6 to 50 ring carbon atoms, or a substituted or unsubstituted divalent heterocyclic group including 5 to 50 ring atoms;

$Ar_{1C}$ is a substituted or unsubstituted aryl group including 6 to 50 ring carbon atoms, or a substituted or unsubstituted monovalent heterocyclic group including 5 to 50 ring atoms;

provided that at least one hydrogen atom possessed by the group of $-L_{1C}-Ar_{1C}$ is a deuterium atom;

one or more sets of adjacent two or more of $R_{11C}$ to $R_{13C}$ form a substituted or unsubstituted, saturated or unsaturated ring by bonding with each other, or do not form a substituted or unsubstituted, saturated or unsaturated ring;

$R_{1C}$ to $R_{8C}$, $R_{14C}$, and $R_{17C}$ to $R_{21C}$, and $R_{11C}$ to $R_{13C}$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $—Si(R_{901})(R_{902})(R_{903})$, $—O—(R_{904})$, $—S—(R_{905})$, $—N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when two or more of each of $R_{901}$ to $R_{907}$ are present, the two or more of each of $R_{901}$ to $R_{907}$ may be the same as or different from each other;

provided that in the case where $R_{1C}$ to $R_{8C}$, $R_{14C}$, and $R_{17C}$ to $R_{21C}$, and $R_{11C}$ to $R_{13C}$ which do not form the substituted or unsubstituted, saturated or unsaturated ring are hydrogen atoms, the hydrogen atoms are not deuterium atoms;

$R_{1C}$ to $R_{8C}$, $R_{14C}$ and $R_{17C}$ to $R_{21C}$, which are not hydrogen atoms, and hydrogen atoms of $R_{11C}$ to $R_{13C}$ which do not form the substituted or unsubstituted, saturated or unsaturated rings, are not deuterium atoms;

in the case where $R_{1C}$ to $R_{8C}$, $R_{14C}$, and $R_{17C}$ to $R_{21C}$ which are not hydrogen atoms, and $R_{11C}$ to $R_{13C}$ which do not form the substituted or unsubstituted, saturated or unsaturated ring have an arbitrary substituent, hydrogen atoms possessed by the arbitrary substituent are not deuterium atoms;

hydrogen atoms possessed by the substituted or unsubstituted, saturated or unsaturated ring formed by bonding $R_{11C}$ to $R_{13C}$ to each other are not deuterium atoms; and in the case where the substituted or unsubstituted, saturated or unsaturated ring formed by bonding $R_{11C}$ to $R_{13C}$ to each other has an arbitrary substituent, hydrogen atoms possessed by the arbitrary substituent are not deuterium atoms.

7. The compound according to claim 6, wherein the compound represented by the formula (3-2) is a compound represented by the following formula (3-2-1):

(3-2-1)

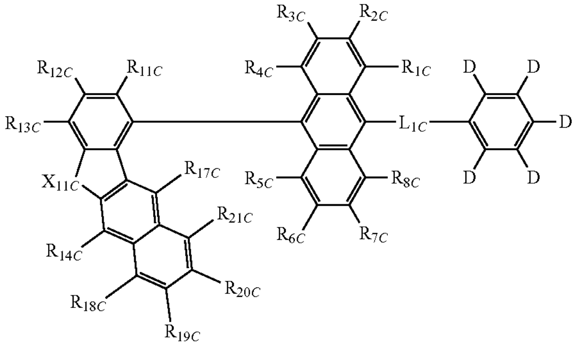

wherein in the formula (3-2-1), $X_{11C}$, $R_{11C}$ to $R_{14C}$, $R_{17C}$ to $R_{21C}$, $R_{1C}$ to $R_{8C}$, and $L_{1C}$ are as defined in the formula (3-2).

8. The compound according to claim 7, wherein in the formula (3-2-1), $L_{1C}$ is a single bond or an unsubstituted arylene group including 6 to 50 ring carbon atoms.

9. The compound according to claim 7, wherein in the formula (3-2-1), $L_{1C}$ is a single bond, an unsubstituted phenylene group, or an unsubstituted naphthylene group.

10. The compound according to claim 6, wherein in the formula (3-2), $X_{11C}$ is an oxygen atom.

11. The compound according to claim 6, wherein the compound represented by the formula (3-2) is a compound represented by the following formula (3-2-2):

(3-2-2)

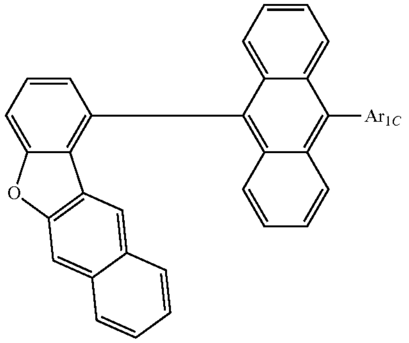

wherein in the formula (3-2-2), Aric is as defined in the formula (3-2).

12. The compound according to claim 6, wherein in the formula (3-2), Aric is a $—C_6D_5$ group.

13. An organic electroluminescence device comprising:

a cathode;

an anode; and at least one emitting layer disposed between the cathode and the anode, wherein the emitting layer comprises a first host material, a second host material, and a dopant material, the first host material is a compound represented by the following formula (1-1), the second host material is a compound represented by the following formula (2), and the first host material and the second host material are different compounds:

(1)

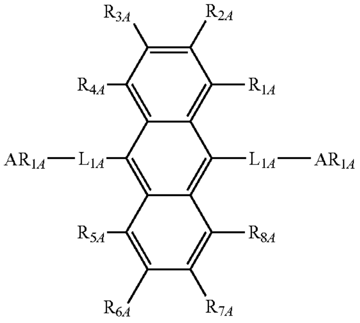

wherein in the formula (1-1), $R_{1A}$ and $R_{3A}$ to $R_{8A}$ are independently a hydrogen atom, a substituent R, or a group represented by the following formula (1A);

the substituent R is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $—Si(R_{901})(R_{902})(R_{903})$, $—O—(R_{904})$, $—S—(R_{905})$, $—N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

when two or more of the substituents R are present, the two or more of the substituents R may be the same as or different from each other;

$L_{1A}$'s are independently a single bond, a substituted or unsubstituted arylene group including 6 to 50 ring carbon atoms, or a substituted or unsubstituted divalent heterocyclic group including 5 to 50 ring atoms;

$Ar_{1A}$'s are independently a substituted or unsubstituted aryl group including 6 to 50 ring carbon atoms, or a substituted or unsubstituted monovalent heterocyclic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when two or more of each of $R_{901}$ to $R_{907}$ are present, the two or more of each of $R_{901}$ to $R_{907}$ are the same as or different from each other;

$$L_{1A}\text{-}Ar_{1A} \quad (1A)$$

wherein in the formula (1A), $L_{1A}$ and $Ar_{1A}$ are as defined in the formula (1-1); and when two or more groups represented by the formula (1A) are present, the two or more of the groups represented by the formula (1A) may be the same as or different from each other, (2)

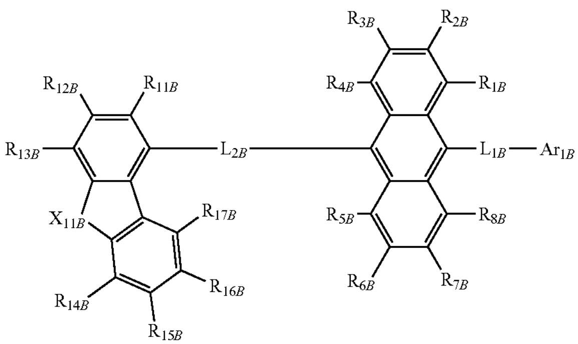

wherein in the formula (2), $X_{11B}$ is an oxygen atom or a sulfur atom;

one or more sets of adjacent two or more of $R_{14B}$ to $R_{17B}$ form a substituted or unsubstituted, saturated or unsaturated ring by bonding with each other;

one or more sets of adjacent two or more of $R_{11B}$ to $R_{13B}$ form a substituted or unsubstituted, saturated or unsaturated ring by bonding with each other, or do not form a substituted or unsubstituted, saturated or unsaturated ring;

$R_{1B}$ to $R_{8B}$, and $R_{11B}$ to $R_{17B}$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$L_{1B}$ and $L_{2B}$ are independently a single bond, a substituted or unsubstituted arylene group including 6 to 50 ring carbon atoms, or a substituted or unsubstituted divalent heterocyclic group including 5 to 50 ring atoms;

$Ar_{1B}$ is a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formula (1-1).

14. An organic electroluminescence device comprising:

a cathode;

an anode; and at least one emitting layer disposed between the cathode and the anode, wherein the emitting layer comprises a first host material, a second host material, and a dopant material, the first host material is a compound represented by the following formula (1-11), the following formula (1-12), or the following formula (1-13):

the second host material is a compound represented by the following formula (2), and the first host material and the second host material are different compounds:

(1-11)

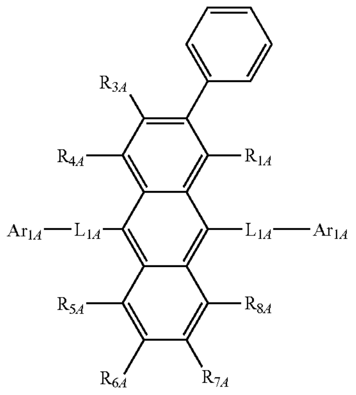

(1-12)

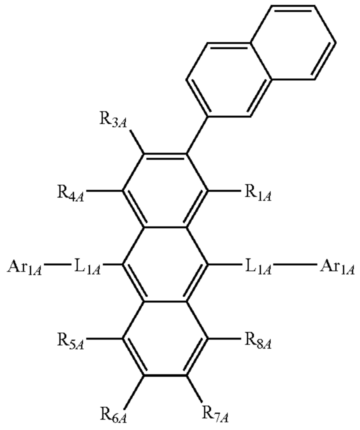

-continued (1-13)

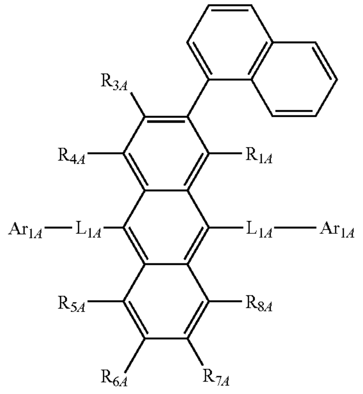

wherein in the formulae (1-11), (1-12) and (1-13), $R_{1A}$ and $R_{3A}$ to $R_{8A}$ are independently a hydrogen atom, a substituent R, or a group represented by the following formula (1A);

the substituent R is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms;

when two or more of the substituents R are present, the two or more of the substituents R may be the same as or different from each other;

$L_{1A}$'s are independently a single bond, a substituted or unsubstituted arylene group including 6 to 50 ring carbon atoms, or a substituted or unsubstituted divalent heterocyclic group including 5 to 50 ring atoms;

$Ar_{1A}$'s are independently a substituted or unsubstituted aryl group including 6 to 50 ring carbon atoms, or a substituted or unsubstituted monovalent heterocyclic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when two or more of each of $R_{901}$ to $R_{907}$ are present, the two or more of each of $R_{901}$ to $R_{907}$ are the same as or different from each other;

$$L_{1A}\text{-}Ar_{1A} \quad (1A)$$

wherein in the formula (1A), $L_{1A}$ and $Ar_{1A}$ are as defined in the formulae (1-11), (1-12), and 1-13); and when two or more groups represented by the formula (1A) are present, the two or more of the groups represented by the formula (1A) may be the same as or different from each other, (2)

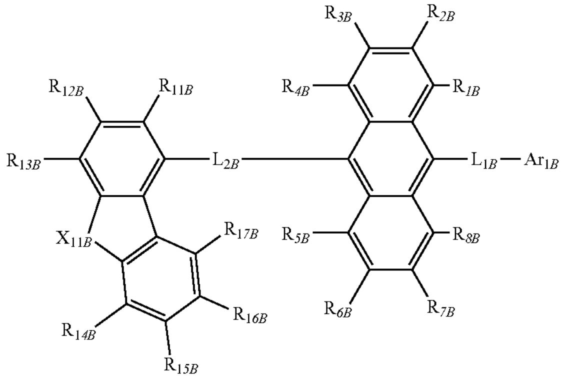

wherein in the formula (2), $X_{11B}$ is an oxygen atom or a sulfur atom;

one or more sets of adjacent two or more of $R_{14B}$ to $R_{17B}$ form a substituted or unsubstituted, saturated or unsaturated ring by bonding with each other;

one or more sets of adjacent two or more of $R_{11B}$ to $R_{13B}$ form a substituted or unsubstituted, saturated or unsaturated ring by bonding with each other, or do not form a substituted or unsubstituted, saturated or unsaturated ring;

$R_{1B}$ to $R_{8B}$, and $R_{11B}$ to $R_{17B}$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$L_{1B}$ and $L_{2B}$ are independently a single bond, a substituted or unsubstituted arylene group including 6 to 50 ring carbon atoms, or a substituted or unsubstituted divalent heterocyclic group including 5 to 50 ring atoms;

$Ar_{1B}$ is a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formulae (1-11), (1-12), and (1-13).

15. An organic electroluminescence device comprising:

a cathode;

an anode; and at least one emitting layer disposed between the cathode and the anode, wherein the emitting layer comprises a first host material, a second host material, and a dopant material, the first host material is a compound represented by the following formula (1-2), the second host material is a compound represented by the following formula (2), and the first host material and the second host material are different compounds:

(1-2)

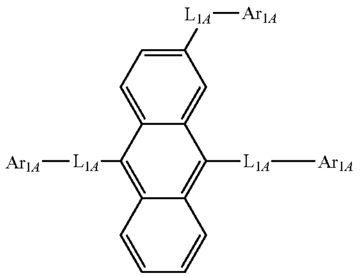

wherein in the formula (1-2), $L_{1A}$'s are independently a single bond, a substituted or unsubstituted arylene group including 6 to 50 ring carbon atoms, or a substituted or unsubstituted divalent heterocyclic group including 5 to 50 ring atoms;

$Ar_{1A}$'s are independently a substituted or unsubstituted aryl group including 6 to 50 ring carbon atoms, or a substituted or unsubstituted monovalent heterocyclic group including 5 to 50 ring atoms;

$L_{1A}$-$Ar_{1A}$ (1A)

wherein in the formula (1A), $L_{1A}$ and $Ar_{1A}$ are as defined in the formula (1-2); and when two or more groups represented by the formula (1A) are present, the two or more of the groups represented by the formula (1A) may be the same as or different from each other, (2)

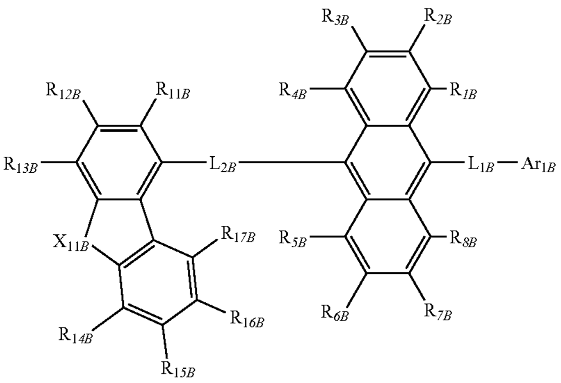

wherein in the formula (2), $X_{11B}$ is an oxygen atom or a sulfur atom;

one or more sets of adjacent two or more of $R_{14B}$ to $R_{17B}$ form a substituted or unsubstituted, saturated or unsaturated ring by bonding with each other;

one or more sets of adjacent two or more of $R_{11B}$ to $R_{13B}$ form a substituted or unsubstituted, saturated or unsaturated ring by bonding with each other, or do not form a substituted or unsubstituted, saturated or unsaturated ring;

$R_{1B}$ to $R_{8B}$, and $R_{11B}$ to $R_{17B}$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$L_{1B}$ and $L_{2B}$ are independently a single bond, a substituted or unsubstituted arylene group including 6 to 50 ring carbon atoms, or a substituted or unsubstituted divalent heterocyclic group including 5 to 50 ring atoms;

$Ar_{1B}$ is a substituted or unsubstituted aryl group including 6 to 50 ring carbon atoms, or a substituted or unsubstituted monovalent heterocyclic group including 5 to 50 ring atoms; and $R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when two or more of each of $R_{901}$ to $R_{907}$ are present, the two or more of each of $R_{901}$ to $R_{907}$ are the same as or different from each other.

16. An organic electroluminescence device comprising:

a cathode;

an anode; and at least one emitting layer disposed between the cathode and the anode, wherein the emitting layer comprises a first host material, a second host material, and a dopant material, the first host material is a compound represented by the following formula (1-21), the following formula (1-22), or the following formula (1-23), the second host material is a compound represented by the following formula (2), and the first host material and the second host material are different compounds:

(1-21)

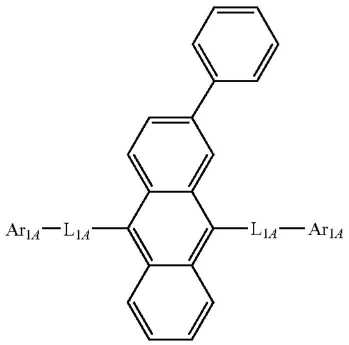

(1-22)

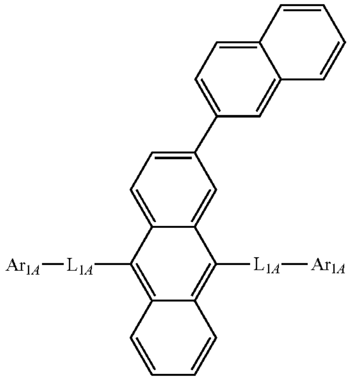

(1-23)

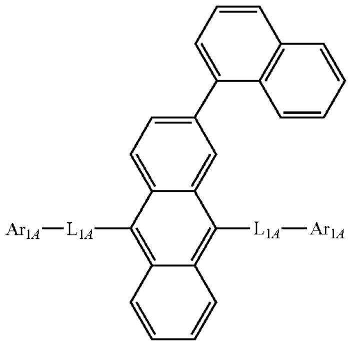

wherein in the formulae (1-21), (1-22), and (1-23)

$L_{1A}$'s are independently a single bond, a substituted or unsubstituted arylene group including 6 to 50 ring carbon atoms, or a substituted or unsubstituted divalent heterocyclic group including 5 to 50 ring atoms;

$Ar_{1A}$'s are independently a substituted or unsubstituted aryl group including 6 to 50 ring carbon atoms, or a substituted or unsubstituted monovalent heterocyclic group including 5 to 50 ring atoms;

$$L_{1A}\text{-}Ar_{1A} \quad (1A)$$

wherein in the formula (1A), $L_{1A}$ and $Ar_{1A}$ are as defined in the formulae (1-21), (1-22), and (1-23); and when two or more groups represented by the formula (1A) are present, the two or more of the groups represented by the formula (1A) may be the same as or different from each other, (2)

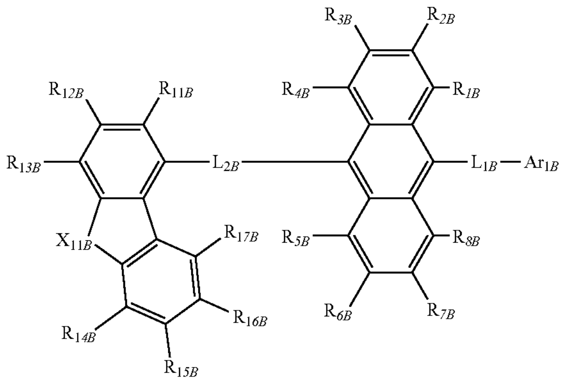

wherein in the formula (2), $X_{11B}$ is an oxygen atom or a sulfur atom;

one or more sets of adjacent two or more of $R_{14B}$ to $R_{17B}$ form a substituted or unsubstituted, saturated or unsaturated ring by bonding with each other;

one or more sets of adjacent two or more of $R_{11B}$ to $R_{13B}$ form a substituted or unsubstituted, saturated or unsaturated ring by bonding with each other, or do not form a substituted or unsubstituted, saturated or unsaturated ring;

$R_{1B}$ to $R_{8B}$, and $R_{11B}$ to $R_{17B}$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$ $-N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$L_{1B}$ and $L_{2B}$ are independently a single bond, a substituted or unsubstituted arylene group including 6 to 50 ring carbon atoms, or a substituted or unsubstituted divalent heterocyclic group including 5 to 50 ring atoms;

$Ar_{1B}$ is a substituted or unsubstituted aryl group including 6 to 50 ring carbon atoms, or a substituted or unsubstituted monovalent heterocyclic group including 5 to 50 ring atoms; and $R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when two or more of each of $R_{901}$ to $R_{907}$ are present, the two or more of each of $R_{901}$ to $R_{907}$ are the same as or different from each other.

17. A composition comprising a compound represented by the following formula (1) and a compound represented by the following formula (2), wherein the compound represented by the following formula (1) and the compound represented by the following formula (2) are different compounds:

(1)

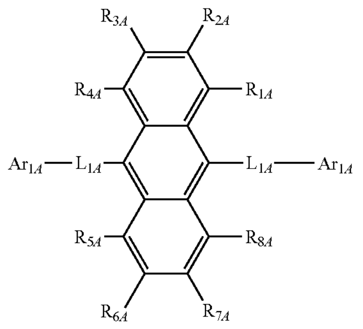

wherein in the formula (1), $R_{1A}$ to $R_{8A}$ are deuterium atoms $L_{1A}$'s are independently a single bond, a substituted or unsubstituted arylene group including 6 to 50 ring carbon atoms, or a substituted or unsubstituted divalent heterocyclic group including 5 to 50 ring atoms;

$Ar_{1A}$'s are independently a substituted or unsubstituted aryl group including 6 to 50 ring carbon atoms, or a substituted or unsubstituted monovalent heterocyclic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when two or more of each of $R_{901}$ to $R_{907}$ are present, the two or more of each of $R_{901}$ to $R_{907}$ are the same as or different from each other;

$$-L_{1A}-Ar_{1A} \quad (1A)$$

wherein in the formula (1A), $L_{1A}$ and $Ar_{1A}$ are as defined in the formula (1); and when two or more groups represented by the formula (1A) are present, the two or more of the groups represented by the formula (1A) may be the same as or different from each other, (2)

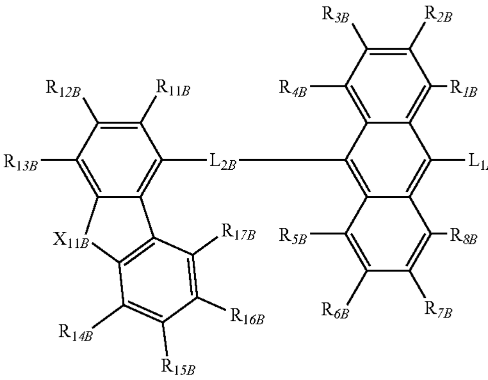

wherein in the formula (2), $X_{11B}$ is an oxygen atom or a sulfur atom;

one or more sets of adjacent two or more of $R_{14B}$ to $R_{17B}$ form a substituted or unsubstituted, saturated or unsaturated ring by bonding with each other;

one or more sets of adjacent two or more of $R_{11B}$ to $R_{13B}$ form a substituted or unsubstituted, saturated or unsaturated ring by bonding with each other, or do not form a substituted or unsubstituted, saturated or unsaturated ring;

$R_{11B}$ to $R_{17B}$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{1B}$ to $R_{8B}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $—Si(R_{901})(R_{902})(R_{903})$, $—O—(R_{904})$, $—S—(R_{905})$, $—N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$L_{1B}$ and $L_{2B}$ are independently a single bond, a substituted or unsubstituted arylene group including 6 to 50 ring carbon atoms, or a substituted or unsubstituted divalent heterocyclic group including 5 to 50 ring atoms;

$Ar_{1B}$ is a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formula (1).

18. A composition comprising a compound represented by the following formula (1) and a compound represented by the following formula (2), wherein the compound represented by the following formula (1) and the compound represented by the following formula (2) are different compounds:

(1)

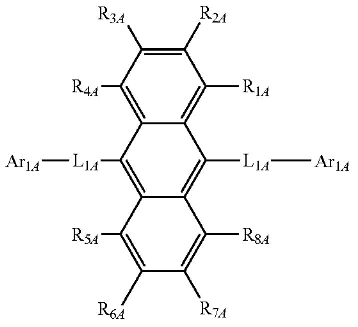

wherein in the formula (1), $R_{1A}$ to $R_{8A}$ are independently a hydrogen atom, a substituent R, or a group represented by the following formula (1A);

the substituent R is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $—Si(R_{901})(R_{902})(R_{903})$, $—O—(R_{904})$, $—S—(R_{905})$, $—N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

when two or more of the substituents R are present, the two or more of the substituents R may be the same as or different from each other;

$L_{1A}$'s are independently a single bond, a substituted or unsubstituted arylene group including 6 to 50 ring carbon atoms, or a substituted or unsubstituted divalent heterocyclic group including 5 to 50 ring atoms;

$Ar_{1A}$'s are independently a substituted or unsubstituted aryl group including 6 to 50 ring carbon atoms, or a substituted or unsubstituted monovalent heterocyclic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when two or more of each of $R_{901}$ to $R_{907}$ are present, the two or more of each of $R_{901}$ to $R_{907}$ are the same as or different from each other;

$$-L_{1A}-Ar_{1A} \quad (1A)$$

wherein in the formula (1A), $L_{1A}$ and $Ar_{1A}$ are as defined in the formula (1); and when two or more groups represented by the formula (1A) are present, the two or more of the groups represented by the formula (1A) may be the same as or different from each other, (2)

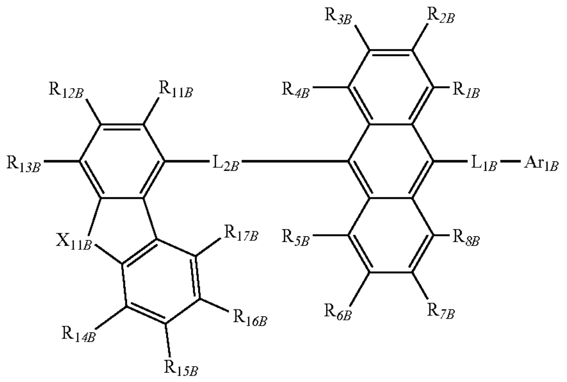

wherein in the formula (2), $X_{11B}$ is an oxygen atom or a sulfur atom;

one or more sets of adjacent two or more of $R_{14B}$ to $R_{17B}$ form a substituted or unsubstituted, saturated or unsaturated ring by bonding with each other;

one or more sets of adjacent two or more of $R_{11B}$ to $R_{13B}$ form a substituted or unsubstituted, saturated or unsaturated ring by bonding with each other, or do not form a substituted or unsubstituted, saturated or unsaturated ring;

$R_{11B}$ to $R_{17B}$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{1B}$ to $R_{8B}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$L_{1B}$ and $L_{2B}$ are independently a single bond, a substituted or unsubstituted arylene group including 6 to 50 ring carbon atoms, or a substituted or unsubstituted divalent heterocyclic group including 5 to 50 ring atoms;

$Ar_{1B}$ is an unsubstituted aryl group including 6 to 50 ring carbon atoms, and the aryl group has one or more deuterium atoms; and $R_{901}$ to $R_{907}$ are as defined in the formula (1).

19. A composition comprising a compound represented by the following formula (1) and a compound represented by the following formula (2), wherein the compound represented by the following formula (1) and the compound represented by the following formula (2) are different compounds:

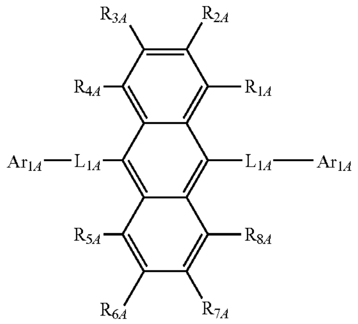

(1)

wherein in the formula (1), $R_{1A}$ to $R_{8A}$ are independently a hydrogen atom, a substituent R, or a group represented by the following formula (1A);

the substituent R is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

when two or more of the substituents R are present, the two or more of the substituents R may be the same as or different from each other;

$L_{1A}$'s are independently a single bond, a substituted or unsubstituted arylene group including 6 to 50 ring carbon atoms, or a substituted or unsubstituted divalent heterocyclic group including 5 to 50 ring atoms;

$Ar_{1A}$'s are independently a substituted or unsubstituted aryl group including 6 to 50 ring carbon atoms, or a substituted or unsubstituted monovalent heterocyclic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when two or more of each of $R_{901}$ to $R_{907}$ are present, the two or more of each of $R_{901}$ to $R_{907}$ are the same as or different from each other;

$$-L_{1A}-Ar_{1A} \quad (1A)$$

wherein in the formula (1A), $L_{1A}$ and $Ar_{1A}$ are as defined in the formula (1); and when two or more groups represented by the formula (1A) are present, the two or more of the groups represented by the formula (1A) may be the same as or different from each other, (2)

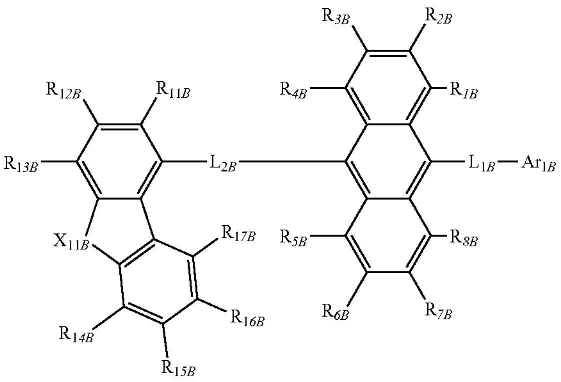

wherein in the formula (2), $X_{11B}$ is an oxygen atom or a sulfur atom;

one or more sets of adjacent two or more of $R_{14B}$ to $R_{17B}$ form a substituted or unsubstituted, saturated or unsaturated ring by bonding with each other;

one or more sets of adjacent two or more of $R_{11B}$ to $R_{13B}$ form a substituted or unsubstituted, saturated or unsaturated ring by bonding with each other, or do not form a substituted or unsubstituted, saturated or unsaturated ring;

$R_{11B}$ to $R_{17B}$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{1B}$ to $R_{8B}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$L_{1B}$ and $L_{2B}$ are independently a single bond, a substituted or unsubstituted arylene group including 6 to 50 ring carbon atoms, or a substituted or unsubstituted divalent heterocyclic group including 5 to 50 ring atoms;

$Ar_{1B}$ has a $-C_6D_5$ group and is a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formula (1).

* * * * *